US012114563B2

(12) United States Patent
Maruyama et al.

(10) Patent No.: US 12,114,563 B2
(45) Date of Patent: Oct. 8, 2024

(54) ORGANIC LIGHT-EMITTING DEVICE

(71) Applicant: Samsung Electronics Co., Ltd., Suwon-si (KR)

(72) Inventors: Yusuke Maruyama, Hwaseong-si (KR); Sangmo Kim, Hwaseong-si (KR); Juhyun Kim, Seoul (KR); Joonghyuk Kim, Seoul (KR); Hwangsuk Kim, Suwon-si (KR); Sungho Nam, Daegu (KR); Soohwan Sul, Suwon-si (KR); Dmitry Androsov, Hwaseong-si (KR); Soonok Jeon, Suwon-si (KR); Yongsik Jung, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 694 days.

(21) Appl. No.: 17/324,323

(22) Filed: May 19, 2021

(65) Prior Publication Data

US 2023/0069900 A1 Mar. 9, 2023

(30) Foreign Application Priority Data

Oct. 8, 2020 (KR) ........................ 10-2020-0130411

(51) Int. Cl.

| | |
|---|---|
| ***H10K 85/30*** | (2023.01) |
| ***C09K 11/06*** | (2006.01) |
| ***H10K 85/60*** | (2023.01) |
| *H10K 50/12* | (2023.01) |

(52) U.S. Cl.

CPC ............ *H10K 85/631* (2023.02); *C09K 11/06* (2013.01); *H10K 85/346* (2023.02); *H10K 85/6572* (2023.02); *C09K 2211/1007* (2013.01); *C09K 2211/1014* (2013.01); *C09K 2211/1029* (2013.01); *C09K 2211/1044* (2013.01); *C09K 2211/185* (2013.01); *H10K 50/121* (2023.02)

(58) Field of Classification Search

None

See application file for complete search history.

(56) References Cited

U.S. PATENT DOCUMENTS

2020/0028084 A1* 1/2020 Song ..................... C07C 211/61
2020/0058874 A1 2/2020 Kim et al.
2020/0144503 A1 5/2020 Hayano
2021/0053998 A1 2/2021 Kim et al.
2021/0202876 A1* 7/2021 Kim ....................... H10K 59/38
2022/0102636 A1* 3/2022 Dück ...................... C07F 5/027
2022/0285621 A1* 9/2022 Thirion .............. H10K 85/6574
2022/0289769 A1* 9/2022 Dück ................... H10K 85/658
2023/0084208 A1 3/2023 Kim et al.
2023/0159568 A1* 5/2023 Zink ................... H10K 85/658 257/40
2023/0345748 A1* 10/2023 Kim ...................... H10K 50/11

FOREIGN PATENT DOCUMENTS

KR 1020200011383 A 2/2020
KR 1020200019272 A 2/2020
KR 1020200020538 A 2/2020
KR 1020200047400 A 5/2020
KR 1020200052513 A 5/2020

OTHER PUBLICATIONS

English Abstract of KR 10-2020-0011383.
English Abstract of KR 10-2020-0047400.

* cited by examiner

*Primary Examiner* — Robert S Loewe
(74) *Attorney, Agent, or Firm* — CANTOR COLBURN LLP

(57) ABSTRACT

Disclosed are an organic light-emitting device and an electronic apparatus including the same. The organic light-emitting device includes: a first electrode; a second electrode facing the first electrode; and an organic layer located between the first electrode and the second electrode and including an emission layer, wherein the emission layer includes a host compound, a first dopant compound, and a second dopant compound, and the second dopant compound is represented by Formula 1, $$A\text{-}(Ar_1)_{n11} \quad \text{Formula 1}$$

wherein, in Formula 1,

A is a group represented by Formula 1-1,

Formula 1-1

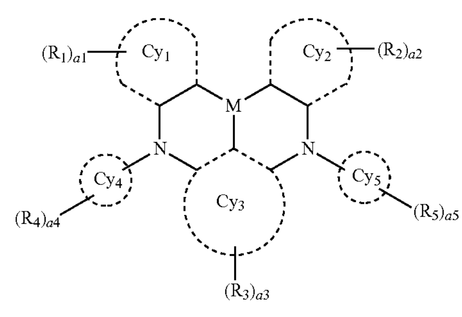

wherein, in Formulae 1 and 1-1, $Ar_1$, n11, M, $CY_1$ to $CY_5$, $R_1$ to $R_5$, and a1 to a5 are the same as described in the specification.

18 Claims, 1 Drawing Sheet

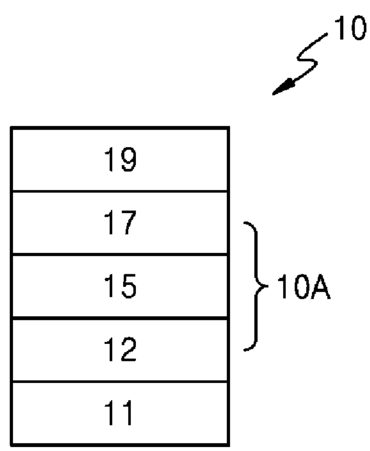
10
19
17
15
12
11
10A

ORGANIC LIGHT-EMITTING DEVICE

CROSS-REFERENCE TO RELATED APPLICATION

This application is based on and claims priority to Korean Patent Application No. 10-2020-0130411, filed on Oct. 8, 2020, in the Korean Intellectual Property Office, and all the benefits accruing therefrom under 35 U.S.C. § 119, the entire content of which is incorporated by reference herein.

BACKGROUND

1. Field

Provided is an organic light-emitting device.

2. Description of Related Art

Organic light-emitting devices (OLEDs) are self-emission devices that produce full-color images, and also have wide viewing angles, high contrast ratios, short response times, and excellent characteristics in terms of brightness, driving voltage, and response speed, compared to devices in the art.

In an example, an organic light-emitting device includes an anode, a cathode, and an organic layer between the anode and the cathode, wherein the organic layer includes an emission layer. A hole transport region may be located between the anode and the emission layer, and an electron transport region may be located between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state to thereby generate light.

SUMMARY

Provided is an organic light-emitting device with low driving voltage, high efficiency, and long lifespan.

Additional aspects will be set forth in part in the description which follows and, in part, will be apparent from the description, or may be learned by practice of the presented embodiments of the disclosure.

According to an aspect, provided is an organic light-emitting device including a first electrode, a second electrode facing the first electrode, and an organic layer located between the first electrode and the second electrode and including an emission layer, wherein the emission layer includes a host compound, a first dopant compound, and a second dopant compound, and the second dopant compound is represented by Formula 1 below.

$$A\text{-}(Ar_1)_{n11} \qquad \text{Formula 1}$$

wherein, in Formula 1,

A is a group represented by Formula 1-1,

Formula 1-1

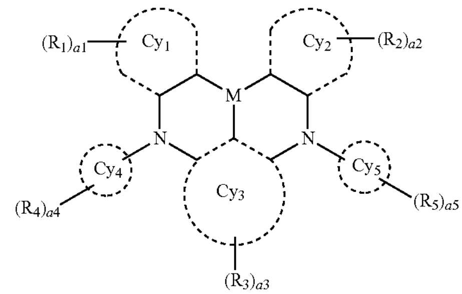

$Ar_1$ is a substituted or unsubstituted $C_5$-$C_{30}$ carbocyclic group or a substituted or unsubstituted $C_1$-$C_{30}$ heterocyclic group, n11 is an integer of 4 or more, $Ar_1$ in the number of n11 are identical to or different from each other, M is B, Al, Si($R_a$), Ge($R_a$), P, P(=O), or P(=S), $CY_1$ to $CY_5$ are each independently a $C_5$-$C_{30}$ carbocyclic group or a $C_1$-$C_{30}$ heterocyclic group, $R_a$ and $R_1$ to $R_5$ are each independently a binding site to $Ar_1$ in Formula 1, hydrogen, deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_1$-$C_{60}$ heteroalkyl aryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), or —P(=O)($Q_8$)($Q_9$), a1 to a5 are each independently an integer from 1 to 10, two neighboring groups of $R_1$ to $R_5$ are optionally linked to each other to form a $C_5$-$C_{30}$ carbocyclic group unsubstituted or substituted with $R_{10}$ or a $C_1$-$C_{30}$ heterocyclic group unsubstituted or substituted with $R_{10}$, wherein $R_{10}$ is the same as described in connection with $R_1$, and at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_1$-$C_{60}$ heteroalkyl aryl group, the substituted monovalent non-aromatic condensed polycyclic group, and the substituted monovalent non-aromatic condensed heteropolycyclic group is deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkylthio group, or a $C_1$-$C_{60}$ alkoxy group, a $C_1$-$C_{60}$ alkyl group, a $C_2$-$C_{60}$ alkenyl group, a $C_2$-$C_{60}$ alkynyl group, a $C_1$-$C_{60}$ alkylthio group, or a $C_1$-$C_{60}$ alkoxy group, each independently substituted with at least one deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl alkyl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a $C_1$-$C_{60}$ heteroalkyl aryl group, a monovalent non-aromatic condensed polycyclic group, a monovalent non-aromatic condensed heteropolycyclic group, $—Si(Q_{11})(Q_{12})(Q_{13})$, $—N(Q_{14})(Q_{15})$, $—B(Q_{16})(Q_{17})$, or $—P(=O)(Q_{18})(Q_{19})$, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl alkyl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a $C_1$-$C_{60}$ heteroalkyl aryl group, a monovalent non-aromatic condensed polycyclic group, or a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_6$-$C_{60}$ alkyl aryl group, a $C_1$-$C_{60}$ heteroaryl group, a $C_1$-$C_{60}$ heteroaryloxy group, a $C_1$-$C_{60}$ heteroarylthio group, a $C_1$-$C_{60}$ heteroalkyl aryl group, a monovalent non-aromatic condensed polycyclic group, or a monovalent non-aromatic condensed heteropolycyclic group, each independently substituted with at least one deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl alkyl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a $C_1$-$C_{60}$ heteroalkyl aryl group, a monovalent non-aromatic condensed polycyclic group, a monovalent non-aromatic condensed heteropolycyclic group, $—Si(Q_{21})(Q_{22})(Q_{23})$, $—N(Q_{24})(Q_{25})$-$B(Q_{26})(Q_{27})$, or $—P(=O)(Q_{28})(Q_{29})$, or $—Si(Q_{31})(Q_{32})(Q_{33})$, $—N(Q_{34})(Q_{35})$, $—B(Q_{36})(Q_{37})$, or $—P(=O)(Q_{38})(Q_{39})$, wherein $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{11}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_1$-$C_{60}$ heteroalkyl aryl group, a substituted or unsubstituted monovalent non-aromatic condensed polycyclic group, or a substituted or unsubstituted monovalent non-aromatic condensed heteropolycyclic group.

According to an aspect, provided is an electronic apparatus including the organic light-emitting device.

BRIEF DESCRIPTION OF THE DRAWING

The above and other aspects, features, and advantages of certain embodiments of the disclosure will be more apparent from the following description taken in conjunction with the accompanying drawing, in which FIGURE is a cross-sectional view schematically illustrating an organic light-emitting device according to an embodiment.

DETAILED DESCRIPTION

Reference will now be made in detail to embodiments, examples of which are illustrated in the accompanying drawings, wherein like reference numerals refer to like elements throughout the specification. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. Throughout the disclosure, the expression "at least one of a, b, or c" indicates only a, only b, only c, both a and b, both a and c, both b and c, all of a, b, and c, or variations thereof.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±20%, 10%, 5% of the stated value.

In any formula, * and *' each indicate a binding site to a neighboring atom or a neighboring functional group.

According to an aspect, provided is an organic light-emitting device including: a first electrode; a second electrode facing the first electrode; and an organic layer located between the first electrode and the second electrode and including an emission layer, wherein the emission layer includes a host compound, a first dopant compound, and a second dopant compound, and the second dopant compound is represented by Formula 1 below.

$$A\text{-}(Ar_1)_{n11} \quad \text{Formula 1}$$

wherein, in Formula 1, A may be a group represented by Formula 1-1,

Formula 1-1

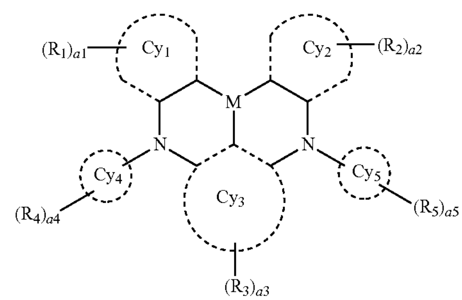

In Formula 1, $Ar_1$ may be a substituted or unsubstituted $C_5$-$C_{30}$ carbocyclic group or a substituted or unsubstituted $C_1$-$C_{30}$ heterocyclic group.

In an embodiment, $Ar_1$ may be: a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, or a carbazolyl group;

a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, or a carbazolyl group, each independently substituted with at least one of deuterium, —F, —Cl, —Br, —I, a hydroxyl group, a cyano group (CN), a nitro group, an amino group, a $C_1$-$C_{60}$ alkyl group, a $C_1$-$C_{60}$ alkoxy group, a $C_1$-$C_{60}$ alkylthio group, a $C_6$-$C_{60}$ aryl alkyl group, a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a carbazolyl group, —$Si(Q_{31})(Q_{32})(Q_{33})$, —$N(Q_{34})(Q_{35})$, —$B(Q_{36})(Q_{37})$, or —$P(=O)(Q_{38})(Q_{39})$; or —$N(Q_1)(Q_2)$, —$Si(Q_3)(Q_4)(Q_5)$, —$B(Q_6)(Q_7)$, or —$P(=O)(Q_8)(Q_9)$, but embodiments of the present disclosure are not limited thereto.

In an embodiment, $Ar_1$ may be:

a phenyl group, a naphthyl group, a fluorenyl group, a phenanthrenyl group, an anthracenyl group, a fluoranthenyl group, a triphenylenyl group, a pyrenyl group, a pyridinyl group, a pyrazinyl group, a pyrimidinyl group, a pyridazinyl group, a dibenzofuranyl group, a dibenzothiophenyl group, or a carbazolyl group; or a phenyl group, a naphthyl group, a fluorenyl group, a phenanthrenyl group, an anthracenyl group, a fluoranthenyl group, a triphenylenyl group, a pyrenyl group, a pyridinyl group, a pyrazinyl group, a pyrimidinyl group, a pyridazinyl group, a dibenzofuranyl group, a dibenzothiophenyl group, and a carbazolyl group, each independently substituted with at least one of deuterium, —F, —Cl, —Br, —I, a hydroxyl group, a cyano group (CN), a nitro group, an amino group, a $C_1$-$C_{60}$ alkyl group, a $C_1$-$C_{60}$ alkoxy group, a $C_1$-$C_{60}$ alkylthio group, a phenyl group, a naphthyl group, a fluorenyl group, a phenanthrenyl group, an anthracenyl group, a fluoranthenyl group, a triphenylenyl group, a pyrenyl group, a pyridinyl group, a pyrazinyl group, a pyrimidinyl group, a pyridazinyl group, a dibenzofuranyl group, a dibenzothiophenyl group, or a carbazolyl group.

In an embodiment, $Ar_1$ may be a group of Formulae 3-1 to 3-78, but embodiments of the present disclosure are not limited thereto:

3-1

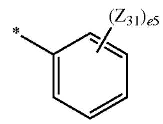

3-2

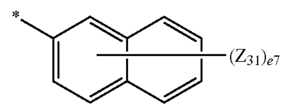

3-3

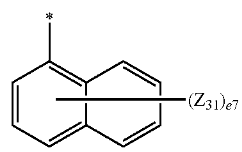

3-4

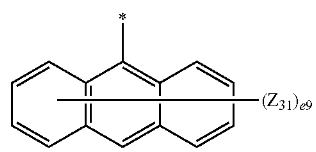

3-5

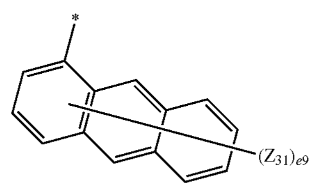

3-6

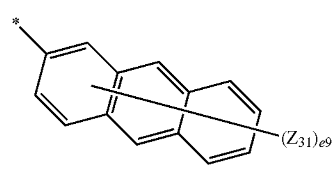

3-7

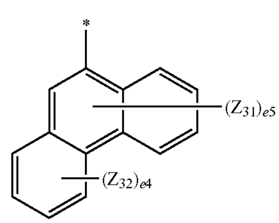

3-8

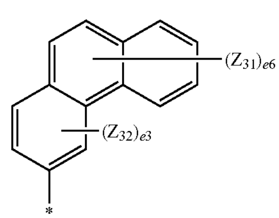

-continued
3-9
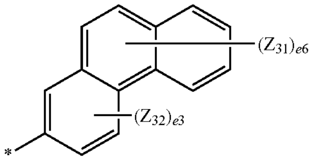
3-10
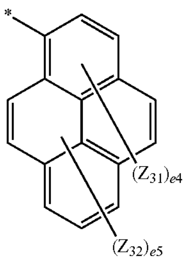
3-11
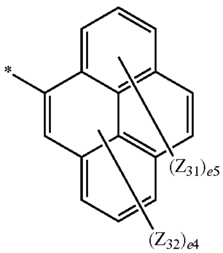
3-12
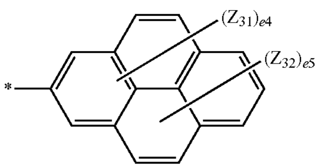
3-13
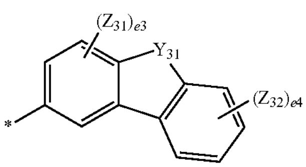
3-14
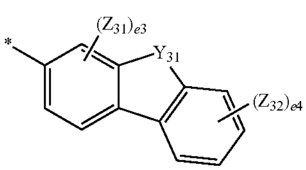
3-15
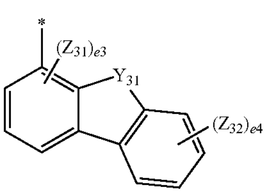
3-16
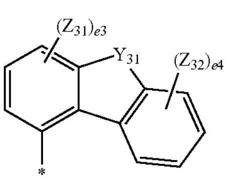
-continued
3-17
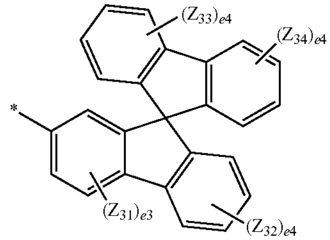
3-18
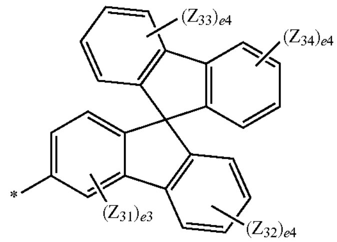
3-19
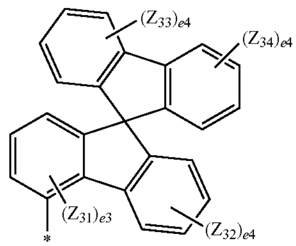
3-20
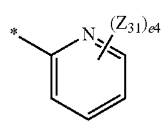
3-21
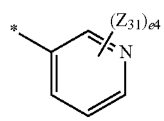
3-22
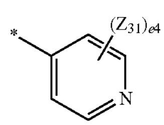
3-23
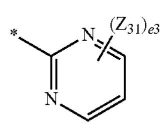
3-24
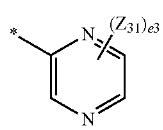
3-25
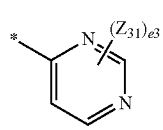

-continued
3-26
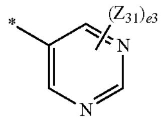
3-27
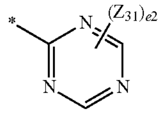
3-28
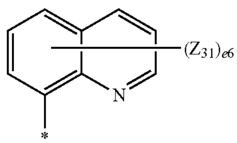
3-29
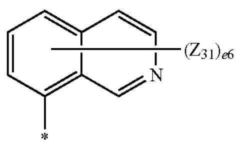
3-30
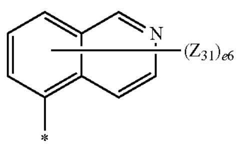
3-31
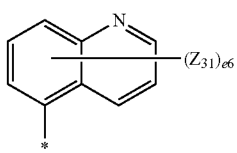
3-32
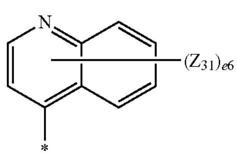
3-33
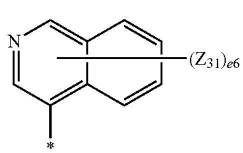
3-34
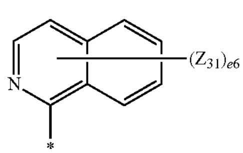
3-35
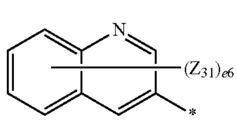
3-36
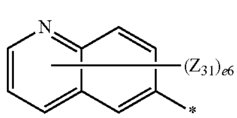
-continued
3-37
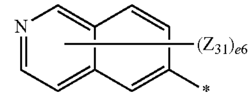
3-38
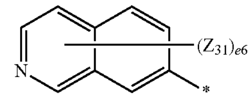
3-39
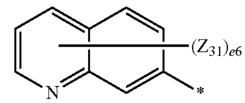
3-40
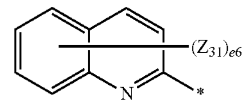
3-41
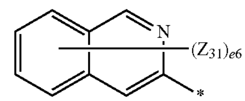
3-42
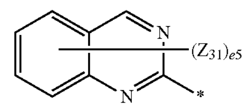
3-43
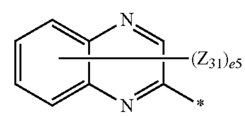
3-44
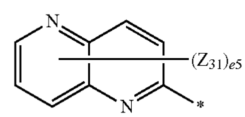
3-45
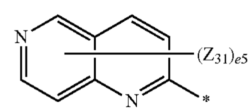
3-46
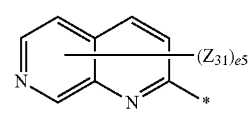
3-47
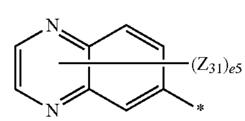
3-48
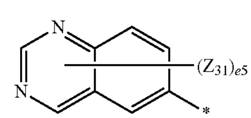
3-49
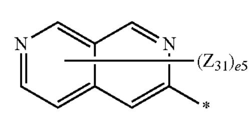
3-50
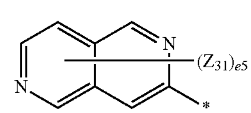

3-51
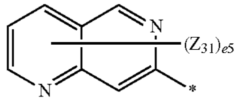
3-52
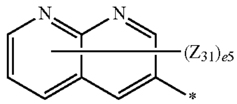
3-53
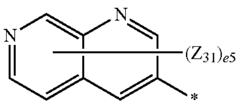
3-54
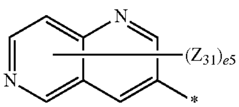
3-55
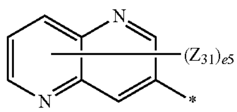
3-56
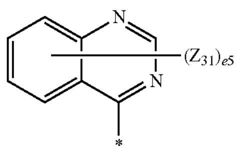
3-57
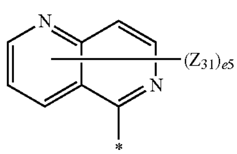
3-58
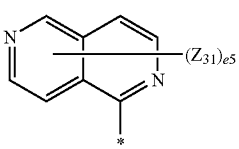
3-59
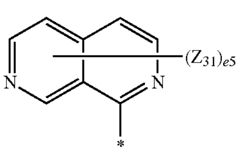
3-60
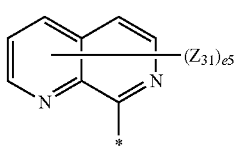
3-61
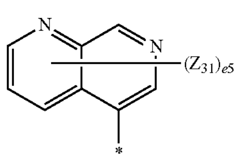
3-62
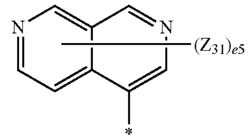
3-63
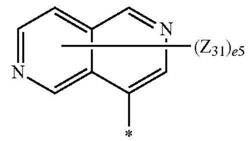
3-64
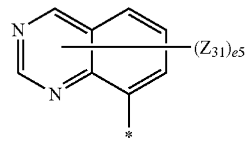
3-65
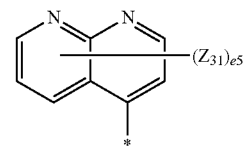
3-66
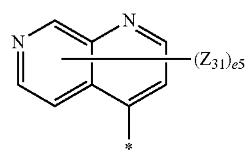
3-67
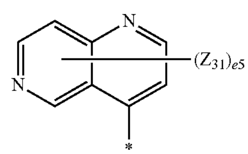
3-68
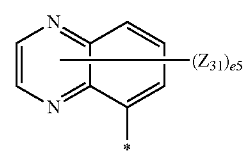
3-69
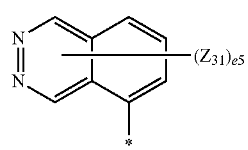
3-70
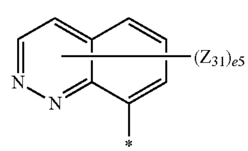
3-71
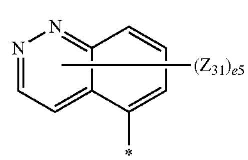

-continued 3-72

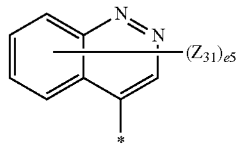

3-73

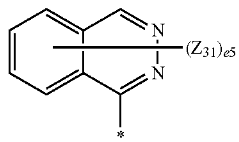

3-74

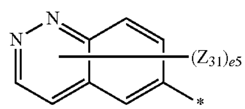

3-75

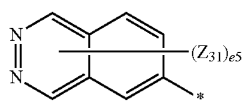

3-76

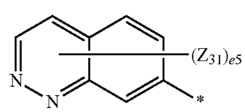

3-77

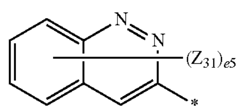

3-78

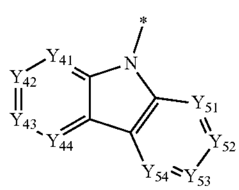

wherein, in Formulae 3-1 to 3-78, $Y_{31}$ may be O, S, $N(R_{31})$, $C(R_{31})(R_{32})$, or $Si(R_{31})(R_{32})$, $Y_{41}$ may be $C(R_{41})$ or N, $Y_{42}$ may be $C(R_{42})$ or N, $Y_{43}$ may be $C(R_{43})$ or N, $Y_{44}$ may be $C(R_{44})$ or N, $Y_{51}$ may be $C(R_{51})$ or N, $Y_{52}$ may be $C(R_{52})$ or N, $Y_{53}$ may be $C(R_{53})$ or N, $Y_{54}$ may be $C(R_{54})$ or N, $Z_{31}$ to $Z_{34}$, $R_{31}$, $R_{32}$, $R_{41}$ to $R_{44}$, and $R_{51}$ to $R_{54}$ may each independently be hydrogen, deuterium, —F, —Cl, —Br, —I, a hydroxyl group, a cyano group (CN), a nitro group, an amino group, a $C_1$-$C_{60}$ alkyl group, a $C_1$-$C_{60}$ alkoxy group, a $C_1$-$C_{60}$ alkylthio group, a $C_6$-$C_{60}$ aryl alkyl group, a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, or a carbazolyl group, e2 may be an integer from 0 to 2, e3 may be an integer from 0 to 3, e4 may be an integer from 0 to 4, e5 may be an integer from 0 to 5, e6 may be an integer from 0 to 6, e7 may be an integer from 0 to 7, e9 may be an integer from 0 to 9, indicates a binding site to a neighboring atom, and substituents $Z_{31}$ to $Z_{34}$ may be present on each ring through which the bond with the corresponding substituent passes.

In Formula 1, n11 may be an integer of 4 or more, $Ar_1$(s) in the number of n11 may be identical to or different from each other.

In an embodiment, $Ar_1$(s) in the number of n11 may be identical to each other.

M in Formula 1-1 may be B, Al, $Si(R_1)$, $Ge(R_1)$, P, P(═O), or P(═S).

In an embodiment, M may be B, Al, $Si(R_1)$, P, or P(═O), but embodiments of the present disclosure are not limited thereto.

In an embodiment, M may be B.

In Formula 1-1, ring $CY_1$ to ring $CY_5$ may each independently be a $C_5$-$C_{30}$ carbocyclic group or a $C_1$-$C_{30}$ heterocyclic group.

In an embodiment, ring $CY_1$ to ring $CY_5$ may each independently be a first ring, a second ring, a condensed ring in which two or more groups selected from the first ring are condensed with each other, a condensed ring in which two or more groups selected from the second ring are condensed with each other, or a condensed ring in which at least one first ring and at least one second ring are condensed with each other, but embodiments of the present disclosure are not limited thereto.

The first ring may be a cyclopenta-1,3-diene group, an indene group, an azulene group, a phenyl group, a naphthalene group, an anthracene group, a phenanthrene group, a tetracene group, a tetraphene group, a pyrene group, a chrysene group, a triphenylene group, or a fluorene group, and the second ring may be a furan group, a thiophene group, a pyrrole group, a borole group, a silole group, a pyrrolidine group, an imidazole group, a thiazole group, a triazole group, an oxazole group, an isoxazole group, a thiazole group, an isothiazole group, a pyridine group, a pyrimidine group, a pyridazine group, a triazine group, an indole group, an isoindole group, an indolizine group, a quinoline group, an isoquinoline group, a quinoxaline group, an isoquinoxaline group, a carbazole group, a dibenzofuran group, a dibenzothiophene group, a dibenzosilole group, or a dibenzoborole group.

In an embodiment, ring $CY_1$ to ring $CY_5$ may each independently be a phenyl group, a naphthalene group, an anthracene group, a fluorene group, a pyridine group, a pyrimidine group, a carbazole group, a dibenzofuran group, a dibenzothiophene group, or a dibenzosilole group.

In Formula 1-1, $R_a$ and $R_1$ to $R_5$ may each independently be a binding site to $Ar_1$ in Formula 1, hydrogen, deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_1$-$C_{60}$ heteroalkyl aryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, or —$P(=O)(Q_8)(Q_9)$.

In an embodiment, $R_a$ and $R_1$ to $R_5$ may each independently be:

a binding site to $Ar_1$ in Formula 1;

hydrogen, deuterium, —F, —Cl, —Br, —I, a hydroxyl group, a cyano group (CN), a nitro group, an amino group, a $C_1$-$C_{60}$ alkyl group, or a $C_1$-$C_{60}$ alkoxy group;

a $C_1$-$C_{60}$ alkyl group, a $C_1$-$C_{60}$ alkylthio group, or a $C_1$-$C_{60}$ alkoxy group, each independently substituted with at least one of deuterium, —F, —Cl, —Br, —I, a hydroxyl group, a cyano group (CN), a nitro group, an amino group, a phenyl group, a biphenyl group, a naphthyl group, a fluorenyl group, a phenanthrenyl group, an anthracenyl group, a fluoranthenyl group, a triphenylenyl group, a pyrenyl group, or a chrysenyl group;

a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, or a carbazolyl group;

a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, or a carbazolyl group, each independently substituted with at least one of deuterium, —F, —Cl, —Br, —I, a hydroxyl group, a cyano group (CN), a nitro group, an amino group, a $C_1$-$C_{60}$ alkyl group, a $C_1$-$C_{60}$ alkoxy group, a $C_1$-$C_{60}$ alkylthio group, a $C_6$-$C_{60}$ aryl alkyl group, a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a carbazolyl group, —$Si(Q_{31})(Q_{32})(Q_{33})$, —$N(Q_{34})(Q_{35})$, —$B(Q_{36})(Q_{37})$, or —$P(=O)(Q_{38})(Q_{39})$; or —$N(Q_1)(Q_2)$, —$Si(Q_3)(Q_4)(Q_5)$, —$B(Q_6)(Q_7)$, or —$P(=O)(Q_8)(Q_9)$, but embodiments of the present disclosure are not limited thereto.

In an embodiment, $R_a$ may be: hydrogen, deuterium, —F, —Cl, —Br, —I, a hydroxyl group, a cyano group (CN), a nitro group, an amino group, a $C_1$-$C_{60}$ alkyl group, a $C_1$-$C_{60}$ alkylthio group, or a $C_1$-$C_{60}$ alkoxy group; a $C_1$-$C_{60}$ alkyl group, a $C_1$-$C_{60}$ alkylthio group, or a $C_1$-$C_{60}$ alkoxy group, each independently substituted with at least one of deuterium, —F, —Cl, —Br, —I, a hydroxyl group, a cyano group (CN), a nitro group, an amino group, a phenyl group, or a biphenyl group.

In an embodiment, when at least one group of $R_1$(s) in the number of a1 may be a binding site to $Ar_1$ in Formula 1, the remaining $R_1$ groups may each be hydrogen.

In an embodiment, when at least one group of $R_2$(s) in the number of a2 may be a binding site to $Ar_1$ in Formula 1, the remaining $R_2$ groups may each be hydrogen.

In an embodiment, when at least one group of $R_3$(s) in the number of a3 may be a binding site to $Ar_1$ in Formula 1, the remaining $R_3$ groups may each be hydrogen.

In an embodiment, when at least one group of $R_4$(s) in the number of a4 may be a binding site to $Ar_1$ in Formula 1, the remaining $R_4$ groups may each be hydrogen.

In an embodiment, when at least one group of $R_5$(s) in the number of a5 may be a binding site to $Ar_1$ in Formula 1, the remaining $R_5$ groups may each be hydrogen.

In Formula 1-1, a1 to a5 may each independently an integer from 1 to 10. Here, a1 may indicate the number of $R_1$ groups, wherein, when a1 is an integer of 2 or more, two or more of $R_1$(s) may be identical to or different from each other, a2 may indicate the number of $R_2$ groups, wherein, when a2 is an integer of 2 or more, two or more of $R_2$(s) may be identical to or different from each other, a3 may indicate the number of $R_3$ groups, wherein, when a3 is an integer of 2 or more, two or more of $R_3$(s) may be identical to or different from each other, a4 may indicate the number of $R_4$ groups, wherein, when a4 is an integer of 2 or more, two or more of $R_4$(s) may be identical to or different from each other, and a5 may indicate the number of $R_5$ groups, wherein, when a5 is an integer of 2 or more, two or more of $R_5$(s) may be identical to or different from each other.

In Formula 1-1, two neighboring groups of $R_1$ to $R_5$ may optionally linked to each other to thereby form a $C_5$-$C_{30}$ carbocyclic group unsubstituted or substituted with $R_{10}$ a $C_1$-$C_{30}$ heterocyclic group unsubstituted or substituted with $R_{10}$. In this regard, $R_{10}$ is the same as described in connection with $R_1$.

In an embodiment, Formula 1 may be represented by Formula 1-2:

Formula 1-2

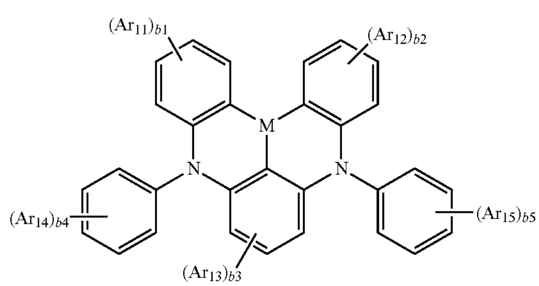

In Formula 1-2,

M is the same as described in the present specification, each of $Ar_{11}$ to $Ar_{15}$ is the same as described in connection with $Ar_1$ in the present specification, b1 and b2 are each independently an integer from 0 to 4, b3 may be an integer from 0 to 3, b4 and b5 may each independently be an integer from 0 to 5, and $b1+b2+b3+b4+b5\geq 4$.

In an embodiment, when b1 is 2 or more, two or more of $Ar_{11}$(s) may be identical to or different from each other, when b2 is 2 or more, two or more of $Ar_{12}$(s) may be identical to or different from each other, when b3 is 2 or more, two or more of $Ar_{13}$(s) may be identical to or different from each other, when b4 is 2 or more, two or more of $Ar_{14}$(s) may be identical to or different from each other, and when b5 is 2 or more, two or more of $Ar_{15}$(s) may be identical to or different from each other.

In an embodiment, when b1 is 0, $Ar_{11}$ does not exist, when b2 is 0, $Ar_{12}$ does not exist, when b3 is 0, $Ar_{13}$ does not exist, when b4 is 0, $Ar_{14}$ does not exist, and when b5 is 0, $Ar_{15}$ does not exist.

In an embodiment, in Formula 1-2, $Ar_{11}$(s) in the number of b1, $Ar_{12}$(s) in the number of b2, $Ar_{13}$(s) in the number of b3, $Ar_{14}$(s) in the number of b4, and $Ar_{15}$(s) in the number of b5 may be identical to each other.

In an embodiment, in Formula 1-2, (i) b1 may be 4; b2 may be 4; b4 may be 4; or b5 may be 4;

(ii) b1 may be 3 and b2 may be 1; b1 may be 3 and b3 may be 1; b1 may be 3 and b4 may be 1; or b1 may be 3 and b5 may be 1;

(iii) b1 may be 2, b2 may be 1, and b3 may be 1; b1 may be 2, b2 may be 1, and b4 may be 1; b1 may be 2, b2 may be 1, and b5 may be 1; b1 may be 2, b3 may be 1, and b4 may be 1; b1 may be 2, b3 may be 1, and b5 may be 1; b1 may be 2, b4 may be 1, and b5 may be 1; b1 may be 2 and b2 may be 2; b1 may be 2 and b3 may be 2; b1 may be 2 and b4 may be 2; or b1 may be 2 and b5 may be 2;

(iv) b1 may be 1, b2 may be 1, b3 may be 1, and b4 may be 1; b1 may be 1, b2 may be 1, b3 may be 1, and b5 may be 1; b1 may be 1, b3 may be 1, b4 may be 1, and b5 may be 1; b1 may be 1, b2 may be 2, and b3 may be 1; b1 may be 1, b2 may be 2, and b4 may be 1; b1 may be 1, b2 may be 2, and b5 may be 1; b1 may be 1, b2 may be 1, and b3 may be 2; b1 may be 1, b3 may be 2, and b4 may be 1; b1 may be 1, b3 may be 2, and b5 may be 1; b1 may be 1, b2 may be 1, and b4 may be 2; b1 may be 1, b3 may be 1, and b4 may be 2; b1 may be 1, b4 may be 2, and b5 may be 1; b1 may be 1, b2 may be 1, and b5 may be 2; b1 may be 1, b3 may be 1, and b5 may be 2; b1 may be 1, b4 may be 1, and b5 may be 2; b1 may be 1 and b2 may be 3; b1 may be 1 and b3 may be 3; b1 may be 1 and b4 may be 3; or b1 may be 1 and b5 may be 3;

(v) b2 may be 3 and b3 may be 1; b2 may be 3 and b4 may be 1; or b2 may be 3 and b5 may be 1;

(vi) b2 may be 2, b3 may be 1, and b4 may be 1; b2 may be 2, b3 may be 1, and b5 may be 1; b2 may be 2, b4 may be 1, and b5 may be 1; b2 may be 2 and b3 may be 2; b2 may be 2 and b4 may be 2; or b2 may be 2 and b5 may be 2;

(vii) b2 may be 1, b3 may be 1, b4 may be 1, and b5 may be 1; b2 may be 1, b3 may be 2, and b4 may be 1; b2 may be 1, b3 may be 2, and b5 may be 1; b2 may be 1, b3 may be 1, and b4 may be 2; b2 may be 1, b4 may be 2, and b5 may be 1; b2 may be 1, b5 may be 2, and b3 may be 1; b2 may be 1, b5 may be 2, and b4 may be 1; b2 may be 1 and b3 may be 3; b2 may be 1 and b4 may be 3; or b2 may be 1 and b5 may be 3;

(viii) b3 may be 3 and b4 may be 1; or b3 may be 3 and b5 may be 1;

(ix) b3 may be 2, b4 may be 1, and b5 may be 1; b3 may be 2 and b4 may be 2; or b3 may be 2 and b5 may be 2;

(x) b3 may be 1, b4 may be 2, and b5 may be 1; or b3 may be 1, b4 may be 1, and b5 may be 2;

(xi) b4 may be 3 and b5 may be 1;

(xii) b4 may be 2 and b5 may be 2; or (xiii) b4 may be 1 and b5 may be 3, but embodiments of the present disclosure are not limited thereto.

In an embodiment, the second dopant compound may be Compounds 1 to 229:
1
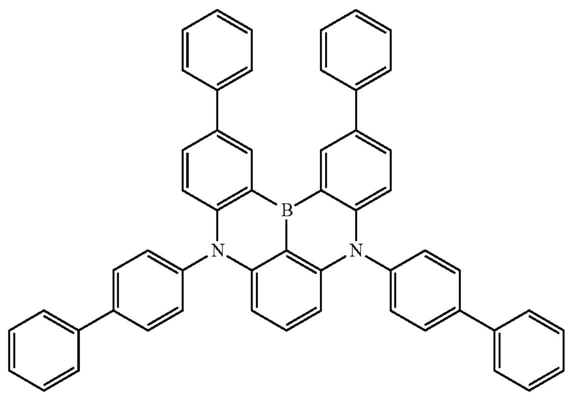
2
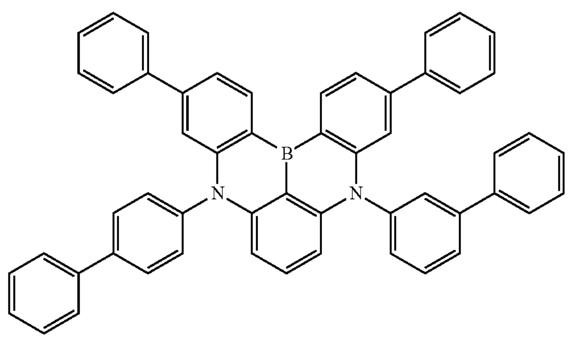
3
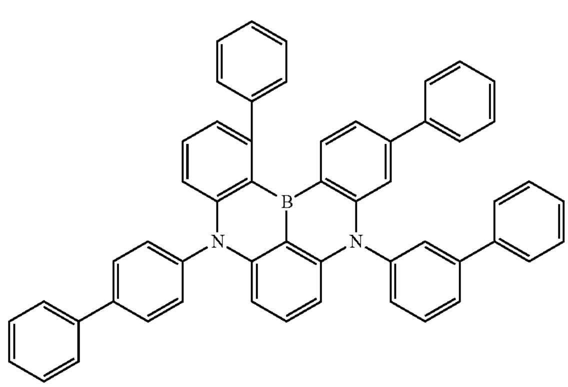
-continued
4
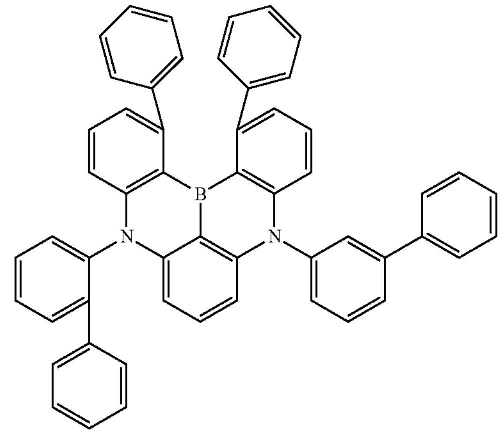
5
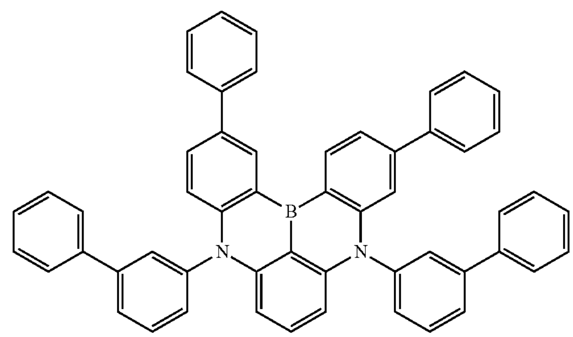
6
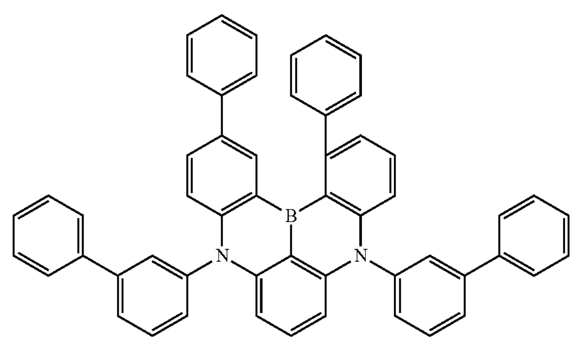
7
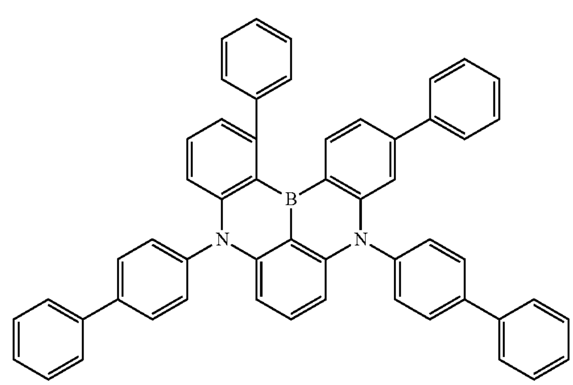

-continued
8
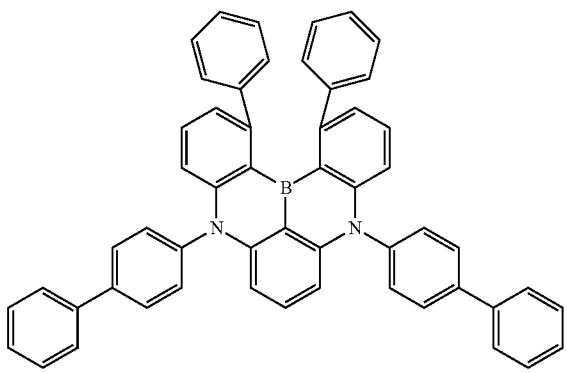
9
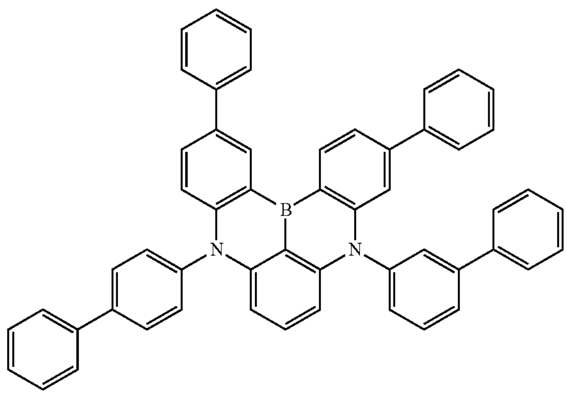
10
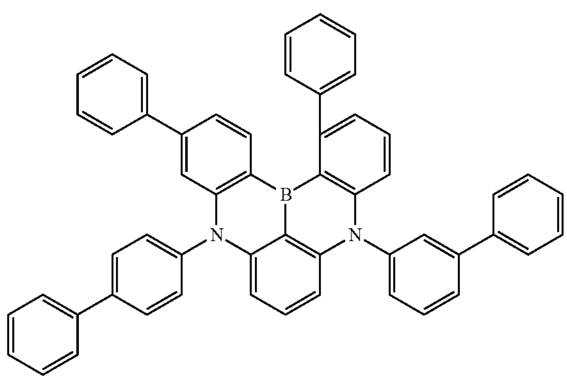
11
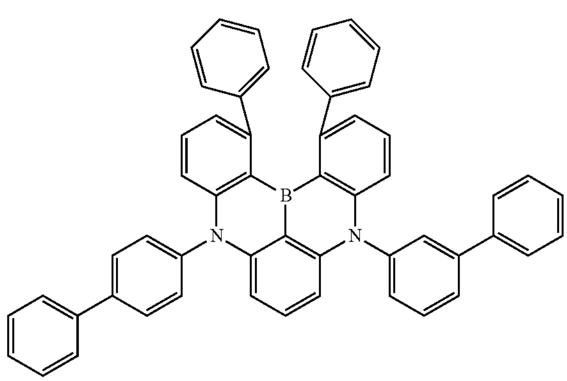
-continued
12
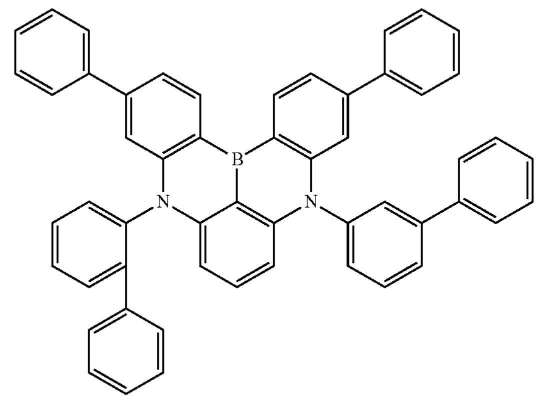
13
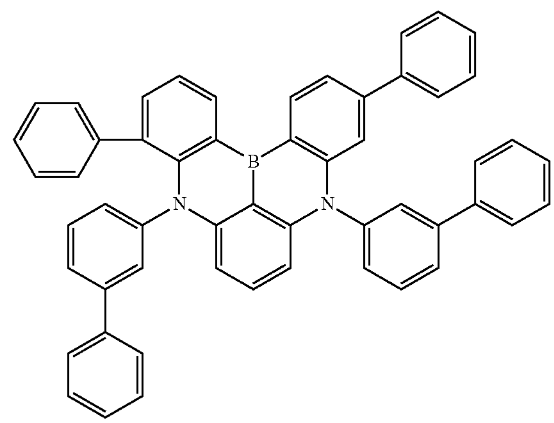
14
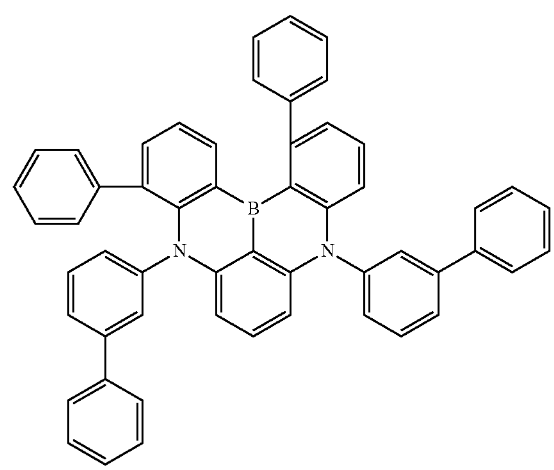

15
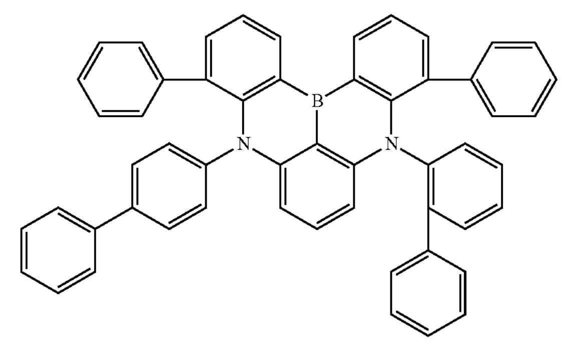
16
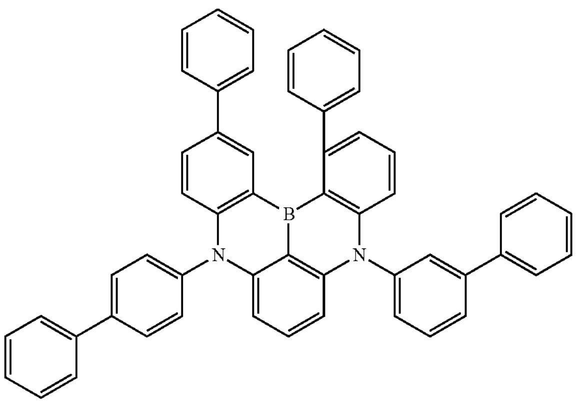
17
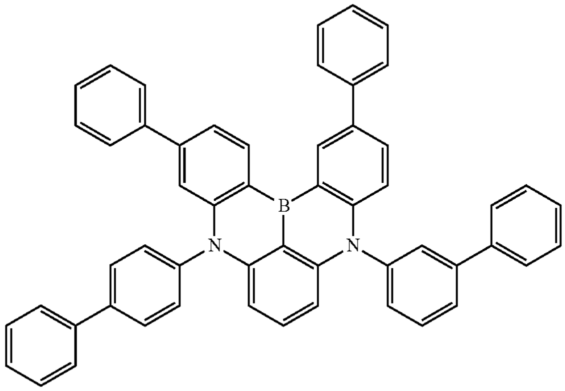
18
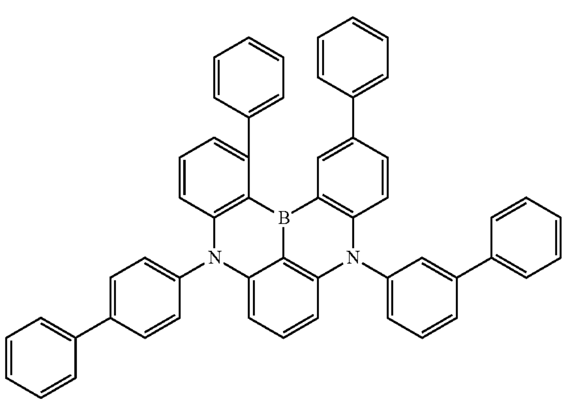
19
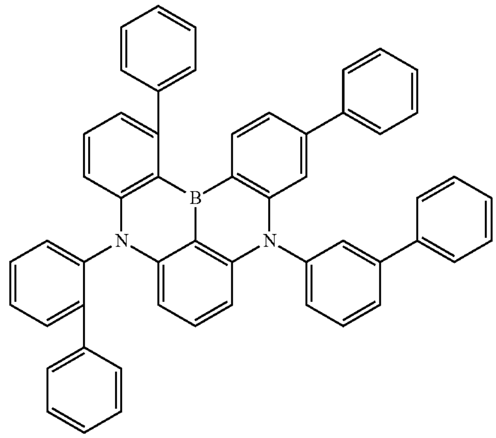
20
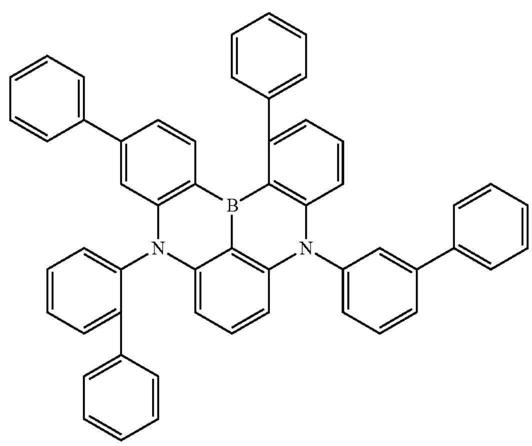
21
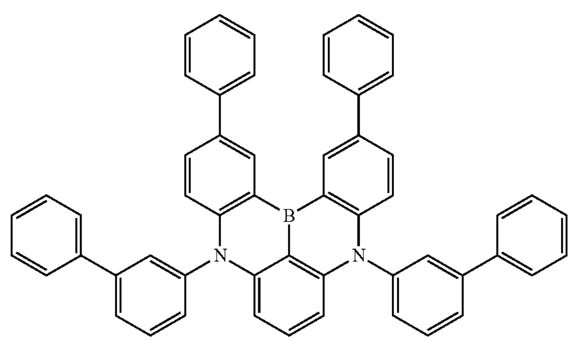
22
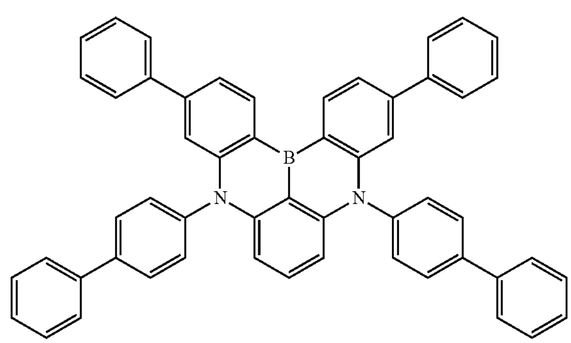

-continued
23
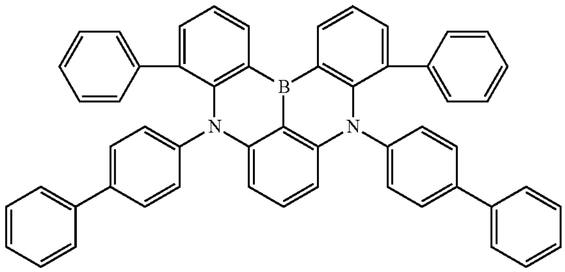
24
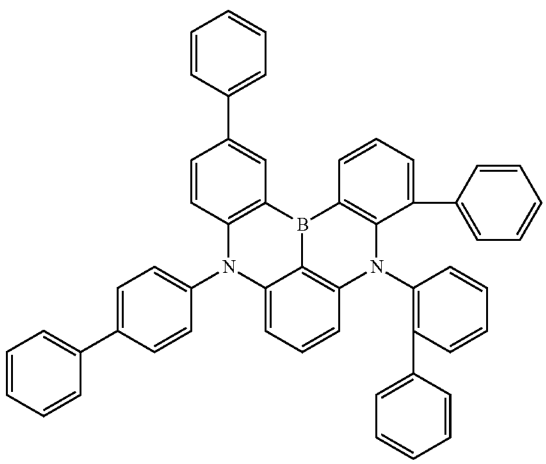
25
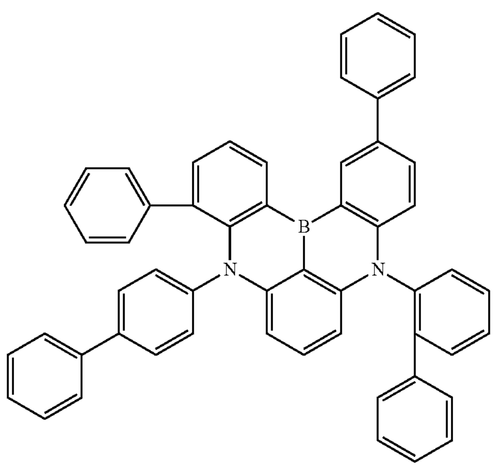
26
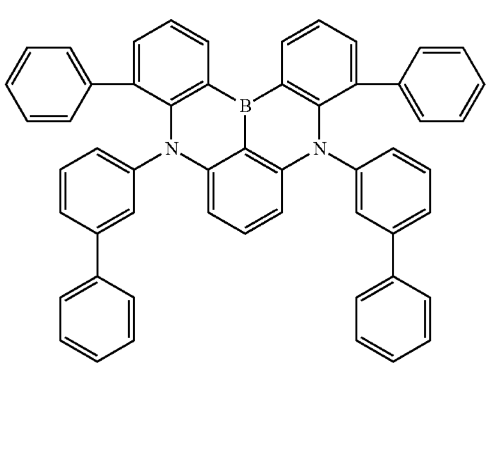
-continued
27
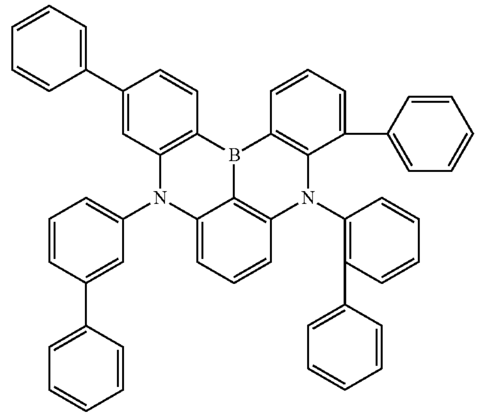
28
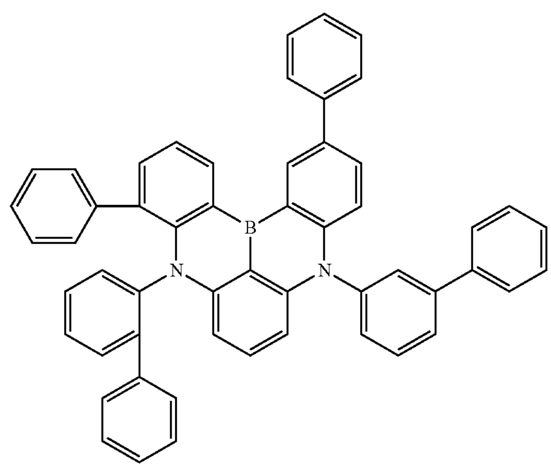
29
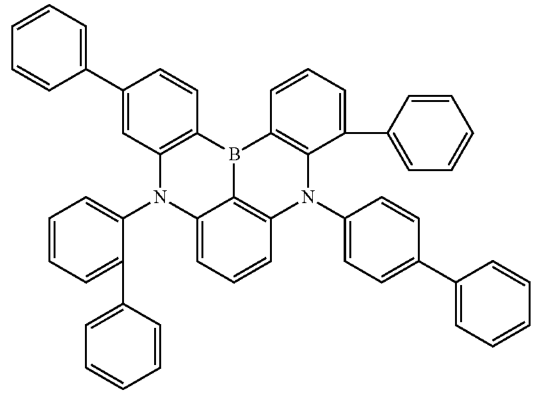

-continued
30
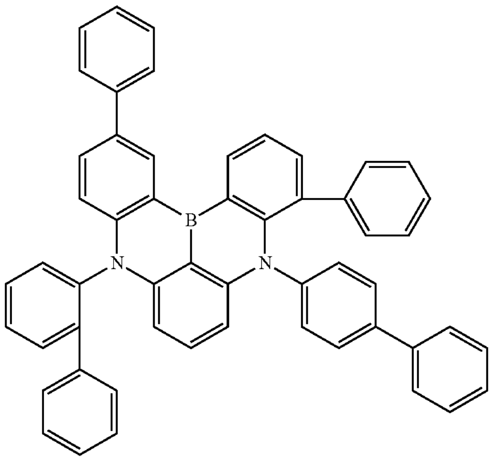
31
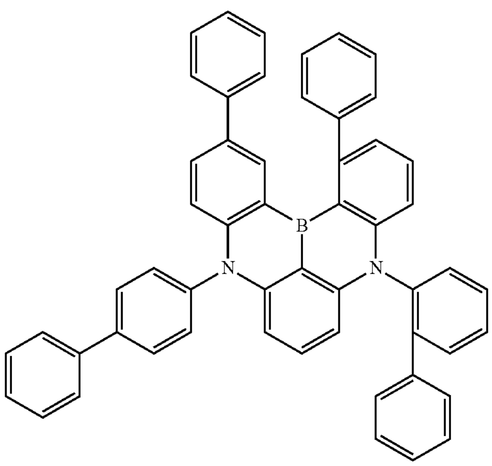
32
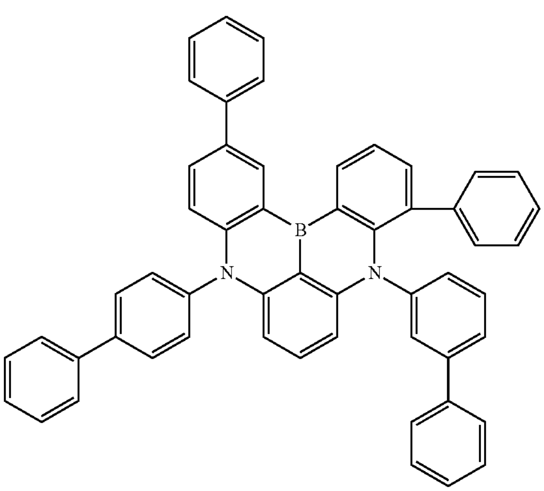
-continued
33
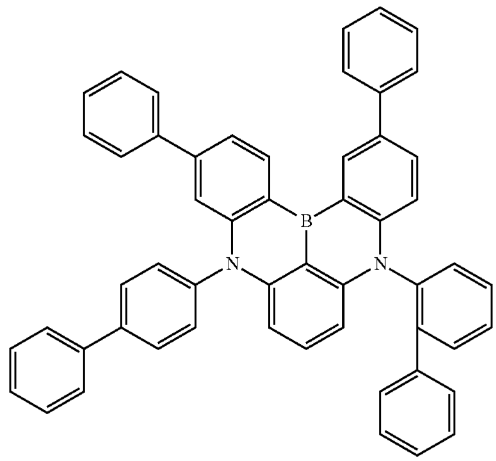
34
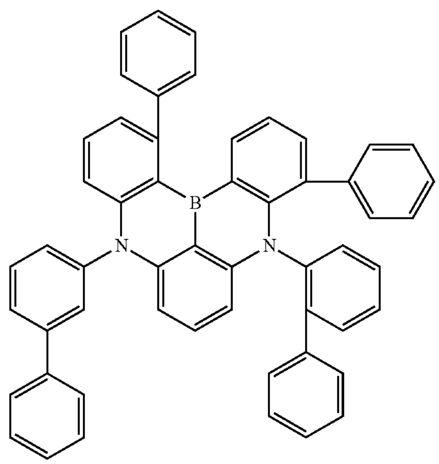
35
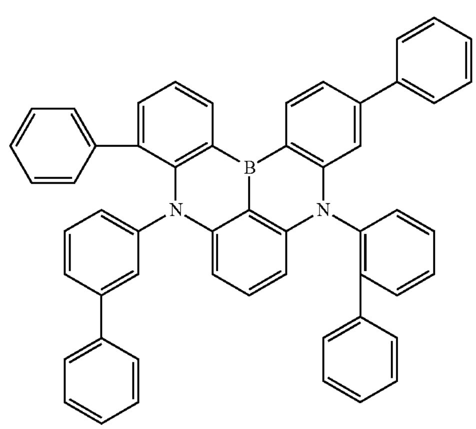

-continued
36
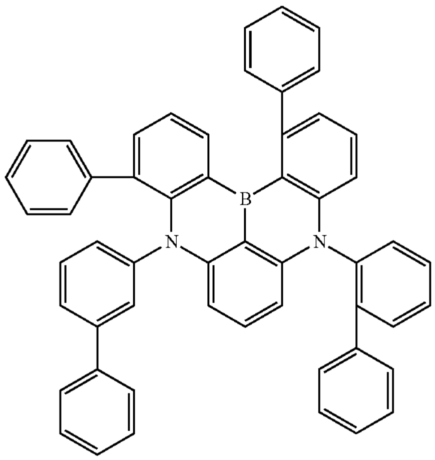
37
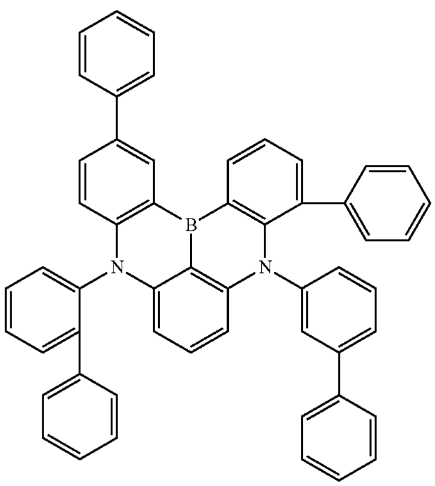
38
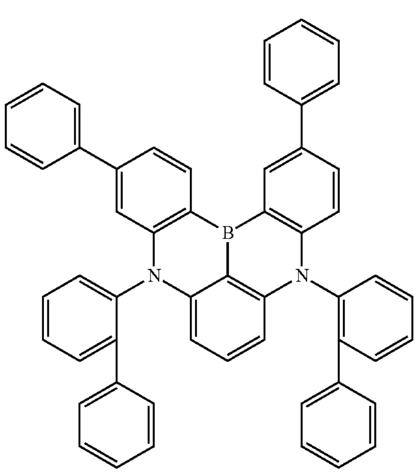
-continued
39
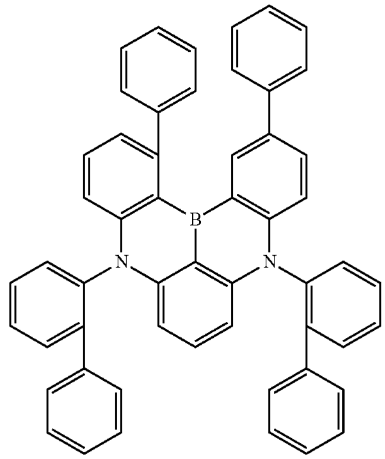
40
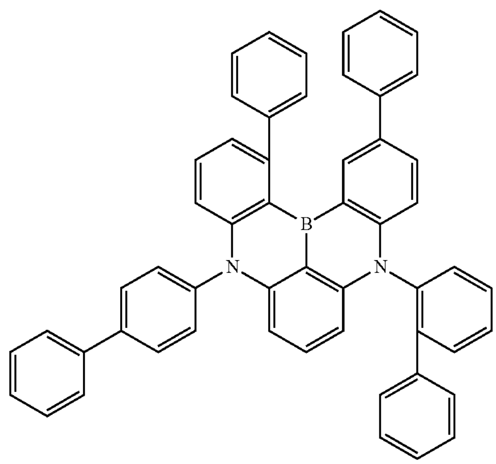
41
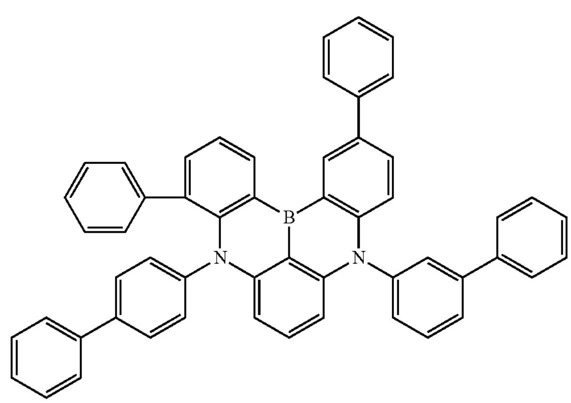

-continued
42
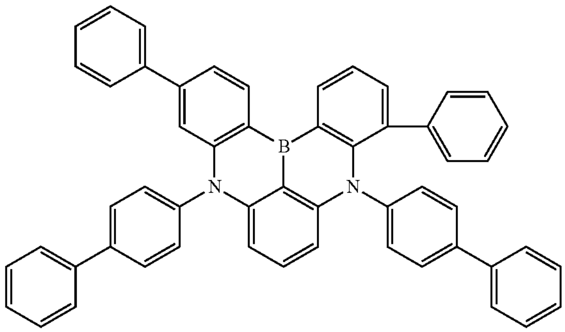
43
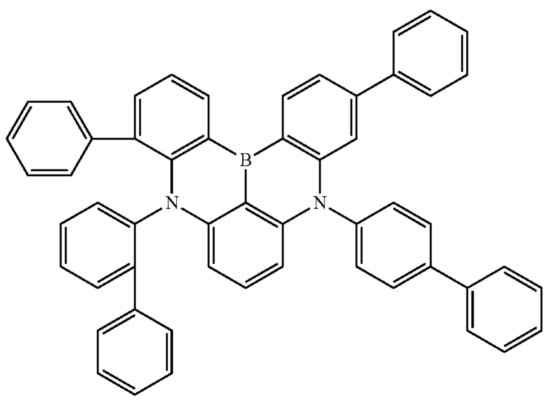
44
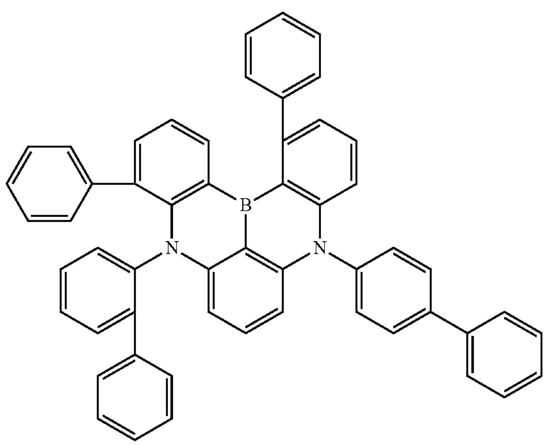
45
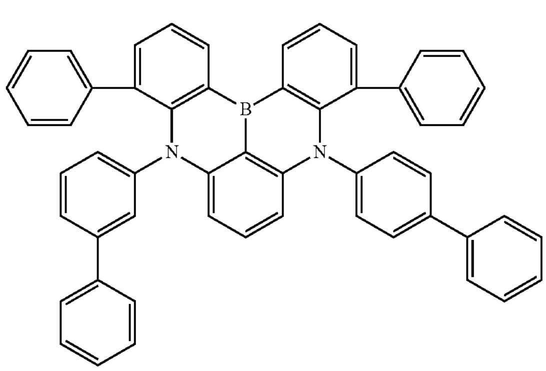
-continued
46
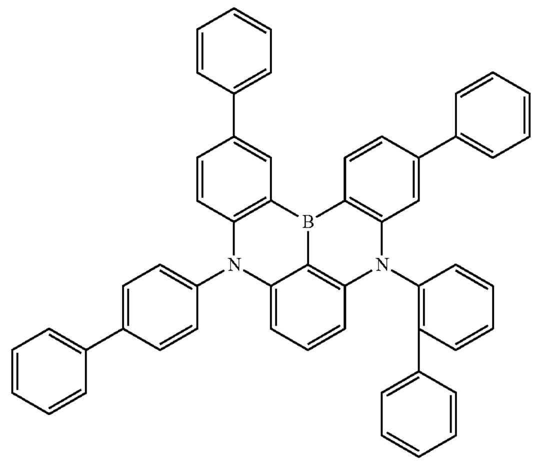
47
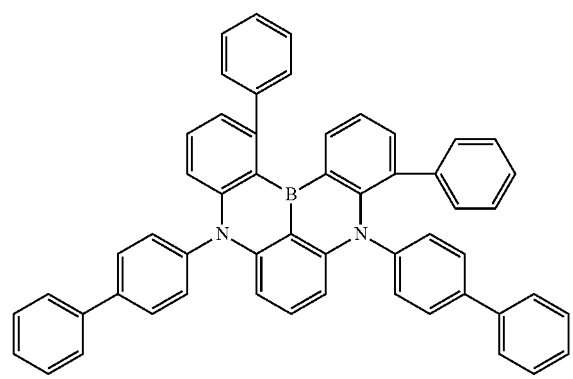
48
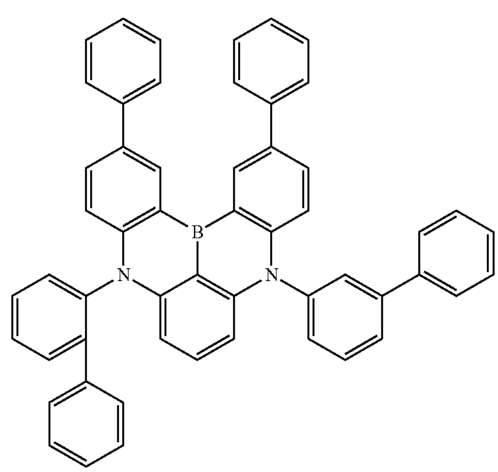

-continued
49
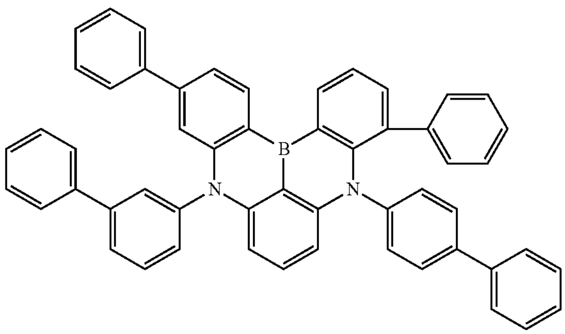
50
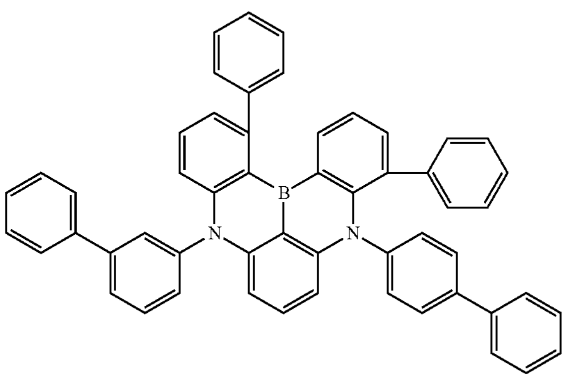
51
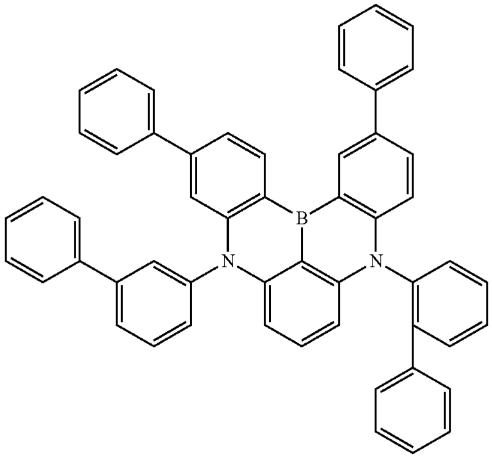
-continued
52
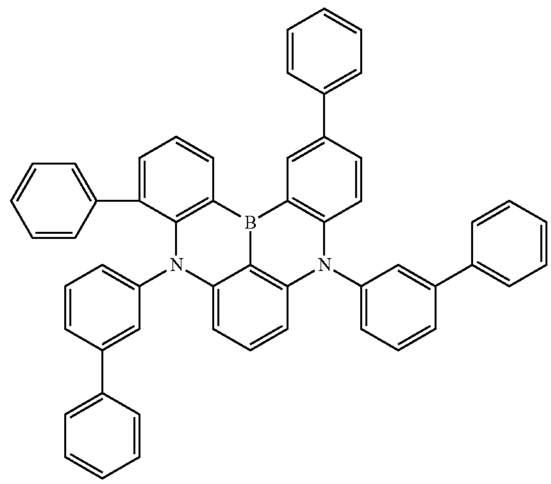
53
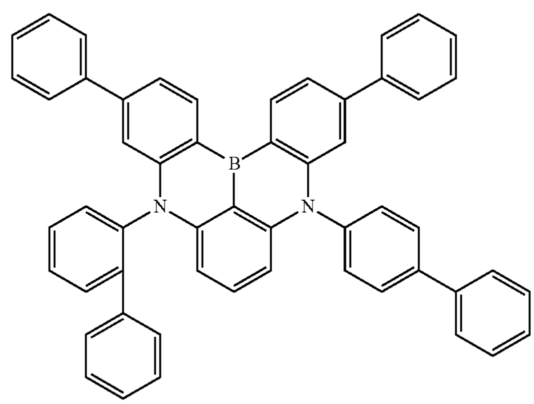
54
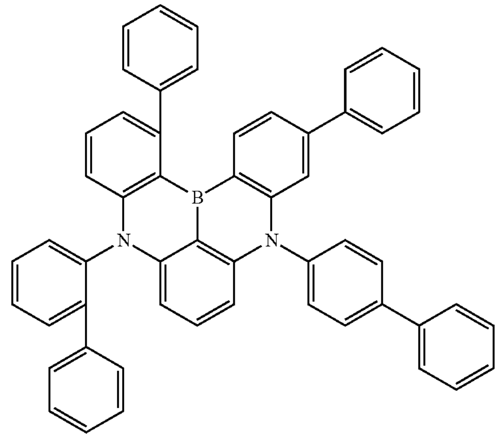

-continued
55
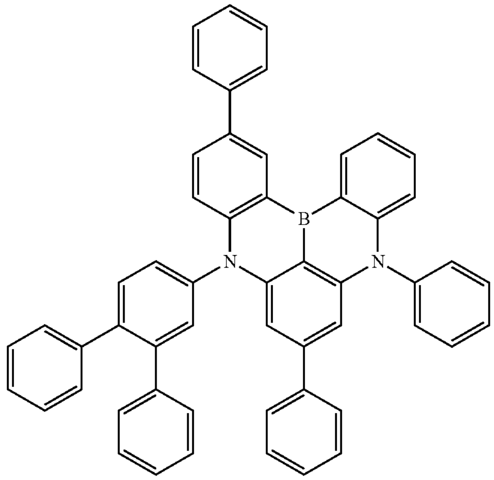
56
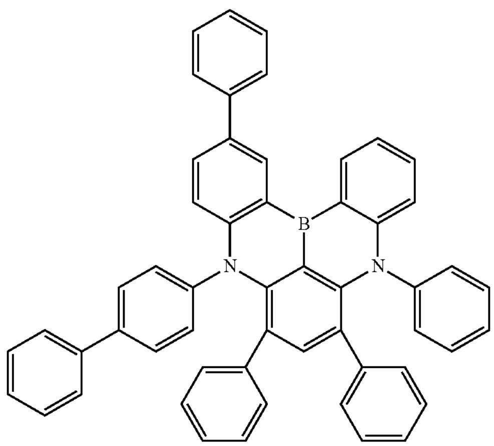
57
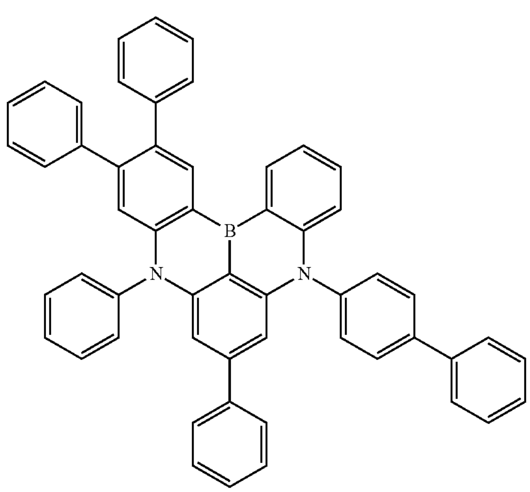
-continued
58
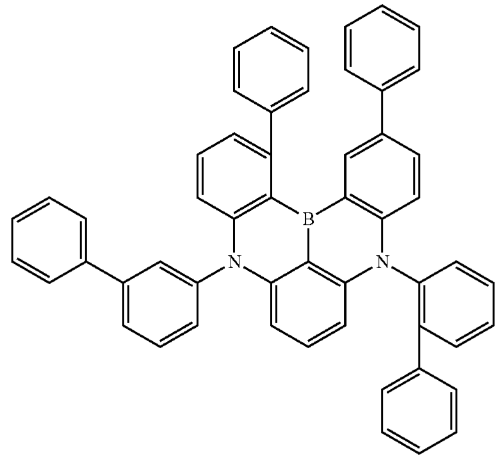
59
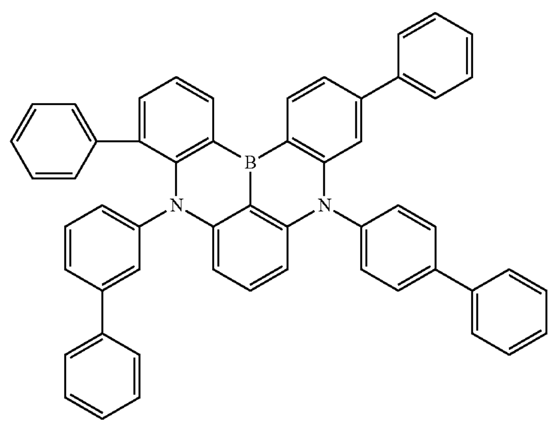
60
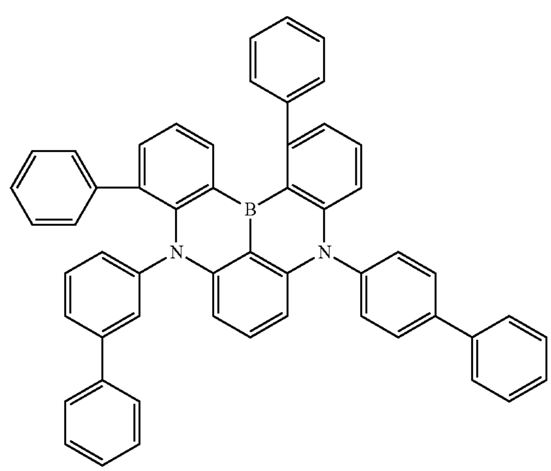

61
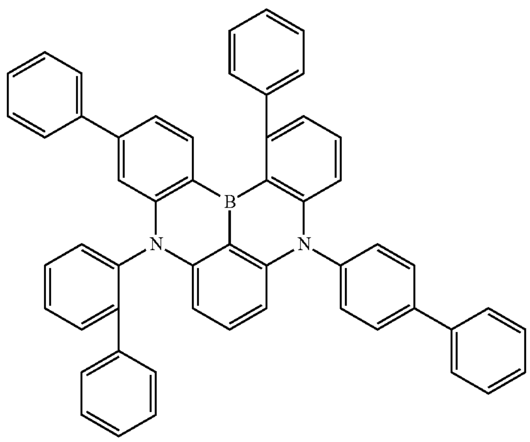
62
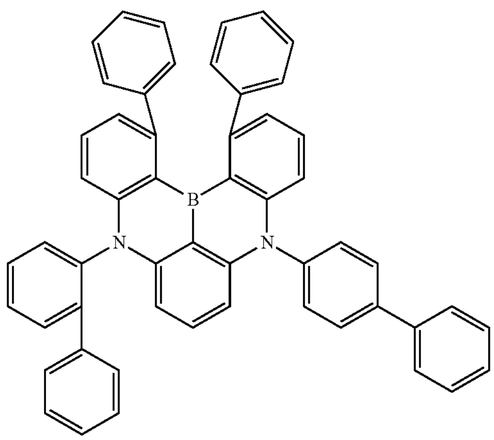
63
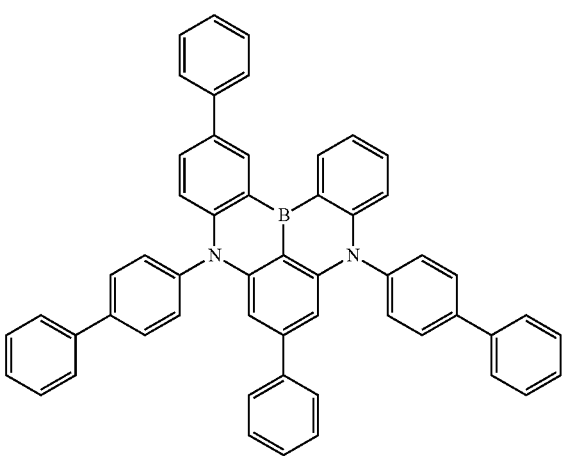
64
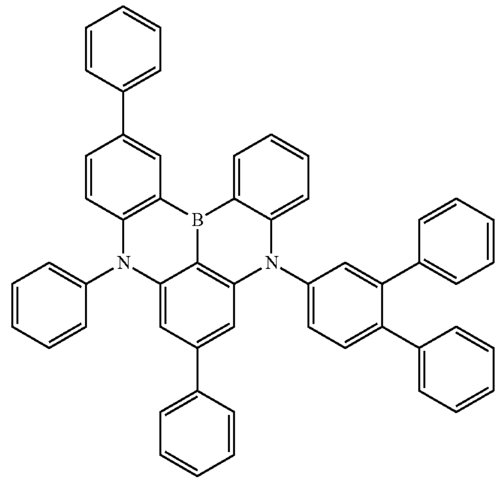
65
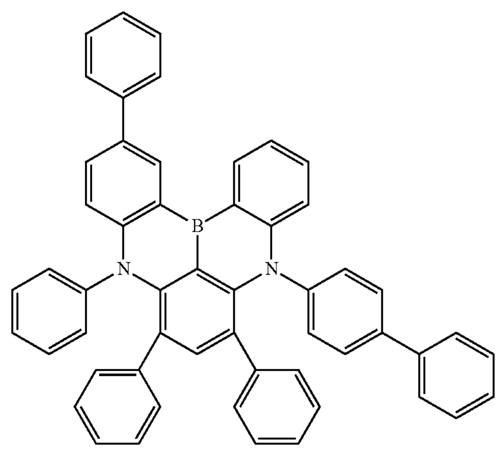
66
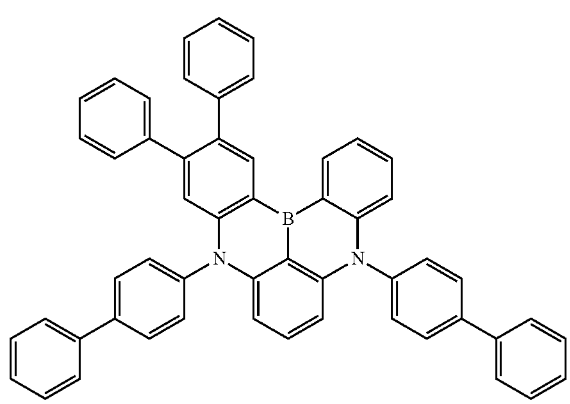

-continued
67
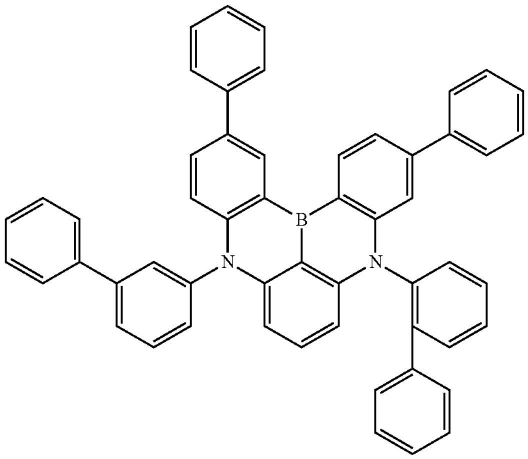
68
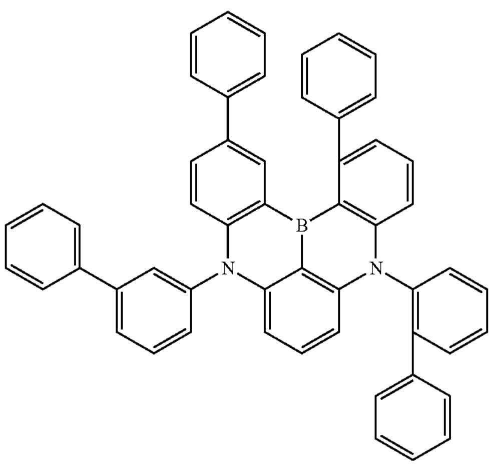
69
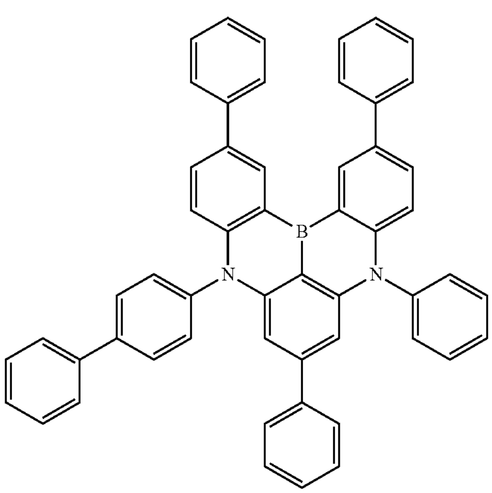
-continued
70
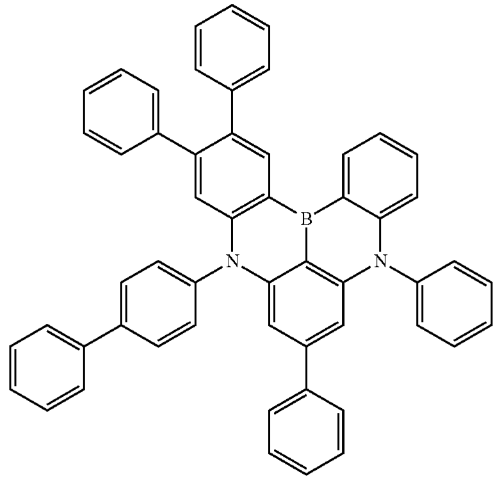
71
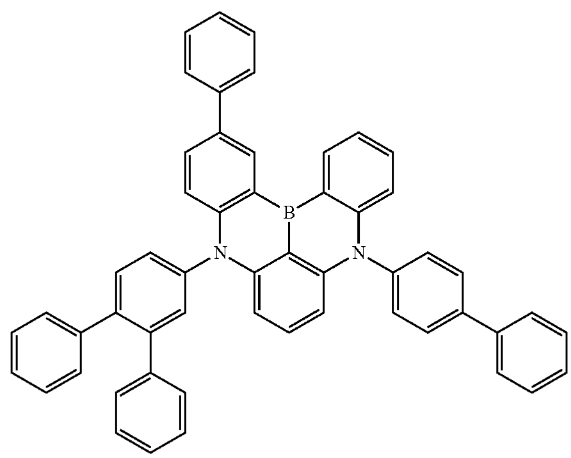
72
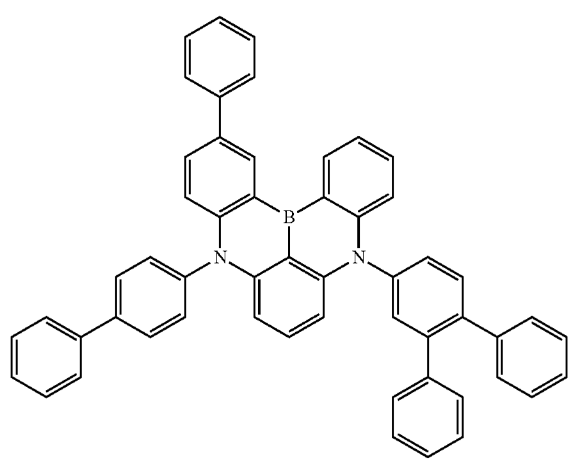

-continued
73
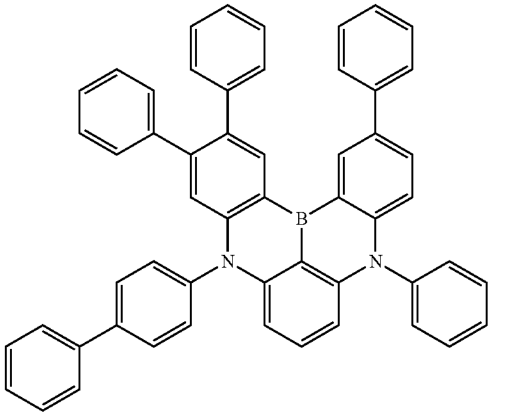
74
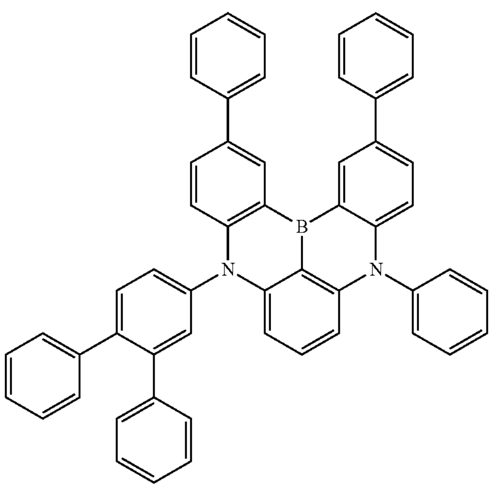
75
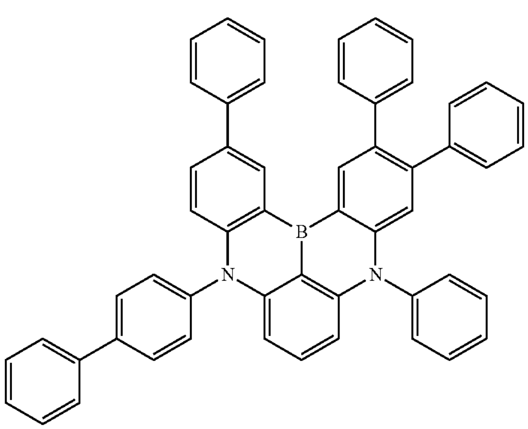
-continued
76
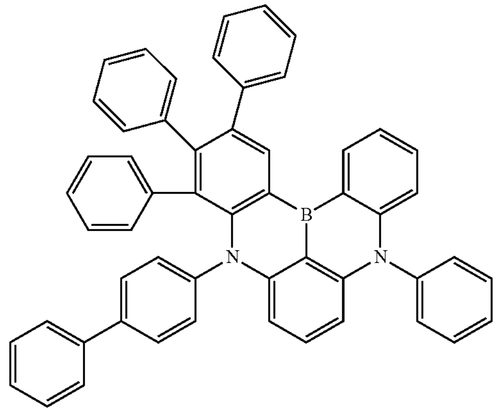
77
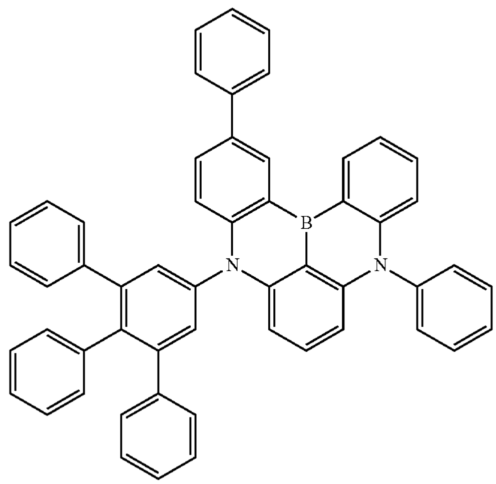
78
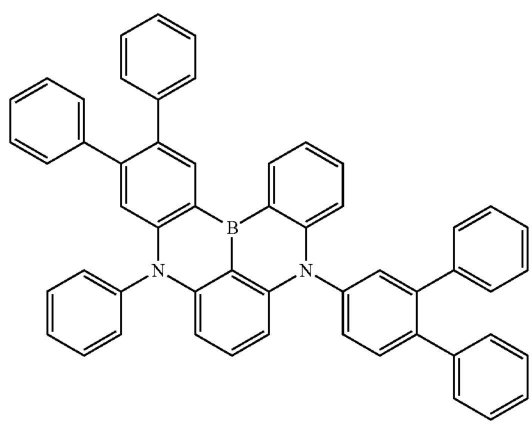
79
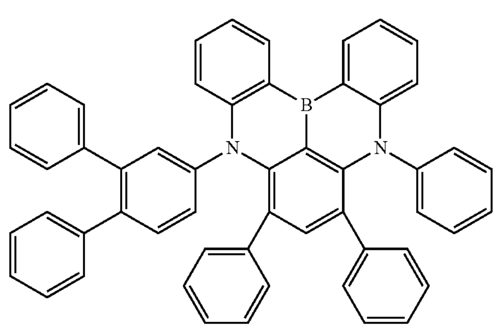

-continued
80
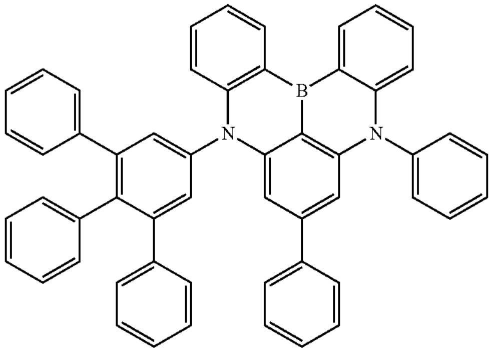
81
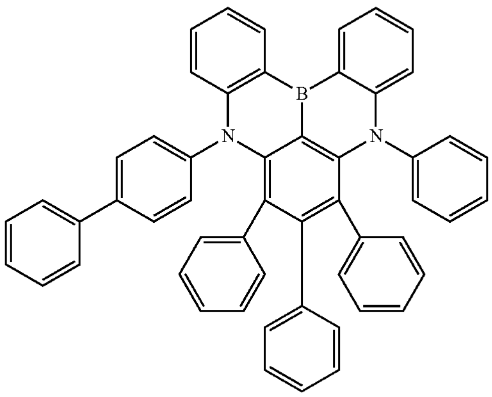
82
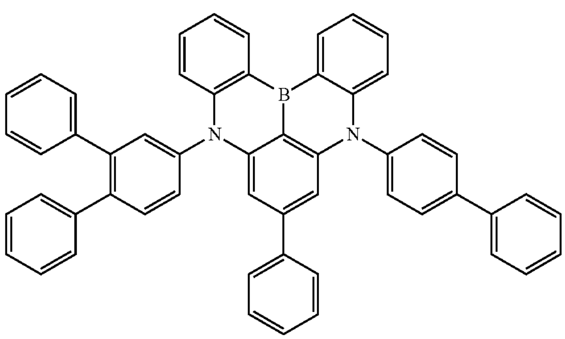
83
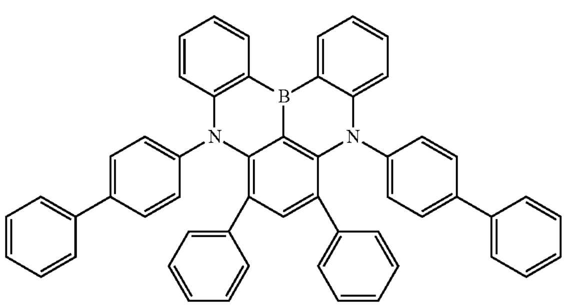
-continued
84
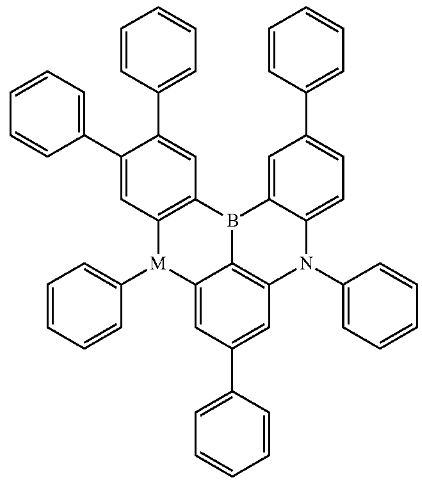
85
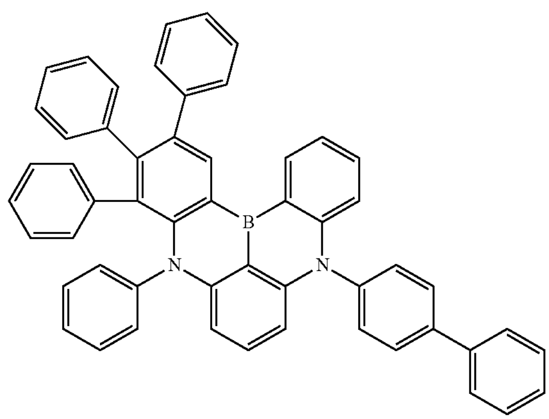
86
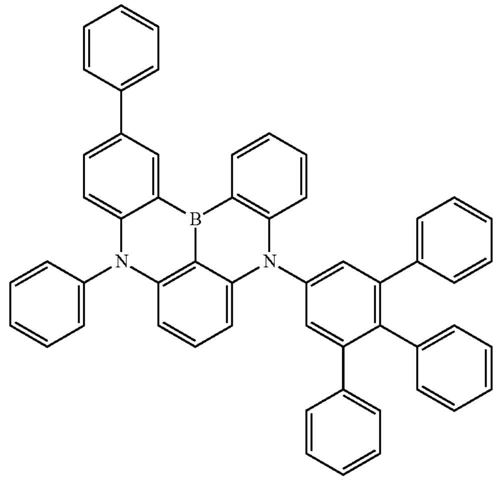

87
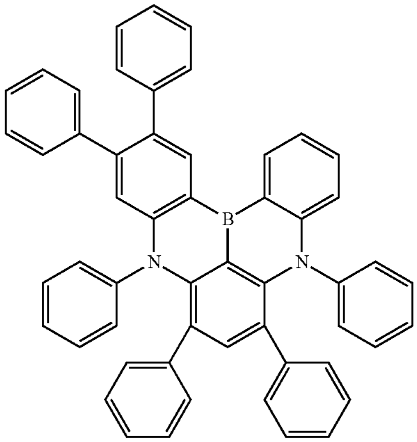
88
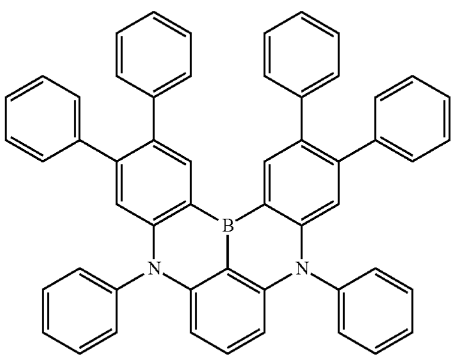
89
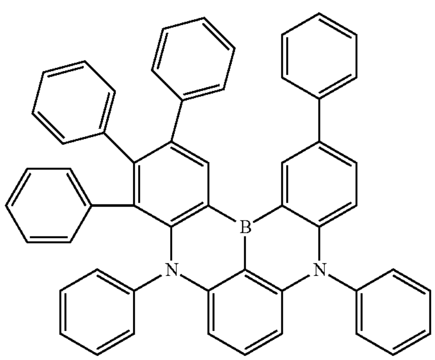
90
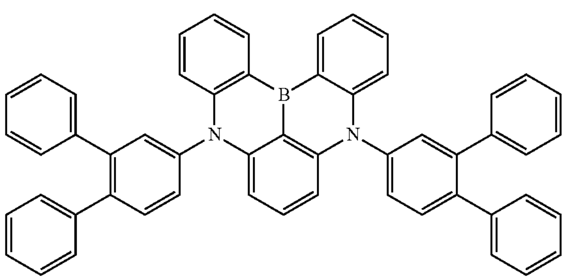
91
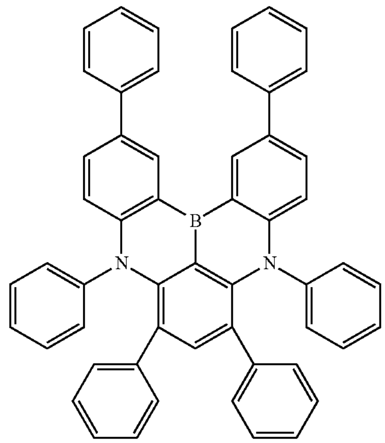
92
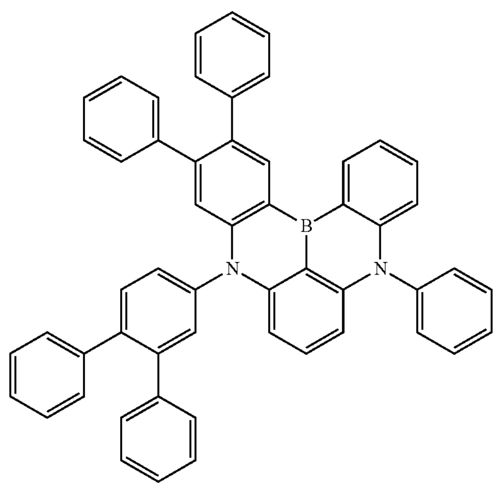
93
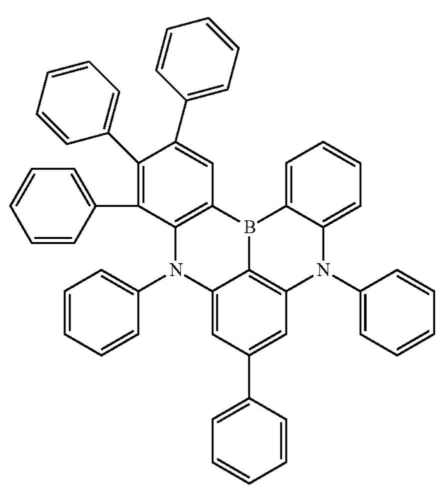

-continued
94
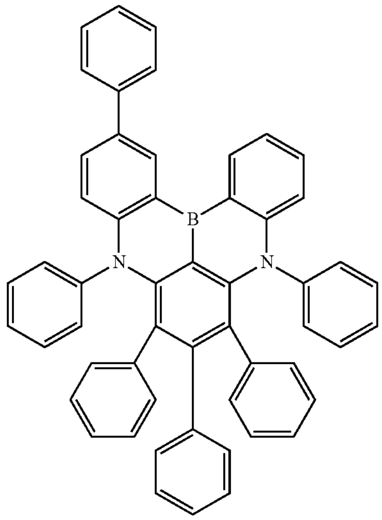
95
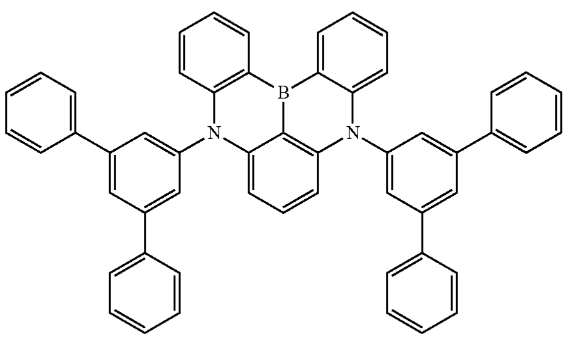
96
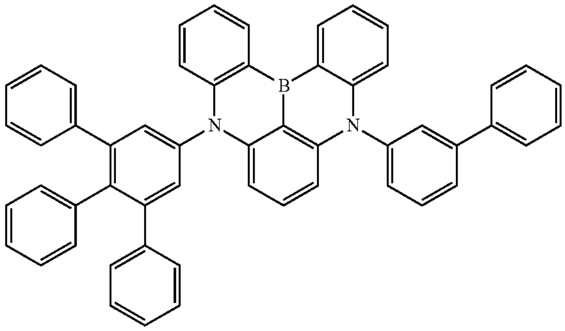
-continued
97
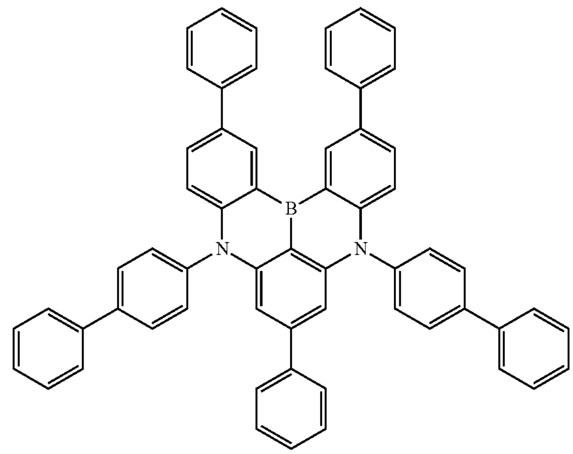
98
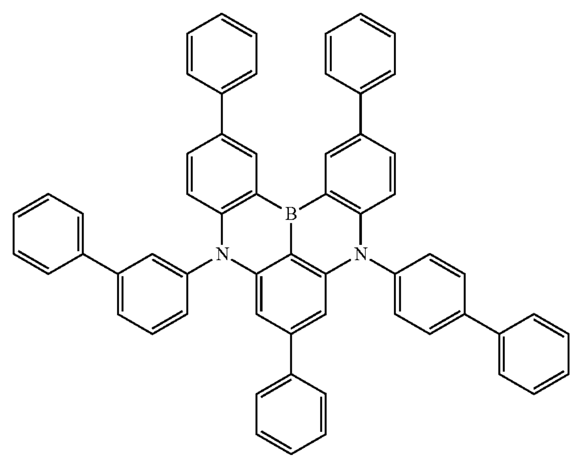
99
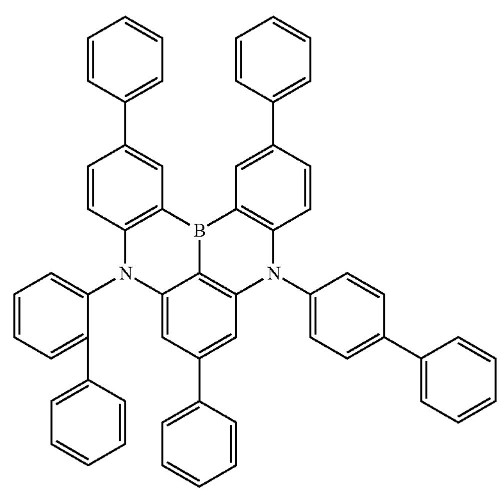

-continued
100
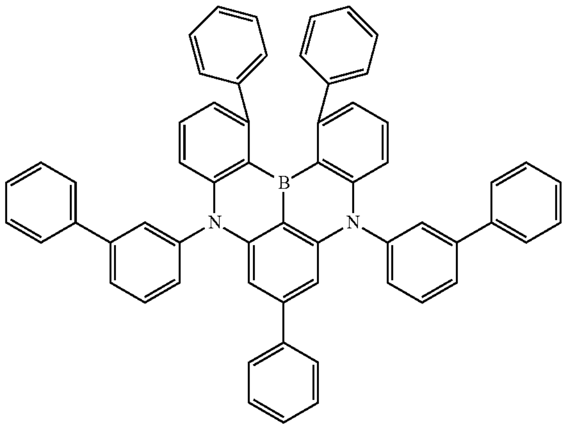
101
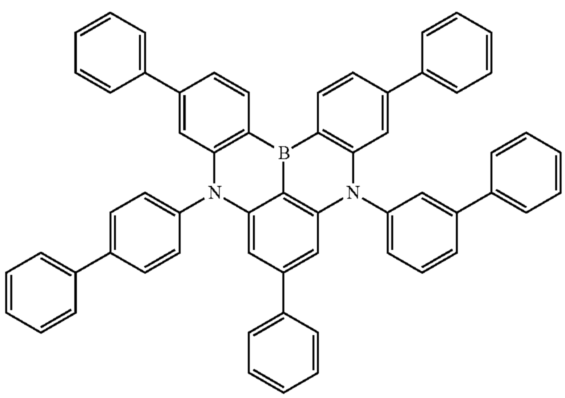
102
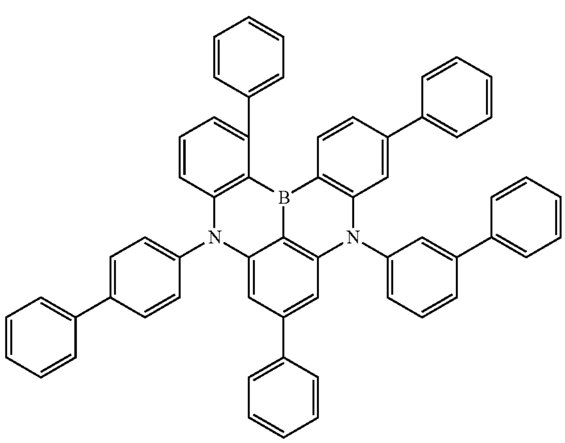
-continued
103
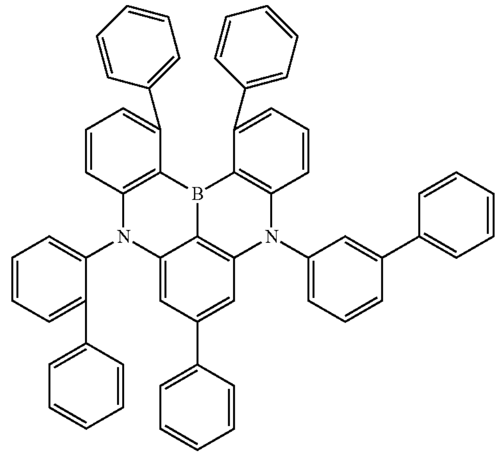
104
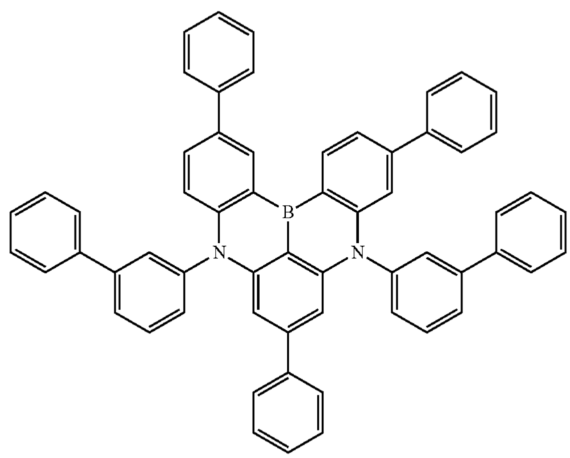
105
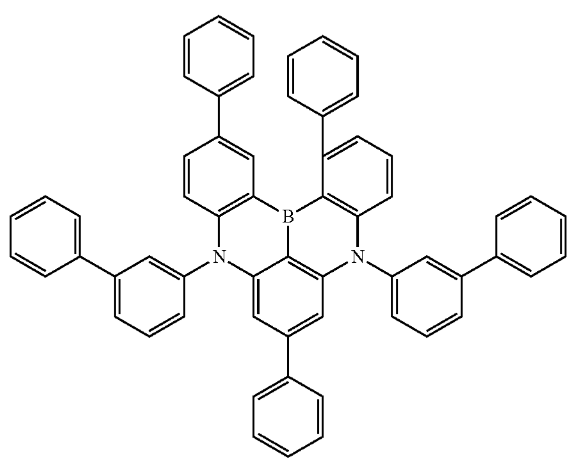

106
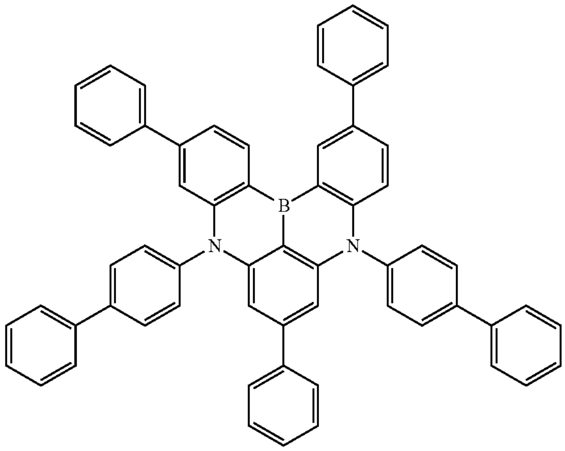
107
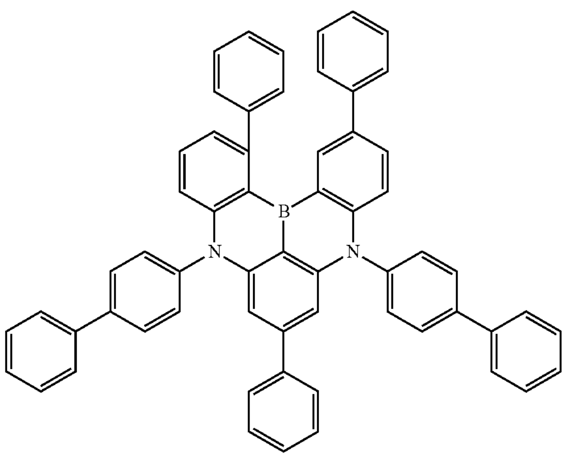
108
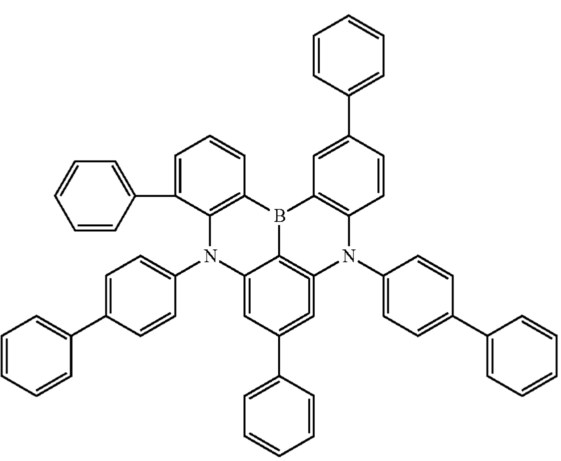
109
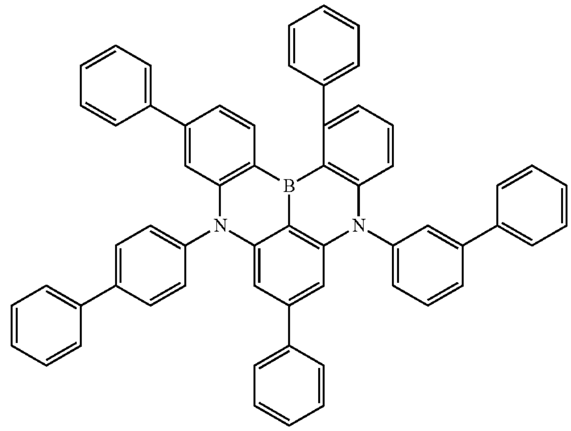
110
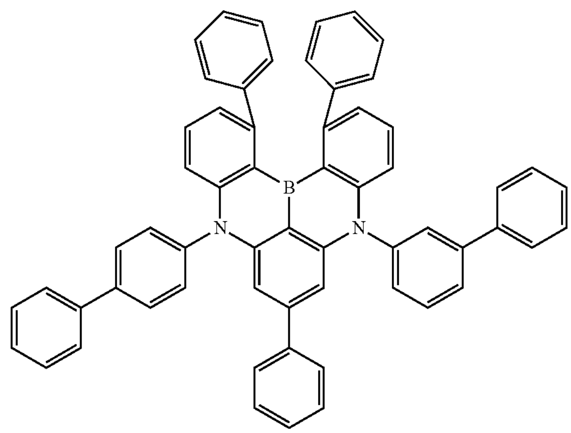
111
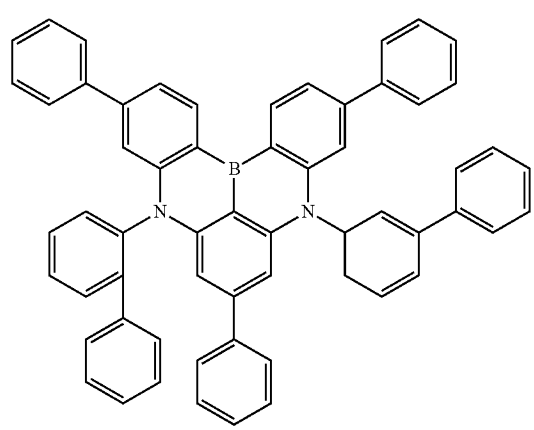

-continued
112
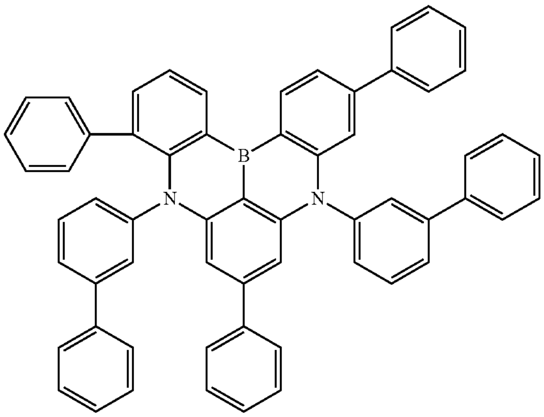
113
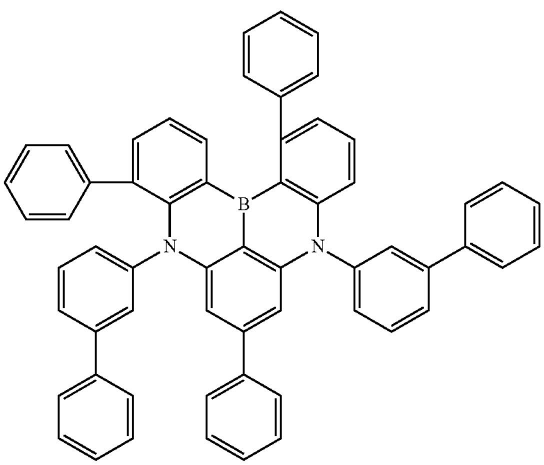
114
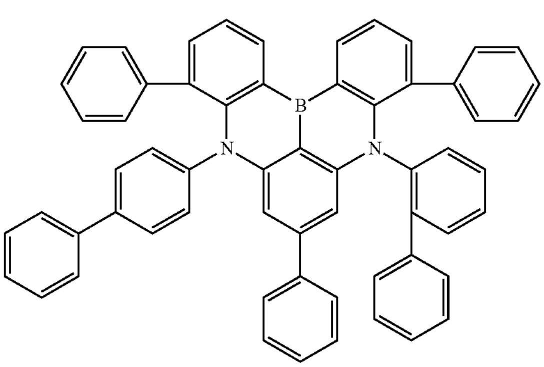
-continued
115
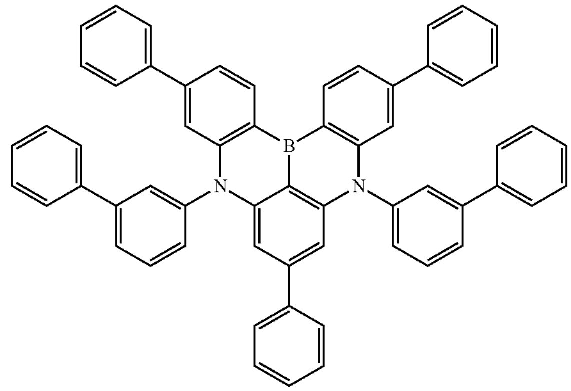
116
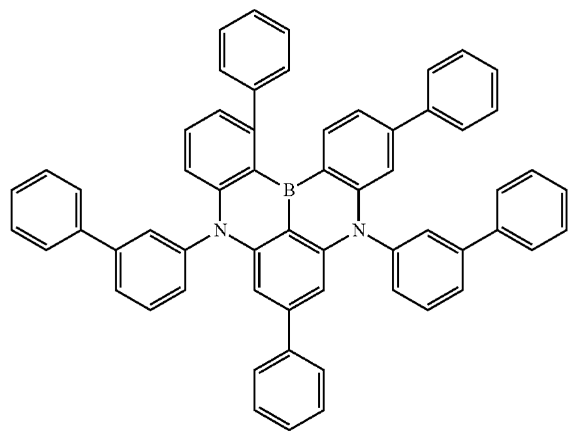
117
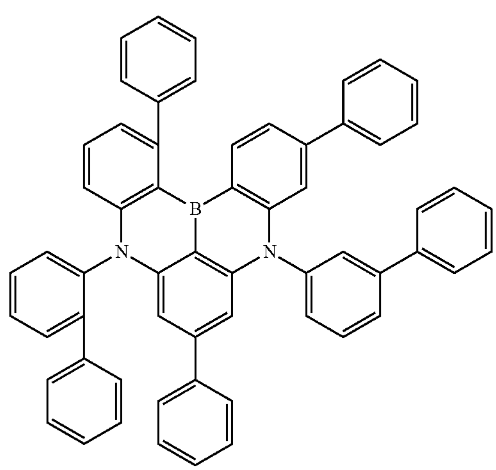

-continued
118
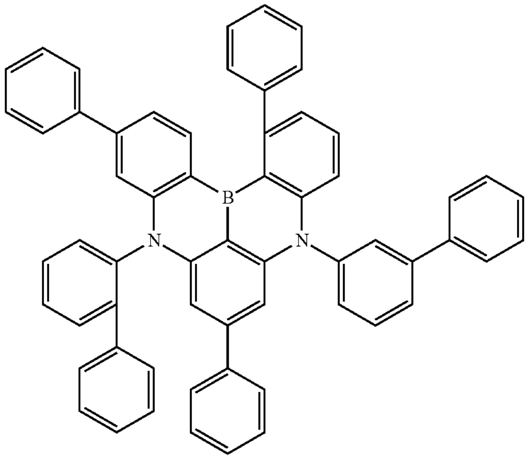
119
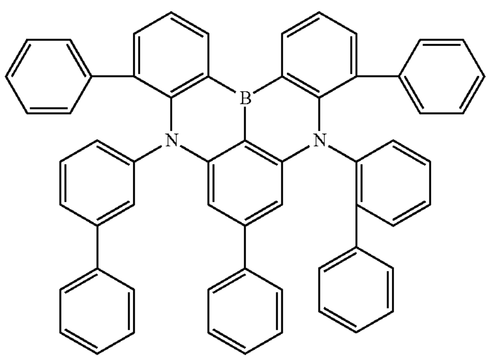
120
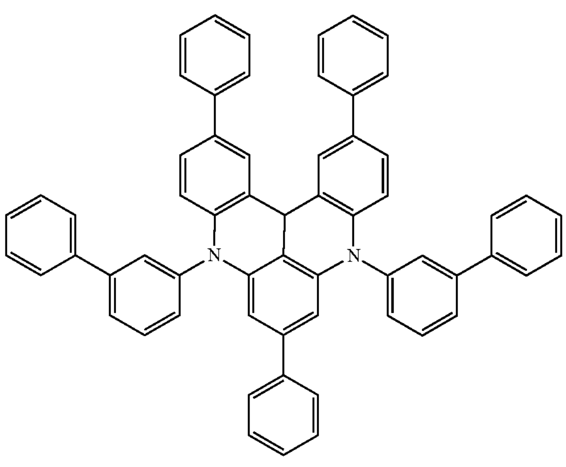
-continued
121
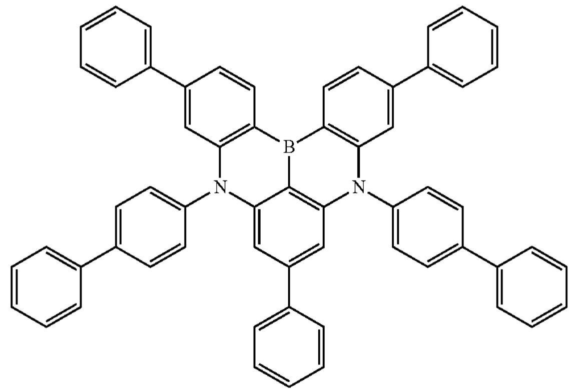
122
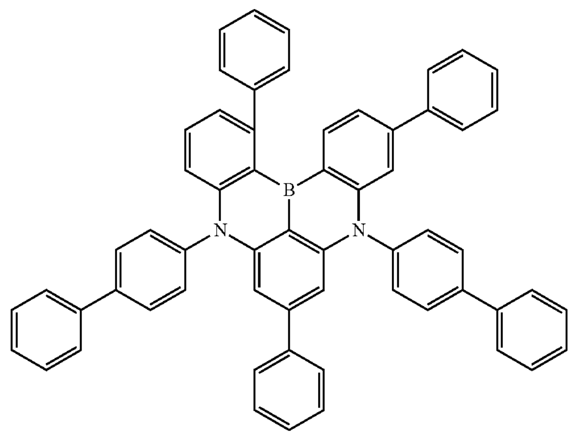
123
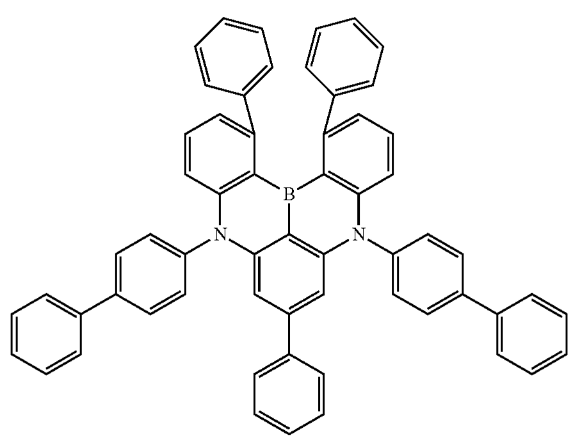

-continued
124
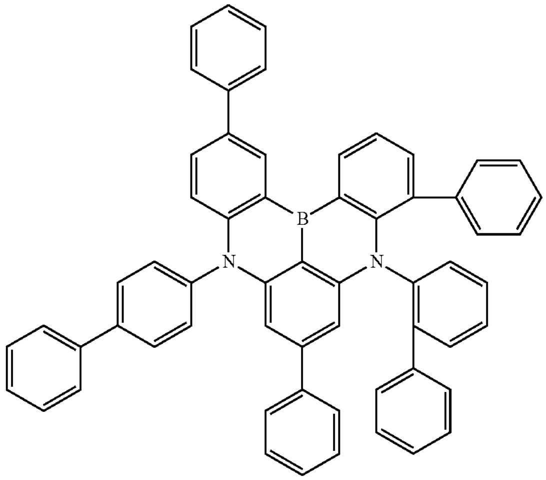
125
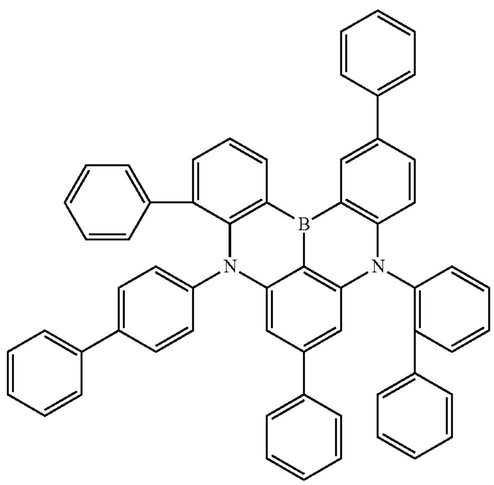
126
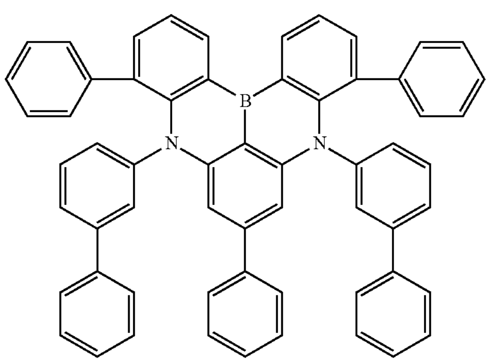
-continued
127
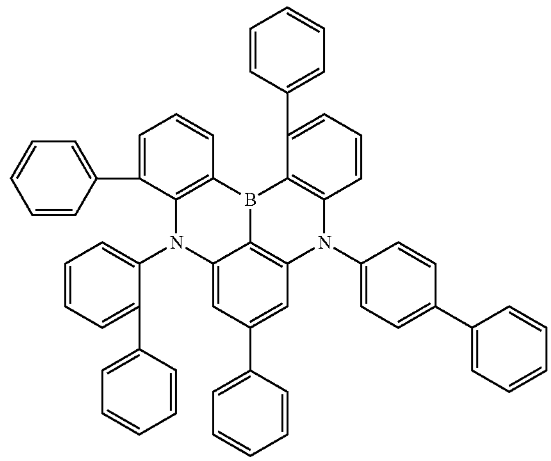
128
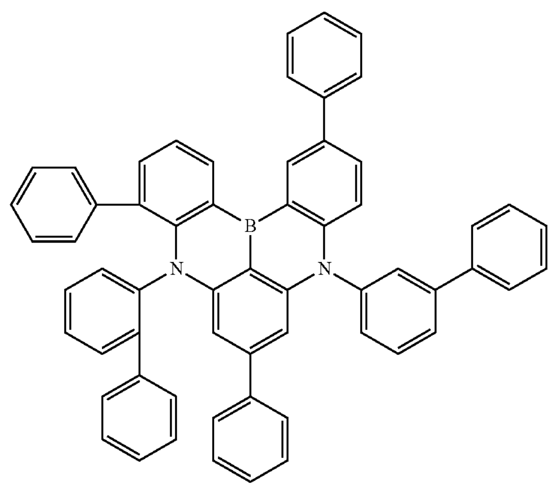
129
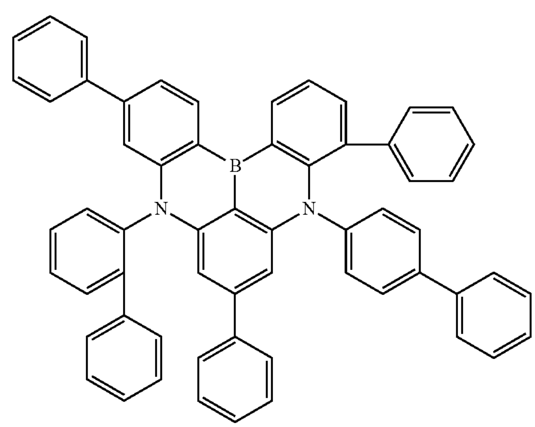

-continued
130
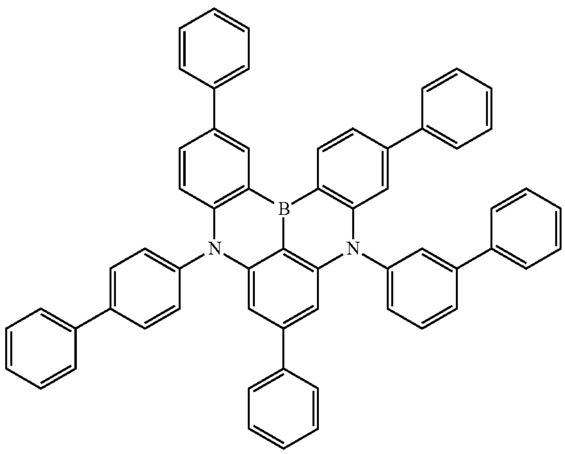
131
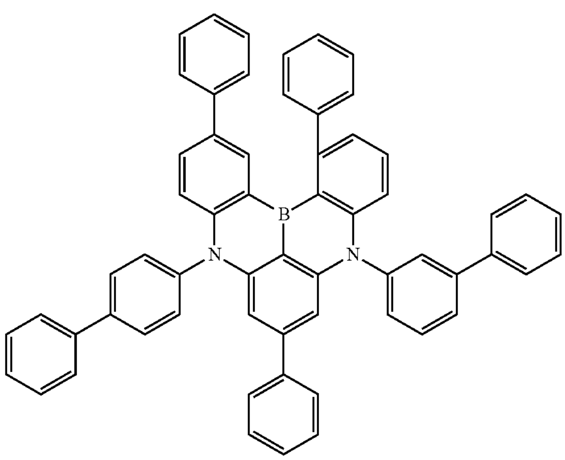
132
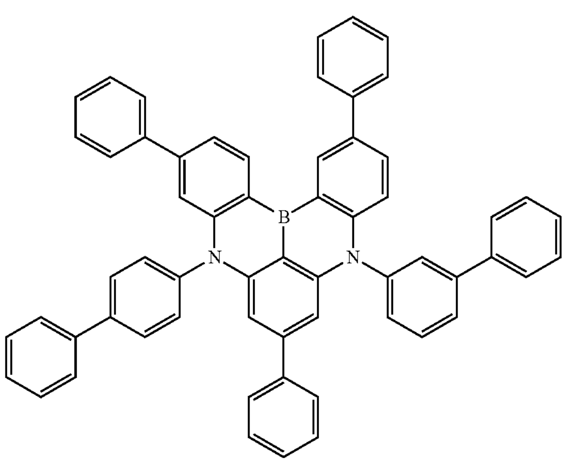
-continued
133
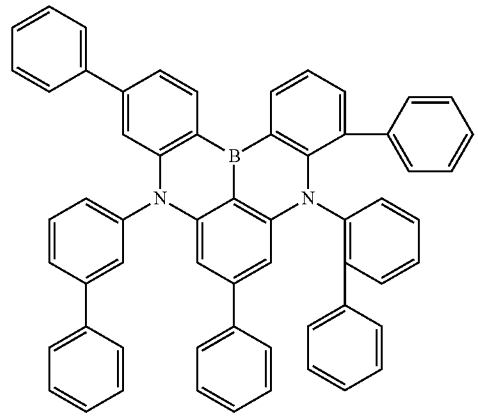
134
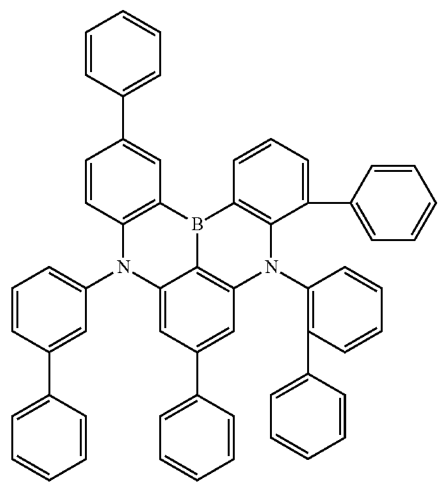
135
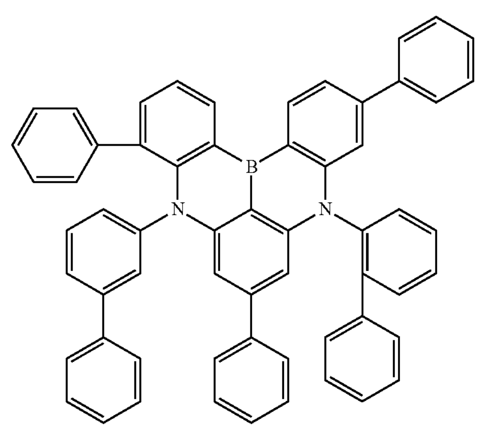

-continued
136
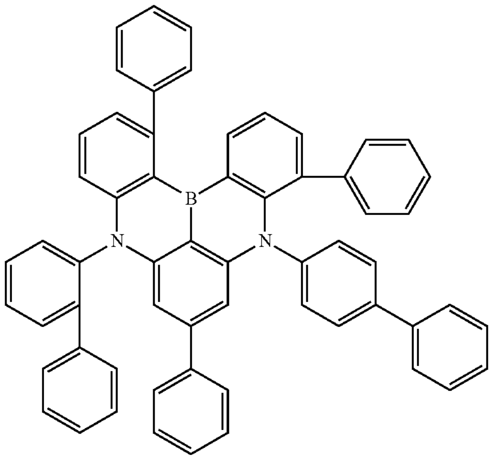
137
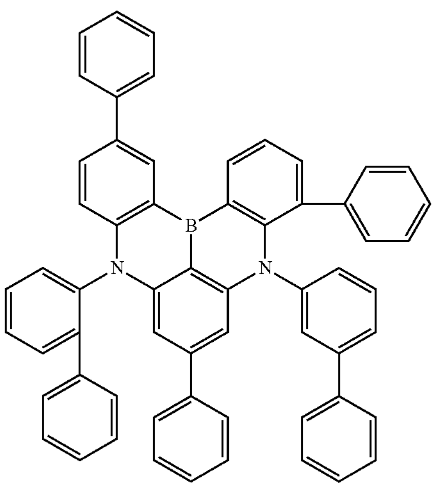
138
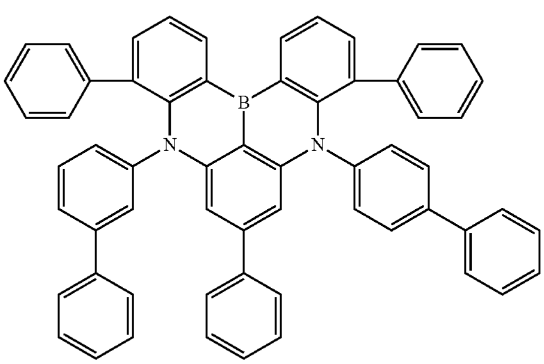
-continued
139
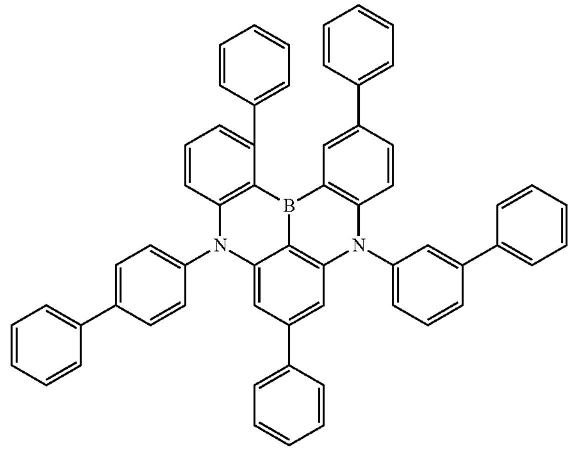
140
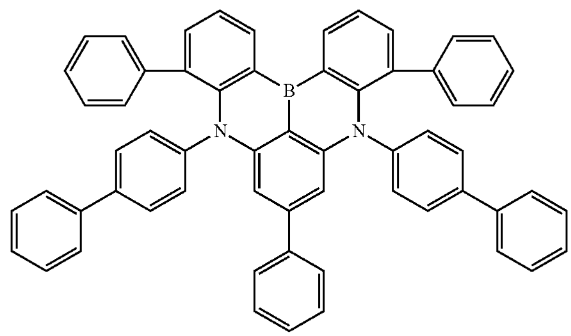
141
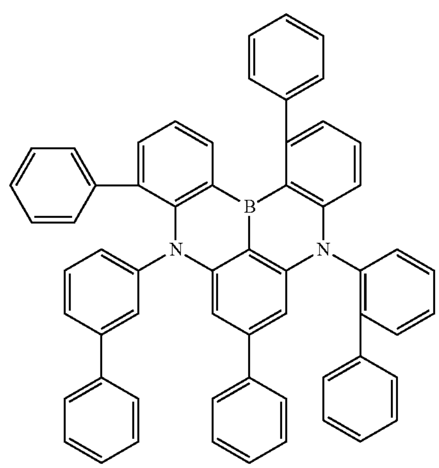

-continued
142
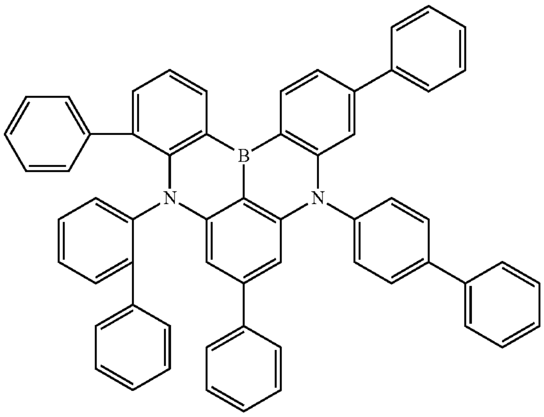
143
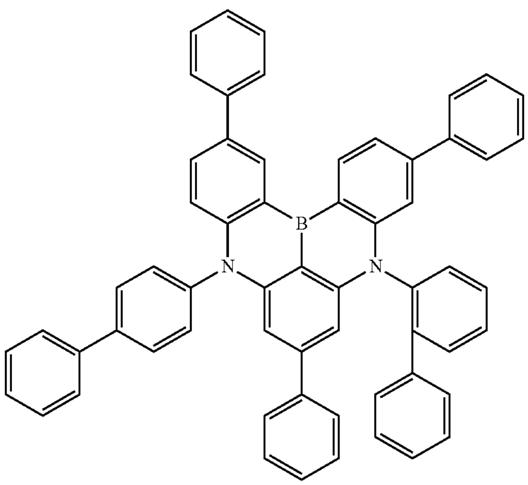
144
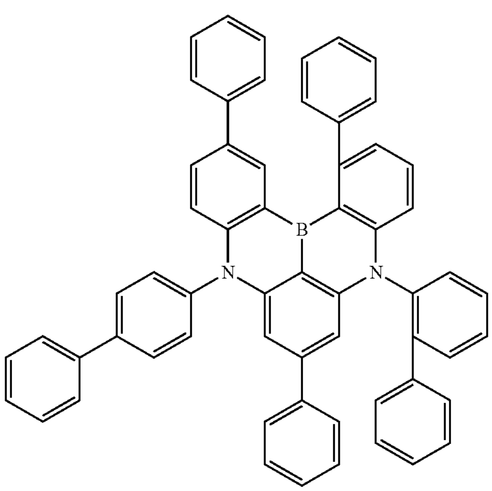
-continued
145
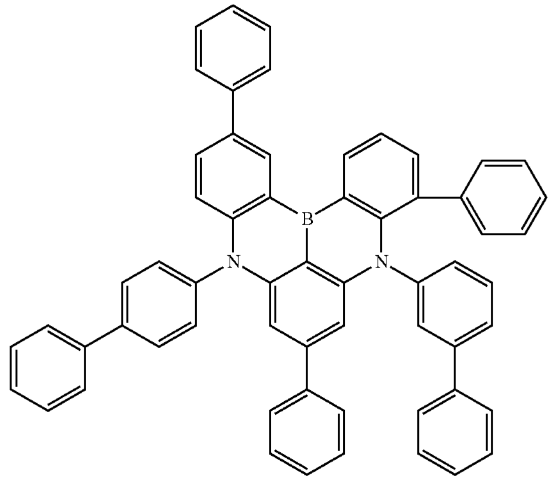
146
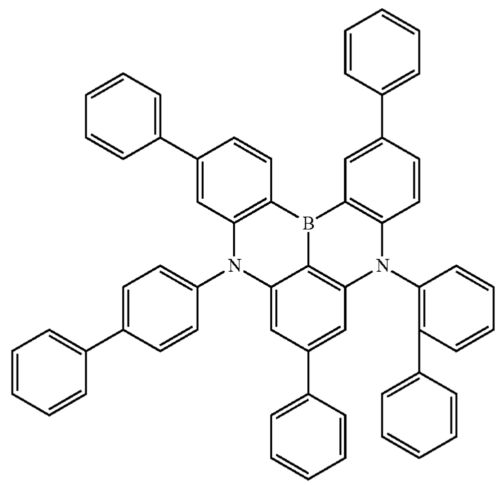
147
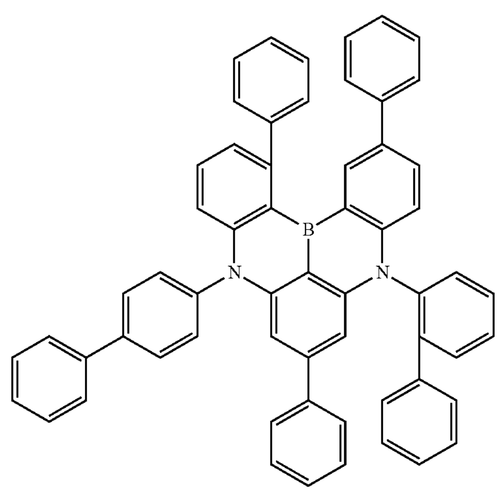

-continued
148
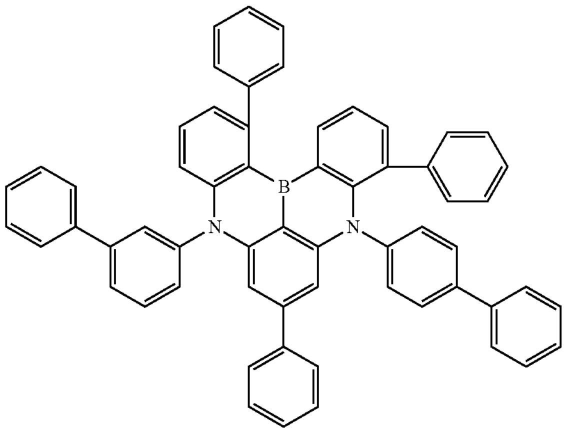
149
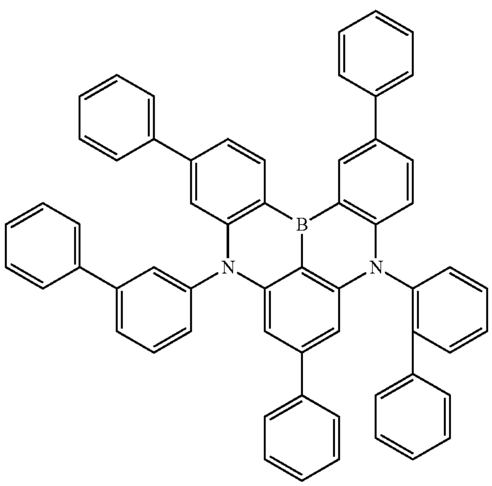
150
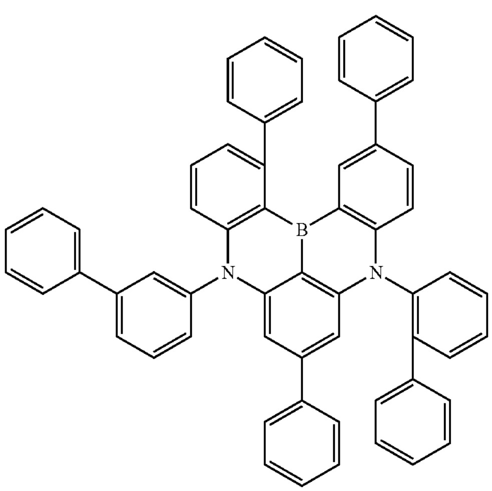
-continued
151
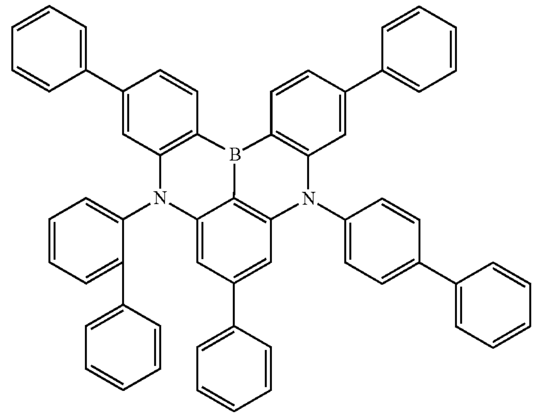
152
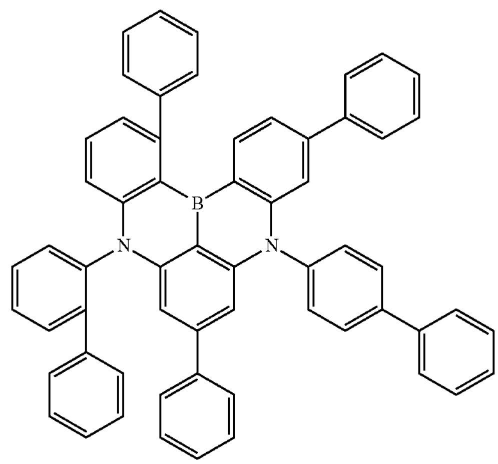
153
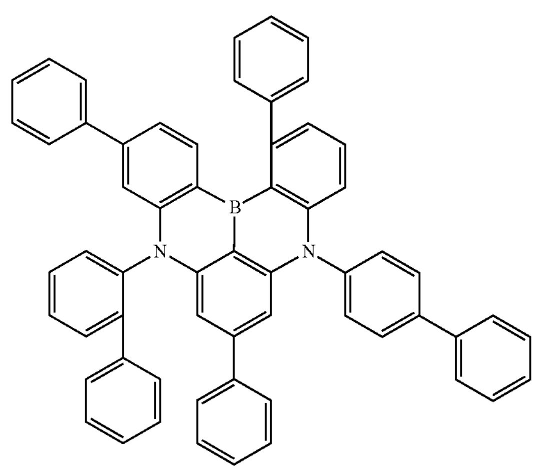

-continued
154
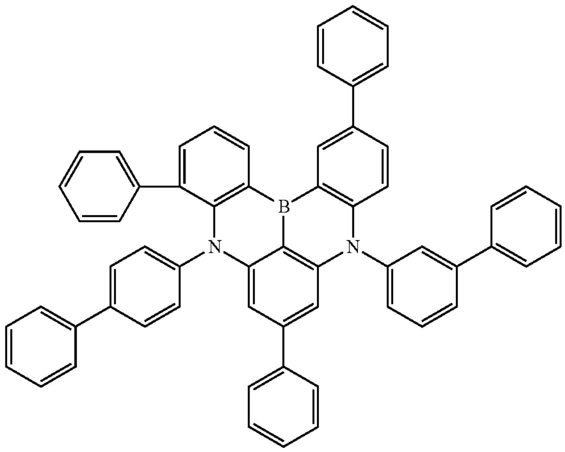
155
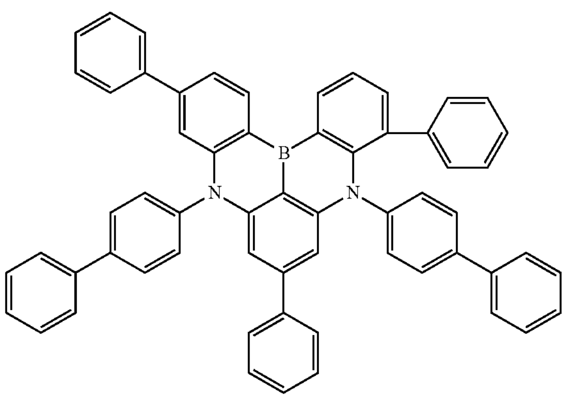
156
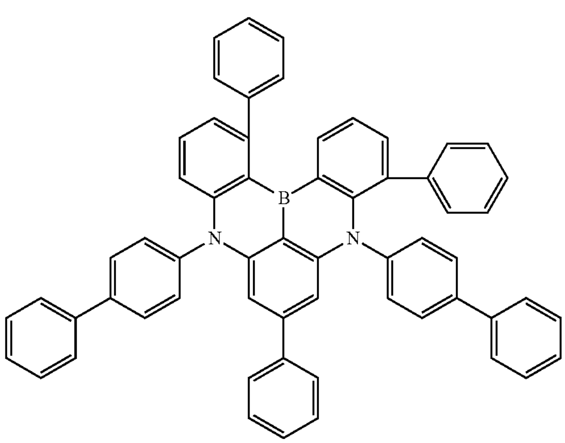
-continued
157
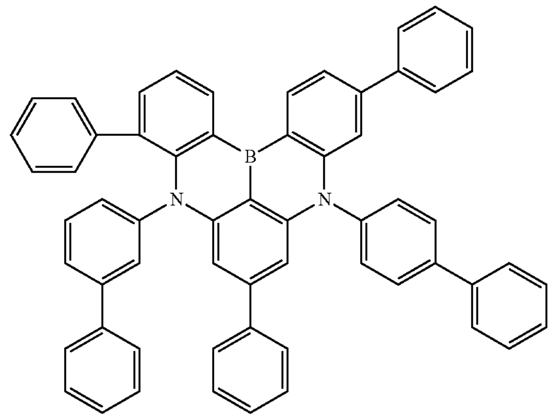
158
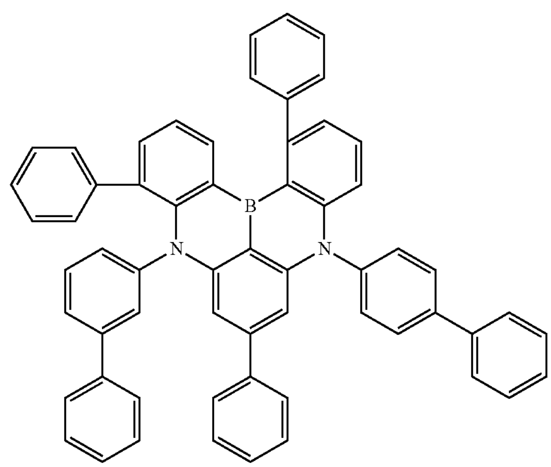
159
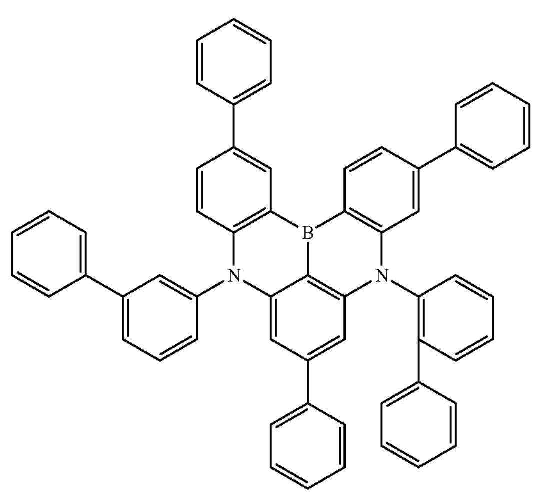

-continued
160
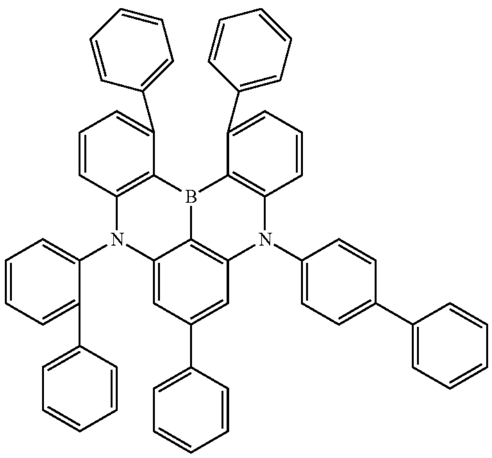
161
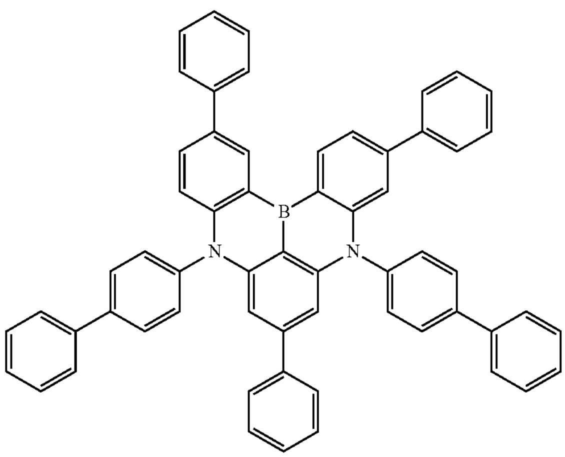
162
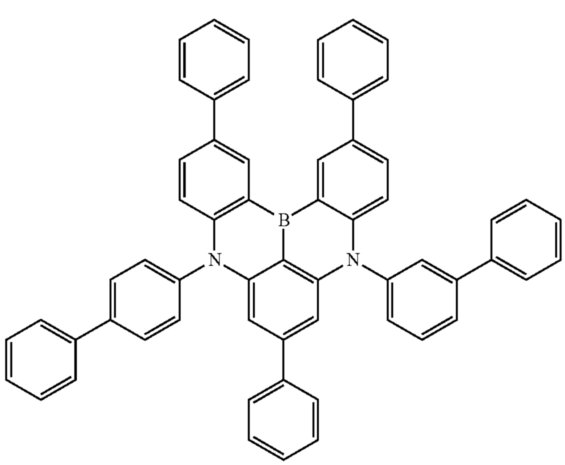
-continued
163
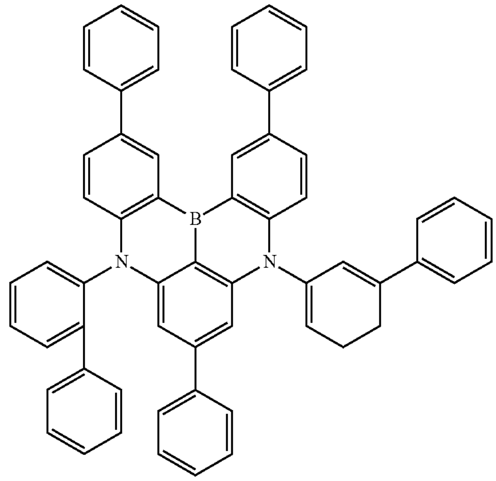
164
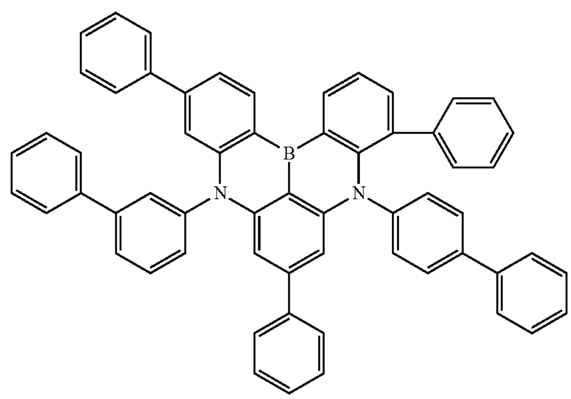
165
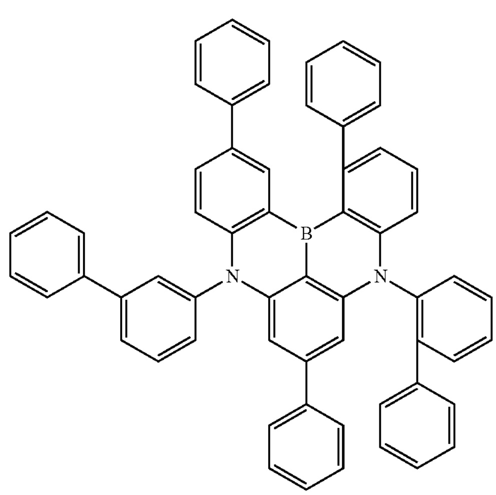

-continued
166
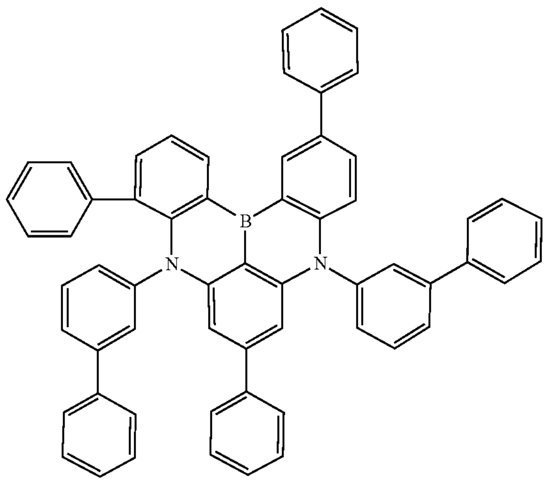
167
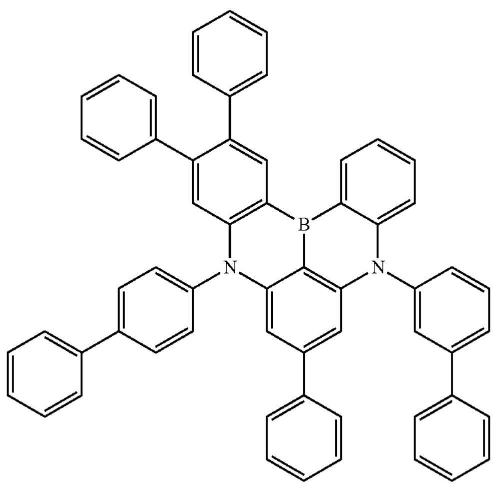
168
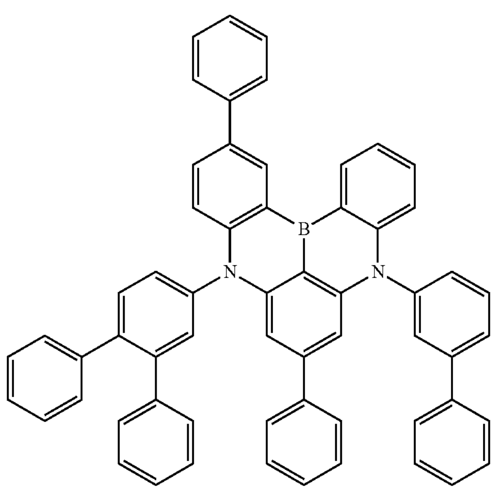
-continued
169
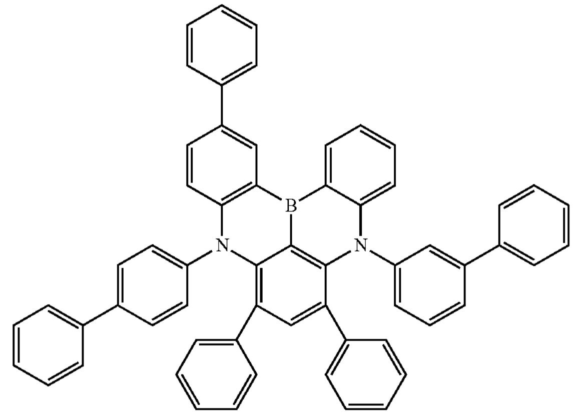
170
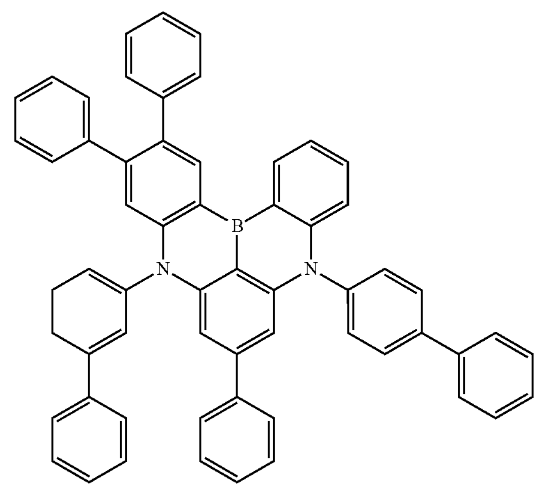
171
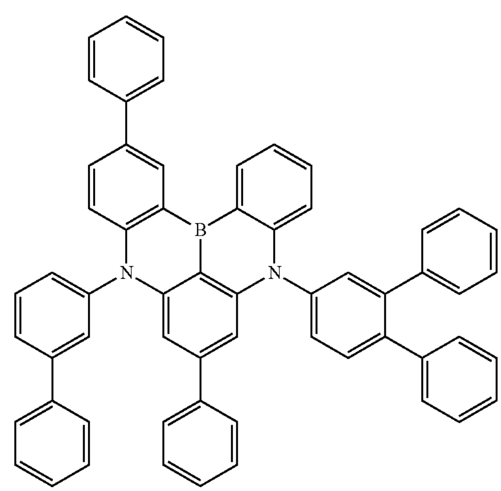

-continued
172
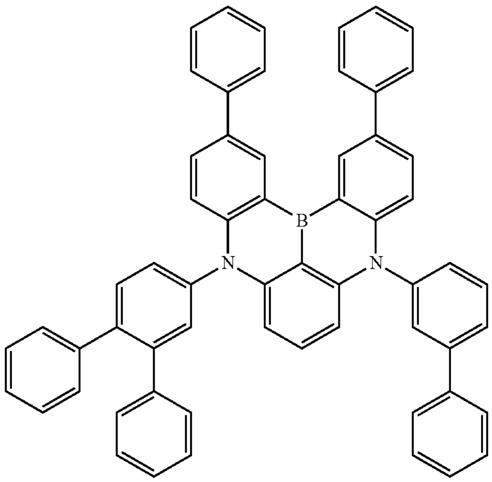
173
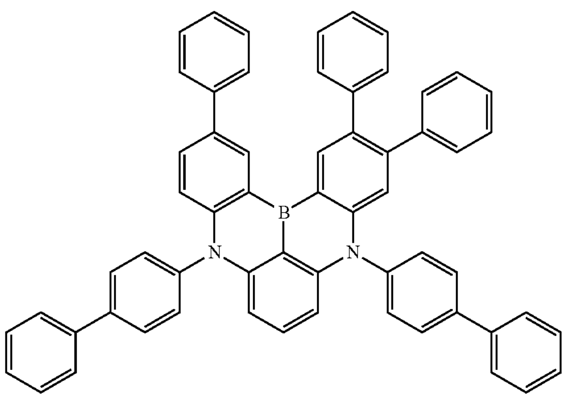
174
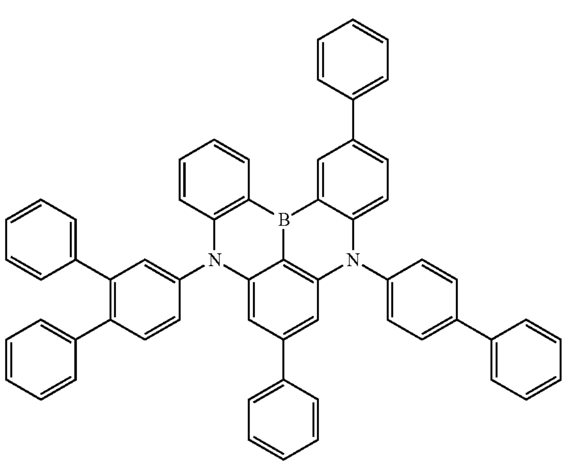
-continued
175
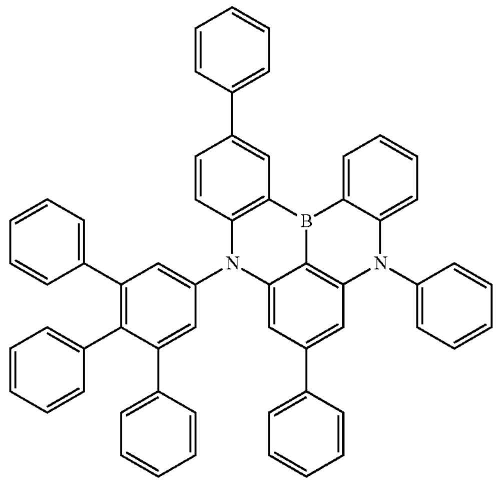
176
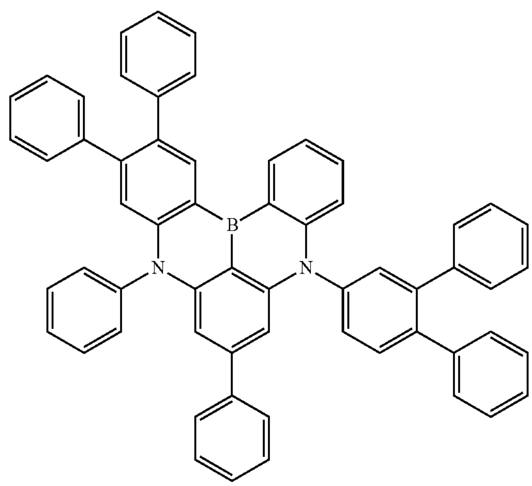
177
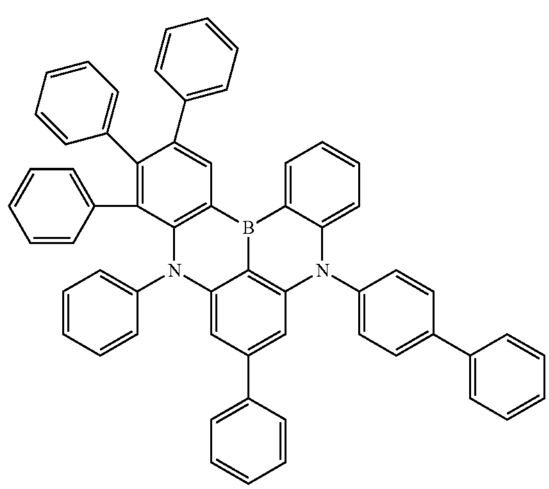

-continued
178
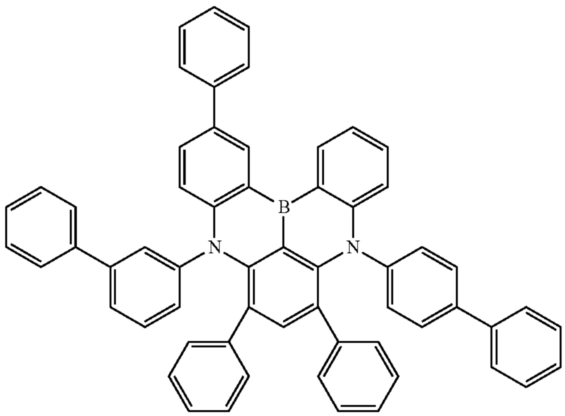
179
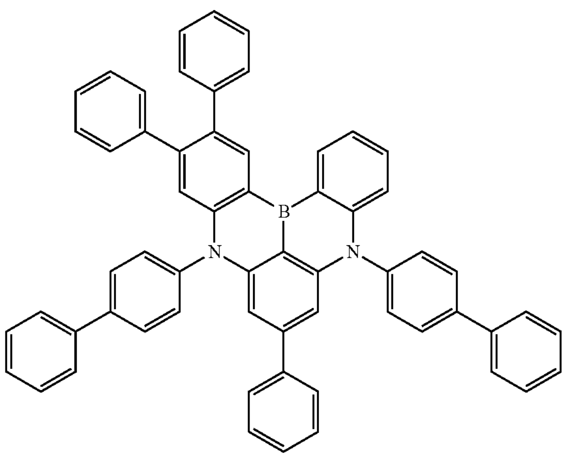
180
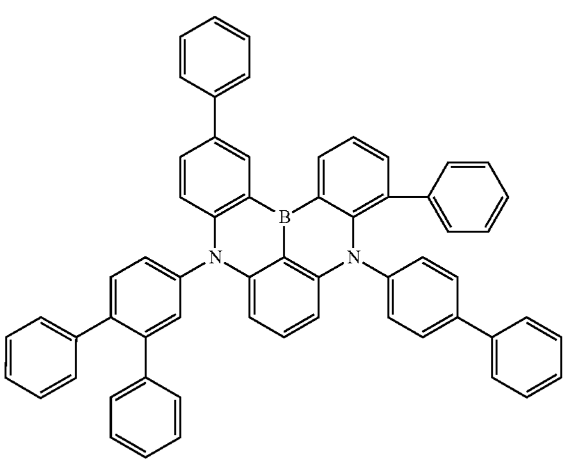
-continued
181
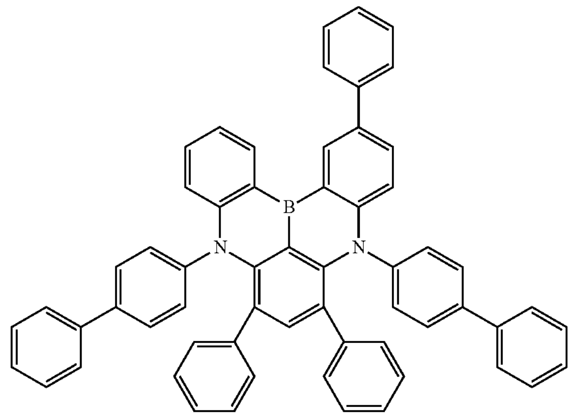
182
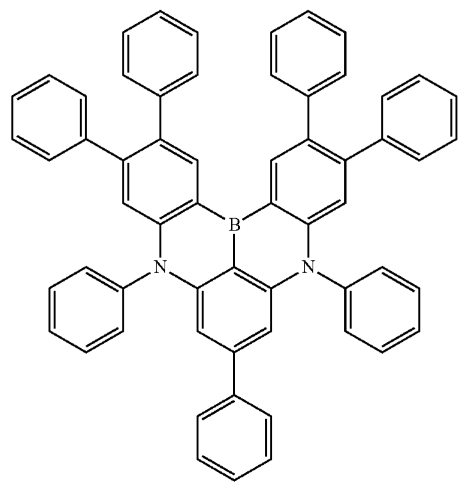
183
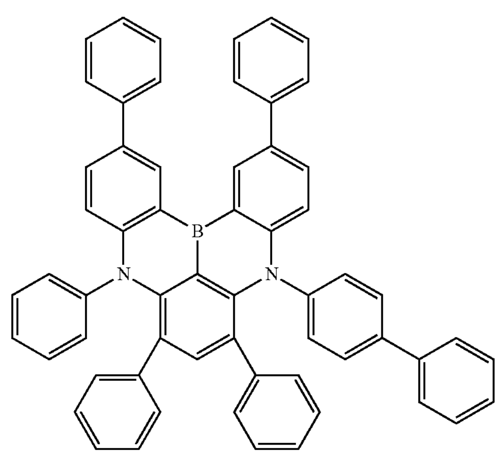

184
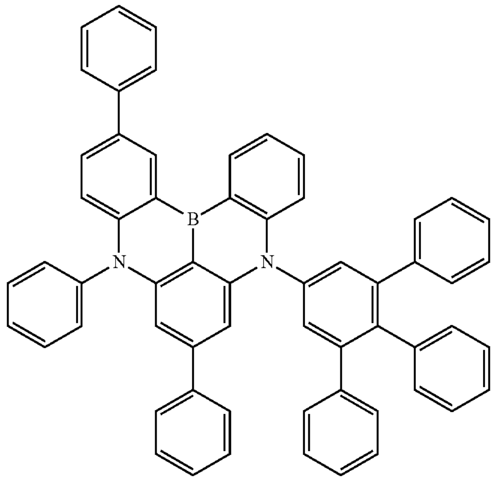
185
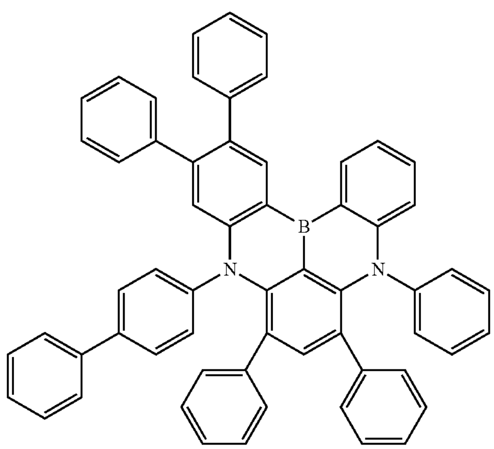
186
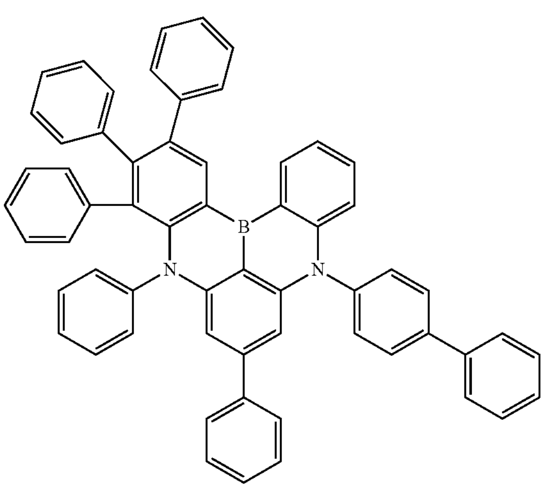
187
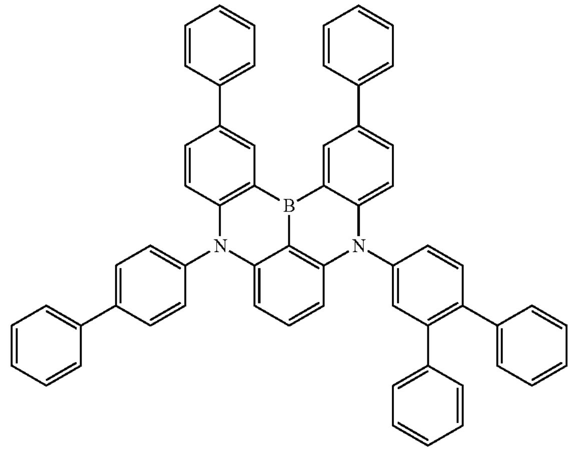
188
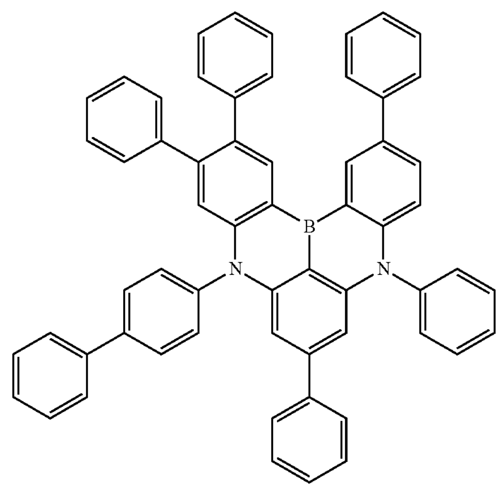
189
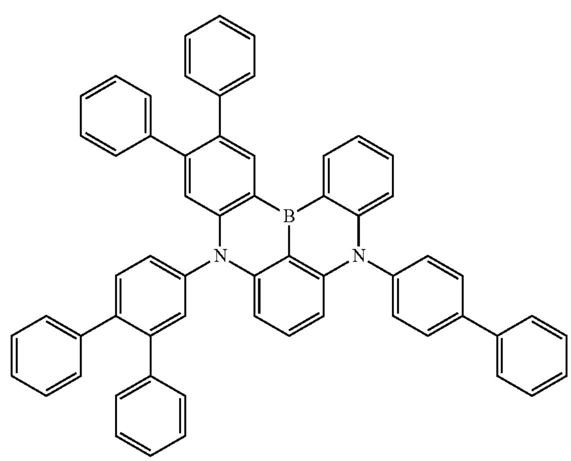

190
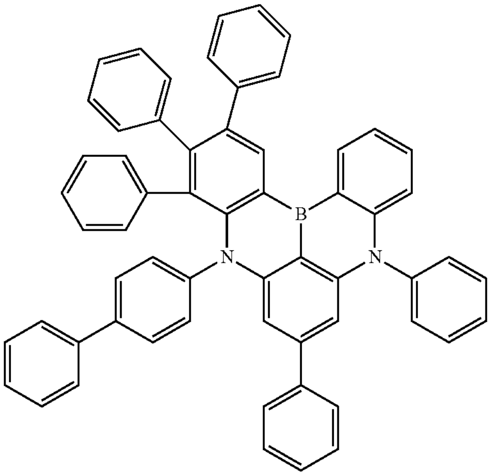
191
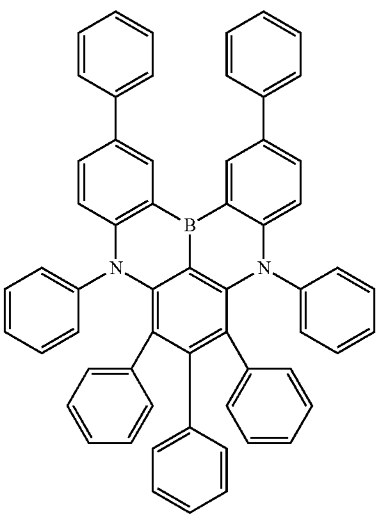
192
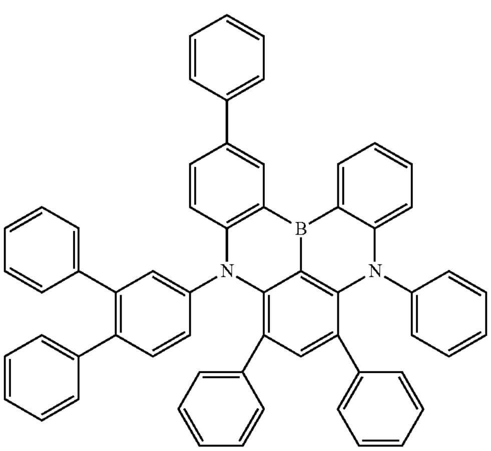
193
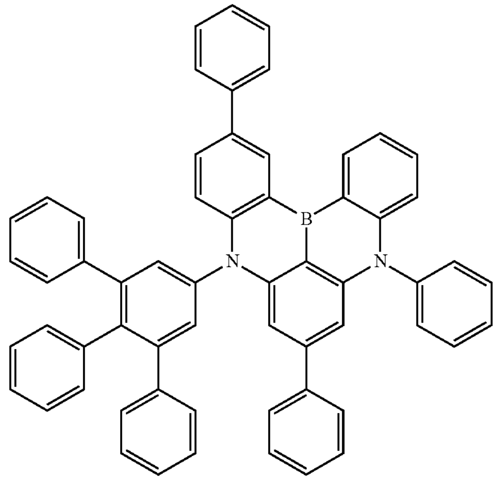
194
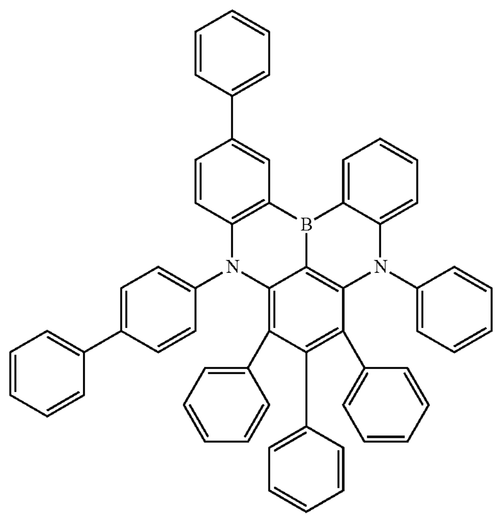
195
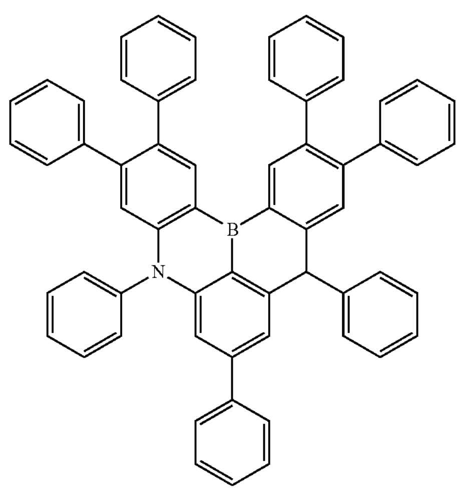

-continued
196
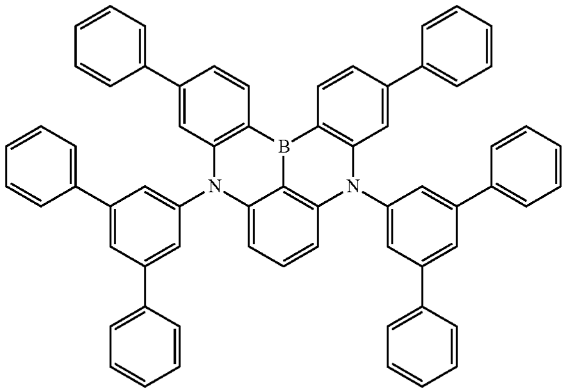
197
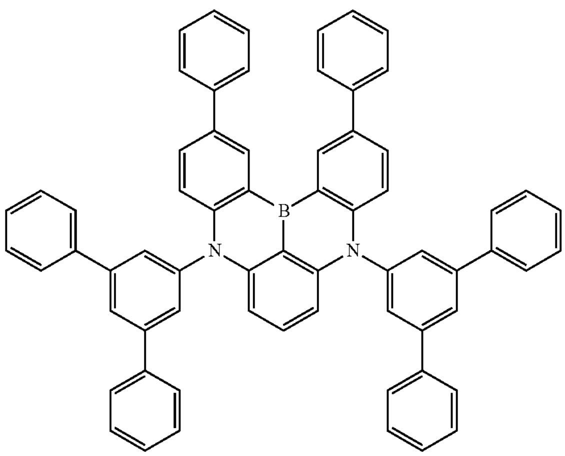
198
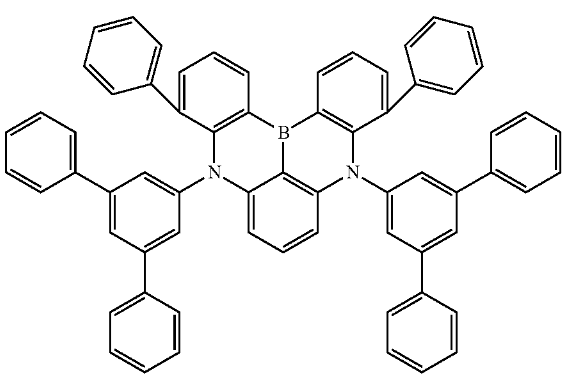
199
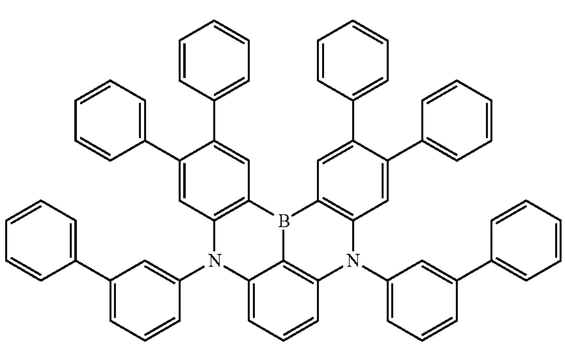
-continued
200
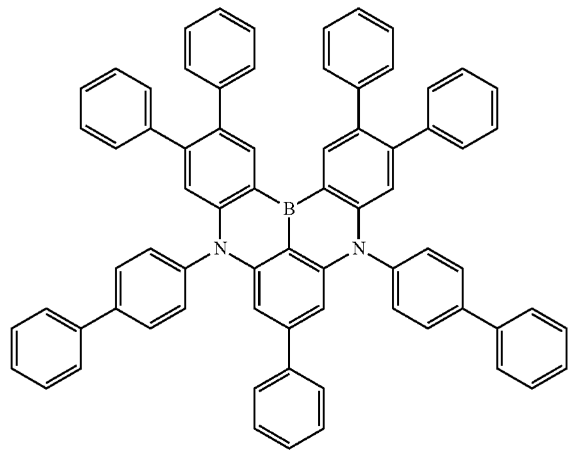
201
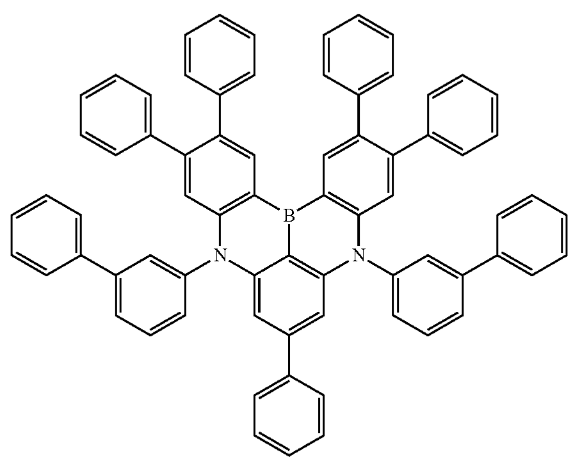
202
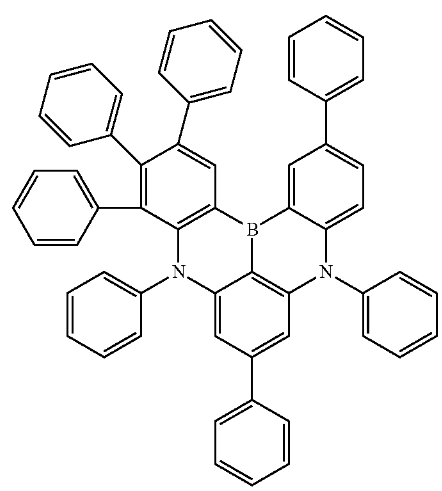

-continued
203
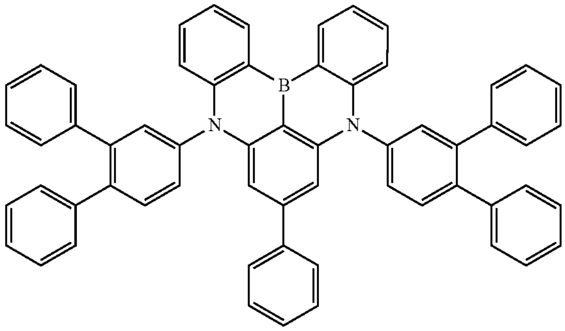
204
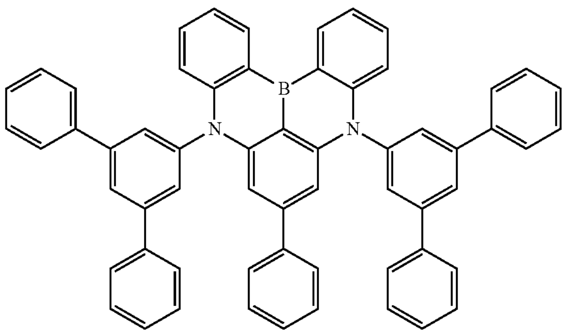
205
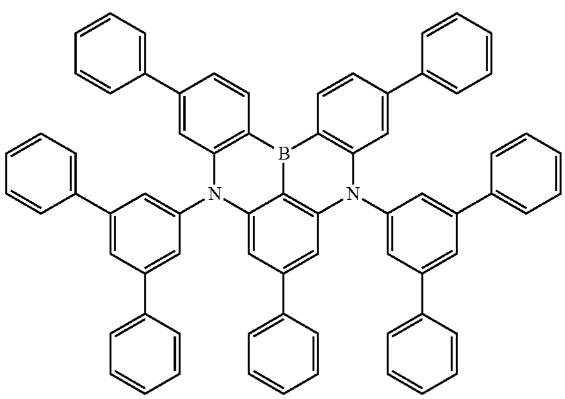
206
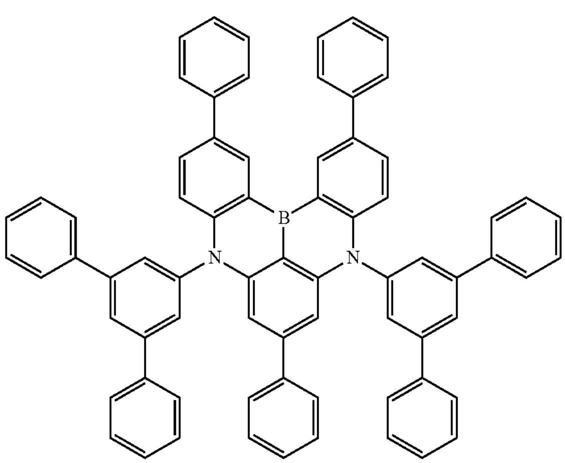
-continued
207
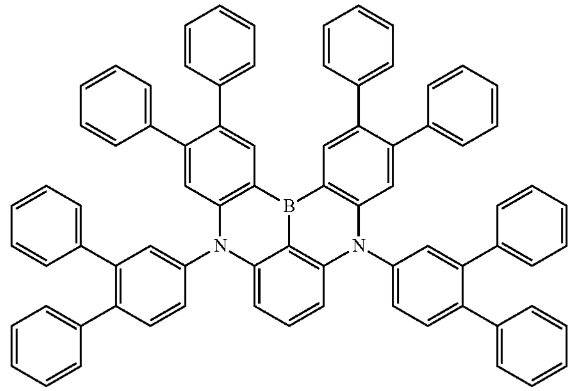
208
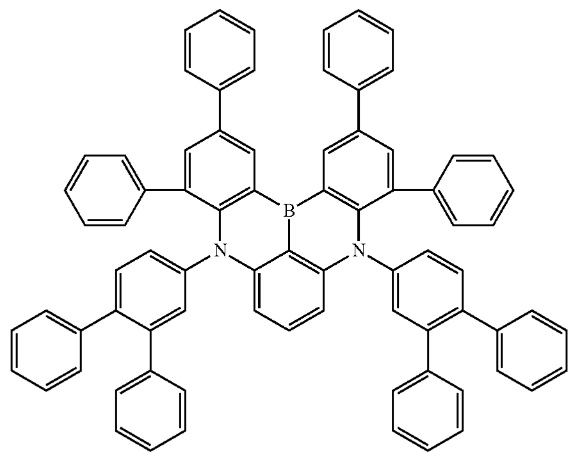
209
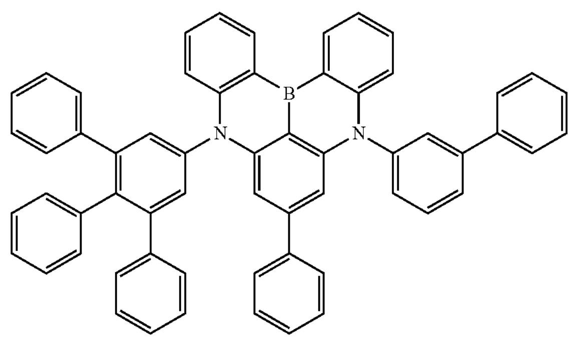
210
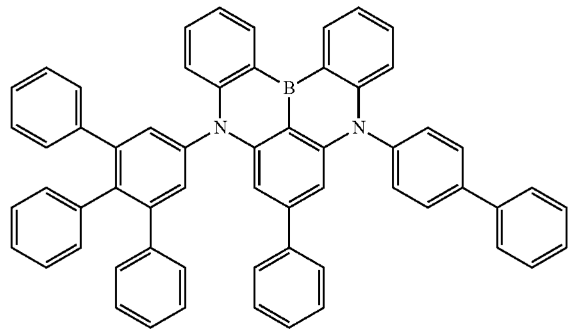

-continued
211
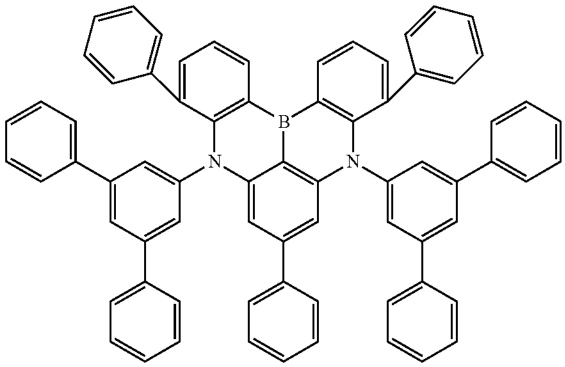
212
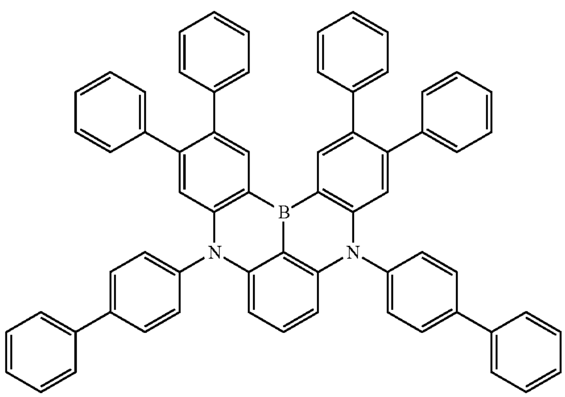
213
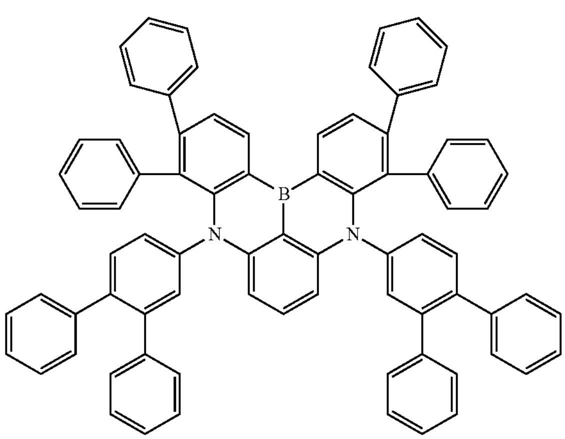
-continued
214
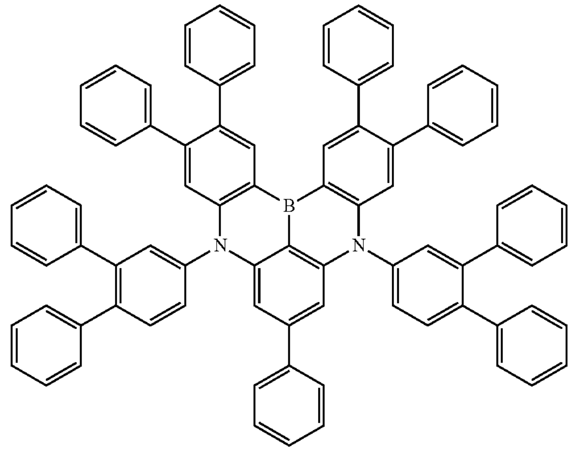
215
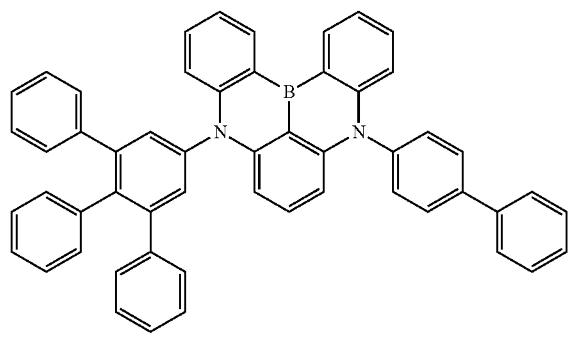
216
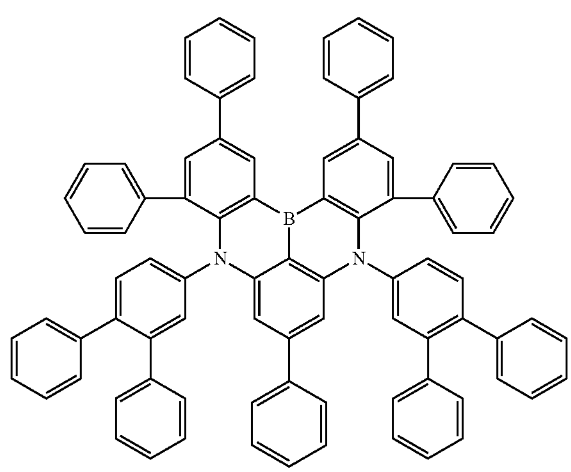

-continued
217
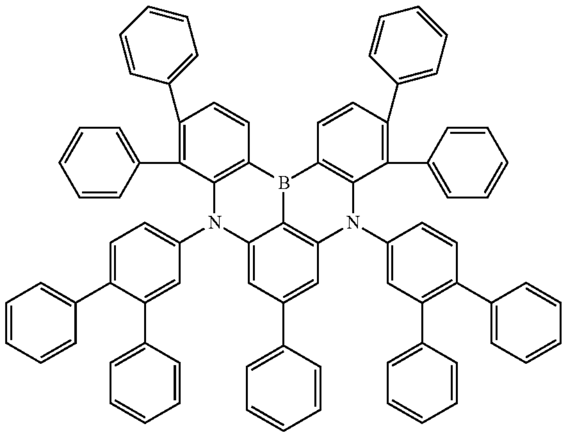
218
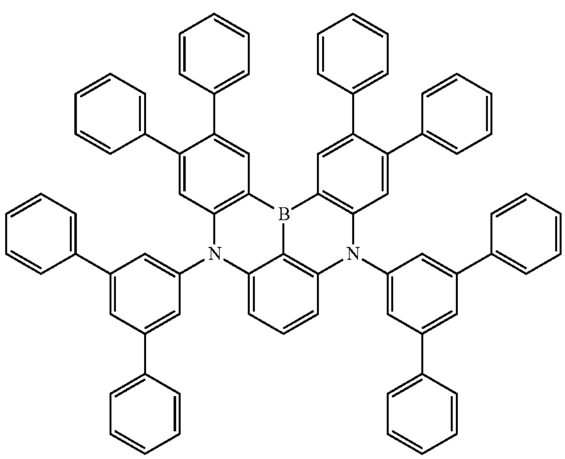
219
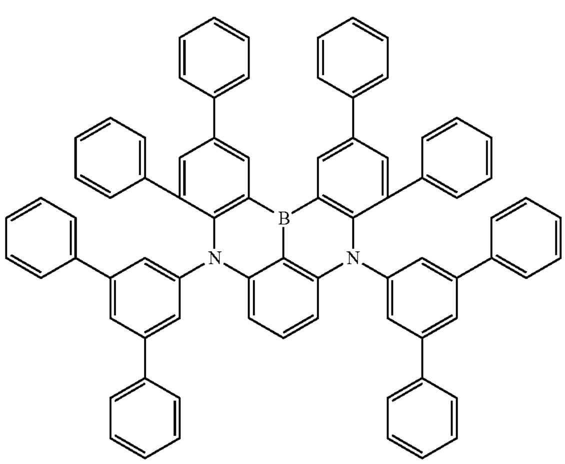
-continued
220
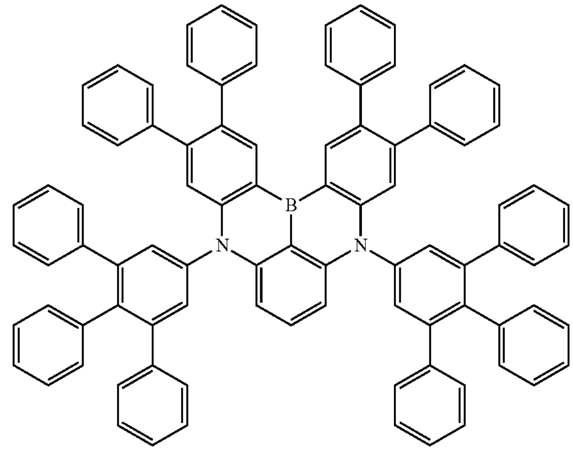
221
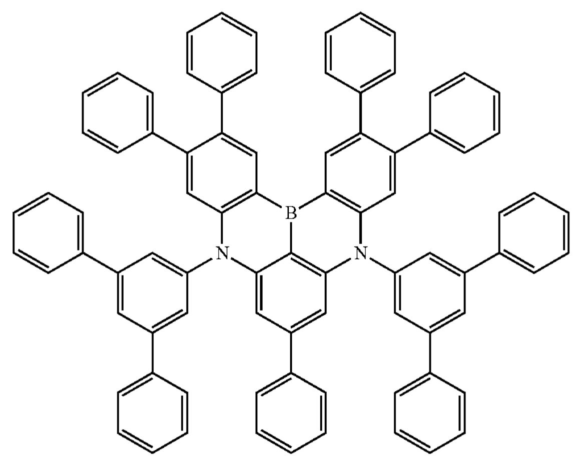
222
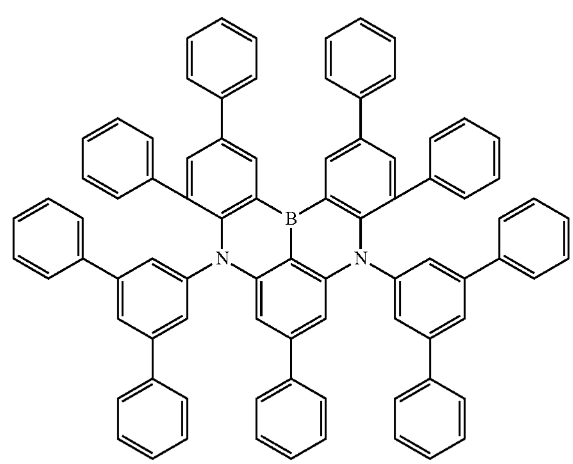

223
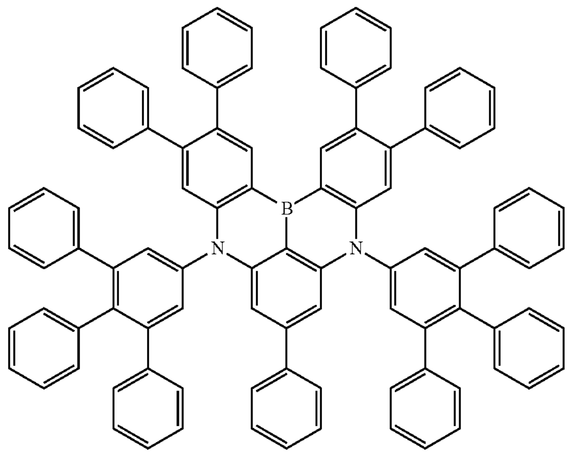
224
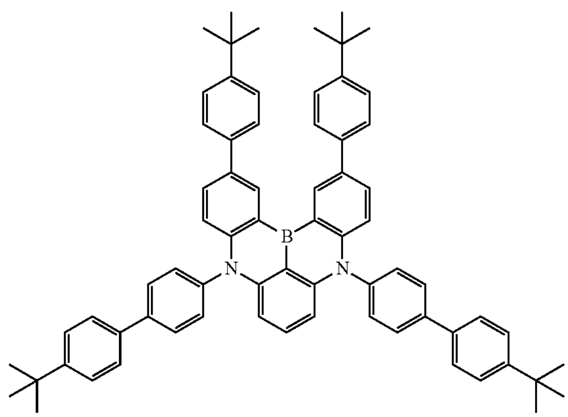
225
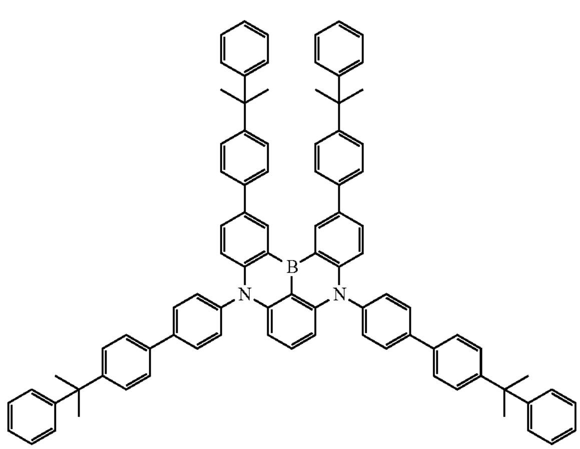
226
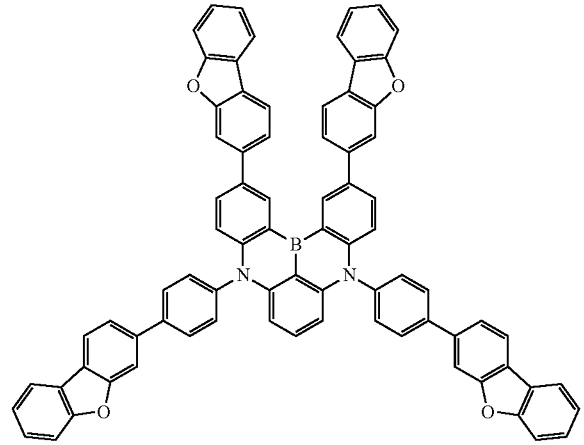
227
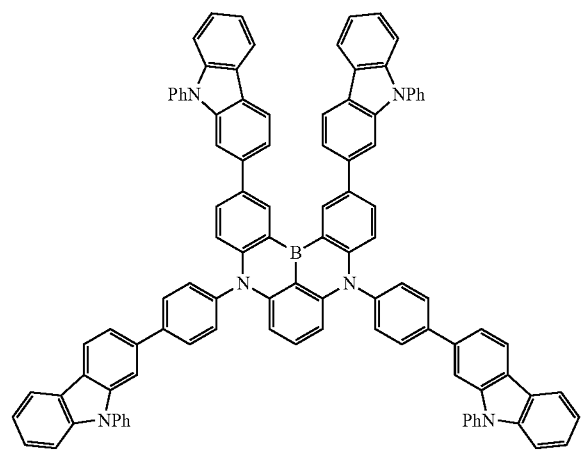
228
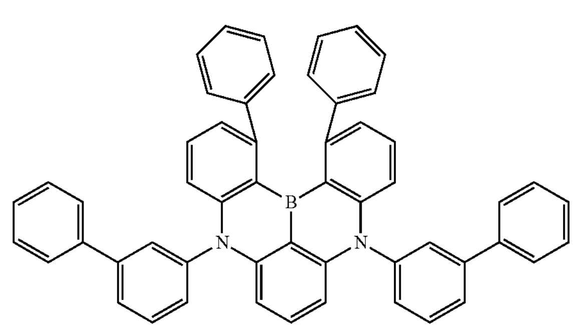

-continued

229

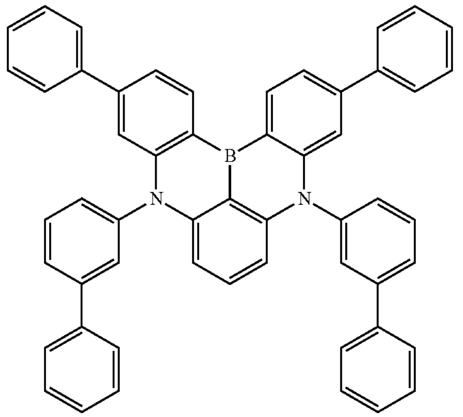

wherein in the formulae Ph is a phenyl group.

While not wishing to be bound by theory, it is understood that because the second dopant compound represented by Formula 1 includes four or more substituents ($Ar_1$) which are substituted on a central condensed ring core (A), stability of a molecule is improved, and thus, an organic light-emitting device including the second dopant compound represented by Formula 1 has an improved lifespan characteristics While not wishing to be bound by theory, it is understood that because the organic light-emitting device includes the emission layer including a host compound and a first dopant compound together with the second dopant compound represented by Formula 1, a decrease in efficiency according to triplet-triplet annihilation may be easily prevented, and because excitons are transferred to the light-emitting dopant without loss of excitons through a Forster resonance energy transfer (FRET) mechanism and a dexter energy transfer (DET) mechanism, efficiency may be improved.

A highest occupied molecular orbital (HOMO) energy level, a lowest unoccupied molecular orbital (LUMO) energy level, a $S_1$ energy level, and a T1 energy level of the exemplary second dopant compound represented by Formula 1 are evaluated using Gaussian 09 program with molecular structure optimization by density functional theory (DFT) based on B3LYP, and results thereof are shown in Table 1 below.

TABLE 1

| Compound No. | HOMO (eV) | LUMO (eV) | $S_1$ (eV) | $T_1$ (eV) |
|---|---|---|---|---|
| Compound 1 | −4.726 | −1.179 | 3.020 | 2.546 |
| Compound 224 | −4.639 | −1.107 | 3.007 | 2.555 |
| Compound 95 | −4.743 | −1.125 | 3.074 | 2.638 |
| Compound 229 | −4.775 | −1.323 | 2.936 | 2.517 |

Referring to Table 1, it is confirmed that the second dopant compound represented by Formula 1 has electric characteristics that are suitable for use as a light-emitting dopant for an electronic device, for example, an organic light-emitting device.

Synthesis method of the second dopant compound represented by Formula 1 may be recognized by those skilled in the art with reference to the following Synthesis Examples.

In an embodiment, the host may consist of one kind of host. When the host consists of one kind of host, the one kind of host may be a bipolar host, an electron transport host, or a hole transport host, which will be described later.

In an embodiment, the host compound included in the emission layer may include two different compounds.

In an embodiment, the host compound included in the emission layer may include a common host forming an exciplex.

In an embodiment, the host compound may include a hole transport host compound and an electron transport host compound, but embodiments of the present disclosure are not limited thereto. The electron transport host compound and a hole transport host may be understood by referring to the related description to be presented later.

In an embodiment, the host may include an electron transport host including at least one electron transport moiety and a hole transport host that does not include an electron transport moiety.

The electron transport moiety used herein may be a cyano group, a π-electron-deficient nitrogen-containing cyclic group, or a group represented by one of the following formulae:

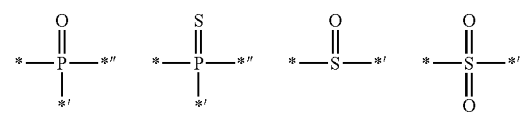

In the formulae, *, *', and *" are each binding sites to neighboring atoms.

In an embodiment, the electron transport host in the emission layer may include at least one of a cyano group and a π-electron-deficient nitrogen-containing cyclic group.

In an embodiment, the electron transport host in the emission layer may include at least one cyano group.

In an embodiment, the electron transport host in the emission layer may include at least one cyano group and at least one π-electron-deficient nitrogen-containing cyclic group.

In an embodiment, the host may include an electron transport host and a hole transport host, wherein the electron transport host may include at least one π-electron-deficient nitrogen-free cyclic group and at least one electron transport moiety, and the hole transport host may include at least one π-electron-deficient nitrogen-free cyclic group and may not include an electron transport moiety.

In the present specification, the term "π-electron-deficient nitrogen-containing cyclic group" refers to a cyclic group having at least one *—N=*' moiety, and for example, may be: an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, a benzoisoxazole group, a triazole group, a tetrazole group, an oxadiazole group, a triazine group, a thiadiazole group, an imidazopyridine group, an imidazopyrimidine group, and an azacarbazole group; or a condensed cyclic group of two or more π-electron-deficient nitrogen-containing cyclic groups.

In an embodiment, the π-electron-deficient nitrogen-free cyclic group may be a phenyl group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a coronene group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, and a triindolobenzene group; or a condensed cyclic of two or more π-electron-deficient nitrogen-free cyclic group, but embodiments of the present disclosure are not limited thereto.

In an embodiment, the electron transport host may be compounds represented by Formula E-1 below, and the hole transport host may be compounds represented by Formula H-1, but embodiments of the present disclosure are not limited thereto:

$$[Ar_{301}]_{xb11}\text{-}[(L_{301})_{xb1}\text{-}R_{301}]_{xb21}$$ Formula E-1 wherein, in Formula E-1, $Ar_{301}$ may be a substituted or unsubstituted $C_5$-$C_{60}$ carbocyclic group or a substituted or unsubstituted $C_1$-$C_{60}$ heterocyclic group, xb11 may be 1, 2, or 3, $L_{301}$ may each independently be a single bond, a group represented by the following formulae, a substituted or unsubstituted $C_5$-$C_{60}$ carbocyclic group, or a substituted or unsubstituted $C_1$-$C_{60}$ heterocyclic group, and *, *', and * in the following formulae are each a binding site to a neighboring atom,

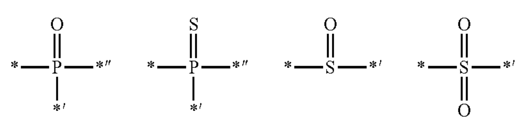

xb1 may be an integer from 1 to 5, $R_{301}$ may be hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, $—Si(Q_{301})(Q_{302})(Q_{303})$, $—N(Q_{301})(Q_{302})$, $—B(Q_{301})(Q_{302})$, $—C(=O)(Q_{301})$, $—S(=O)_2(Q_{301})$, $—S(=O)(Q_{301})$, $—P(=O)(Q_{301})(Q_{302})$, or $—P(=S)(Q_{301})(Q_{302})$, xb21 may be an integer from 1 to 5, $Q_{301}$ to $Q_{303}$ may each independently be a $C_1$-$C_{10}$ alkyl group, a $C_1$-$C_{10}$ alkoxy group, a $C_1$-$C_{10}$ alkylthio group, a phenyl group, a biphenyl group, a terphenyl group, or a naphthyl group, and at least one of Condition 1 to Condition 3 below is satisfied:

Condition 1:

at least one of $Ar_{301}$, $L_{301}$, and $R_{301}$ in Formula E-1 may each independently include a π-electron-deficient nitrogen-containing cyclic group;

Condition 2:

$L_{301}$ in Formula E-1 may be a group represented by one of the following formulae:

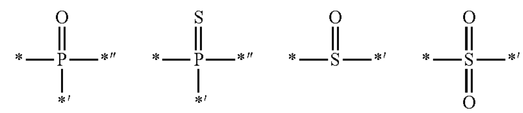

Condition 3:

$R_{301}$ in Formula E-1 may be a cyano group, $—S(=O)_2(Q_{301})$, $—S(=O)(Q_{301})$, $—P(=O)(Q_{301})(Q_{302})$, or $—P(=S)(Q_{301})(Q_{302})$.

Formula H-1

$$Ar_{401}—(L_{401})_{xd1}—(Ar_{402})_{xd11}$$

11

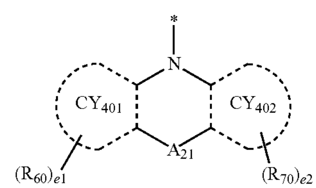

12

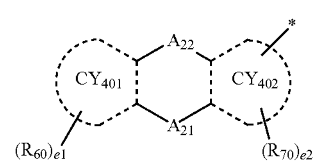

wherein, in Formulae H-1, 11, and 12, $L_{401}$ may be:

a single bond; or a phenyl group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a coronene group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group or a triindolobenzene group, may each independently be unsubstituted or substituted with at least one deuterium, a $C_1$-$C_{10}$ alkyl group, a $C_1$-$C_{10}$ alkoxy group, a $C_1$-$C_{10}$ alkylthio group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, or —Si($Q_{401}$)($Q_{402}$)($Q_{403}$), xd1 may be an integer from 1 to 10, wherein, when xd1 is 2 or more, two or more of $L_{401}$(s) are identical to or different from each other, $Ar_{401}$ may be groups represented by Formulae 11 or 12, $Ar_{402}$ may be:

a group represented by Formula 11 or 12, a phenyl group, a naphthyl group, a fluorenyl group, a carbazolyl group, a dibenzofuranyl group, a dibenzothiophenyl group, a biphenyl group, a terphenyl group, or a triphenylenyl group; or a phenyl group, a naphthyl group, a fluorenyl group, a carbazolyl group, a dibenzofuranyl group, a dibenzothiophenyl group, a biphenyl group, a terphenyl group, or a triphenylenyl group, each independently substituted with at least one deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{20}$ alkylthio group, a phenyl group, a naphthyl group, a fluorenyl group, a carbazolyl group, a dibenzofuranyl group, a dibenzothiophenyl group, a biphenyl group, a terphenyl group, or a triphenylenyl group, $CY_{401}$ and $CY_{402}$ may each independently be a phenyl group, a naphthalene group, a fluorene group, a carbazole group, a benzocarbazole group, an indolocarbazole group, a dibenzofuran group, a dibenzothiophene group, a dibenzosilole group, a benzonaphthofuran group, a benzonaphthothiophene group, or a benzonaphthosilole group, xd11 may be an integer from 1 to 10, wherein when xd11 is 2 or more, two or more of $Ar_{402}$(s) may be identical to or different from each other, $A_{21}$ may be a single bond, O, S, N($R_{51}$), C($R_{51}$)($R_{52}$), or Si($R_{51}$)($R_{52}$), $A_{22}$ may be a single bond, O, S, N($R_{53}$), C($R_{53}$)($R_{54}$), or Si($R_{53}$)($R_{54}$), at least one of $A_{21}$ and $A_{22}$ in Formula 12 may not be a single bond, $R_{51}$ to $R_{54}$, $R_{60}$, and $R_{70}$ may each independently be:

hydrogen, deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkylthio group, or a $C_1$-$C_{20}$ alkoxy group; a $C_1$-$C_{20}$ alkyl group, a $C_1$-$C_{20}$ alkylthio group, or a $C_1$-$C_{20}$ alkoxy group, each independently substituted with at least one deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a carbazolyl group, a dibenzofuranyl group, or a dibenzothiophenyl group;

a π-electron-deficient nitrogen-free cyclic group (for example, a phenyl group, a naphthyl group, a fluorenyl group, a carbazolyl group, a dibenzofuranyl group, a dibenzothiophenyl group, a biphenyl group, a terphenyl group, or a triphenylenyl group);

a π-electron-deficient nitrogen-free cyclic group (for example, a phenyl group, a naphthyl group, a fluorenyl group, a carbazolyl group, a dibenzofuranyl group, a dibenzothiophenyl group, a biphenyl group, a terphenyl group, and a triphenylenyl group) that is substituted with at least one deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{20}$ alkylthio group, a phenyl group, a naphthyl group, a fluorenyl group, a carbazolyl group, a dibenzofuranyl group, a dibenzothiophenyl group, or a biphenyl group; or —Si($Q_{404}$)($Q_{405}$)($Q_{406}$), e1 and e2 may each independently be an integer from 0 to 10, $Q_{401}$ to $Q_{406}$ may each independently be hydrogen, deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a carbazolyl group, a dibenzofuranyl group, a dibenzothiophenyl group, a biphenyl group, a terphenyl group, or a triphenylenyl group, and

* indicates a binding site to a neighboring atom.

In an embodiment, at least one of $A_{21}$ and $A_{22}$ in Formula 12 is not a single bond.

In an embodiment, in Formula E-1, $Ar_{301}$ and $L_{301}$ may each independently be a phenyl group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, or an azacarbazole group, each independently unsubstituted or substituted with at least one deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a $C_1$-$C_{20}$ alkylthio group, a phenyl group, a biphenyl group, a terphenyl group, a naphthyl group, a cyano-containing phenyl group, a cyano-containing biphenyl group, a cyano-containing terphenyl group, a cyano-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl)triazinyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), at least one of $L_{301}$(s) in the number of xb1 may each independently be an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, or an azacarbazole group, each independently unsubstituted or substituted with at least one deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a $C_1$-$C_{20}$ alkylthio group, a phenyl group, a biphenyl group, a terphenyl group, a naphthyl group, a cyano-containing phenyl group, a cyano-containing biphenyl group, a cyano-containing terphenyl group, a cyano-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl)triazinyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), $R_{301}$ may be hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a $C_1$-$C_{20}$ alkylthio group, a phenyl group, a biphenyl group, a terphenyl group, a tetraphenyl group, a naphthyl group, a cyano-containing phenyl group, a cyano-containing biphenyl group, a cyano-containing terphenyl group, a cyano-containing tetraphenyl group, a cyano-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl)triazinyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), and $Q_{31}$ to $Q_{33}$ may each independently be a $C_1$-$C_{10}$ alkyl group, a $C_1$-$C_1$ alkoxy group, a $C_1$-$C_1$ alkylthio group, a phenyl group, a biphenyl group, a terphenyl group, or a naphthyl group, but embodiments of the present disclosure are not limited thereto.

In an embodiment, $Ar_{301}$ may be: a phenyl group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, or a dibenzothiophene group, each independently unsubstituted or substituted with at least one deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_1$-$C_{20}$ alkylthio group, a phenyl group, a biphenyl group, a terphenyl group, a naphthyl group, a cyano group-containing phenyl group, a cyano group-containing biphenyl group, a cyano group-containing terphenyl group, a cyano group-containing naphthyl group, a pyridinyl group, a phenyl pyridinyl group, a diphenyl pyridinyl group, a biphenyl pyridinyl group, a di(biphenyl) pyridinyl group, a pyrazinyl group, a phenyl pyrazinyl group, a diphenyl pyrazinyl group, a biphenyl pyrazinyl group, a di(biphenyl) pyrazinyl group, a pyridazinyl group, a phenyl pyridazinyl group, a diphenyl pyridazinyl group, a biphenyl pyridazinyl group, a di(biphenyl) pyridazinyl group, a pyrimidinyl group, a phenyl pyrimidinyl group, a diphenyl pyrimidinyl group, a biphenyl pyrimidinyl group, a di(biphenyl) pyrimidinyl group, a triazinyl group, a phenyl triazinyl group, a diphenyl triazinyl group, a biphenyl triazinyl group, a di(biphenyl) triazinyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$); or groups represented by Formulae 5-1 to 5-3 or Formulae 6-1 to 6-33, and $L_{301}$ may be groups represented by Formulae 5-1 to 5-3 or Formulae 6-1 to 6-33:

5-1

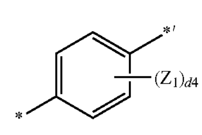

-continued
5-2
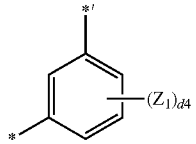
5-3
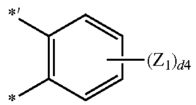
6-1
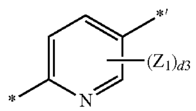
6-2
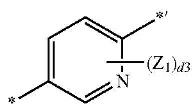
6-3
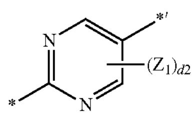
6-4
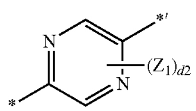
6-5
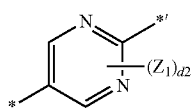
6-6
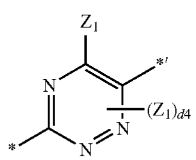
6-7
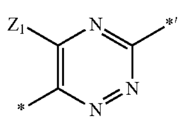
6-8
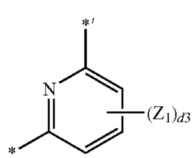
6-9
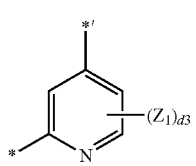
6-10
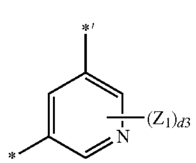
-continued
6-11
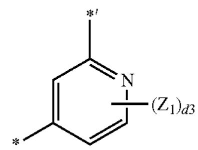
6-12
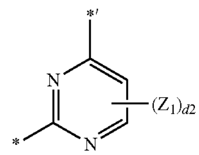
6-13
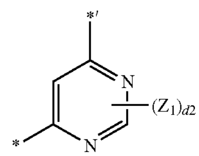
6-14
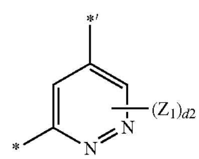
6-15
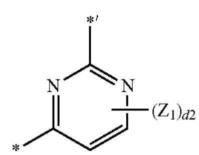
6-16
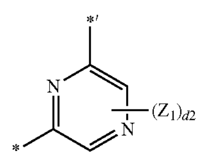
6-17
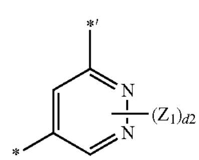
6-18
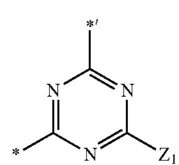
6-19
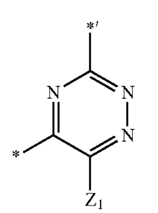

-continued 6-20

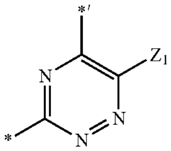

6-21

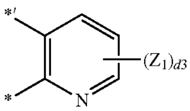

6-22

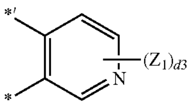

6-23

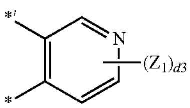

6-24

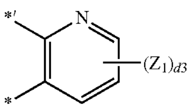

6-25

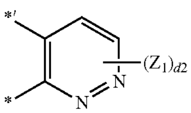

6-26

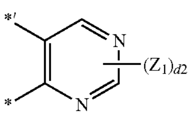

6-27

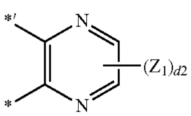

6-28

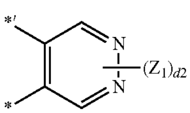

6-29

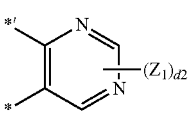

6-30

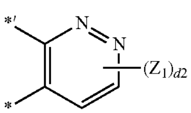

6-31

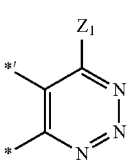

6-32

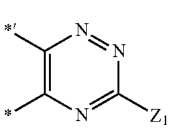

-continued 6-33

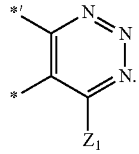

In Formulae 5-1 to 5-3 and 6-1 to 6-33, $Z_1$ may be hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a $C_1$-$C_{20}$ alkylthio group, a phenyl group, a biphenyl group, a terphenyl group, a naphthyl group, a cyano-containing phenyl group, a cyano-containing biphenyl group, a cyano-containing terphenyl group, a cyano-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl)triazinyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), d4 may be 0, 1, 2, 3, or 4, d3 may be 0, 1, 2, or 3, d2 may be 0, 1, or 2, and

* and *' each indicate a binding site to a neighboring atom.

$Q_{31}$ to $Q_{33}$ are the same as described above.

In an embodiment, $L_{301}$ may be groups represented by Formulae 5-2, 5-3, or 6-8 to 6-33.

In an embodiment, $R_{301}$ may be a cyano group and groups represented by Formulae 7-1 to 7-18, or at least one of $Ar_{402}$(s) in the number of xd11 may be groups represented by Formulae 7-1 to 7-18, but embodiments of the present disclosure are not limited thereto:

7-1

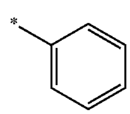

7-2

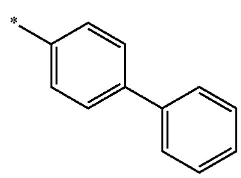

7-3

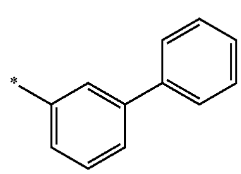

-continued
7-4
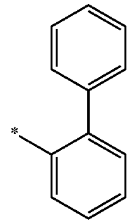
7-5
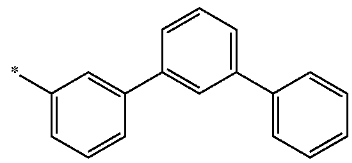
7-6
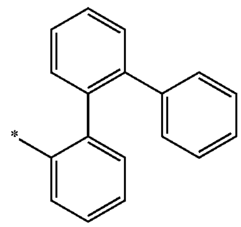
7-7
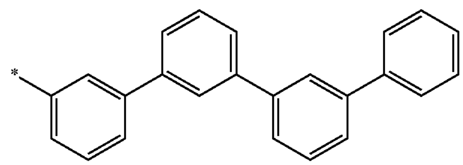
7-8
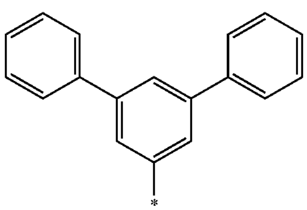
7-9
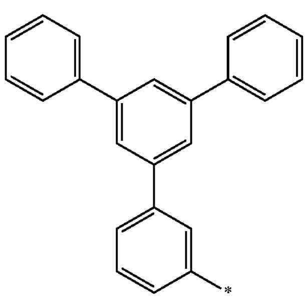
7-10
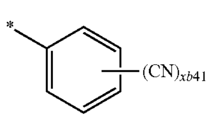
7-1
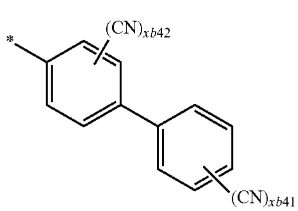
-continued
7-12
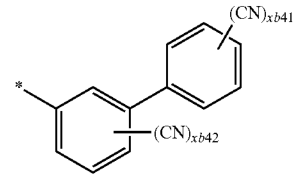
7-13
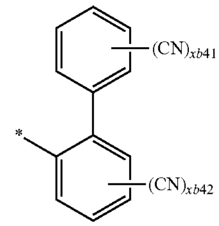
7-14
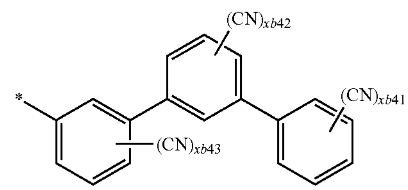
7-15
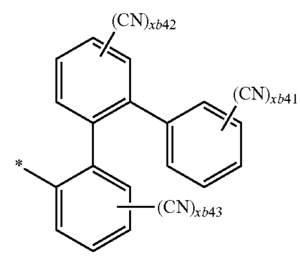
7-16
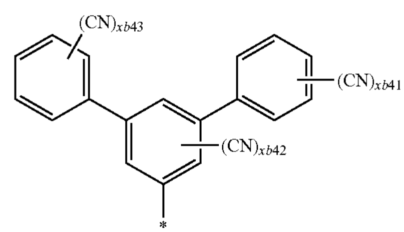
7-17
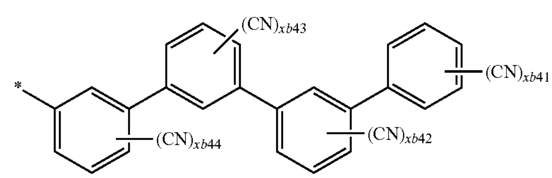
7-18
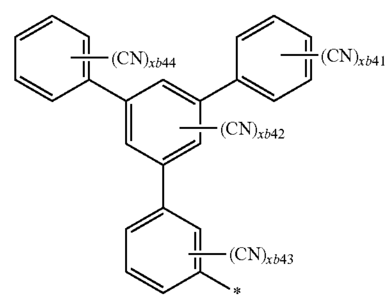

In Formulae 7-1 to 7-18, xb41 to xb44 may be each 0, 1, or 2, wherein xb41 in Formula 7-10 may not be 0, the sum of xb4l and xb42 in Formulae 7-11 to 7-13 may not be 0, the sum of xb41, xb42, and xb43 in Formulae 7-14 to 7-16 may not be 0, the sum of xb41, xb42, xb43, and xb44 in Formulae 7-17 and 7-18 may not be 0, and * indicates a binding site to a neighboring atom.

In an embodiment, at least one of the following conditions is satisfied:

xb41 in Formula 7-10 is not 0, the sum of xb41 and xb42 in Formulae 7-11 to 7-13 is not 0, the sum of xb41, xb42, and xb43 in Formulae 7-14 to 7-16 is not 0, or the sum of xb41, xb42, xb43, and xb44 in Formulae 7-17 and 7-18 is not 0.

Two or more of $Ar_{301}$(s) in Formula E-1 may be identical to or different from each other, two or more of $L_{301}$(s) in Formula E-1 may be identical to or different from each other, two or more of $L_{401}$(s) in Formula H-1 may be identical to or different from each other, and two or more of $Ar_{402}$(s) in Formula H-1 may be identical to or different from each other.

In an embodiment, the electron transport host may include i) at least one of a cyano group, a pyrimidine group, a pyrazine group, and a triazine group and ii) a triphenylene group, and the hole transport host may include a carbazole group.

In an embodiment, the electron transport host may include at least one cyano group.

The electron transport host may be, for example, a compound of Groups HE1 to HE7, but embodiments of the present disclosure are not limited thereto:

Group HE1

H-E1

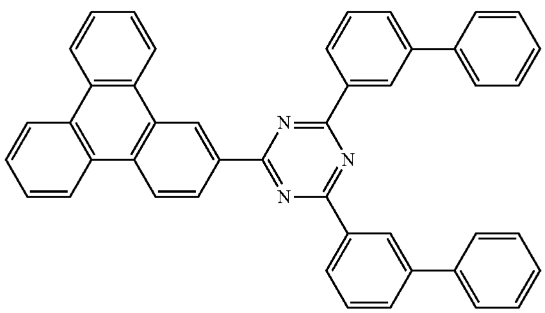

H-E2

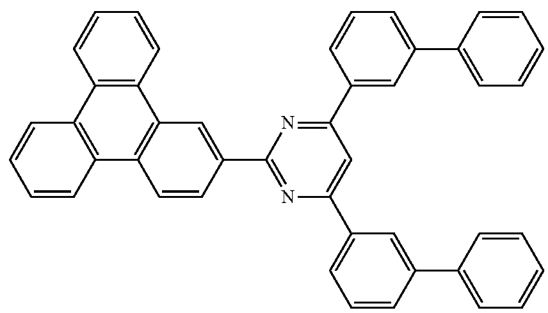

H-E3

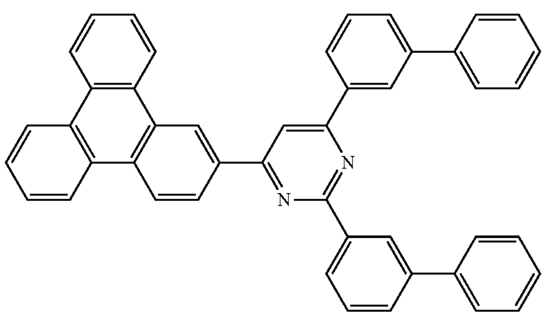

H-E4

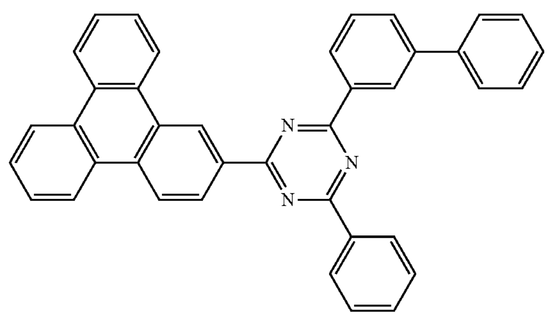

H-E5

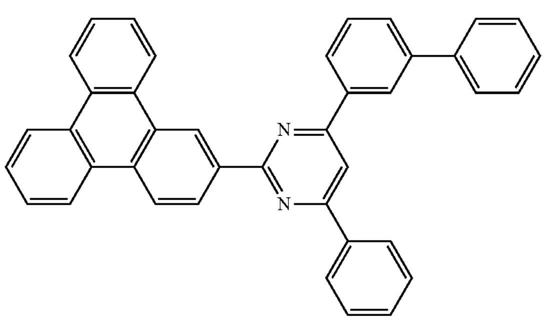

H-E6

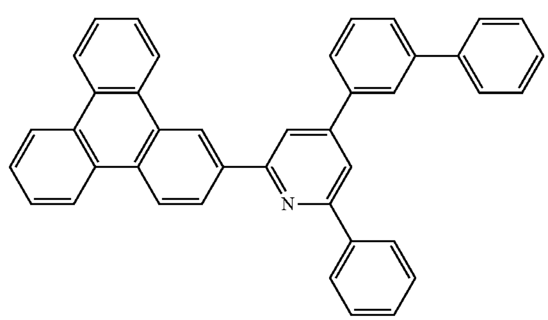

-continued
H-E7
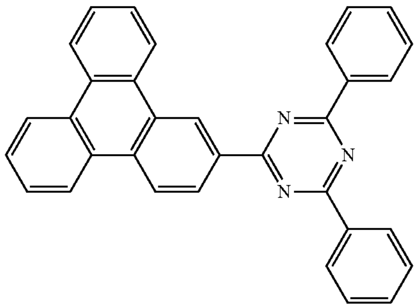
H-E8
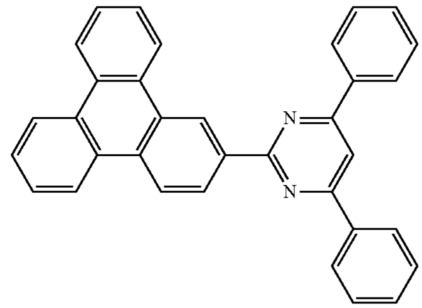
H-E9
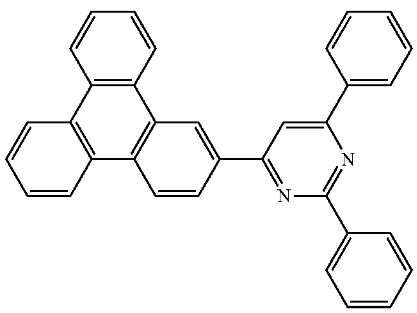
H-E10
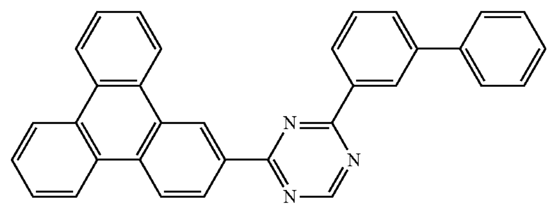
H-E11
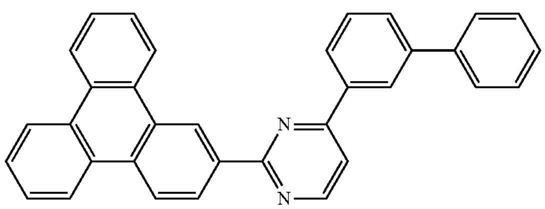
H-E12
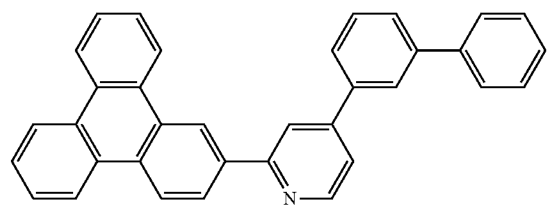
H-E13
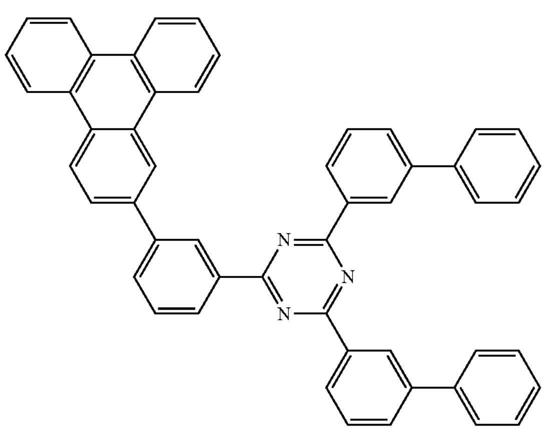
H-E14
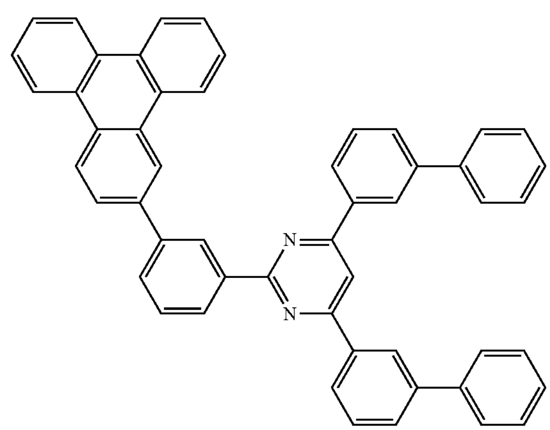

-continued
H-E15
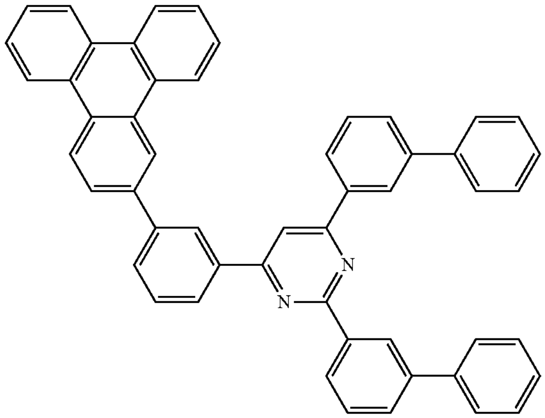
H-E16
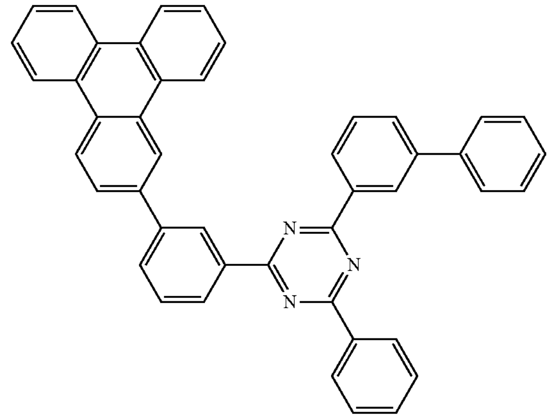
H-E17
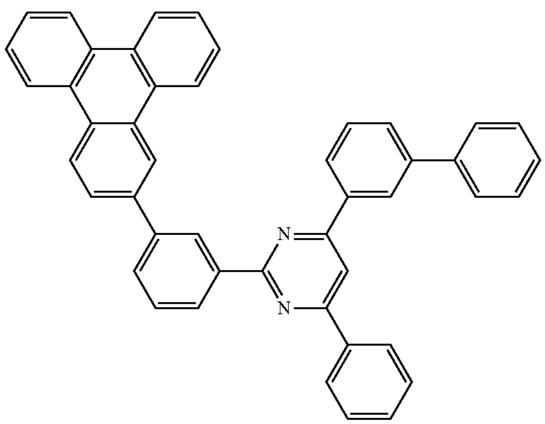
H-E18
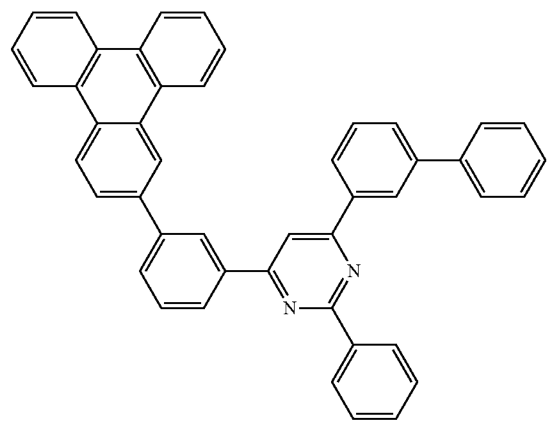
H-E19
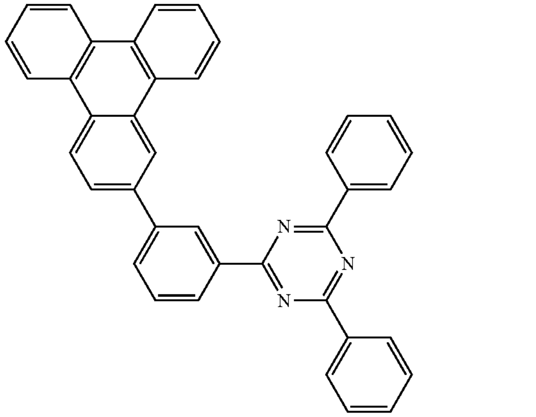
H-E20
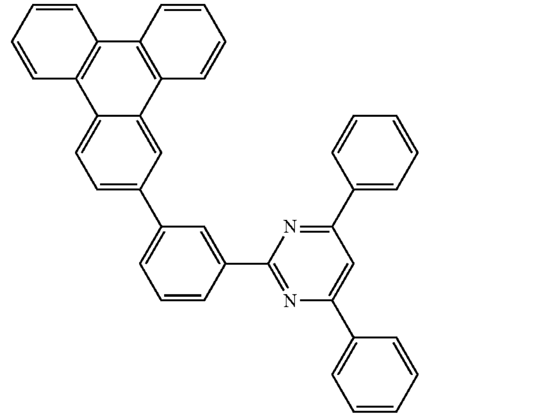

-continued
H-E21
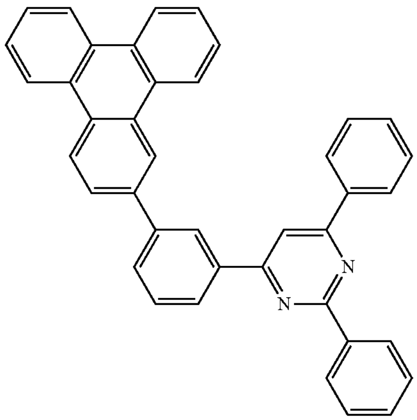
H-E22
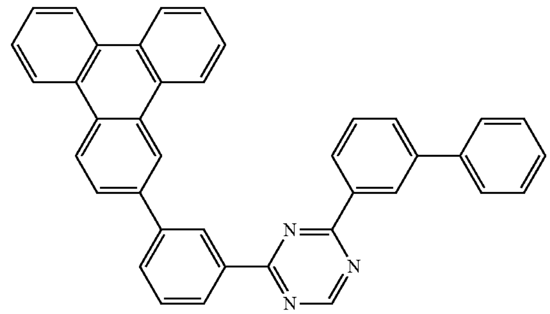
H-E23
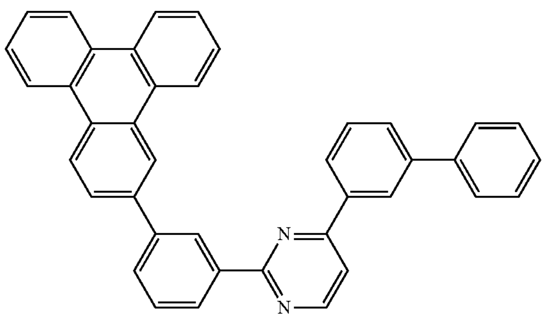
H-E24
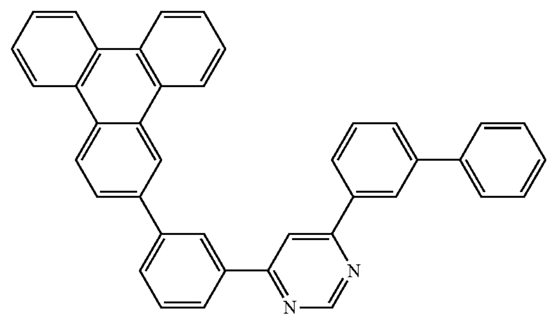
H-E25
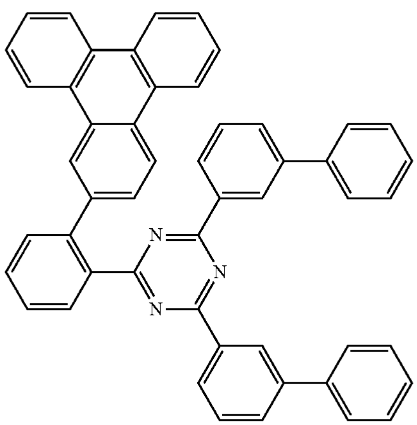
H-E26
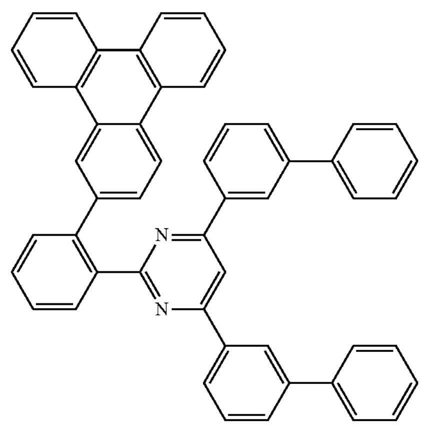
H-E27
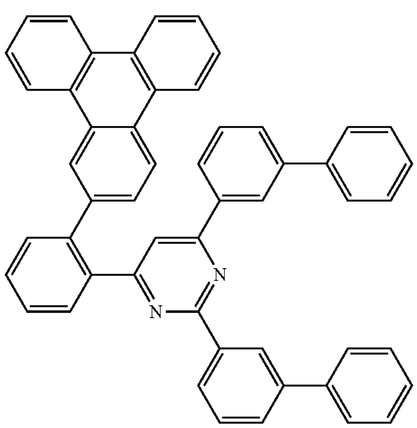
H-E28
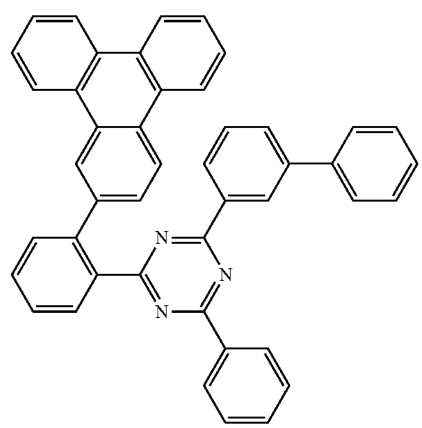

-continued
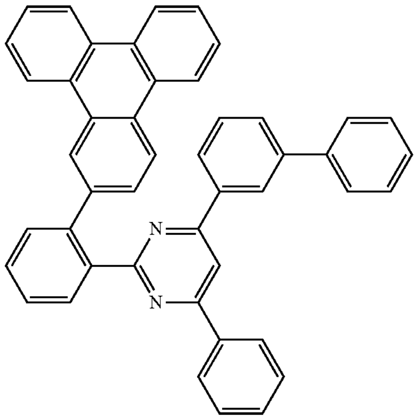
H-E29
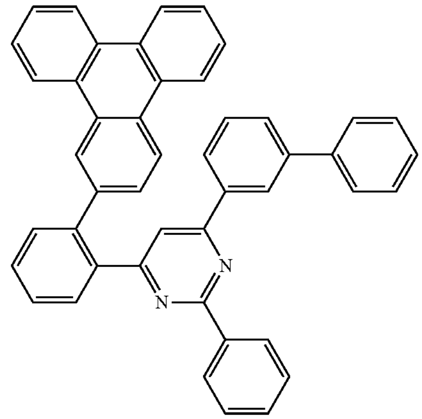
H-E30
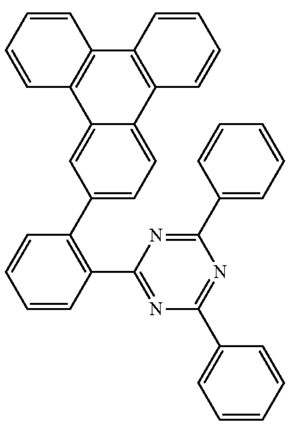
H-E31
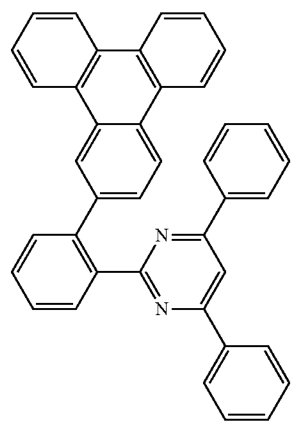
H-E32
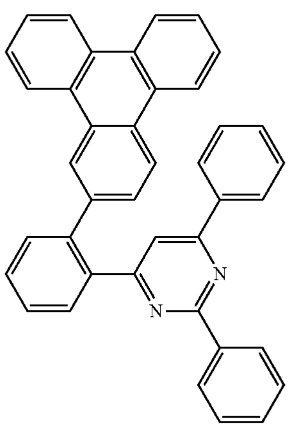
H-E33
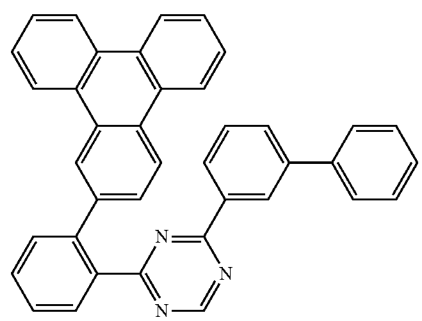
H-E34
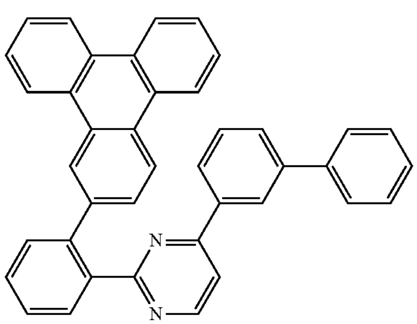
H-E35
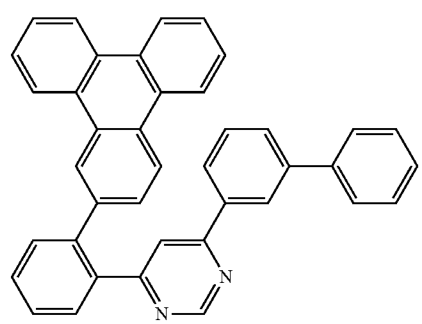
H-E36

-continued
H-E37
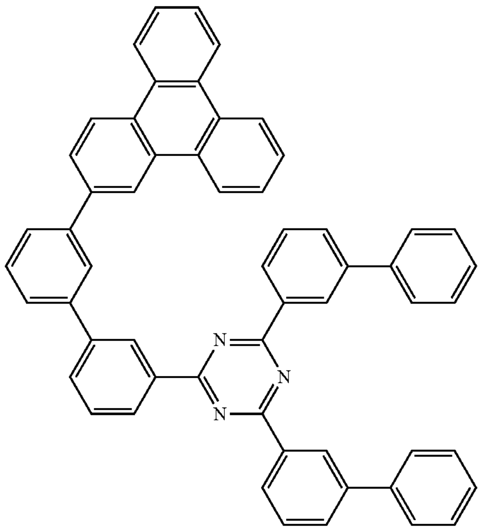
H-E38
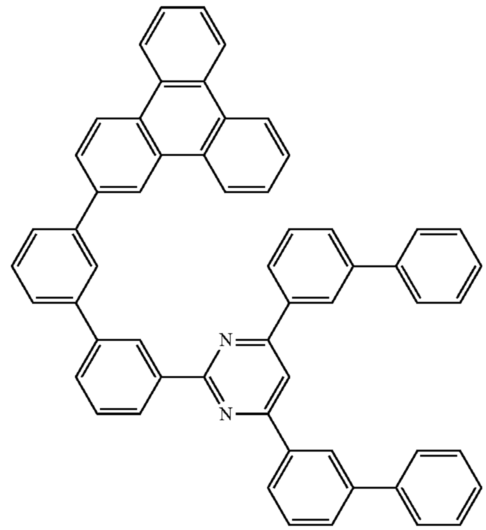
H-E39
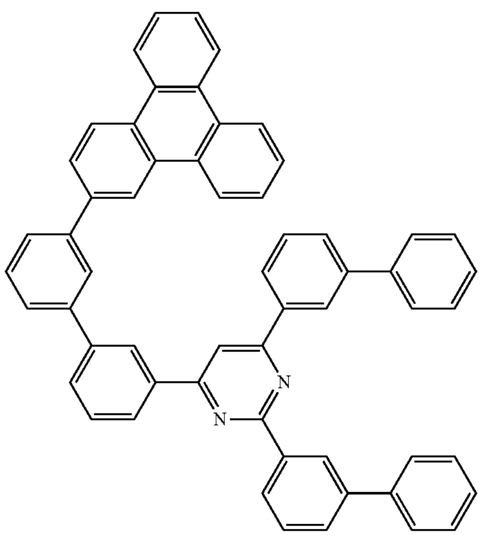
H-E40
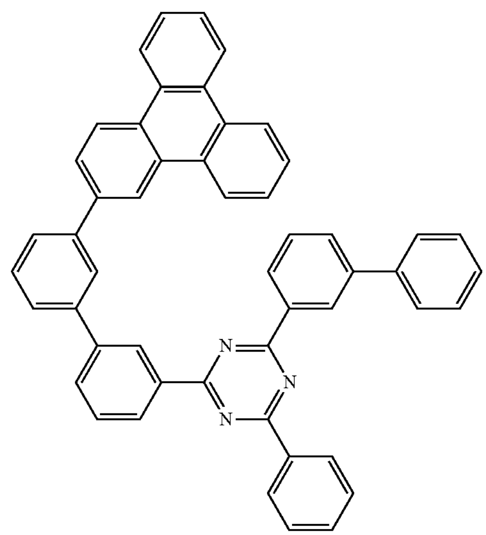
H-E41
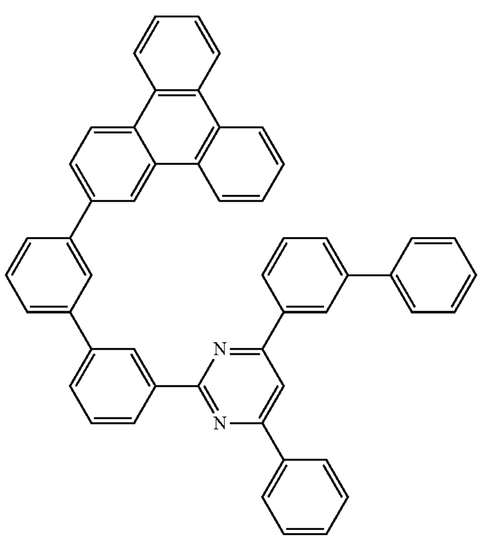
H-E42
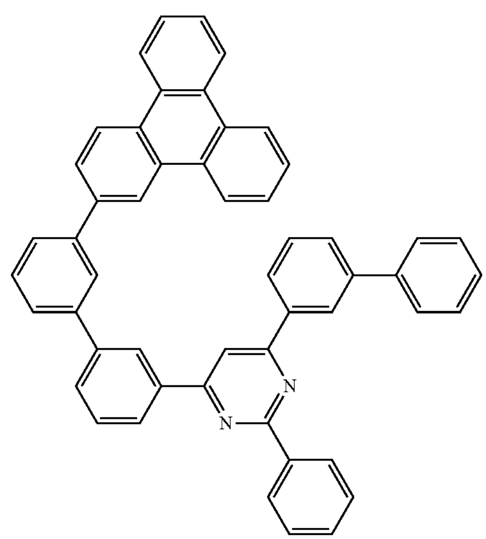

-continued
H-E43
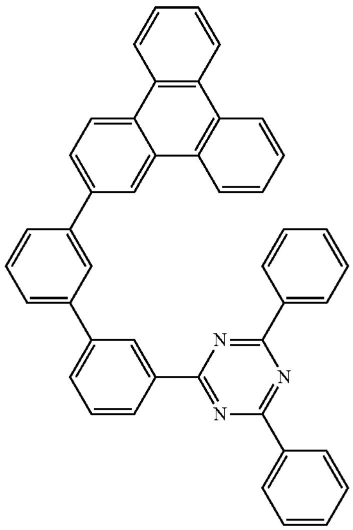
H-E44
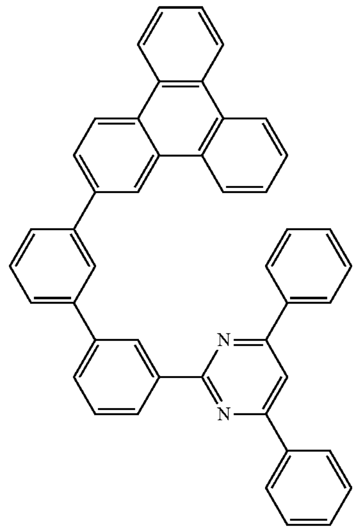
H-E45
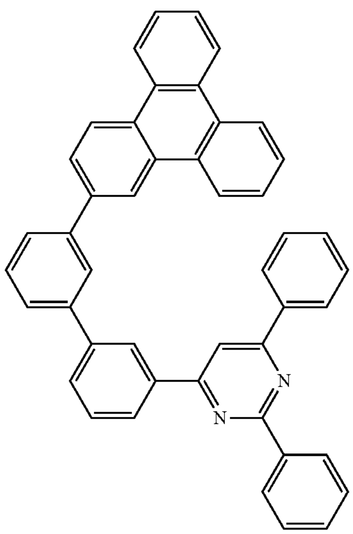
H-E46
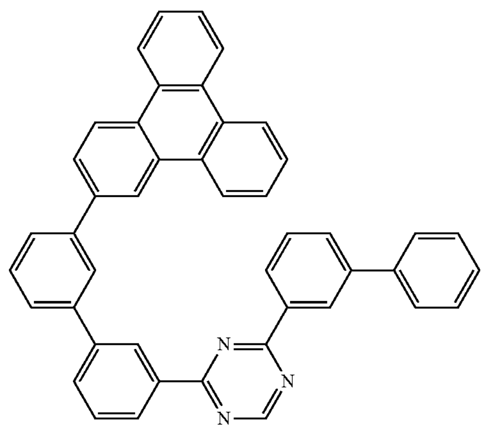
H-E47
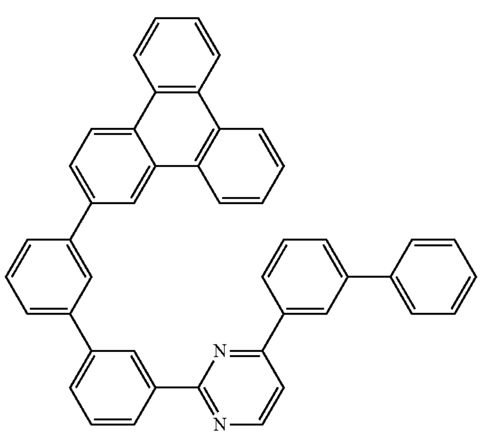
H-E48
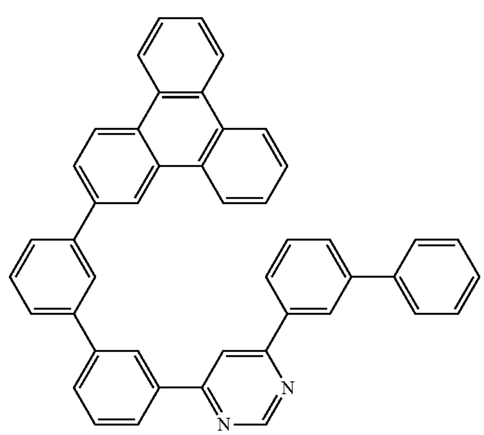

-continued
H-E49
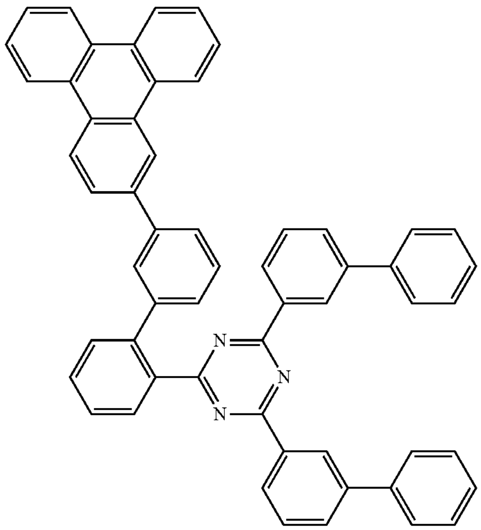
H-E50
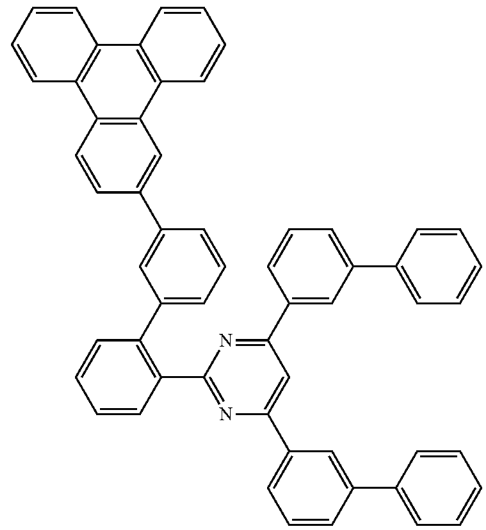
H-E51
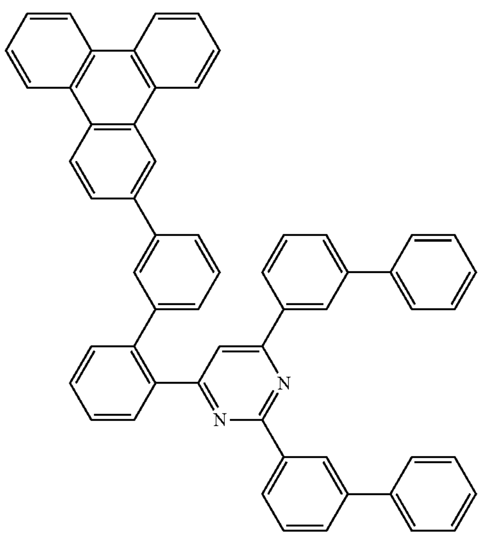
H-E52
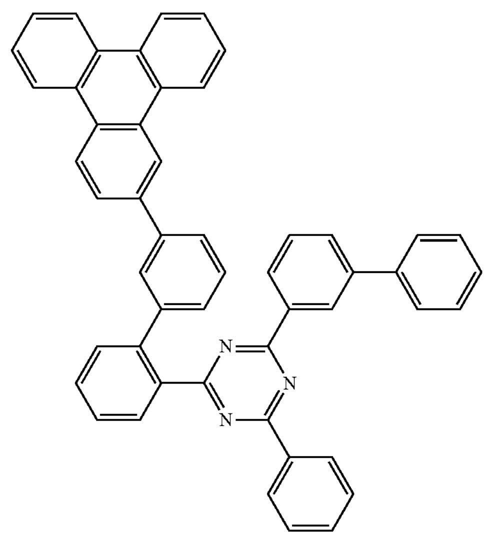
H-E53
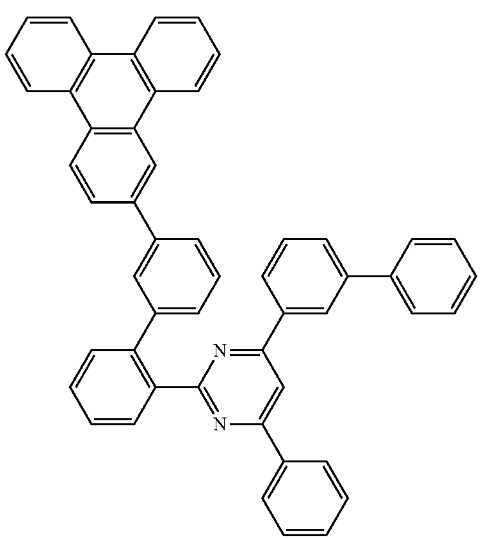
H-E54
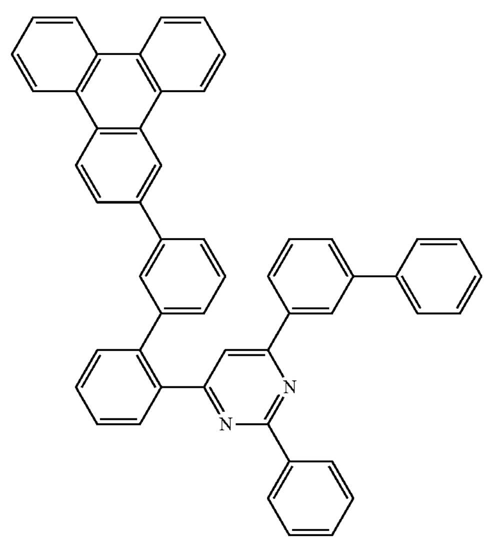

-continued
H-E55
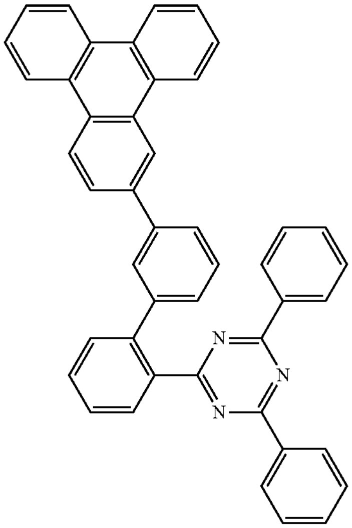
H-E56
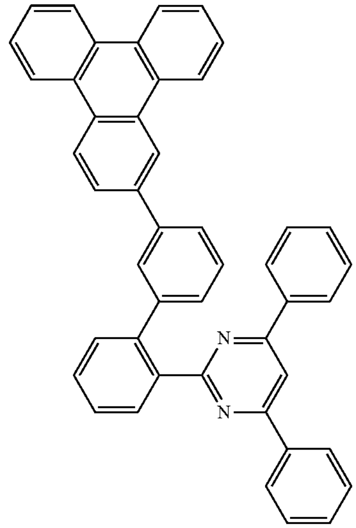
H-E57
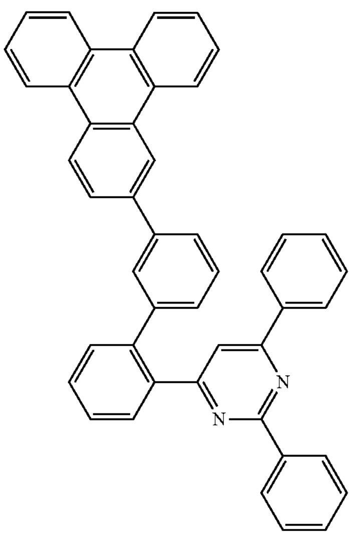
H-E58
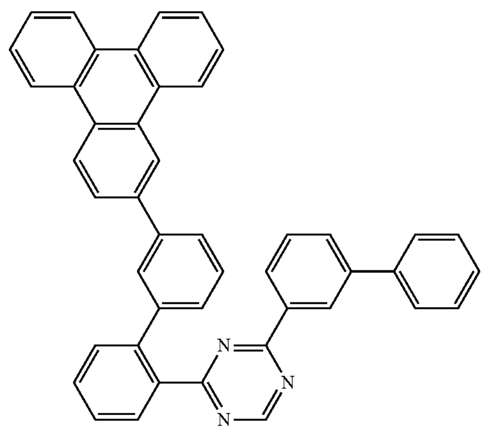
H-E59
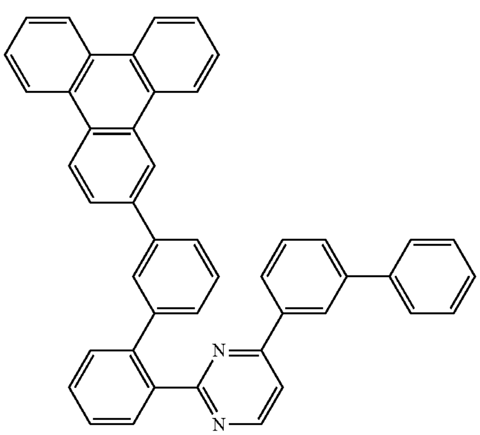
H-E60
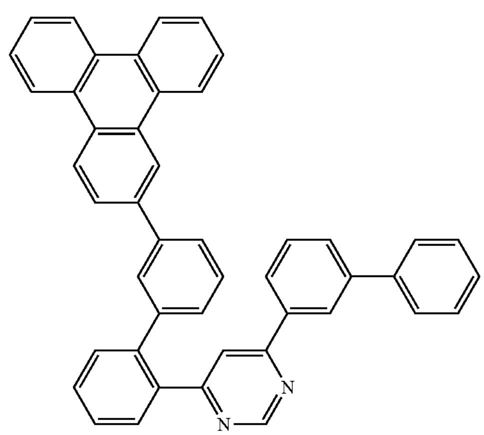

-continued
H-E61
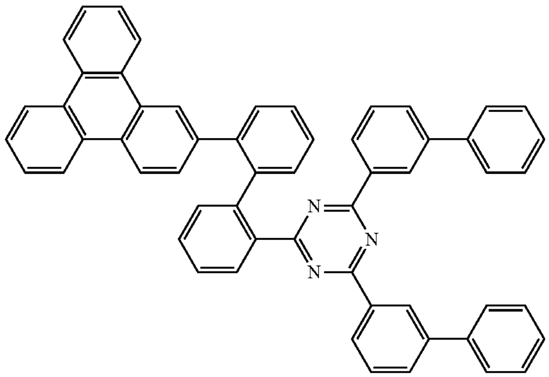
H-E62
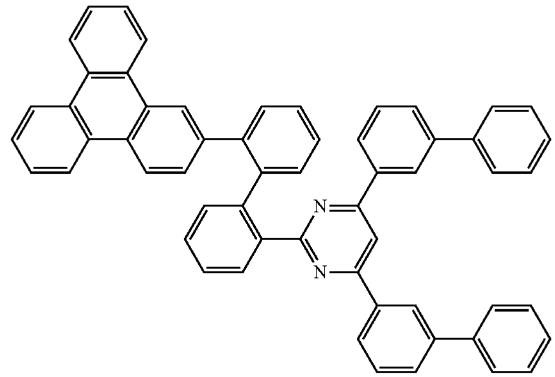
H-E63
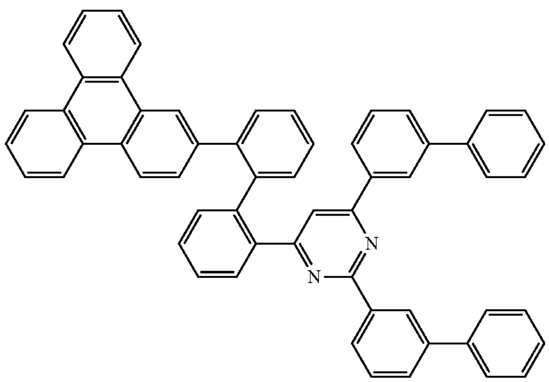
H-E64
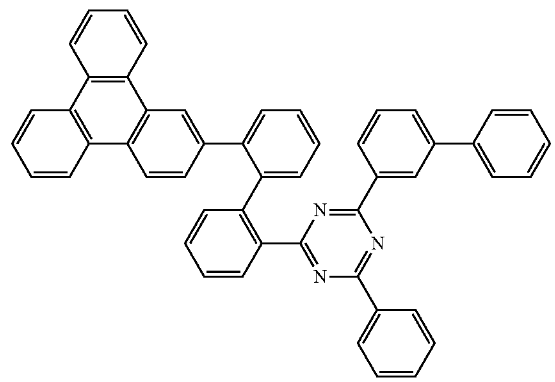
H-E65
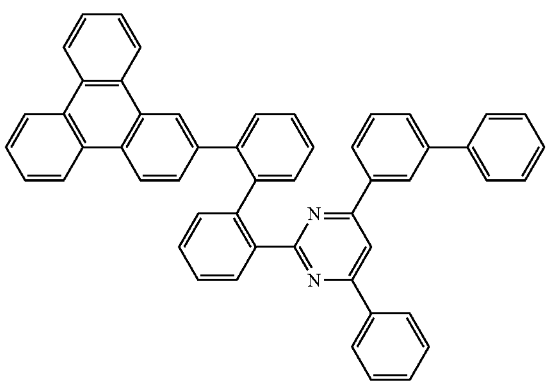
H-E66
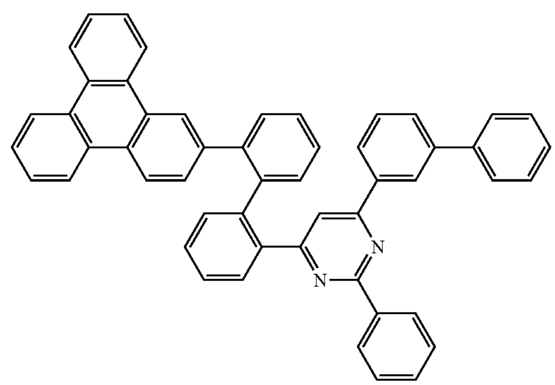
H-E67
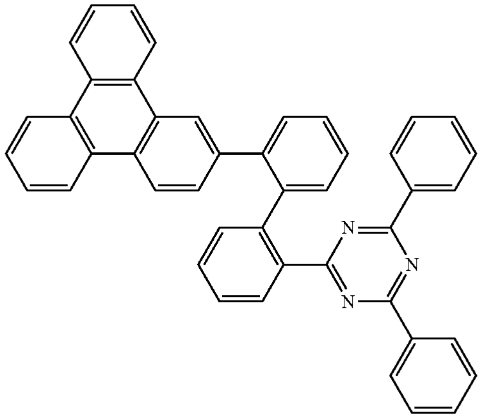
H-E68
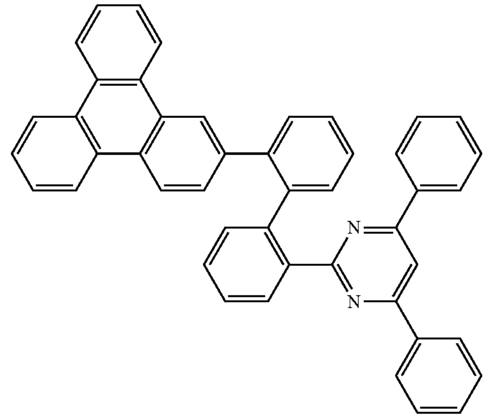

-continued
H-E69
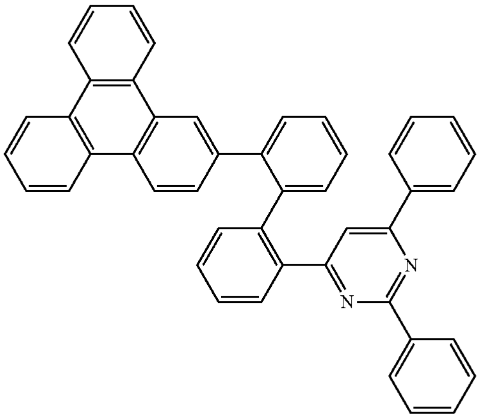
H-E70
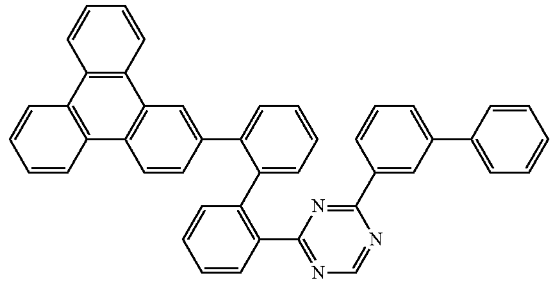
H-E71
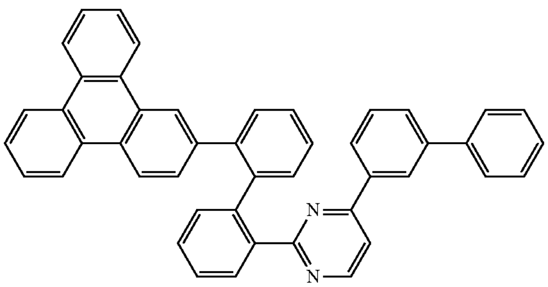
H-E72
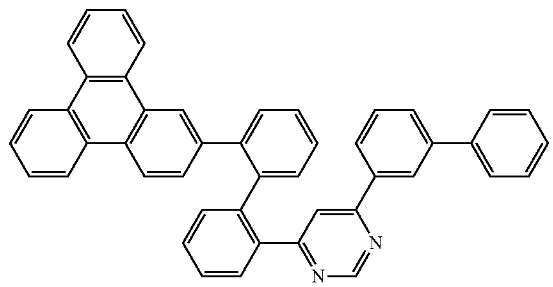
H-E73
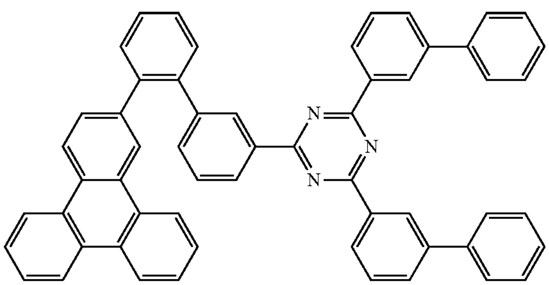
H-E74
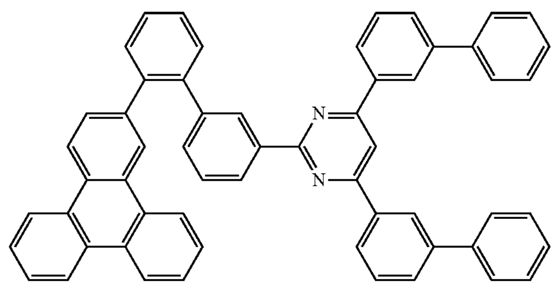
H-E75
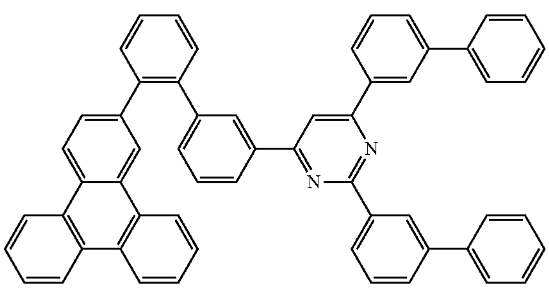
H-E76
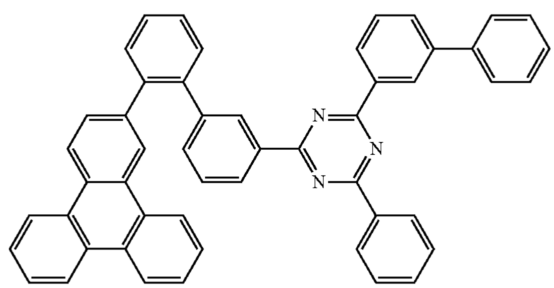
H-E77
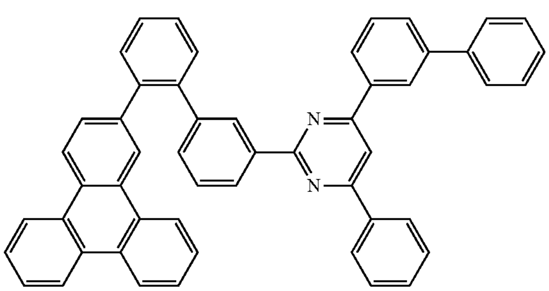
H-E78
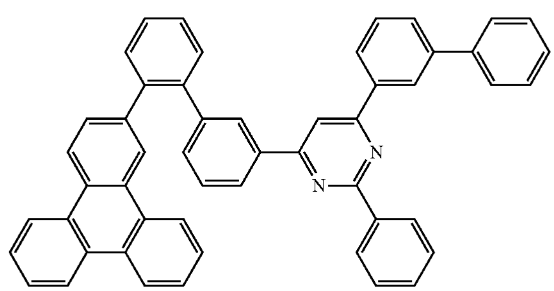

-continued
H-E79
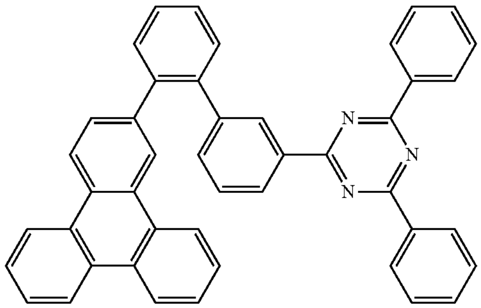
H-E80
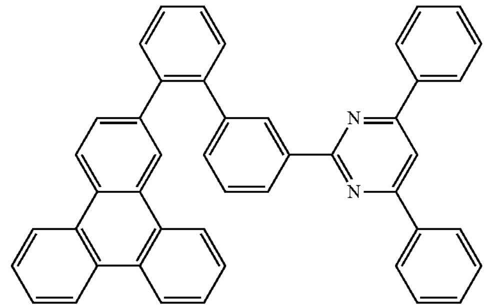
H-E81
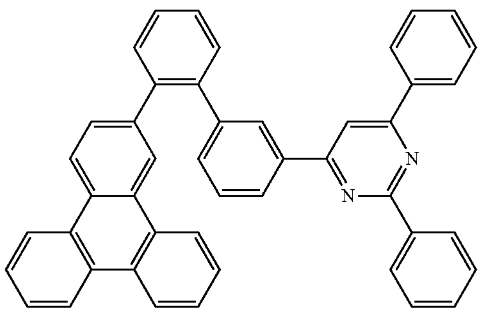
H-E82
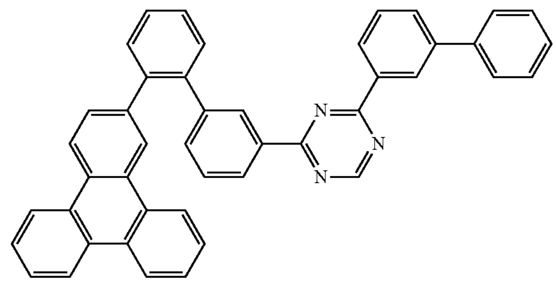
H-E83
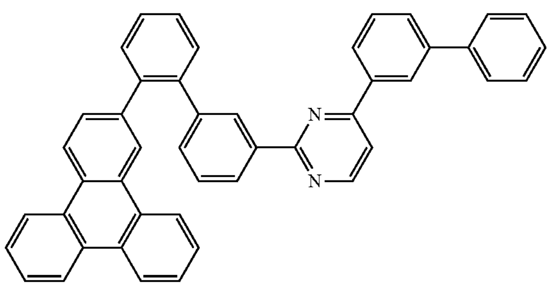
H-E84
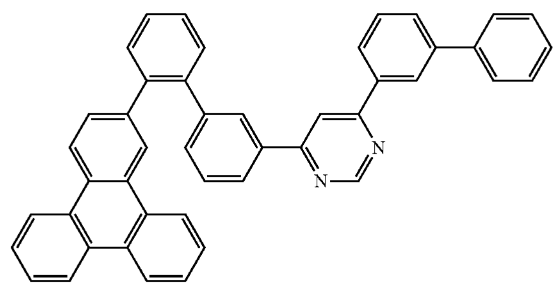
H-E(1)
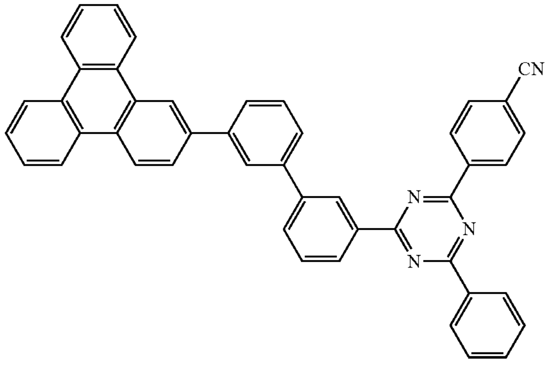
H-E(2)
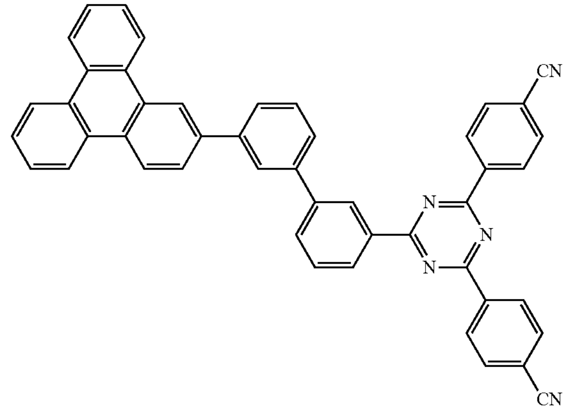

-continued
H-E(3)
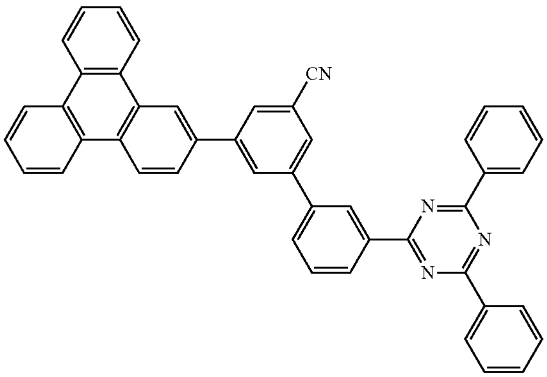
H-E(4)
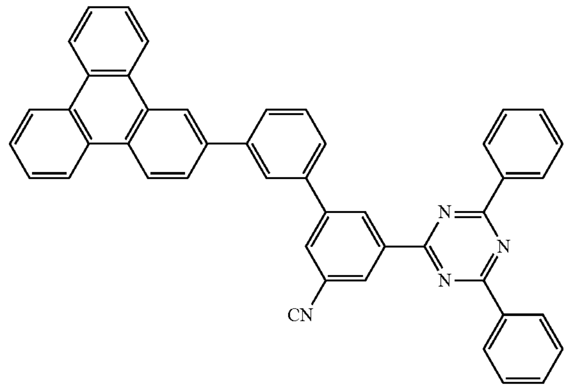
A-1
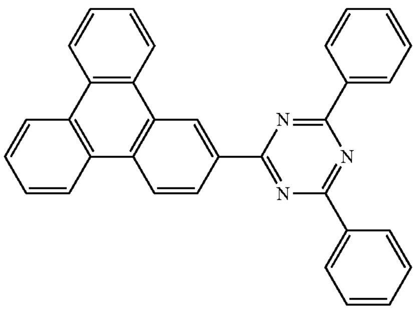
A-2
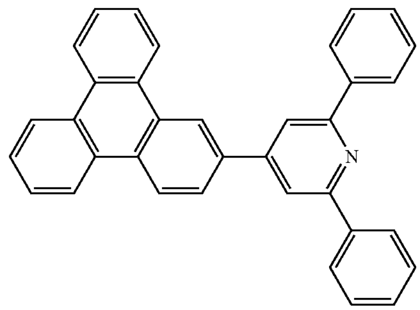
A-3
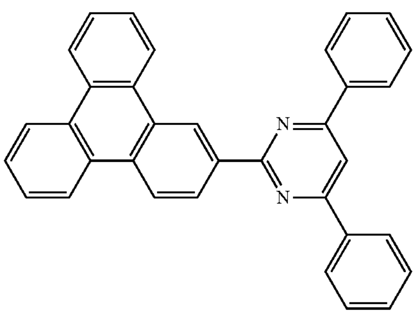
A-4
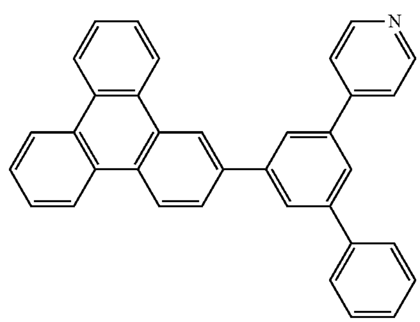
A-5
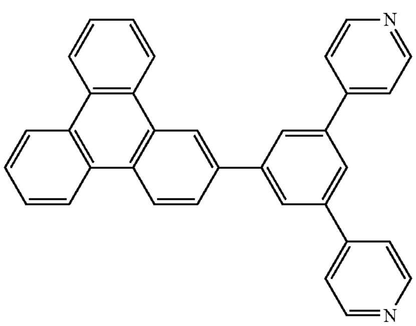
A-6
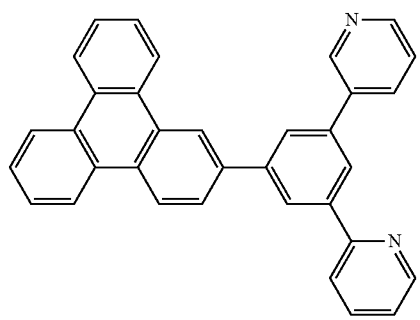

-continued
A-7
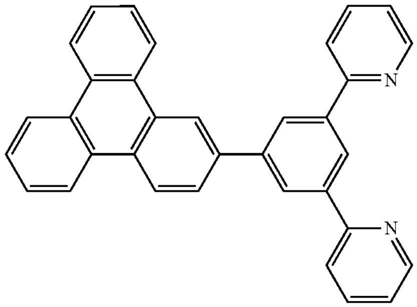
A-8
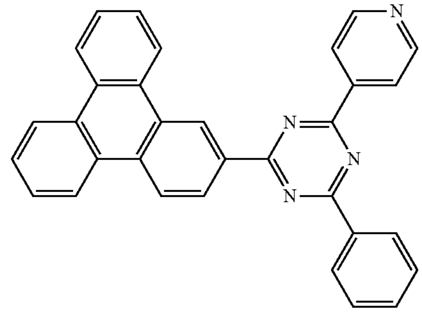
A-9
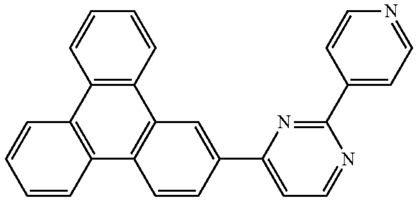
A-10
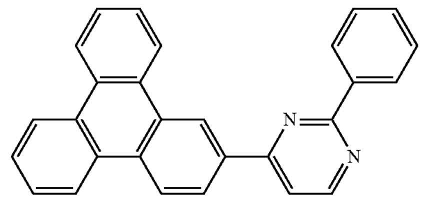
A-11
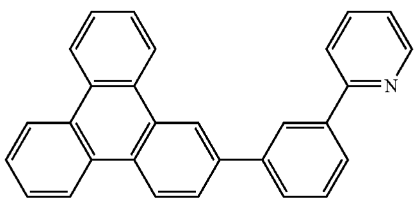
A-12
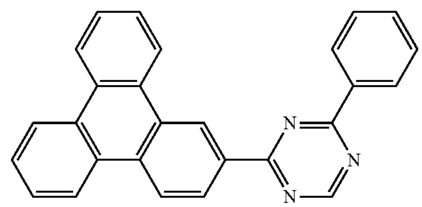
A-13
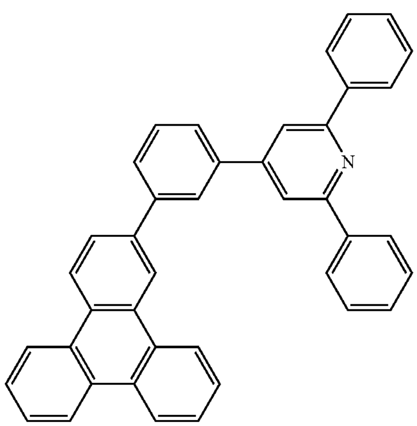
A-14
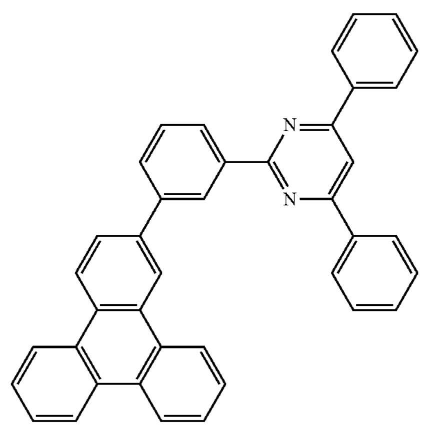
A-15
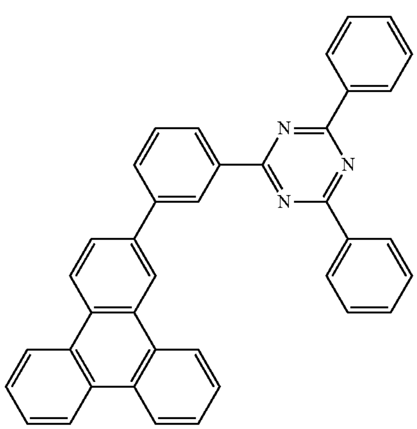
A-16
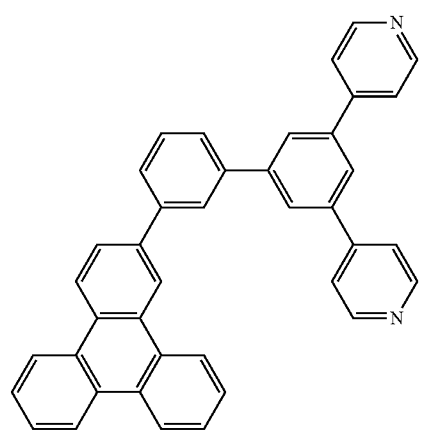

-continued
A-17
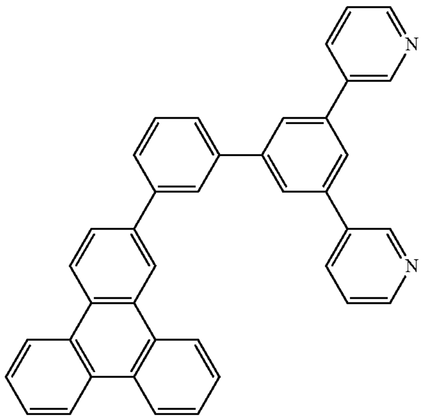
A-18
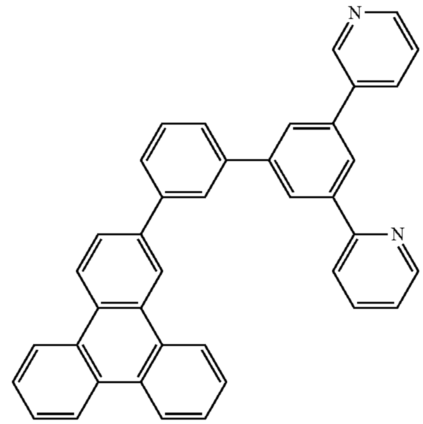
A-19
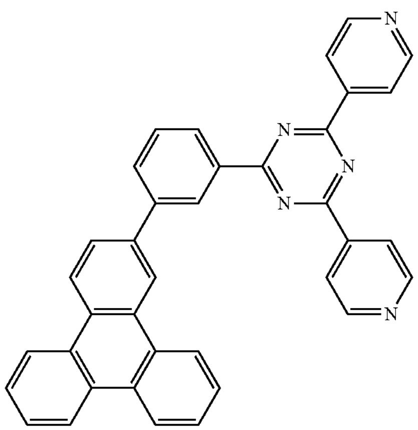
A-20
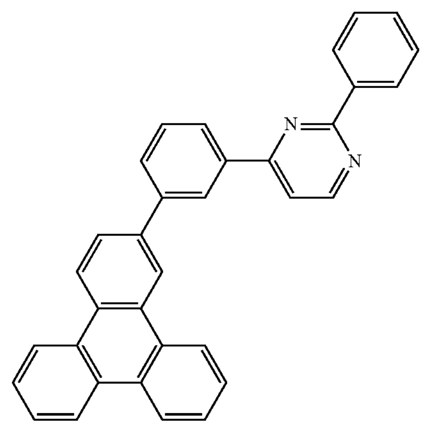
A-21
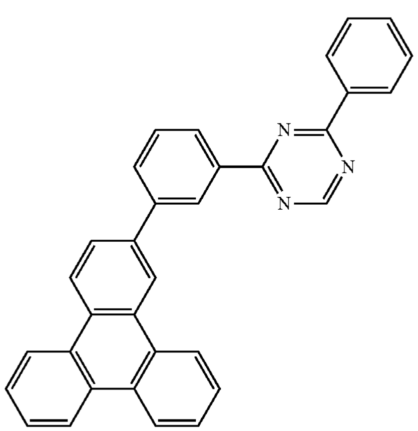
A-22
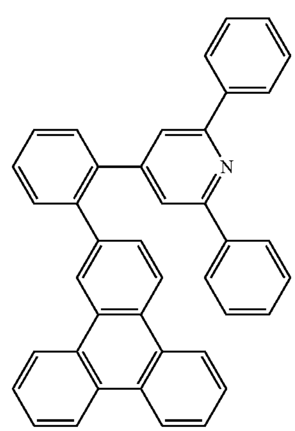

-continued
A-23
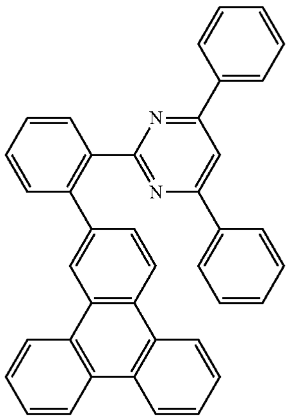
A-24
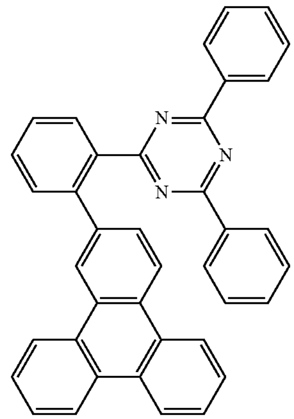
A-25
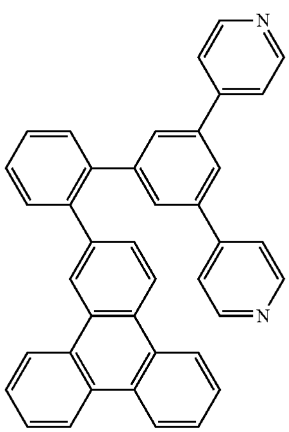
A-26
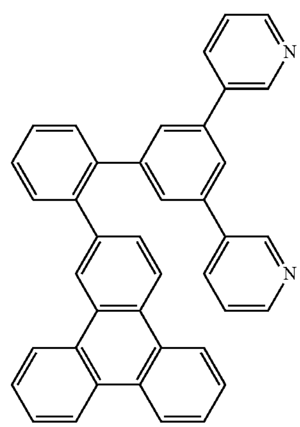
A-27
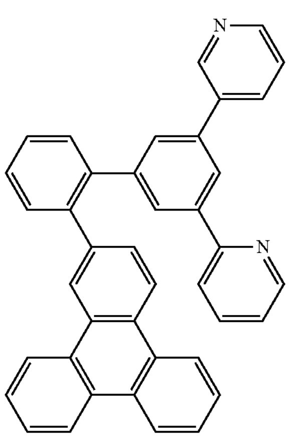
A-28
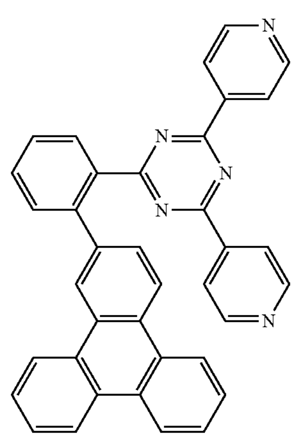

-continued
A-29
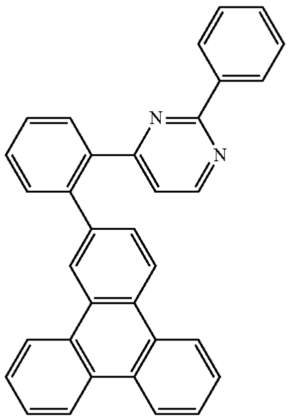
A-30
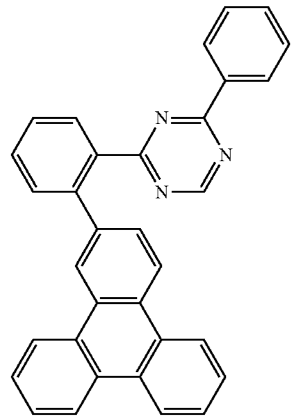
A-31
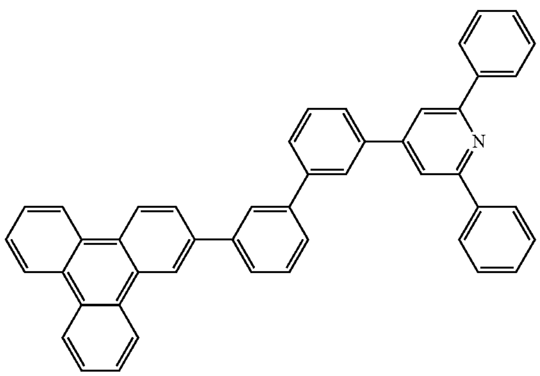
A-32
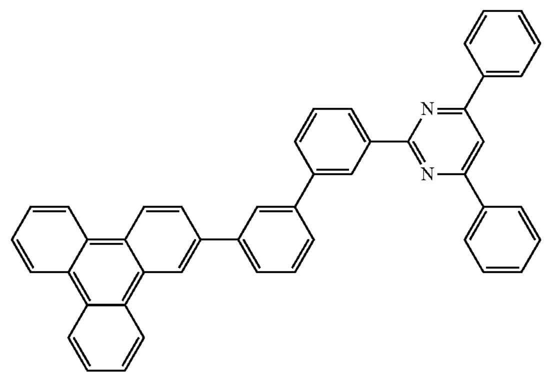
A-33
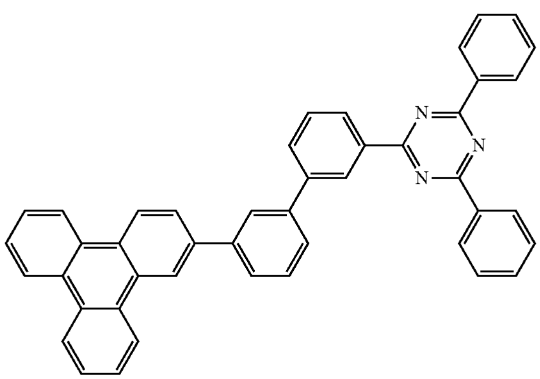
A-34
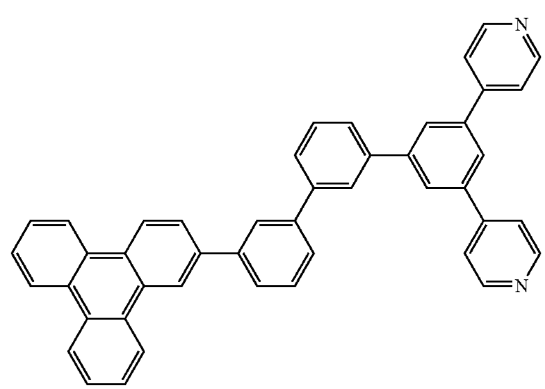
A-35
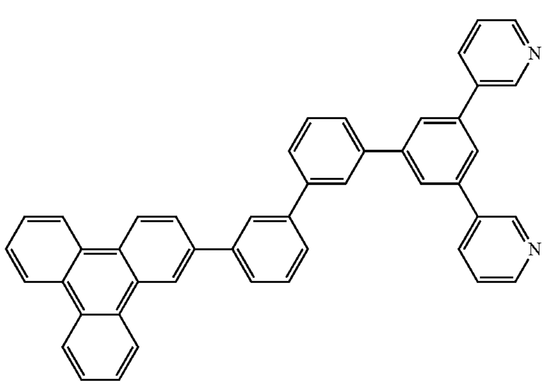
A-36
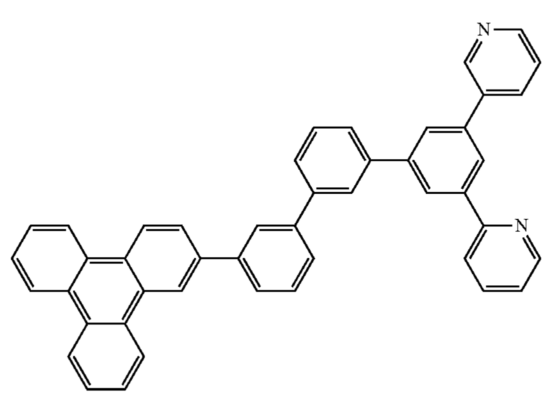

-continued
A-37
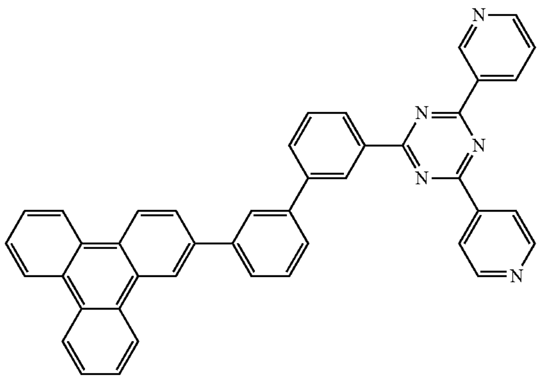
A-38
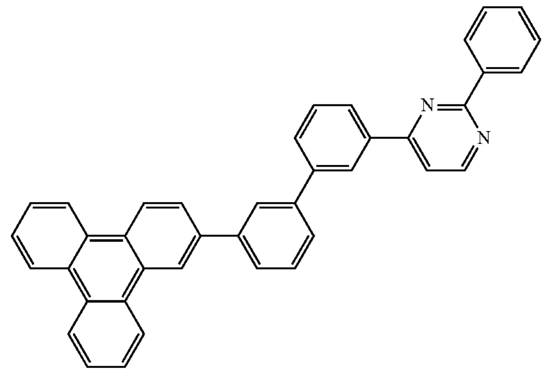
A-39
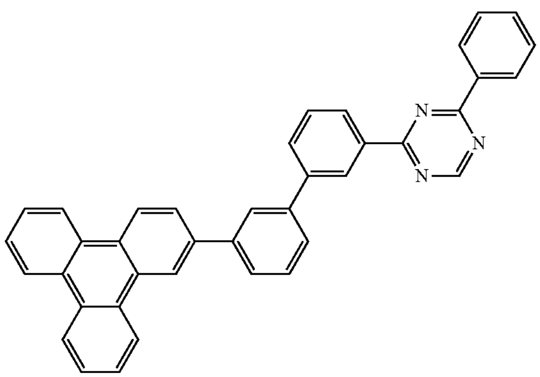
A-40
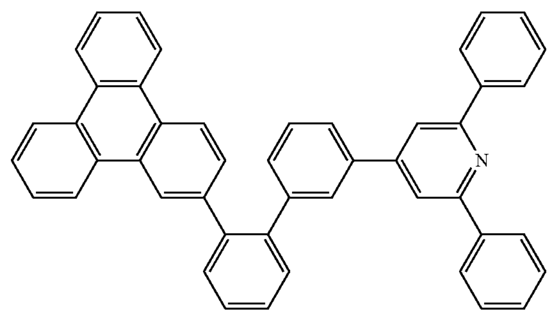
A-41
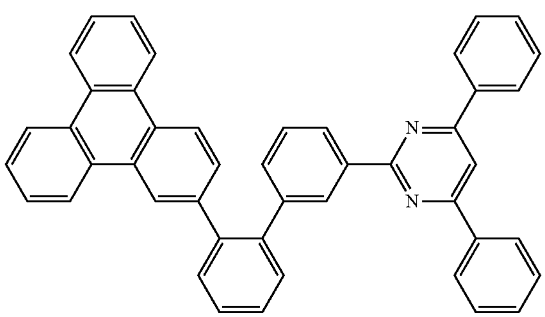
A-42
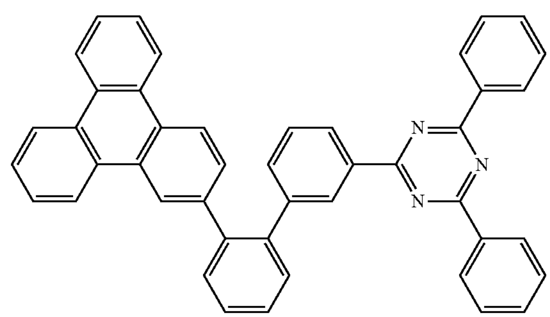
A-43
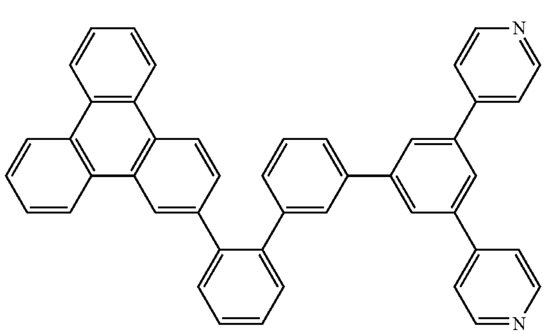
A-44
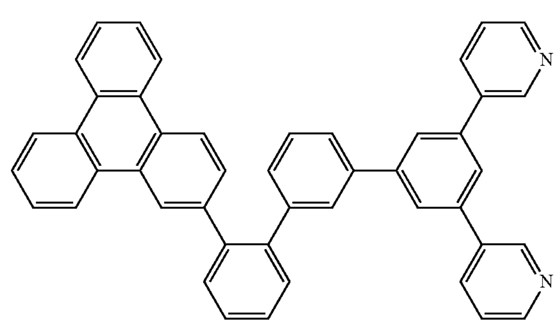

-continued
A-45
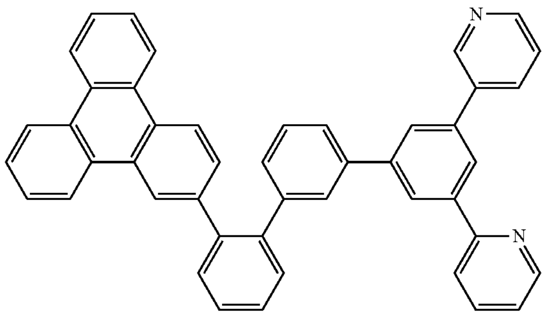
A-46
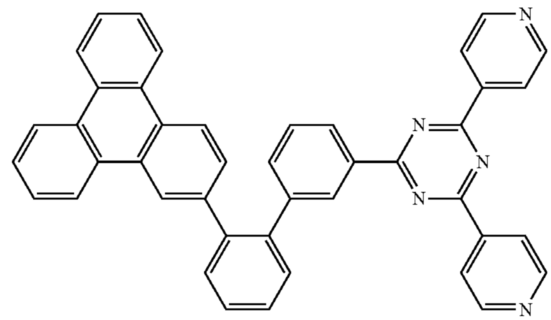
A-47
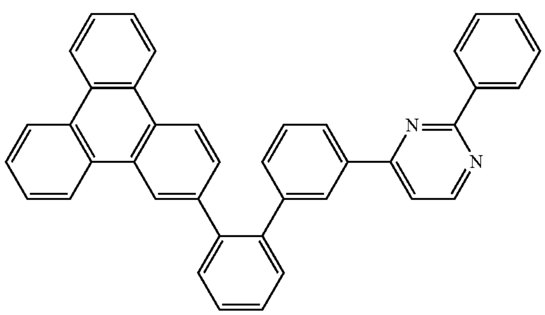
A-48
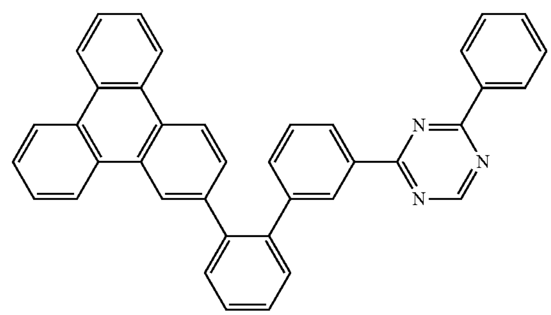
A-49
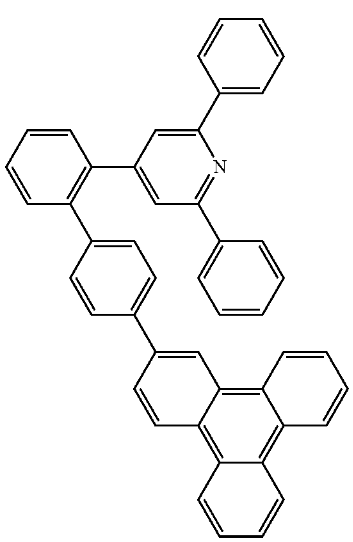
A-50
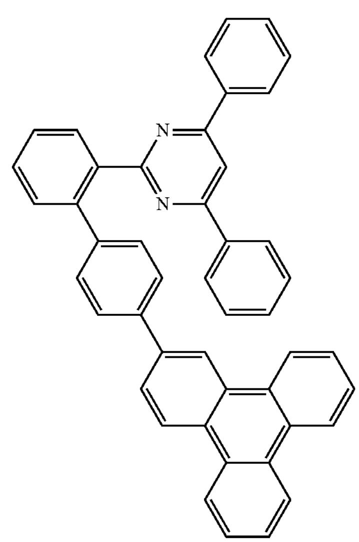

-continued
A-51
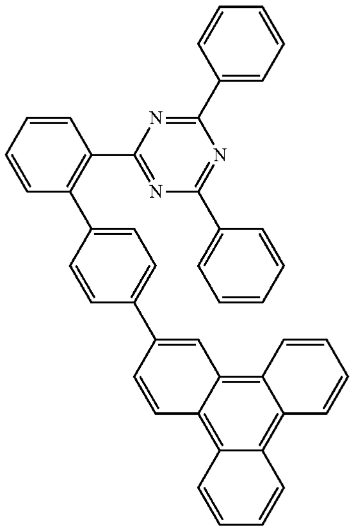
A-52
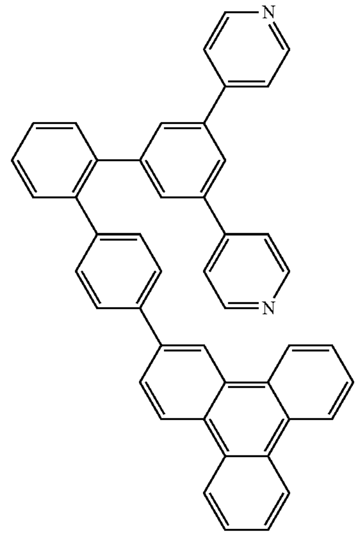
A-53
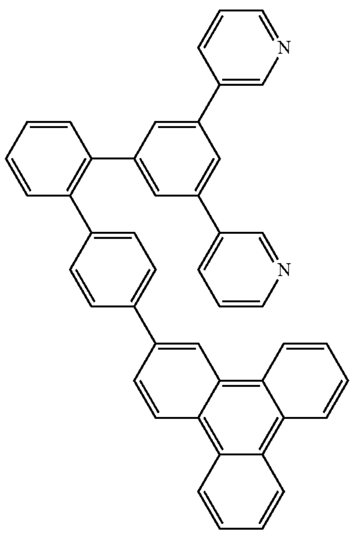
A-54
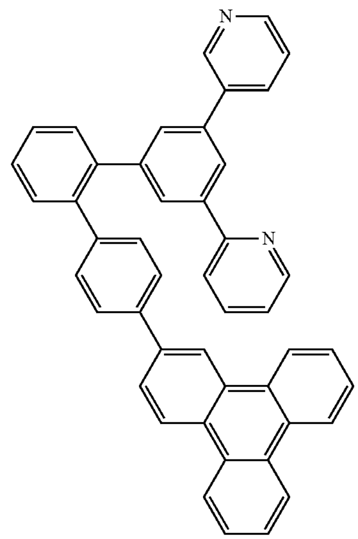
A-55
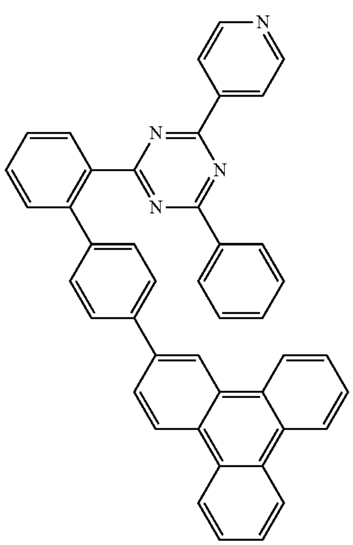
A-56
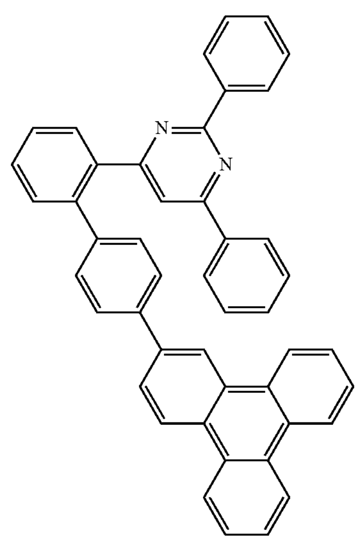

-continued
A-57
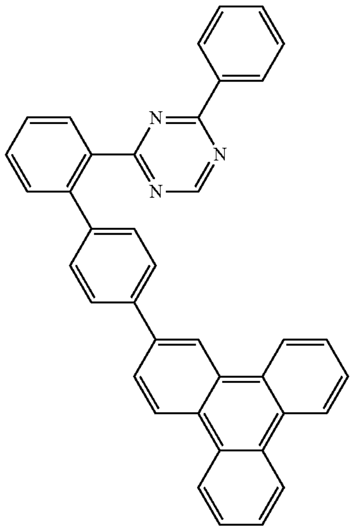
A-58
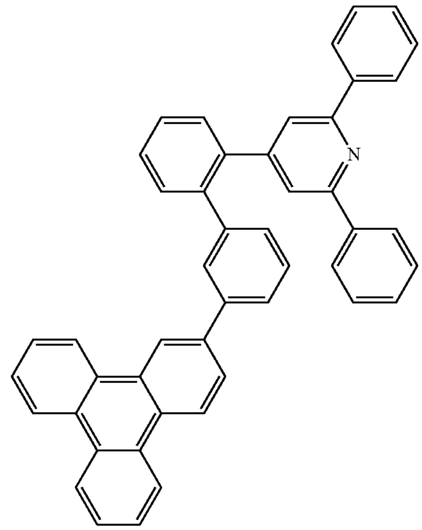
A-59
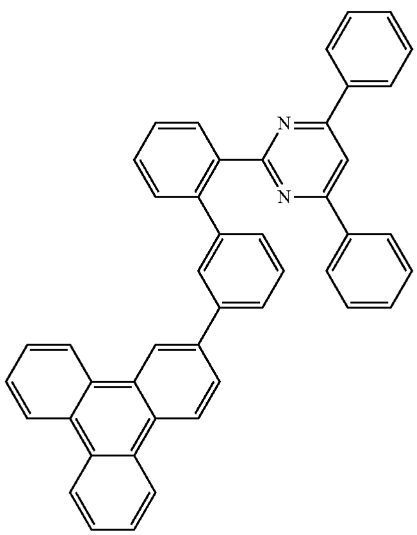
A-60
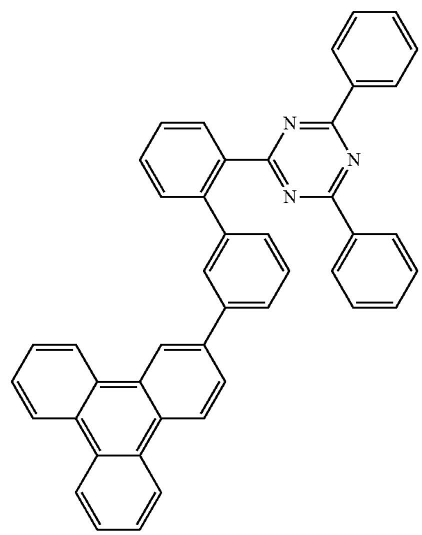
A-61
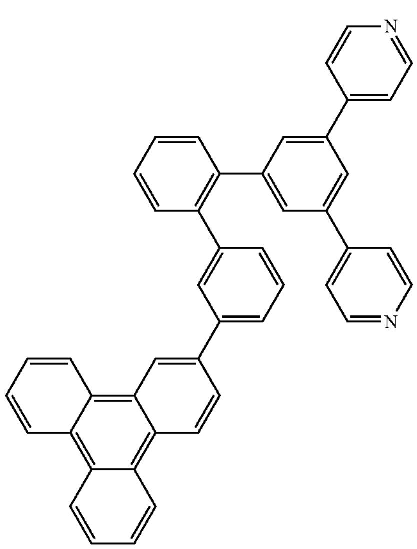
A-62
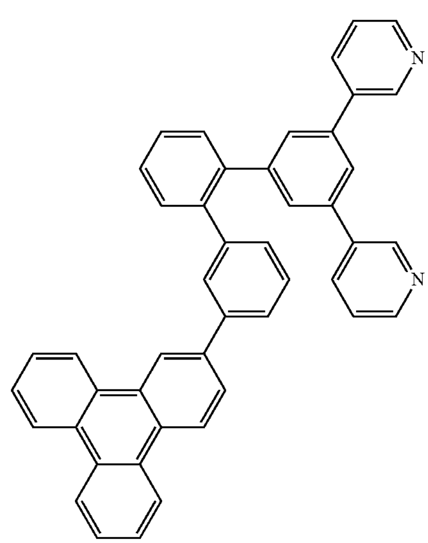

-continued
A-63
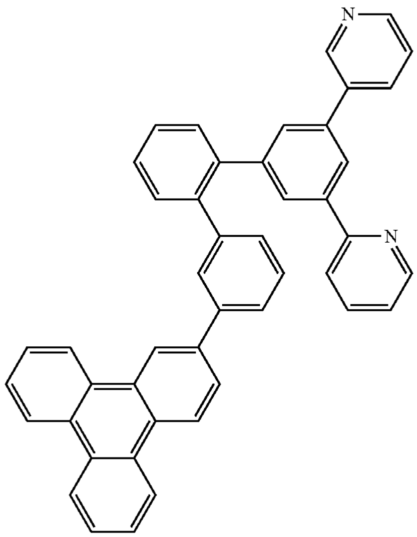
A-64
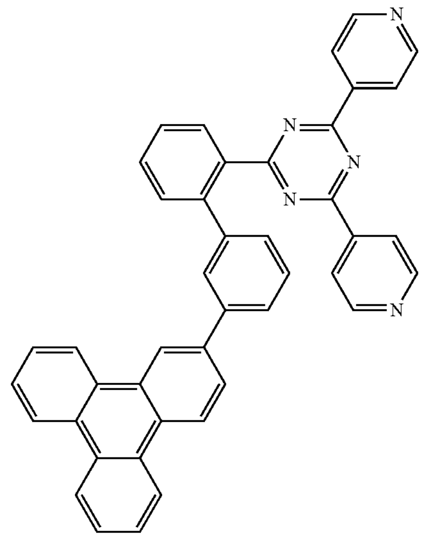
A-65
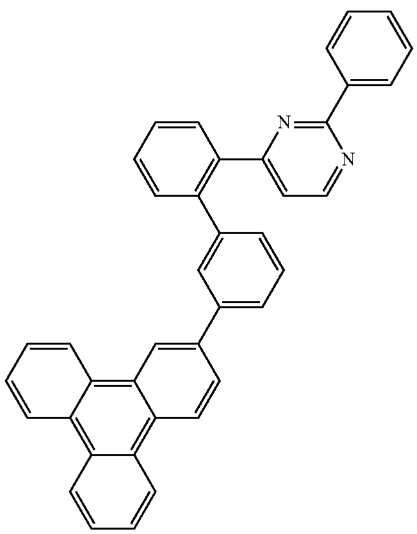
A-66
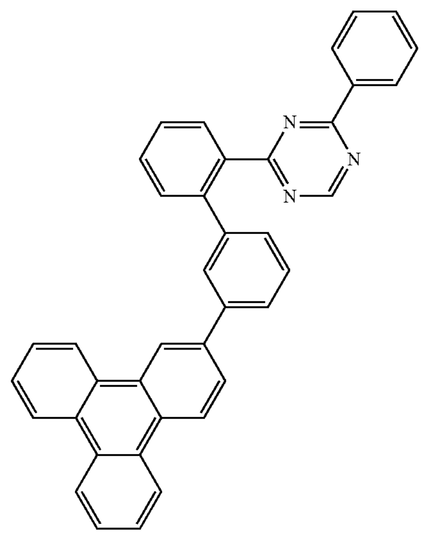
A-67
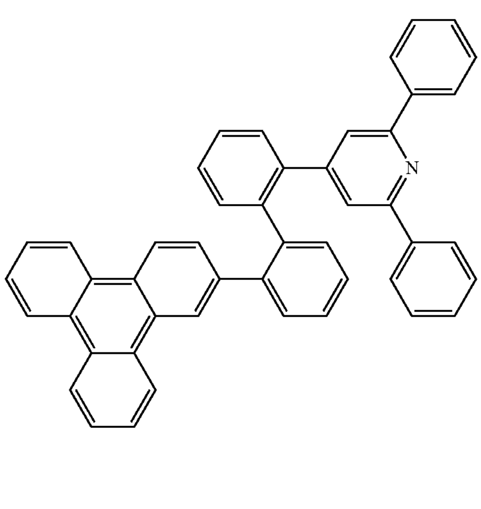
A-68
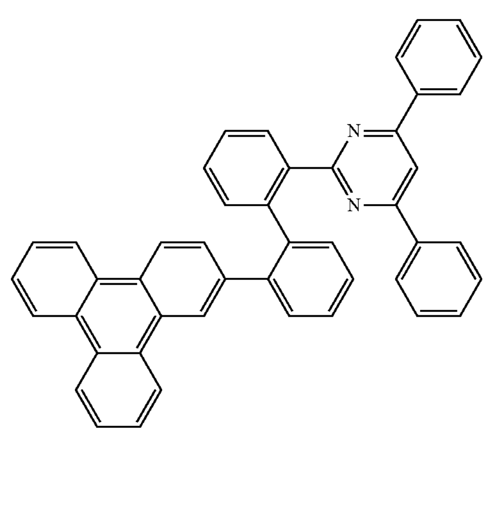

-continued
A-69
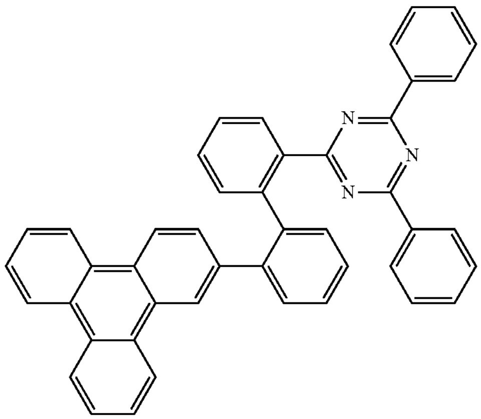
A-70
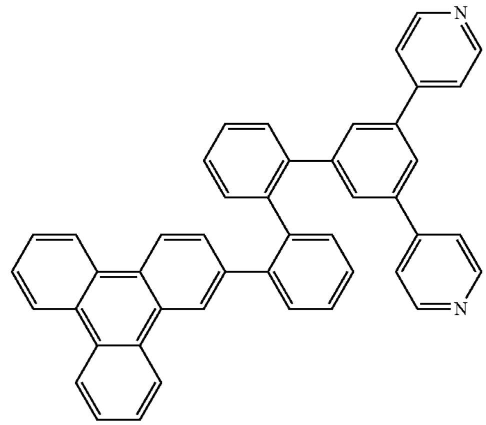
A-71
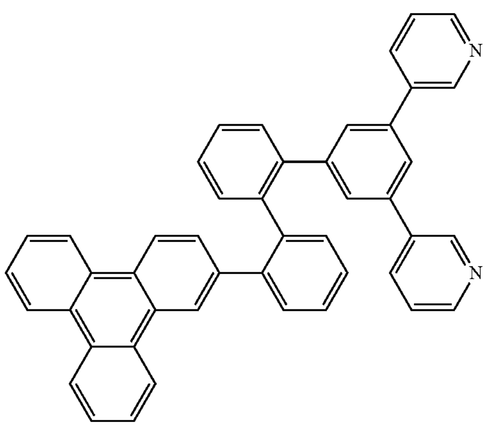
A-72
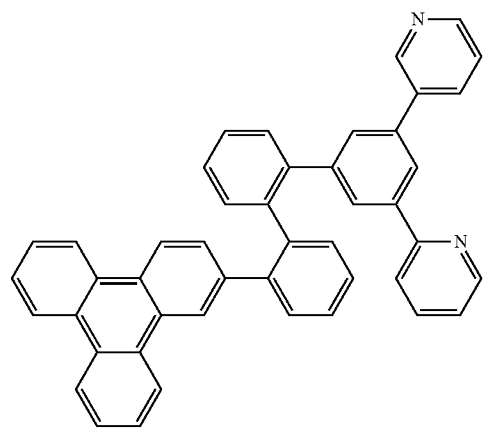
A-73
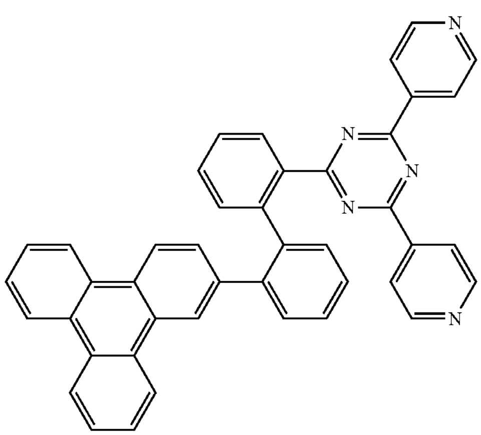
A-74
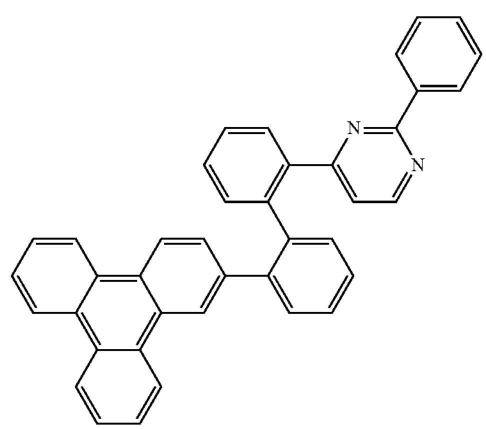

-continued
A-75
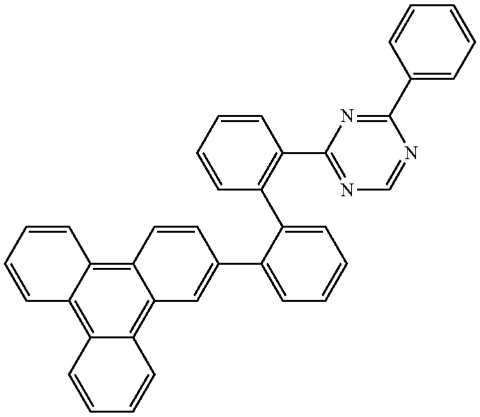
A-76
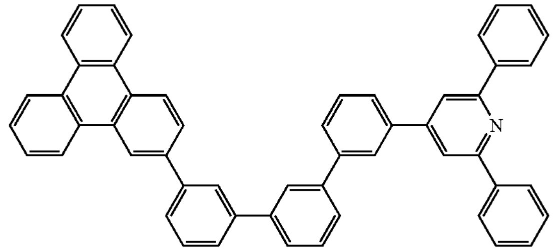
A-77
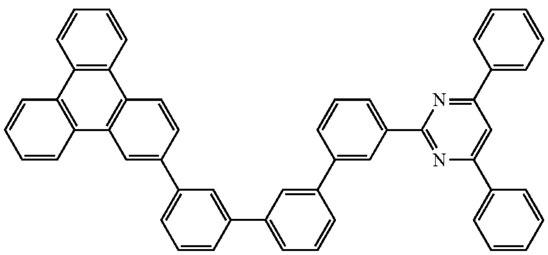
A-78
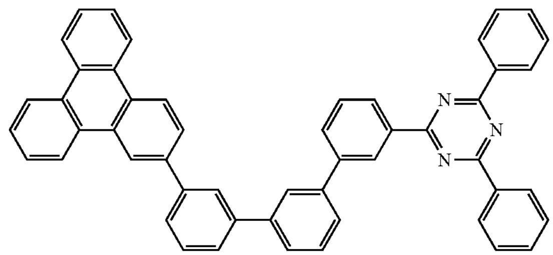
A-79
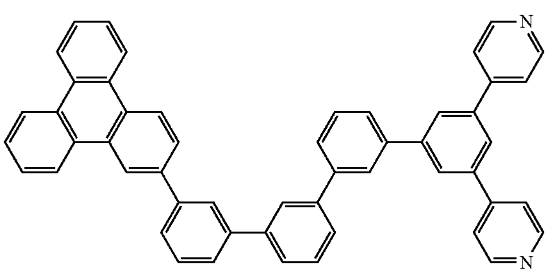
A-80
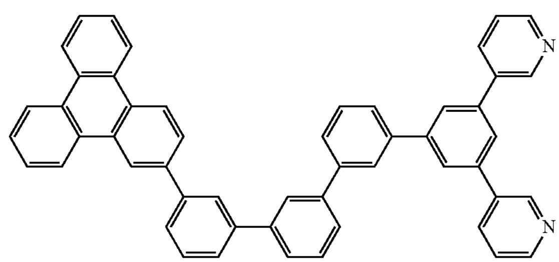
A-81
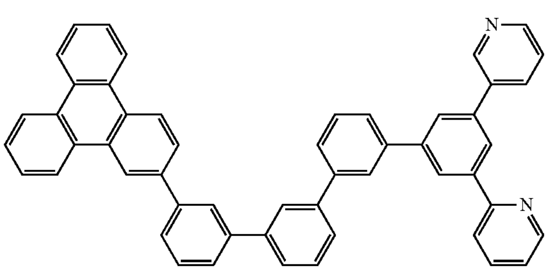
A-82
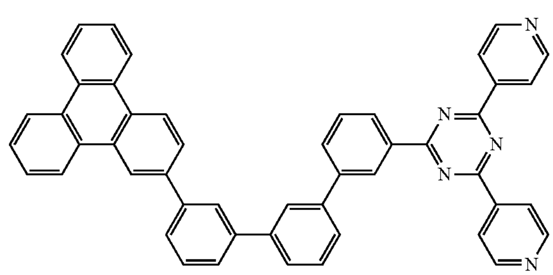
A-83
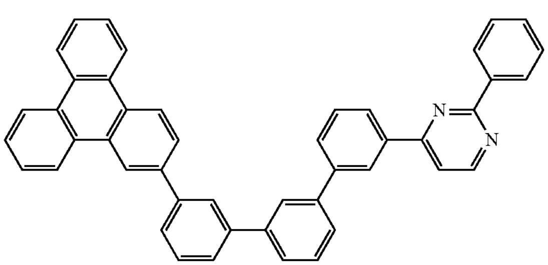
A-84
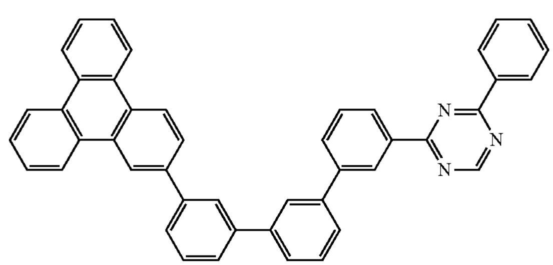

-continued
A-85
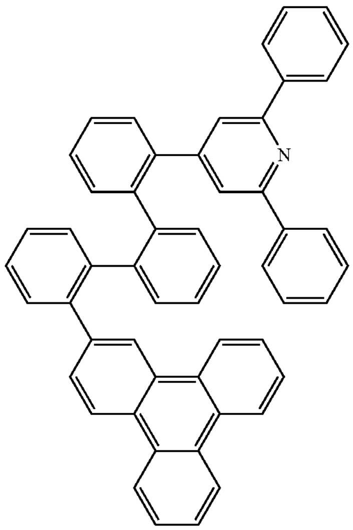
A-86
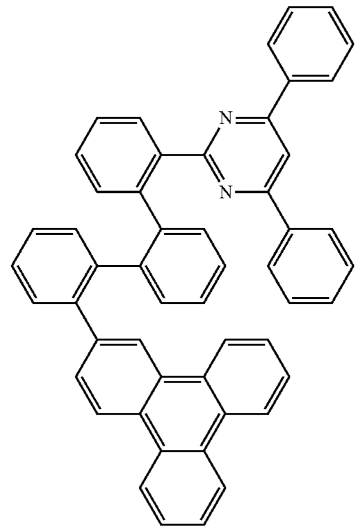
A-87
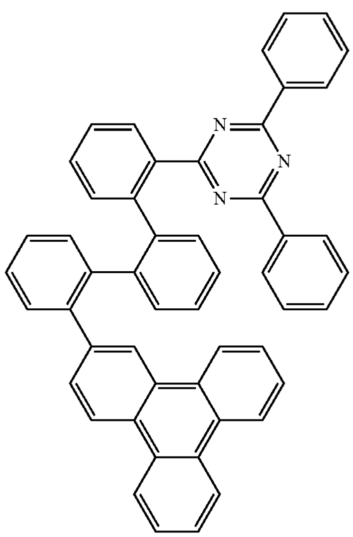
A-88
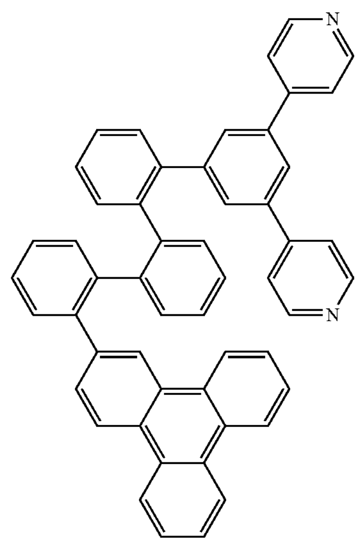
A-89
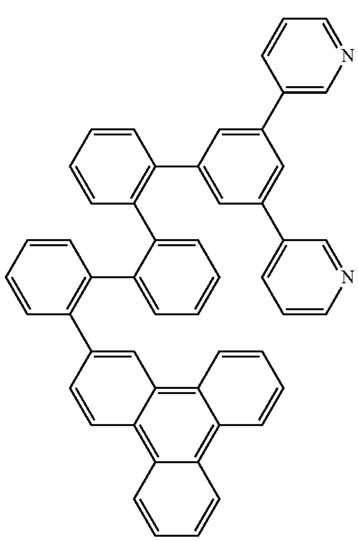
A-90
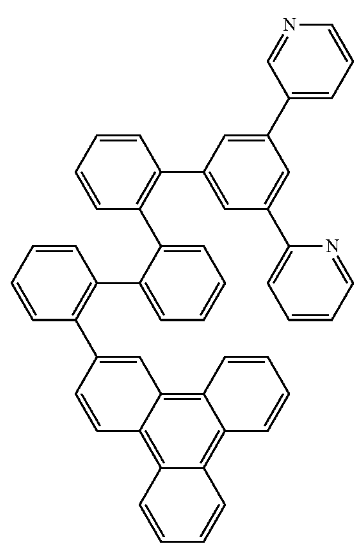

-continued
A-91
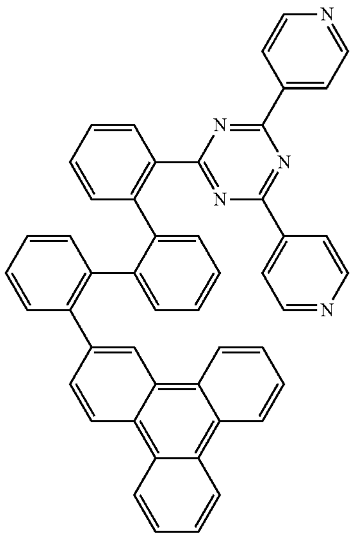
A-92
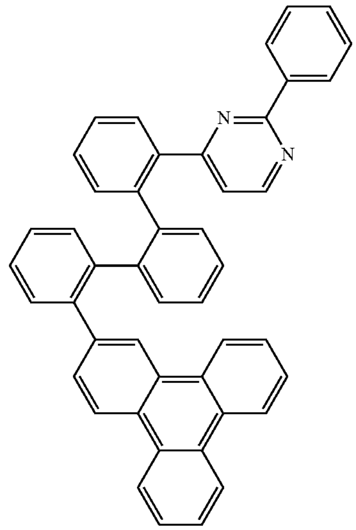
A-93
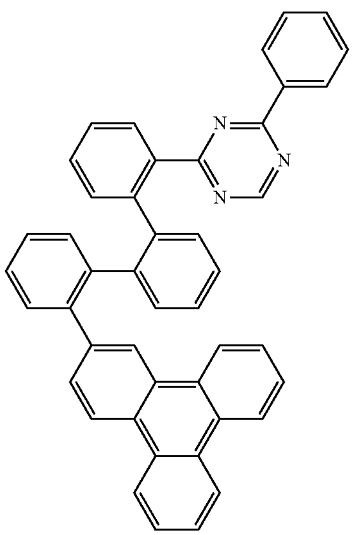
A-94
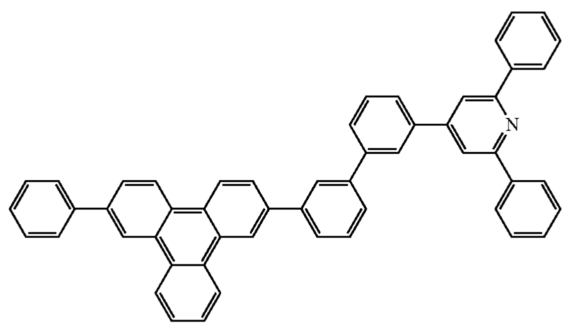
A-95
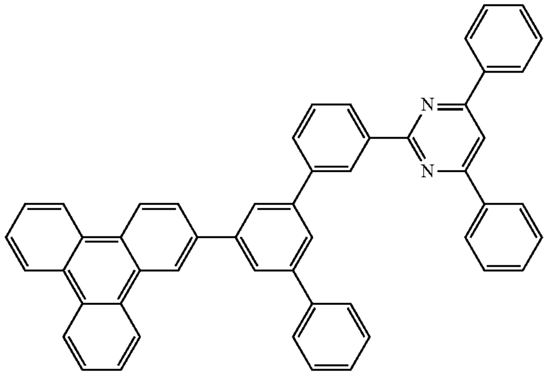
A-96
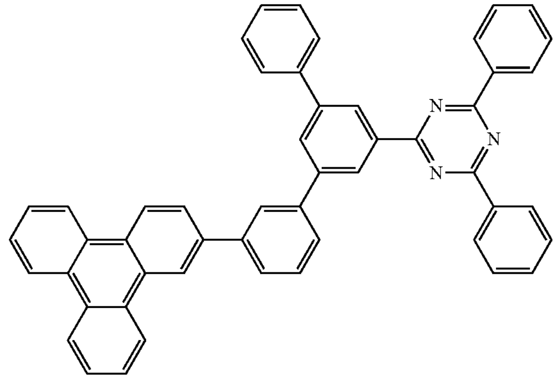

-continued
A-97
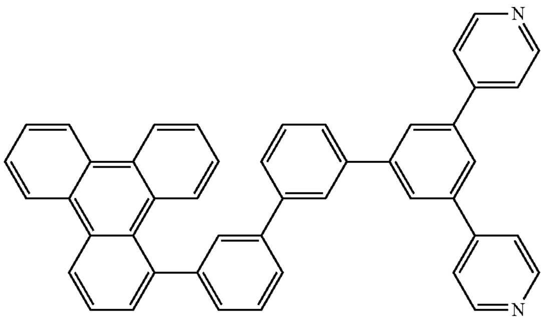
A-98
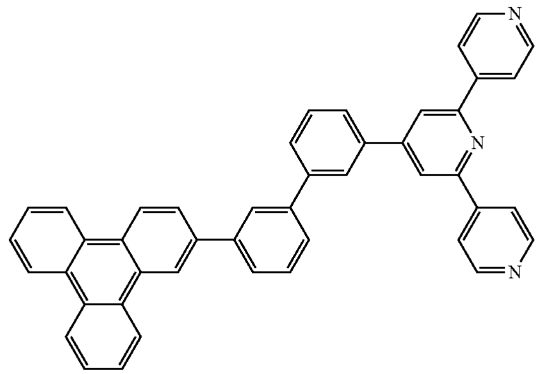
A-99
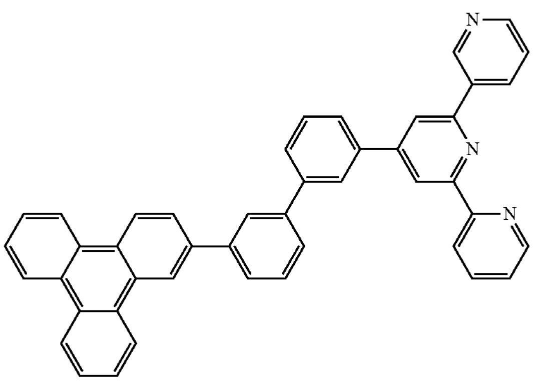
A-100
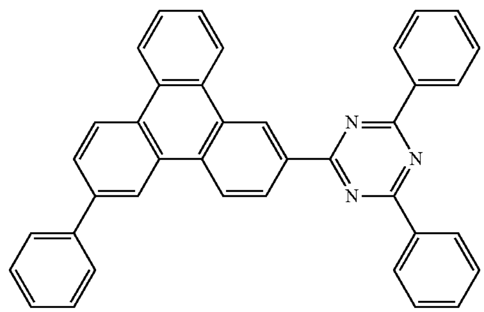
A-101
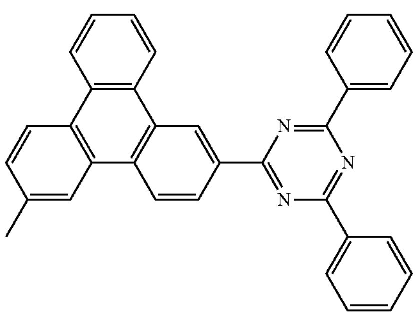
A-102
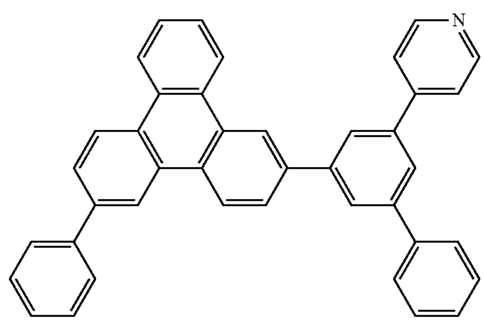
A-103
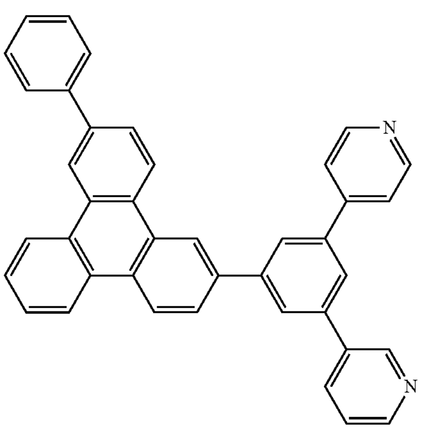
A-104
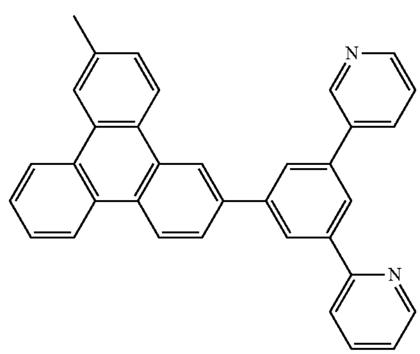

-continued
A-105
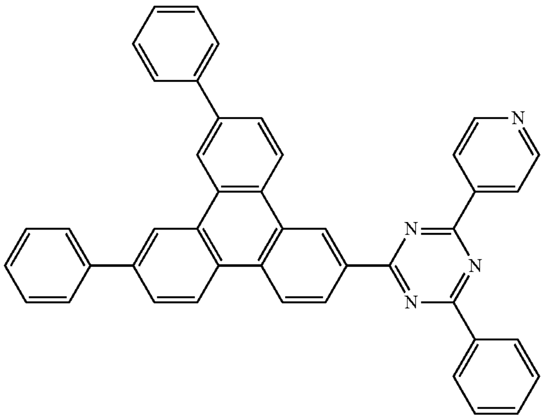
A-106
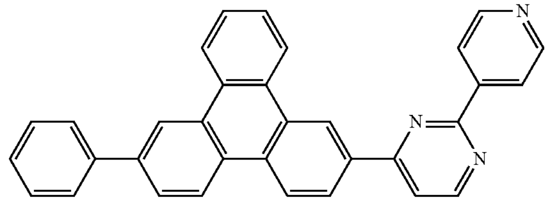
A-107
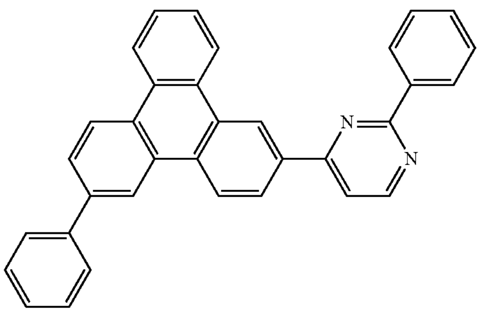
A-108
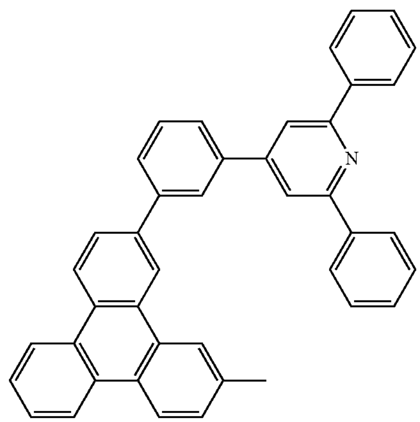
A-109
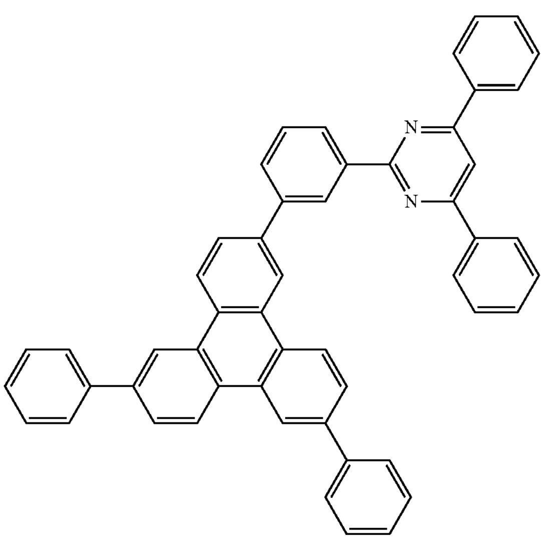
A-110
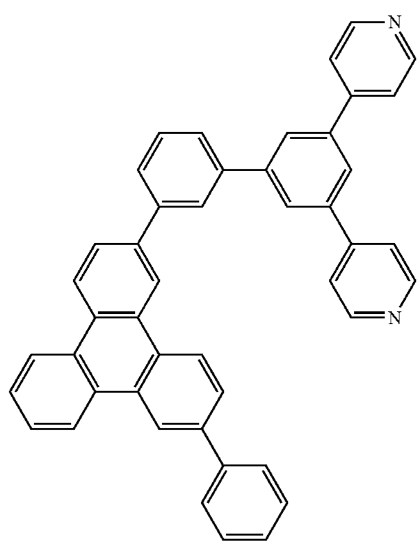

-continued
A-111
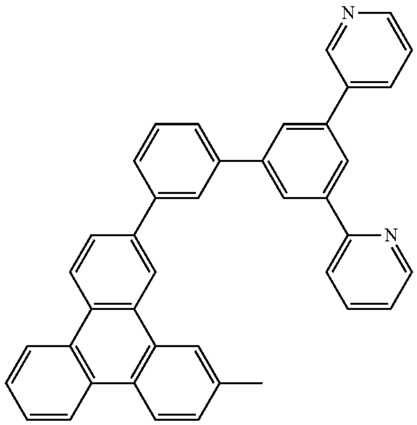
A-112
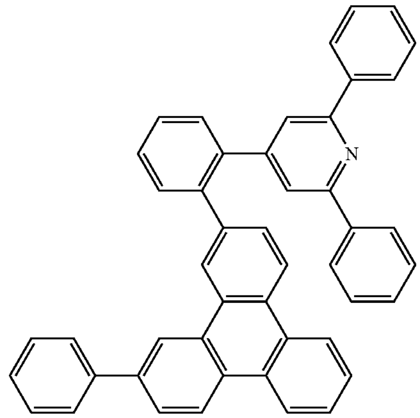
A-113
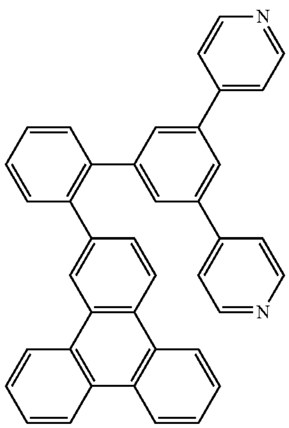
A-114
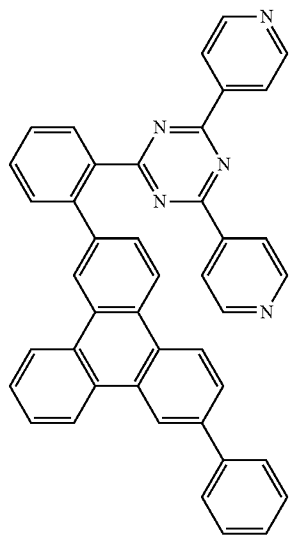
A-115
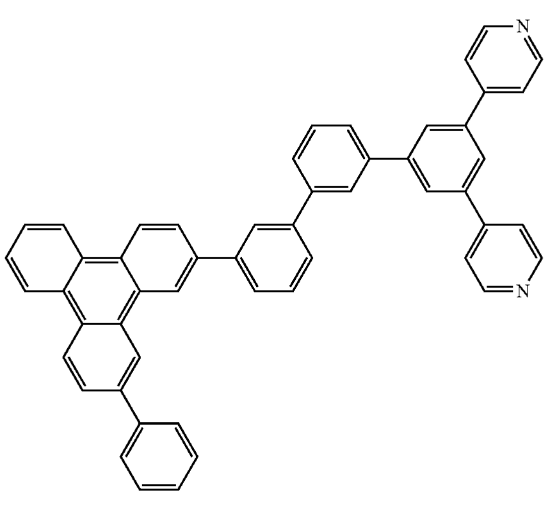
A-116
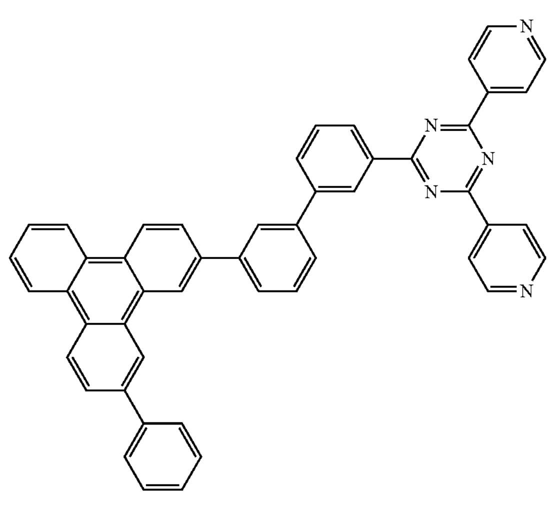

-continued
A-117
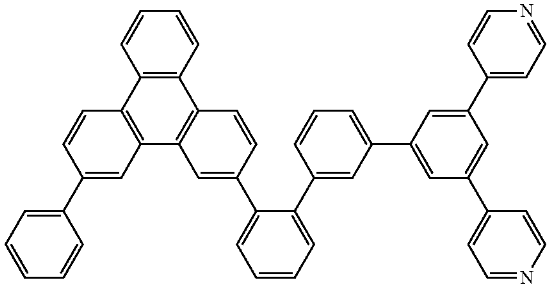
A-118
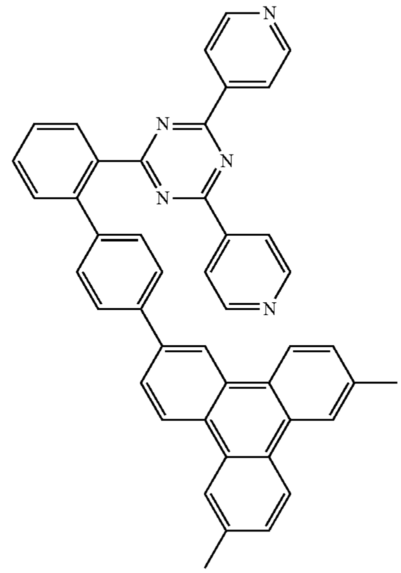
A-119
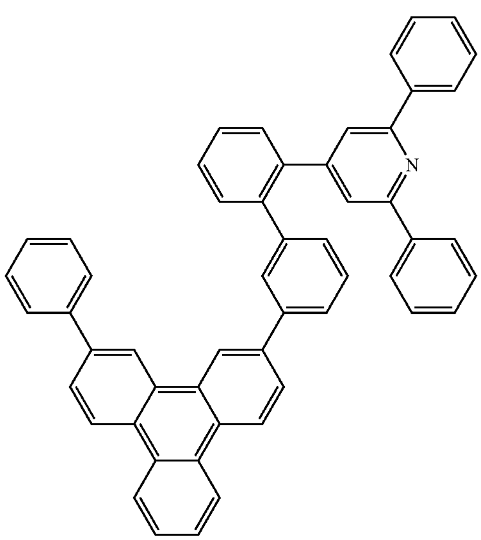
A-120
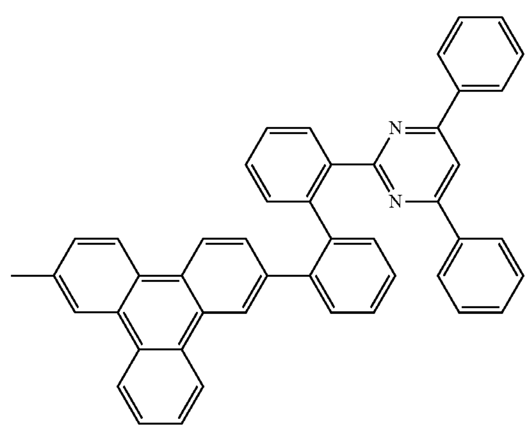

-continued
A-121
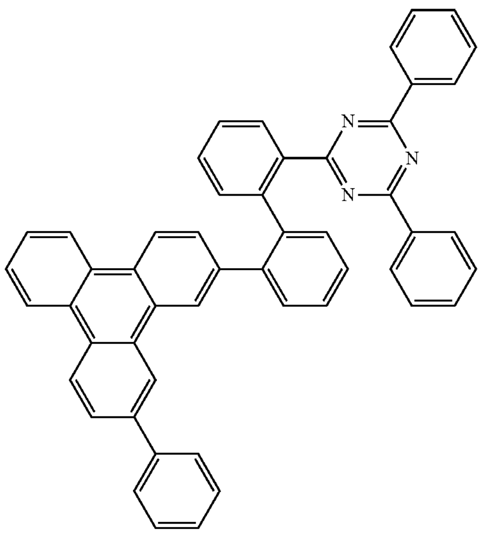
A-122
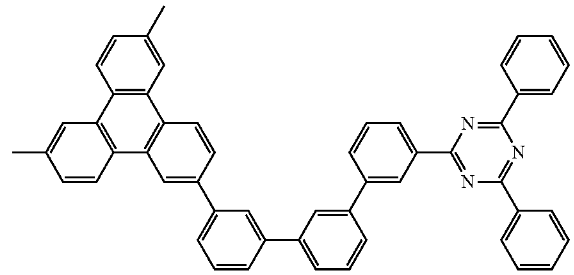
A-123
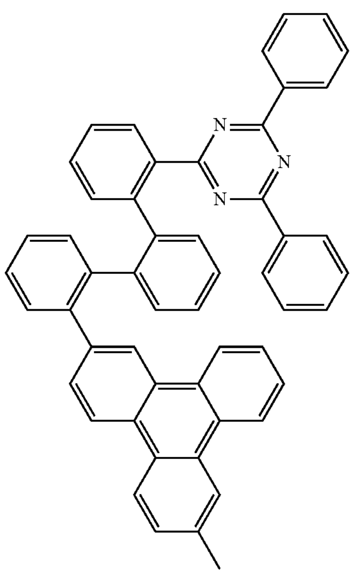
A-124
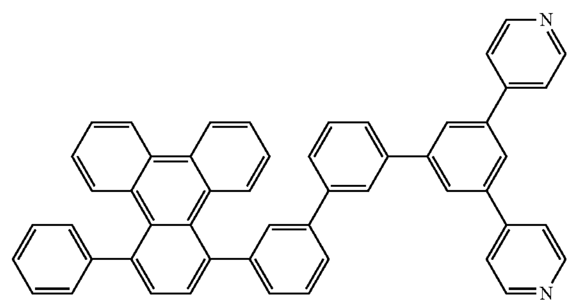
A-125
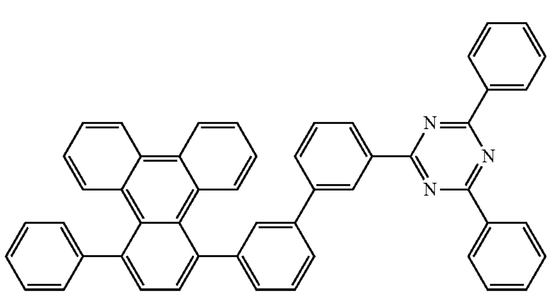
A(1)
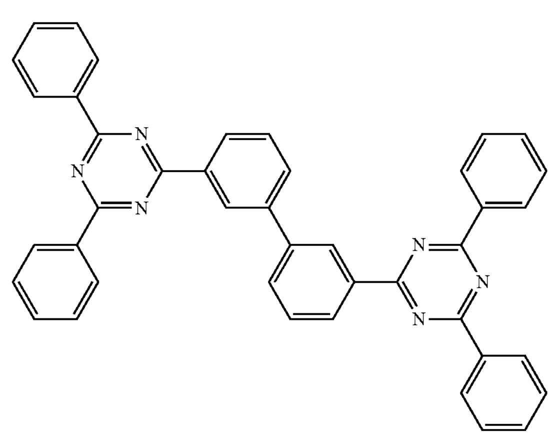

-continued
A(2)
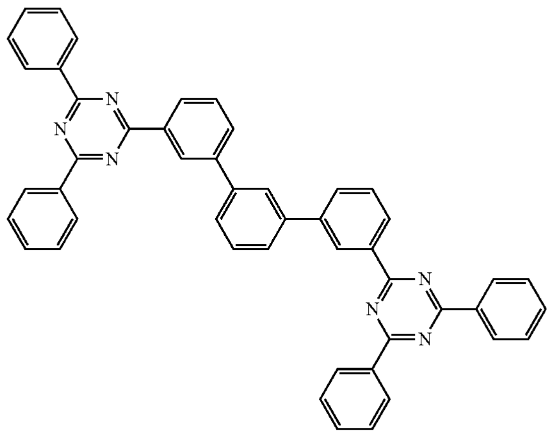
A(3)
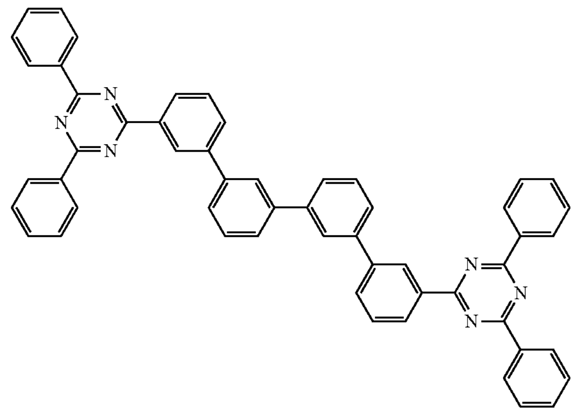
A(4)
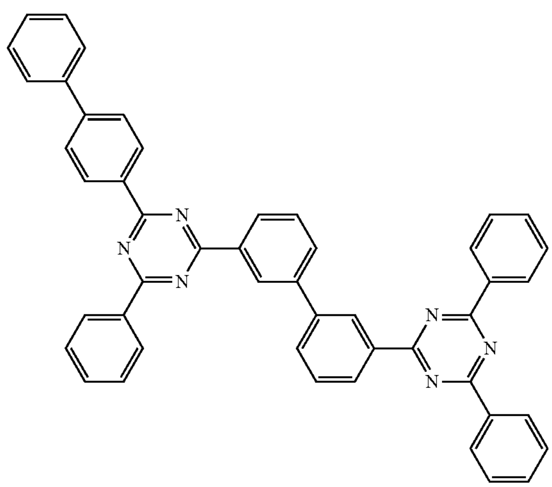
A(5)
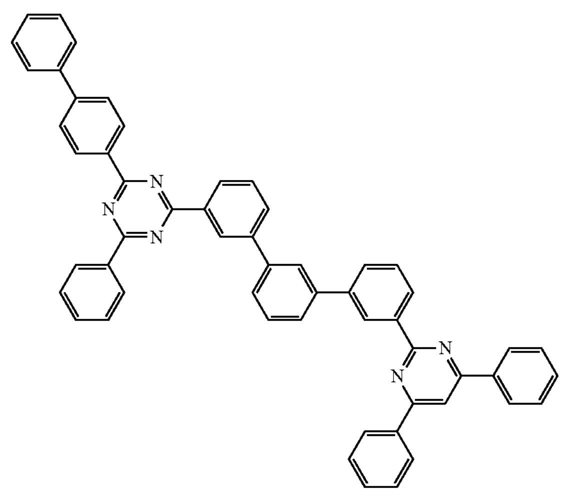
A(6)
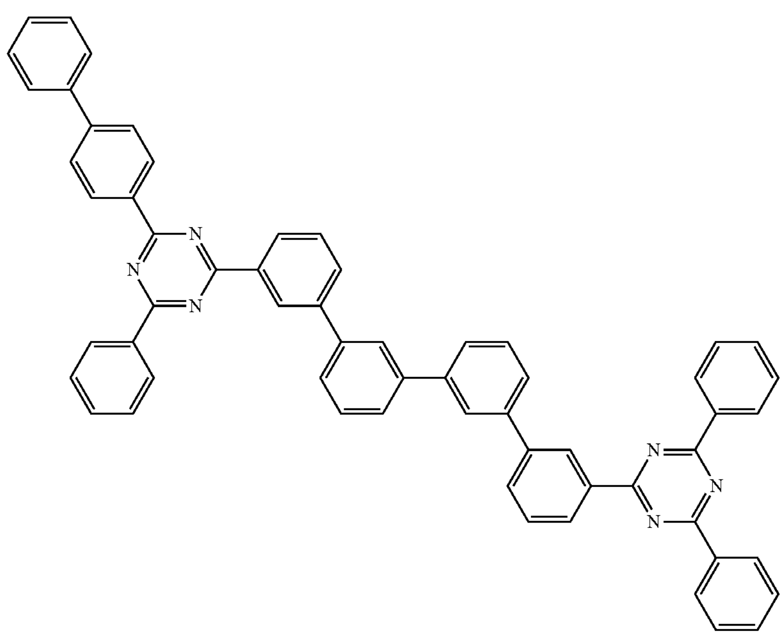

-continued
A(7)
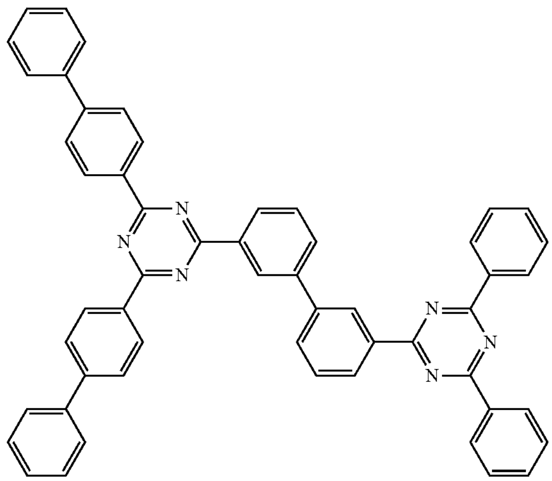
A(8)
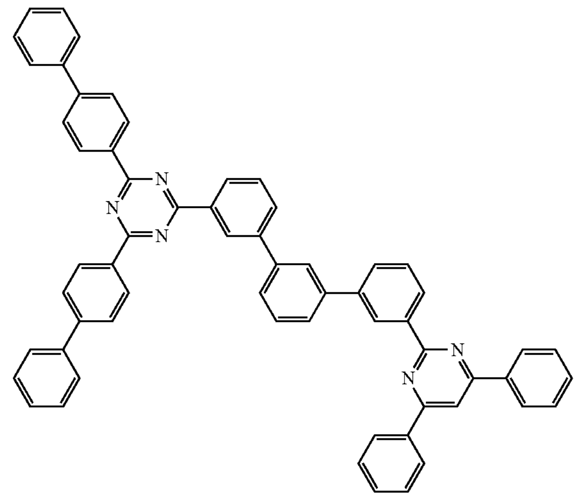
A(9)
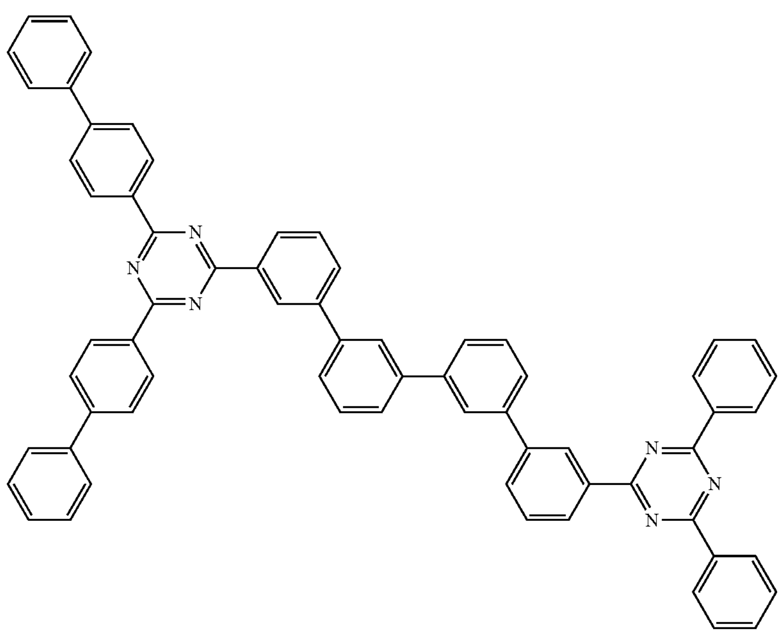

-continued
A(10)
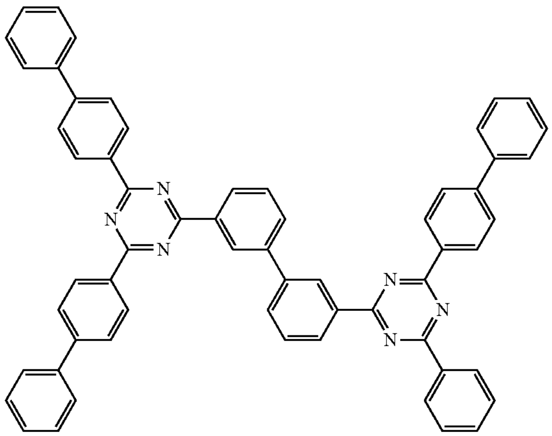
A(11)
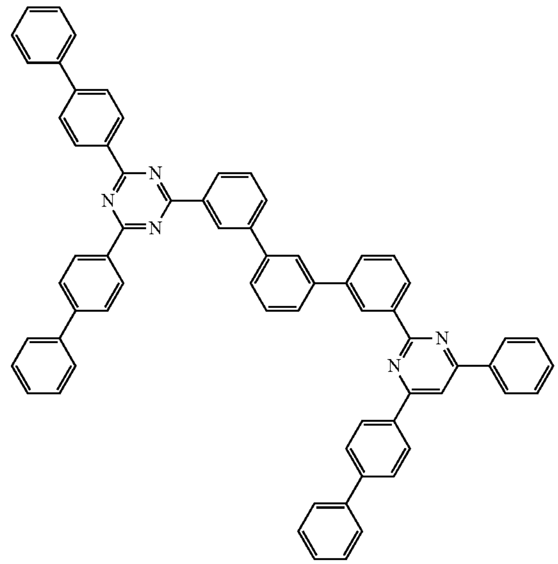
A(12)
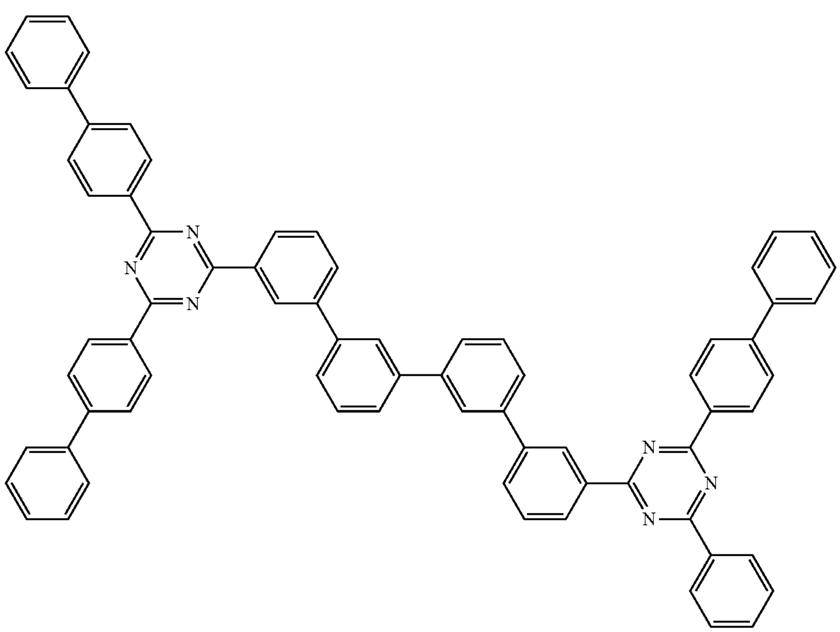

-continued
A(13)
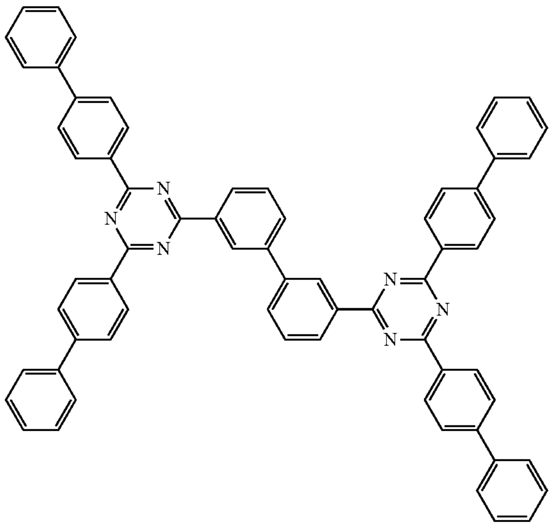
A(14)
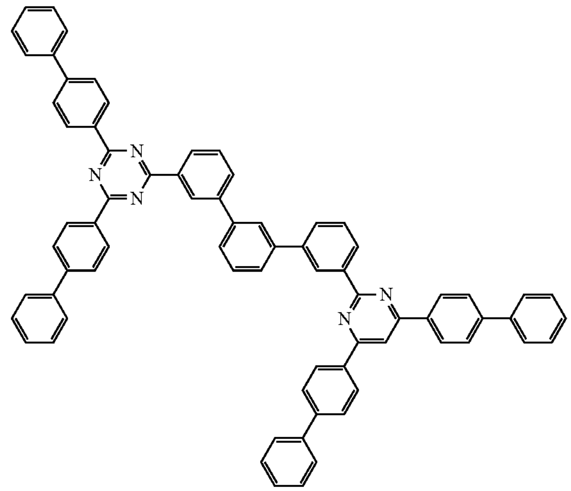
A(15)
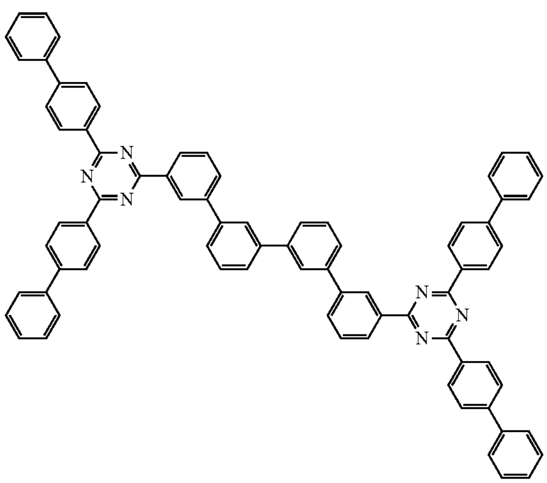
A(16)
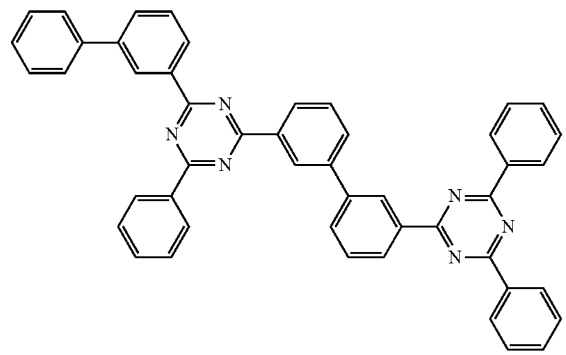
A(17)
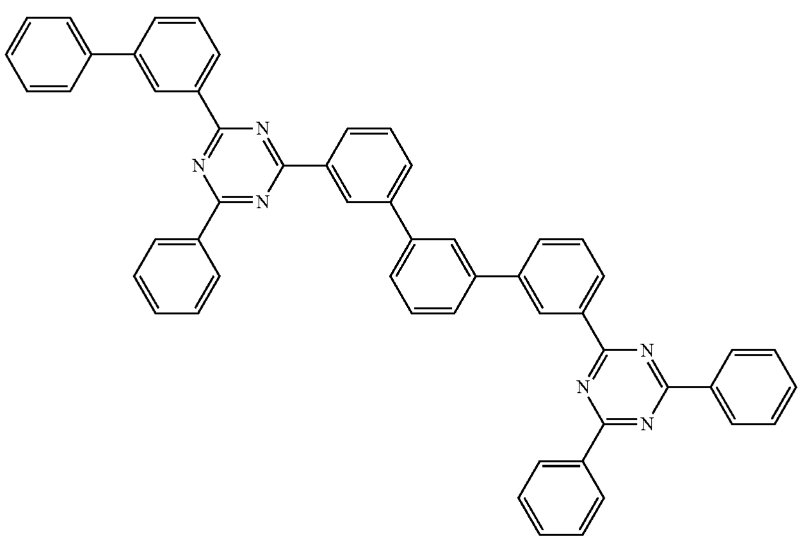

-continued
A(18)
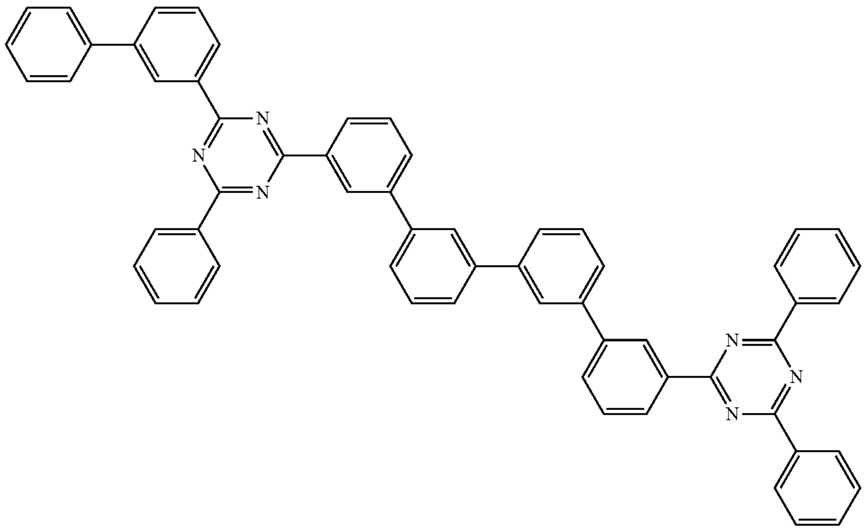
A(19)
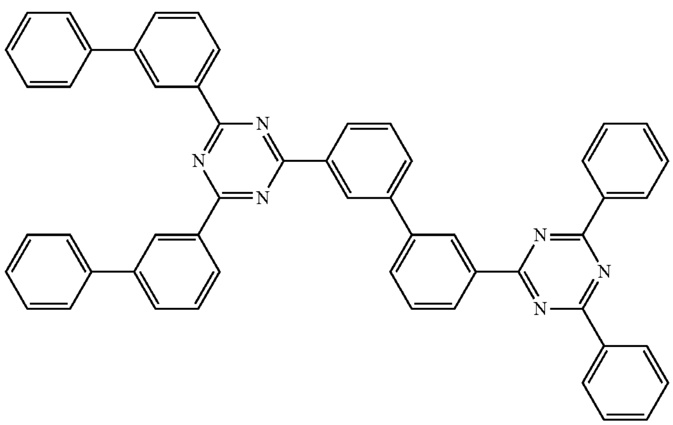
A(20)
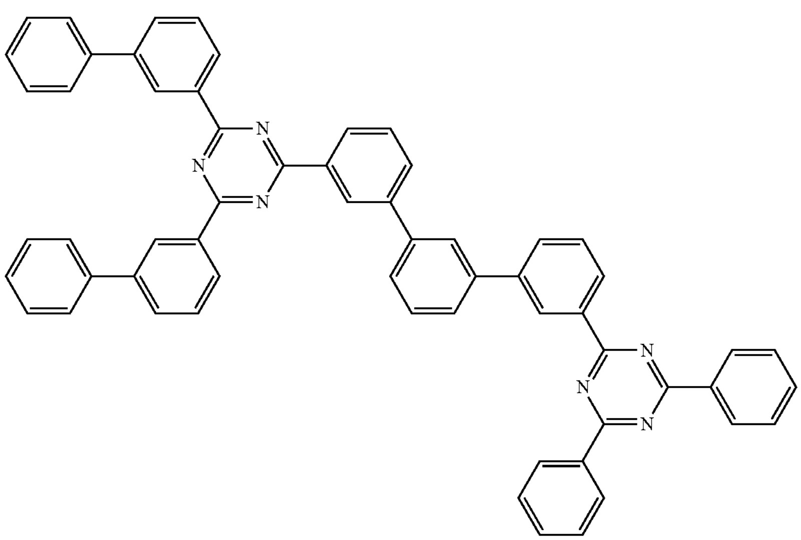

-continued
A(21)
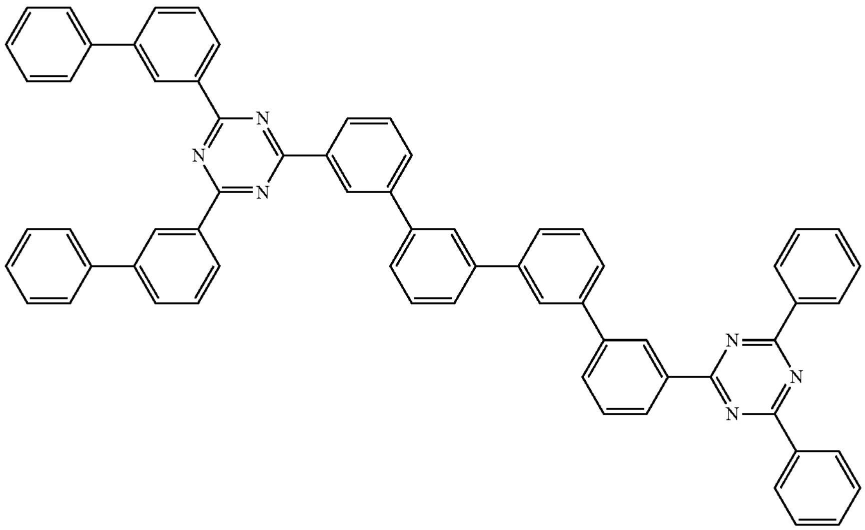
A(22)
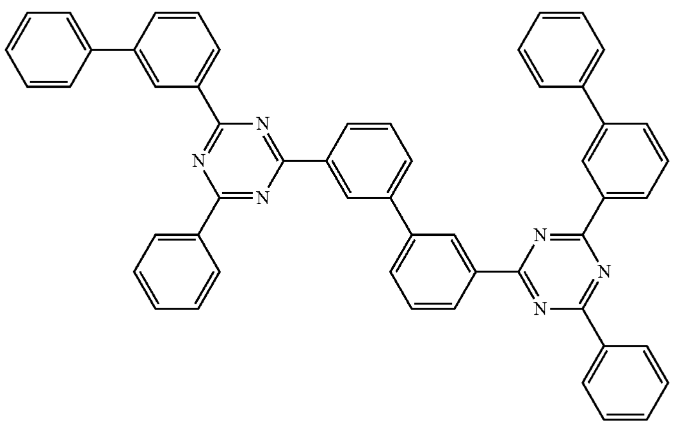
A(23)
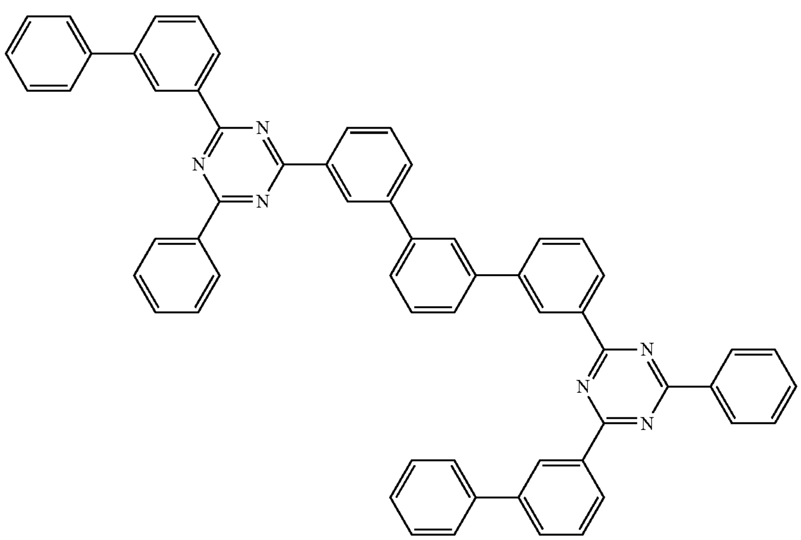

-continued
A(24)
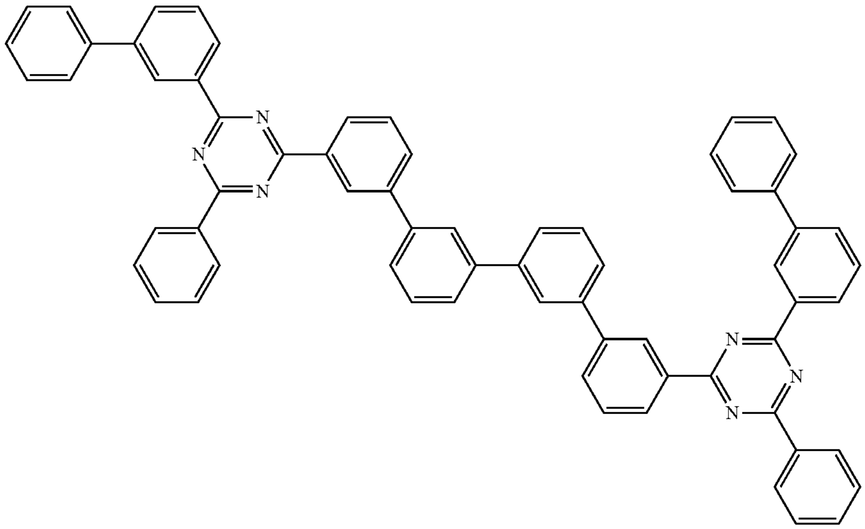
A(25)
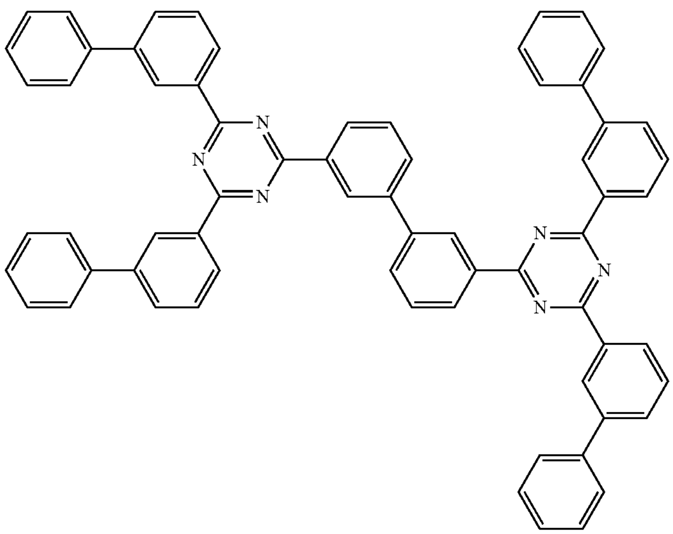
A(26)
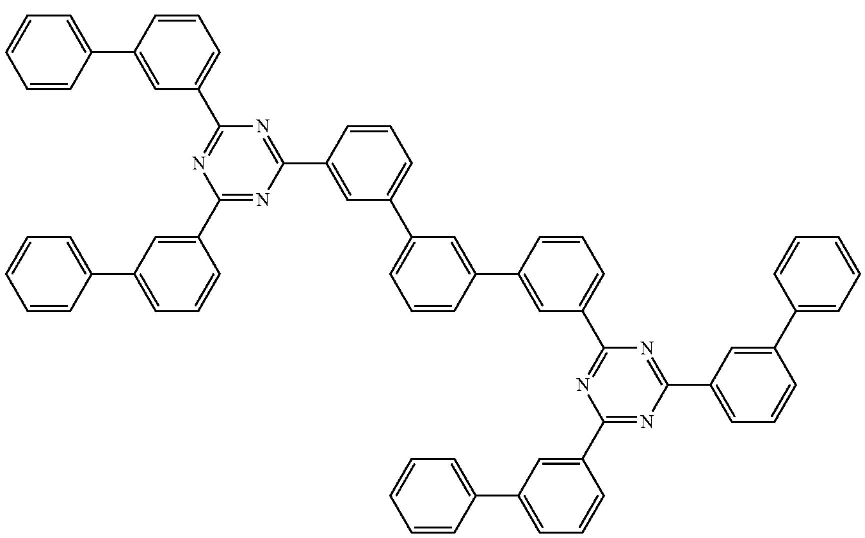

-continued
A(27)
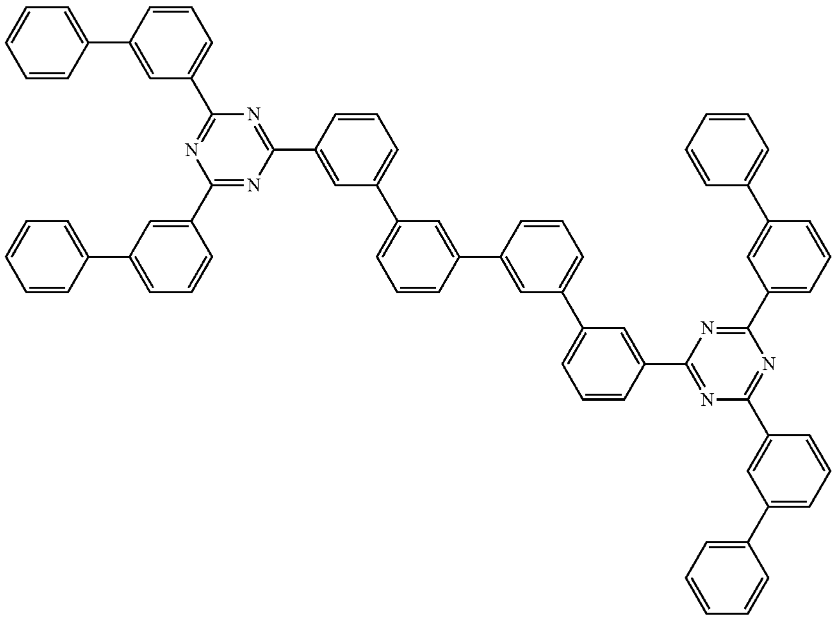
A(28)
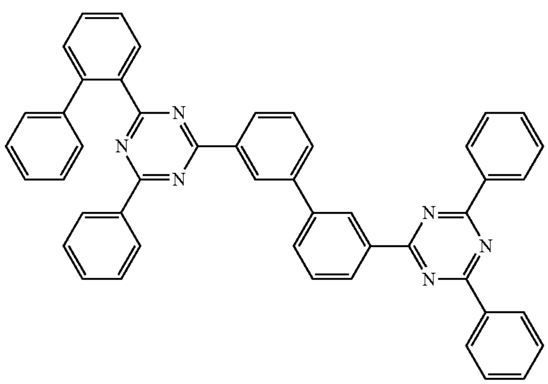
A(29)
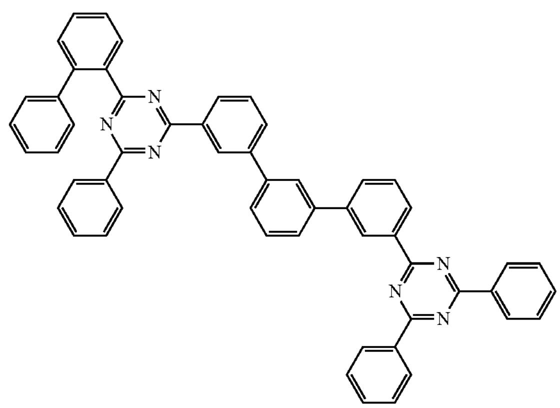
A(30)
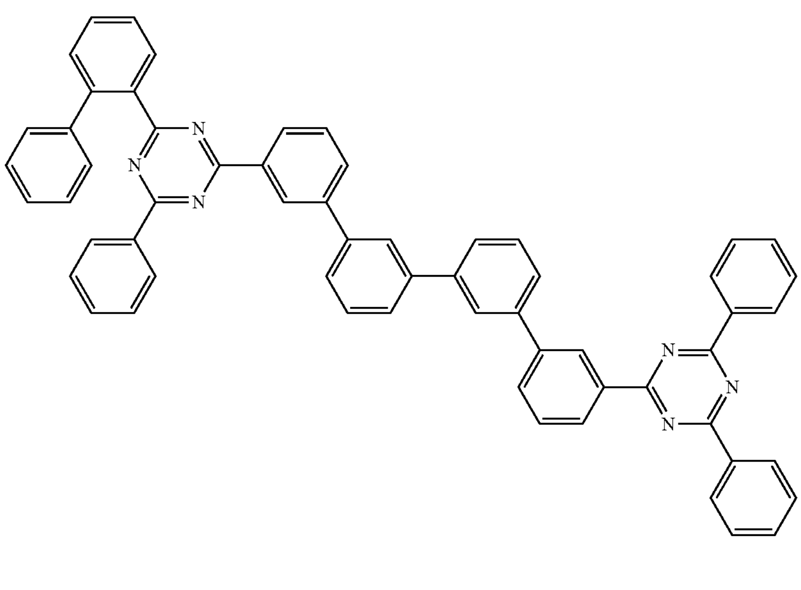

-continued
A(31)
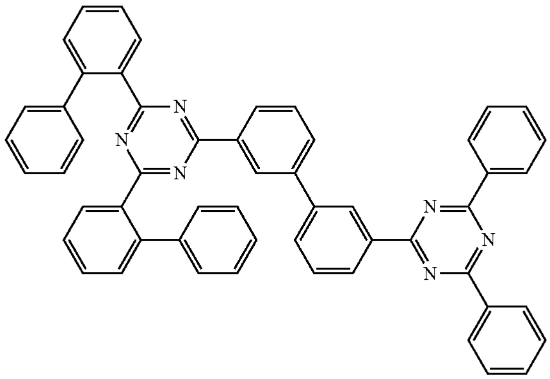
A(32)
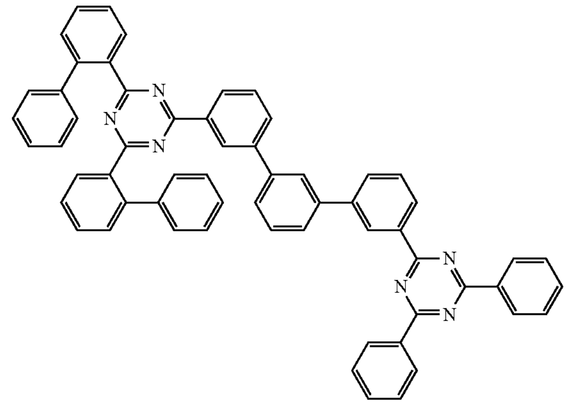
A(33)
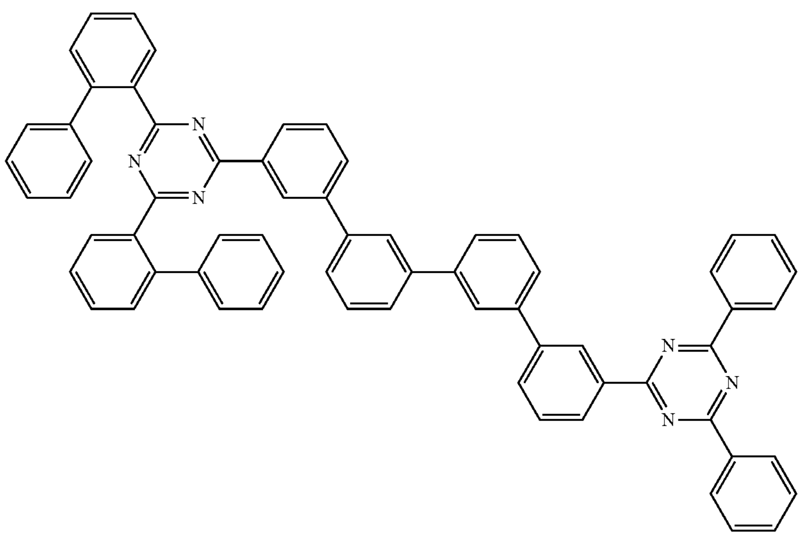
A(34)
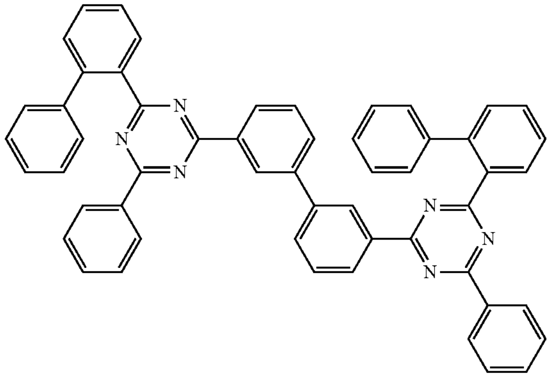
A(35)
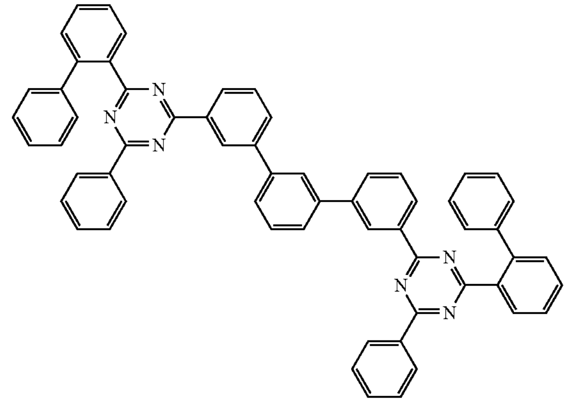

-continued
A(36)
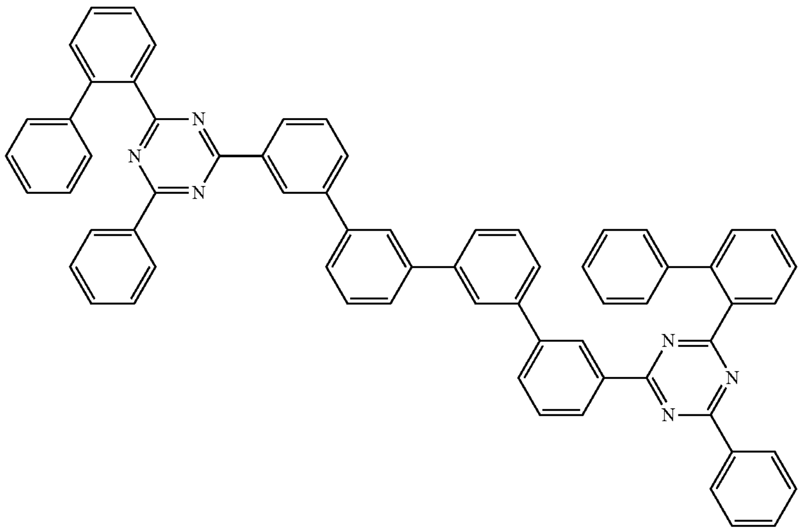
A(37)
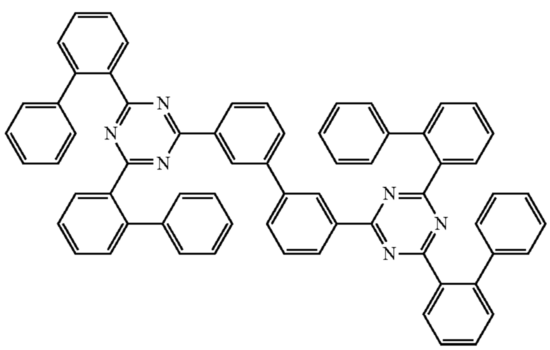
A(38)
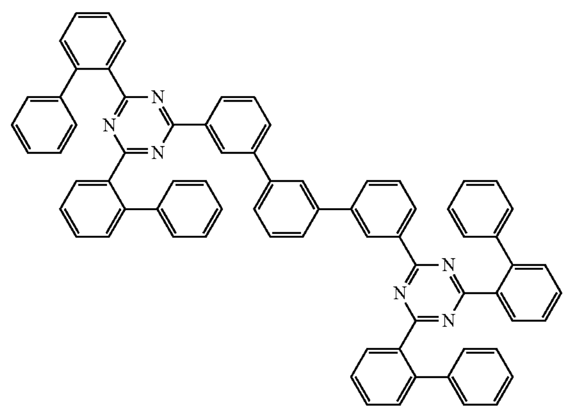
A(39)
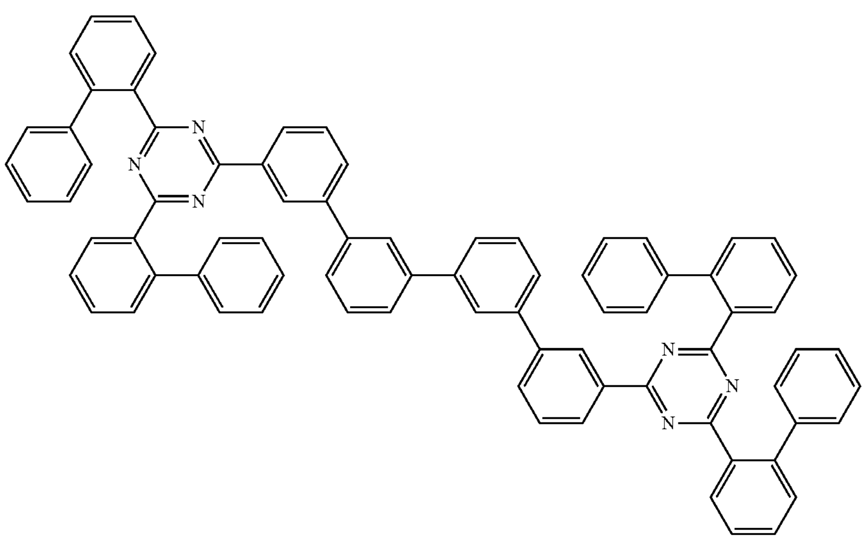

-continued
A(40)
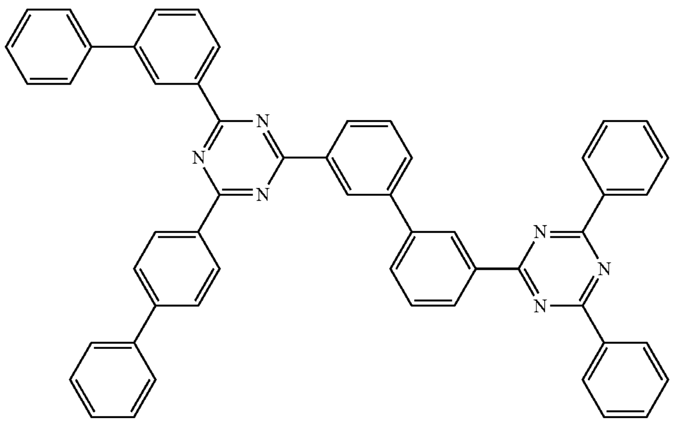
A(41)
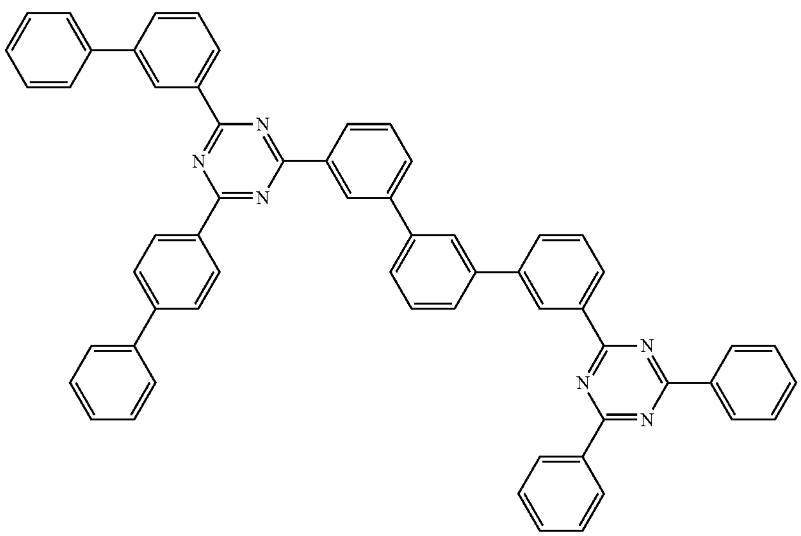
A(42)
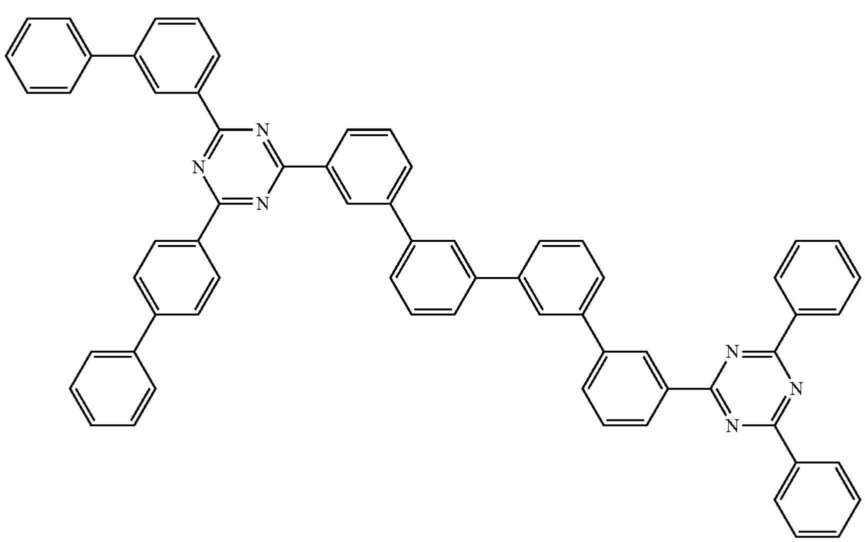

-continued
A(43)
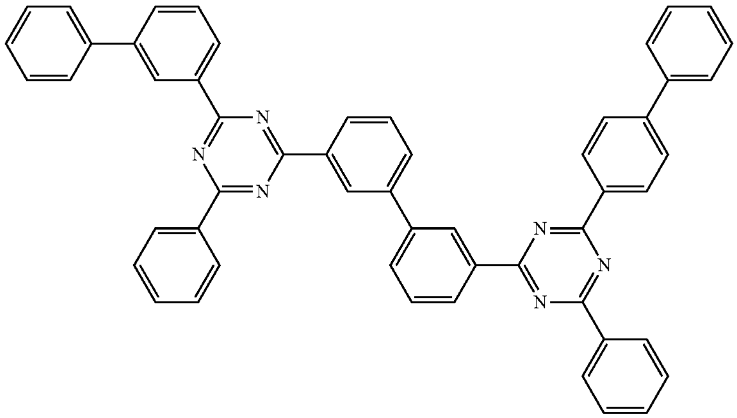
A(44)
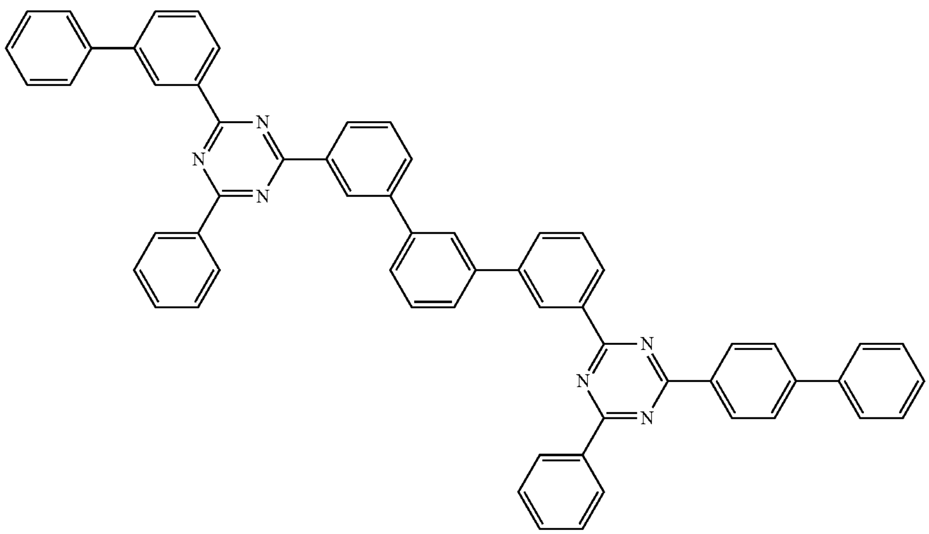
A(45)
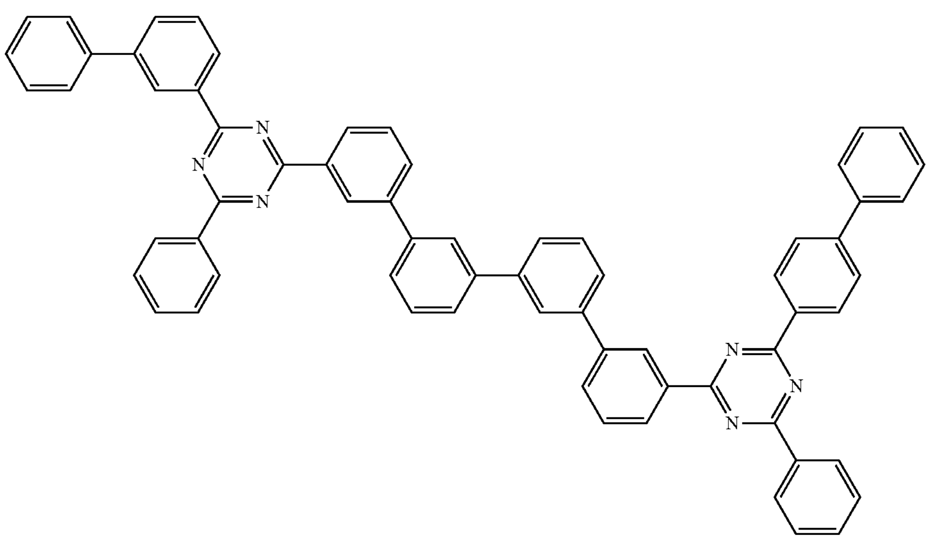

-continued
A(46)
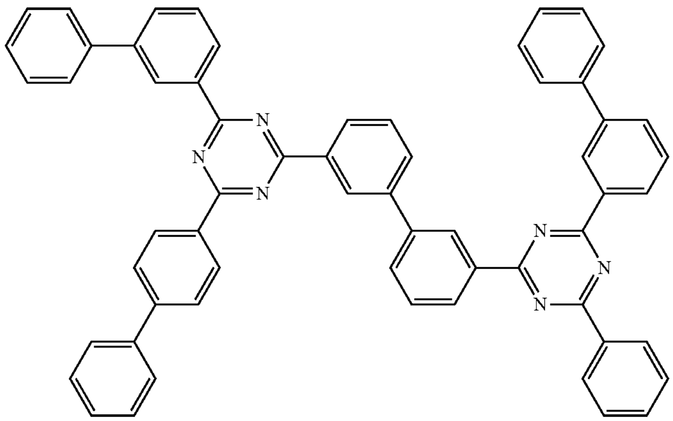
A(47)
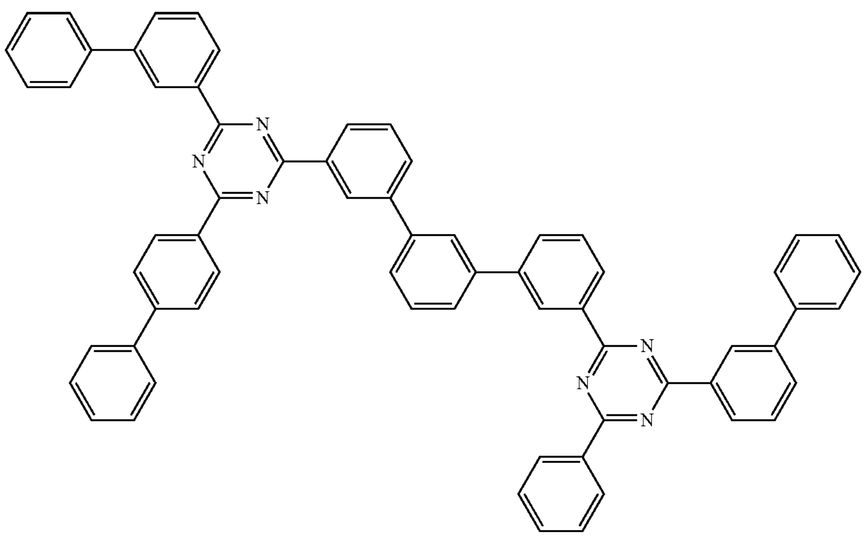
A(48)
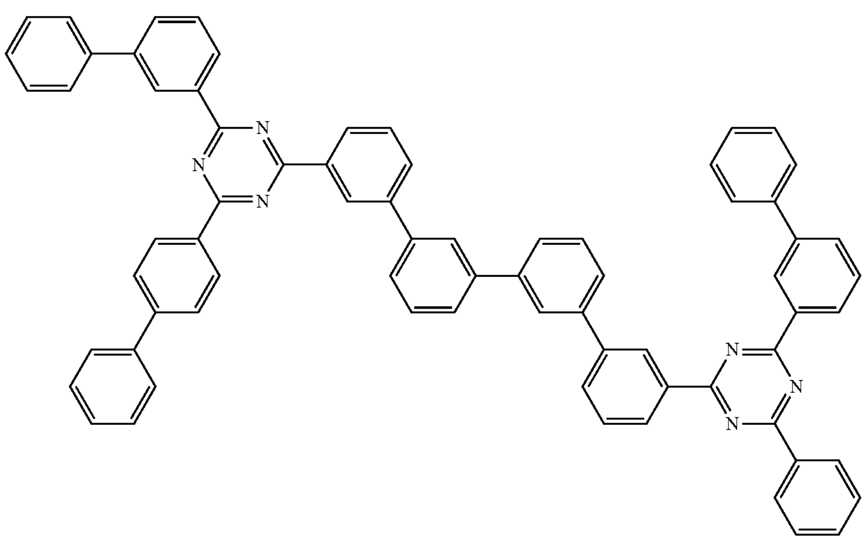

-continued
A(49)
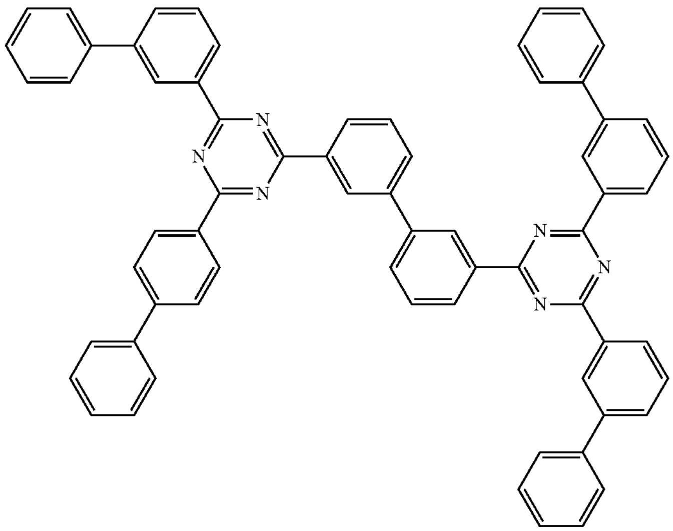
A(50)
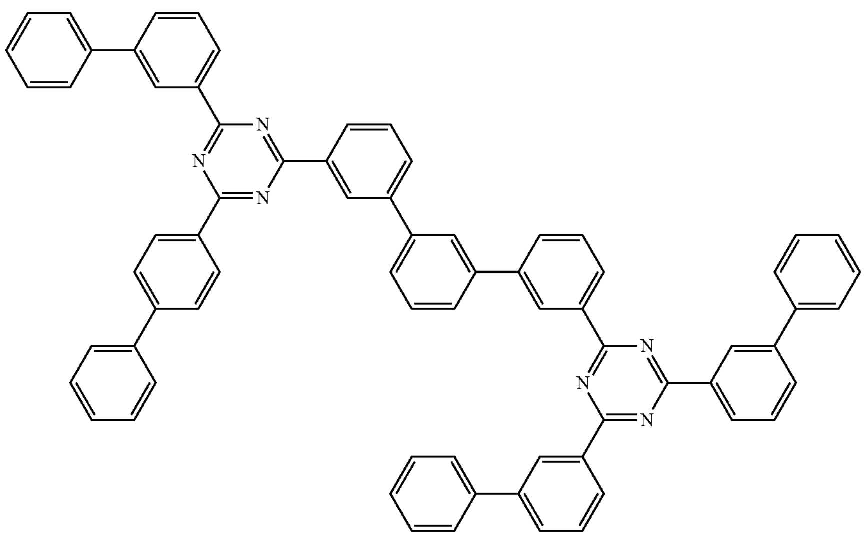
A(51)
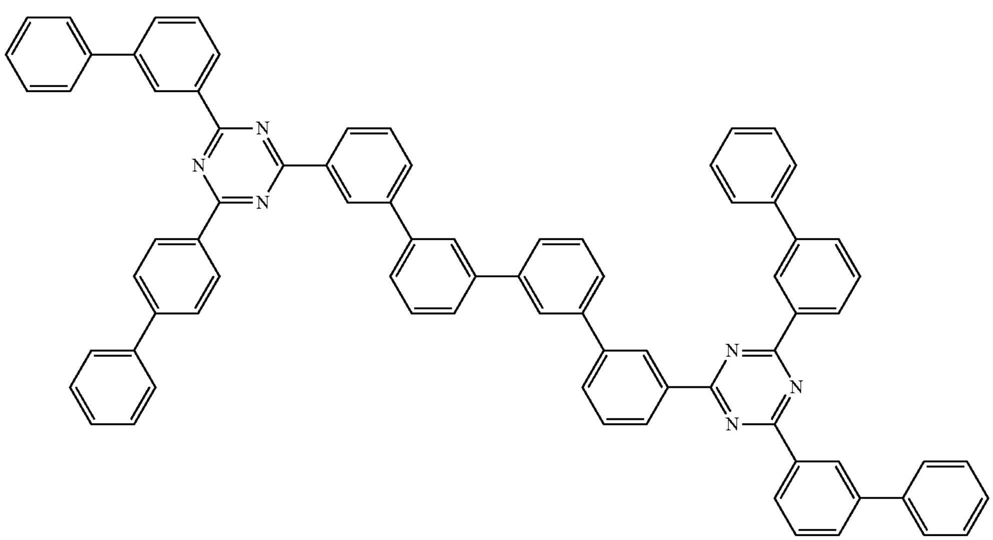

-continued
A(52)
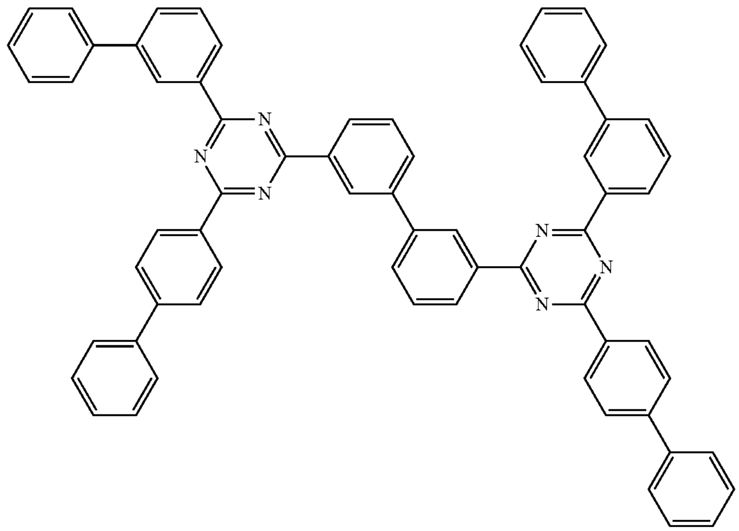
A(53)
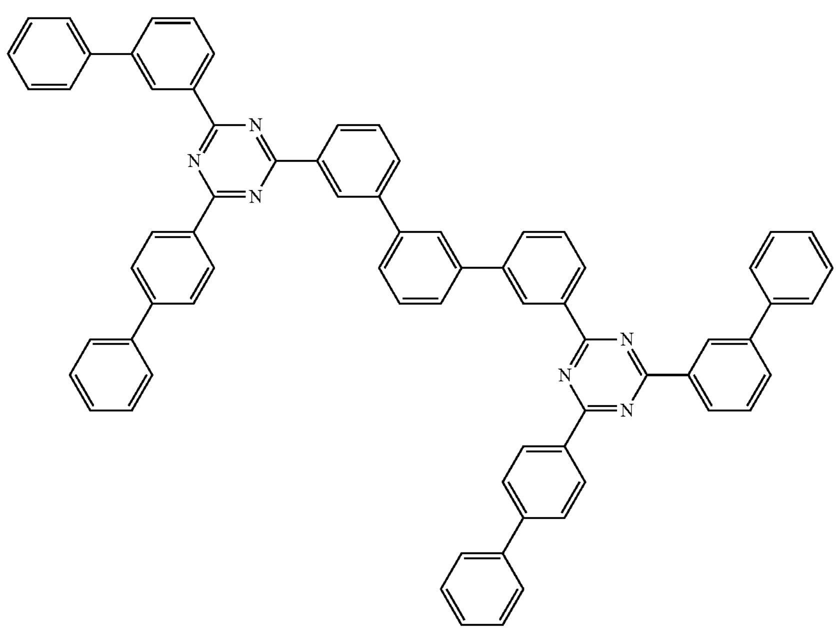

-continued
A(54)
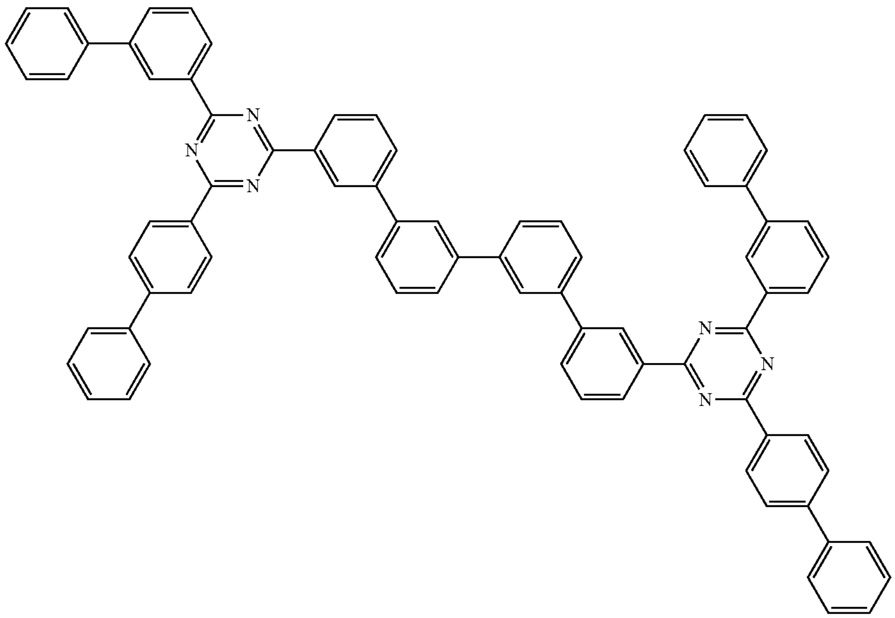
A(55)
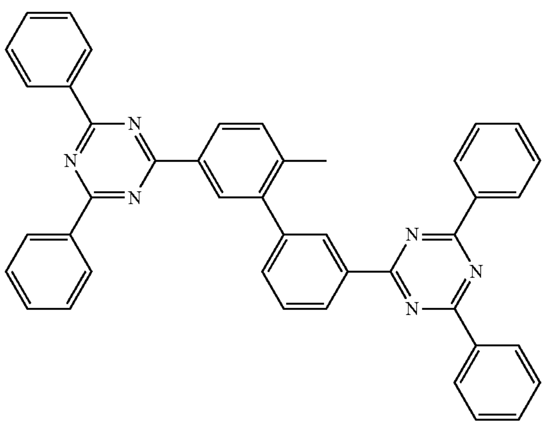
A(56)
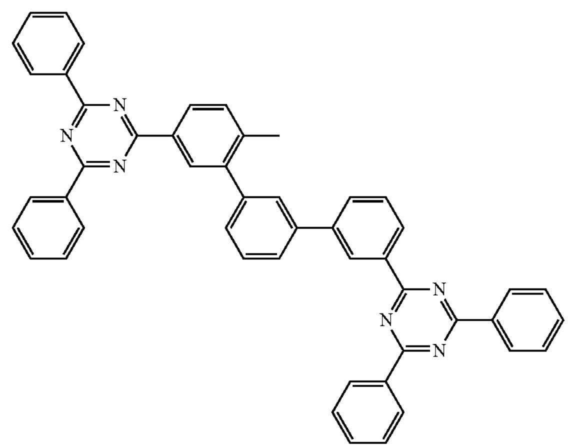
A(57)
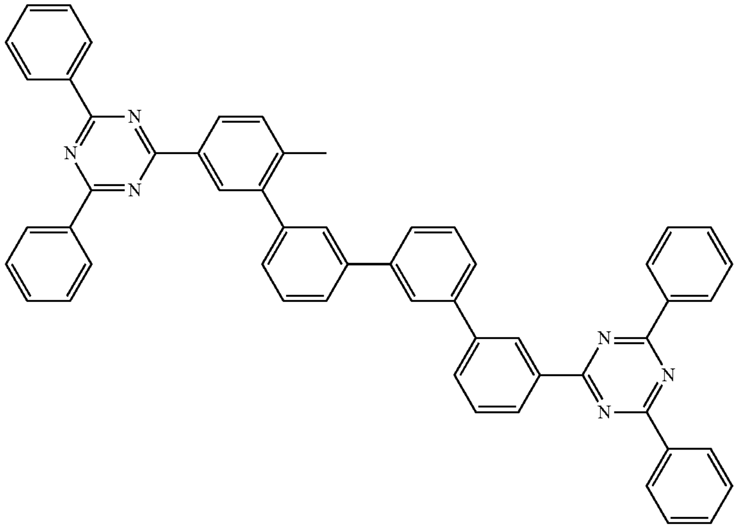

A(58)
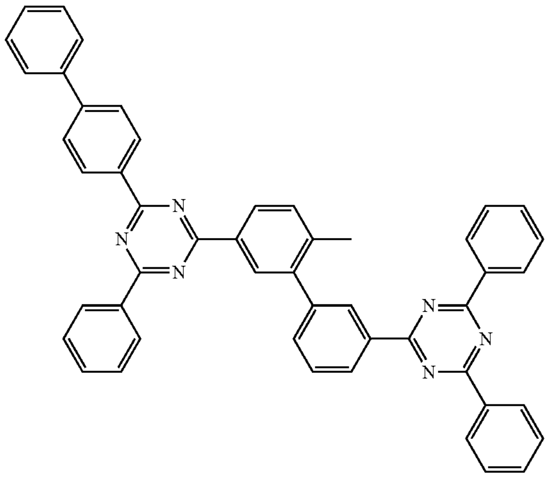
A(59)
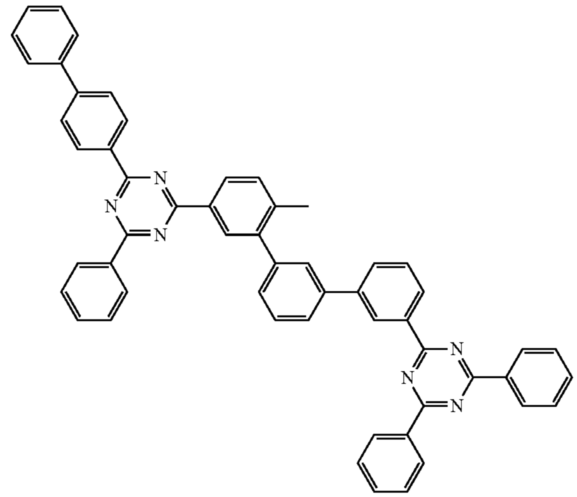
A(60)
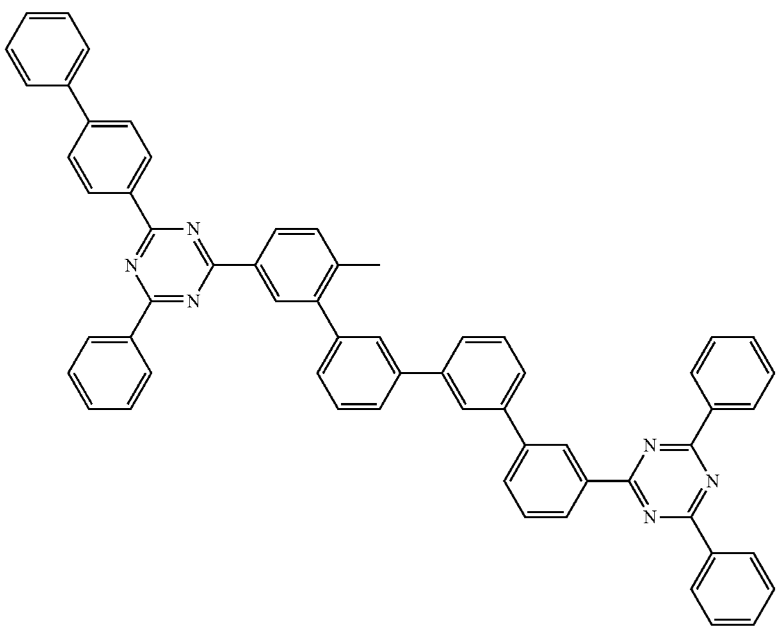
A(61)
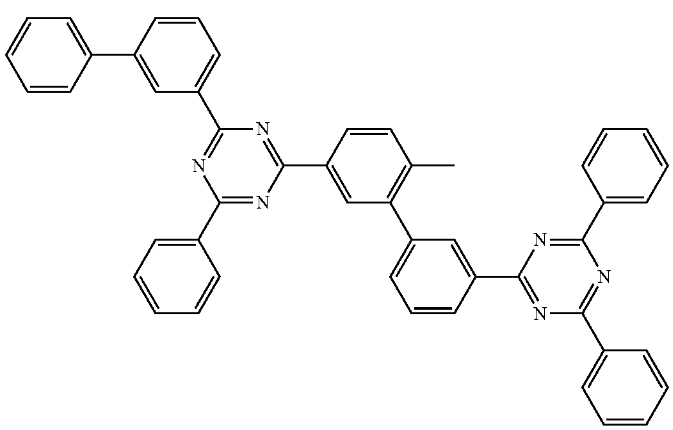

-continued
A(62)
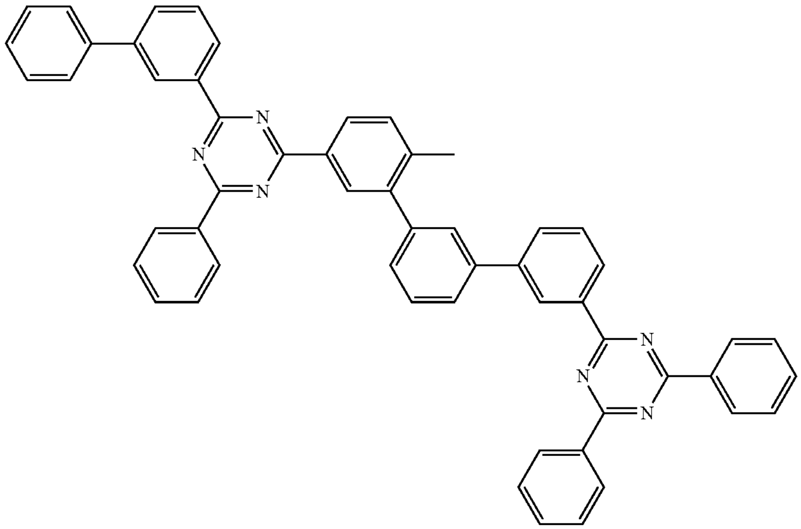
A(63)
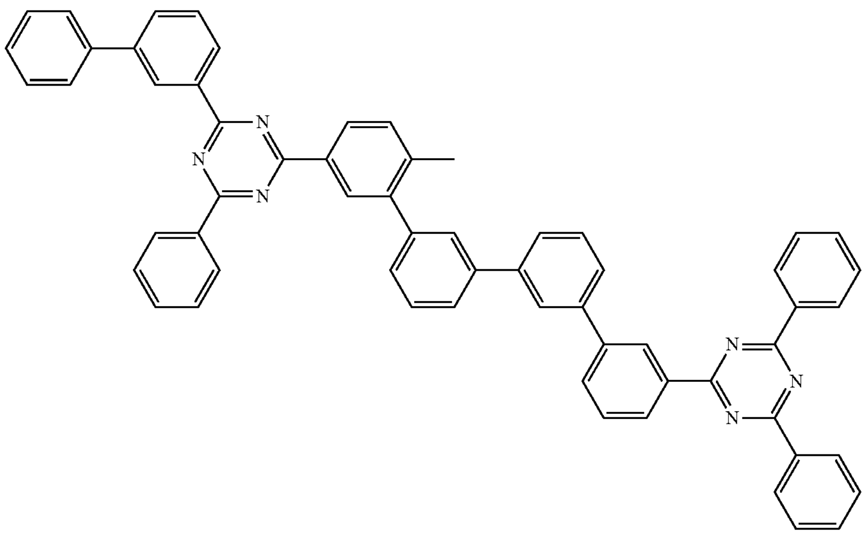
A(64)
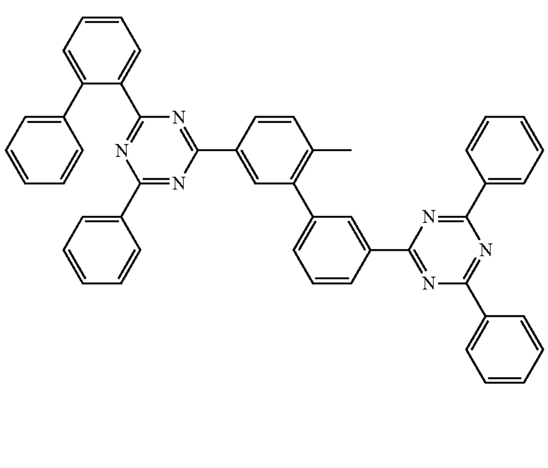
A(65)
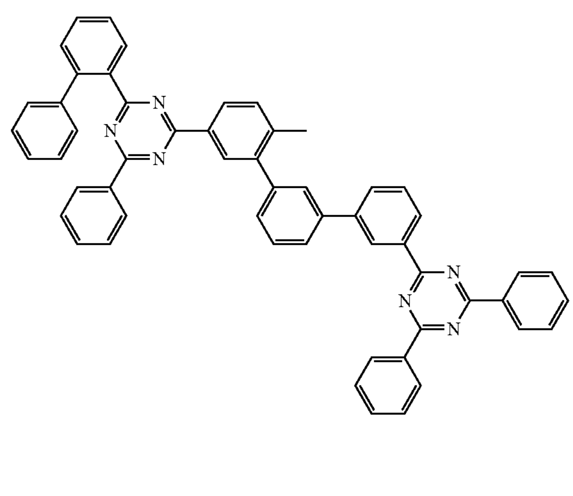

-continued
A(66)
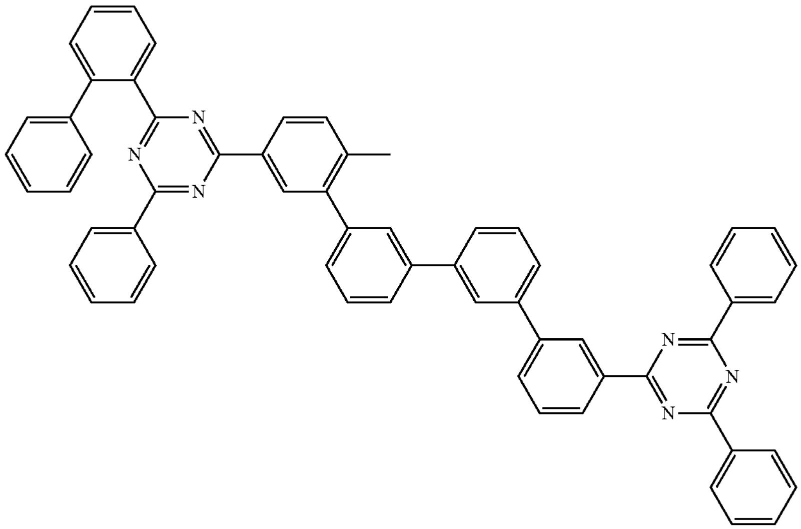
A(67)
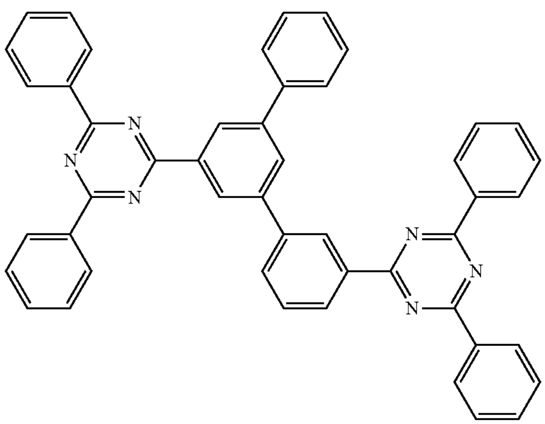
A(68)
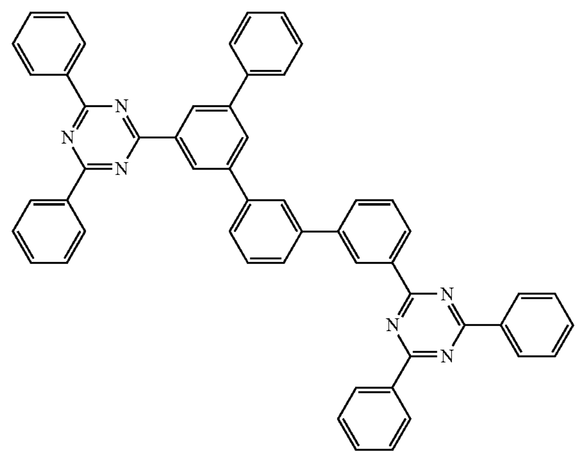
A(69)
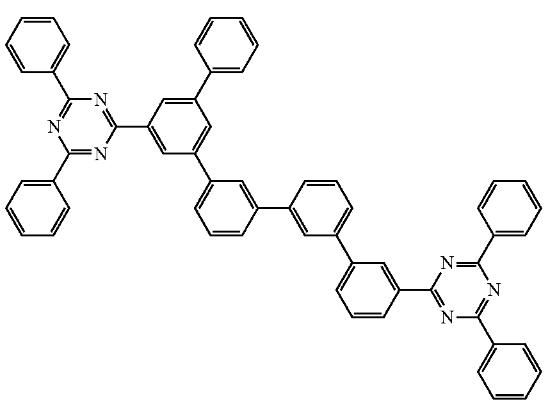
A(70)
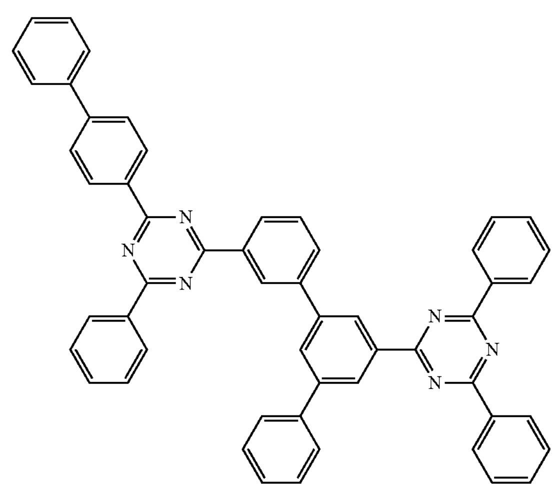

-continued
A(71)
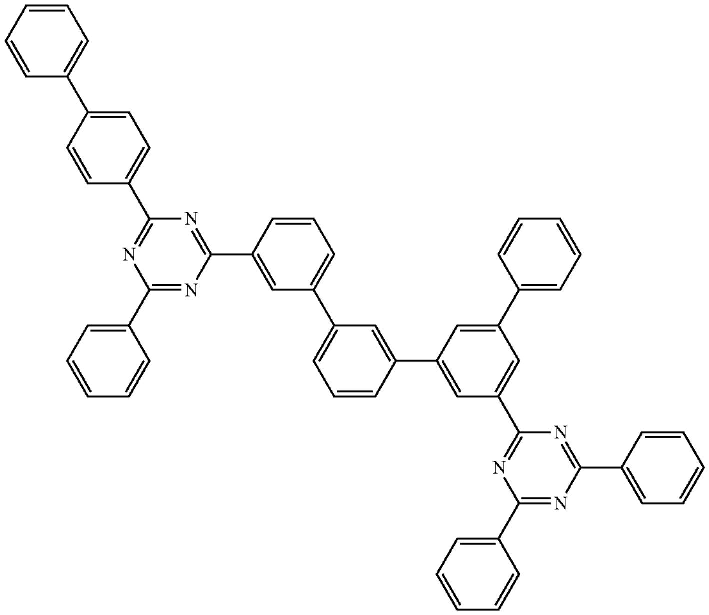
A(72)
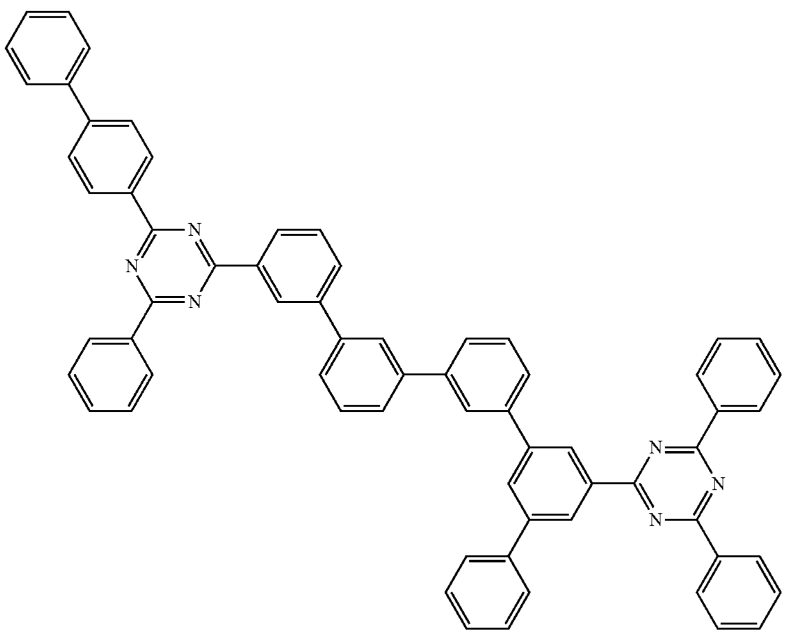
A(73)
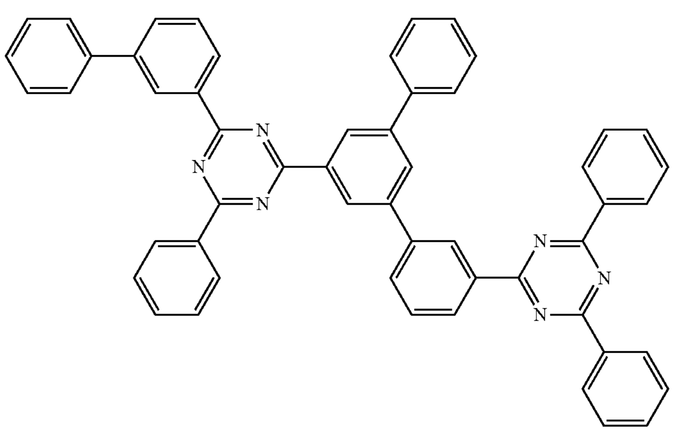

-continued
A(74)
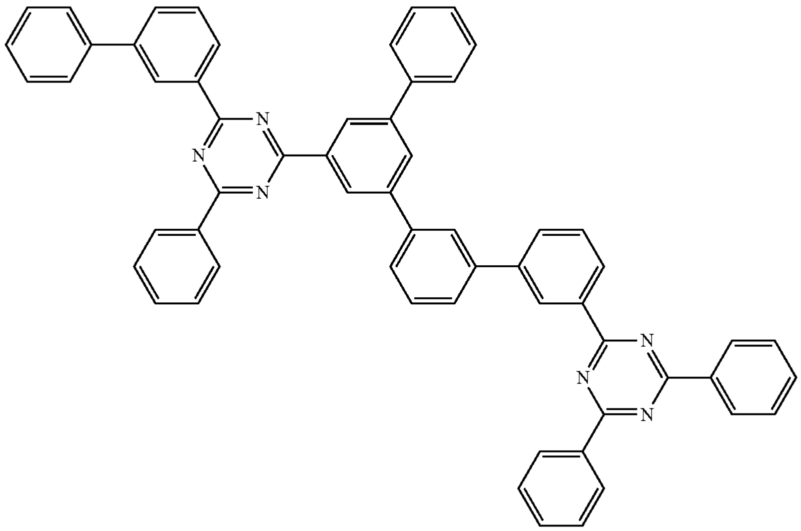
A(75)
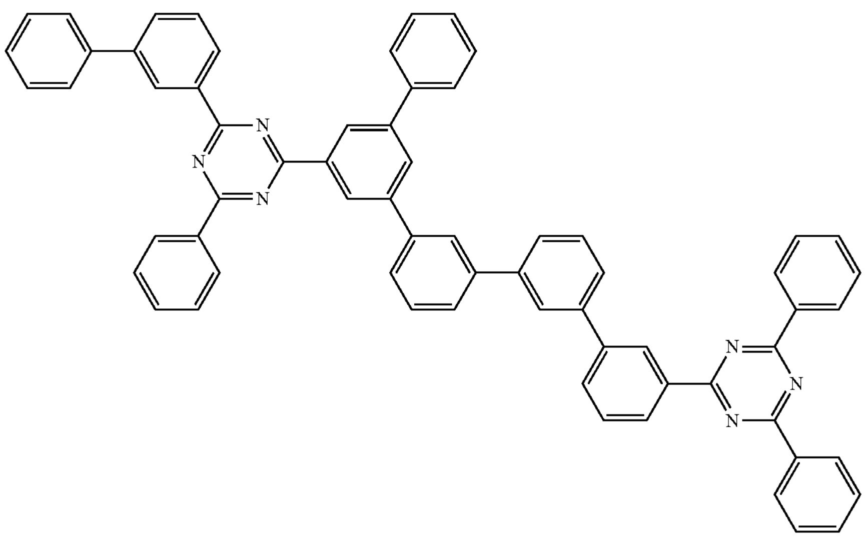
A(76)
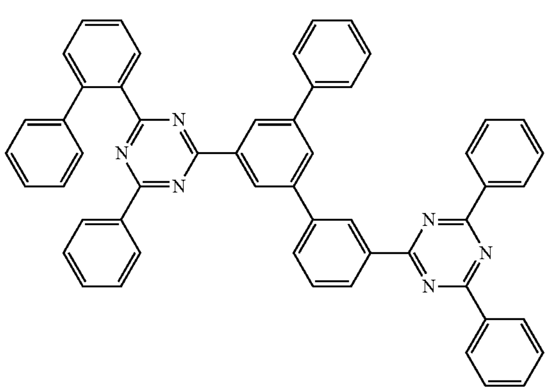
A(77)
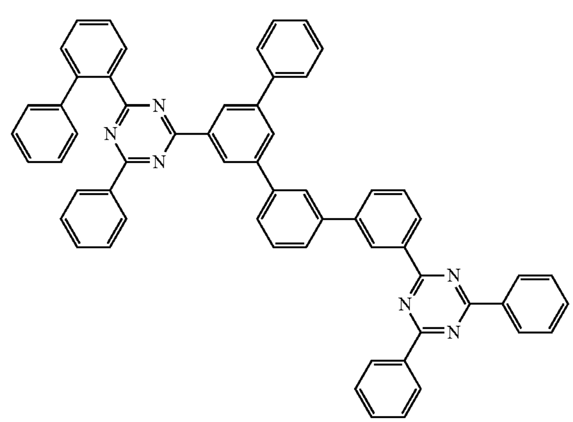

-continued
A(78)
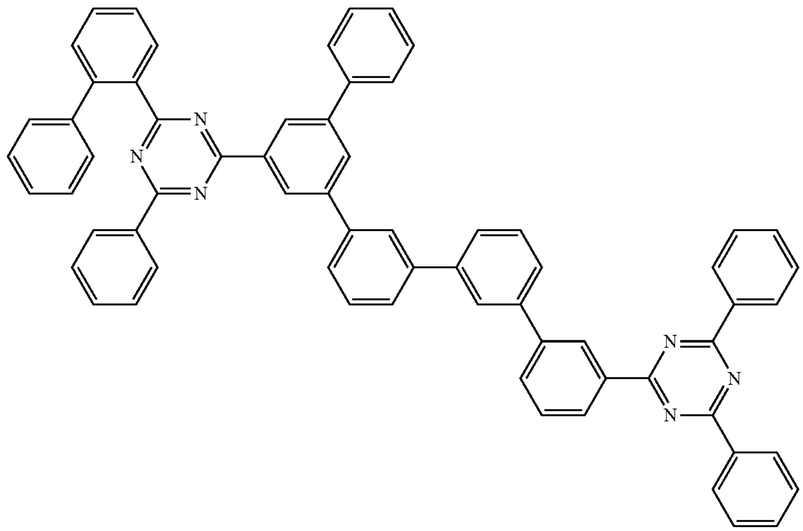
A(79)
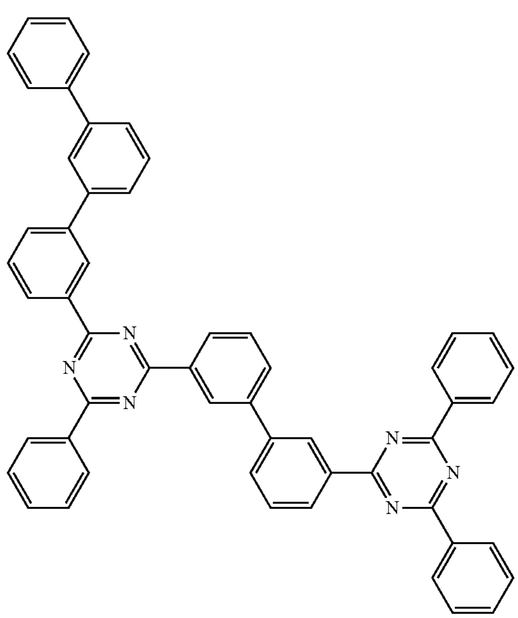
A(80)
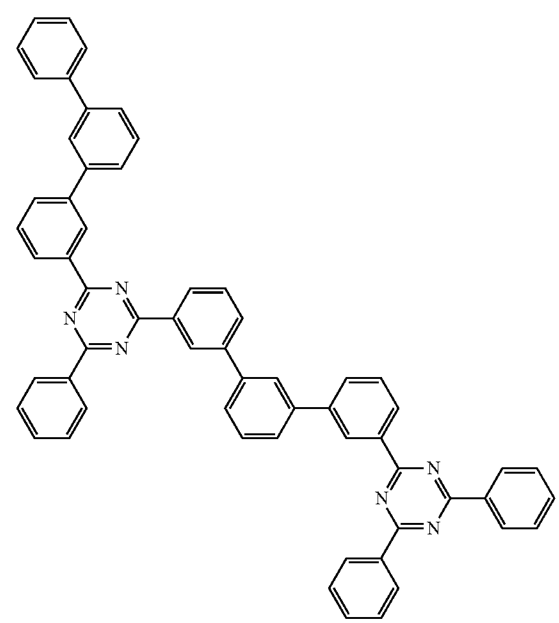

-continued
A(81)
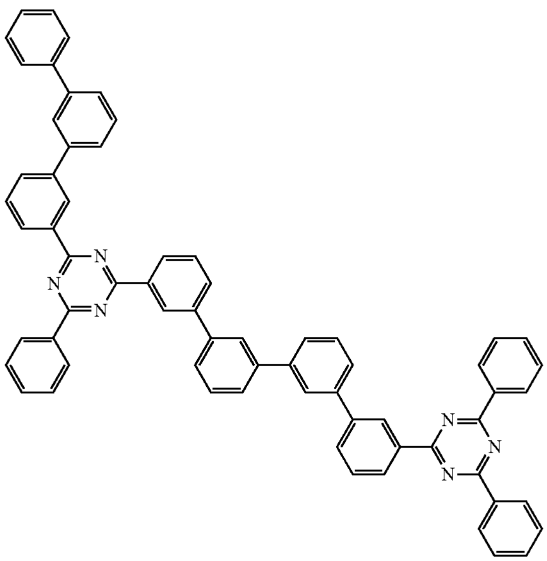
A(82)
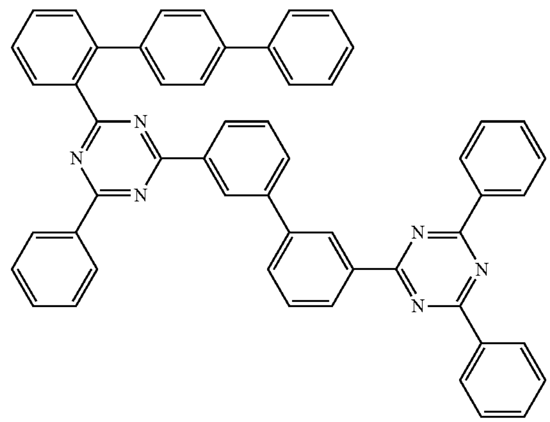
A(83)
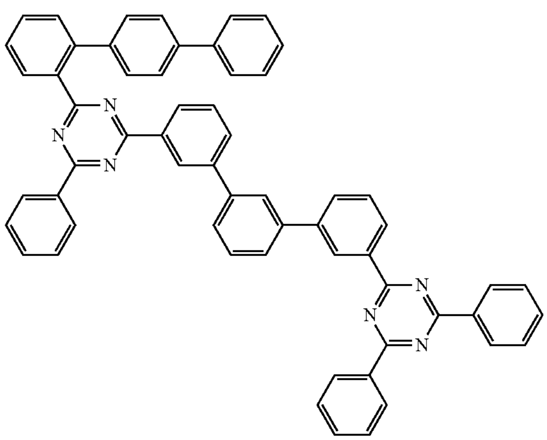
A(84)
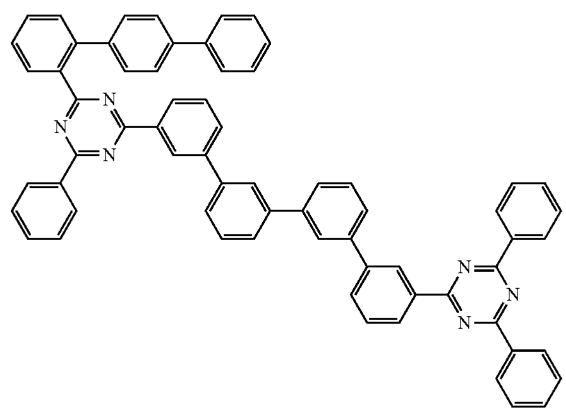
A(85)
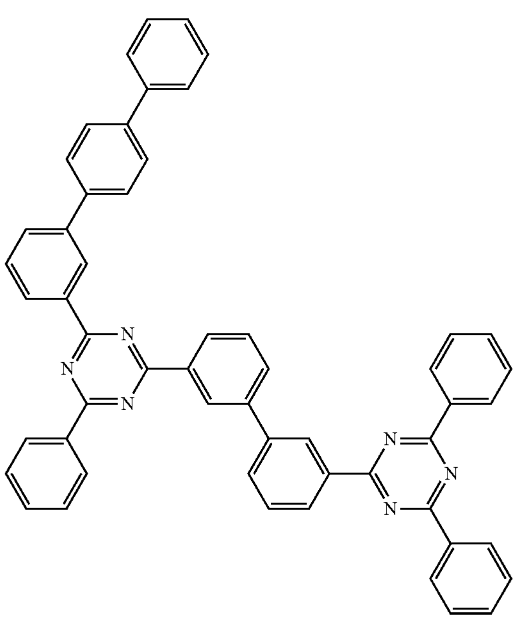
A(86)
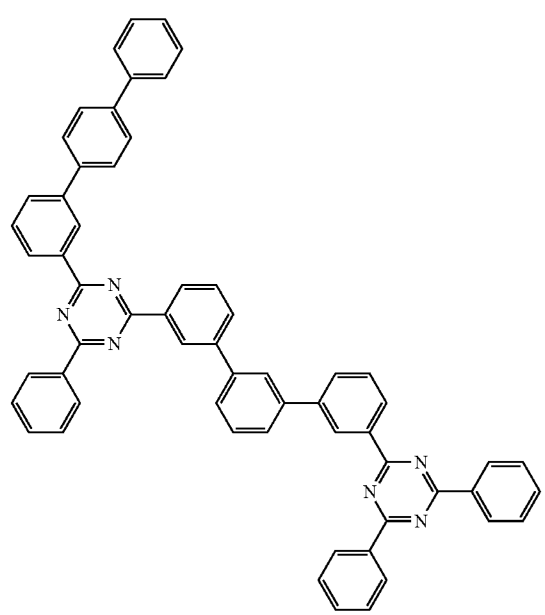

-continued
A(87)
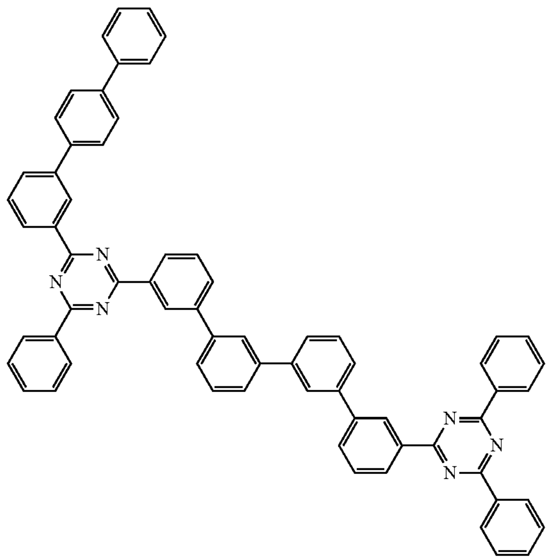
A(88)
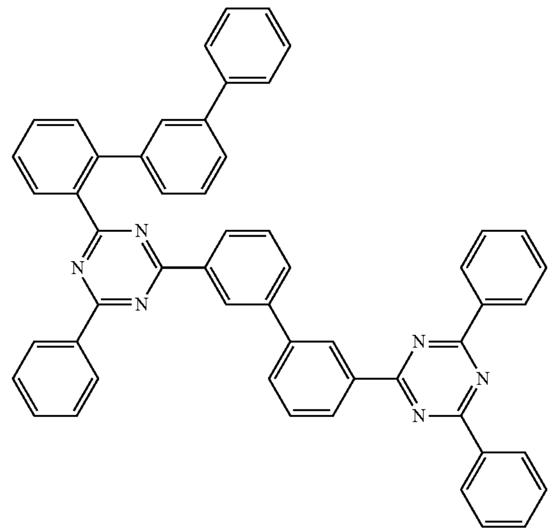
A(89)
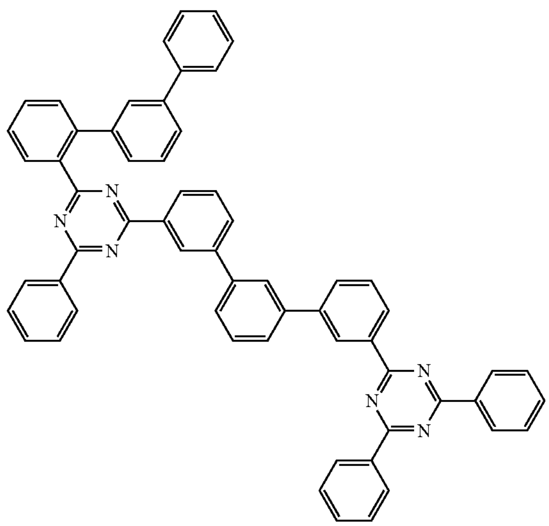
A(90)
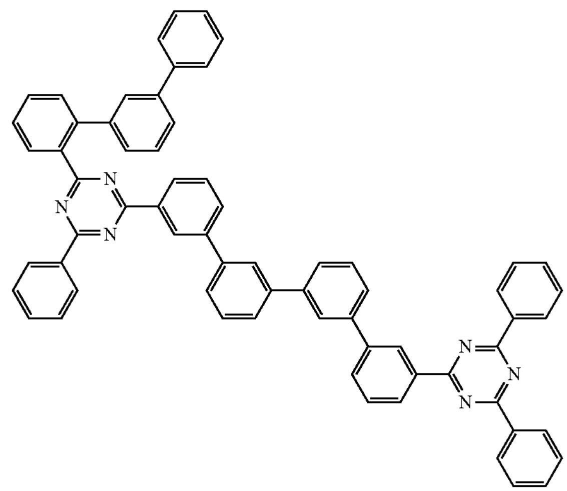
A(91)
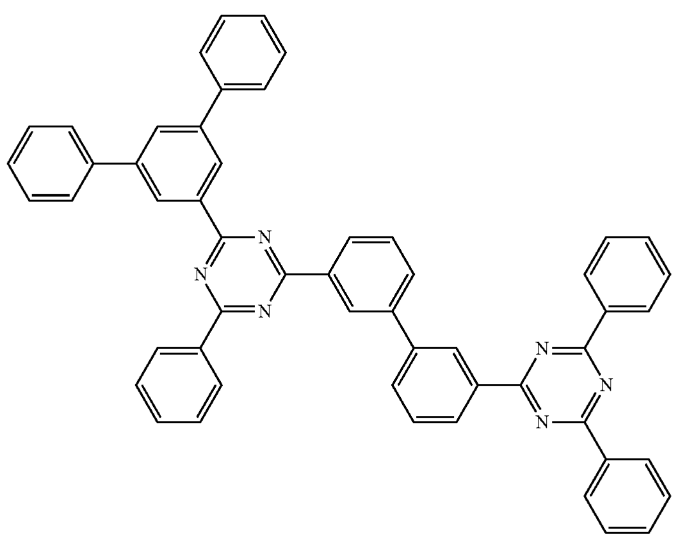

-continued
A(92)
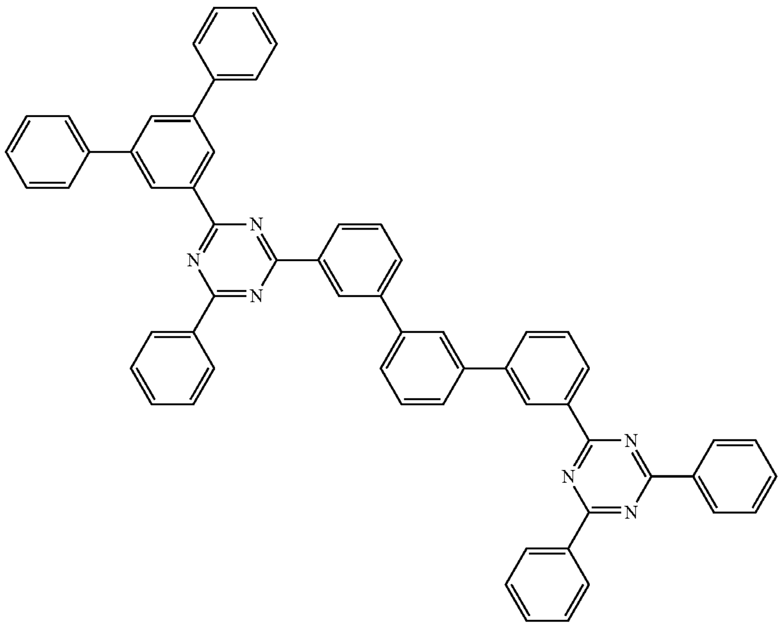
A(93)
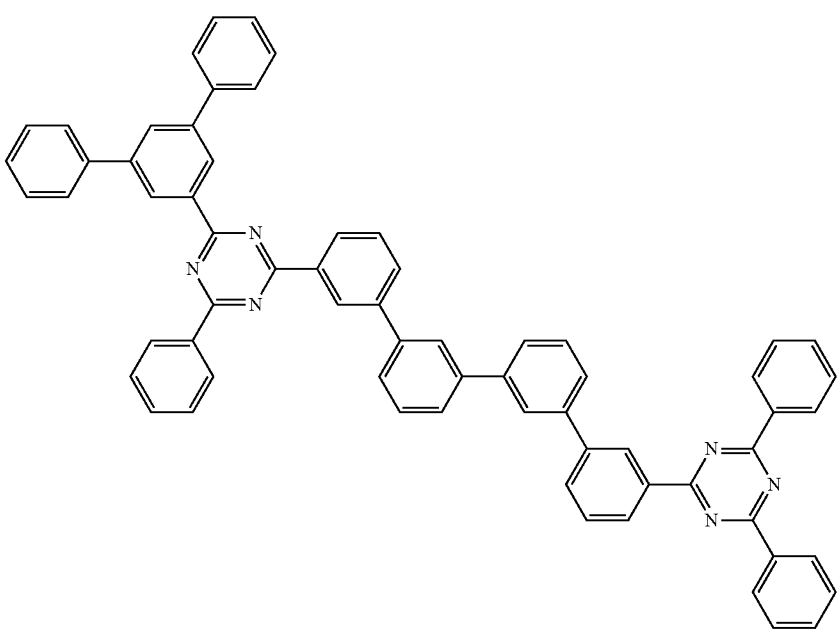

-continued
A(94)
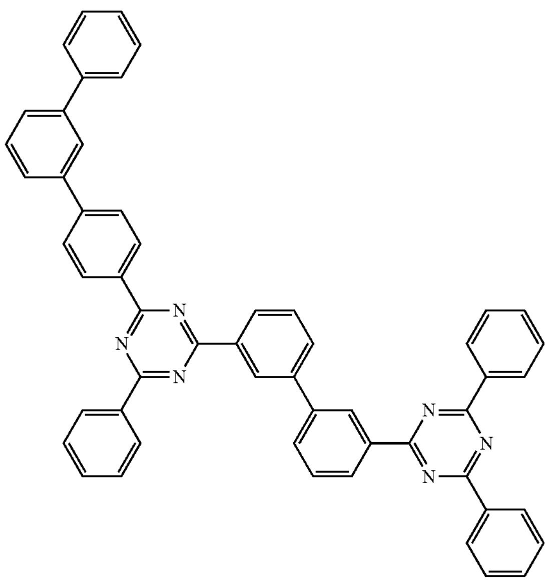
A(95)
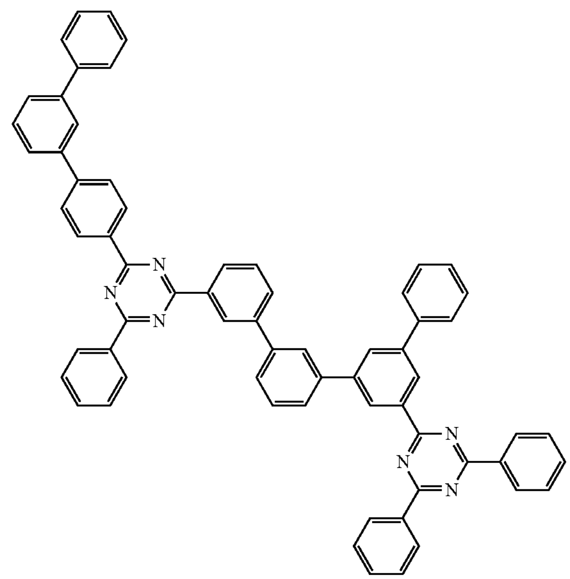
A(96)
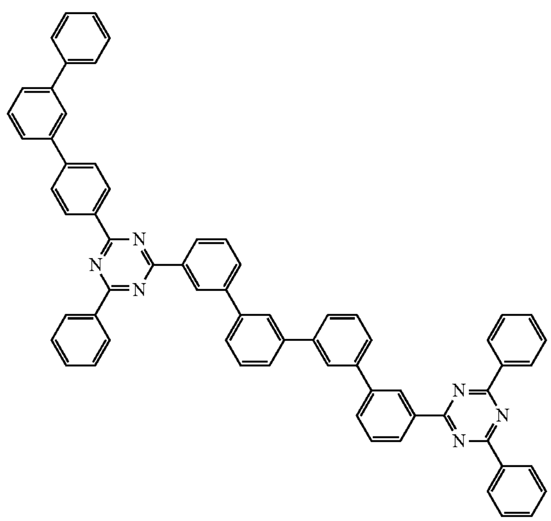
A(97)
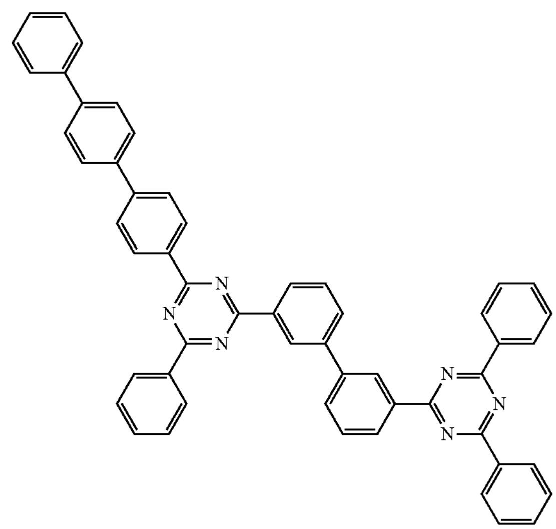
A(98)
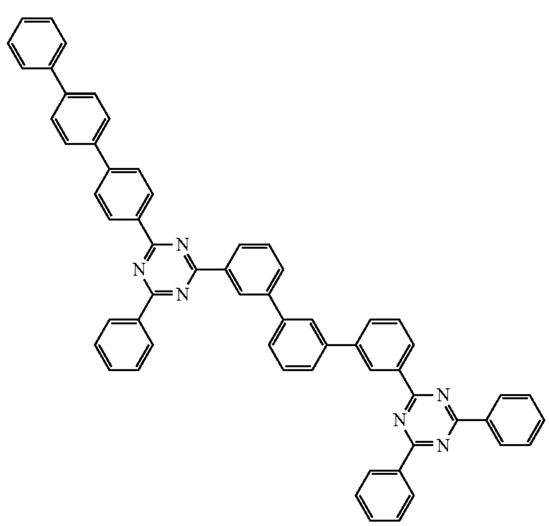
A(99)
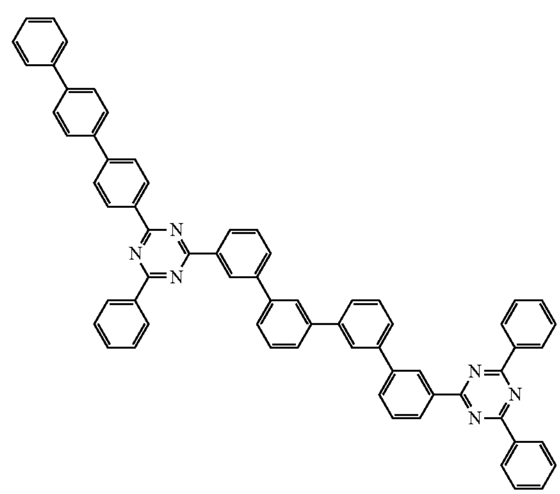

-continued
A(100)
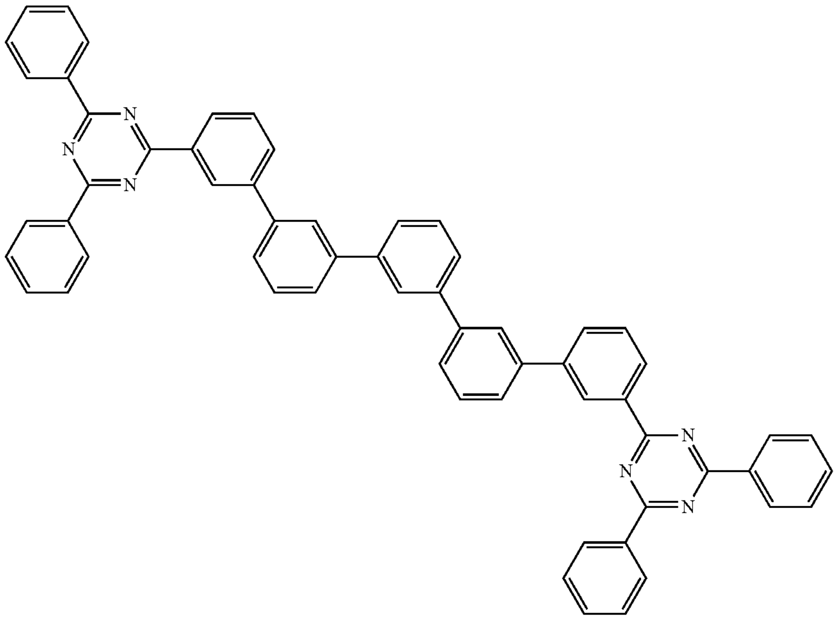
A(101)
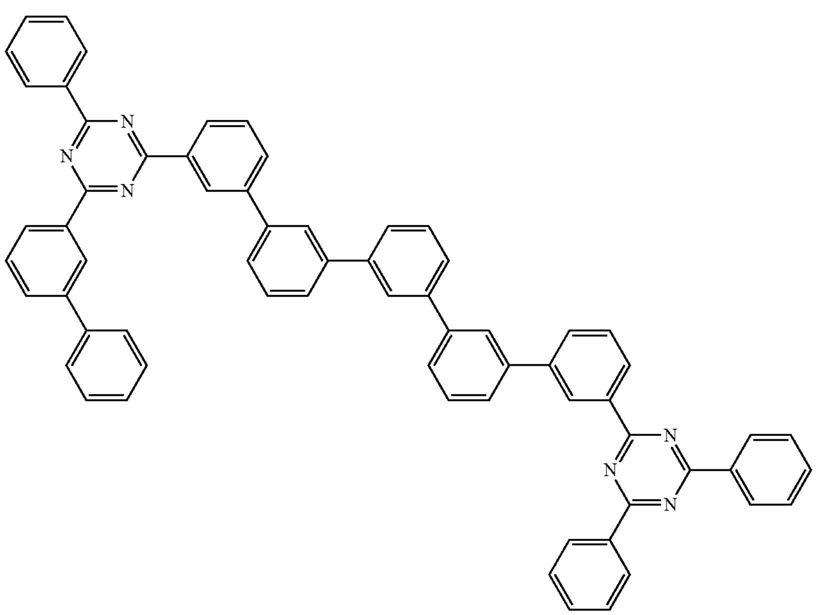

-continued
A(102)
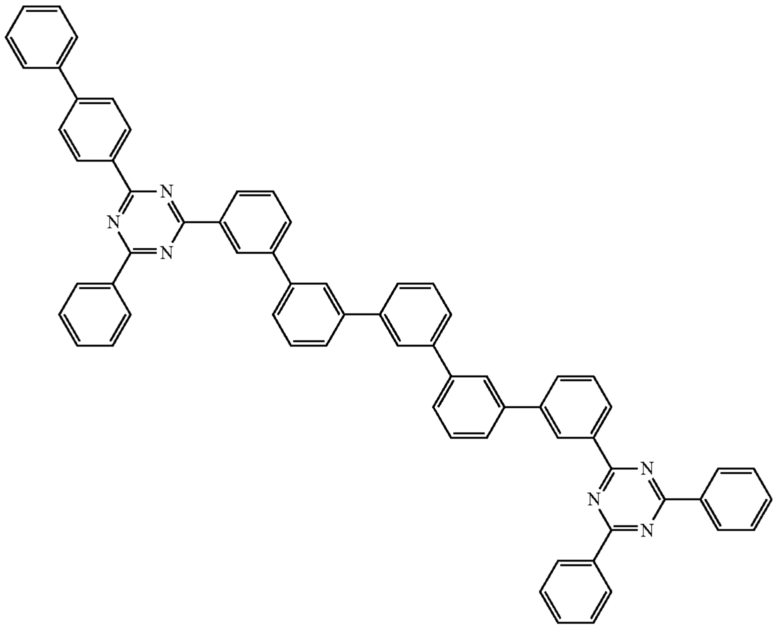
A(103)
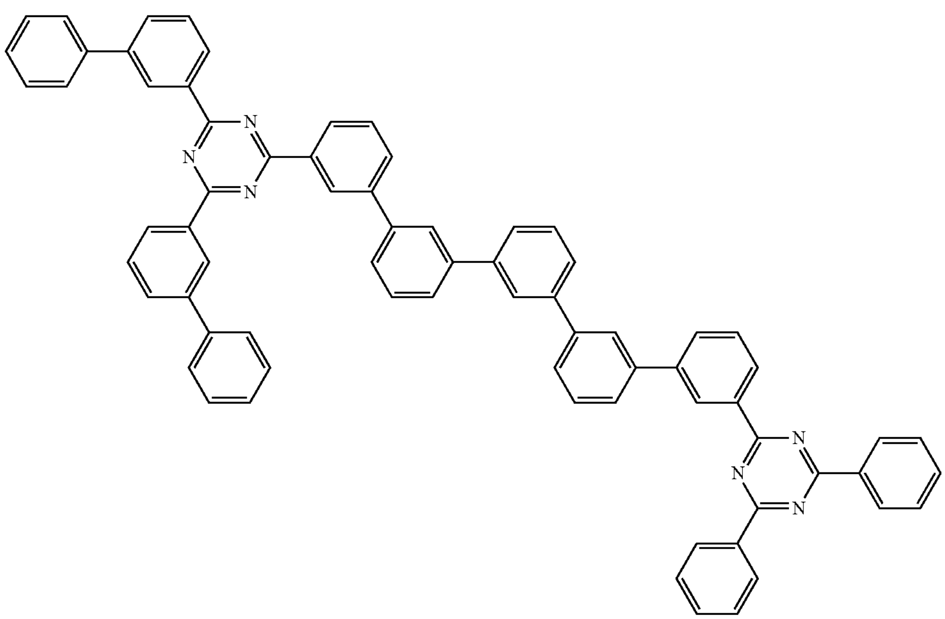

-continued
A(104)
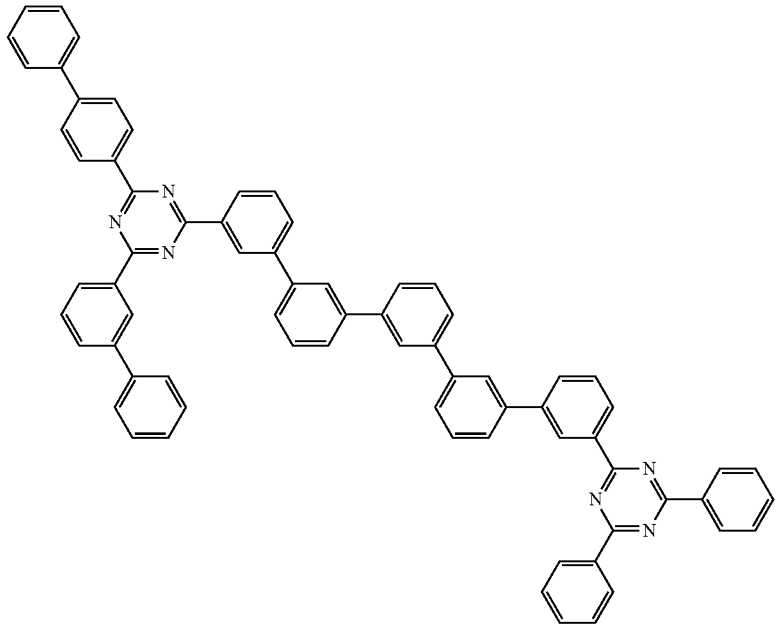
A(105)
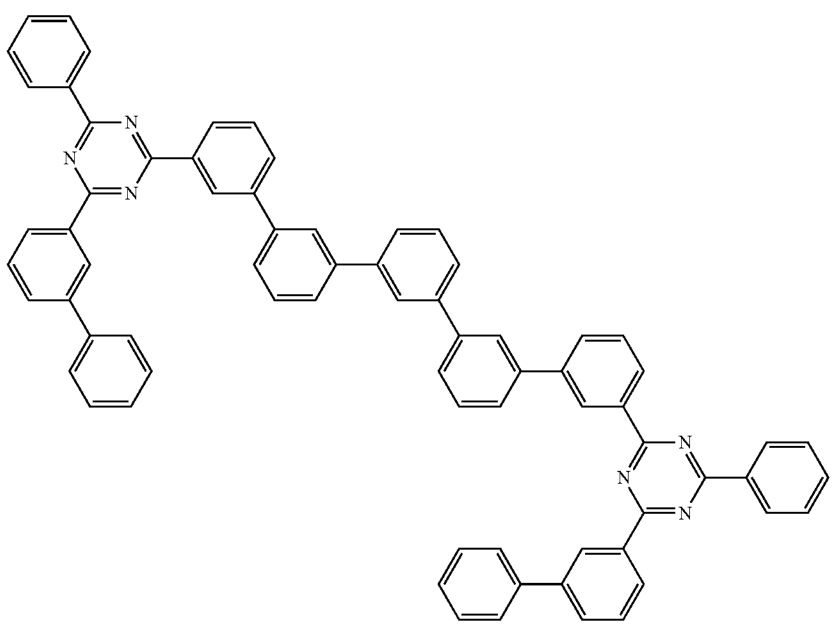

-continued
A(106)
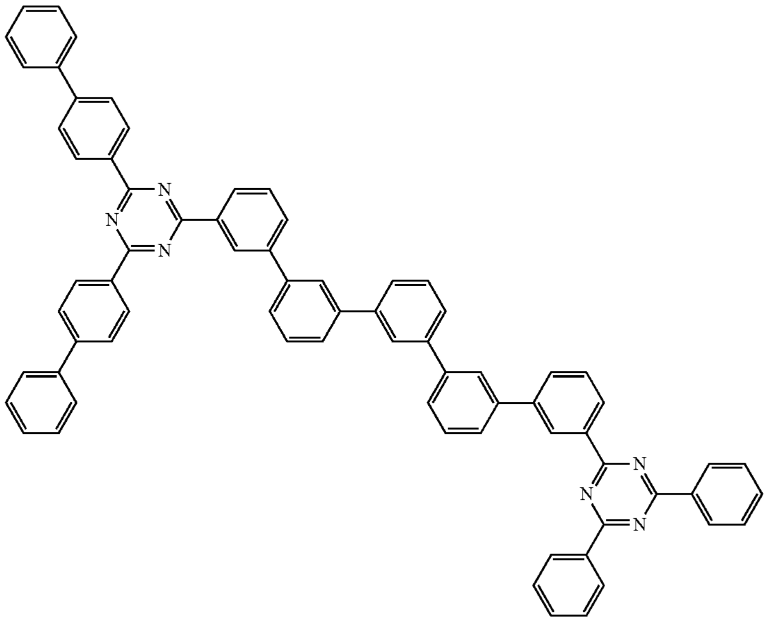
A(107)
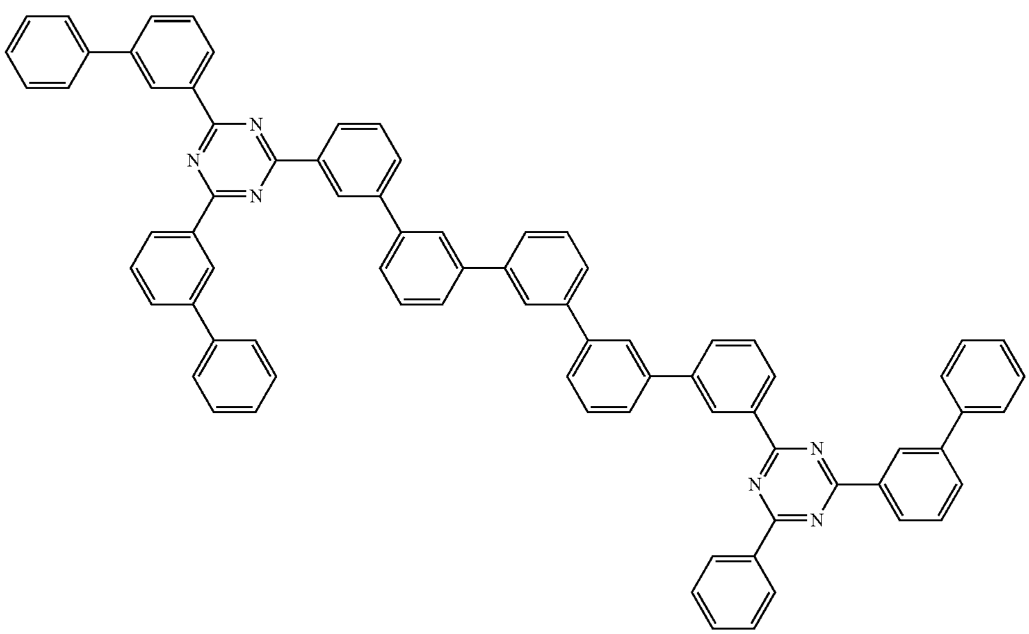

-continued
A(108)
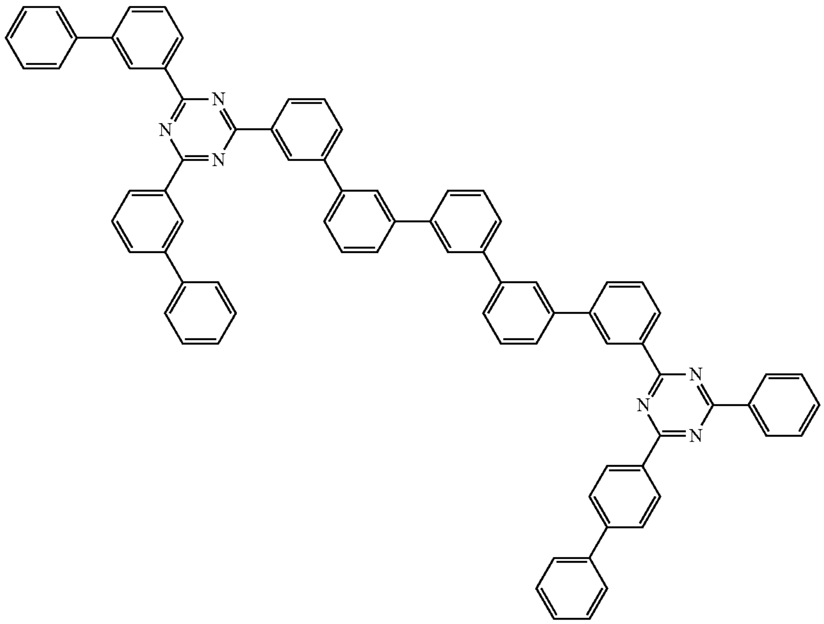
A(109)
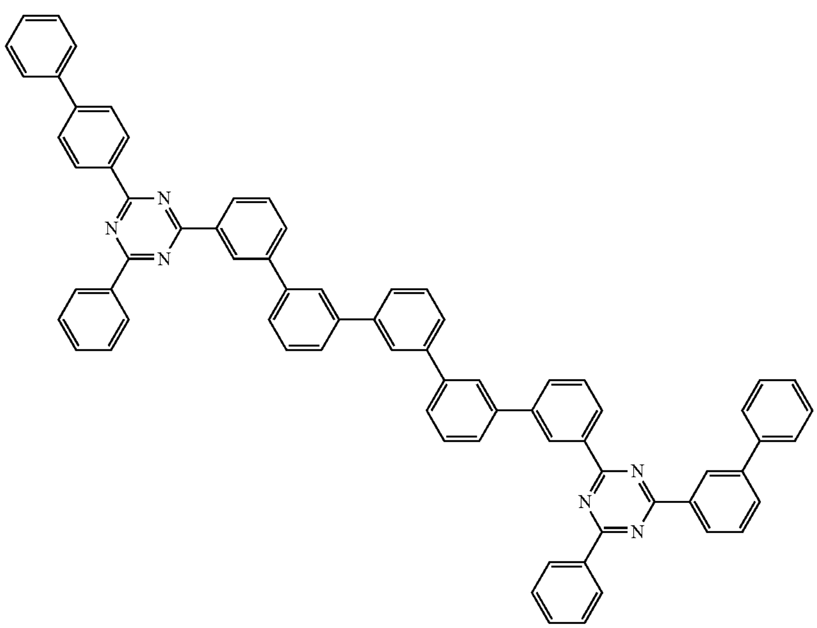

-continued
A(110)
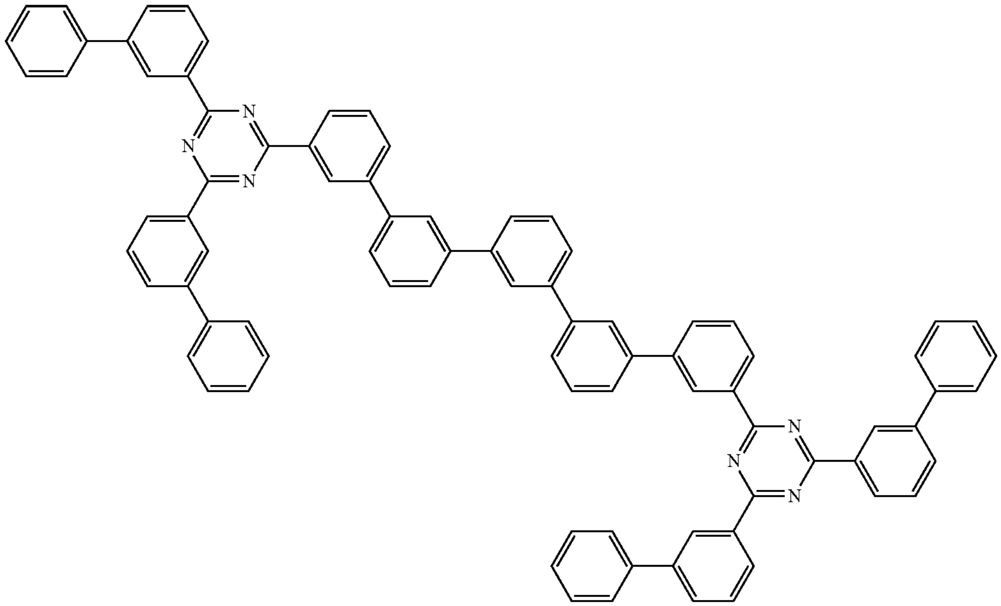
A(111)
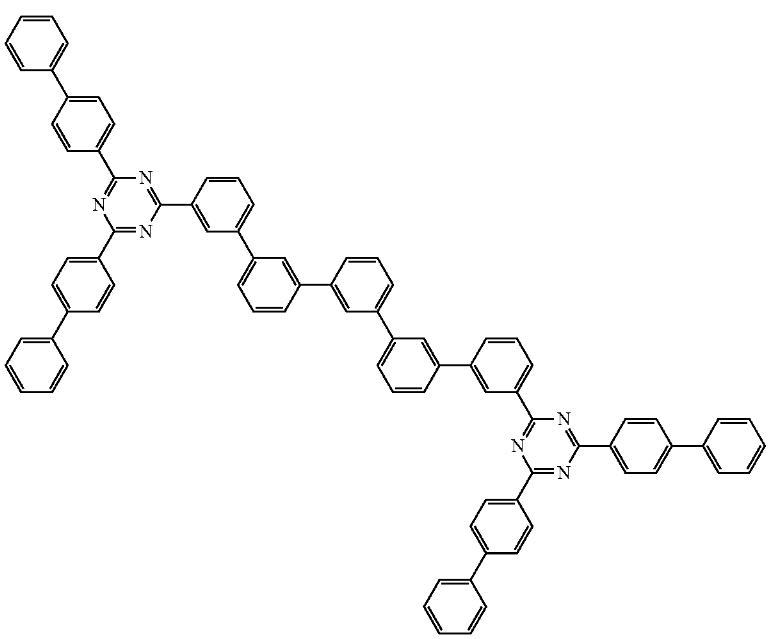

-continued
A(112)
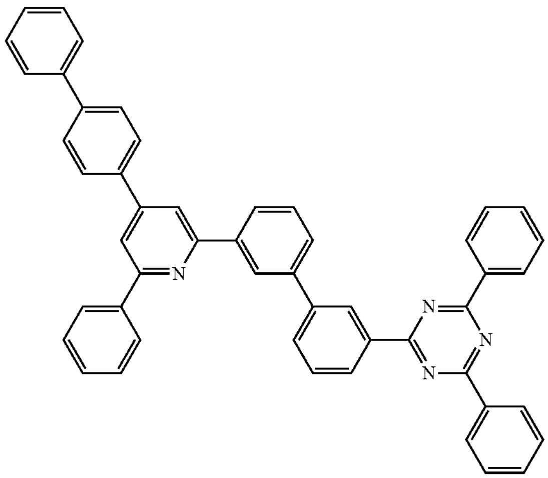
A(113)
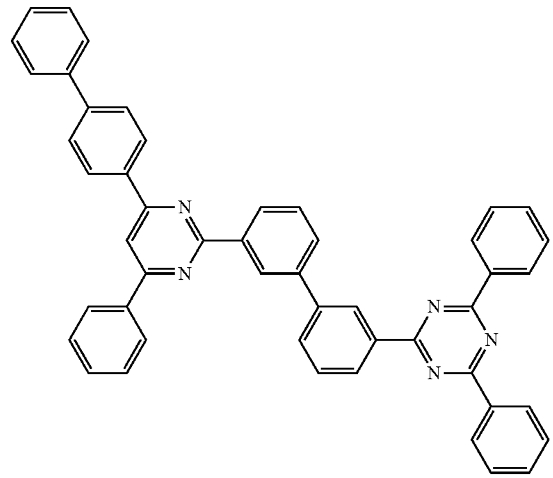
A(114)
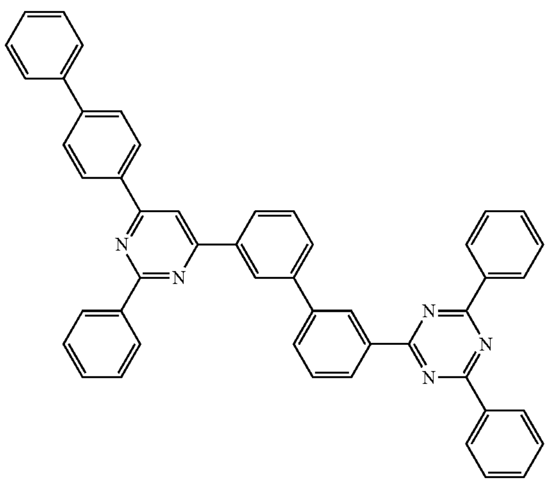
A(115)
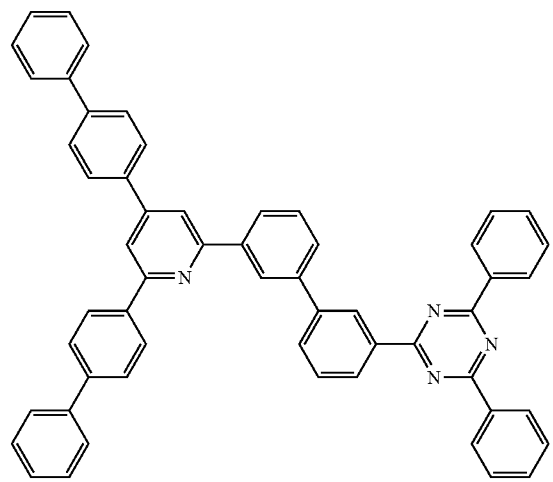
A(116)
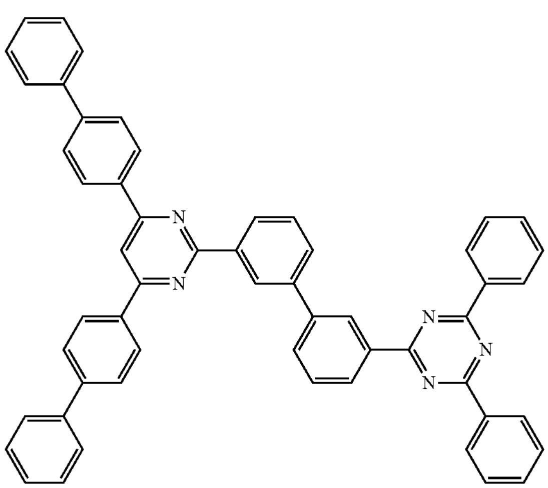
A(117)
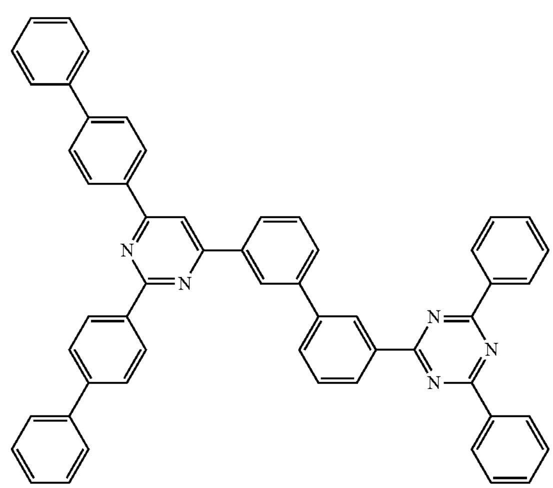

-continued
A(118)
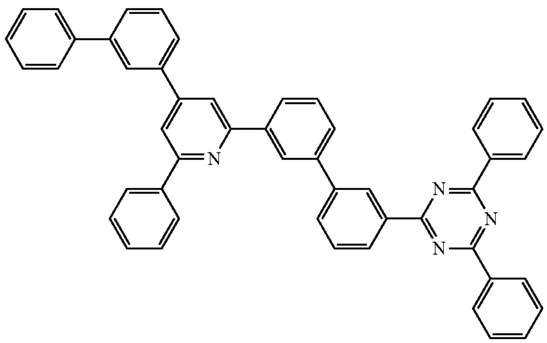
A(119)
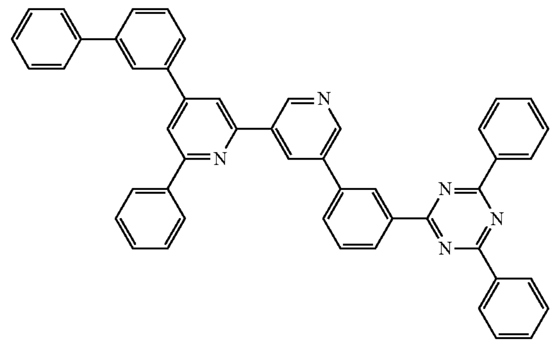
A(120)
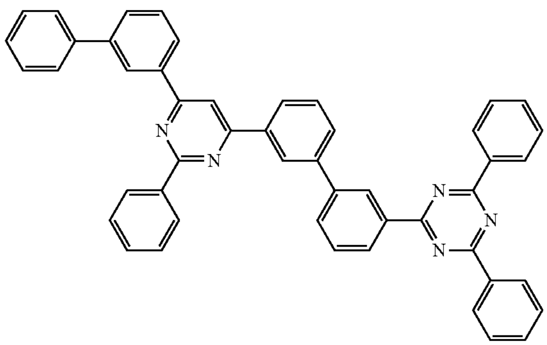
A(121)
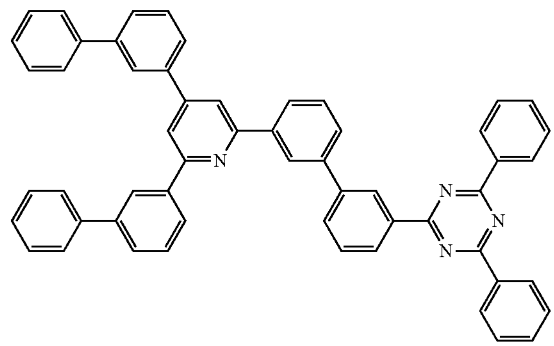
A(122)
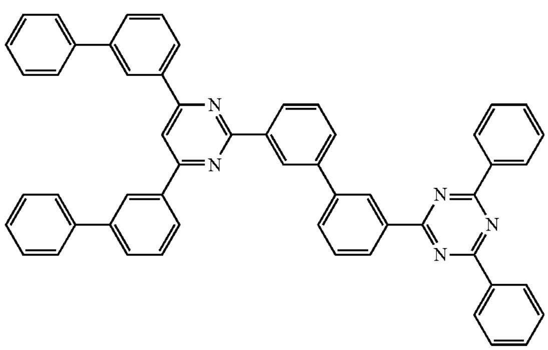
A(123)
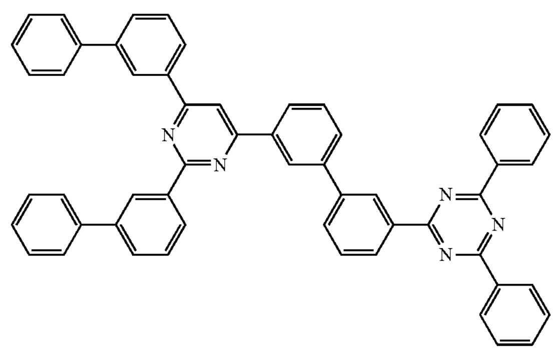
A(124)
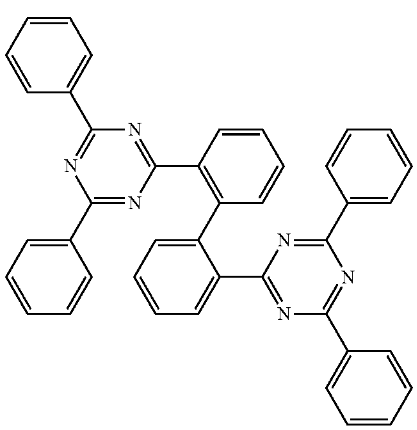
A(125)
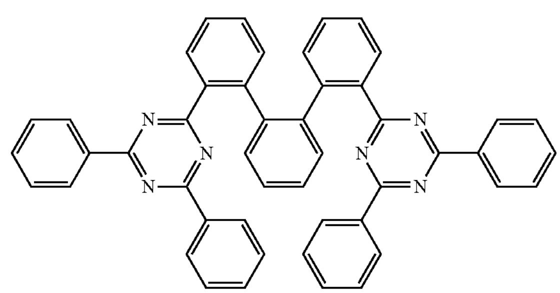

-continued
A(126)
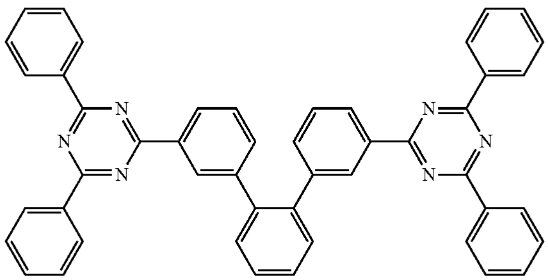
A(127)
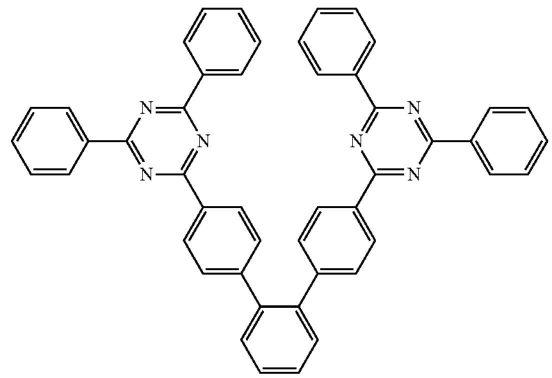
A(128)
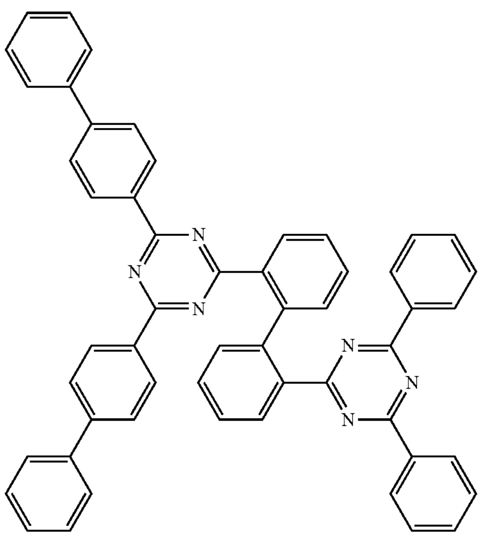
A(129)
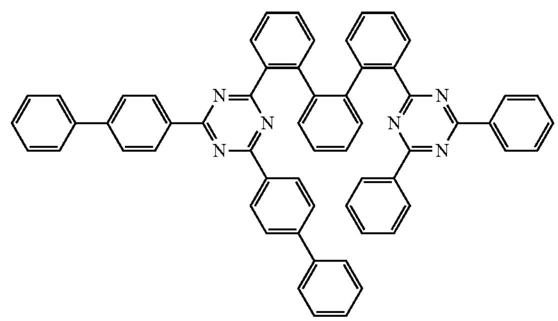
A(130)
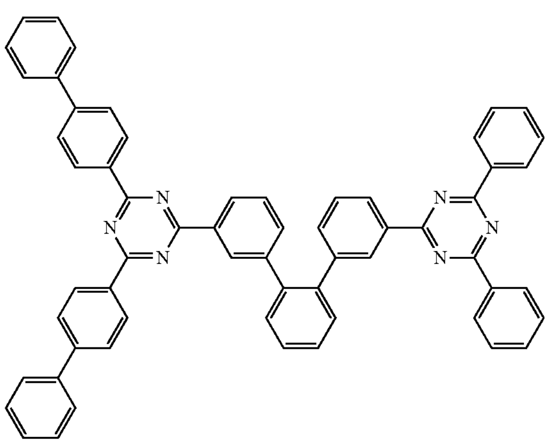
A(131)
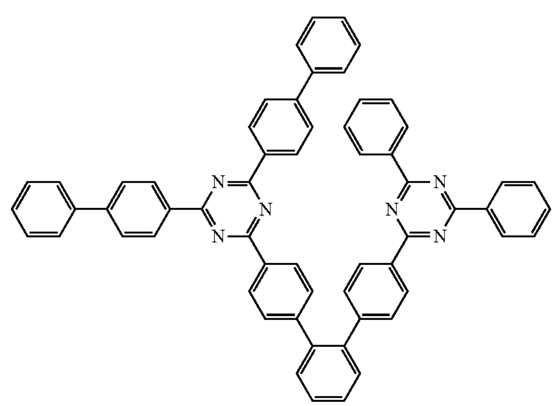

-continued
A(132)
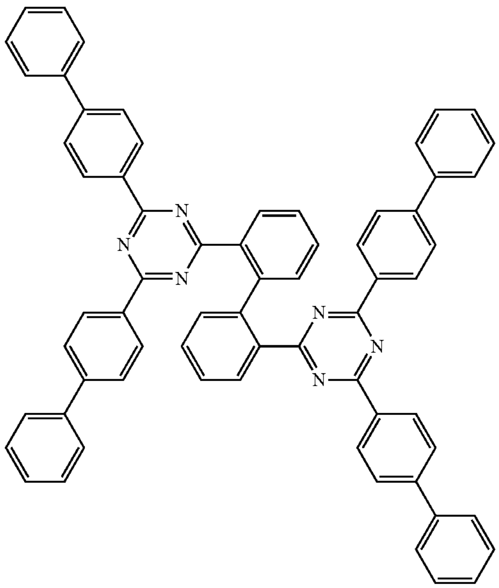
A(133)
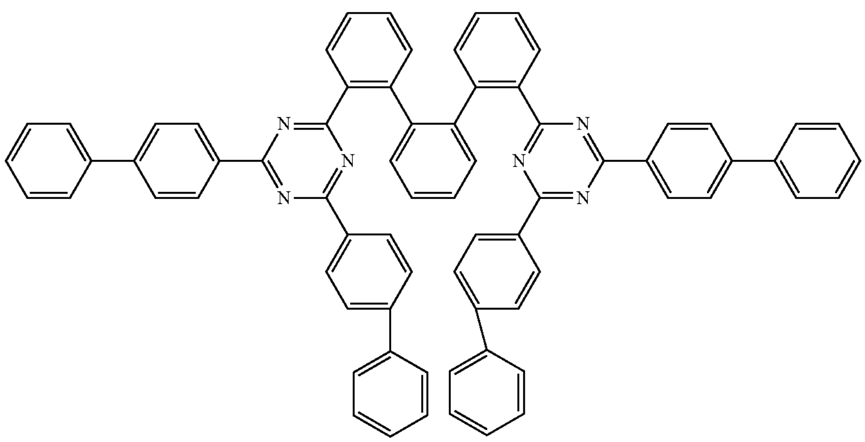
A(134)
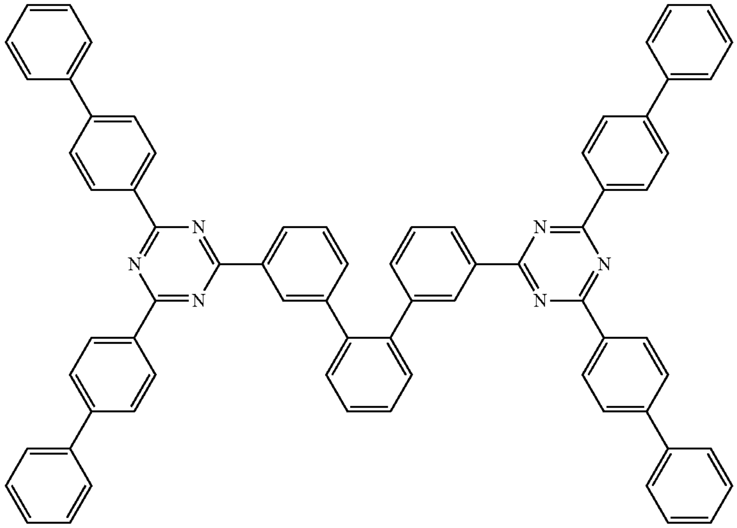

-continued
A(135)
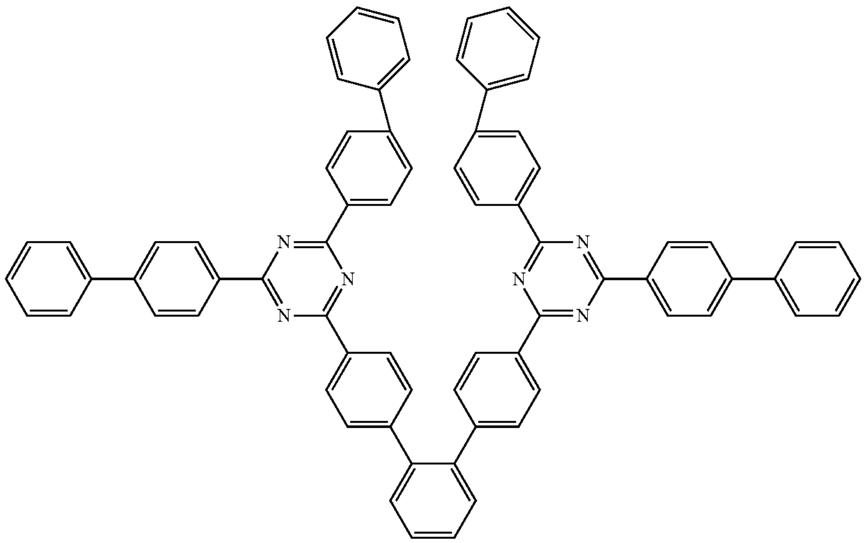
A(136)
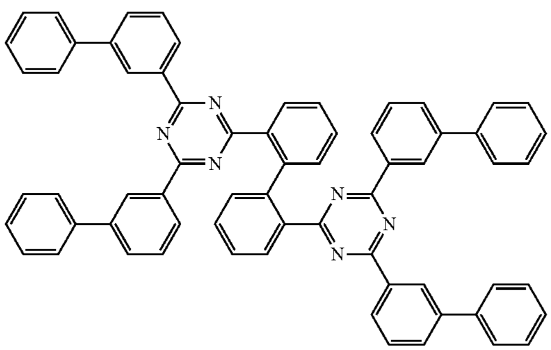
A(137)
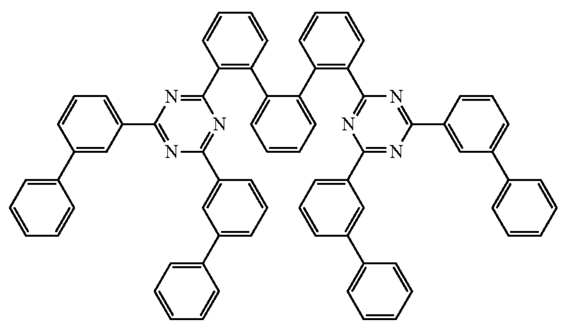
A(138)
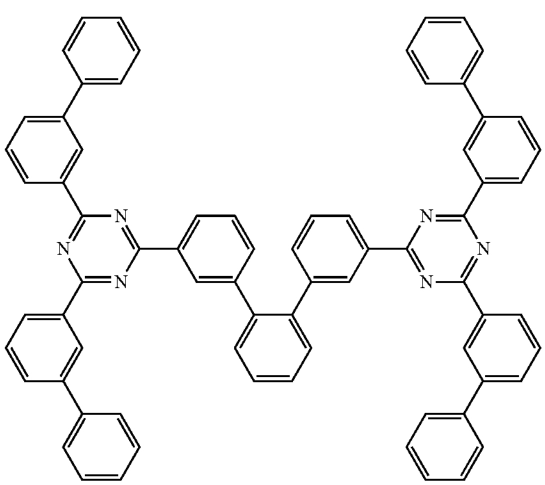
A(139)
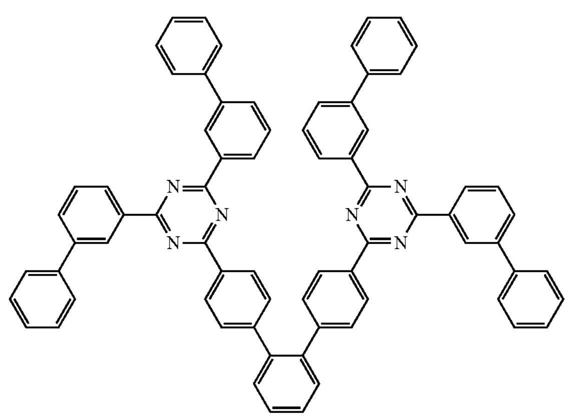

-continued
A(140)
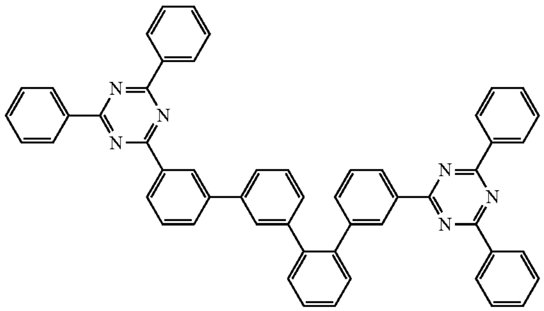
A(141)
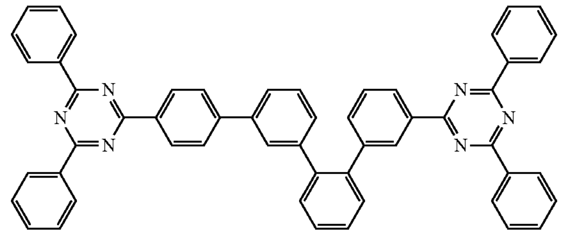
A(142)
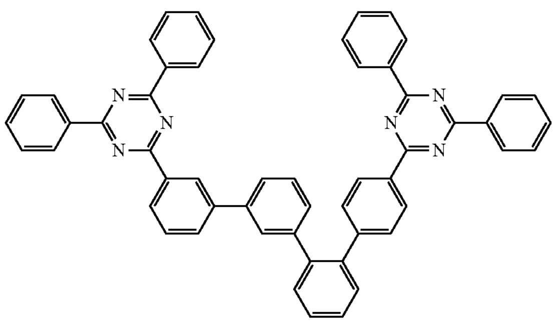
A(143)
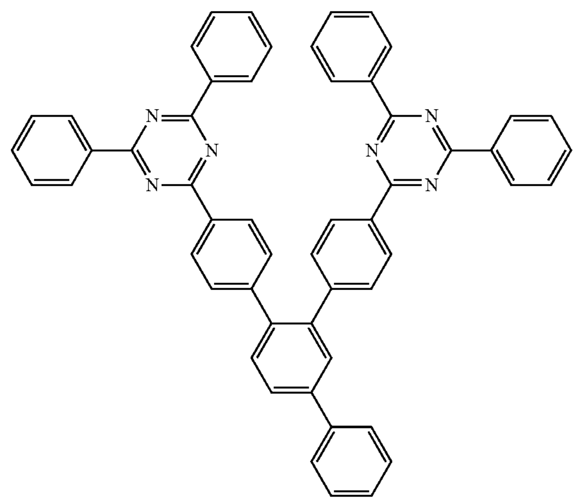
A(144)
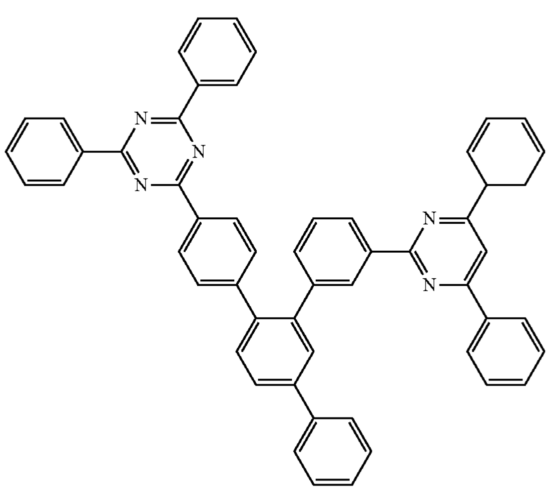
A(145)
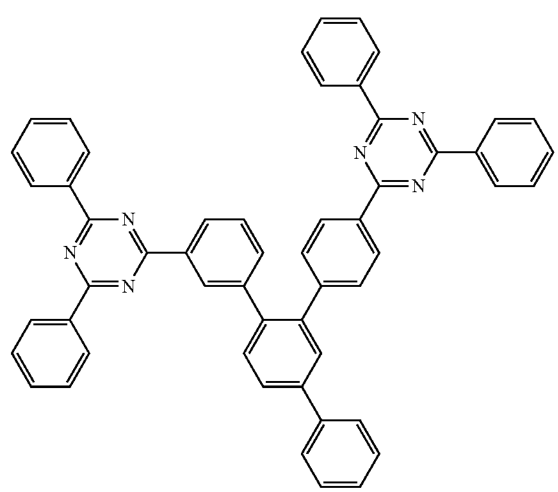

-continued
A(146)
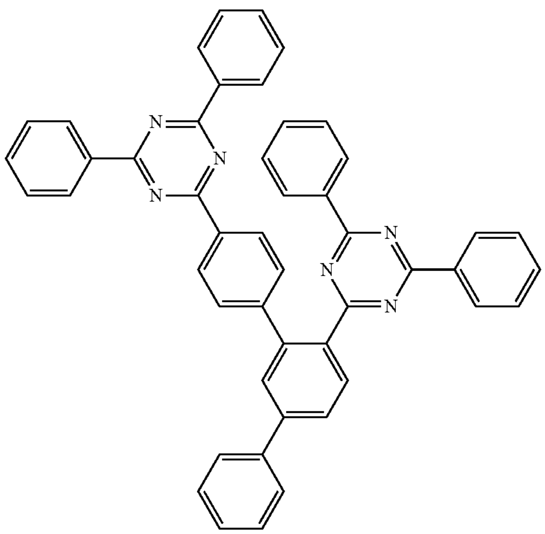
A(147)
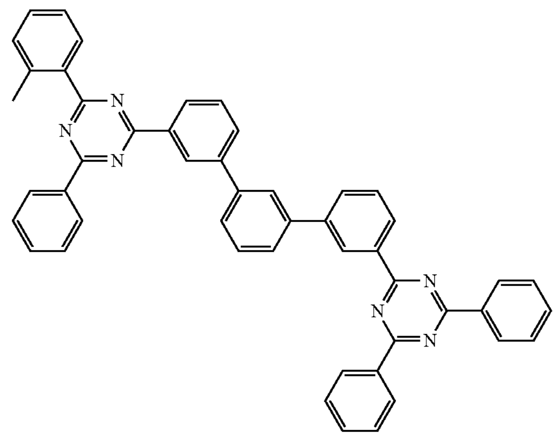
A(148)
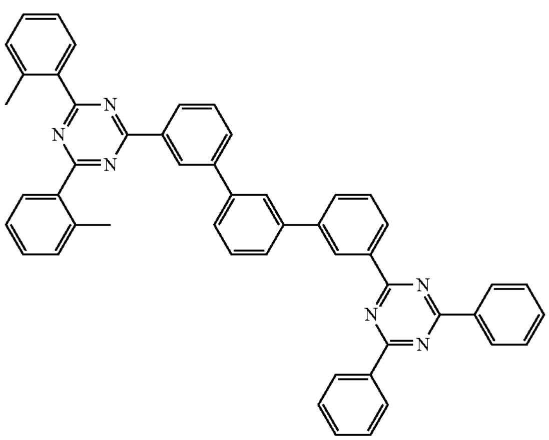
A(149)
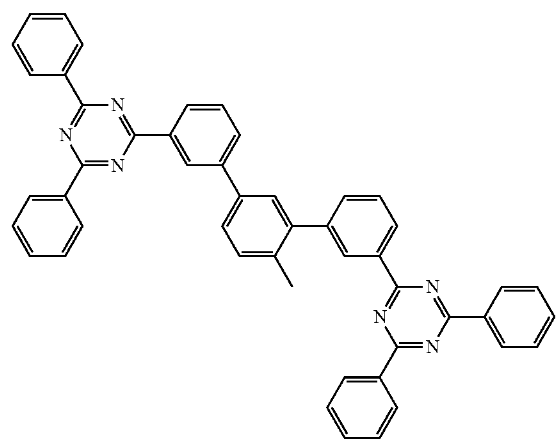
A(150)
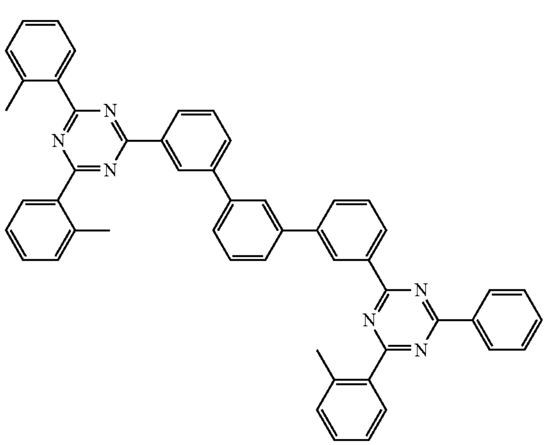
A(151)
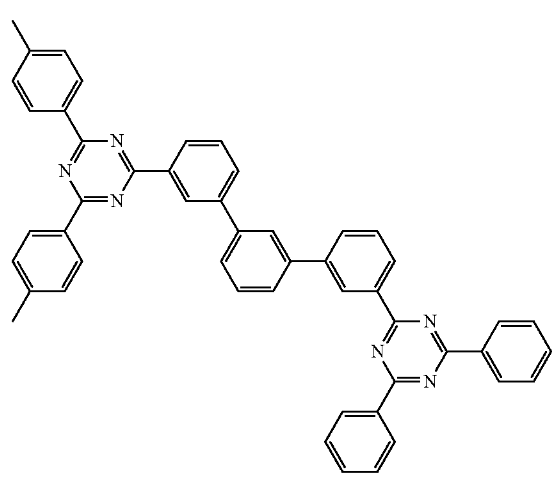

-continued
A(152)
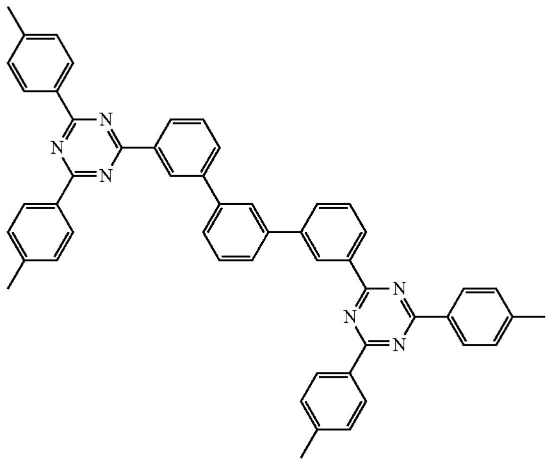
A(153)
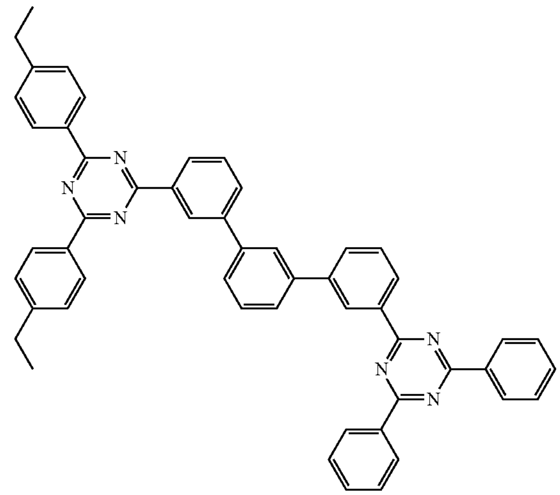
A(154)
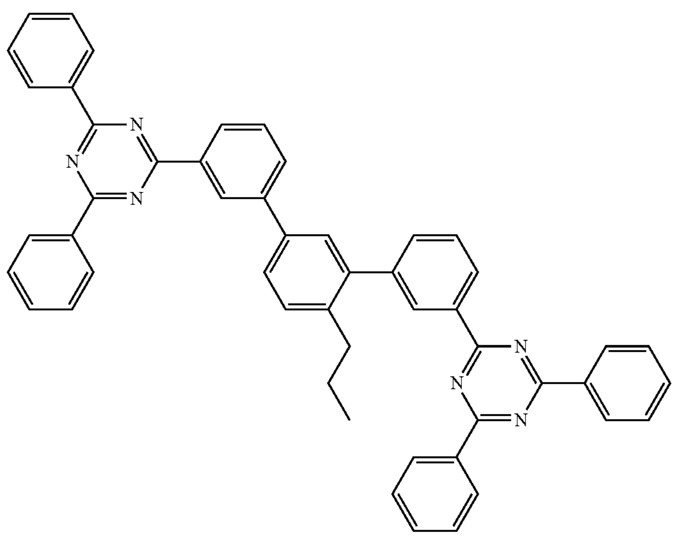
Group HE2
1
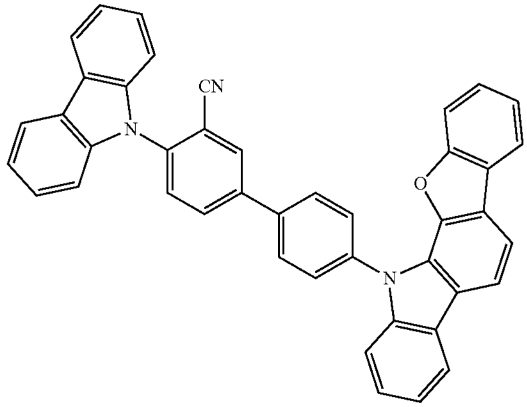
-continued
2
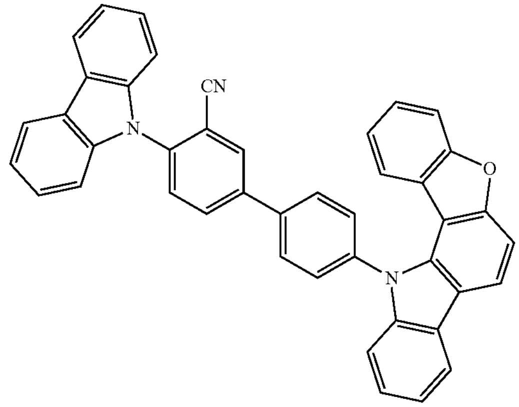

-continued
3
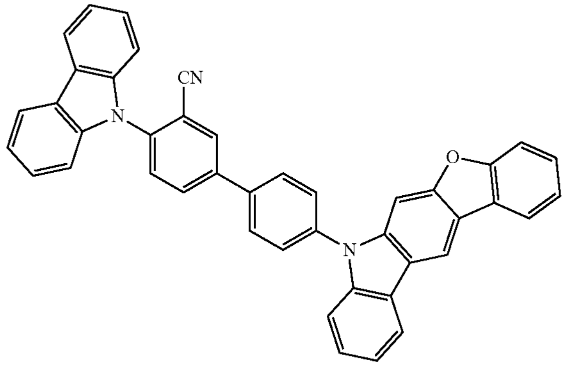
4
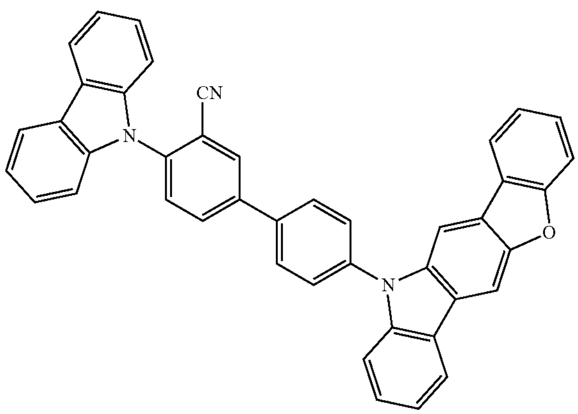
5
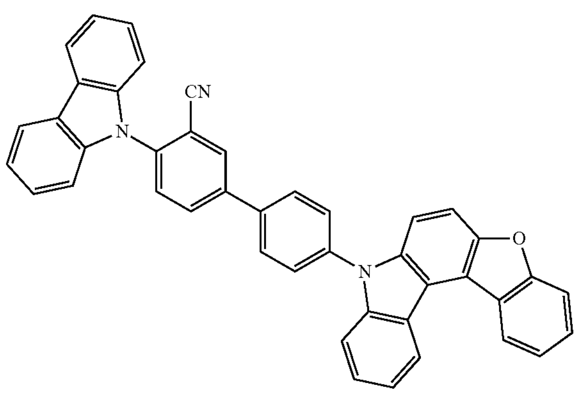
6
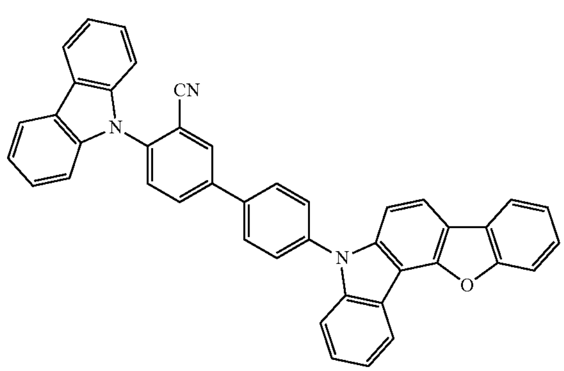
-continued
7
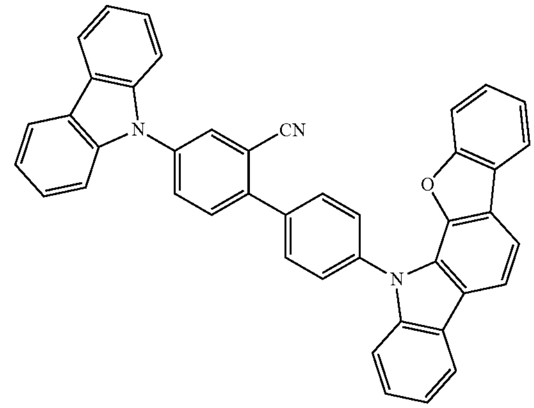
8
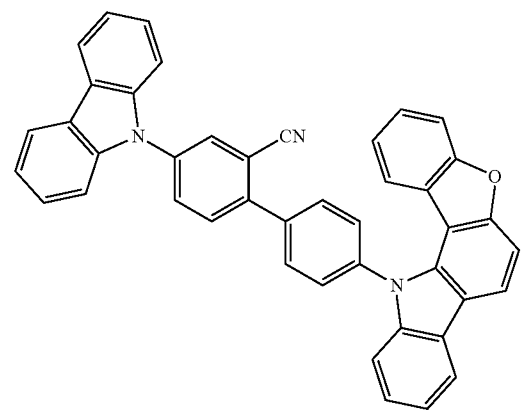
9
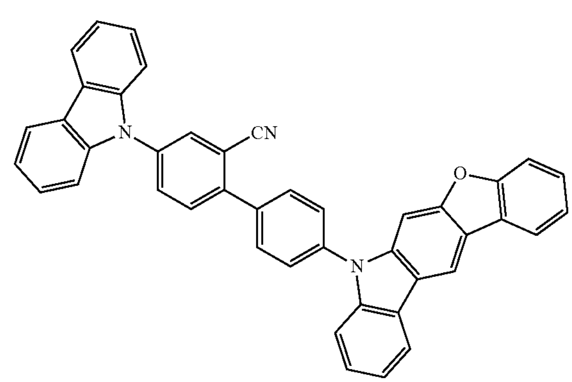

-continued
10
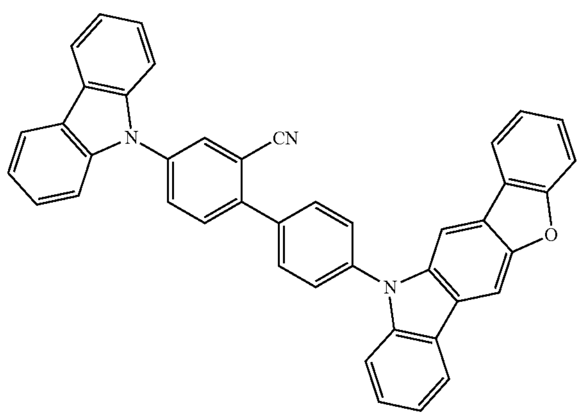
11
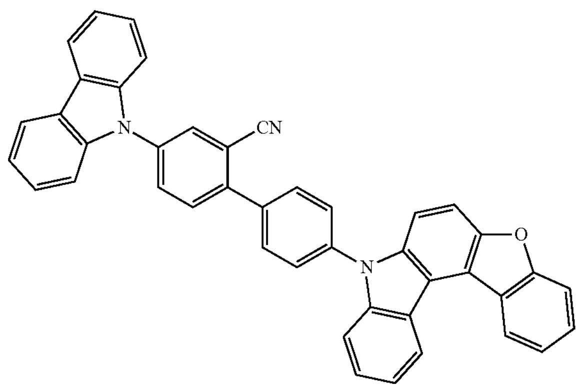
12
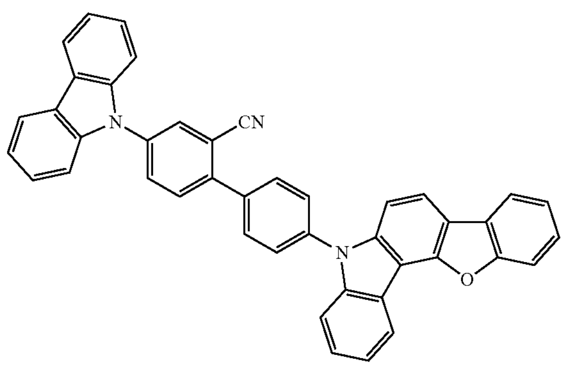
13
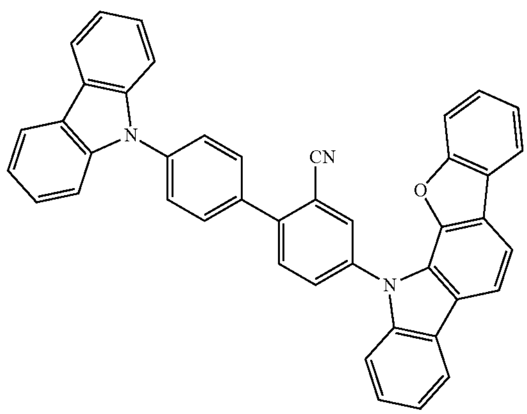
-continued
14
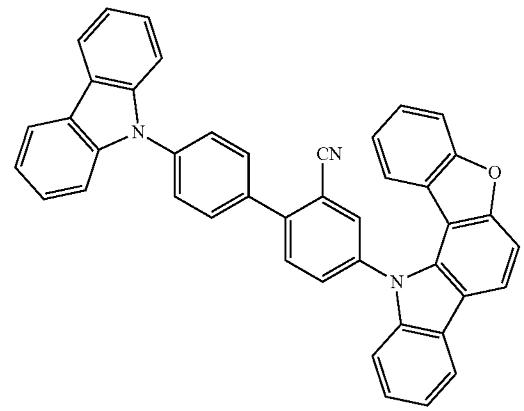
15
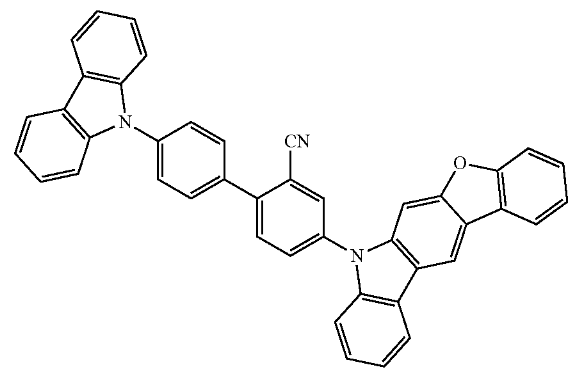
16
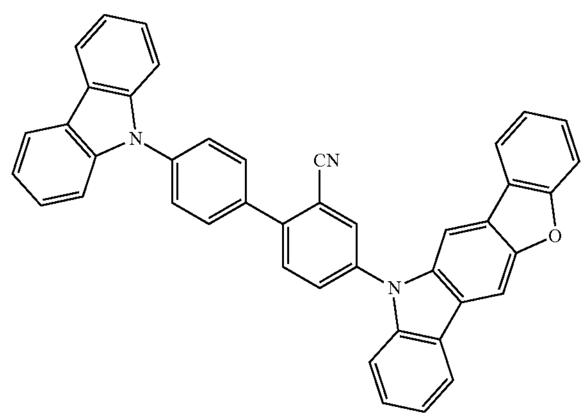
17
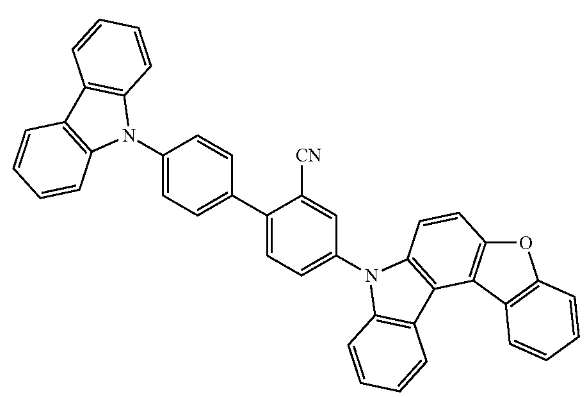

-continued
18
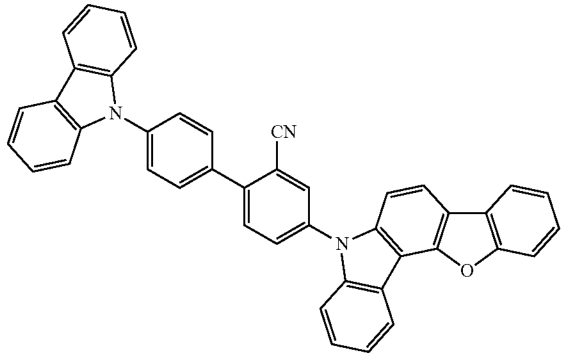
19
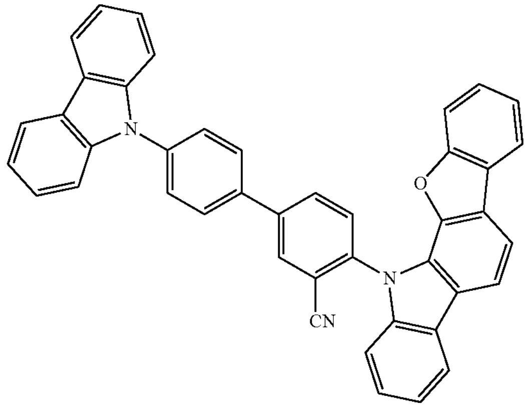
20
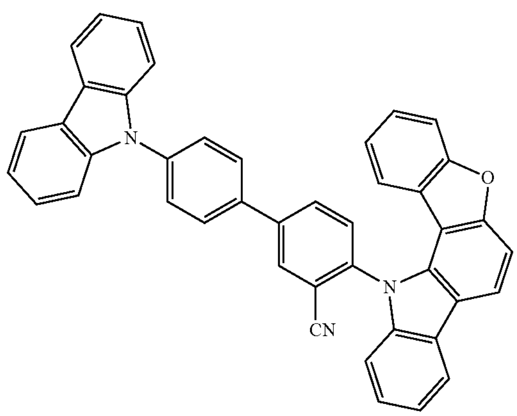
21
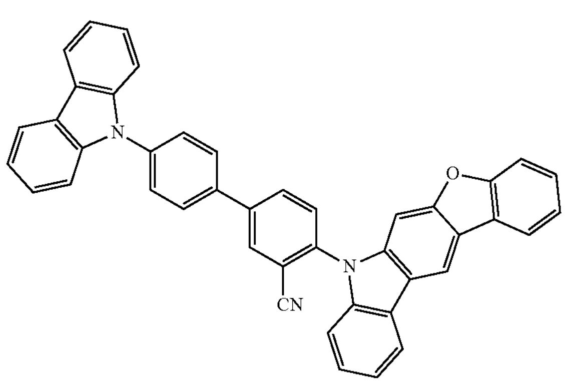
-continued
22
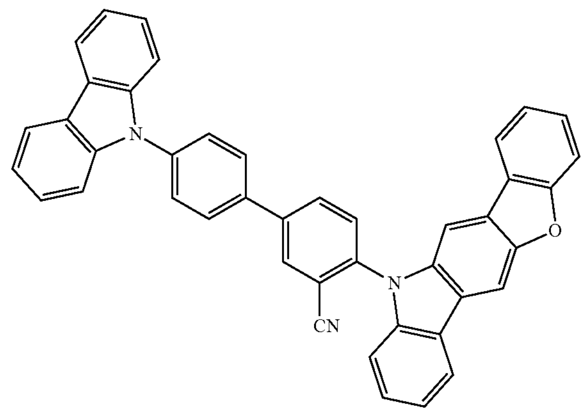
23
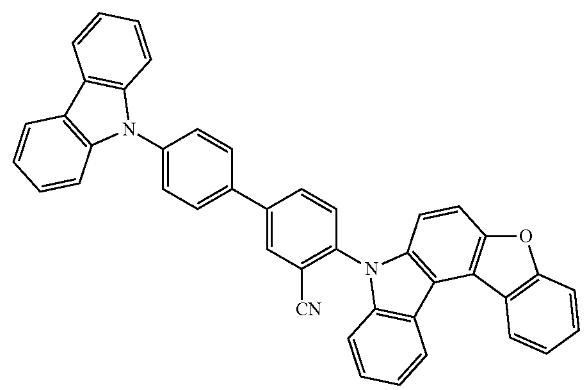
24
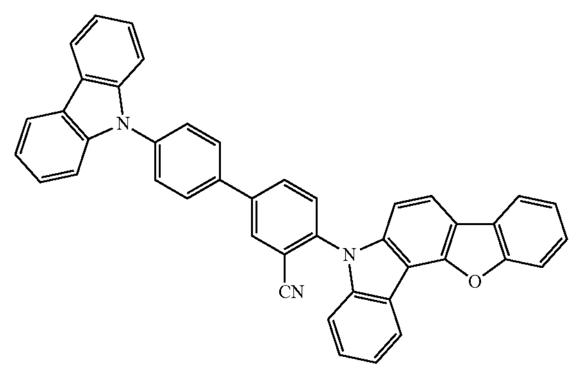
25
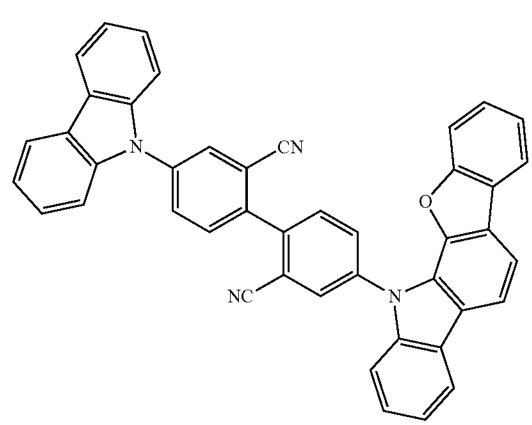

-continued
26
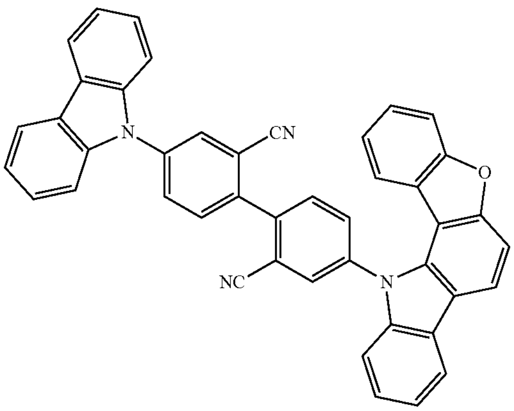
27
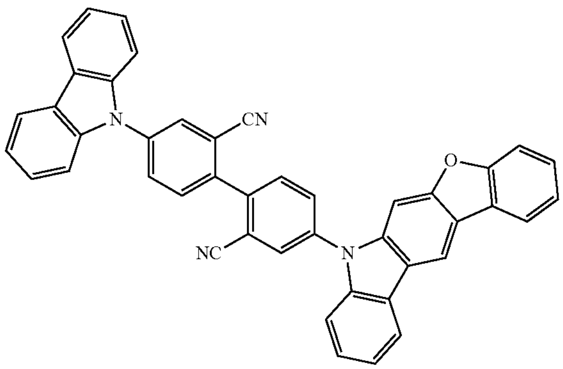
28
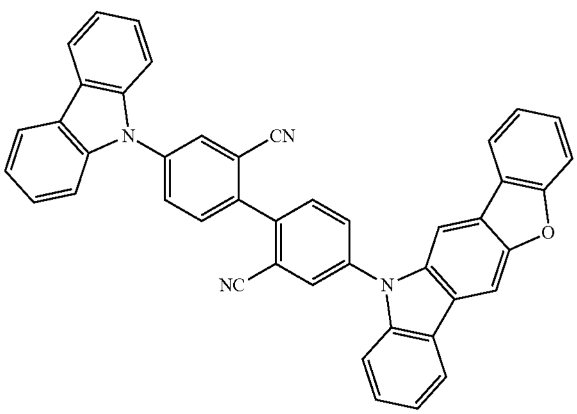
29
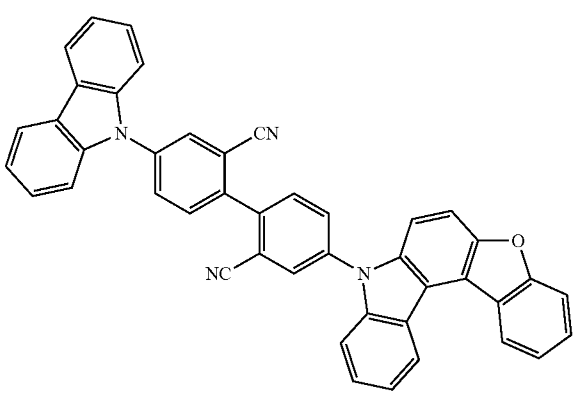
-continued
30
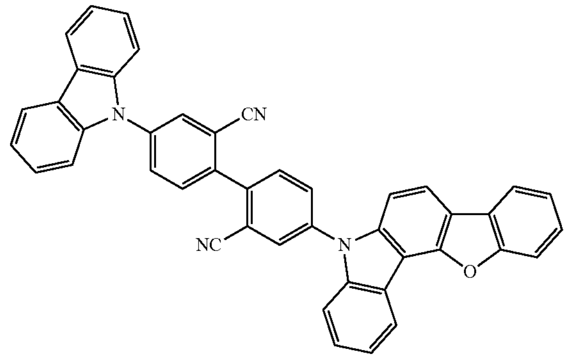
31
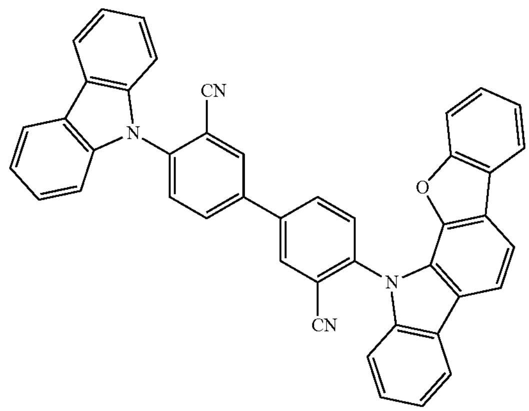
32
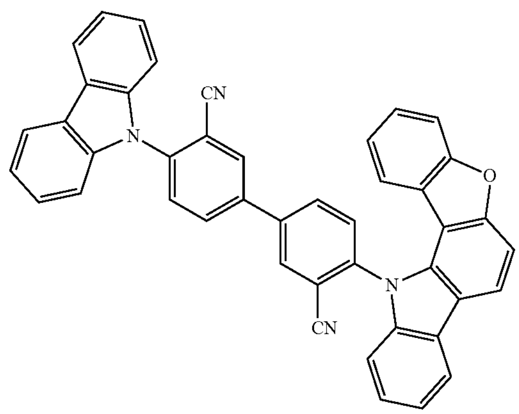
33
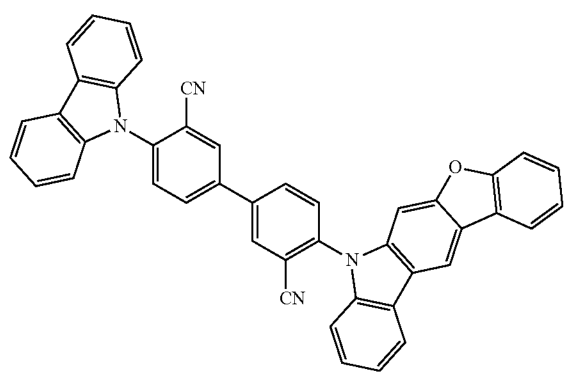

34
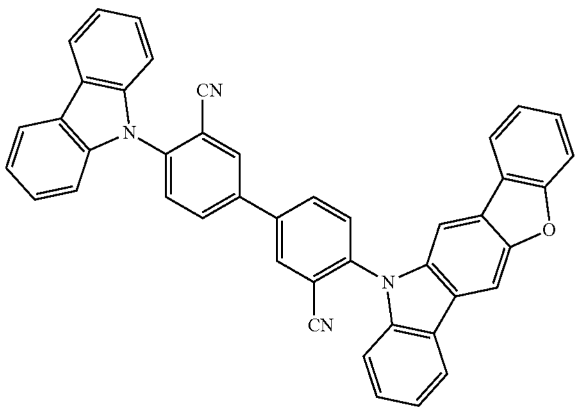
35
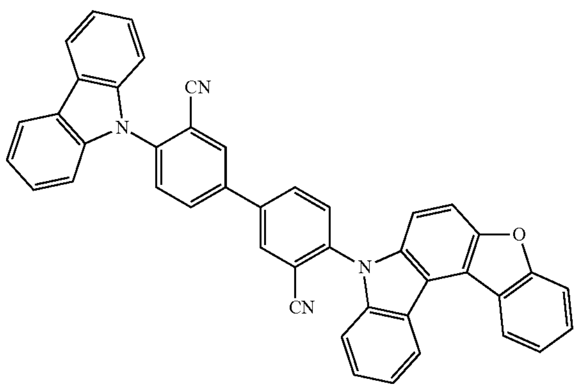
36
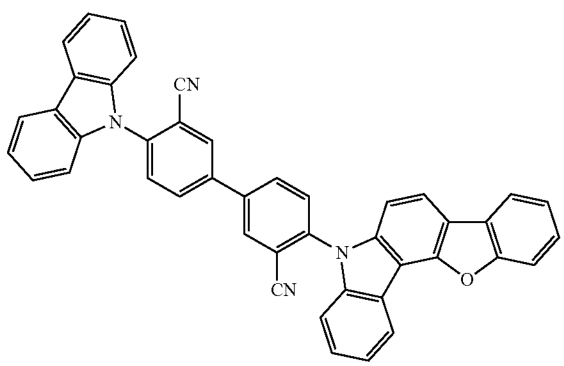
37
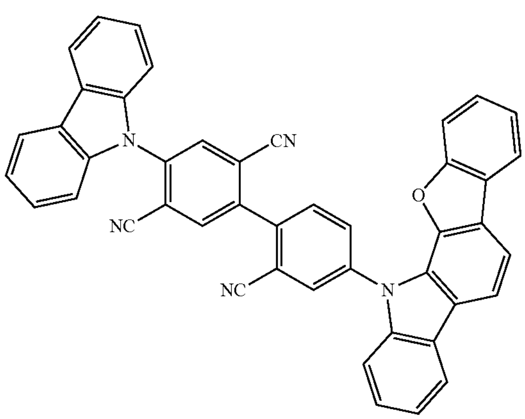
38
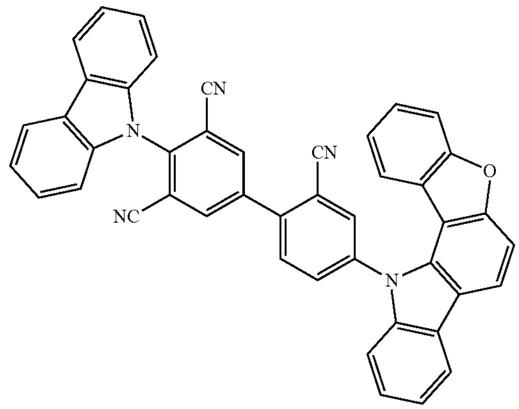
39
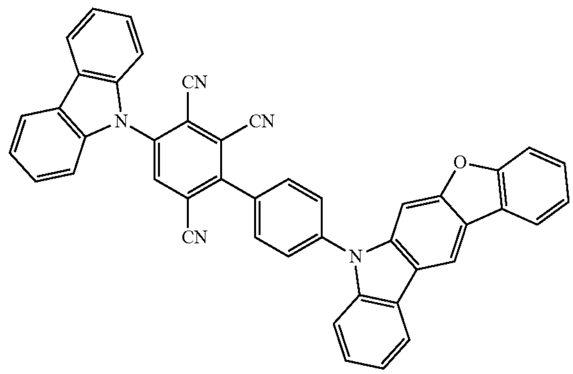
40
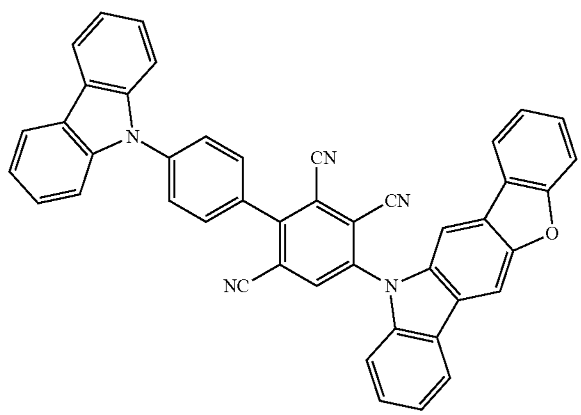
41
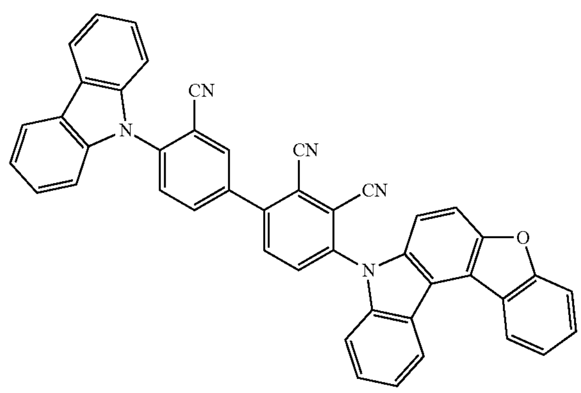

-continued
42
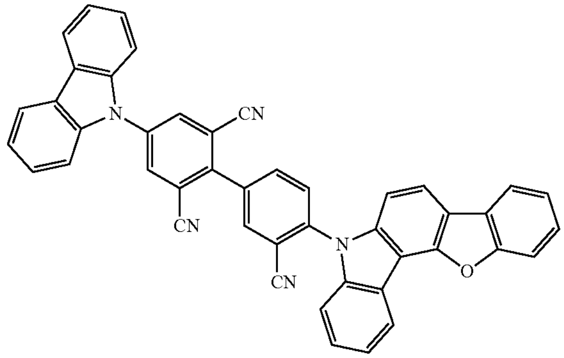
43
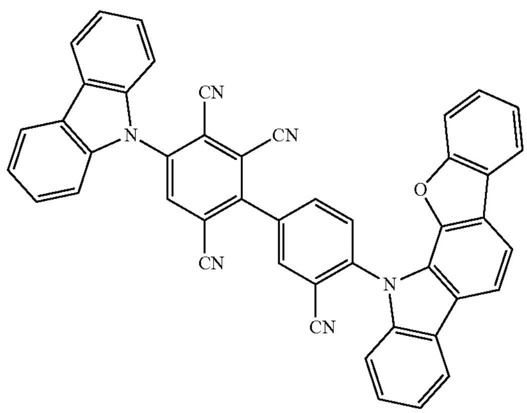
44
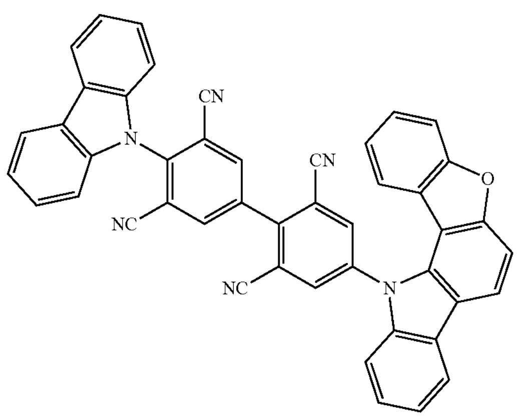
45
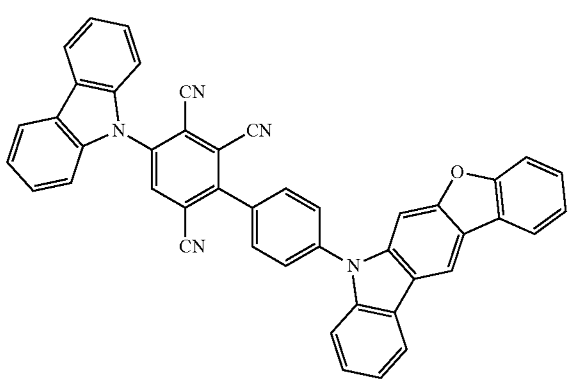
-continued
46
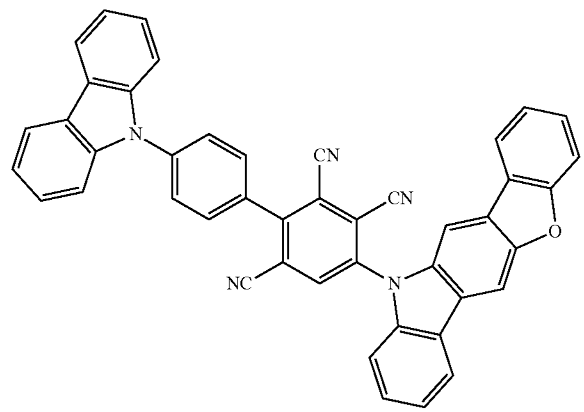
47
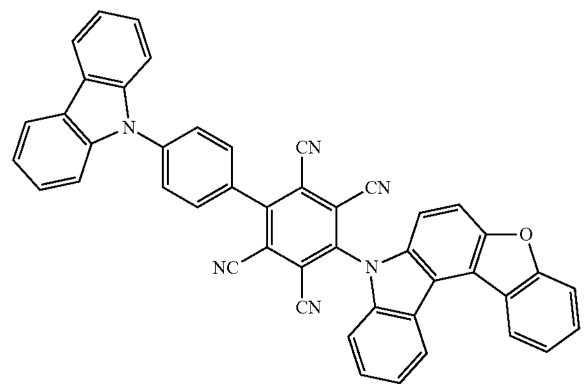
48
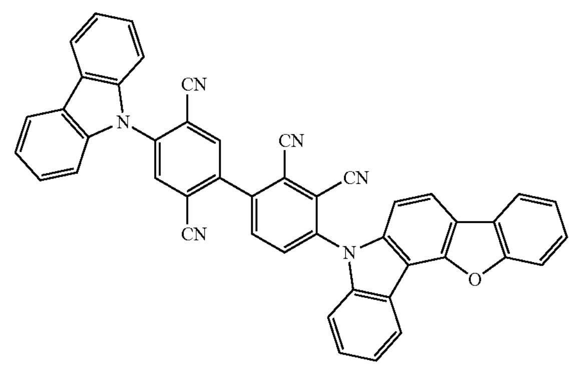
49
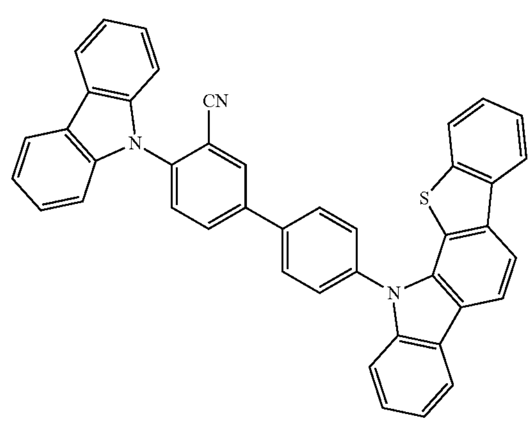

50
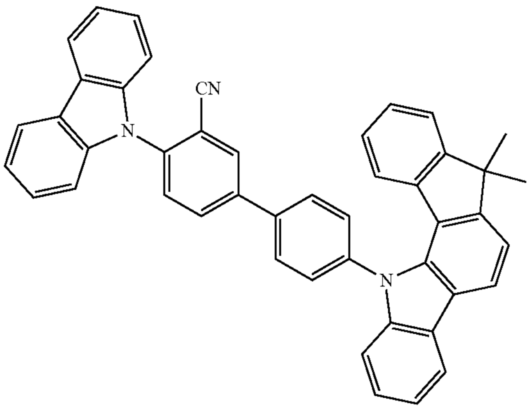
51
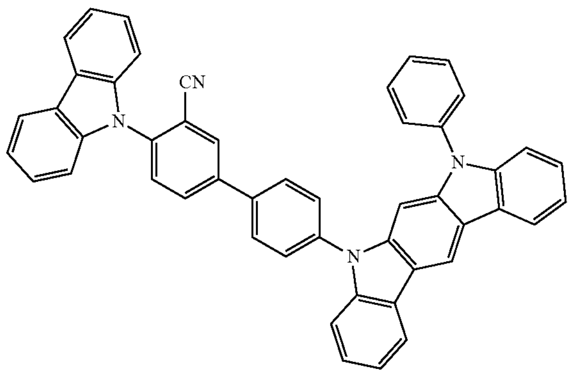
52
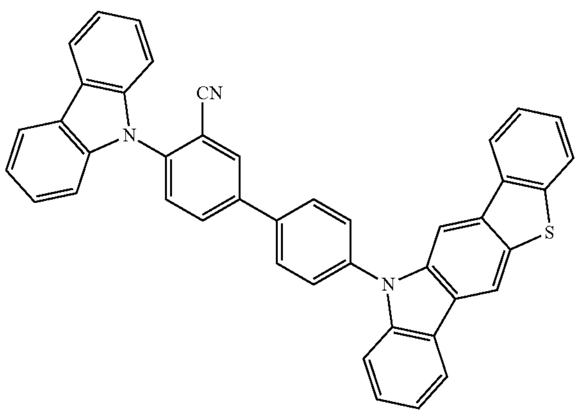
53
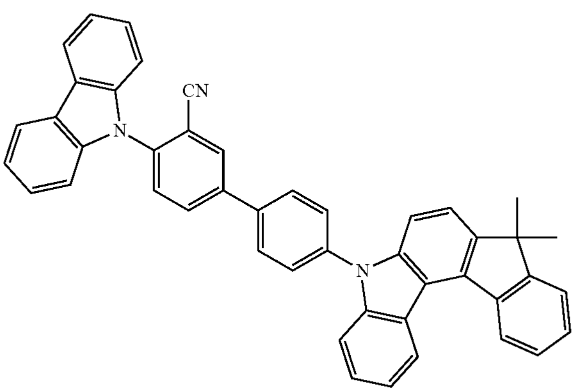
54
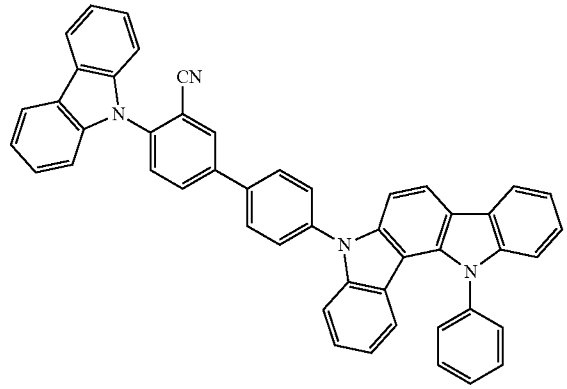
55
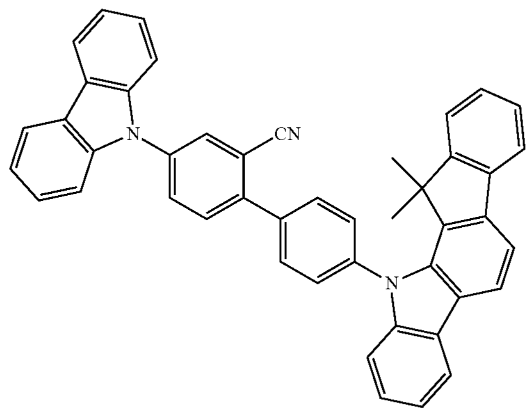
56
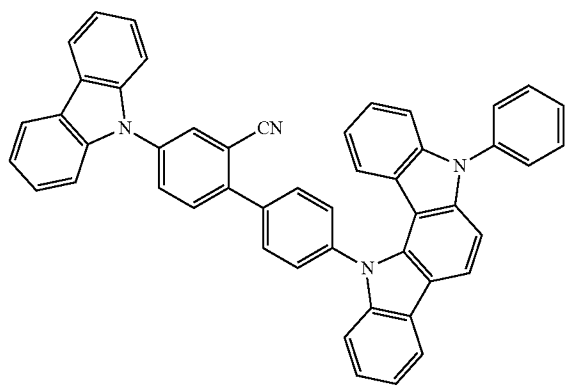
57
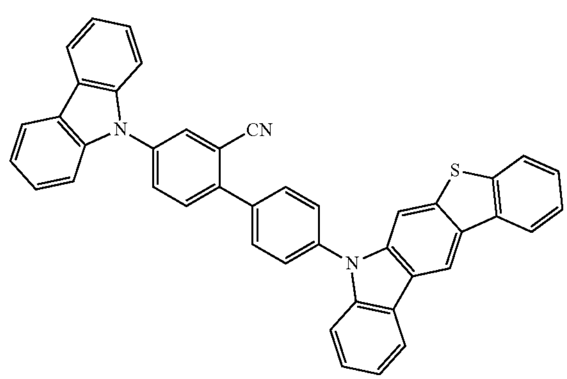

58
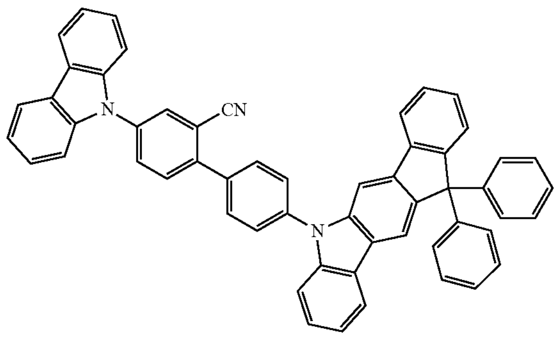
59
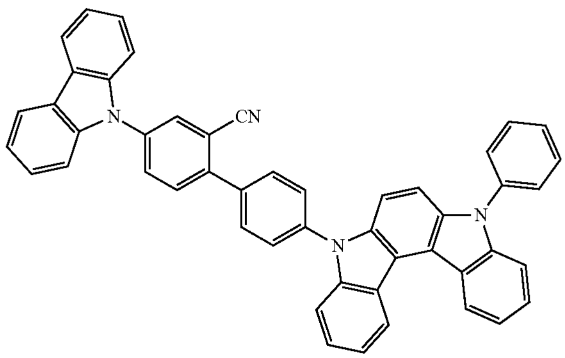
60
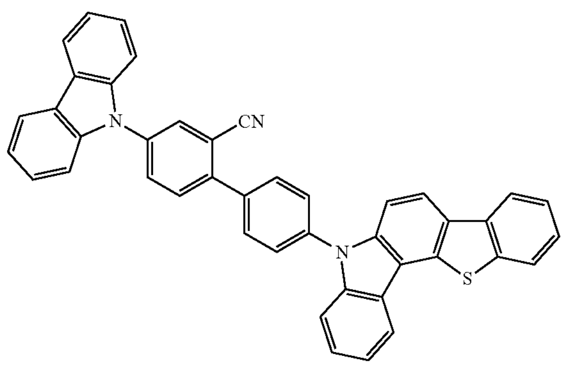
61
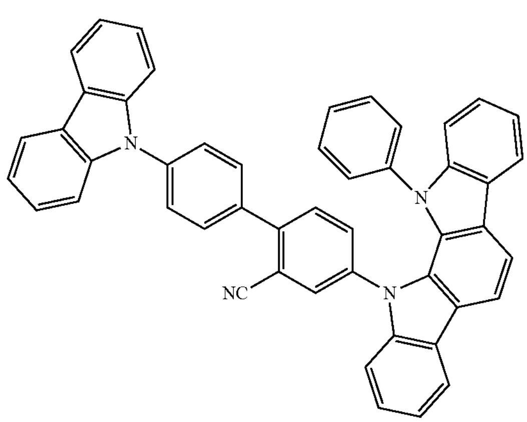
62
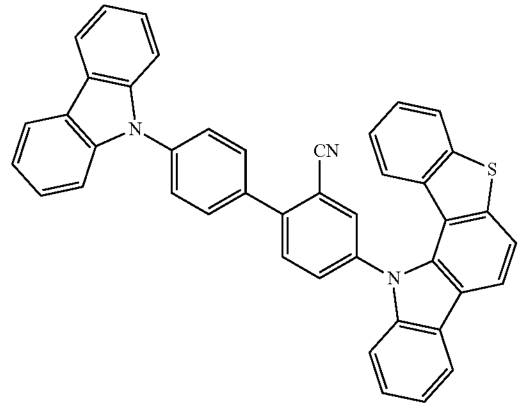
63
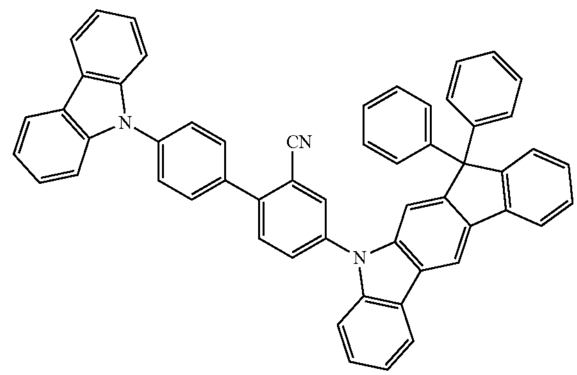
64
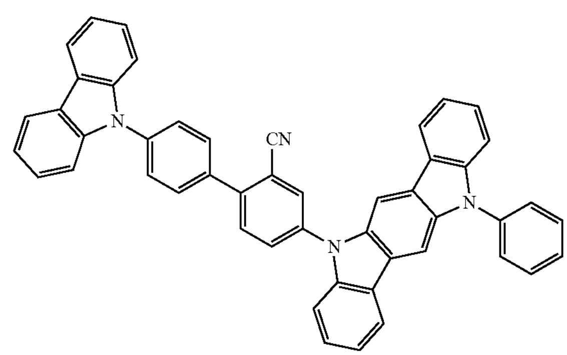
65
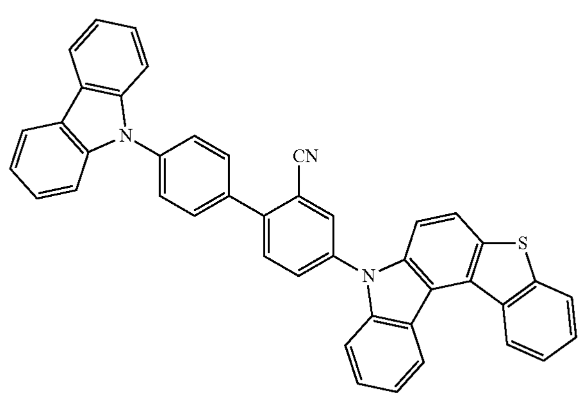

66
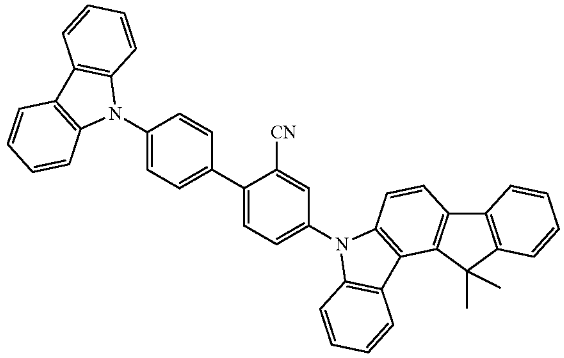
67
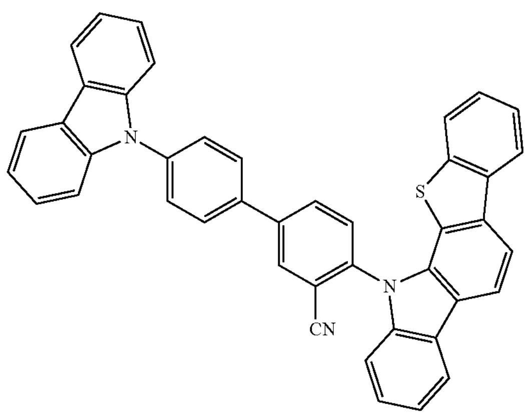
68
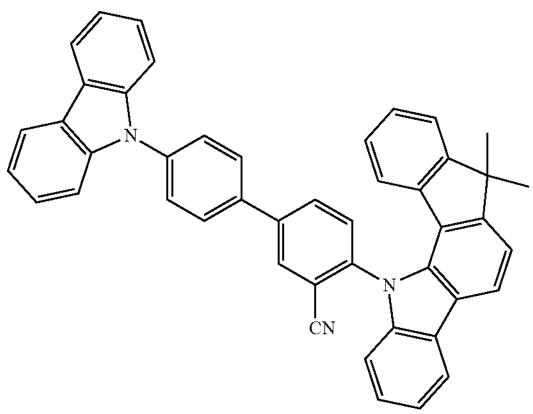
69
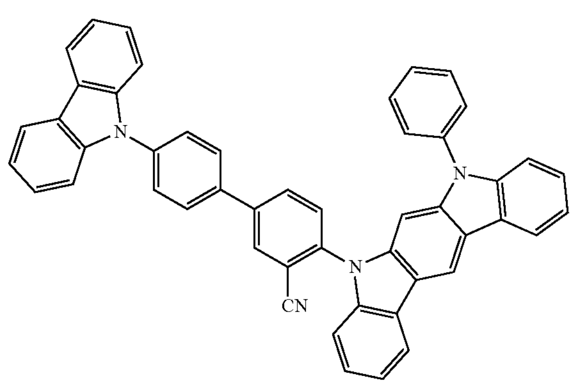
70
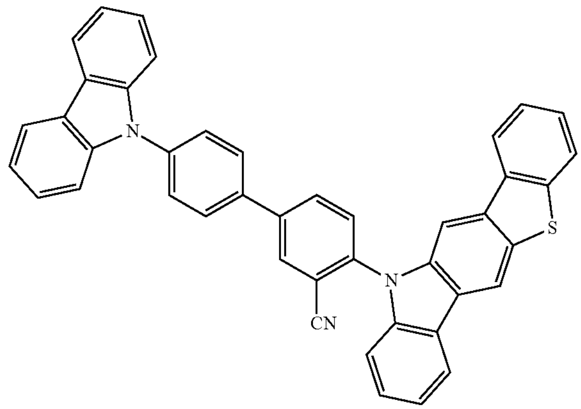
71
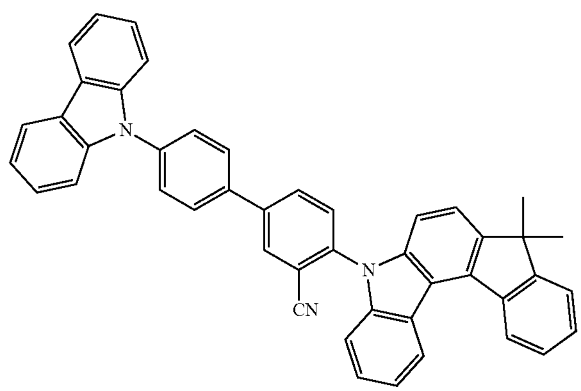
72
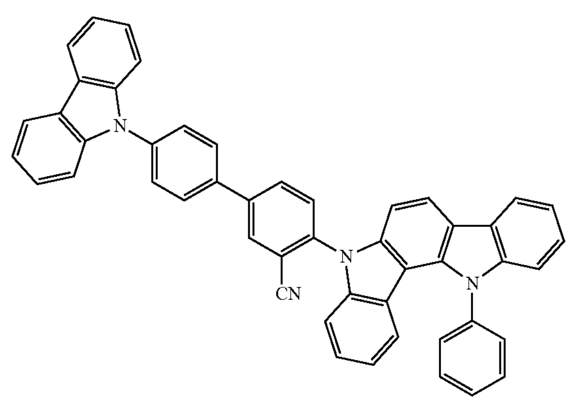

-continued
73
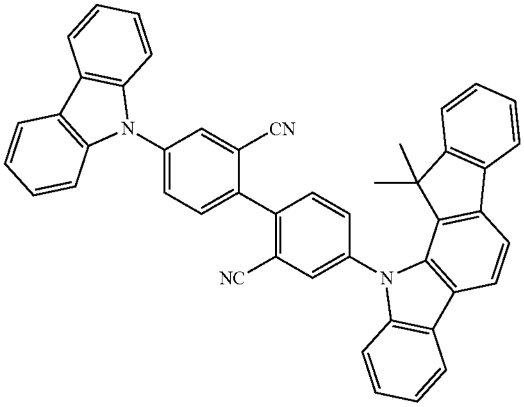
74
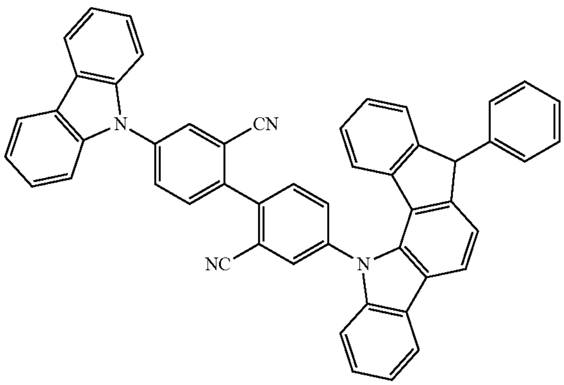
75
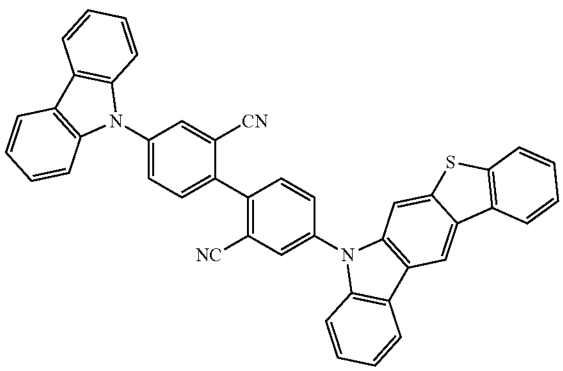
76
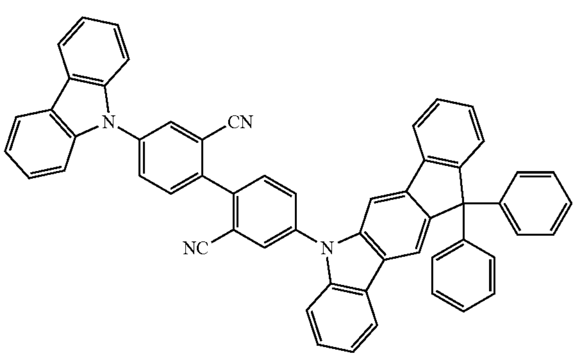
-continued
77
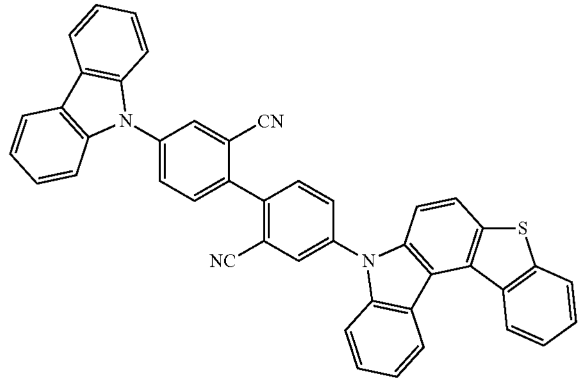
78
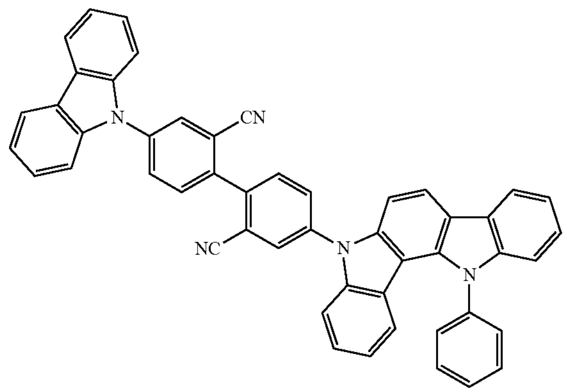
79
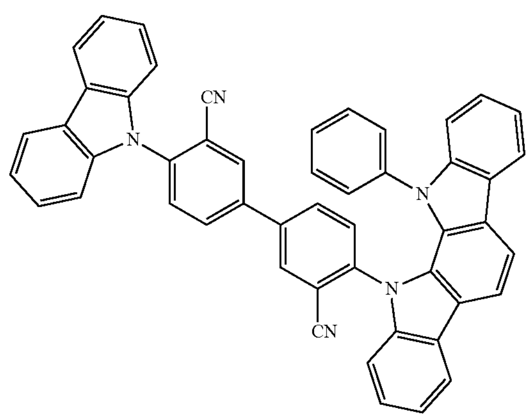

-continued
80
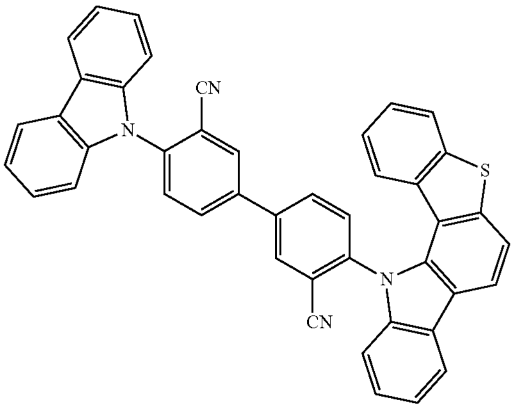
81
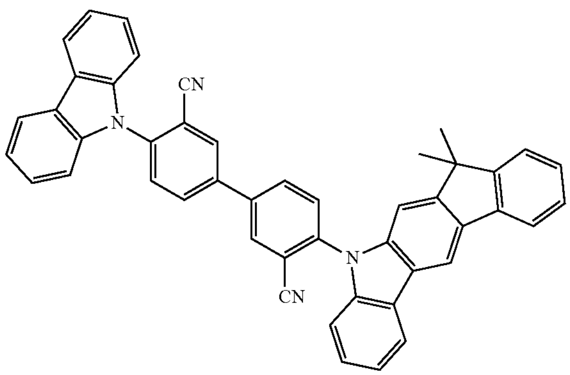
82
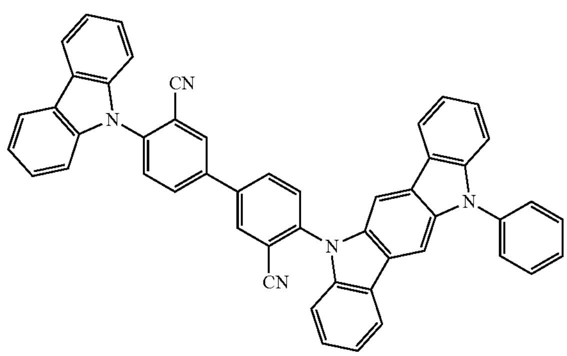
83
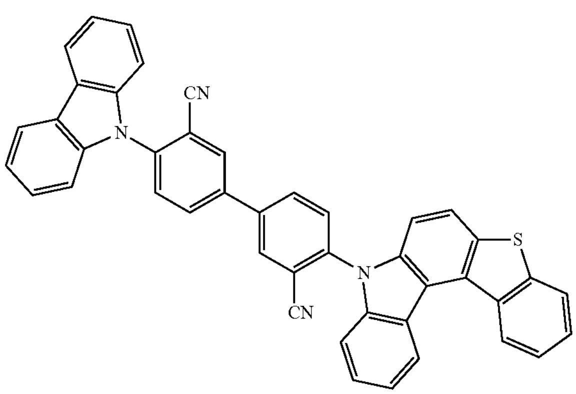
-continued
84
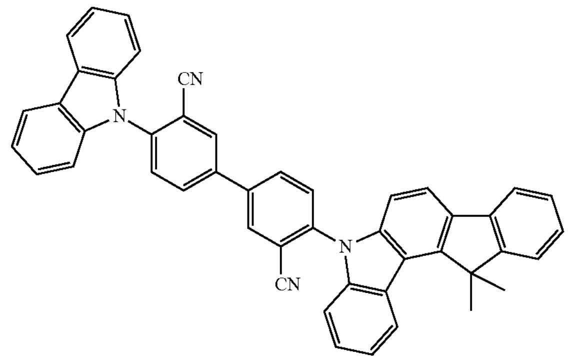
85
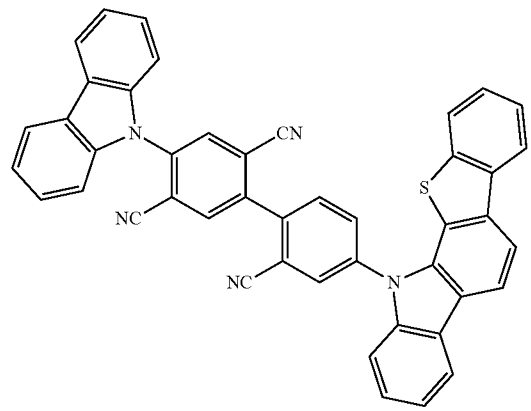
86
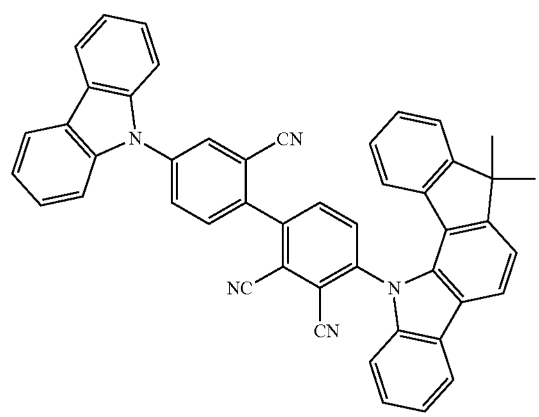
87
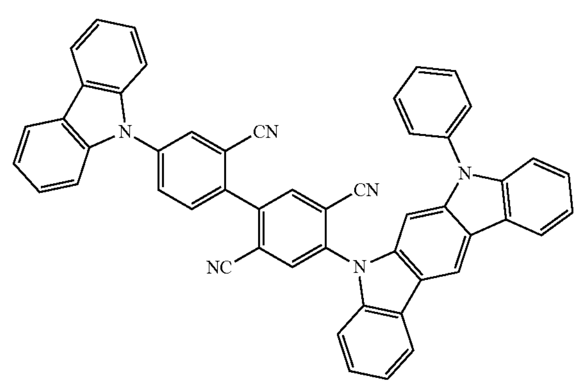

-continued
88
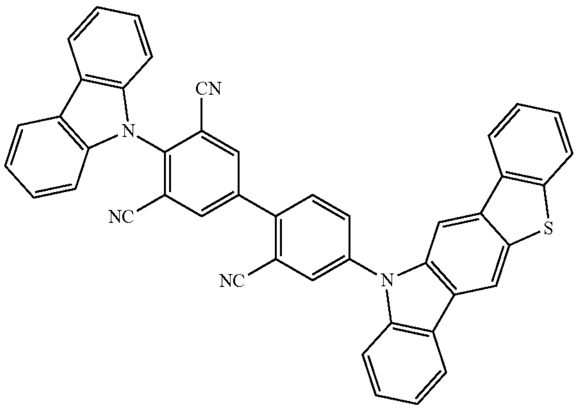
89
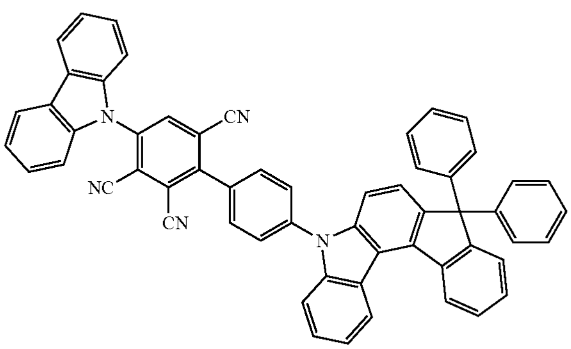
90
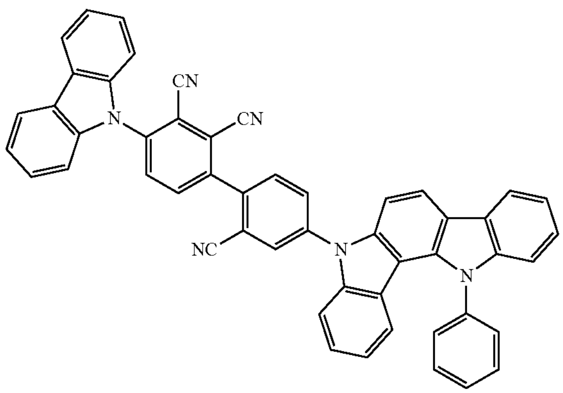
91
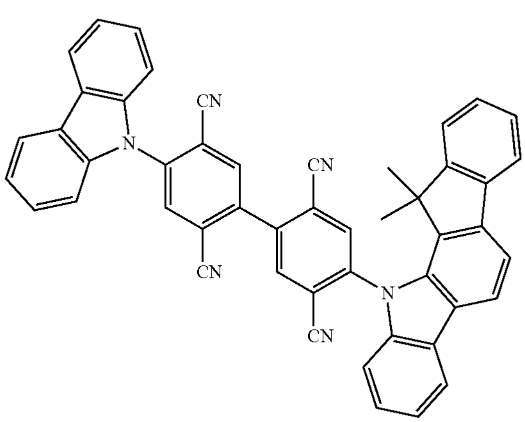
-continued
92
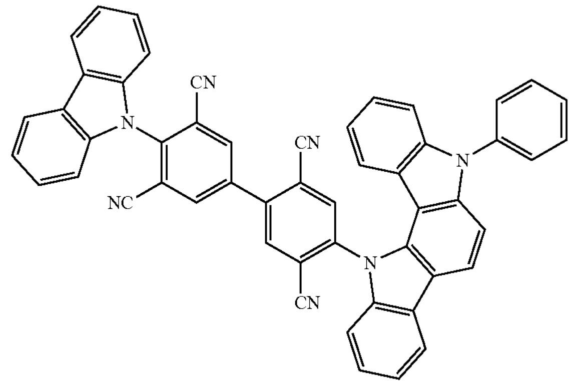
93
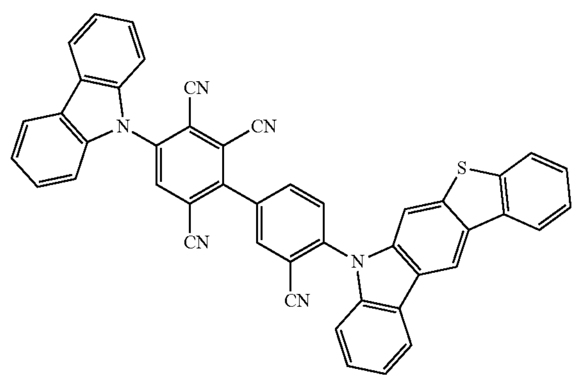
94
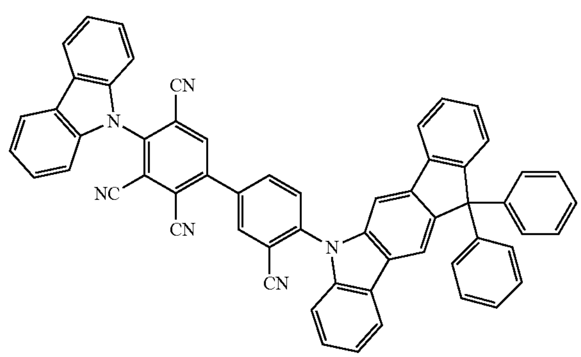
95
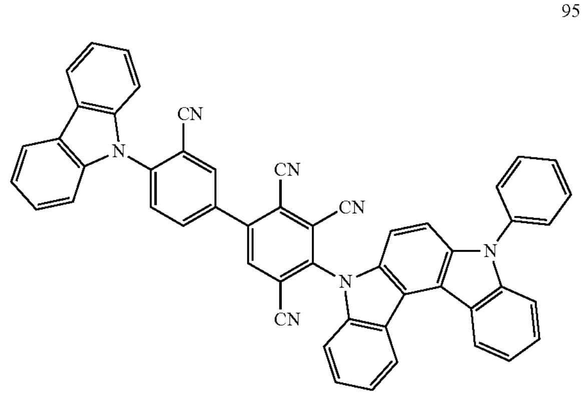

-continued
96
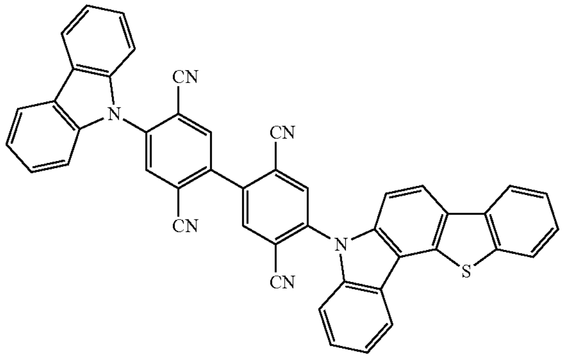
97
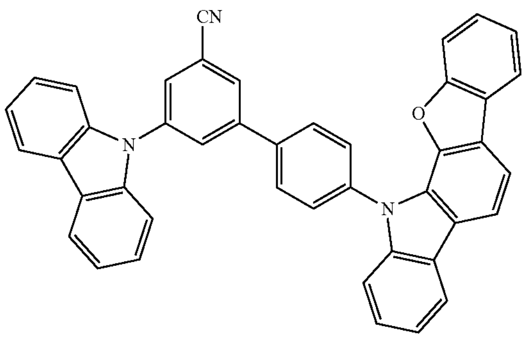
98
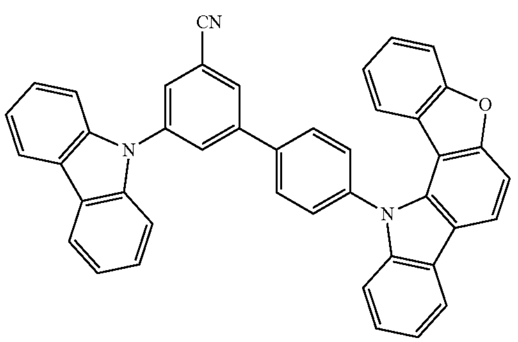
99
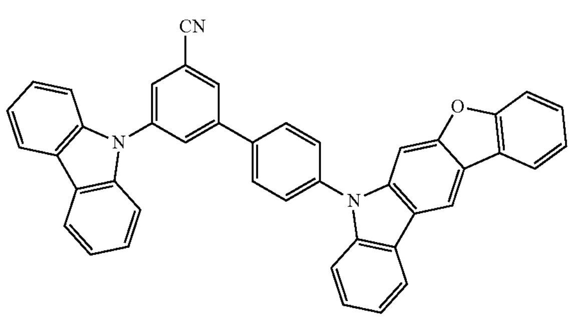
-continued
100
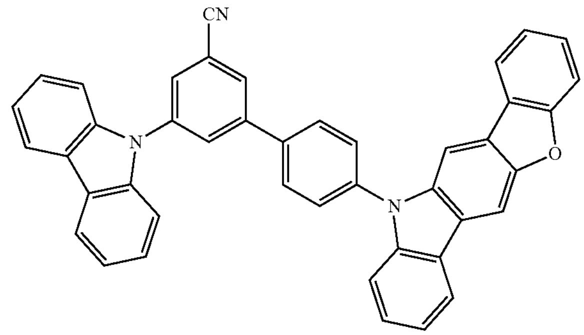
101
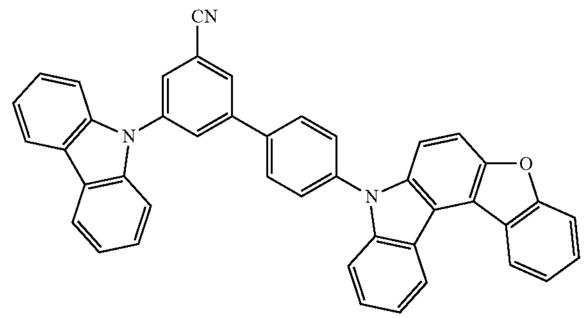
102
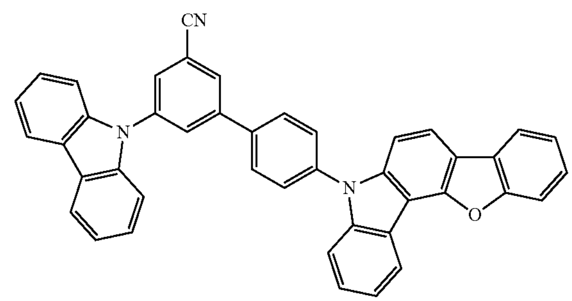
103
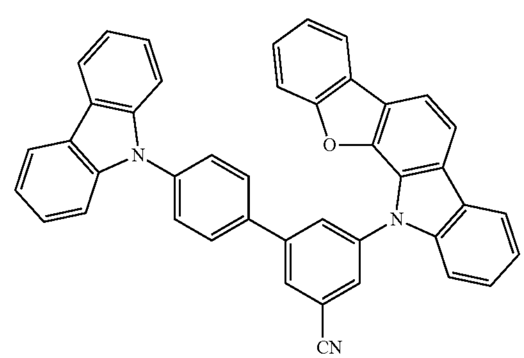

-continued
104
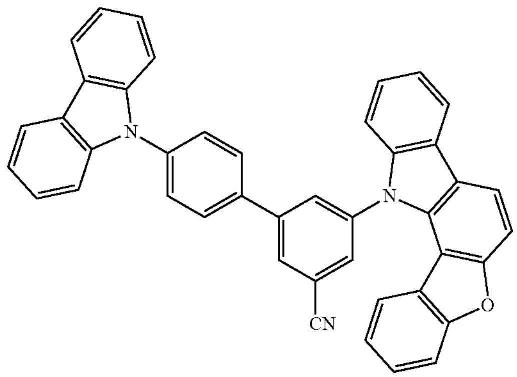
105
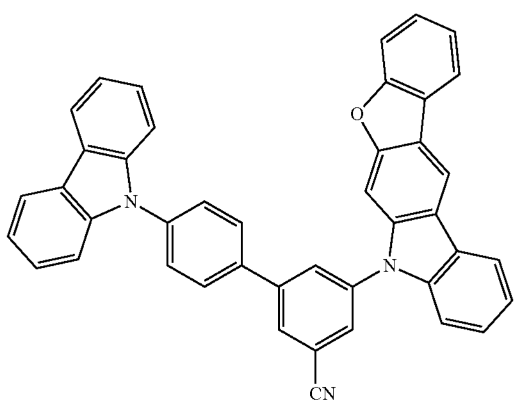
106
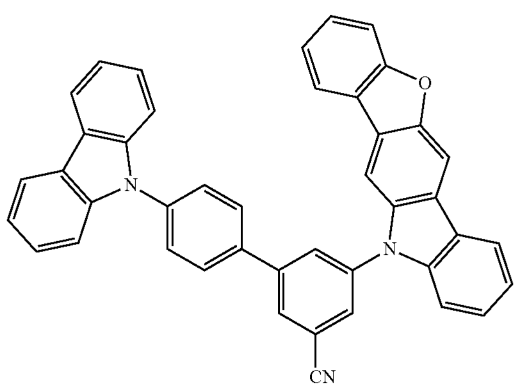
107
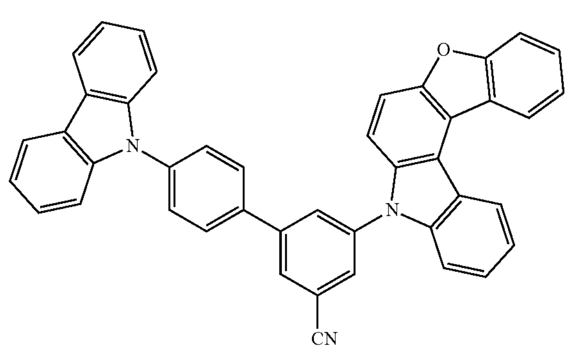
-continued
108
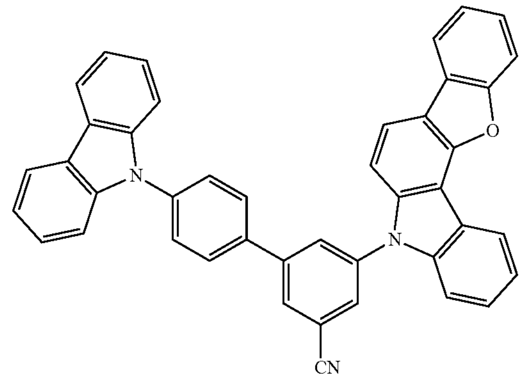
109
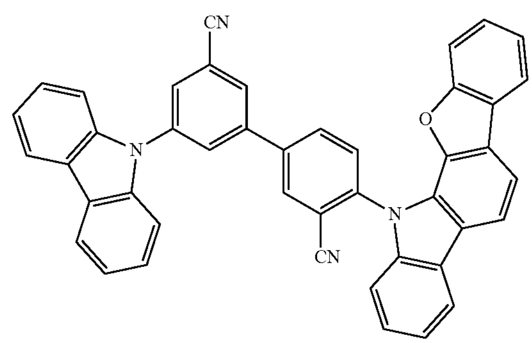
110
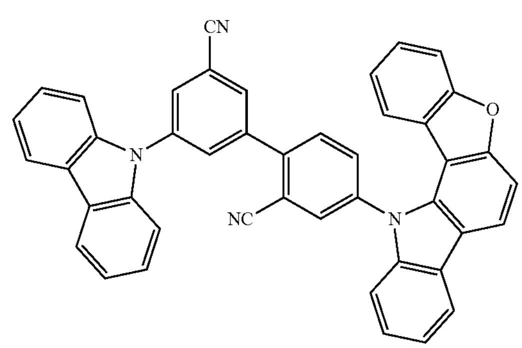
111
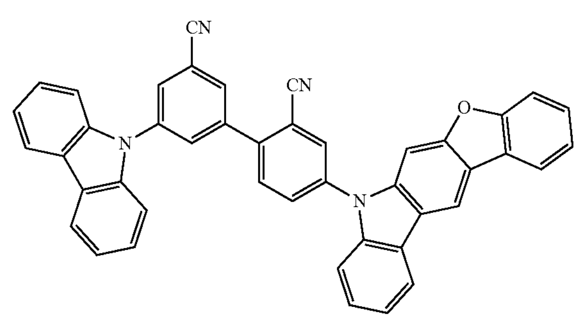

-continued
112
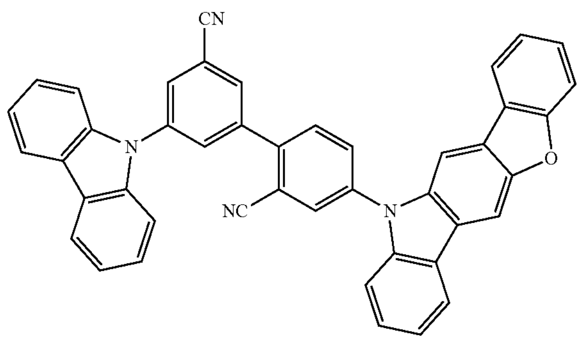
113
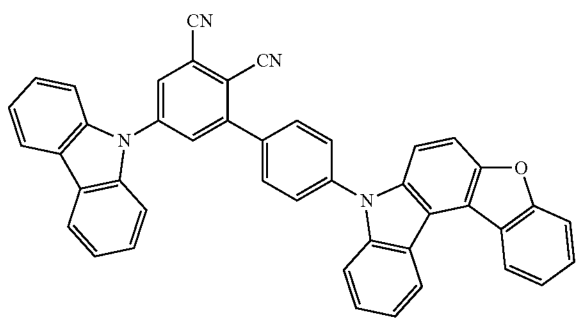
114
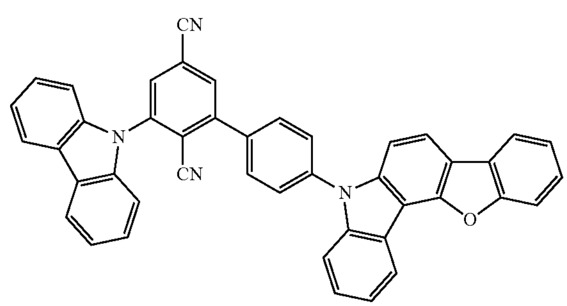
115
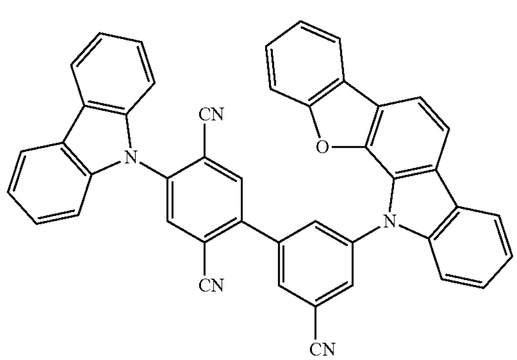
-continued
116
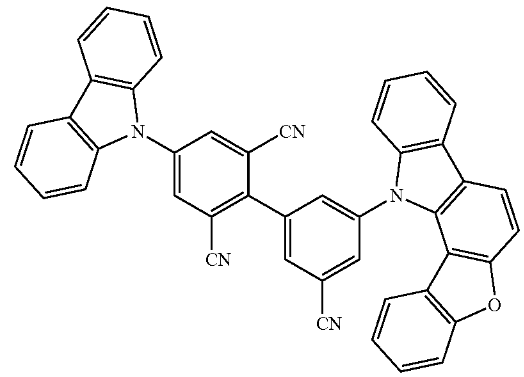
117
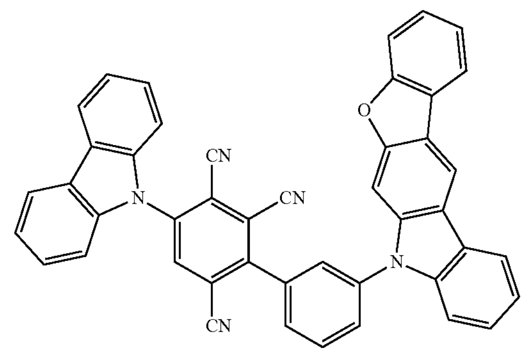
118
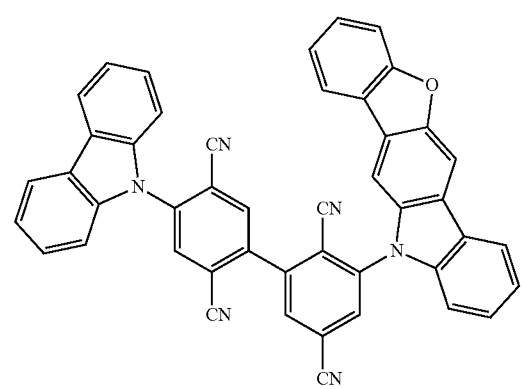
119
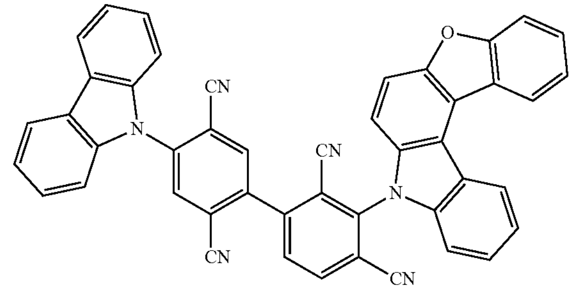

-continued
120
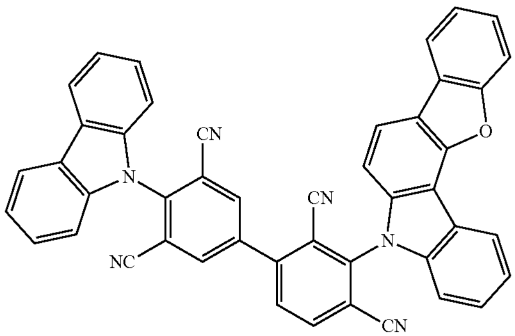
121
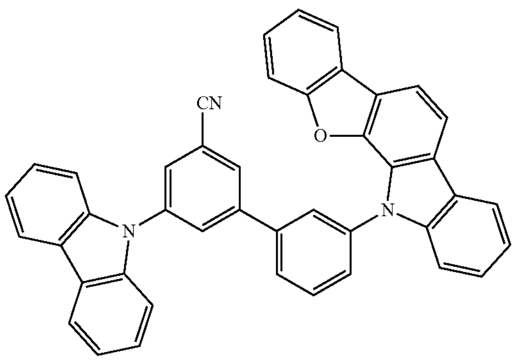
122
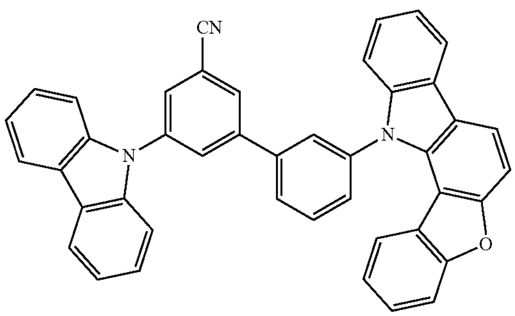
123
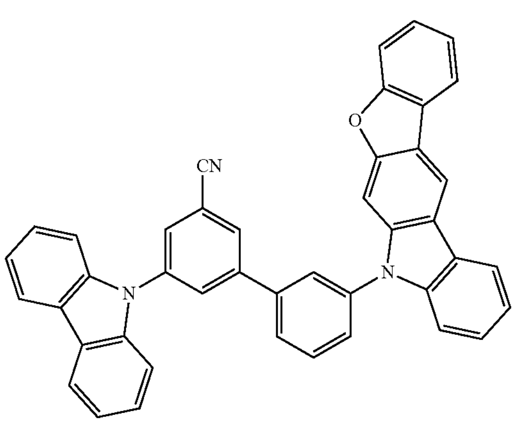
-continued
124
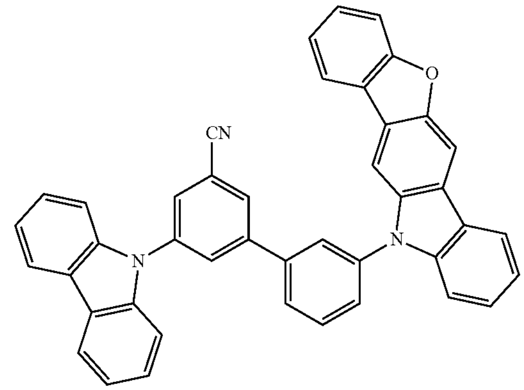
125
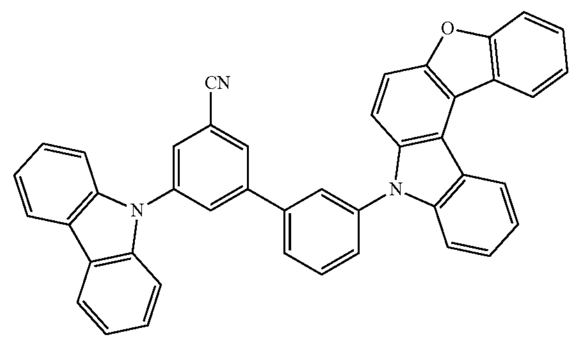
126
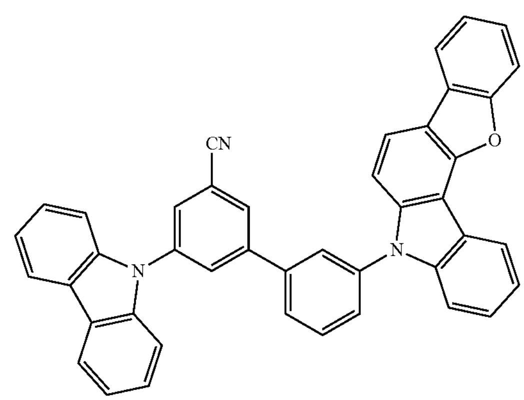
127
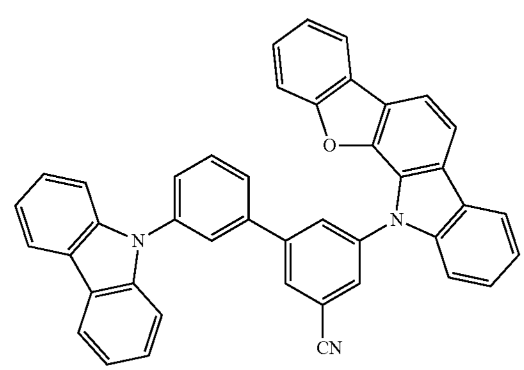

-continued
128
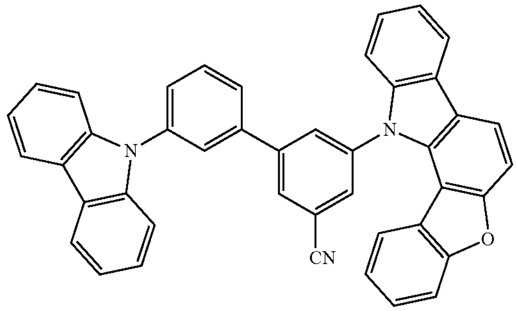
129
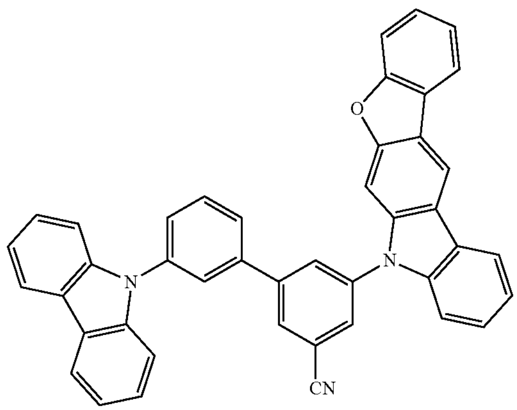
130
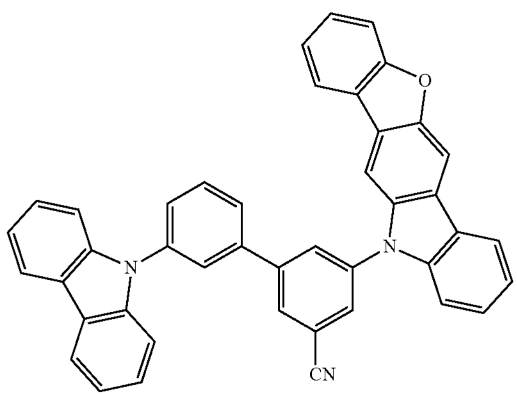
131
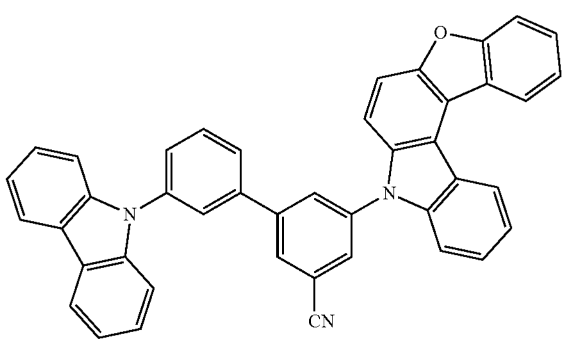
-continued
132
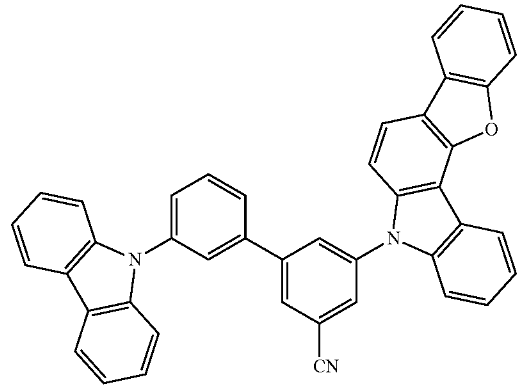
133
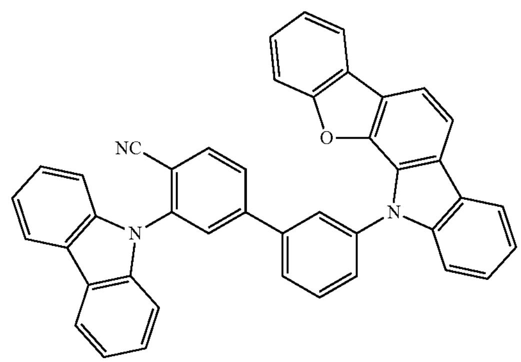
134
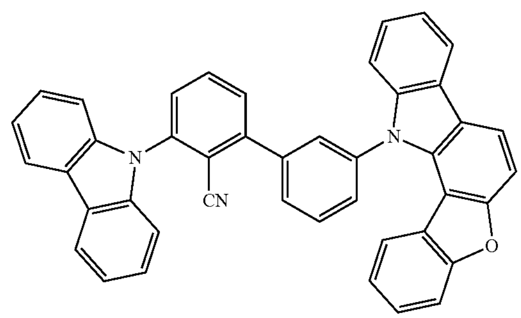
135
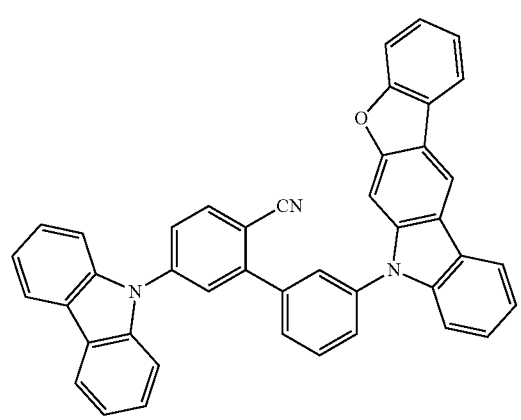

-continued
136
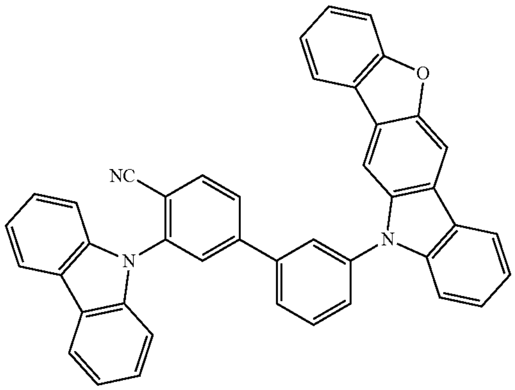
137
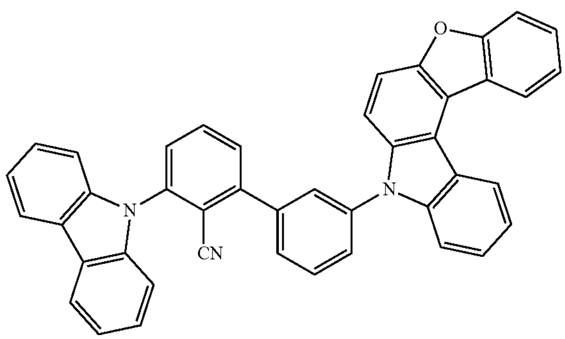
138
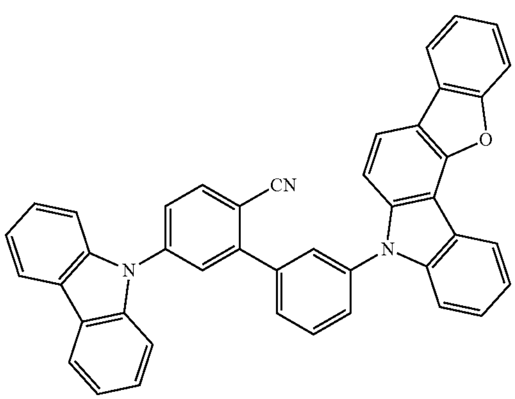
139
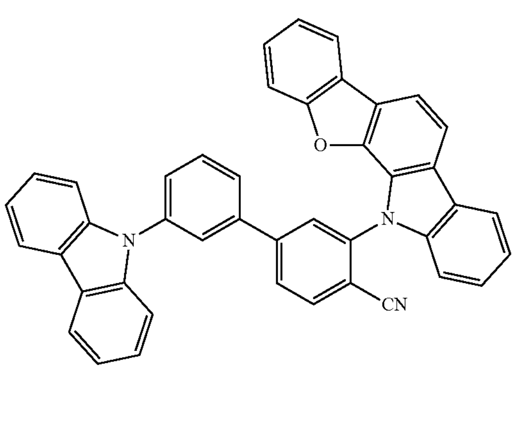
-continued
140
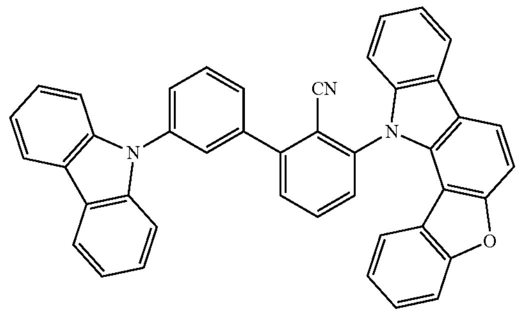
141
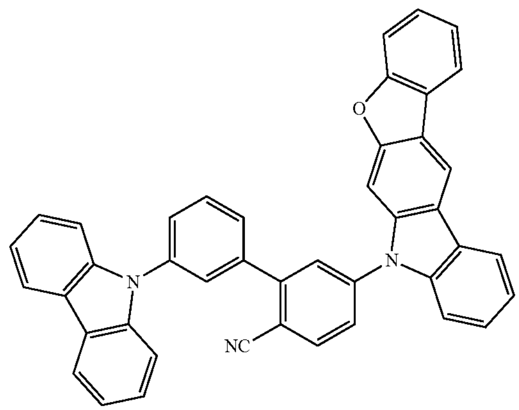
142
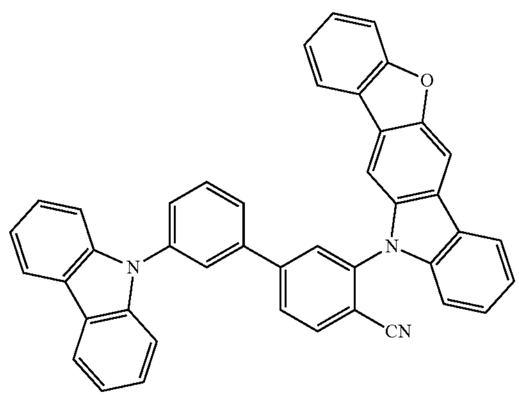
143
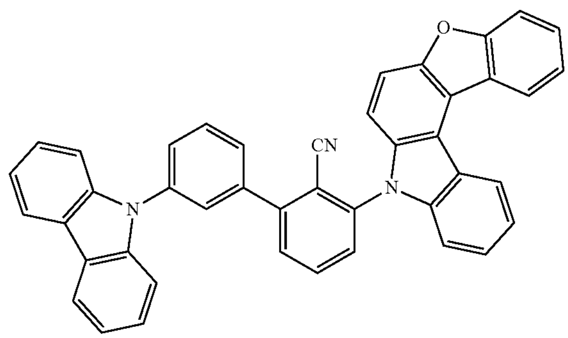

-continued
144
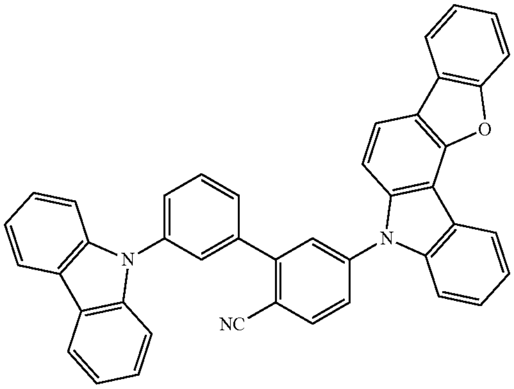
145
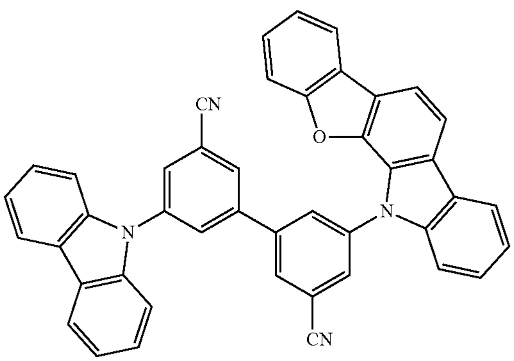
146
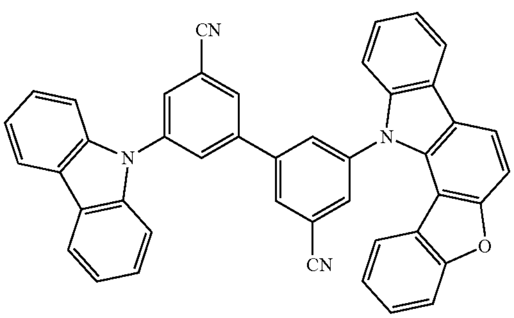
147
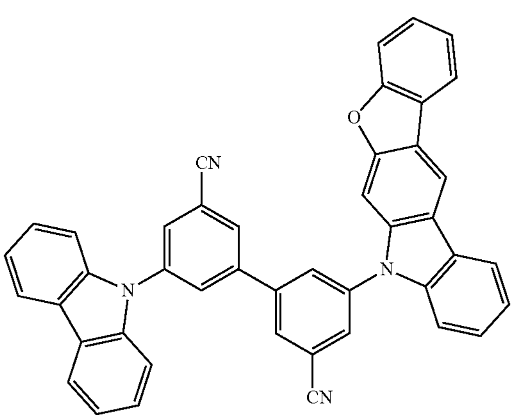
-continued
148
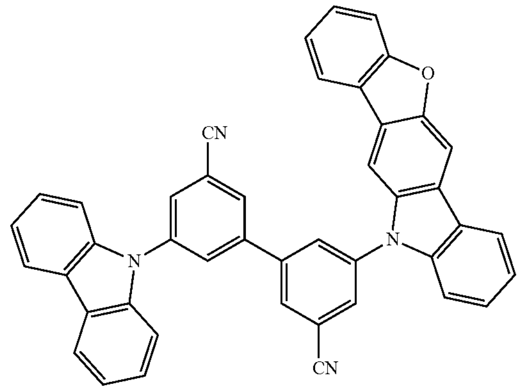
149
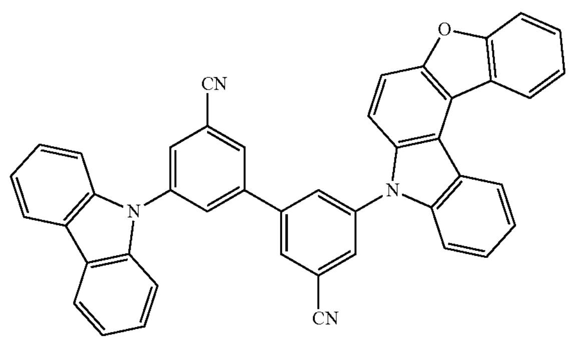
150
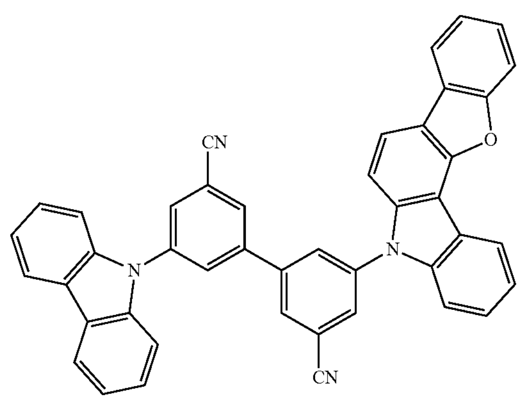
151
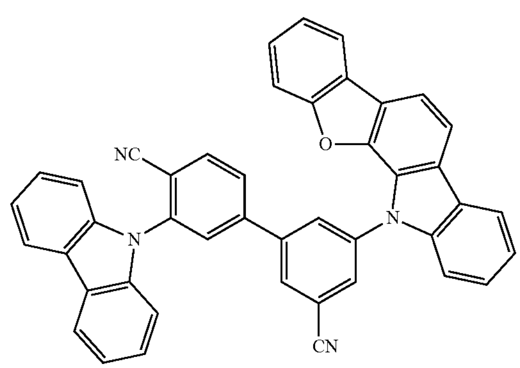

-continued
152
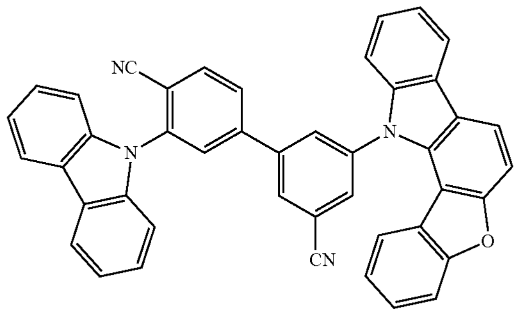
153
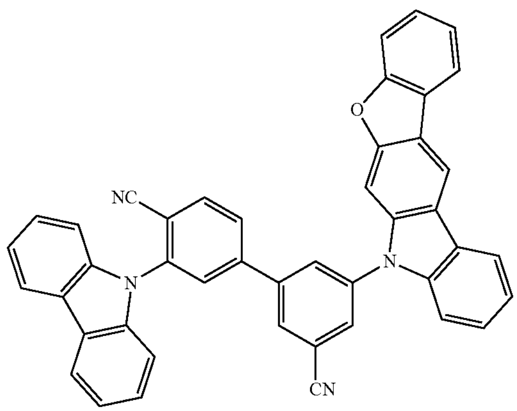
154
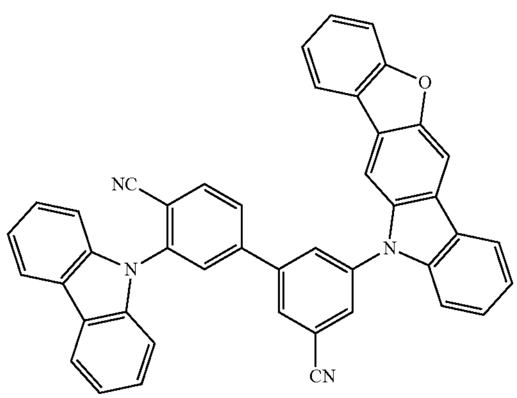
155
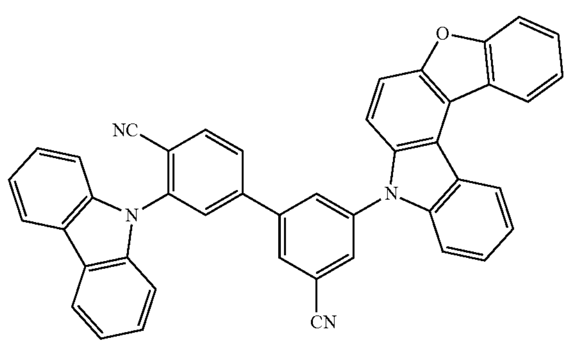
-continued
156
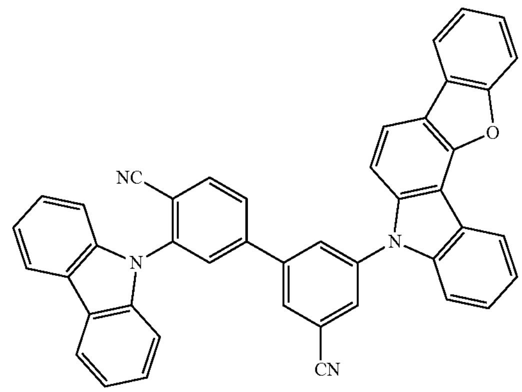
157
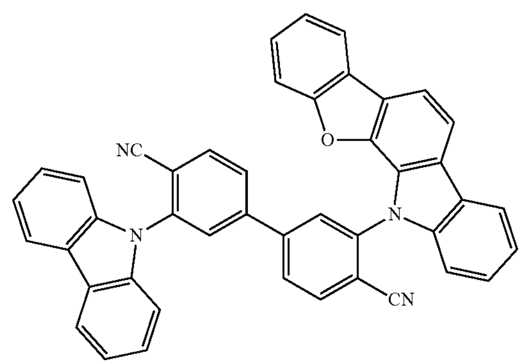
158
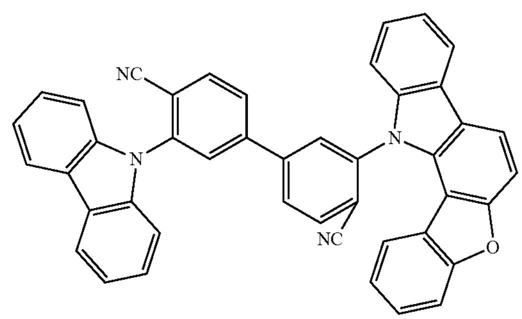
159
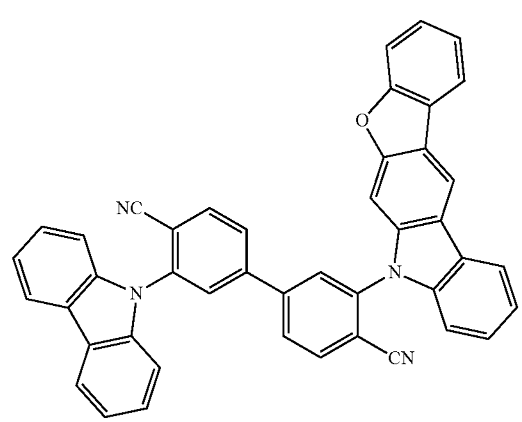

-continued
160
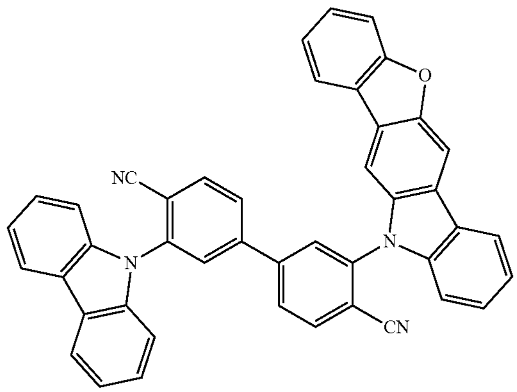
161
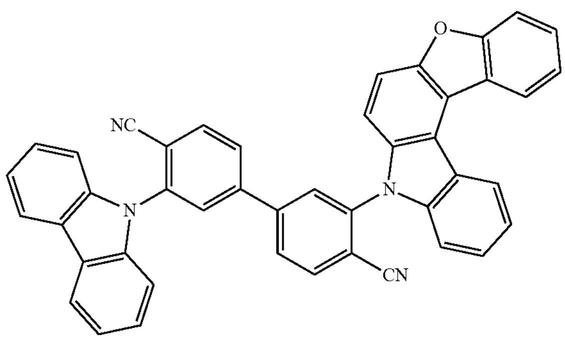
162
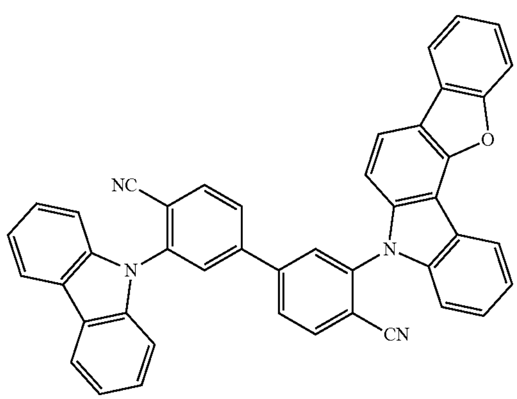
163
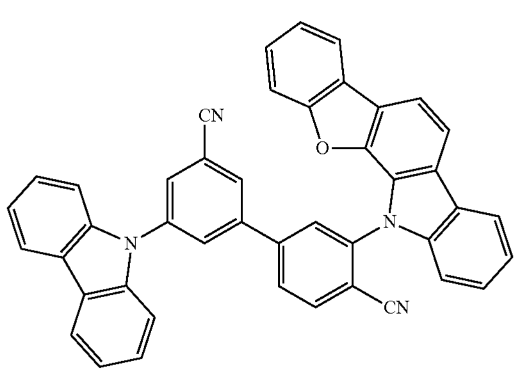
-continued
164
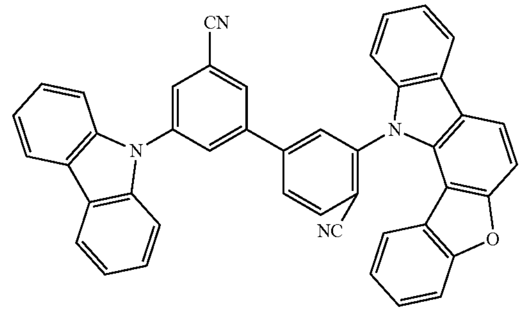
165
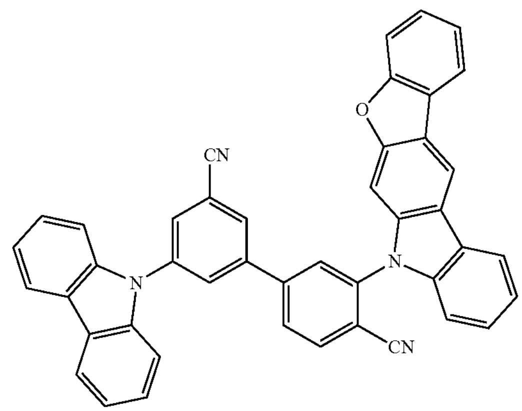
166
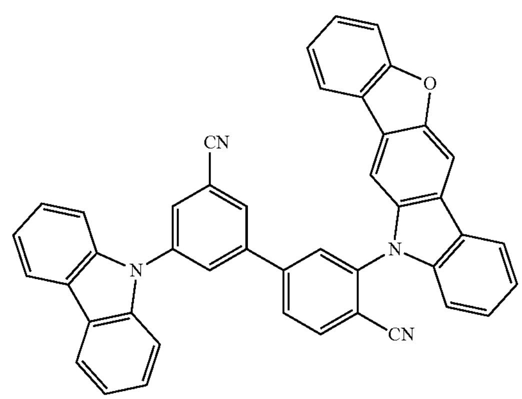
167
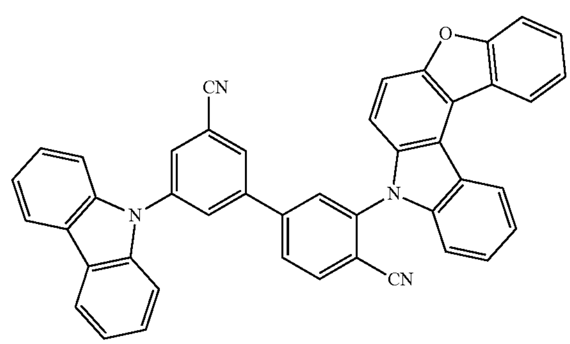

-continued
168
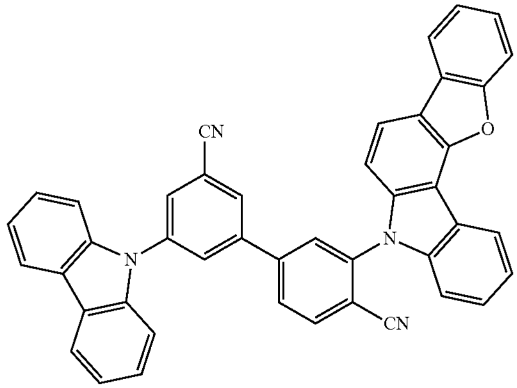
169
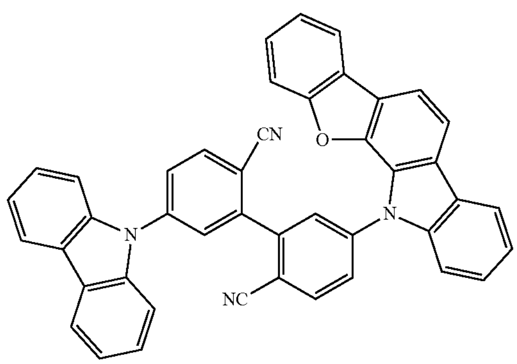
170
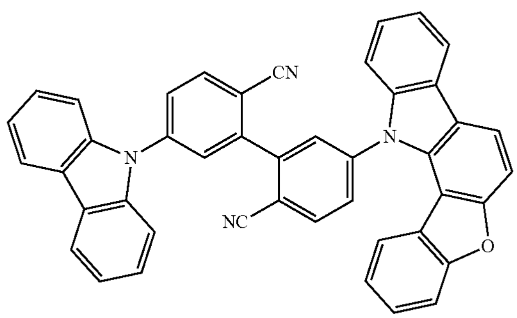
171
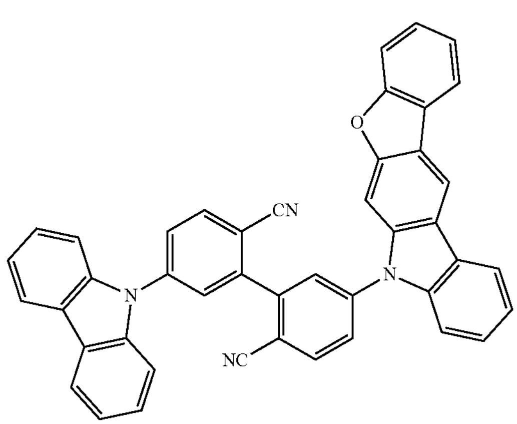
-continued
172
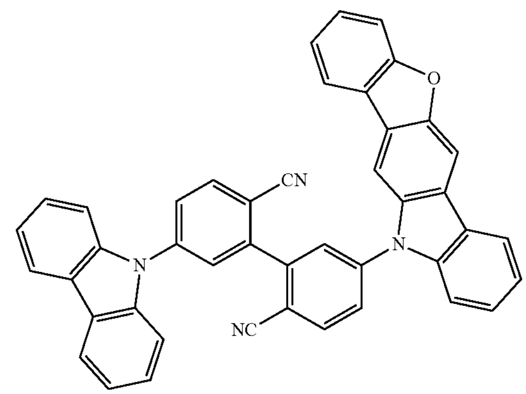
173
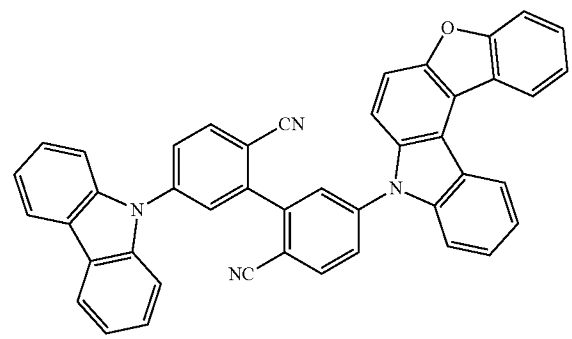
174
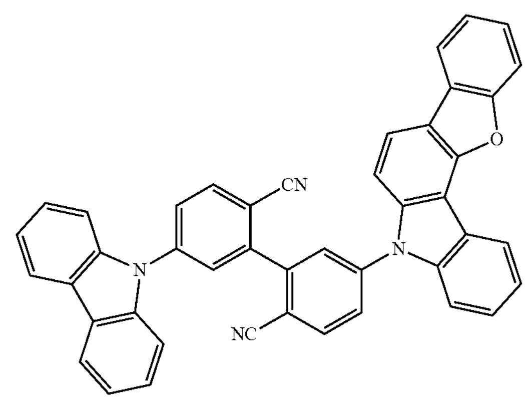
175
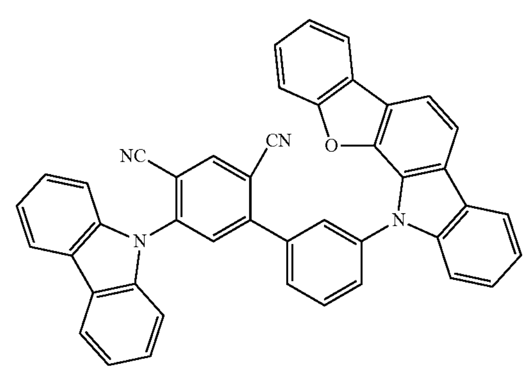

-continued
176
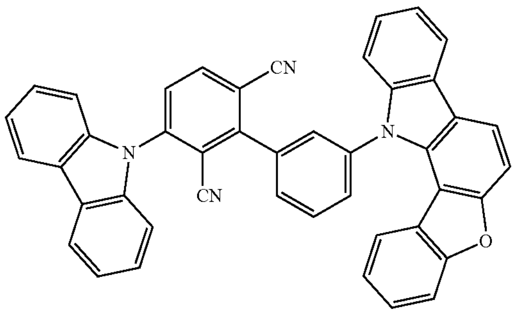
177
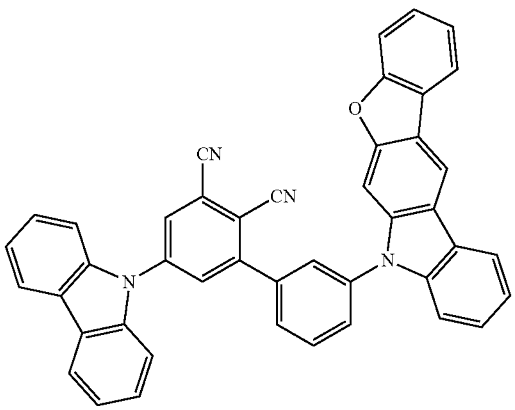
178
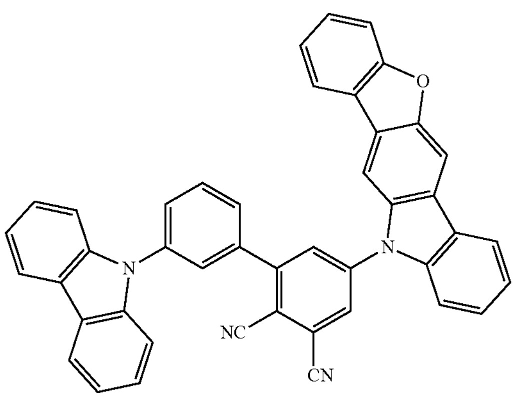
179
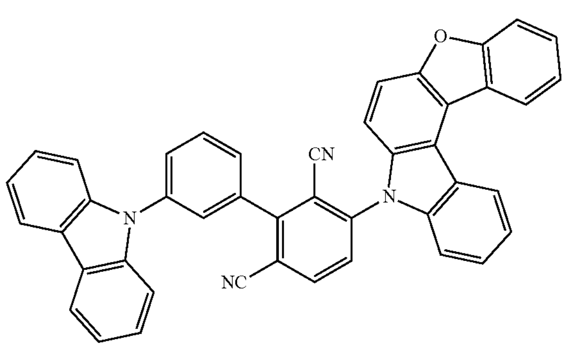
-continued
180
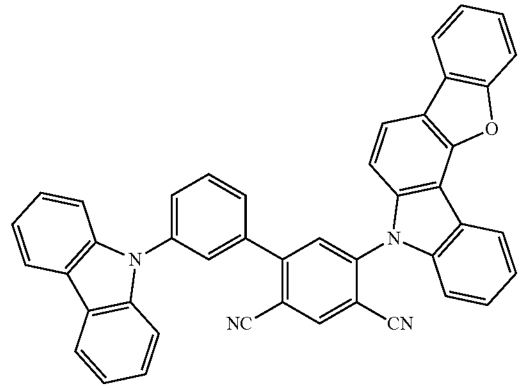
181
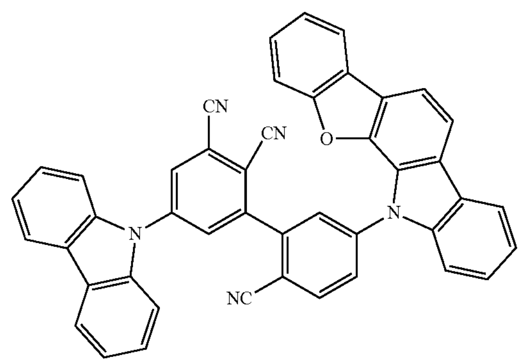
182
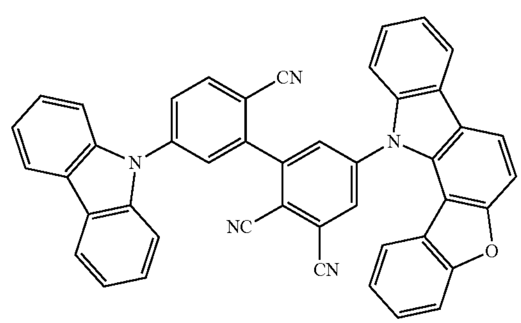
183
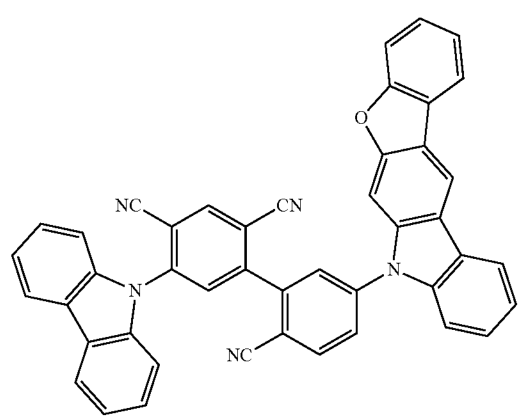

-continued
184
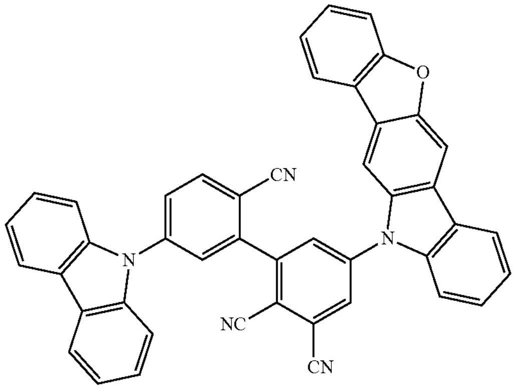
185
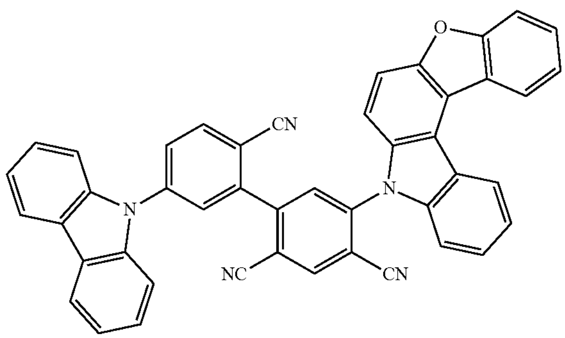
186
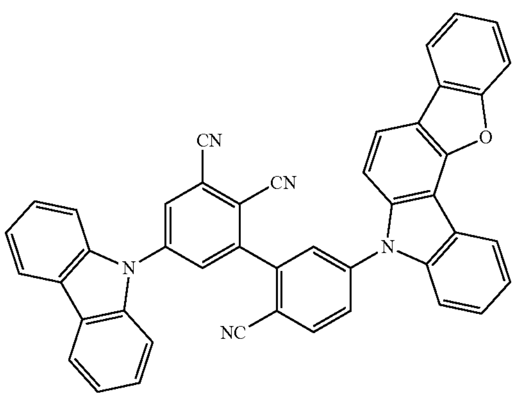
187
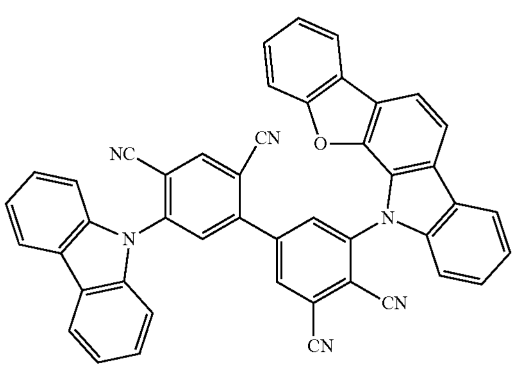
-continued
188
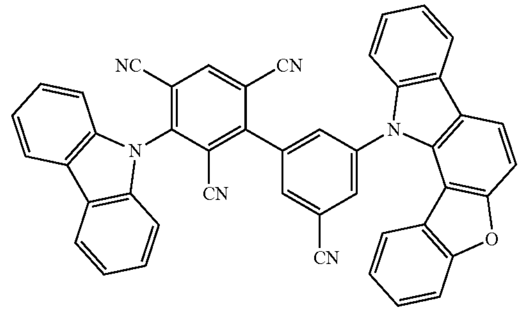
189
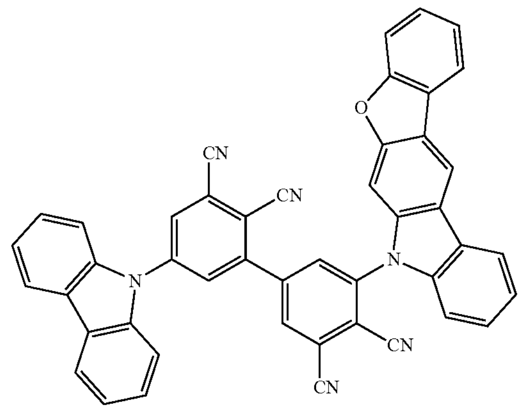
190
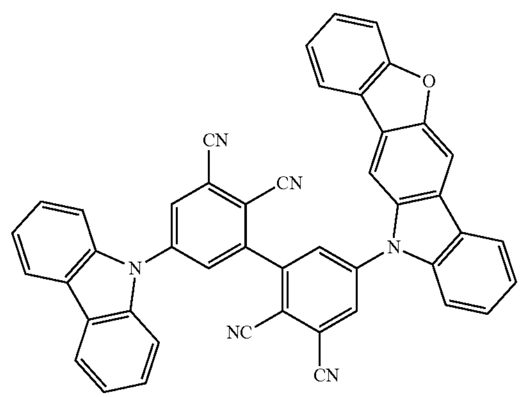
191
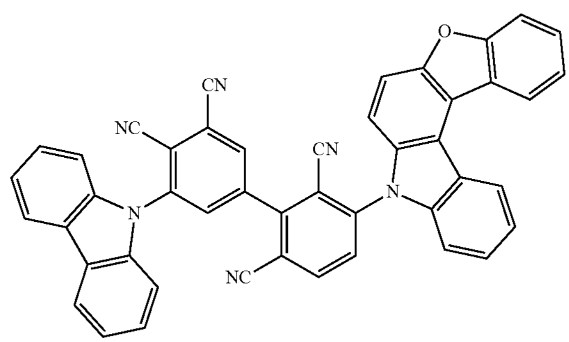

-continued
192
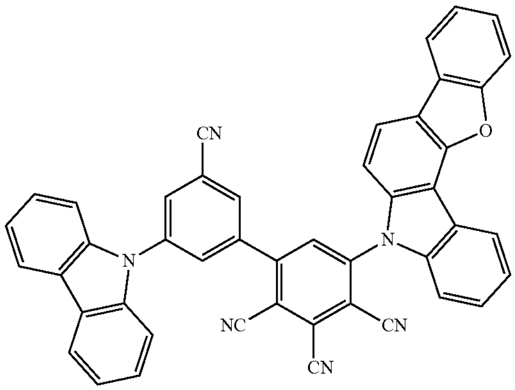
193
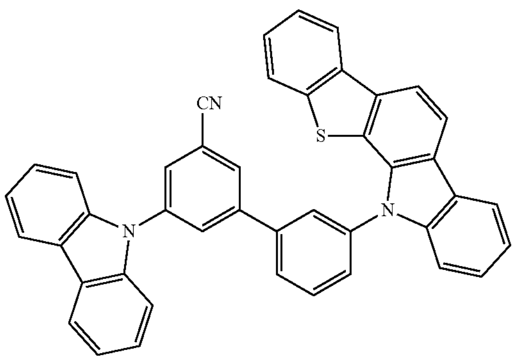
194
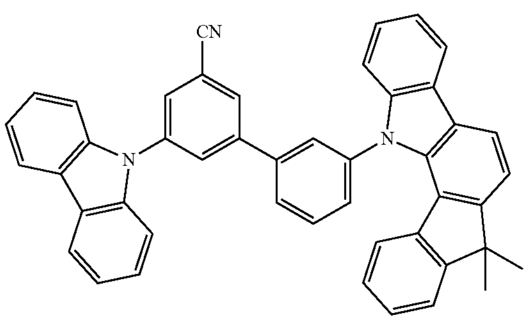
195
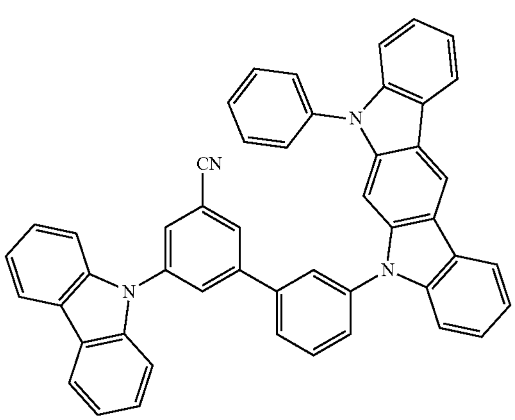
-continued
196
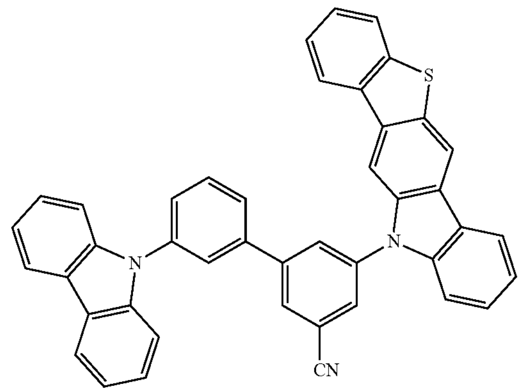
197
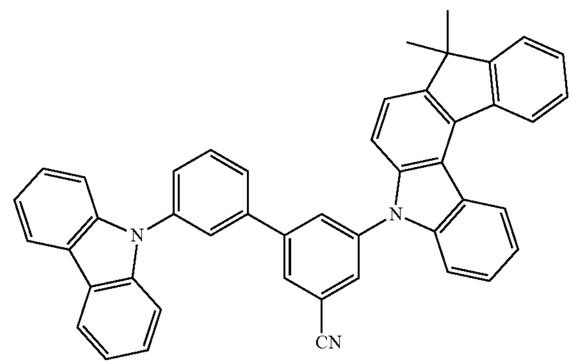
198
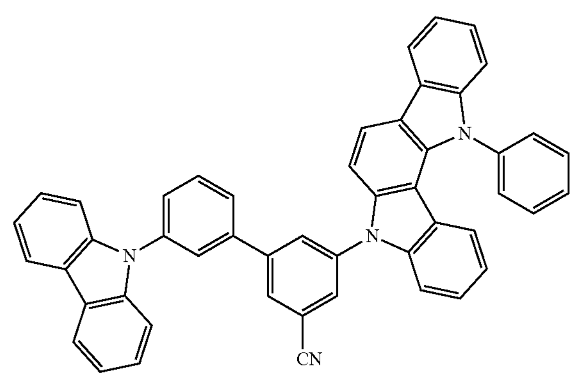
199
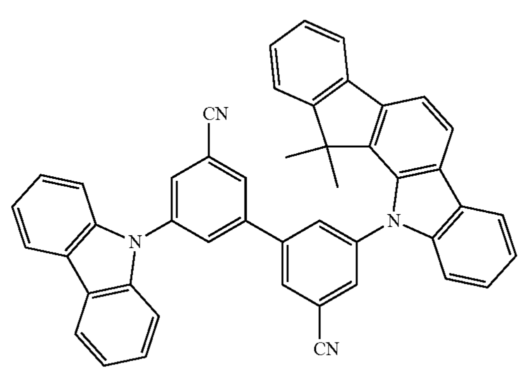

-continued
200
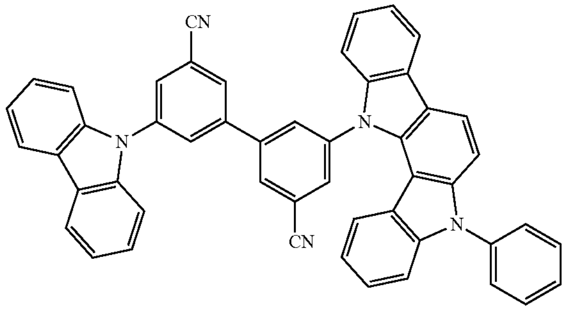
201
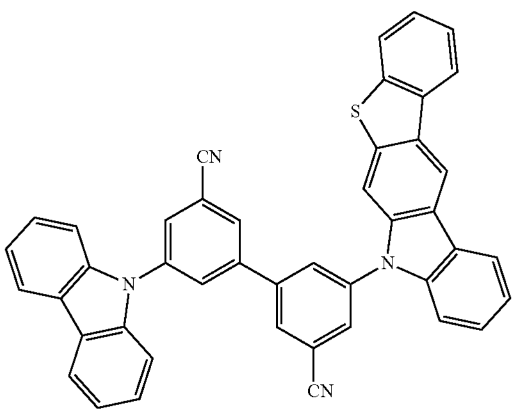
202
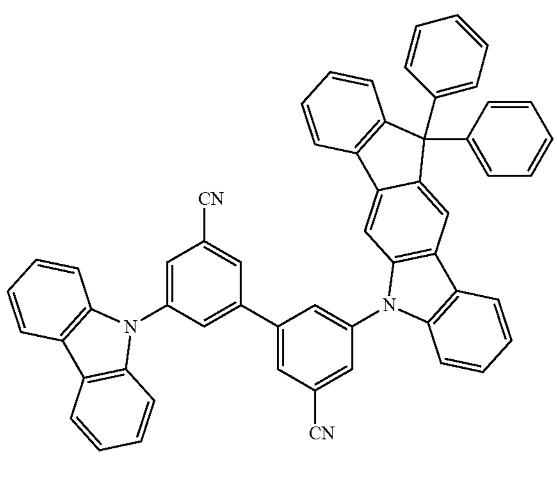
-continued
203
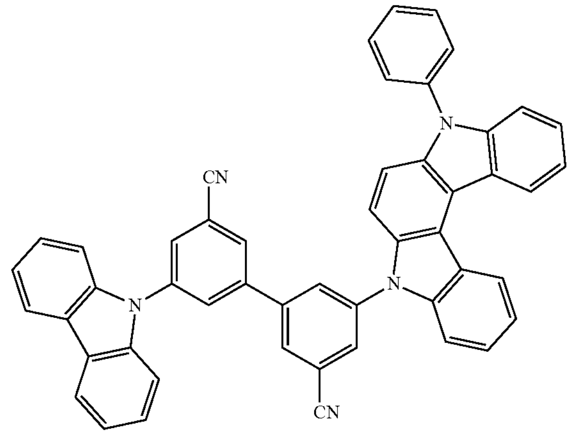
204
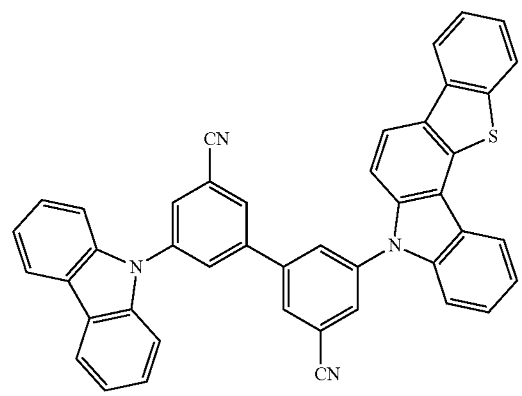
205
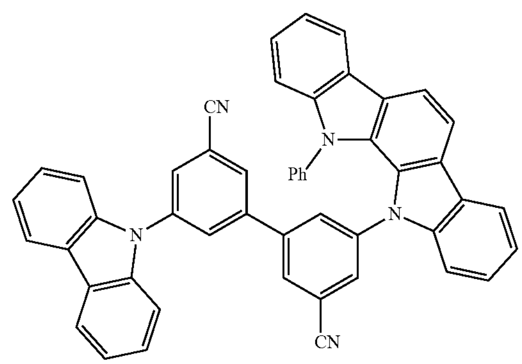
206
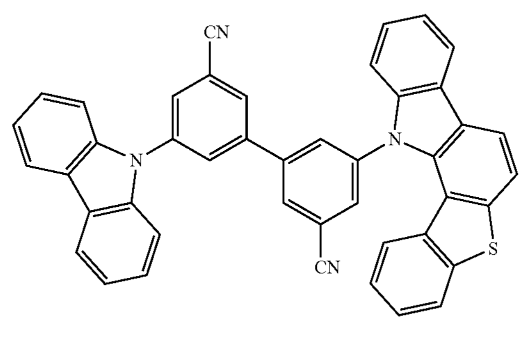

-continued
207
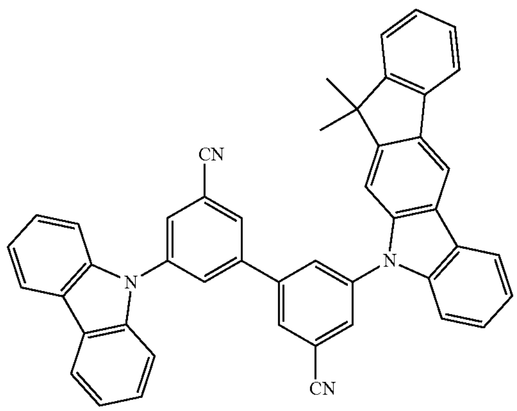
208
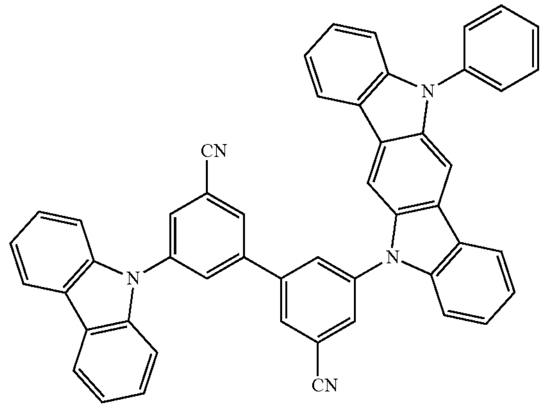
209
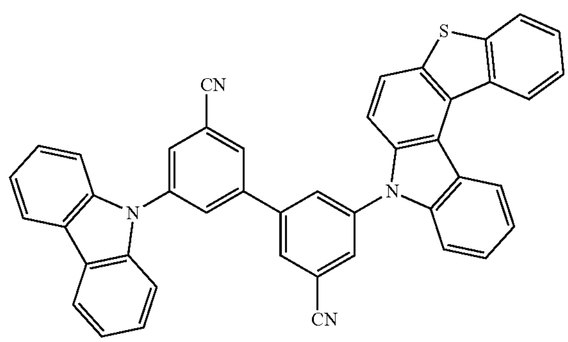
210
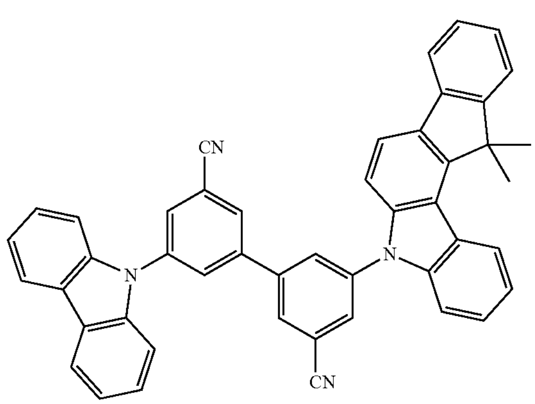
-continued
211
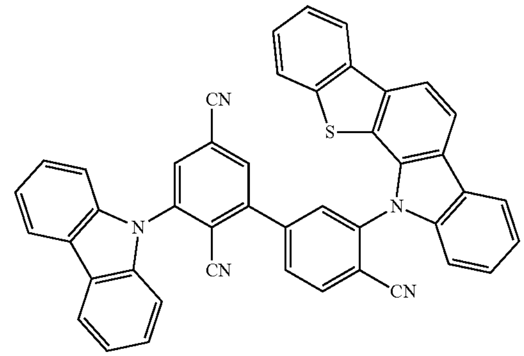
212
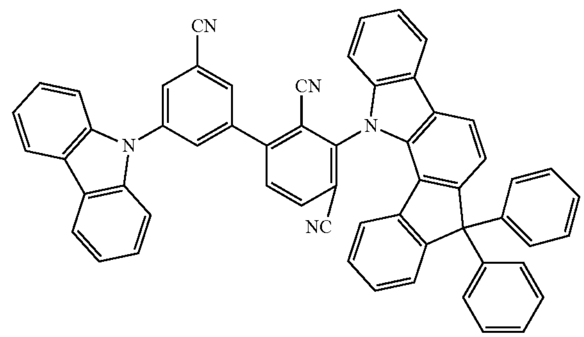
213
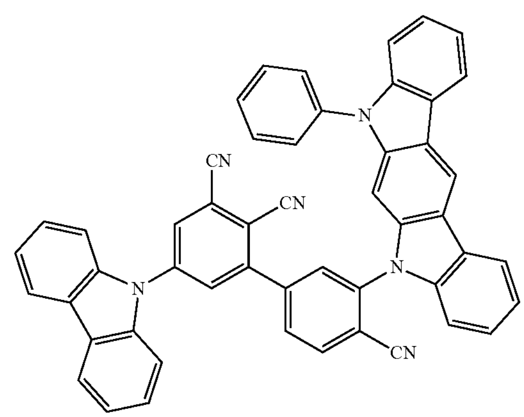
214
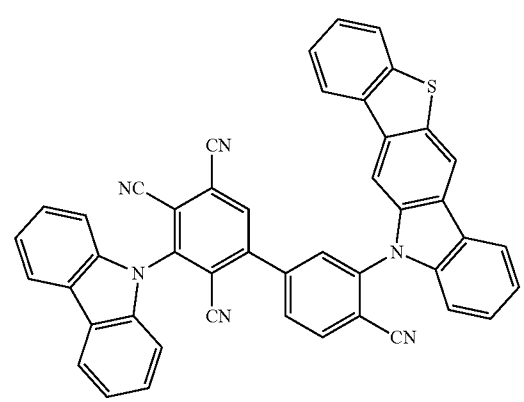

-continued
215
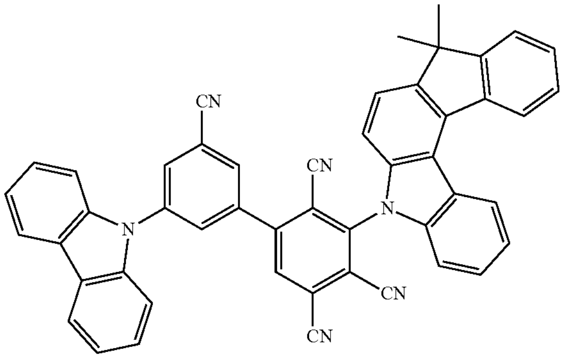
216
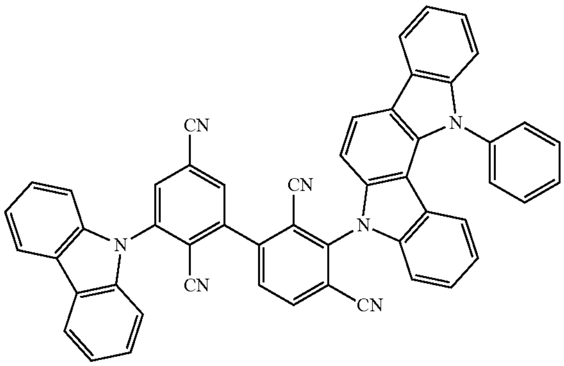
217
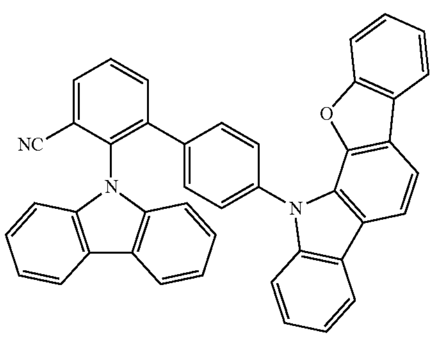
218
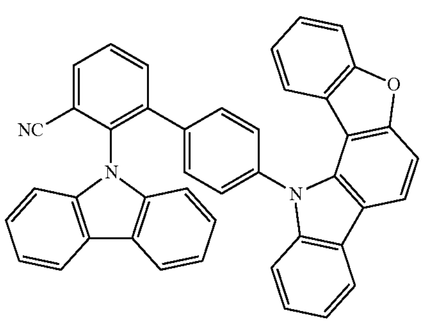
-continued
219
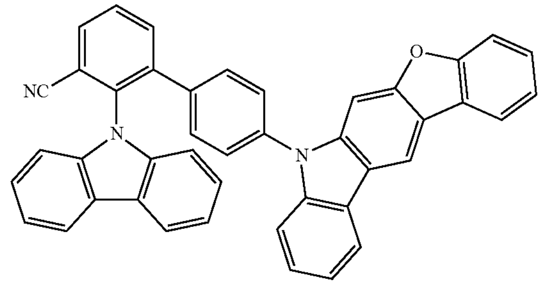
220
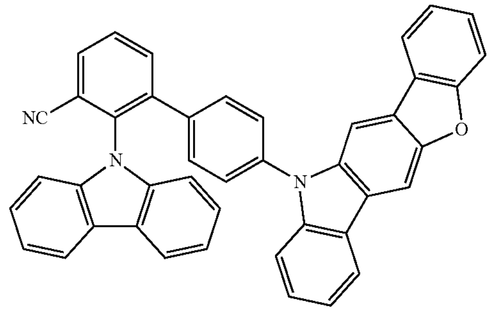
221
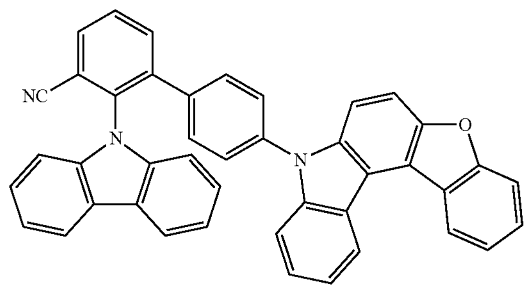
222
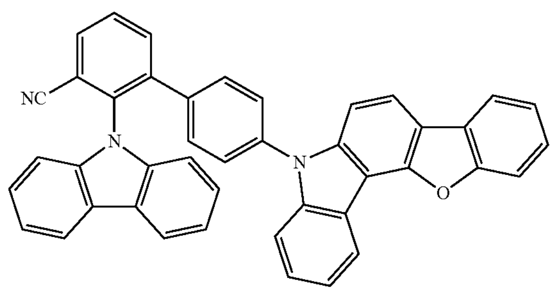
223
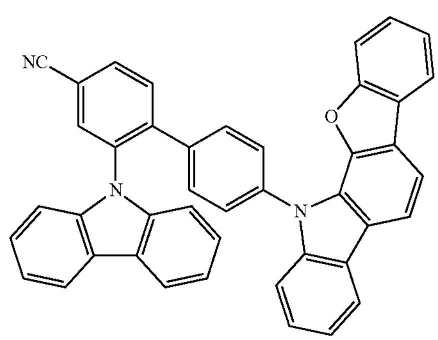

224
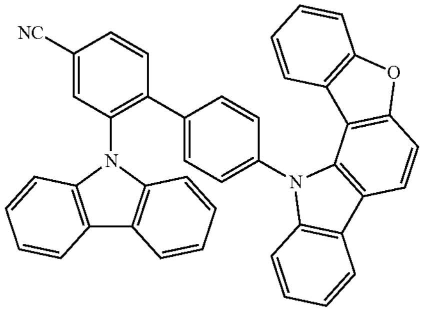
225
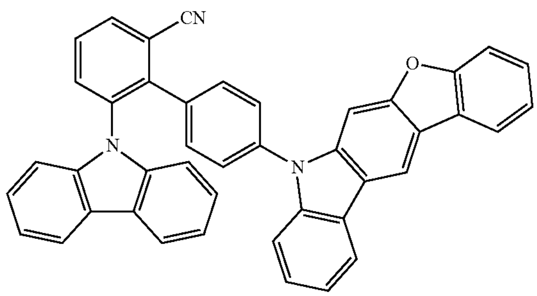
226
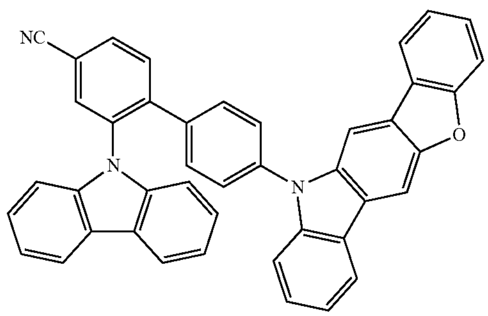
227
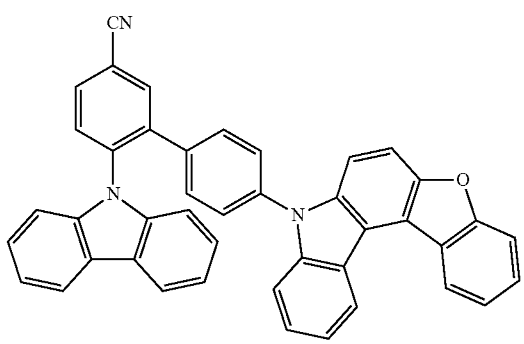
228
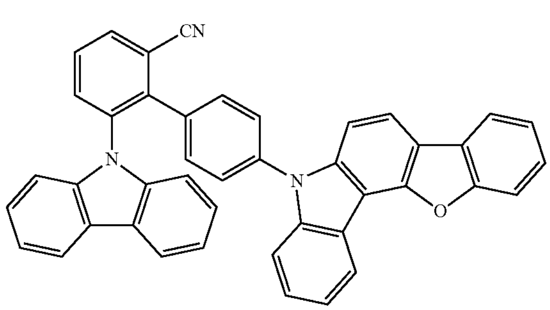
229
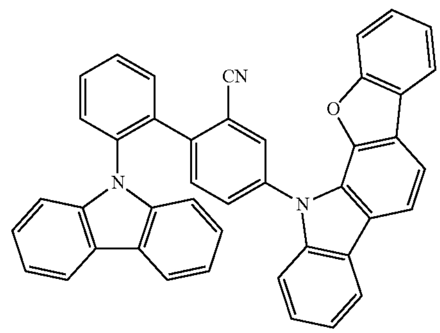
230
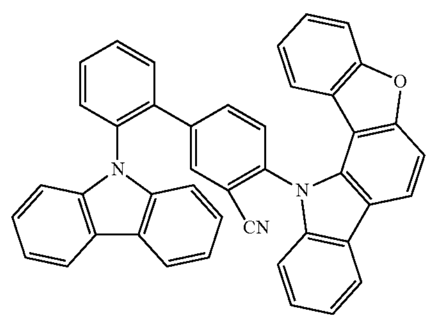
231
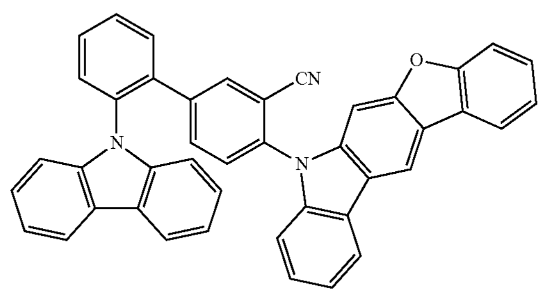
232
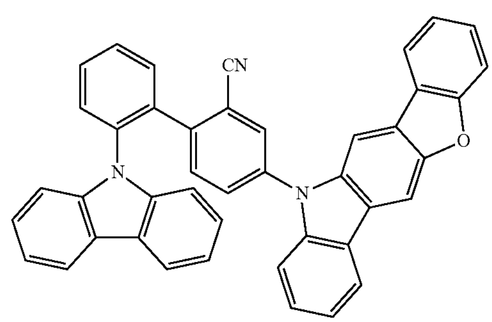
233
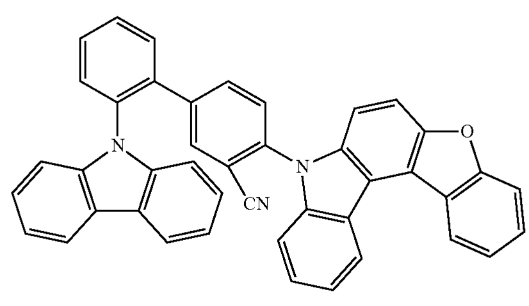

-continued
234
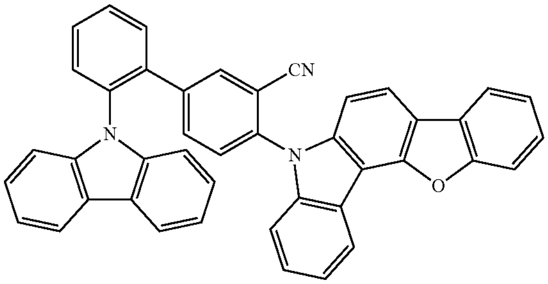
235
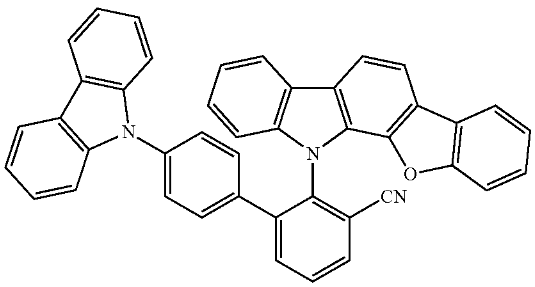
236
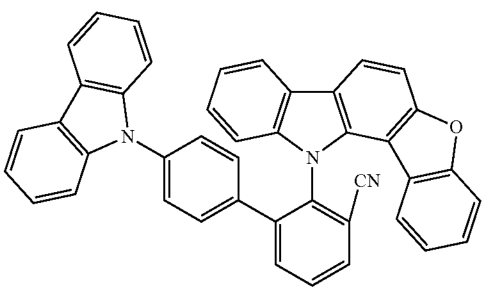
237
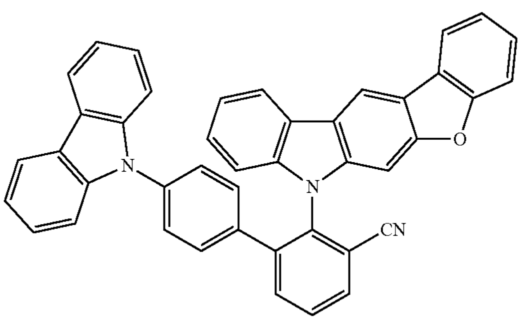
238
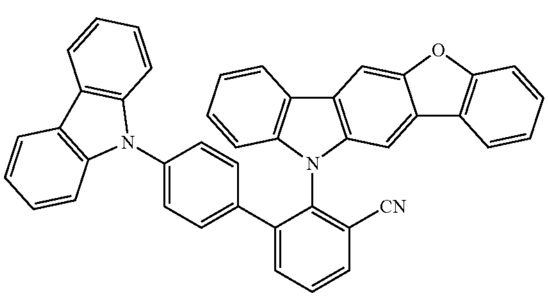
-continued
239
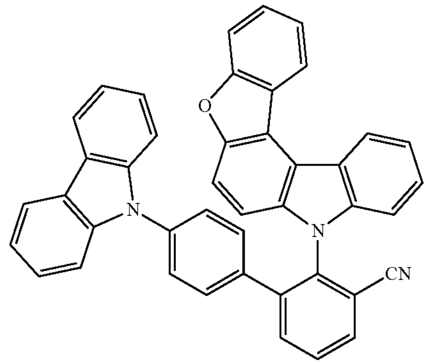
240
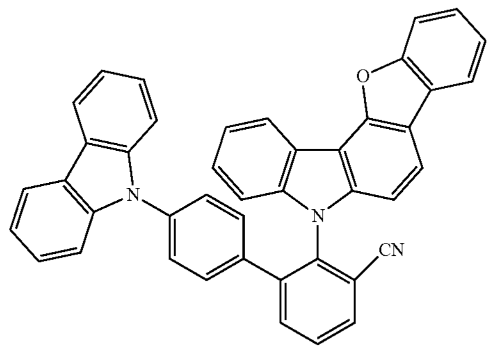
241
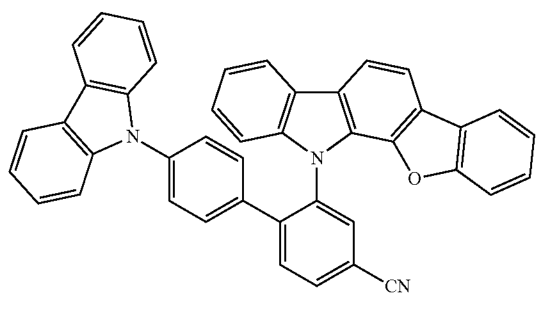
242
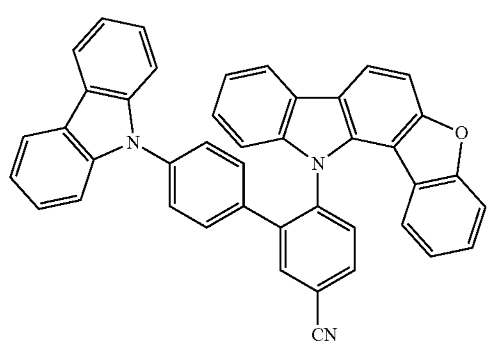

-continued
243
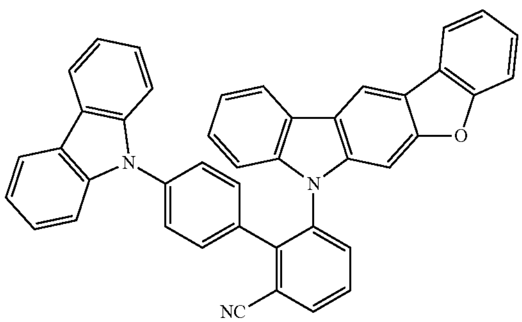
244
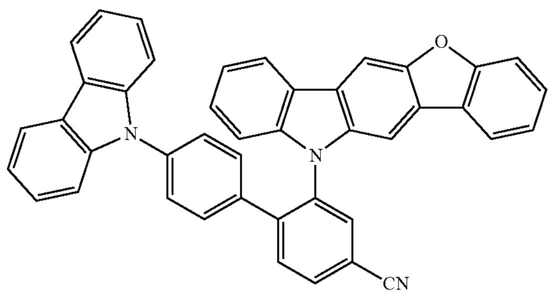
245
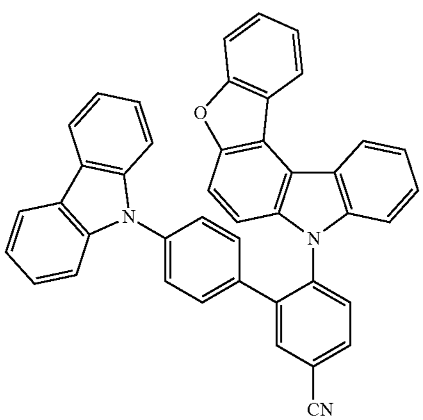
246
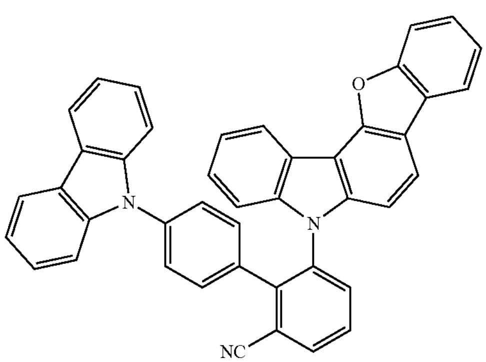
-continued
247
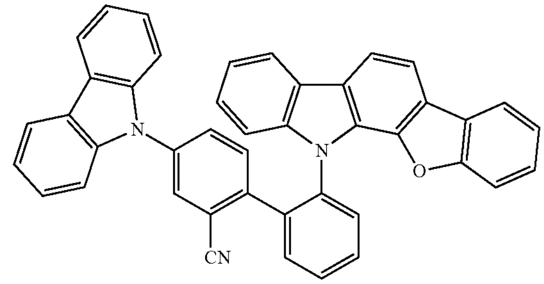
248
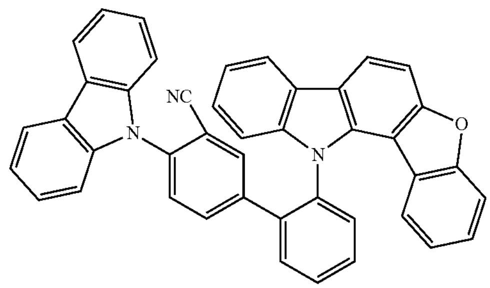
249
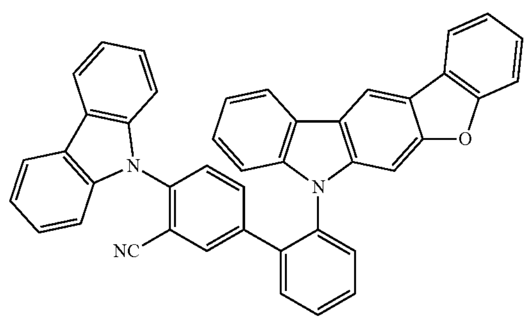
250
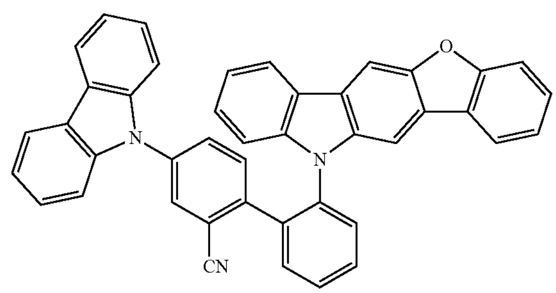
251
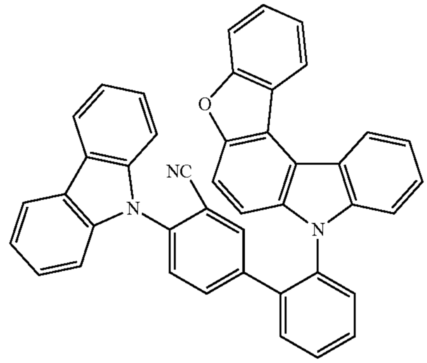

-continued
252
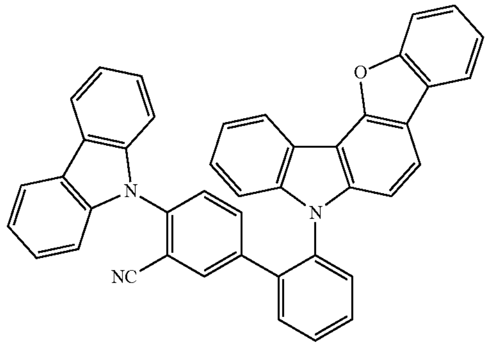
253
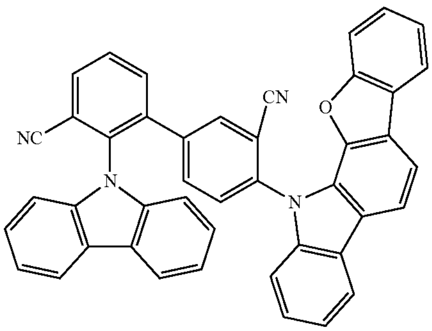
254
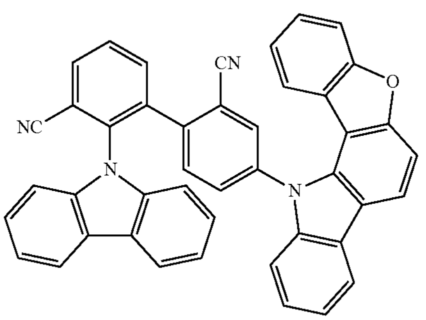
255
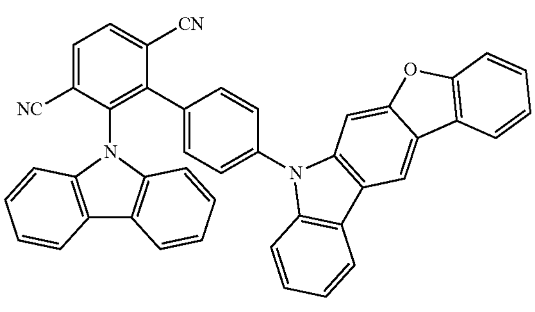
256
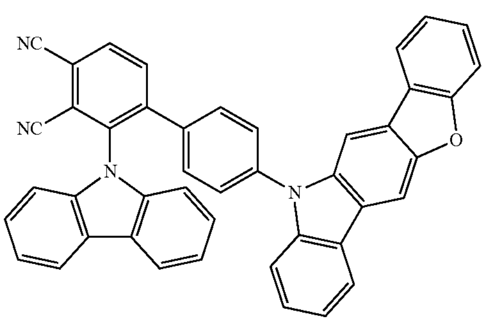
-continued
257
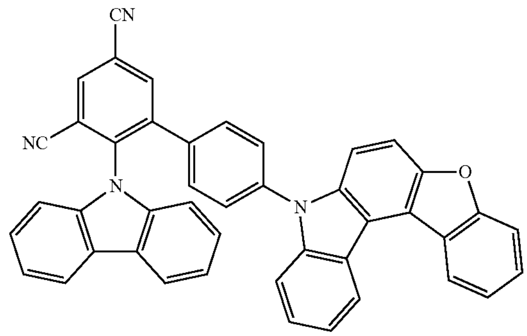
258
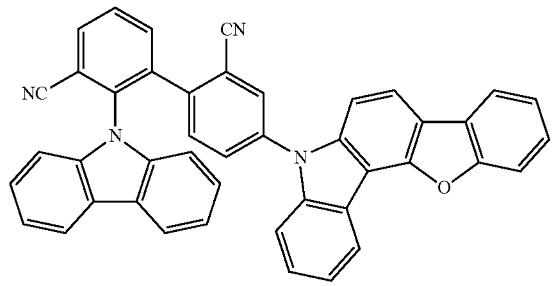
259
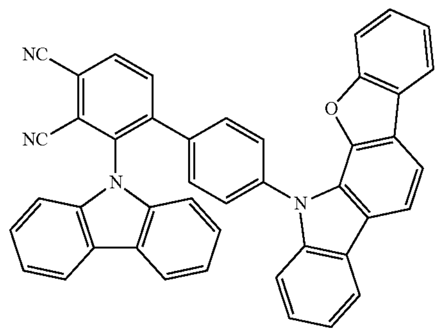
260
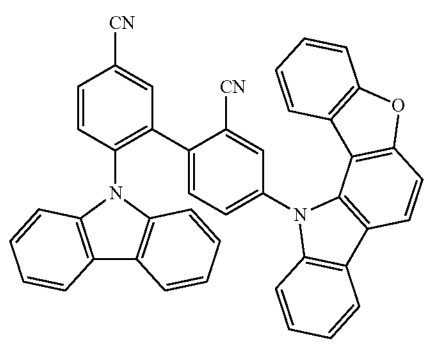
261
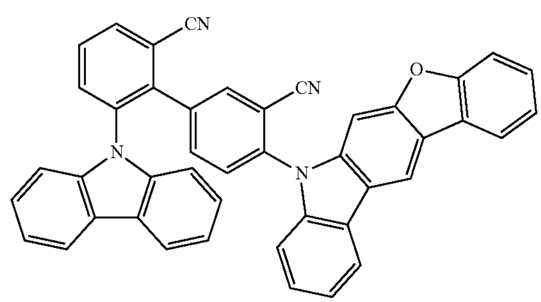

-continued
262
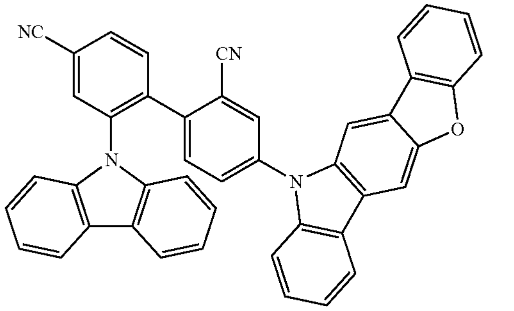
263
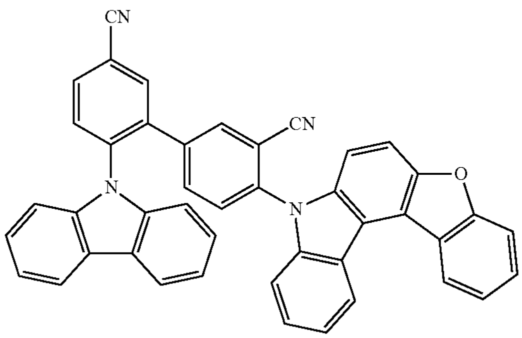
264
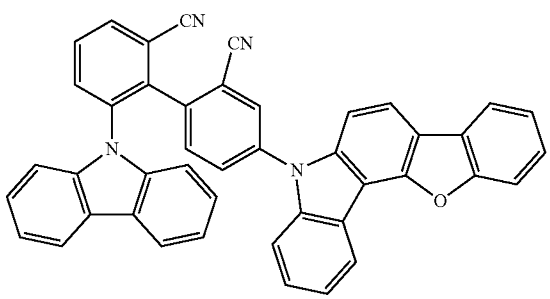
265
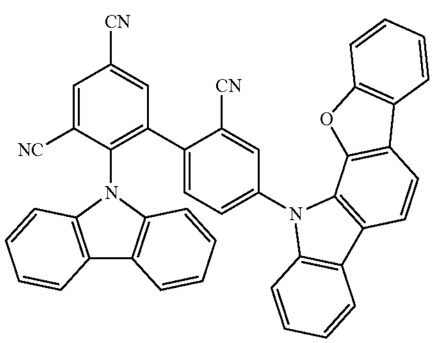
266
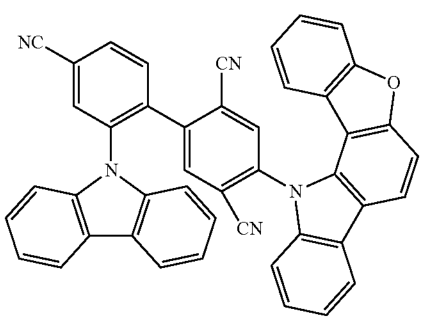
-continued
267
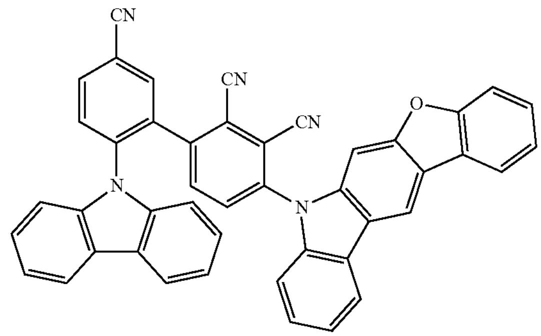
268
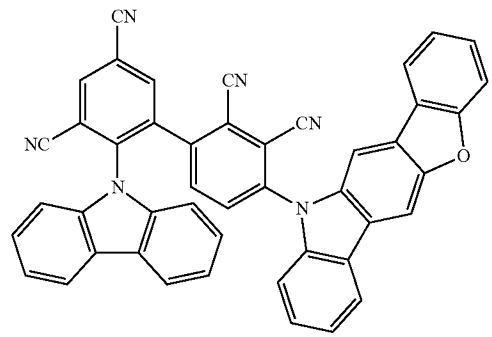
269
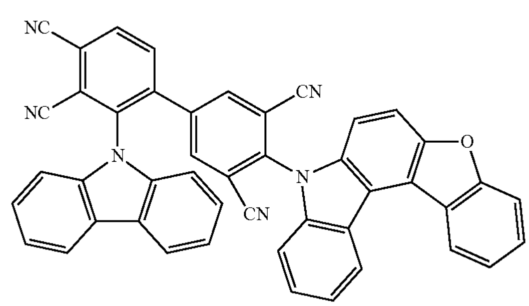
270
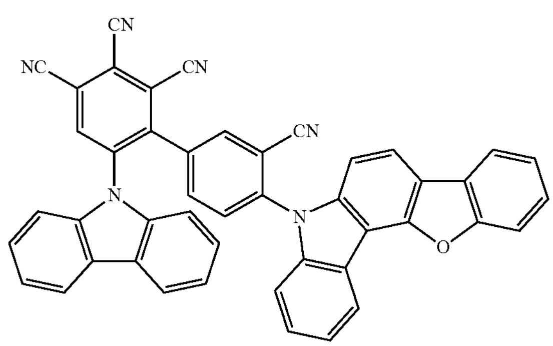

-continued
271
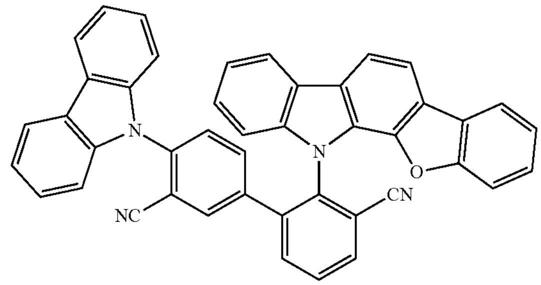
272
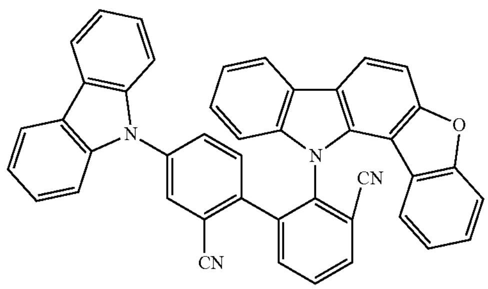
273
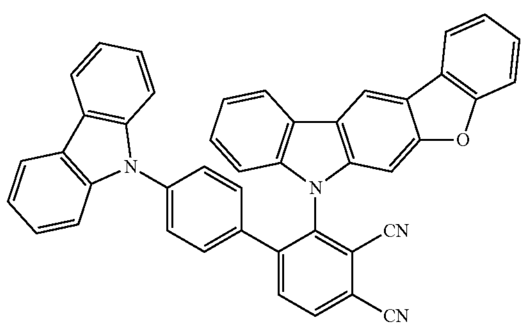
274
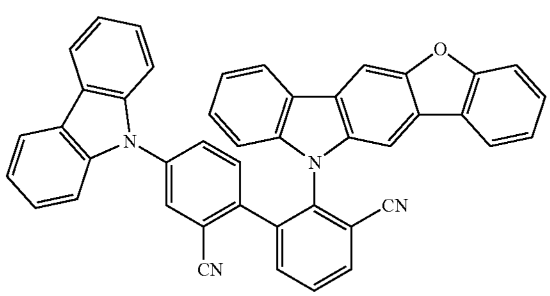
275
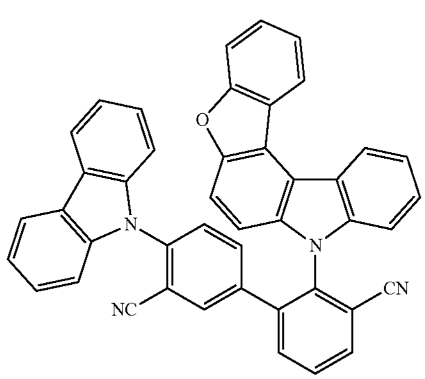
-continued
276
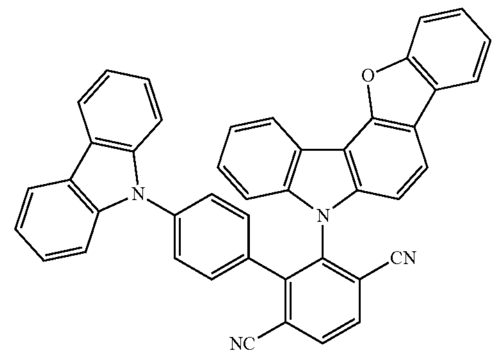
277
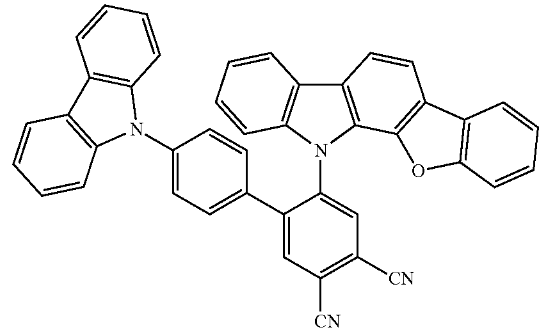
278
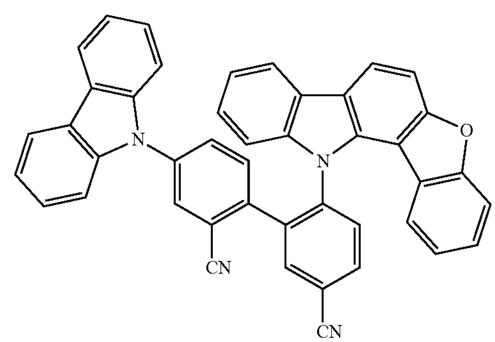
279
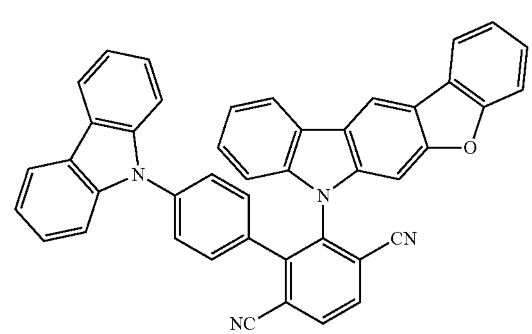

-continued
280
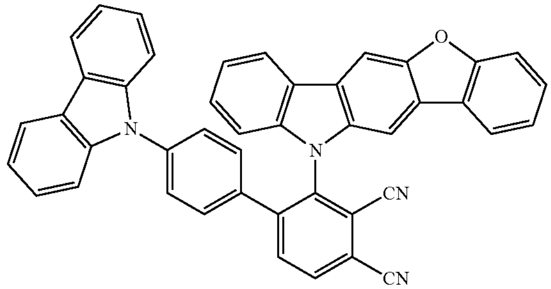
281
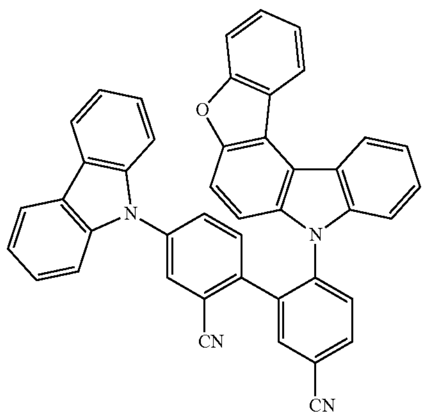
282
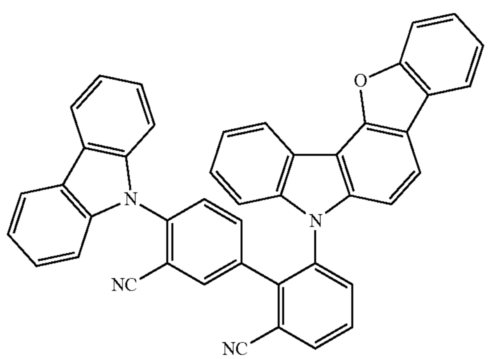
283
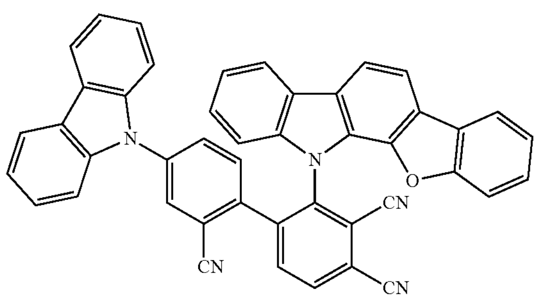
-continued
284
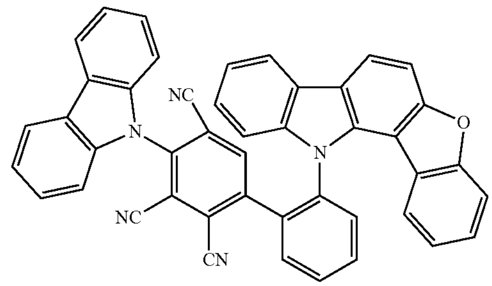
285
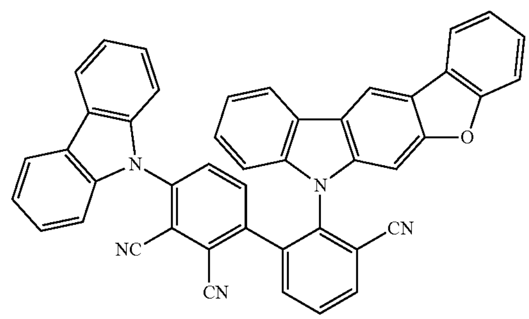
286
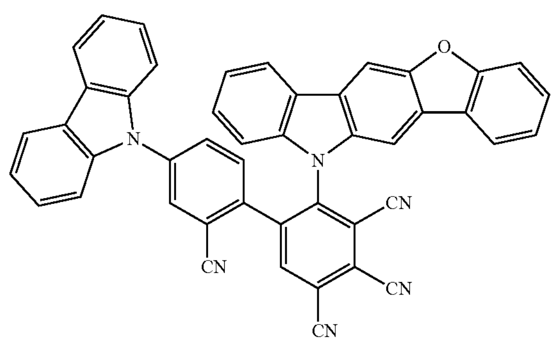
287
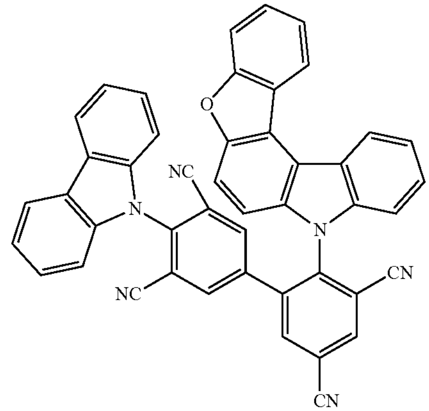

-continued
288
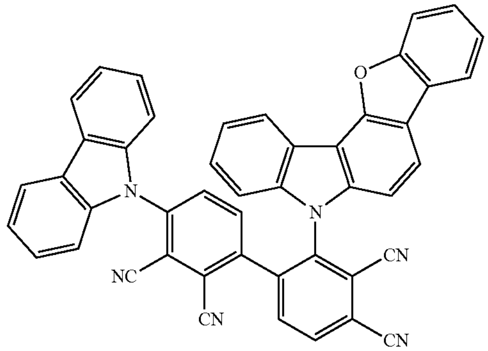
289
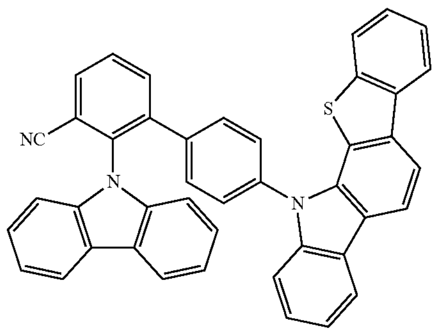
290
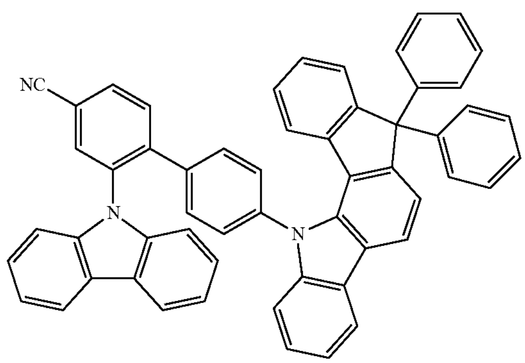
291
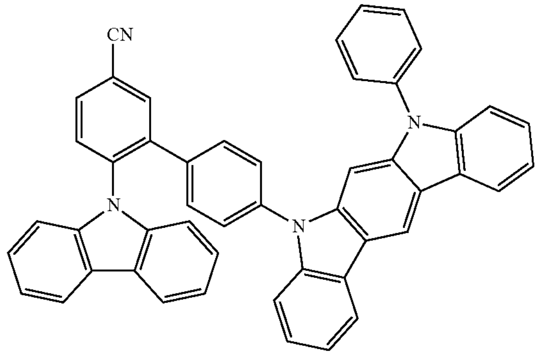
-continued
292
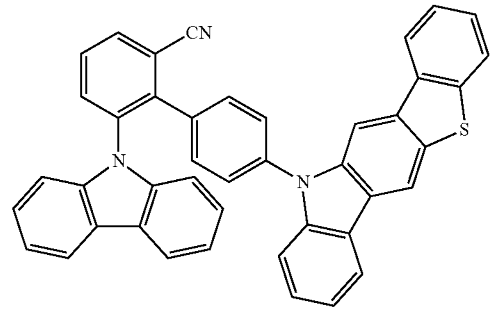
293
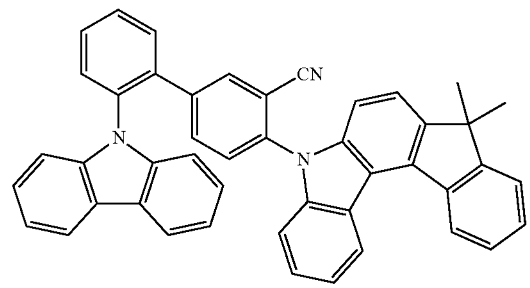
294
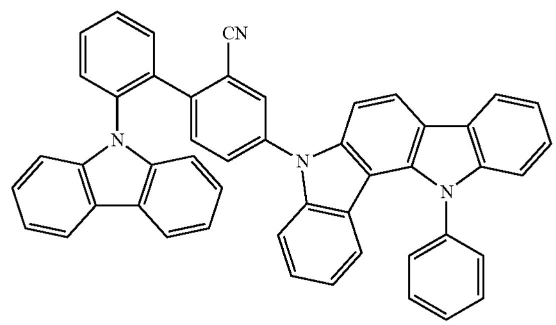
295
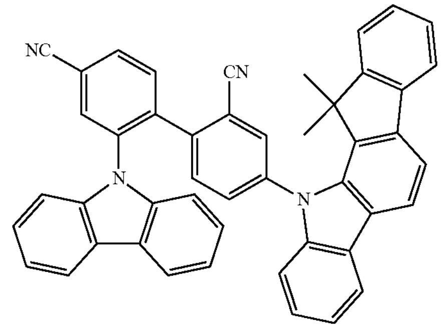

296
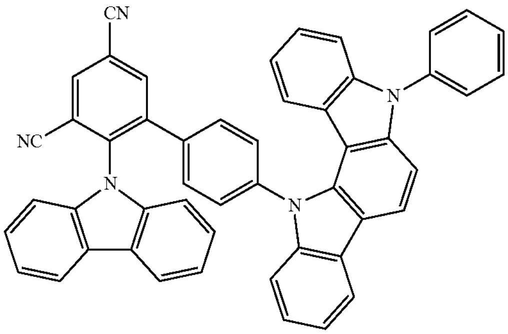
297
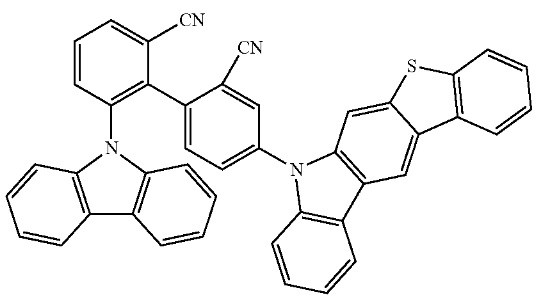
298
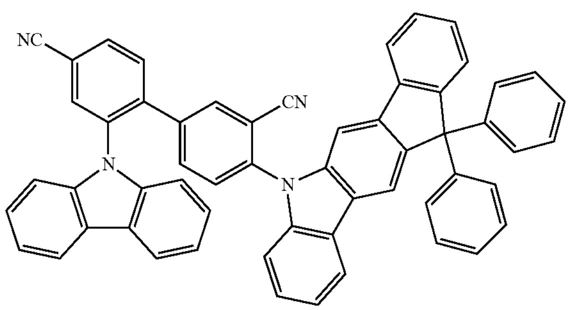
299
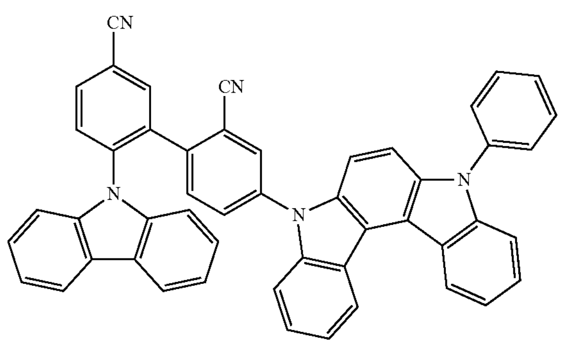
300
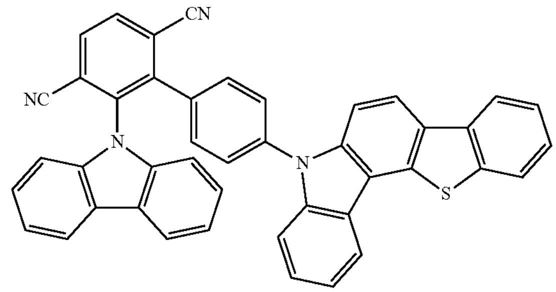
301
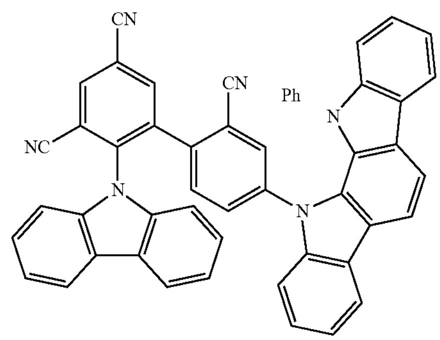
302
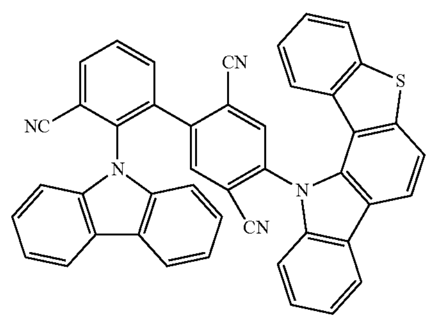
303
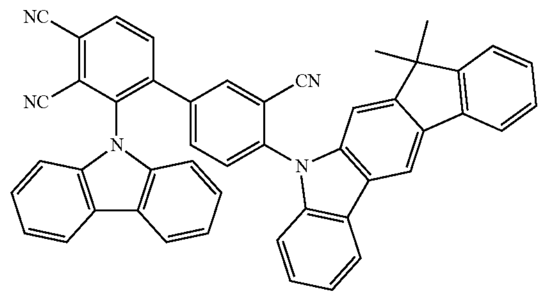

-continued
304
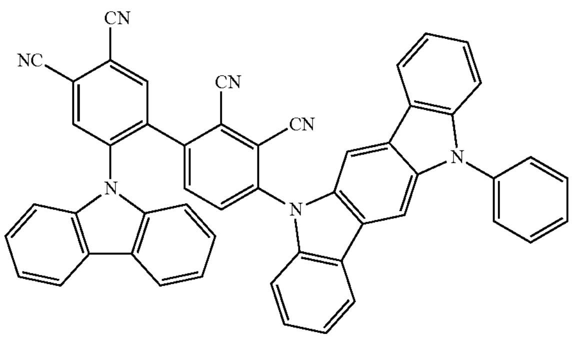
305
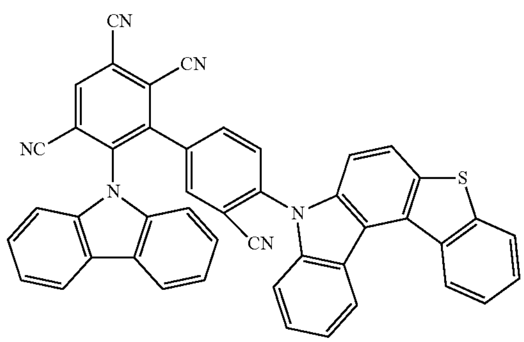
306
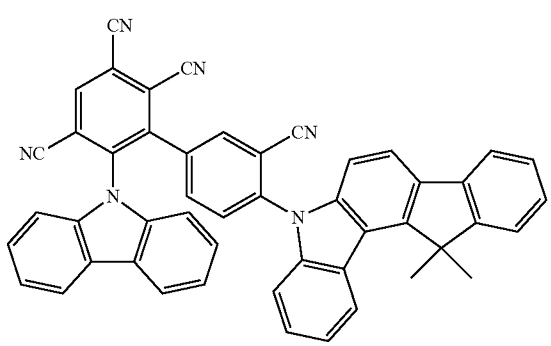
307
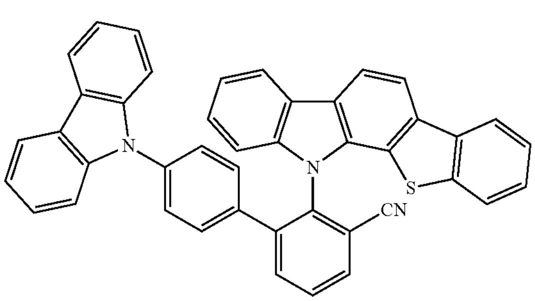
-continued
308
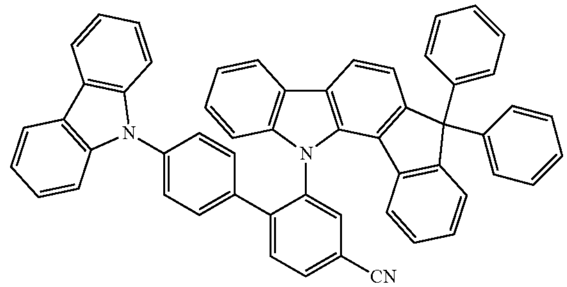
309
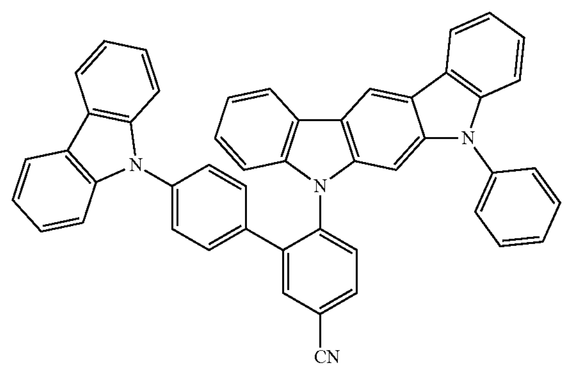
310
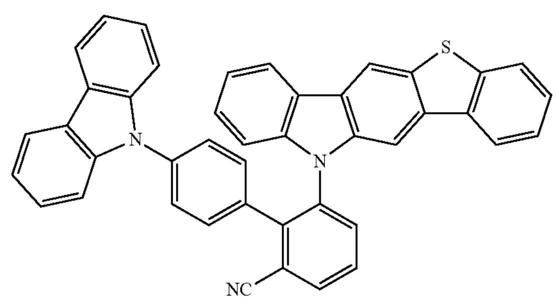
311
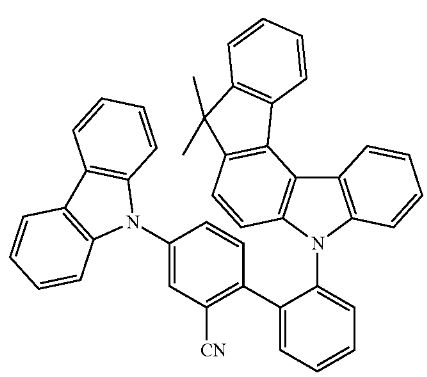

312
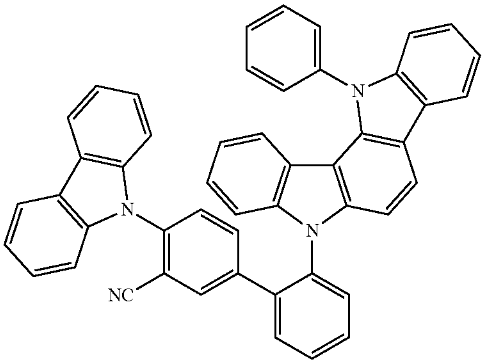
313
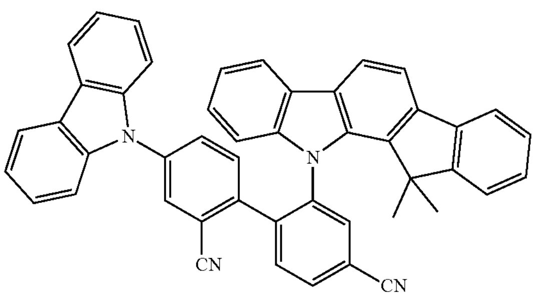
314
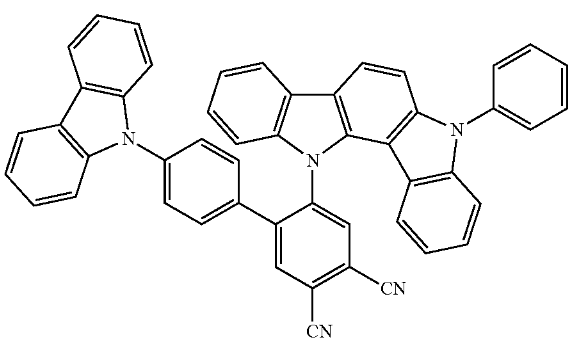
315
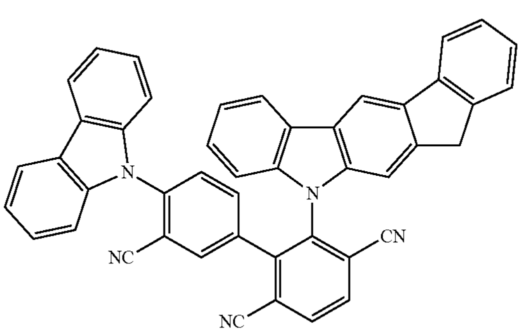
316
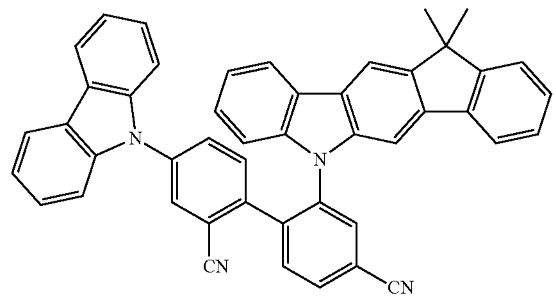
317
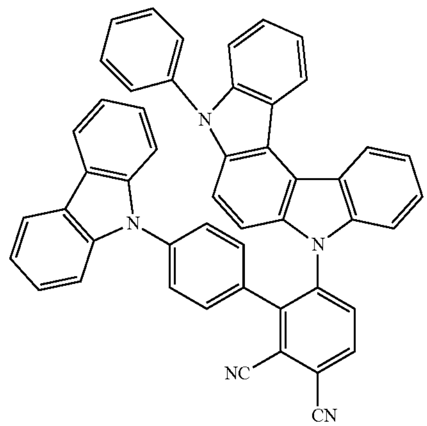
318
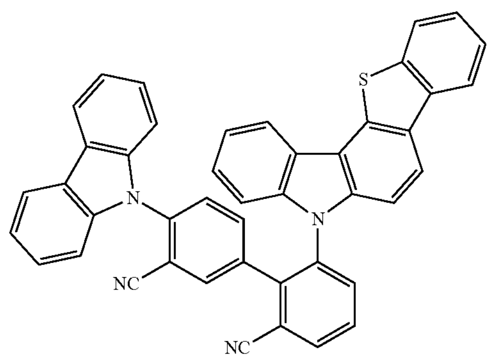
319
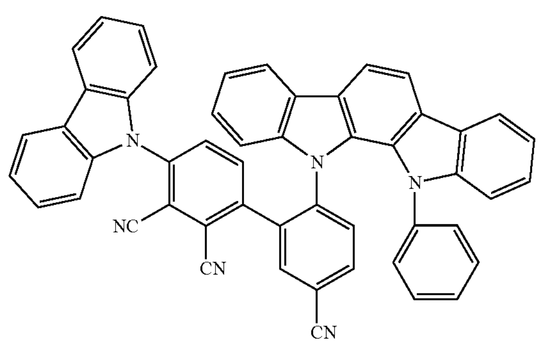

320
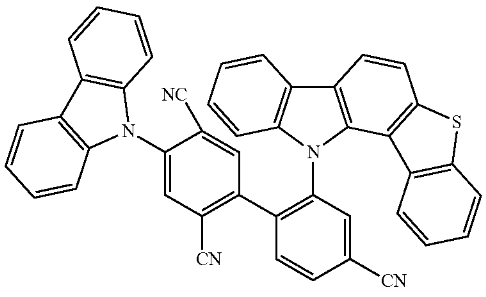
321
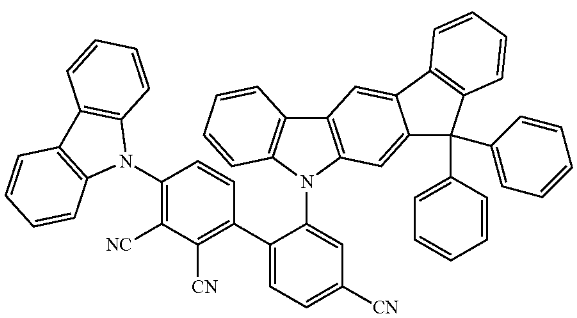
322
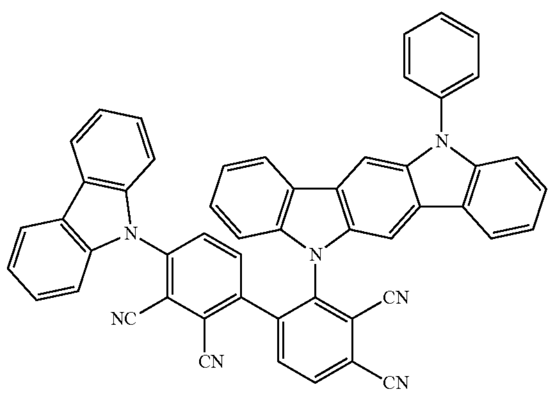
323
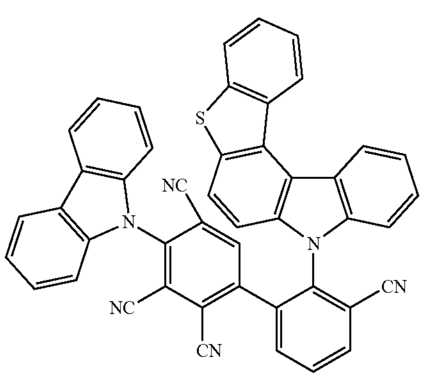
324
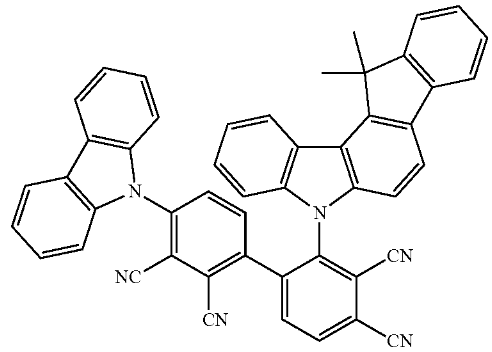
325
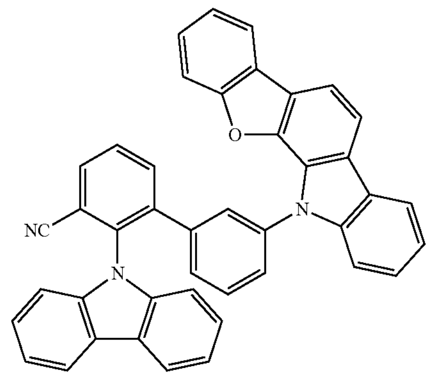
326
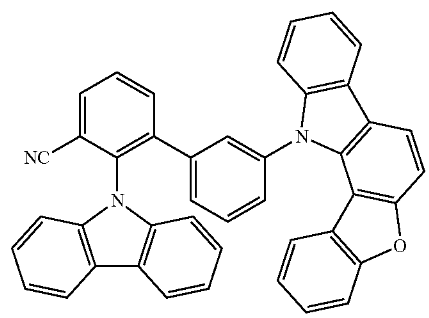
327
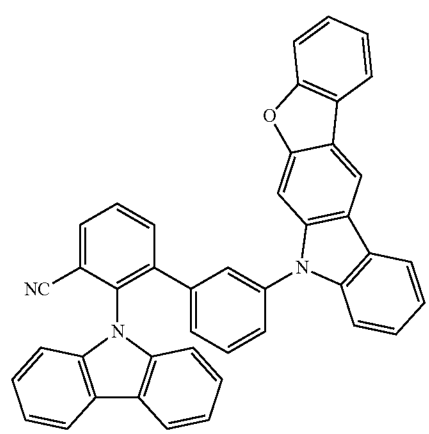

-continued
328
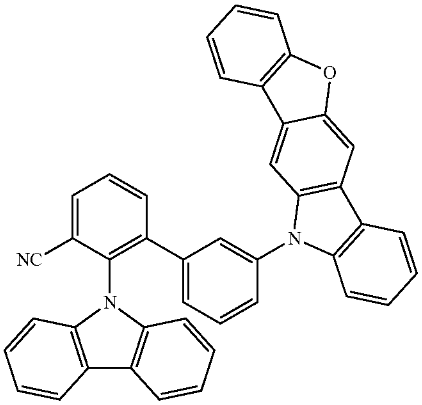
329
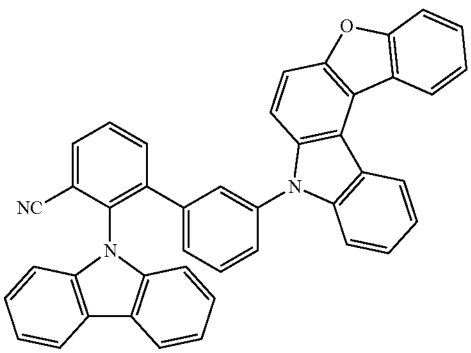
330
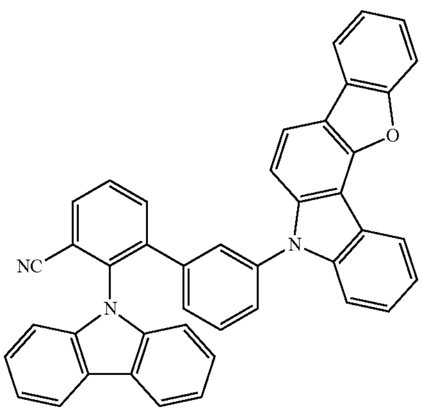
331
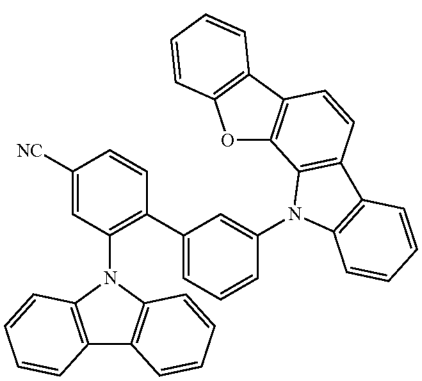
-continued
332
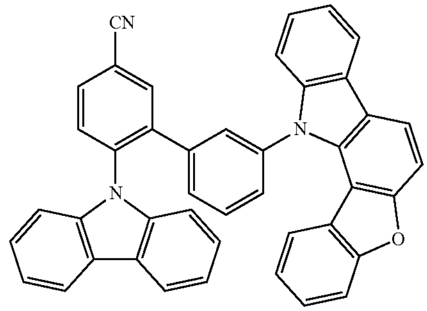
333
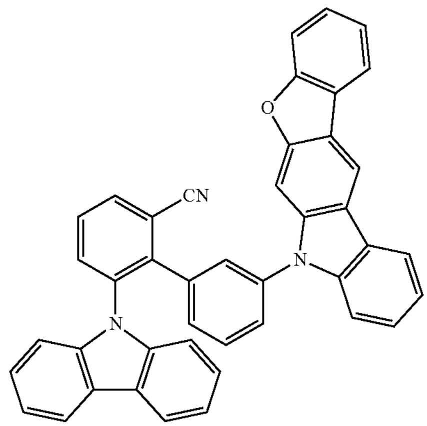
334
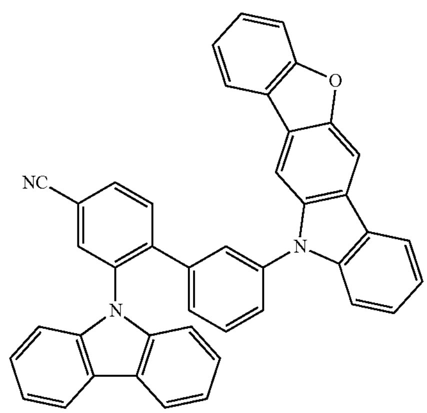
335
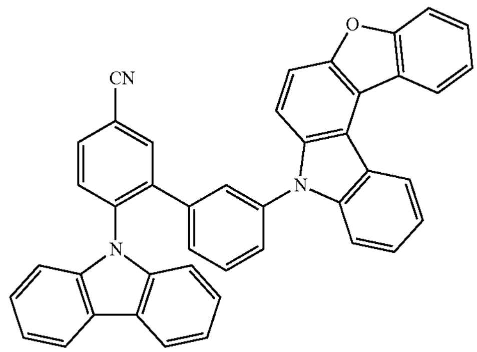

-continued
336
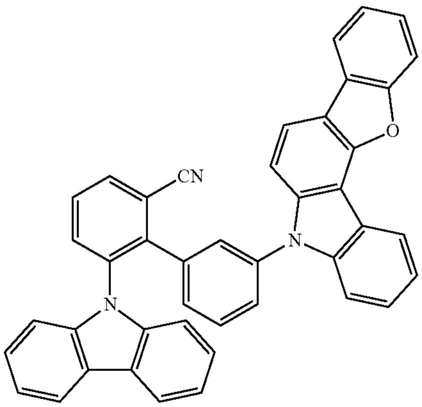
337
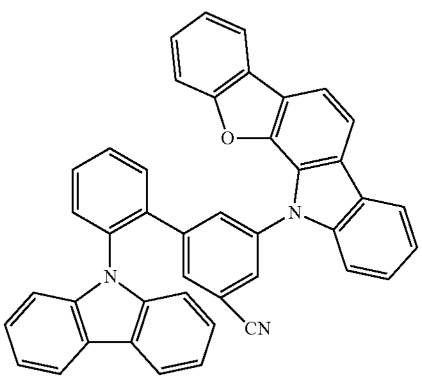
338
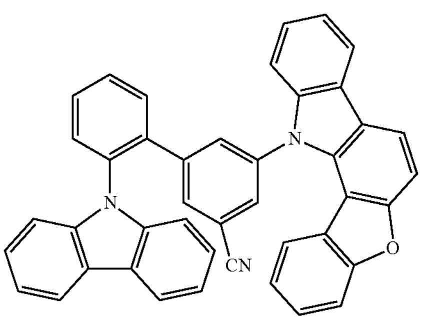
339
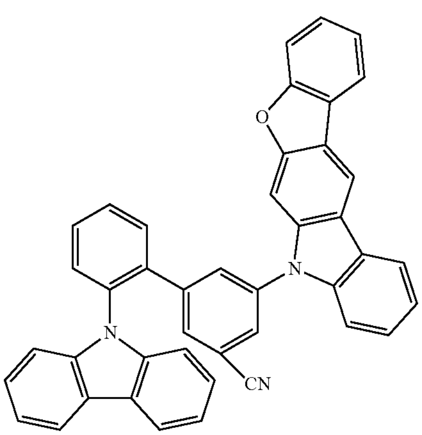
-continued
340
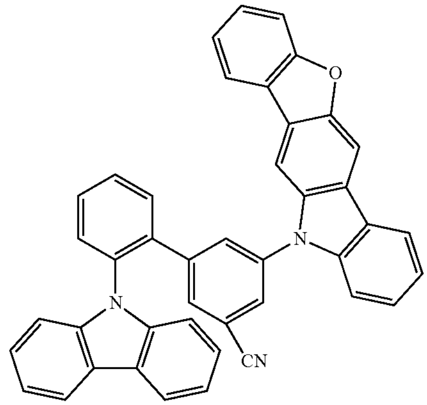
341
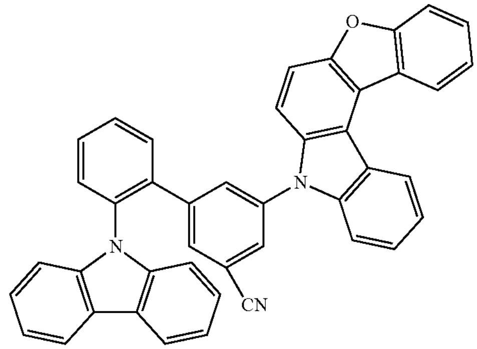
342
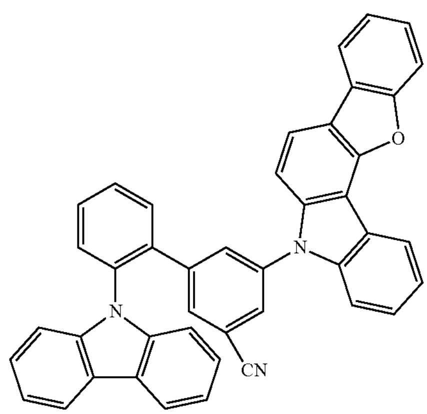
343
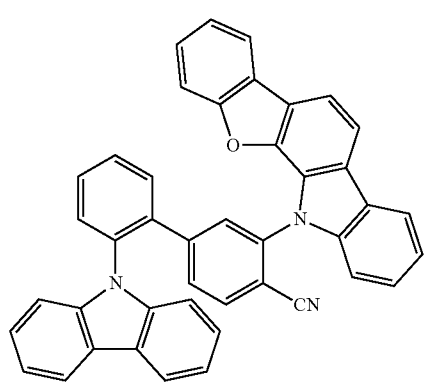

-continued
344
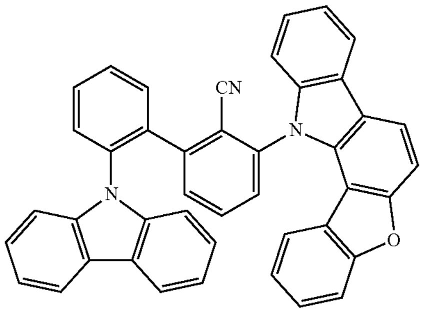
345
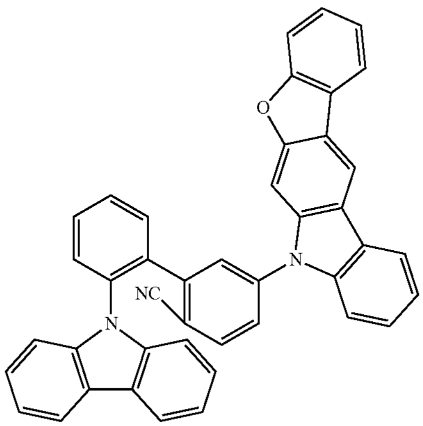
346
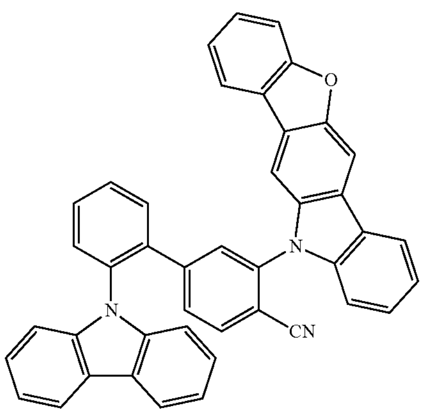
347
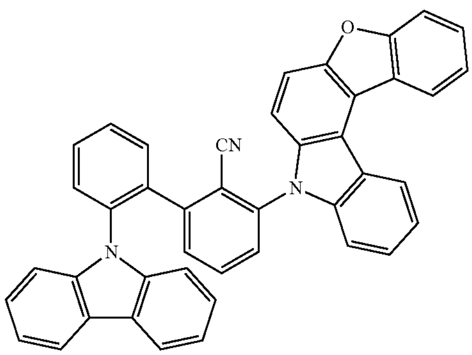
-continued
348
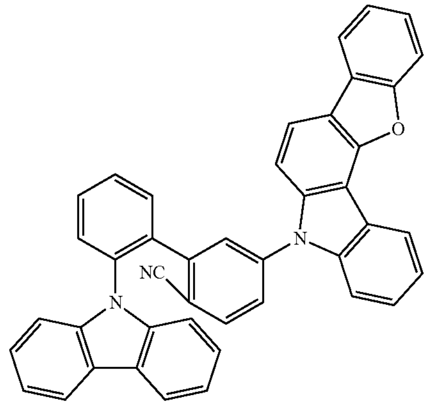
349
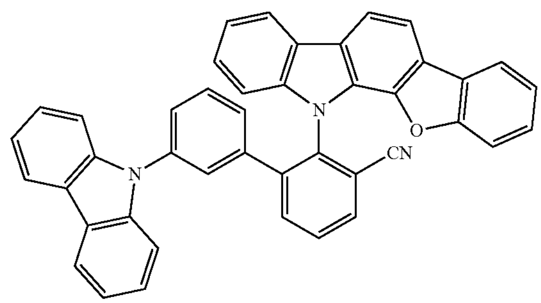
350
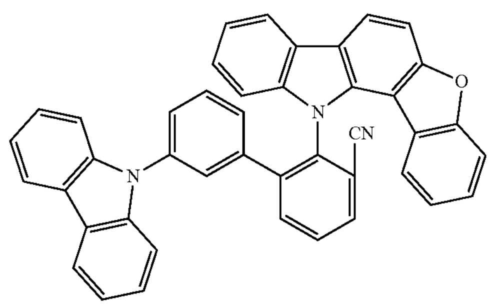
351
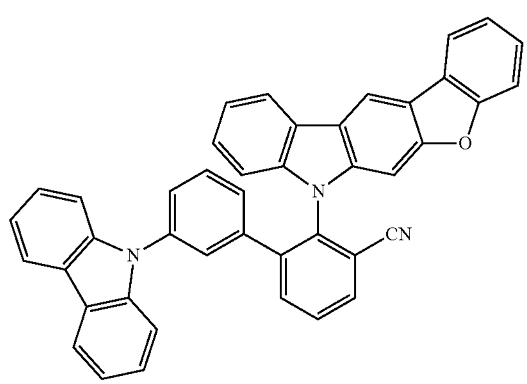

-continued
352
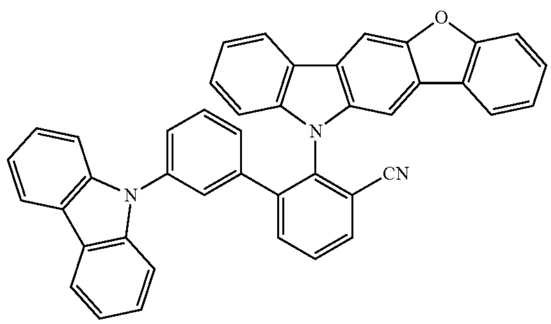
353
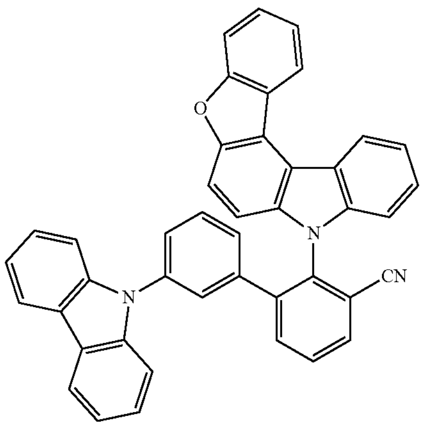
354
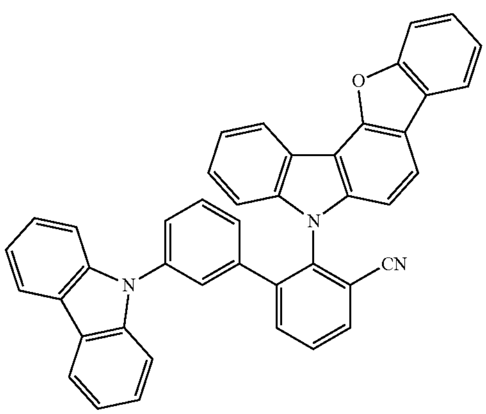
355
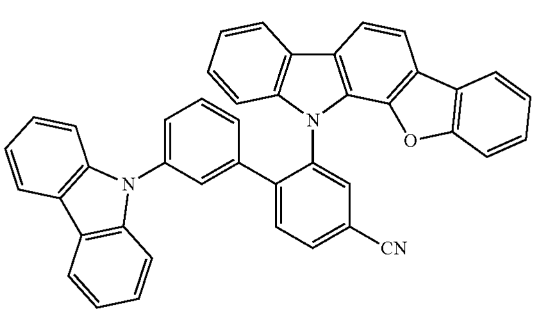
-continued
356
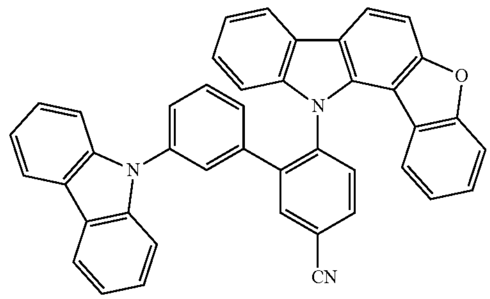
357
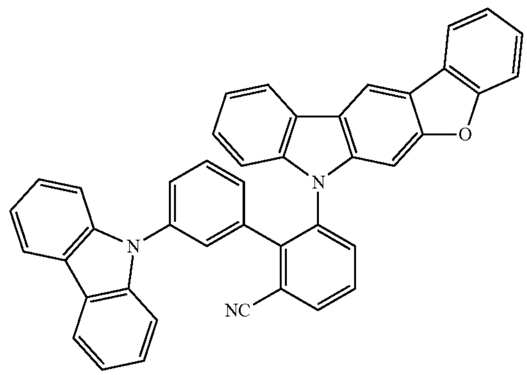
358
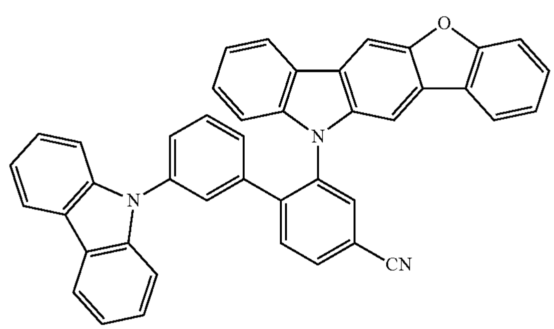
359
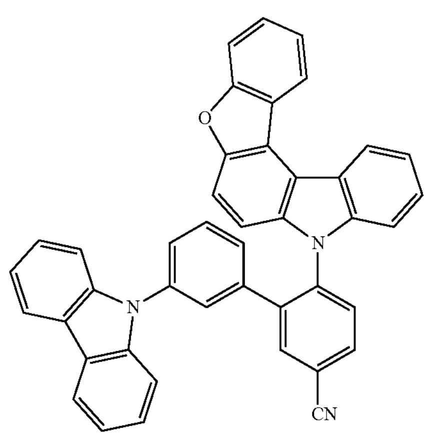

-continued
360
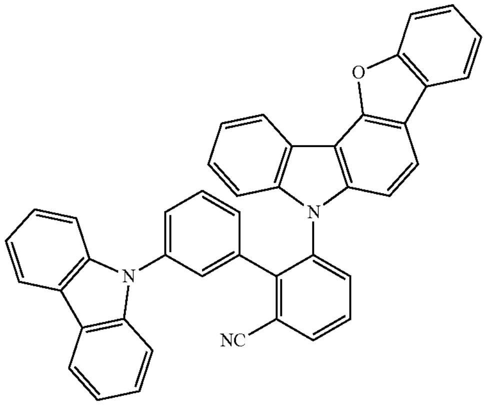
361
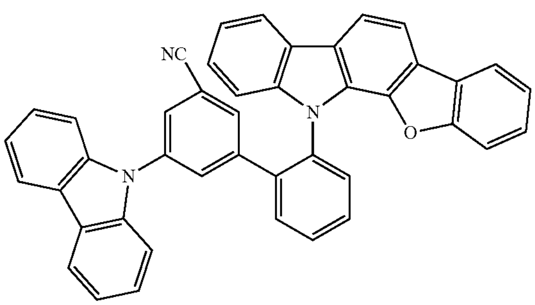
362
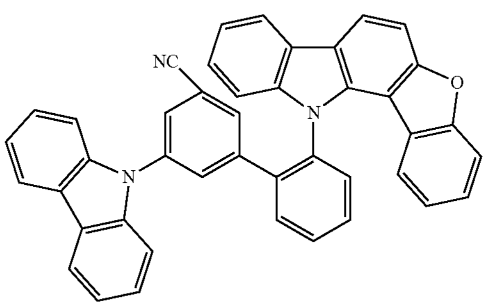
363
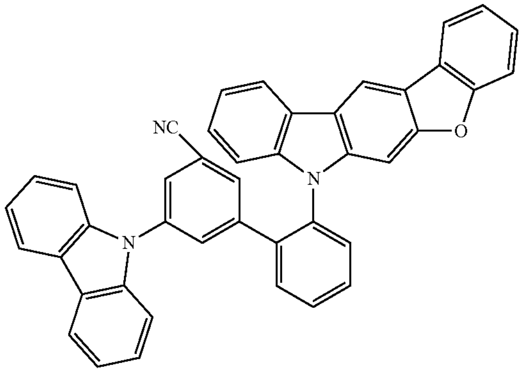
-continued
364
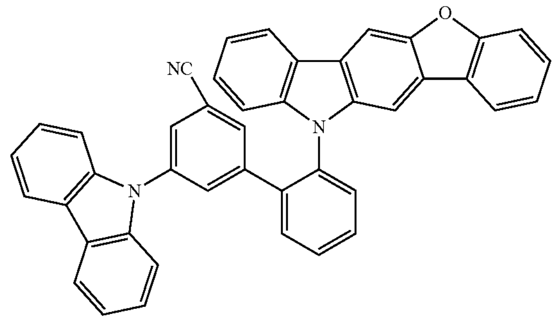
365
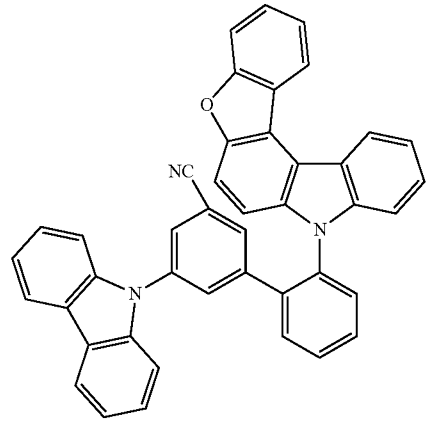
366
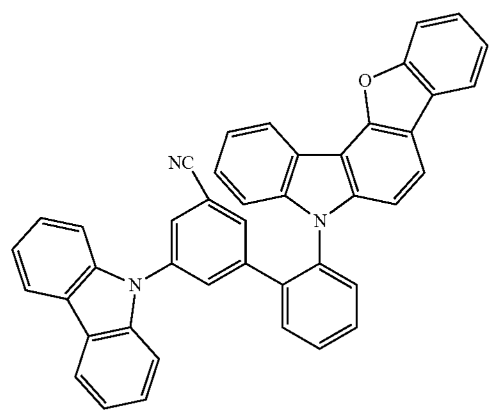
367
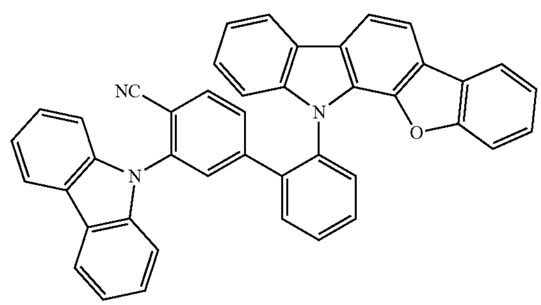

-continued
368
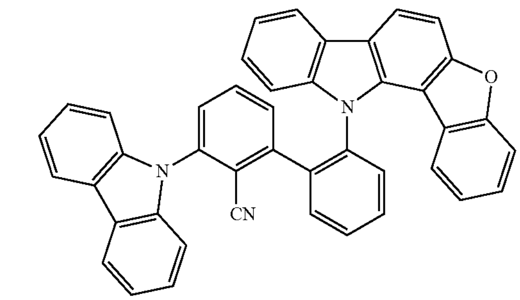
369
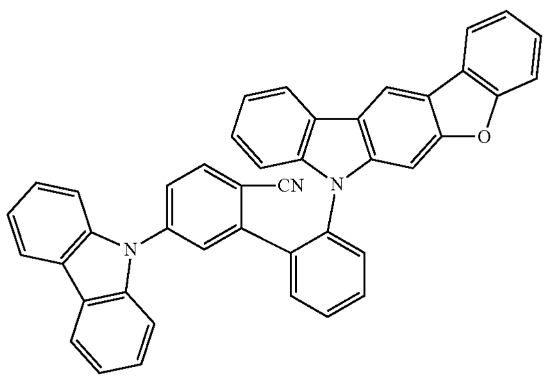
370
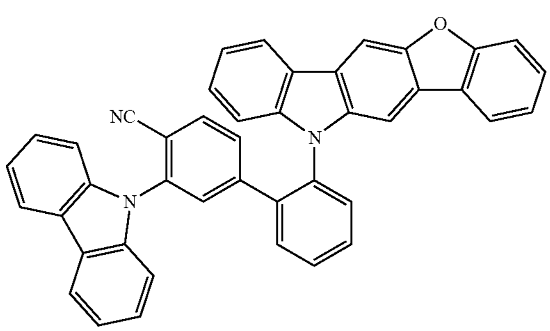
371
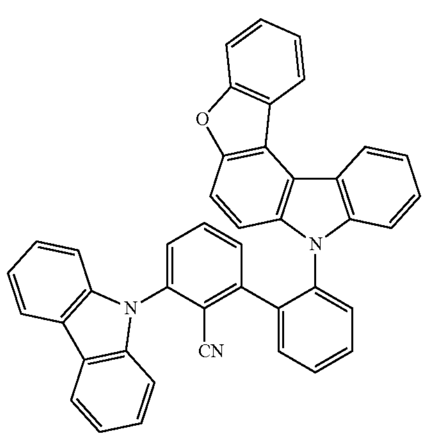
-continued
372
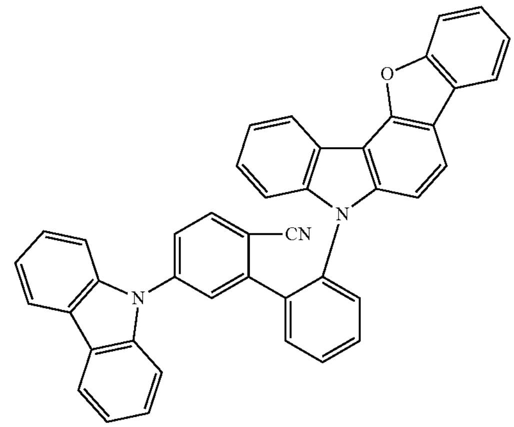
373
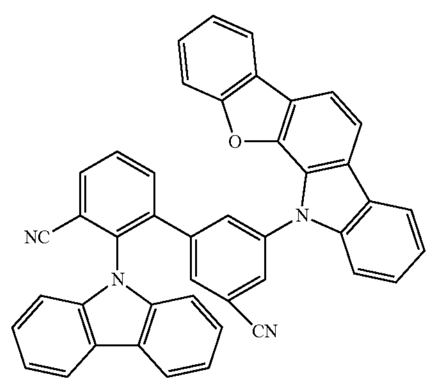
374
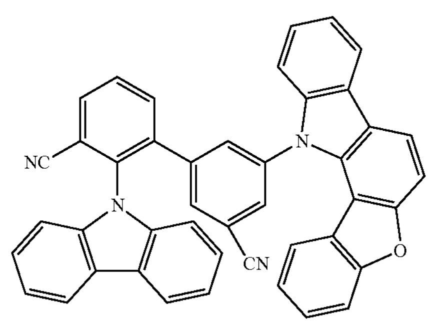
375
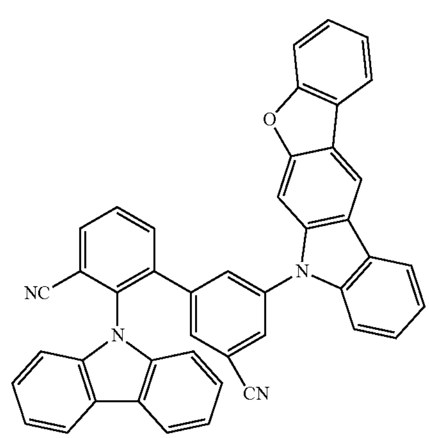

376
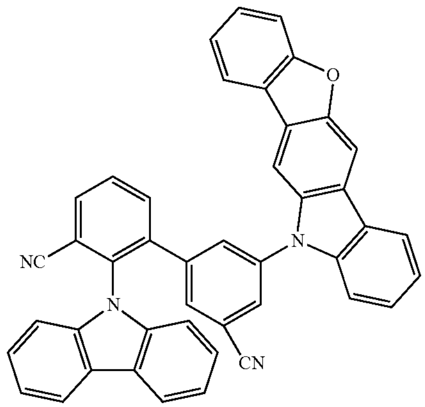
377
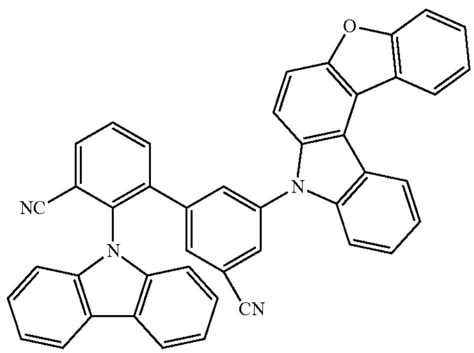
378
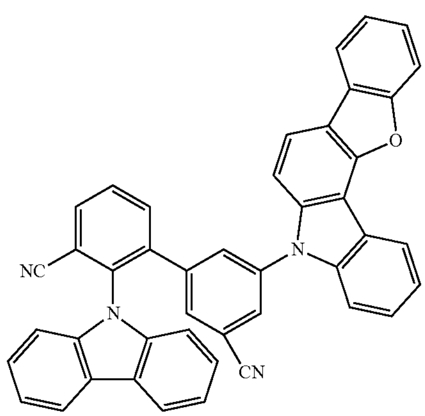
379
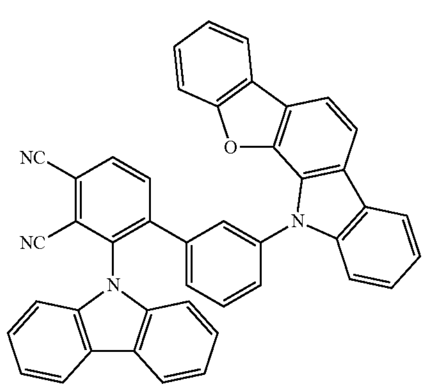
380
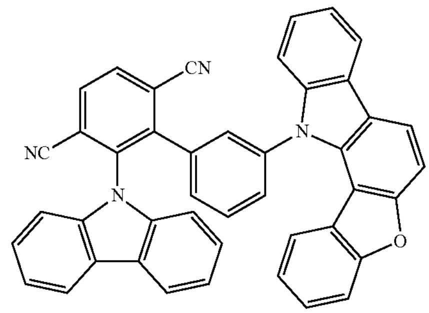
381
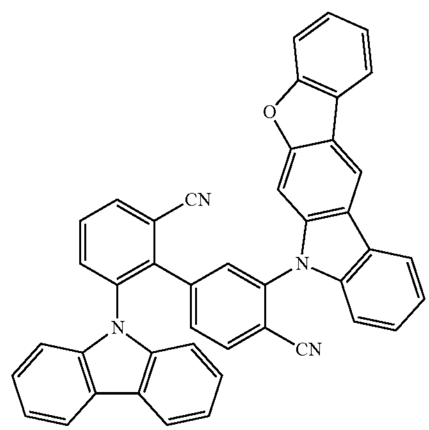
382
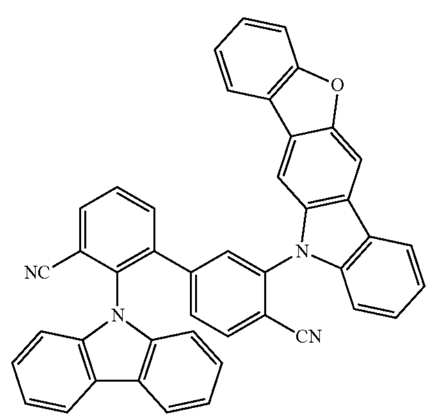
383
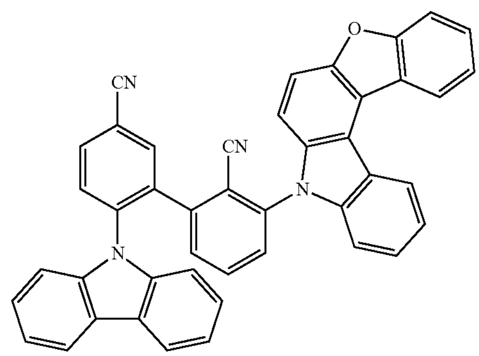

384
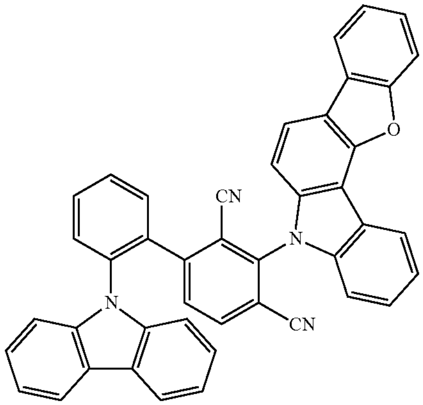
385
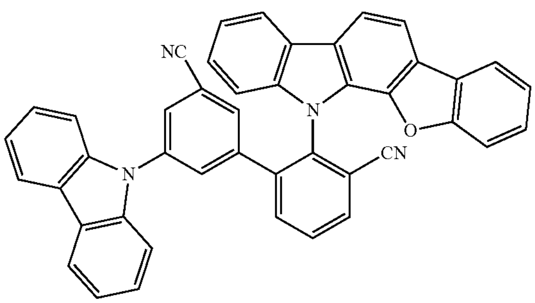
386
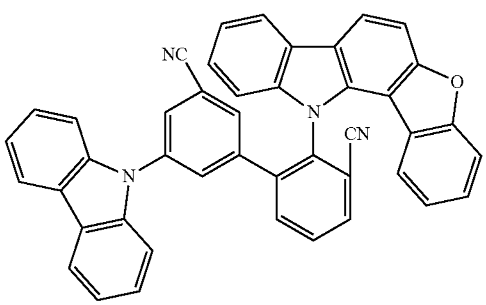
387
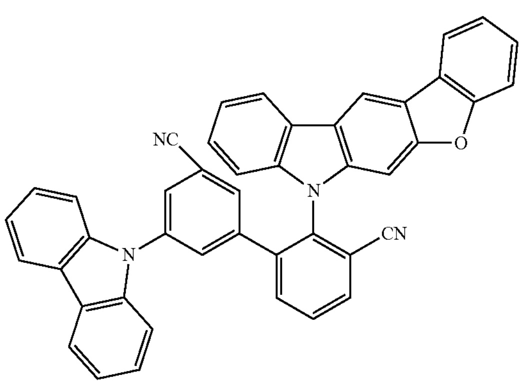
388
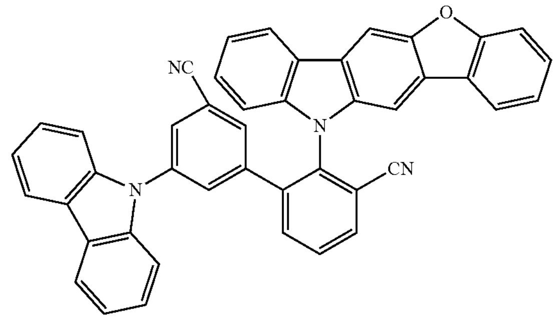
389
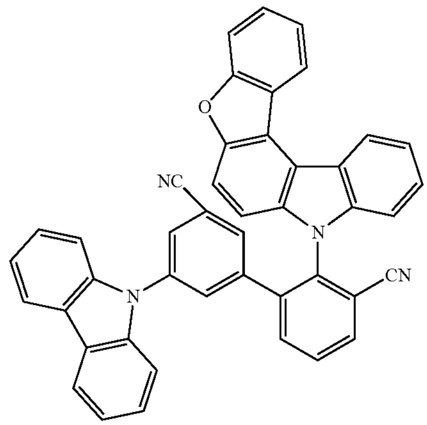
390
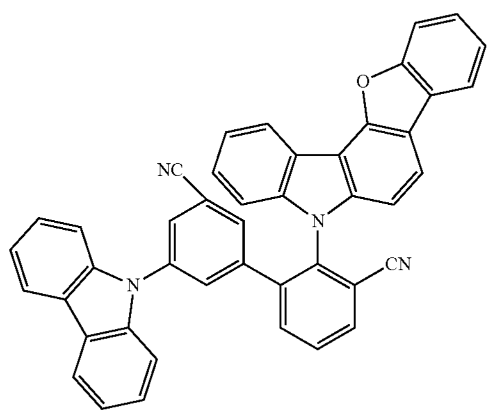
391
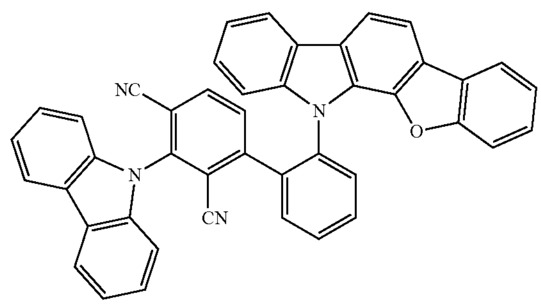

-continued
392
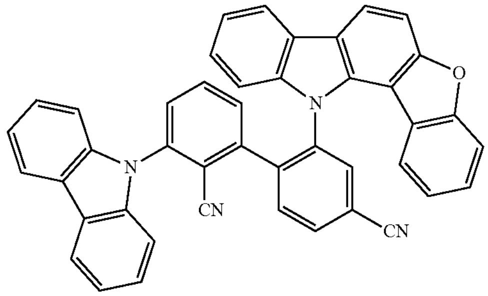
393
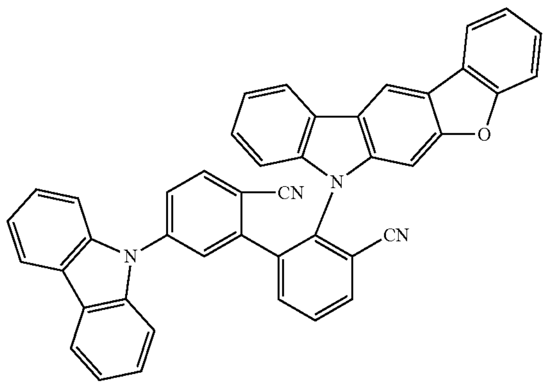
394
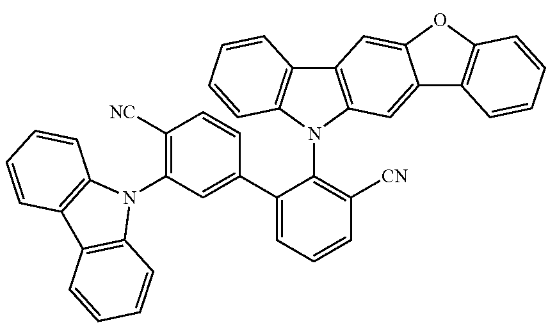
395
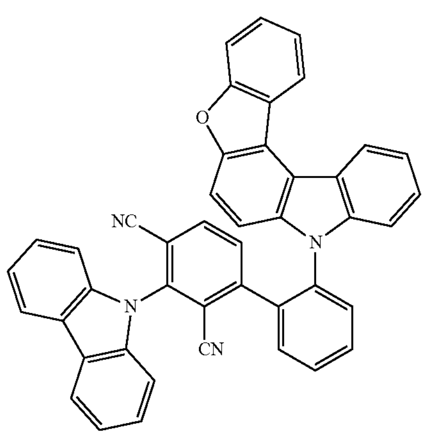
-continued
396
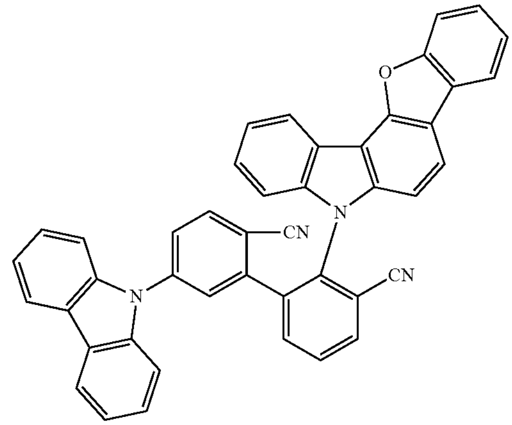
397
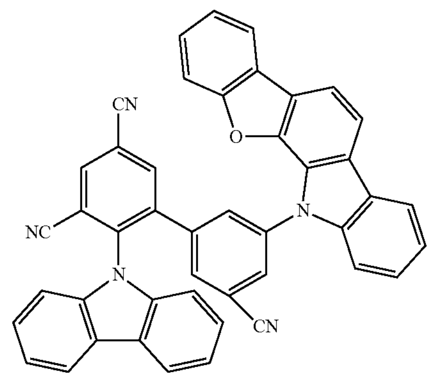
398
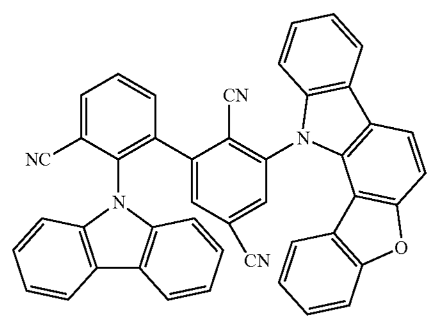
399
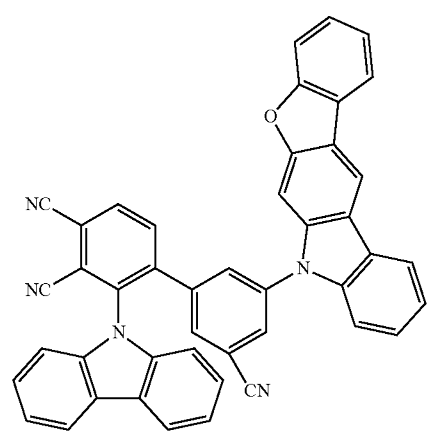

-continued
400
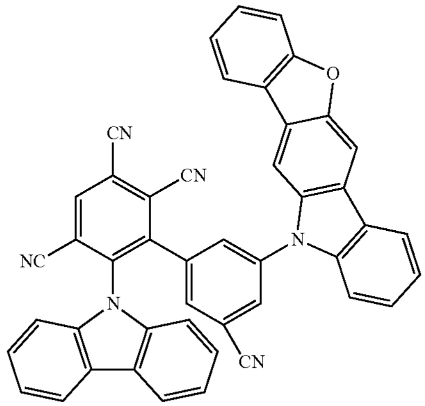
401
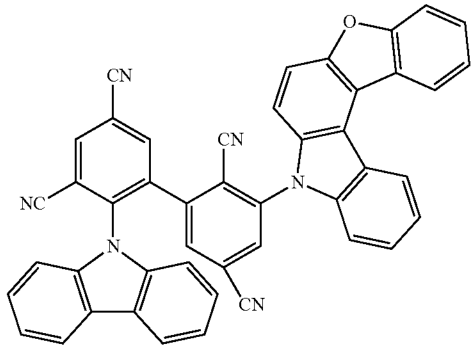
402
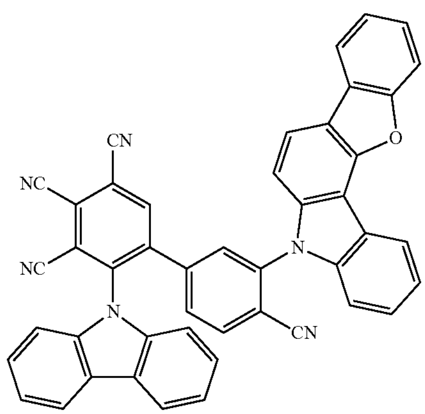
403
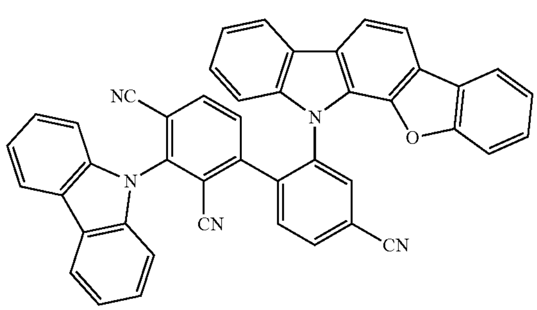
-continued
404
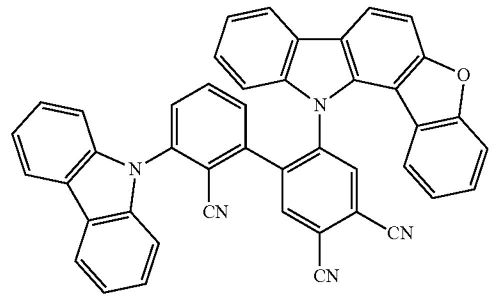
405
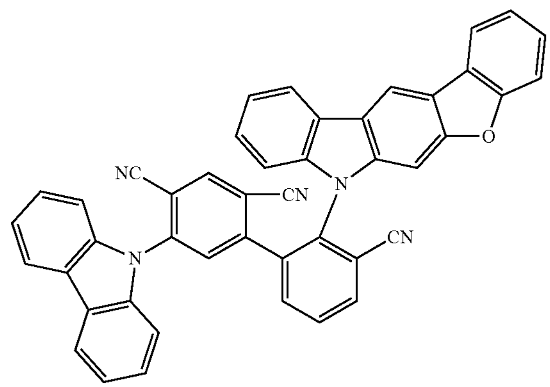
406
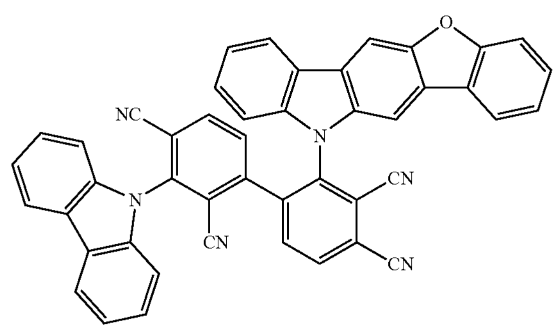
407
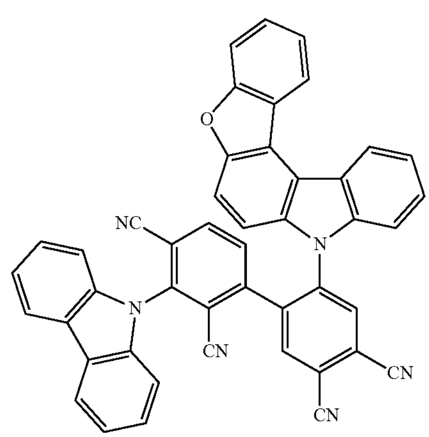

-continued
408
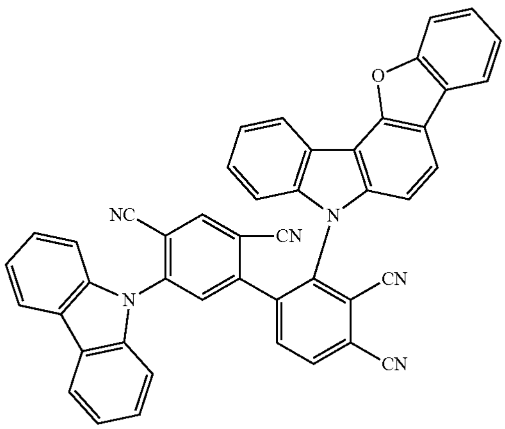
409
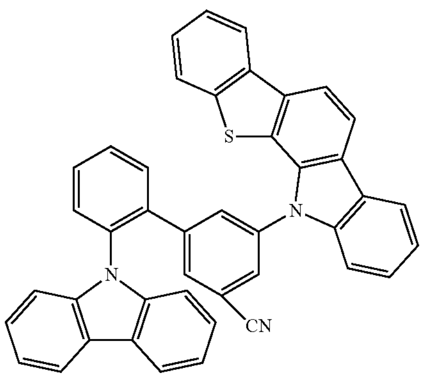
410
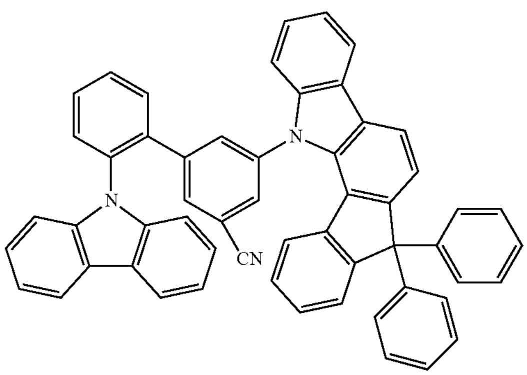
411
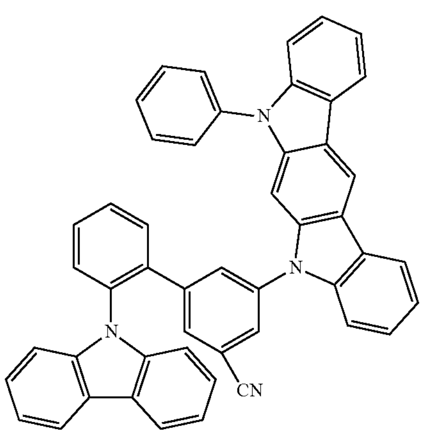
-continued
412
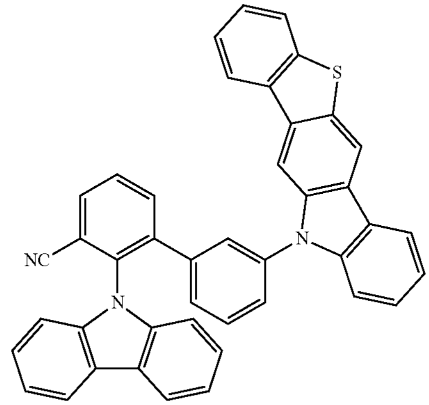
413
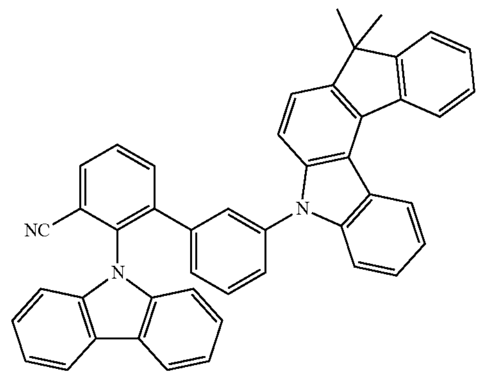
414
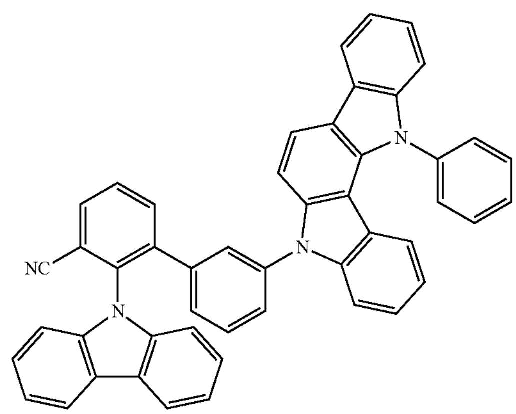
415
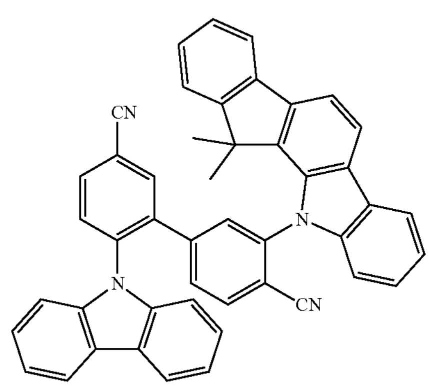

-continued
416
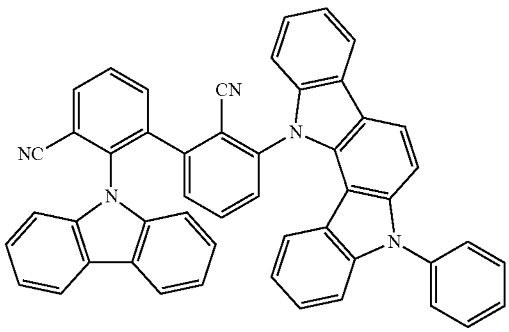
417
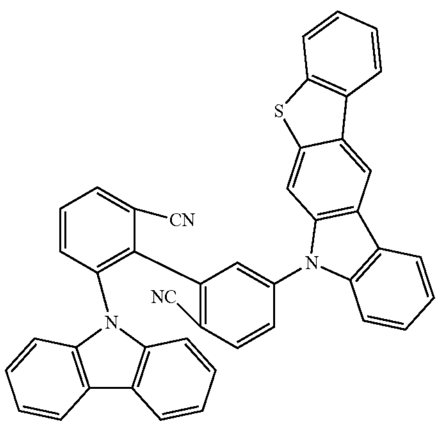
418
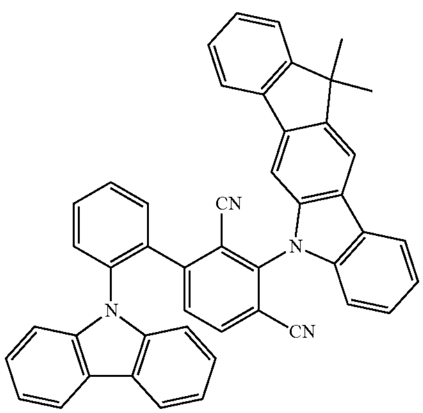
419
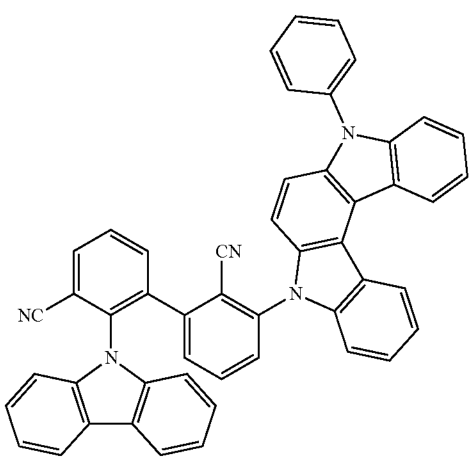
-continued
420
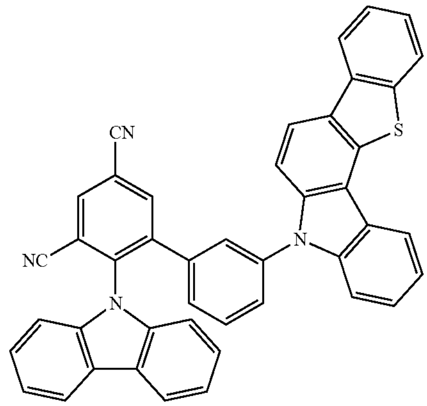
421
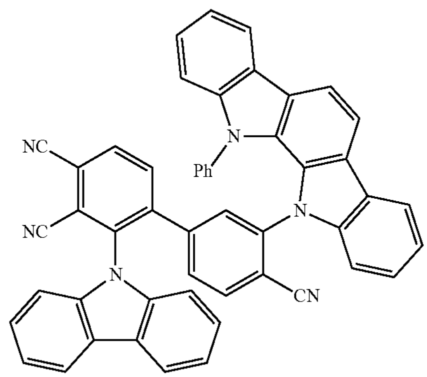
422
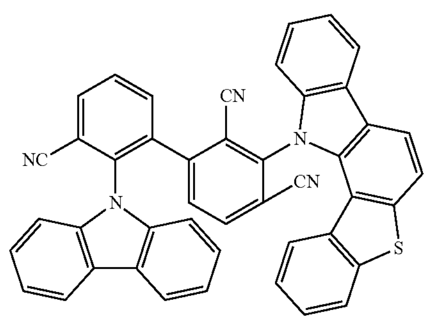
423
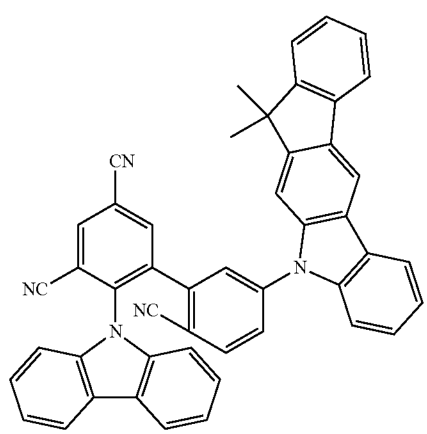

-continued
424
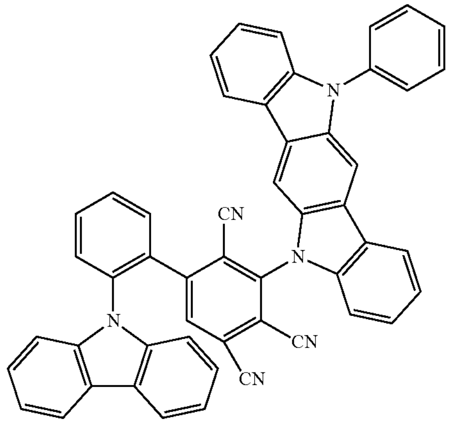
425
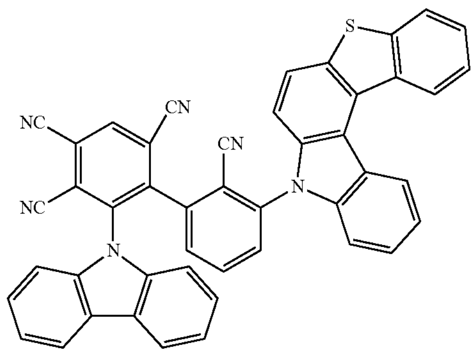
426
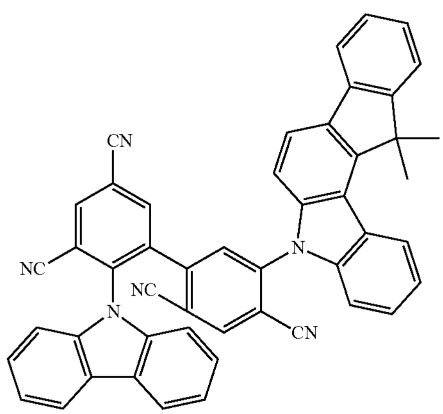
427
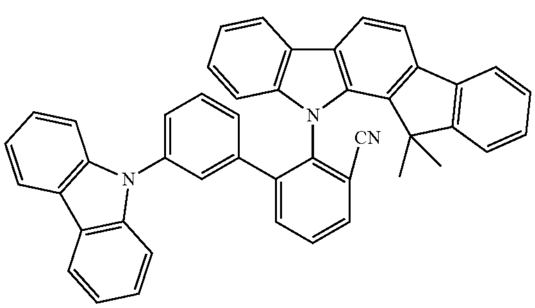
-continued
428
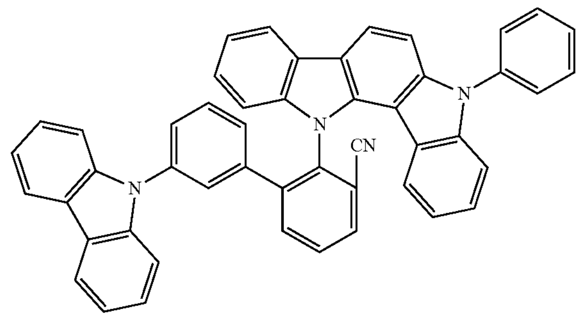
429
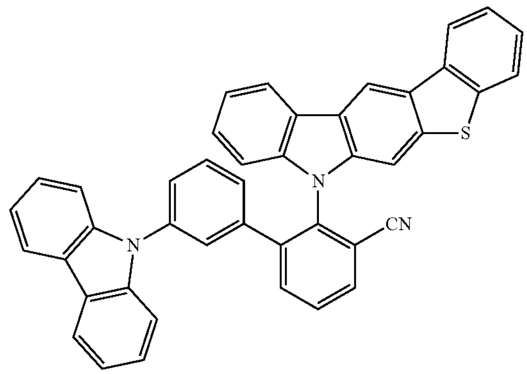
430
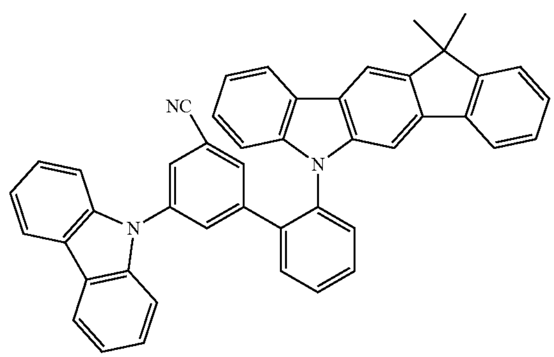
431
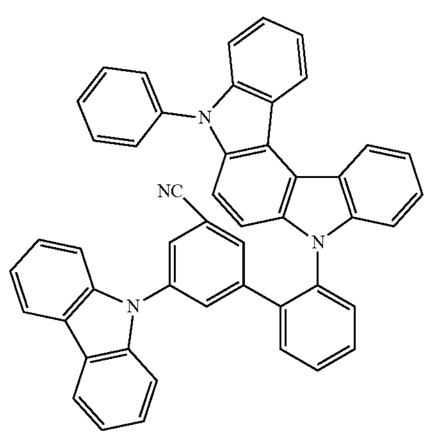

-continued
432
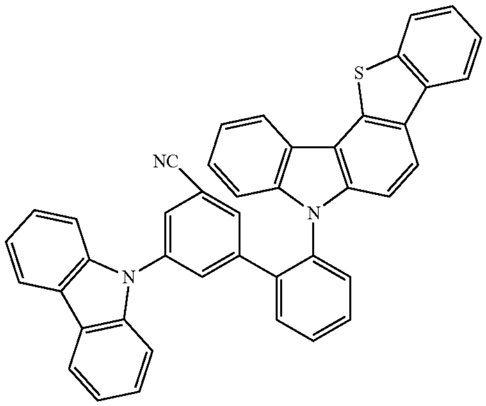
433
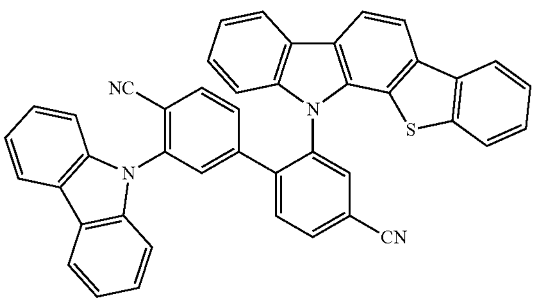
434
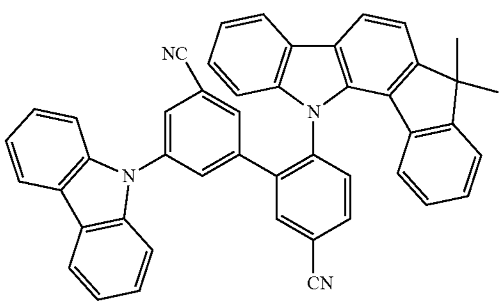
435
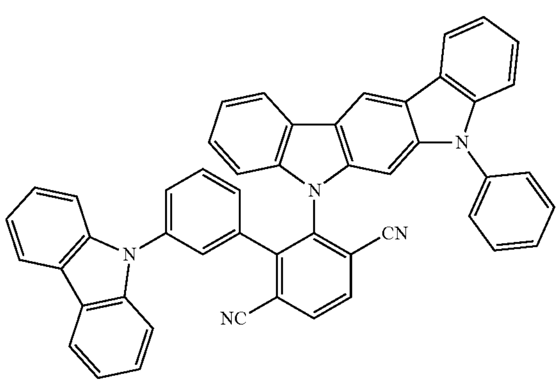
-continued
436
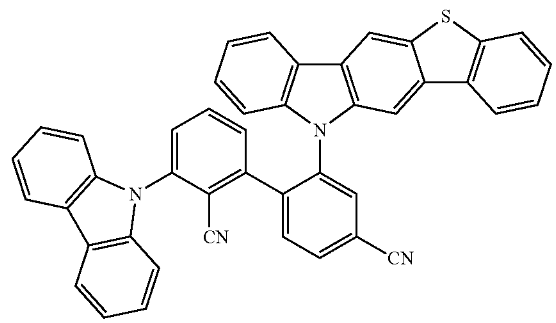
437
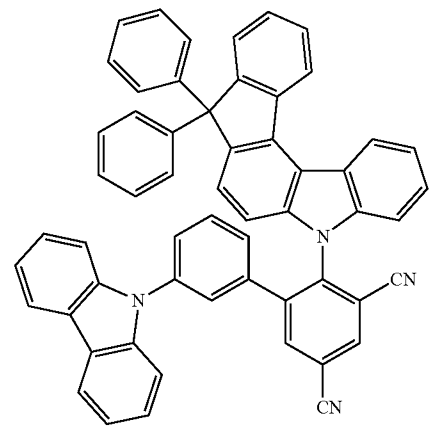
438
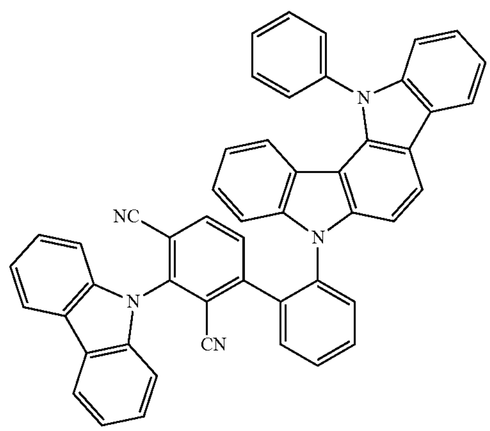
439
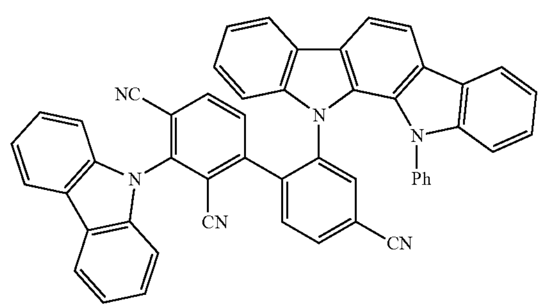

-continued
440
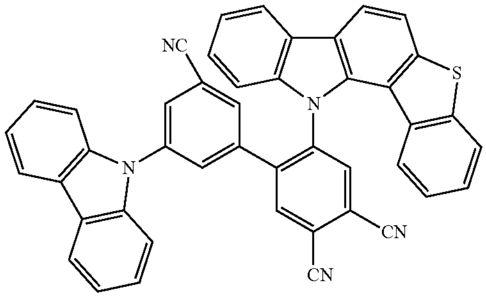
441
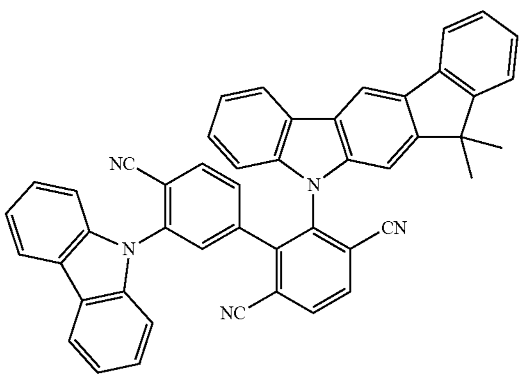
442
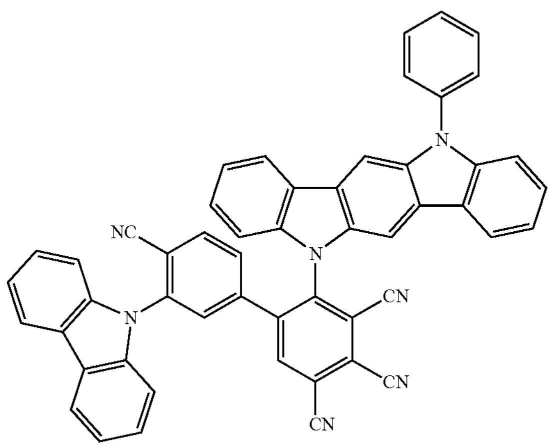
443
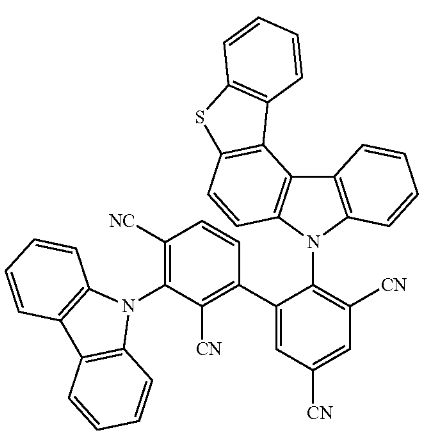
-continued
444
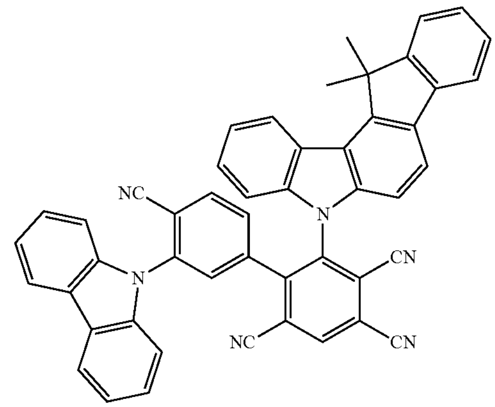
445
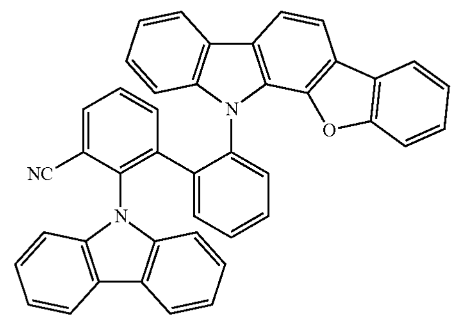
446
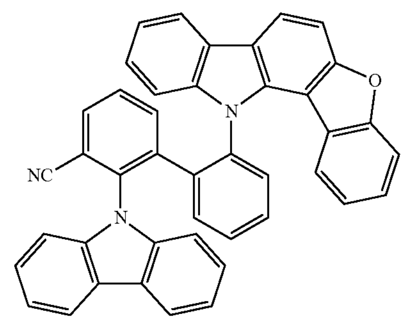
447
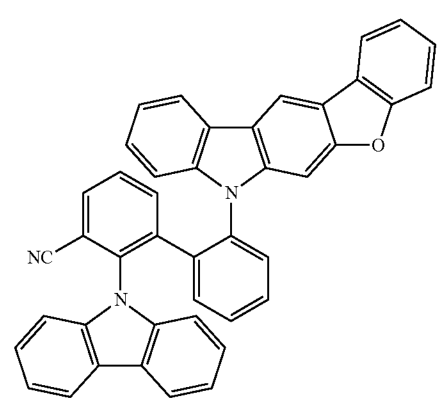

-continued
448
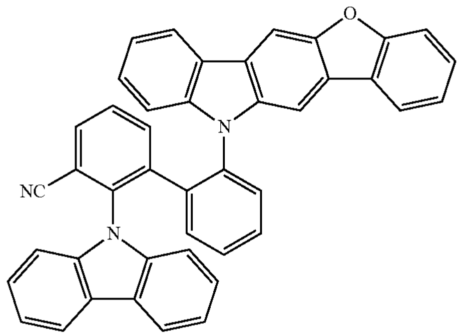
449
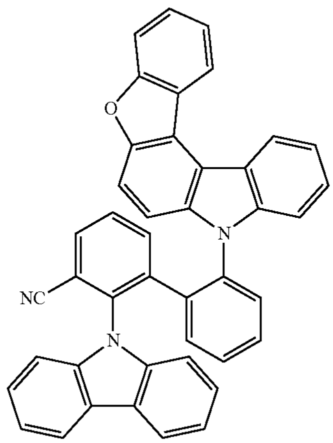
450
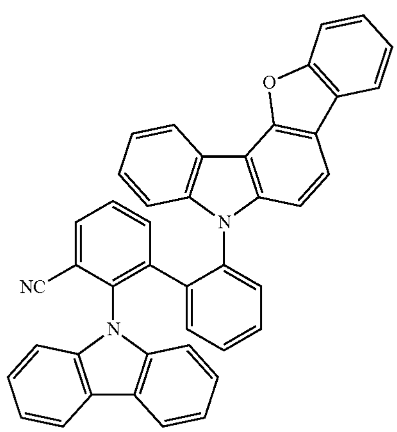
451
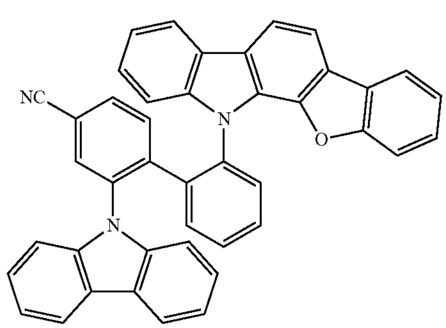
-continued
452
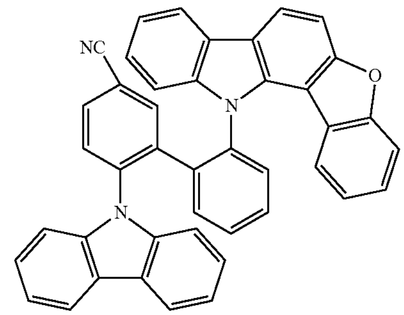
453
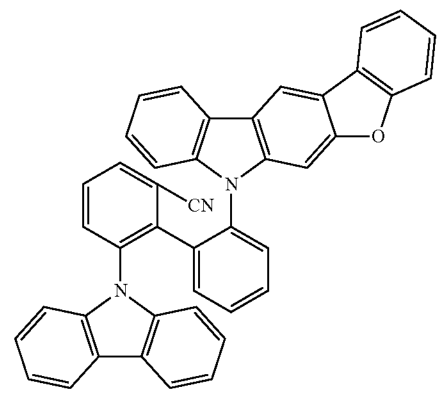
454
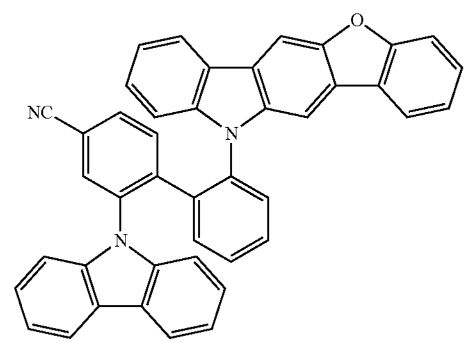
455
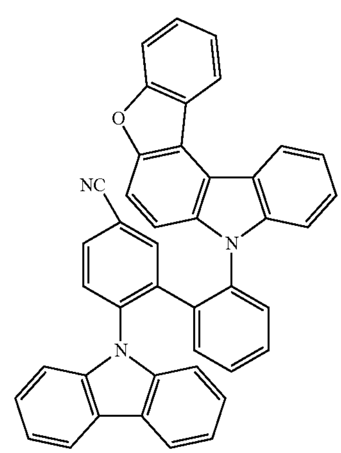

-continued
456
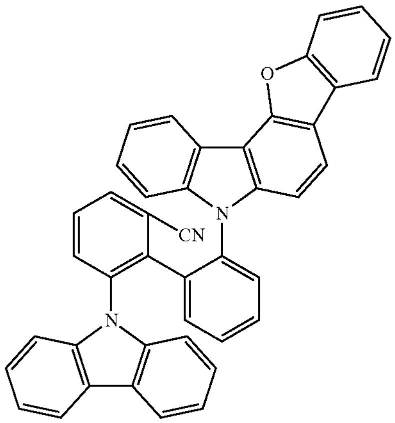
457
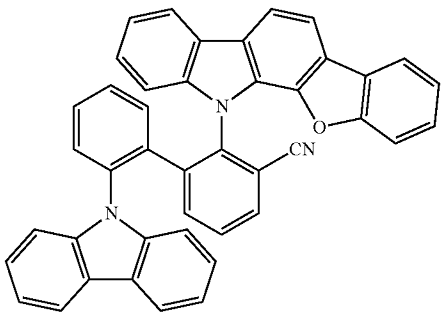
458
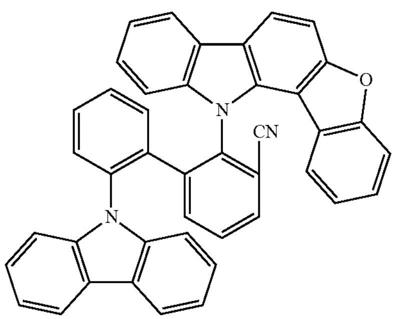
459
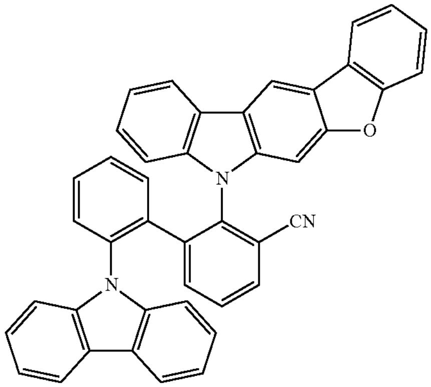
-continued
460
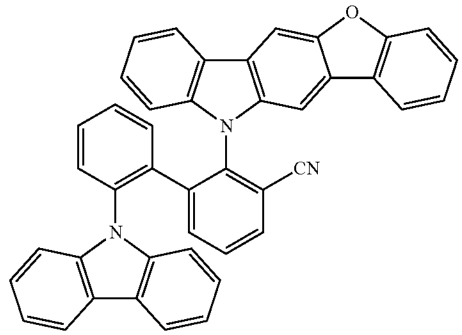
461
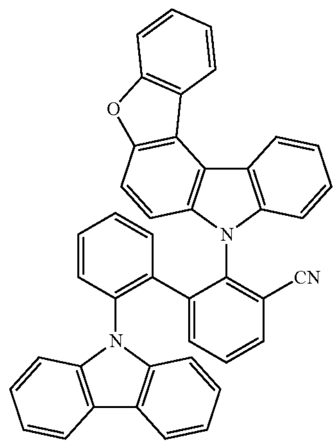
462
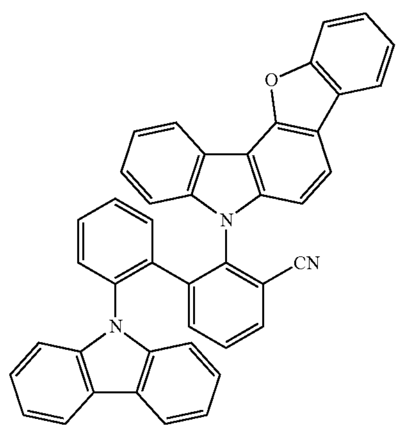
463
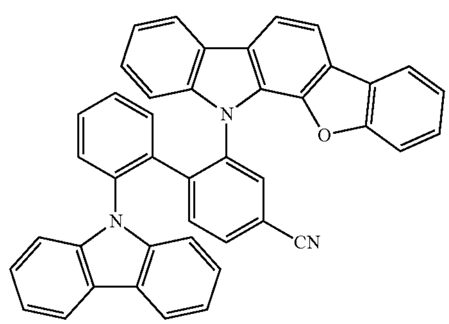

-continued
464
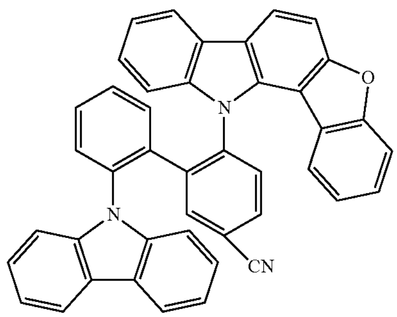
465
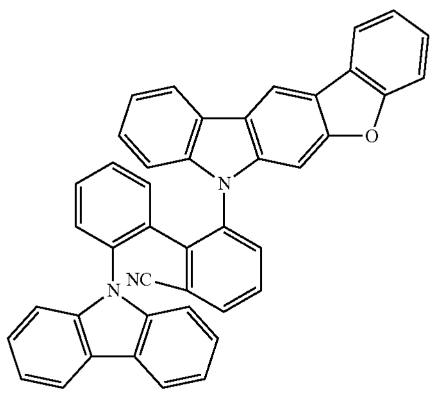
466
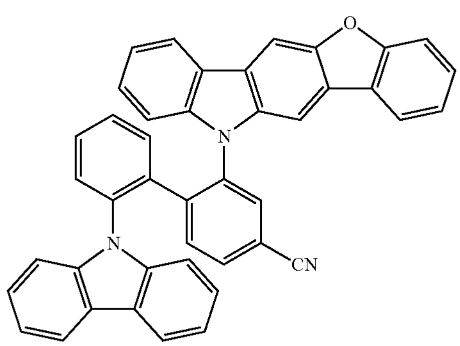
467
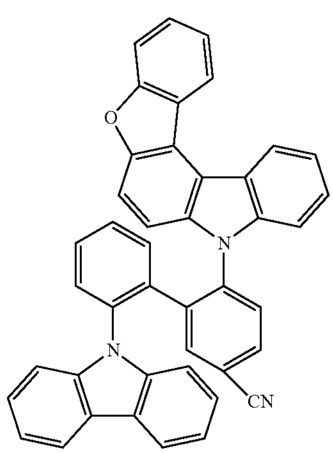
-continued
468
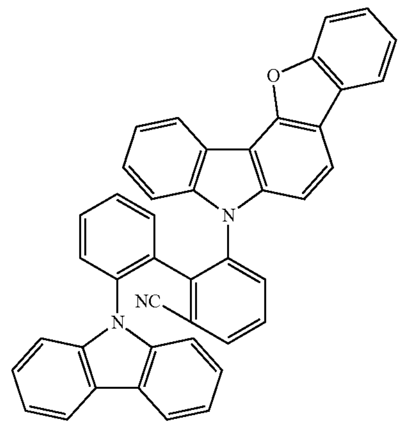
469
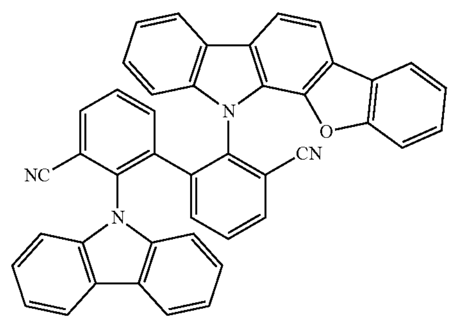
470
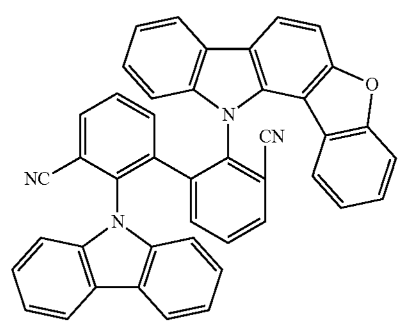
471
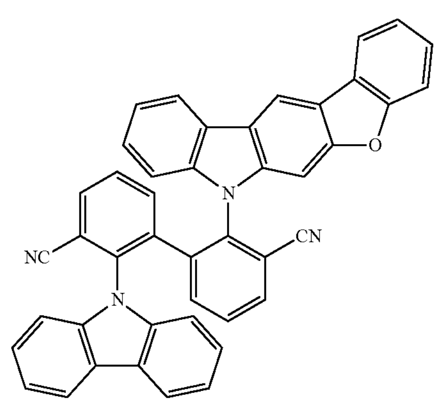

472
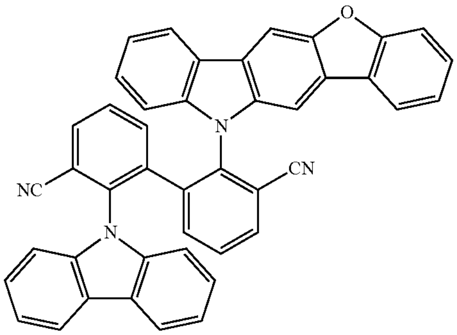
473
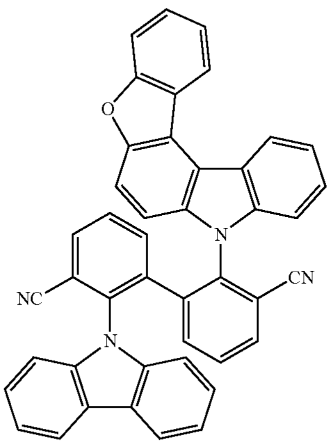
474
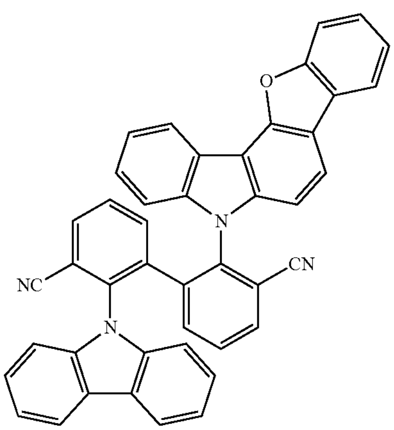
475
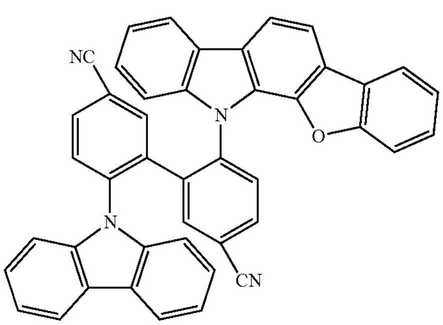
476
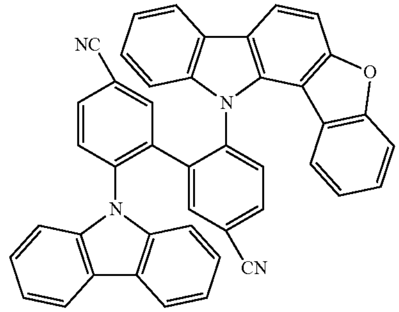
477
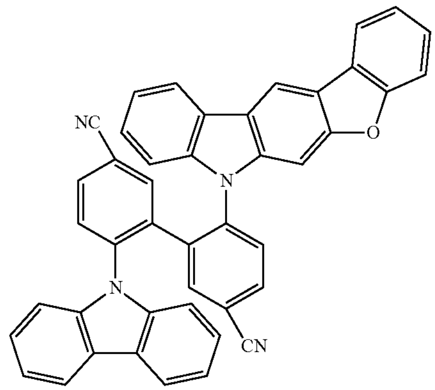
478
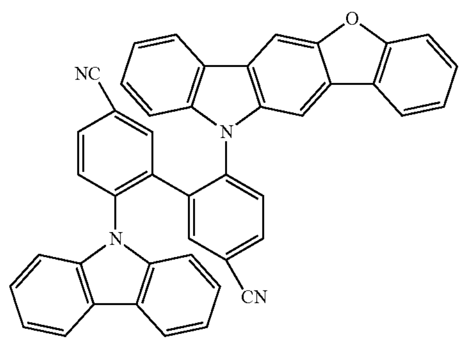
479
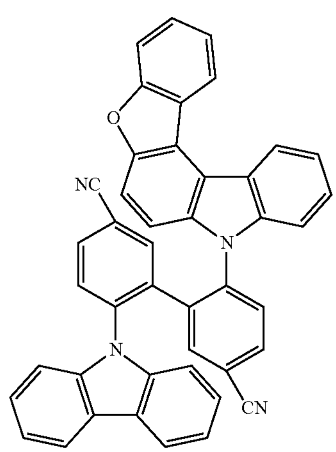

-continued
480
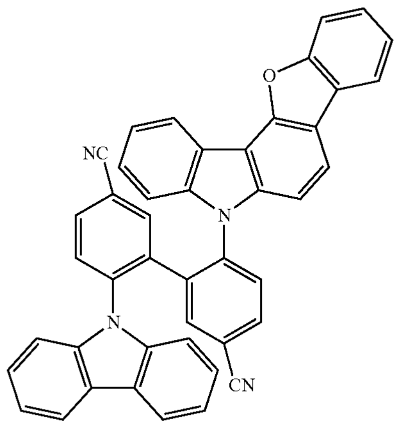
481
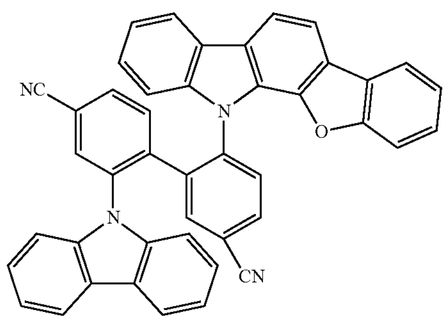
482
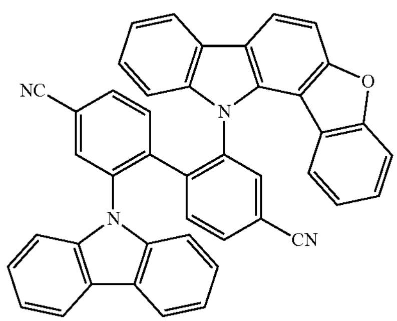
483
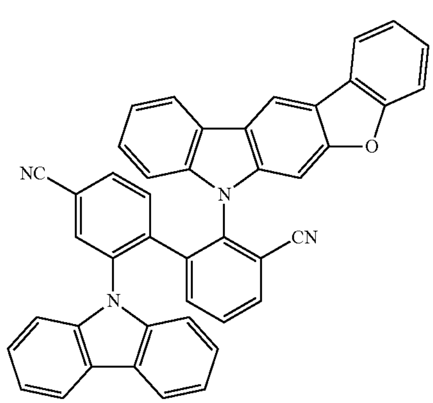
-continued
484
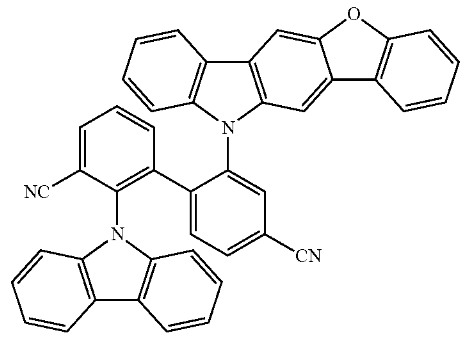
485
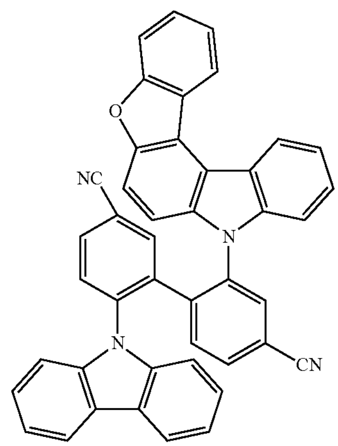
486
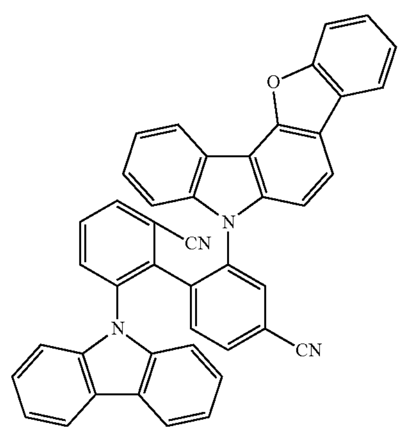
487
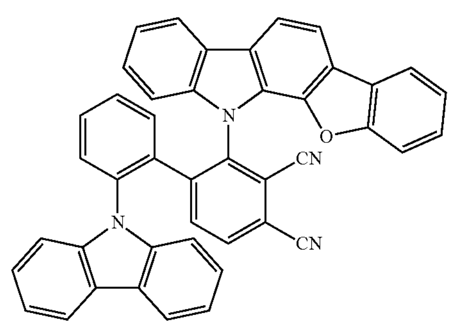

488
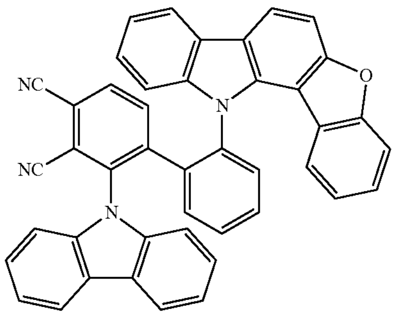
489
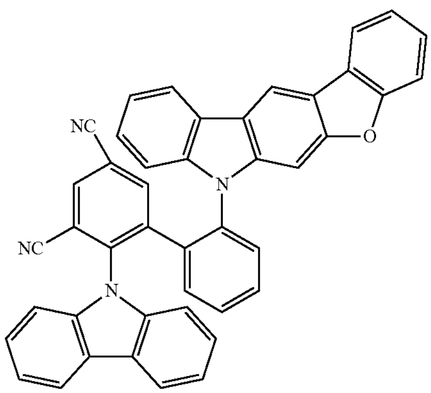
490
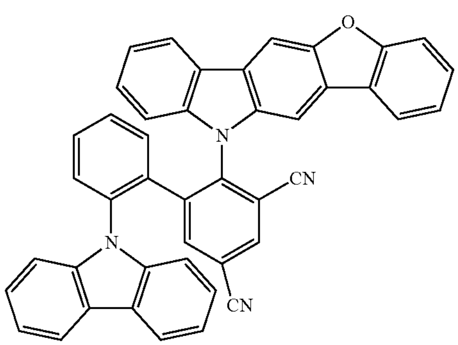
491
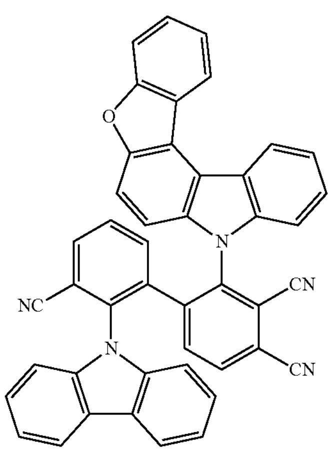
492
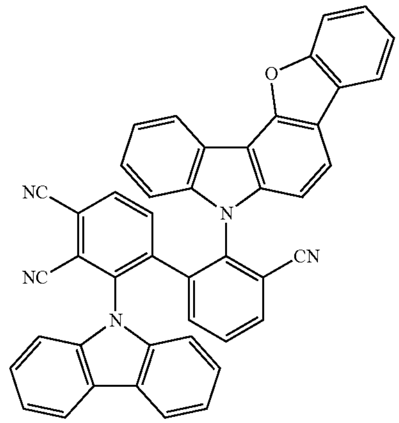
493
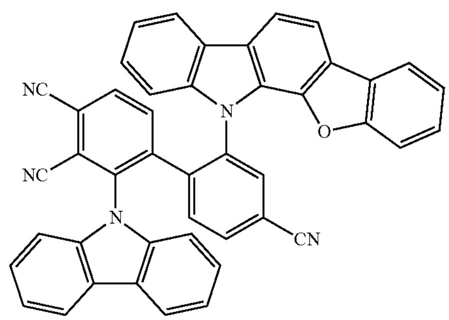
494
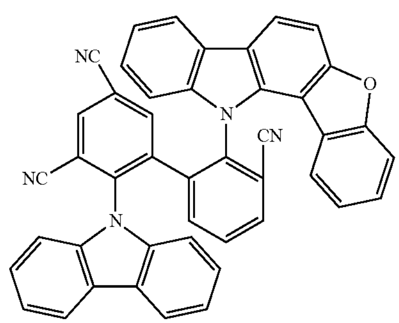
495
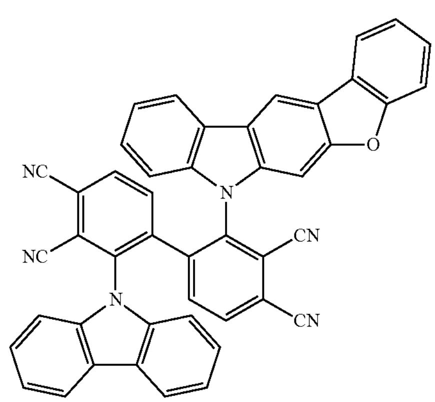

-continued
496
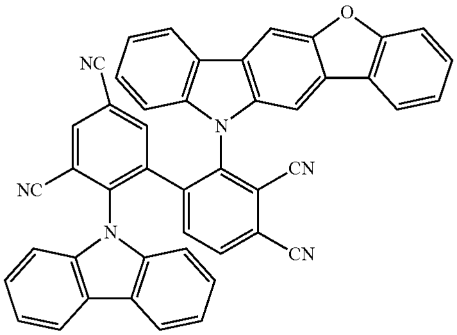
497
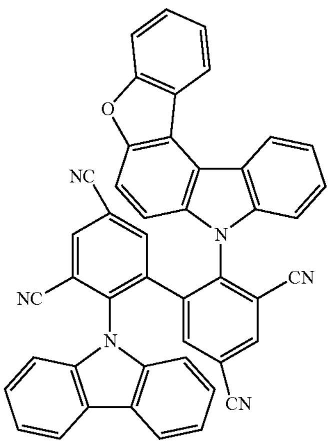
498
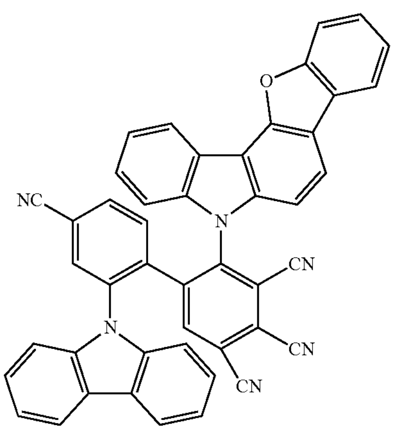
499
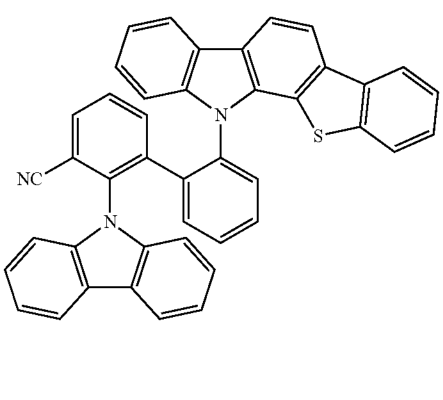
-continued
500
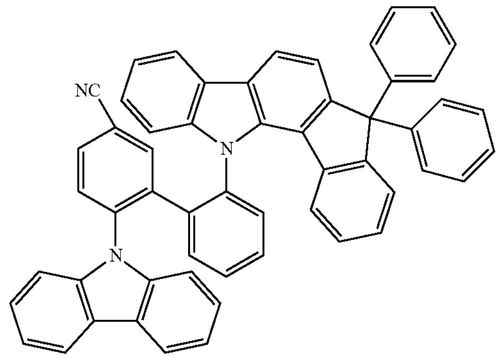
501
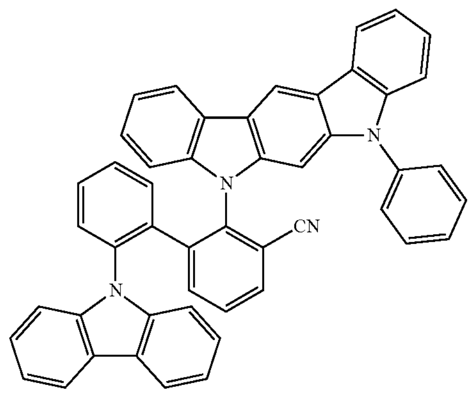
502
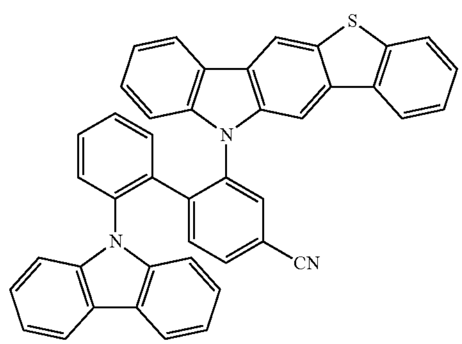
503
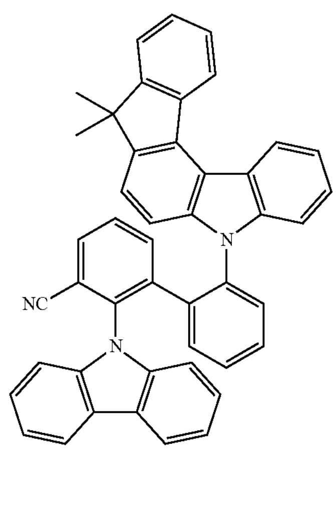

-continued
504
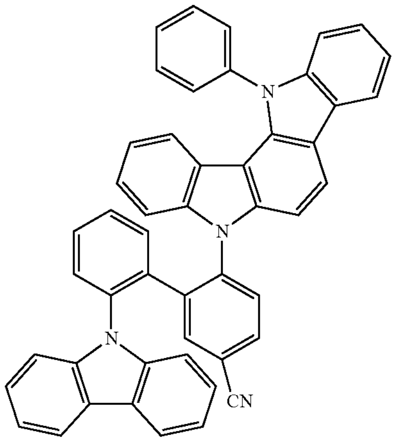
505
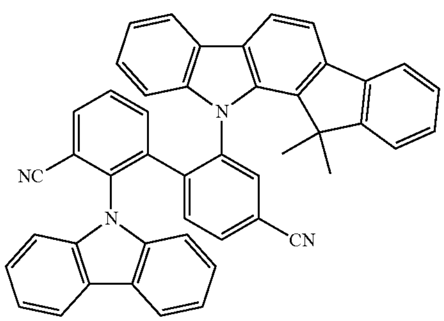
506
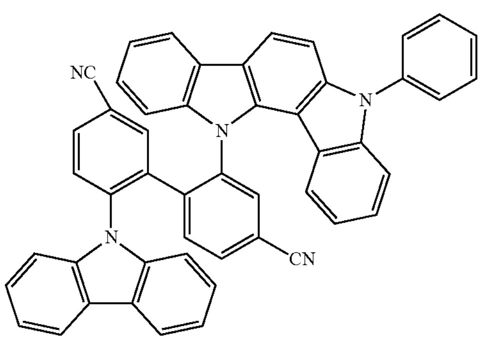
507
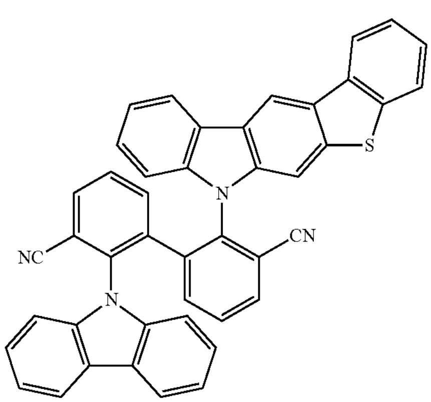
-continued
508
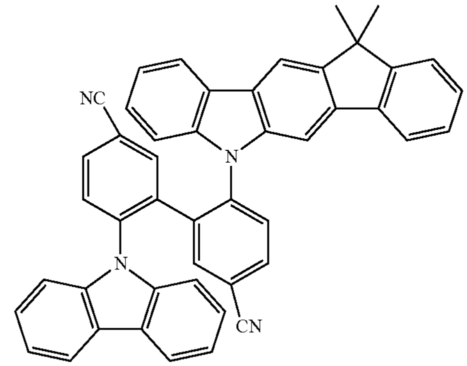
509
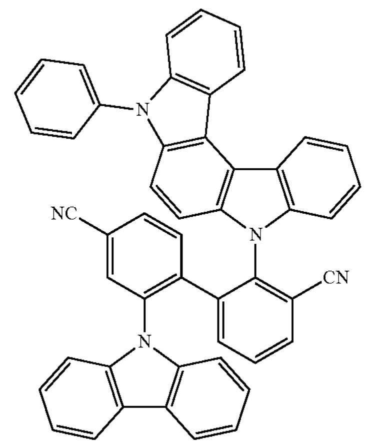
510
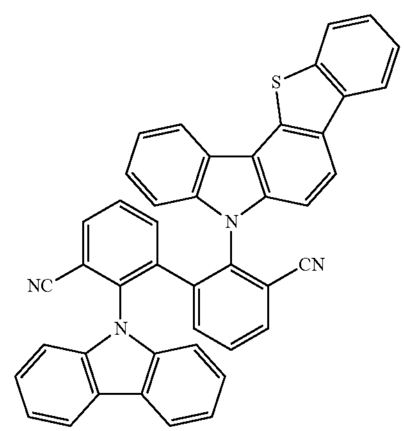
511
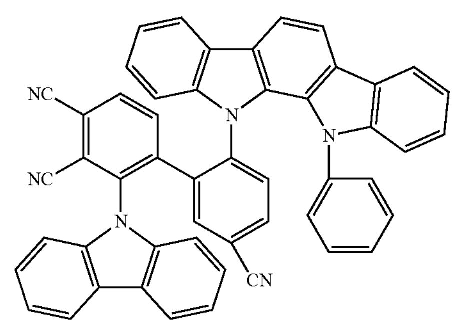

-continued
512
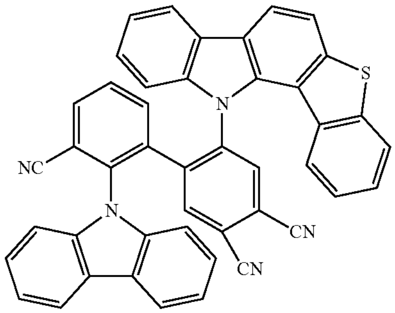
513
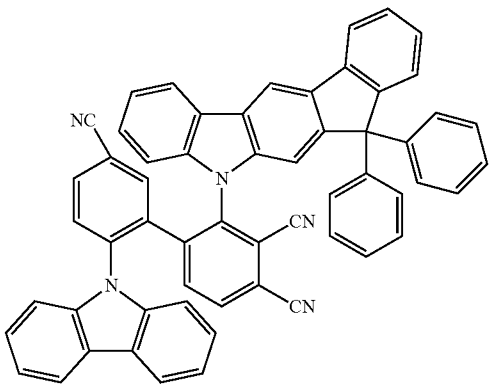
514
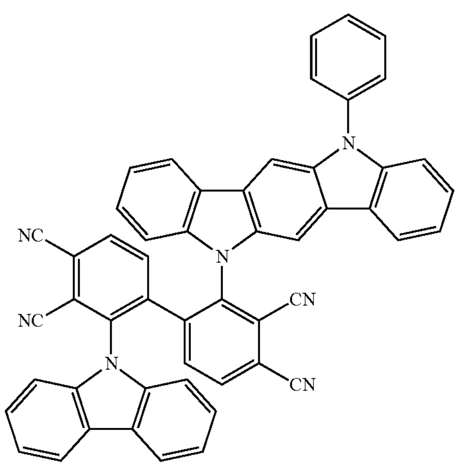
515
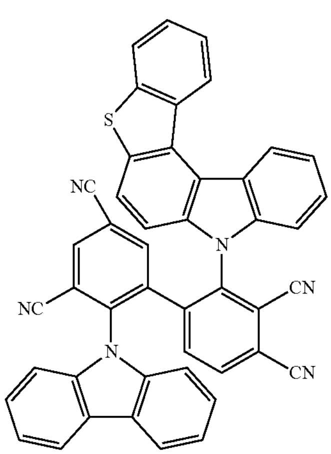
-continued
516
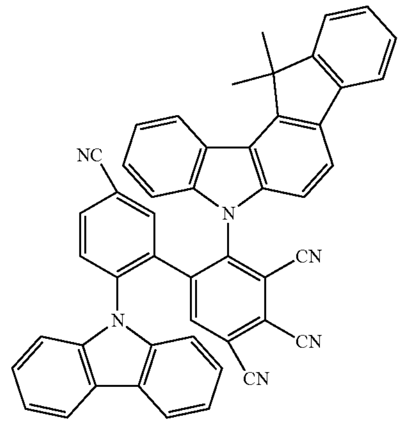
517
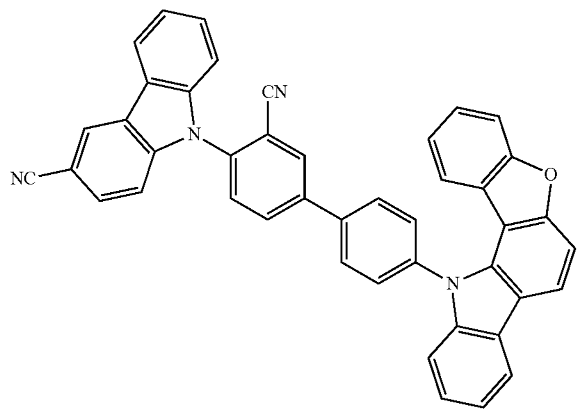
518
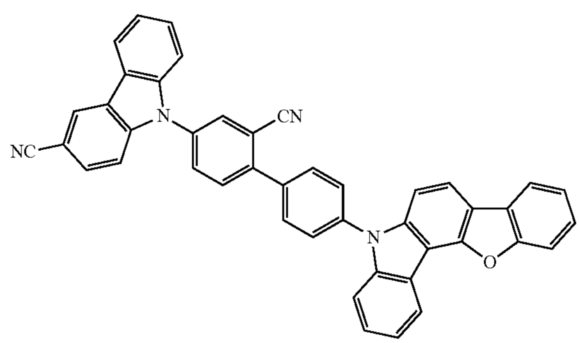
519
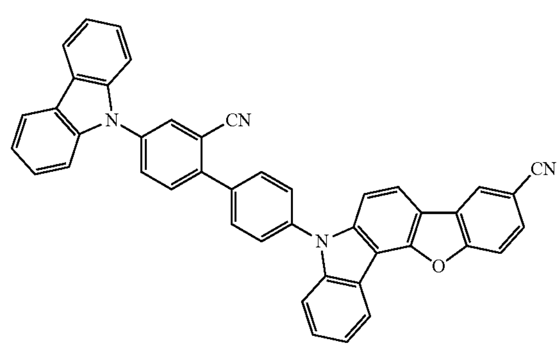

-continued
520
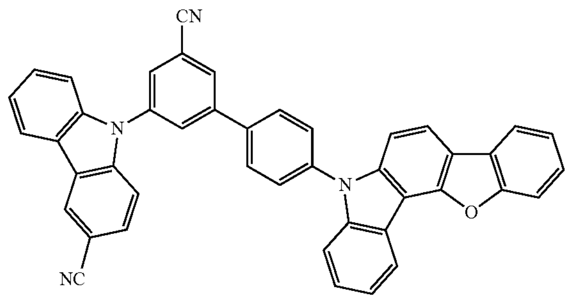
521
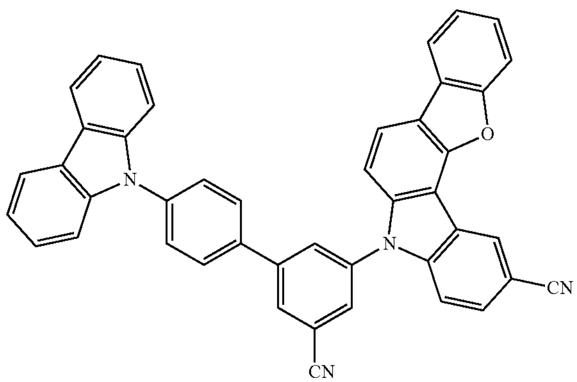
522
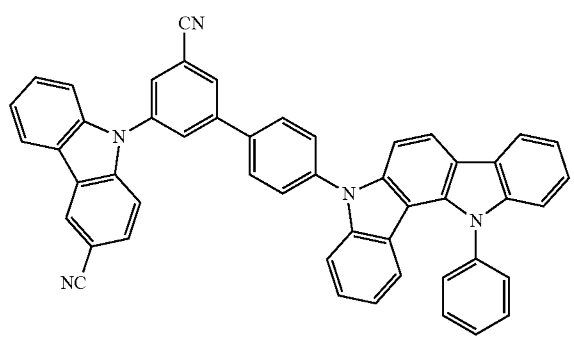
523
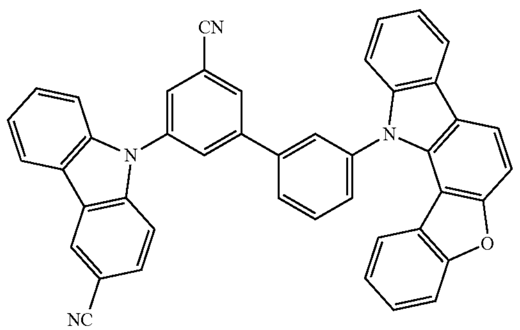
-continued
524
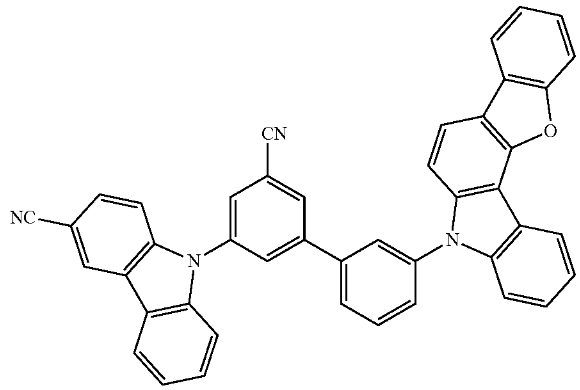
525
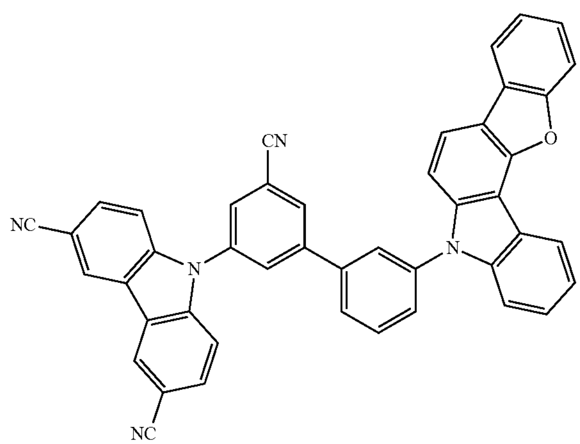
526
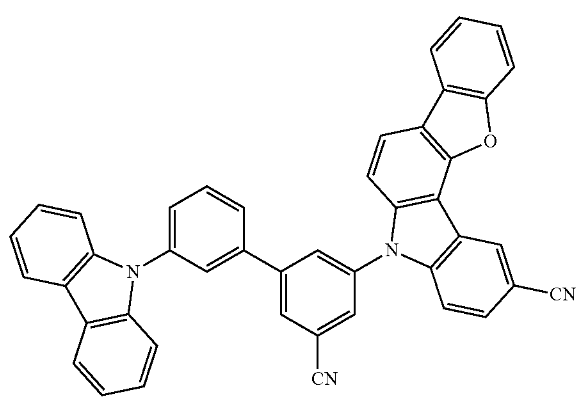

-continued
527
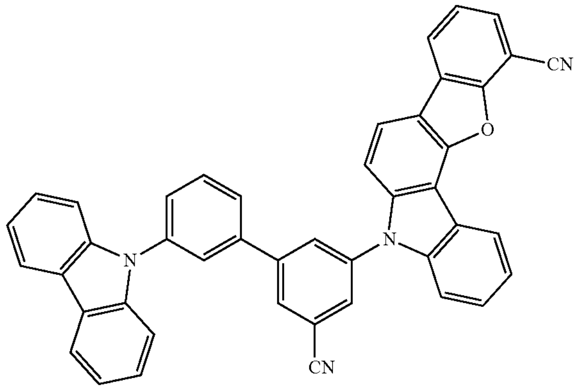
528
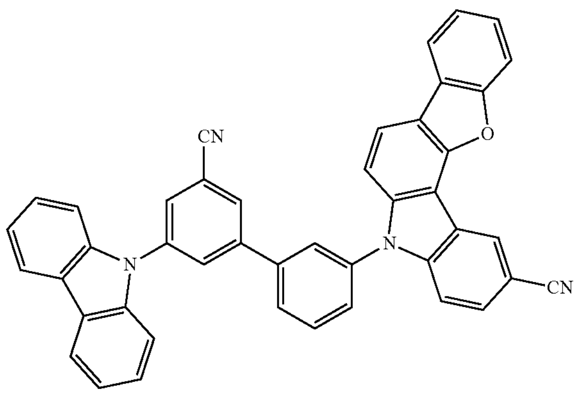
529
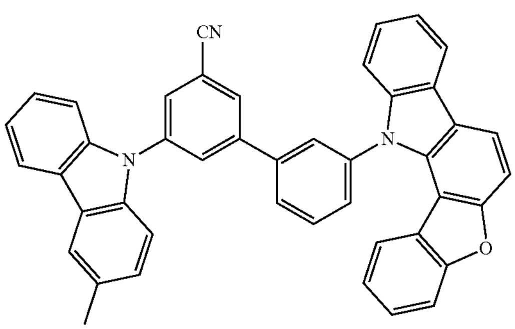
530
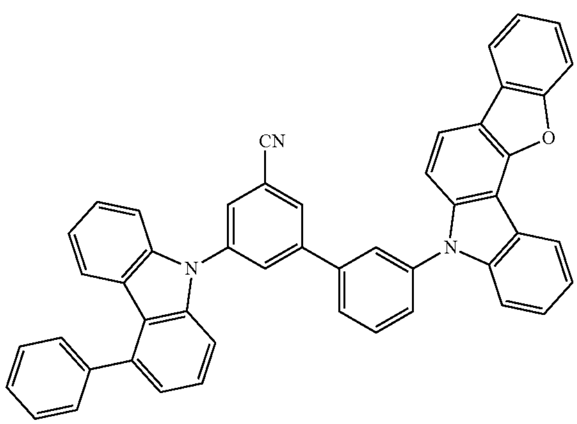
-continued
531
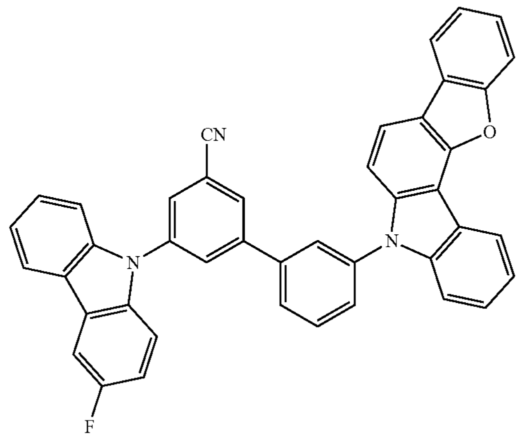
532
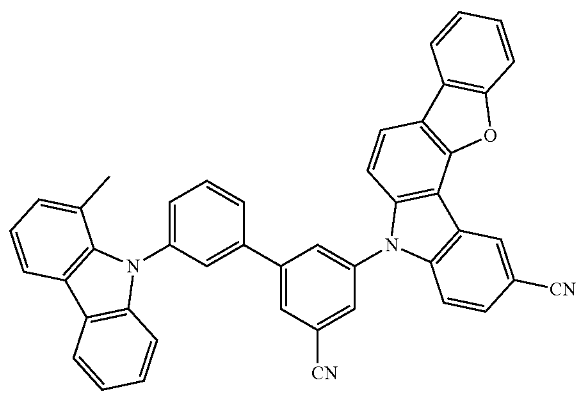
533
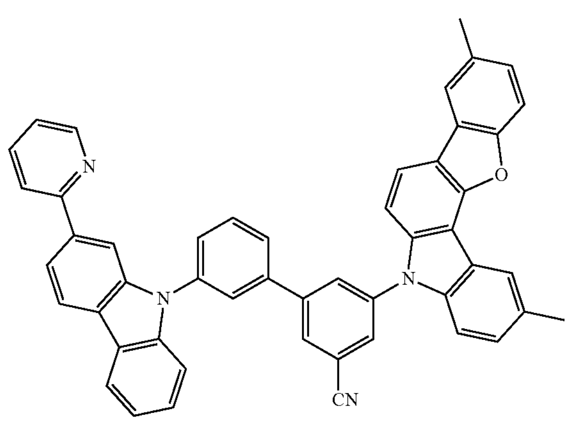

-continued
534
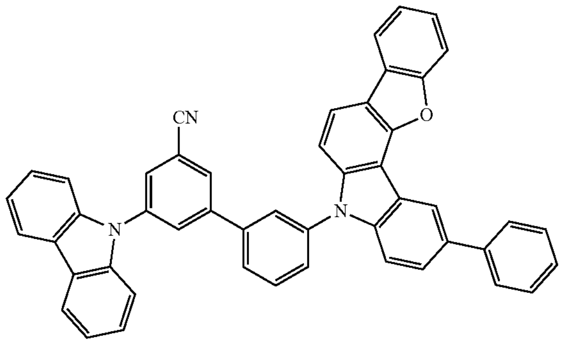
535
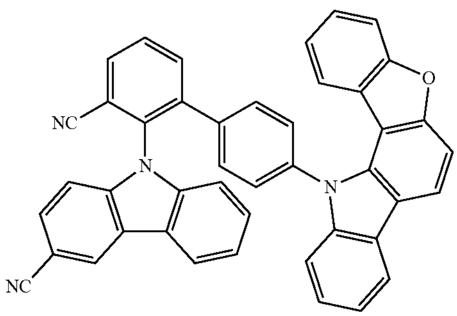
536
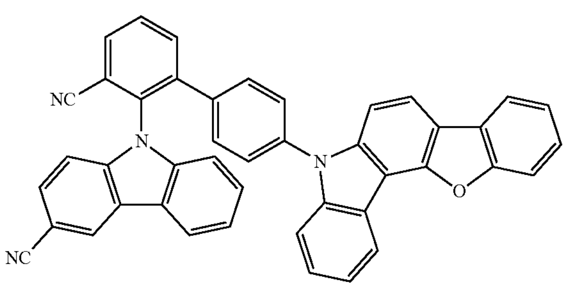
537
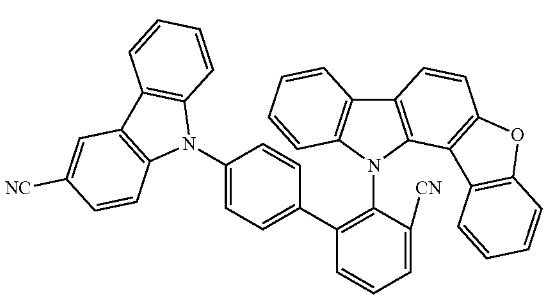
-continued
538
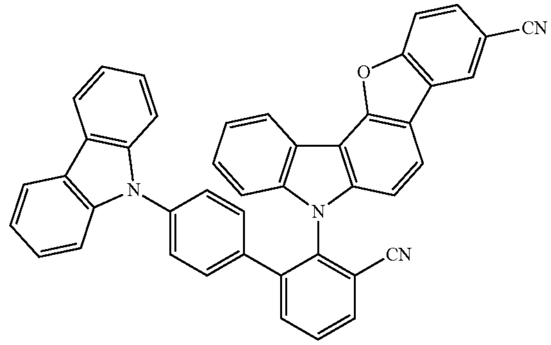
539
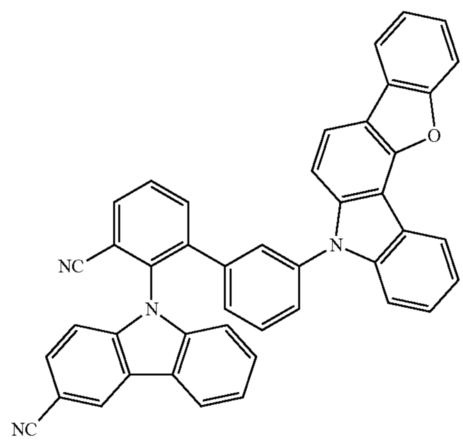
540
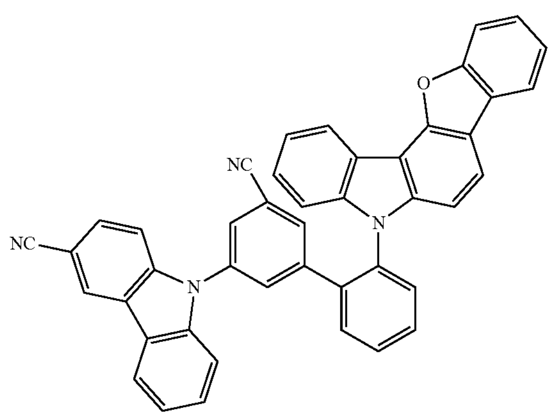
541
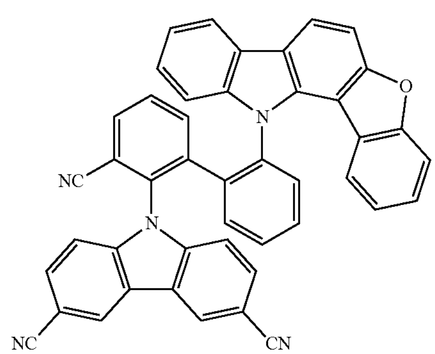

-continued
542
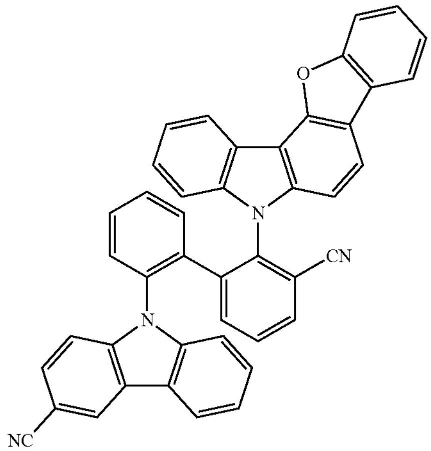
543
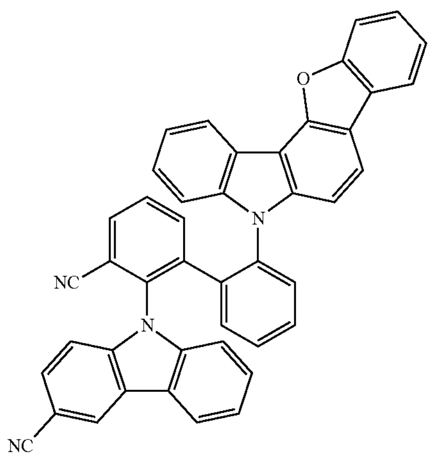
544
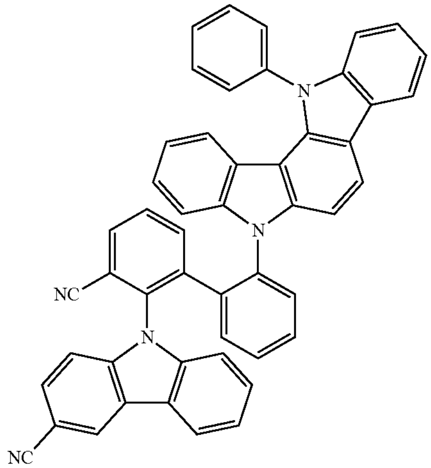
-continued
545
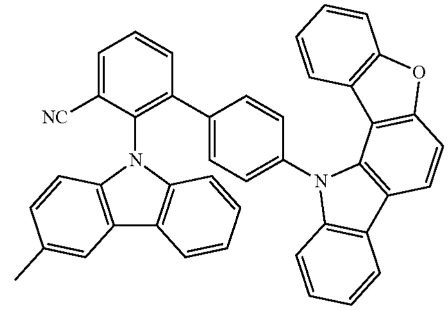
546
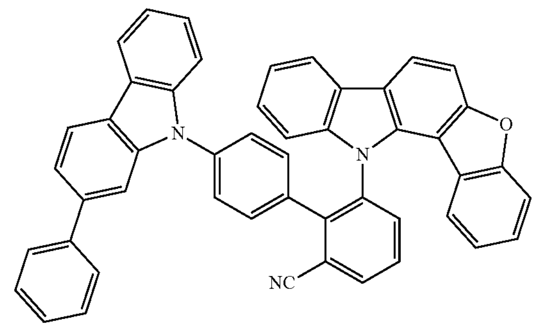
547
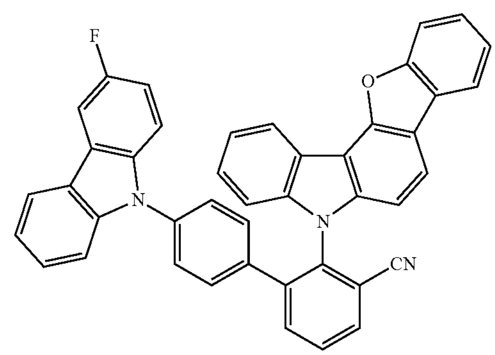
548
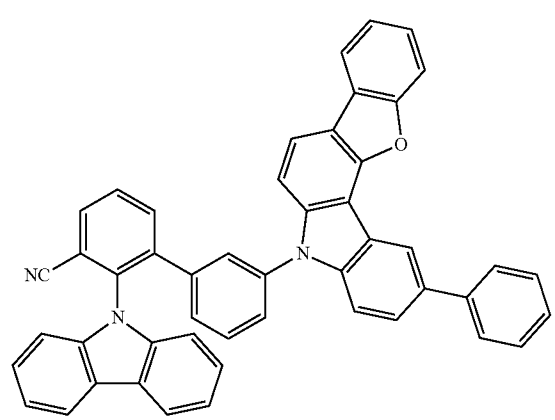

-continued
549
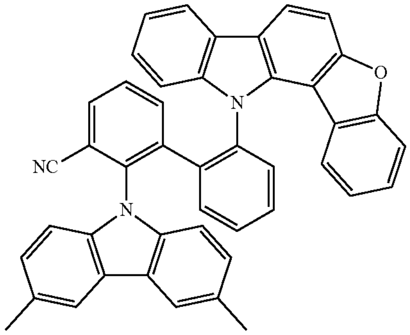
550
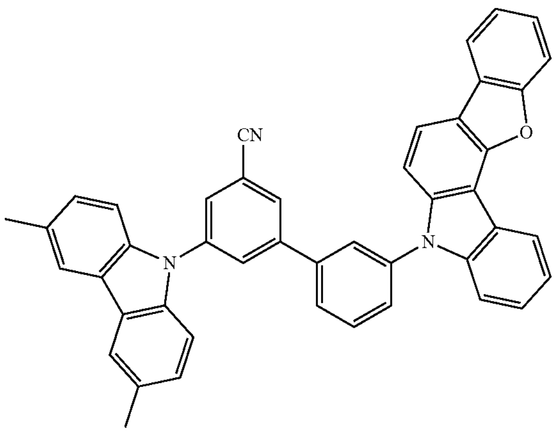
551
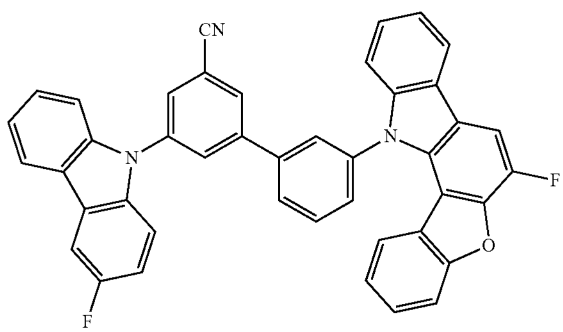
552
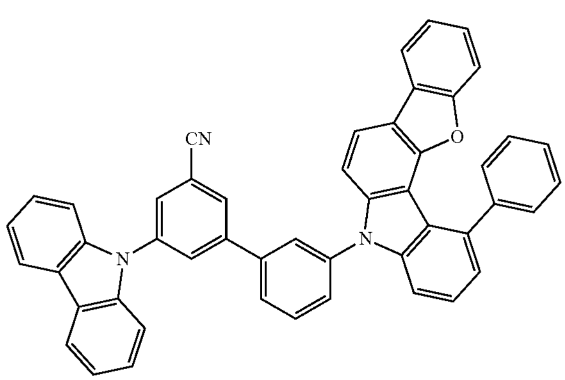
-continued
553
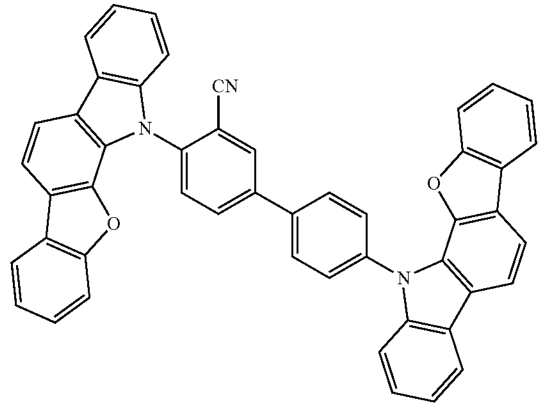
554
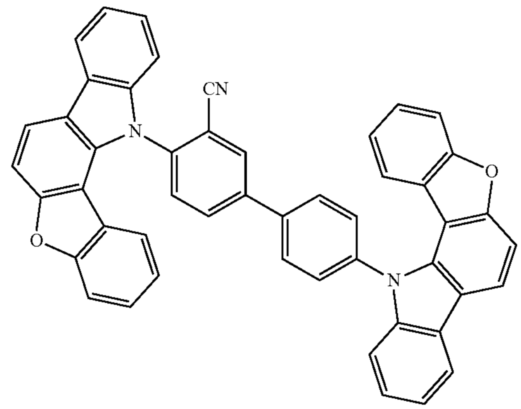
555
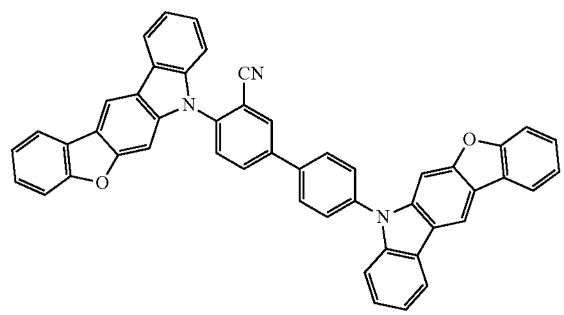
556
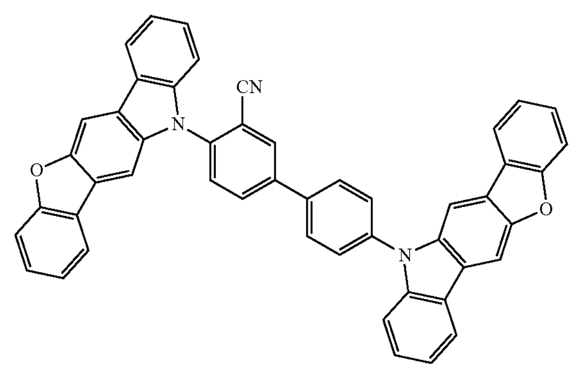

-continued
557
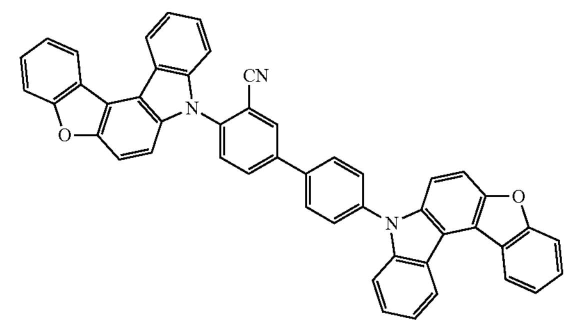
558
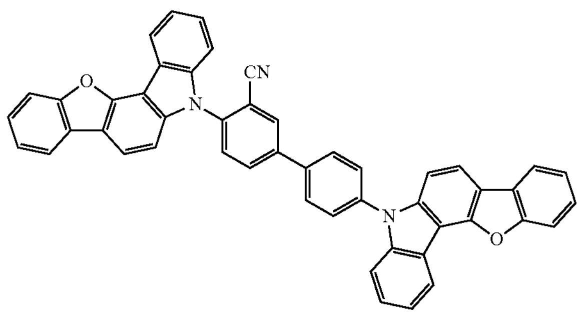
559
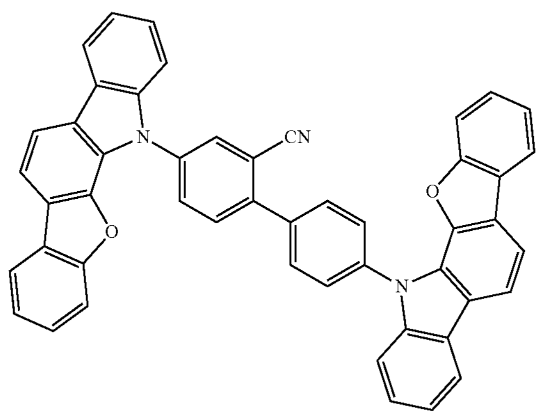
560
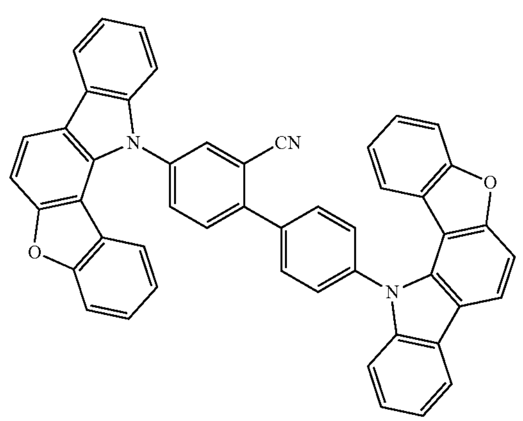
-continued
561
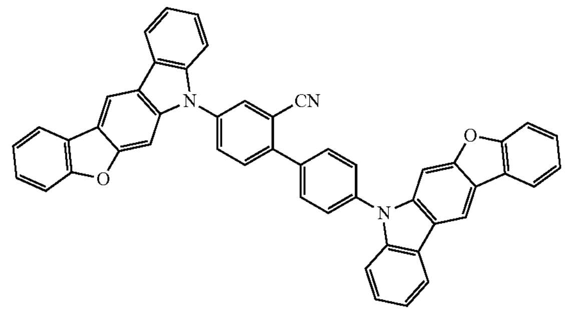
562
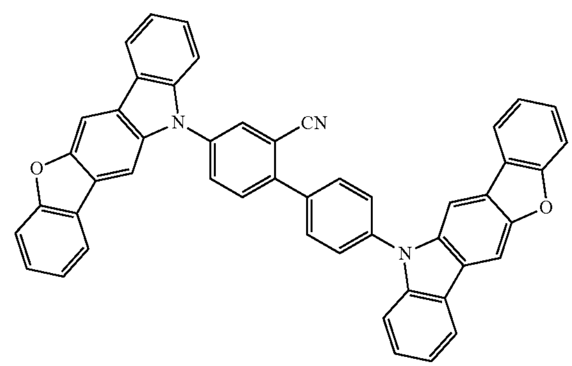
563
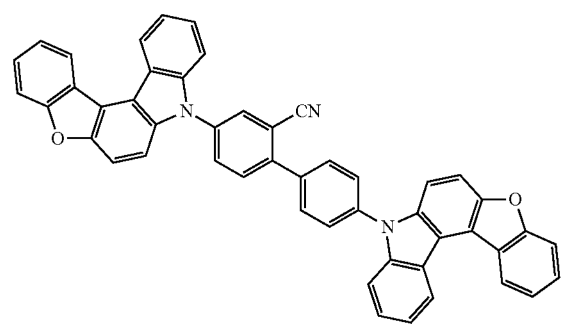
564
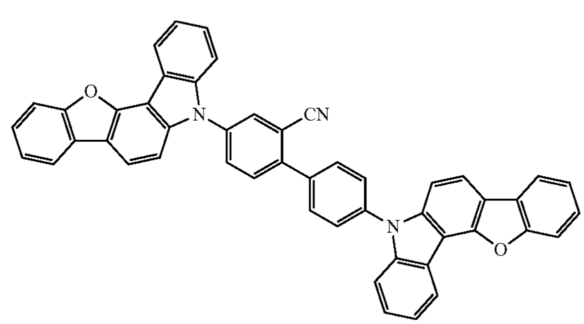

-continued
565
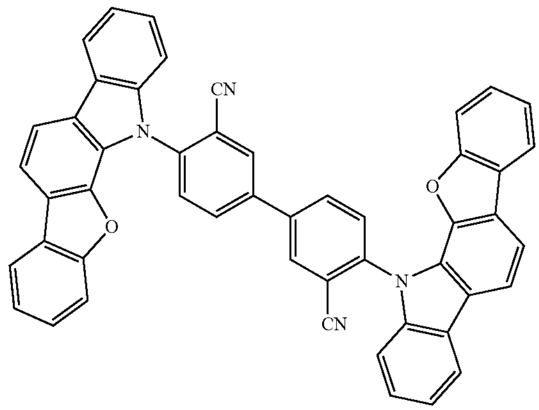
566
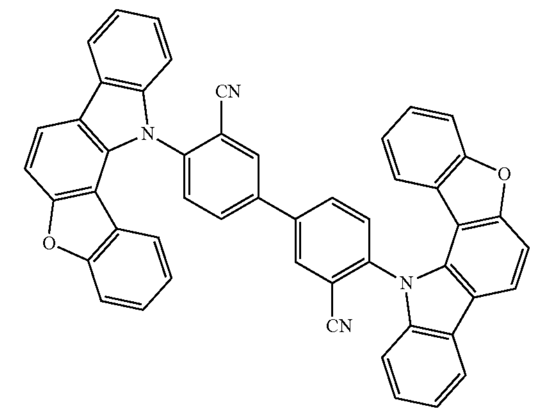
567
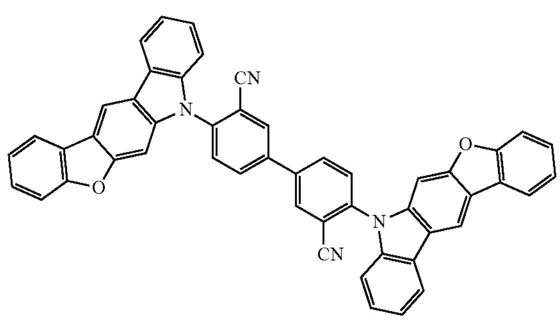
568
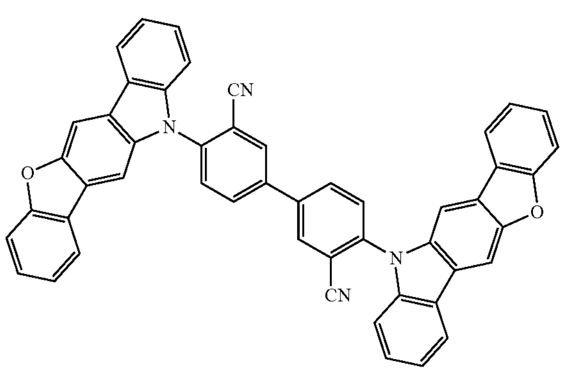
-continued
569
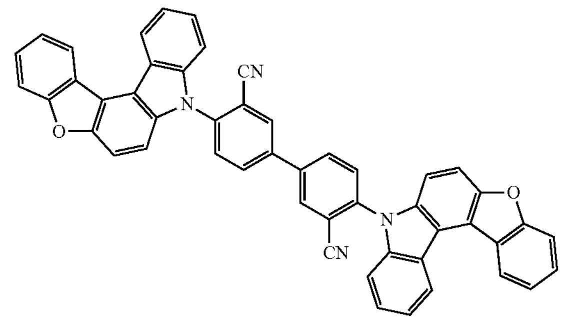
670
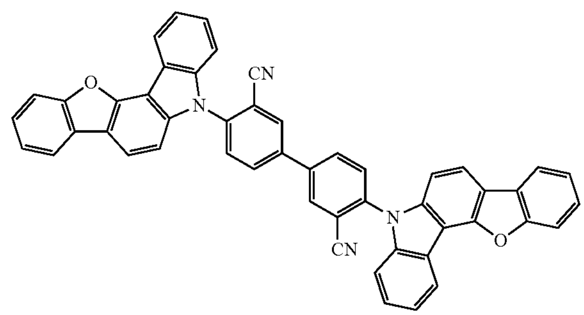
571
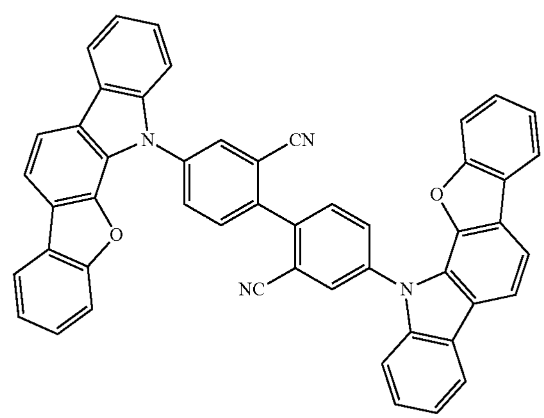
572
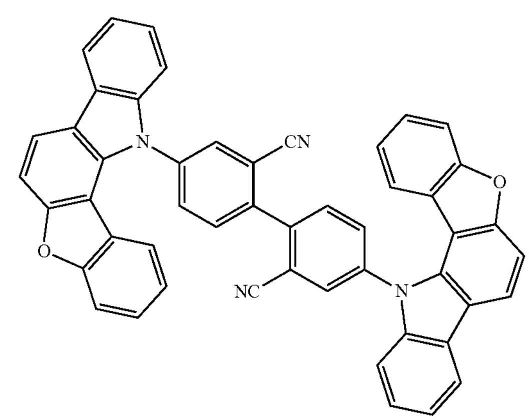

573
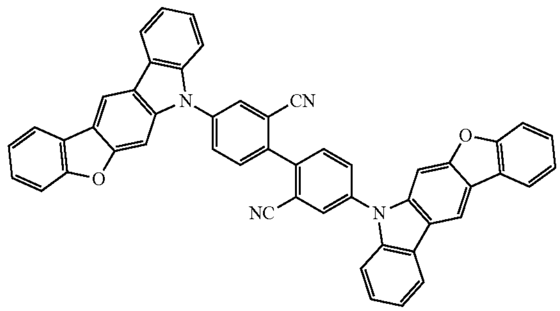
574
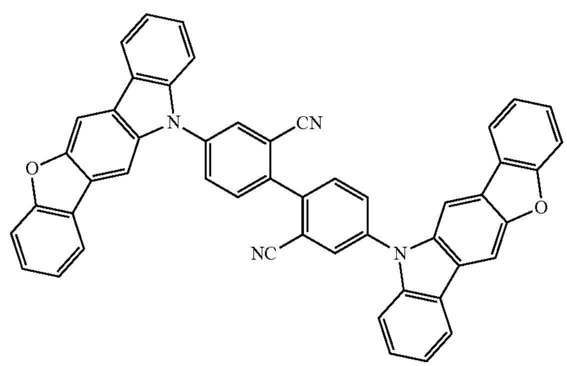
575
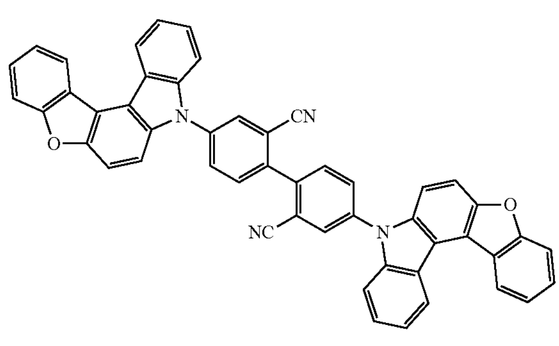
576
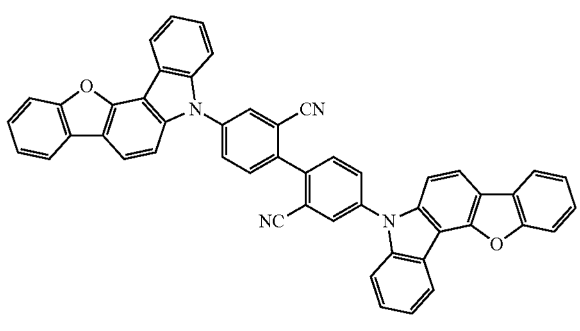
577
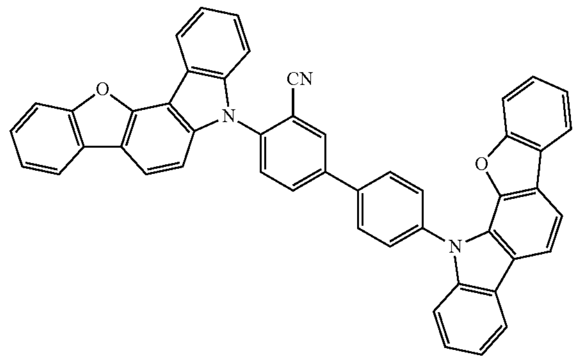
578
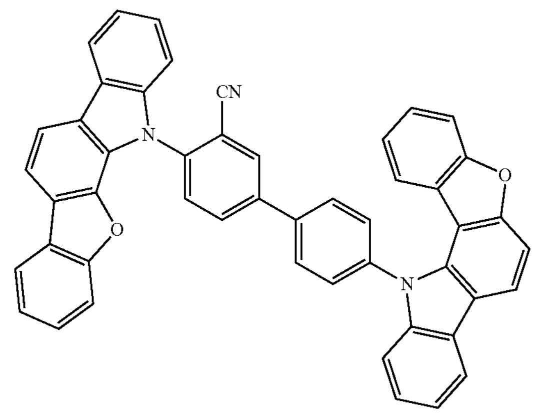
579
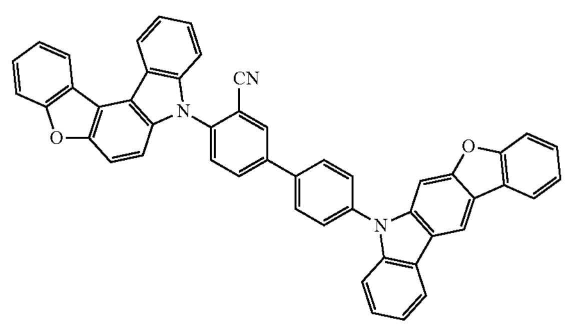
580
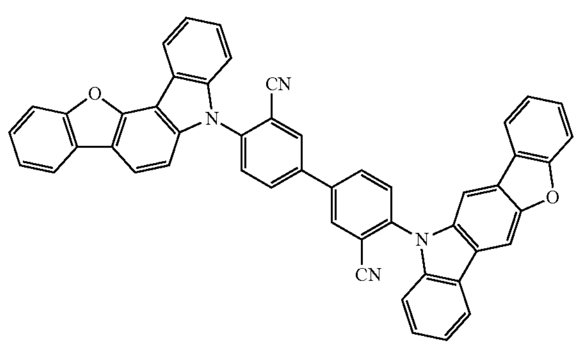

-continued
581
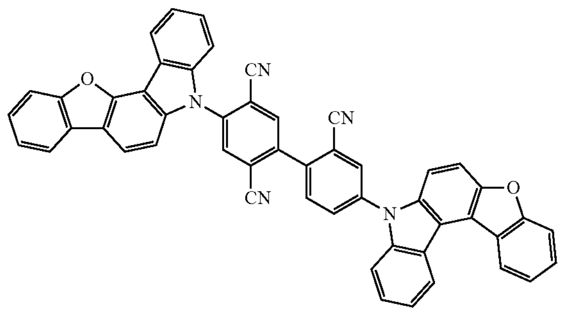
852
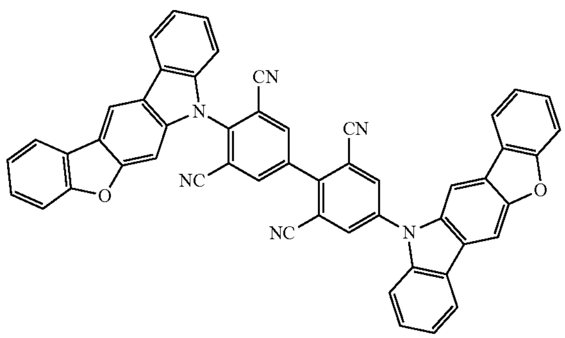
583
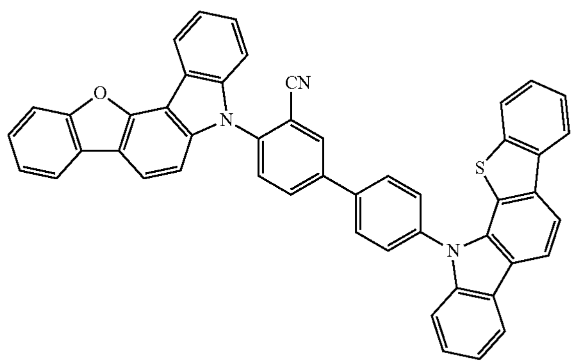
584
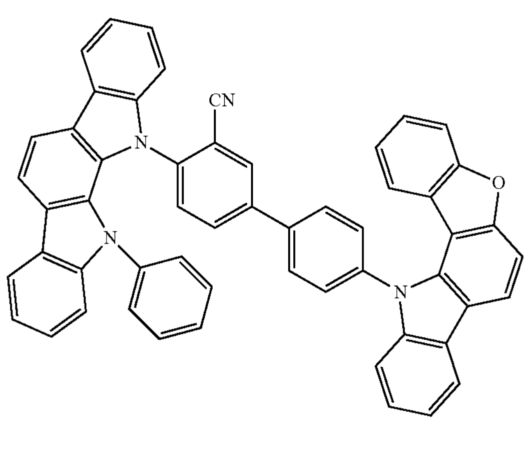
-continued
585
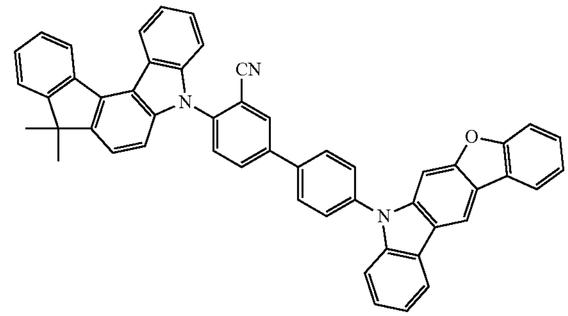
586
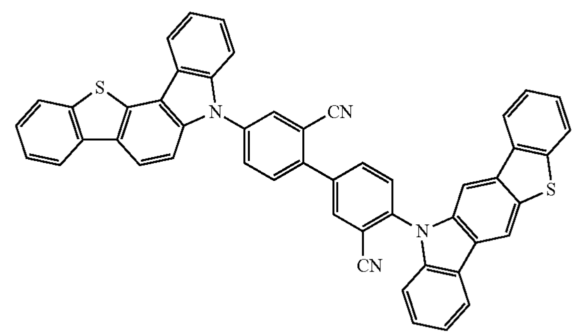
587
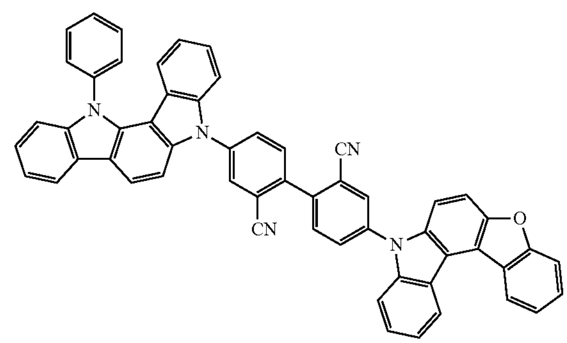
588
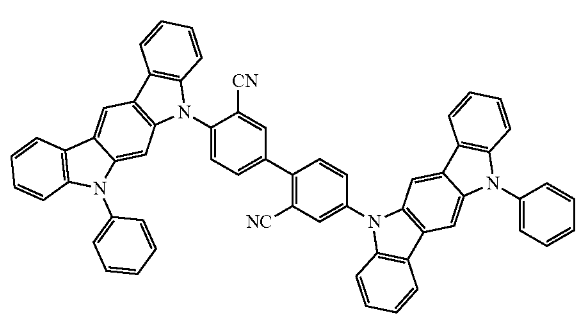

589
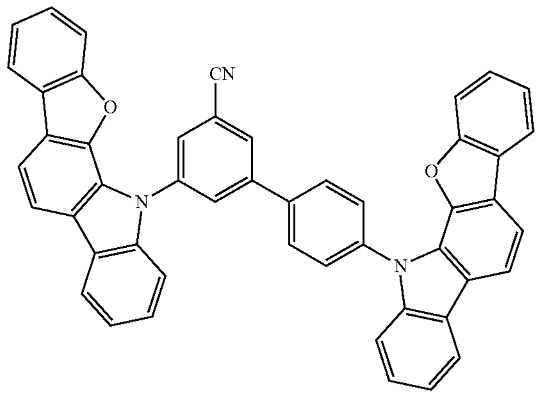
590
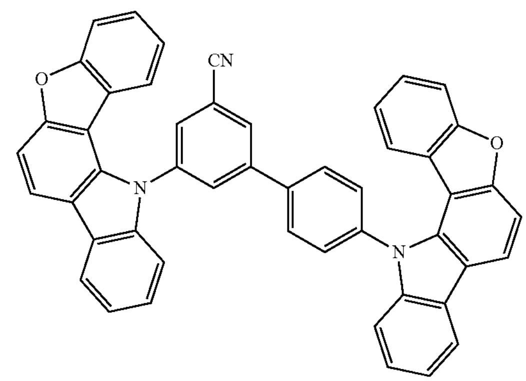
591
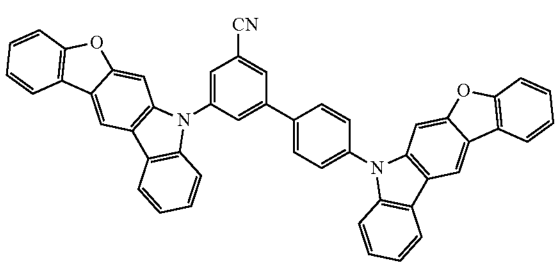
592
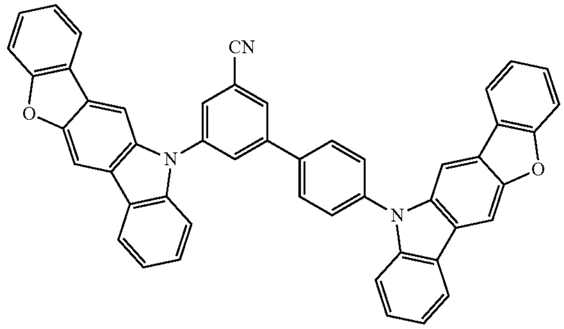
593
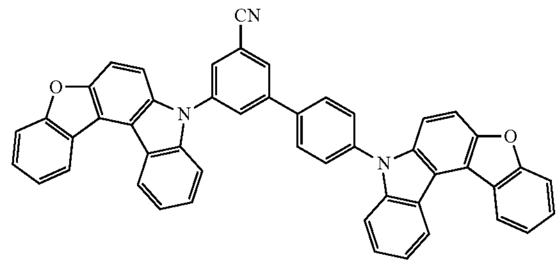
594
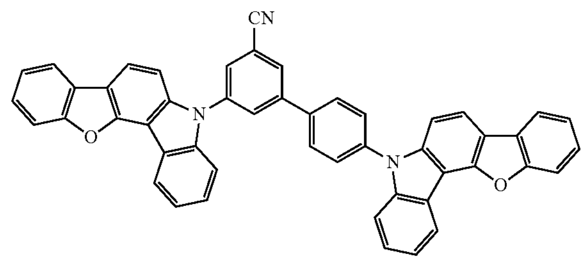
595
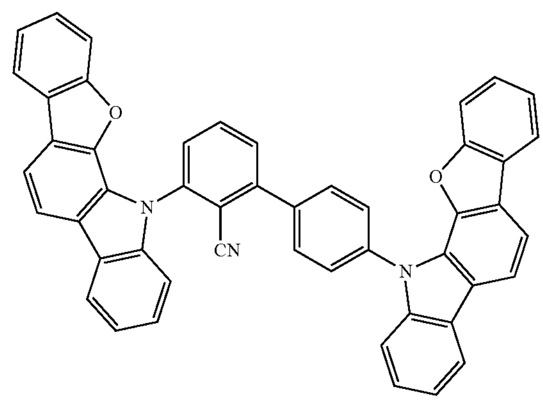
596
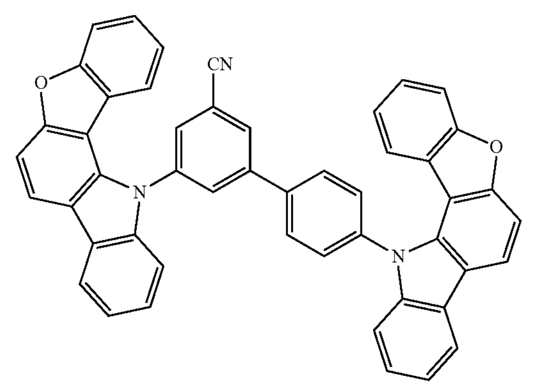
597
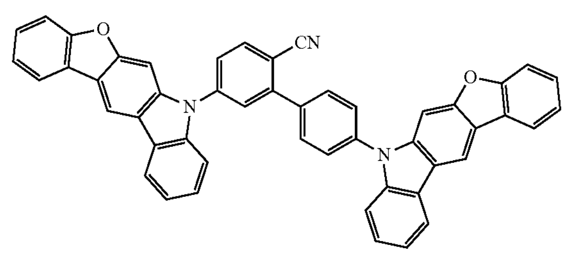

-continued
598
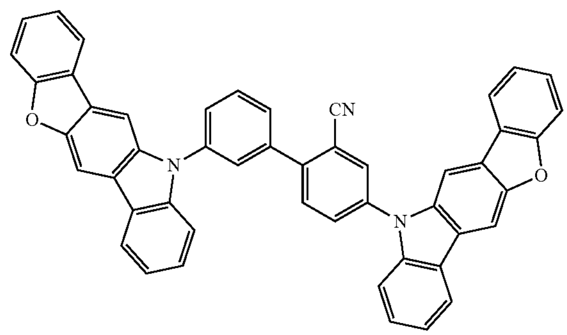
599
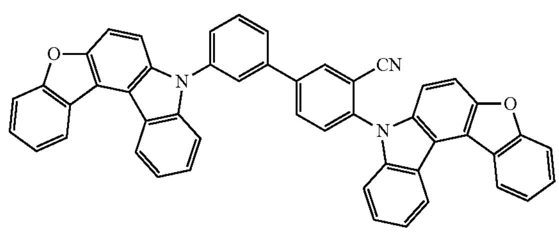
600
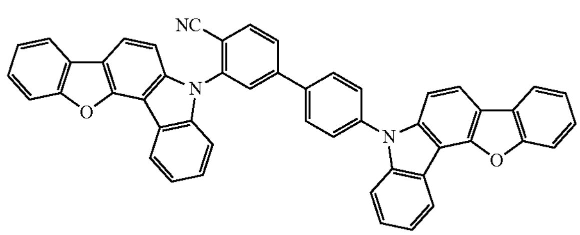
601
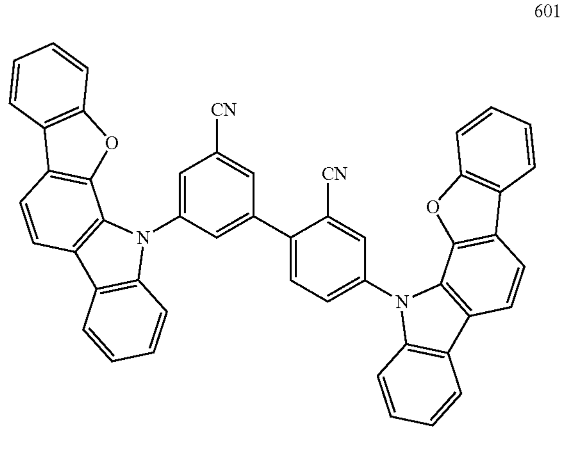
-continued
602
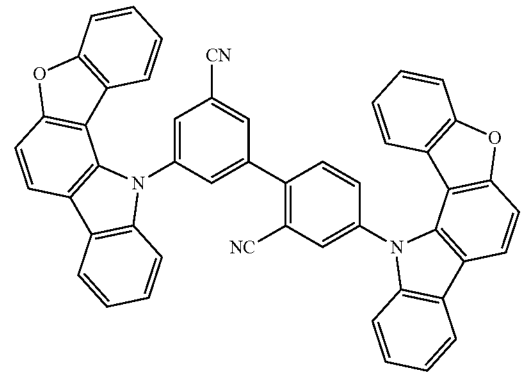
603
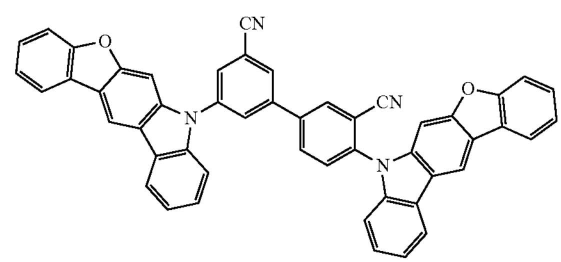
604
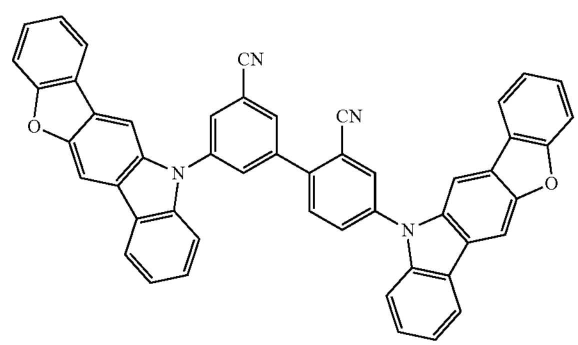
605
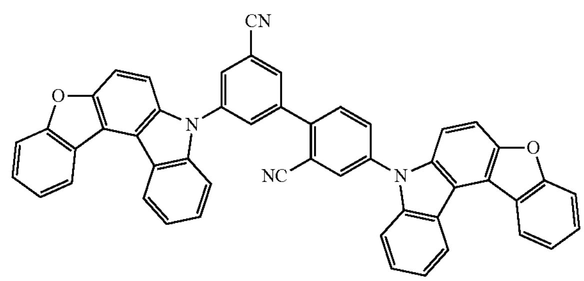
606
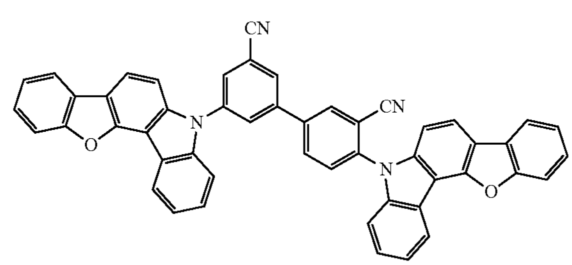

-continued
607
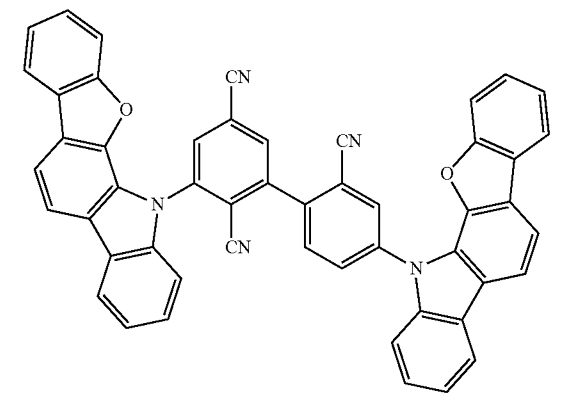
608
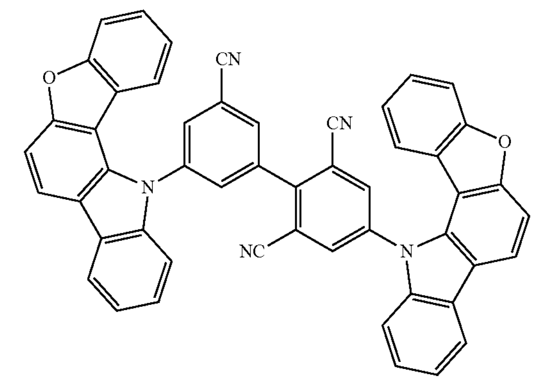
609
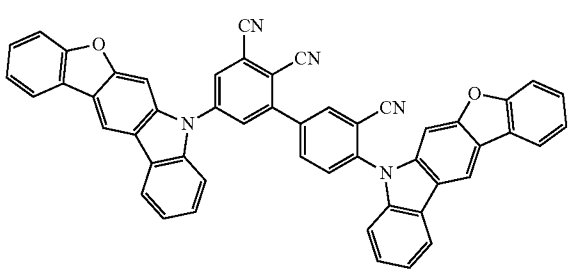
610
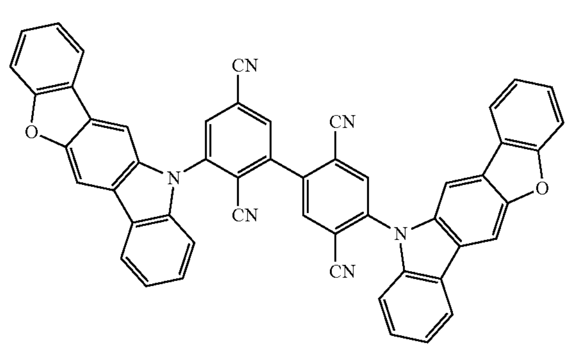
-continued
611
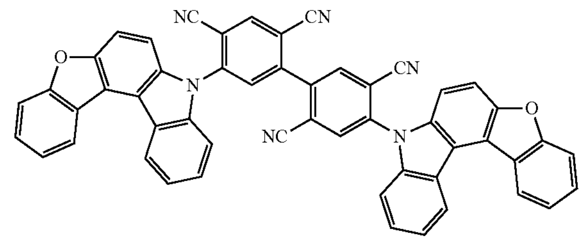
612
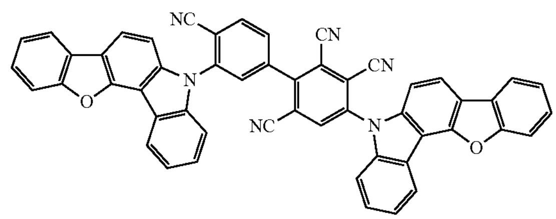
613
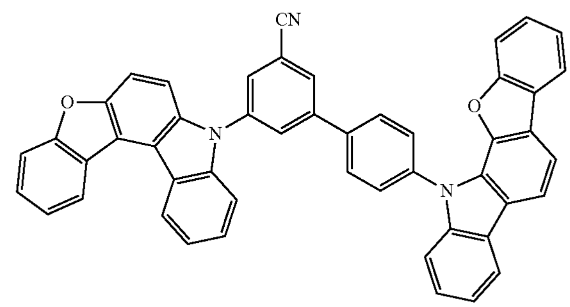
614
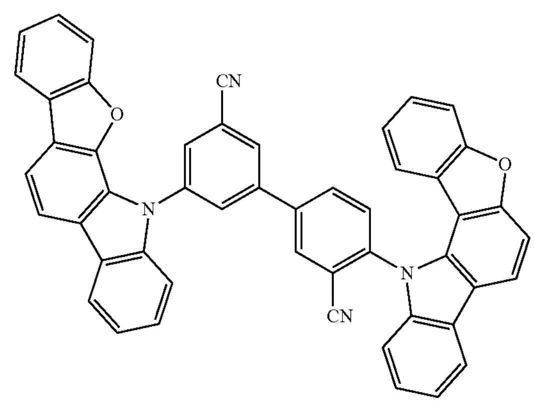
615
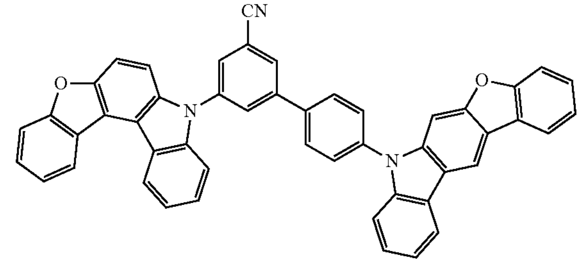

-continued
616
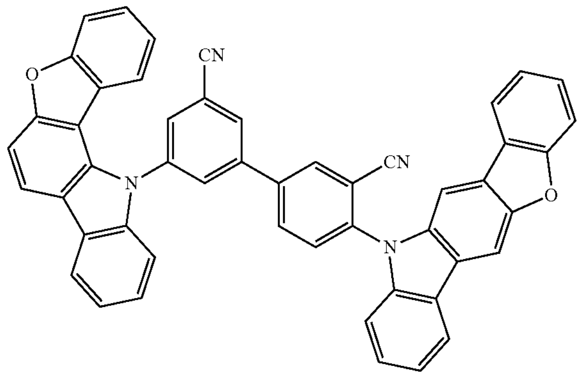
617
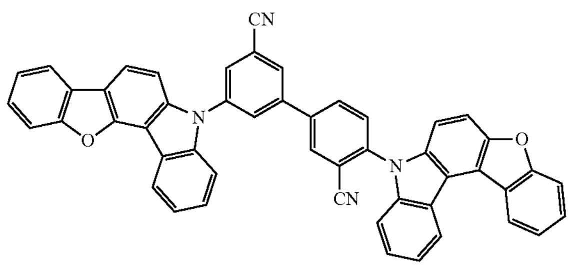
618
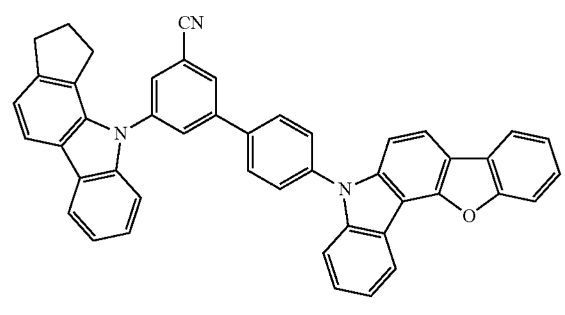
619
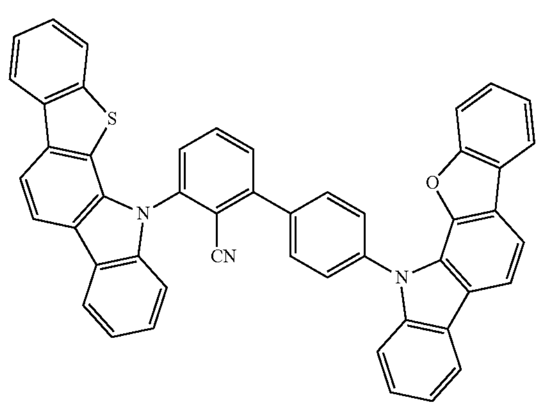
-continued
620
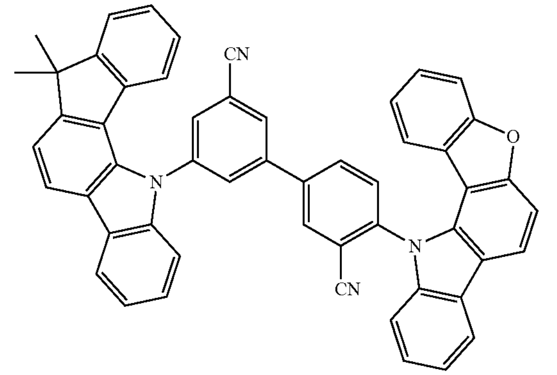
621
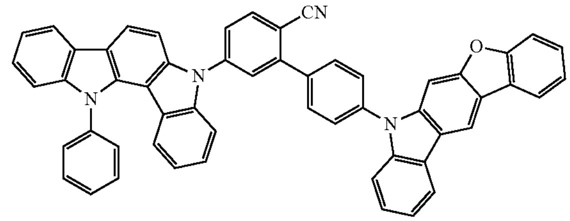
622
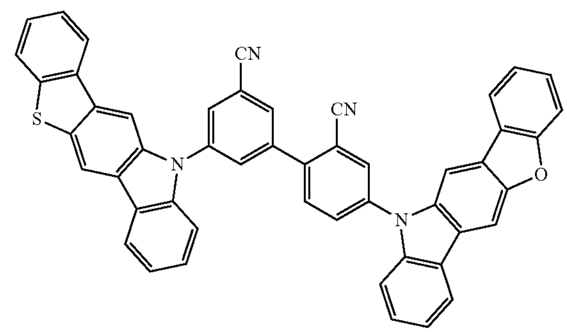
623
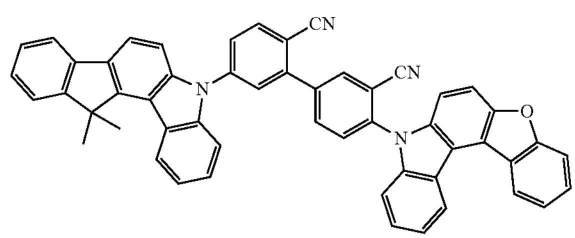
624
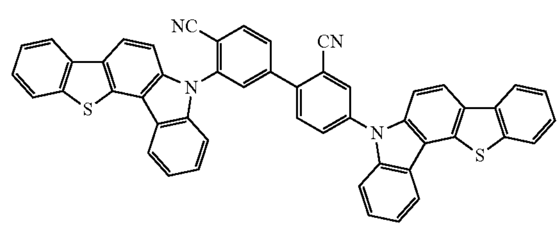

625
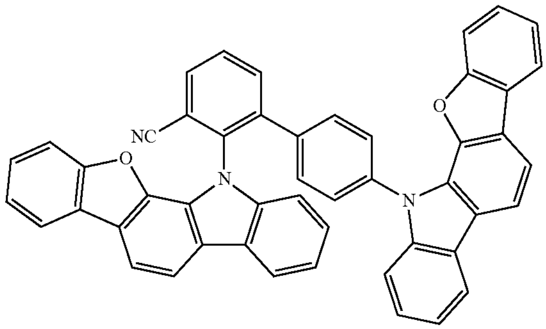
626
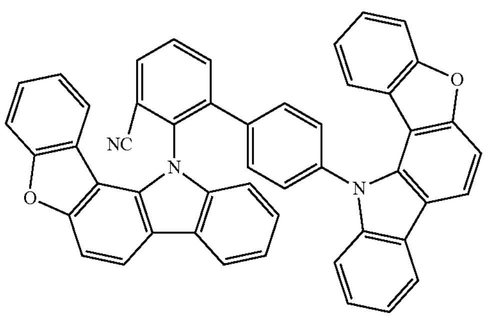
627
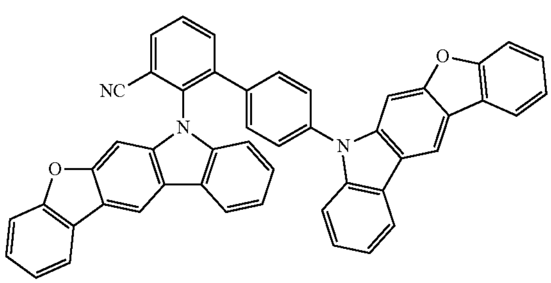
628
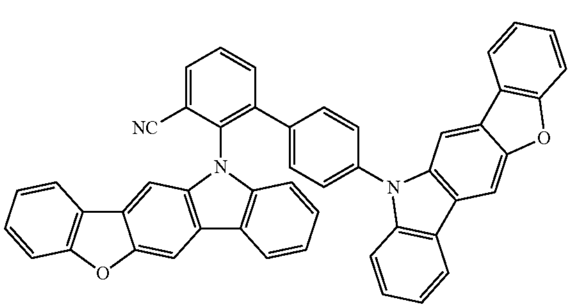
629
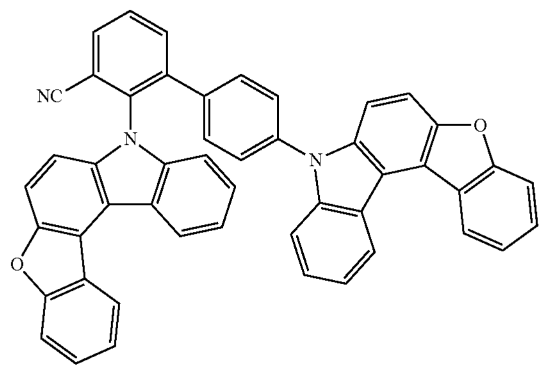
630
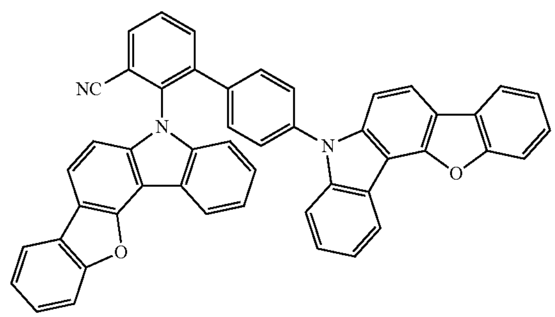
631
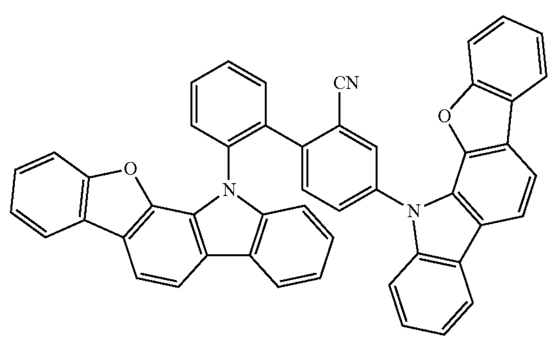
632
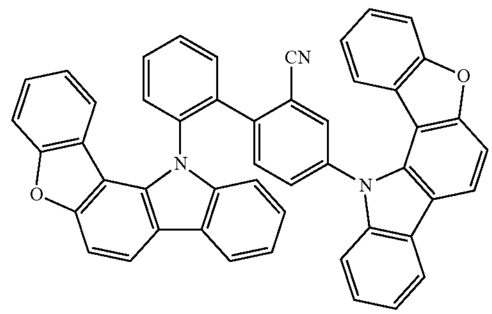

633
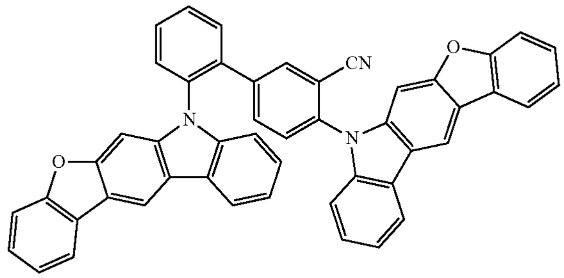
634
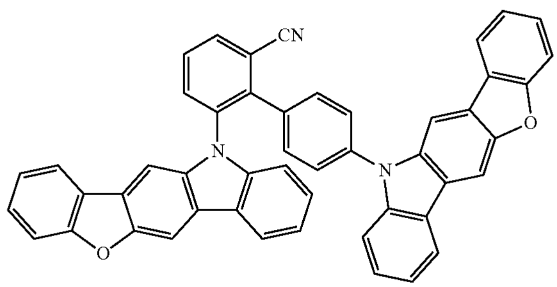
635
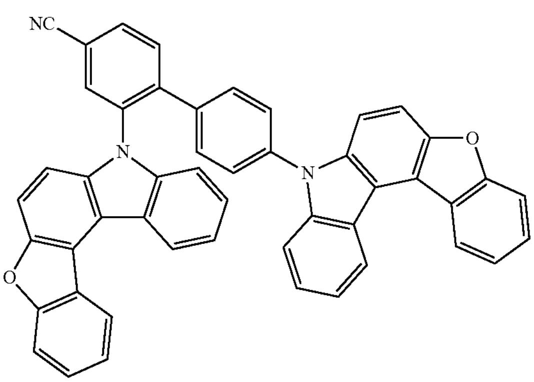
636
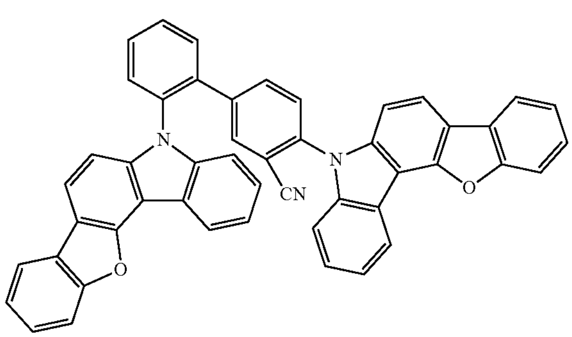
637
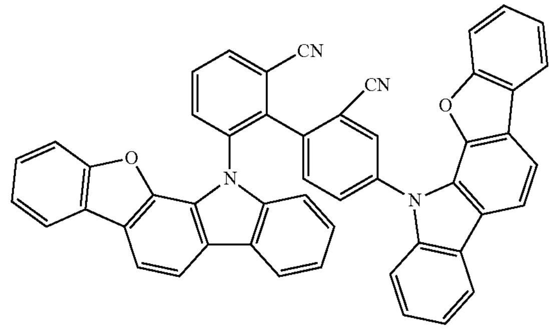
638
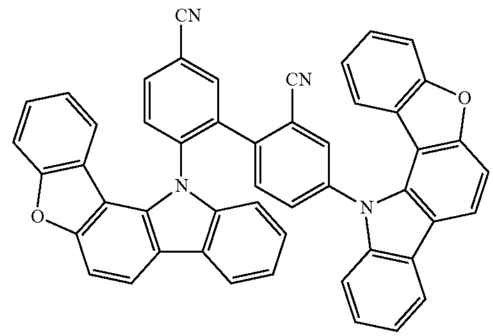
639
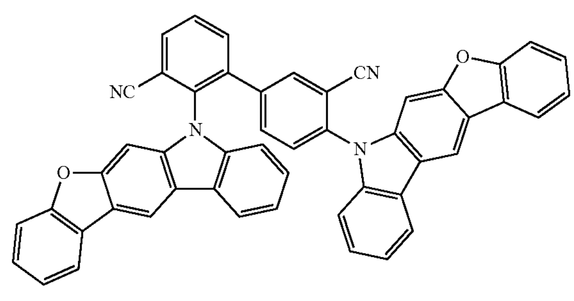
640
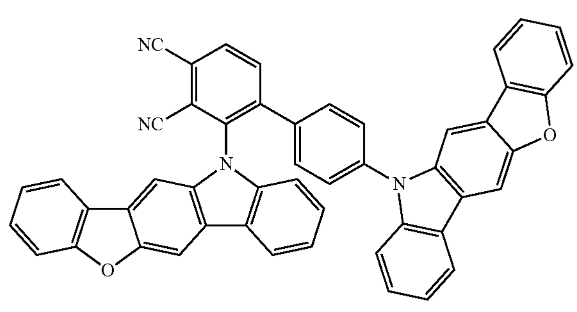

-continued
641
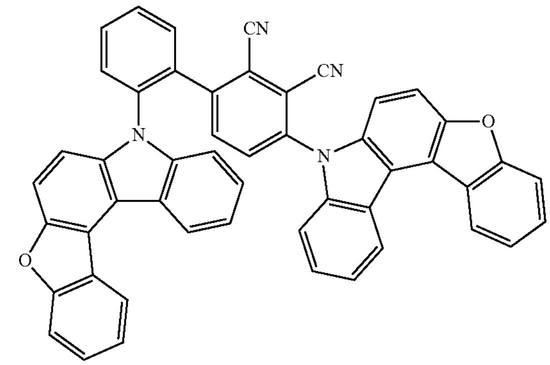
642
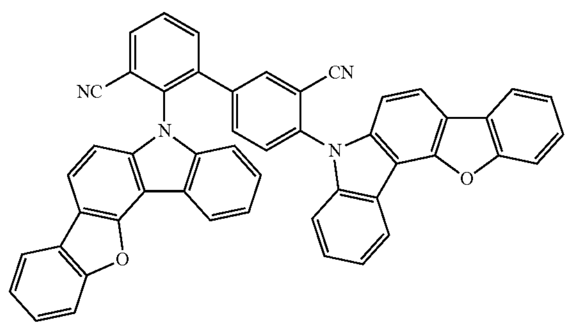
643
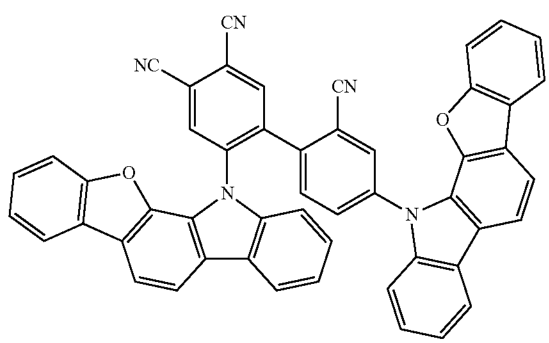
644
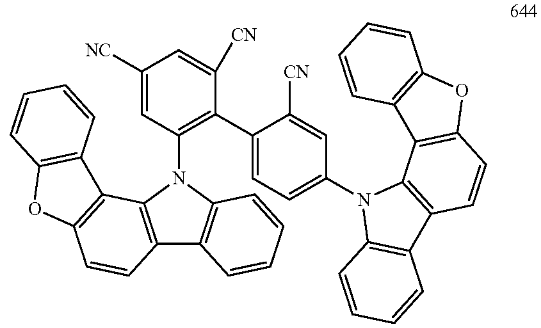
-continued
645
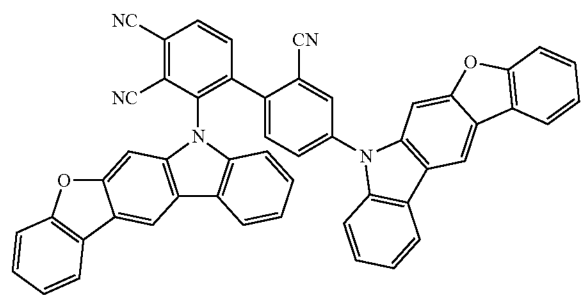
646
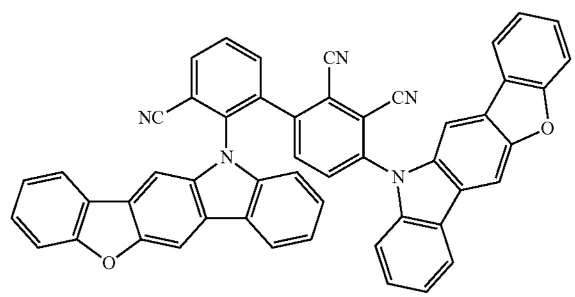
647
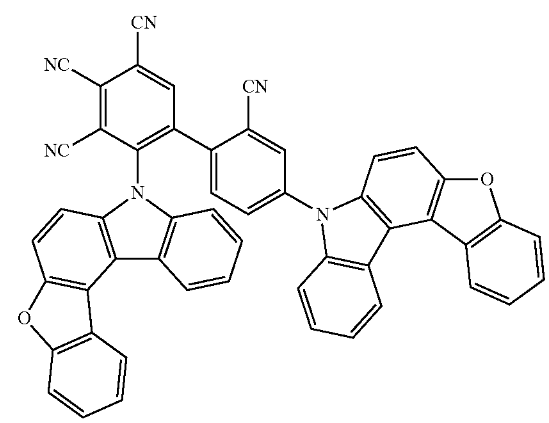
648
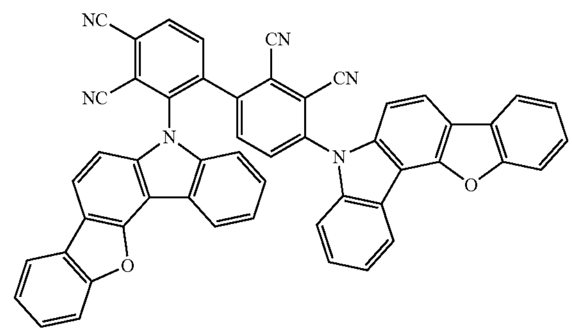

-continued
649
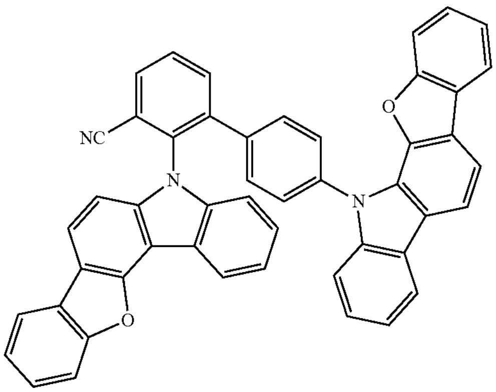
650
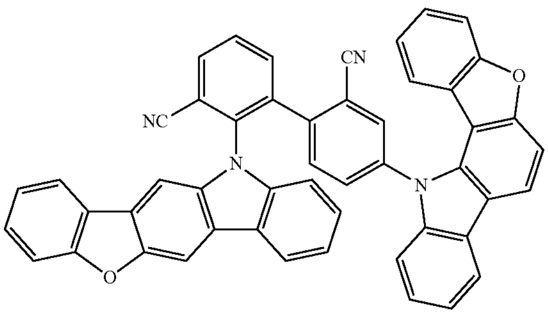
651
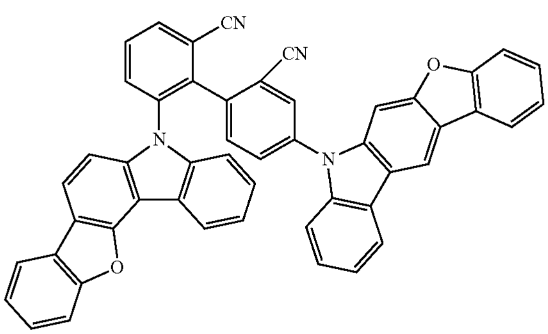
652
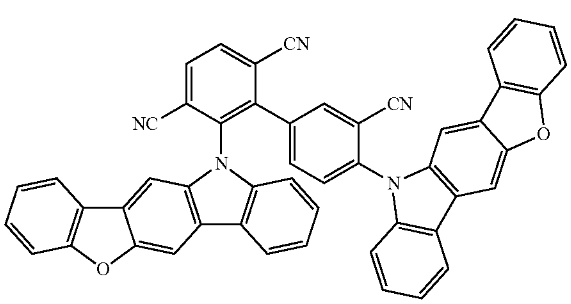
-continued
653
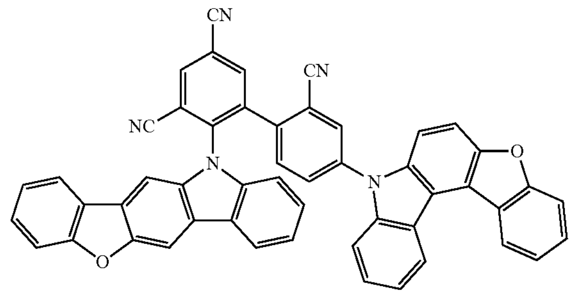
654
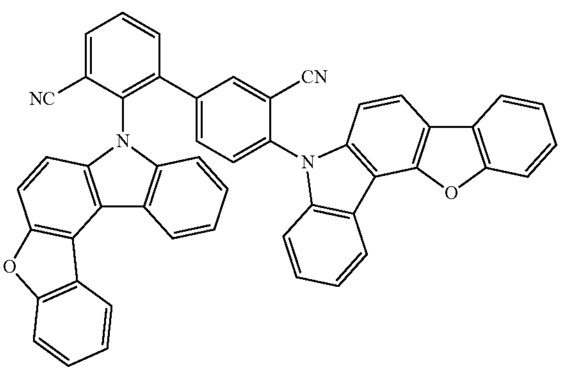
655
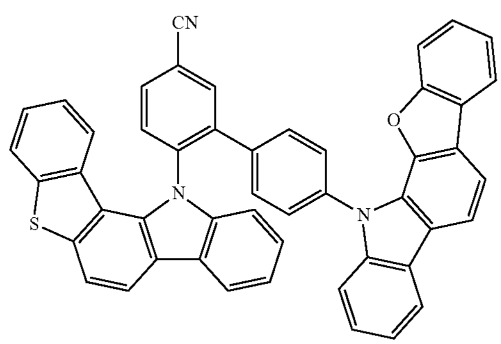
656
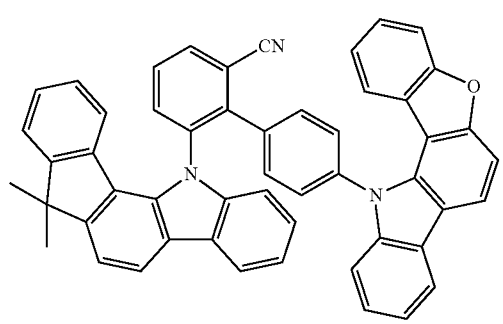

-continued
657
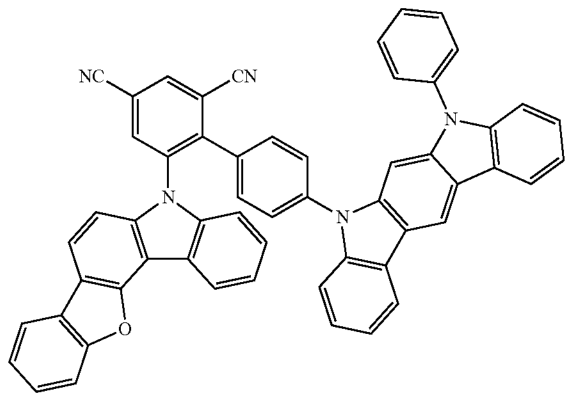
658
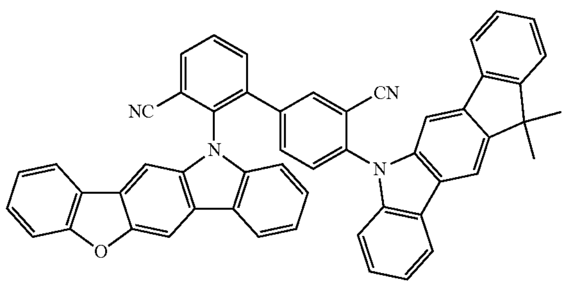
659
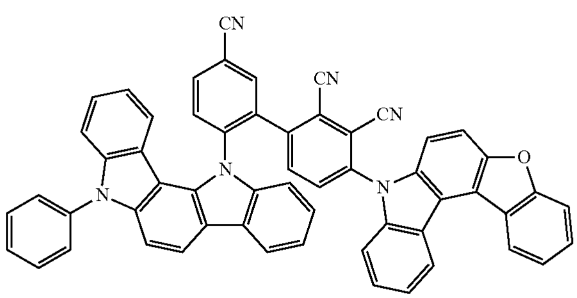
660
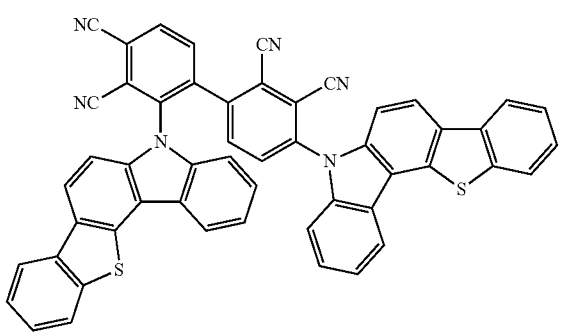
-continued
661
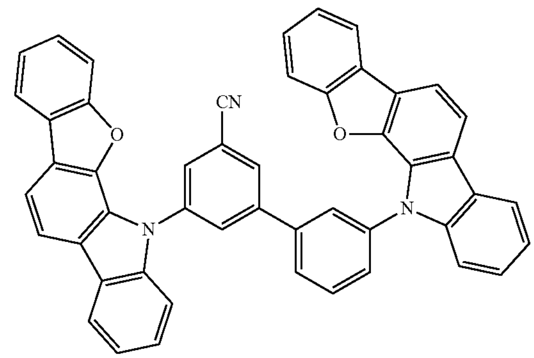
662
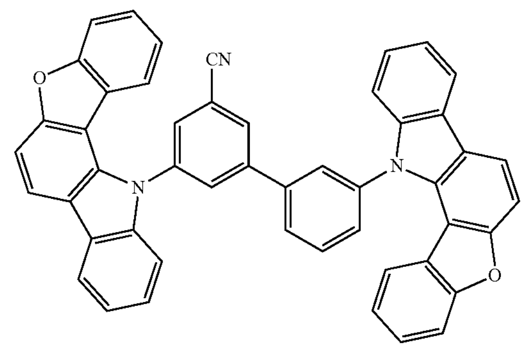
663
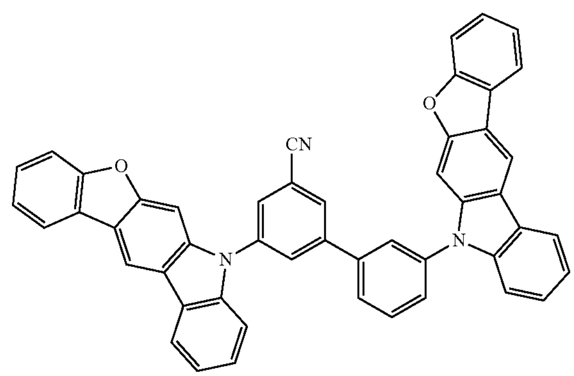
664
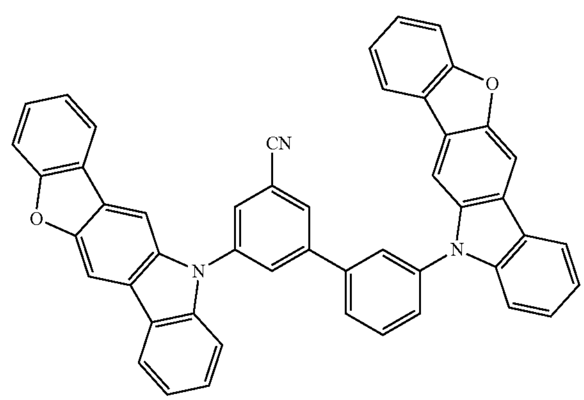

665
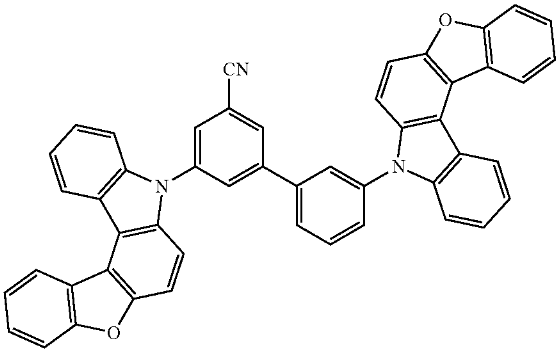
666
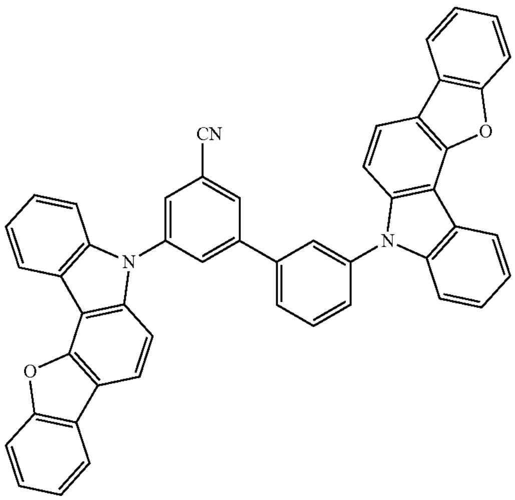
667
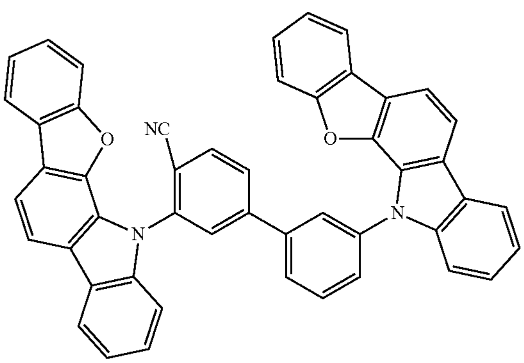
668
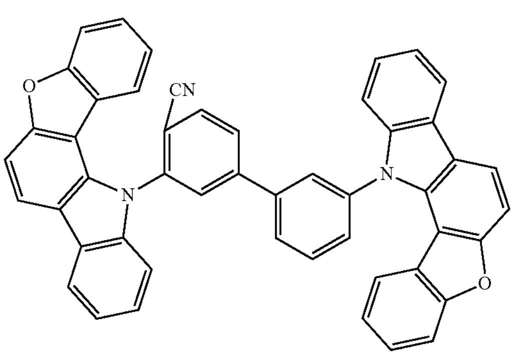
669
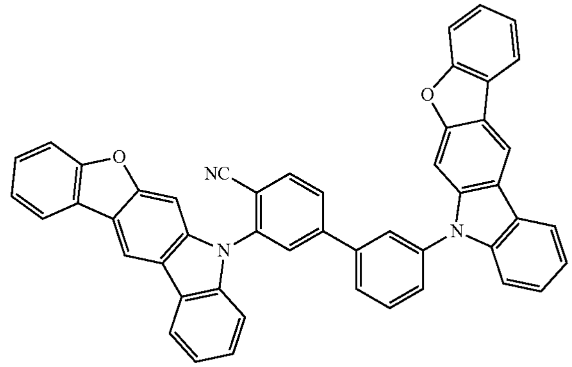
670
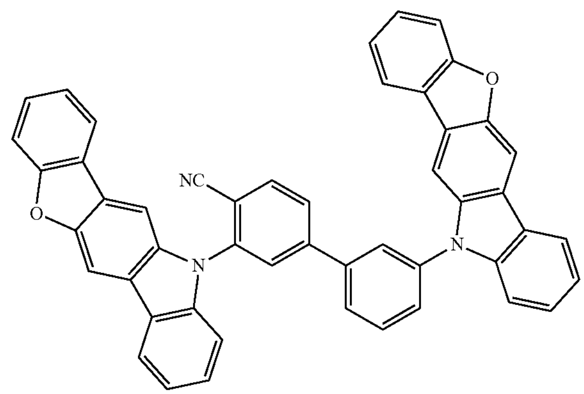
671
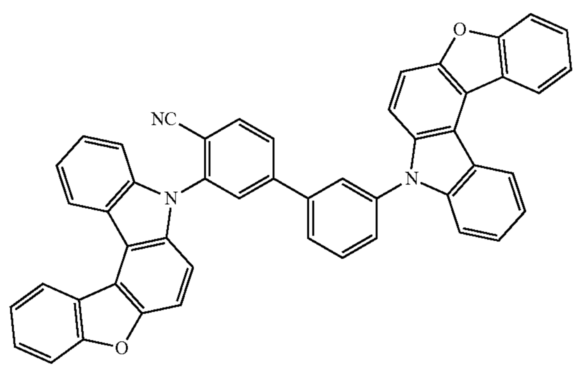

-continued
672
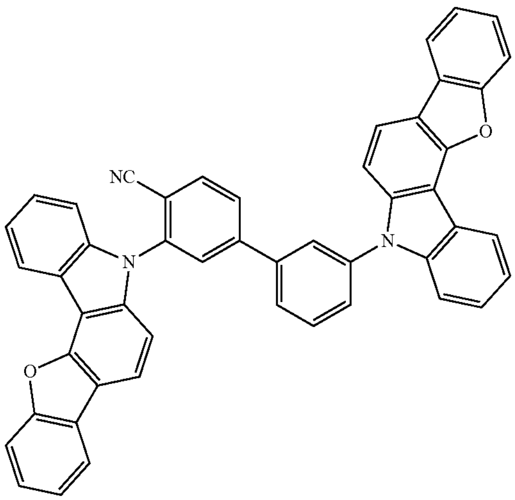
673
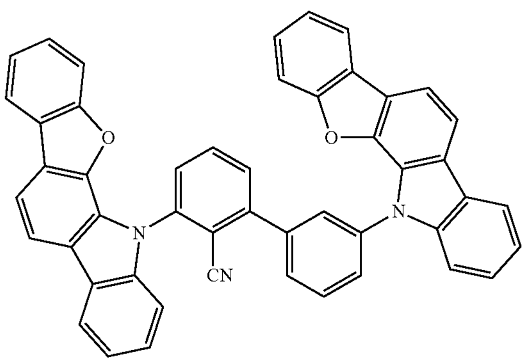
674
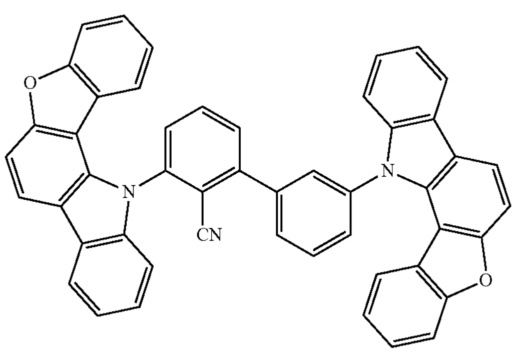
675
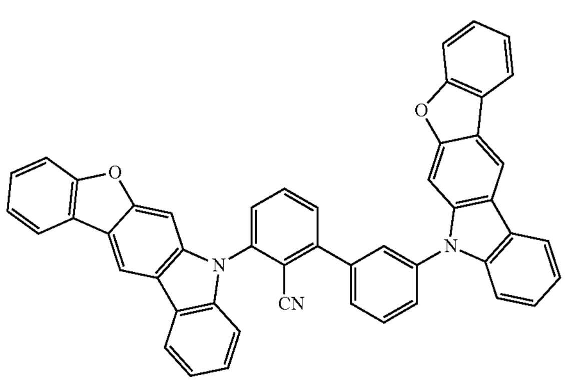
-continued
676
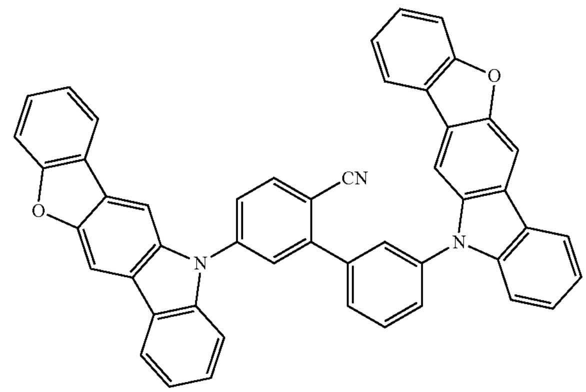
677
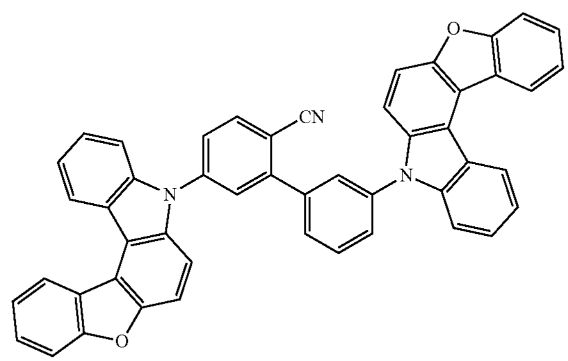
678
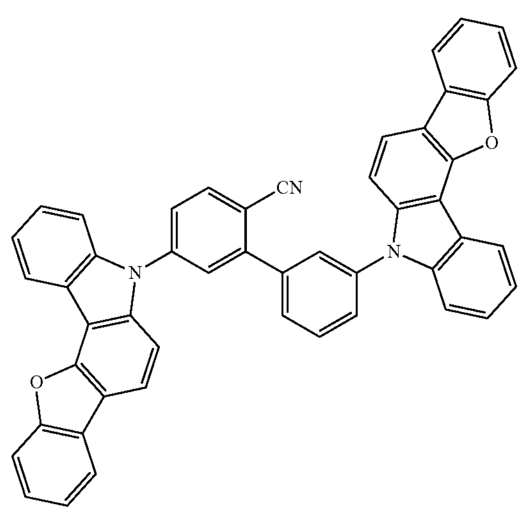

-continued
679
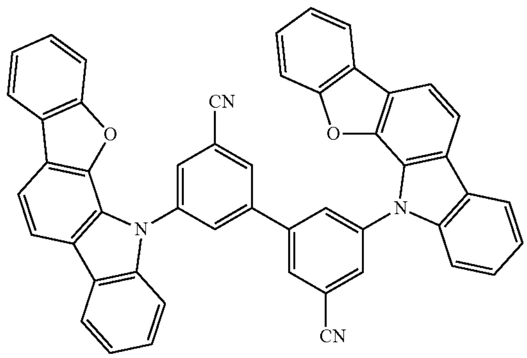
680
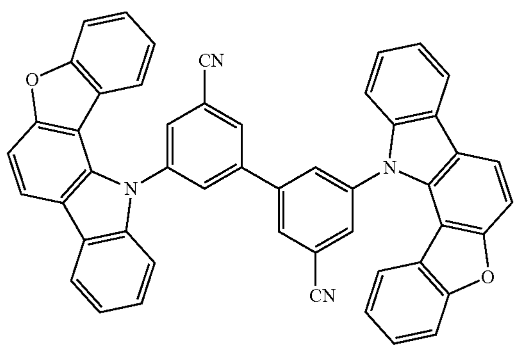
681
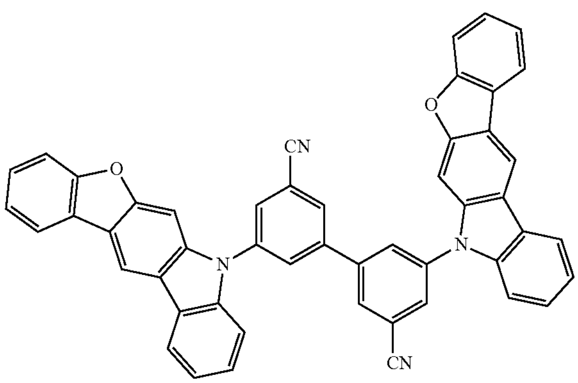
682
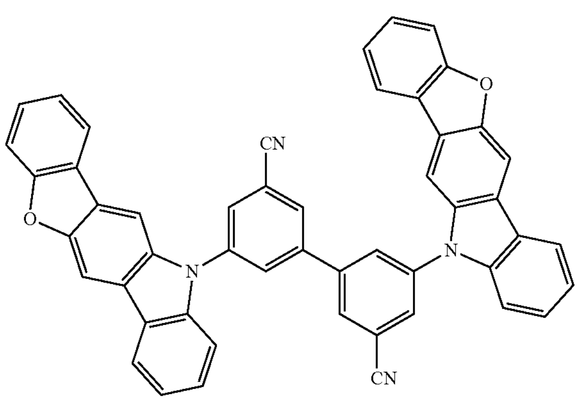
-continued
683
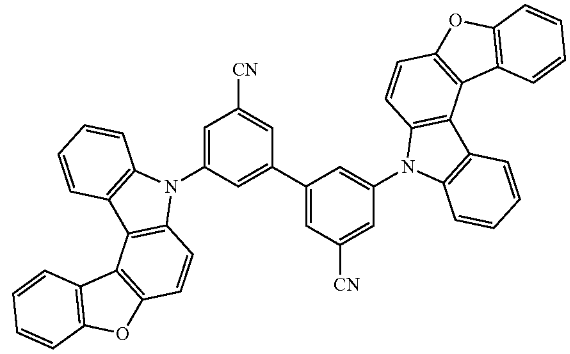
684
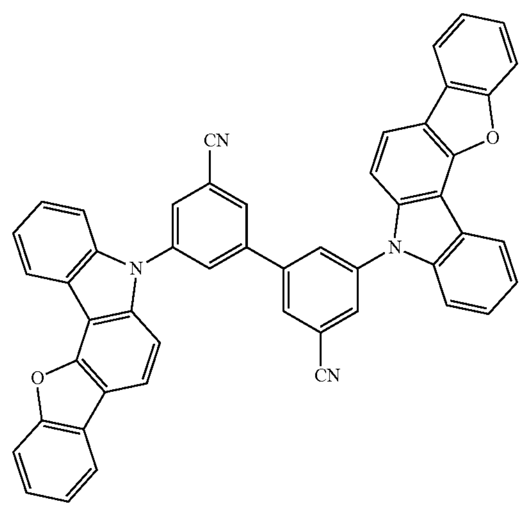
685
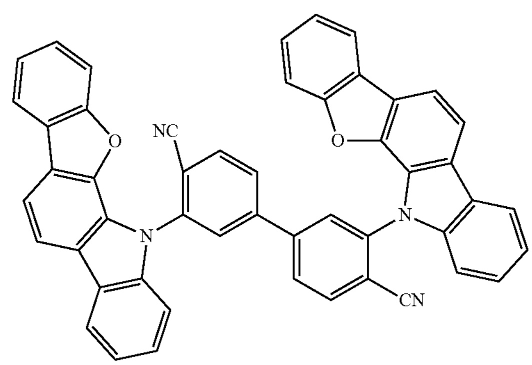
686
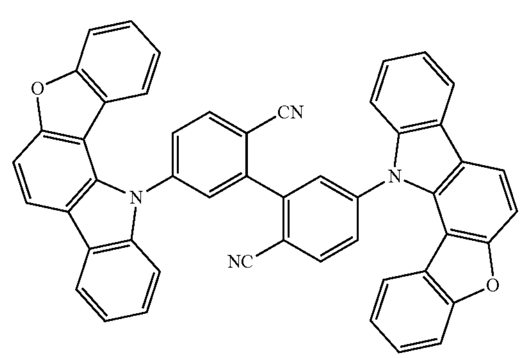

-continued
687
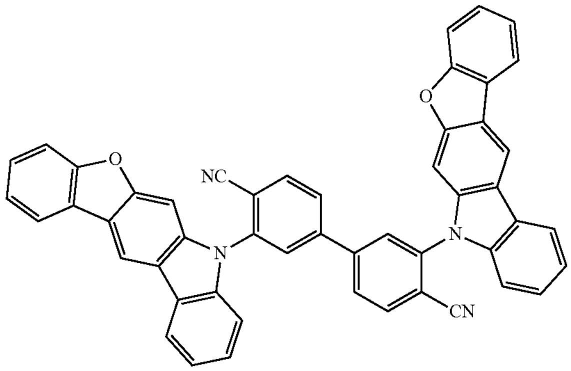
688
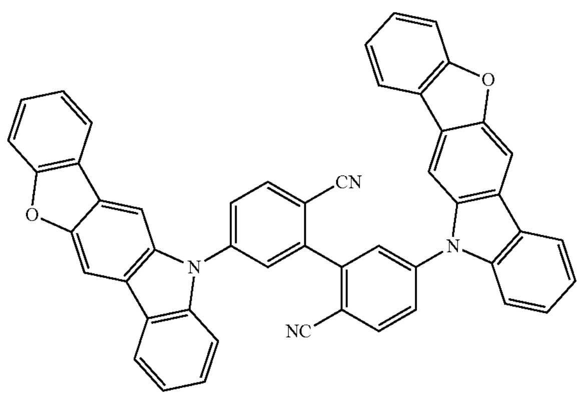
689
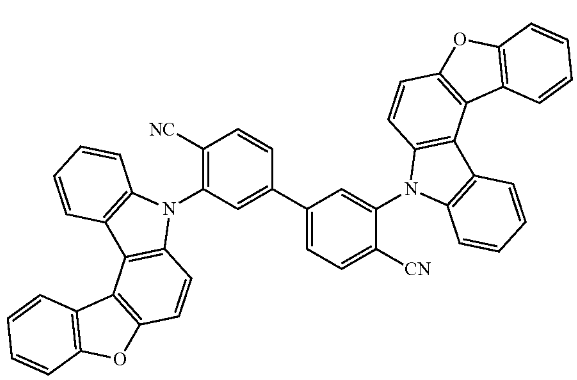
-continued
690
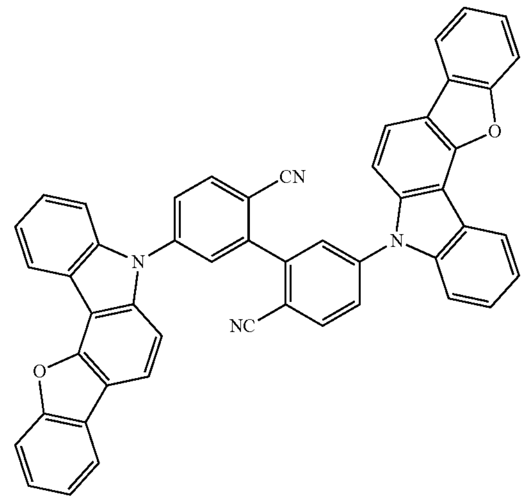
691
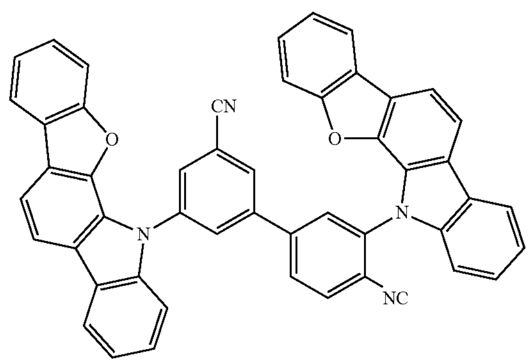
692
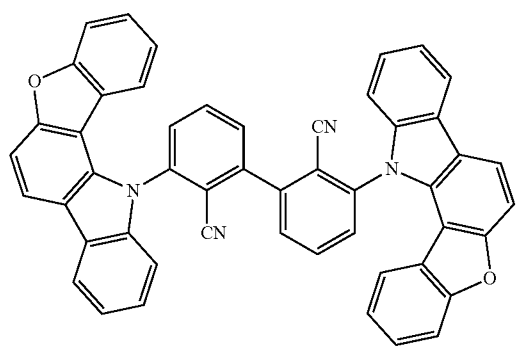
693
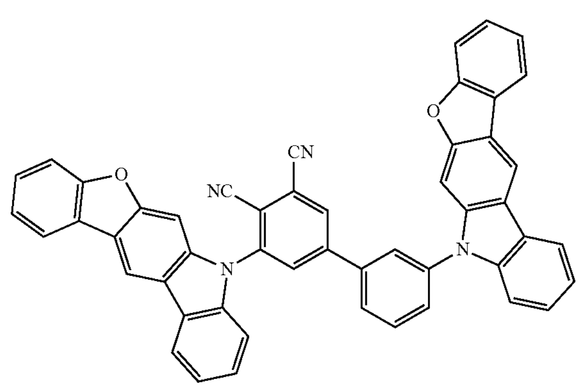

694
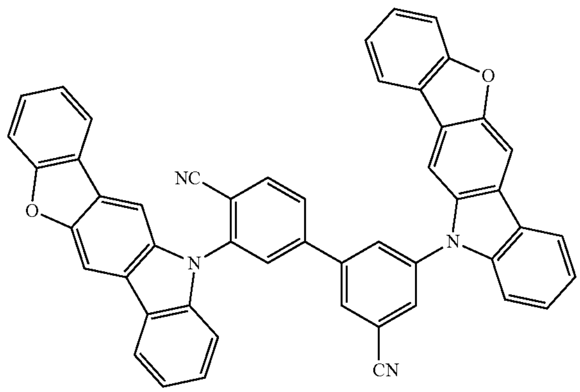
695
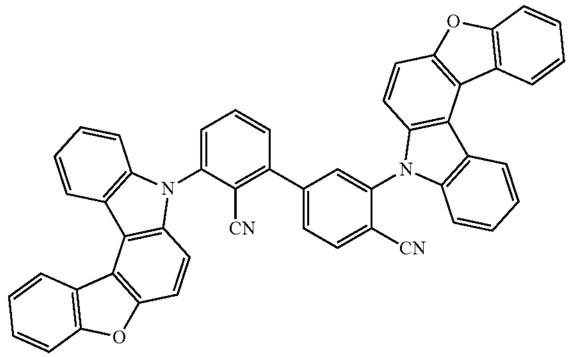
696
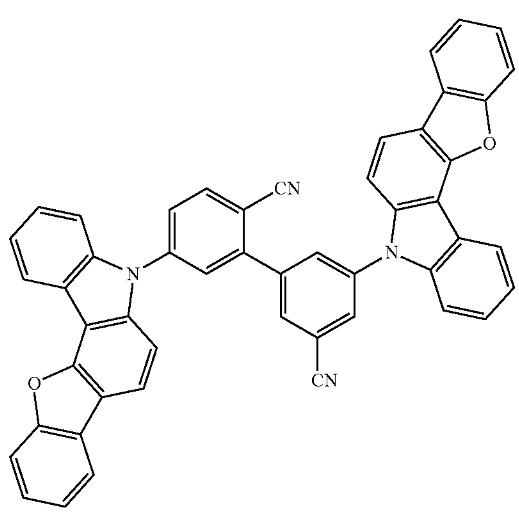
697
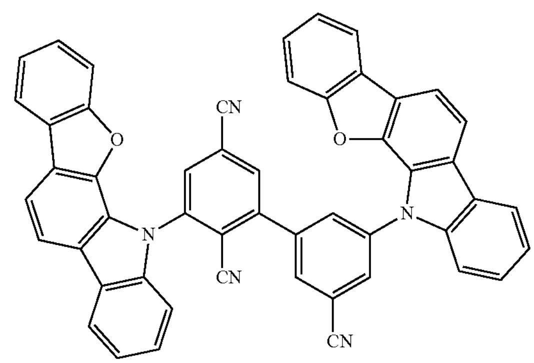
698
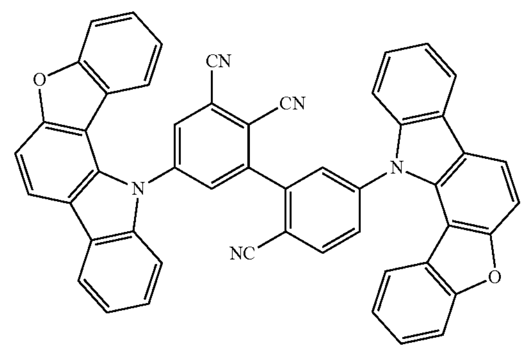
699
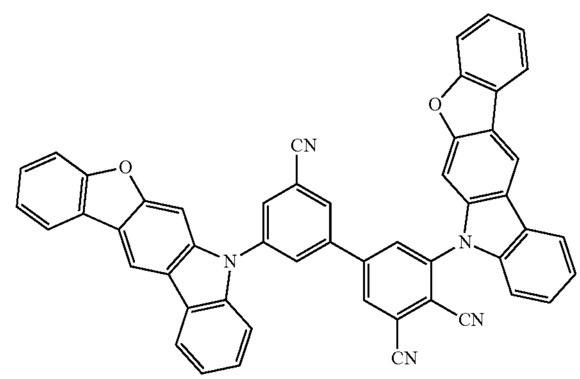
700
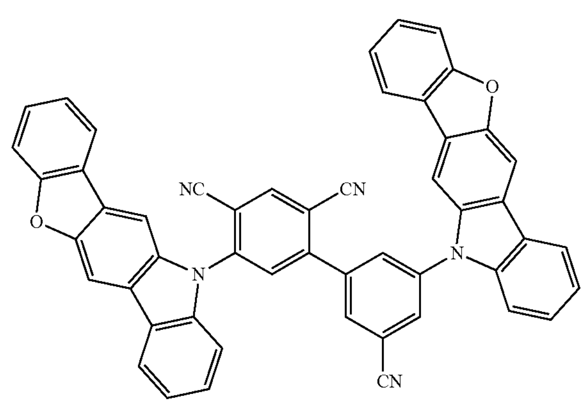

-continued
701
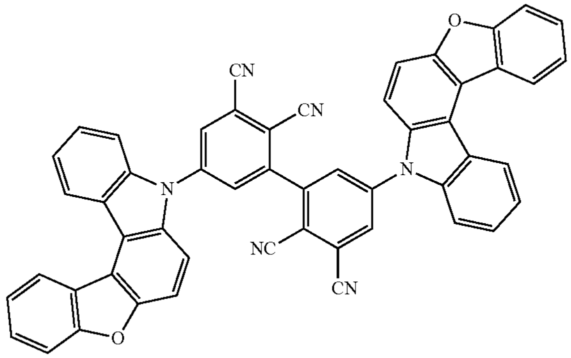
702
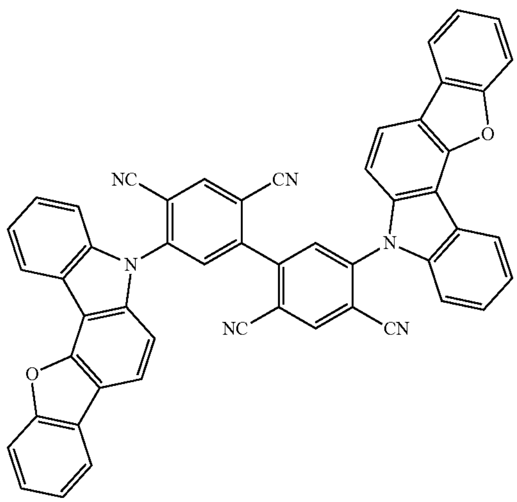
703
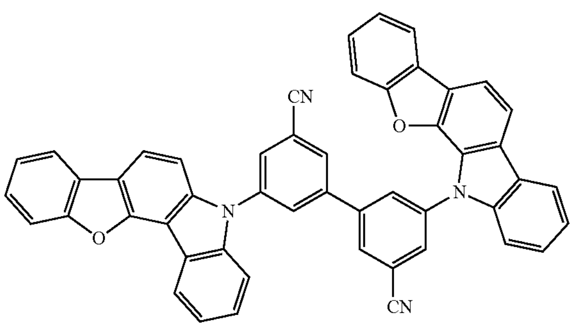
704
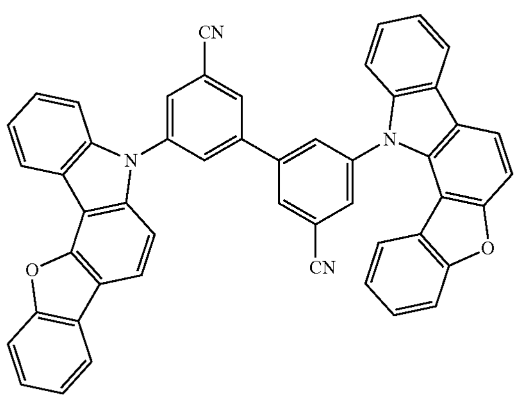
-continued
705
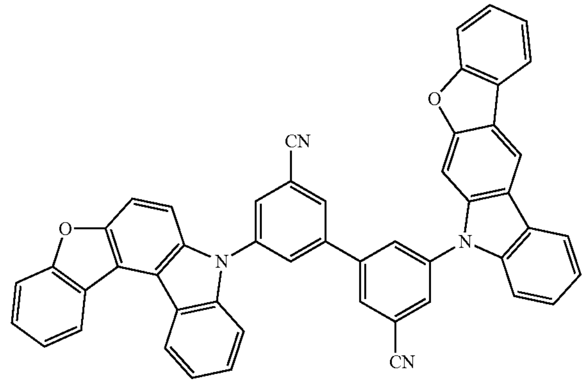
706
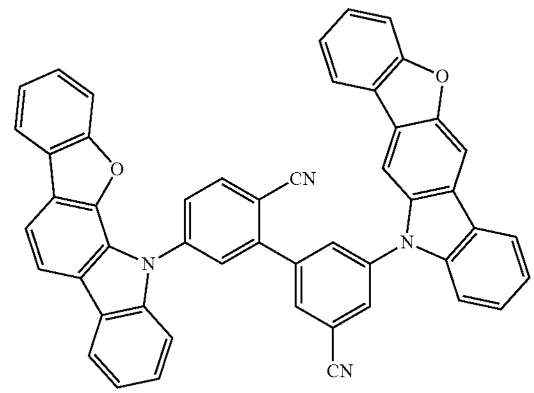
707
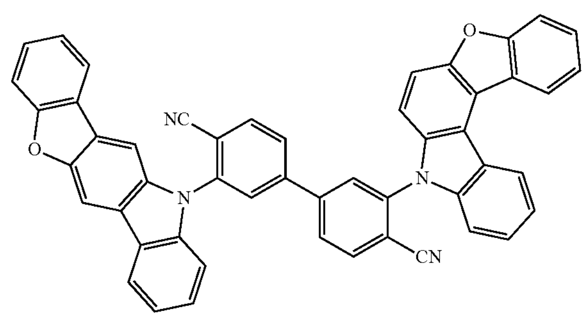
708
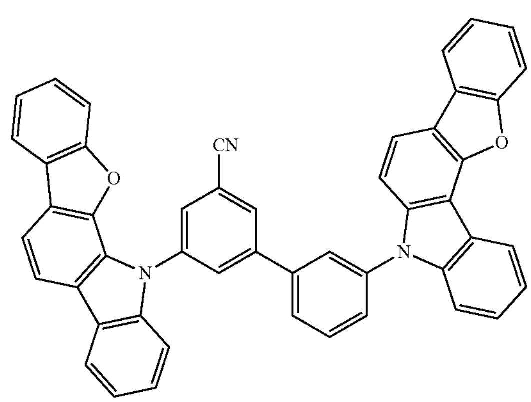

709
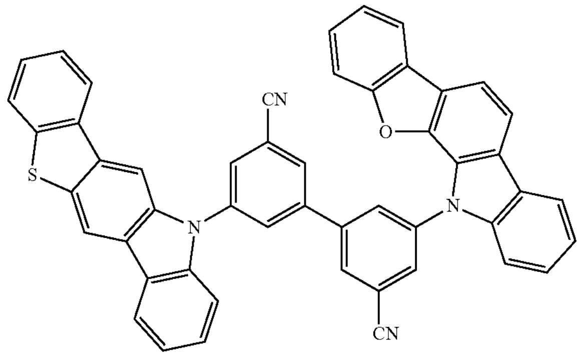
710
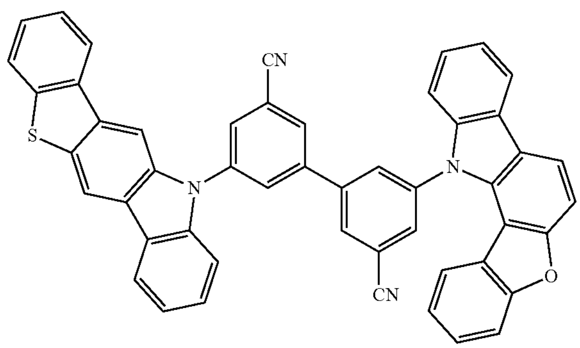
711
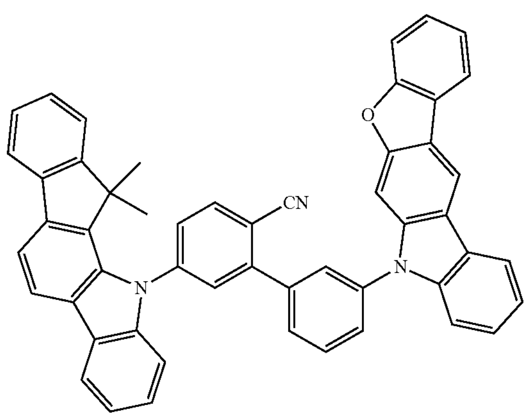
712
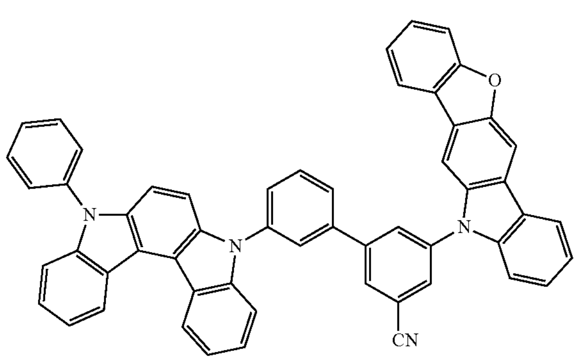
713
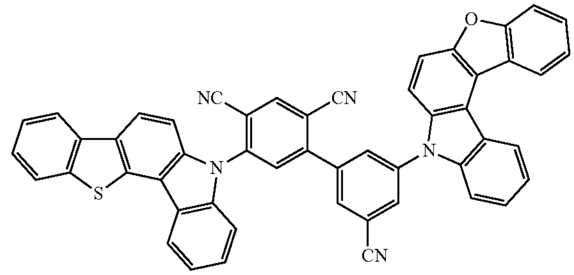
714
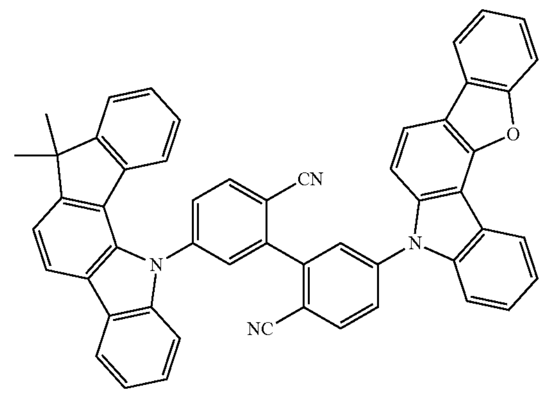
715
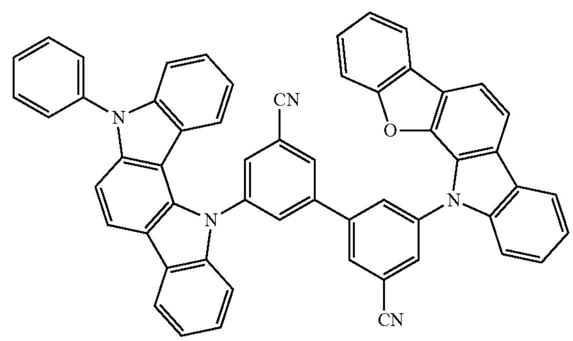
716
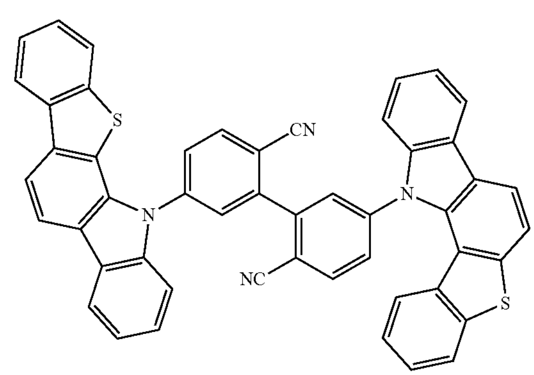

-continued
717
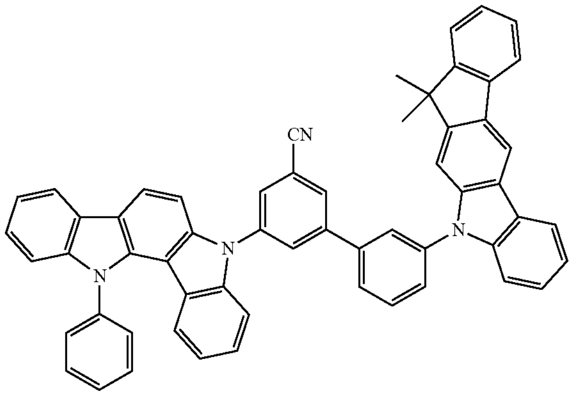
718
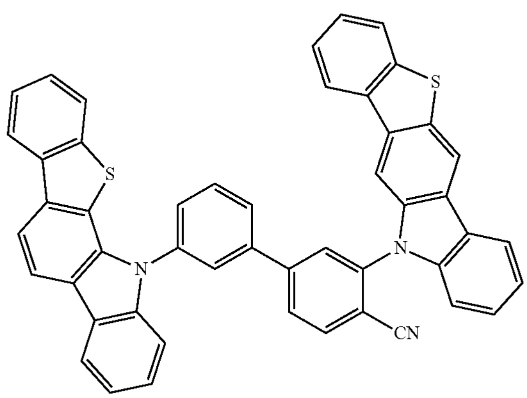
719
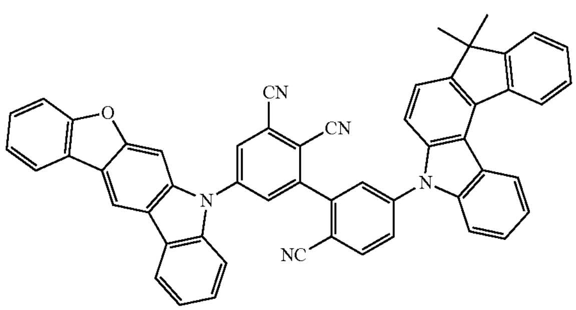
720
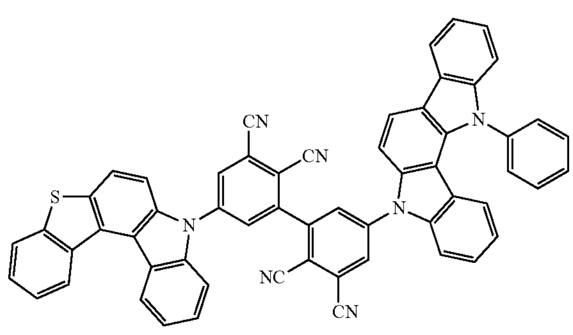
-continued
721
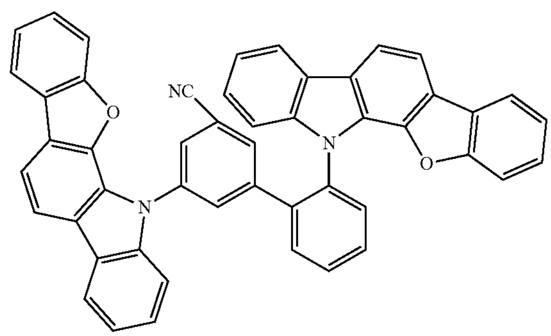
722
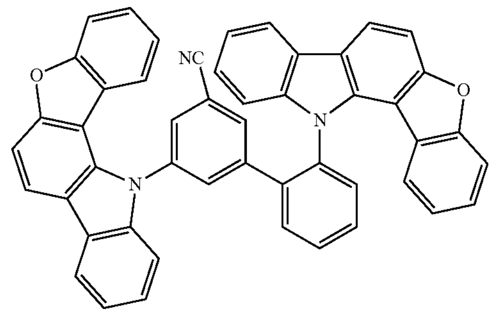
723
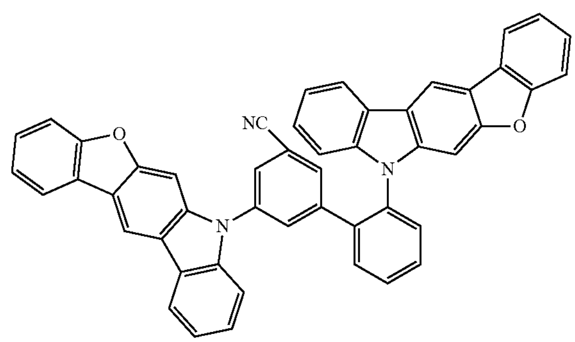
724
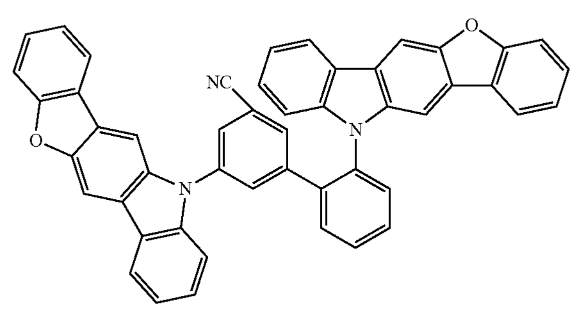

-continued
725
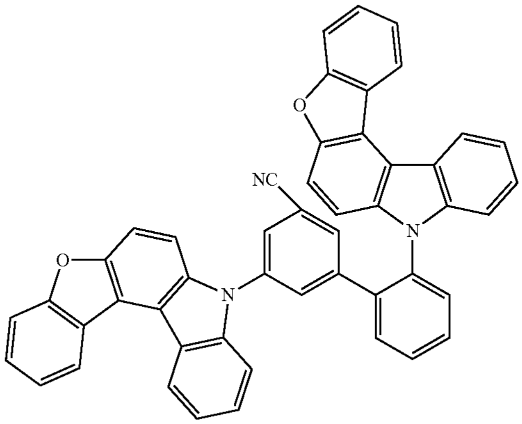
726
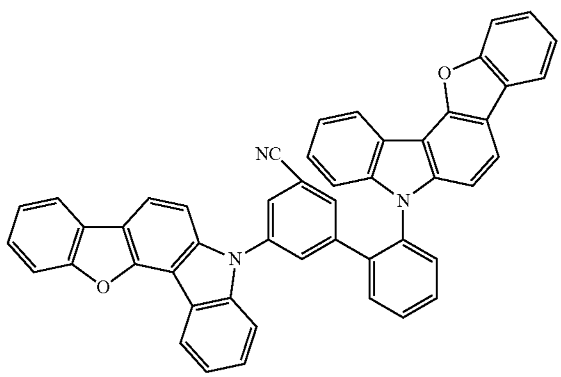
727
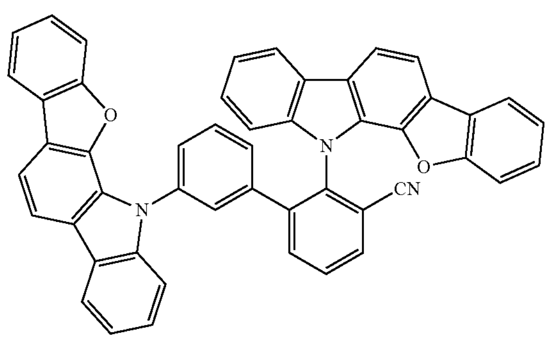
728
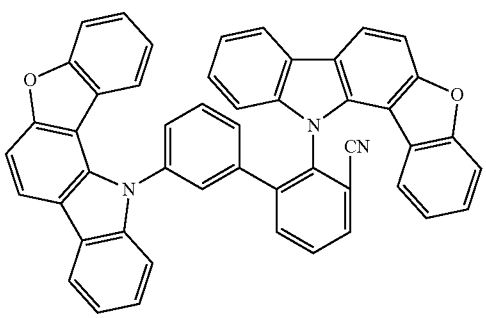
-continued
729
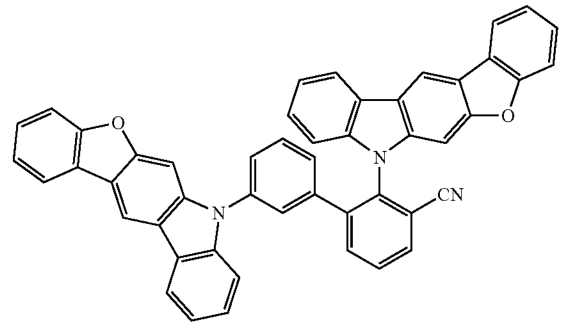
730
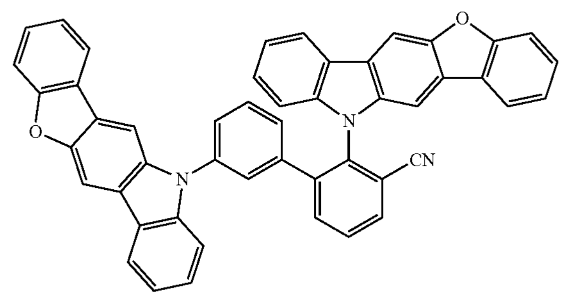
731
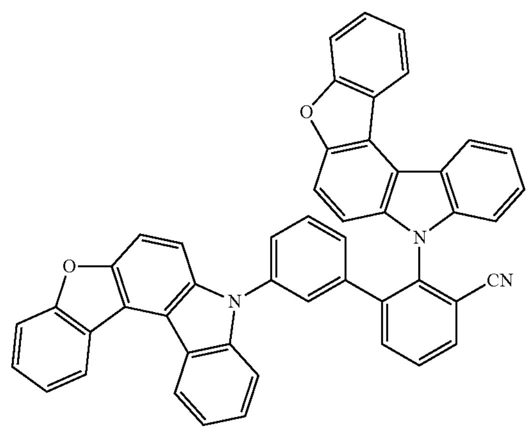
732
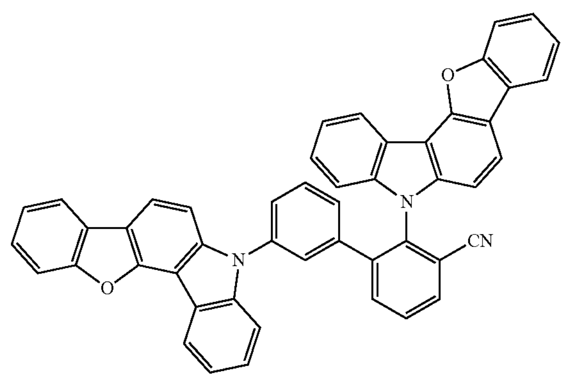

-continued
733
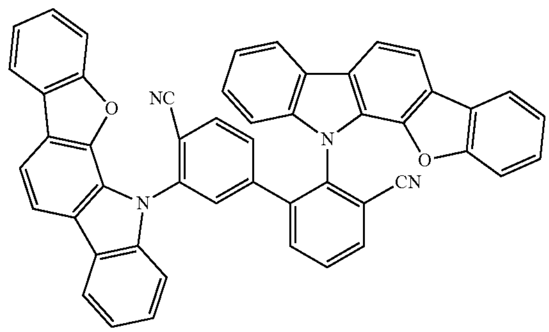
734
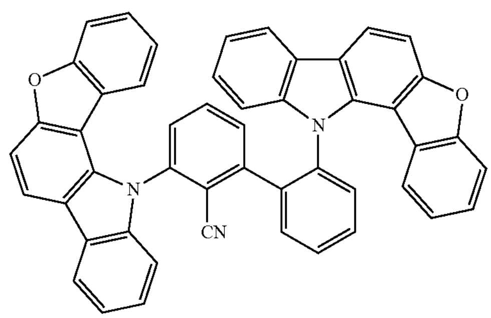
735
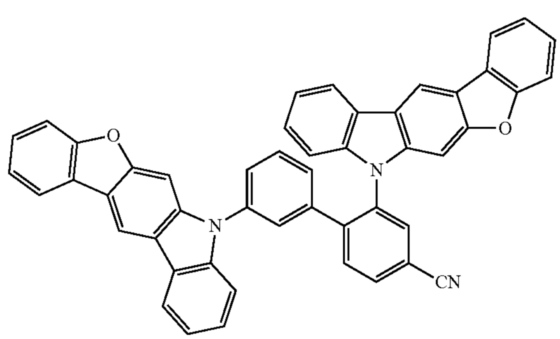
736
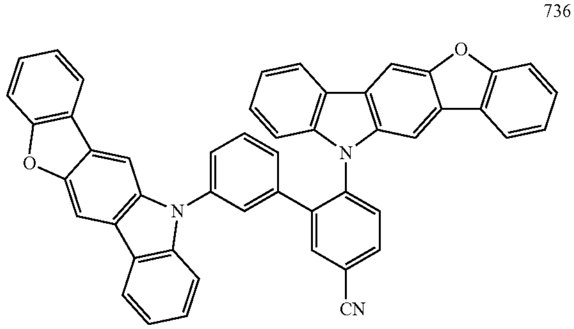
-continued
737
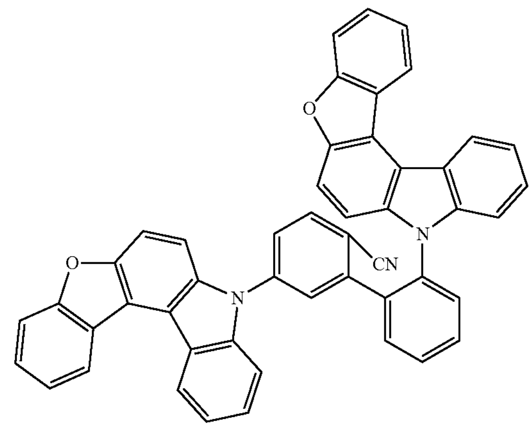
738
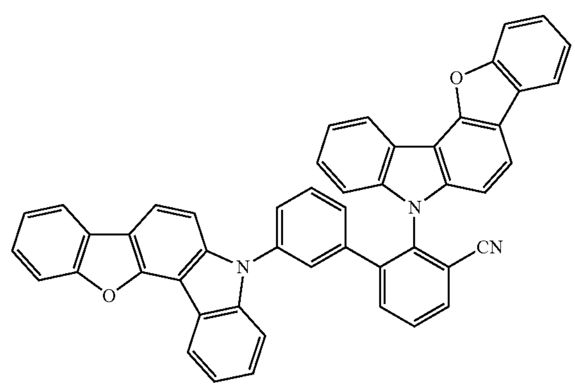
739
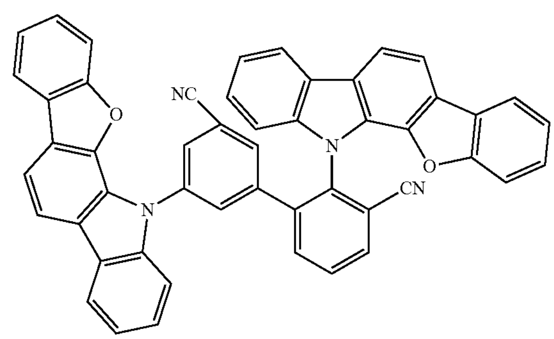
740
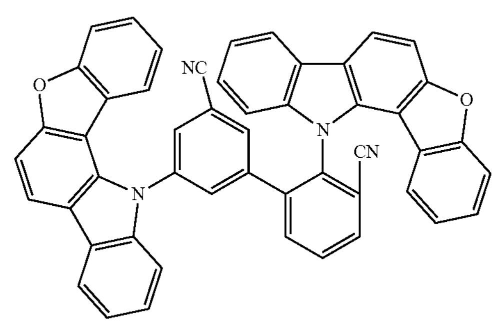

-continued
741
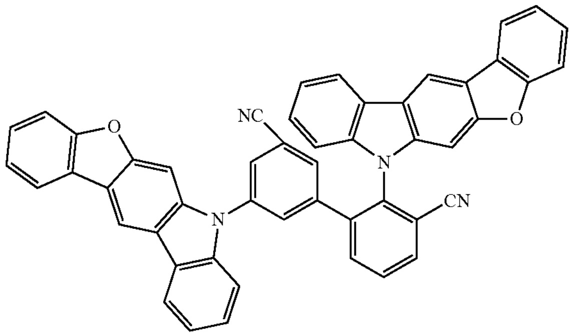
742
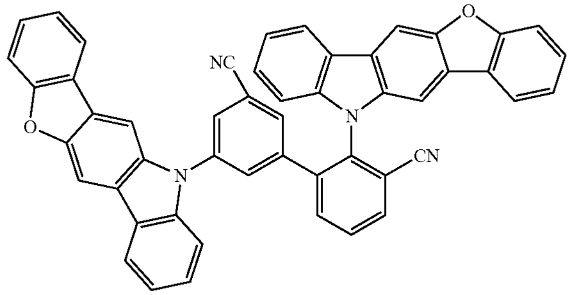
743
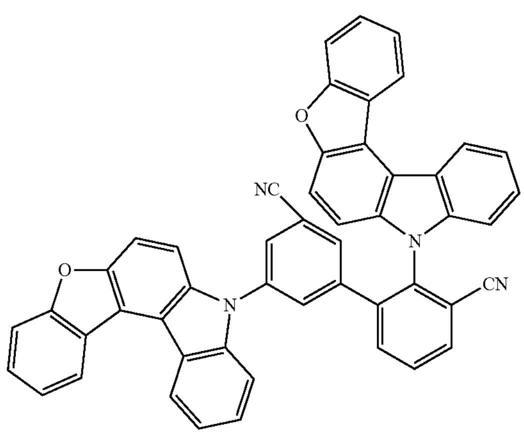
744
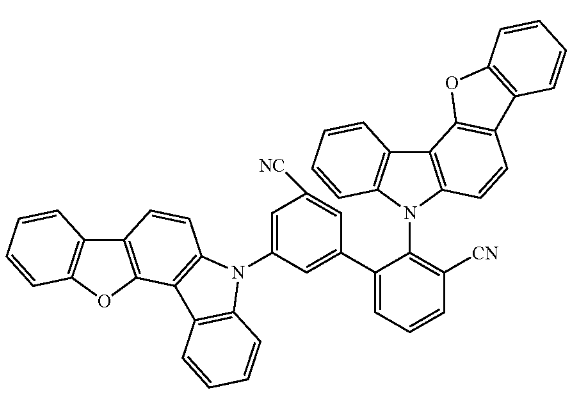
-continued
745
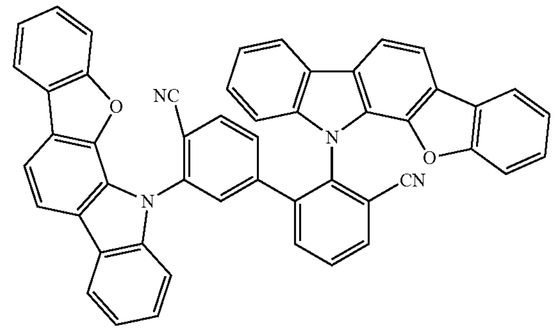
746
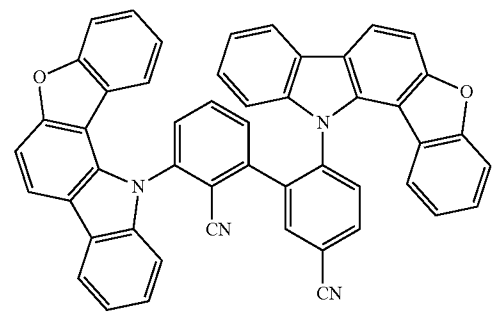
747
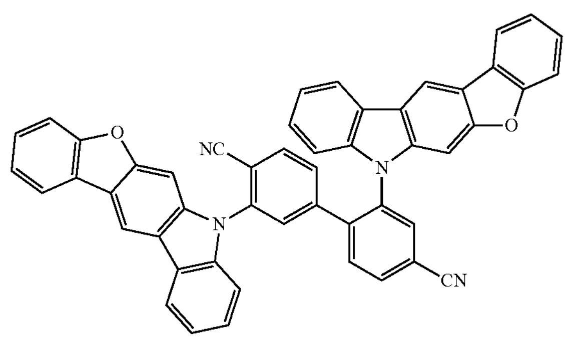
748
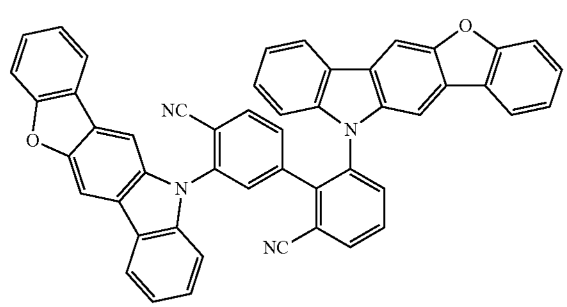

-continued
749
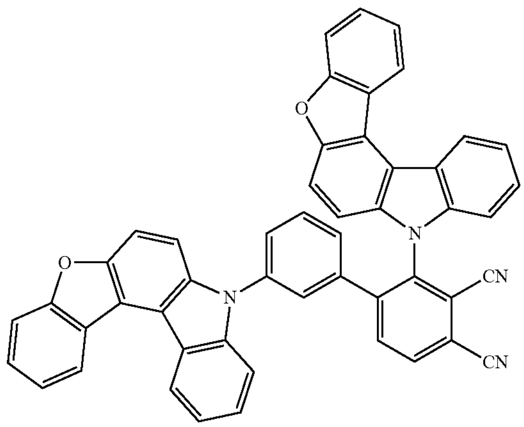
750
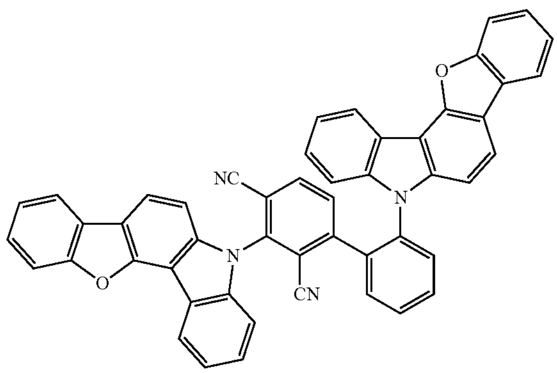
751
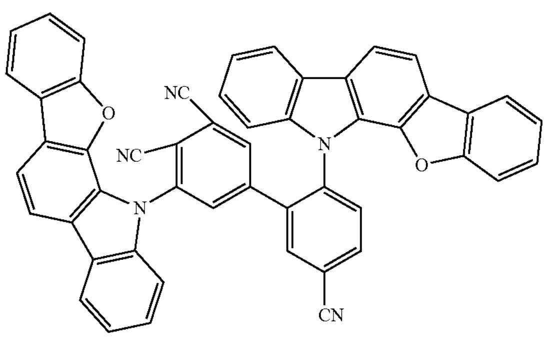
752
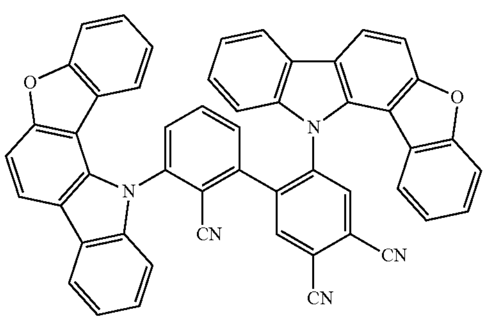
-continued
753
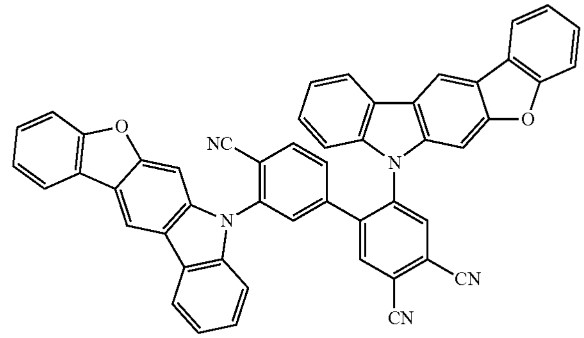
754
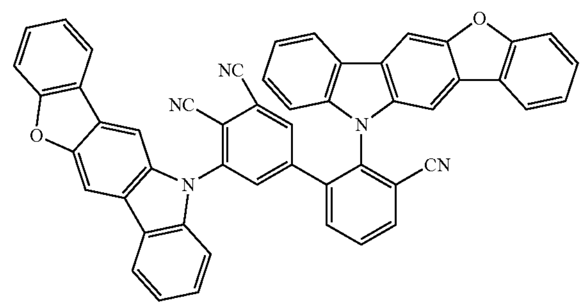
755
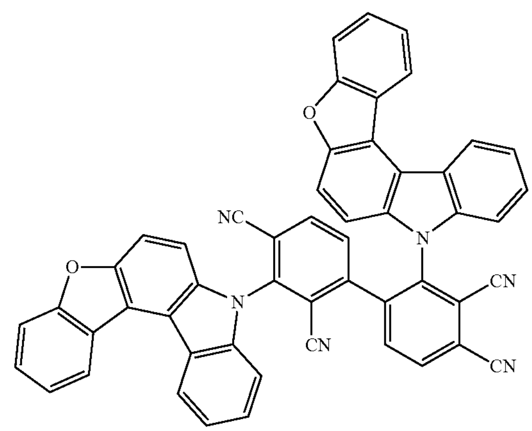
756
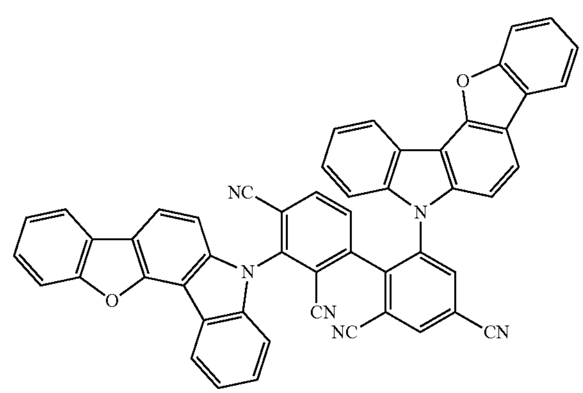

-continued
757
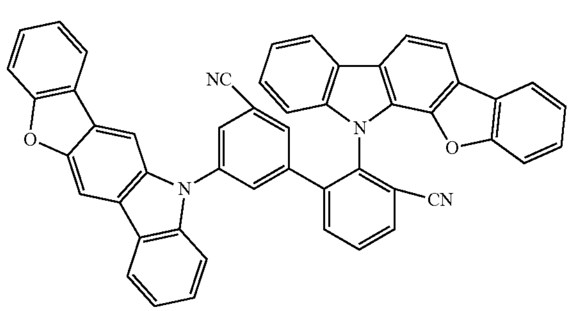
758
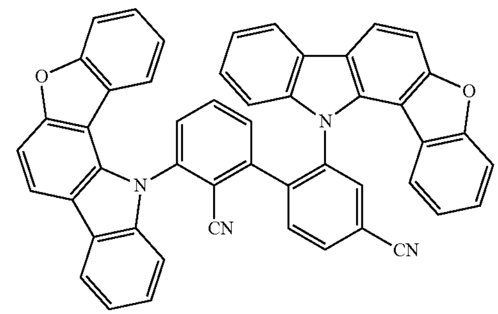
759
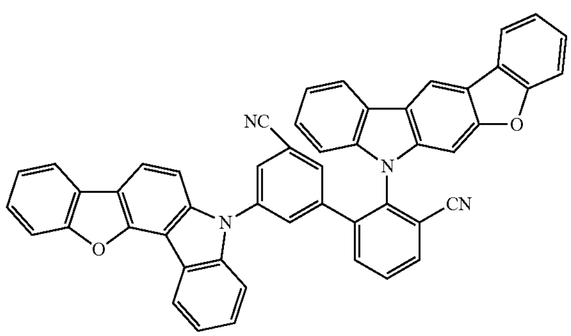
760
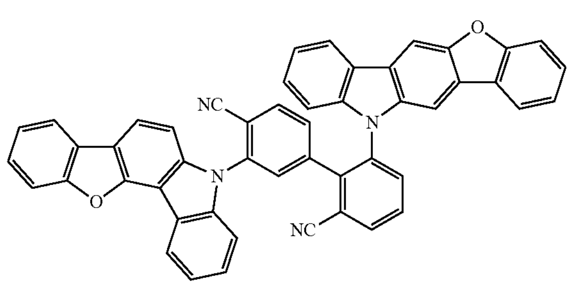
-continued
761
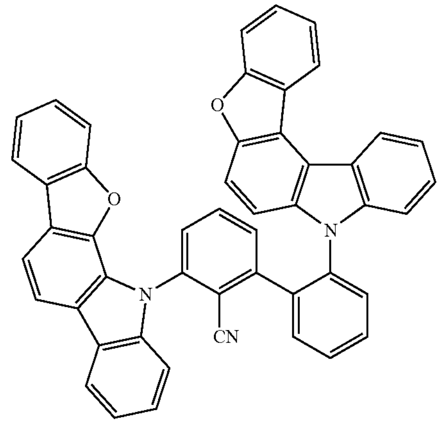
762
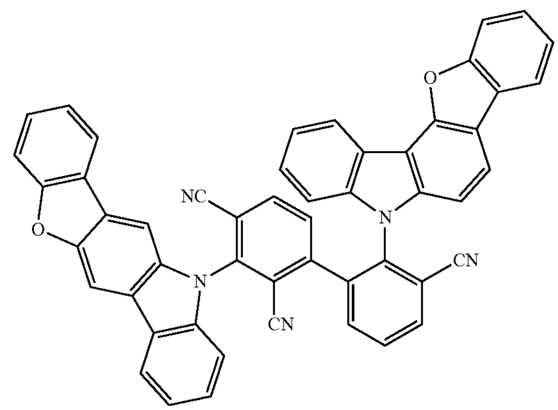
763
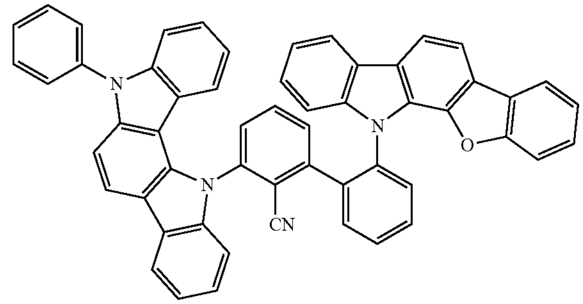
764
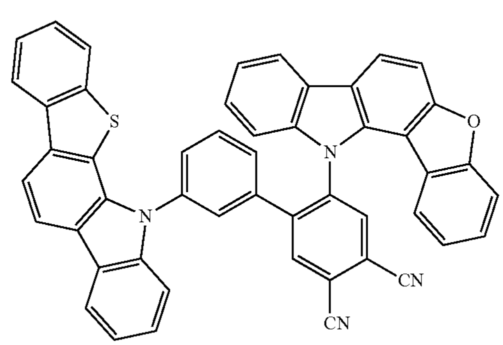

765
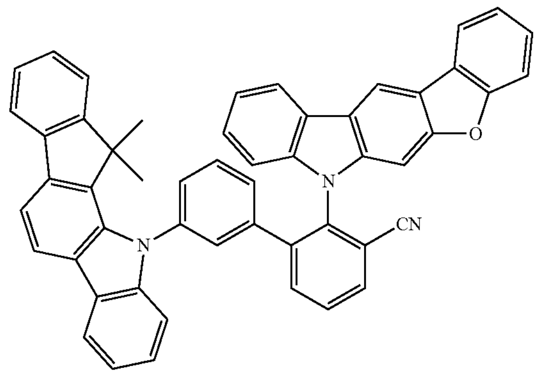
766
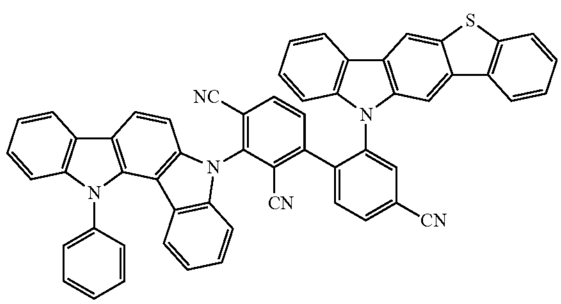
767
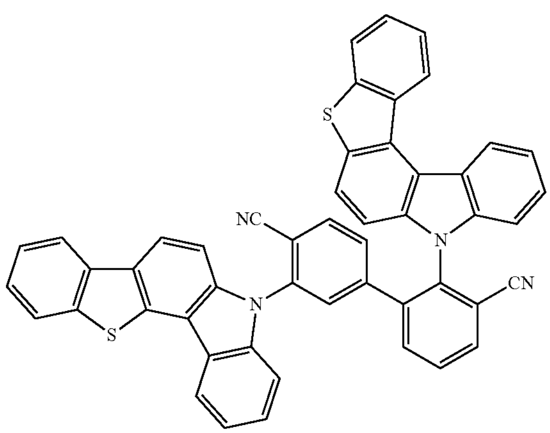
768
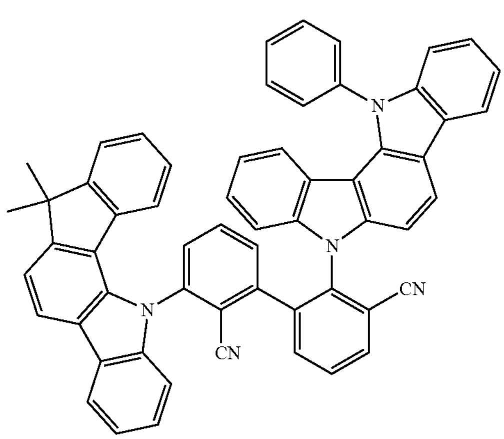
769
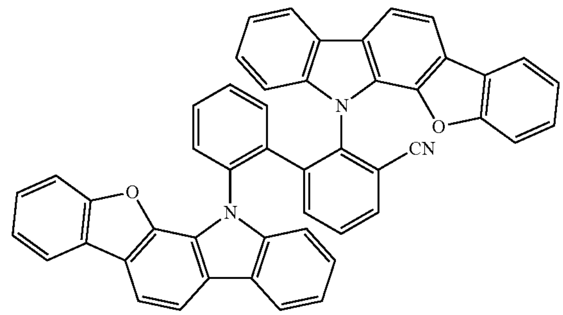
770
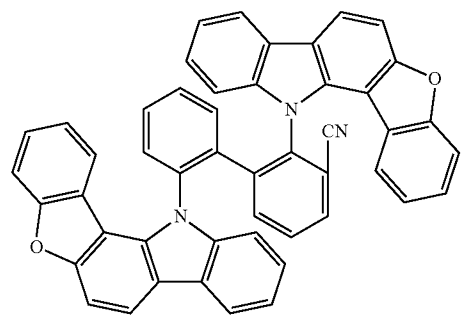
771
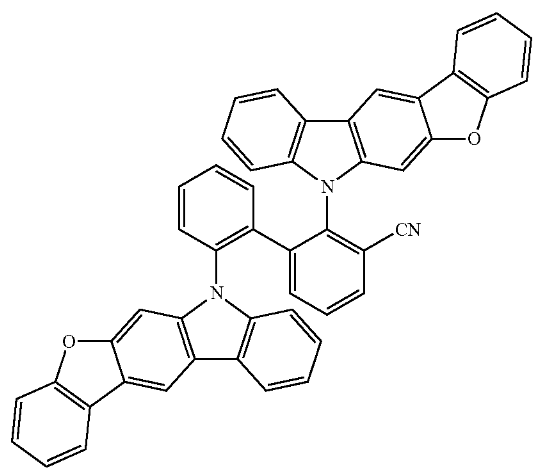
772
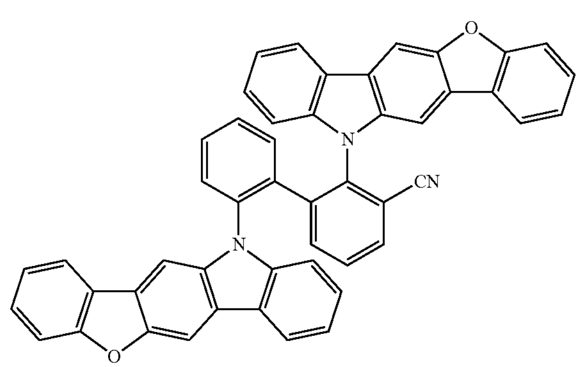

-continued
773
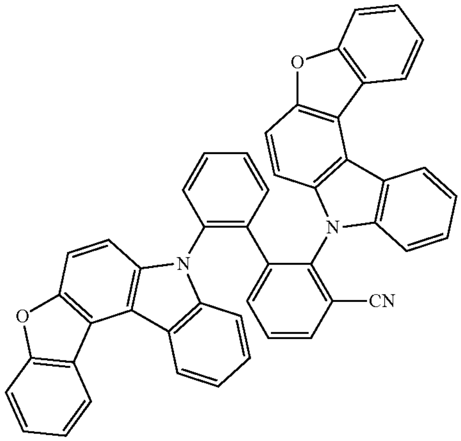
774
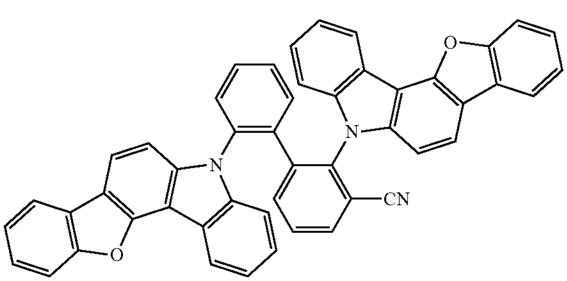
775
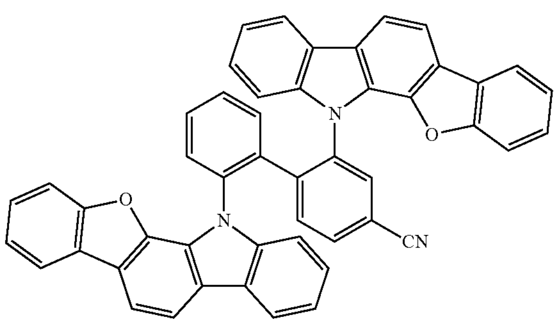
776
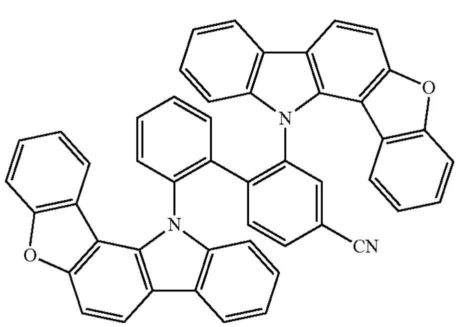
-continued
777
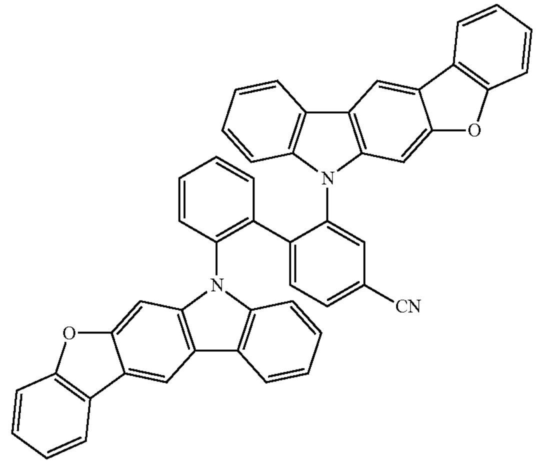
778
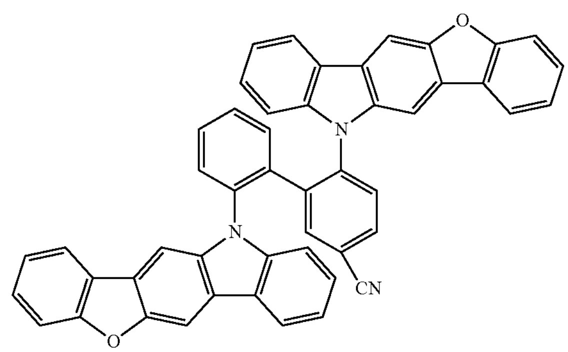
779
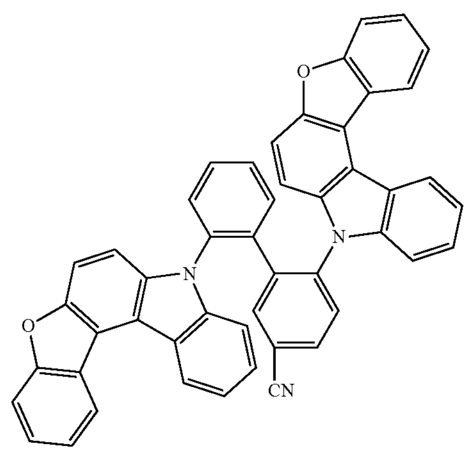
780
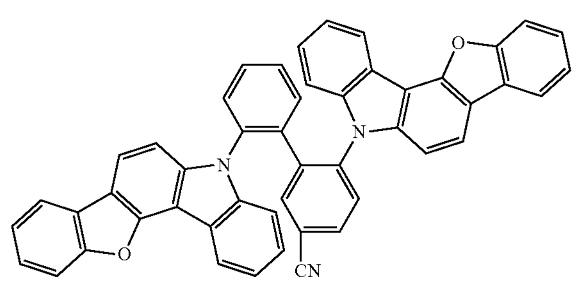

-continued
781
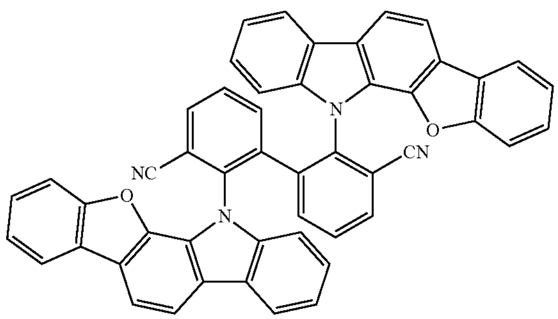
782
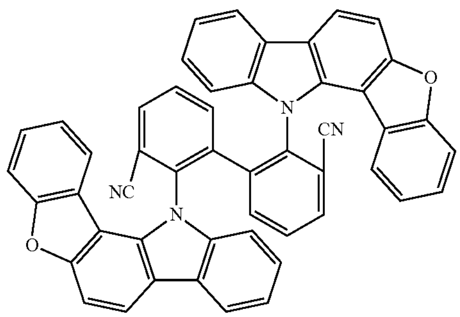
783
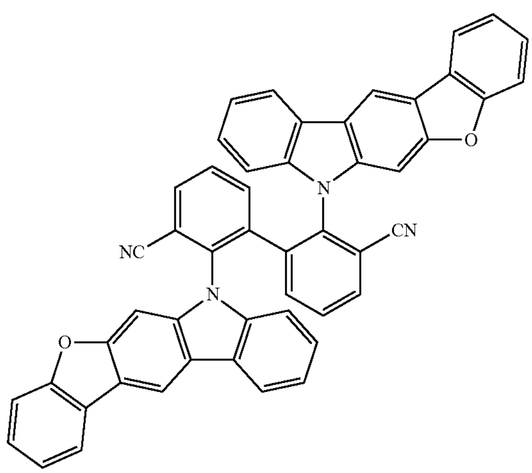
784
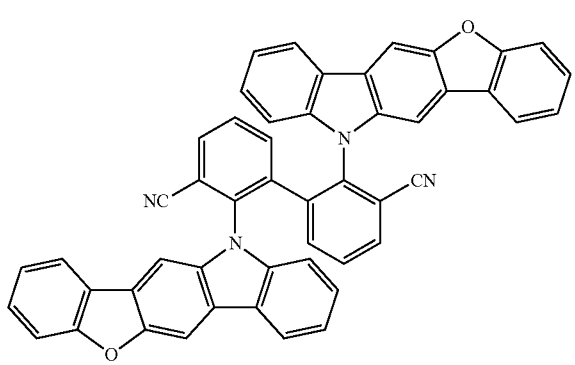
-continued
785
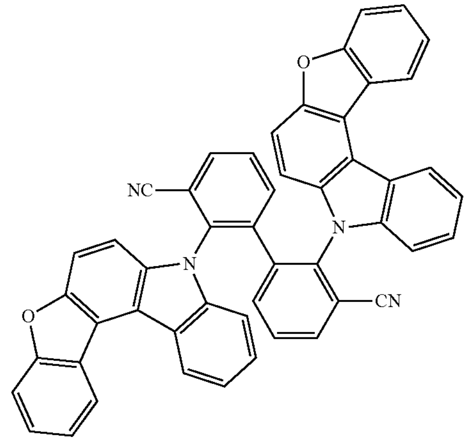
786
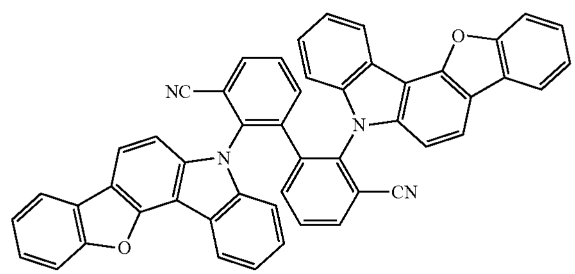
787
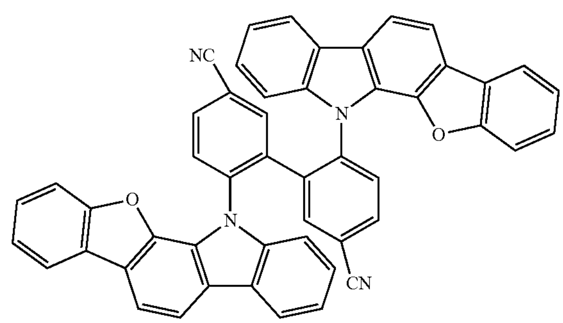
788
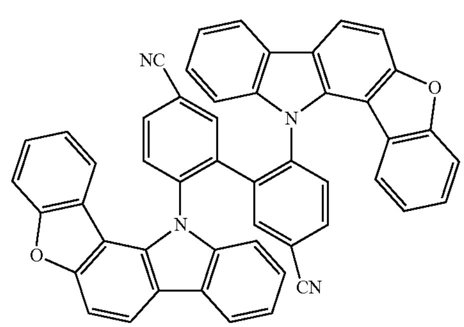

-continued
789
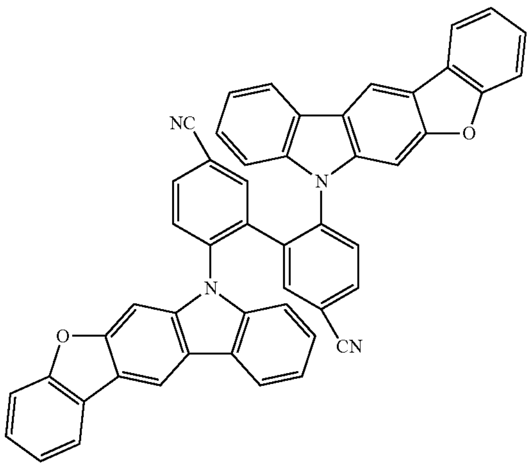
790
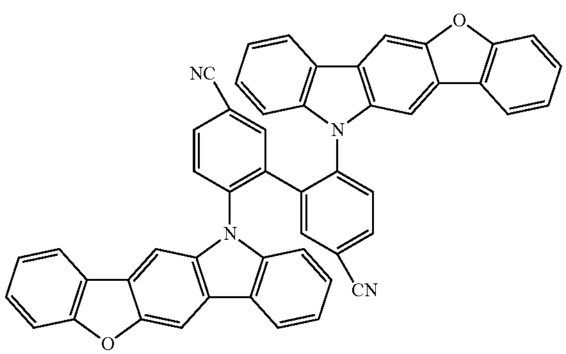
791
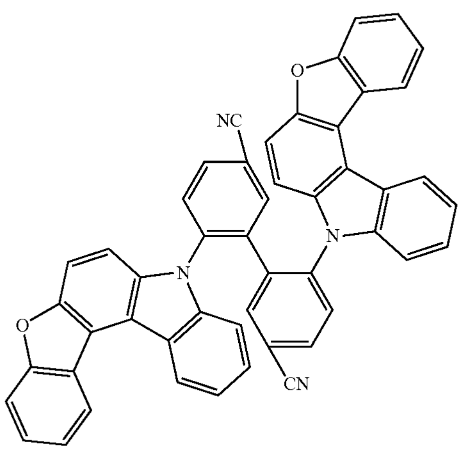
792
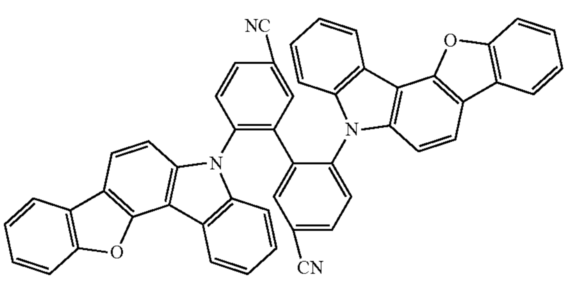
-continued
793
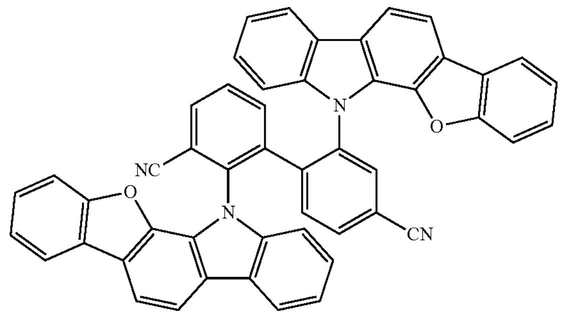
794
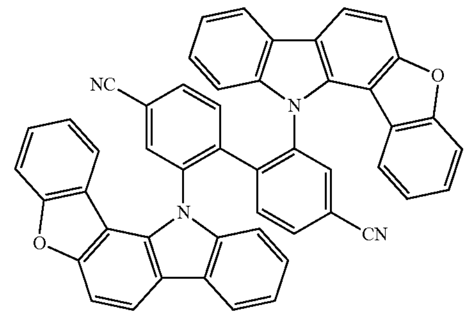
795
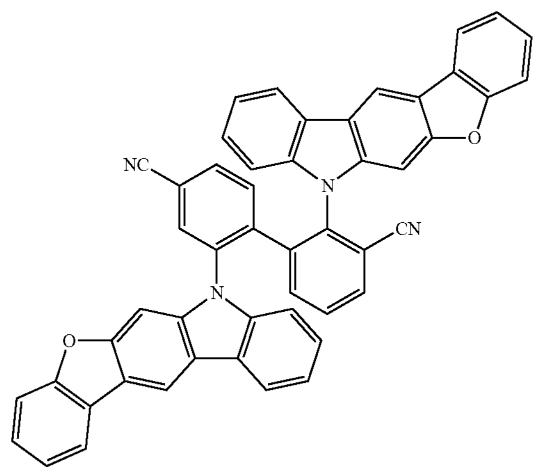
796
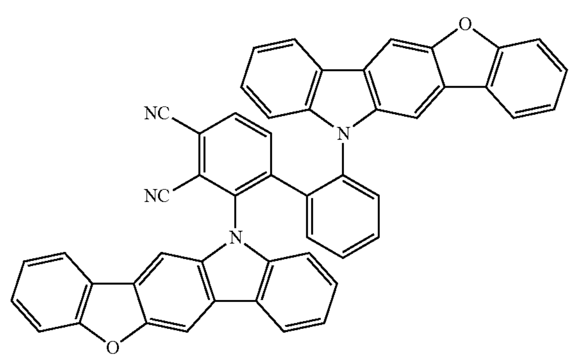

-continued
797
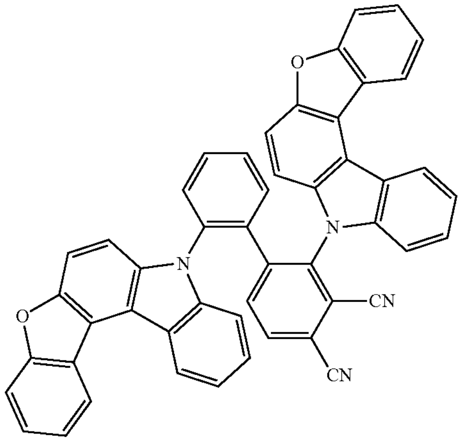
798
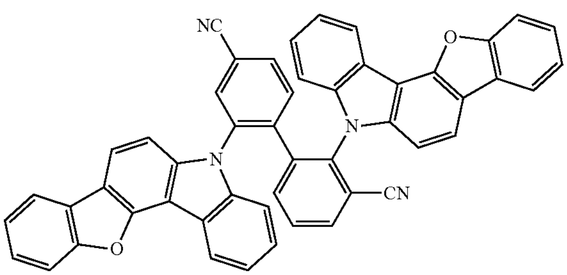
799
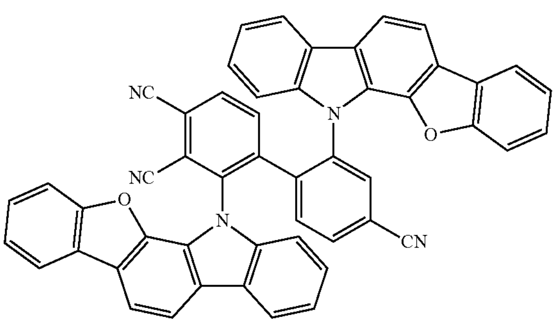
800
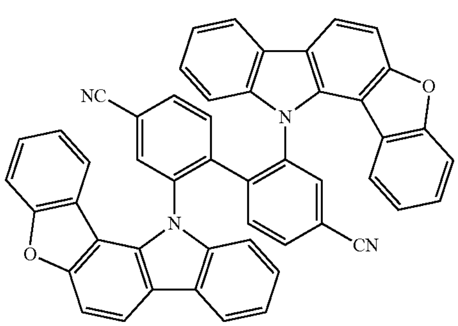
-continued
801
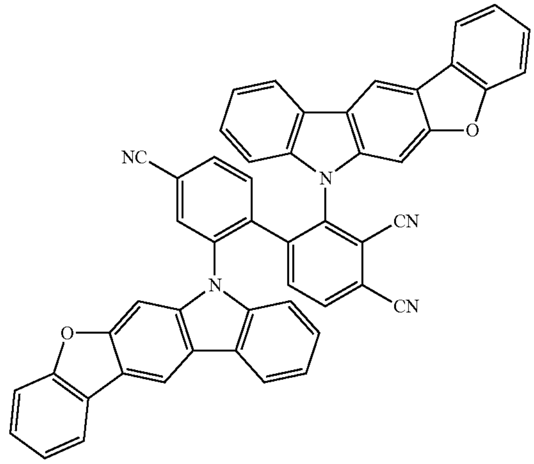
802
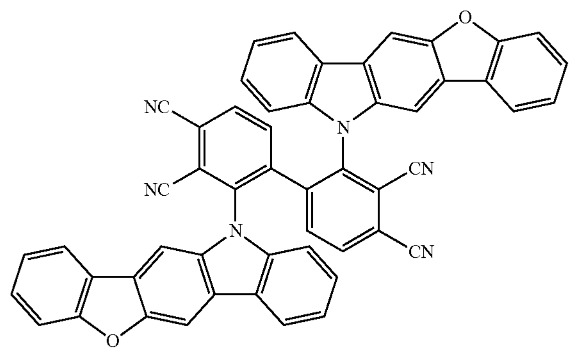
803
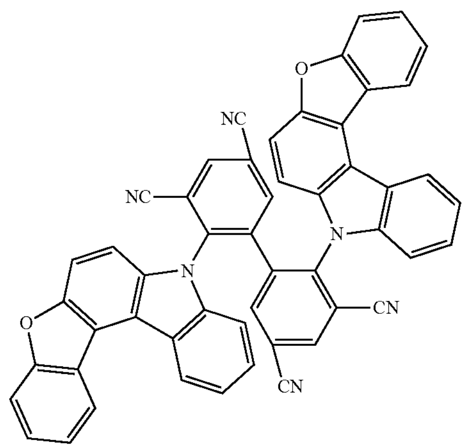
804
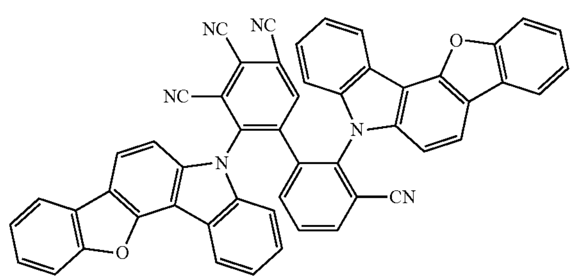

-continued
805
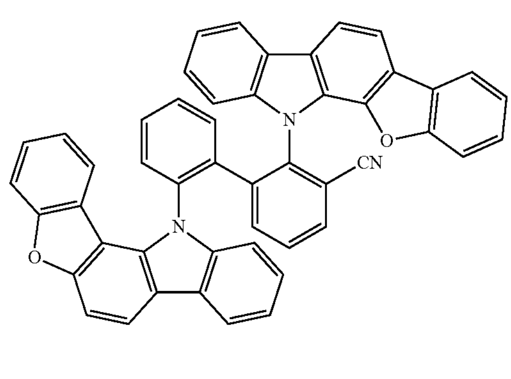
806
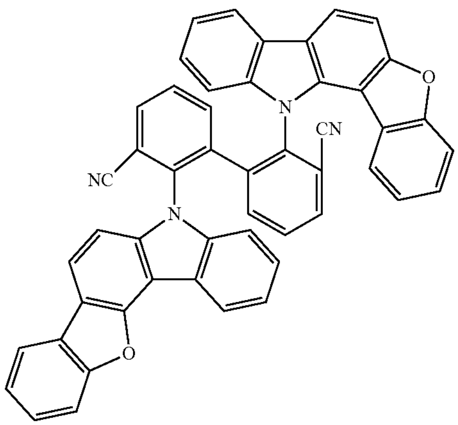
807
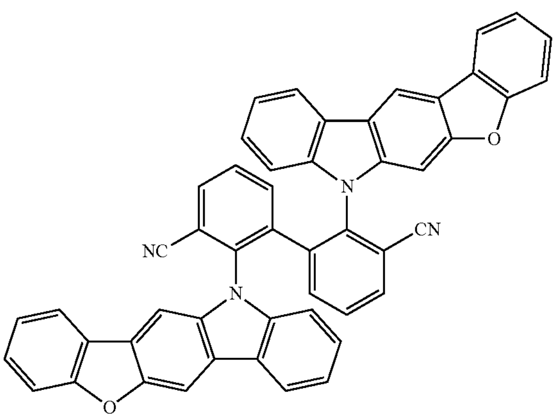
808
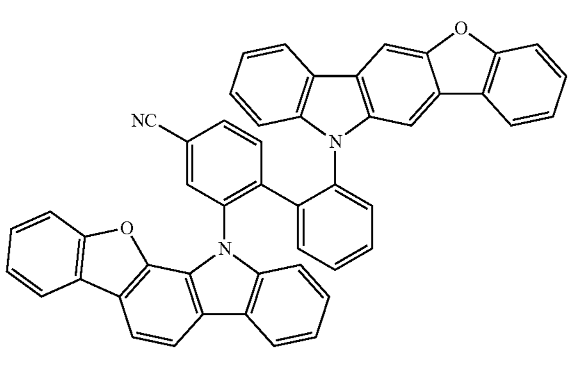
-continued
809
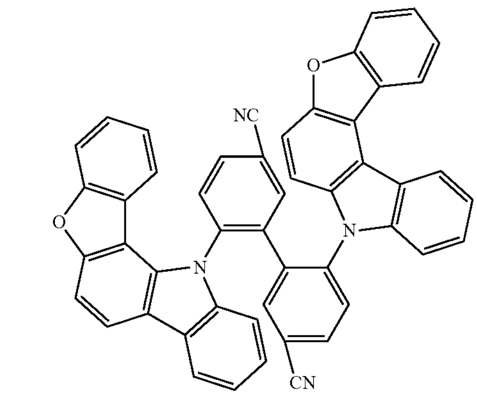
810
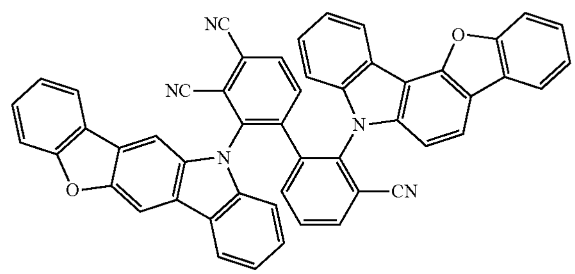
811
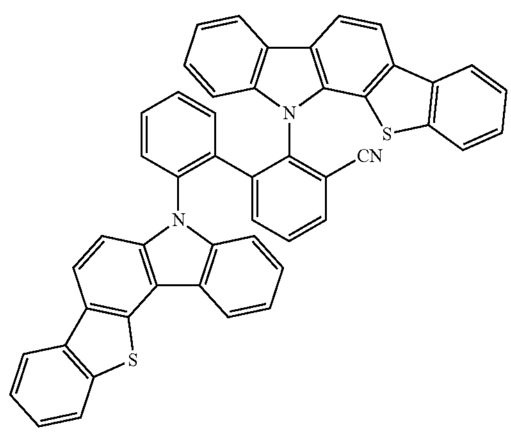
812
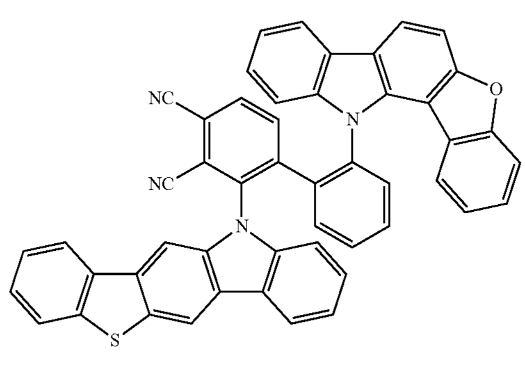

-continued
813
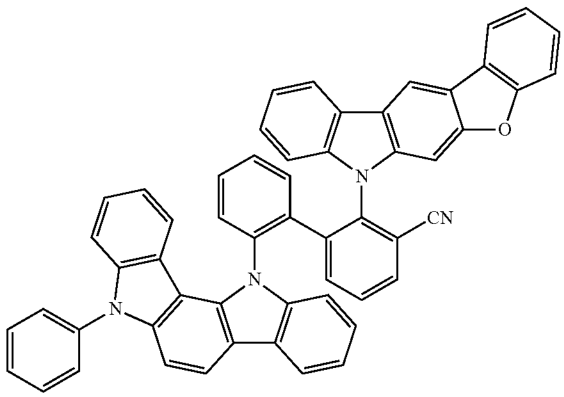
814
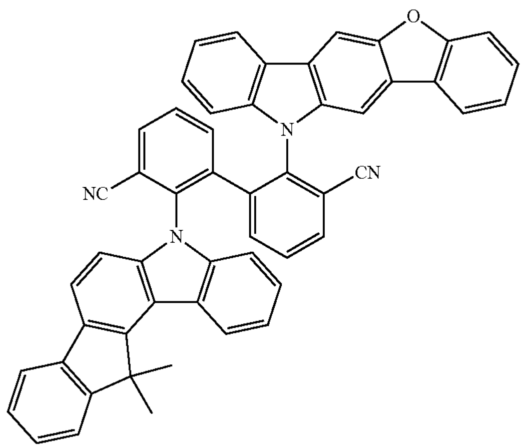
815
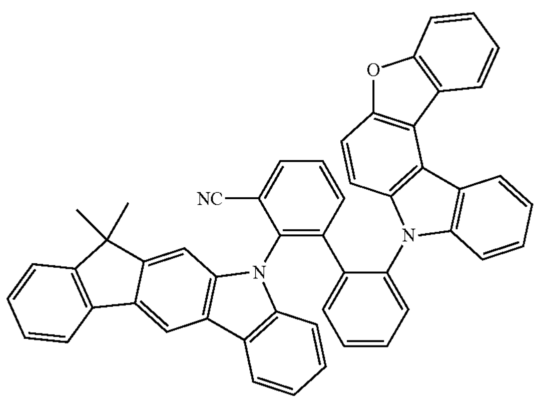
816
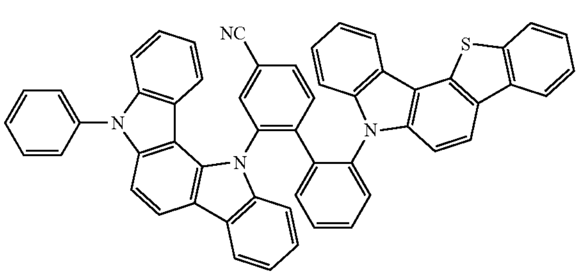
-continued
817
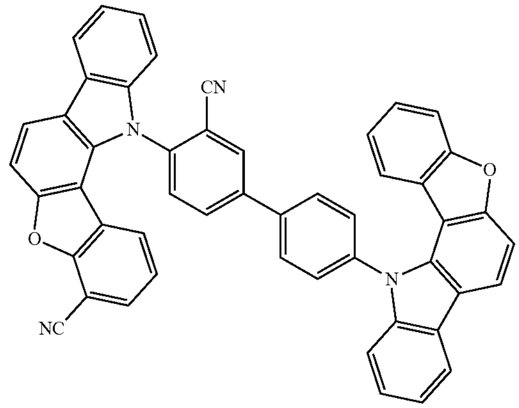
818
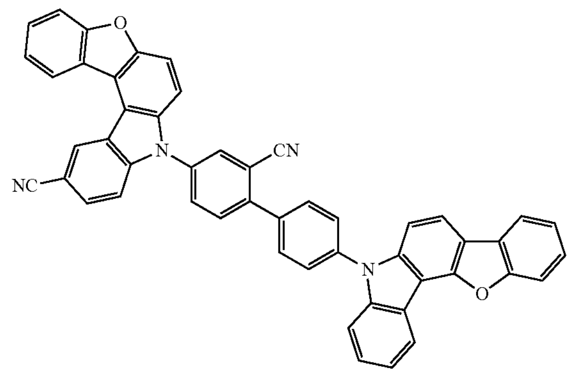
819
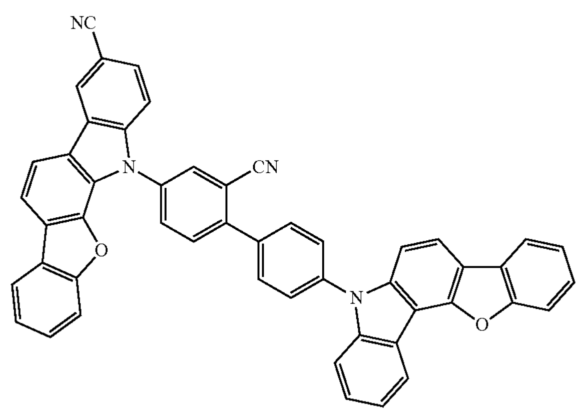
820
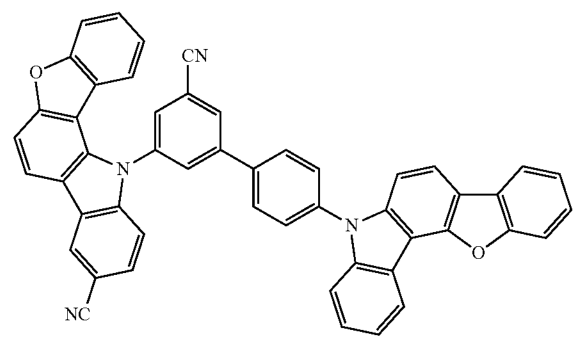

-continued
821
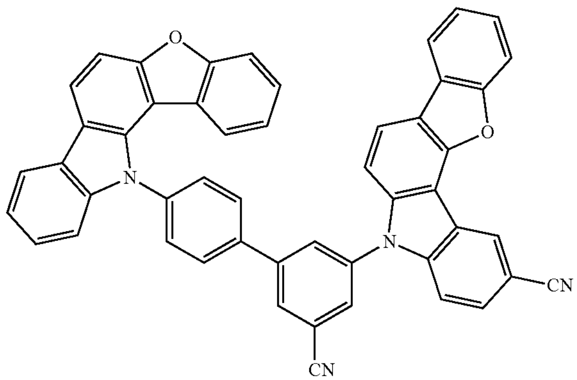
822
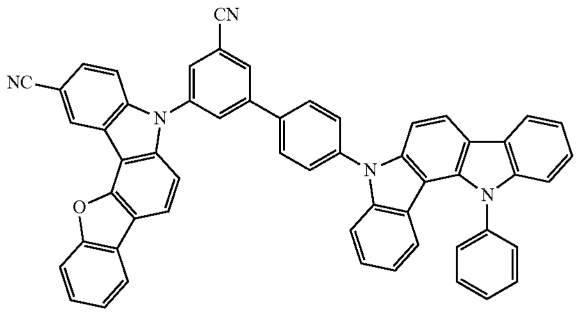
823
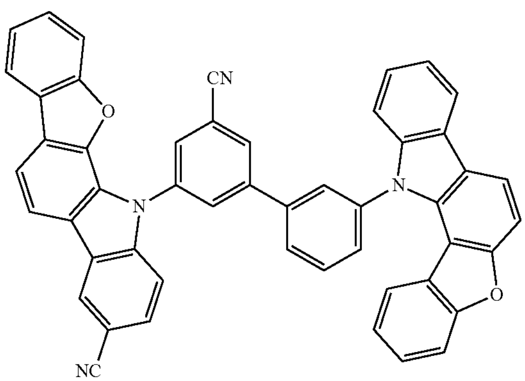
824
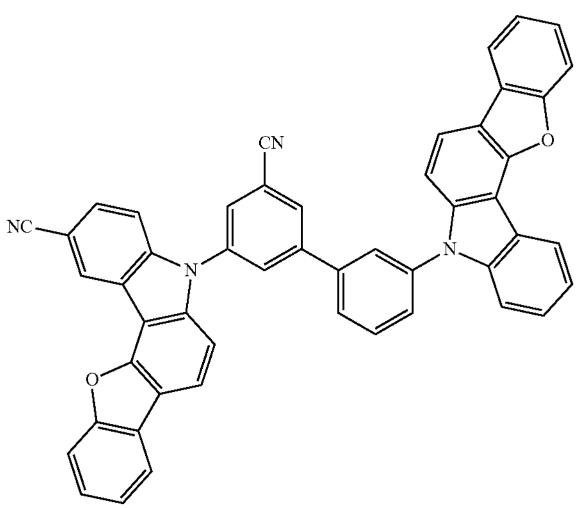
-continued
825
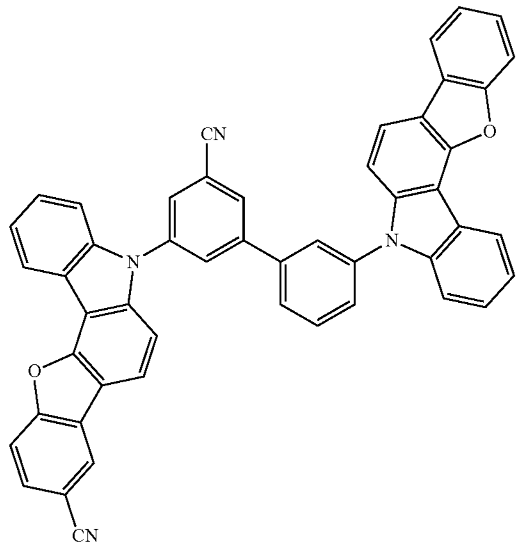
826
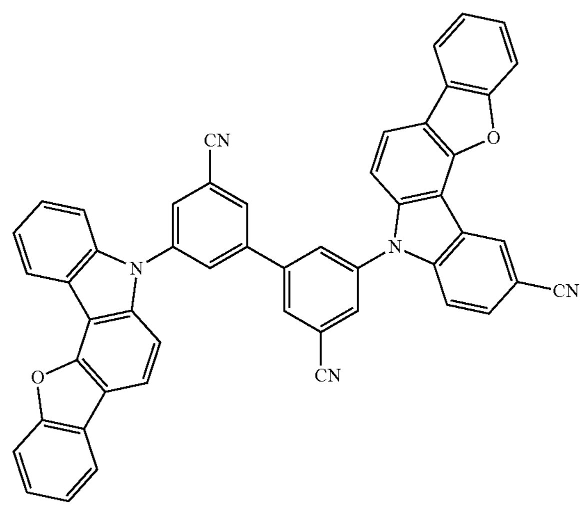
827
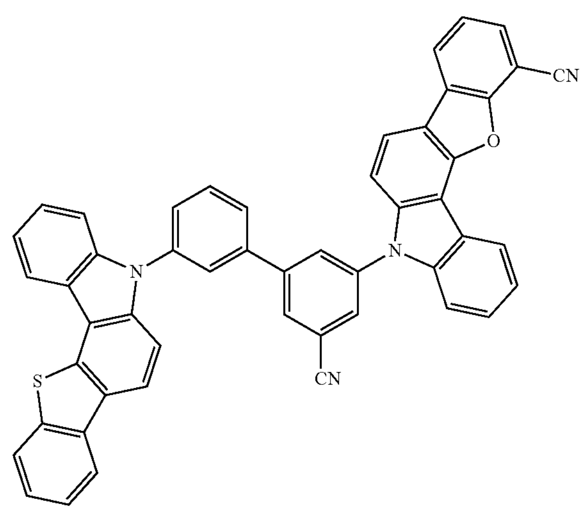

-continued
828
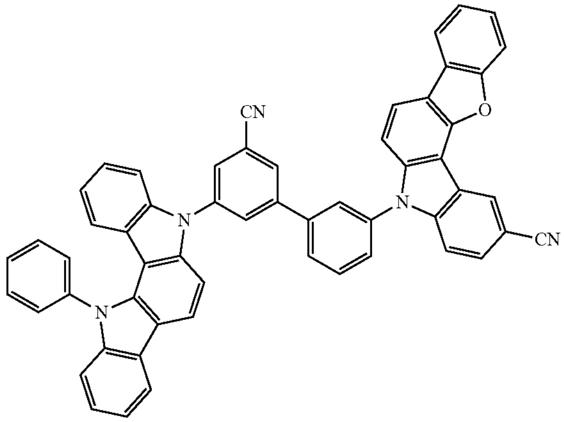
829
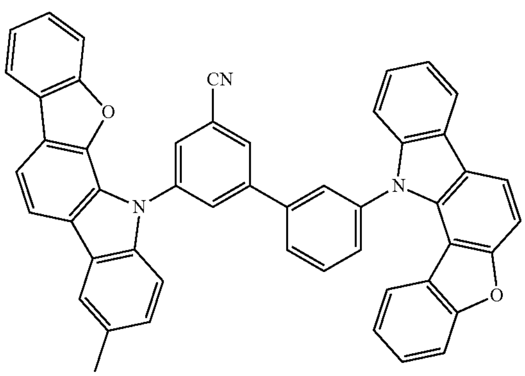
830
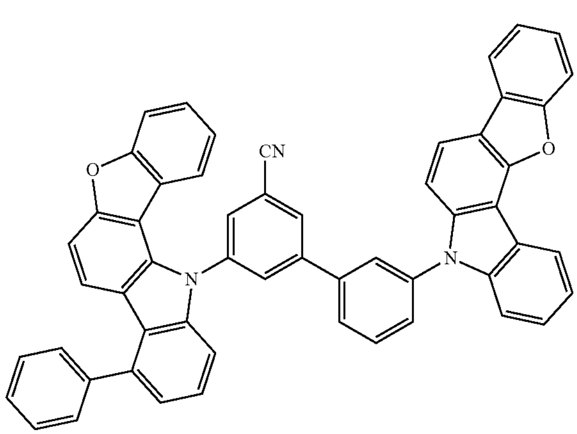
-continued
831
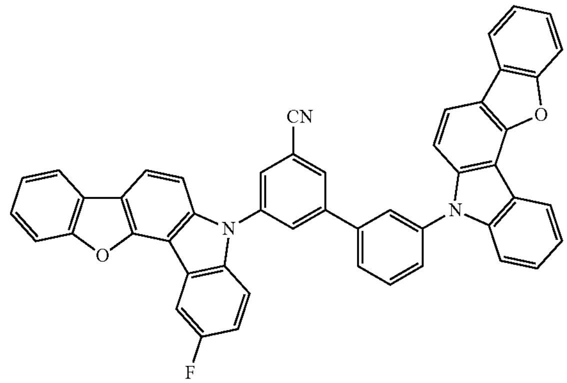
832
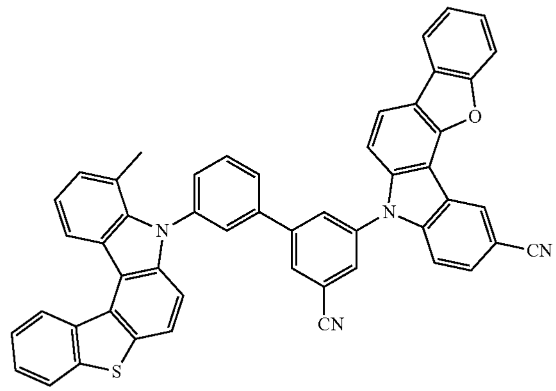
833
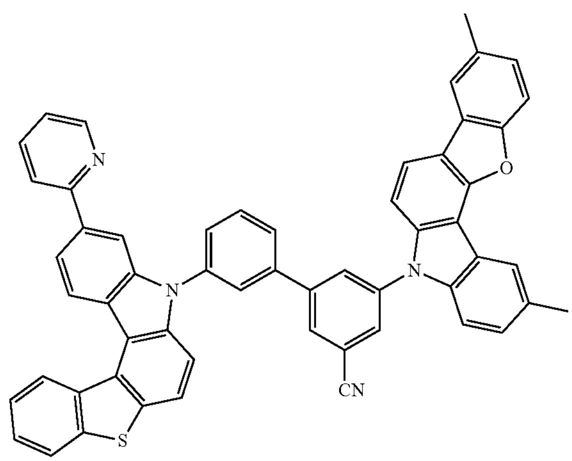
834
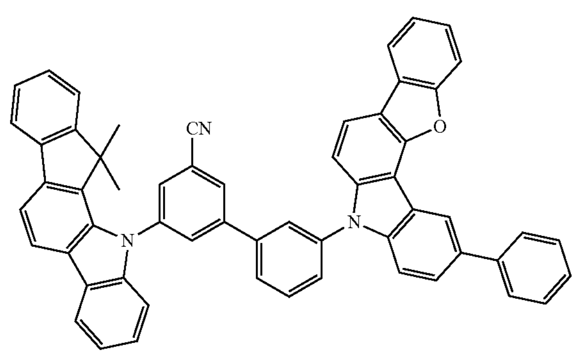

-continued
835
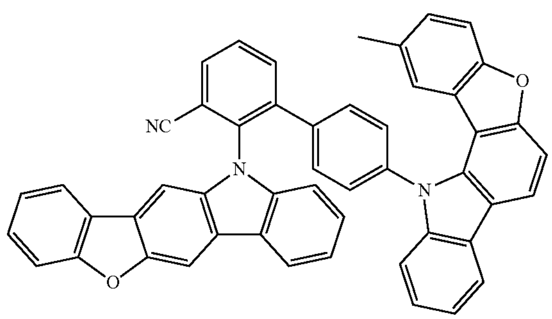
836
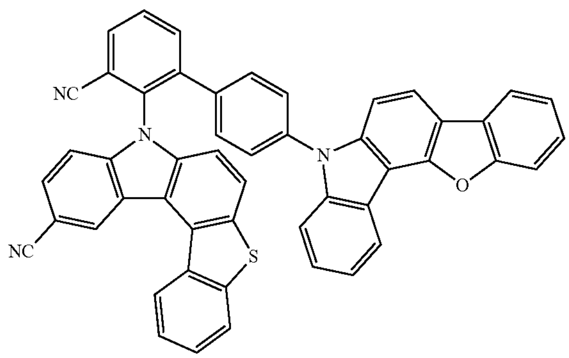
837
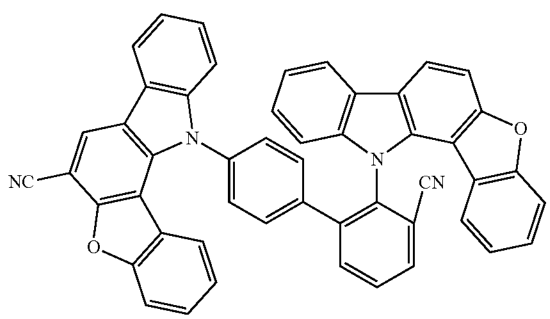
838
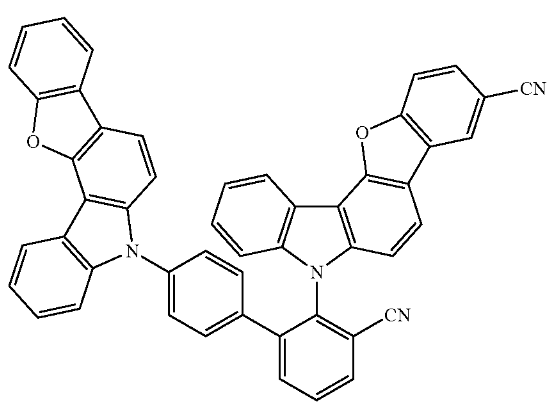
-continued
839
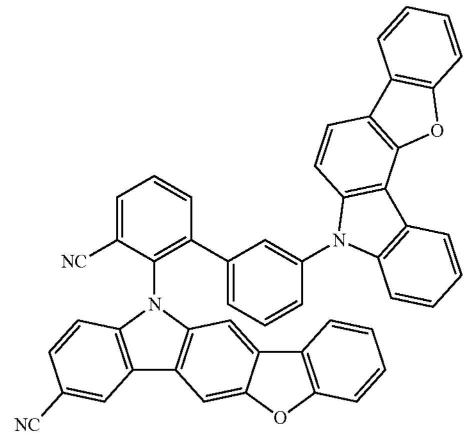
840
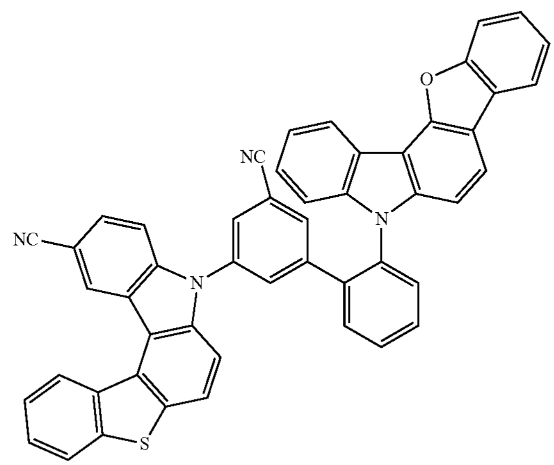
841
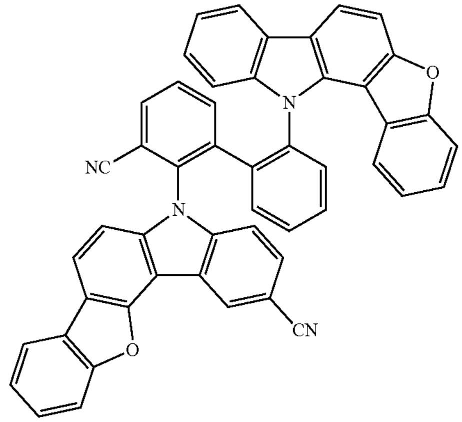

842
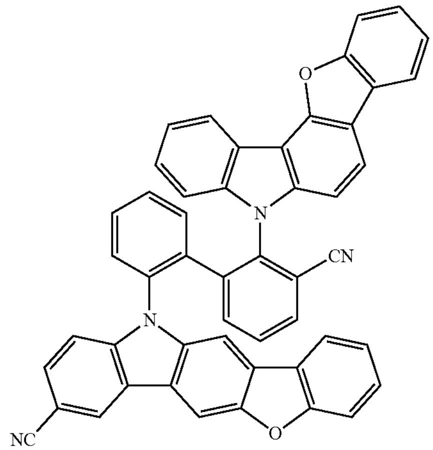
843
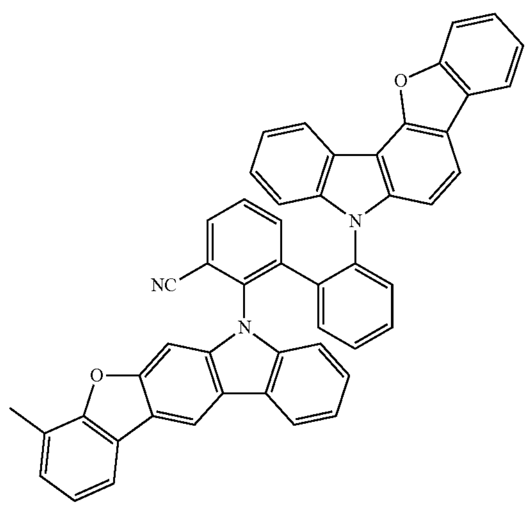
844
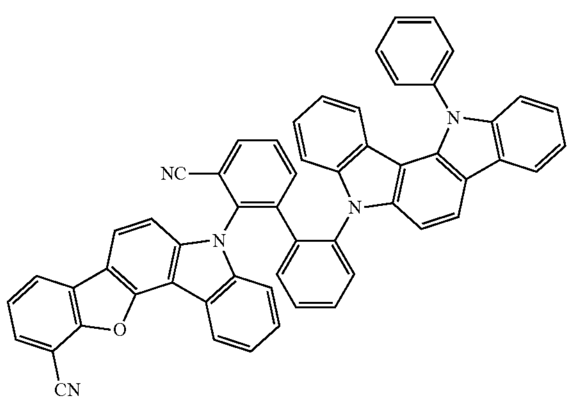
845
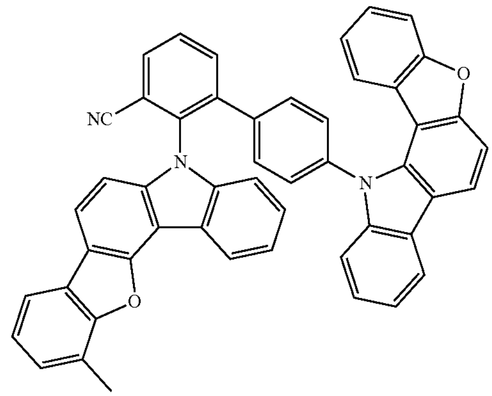
846
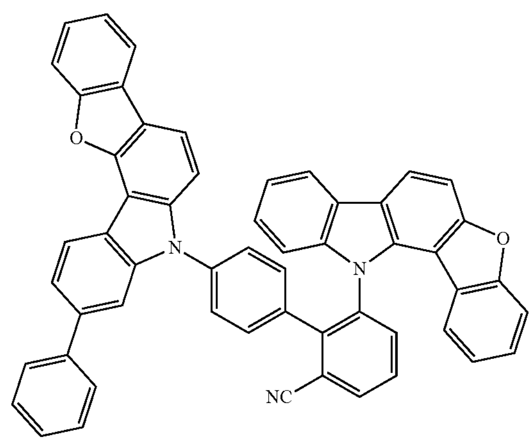
847
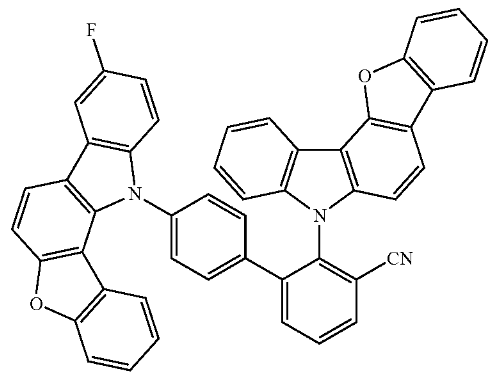

-continued
848
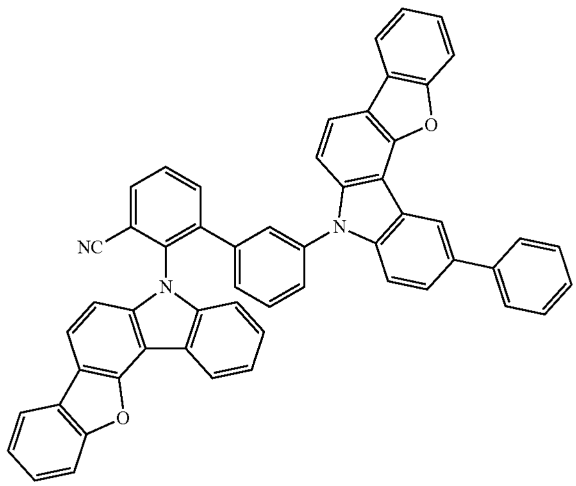
849
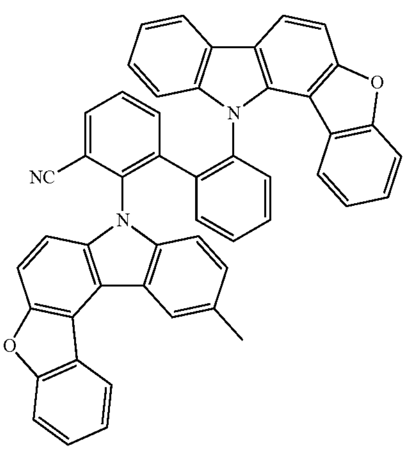
850
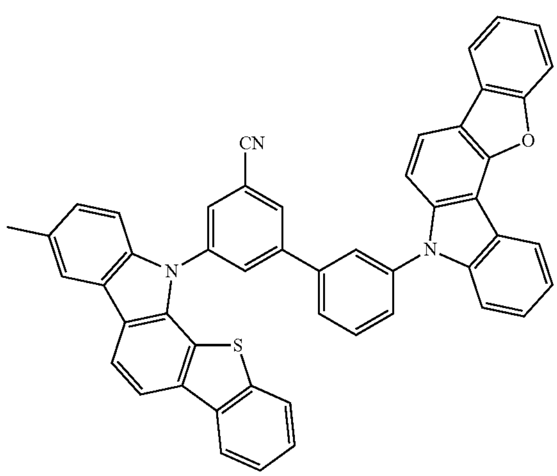
-continued
851
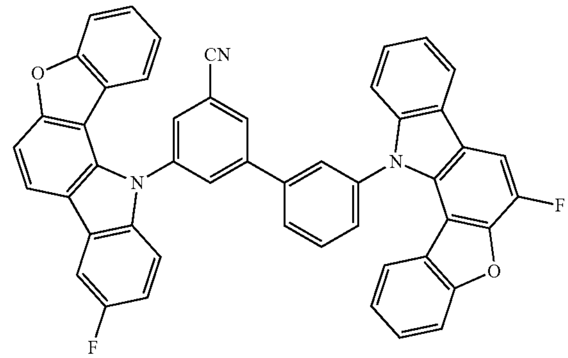
852
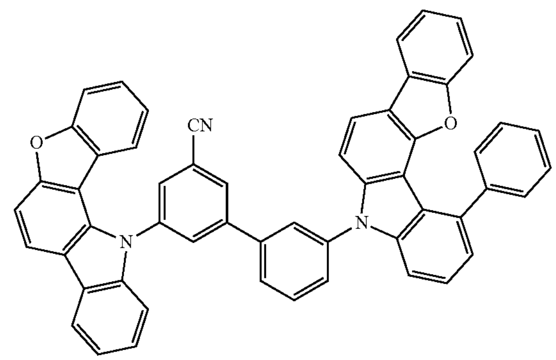
Group HE3
1
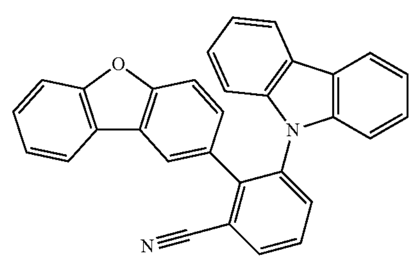
2
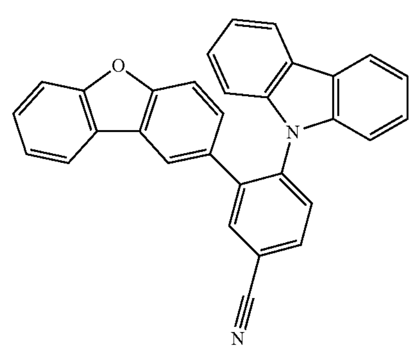

-continued
3
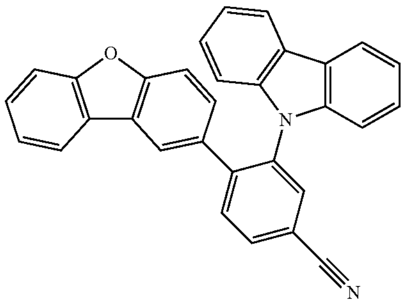
4
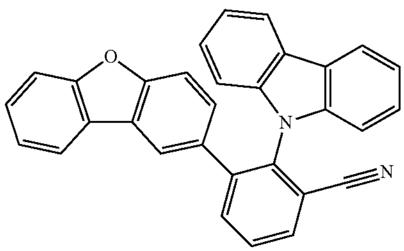
5
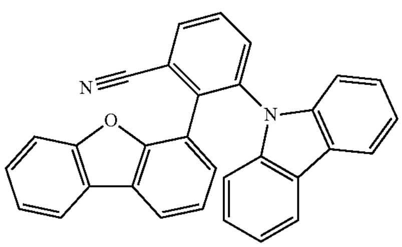
6
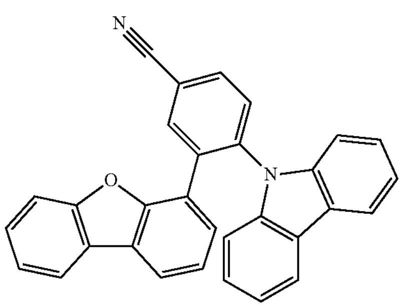
7
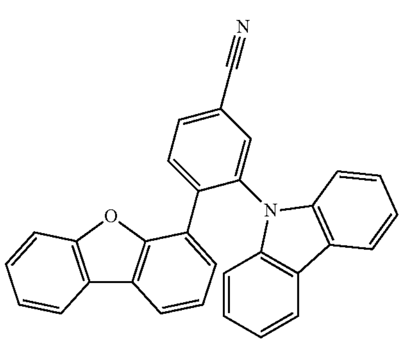
-continued
8
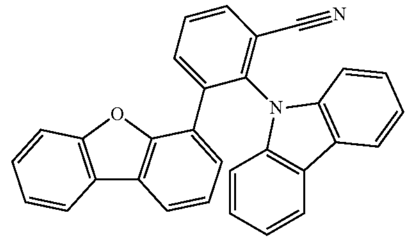
9
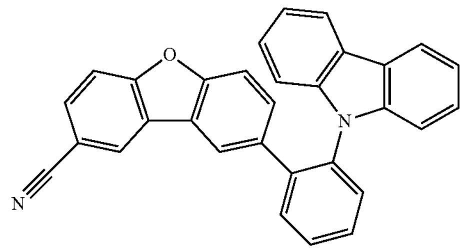
10
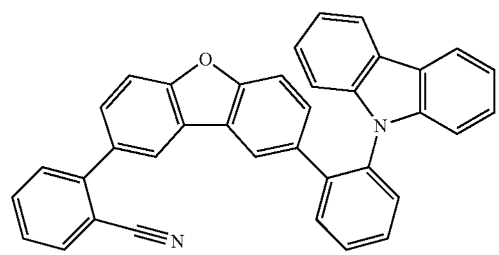
11
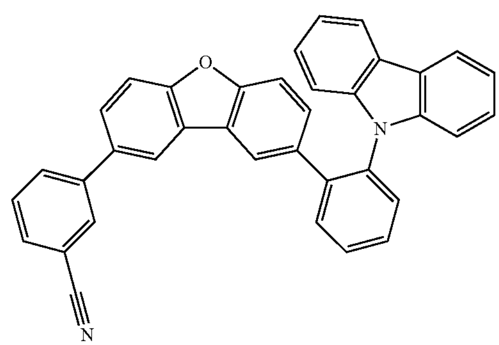
12
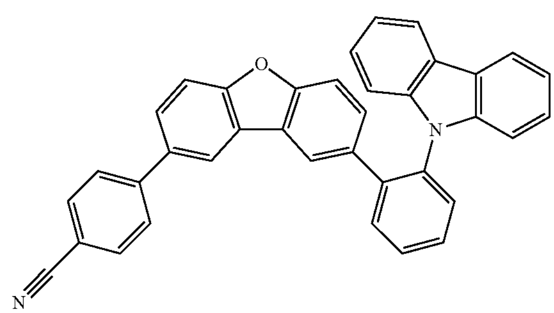

-continued
13
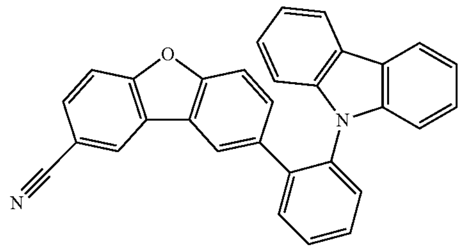
14
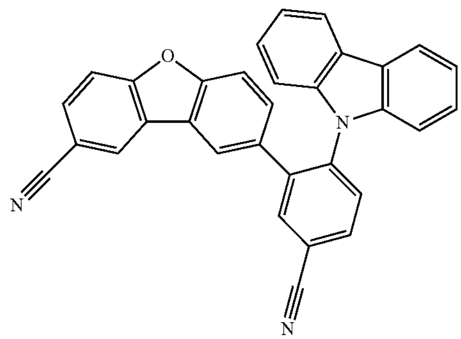
15
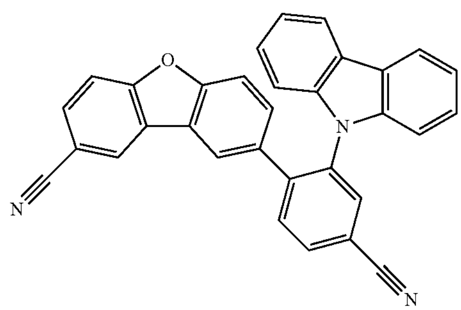
16
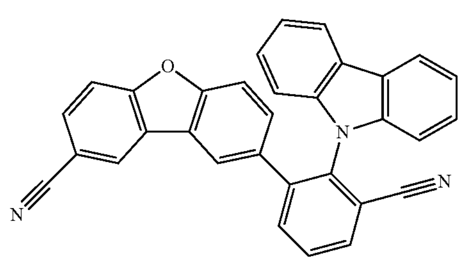
17
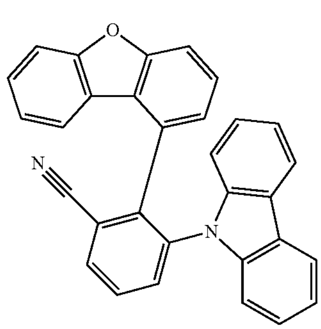
-continued
18
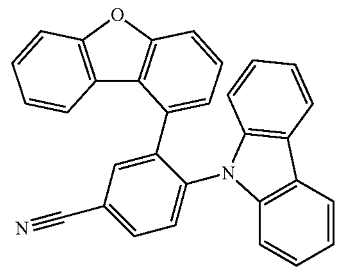
19
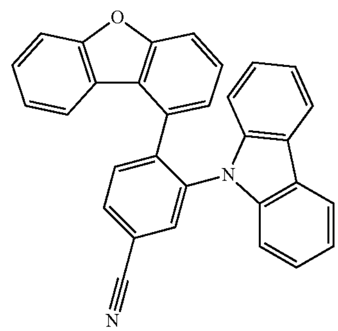
20
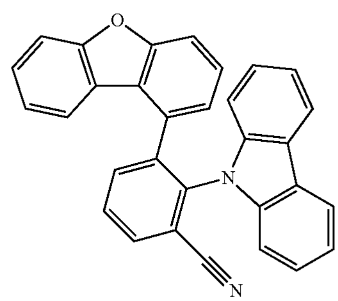
21
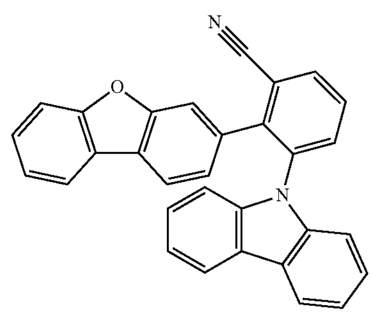
22
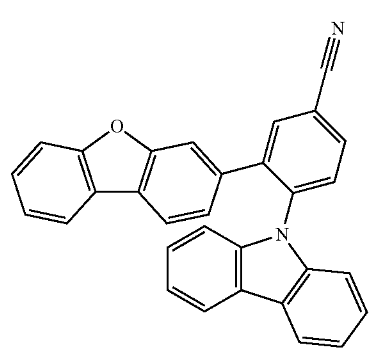

-continued
23
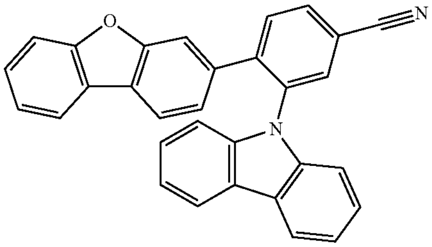
24
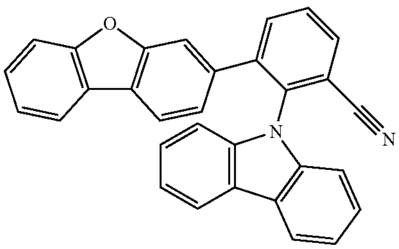
25
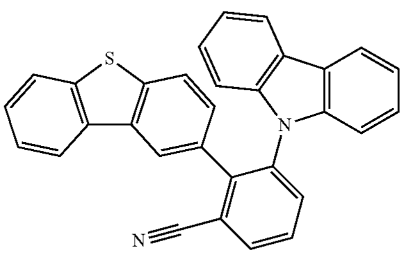
26
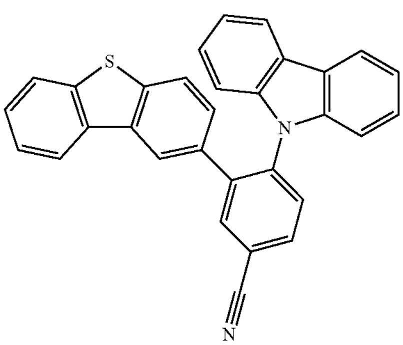
27
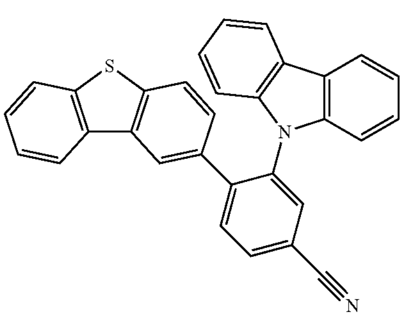
-continued
28
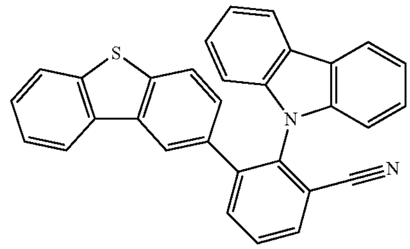
29
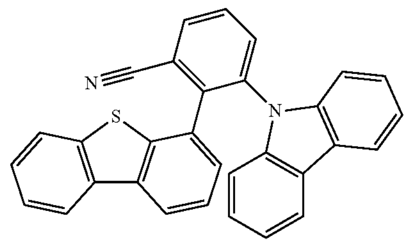
30
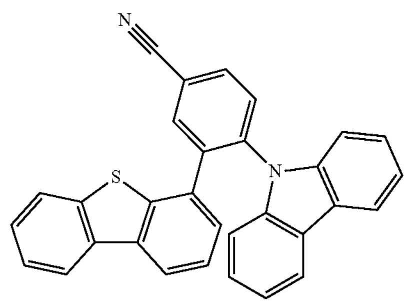
31
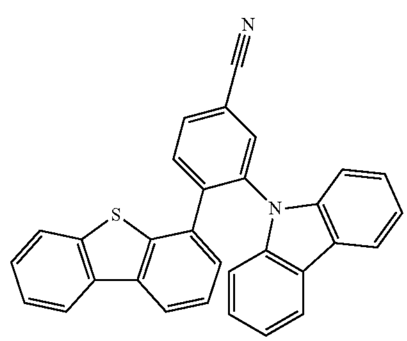
32
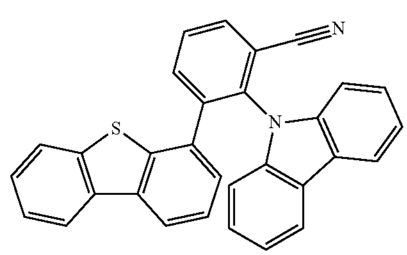

-continued
33
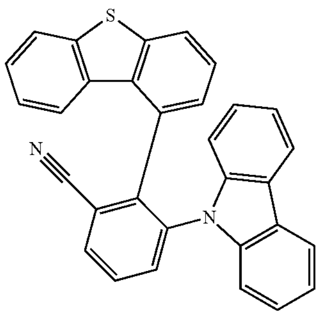
34
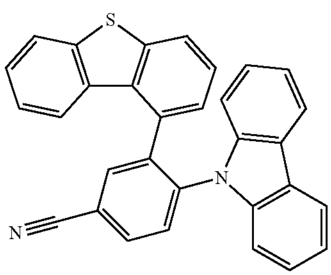
35
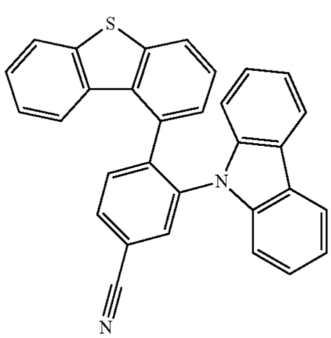
36
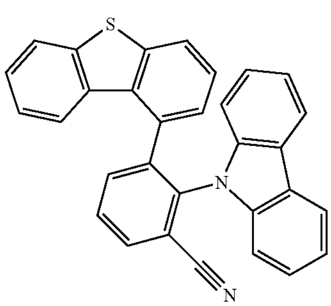
37
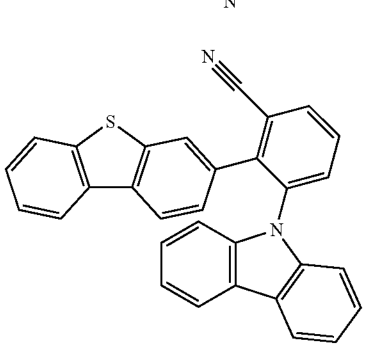
-continued
38
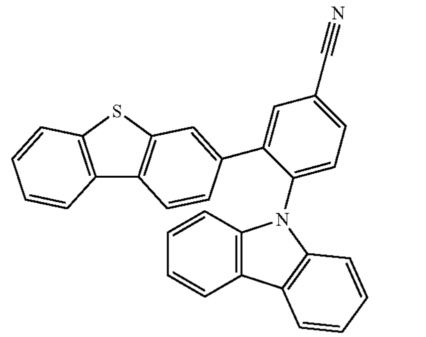
39
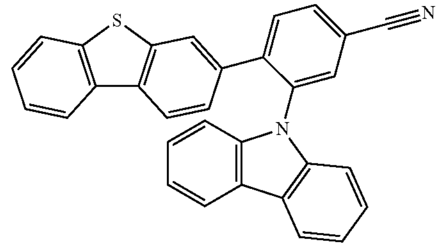
40
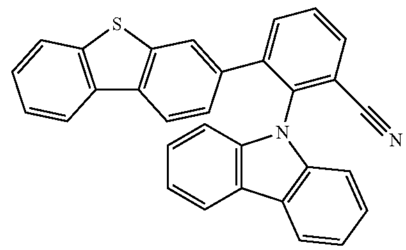
41
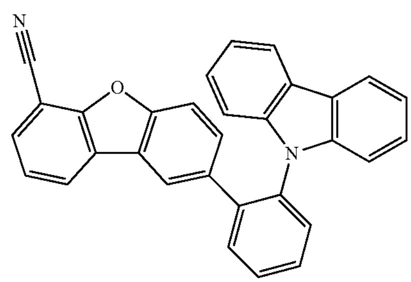
42
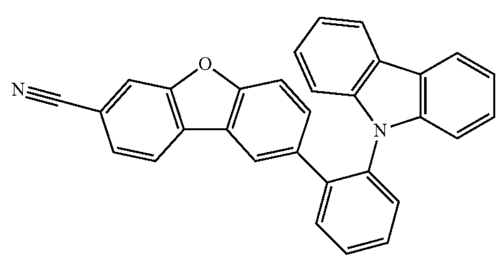
43
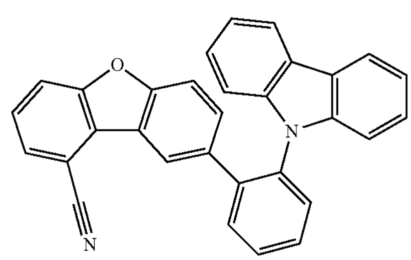

-continued
44
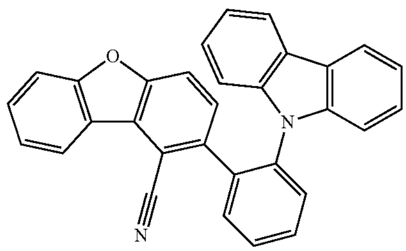
45
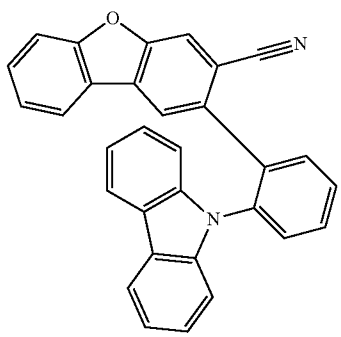
46
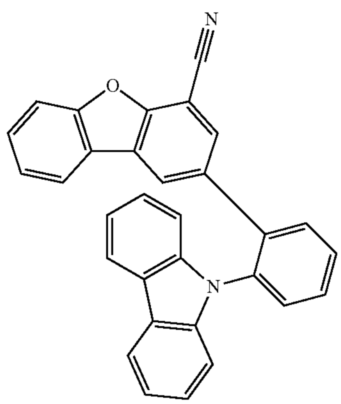
47
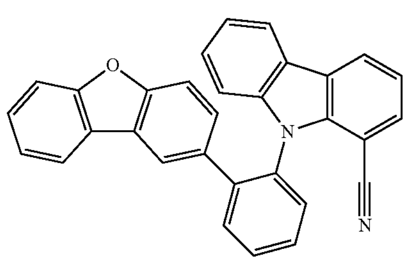
48
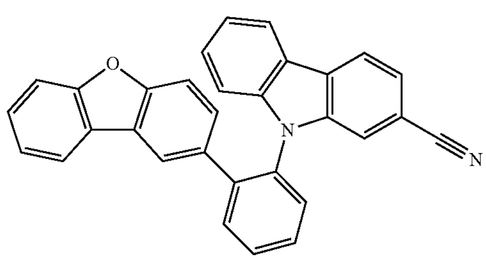
-continued
49
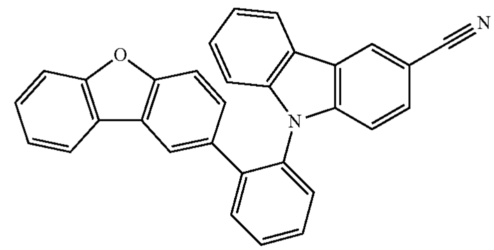
50
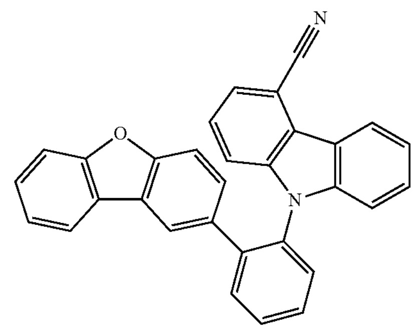
51
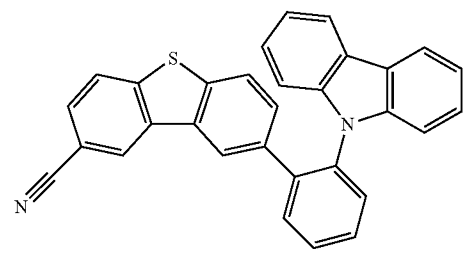
52
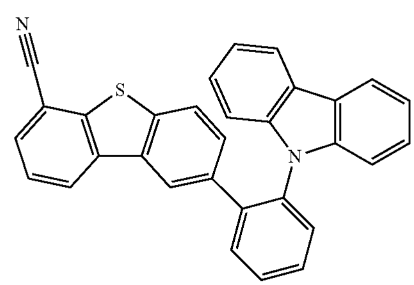
53
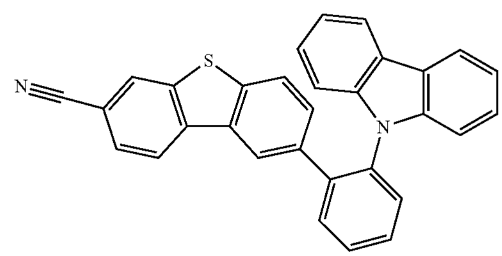
54
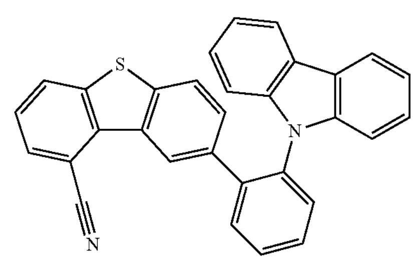

-continued
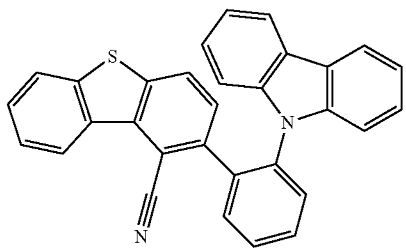
55
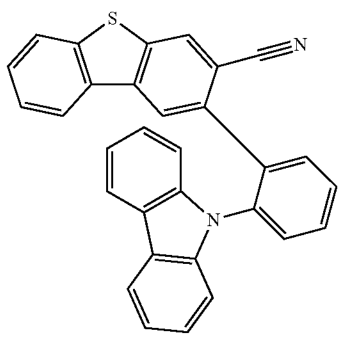
56
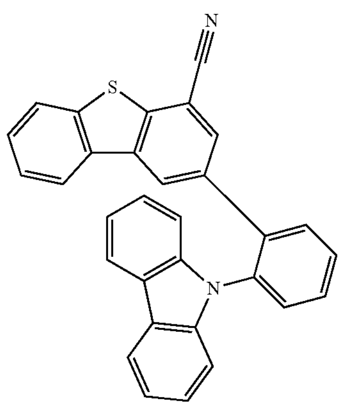
57
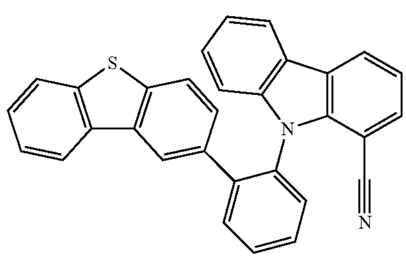
58
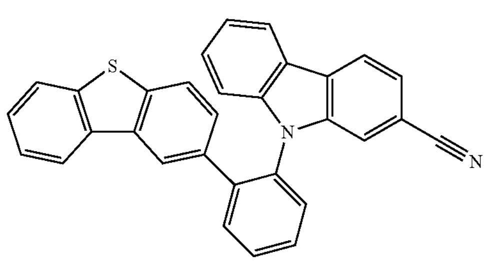
59
-continued
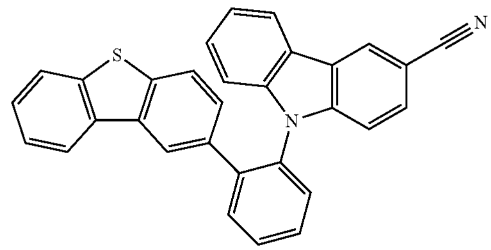
60
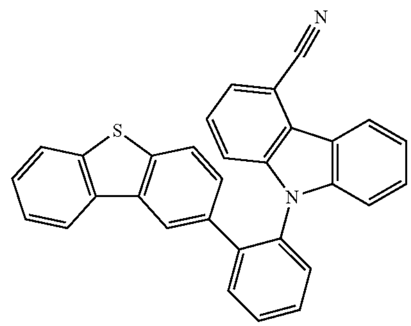
61
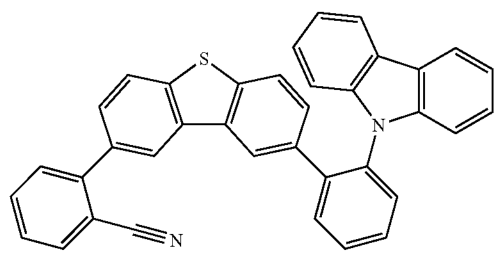
62
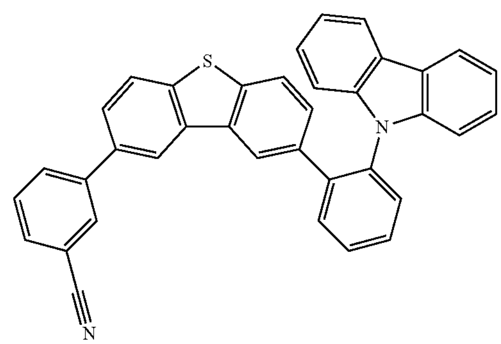
63
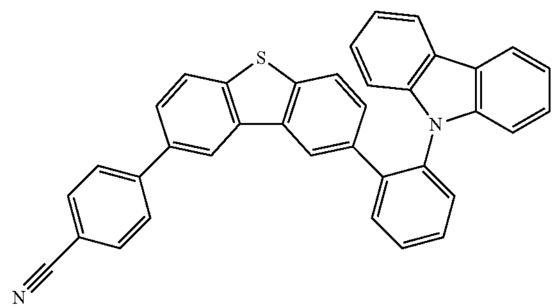
64

-continued
65
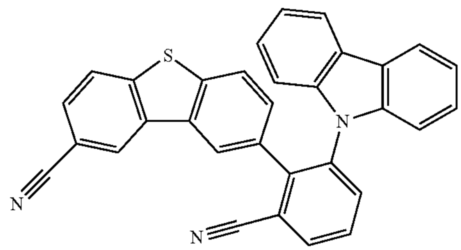
66
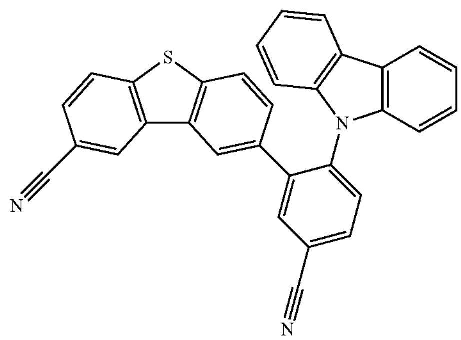
67
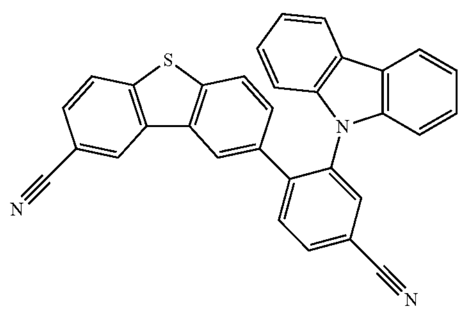
68
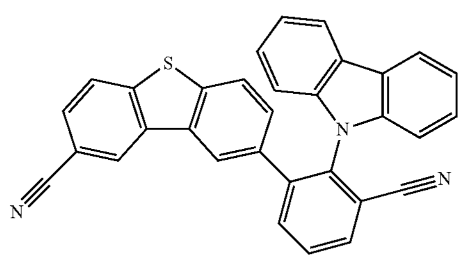
69
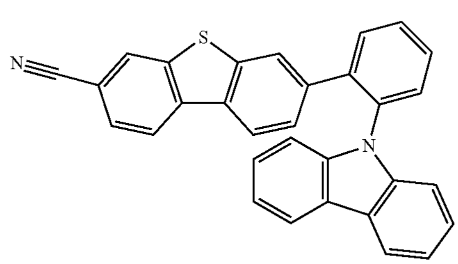
-continued
70
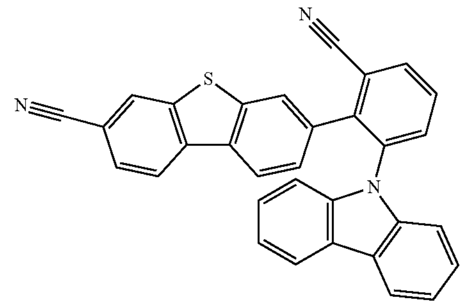
71
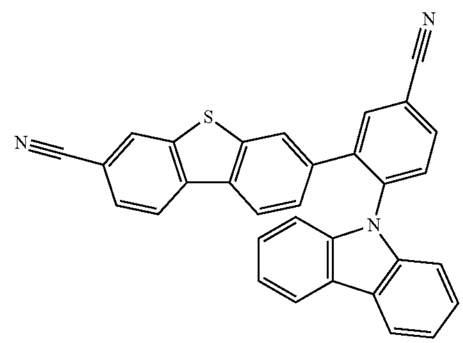
72
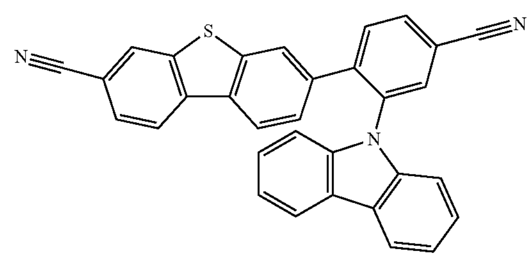
73
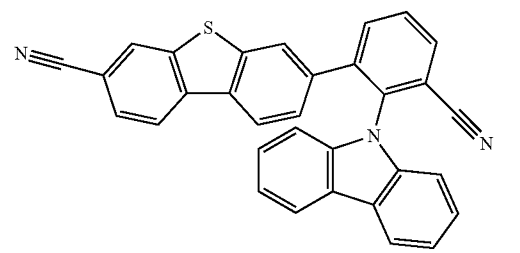
74
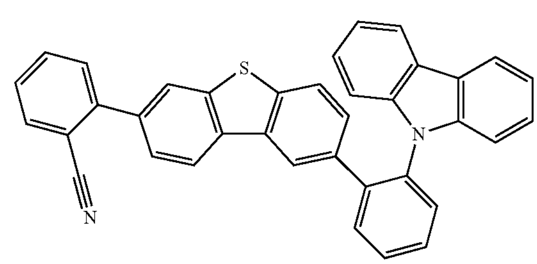

-continued
75
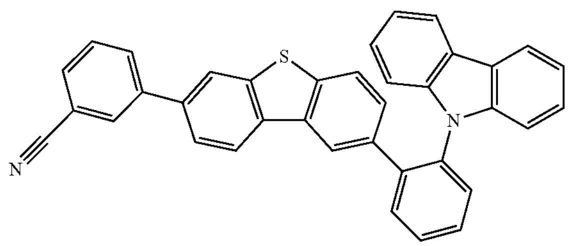
76
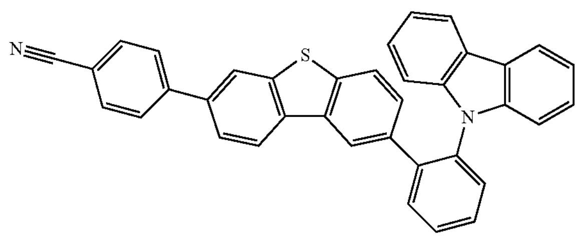
77
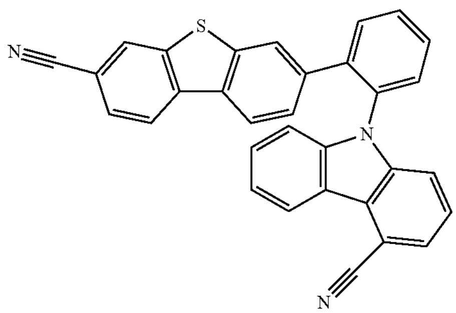
78
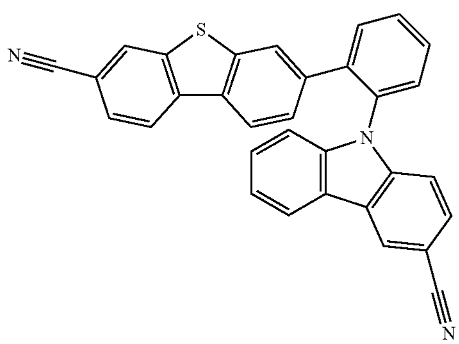
79
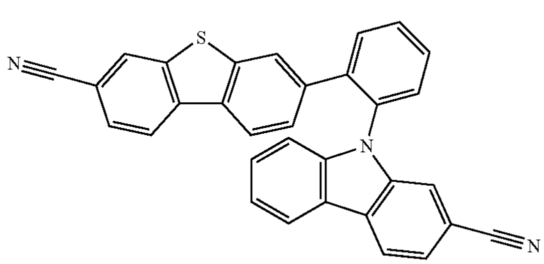
-continued
80
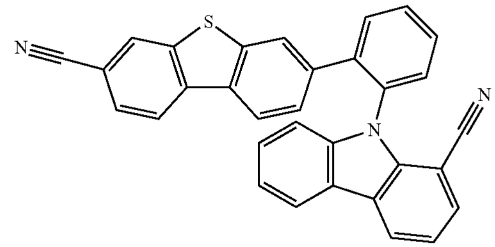
81
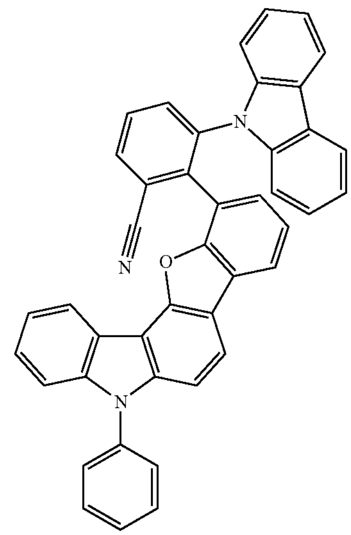
82
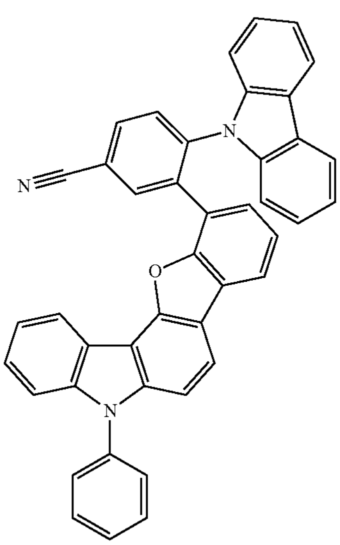

-continued
83
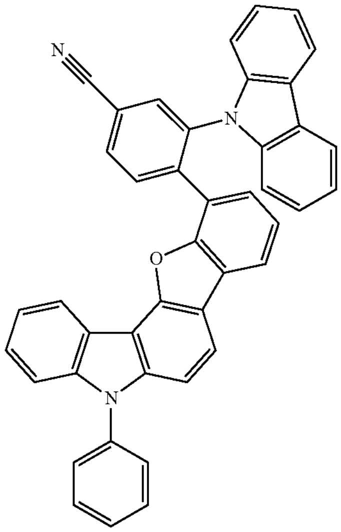
84
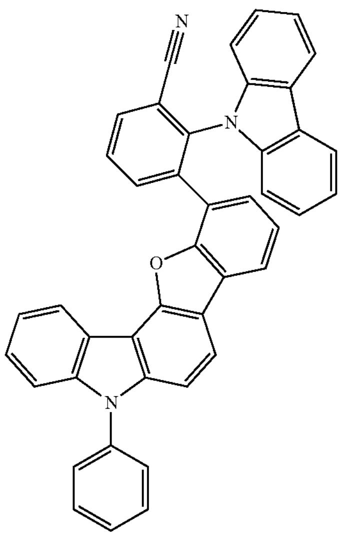
85
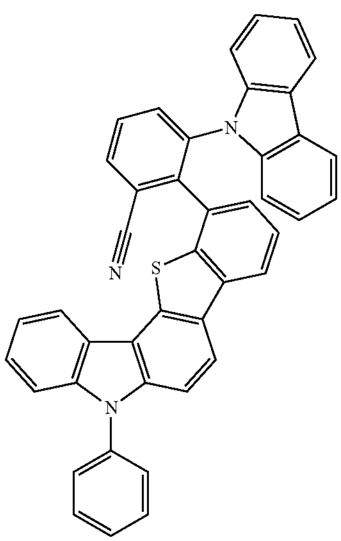
-continued
86
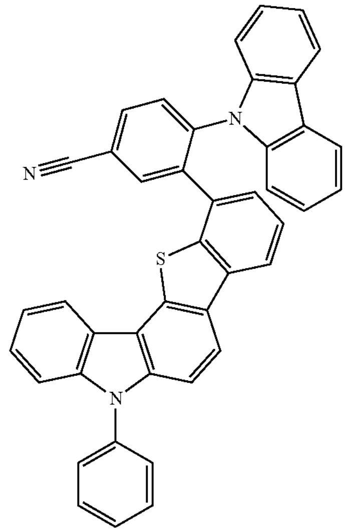
87
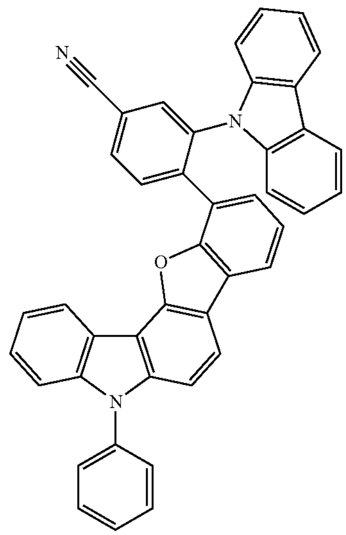
88
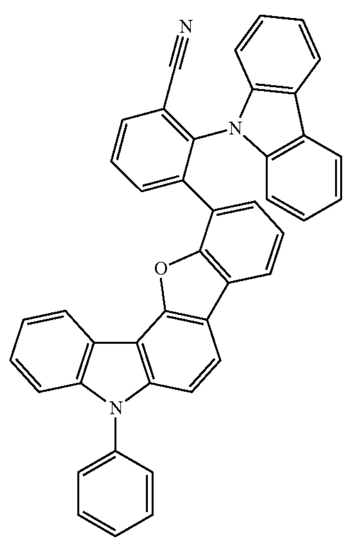

-continued
89
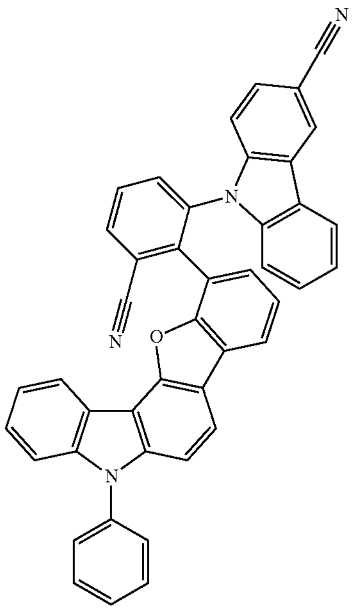
90
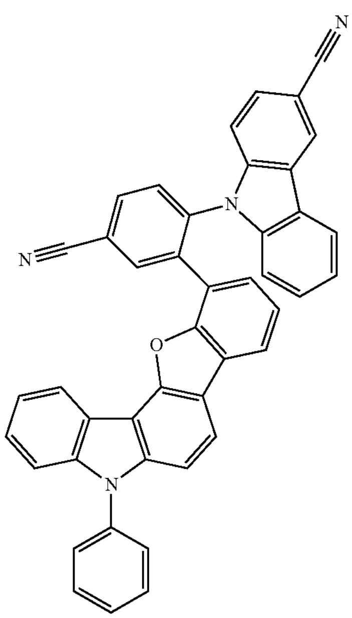
-continued
91
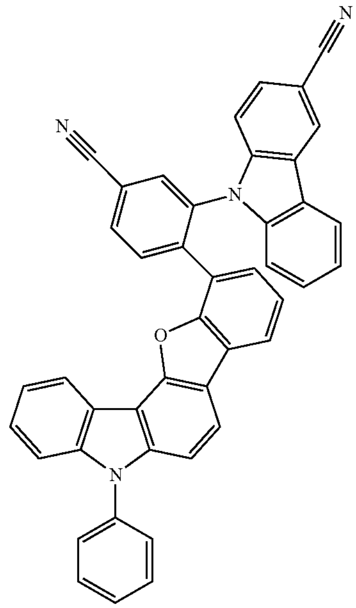
92
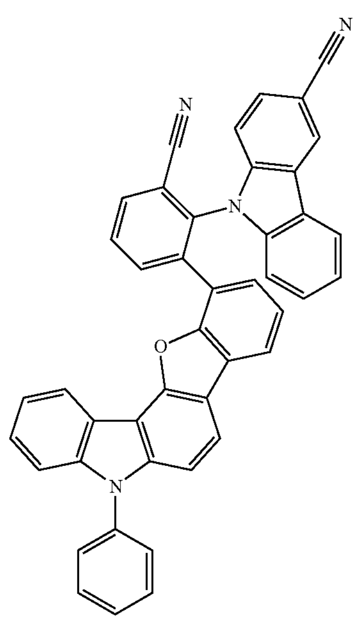

-continued
93
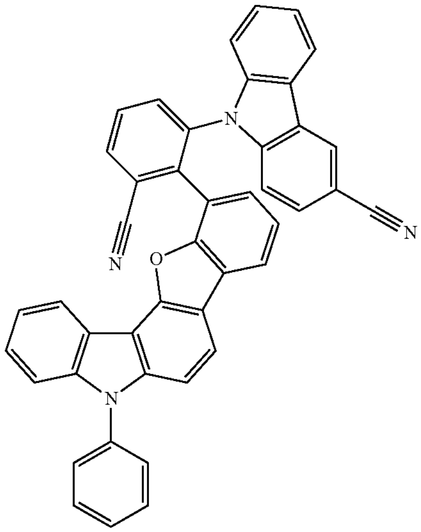
94
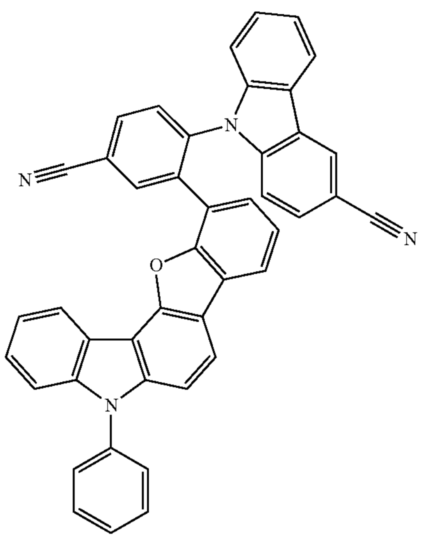
95
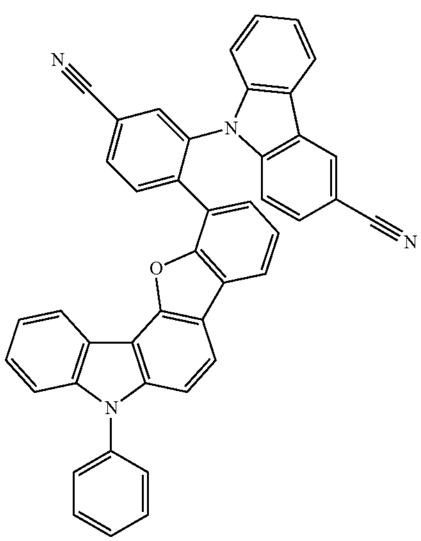
-continued
96
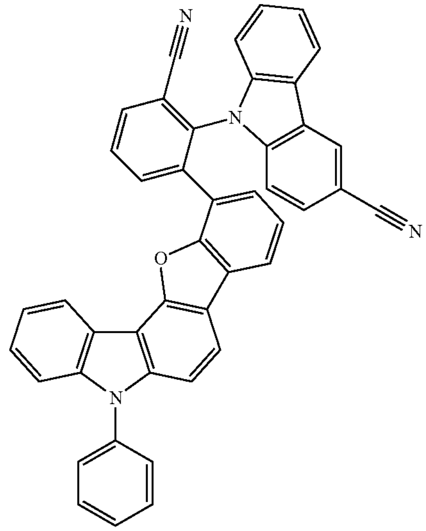
97
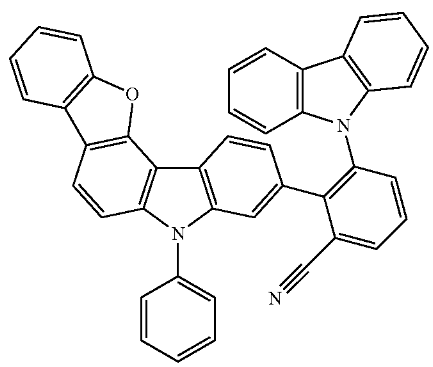
98
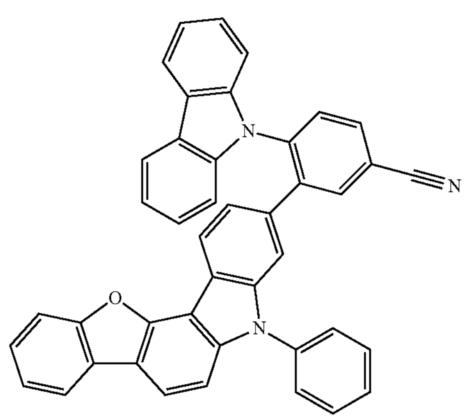

-continued
99
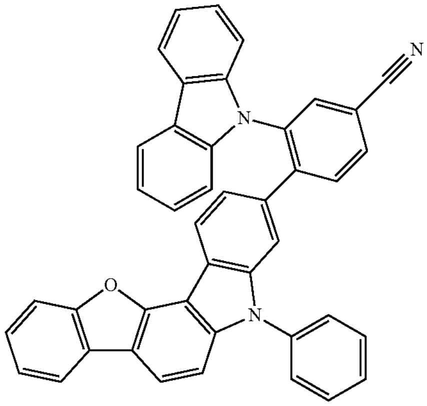
100
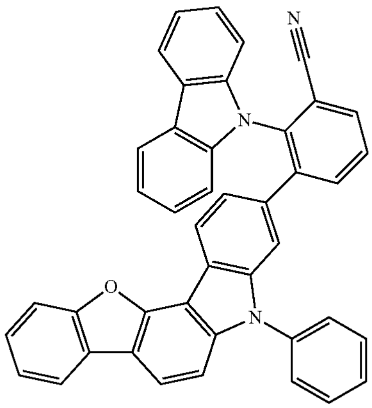
101
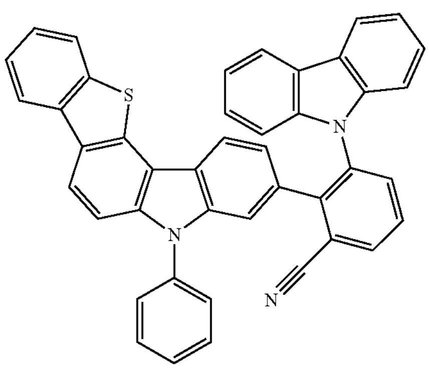
102
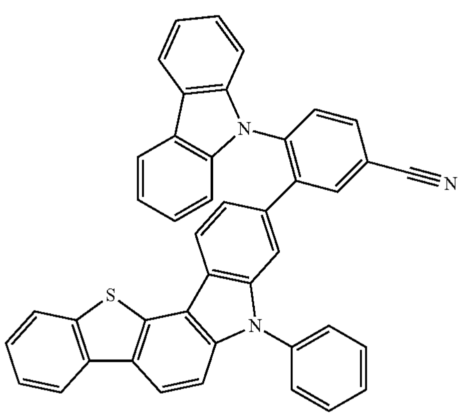
-continued
103
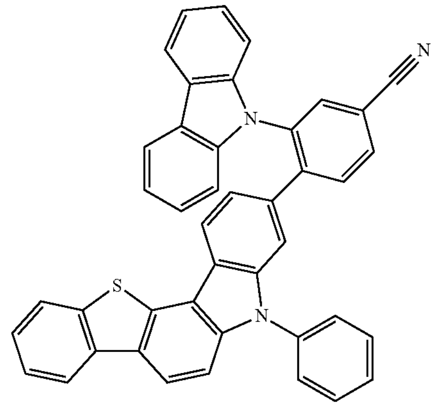
104
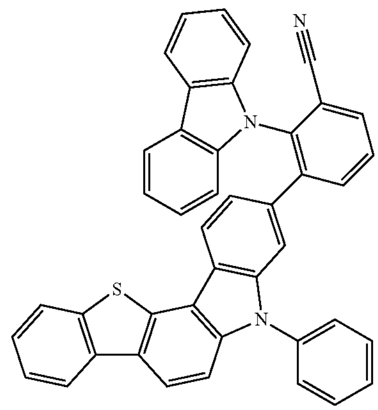
105
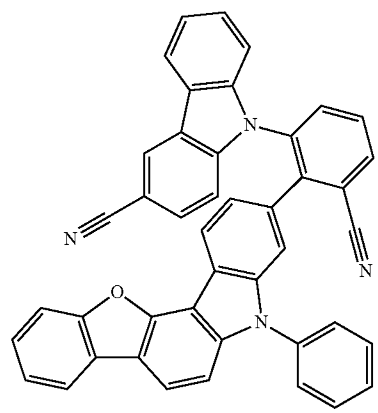
106
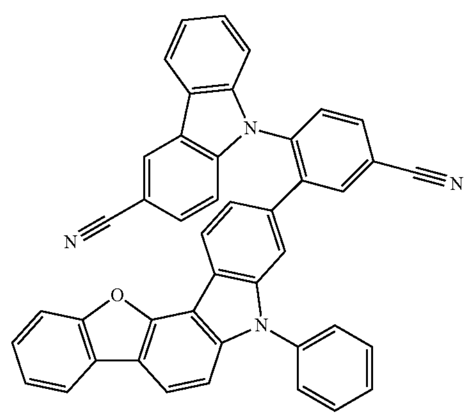

-continued
107
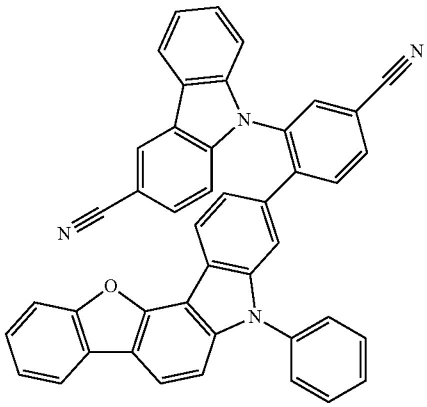
108
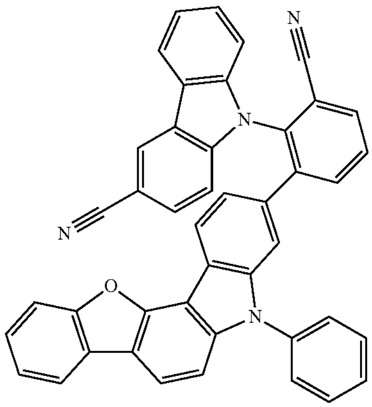
109
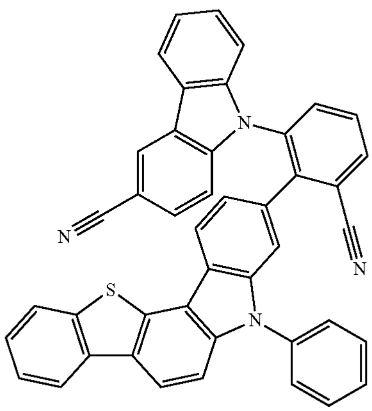
110
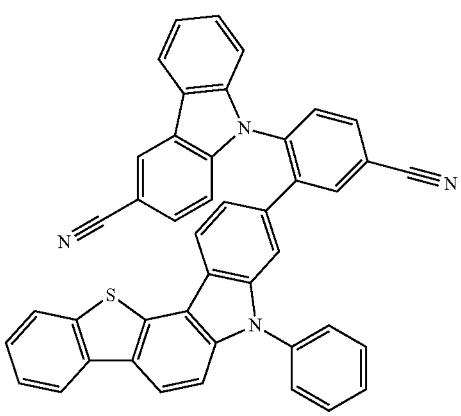
-continued
111
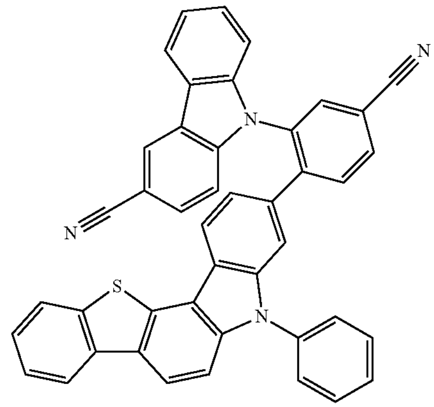
112
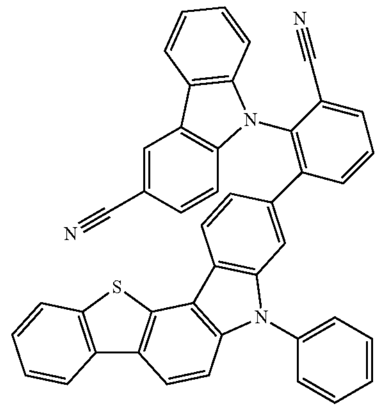
113
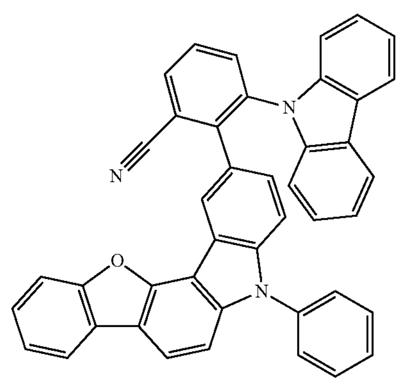
114
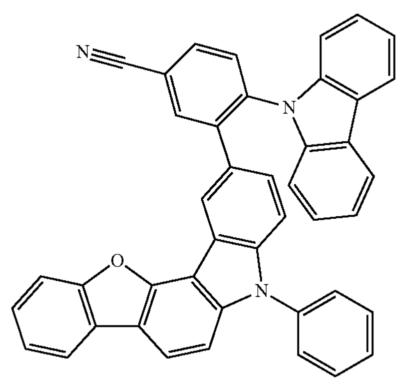

-continued
115
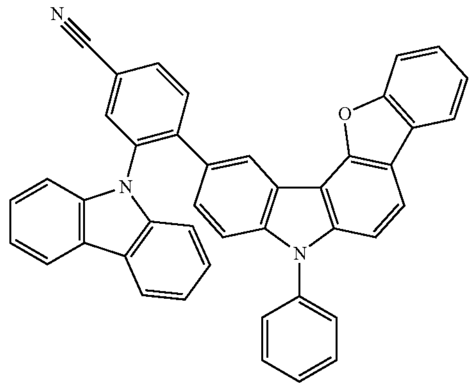
116
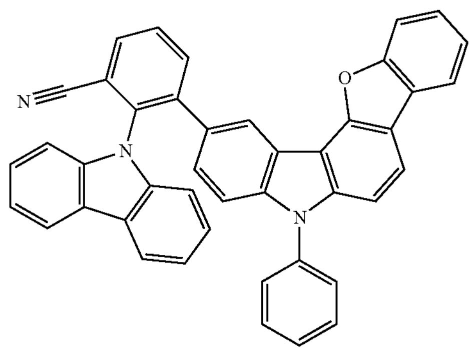
117
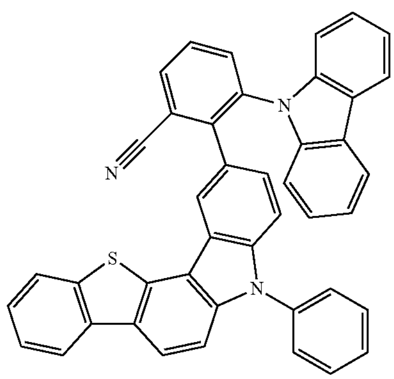
118
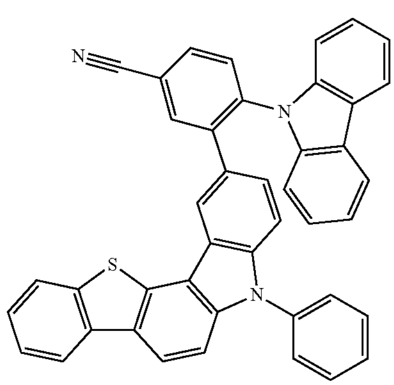
-continued
19
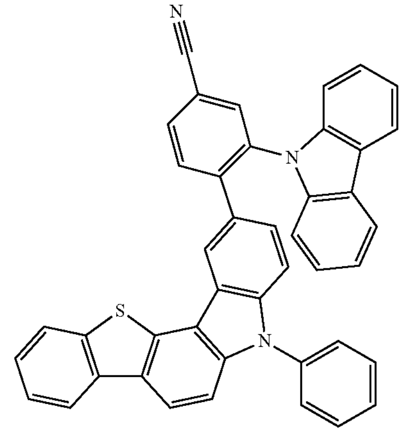
120
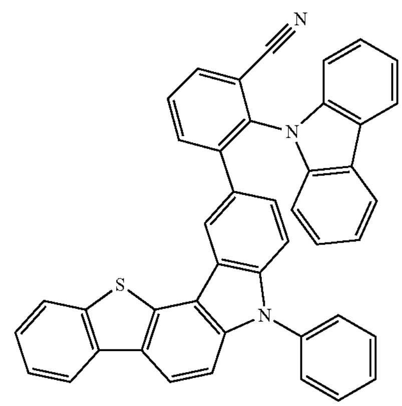
121
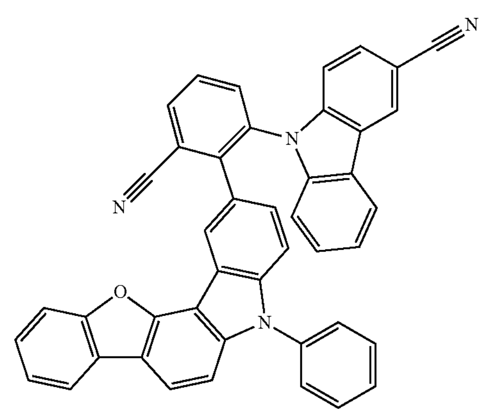
122
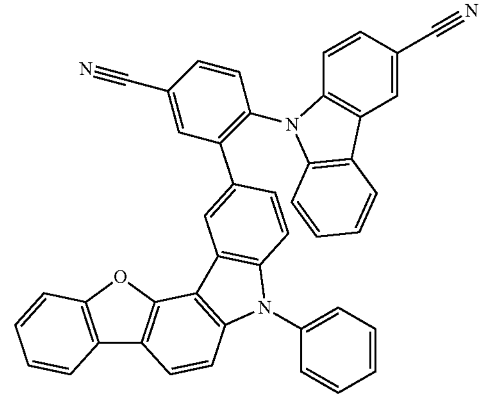

-continued
123
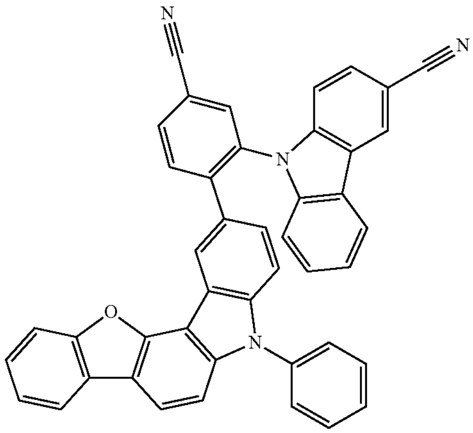
124
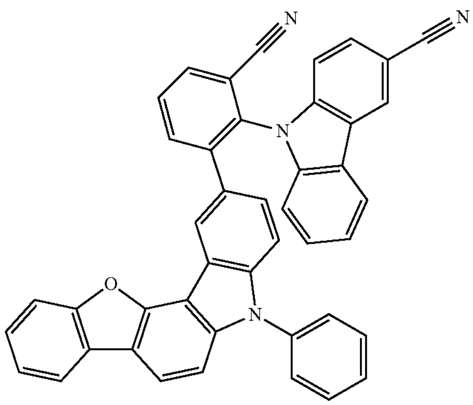
125
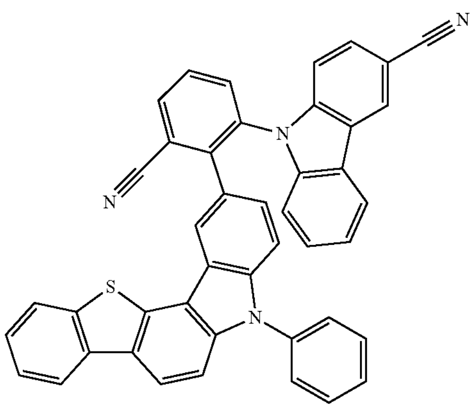
126
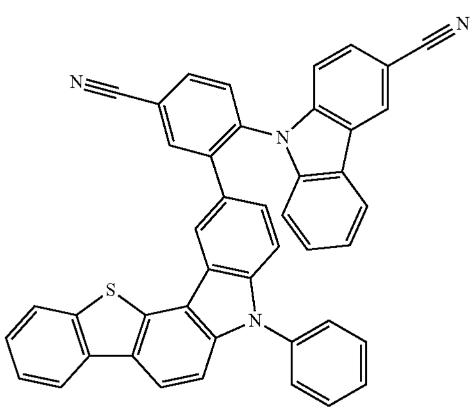
-continued
127
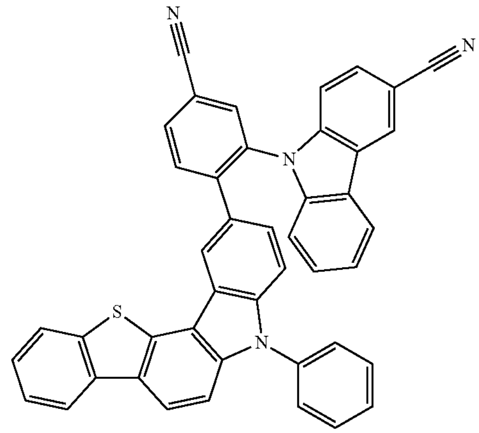
128
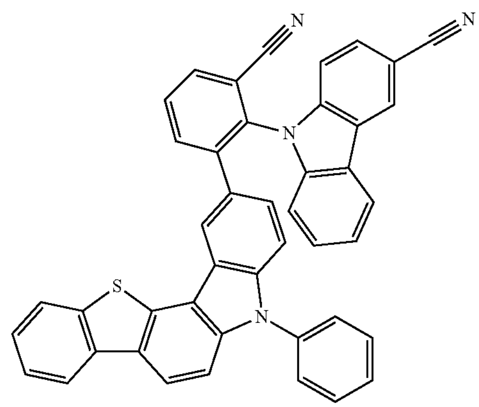
129
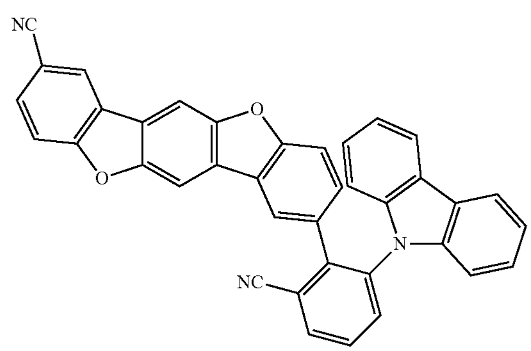
130
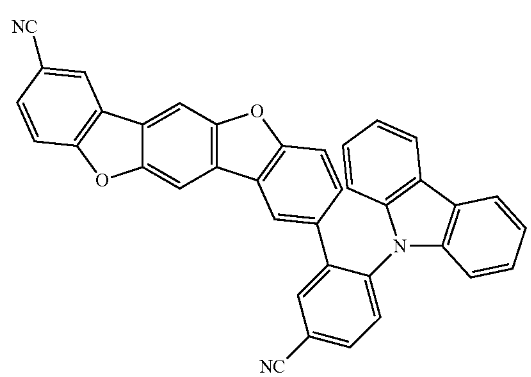

-continued
131
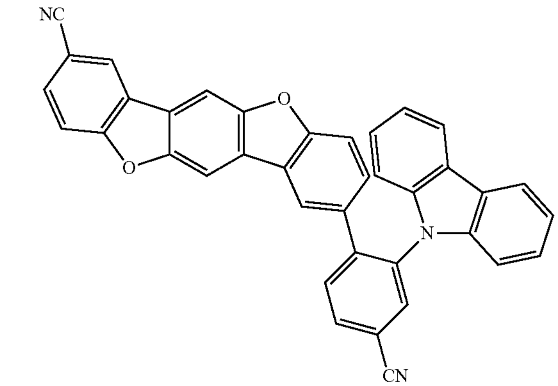
132
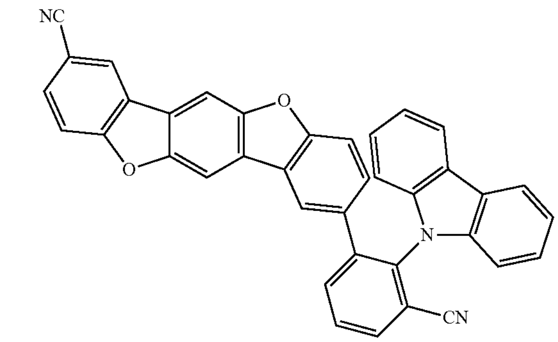
133
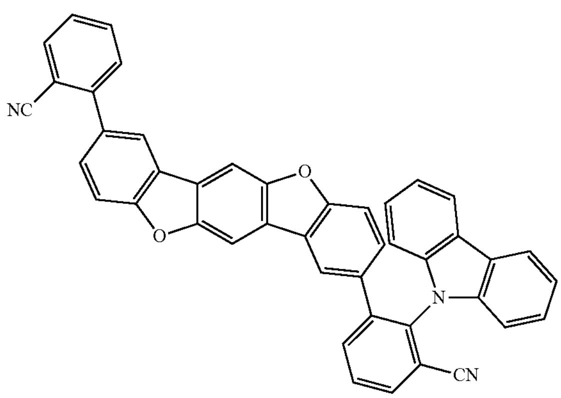
134
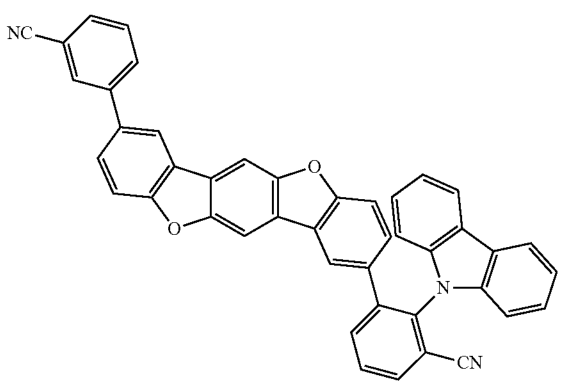
-continued
135
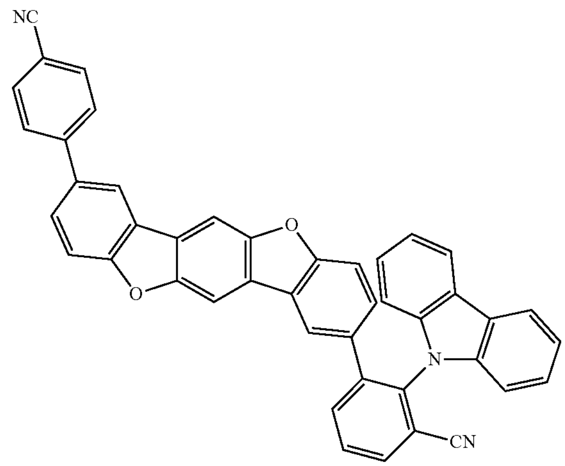
136
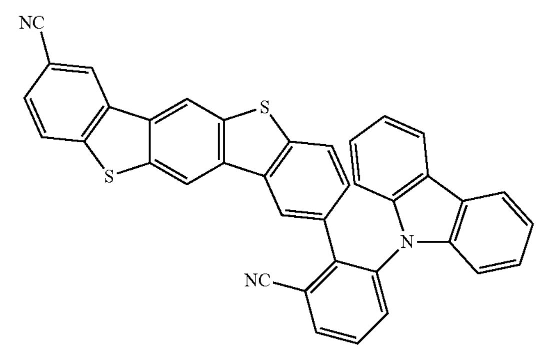
137
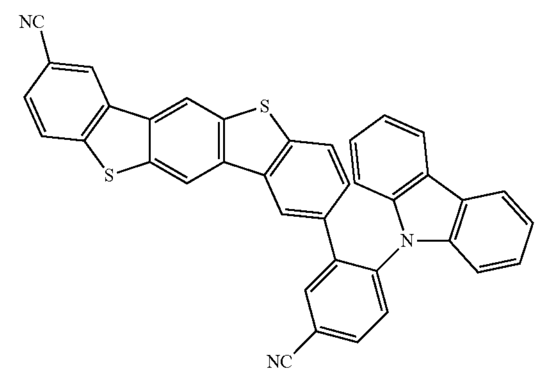
138
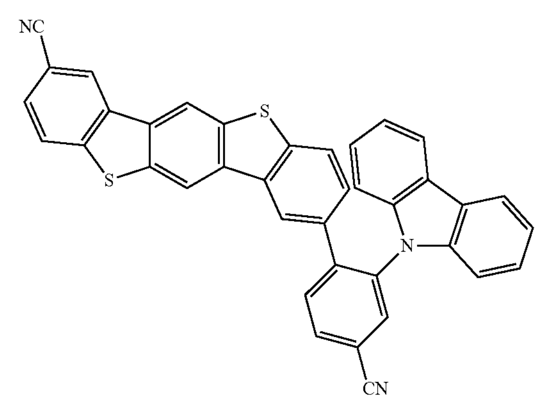

-continued
139
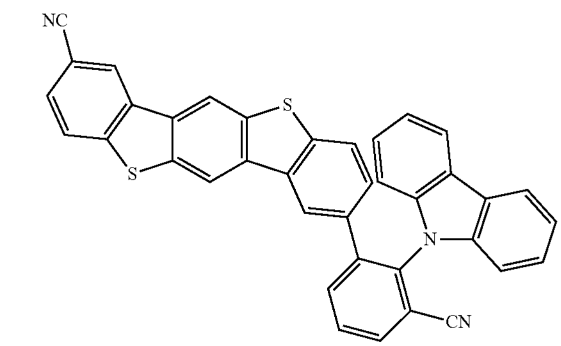
140
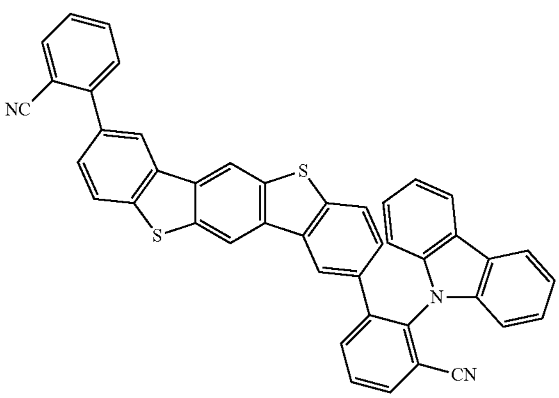
141
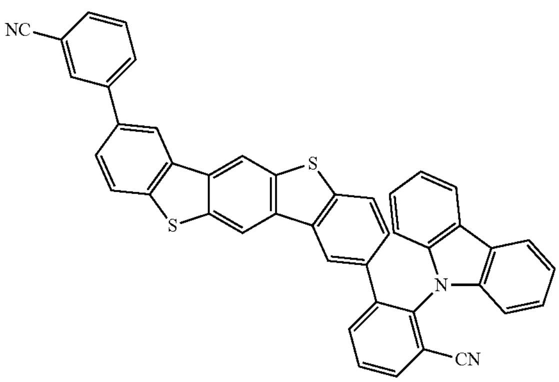
142
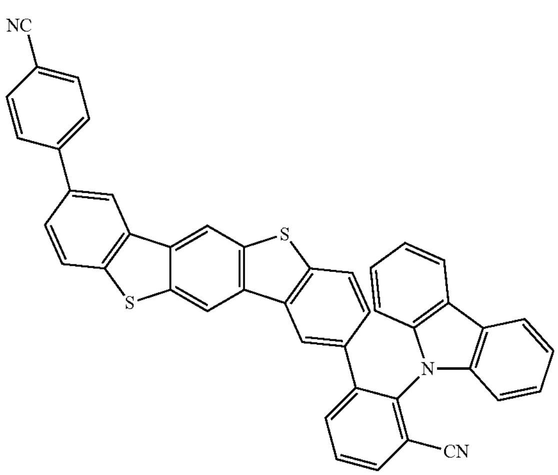
-continued
143
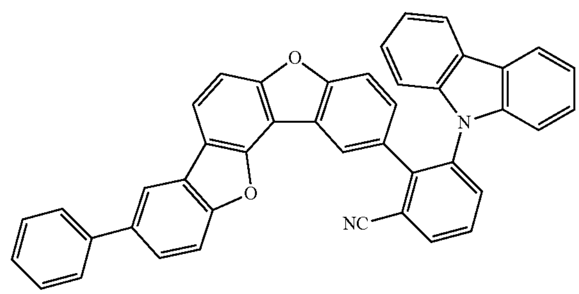
144
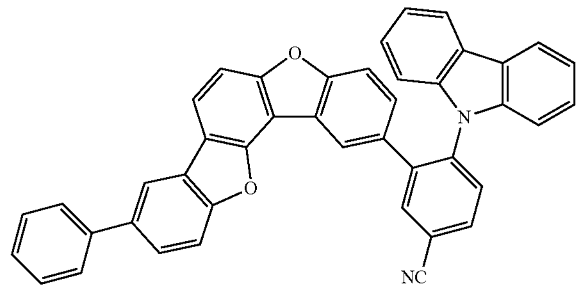
145
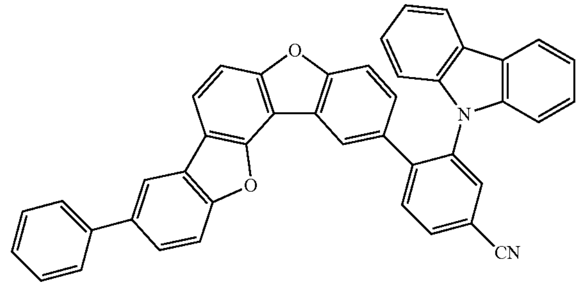
146
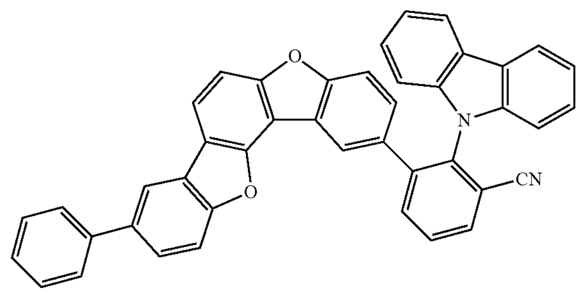
147
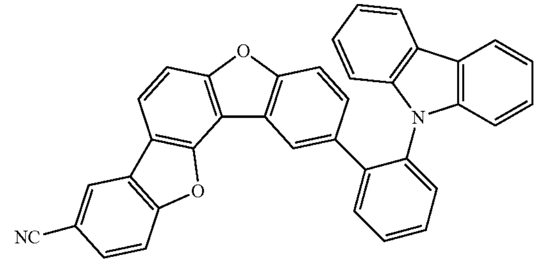

-continued
148
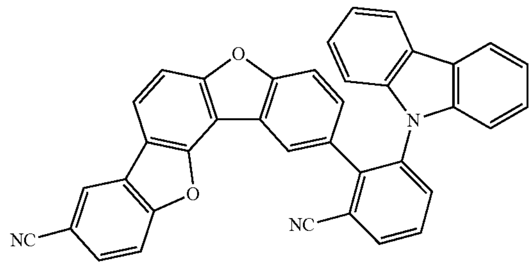
149
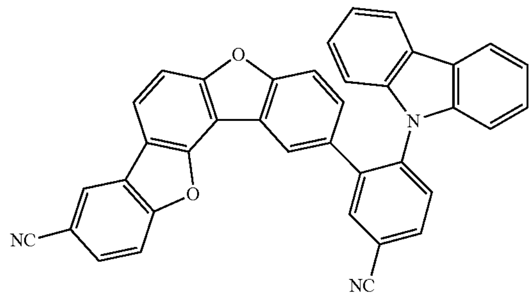
150
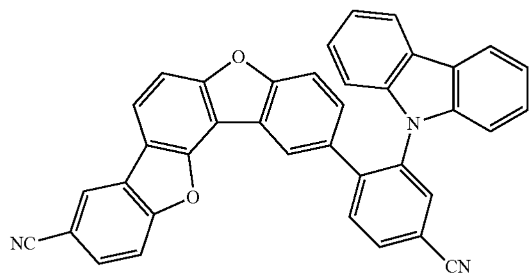
151
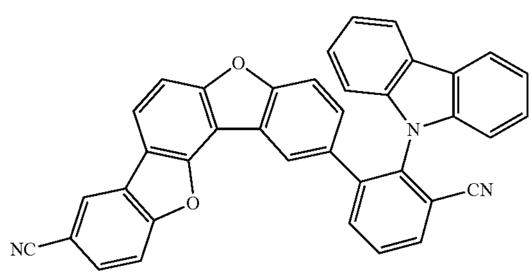
152
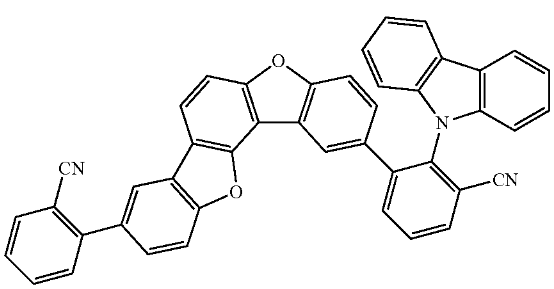
-continued
153
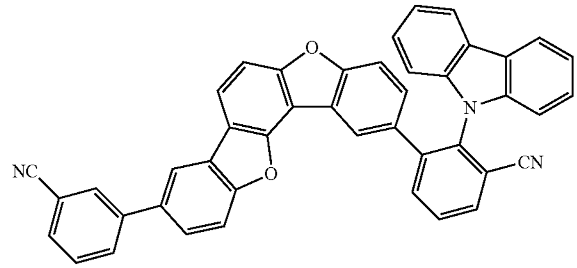
154
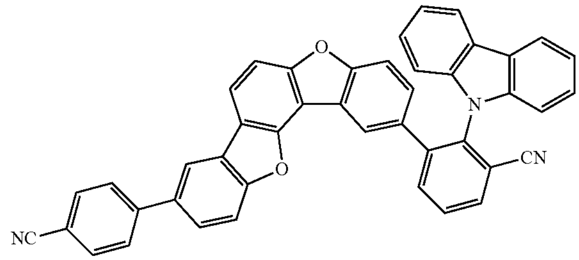
155
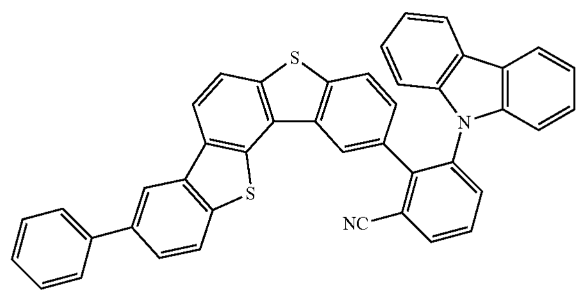
156
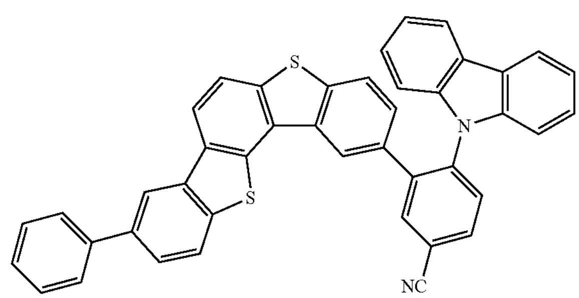
157
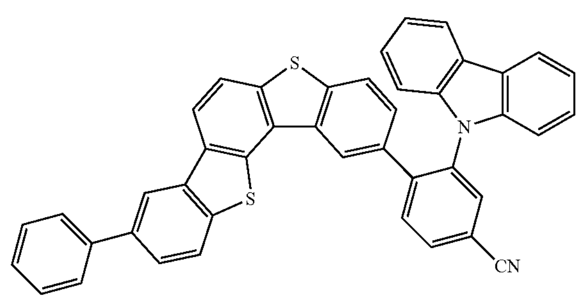

-continued
158
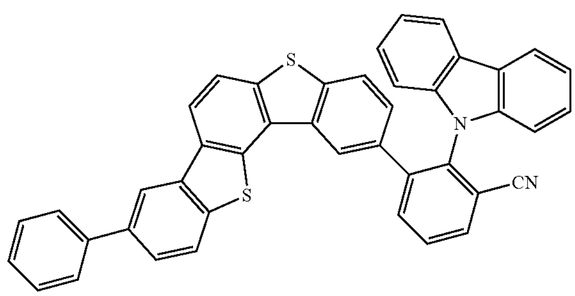
159
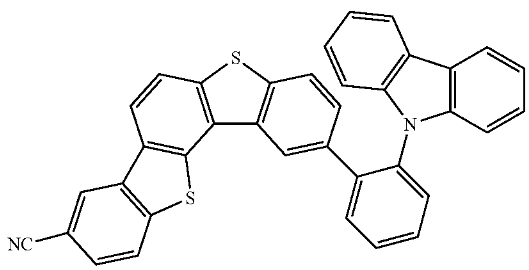
160
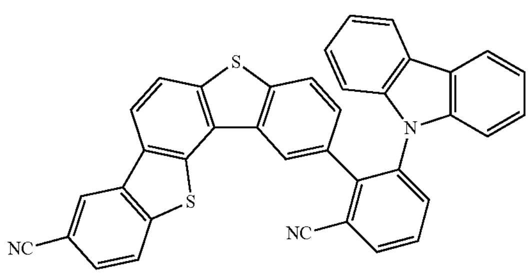
161
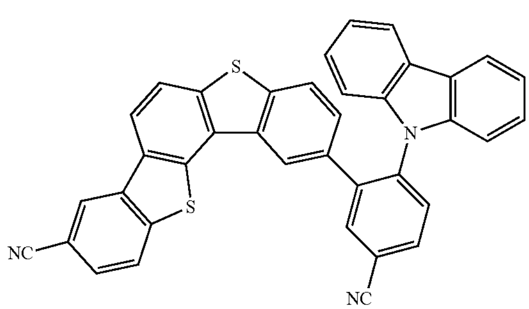
162
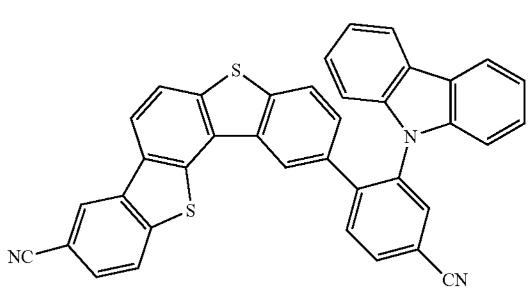
-continued
163
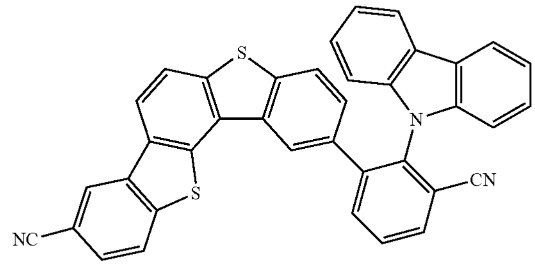
164
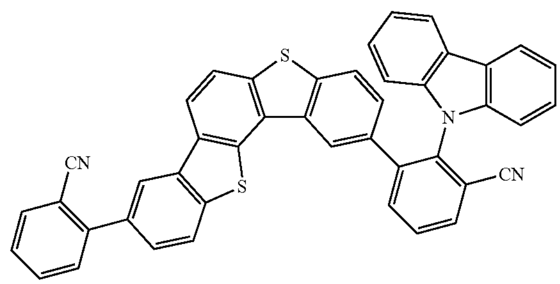
165
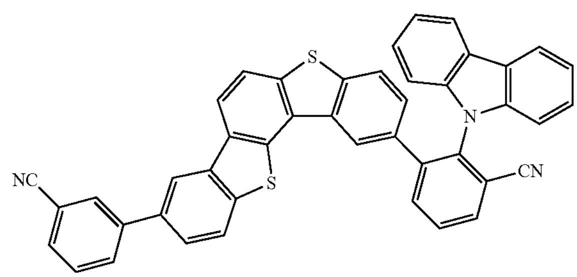
166
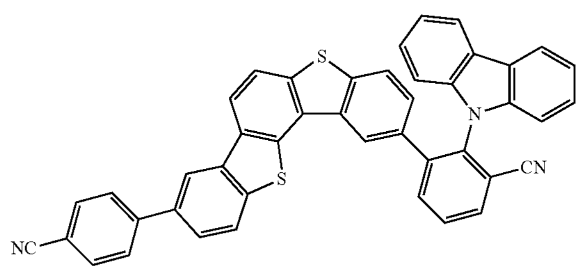
167
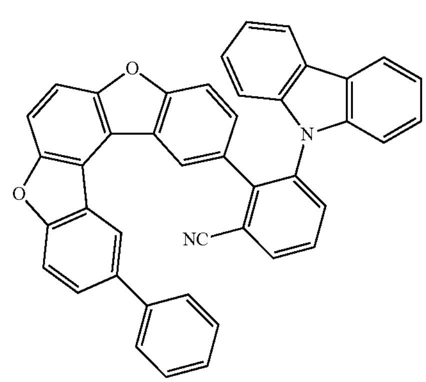

-continued
168
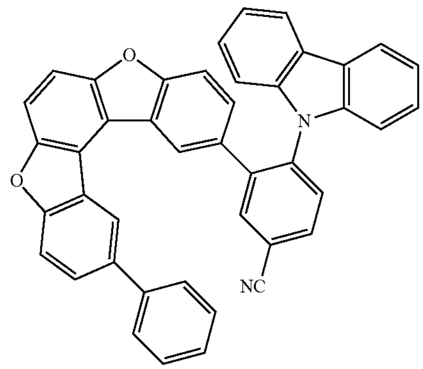
169
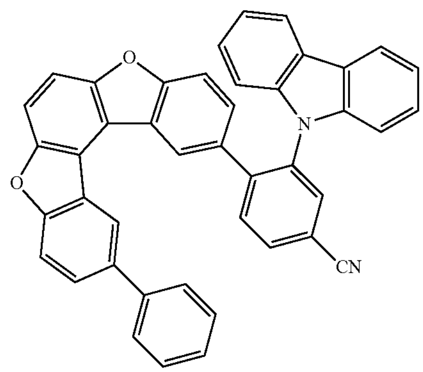
170
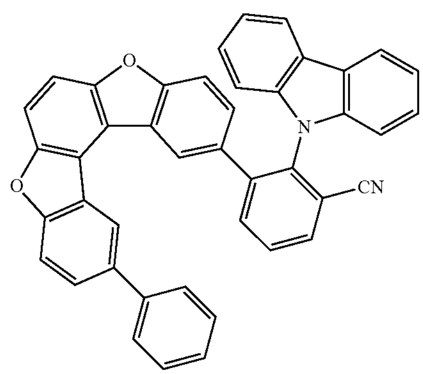
171
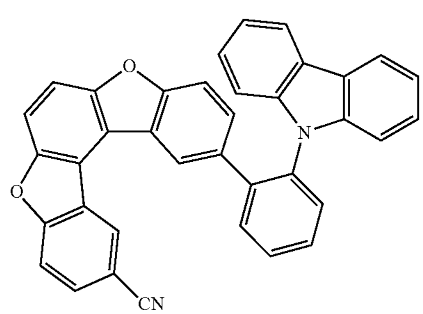
-continued
172
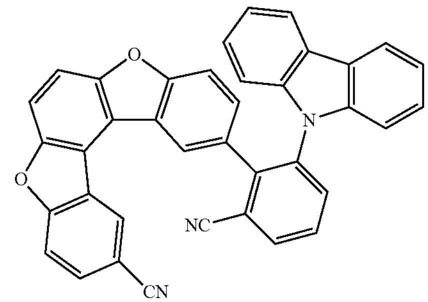
173
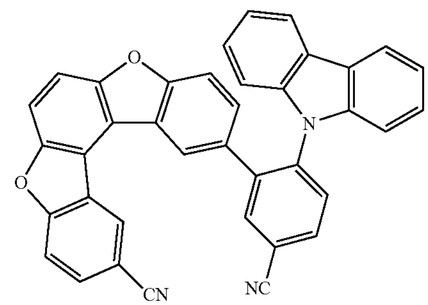
174
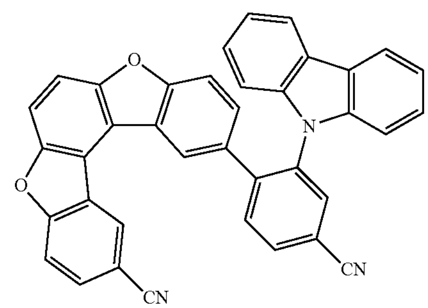
175
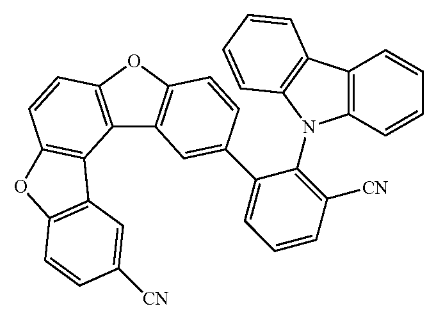
176
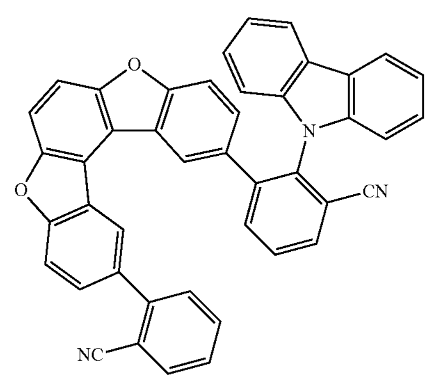

177
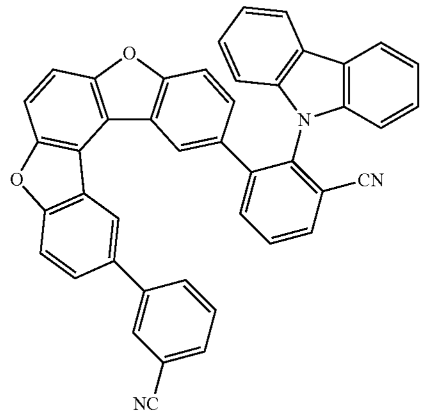
178
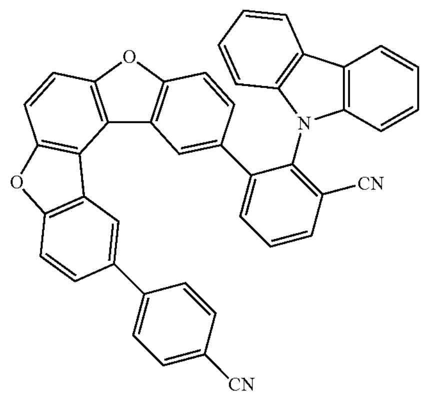
179
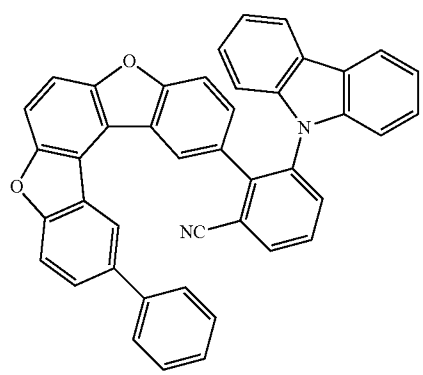
180
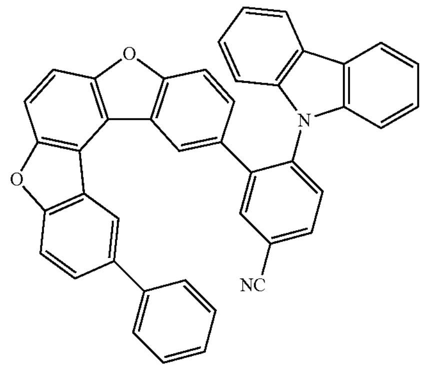
181
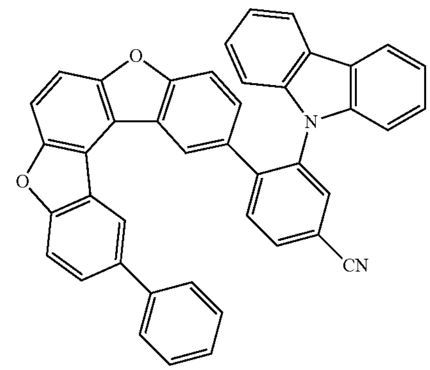
182
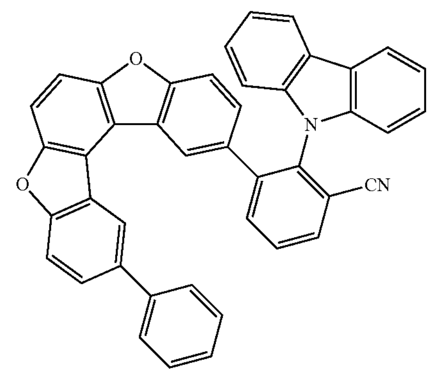
183
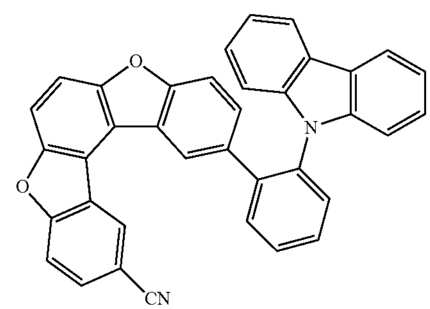
184
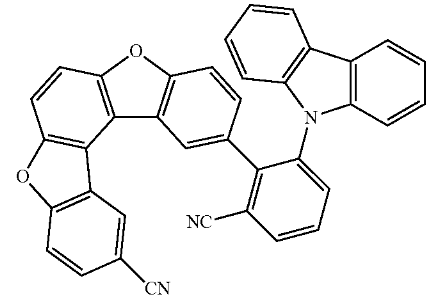

-continued
185
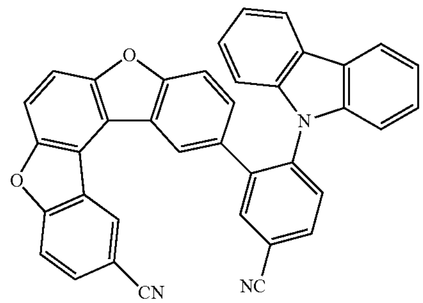
186
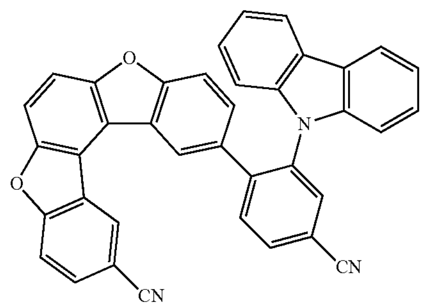
187
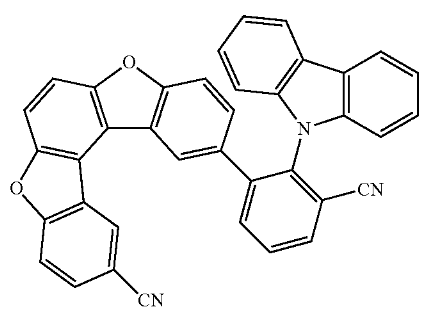
188
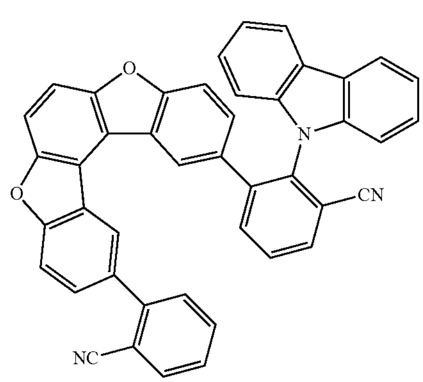
-continued
189
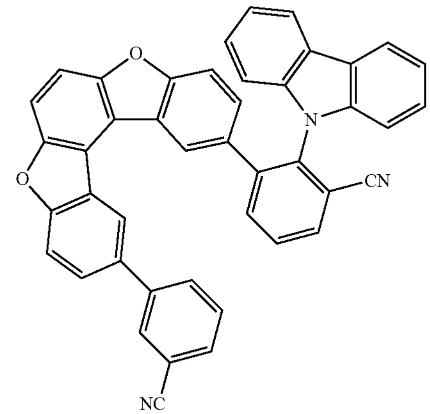
190
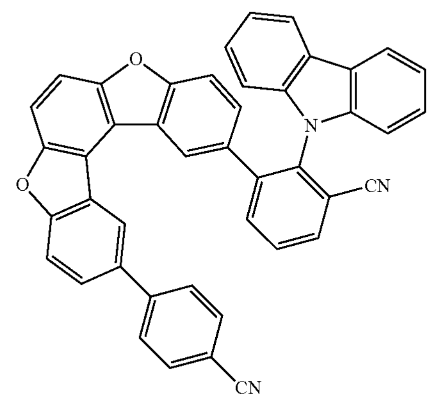
191
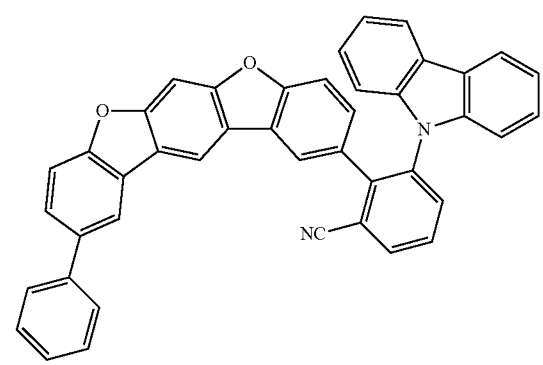
192
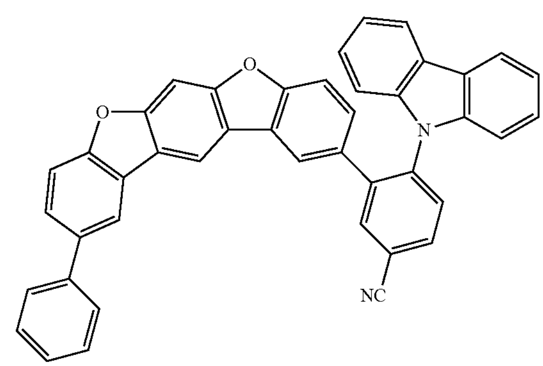

193
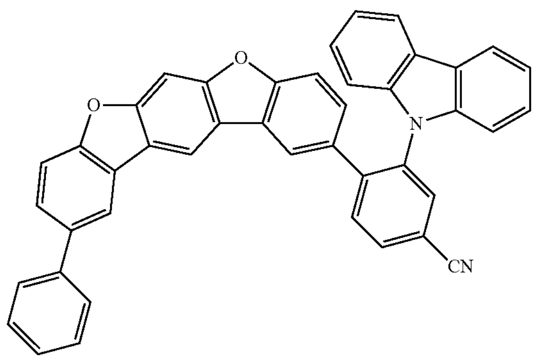
194
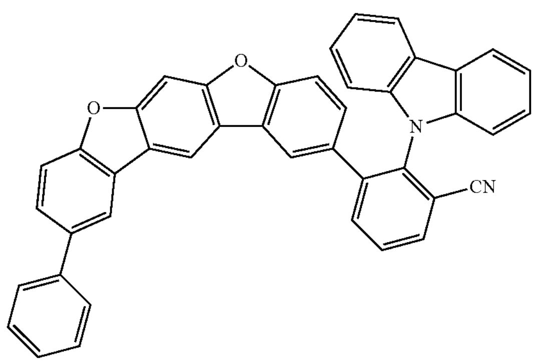
195
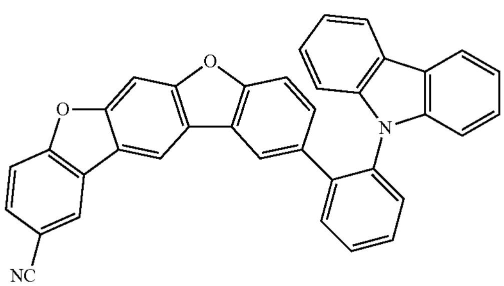
196
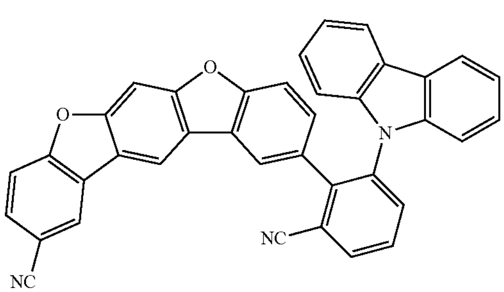
197
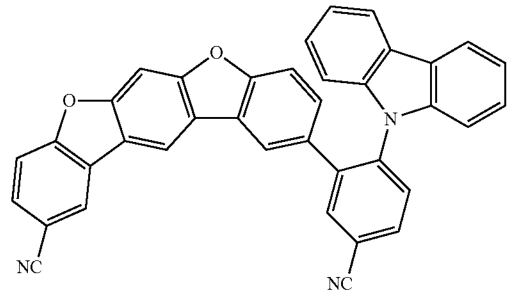
198
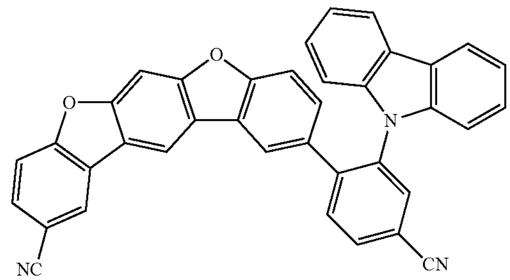
199
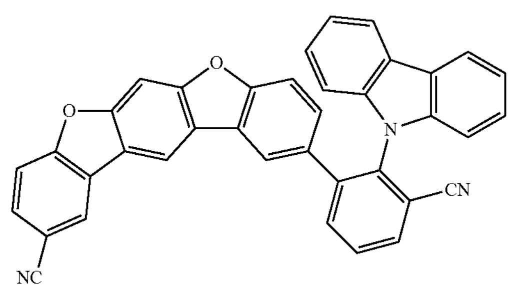
200
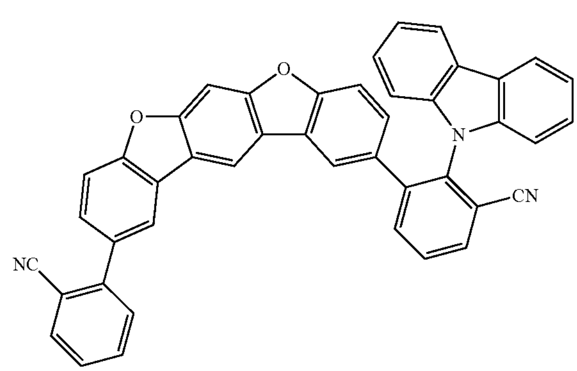

-continued
201
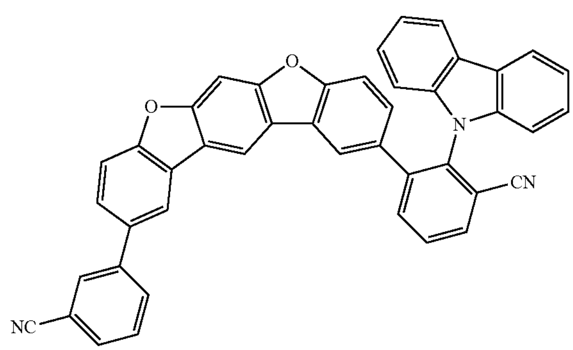
202
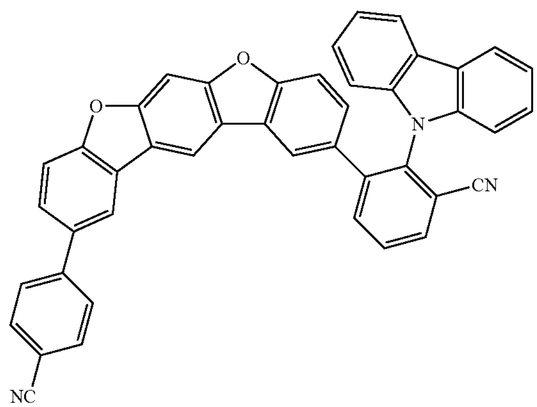
203
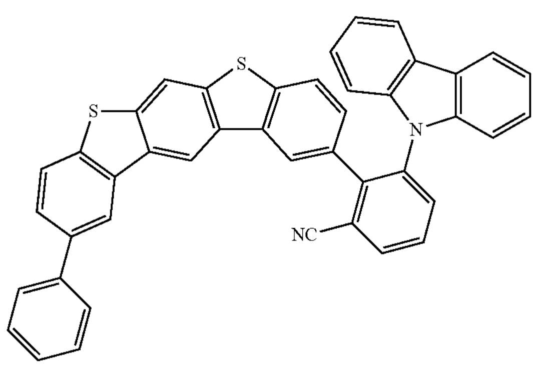
204
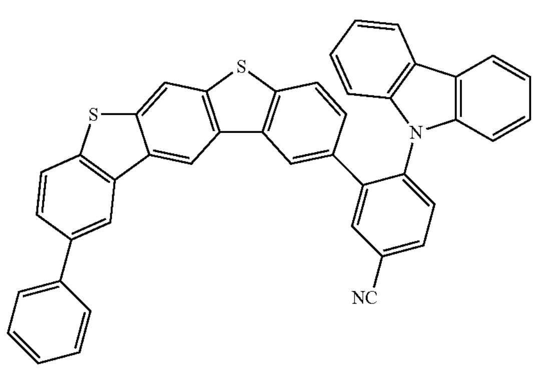
-continued
205
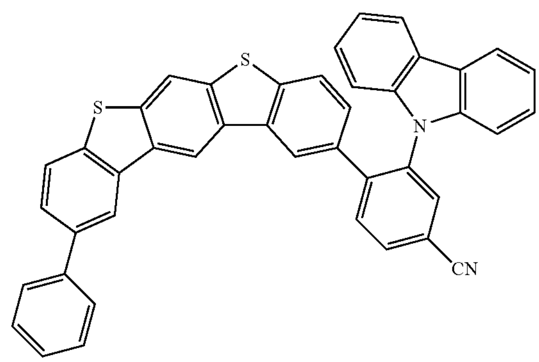
206
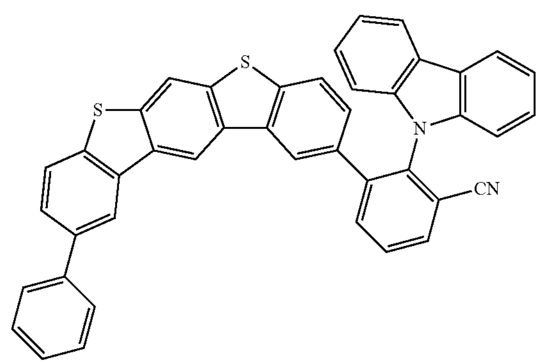
207
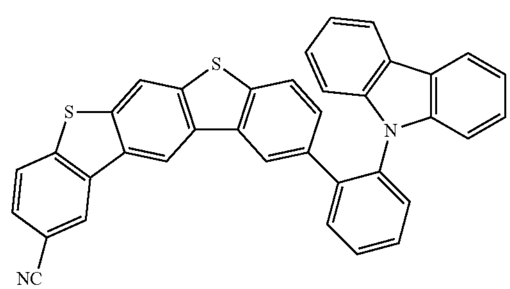
208
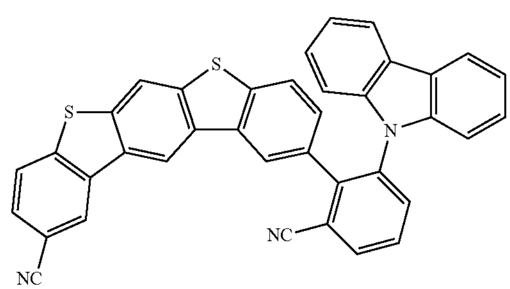

-continued
209
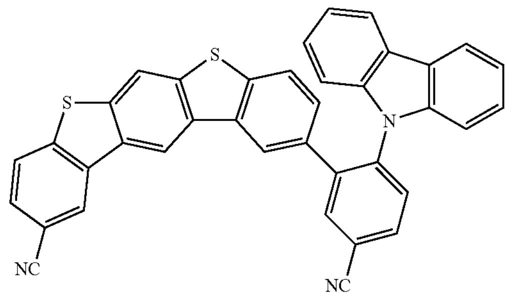
210
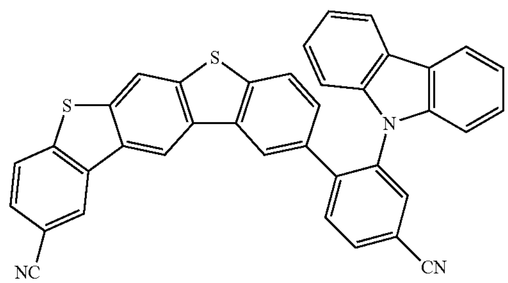
211
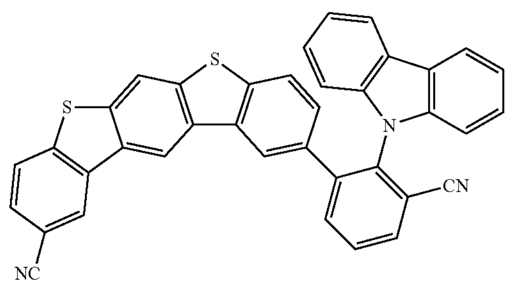
212
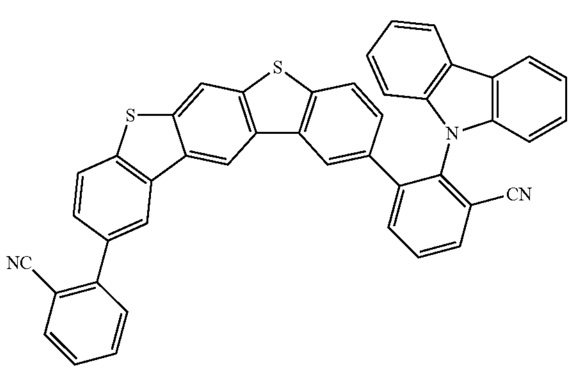
-continued
213
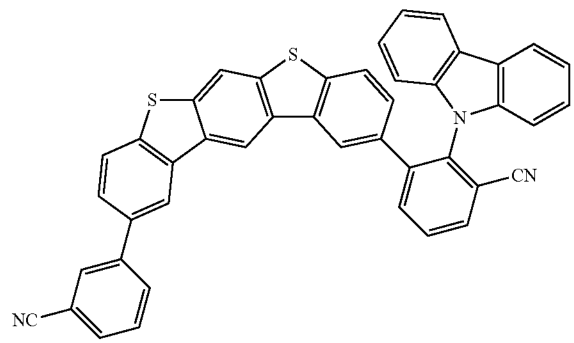
214
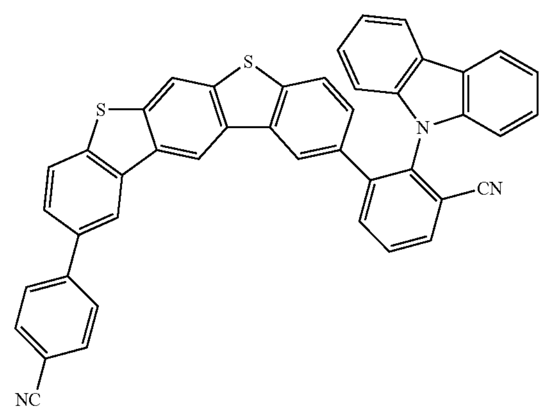
215
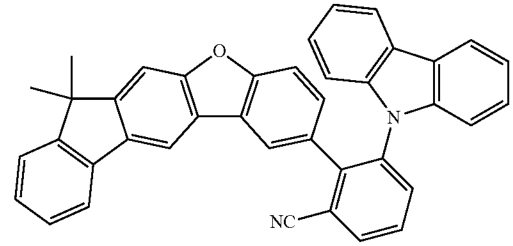
216
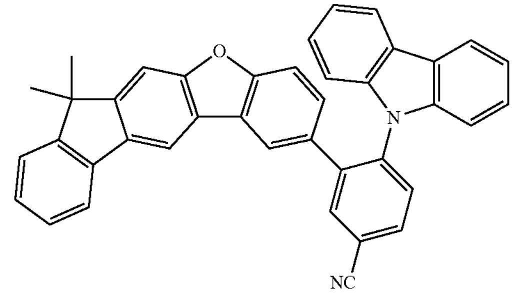

-continued
217
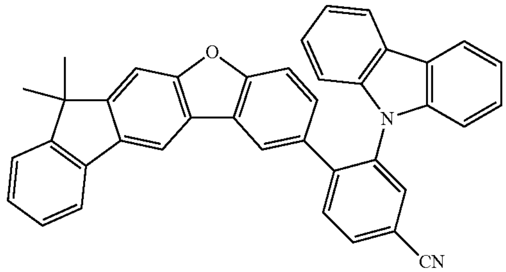
218
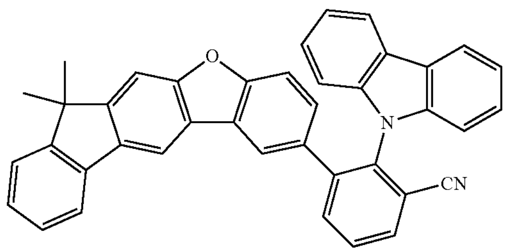
219
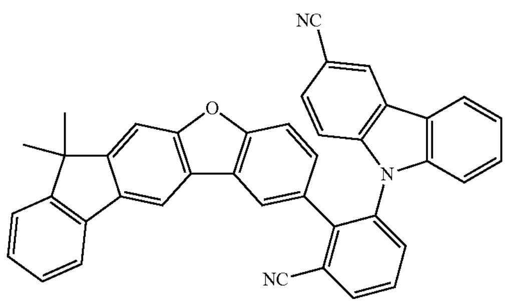
220
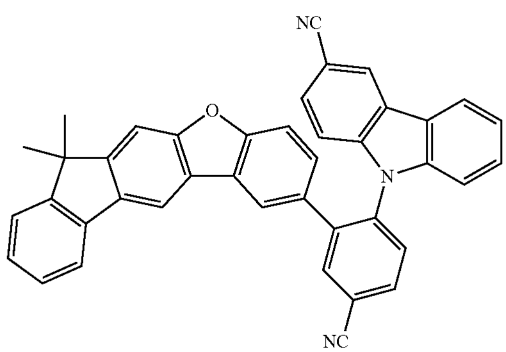
221
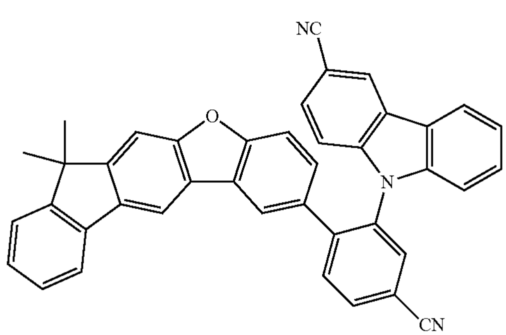
-continued
222
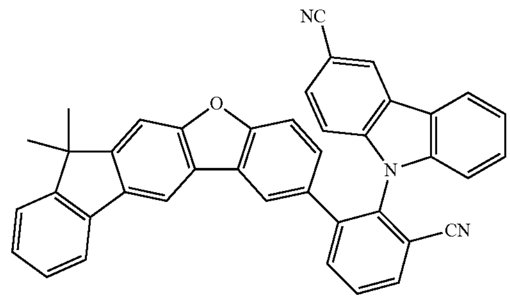
223
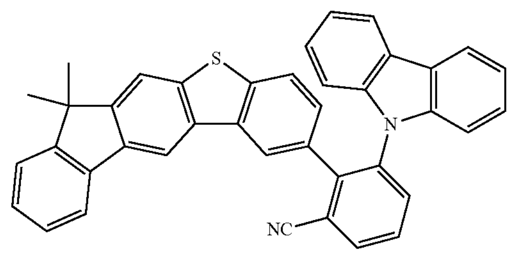
224
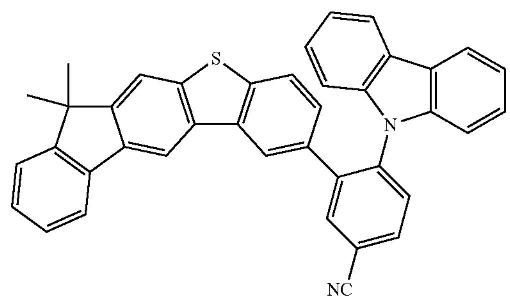
225
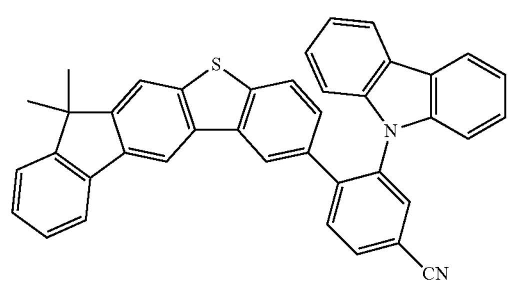
226
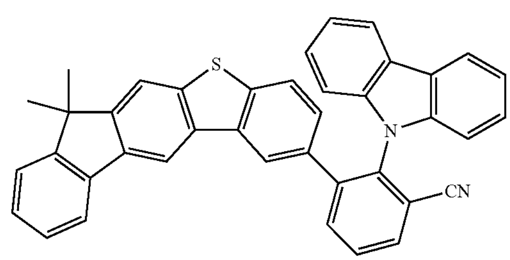

-continued
227
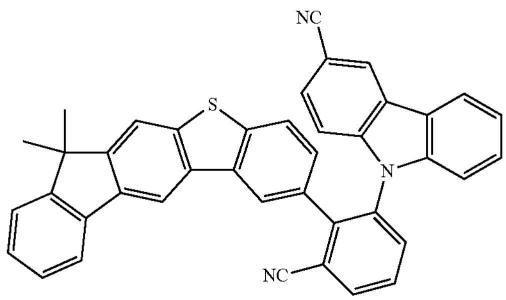
228
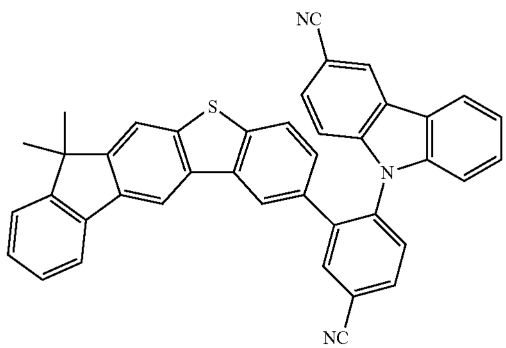
229
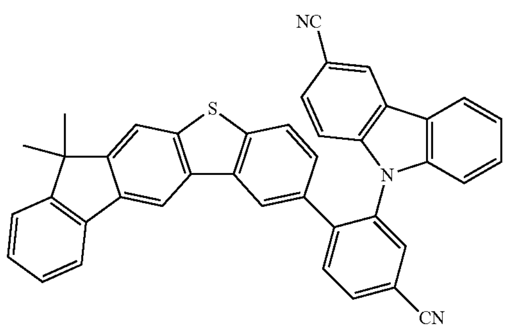
230
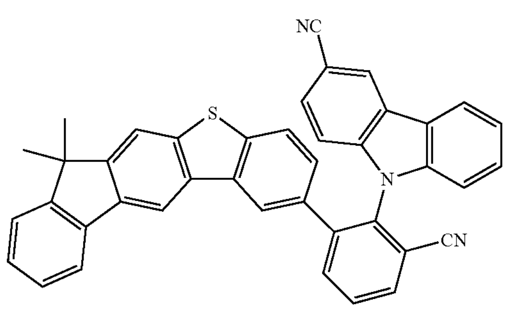
231
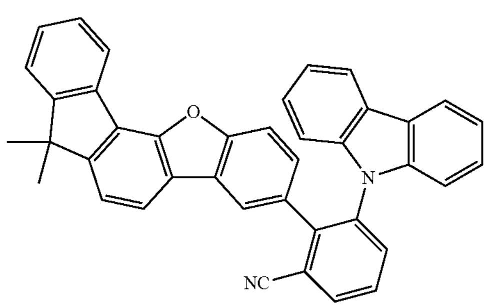
-continued
232
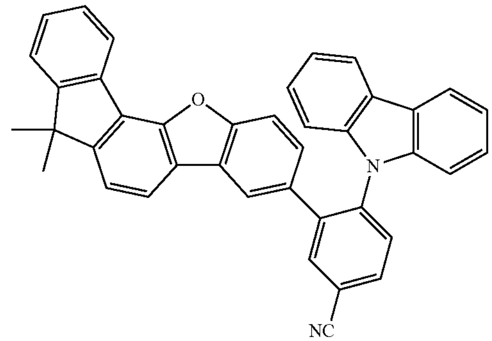
233
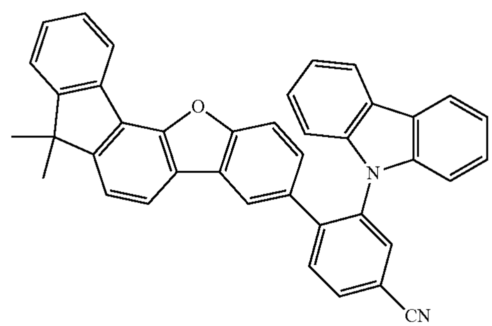
234
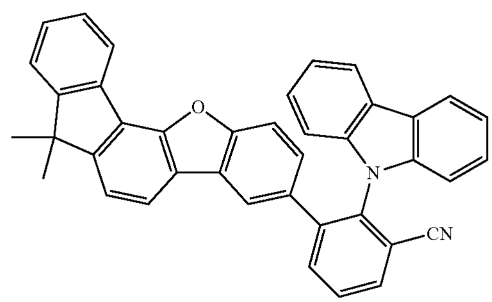
235
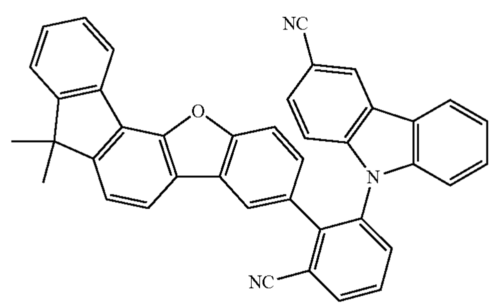
236
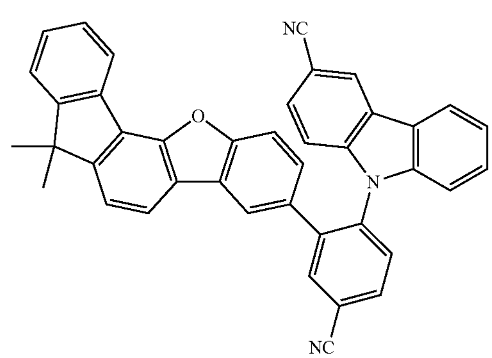

-continued
237
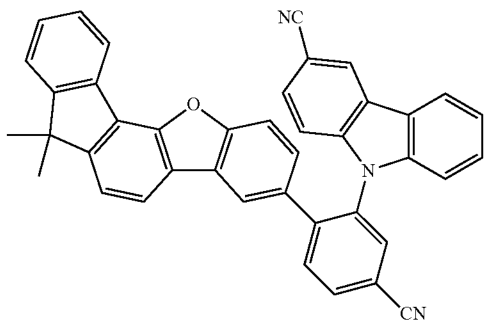
238
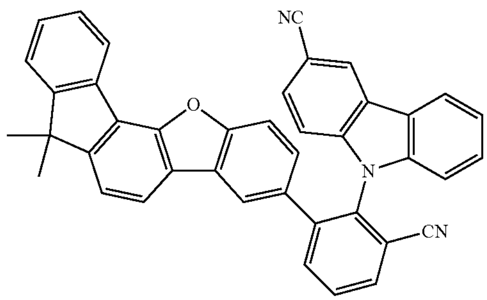
239
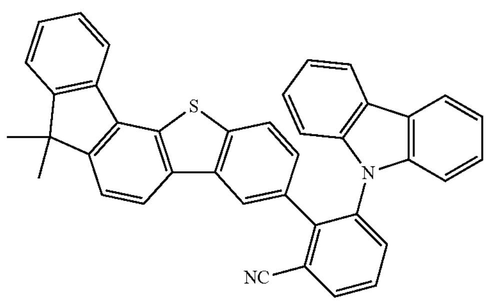
240
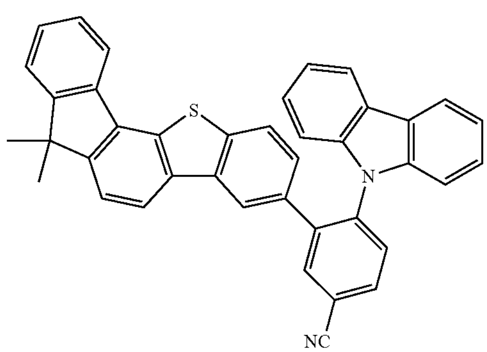
241
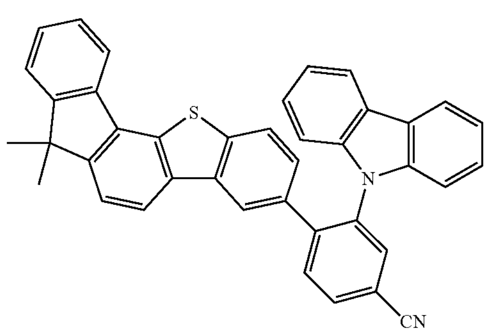
-continued
242
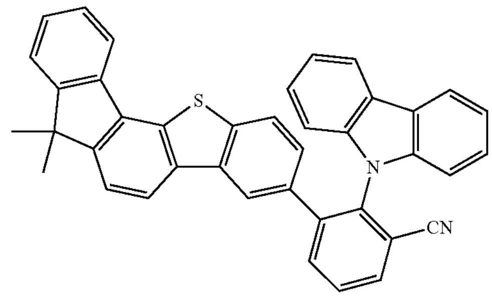
243
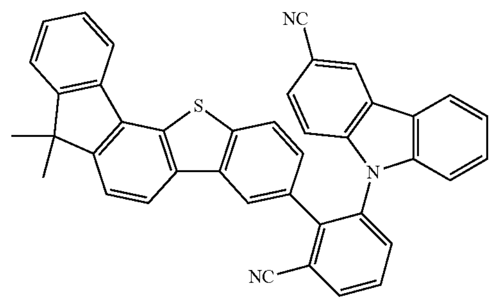
244
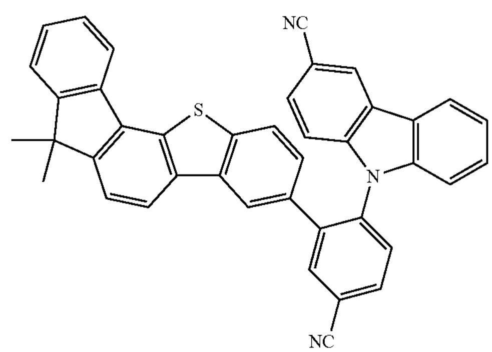
245
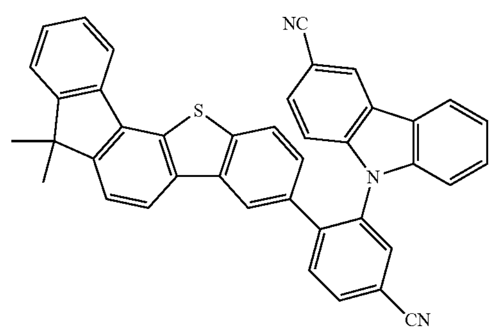
246
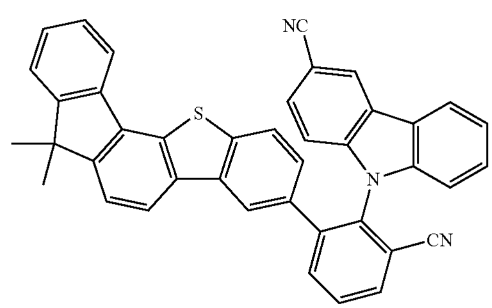

-continued
247
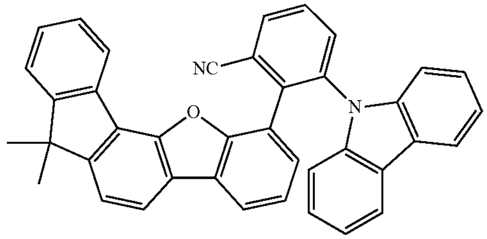
248
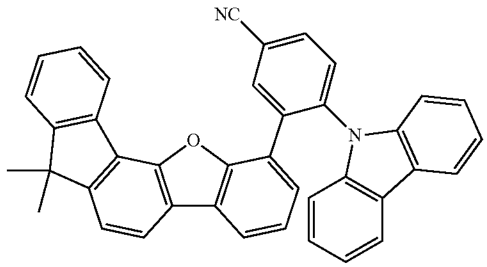
249
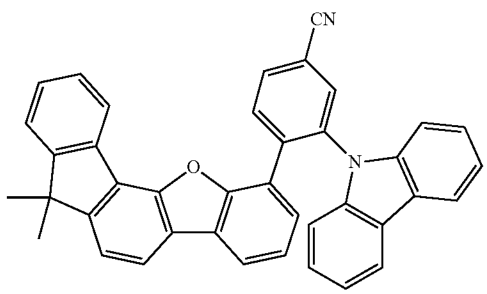
250
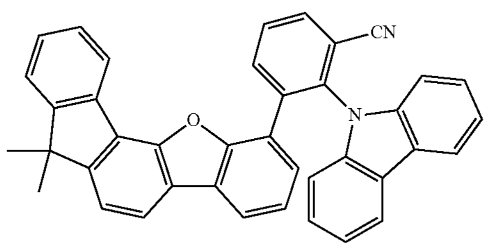
251
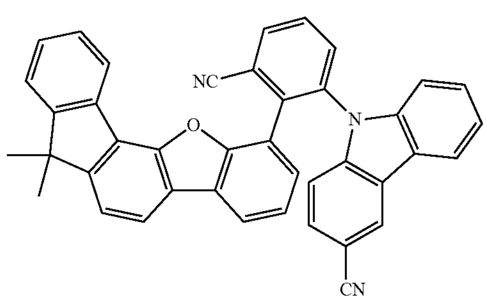
-continued
252
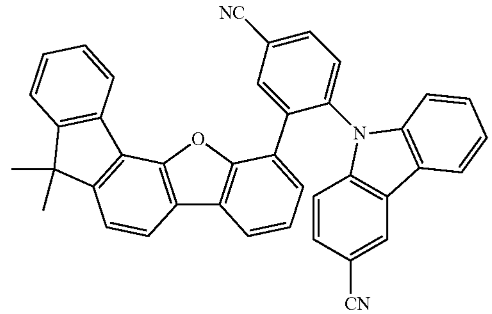
253
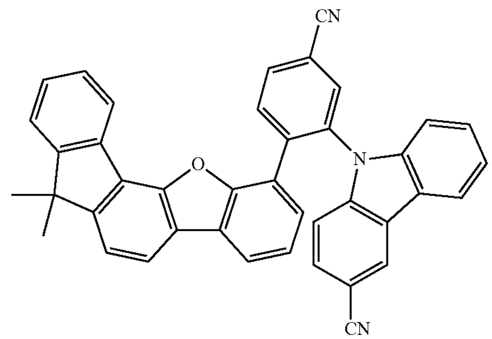
254
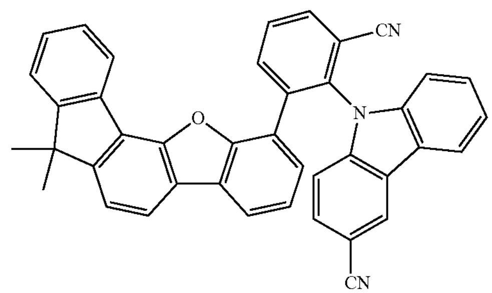
255
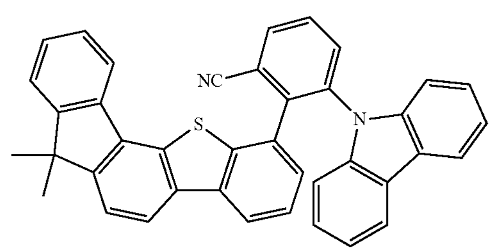
256
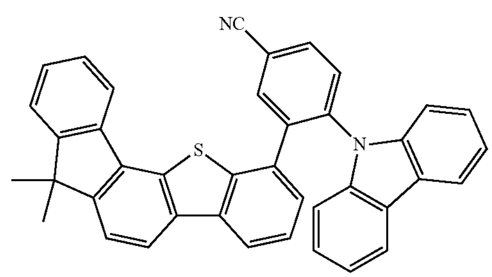

-continued
257
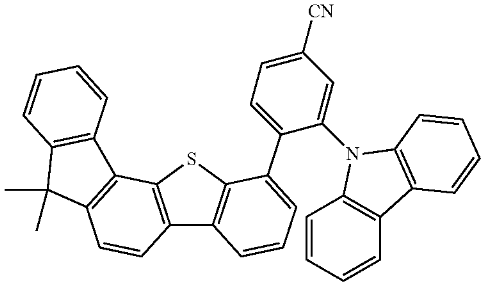
258
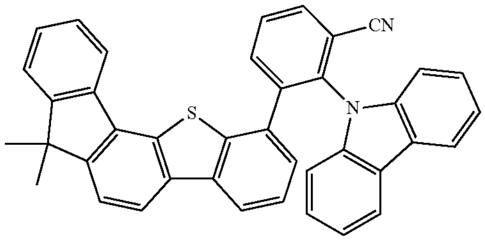
259
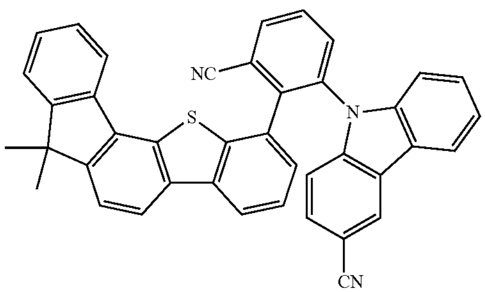
260
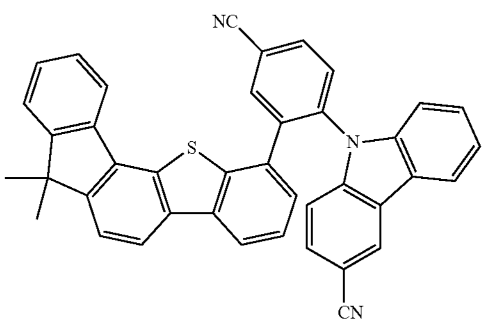
261
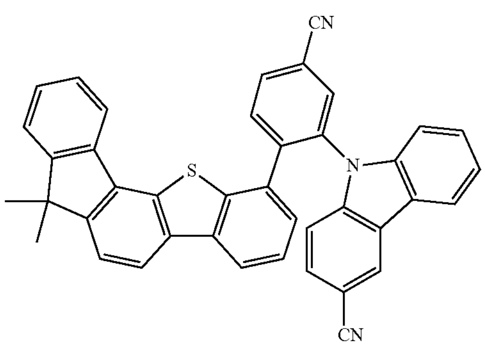
-continued
262
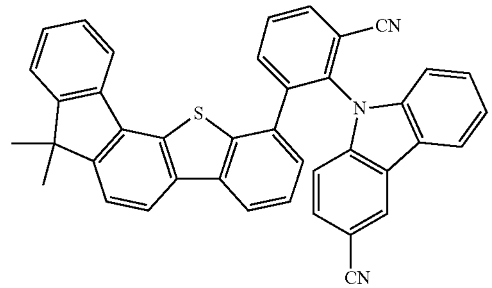
263
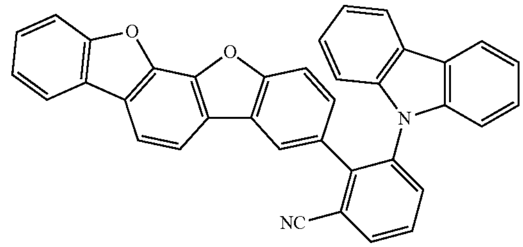
264
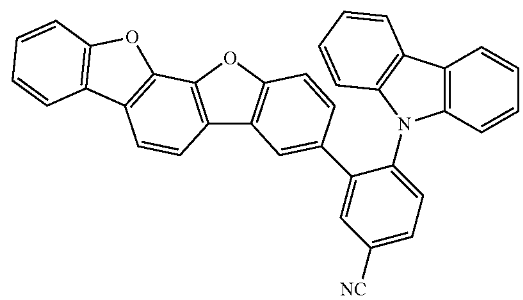
265
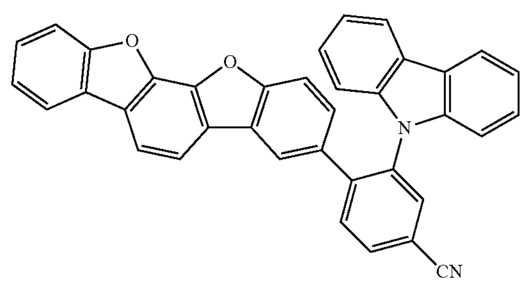
266
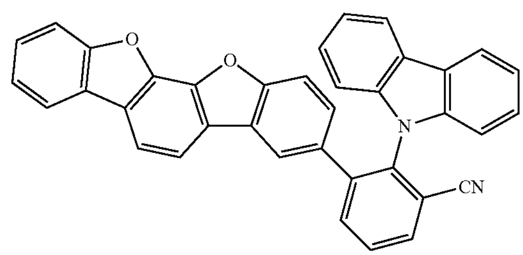

-continued
267
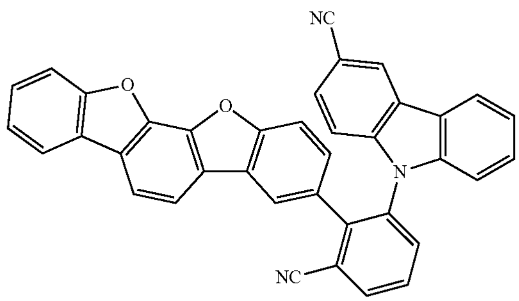
268
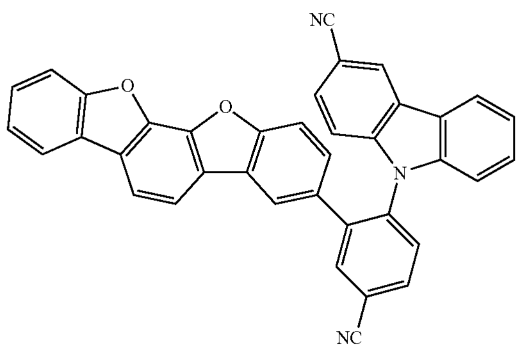
269
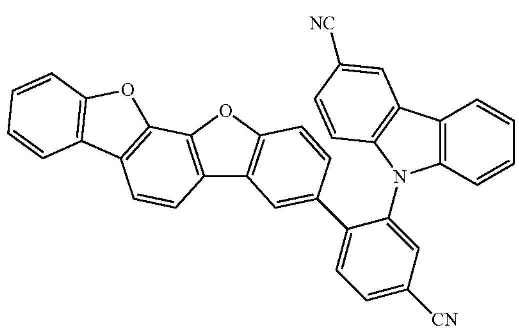
270
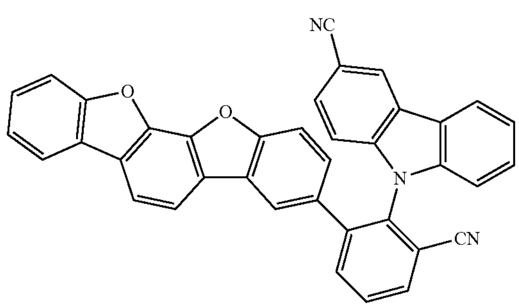
271
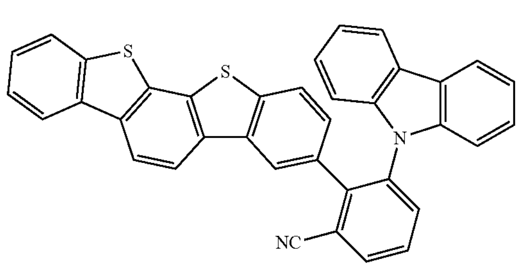
-continued
272
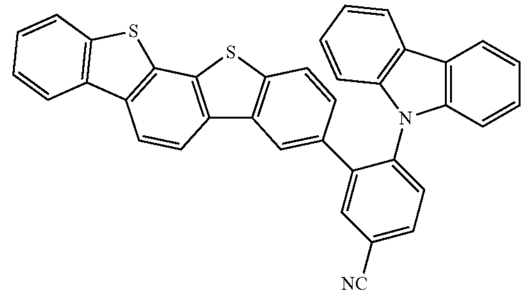
273
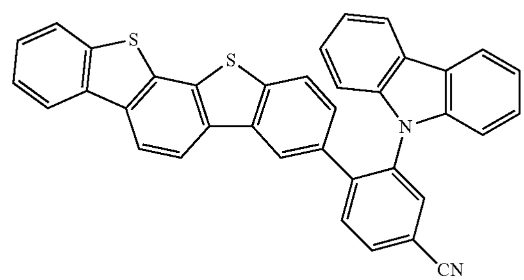
274
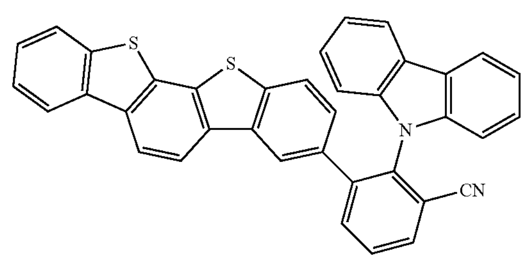
275
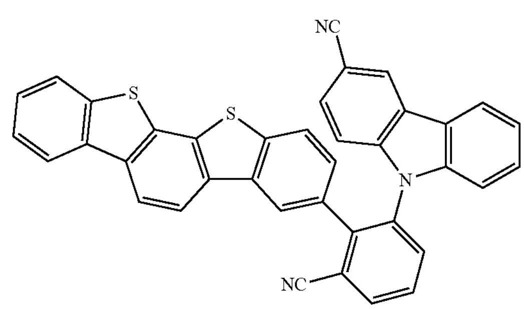
276
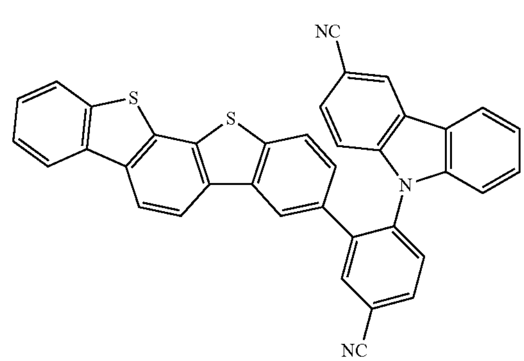

-continued
277
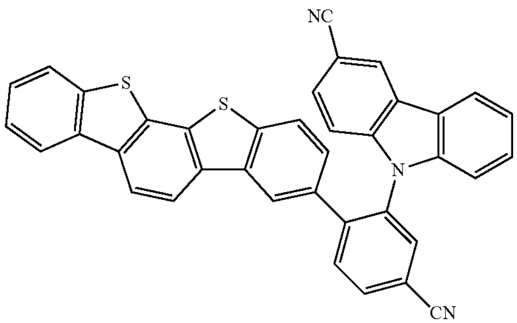
278
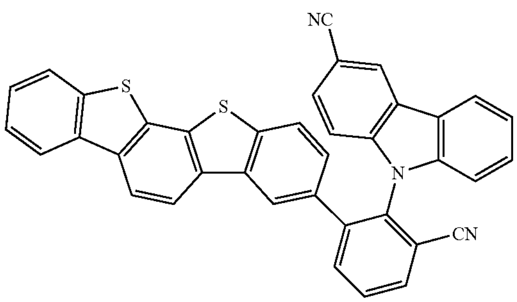
279
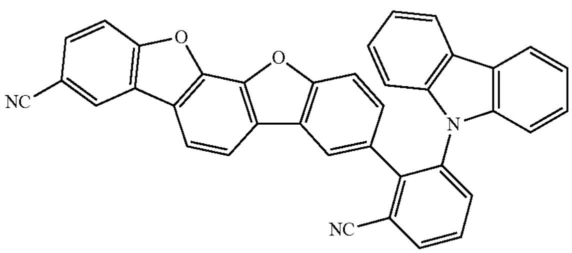
280
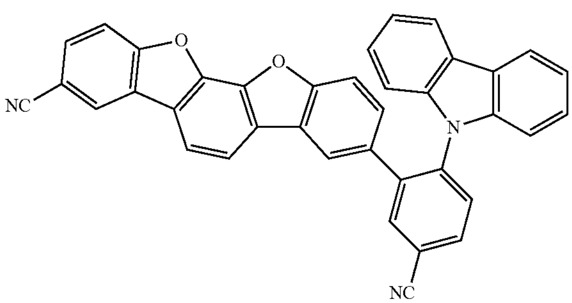
281
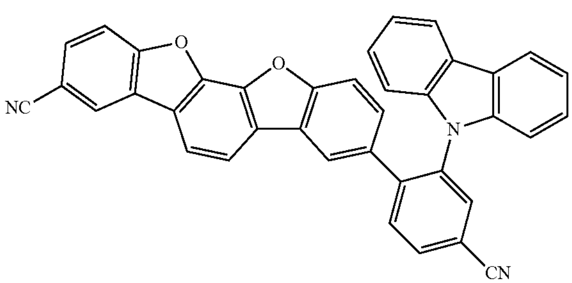
-continued
282
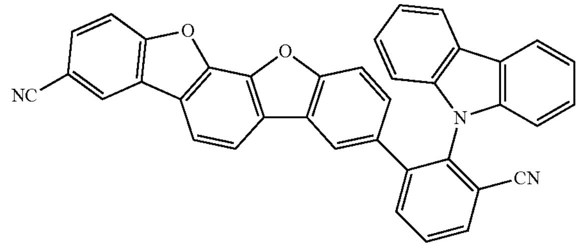
283
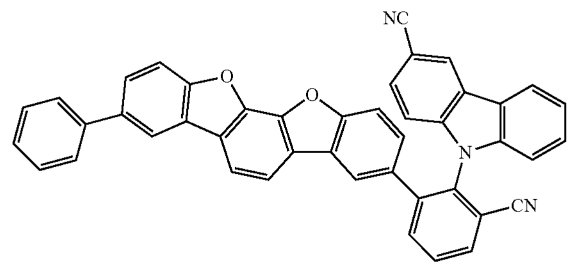
284
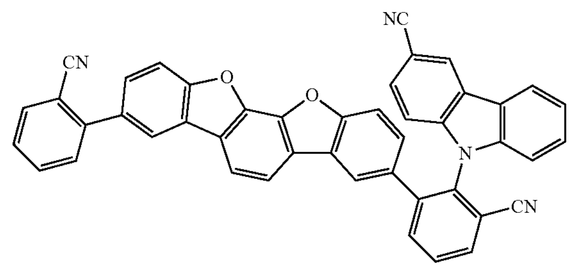
285
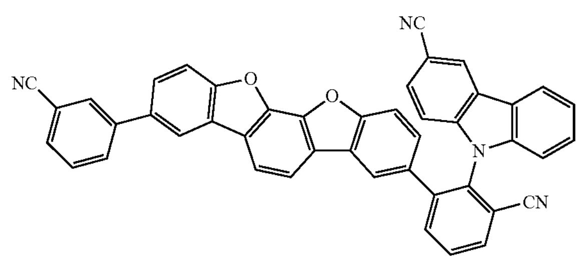
286
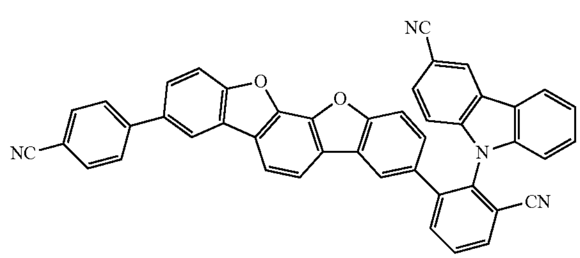

287
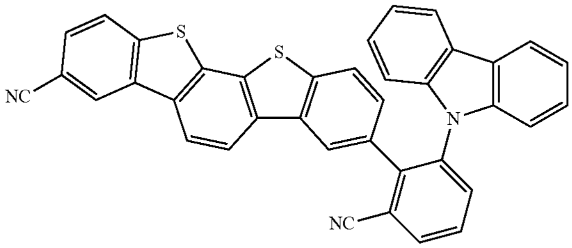
288
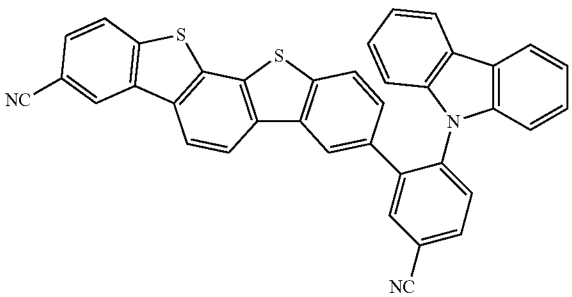
289
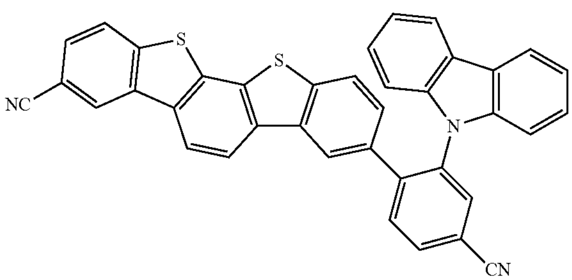
290
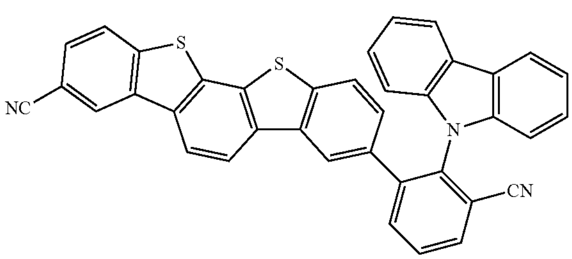
291
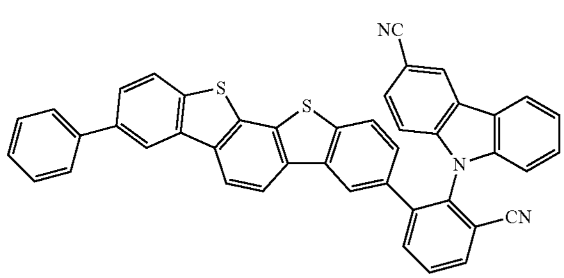
292
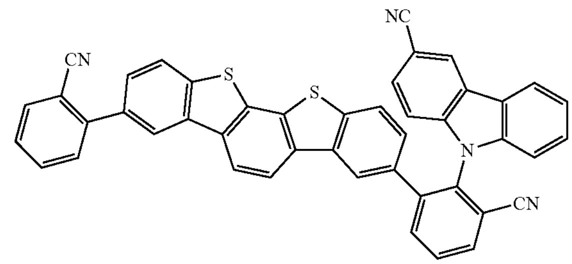
293
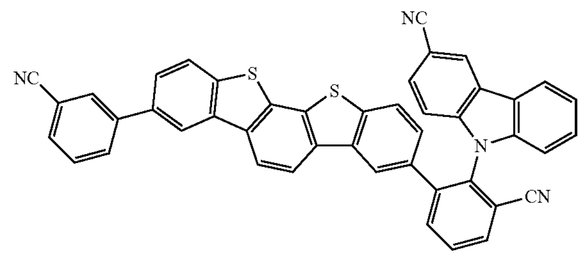
294
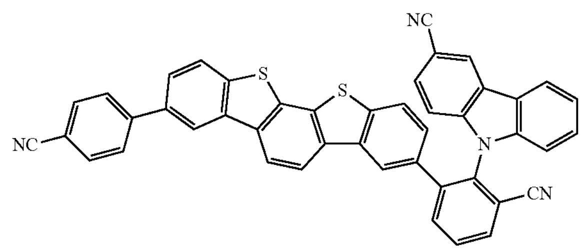
295
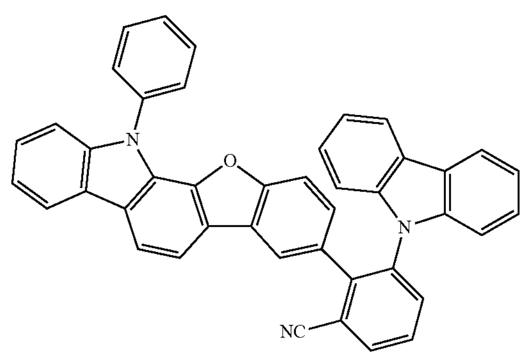
296
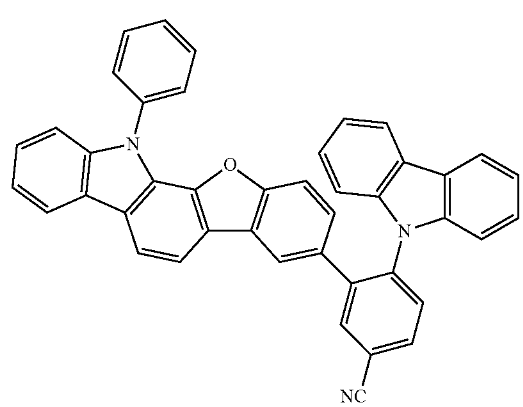

-continued
297
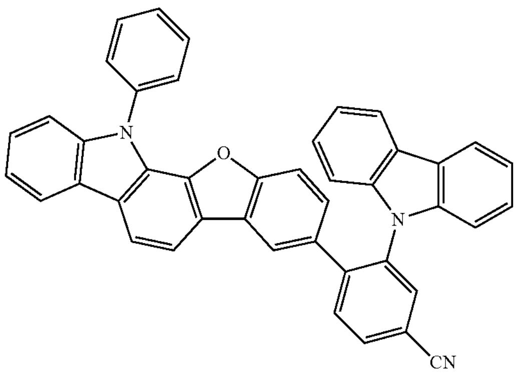
298
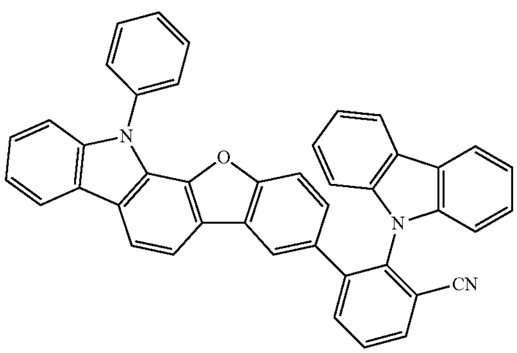
299
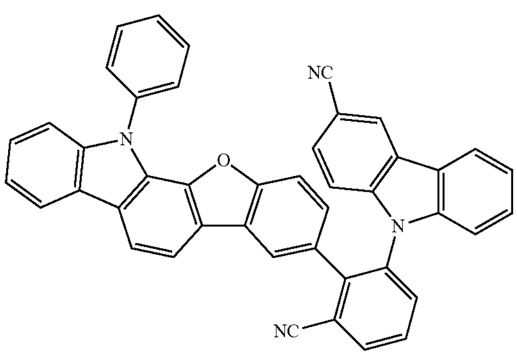
300
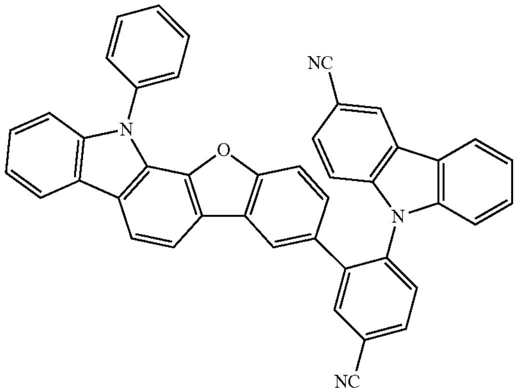
-continued
301
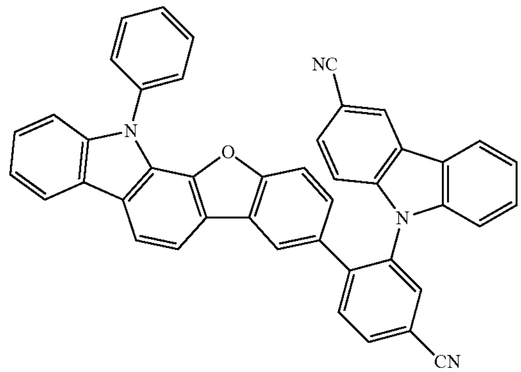
302
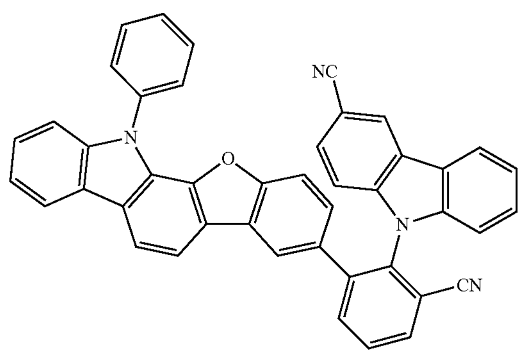
303
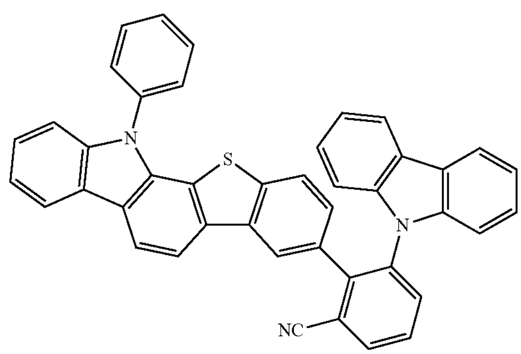
304
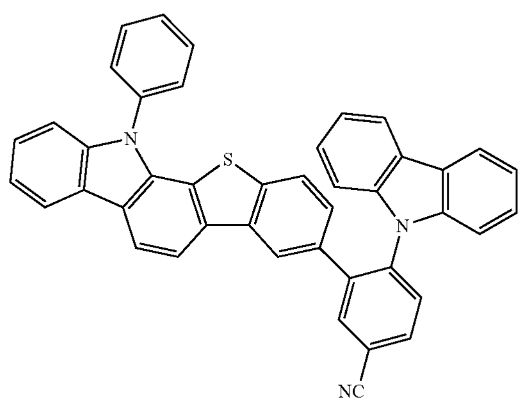

-continued
305
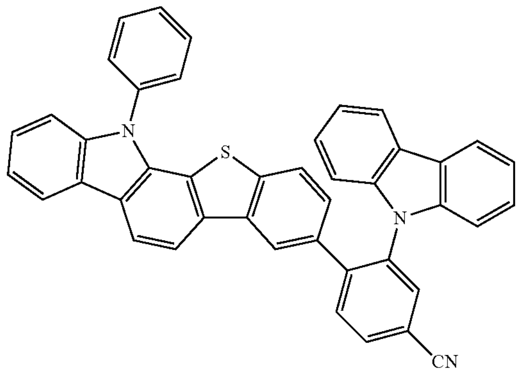
306
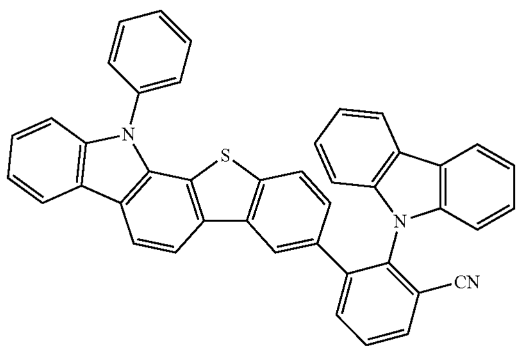
307
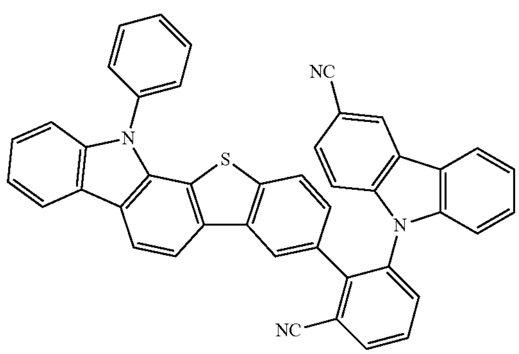
308
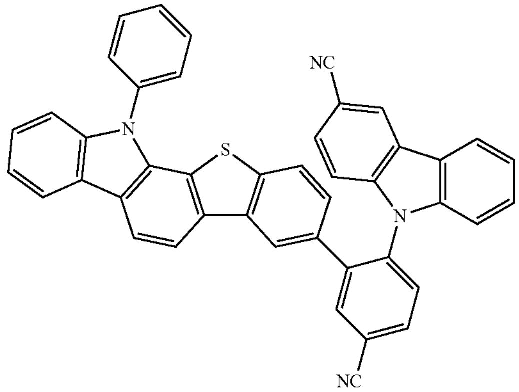
-continued
309
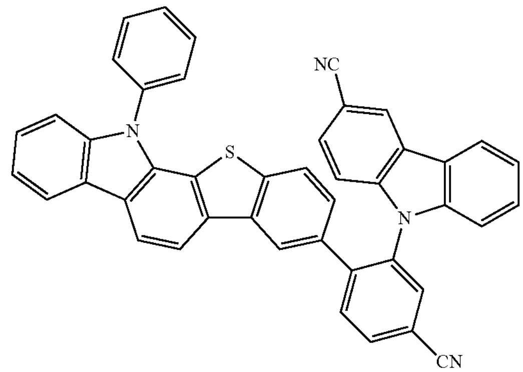
310
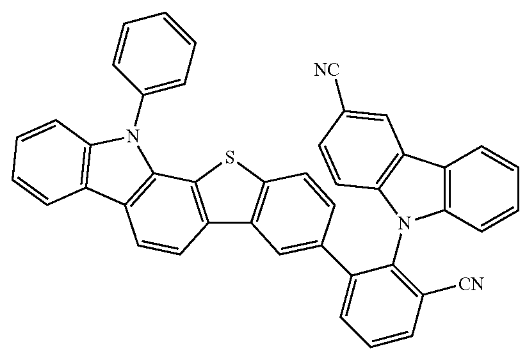
311
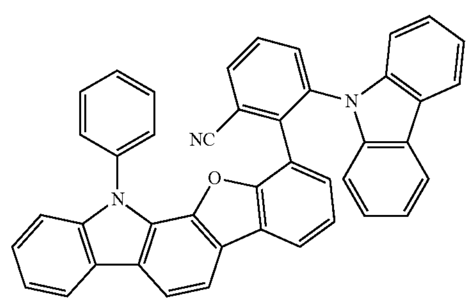
312
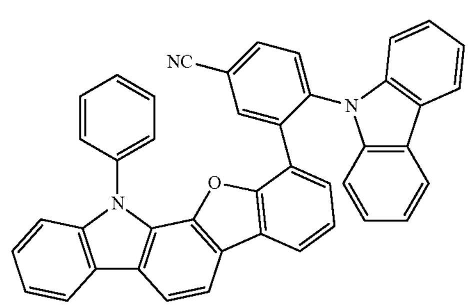

-continued
313
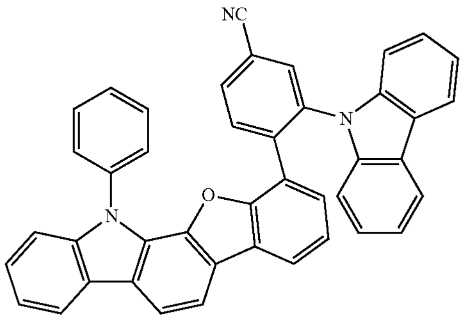
314
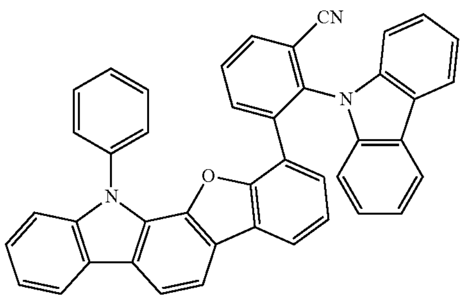
315
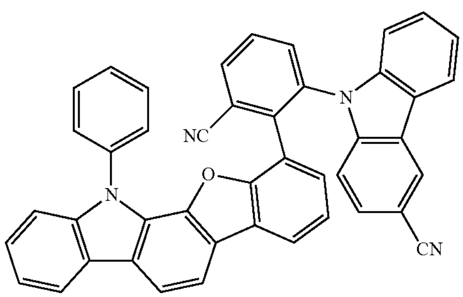
316
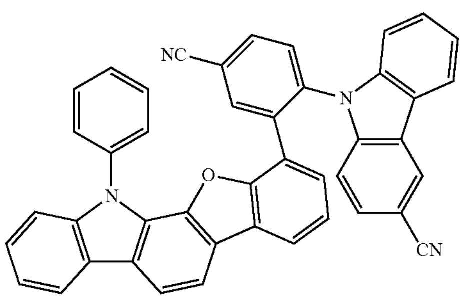
317
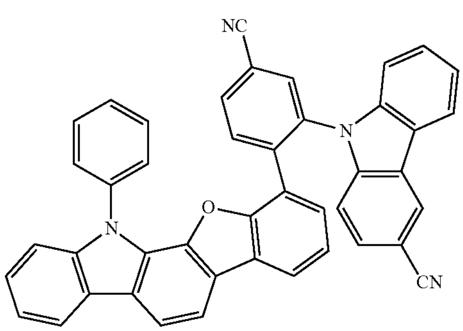
-continued
318
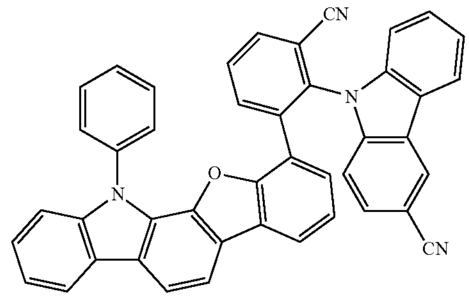
319
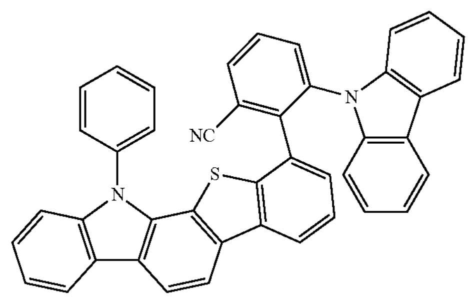
320
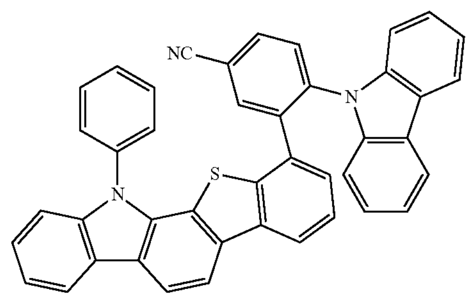
321
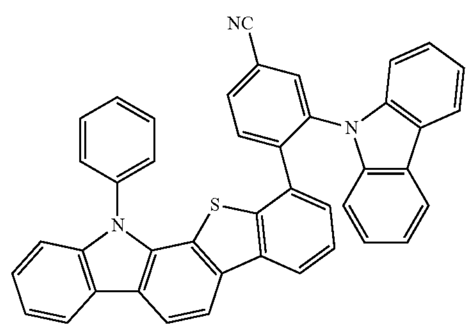
322
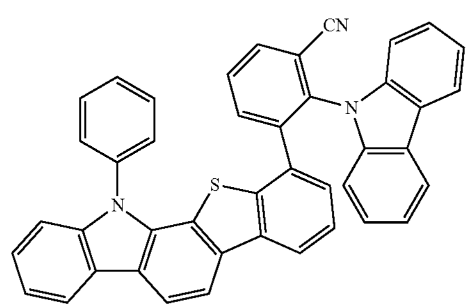

323
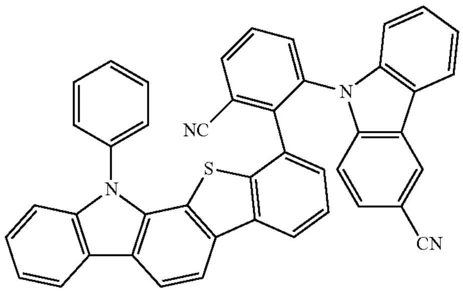
324
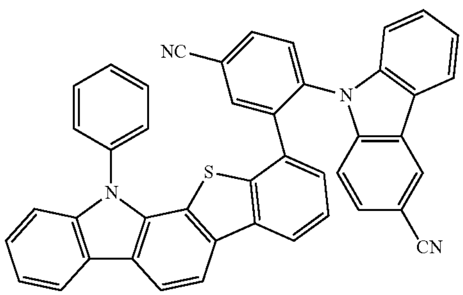
325
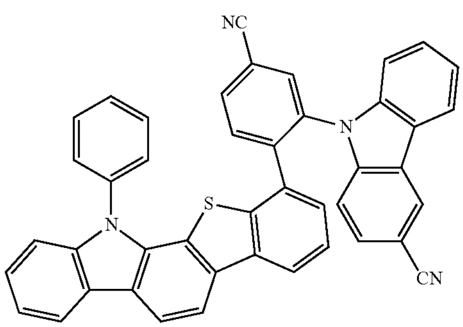
326
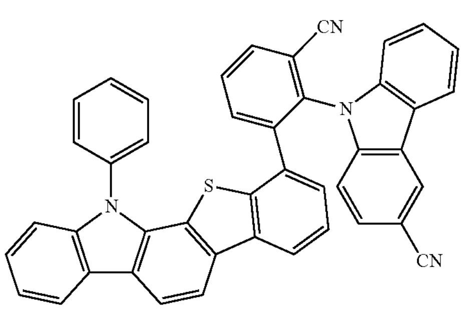
327
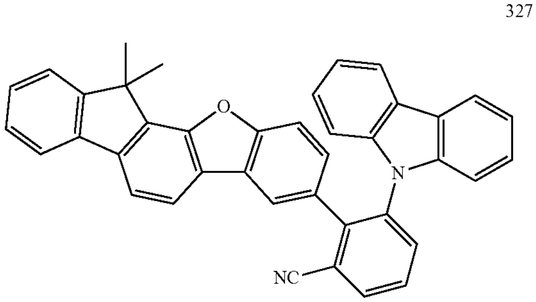
328
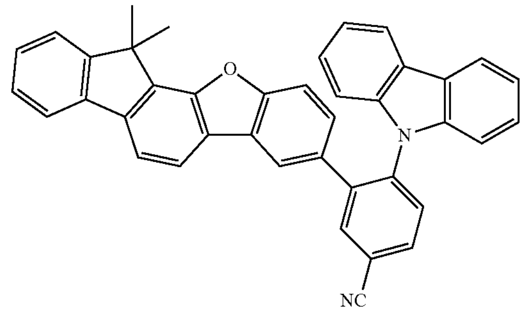
329
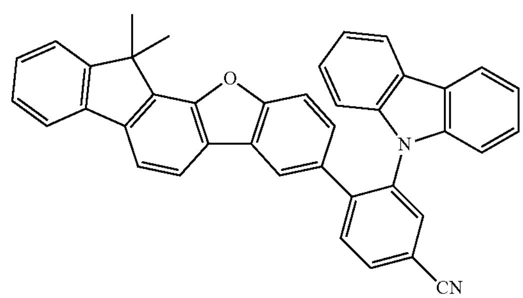
330
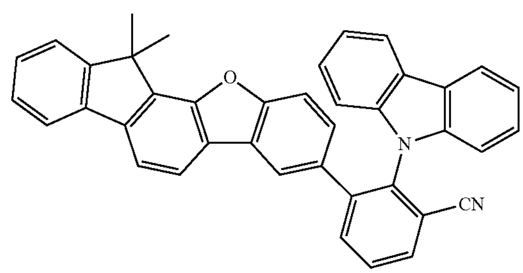
331
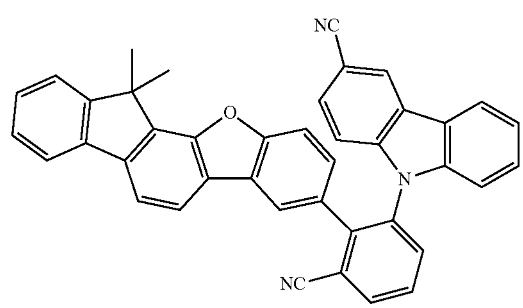
332
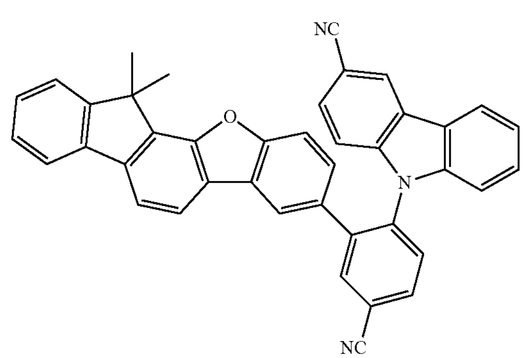

-continued
333
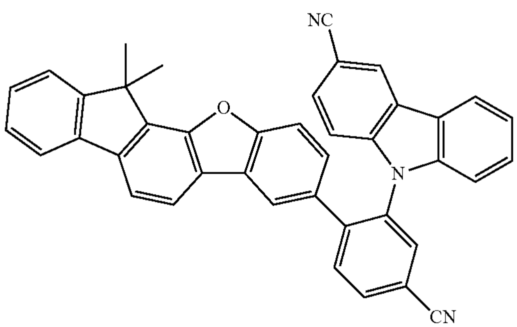
334
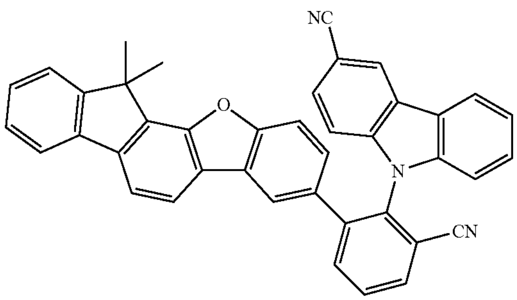
335
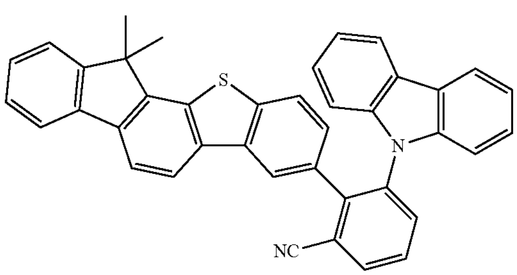
336
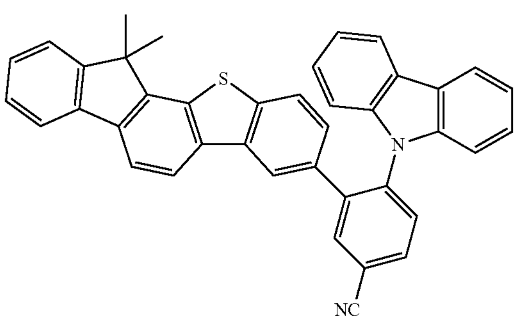
337
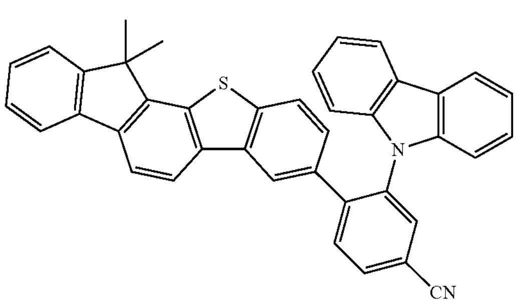
-continued
338
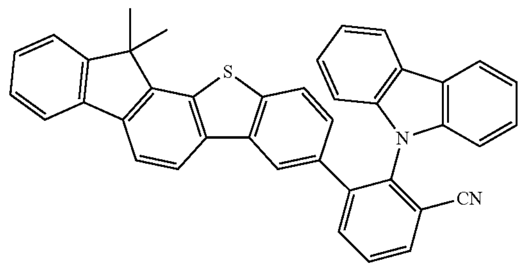
339
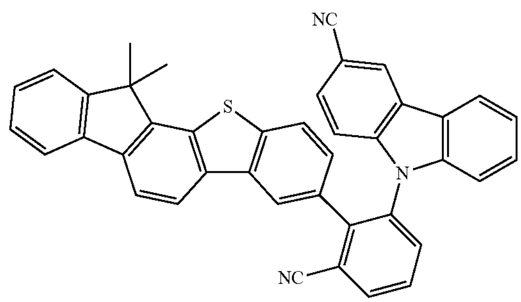
340
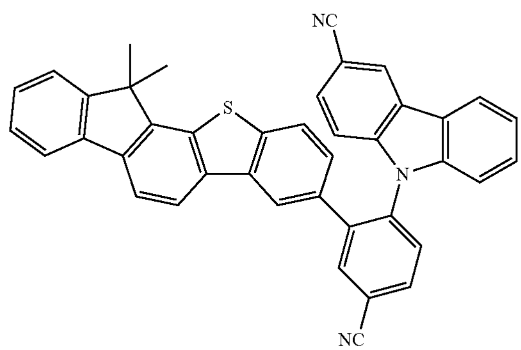
341
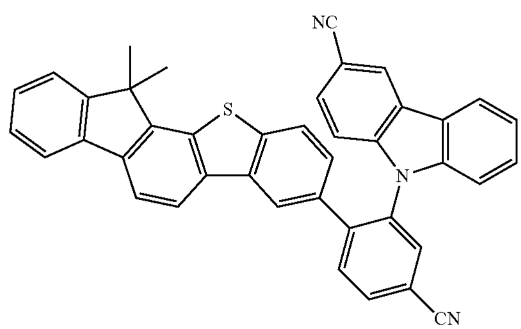
342
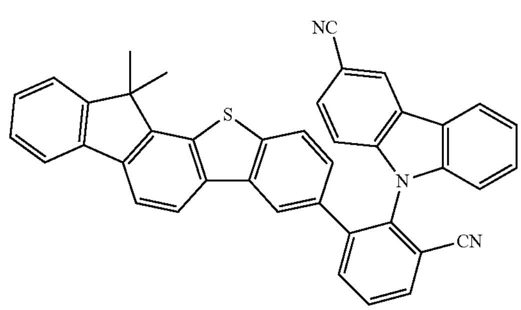

-continued
343
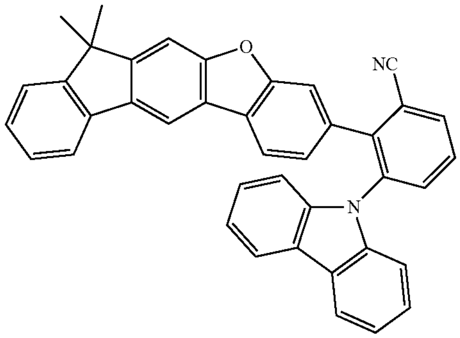
344
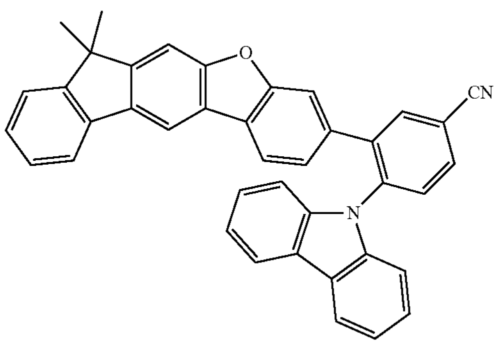
345
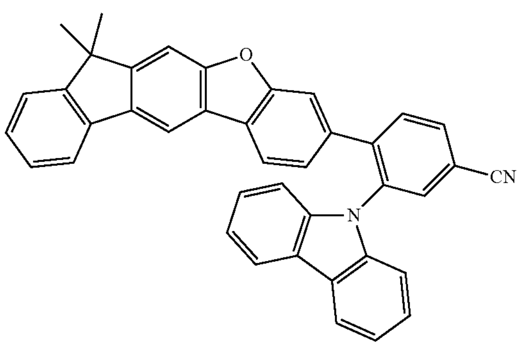
346
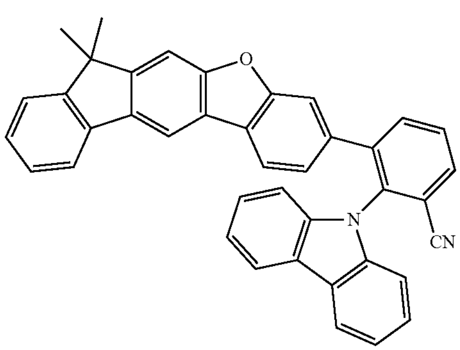
-continued
347
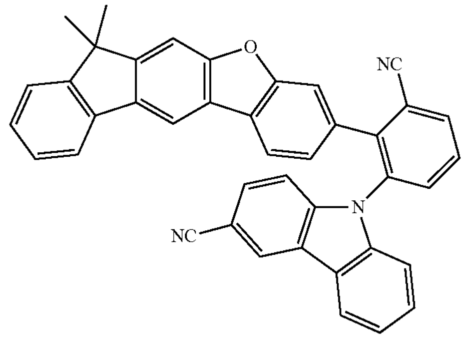
348
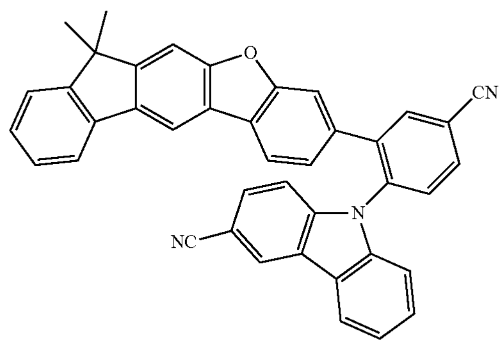
349
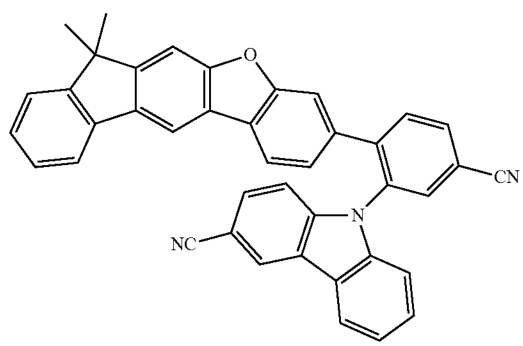
350
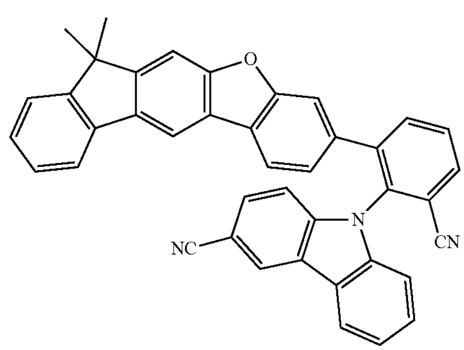

-continued
351
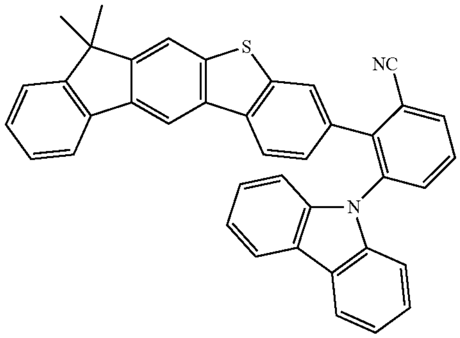
352
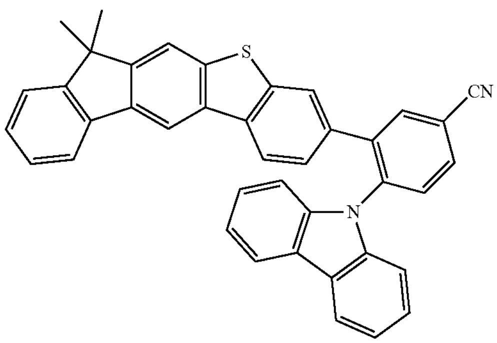
353
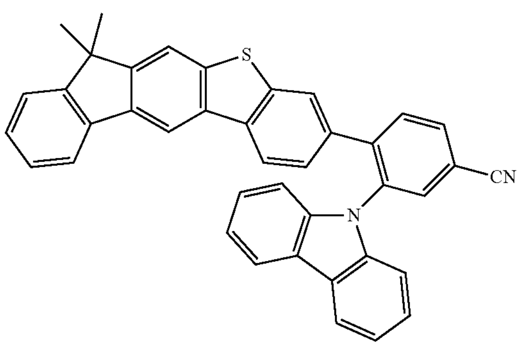
354
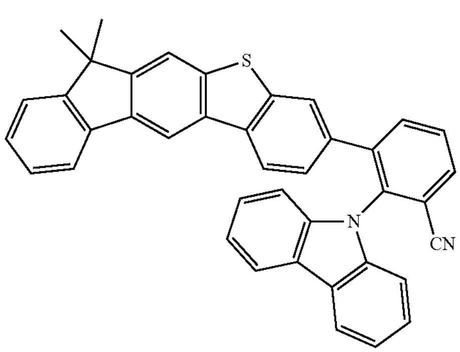
-continued
355
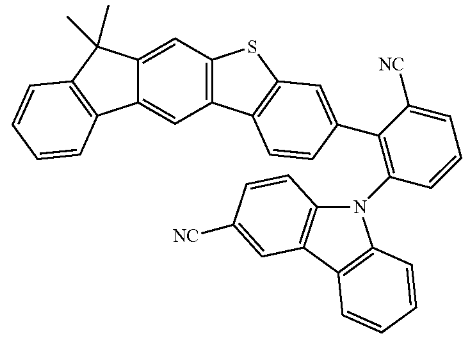
356
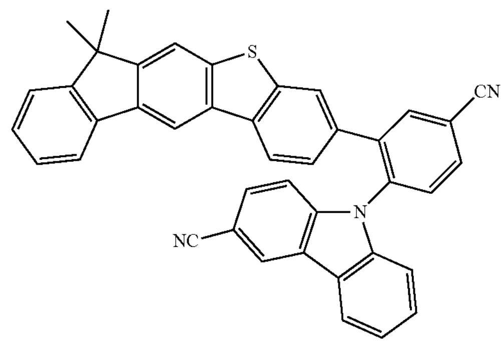
357
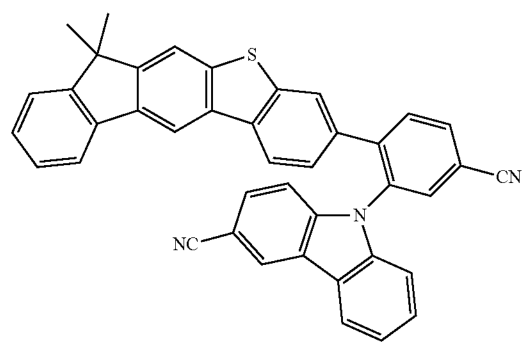
358
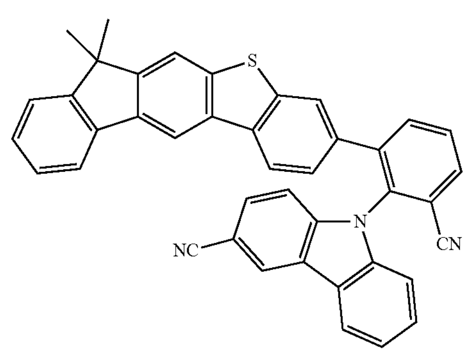

-continued
359
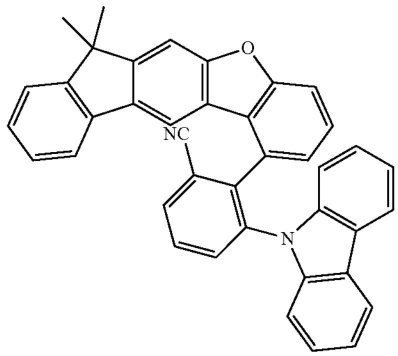
360
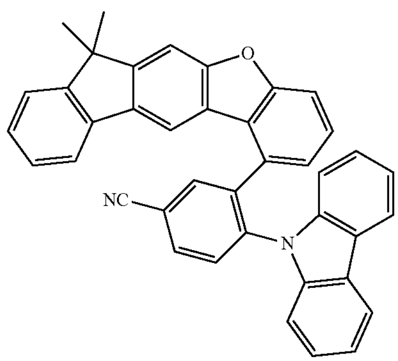
361
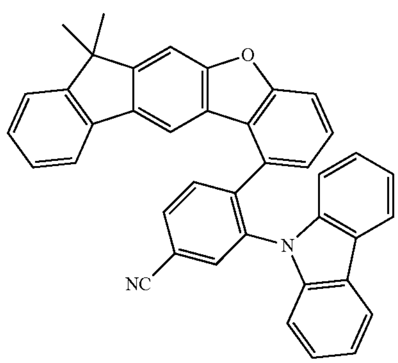
362
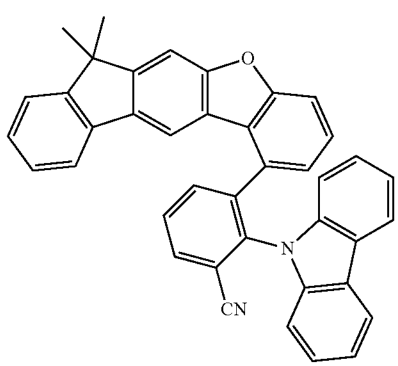
-continued
363
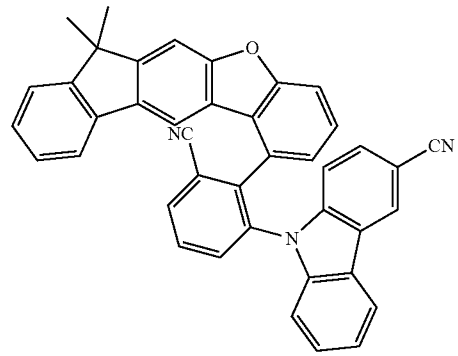
364
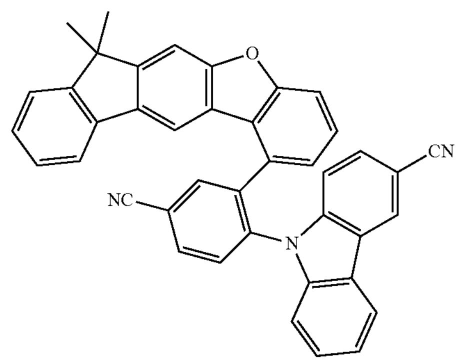
365
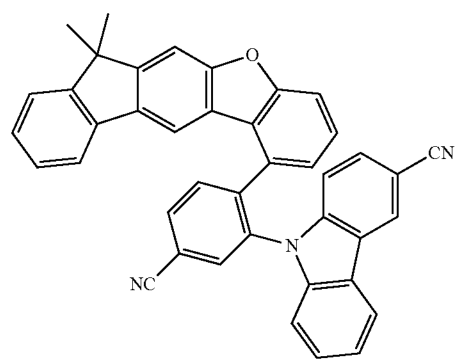
366
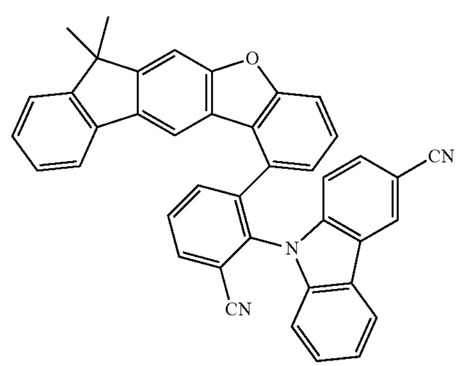

-continued
367
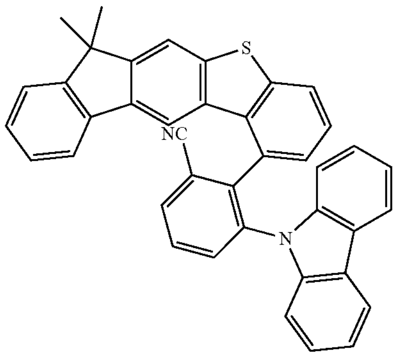
368
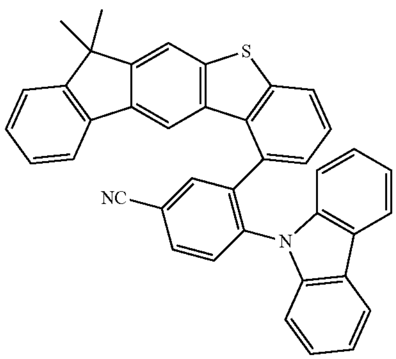
369
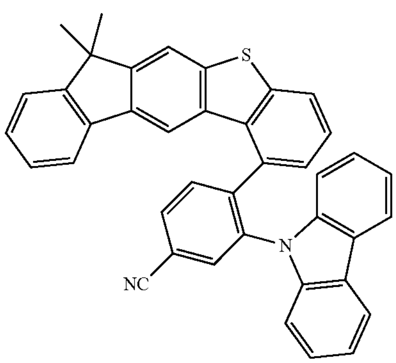
370
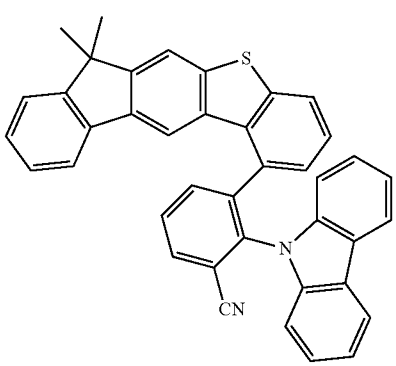
-continued
371
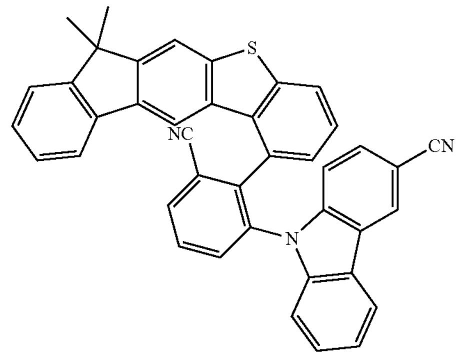
372
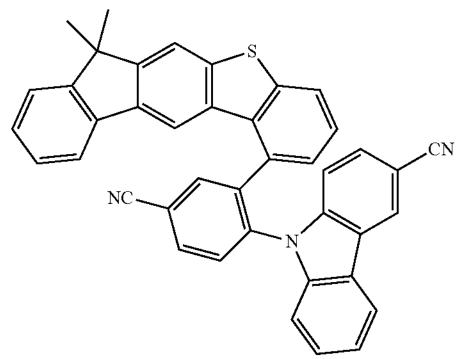
373
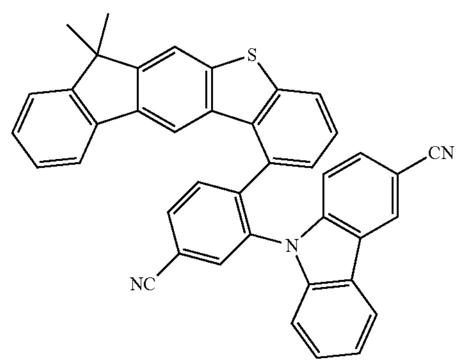
374
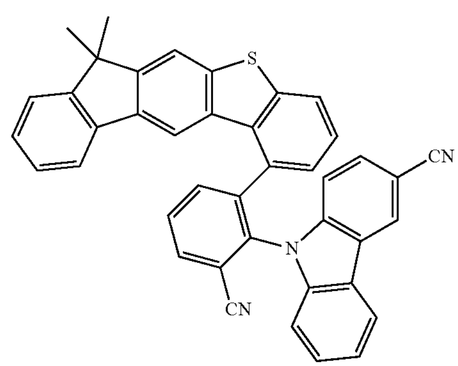

-continued
375
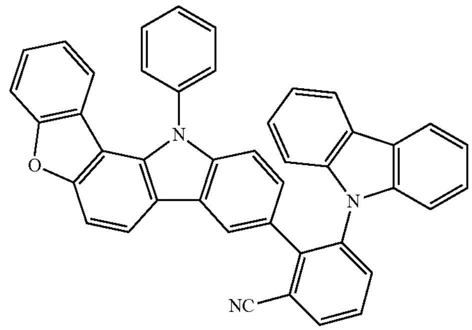
376
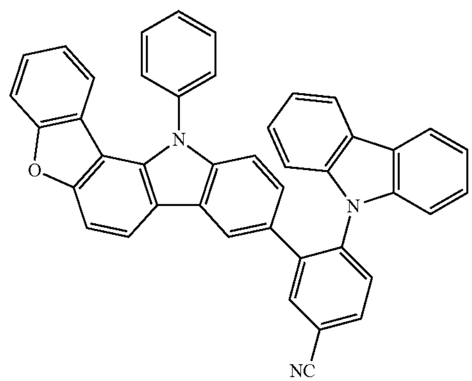
377
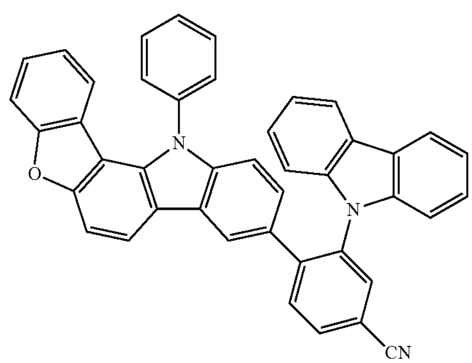
378
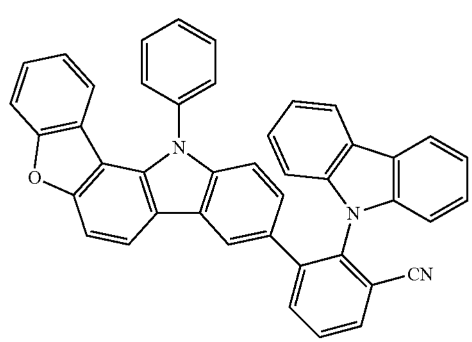
-continued
379
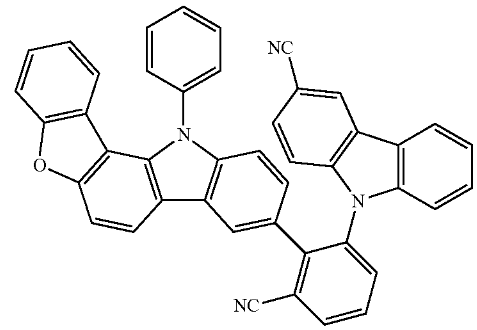
380
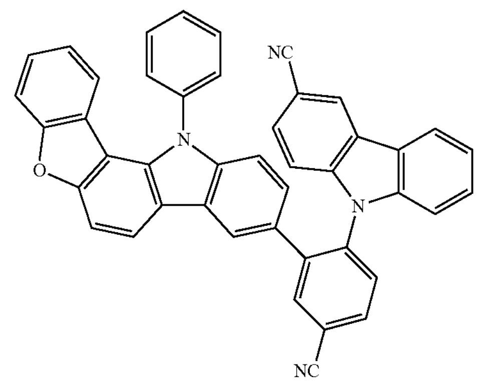
381
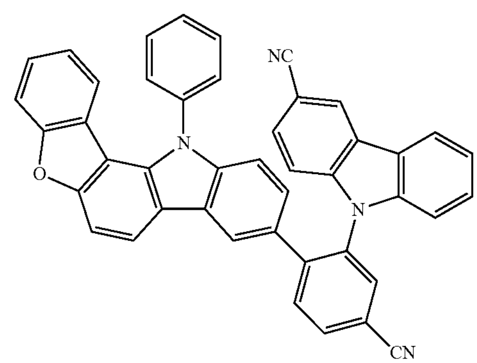
382
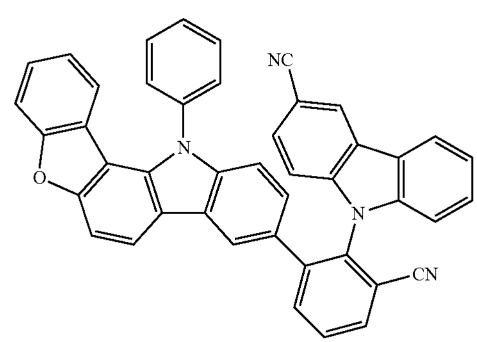

383
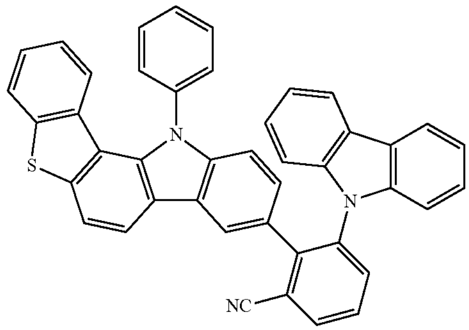
384
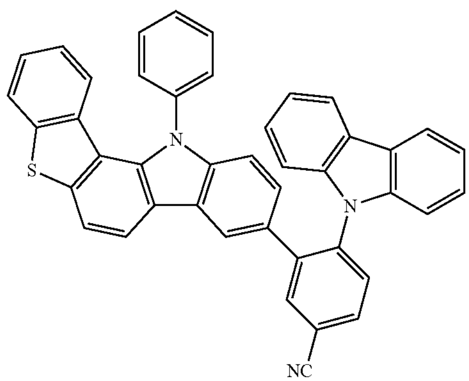
385
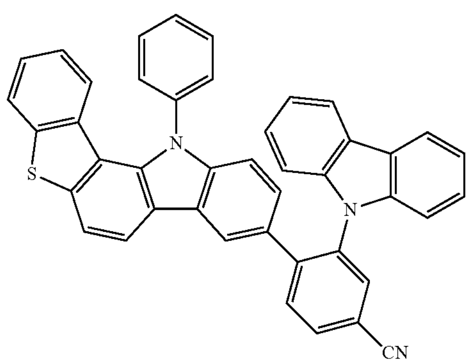
386
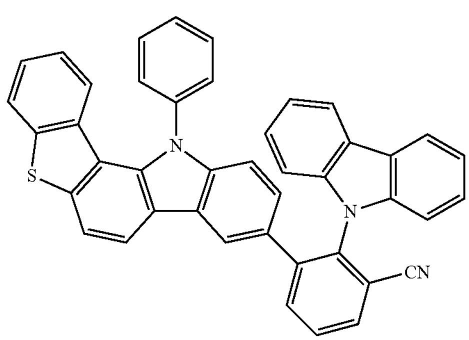
387
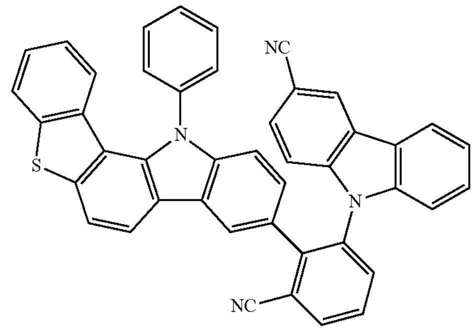
388
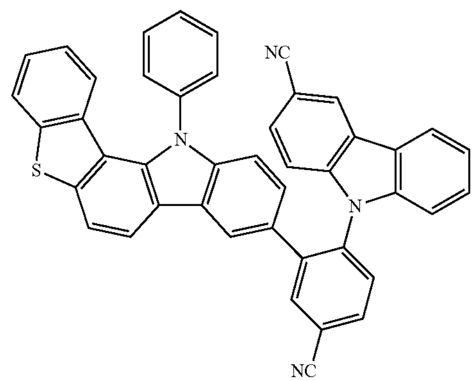
389
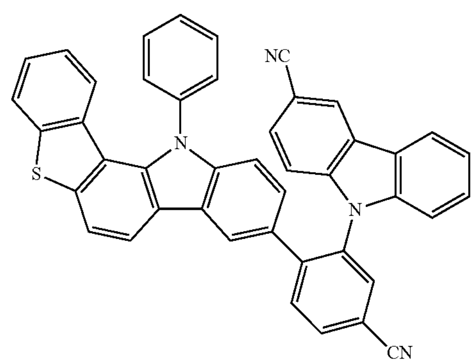
390
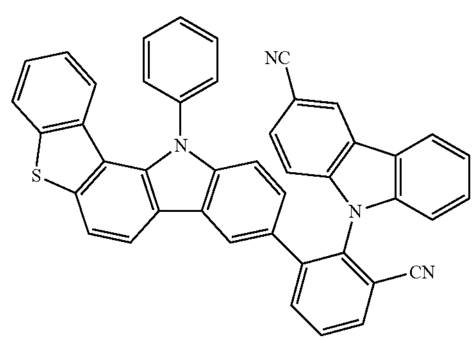

-continued
391
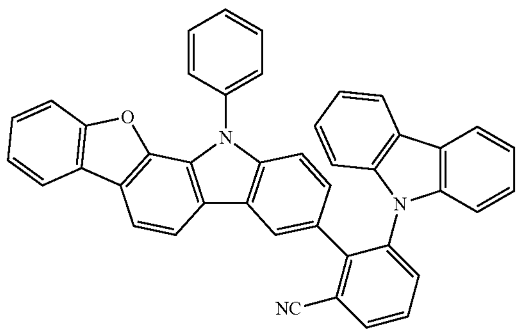
392
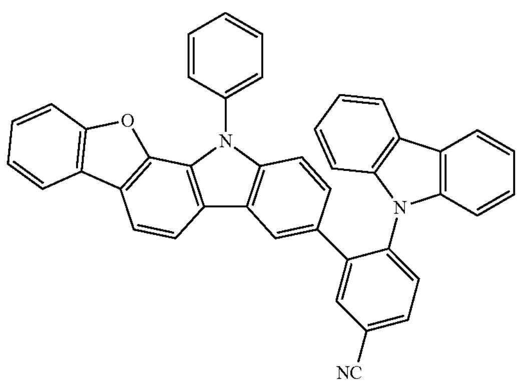
393
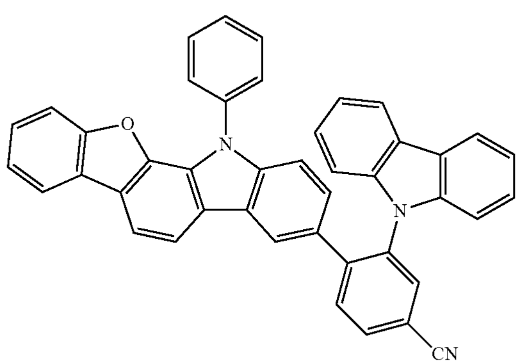
394
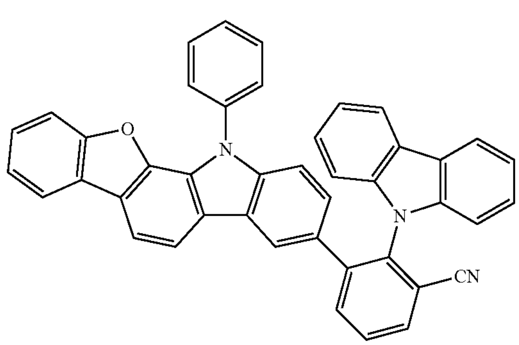
-continued
395
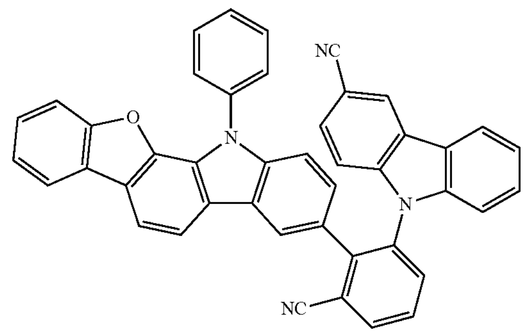
396
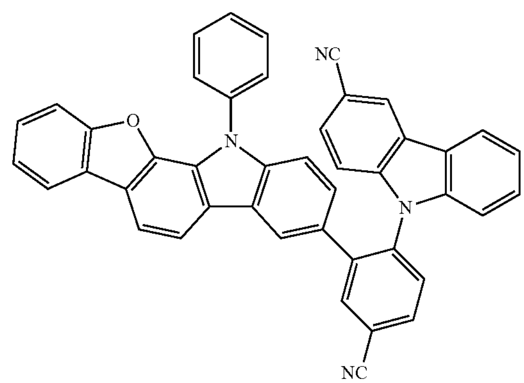
397
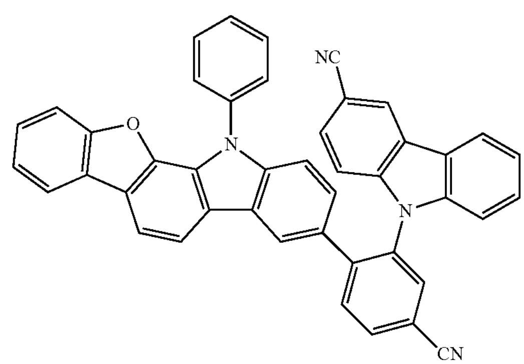
398
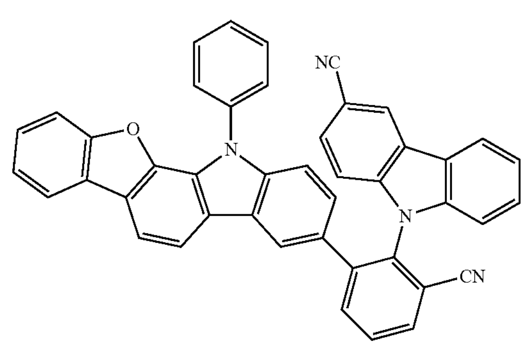

399
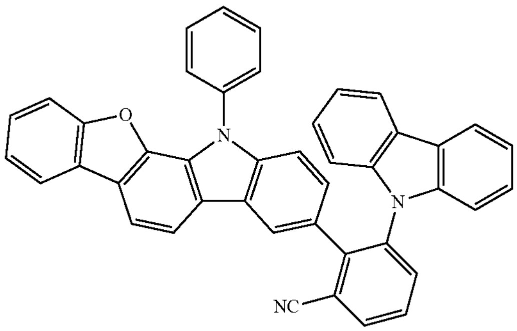
400
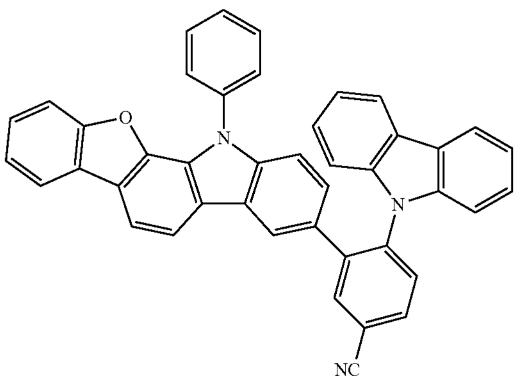
401
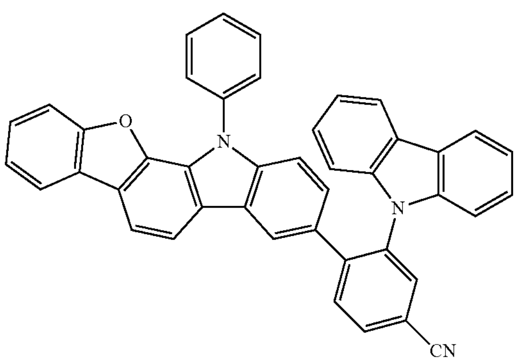
402
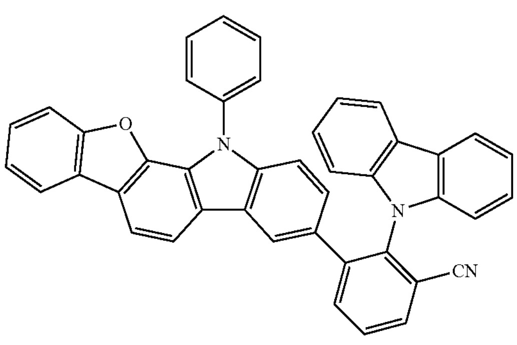
403
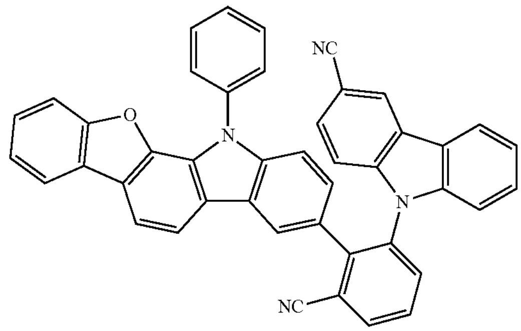
404
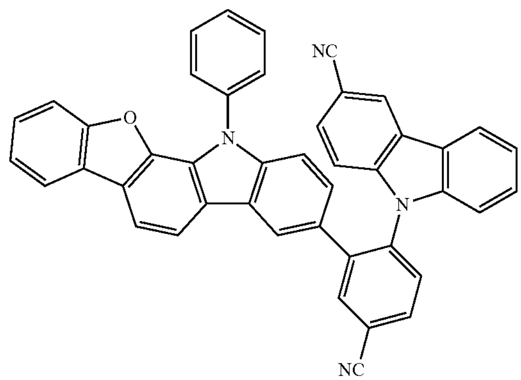
405
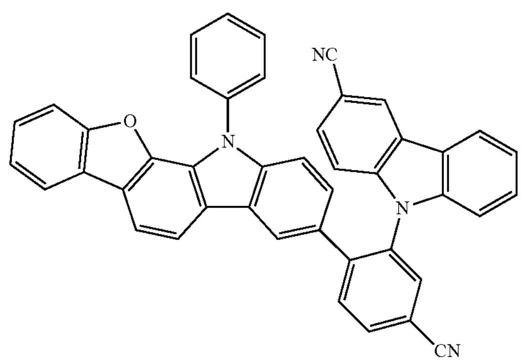
406
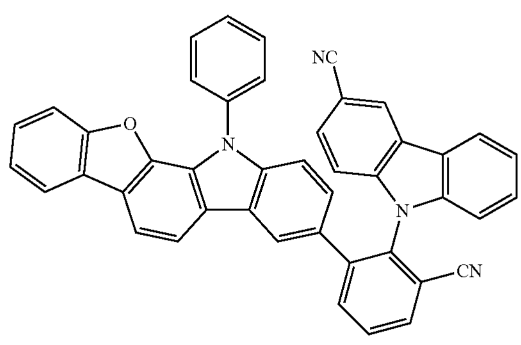

-continued
407
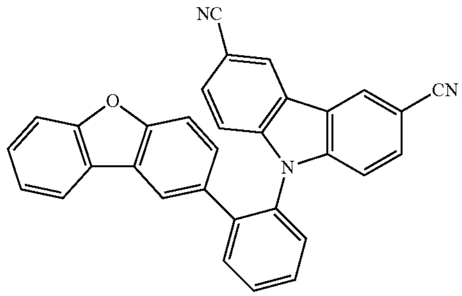
408
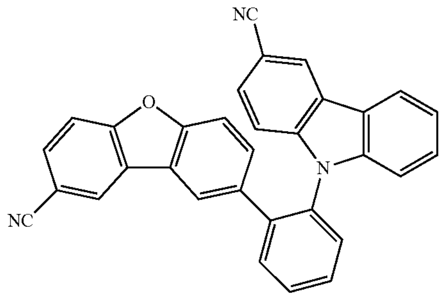
409
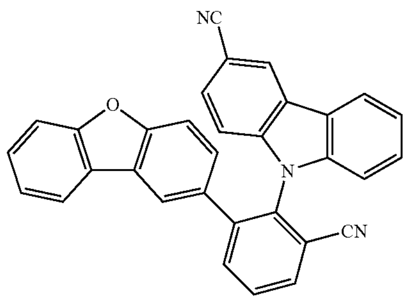
410
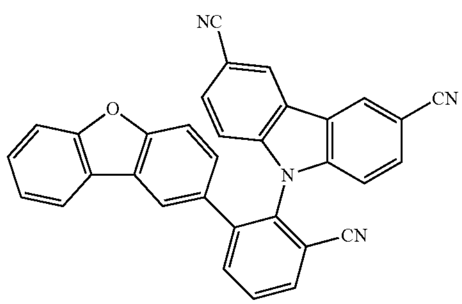
411
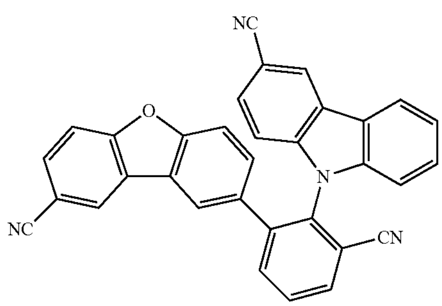
-continued
412
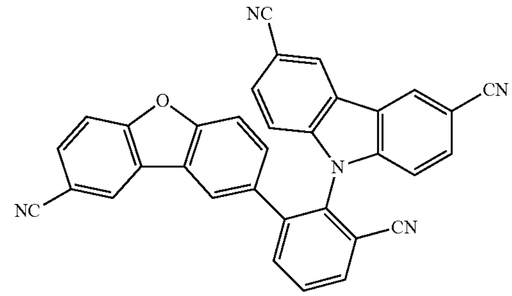
413
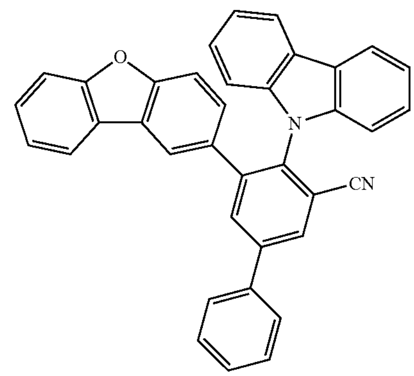
414
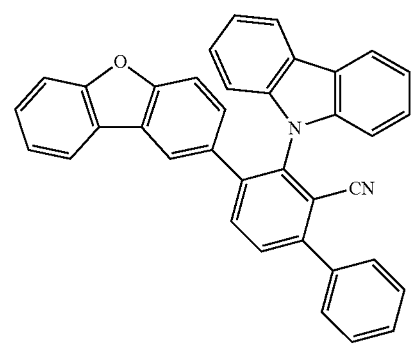
415
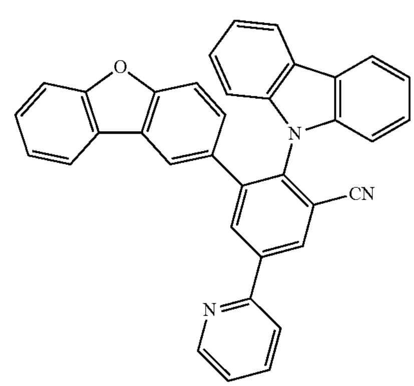

416
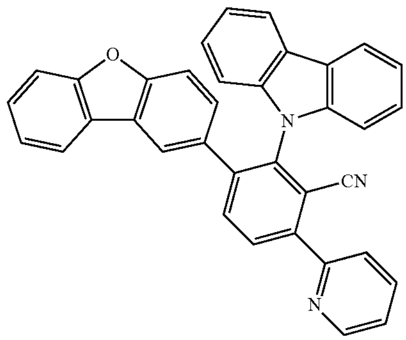
417
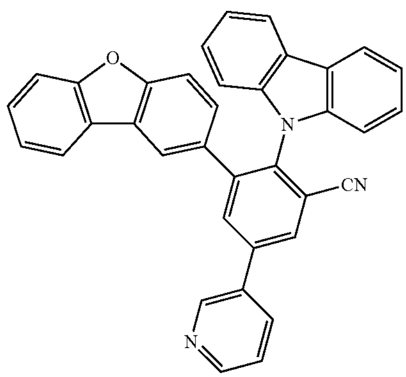
418
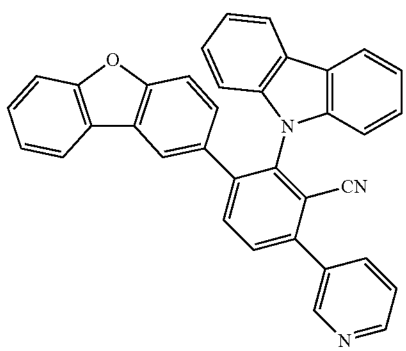
419
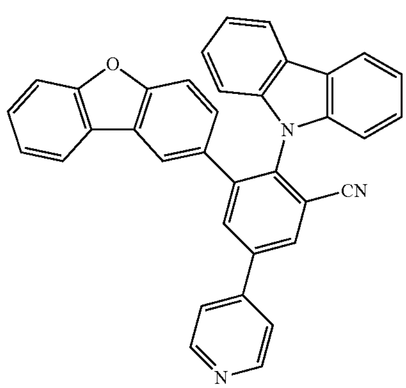
420
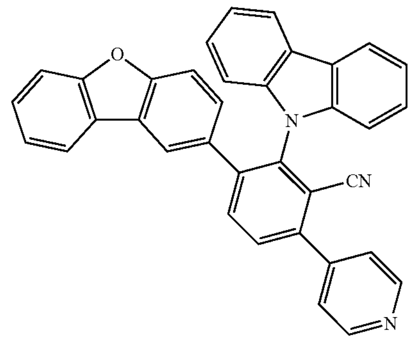
421
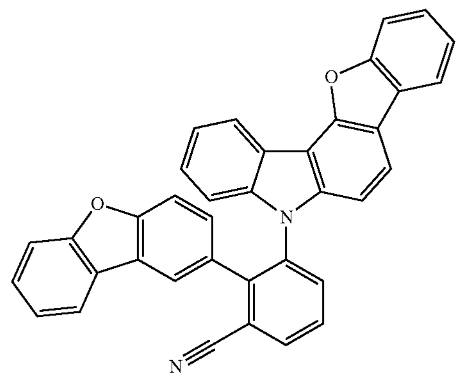
422
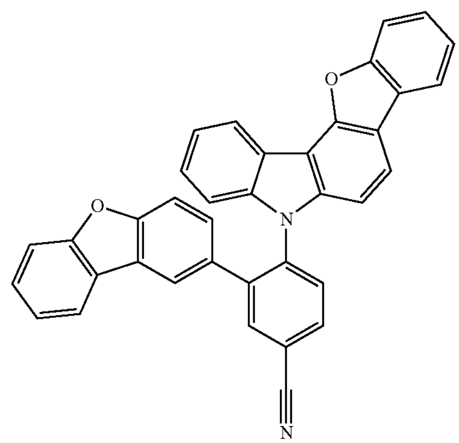
423
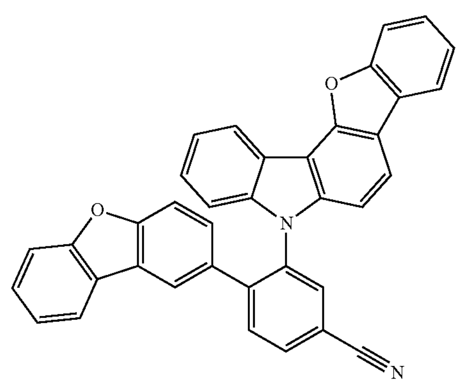

424
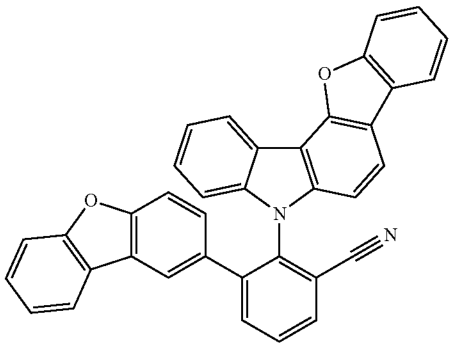
425
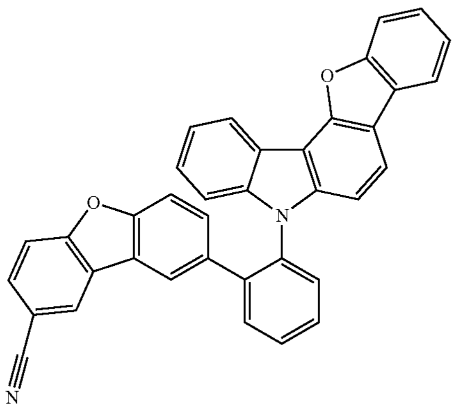
426
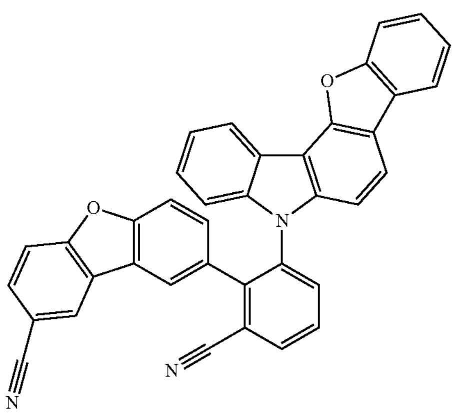
427
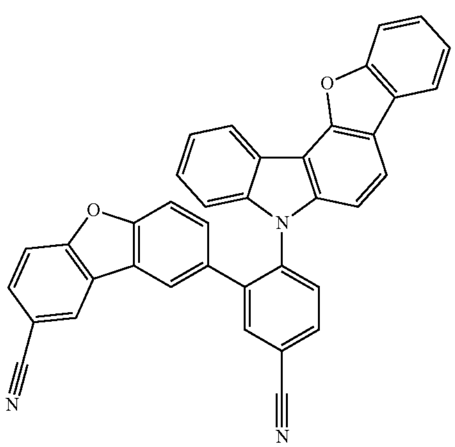
428
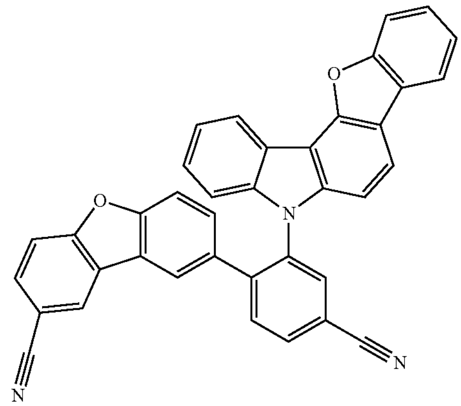
429
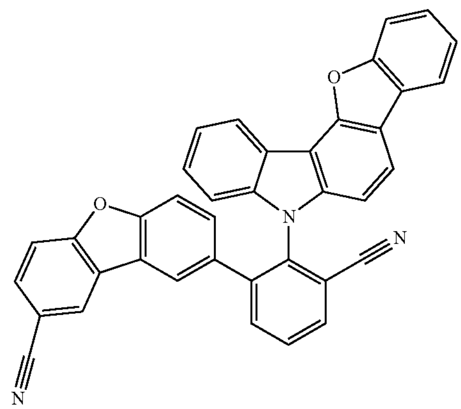
430
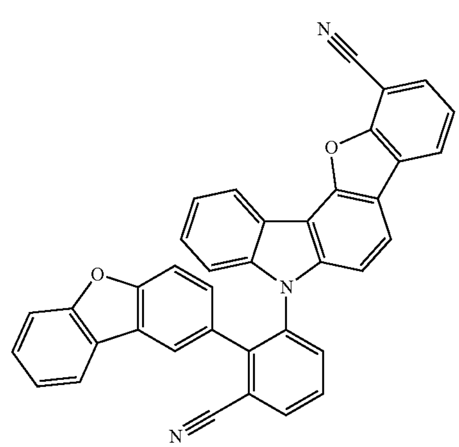

-continued
431
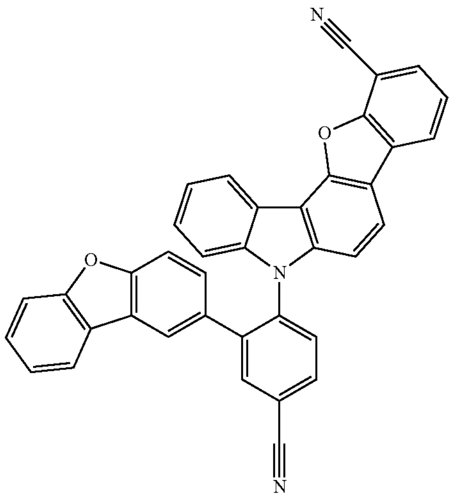
432
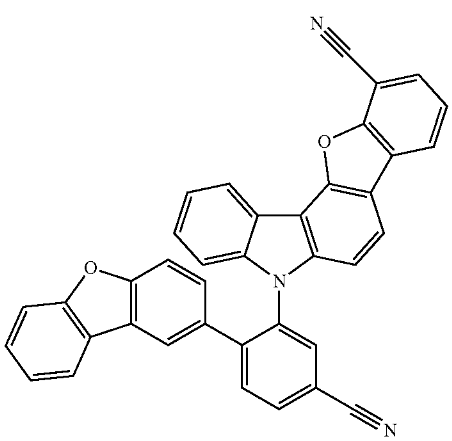
433
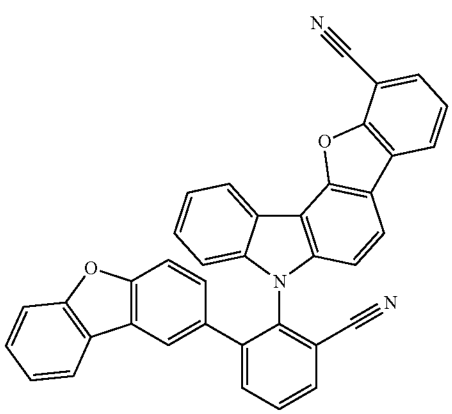
-continued
434
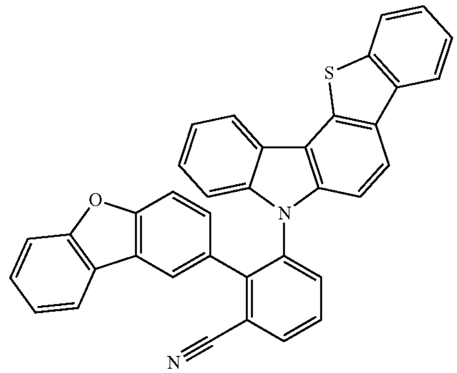
435
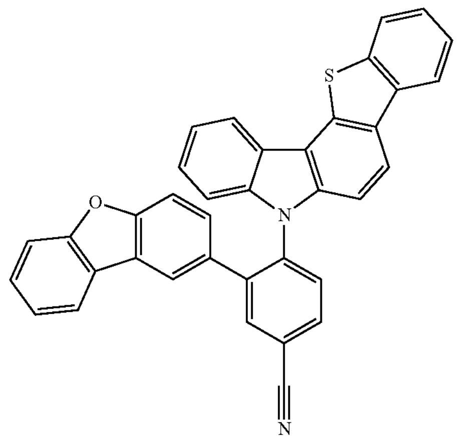
436
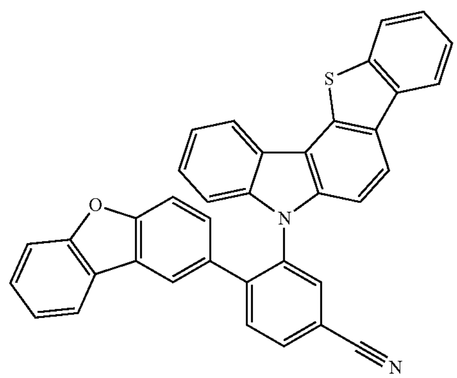
437
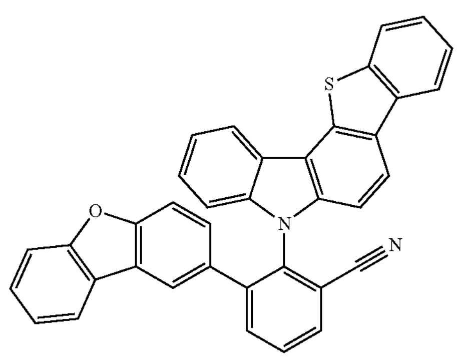

-continued
438
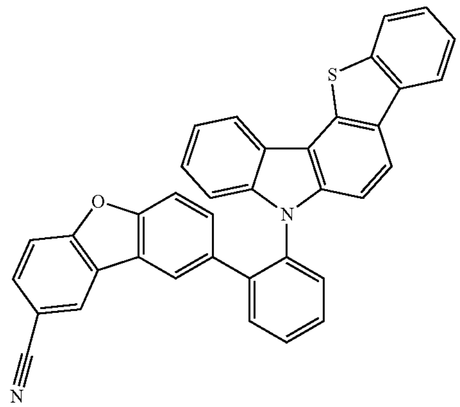
439
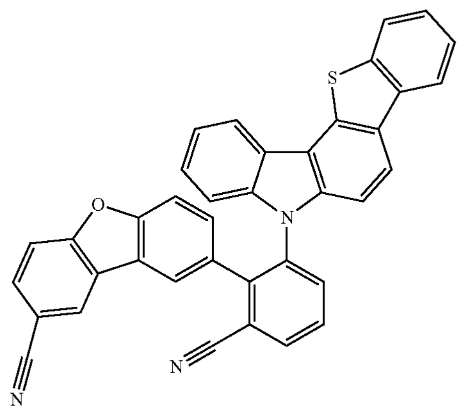
440
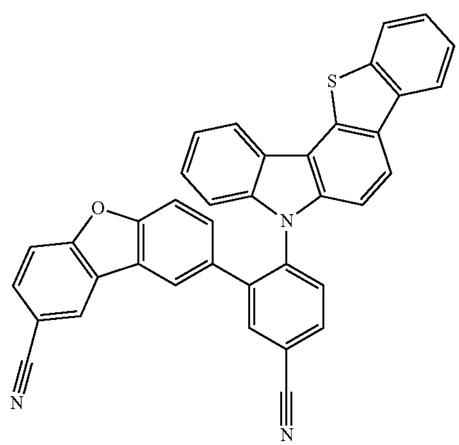
441
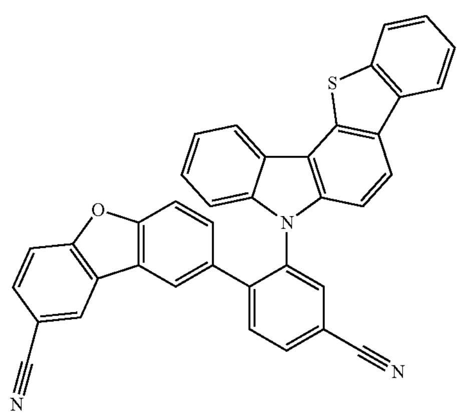
-continued
442
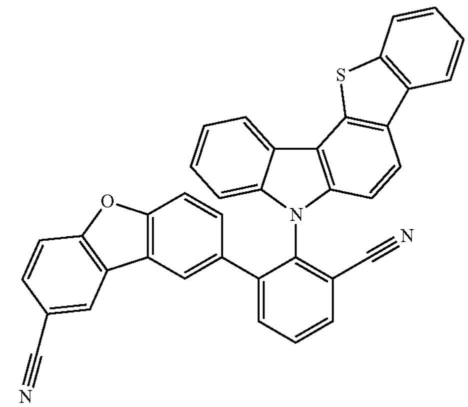
443
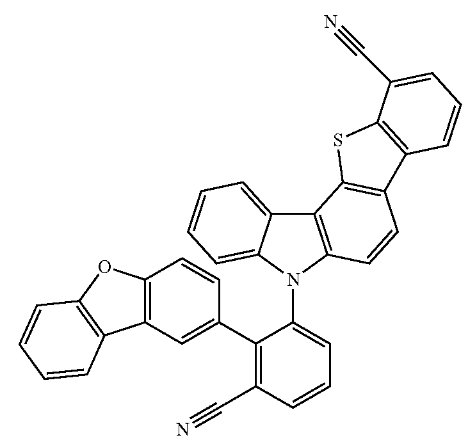
444
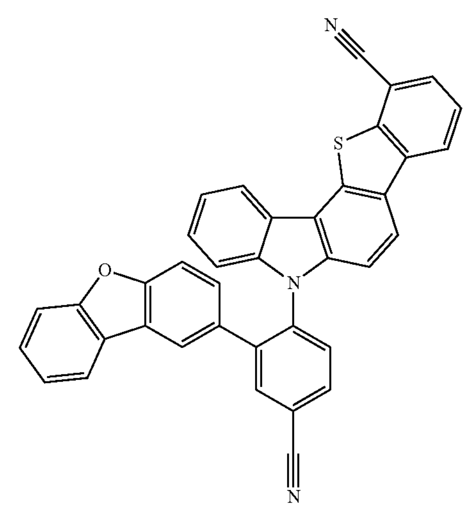

-continued
445
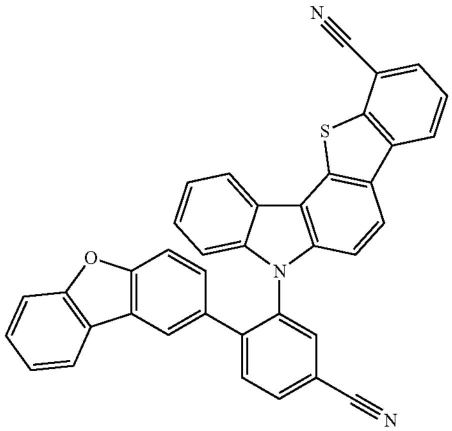
446
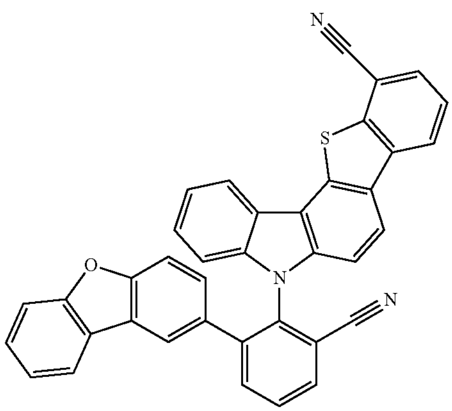
447
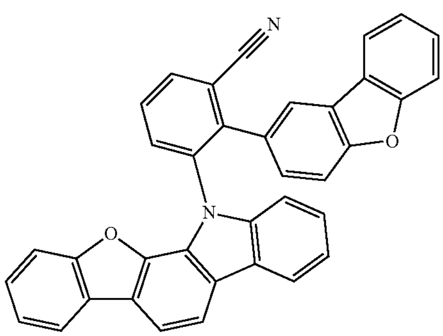
448
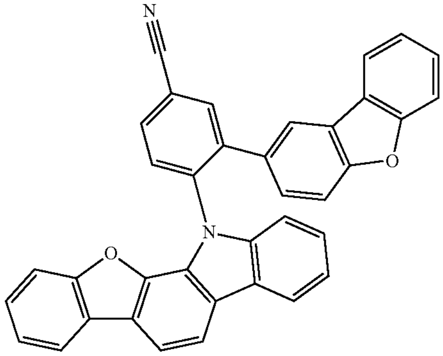
-continued
449
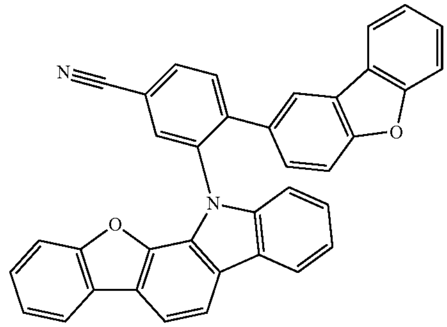
450
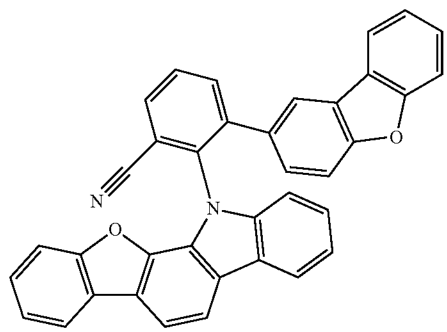
451
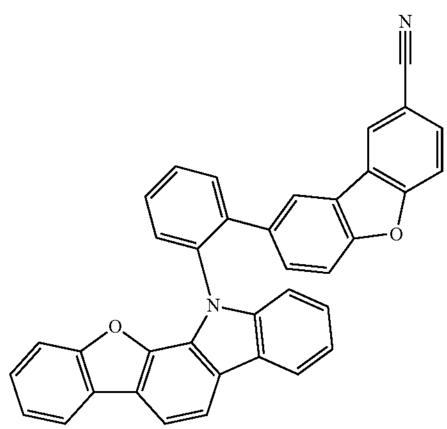
452
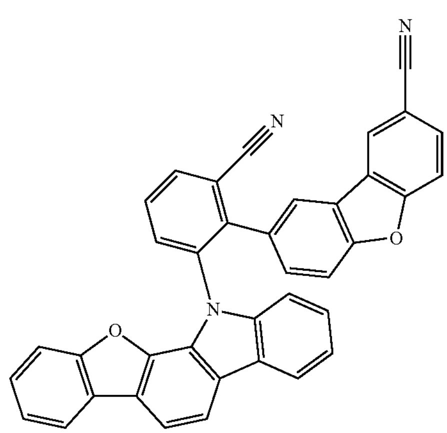

-continued
453
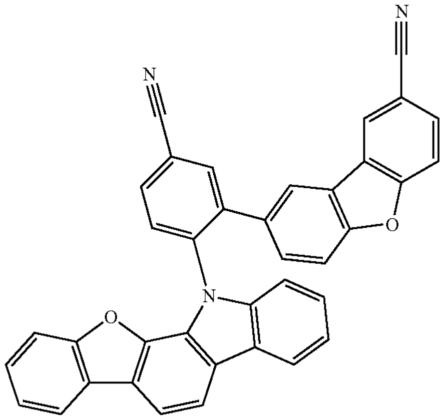
454
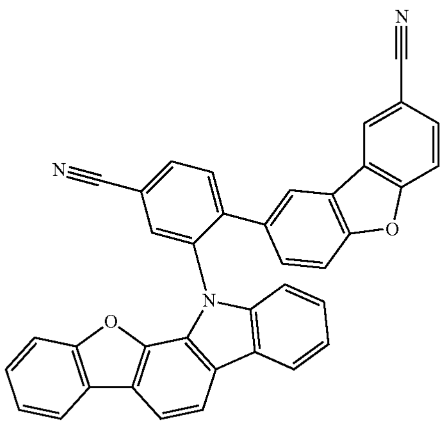
455
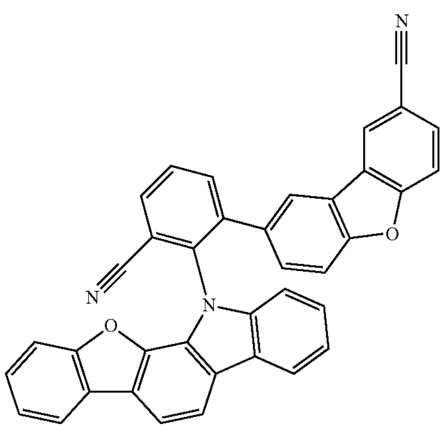
456
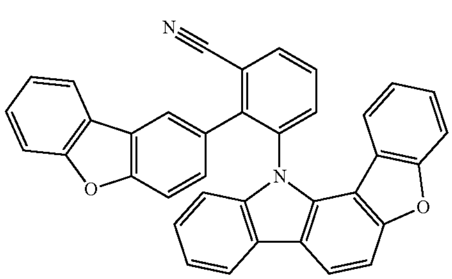
-continued
457
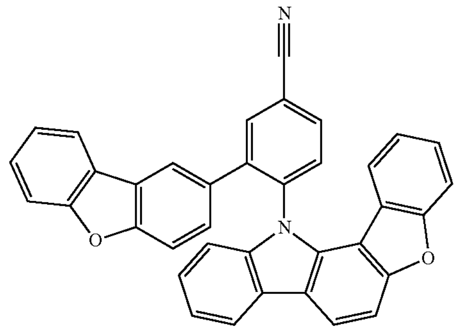
458
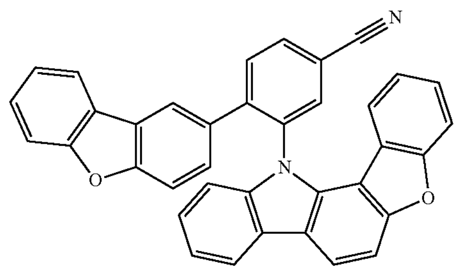
459
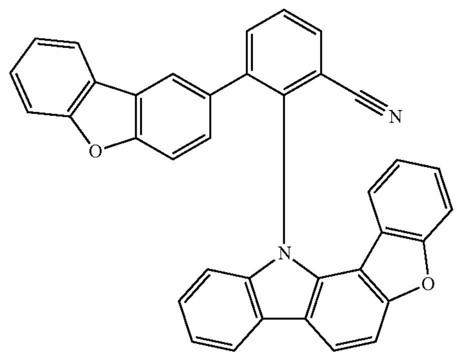
460
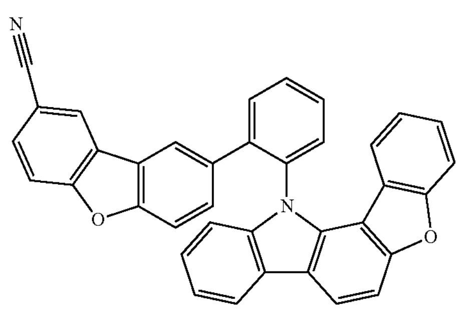
461
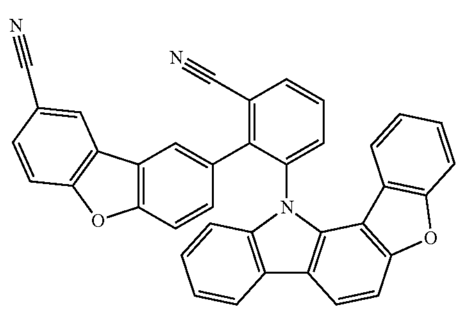

-continued
462
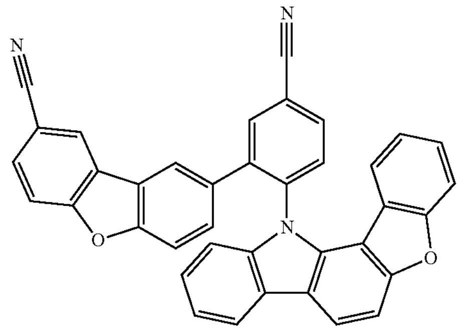
463
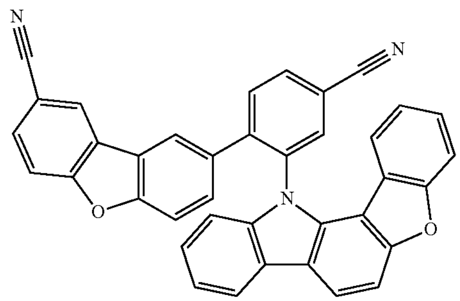
464
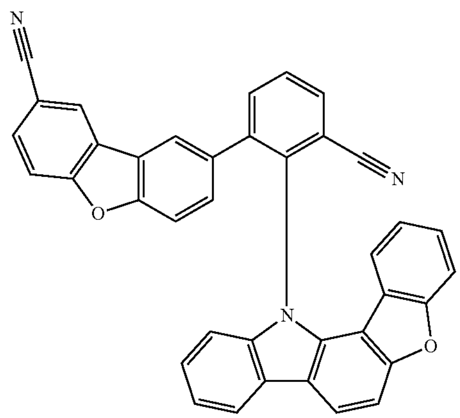
465
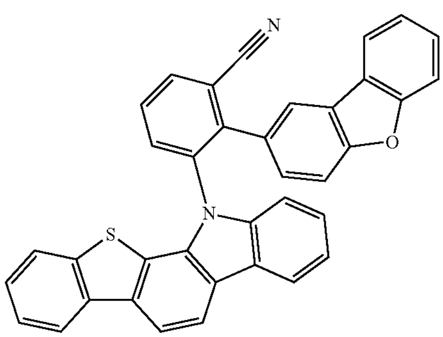
-continued
466
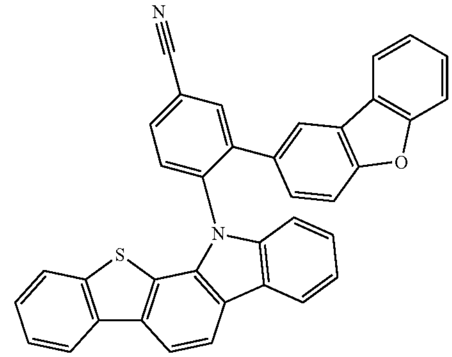
467
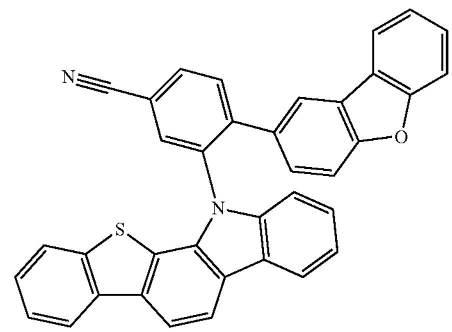
468
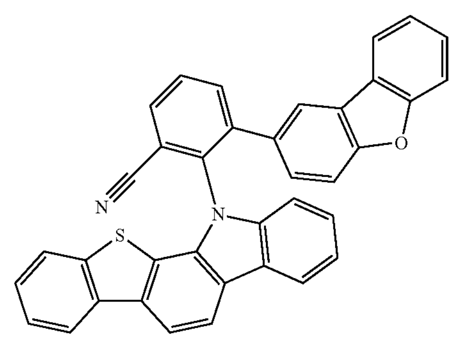
469
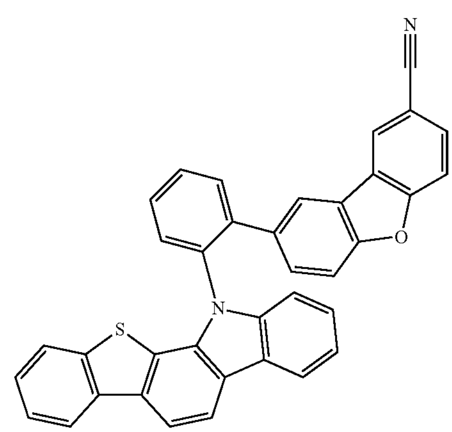

-continued
470
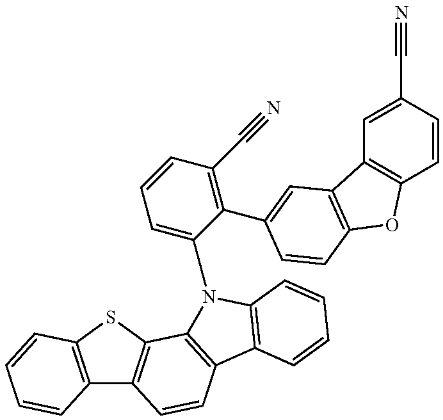
471
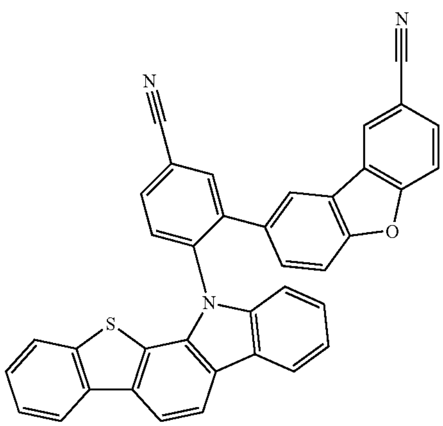
472
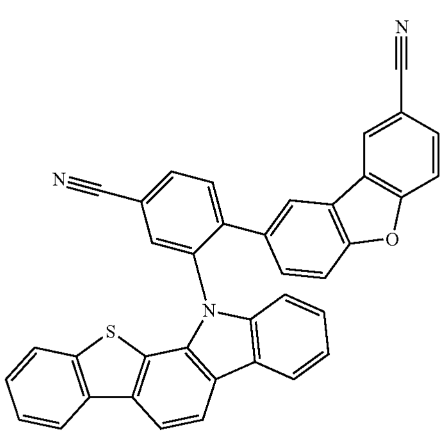
-continued
473
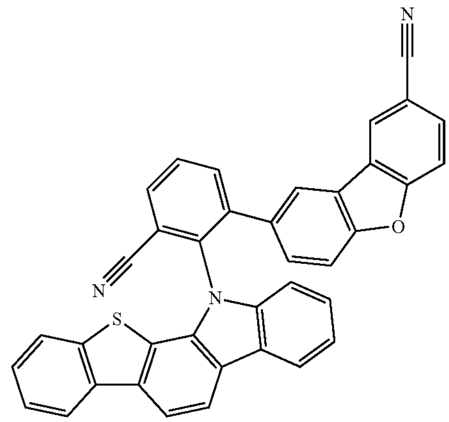
474
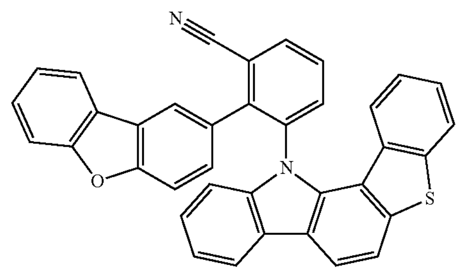
475
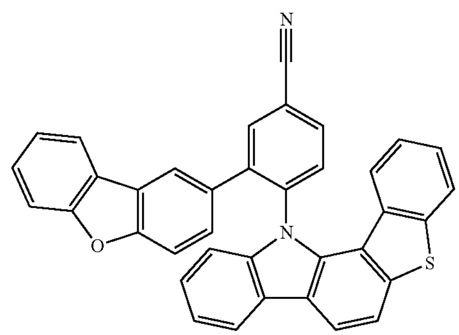
476
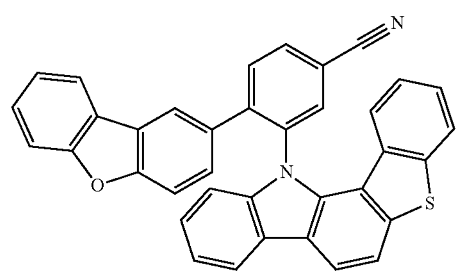
477
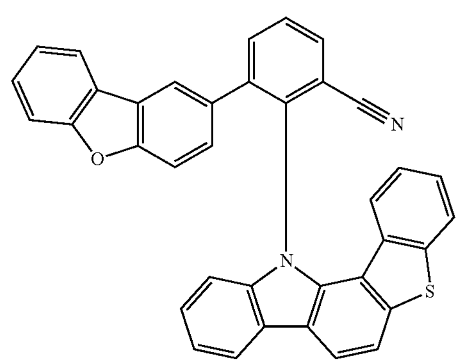

-continued
478
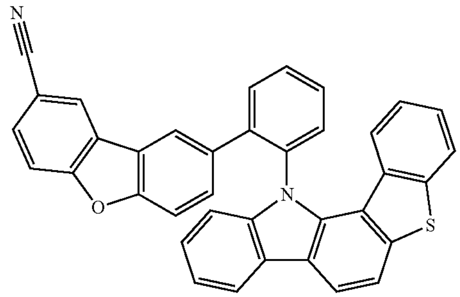
479
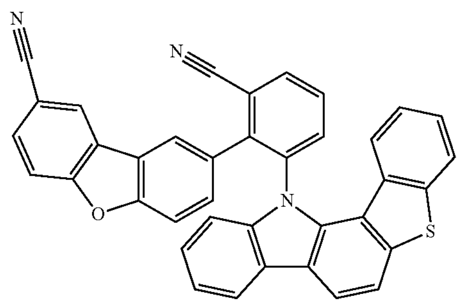
480
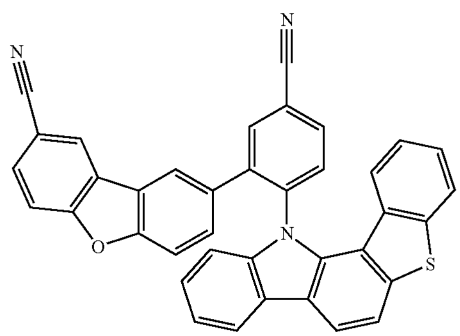
481
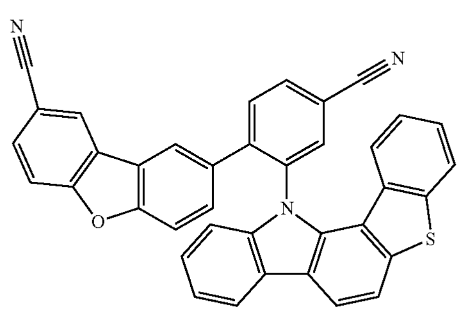
-continued
482
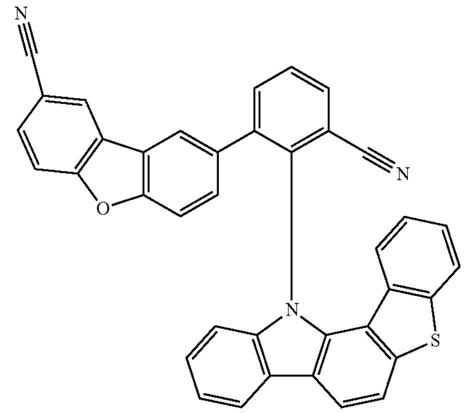
Group HE4
1
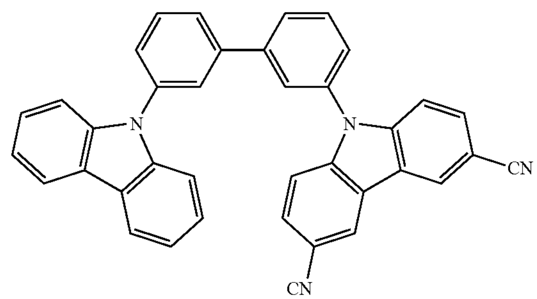
2
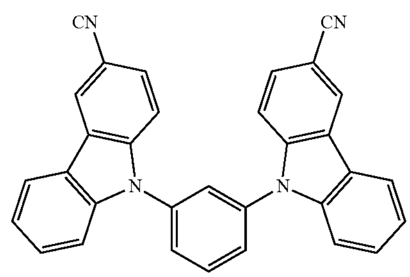
3
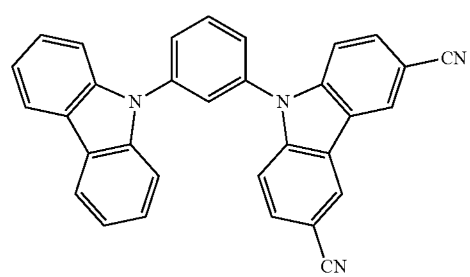
4
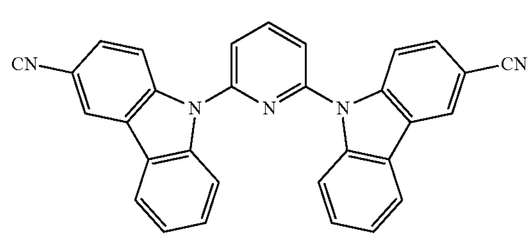

-continued
5
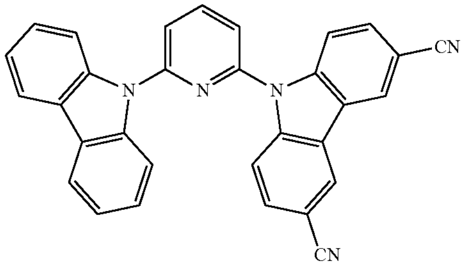
6
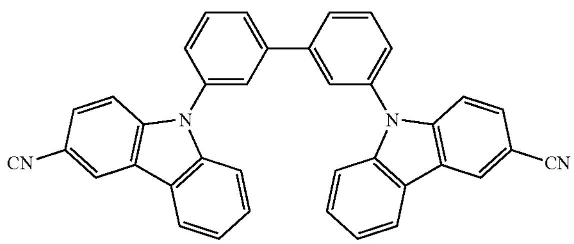
7
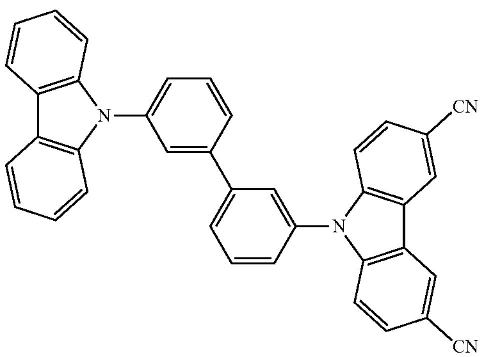
8
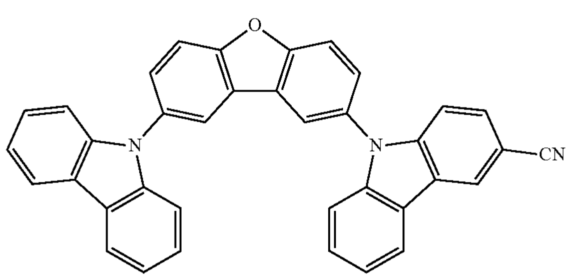
9
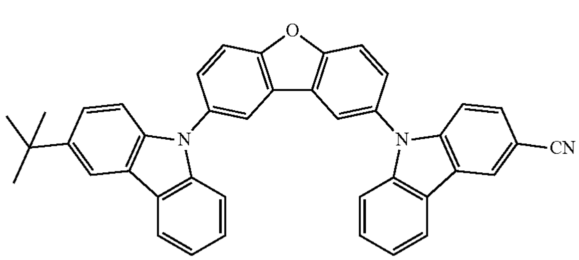
-continued
10
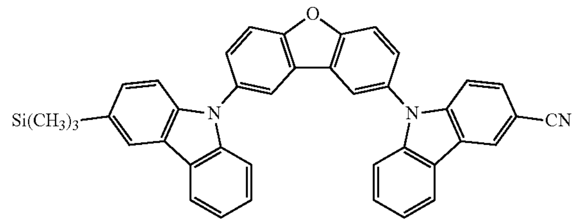
11
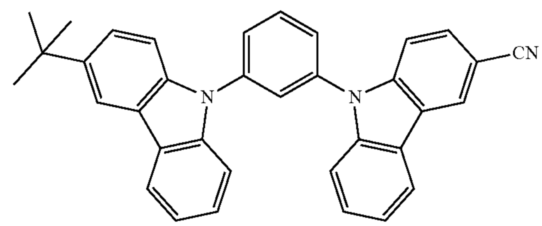
12
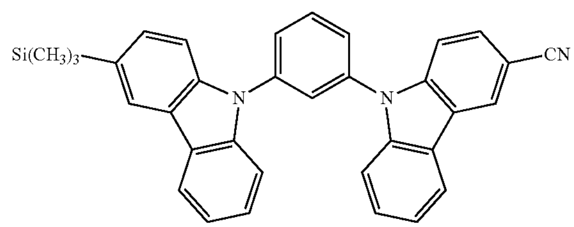
13
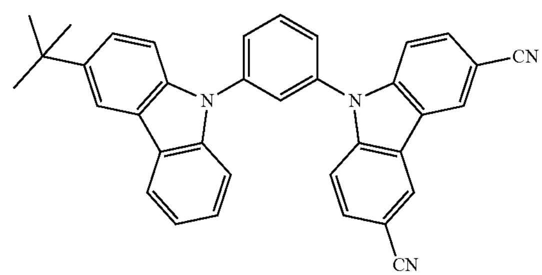
14
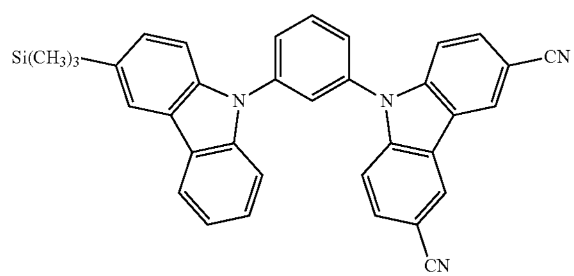
15
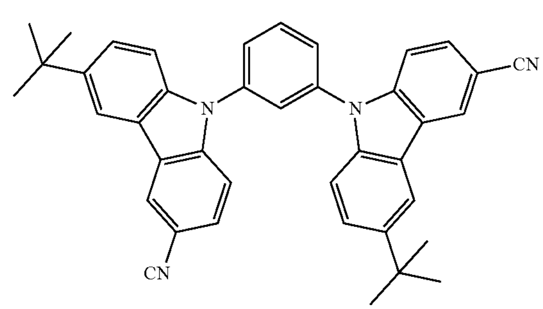

-continued
16
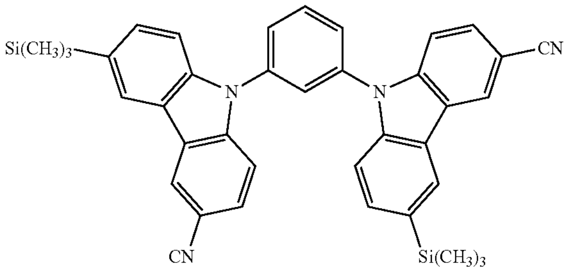
17
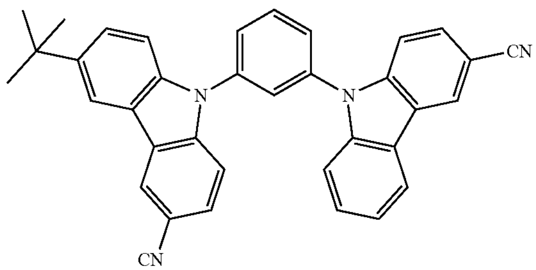
18
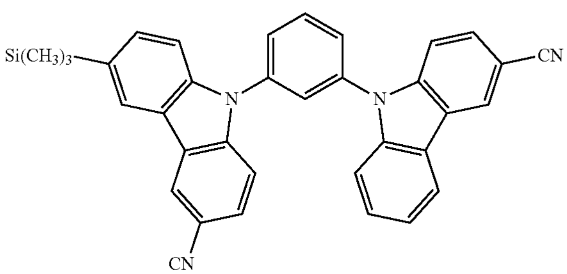
19
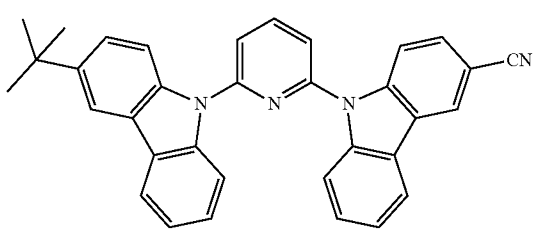
20
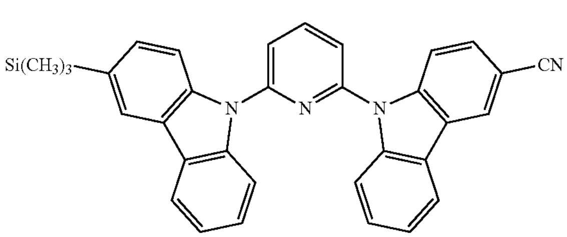
-continued
21
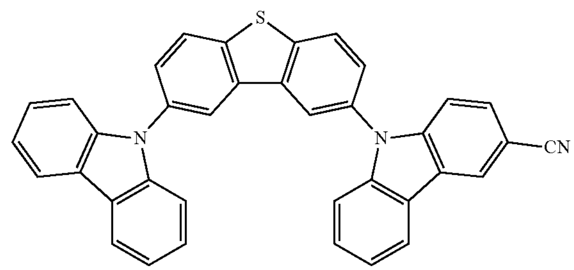
22
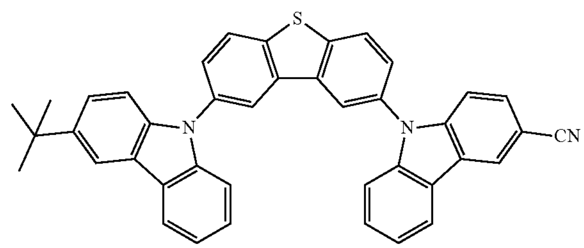
23
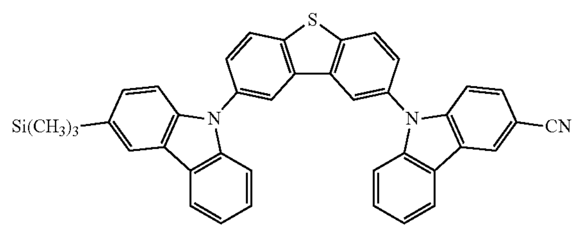
24
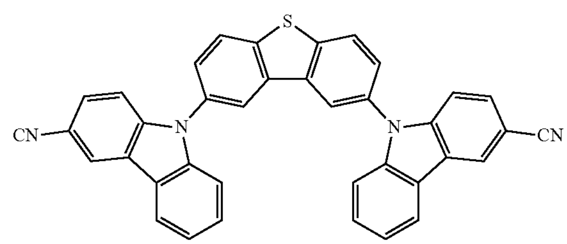
25
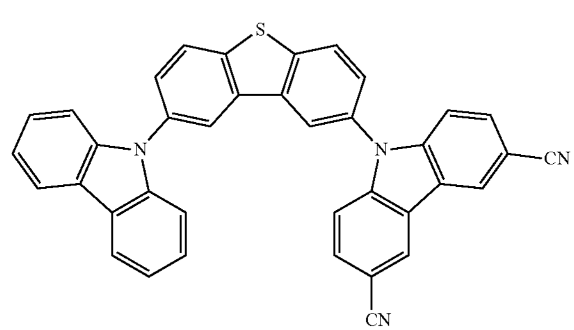

-continued
26
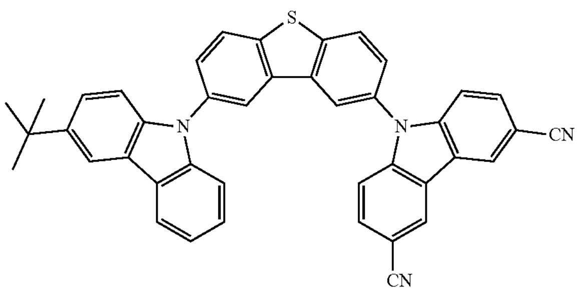
27
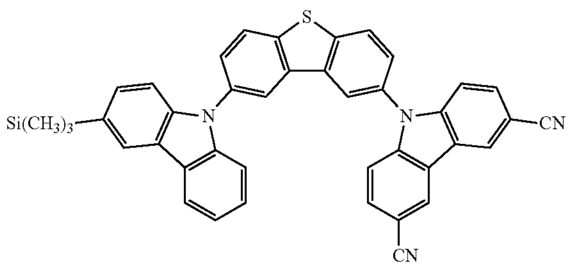
28
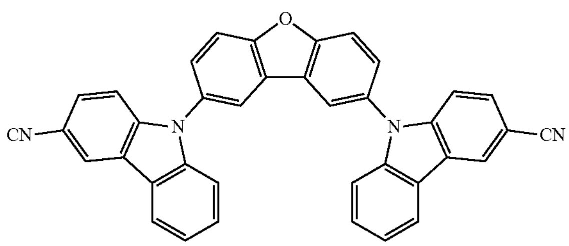
29
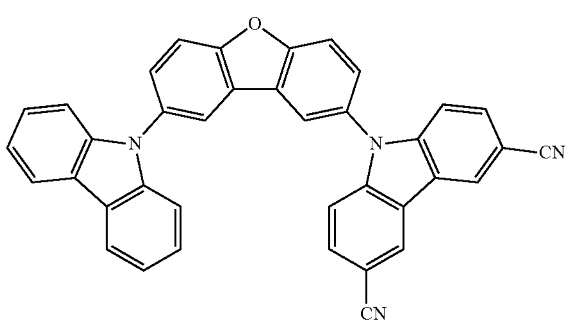
30
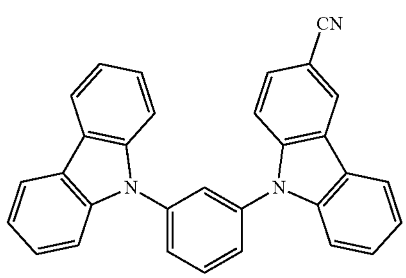
-continued
31
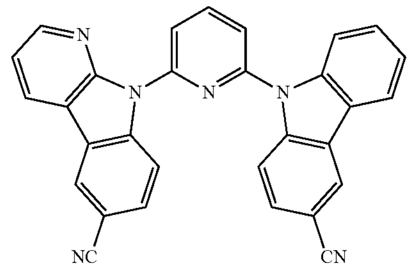
32
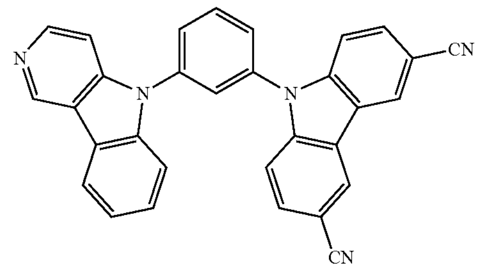
33
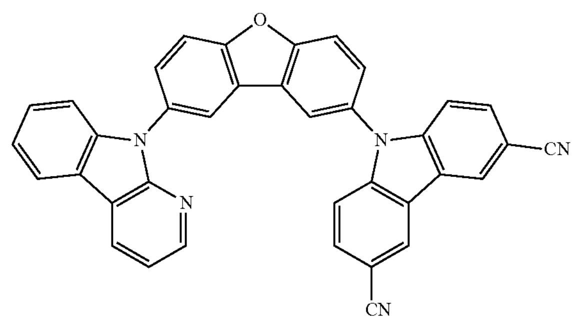
34
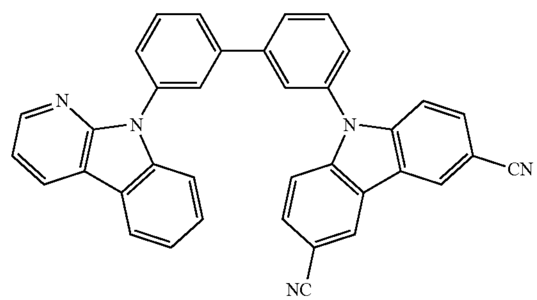
35
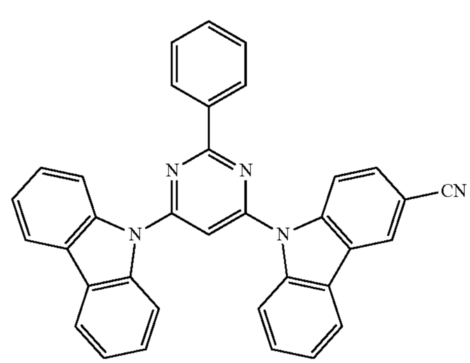

-continued
36
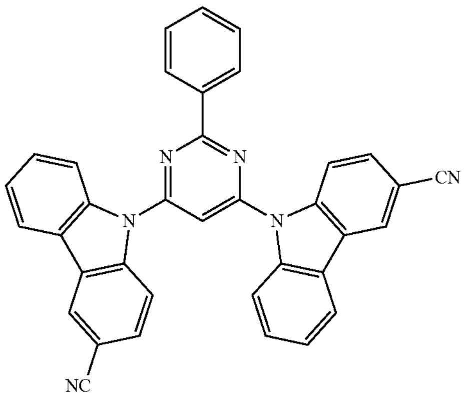
37
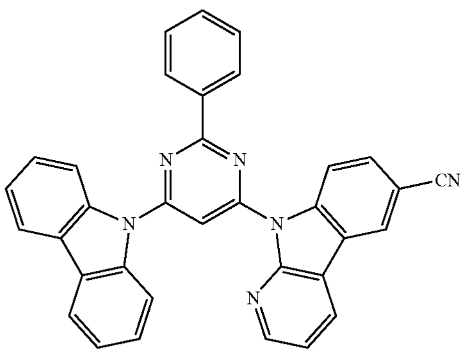
38
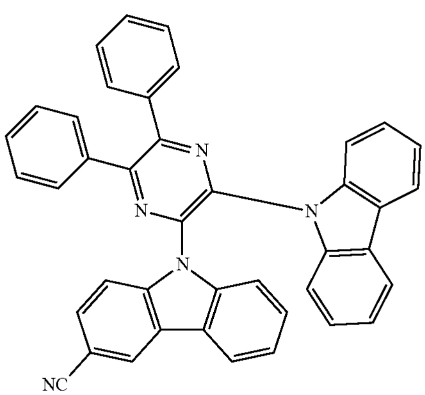
39
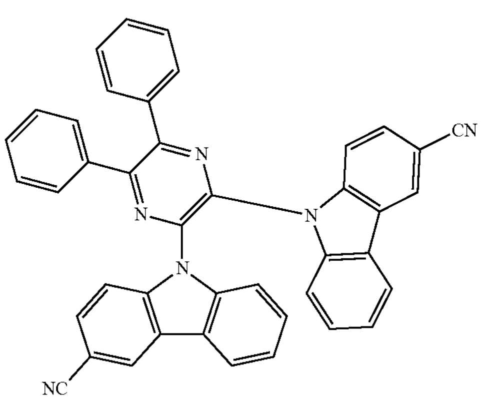
-continued
40
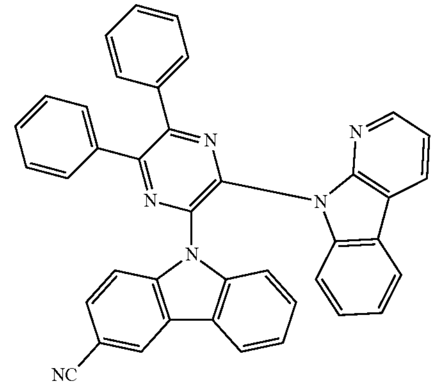
41
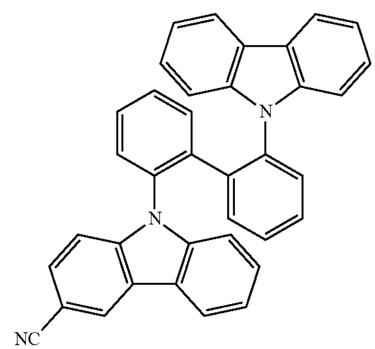
42
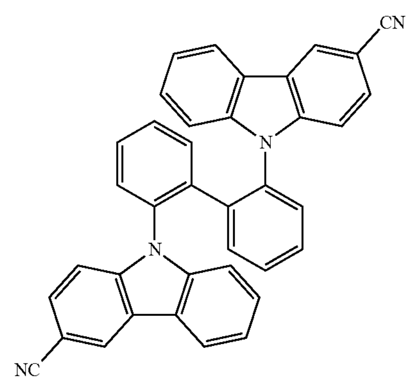
43
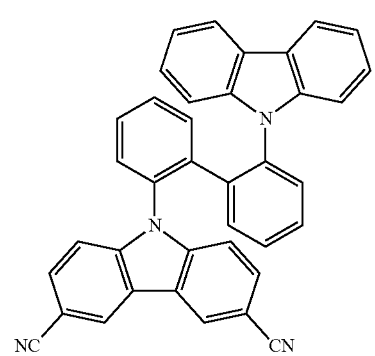

44
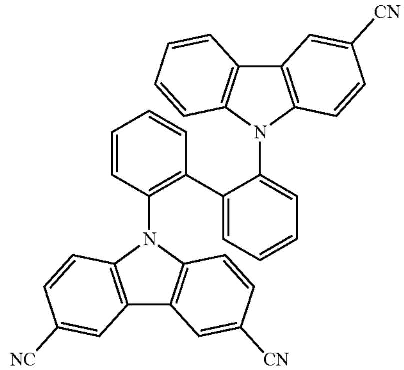
45
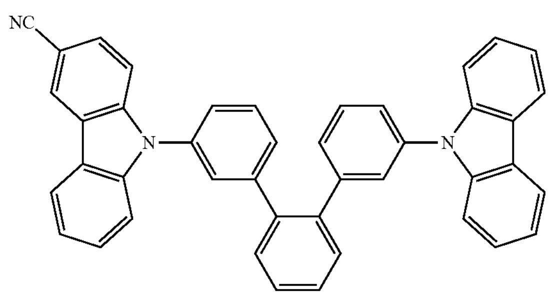
46
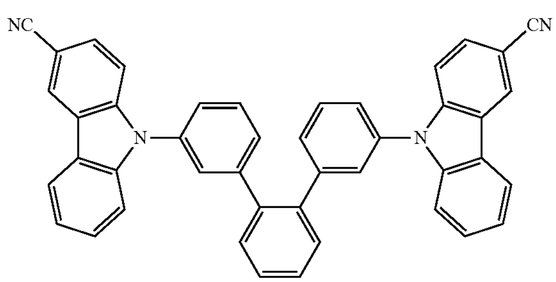
47
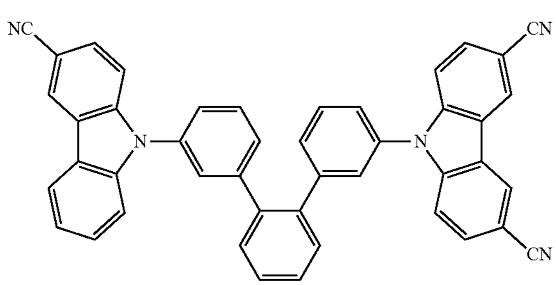
48
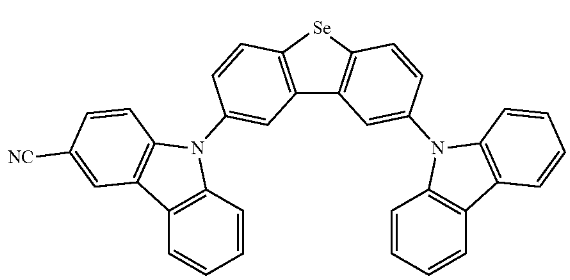
49
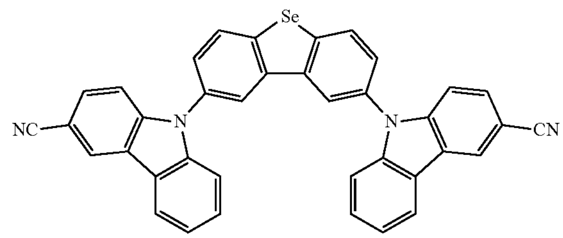
50
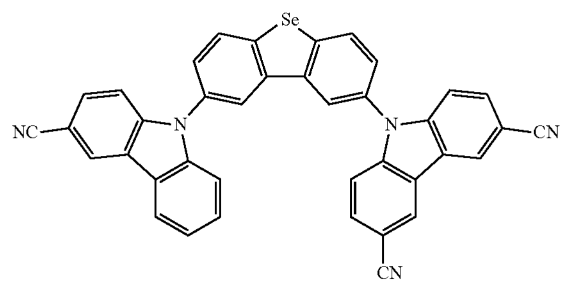
51
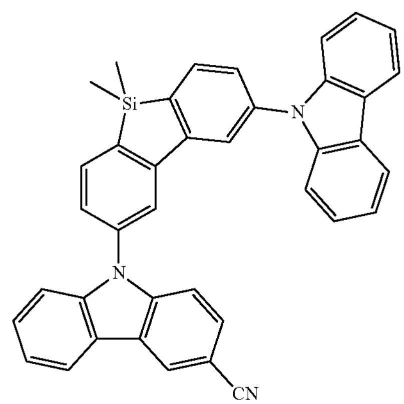
52
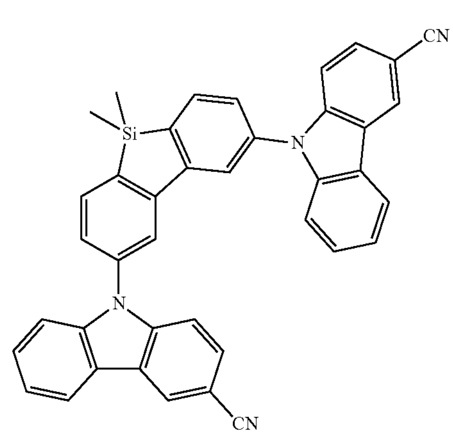

-continued
53
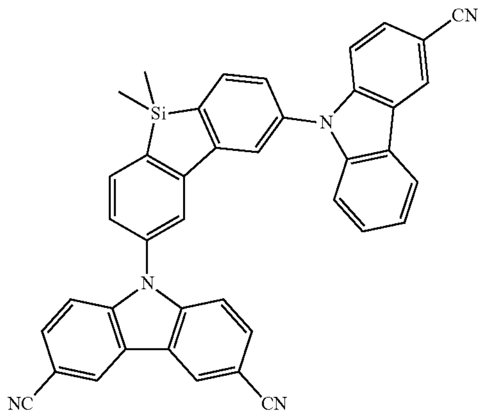
54
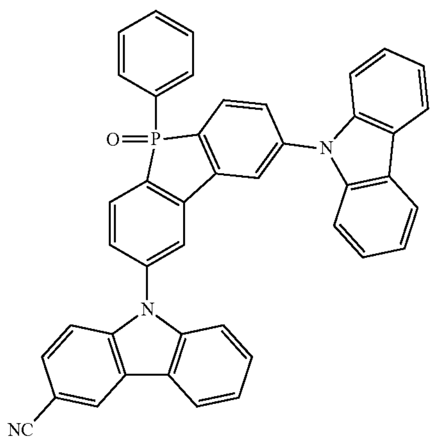
55
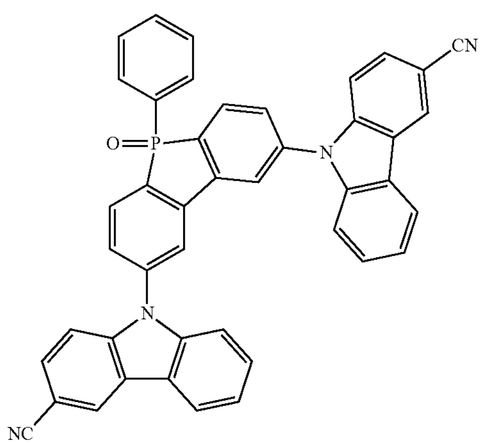
-continued
56
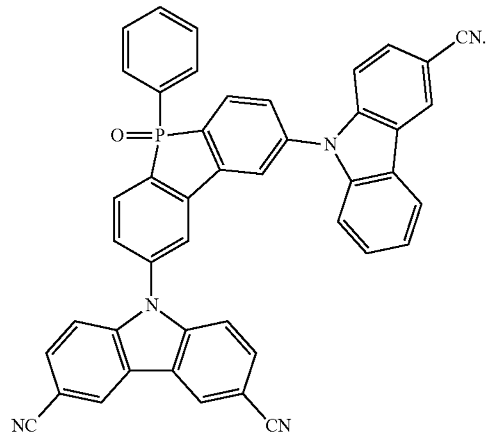
Group HE5
1
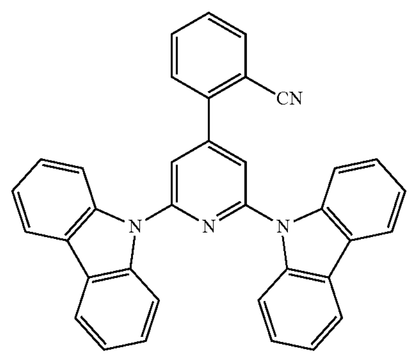
2
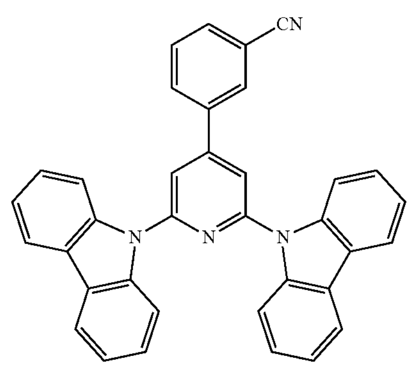

-continued
3
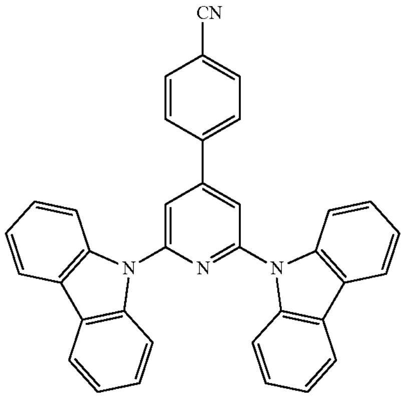
4
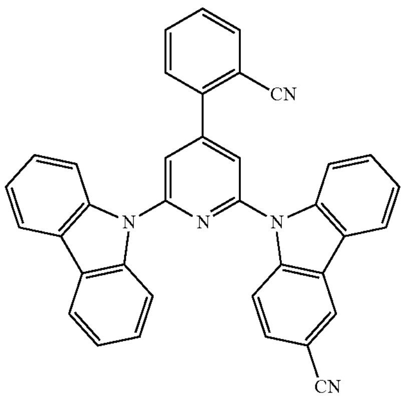
5
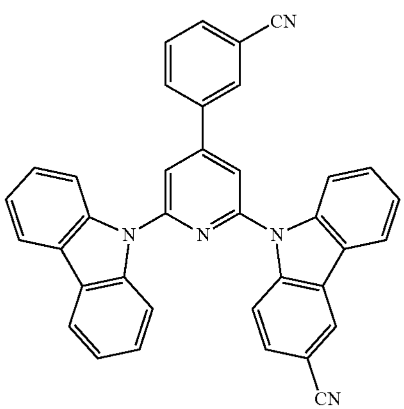
6
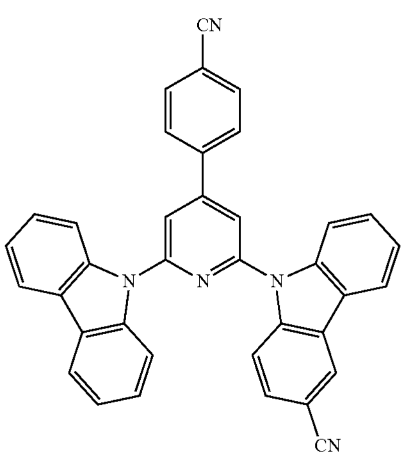
-continued
7
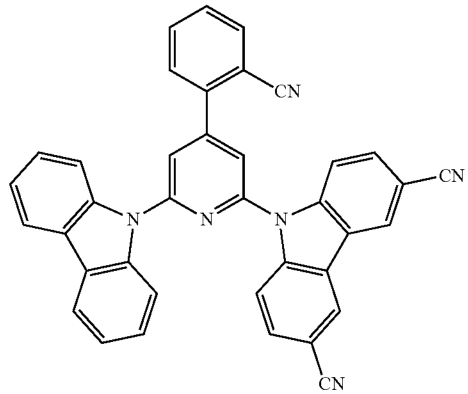
8
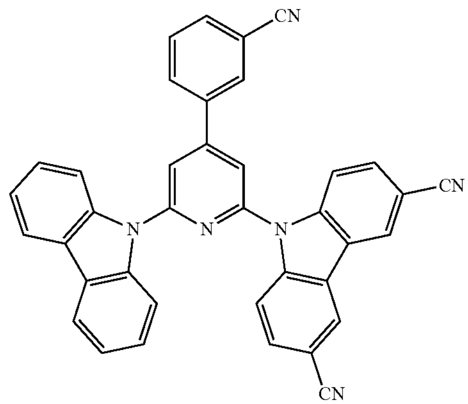
9
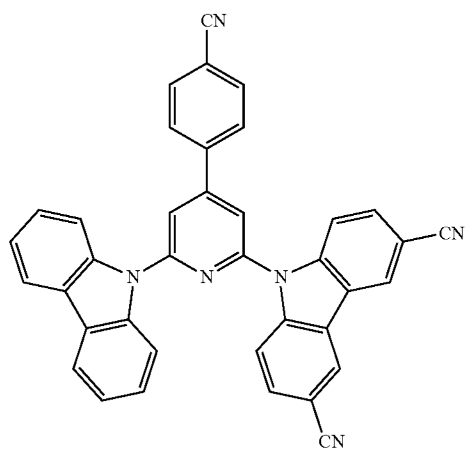
10
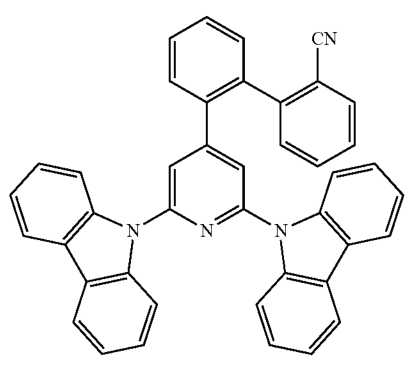

-continued
11
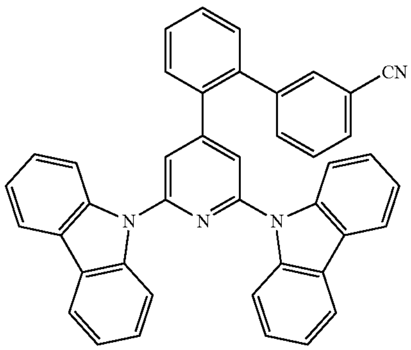
12
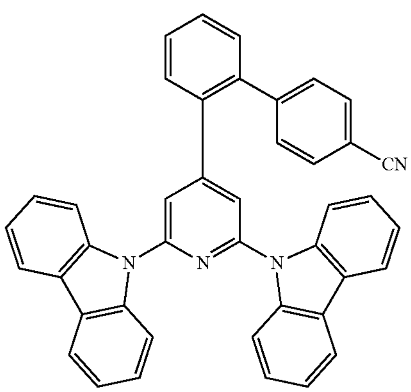
13
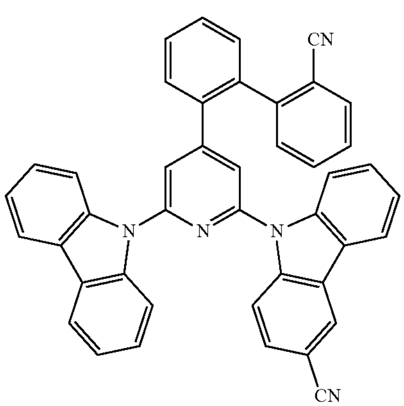
14
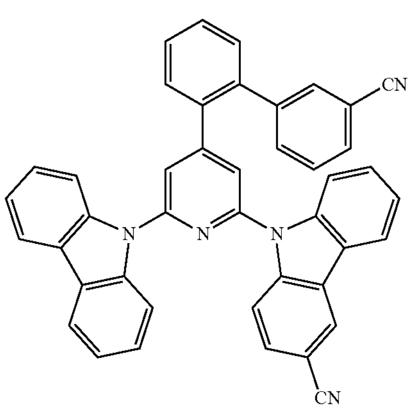
-continued
15
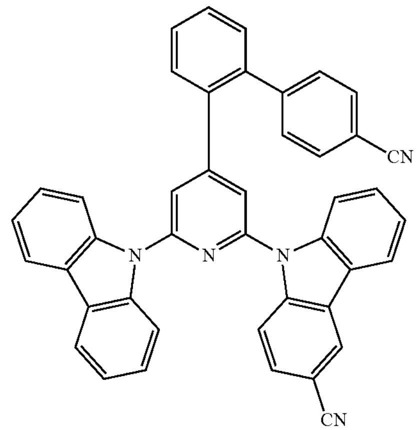
16
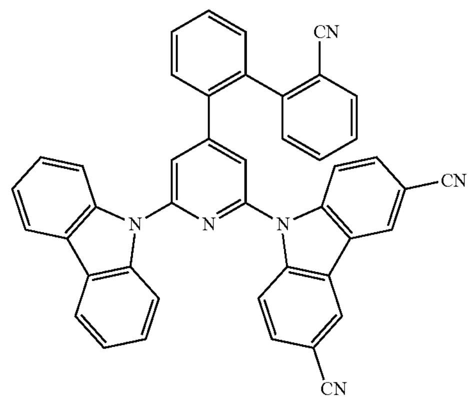
17
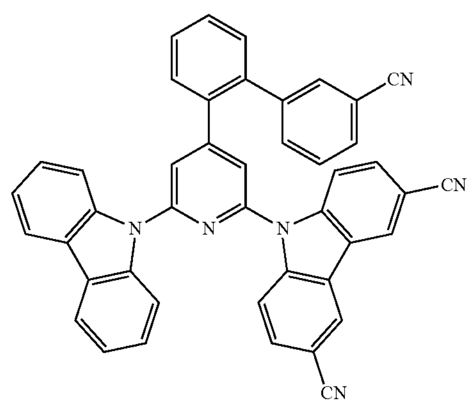
18
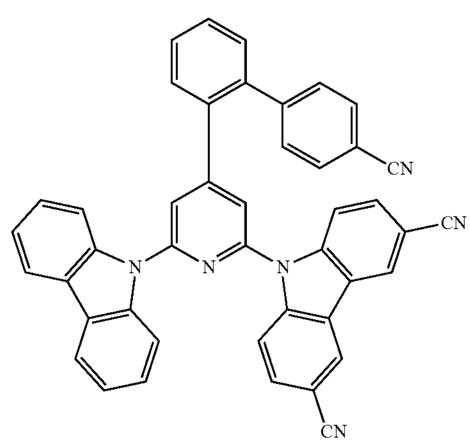

-continued
19
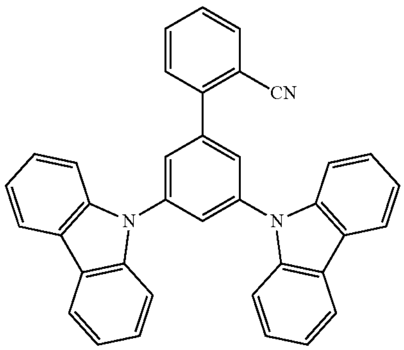
20
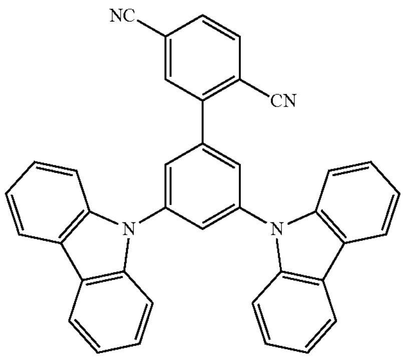
21
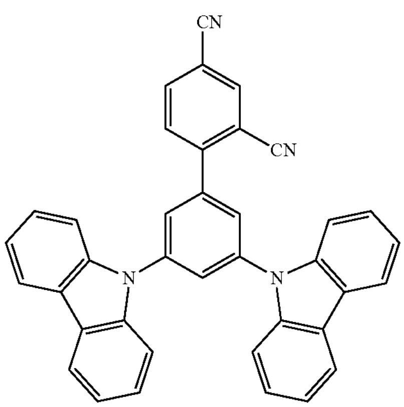
22
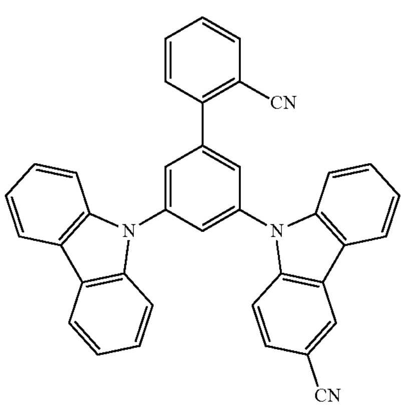
-continued
23
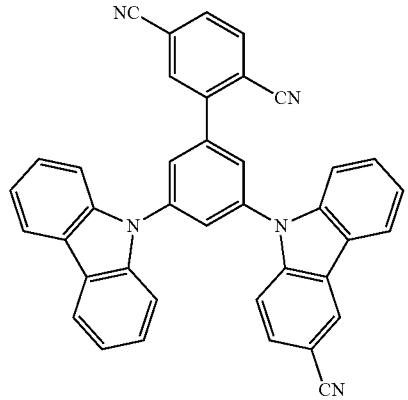
24
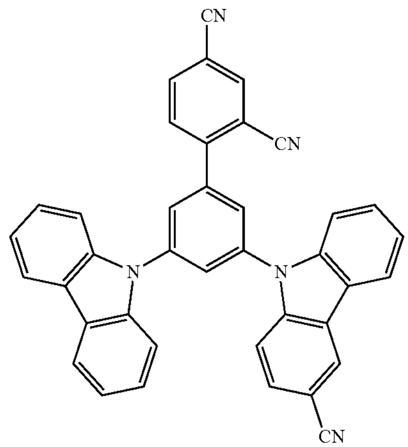
25
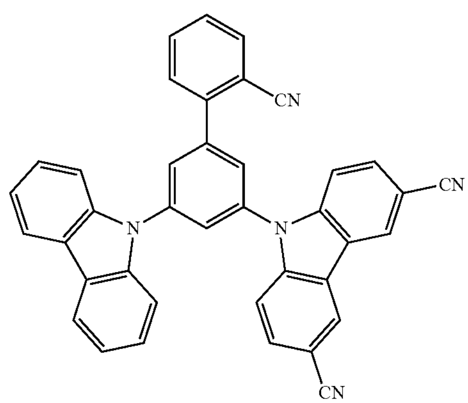
26
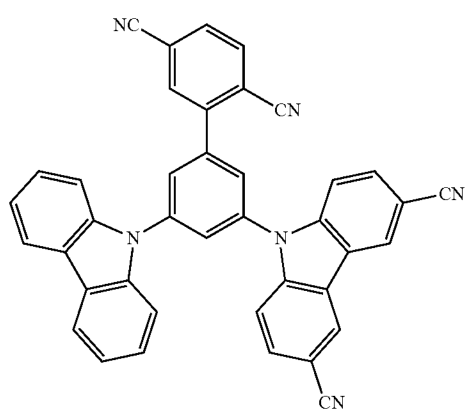

27
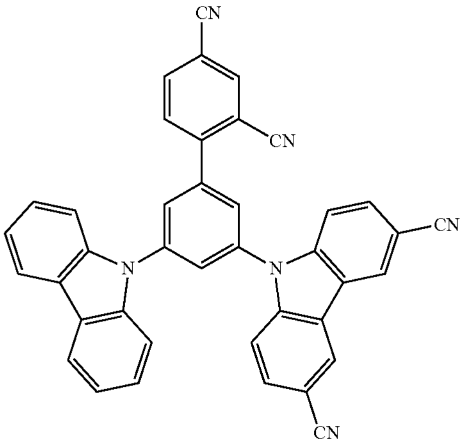
28
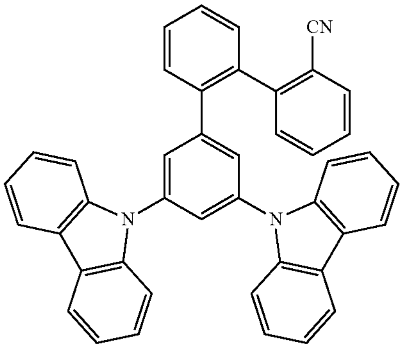
29
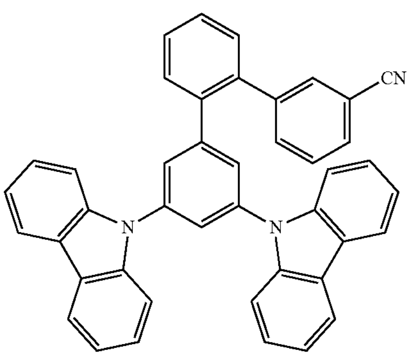
30
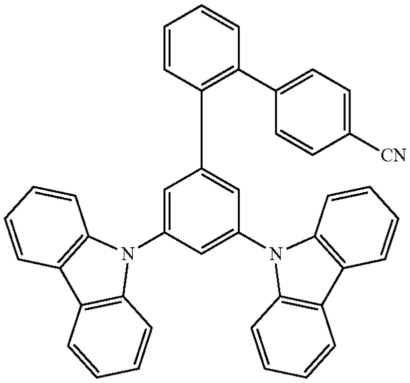
31
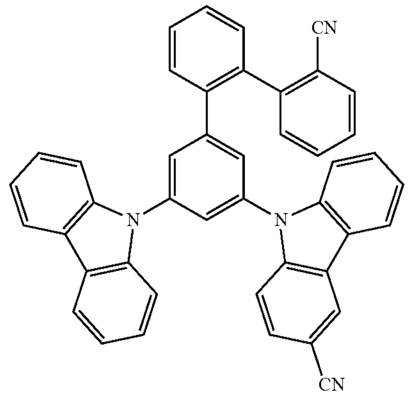
32
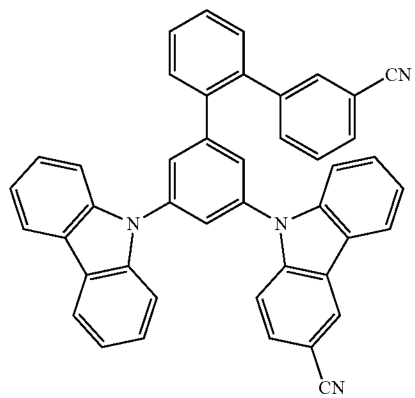
33
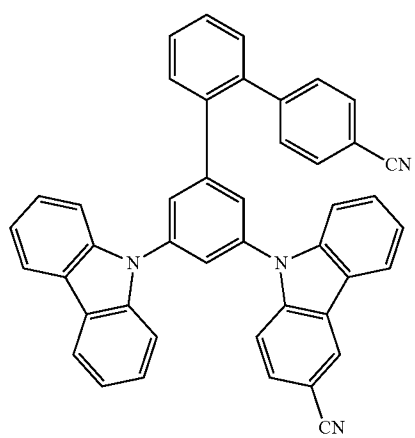
34
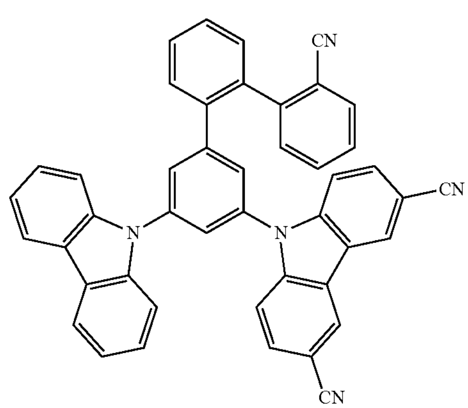

-continued
35
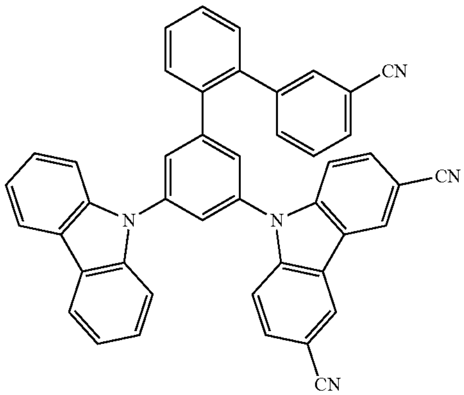
36
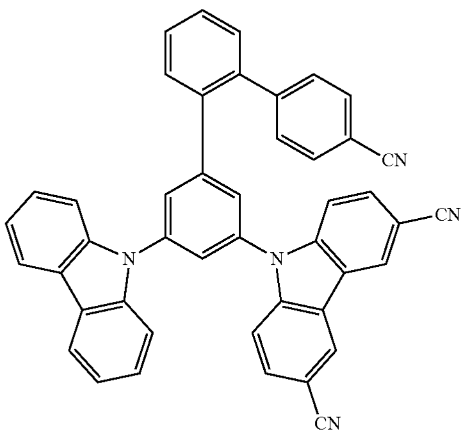
37
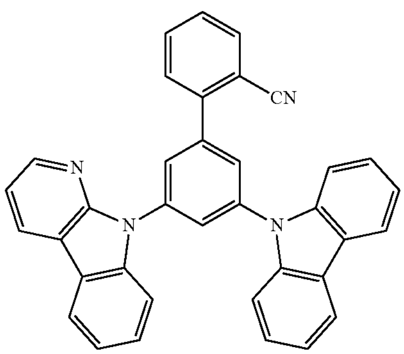
38
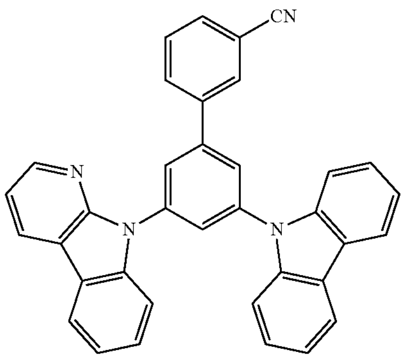
-continued
39
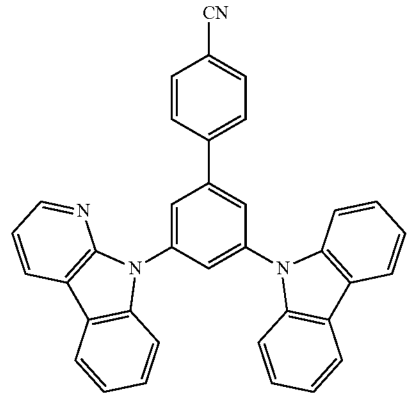
40
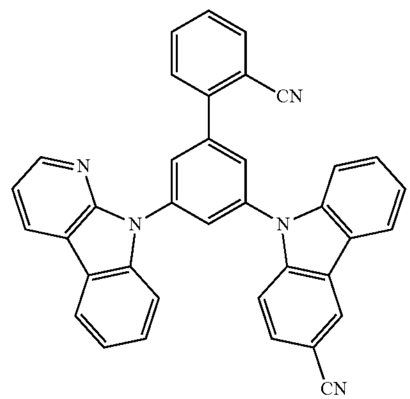
41
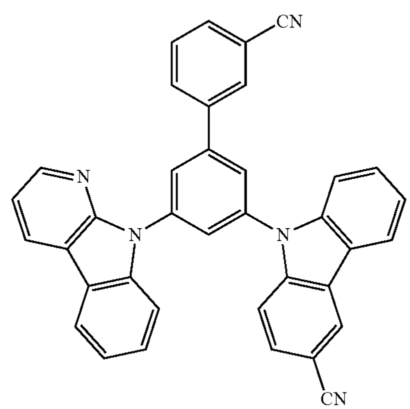
42
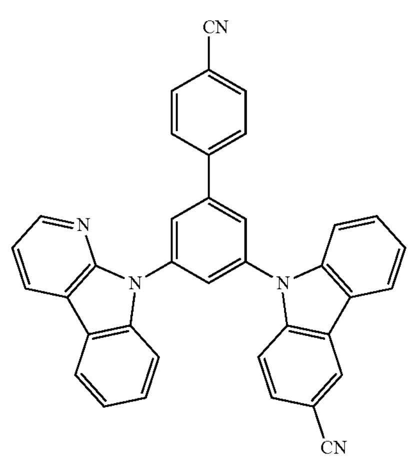

-continued
43
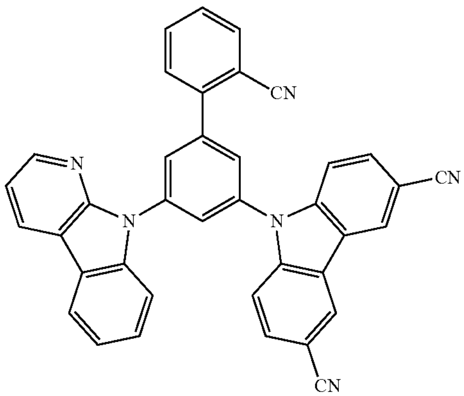
44
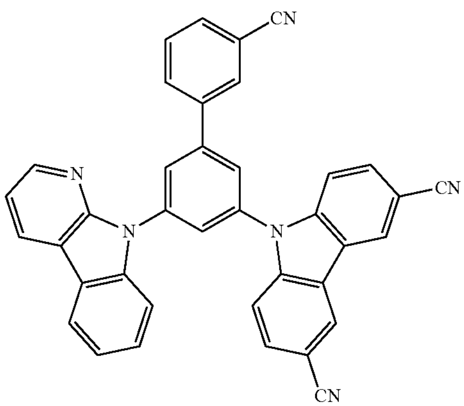
45
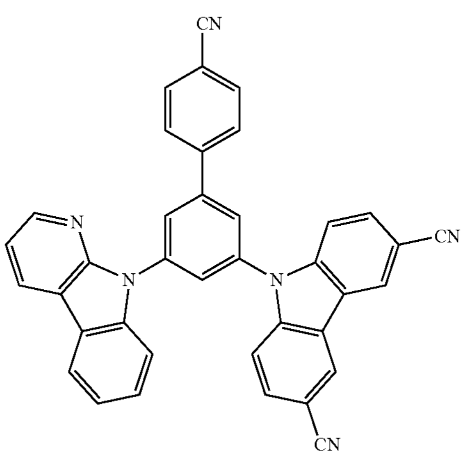
46
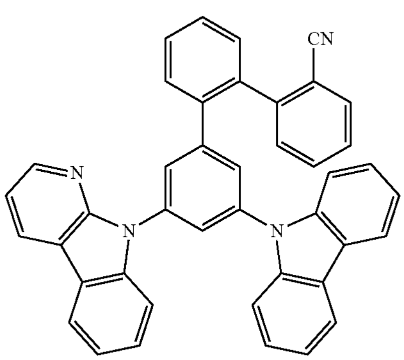
-continued
47
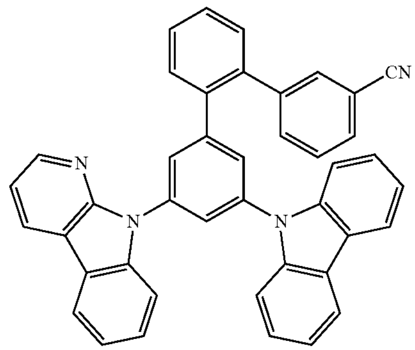
48
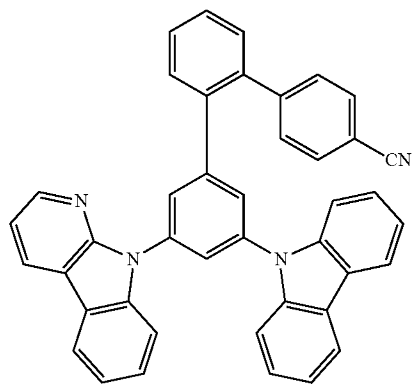
49
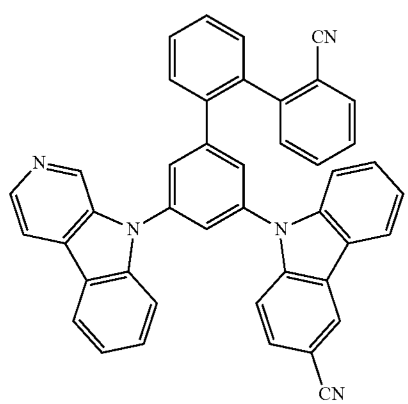
50
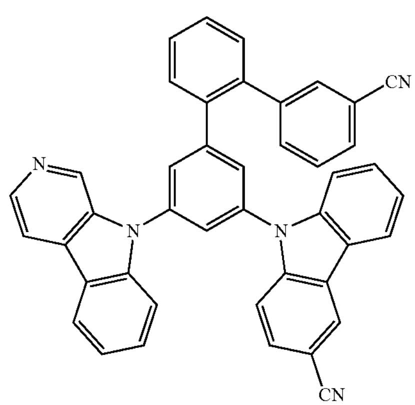

-continued
51
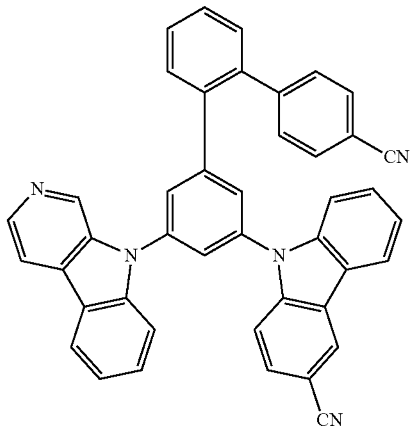
52
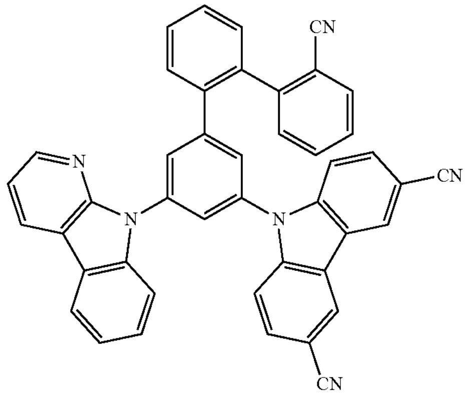
53
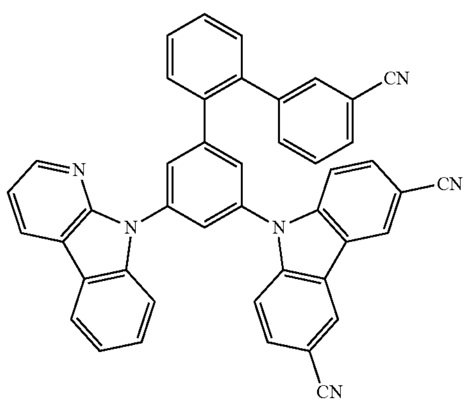
54
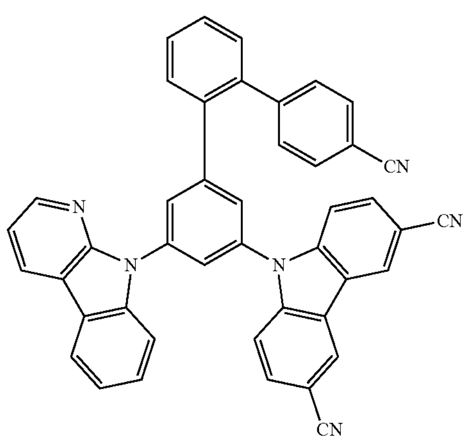
-continued
55
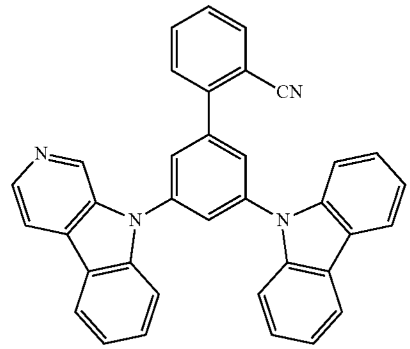
56
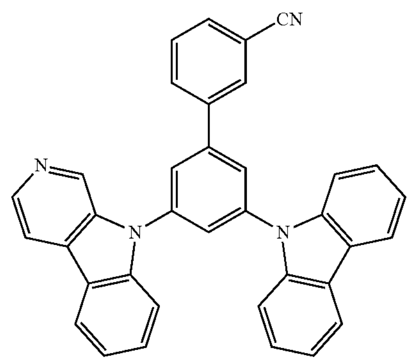
57
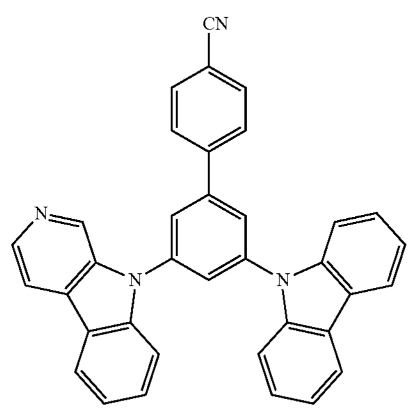
58
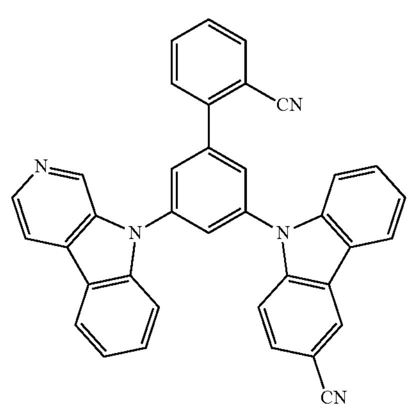

59
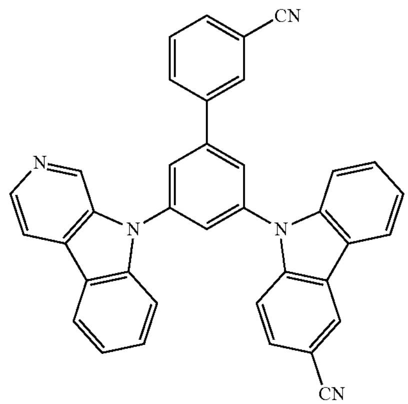
60
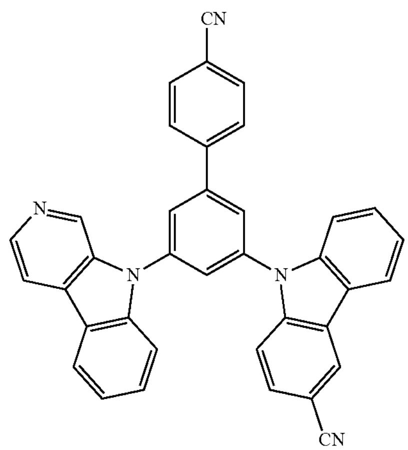
61
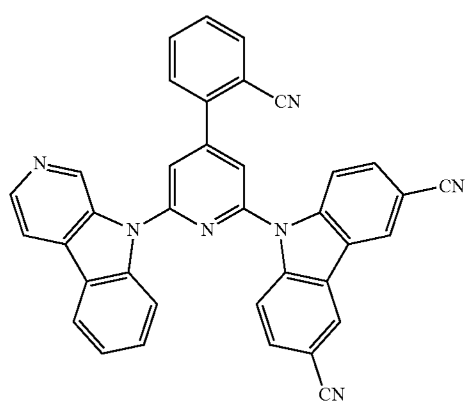
62
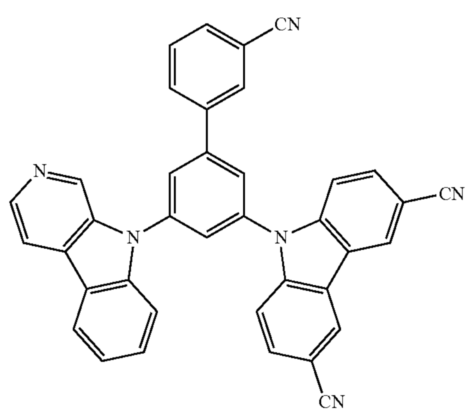
63
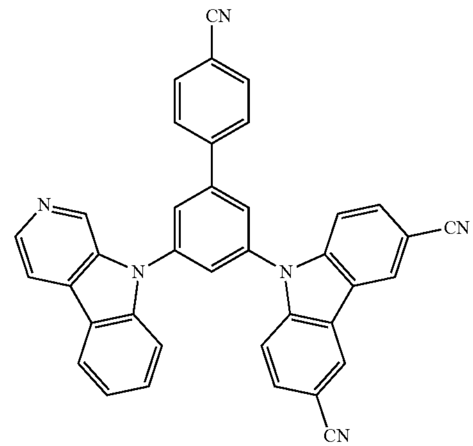
64
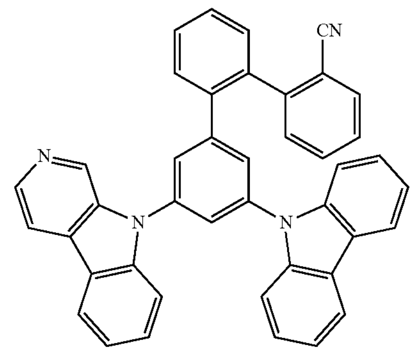
65
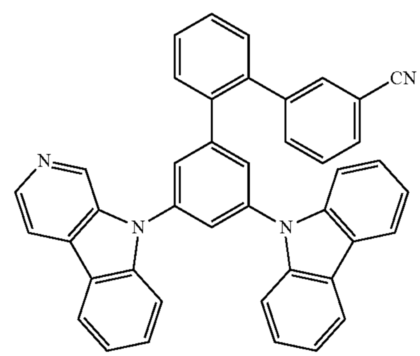
66
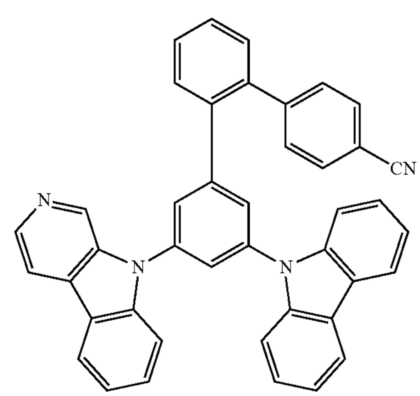

67
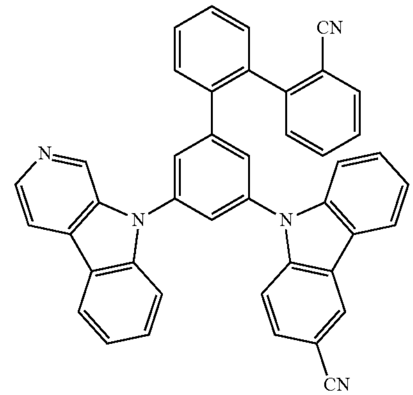
68
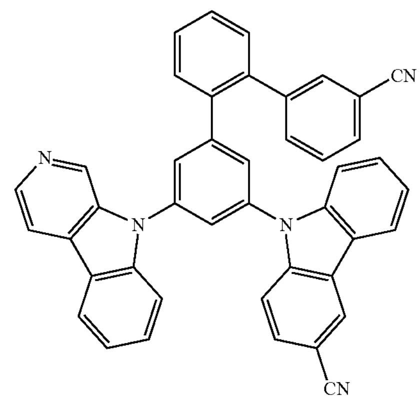
69
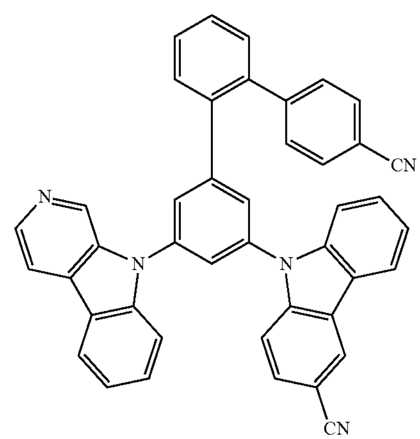
70
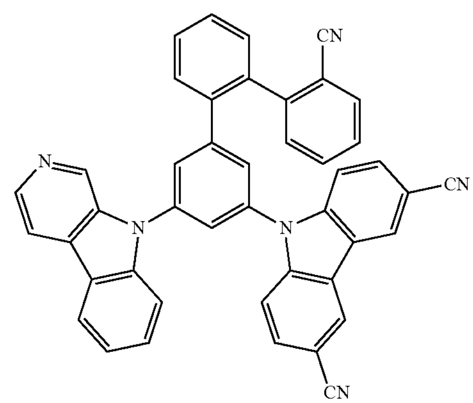
71
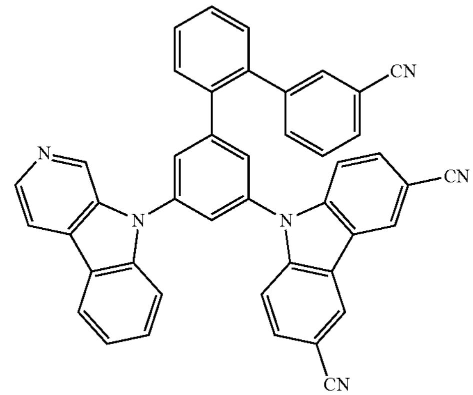
72
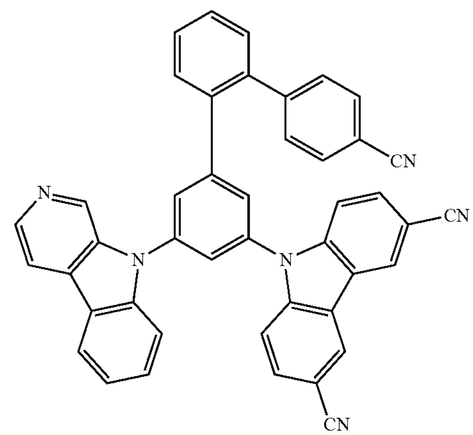
73
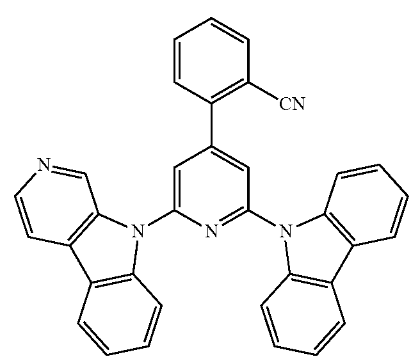
74
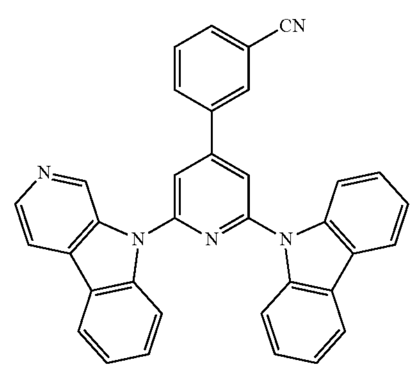

-continued
75
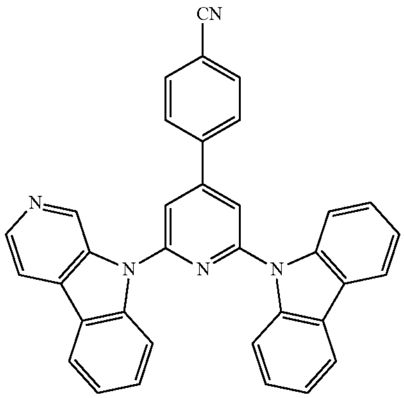
76
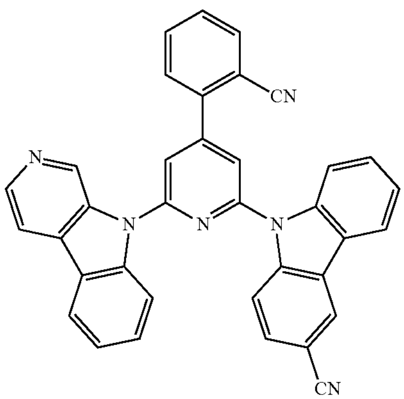
77
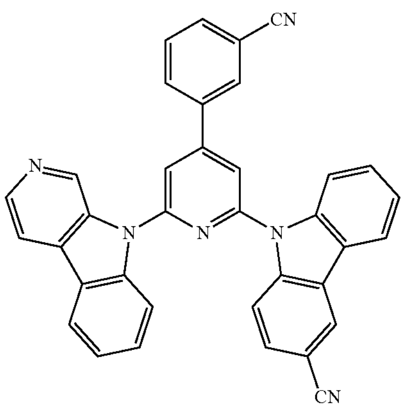
78
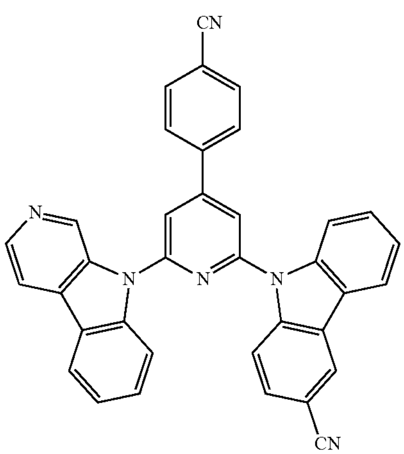
-continued
79
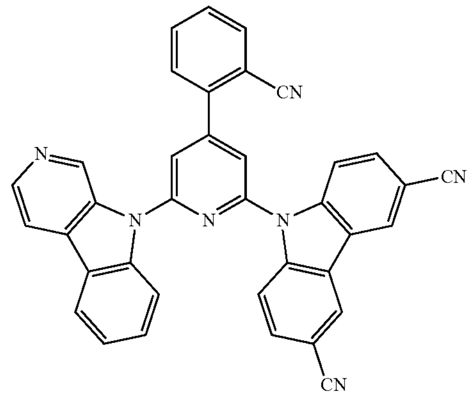
80
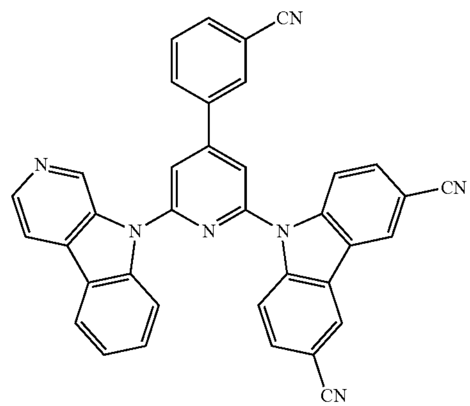
81
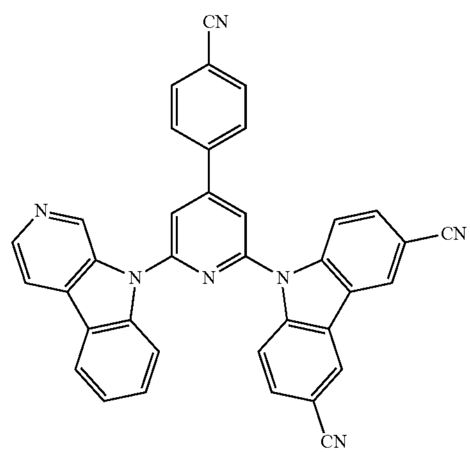
82
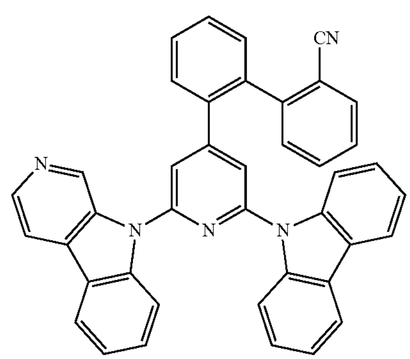

-continued
83
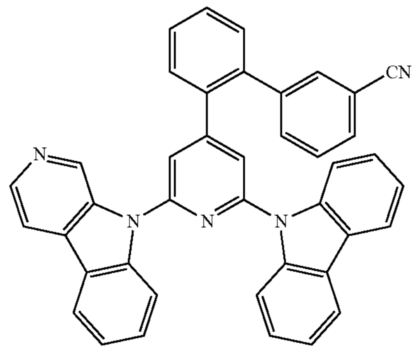
84
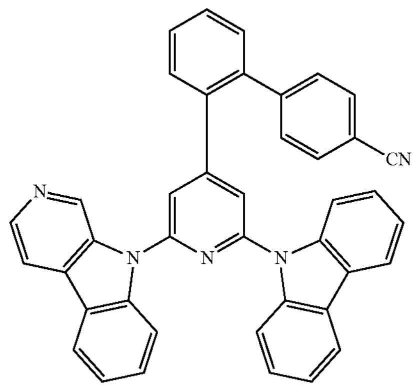
85
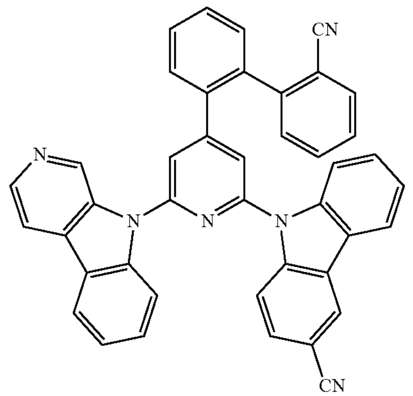
86
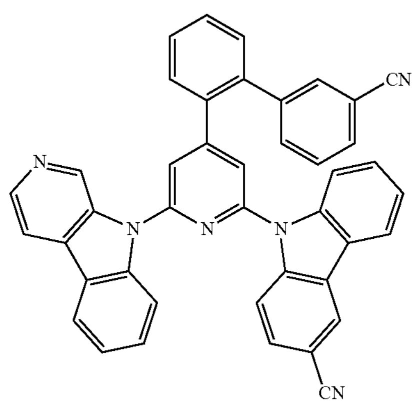
-continued
87
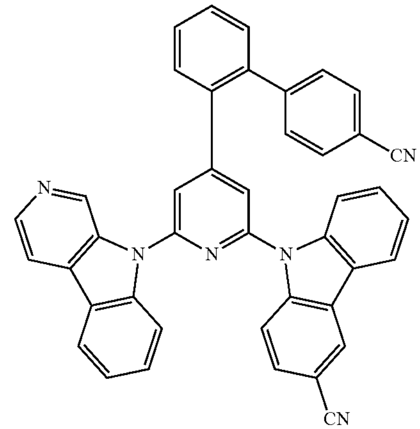
88
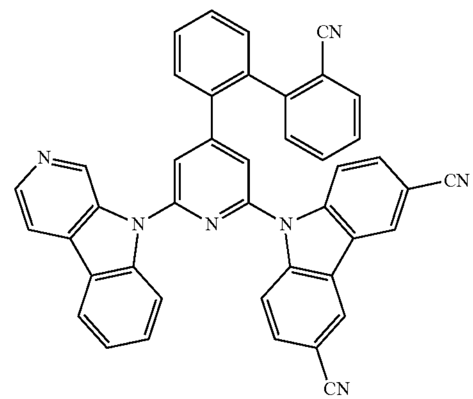
89
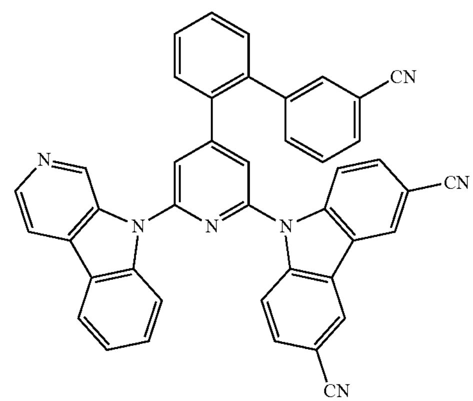
90
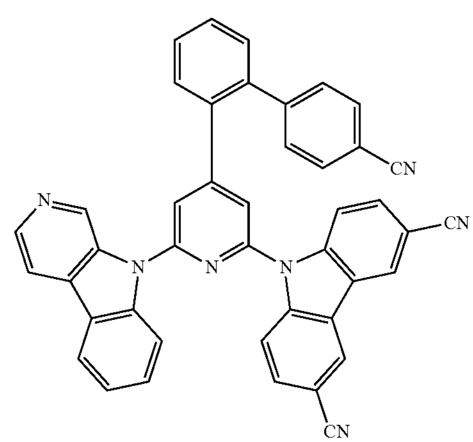

91
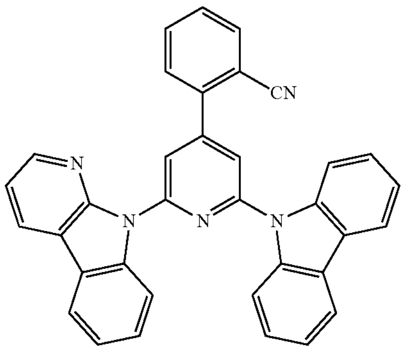
92
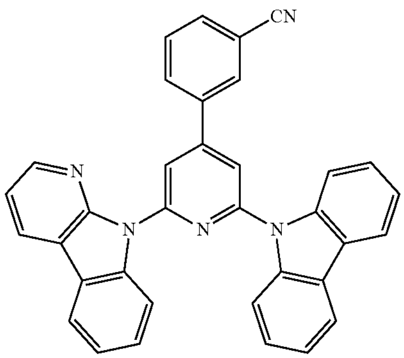
93
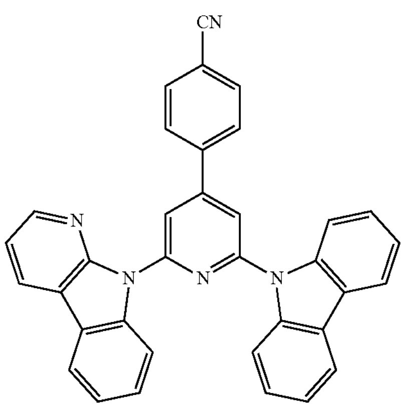
94
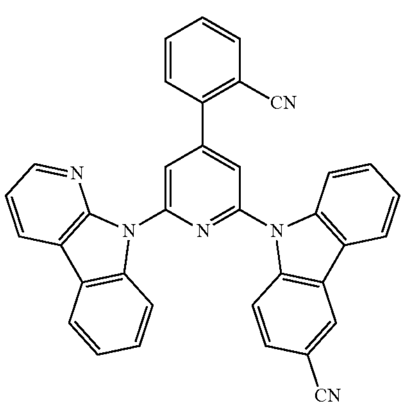
95
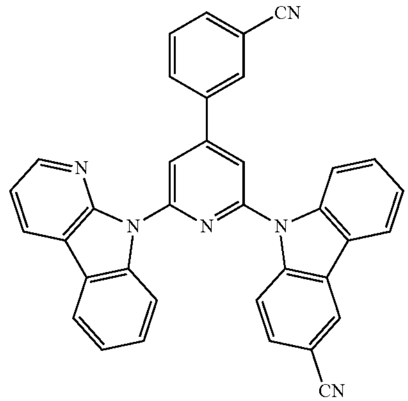
96
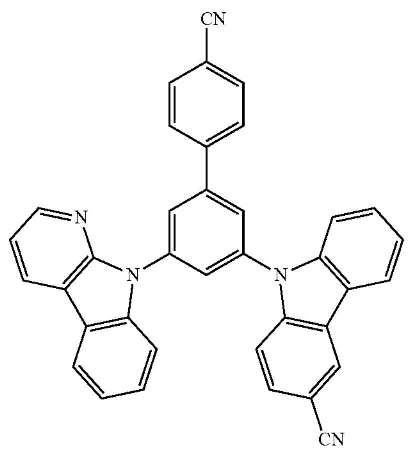
97
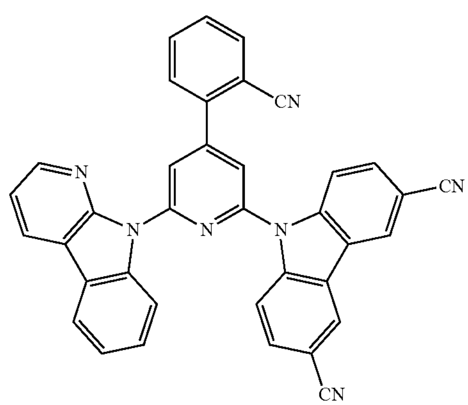
98
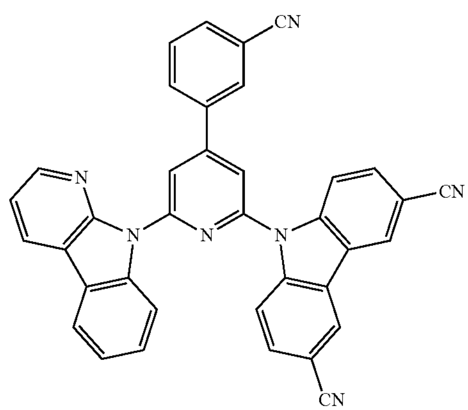

99
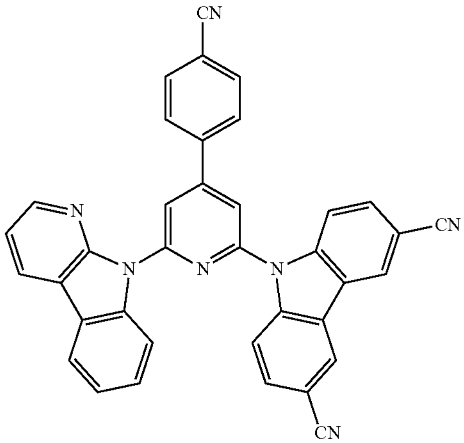
100
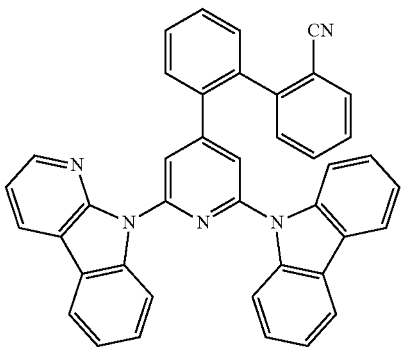
101
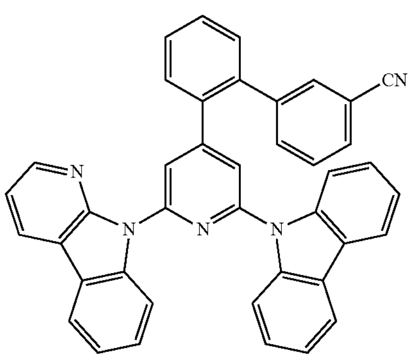
102
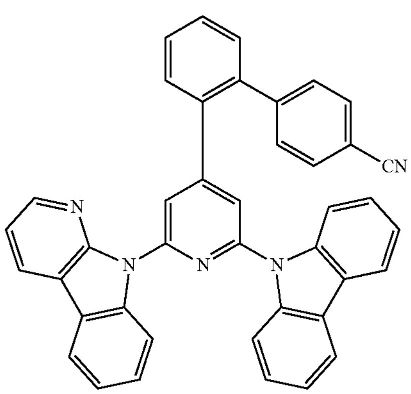
103
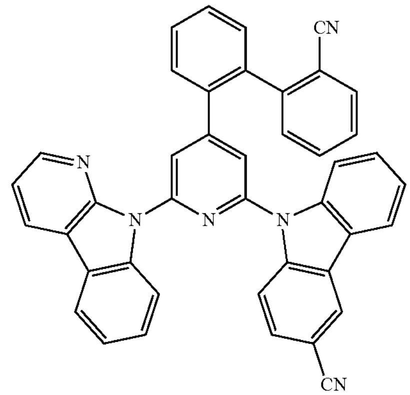
104
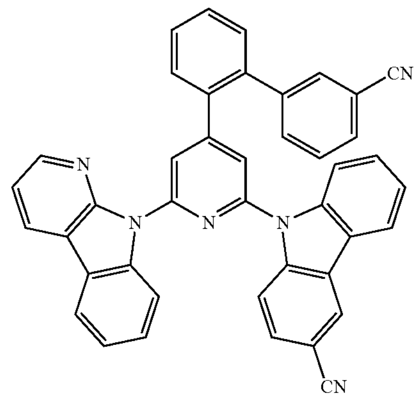
105
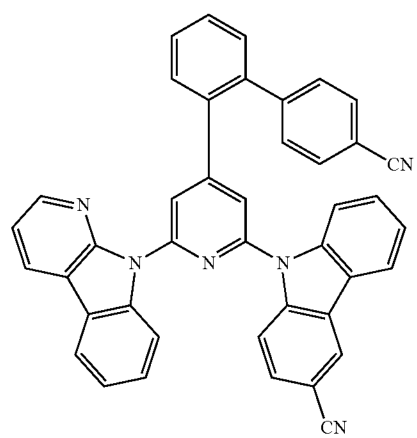
106
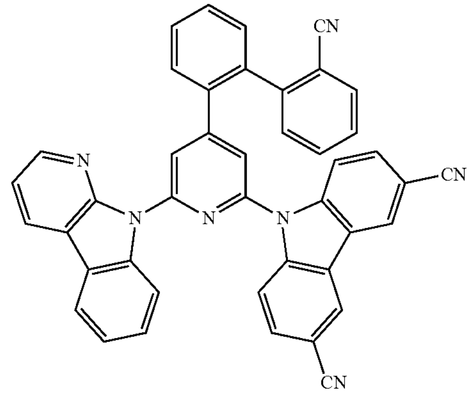

107
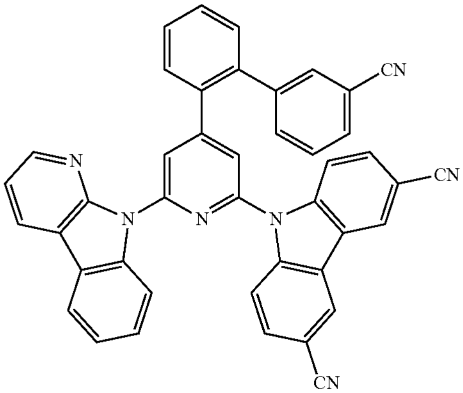
108
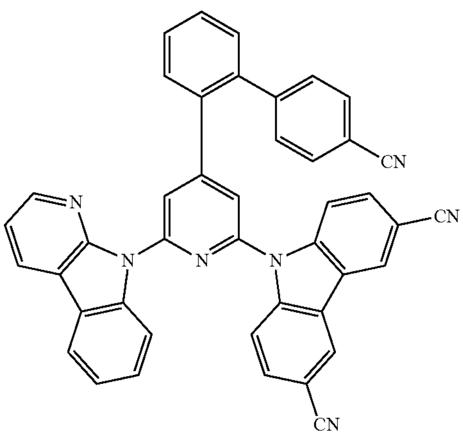
109
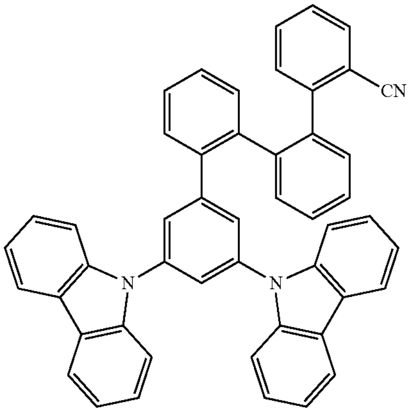
110
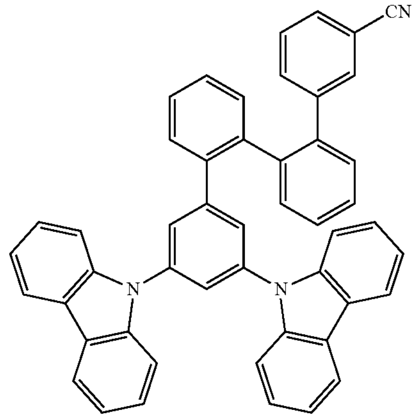
111
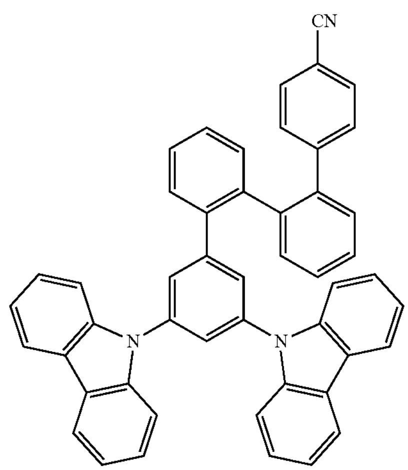
112
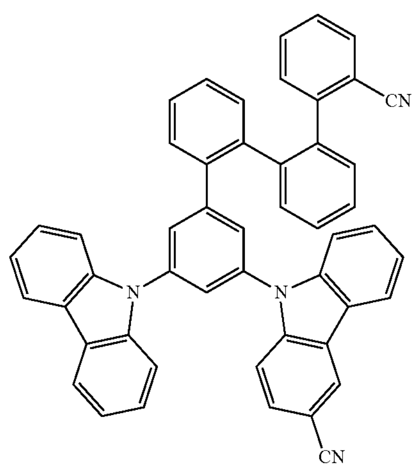

113
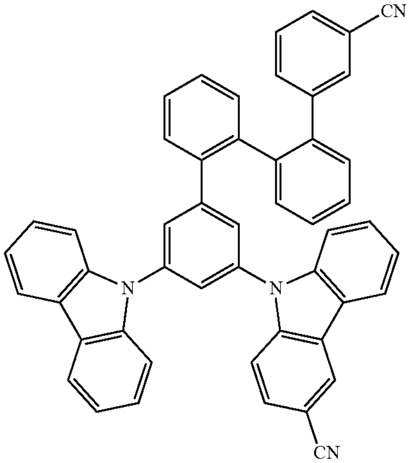
114
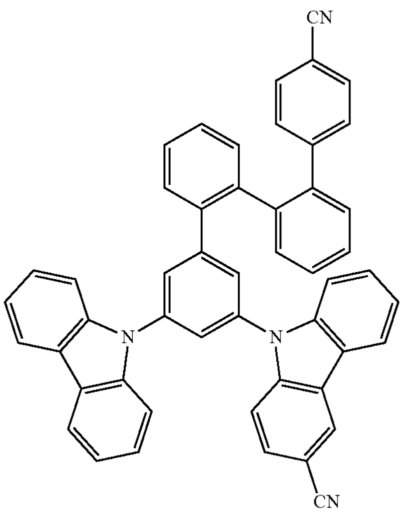
115
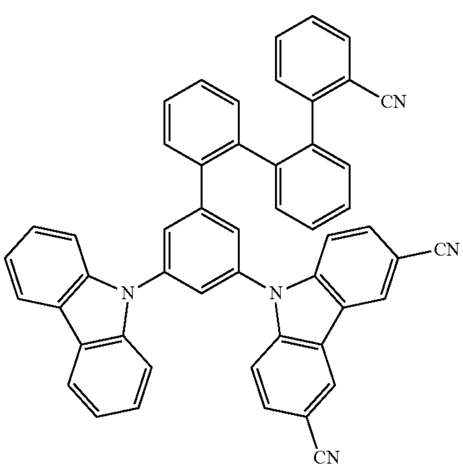
116
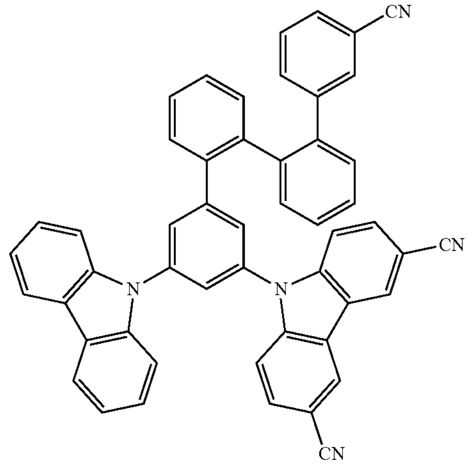
117
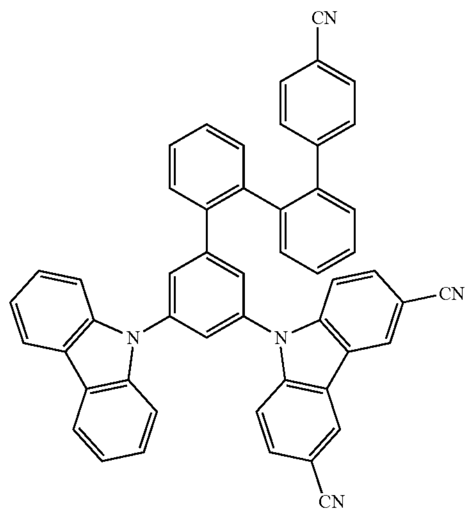
118
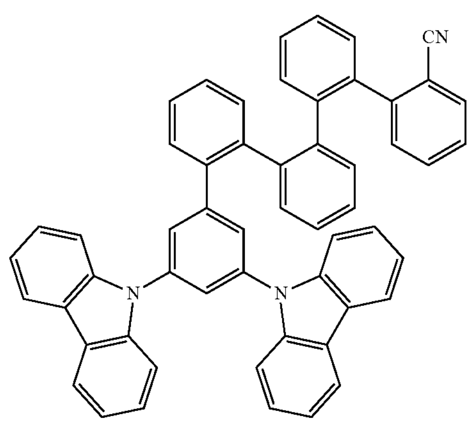

-continued
119
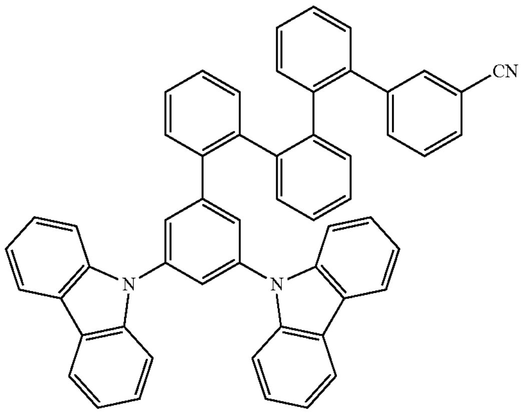
120
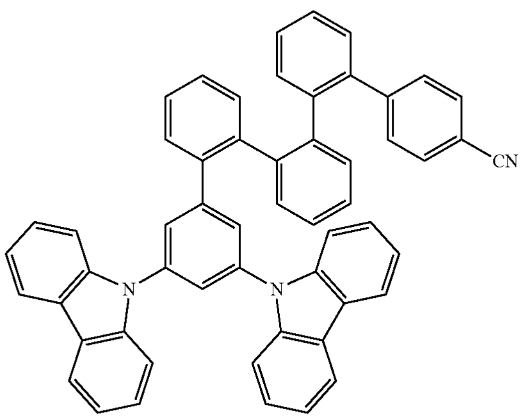
121
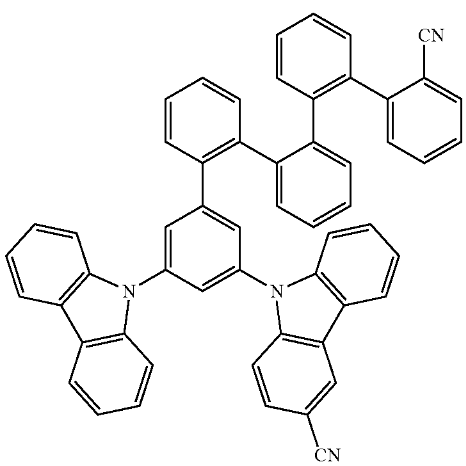
-continued
122
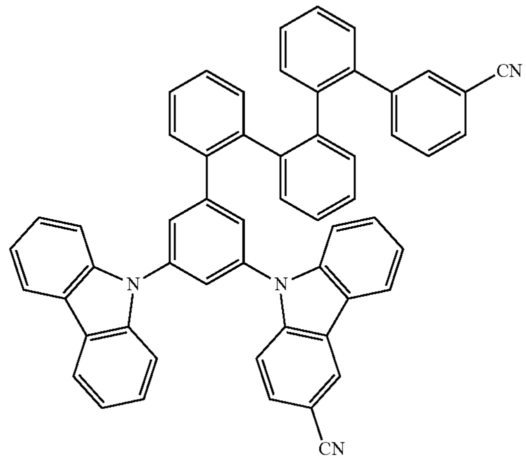
123
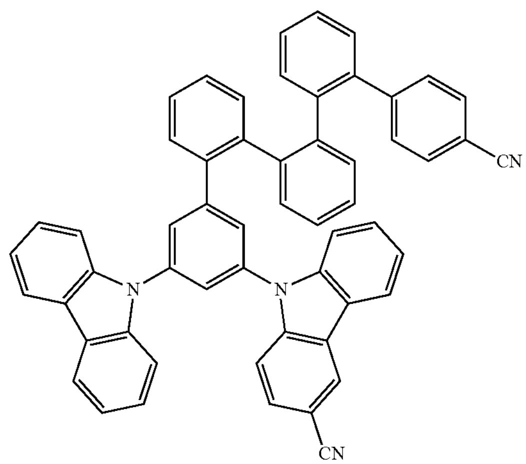
124
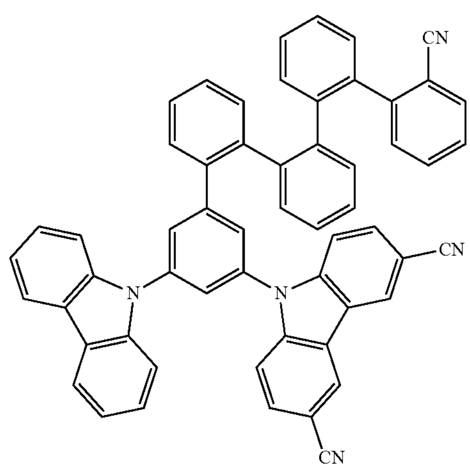

-continued
125
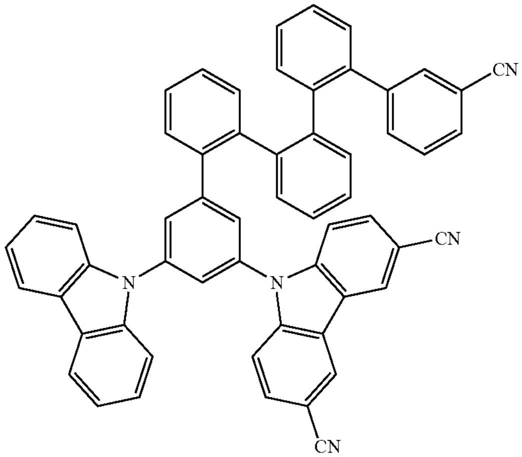
126
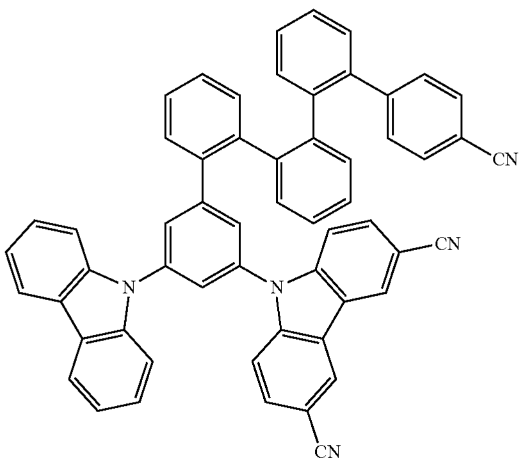
127
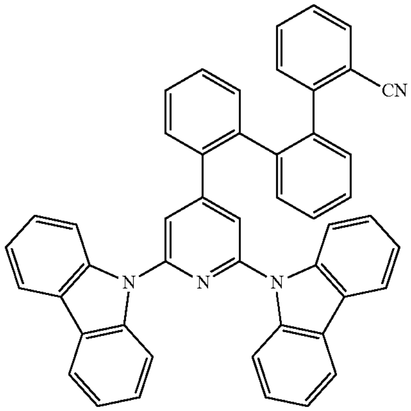
-continued
128
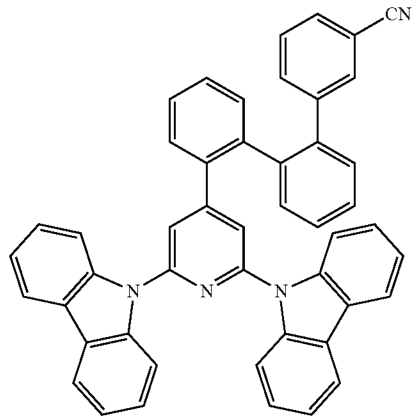
129
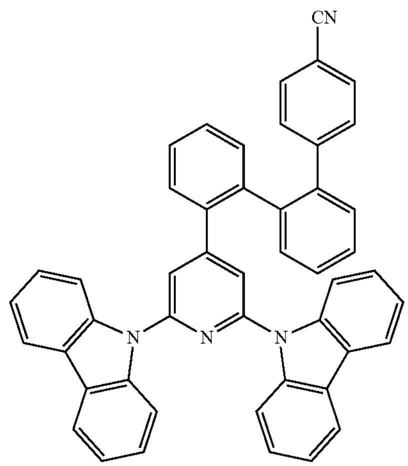
130
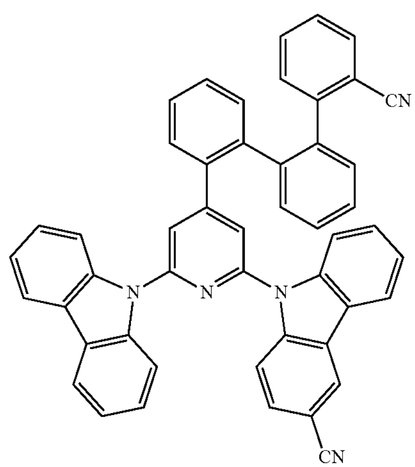

-continued
131
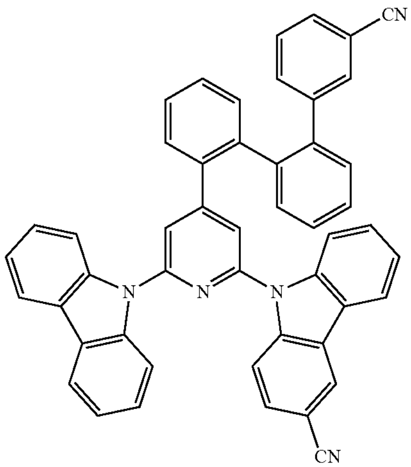
132
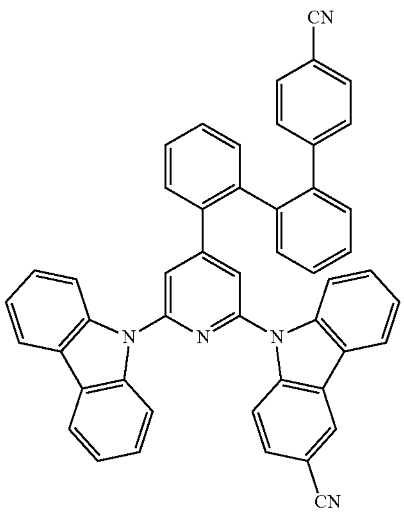
133
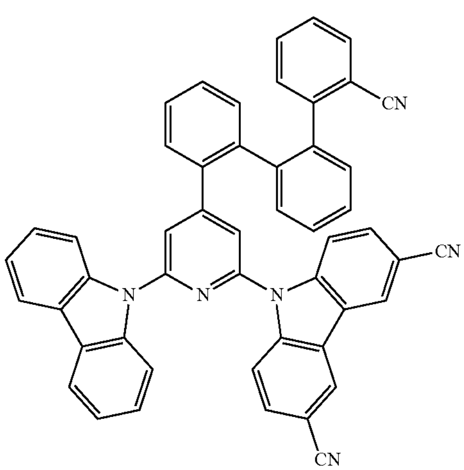
-continued
134
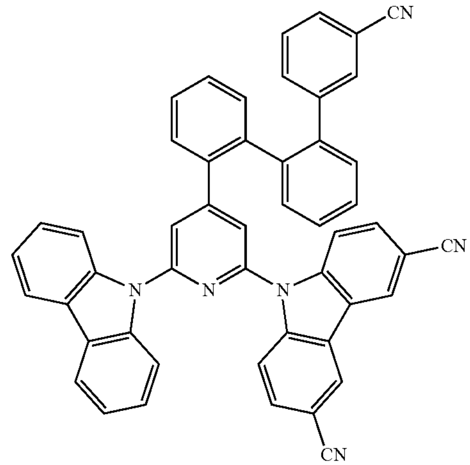
135
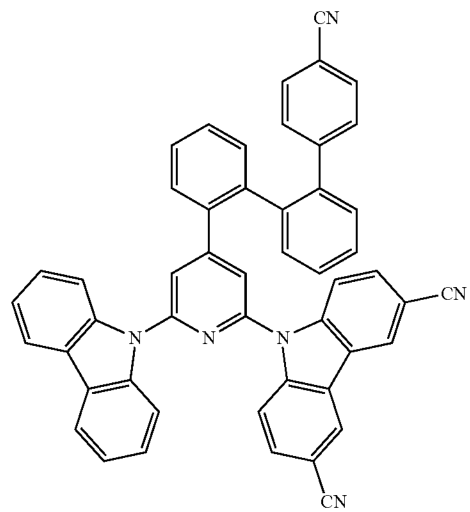
136
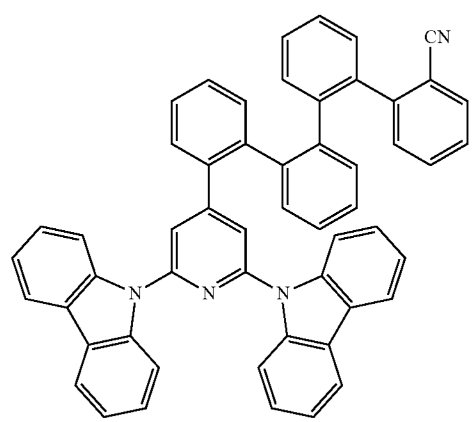

137
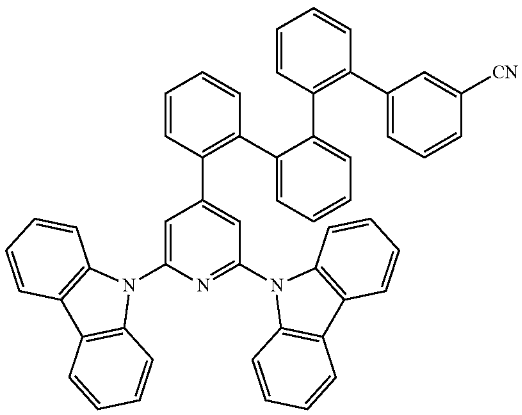
138
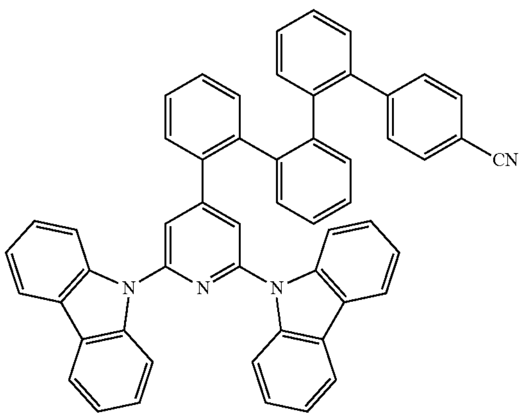
139
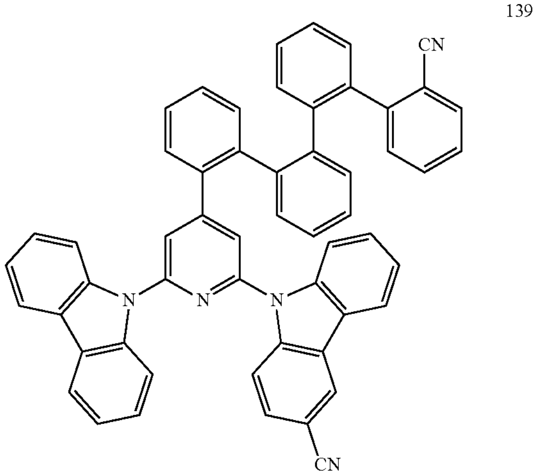
140
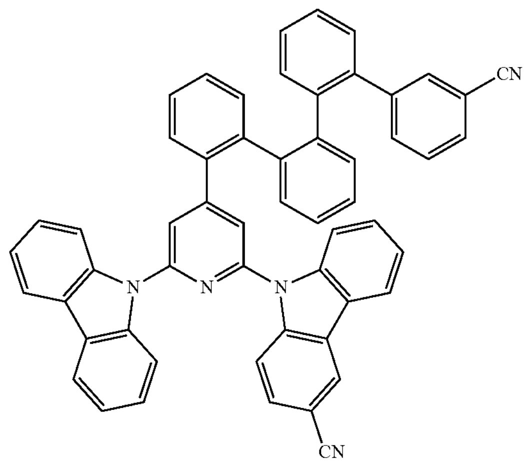
141
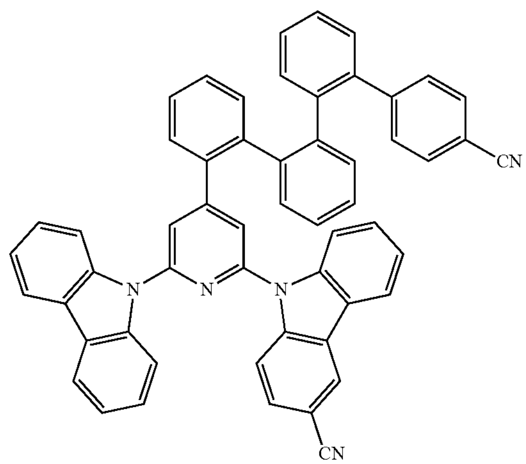
142
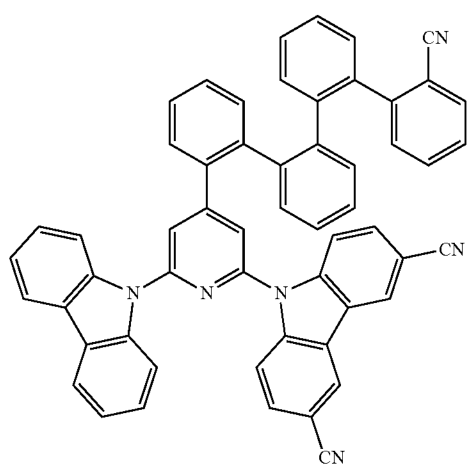

-continued
143
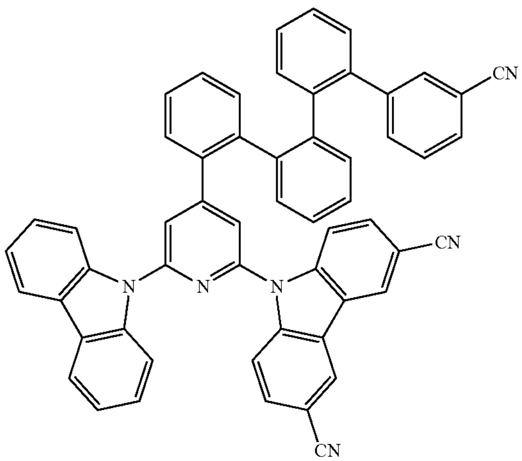
144
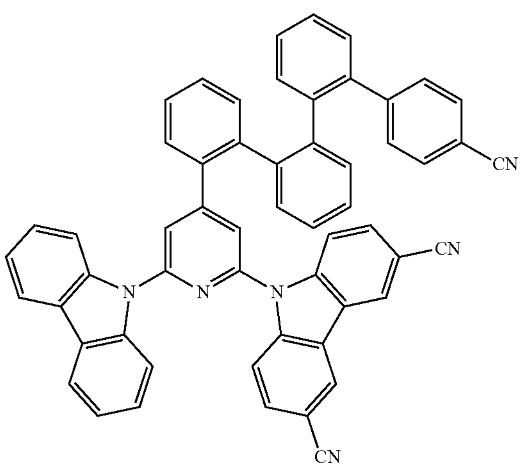
145
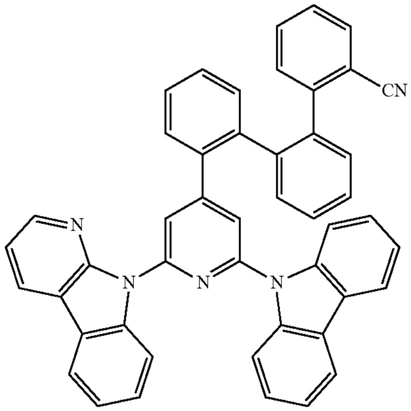
-continued
146
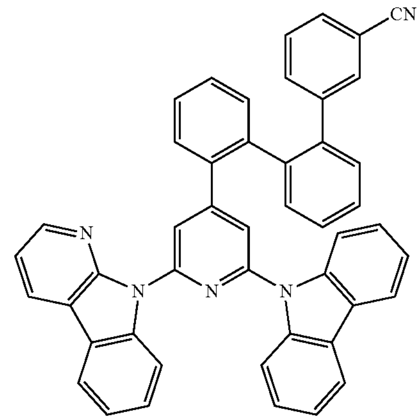
147
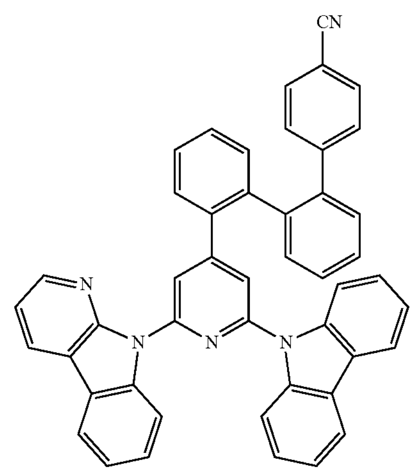
148
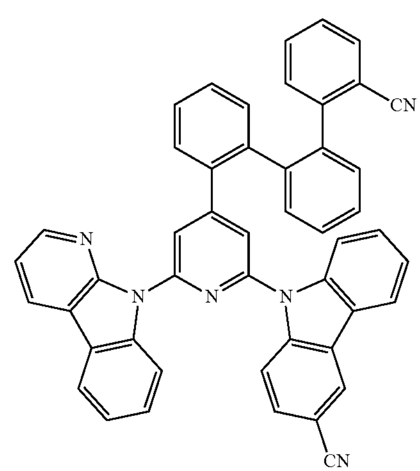

149
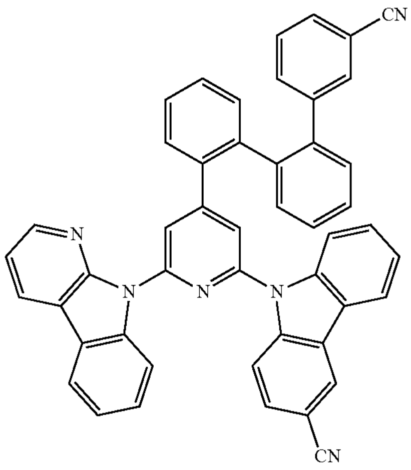
150
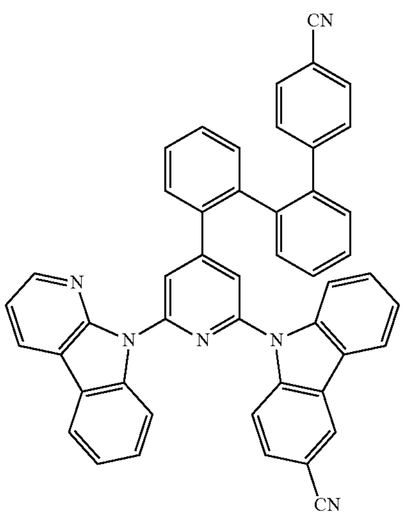
151
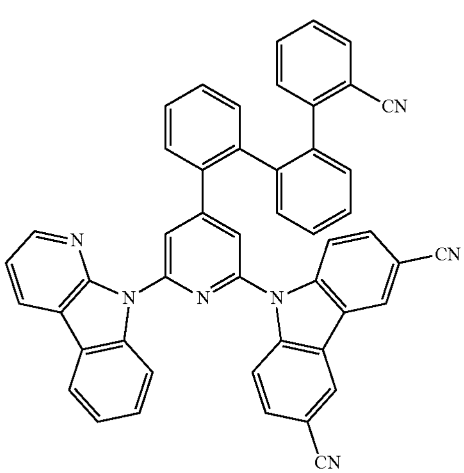
152
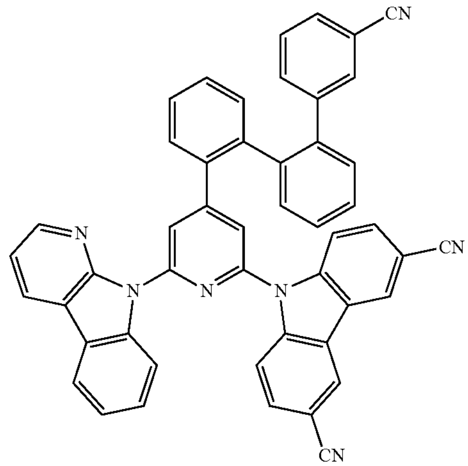
153
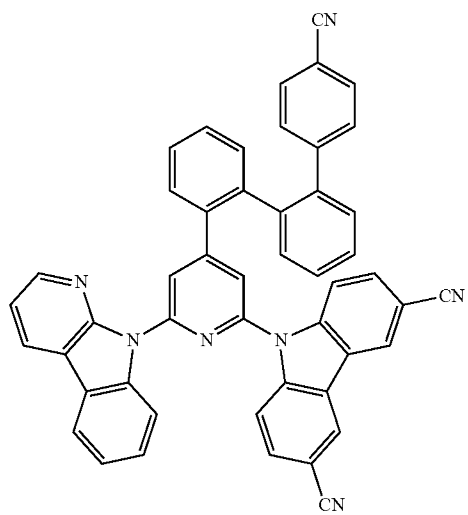
154
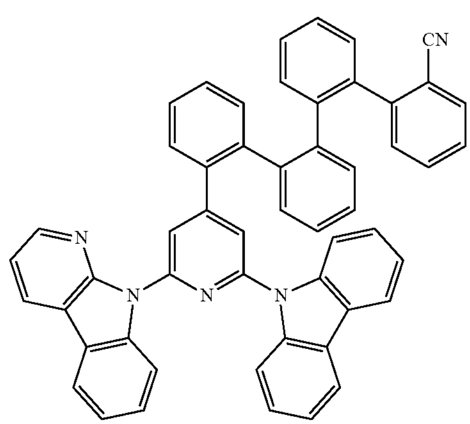

-continued
155
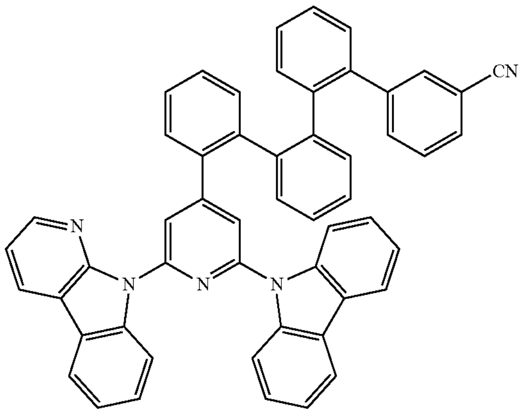
156
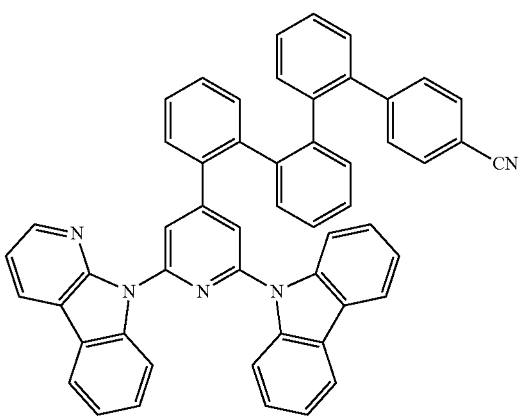
157
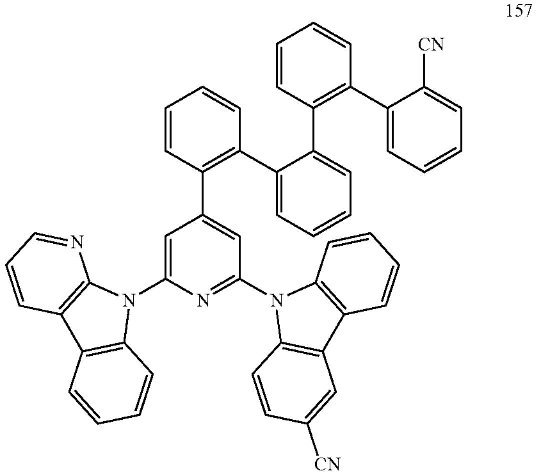
-continued
158
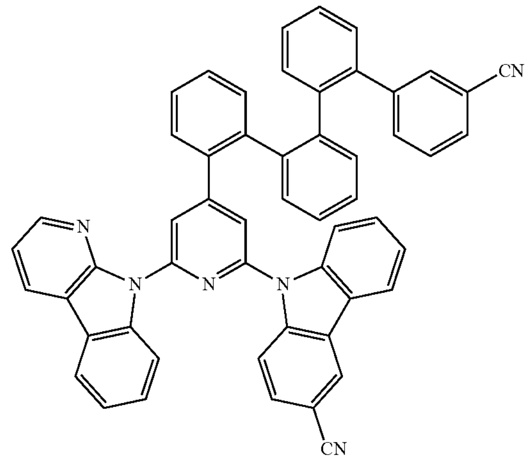
159
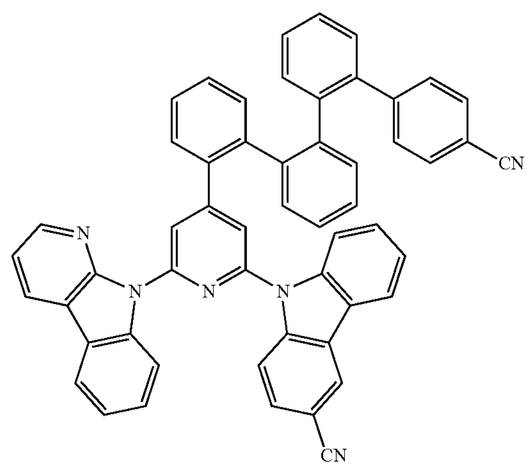
160
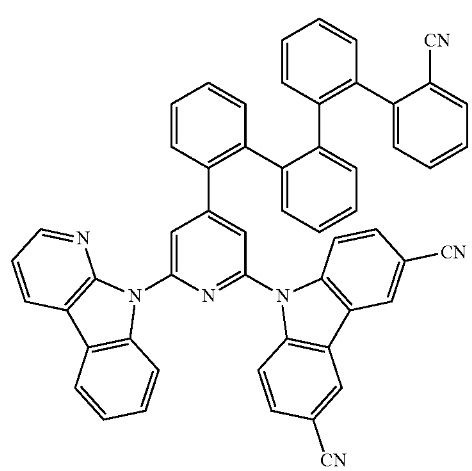

-continued
161
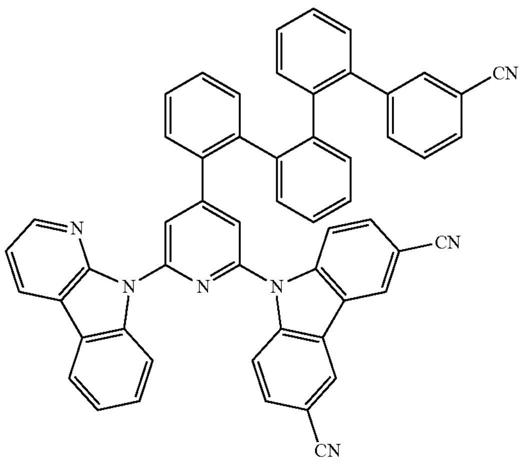
162
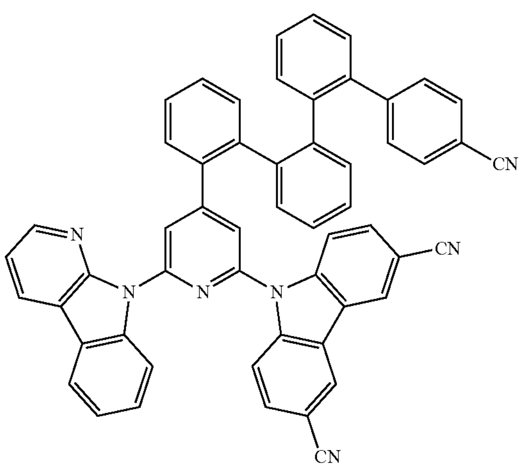
163
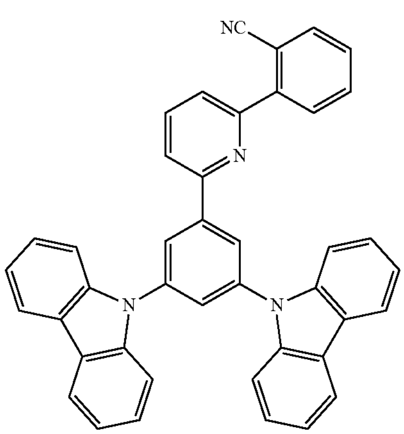
-continued
164
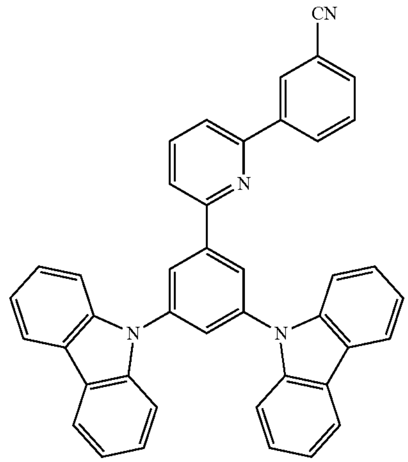
165
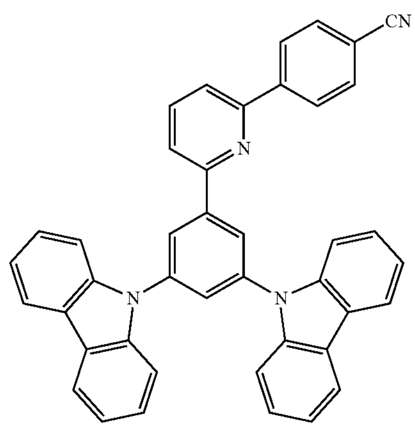
166
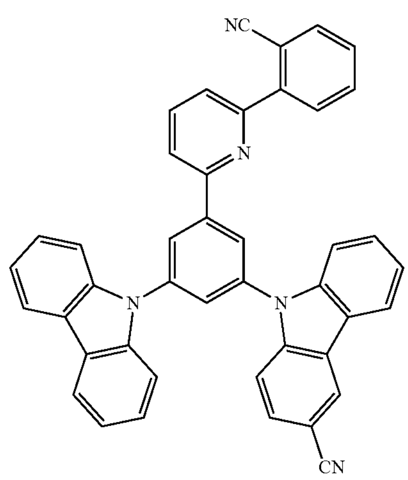

-continued
167
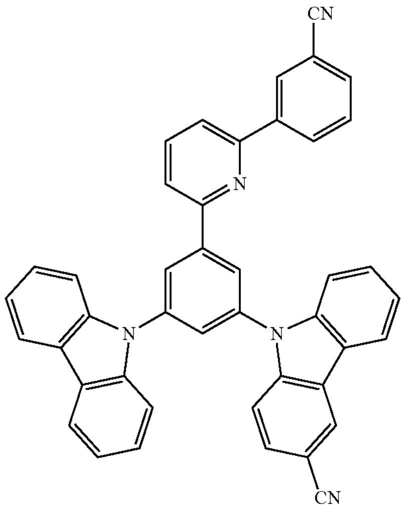
168
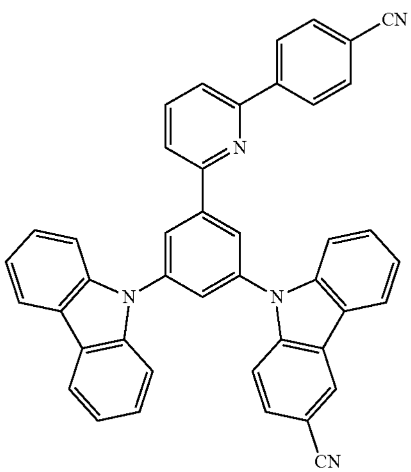
169
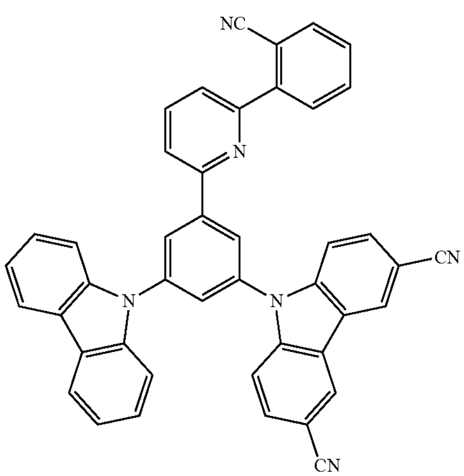
-continued
170
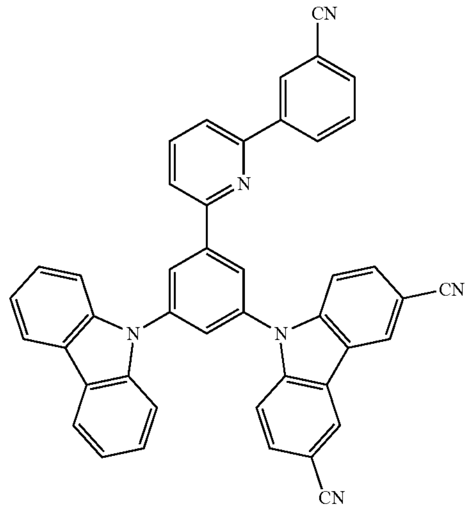
171
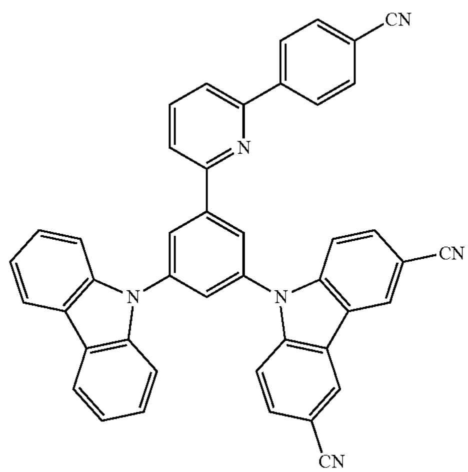
172
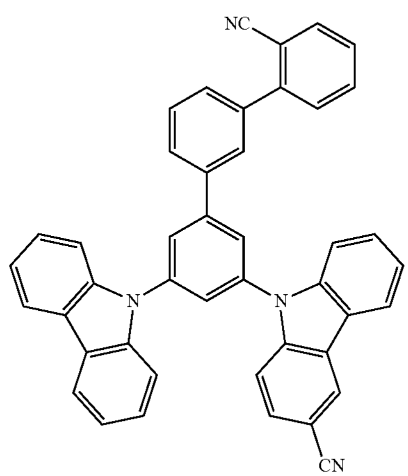

-continued
173
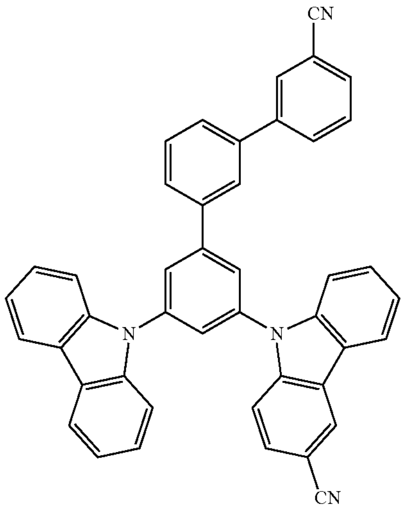
174
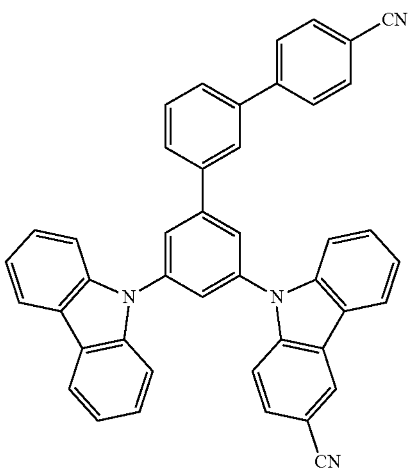
175
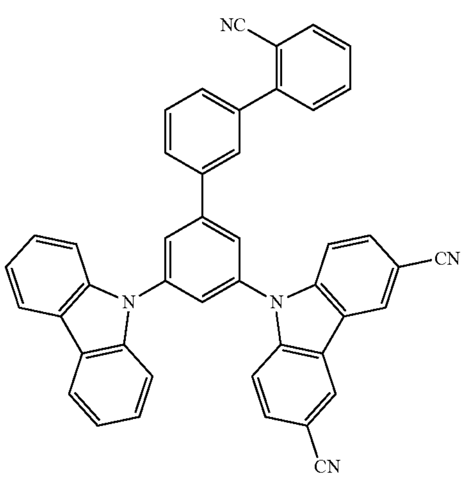
-continued
176
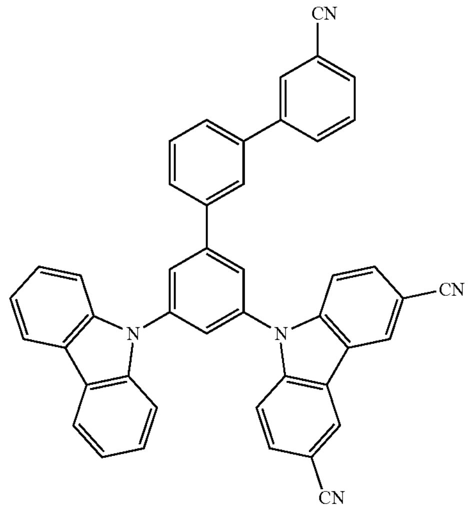
177
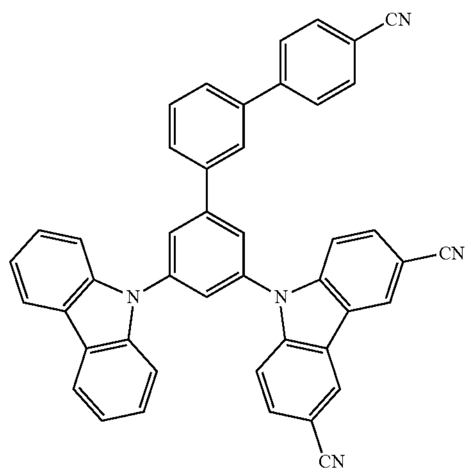
178
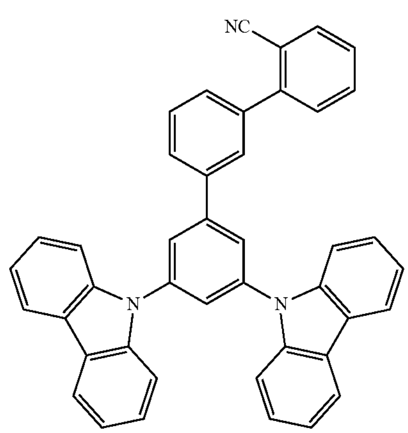

179
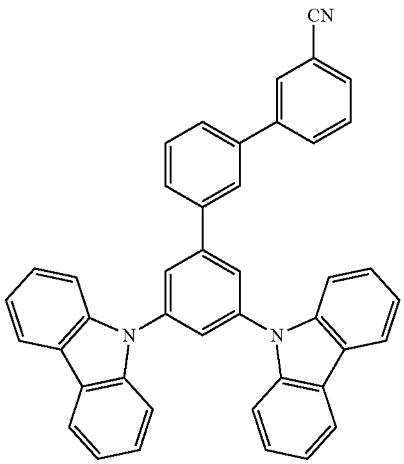
180
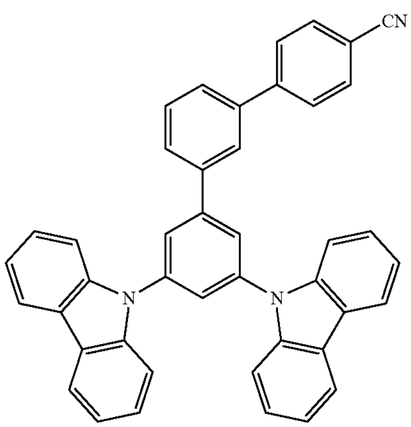
181
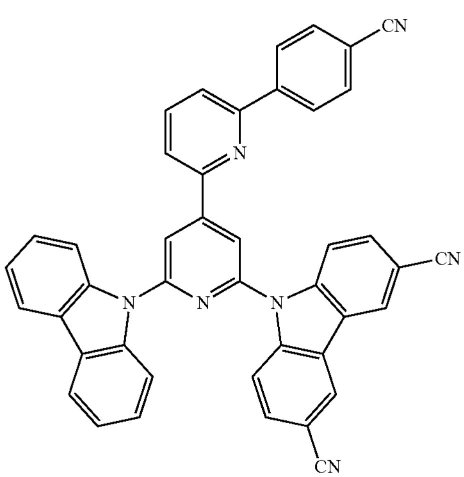
182
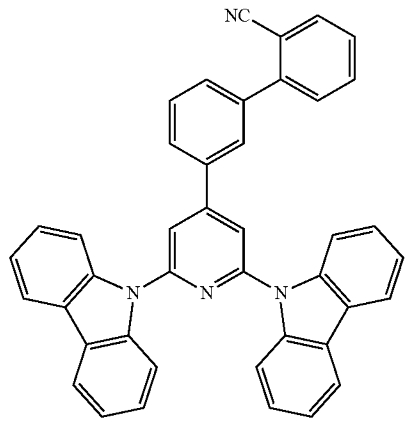
183
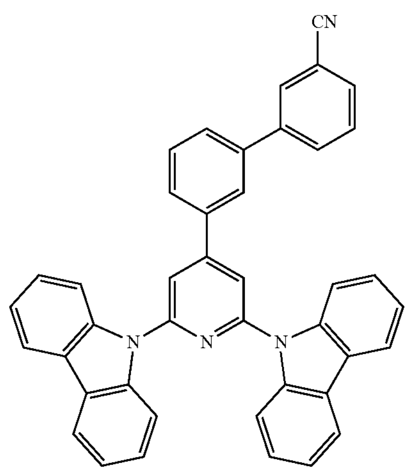
184
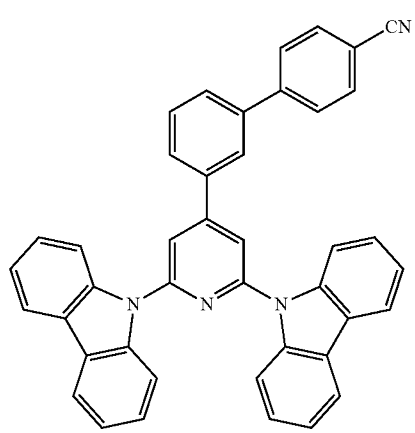

-continued
185
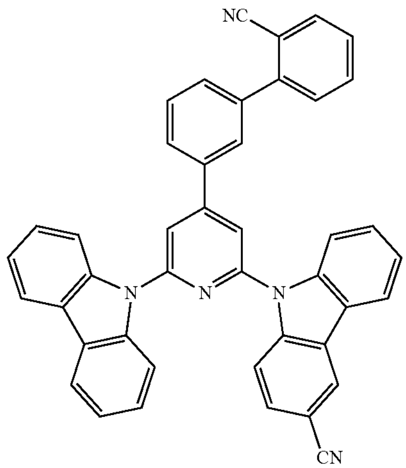
186
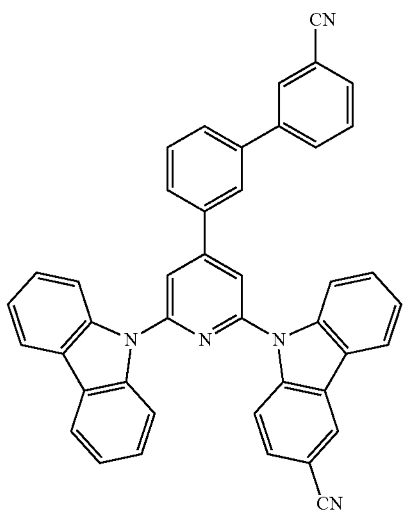
187
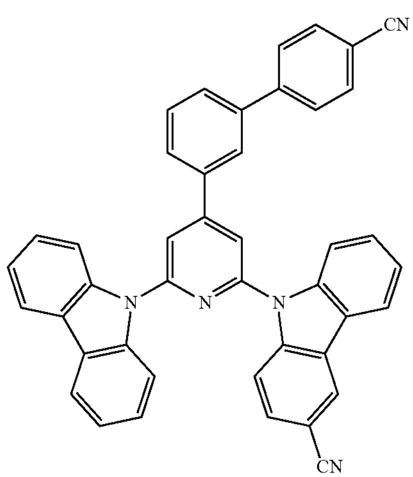
-continued
188
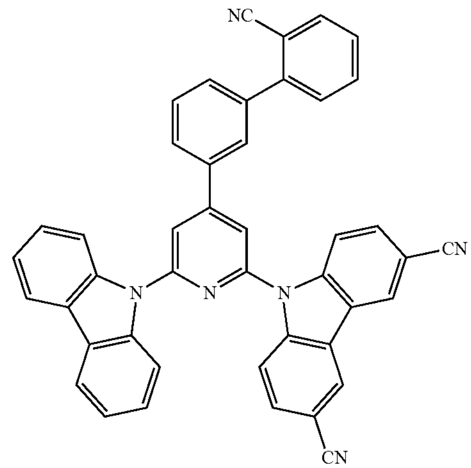
189
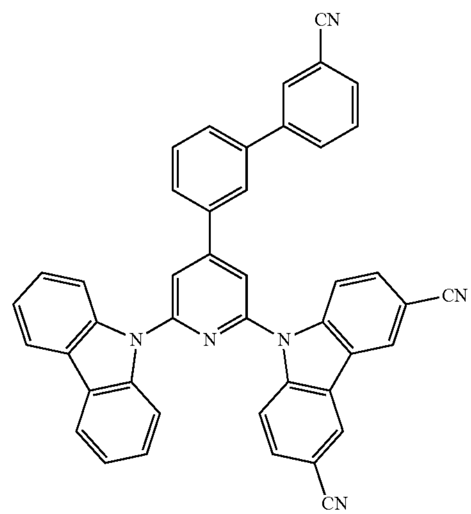
190
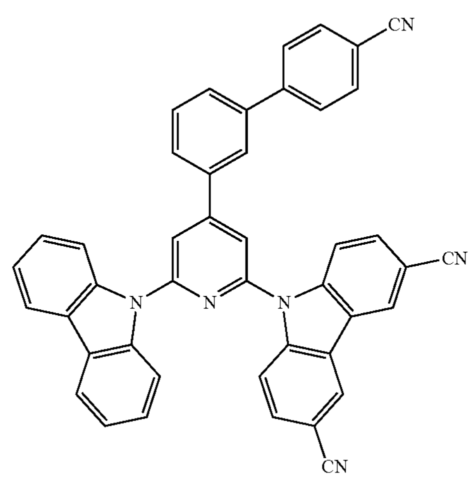

191
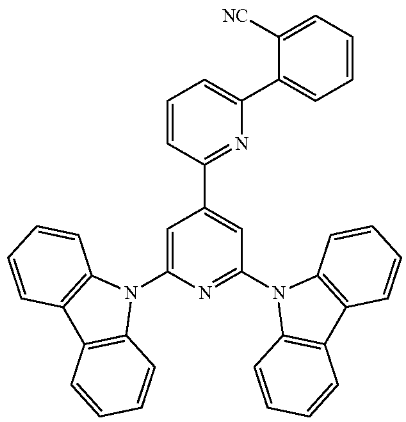
192
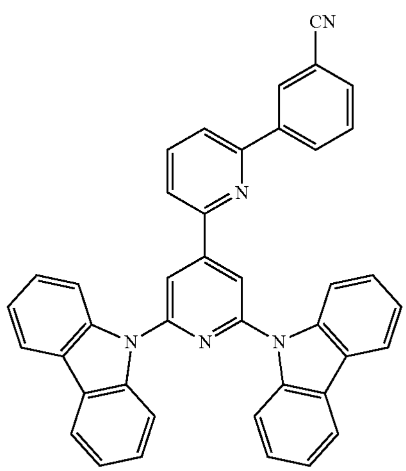
193
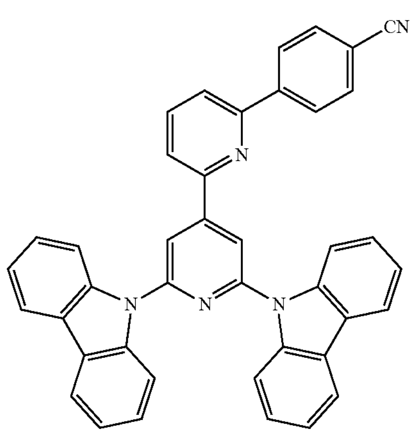
194
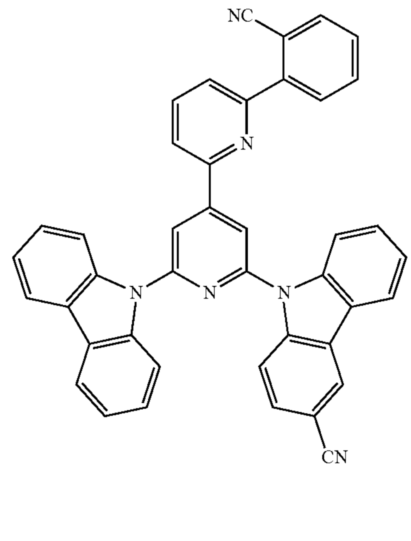
195
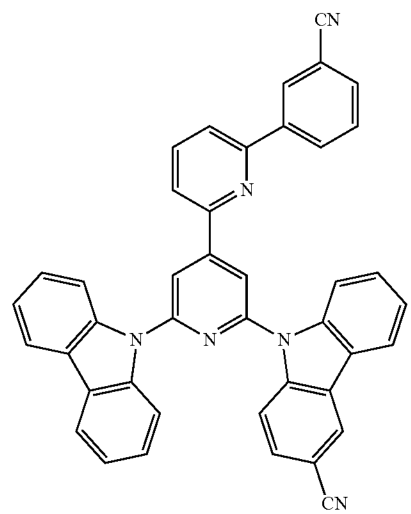
196
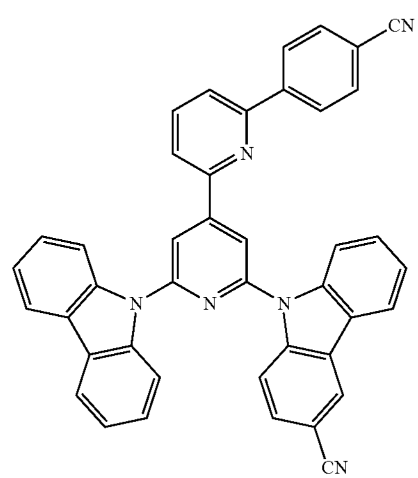

-continued
197
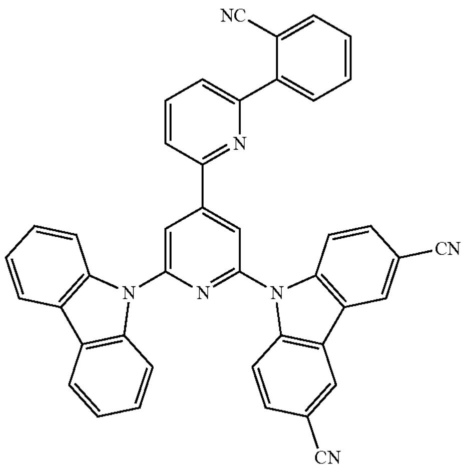
198
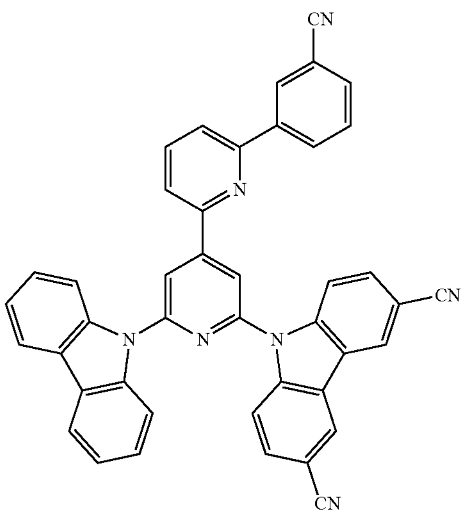
199
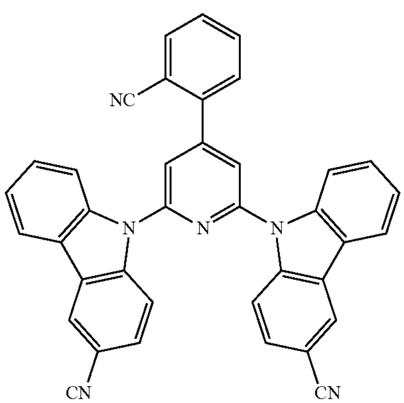
-continued
200
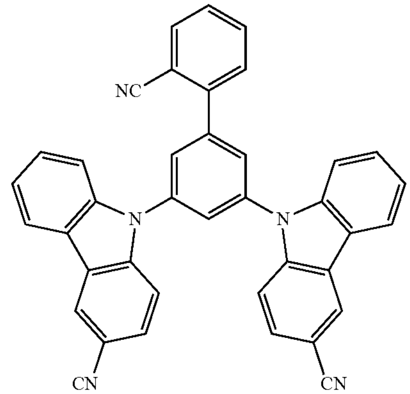
201
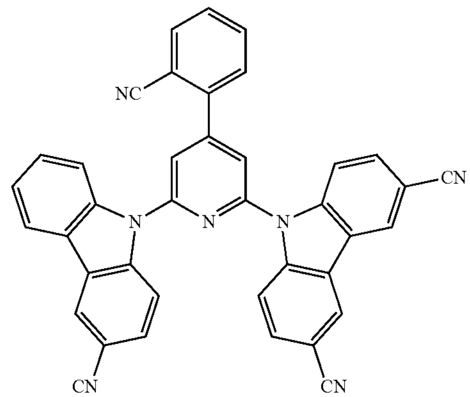
202
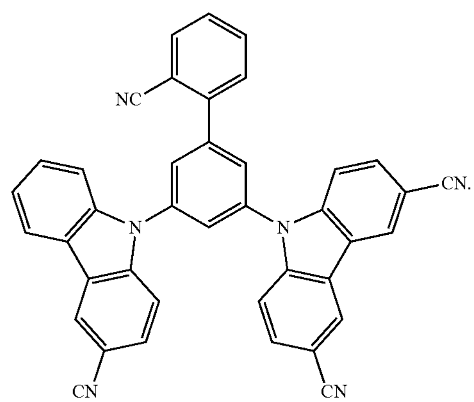
Group HE6
1
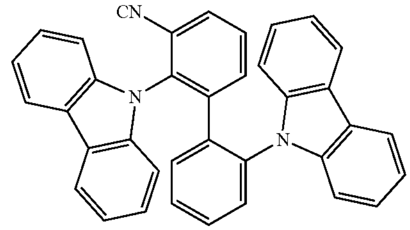

-continued
2
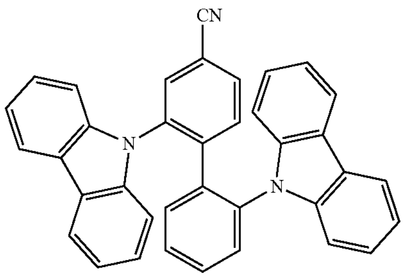
3
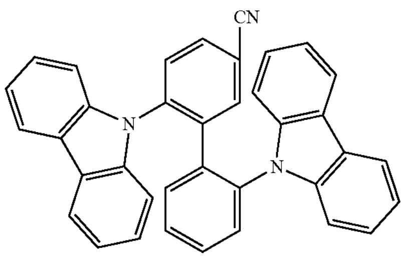
4
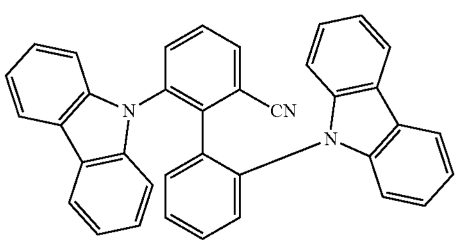
5
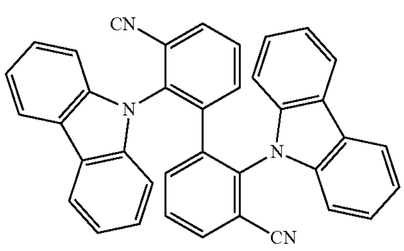
6
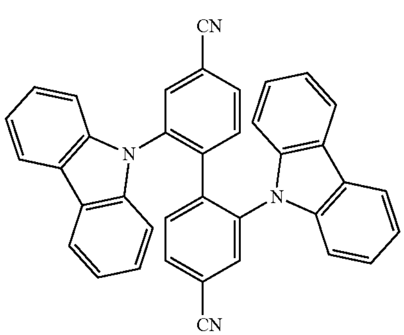
7
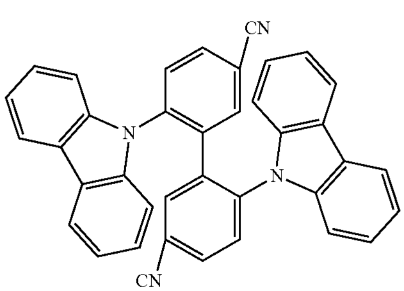
-continued
8
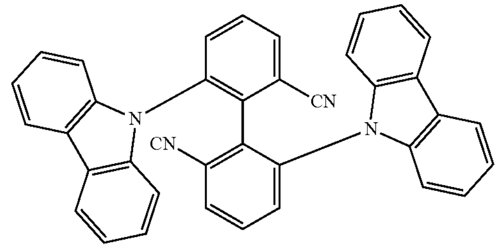
9
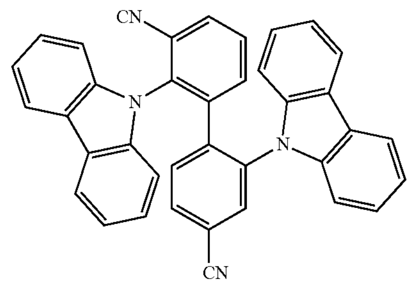
10
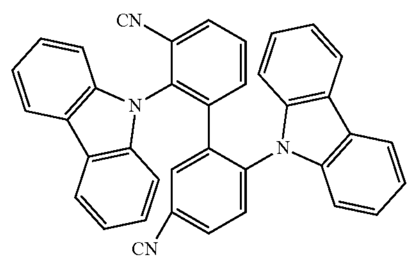
11
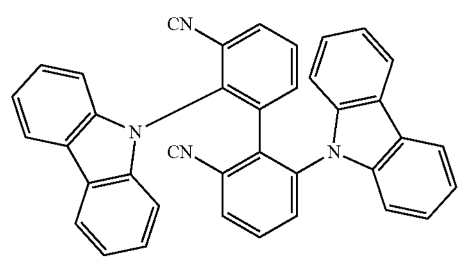
12
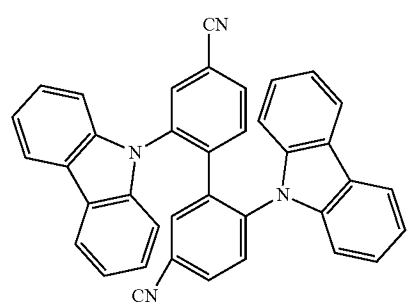
13
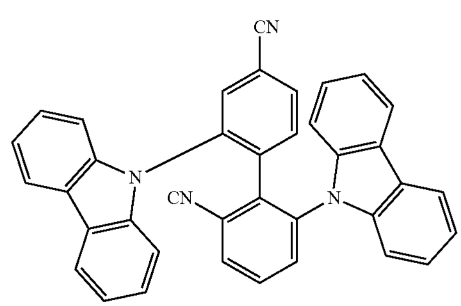

14
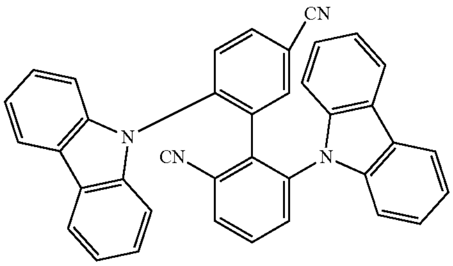
15
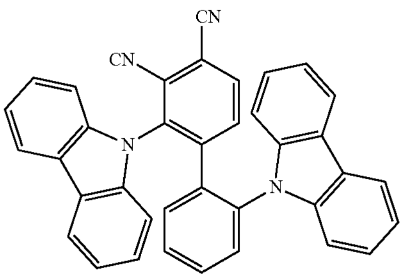
16
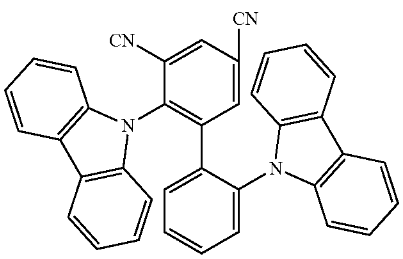
17
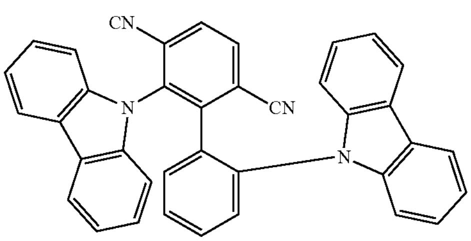
18
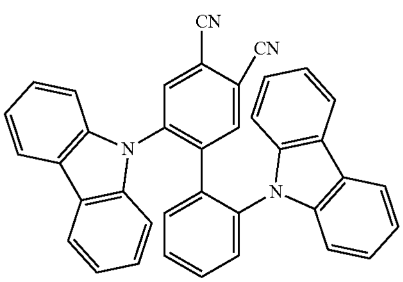
19
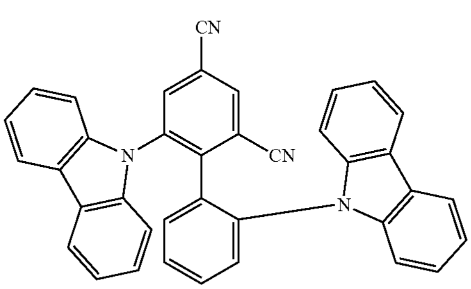
20
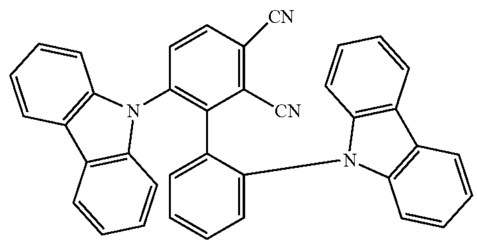
21
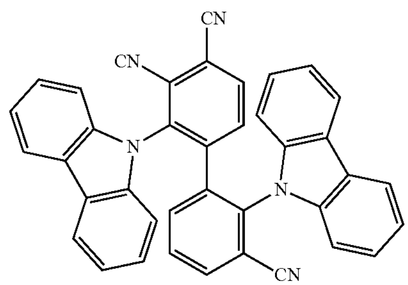
22
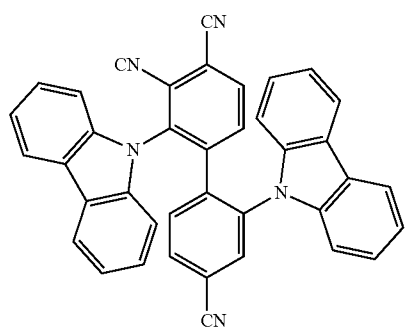
23
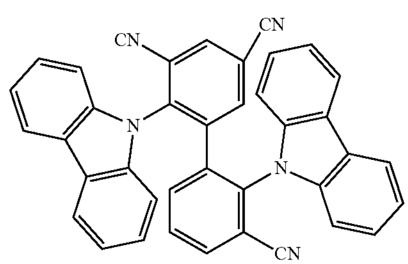
24
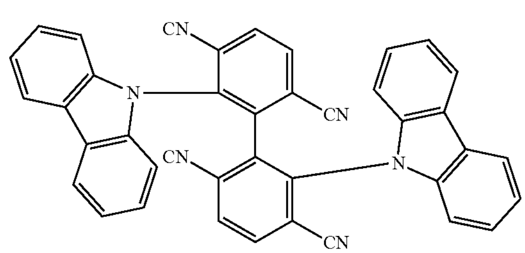

-continued
25
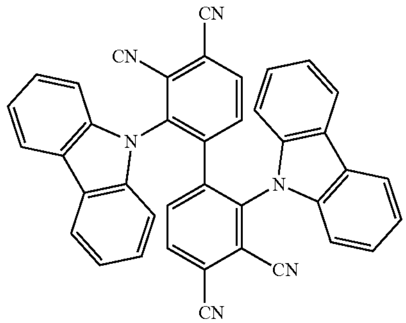
26
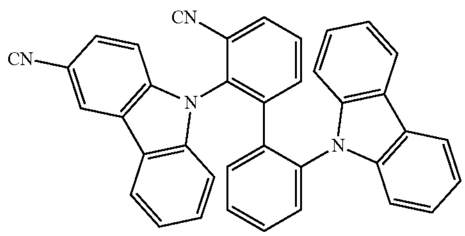
27
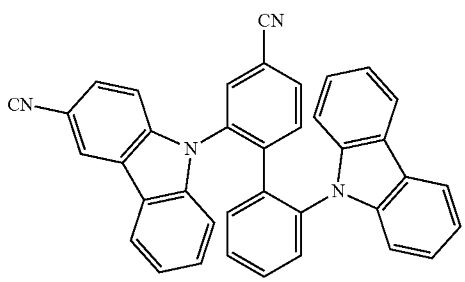
28
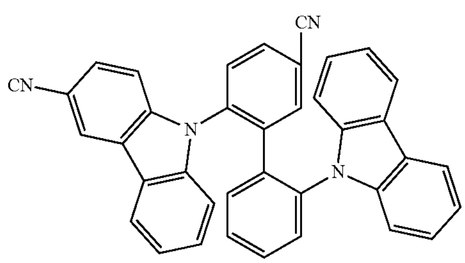
29
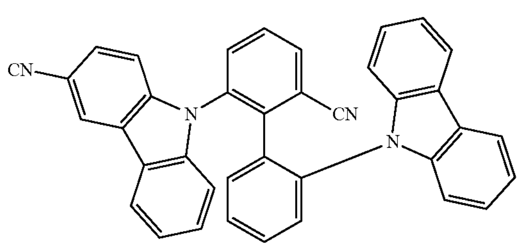
30
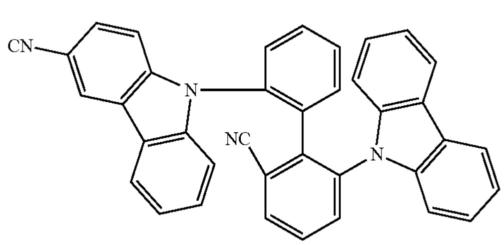
-continued
31
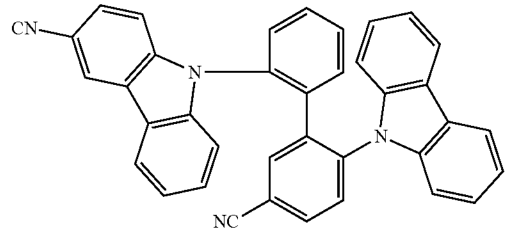
32
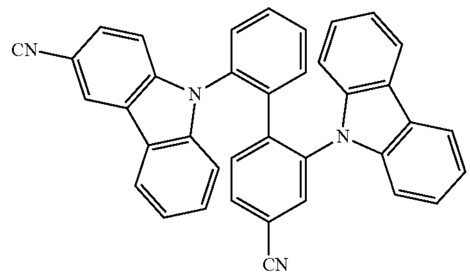
33
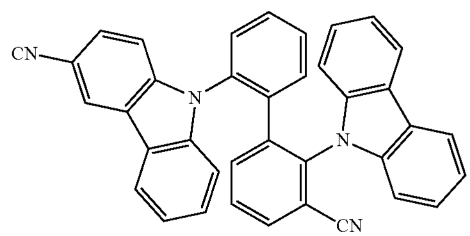
34
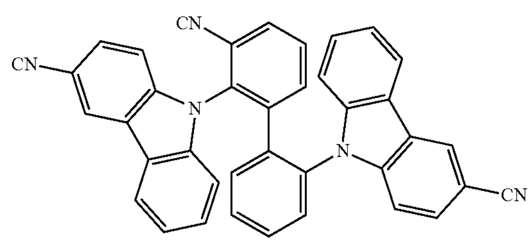
35
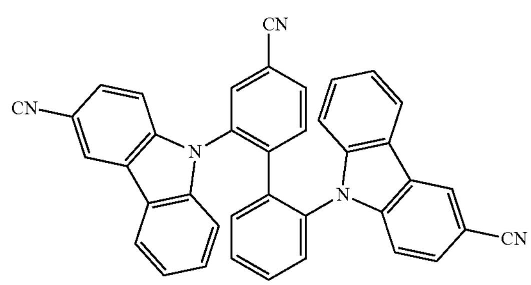
36
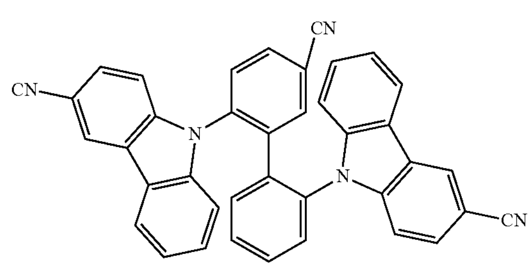

-continued
37
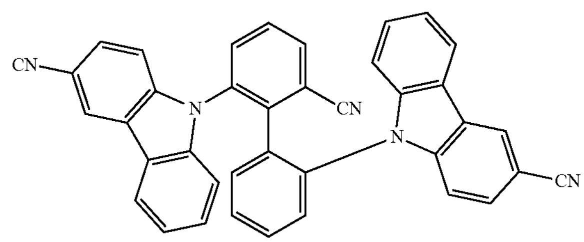
38
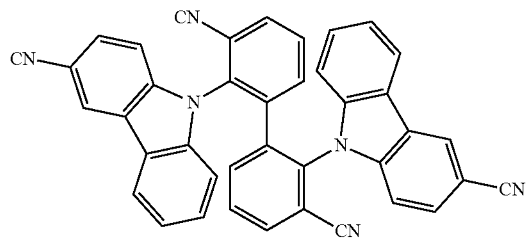
39
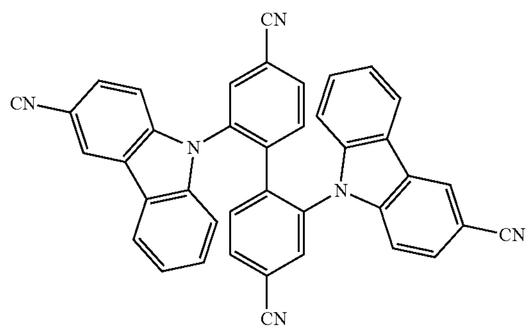
40
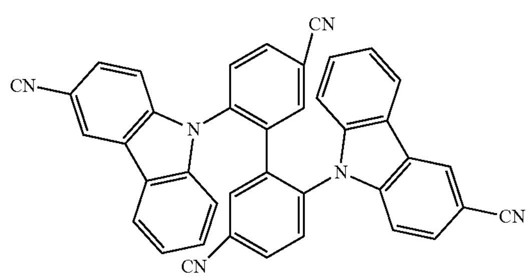
41
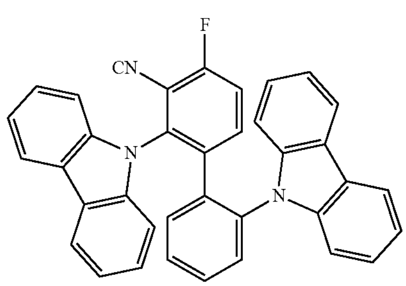
-continued
42
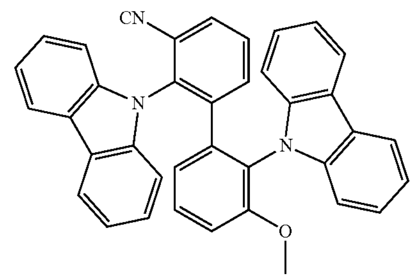
43
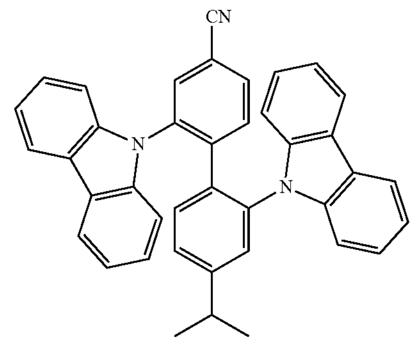
44
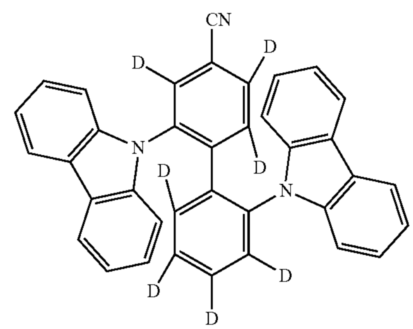
45
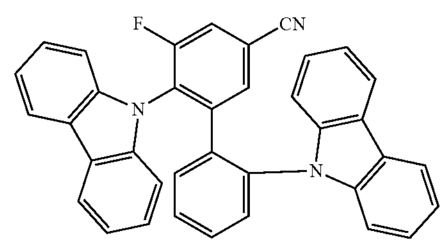
46
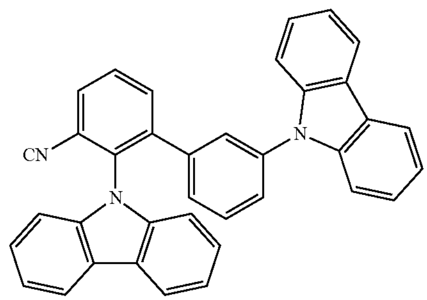

-continued
47
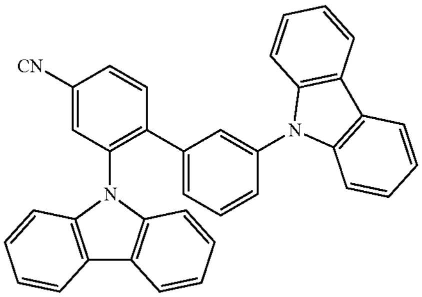
48
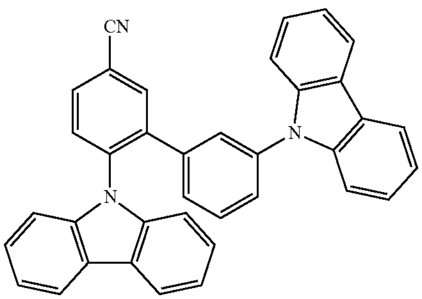
49
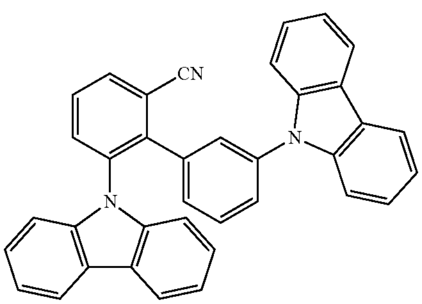
50
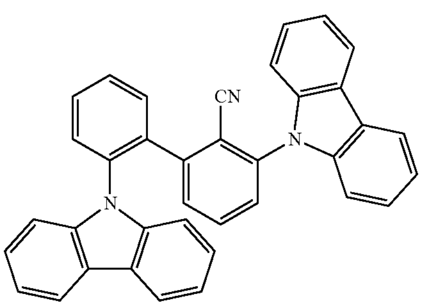
51
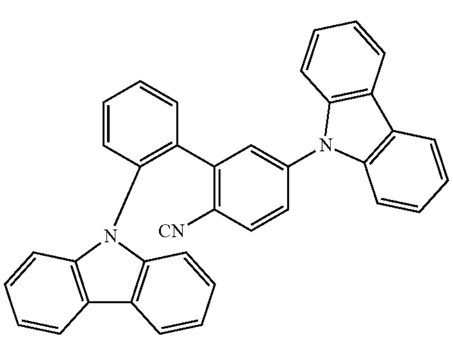
-continued
52
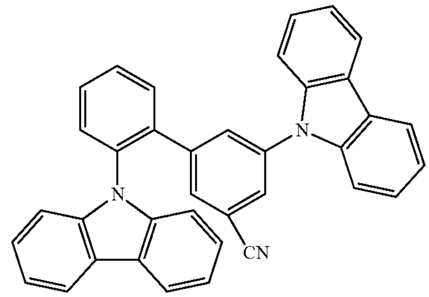
53
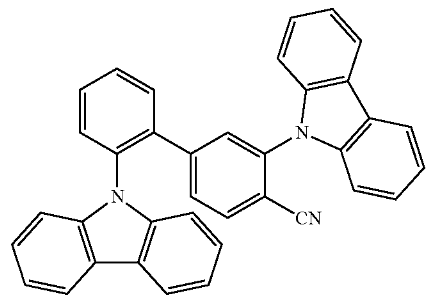
54
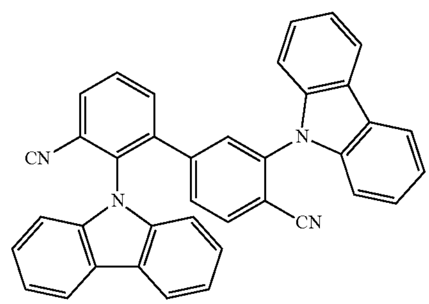
55
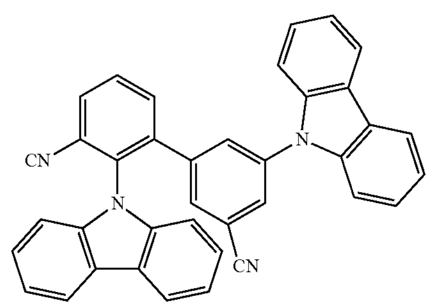
56
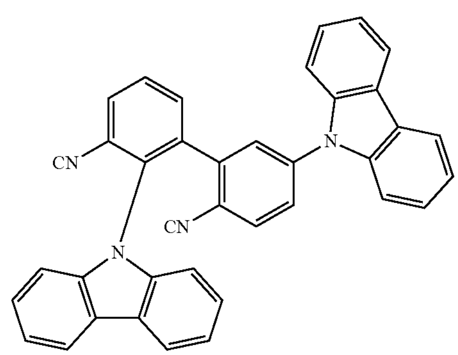

-continued
57
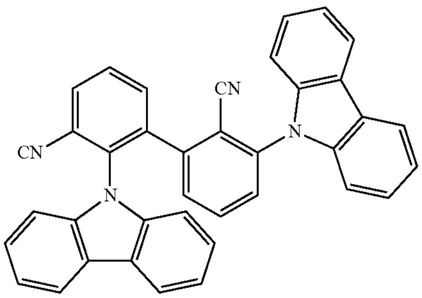
58
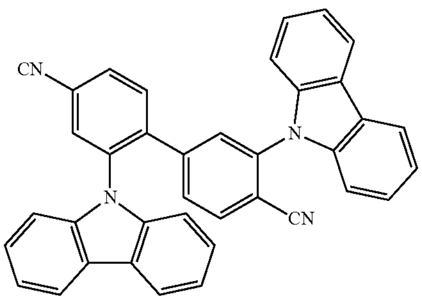
59
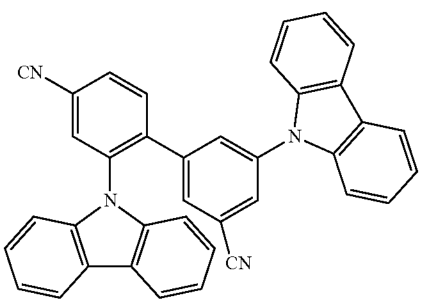
60
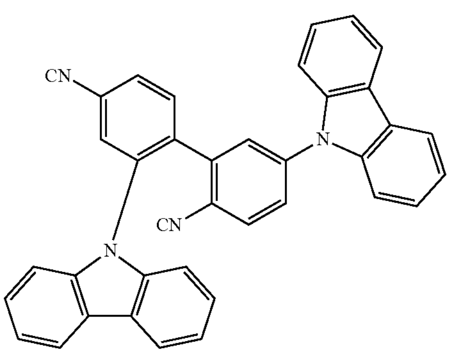
61
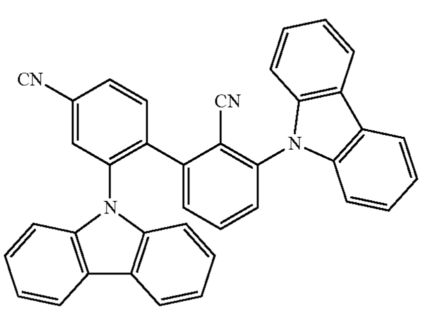
-continued
62
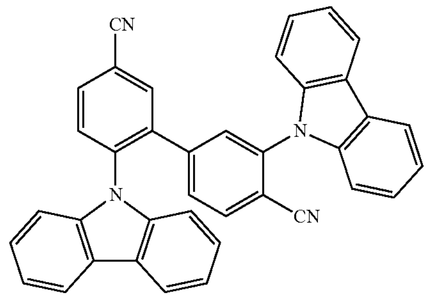
63
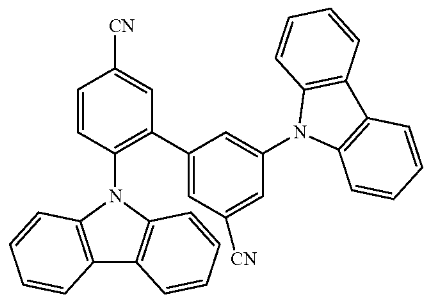
64
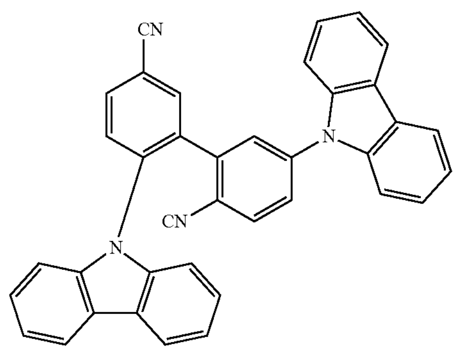
65
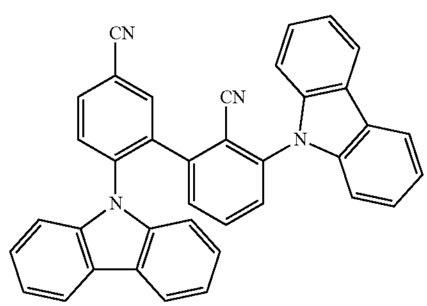
66
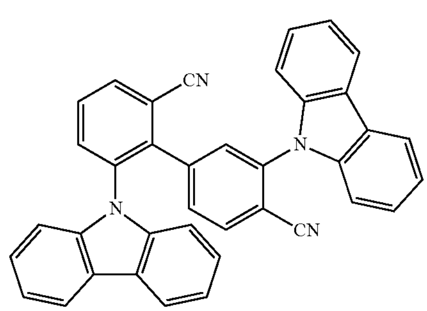

-continued
67
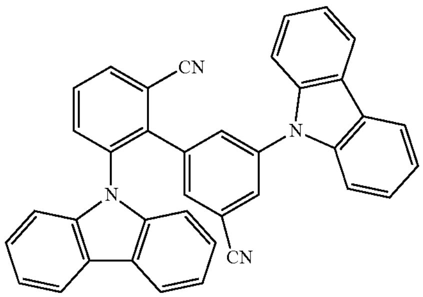
68
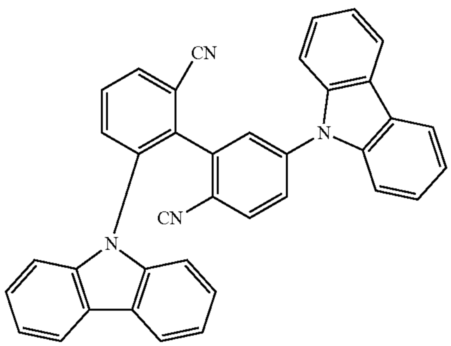
69
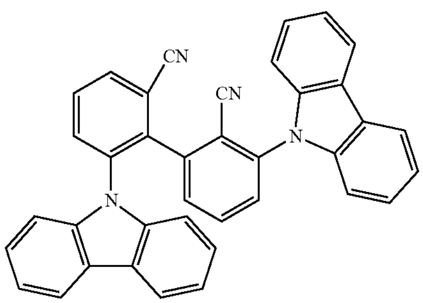
70
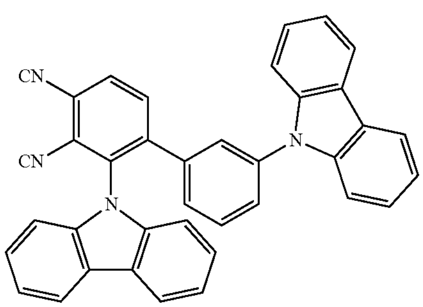
71
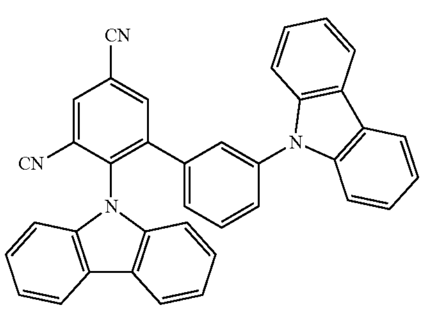
-continued
72
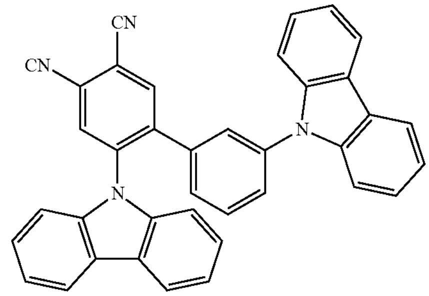
73
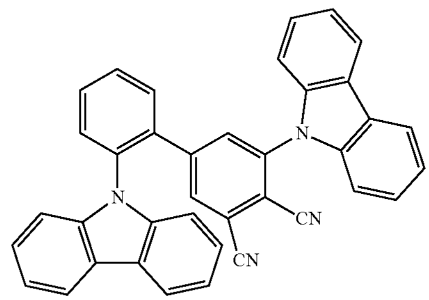
74
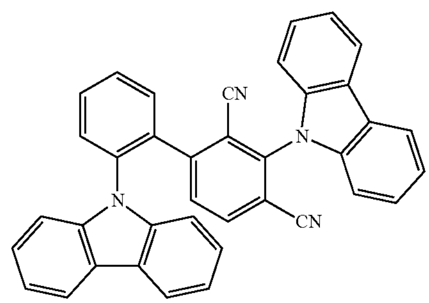
75
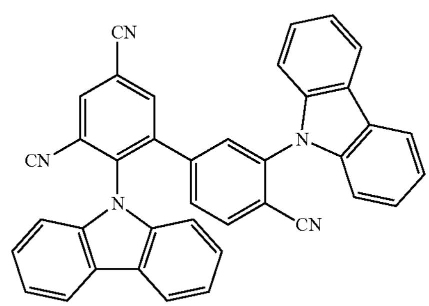
76
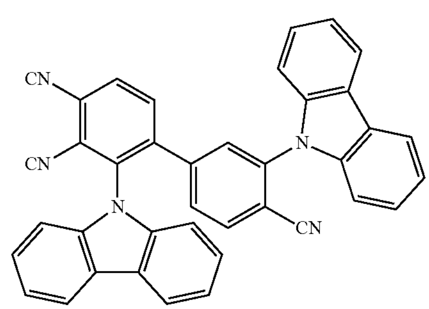

-continued
77
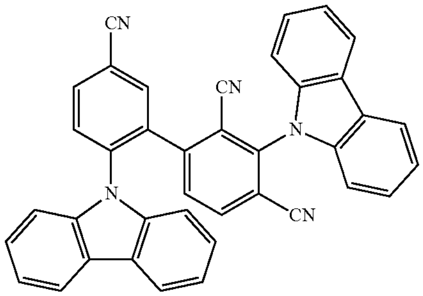
78
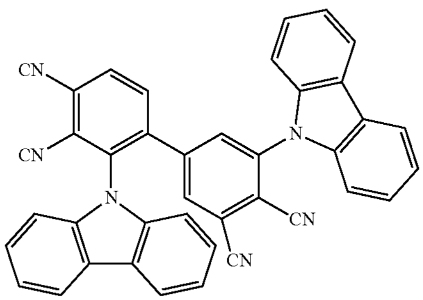
79
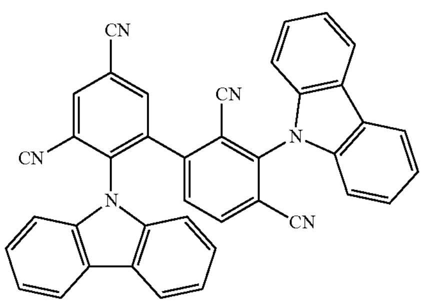
80
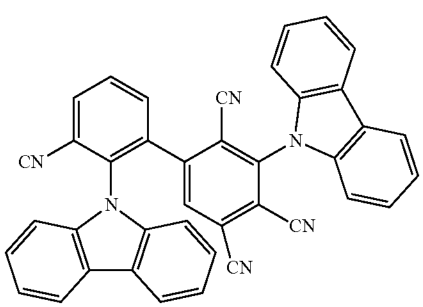
81
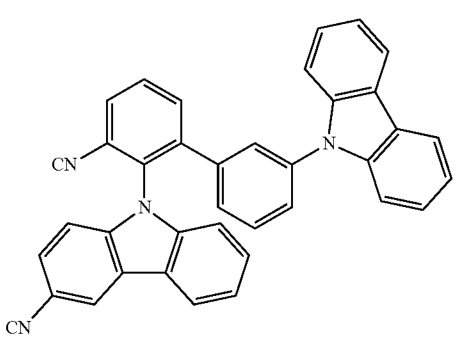
-continued
82
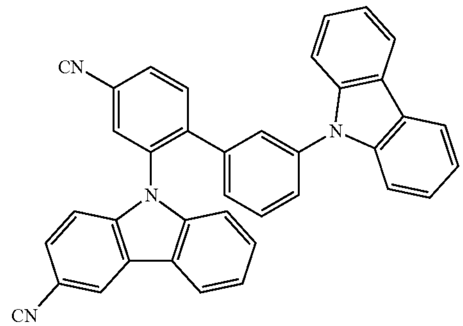
83
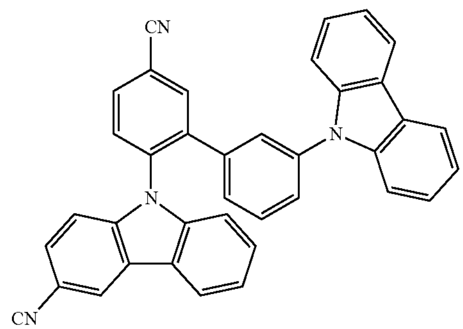
84
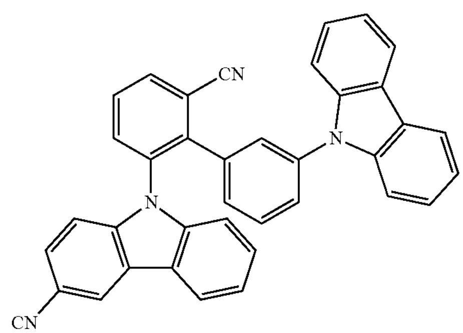
85
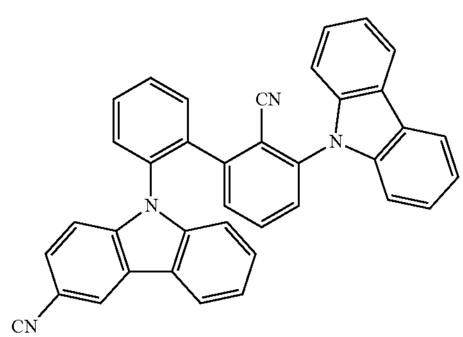

86
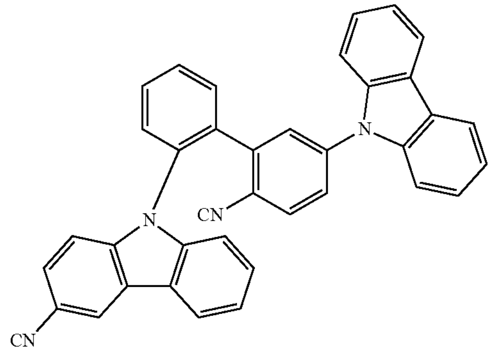
87
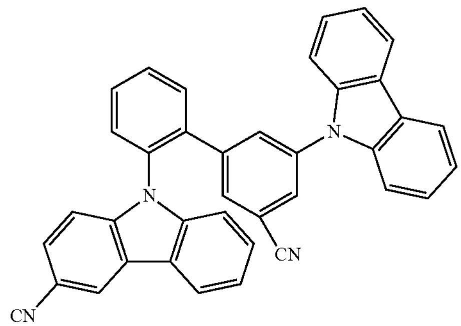
88
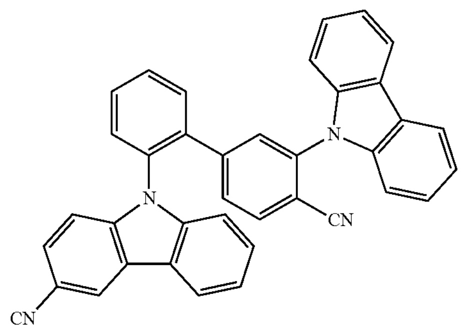
89
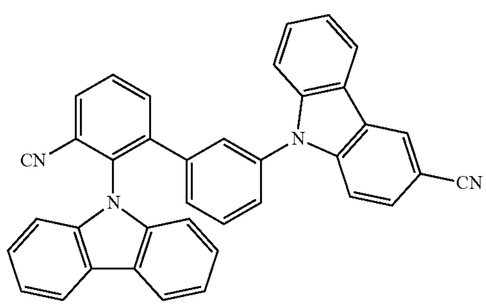
90
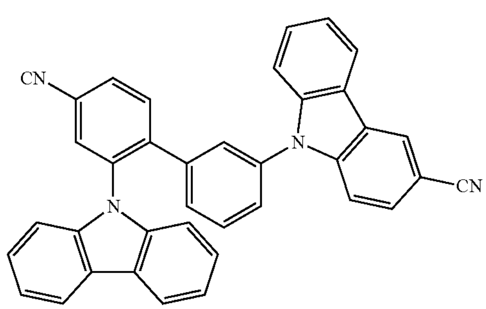
91
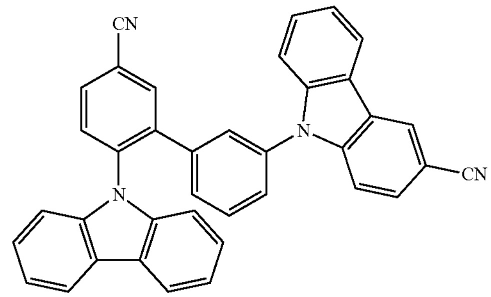
92
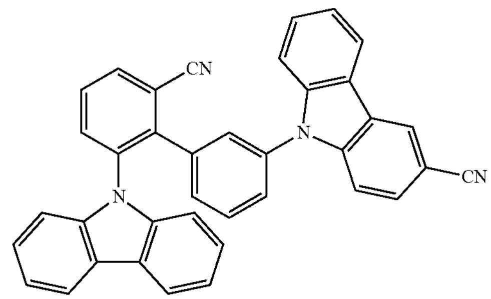
93
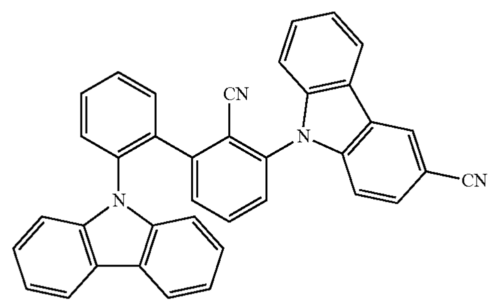
94
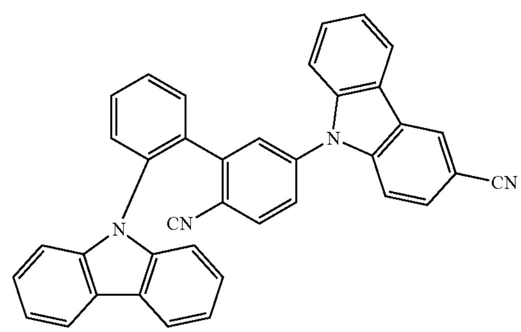
95
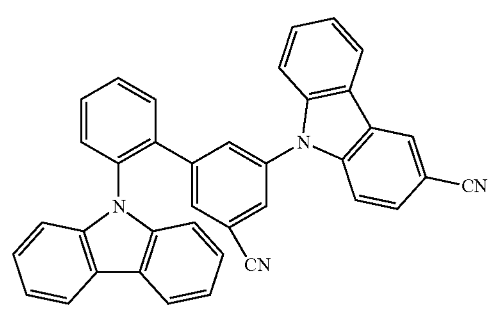

-continued
96
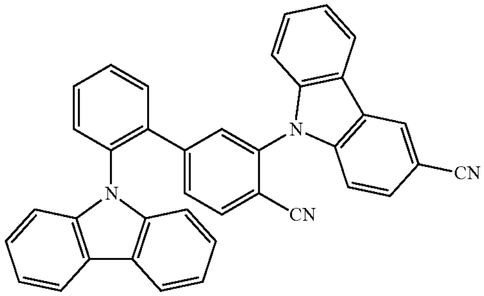
97
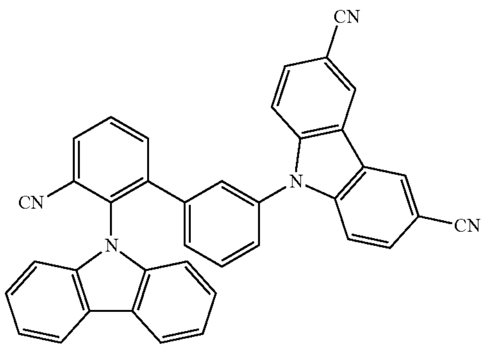
98
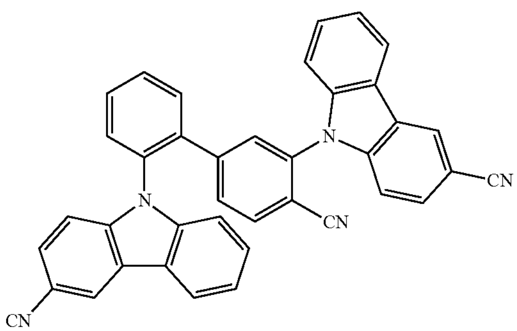
99
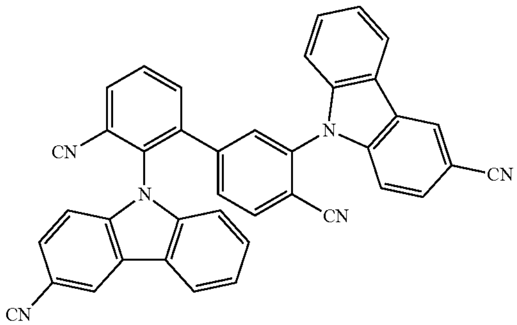
-continued
100
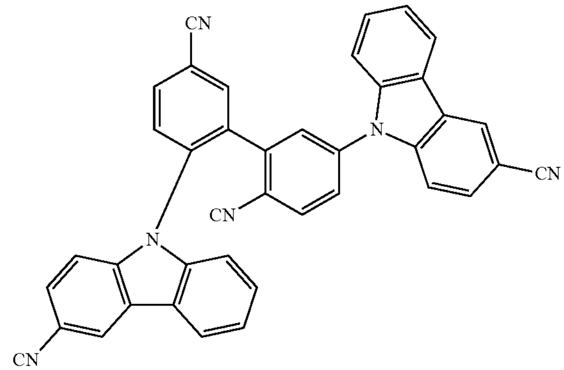
101
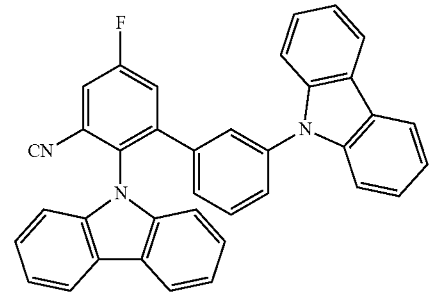
102
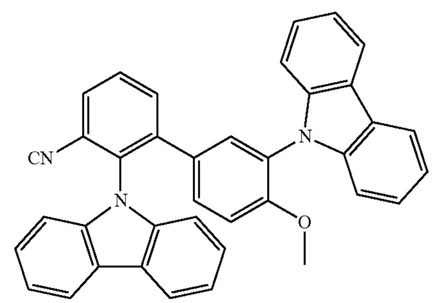
103
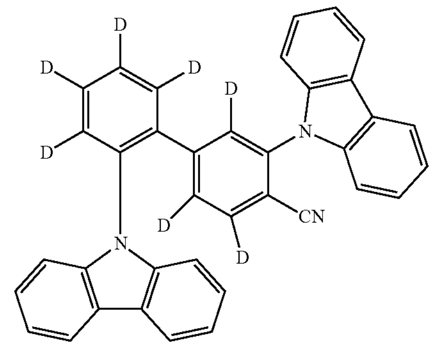

104
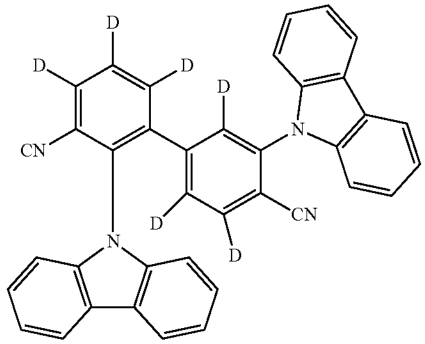
105
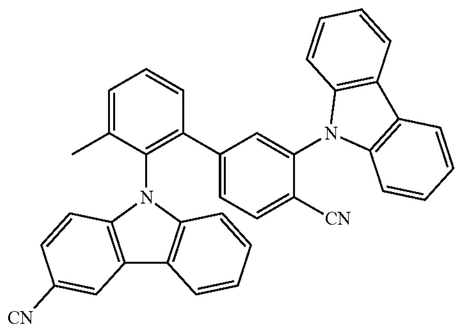
106
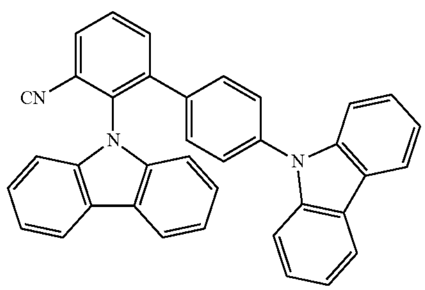
107
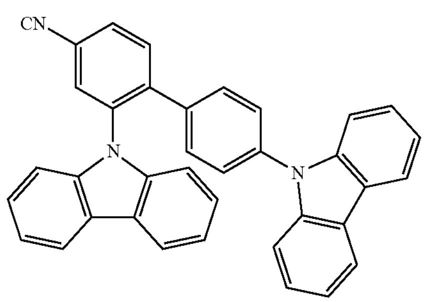
108
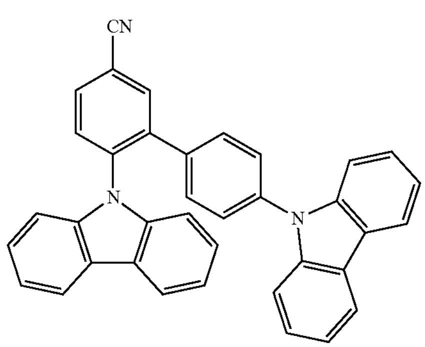
109
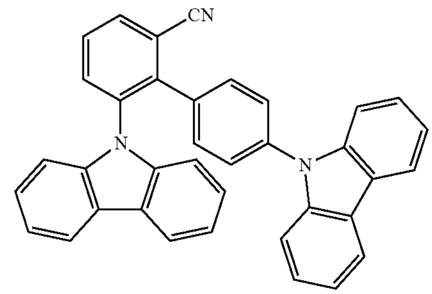
110
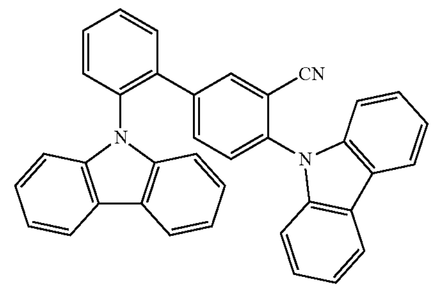
111
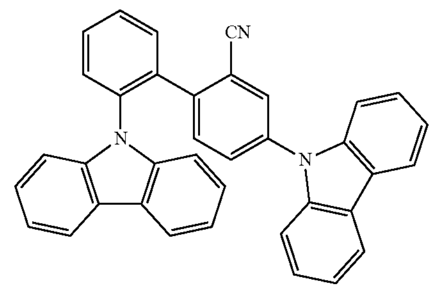
112
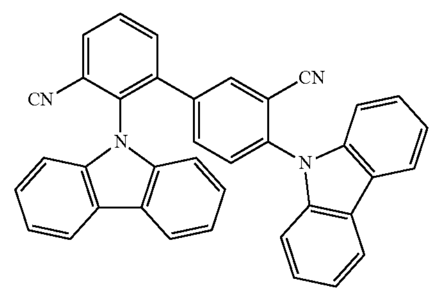
113
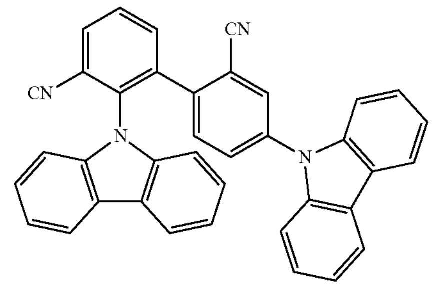

-continued
114
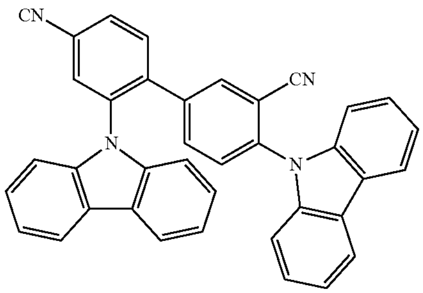
115
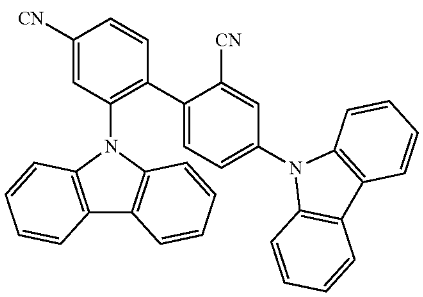
116
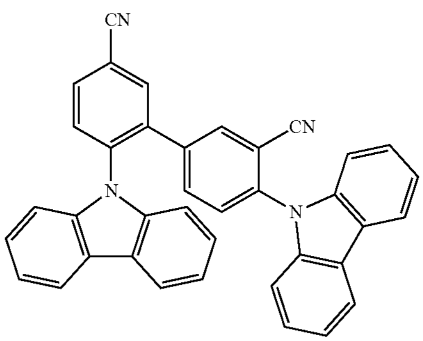
117
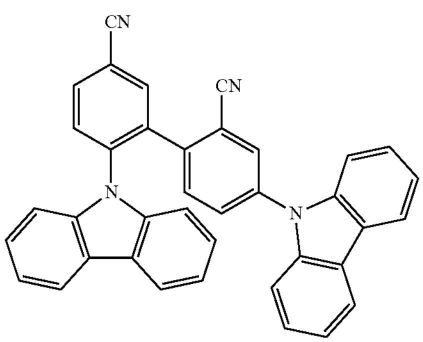
118
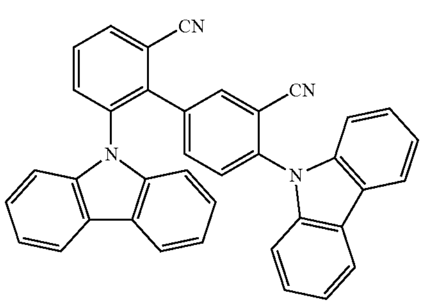
-continued
119
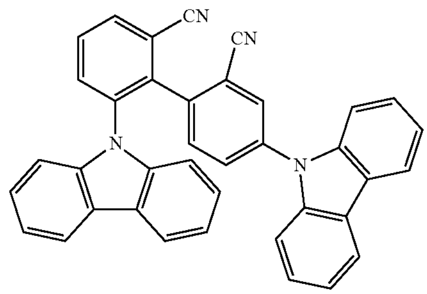
120
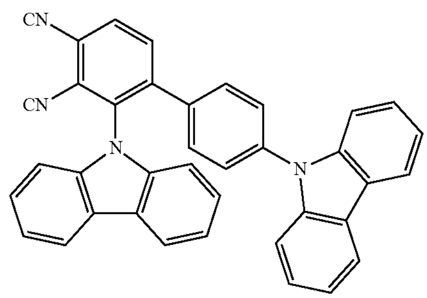
121
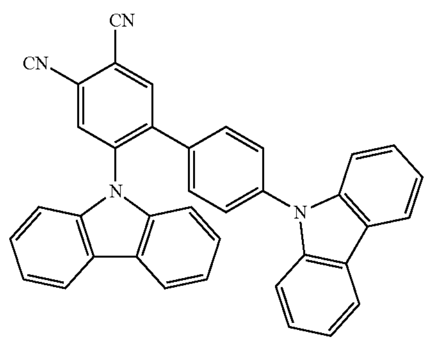
122
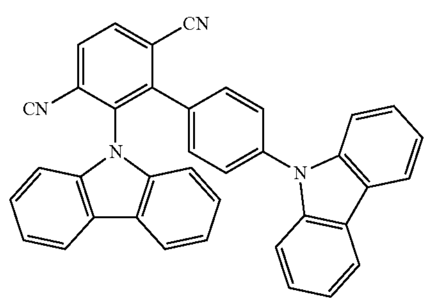
123
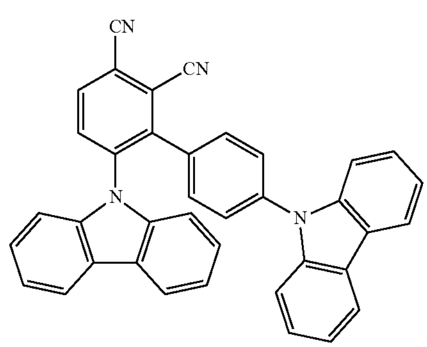

-continued
124
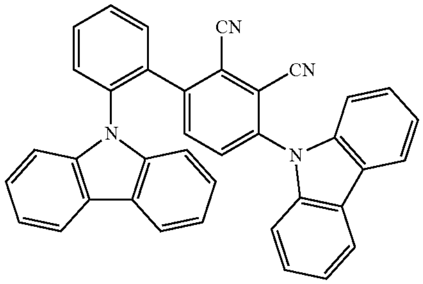
125
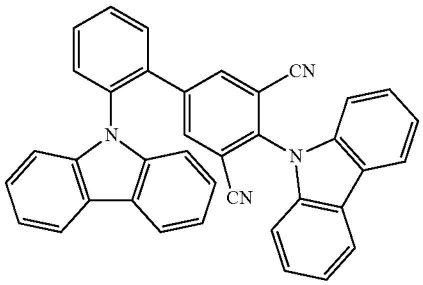
126
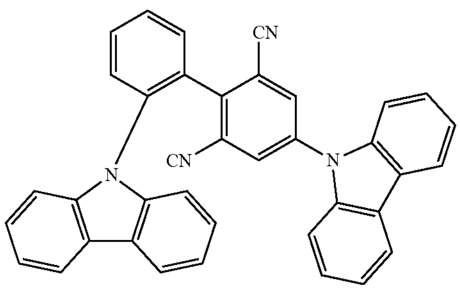
127
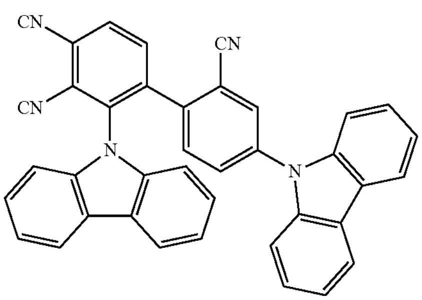
128
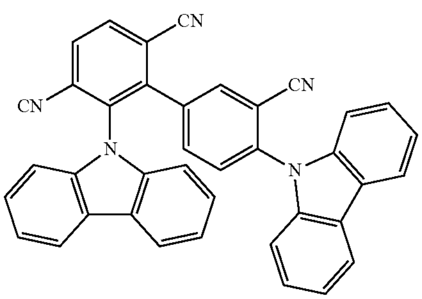
-continued
129
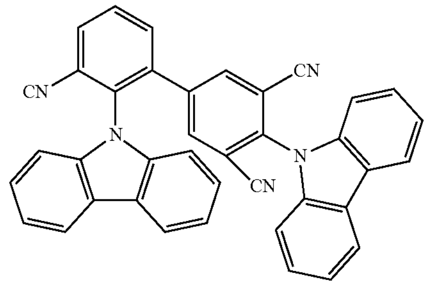
130
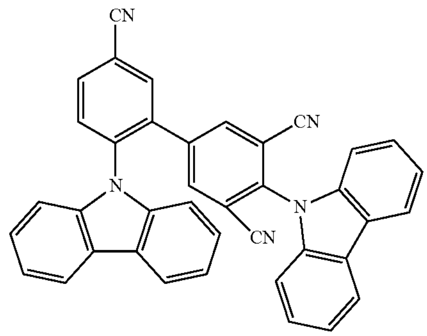
131
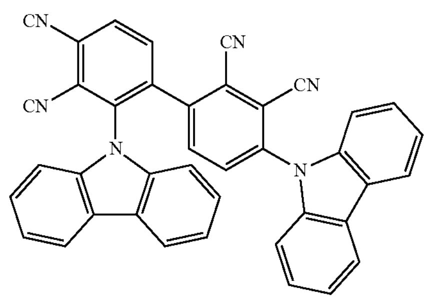
132
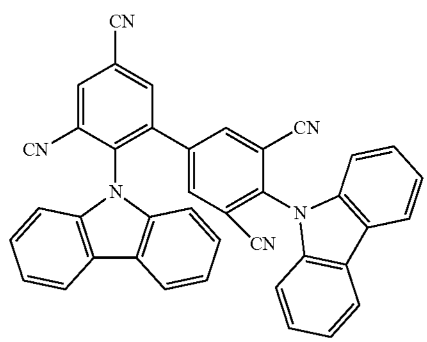
133
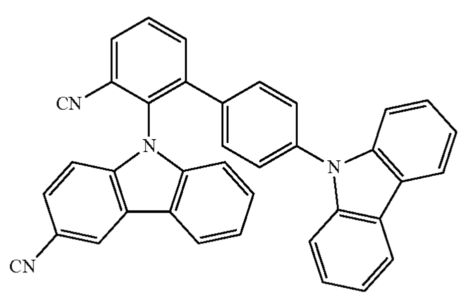

134
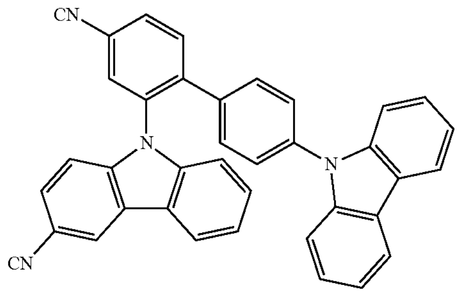
135
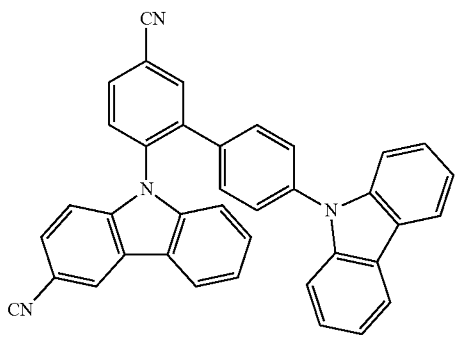
136
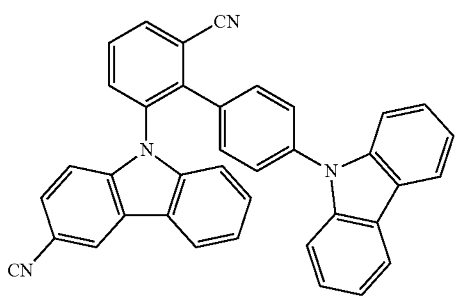
137
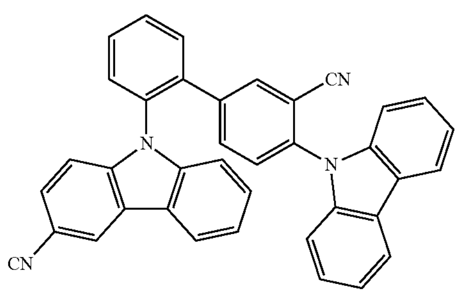
138
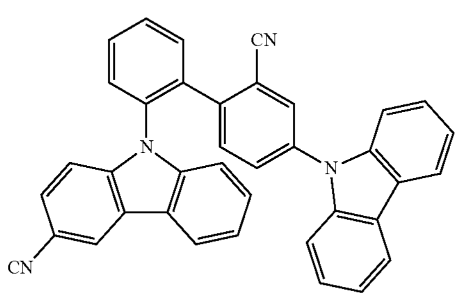
139
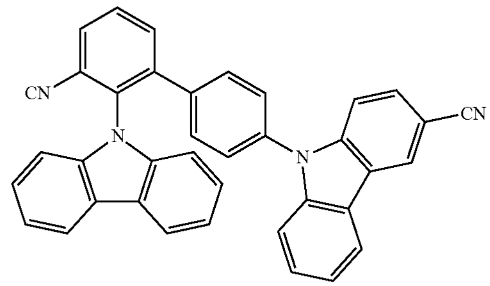
140
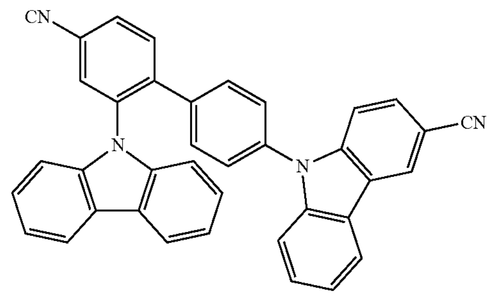
141
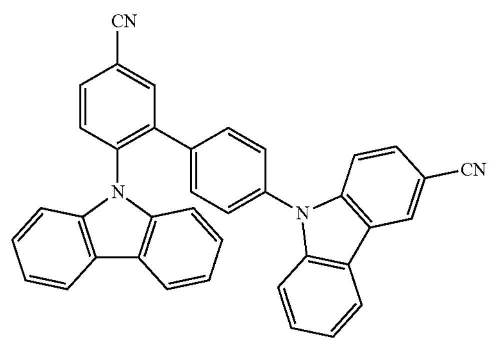
142
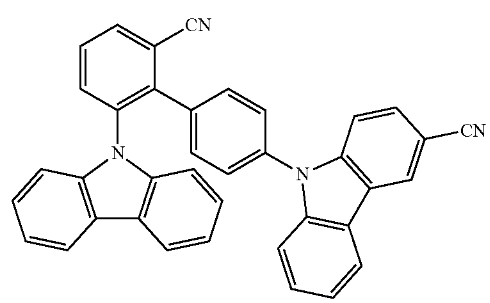
143
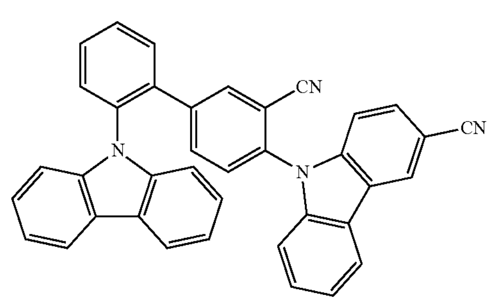

-continued
144
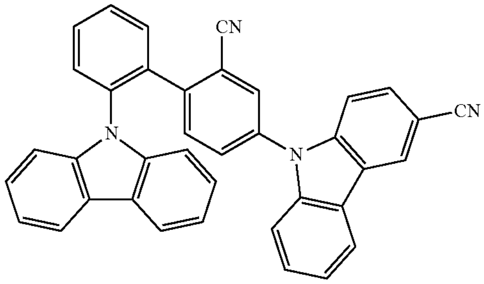
145
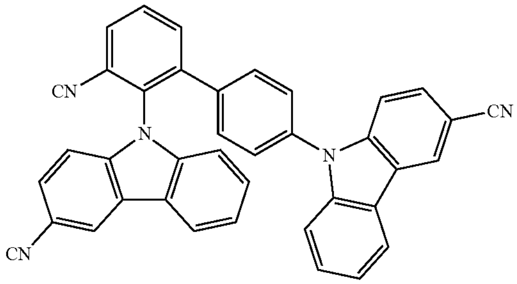
146
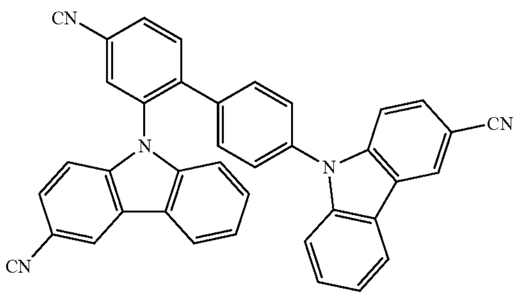
147
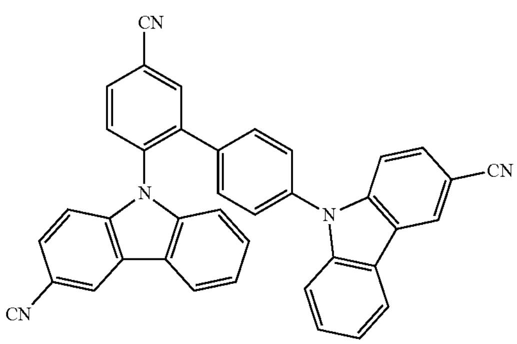
148
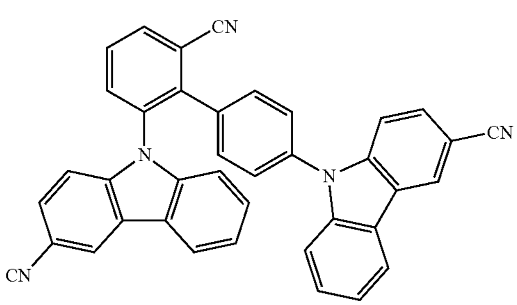
-continued
149
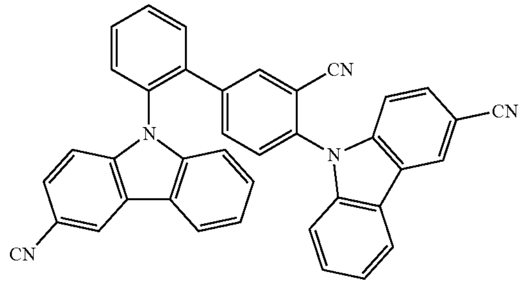
150
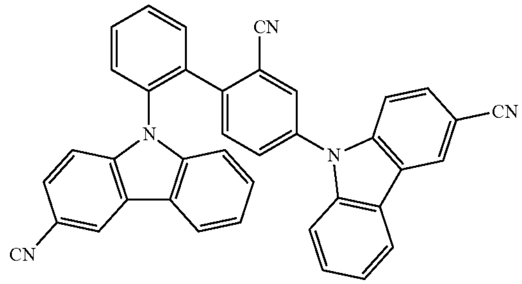
151
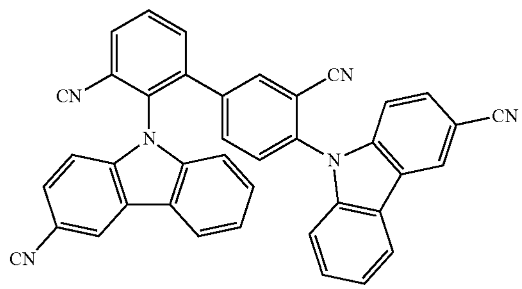
152
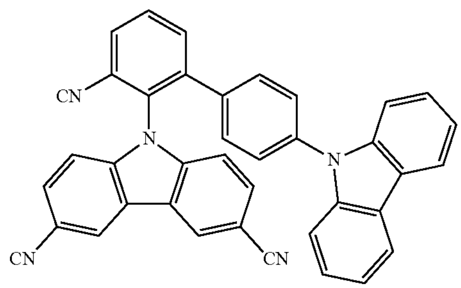
153
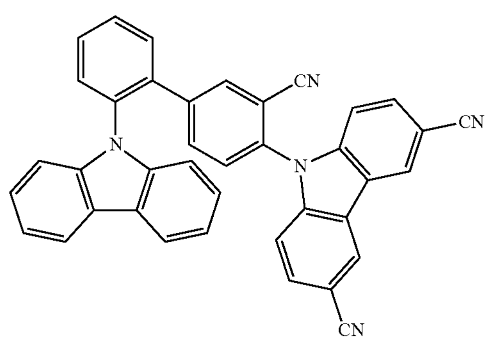

-continued
154
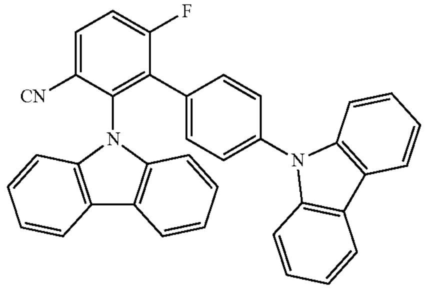
155
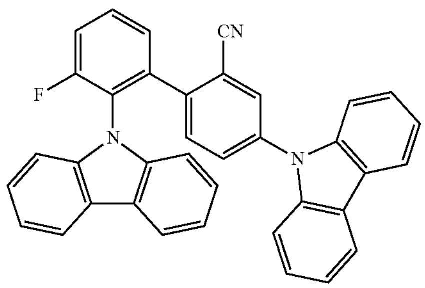
156
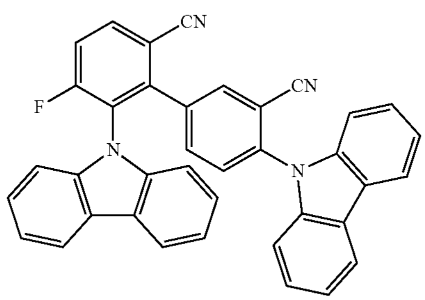
157
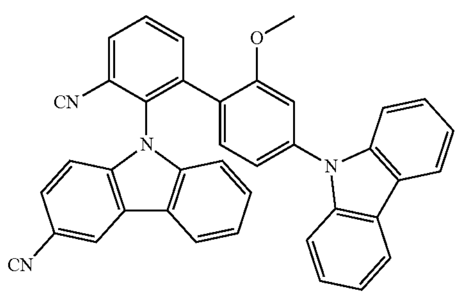
158
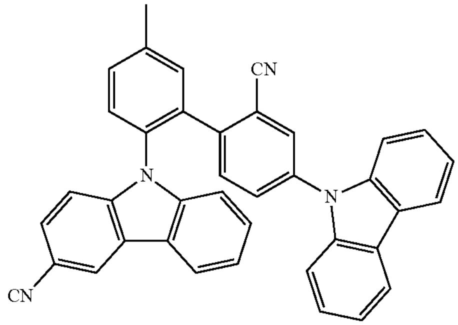
-continued
159
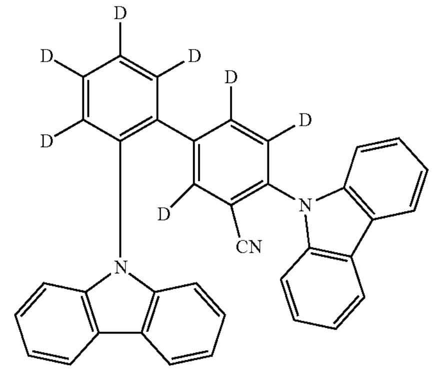
160
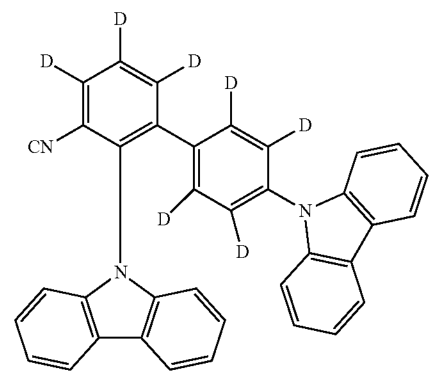
161
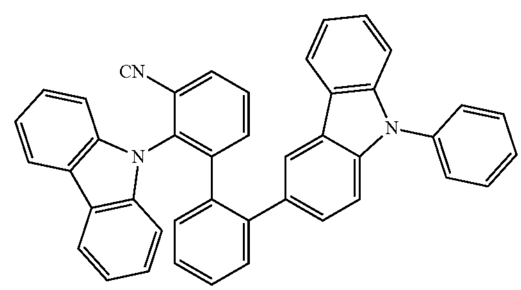
162
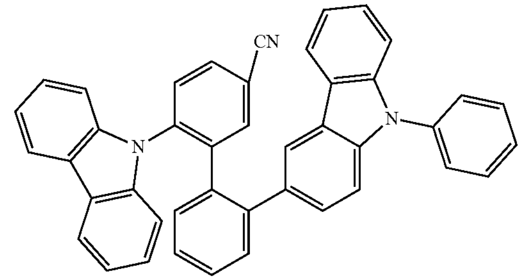

163
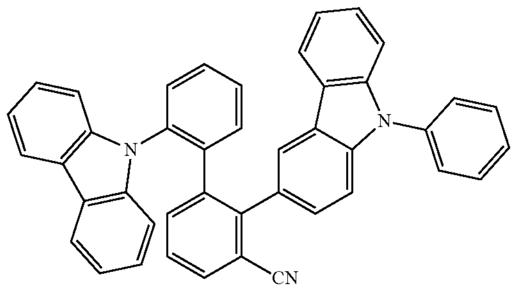
164
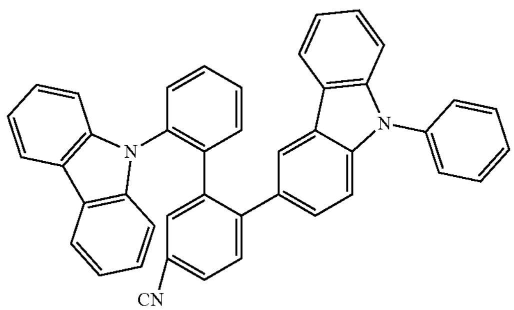
165
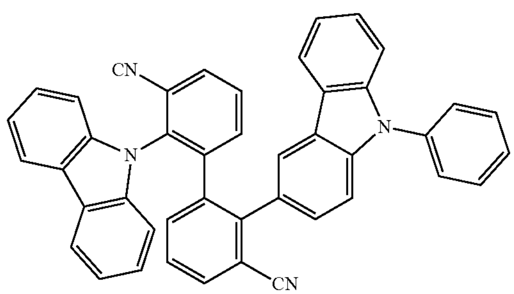
166
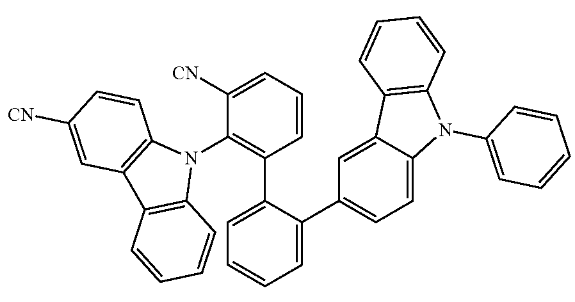
167
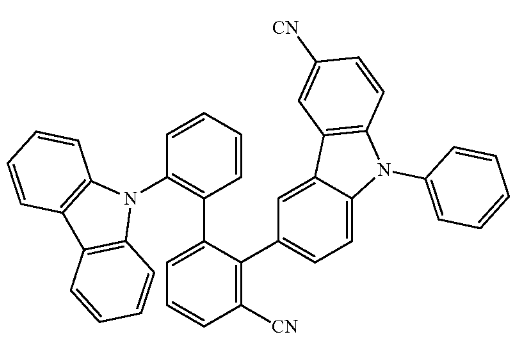
168
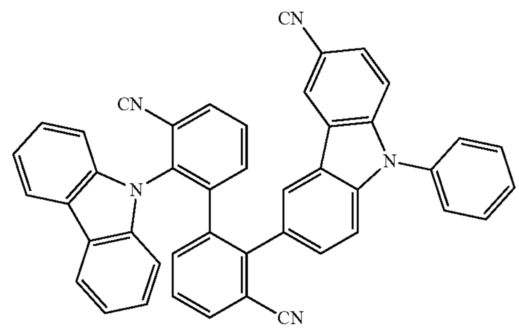
169
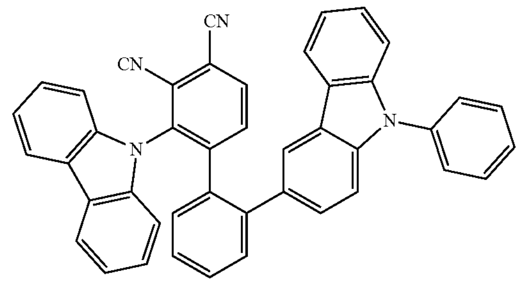
170
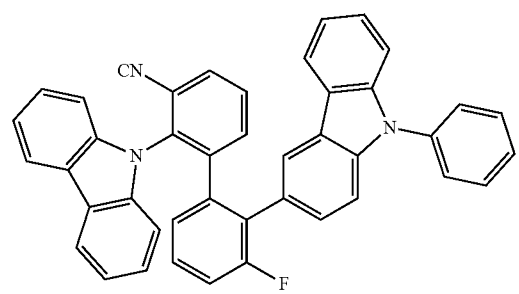
171
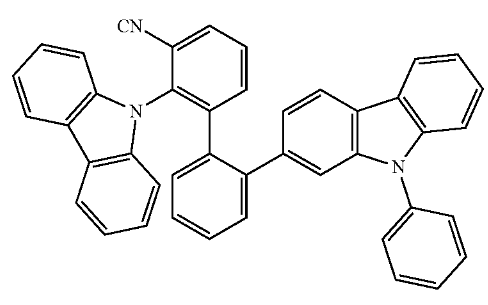
172
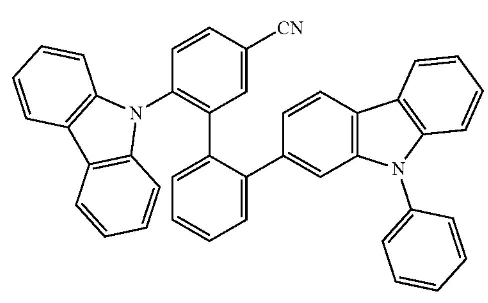

-continued
173
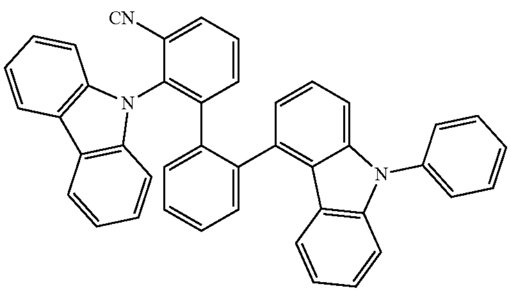
174
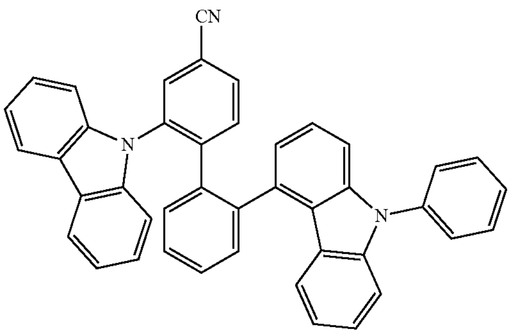
175
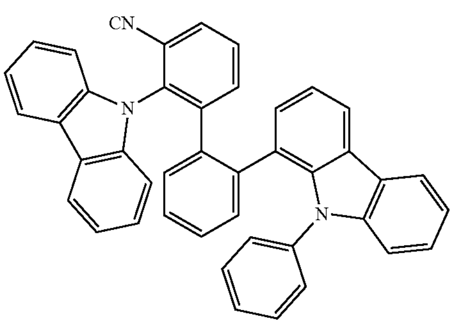
176
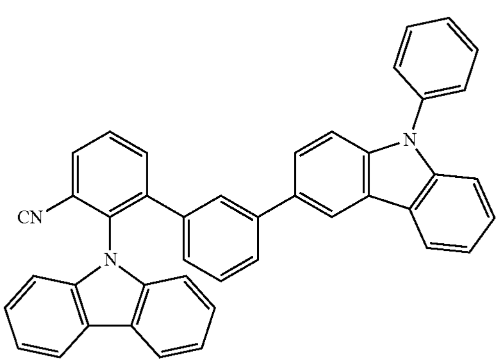
-continued
177
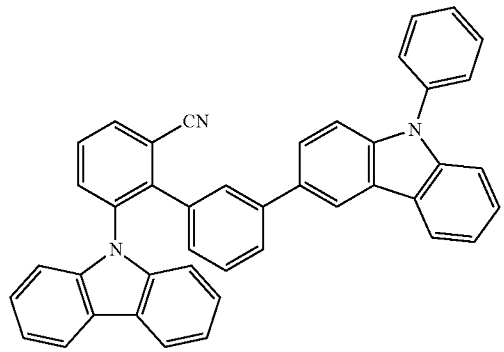
178
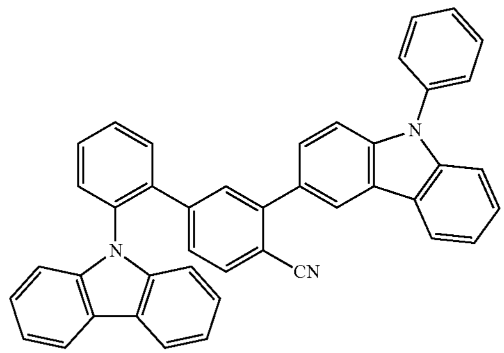
179
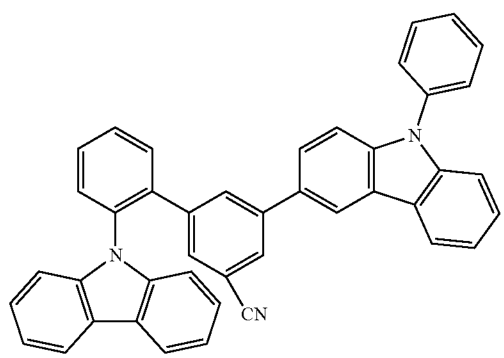
180
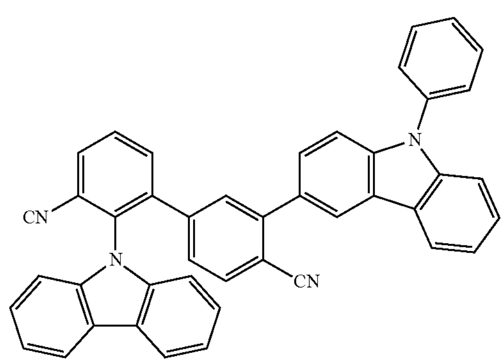

-continued
181
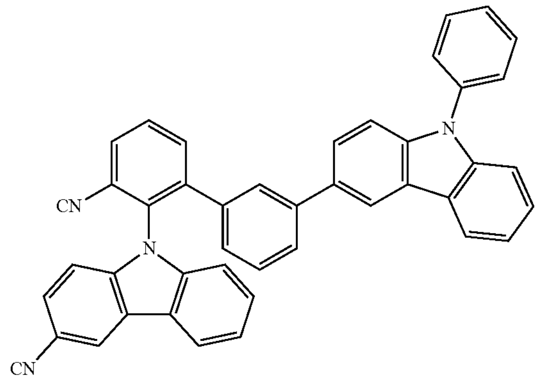
182
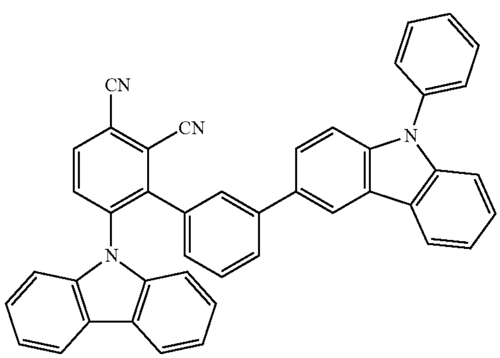
183
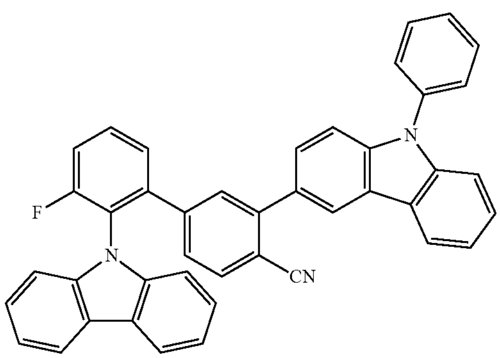
184
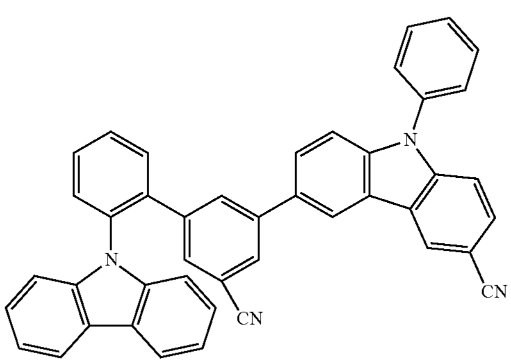
-continued
185
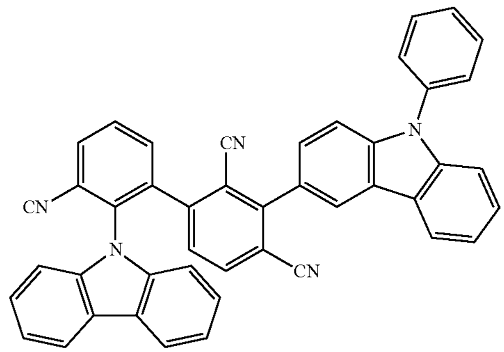
186
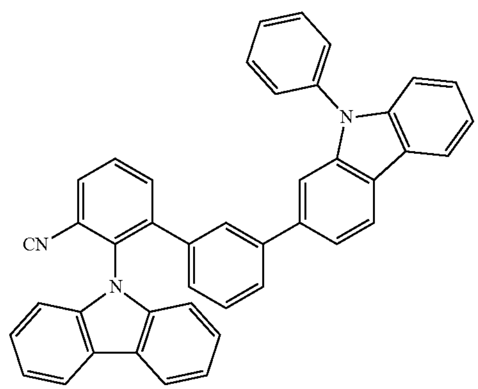
187
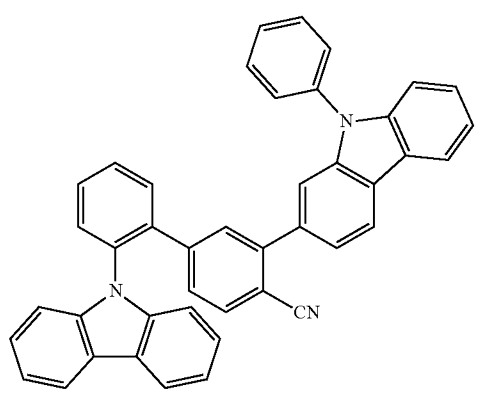
188
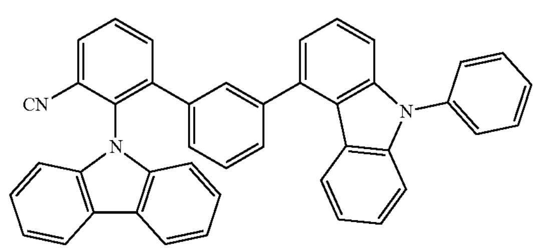

-continued
189
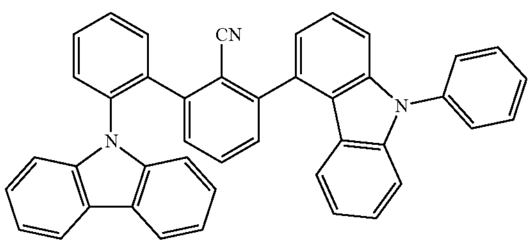
190
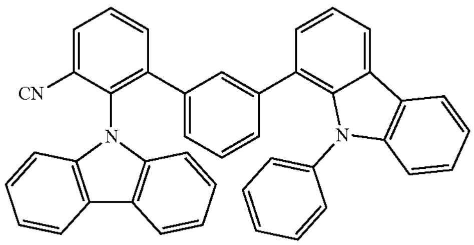
191
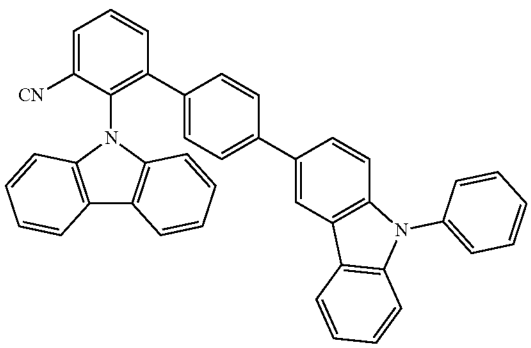
192
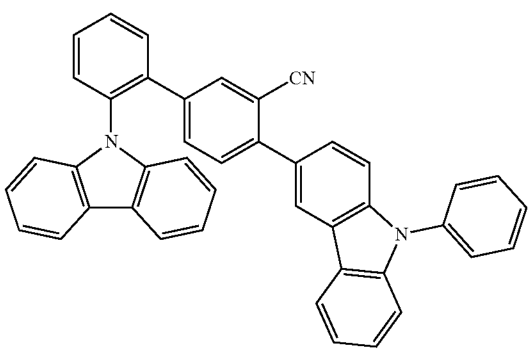
193
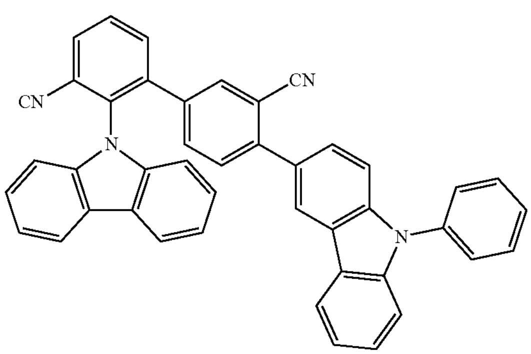
-continued
194
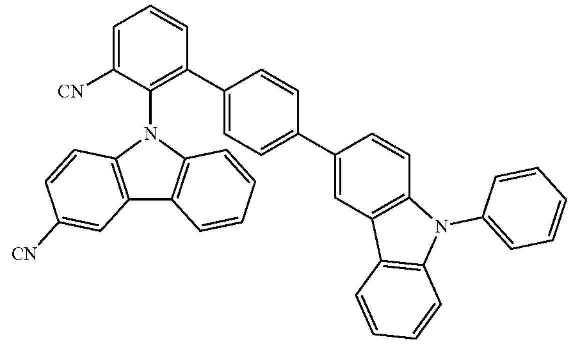
195
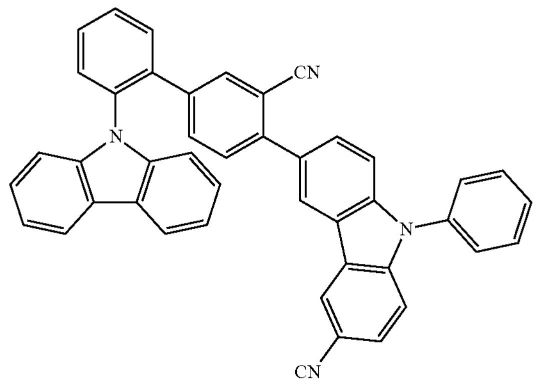
196
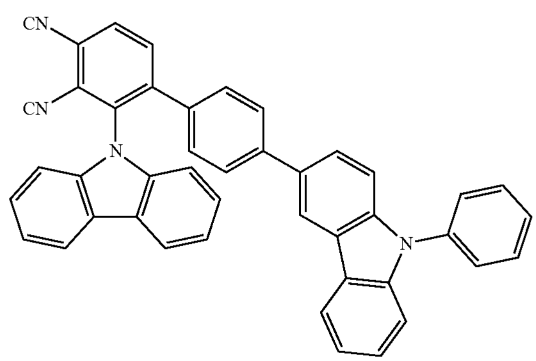
197
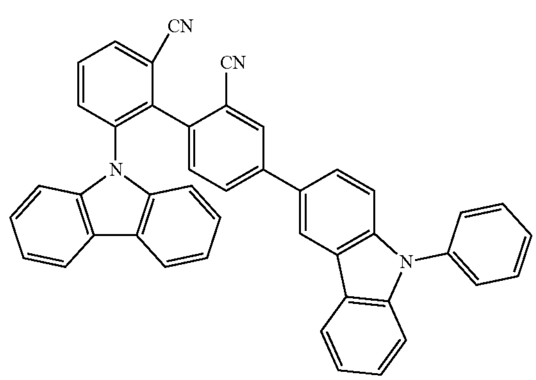

-continued
198
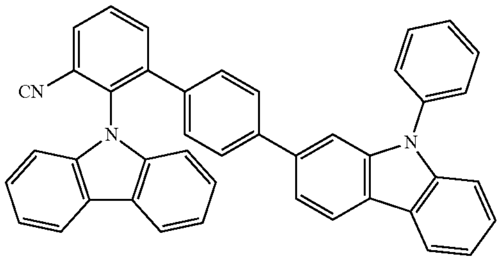
199
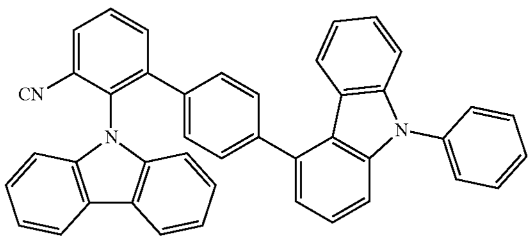
200
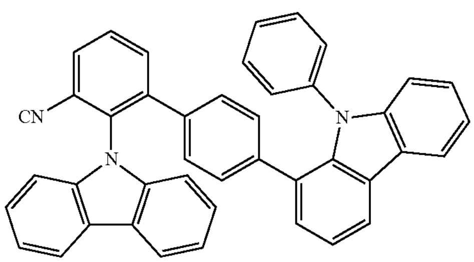
201
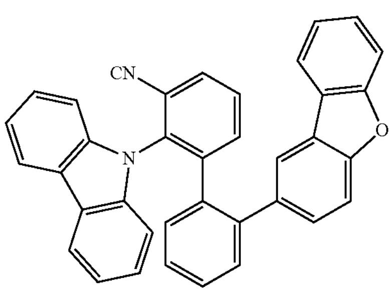
202
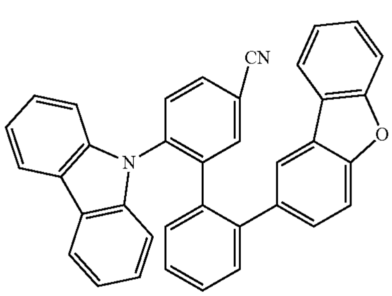
-continued
203
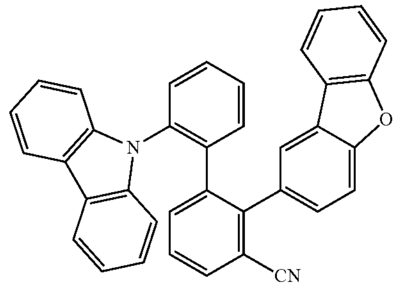
204
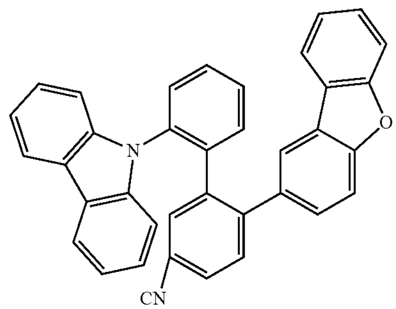
205
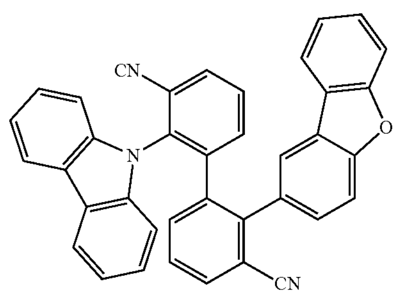
206
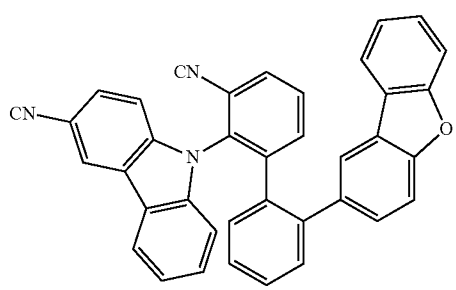
207
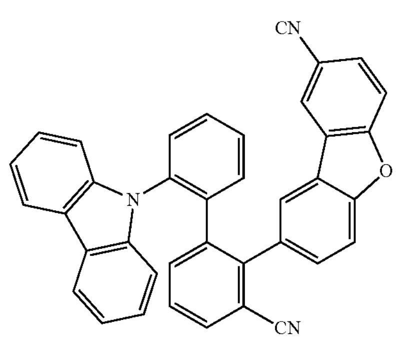

-continued
208
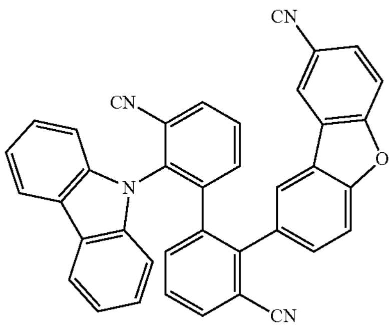
209
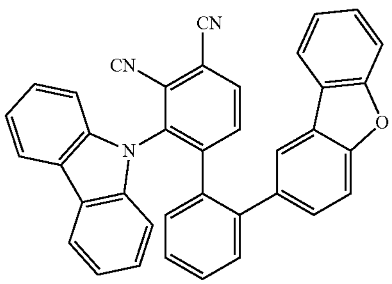
210
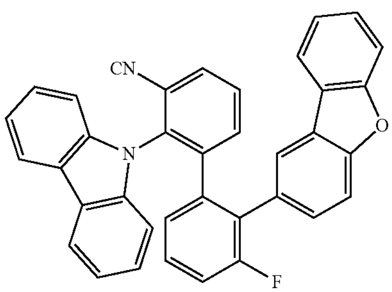
211
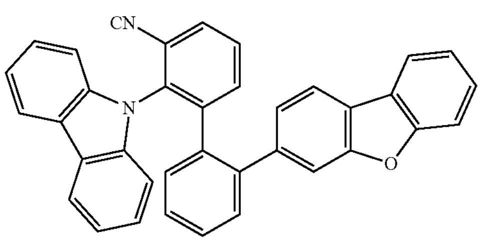
212
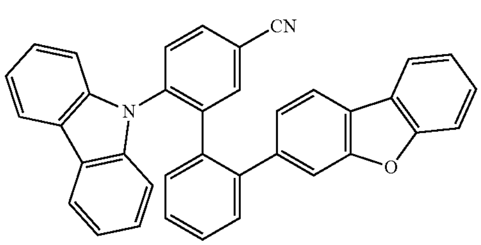
-continued
213
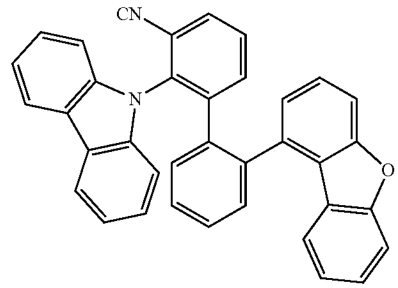
214
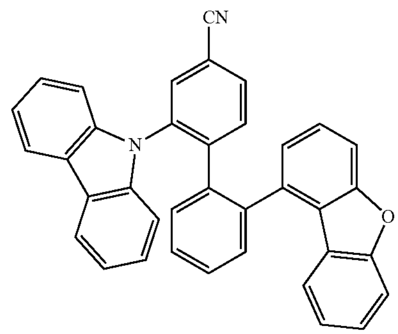
215
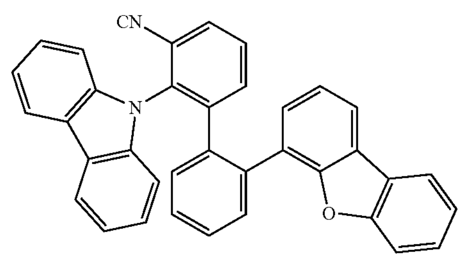
216
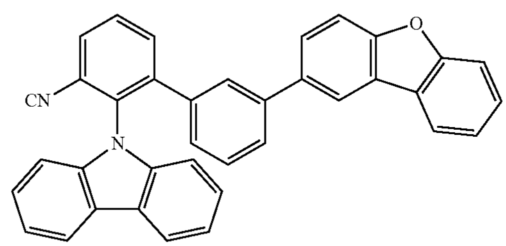
217
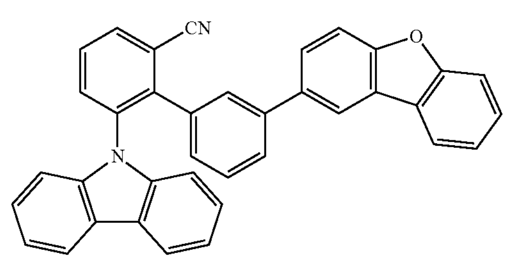

-continued
218
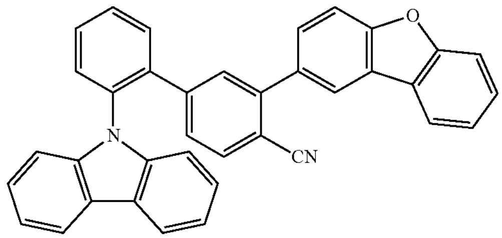
219
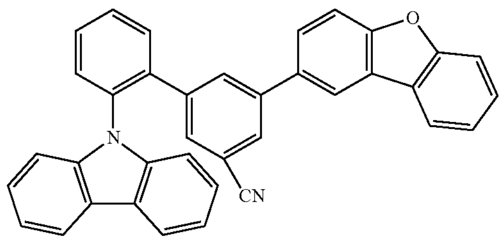
220
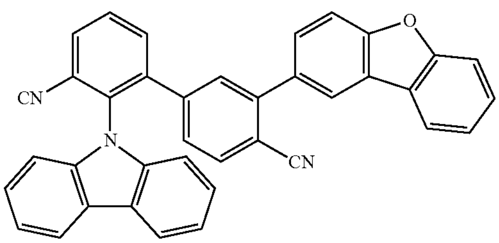
221
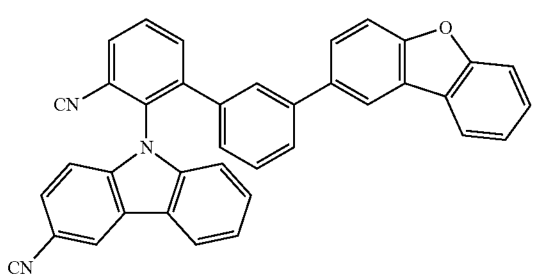
222
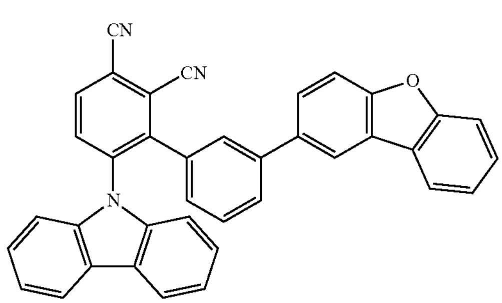
-continued
2223
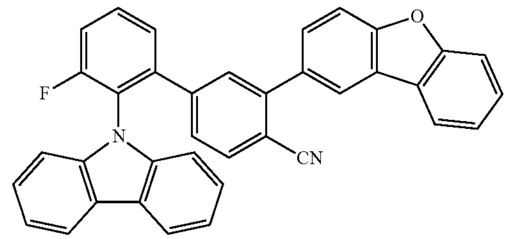
224
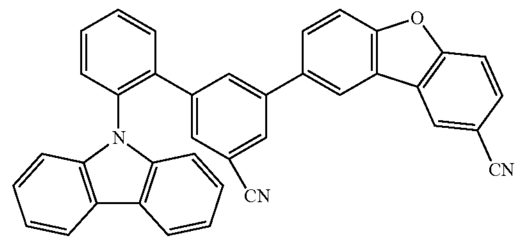
225
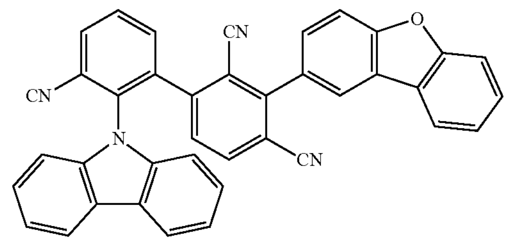
226
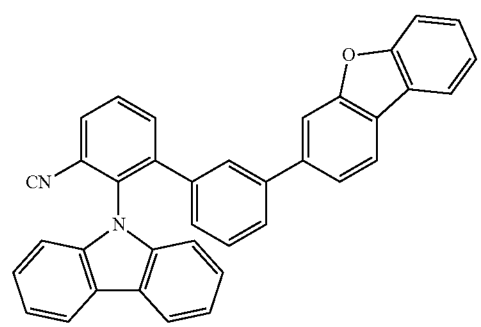
227
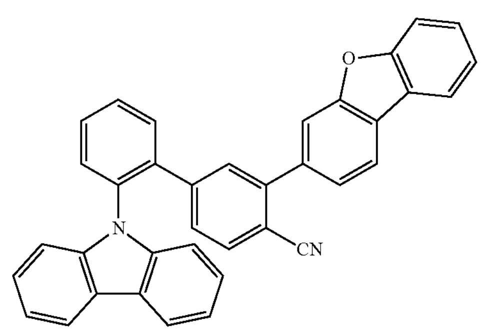

-continued
228
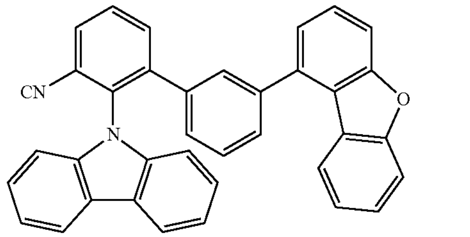
229
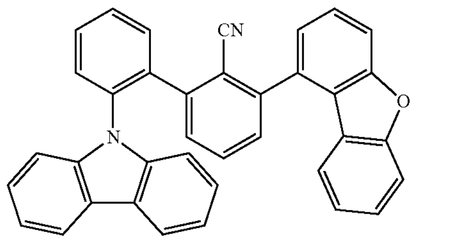
230
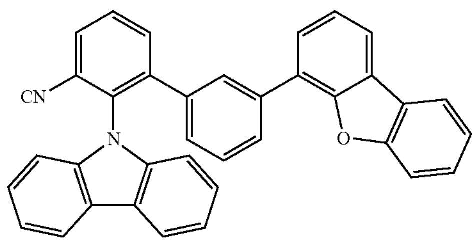
231
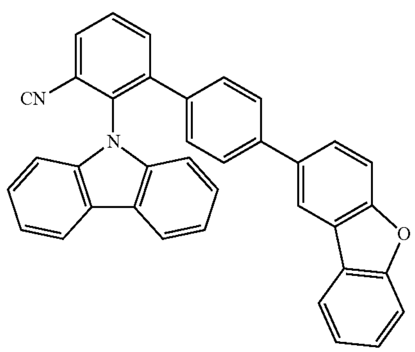
232
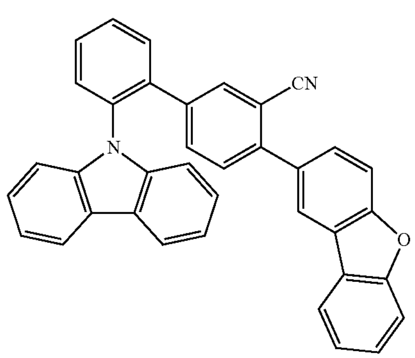
-continued
233
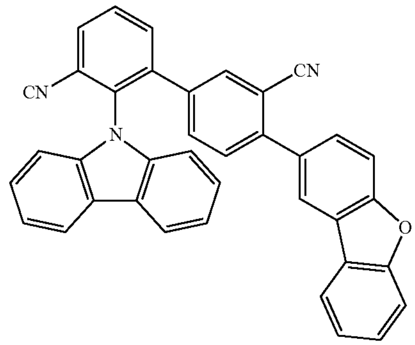
234
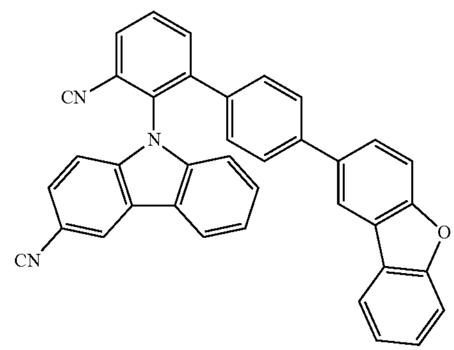
235
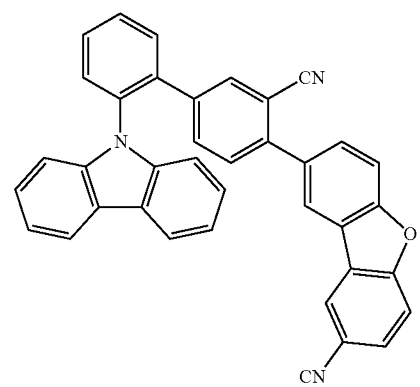
236
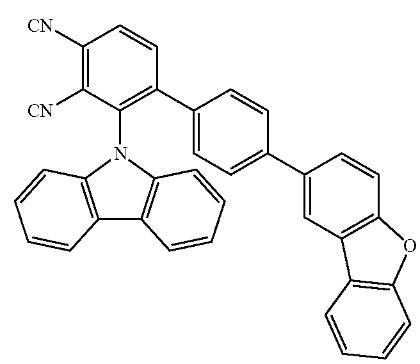

-continued
237
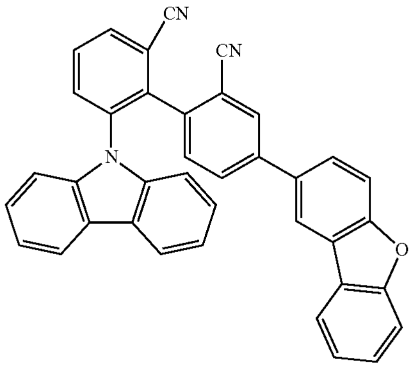
238
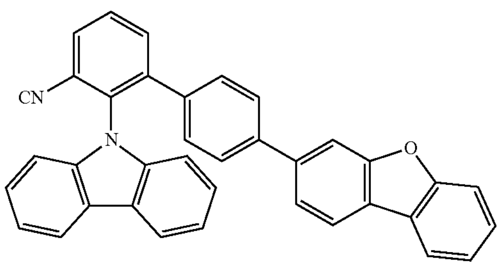
239
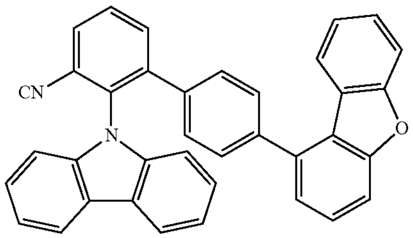
240
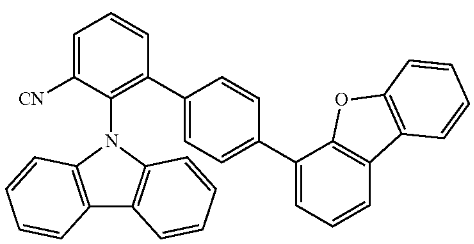
241
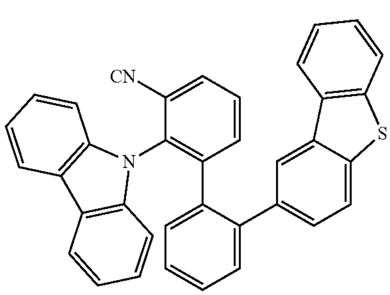
-continued
242
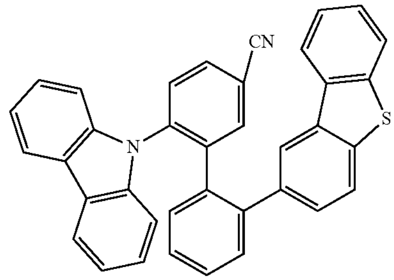
243
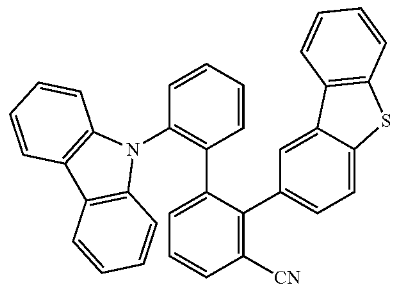
244
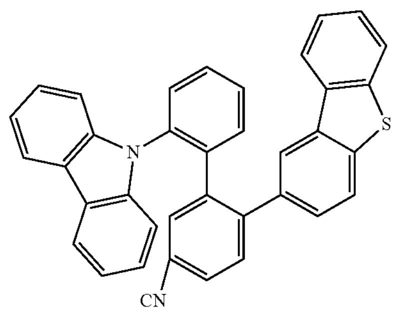
245
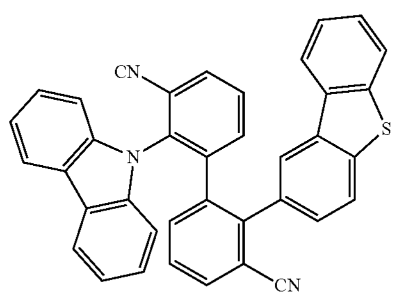
246
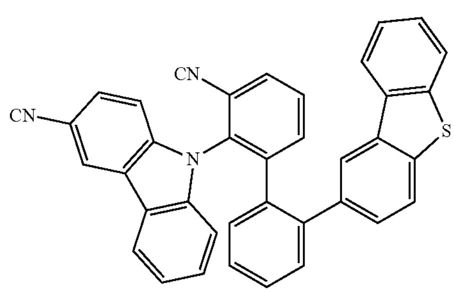

-continued
247
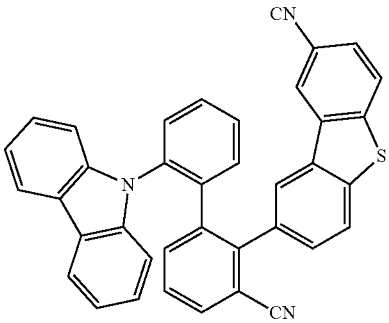
248
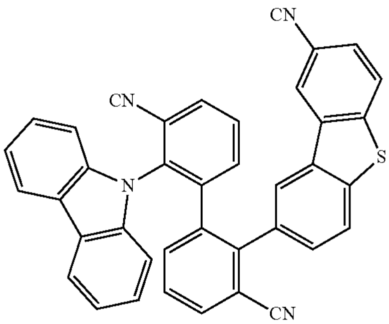
249
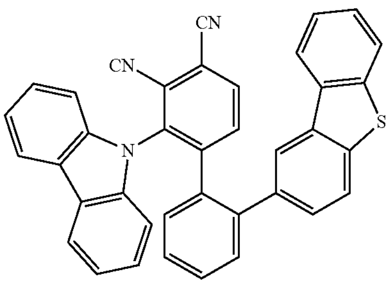
250
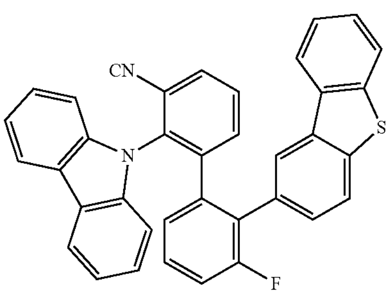
251
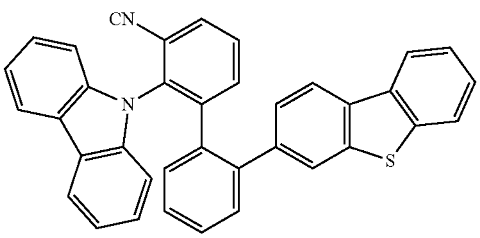
-continued
252
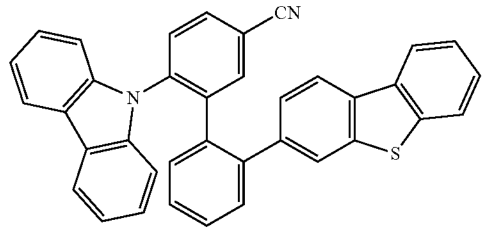
253
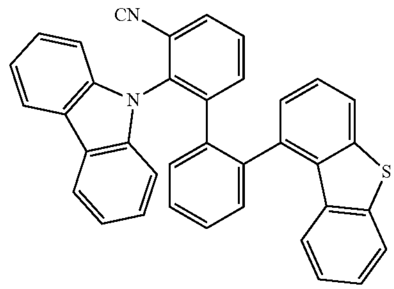
254
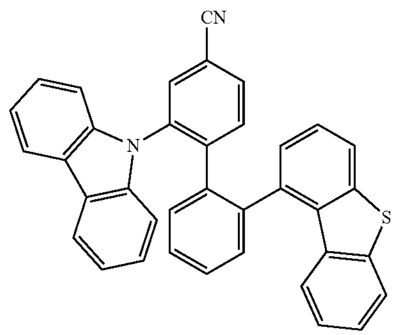
255
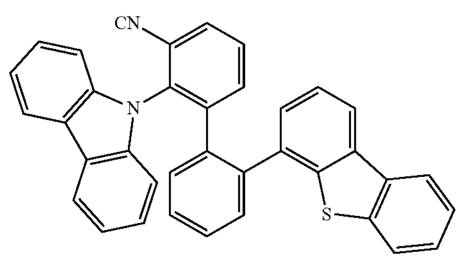
256
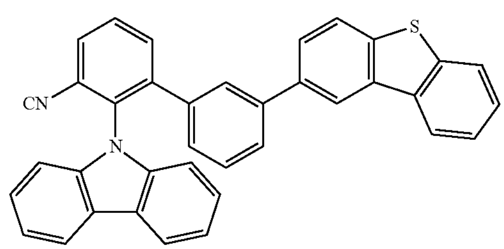

257
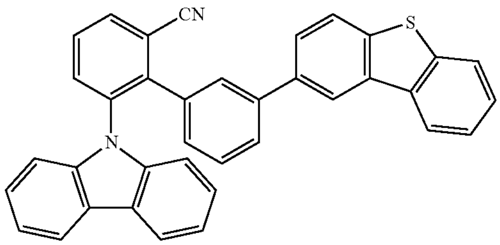
258
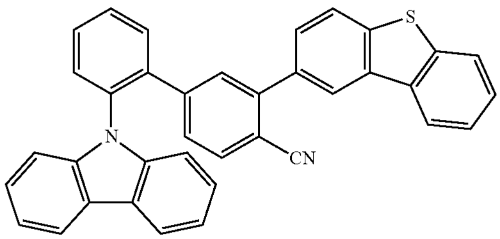
259
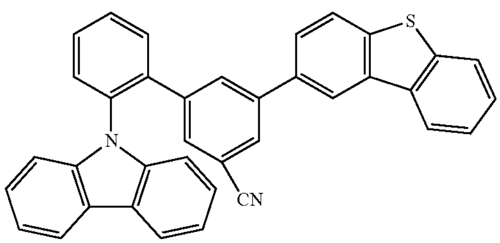
260
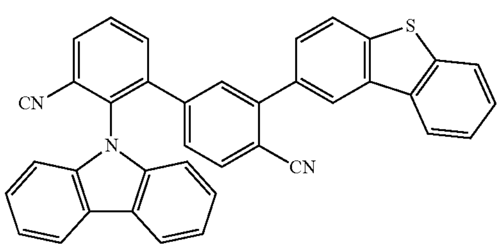
261
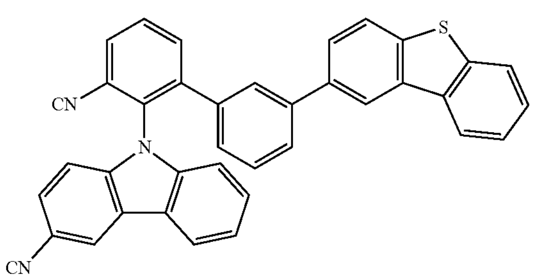
262
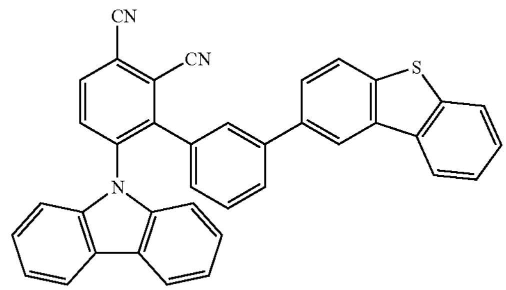
263
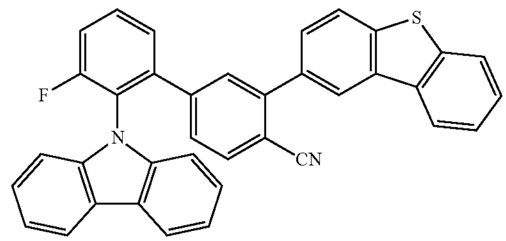
264
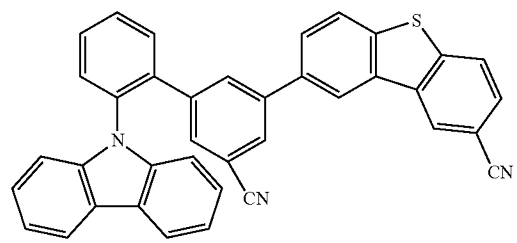
265
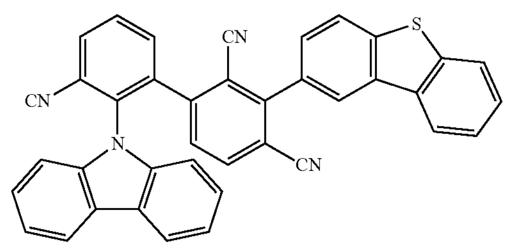
266
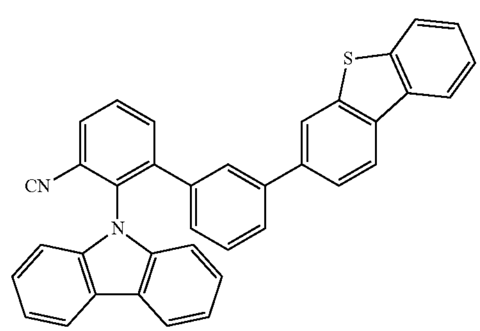

-continued
267
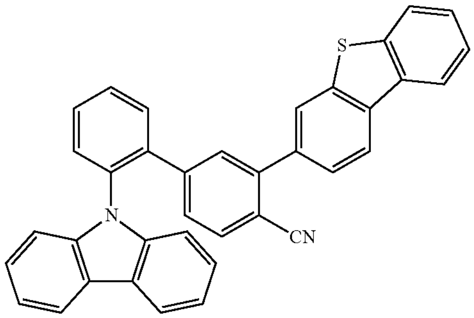
268
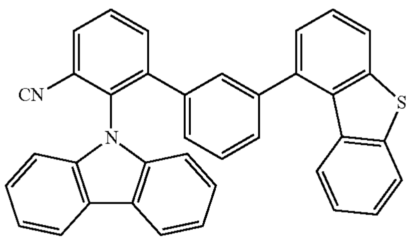
269
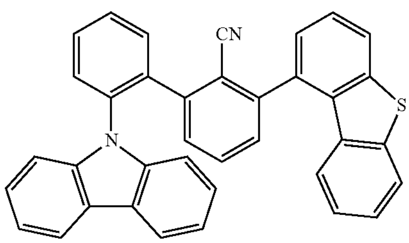
270
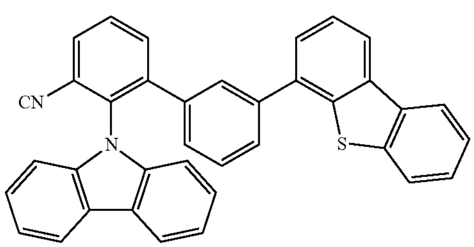
271
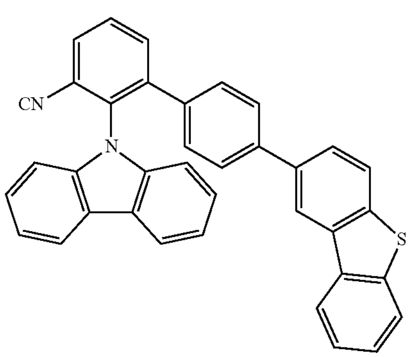
-continued
272
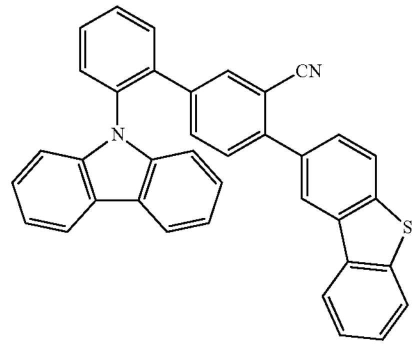
273
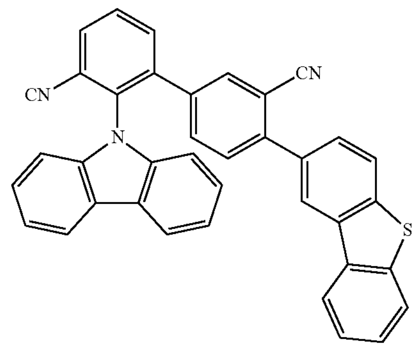
274
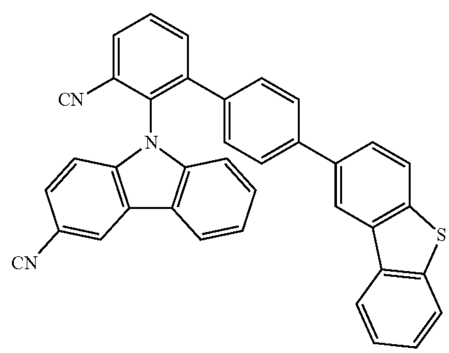
275
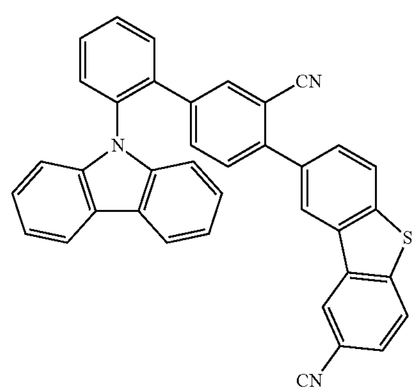

-continued
276
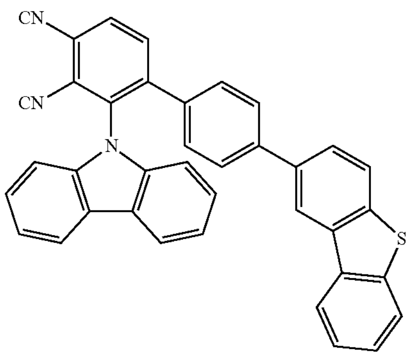
277
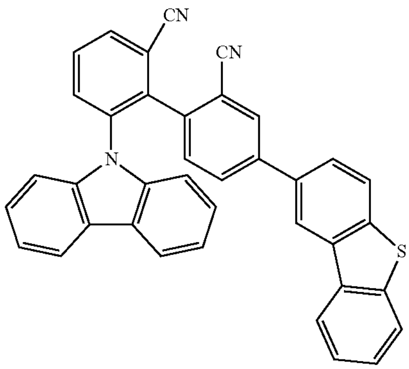
278
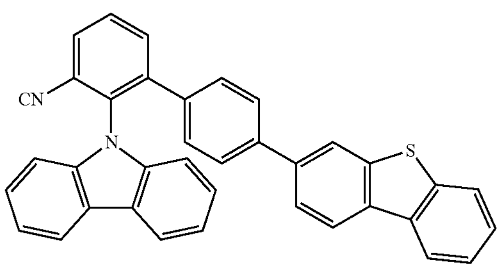
279
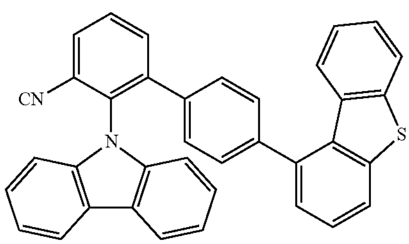
280
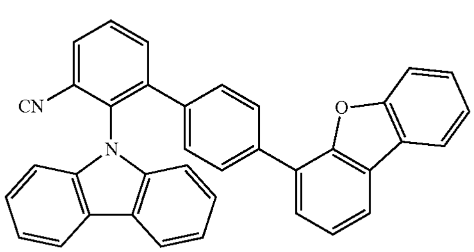
-continued
281
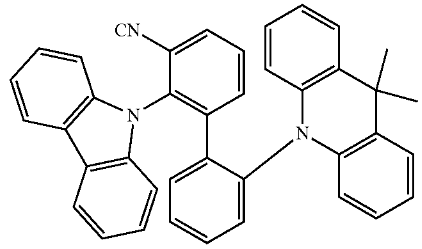
282
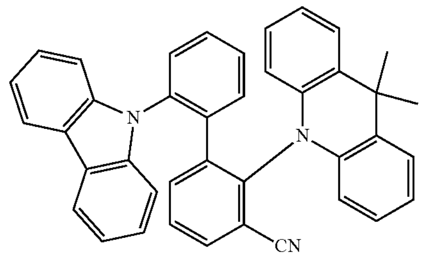
283
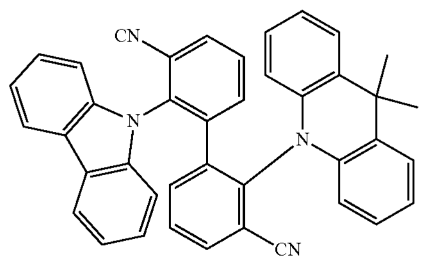
284
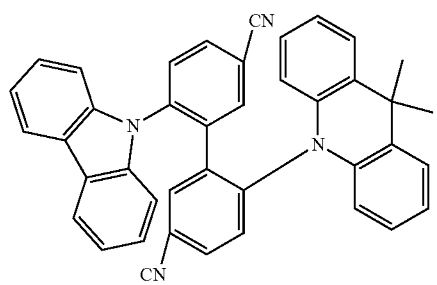
285
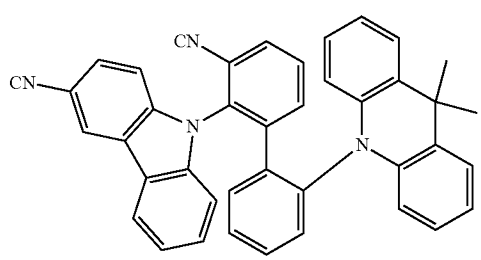
286
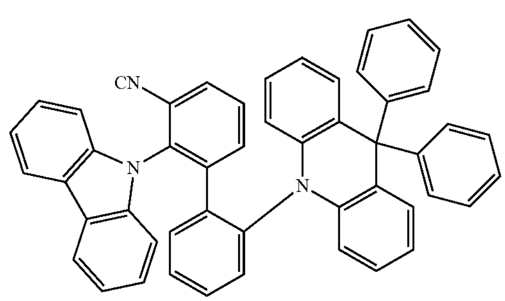

-continued
287
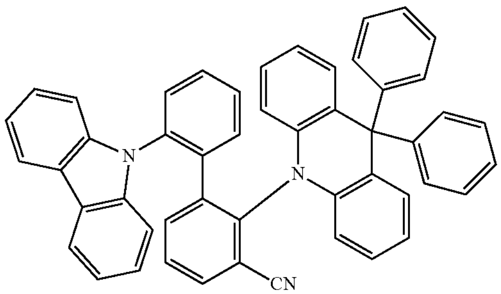
288
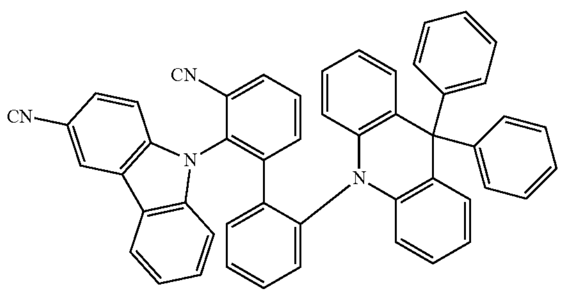
289
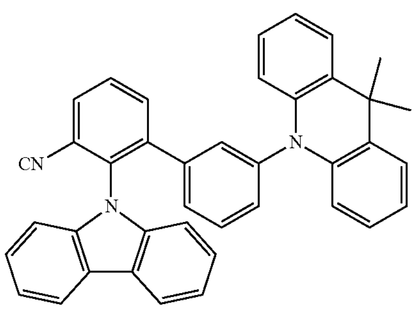
290
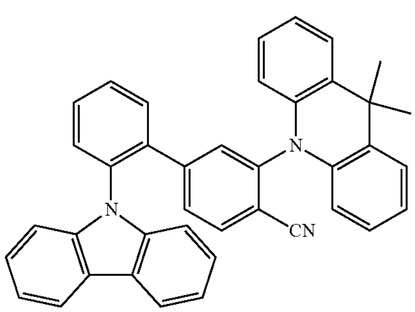
291
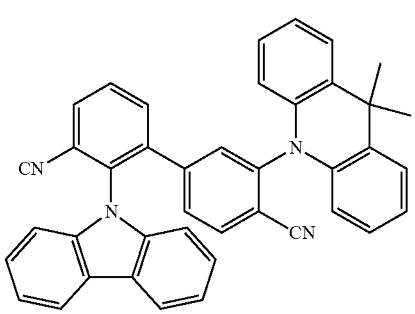
-continued
292
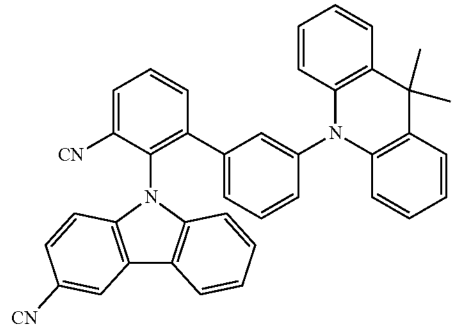
293
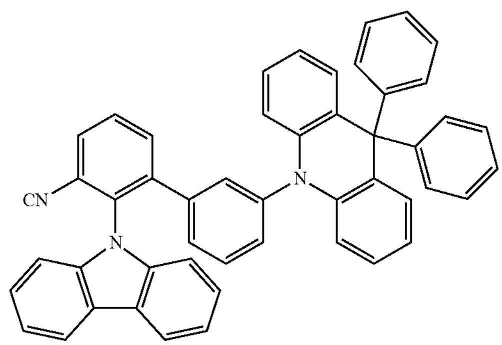
294
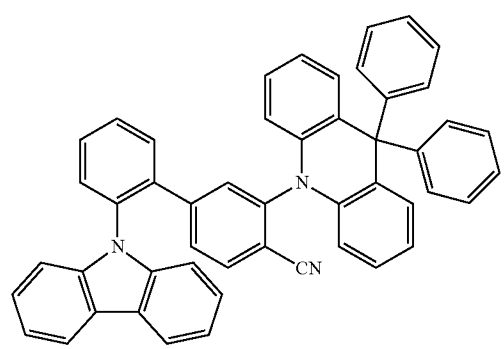
295
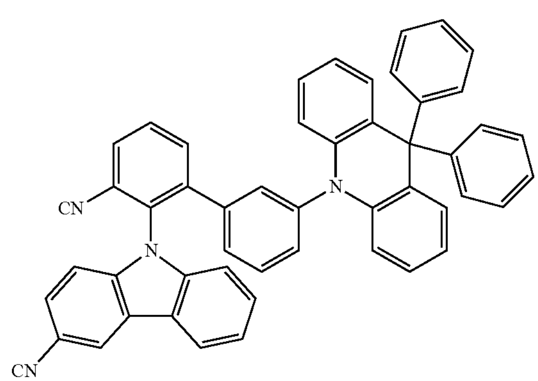

-continued
296
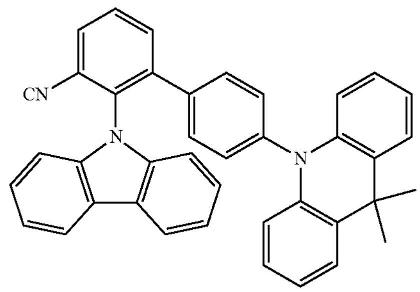
297
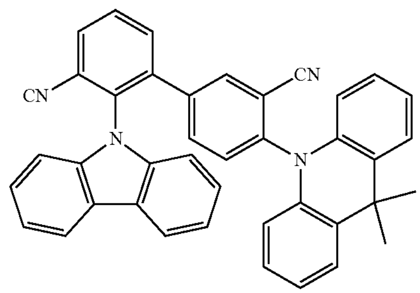
298
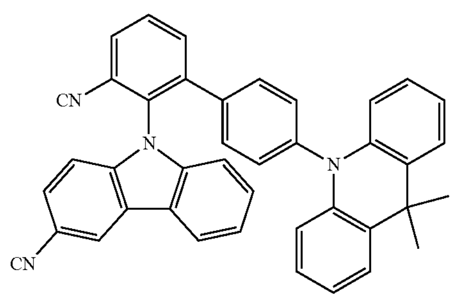
299
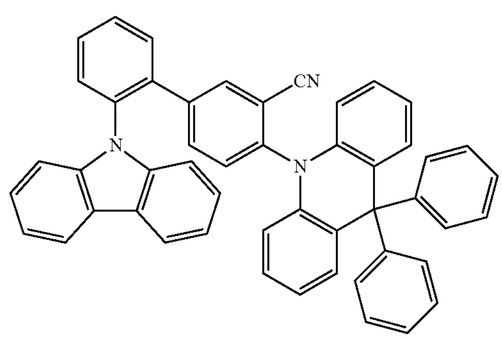
300
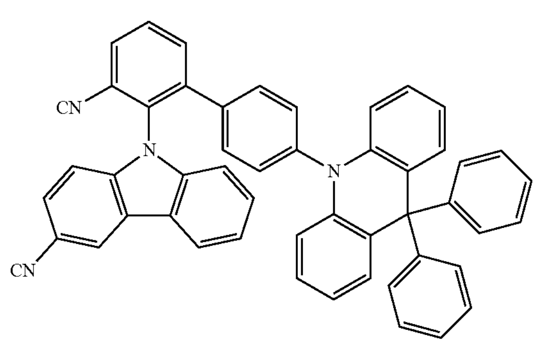
301
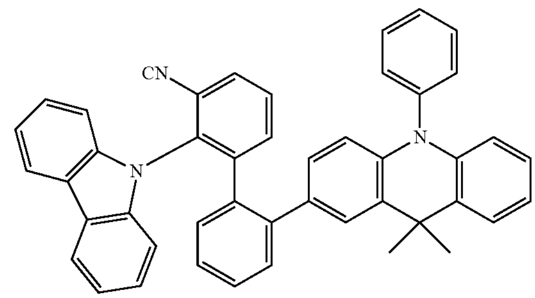
302
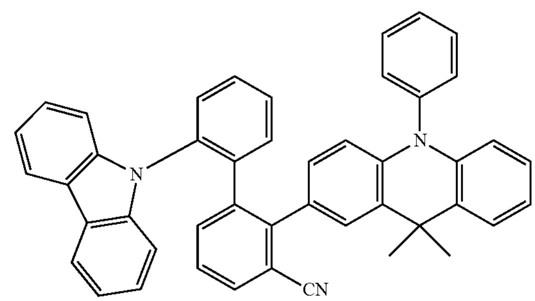
303
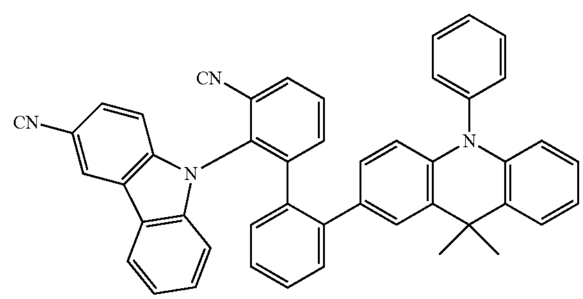
304
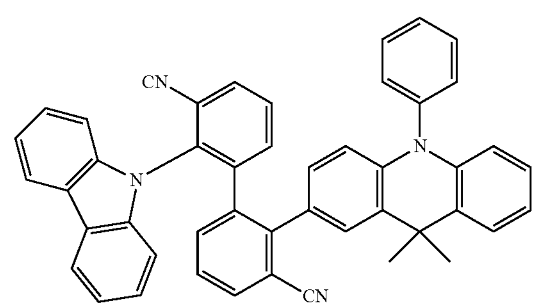
305
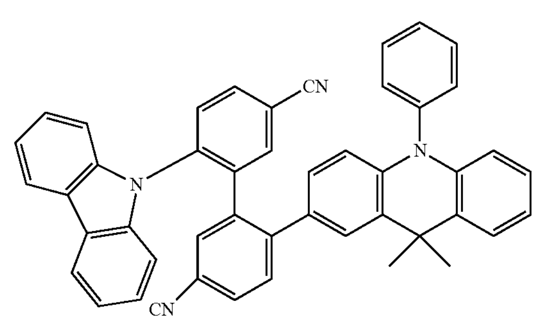

-continued
306
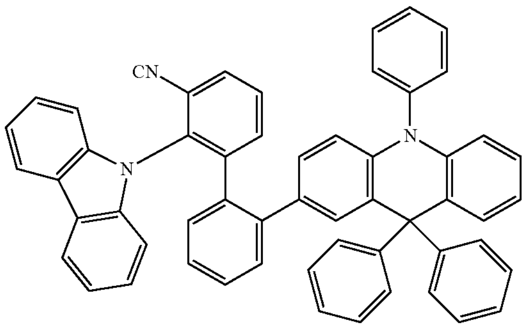
307
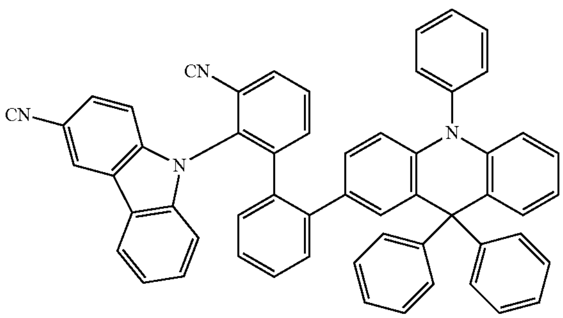
308
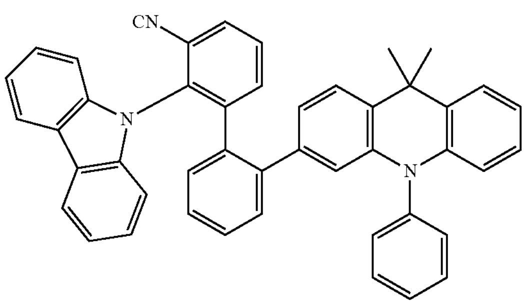
309
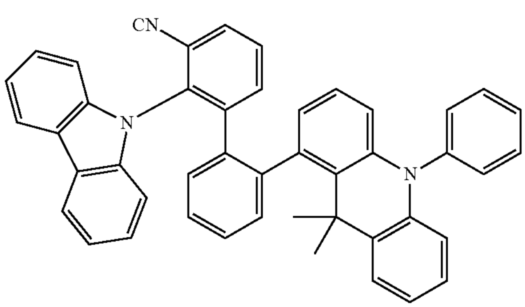
310
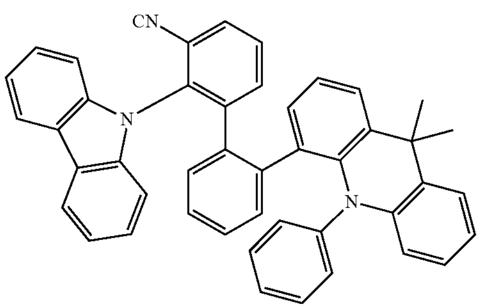
-continued
311
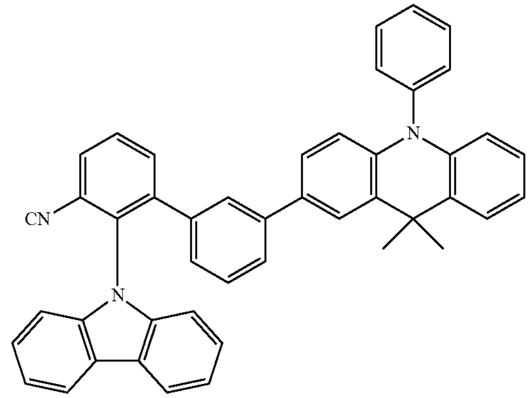
312
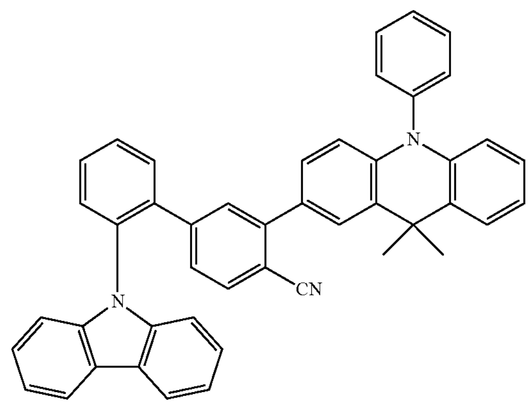
313
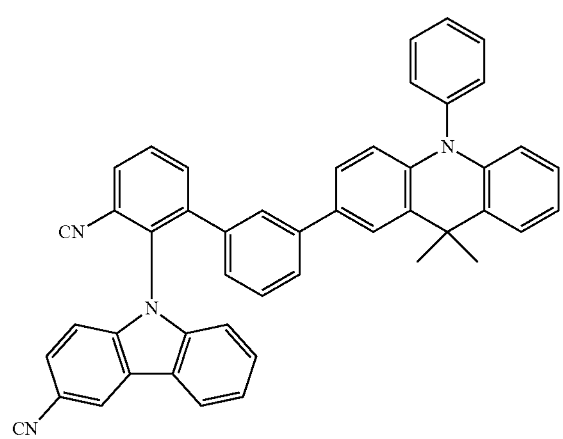

-continued
314
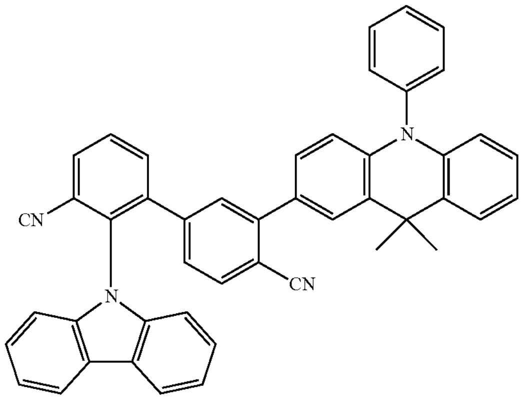
315
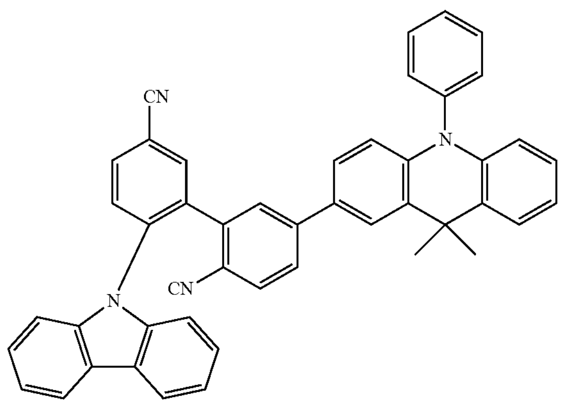
316
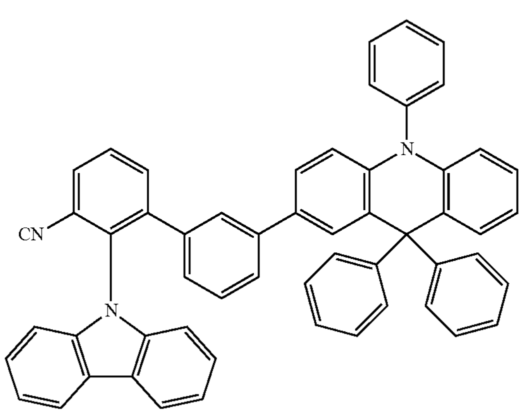
-continued
317
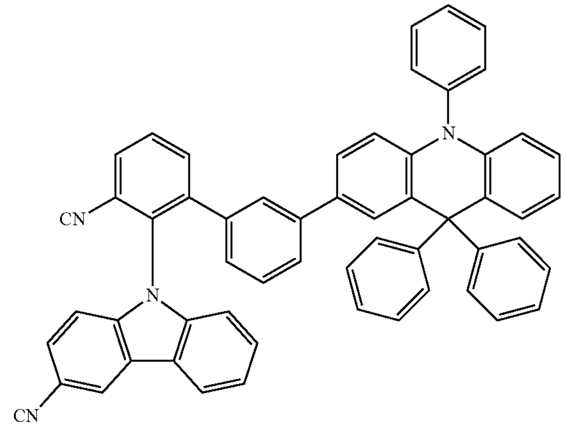
318
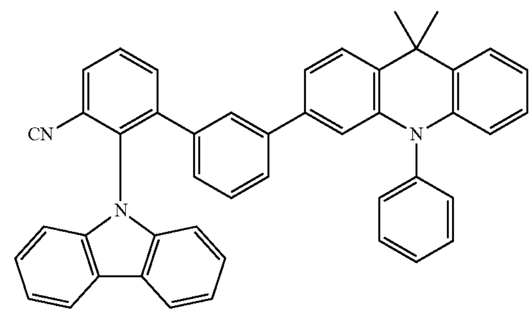
319
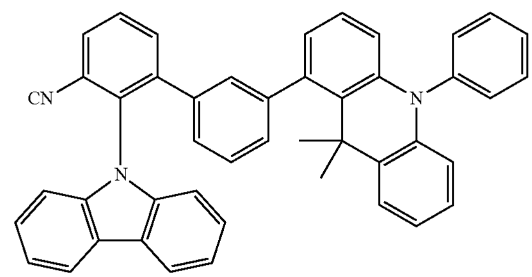
320
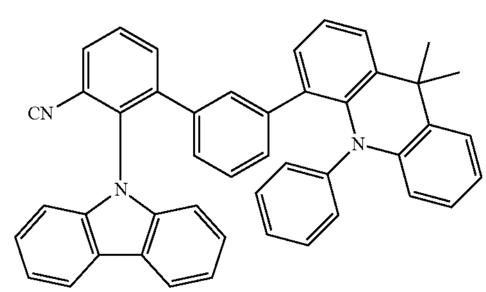

-continued
321
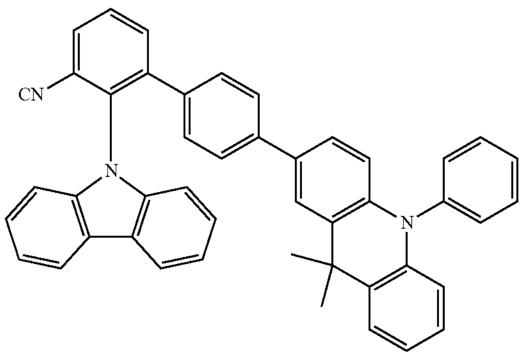
322
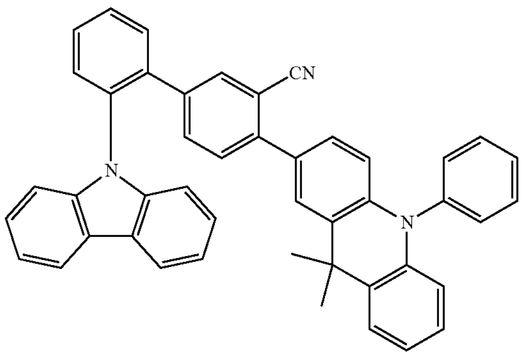
323
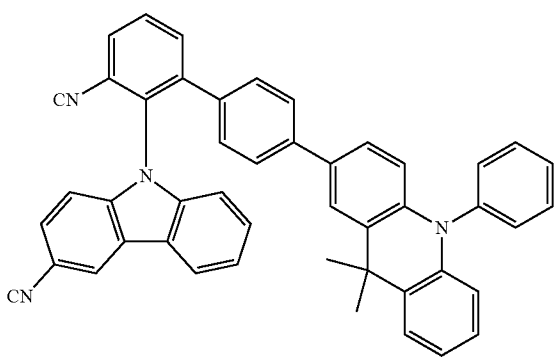
324
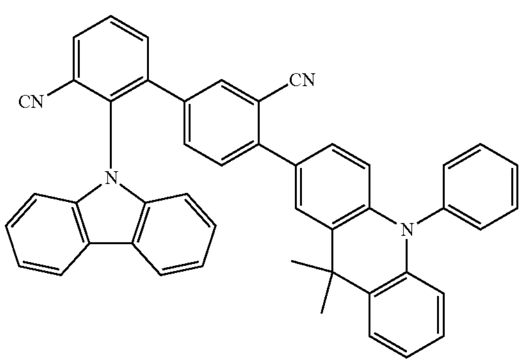
-continued
325
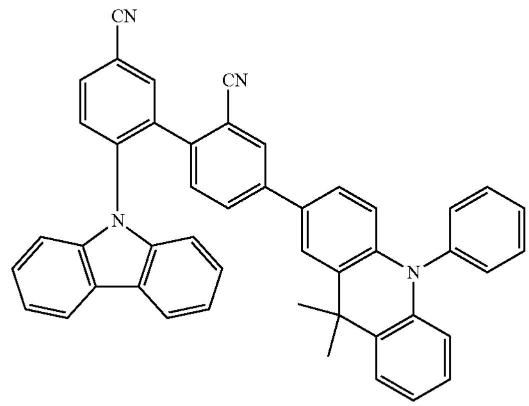
326
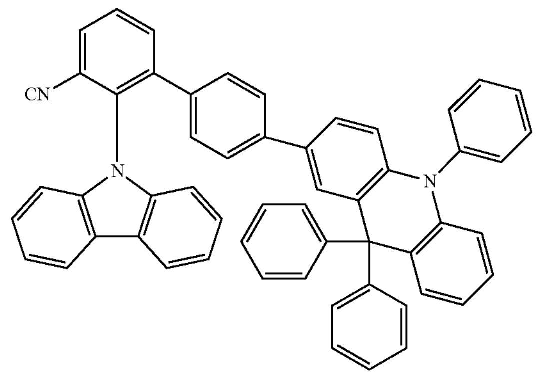
327
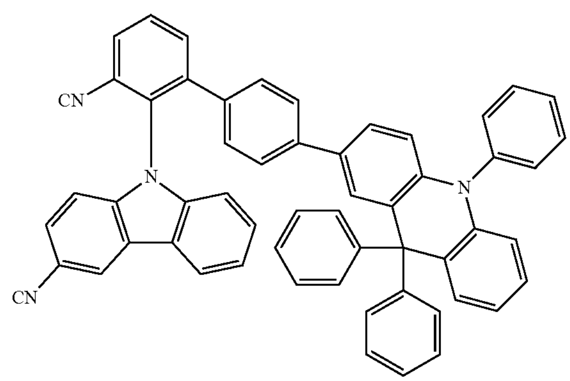
328
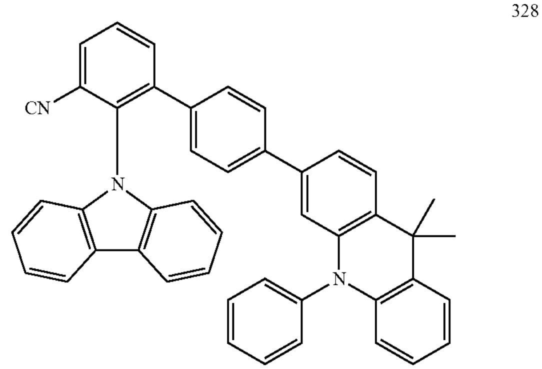

329
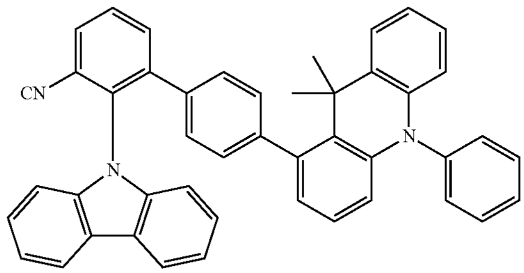
330
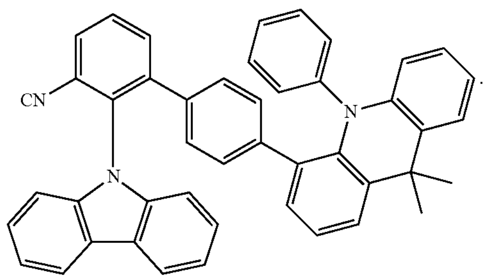
Group HE7
1
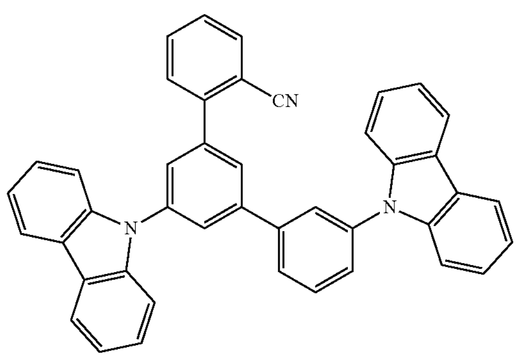
2
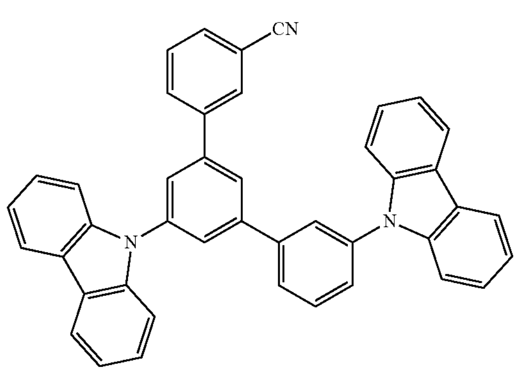
3
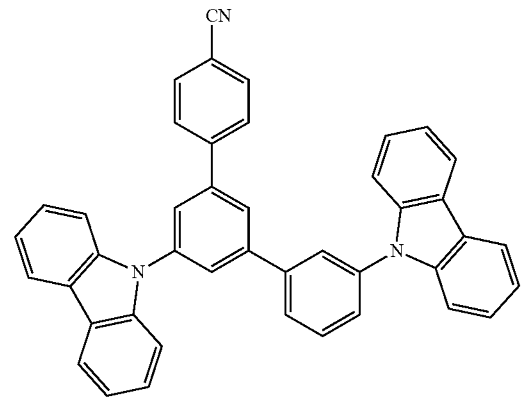
4
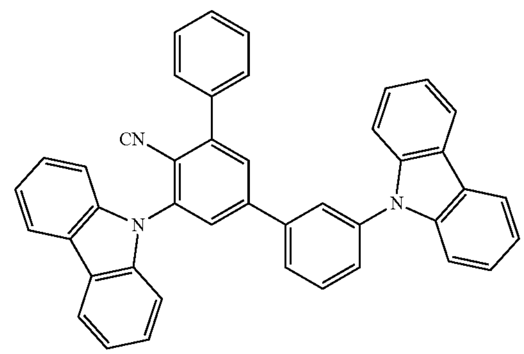
5
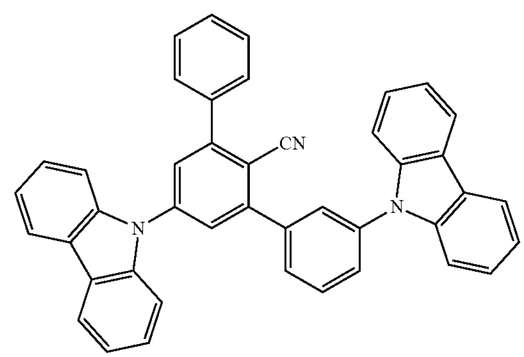
6
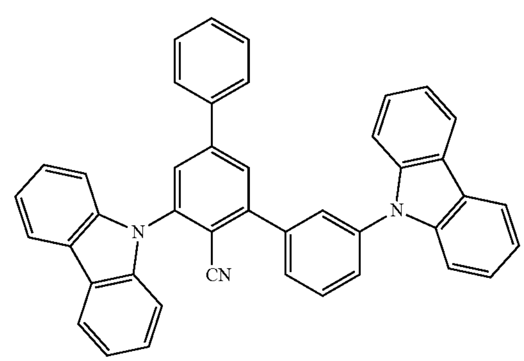

-continued
7
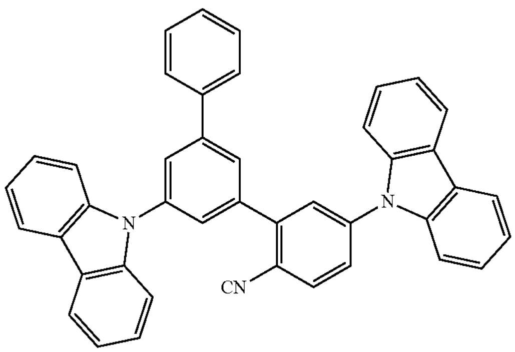
8
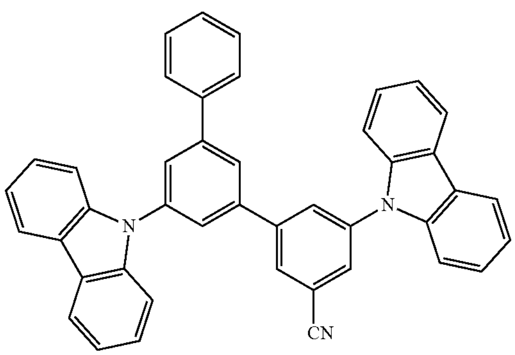
9
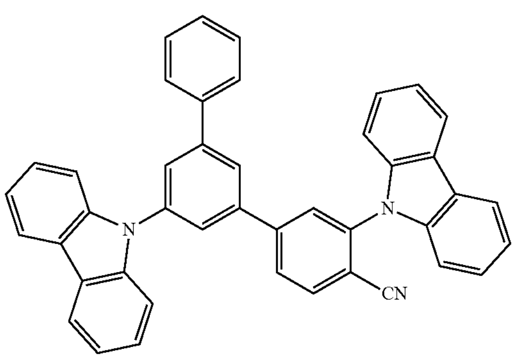
10
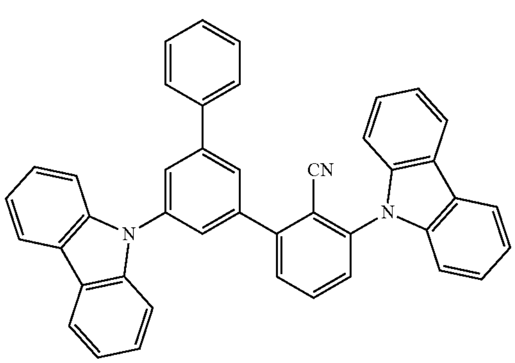
-continued
11
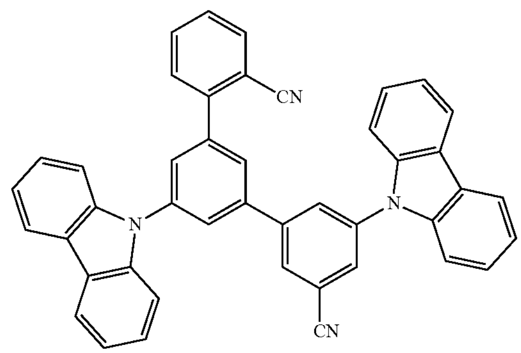
12
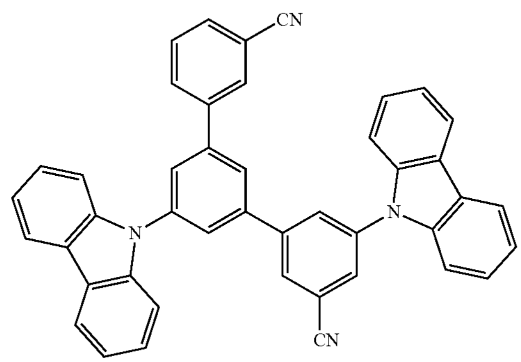
13
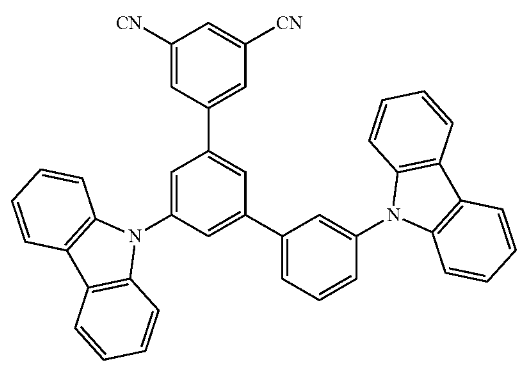
14
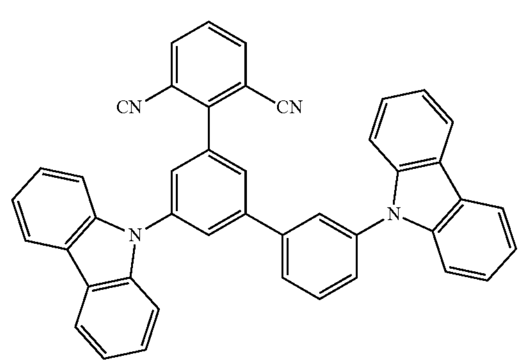

-continued
15
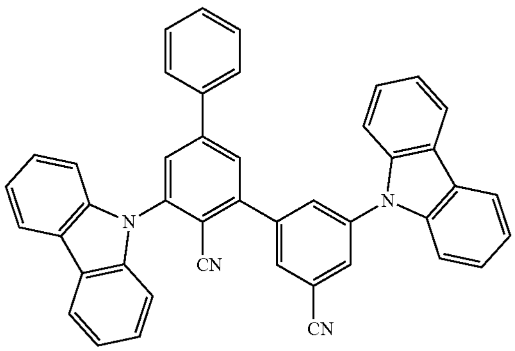
16
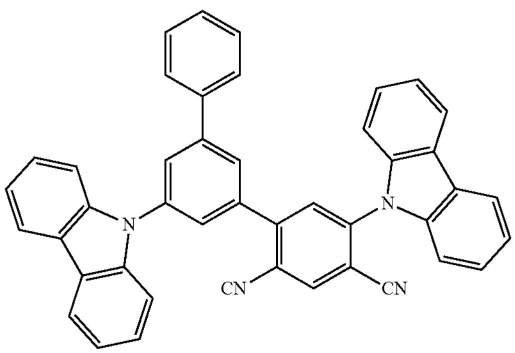
17
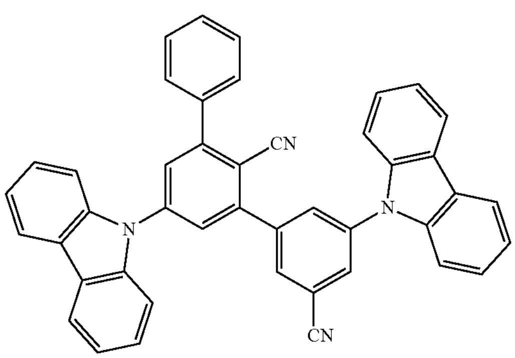
18
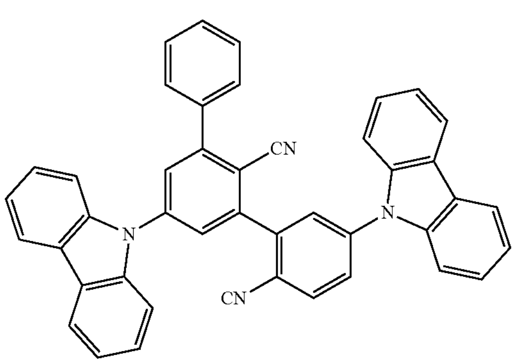
-continued
19
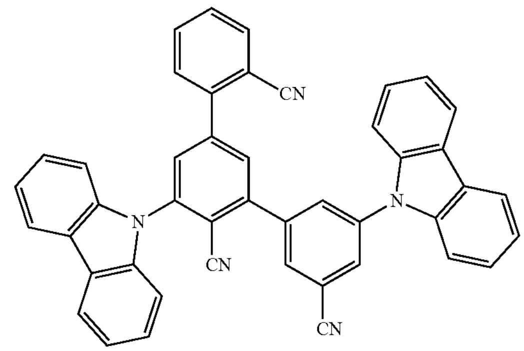
20
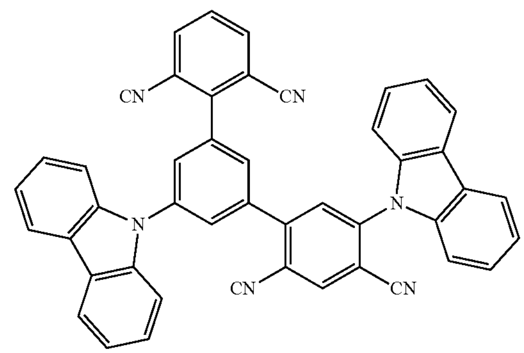
21
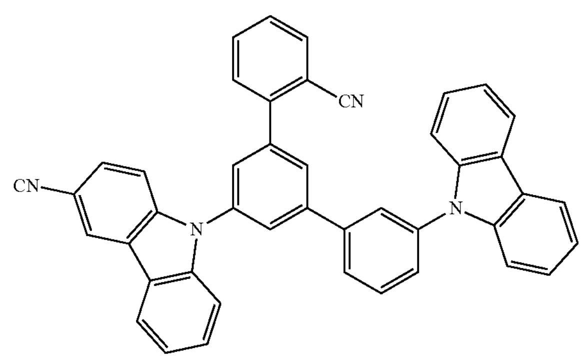
22
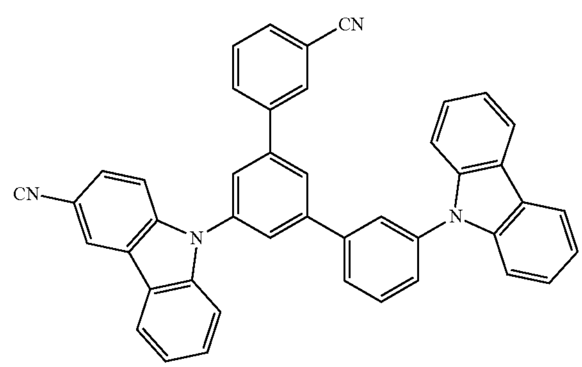

-continued
23
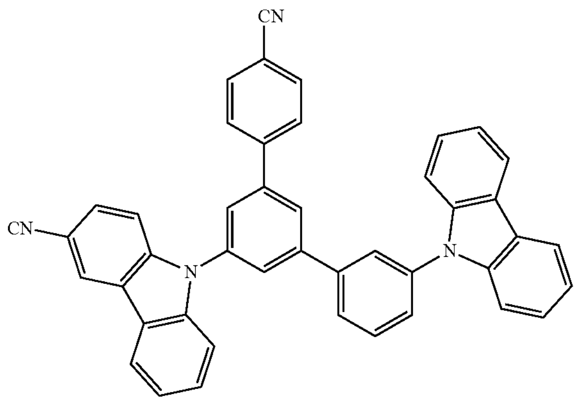
24
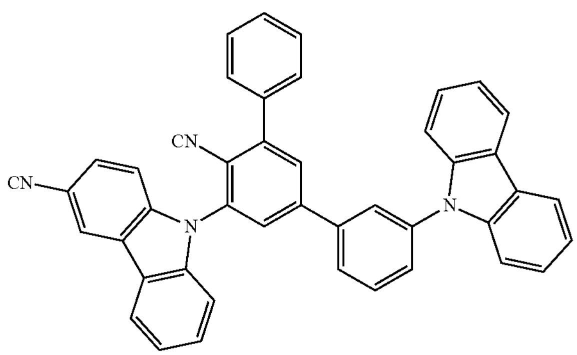
25
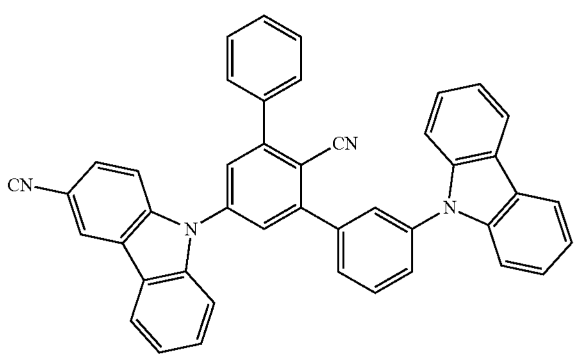
26
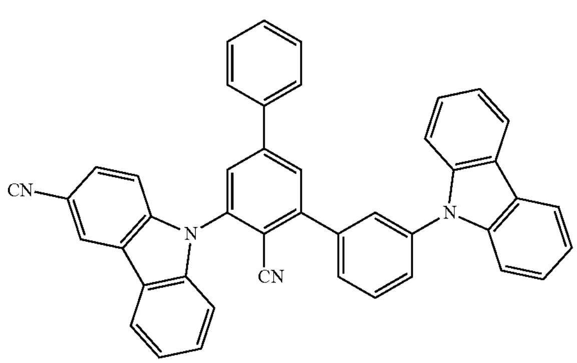
-continued
27
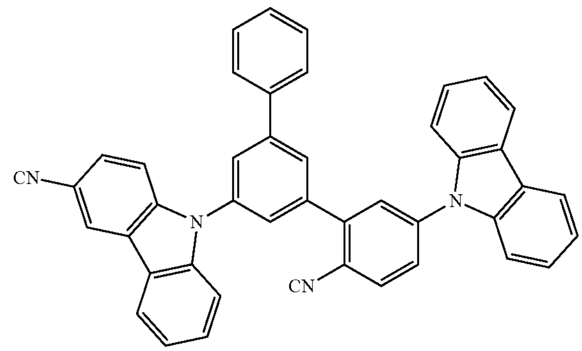
28
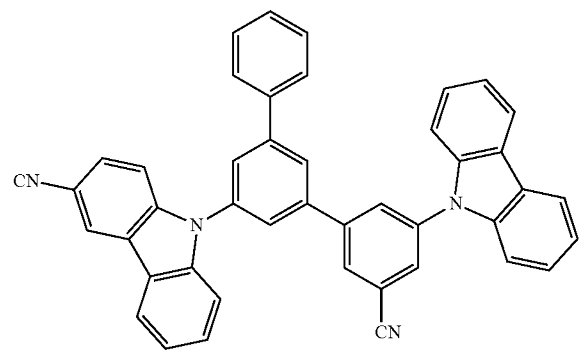
29
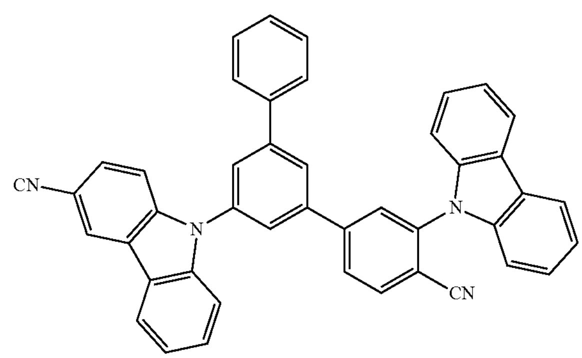
30
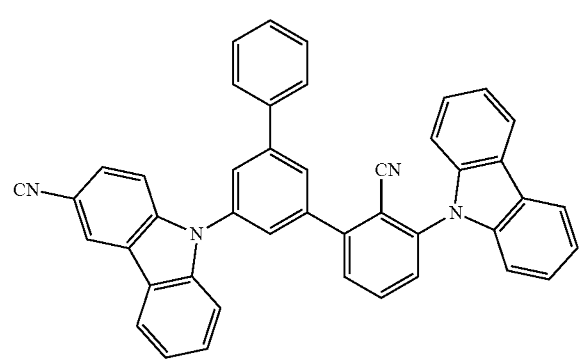

-continued
31
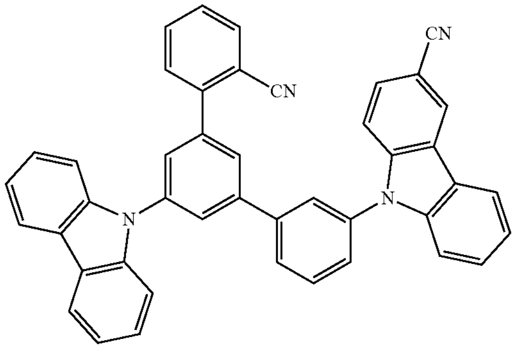
32
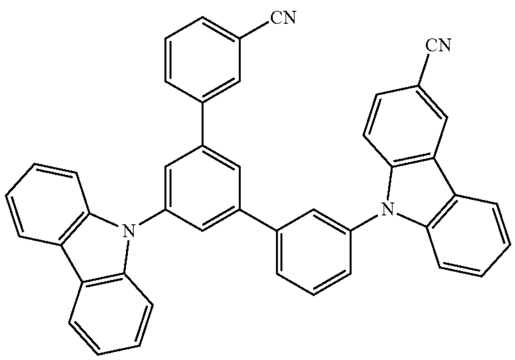
33
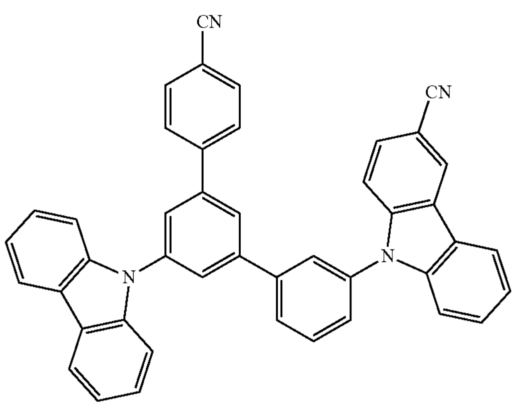
34
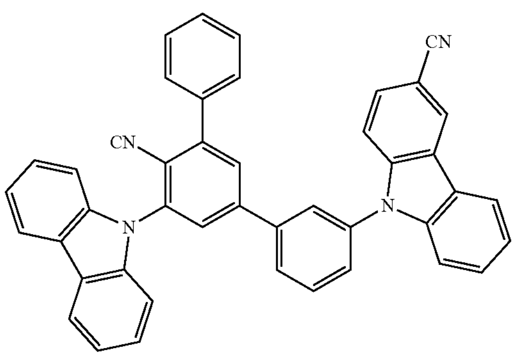
-continued
35
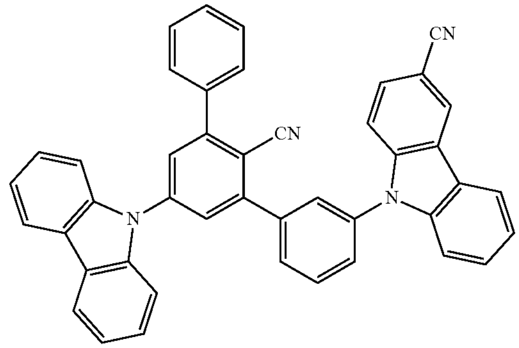
36
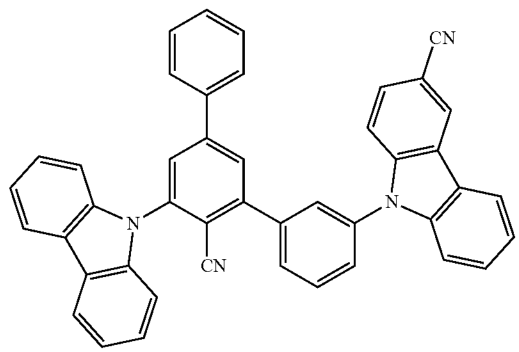
37
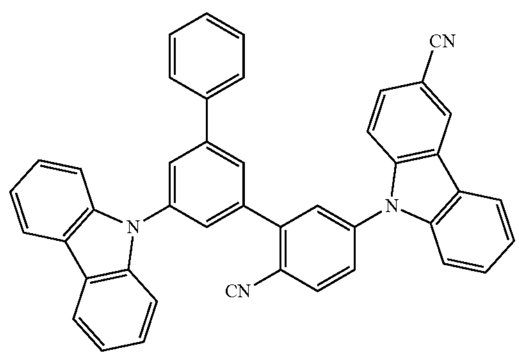
38
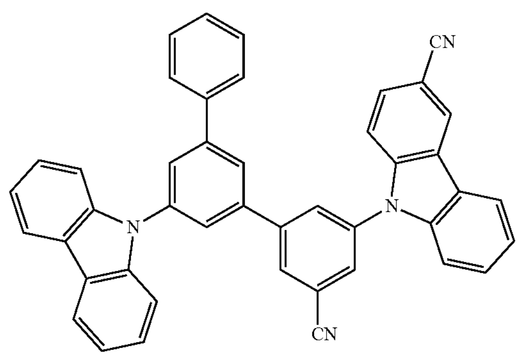

-continued
39
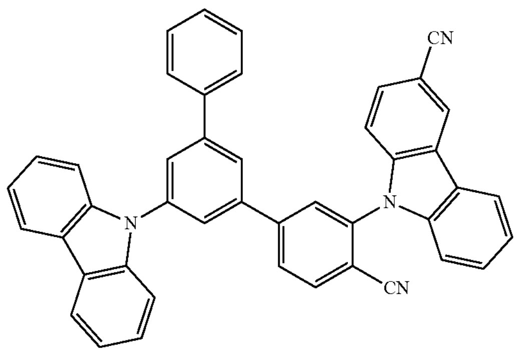
40
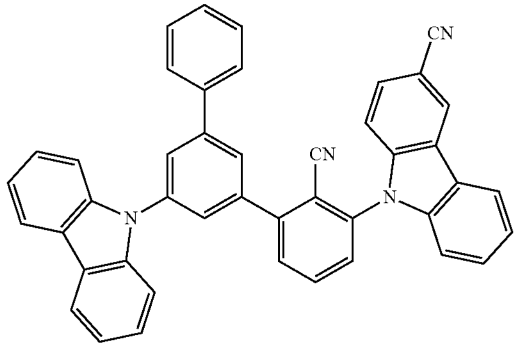
41
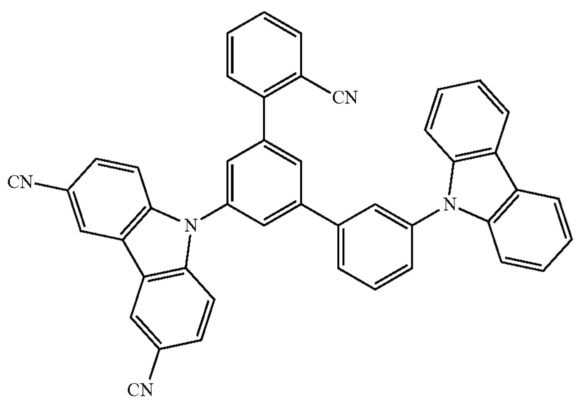
42
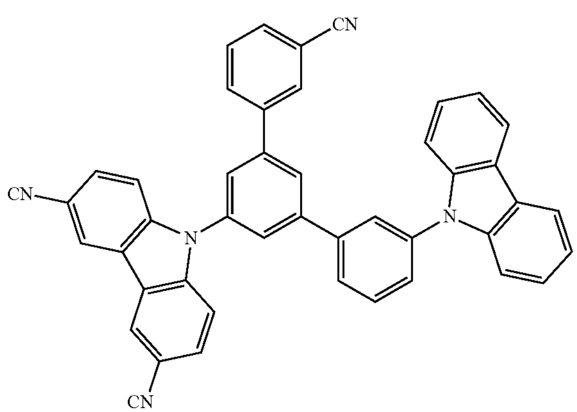
-continued
43
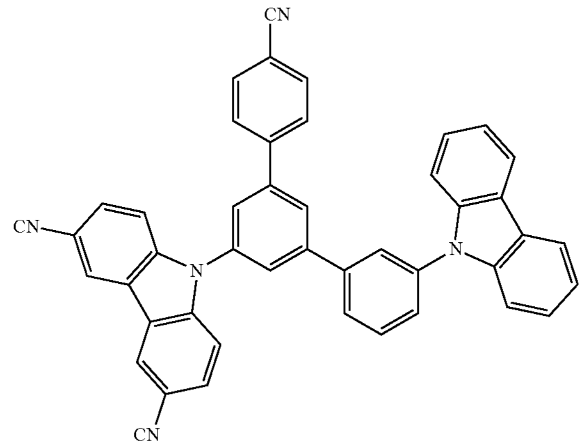
44
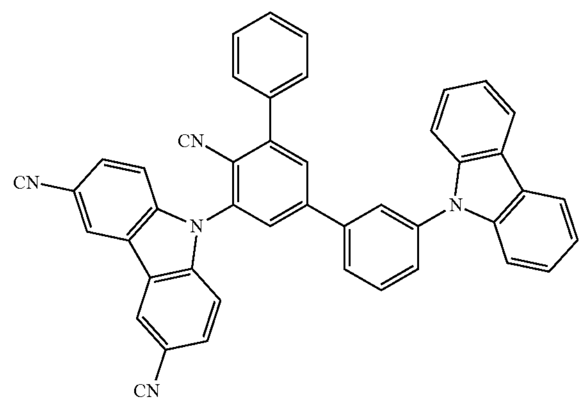
45
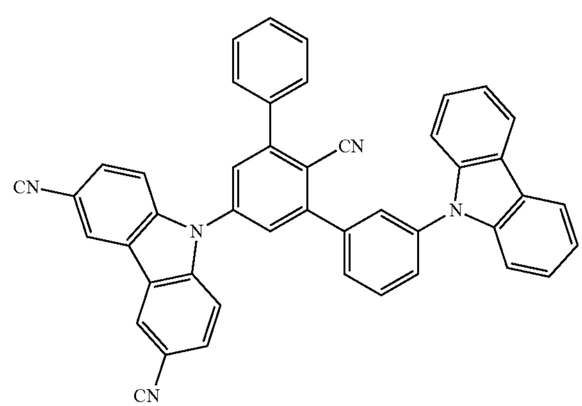

46
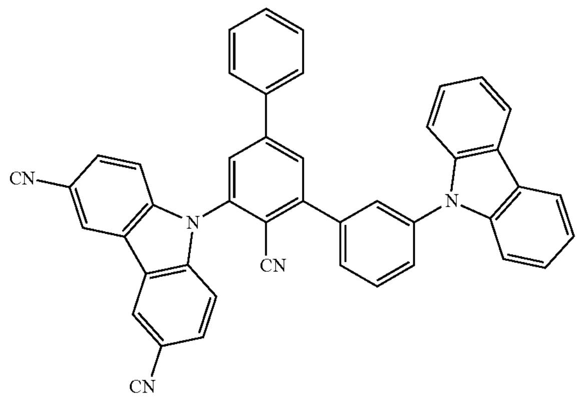
47
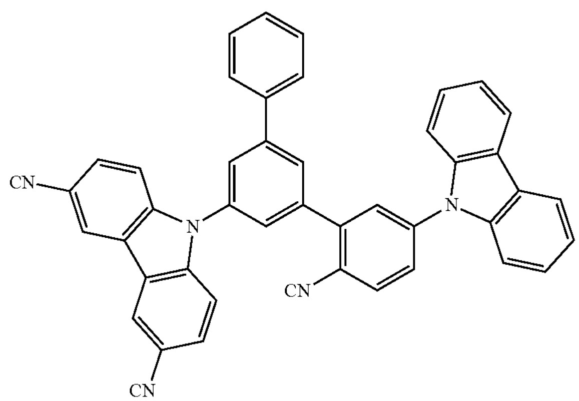
48
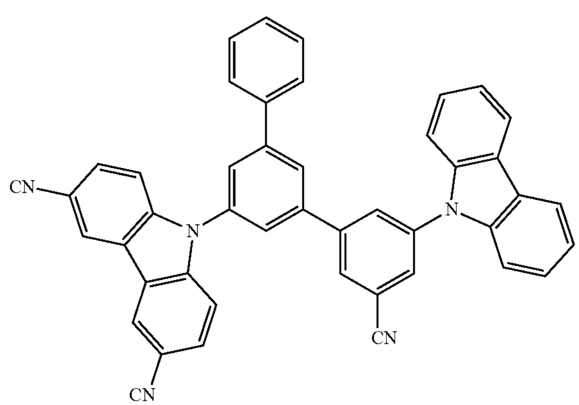
49
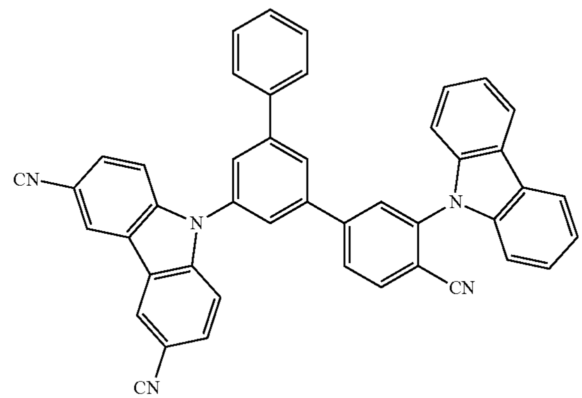
50
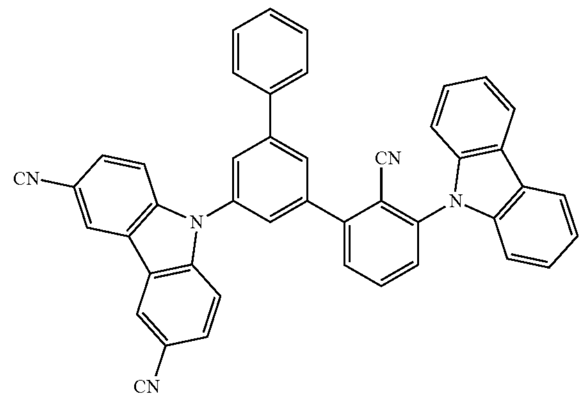
51
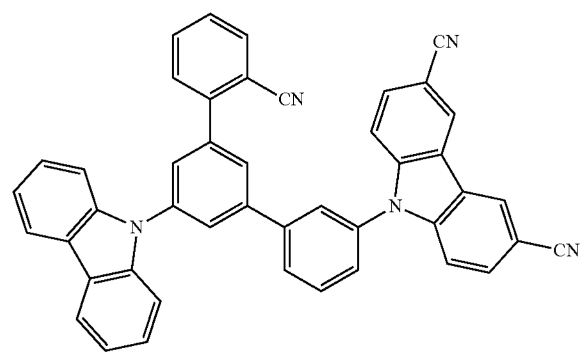
52
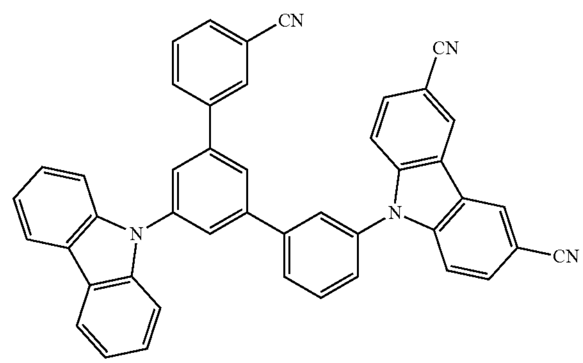

-continued
53
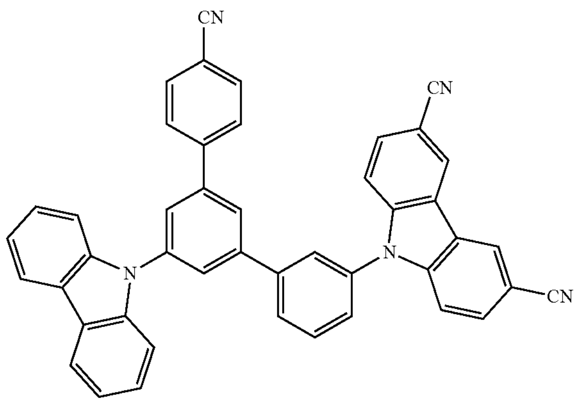
54
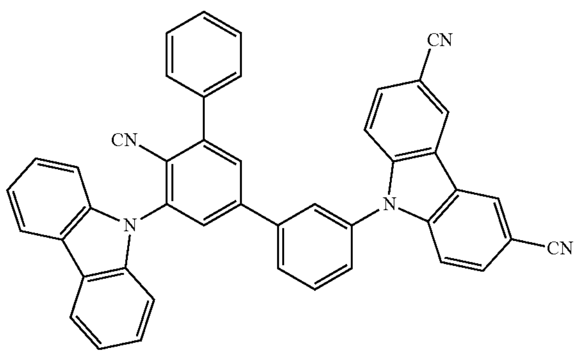
55
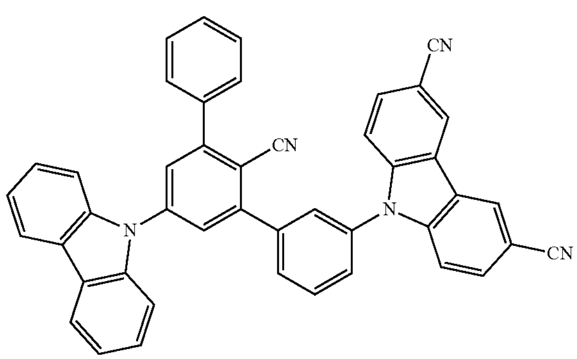
56
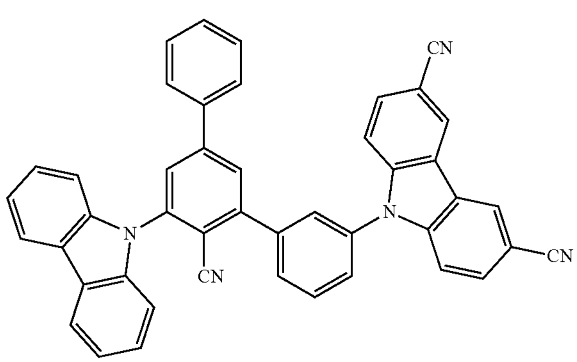
-continued
57
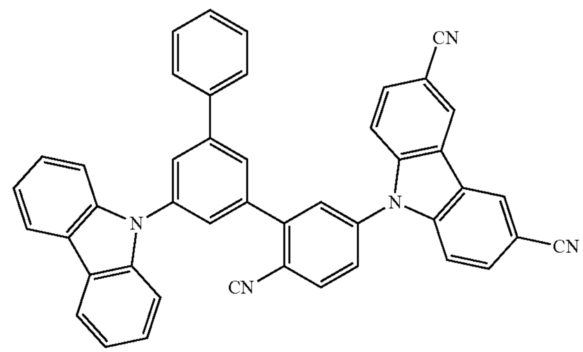
58
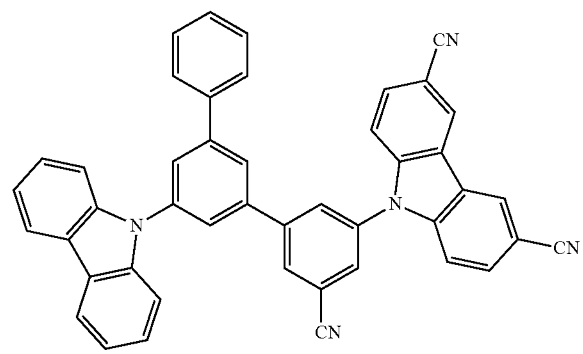
59
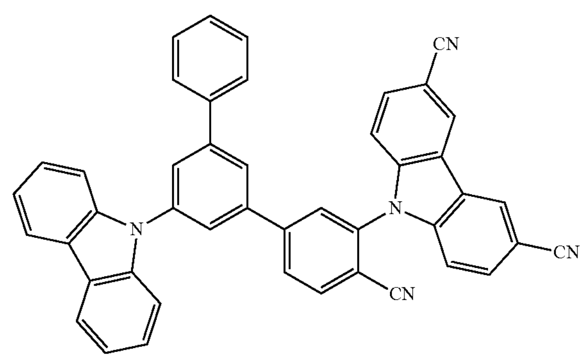
60
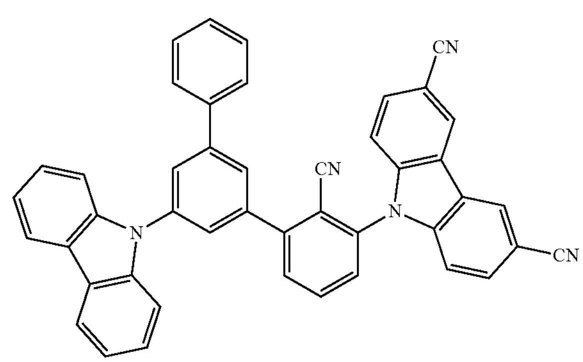

61
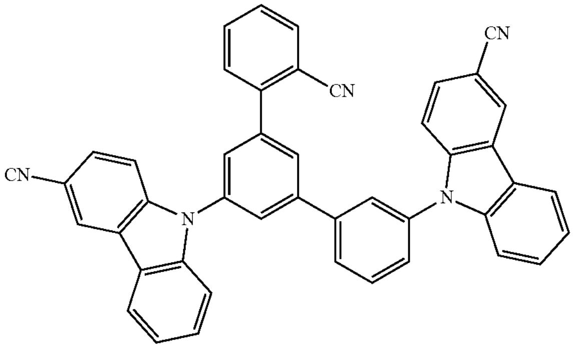
62
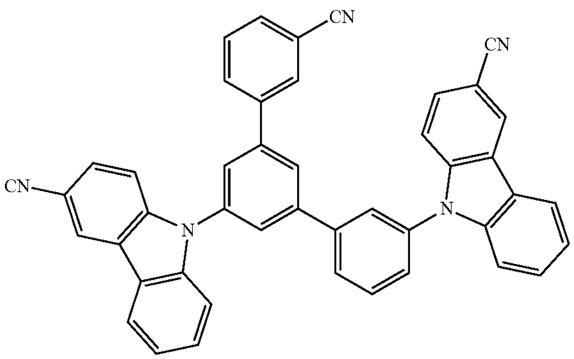
63
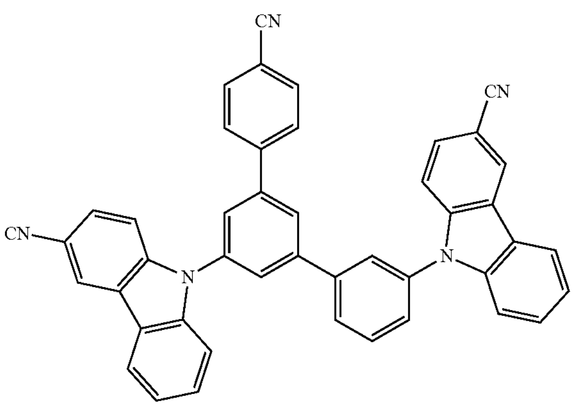
64
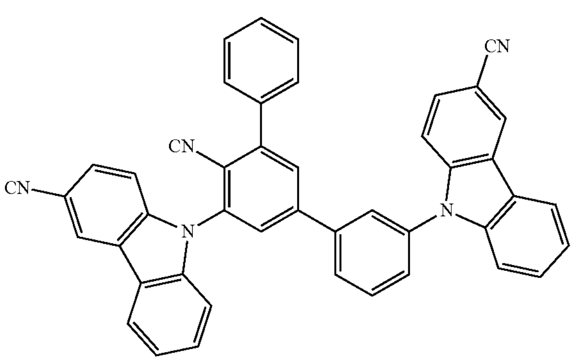
65
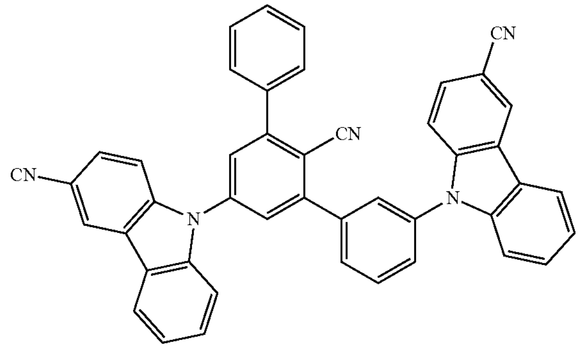
66
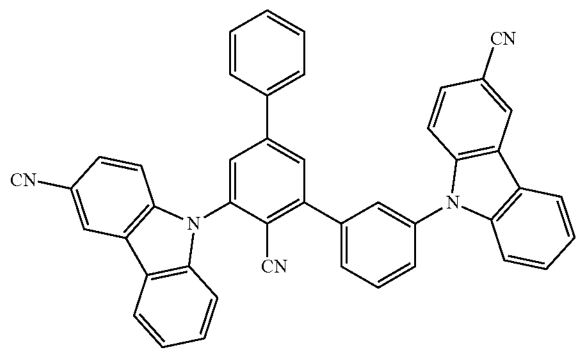
67
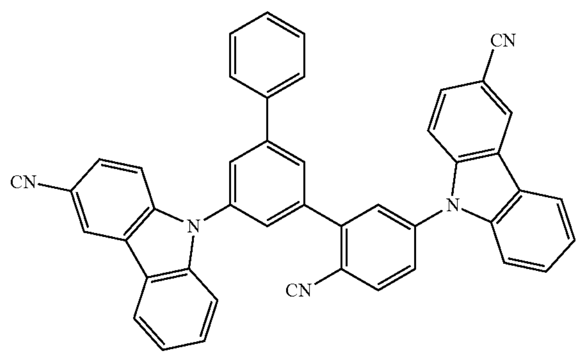
68
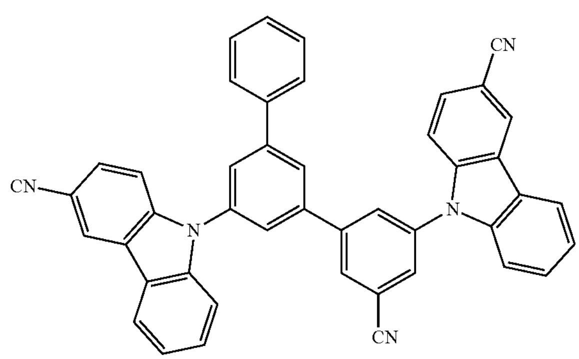

-continued
69
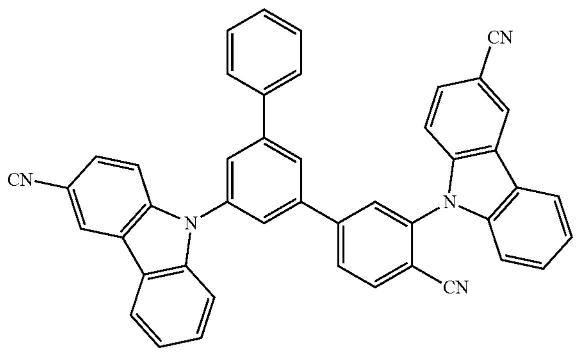
70
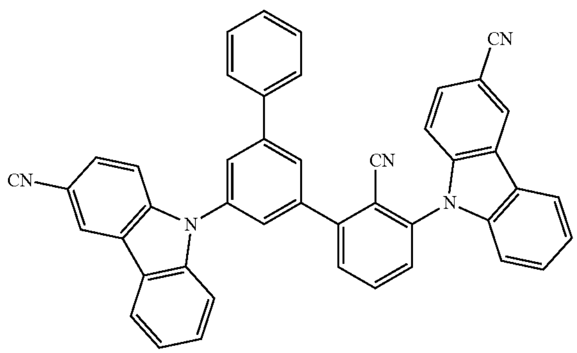
71
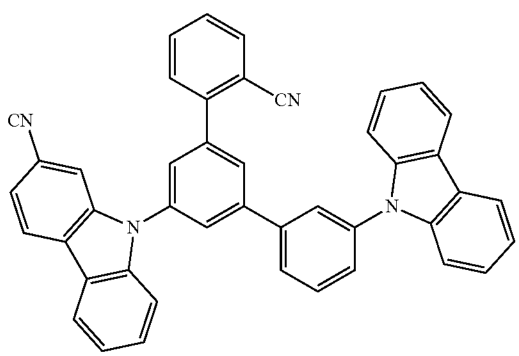
72
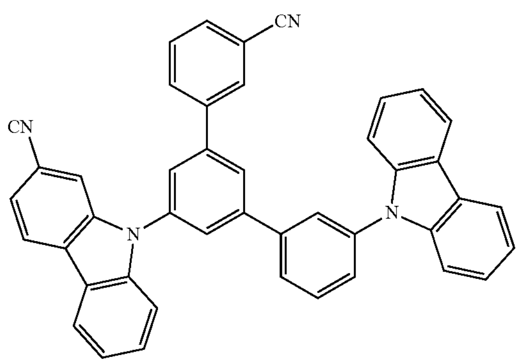
-continued
73
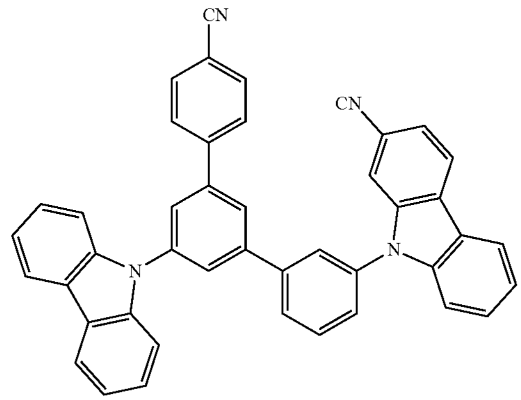
74
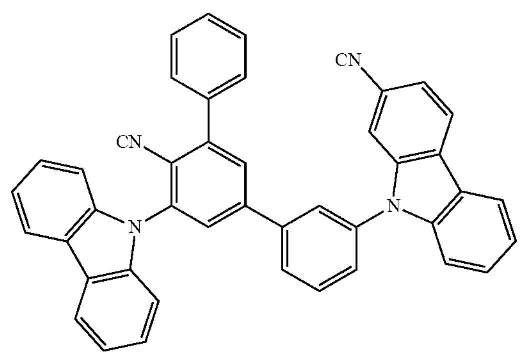
75
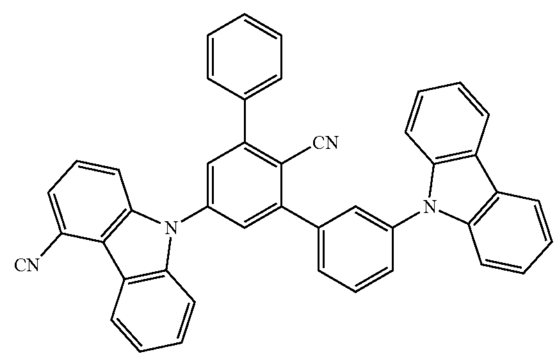
76
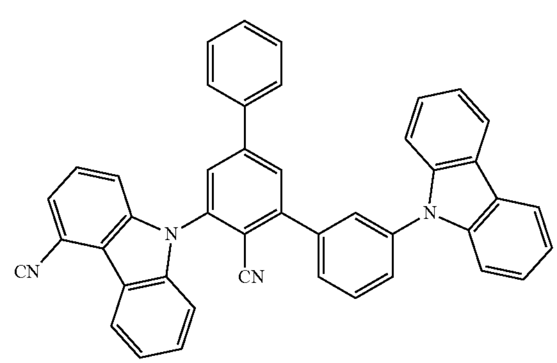

77
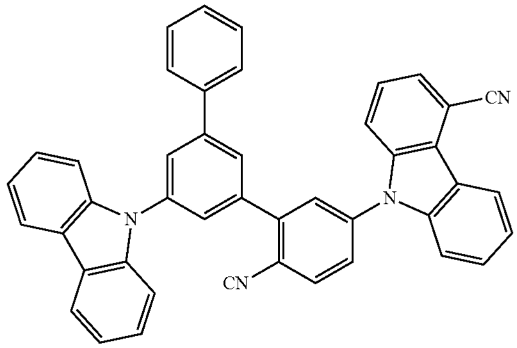
78
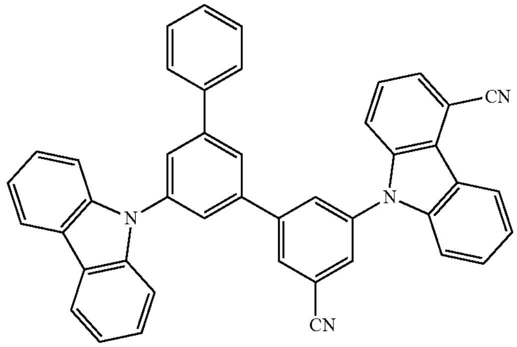
79
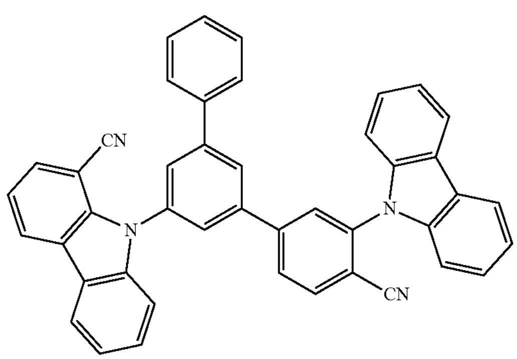
80
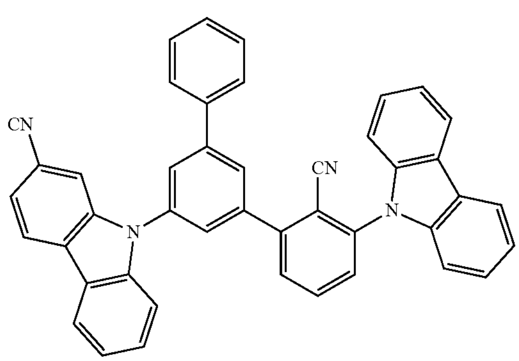
81
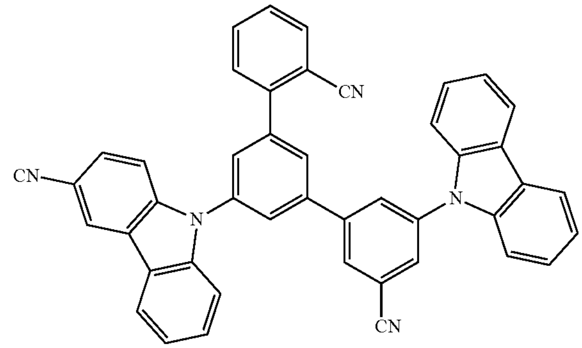
82
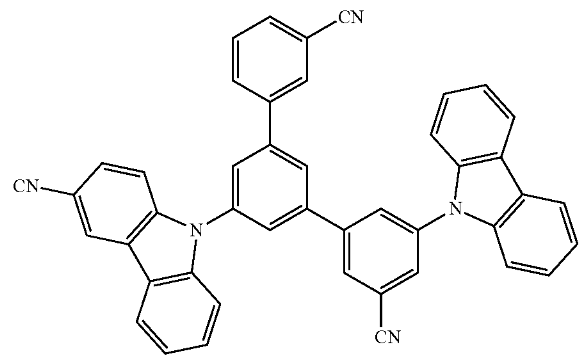
83
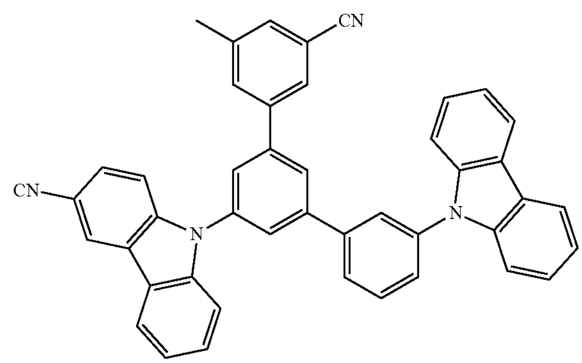
84
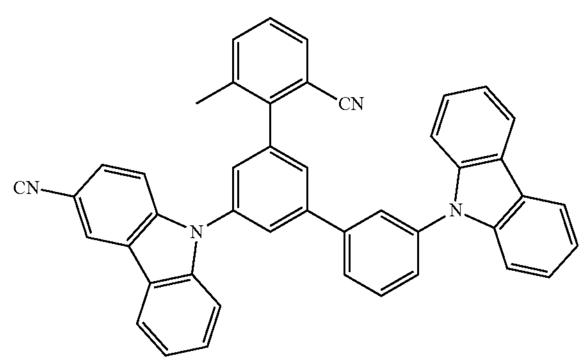

-continued
85
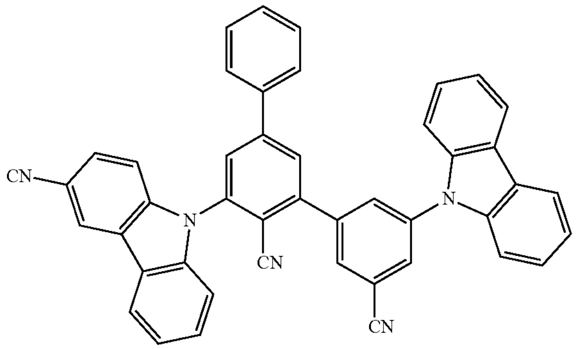
86
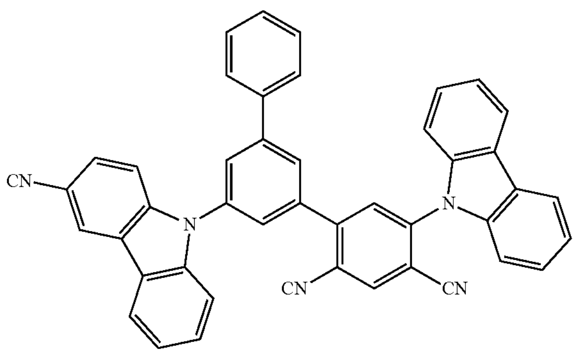
87
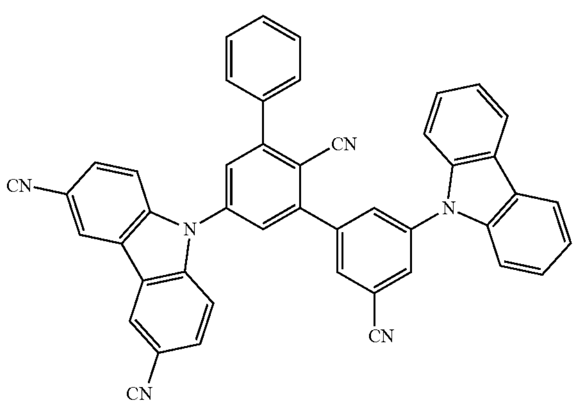
88
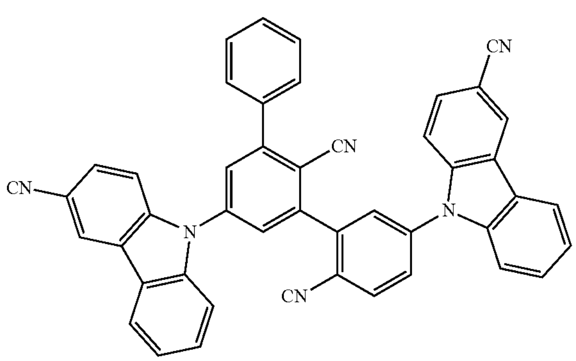
-continued
89
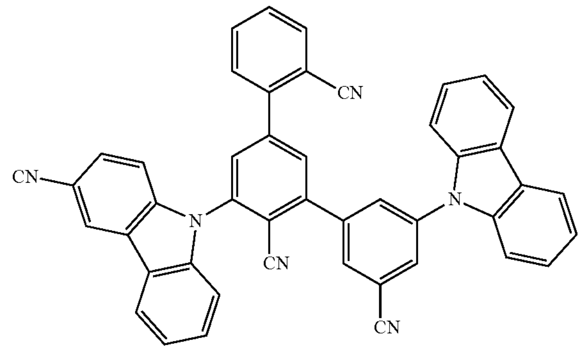
90
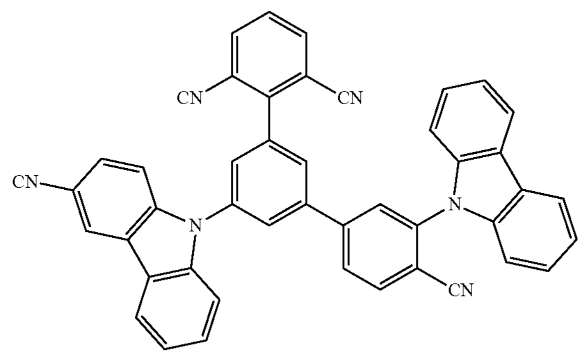
91
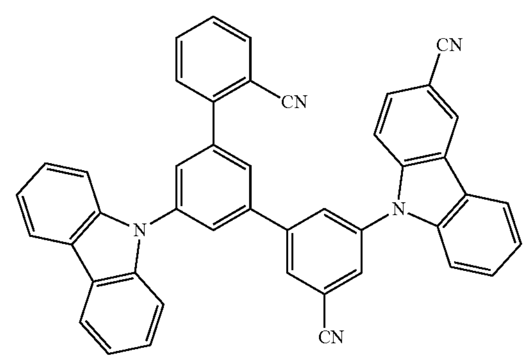
92
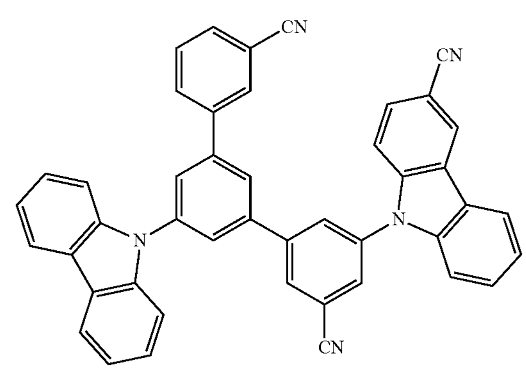

-continued
93
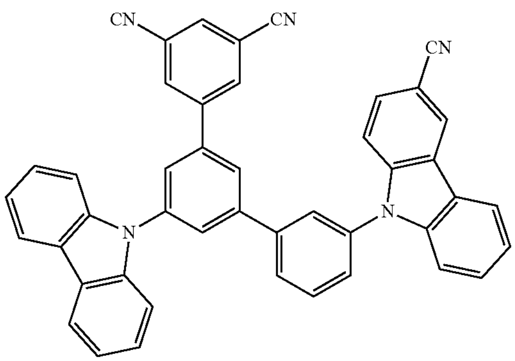
94
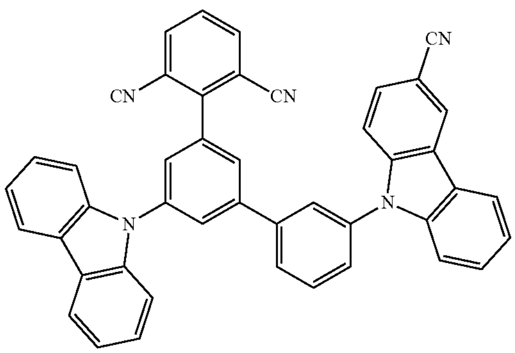
95
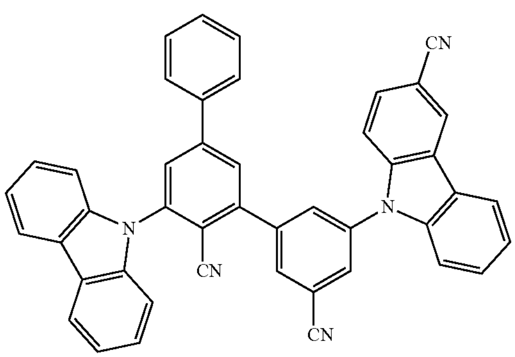
96
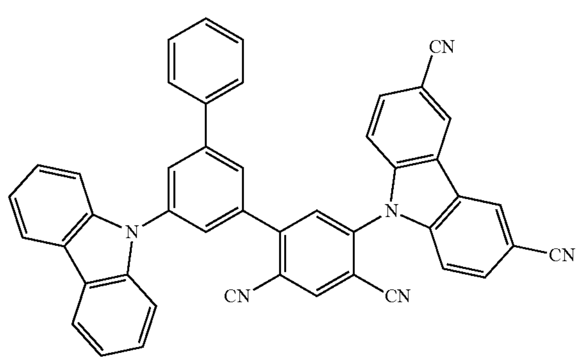
-continued
97
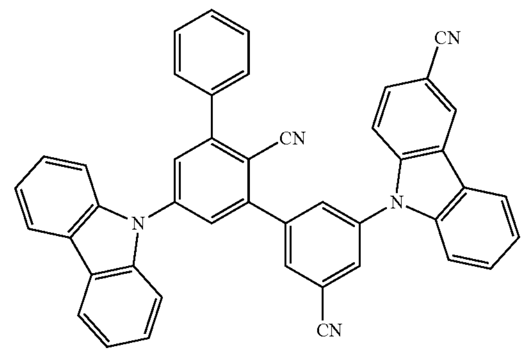
98
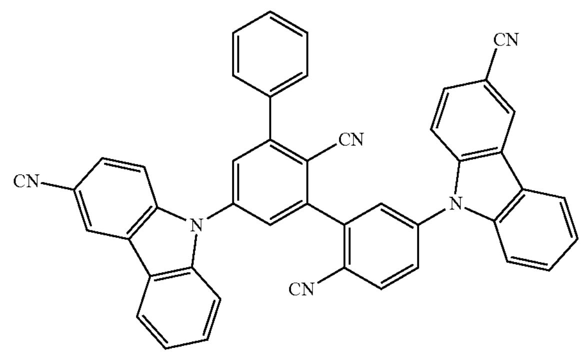
99
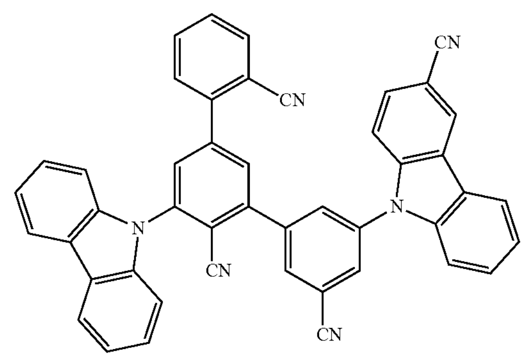
100
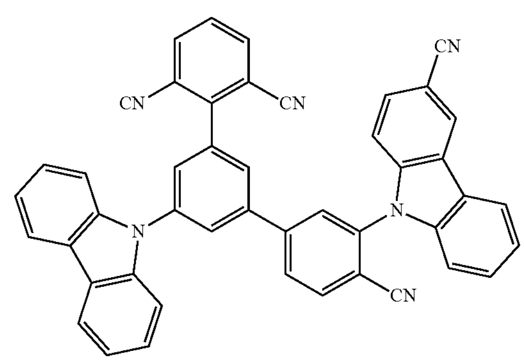

-continued
101
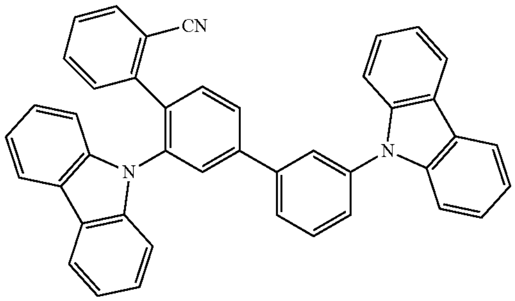
102
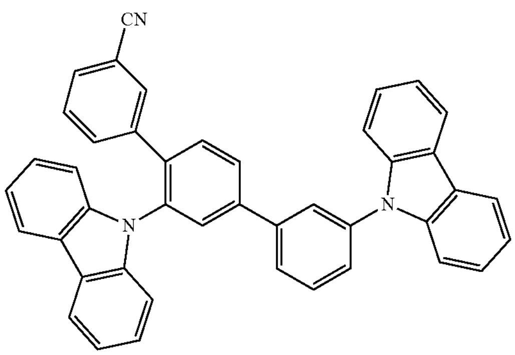
103
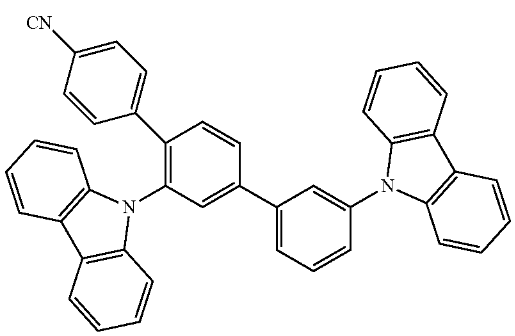
104
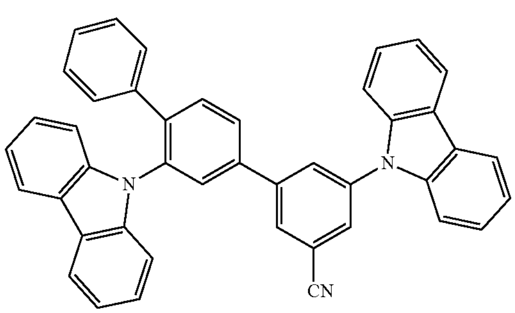
-continued
105
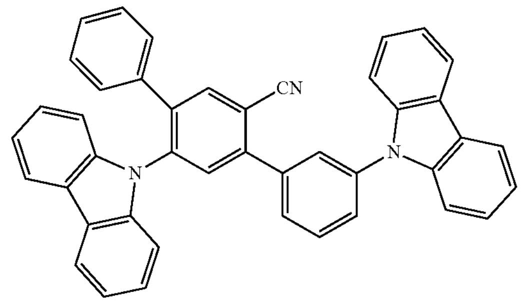
106
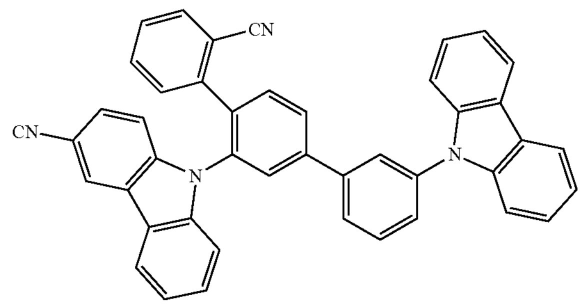
107
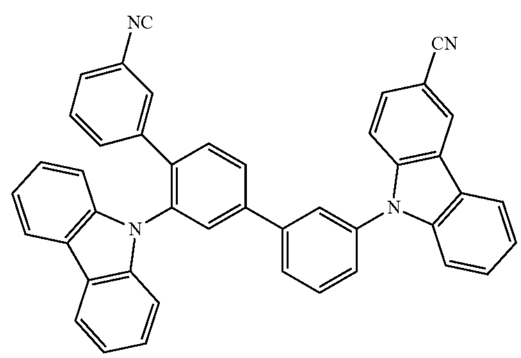
108
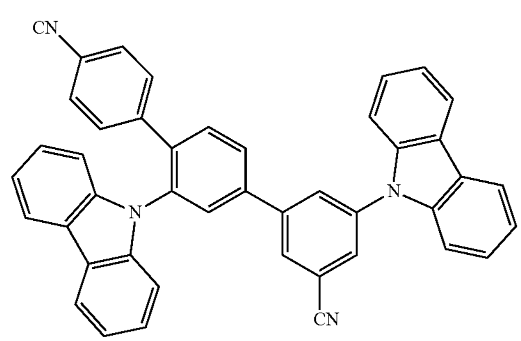

-continued
109
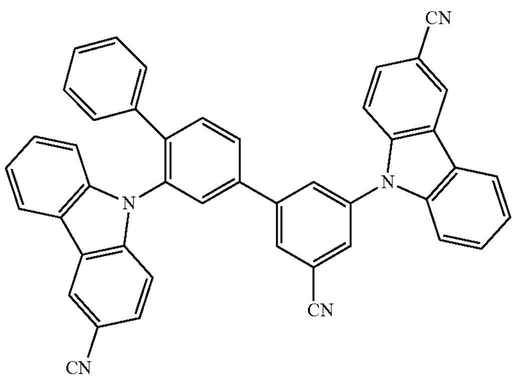
110
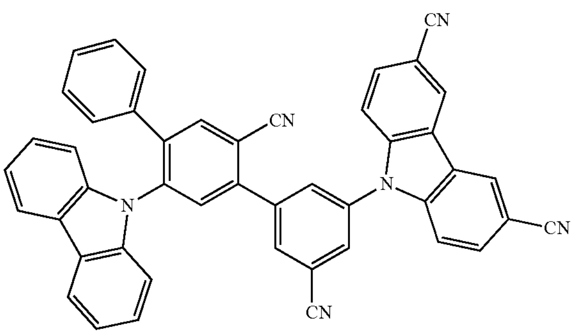
111
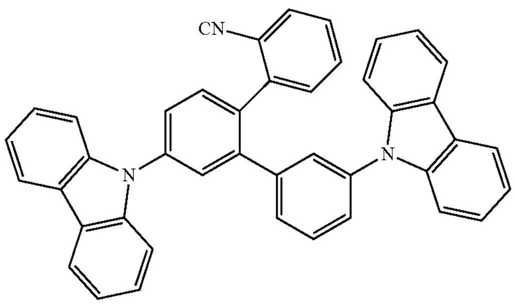
112
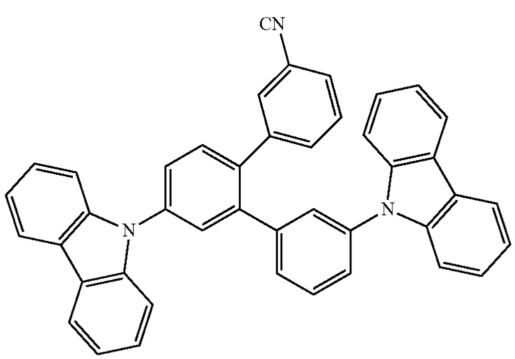
-continued
113
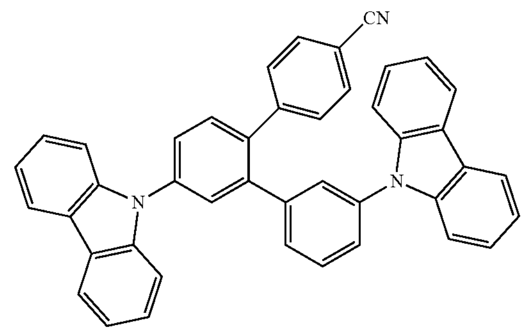
114
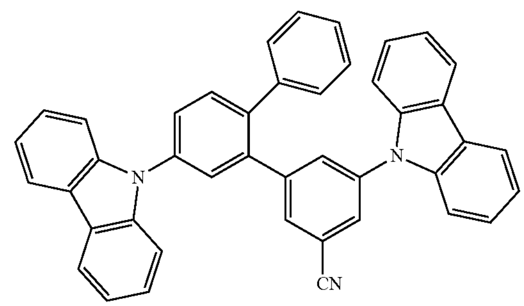
115
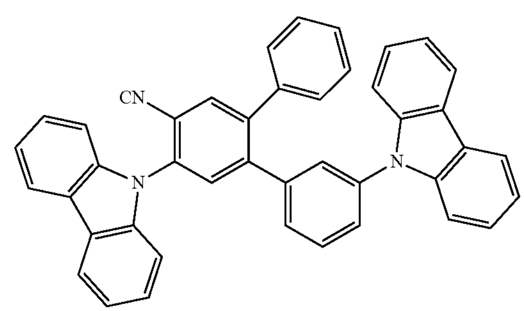
116
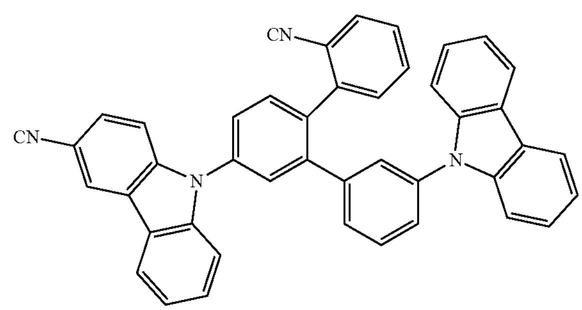

-continued
117
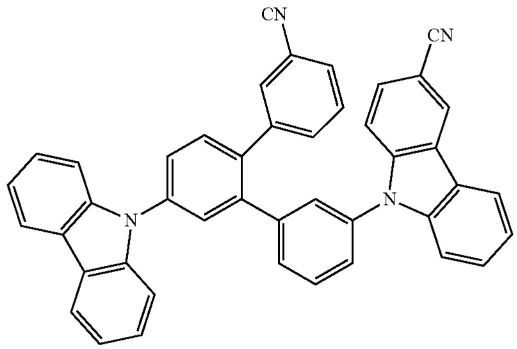
118
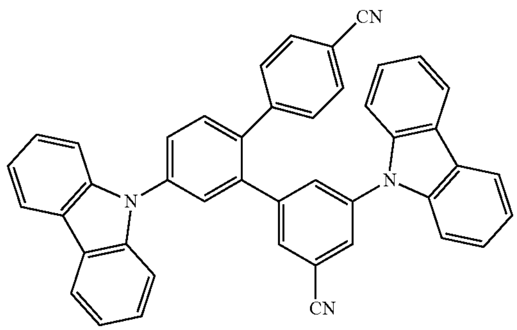
119
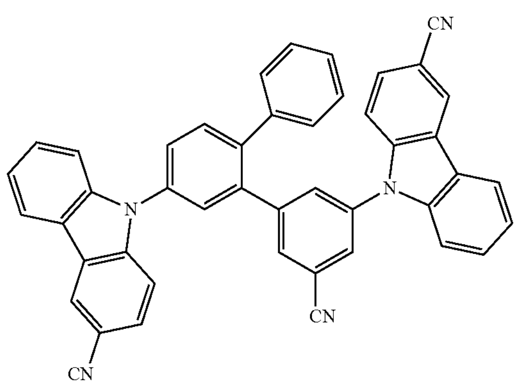
120
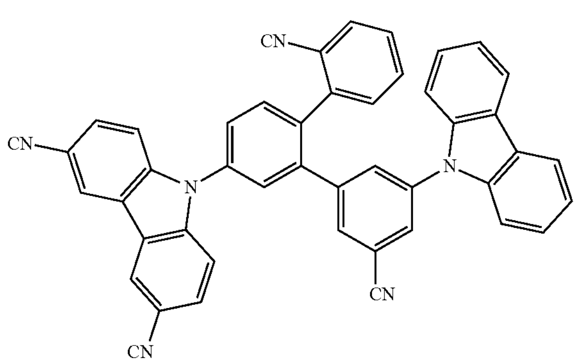
-continued
121
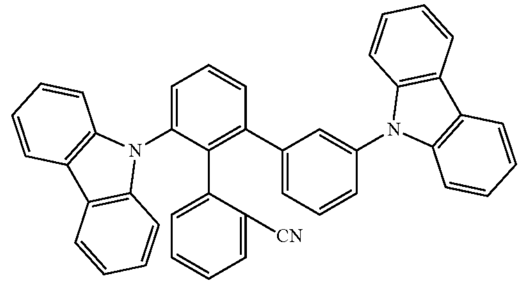
122
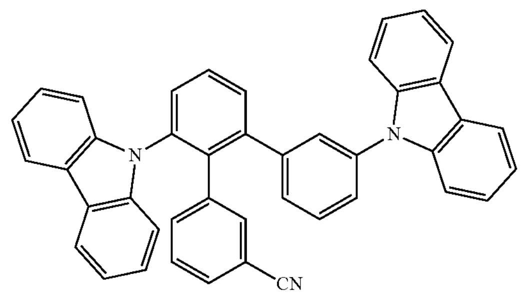
123
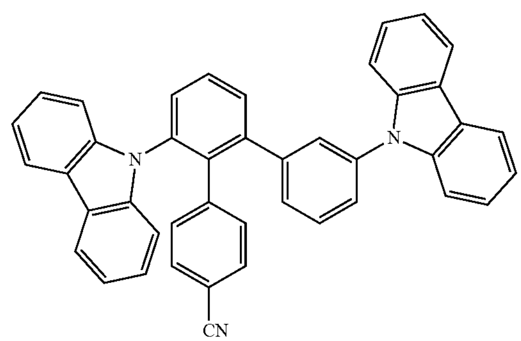
124
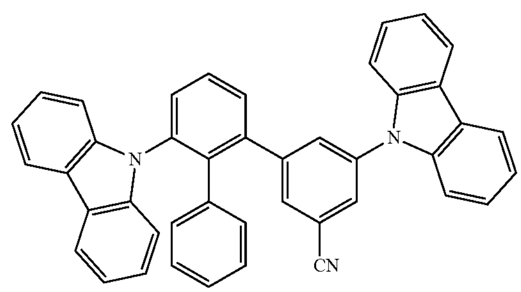
125
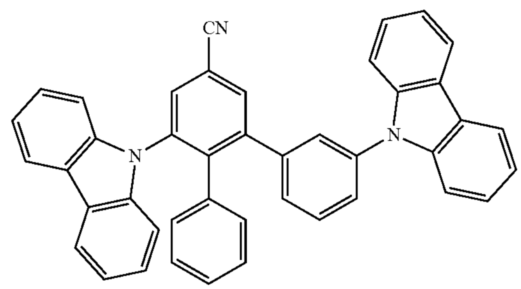

126
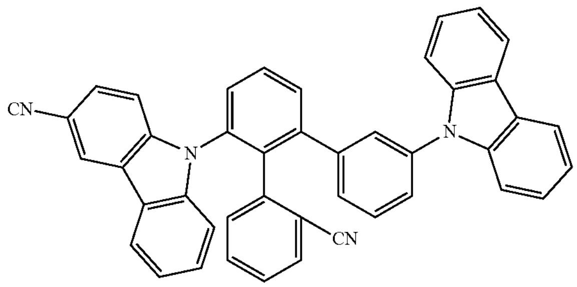
127
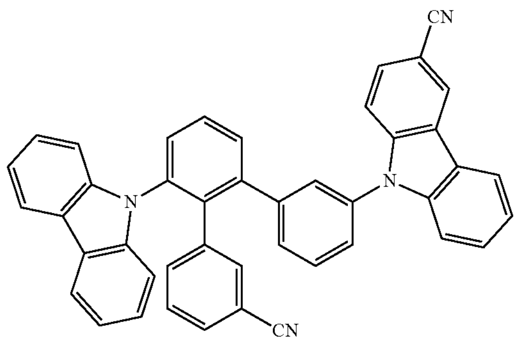
28
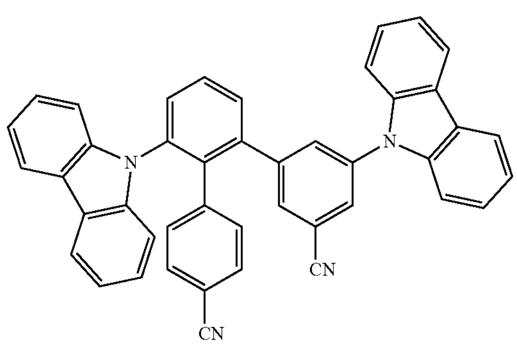
129
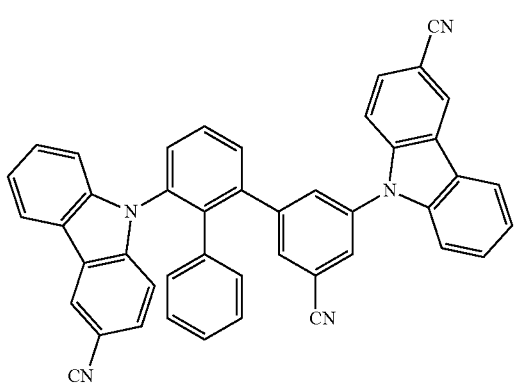
130
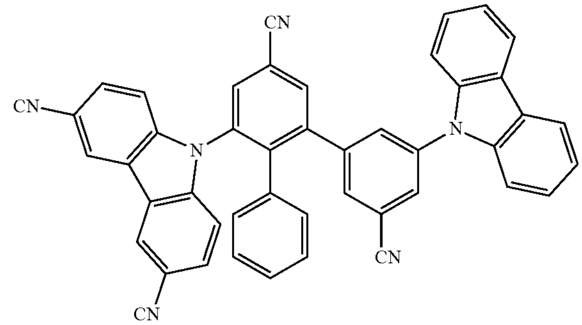
131
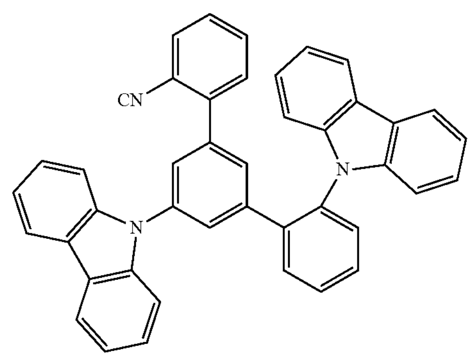
132
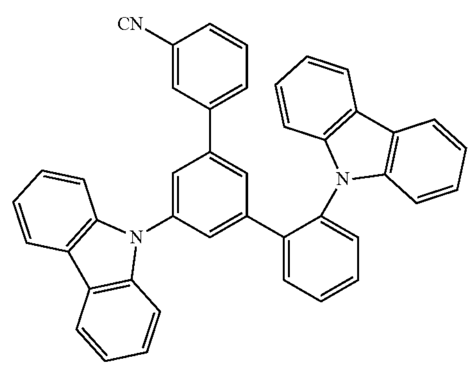
133
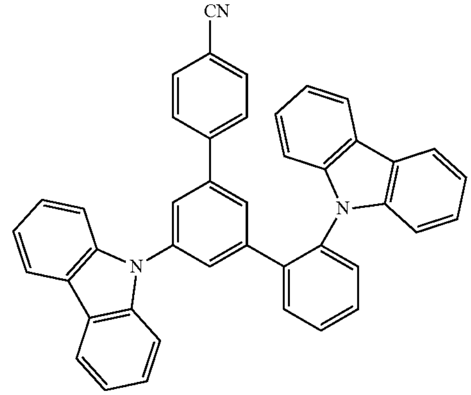

-continued
134
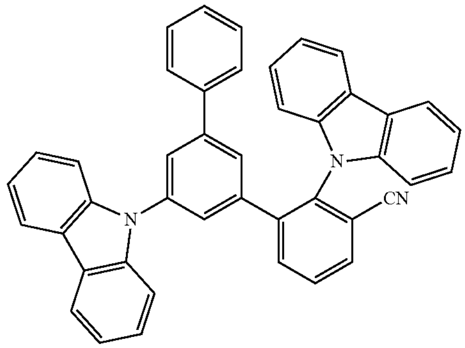
135
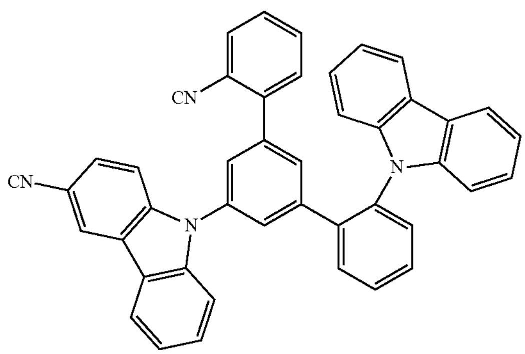
136
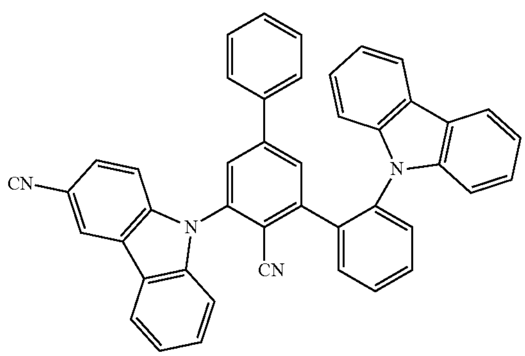
137
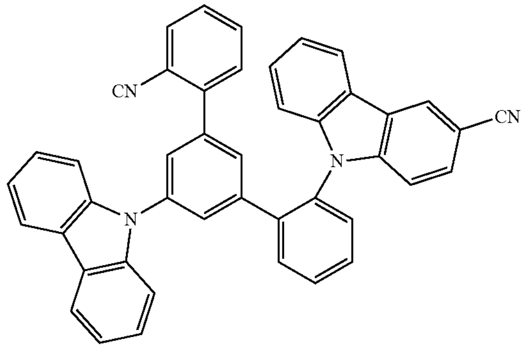
-continued
138
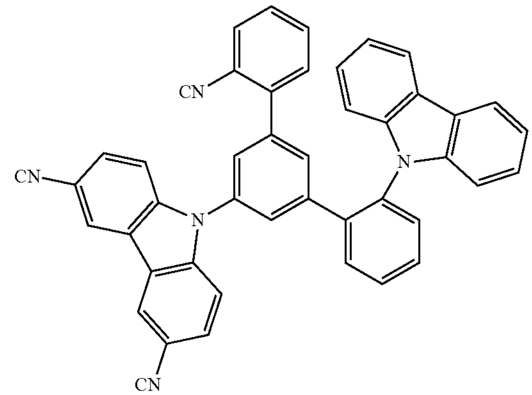
139
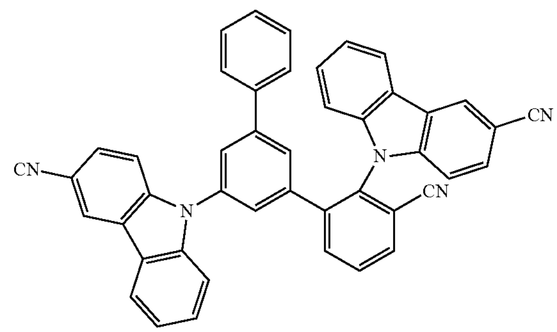
140
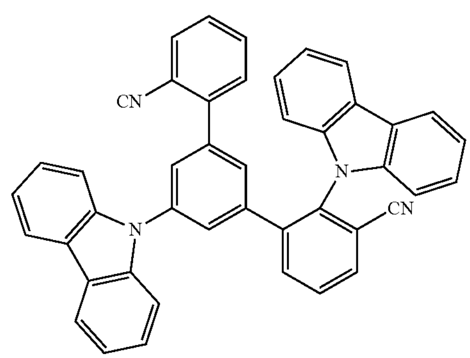
141
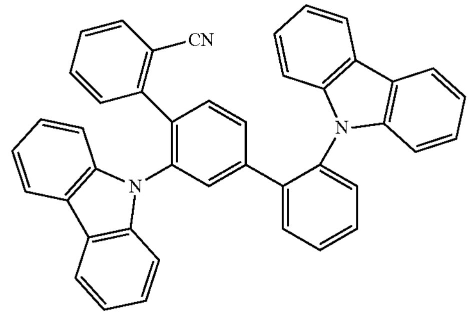

-continued
142
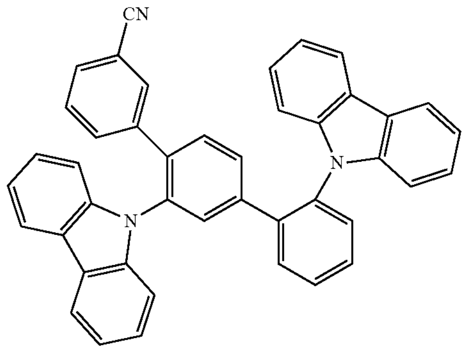
143
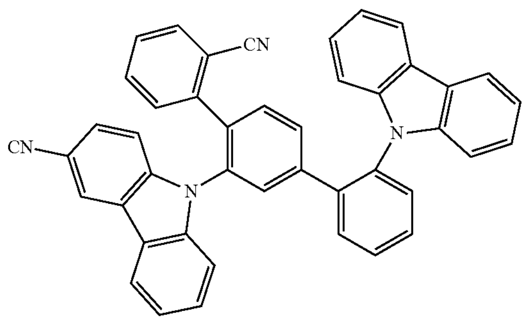
144
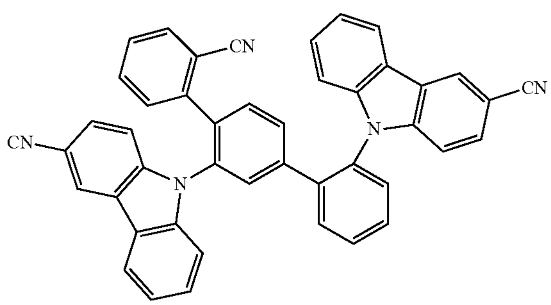
145
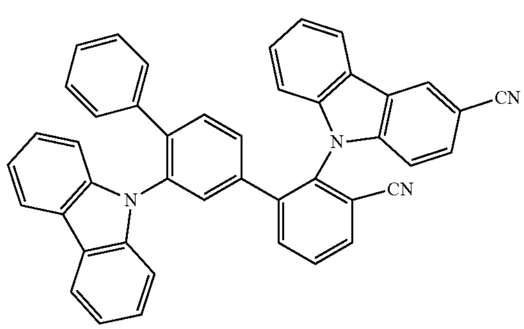
-continued
146
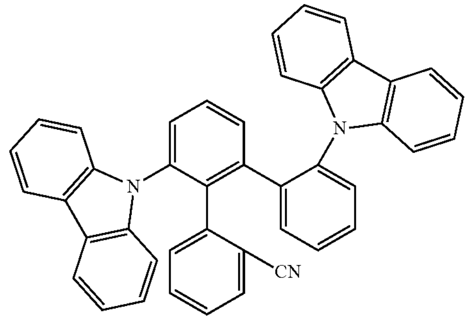
147
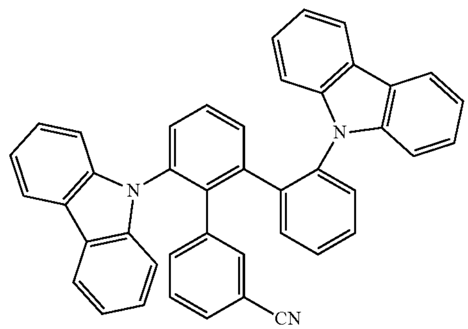
148
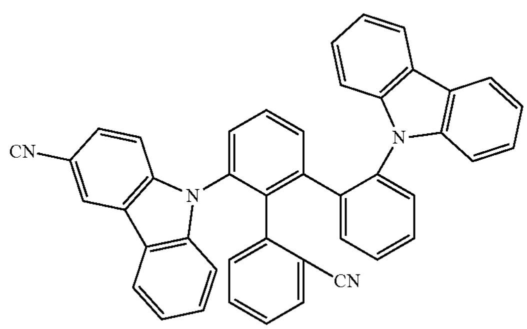
149
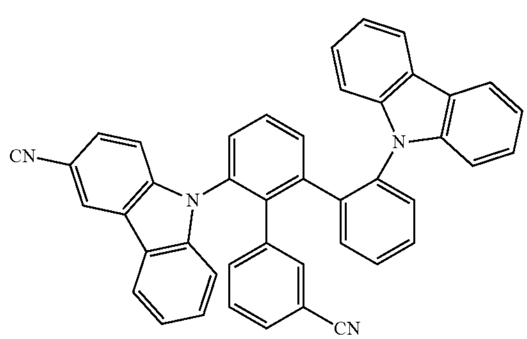

150
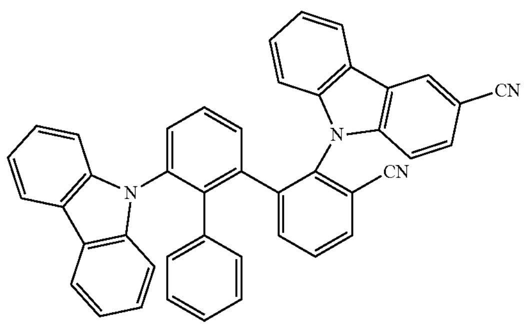
151
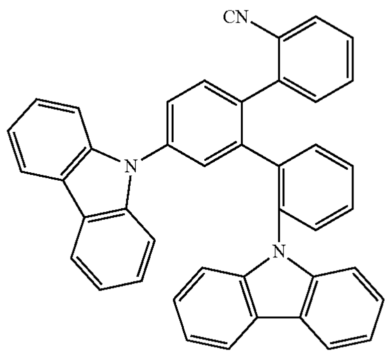
152
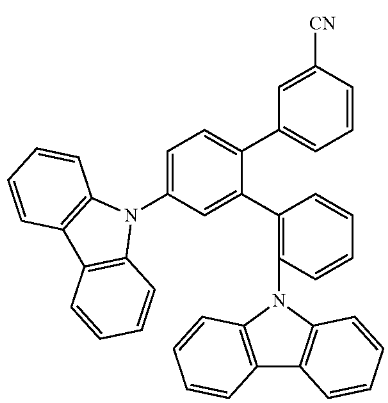
153
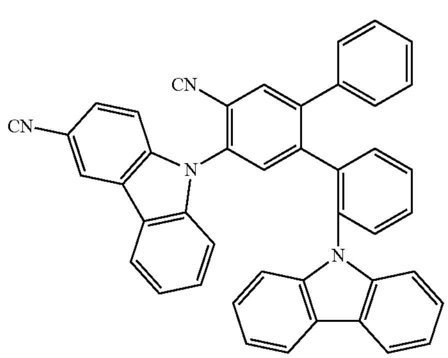
154
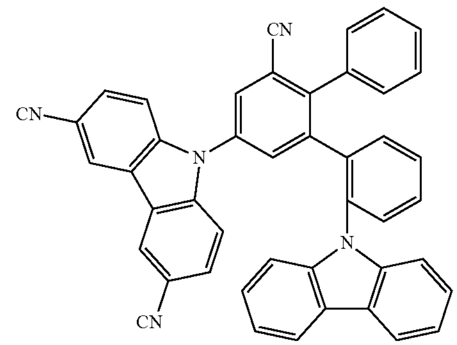
155
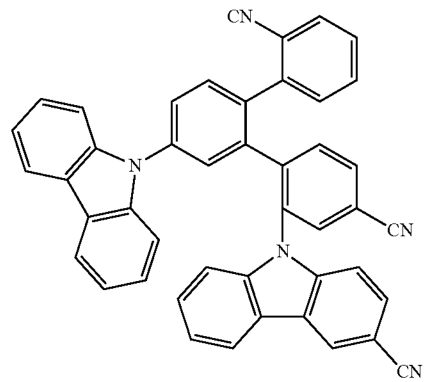
156
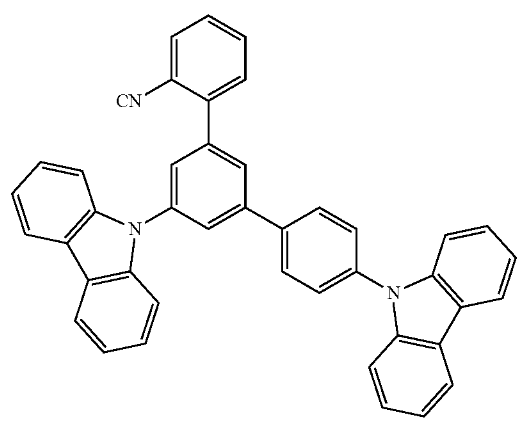
157
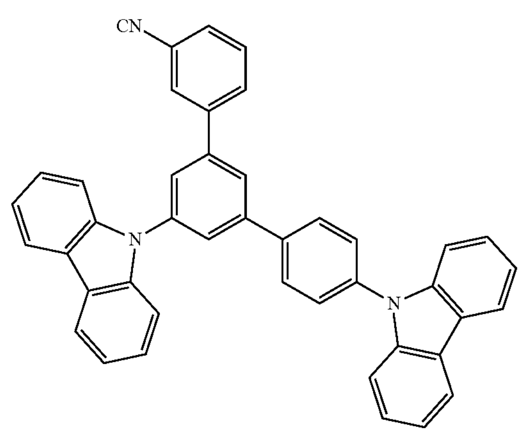

-continued
158
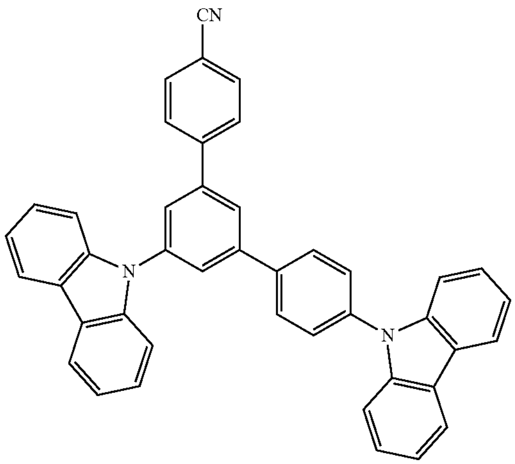
159
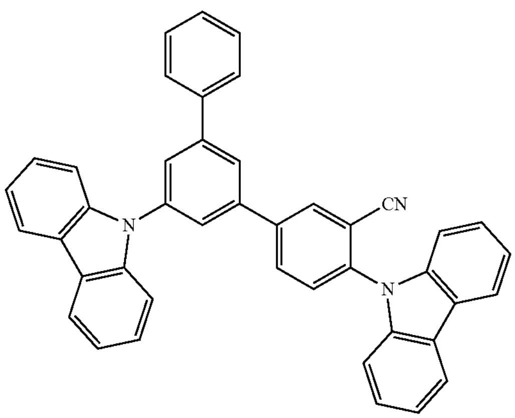
160
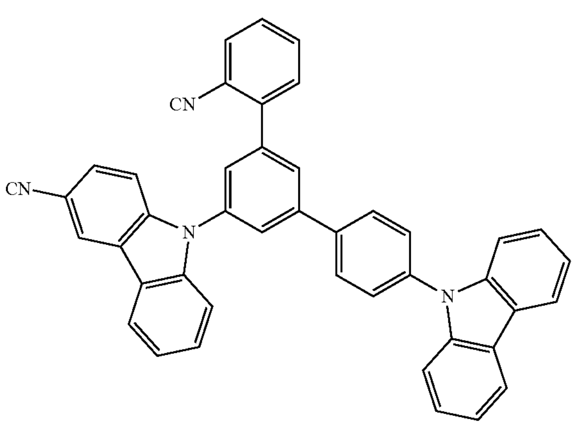
-continued
161
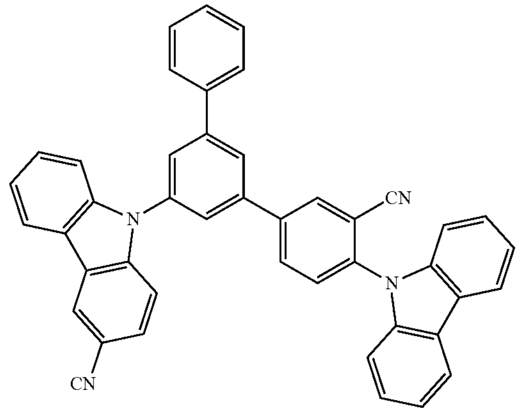
162
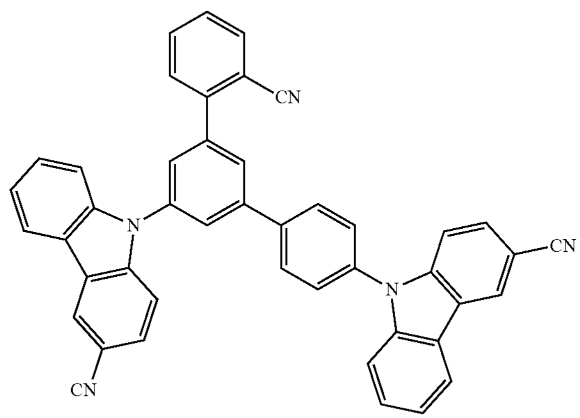
163
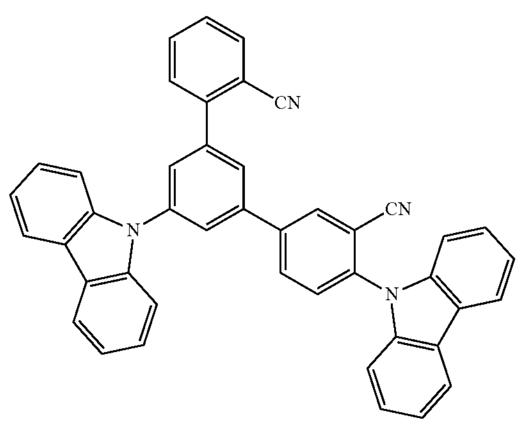

-continued
164
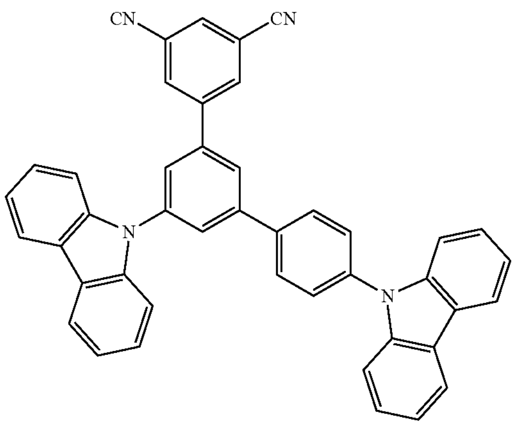
165
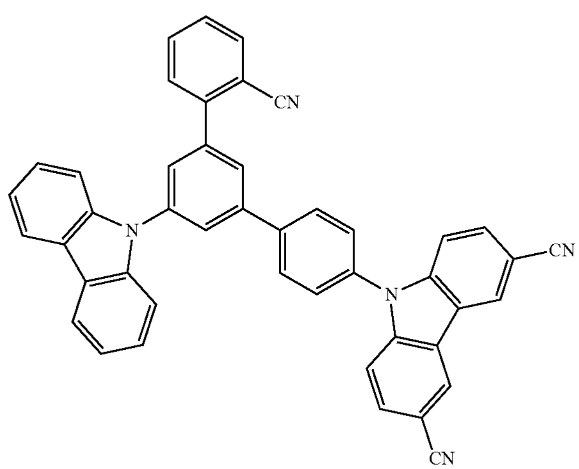
166
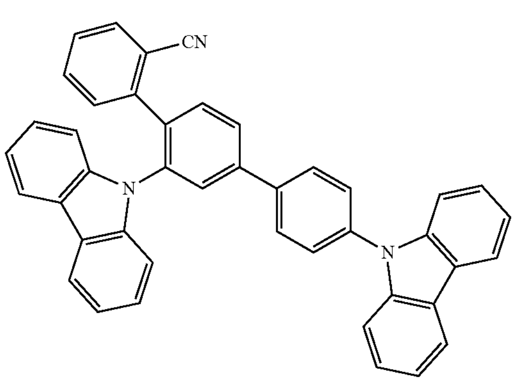
-continued
167
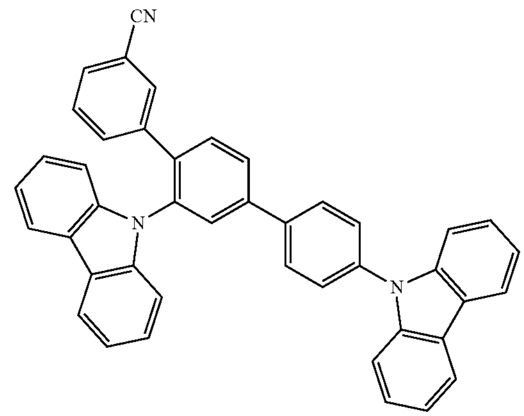
168
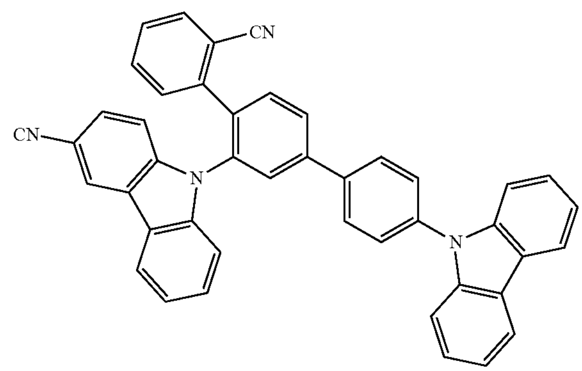
169
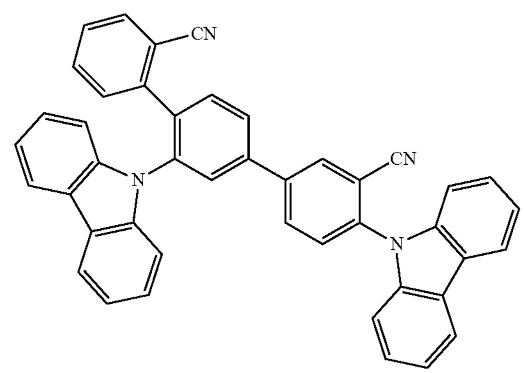
170
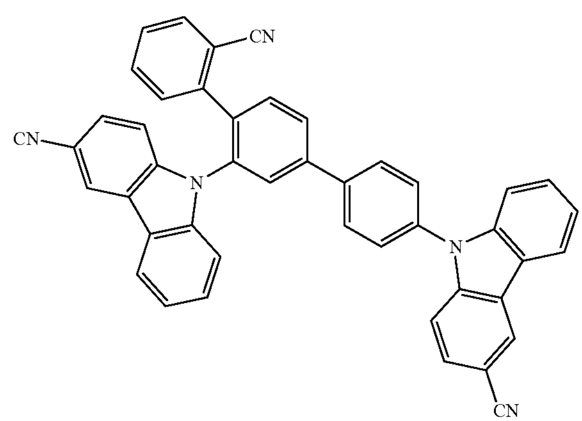

171
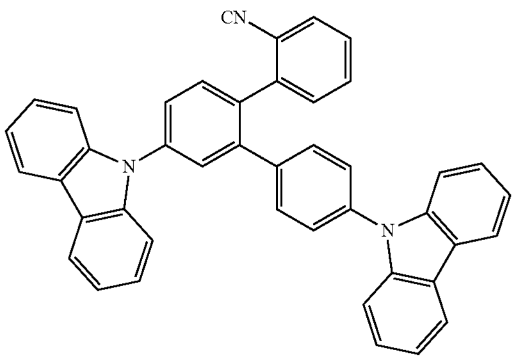
172
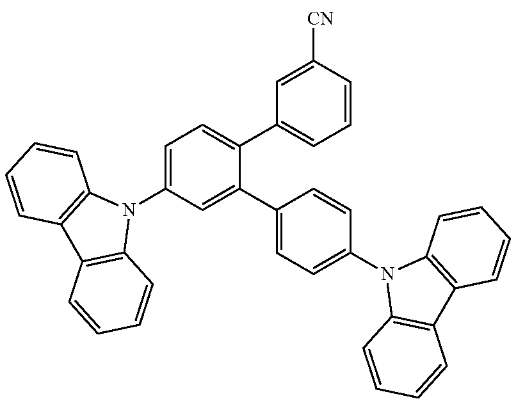
173
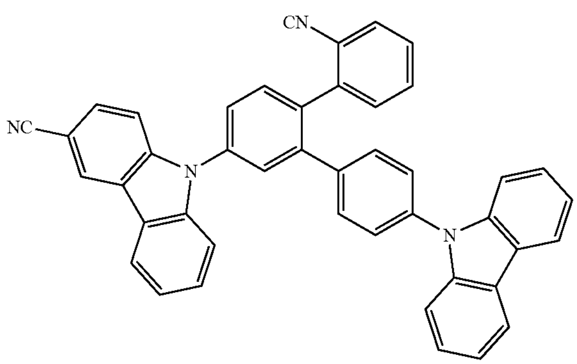
174
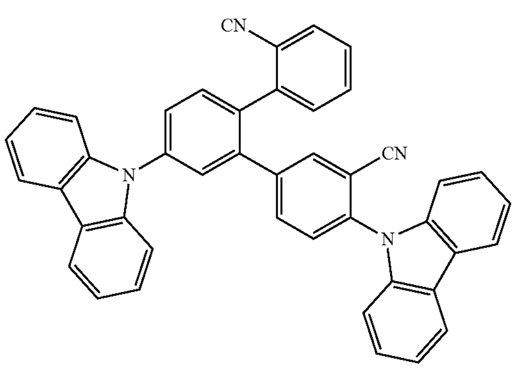
175
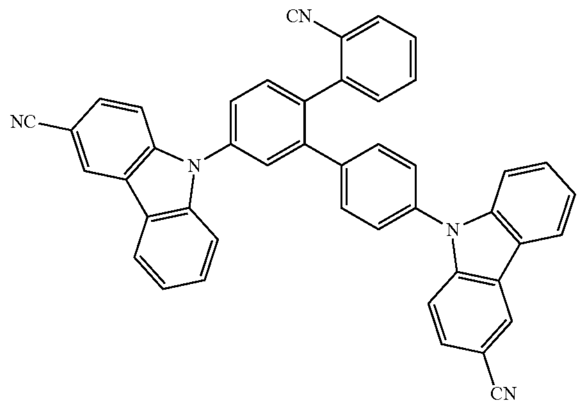
176
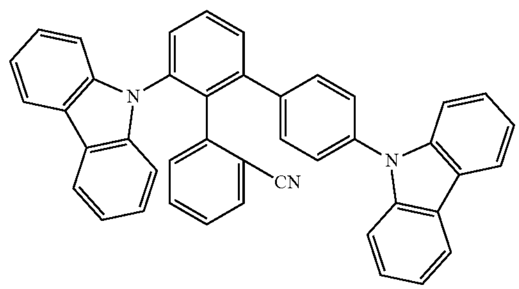
177
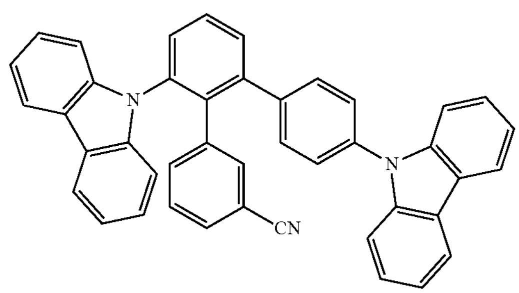
178
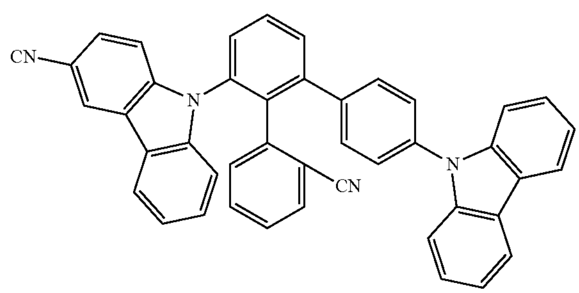

179
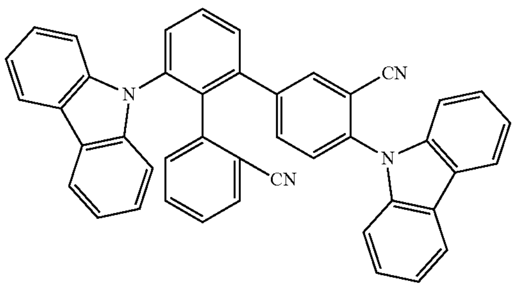
180
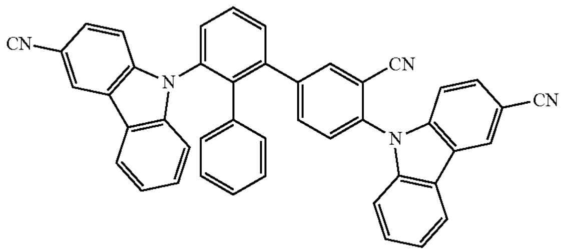
181
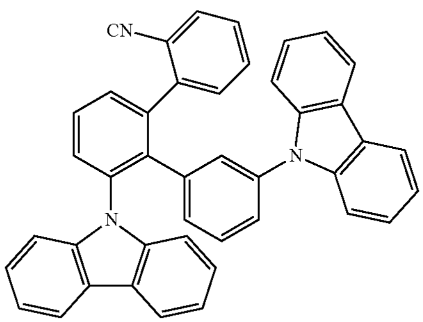
182
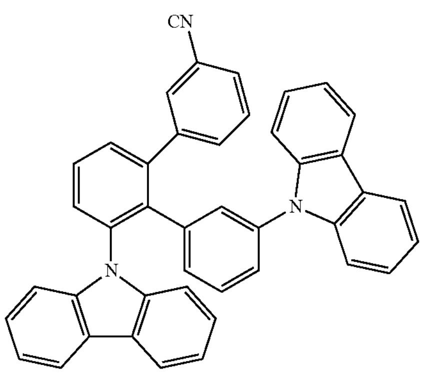
183
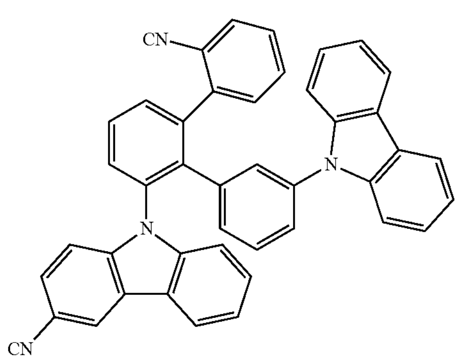
184
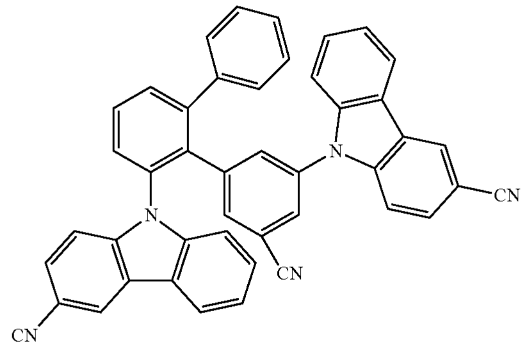
185
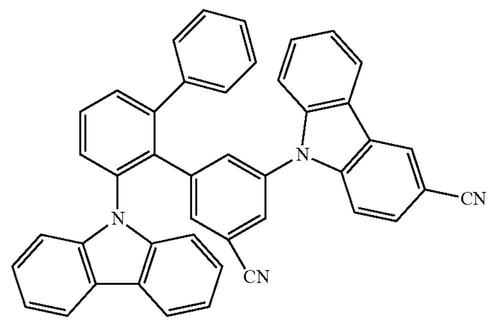
186
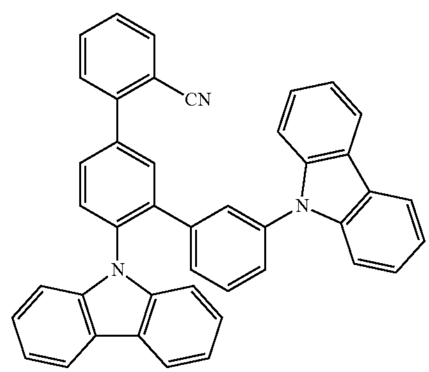
187
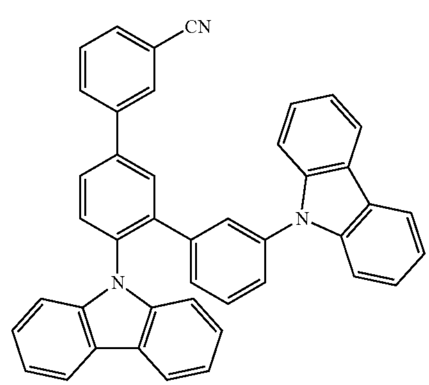

188
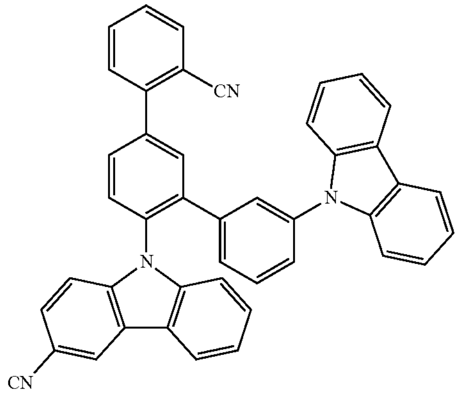
189
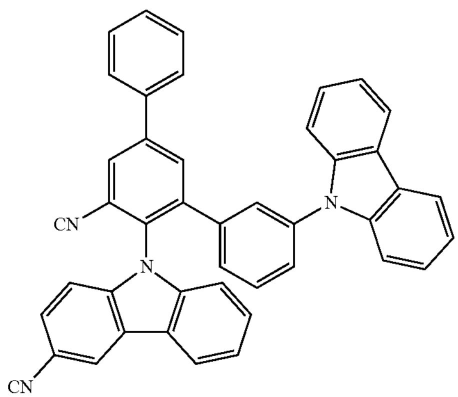
190
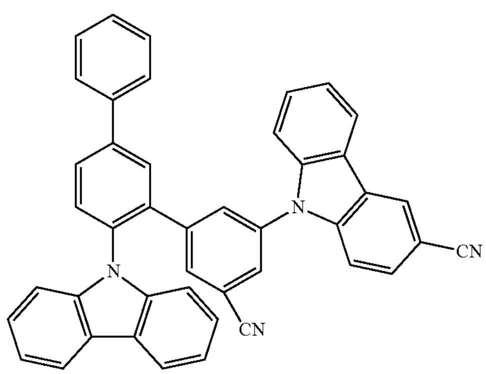
191
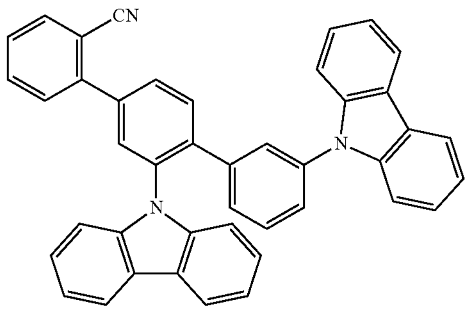
192
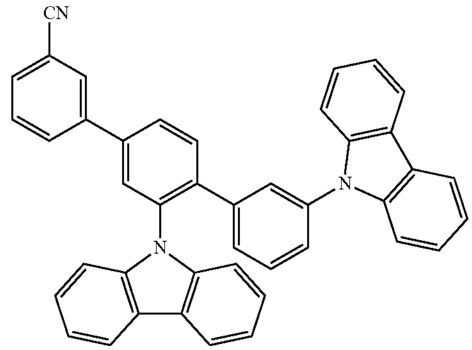
193
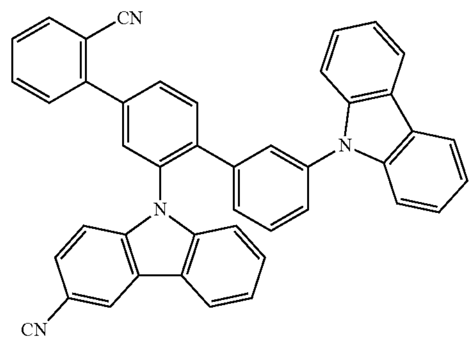
194
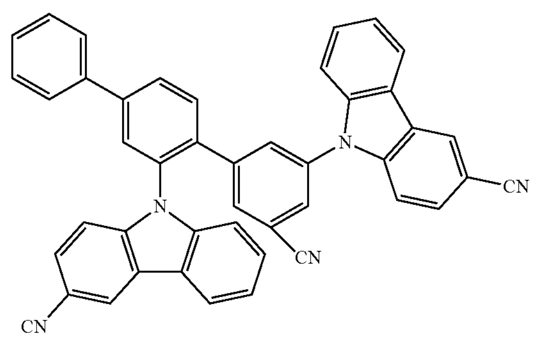
195
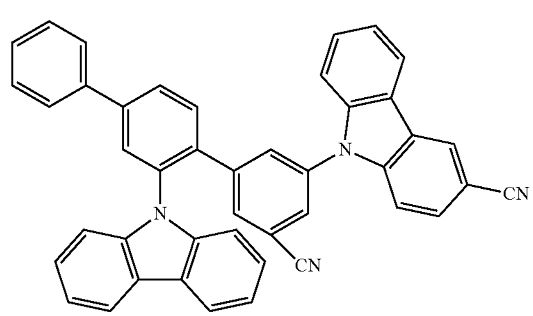

196
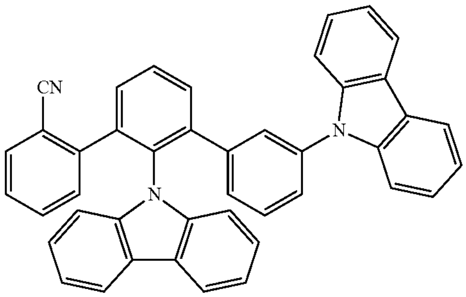
197
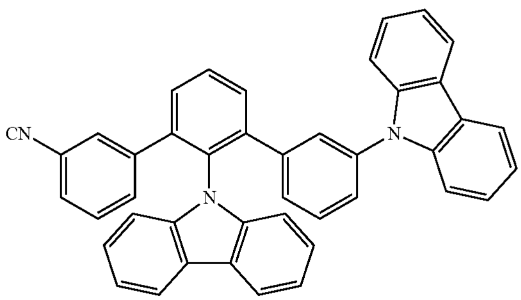
198
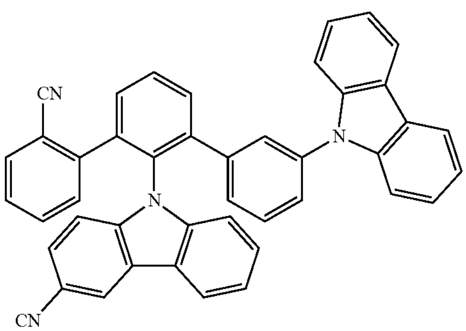
199
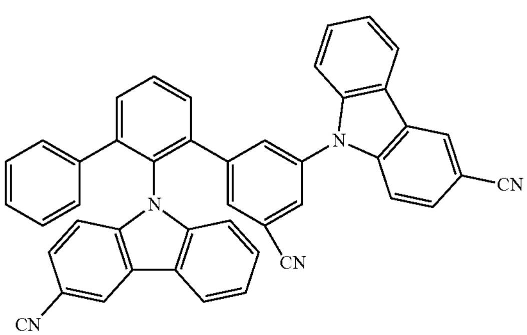
200
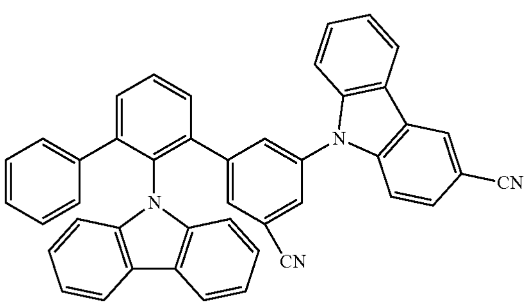
201
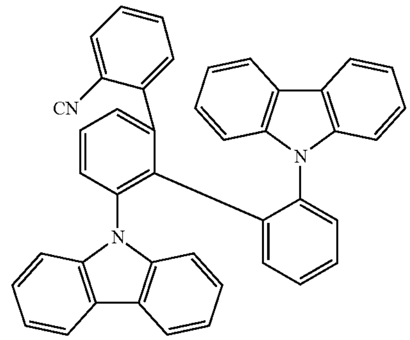
202
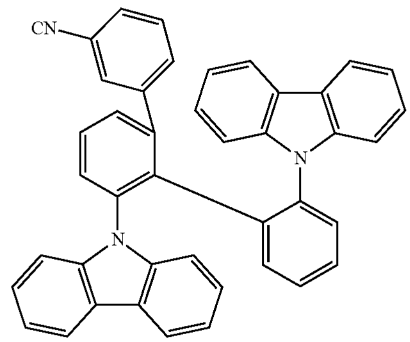
203
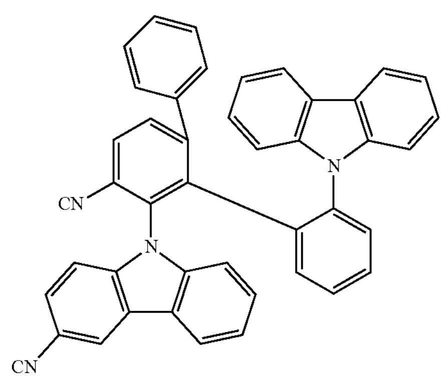
204
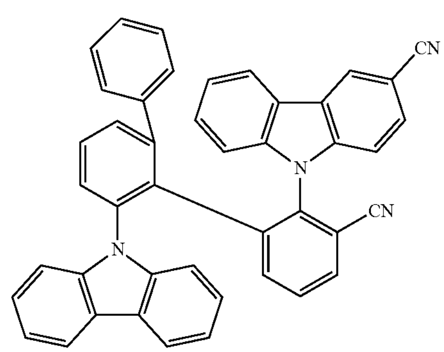

-continued
205
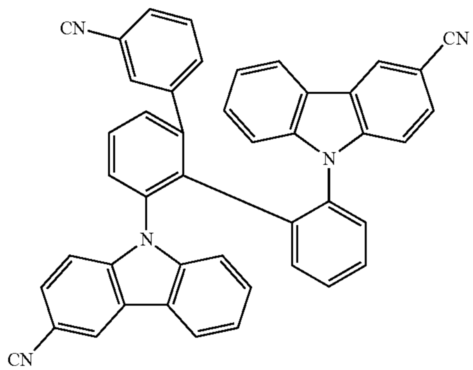
206
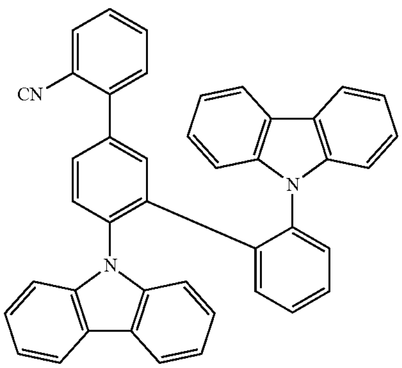
207
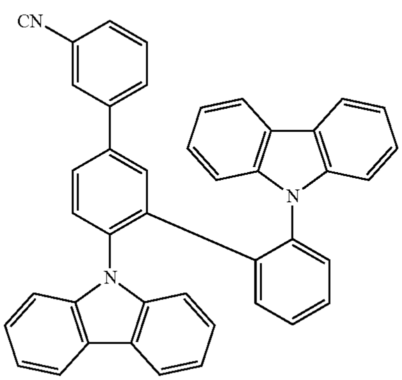
208
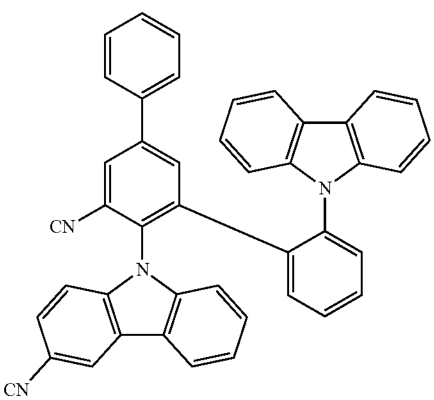
-continued
209
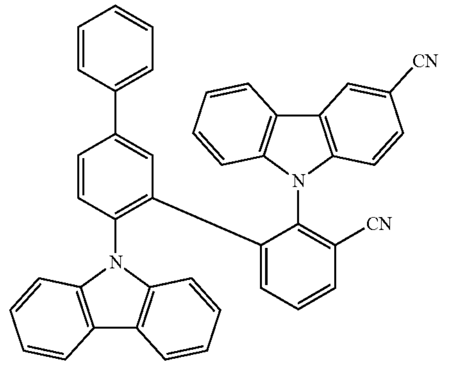
210
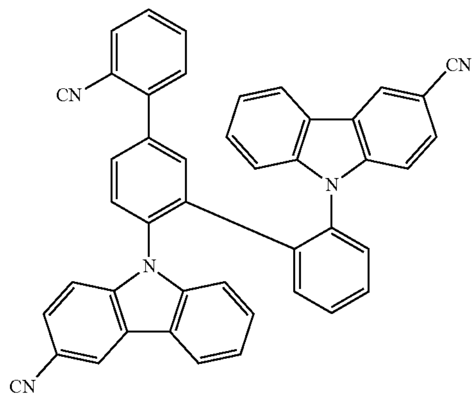
211
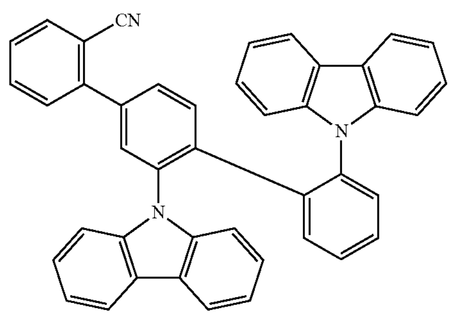
212
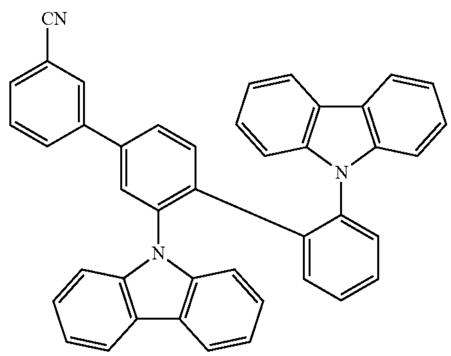

-continued
213
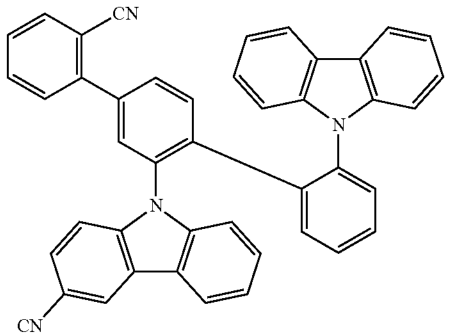
214
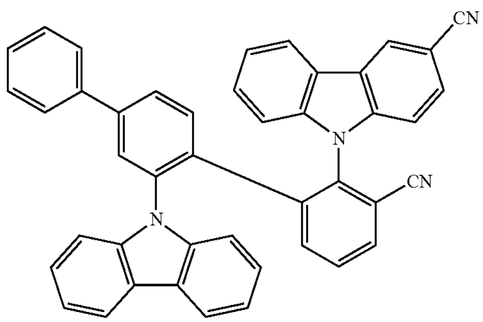
215
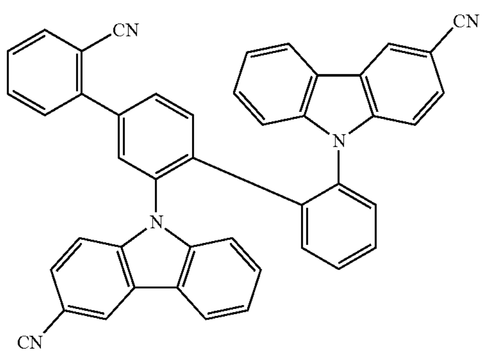
216
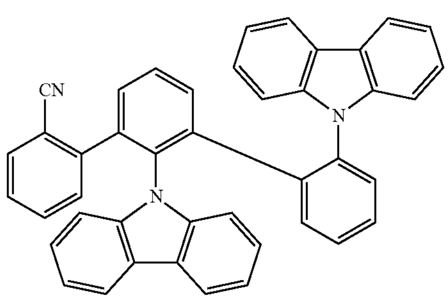
217
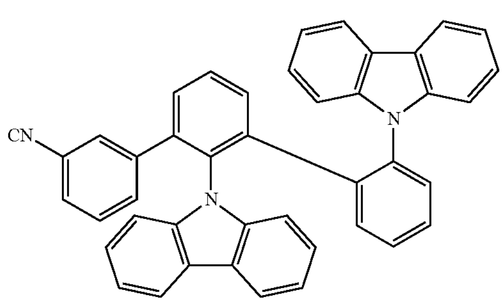
-continued
218
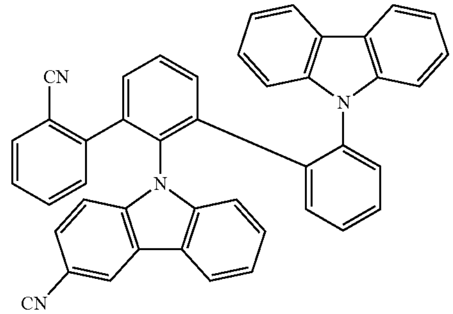
219
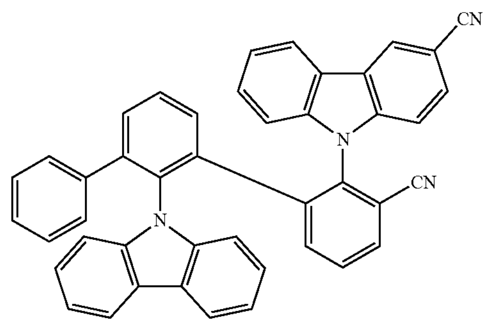
220
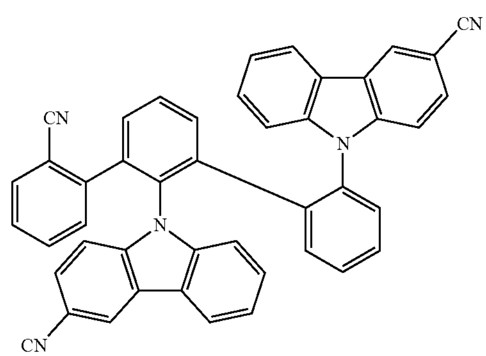
221
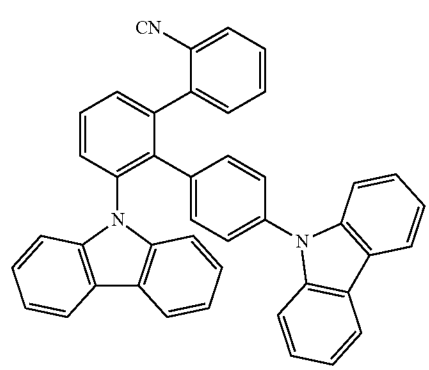

-continued
222
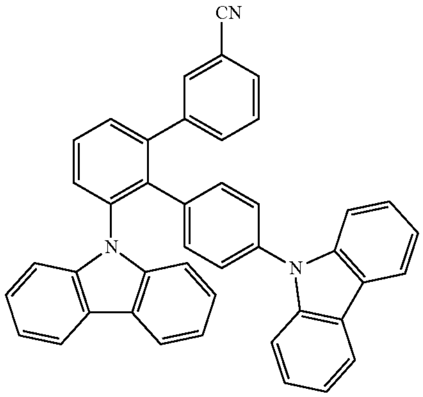
223
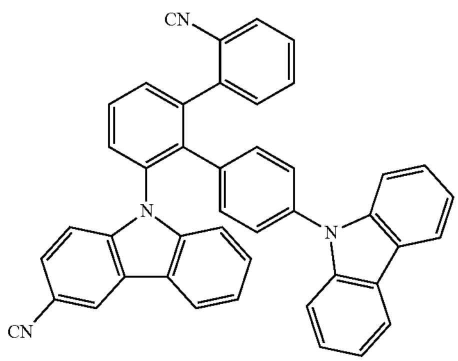
224
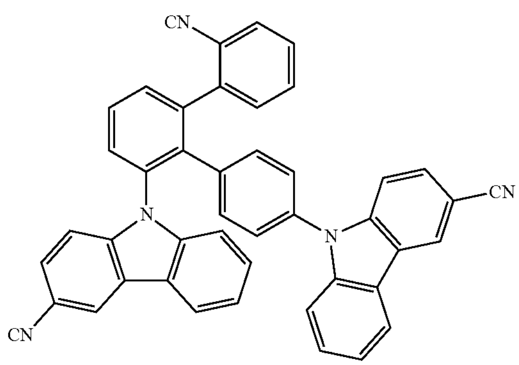
225
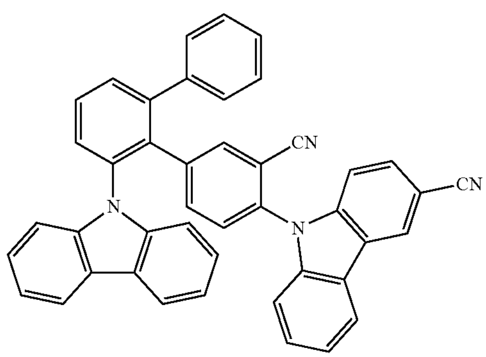
-continued
226
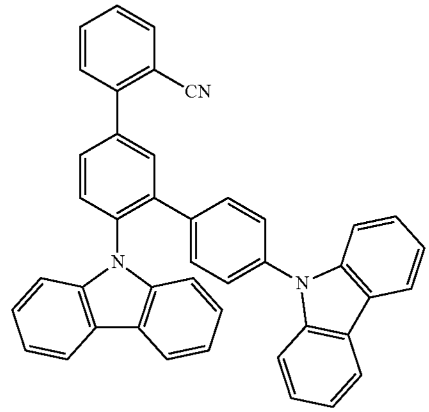
227
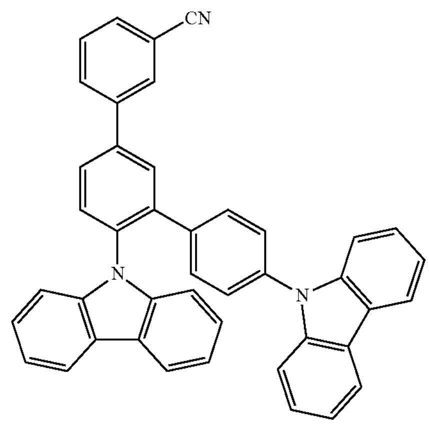
228
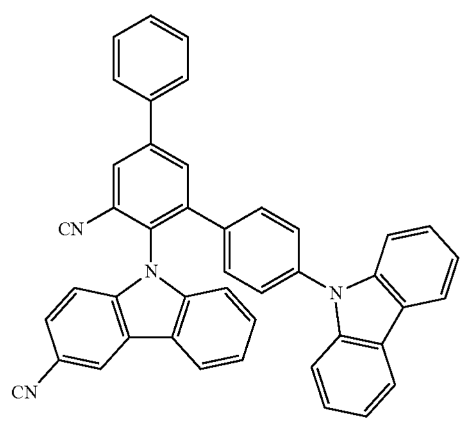

-continued
229
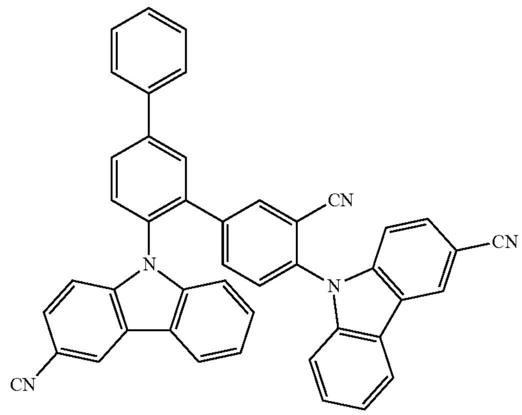
230
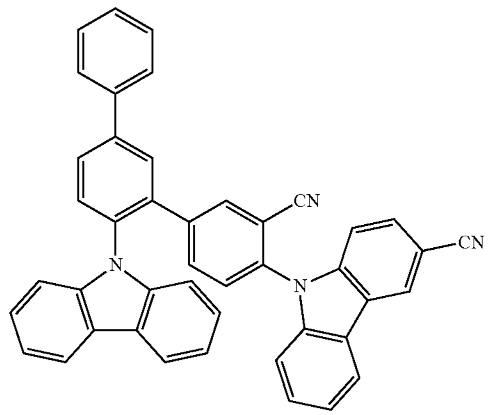
231
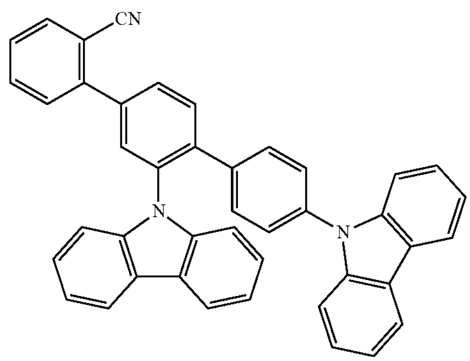
232
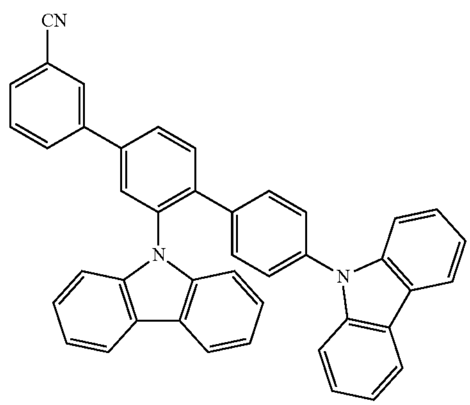
-continued
233
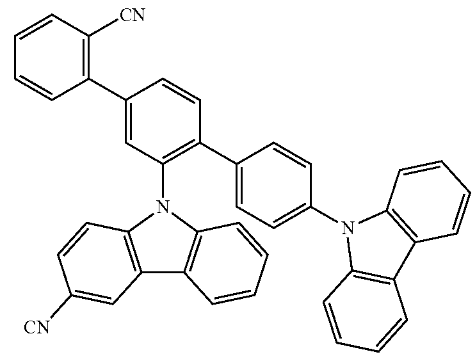
234
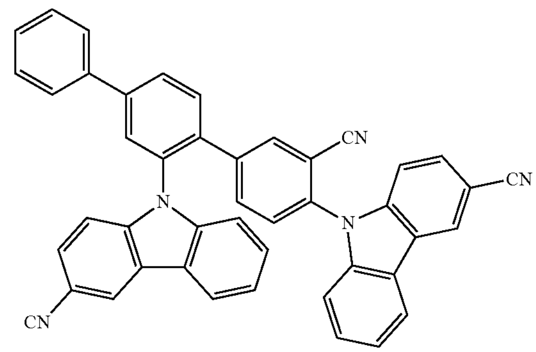
235
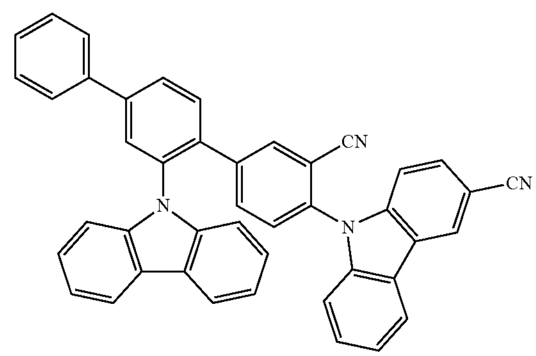
236
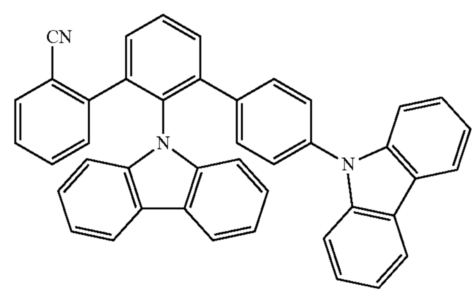

-continued
237
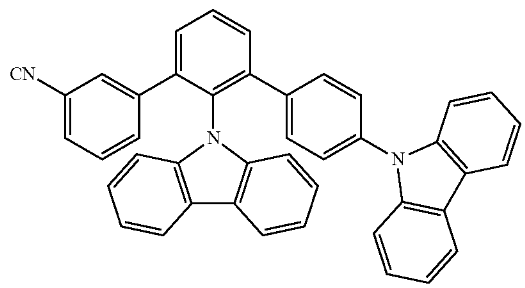
238
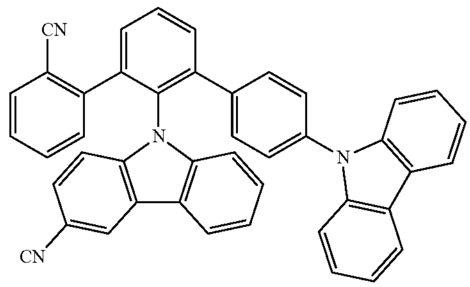
239
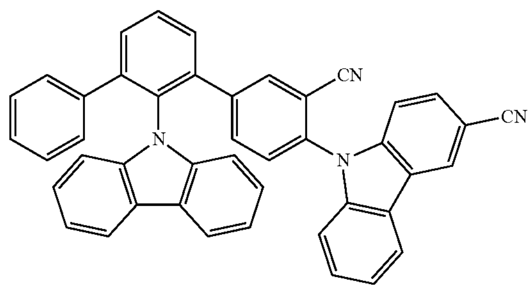
240
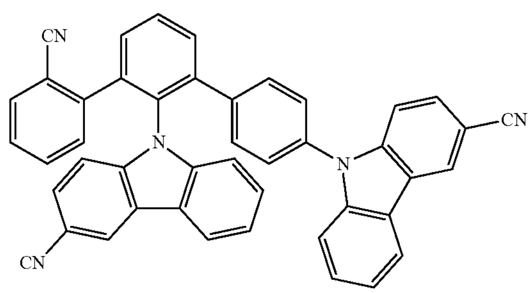
241
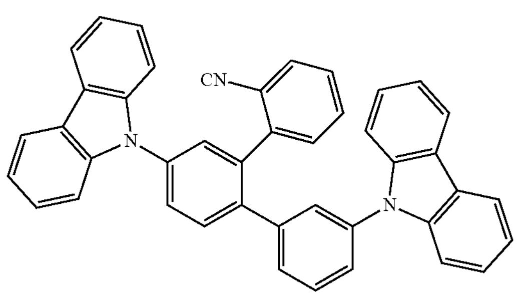
-continued
242
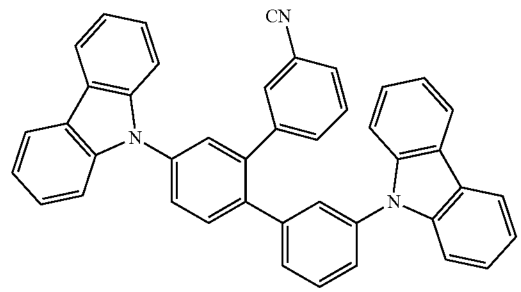
243
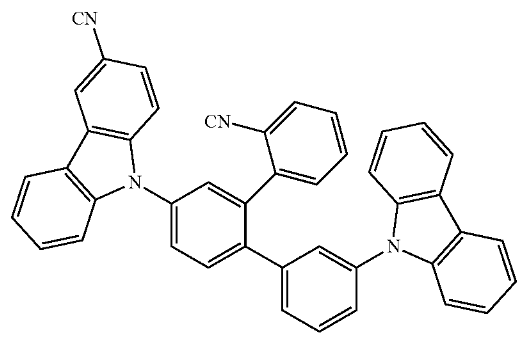
244
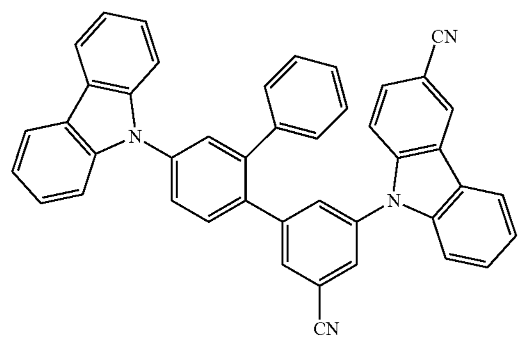
245
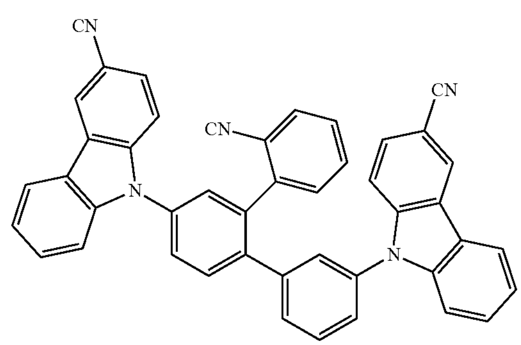

246
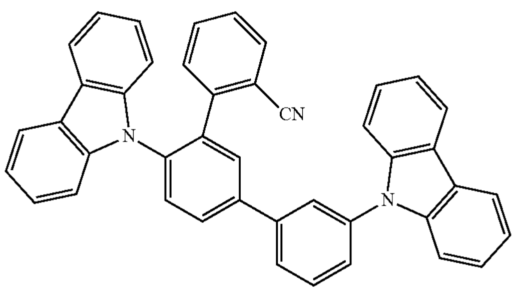
247
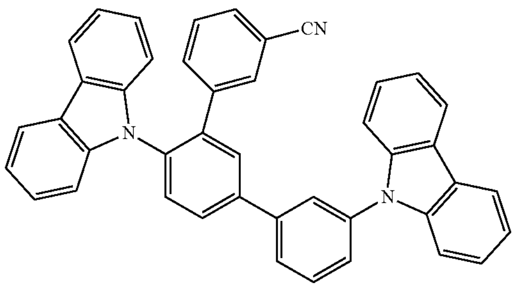
248
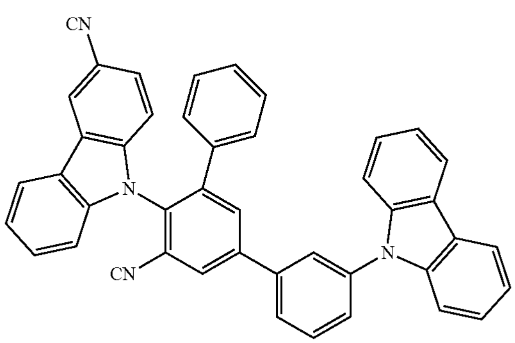
249
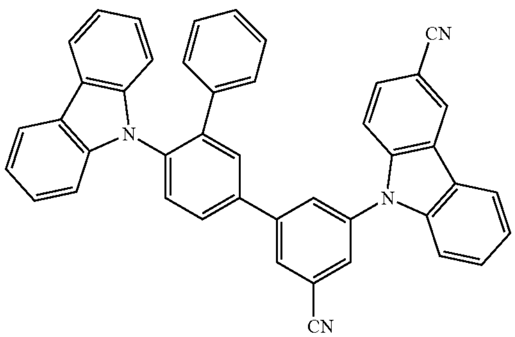
250
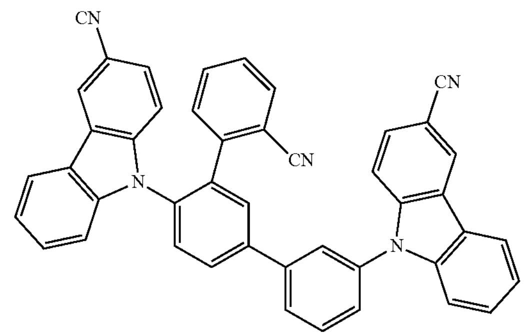
251
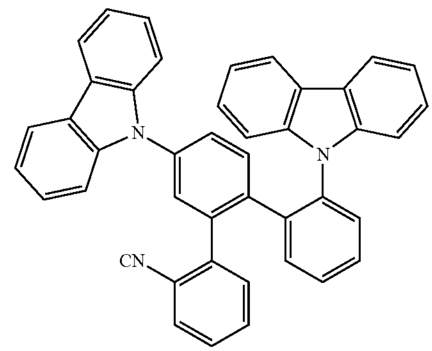
252
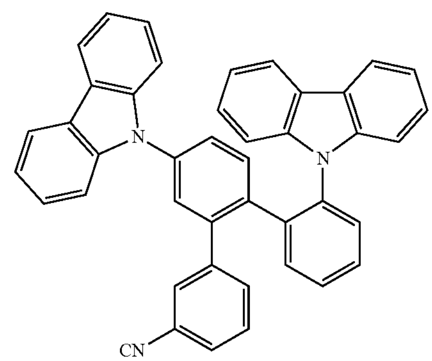
253
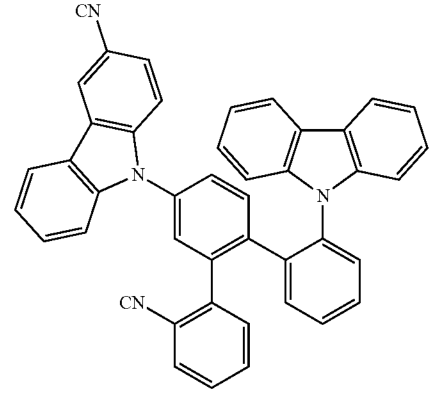

-continued
254
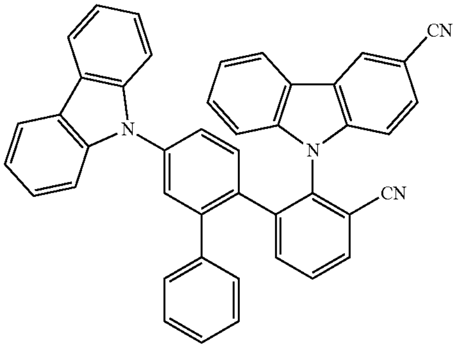
255
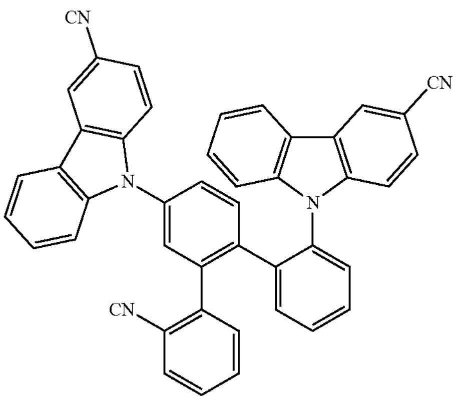
256
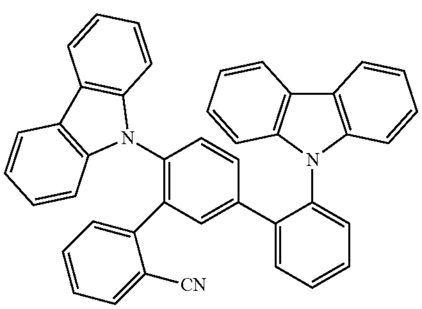
257
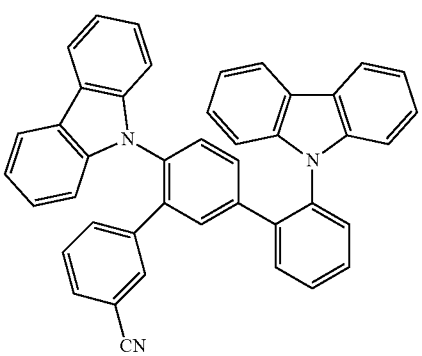
-continued
258
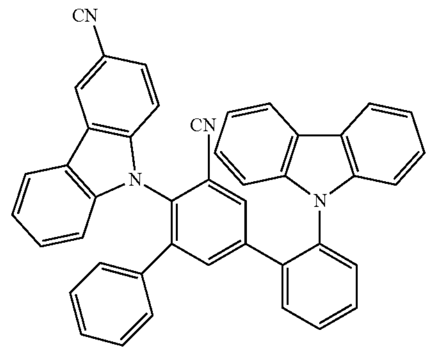
259
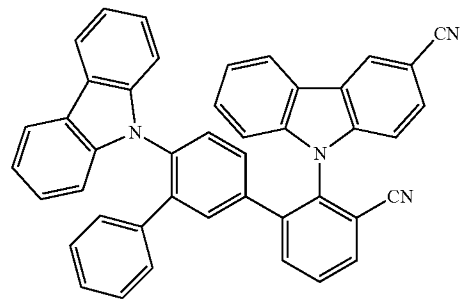
260
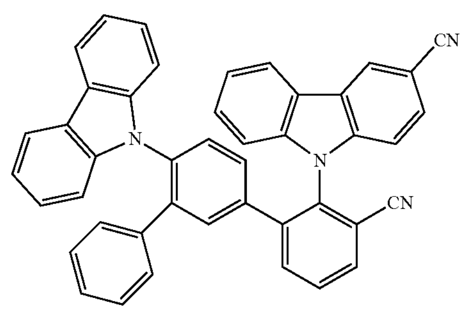
261
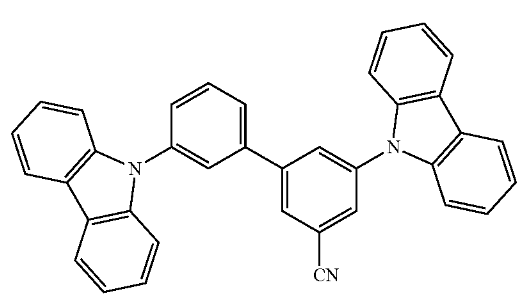
In an embodiment, the hole transport host may be Compounds H-H1 to H-H104, but embodiments of the present disclosure are not limited thereto:

H-H1
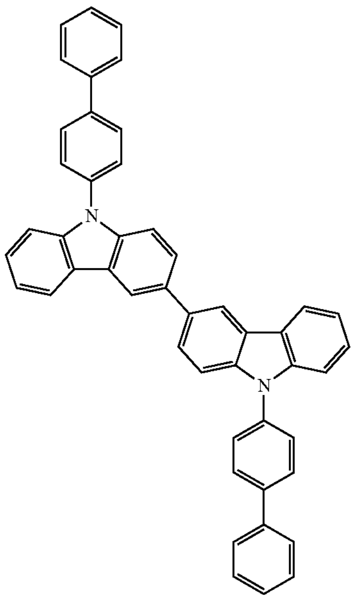
H-H2
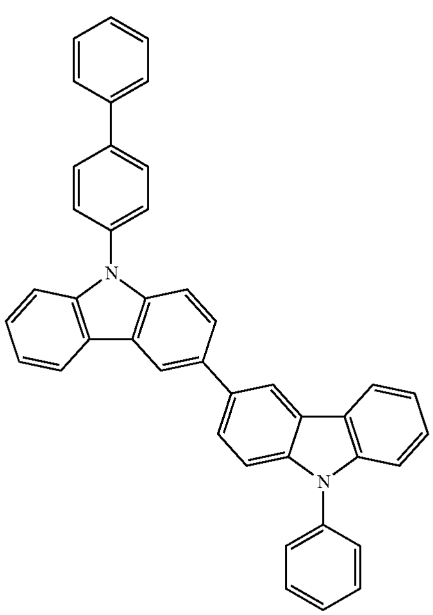
-continued
H-H3
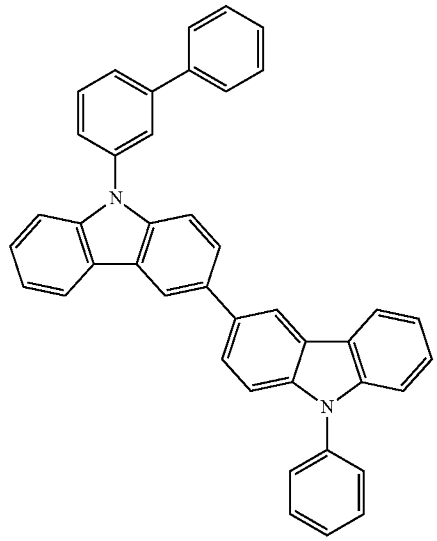
H-H4
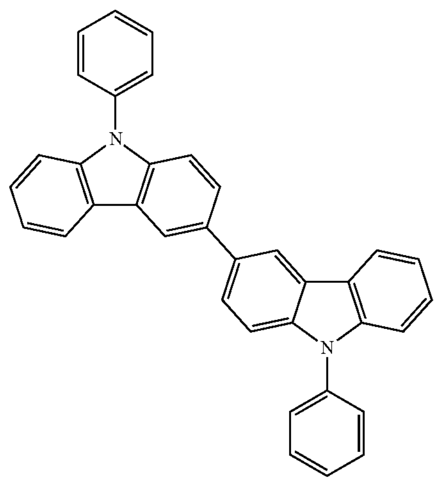
H-H5
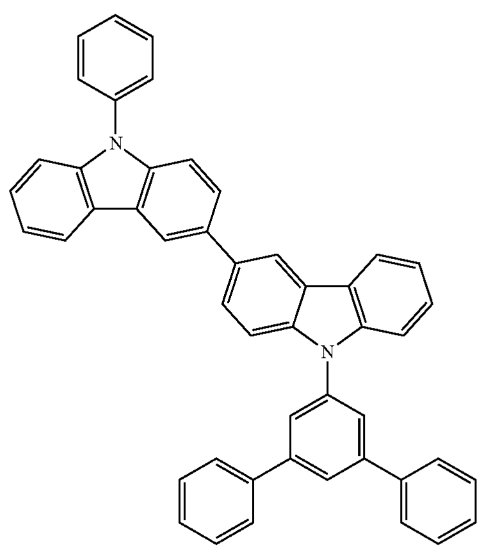

-continued
H-H6
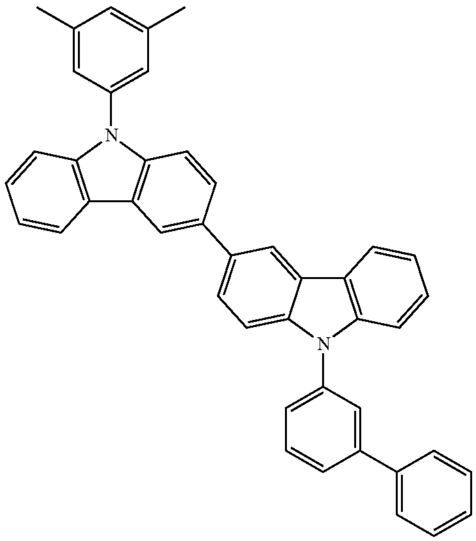
H-H7
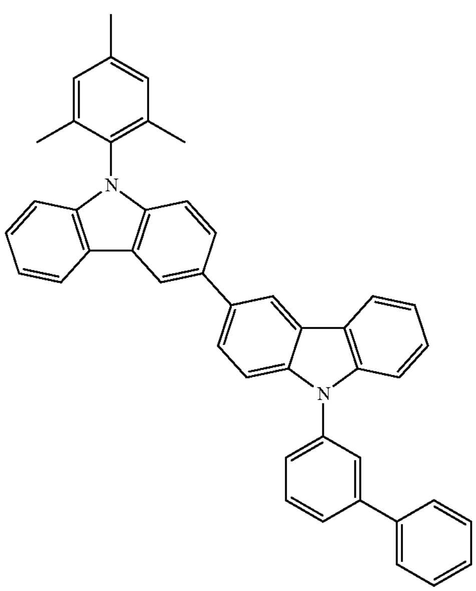
-continued
H-H8
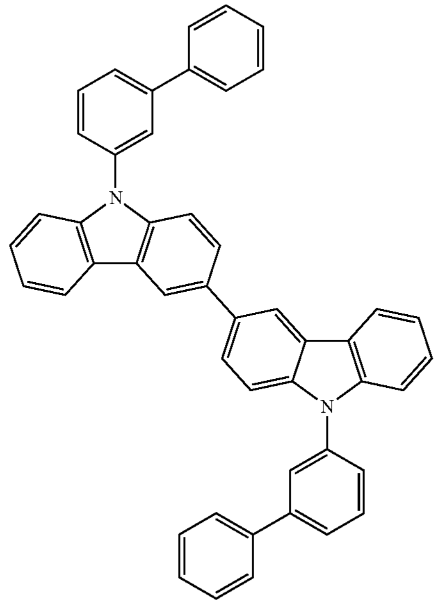
H-H9
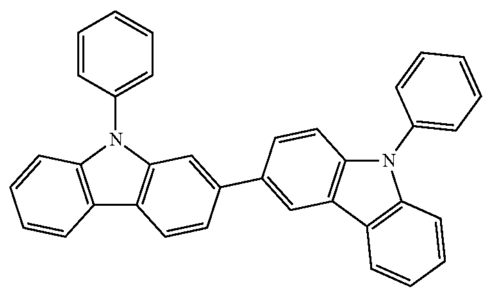
H-H10
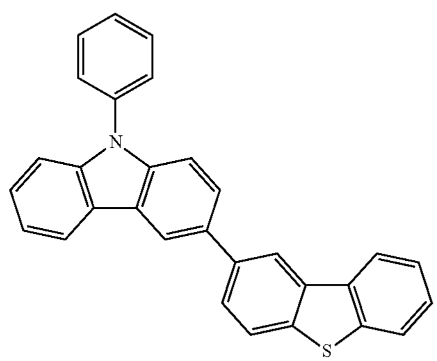
H-H11
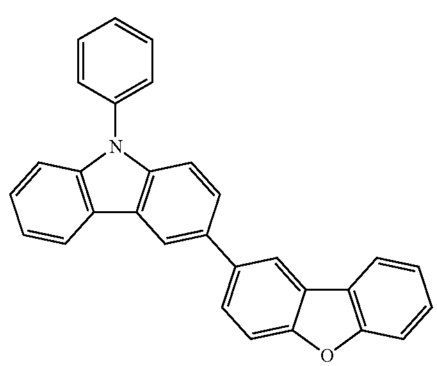

-continued
H-H12
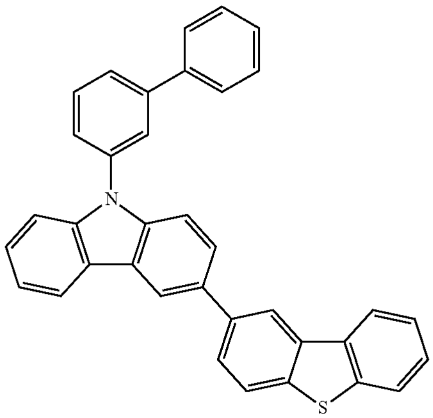
H-H13
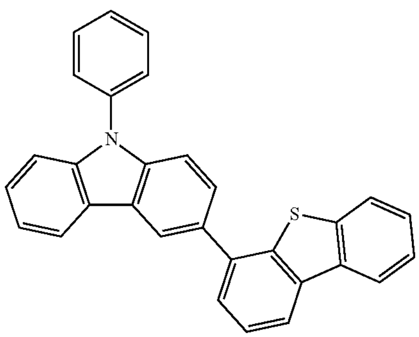
H-H14
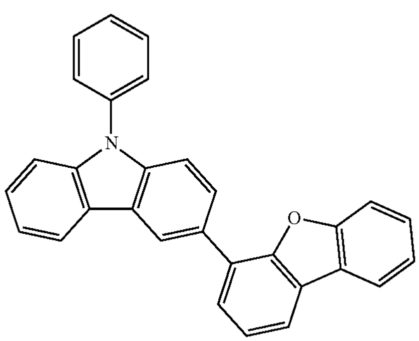
H-H15
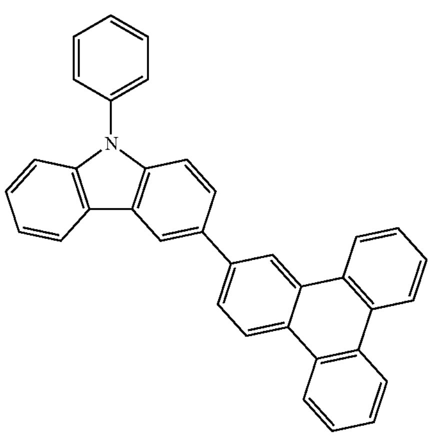
-continued
H-H16
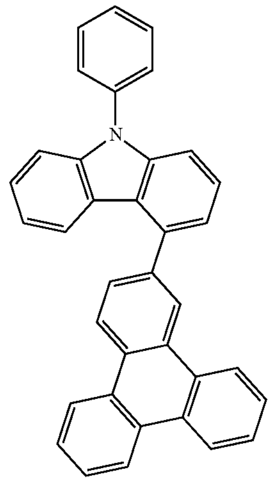
H-H17
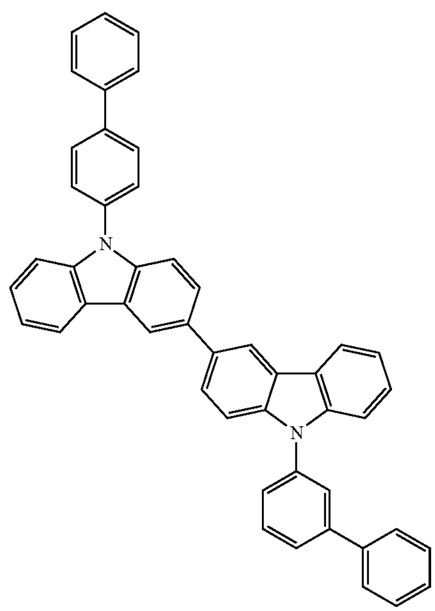
H-H18
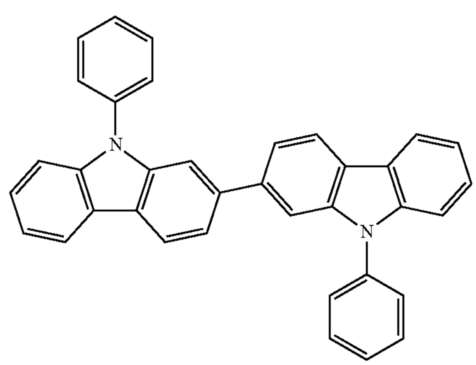

-continued
H-H19
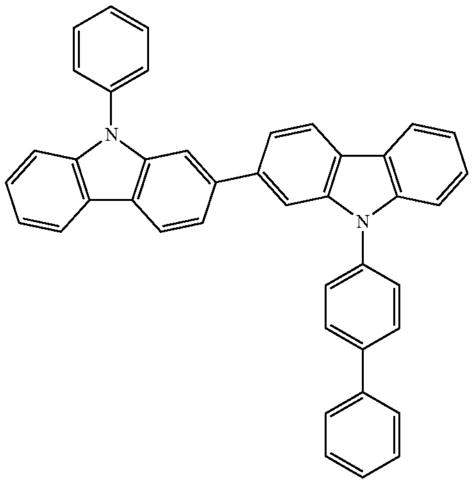
H-H20
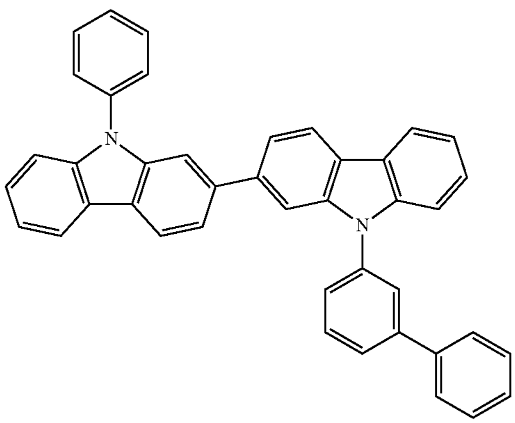
H-H21
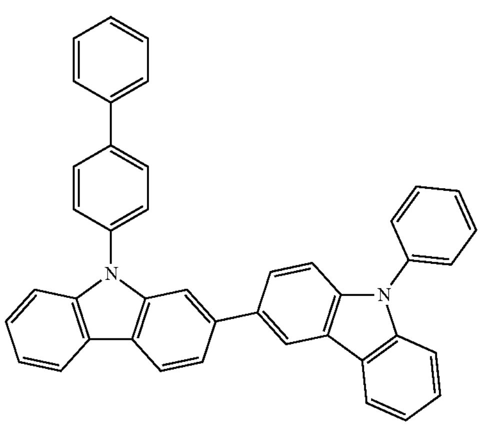
-continued
H-H22
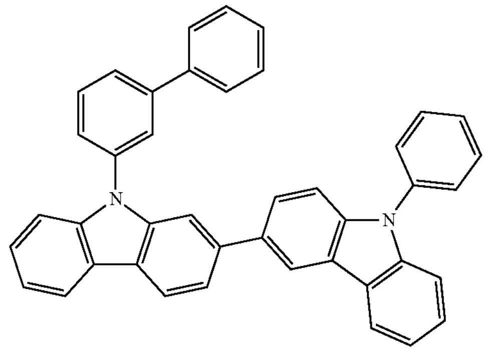
H-H23
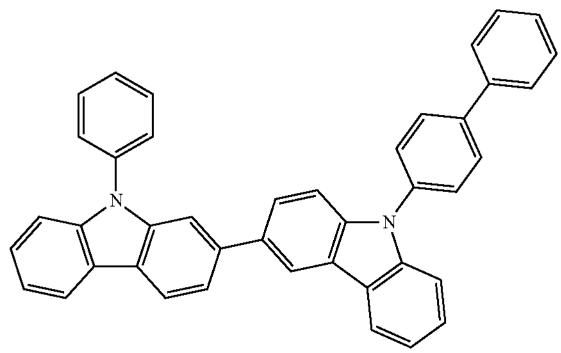
H-H24
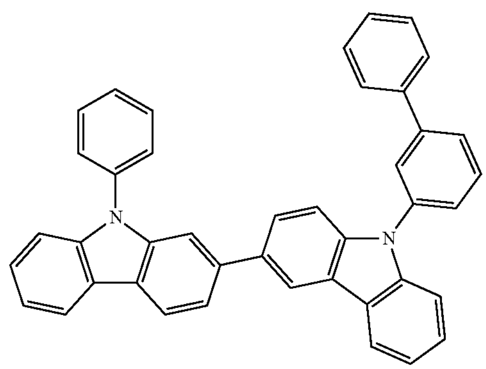
H-H25
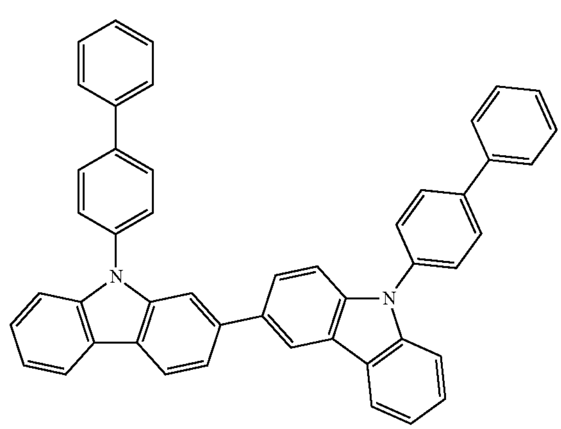

H-H26
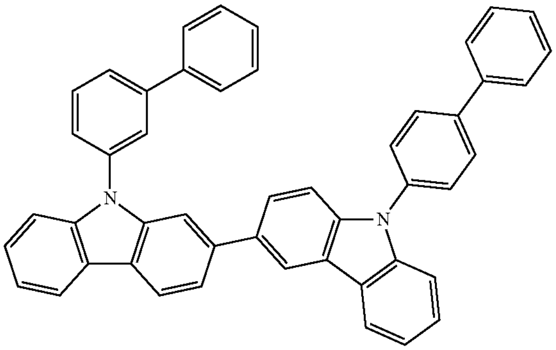
H-H27
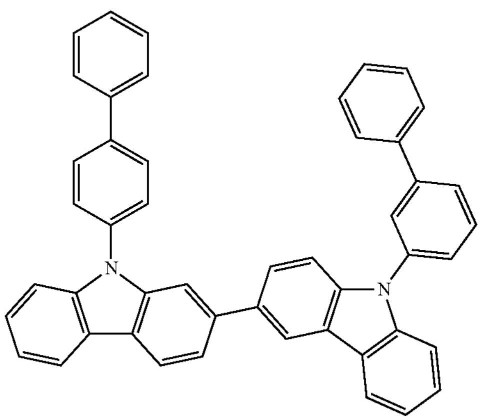
H-H28
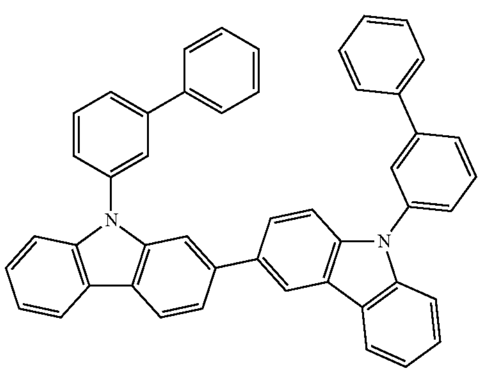
H-H29
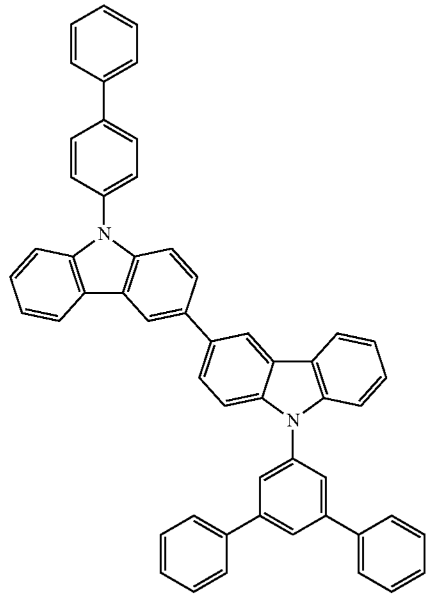
H-H30
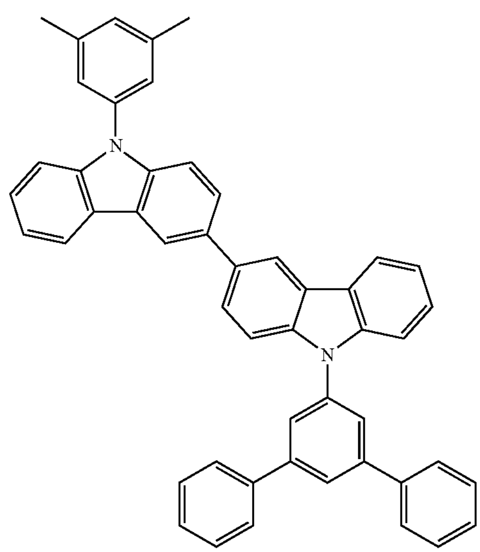

H-H31
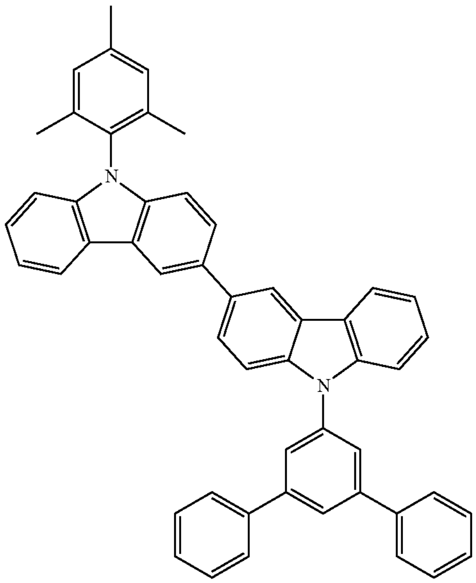
H-H32
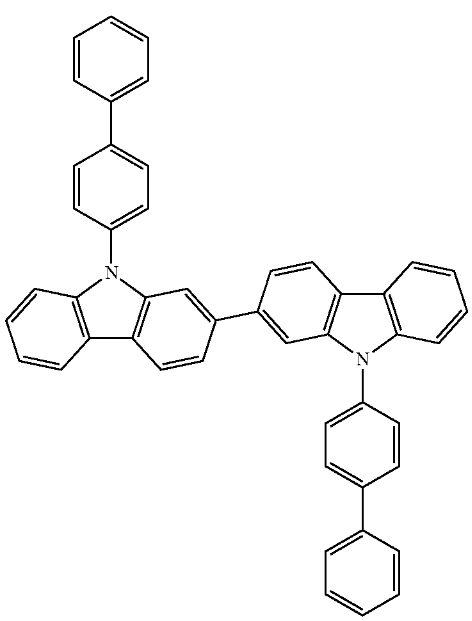
H-H33
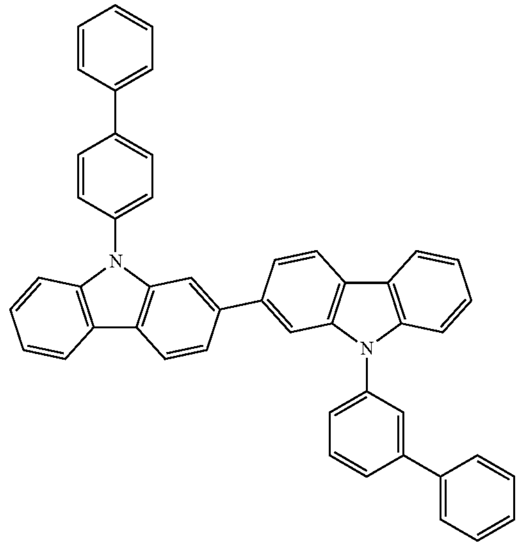
H-H34
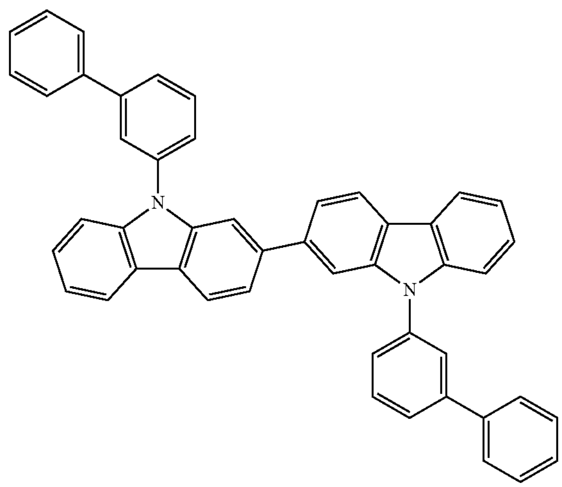
H-H35
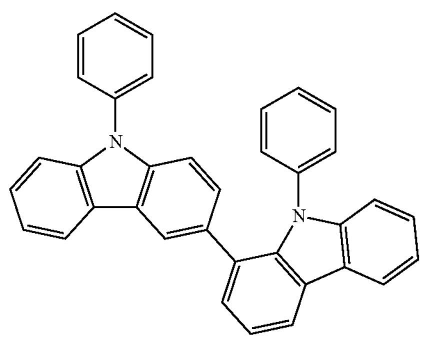

-continued
H-H36
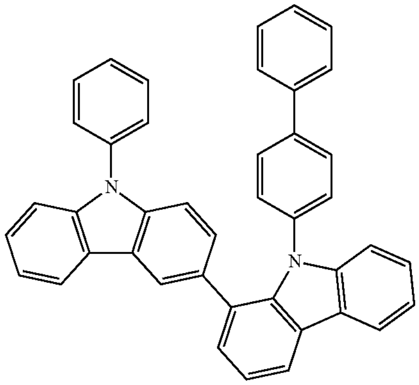
H-H37
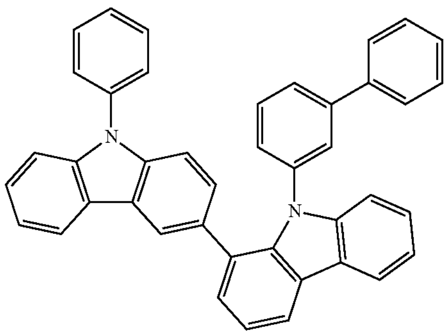
H-H38
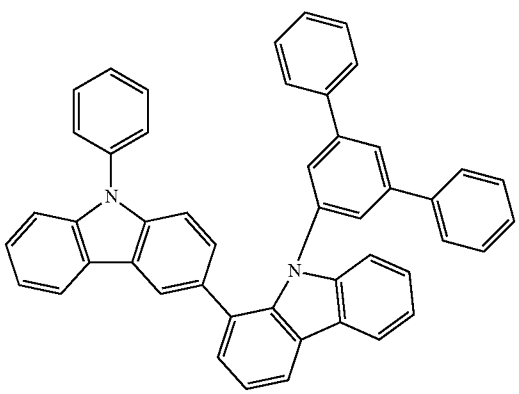
H-H39
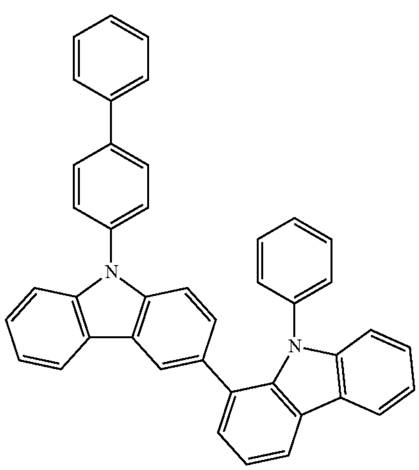
-continued
H-H40
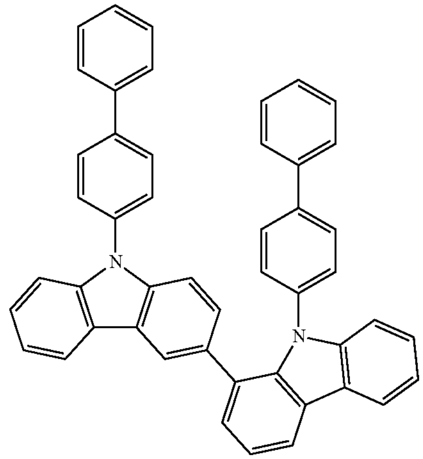
H-H41
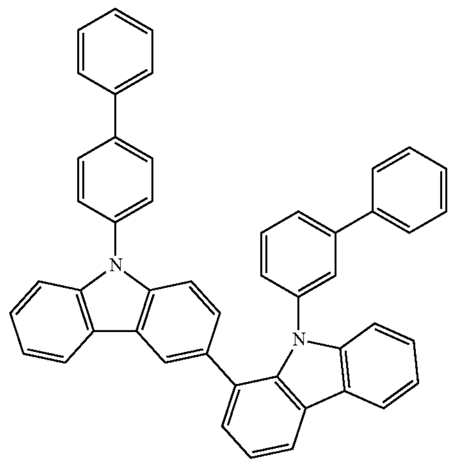
H-H42
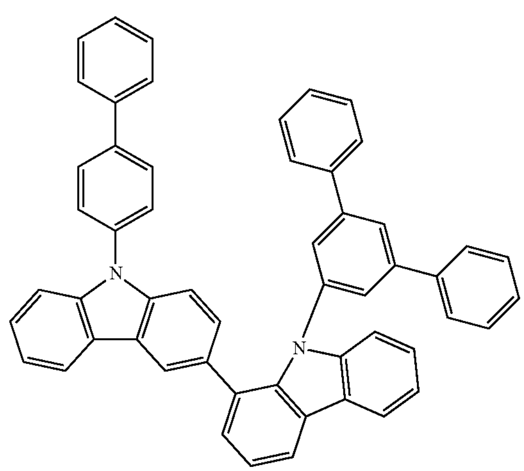

-continued
H-H43
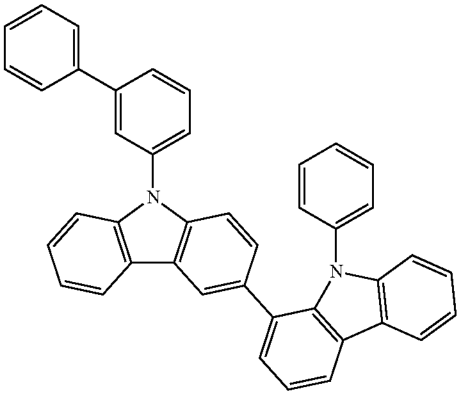
H-H44
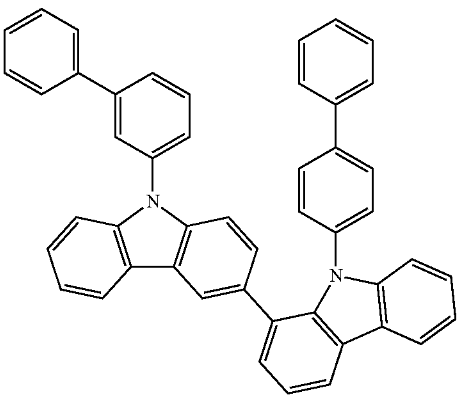
H-H45
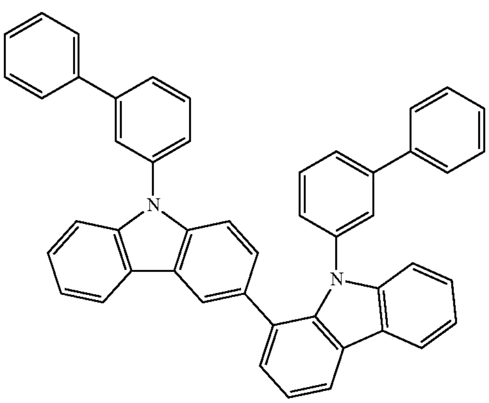
H-H46
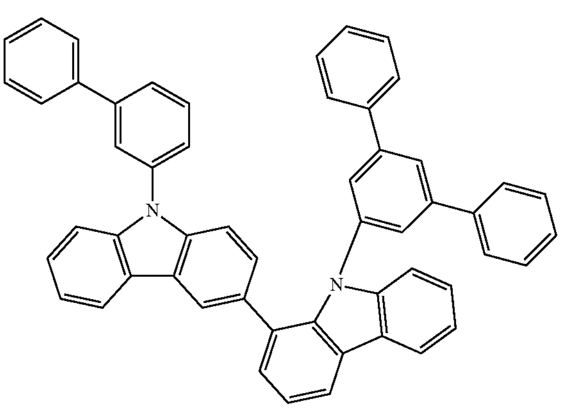
-continued
H-H47
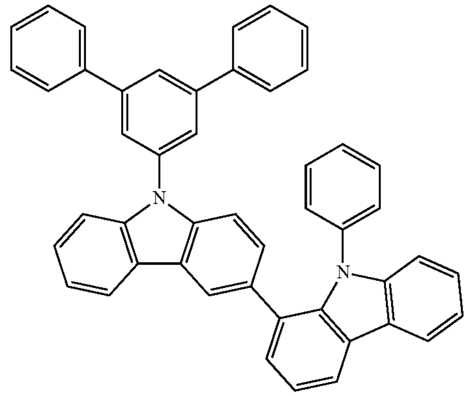
H-H48
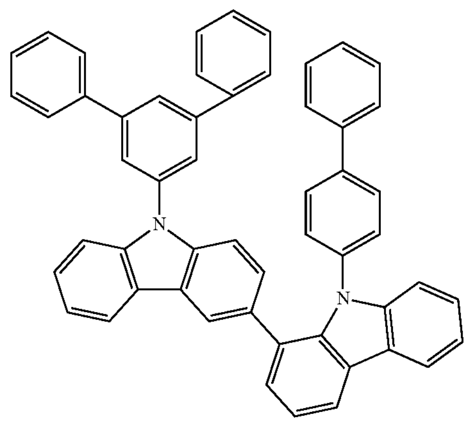
H-H49
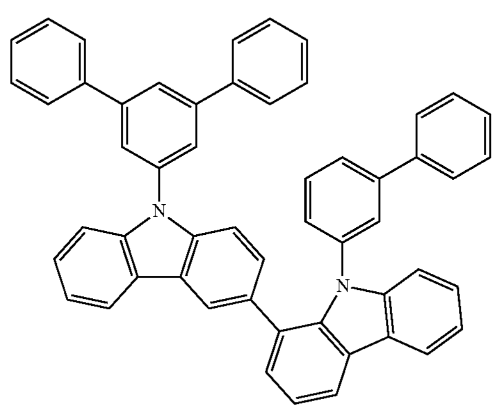

-continued
H-H50
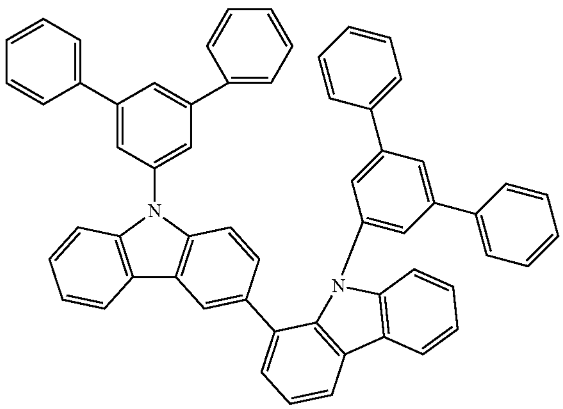
H-H51
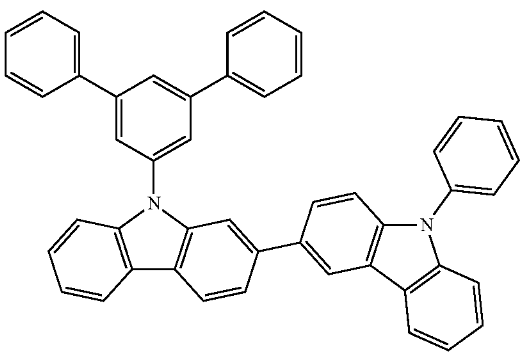
H-H52
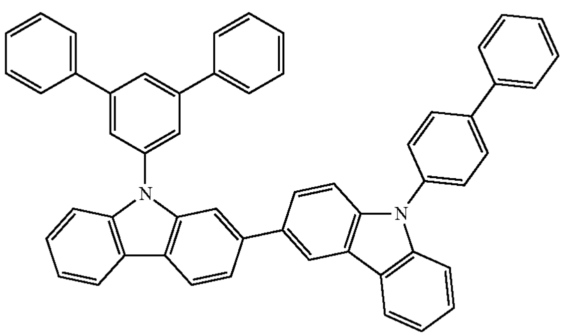
H-H53
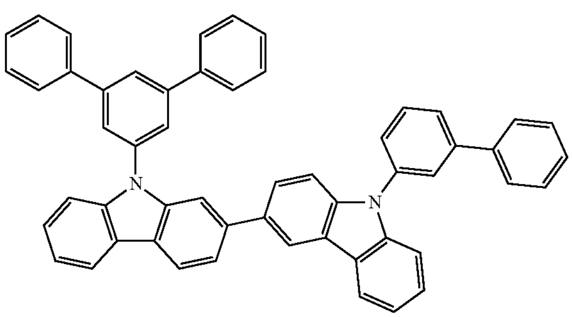
-continued
H-H54
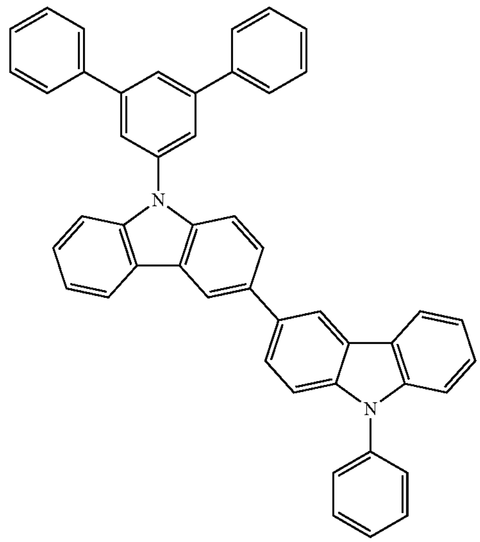
H-H55
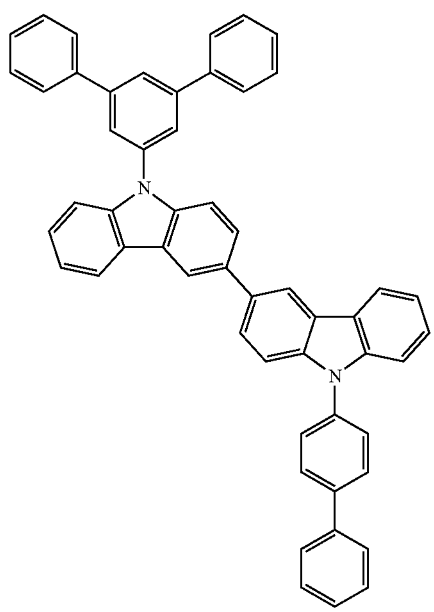

-continued
H-H56
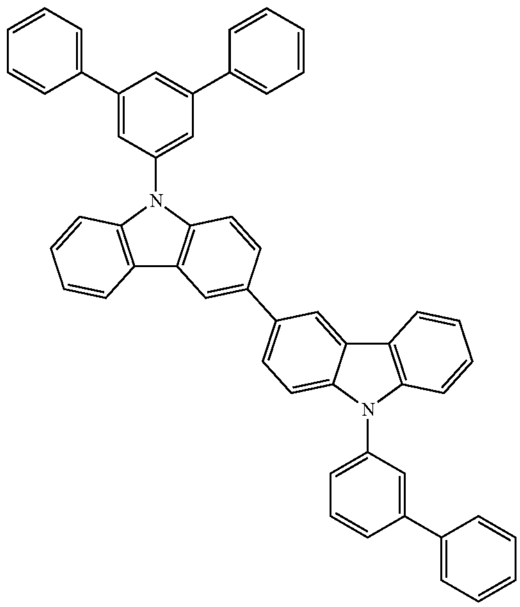
H-H57
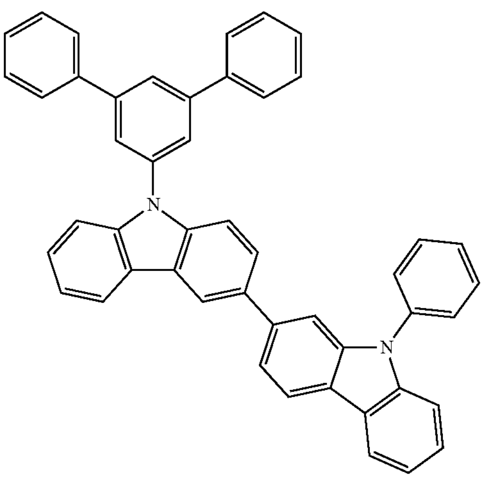
H-H58
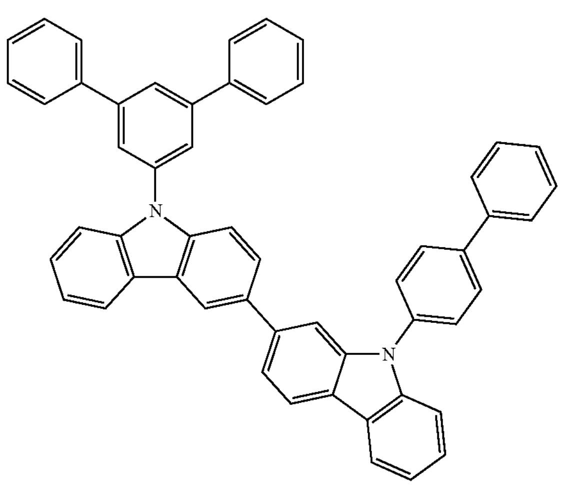
-continued
H-H59
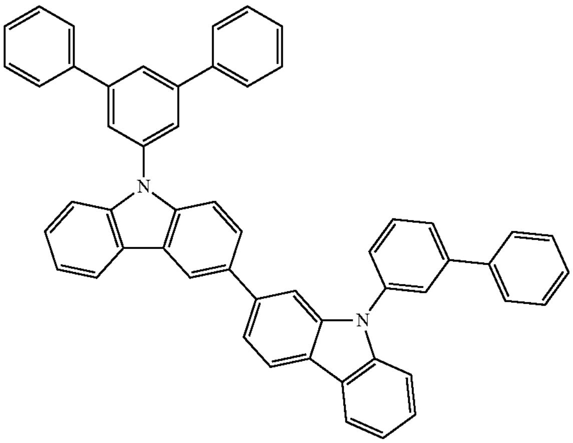
H-H60
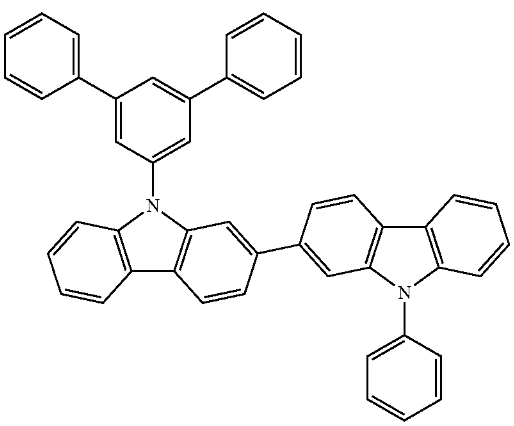
H-H61
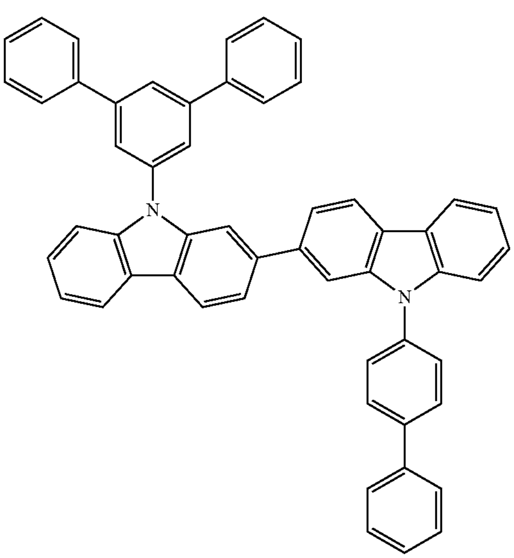

-continued
H-H62
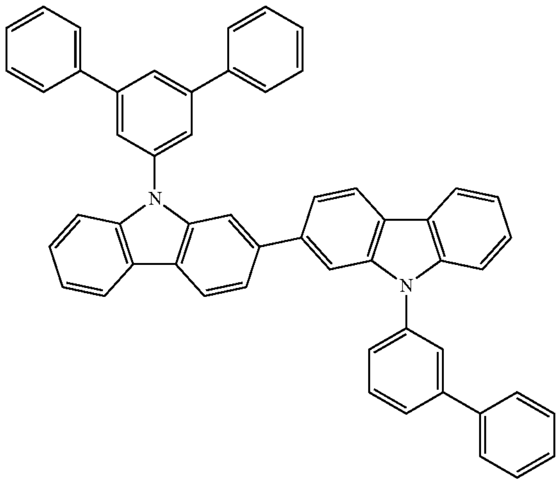
H-H63
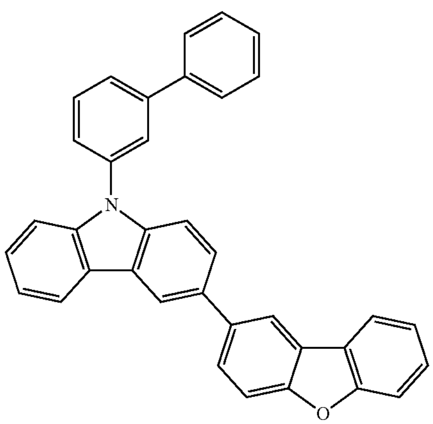
H-H64
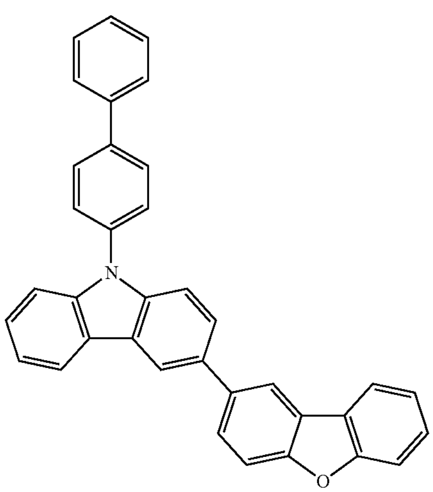
-continued
H-H65
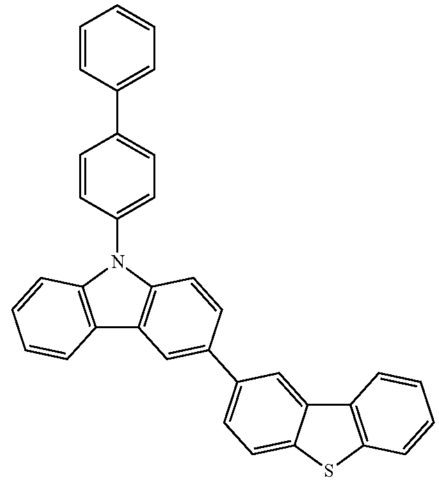
H-H66
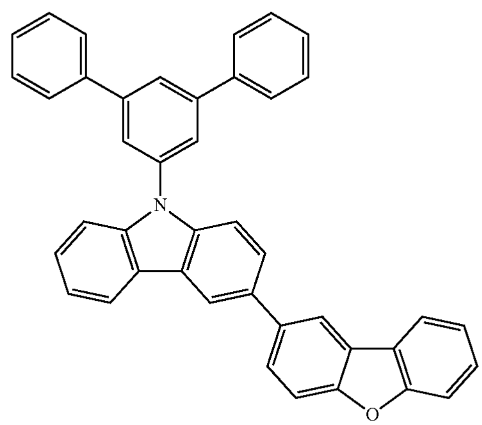
H-H67
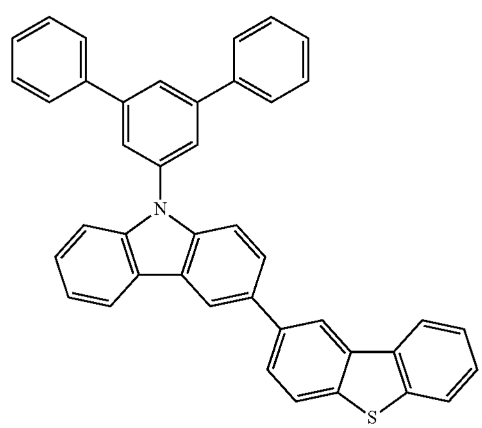

-continued
H-H68
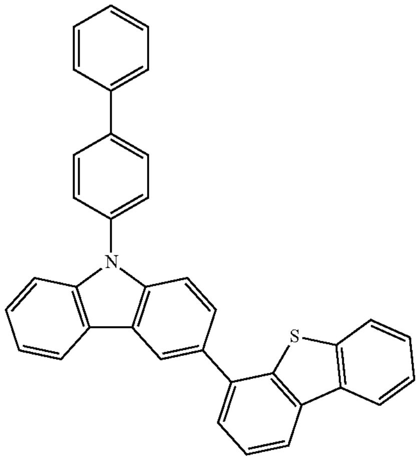
H-H69
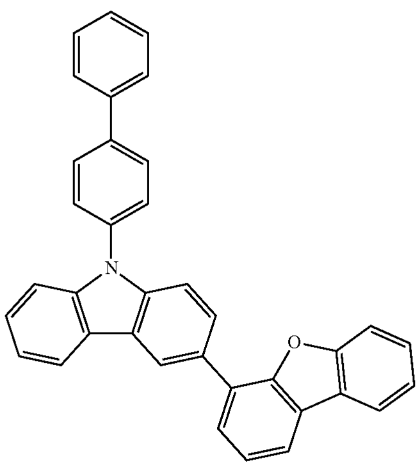
H-H70
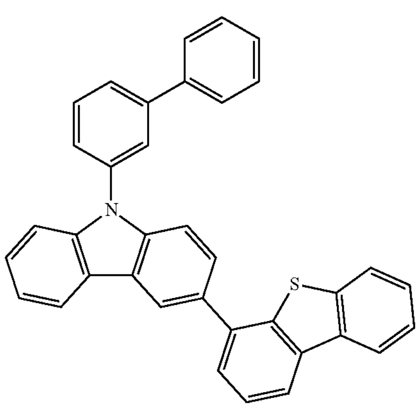
-continued
H-H71
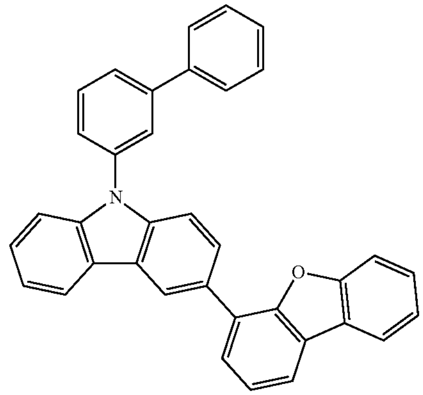
H-H72
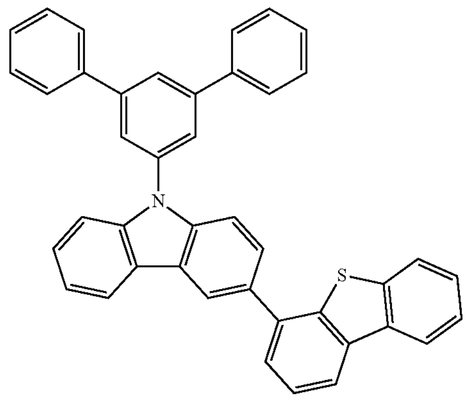
H-H73
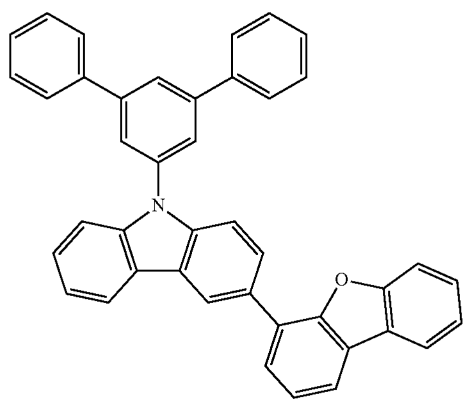
H-H74
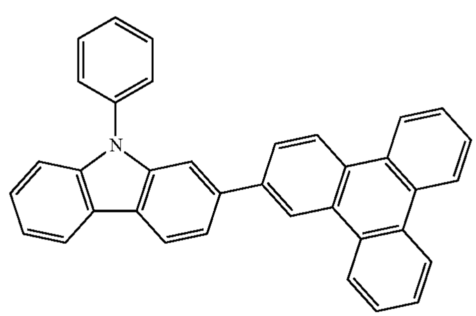

-continued
H-H75
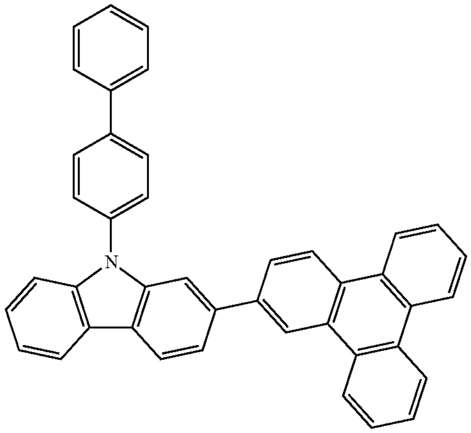
H-H76
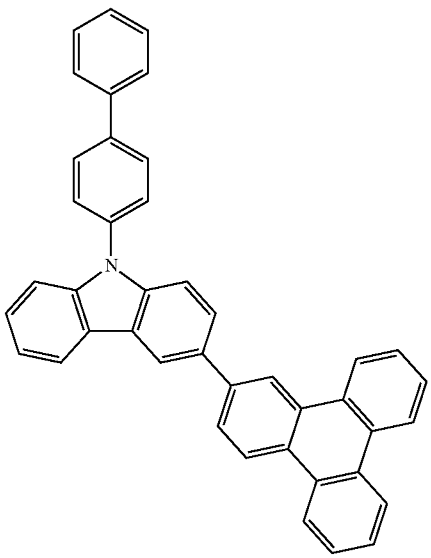
H-H77
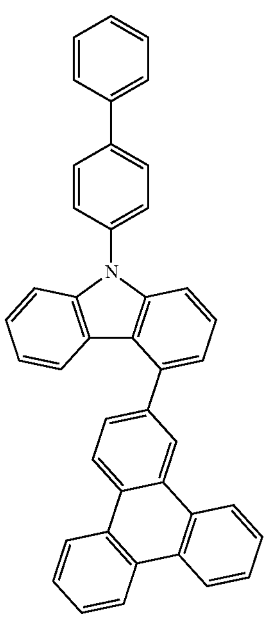
-continued
H-H78
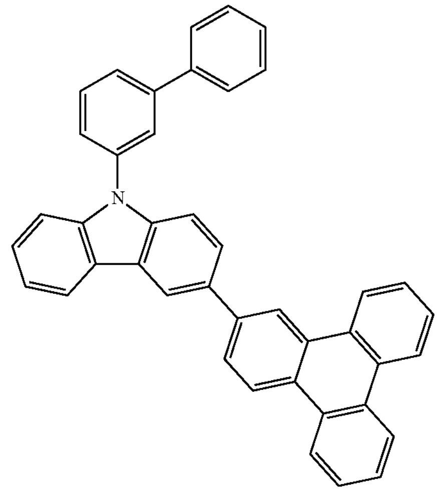
H-H79
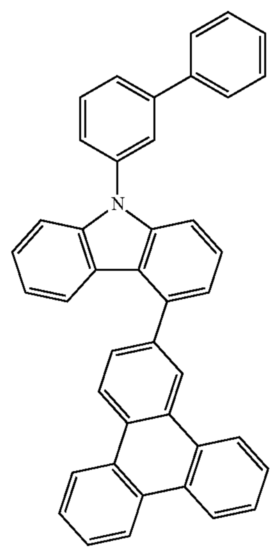
H-H80
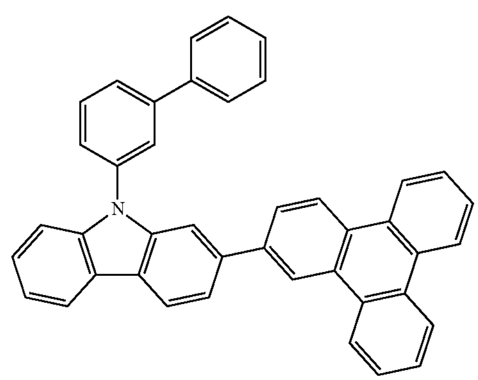

-continued
H-H81
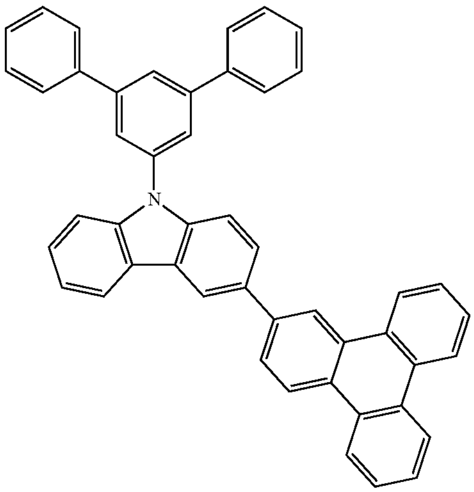
H-H82
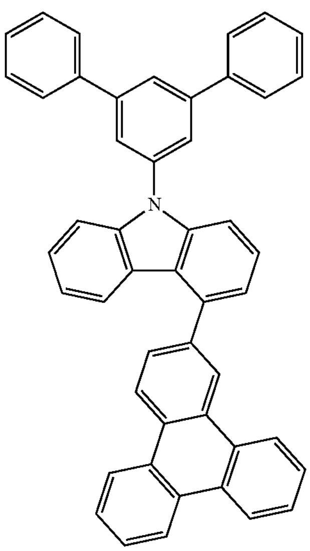
H-H83
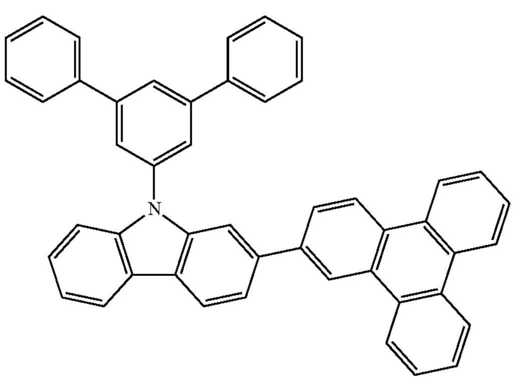
-continued
H-H84
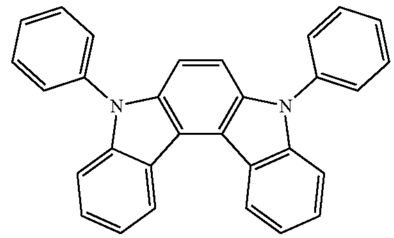
H-H85
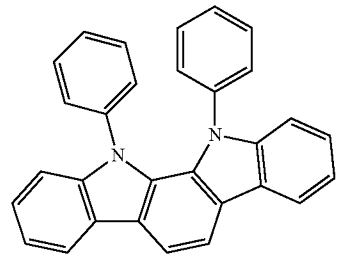
H-H86
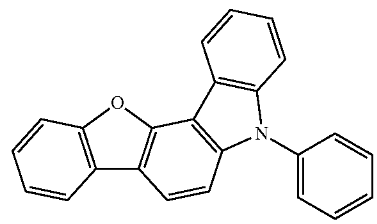
H-H87
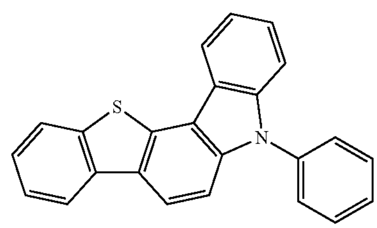
H-H88
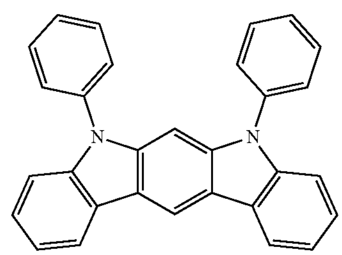
H-H89
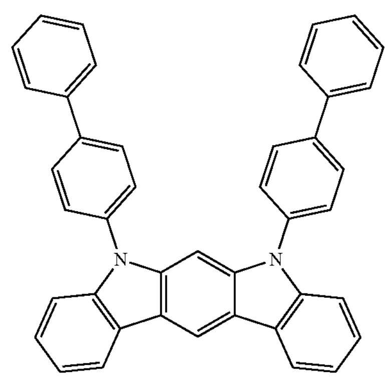

-continued
H-H90
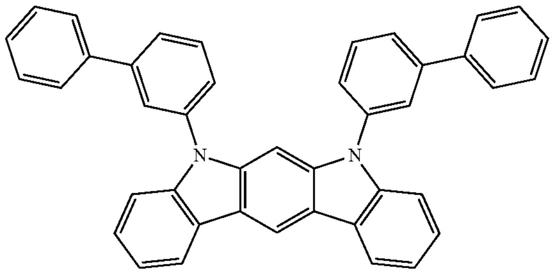
H-H91
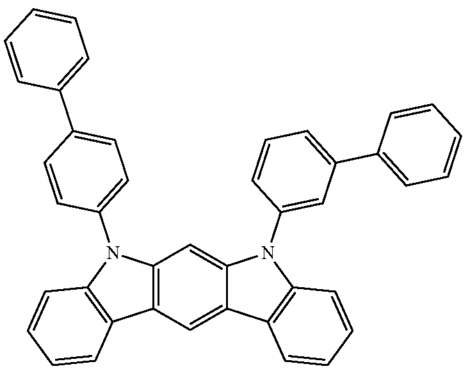
H-H92
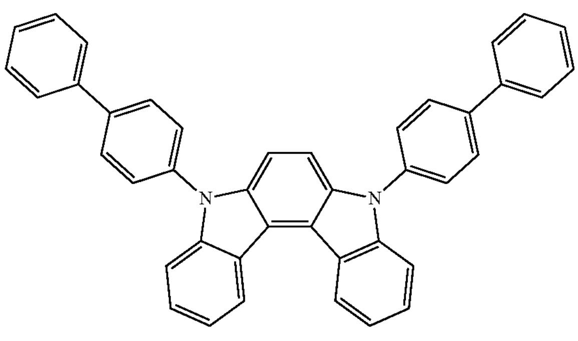
H-H93
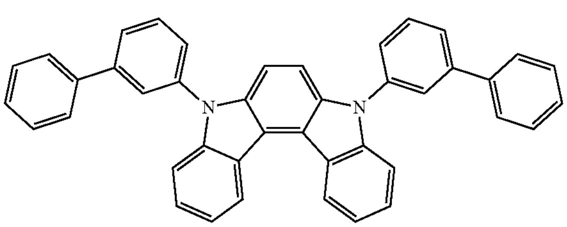
-continued
H-H94
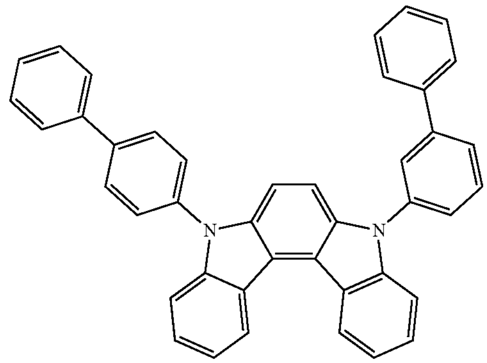
H-H95
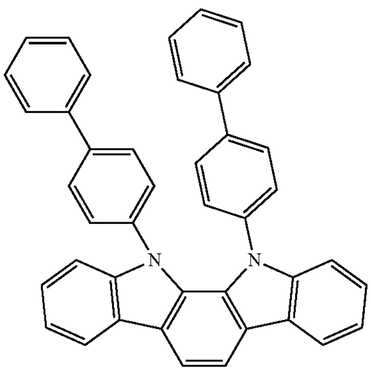
H-H96
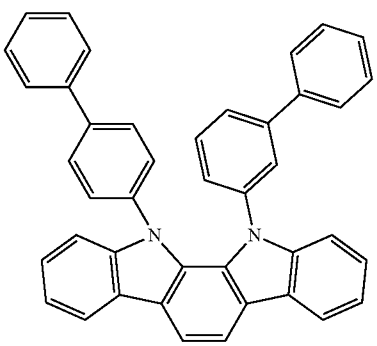
H-H97
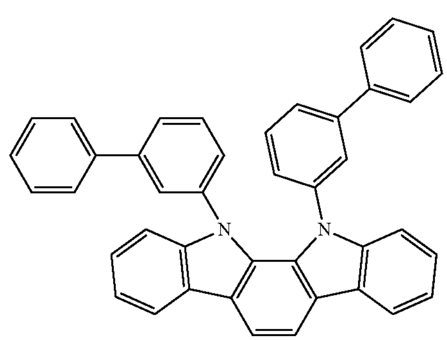

-continued
H-H98
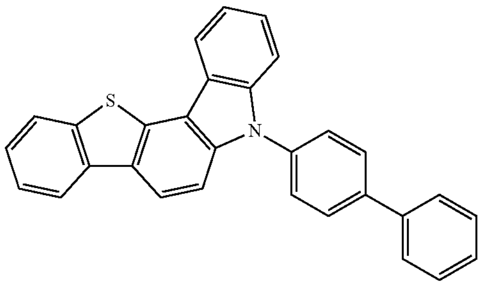
H-H99
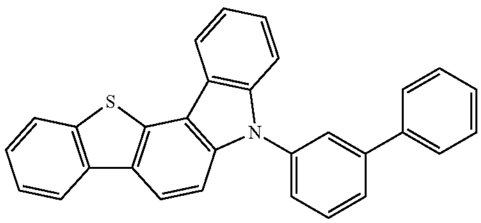
H-H100
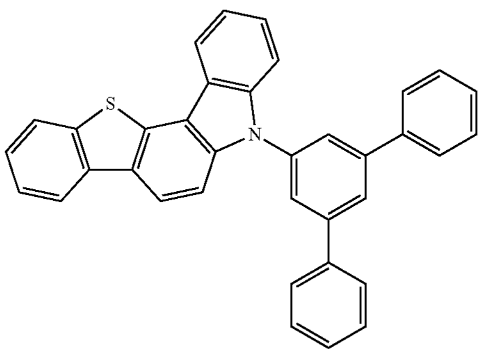
H-H101
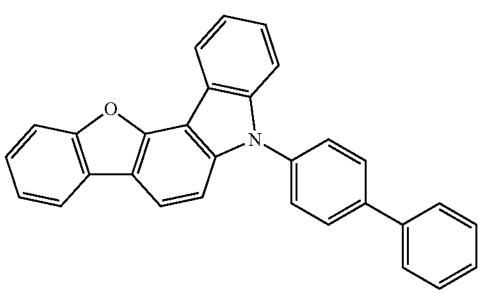
H-H102
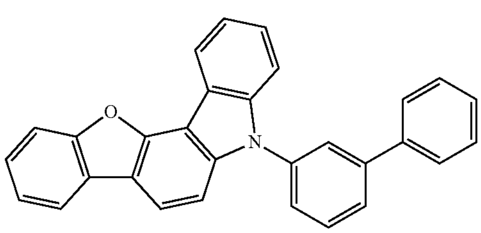
-continued
H-H103
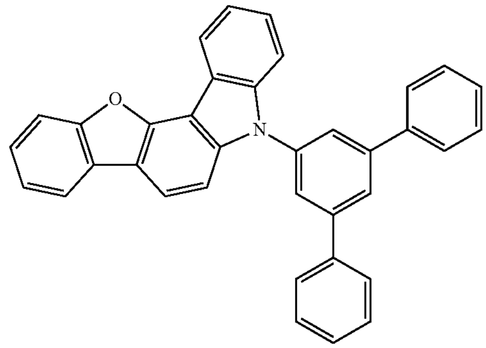
H-H104
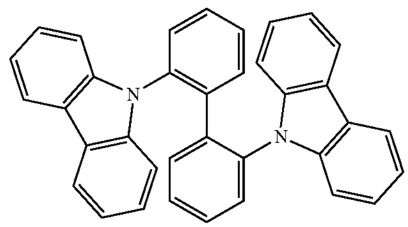
In an embodiment, the bipolar host may be the following Group HEH1, but embodiments of the present disclosure are not limited thereto:
Group HEH1
1
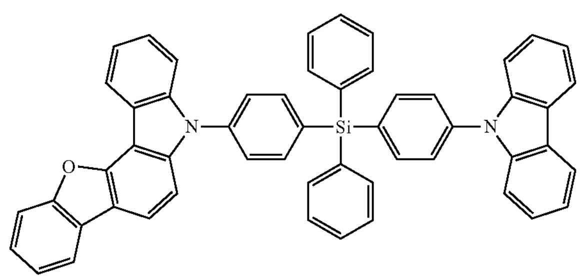
2
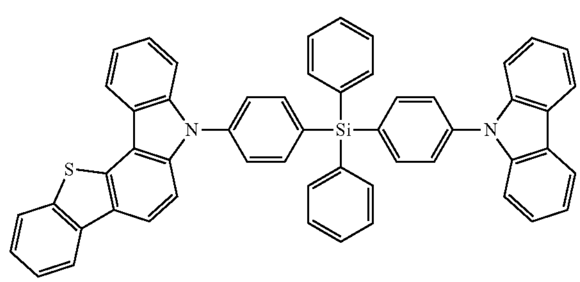

-continued
3
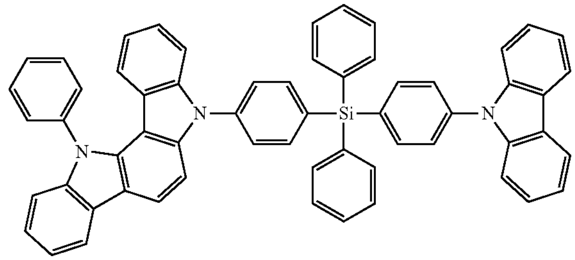
4
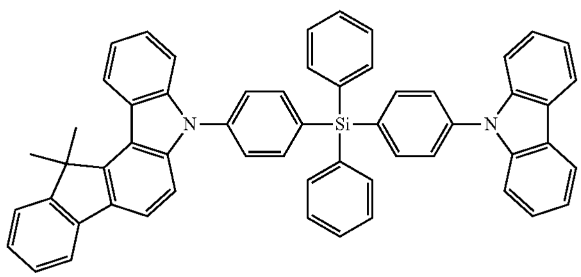
5
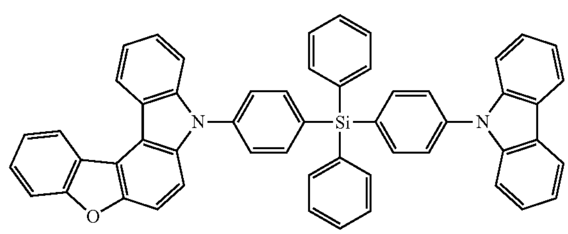
6
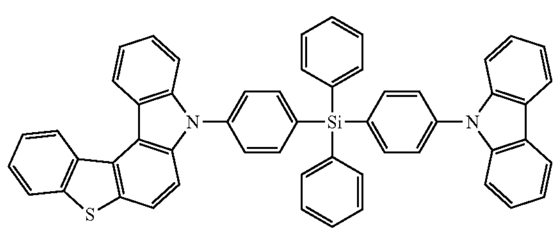
7
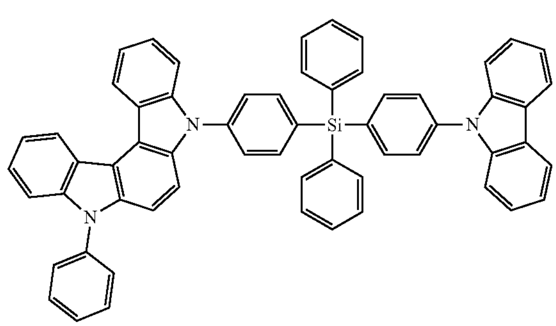
-continued
8
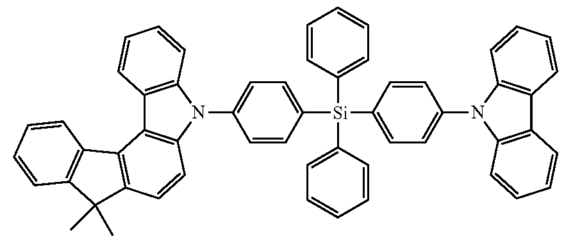
9
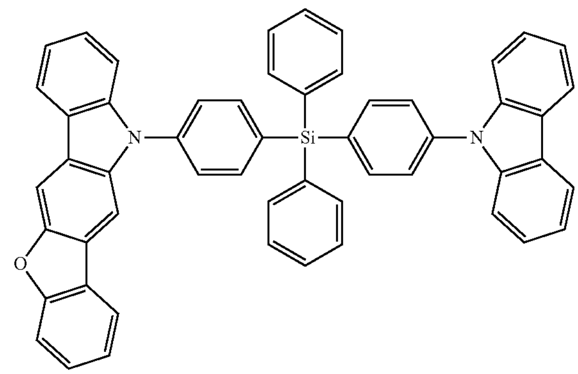
10
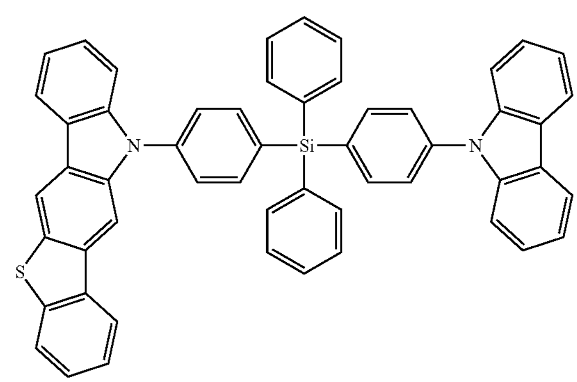
11
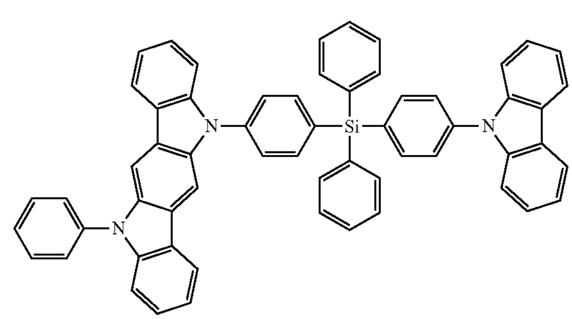

-continued
12
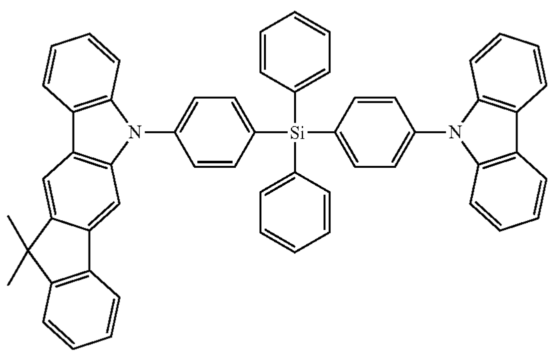
13
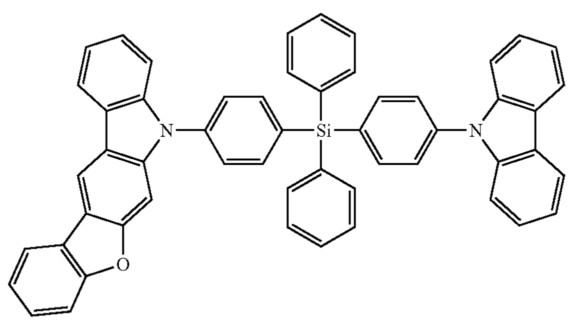
14
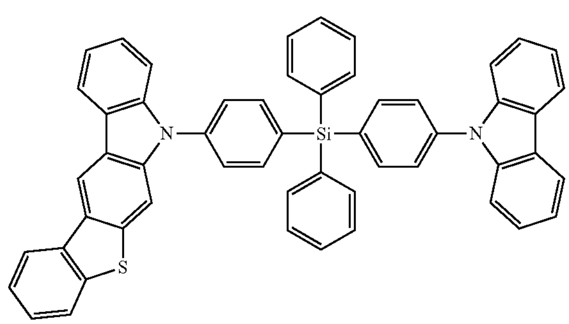
15
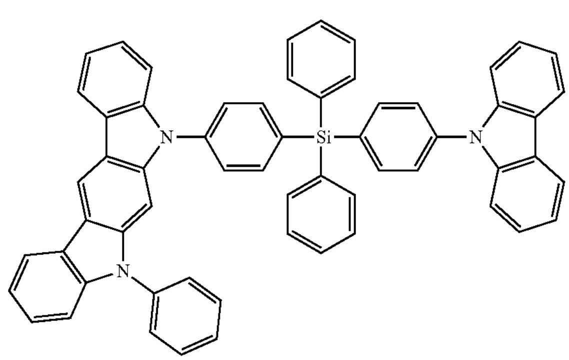
-continued
16
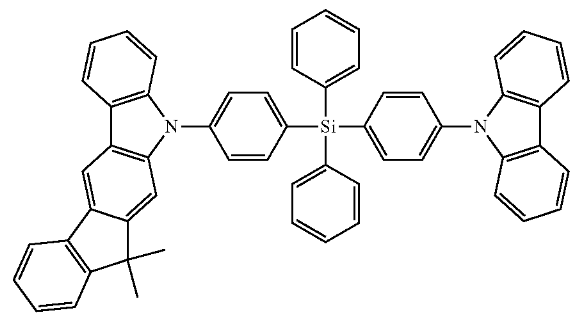
17
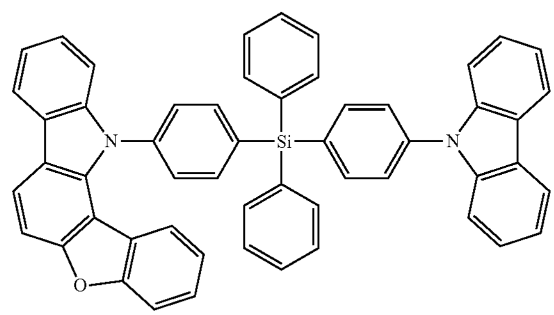
18
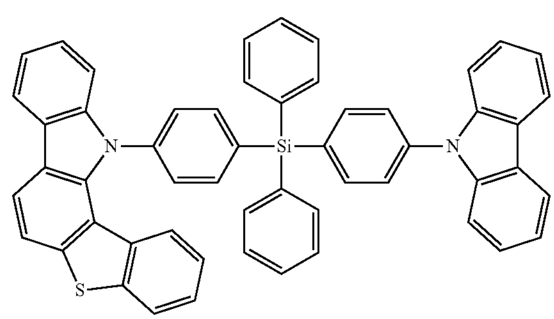
19
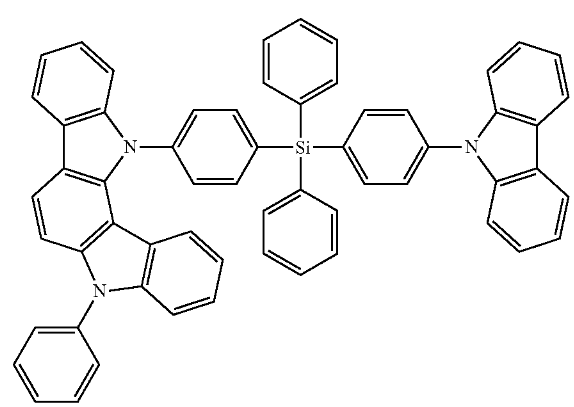

20
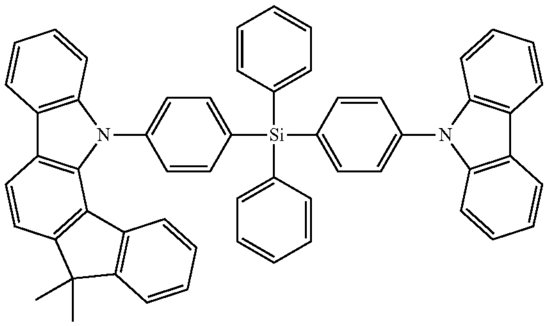
21
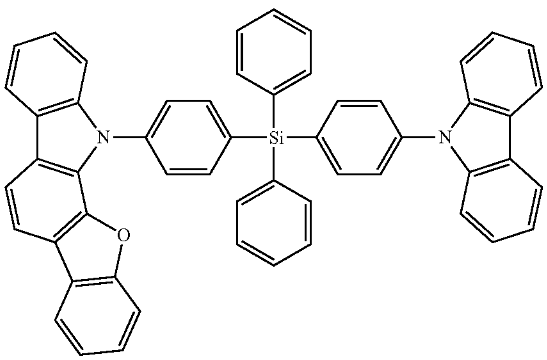
22
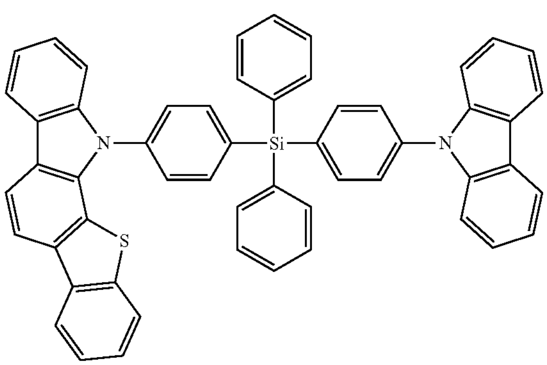
23
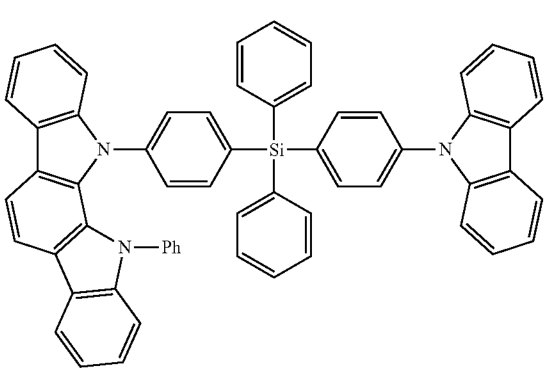
24
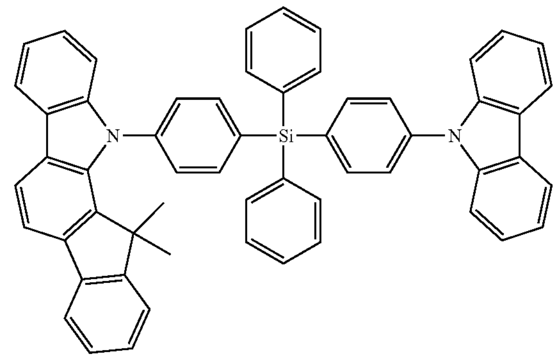
25
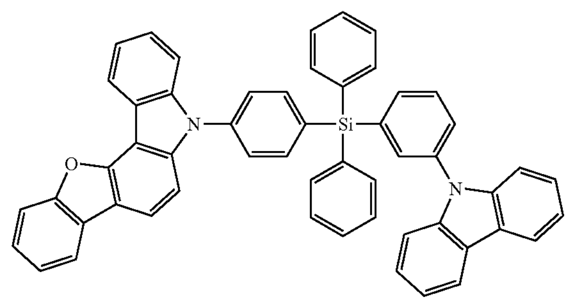
26
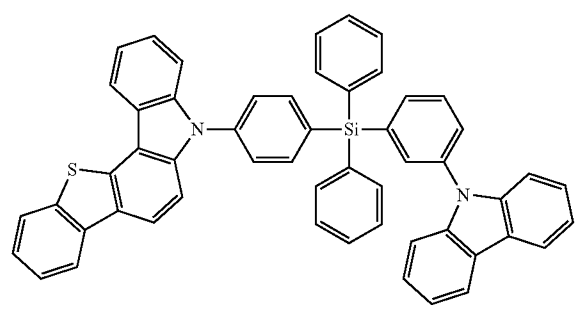
27
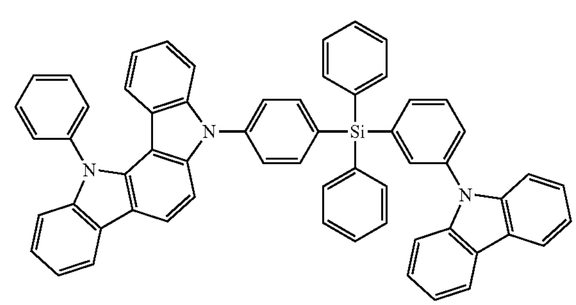

28
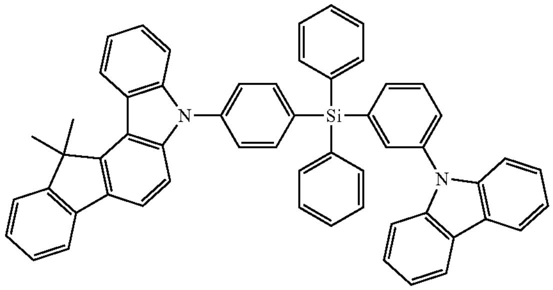
29
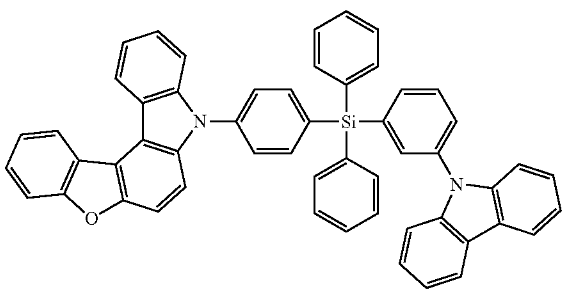
30
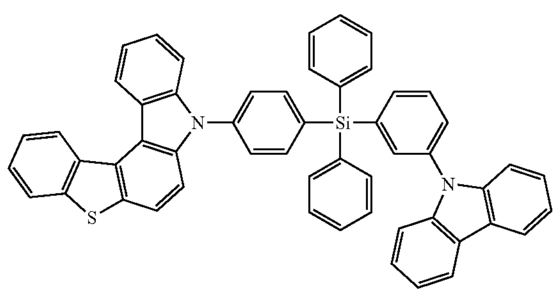
31
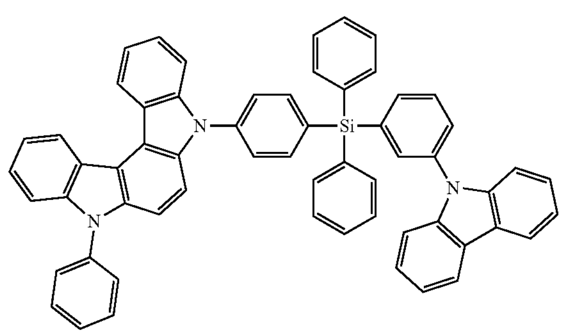
32
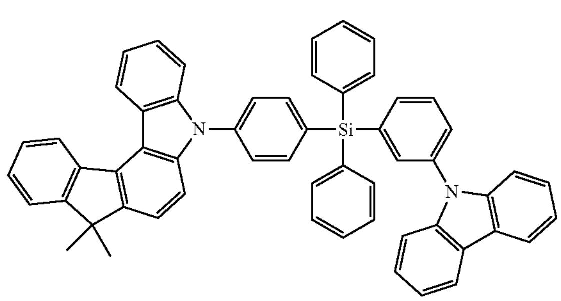
33
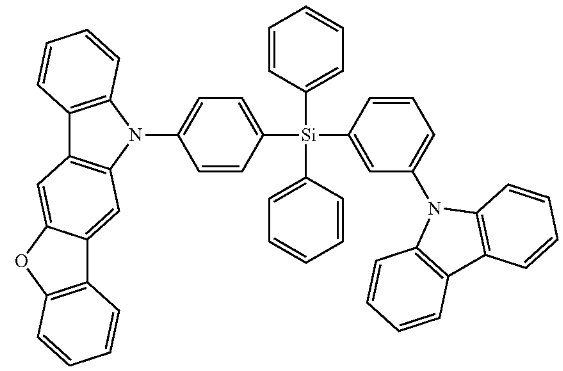
34
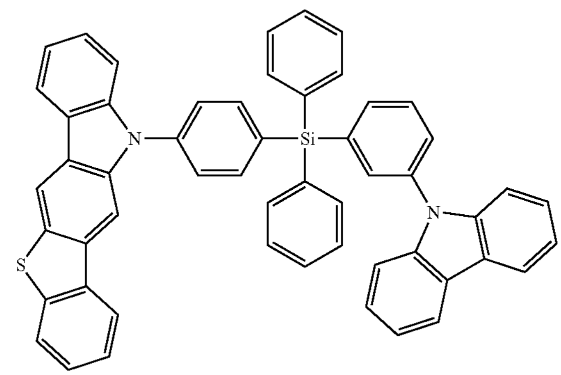
35
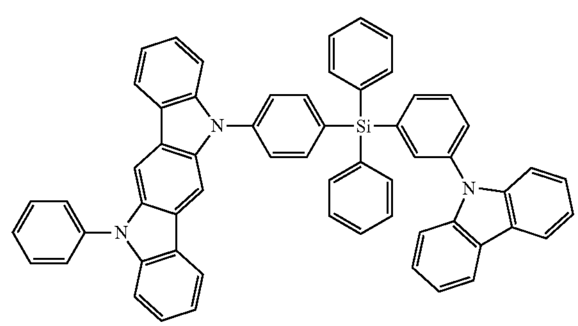
36
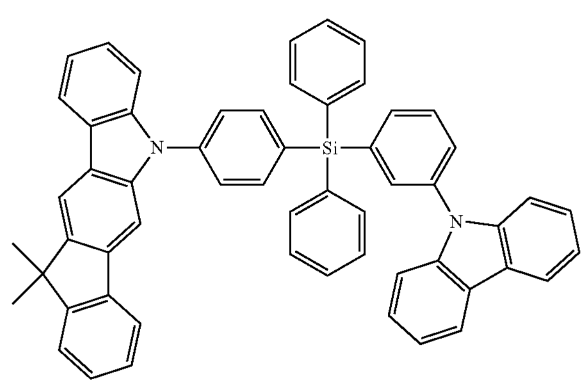

-continued
37
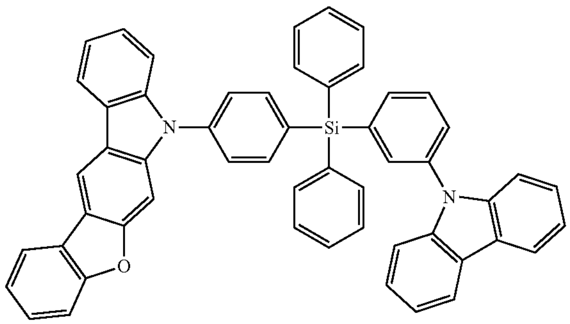
38
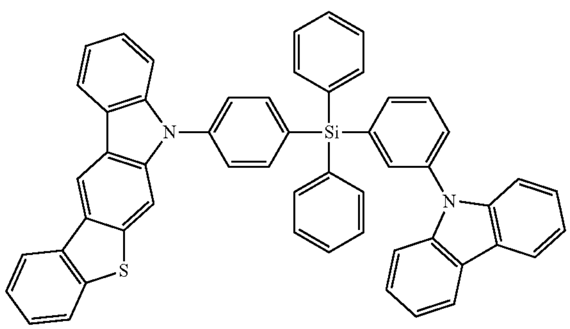
39
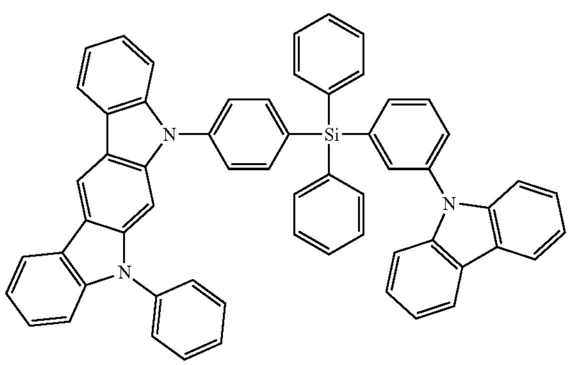
40
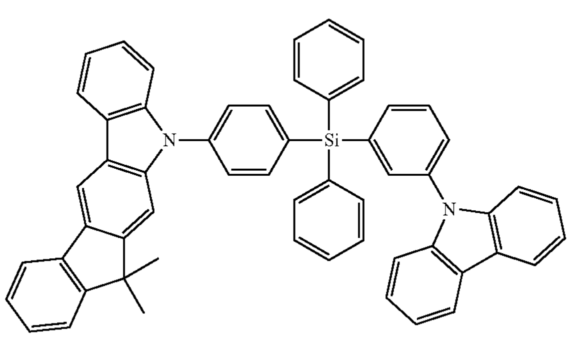
-continued
41
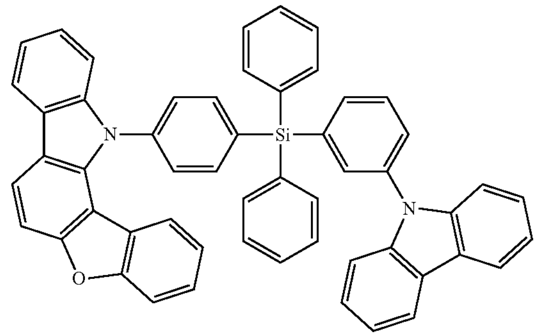
42
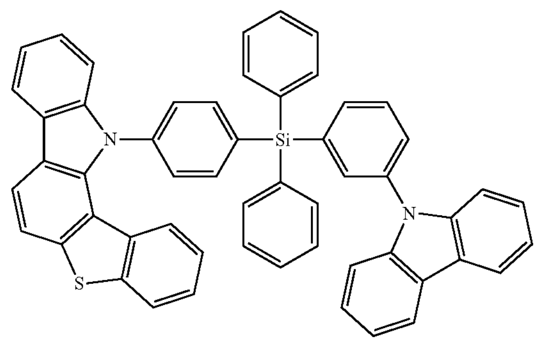
43
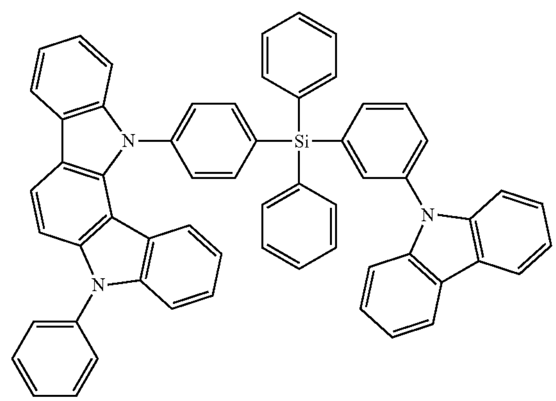
44
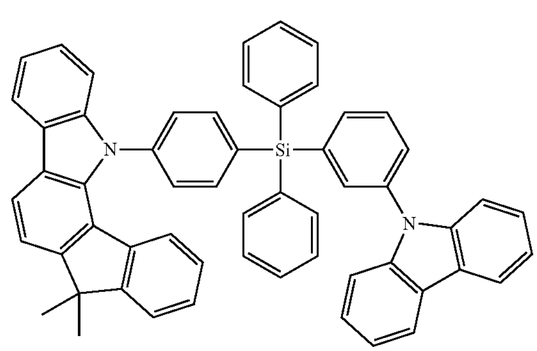

45
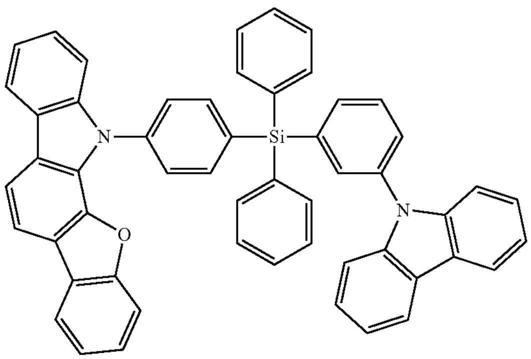
46
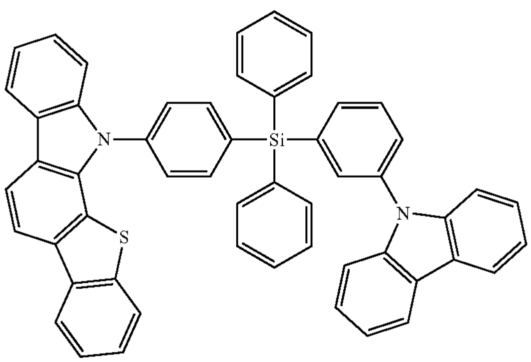
47
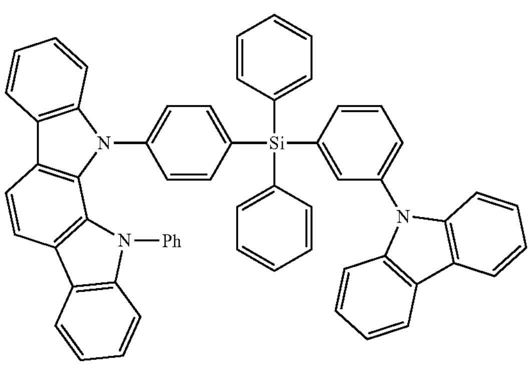
48
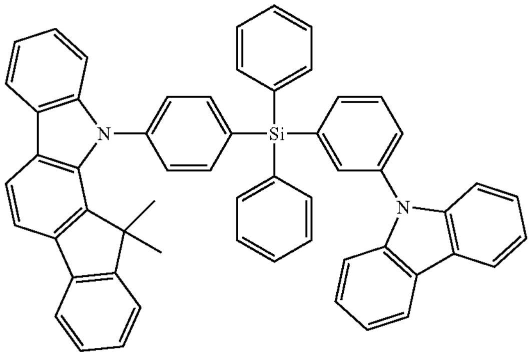
49
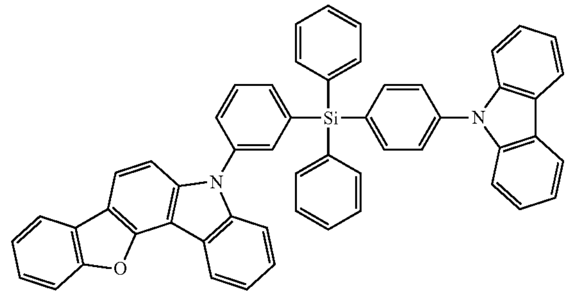
50
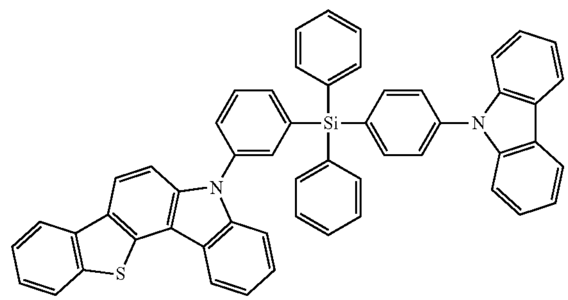
51
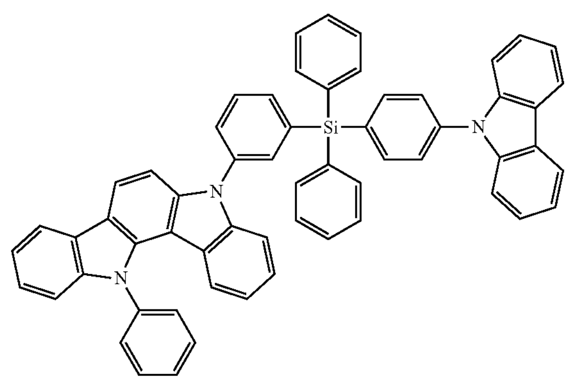
52
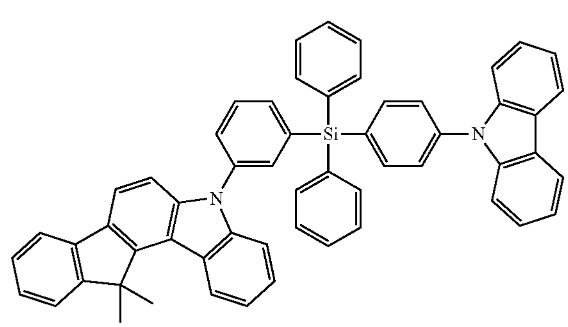

53
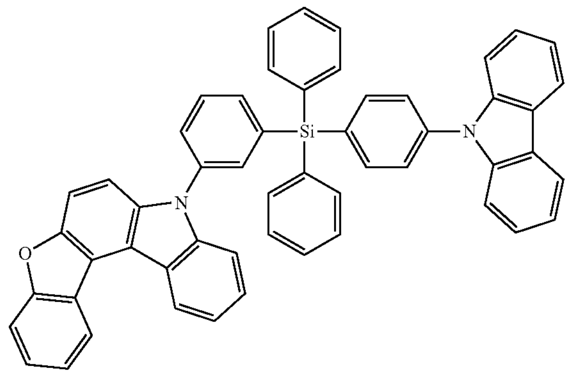
54
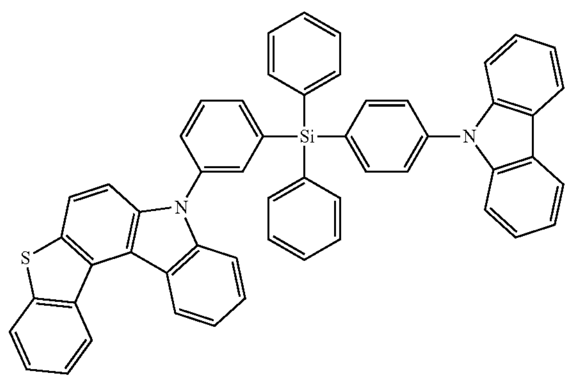
55
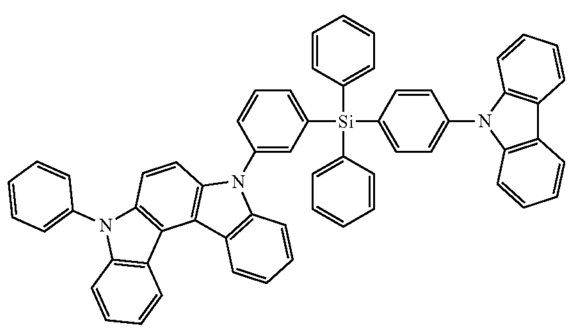
56
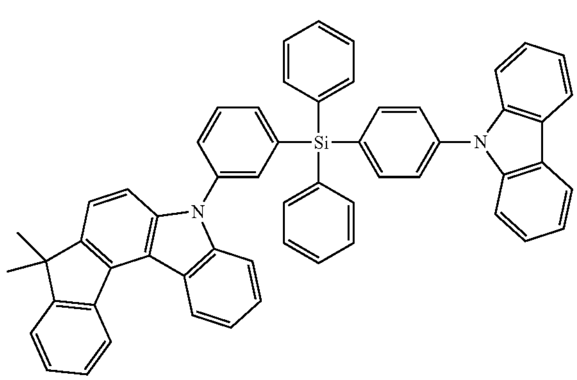
57
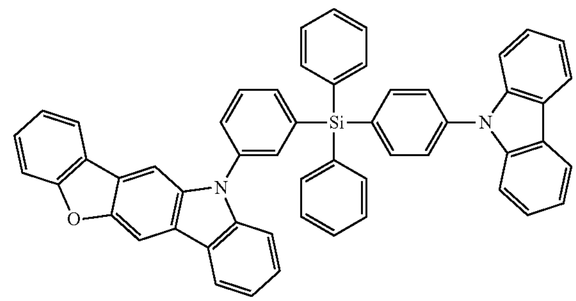
58
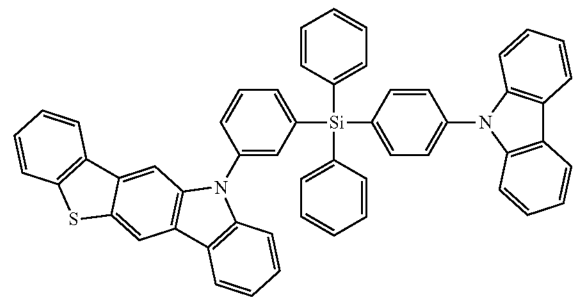
59
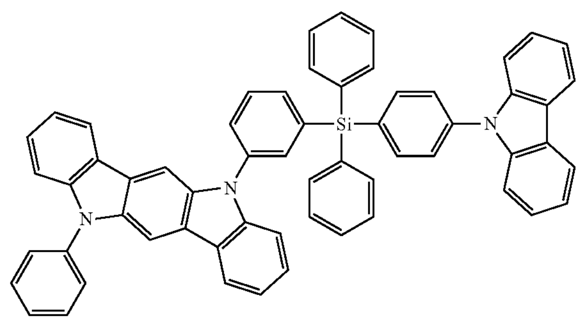
60
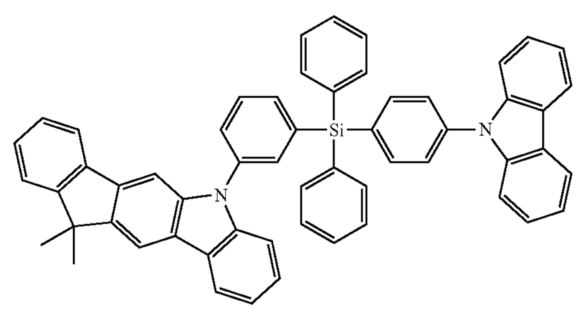
61
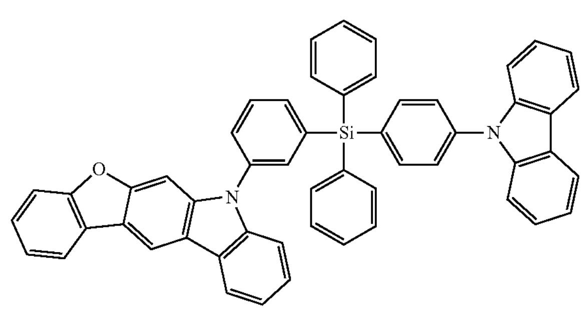

-continued
62
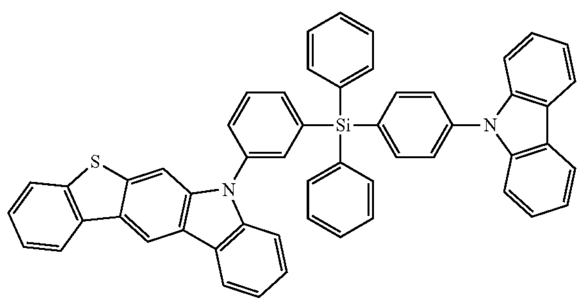
63
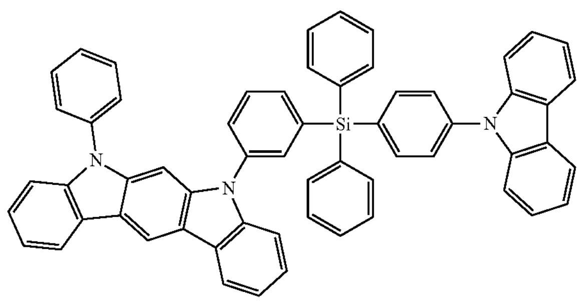
64
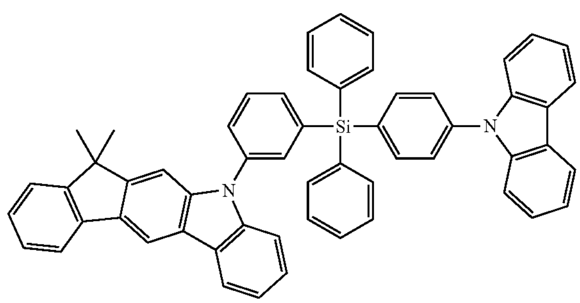
65
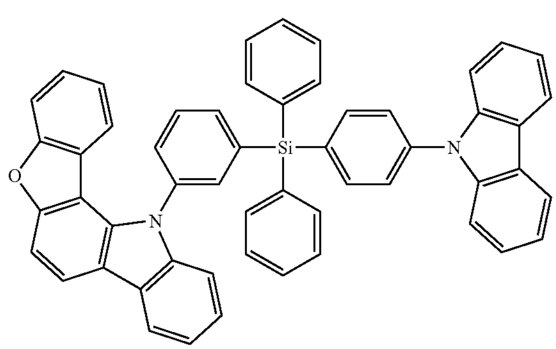
-continued
66
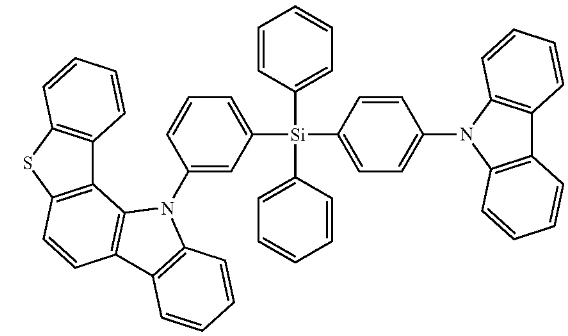
67
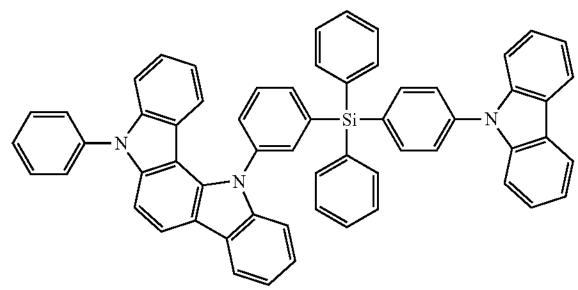
68
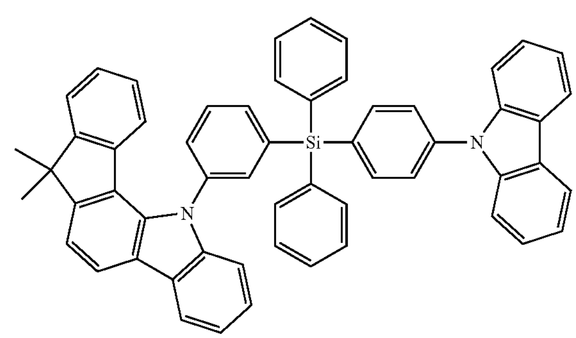
69
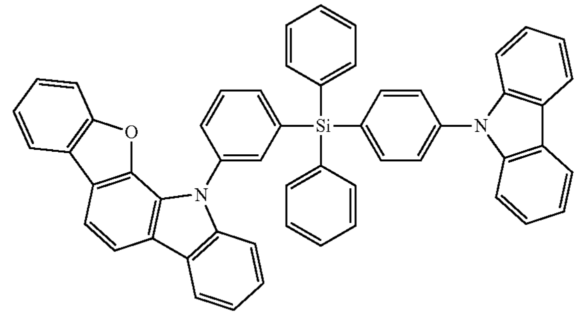

-continued
70
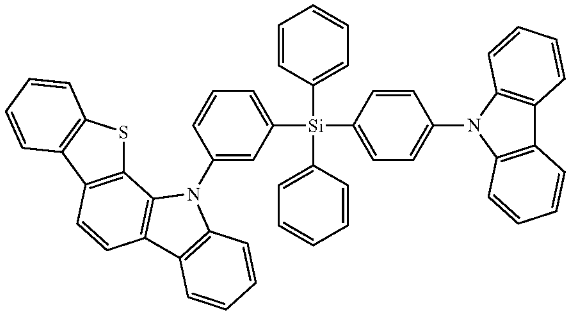
71
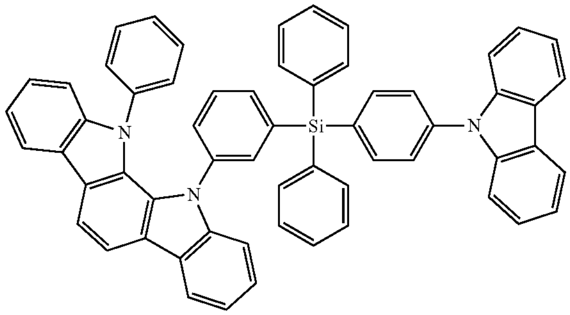
72
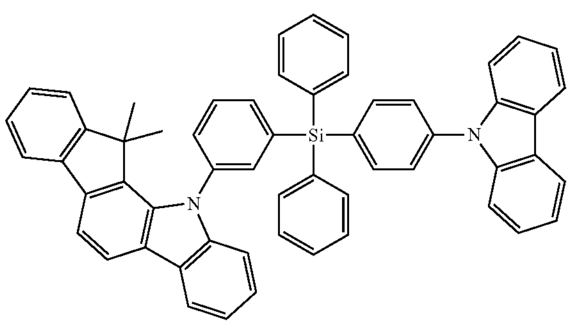
73
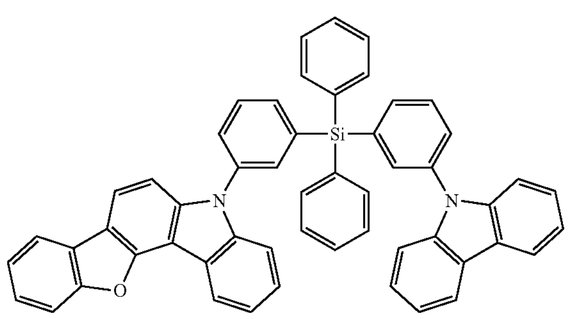
-continued
74
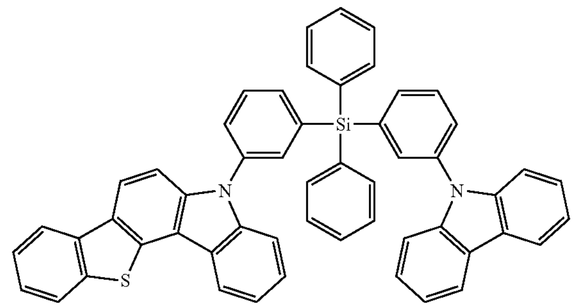
75
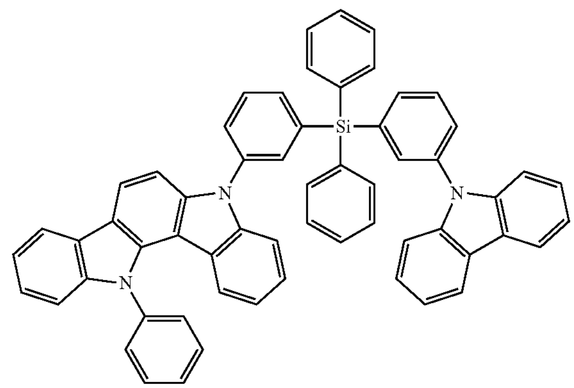
76
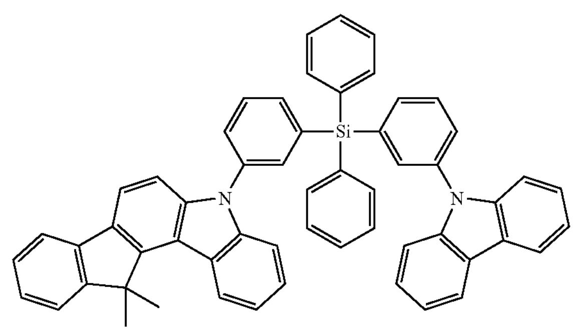
77
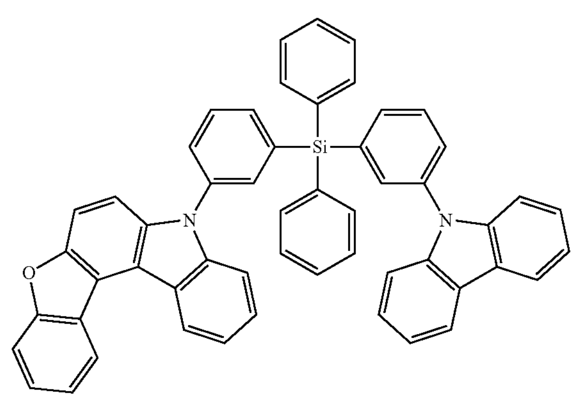

-continued
78
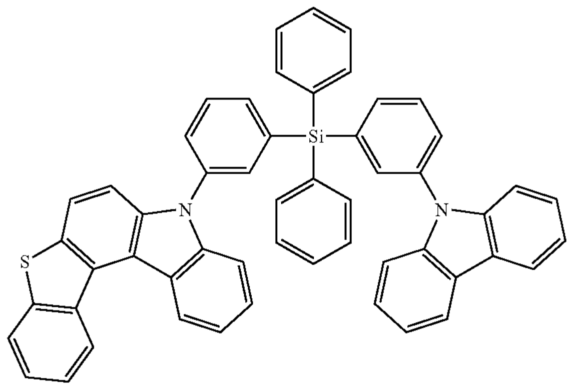
79
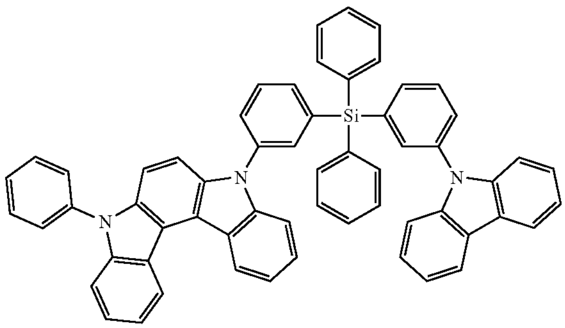
80
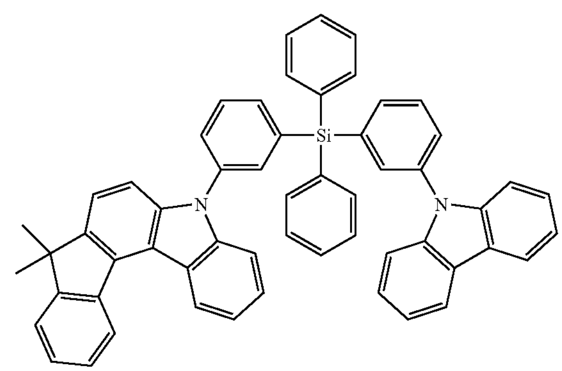
81
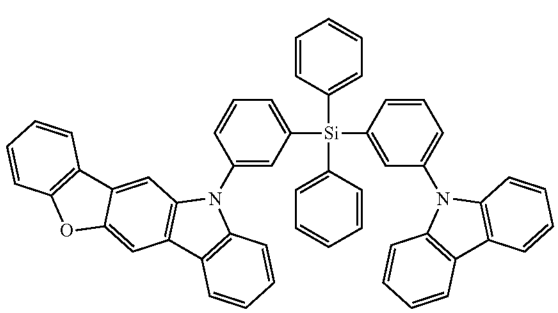
-continued
82
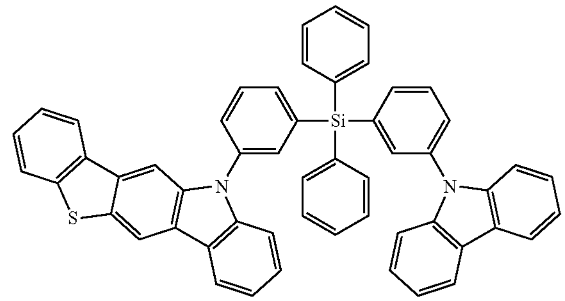
83
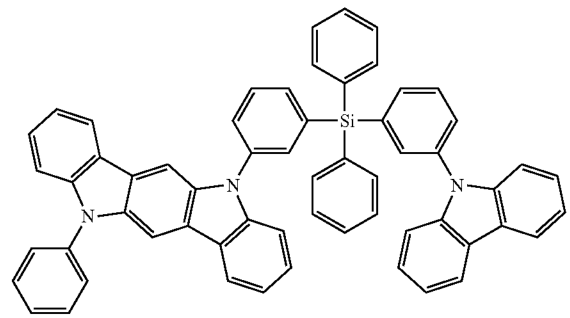
84
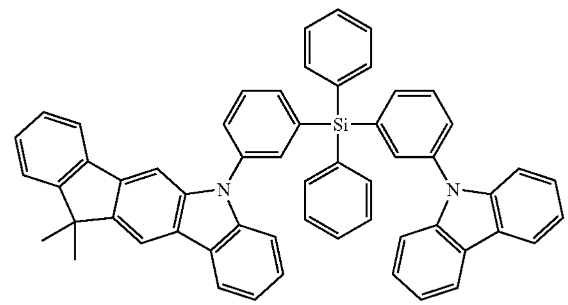
85
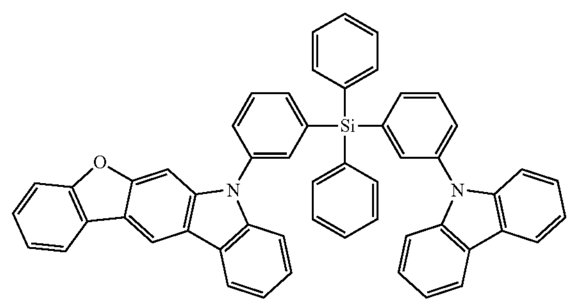
86
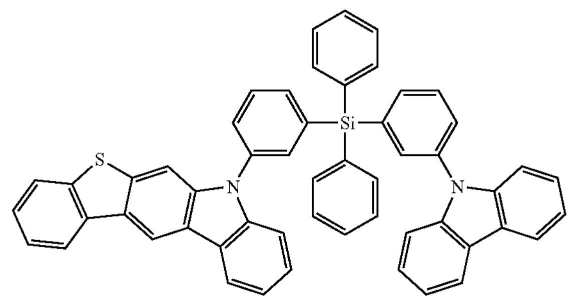

-continued
87
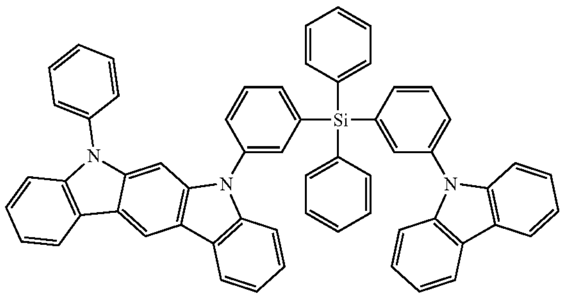
88
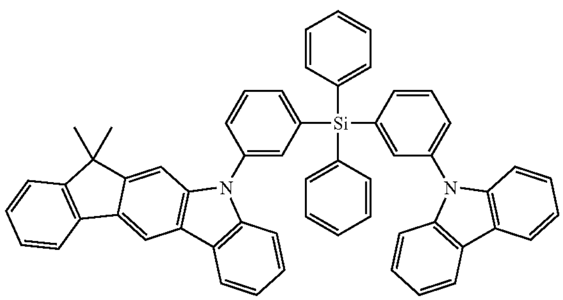
89
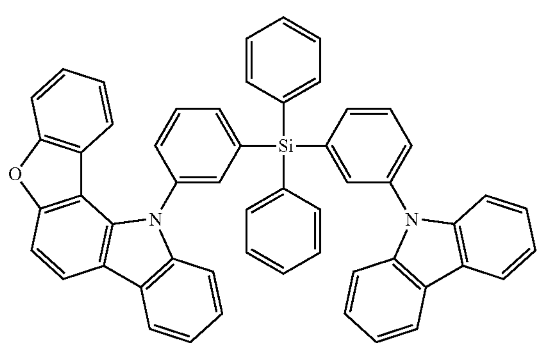
90
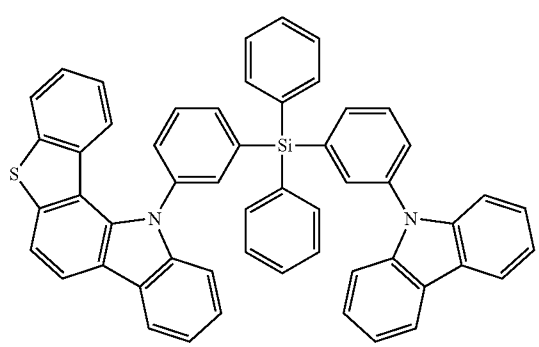
-continued
91
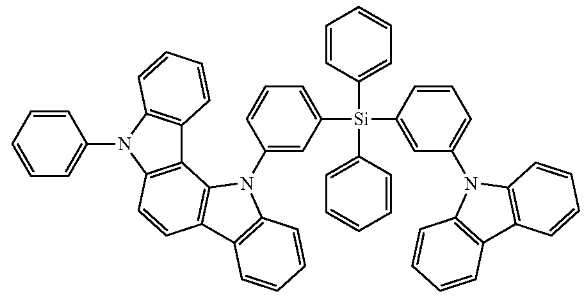
92
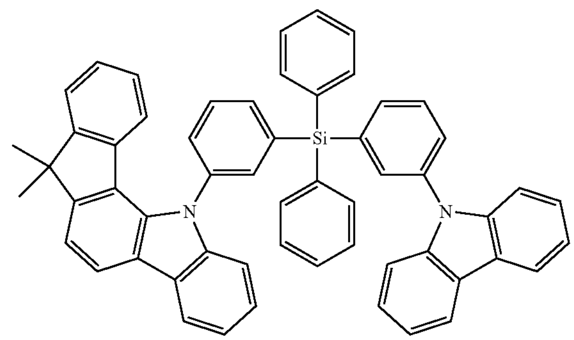
93
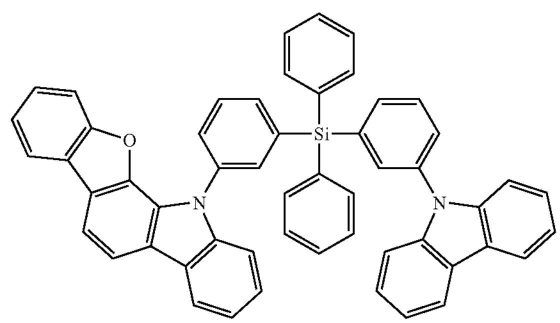
94
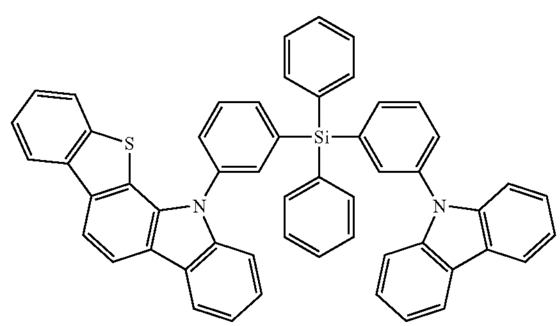

-continued
95
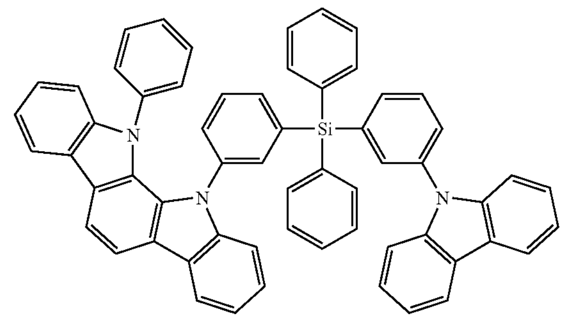
96
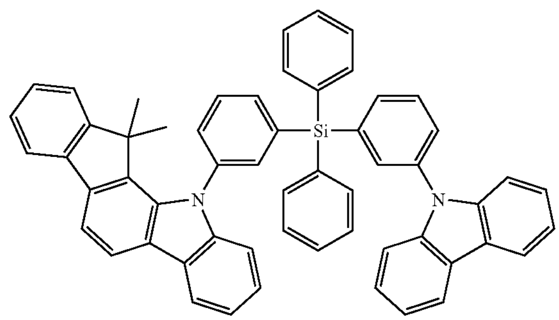
97
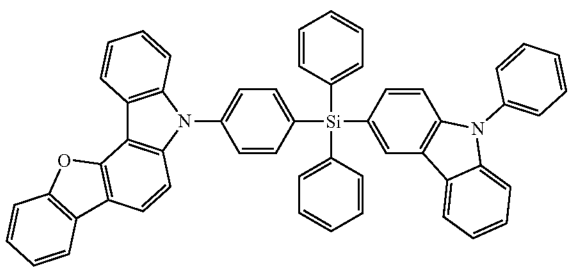
98
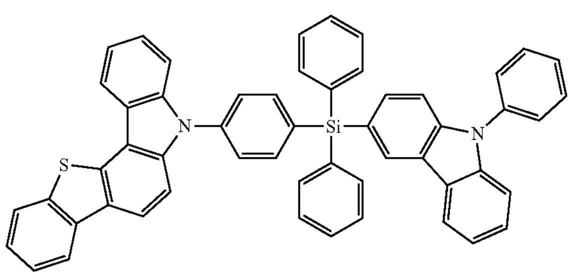
99
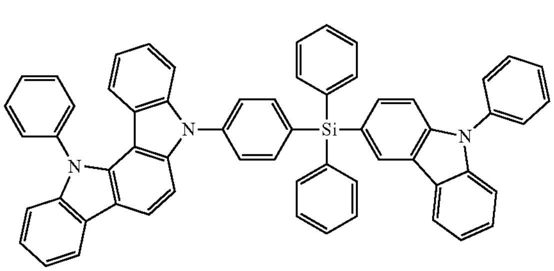
-continued
100
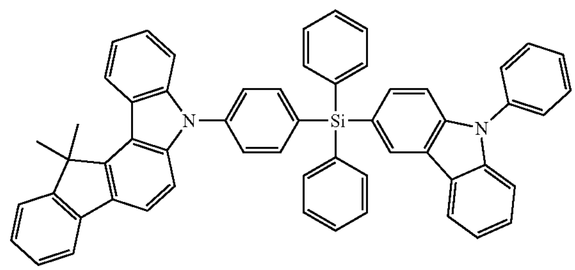
101
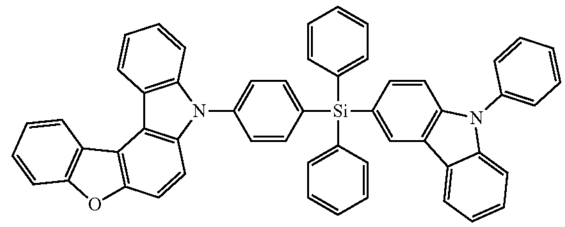
102
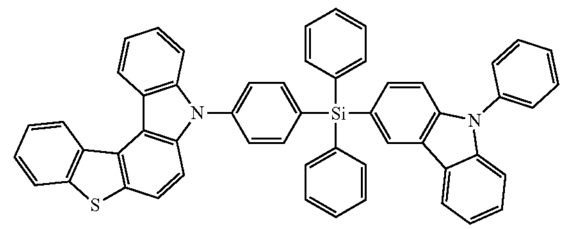
103
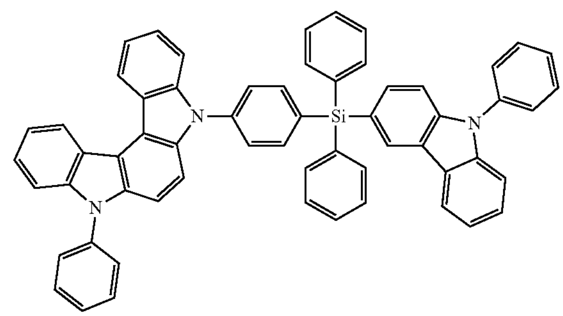
104
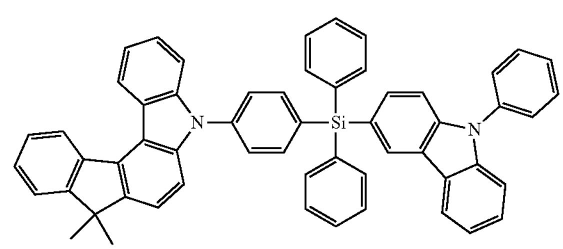

-continued
105
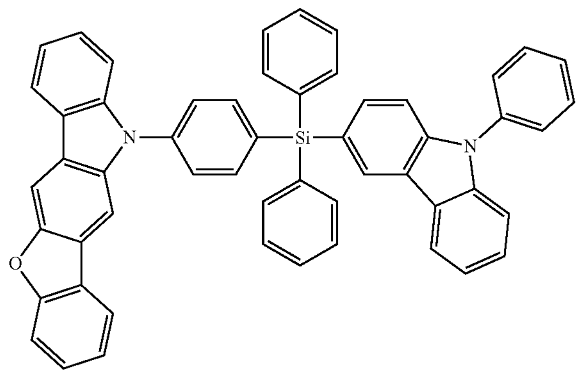
106
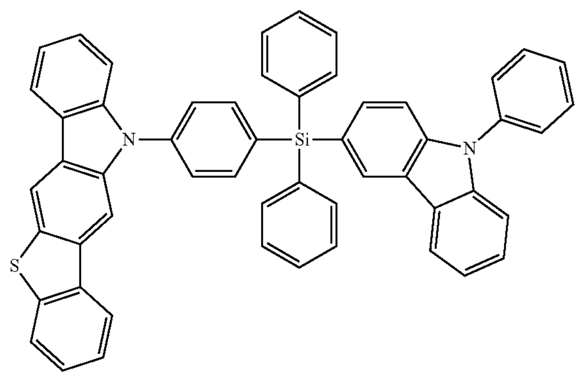
107
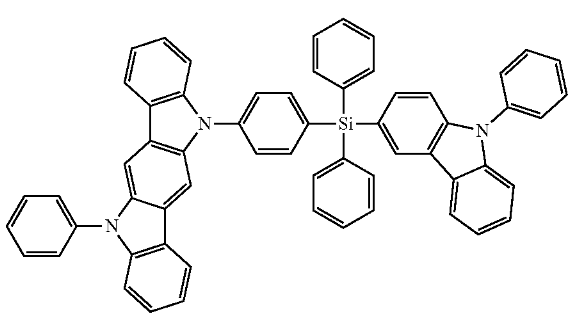
108
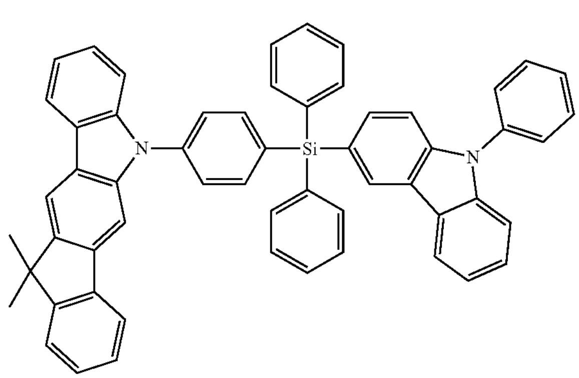
-continued
109
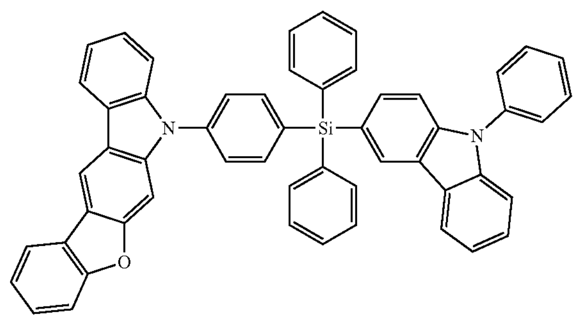
110
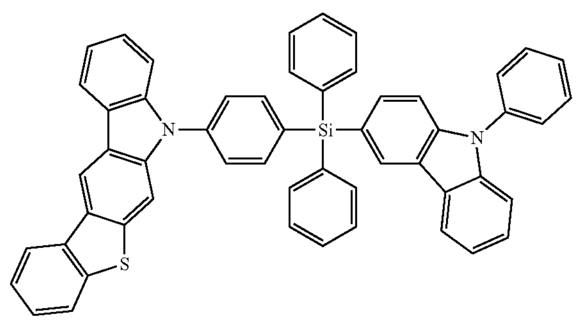
111
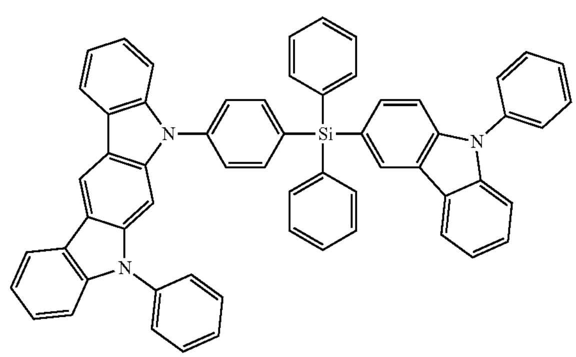
112
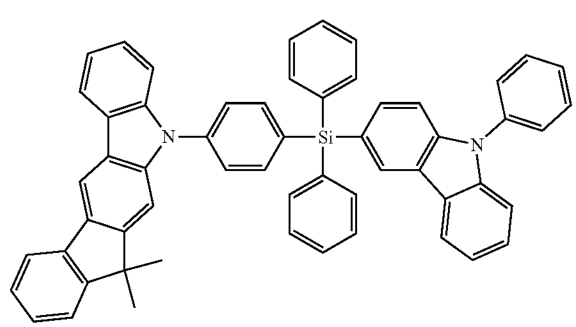

113
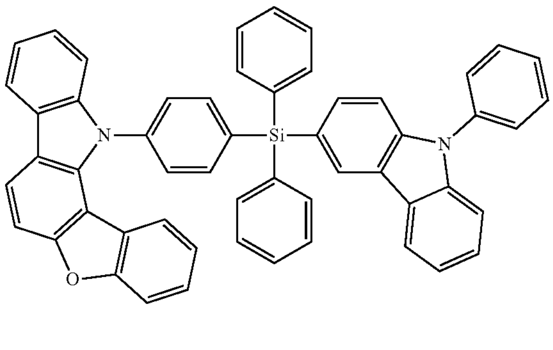
114
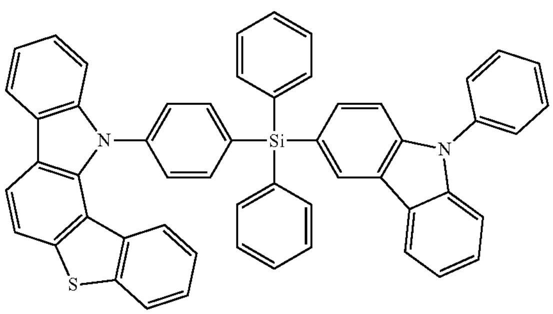
115
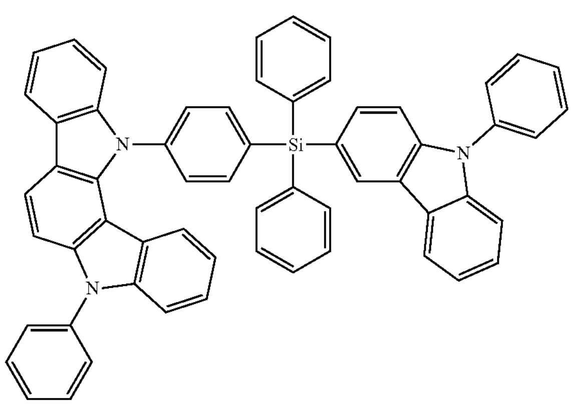
116
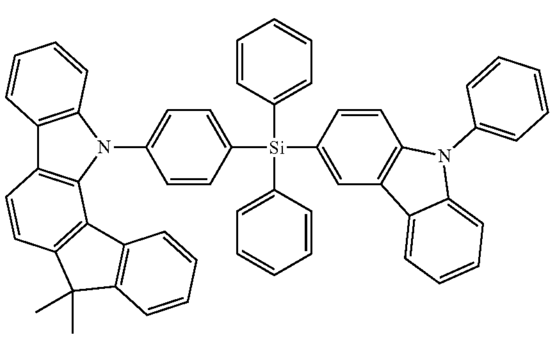
117
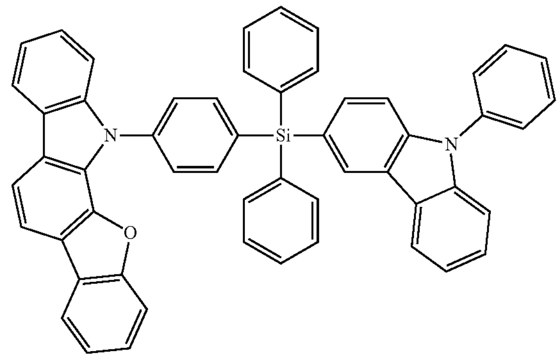
118
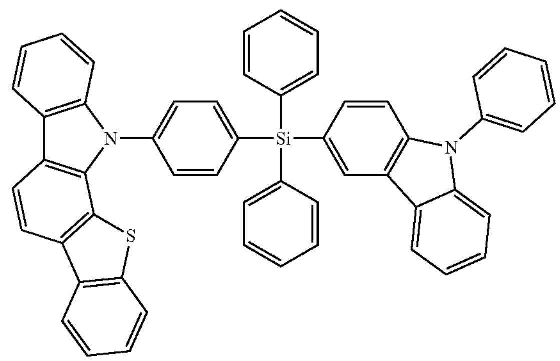
119
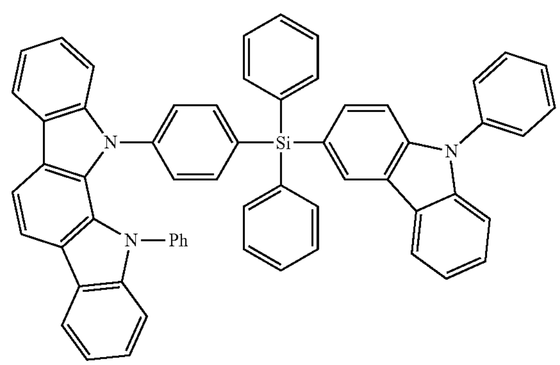
120
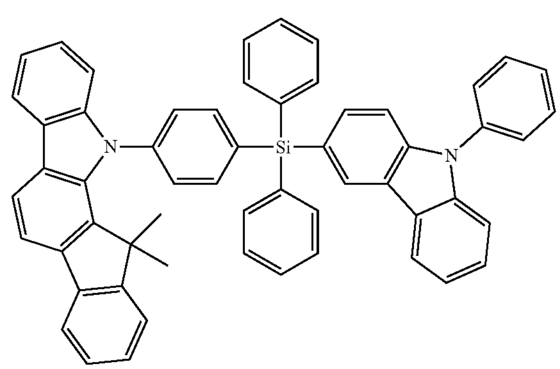

-continued
121
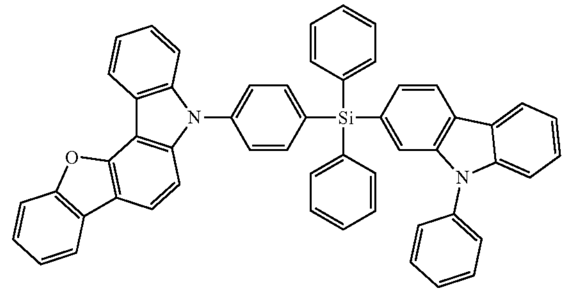
122
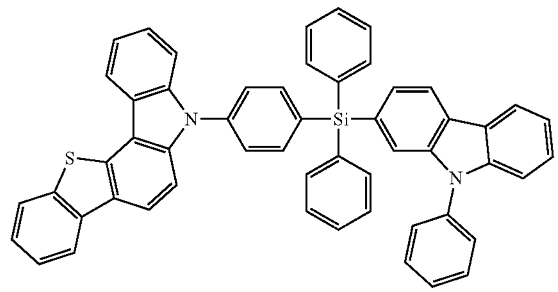
123
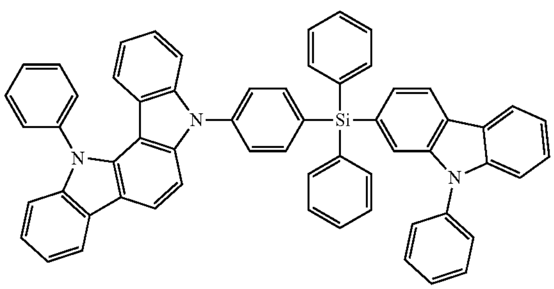
124
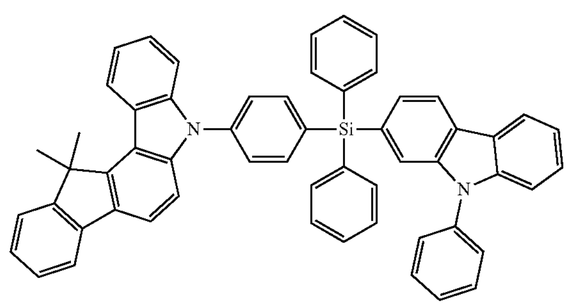
125
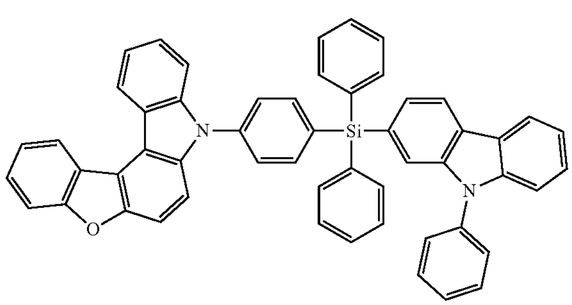
-continued
126
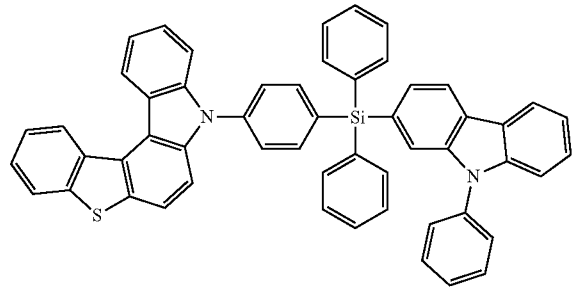
127
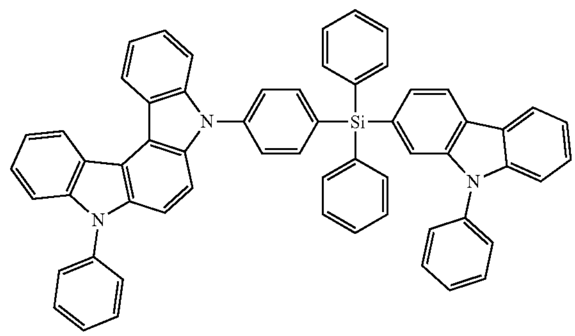
128
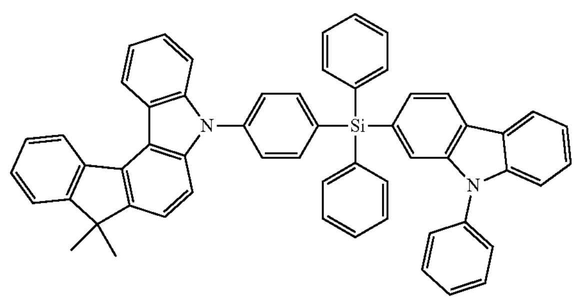
129
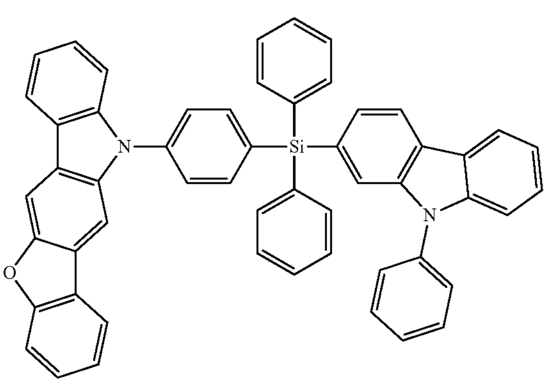

130
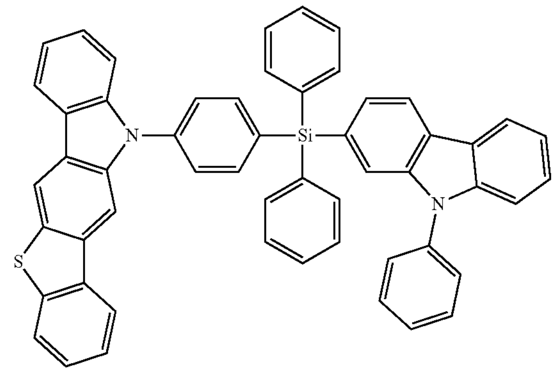
131
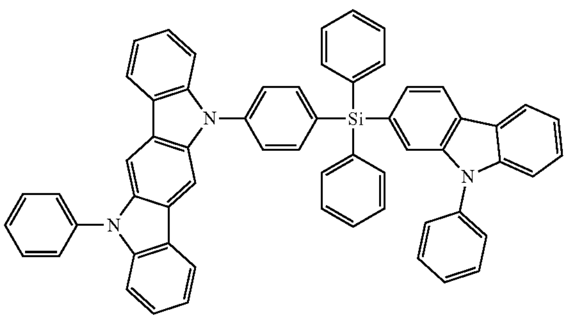
132
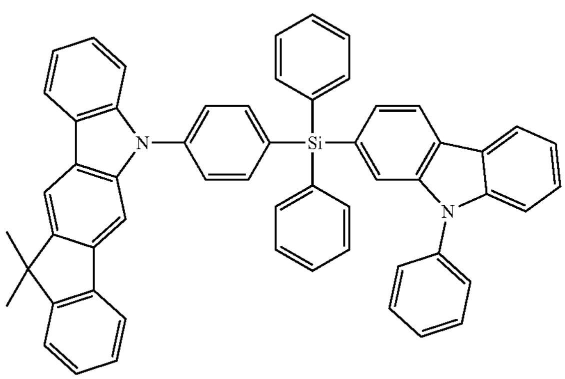
133
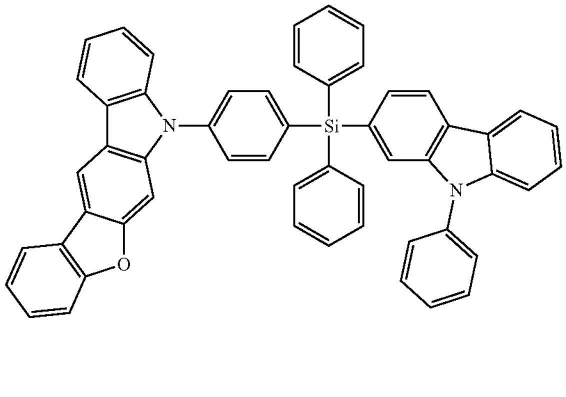
134
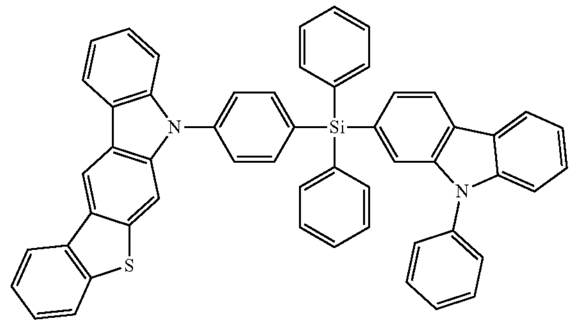
135
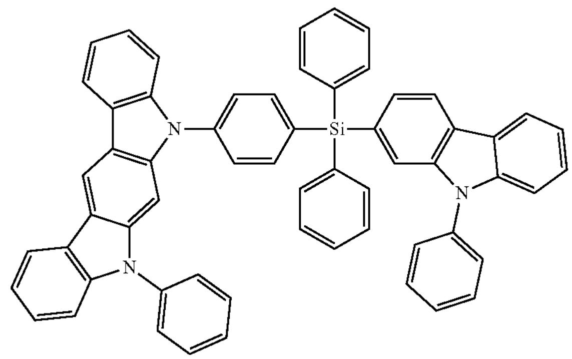
136
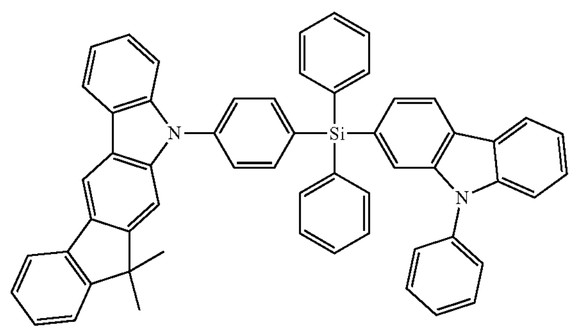
137
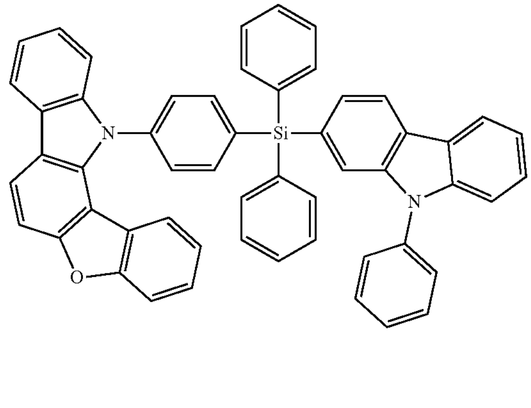

138
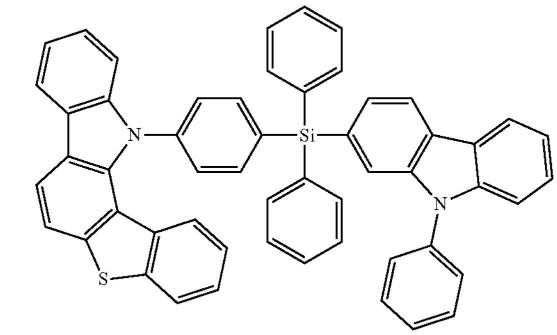
139
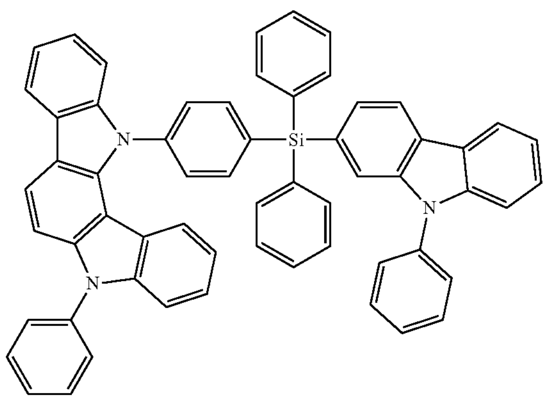
140
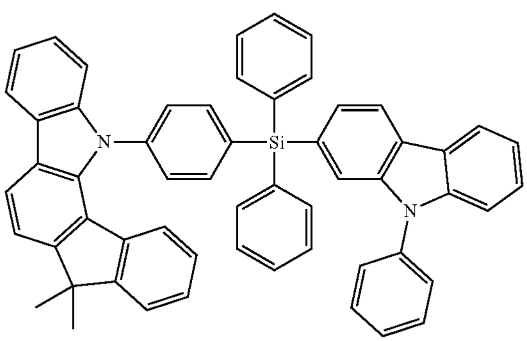
141
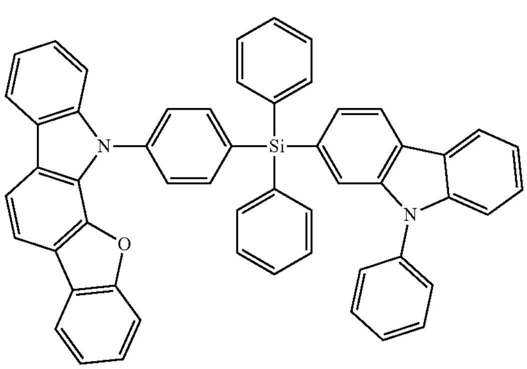
142
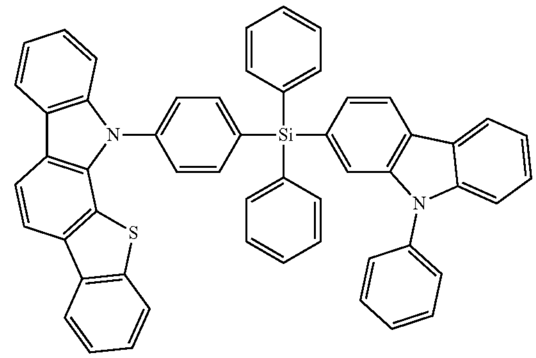
143
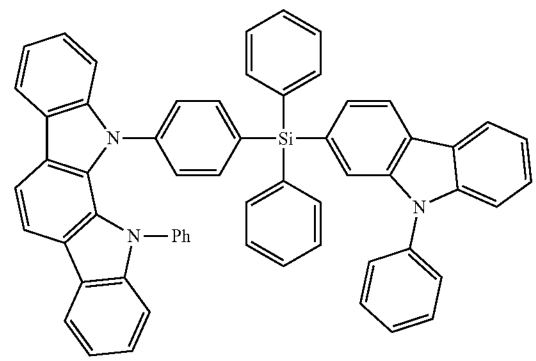
144
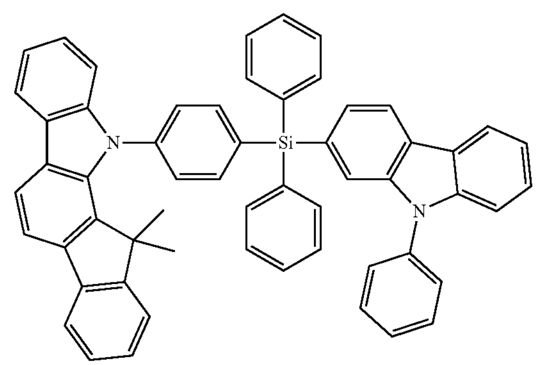
145
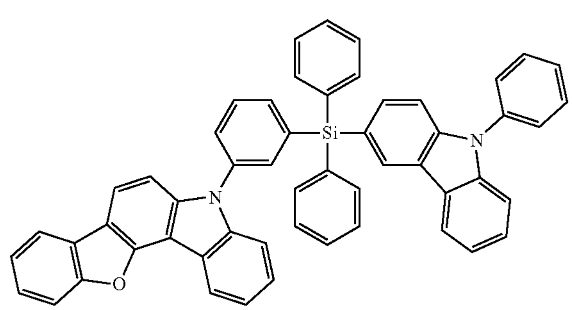

-continued
146
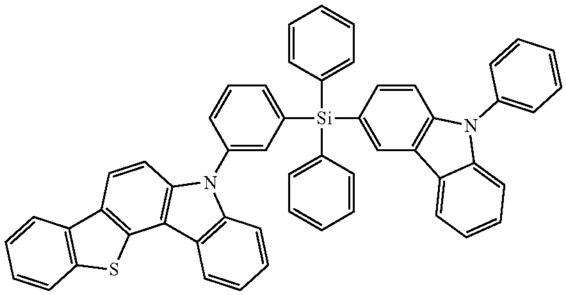
147
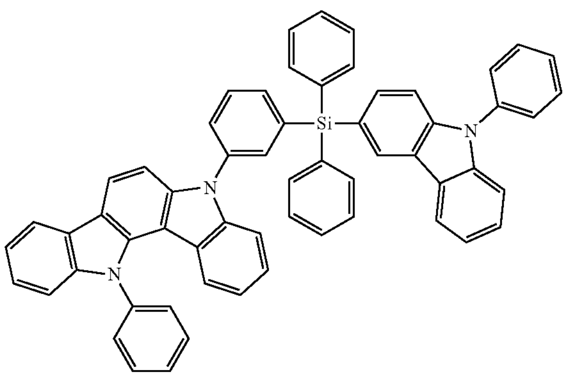
148
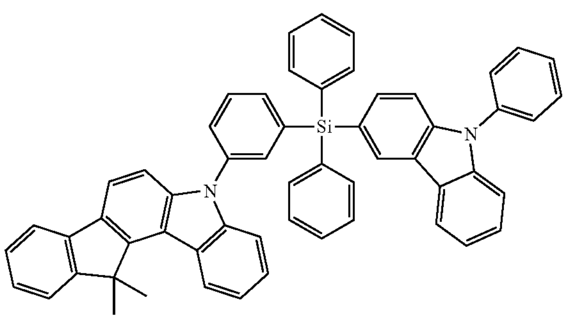
149
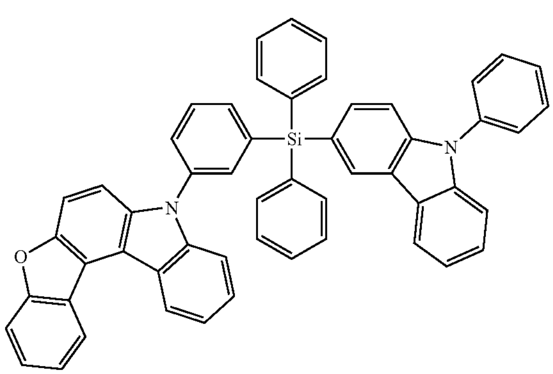
-continued
150
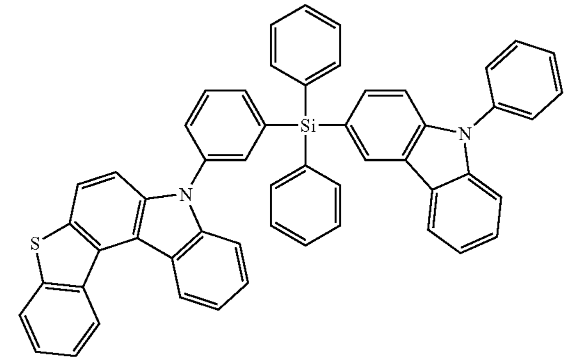
151
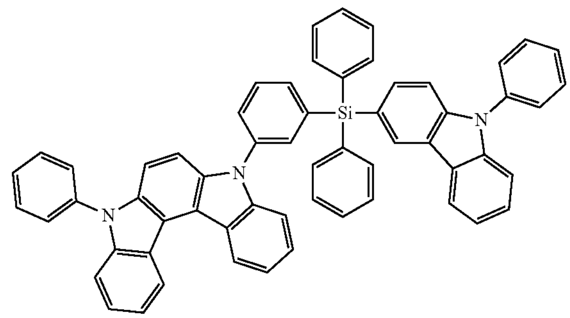
152
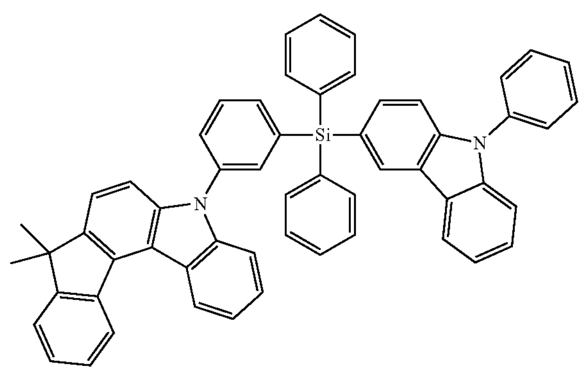
153
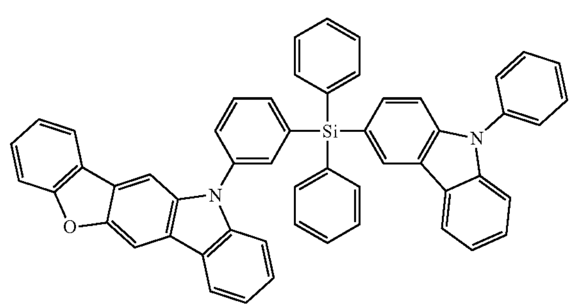

-continued
154
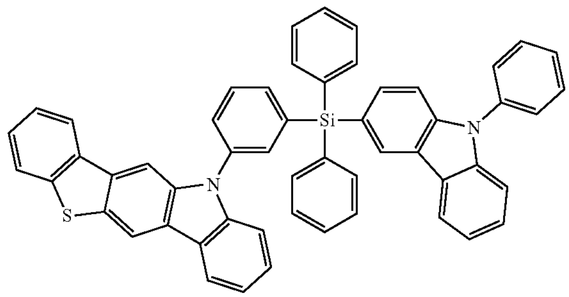
155
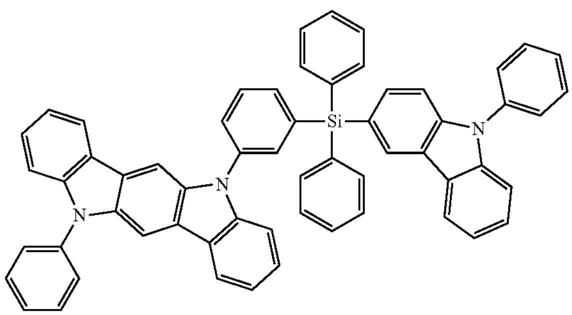
156
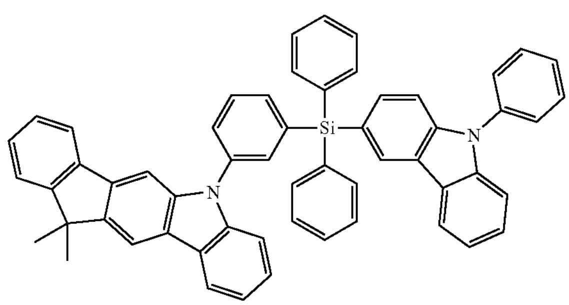
157
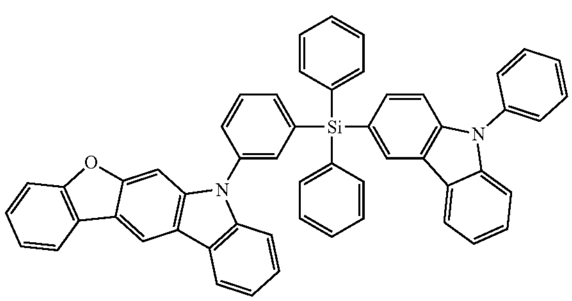
158
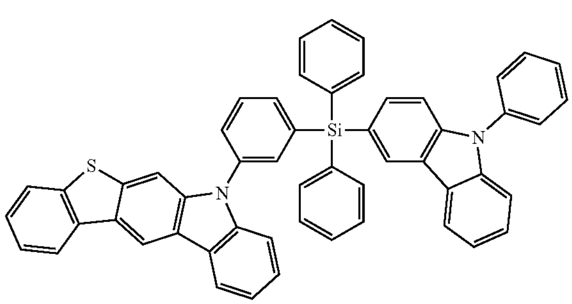
-continued
159
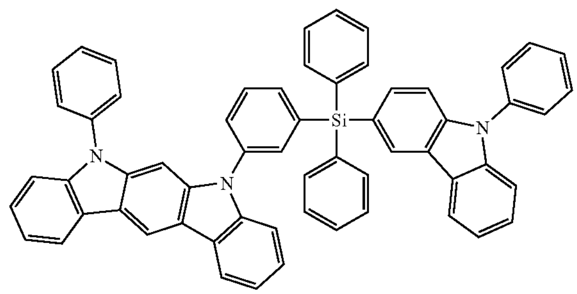
160
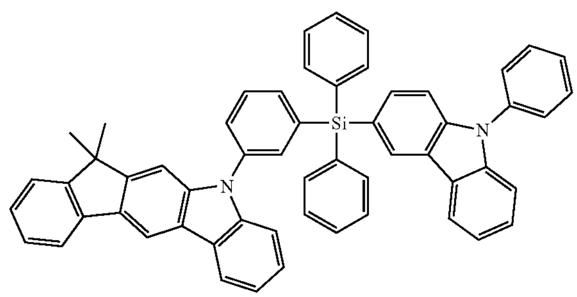
161
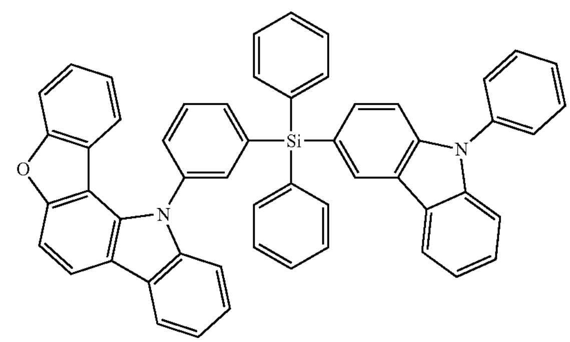
162
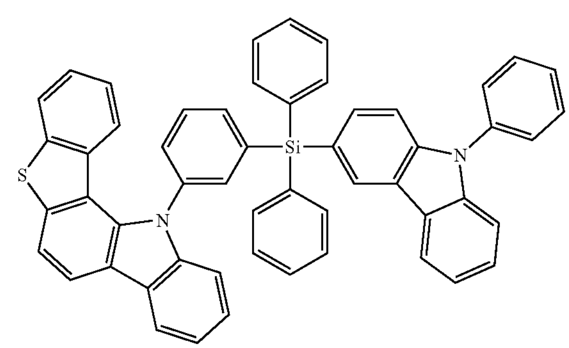
163
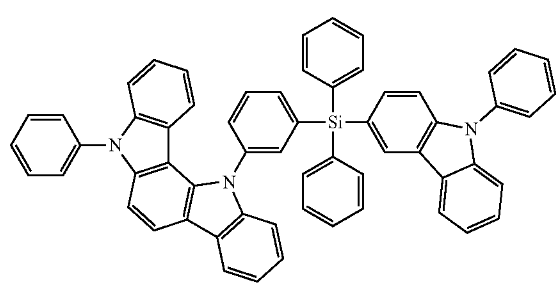

-continued
164
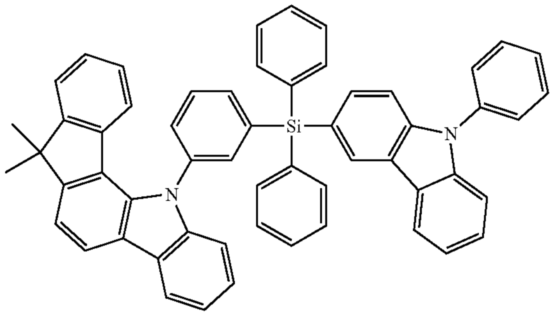
165
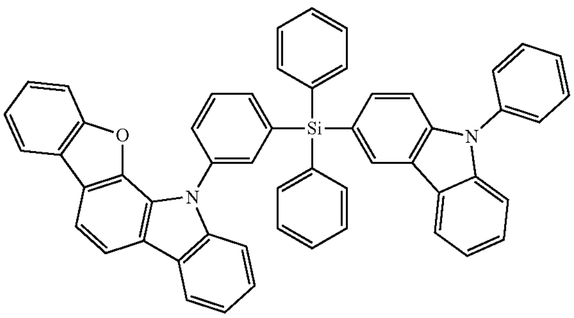
166
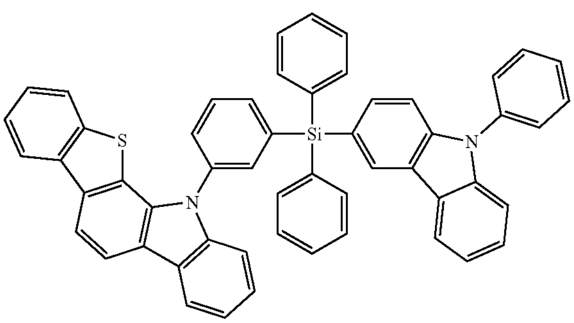
167
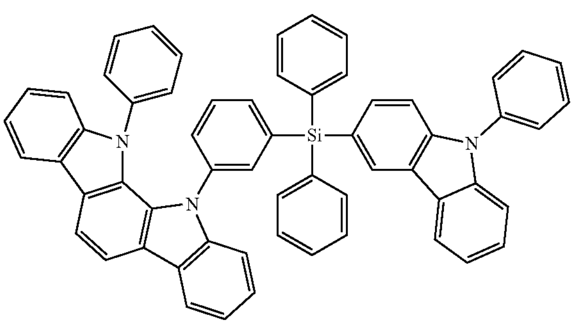
-continued
168
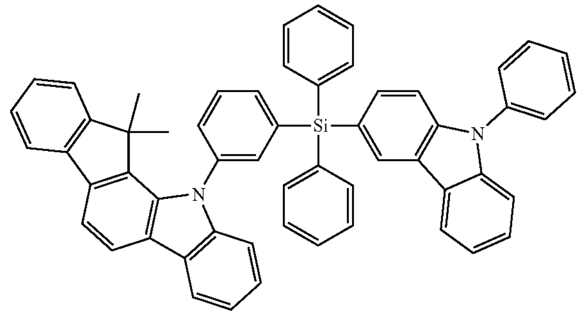
169
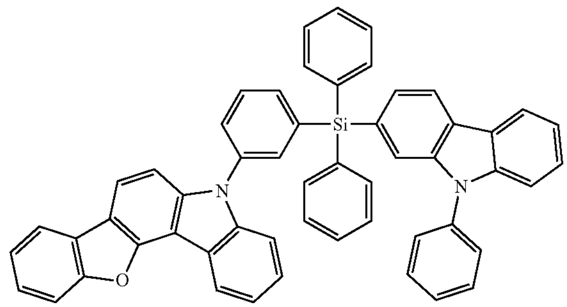
170
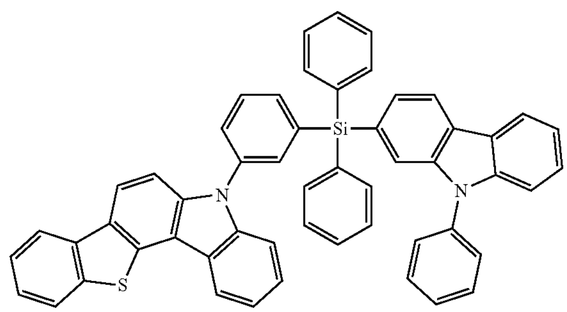
171
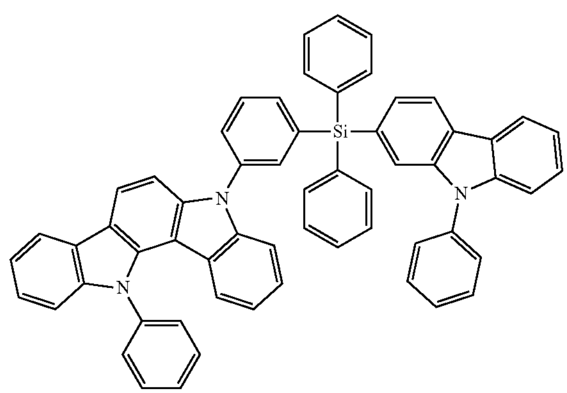

-continued
172
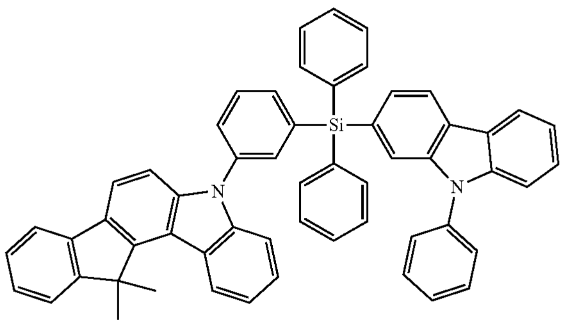
173
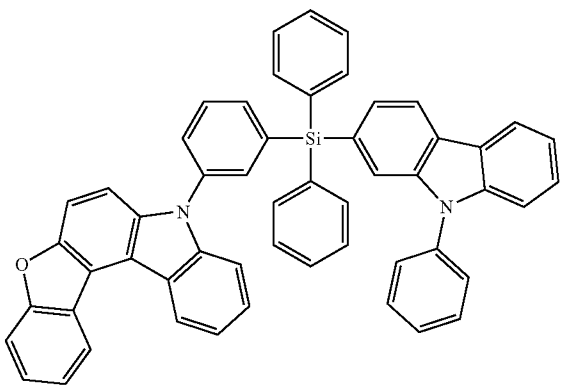
174
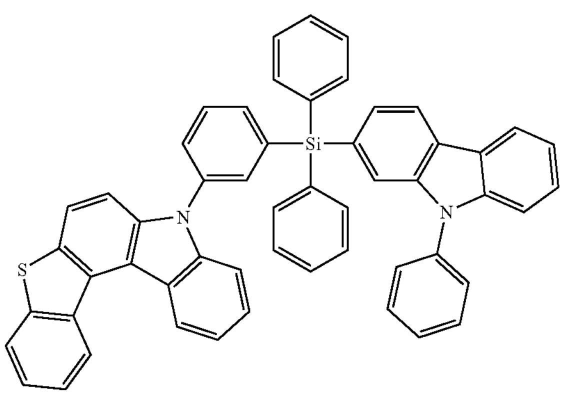
175
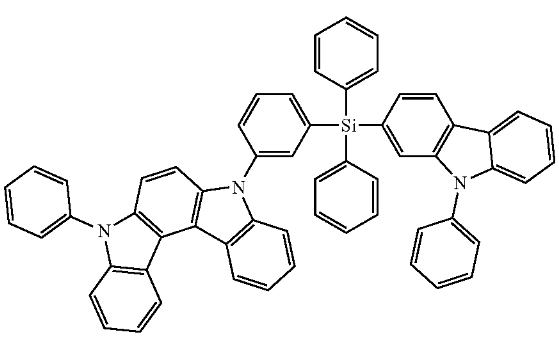
-continued
176
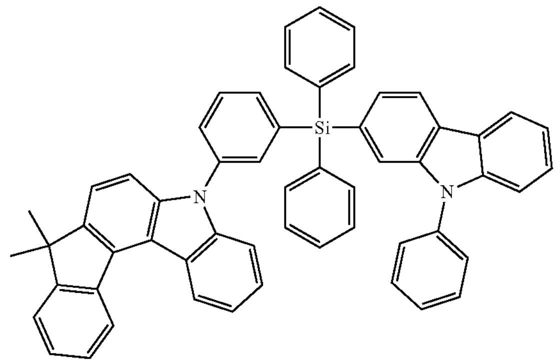
177
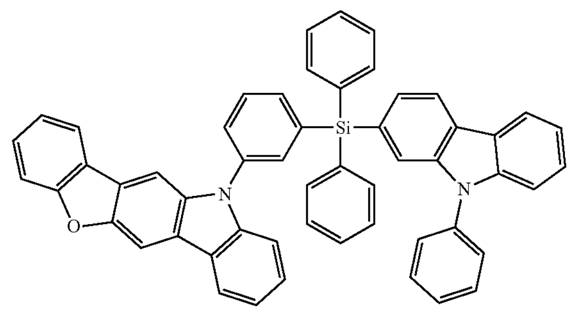
178
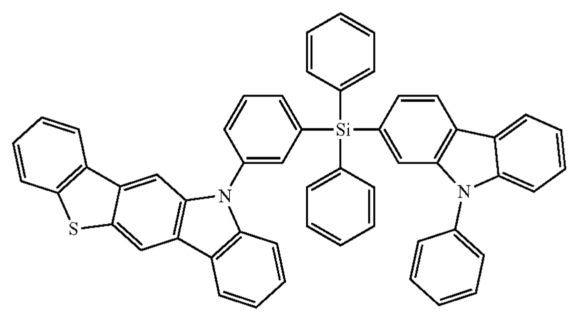
179
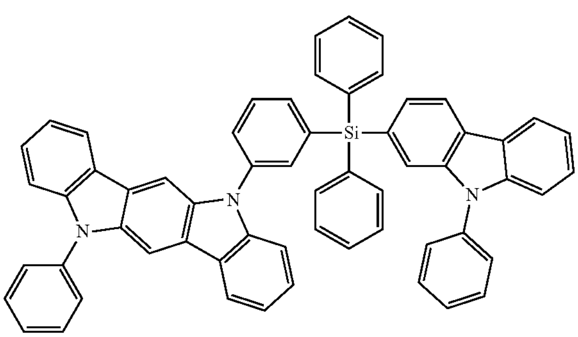

-continued
180
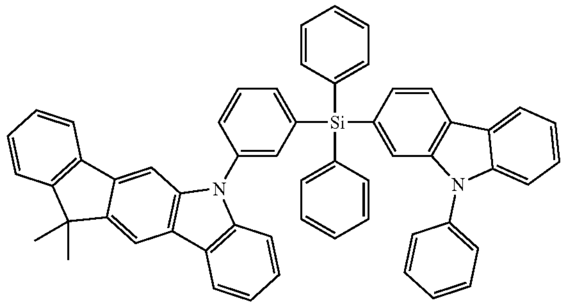
181
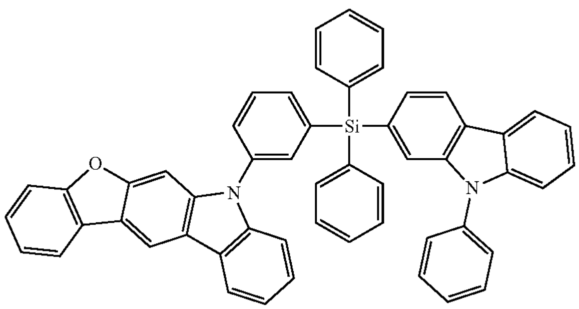
182
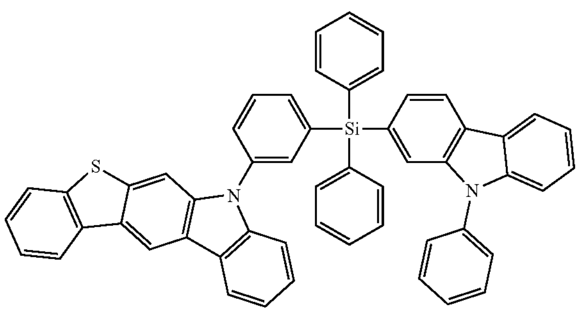
183
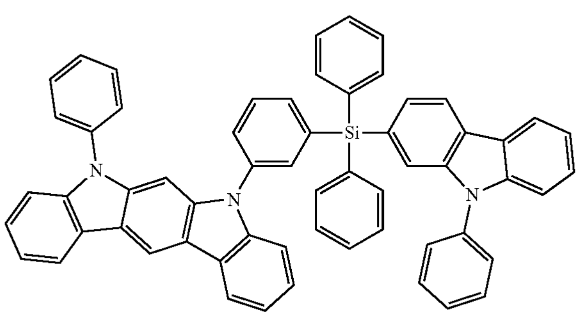
184
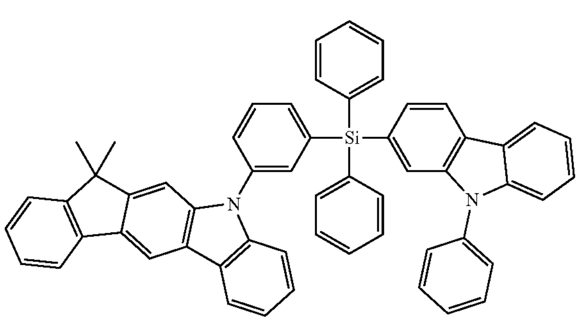
-continued
185
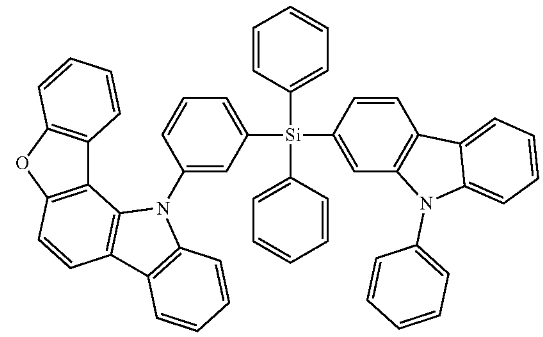
186
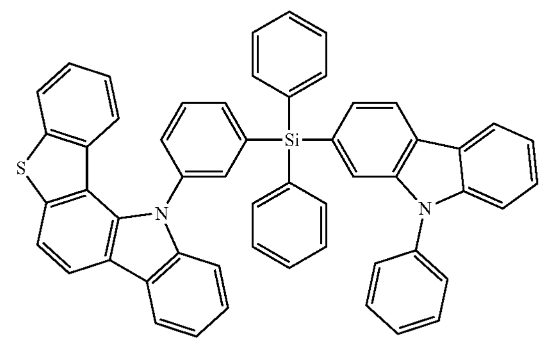
187
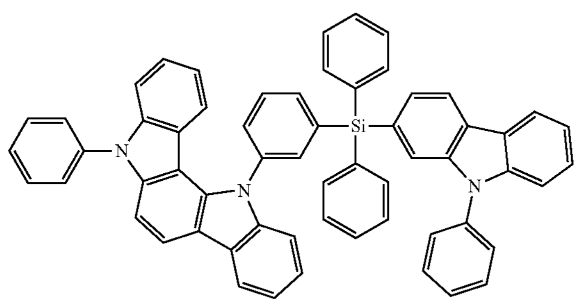
188
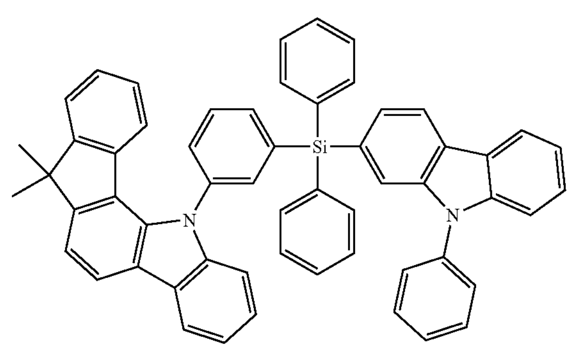

-continued
189
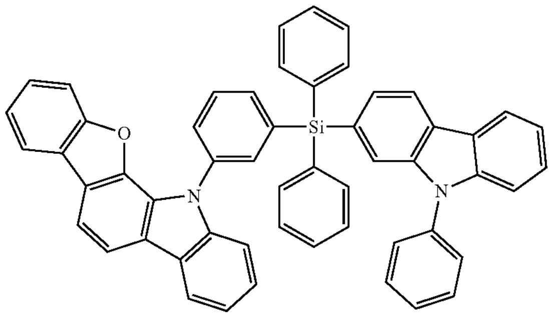
190
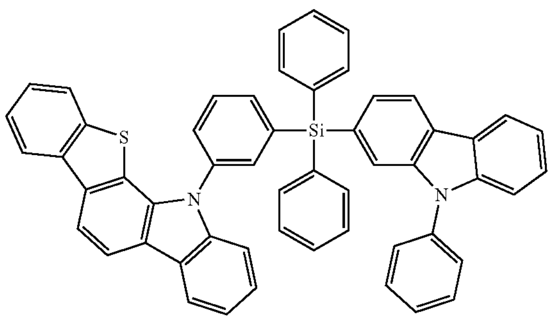
191
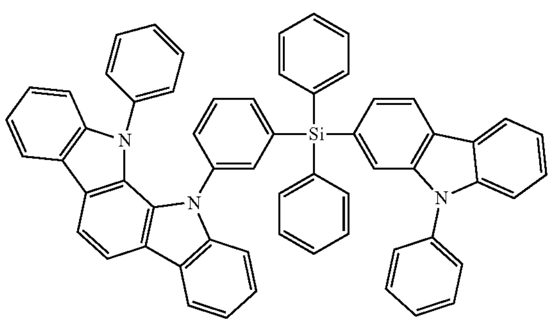
192
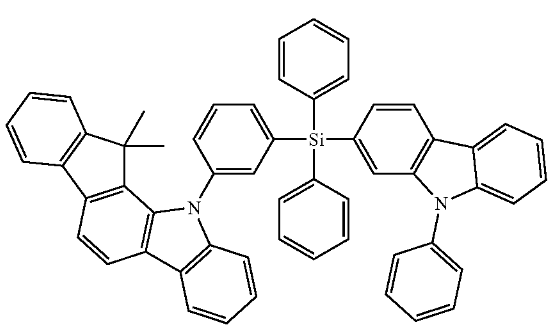
-continued
193
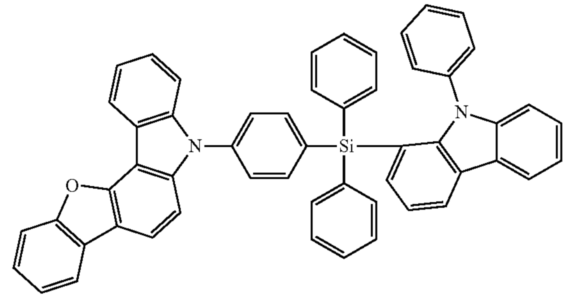
194
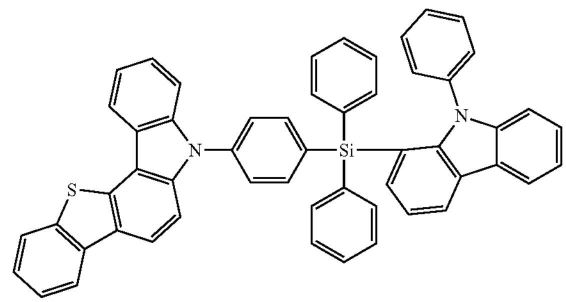
195
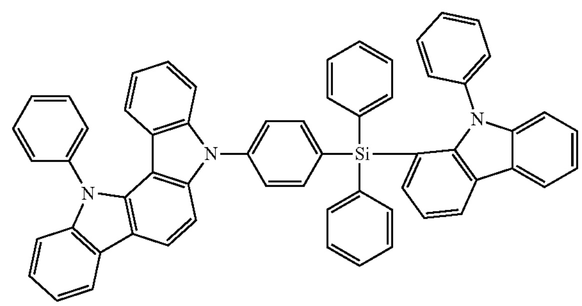
196
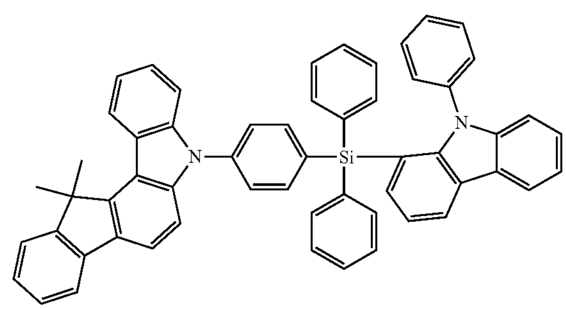
197
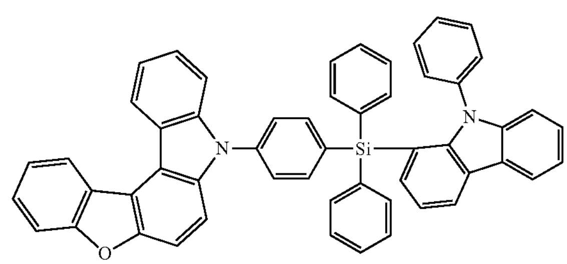

-continued
198
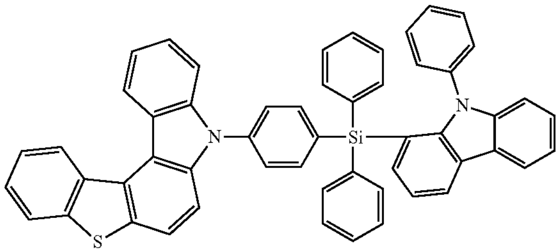
199
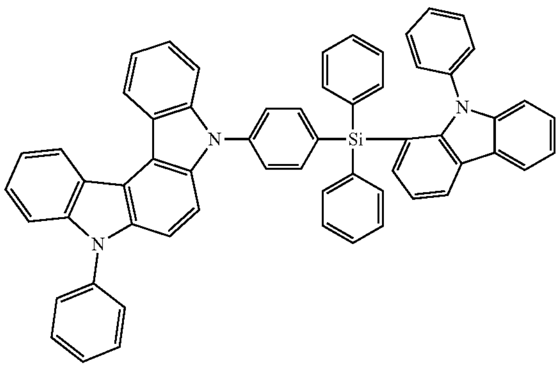
200
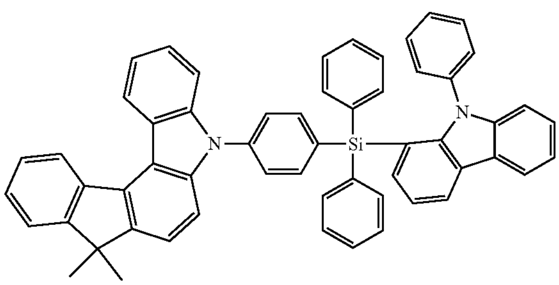
201
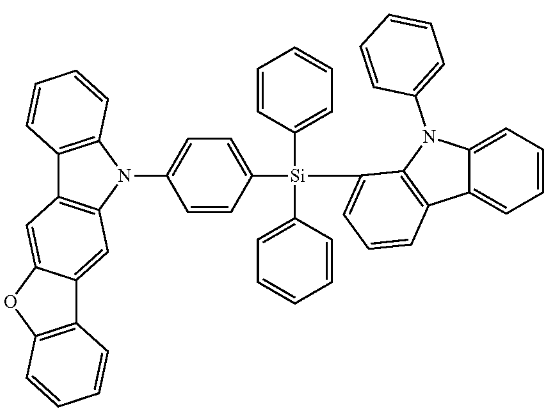
-continued
202
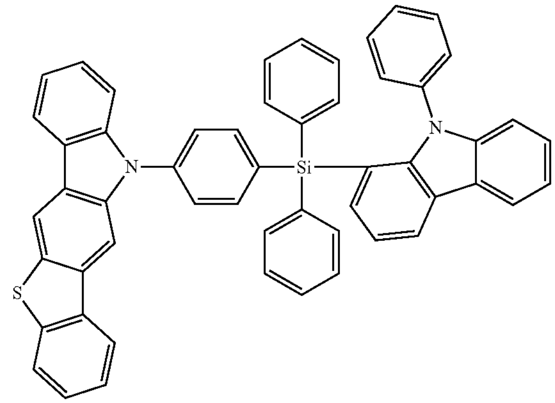
203
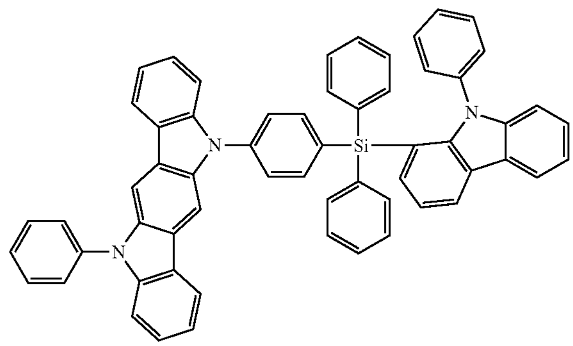
204
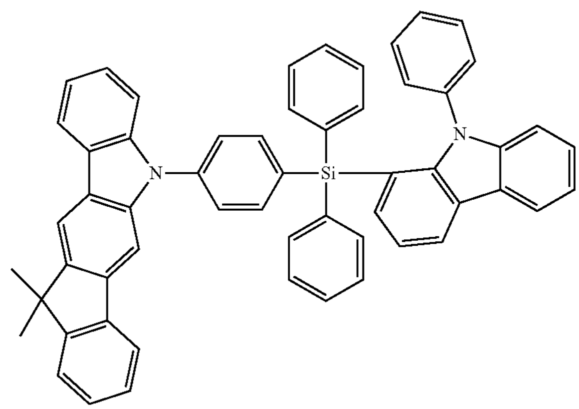
205
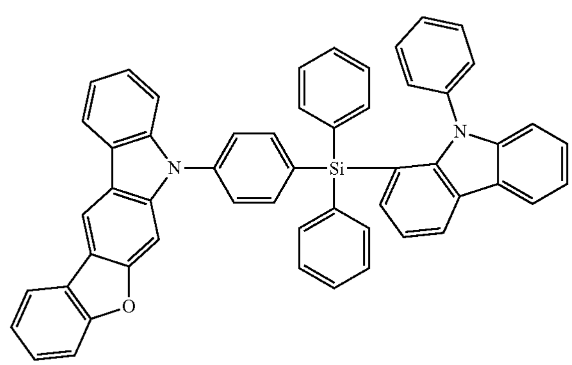

-continued
206
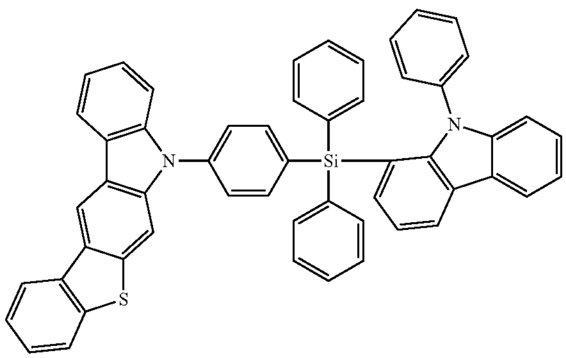
207
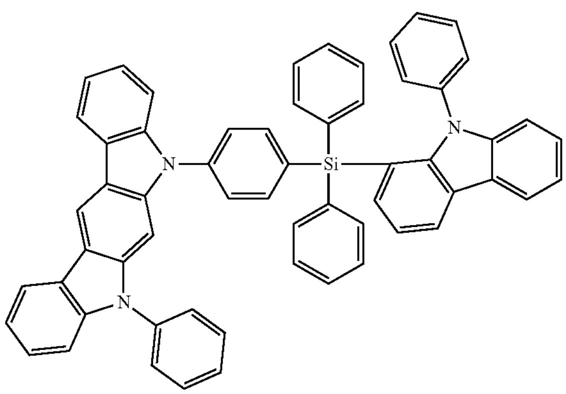
208
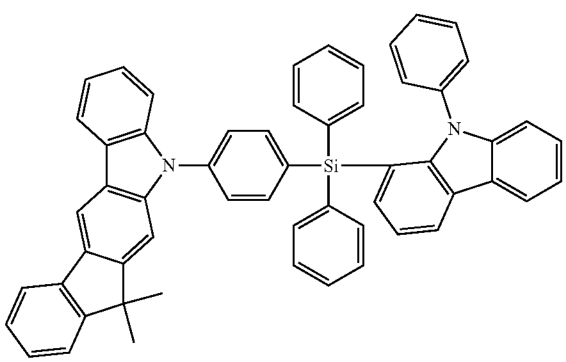
209
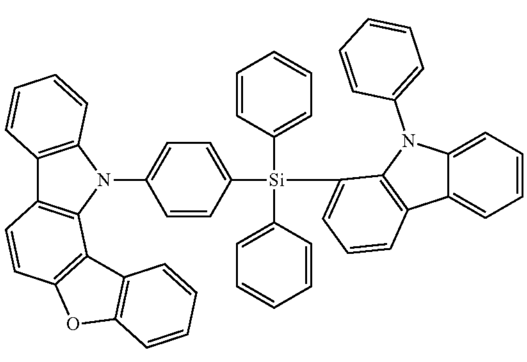
-continued
210
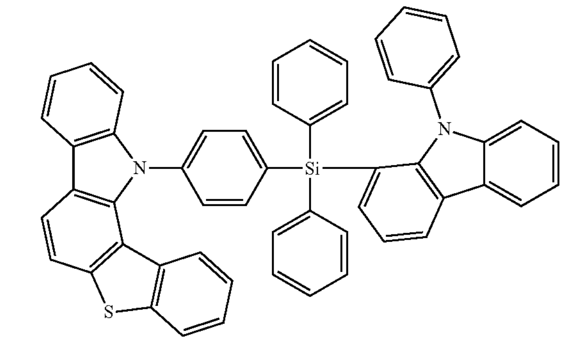
211
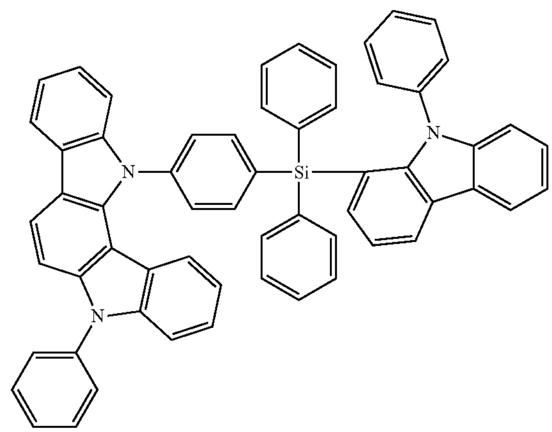
212
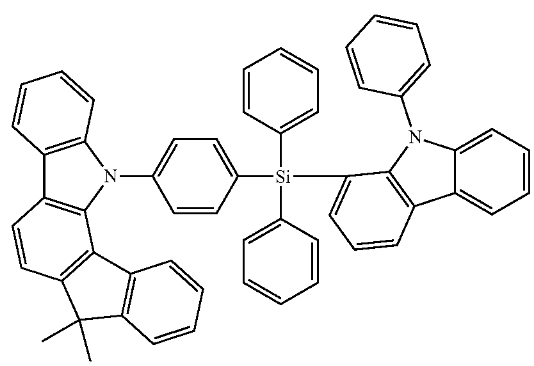
213
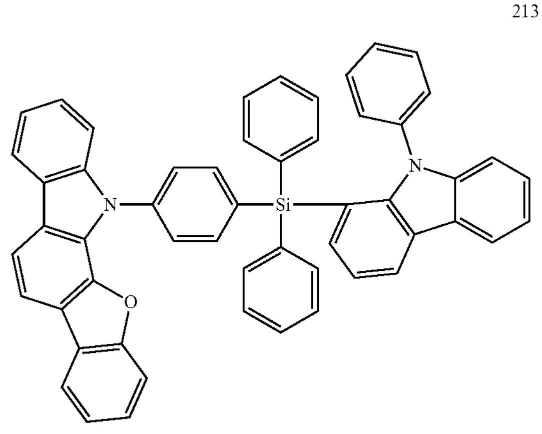

-continued
214
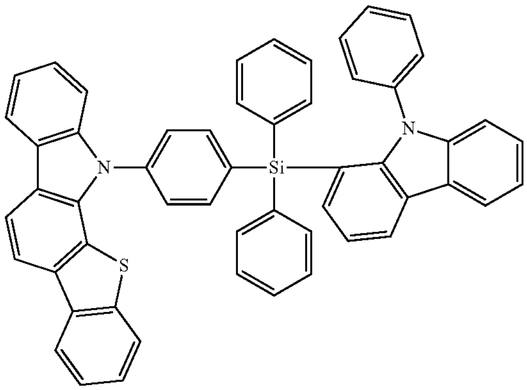
215
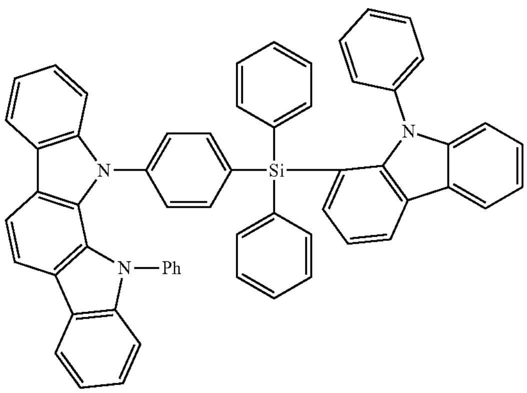
216
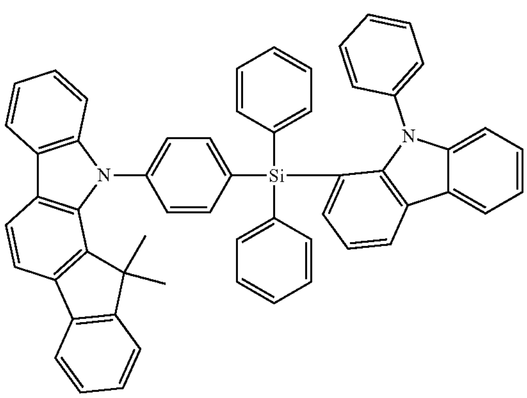
217
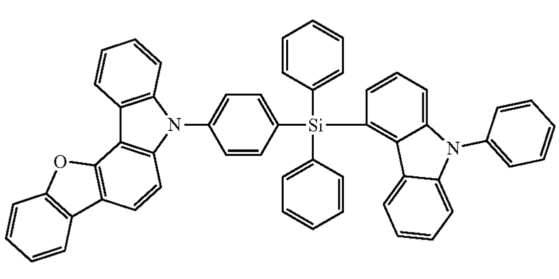
-continued
218
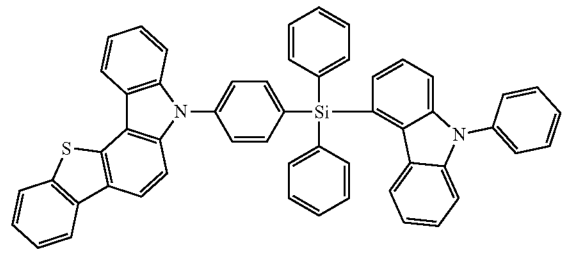
219
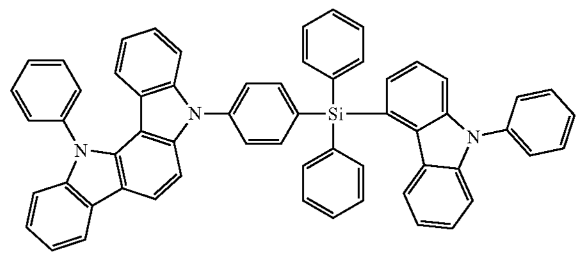
220
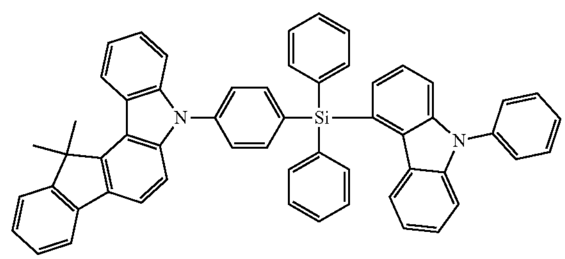
221
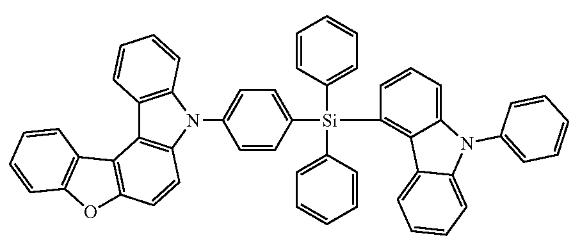
222
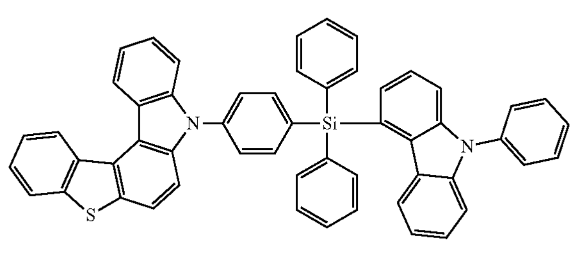

-continued
223
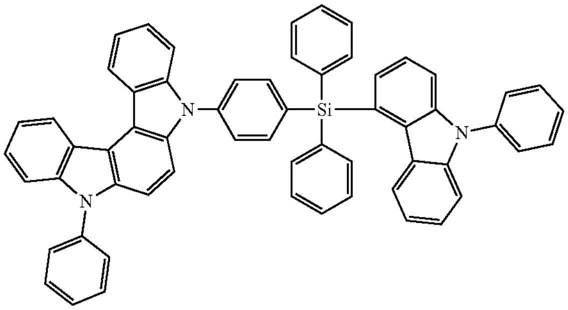
224
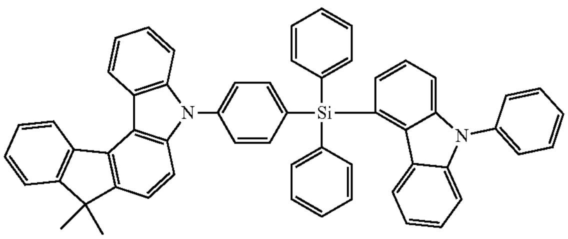
225
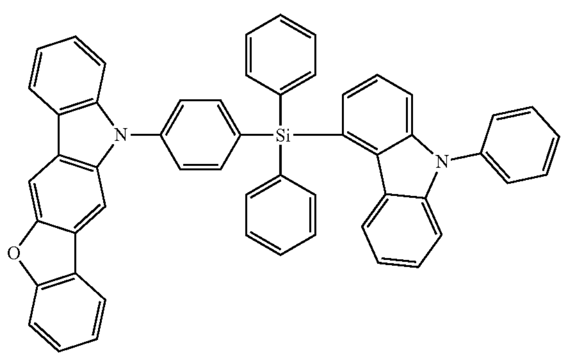
226
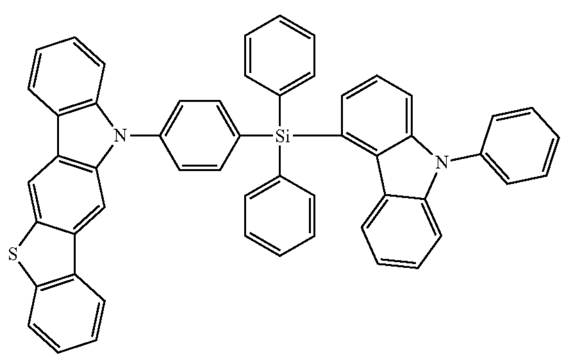
227
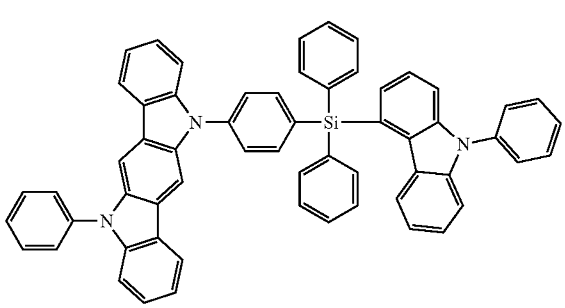
-continued
228
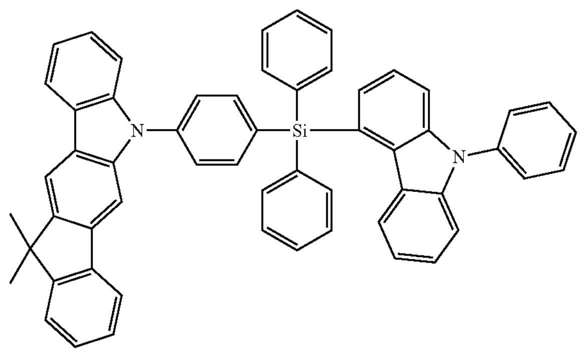
229
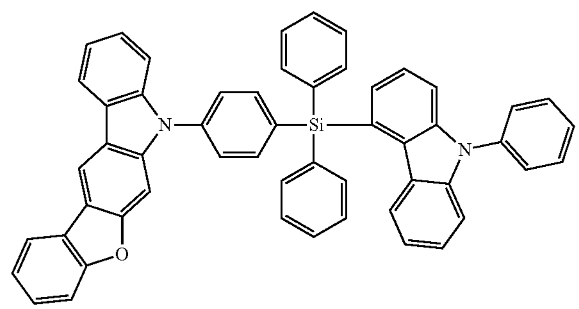
230
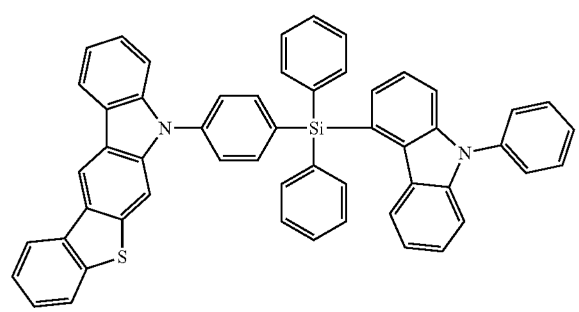
231
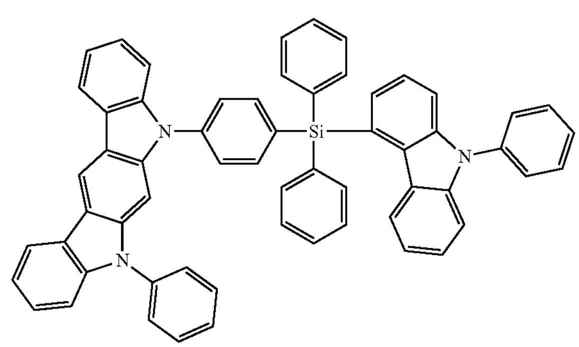

-continued
232
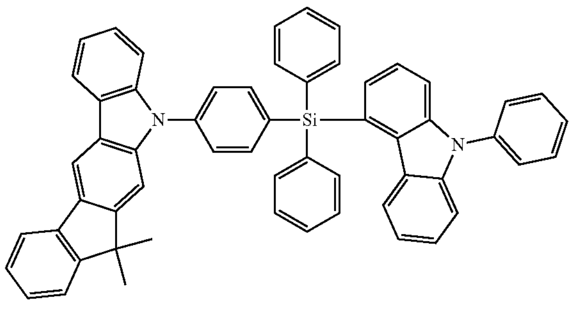
233
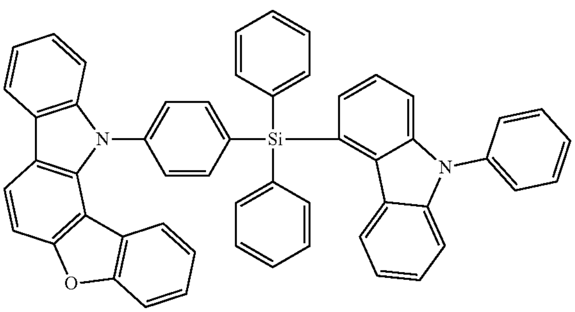
234
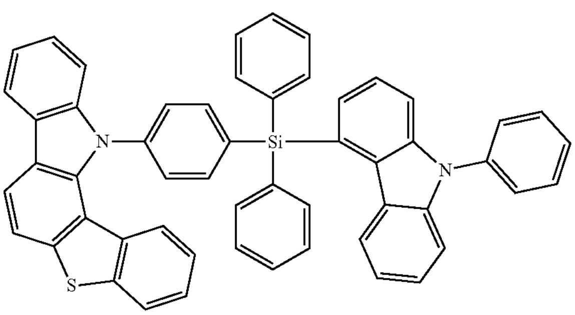
235
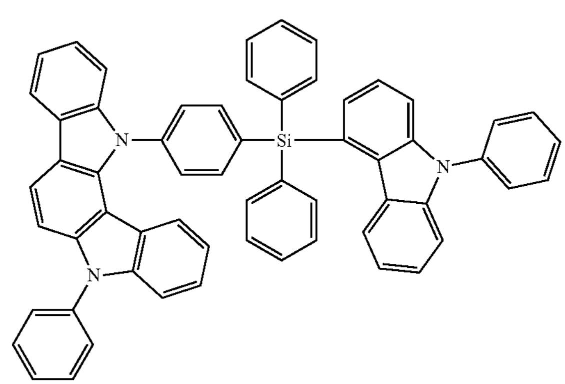
-continued
236
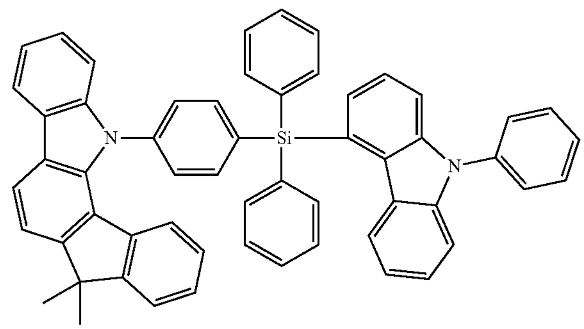
237
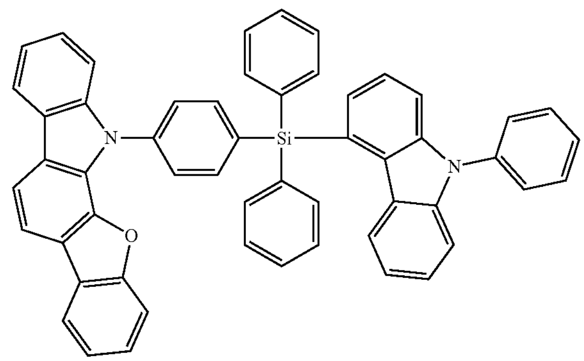
238
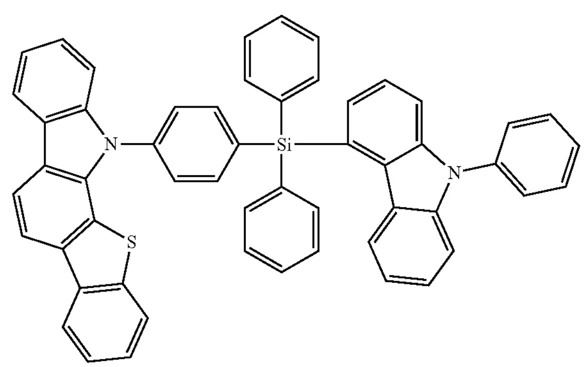
239
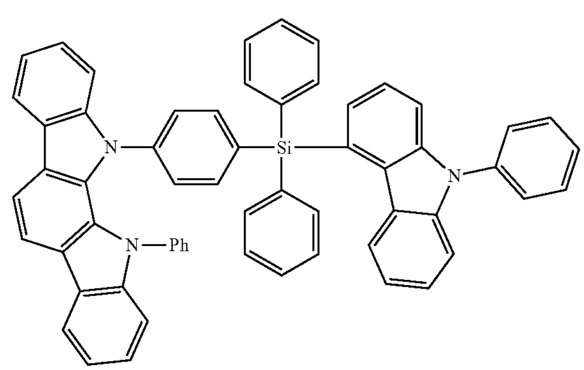

-continued
240
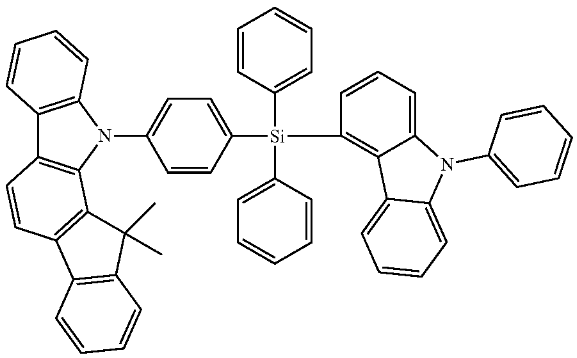
241
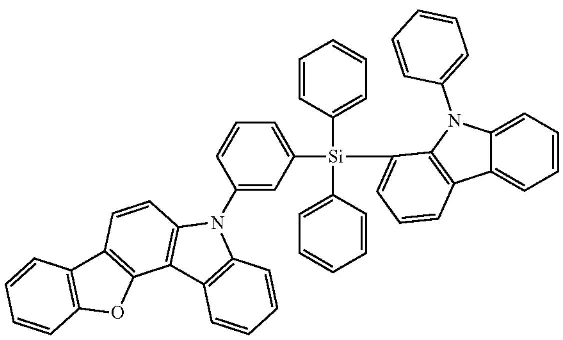
242
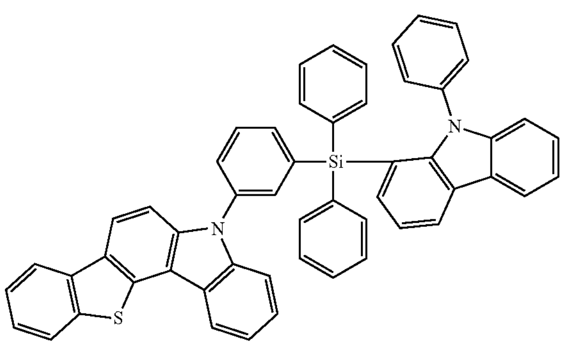
243
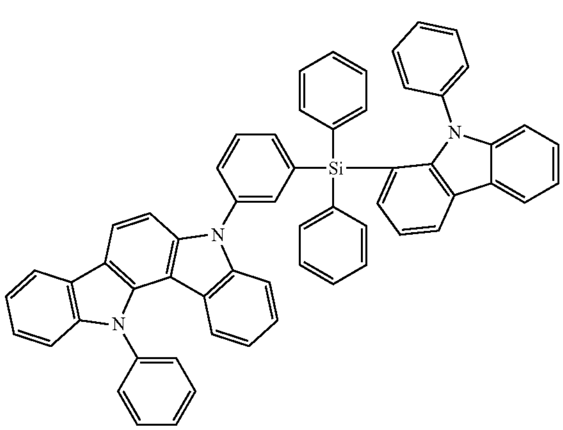
-continued
244
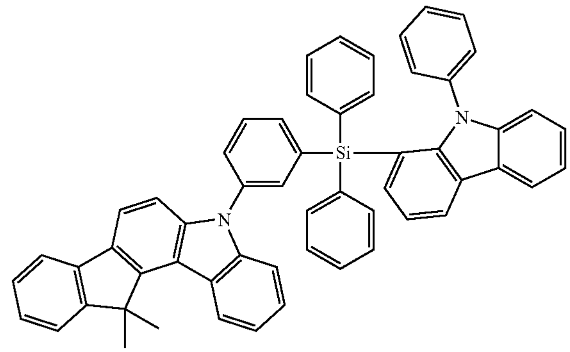
245
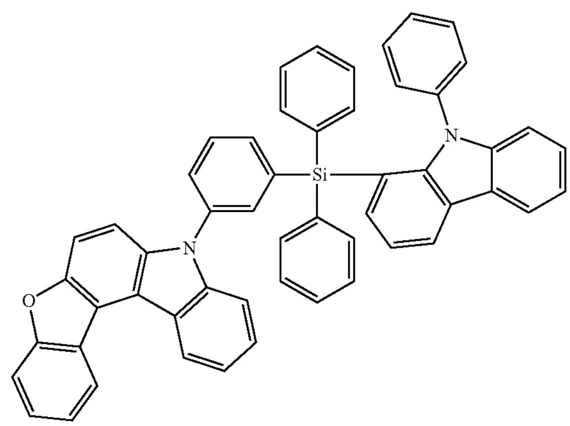
246
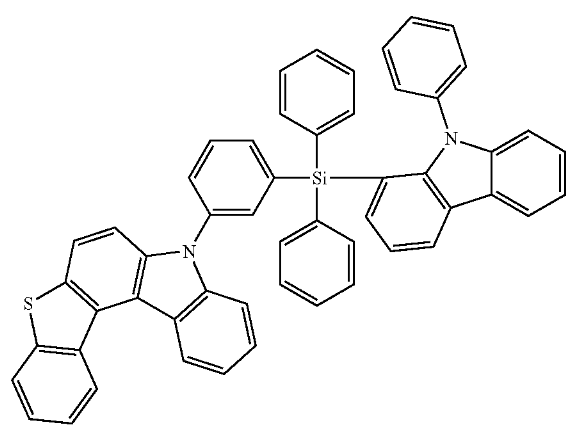
247
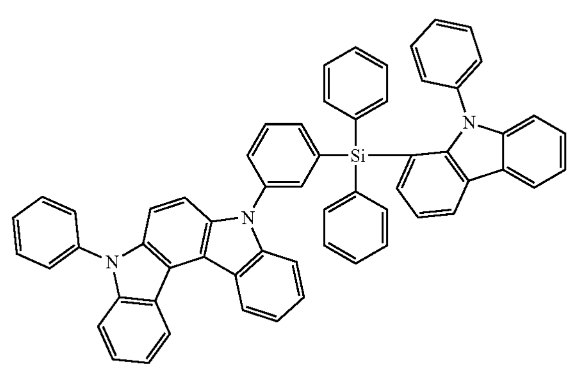

-continued
248
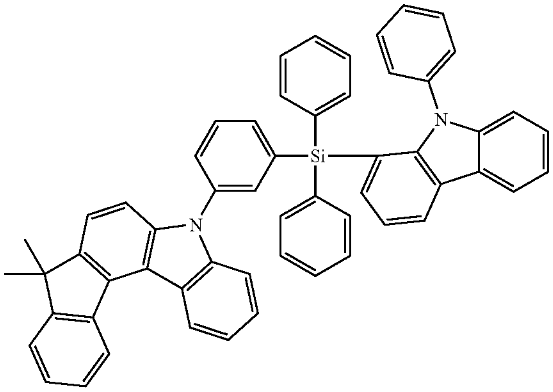
249
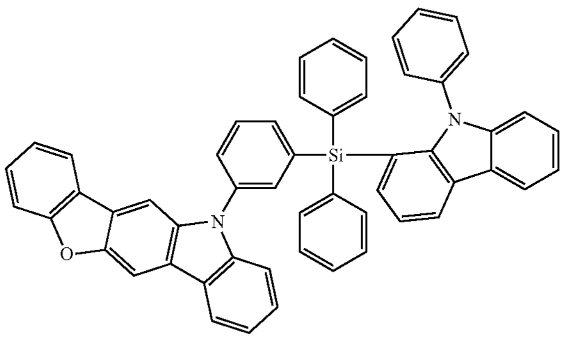
250
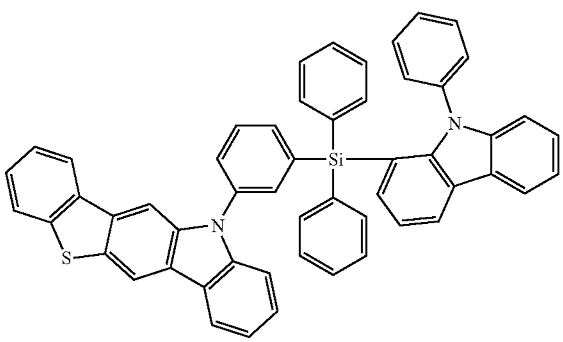
251
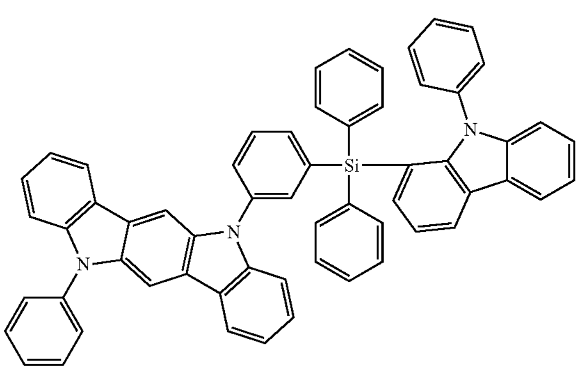
-continued
252
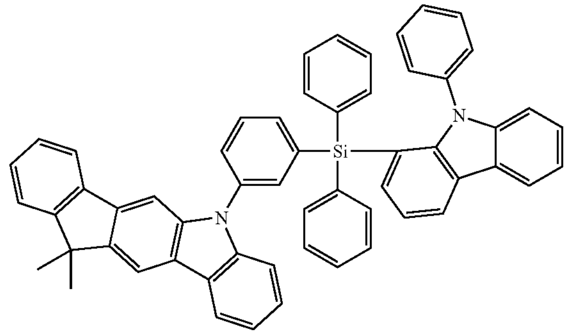
253
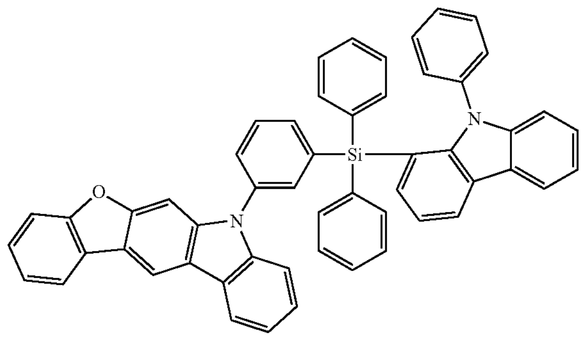
254
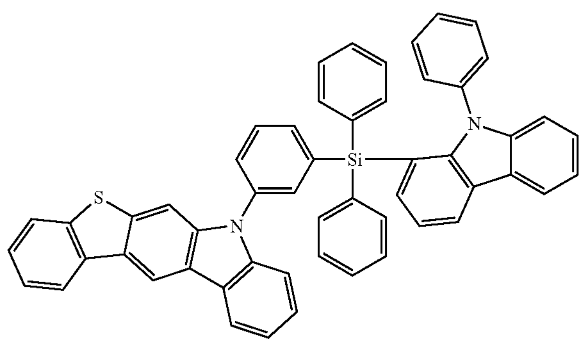
255
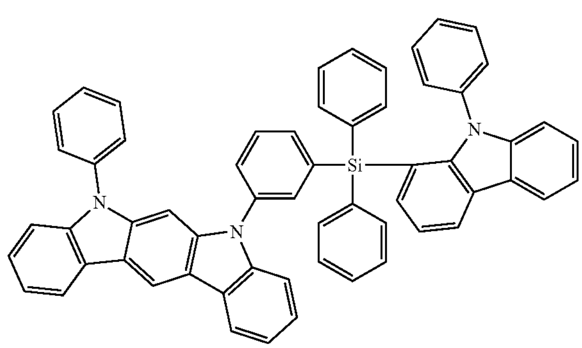

-continued
256
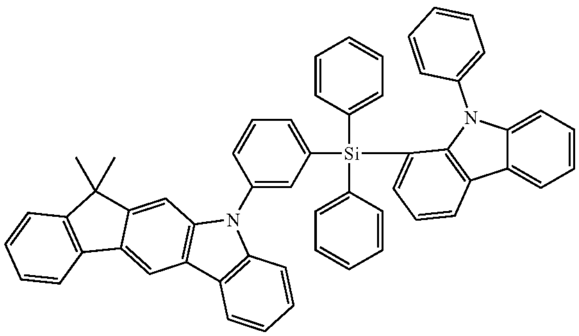
257
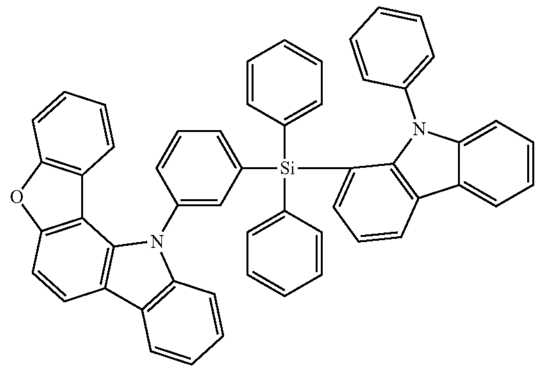
258
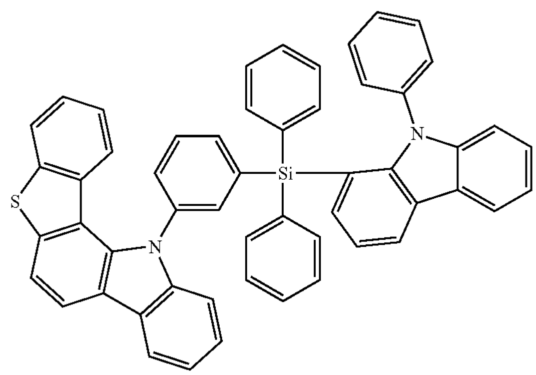
259
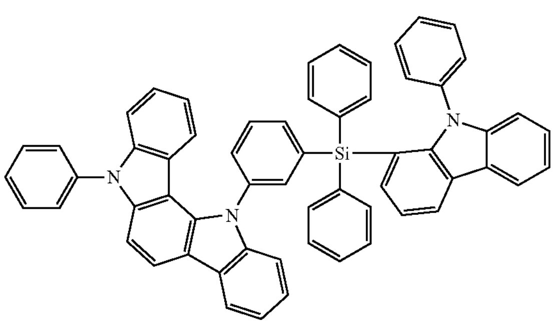
-continued
260
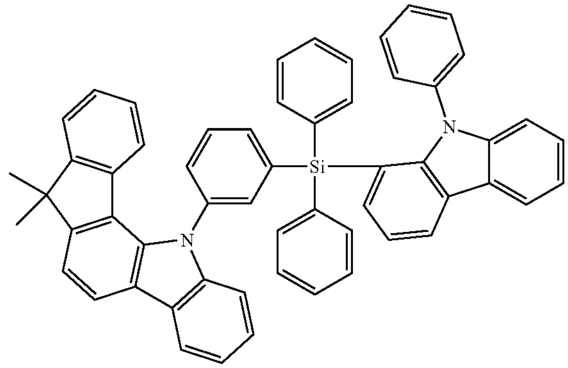
261
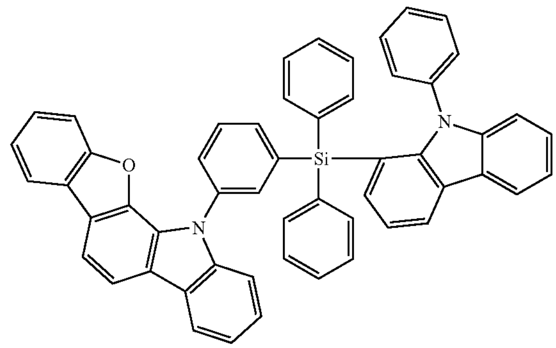
262
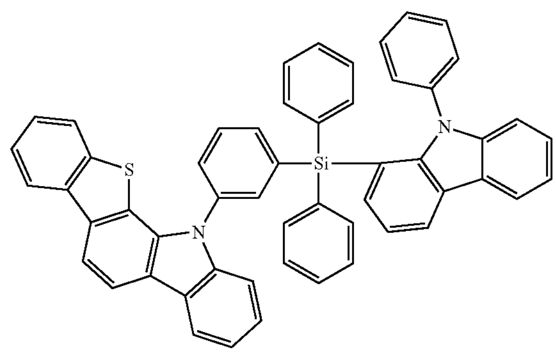
263
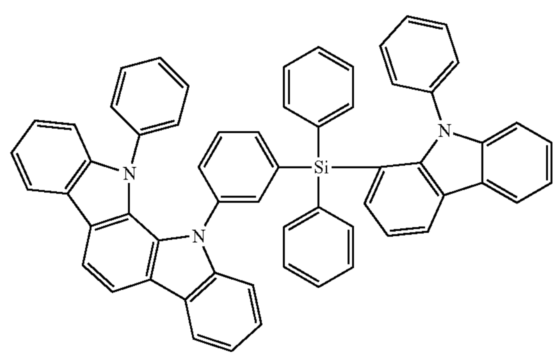

264
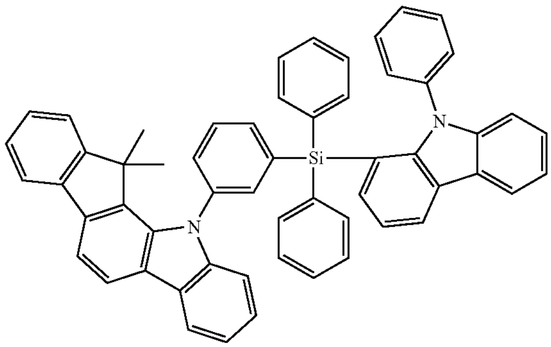
265
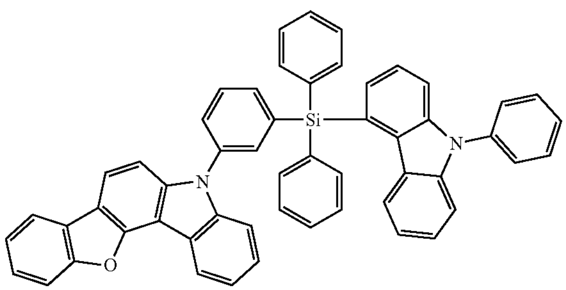
266
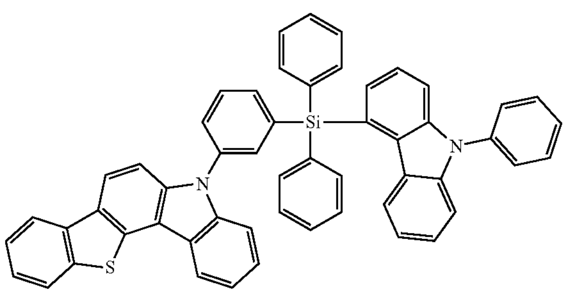
267
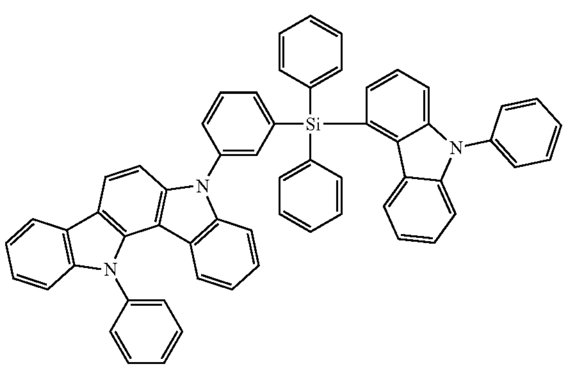
268
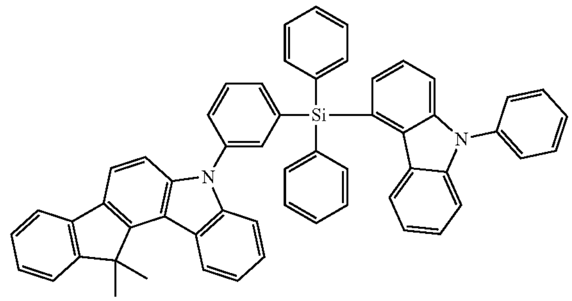
269
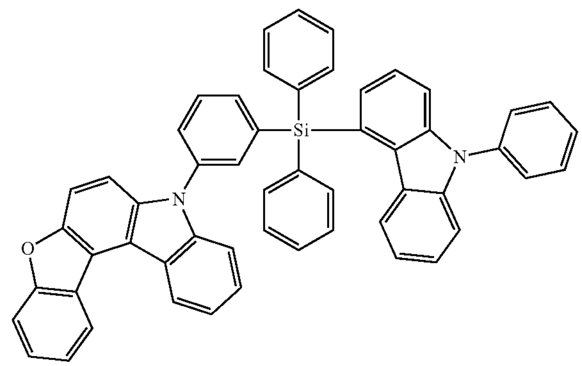
270
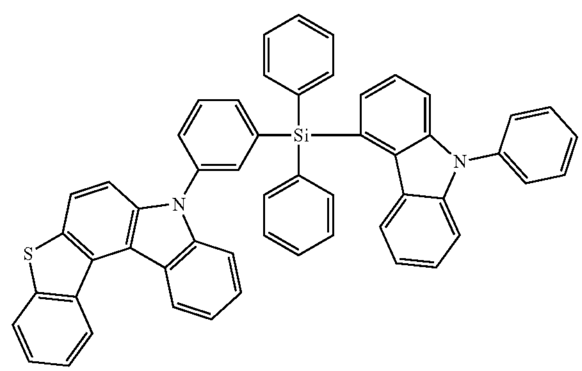
271
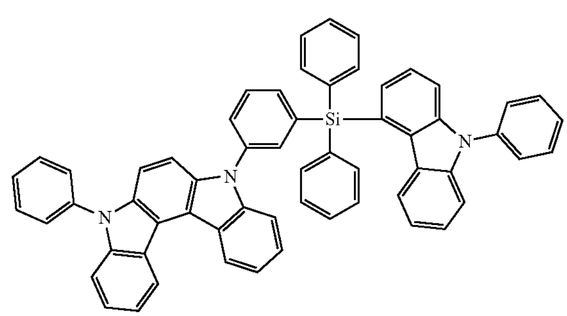

-continued
272
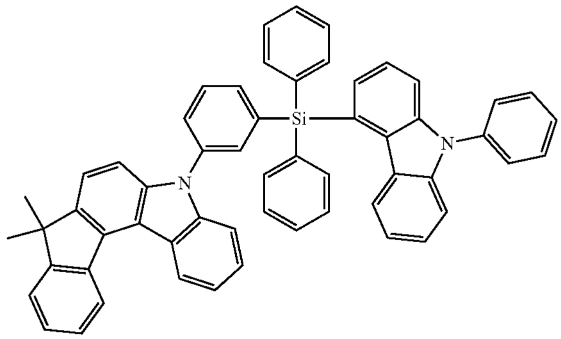
273
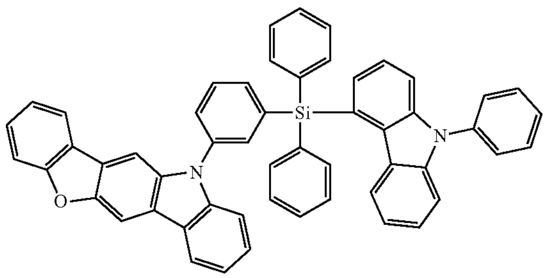
274
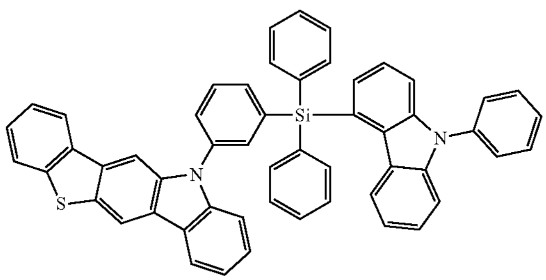
275
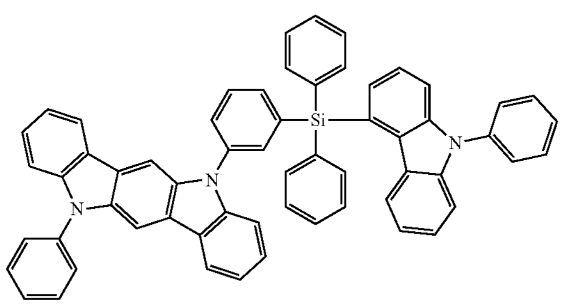
276
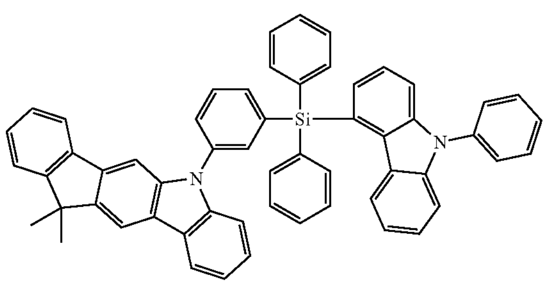
-continued
277
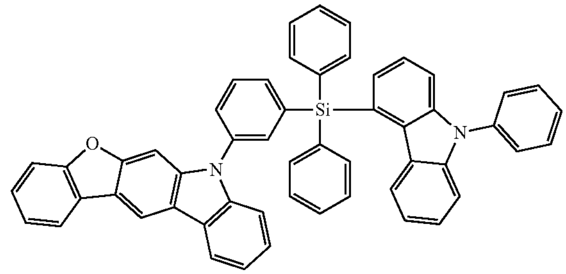
278
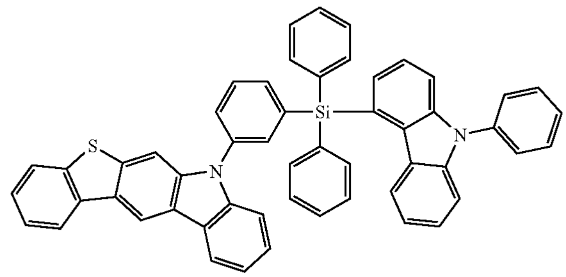
279
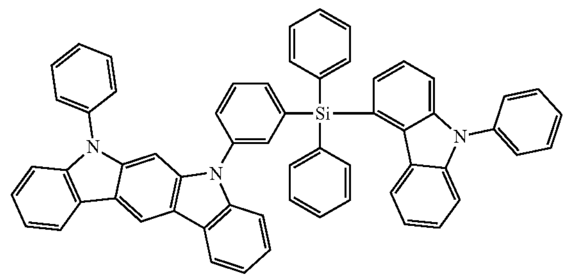
280
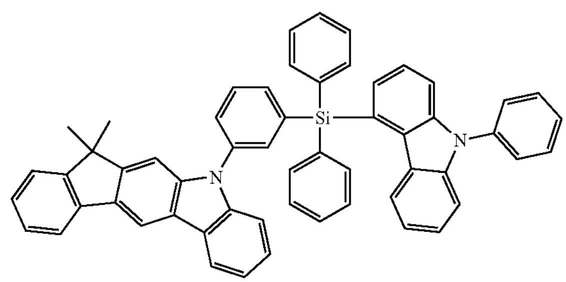
281
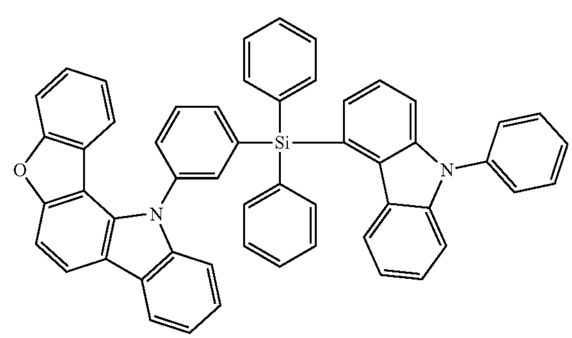

-continued
282
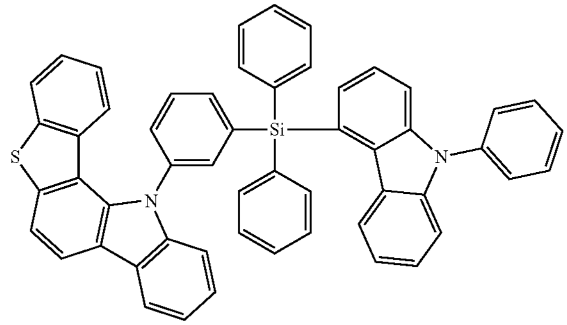
283
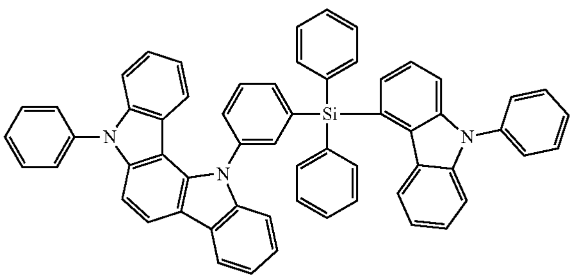
284
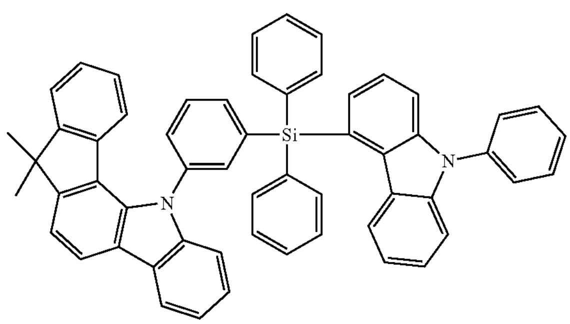
285
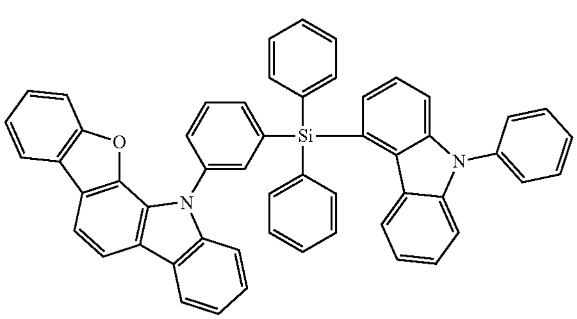
286
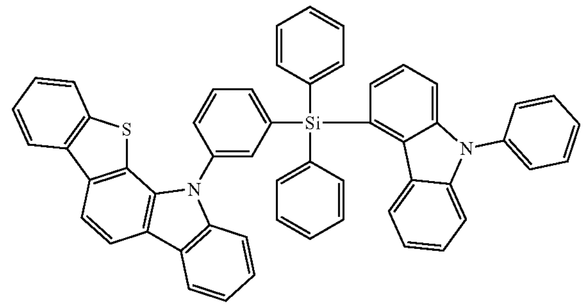
287
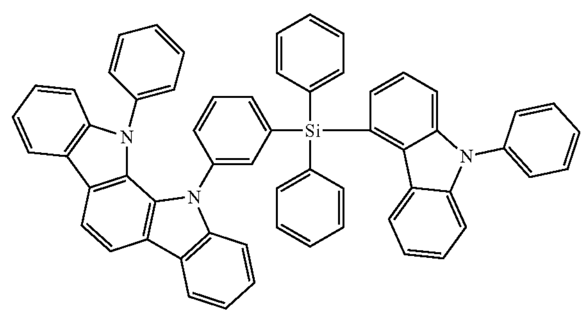
288
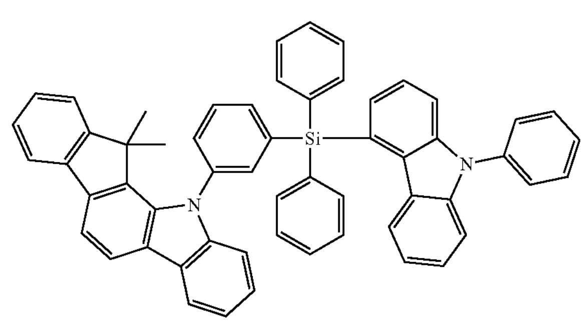

289
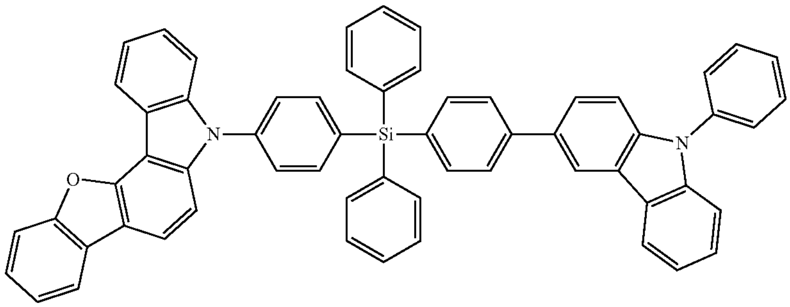
290
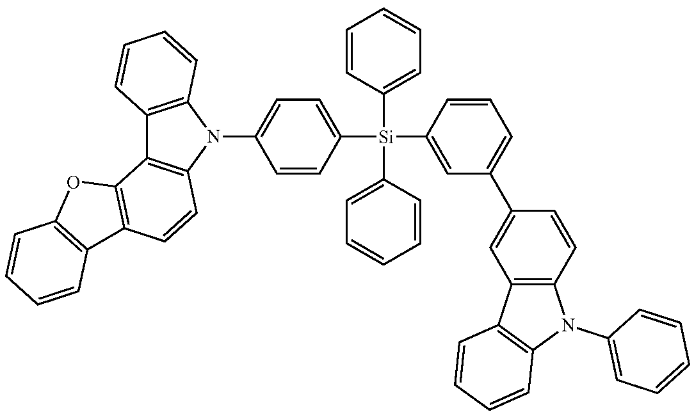
291
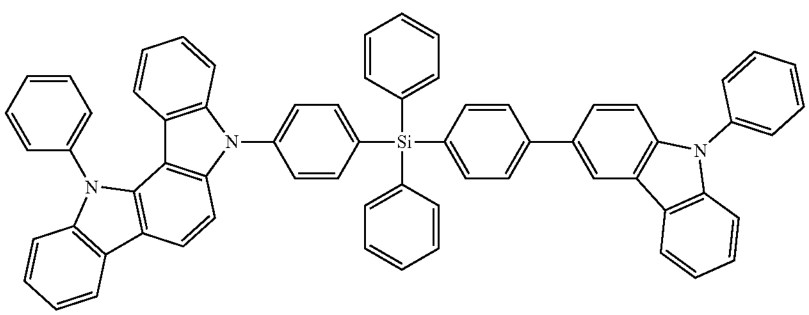
292
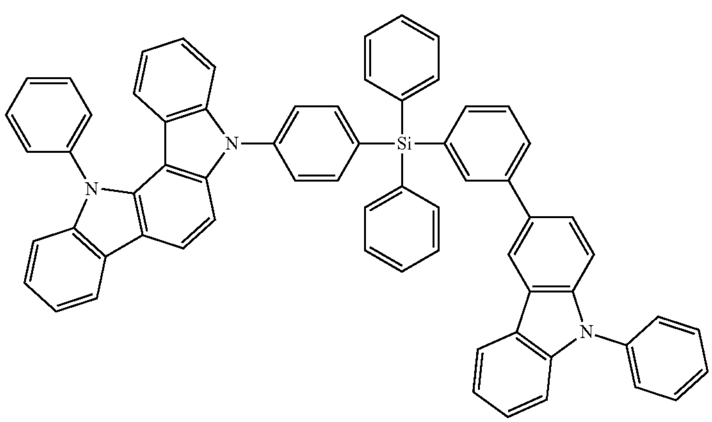

-continued
293
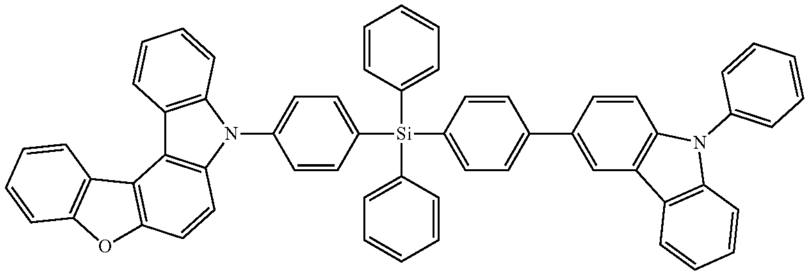
294
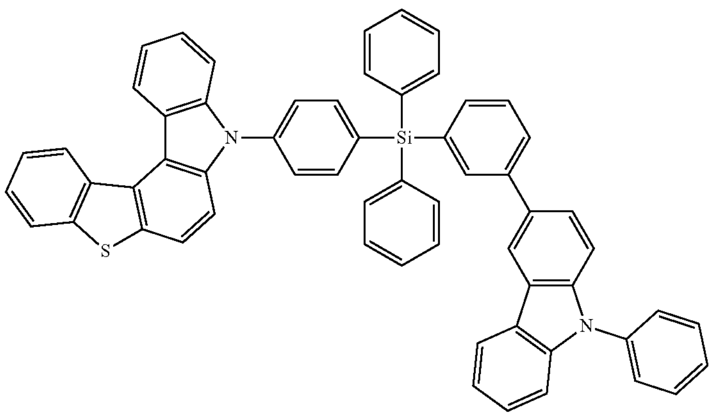
295
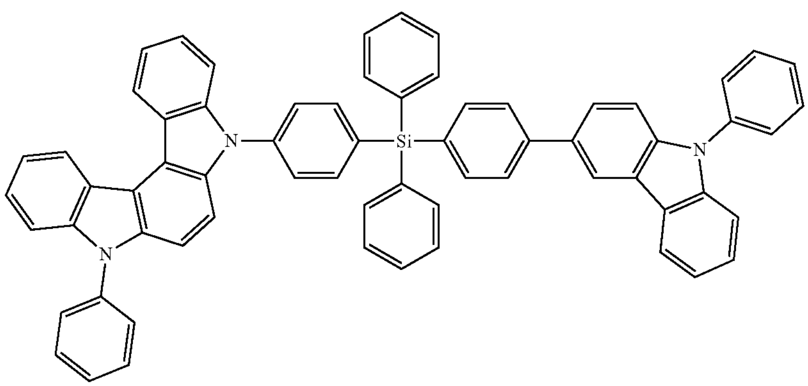
296
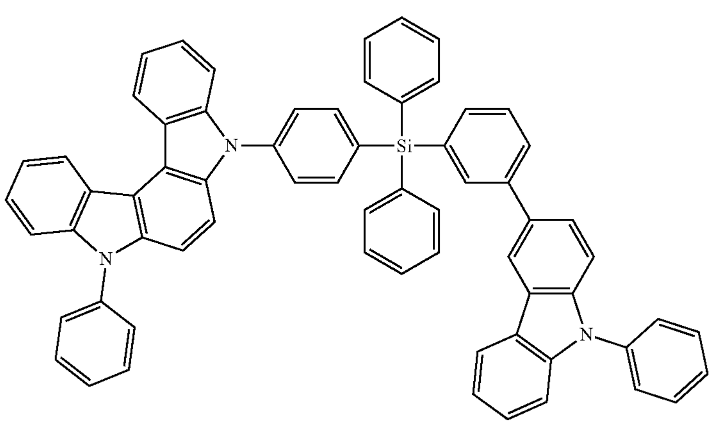

-continued
297
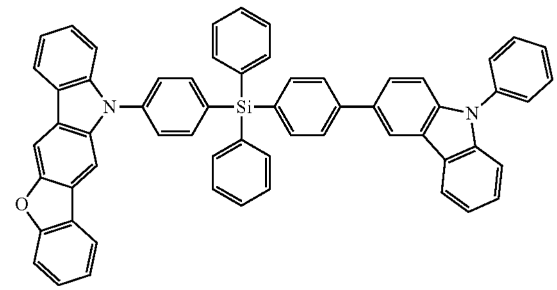
298
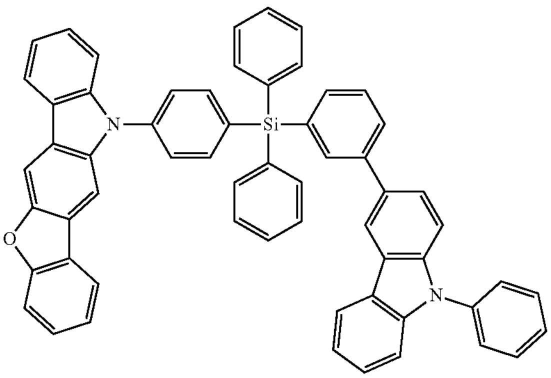
299
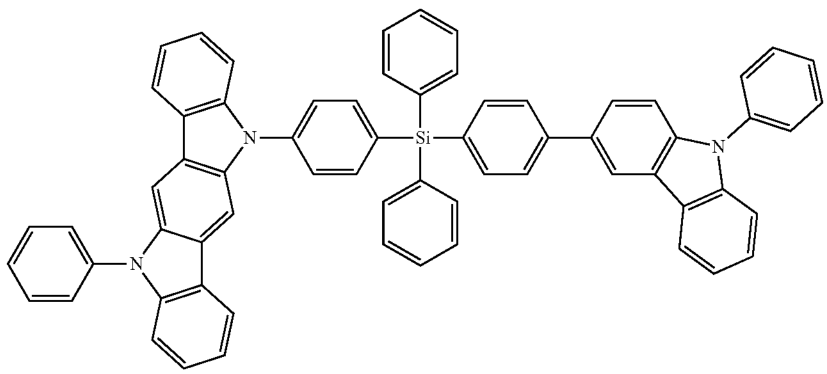
300
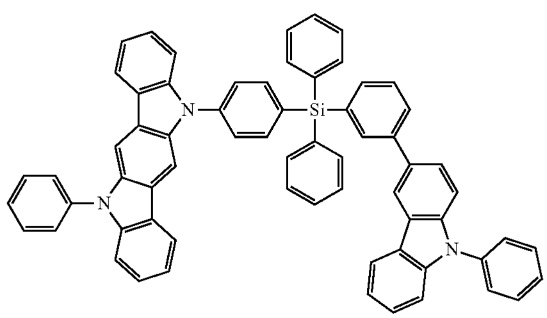
301
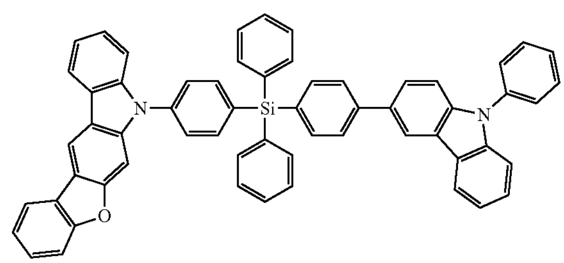
302
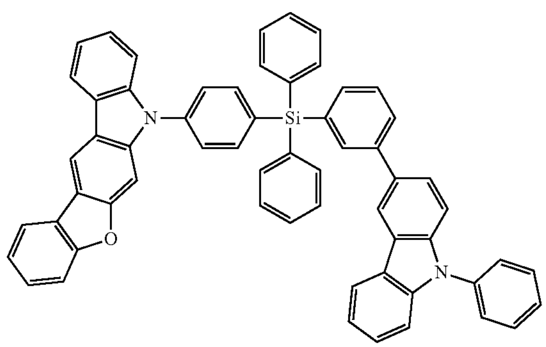
303
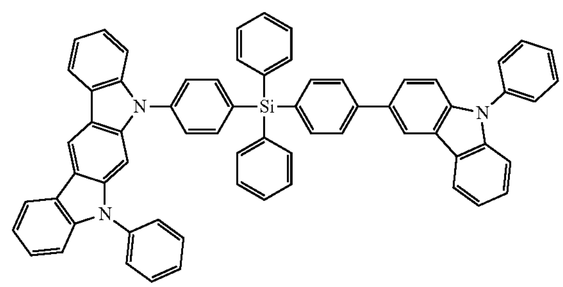

-continued
304
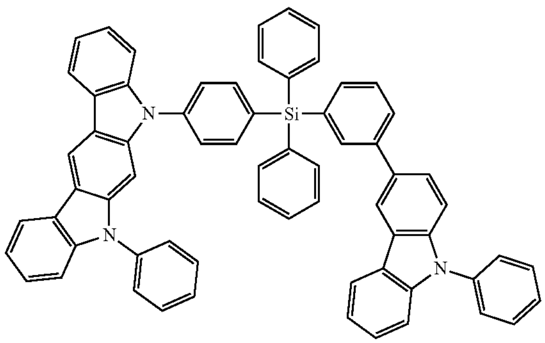
305
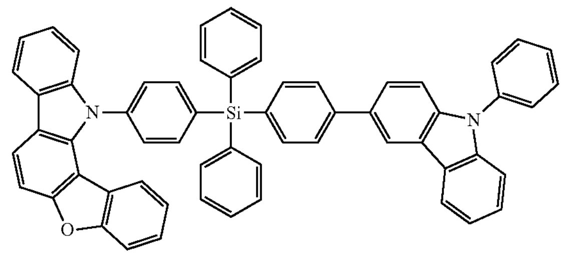
306
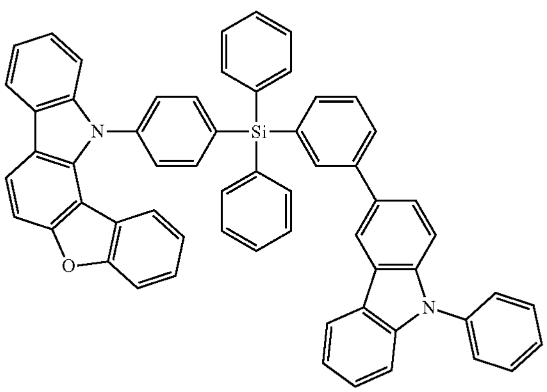
307
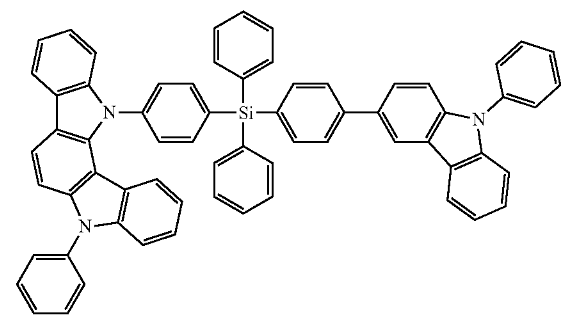
308
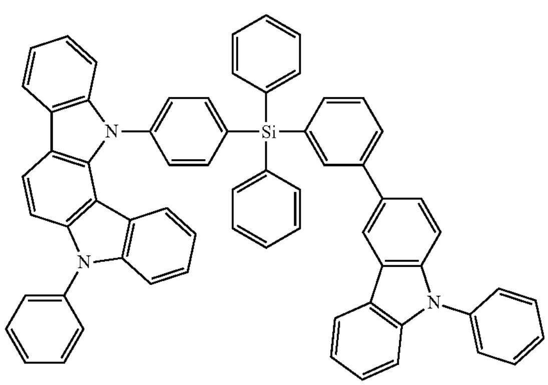
309
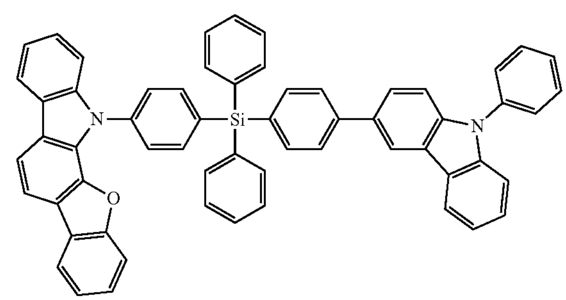
310
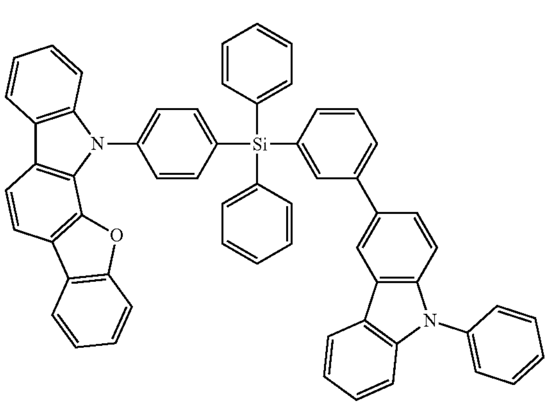
311
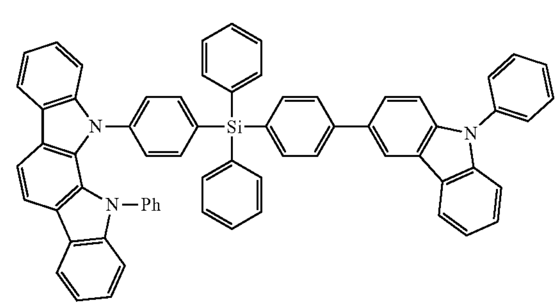

-continued
312
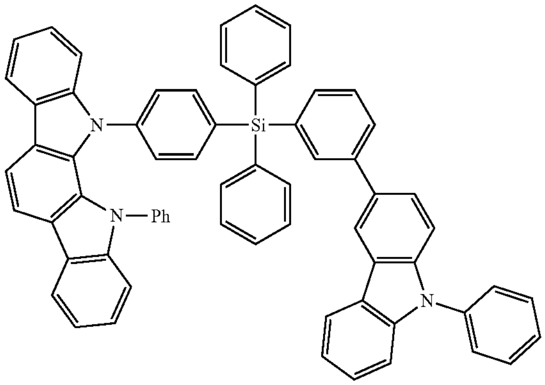
313
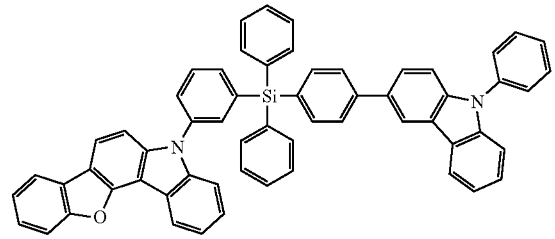
314
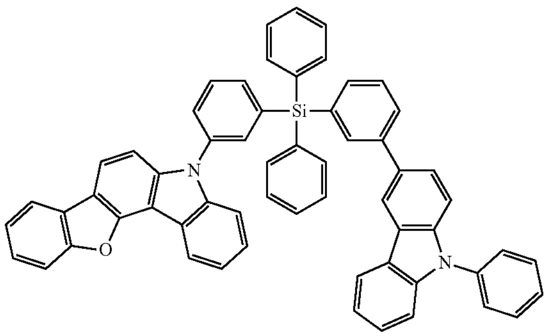
315
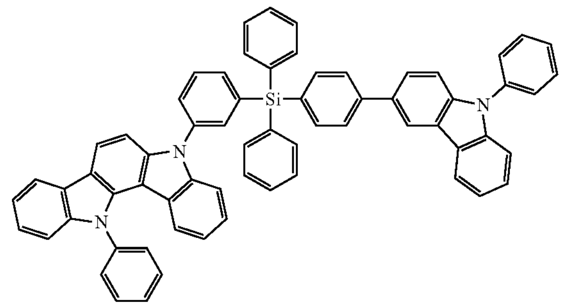
316
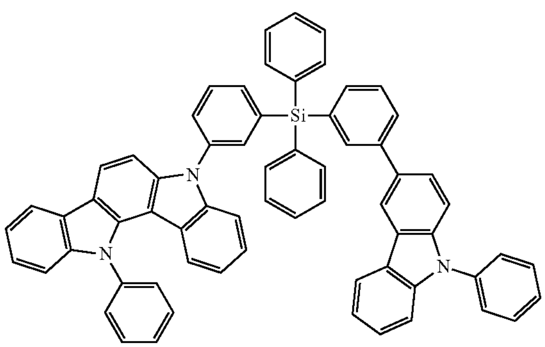
317
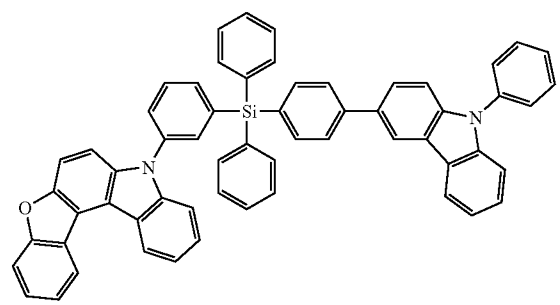
318
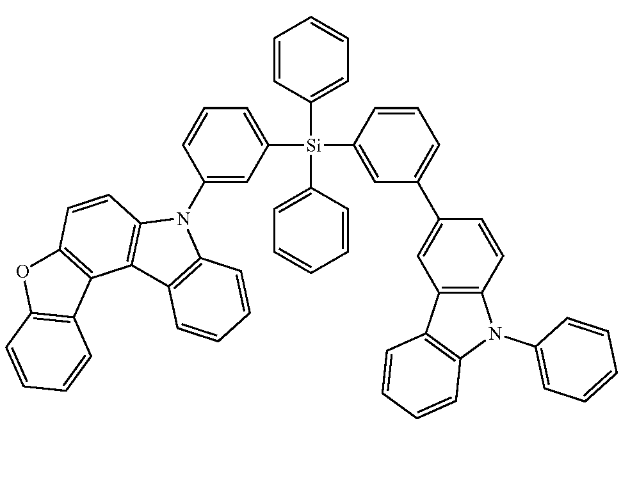

-continued
319
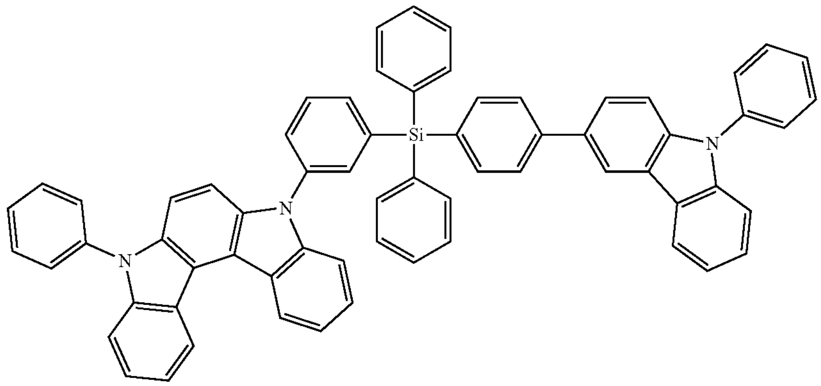
320
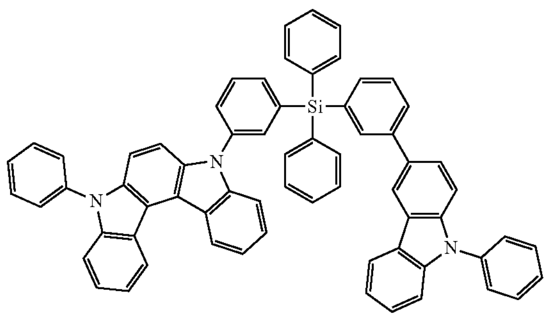
321
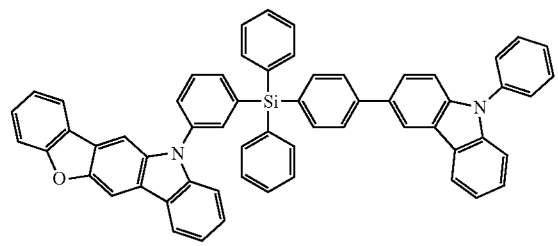
322
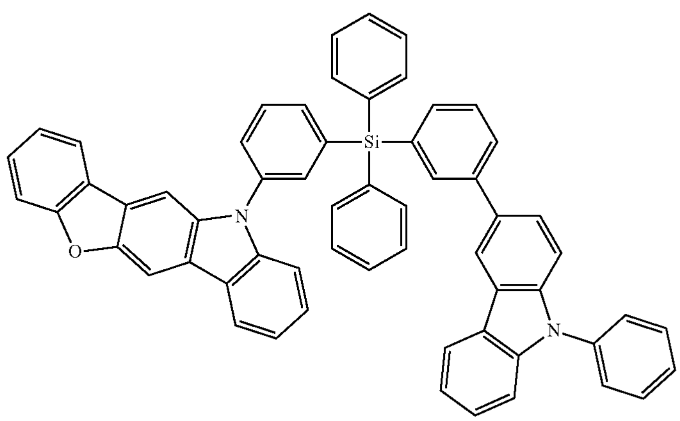
323
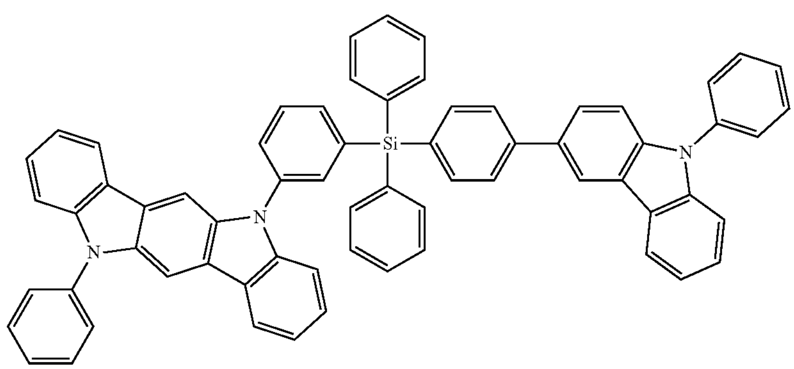

-continued
324
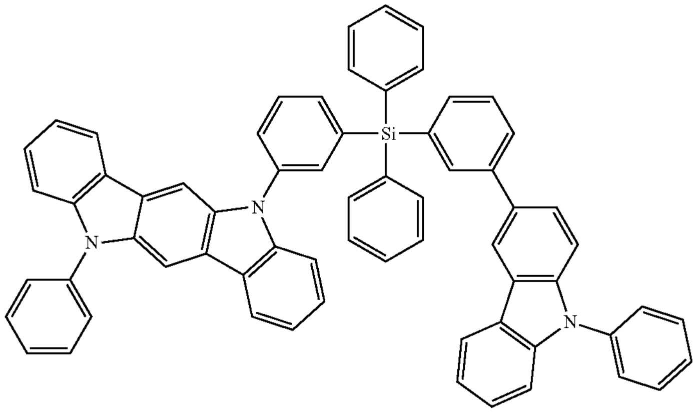
325
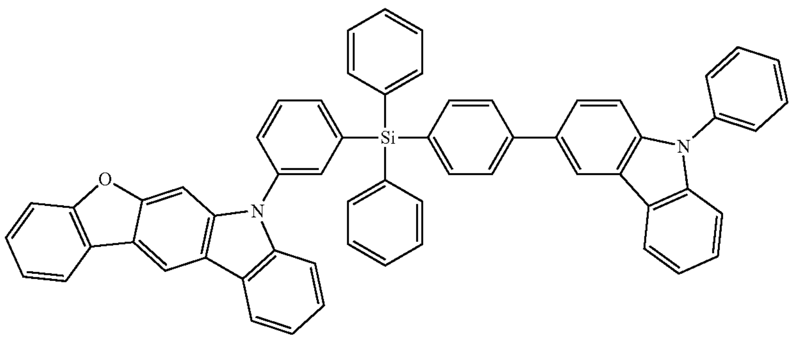
326
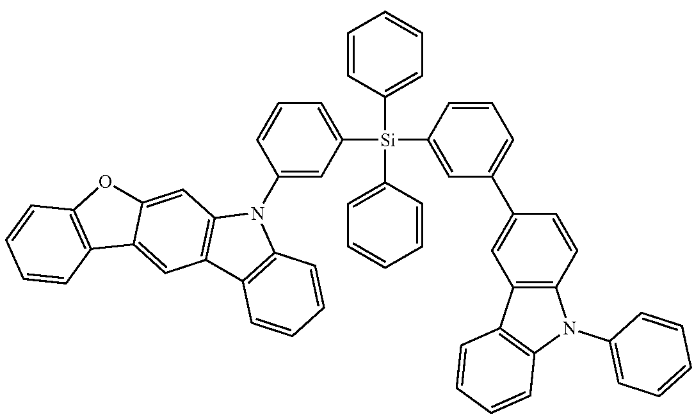
327
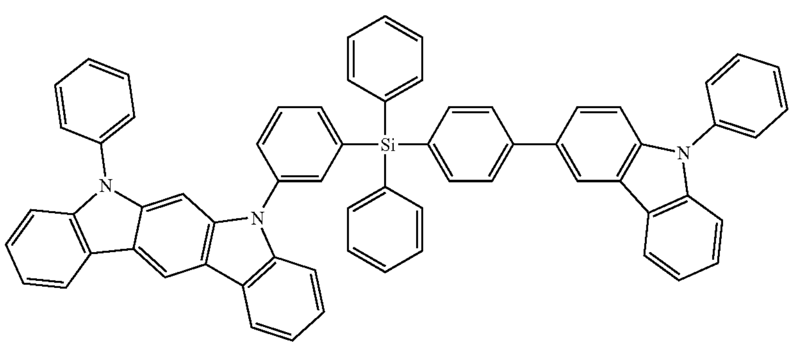

-continued
328
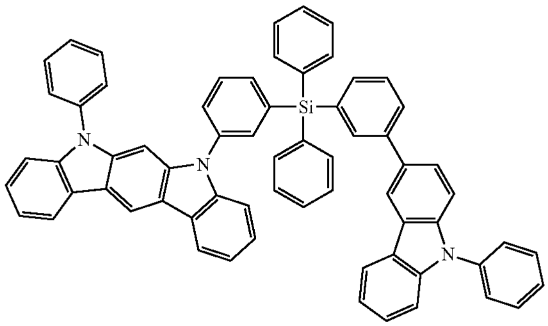
329
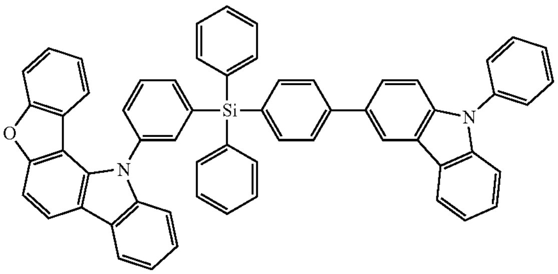
330
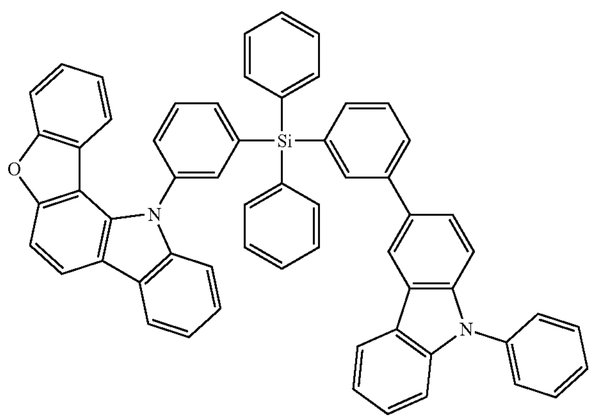
331
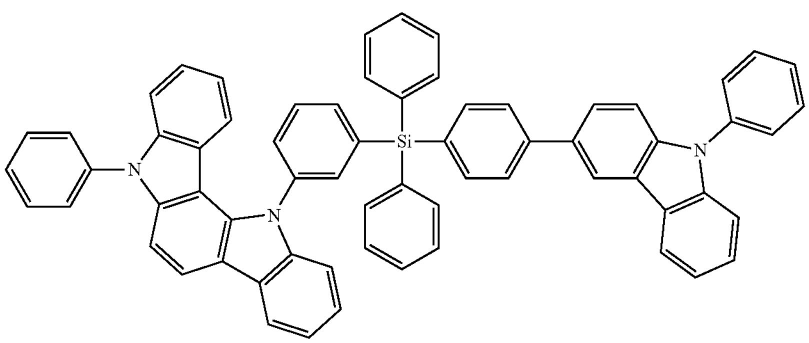
332
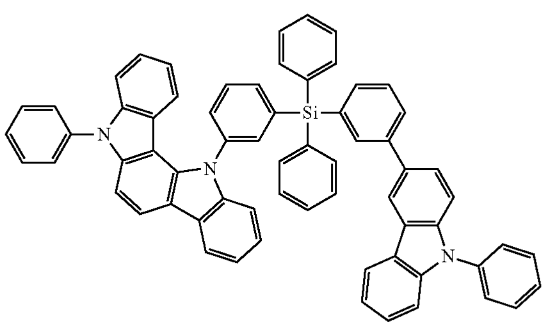
333
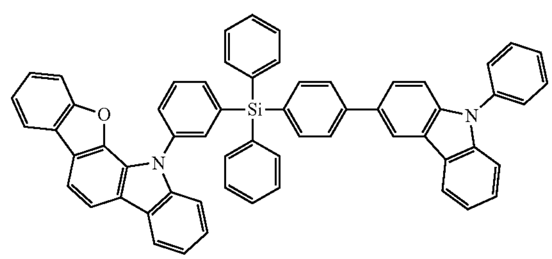

-continued
334
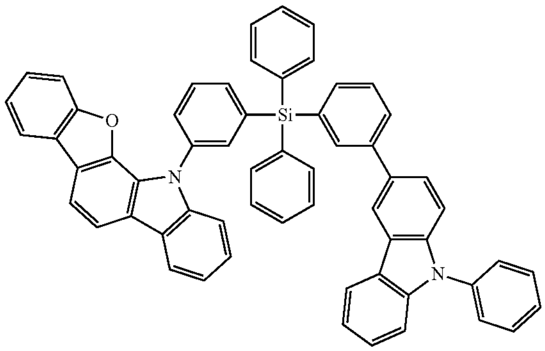
335
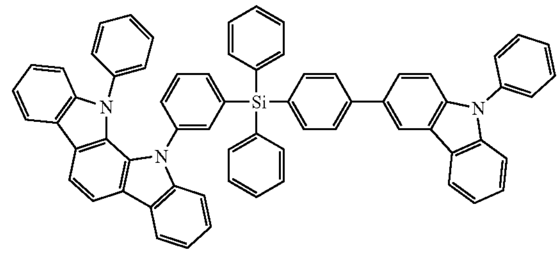
336
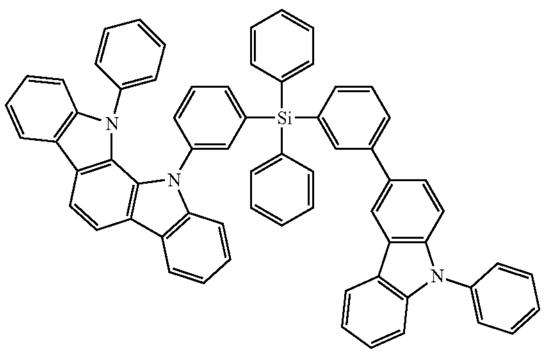
337
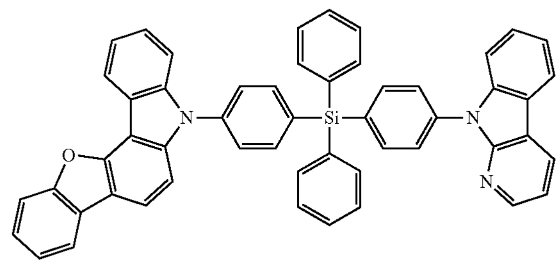
338
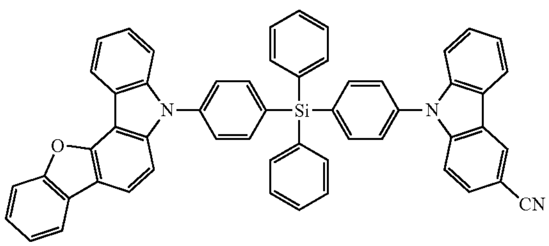
339
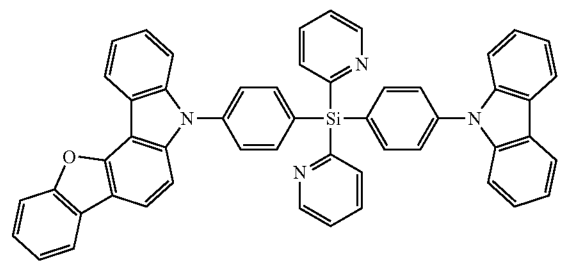
340
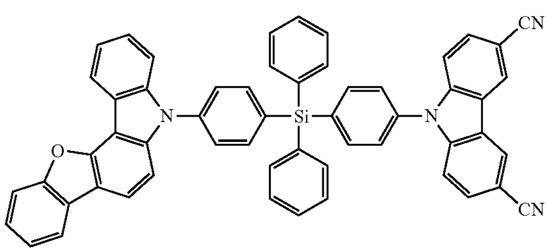
341
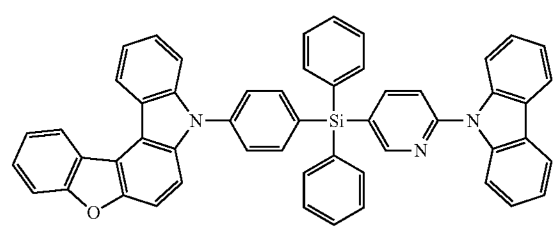
342
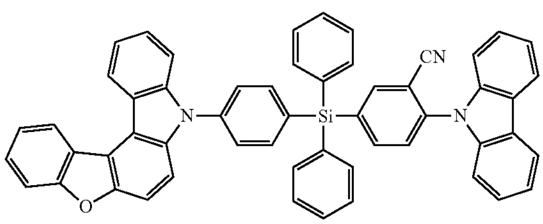
343
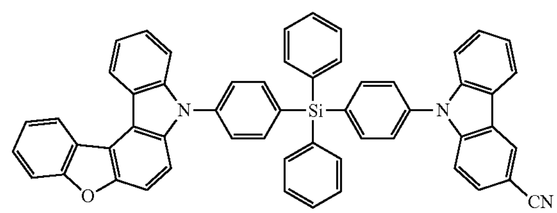

-continued
344
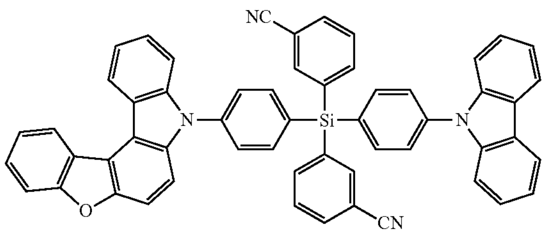
345
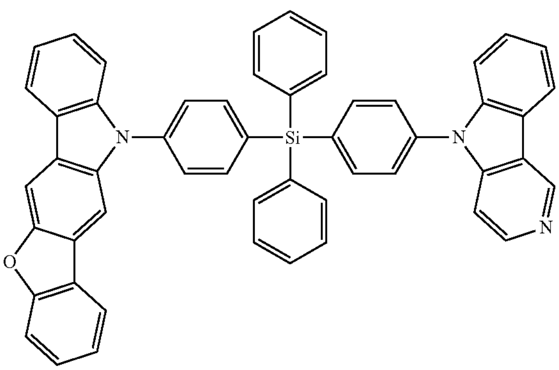
346
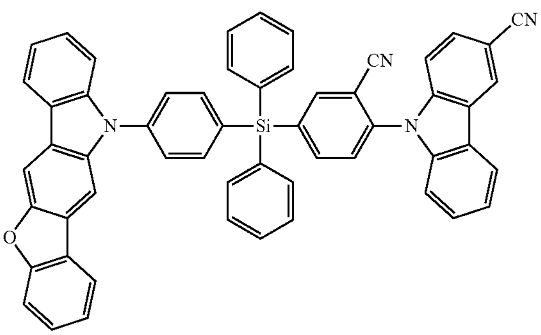
347
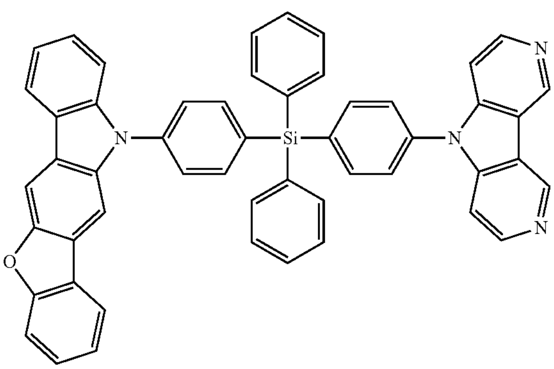
348
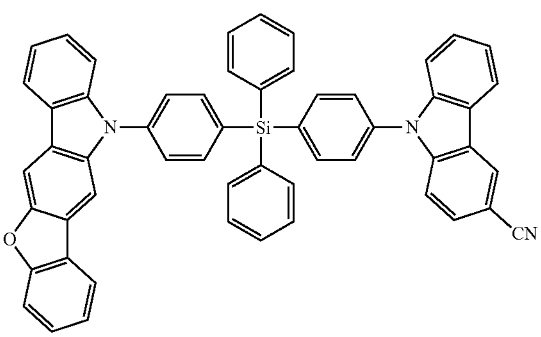
349
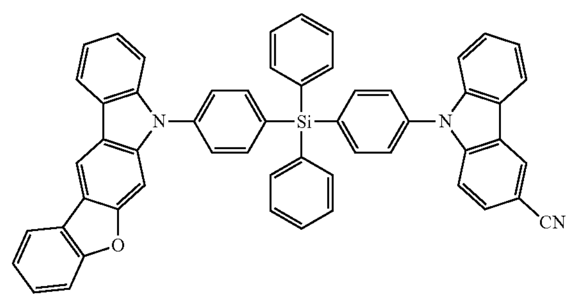
350
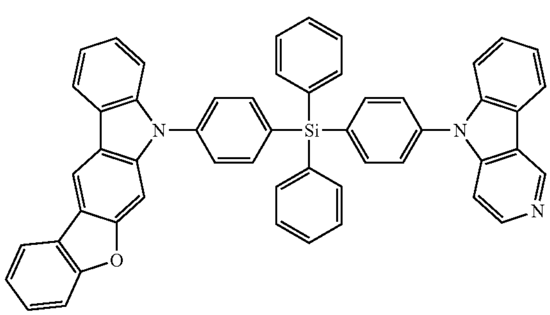
351
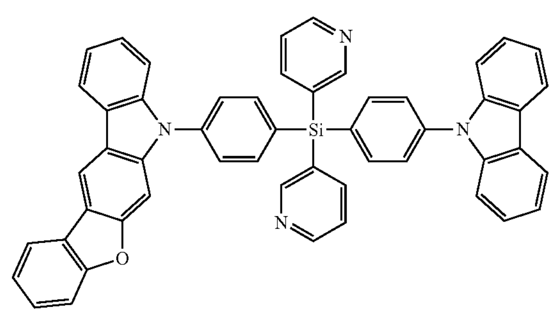

-continued
352
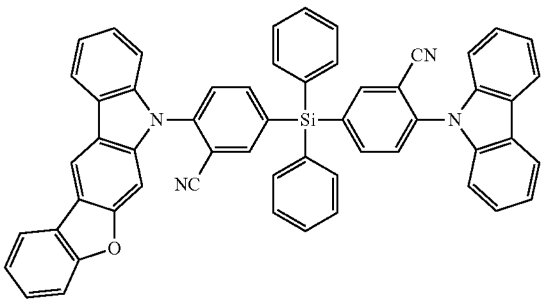
353
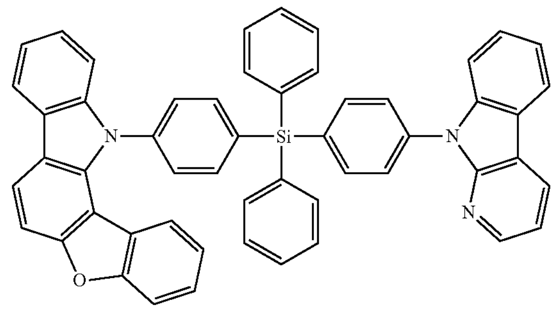
354
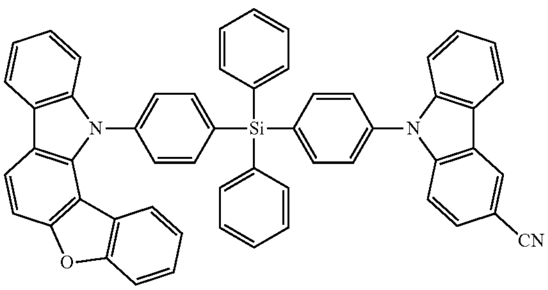
355
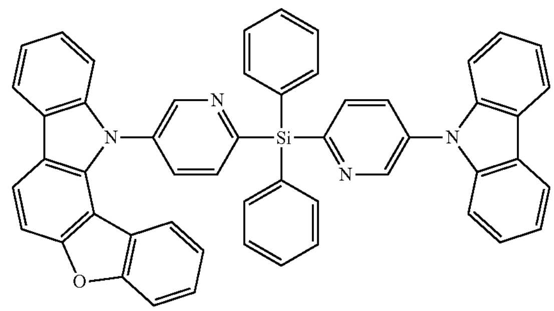
356
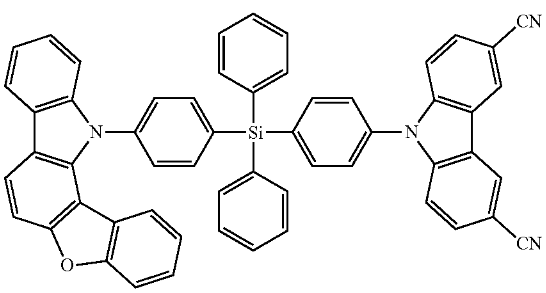
357
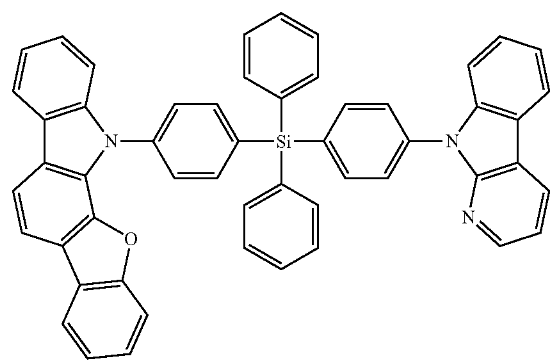
358
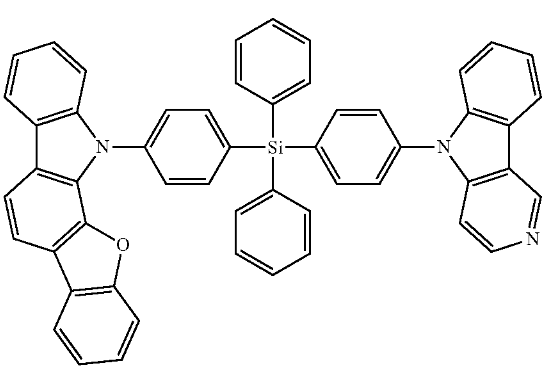
359
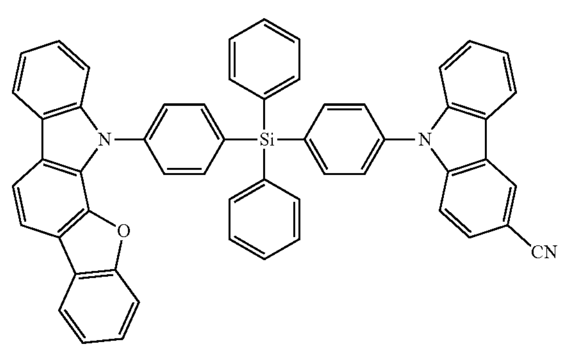

-continued
360
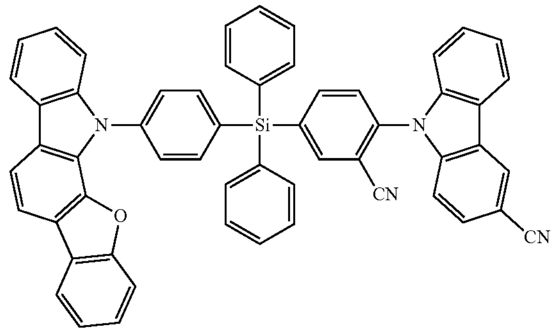
361
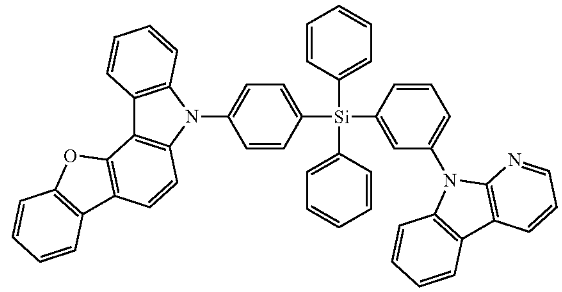
362
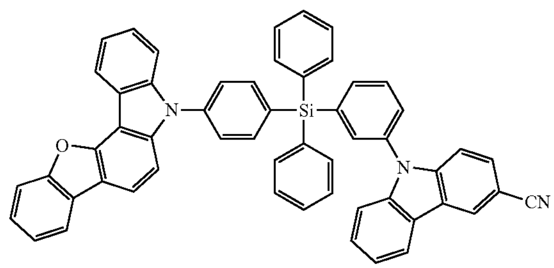
363
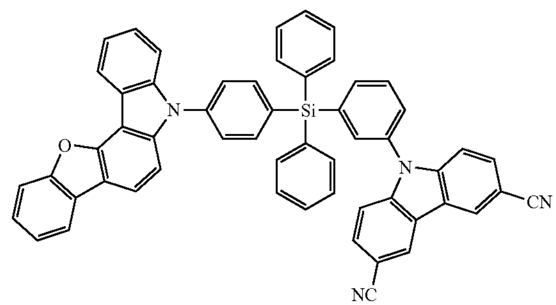
364
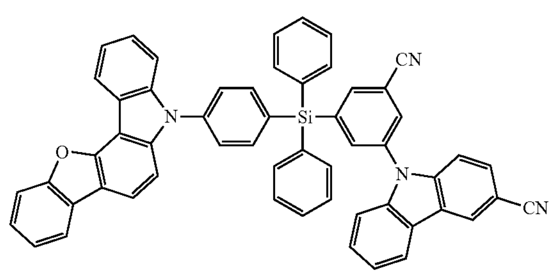
365
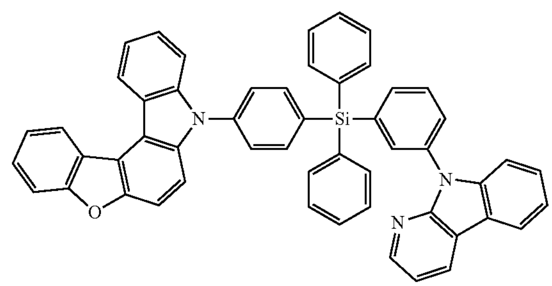
366
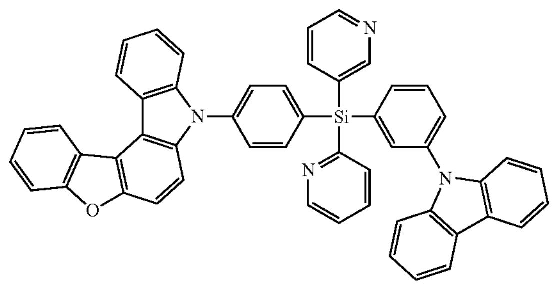
367
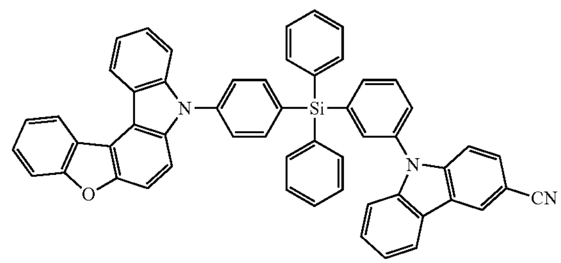

-continued
368
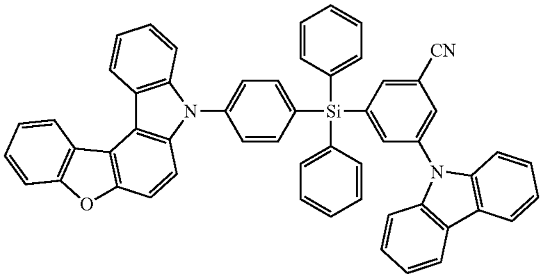
369
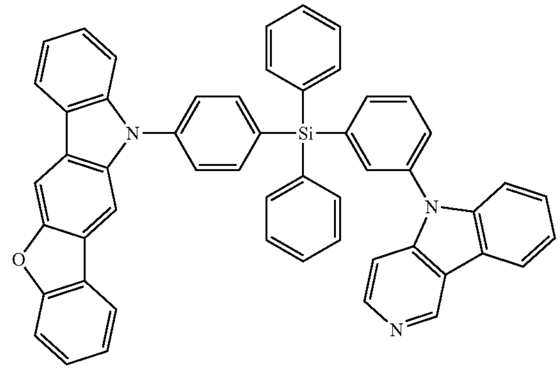
370
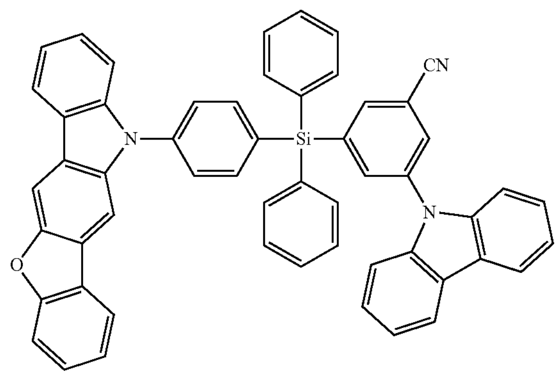
371
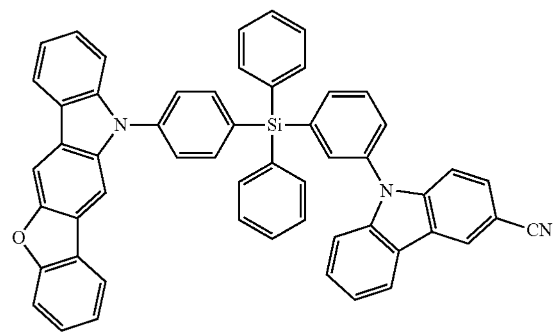
372
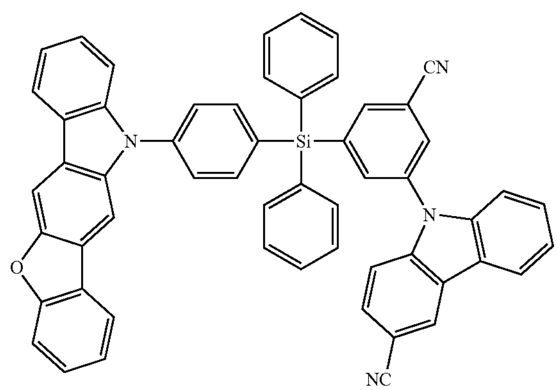
373
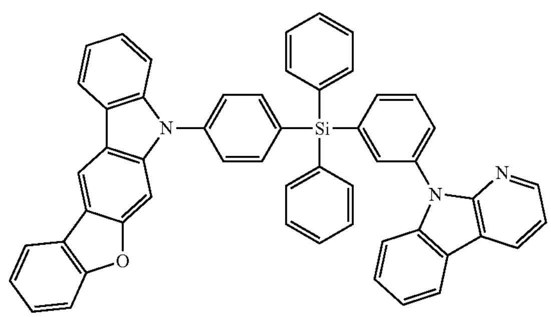
374
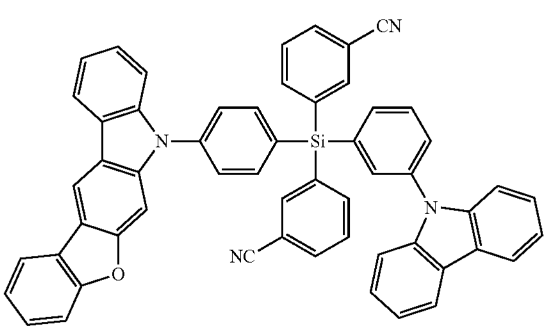
375
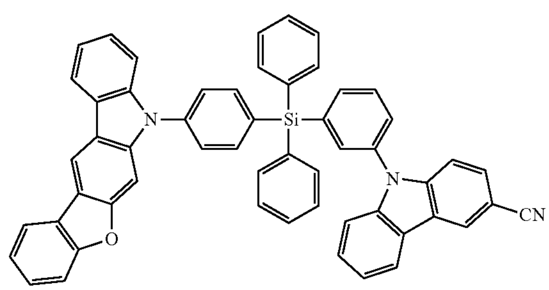

-continued
376
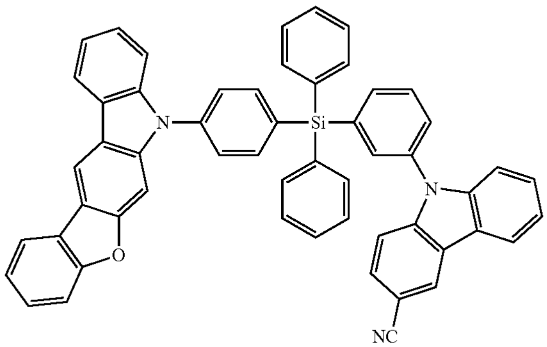
377
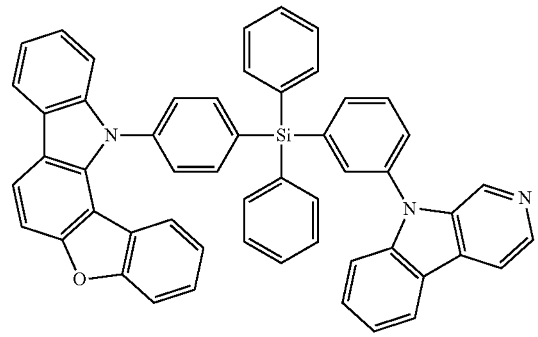
378
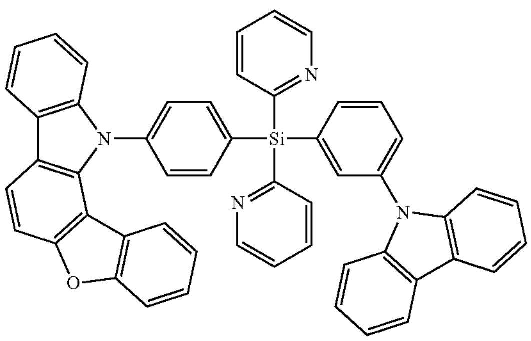
379
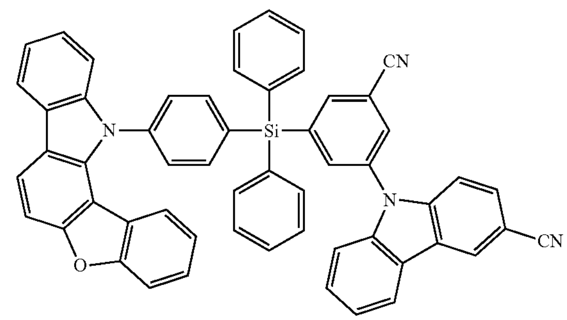
380
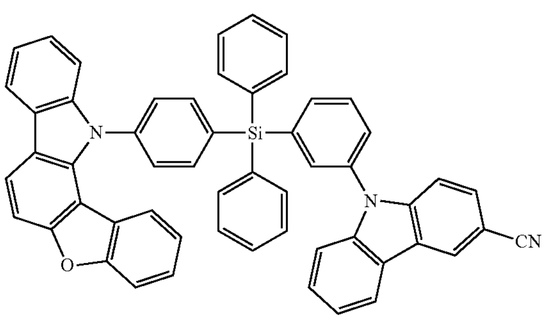
381
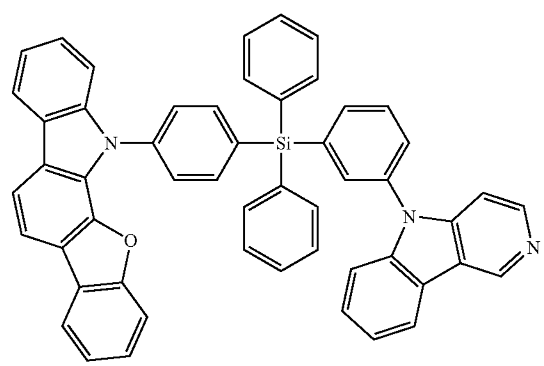
382
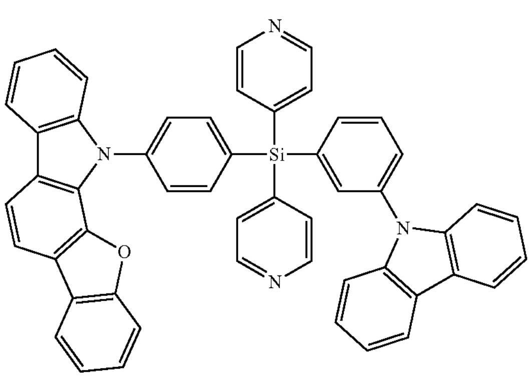
383
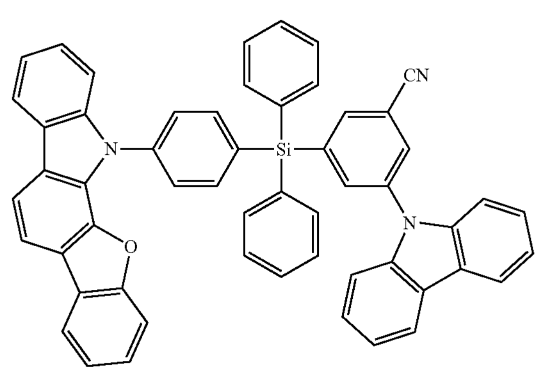

-continued
384
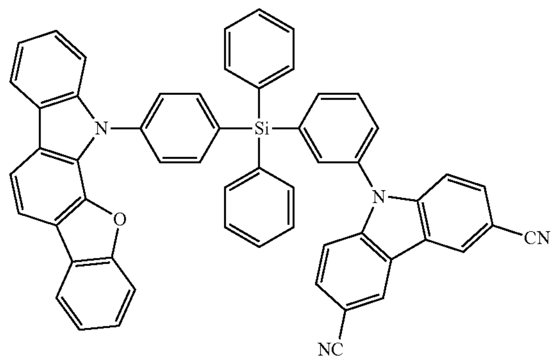
385
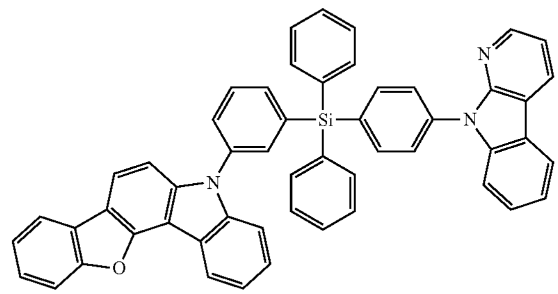
386
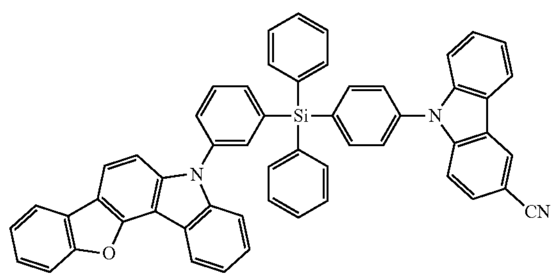
387
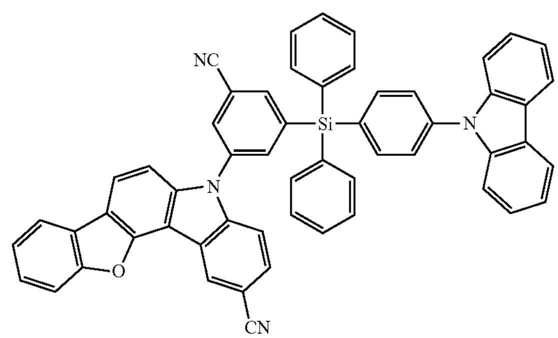
388
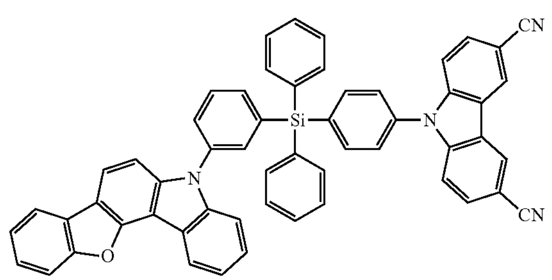
389
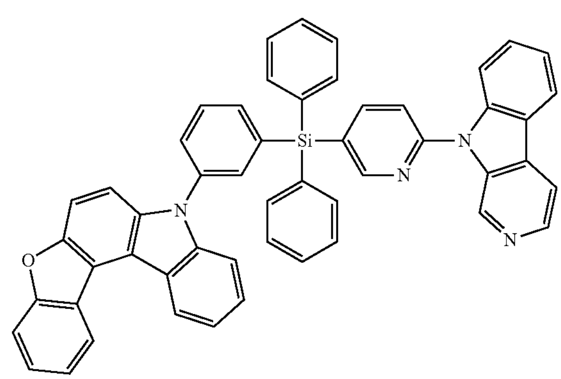
390
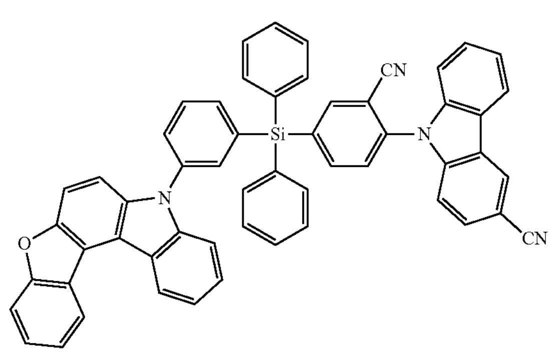
391
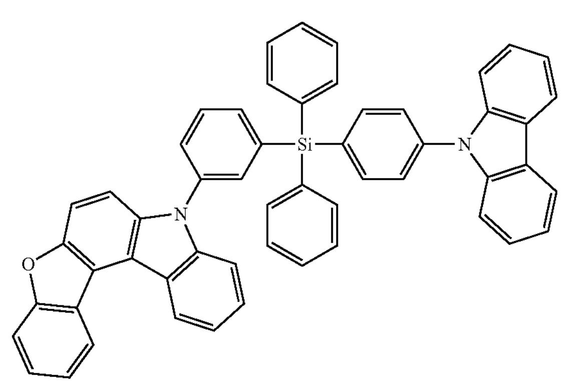

-continued
392
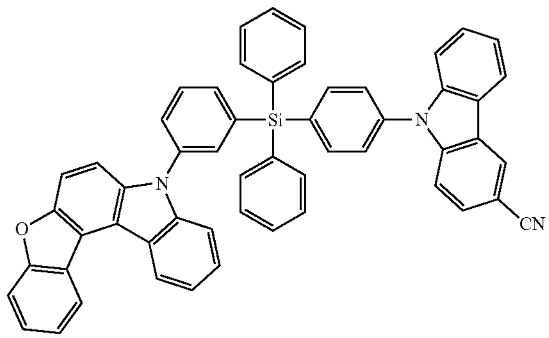
393
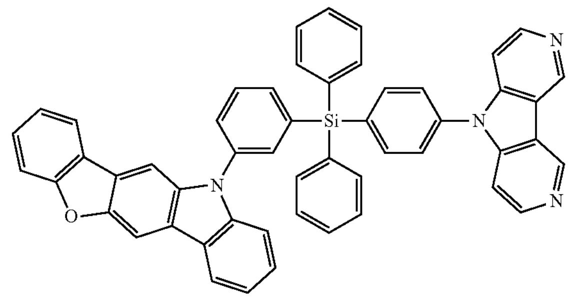
394
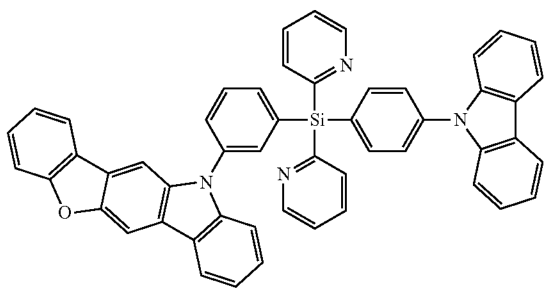
395
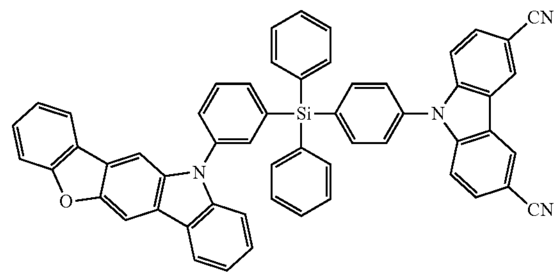
396
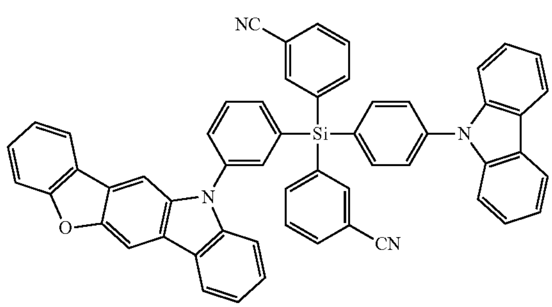
397
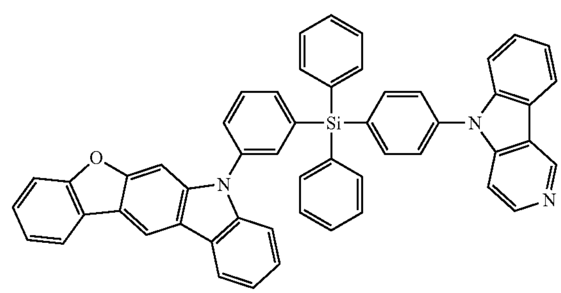
398
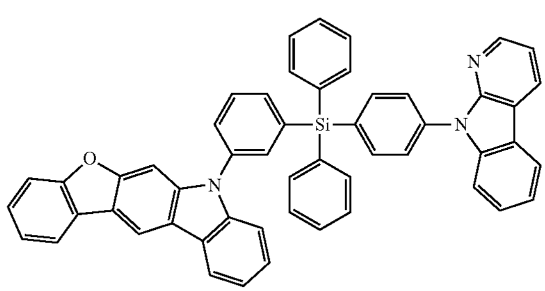
399
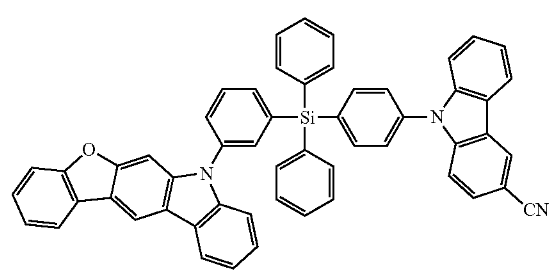

-continued
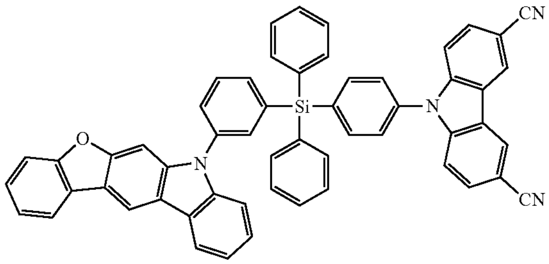
400
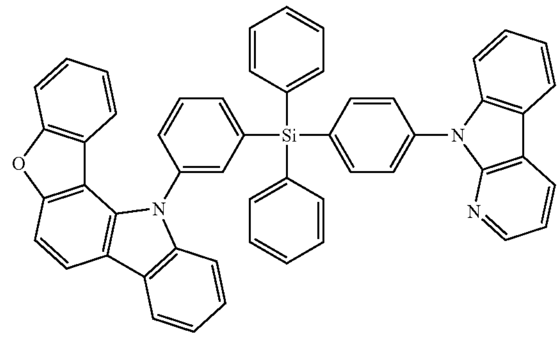
401
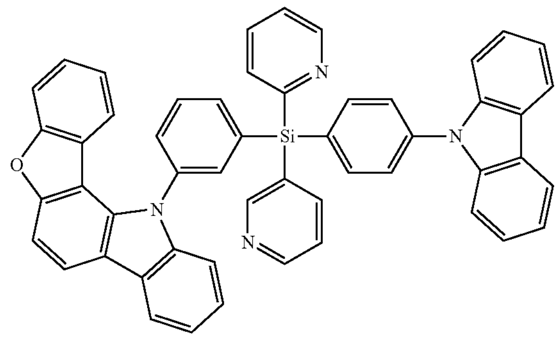
402
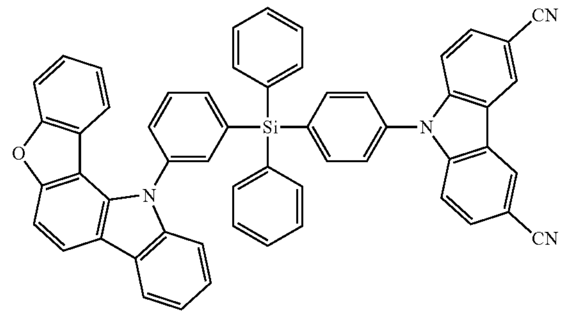
403
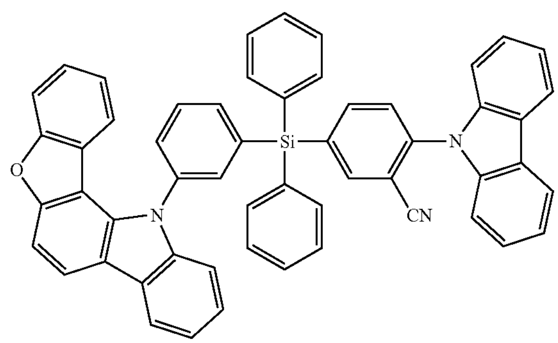
404
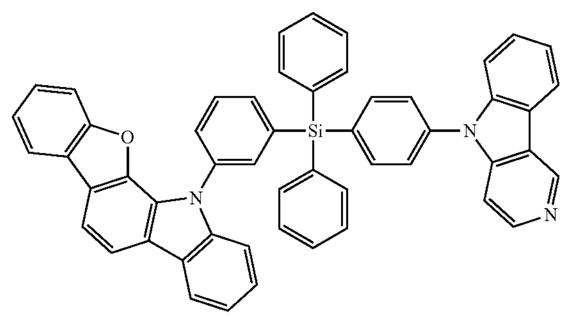
405
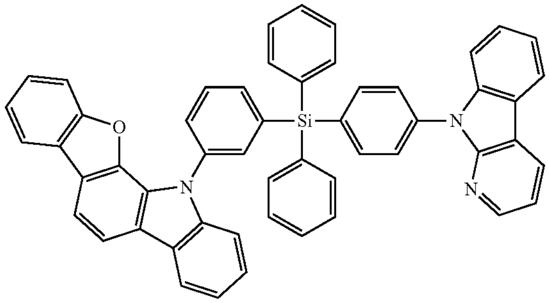
406
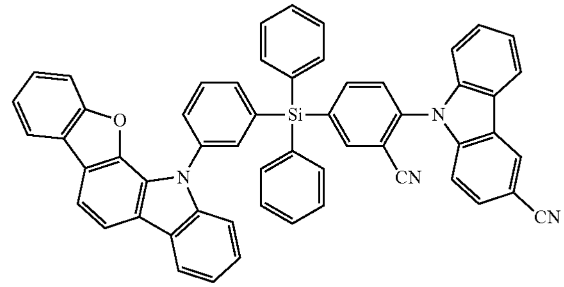
407

-continued
408
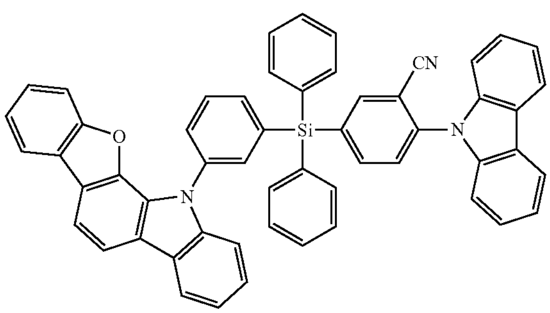
409
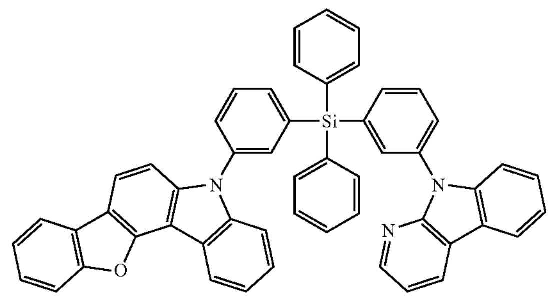
410
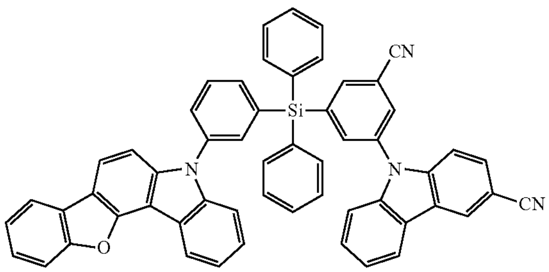
411
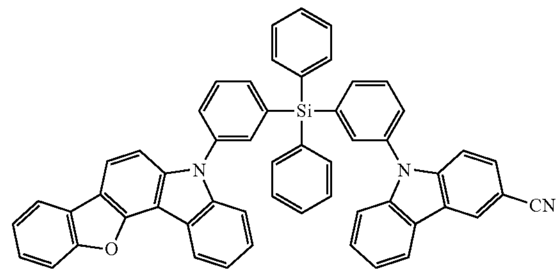
412
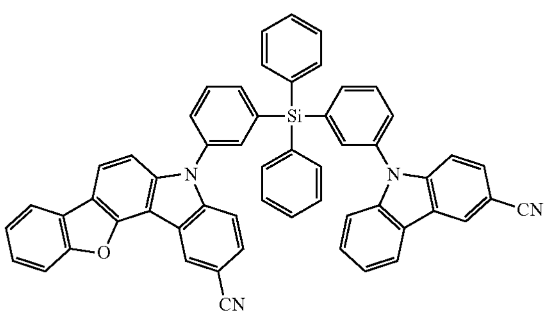
413
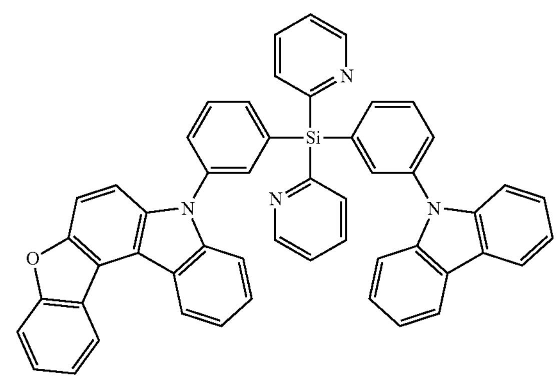
414
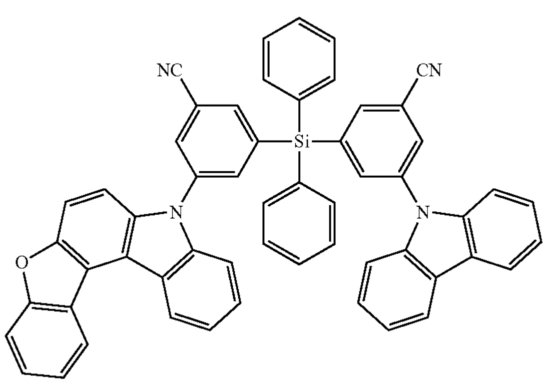
415
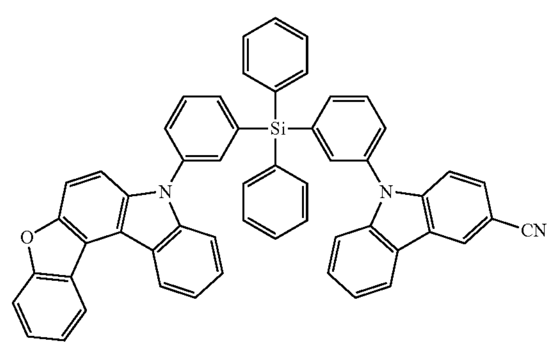

-continued
416
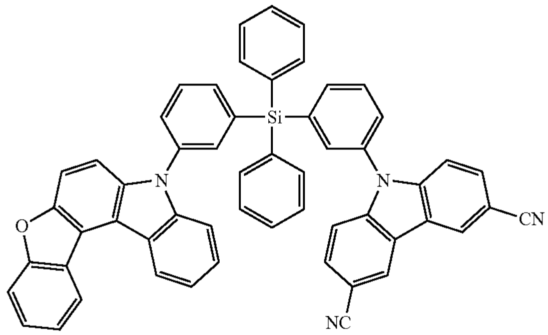
417
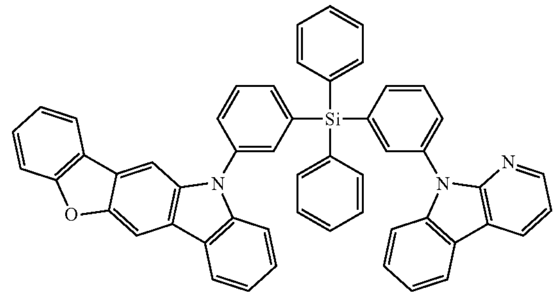
418
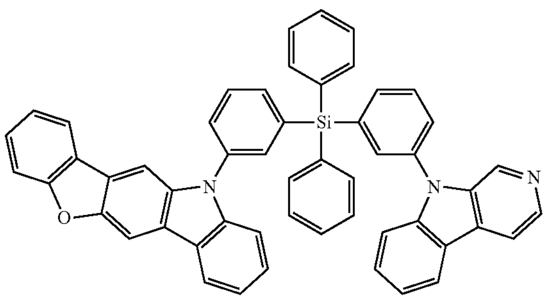
419
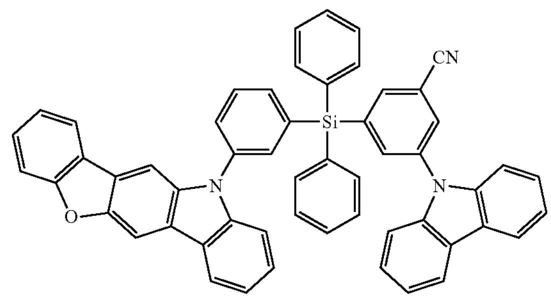
420
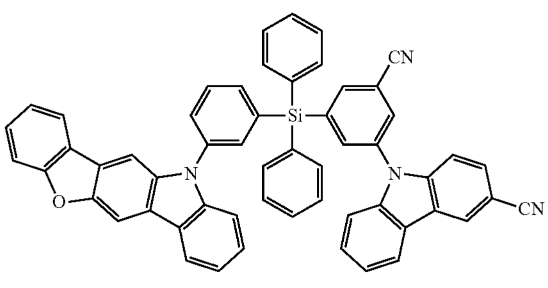
421
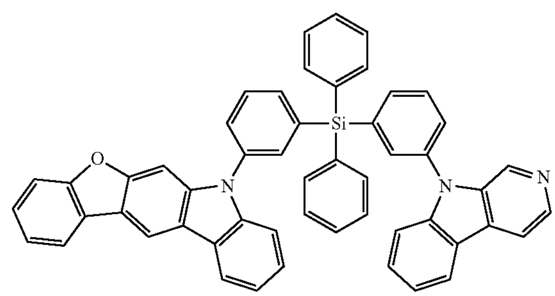
422
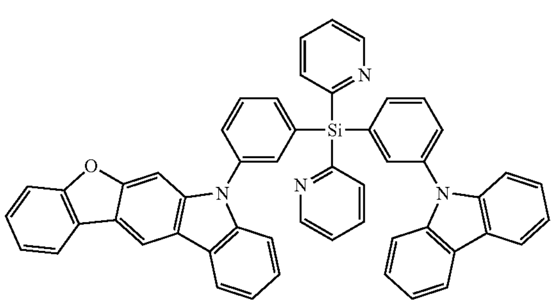
423
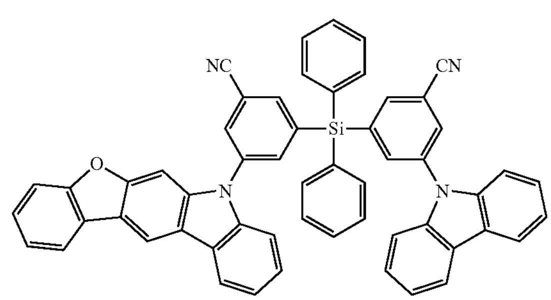

-continued
424
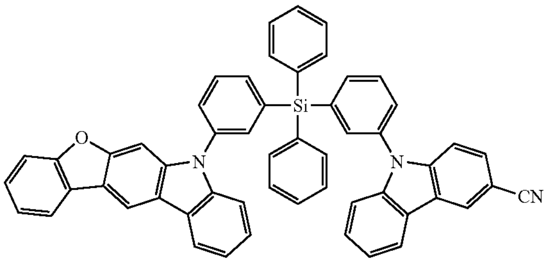
425
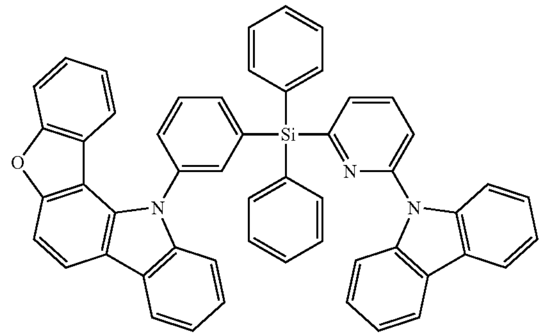
426
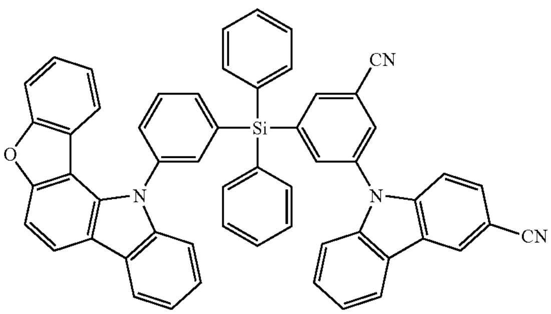
427
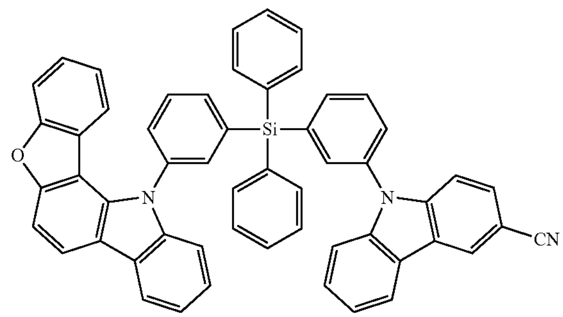
428
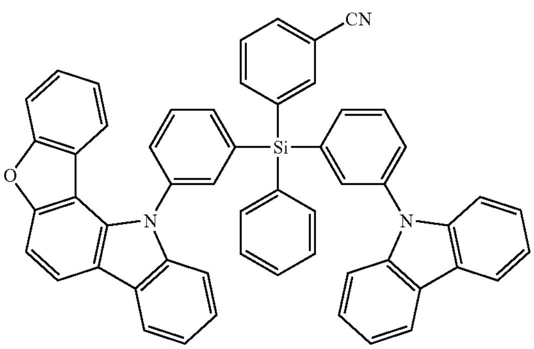
429
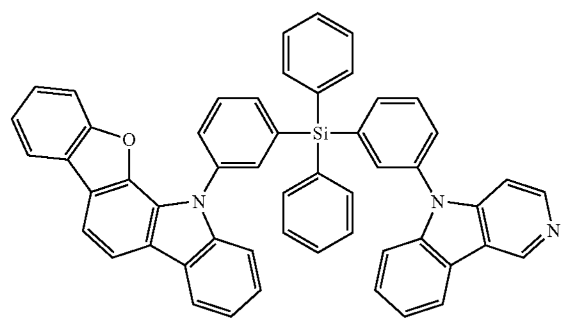
430
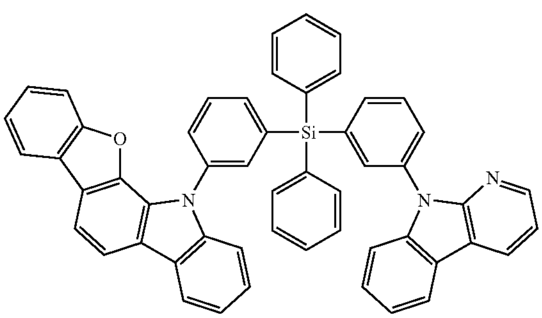
431
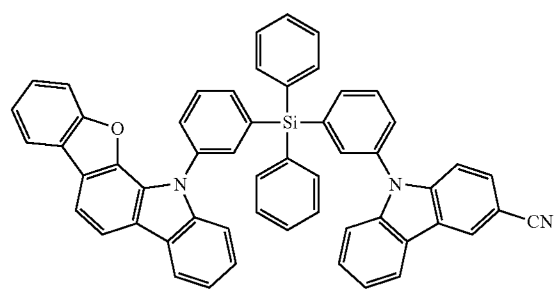

-continued

432

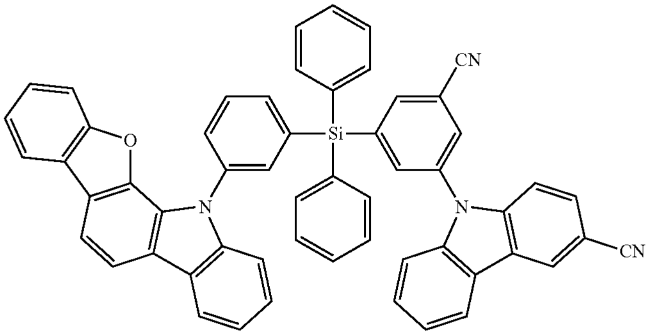

In Compound 1 to 432,

Ph is a phenyl group.

When the host is a mixture of an electron transport host and a hole transport host, the weight ratio of the electron transport host to the hole transport host may be 1:9 to 9:1, for example, 2:8 to 8:2, for example, 4:6 to 6:4, for example, 5:5. When the weight ratio of the electron transport host to the hole transport host satisfies the above-described ranges, the hole-and-electron transport balance in the emission layer may be achieved.

In an embodiment, the host may include at least one of TPBi, TBADN, ADN (also referred to as "DNA"), CBP, CDBP, TCP, mCP, or Compounds H50 to H52:

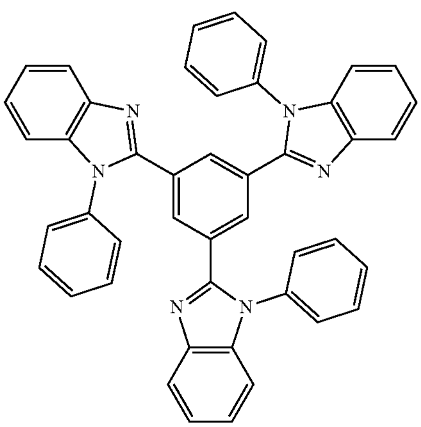

TPBi

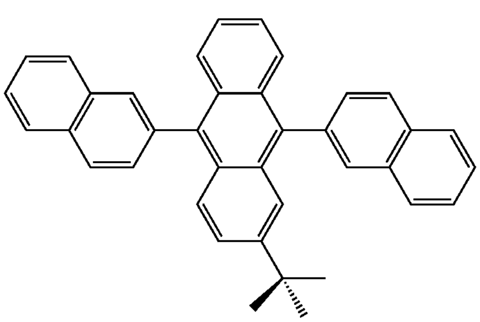

TBADN

-continued

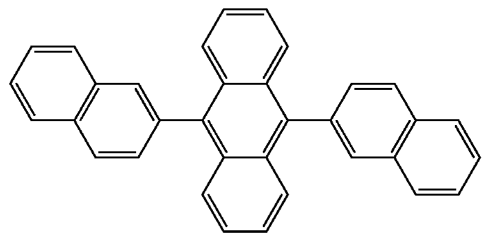

ADN

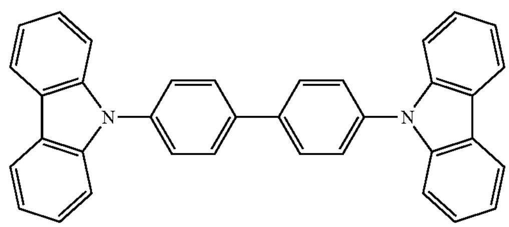

CBP

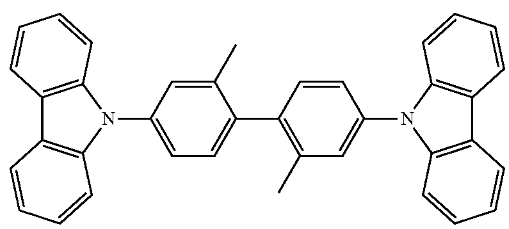

CDBP

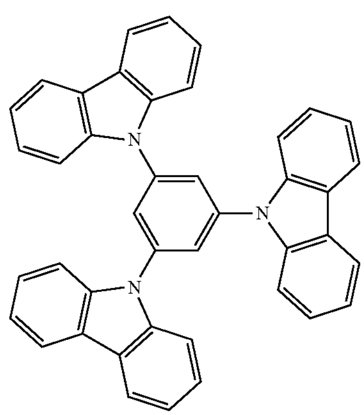

TCP

-continued

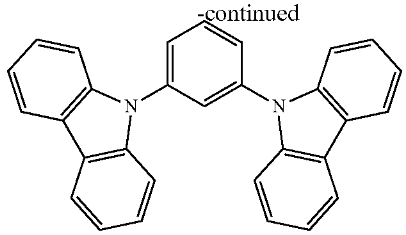

mCP

H50

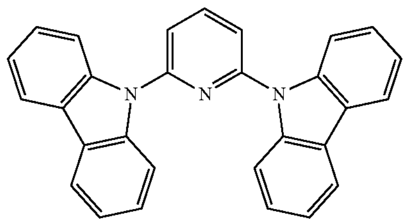

H51

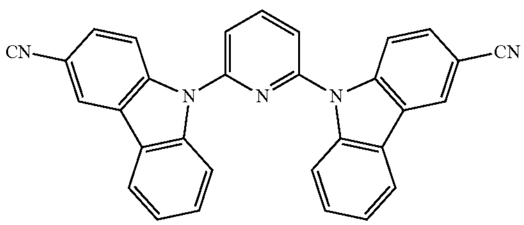

H52

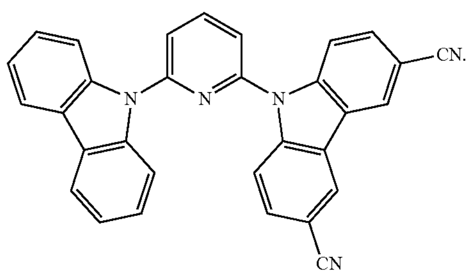

In an embodiment, the host may further include a compound represented by Formula 301 below:

Formula 301

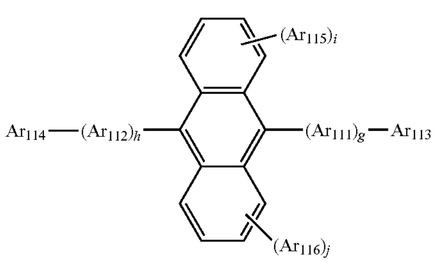

In Formula 301, $Ar_{111}$ and $Ar_{112}$ may each independently be:

a phenylene group, a naphthylene group, a phenanthrenylene group, or a pyrenylene group; or a phenylene group, a naphthylene group, a phenanthrenylene group, or a pyrenylene group, each independently substituted with at least one of a phenyl group, a naphthyl group, or an anthracenyl group.

$Ar_{113}$ to $Ar_{116}$ in Formula 301 may each independently be:

a $C_1$-$C_{10}$ alkyl group, a phenyl group, a naphthyl group, a phenanthrenyl group, or a pyrenyl group; or a phenyl group, a naphthyl group, a phenanthrenyl group, or a pyrenyl group, each independently substituted with at least one of a phenyl group, a naphthyl group, or an anthracenyl group.

g, h, i, and j in Formula 301 may each independently be an integer from 0 to 4, for example, 0, 1, or 2.

In Formula 301, $Ar_{113}$ to $Ar_{116}$ may each independently be:

a $C_1$-$C_{10}$ alkyl group substituted with at least one of a phenyl group, a naphthyl group, or an anthracenyl group;

a phenyl group, a naphthyl group, an anthracenyl group, a pyrenyl group, a phenanthrenyl group, or a fluorenyl group;

a phenyl group, a naphthyl group, an anthracenyl group, a pyrenyl group, a phenanthrenyl group, or a fluorenyl group, each independently substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a phenyl group, a naphthyl group, an anthracenyl group, a pyrenyl group, a phenanthrenyl group, or a fluorenyl group; or

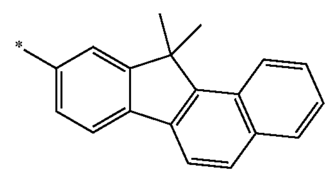

but embodiments of the present disclosure are not limited thereto.

In an embodiment, the host may include a compound represented by Formula 302:

Formula 302

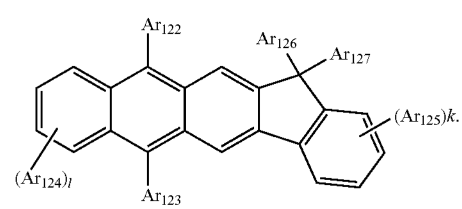

Detailed descriptions of $Ar_{122}$ to $Ar_{125}$ in Formula 302 are the same as described in connection with $Ar_{113}$ in Formula 301.

$Ar_{126}$ and $Ar_{127}$ in Formula 302 may each independently be a $C_1$-$C_{10}$ alkyl group (for example, a methyl group, an ethyl group, or a propyl group).

k and l in Formula 302 may each independently be an integer from 0 to 4. In an embodiment, k and l may be 0, 1, or 2.

When the organic light-emitting device is a full-color organic light-emitting device, emission layer may be patterned into a red emission layer, a green emission layer, and a blue emission layer. In an embodiment, the emission layer may have a structure in which the red emission layer, the green emission layer, and/or the blue emission layer are stacked, the emission layer may emit white light, and various modifications are possible.

When the emission layer includes a host and a light-emitting dopant, an amount of the light-emitting dopant may be from about 0.01 parts by weight to about 15 parts by weight based on about 100 parts by weight of the host, for example, about 0.01 parts by weight to about 12 parts by weight, about 0.01 parts by weight to about 10 parts by weight, about 0.01 parts by weight to about 8 parts by weight, about 0.01 parts by weight to about 6 parts by weight, about 0.01 parts by weight to about 4 parts by weight, or about 0.01 parts by weight to about 2 parts by weight based on 100 parts by weight of the host, but embodiments of the present disclosure are not limited thereto.

A thickness of the emission layer may be in a range of about 100 Å to about 1,000 Å, for example, about 200 Å to about 600 Å, for example, about 100 Å to about 800 Å, about 200 Å to about 600 Å, or about 300 Å to about 400 Å. When the thickness of the emission layer is within these ranges, improved light-emission characteristics may be obtained without a substantial increase in driving voltage.

In the emission layer of the organic light-emitting device, the first dopant compound may include an organometallic compound including a transition metal.

The first dopant compound may include a polycyclic compound represented by Formula 1.

In an embodiment, the first dopant compound may include an organometallic compound including at least one a first-row transition metal of the Periodic Table of Elements, a second-row transition metal of the Periodic Table of Elements, or a third-row transition metal of the Periodic Table of Elements.

In an embodiment, the first dopant compound may include an organic ligand ($L_1$) and at least one metal ($M_{11}$) a first-row transition metal of the Periodic Table of Elements, a second-row transition metal of the Periodic Table of Elements, or a third-row transition metal of the Periodic Table of Elements, and $L_1$ and $M_{11}$ may form one cyclometallated ring, two cyclometallated rings, three cyclometallated rings, or four cyclometallated rings.

In an embodiment, the first dopant compound may include an organometallic compound represented by Formula 101 below:

$$M_{11}(L_1)_{n1}(L_2)_{n2} \quad \text{Formula 101}$$

In Formula 101, $M_{11}$ may be a first-row transition metal of the Periodic Table of Elements, a second-row transition metal of the Periodic Table of Elements, or a third-row transition metal of the Periodic Table of Elements, $L_1$ may be a ligand represented by one of Formulae 10-1 to 10-4, $L_2$ may be a monodentate ligand or a bidentate ligand, n1 may be 1, and n2 may be 0, 1, or 2, and 10-1

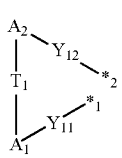

-continued 10-2

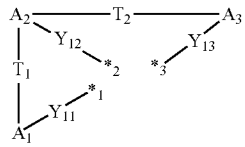

10-3

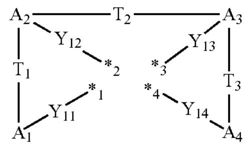

10-4

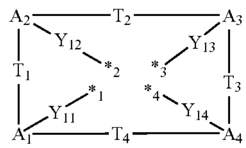

wherein, in Formulae 10-1 to 10-4, $A_1$ to $A_4$ may each independently be a substituted or unsubstituted $C_5$-$C_{30}$ carbocyclic group, a substituted or unsubstituted $C_1$-$C_{30}$ heterocyclic group, or a non-cyclic group, $Y_{11}$ to $Y_{14}$ may each independently be a chemical bond, O, S, $N(R_{91})$, $B(R_{91})$, $P(R_{91})$, or $C(R_{91})(R_{92})$, $T_1$ to $T_4$ may each independently be a single bond, a double bond, *—$N(R_{93})$—*', * $B(R_{93})$—*', *—$P(R_{93})$—*', *—$C(R_{93})(R_{94})$—*', *—$Si(R_{93})(R_{94})$—*', *—$Ge(R_{93})(R_{94})$—*', *—S—*', *—Se—*', *—O—*' *—C(=O)—*', *—S(=O)—*', *—$S(=O)_2$—*', *—$C(R_{93})$=*', *=$C(R_{93})$—*', *—$C(R_{93})$=$C(R_{94})$—*', *—C(=S)—*', or *—C≡C—*', a substituent of the substituted $C_5$-$C_{30}$ carbocyclic group, a substituent of the substituted $C_1$-$C_{30}$ heterocyclic group, or $R_{91}$ to $R_{94}$ may each independently be hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, or —$P(=S)(Q_1)(Q_2)$, wherein each of the substituent of the substituted $C_5$-$C_{30}$ carbocyclic group and the substituent of the substituted $C_1$-$C_{30}$ heterocyclic group is not hydrogen, $*_1$, $*_2$, $*_3$, and $*_4$ each indicate a binding site to $M_{11}$, and $Q_1$ to $Q_3$ may each independently be hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group substituted with at least one deuterium, —F, a cyano group, a $C_1$-$C_{60}$ alkyl group, or a $C_6$-$C_{60}$ aryl group, or a $C_6$-$C_{60}$ aryl group substituted with at least one deuterium, —F, a cyano group, a $C_1$-$C_{60}$ alkyl group, or a $C_6$-$C_{60}$ aryl group.

In an embodiment, the first dopant compound may be Groups I to VI, but embodiments of the present disclosure are not limited thereto:

Group I

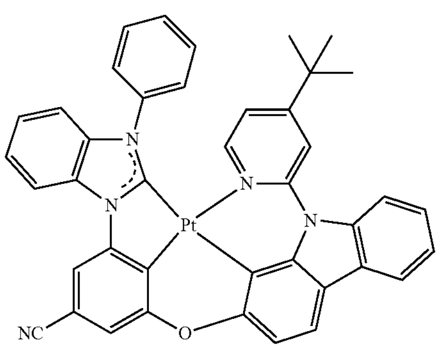

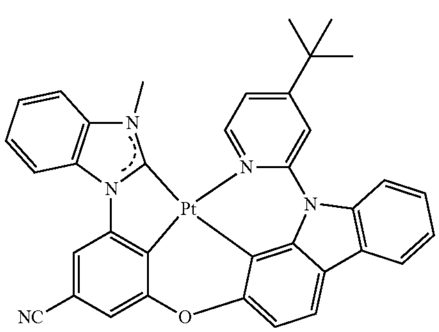

-continued

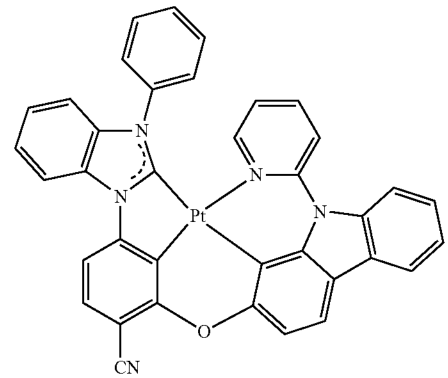

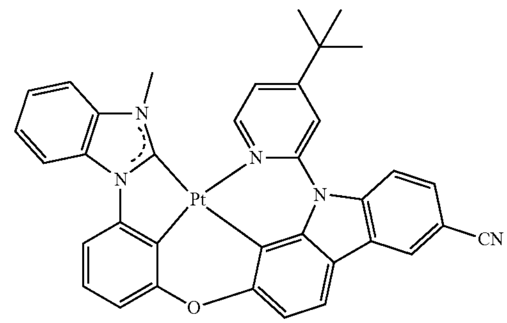

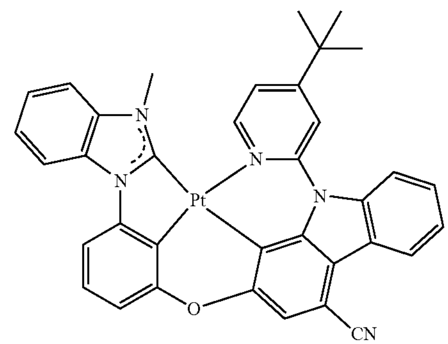

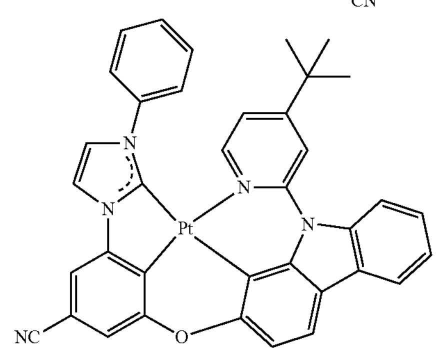

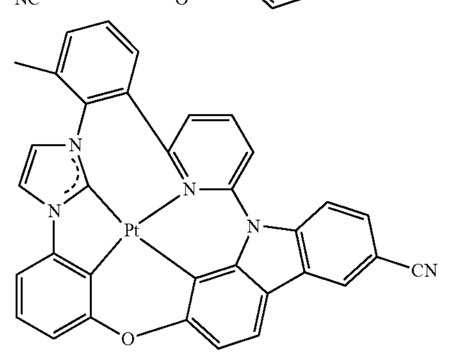

-continued
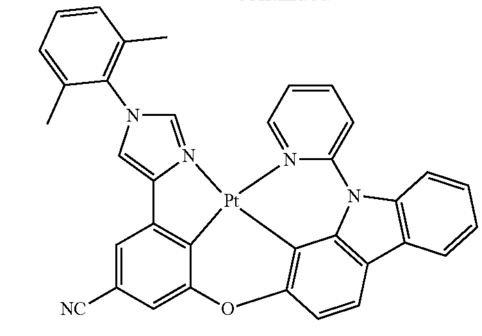
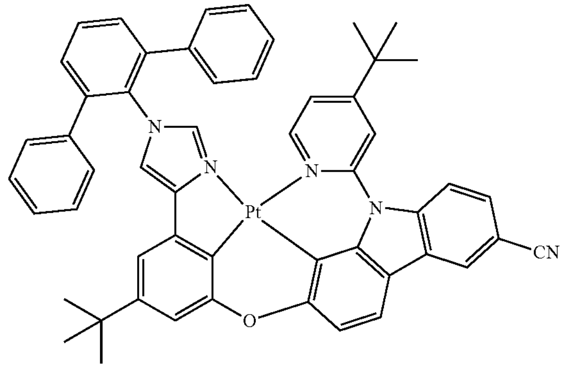
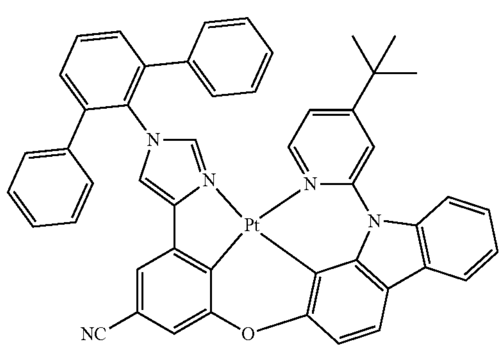
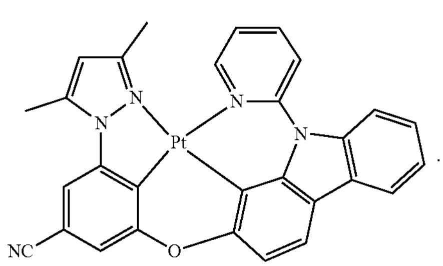
Group II
1
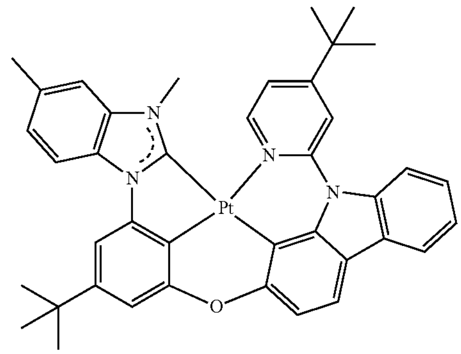
2
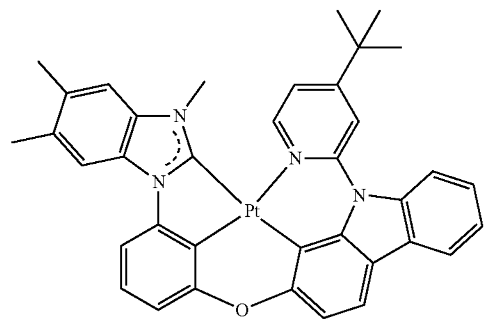
3
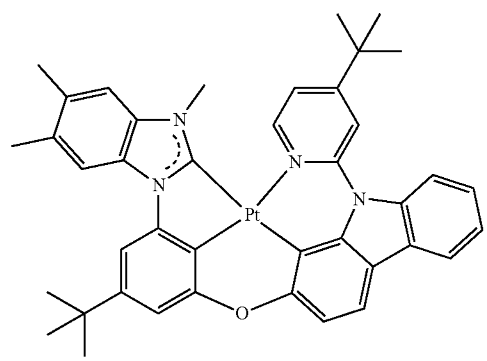
4
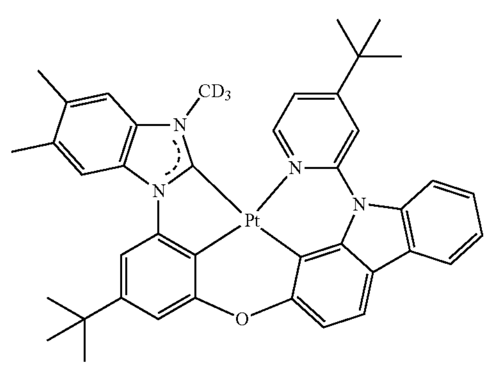

-continued
5
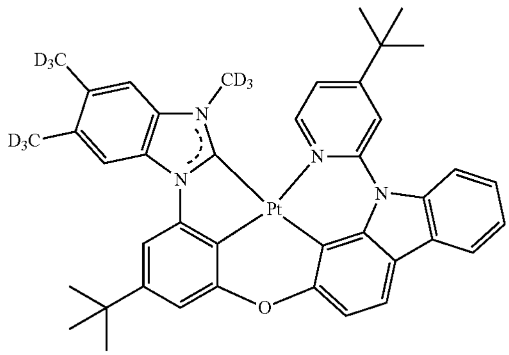
6
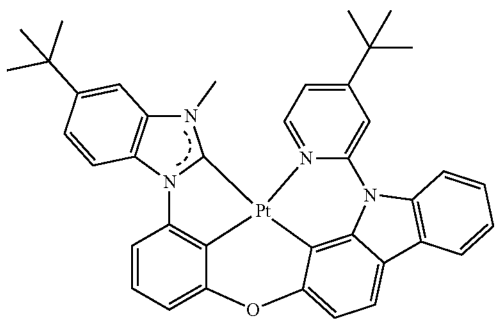
7
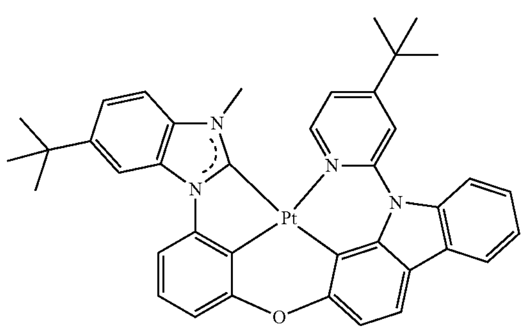
8
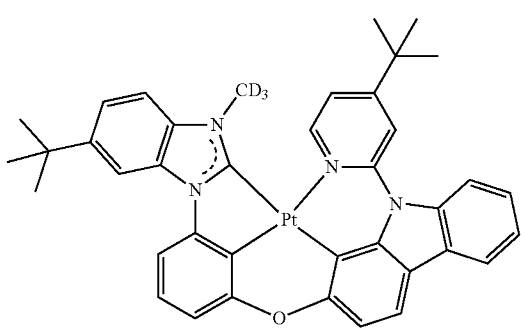
-continued
9
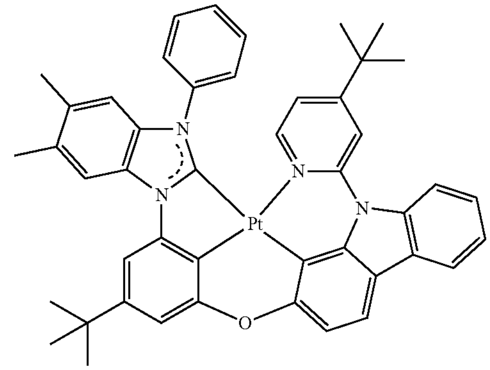
10
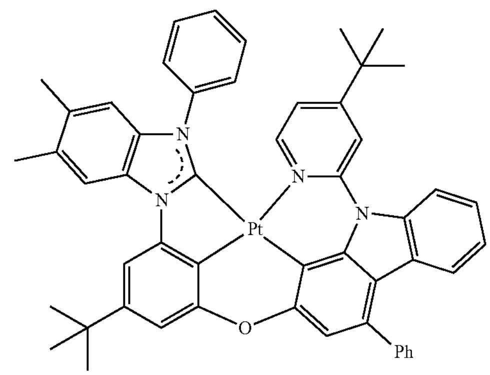
11
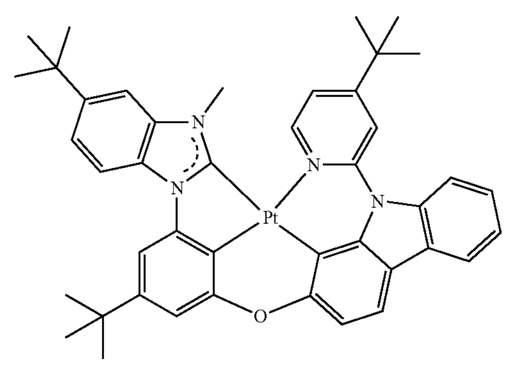
12
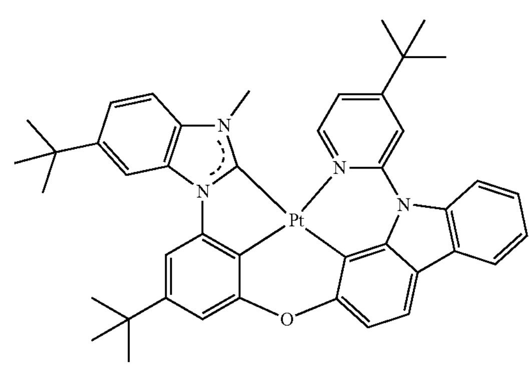

13
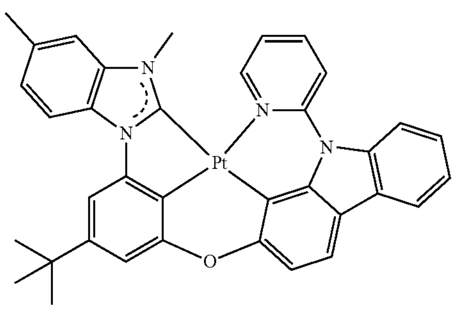
14
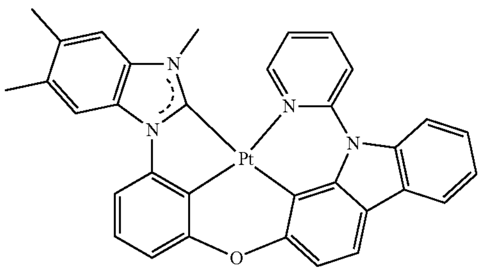
15
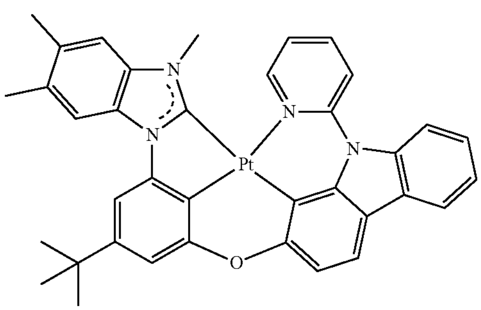
16
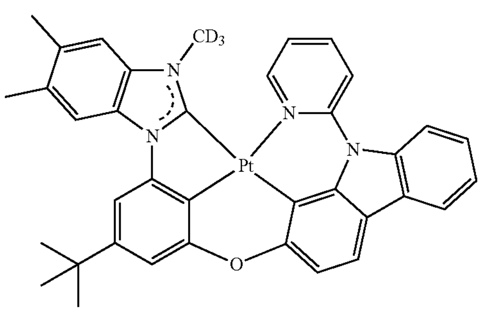
17
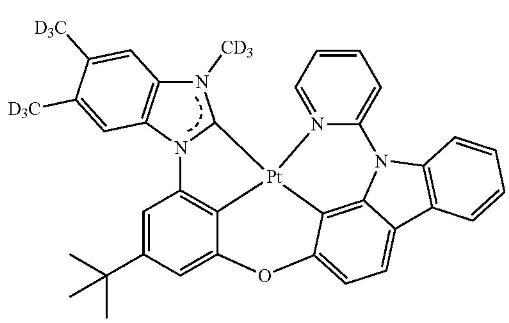
18
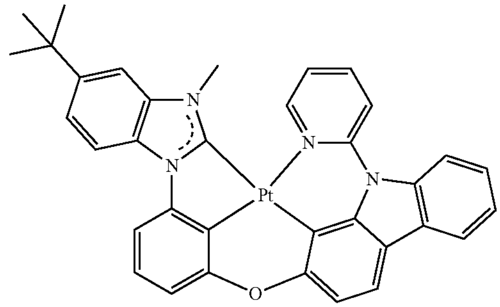
19
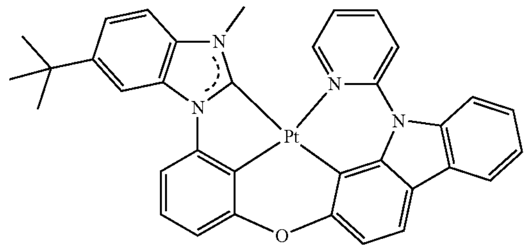
20
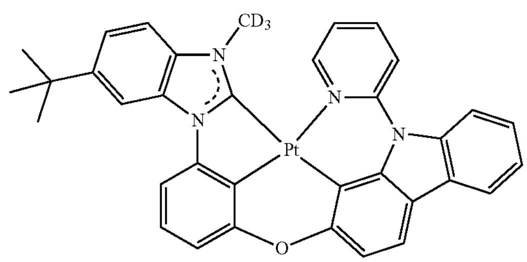
21
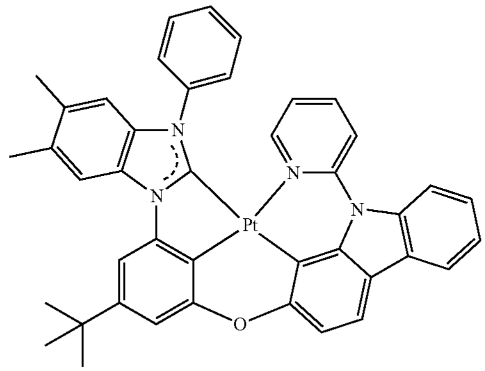
22
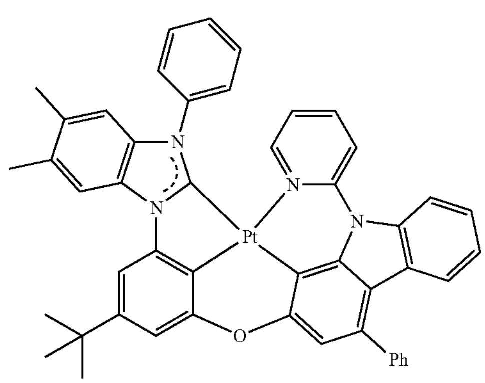

23
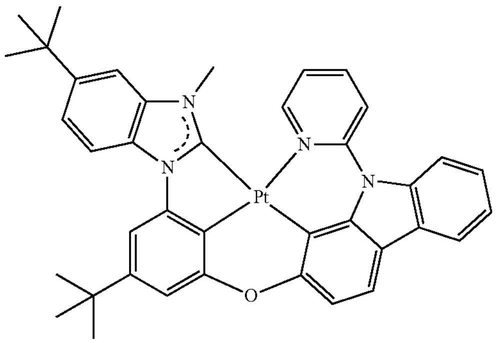
24
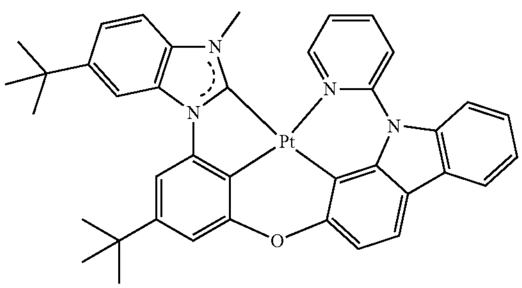
25
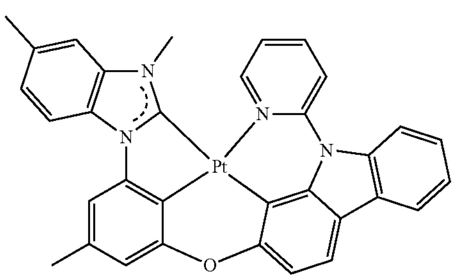
26
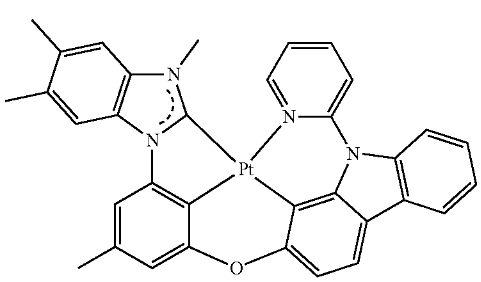
27
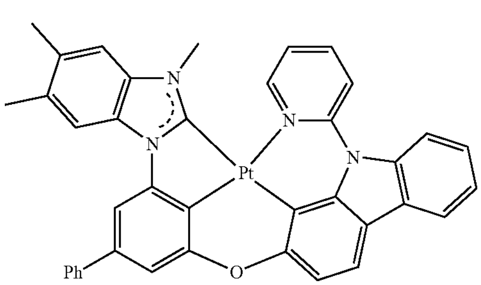
28
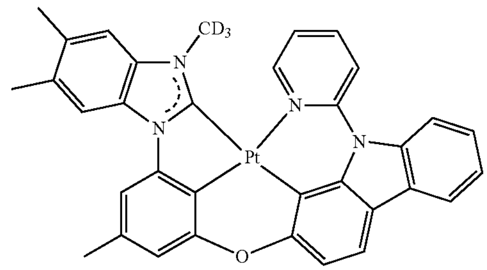
29
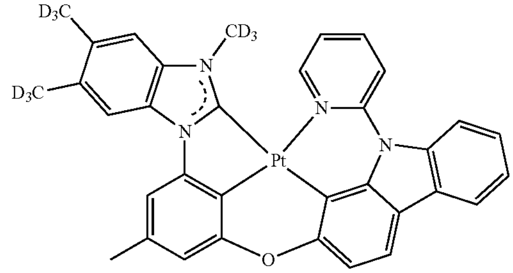
30
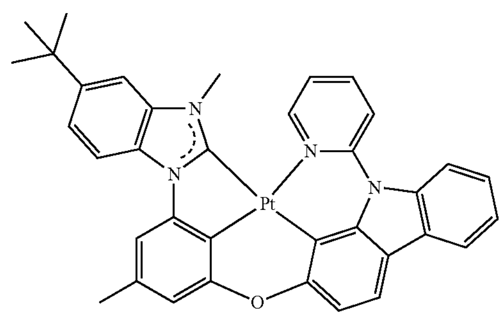
31
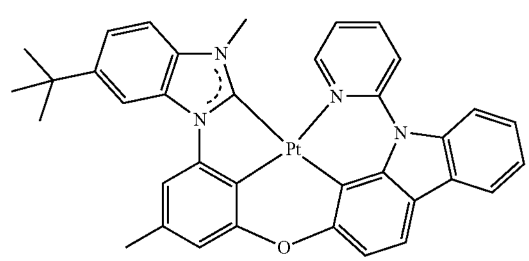
32
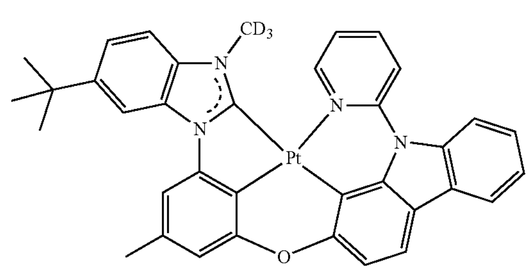

33
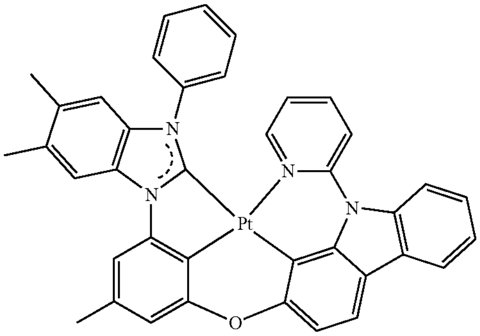
34
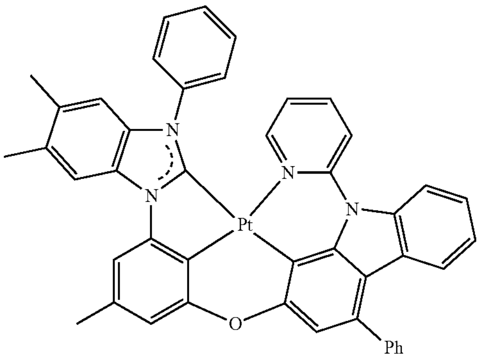
35
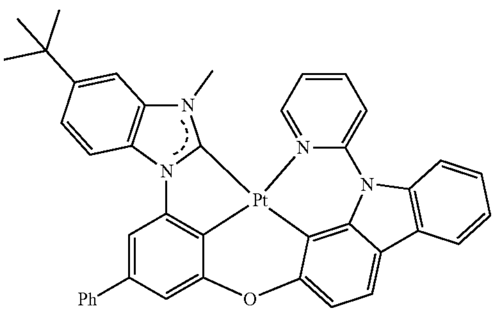
36
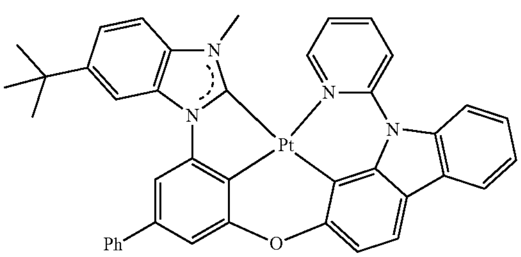
37
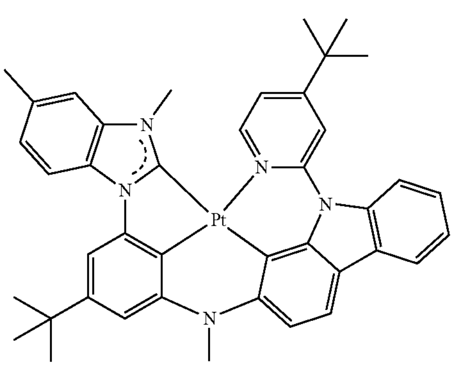
38
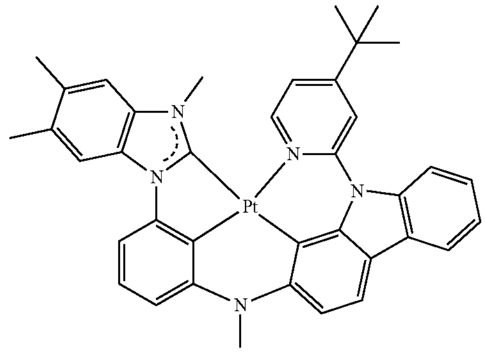
39
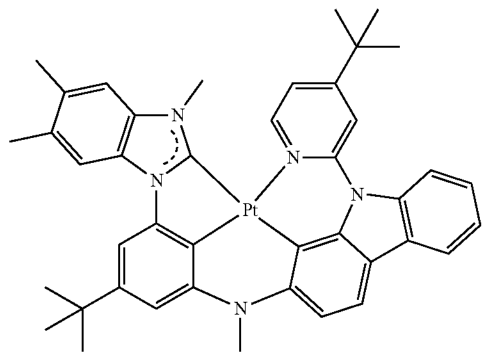
40
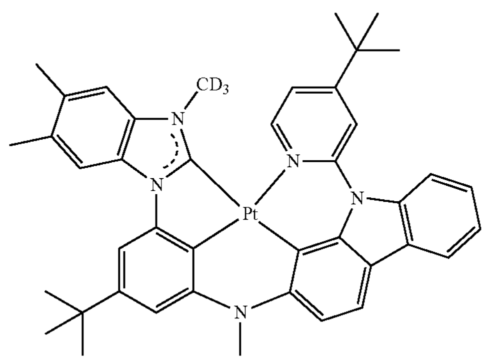
41
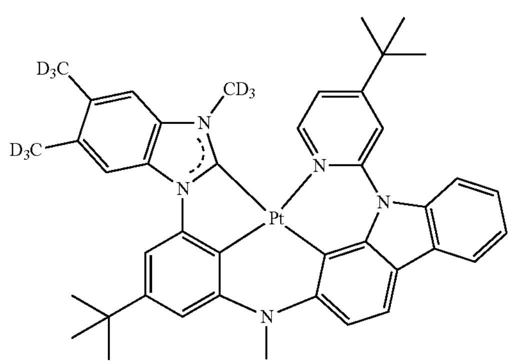

-continued
42
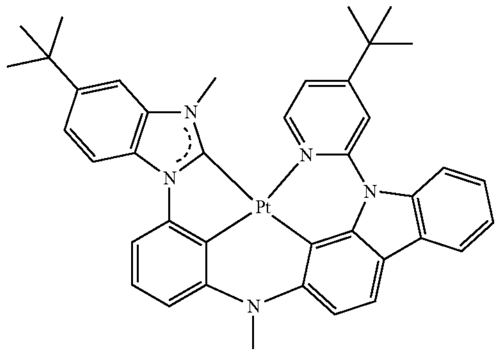
43
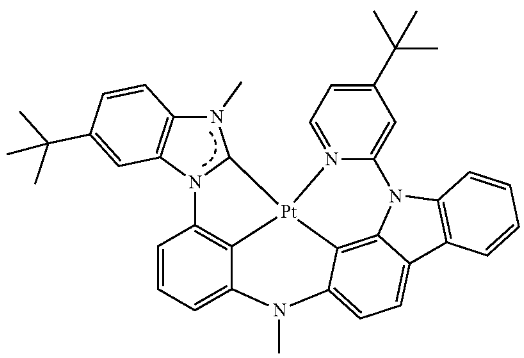
44
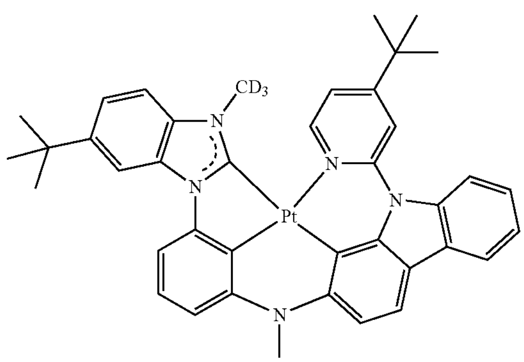
45
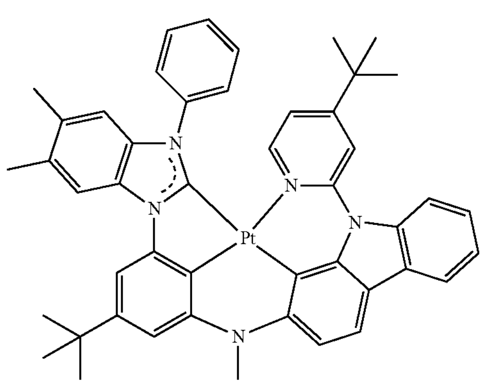
-continued
46
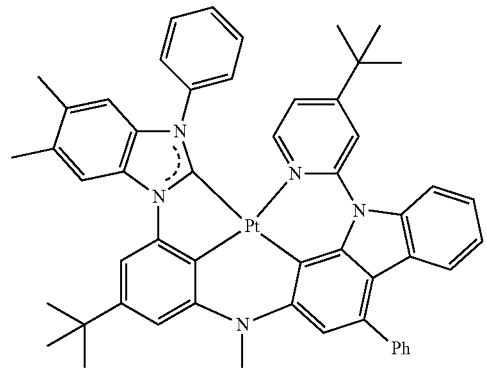
47
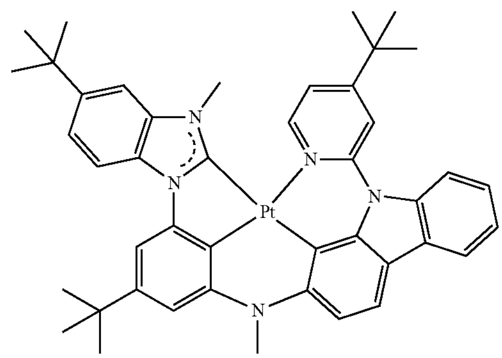
48
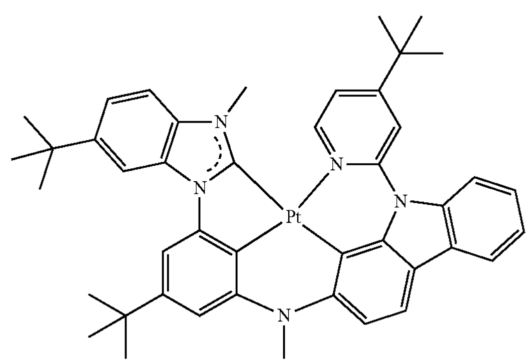
49
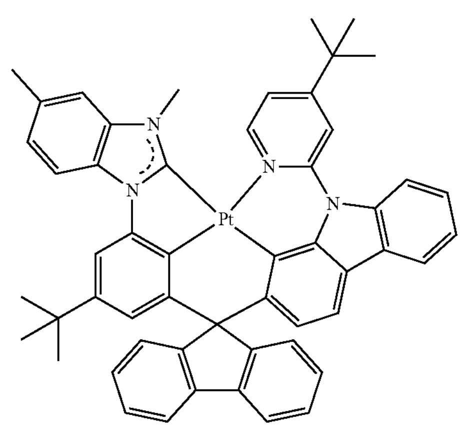

-continued
50
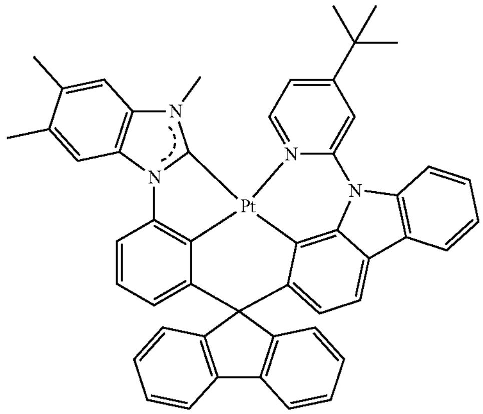
51
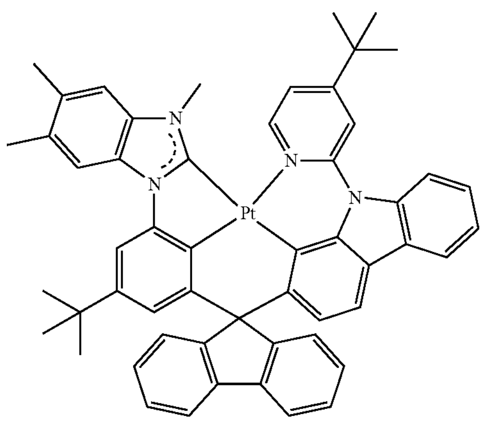
52
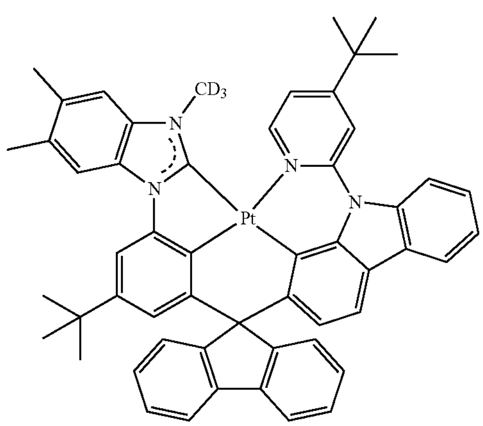
-continued
53
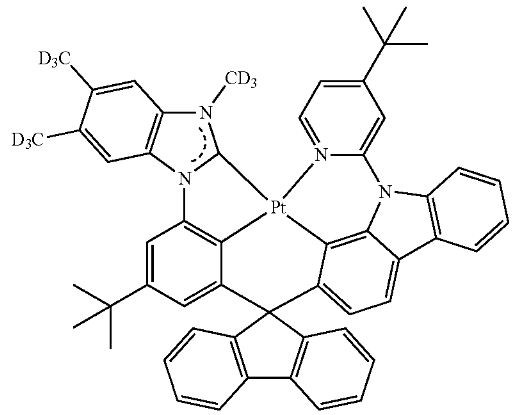
54
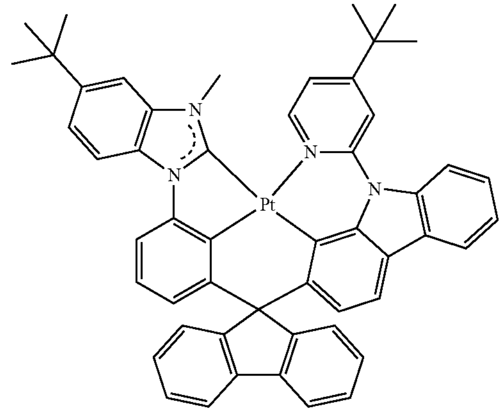
55
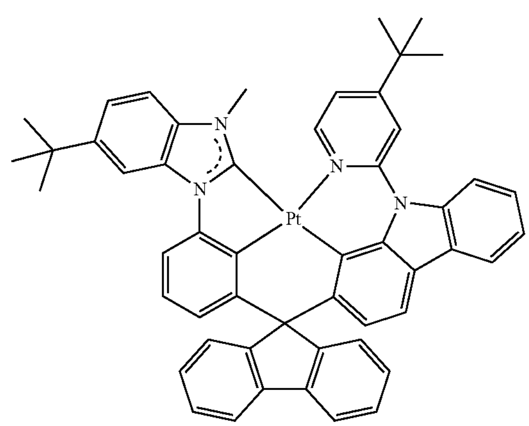

56
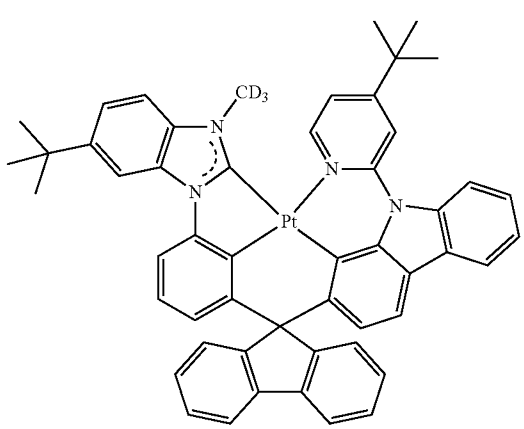
57
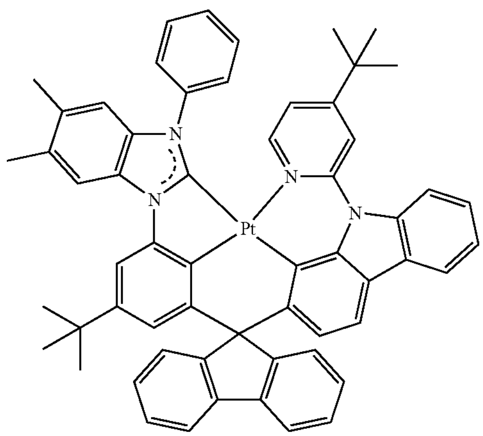
58
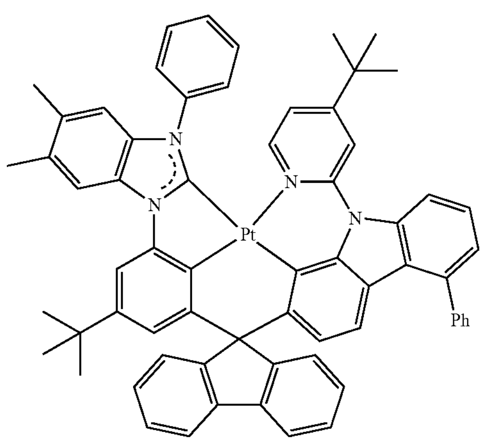
59
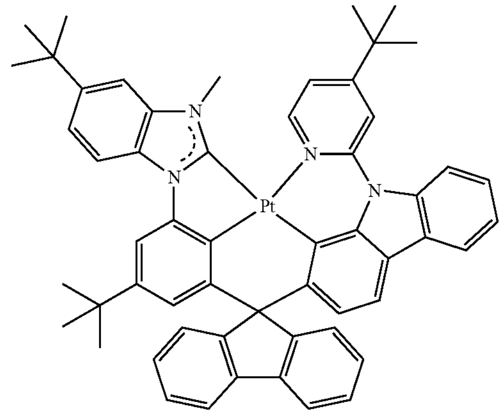
60
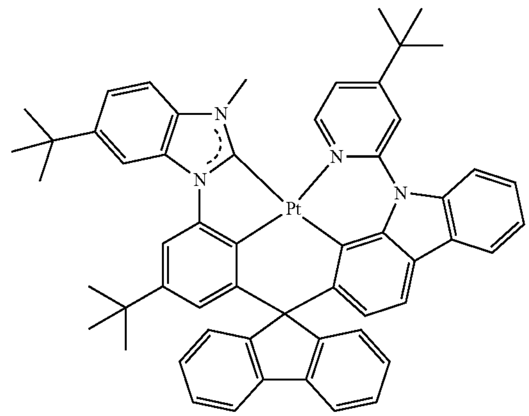
61
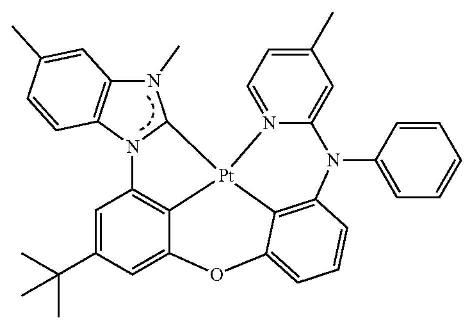
62
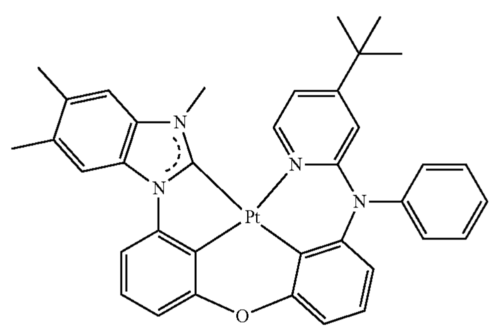

-continued
63
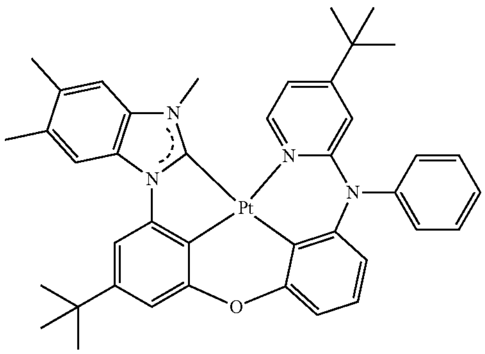
67
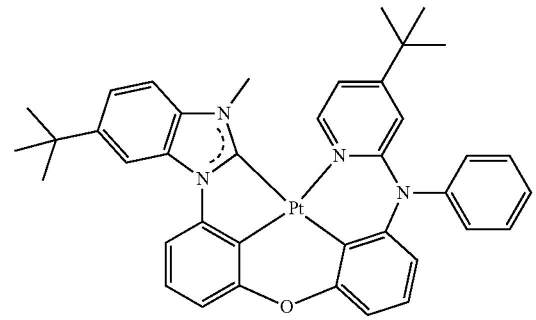
64
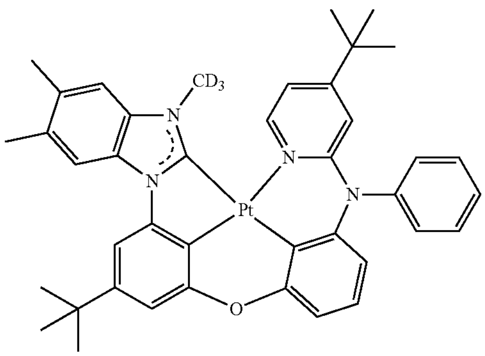
68
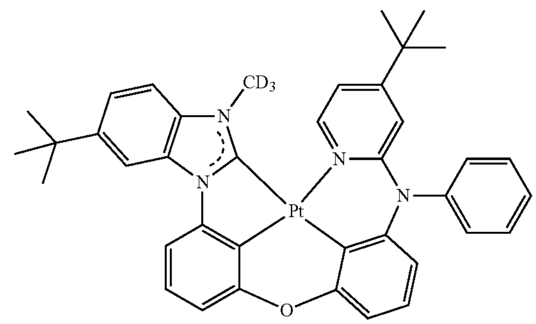
65
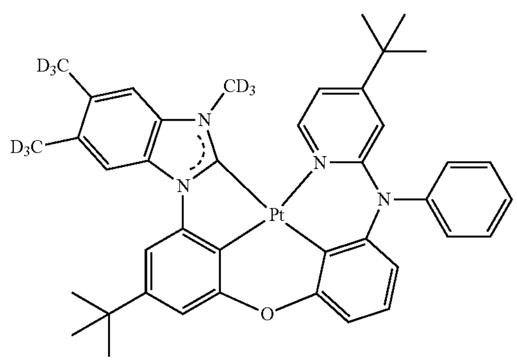
69
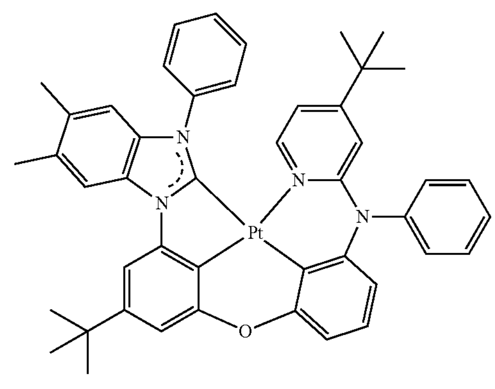
66
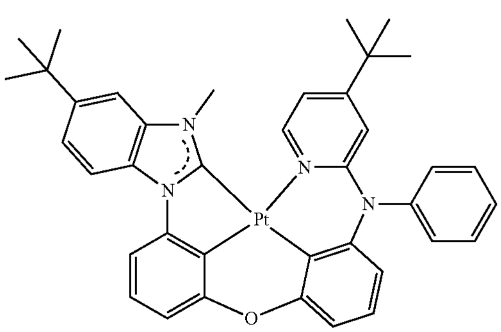
70
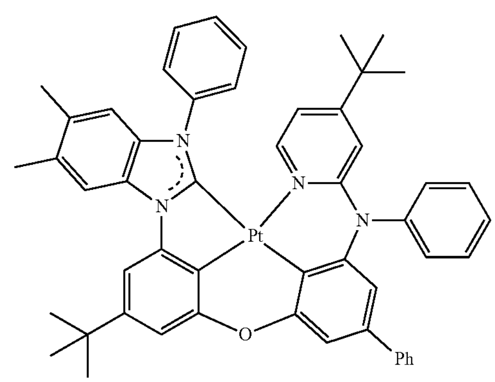

-continued
71
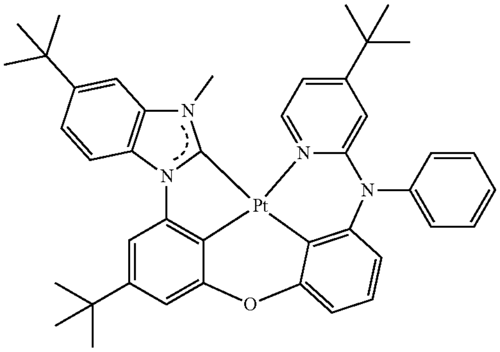
72
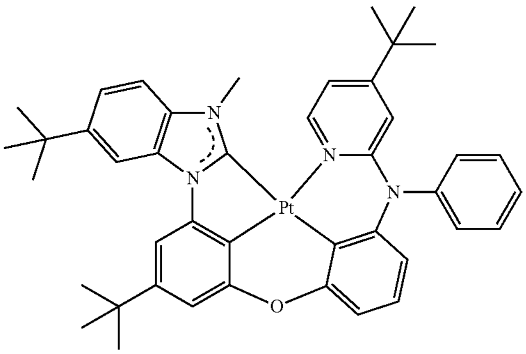
73
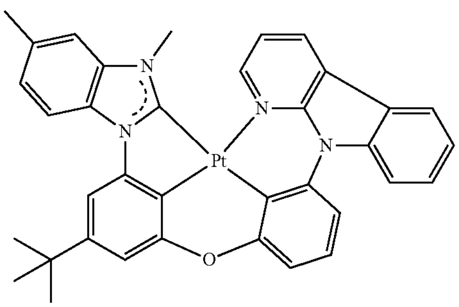
74
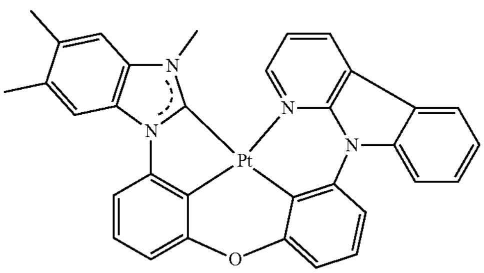
75
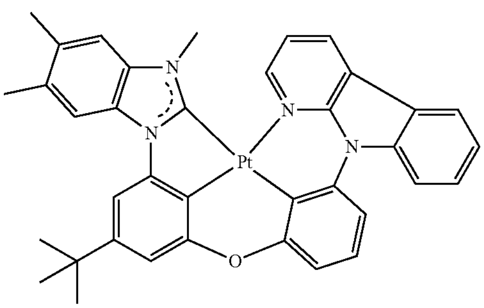
-continued
76
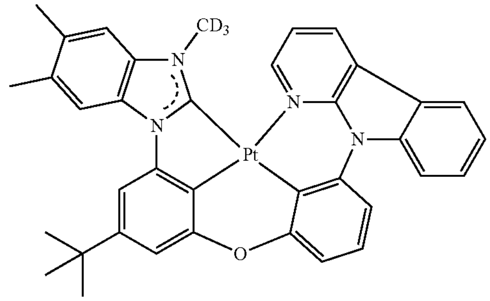
77
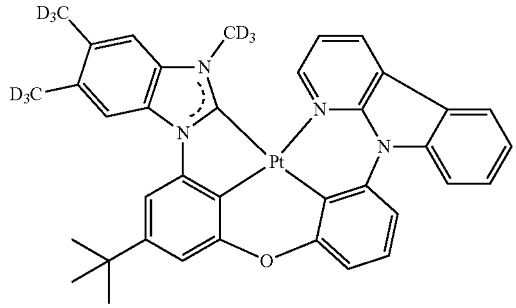
78
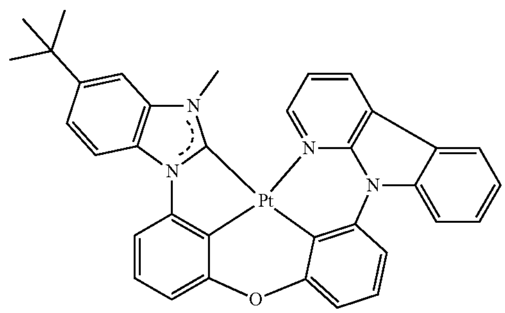
79
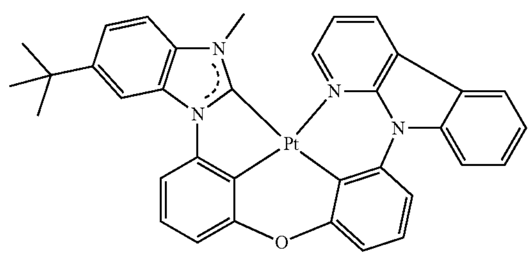
80
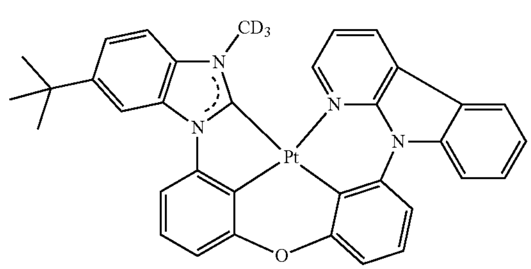

-continued
81
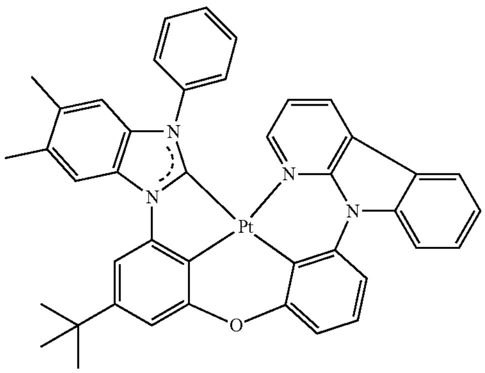
82
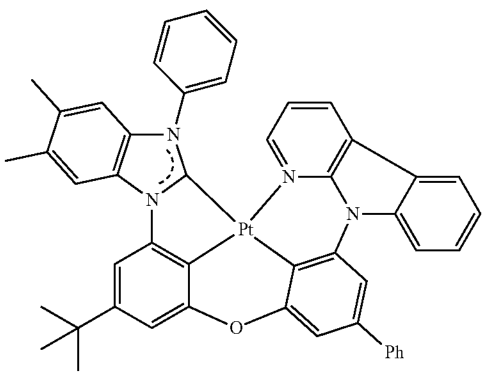
83
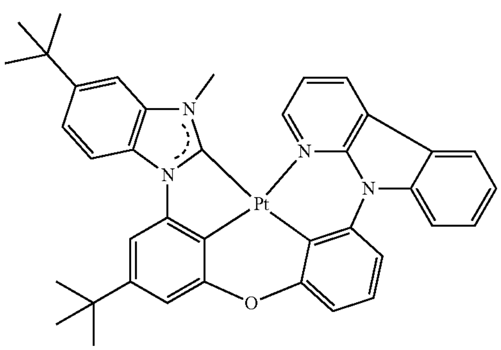
84
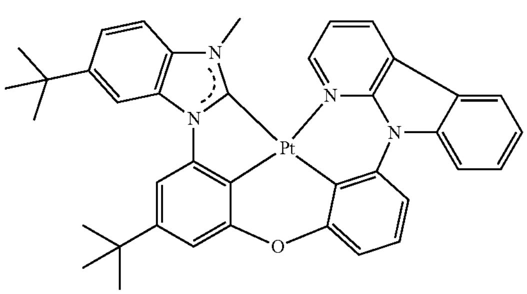
-continued
85
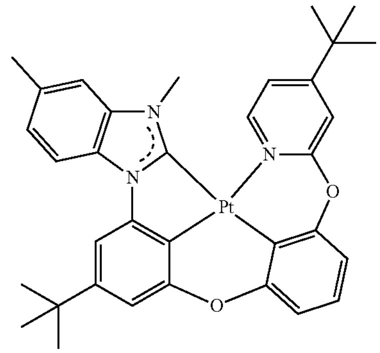
86
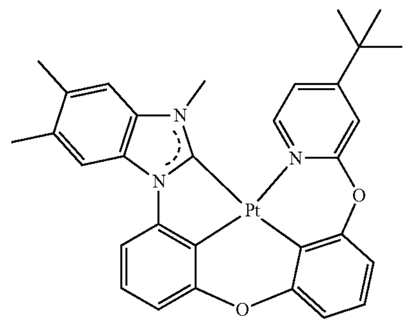
87
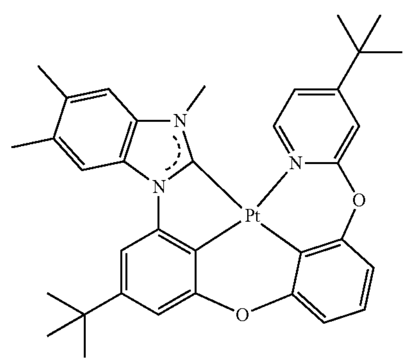
88
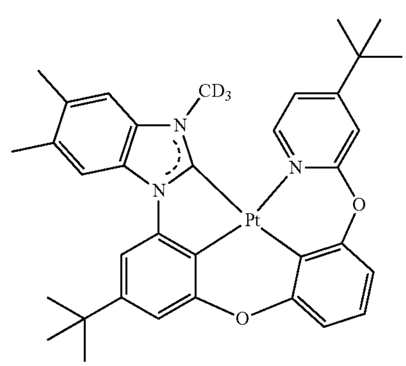

89
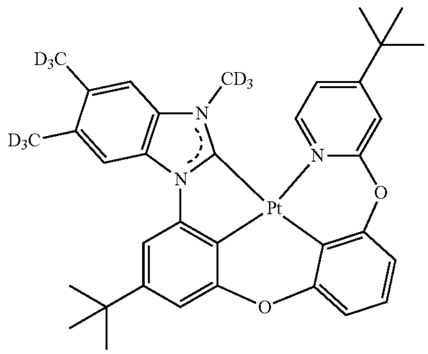
90
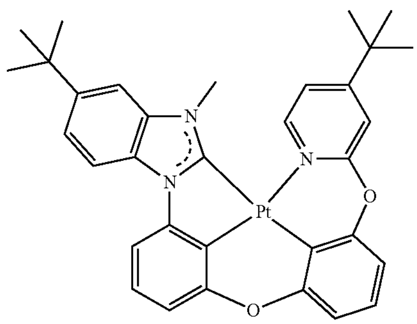
91
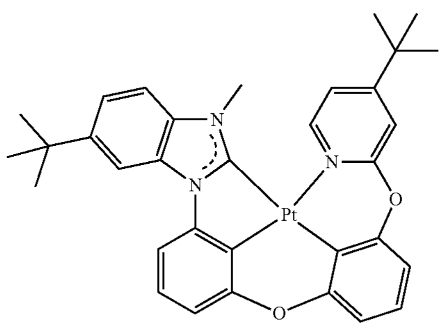
92
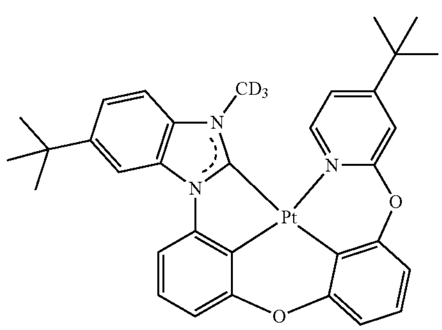
93
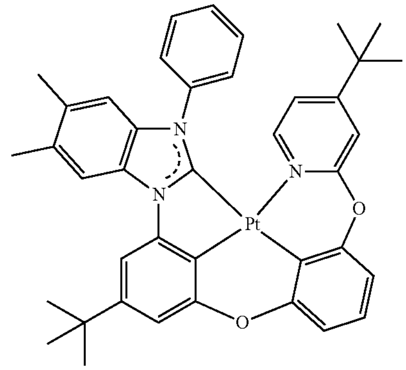
94
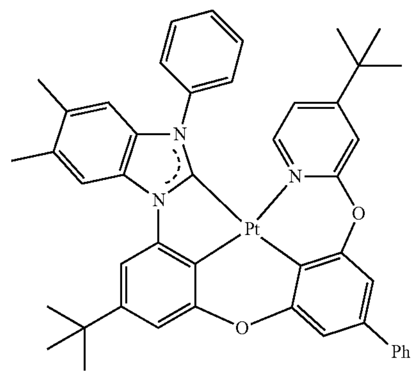
95
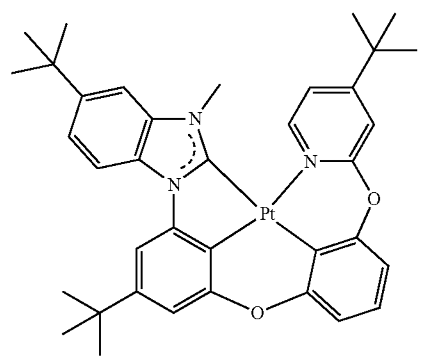
96
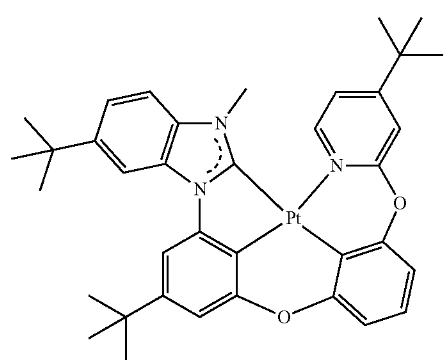

-continued
97
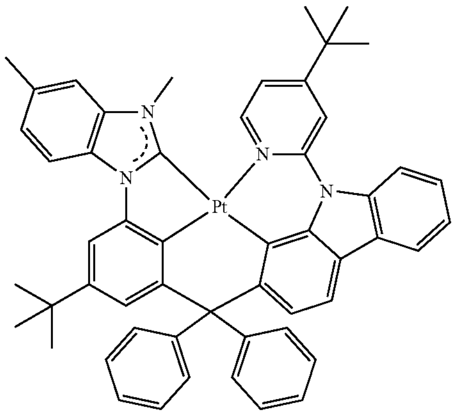
98
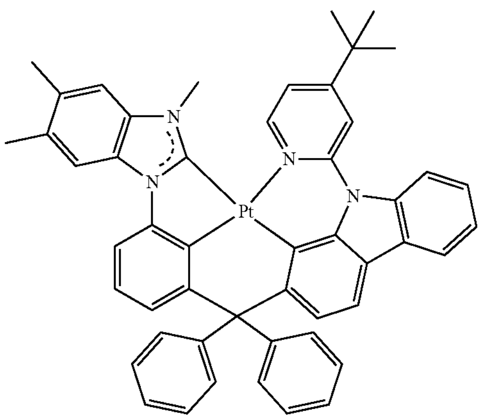
99
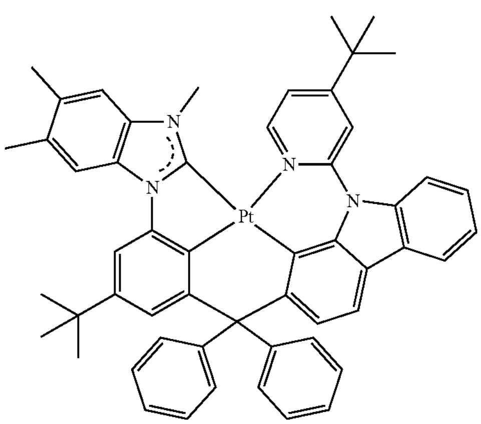
-continued
100
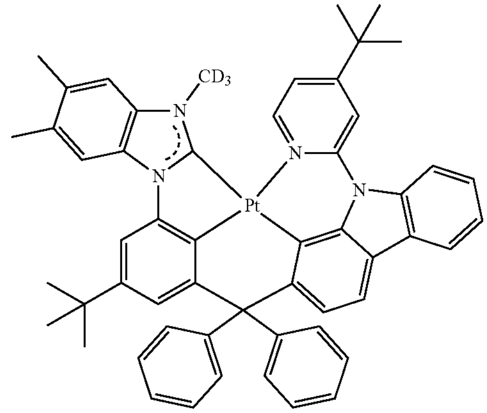
101
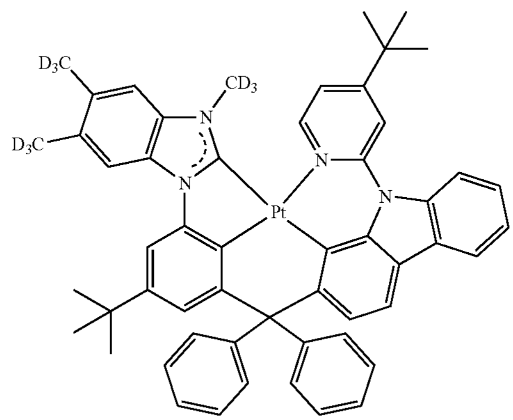
102
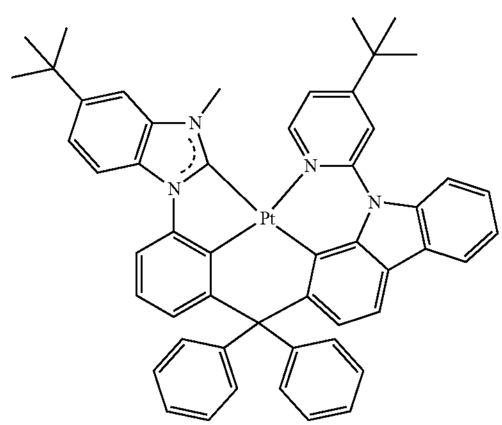

-continued
103
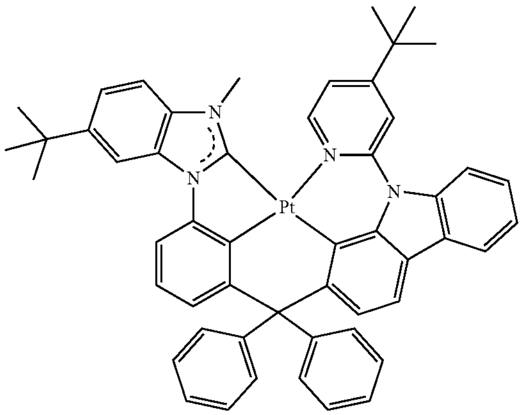
104
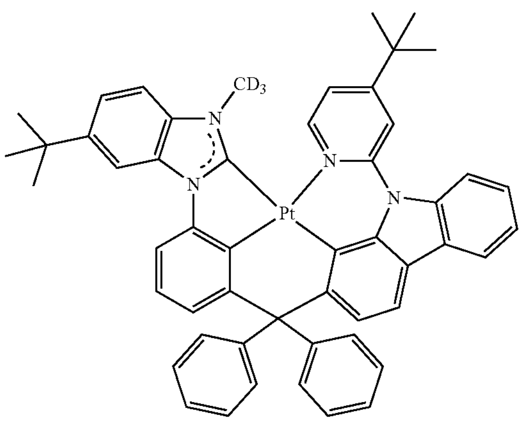
105
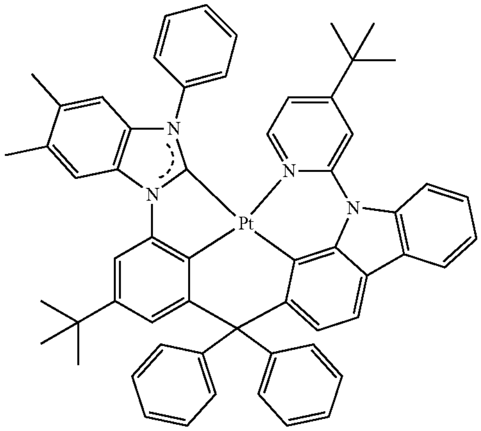
-continued
106
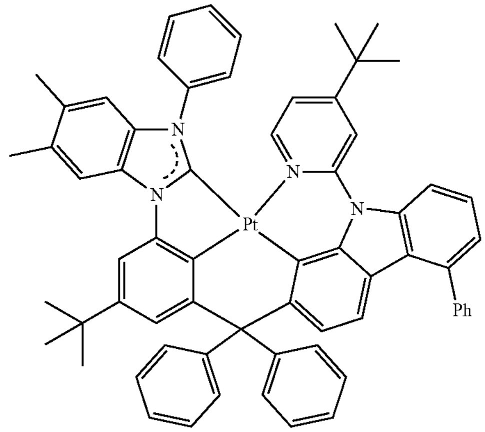
107
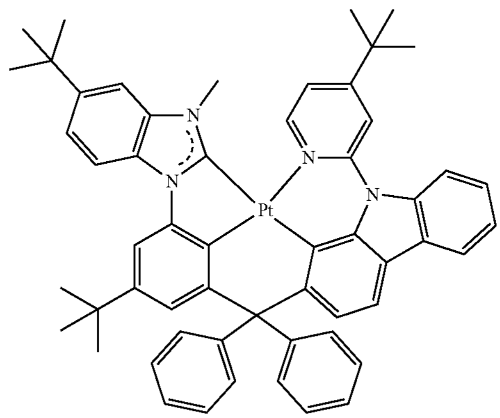
108
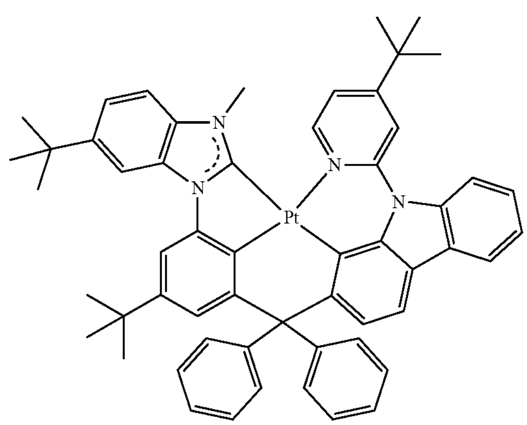

-continued
109
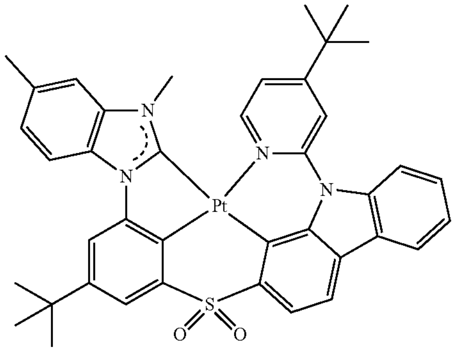
113
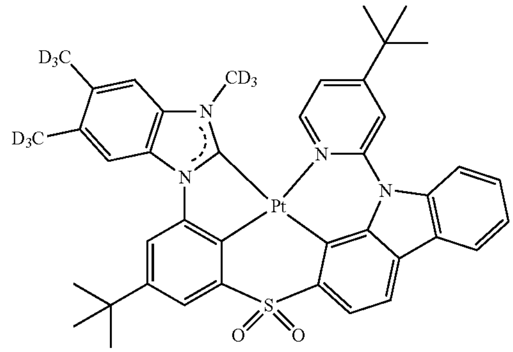
110
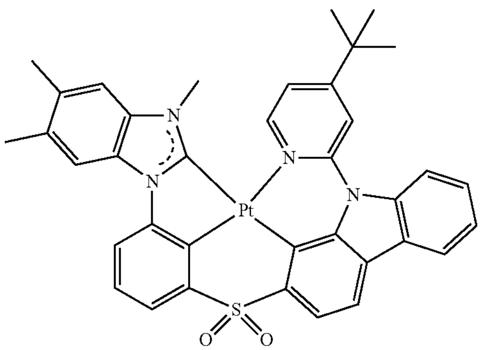
114
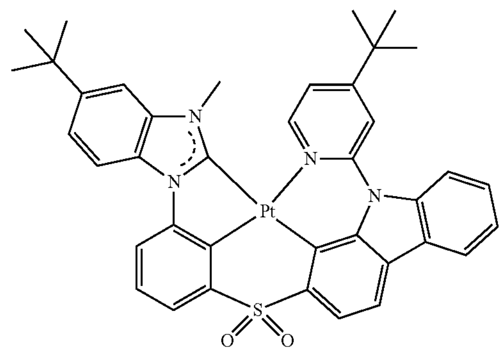
111
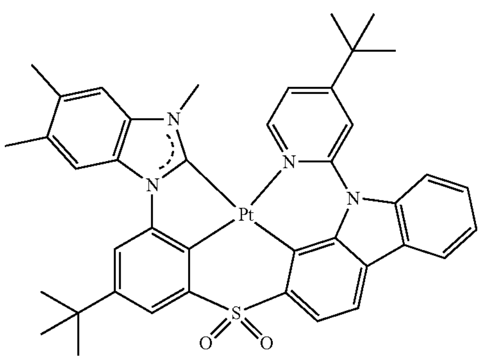
115
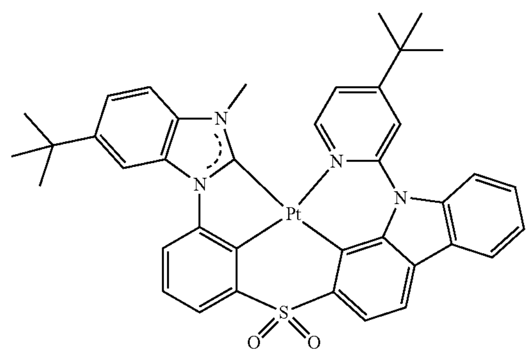
112
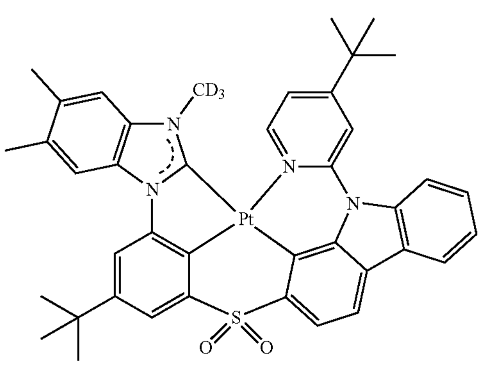
116
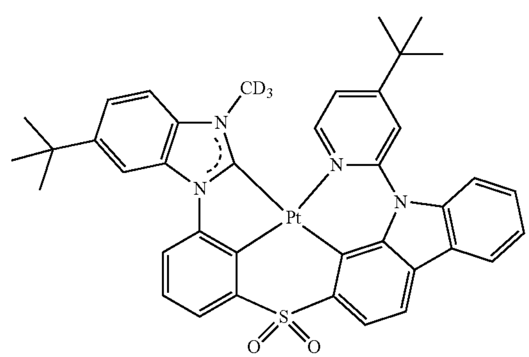

-continued
117
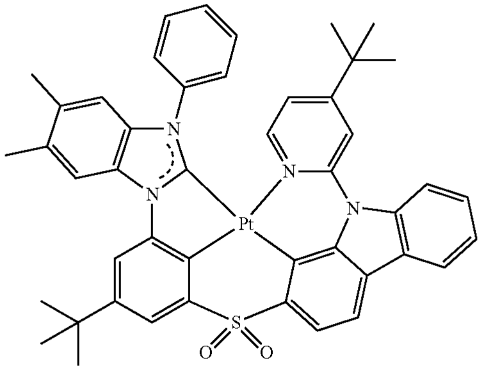
118
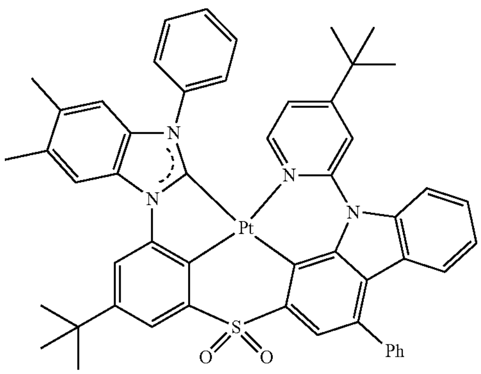
119
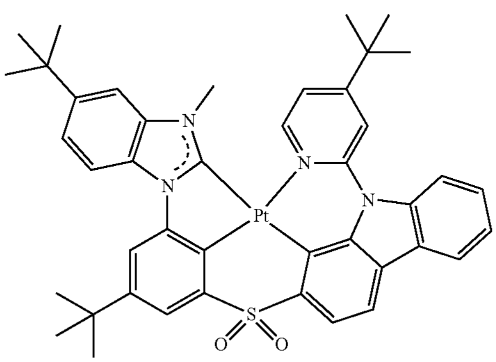
120
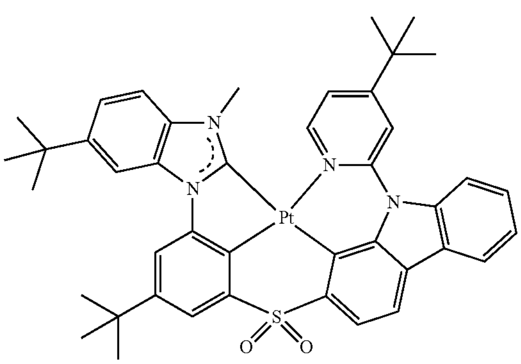
Group III
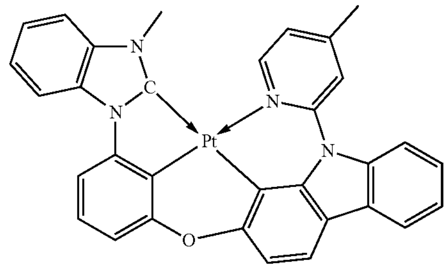
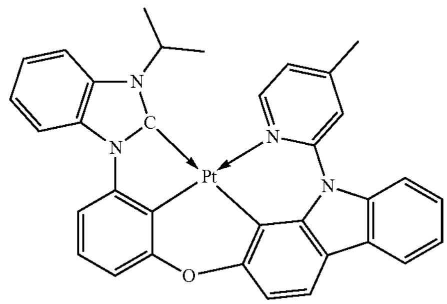
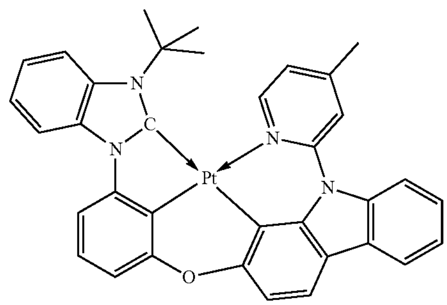
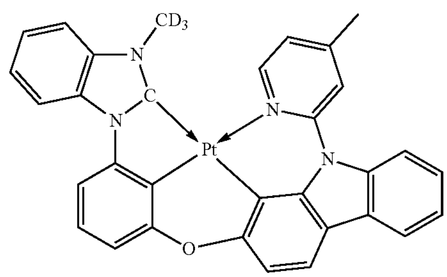
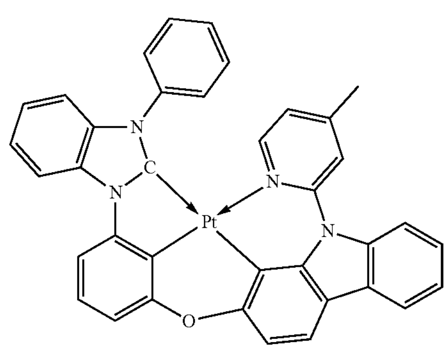

-continued
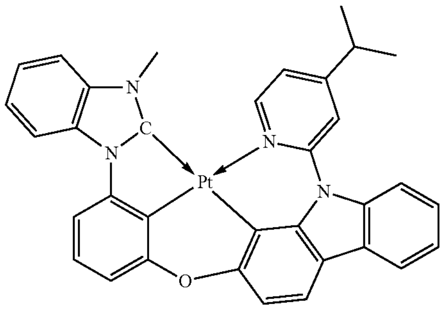
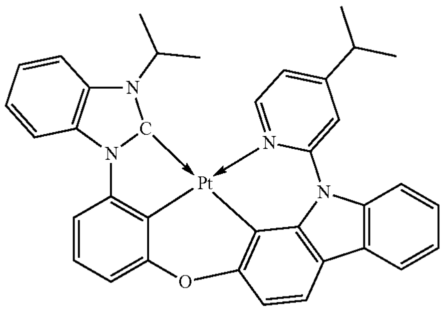
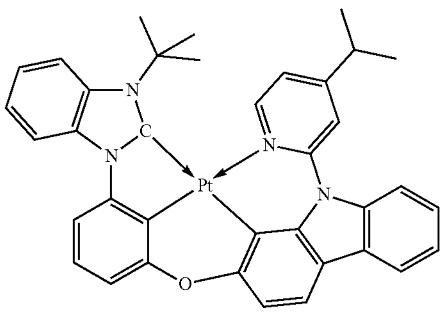
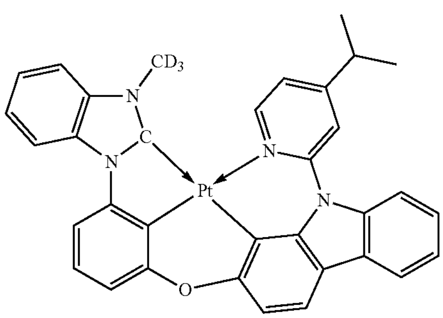
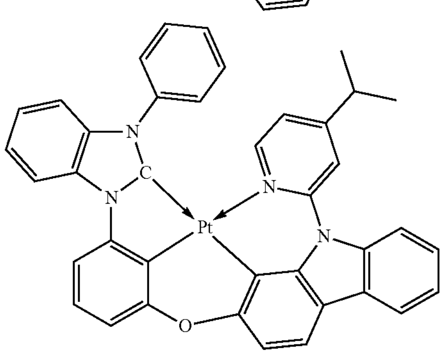
-continued
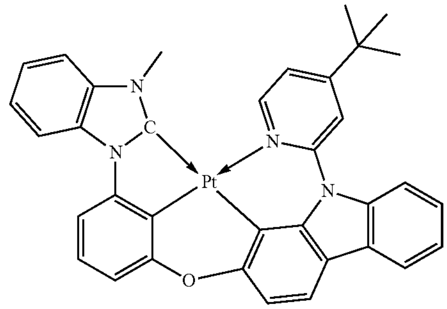
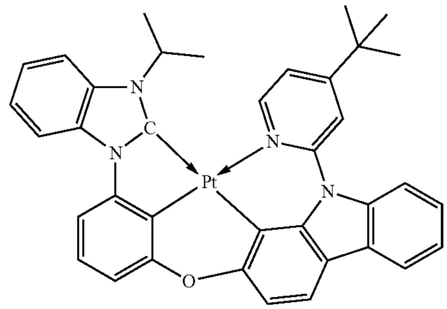
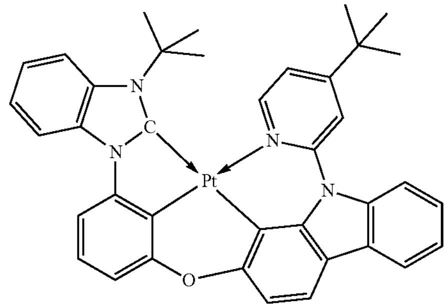
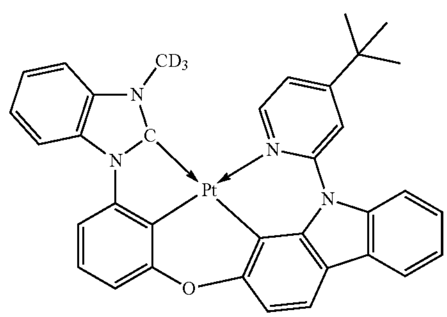
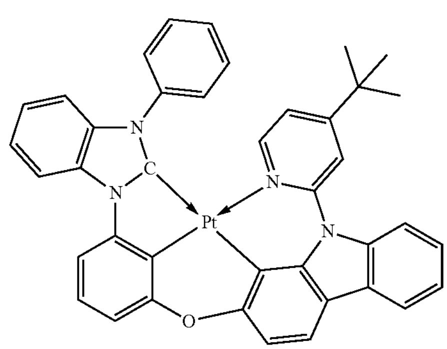

-continued
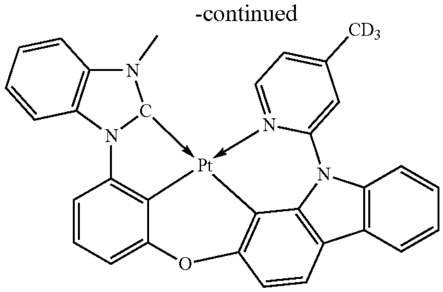
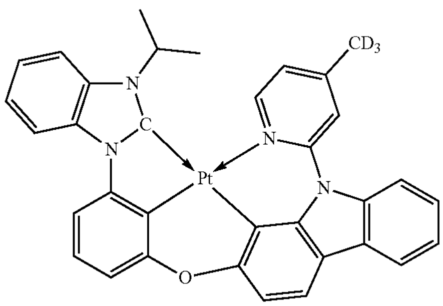
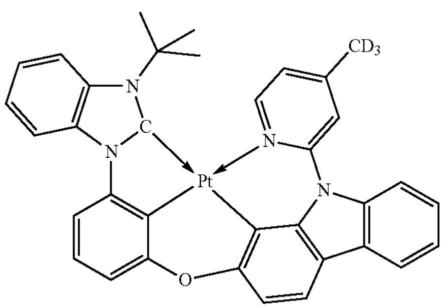
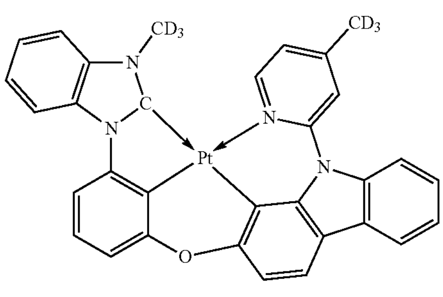
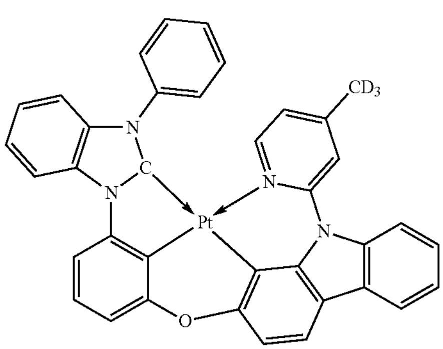
-continued
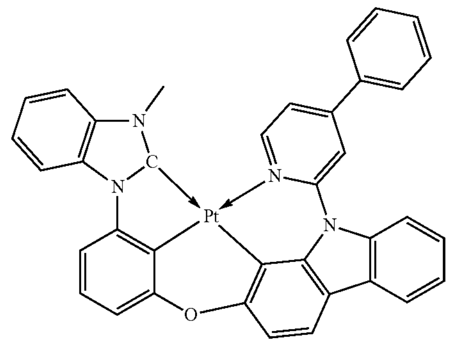
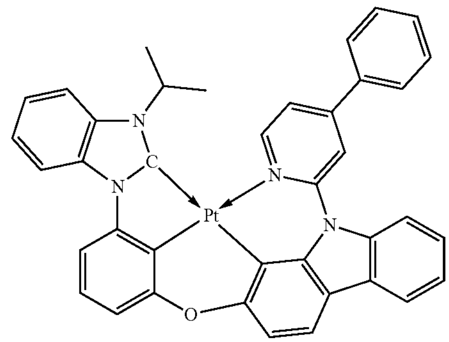
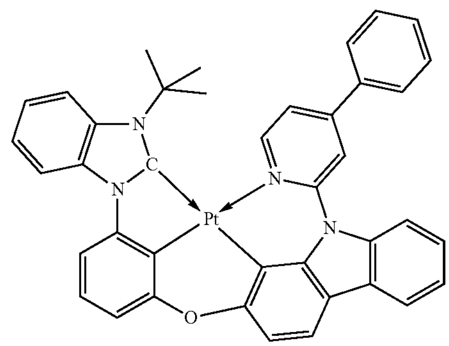
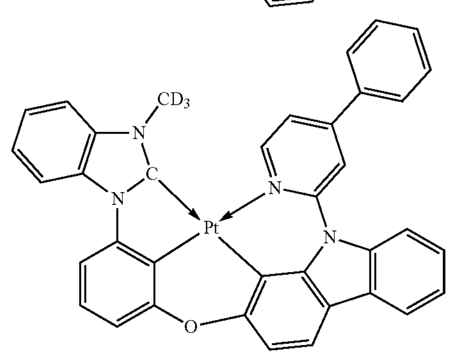
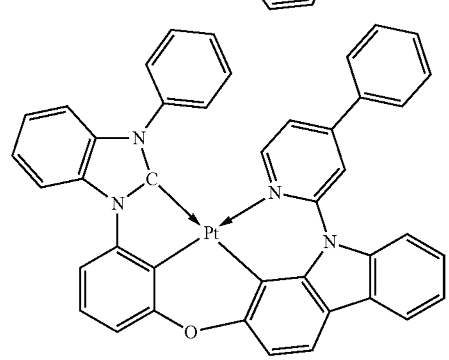

-continued
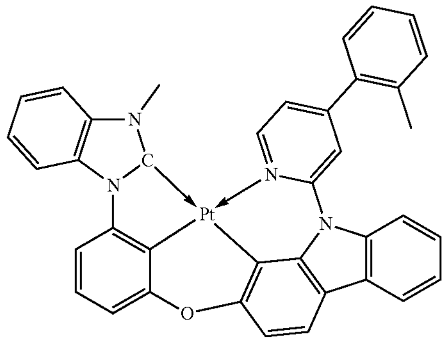
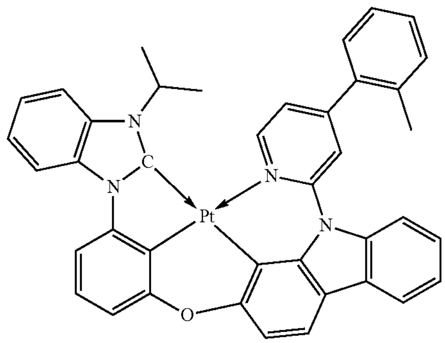
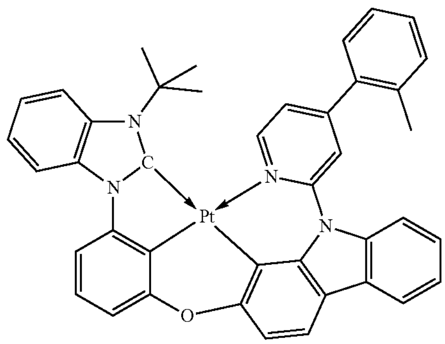
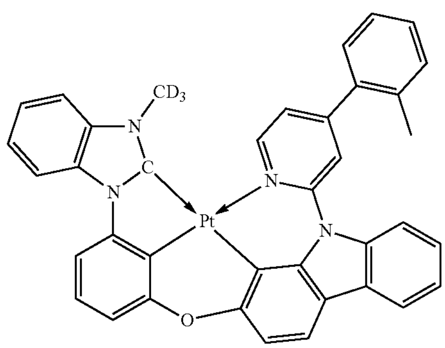
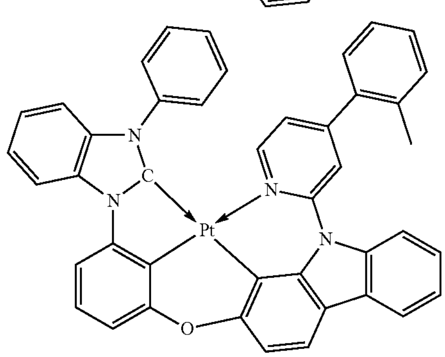
-continued
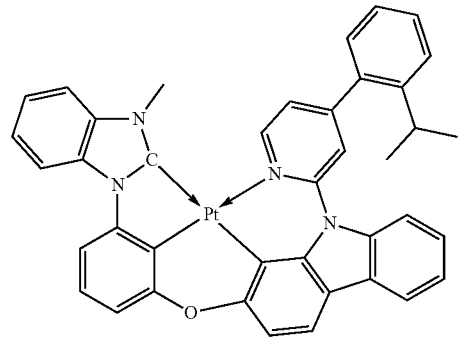
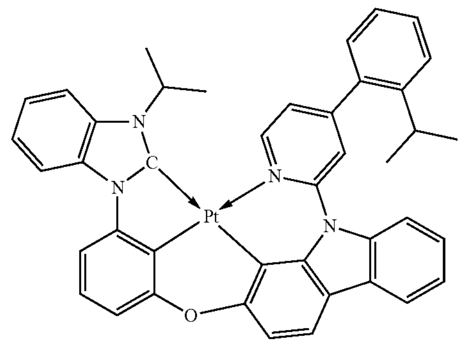
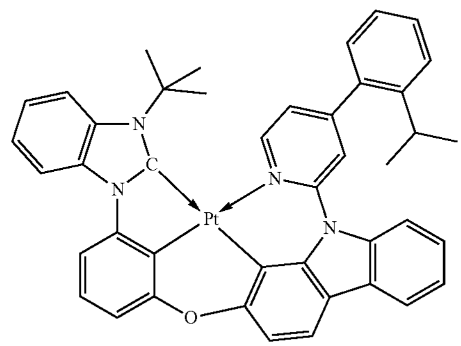
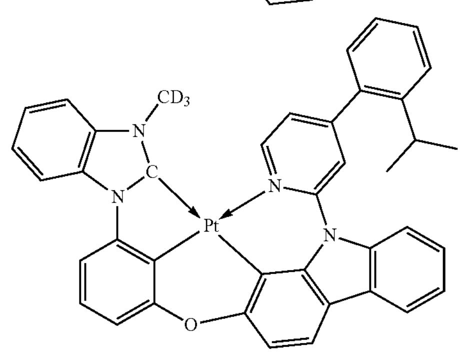
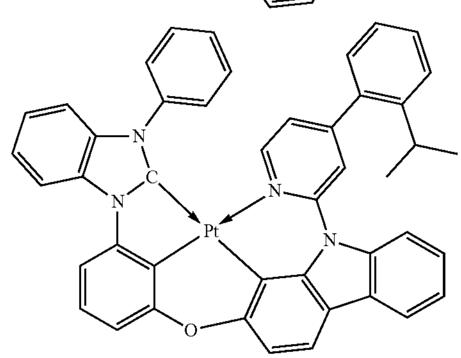

-continued
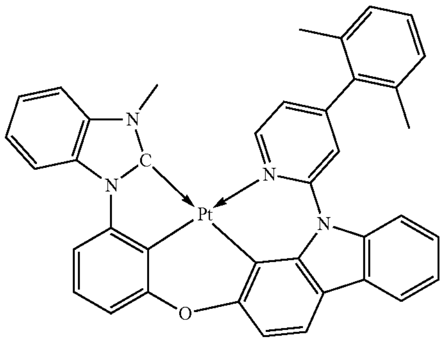
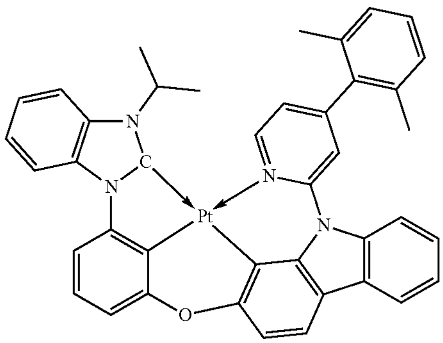
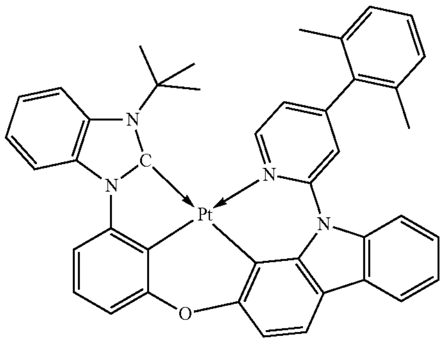
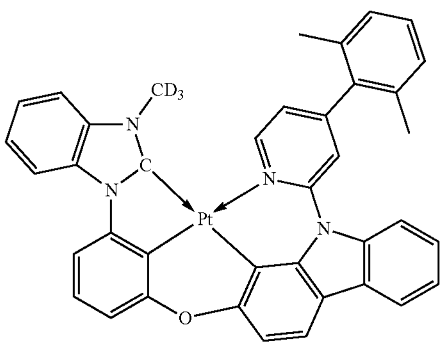
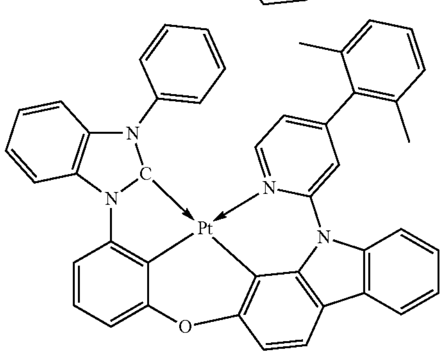
-continued
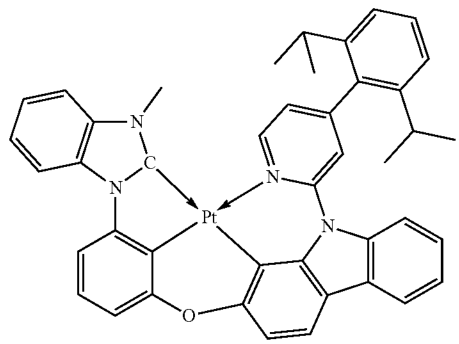
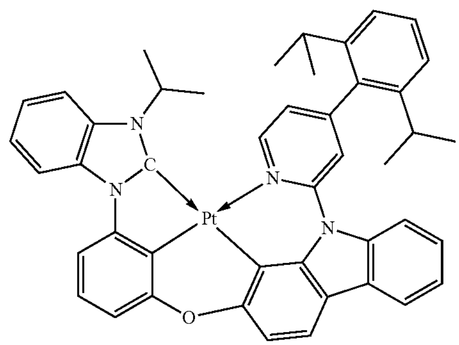
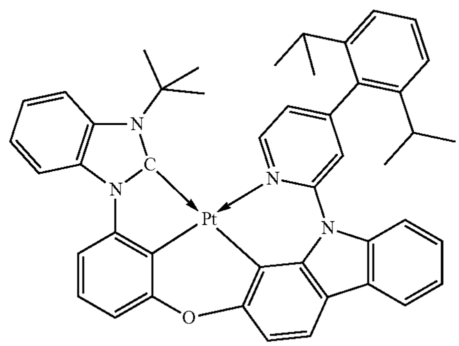
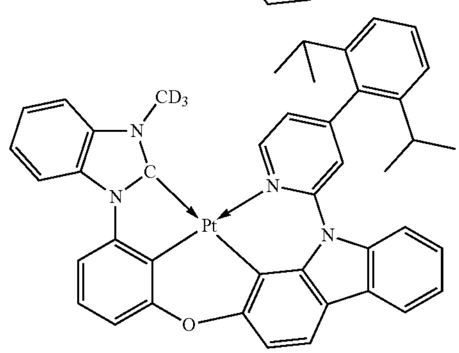
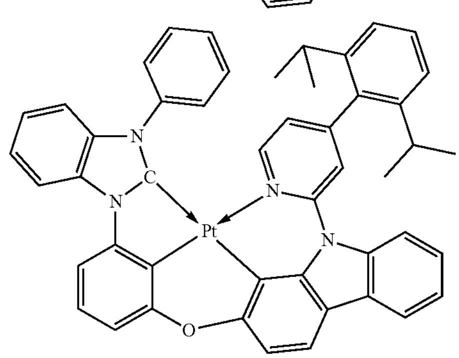

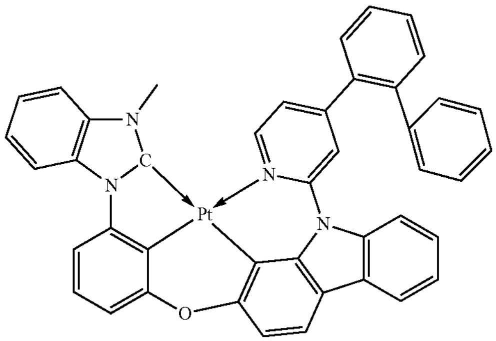
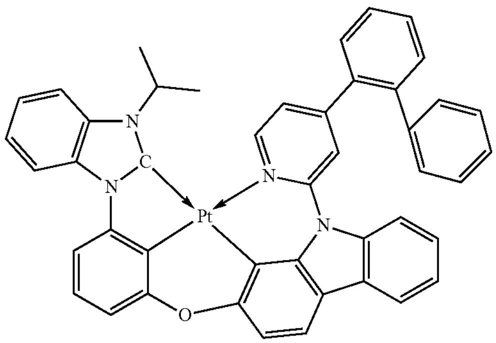
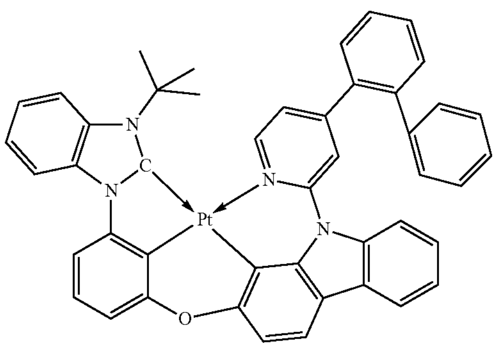
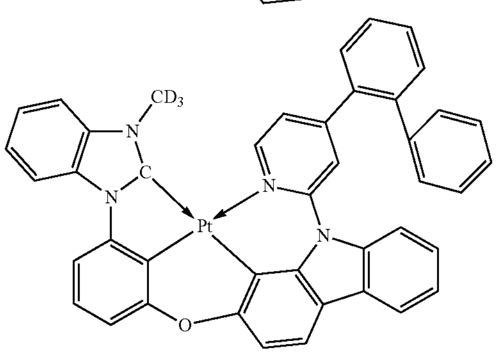
CD3
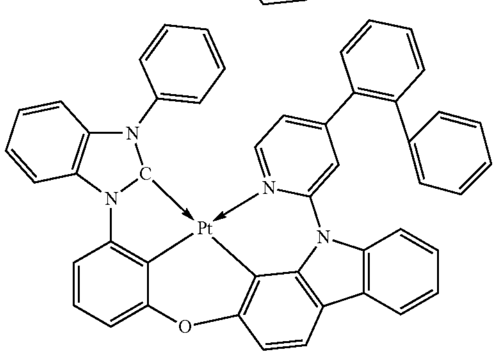
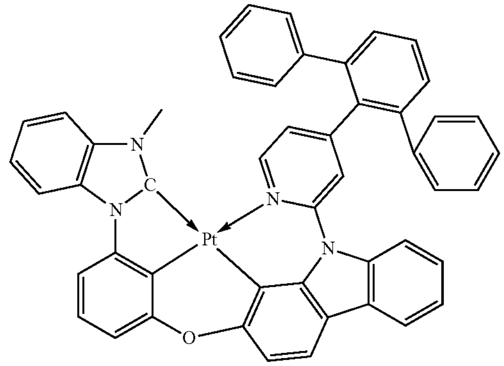
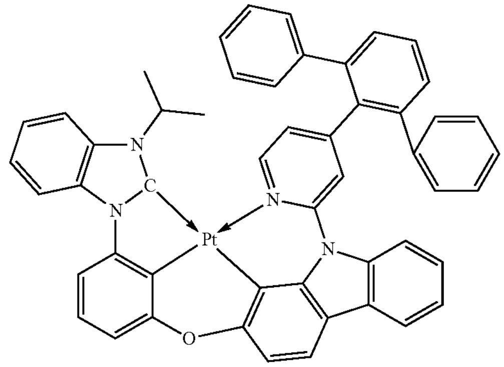
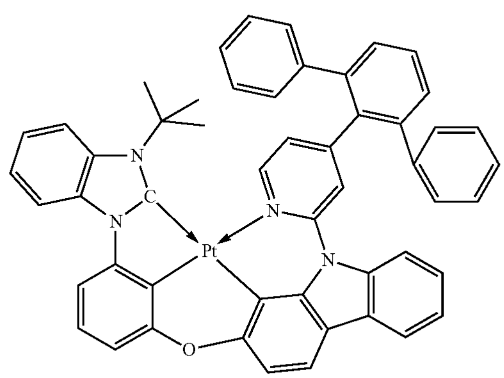
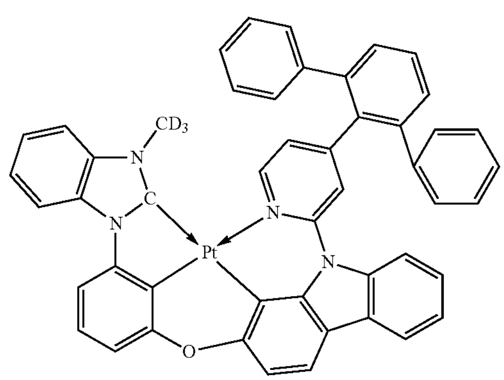
CD3

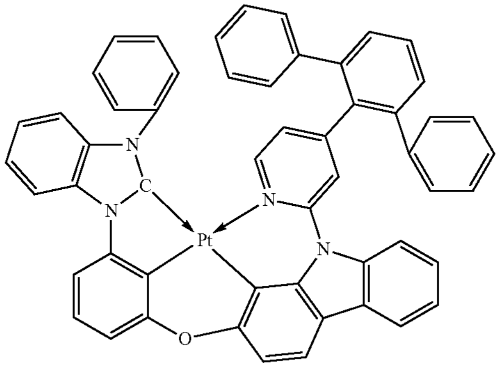
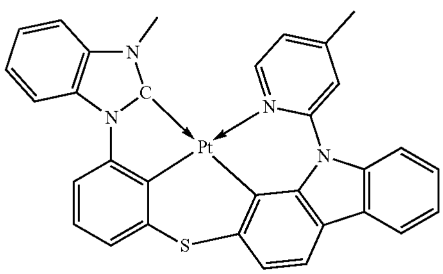
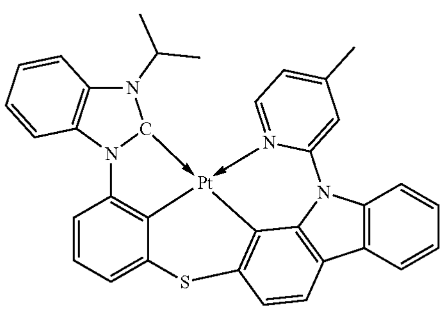
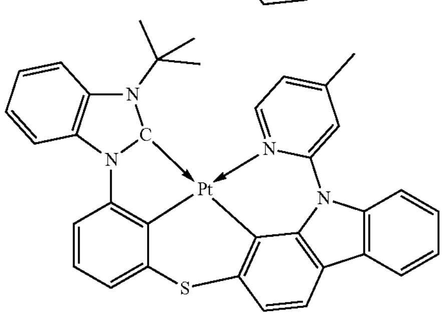
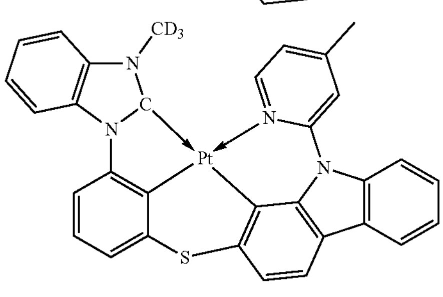
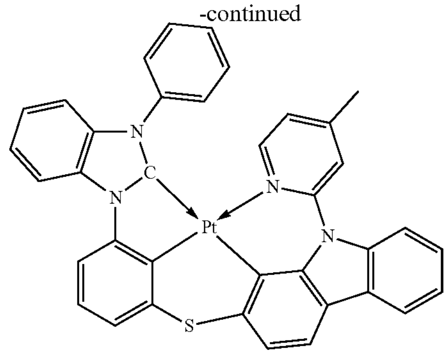
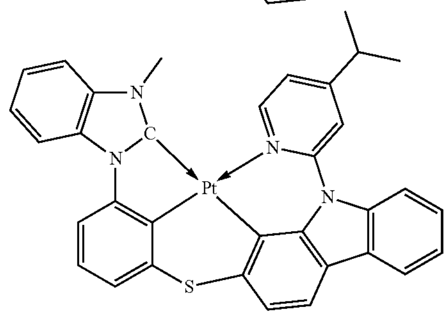
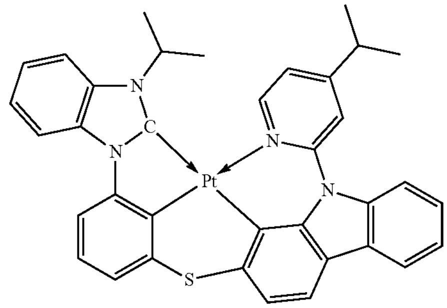
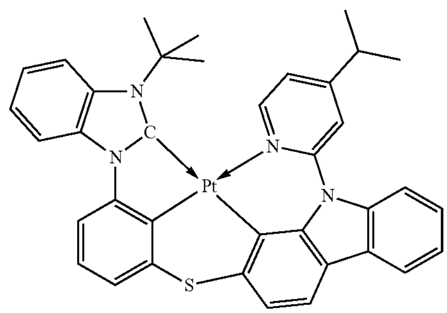
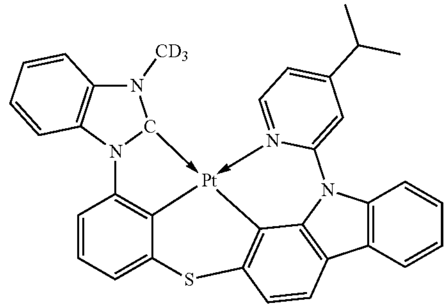

-continued
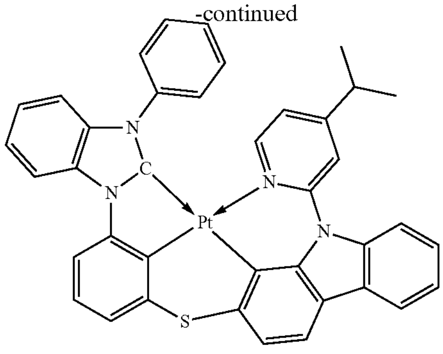
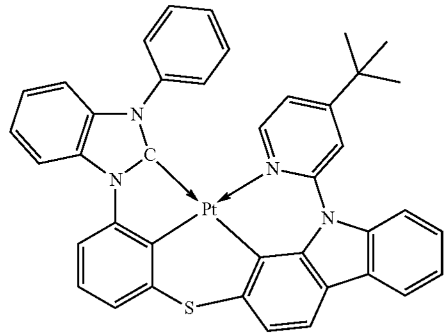
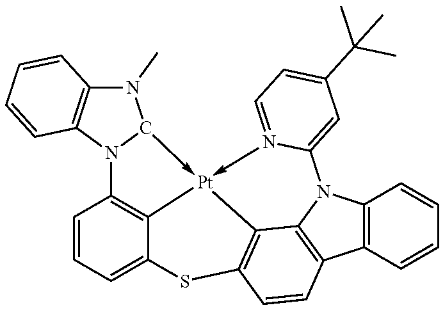
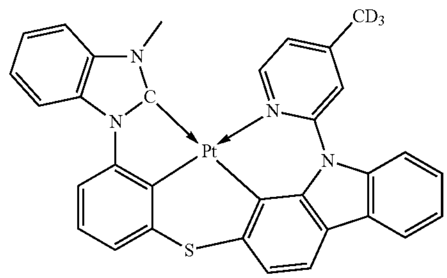
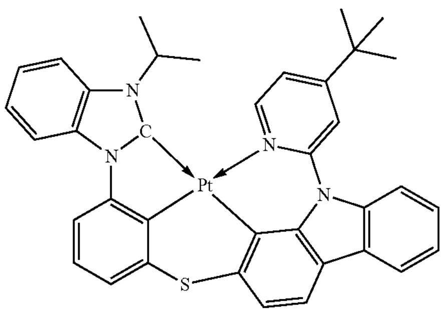
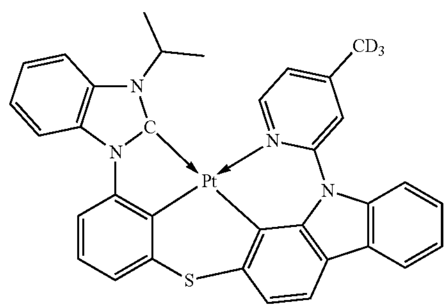
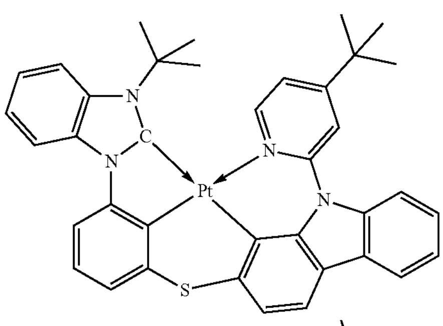
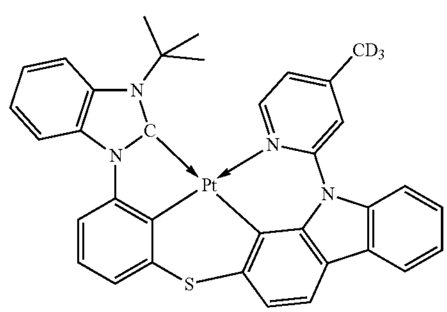
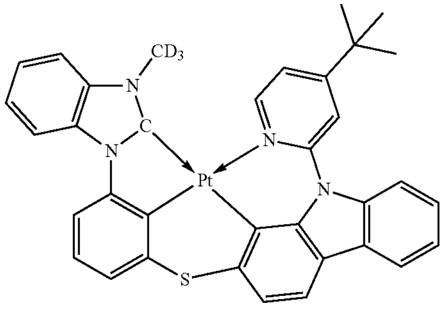
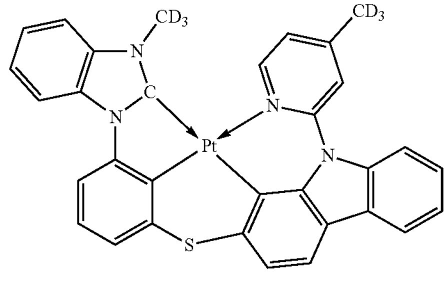

-continued
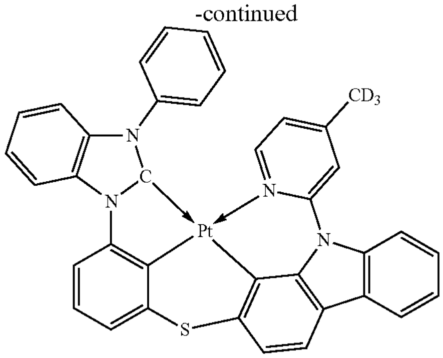
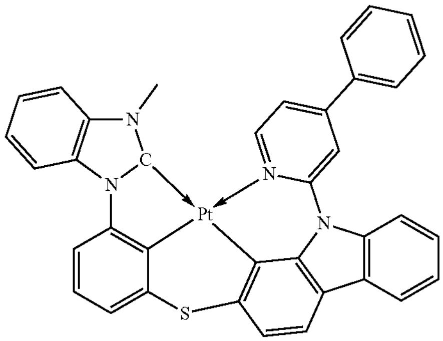
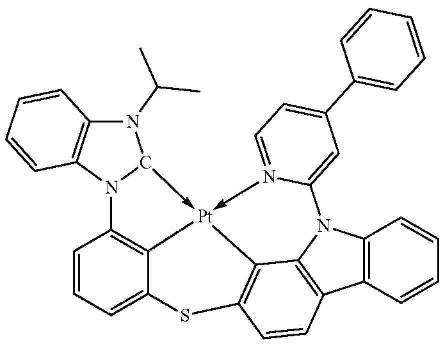
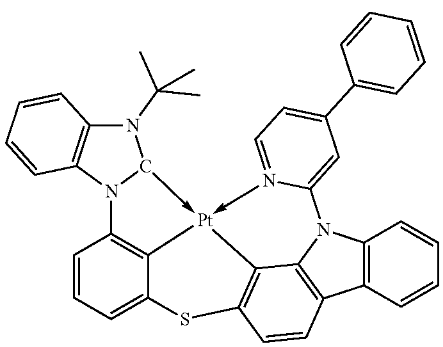
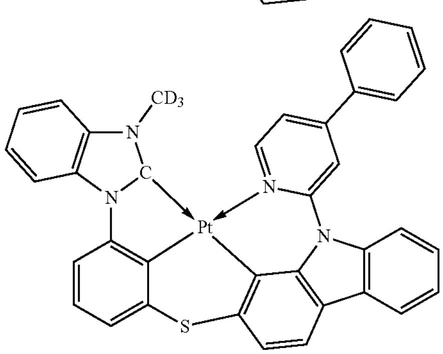
-continued
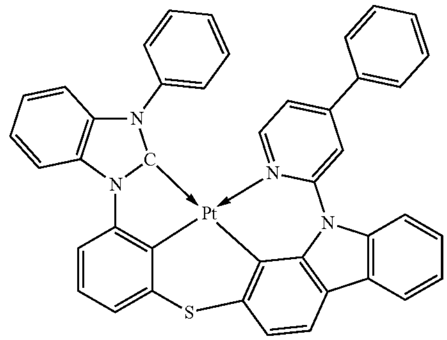
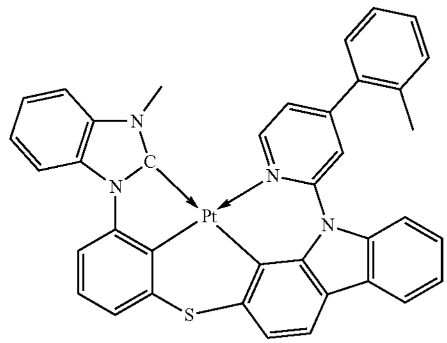
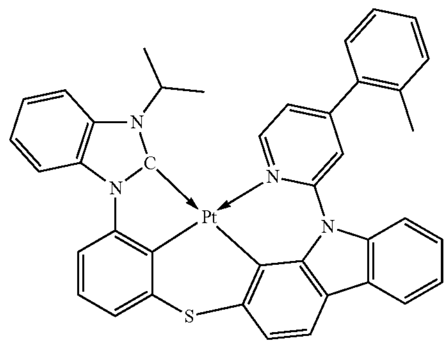
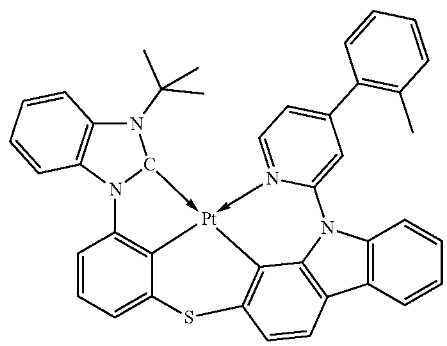
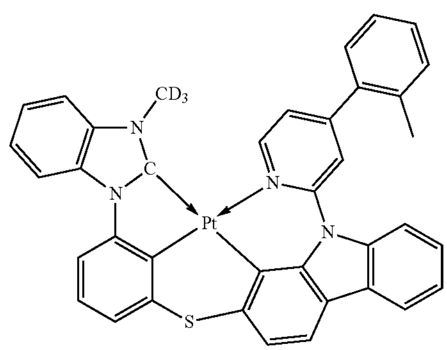

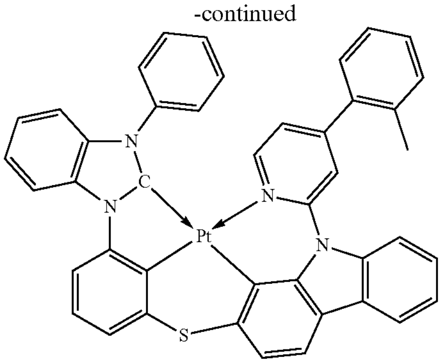
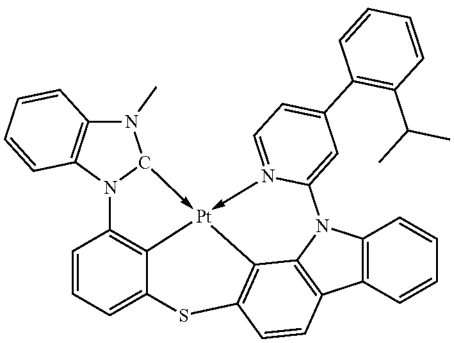
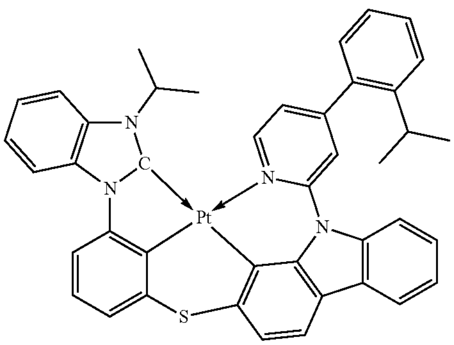
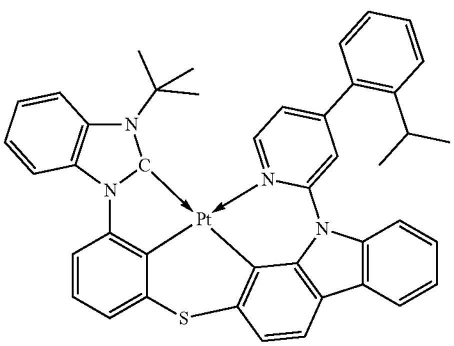
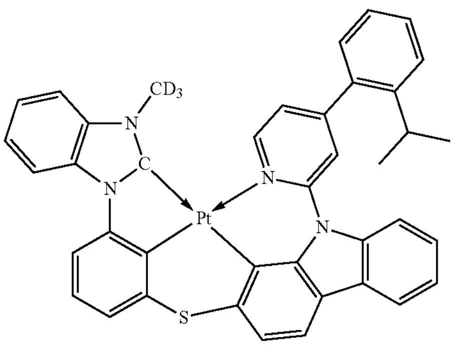
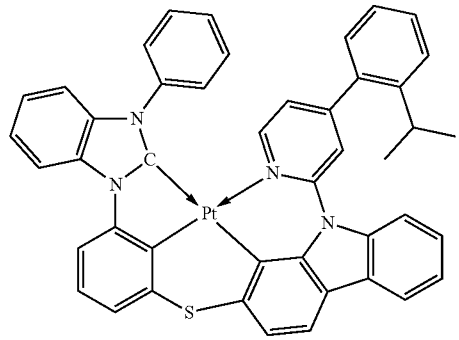
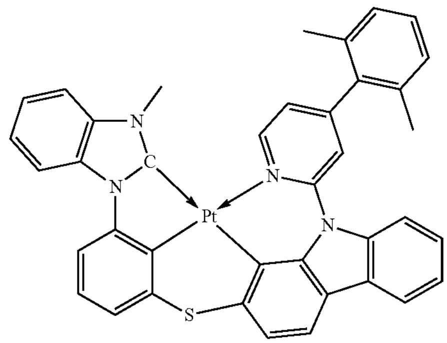
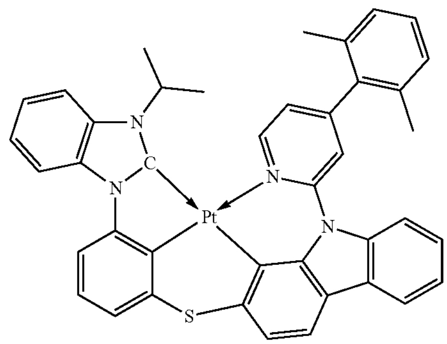
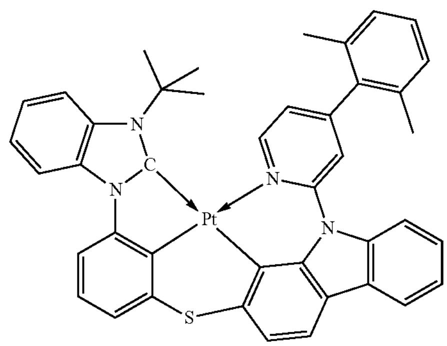
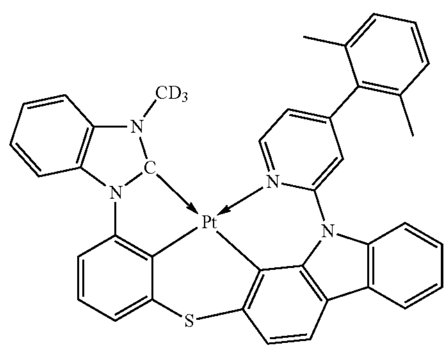

-continued
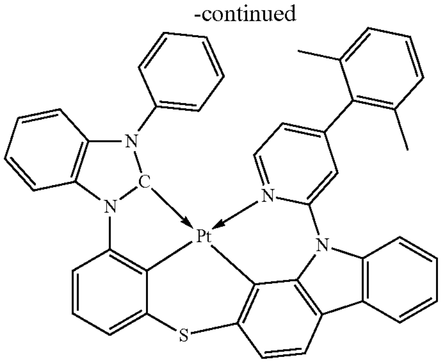
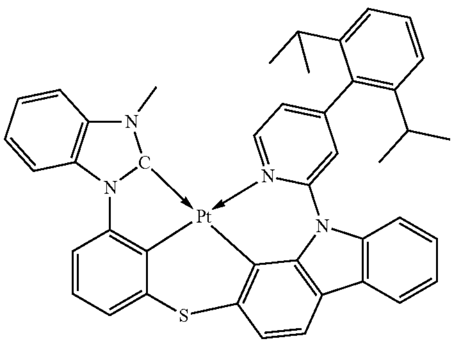
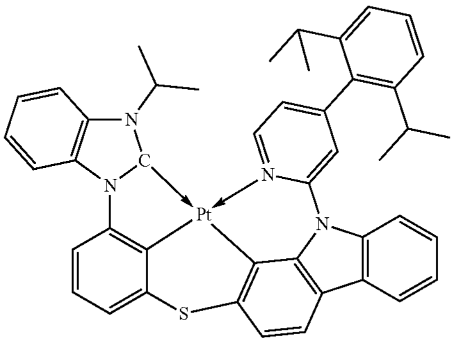
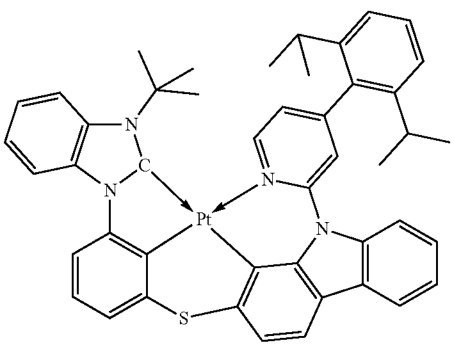
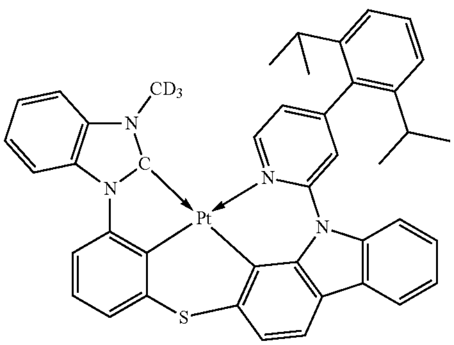
-continued
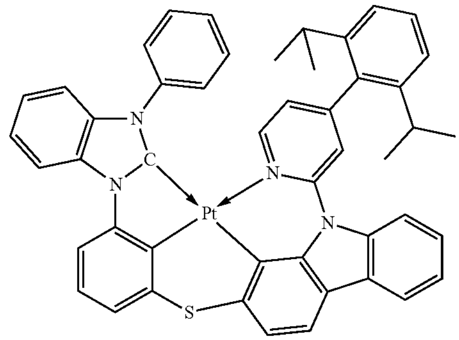
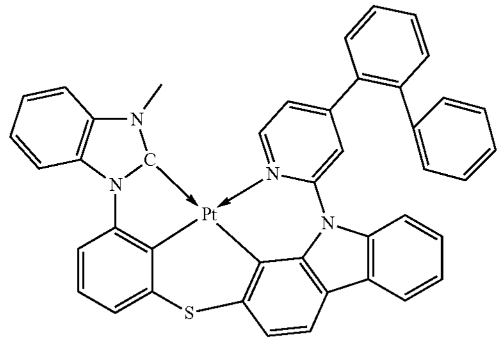
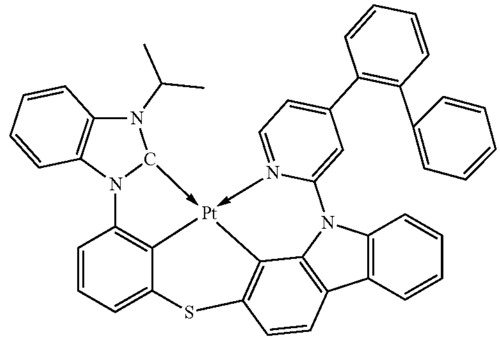
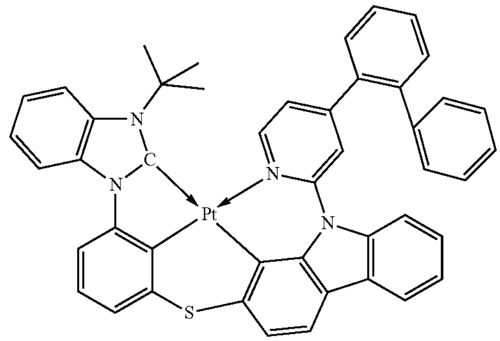
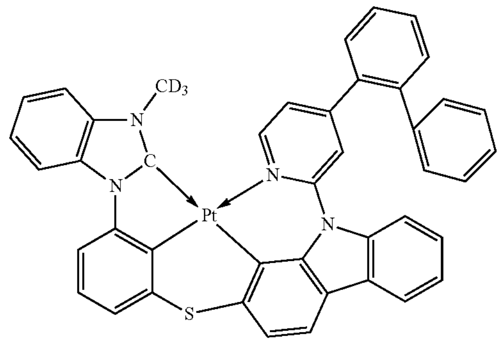

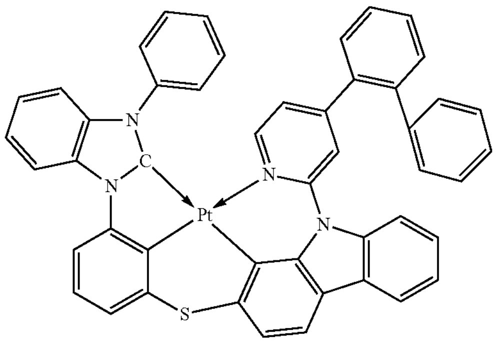
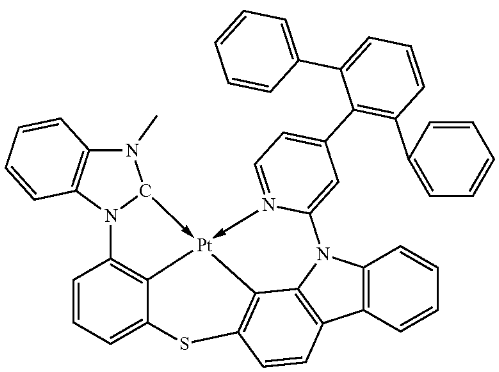
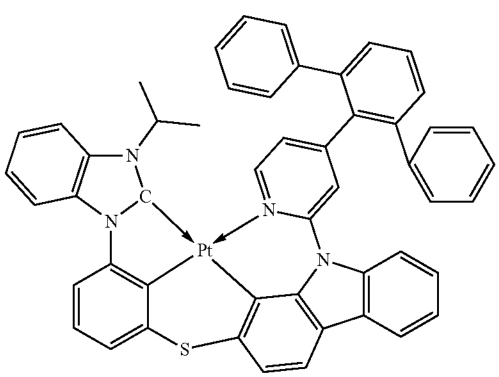
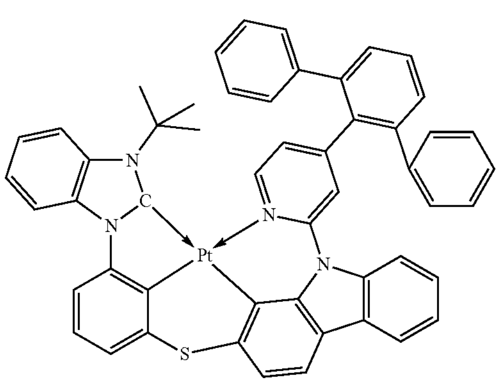
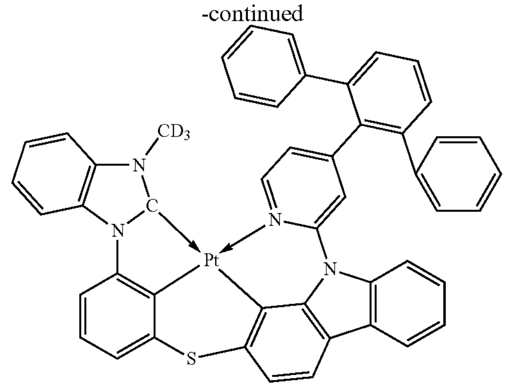
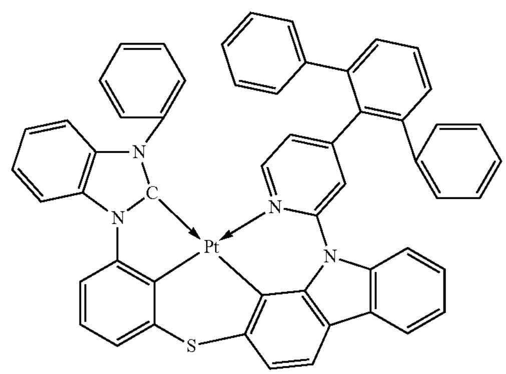
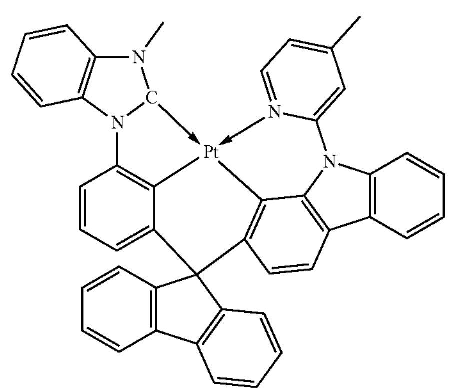
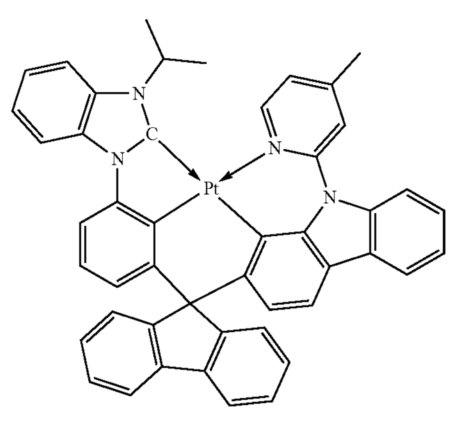

-continued
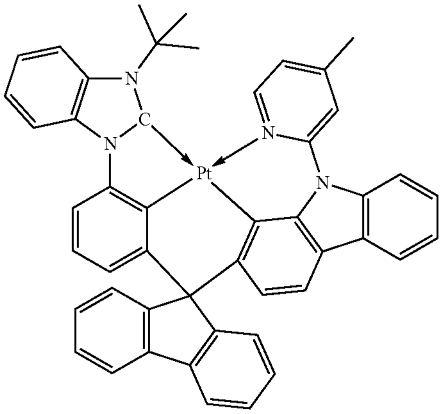
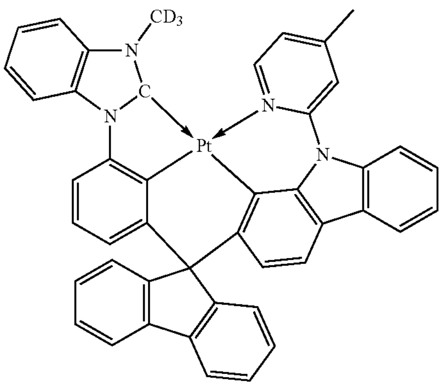
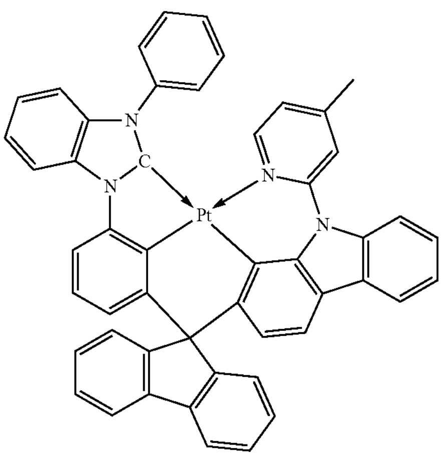
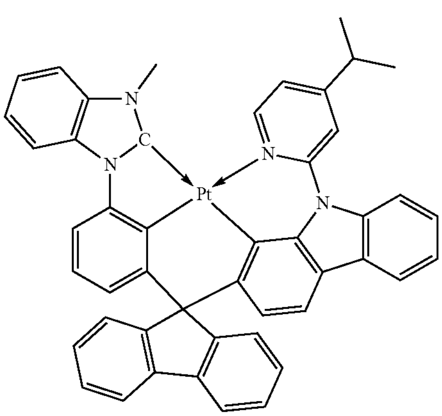
-continued
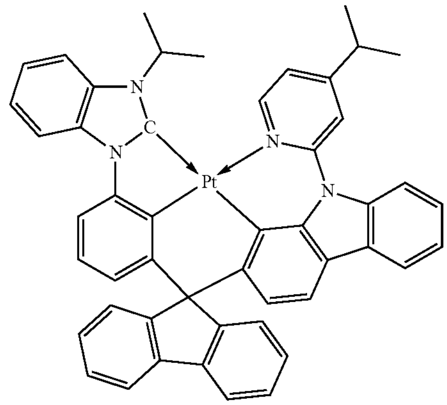
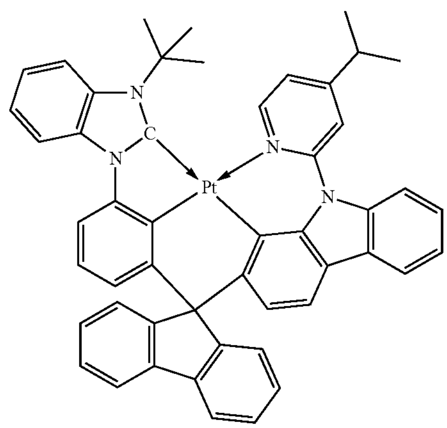
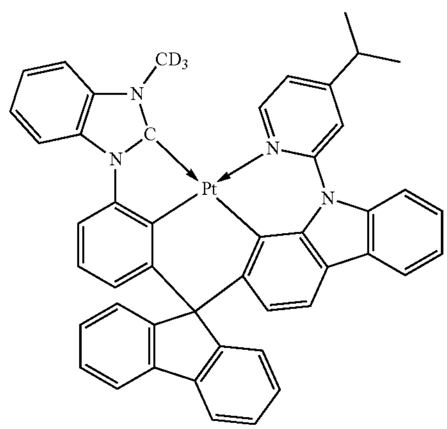
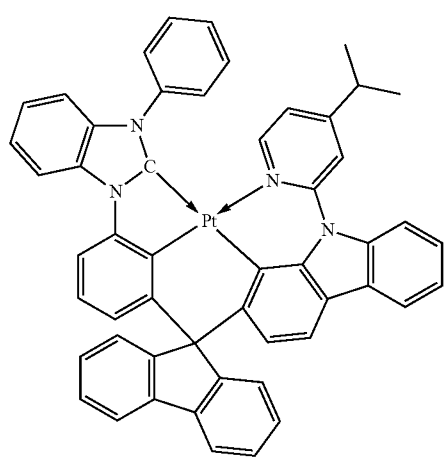

-continued
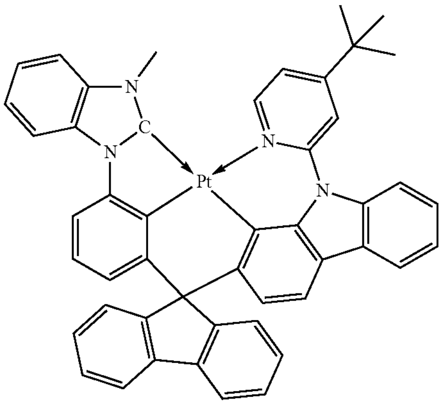
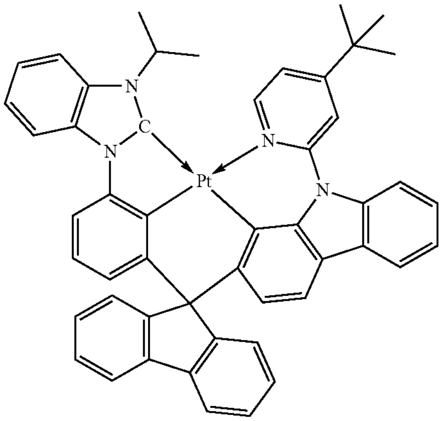
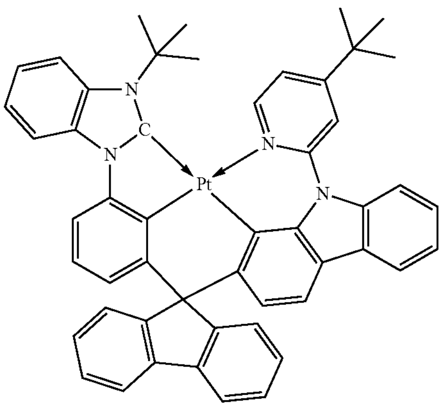
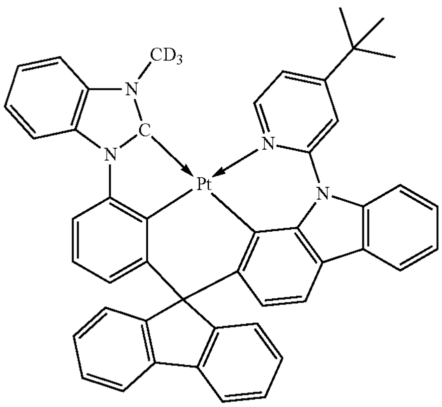
-continued
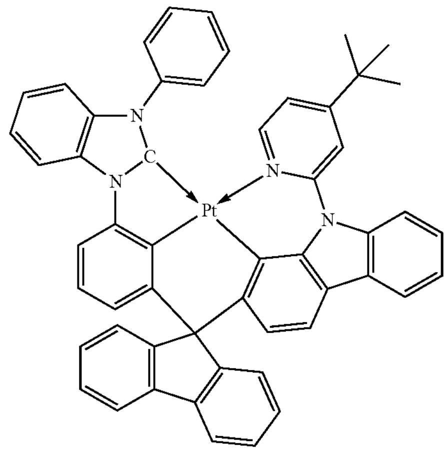
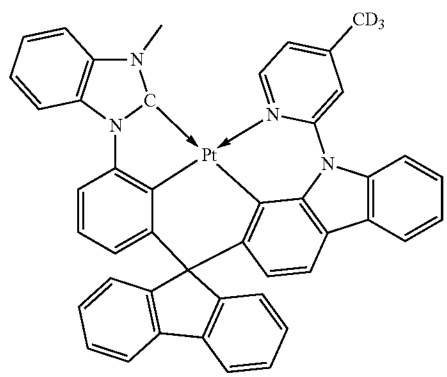
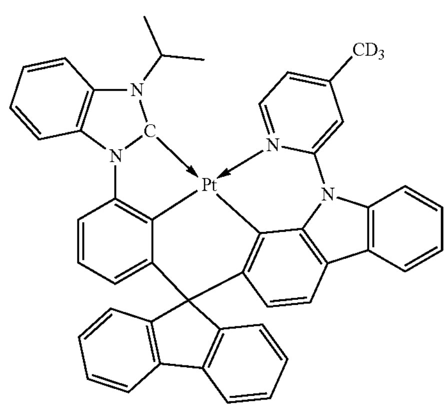
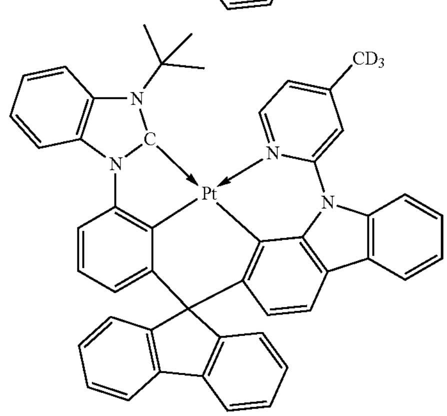

-continued
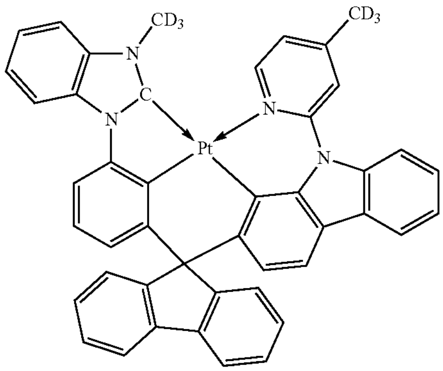
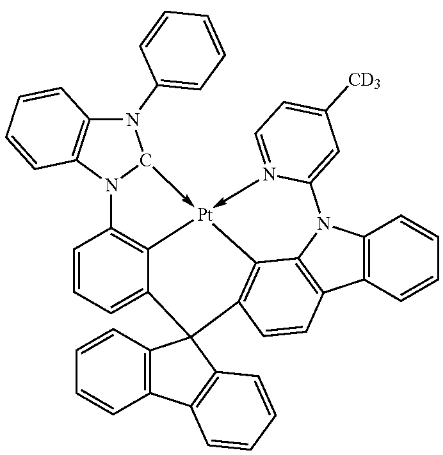
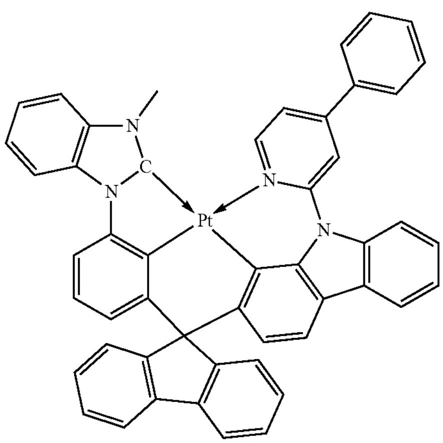
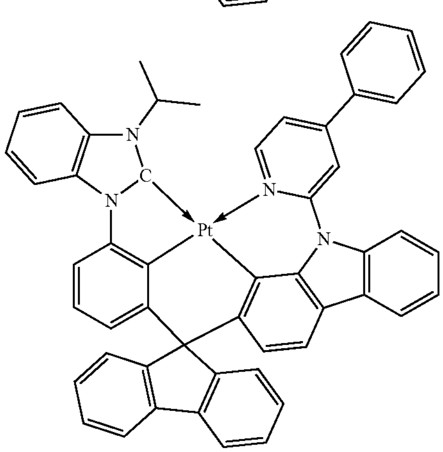
-continued
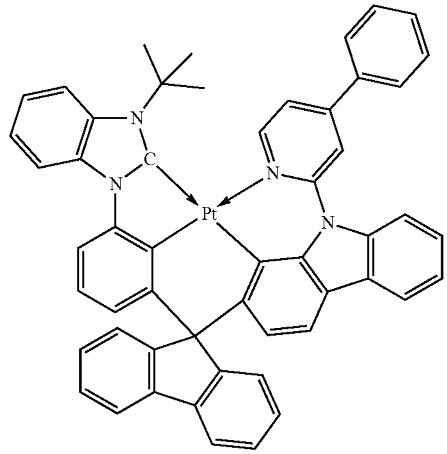
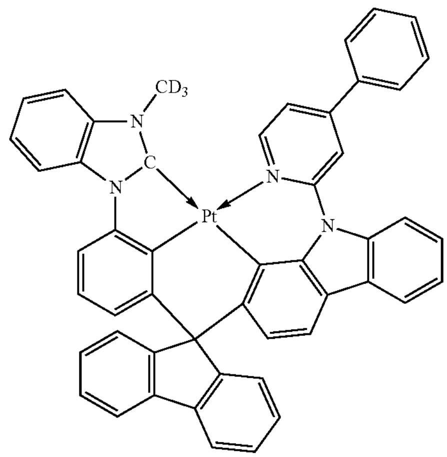
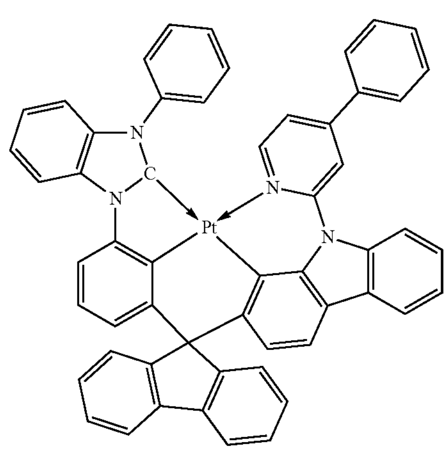

-continued
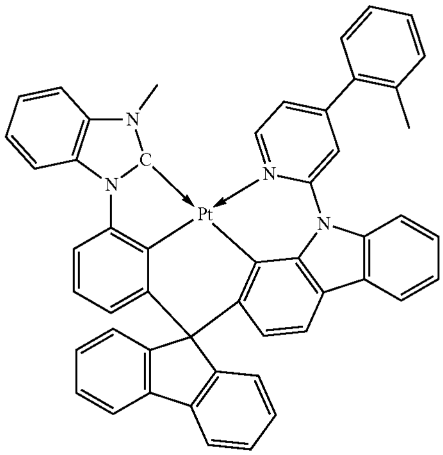
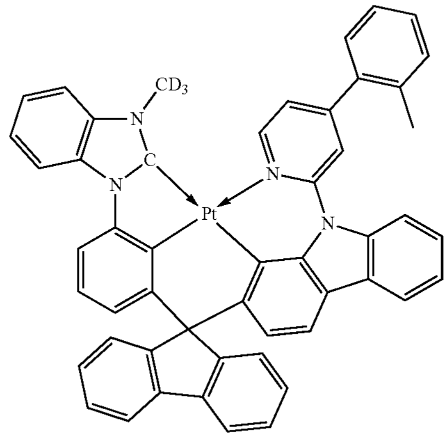
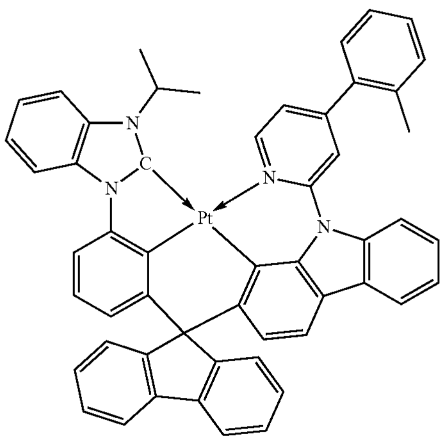
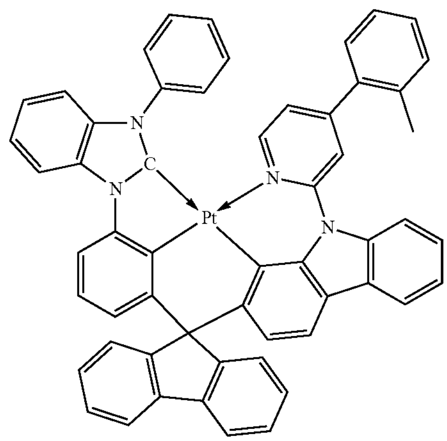
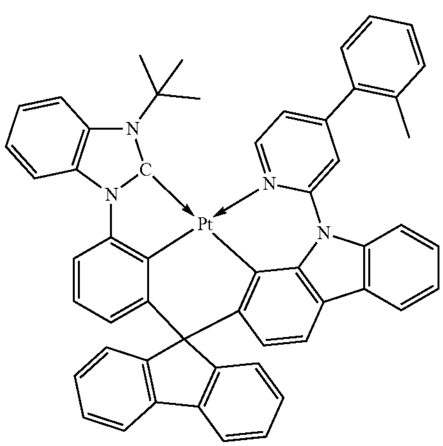
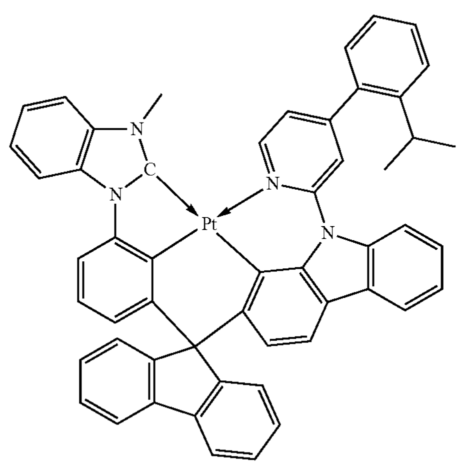

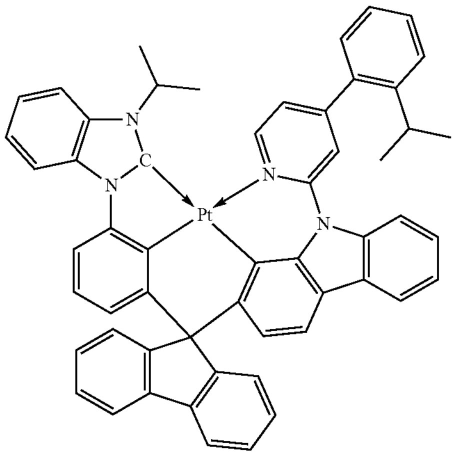
N
C
N
Pt
N
N
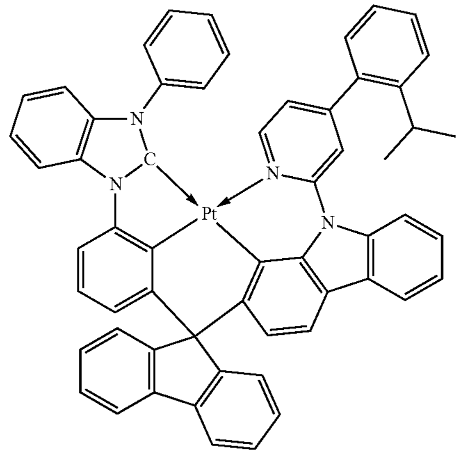
N
C
N
Pt
N
N
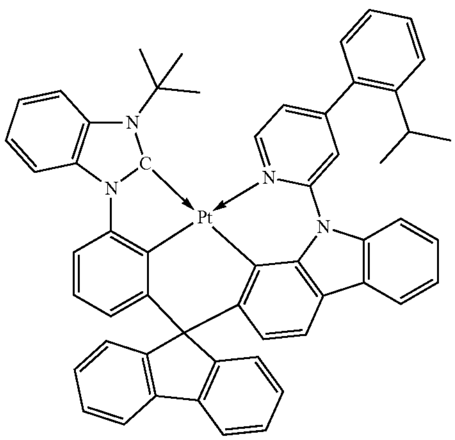
N
C
N
Pt
N
N
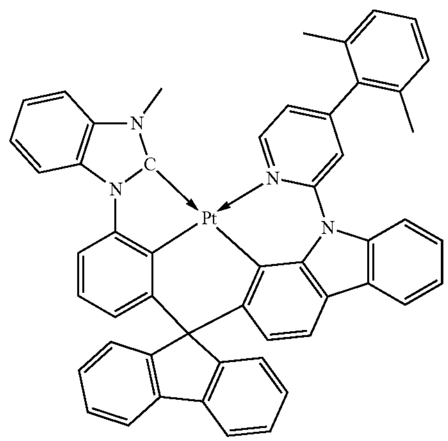
N
C
N
Pt
N
N
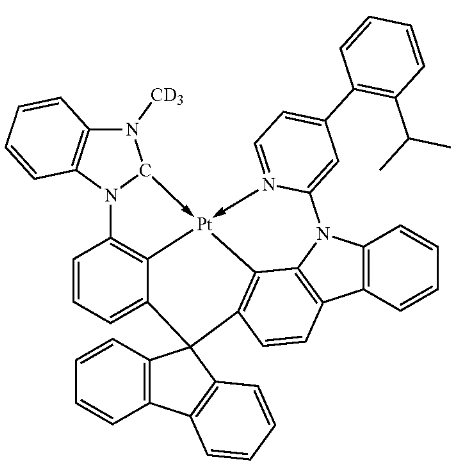
CD3
N
C
N
Pt
N
N
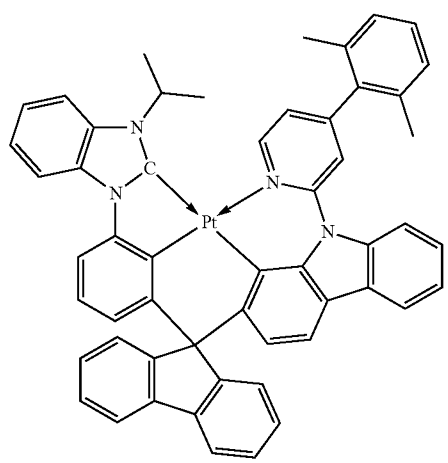
N
C
N
Pt
N
N

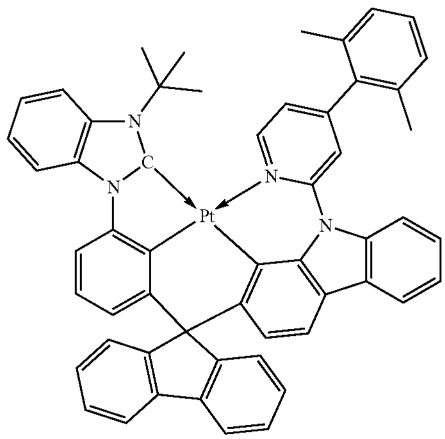
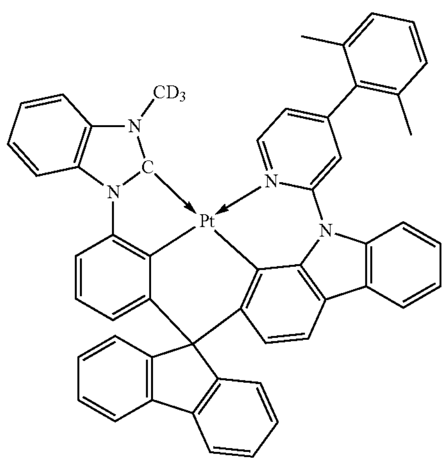
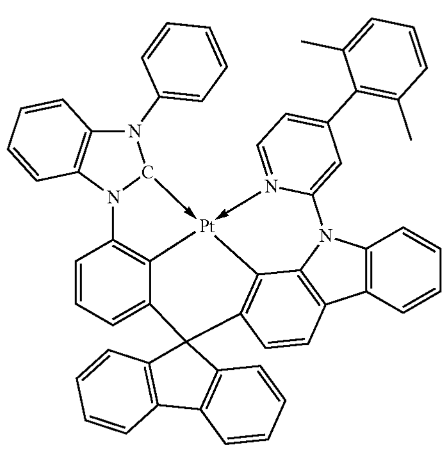
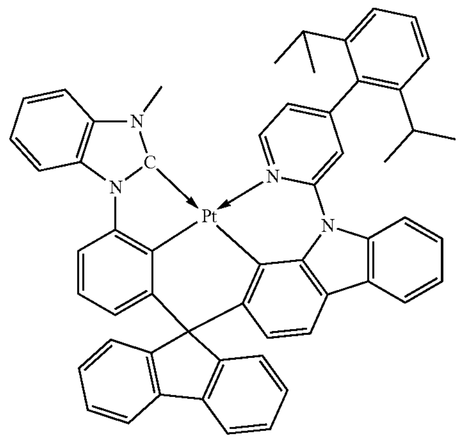
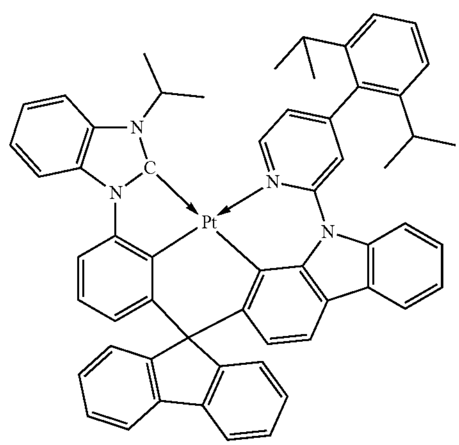
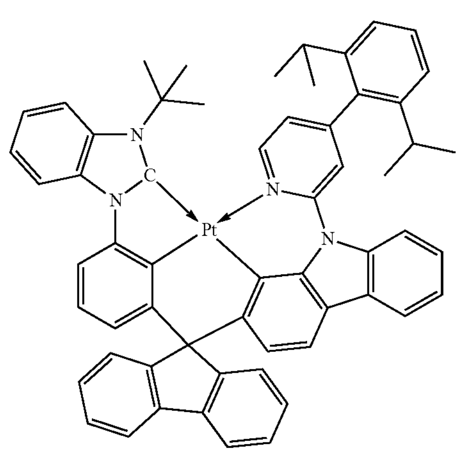

-continued
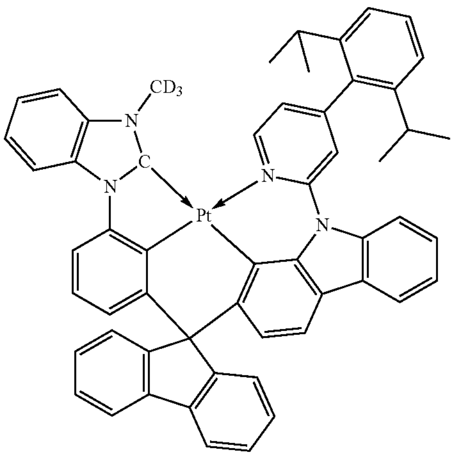
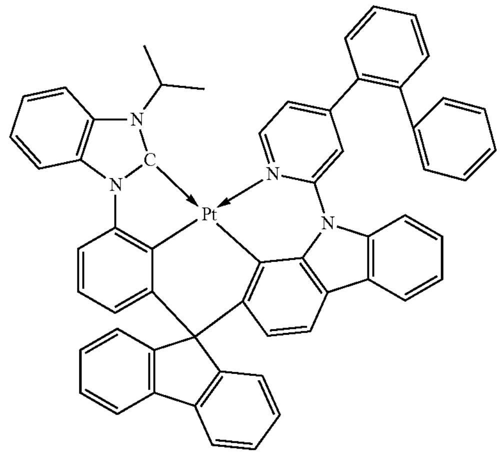
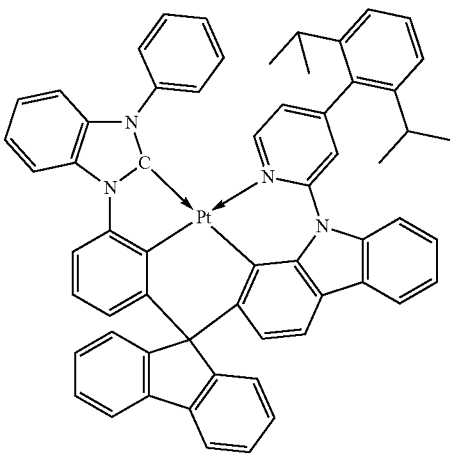
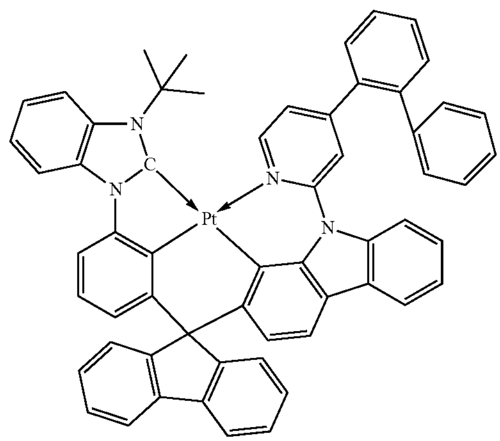
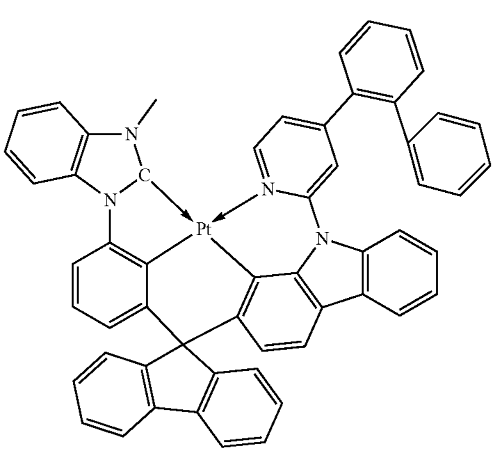
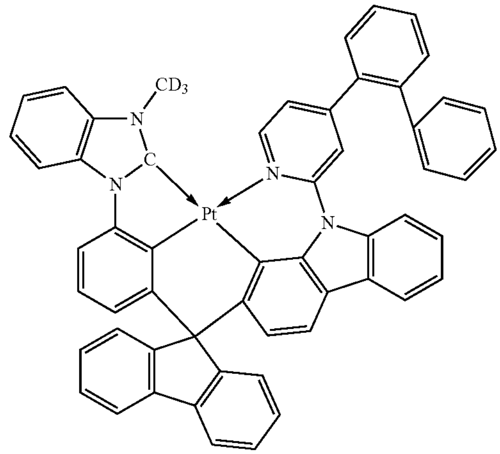
-continued -continued
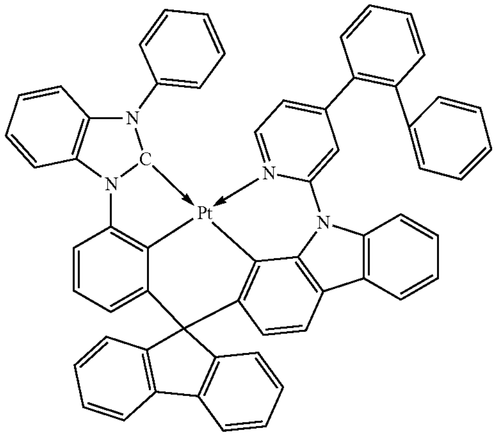
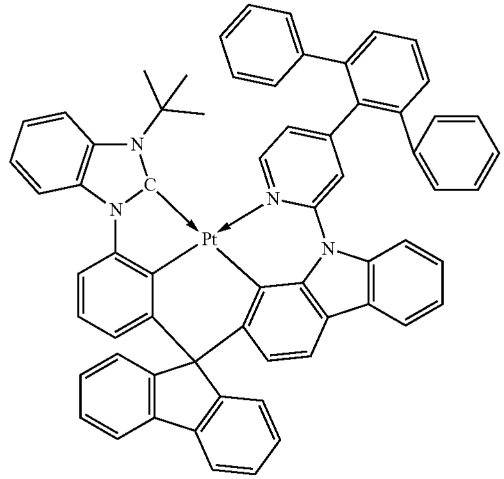
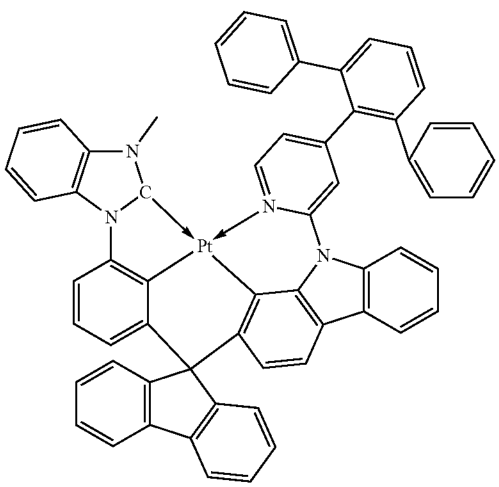
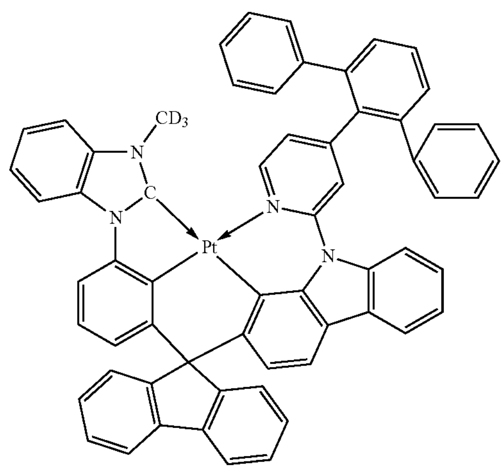
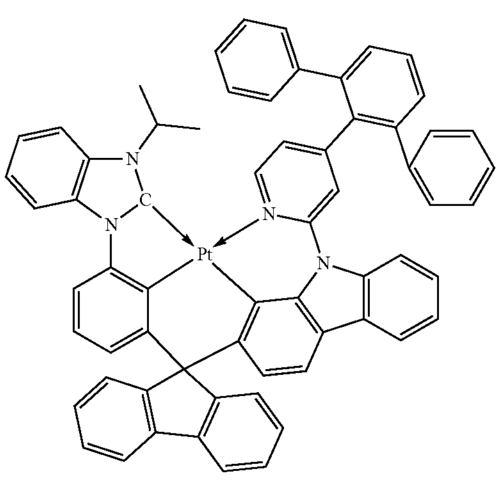
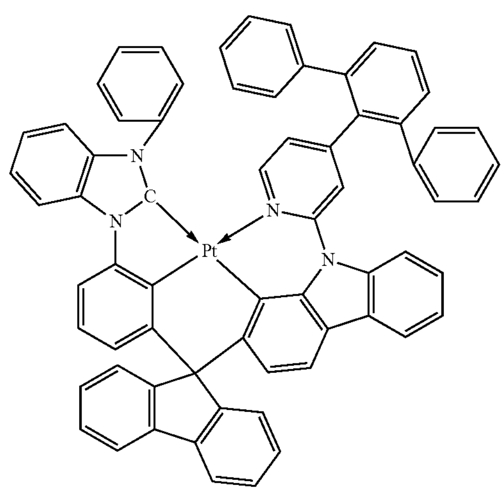

-continued
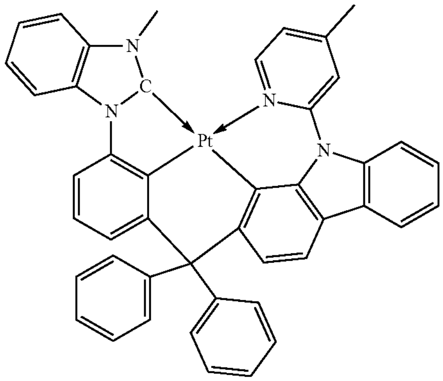
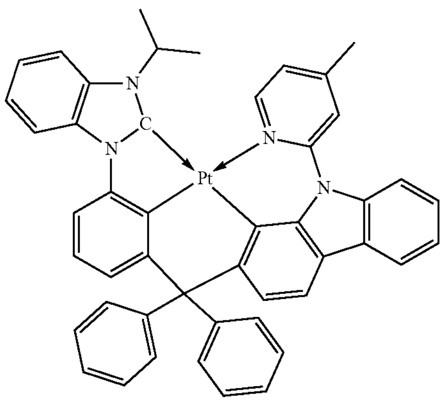
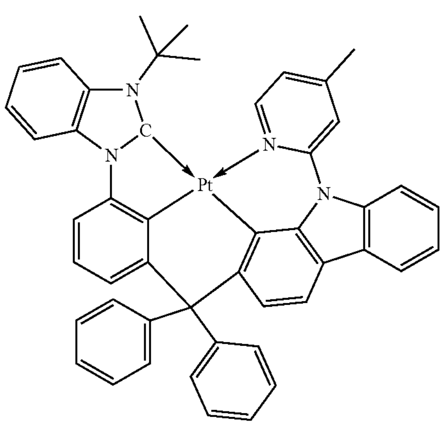
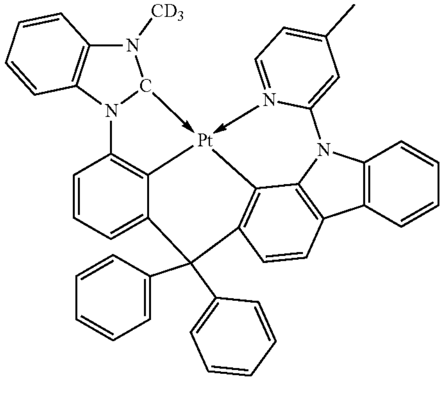
-continued
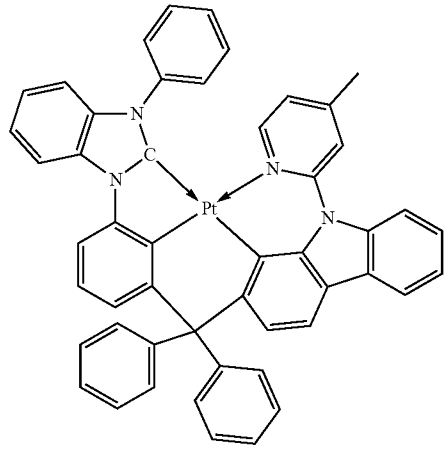
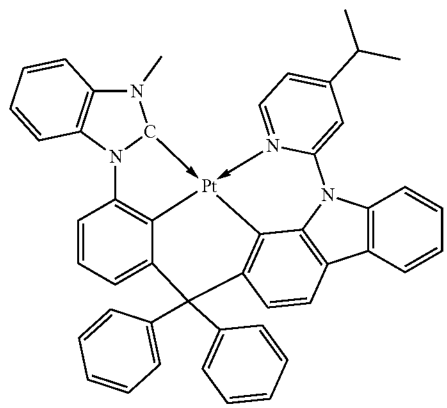
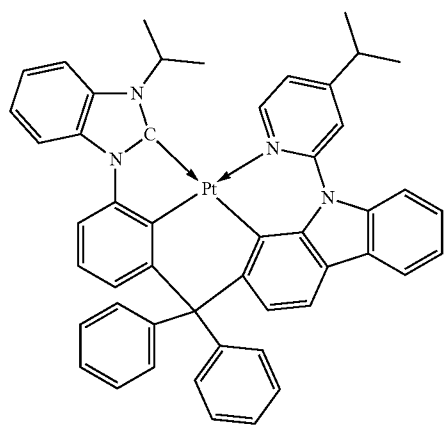
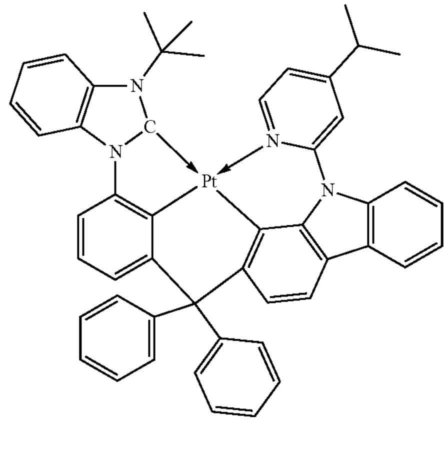

-continued
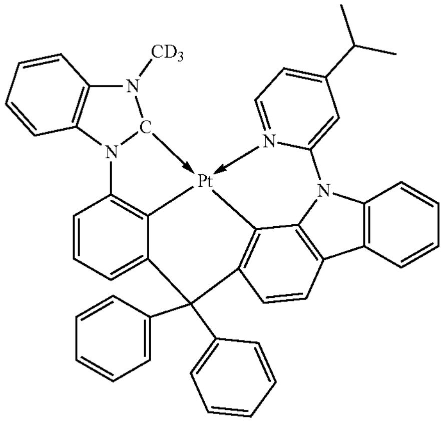
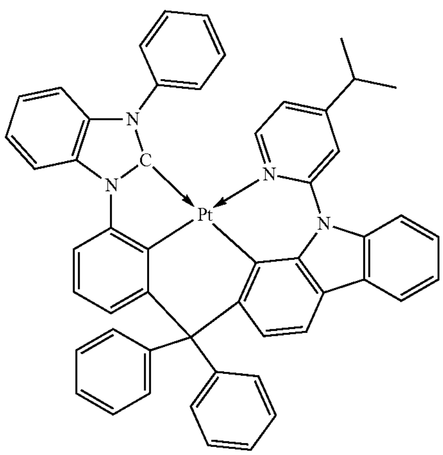
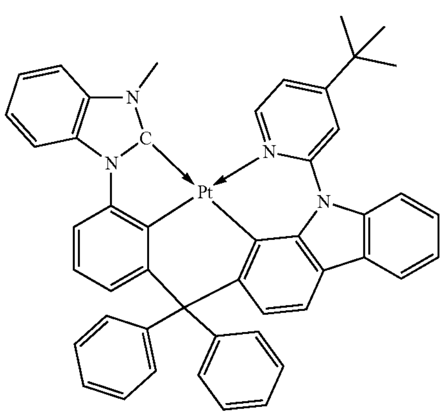
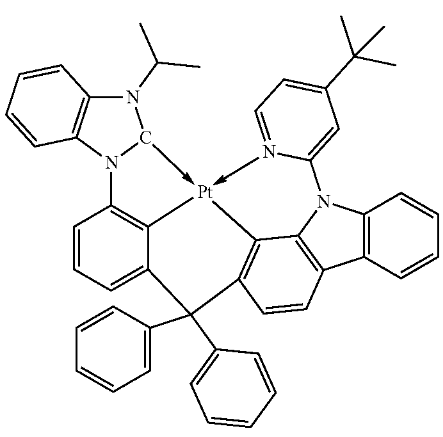
-continued
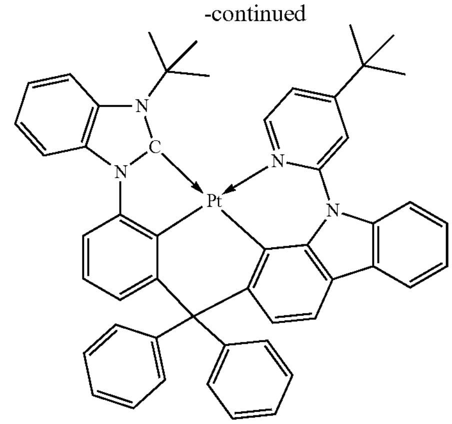
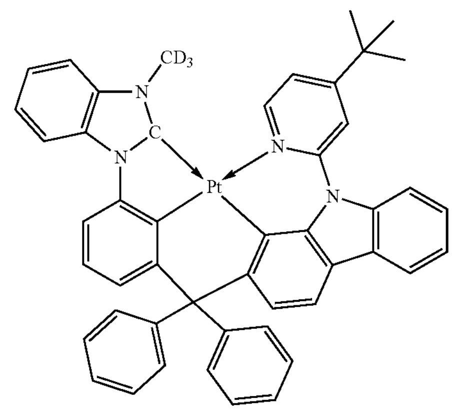
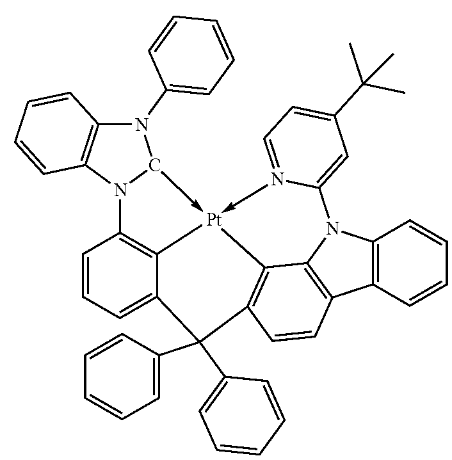
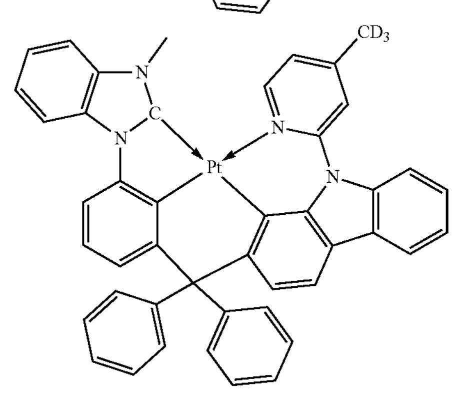

-continued
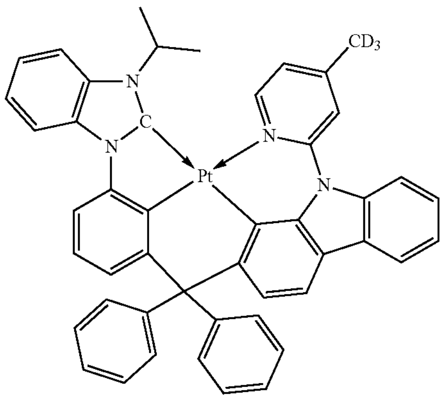
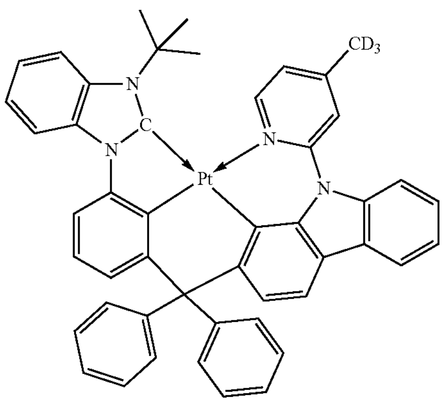
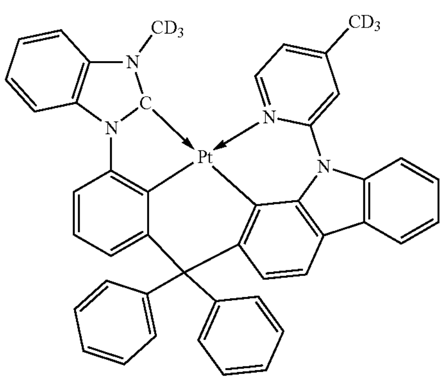
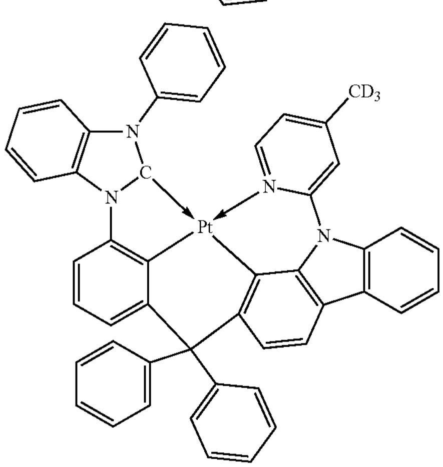
-continued
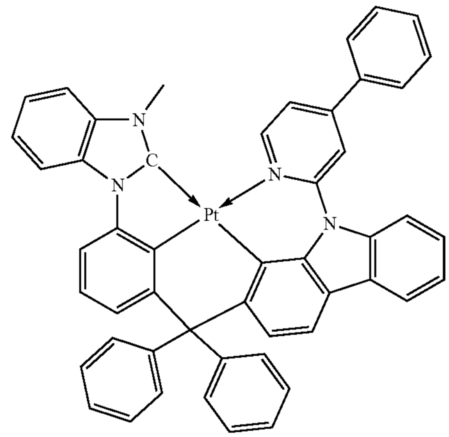
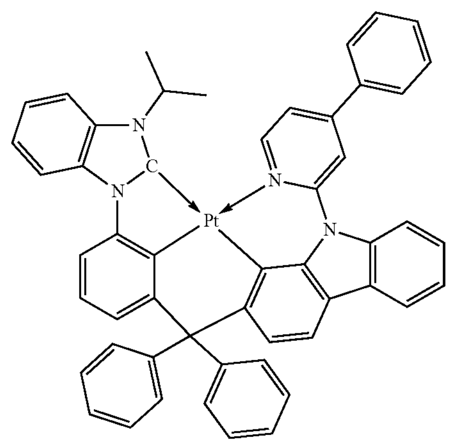
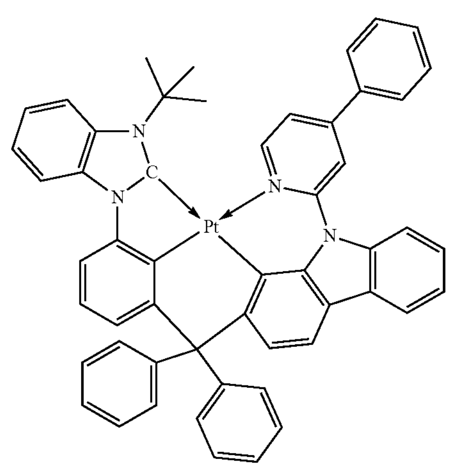

-continued
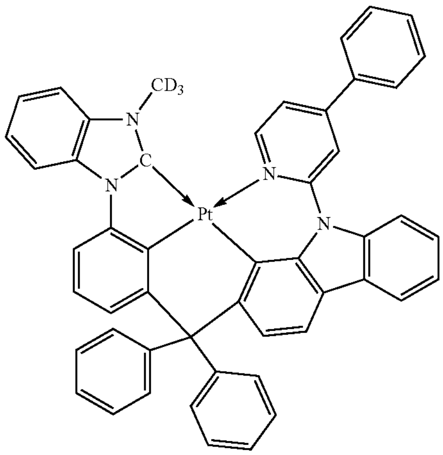
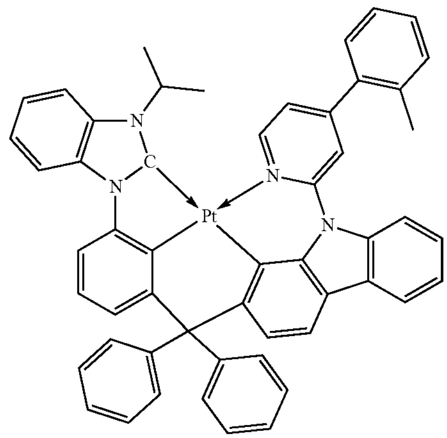
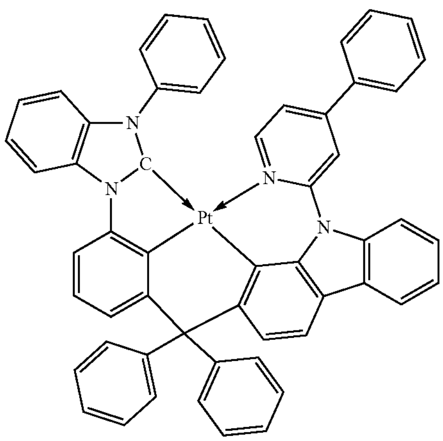
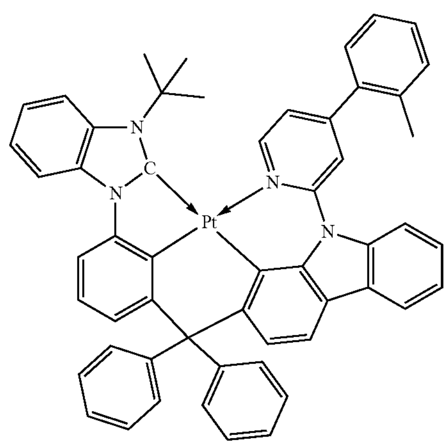
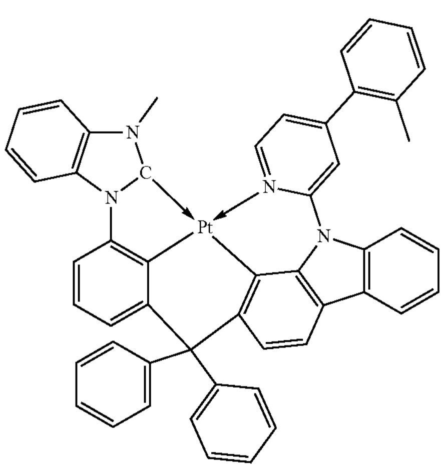
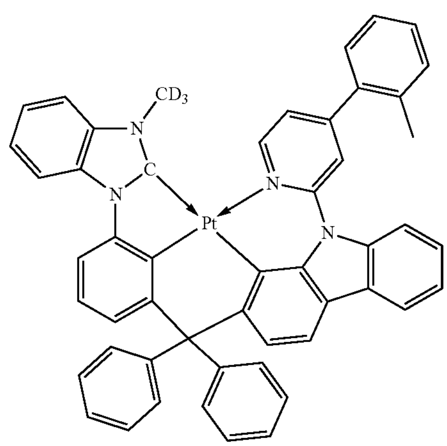
-continued -continued
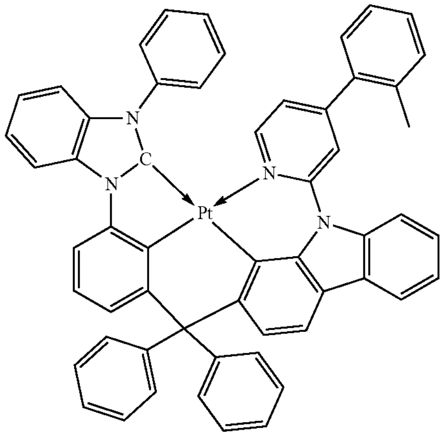
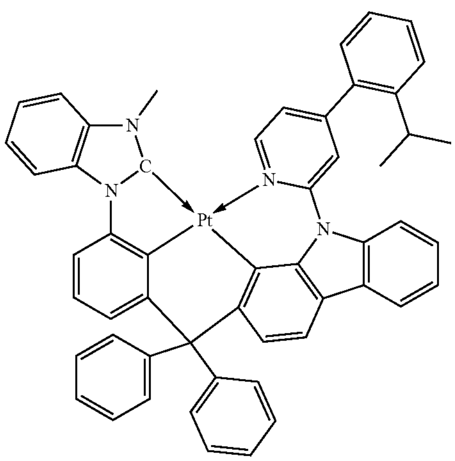
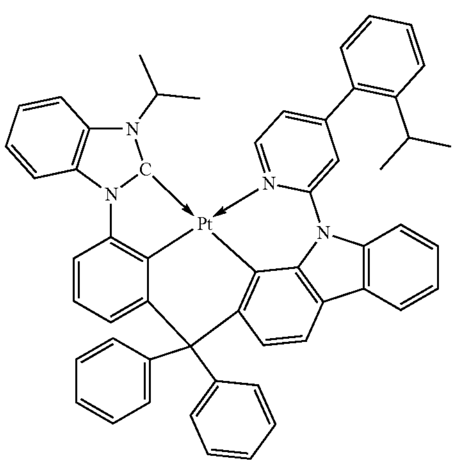
-continued
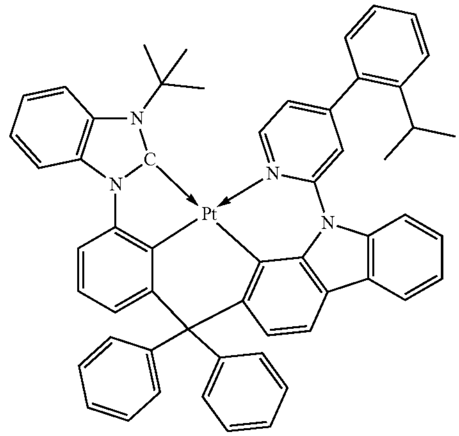
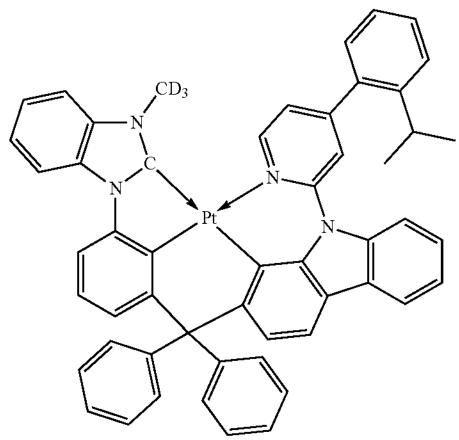
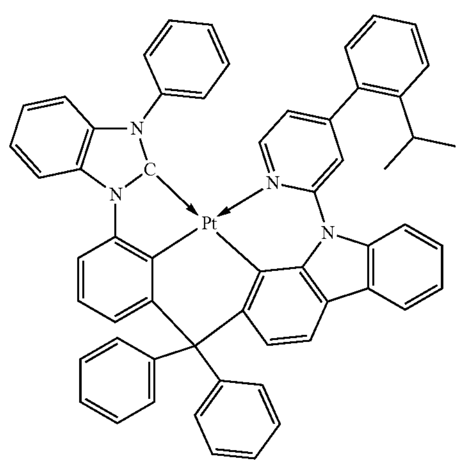

-continued
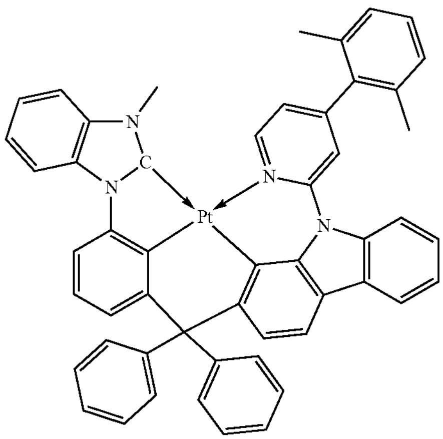
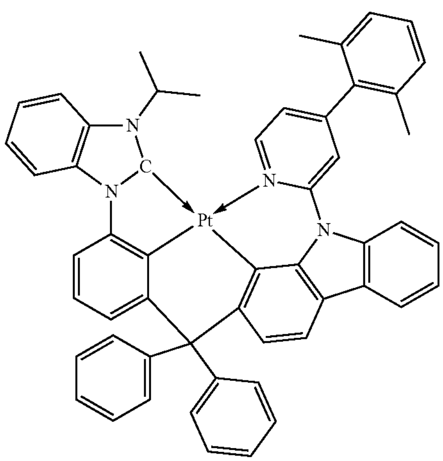
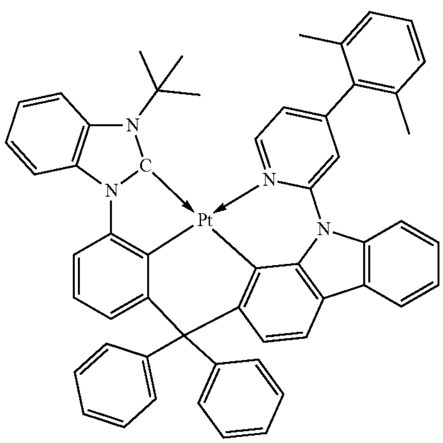
-continued
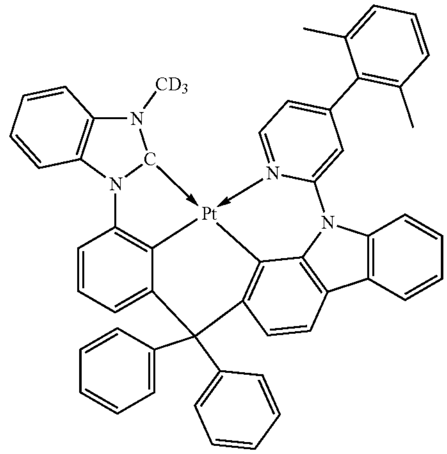
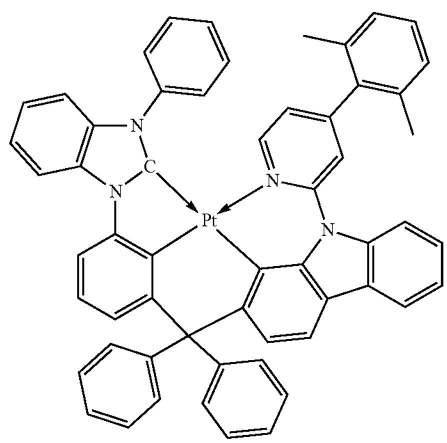
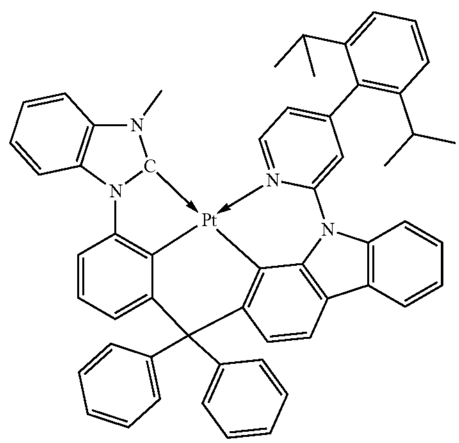

-continued
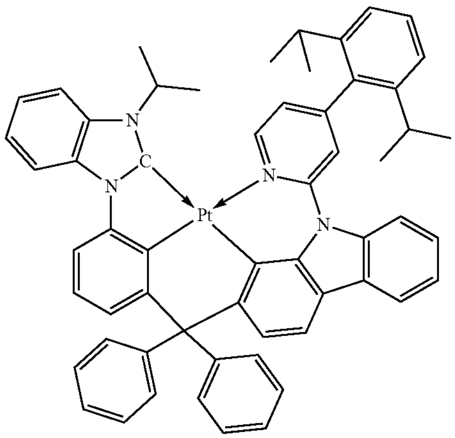
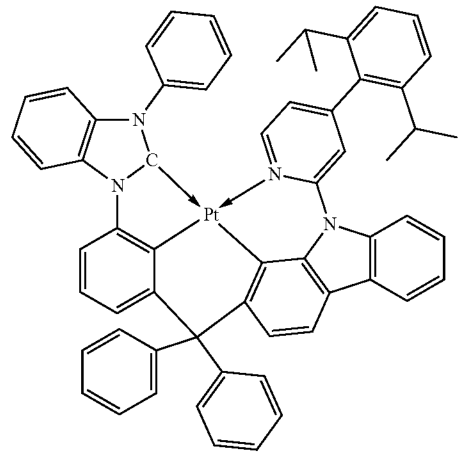
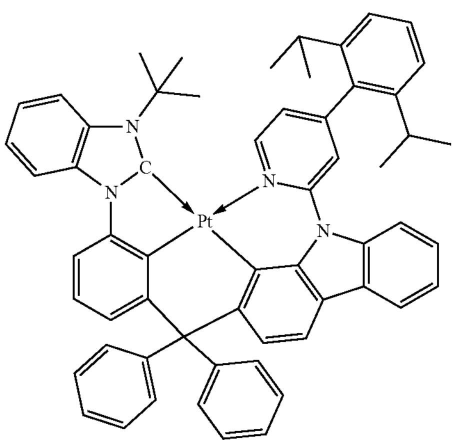
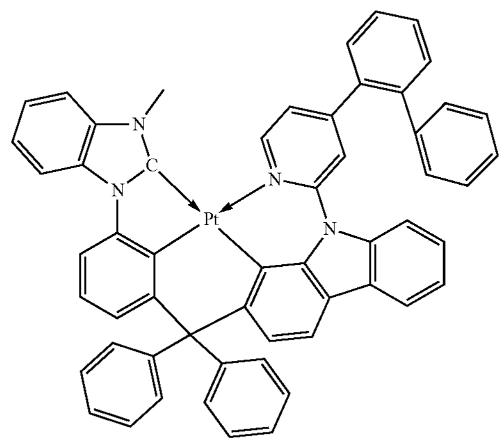
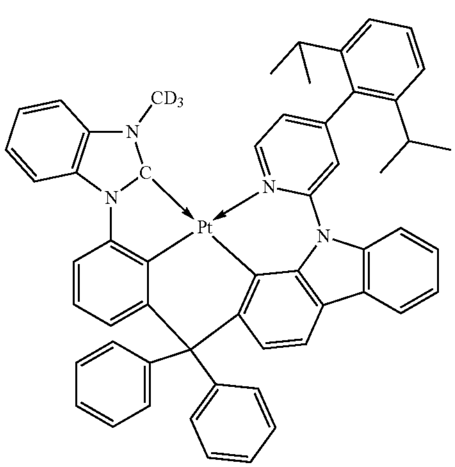
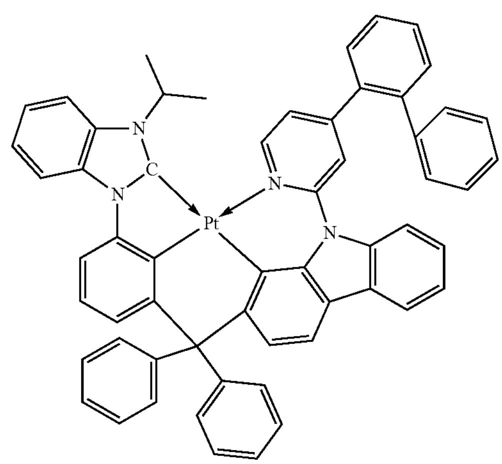

-continued
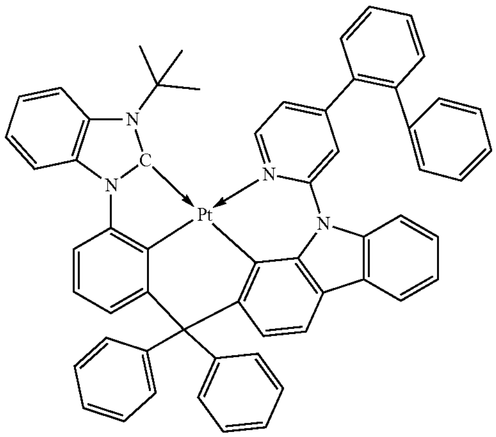
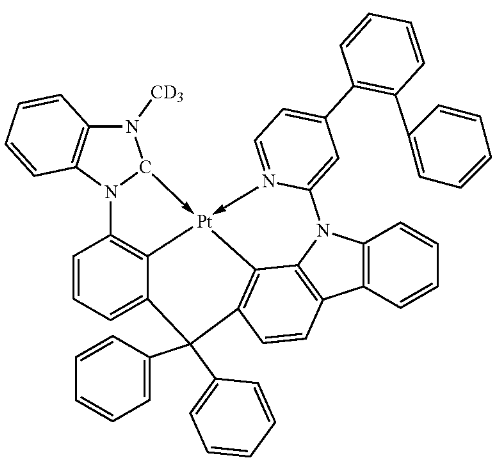
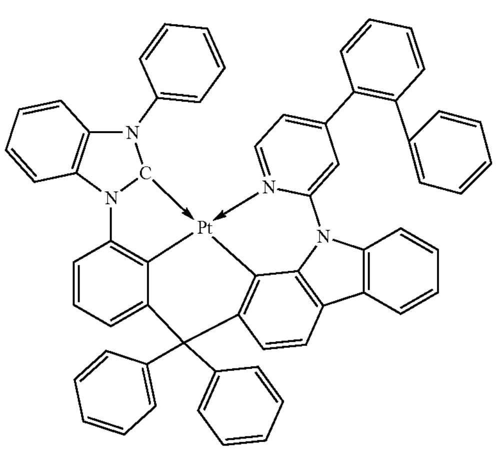
-continued
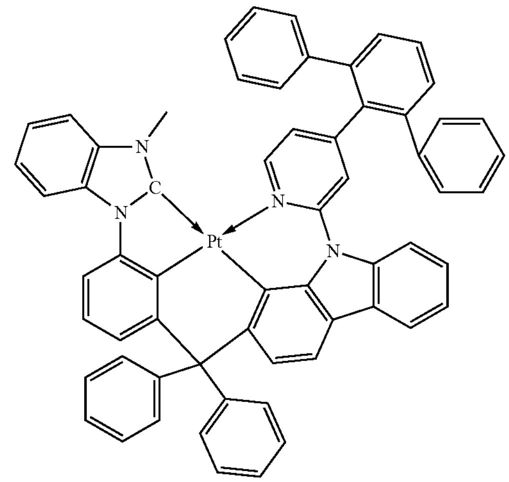
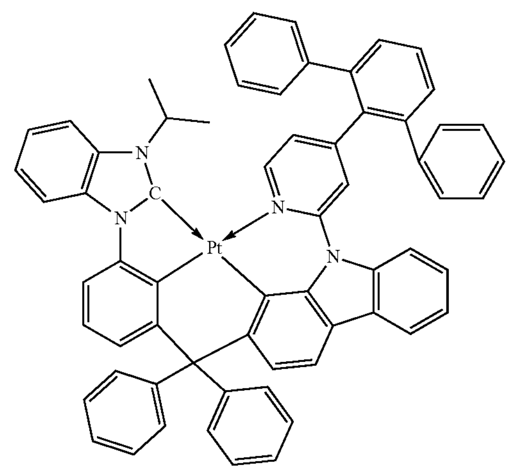
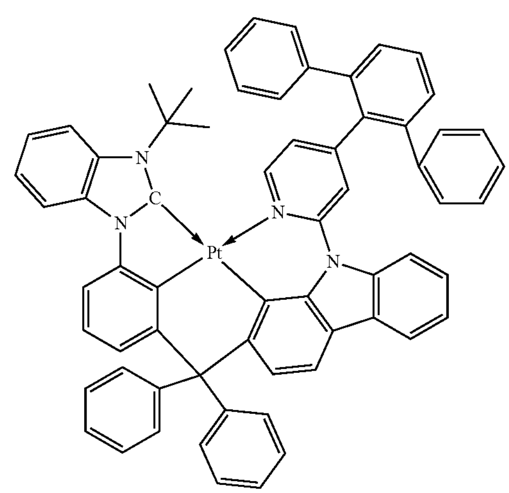

-continued
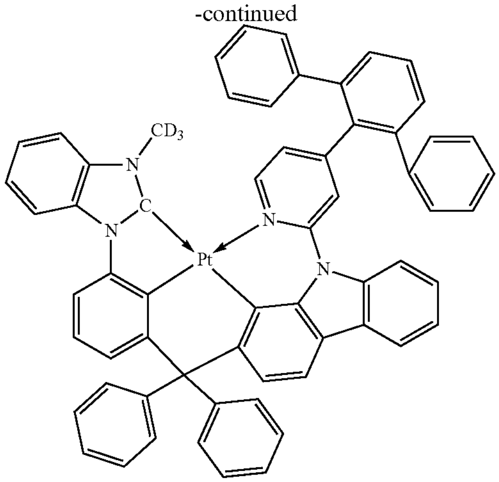
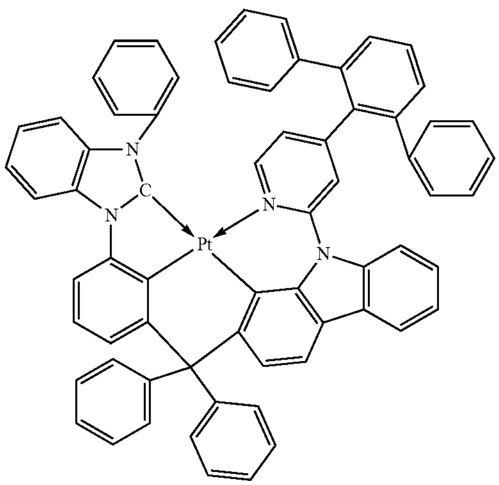
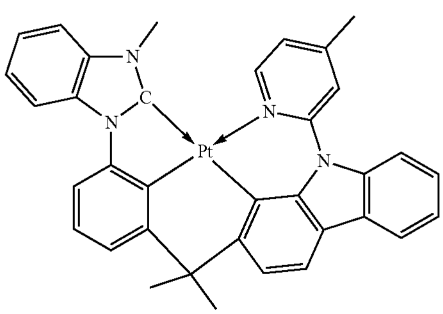
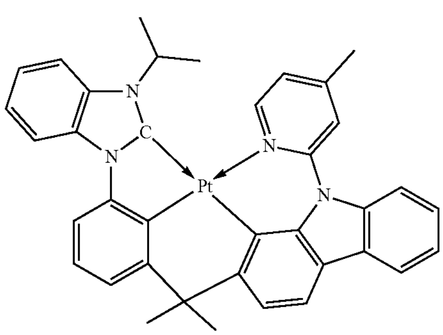
-continued
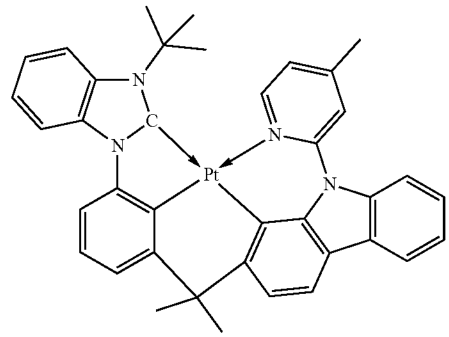
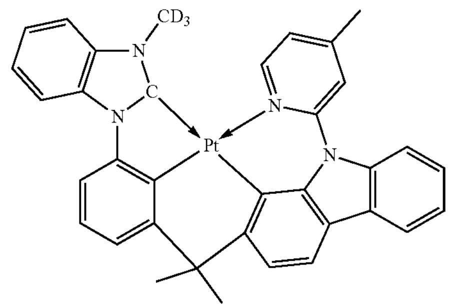
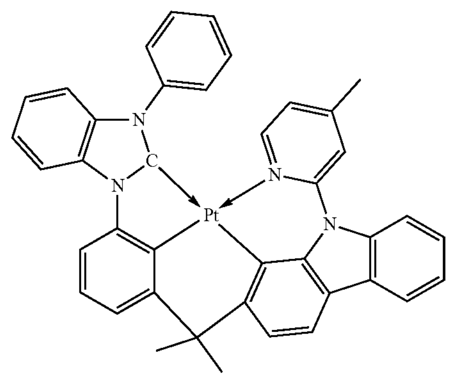
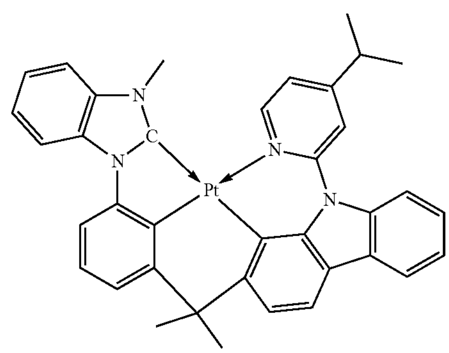
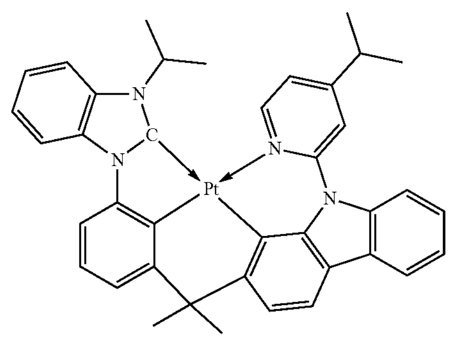

-continued
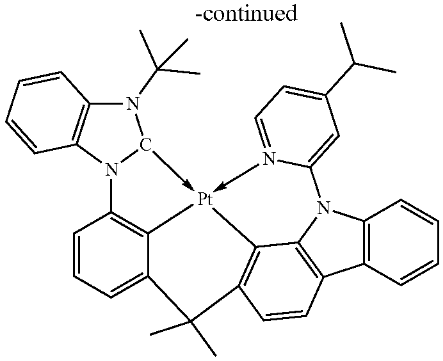
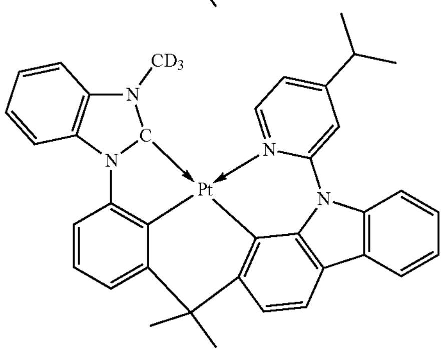
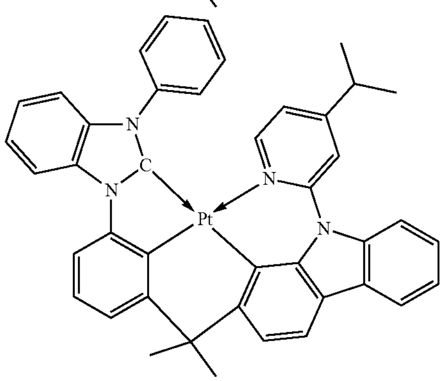
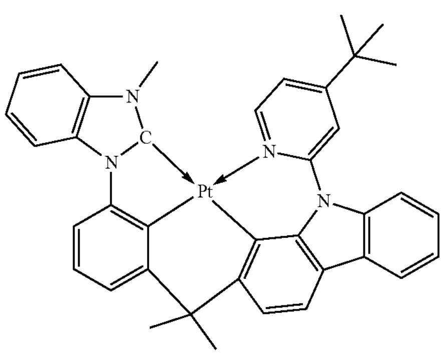
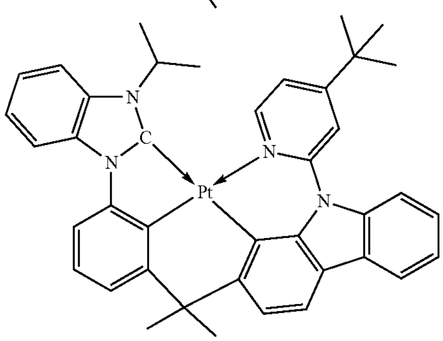
-continued
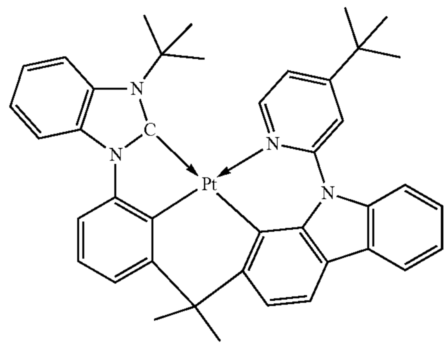
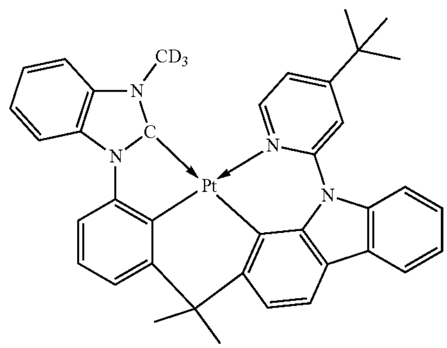
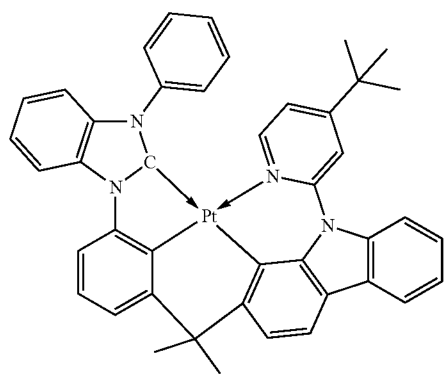
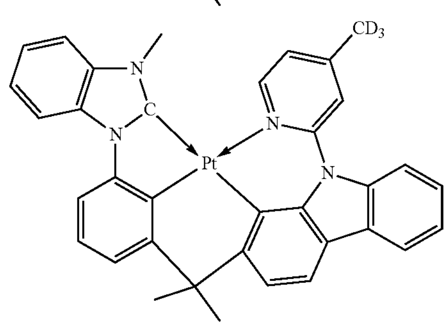
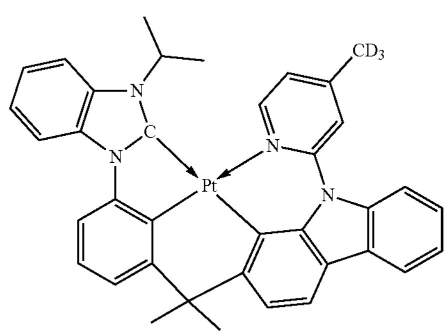

-continued
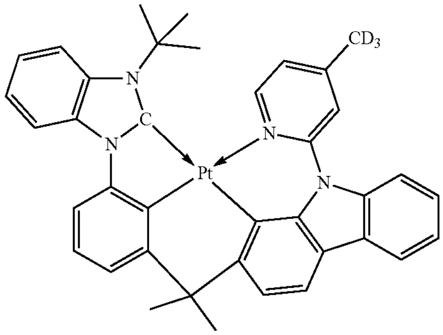
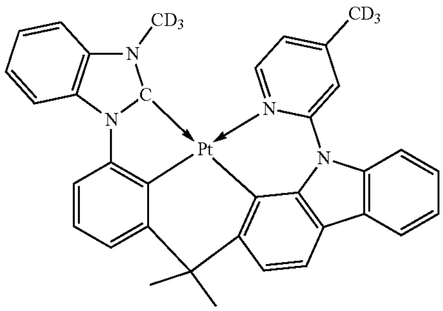
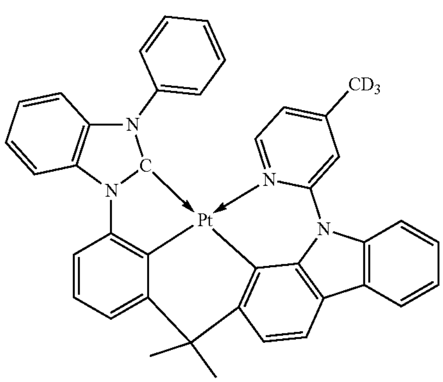
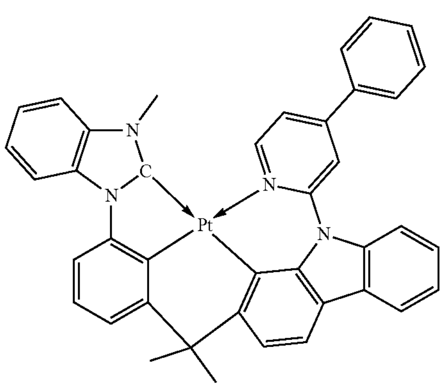
-continued
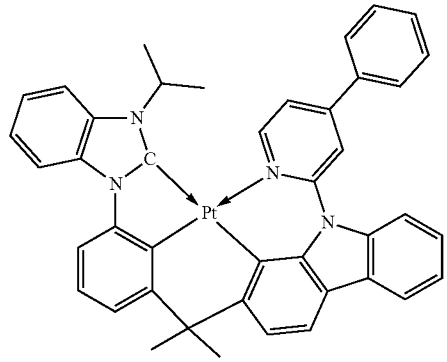
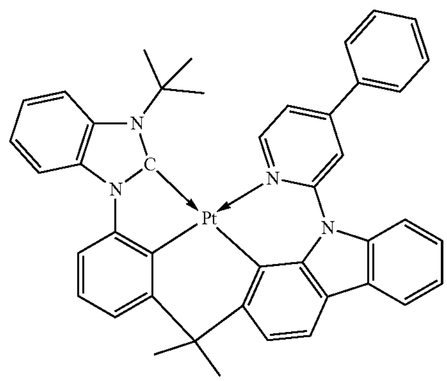
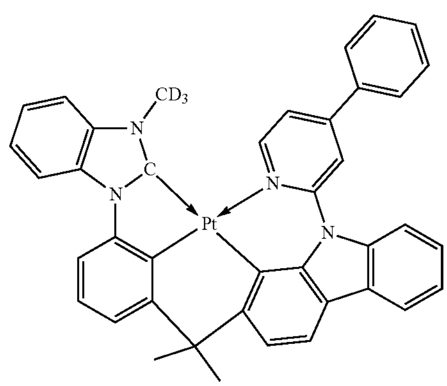
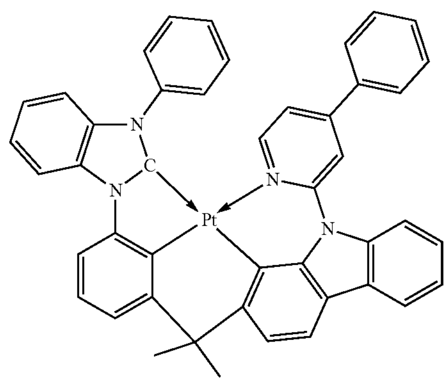

-continued
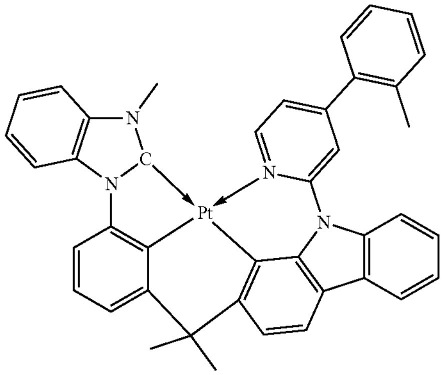
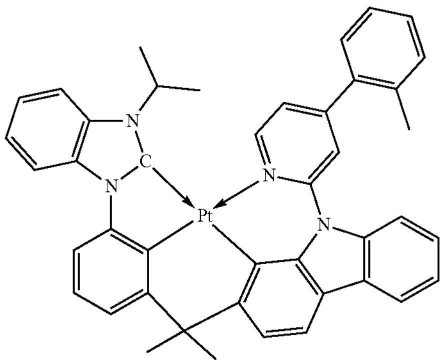
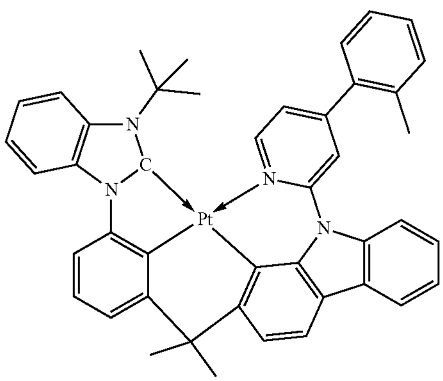
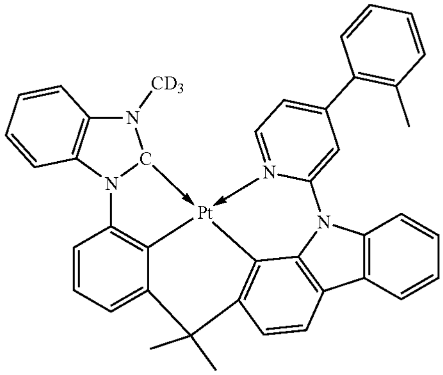
-continued
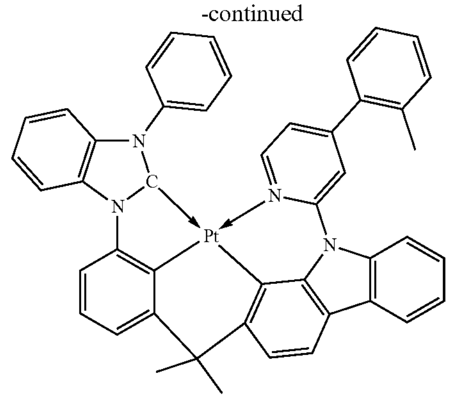
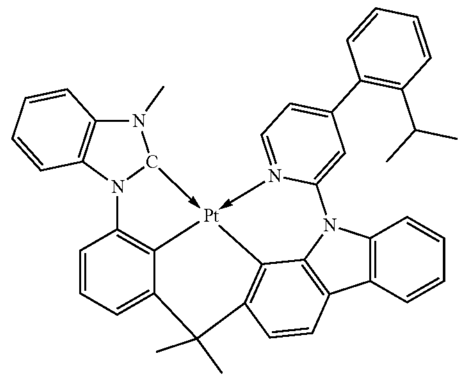
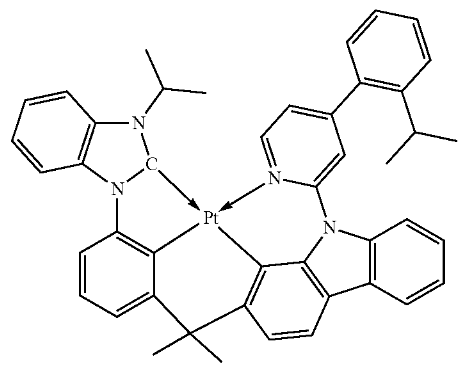
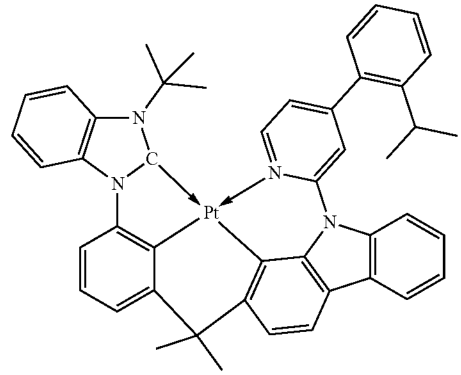

-continued
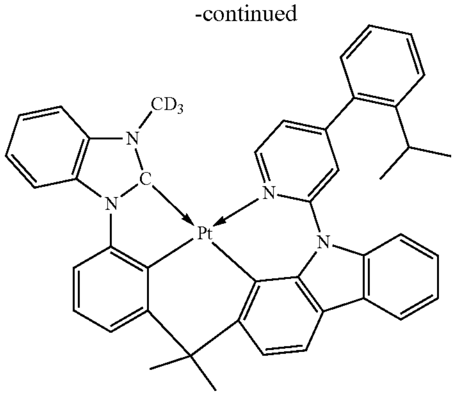
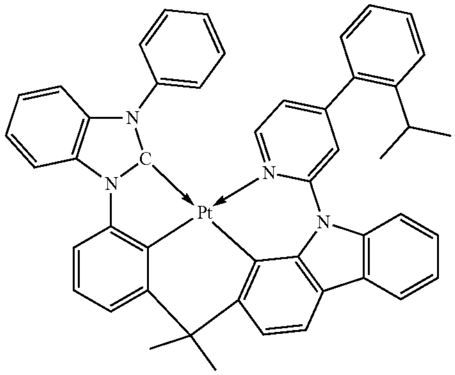
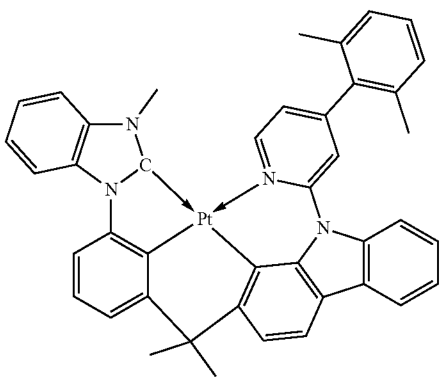
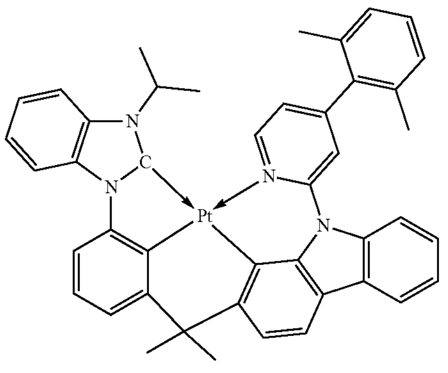
-continued
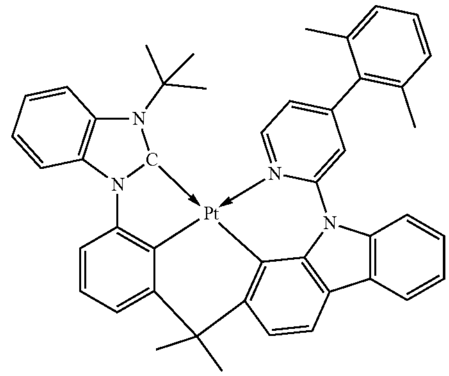
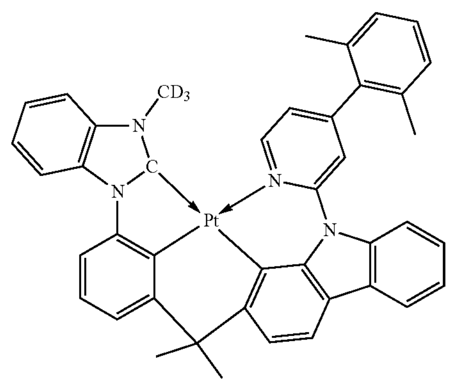
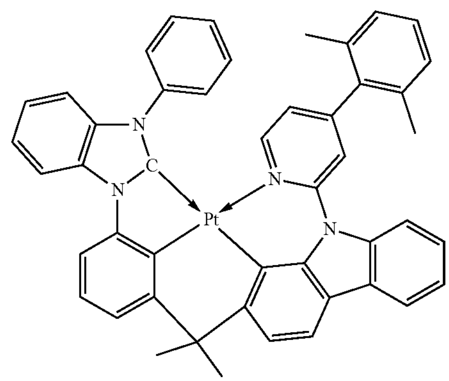
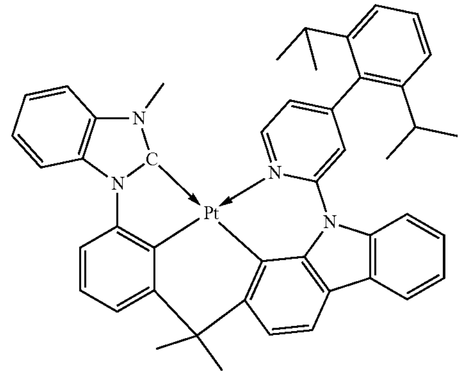

-continued
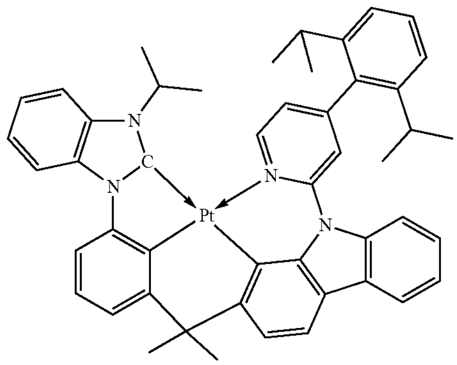
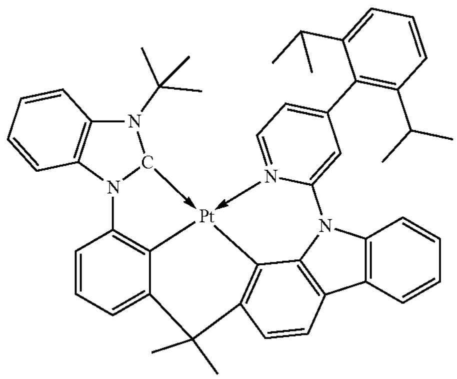
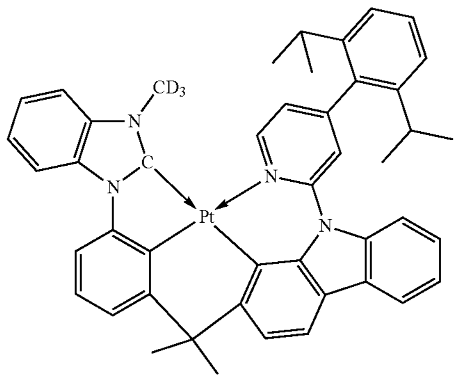
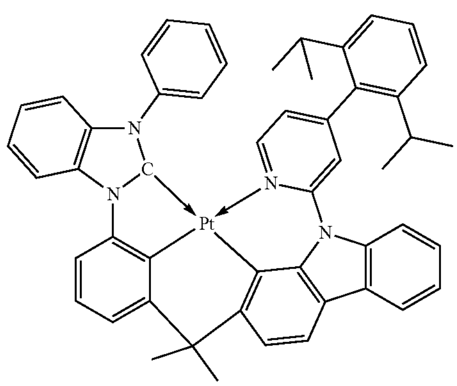
-continued
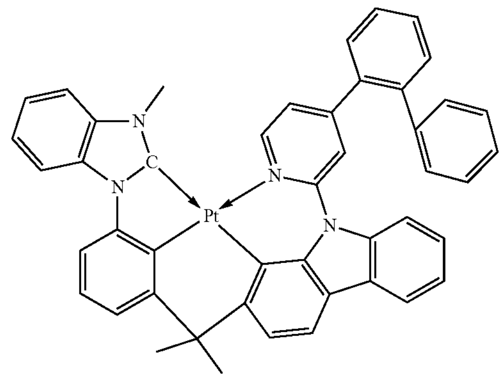
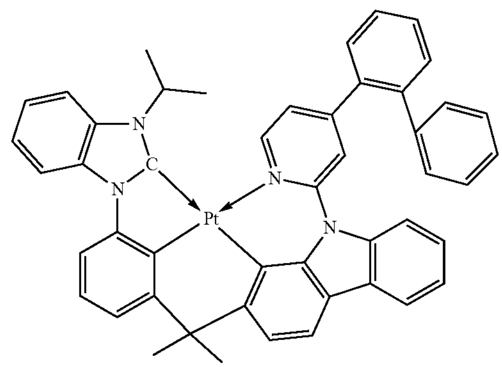
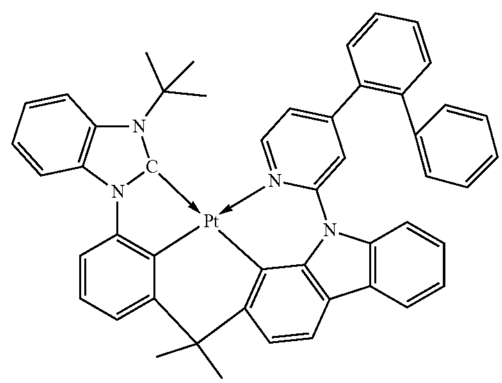
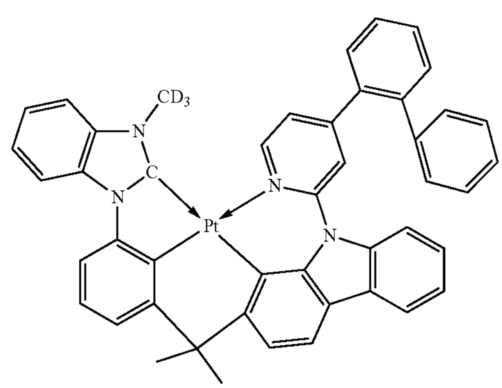

-continued
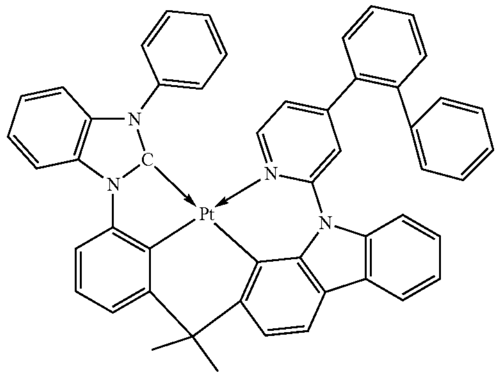
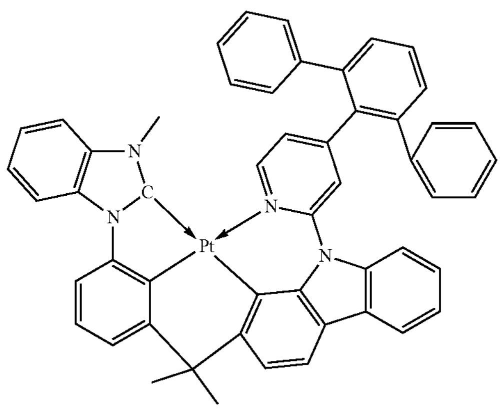
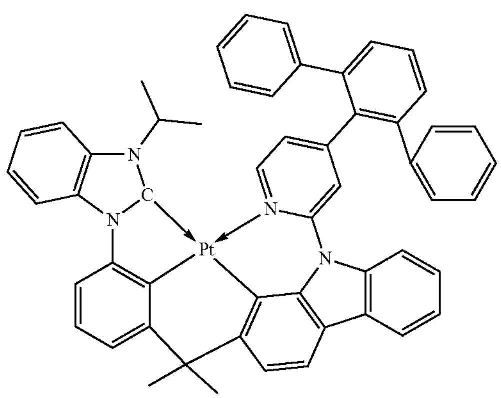
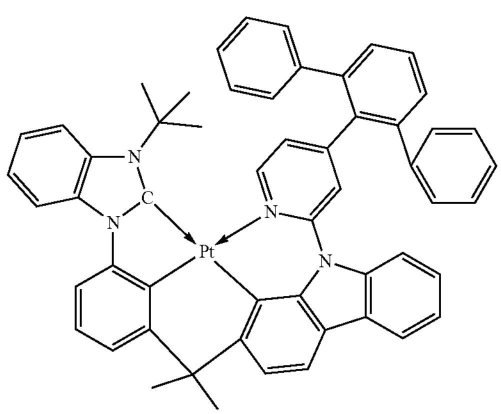
-continued
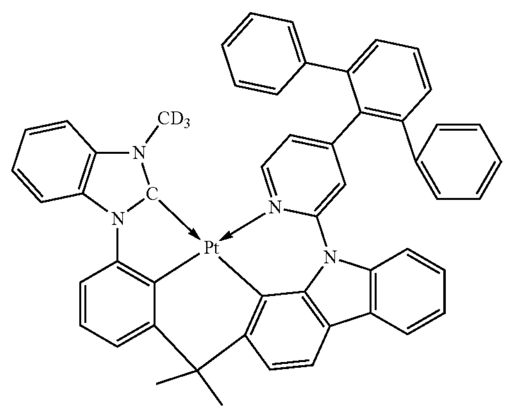
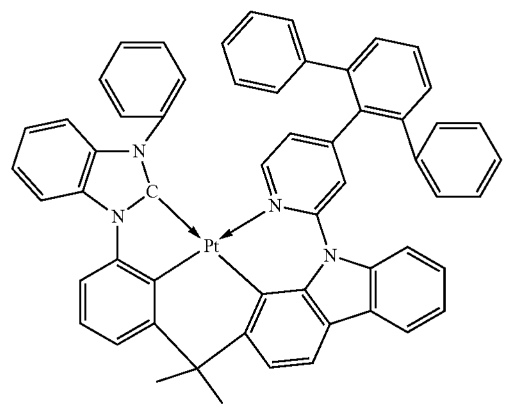
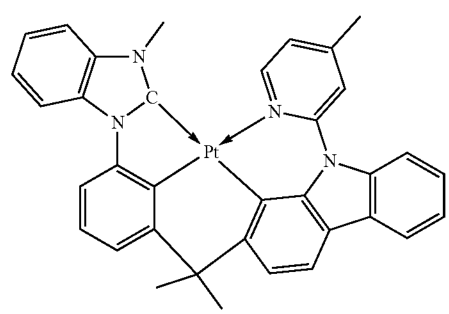
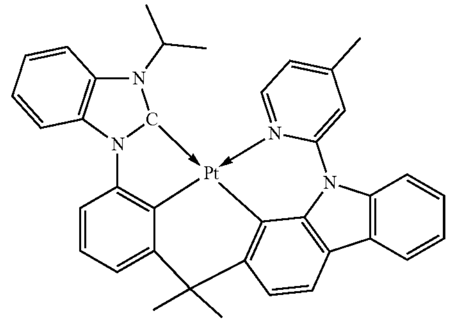

-continued
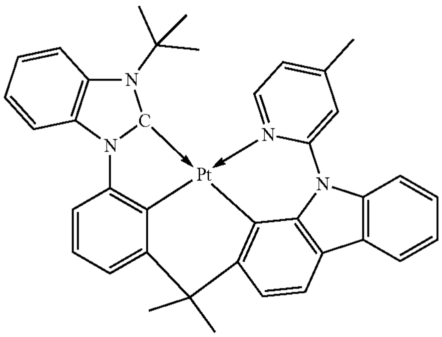
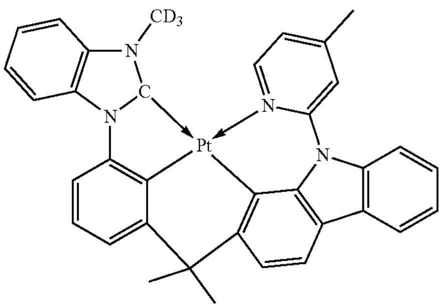
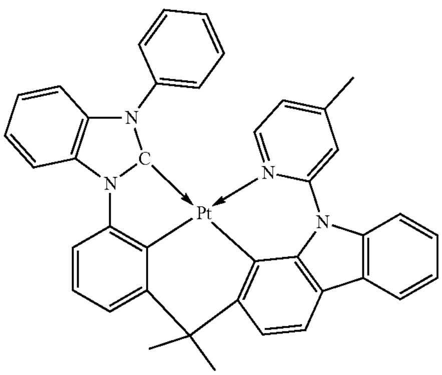
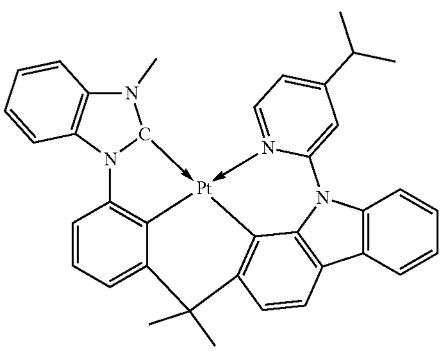
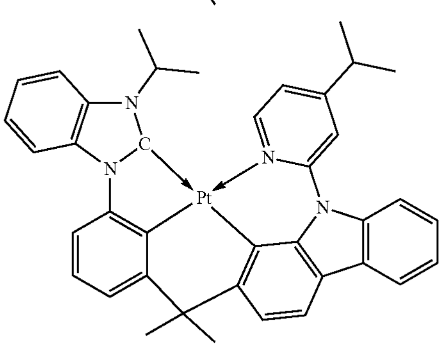
-continued
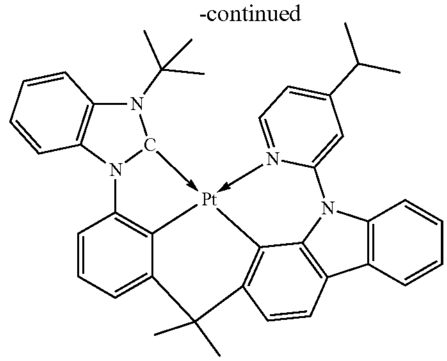
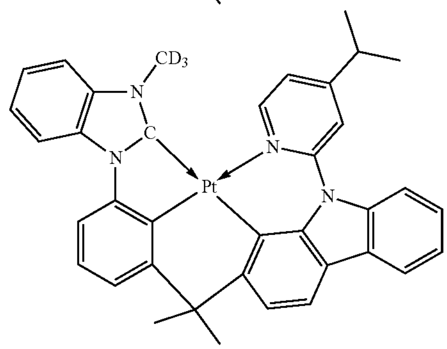
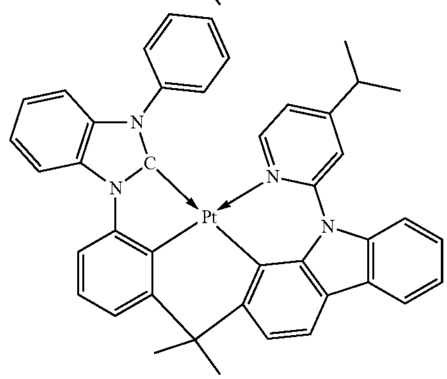
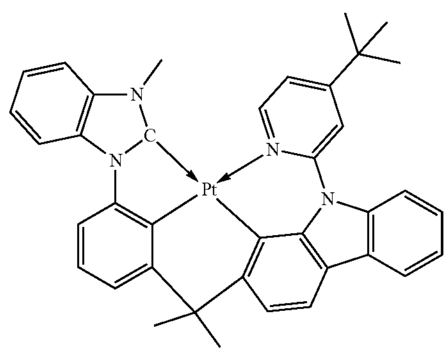
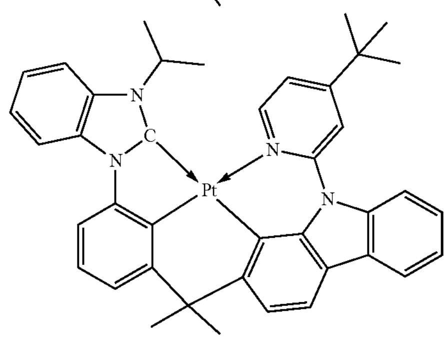

-continued
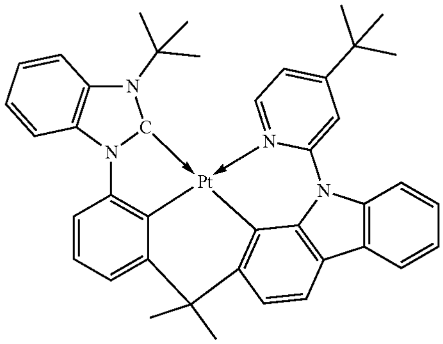
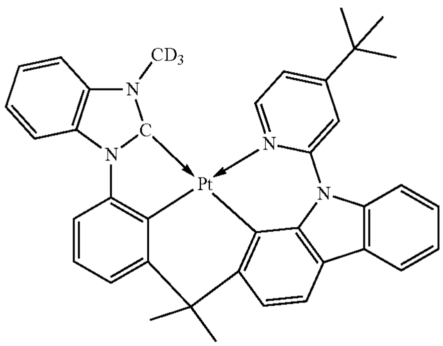
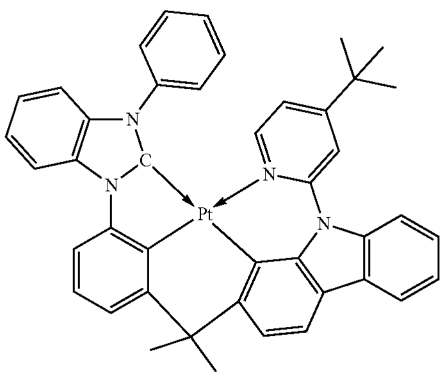
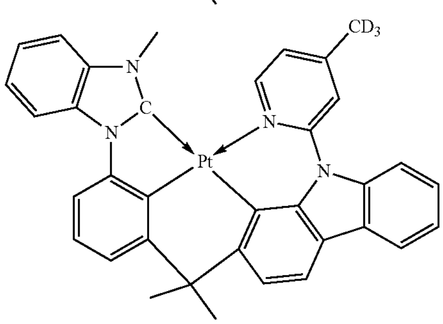
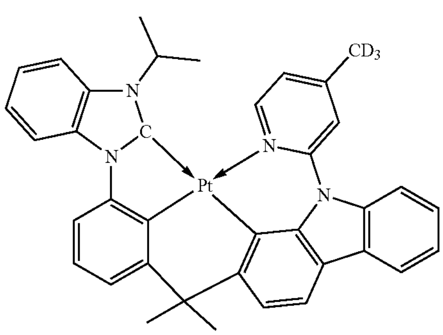
-continued
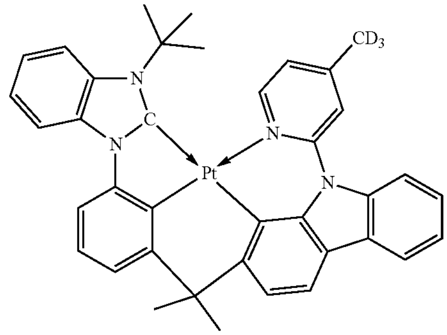
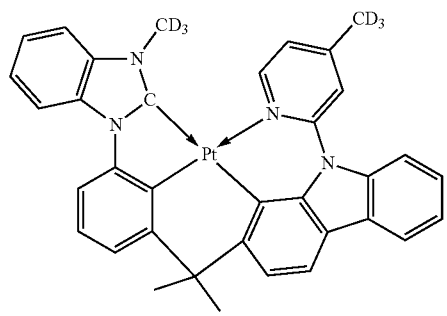
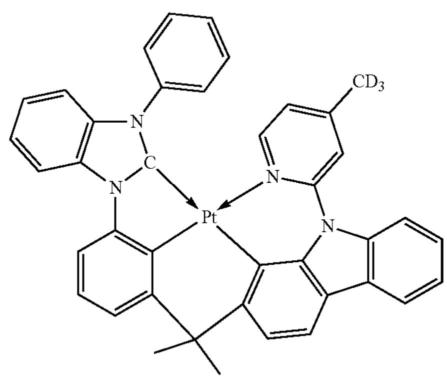
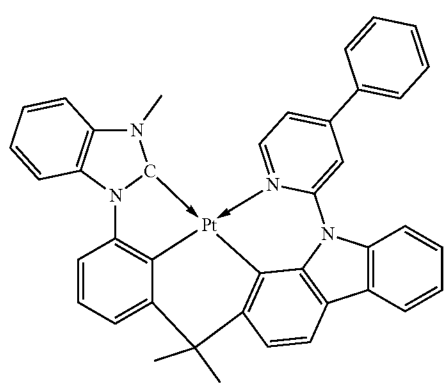

-continued
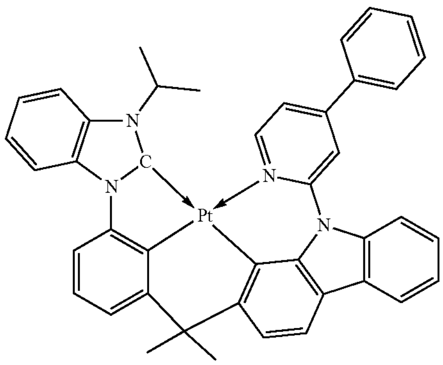
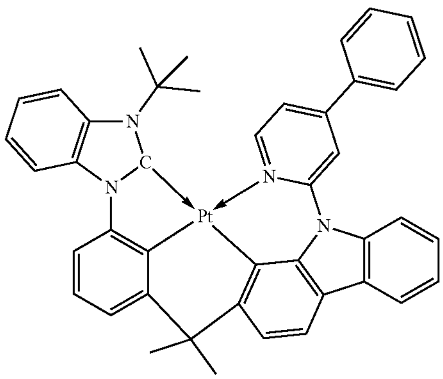
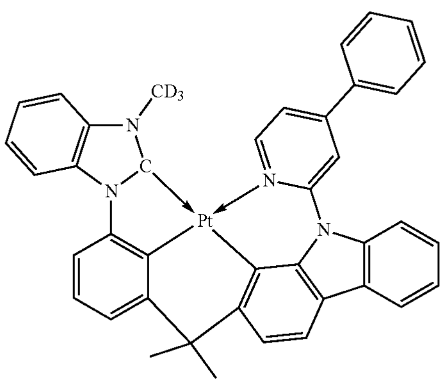
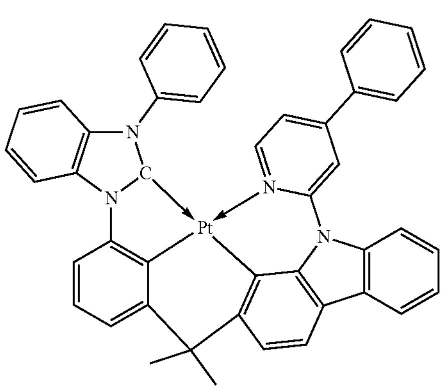
-continued
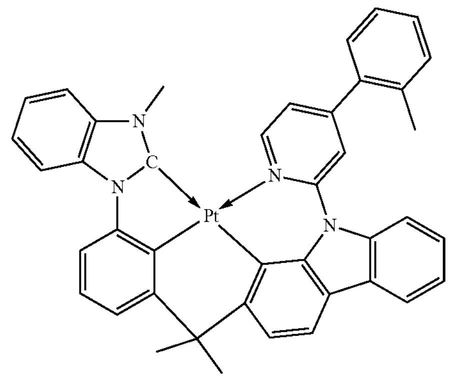
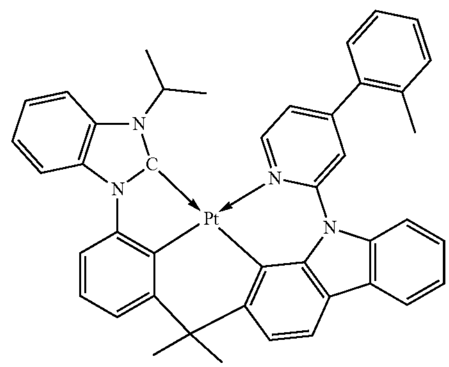
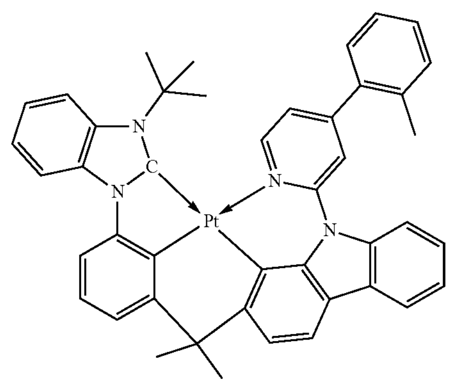
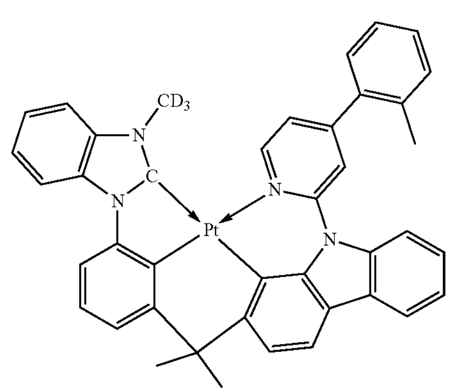

-continued
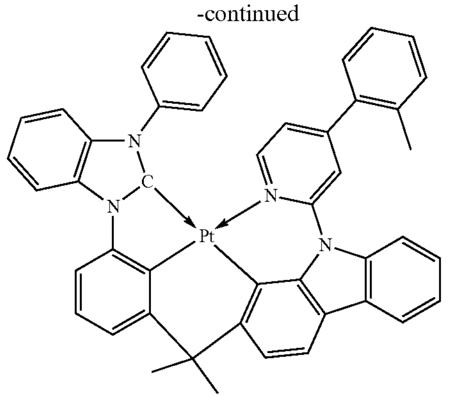
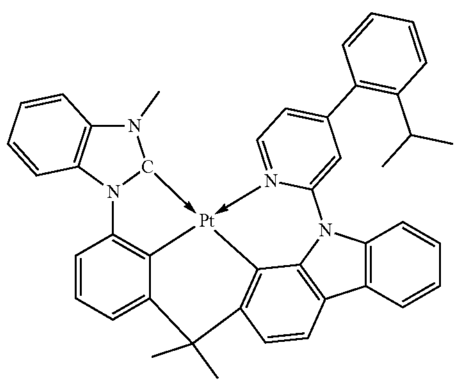
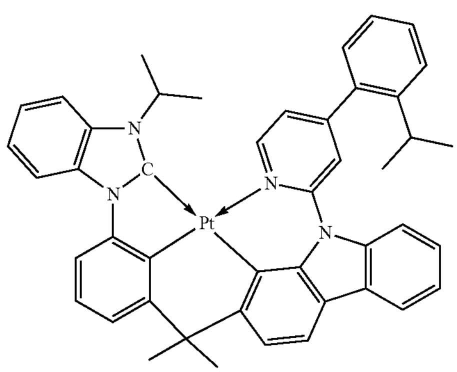
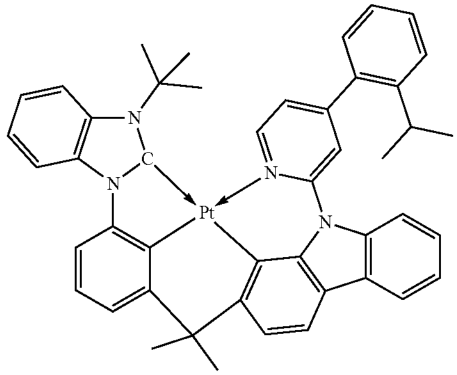
-continued
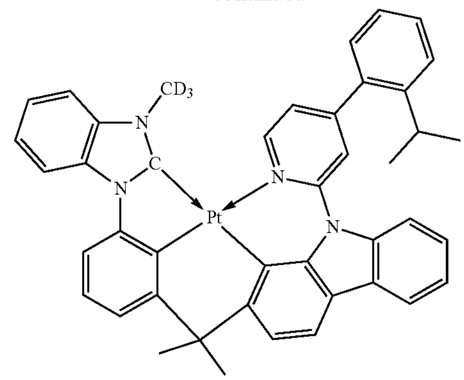
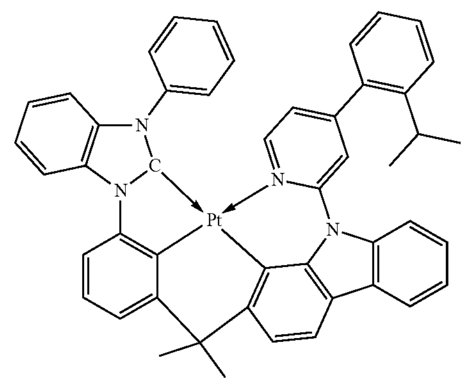
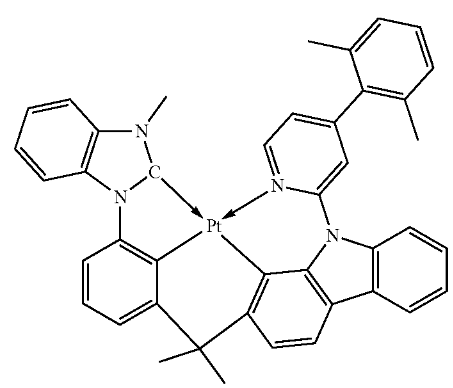
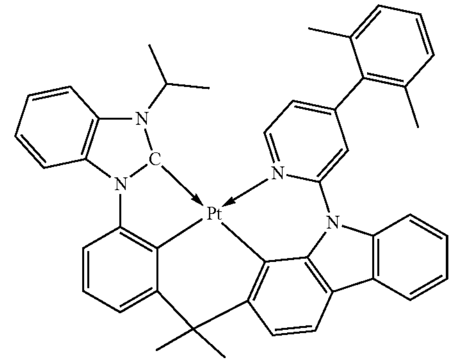

-continued
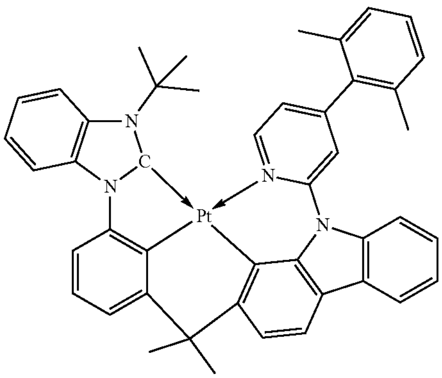
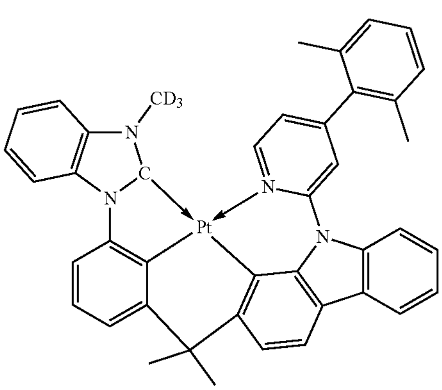
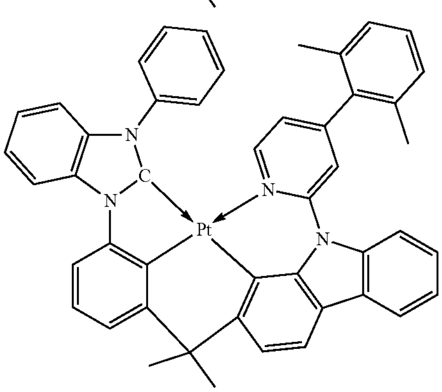
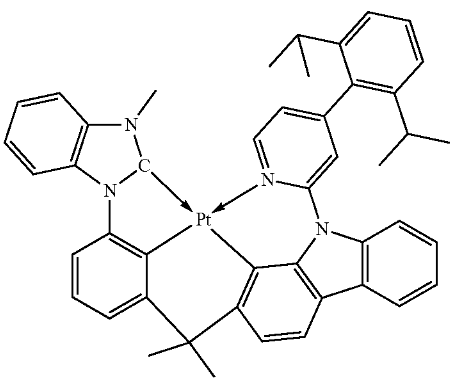
-continued
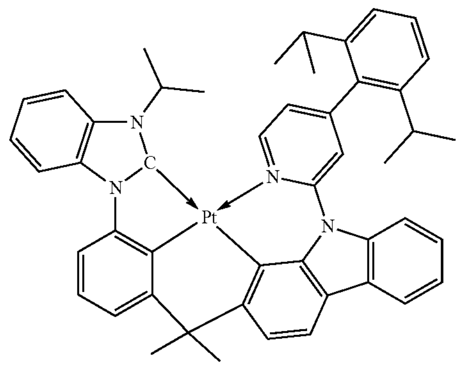
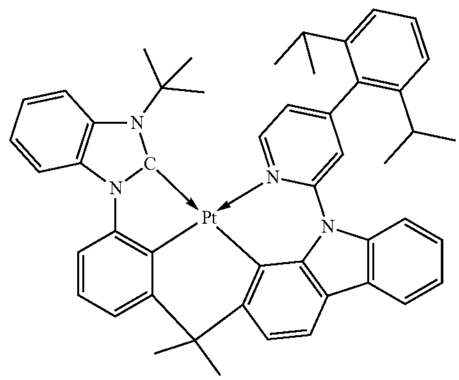
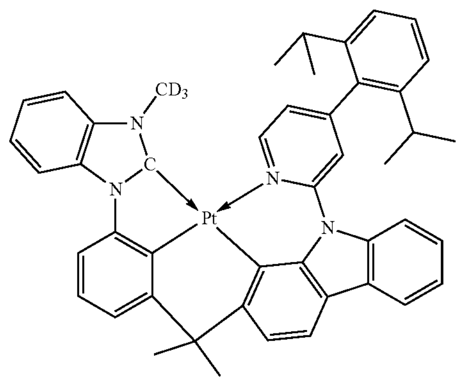
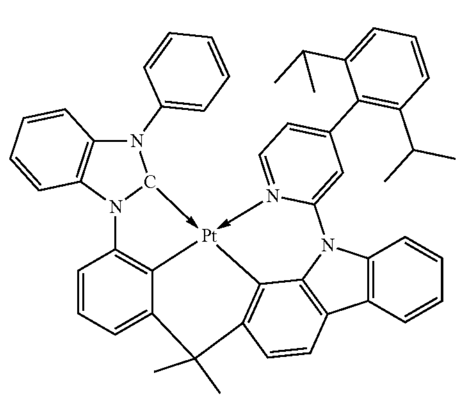

-continued
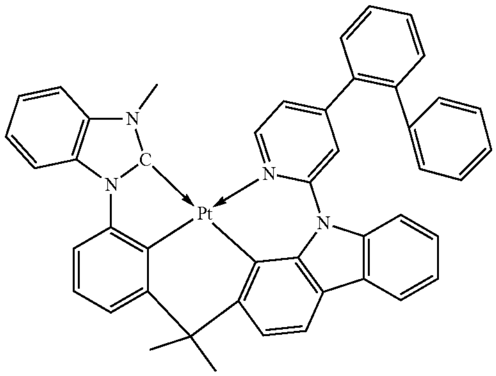
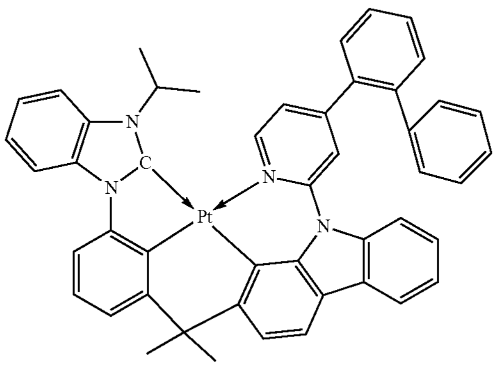
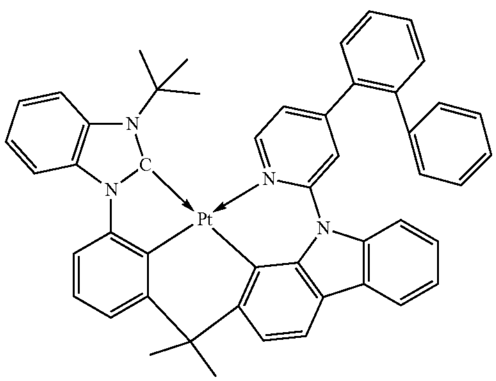
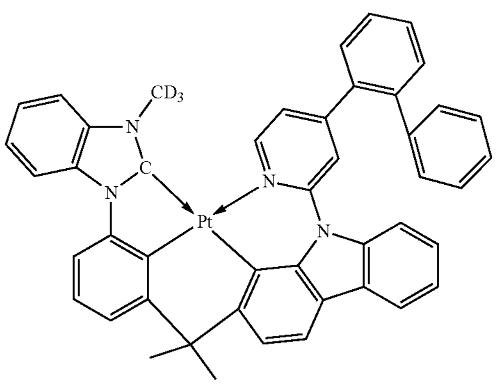
-continued
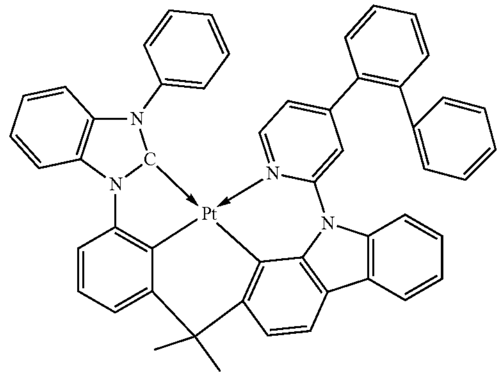
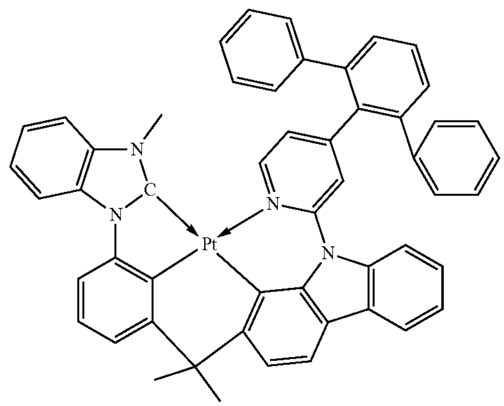
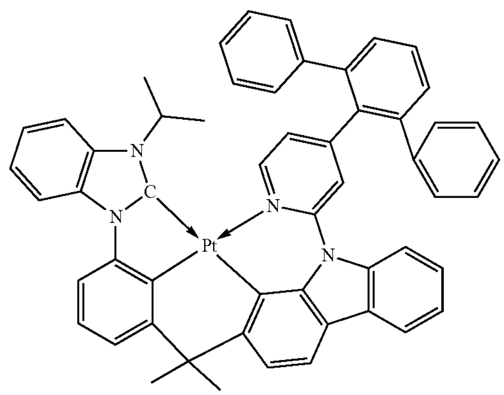
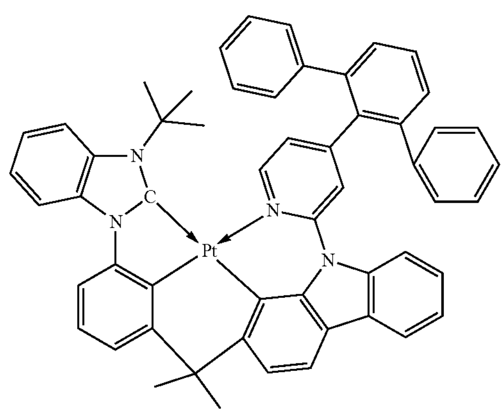

-continued
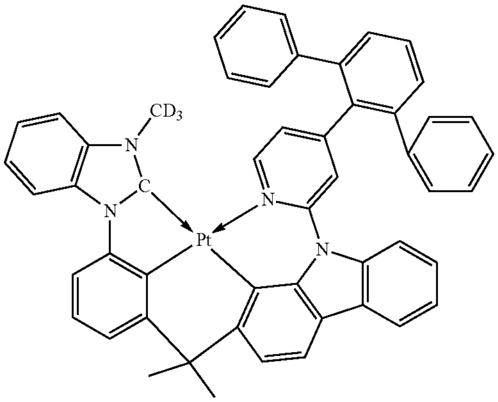
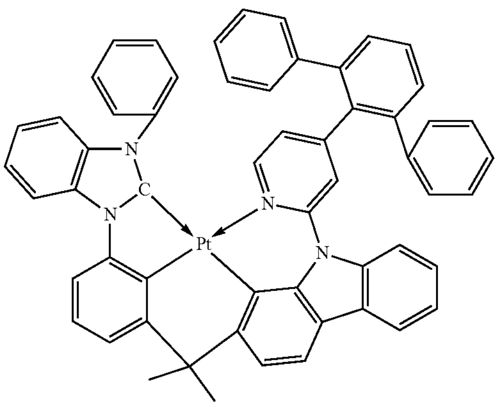
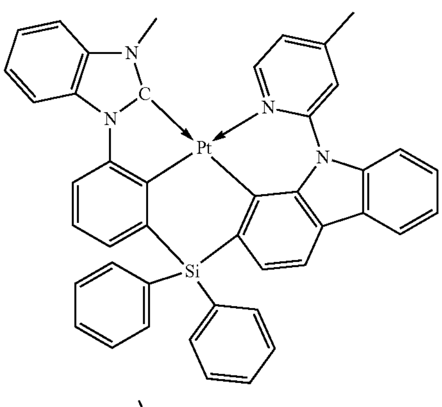
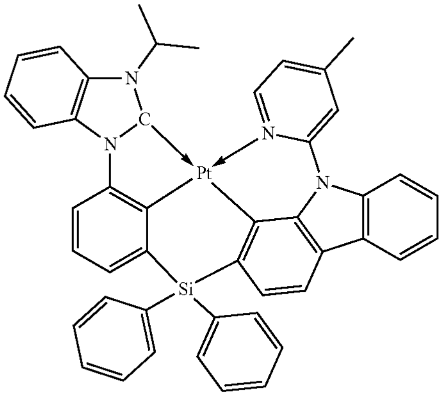
-continued
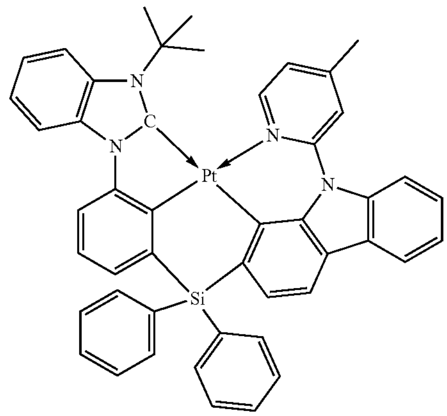
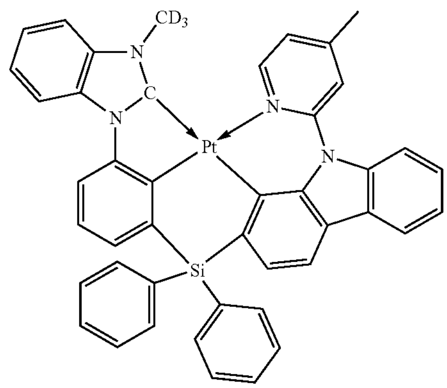
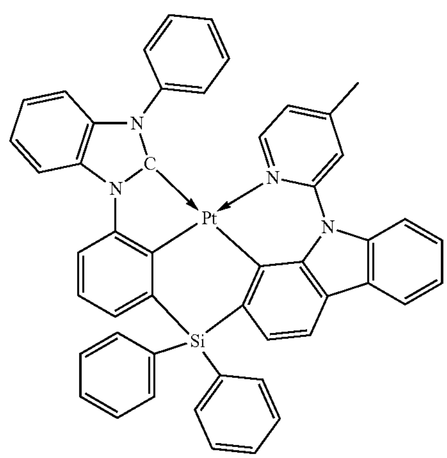
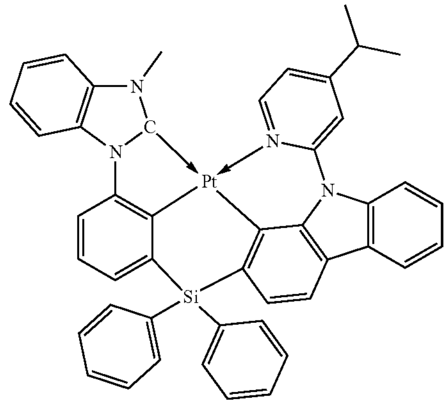

-continued
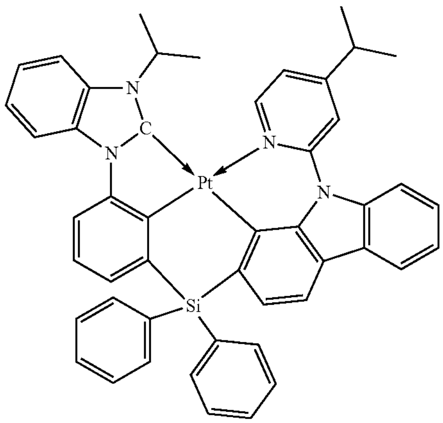
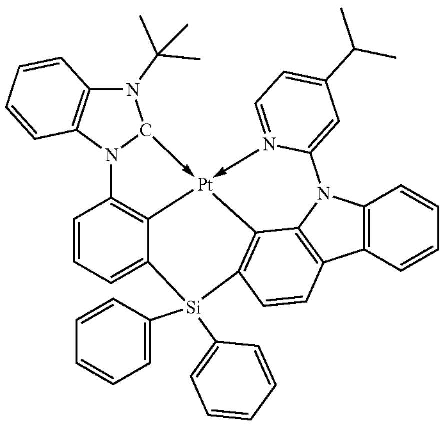
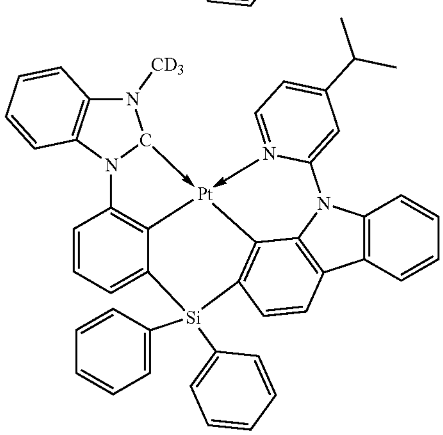
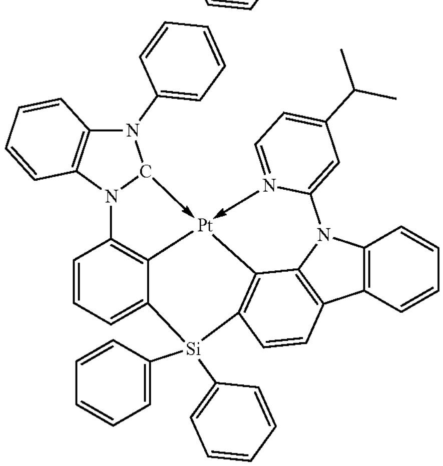
-continued
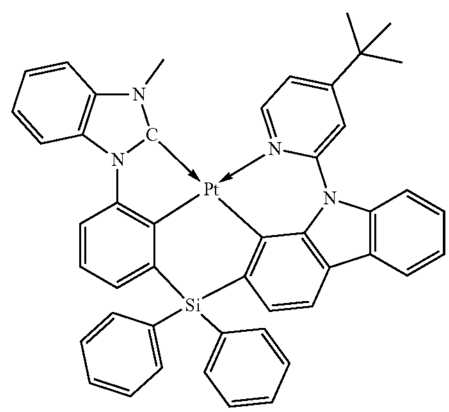
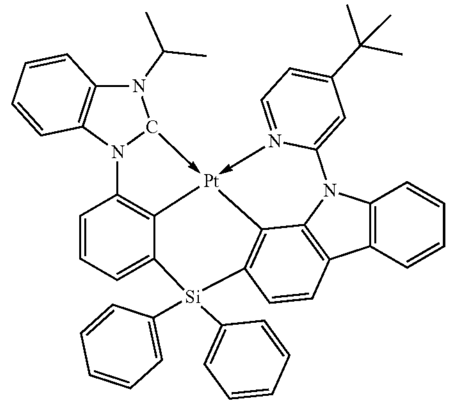
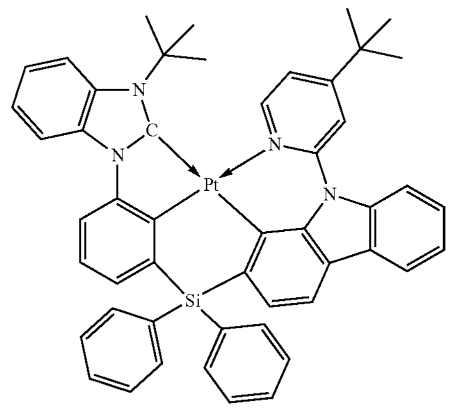
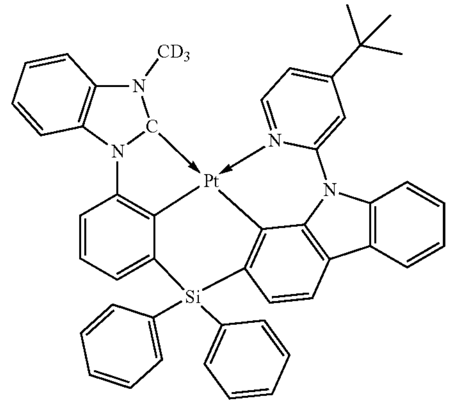

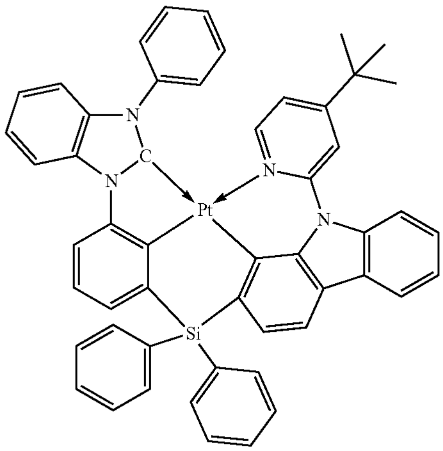
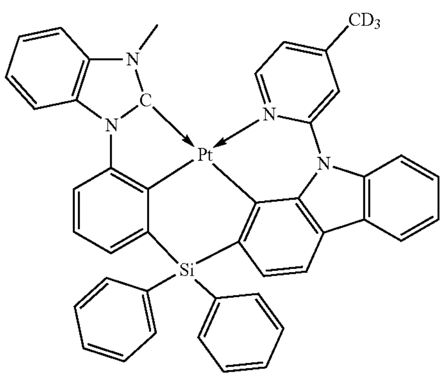
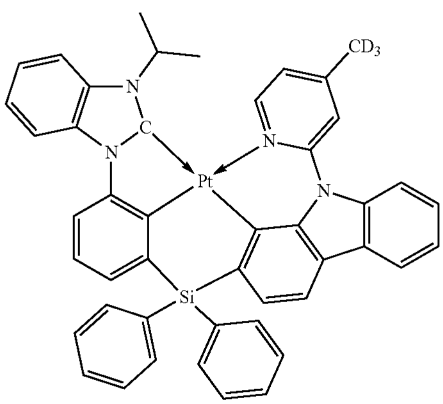
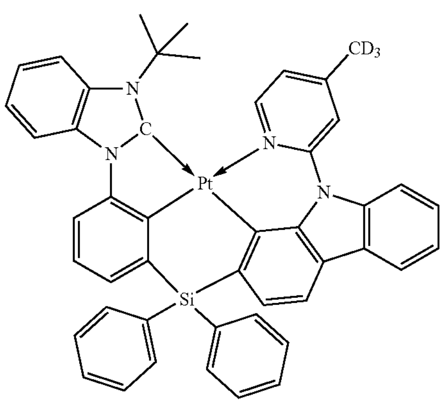
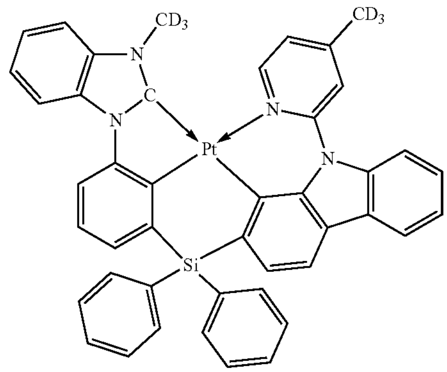
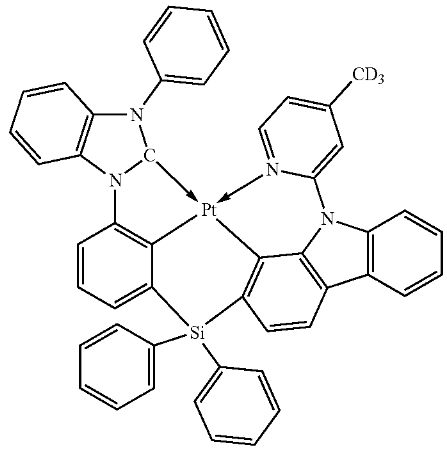
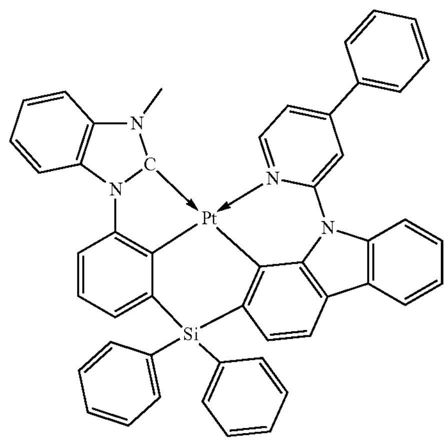
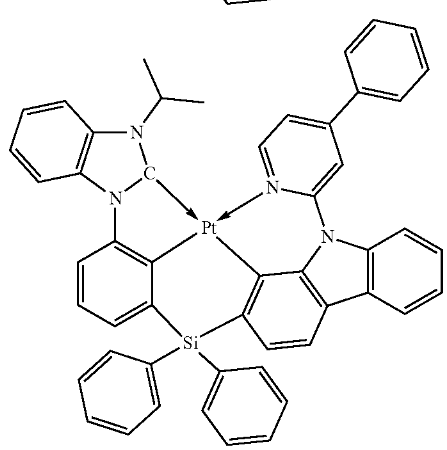

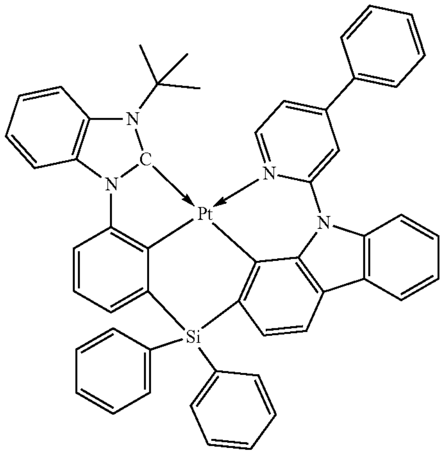
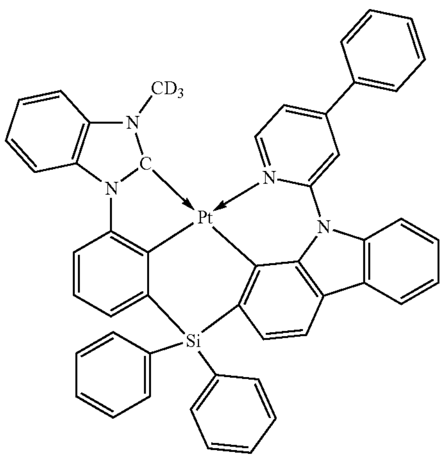
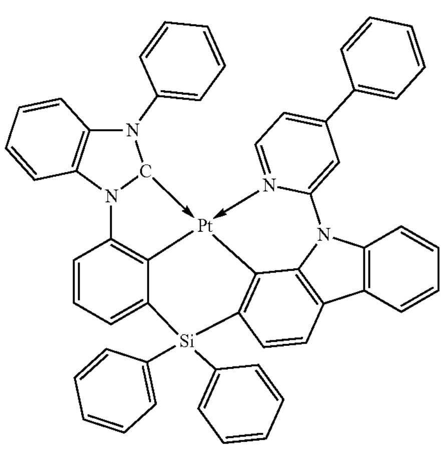
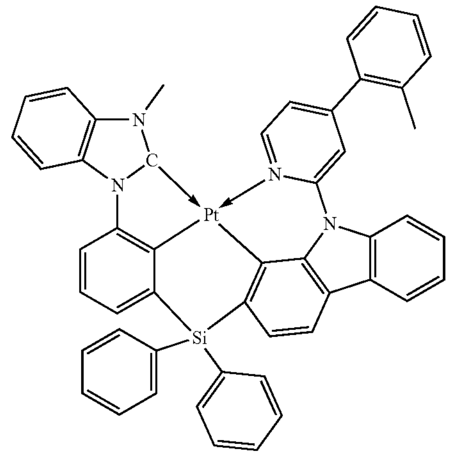
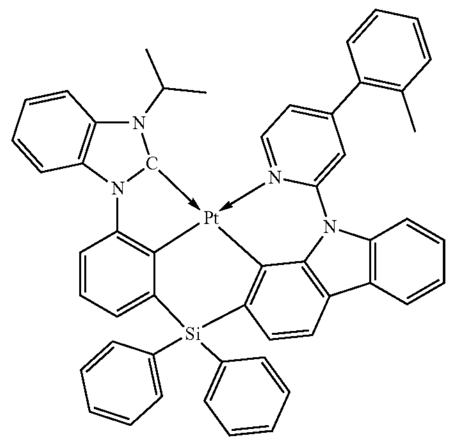
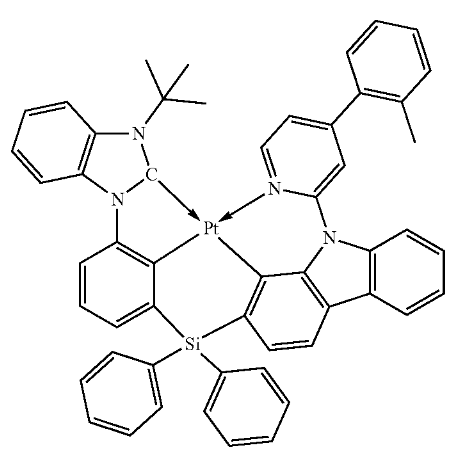

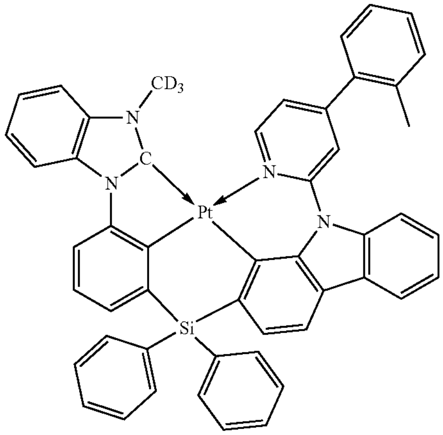
CD3
N
C
N
Pt
N
N
Si
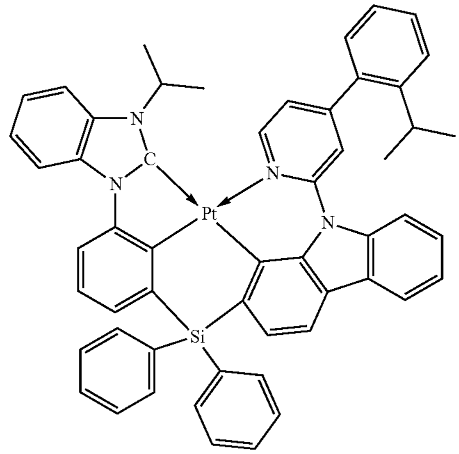
N
C
N
Pt
N
N
Si
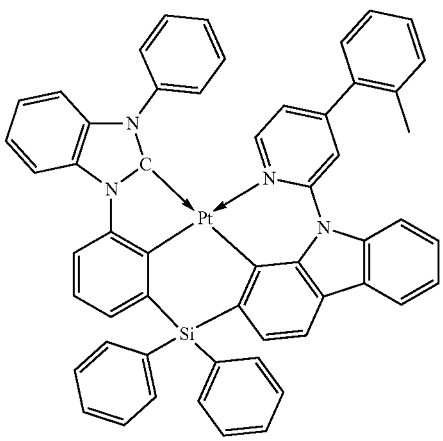
N
C
N
Pt
N
N
Si
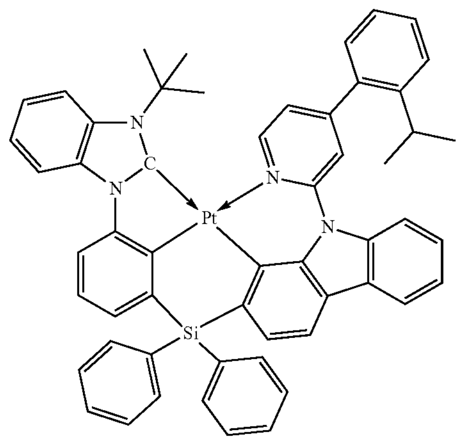
N
C
N
Pt
N
N
Si
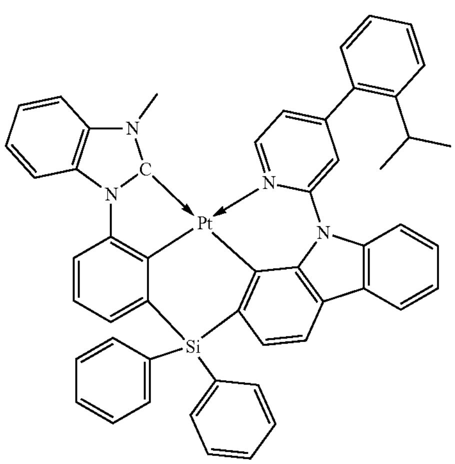
N
C
N
Pt
N
N
Si
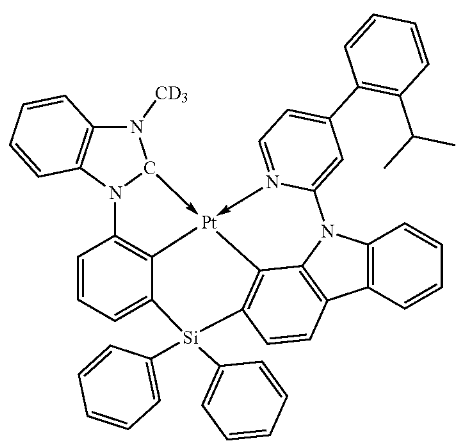
CD3
N
C
N
Pt
N
N
Si -continued
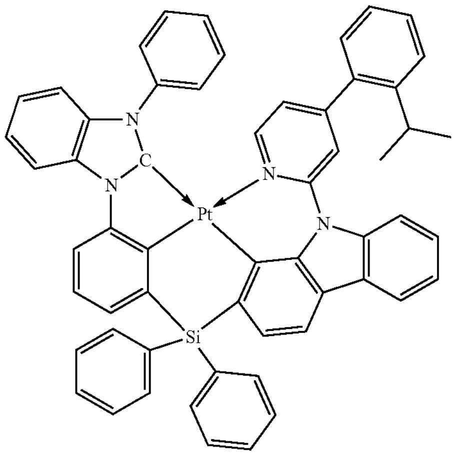
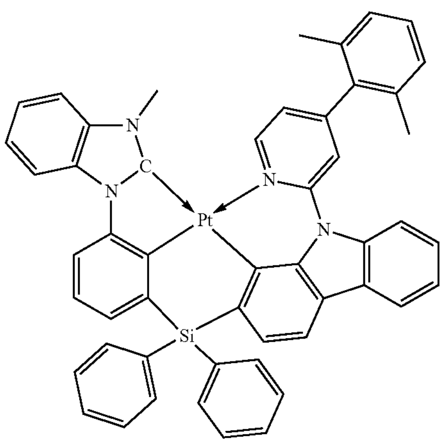
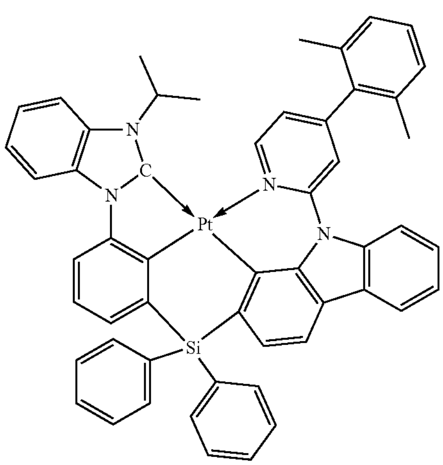
-continued
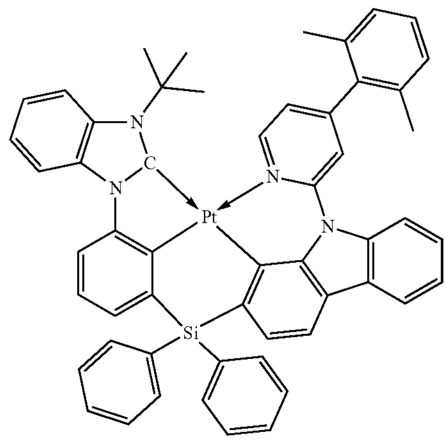
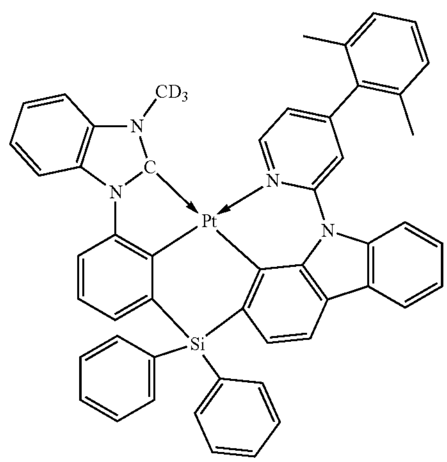
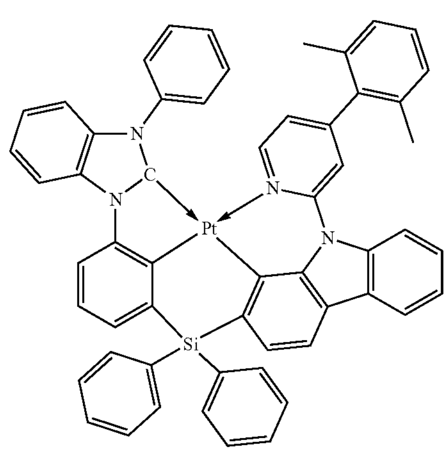

-continued
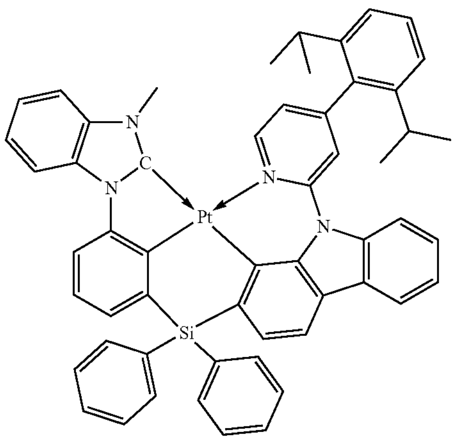
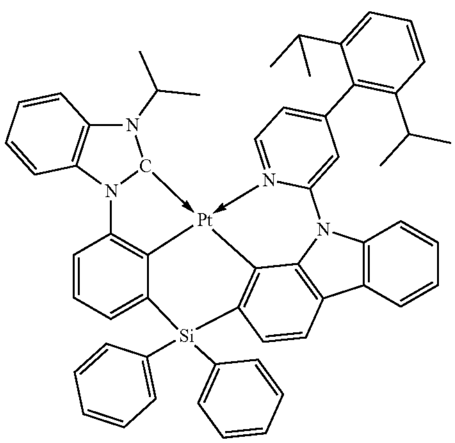
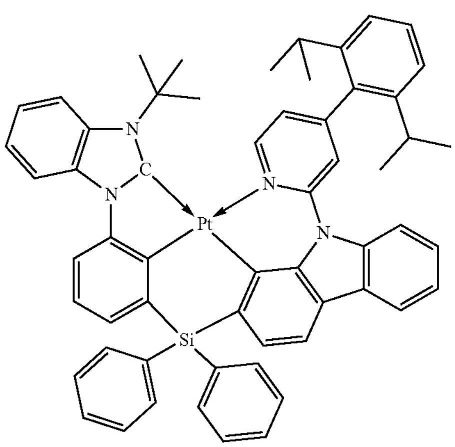
-continued
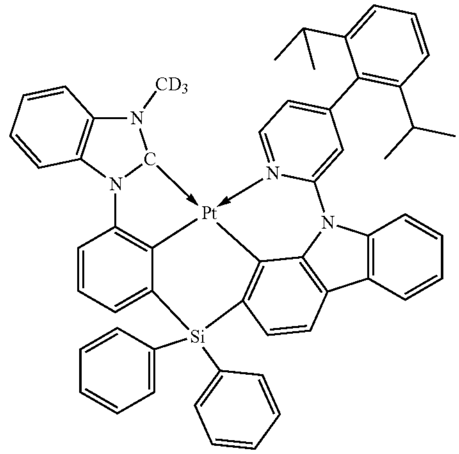
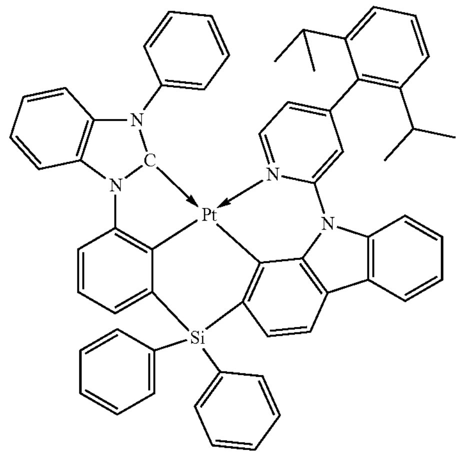
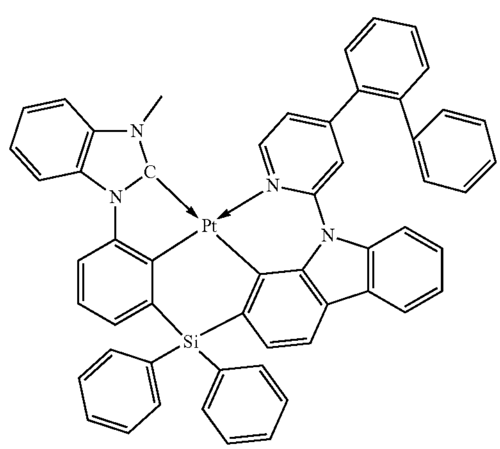

-continued
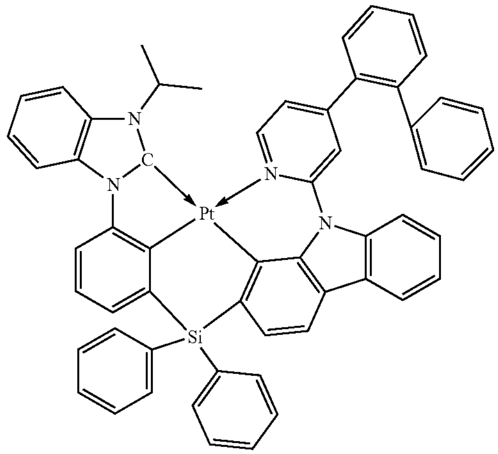
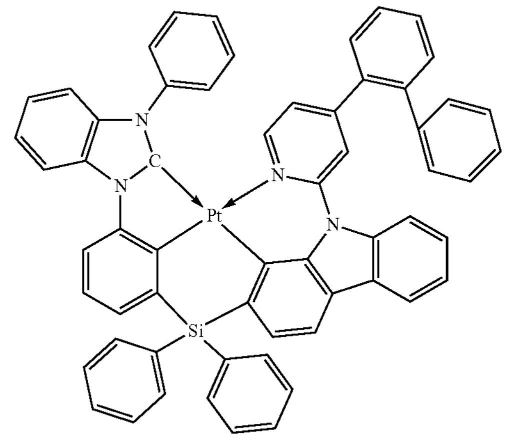
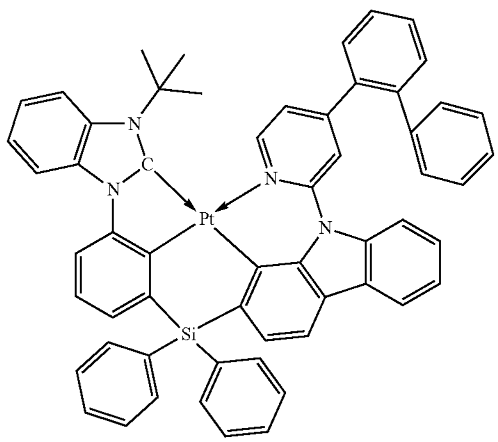
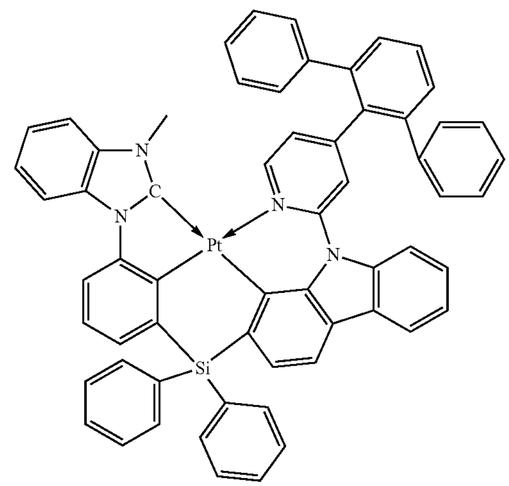
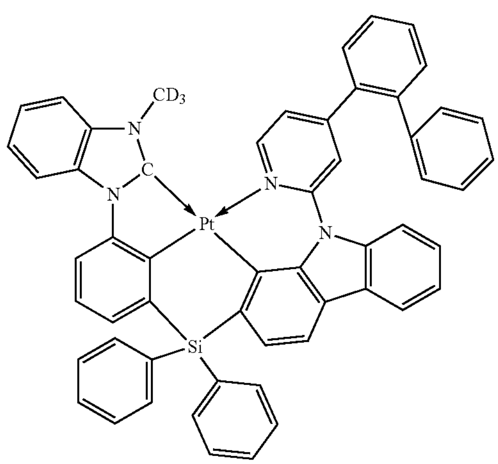
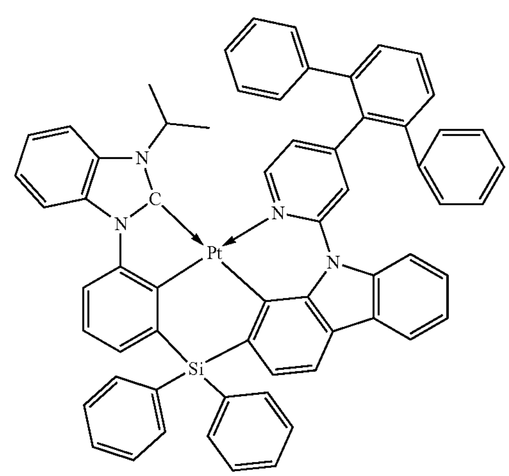
-continued -continued
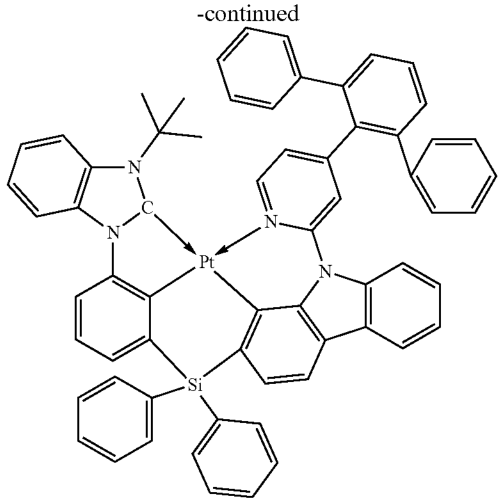
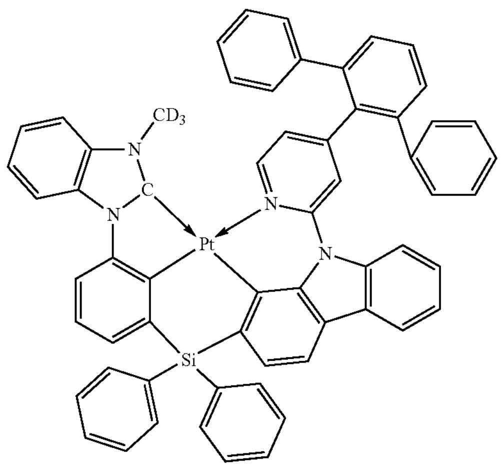
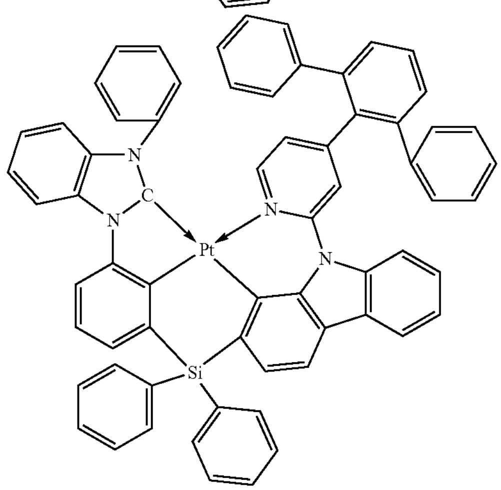
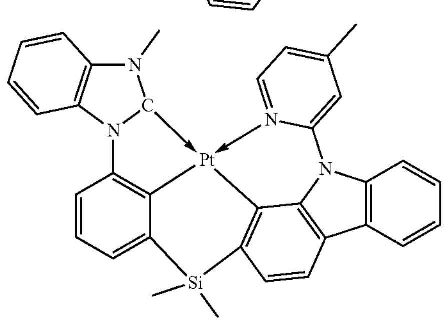
-continued
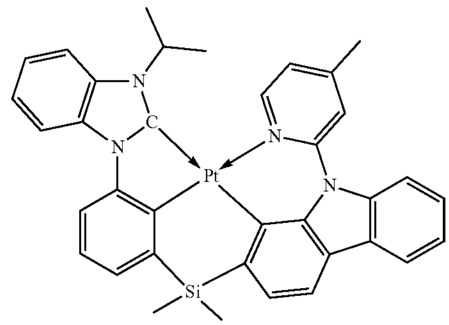
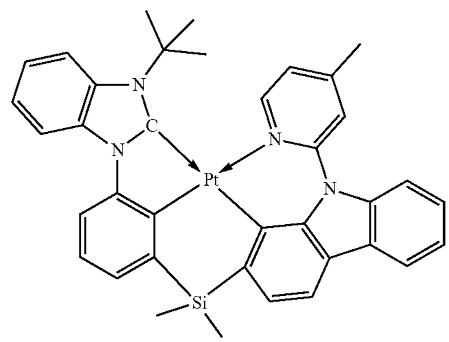
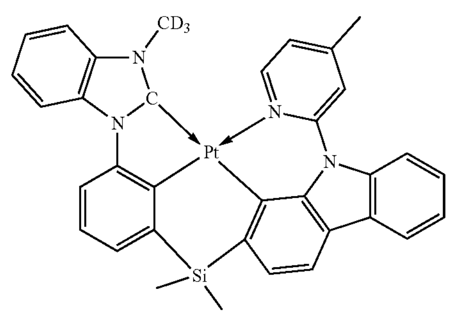
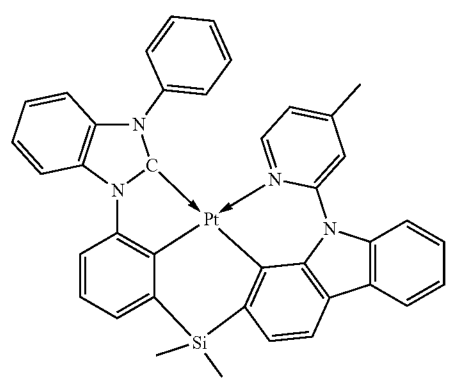
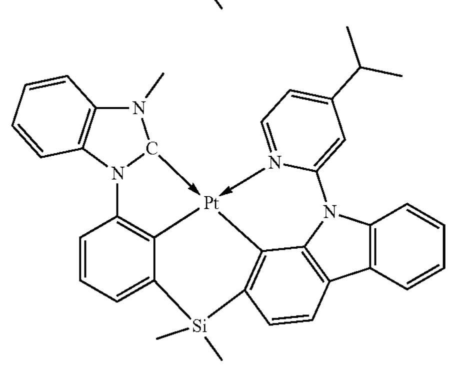

-continued
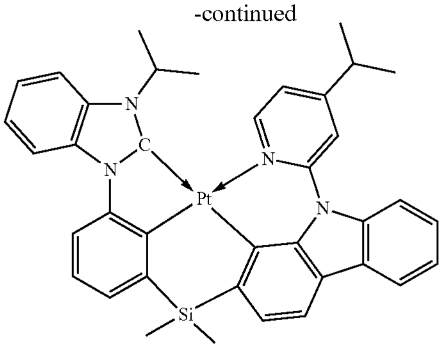
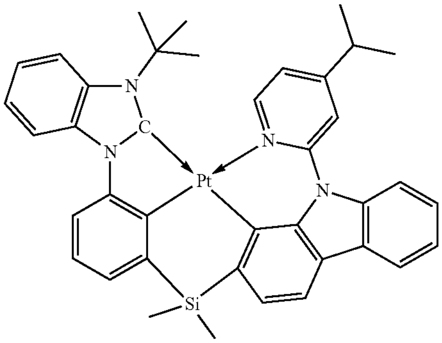
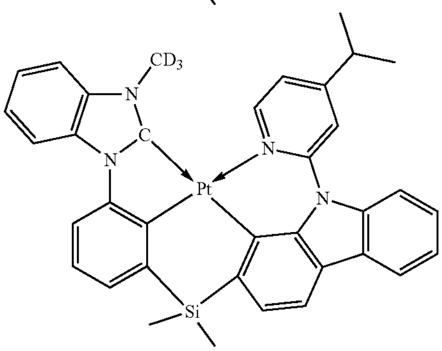
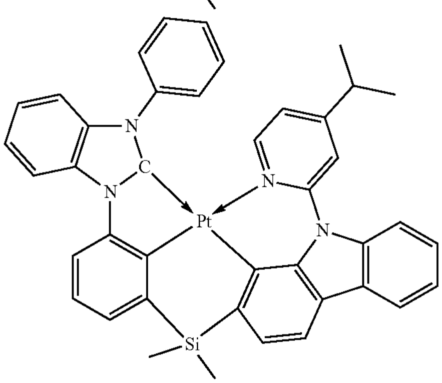
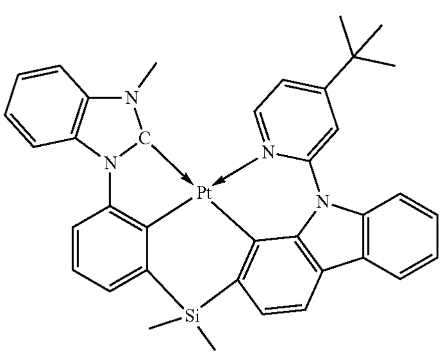
-continued
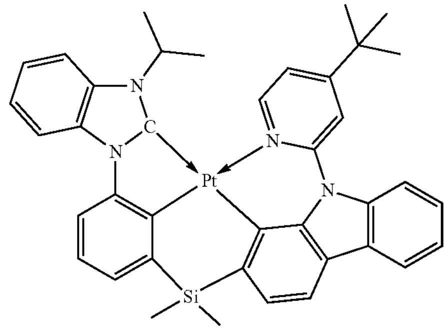
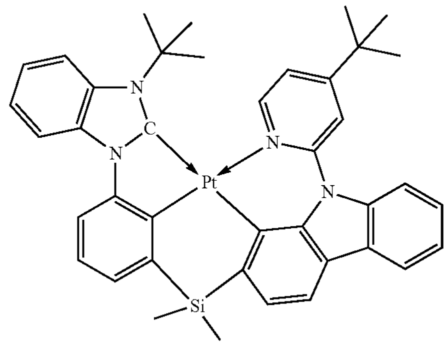
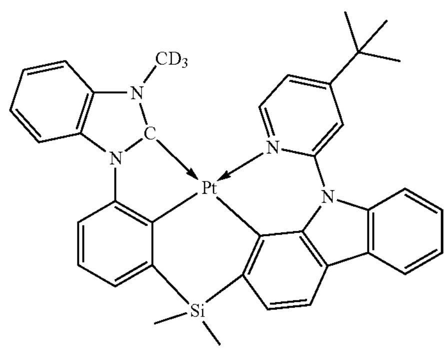
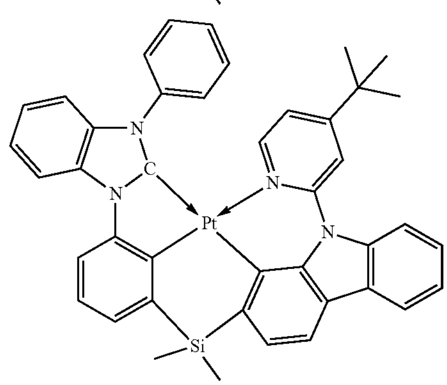
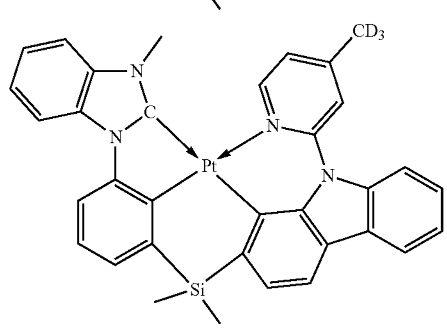

-continued
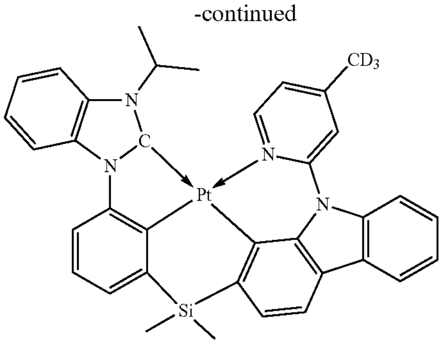
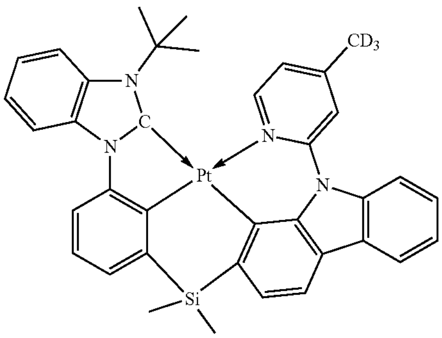
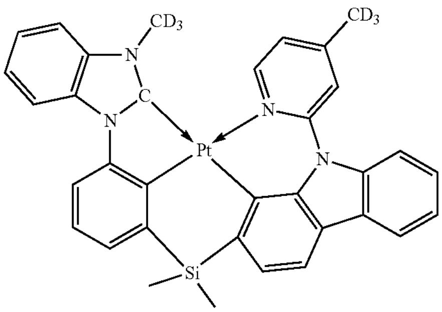
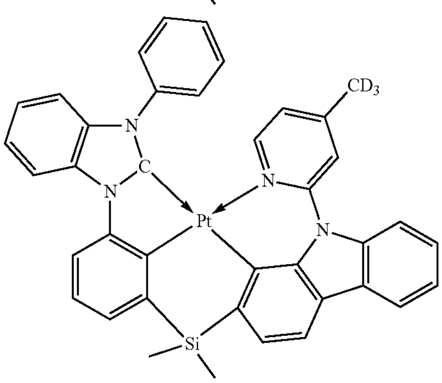
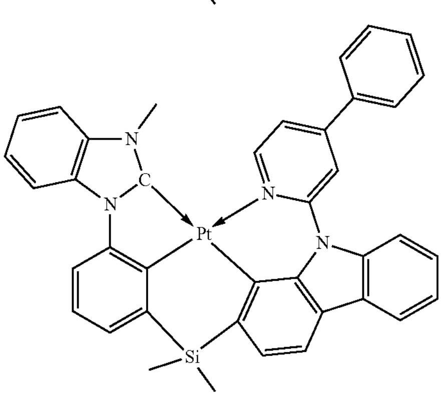
-continued
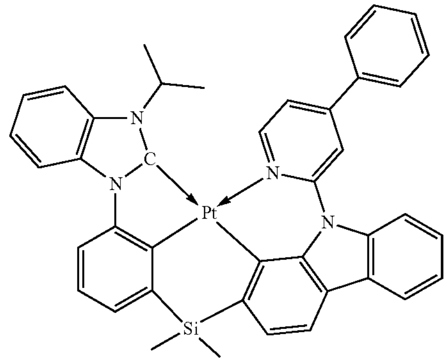
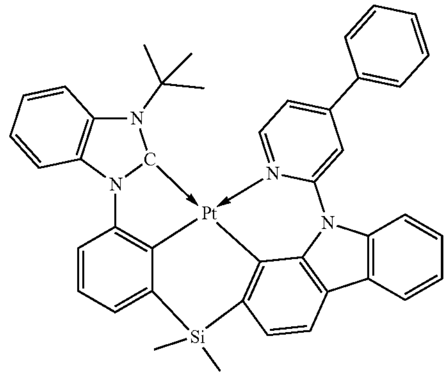
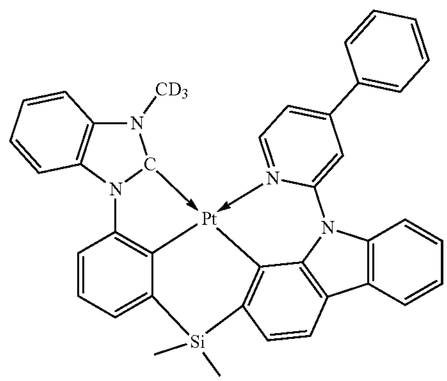
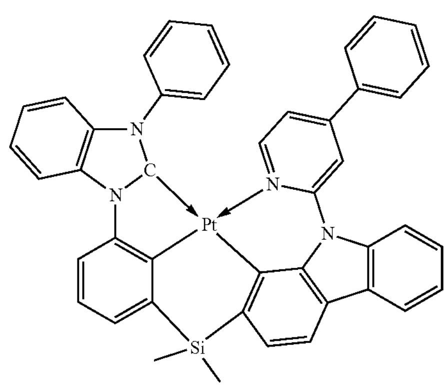

-continued
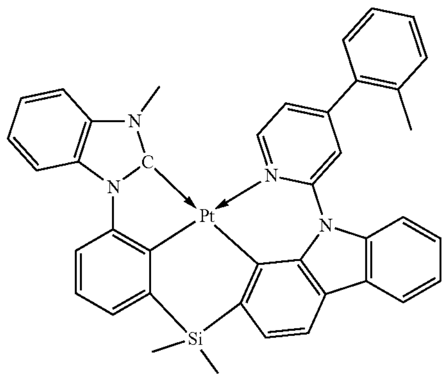
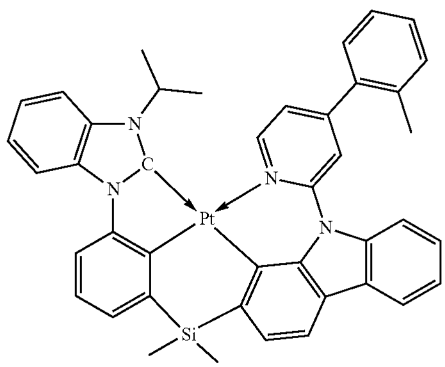
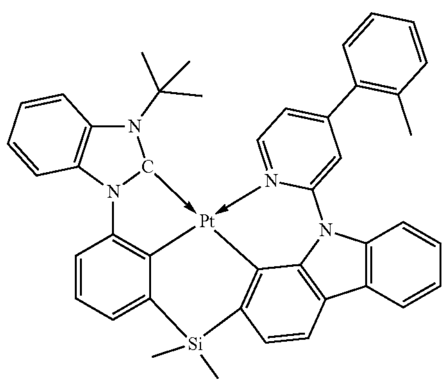
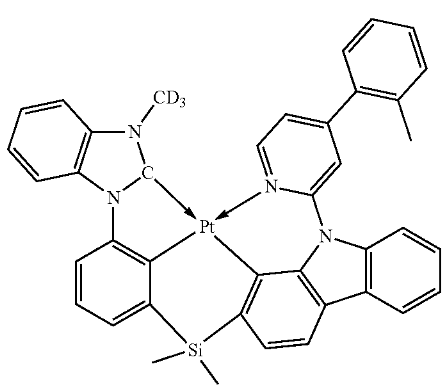
-continued
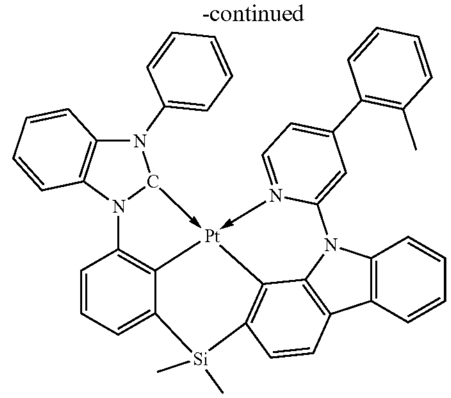
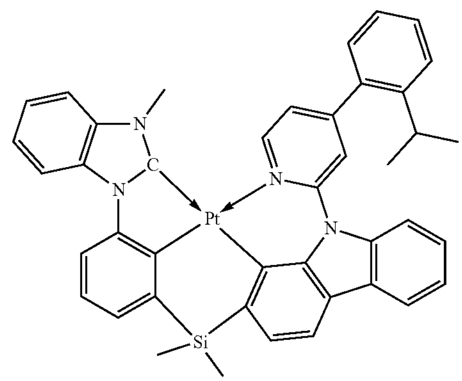
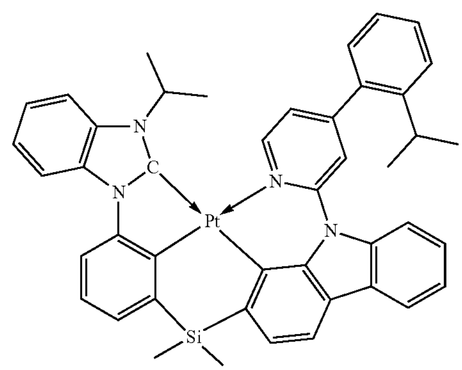
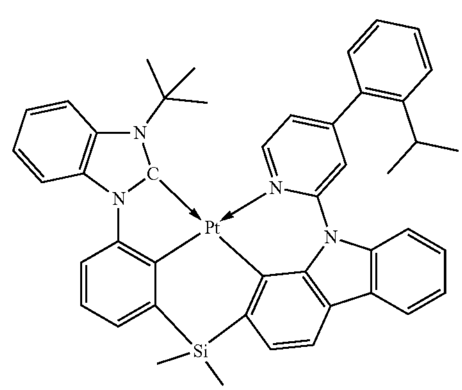

-continued
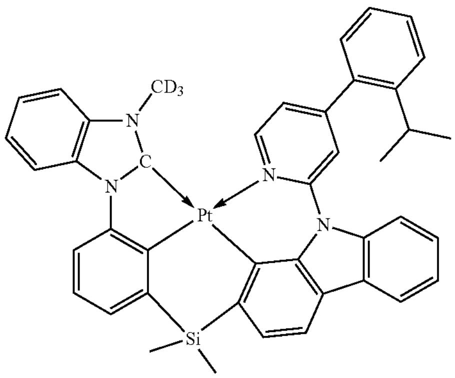
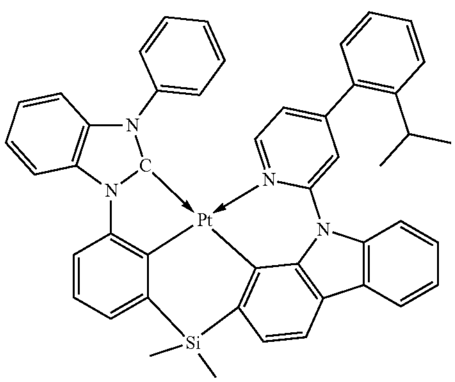
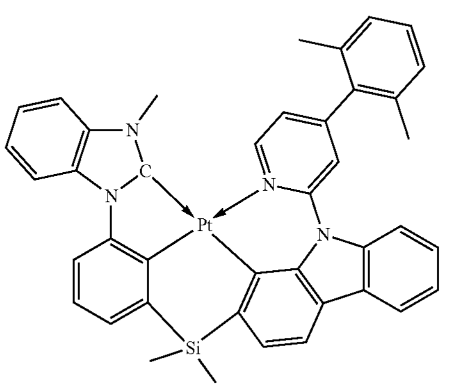
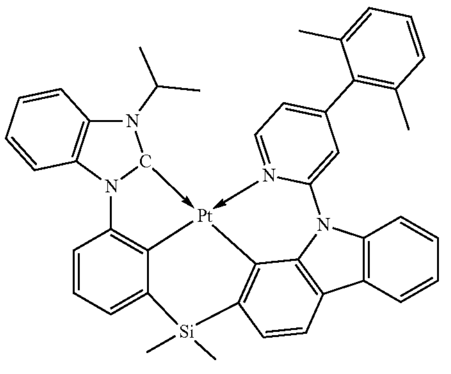
-continued
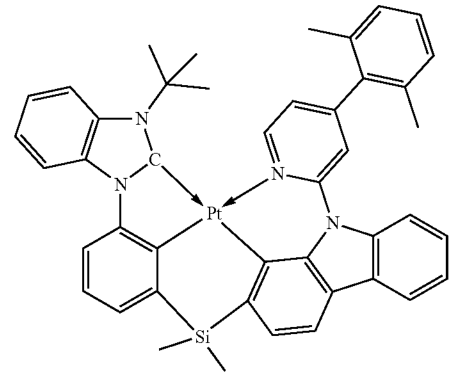
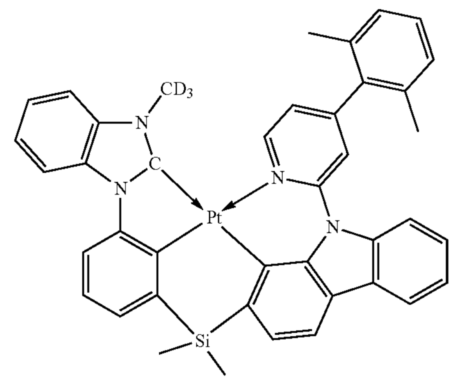
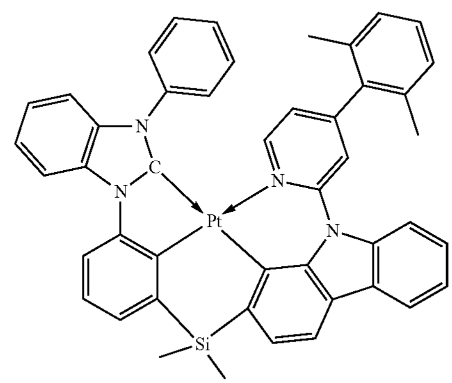
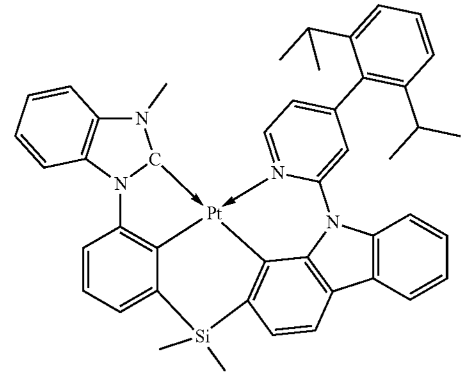

-continued
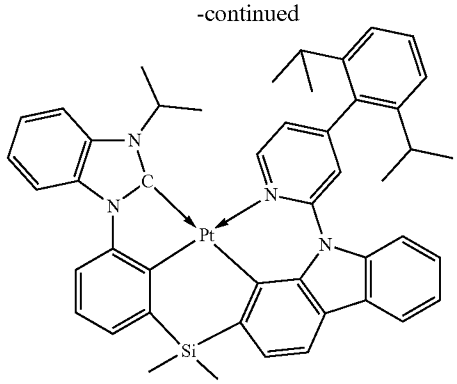
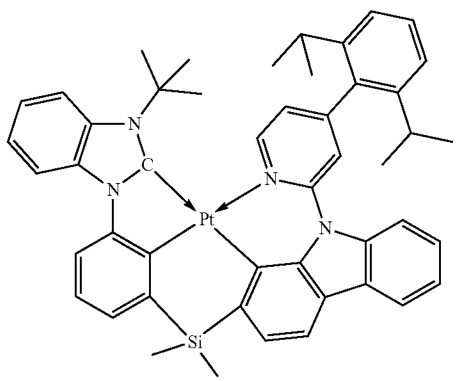
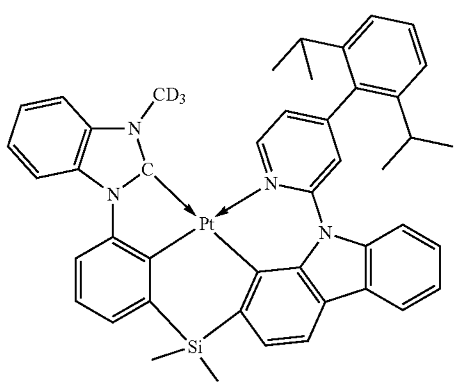
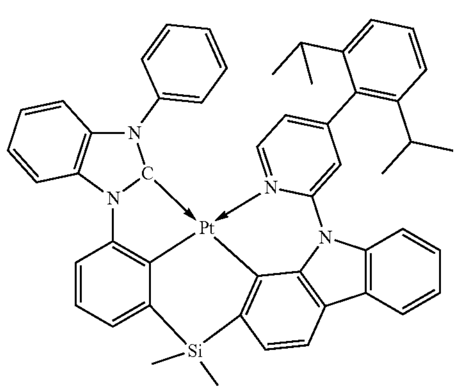
-continued
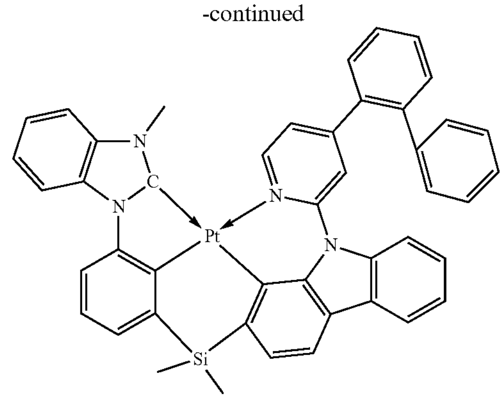
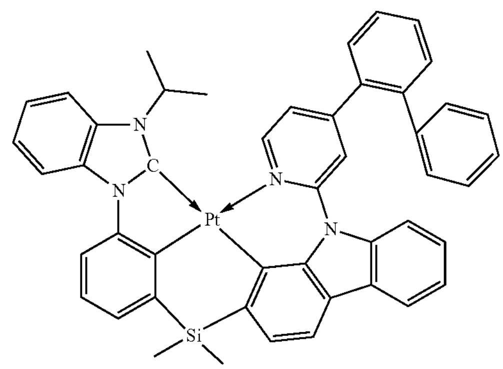
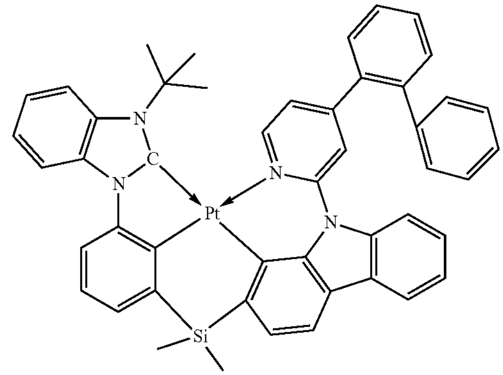
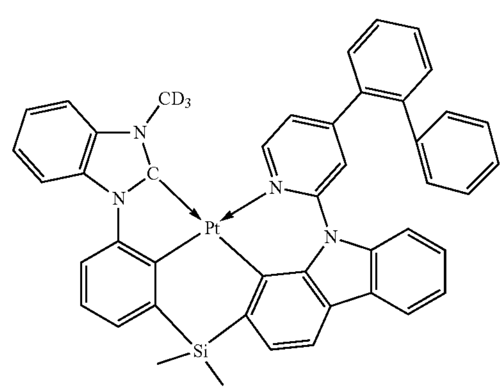

-continued
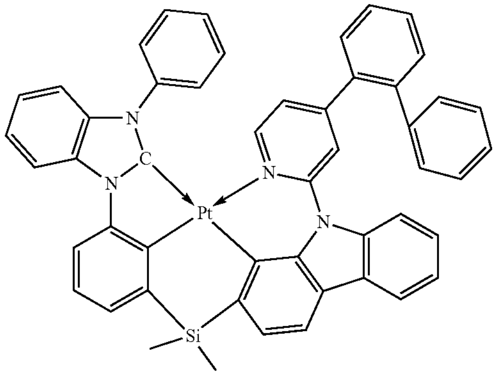
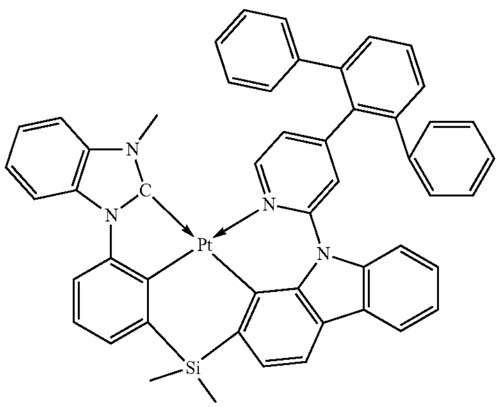
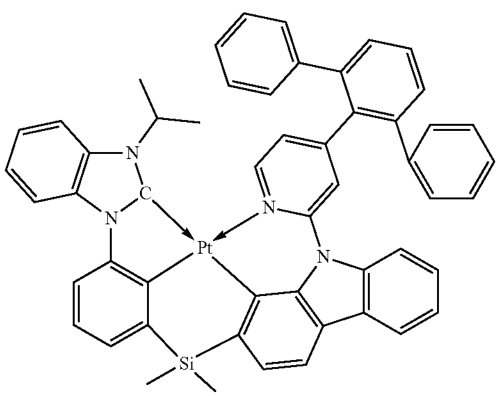
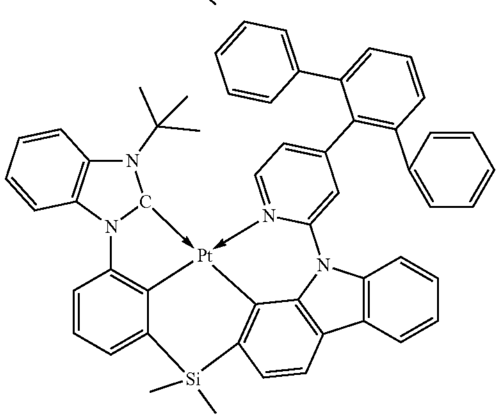
-continued
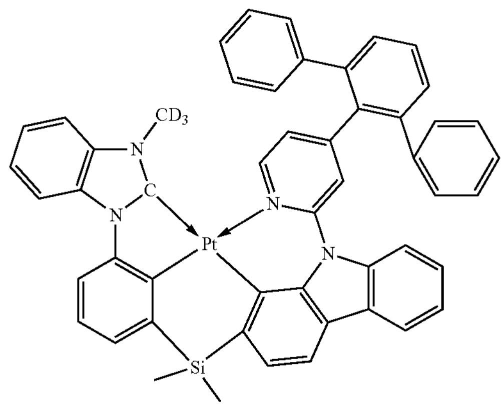
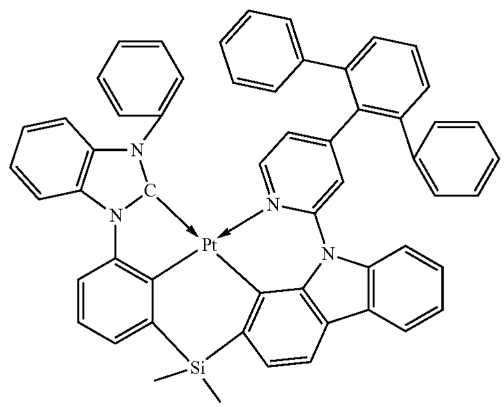
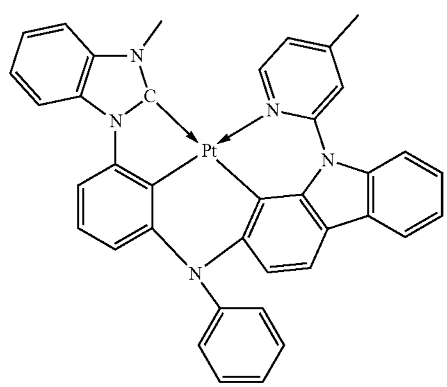
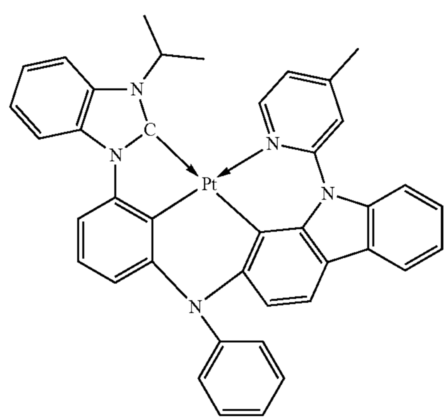

-continued
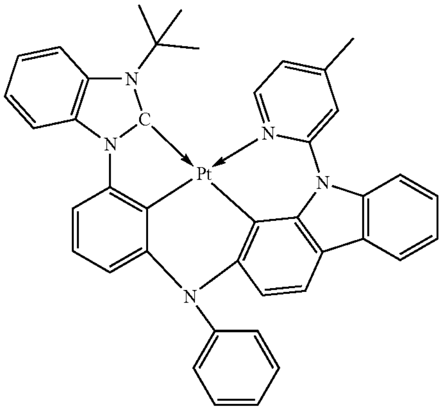
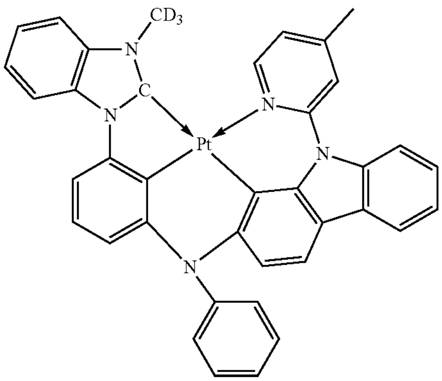
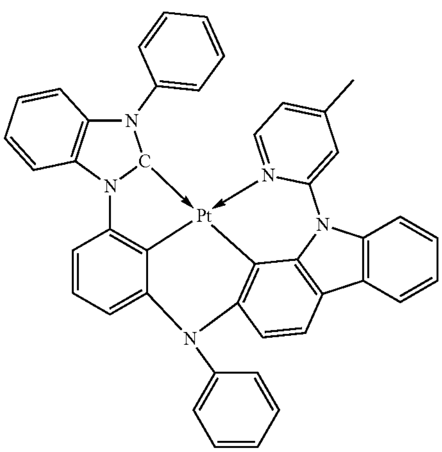
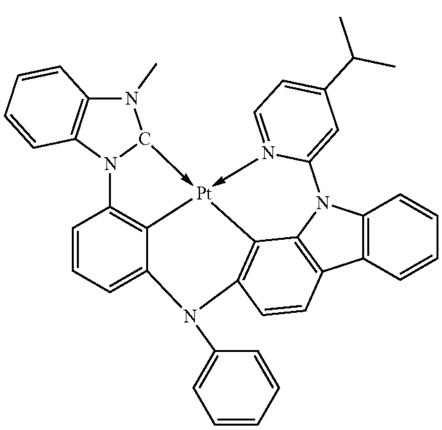
-continued
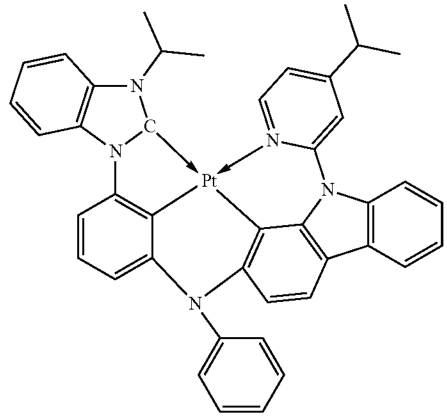
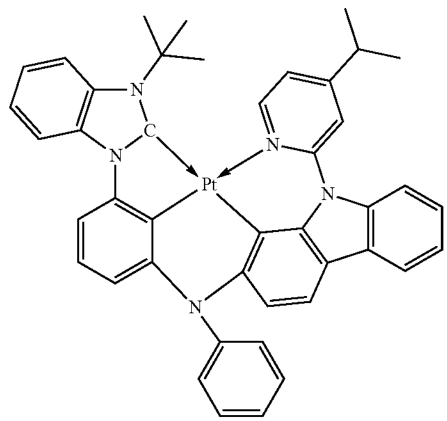
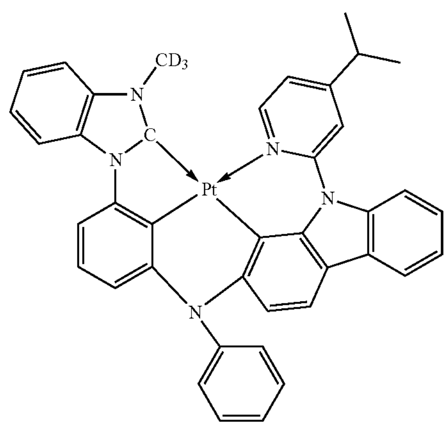
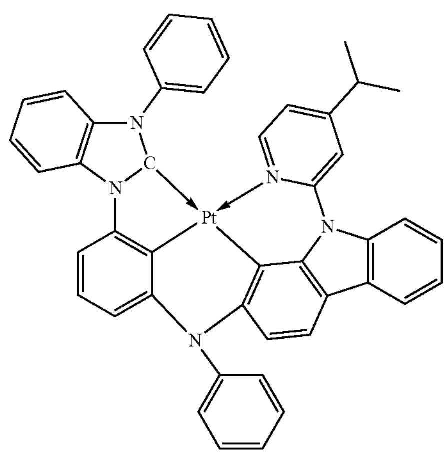

-continued
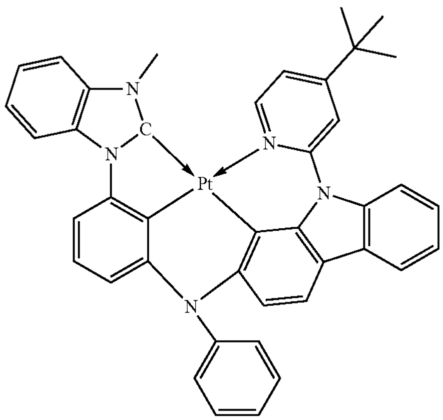
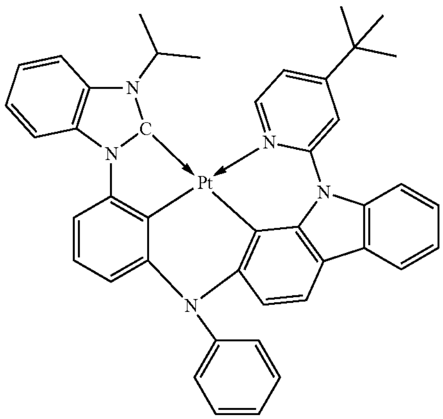
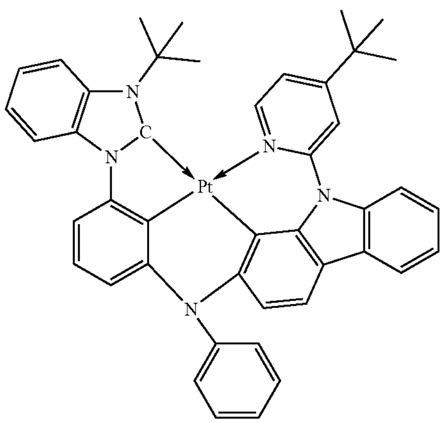
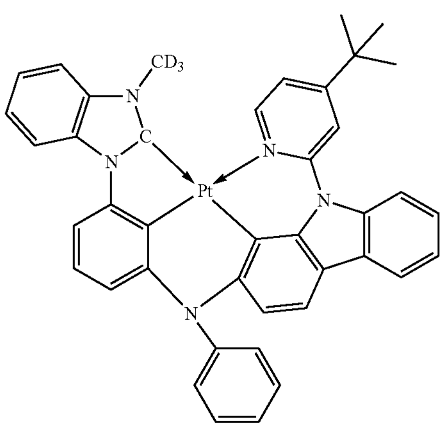
-continued
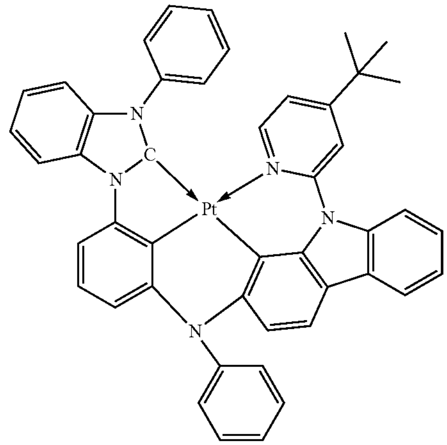
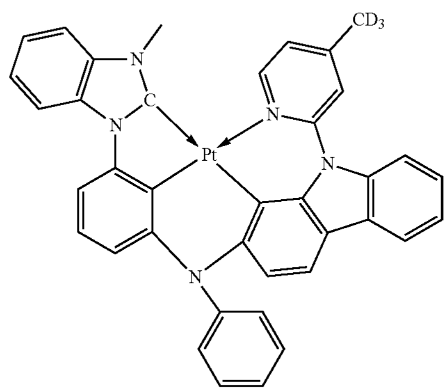
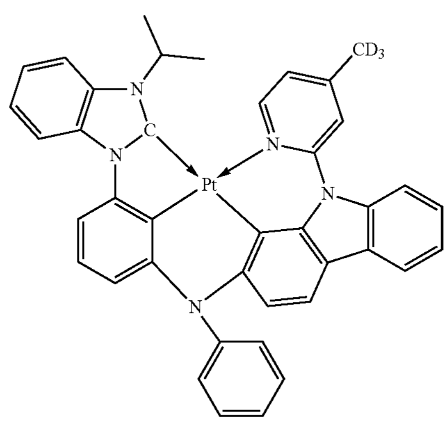
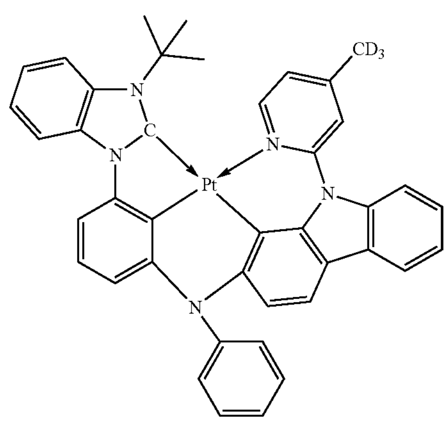

-continued
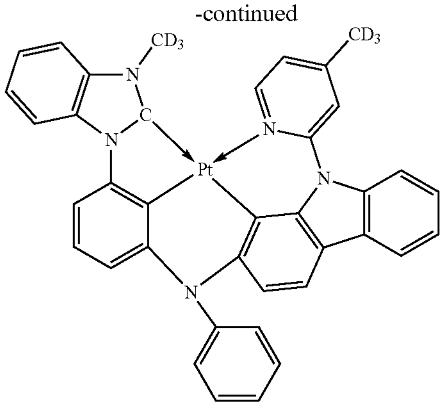
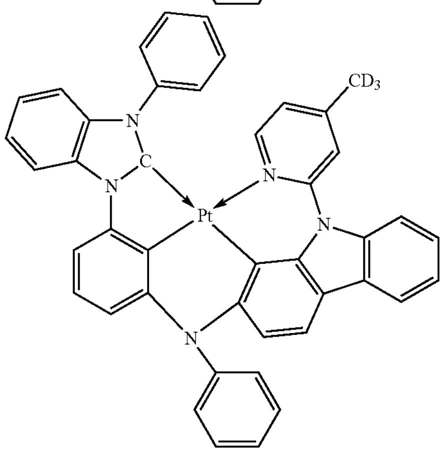
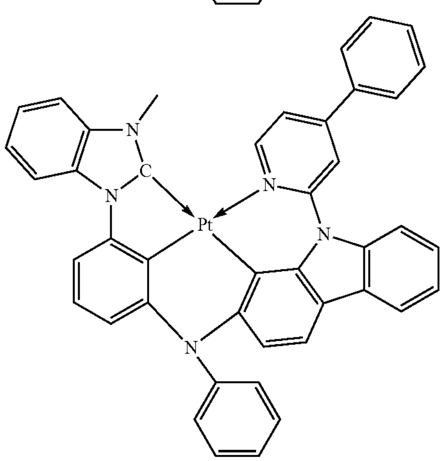
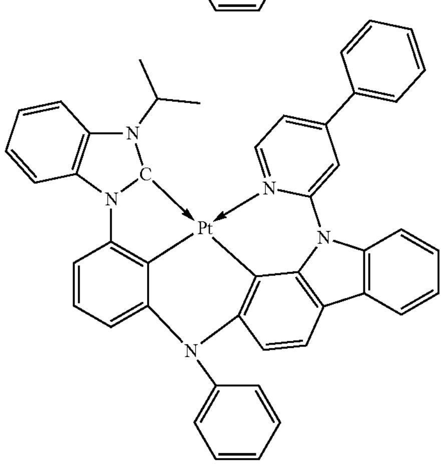
-continued
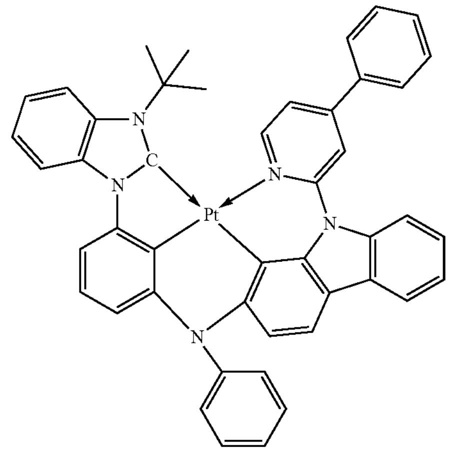
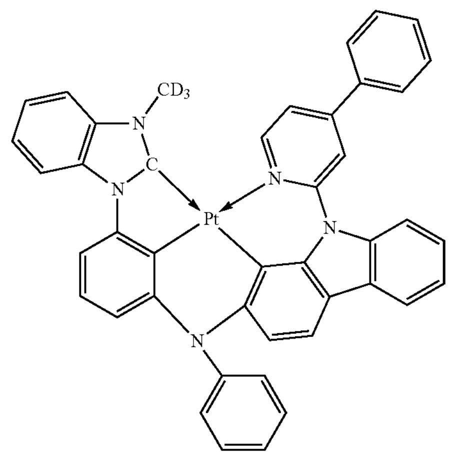
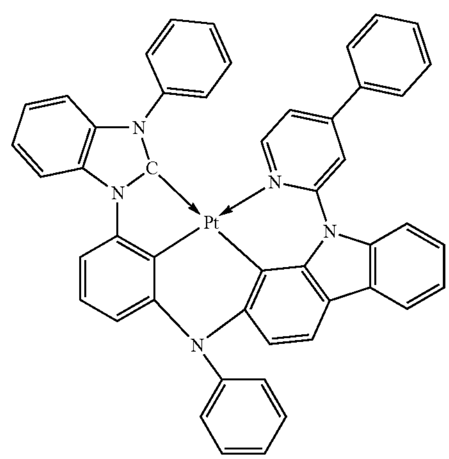

-continued
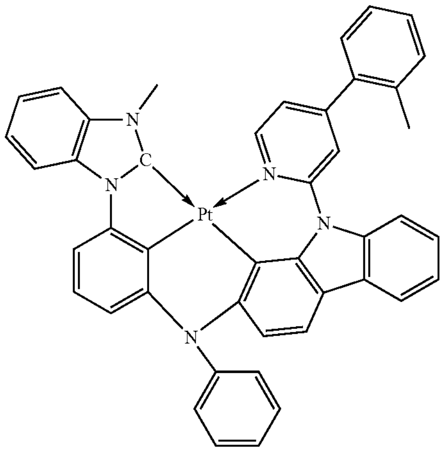
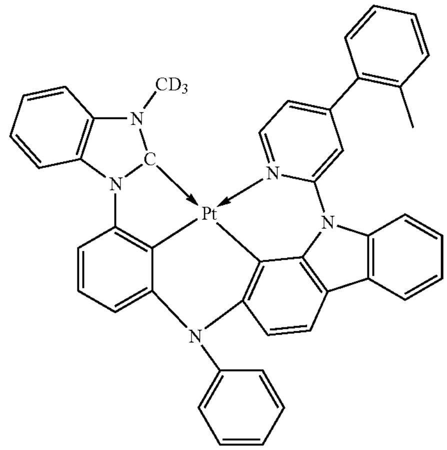
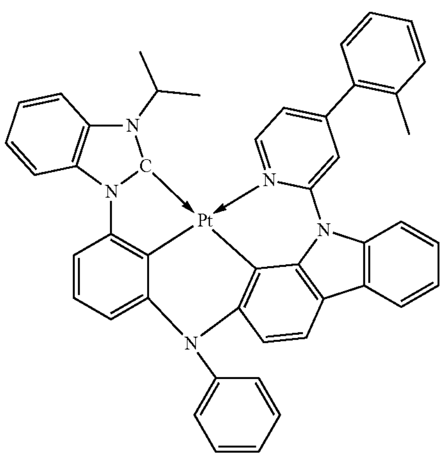
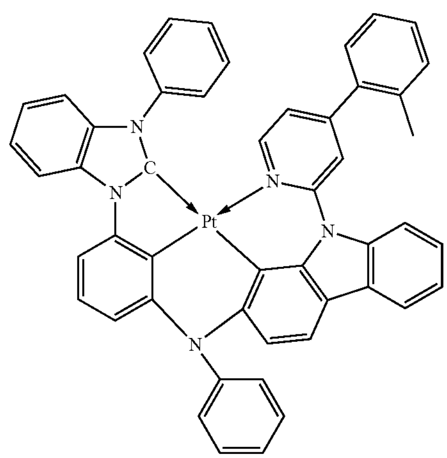
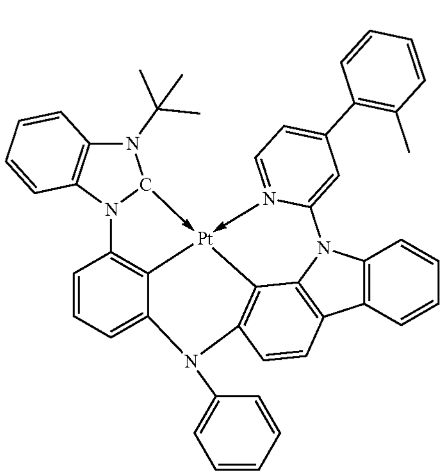
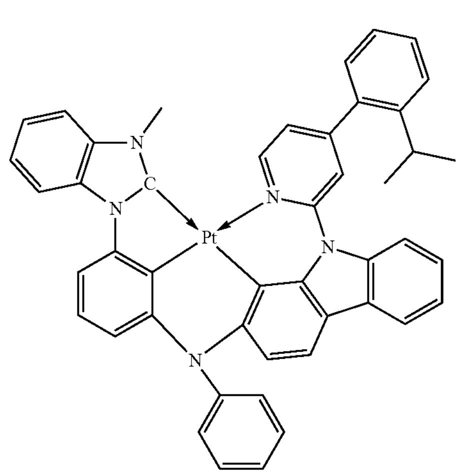
-continued -continued
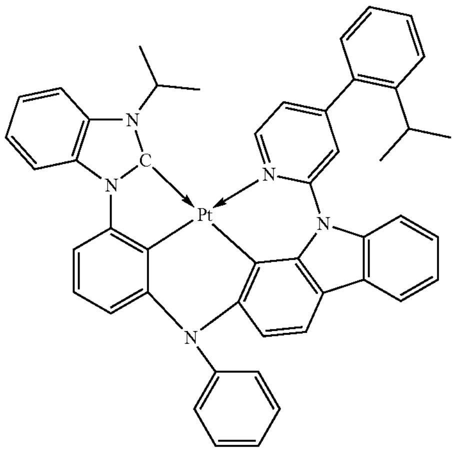
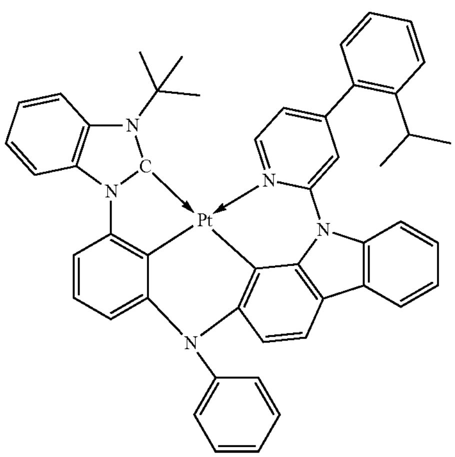
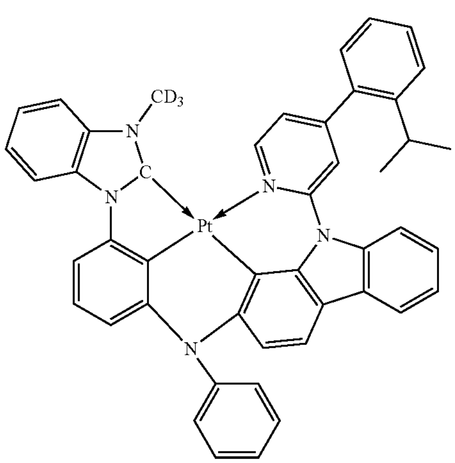
-continued
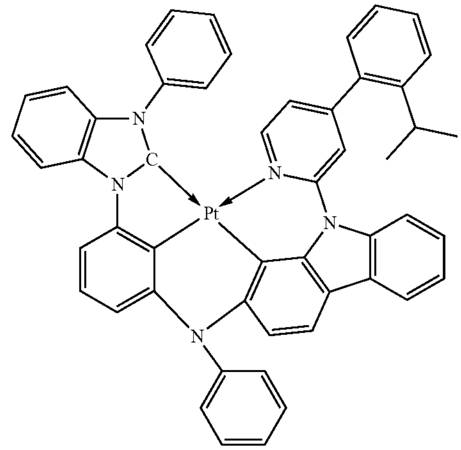
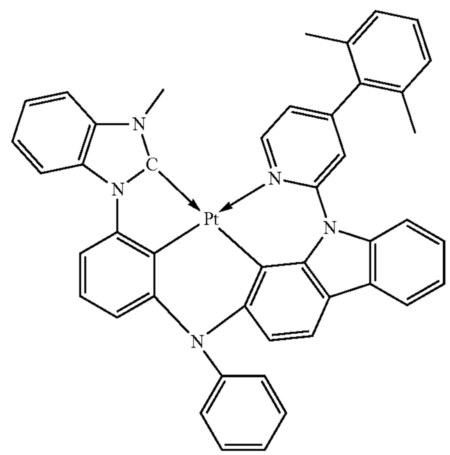
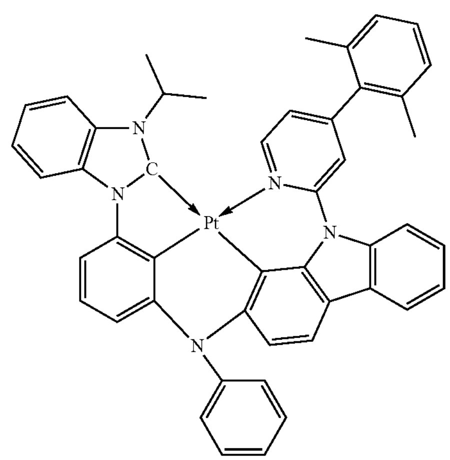

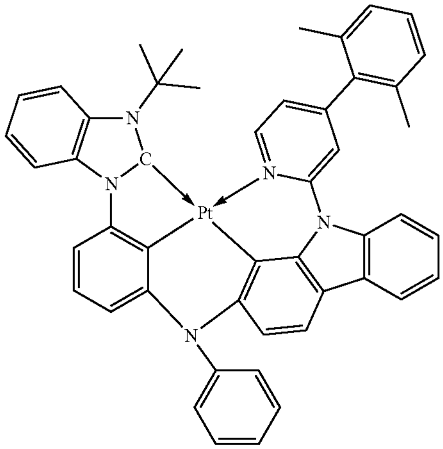
N
C
N
Pt
N
N
N
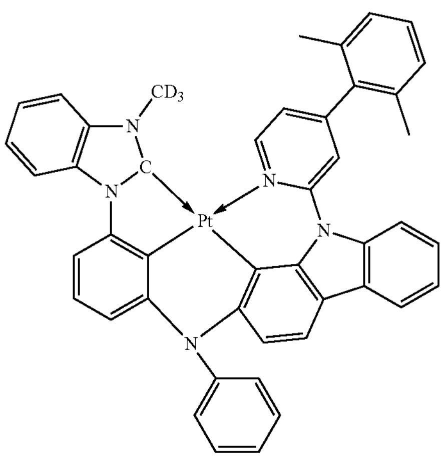
CD3
N
C
N
Pt
N
N
N
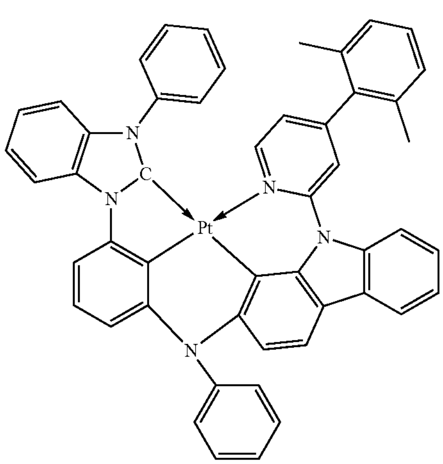
N
C
N
Pt
N
N
N
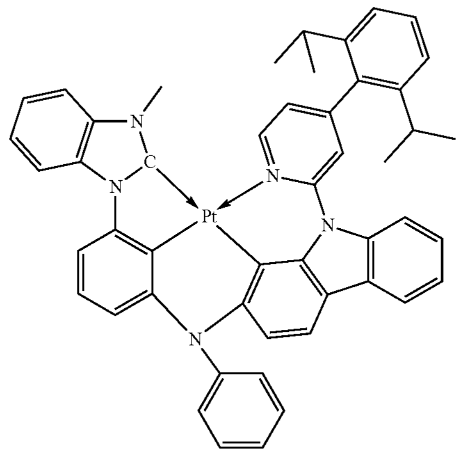
N
C
N
Pt
N
N
N
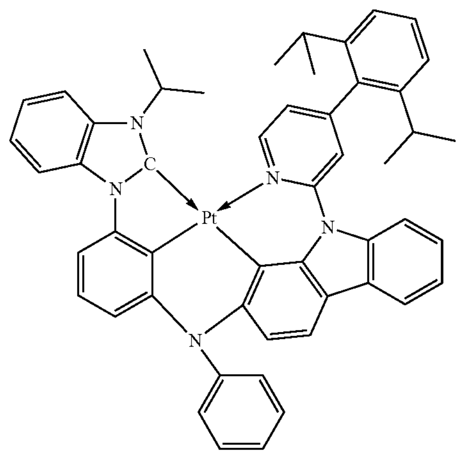
N
C
N
Pt
N
N
N
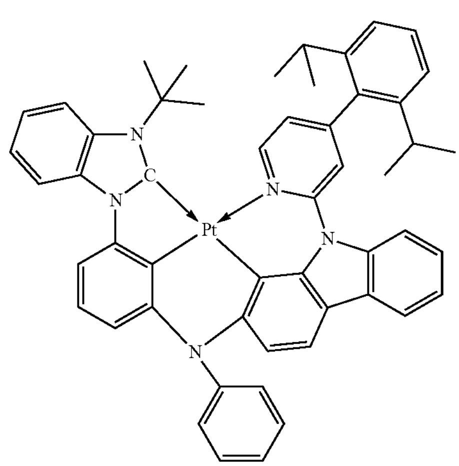
N
C
N
Pt
N
N
N

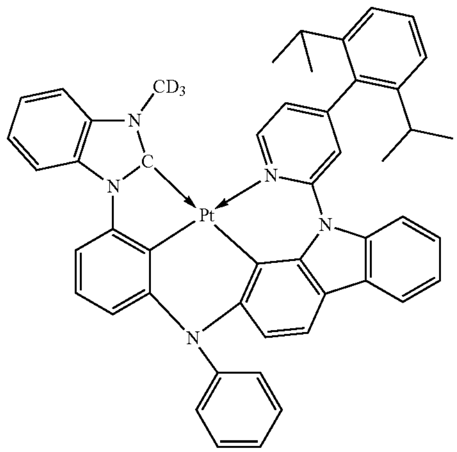
CD3
N
C
N
Pt
N
N
N
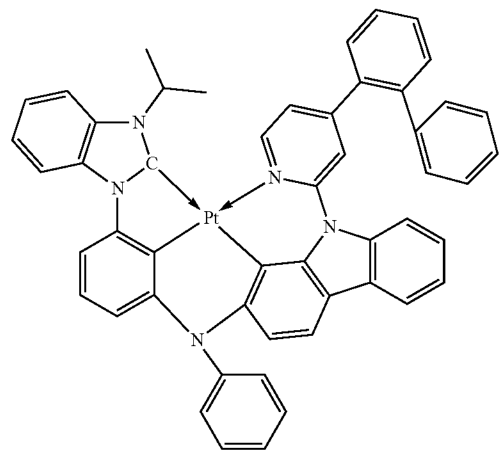
N
C
N
Pt
N
N
N
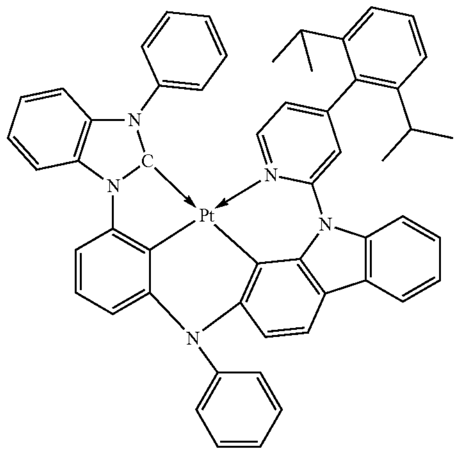
N
C
N
Pt
N
N
N
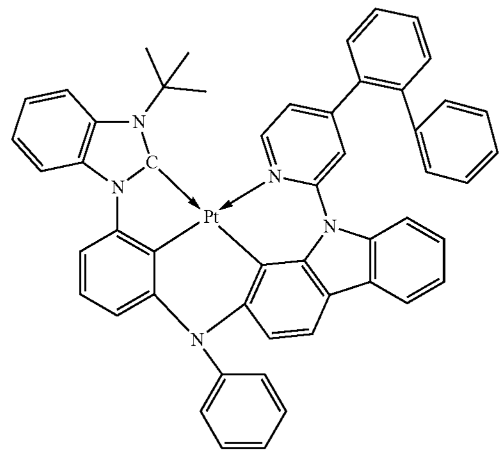
N
C
N
Pt
N
N
N
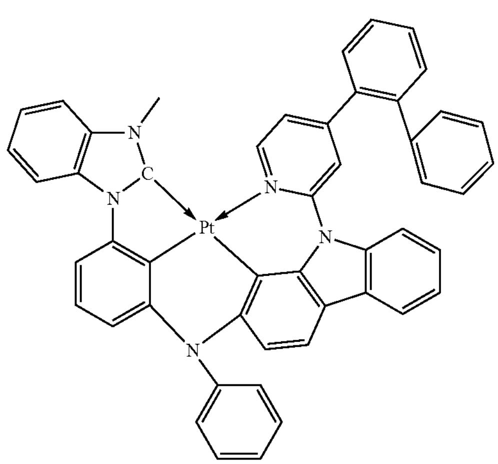
N
C
N
Pt
N
N
N
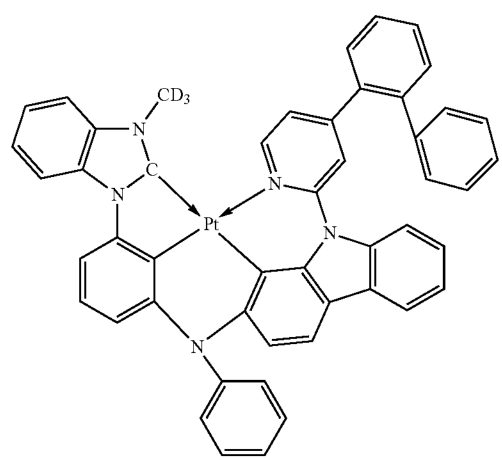
CD3
N
C
N
Pt
N
N
N -continued
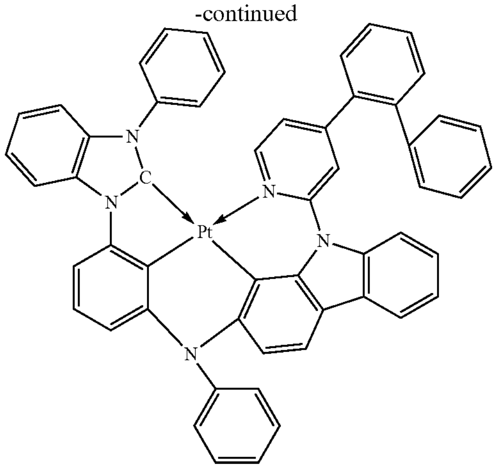
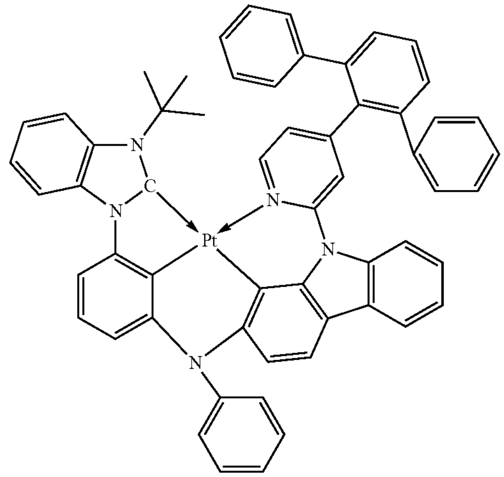
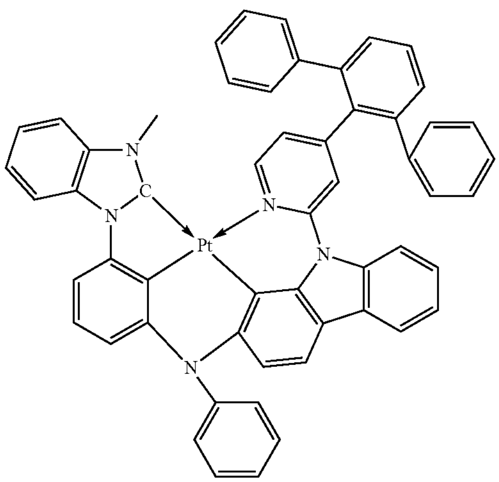
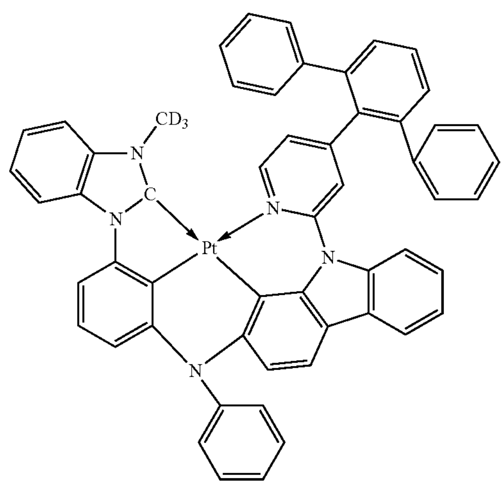
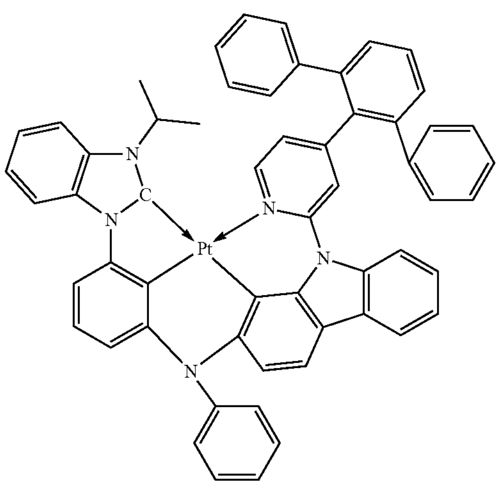
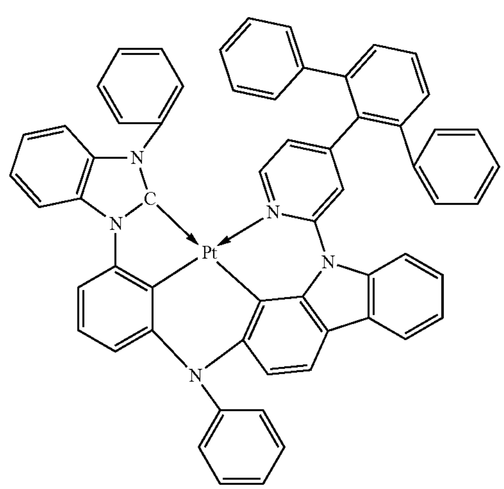

-continued
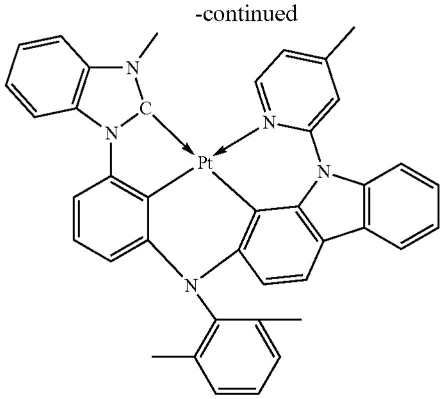
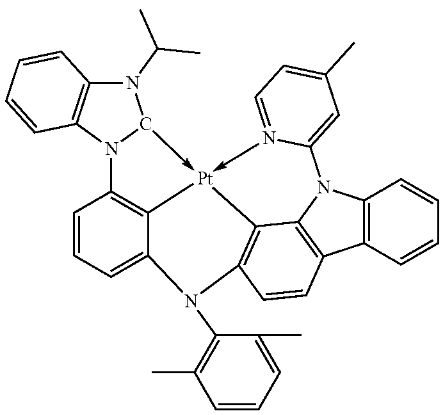
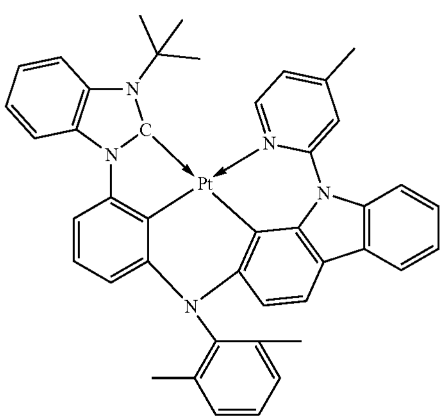
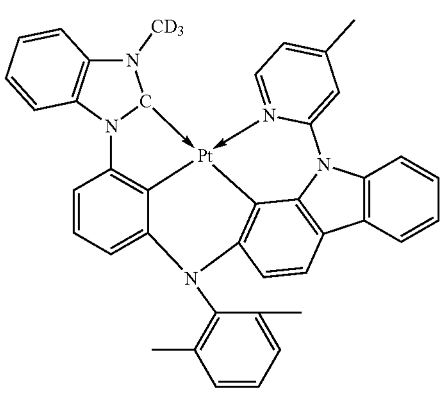
-continued
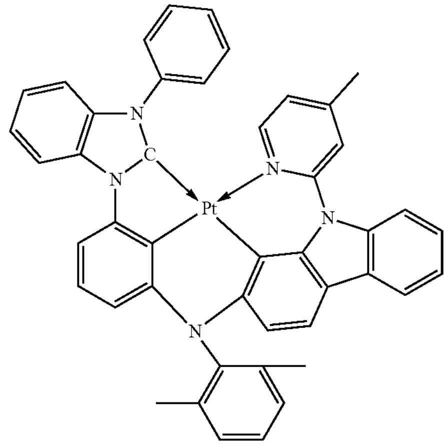
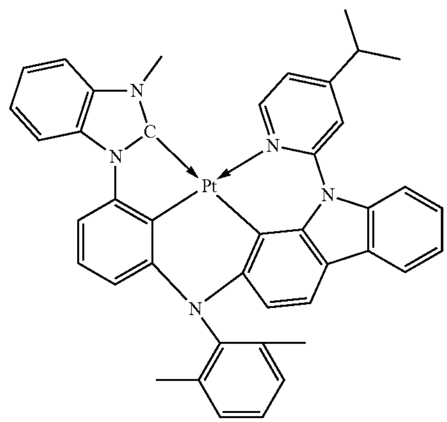
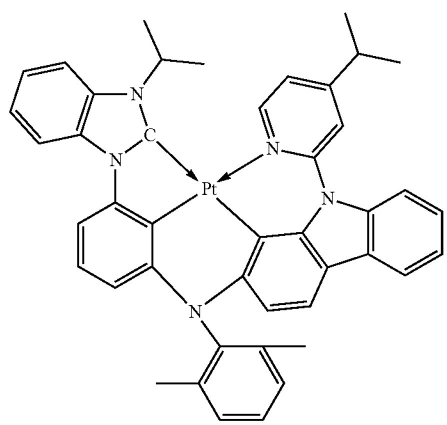
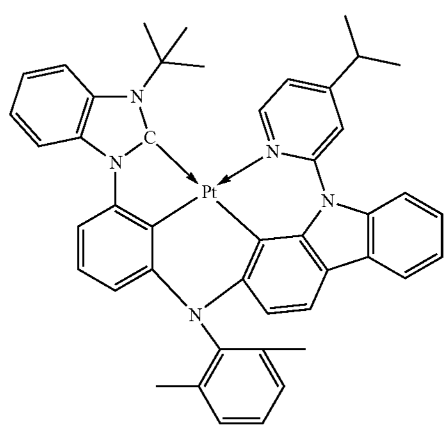

-continued
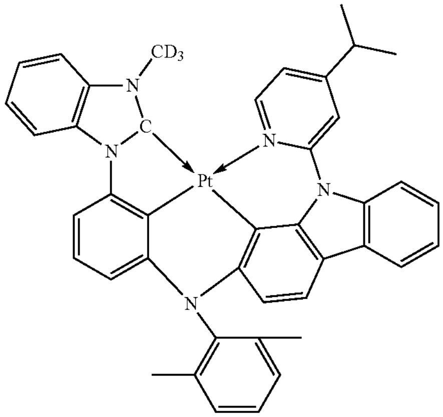
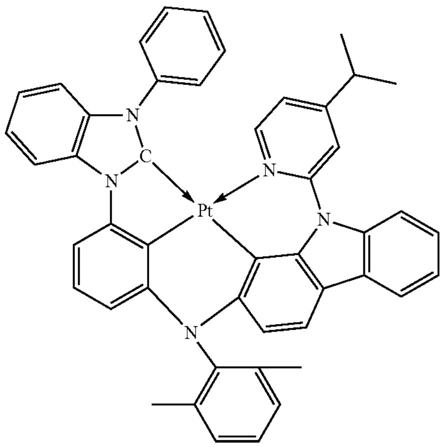
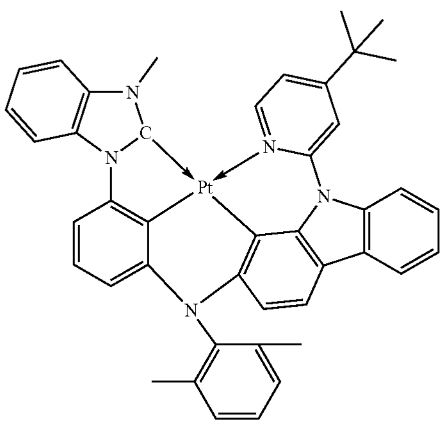
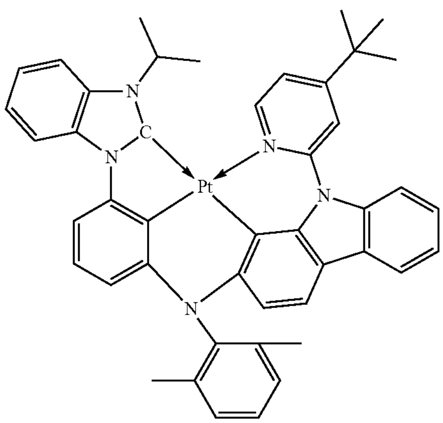
-continued
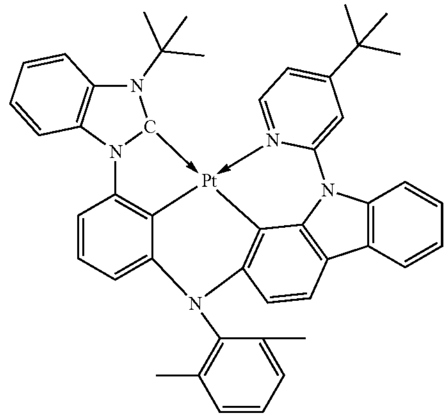
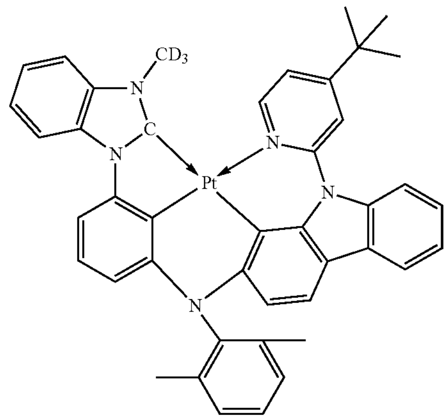
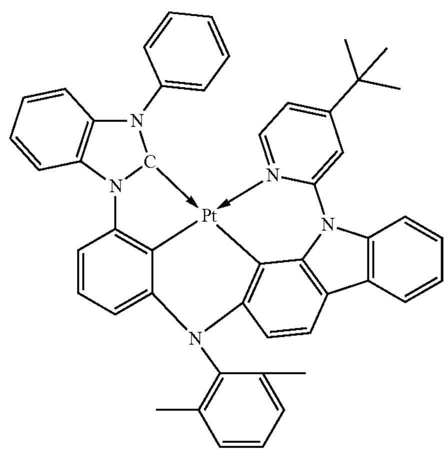
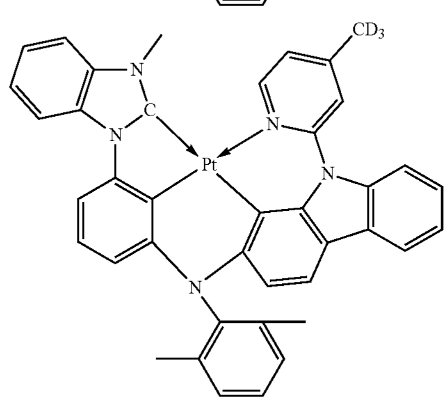

-continued
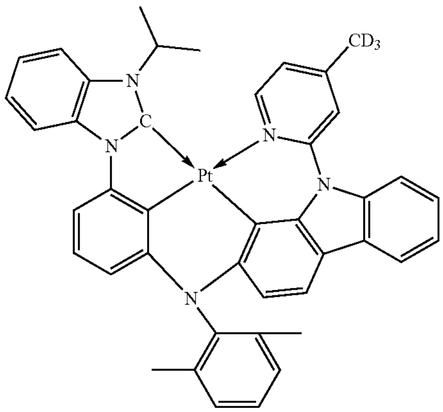
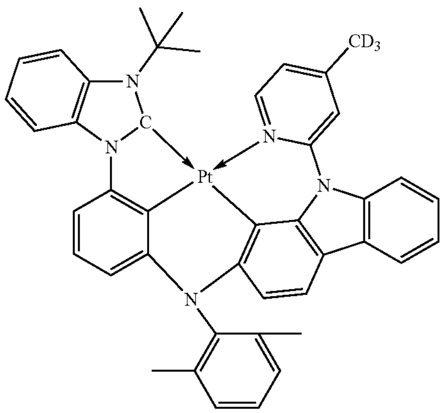
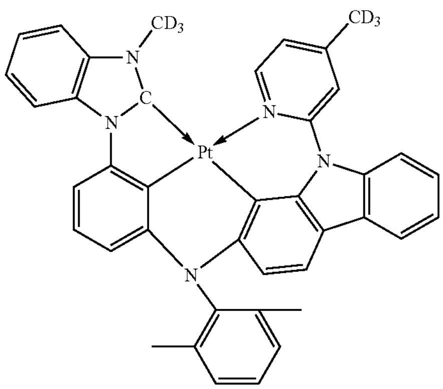
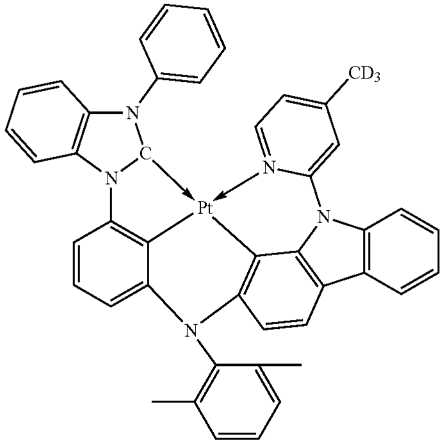
-continued
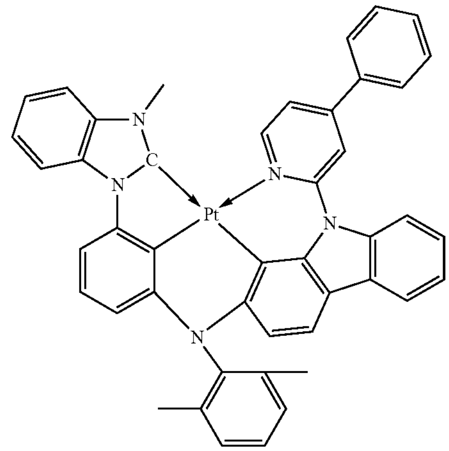
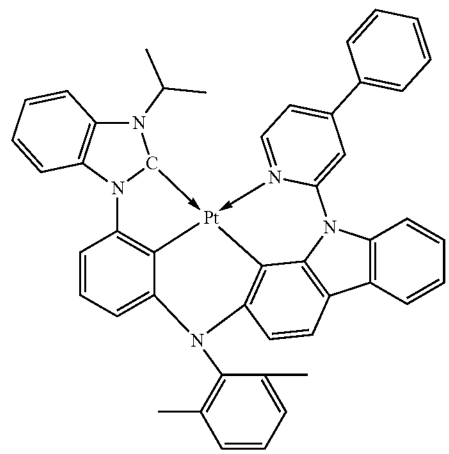
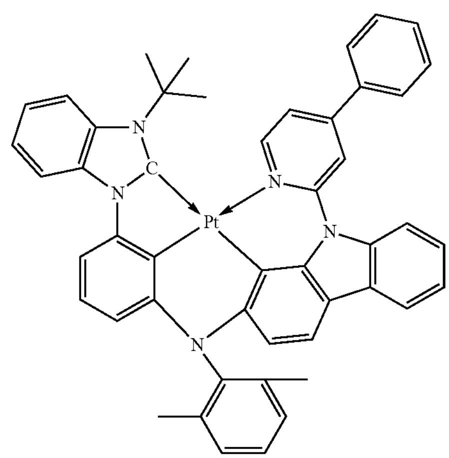

-continued
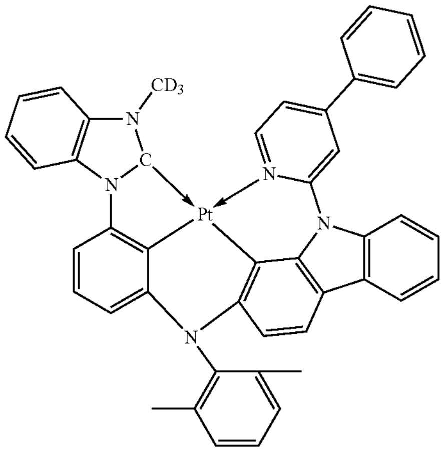
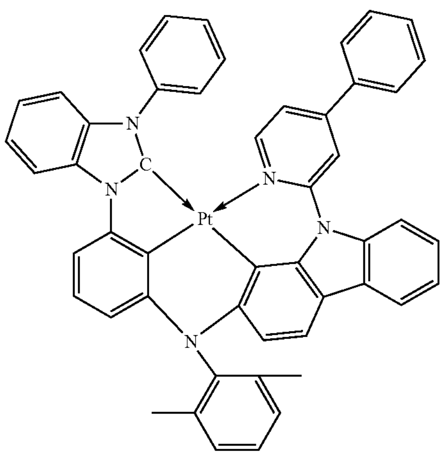
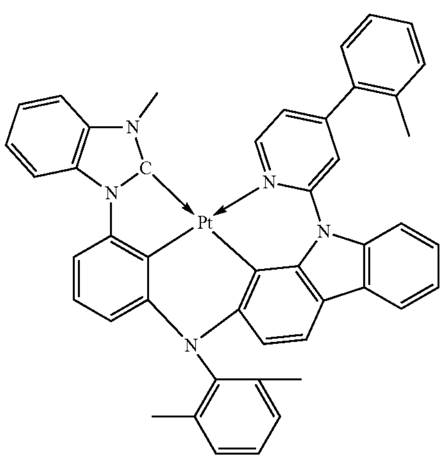
-continued
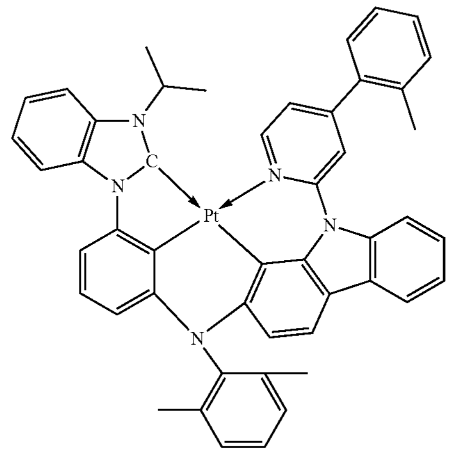
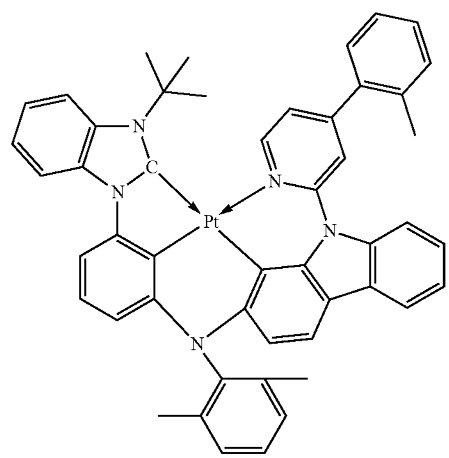
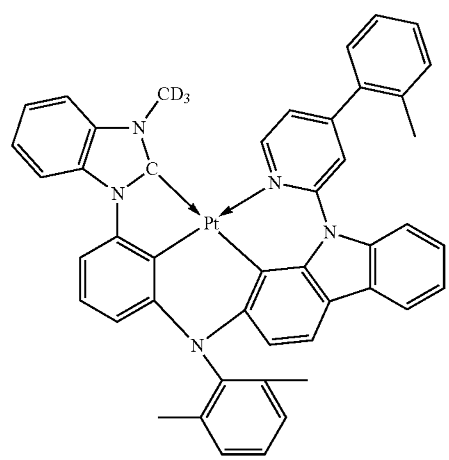

-continued
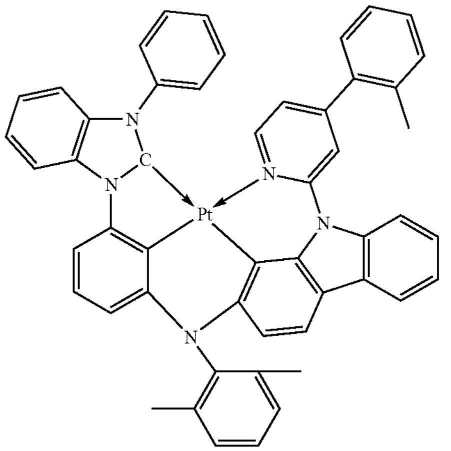
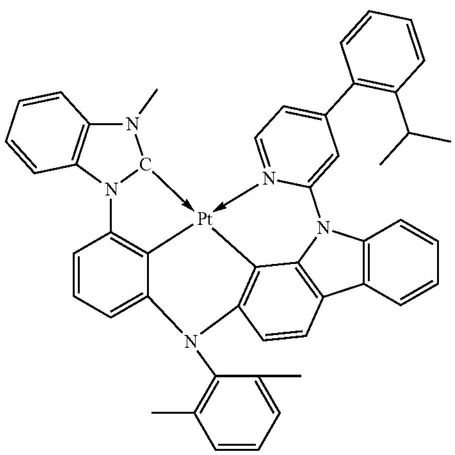
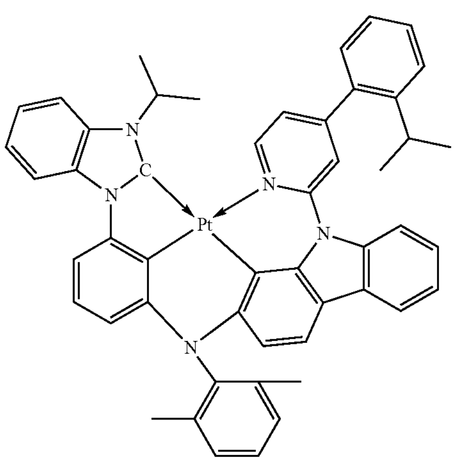
-continued
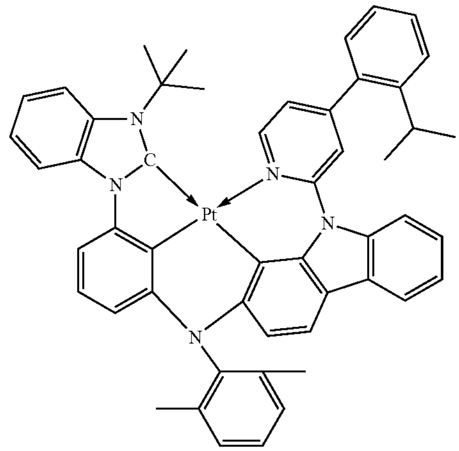
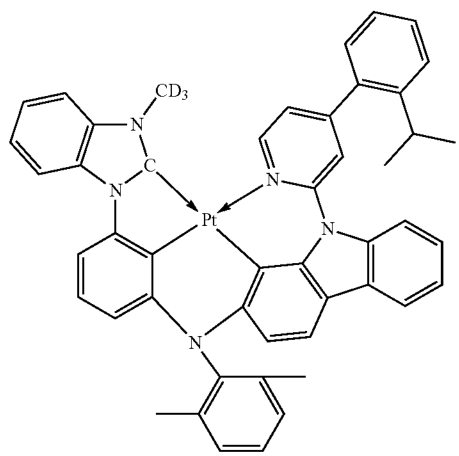
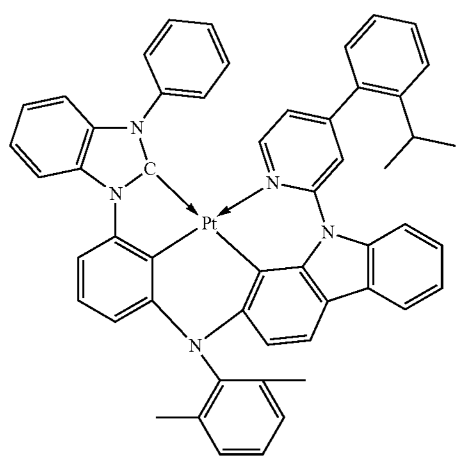

-continued
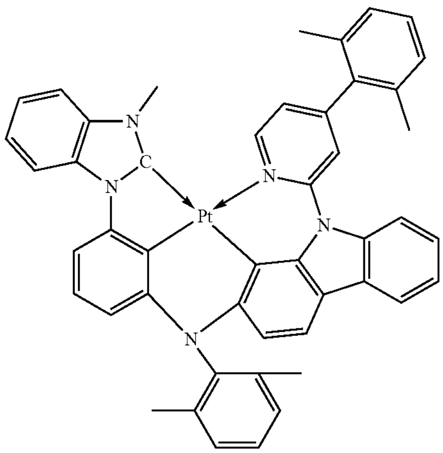
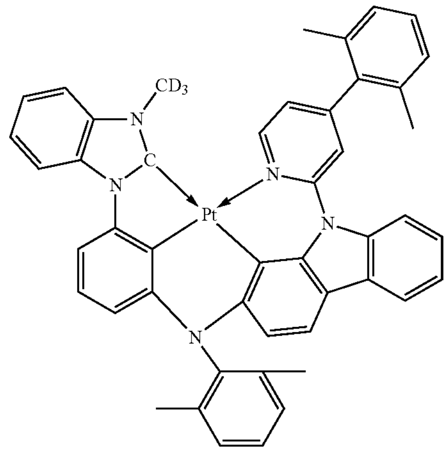
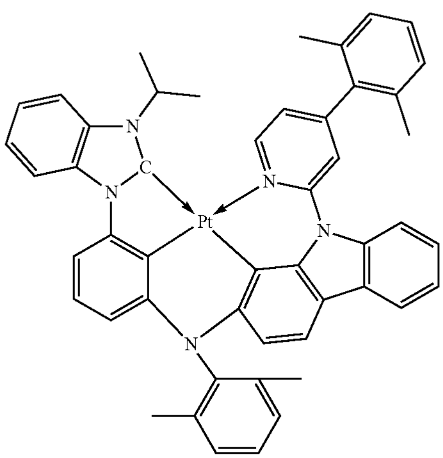
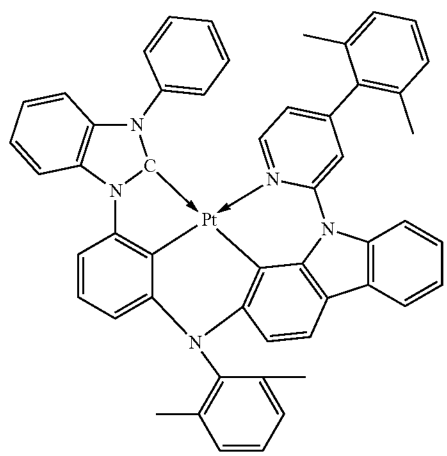
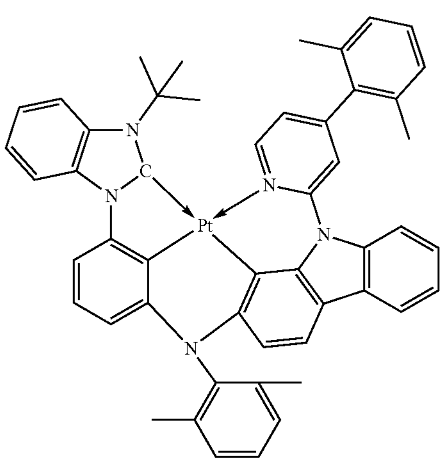
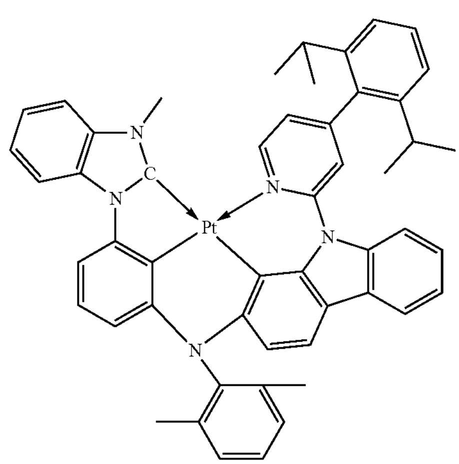

-continued
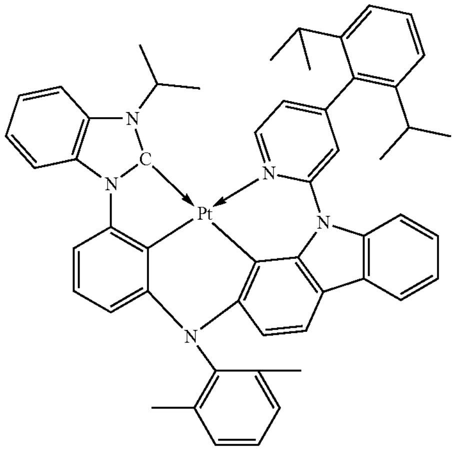
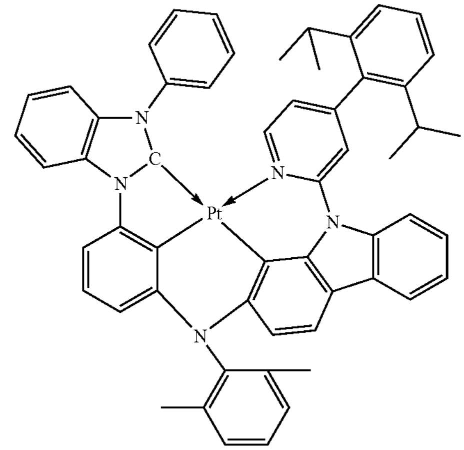
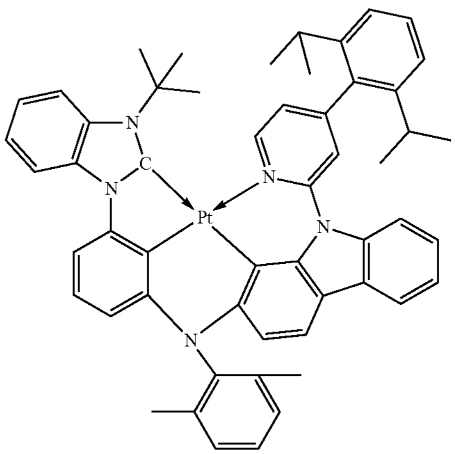
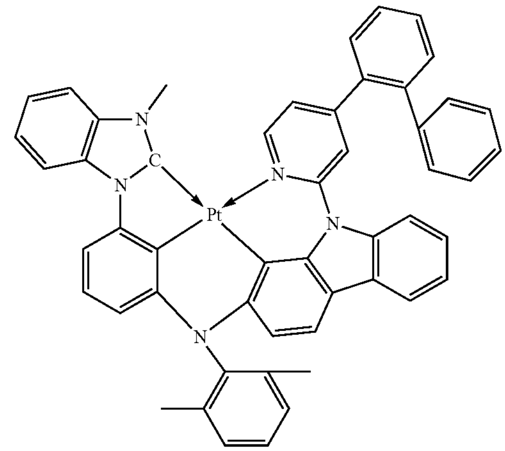
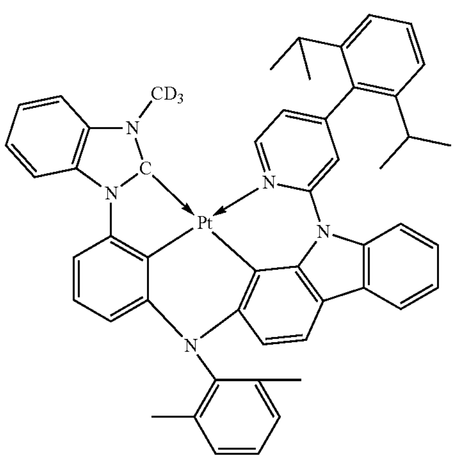
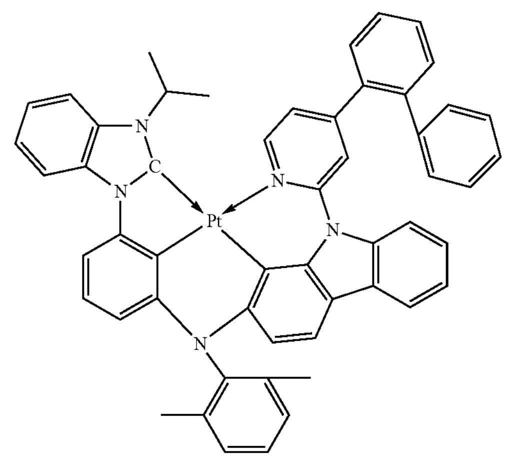
-continued -continued
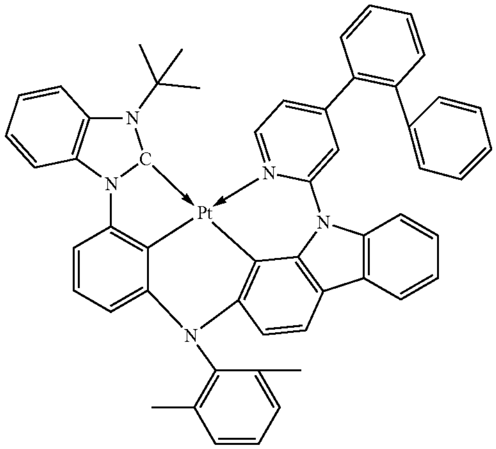
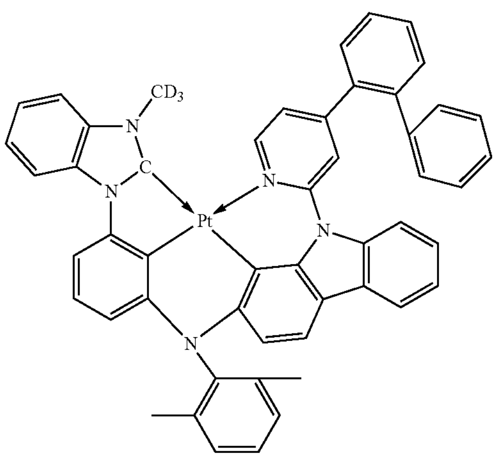
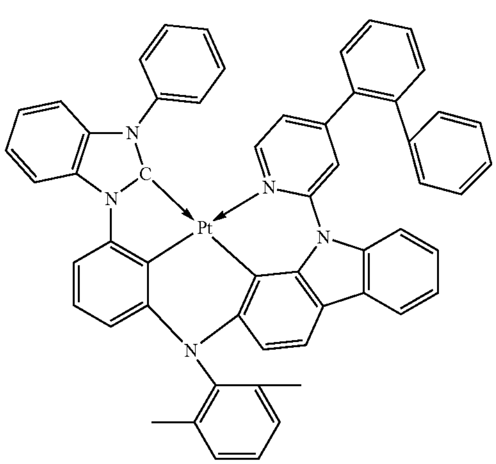
-continued
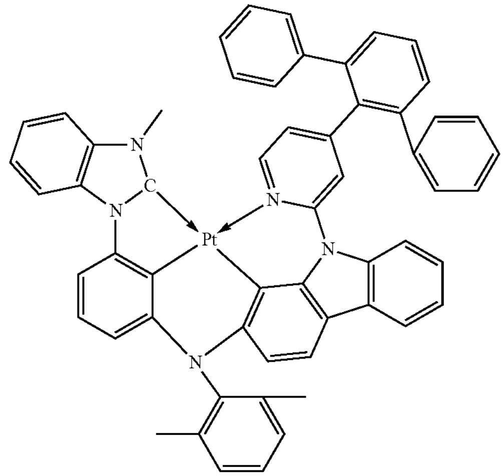
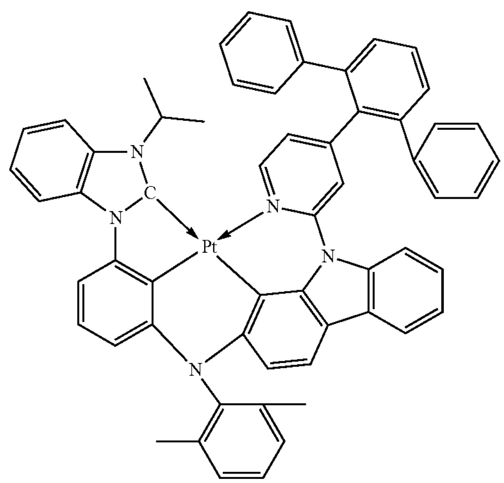
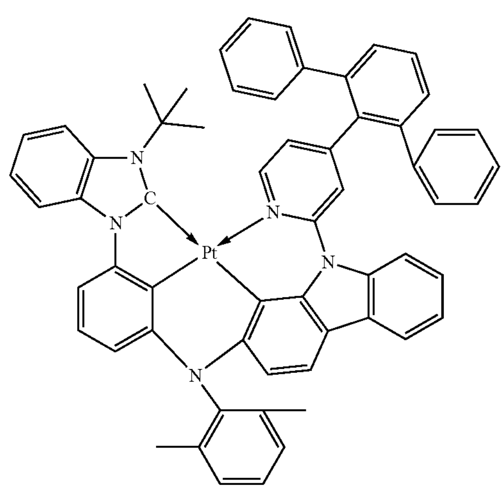

-continued
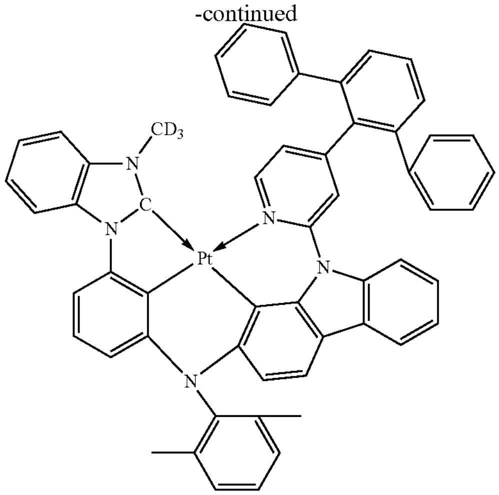
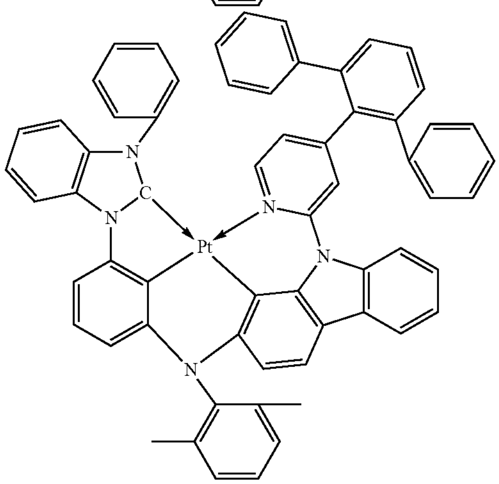
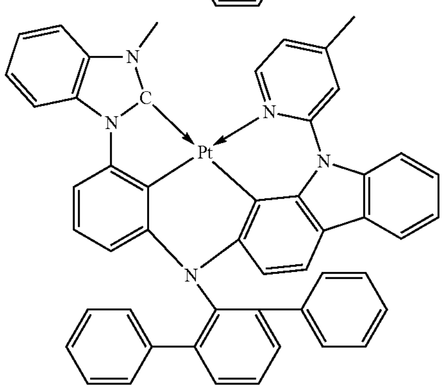
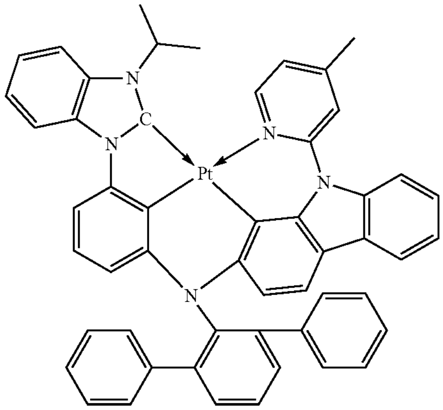
-continued
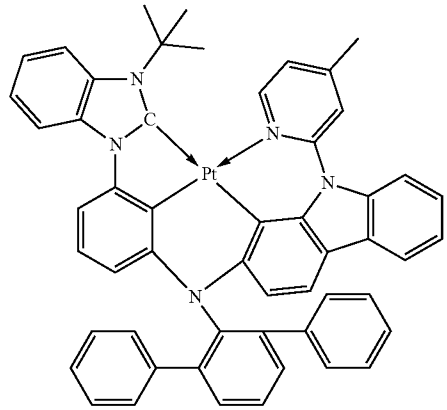
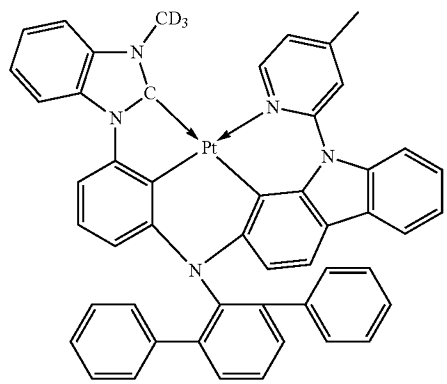
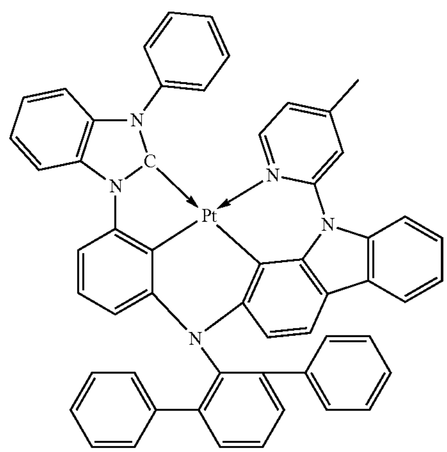
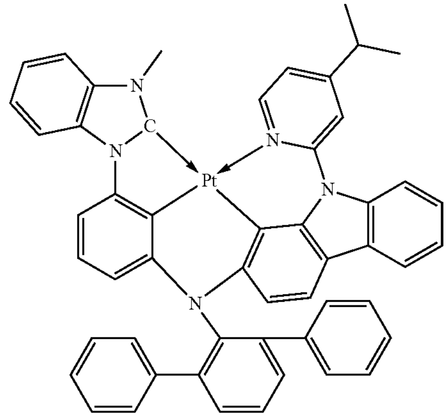

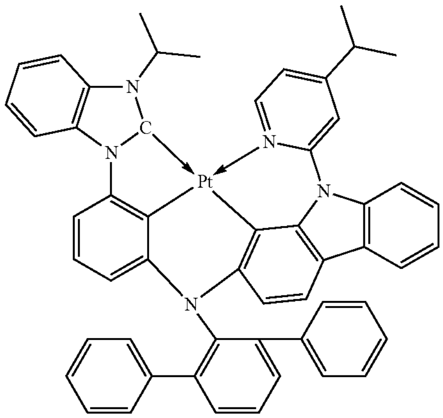
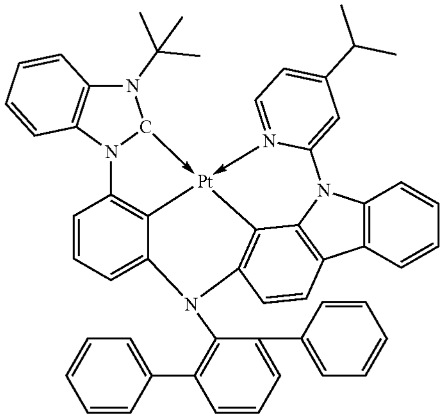
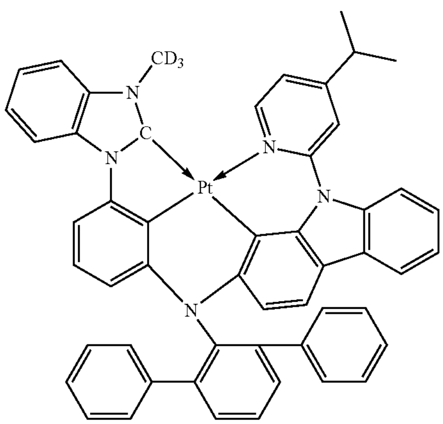
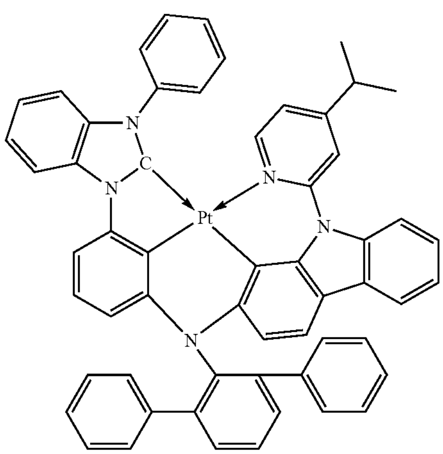
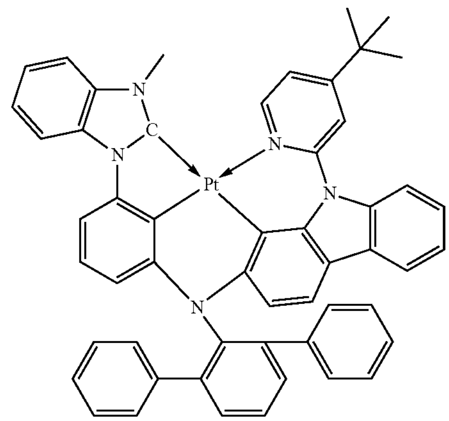
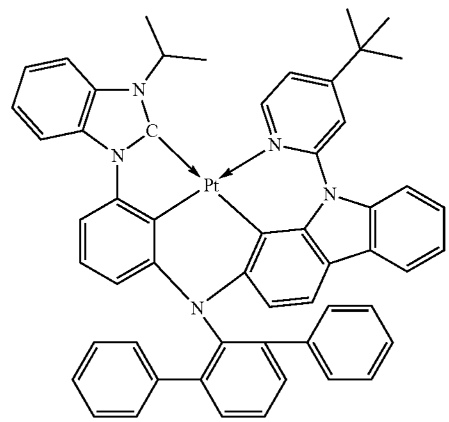
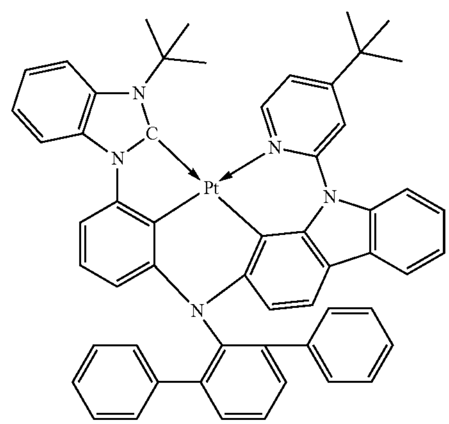
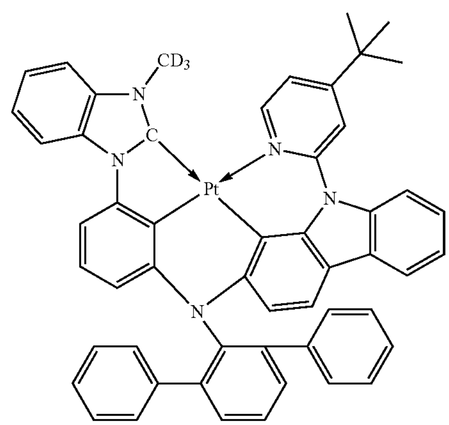

-continued
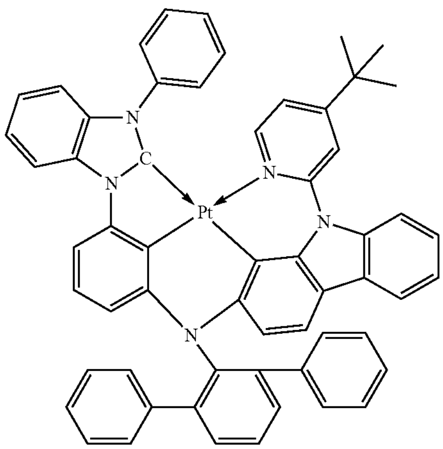
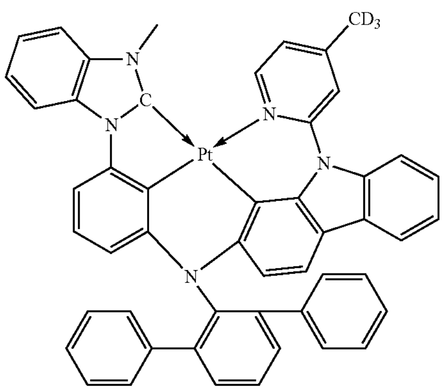
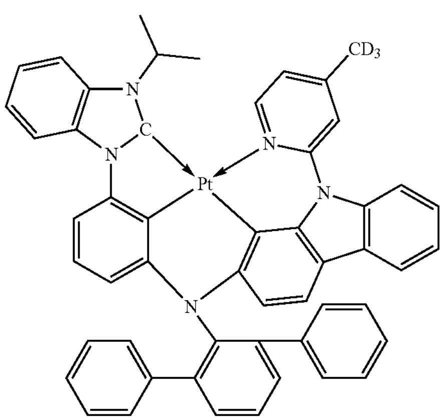
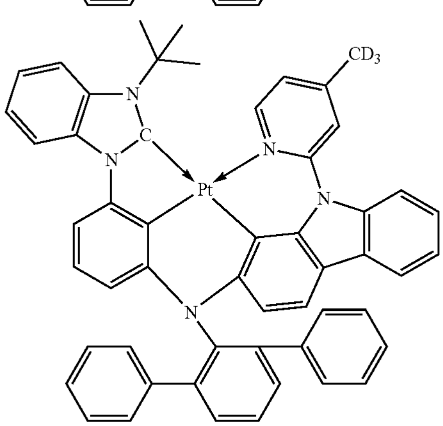
-continued
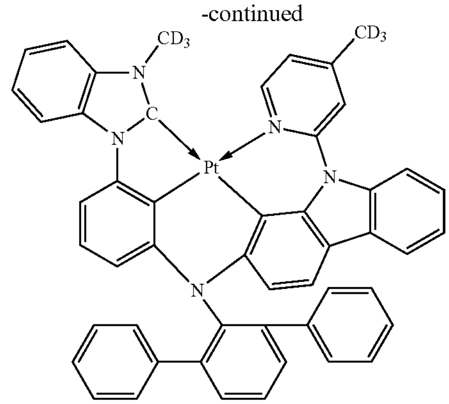
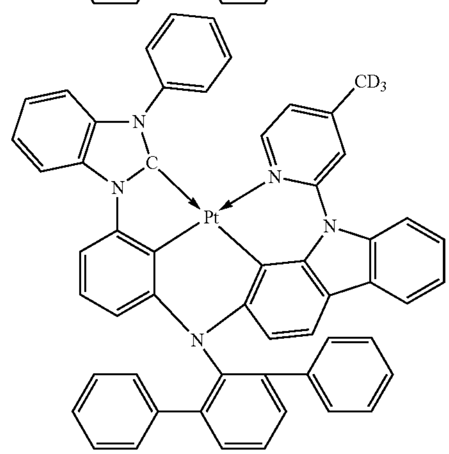
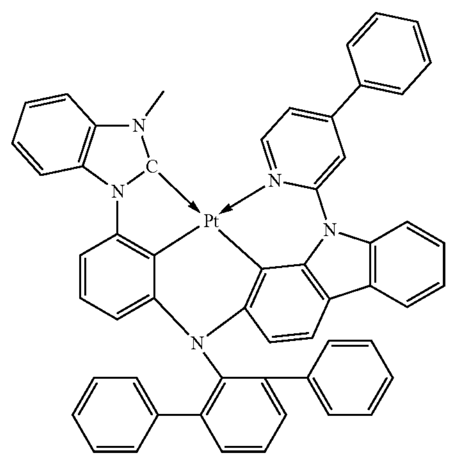
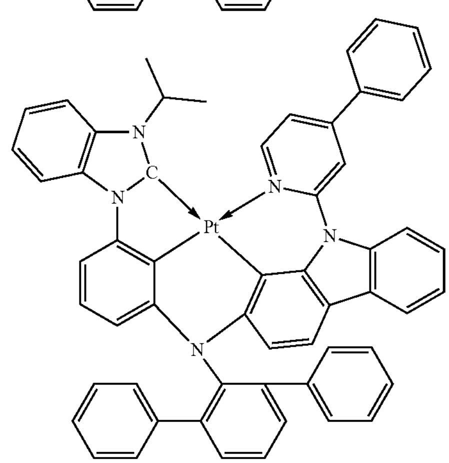

-continued
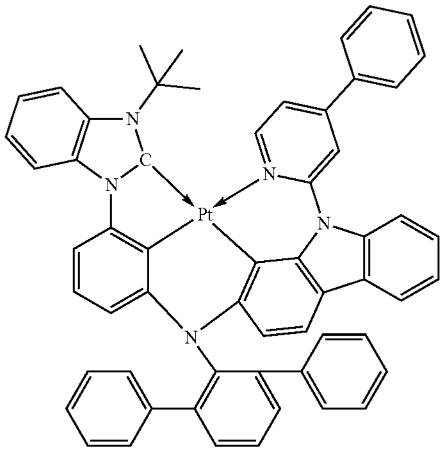
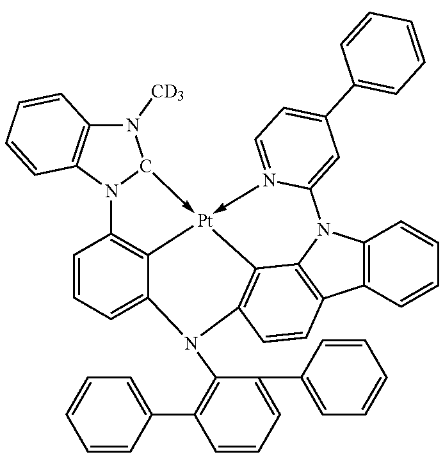
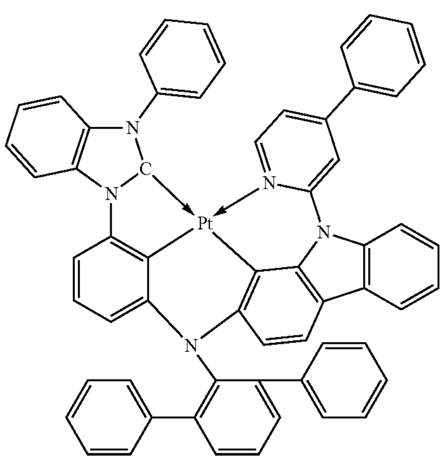
-continued
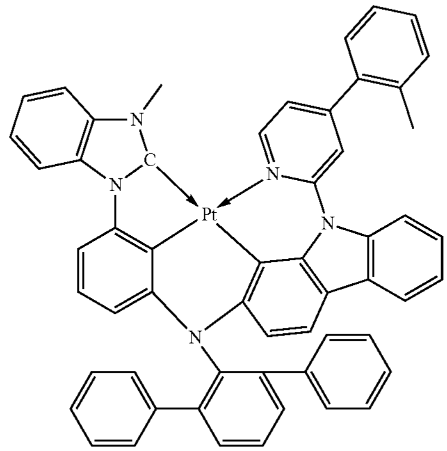
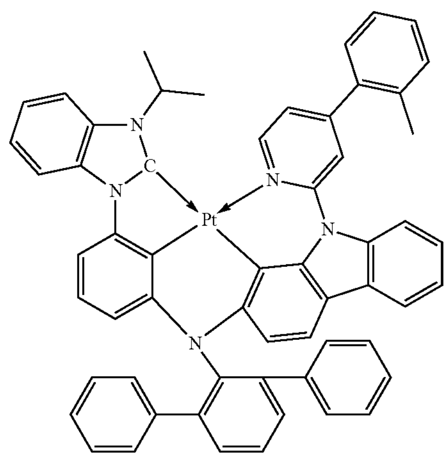
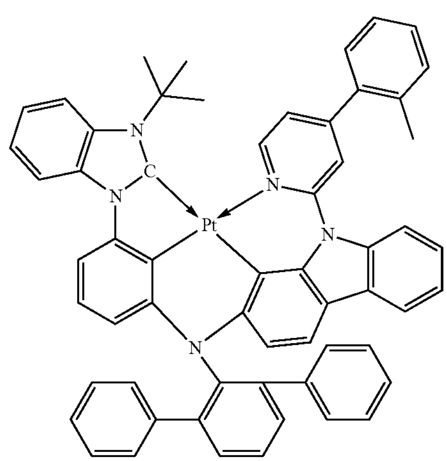

-continued
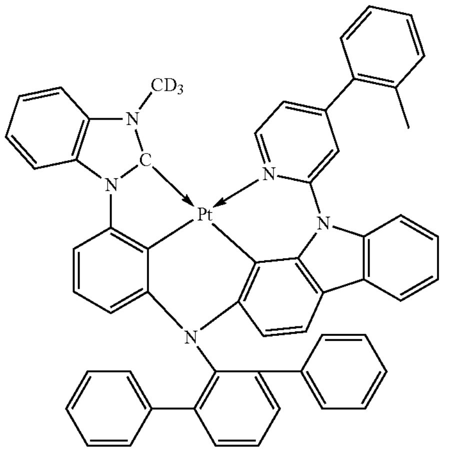
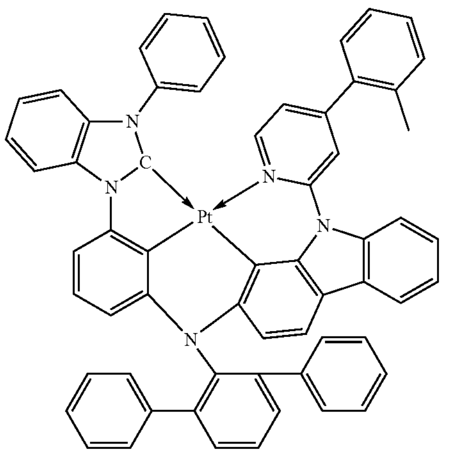
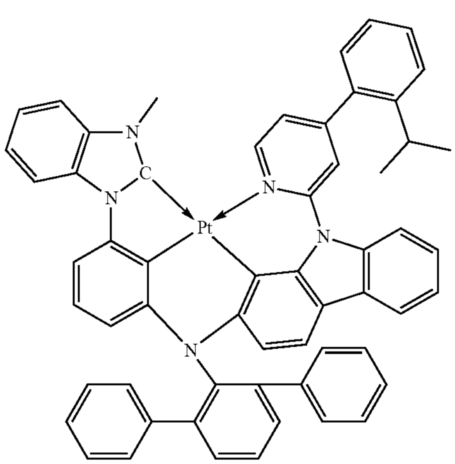
-continued
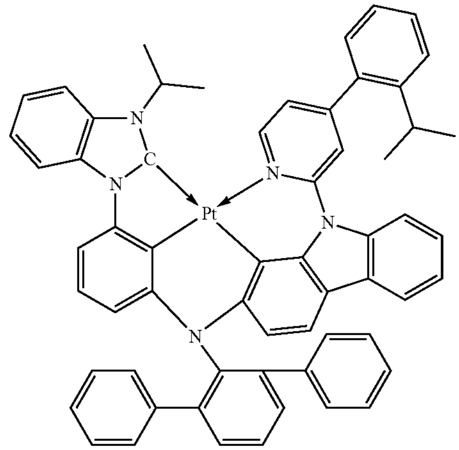
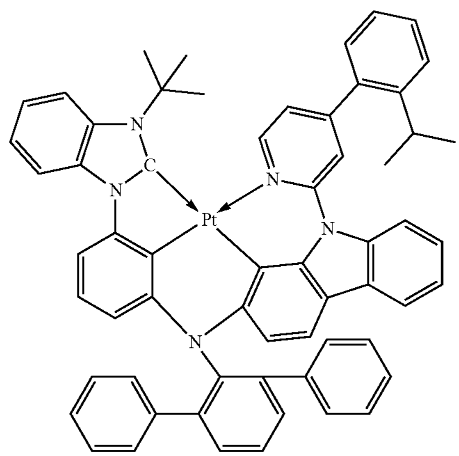
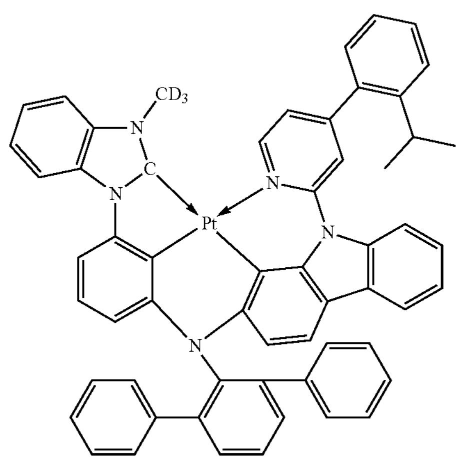

-continued
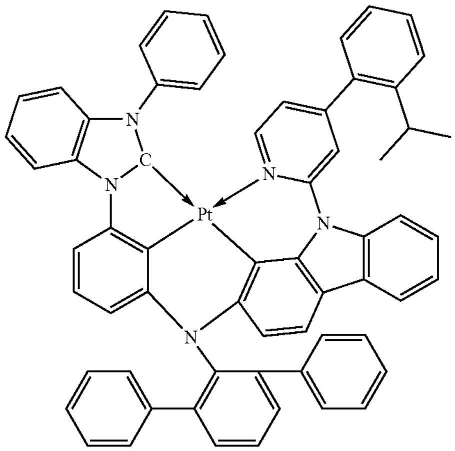
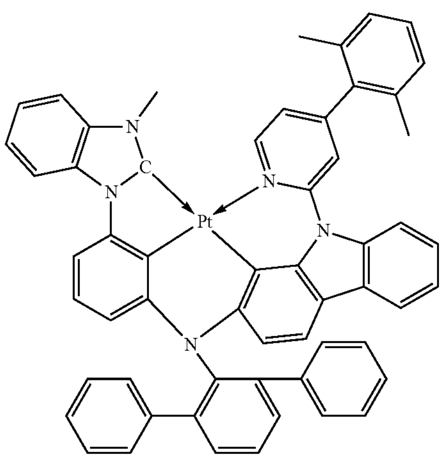
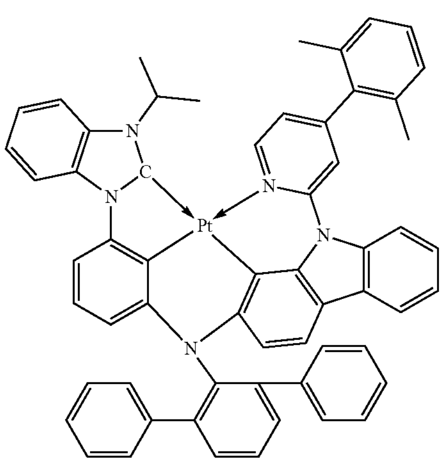
-continued
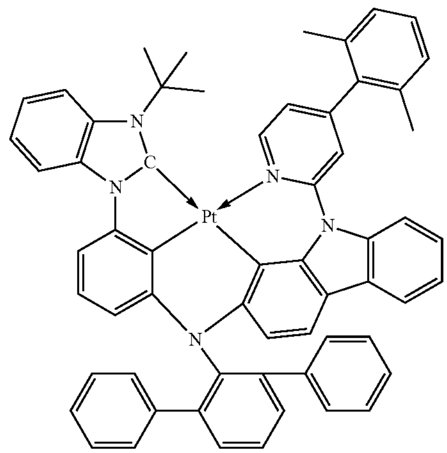
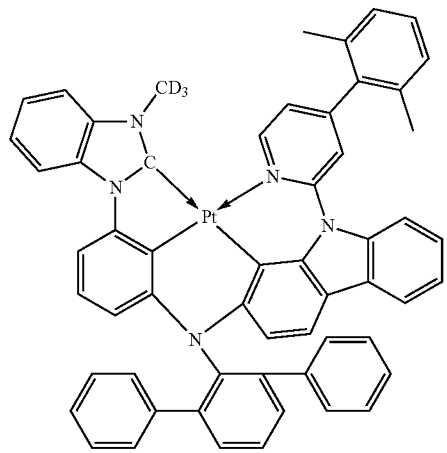
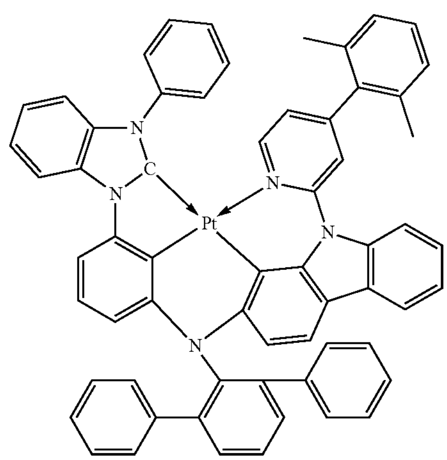

-continued
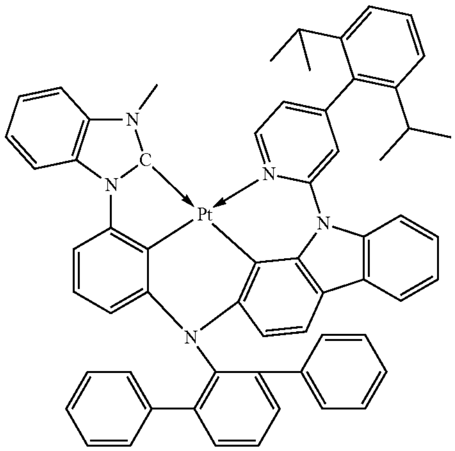
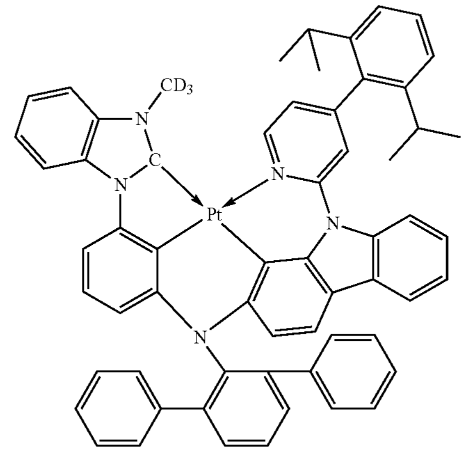
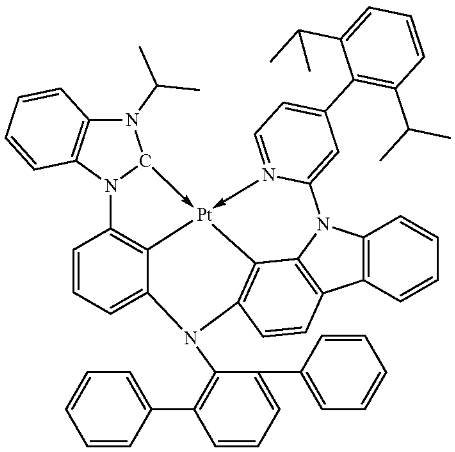
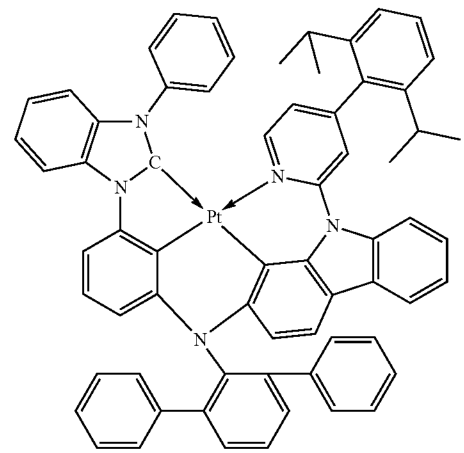
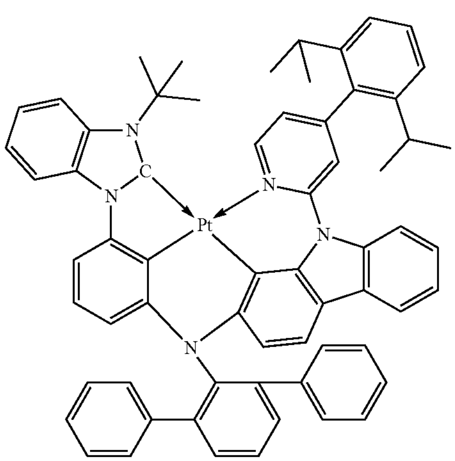
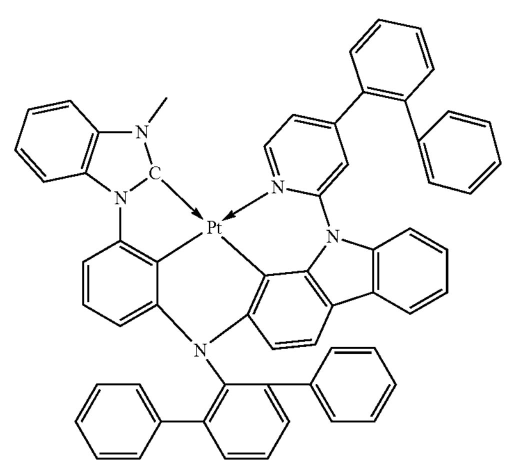

-continued
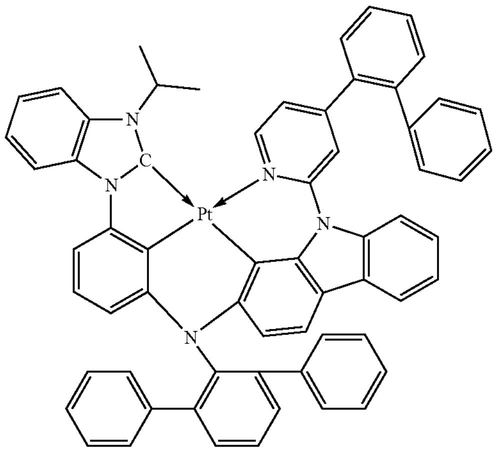
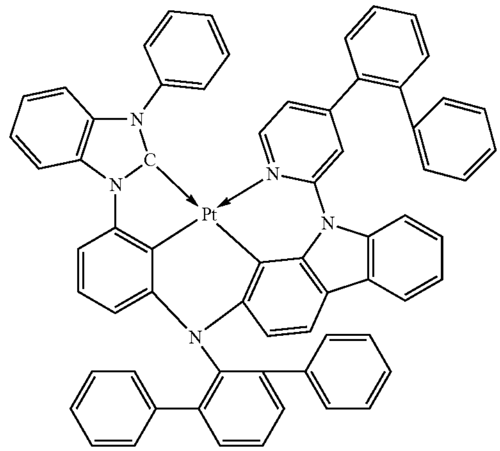
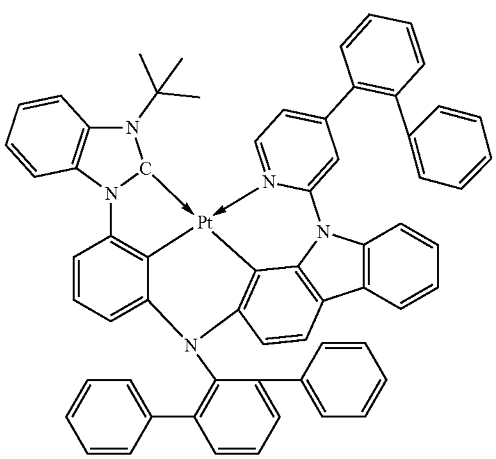
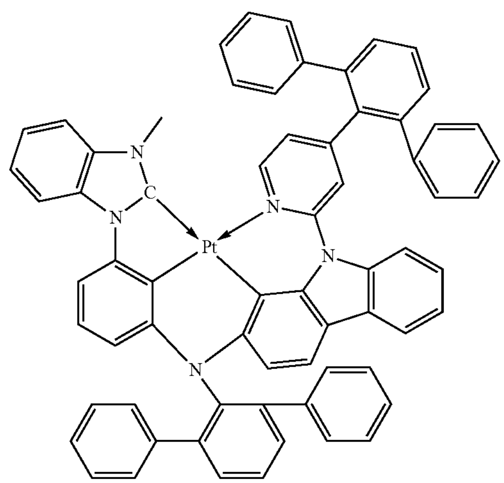
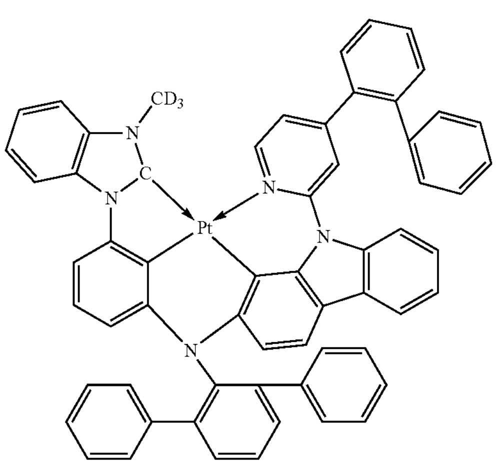
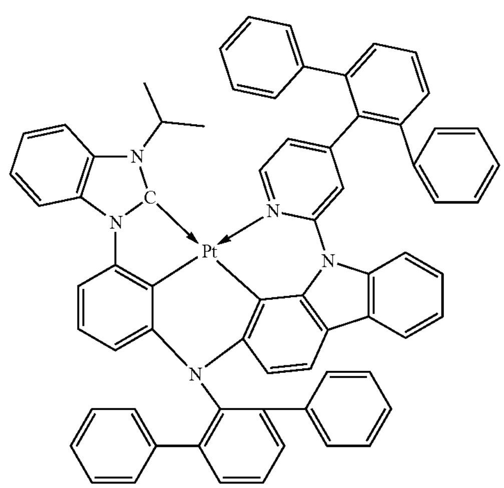

-continued
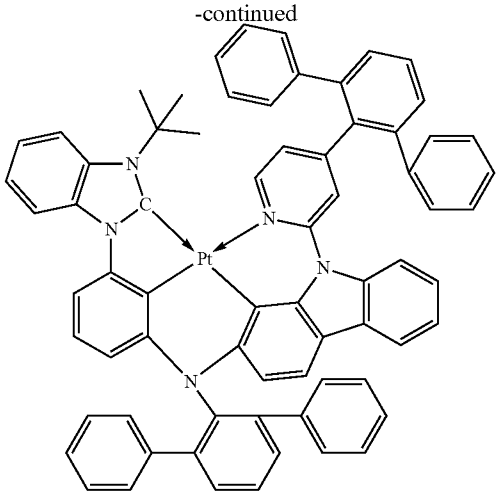
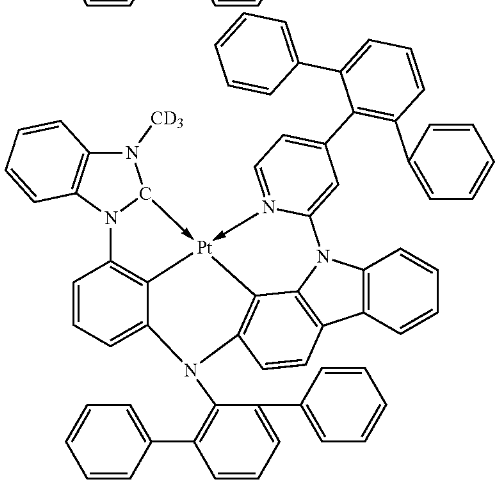
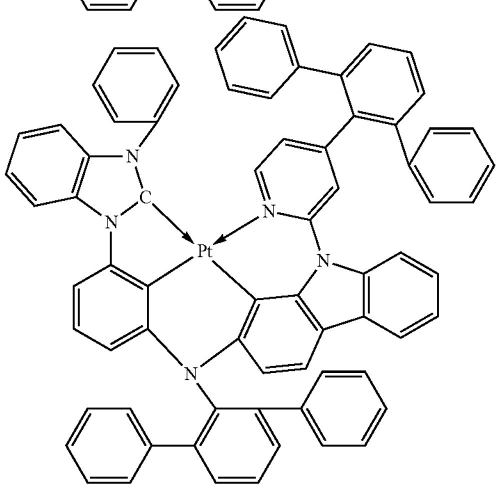
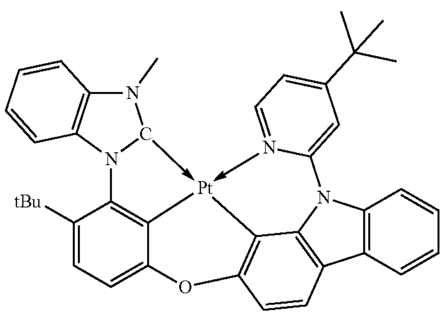
-continued
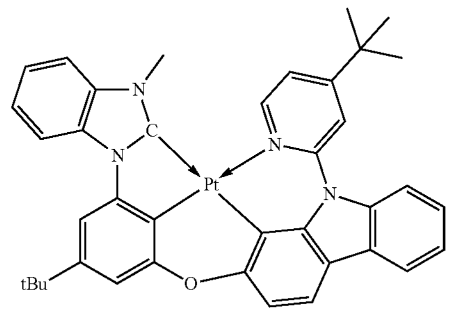
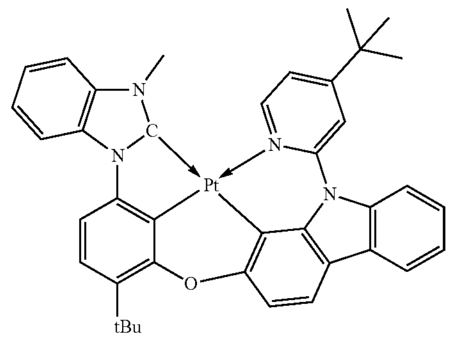
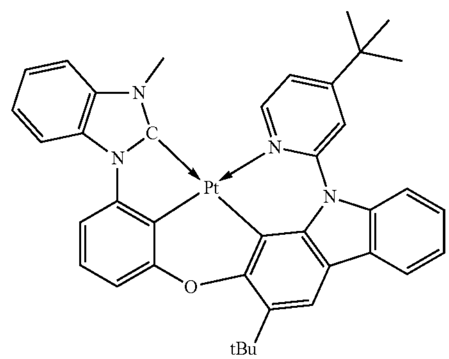
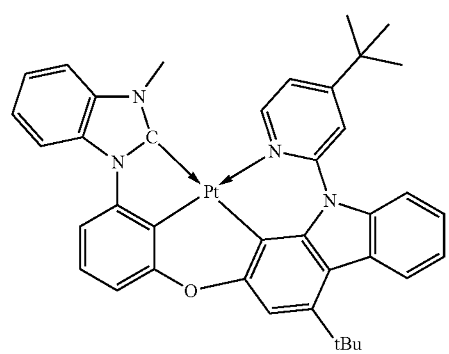
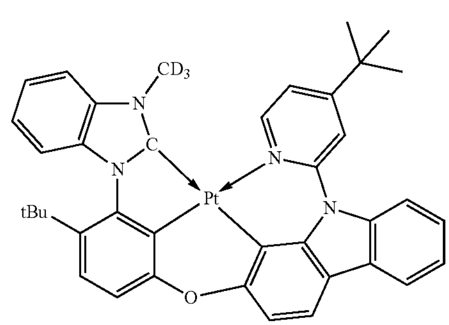

-continued
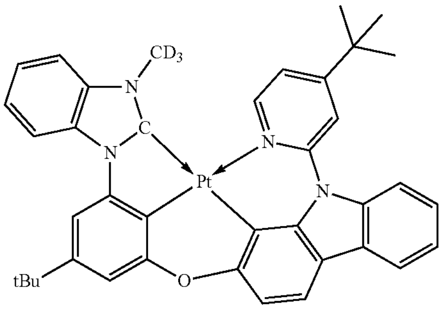
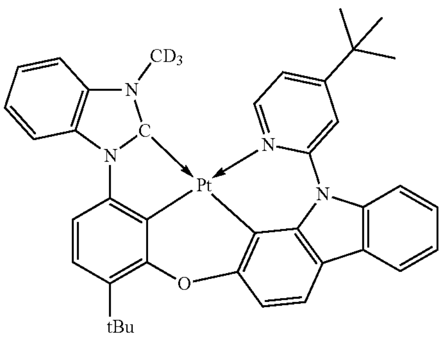
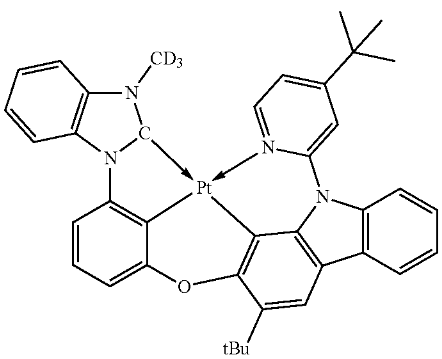
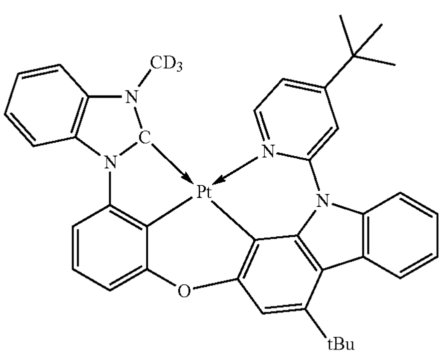
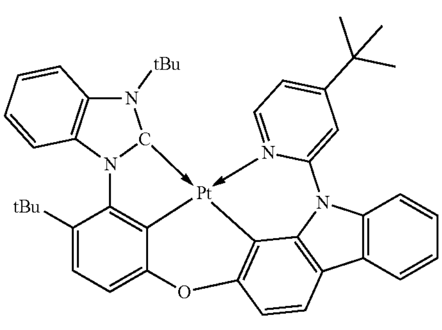
-continued
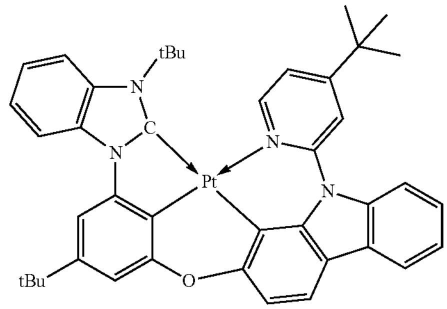
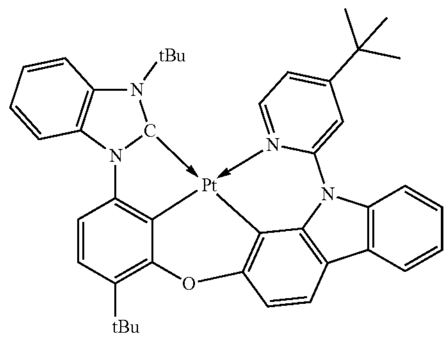
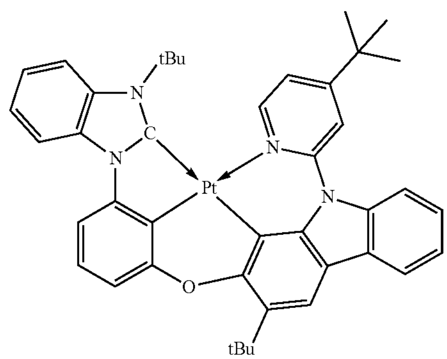
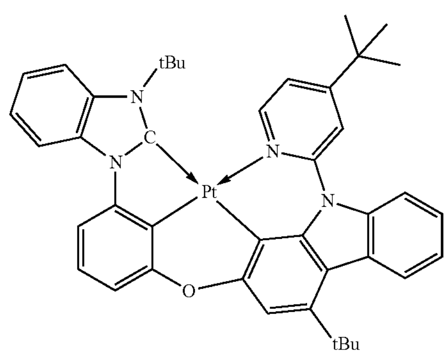
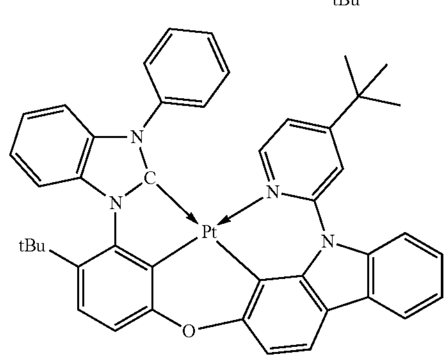

-continued
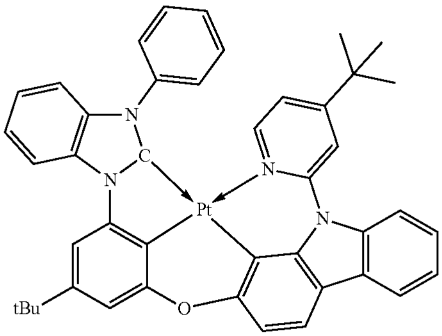
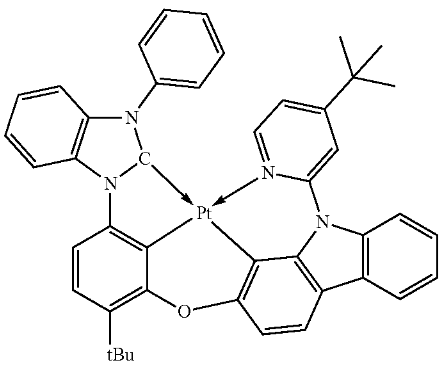
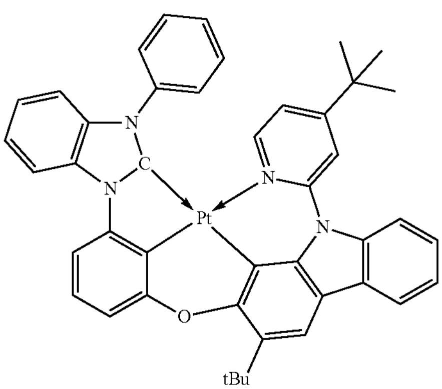
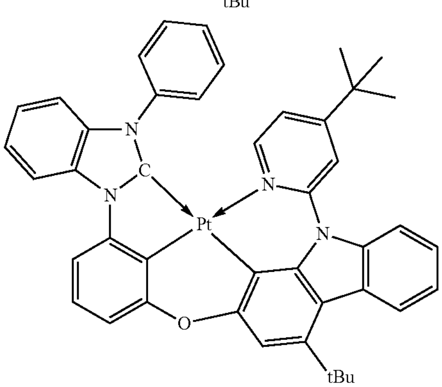
-continued
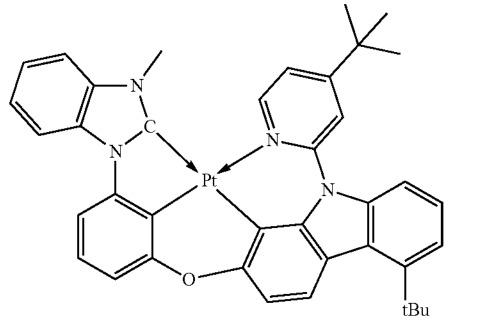
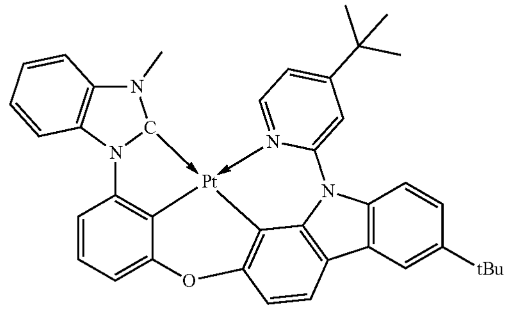
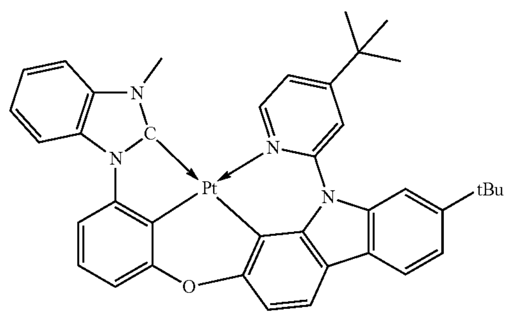
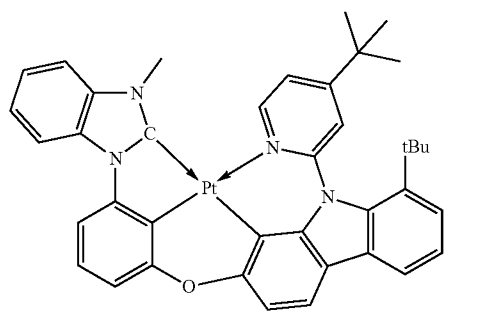
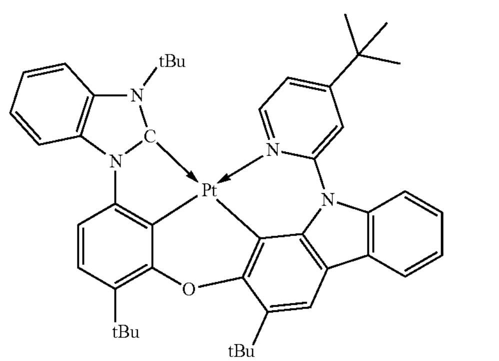

-continued
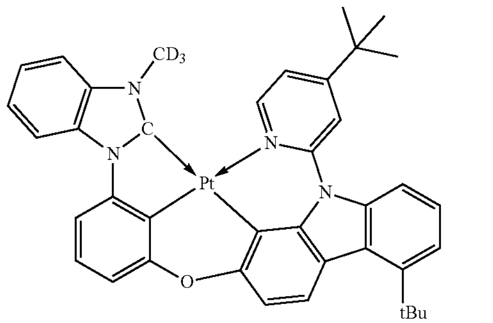
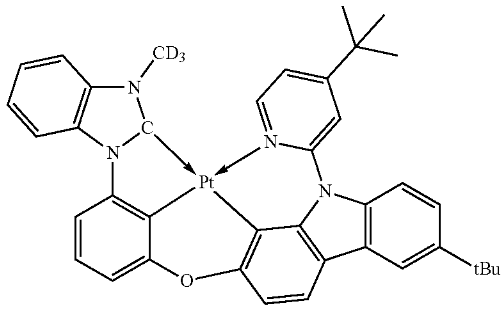
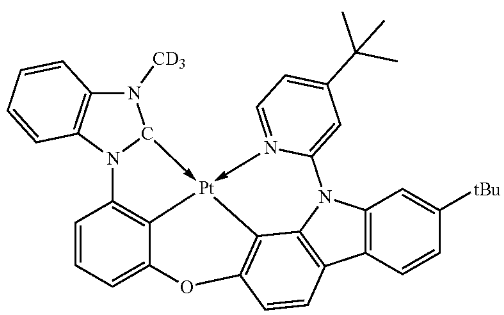
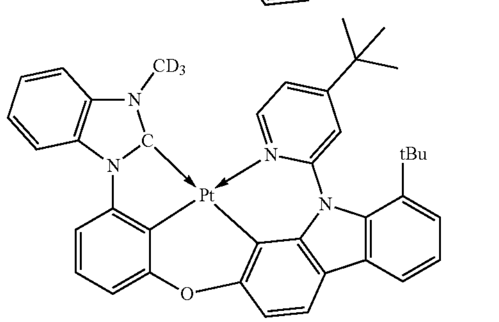
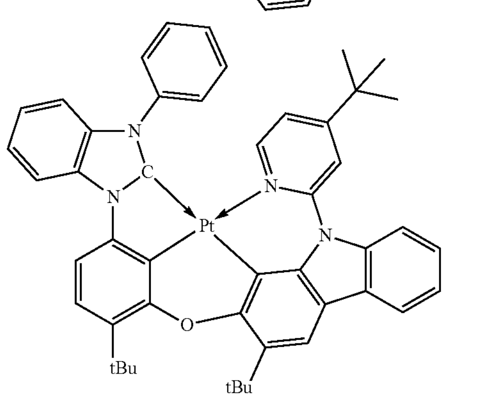
-continued
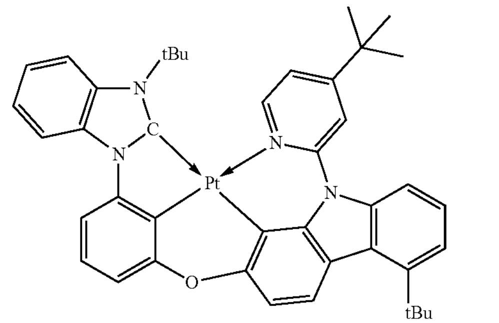
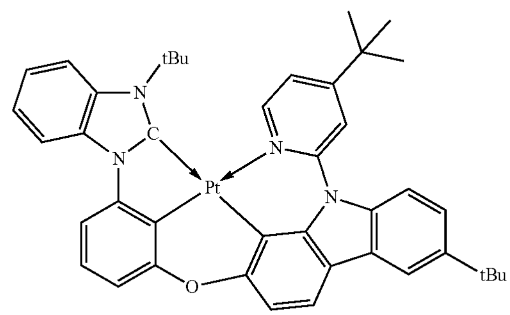
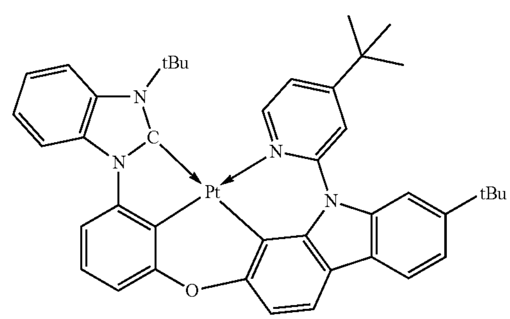
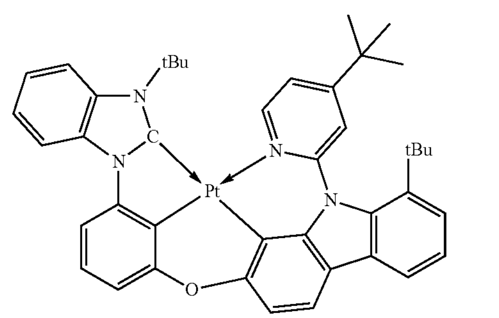
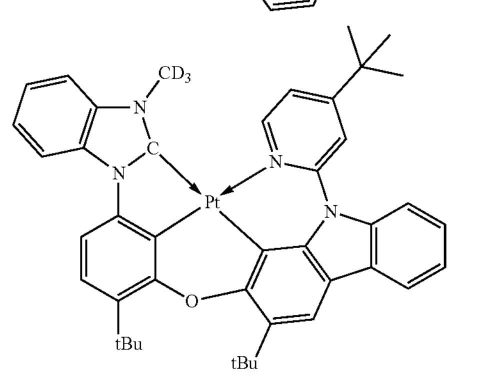

-continued
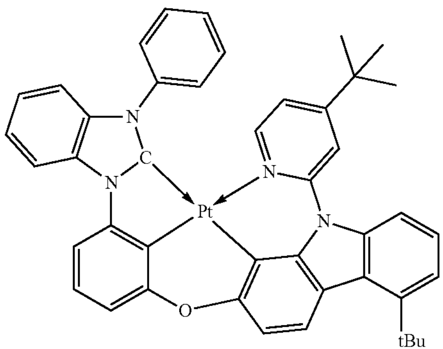
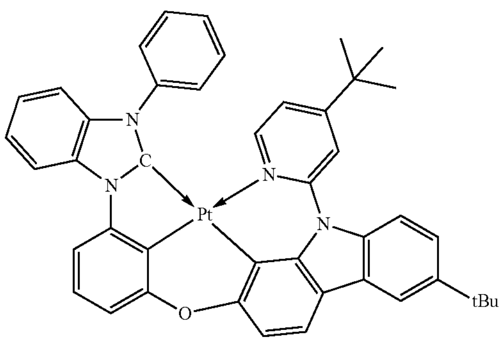
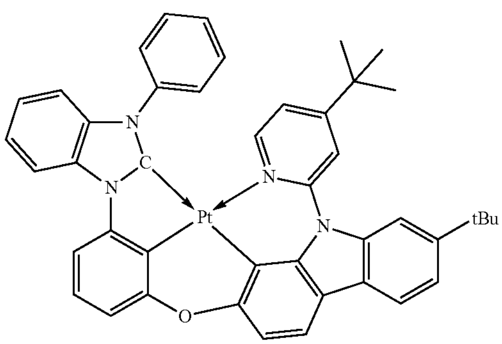
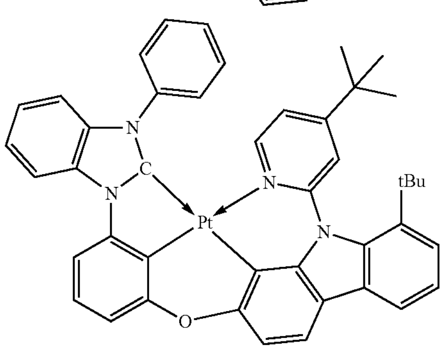
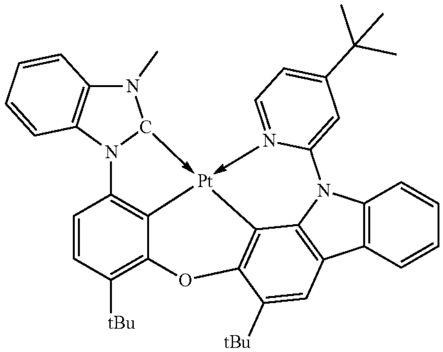
-continued
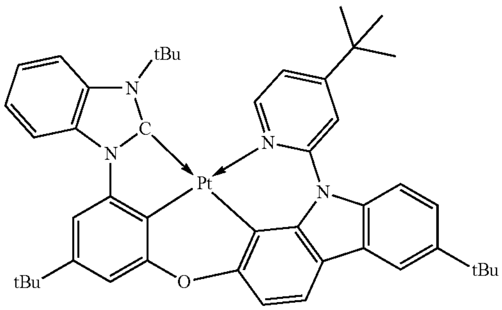
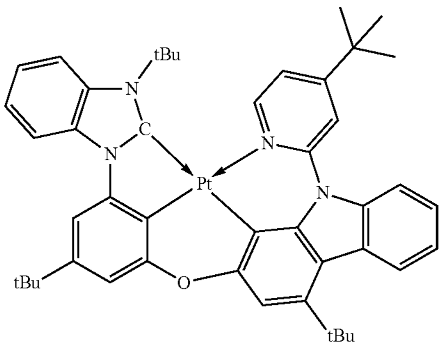
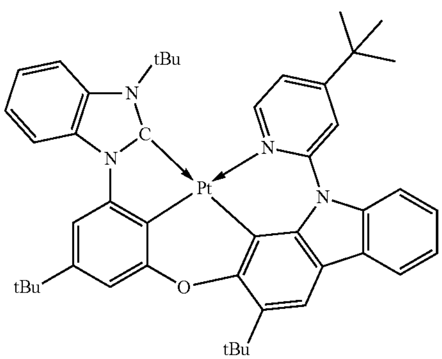
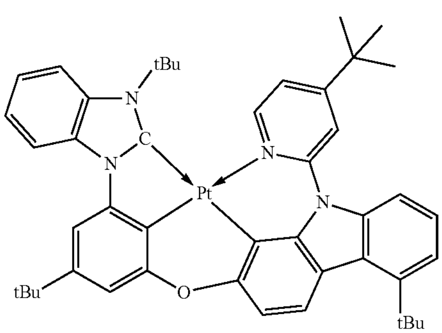
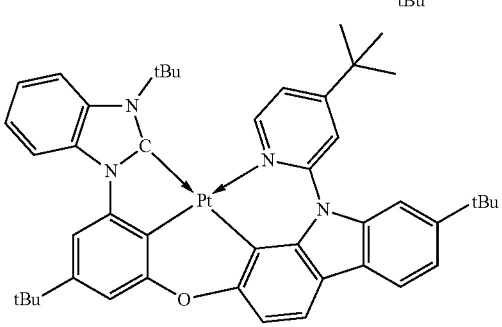

-continued
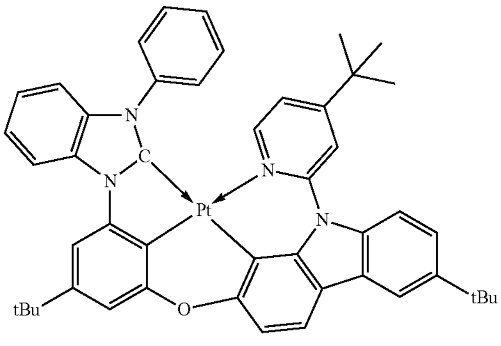
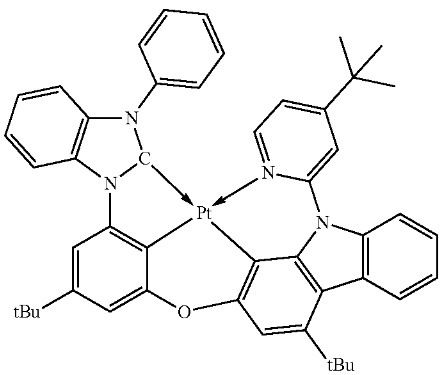
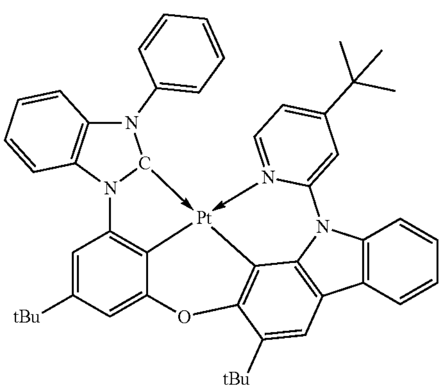
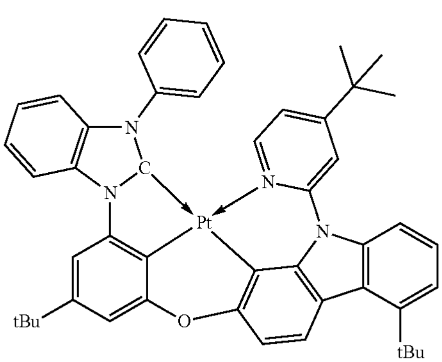
-continued
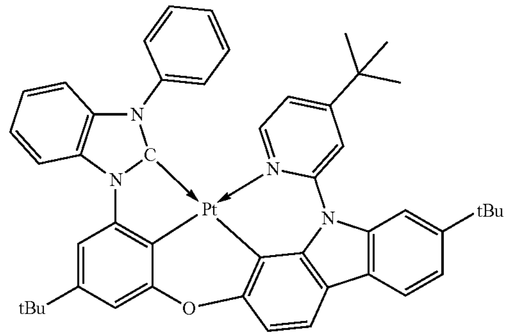
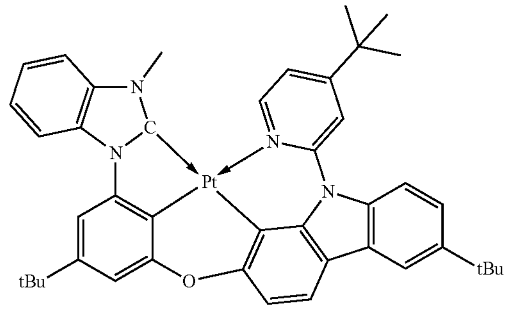
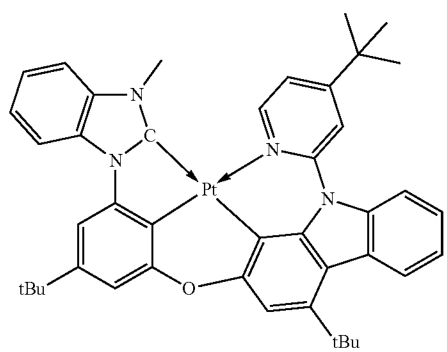
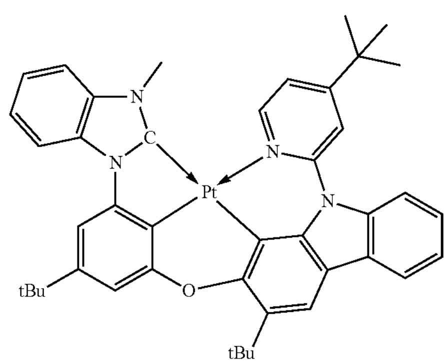
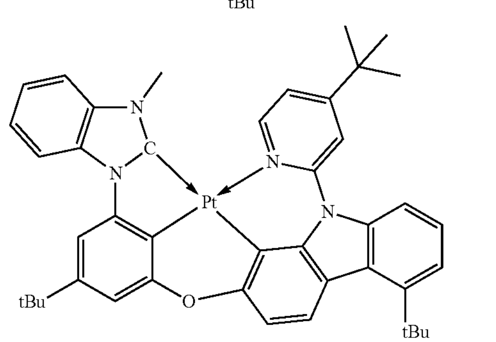

-continued
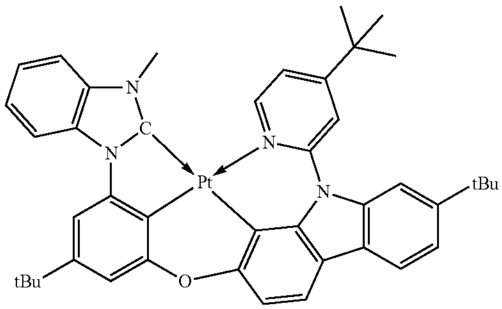
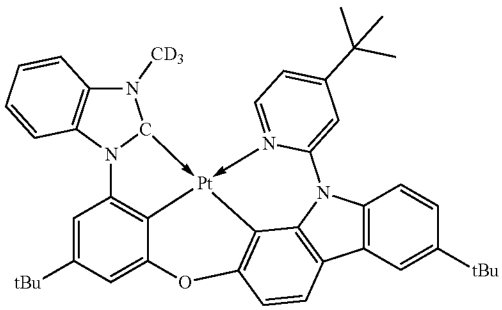
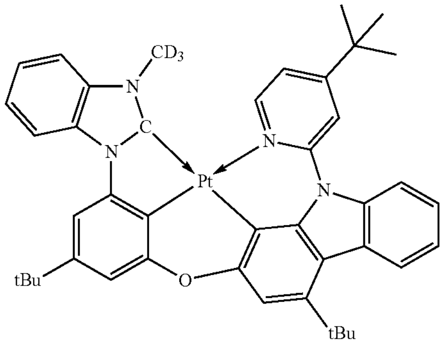
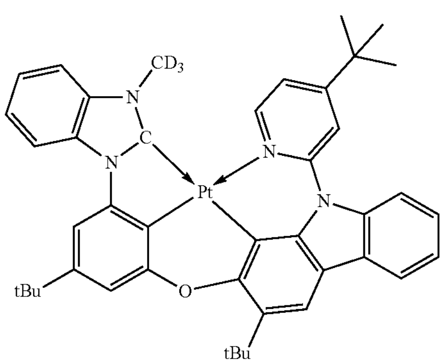
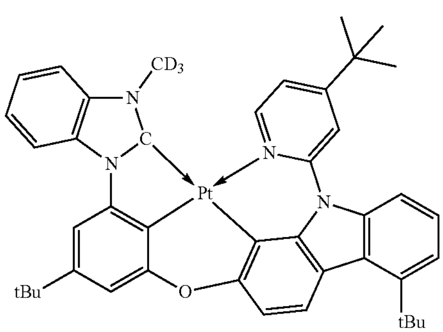
-continued
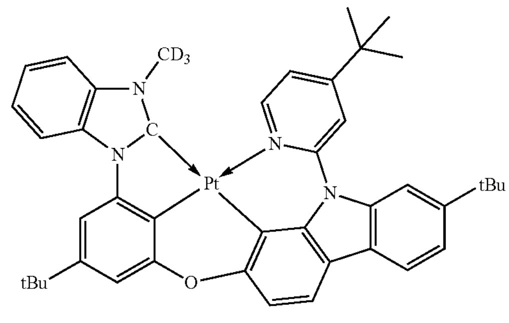
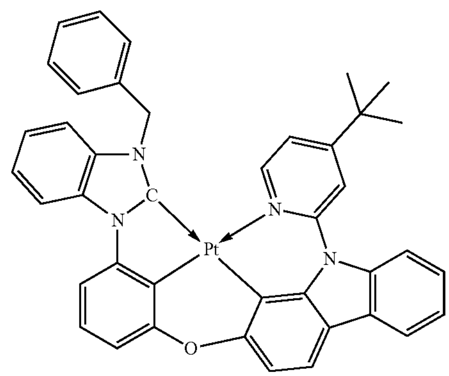
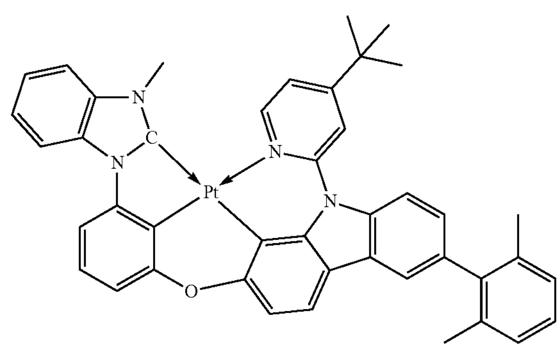
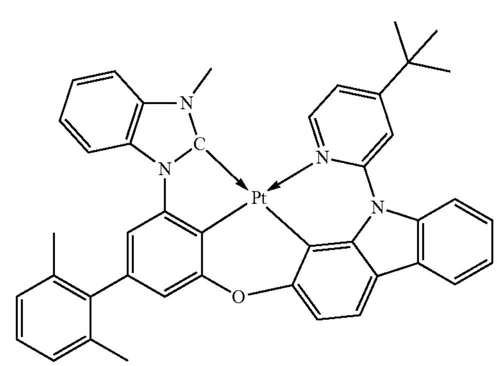

-continued
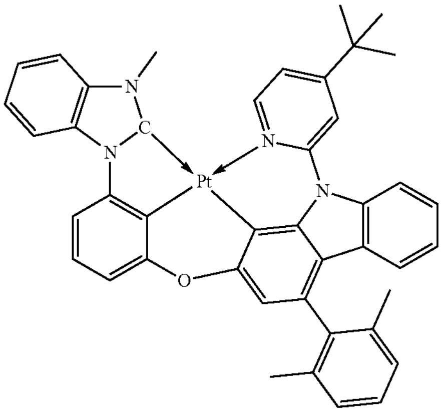
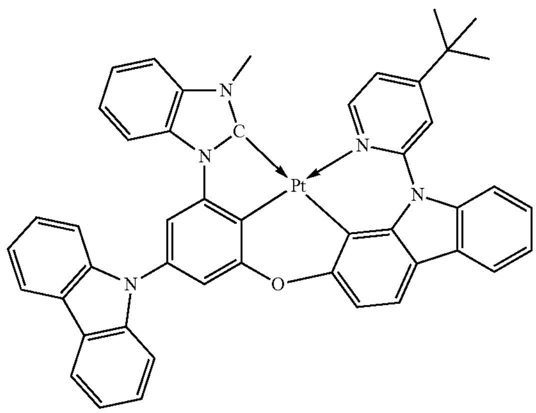
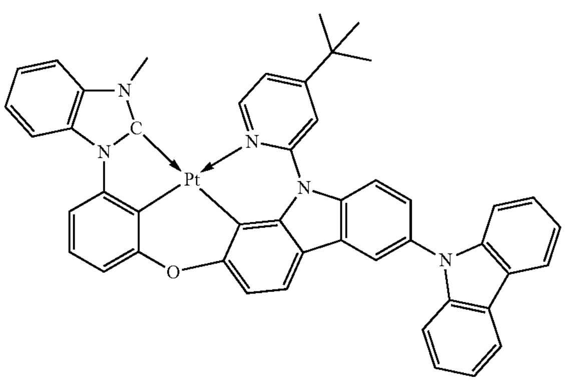
.
Group IV
1
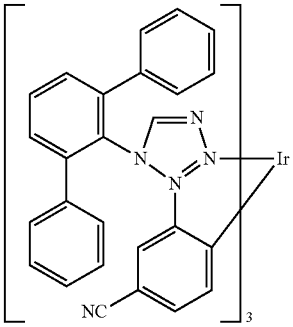
-continued
2
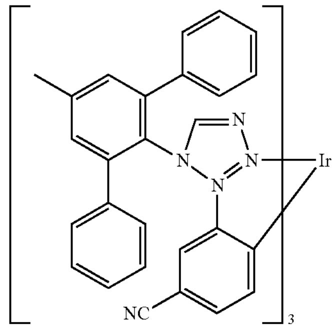
3
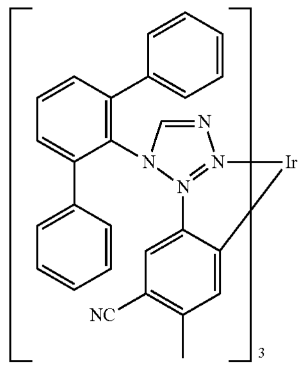
4
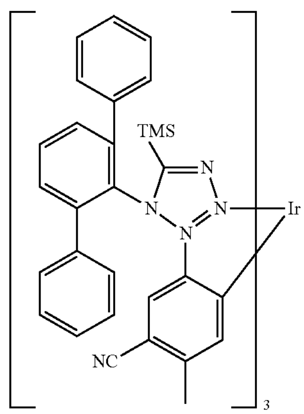
5
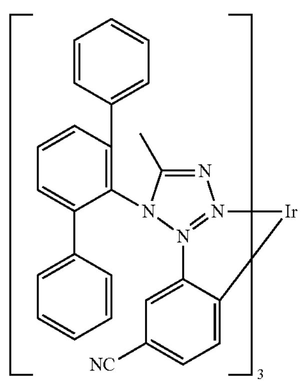

-continued

6

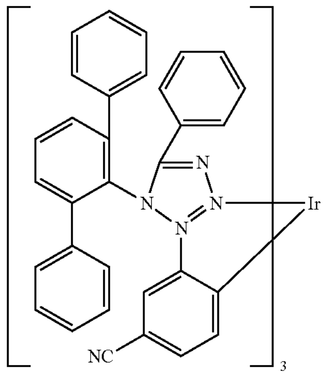

7

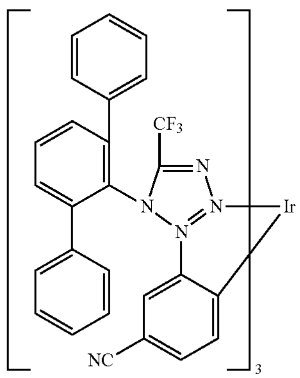

8

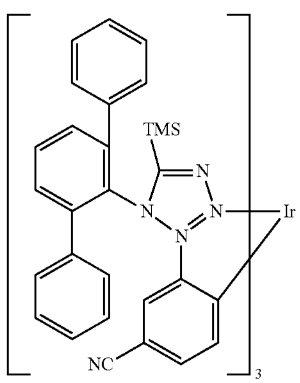

9

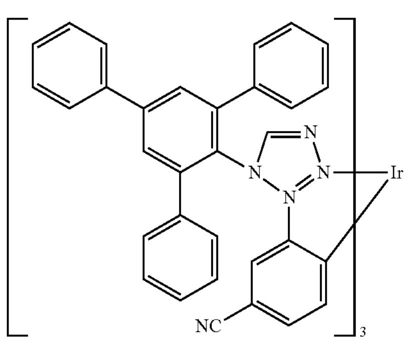

-continued

10

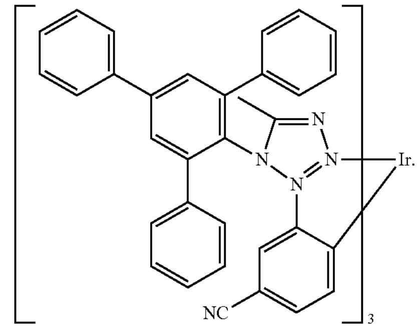

Group V

A compound represented by the following Formula A:

$(L_{101})_{n101}$-$M_{101}$-$(L_{102})_{m101}$ Formula A

In Formula A, $L_{101}$, n101, $M_{101}$, $L_{102}$, and m101 are the same as described in Tables 2 to 4:

TABLE 2

| Compound name | $L_{101}$ | n101 | $M_{101}$ | $L_{102}$ | m101 |
|---|---|---|---|---|---|
| BD001 | LM1 | 3 | Ir | — | 0 |
| BD002 | LM2 | 3 | Ir | — | 0 |
| BD003 | LM3 | 3 | Ir | — | 0 |
| BD004 | LM4 | 3 | Ir | — | 0 |
| BD005 | LM5 | 3 | Ir | — | 0 |
| BD006 | LM6 | 3 | Ir | — | 0 |
| BD007 | LM7 | 3 | Ir | — | 0 |
| BD008 | LM8 | 3 | Ir | — | 0 |
| BD009 | LM9 | 3 | Ir | — | 0 |
| BD010 | LM10 | 3 | Ir | — | 0 |
| BD011 | LM11 | 3 | Ir | — | 0 |
| BD012 | LM12 | 3 | Ir | — | 0 |
| BD013 | LM13 | 3 | Ir | — | 0 |
| BD014 | LM14 | 3 | Ir | — | 0 |
| BD015 | LM15 | 3 | Ir | — | 0 |
| BD016 | LM16 | 3 | Ir | — | 0 |
| BD017 | LM17 | 3 | Ir | — | 0 |
| BD018 | LM18 | 3 | Ir | — | 0 |
| BD019 | LM19 | 3 | Ir | — | 0 |
| BD020 | LM20 | 3 | Ir | — | 0 |
| BD021 | LM21 | 3 | Ir | — | 0 |
| BD022 | LM22 | 3 | Ir | — | 0 |
| BD023 | LM23 | 3 | Ir | — | 0 |
| BD024 | LM24 | 3 | Ir | — | 0 |
| BD025 | LM25 | 3 | Ir | — | 0 |
| BD026 | LM26 | 3 | Ir | — | 0 |
| BD027 | LM27 | 3 | Ir | — | 0 |
| BD028 | LM28 | 3 | Ir | — | 0 |
| BD029 | LM29 | 3 | Ir | — | 0 |
| BD030 | LM30 | 3 | Ir | — | 0 |
| BD031 | LM31 | 3 | Ir | — | 0 |
| BD032 | LM32 | 3 | Ir | — | 0 |
| BD033 | LM33 | 3 | Ir | — | 0 |
| BD034 | LM34 | 3 | Ir | — | 0 |
| BD035 | LM35 | 3 | Ir | — | 0 |
| BD038 | LM36 | 3 | Ir | — | 0 |
| BD037 | LM37 | 3 | Ir | — | 0 |
| BD038 | LM38 | 3 | Ir | — | 0 |
| BD039 | LM39 | 3 | Ir | — | 0 |
| BD040 | LM40 | 3 | Ir | — | 0 |
| BD041 | LM41 | 3 | Ir | — | 0 |
| BD042 | LM42 | 3 | Ir | — | 0 |
| BD043 | LM43 | 3 | Ir | — | 0 |
| BD044 | LM44 | 3 | Ir | — | 0 |
| BD045 | LM45 | 3 | Ir | — | 0 |
| BD046 | LM46 | 3 | Ir | — | 0 |
| BD047 | LM47 | 3 | Ir | — | 0 |
| BD048 | LM48 | 3 | Ir | — | 0 |
| BD049 | LM49 | 3 | Ir | — | 0 |
| BD050 | LM50 | 3 | Ir | — | 0 |

TABLE 2-continued

| Compound name | $L_{101}$ | n101 | $M_{101}$ | $L_{102}$ | m101 |
|---|---|---|---|---|---|
| BD051 | LM51 | 3 | Ir | — | 0 |
| BD052 | LM52 | 3 | Ir | — | 0 |
| BD053 | LM53 | 3 | Ir | — | 0 |
| BD054 | LM54 | 3 | Ir | — | 0 |
| BD055 | LM55 | 3 | Ir | — | 0 |
| BD056 | LM56 | 3 | Ir | — | 0 |
| BD057 | LM57 | 3 | Ir | — | 0 |
| BD058 | LM58 | 3 | Ir | — | 0 |
| BD059 | LM59 | 3 | Ir | — | 0 |
| BD060 | LM60 | 3 | Ir | — | 0 |
| BD061 | LM61 | 3 | Ir | — | 0 |
| BD062 | LM62 | 3 | Ir | — | 0 |
| BD063 | LM63 | 3 | Ir | — | 0 |
| BD064 | LM64 | 3 | Ir | — | 0 |
| BD065 | LM65 | 3 | Ir | — | 0 |
| BD066 | LM66 | 3 | Ir | — | 0 |
| BD067 | LM67 | 3 | Ir | — | 0 |
| BD068 | LM68 | 3 | Ir | — | 0 |
| BD069 | LM69 | 3 | Ir | — | 0 |
| BD070 | LM70 | 3 | Ir | — | 0 |
| BD071 | LM71 | 3 | Ir | — | 0 |
| BD072 | LM72 | 3 | Ir | — | 0 |
| BD073 | LM73 | 3 | Ir | — | 0 |
| BD074 | LM74 | 3 | Ir | — | 0 |
| BD075 | LM75 | 3 | Ir | — | 0 |
| BD076 | LM76 | 3 | Ir | — | 0 |
| BD077 | LM77 | 3 | Ir | — | 0 |
| BD078 | LM78 | 3 | Ir | — | 0 |
| BD079 | LM79 | 3 | Ir | — | 0 |
| BD080 | LM80 | 3 | Ir | — | 0 |
| BD081 | LM81 | 3 | Ir | — | 0 |
| BD082 | LM82 | 3 | Ir | — | 0 |
| BD083 | LM83 | 3 | Ir | — | 0 |
| BD084 | LM84 | 3 | Ir | — | 0 |
| BD085 | LM85 | 3 | Ir | — | 0 |
| BD086 | LM86 | 3 | Ir | — | 0 |
| BD087 | LM87 | 3 | Ir | — | 0 |
| BD088 | LM88 | 3 | Ir | — | 0 |
| BD089 | LM89 | 3 | Ir | — | 0 |
| BD090 | LM90 | 3 | Ir | — | 0 |
| BD091 | LM91 | 3 | Ir | — | 0 |
| BD092 | LM92 | 3 | Ir | — | 0 |
| BD093 | LM93 | 3 | Ir | — | 0 |
| BD094 | LM94 | 3 | Ir | — | 0 |
| BD095 | LM95 | 3 | Ir | — | 0 |
| BD096 | LM96 | 3 | Ir | — | 0 |
| BD097 | LM97 | 3 | Ir | — | 0 |
| BD098 | LM98 | 3 | Ir | — | 0 |
| BD099 | LM99 | 3 | Ir | — | 0 |
| BD100 | LM100 | 3 | Ir | — | 0 |

TABLE 3

| Compound name | $L_{101}$ | n101 | $M_{101}$ | $L_{102}$ | m101 |
|---|---|---|---|---|---|
| BD101 | LM101 | 3 | Ir | — | 0 |
| BD102 | LM102 | 3 | Ir | — | 0 |
| BD103 | LM103 | 3 | Ir | — | 0 |
| BD104 | LM104 | 3 | Ir | — | 0 |
| BD105 | LM105 | 3 | Ir | — | 0 |
| BD106 | LM106 | 3 | Ir | — | 0 |
| BD107 | LM107 | 3 | Ir | — | 0 |
| BD108 | LM108 | 3 | Ir | — | 0 |
| BD109 | LM109 | 3 | Ir | — | 0 |
| BD110 | LM110 | 3 | Ir | — | 0 |
| BD111 | LM111 | 3 | Ir | — | 0 |
| BD112 | LM112 | 3 | Ir | — | 0 |
| BD113 | LM113 | 3 | Ir | — | 0 |
| BD114 | LM114 | 3 | Ir | — | 0 |
| BD115 | LM115 | 3 | Ir | — | 0 |
| BD116 | LM116 | 3 | Ir | — | 0 |
| BD117 | LM117 | 3 | Ir | — | 0 |
| BD118 | LM118 | 3 | Ir | — | 0 |
| BD119 | LM119 | 3 | Ir | — | 0 |
| BD120 | LM120 | 3 | Ir | — | 0 |

TABLE 3-continued

| Compound name | $L_{101}$ | n101 | $M_{101}$ | $L_{102}$ | m101 |
|---|---|---|---|---|---|
| BD121 | LM121 | 3 | Ir | — | 0 |
| BD122 | LM122 | 3 | Ir | — | 0 |
| BD123 | LM123 | 3 | Ir | — | 0 |
| BD124 | LM124 | 3 | Ir | — | 0 |
| BD125 | LM125 | 3 | Ir | — | 0 |
| BD126 | LM126 | 3 | Ir | — | 0 |
| BD127 | LM127 | 3 | Ir | — | 0 |
| BD128 | LM128 | 3 | Ir | — | 0 |
| BD129 | LM129 | 3 | Ir | — | 0 |
| BD130 | LM130 | 3 | Ir | — | 0 |
| BD131 | LM131 | 3 | Ir | — | 0 |
| BD132 | LM132 | 3 | Ir | — | 0 |
| BD133 | LM133 | 3 | Ir | — | 0 |
| BD134 | LM134 | 3 | Ir | — | 0 |
| BD135 | LM135 | 3 | Ir | — | 0 |
| BD136 | LM136 | 3 | Ir | — | 0 |
| BD137 | LM137 | 3 | Ir | — | 0 |
| BD138 | LM138 | 3 | Ir | — | 0 |
| BD139 | LM139 | 3 | Ir | — | 0 |
| BD140 | LM140 | 3 | Ir | — | 0 |
| BD141 | LM141 | 3 | Ir | — | 0 |
| BD142 | LM142 | 3 | Ir | — | 0 |
| BD143 | LM143 | 3 | Ir | — | 0 |
| BD144 | LM144 | 3 | Ir | — | 0 |
| BD145 | LM145 | 3 | Ir | — | 0 |
| BD146 | LM146 | 3 | Ir | — | 0 |
| BD147 | LM147 | 3 | Ir | — | 0 |
| BD148 | LM148 | 3 | Ir | — | 0 |
| BD149 | LM149 | 3 | Ir | — | 0 |
| BD150 | LM150 | 3 | Ir | — | 0 |
| BD151 | LM151 | 3 | Ir | — | 0 |
| BD152 | LM152 | 3 | Ir | — | 0 |
| BD153 | LM153 | 3 | Ir | — | 0 |
| BD154 | LM154 | 3 | Ir | — | 0 |
| BD155 | LM155 | 3 | Ir | — | 0 |
| BD156 | LM156 | 3 | Ir | — | 0 |
| BD157 | LM157 | 3 | Ir | — | 0 |
| BD158 | LM158 | 3 | Ir | — | 0 |
| BD159 | LM159 | 3 | Ir | — | 0 |
| BD160 | LM160 | 3 | Ir | — | 0 |
| BD161 | LM161 | 3 | Ir | — | 0 |
| BD162 | LM162 | 3 | Ir | — | 0 |
| BD163 | LM163 | 3 | Ir | — | 0 |
| BD164 | LM164 | 3 | Ir | — | 0 |
| BD165 | LM165 | 3 | Ir | — | 0 |
| BD166 | LM166 | 3 | Ir | — | 0 |
| BD167 | LM167 | 3 | Ir | — | 0 |
| BD168 | LM168 | 3 | Ir | — | 0 |
| BD169 | LM169 | 3 | Ir | — | 0 |
| BD170 | LM170 | 3 | Ir | — | 0 |
| BD171 | LM171 | 3 | Ir | — | 0 |
| BD172 | LM172 | 3 | Ir | — | 0 |
| BD173 | LM173 | 3 | Ir | — | 0 |
| BD174 | LM174 | 3 | Ir | — | 0 |
| BD175 | LM175 | 3 | Ir | — | 0 |
| BD176 | LM176 | 3 | Ir | — | 0 |
| BD177 | LM177 | 3 | Ir | — | 0 |
| BD178 | LM178 | 3 | Ir | — | 0 |
| BD179 | LM179 | 3 | Ir | — | 0 |
| BD180 | LM180 | 3 | Ir | — | 0 |
| BD181 | LM181 | 3 | Ir | — | 0 |
| BD182 | LM182 | 3 | Ir | — | 0 |
| BD183 | LM183 | 3 | Ir | — | 0 |
| BD184 | LM184 | 3 | Ir | — | 0 |
| BD185 | LM185 | 3 | Ir | — | 0 |
| BD186 | LM186 | 3 | Ir | — | 0 |
| BD187 | LM187 | 3 | Ir | — | 0 |
| BD188 | LM188 | 3 | Ir | — | 0 |
| BD189 | LM189 | 3 | Ir | — | 0 |
| BD190 | LM190 | 3 | Ir | — | 0 |
| BD191 | LM191 | 3 | Ir | — | 0 |
| BD192 | LM192 | 3 | Ir | — | 0 |
| BD193 | LM193 | 3 | Ir | — | 0 |
| BD194 | LM194 | 3 | Ir | — | 0 |
| BD195 | LM195 | 3 | Ir | — | 0 |
| BD196 | LM196 | 3 | Ir | — | 0 |
| BD197 | LM197 | 3 | Ir | — | 0 |
| BD198 | LM198 | 3 | Ir | — | 0 |

TABLE 3-continued

| Compound name | $L_{101}$ | n101 | $M_{101}$ | $L_{102}$ | m101 |
|---|---|---|---|---|---|
| BD199 | LM199 | 3 | Ir | — | 0 |
| BD200 | LM200 | 3 | Ir | — | 0 |

TABLE 4

| Compound name | $L_{101}$ | n101 | $M_{101}$ | $L_{102}$ | m101 |
|---|---|---|---|---|---|
| BD201 | LM201 | 3 | Ir | — | 0 |
| BD202 | LM202 | 3 | Ir | — | 0 |
| BD203 | LM203 | 3 | Ir | — | 0 |
| BD204 | LM204 | 3 | Ir | — | 0 |
| BD205 | LM205 | 3 | Ir | — | 0 |
| BD206 | LM206 | 3 | Ir | — | 0 |
| BD207 | LM207 | 3 | Ir | — | 0 |
| BD208 | LM208 | 3 | Ir | — | 0 |
| BD209 | LM209 | 3 | Ir | — | 0 |
| BD210 | LM210 | 3 | Ir | — | 0 |
| BD211 | LM211 | 3 | Ir | — | 0 |
| BD212 | LM212 | 3 | Ir | — | 0 |
| BD213 | LM213 | 3 | Ir | — | 0 |
| BD214 | LM214 | 3 | Ir | — | 0 |
| BD215 | LM215 | 3 | Ir | — | 0 |
| BD216 | LM216 | 3 | Ir | — | 0 |
| BD217 | LM217 | 3 | Ir | — | 0 |
| BD218 | LM218 | 3 | Ir | — | 0 |
| BD219 | LM219 | 3 | Ir | — | 0 |
| BD220 | LM220 | 3 | Ir | — | 0 |
| BD221 | LM221 | 3 | Ir | — | 0 |
| BD222 | LM222 | 3 | Ir | — | 0 |
| BD223 | LM223 | 3 | Ir | — | 0 |
| BD224 | LM224 | 3 | Ir | — | 0 |
| BD225 | LM225 | 3 | Ir | — | 0 |
| BD226 | LM226 | 3 | Ir | — | 0 |
| BD227 | LM227 | 3 | Ir | — | 0 |
| BD228 | LM228 | 3 | Ir | — | 0 |
| BD229 | LM229 | 3 | Ir | — | 0 |
| BD230 | LM230 | 3 | Ir | — | 0 |
| BD231 | LM231 | 3 | Ir | — | 0 |
| BD232 | LM232 | 3 | Ir | — | 0 |
| BD233 | LM233 | 3 | Ir | — | 0 |
| BD234 | LM234 | 3 | Ir | — | 0 |
| BD235 | LM235 | 3 | Ir | — | 0 |
| BD236 | LM236 | 3 | Ir | — | 0 |
| BD237 | LM237 | 3 | Ir | — | 0 |
| BD238 | LM238 | 3 | Ir | — | 0 |
| BD239 | LM239 | 3 | Ir | — | 0 |
| BD240 | LM240 | 3 | Ir | — | 0 |
| BD241 | LM241 | 3 | Ir | — | 0 |
| BD242 | LM242 | 3 | Ir | — | 0 |
| BD243 | LM243 | 3 | Ir | — | 0 |
| BD244 | LFM1 | 3 | Ir | — | 0 |
| BD245 | LFM2 | 3 | Ir | — | 0 |
| BD246 | LFM3 | 3 | Ir | — | 0 |
| BD247 | LFM4 | 3 | Ir | — | 0 |
| BD248 | LFM5 | 3 | Ir | — | 0 |
| BD249 | LFM6 | 3 | Ir | — | 0 |
| BD250 | LFM7 | 3 | Ir | — | 0 |
| BD251 | LFP1 | 3 | Ir | — | 0 |
| BD252 | LFP2 | 3 | Ir | — | 0 |
| BD253 | LFP3 | 3 | Ir | — | 0 |
| BD254 | LFP4 | 3 | Ir | — | 0 |
| BD255 | LFP5 | 3 | Ir | — | 0 |
| BD256 | LFP6 | 3 | Ir | — | 0 |
| BD257 | LFP7 | 3 | Ir | — | 0 |
| BD258 | LM47 | 2 | Ir | AN1 | 1 |
| BD259 | LM47 | 2 | Ir | AN2 | 1 |
| BD260 | LM47 | 2 | Ir | AN3 | 1 |
| BD261 | LM47 | 2 | Ir | AN4 | 1 |
| BD262 | LM47 | 2 | Ir | AN5 | 1 |
| BD263 | LM11 | 2 | Pt | — | 0 |
| BD264 | LM13 | 2 | Pt | — | 0 |
| BD265 | LM15 | 2 | Pt | — | 0 |
| BD266 | LM45 | 2 | Pt | — | 0 |
| BD267 | LM47 | 2 | Pt | — | 0 |
| BD268 | LM49 | 2 | Pt | — | 0 |

TABLE 4-continued

| Compound name | $L_{101}$ | n101 | $M_{101}$ | $L_{102}$ | m101 |
|---|---|---|---|---|---|
| BD269 | LM98 | 2 | Pt | — | 0 |
| BD270 | LM100 | 2 | Pt | — | 0 |
| BD271 | LM102 | 2 | Pt | — | 0 |
| BD272 | LM132 | 2 | Pt | — | 0 |
| BD273 | LM134 | 2 | Pt | — | 0 |
| BD274 | LM136 | 2 | Pt | — | 0 |
| BD275 | LM151 | 2 | Pt | — | 0 |
| BD276 | LM153 | 2 | Pt | — | 0 |
| BD277 | LM158 | 2 | Pt | — | 0 |
| BD278 | LM180 | 2 | Pt | — | 0 |
| BD279 | LM182 | 2 | Pt | — | 0 |
| BD280 | LM187 | 2 | Pt | — | 0 |
| BD281 | LM201 | 2 | Pt | — | 0 |
| BD282 | LM206 | 2 | Pt | — | 0 |
| BD283 | LM211 | 2 | Pt | — | 0 |
| BD284 | LM233 | 2 | Pt | — | 0 |
| BD285 | LM235 | 2 | Pt | — | 0 |
| BD286 | LM240 | 2 | Pt | — | 0 |
| BD287 | LFM5 | 2 | Pt | — | 0 |
| BD288 | LFM6 | 2 | Pt | — | 0 |
| BD289 | LFM7 | 2 | Pt | — | 0 |
| BD290 | LFP5 | 2 | Pt | — | 0 |
| BD291 | LFP6 | 2 | Pt | — | 0 |
| BD292 | LFP7 | 2 | Pt | — | 0 |
| BD293 | LM47 | 1 | Pt | AN1 | 1 |
| BD294 | LM47 | 1 | Pt | AN2 | 1 |
| BD295 | LM47 | 1 | Pt | AN3 | 1 |
| BD296 | LM47 | 1 | Pt | AN4 | 1 |
| BD297 | LM47 | 1 | Pt | AN5 | 1 |

In Tables 2 to 4, LM1 to LM243, LFM1 to LFM7 and LFP1 to LFP7 may be understood by referring to Formulae 11-1 to 11-3 and Tables 5 to 7:

11-1

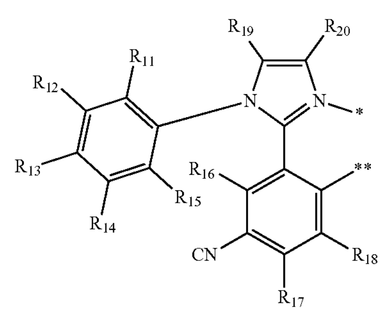

11-2

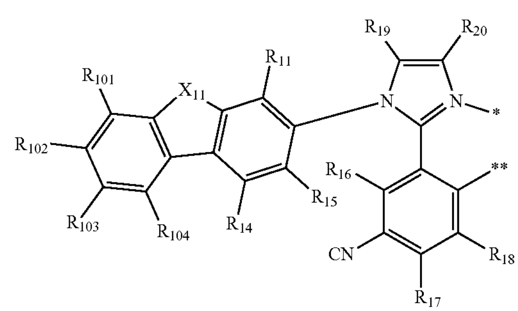

-continued 11-3

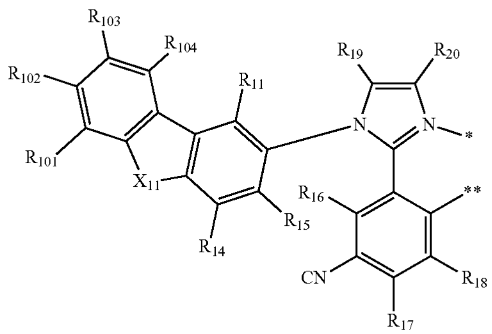

TABLE 5

| Formula 11-1 | | | | | | | | | | |
|---|---|---|---|---|---|---|---|---|---|---|
| Ligand name | $R_{11}$ | $R_{12}$ | $R_{13}$ | $R_{14}$ | $R_{15}$ | $R_{16}$ | $R_{17}$ | $R_{18}$ | $R_{19}$ | $R_{20}$ |
| LM1 | X1 | H | X3 | H | X1 | H | H | H | H | D |
| LM2 | X1 | H | X3 | H | X1 | H | H | H | D | H |
| LM3 | X1 | H | X3 | H | X1 | H | H | H | D | D |
| LM4 | Y1 | H | X3 | H | Y1 | H | H | H | D | D |
| LM5 | Y2 | H | X3 | H | Y2 | H | H | H | D | D |
| LM6 | Y3 | H | X3 | H | Y3 | H | H | H | D | D |
| LM7 | Y3 | D | X3 | D | Y3 | H | H | H | D | D |
| LM8 | Y3 | D | X3 | D | Y3 | D | H | H | D | D |
| LM9 | Y3 | D | X3 | D | Y3 | D | D | H | D | D |
| LM10 | Y3 | D | X3 | D | Y3 | D | D | D | D | D |
| LM11 | Y3 | D | Y11 | D | Y3 | D | D | D | D | D |
| LM12 | Y3 | D | Y11 | D | Y3 | H | X1 | H | D | D |
| LM13 | Y3 | D | Y11 | D | Y3 | D | Y3 | D | D | D |
| LM14 | Y3 | D | Y11 | D | Y3 | H | X4 | H | D | D |
| LM15 | Y3 | D | Y11 | D | Y3 | D | Y12 | D | D | D |
| LM16 | X2 | H | X3 | H | X2 | H | H | H | H | D |
| LM17 | X2 | H | X3 | H | X2 | H | H | H | D | H |
| LM18 | X2 | H | X3 | H | X2 | H | H | H | D | D |
| LM19 | Y4 | H | X3 | H | Y4 | H | H | H | D | D |
| LM20 | Y5 | H | X3 | H | Y5 | H | H | H | D | D |
| LM21 | Y6 | H | X3 | H | Y6 | H | H | H | D | D |
| LM22 | Y7 | H | X3 | H | Y7 | H | H | H | D | D |
| LM23 | Y8 | H | X3 | H | Y8 | H | H | H | D | D |
| LM24 | Y9 | H | X3 | H | Y9 | H | H | H | D | D |
| LM25 | Y10 | H | X3 | H | Y10 | H | H | H | D | D |
| LM26 | Y10 | D | X3 | D | Y10 | H | H | H | D | D |
| LM27 | Y10 | D | X3 | D | Y10 | D | H | H | D | D |
| LM28 | Y10 | D | X3 | D | Y10 | D | D | H | D | D |
| LM29 | Y10 | D | X3 | D | Y10 | D | D | D | D | D |
| LM30 | Y10 | D | Y11 | D | Y10 | D | D | D | D | D |
| LM31 | Y10 | D | Y11 | D | Y10 | H | X1 | H | D | D |
| LM32 | Y10 | D | Y11 | D | Y10 | D | Y3 | D | D | D |
| LM33 | Y10 | D | Y11 | D | Y10 | H | X4 | H | D | D |
| LM34 | Y10 | D | Y11 | D | Y10 | D | Y12 | D | D | D |
| LM35 | X1 | H | X4 | H | X1 | H | H | H | H | D |
| LM36 | X1 | H | X4 | H | X1 | H | H | H | D | H |
| LM37 | X1 | H | X4 | H | X1 | H | H | H | D | D |
| LM38 | Y1 | H | X4 | H | Y1 | H | H | H | D | D |
| LM39 | Y2 | H | X4 | H | Y2 | H | H | H | D | D |
| LM40 | Y3 | H | X4 | H | Y3 | H | H | H | D | D |
| LM41 | Y3 | D | X4 | D | Y3 | H | H | H | D | D |
| LM42 | Y3 | D | X4 | D | Y3 | D | H | H | D | D |
| LM43 | Y3 | D | X4 | D | Y3 | D | D | H | D | D |
| LM44 | Y3 | D | X4 | D | Y3 | D | D | D | D | D |
| LM45 | Y3 | D | Y12 | D | Y3 | D | D | D | D | D |
| LM46 | Y3 | D | Y12 | D | Y3 | H | X1 | H | D | D |
| LM47 | Y3 | D | Y12 | D | Y3 | D | Y3 | D | D | D |
| LM48 | Y3 | D | Y12 | D | Y3 | H | X4 | H | D | D |
| LM49 | Y3 | D | Y12 | D | Y3 | D | Y12 | D | D | D |
| LM50 | X2 | H | X4 | H | X2 | H | H | H | H | D |
| LM51 | X2 | H | X4 | H | X2 | H | H | H | D | H |
| LM52 | X2 | H | X4 | H | X2 | H | H | H | D | D |
| LM53 | Y4 | H | X4 | H | Y4 | H | H | H | D | D |
| LM54 | Y5 | H | X4 | H | Y5 | H | H | H | D | D |

TABLE 5-continued

Formula 11-1

| Ligand name | $R_{11}$ | $R_{12}$ | $R_{13}$ | $R_{14}$ | $R_{15}$ | $R_{16}$ | $R_{17}$ | $R_{18}$ | $R_{19}$ | $R_{20}$ |
|---|---|---|---|---|---|---|---|---|---|---|
| LM55 | Y6 | H | X4 | H | Y6 | H | H | H | D | D |
| LM56 | Y7 | H | X4 | H | Y7 | H | H | H | D | D |
| LM57 | Y8 | H | X4 | H | Y8 | H | H | H | D | D |
| LM58 | Y9 | H | X4 | H | Y9 | H | H | H | D | D |
| LM59 | Y10 | H | X4 | H | Y10 | H | H | H | D | D |
| LM60 | Y10 | D | X4 | D | Y10 | H | H | H | D | D |
| LM61 | Y10 | D | X4 | D | Y10 | D | H | H | D | D |
| LM62 | Y10 | D | X4 | D | Y10 | D | D | H | D | D |
| LM63 | Y10 | D | X4 | D | Y10 | D | D | D | D | D |
| LM64 | Y10 | D | Y12 | D | Y10 | D | D | D | D | D |
| LM65 | Y10 | D | Y12 | D | Y10 | H | X1 | H | D | D |
| LM66 | Y10 | D | Y12 | D | Y10 | D | Y3 | D | D | D |
| LM67 | Y10 | D | Y12 | D | Y10 | H | X4 | H | D | D |
| LM68 | Y10 | D | Y12 | D | Y10 | D | Y12 | D | D | D |
| LM69 | X1 | H | X5 | H | X1 | H | H | H | H | D |
| LM70 | X1 | H | X5 | H | X1 | H | H | H | D | H |
| LM71 | X1 | H | X5 | H | X1 | H | H | H | D | D |
| LM72 | Y1 | H | X5 | H | Y1 | H | H | H | D | D |
| LM73 | Y2 | H | X5 | H | Y2 | H | H | H | D | D |
| LM74 | Y3 | H | X5 | H | Y3 | H | H | H | D | D |
| LM75 | Y3 | D | X5 | D | Y3 | H | H | H | D | D |
| LM76 | Y3 | D | X5 | D | Y3 | D | H | H | D | D |
| LM77 | Y3 | D | X5 | D | Y3 | D | D | H | D | D |
| LM78 | Y3 | D | X5 | D | Y3 | D | D | D | D | D |
| LM79 | Y3 | D | Y13 | D | Y3 | D | D | D | D | D |
| LM80 | Y3 | D | Y13 | D | Y3 | H | X1 | H | D | D |
| LM81 | Y3 | D | Y13 | D | Y3 | D | Y3 | D | D | D |
| LM82 | Y3 | D | Y13 | D | Y3 | H | X4 | H | D | D |
| LM83 | Y3 | D | Y13 | D | Y3 | D | Y12 | D | D | D |
| LM84 | X2 | H | X5 | H | X2 | H | H | H | H | D |
| LM85 | X2 | H | X5 | H | X2 | H | H | H | D | H |
| LM86 | X2 | H | X5 | H | X2 | H | H | H | D | D |
| LM87 | Y4 | H | X5 | H | Y4 | H | H | H | D | D |
| LM88 | Y5 | H | X5 | H | Y5 | H | H | H | D | D |
| LM89 | Y6 | H | X5 | H | Y6 | H | H | H | D | D |
| LM90 | Y7 | H | X5 | H | Y7 | H | H | H | D | D |
| LM91 | Y8 | H | X5 | H | Y8 | H | H | H | D | D |
| LM92 | Y9 | H | X5 | H | Y9 | H | H | H | D | D |
| LM93 | Y10 | H | X5 | H | Y10 | H | H | H | D | D |
| LM94 | Y10 | D | X5 | D | Y10 | H | H | H | D | D |
| LM95 | Y10 | D | X5 | D | Y10 | D | H | H | D | D |
| LM96 | Y10 | D | X5 | D | Y10 | D | D | H | D | D |
| LM97 | Y10 | D | X5 | D | Y10 | D | D | D | D | D |
| LM98 | Y10 | D | Y13 | D | Y10 | D | D | D | D | D |
| LM99 | Y10 | D | Y13 | D | Y10 | H | X1 | H | D | D |
| LM100 | Y10 | D | Y13 | D | Y10 | D | Y3 | D | D | D |
| LM101 | Y10 | D | Y13 | D | Y10 | H | X4 | H | D | D |
| LM102 | Y10 | D | Y13 | D | Y10 | D | Y12 | D | D | D |
| LM103 | X1 | H | X6 | H | X1 | H | H | H | H | D |
| LM104 | X1 | H | X6 | H | X1 | H | H | H | D | H |
| LM105 | X1 | H | X6 | H | X1 | H | H | H | D | D |
| LM106 | Y1 | H | X6 | H | Y1 | H | H | H | D | D |
| LM107 | Y2 | H | X6 | H | Y2 | H | H | H | D | D |
| LM108 | Y3 | H | X6 | H | Y3 | H | H | H | D | D |
| LM109 | Y3 | D | X6 | D | Y3 | H | H | H | D | D |
| LM110 | Y3 | D | X6 | D | Y3 | D | H | H | D | D |
| LM111 | Y3 | D | X6 | D | Y3 | D | D | H | D | D |
| LM112 | Y3 | D | X6 | D | Y3 | D | D | D | D | D |
| LM113 | Y3 | D | Y14 | D | Y3 | D | D | D | D | D |
| LM114 | Y3 | D | Y14 | D | Y3 | H | X1 | H | D | D |
| LM115 | Y3 | D | Y14 | D | Y3 | D | Y3 | D | D | D |
| LM116 | Y3 | D | Y14 | D | Y3 | H | X4 | H | D | D |
| LM117 | Y3 | D | Y14 | D | Y3 | D | Y12 | D | D | D |
| LM118 | X2 | H | X6 | H | X2 | H | H | H | H | D |
| LM119 | X2 | H | X6 | H | X2 | H | H | H | D | H |
| LM120 | X2 | H | X6 | H | X2 | H | H | H | D | D |
| LM121 | Y4 | H | X6 | H | Y4 | H | H | H | D | D |
| LM122 | Y5 | H | X6 | H | Y5 | H | H | H | D | D |
| LM123 | Y6 | H | X6 | H | Y6 | H | H | H | D | D |
| LM124 | Y7 | H | X6 | H | Y7 | H | H | H | D | D |
| LM125 | Y8 | H | X6 | H | Y8 | H | H | H | D | D |
| LM126 | Y9 | H | X6 | H | Y9 | H | H | H | D | D |
| LM127 | Y10 | H | X6 | H | Y10 | H | H | H | D | D |
| LM128 | Y10 | D | X6 | D | Y10 | H | H | H | D | D |
| LM129 | Y10 | D | X6 | D | Y10 | D | H | H | D | D |
| LM130 | Y10 | D | X6 | D | Y10 | D | D | H | D | D |

TABLE 5-continued

| Formula 11-1 | | | | | | | | | | |
|---|---|---|---|---|---|---|---|---|---|---|
| Ligand name | $R_{11}$ | $R_{12}$ | $R_{13}$ | $R_{14}$ | $R_{15}$ | $R_{16}$ | $R_{17}$ | $R_{18}$ | $R_{19}$ | $R_{20}$ |
| LM131 | Y10 | D | X6 | D | Y10 | D | D | D | D | D |
| LM132 | Y10 | D | Y14 | D | Y10 | D | D | D | D | D |
| LM133 | Y10 | D | Y14 | D | Y10 | H | X1 | H | D | D |
| LM134 | Y10 | D | Y14 | D | Y10 | D | Y3 | D | D | D |
| LM135 | Y10 | D | Y14 | D | Y10 | H | X4 | H | D | D |
| LM136 | Y10 | D | Y14 | D | Y10 | D | Y12 | D | D | D |
| LM137 | X1 | H | X7 | H | X1 | H | H | H | H | D |
| LM138 | X1 | H | X7 | H | X1 | H | H | H | D | H |
| LM139 | X1 | H | X7 | H | X1 | H | H | H | D | D |
| LM140 | Y1 | H | X7 | H | Y1 | H | H | H | D | D |
| LM141 | Y2 | H | X7 | H | Y2 | H | H | H | D | D |
| LM142 | Y3 | H | X7 | H | Y3 | H | H | H | D | D |
| LM143 | Y3 | D | X7 | D | Y3 | H | H | H | D | D |
| LM144 | Y3 | D | X7 | D | Y3 | D | H | H | D | D |
| LM145 | Y3 | D | X7 | D | Y3 | D | D | H | D | D |
| LM146 | Y3 | D | X7 | D | Y3 | D | D | D | D | D |
| LM147 | Y3 | D | X8 | D | Y3 | D | D | D | D | D |
| LM148 | Y3 | D | Y16 | D | Y3 | D | D | D | D | D |
| LM149 | Y3 | D | Y17 | D | Y3 | D | D | D | D | D |
| LM150 | Y3 | D | Y18 | D | Y3 | D | D | D | D | D |
| LM151 | Y3 | D | Y15 | D | Y3 | D | D | D | D | D |
| LM152 | Y3 | D | Y15 | D | Y3 | H | X1 | H | D | D |
| LM153 | Y3 | D | Y15 | D | Y3 | D | Y3 | D | D | D |
| LM154 | Y3 | D | Y16 | D | Y3 | D | Y3 | D | D | D |
| LM155 | Y3 | D | Y17 | D | Y3 | D | Y3 | D | D | D |
| LM156 | Y3 | D | Y18 | D | Y3 | D | Y3 | D | D | D |
| LM157 | Y3 | D | Y15 | D | Y3 | H | X4 | H | D | D |
| LM158 | Y3 | D | Y15 | D | Y3 | D | Y12 | D | D | D |
| LM159 | Y3 | D | Y16 | D | Y3 | D | Y12 | D | D | D |
| LM160 | Y3 | D | Y17 | D | Y3 | D | Y12 | D | D | D |
| LM161 | Y3 | D | Y18 | D | Y3 | D | Y12 | D | D | D |
| LM162 | X2 | H | X7 | H | X2 | H | H | H | H | D |
| LM163 | X2 | H | X7 | H | X2 | H | H | H | D | H |
| LM164 | X2 | H | X7 | H | X2 | H | H | H | D | D |
| LM165 | Y4 | H | X7 | H | Y4 | H | H | H | D | D |
| LM166 | Y5 | H | X7 | H | Y5 | H | H | H | D | D |
| LM167 | Y6 | H | X7 | H | Y6 | H | H | H | D | D |
| LM168 | Y7 | H | X7 | H | Y7 | H | H | H | D | D |
| LM169 | Y8 | H | X7 | H | Y8 | H | H | H | D | D |
| LM170 | Y9 | H | X7 | H | Y9 | H | H | H | D | D |
| LM171 | Y10 | H | X7 | H | Y10 | H | H | H | D | D |
| LM172 | Y10 | D | X7 | D | Y10 | H | H | H | D | D |
| LM173 | Y10 | D | X7 | D | Y10 | D | H | H | D | D |
| LM174 | Y10 | D | X7 | D | Y10 | D | D | H | D | D |
| LM175 | Y10 | D | X7 | D | Y10 | D | D | D | D | D |
| LM176 | Y10 | D | X8 | D | Y10 | D | D | D | D | D |
| LM177 | Y10 | D | Y16 | D | Y10 | D | D | D | D | D |
| LM178 | Y10 | D | Y17 | D | Y10 | D | D | D | D | D |
| LM179 | Y10 | D | Y18 | D | Y10 | D | D | D | D | D |
| LM180 | Y10 | D | Y15 | D | Y10 | D | D | D | D | D |
| LM181 | Y10 | D | Y15 | D | Y10 | H | X1 | H | D | D |
| LM182 | Y10 | D | Y15 | D | Y10 | D | Y3 | D | D | D |
| LM183 | Y10 | D | Y16 | D | Y10 | D | Y3 | D | D | D |
| LM184 | Y10 | D | Y17 | D | Y10 | D | Y3 | D | D | D |
| LM185 | Y10 | D | Y18 | D | Y10 | D | Y3 | D | D | D |
| LM186 | Y10 | D | Y15 | D | Y10 | H | X4 | H | D | D |
| LM187 | Y10 | D | Y15 | D | Y10 | D | Y12 | D | D | D |
| LM188 | Y10 | D | Y16 | D | Y10 | D | Y12 | D | D | D |
| LM189 | Y10 | D | Y17 | D | Y10 | D | Y12 | D | D | D |
| LM190 | Y10 | D | Y18 | D | Y10 | D | Y12 | D | D | D |
| LM191 | X1 | X7 | H | H | X1 | H | H | H | H | D |
| LM192 | X1 | X7 | H | H | X1 | H | H | H | D | H |
| LM193 | X1 | X7 | H | H | X1 | H | H | H | D | D |
| LM194 | Y1 | X7 | H | H | Y1 | H | H | H | D | D |
| LM195 | Y2 | X7 | H | H | Y2 | H | H | H | D | D |
| LM196 | Y3 | X7 | H | H | Y3 | H | H | H | D | D |
| LM197 | Y3 | X7 | D | D | Y3 | H | H | H | D | D |
| LM198 | Y3 | X7 | D | D | Y3 | D | H | H | D | D |
| LM199 | Y3 | X7 | D | D | Y3 | D | D | H | D | D |
| LM200 | Y3 | X7 | D | D | Y3 | D | D | D | D | D |
| LM201 | Y3 | Y15 | D | D | Y3 | D | D | D | D | D |
| LM202 | Y3 | Y16 | D | D | Y3 | D | D | D | D | D |
| LM203 | Y3 | Y17 | D | D | Y3 | D | D | D | D | D |
| LM204 | Y3 | Y18 | D | D | Y3 | D | D | D | D | D |
| LM205 | Y3 | Y15 | D | D | Y3 | H | X1 | H | D | D |
| LM206 | Y3 | Y15 | D | D | Y3 | D | Y3 | D | D | D |

TABLE 5-continued

| Formula 11-1 | | | | | | | | | | |
|---|---|---|---|---|---|---|---|---|---|---|
| Ligand name | $R_{11}$ | $R_{12}$ | $R_{13}$ | $R_{14}$ | $R_{15}$ | $R_{16}$ | $R_{17}$ | $R_{18}$ | $R_{19}$ | $R_{20}$ |
| LM207 | Y3 | Y16 | D | D | Y3 | D | Y3 | D | D | D |
| LM208 | Y3 | Y17 | D | D | Y3 | D | Y3 | D | D | D |
| LM209 | Y3 | Y18 | D | D | Y3 | D | Y3 | D | D | D |
| LM210 | Y3 | Y15 | D | D | Y3 | H | X4 | H | D | D |
| LM211 | Y3 | Y15 | D | D | Y3 | D | Y12 | D | D | D |
| LM212 | Y3 | Y16 | D | D | Y3 | D | Y12 | D | D | D |
| LM213 | Y3 | Y17 | D | D | Y3 | D | Y12 | D | D | D |
| LM214 | Y3 | Y18 | D | D | Y3 | D | Y12 | D | D | D |
| LM215 | X2 | X7 | H | H | X2 | H | H | H | H | D |
| LM216 | X2 | X7 | H | H | X2 | H | H | H | D | H |
| LM217 | X2 | X7 | H | H | X2 | H | H | H | D | D |
| LM218 | Y4 | X7 | H | H | Y4 | H | H | H | D | D |
| LM219 | Y5 | X7 | H | H | Y5 | H | H | H | D | D |
| LM220 | Y6 | X7 | H | H | Y6 | H | H | H | D | D |
| LM221 | Y7 | X7 | H | H | Y7 | H | H | H | D | D |
| LM222 | Y8 | X7 | H | H | Y8 | H | H | H | D | D |
| LM223 | Y9 | X7 | H | H | Y9 | H | H | H | D | D |
| LM224 | Y10 | X7 | H | H | Y10 | H | H | H | D | D |
| LM225 | Y10 | X7 | D | D | Y10 | H | H | H | D | D |
| LM226 | Y10 | X7 | D | D | Y10 | D | H | H | D | D |
| LM227 | Y10 | X7 | D | D | Y10 | D | D | H | D | D |
| LM228 | Y10 | X7 | D | D | Y10 | D | D | D | D | D |
| LM229 | Y10 | X8 | D | D | Y10 | D | D | D | D | D |
| LM230 | Y10 | Y16 | D | D | Y10 | D | D | D | D | D |
| LM231 | Y10 | Y17 | D | D | Y10 | D | D | D | D | D |
| LM232 | Y10 | Y18 | D | D | Y10 | D | D | D | D | D |
| LM233 | Y10 | Y15 | D | D | Y10 | D | D | D | D | D |
| LM234 | Y10 | Y15 | D | D | Y10 | H | X1 | H | D | D |
| LM235 | Y10 | Y15 | D | D | Y10 | D | Y3 | D | D | D |
| LM236 | Y10 | Y16 | D | D | Y10 | D | Y3 | D | D | D |
| LM237 | Y10 | Y17 | D | D | Y10 | D | Y3 | D | D | D |
| LM238 | Y10 | Y18 | D | D | Y10 | D | Y3 | D | D | D |
| LM239 | Y10 | Y15 | D | D | Y10 | H | X4 | H | D | D |
| LM240 | Y10 | Y15 | D | D | Y10 | D | Y12 | D | D | D |
| LM241 | Y10 | Y16 | D | D | Y10 | D | Y12 | D | D | D |
| LM242 | Y10 | Y17 | D | D | Y10 | D | Y12 | D | D | D |
| LM243 | Y10 | Y18 | D | D | Y10 | D | Y12 | D | D | D |

TABLE 6

| Formula 11-2 | | | | | | | | | | | | |
|---|---|---|---|---|---|---|---|---|---|---|---|---|
| Ligand name | $R_{11}$ | $X_{11}$ | $R_{101}$ | $R_{102}$ | $R_{103}$ | $R_{104}$ | $R_{14}$ | $R_{15}$ | $R_{16}$ | $R_{17}$ | $R_{18}$ | $R_{19}$ | $R_{20}$ |
| LFM1 | Y10 | N-Ph | D | D | D | D | D | Y10 | D | D | D | D | D |
| LFM2 | Y10 | S | D | D | D | D | D | Y10 | D | D | D | D | D |
| LFM3 | Y10 | O | D | D | D | D | D | Y10 | D | D | D | D | D |
| LFM4 | Y3 | O | D | D | D | D | D | Y3 | D | D | D | D | D |
| LFM5 | Y10 | O | D | D | D | D | D | Y10 | D | D | D | D | D |
| LFM6 | Y10 | O | D | D | D | D | D | Y10 | D | Y3 | D | D | D |
| LFM7 | Y10 | O | D | D | D | D | D | Y10 | D | Y12 | D | D | D |

TABLE 7

| Formula 11-3 | | | | | | | | | | | | | |
|---|---|---|---|---|---|---|---|---|---|---|---|---|---|
| Ligand name | $R_{11}$ | $X_{11}$ | $R_{101}$ | $R_{102}$ | $R_{103}$ | $R_{104}$ | $R_{14}$ | $R_{15}$ | $R_{16}$ | $R_{17}$ | $R_{18}$ | $R_{19}$ | $R_{20}$ |
| LFP1 | Y10 | N-Ph | D | D | D | D | D | Y10 | D | D | D | D | D |
| LFP2 | Y10 | S | D | D | D | D | D | Y10 | D | D | D | D | D |
| LFP3 | Y10 | O | D | D | D | D | D | Y10 | D | D | D | D | D |
| LFP4 | Y3 | O | D | D | D | D | D | Y3 | D | D | D | D | D |
| LFP5 | Y10 | O | D | D | D | D | D | Y10 | D | D | D | D | D |
| LFP6 | Y10 | O | D | D | D | D | D | Y10 | D | Y3 | D | D | D |
| LFP7 | Y10 | O | D | D | D | D | D | Y10 | D | Y12 | D | D | D |

X1 to X10 and Y1 to Y18 in Tables 5 to 7 are the same as described below, and Ph in the tables refers to a phenyl group:
X1
$*-CH_3$
X2
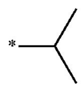
X3
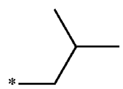
X4
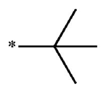
X5
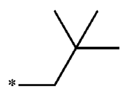
X6
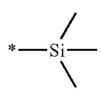
X7
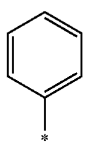
X8
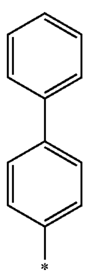
X9
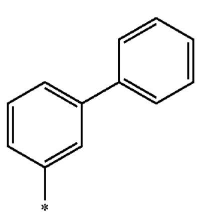
X10
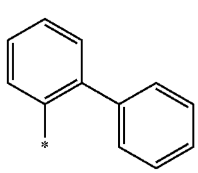
Y1
$*-CH_2D$
Y2
$*-CHD_2$
Y3
$*-CD_3$
-continued
Y4
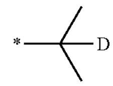
Y5
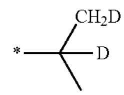
Y6
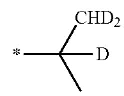
Y7
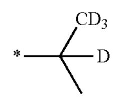
Y8
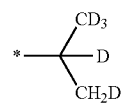
Y9
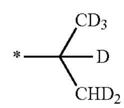
Y10
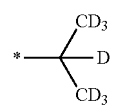
Y11
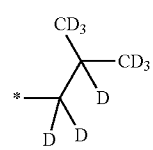
Y12
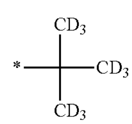
Y13
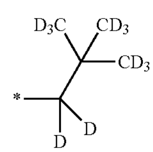
Y14
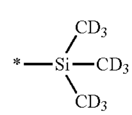
Y15
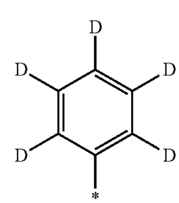

-continued
Y16
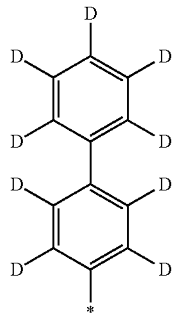
Y17
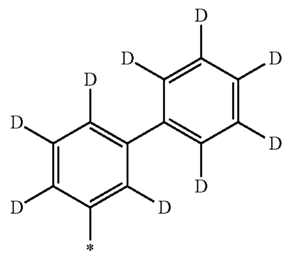
Y18
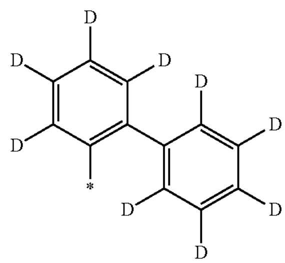
Group VI
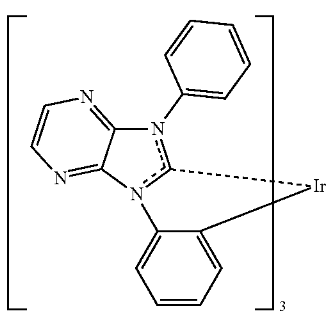
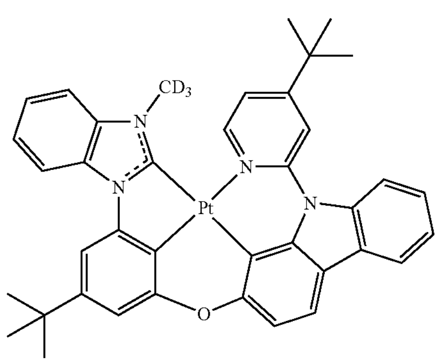
-continued
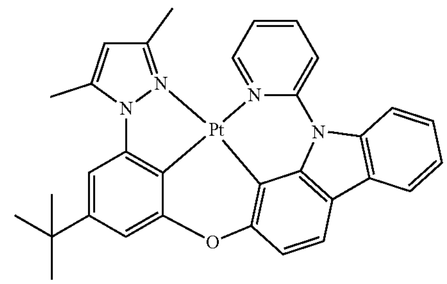
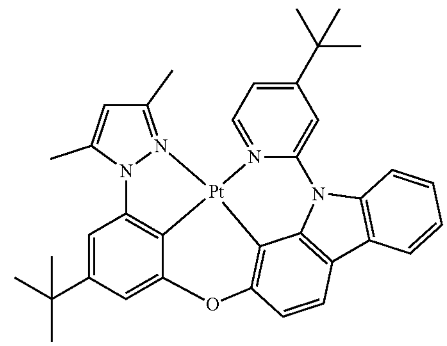
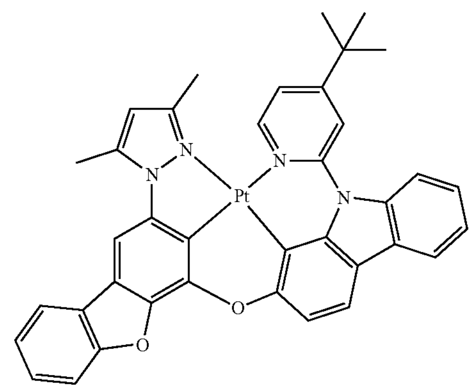
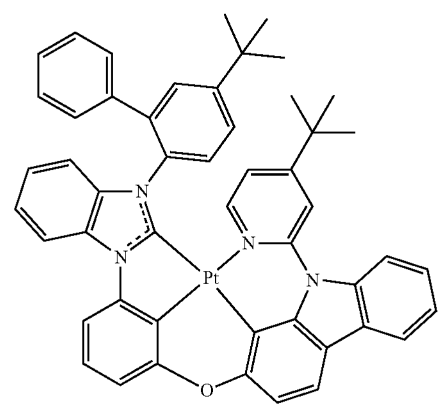

-continued

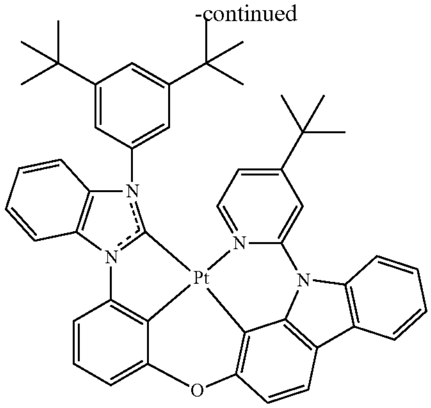

In an embodiment, the first dopant compound may be a thermally activated delayed fluorescence (TADF) emitter satisfying the following Condition 7:

$\Delta E_{ST} \leq 0.3$ eV    Condition 7

In Condition 7, $\Delta E_{ST}$ is a difference between a lowest excited singlet energy level of the first dopant compound and a lowest excited triplet energy level of the first dopant compound.

In an embodiment, the first dopant compound may include a thermally activated delayed fluorescence emitter represented by Formula 201 or 202:

Formula 201

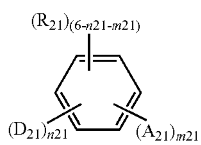

Formula 202

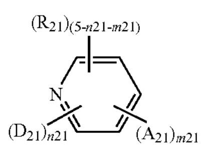

In Formulae 201 and 202, $A_{21}$ may be an acceptor group, $D_{21}$ may be a donor group, m21 may be 1, 2, or 3, and n21 may be 1, 2, or 3, the sum of n21 and m21 in Formula 201 may be 6 or less, and the sum of n21 and m21 in Formula 202 may be 5 or less, $R_{21}$ may be hydrogen, deuterium, —F, —Cl, —Br, —I, —$SF_5$, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, or —$P(=S)(Q_1)(Q_2)$, wherein a plurality of $R_{21}$(s) may optionally be bonded to each other to form a substituted or unsubstituted $C_5$-$C_{30}$ carbocyclic group or a substituted or unsubstituted $C_1$-$C_{30}$ heterocyclic group, and $Q_1$ to $Q_3$ may each independently be hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group substituted with at least one of deuterium, —F, a cyano group, a $C_1$-$C_{60}$ alkyl group, or a $C_6$-$C_{60}$ aryl group, or a $C_6$-$C_{60}$ aryl group substituted with at least one deuterium, —F, a cyano group, a $C_1$-$C_{60}$ alkyl group, or a $C_6$-$C_{60}$ aryl group.

In an embodiment, in Formulae 201 and 202, $A_{21}$ may be a substituted unsubstituted π-electron-deficient nitrogen-free cyclic group.

In an embodiment, the π-electron-deficient nitrogen-free cyclic group may be a phenyl group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a coronene group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, or a triindolobenzene group; or a condensed cyclic of two or more π-electron-deficient nitrogen-free cyclic group, but embodiments of the present disclosure are not limited thereto.

In an embodiment, in Formulae 201 and 202, $D_{21}$ may be: —F, a cyano group, or a π-electron-deficient nitrogen-containing cyclic group;

a $C_1$-$C_{60}$ alkyl group, a π-electron-deficient nitrogen-containing cyclic group, or a π-electron-deficient nitrogen-free cyclic group, each independently substituted with at least one —F or a cyano group; or a π-electron-deficient nitrogen-containing cyclic group substituted with at least one deuterium, a $C_1$-$C_{60}$ alkyl group, a π-electron-deficient nitrogen-containing cyclic group, or a π-electron-deficient nitrogen-free cyclic group.

In an embodiment, the π-electron-deficient nitrogen-free cyclic group is the same as described above.

In an embodiment, the π-electron-deficient nitrogen-containing cyclic group may be a cyclic group having at least one *—N=*' moiety, or for example, may be an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, a benzoisoxazole group, a triazole group, a tetrazole group, an oxadiazole group, a triazine group, a thiadiazole group, an imidazopyridine group, an imidazopyrimidine group, an azacarbazole group, or a benzimidazolobenzimidazole group; or a condensed cyclic of two or more π-electron-deficient nitrogen-containing cyclic groups.

In an embodiment, the first dopant compound may be a compound of one of Groups VII to XI, but embodiments of the present disclosure are not limited thereto:

Group VII

1

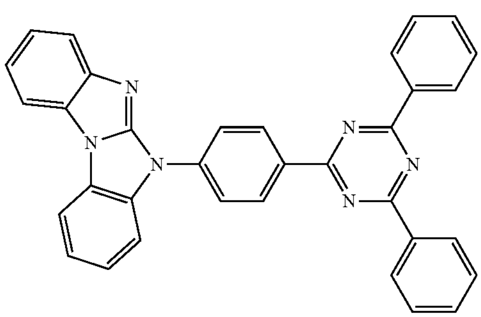

2

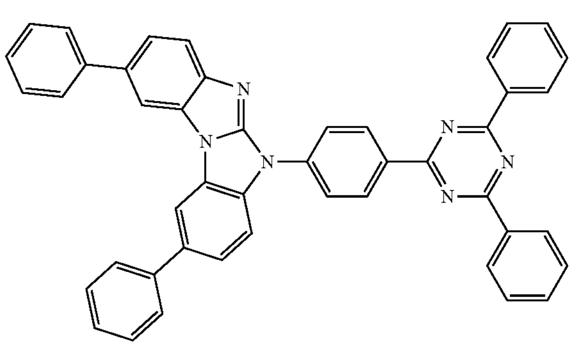

-continued

3

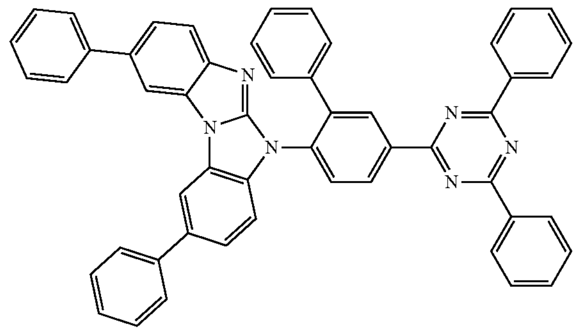

4

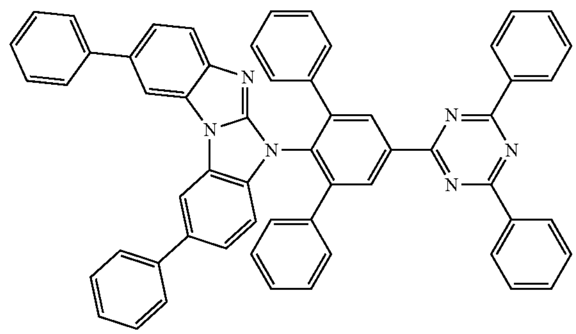

5

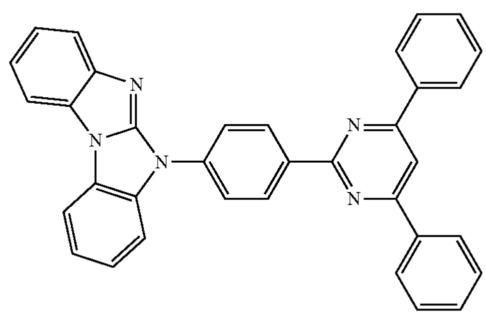

6

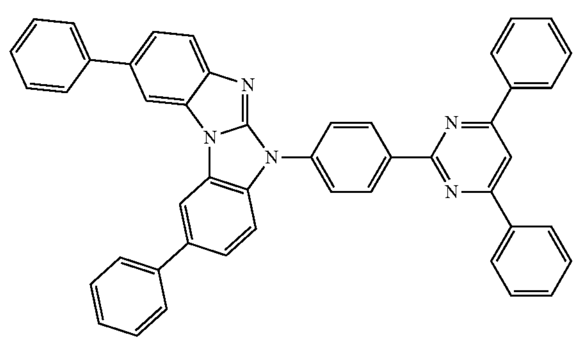

7
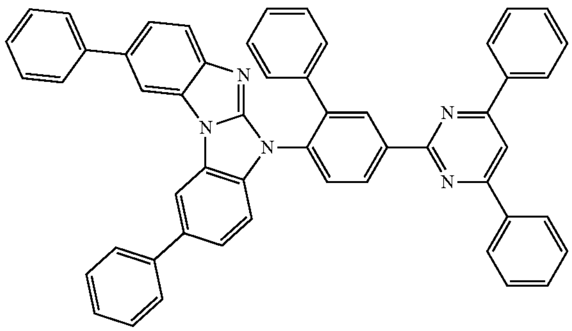
8
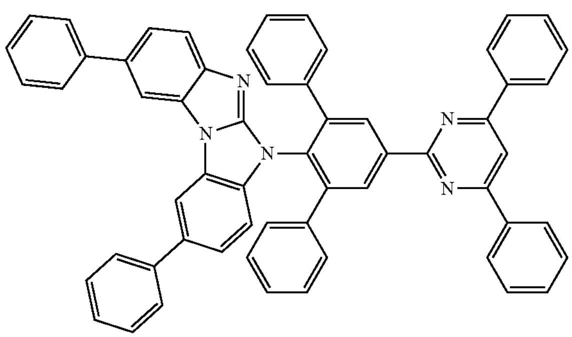
9
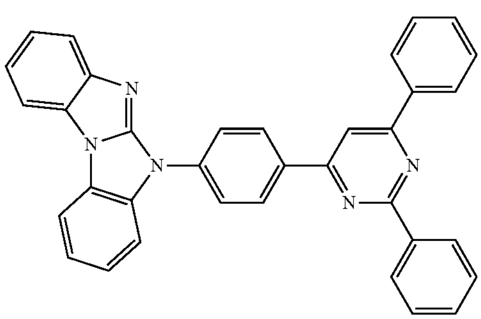
10
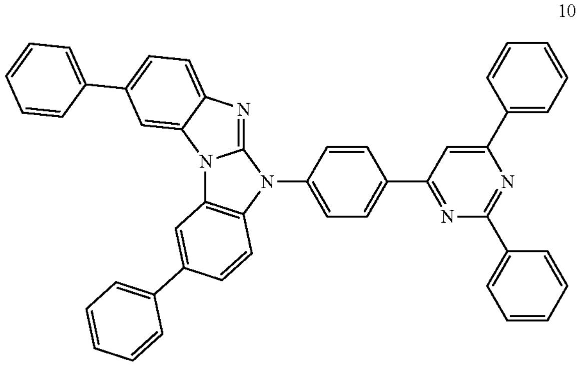
11
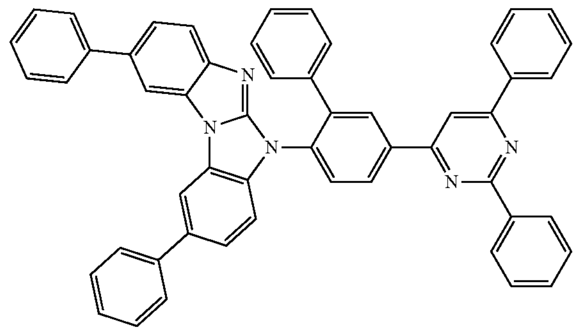
12
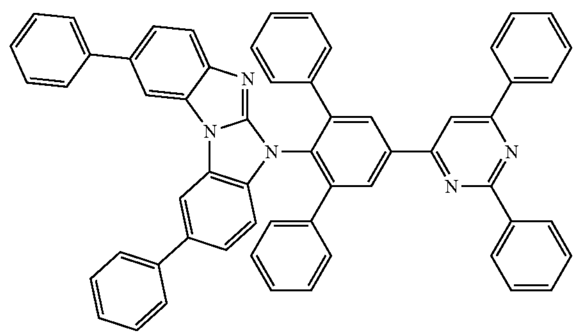
13
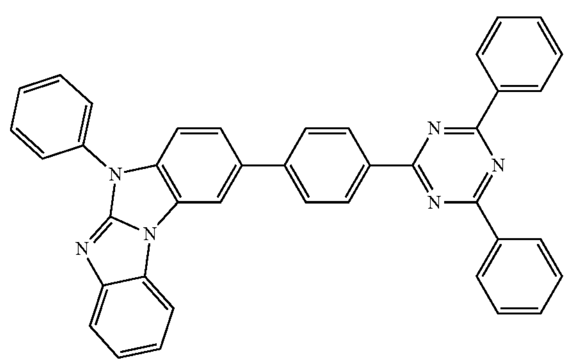
14
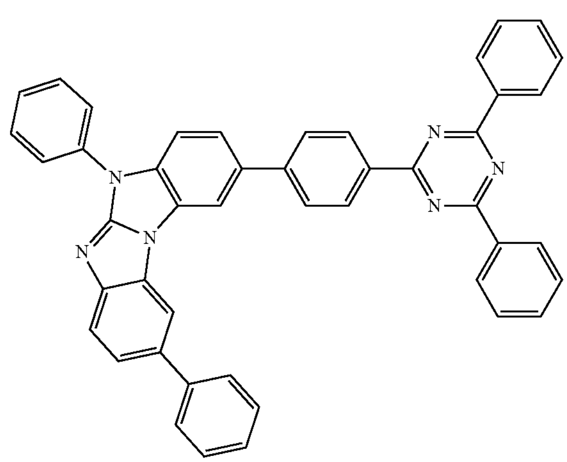

-continued
15
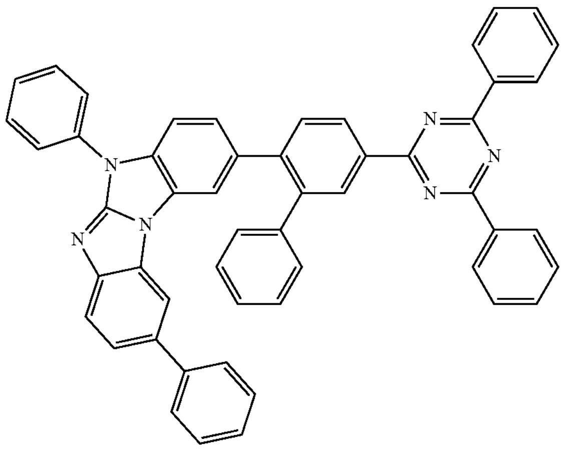
16
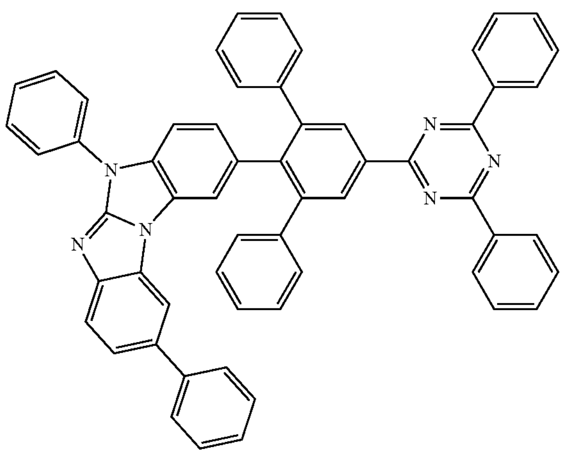
17
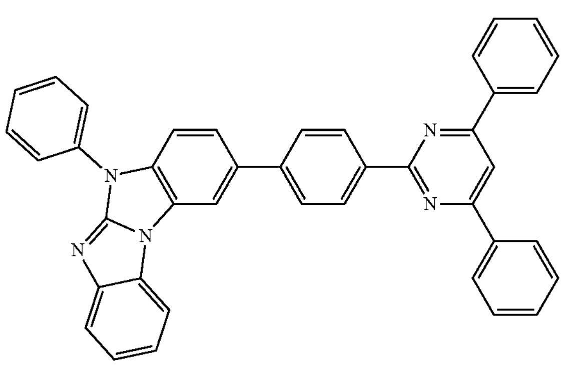
-continued
18
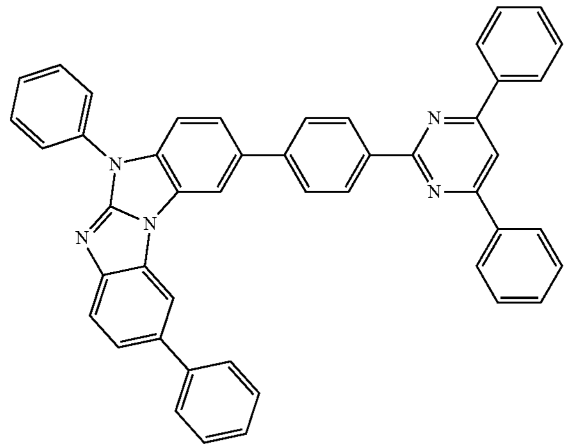
19
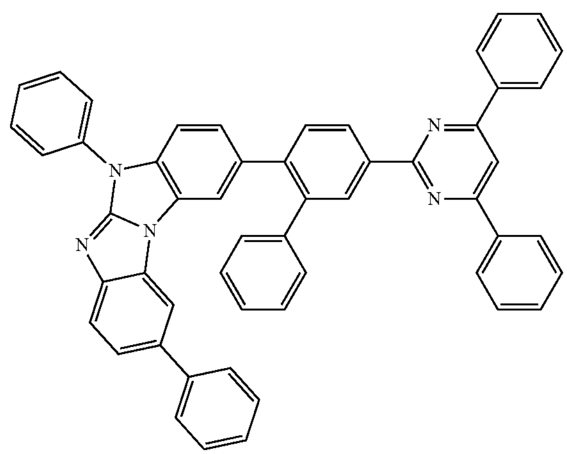
20
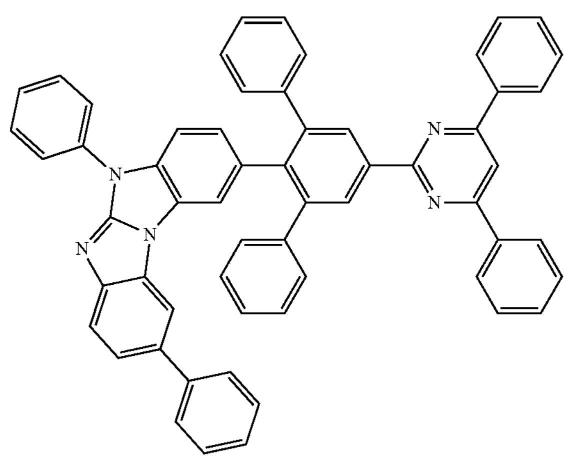

21
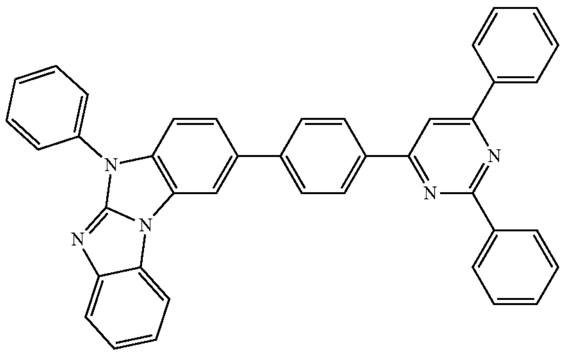
22
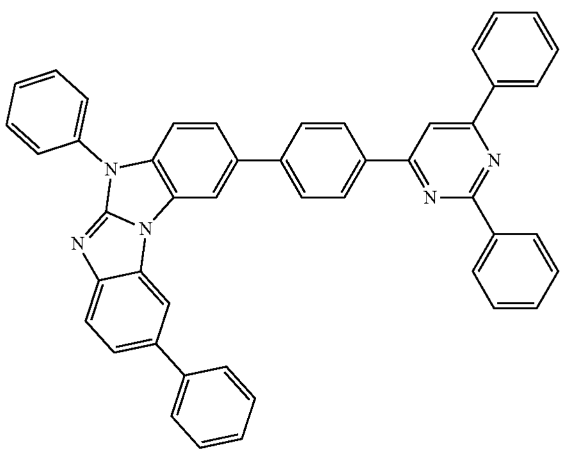
23
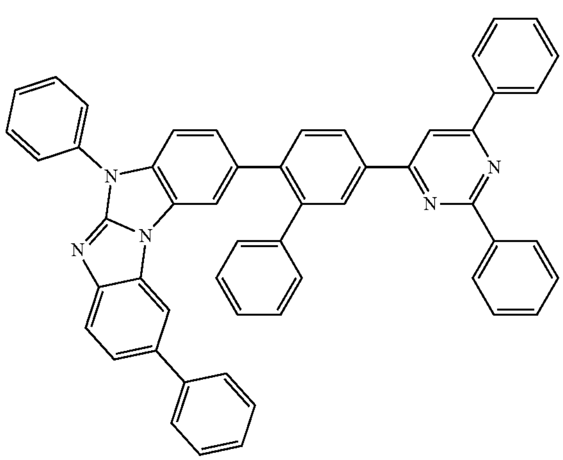
24
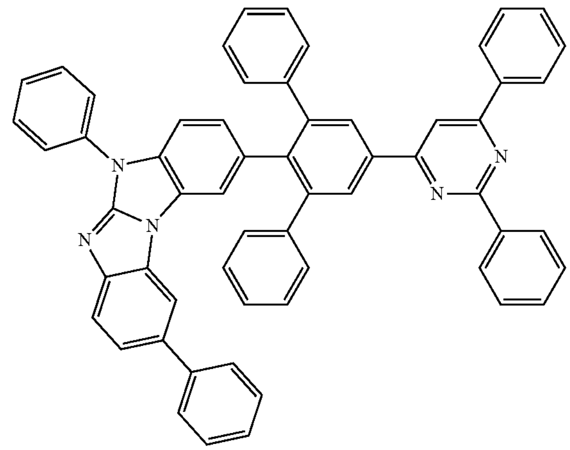
25
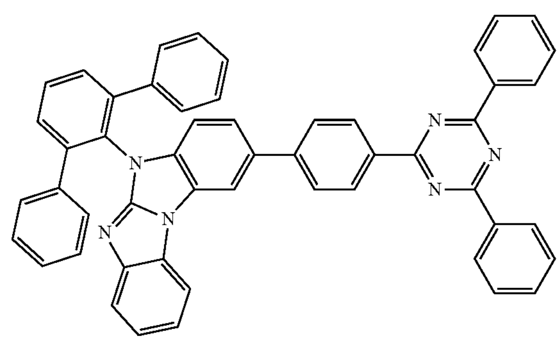
26
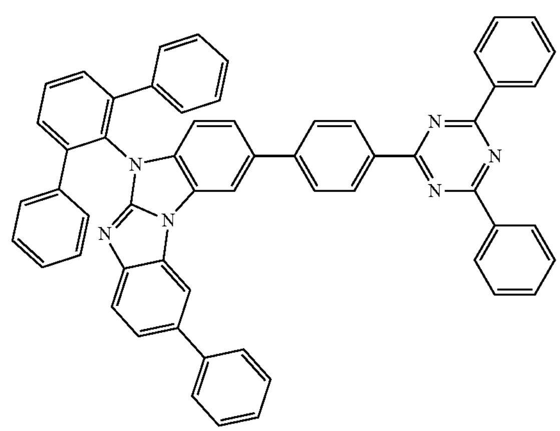

27
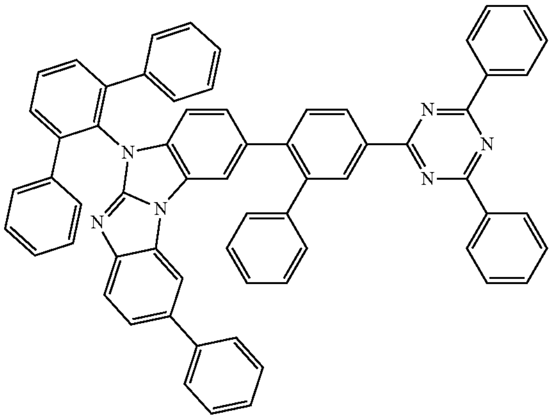
28
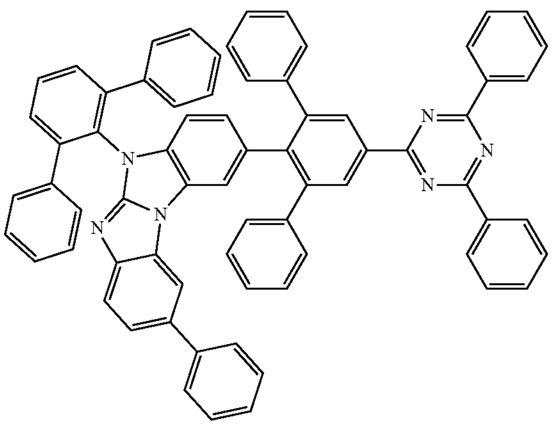
29
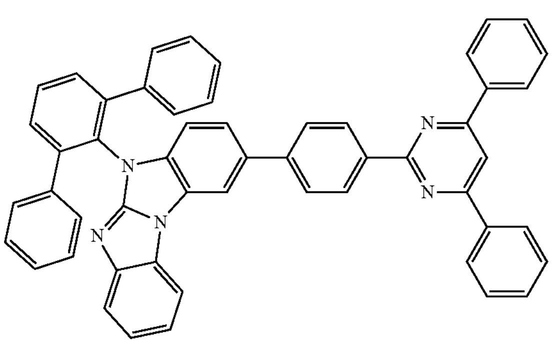
30
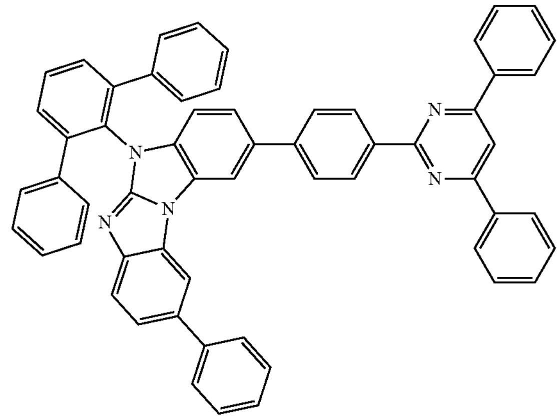
31
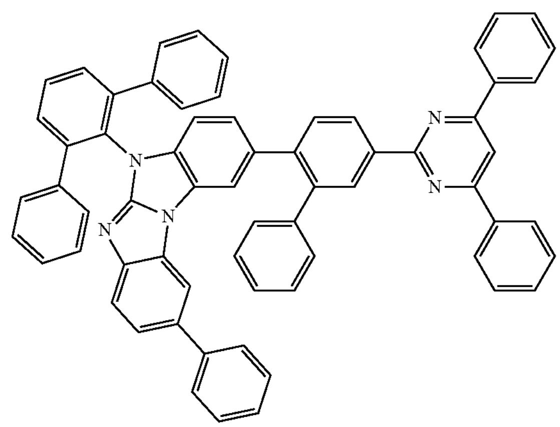
32
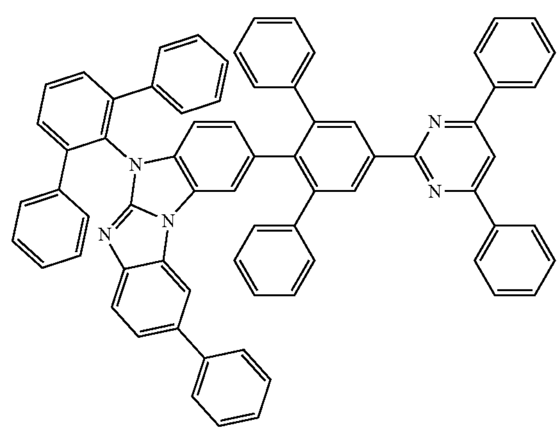

-continued
33
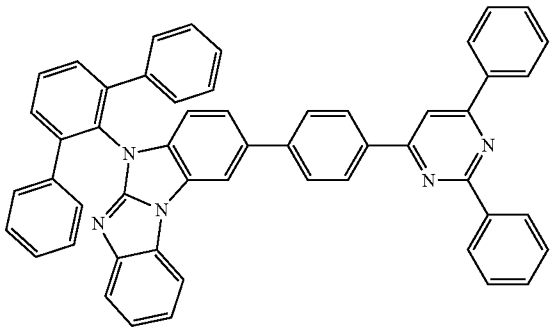
34
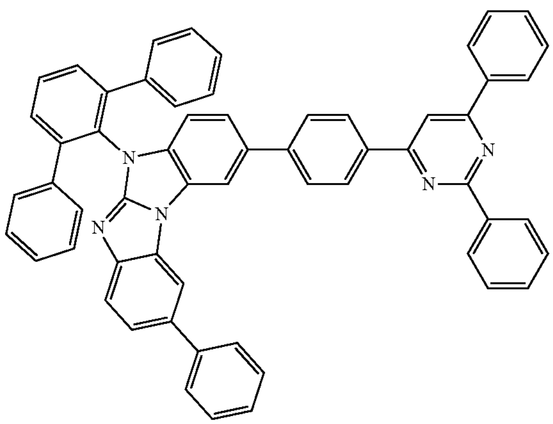
35
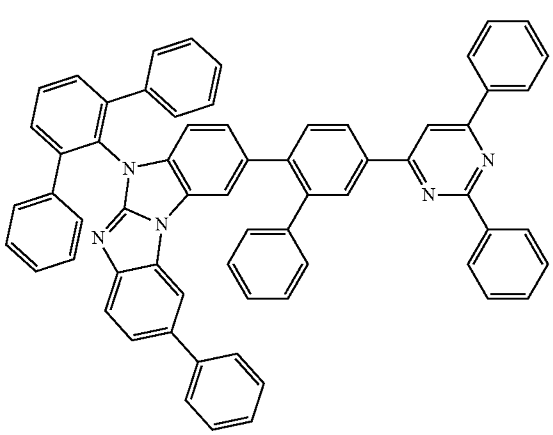
-continued
36
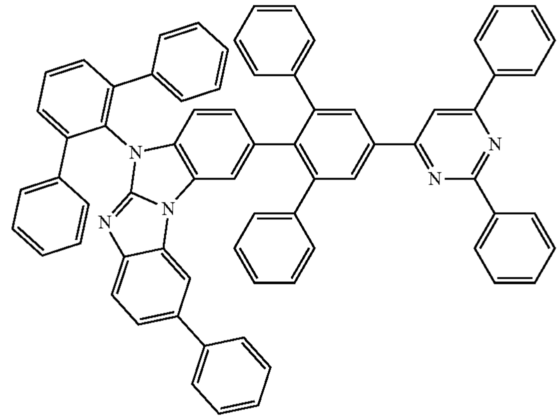
37
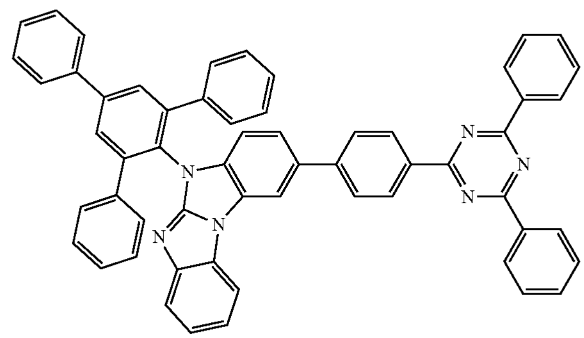
38
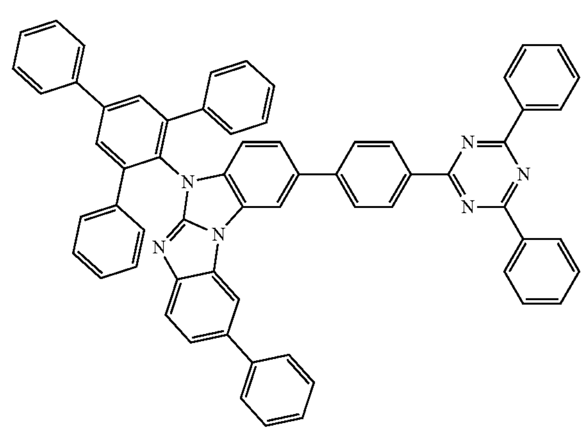

-continued
39
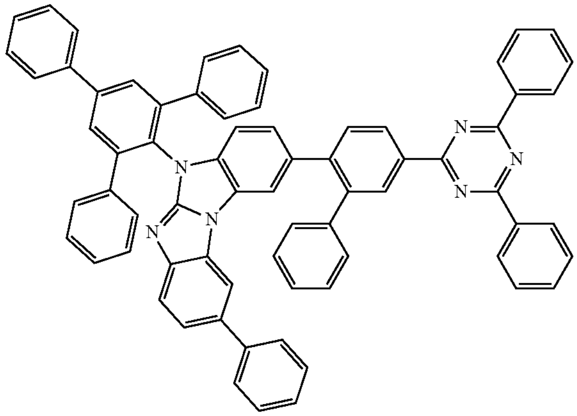
40
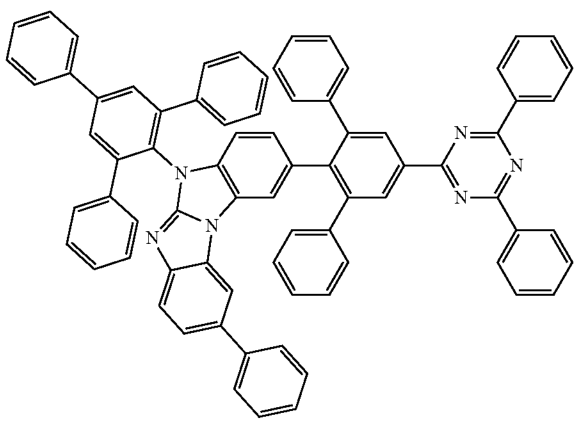
41
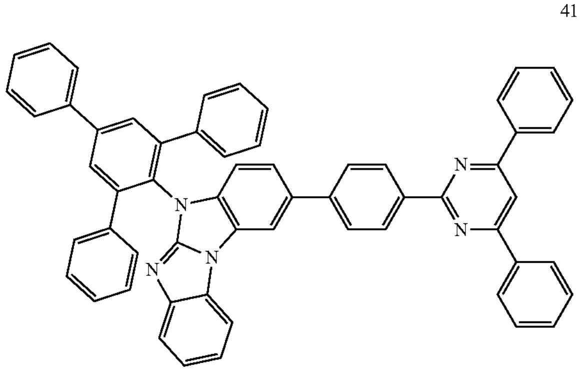
-continued
42
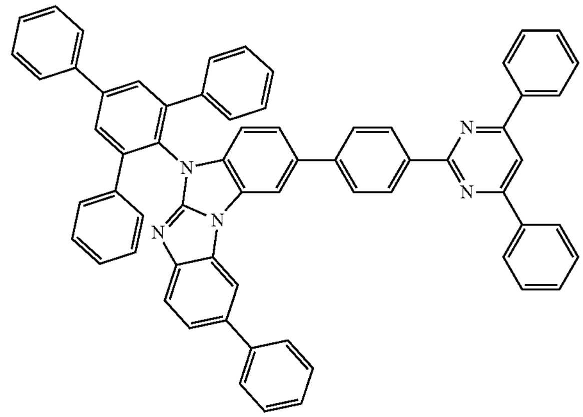
43
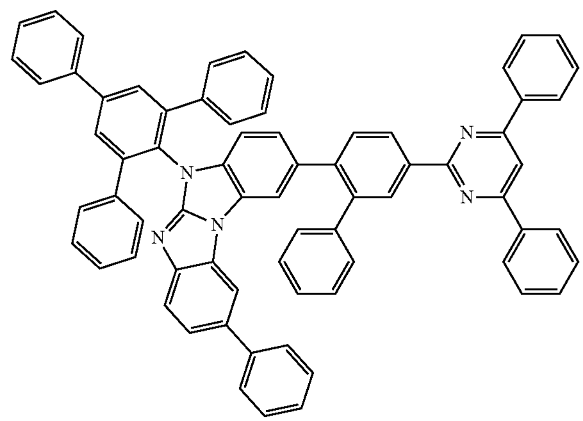
44
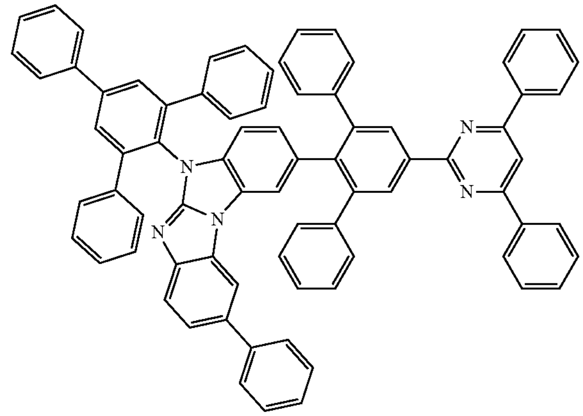

-continued
45
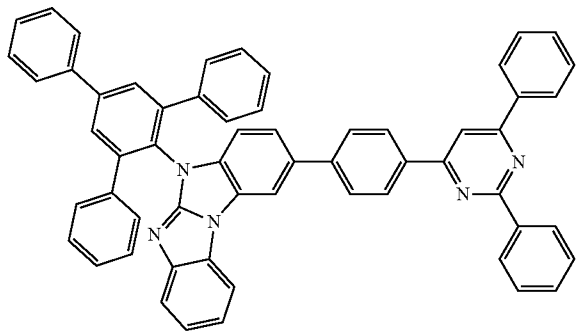
46
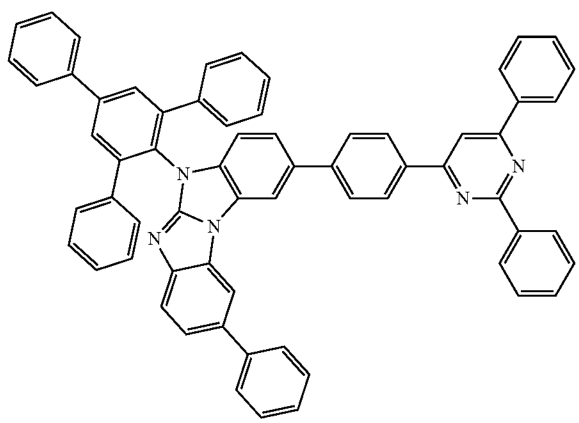
47
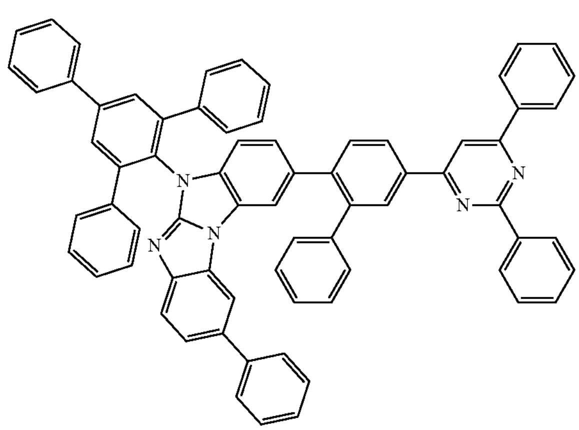
-continued
48
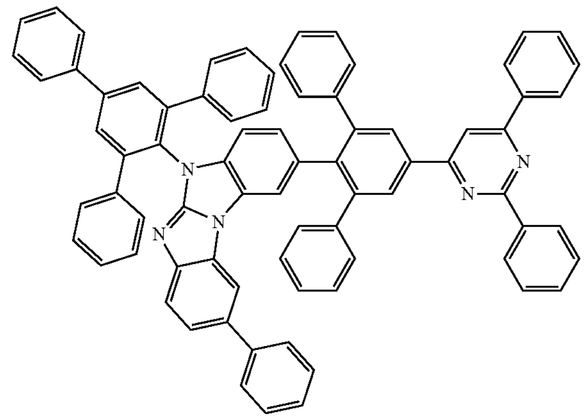
49
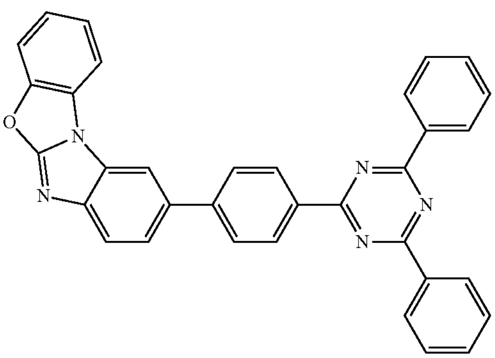
50
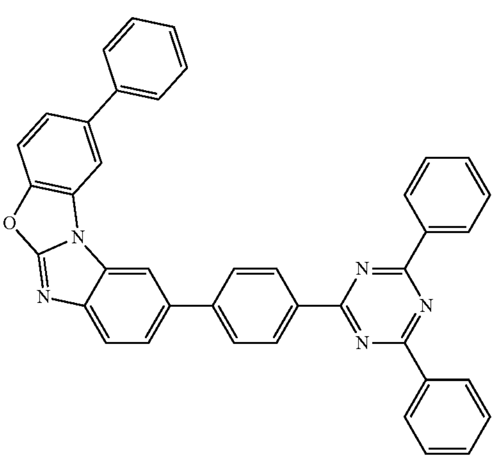

-continued
51
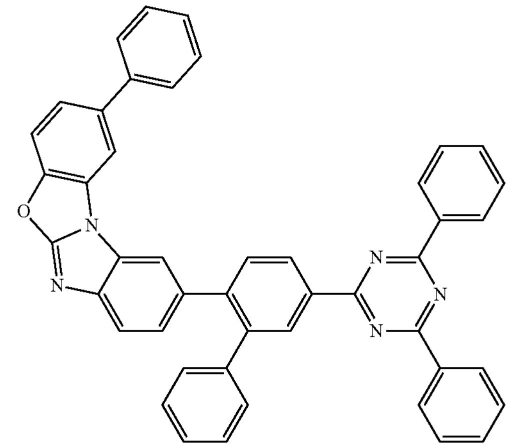
52
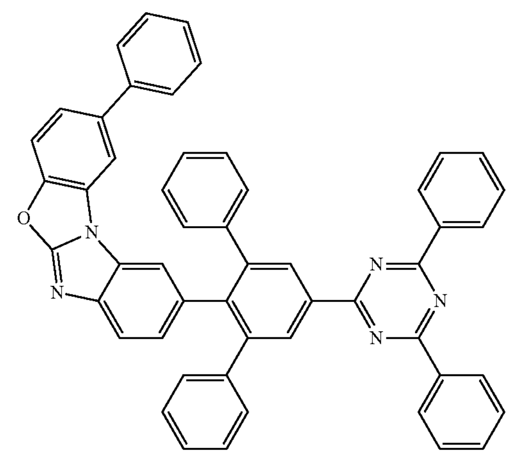
53
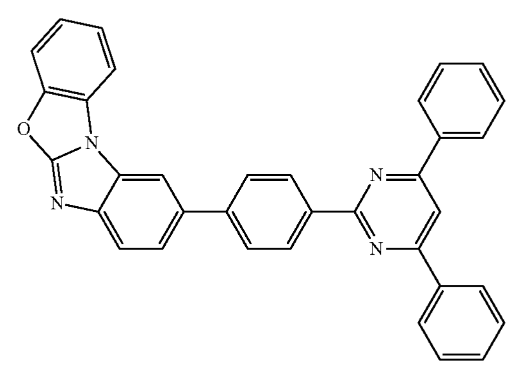
-continued
54
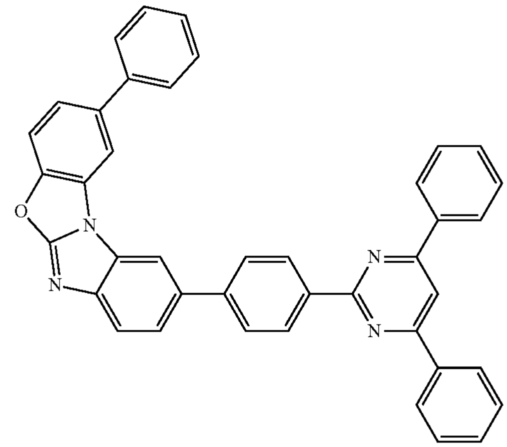
55
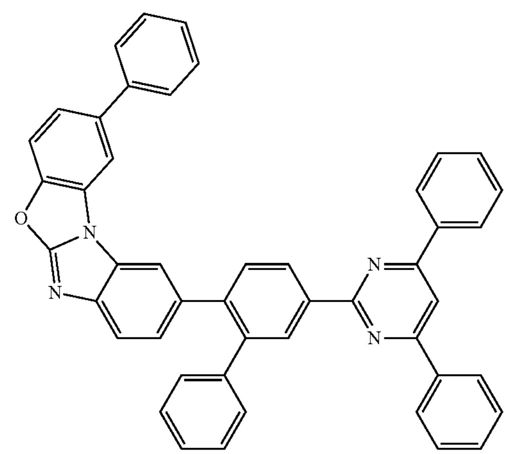
56
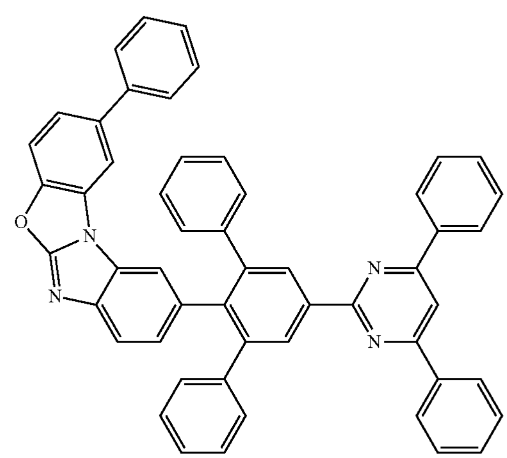

-continued
57
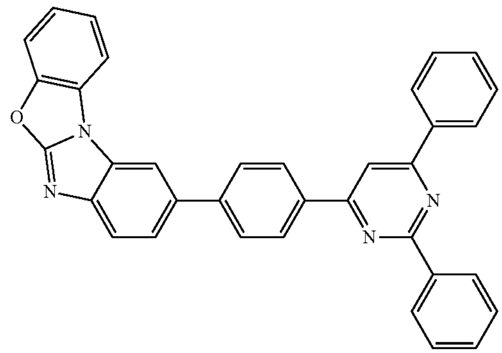
58
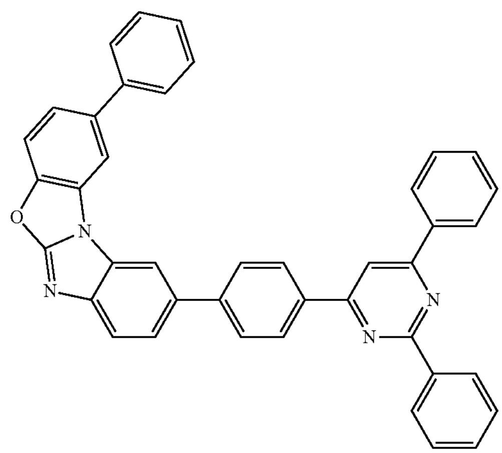
59
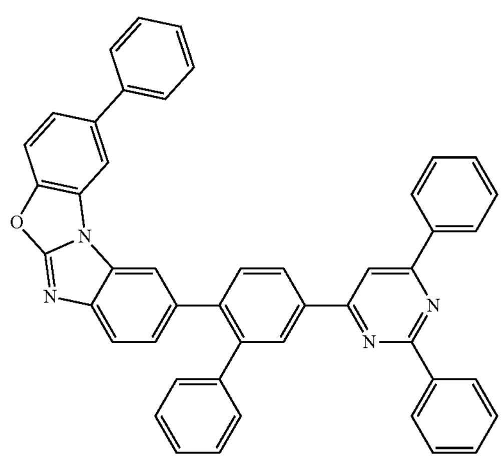
-continued
60
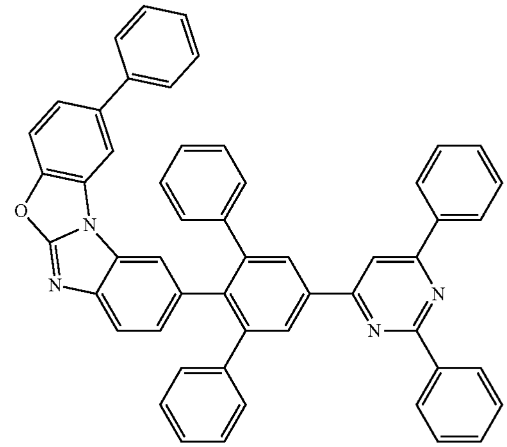
61
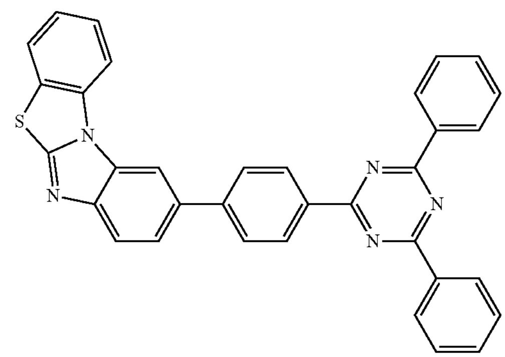
62
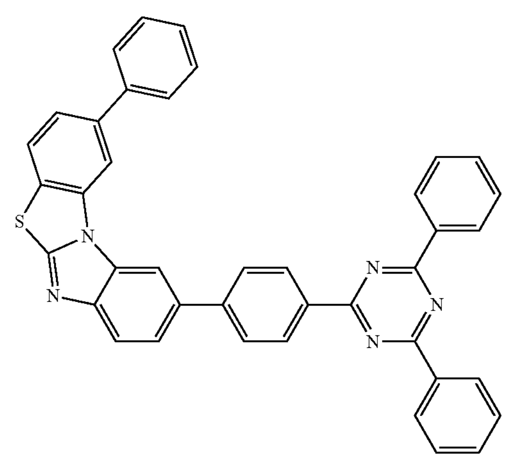

-continued
63
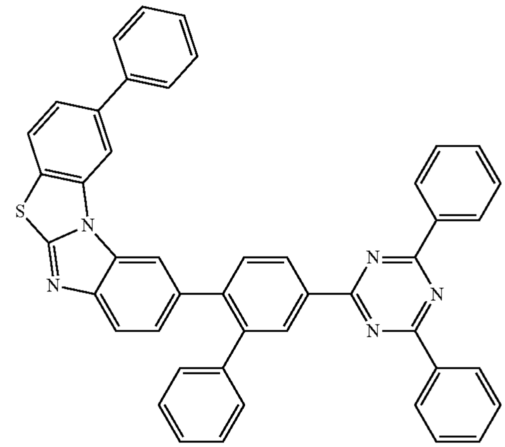
64
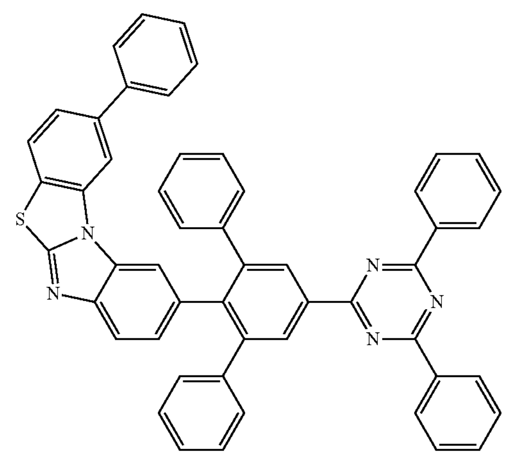
65
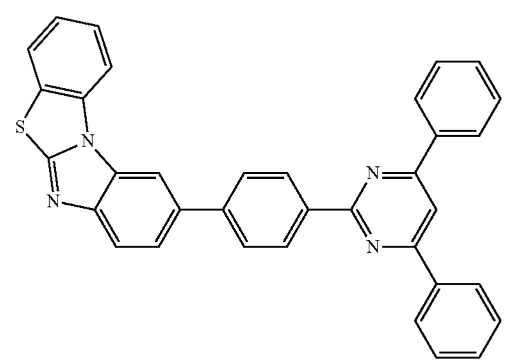
-continued
66
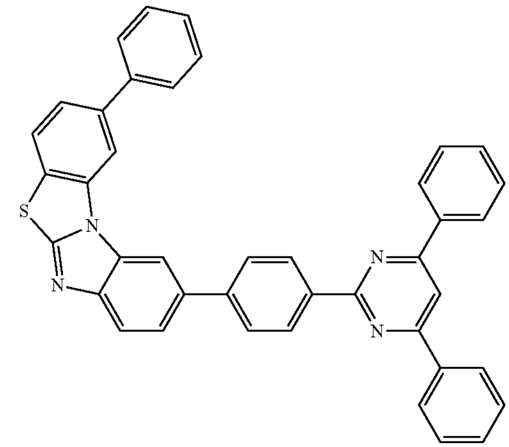
67
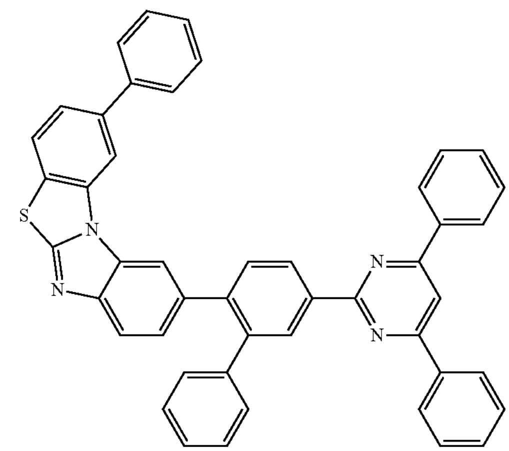
68
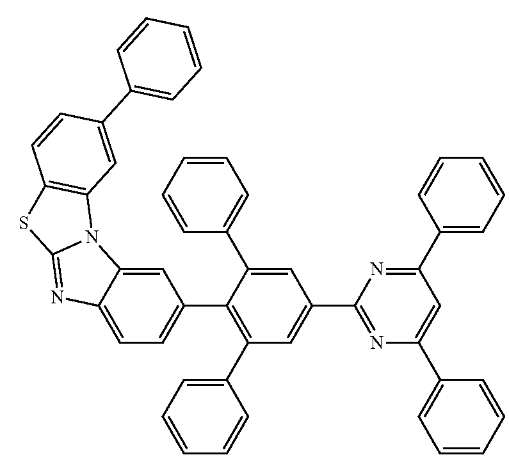

-continued
69
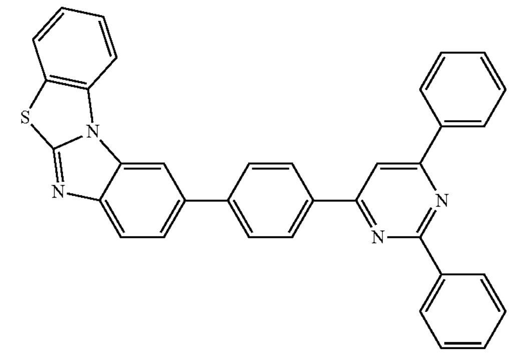
70
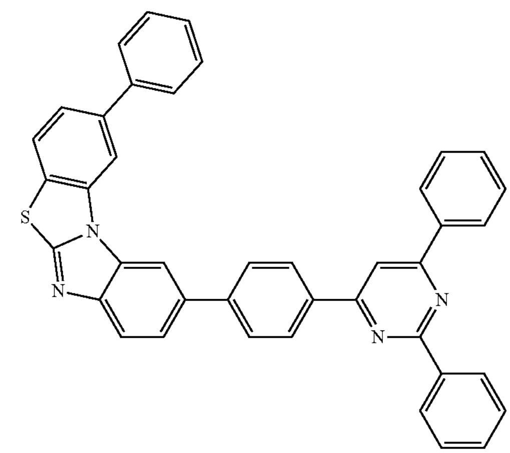
71
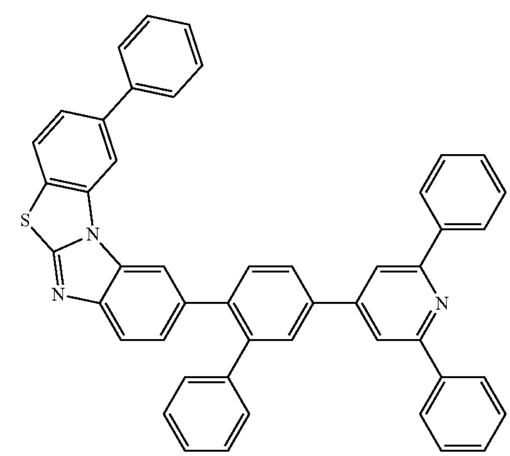
-continued
72
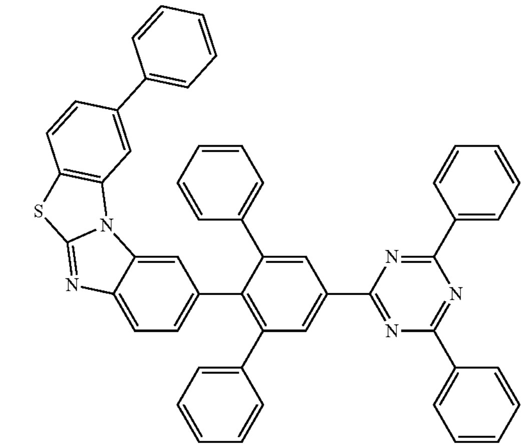
73
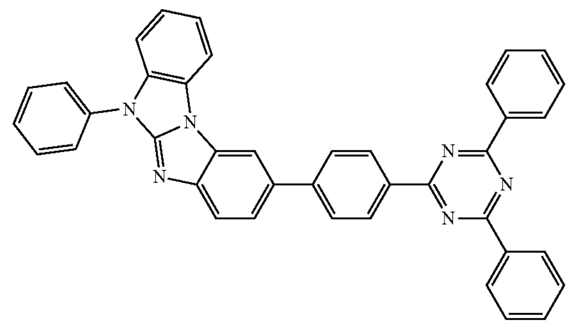
74
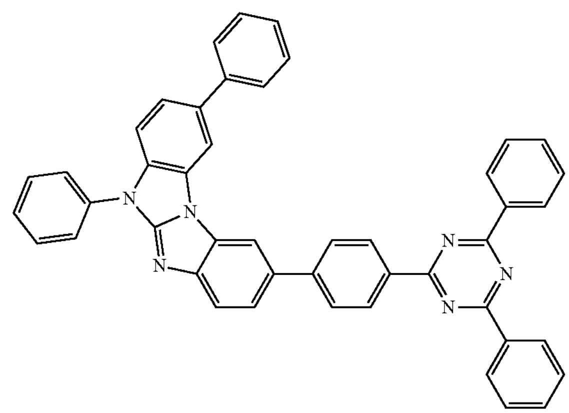
75
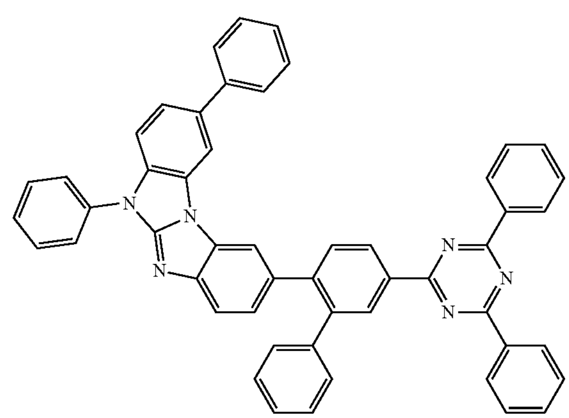

76
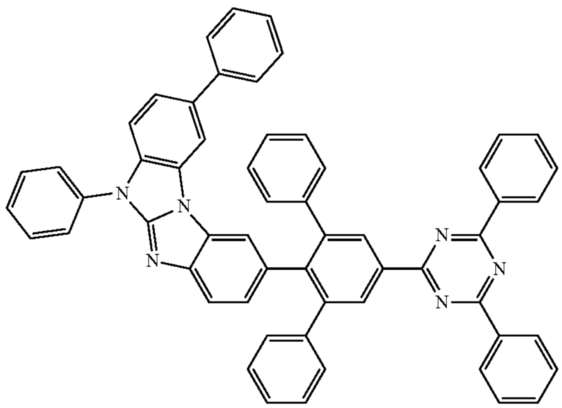
77
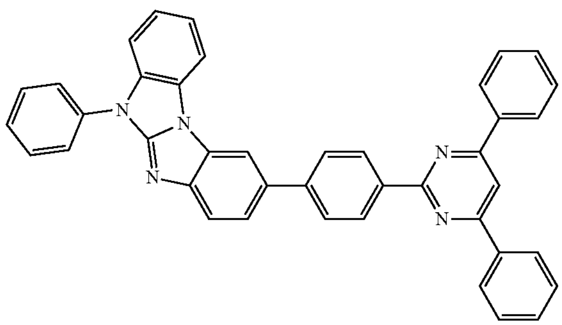
78
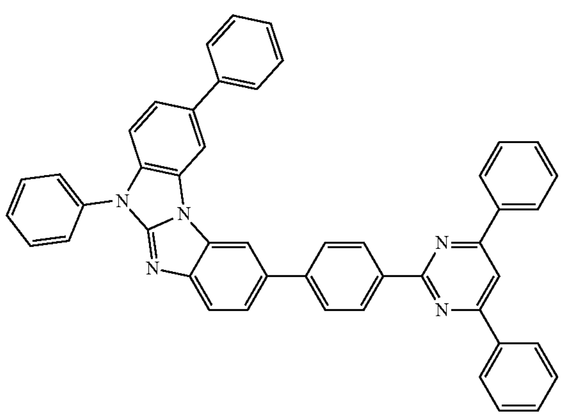
79
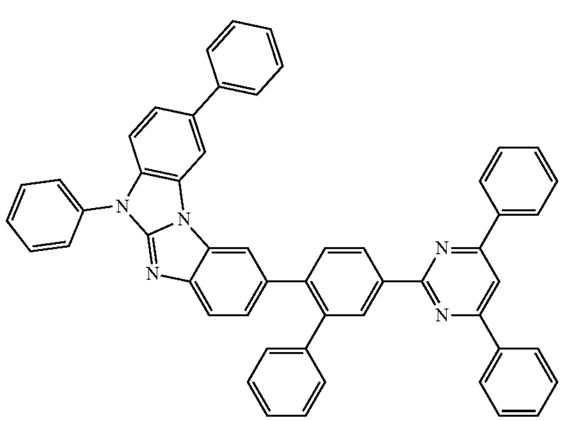
80
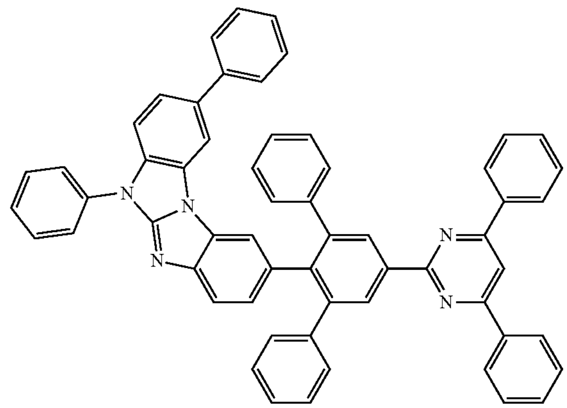
81
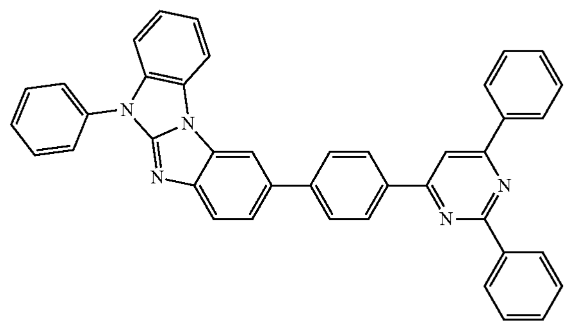
82
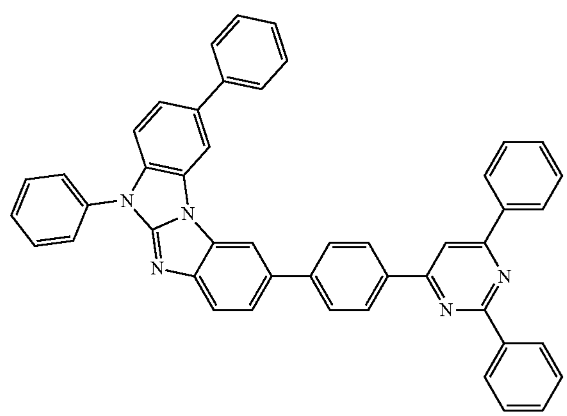
83
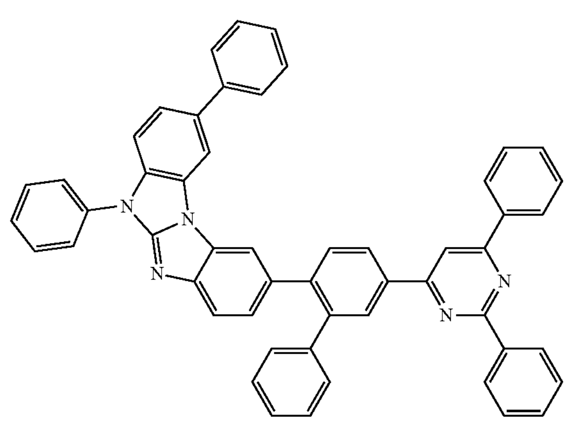

-continued
84
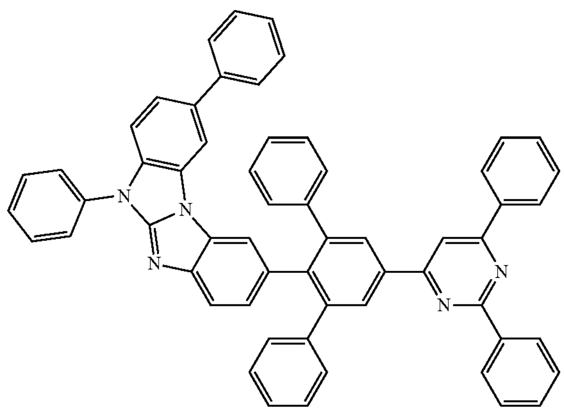
85
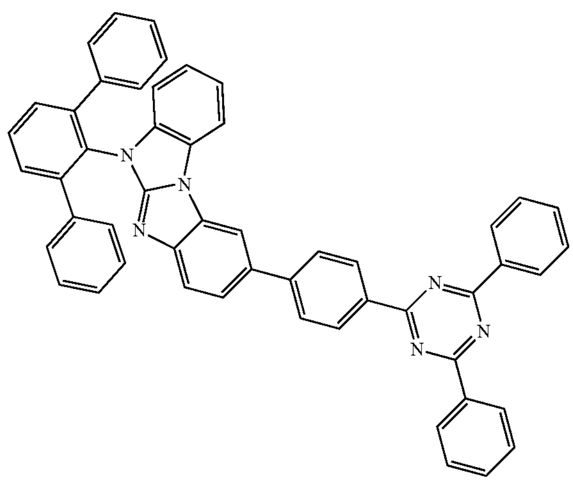
86
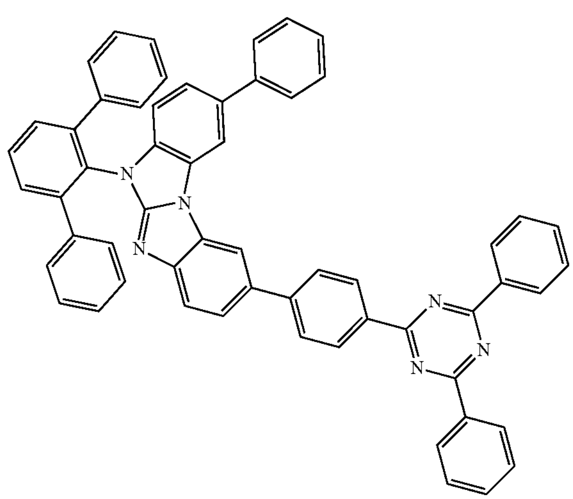
-continued
87
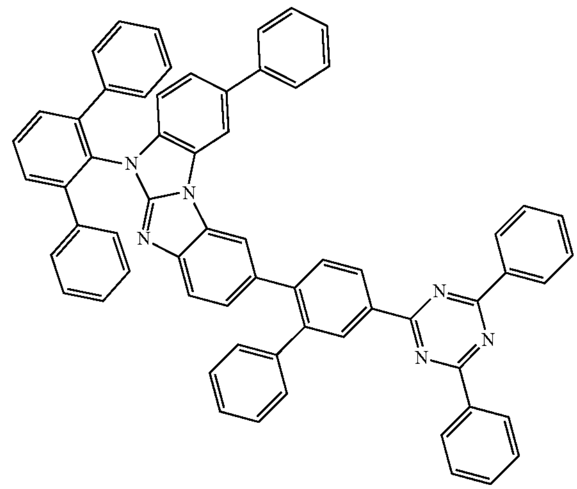
88
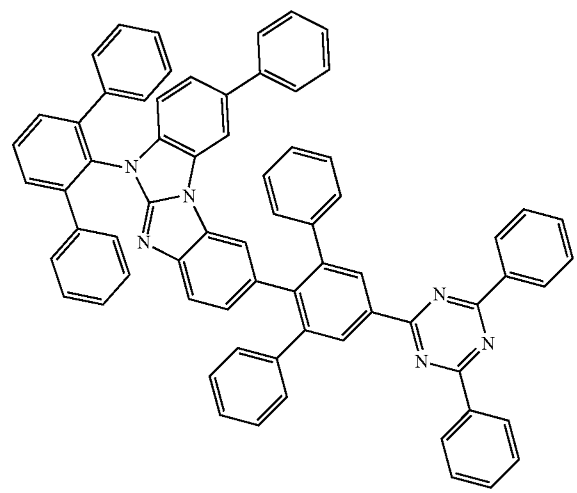
89
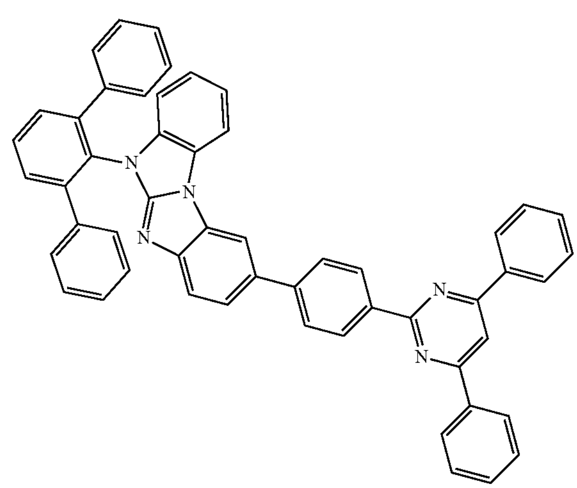

-continued
90
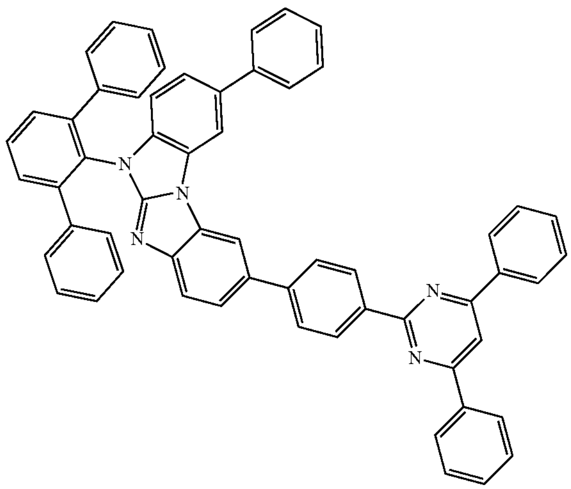
91
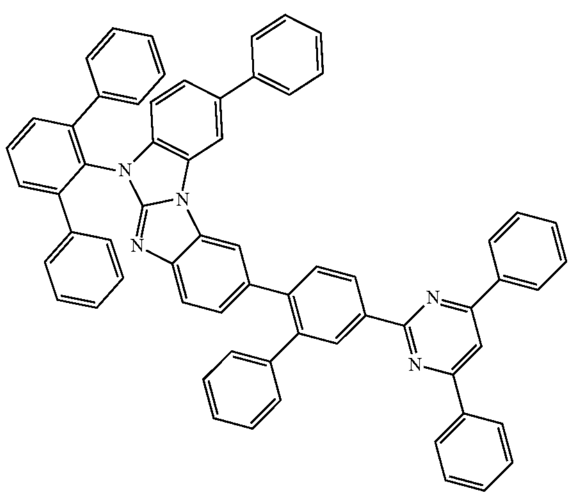
92
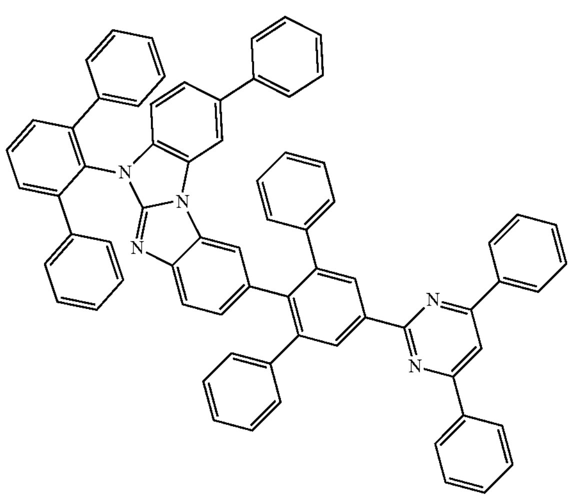
-continued
93
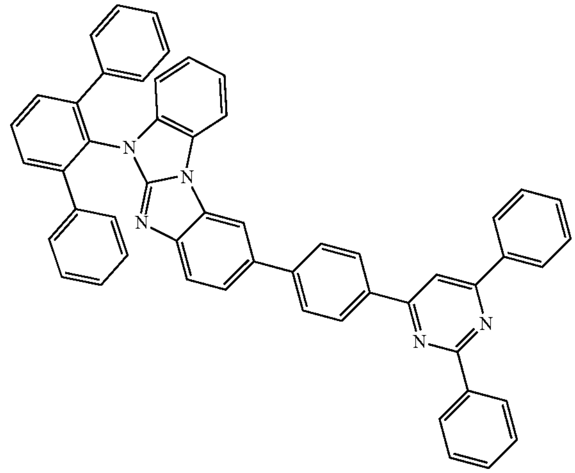
94
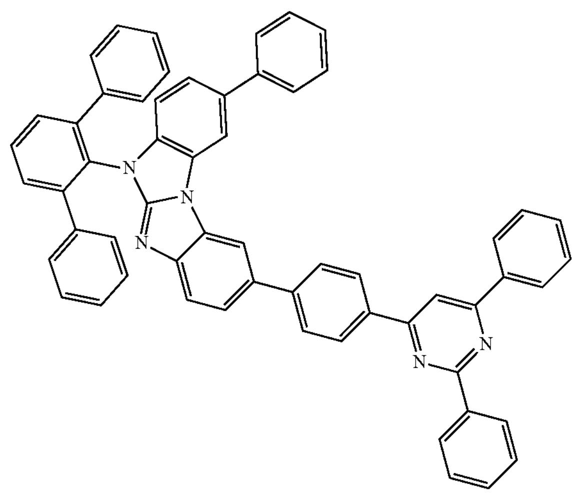
95
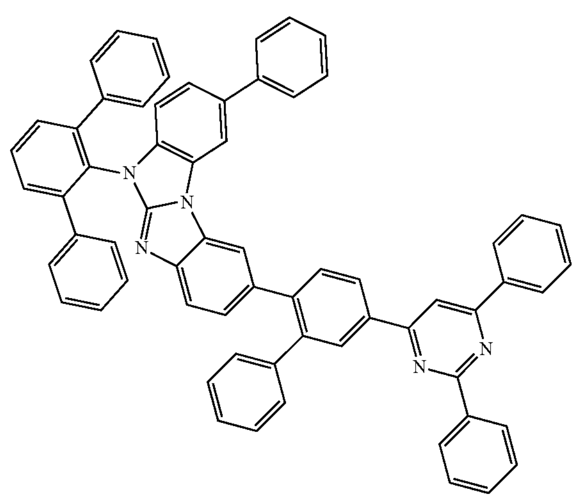

-continued
96
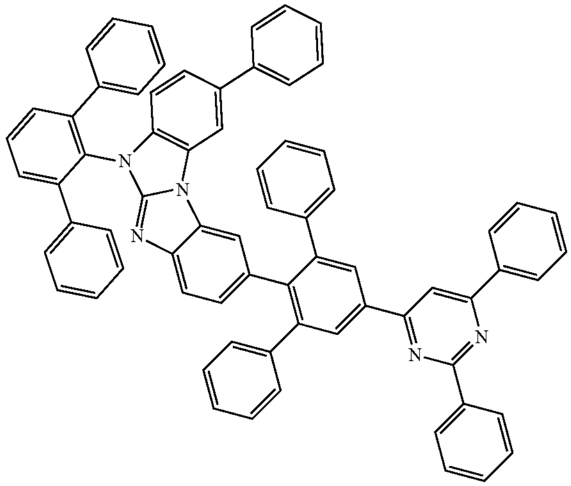
97
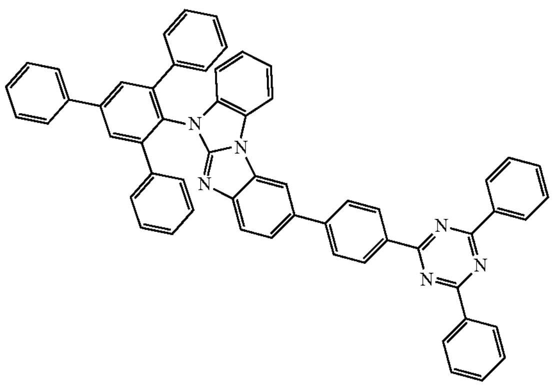
98
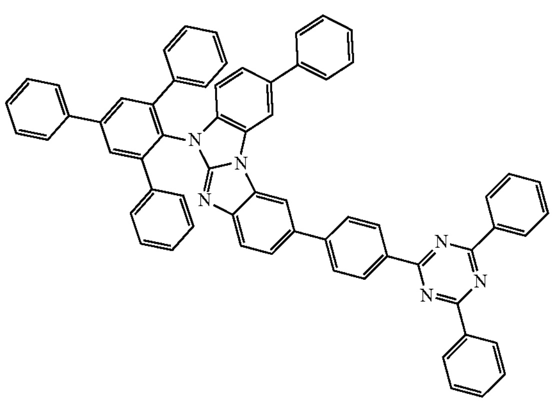
-continued
99
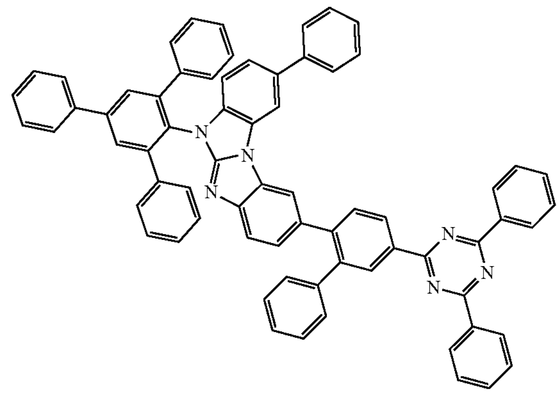
100
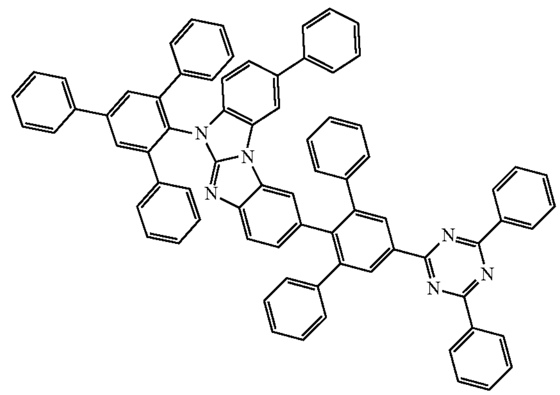
101
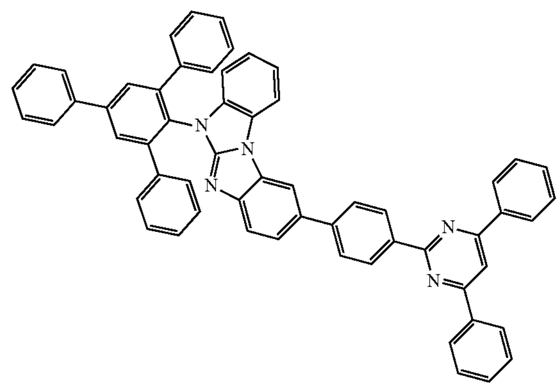
102
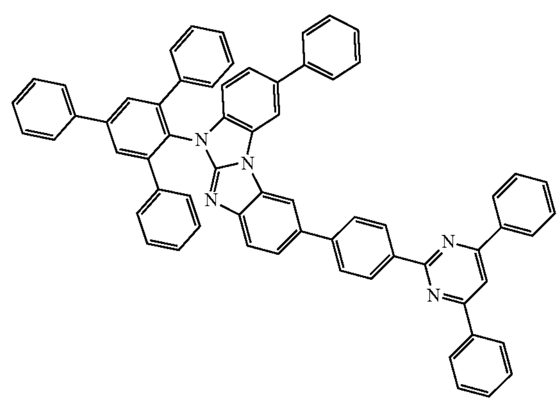

-continued
103
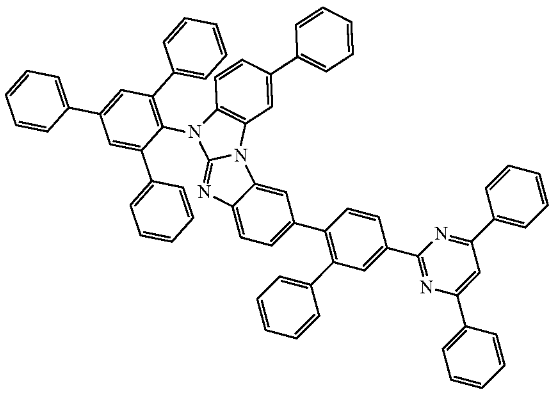
104
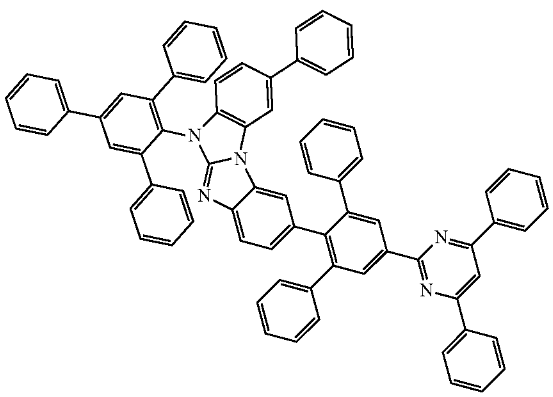
105
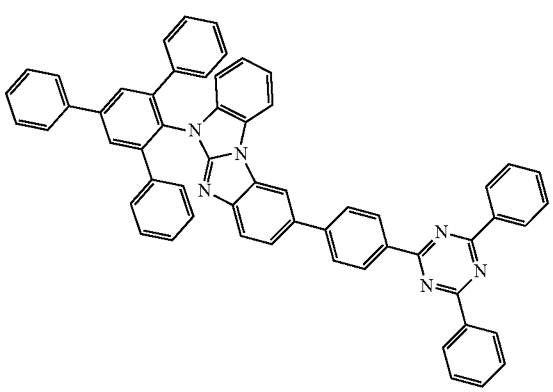
106
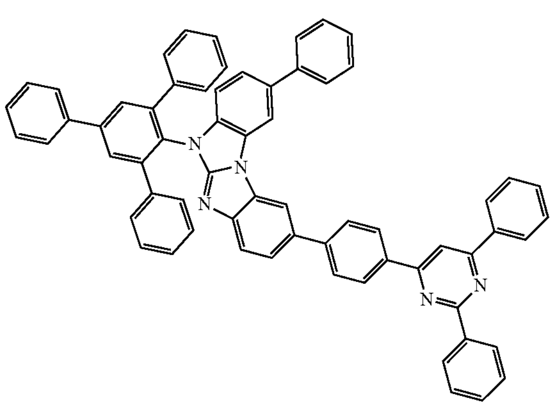
-continued
107
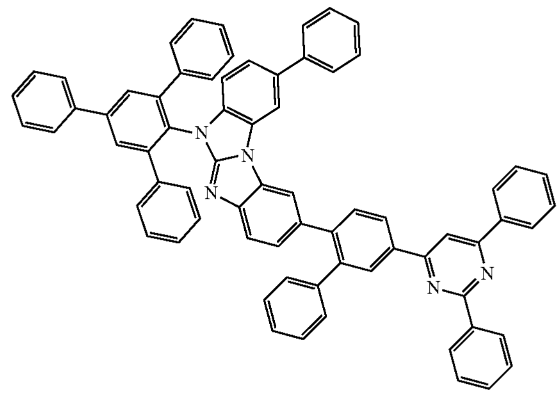
108
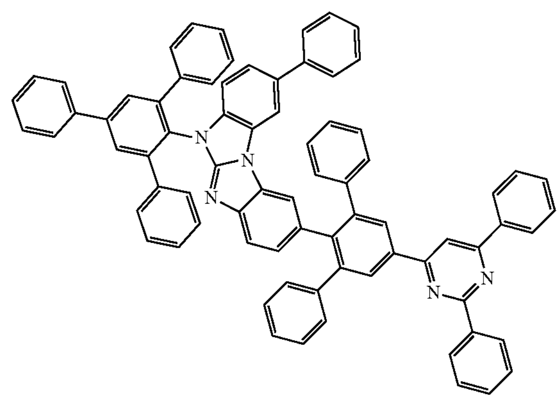
109
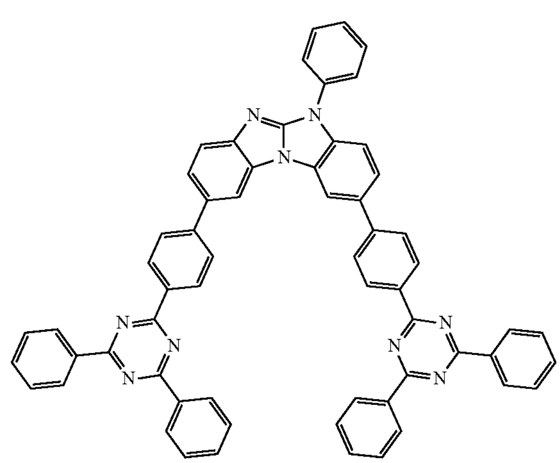

-continued
110
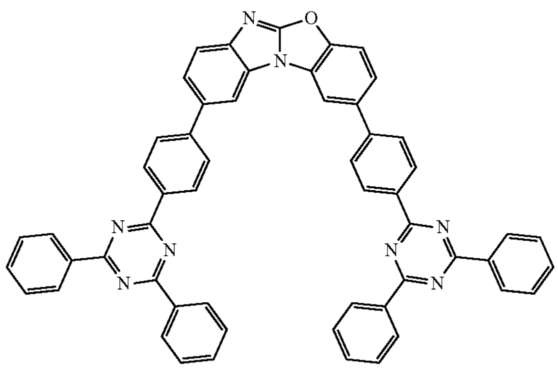
111
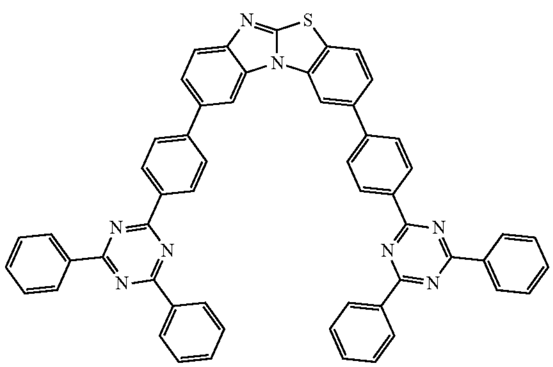
112
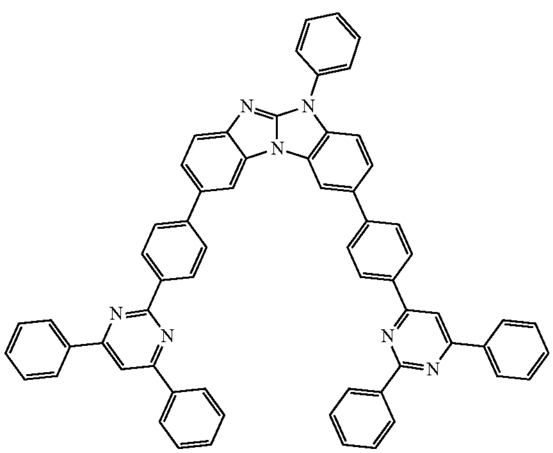
113
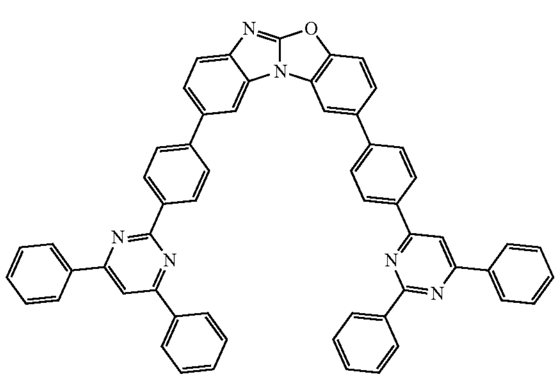
-continued
114
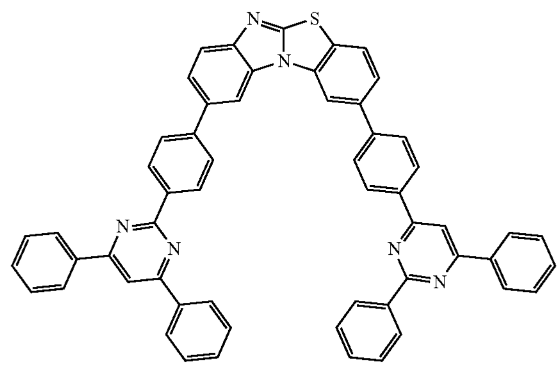
115
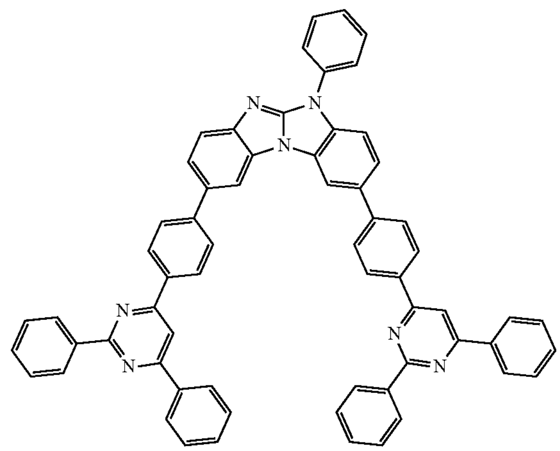
116
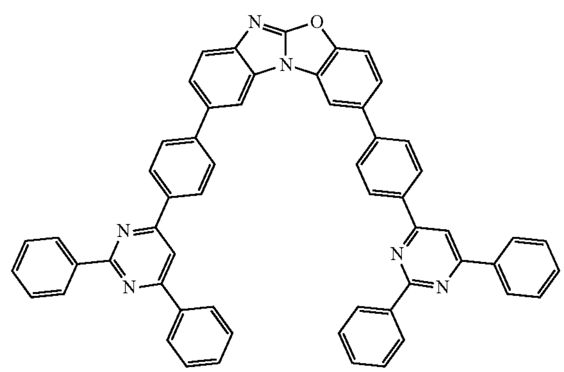
117
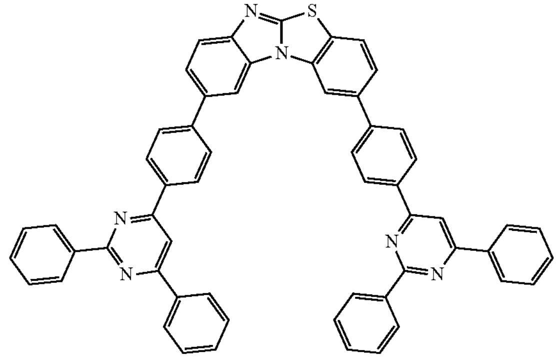

Group VIII
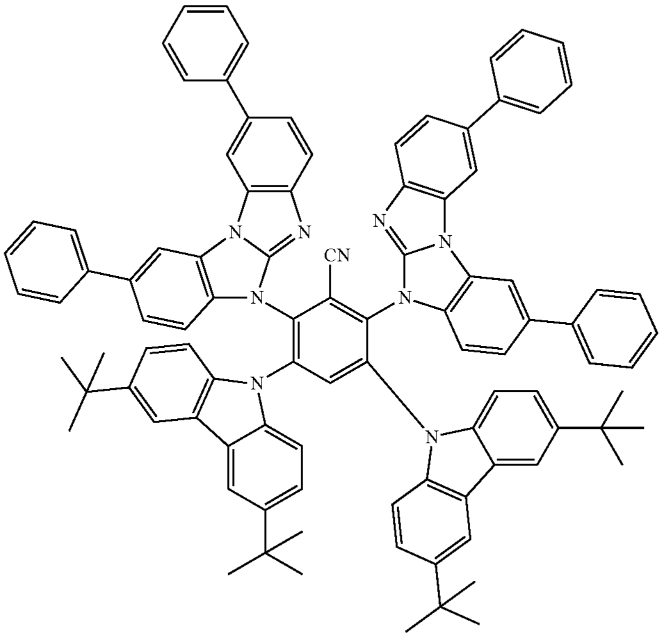
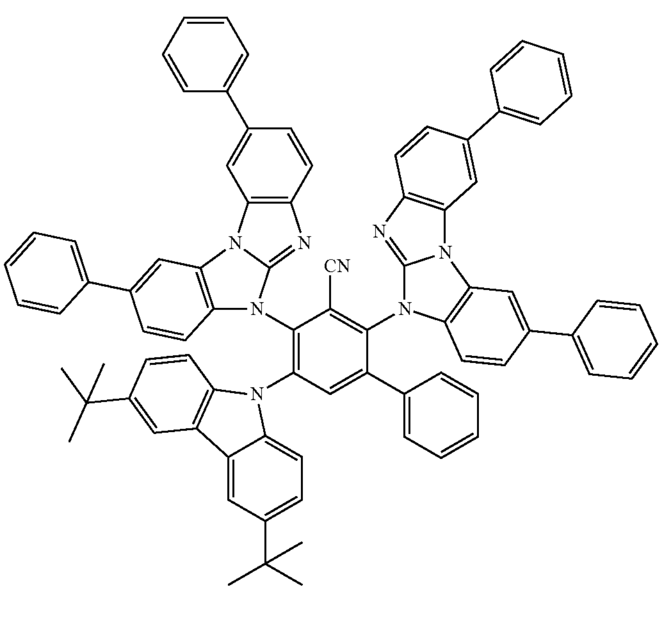

-continued
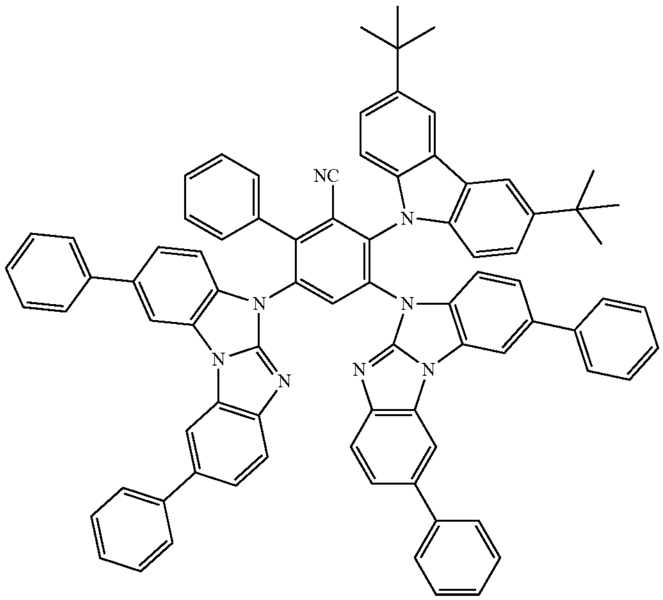
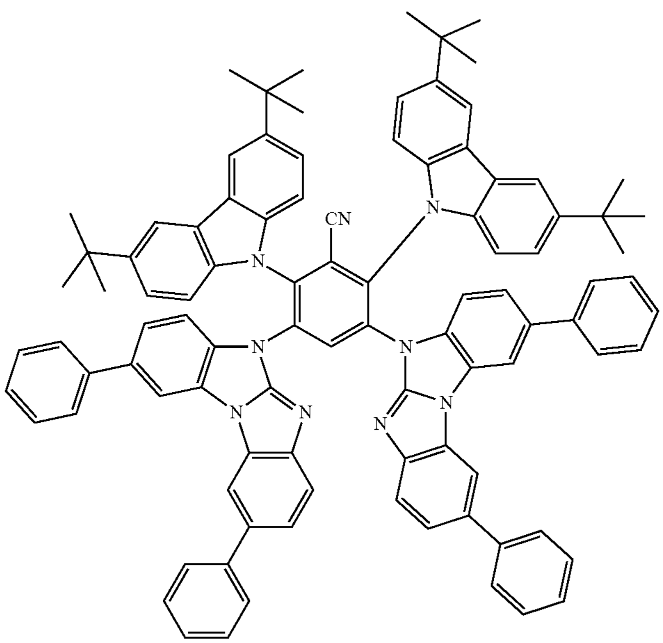
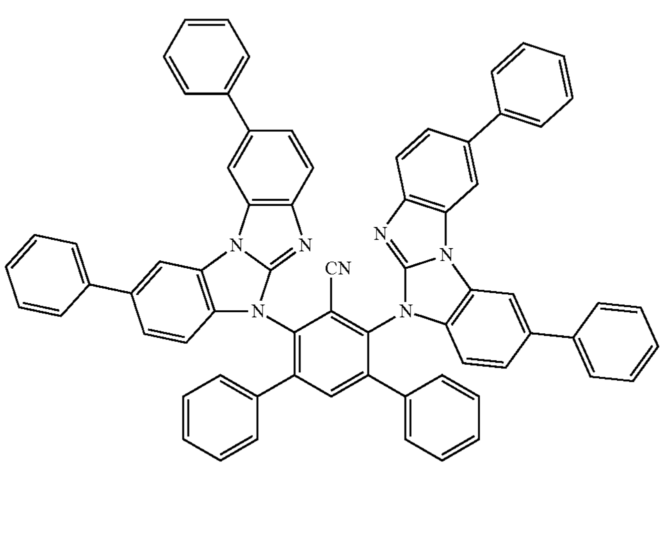

-continued
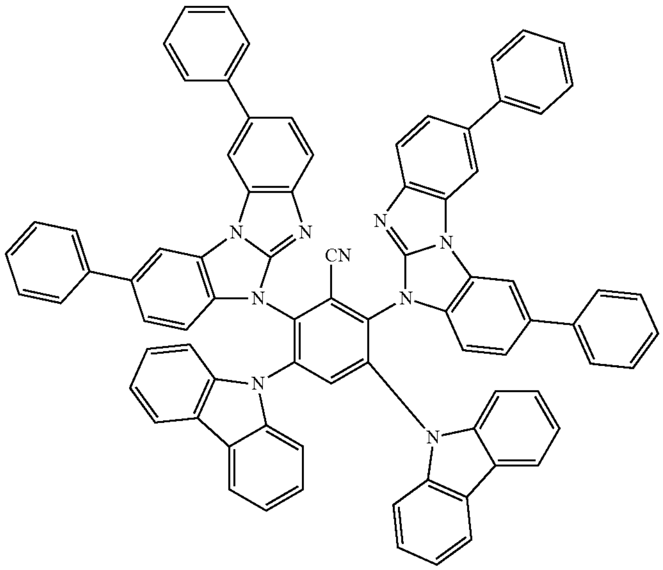
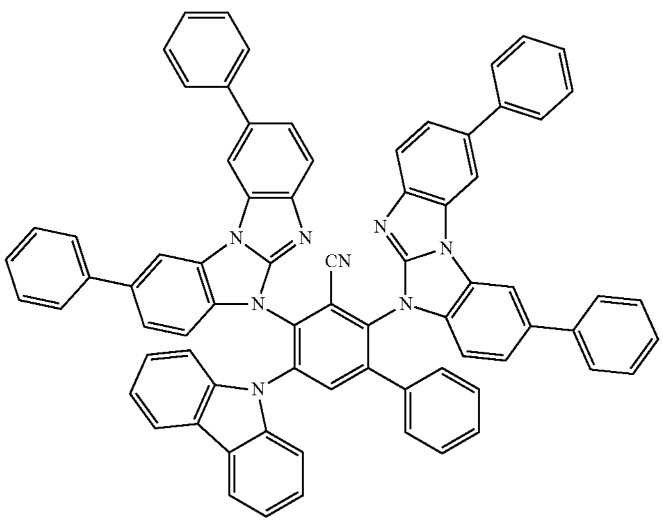
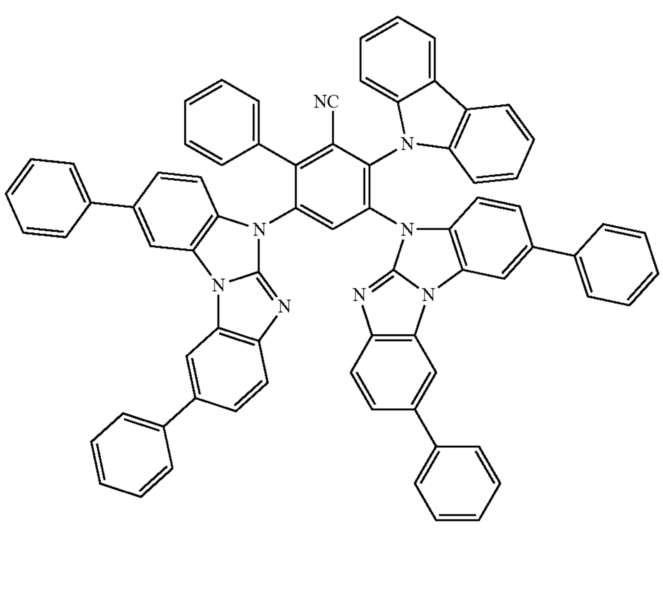

-continued
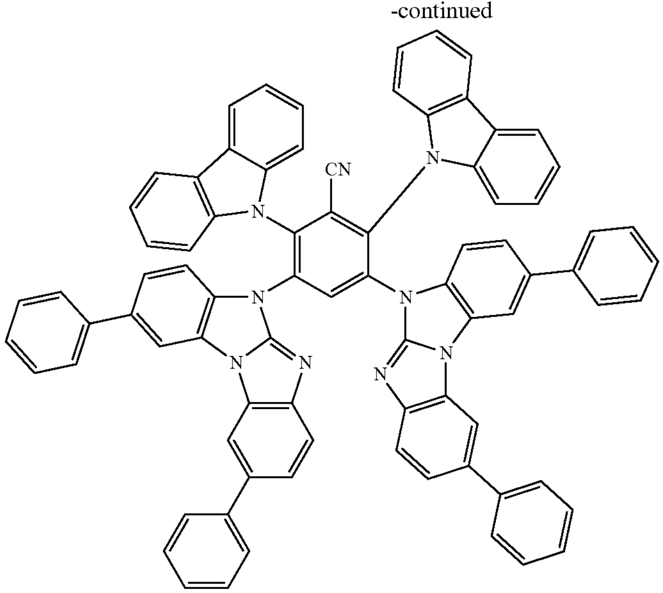
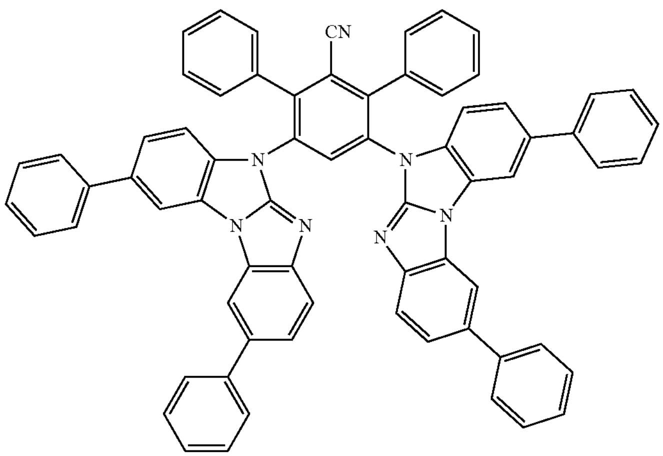
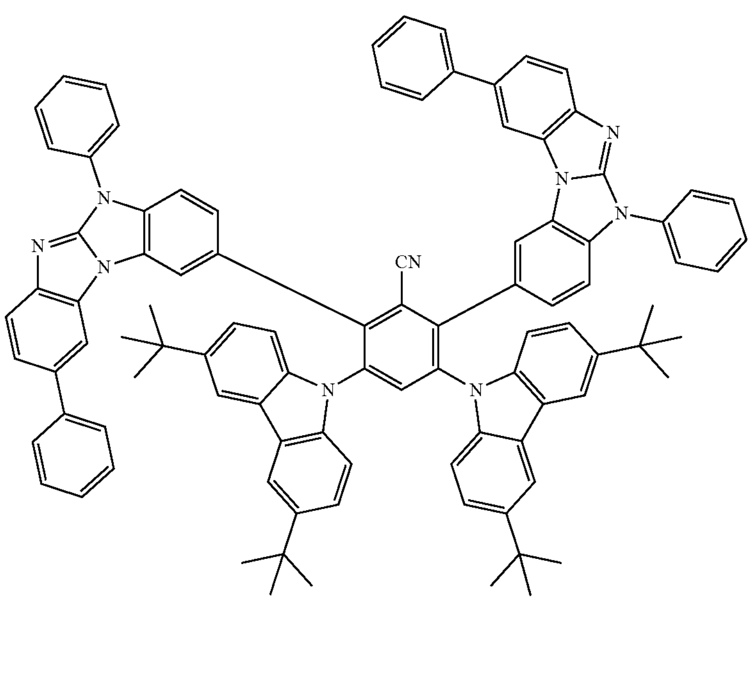

-continued
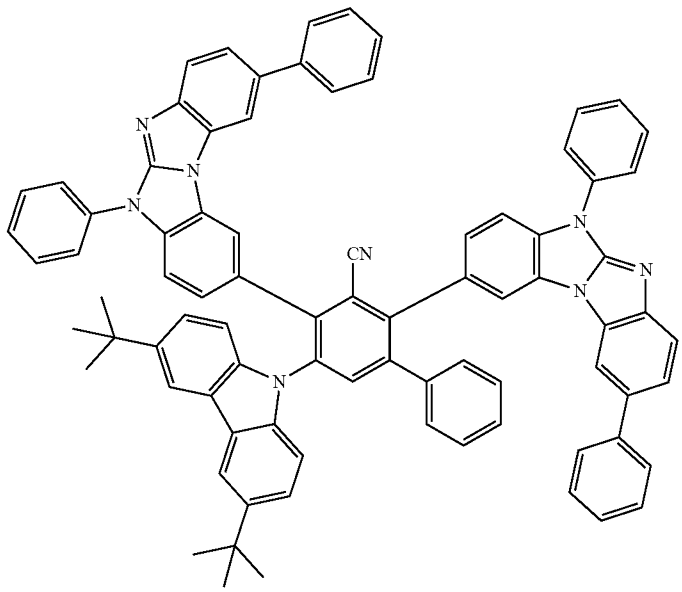
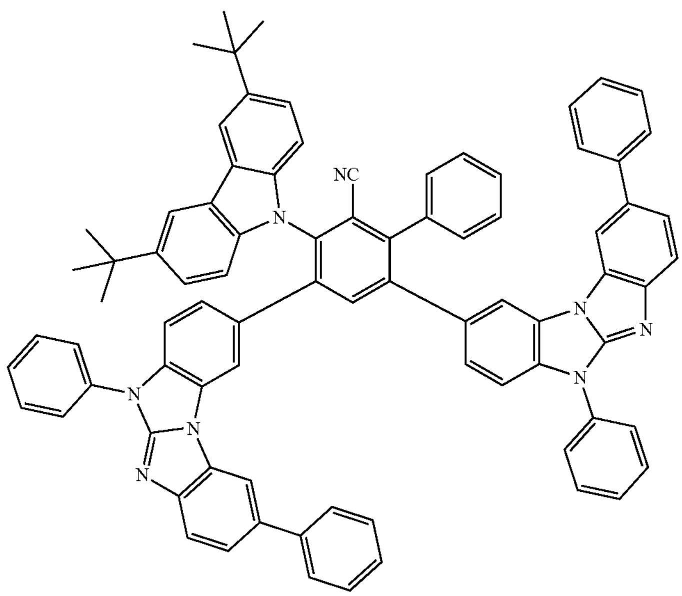
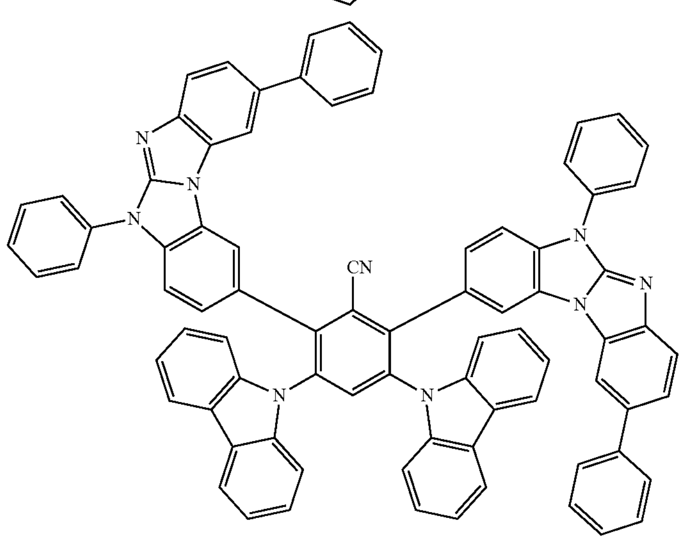

-continued
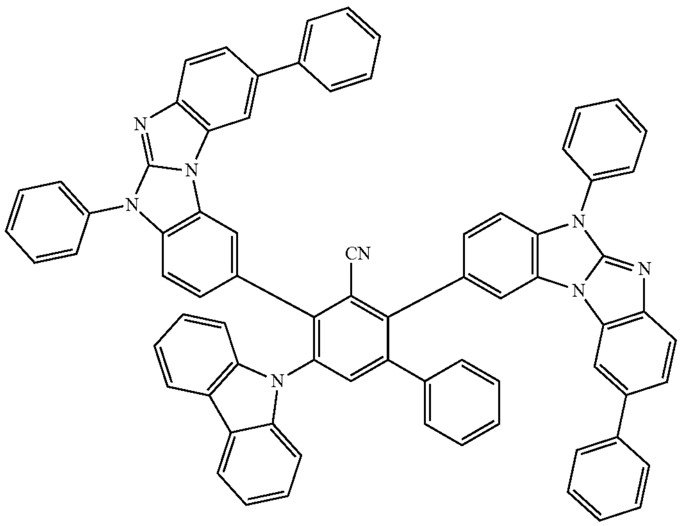
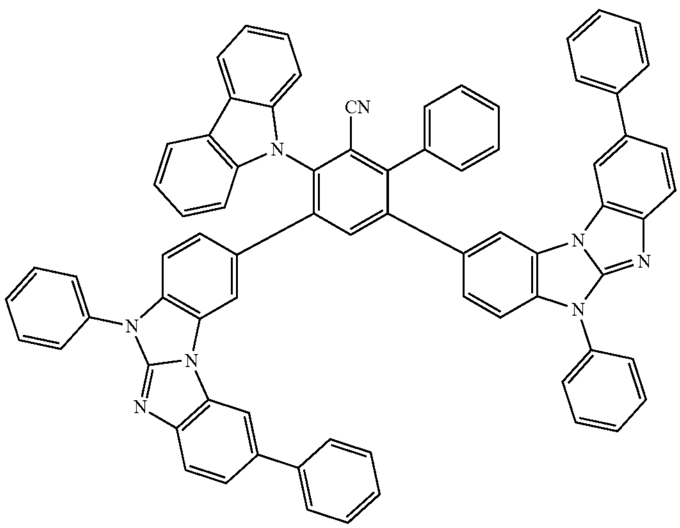
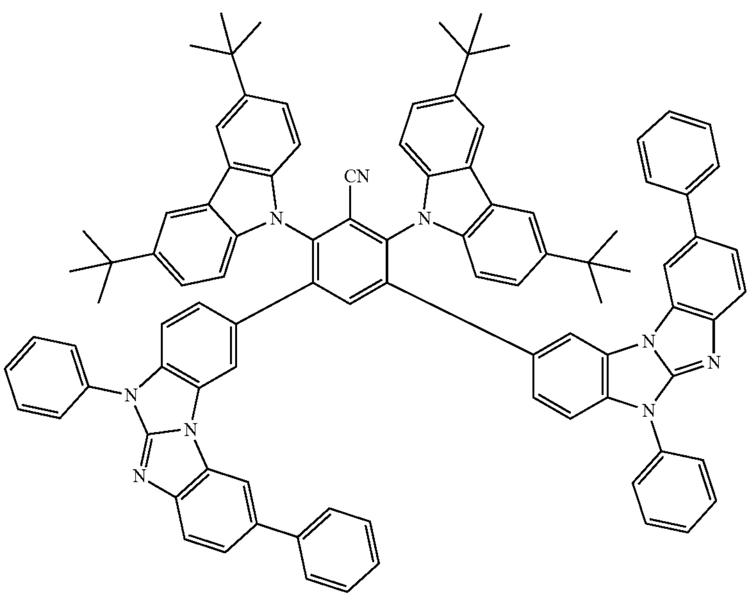

-continued
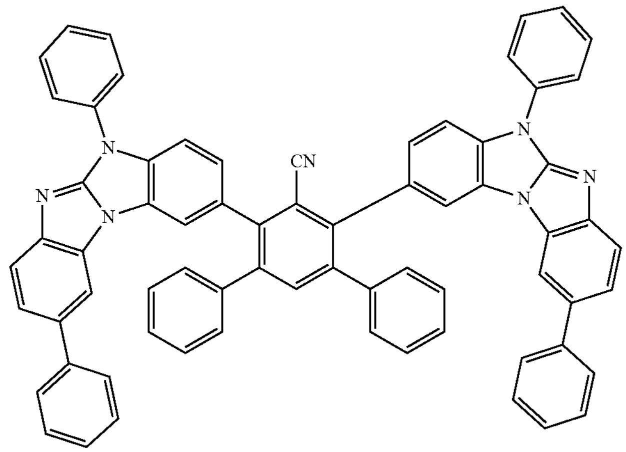
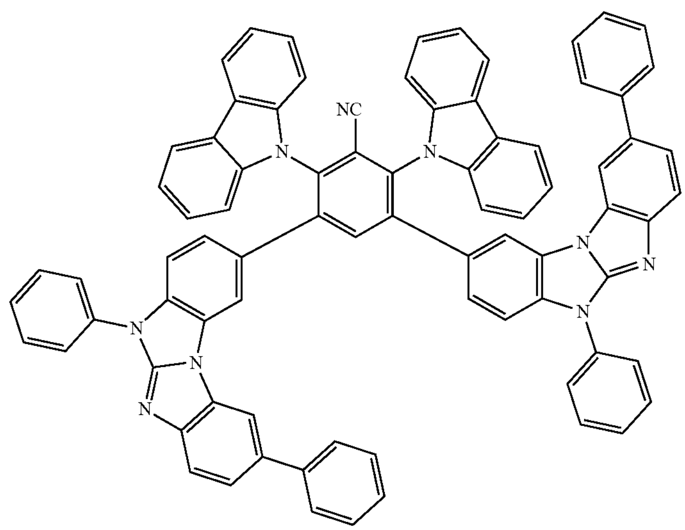
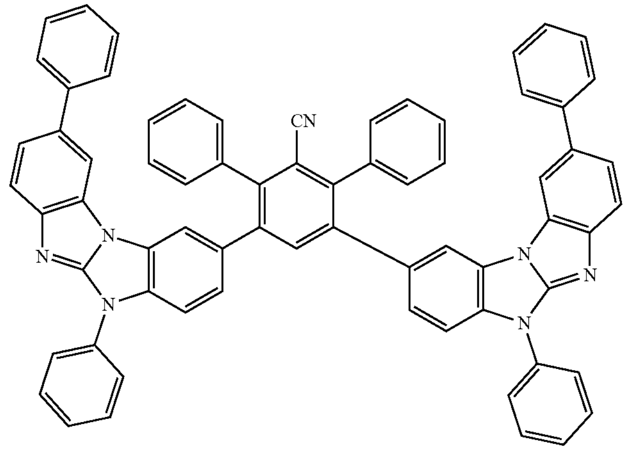

-continued
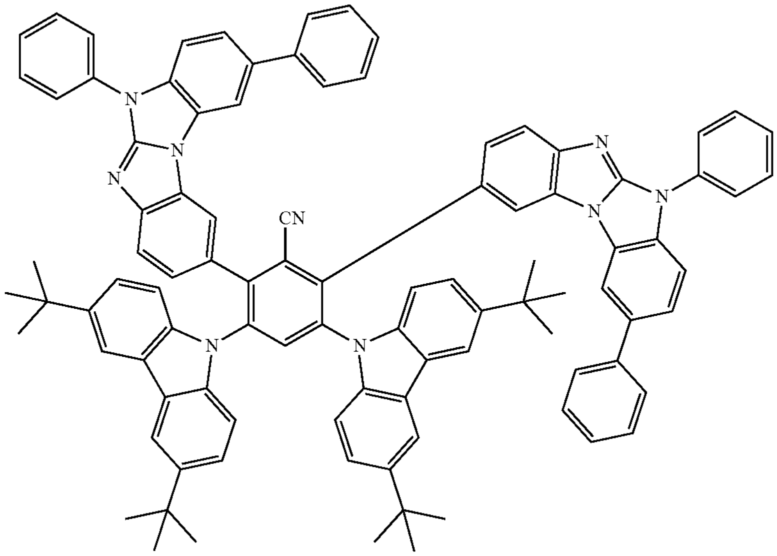
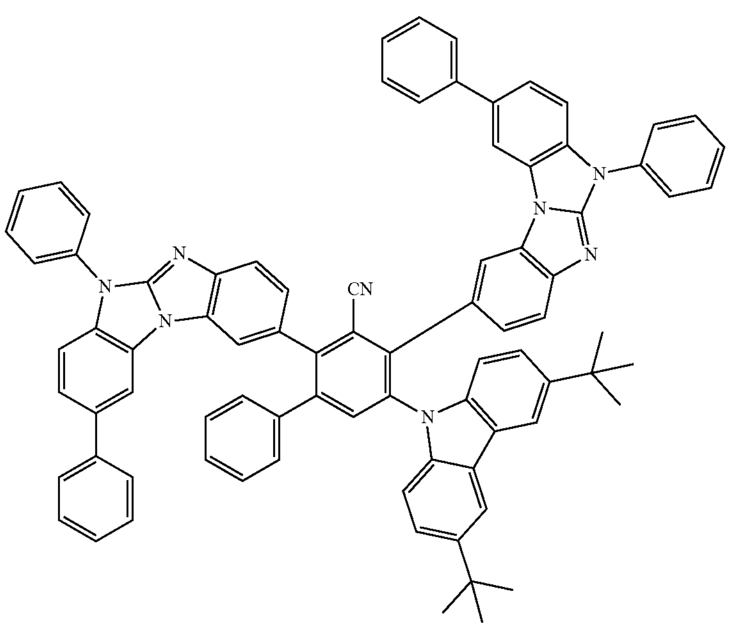

-continued
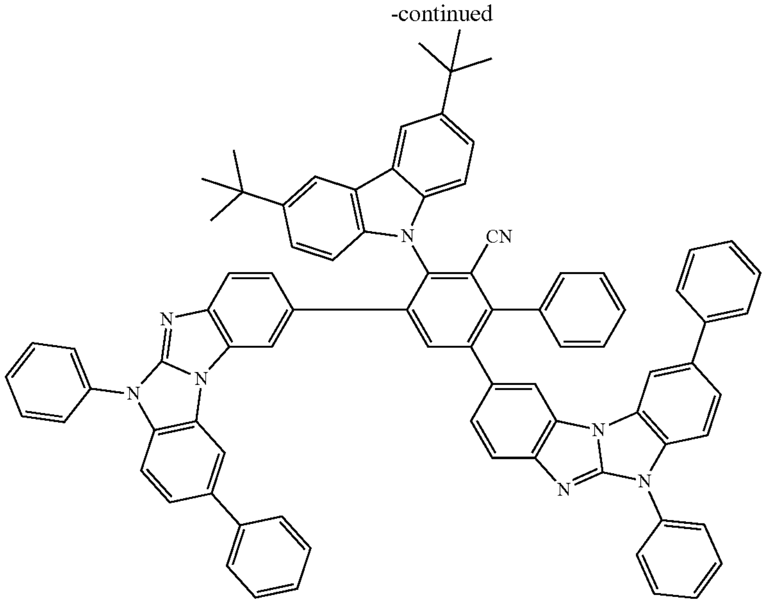
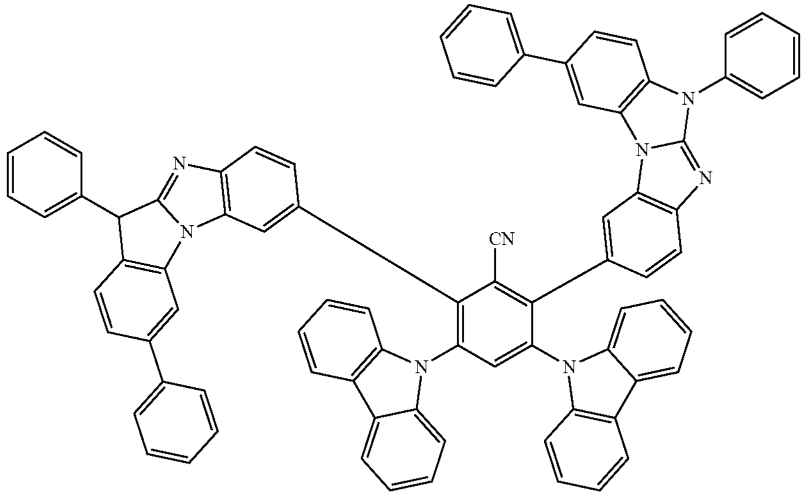
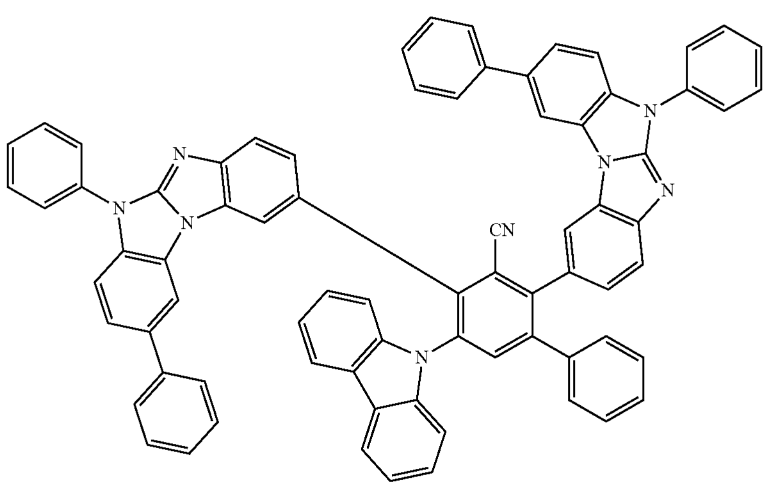

-continued
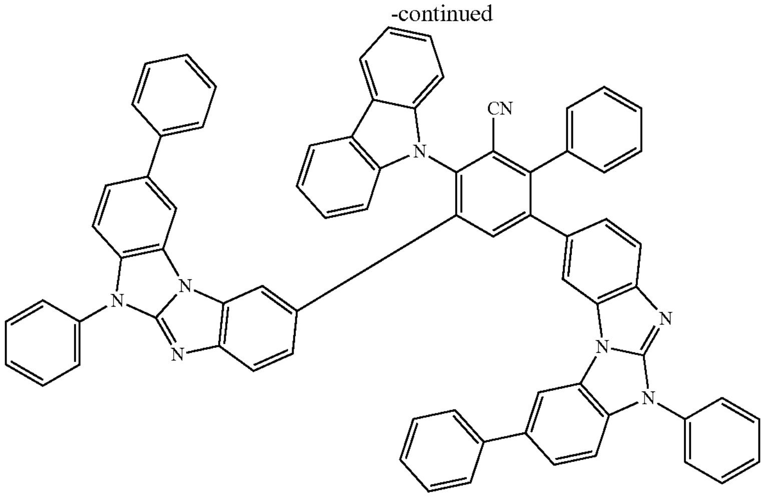
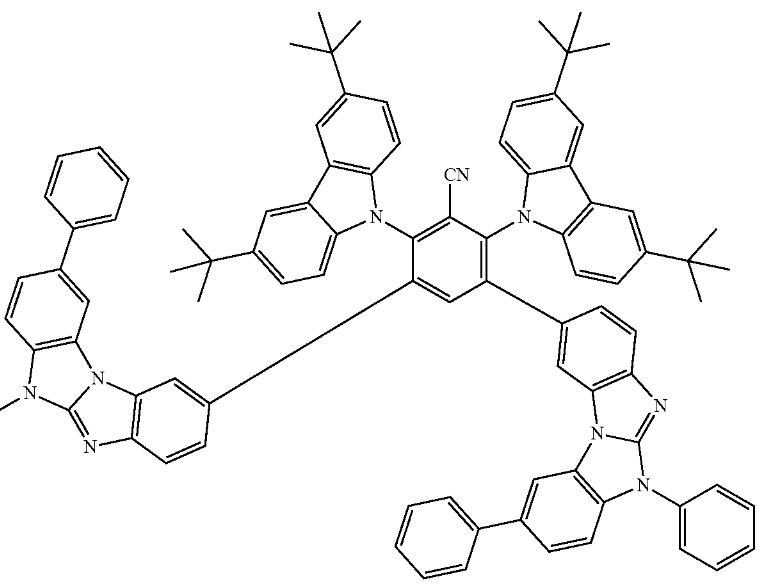
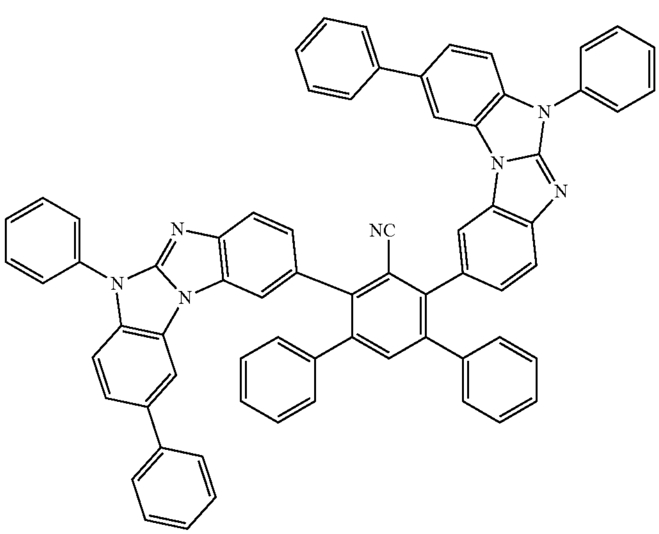

-continued
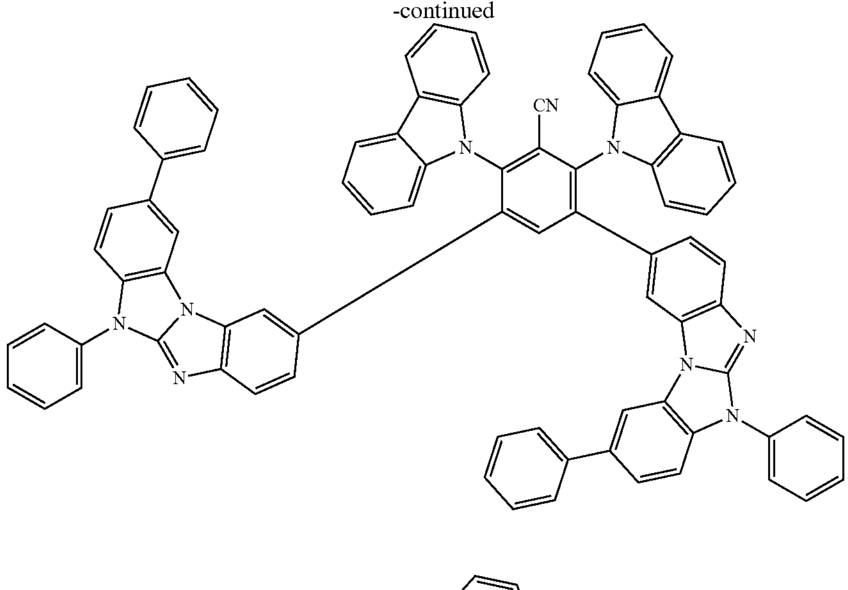
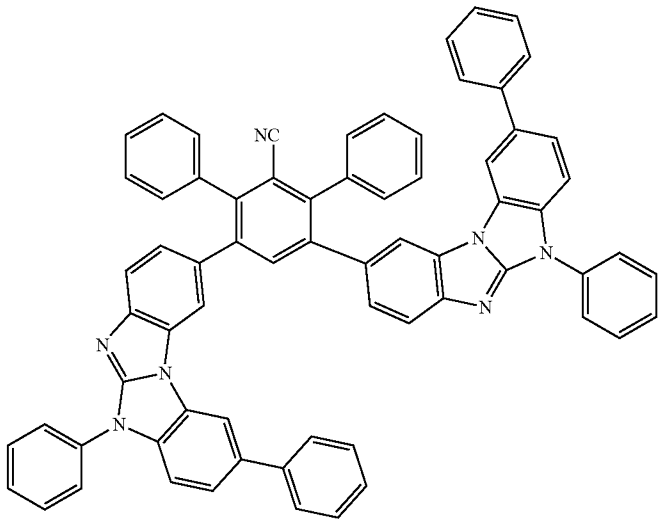
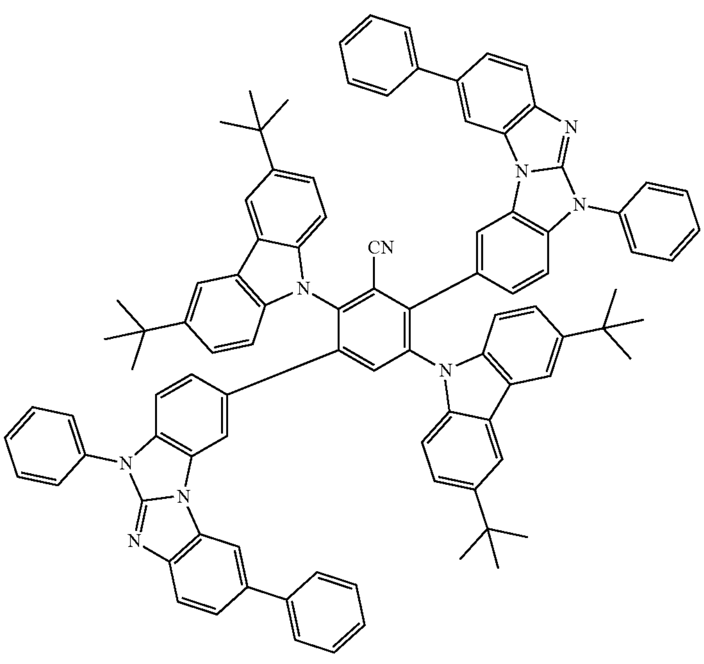

-continued
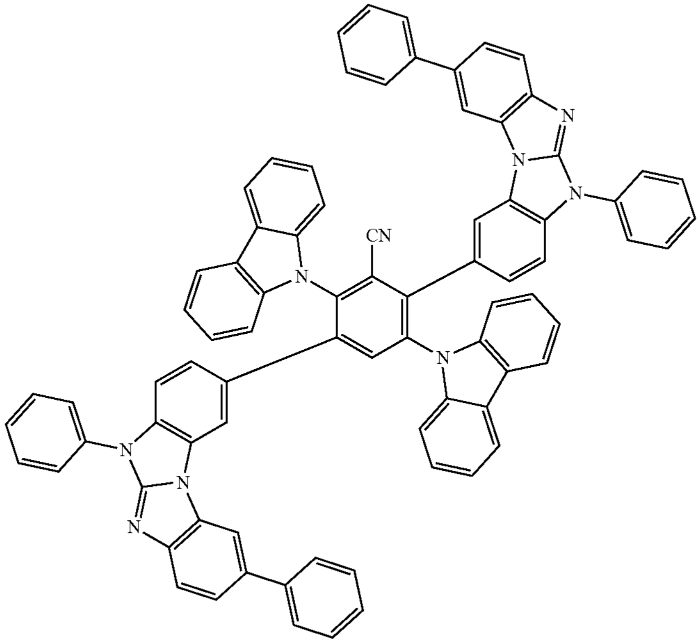
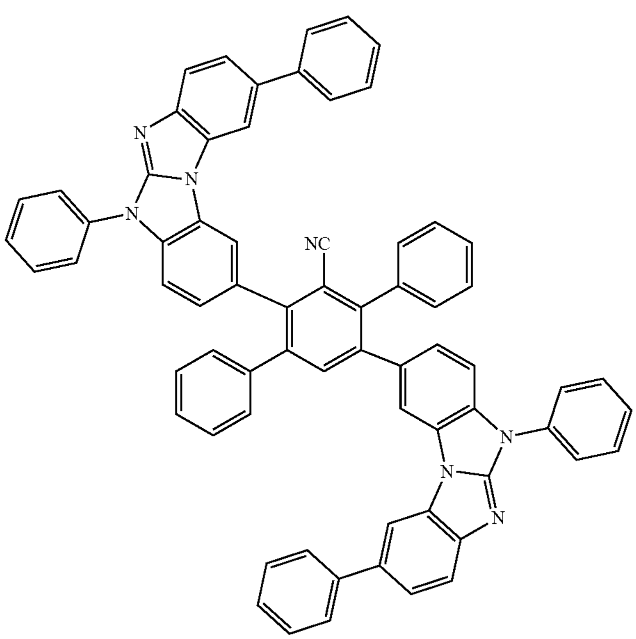

-continued
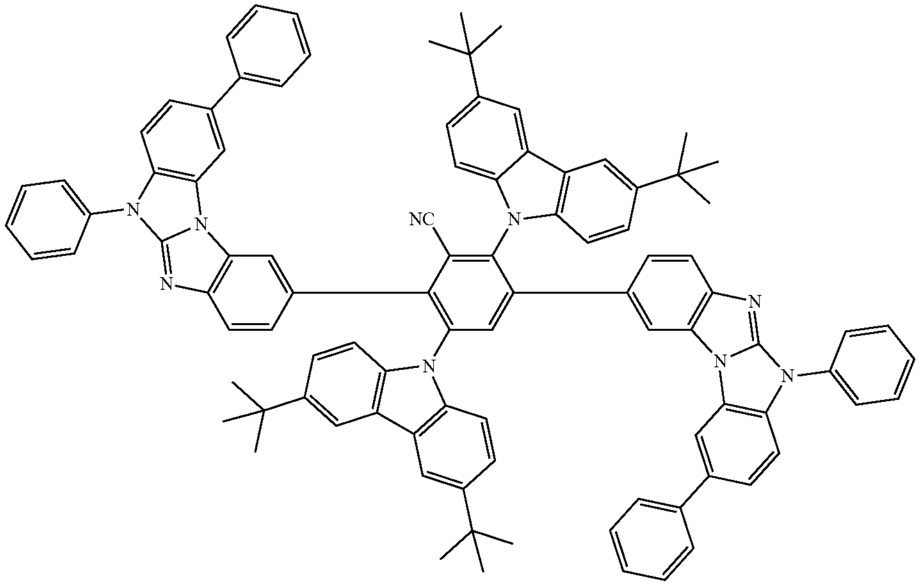
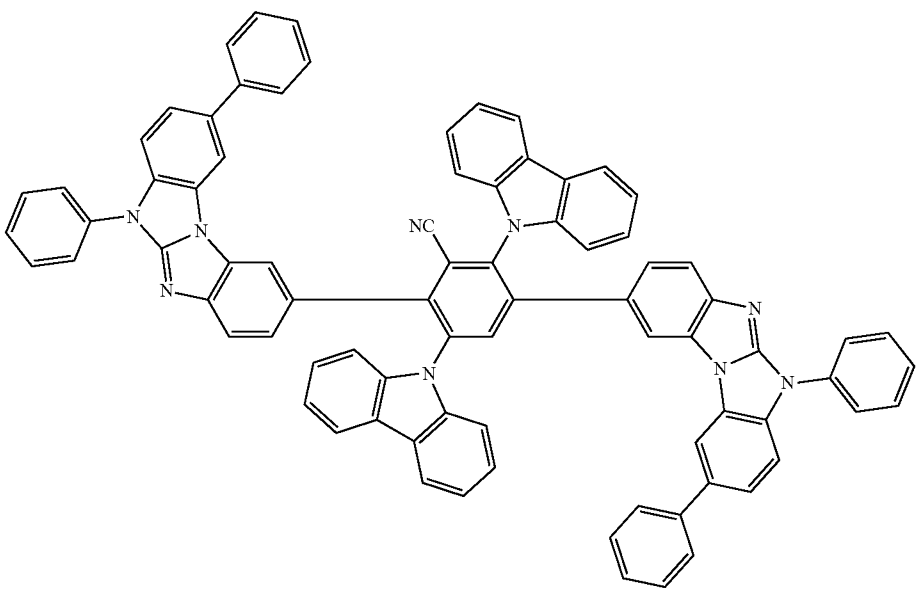

-continued
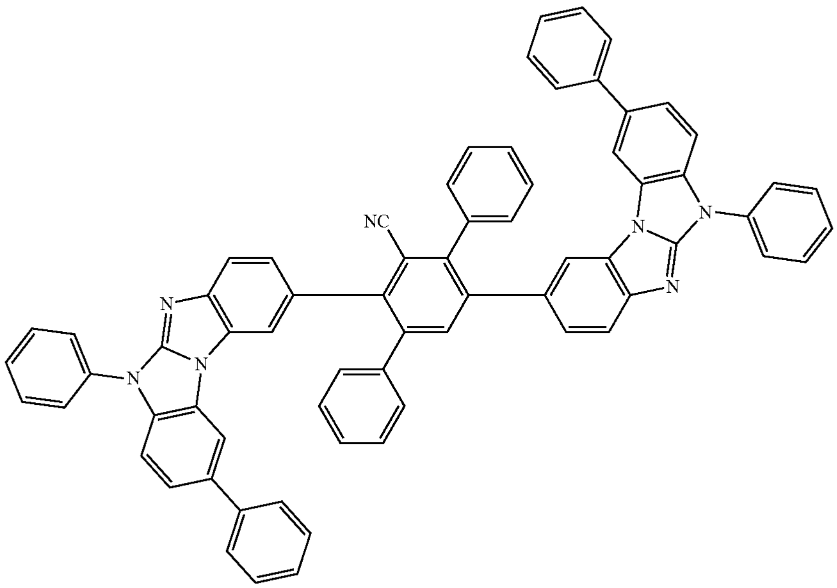
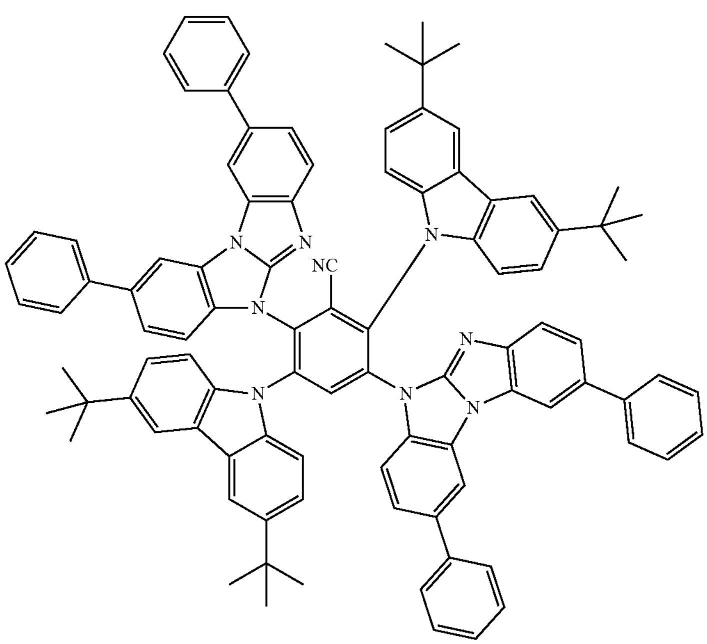

-continued
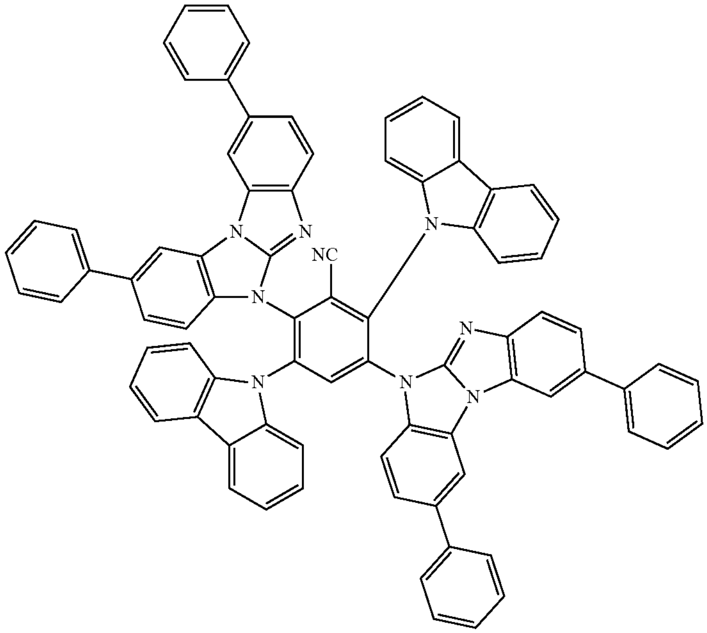
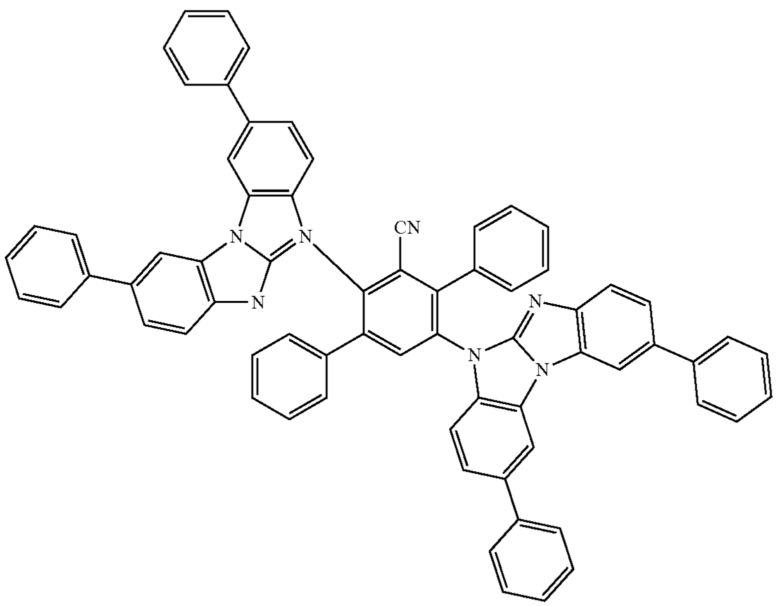
Group IX
1
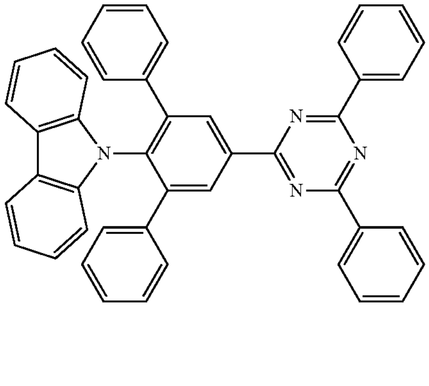
2
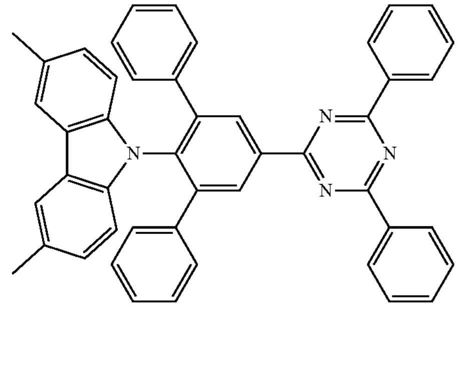

-continued
3
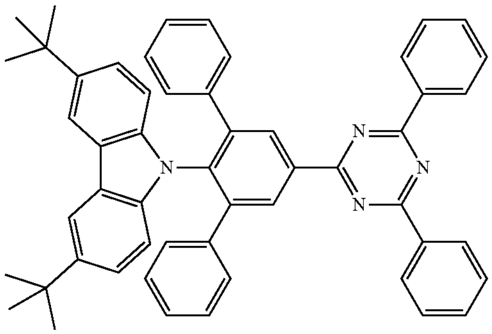
4
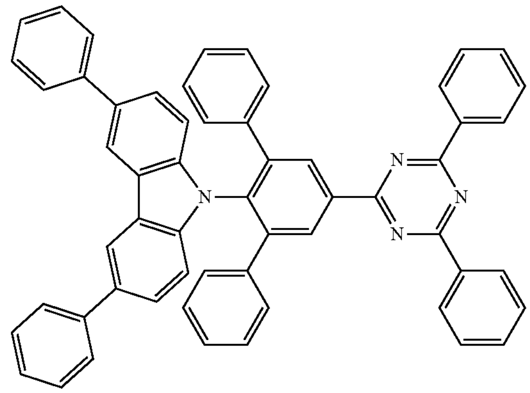
5
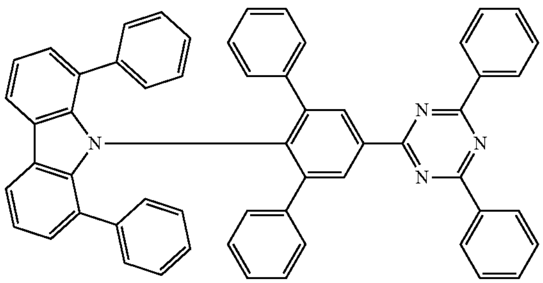
6
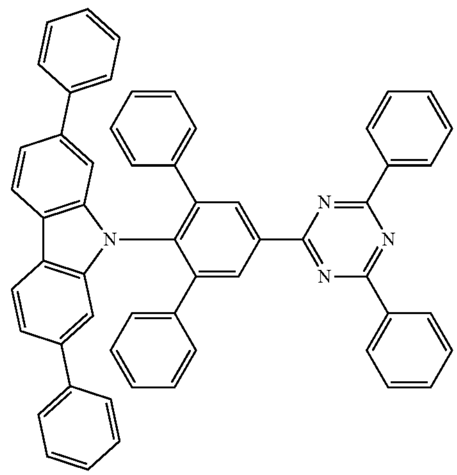
7
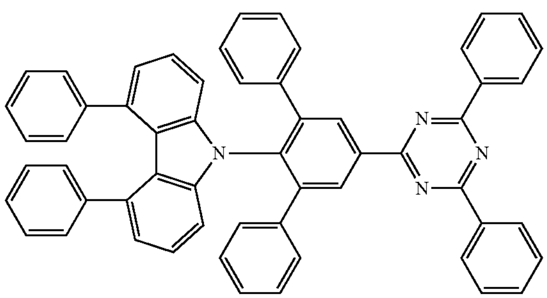
8
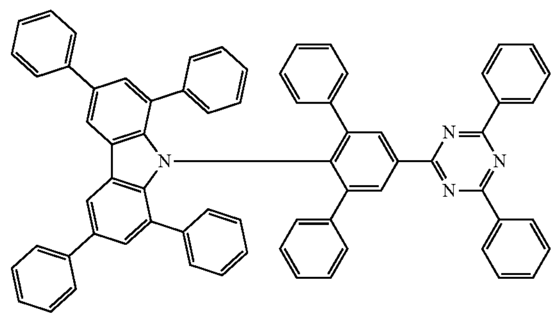
9
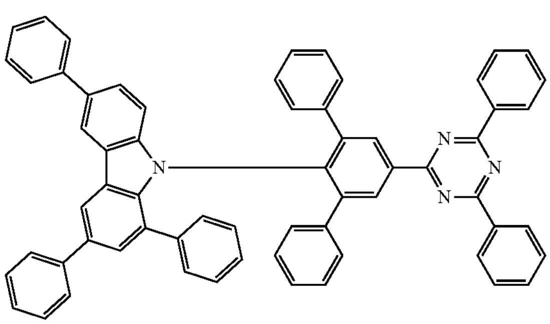
10
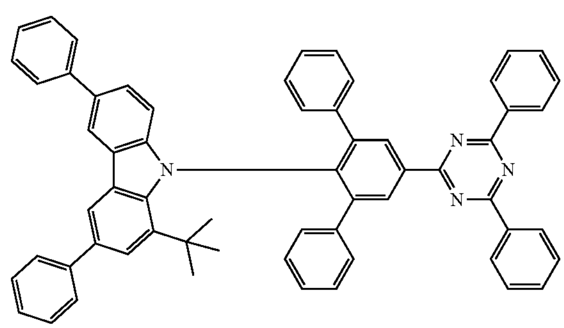

-continued
11
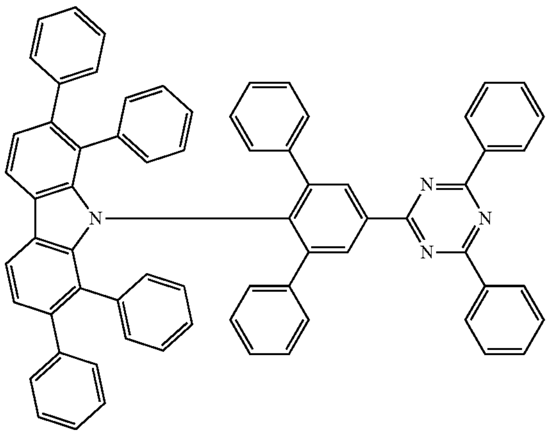
12
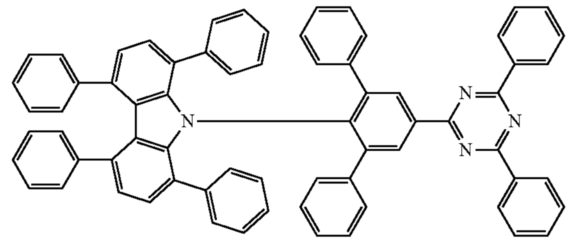
13
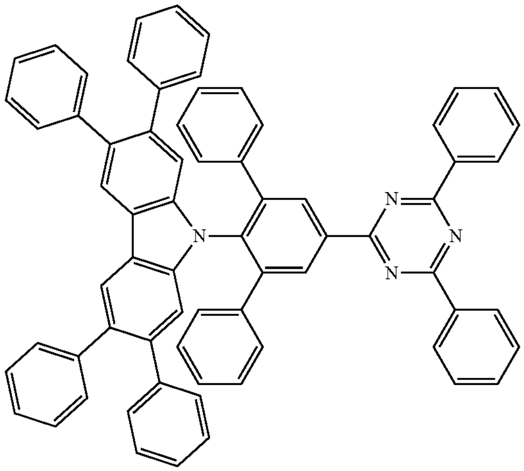
14
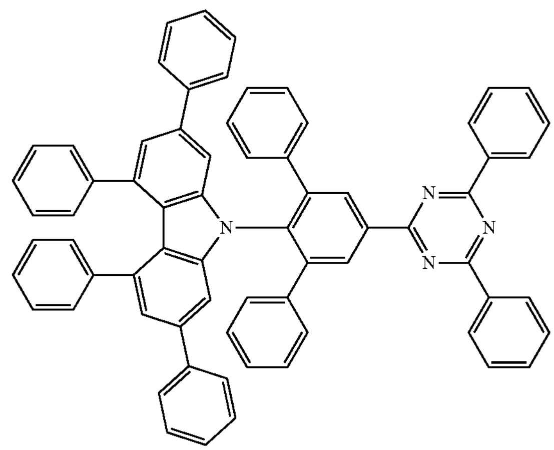
15
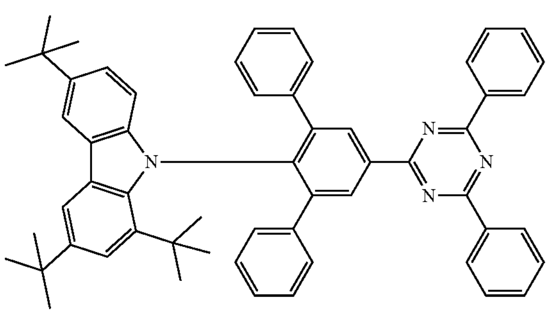
16
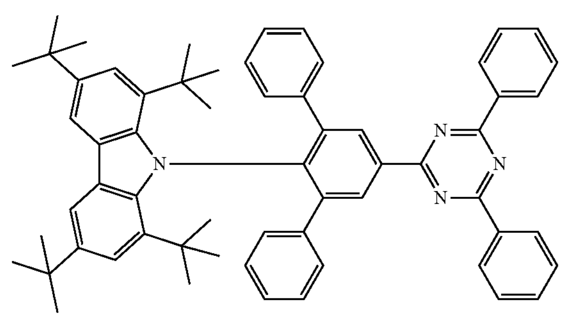
17
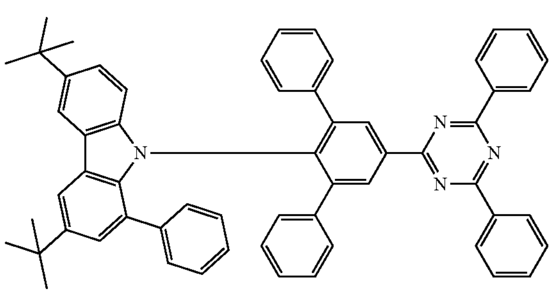
18
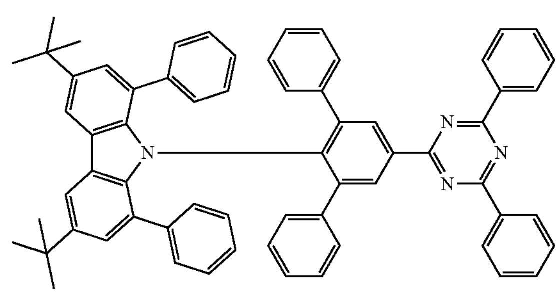

-continued
19
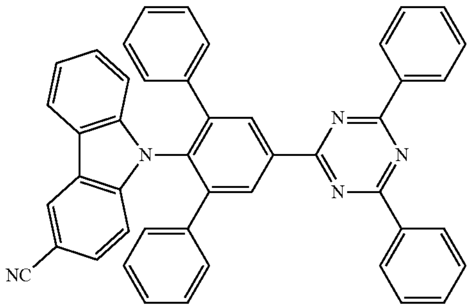
20
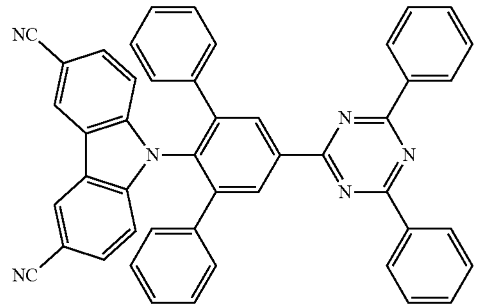
21
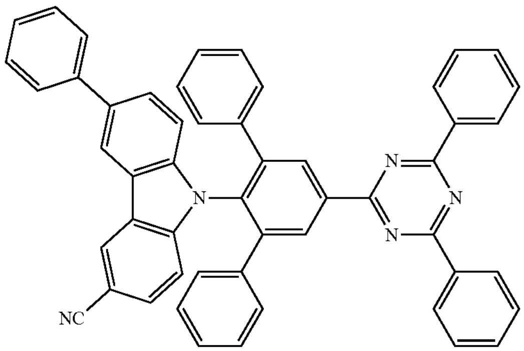
22
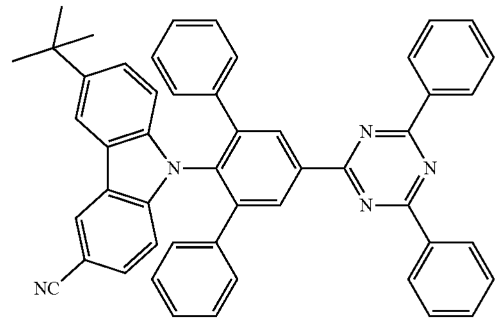
23
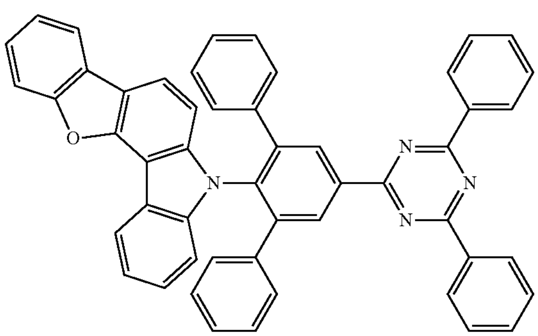
24
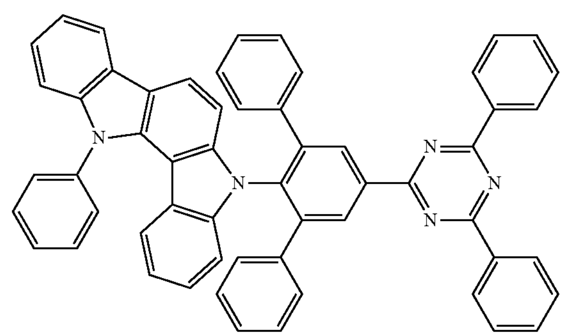
25
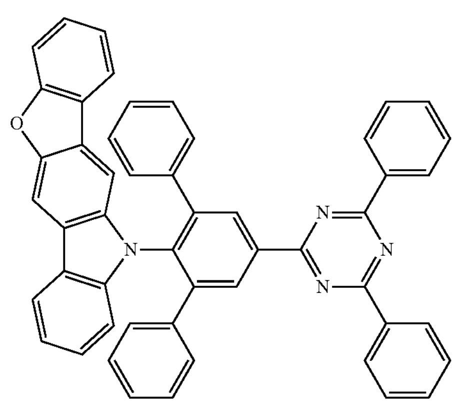
26
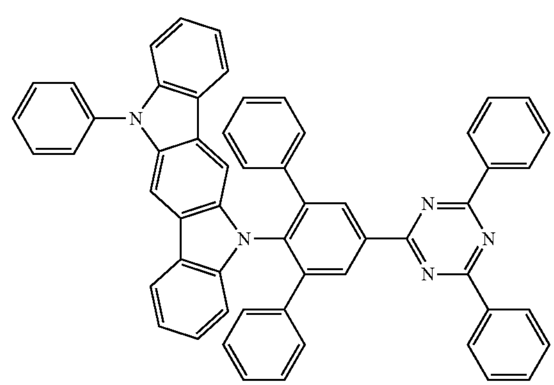

-continued
27
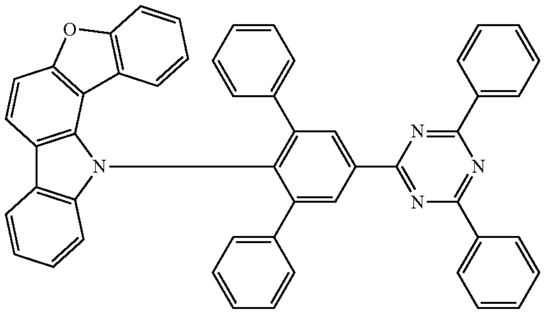
28
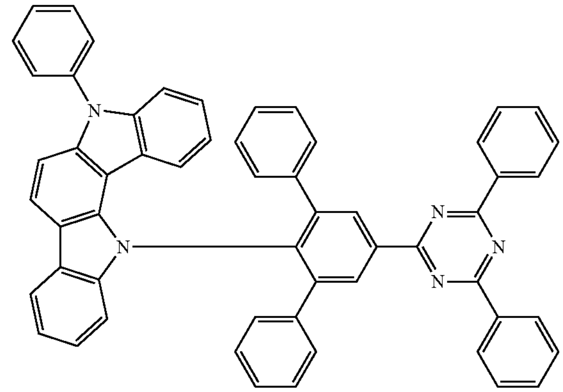
29
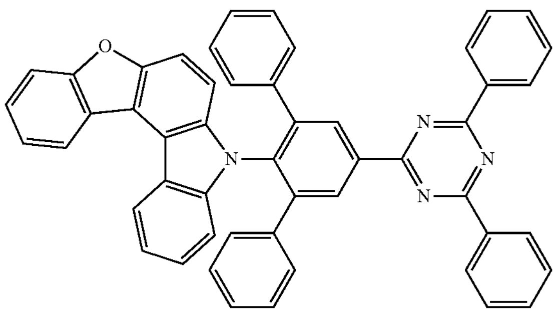
30
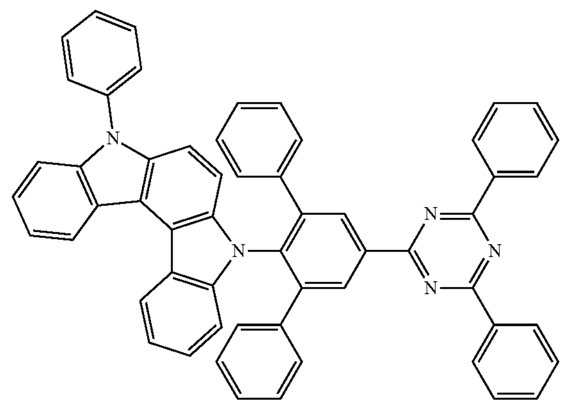
31
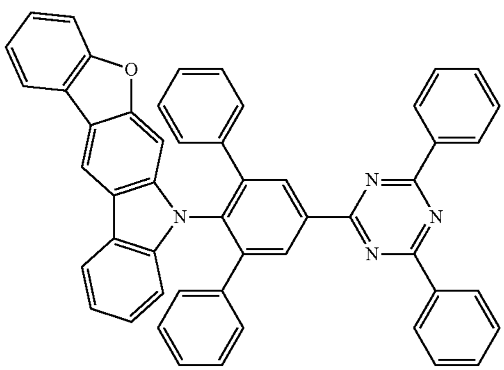
32
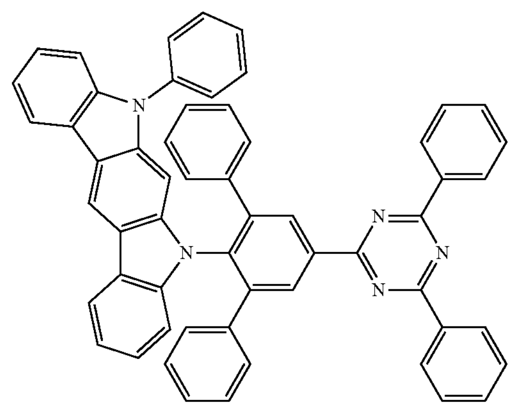
33
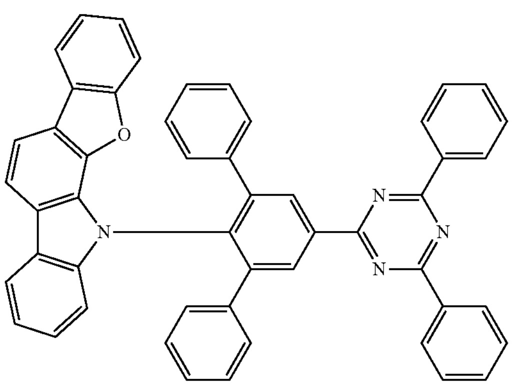
34
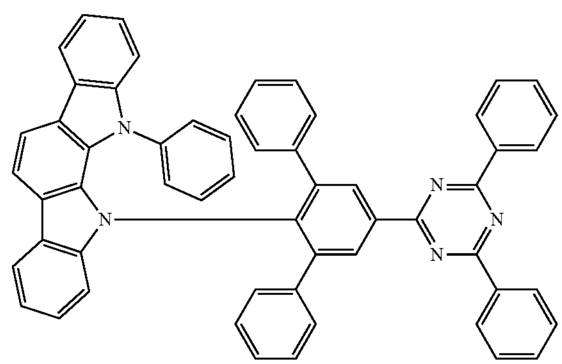

-continued
35
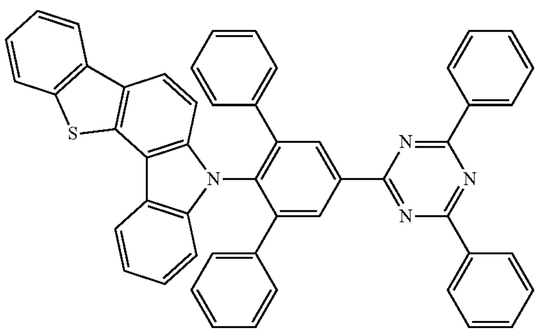
36
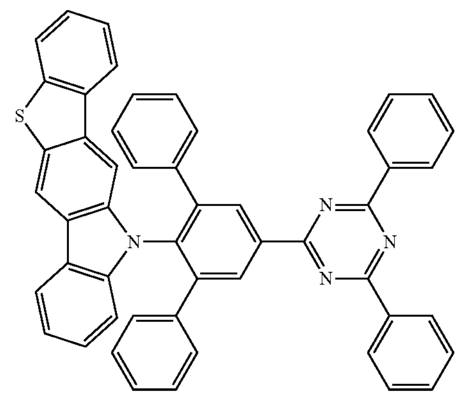
37
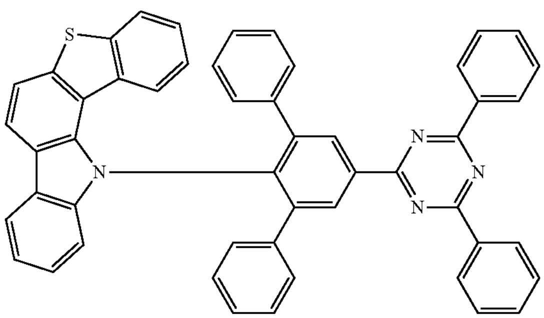
38
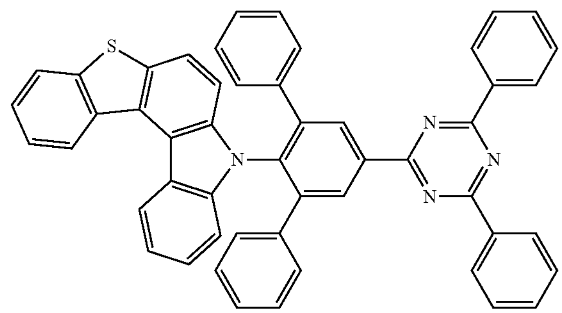
39
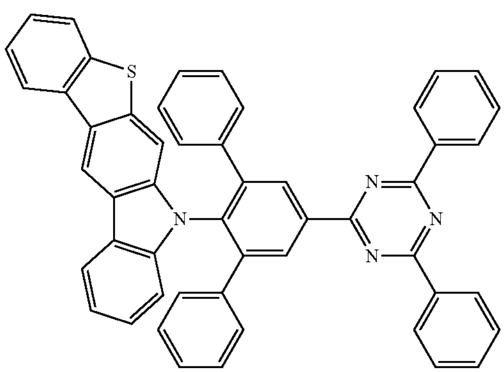
40
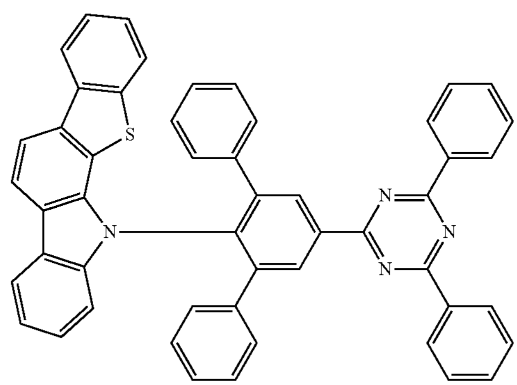
41
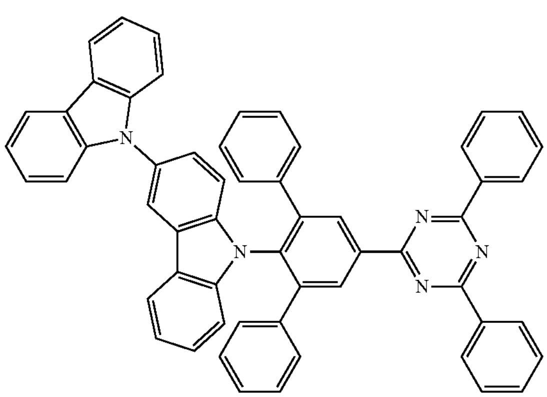
42
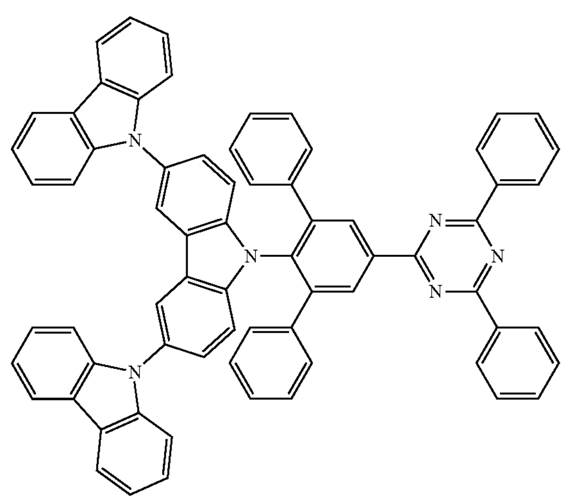

-continued
43
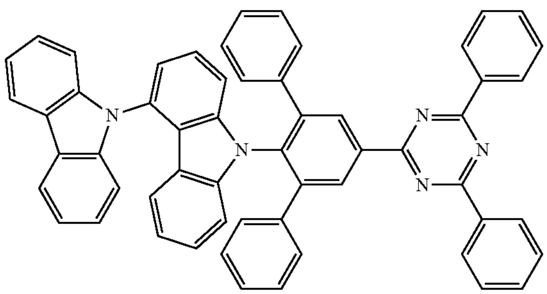
44
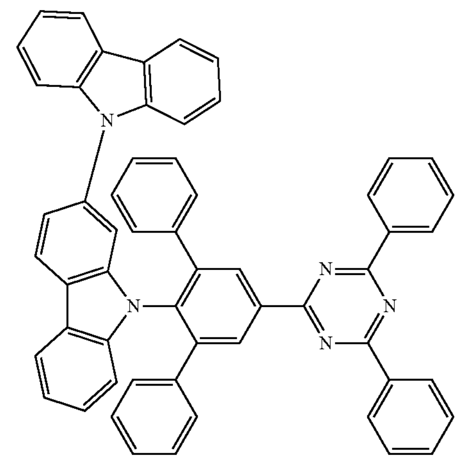
45
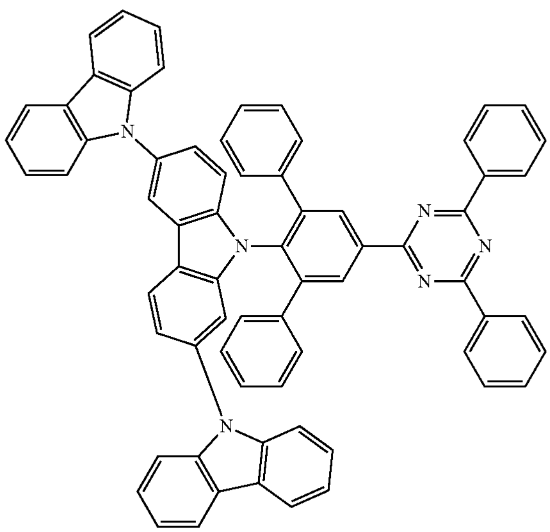
46
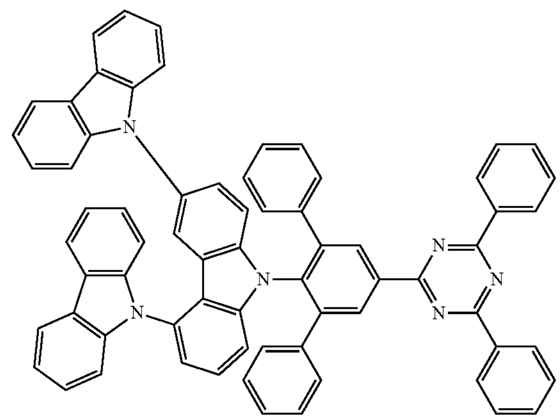
47
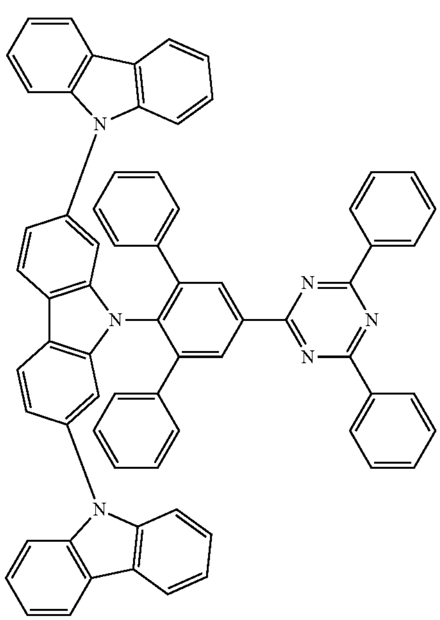
48
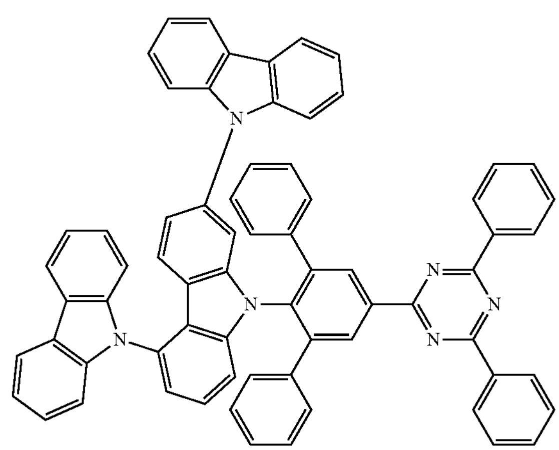

-continued
49
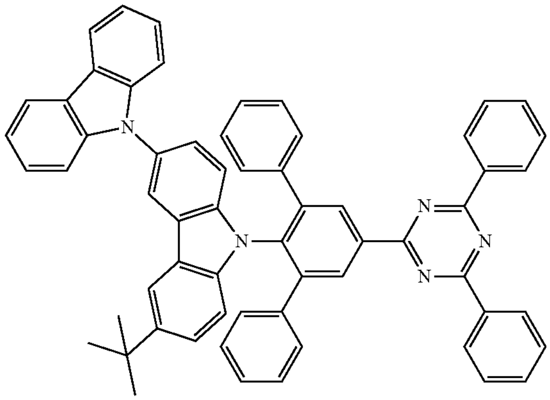
50
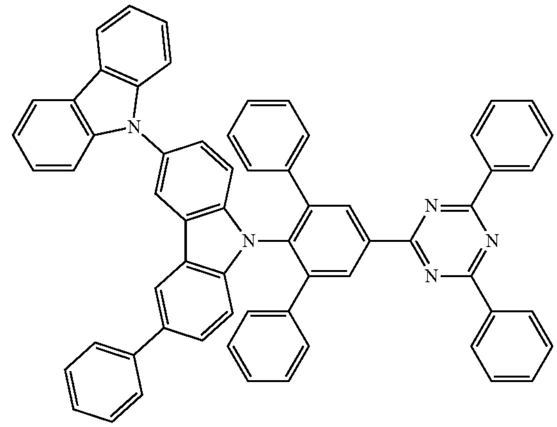
51
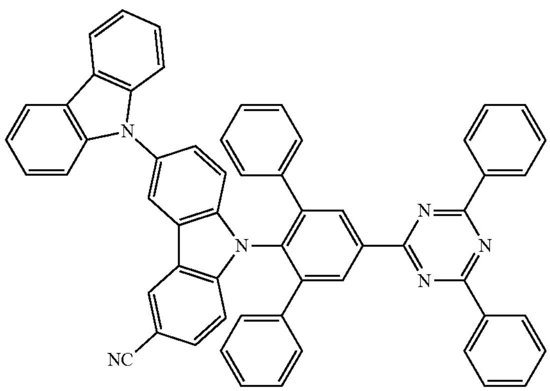
52
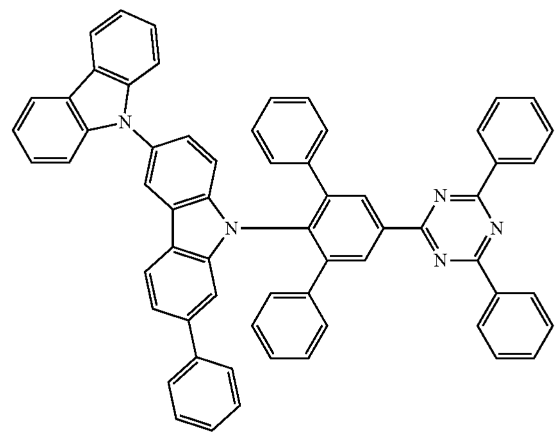
53
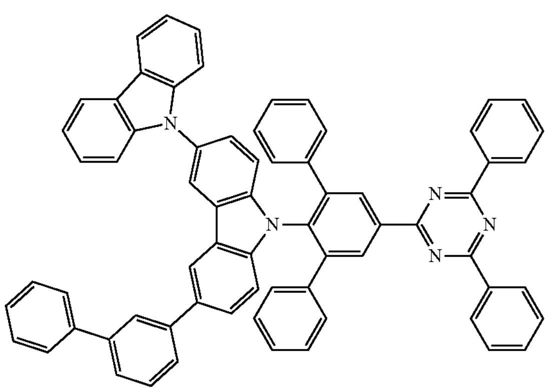
54
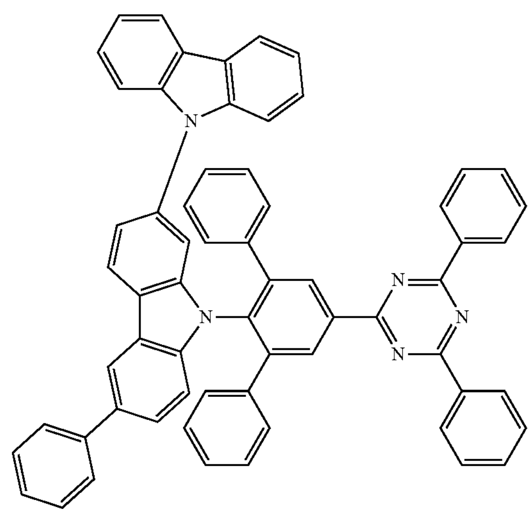

-continued
55
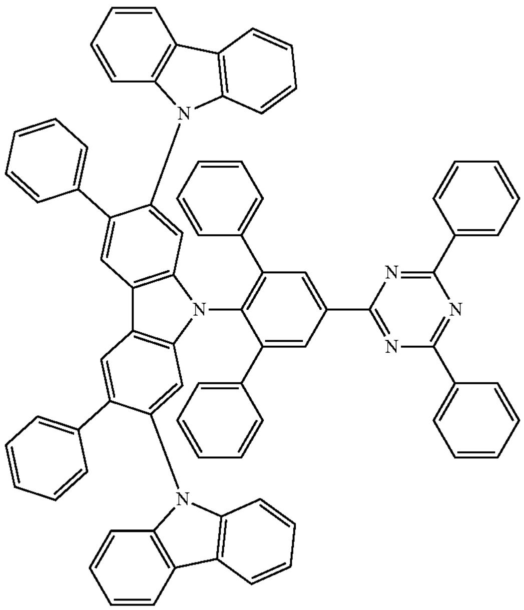
56
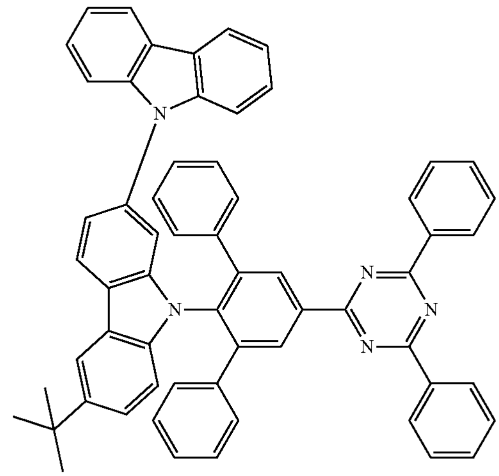
57
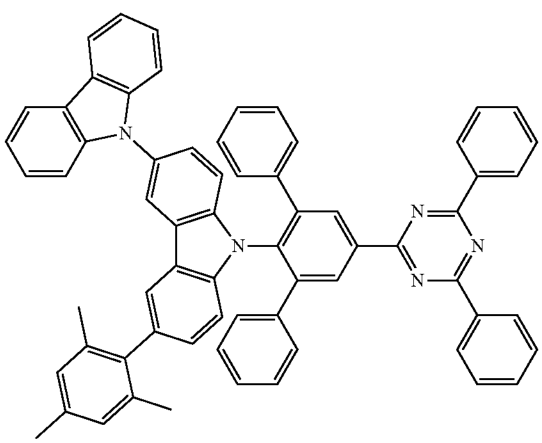
58
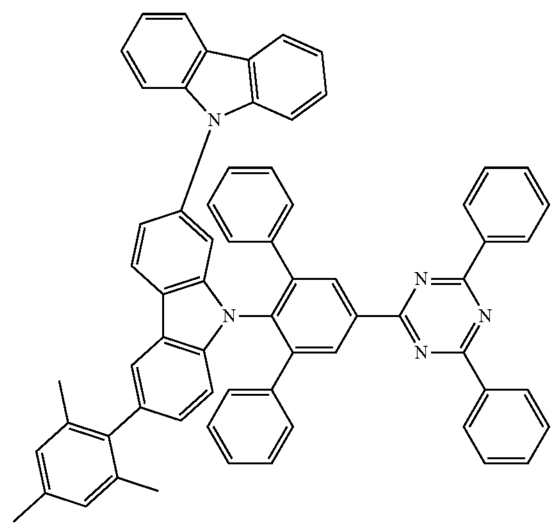
59
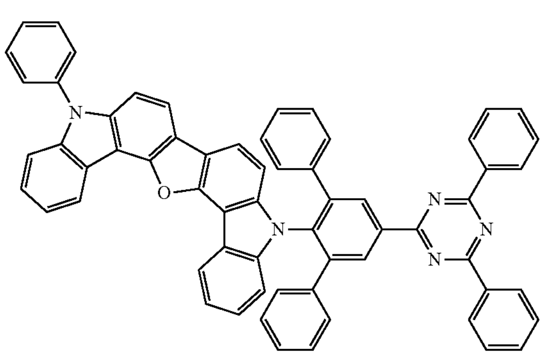
60
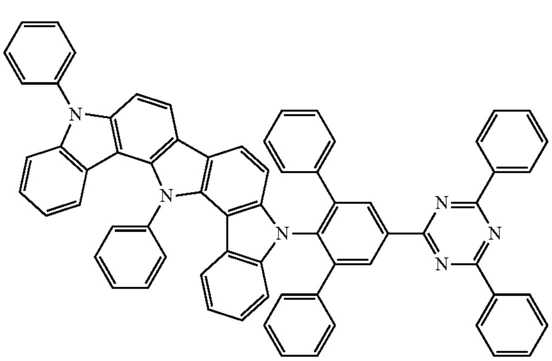

-continued
61
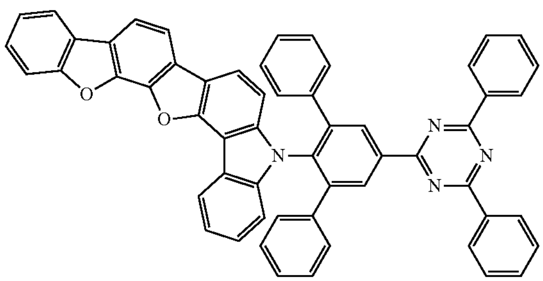
62
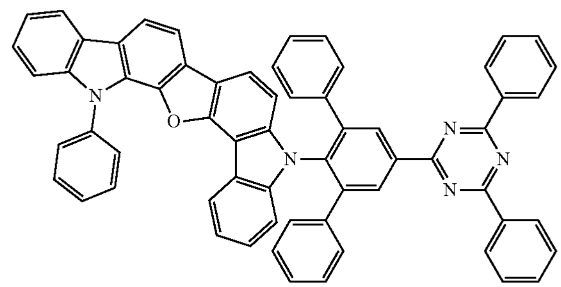
63
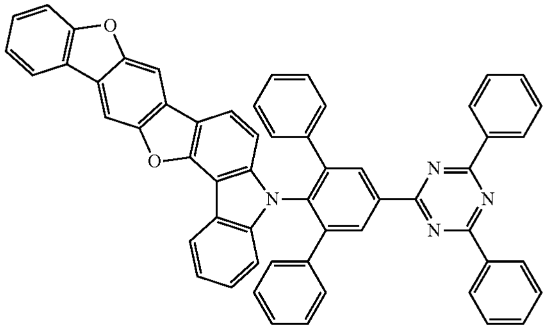
64
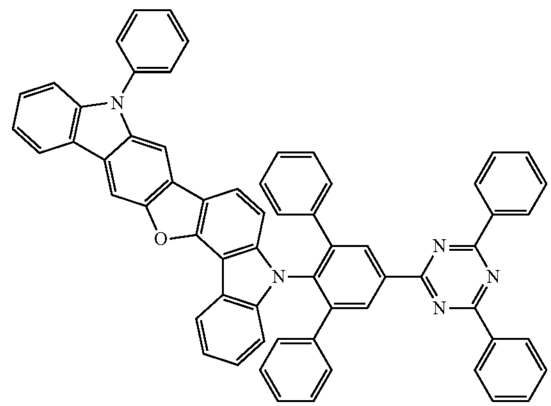
65
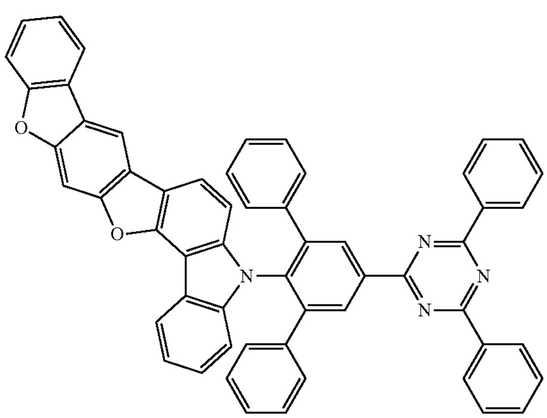
66
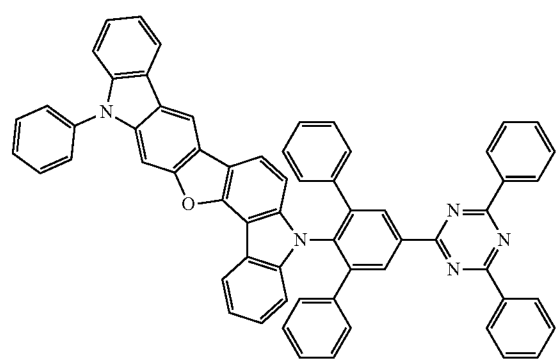
67
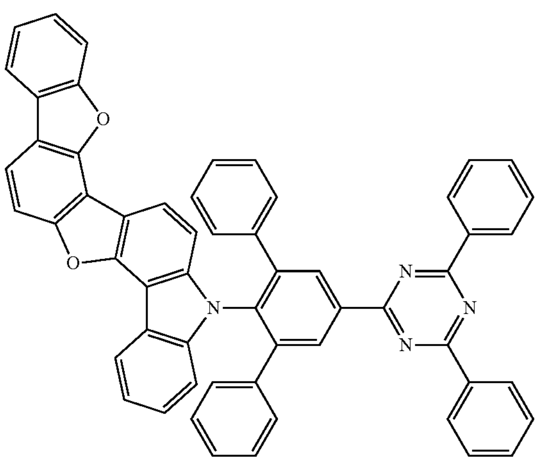
68
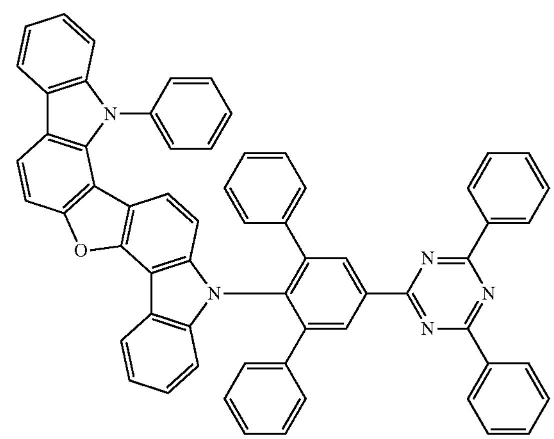

-continued
69
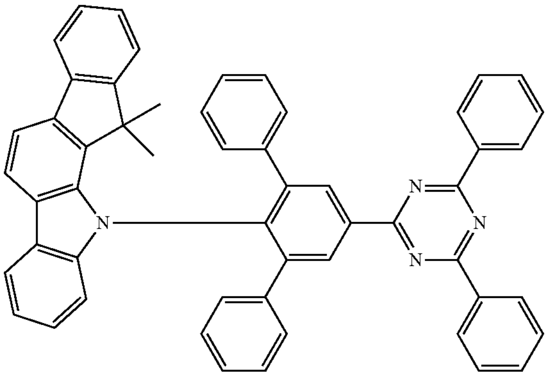
70
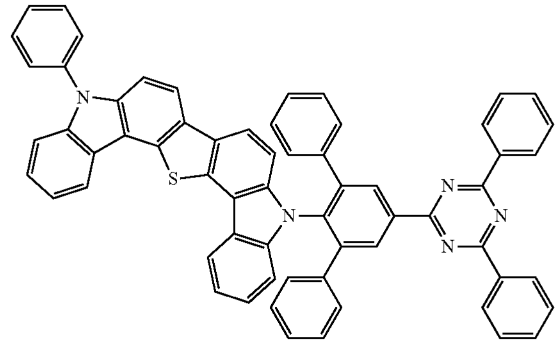
71
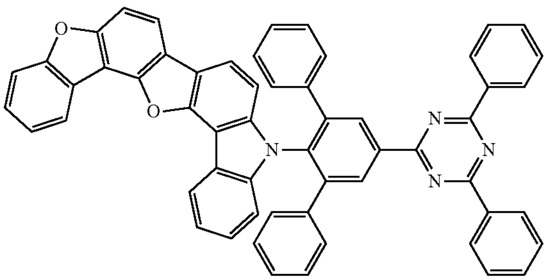
72
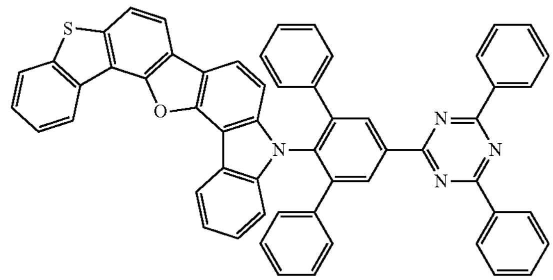
73
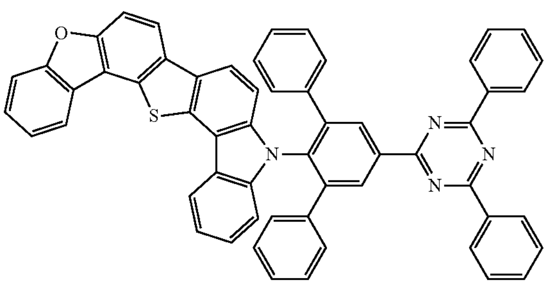
74
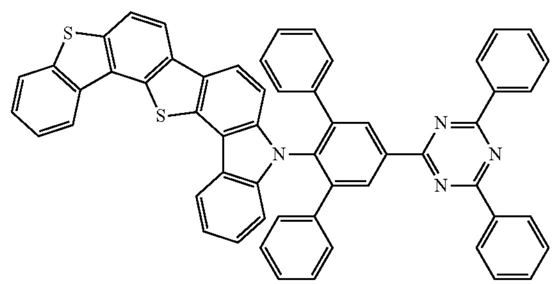
75
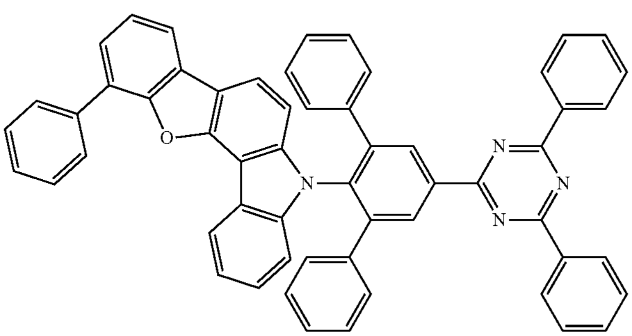
76
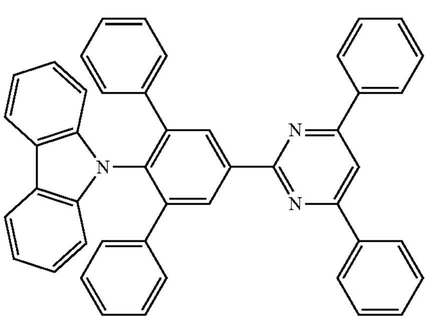
77
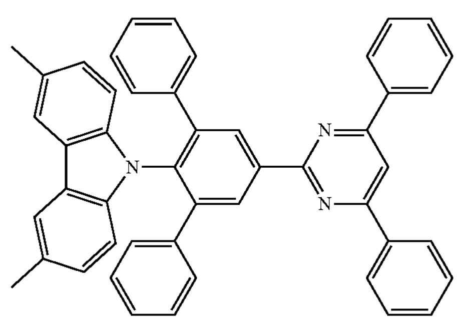

-continued
78
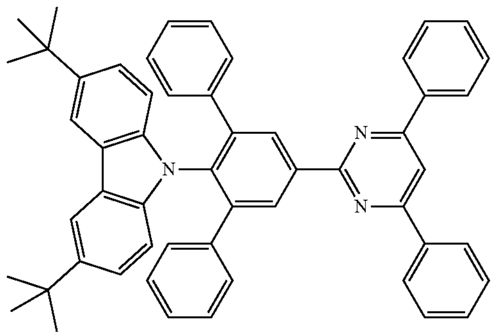
79
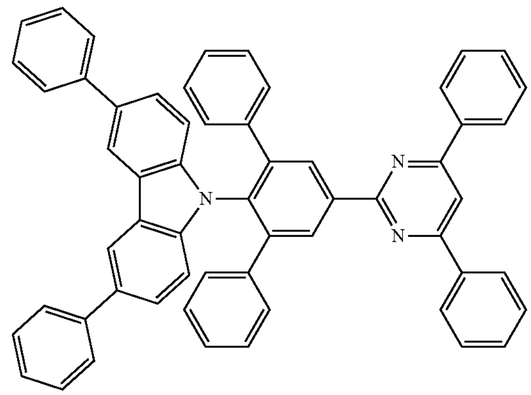
80
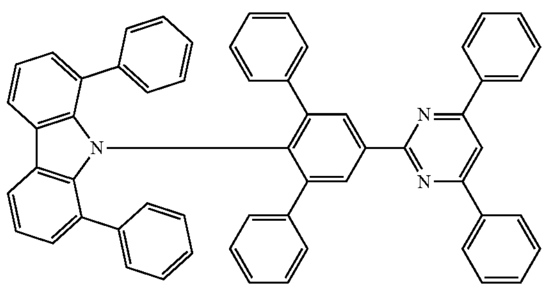
81
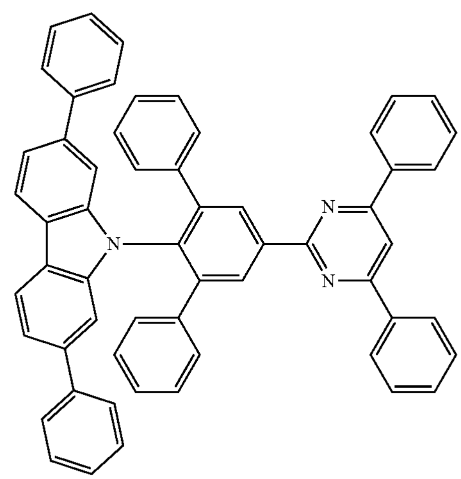
82
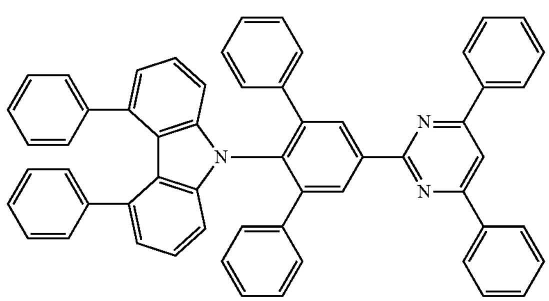
83
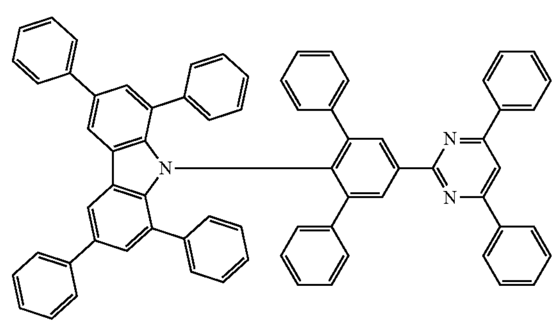
84
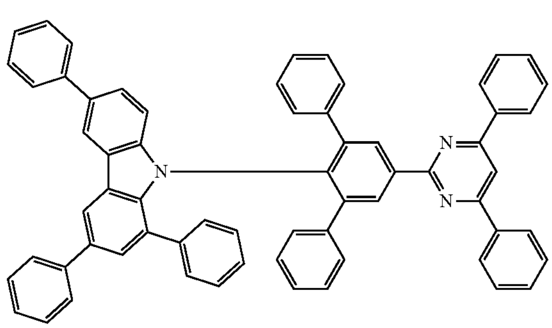
85
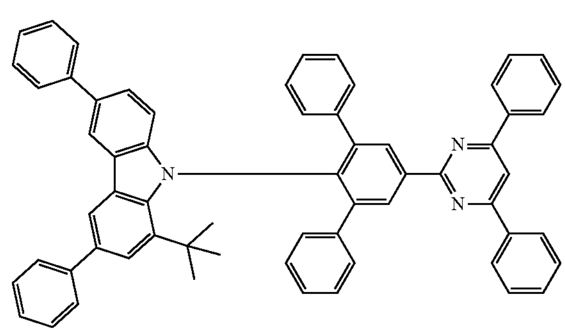

-continued
86
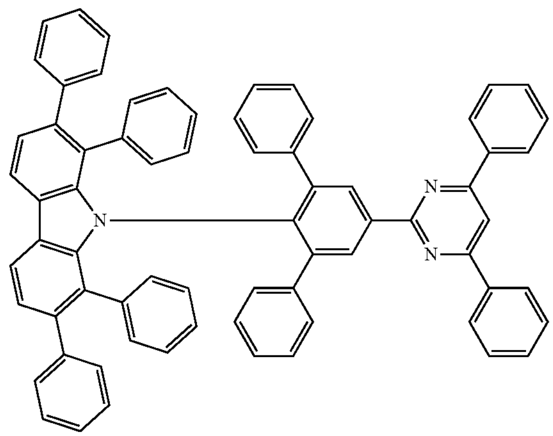
87
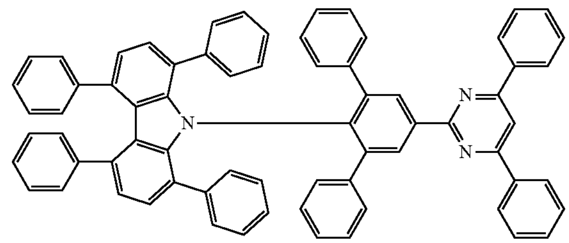
88
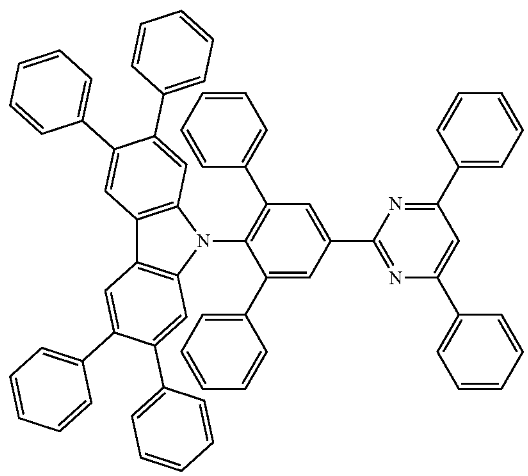
89
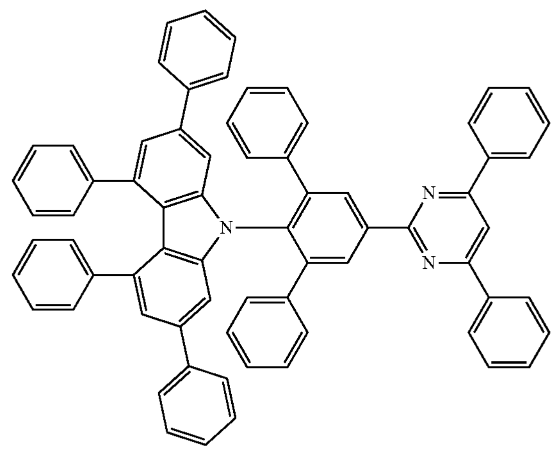
90
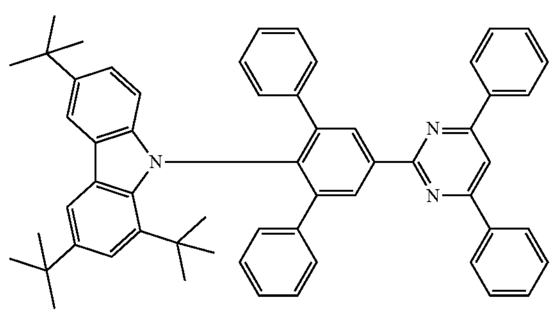
91
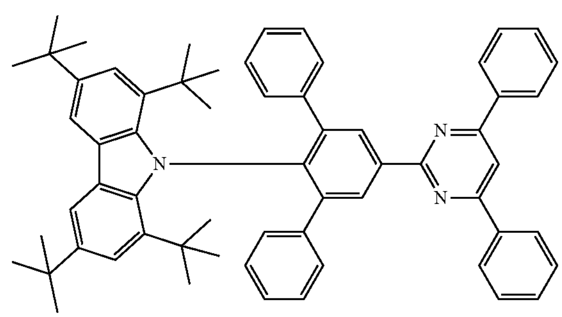
92
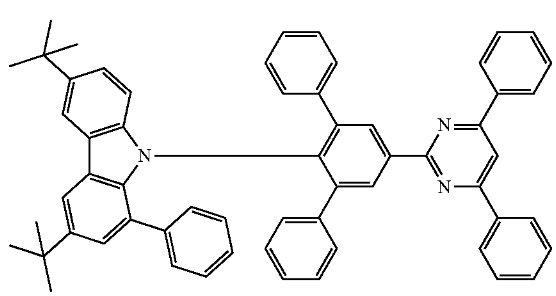
93
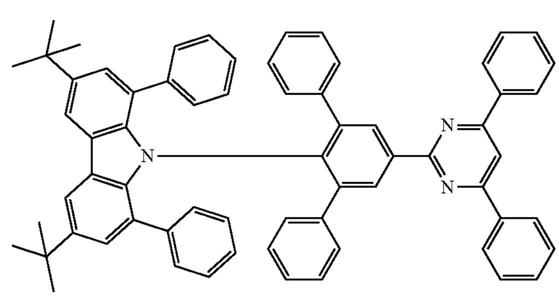

-continued
94
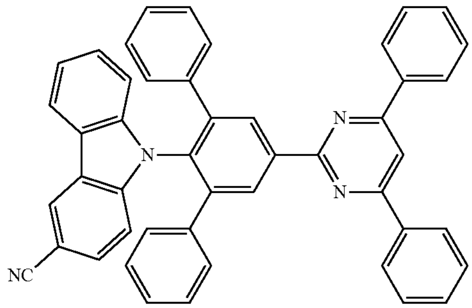
95
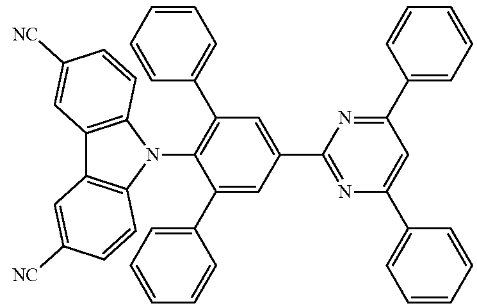
96
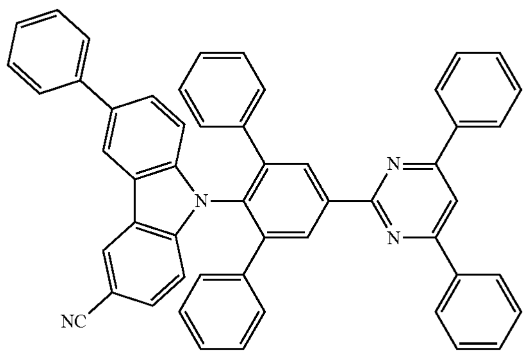
97
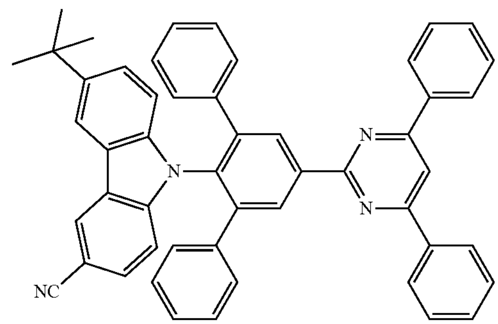
98
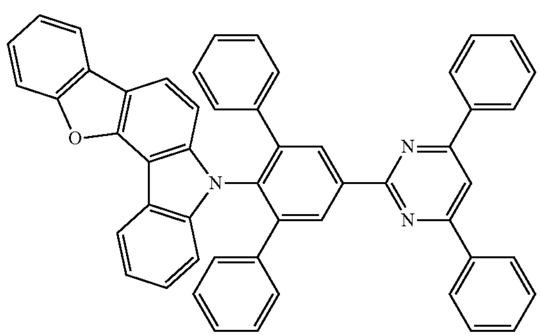
99
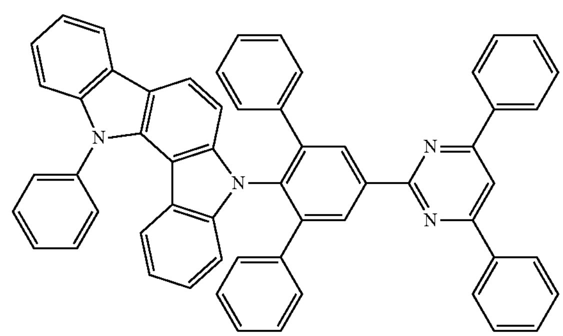
100
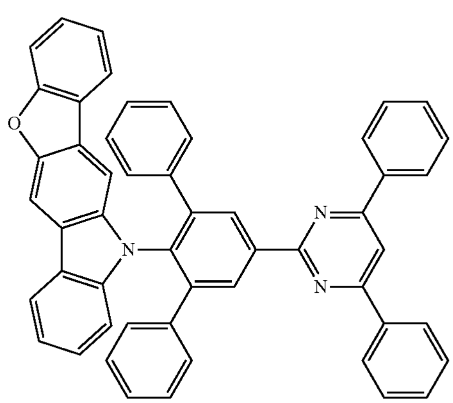
101
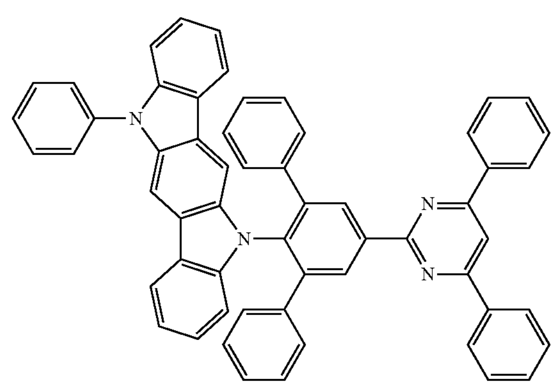

-continued
102
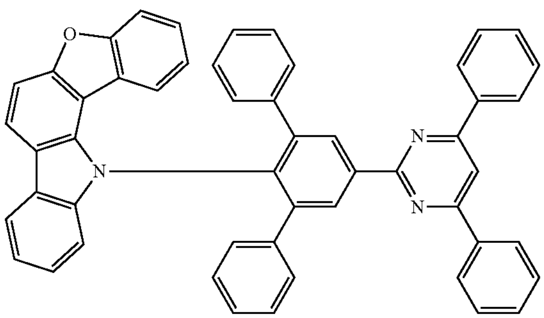
103
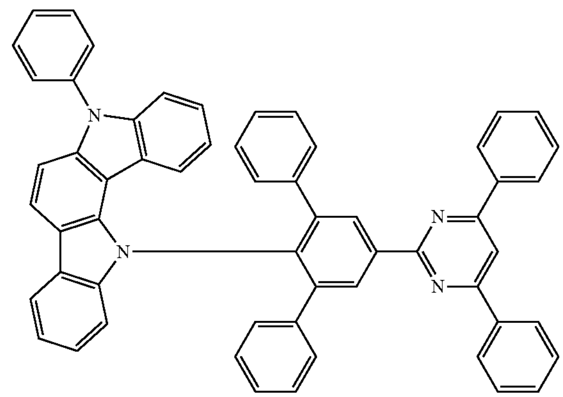
104
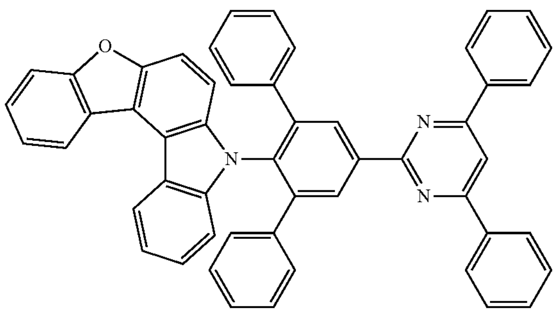
105
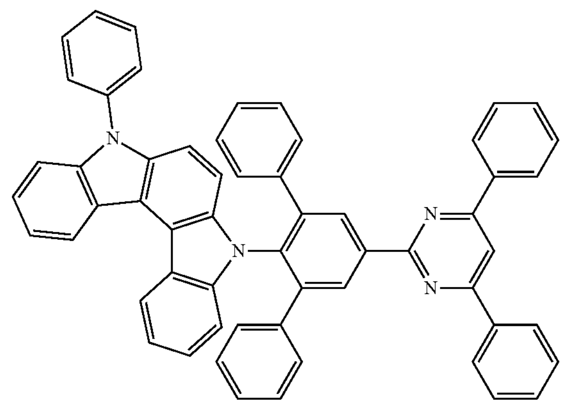
106
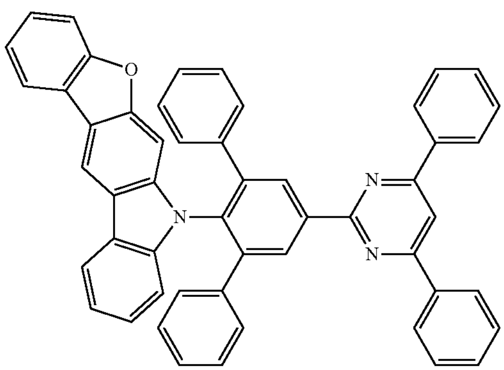
107
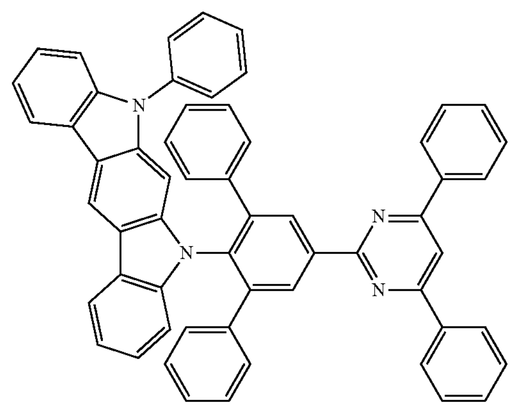
108
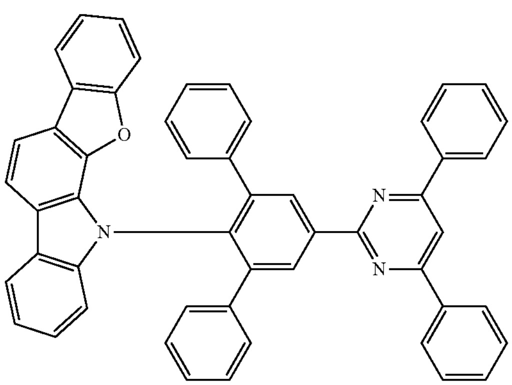
109
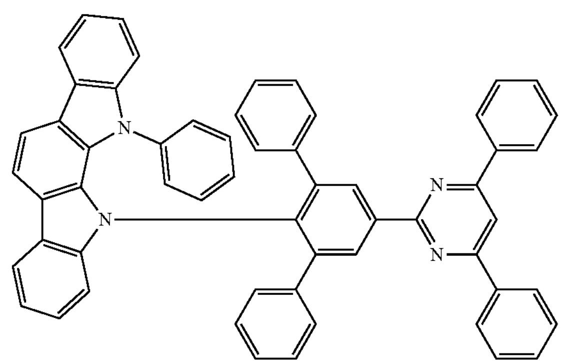

-continued
110
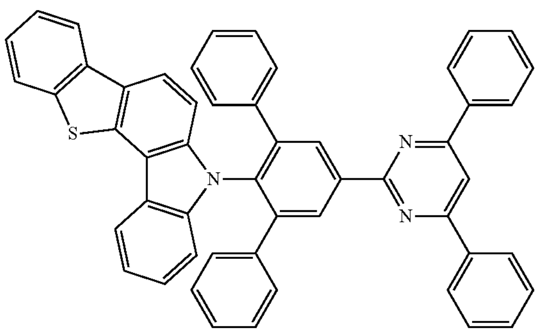
111
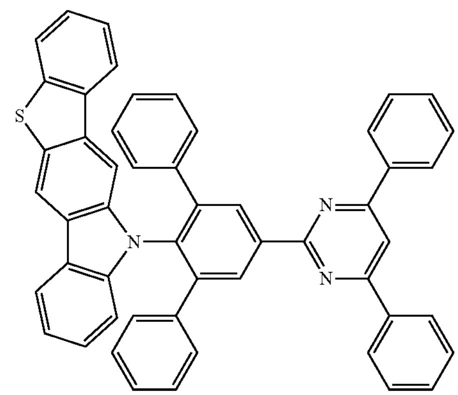
112
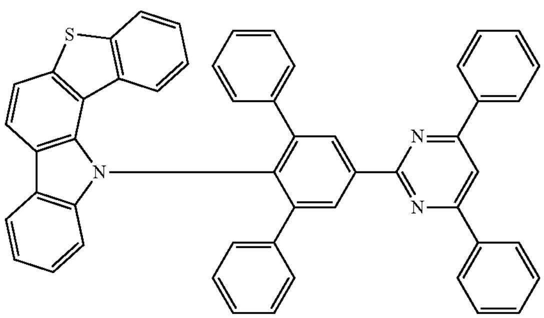
113
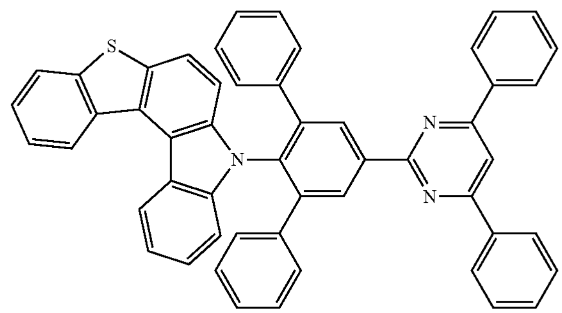
114
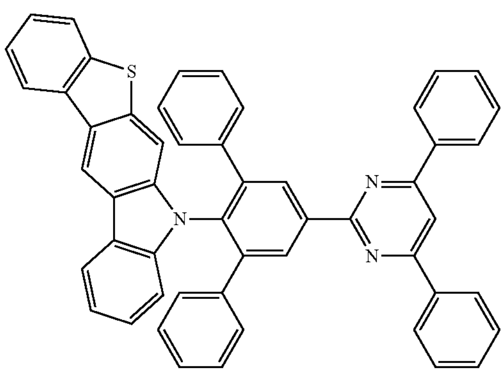
115
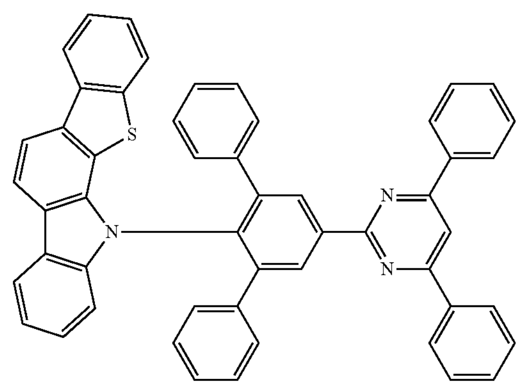
116
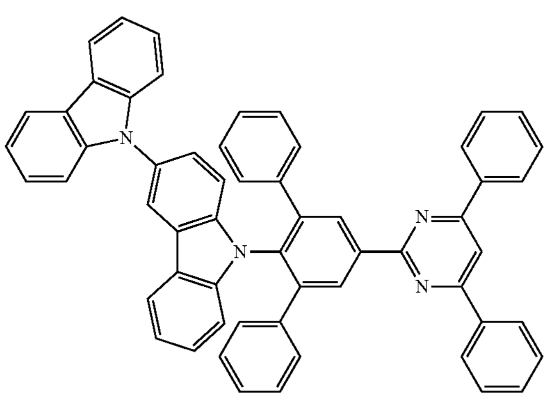
117
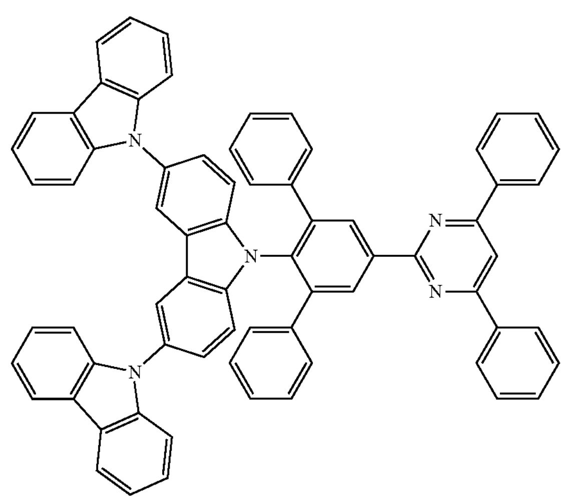

-continued
118
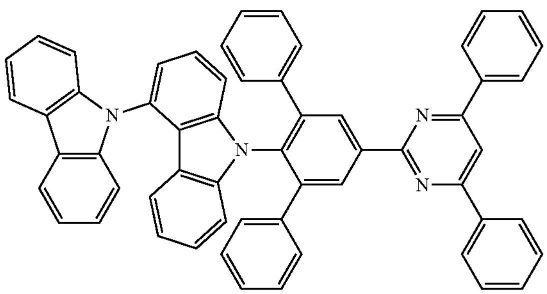
119
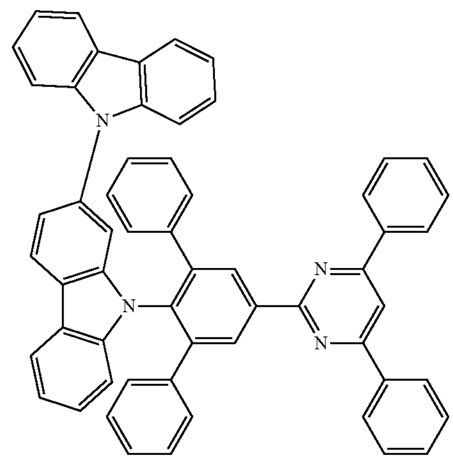
120
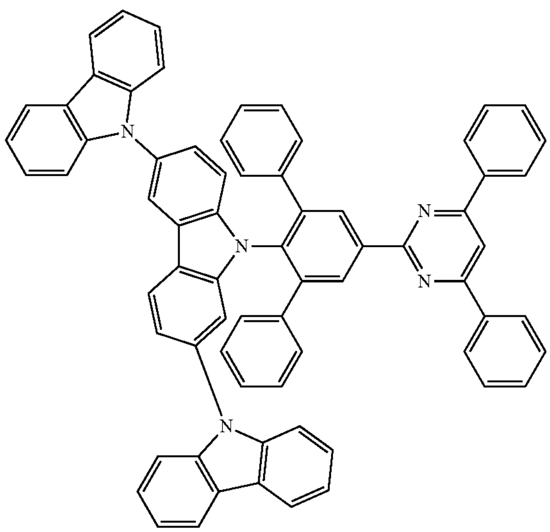
121
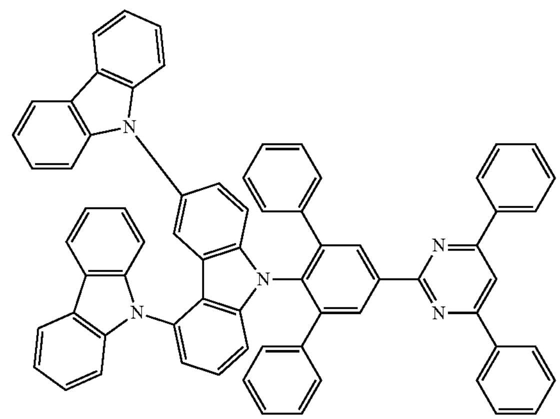
122
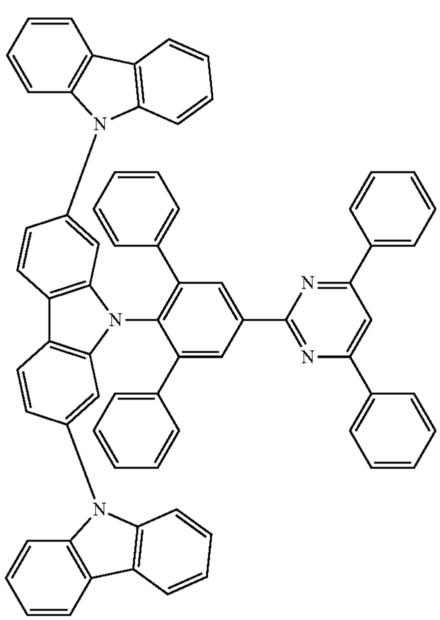
123
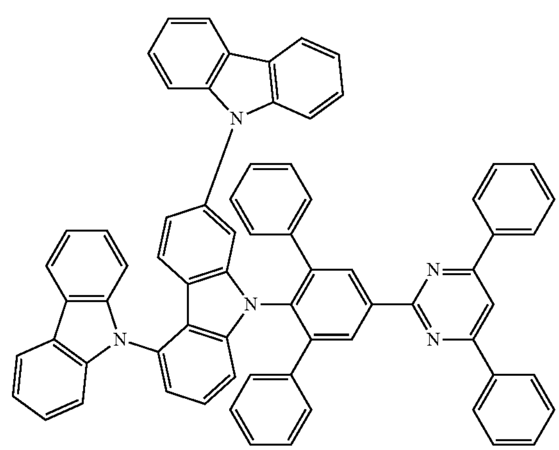

-continued
124
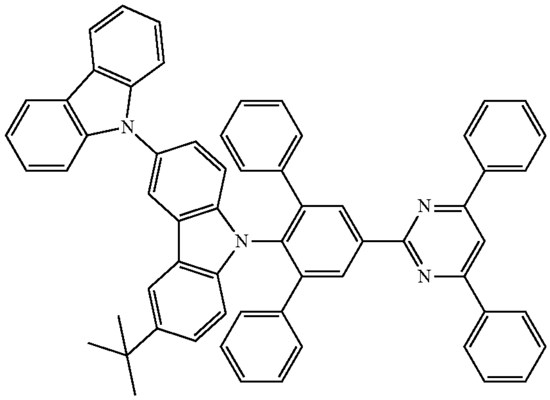
125
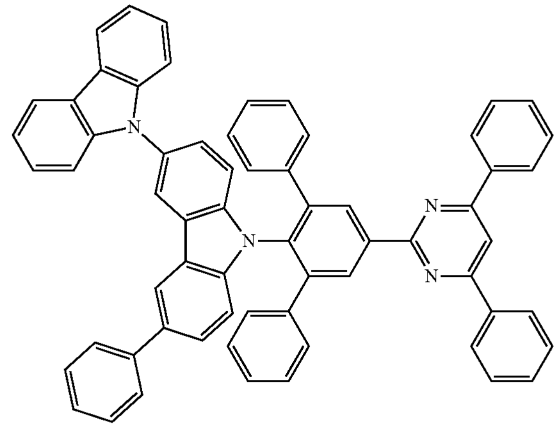
126
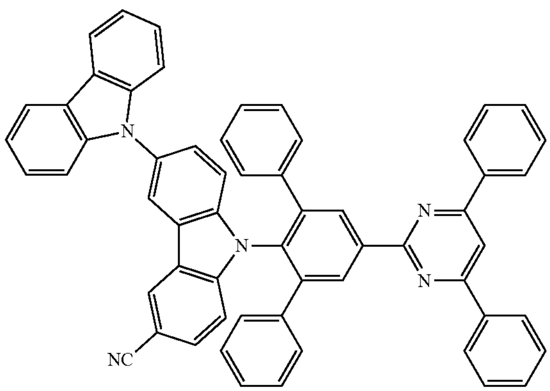
127
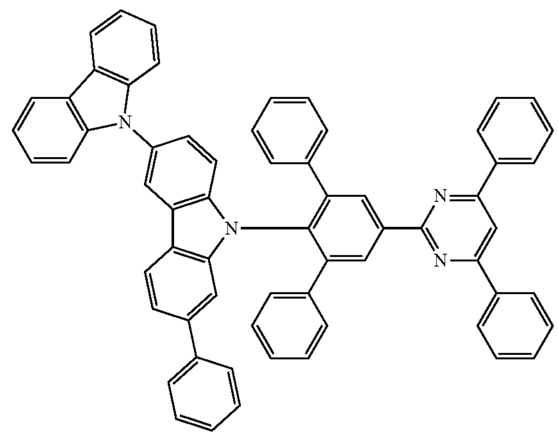
128
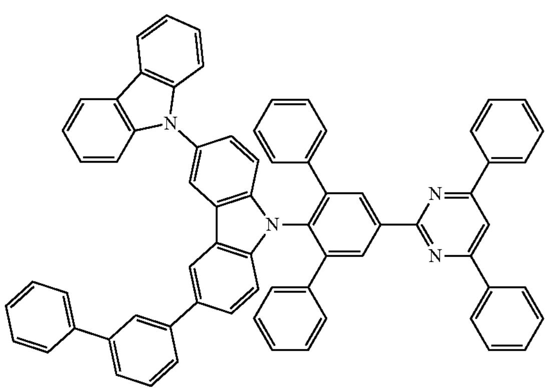
129
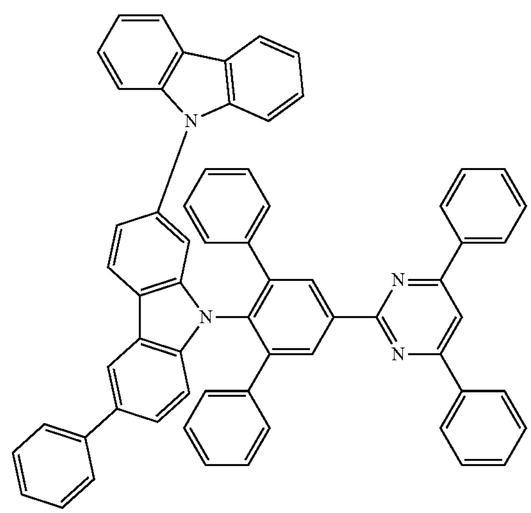

-continued
130
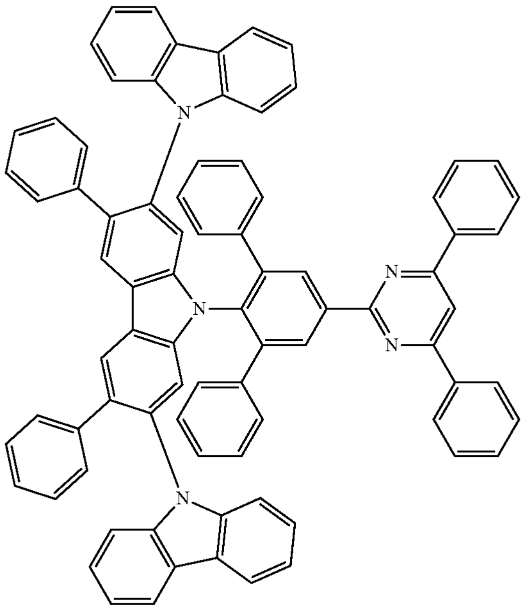
131
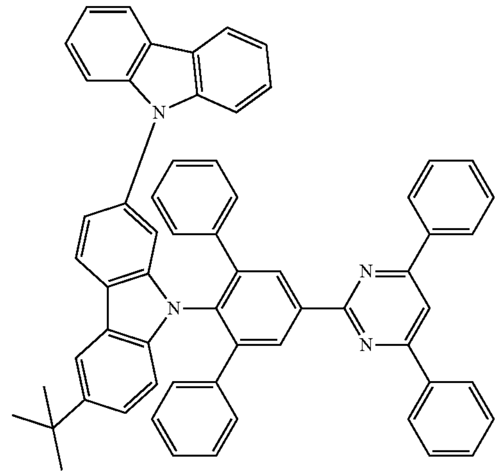
132
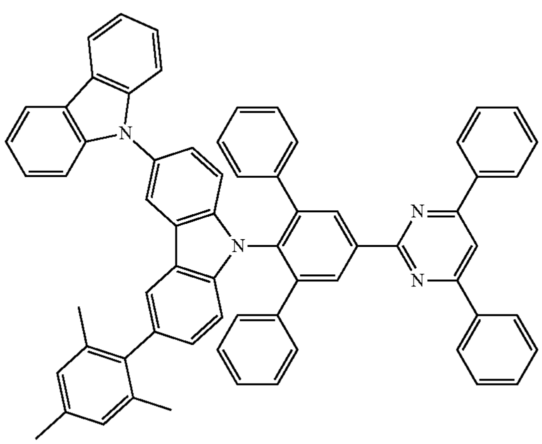
133
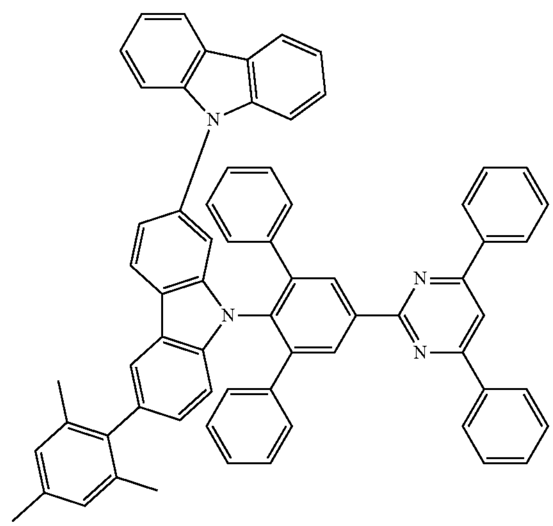
134
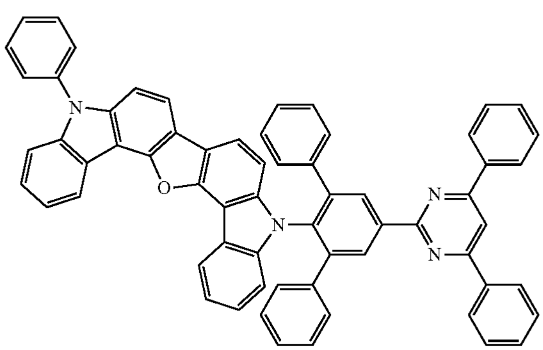
135
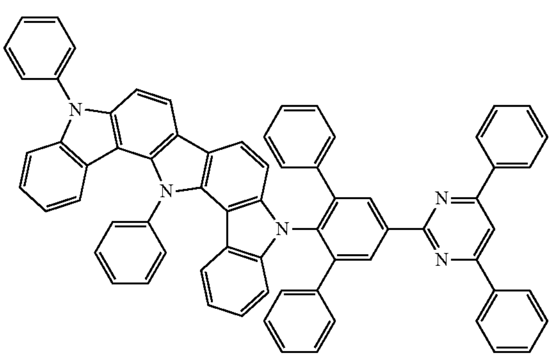

-continued
136
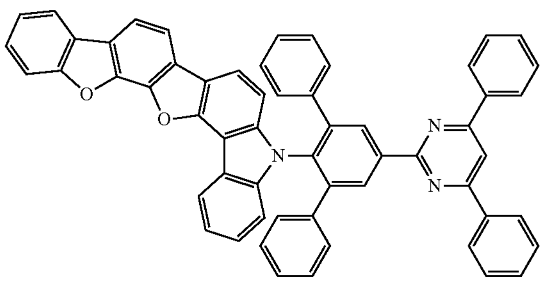
137
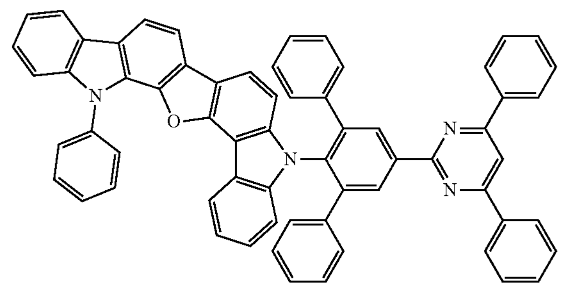
138
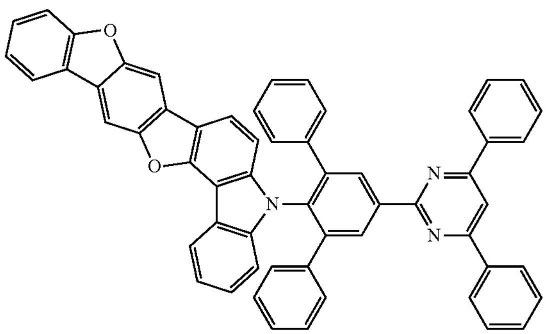
139
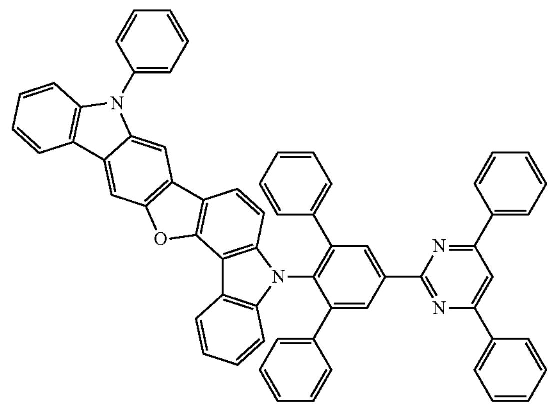
140
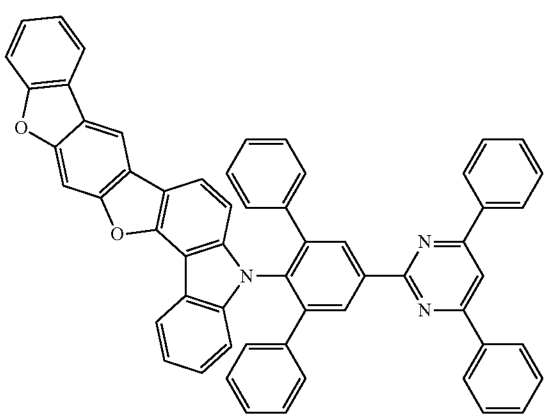
141
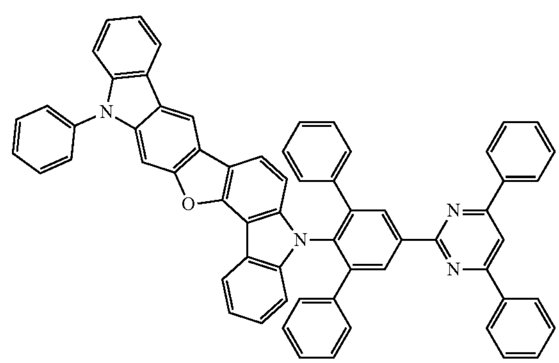
142
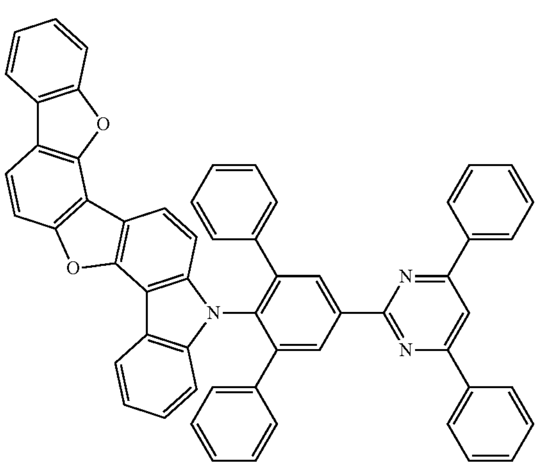
143
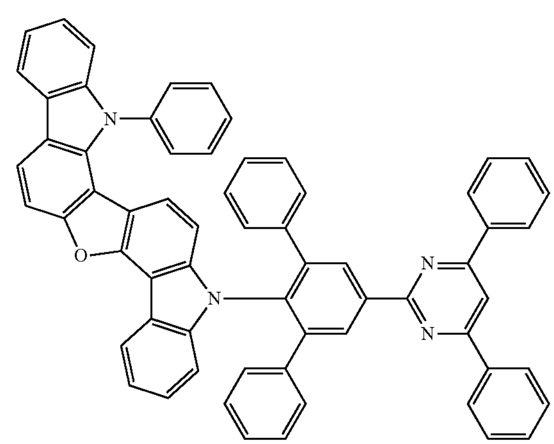

-continued
144
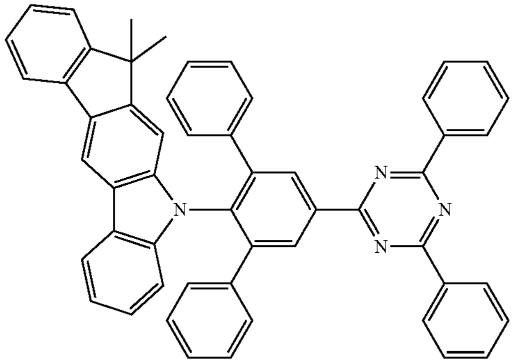
145
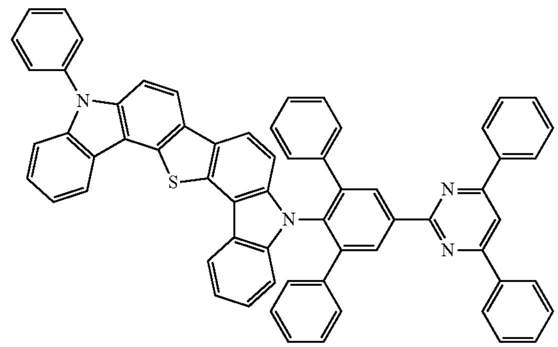
146
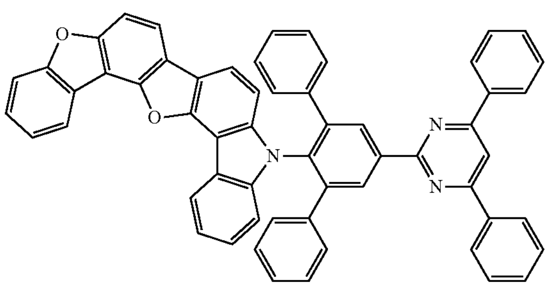
147
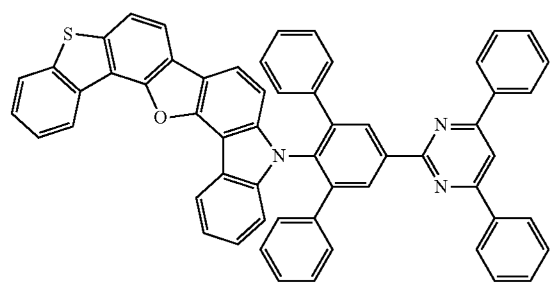
148
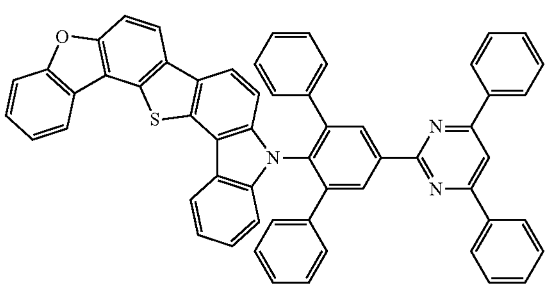
149
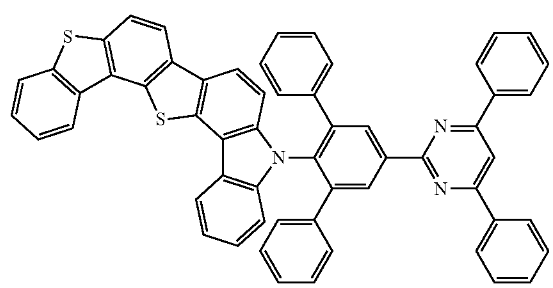
150
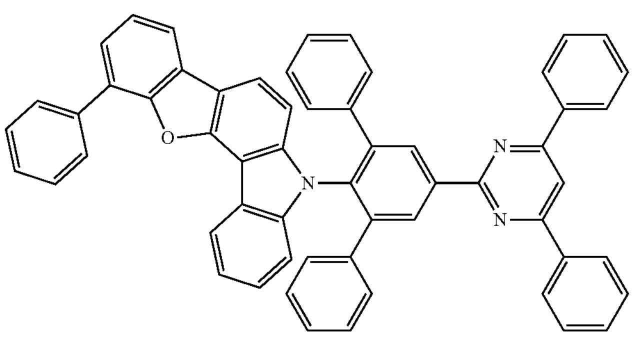
151
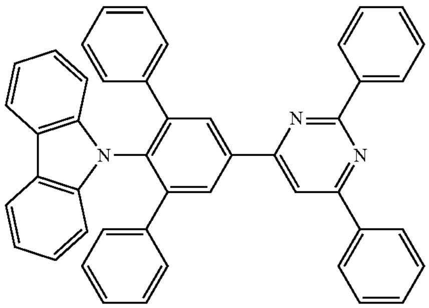
152
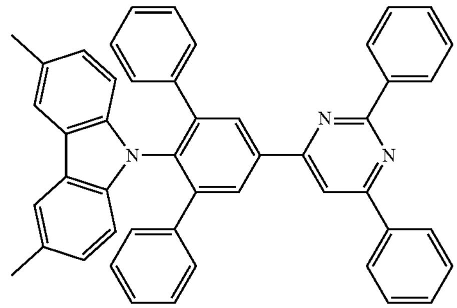

-continued
153
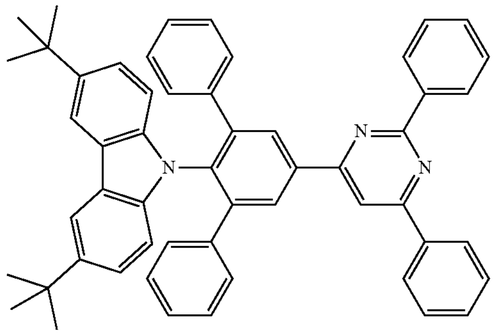
154
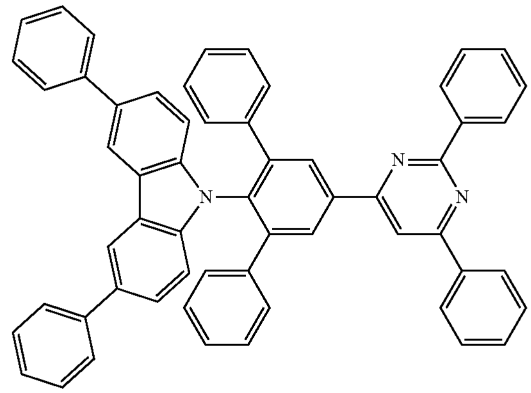
155
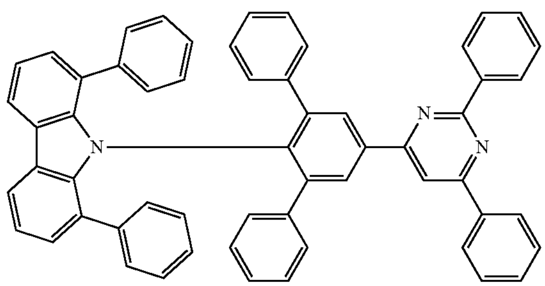
156
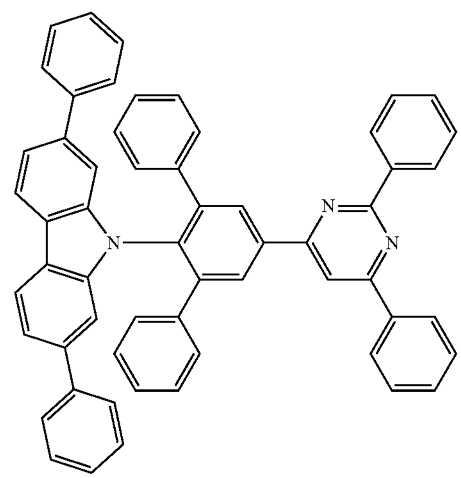
157
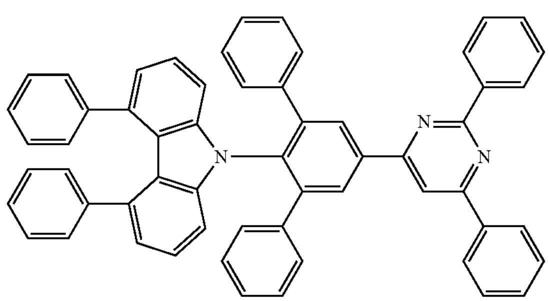
158
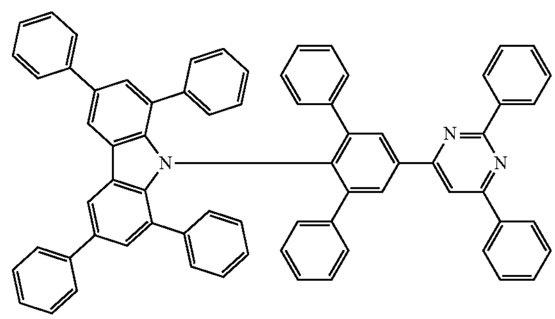
159
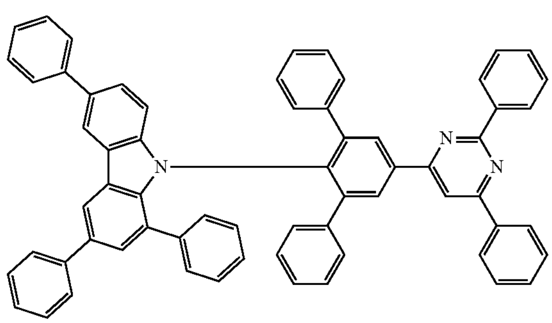
160
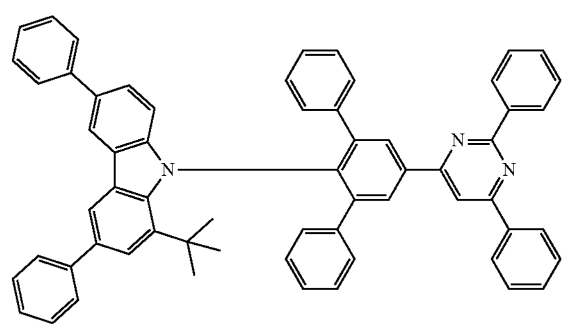

-continued
161
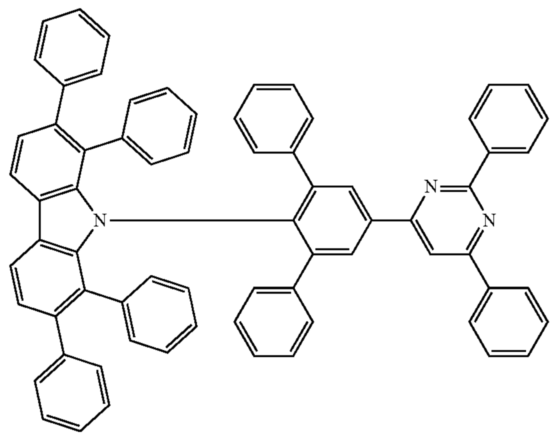
162
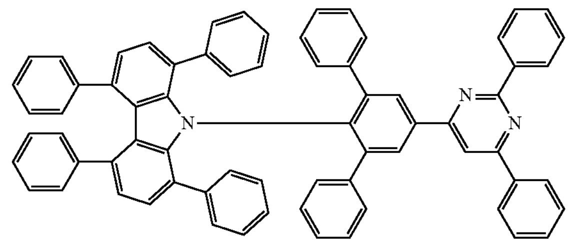
163
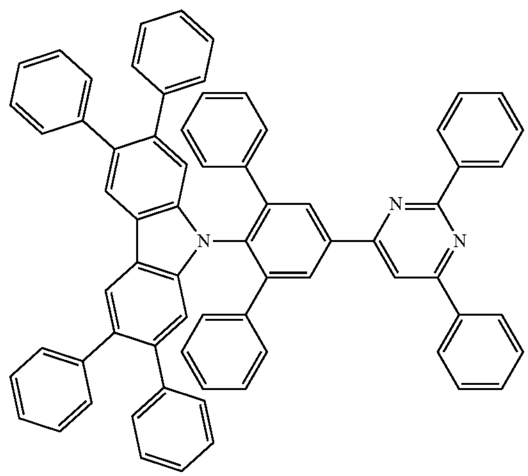
164
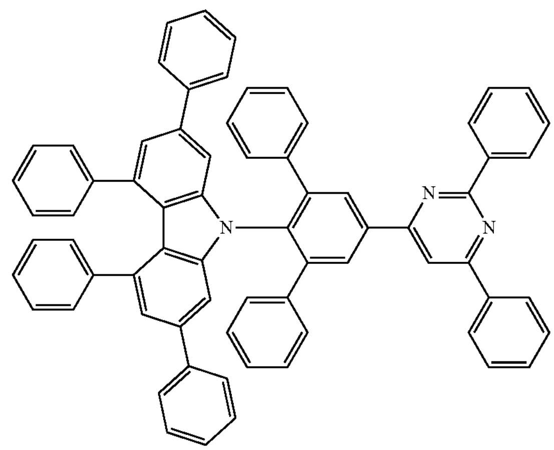
165
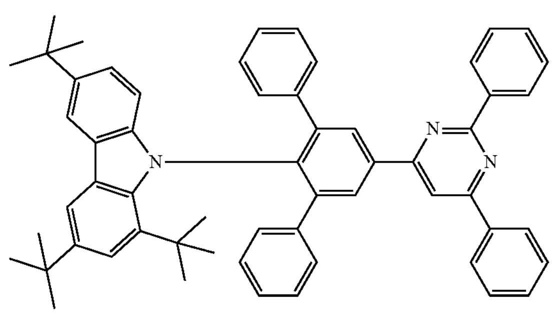
166
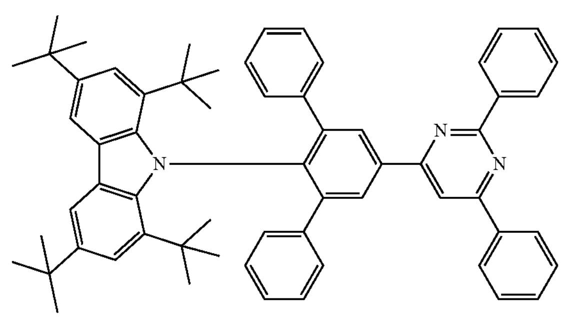
167
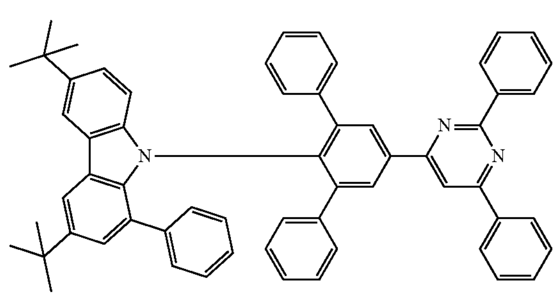
168
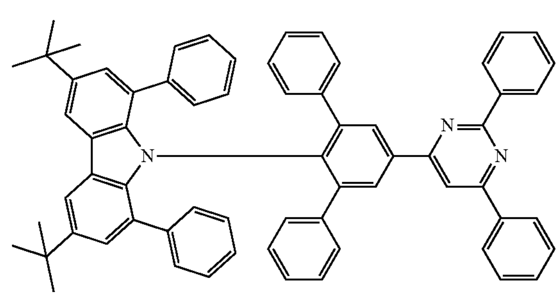

-continued
169
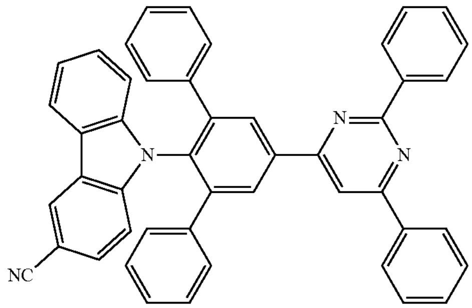
170
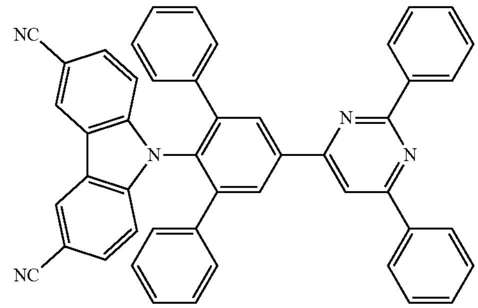
171
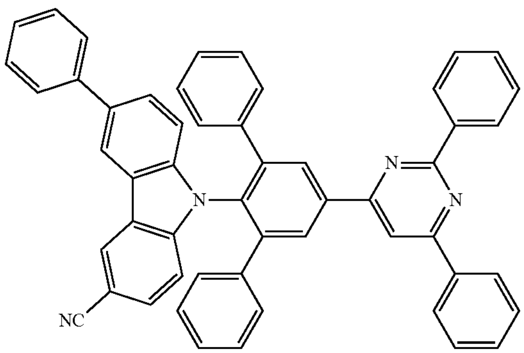
172
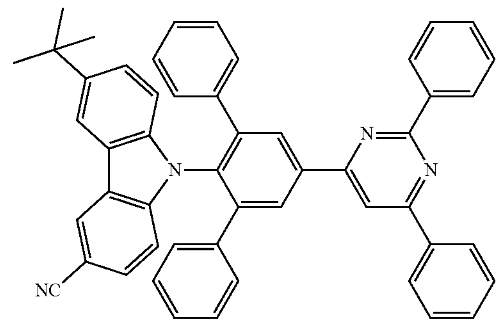
173
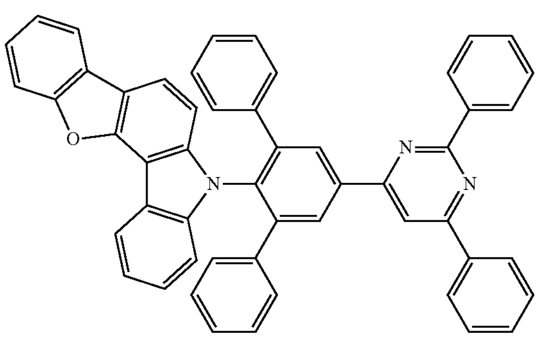
174
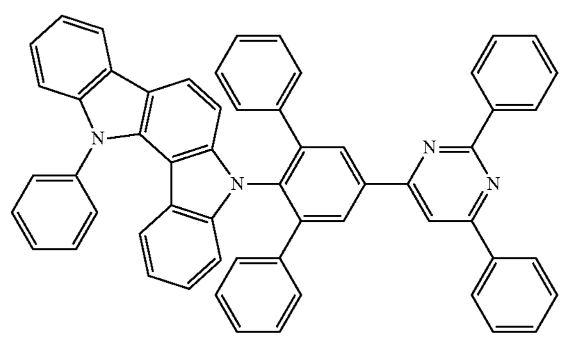
175
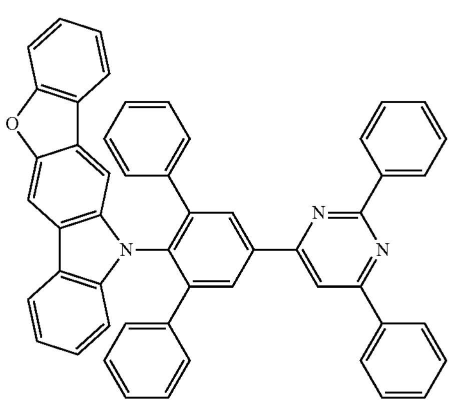
176
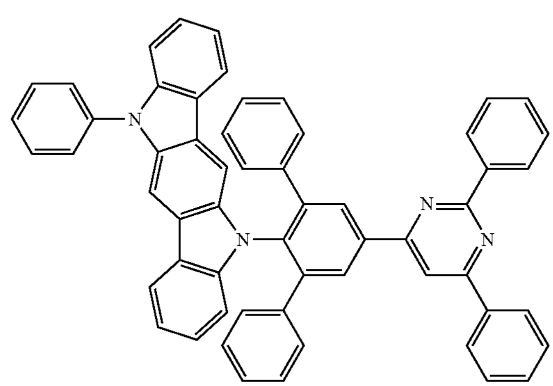

-continued
177
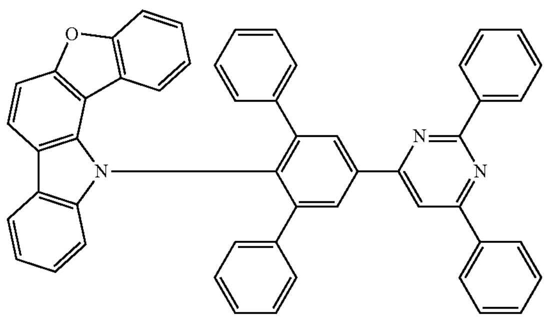
178
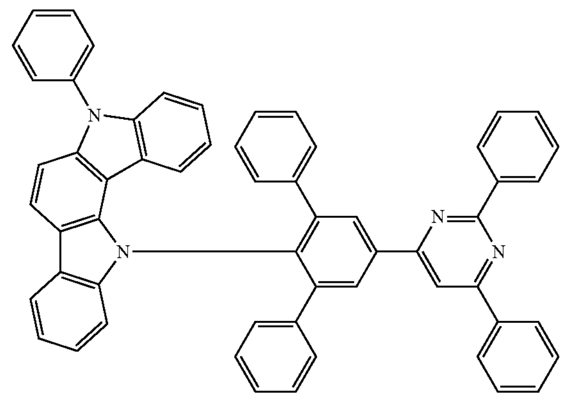
179
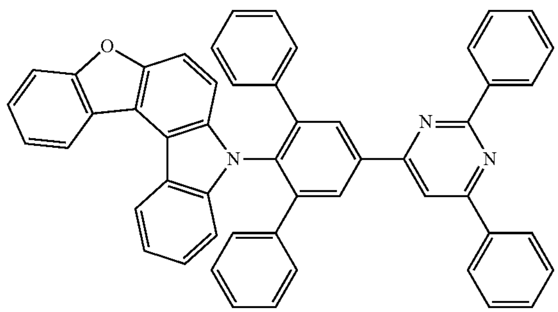
180
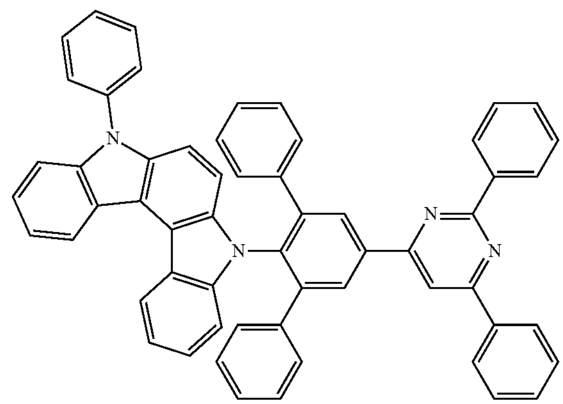
181
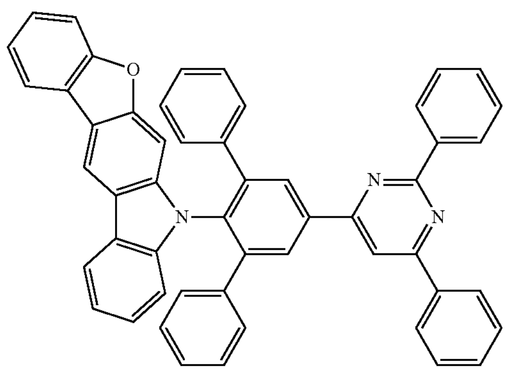
182
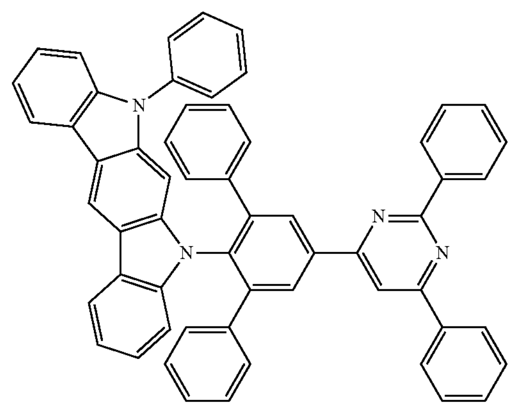
183
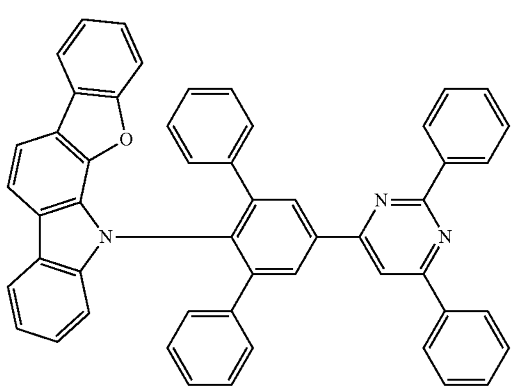
184
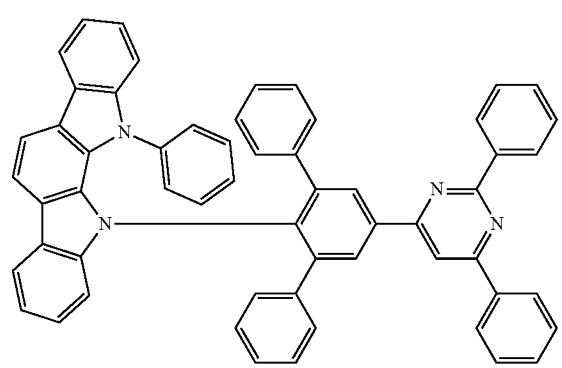

-continued
185
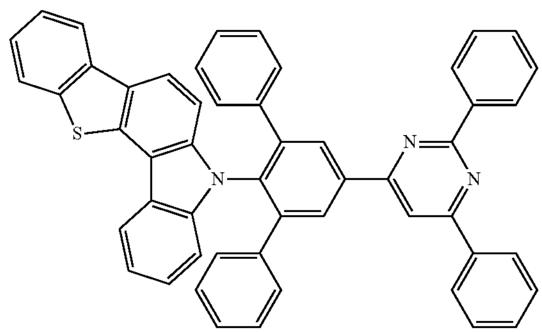
186
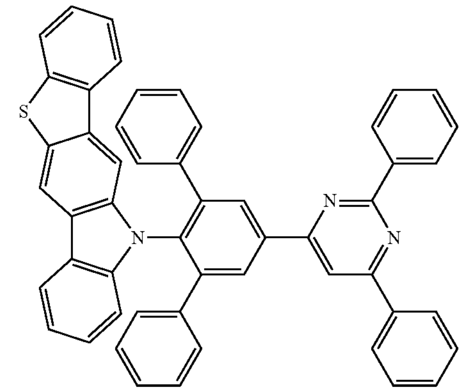
187
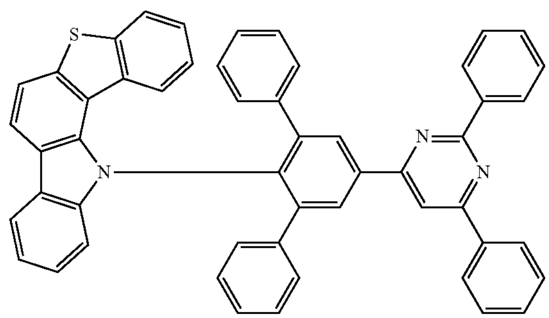
188
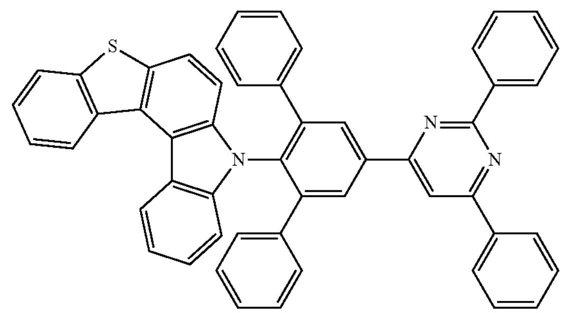
189
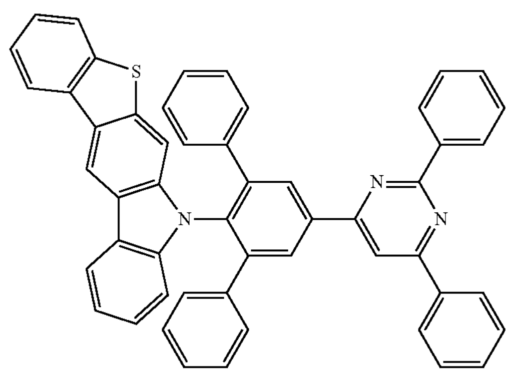
190
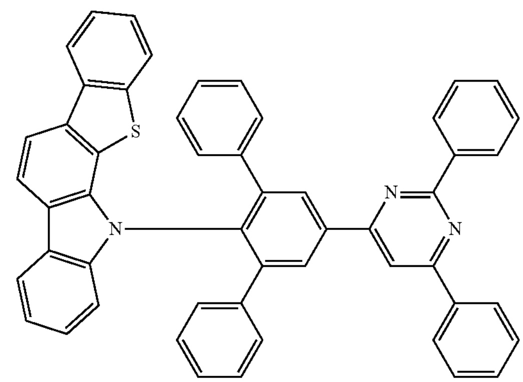
191
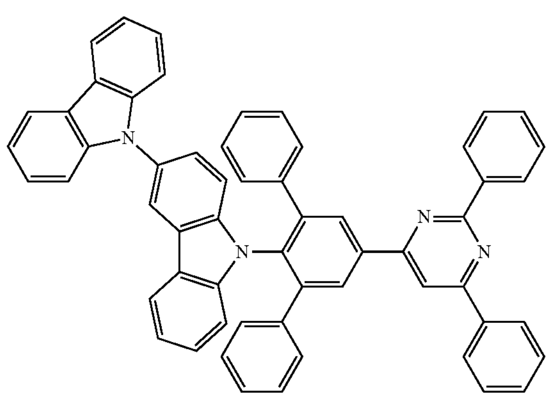
192
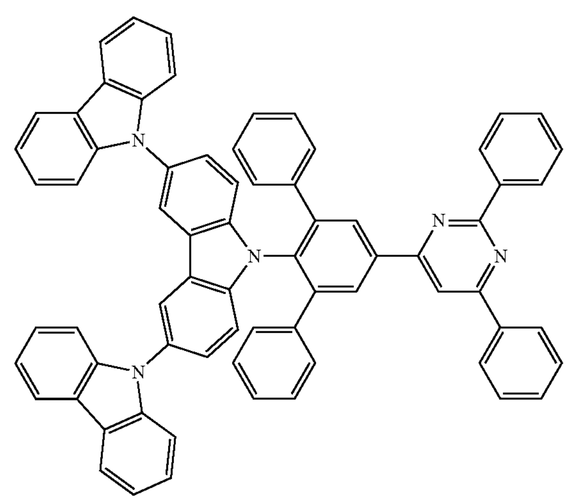

-continued
193
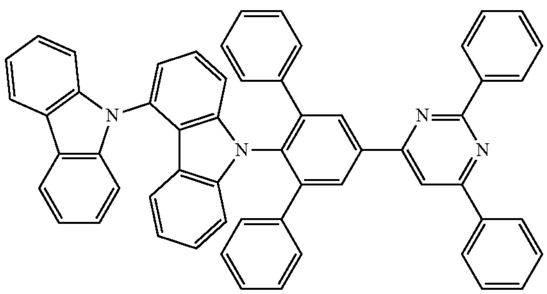
194
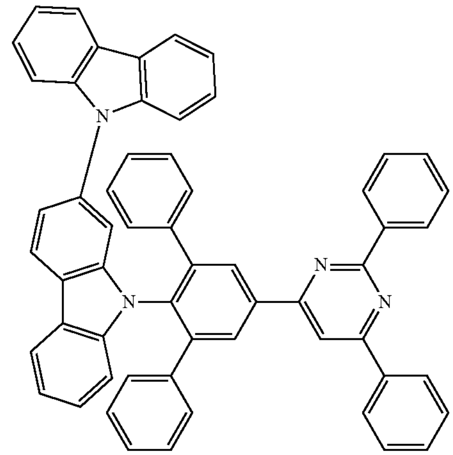
195
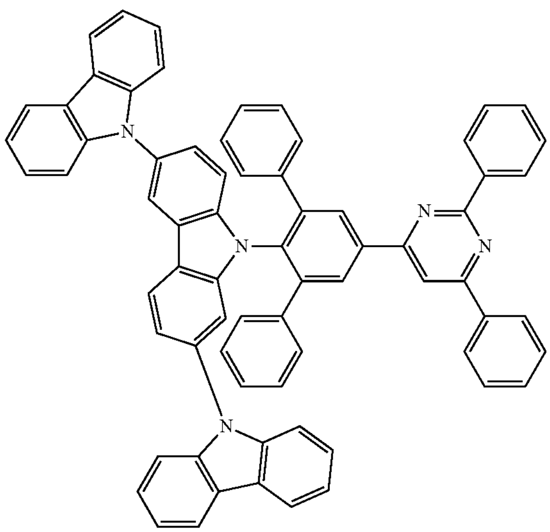
196
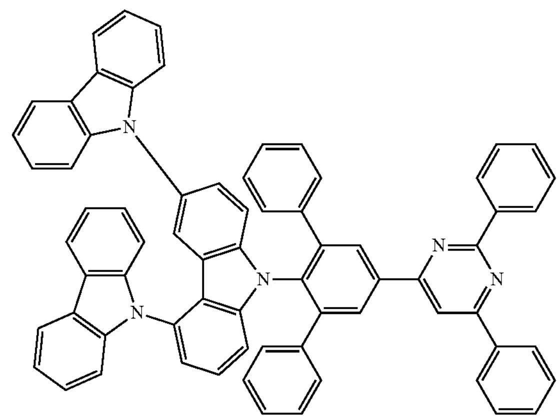
197
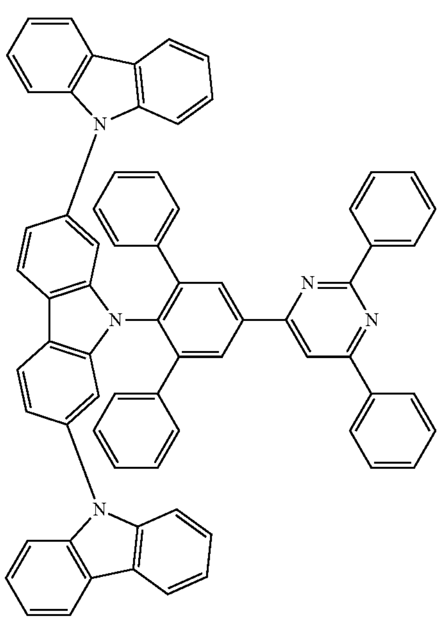
198
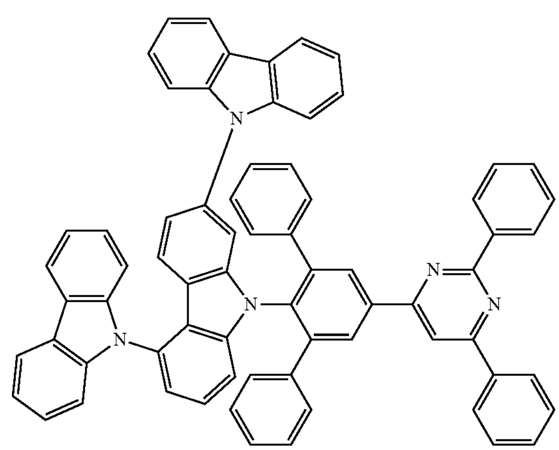

-continued
199
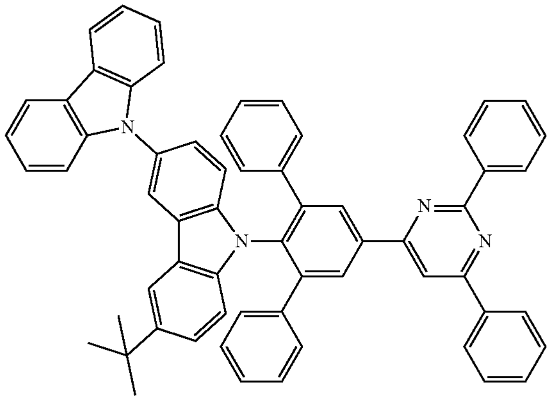
200
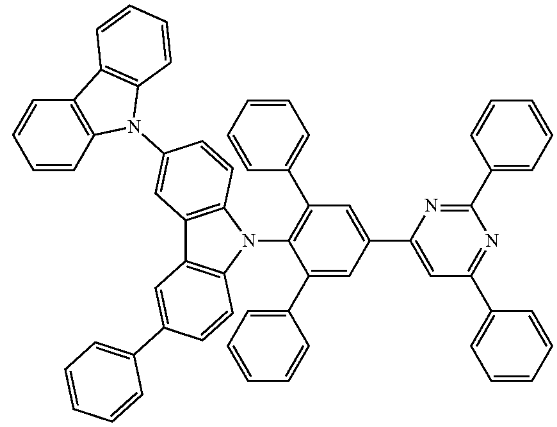
201
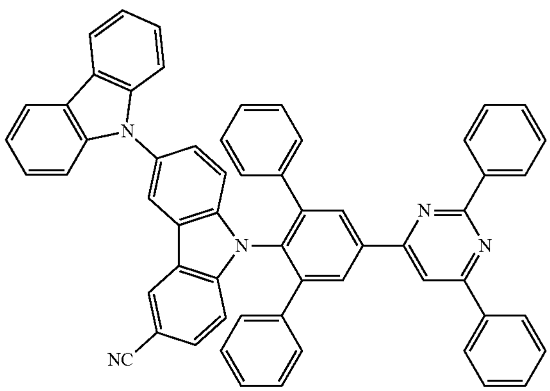
202
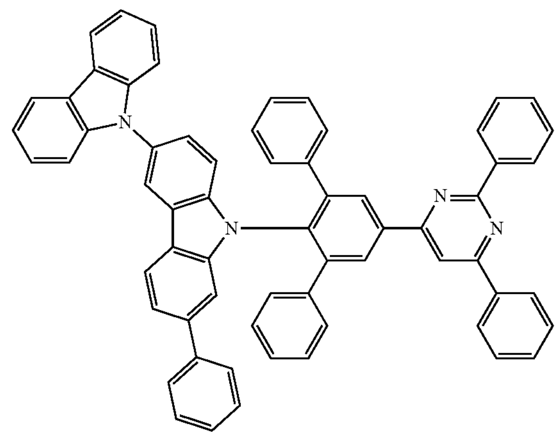
203
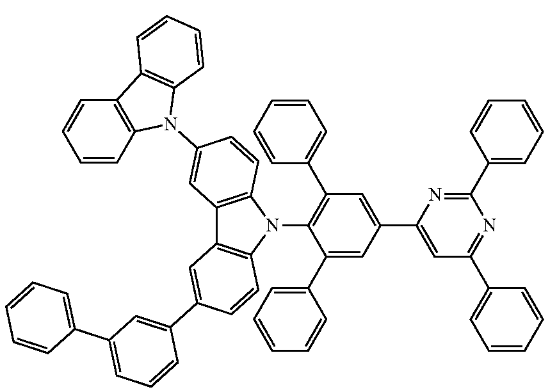
204
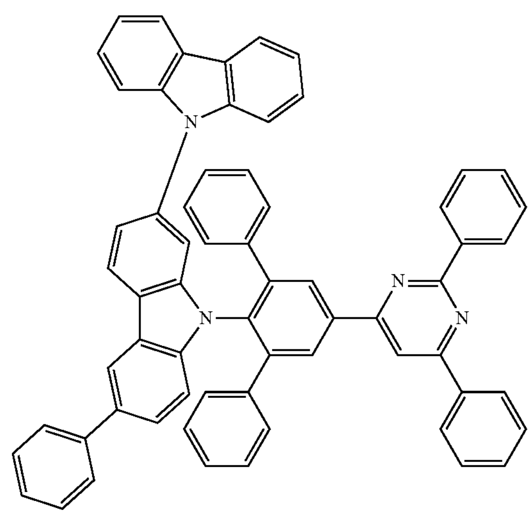

-continued
205
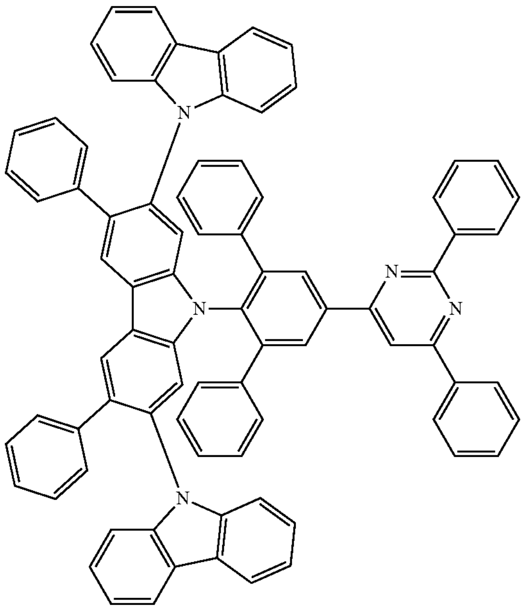
206
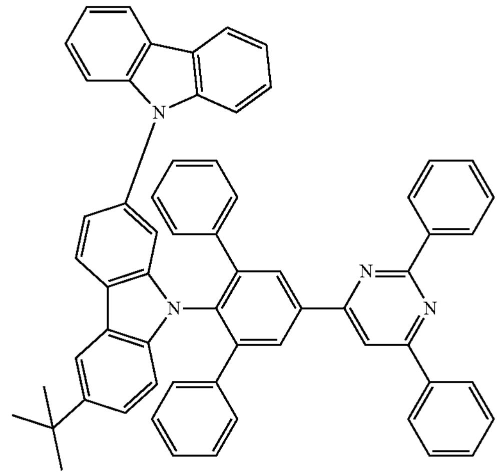
207
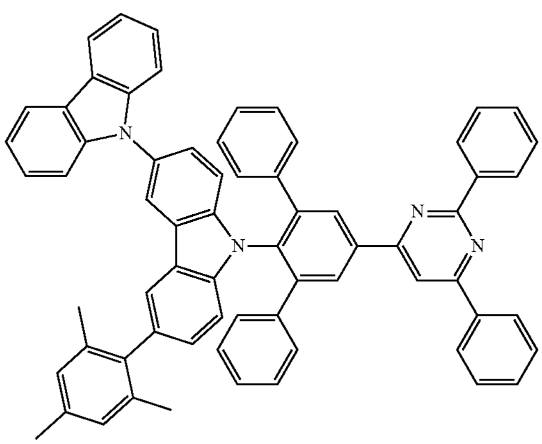
208
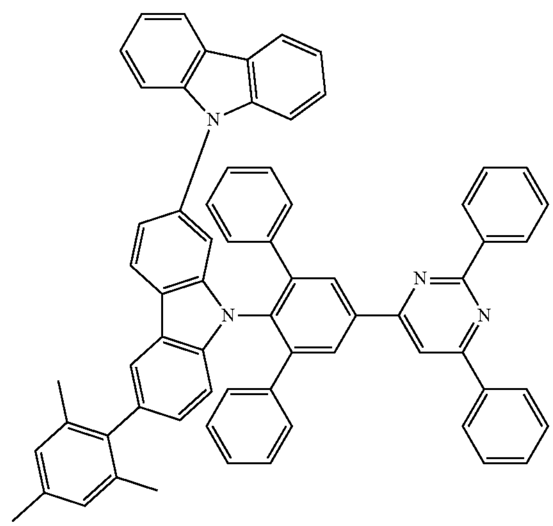
209
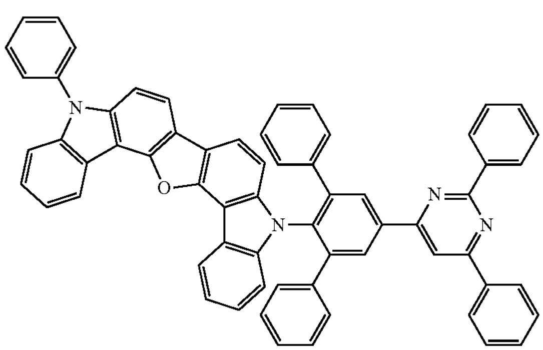
210
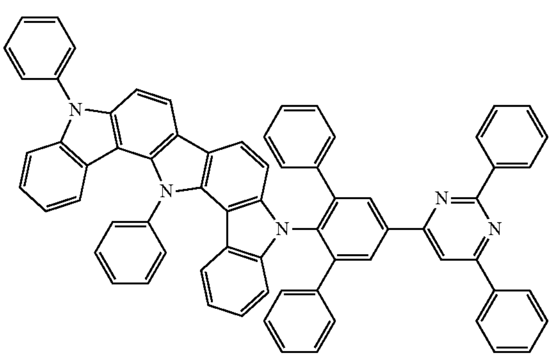

-continued
211
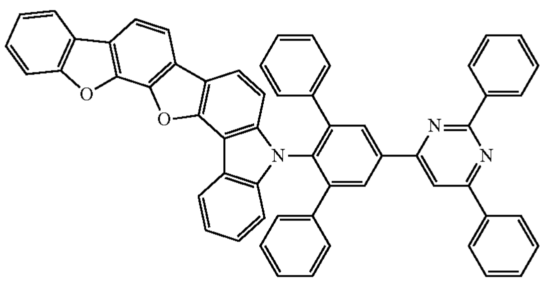
212
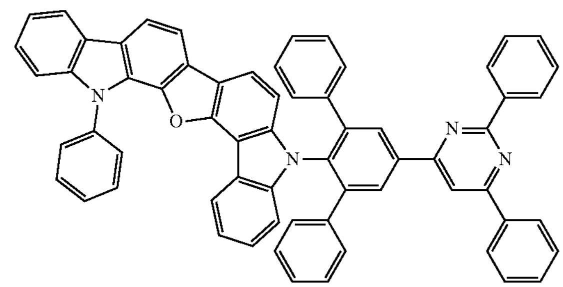
213
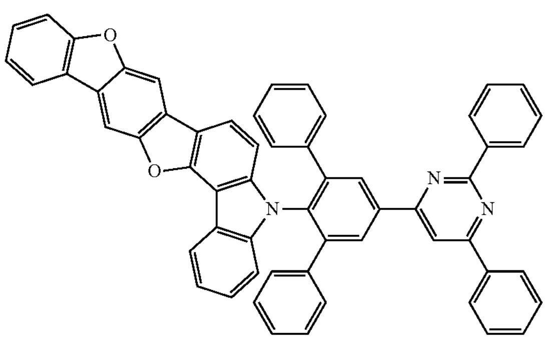
214
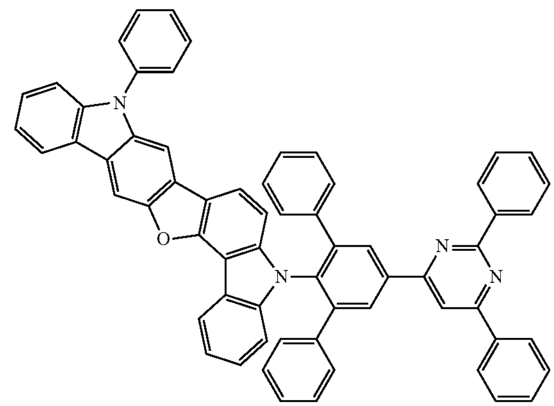
215
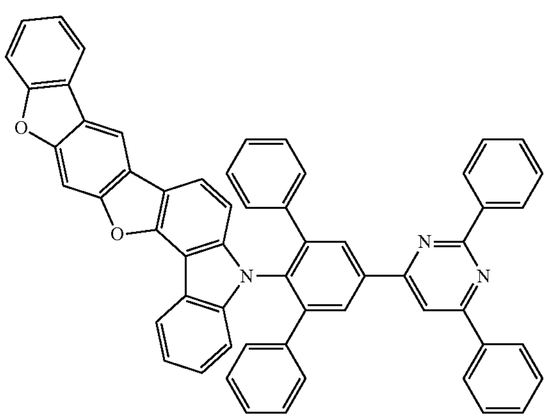
216
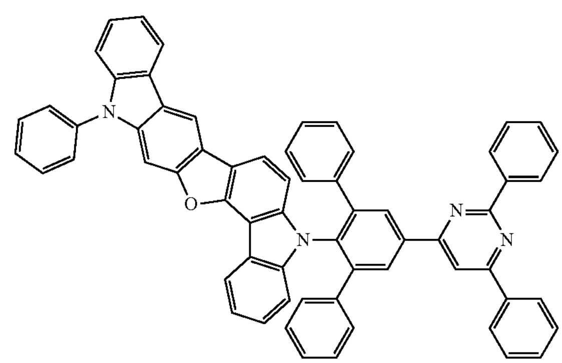
217
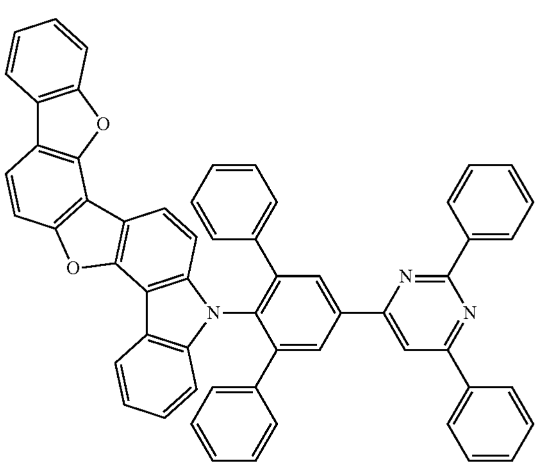
218
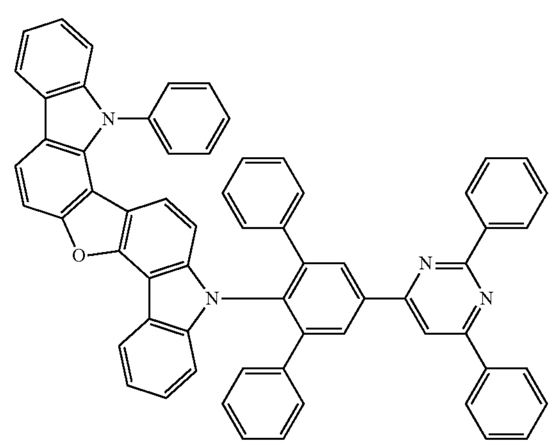

-continued
219
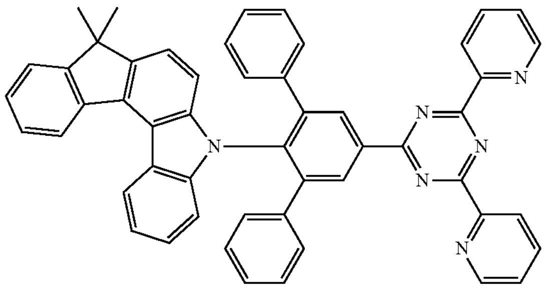
220
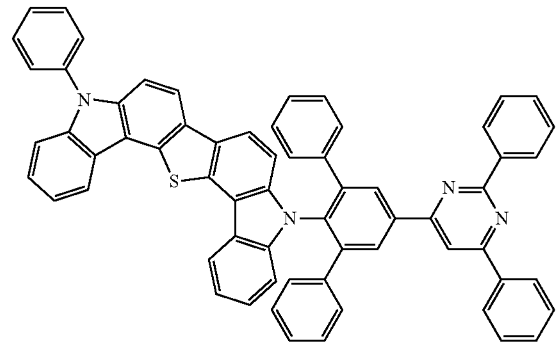
221
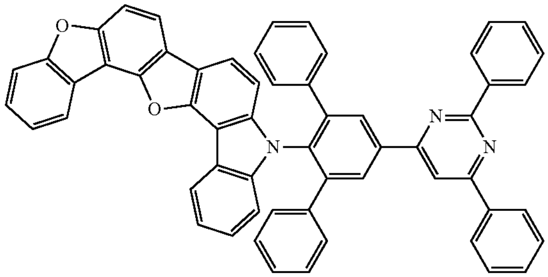
222
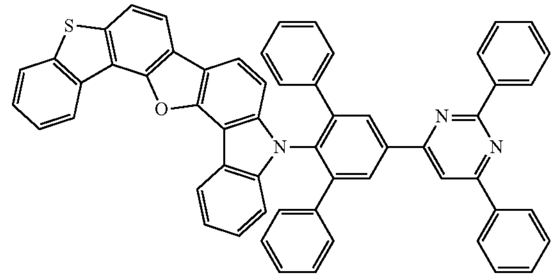
223
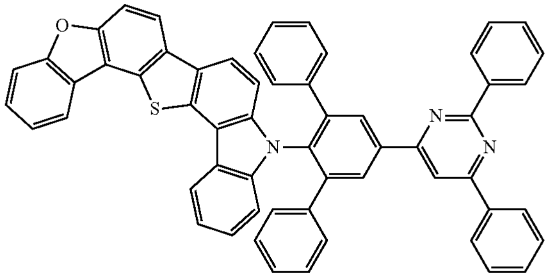
224
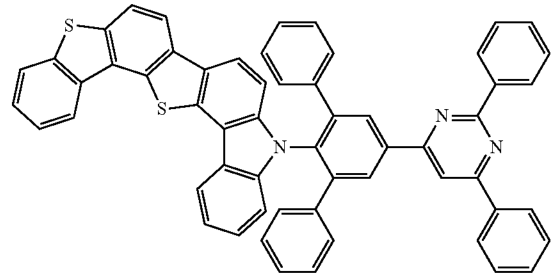
225
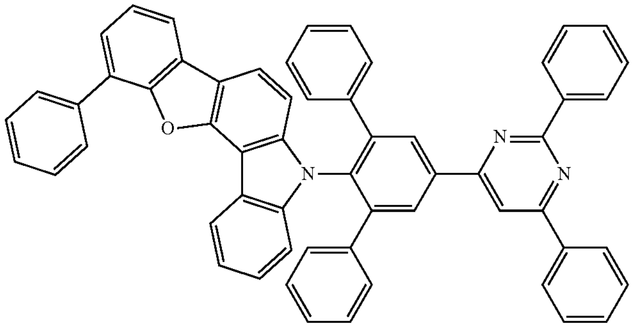

-continued
226
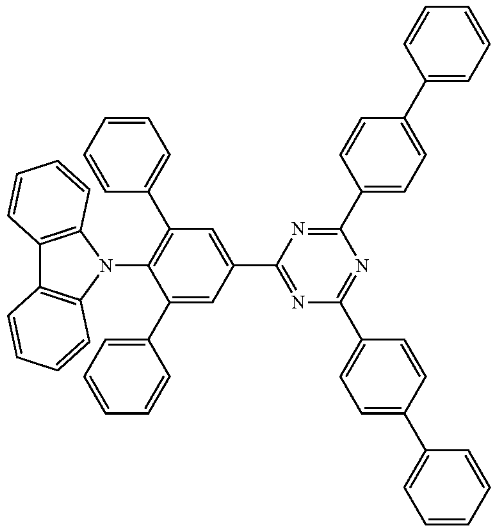
227
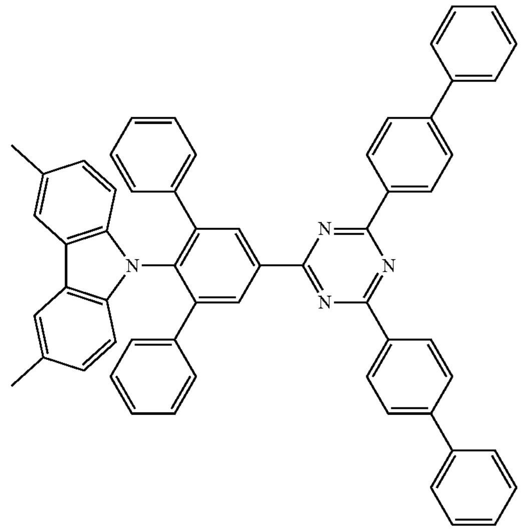
228
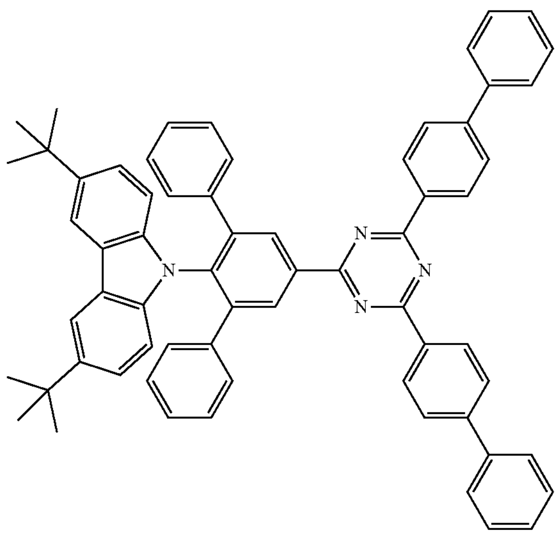
229
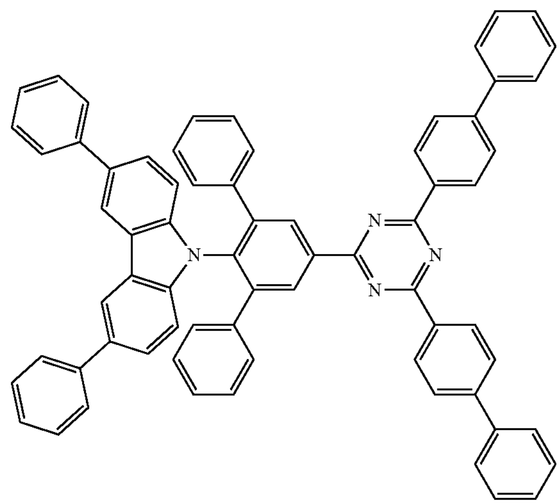
230
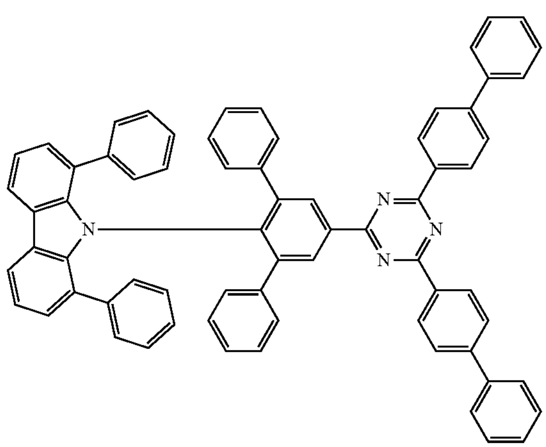
231
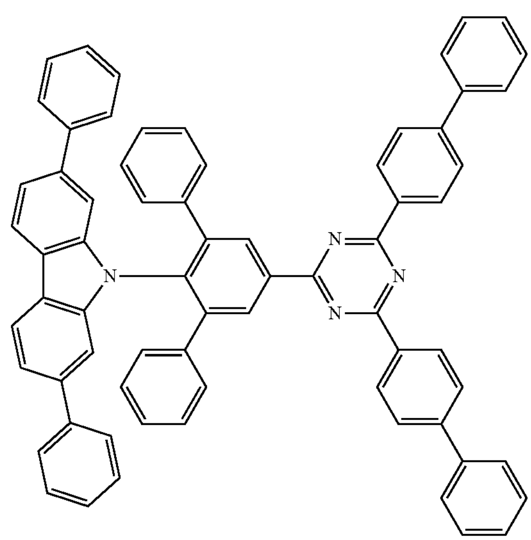

-continued
232
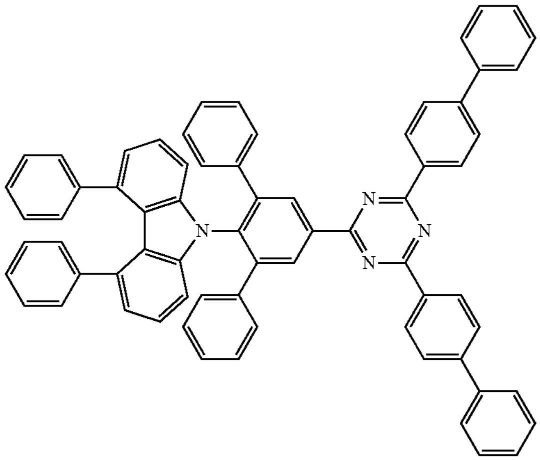
233
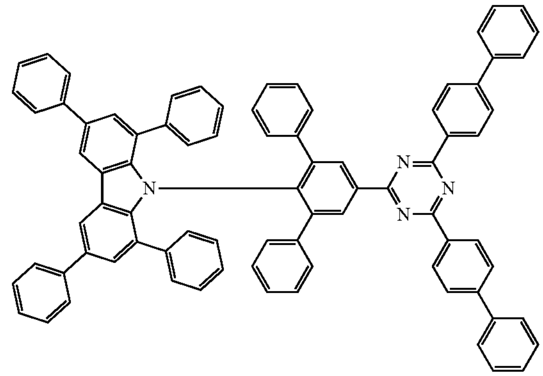
234
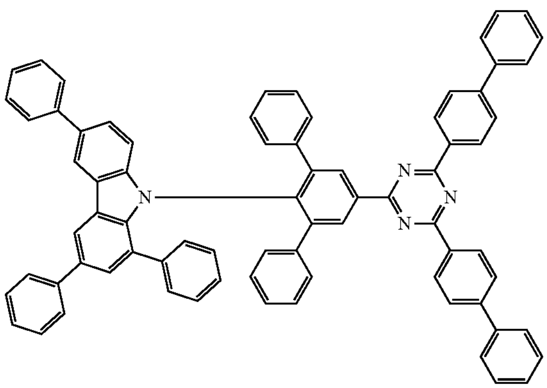
235
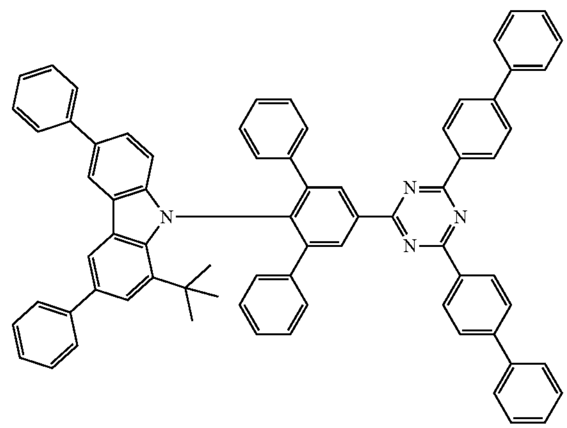
236
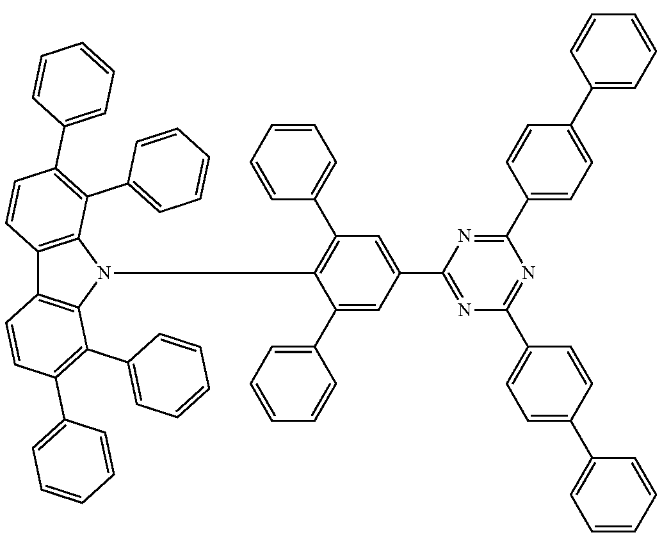

-continued
237
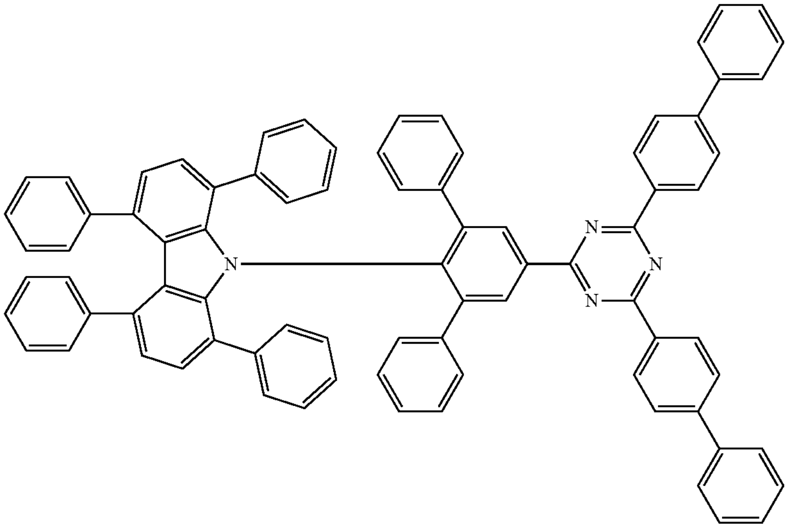
238
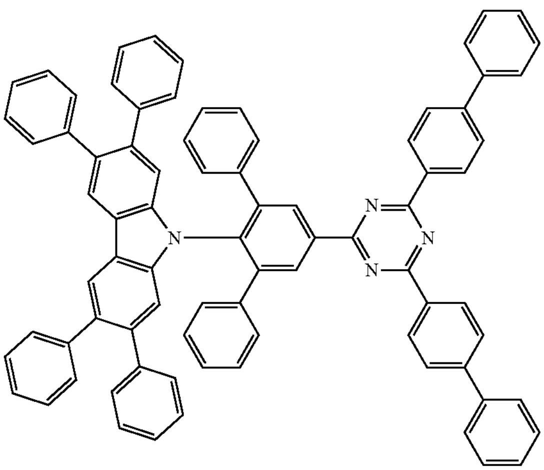
239
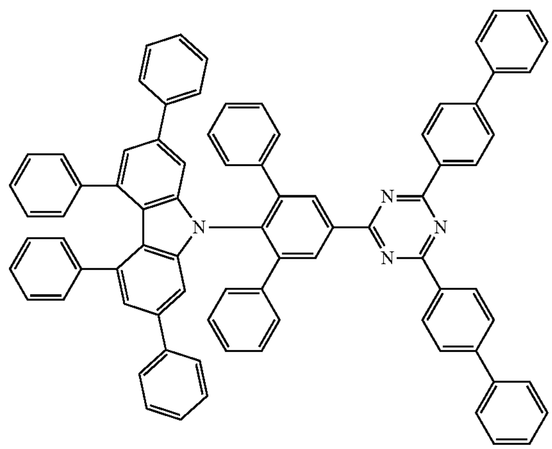
240
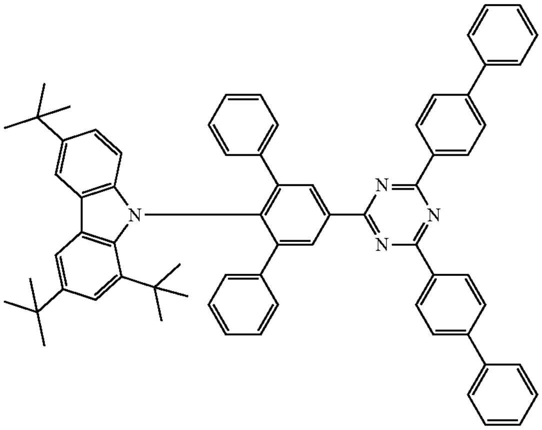
241
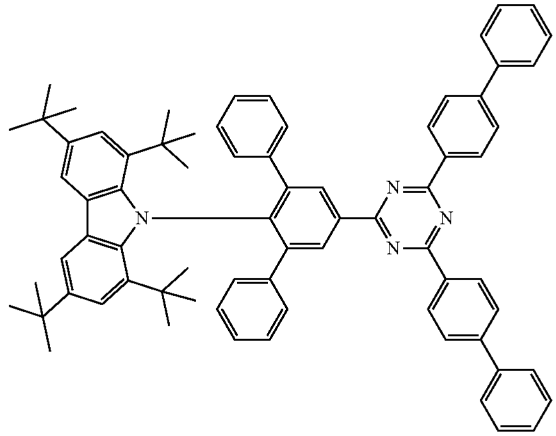

-continued
242
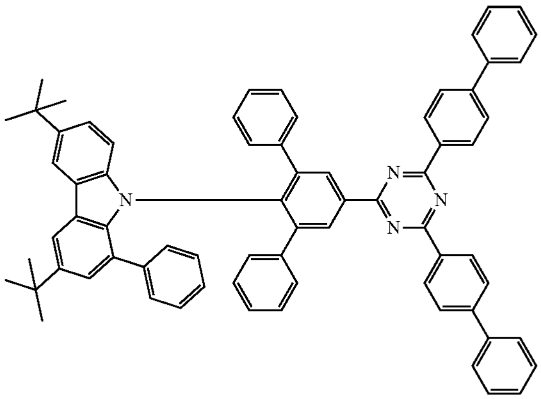
243
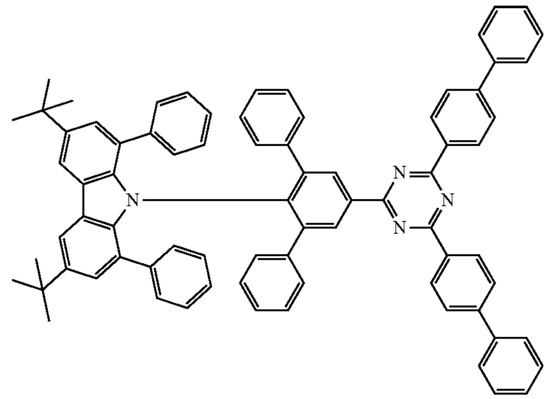
244
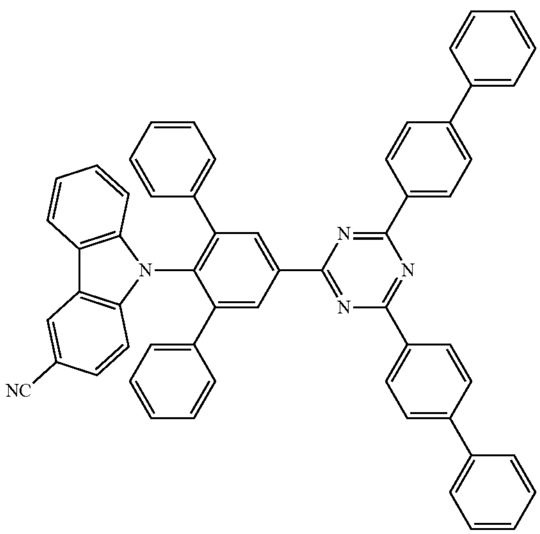
245
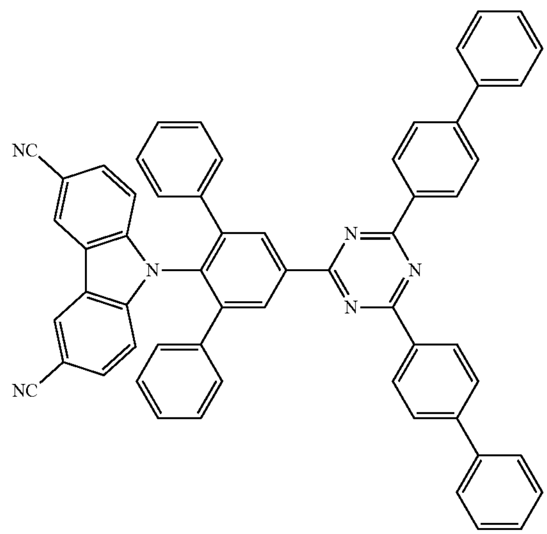
246
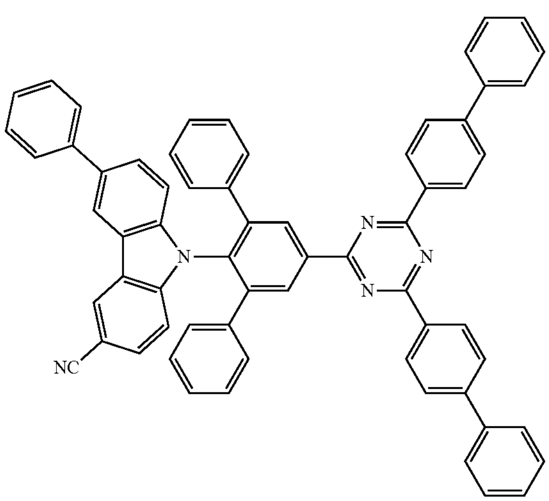
247
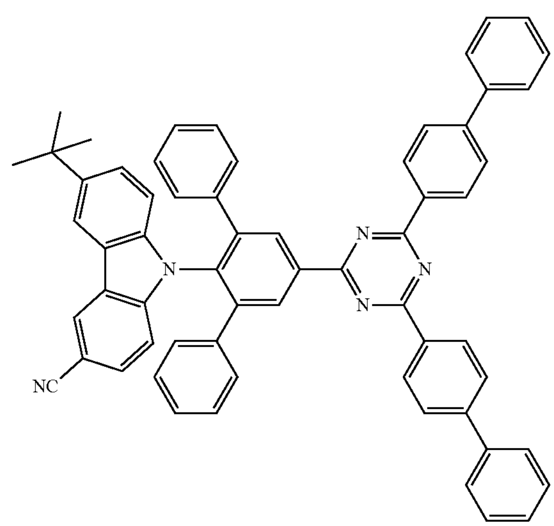

-continued
248
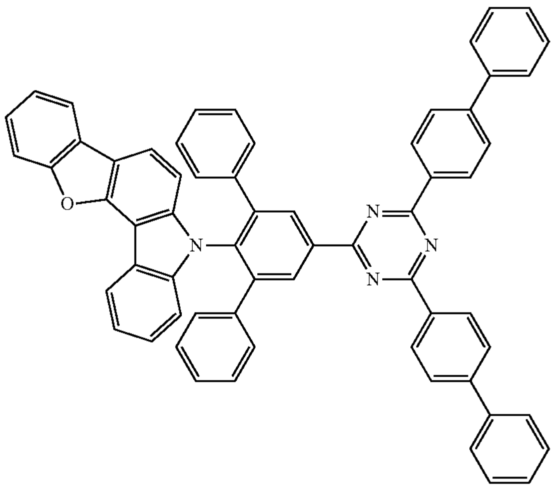
249
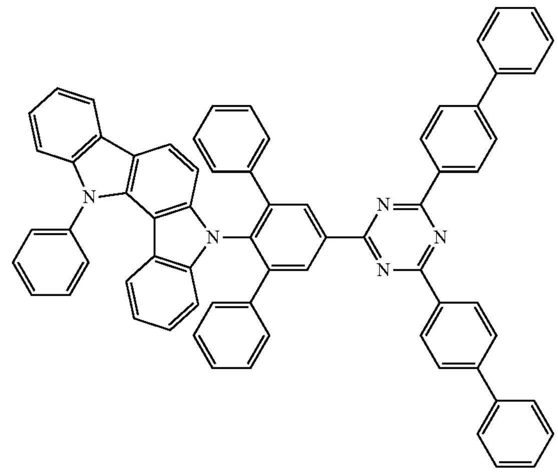
250
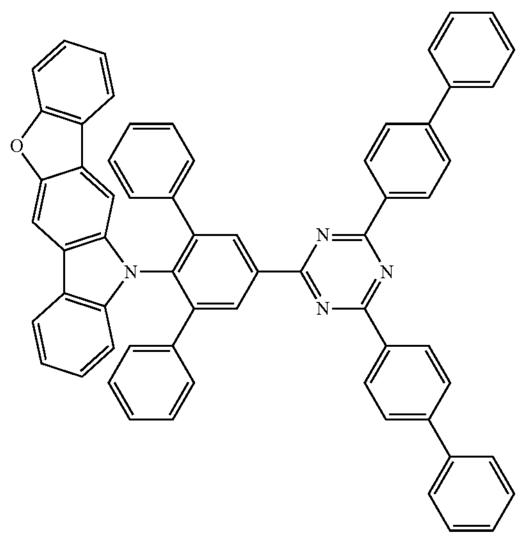
251
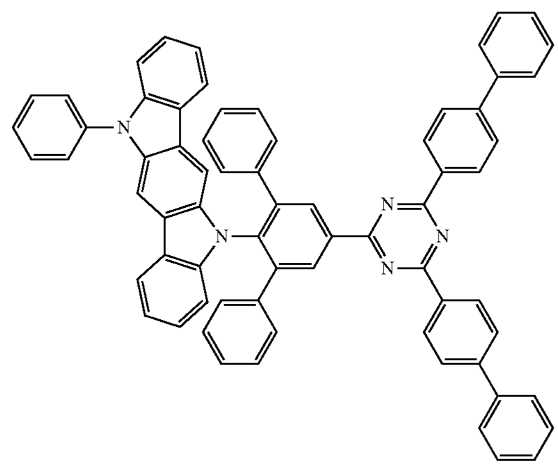
252
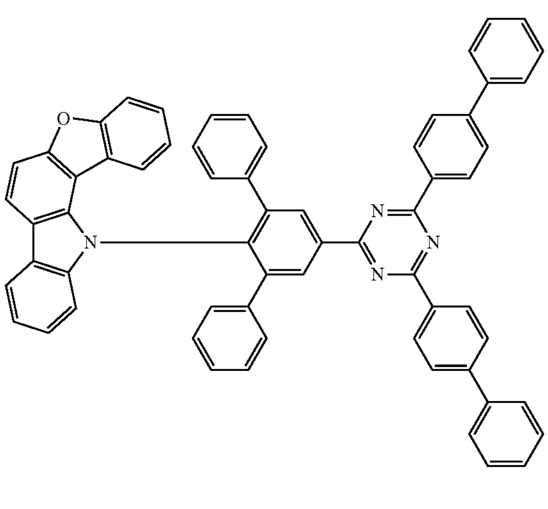
253
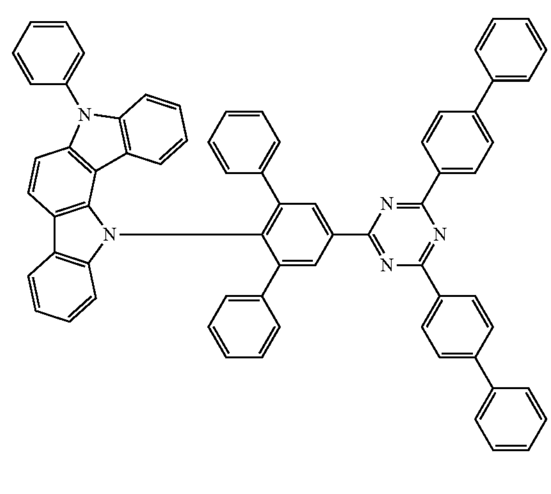

-continued
254
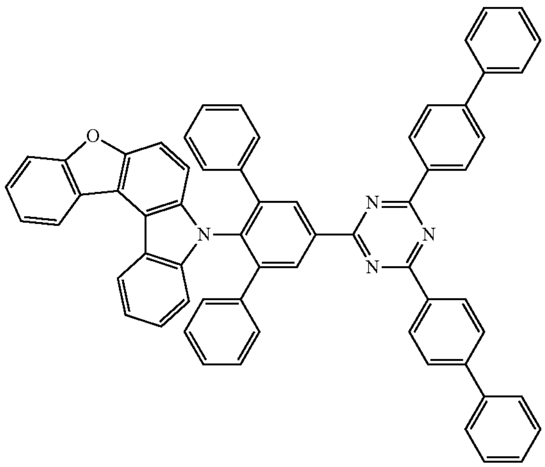
255
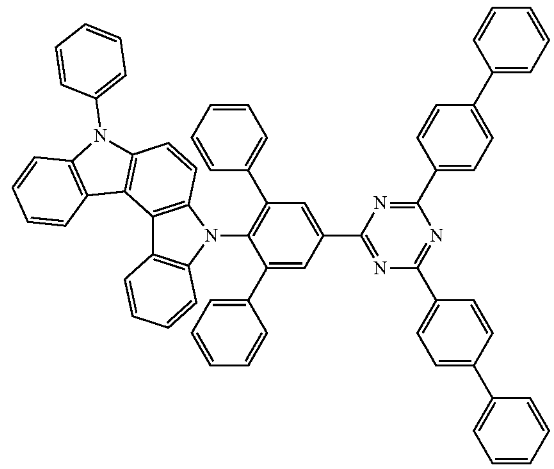
256
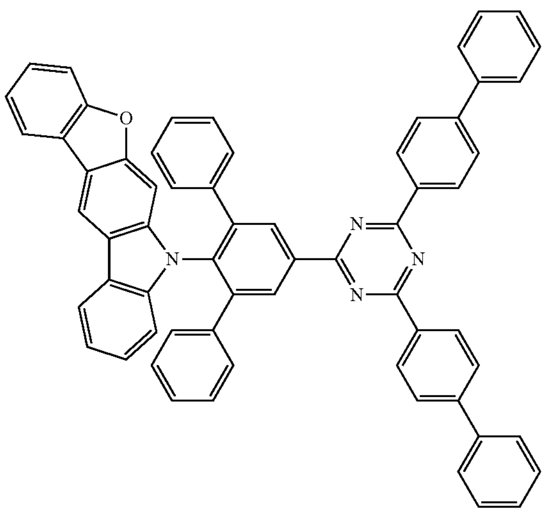
257
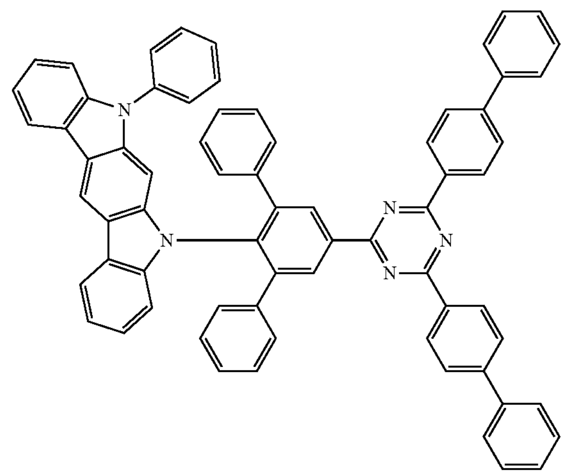
258
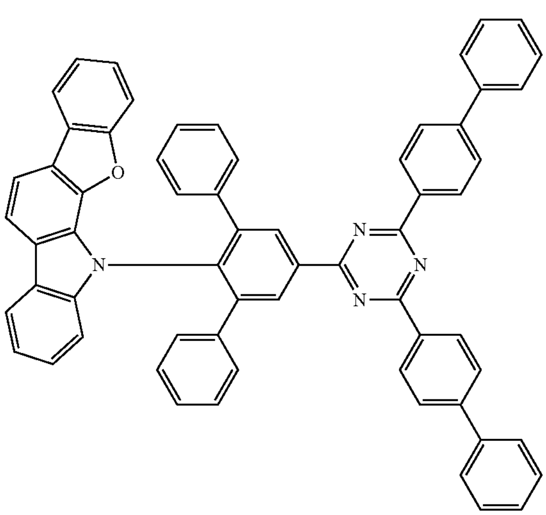
259
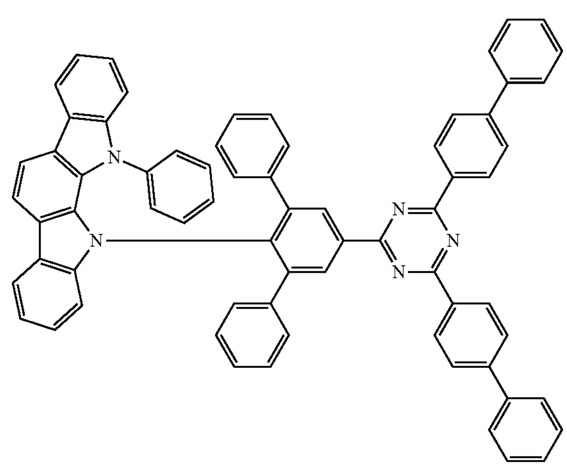

-continued
260
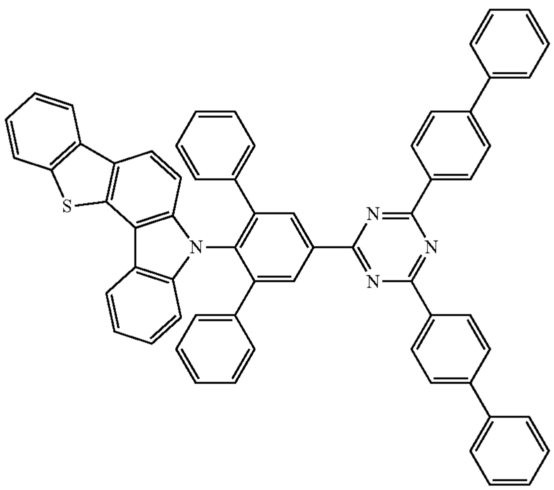
261
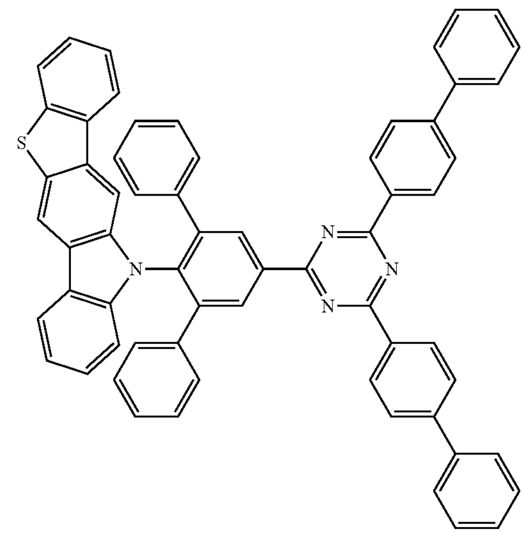
262
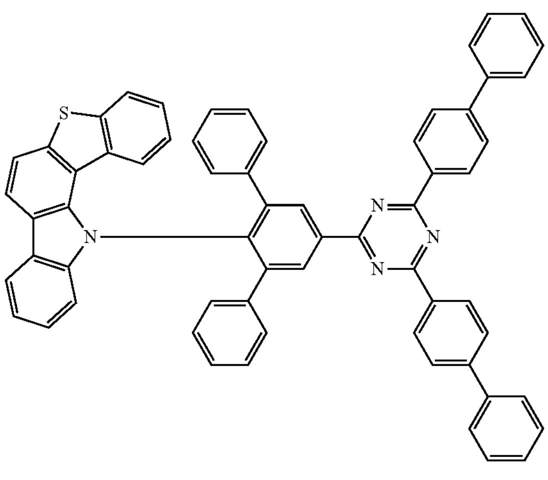
263
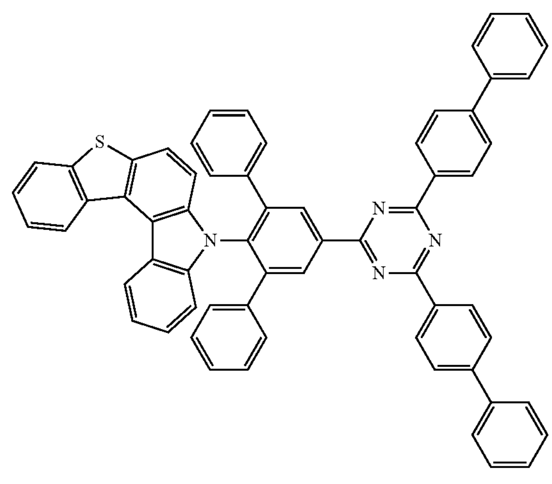
264
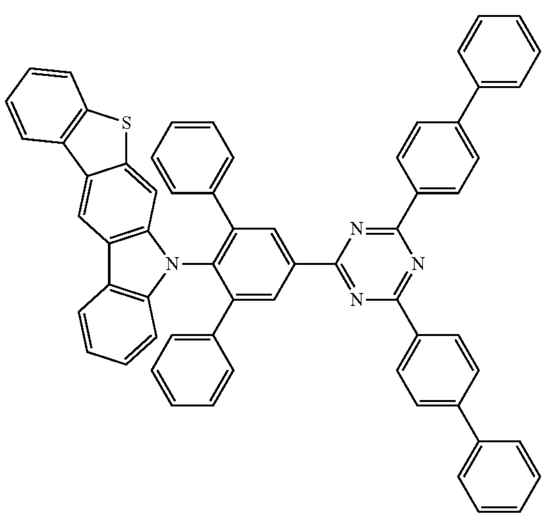
265
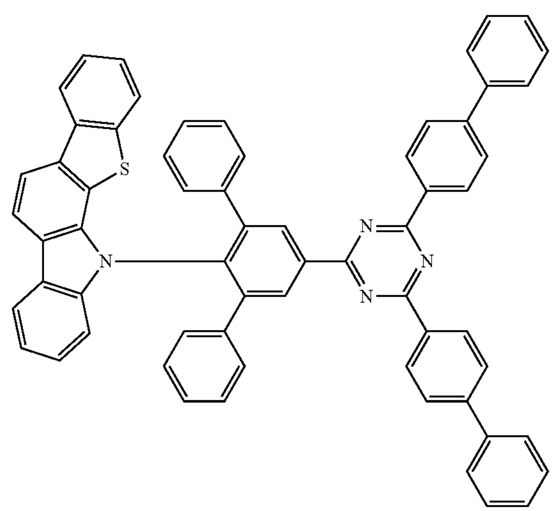

-continued
266
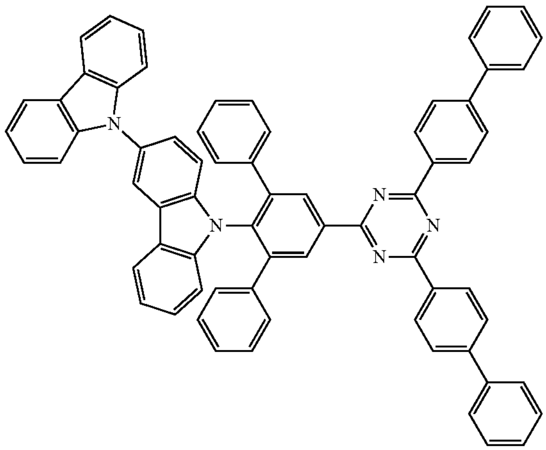
267
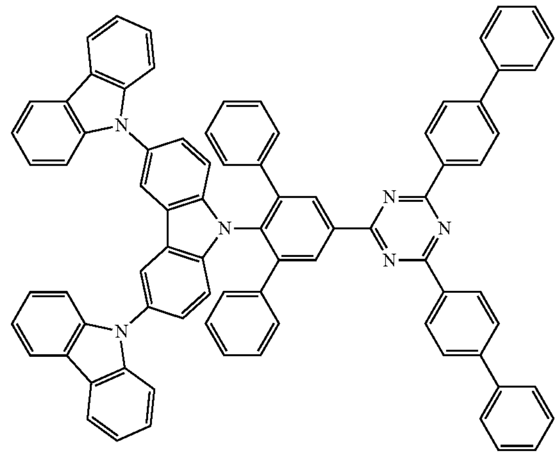
268
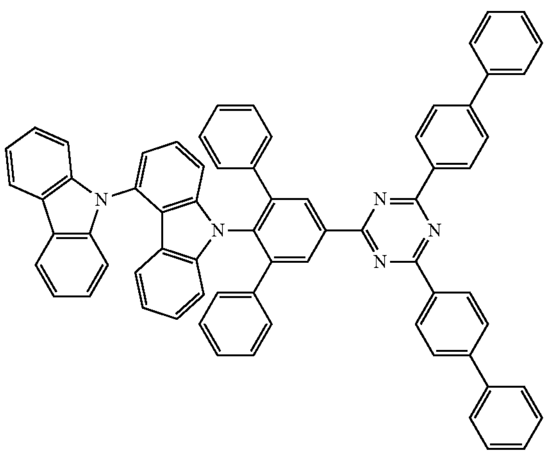
269
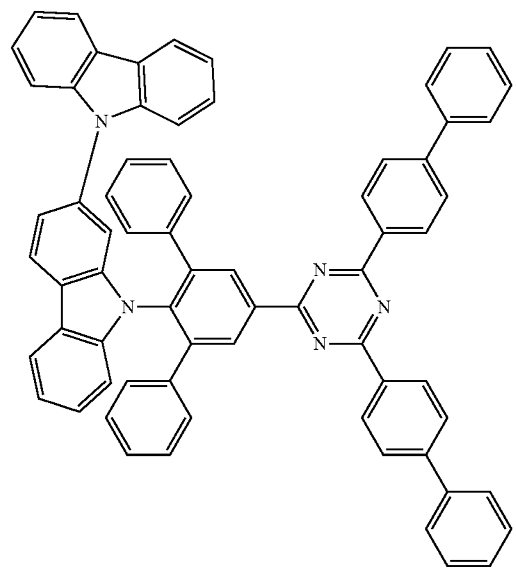
270
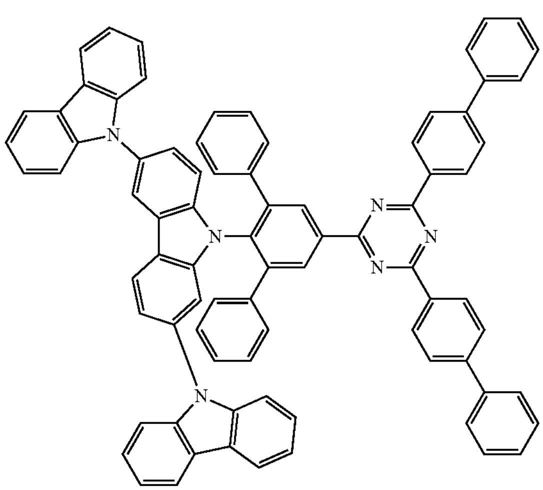
271
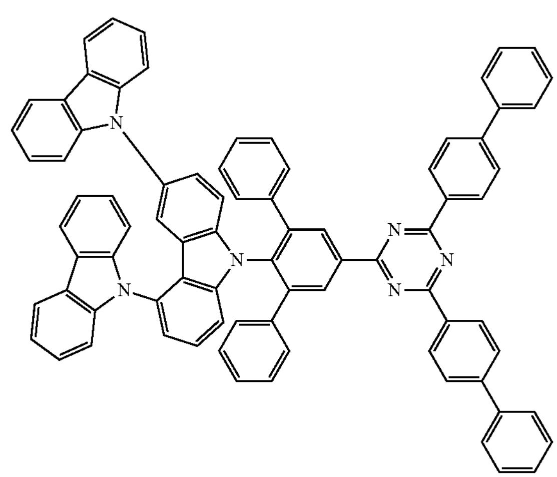

-continued
272
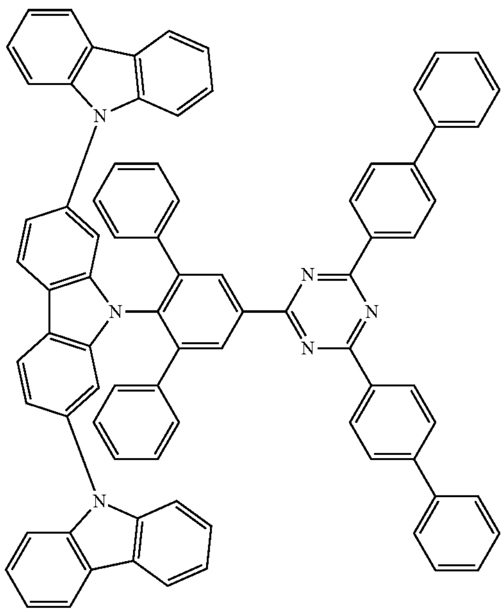
273
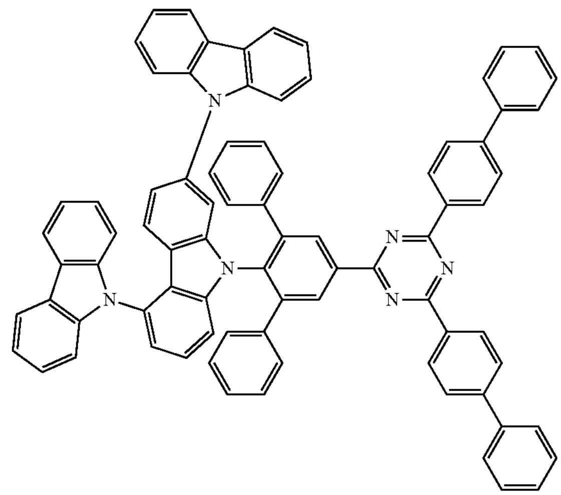
274
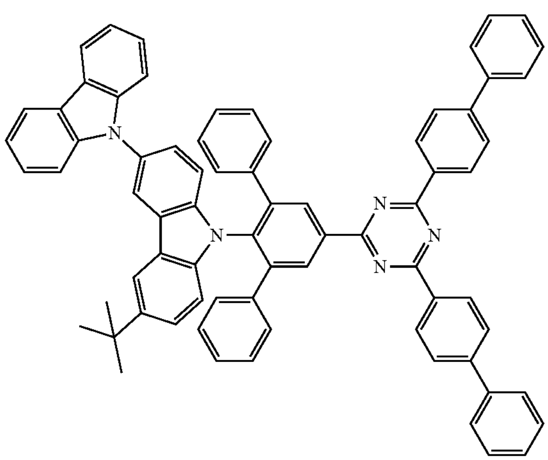
275
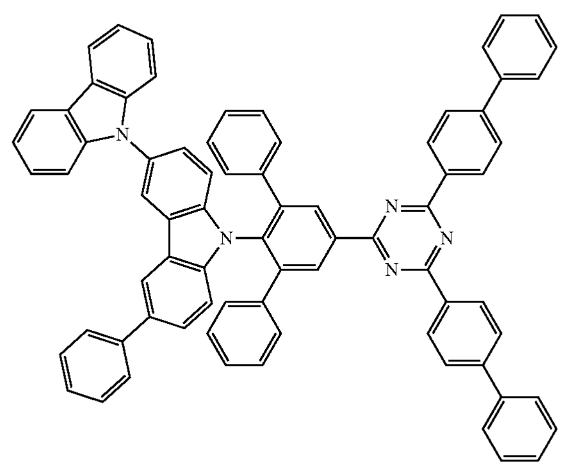
276
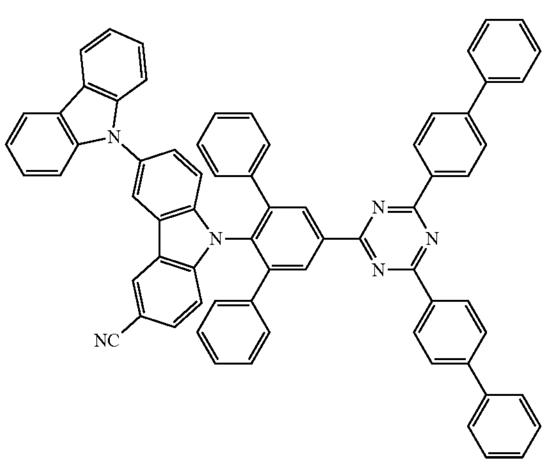
277
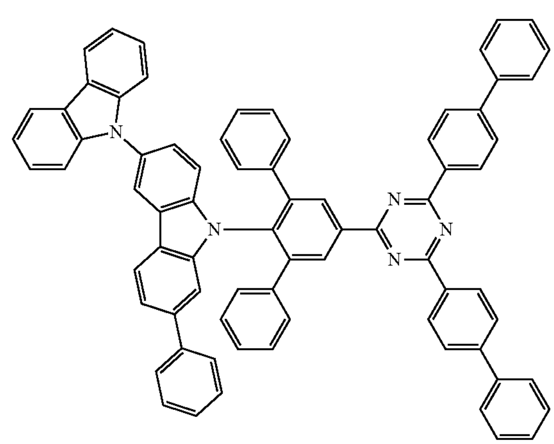

-continued
278
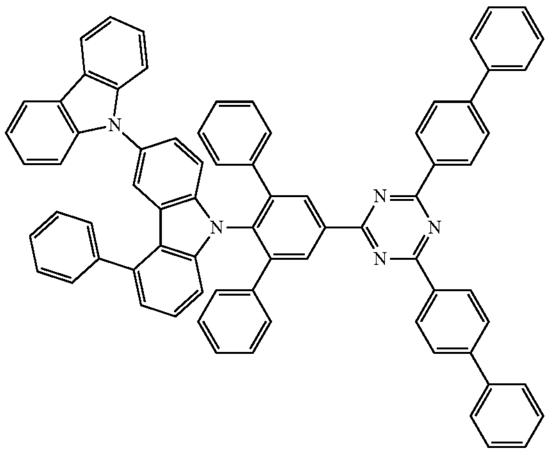
279
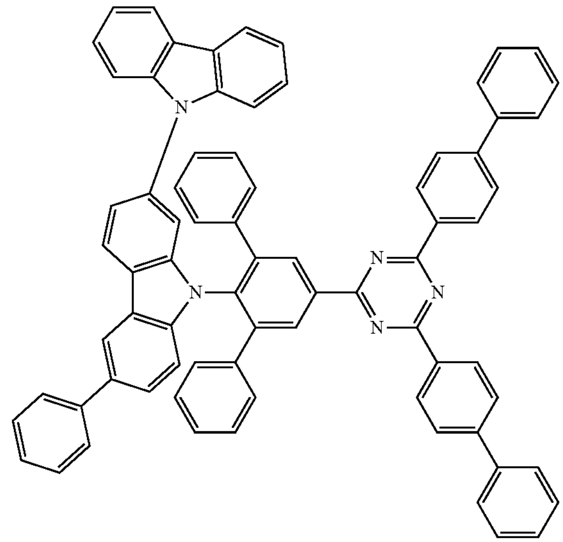
280
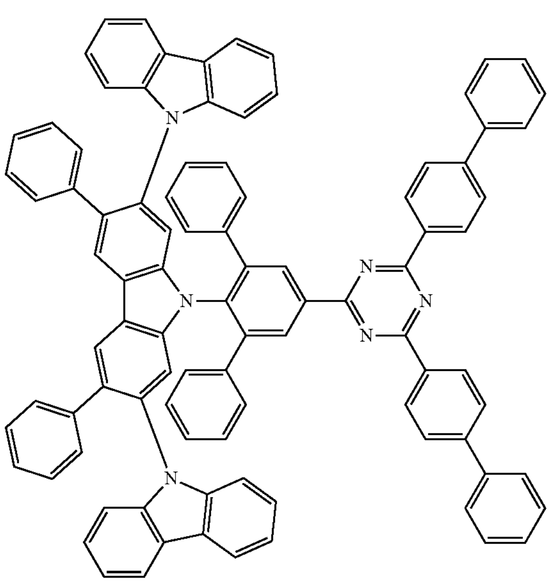
281
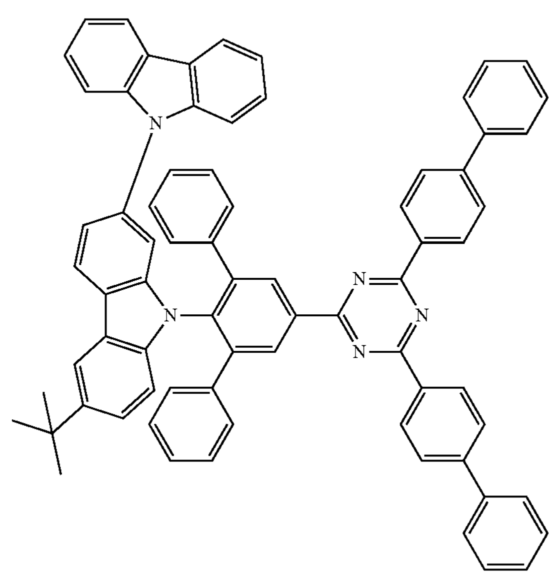

-continued
282
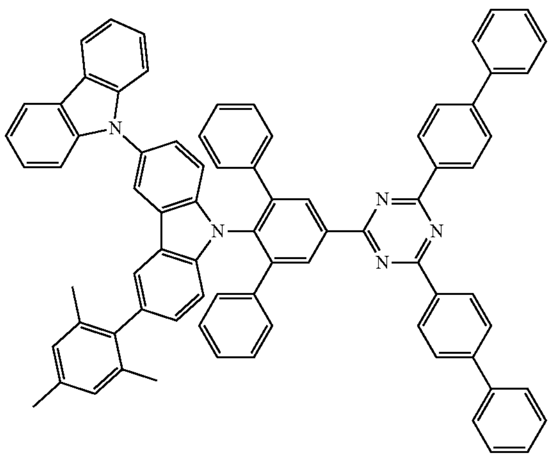
283
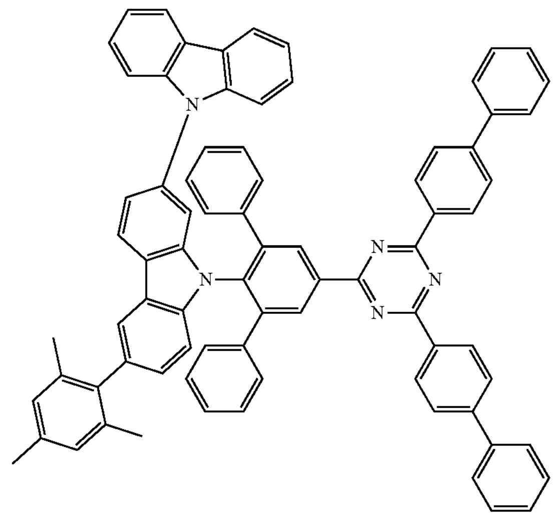
284
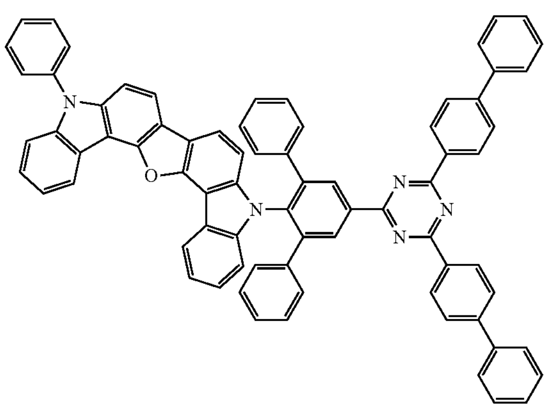
285
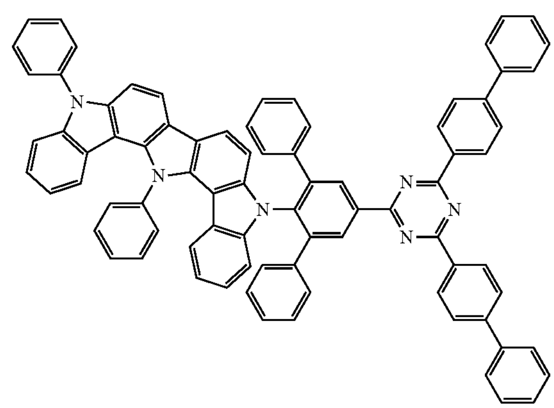
286
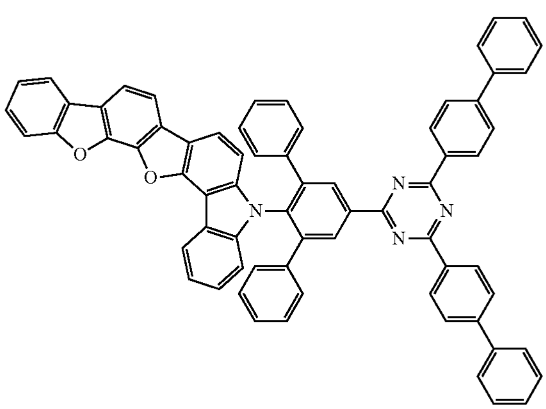
287
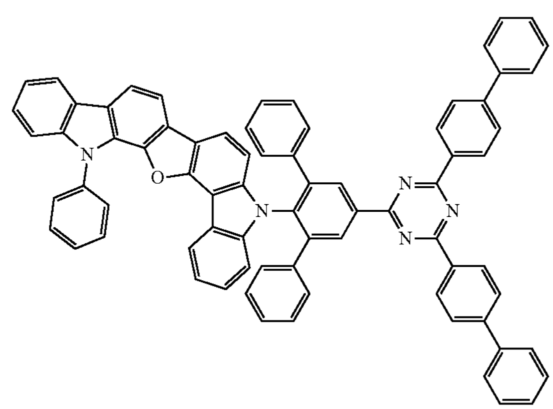

-continued
268
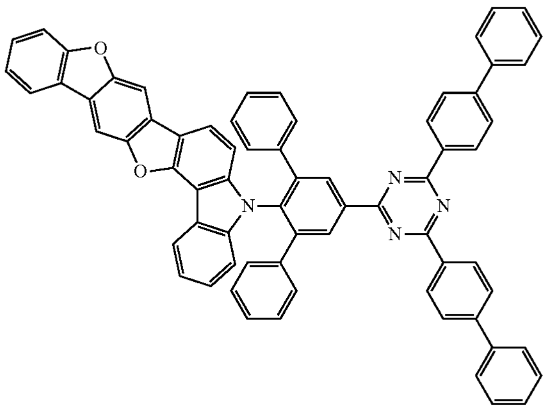
269
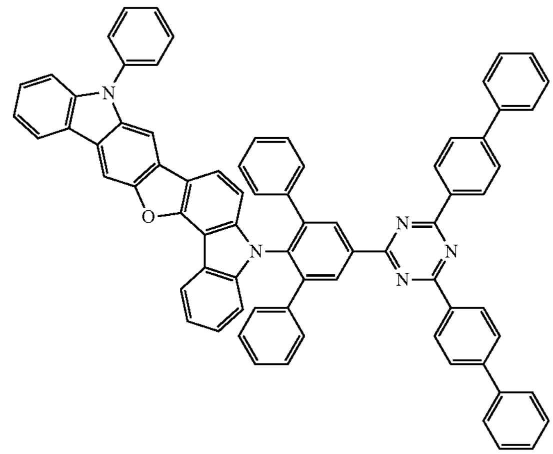
290
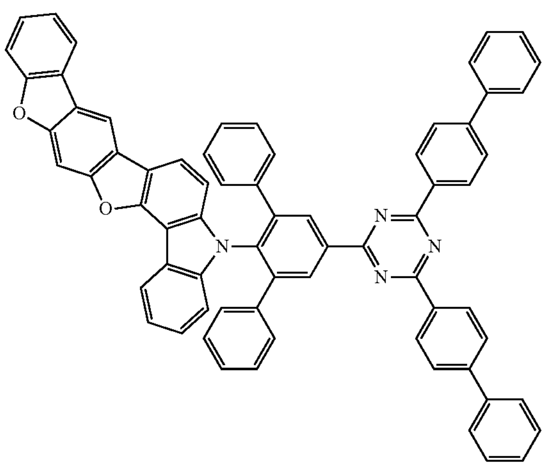
291
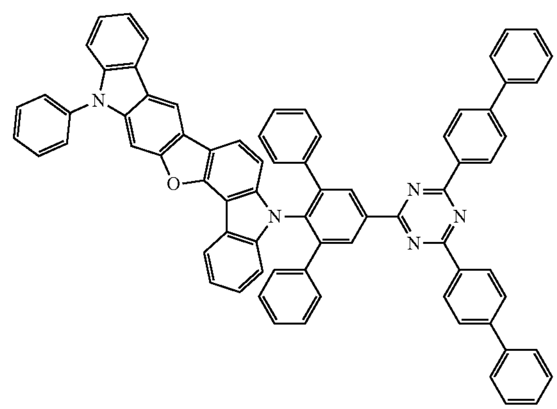
292
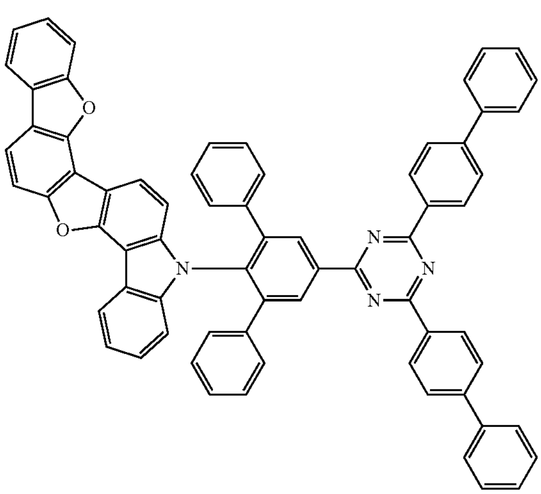
293
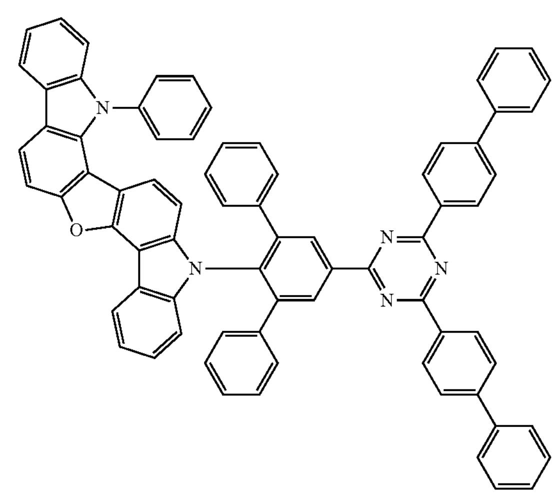

-continued
294
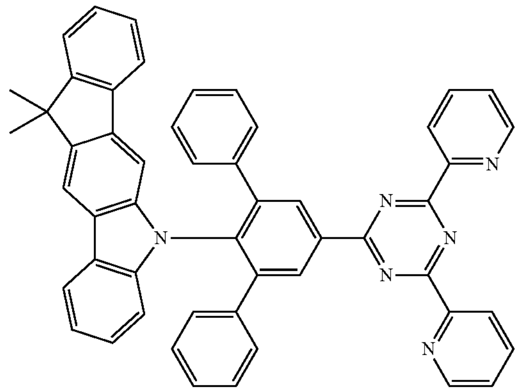
295
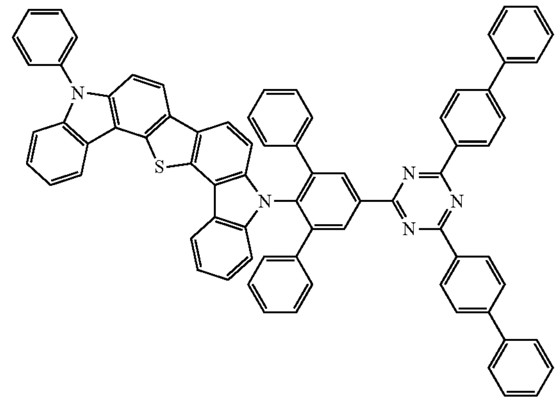
296
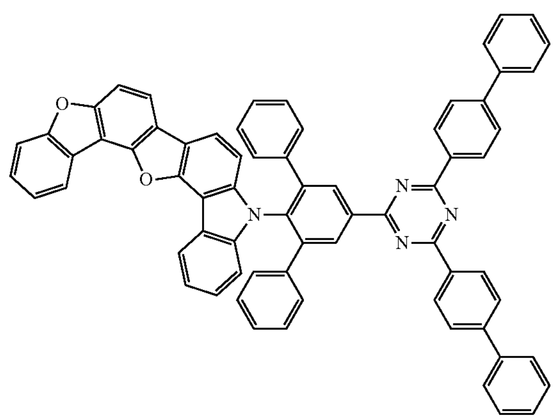
297
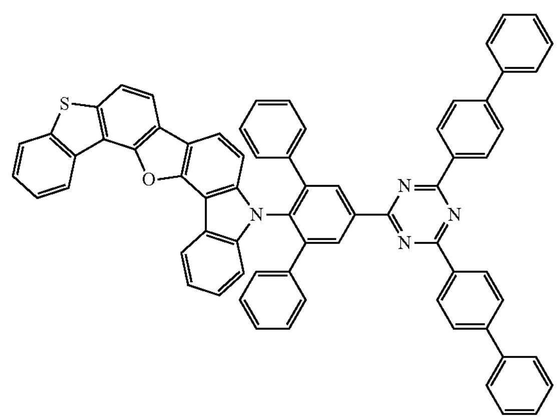
298
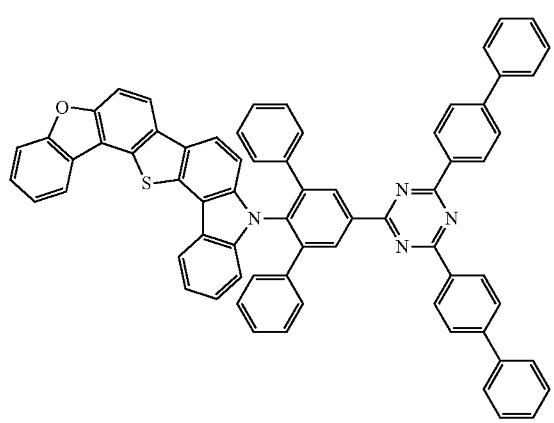
299
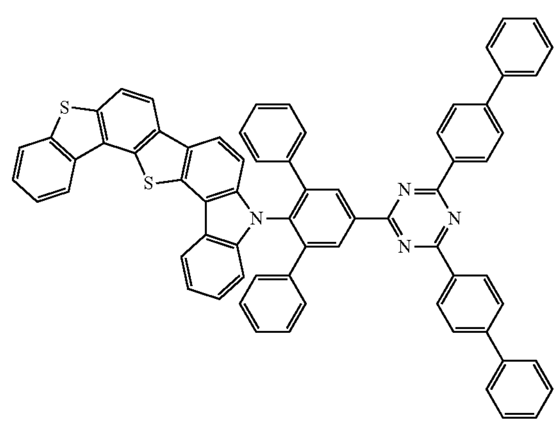

-continued
300
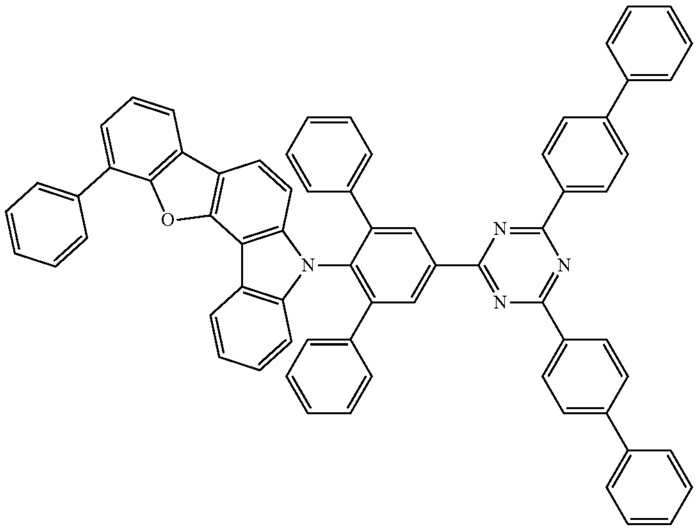
301
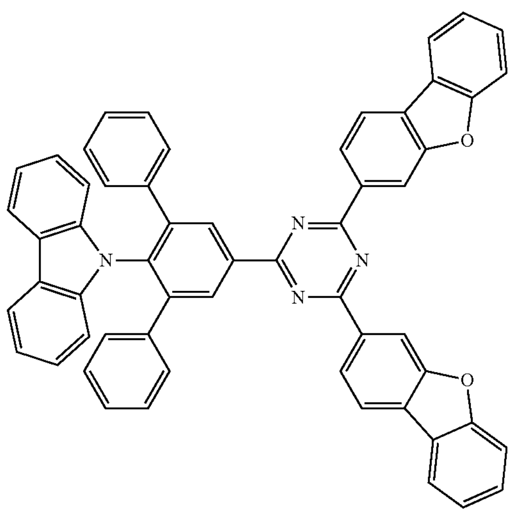
302
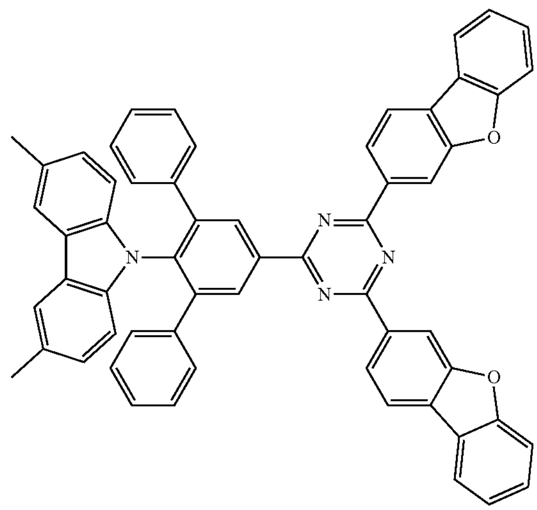
303
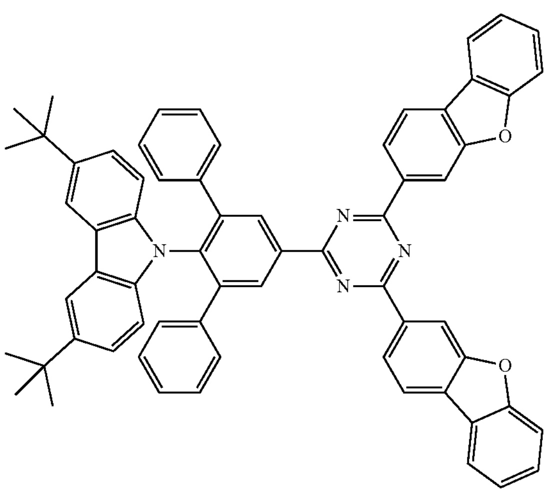
304
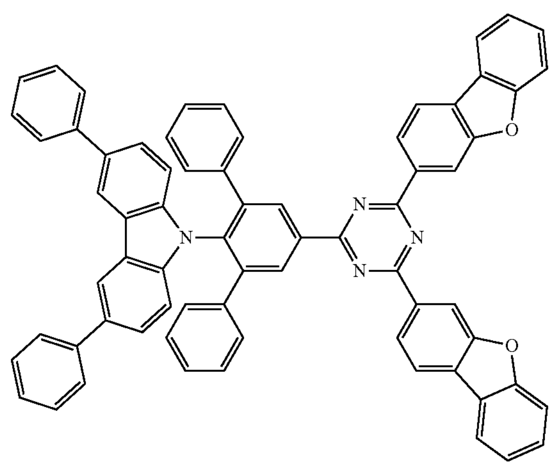

-continued
305
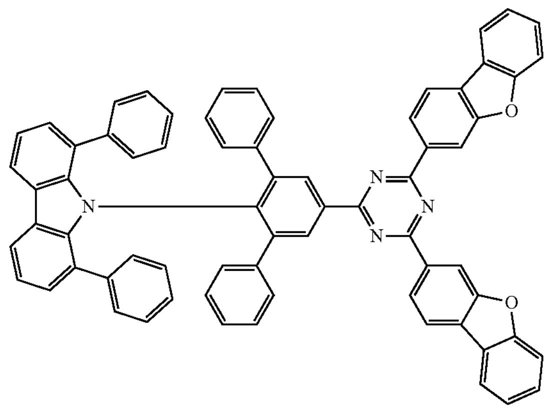
306
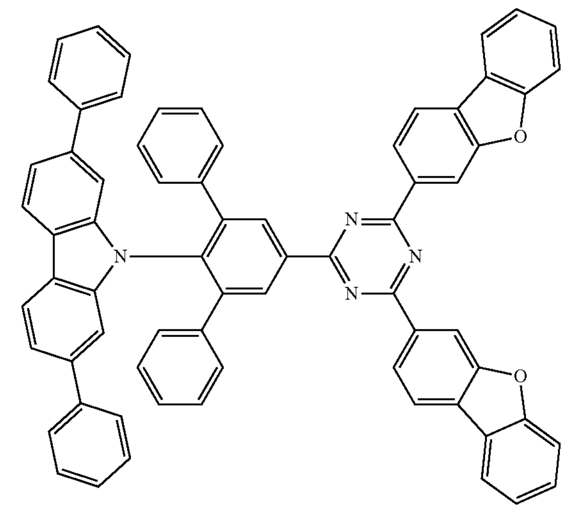
307
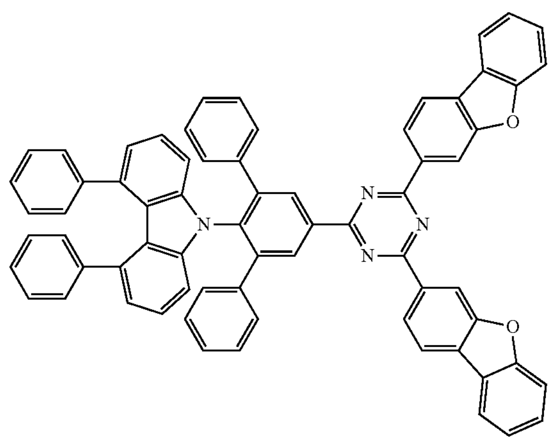
308
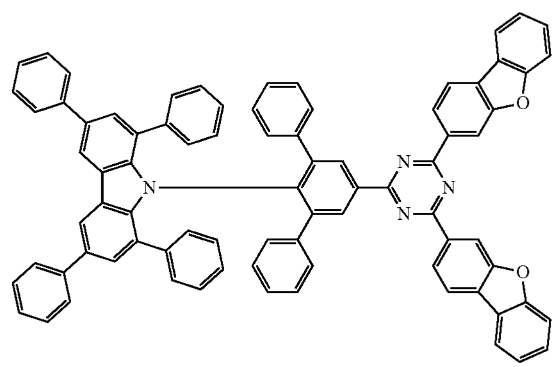
309
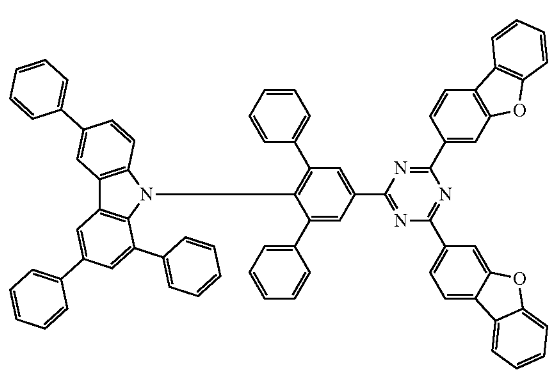
310
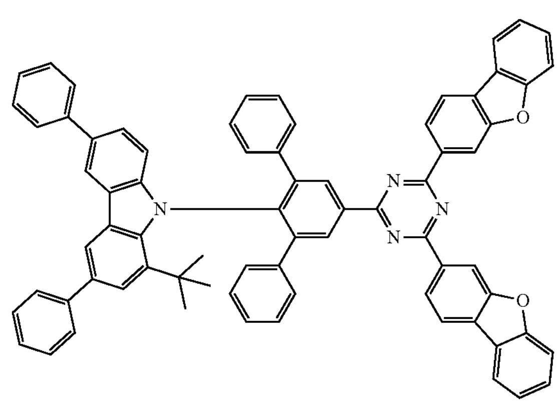

-continued
311
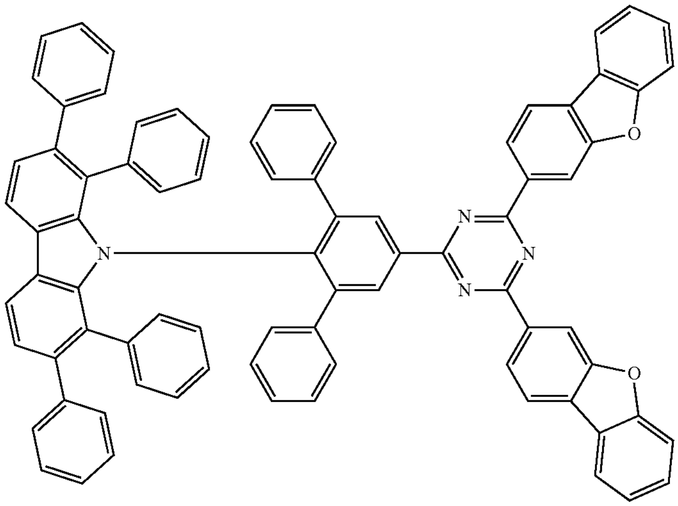
312
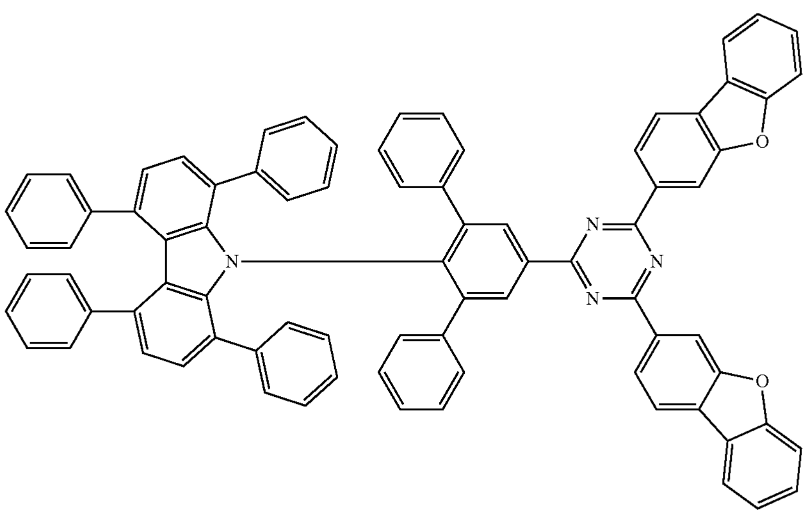
313
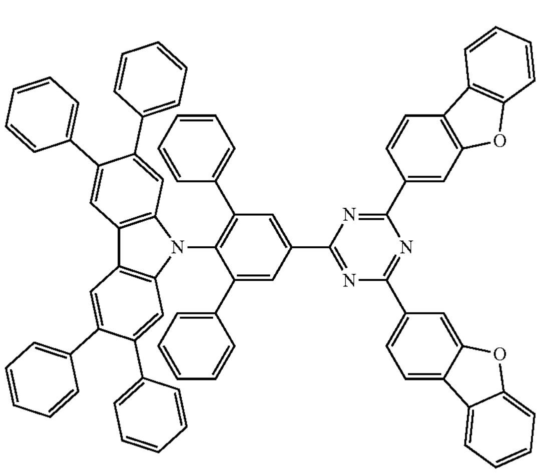
314
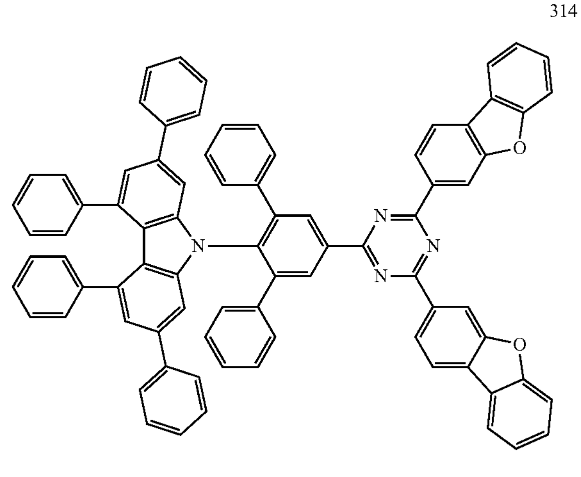

-continued
315
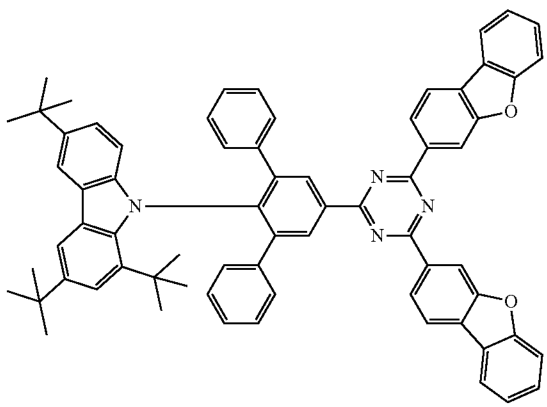
316
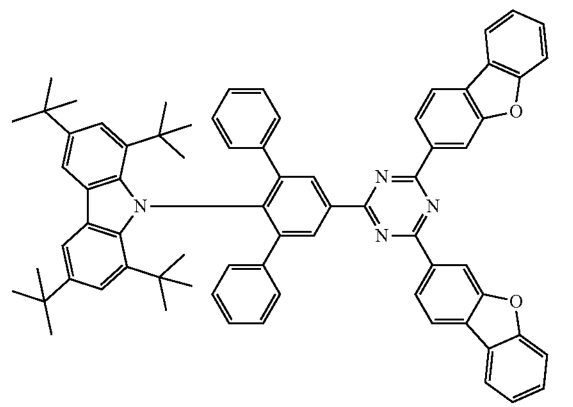
317
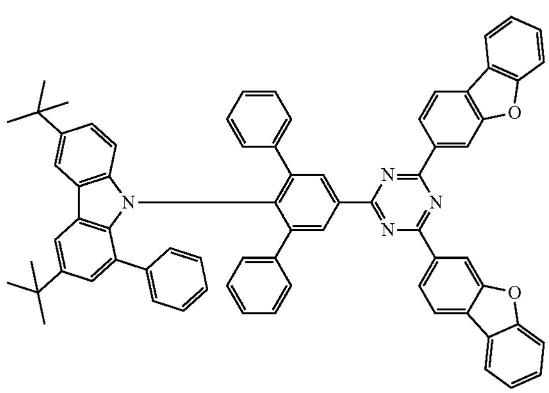
318
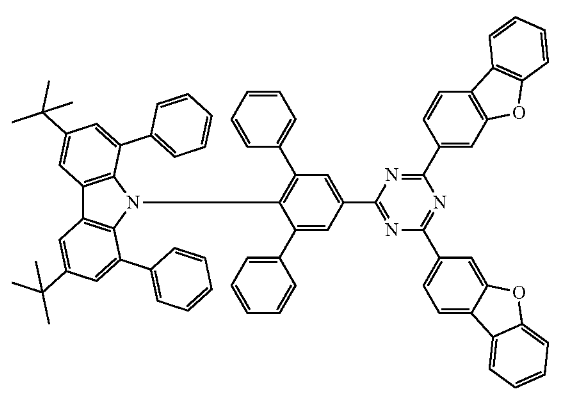
319
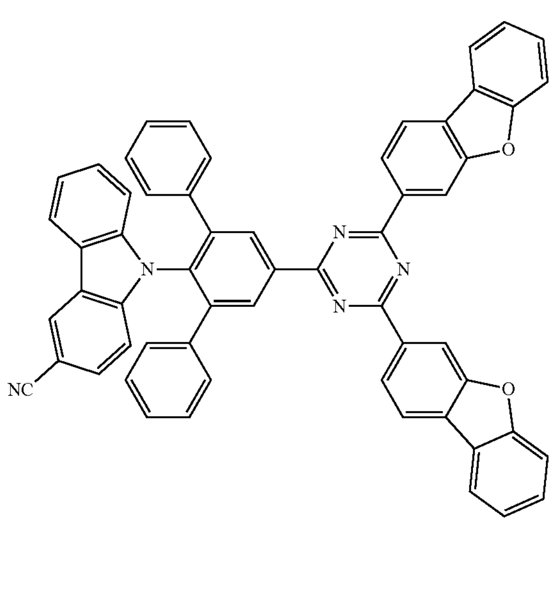
320
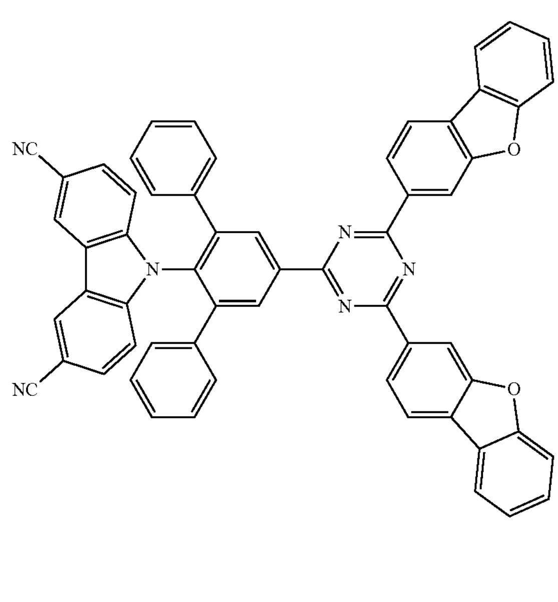

-continued
321
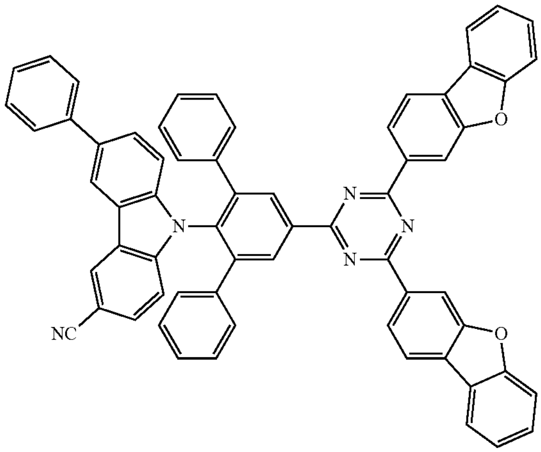
322
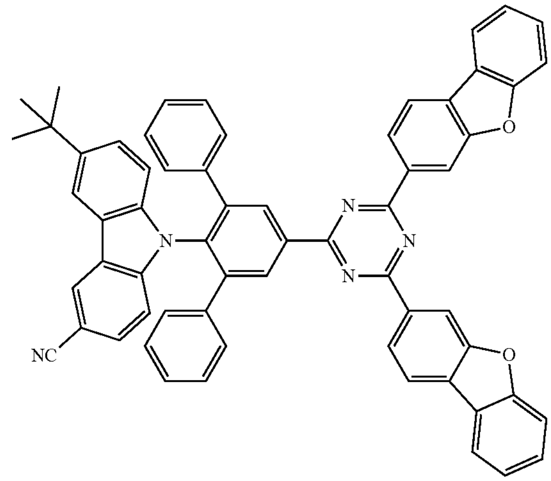
323
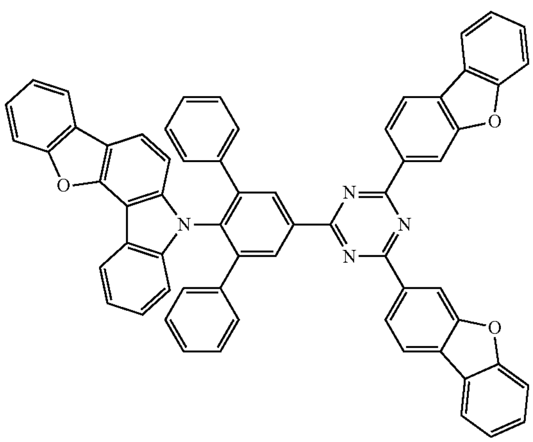
324
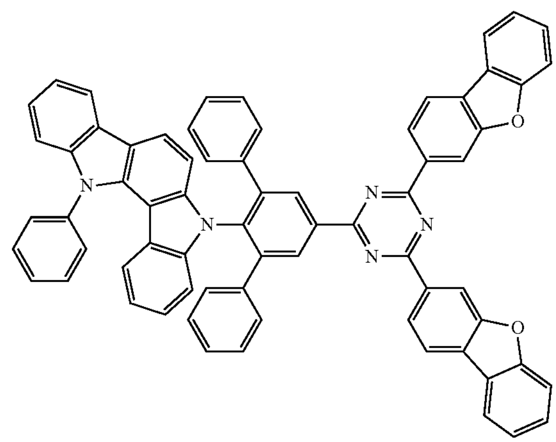
325
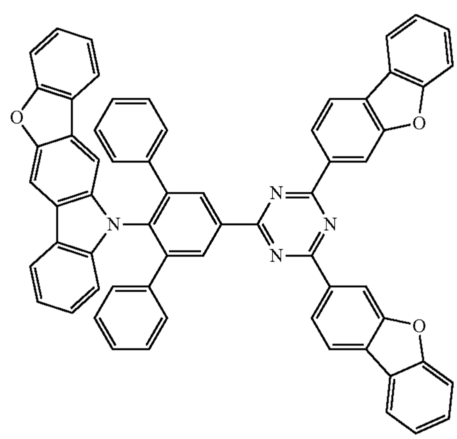
326
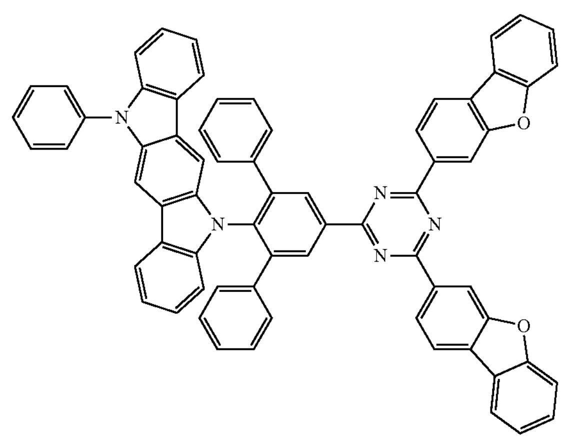

-continued
327
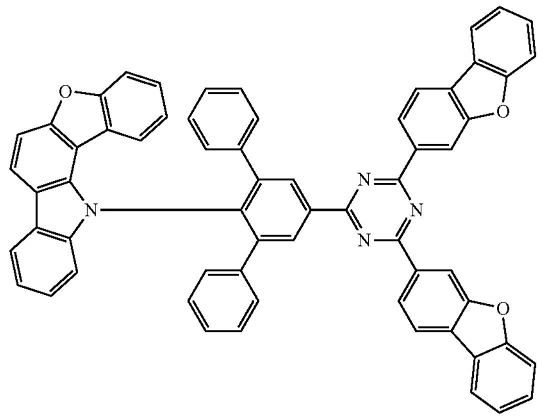
328
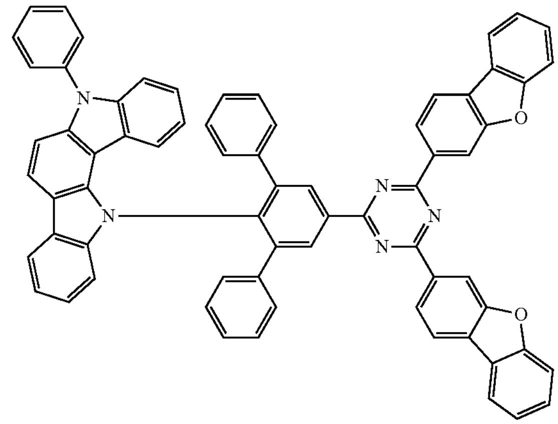
329
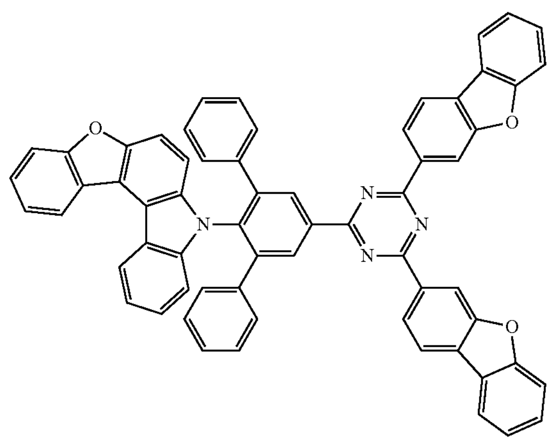
330
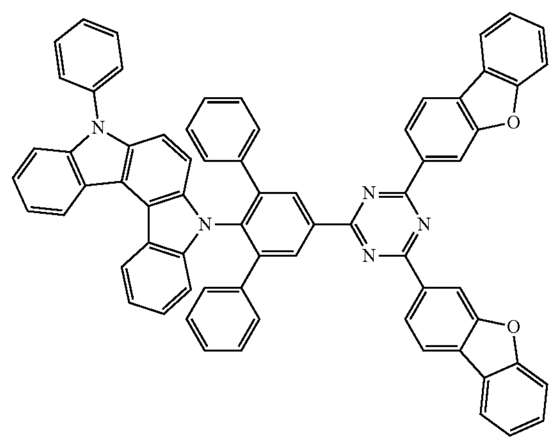
331
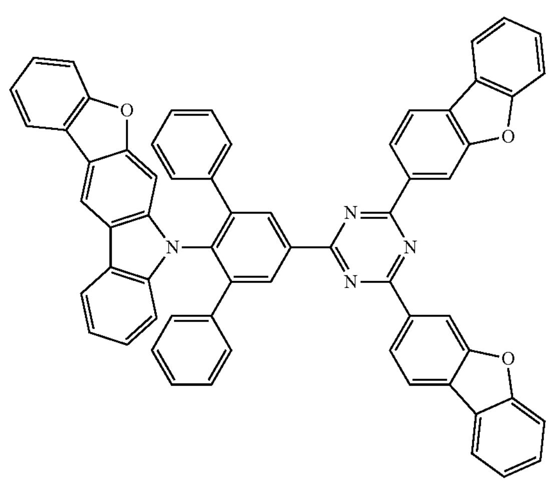
332
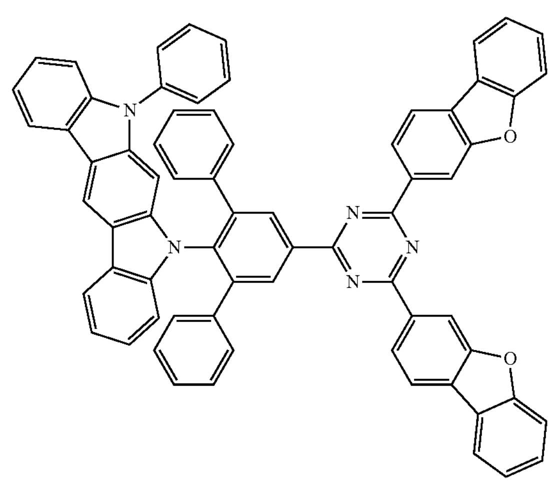

-continued
333
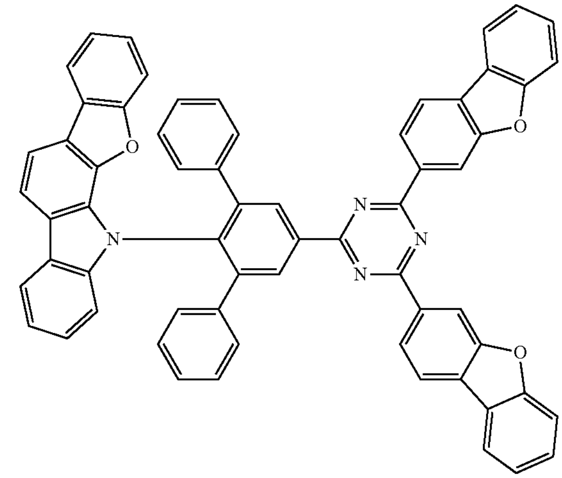
334
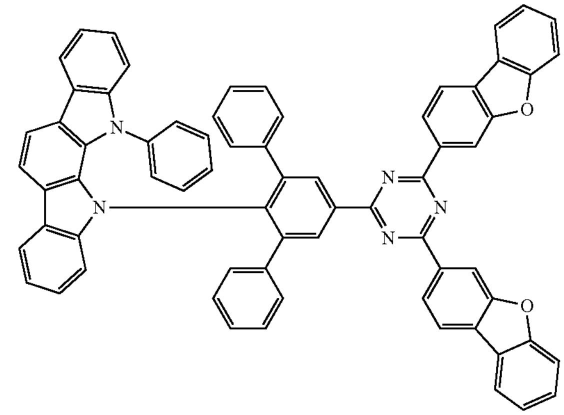
335
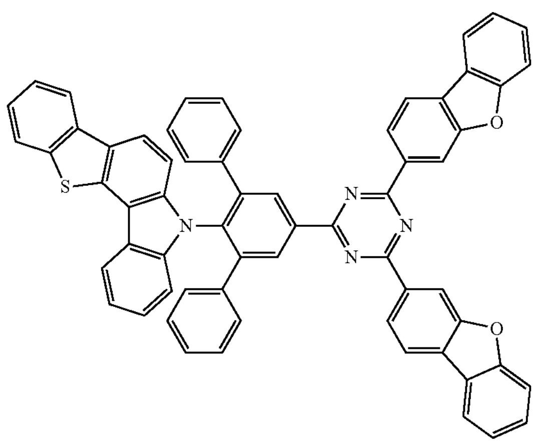
336
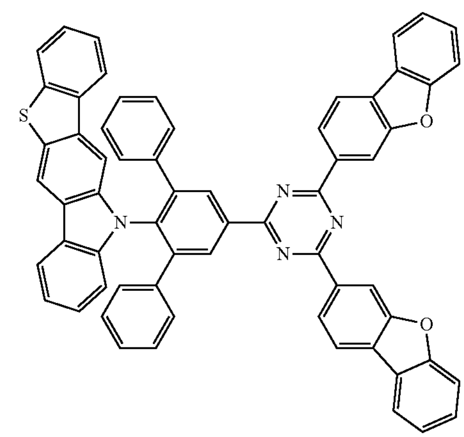
337
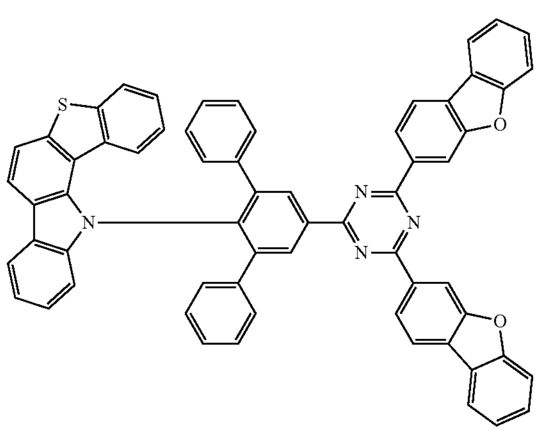
338
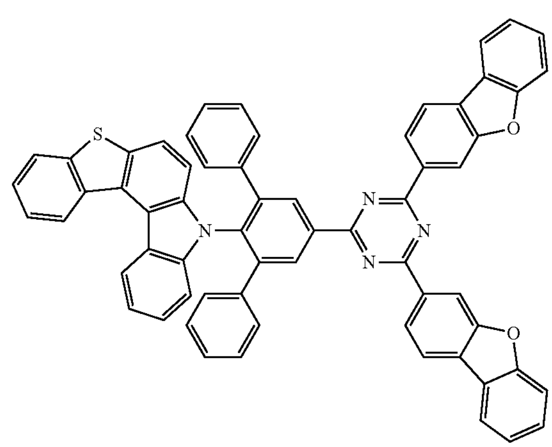

-continued
339
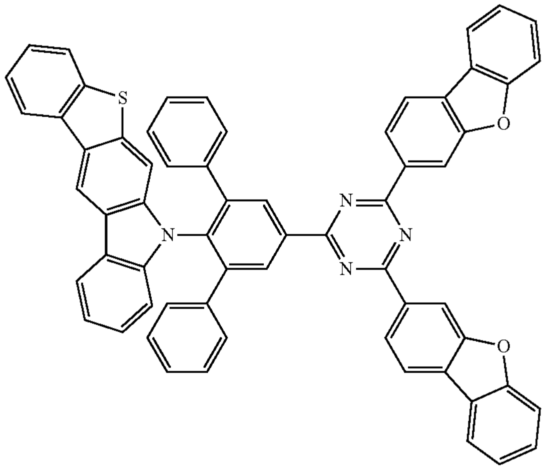
340
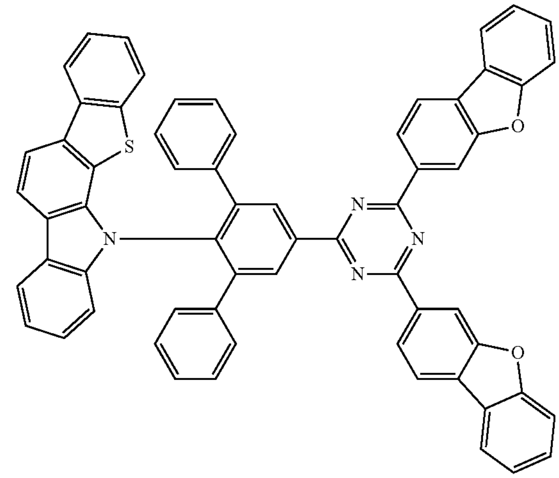
341
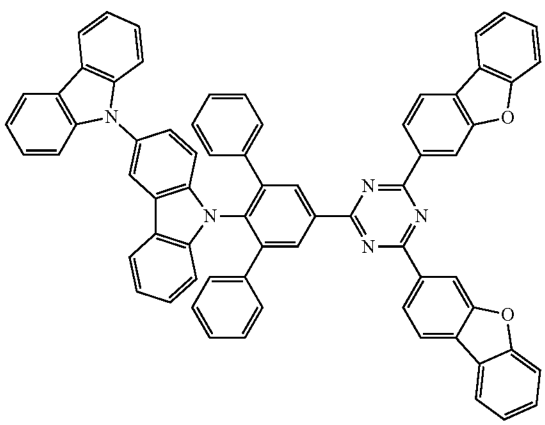
342
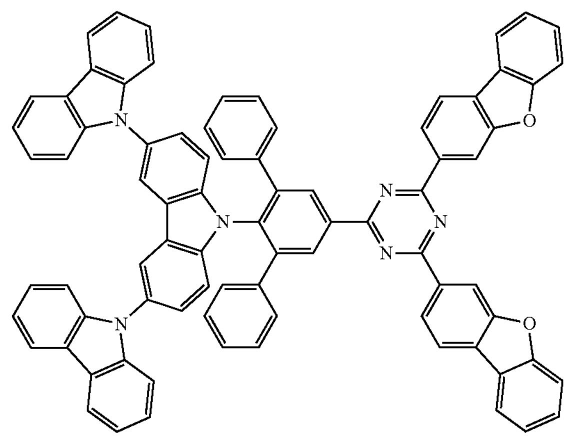
343
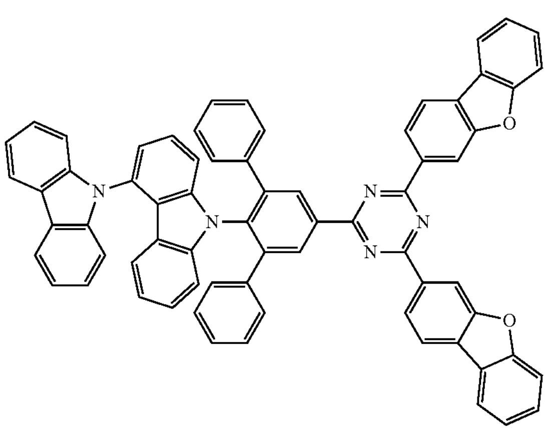
344
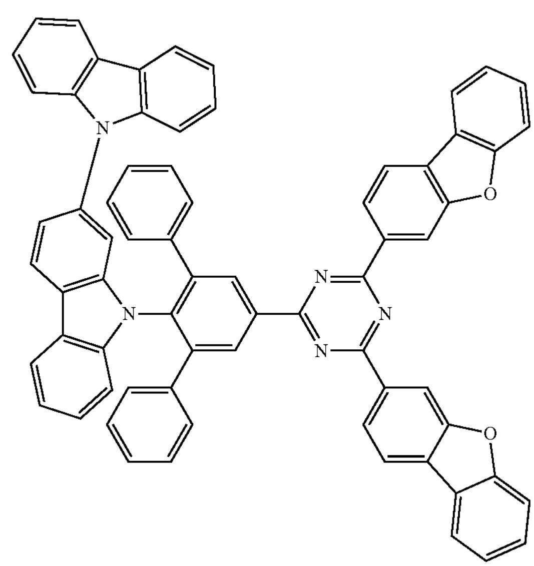

-continued
345
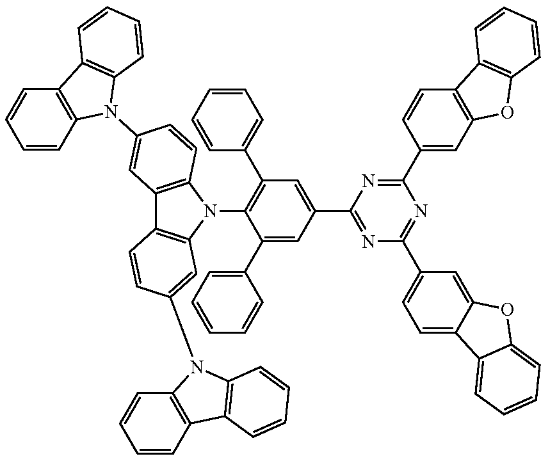
346
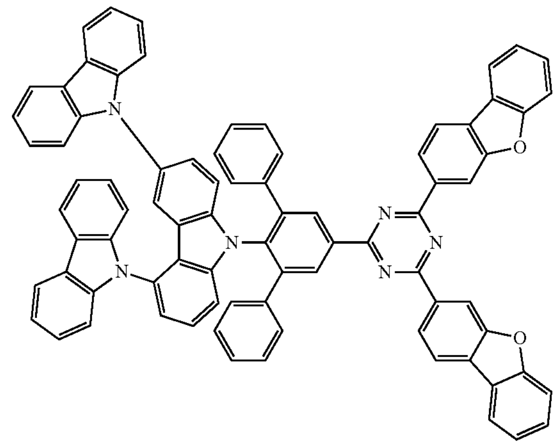
347
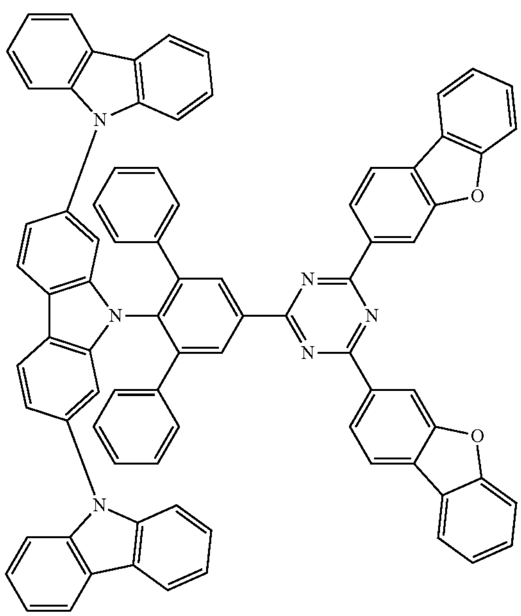
348
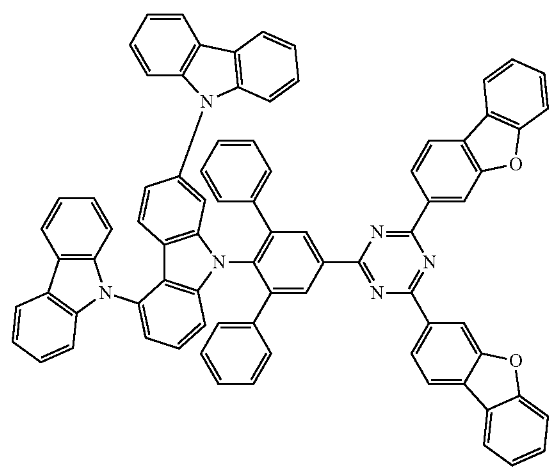
349
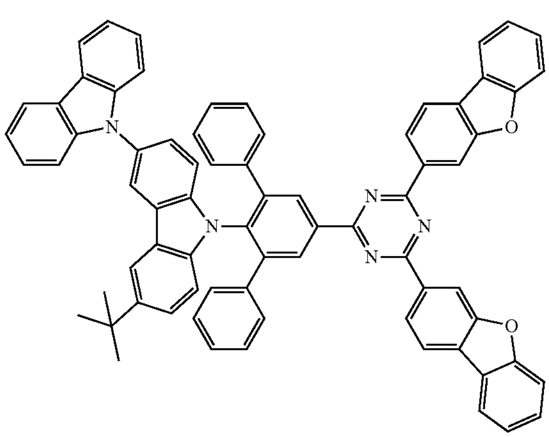
350
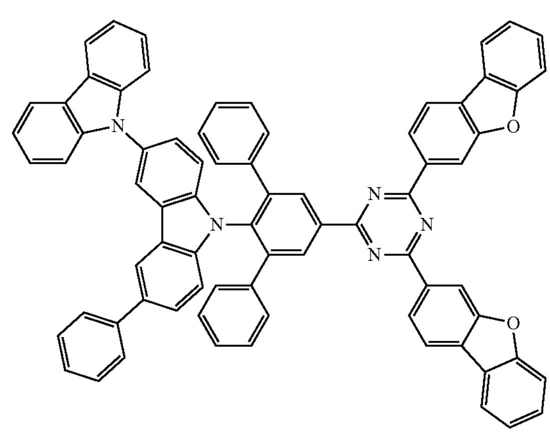

-continued
351
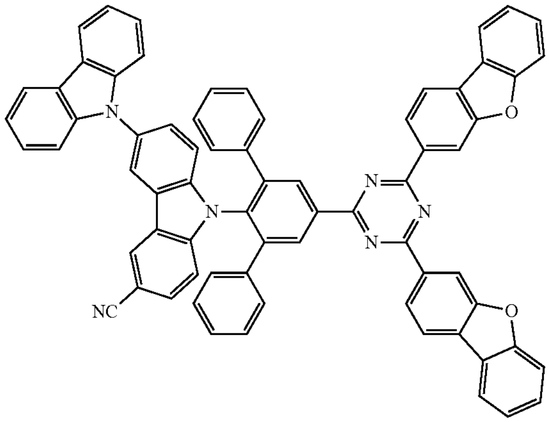
352
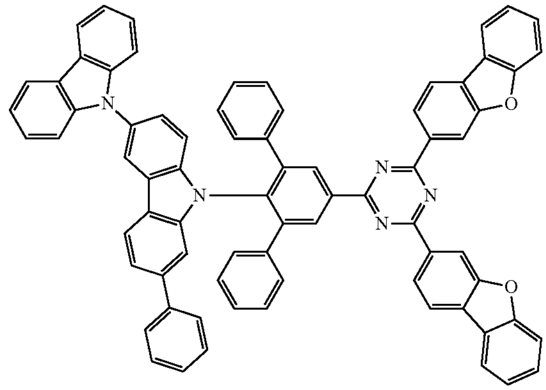
353
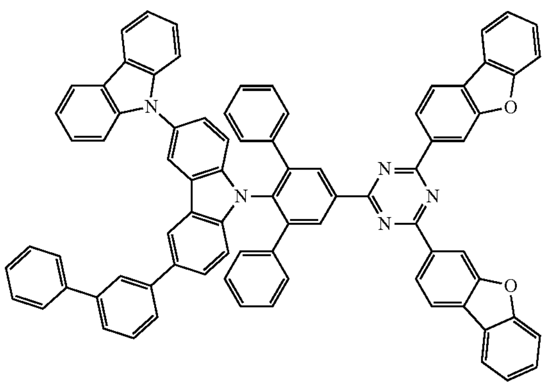
354
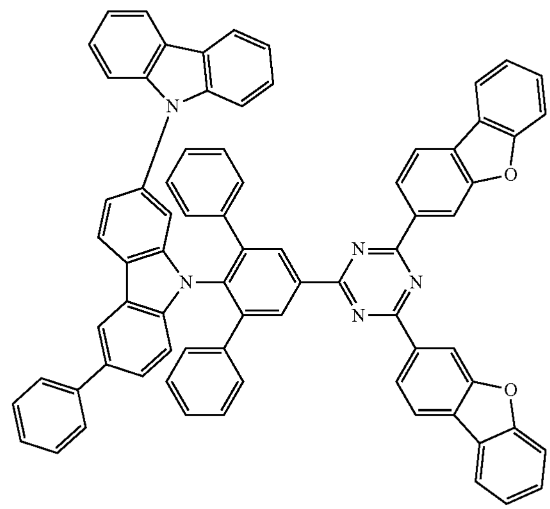
355
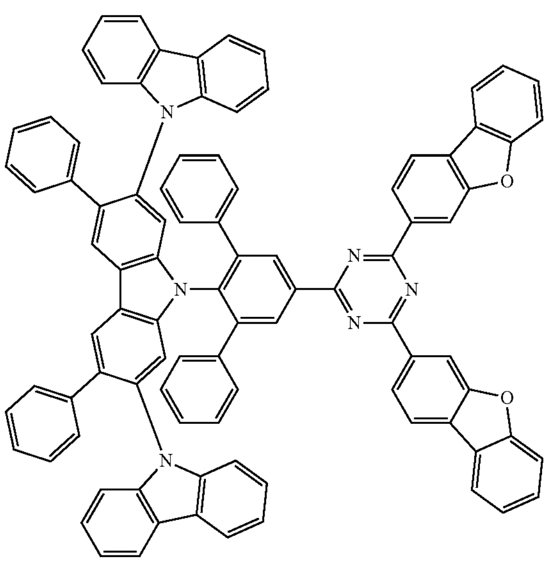
356
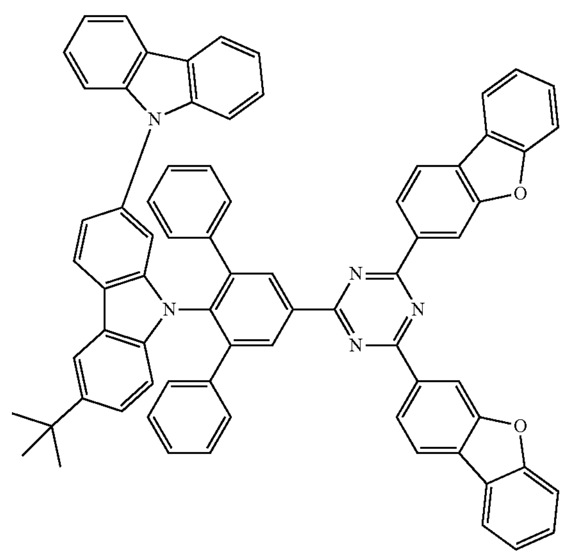

-continued
357
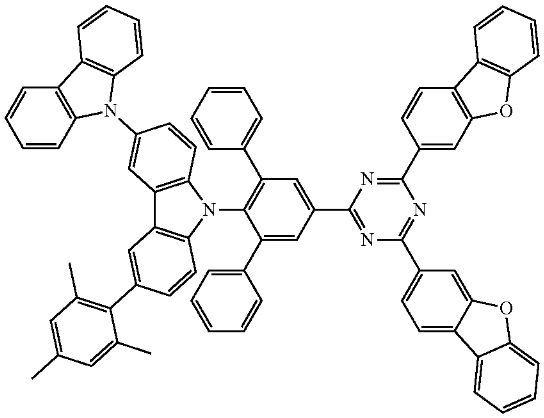
358
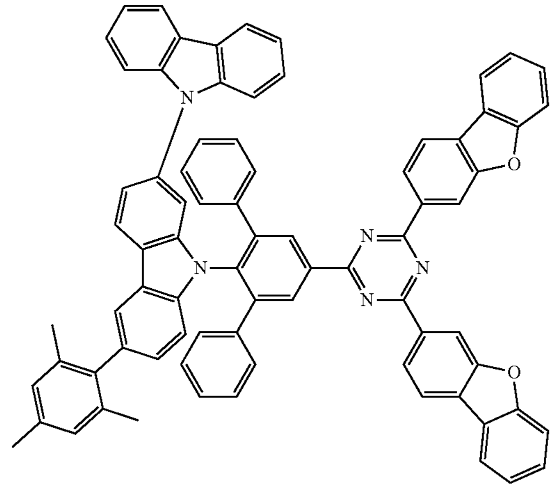
359
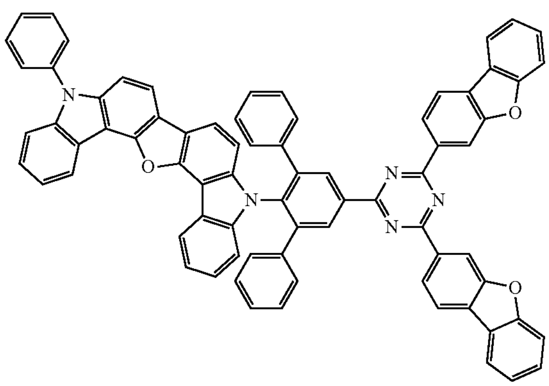
360
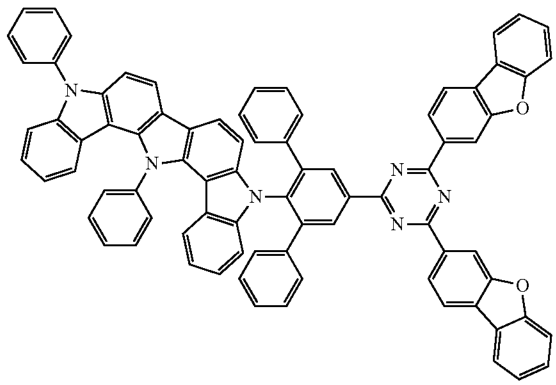
361
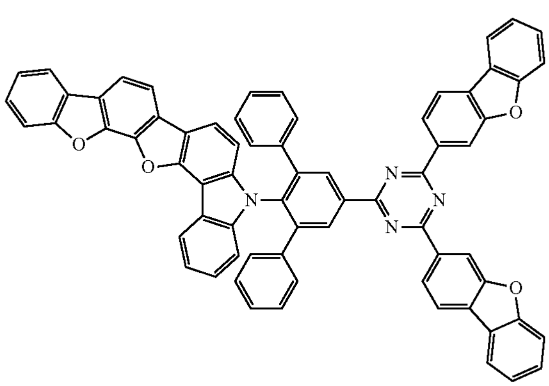
362
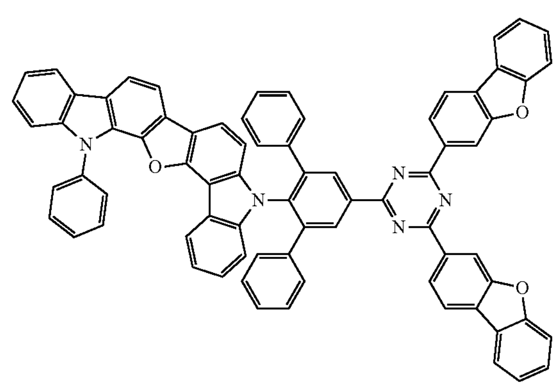

-continued
363
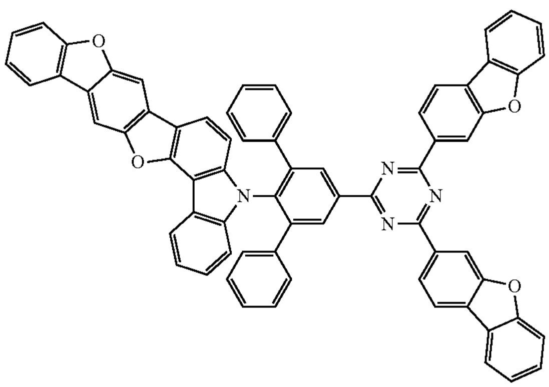
364
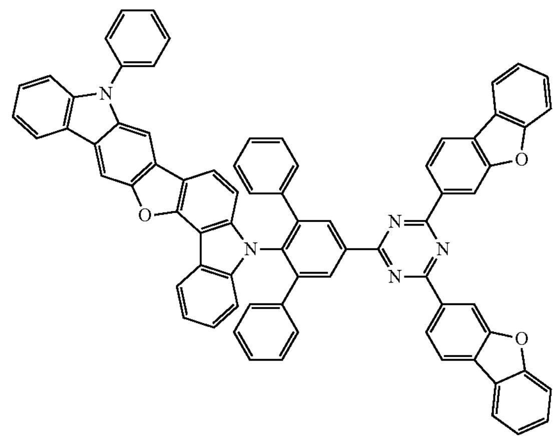
365
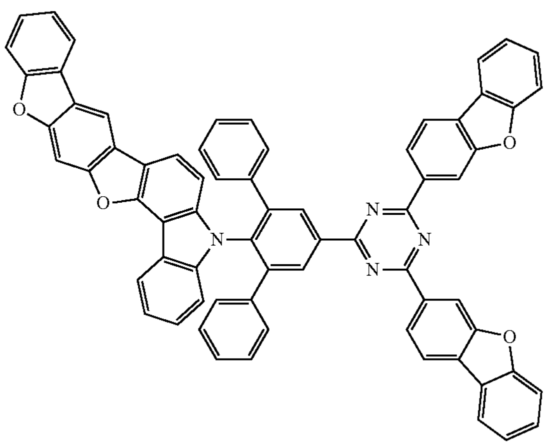
366
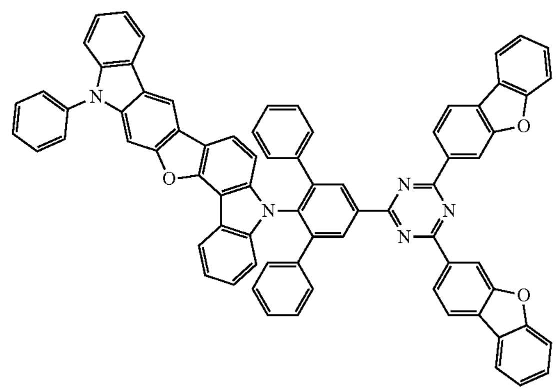
367
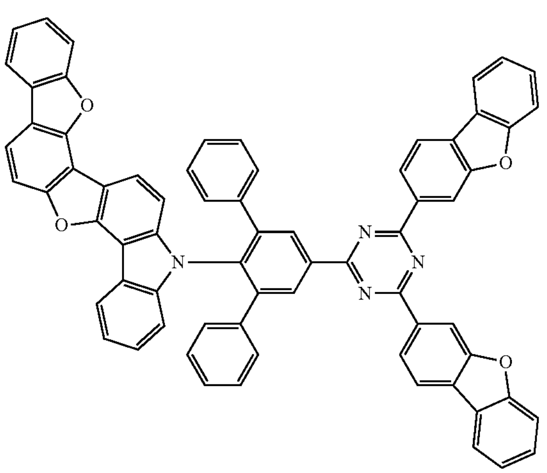
368
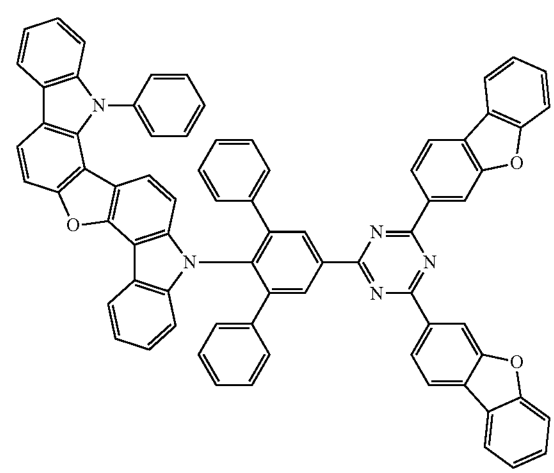

-continued
369
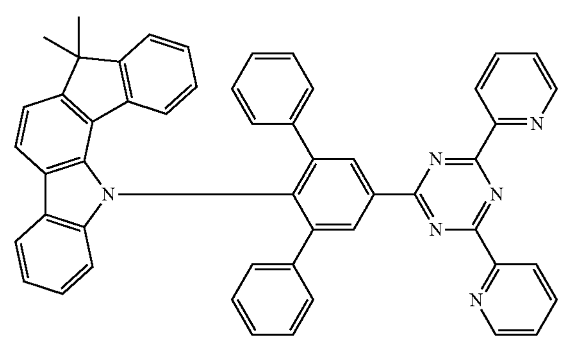
370
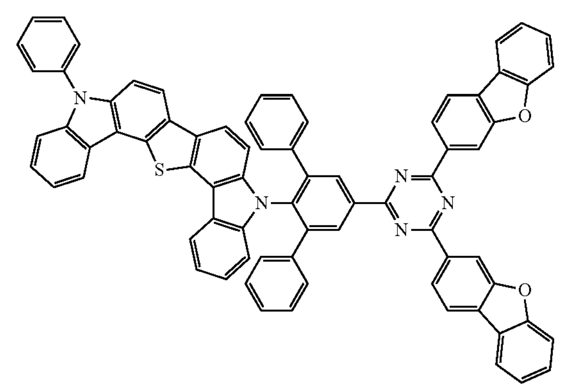
371
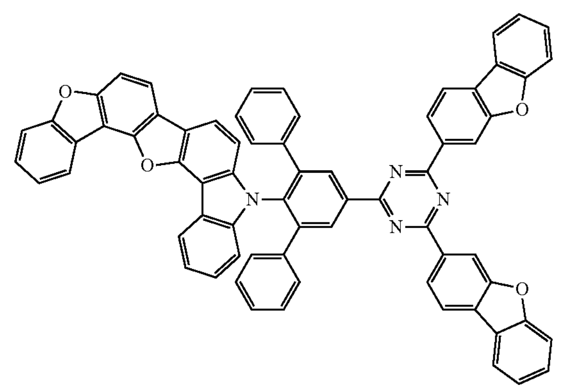
372
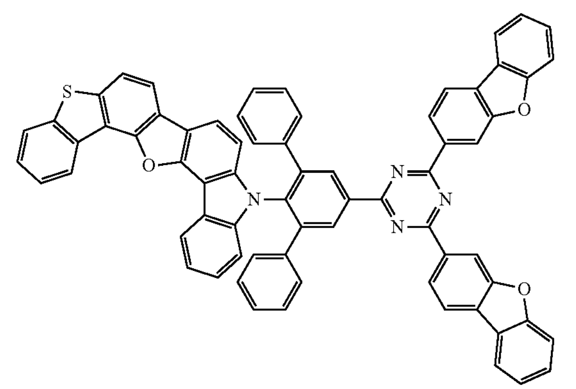
373
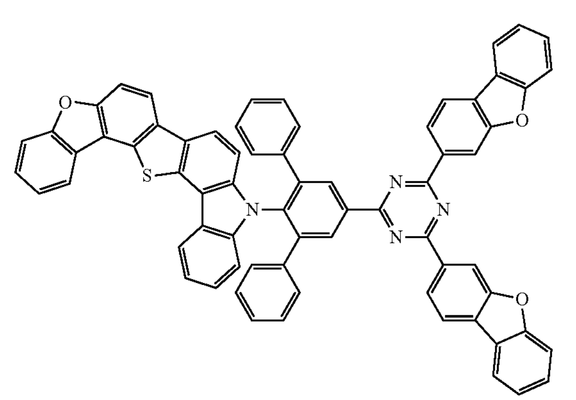
374
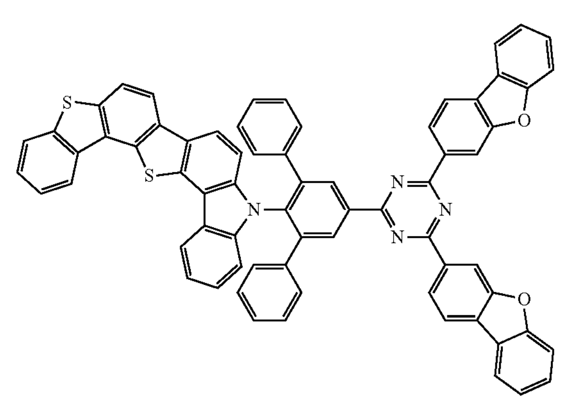

-continued
375
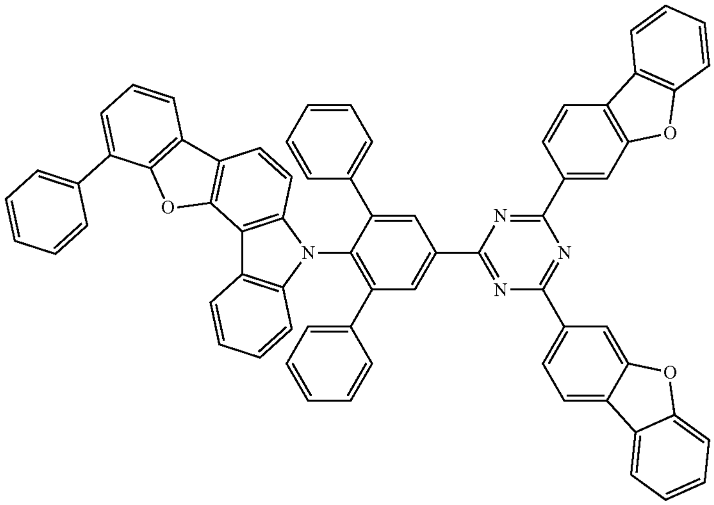
376
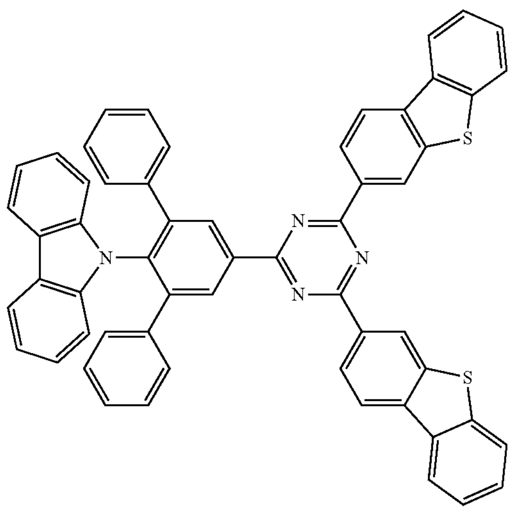
377
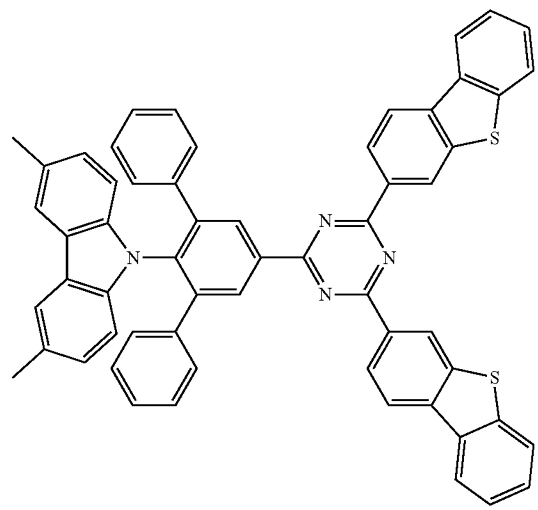
378
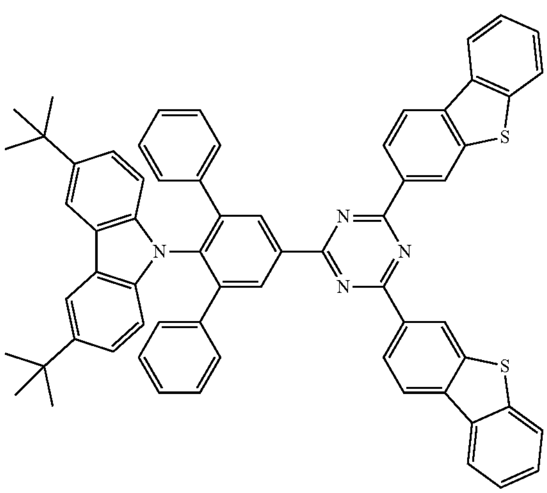
379
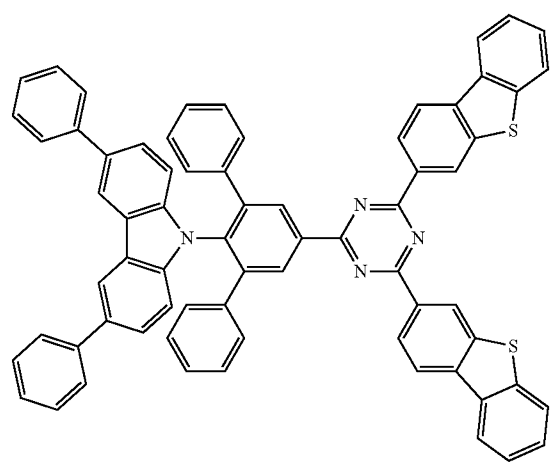

-continued
380
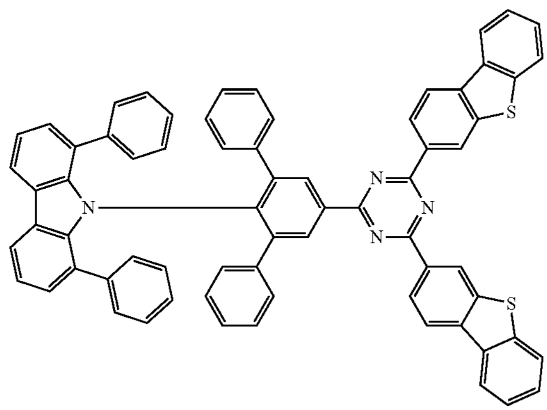
381
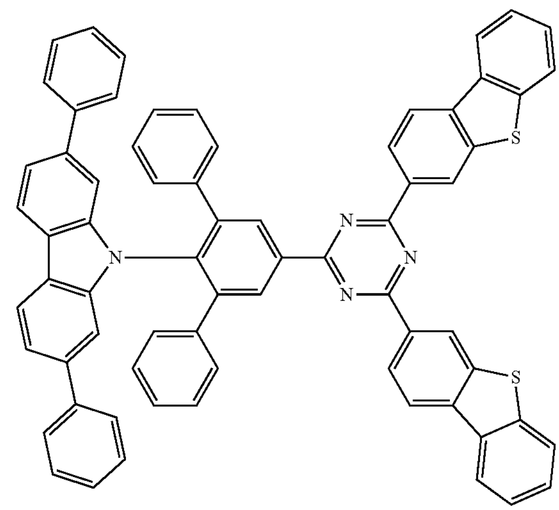
382
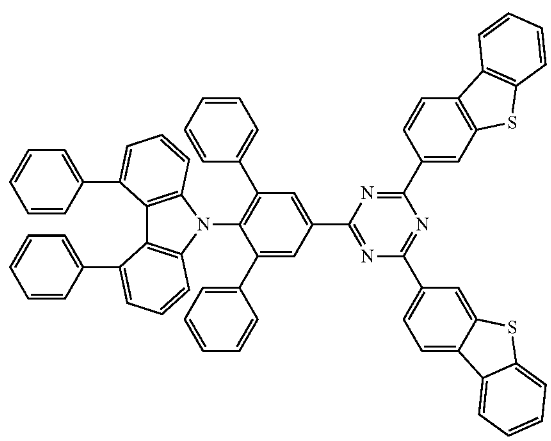
383
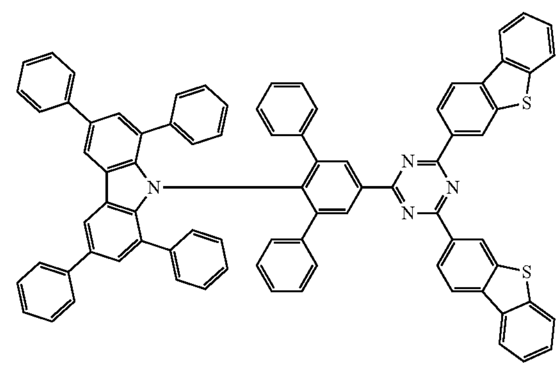
384
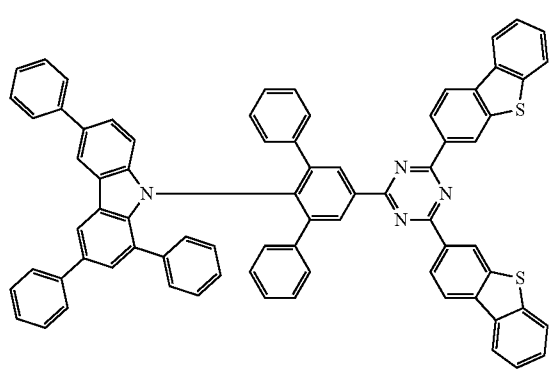
385
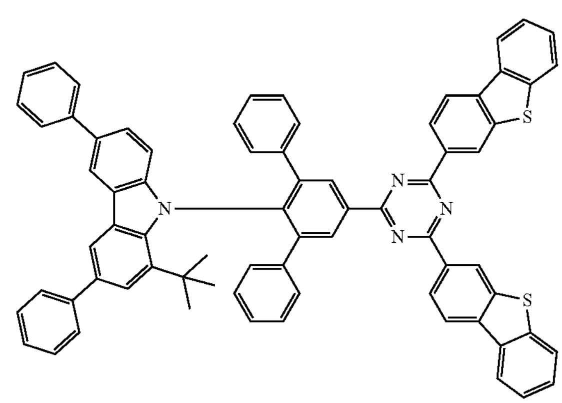

-continued
386
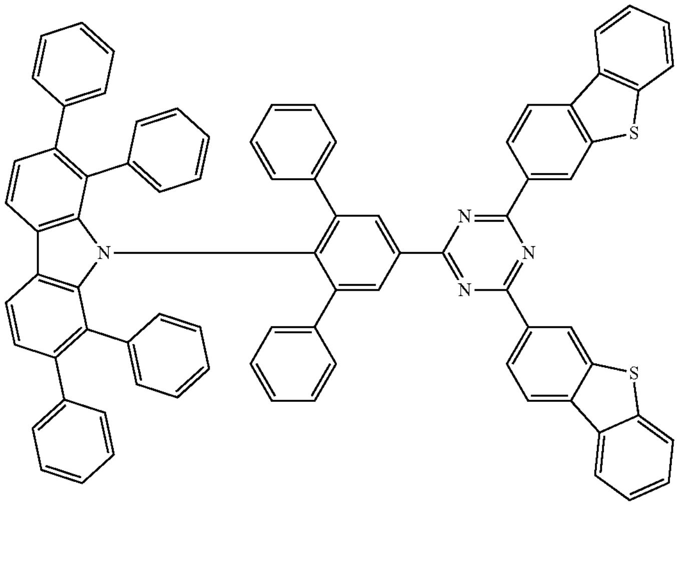
387
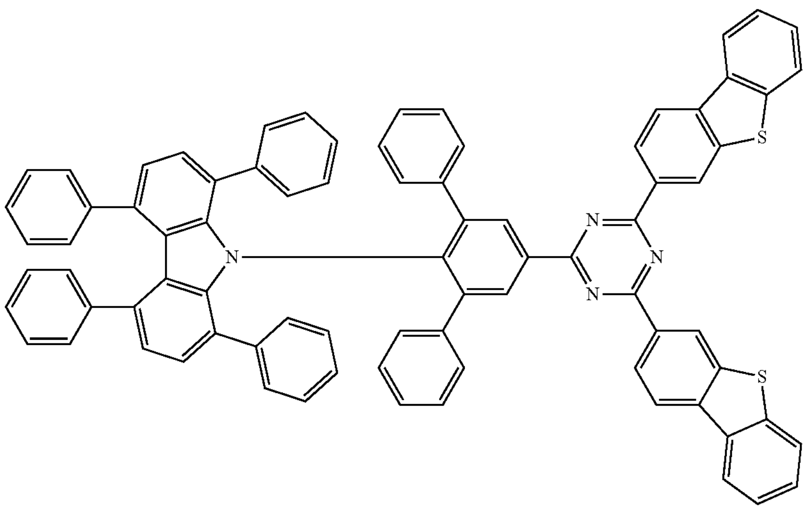
388
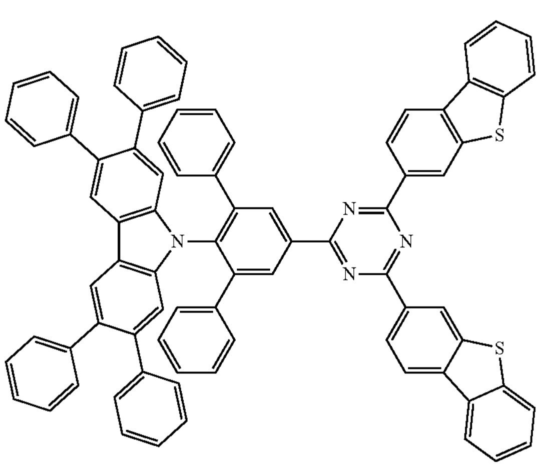
389
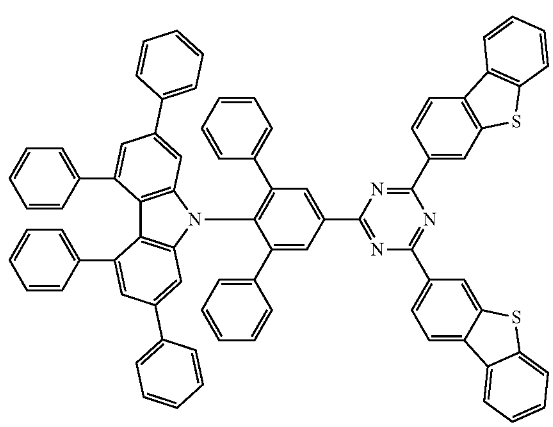

-continued
390
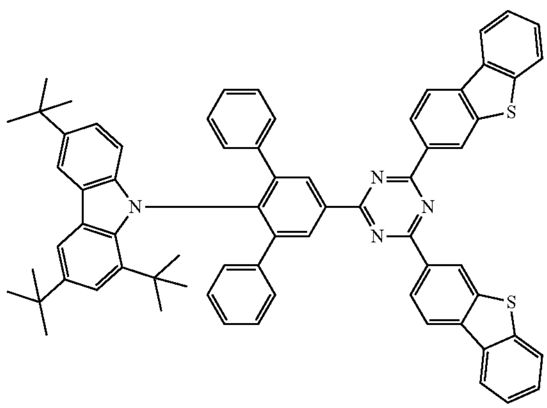
391
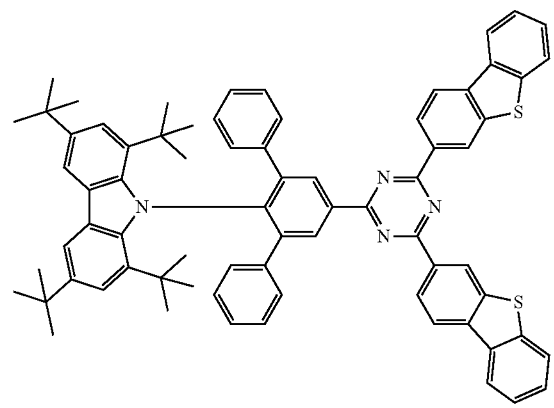
392
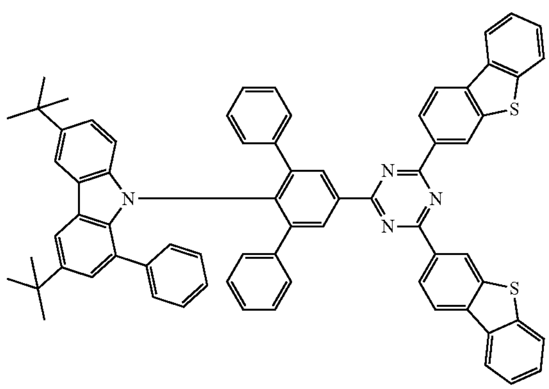
393
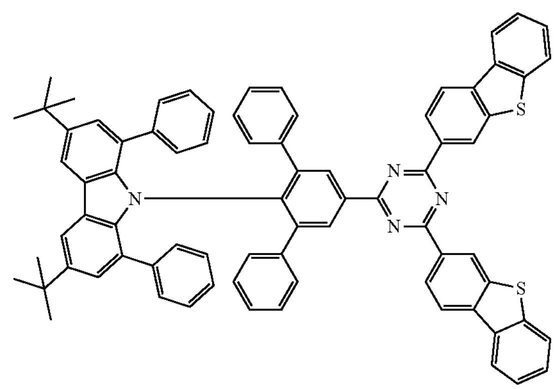
394
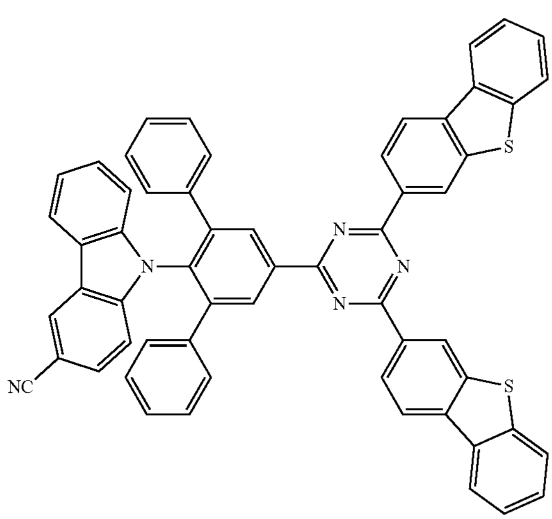
395
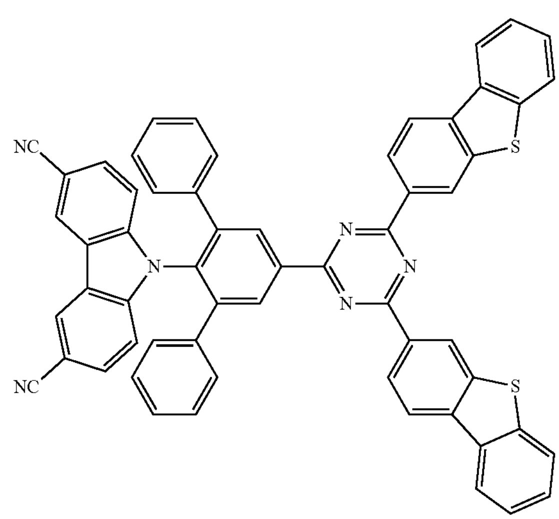

-continued
396
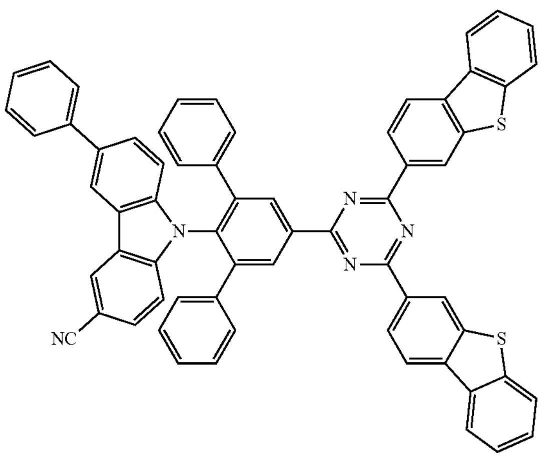
397
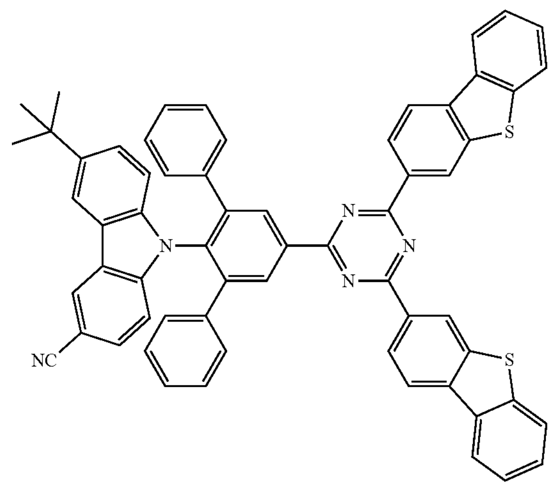
398
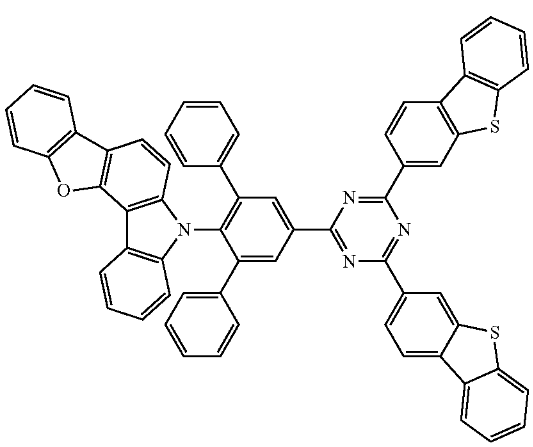
399
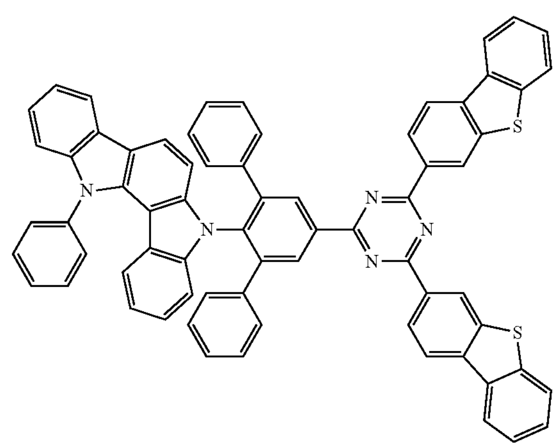
400
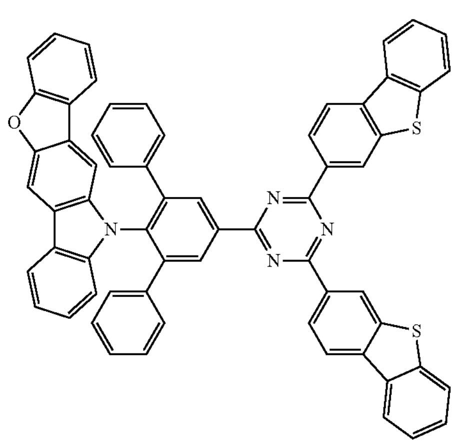
401
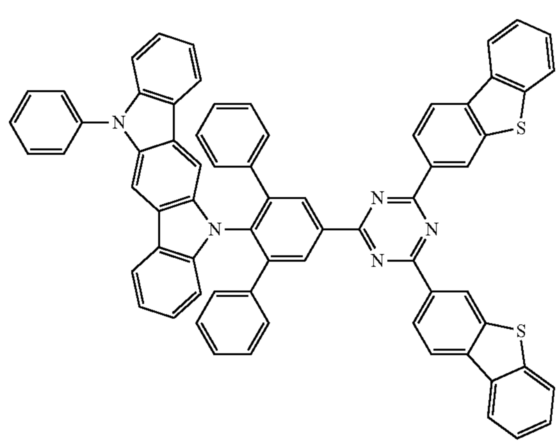

-continued
402
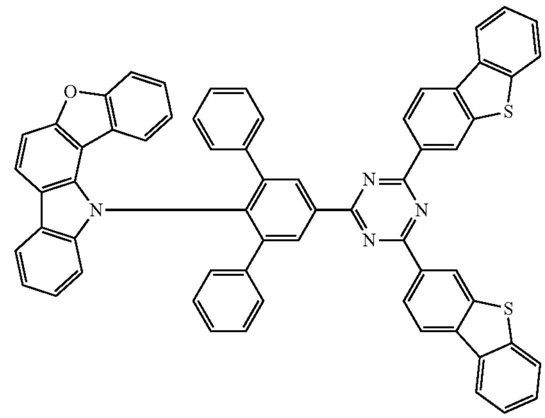
403
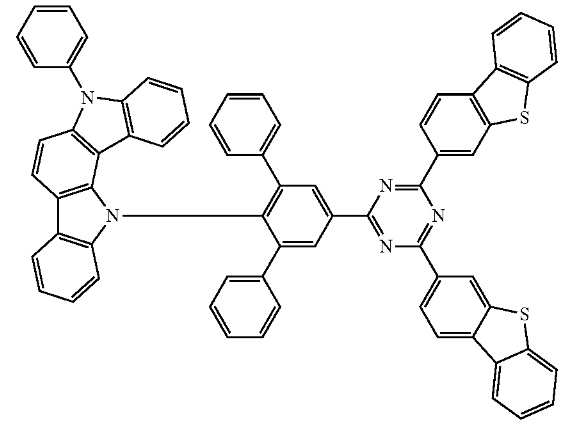
404
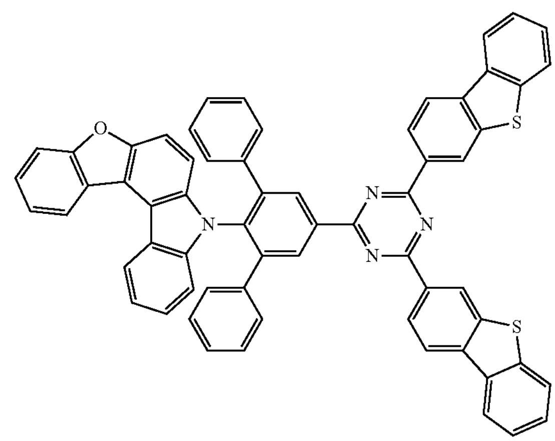
405
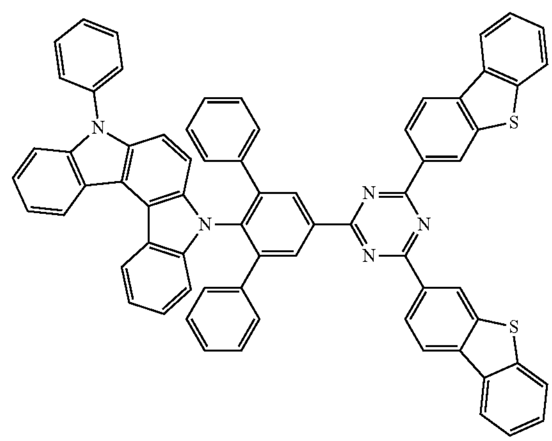
406
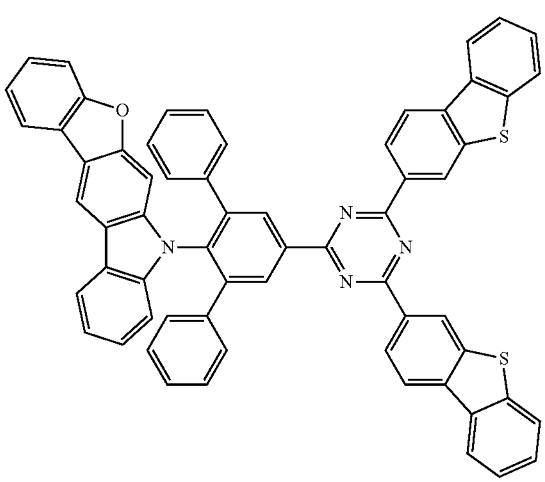
407
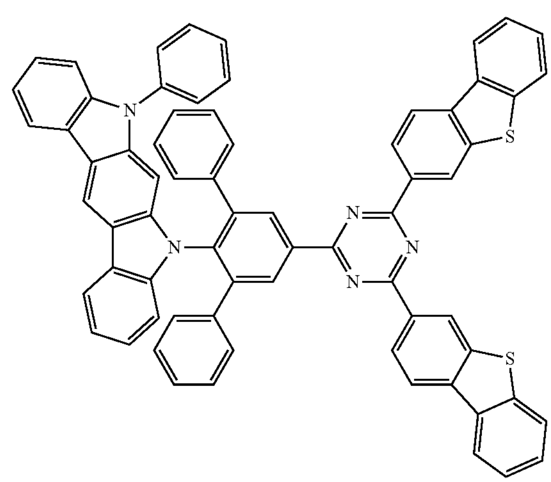

-continued
408
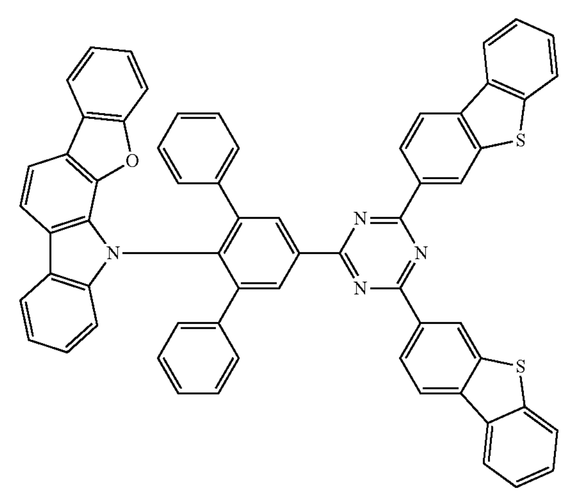
409
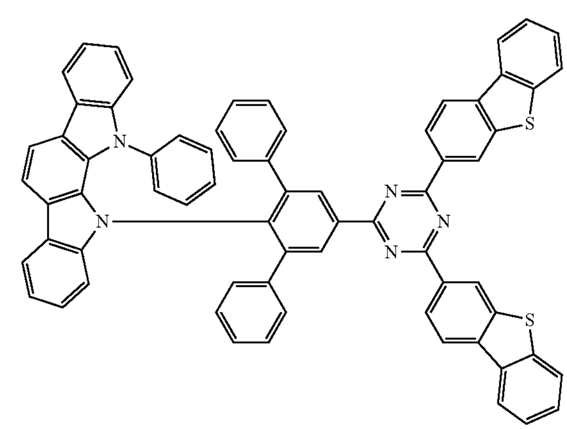
410
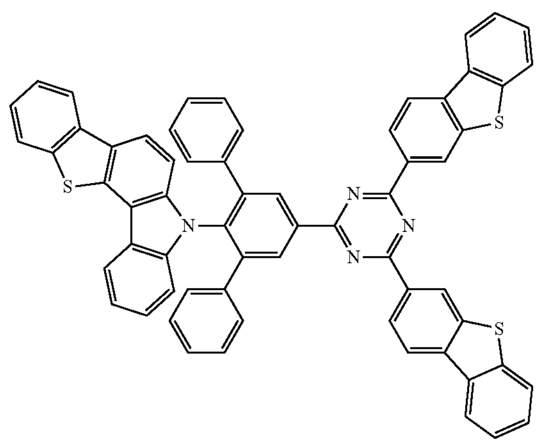
411
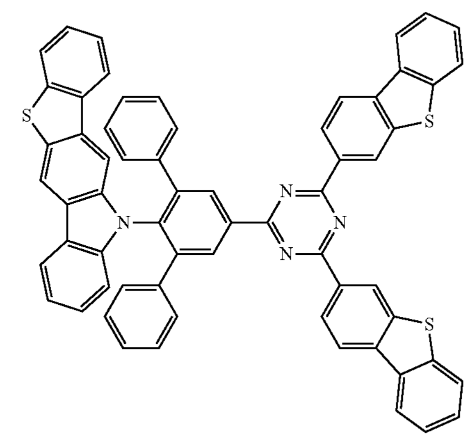
412
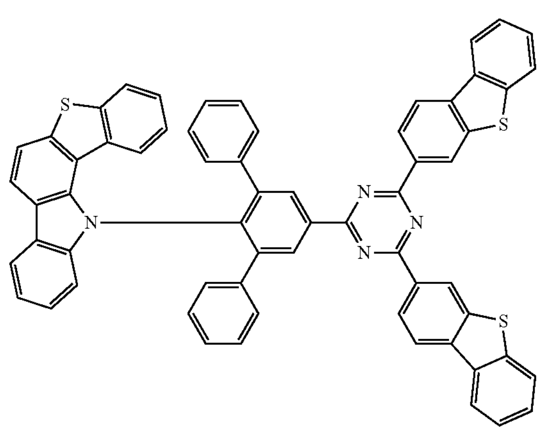
413
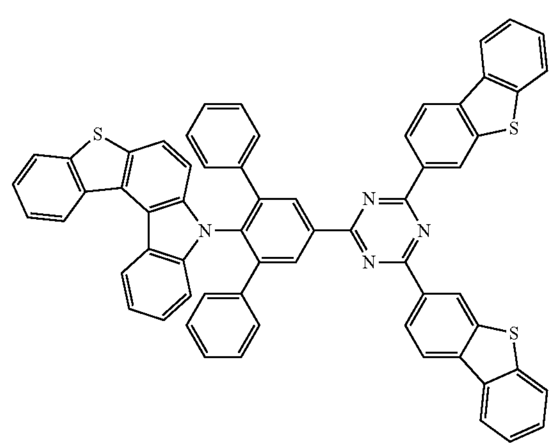

-continued
414
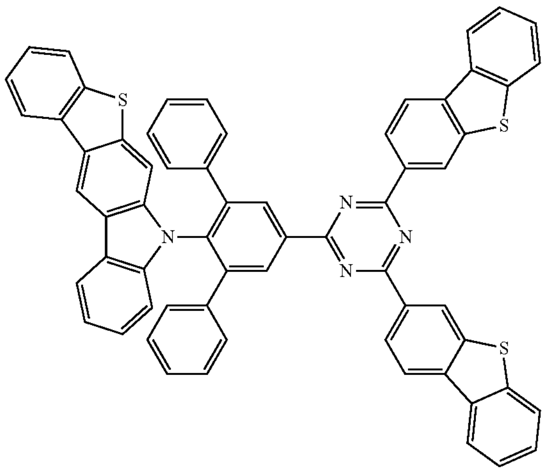
415
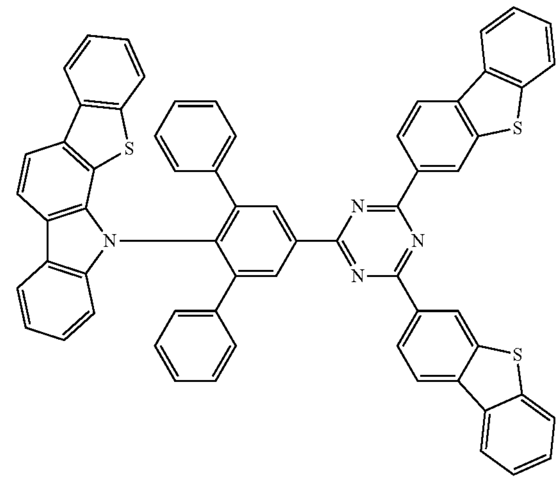
416
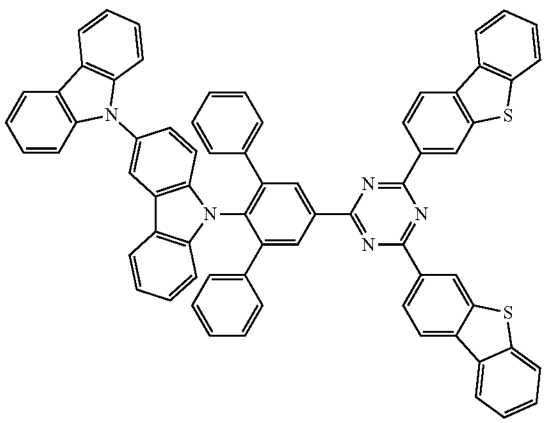
417
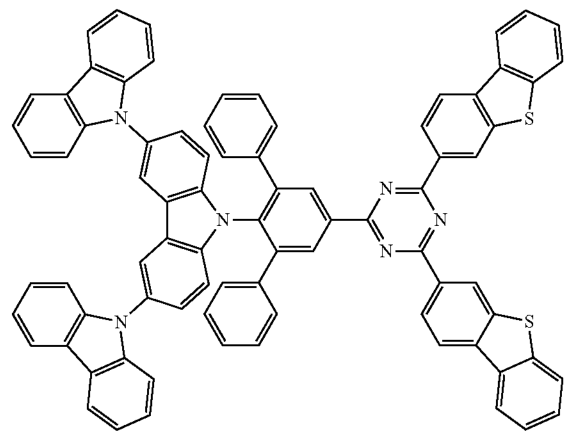
418
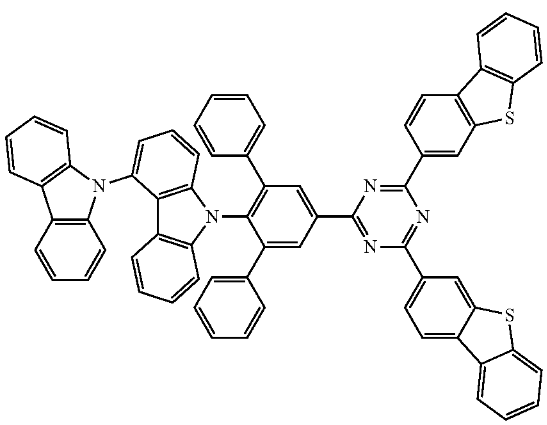
419
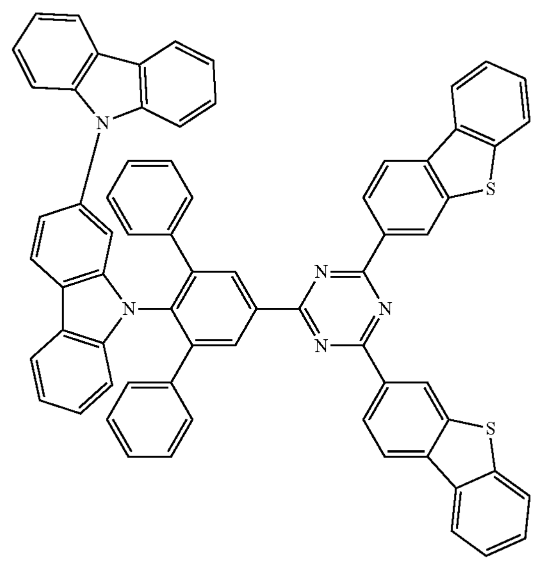

-continued
420
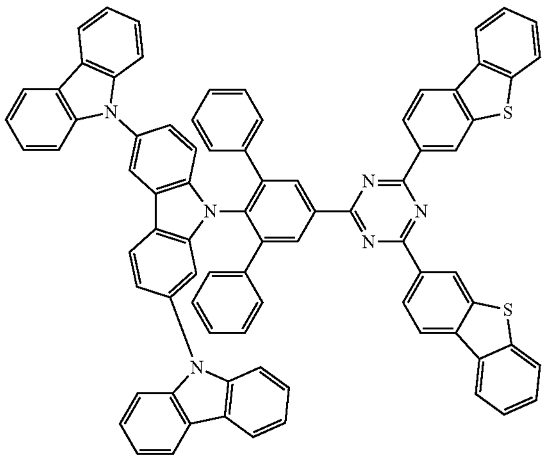
421
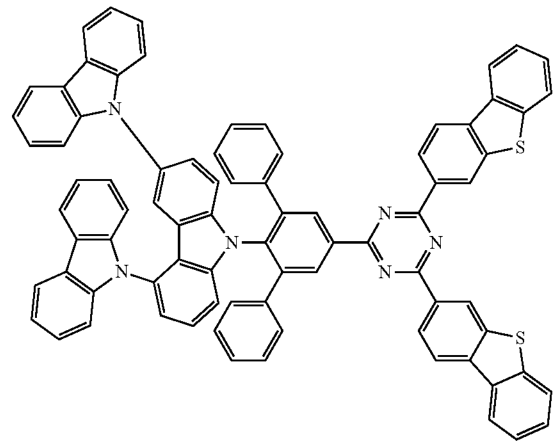
422
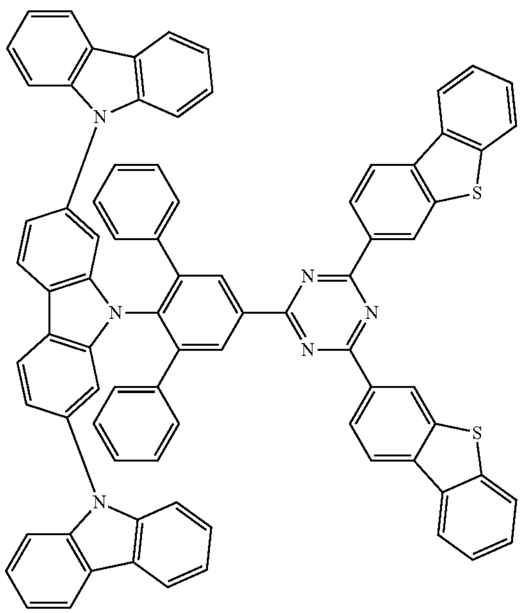
423
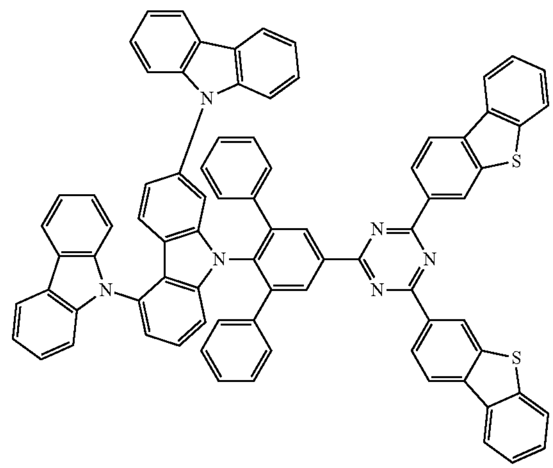
424
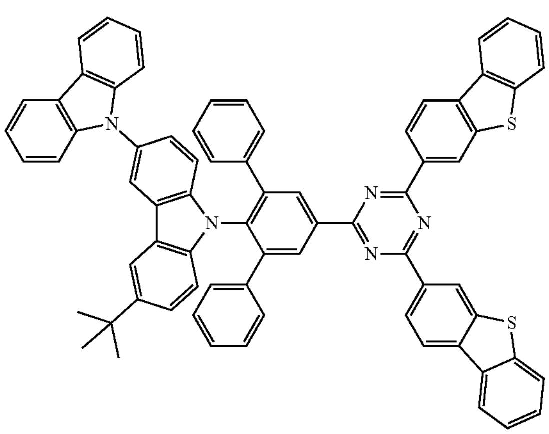
425
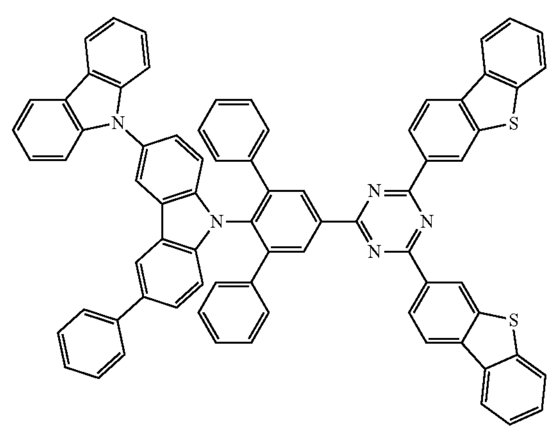

-continued
426
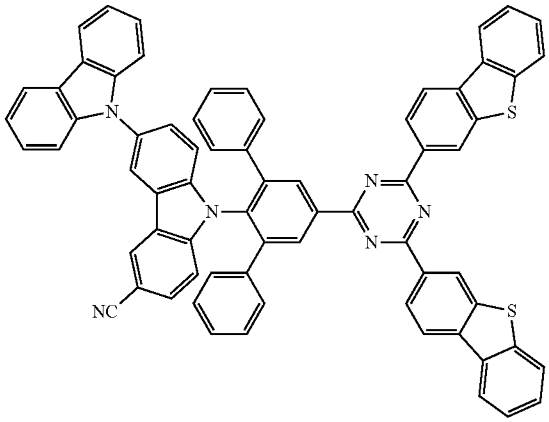
427
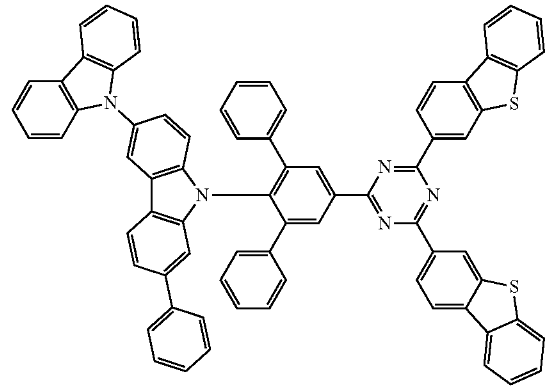
428
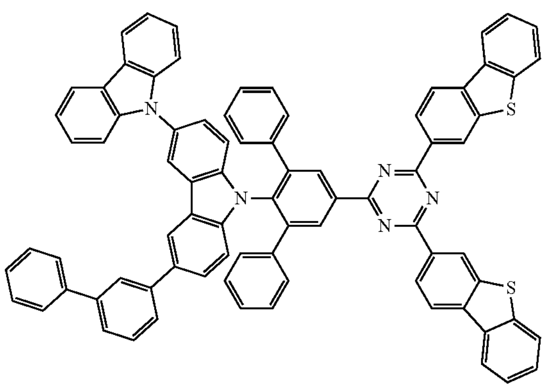
429
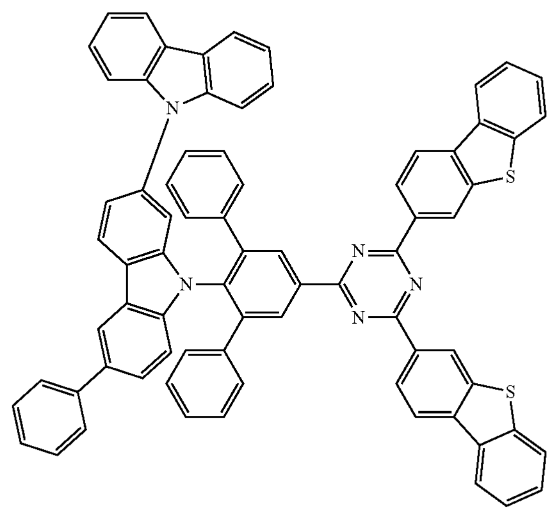
430
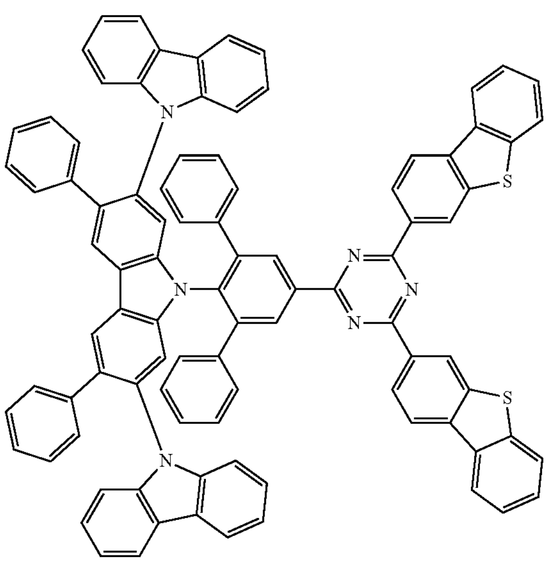
431
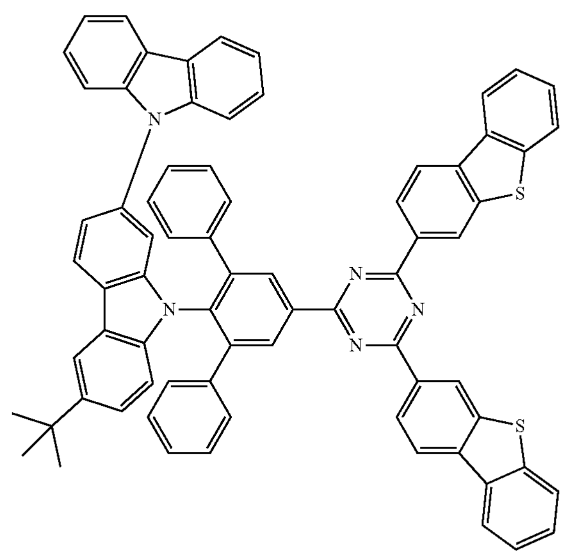

-continued
432
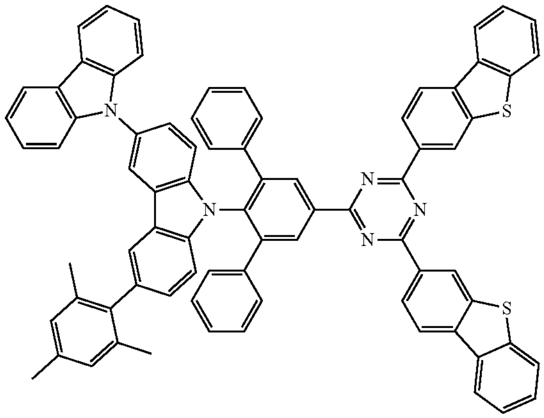
433
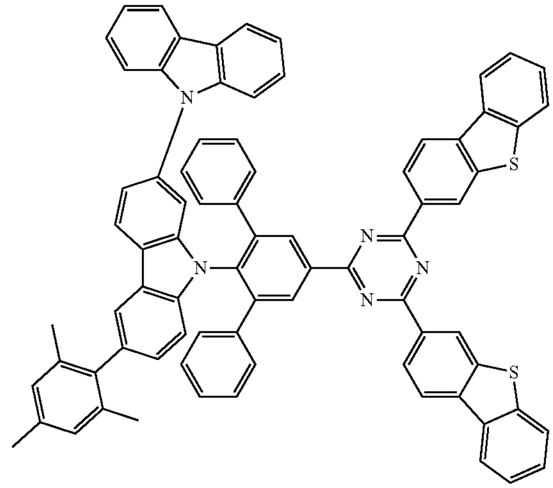
434
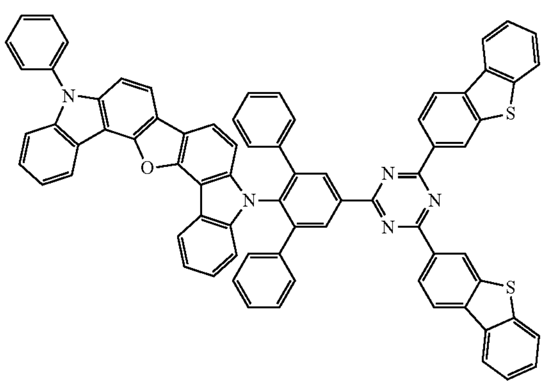
435
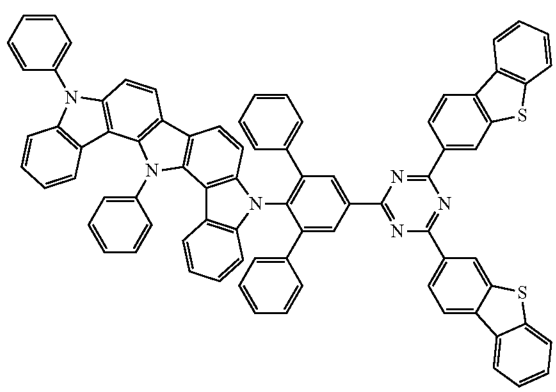
436
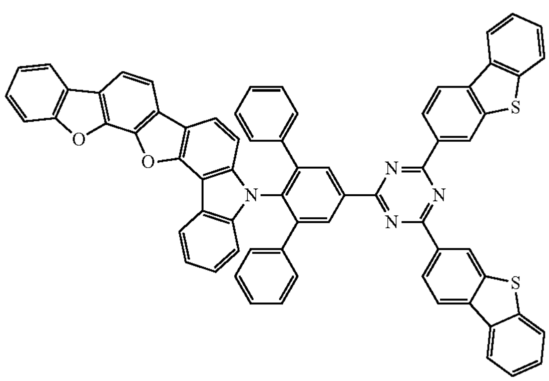
437
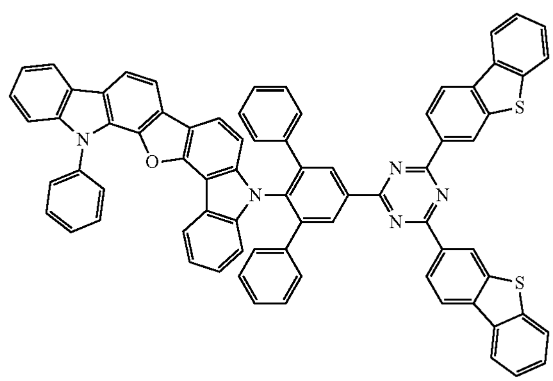

-continued
438
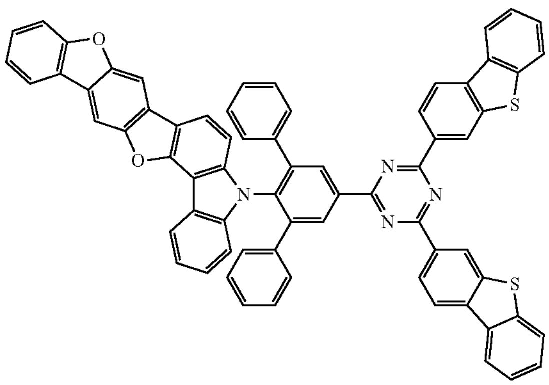
439
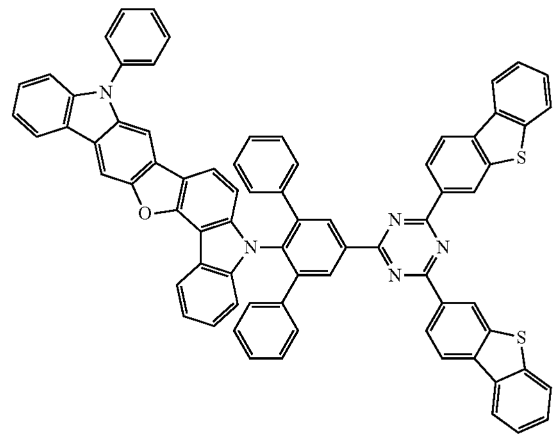
440
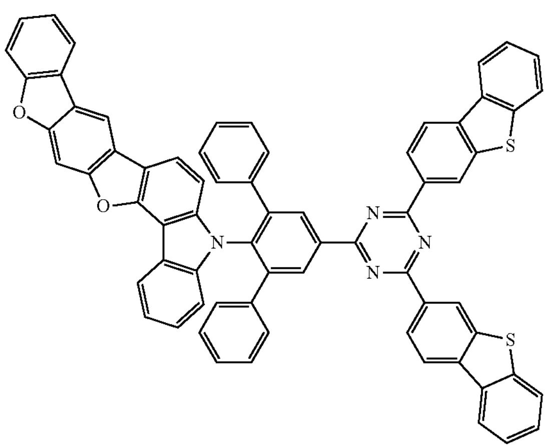
441
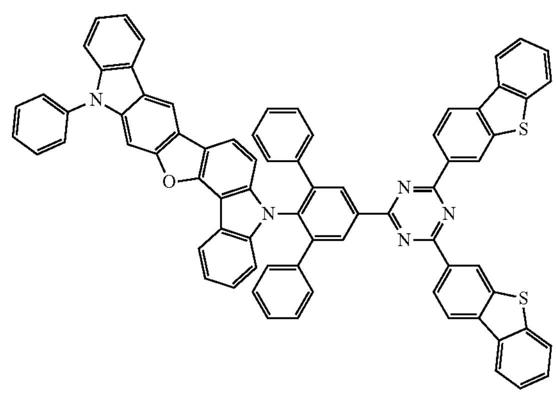
442
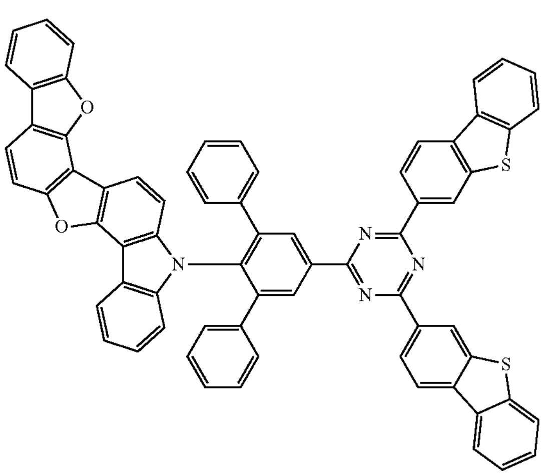
443
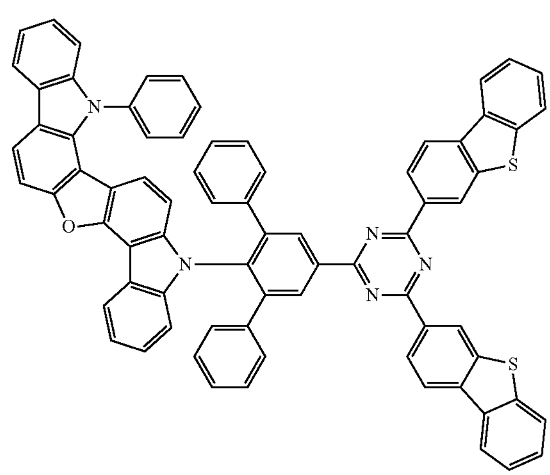

-continued
444
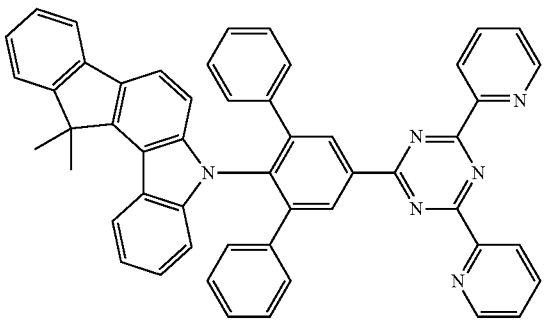
445
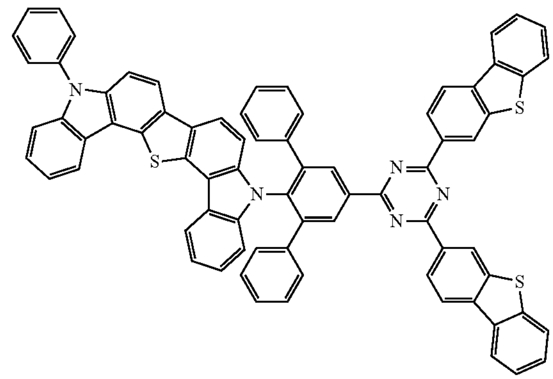
446
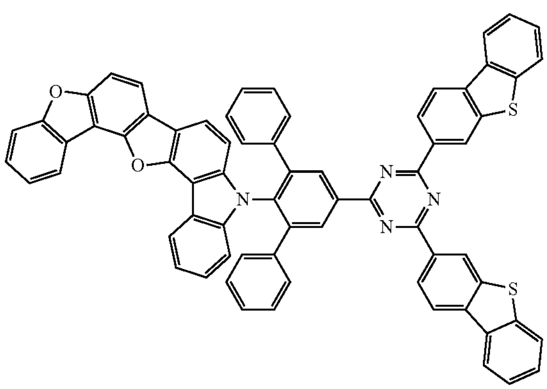
447
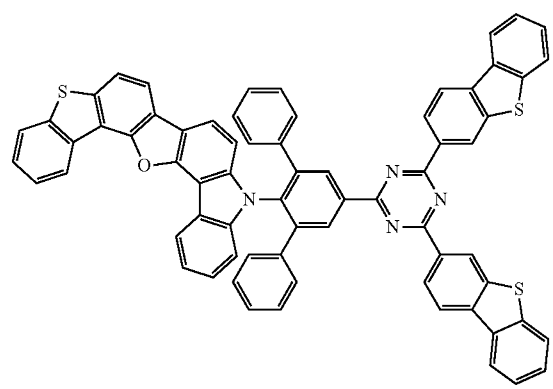
448
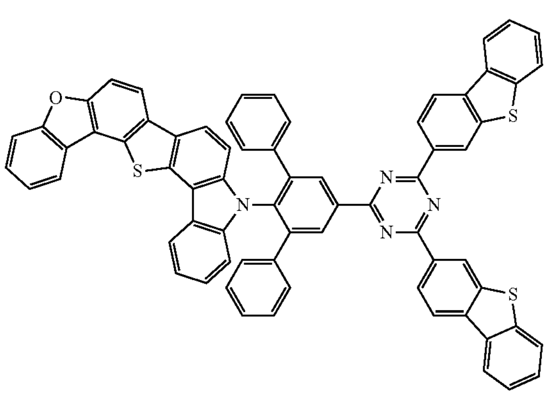
449
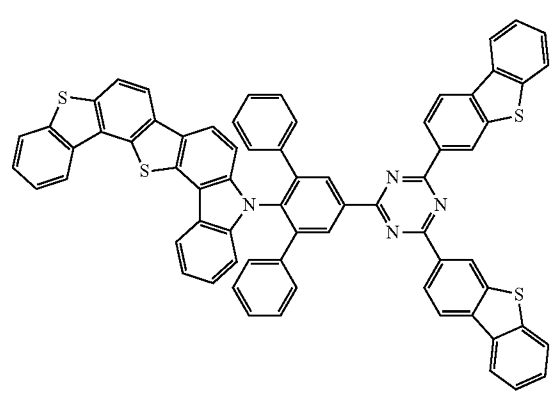

-continued
450
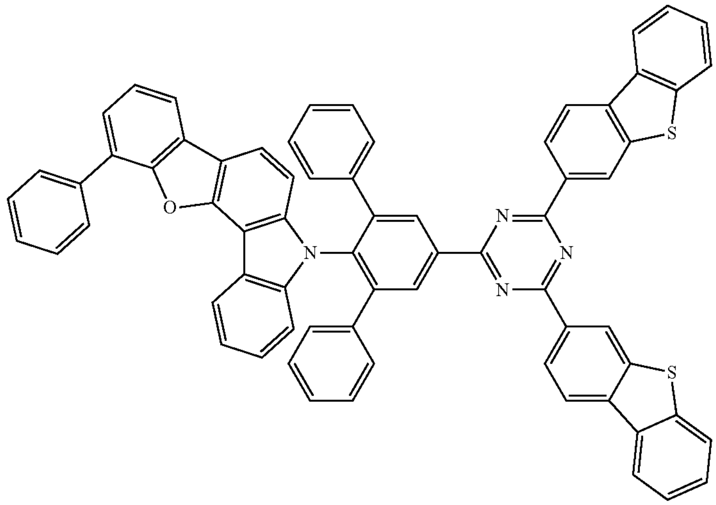
451
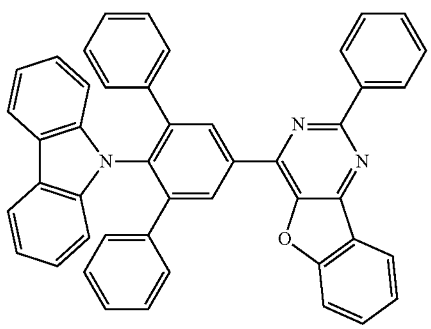
452
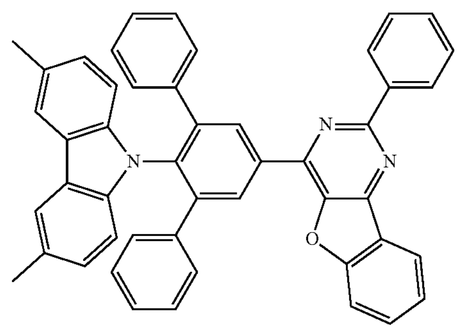
453
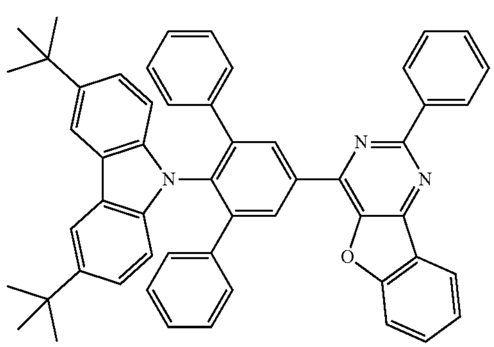
454
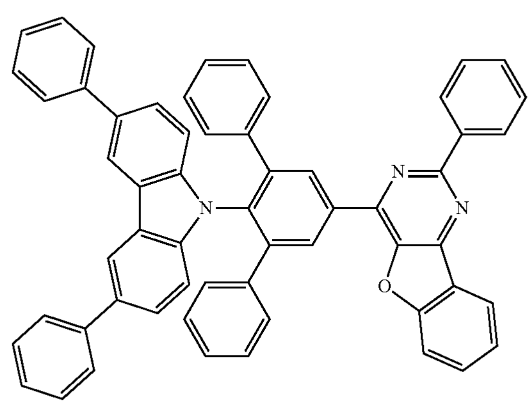

-continued
455
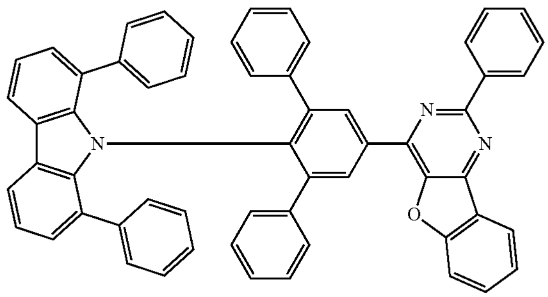
456
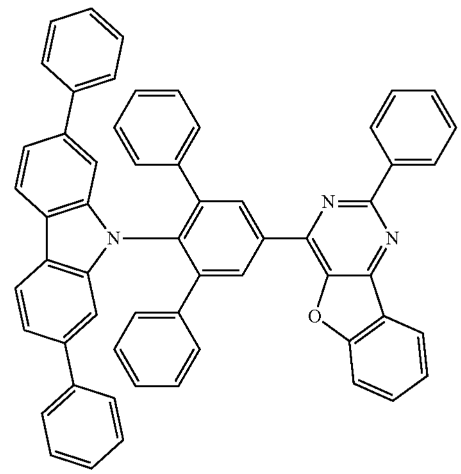
457
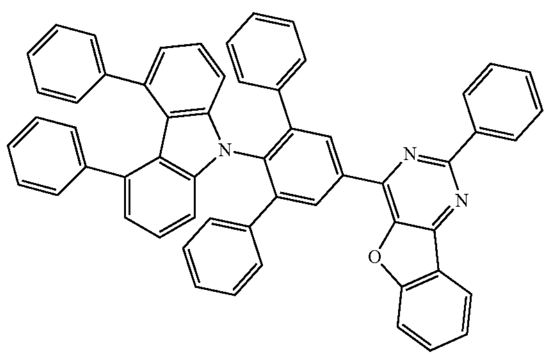
458
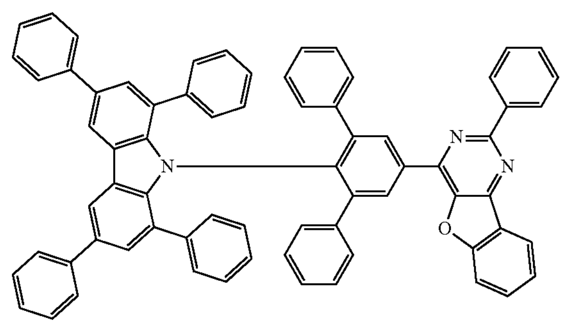
459
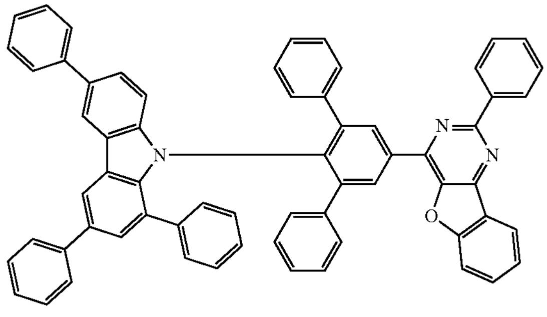
460
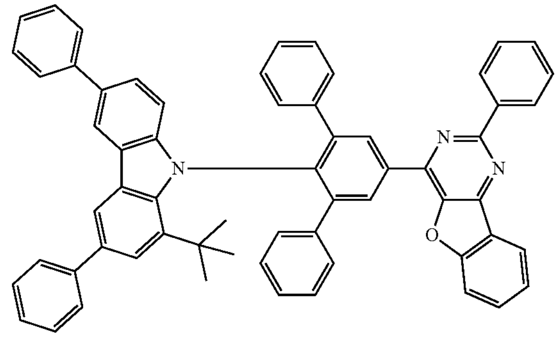

-continued
461
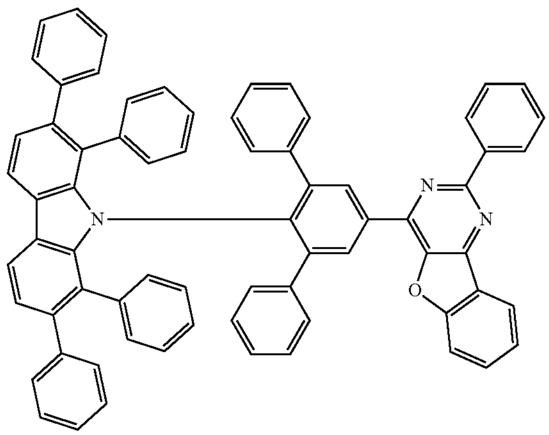
462
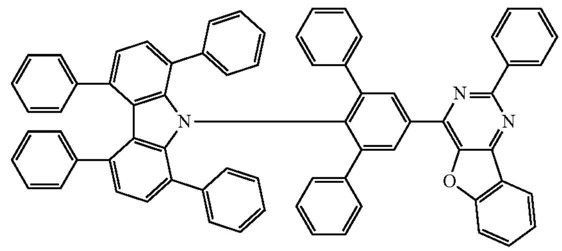
463
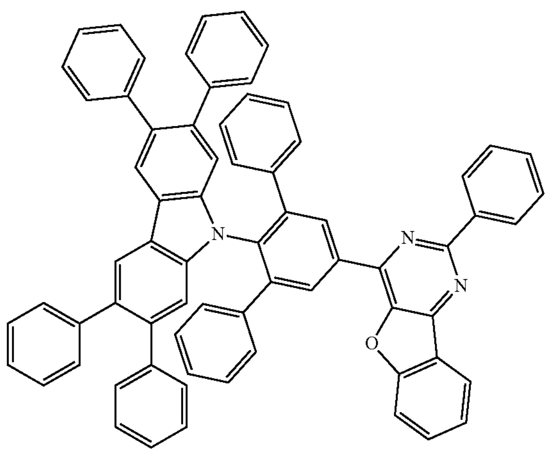
464
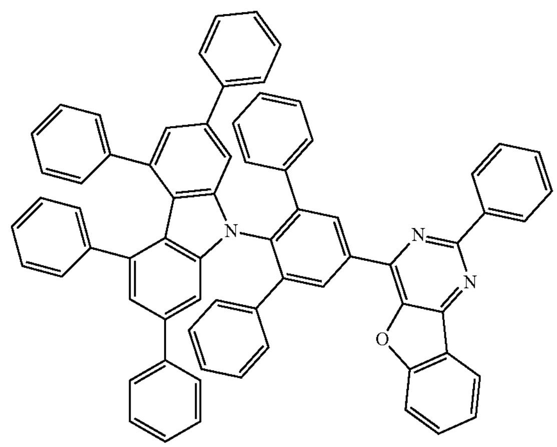
465
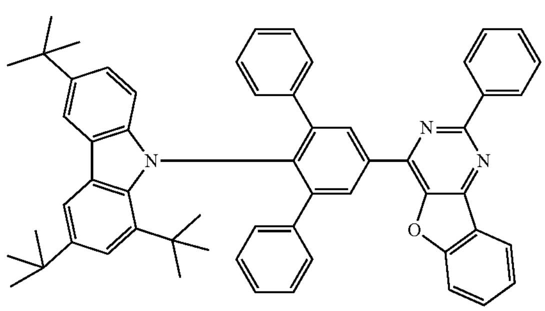
466
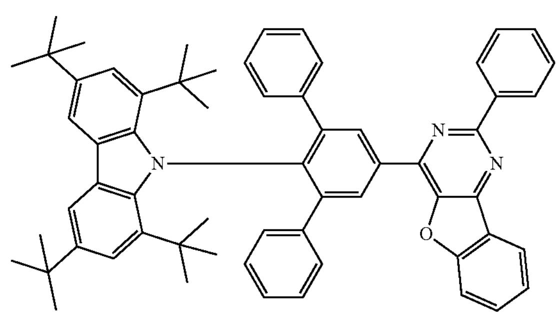
467
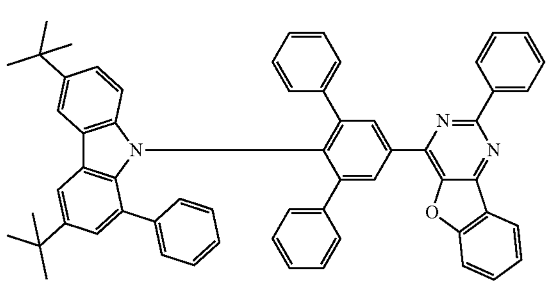
468
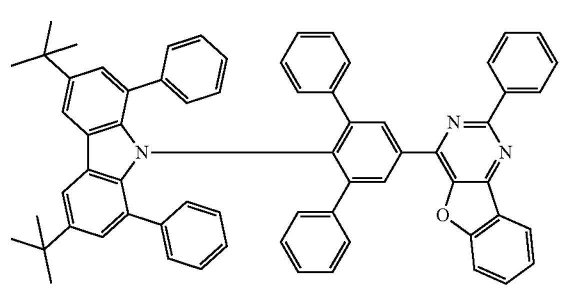

-continued
469
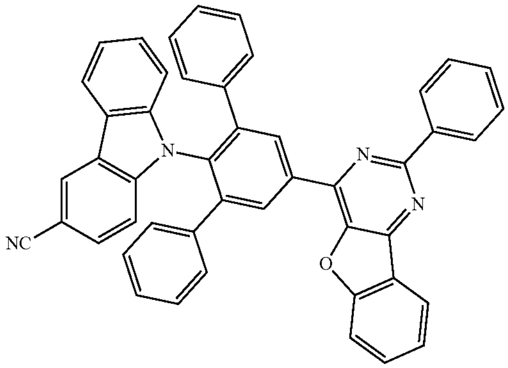
470
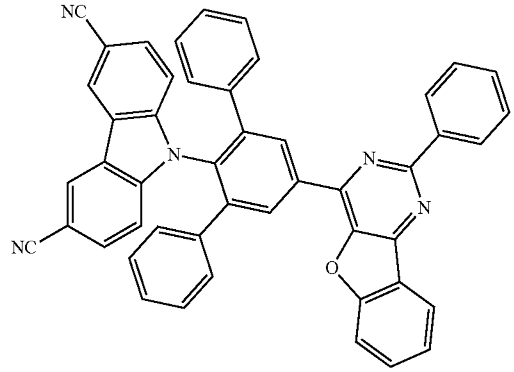
471
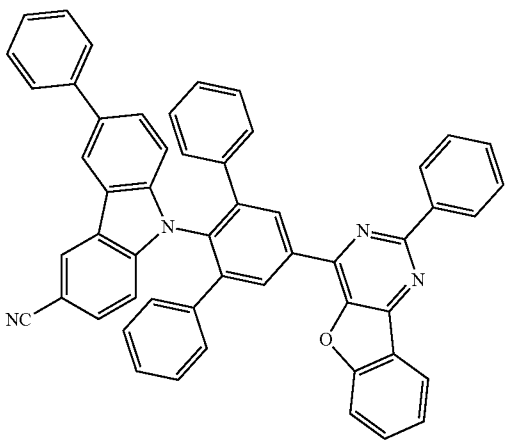
472
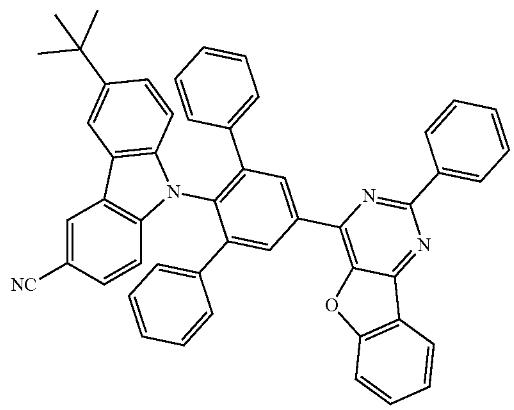
473
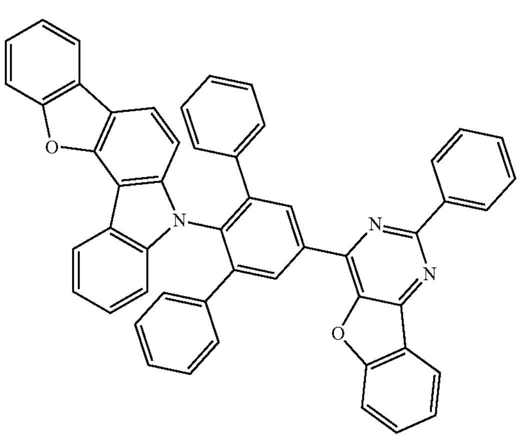
474
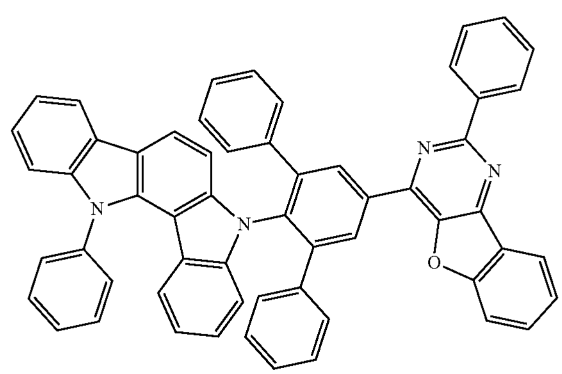

-continued
475
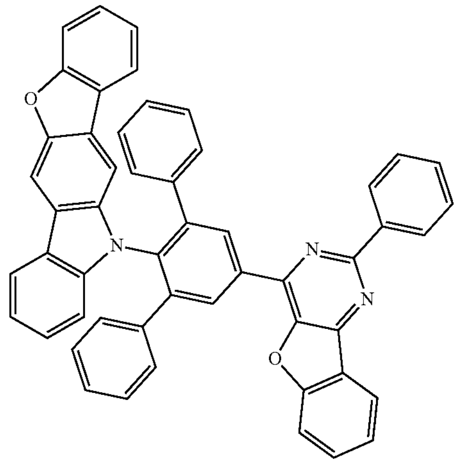
476
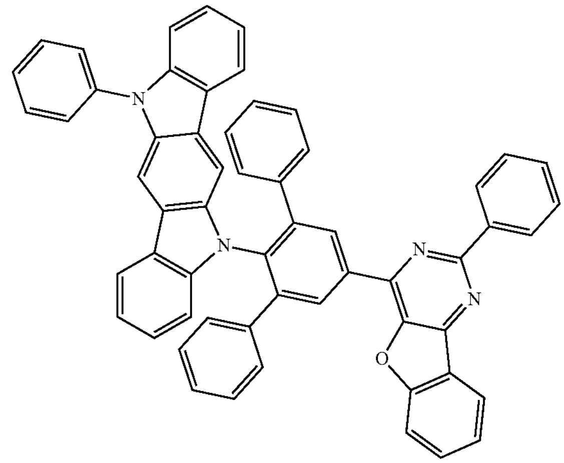
477
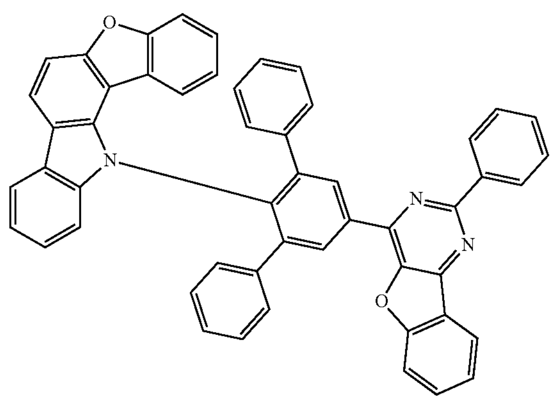
478
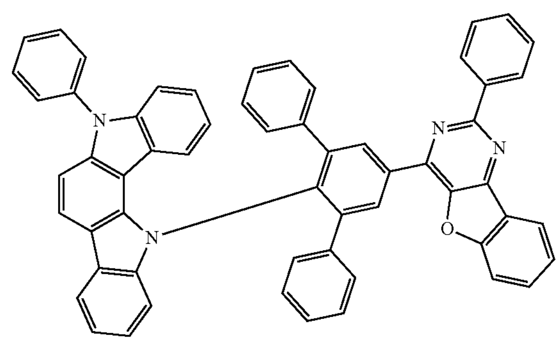
479
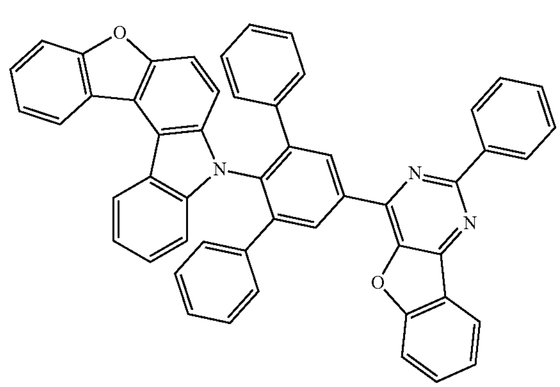
480
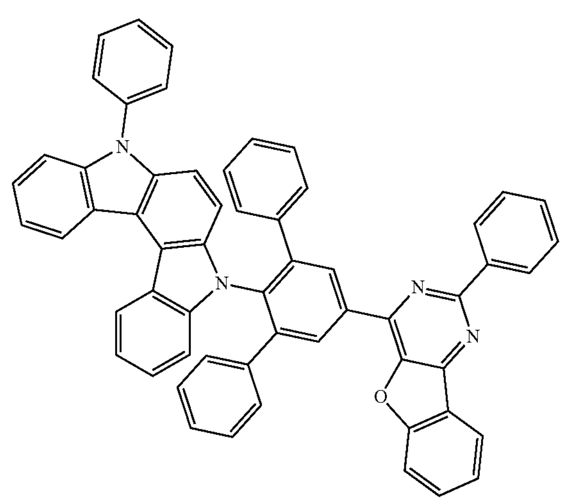

-continued
481
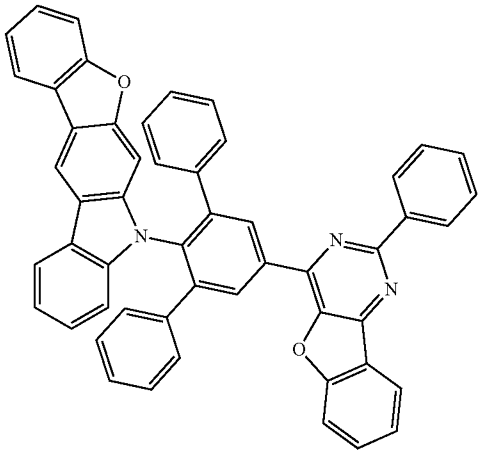
482
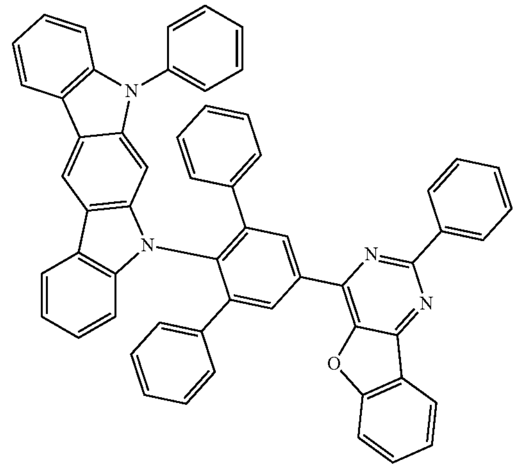
483
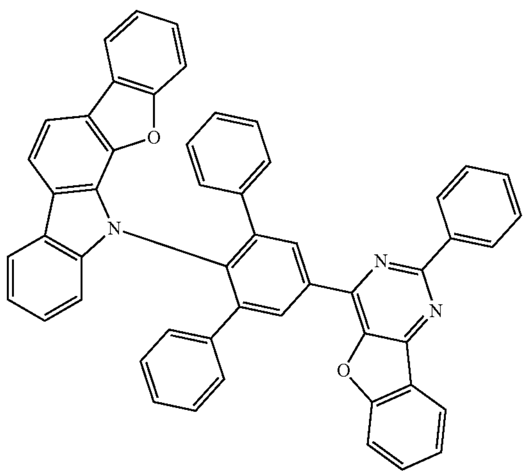
484
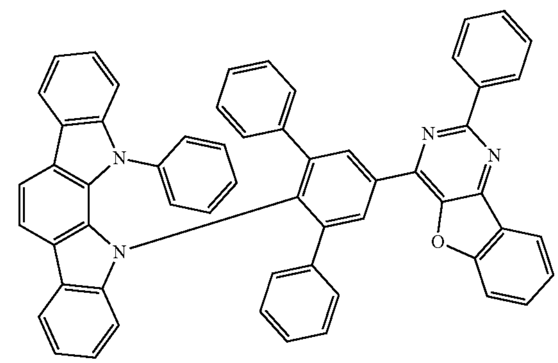
485
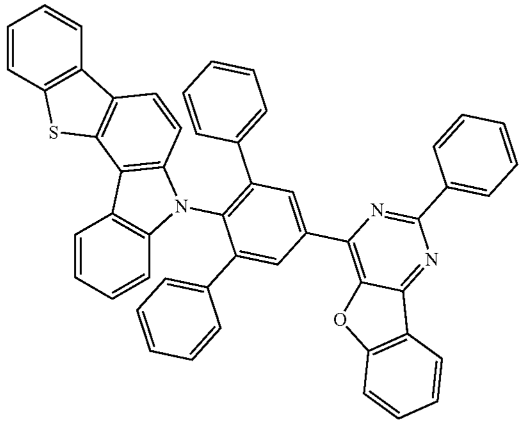
486
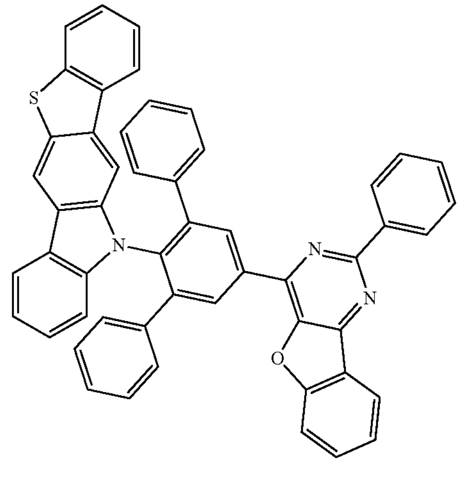

-continued
487
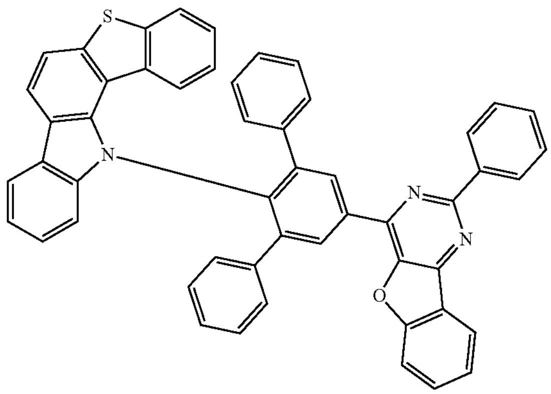
488
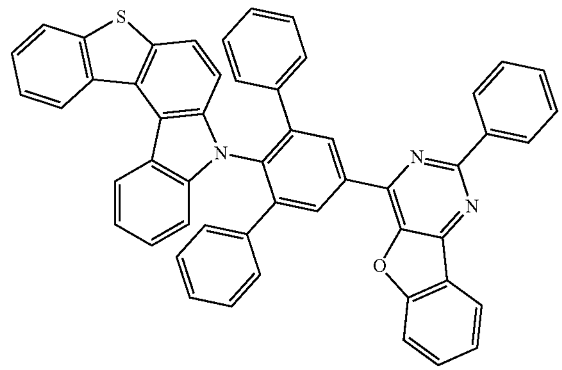
489
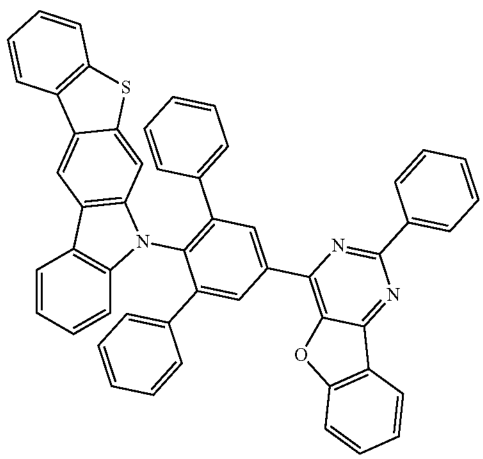
490
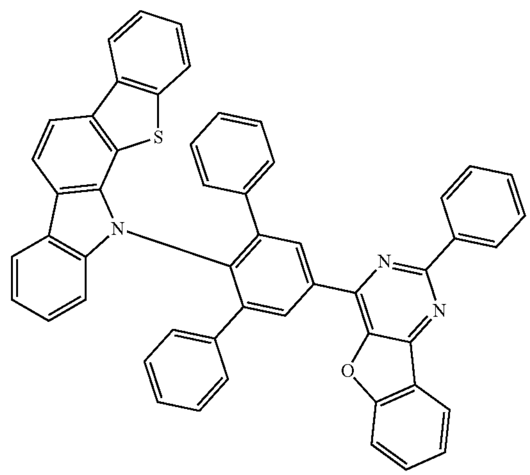
491
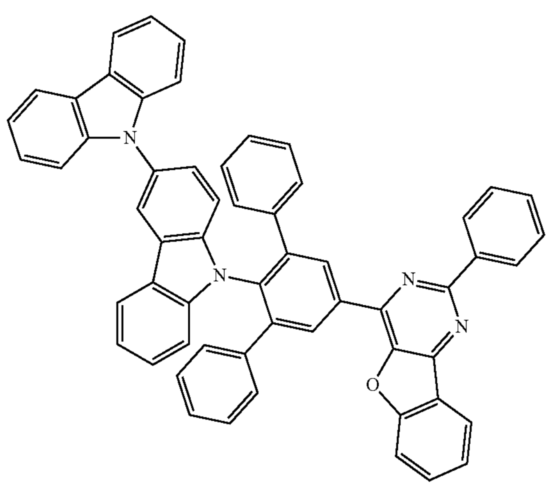
492
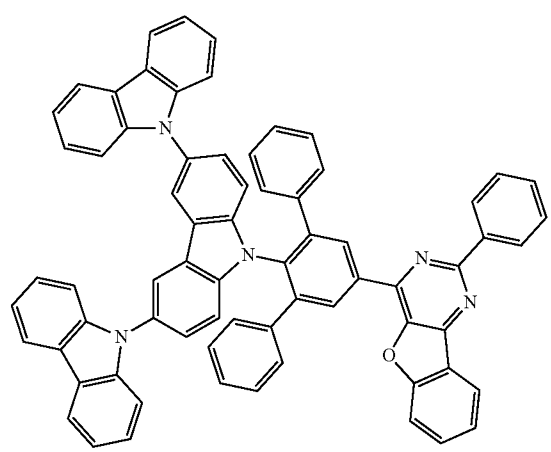

-continued
493
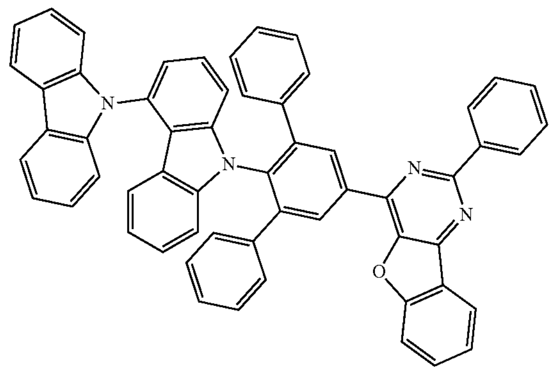
494
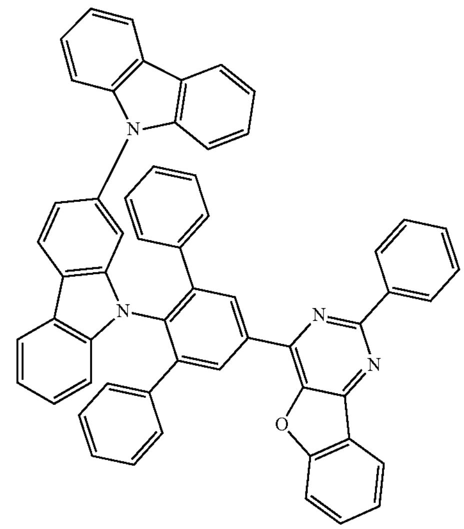
495
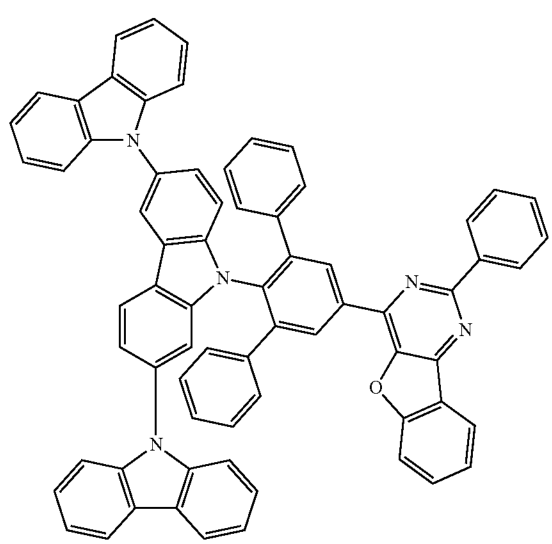
496
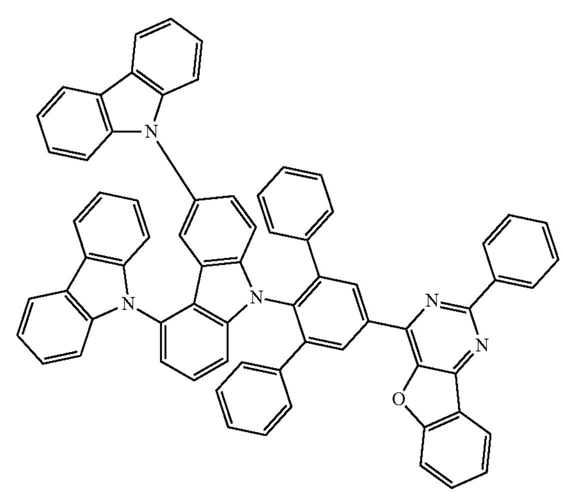

-continued
497
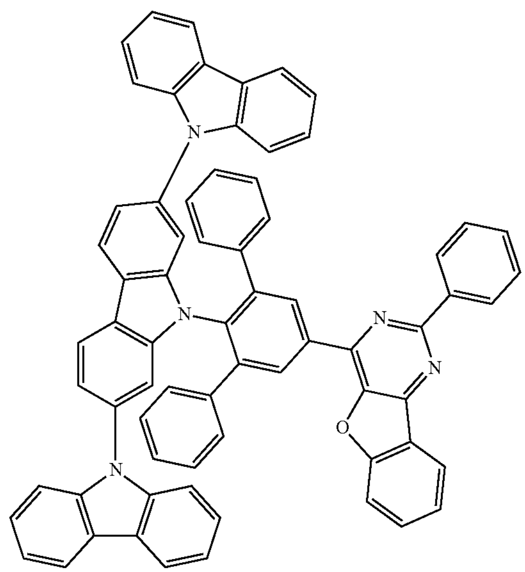
498
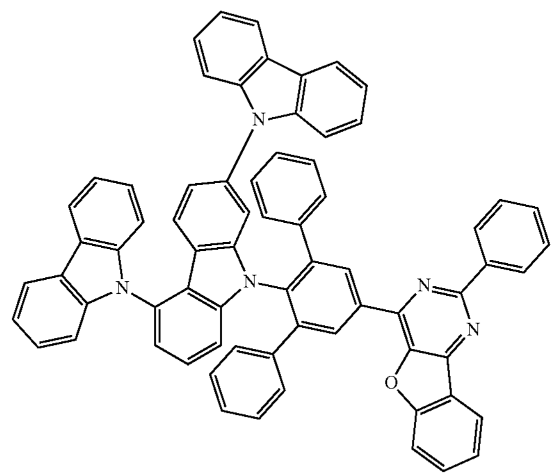
499
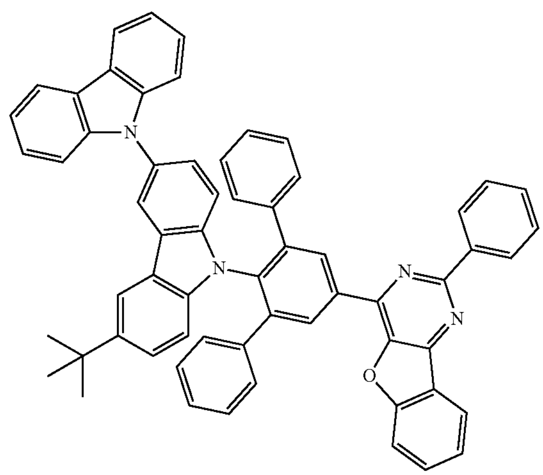
500
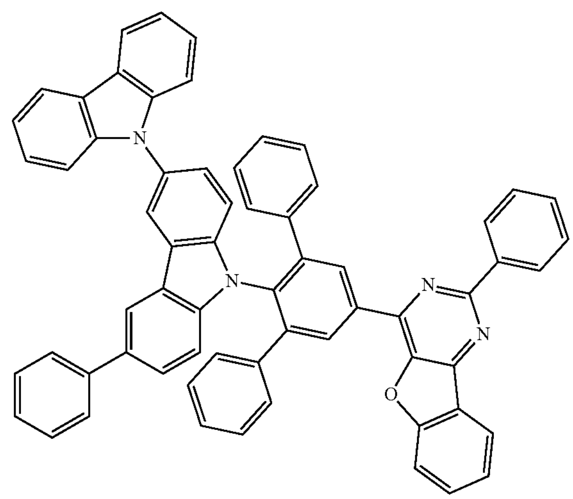
501
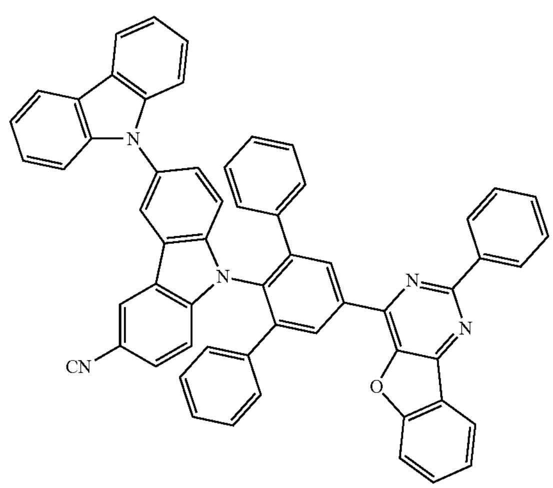
502
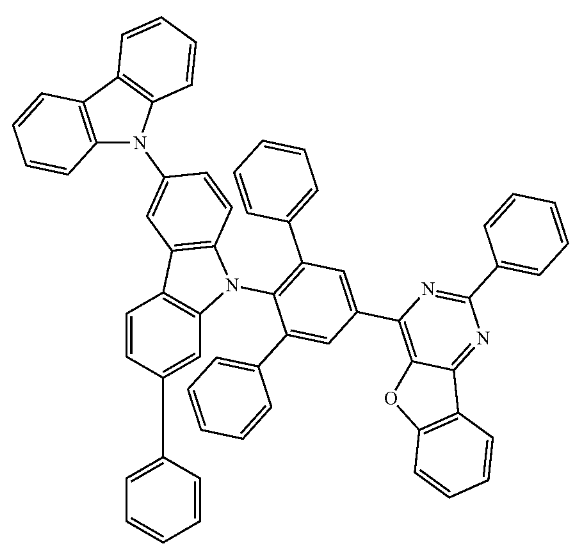

-continued
503
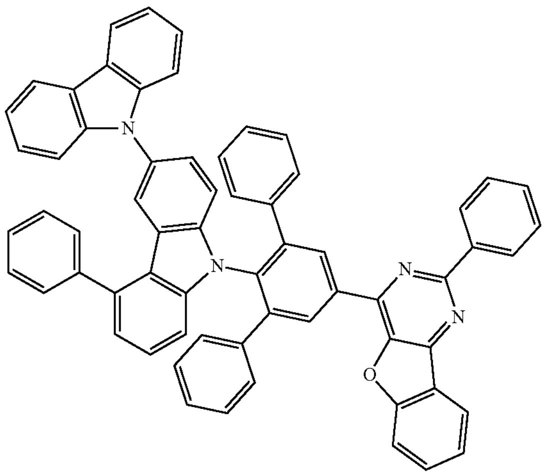
504
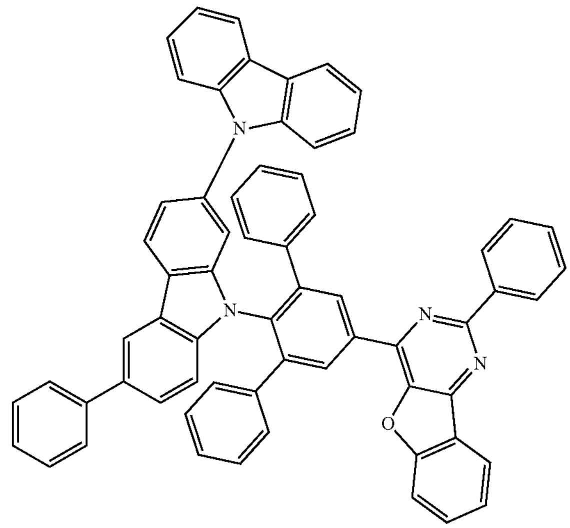
505
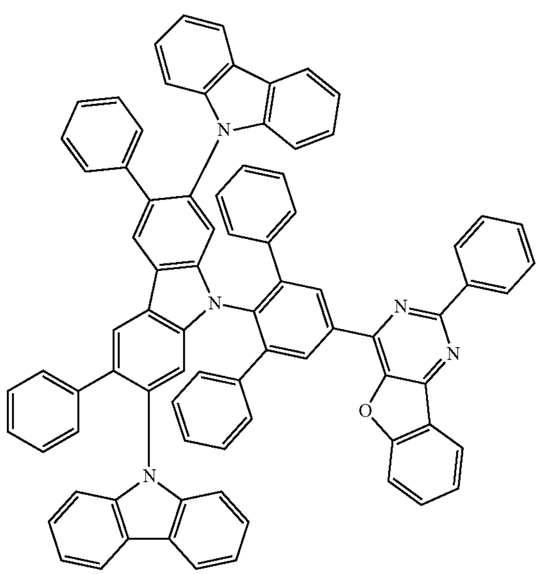
506
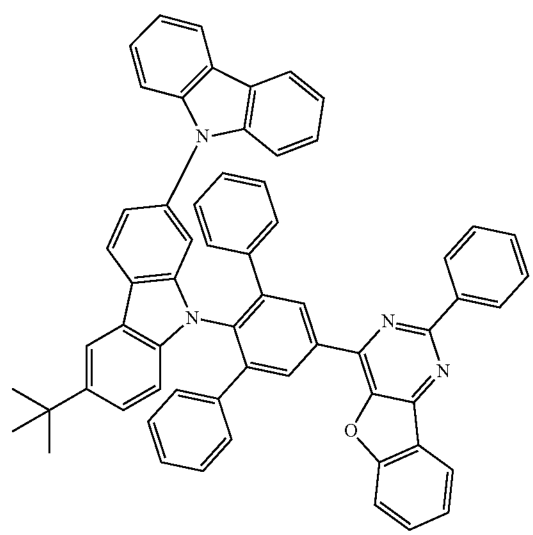
507
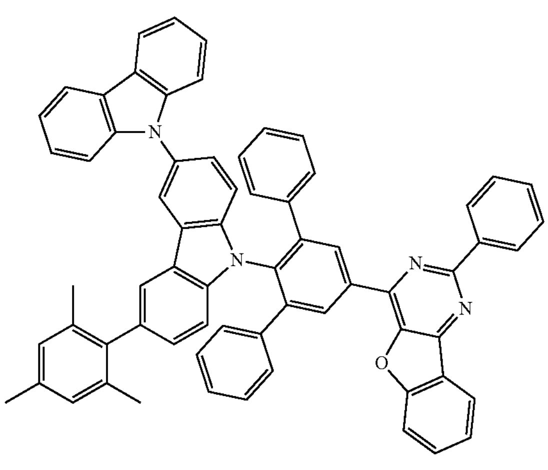
508
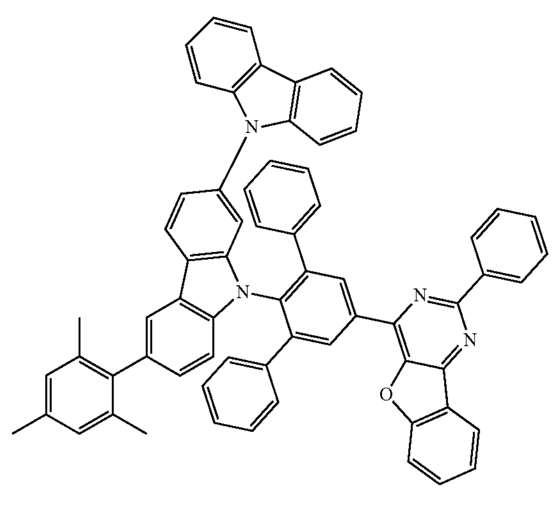

-continued
509
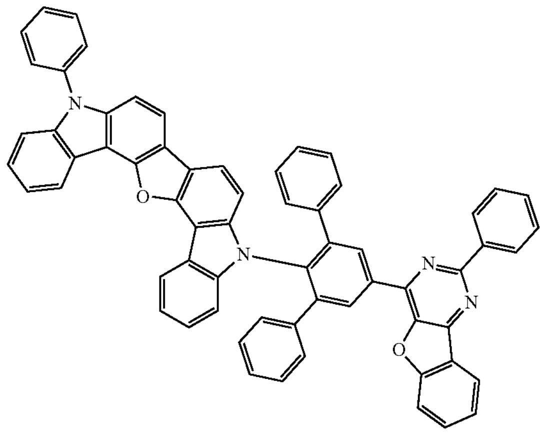
510
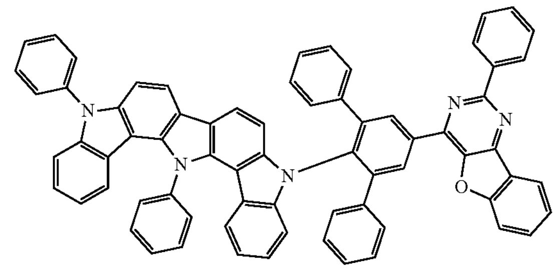
511
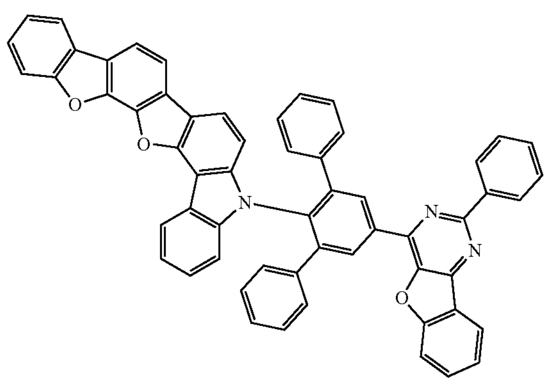
512
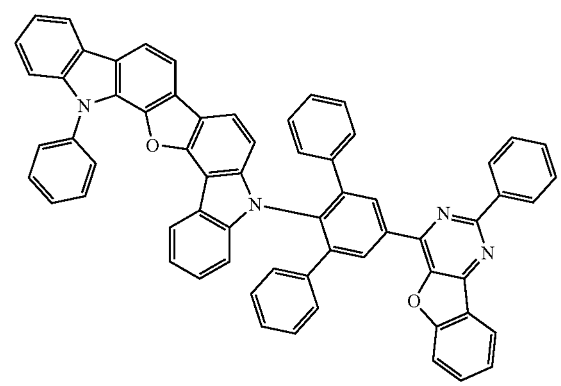
513
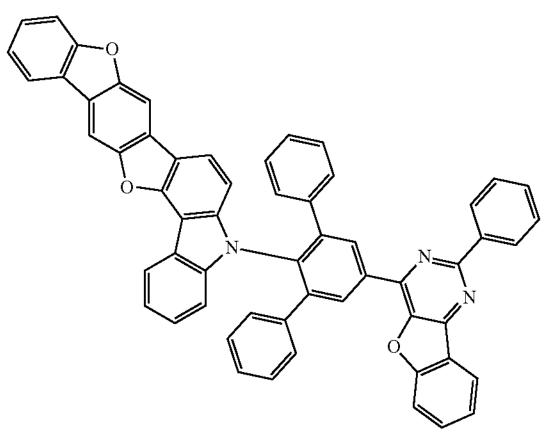
514
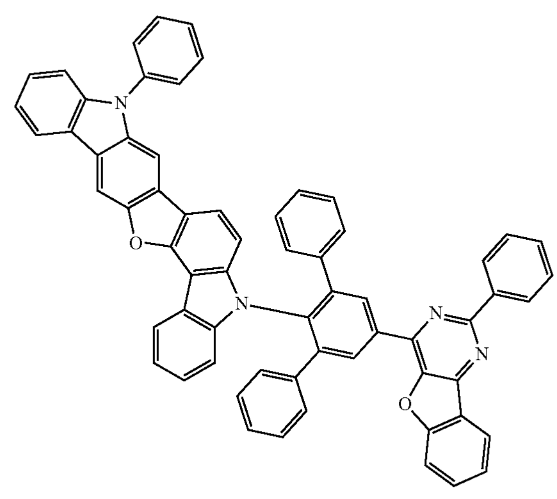

-continued
515
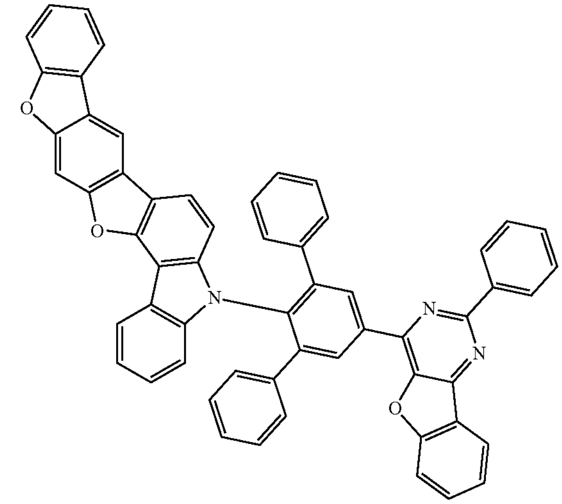
516
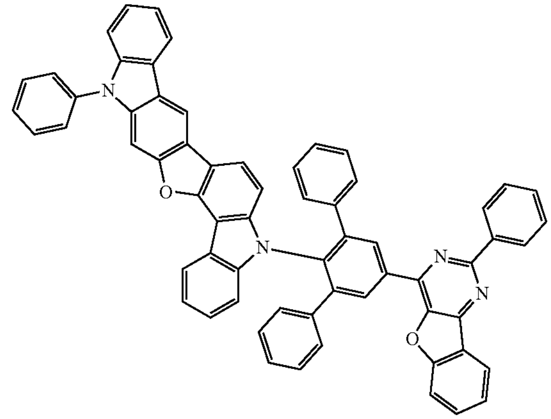
517
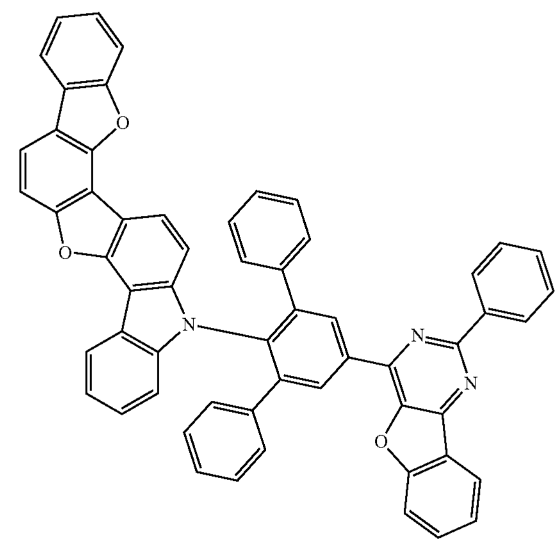
518
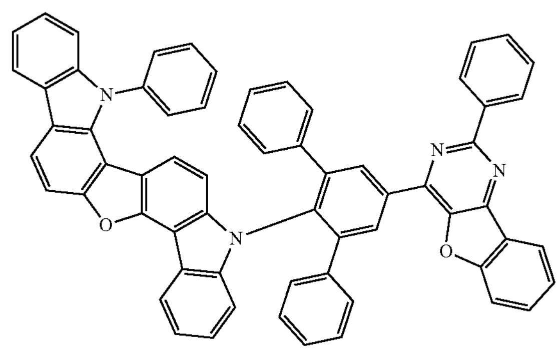
519
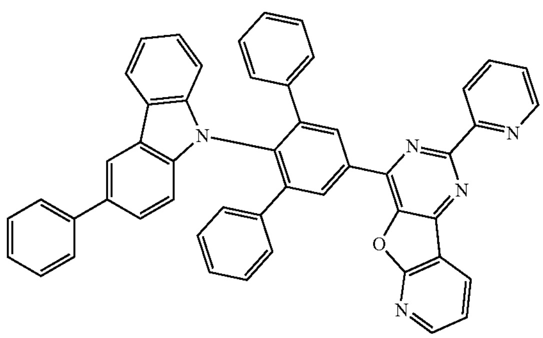
520
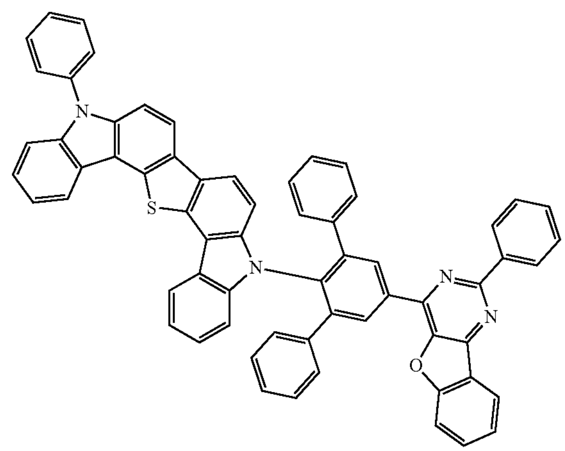

-continued
521
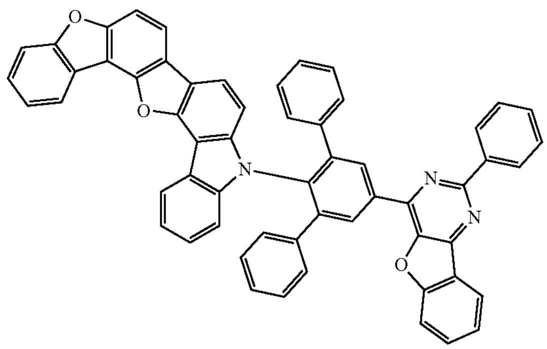
522
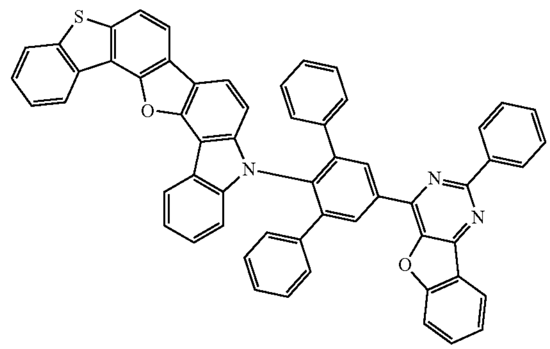
523
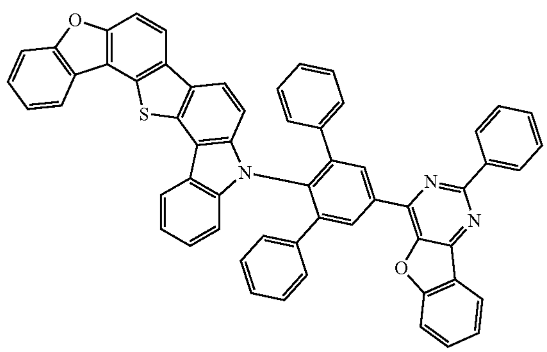
524
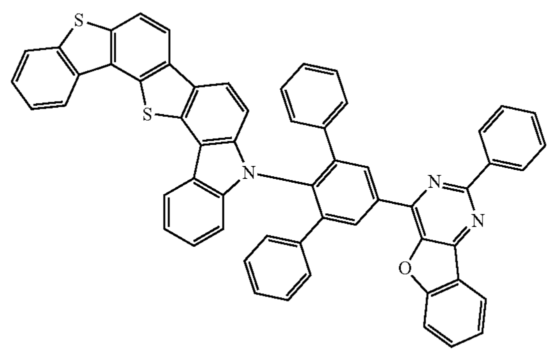
525
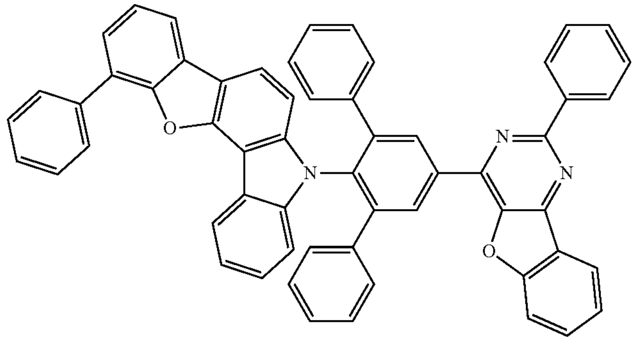
526
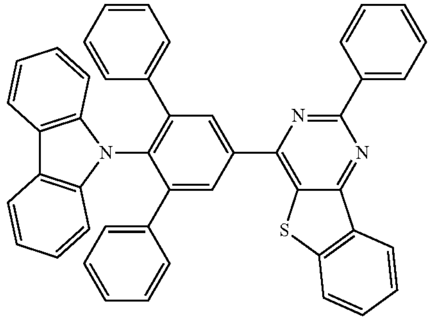
527
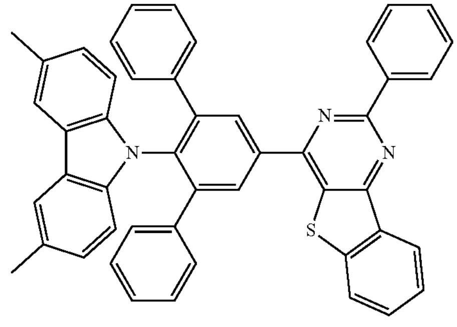

-continued
528
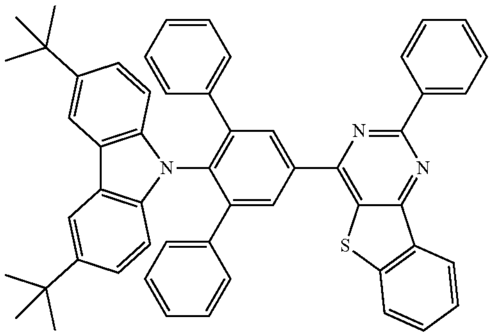
529
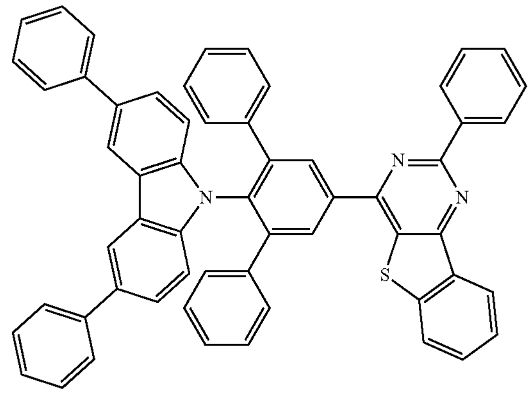
530
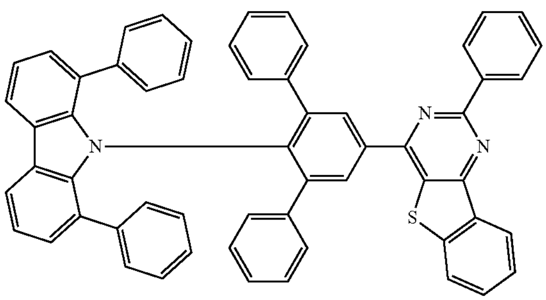
531
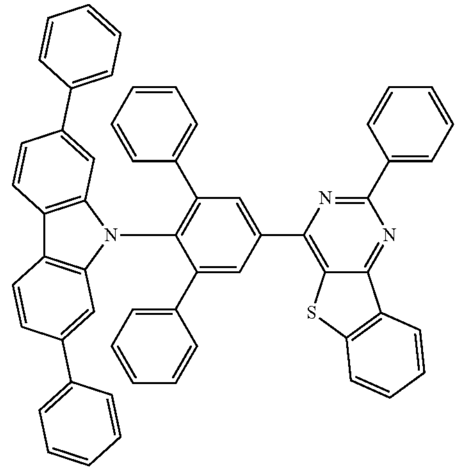
532
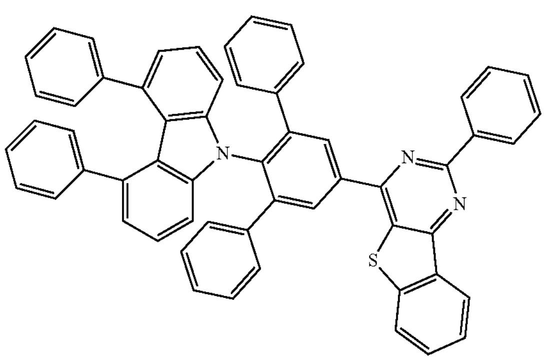
533
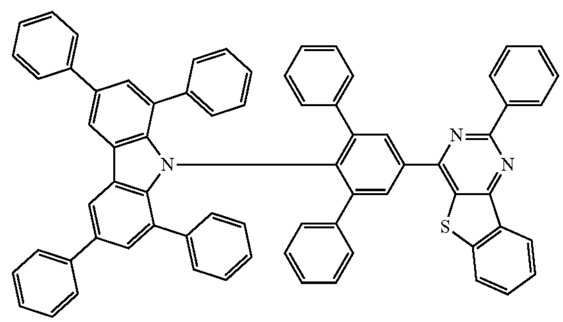
534
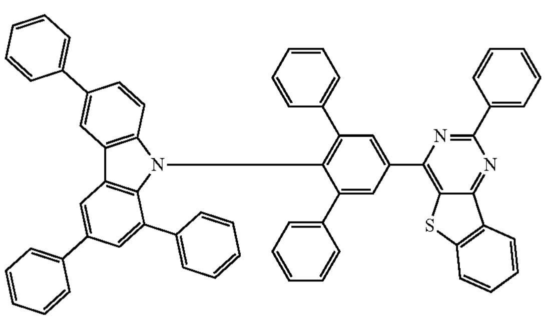
535
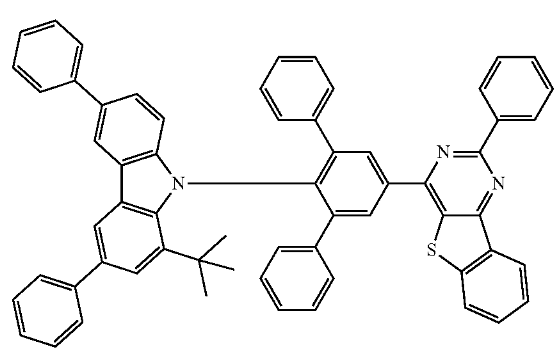

-continued
536
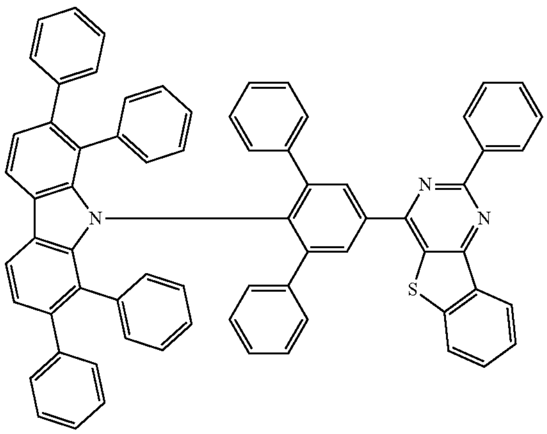
537
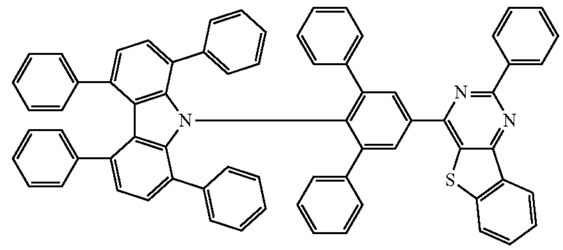
538
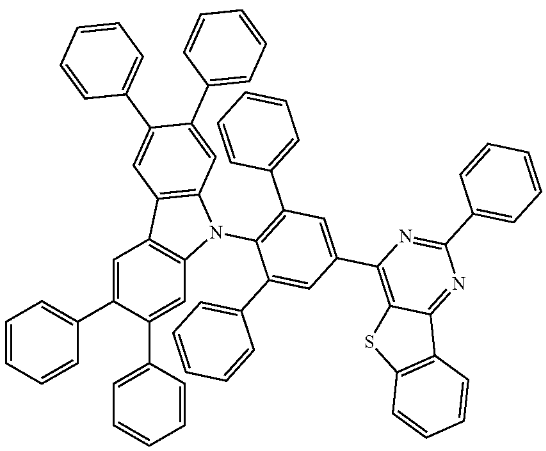
539
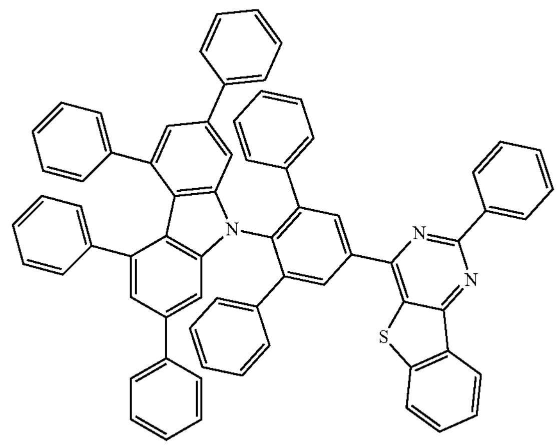
540
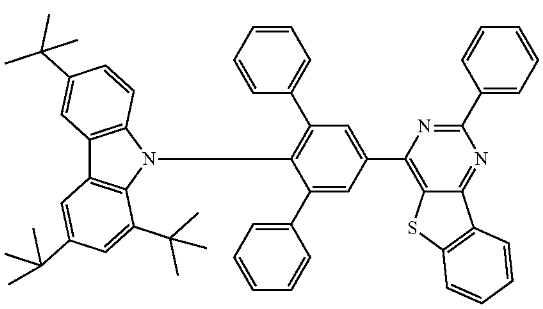
541
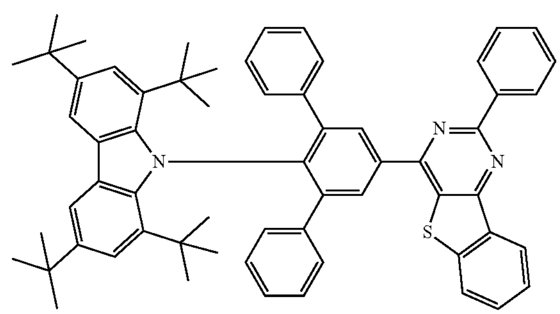
542
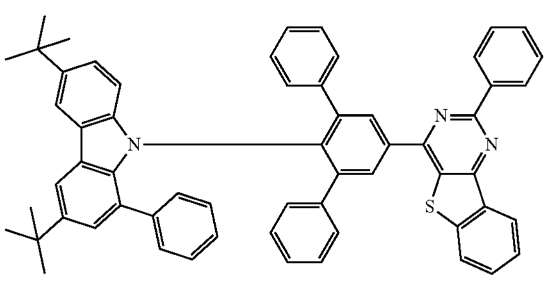
543
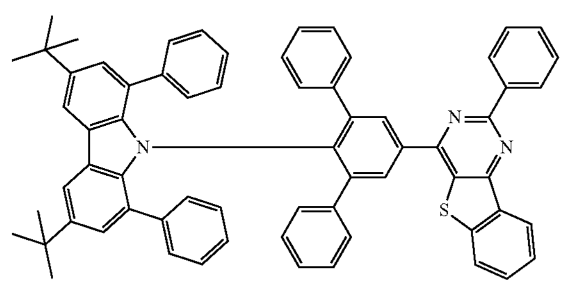

-continued
544
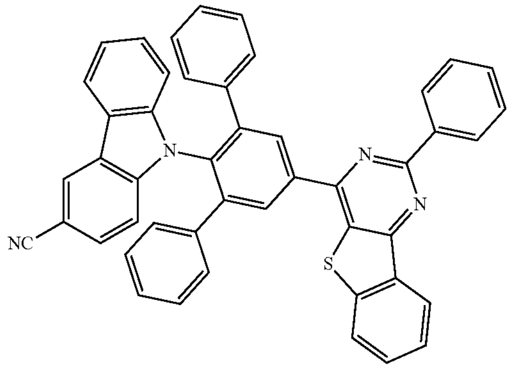
545
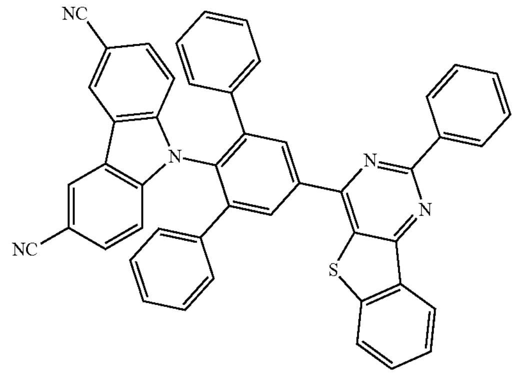
546
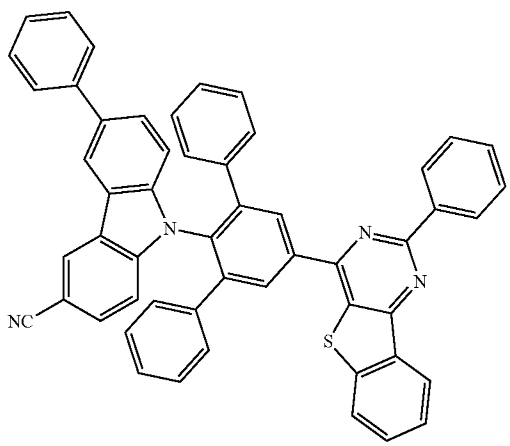
547
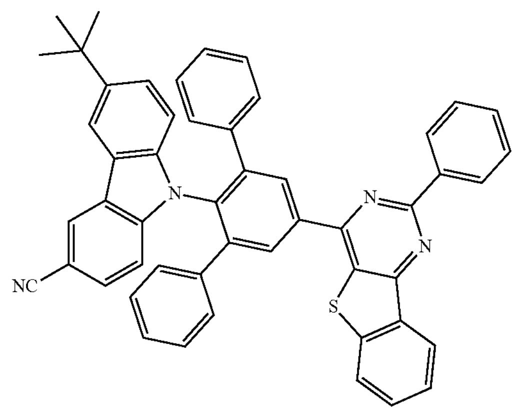
548
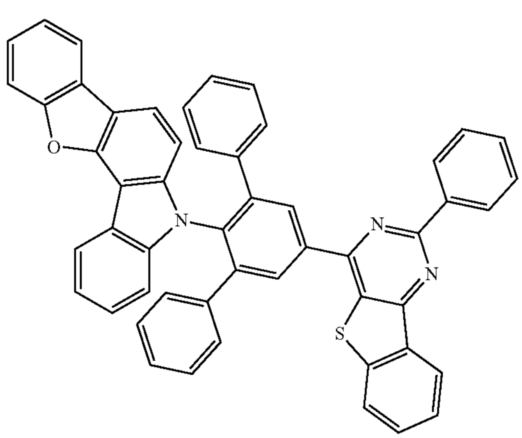
549
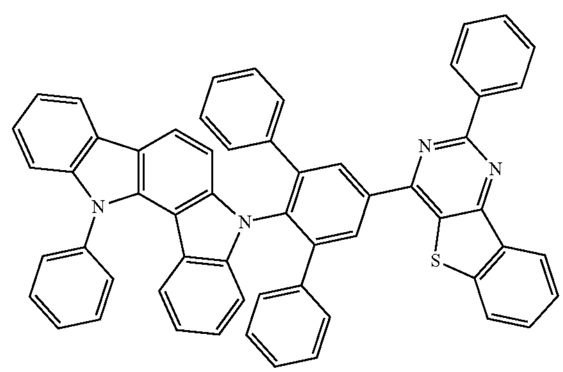

-continued
550
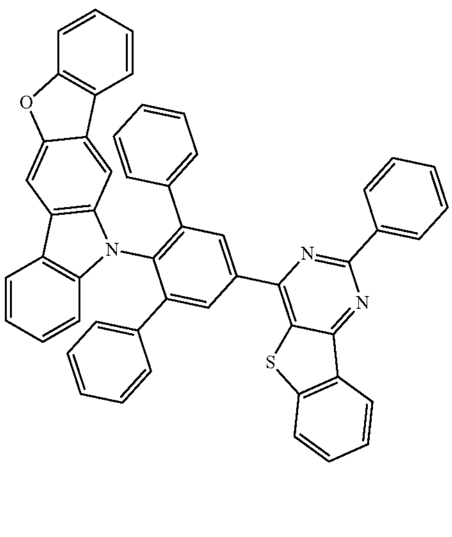
551
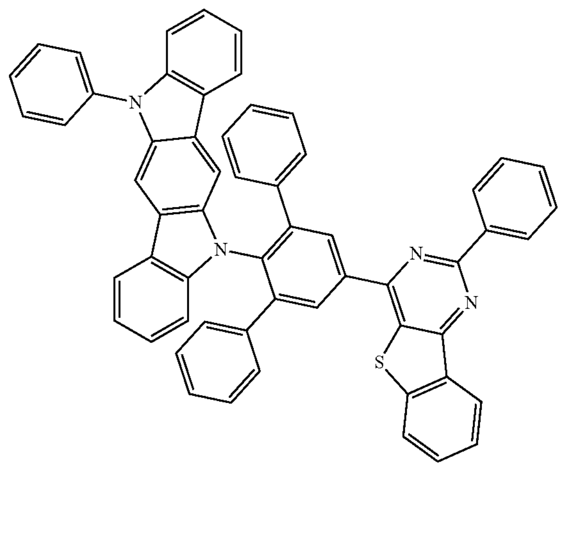
552
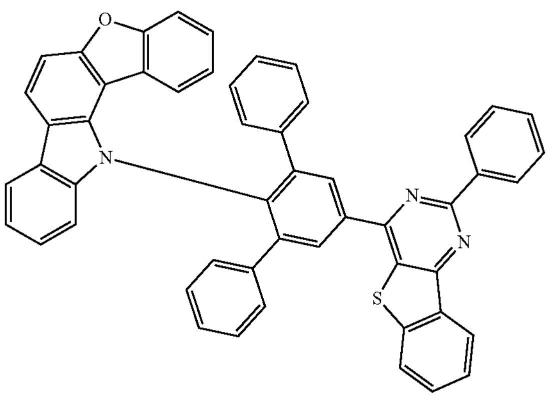
553
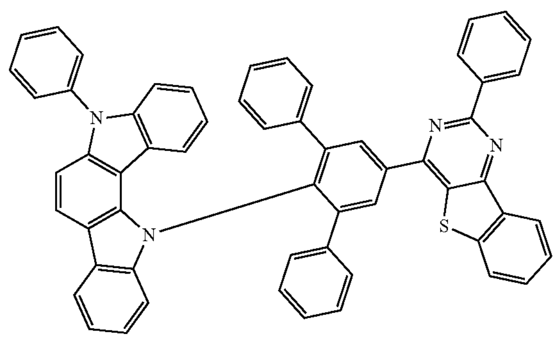
554
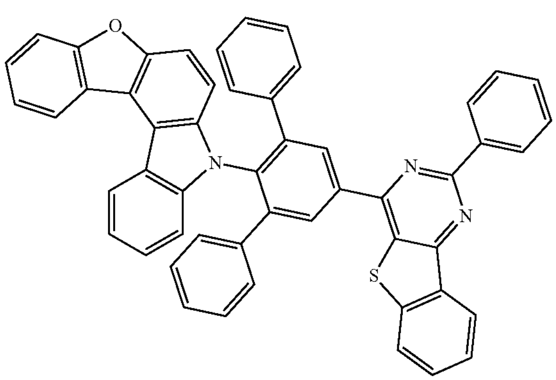
555
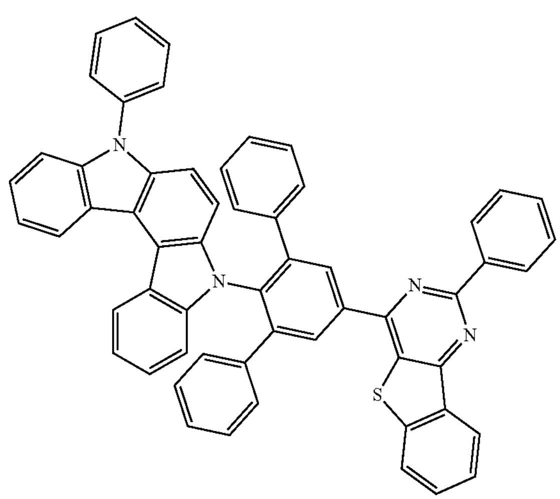

-continued
556
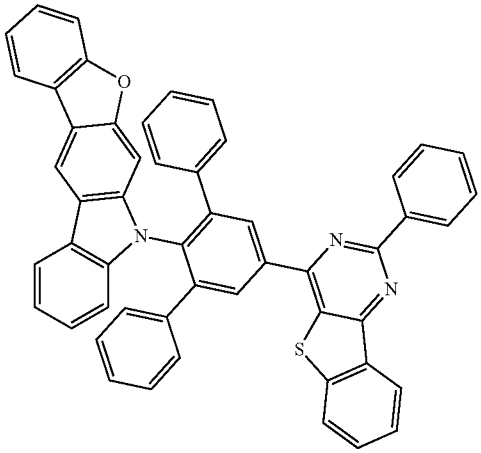
557
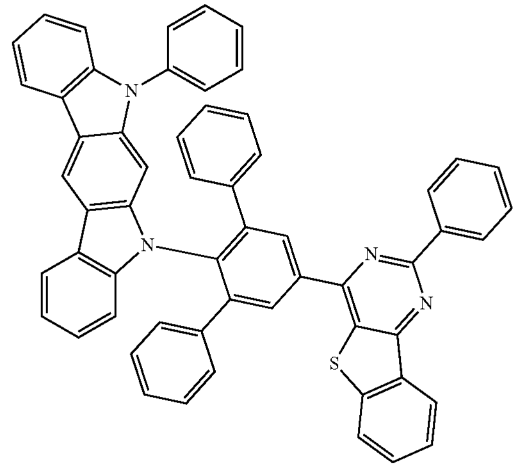
558
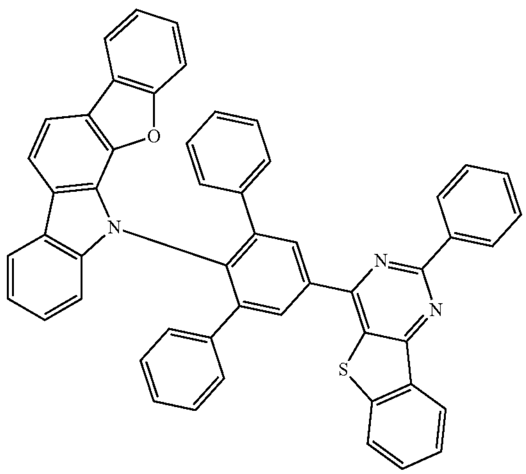
559
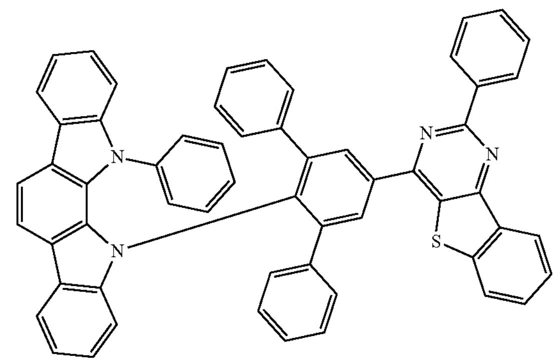
560
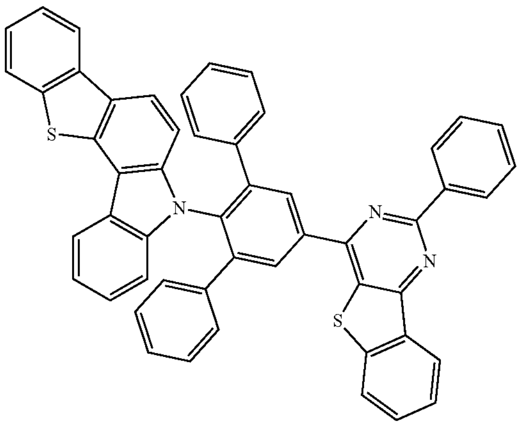
561
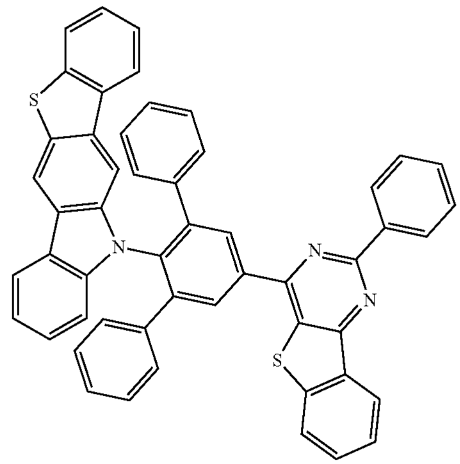

-continued
562
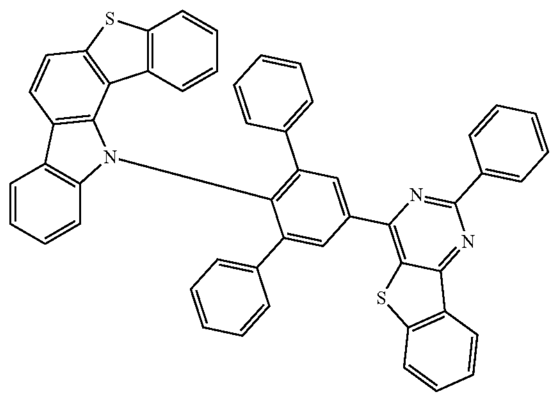
563
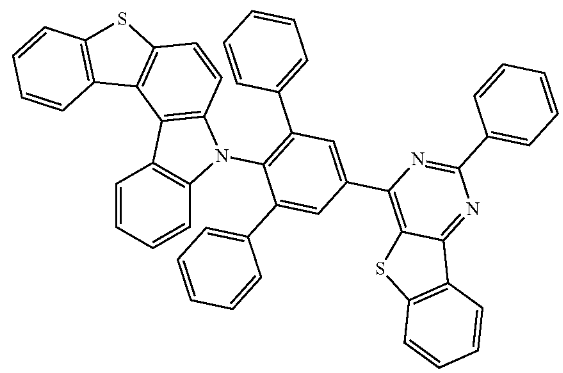
564
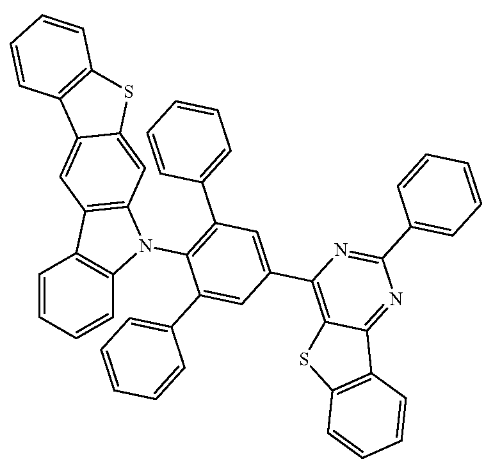
565
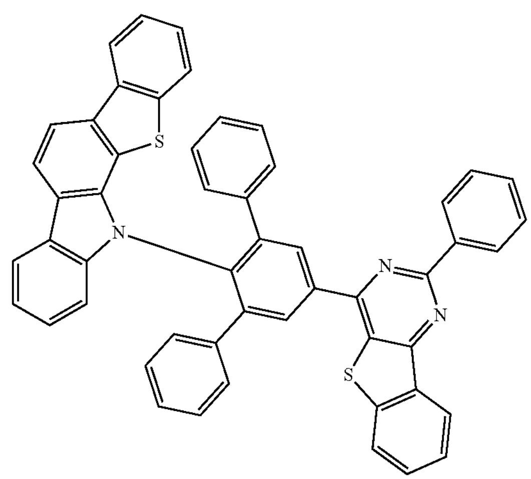
566
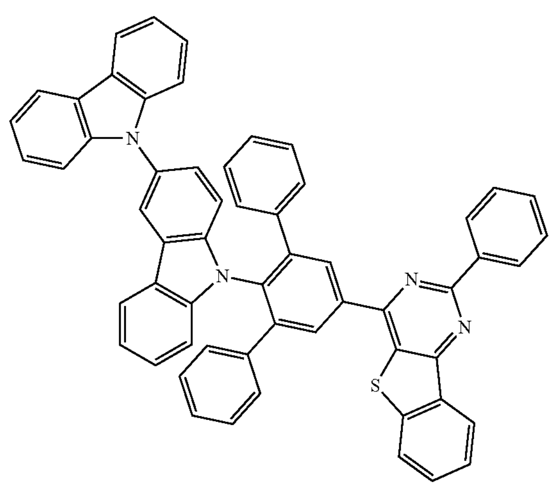
567
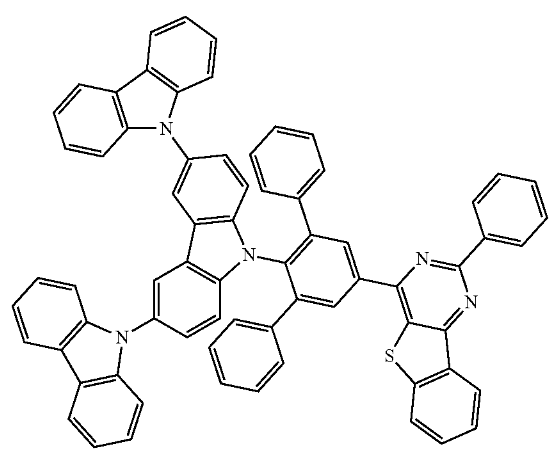

-continued
568
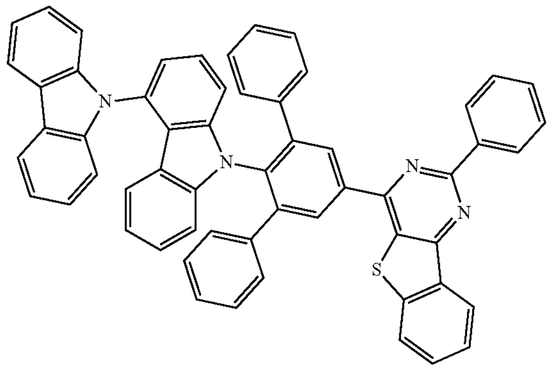
569
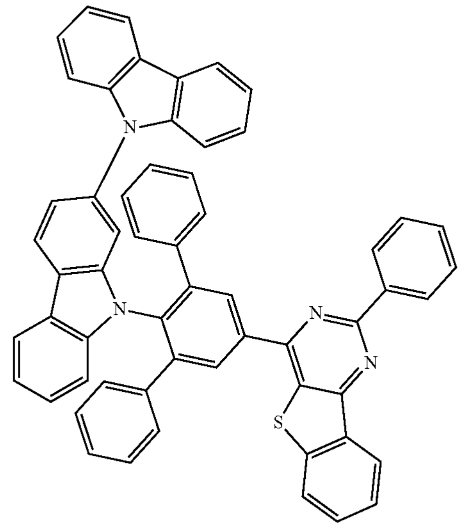
570
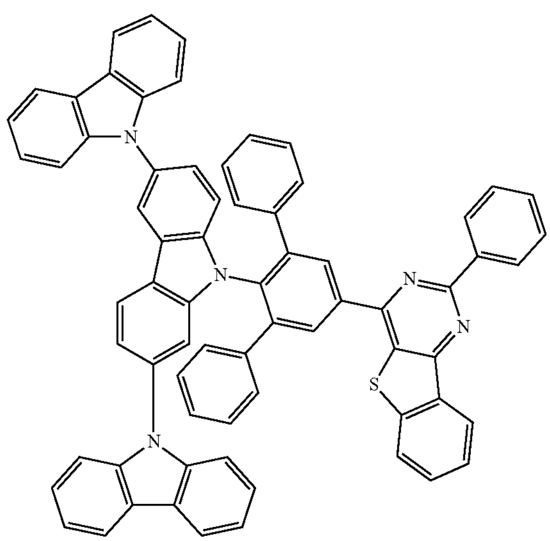
571
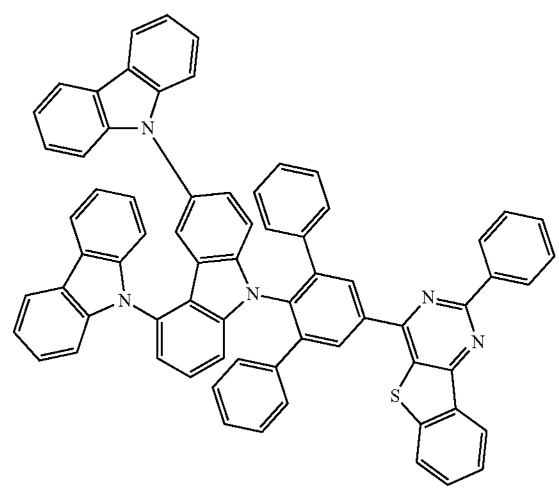

-continued
572
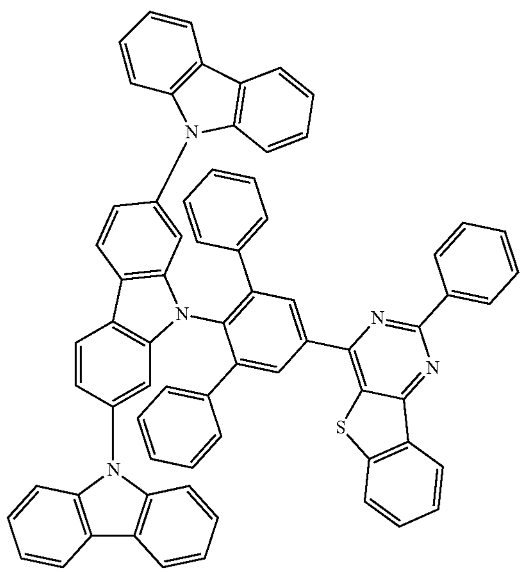
573
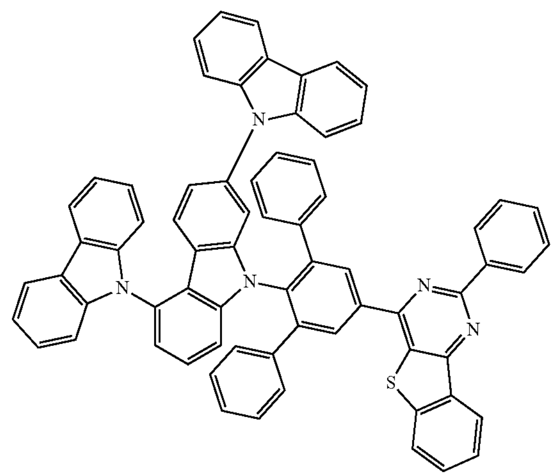
574
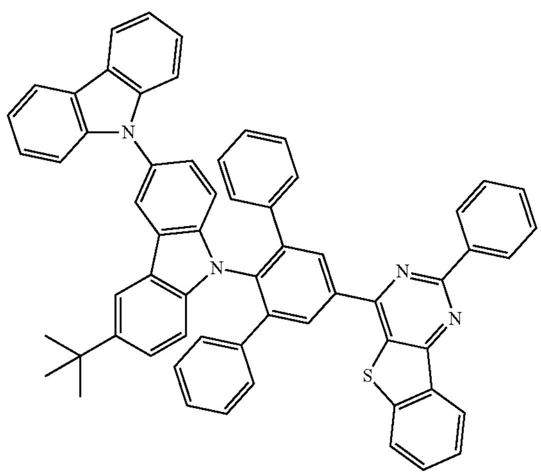
575
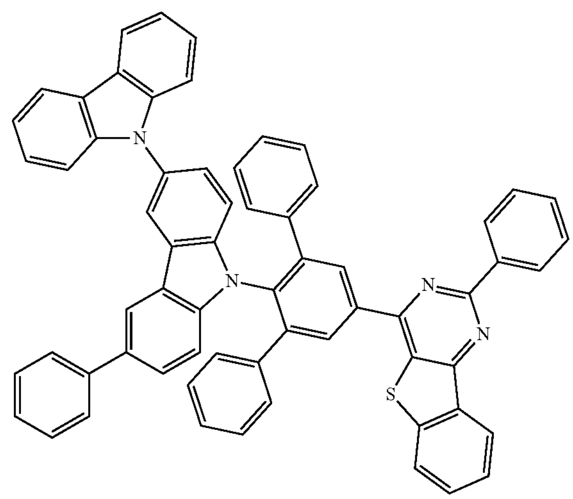
576
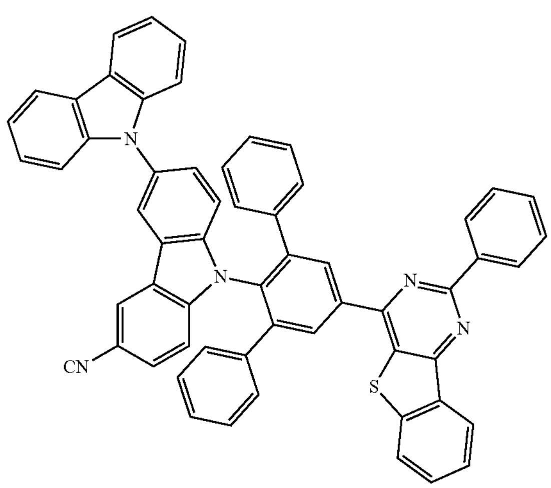
577
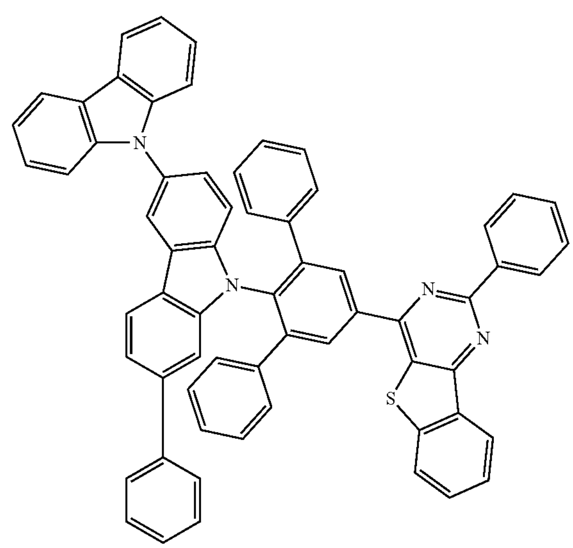

-continued
578
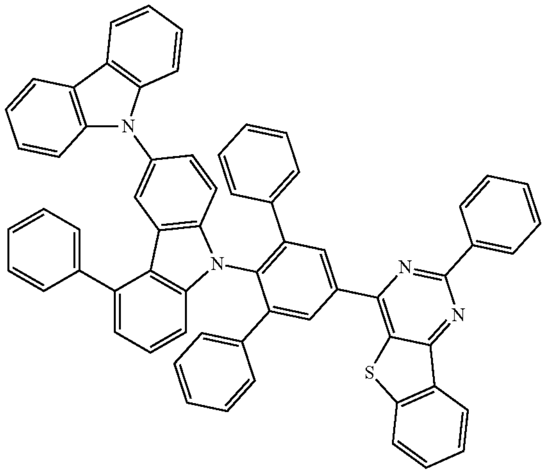
579
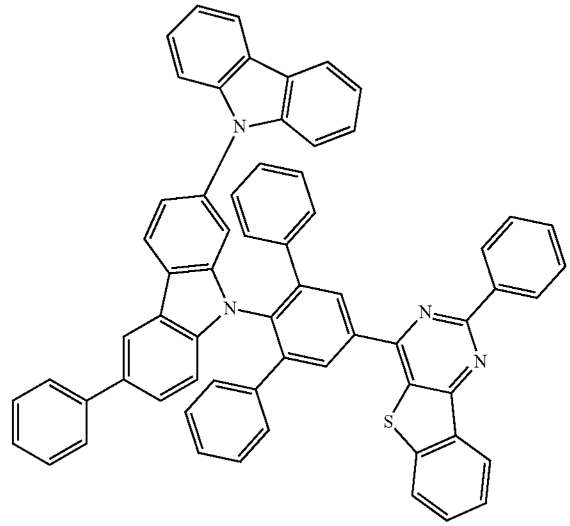
580
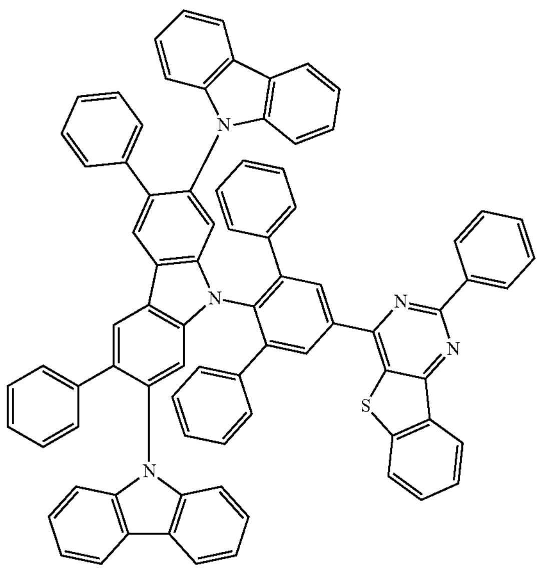
581
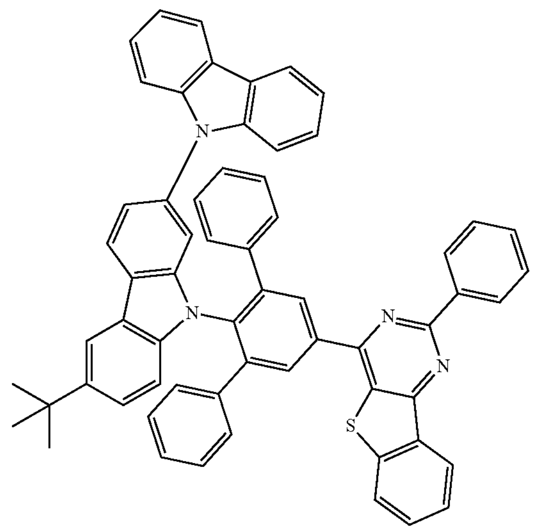
582
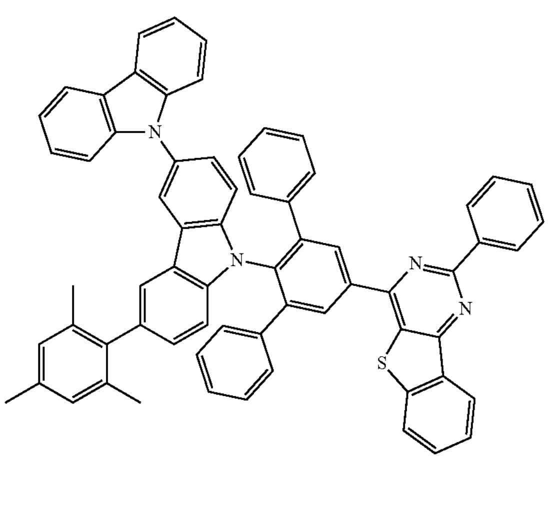
583
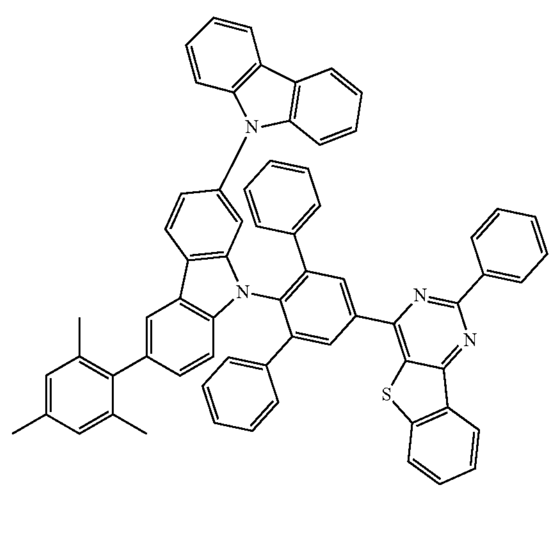

-continued
584
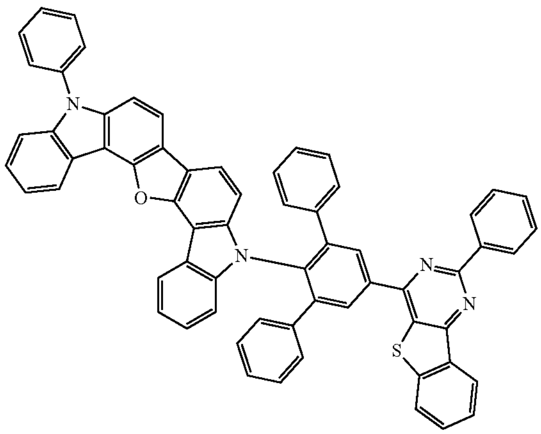
585
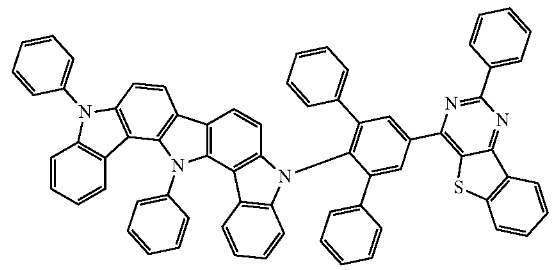
586
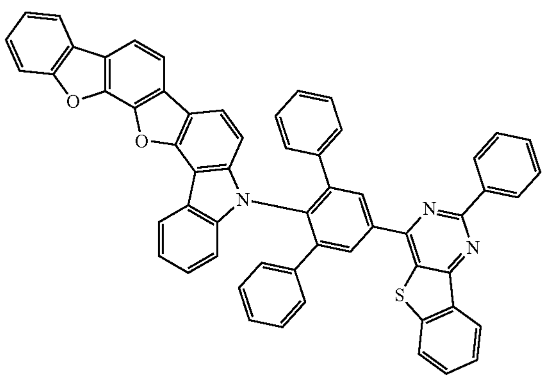
587
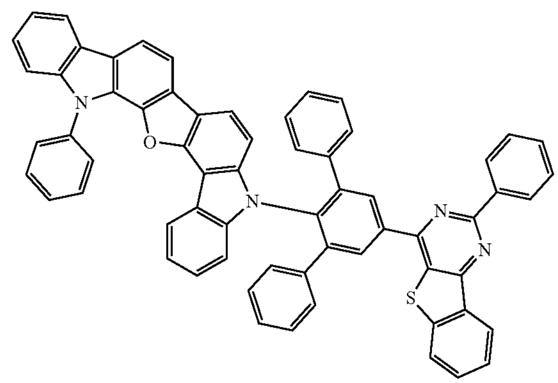
588
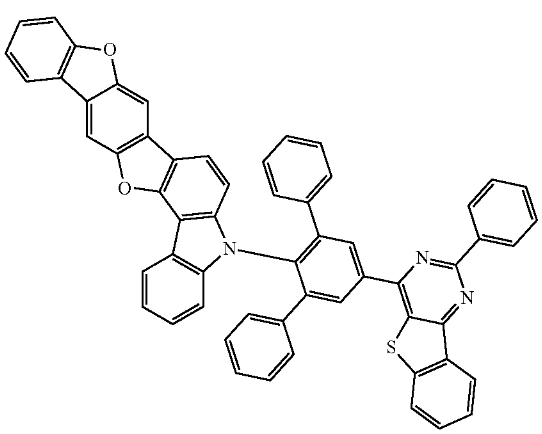
589
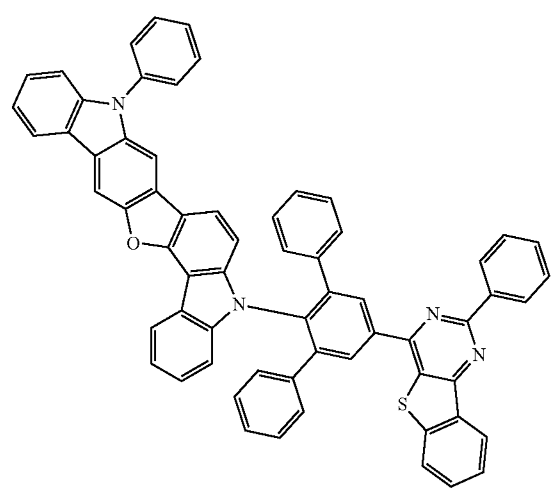

590
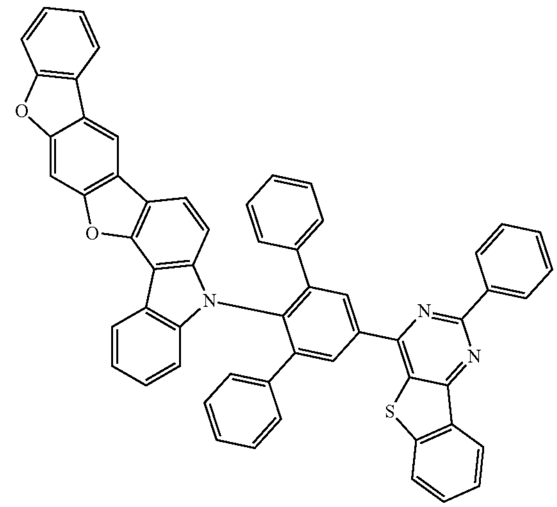
591
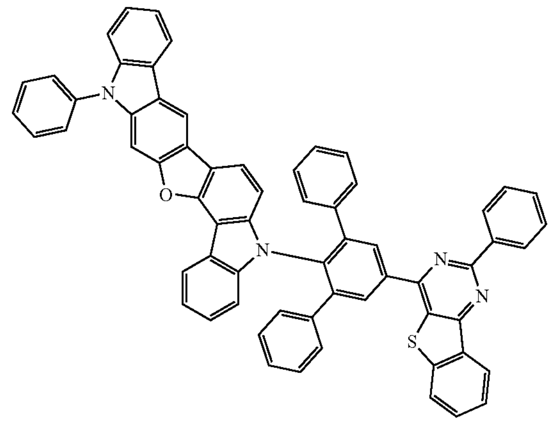
592
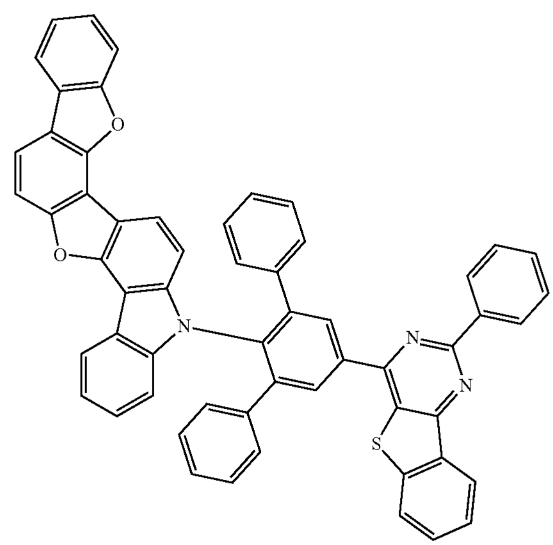
593
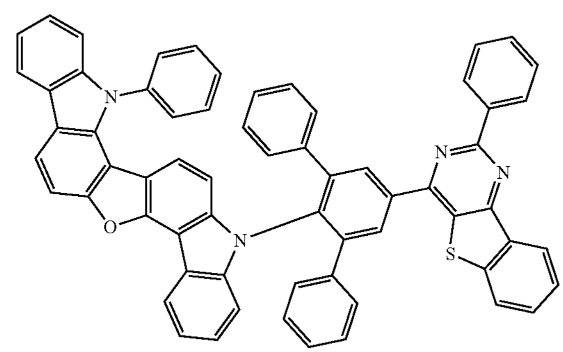
594
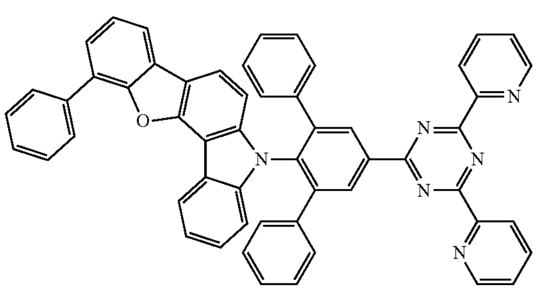
595
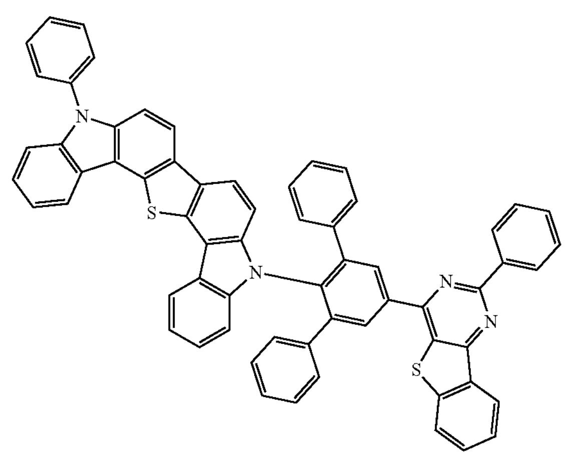

-continued
596
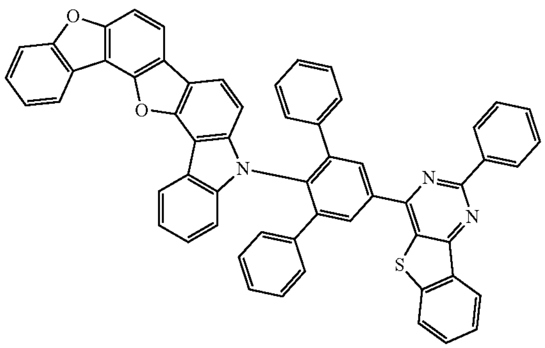
597
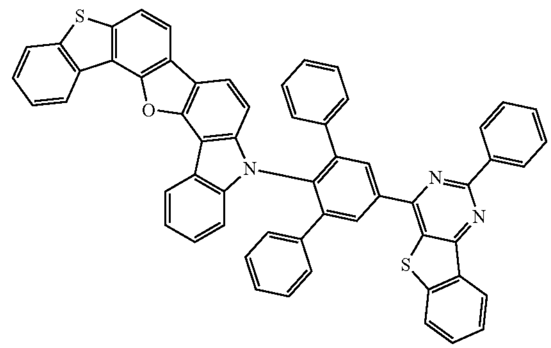
598
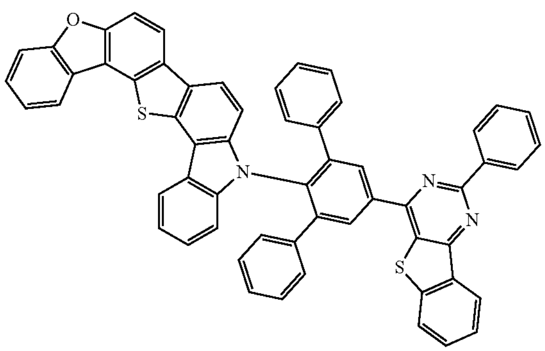
599
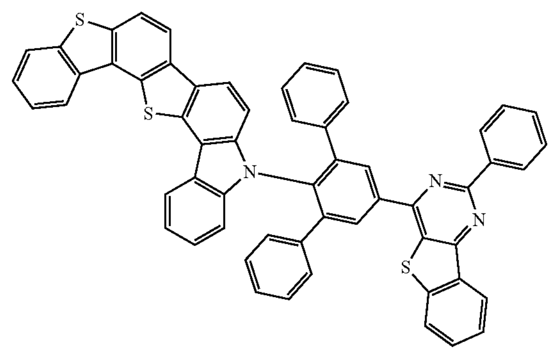
600
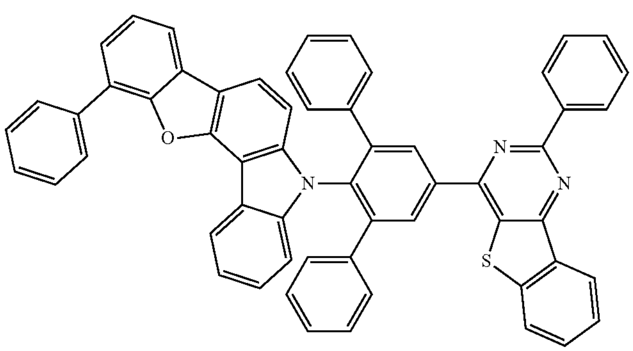
601
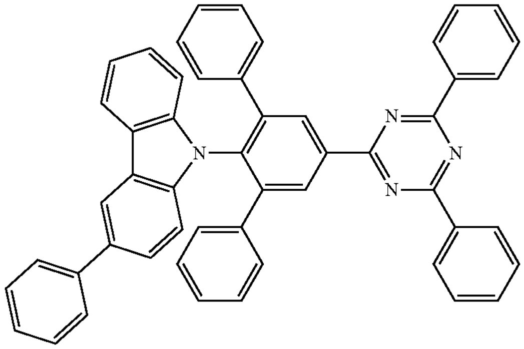
602
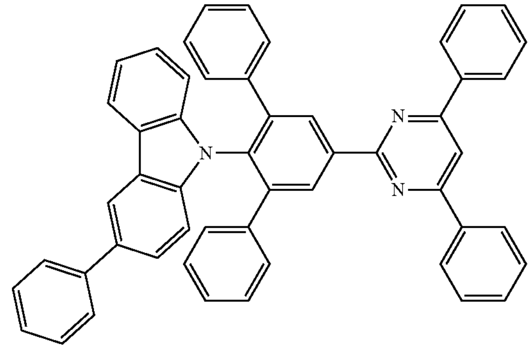

-continued
603
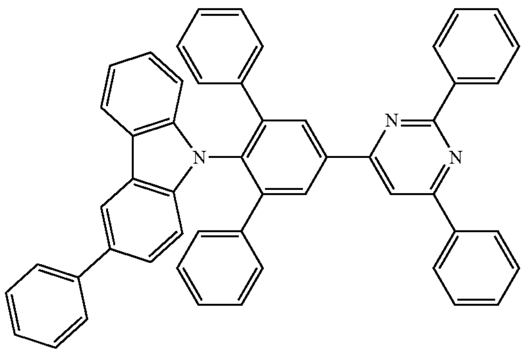
604
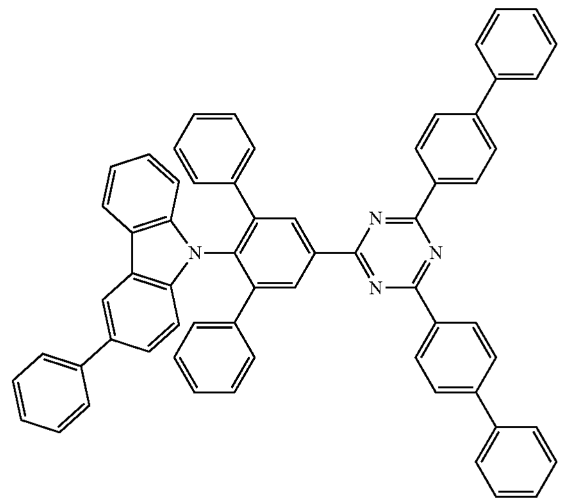
605
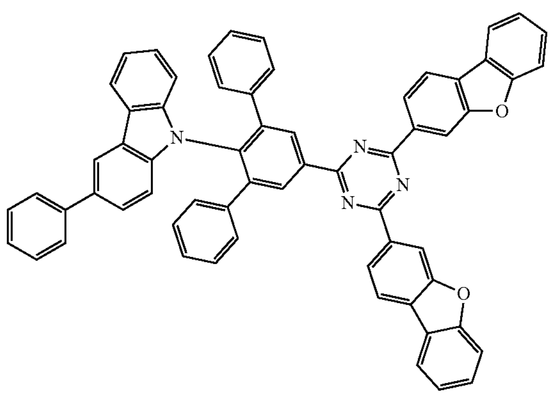
606
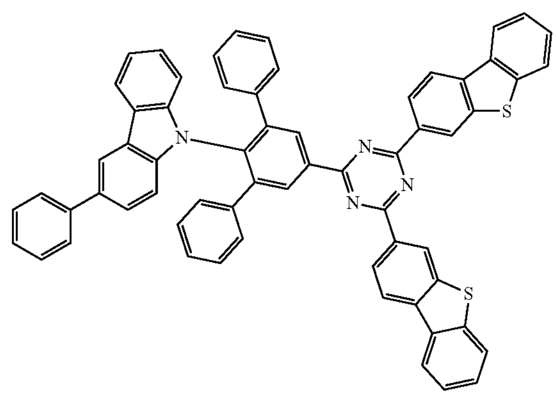
607
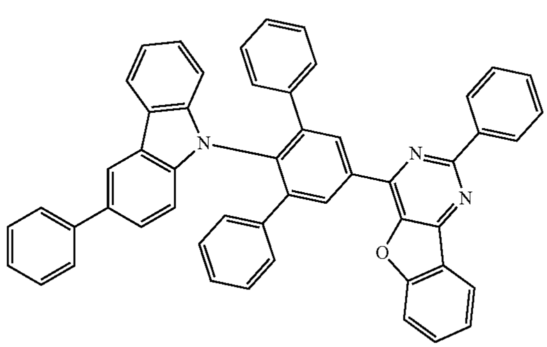
608
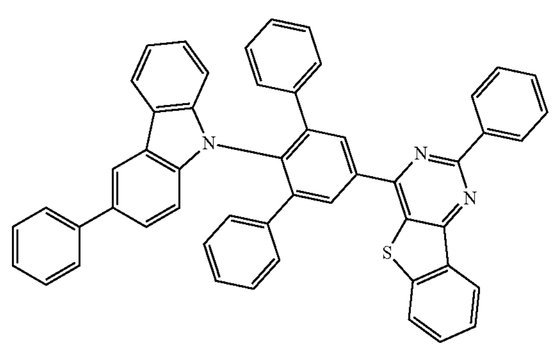

-continued
609
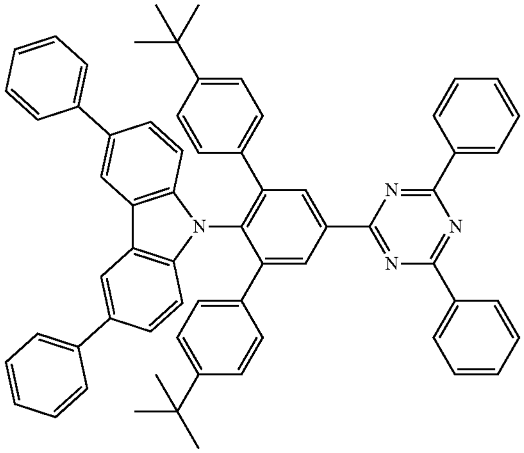
610
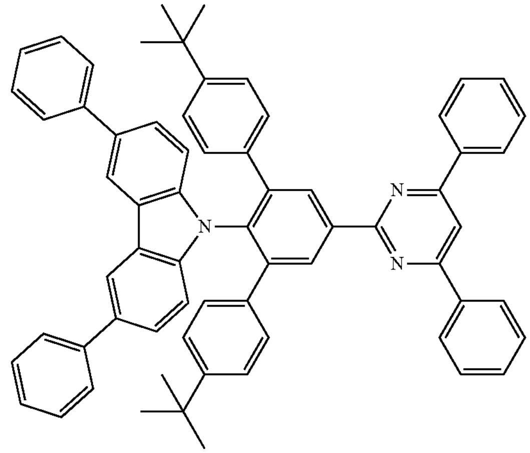
611
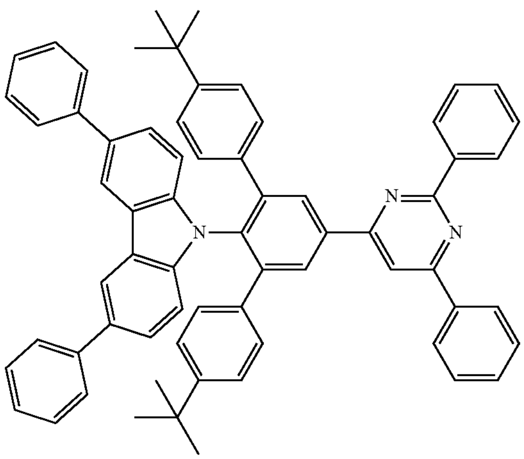
612
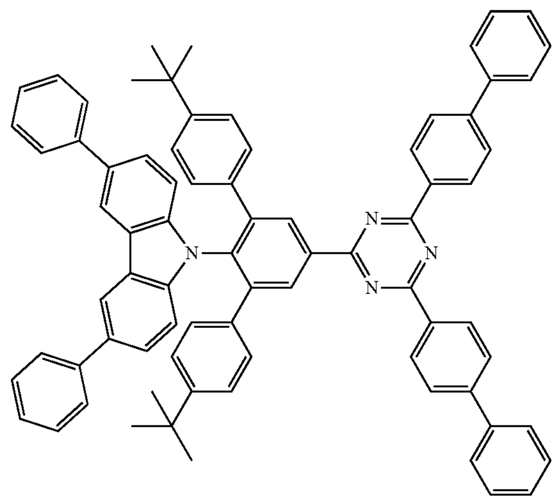
613
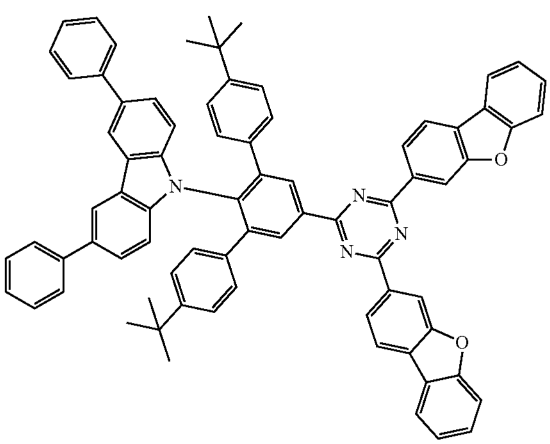
614
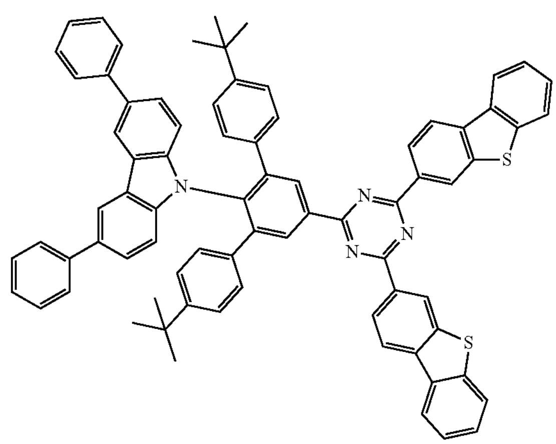

-continued
615
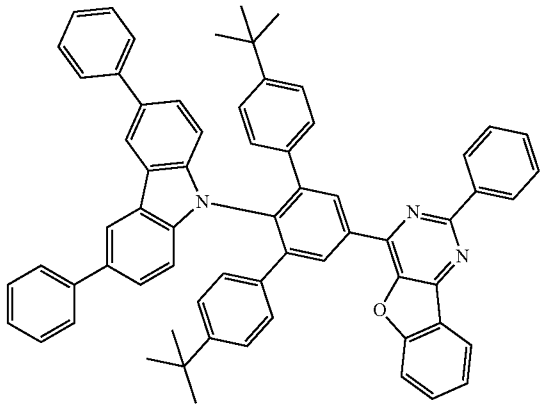
616
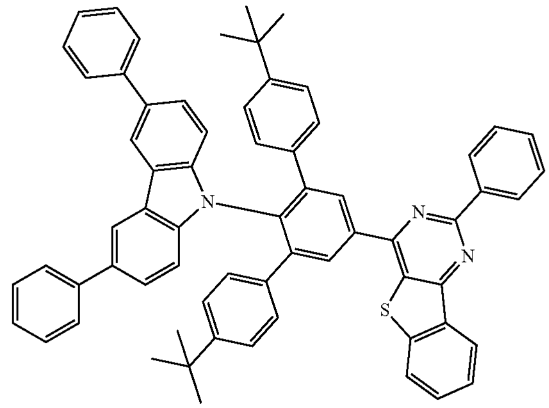
617
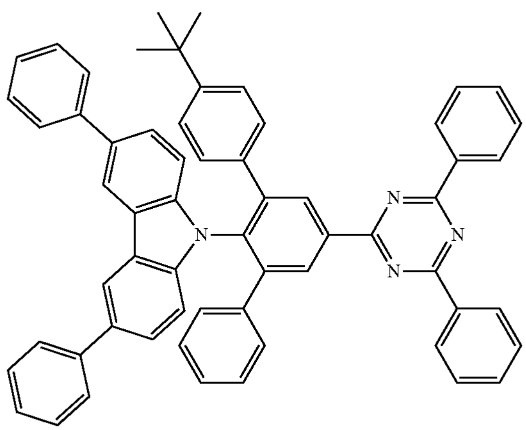
618
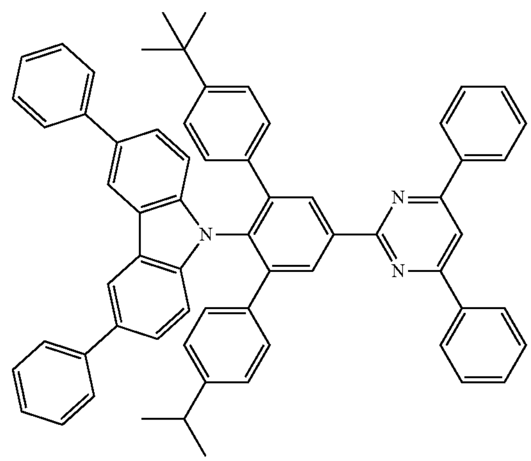
619
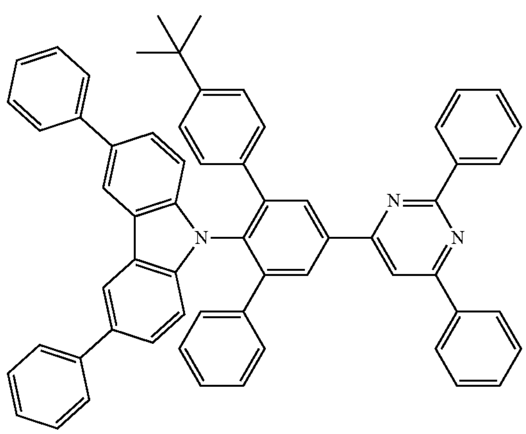
620
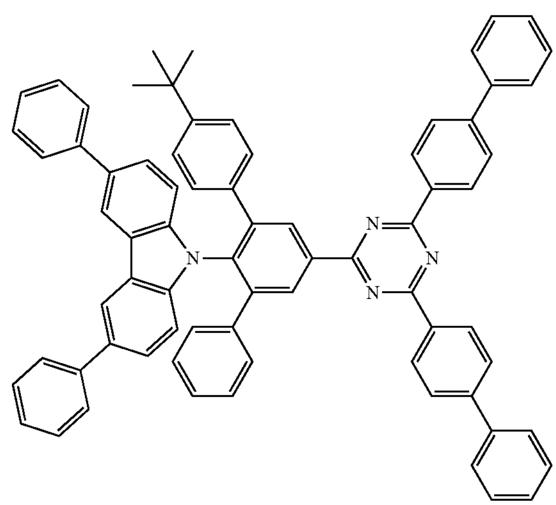

-continued
621
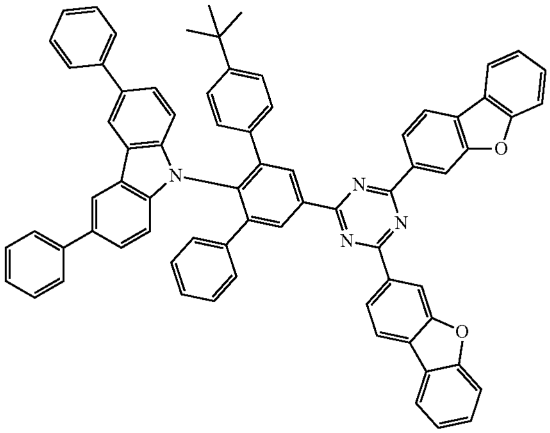
622
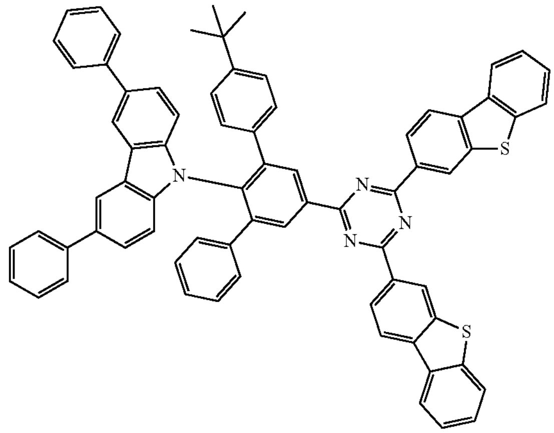
623
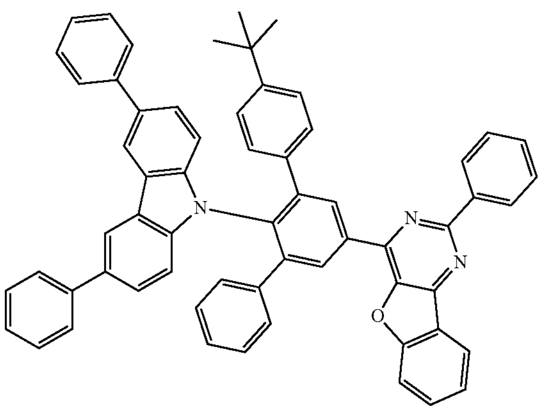
624
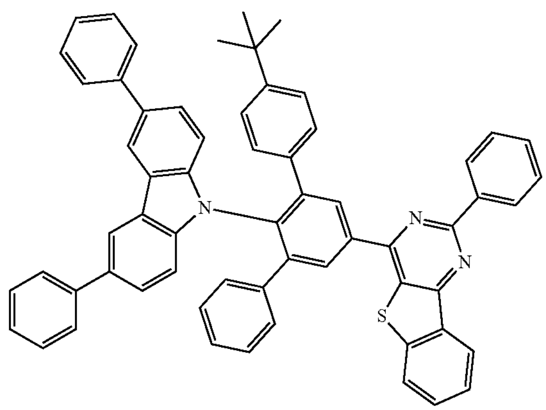
625
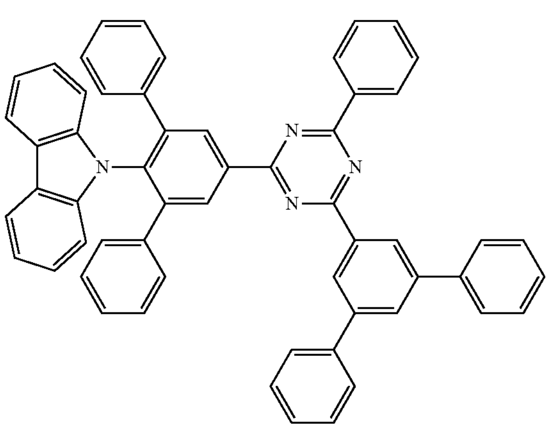
626
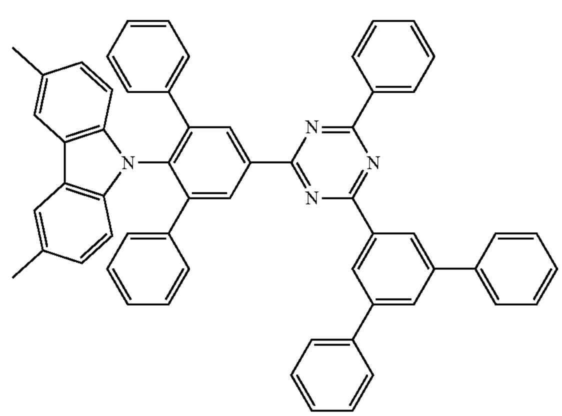

-continued
627
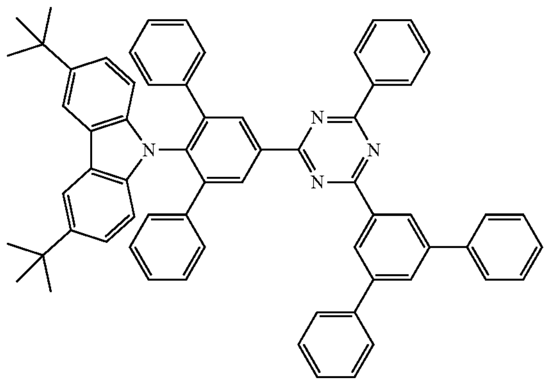
628
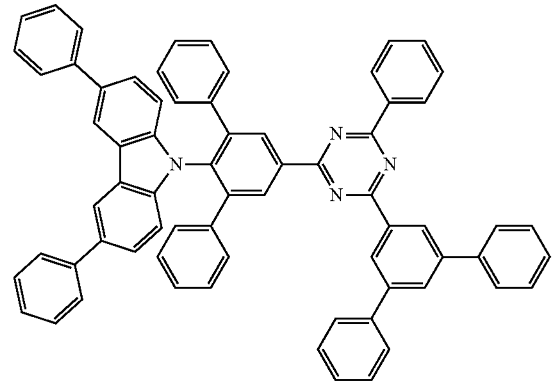
629
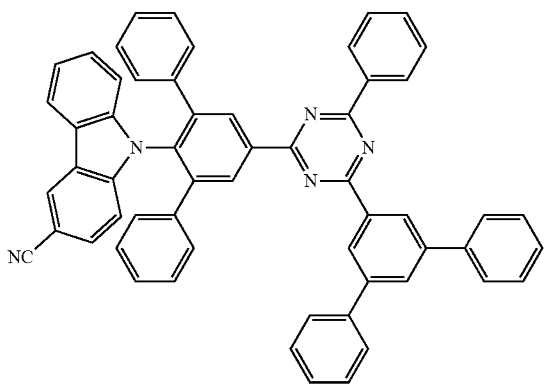
630
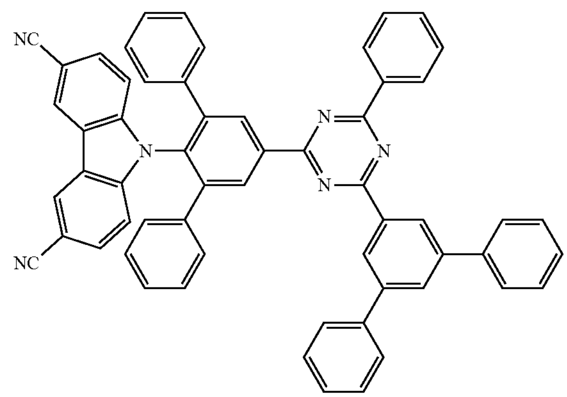
631
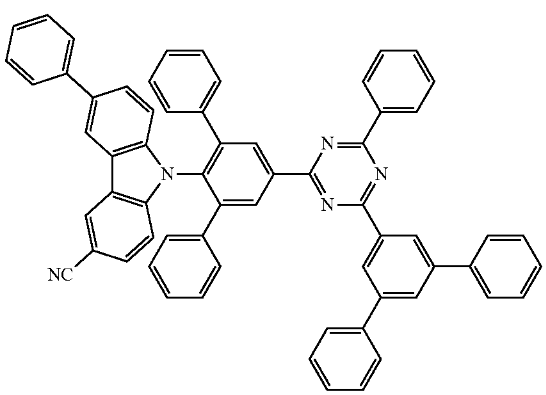
632
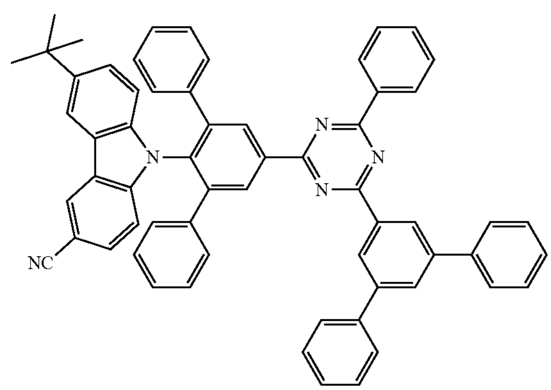
633
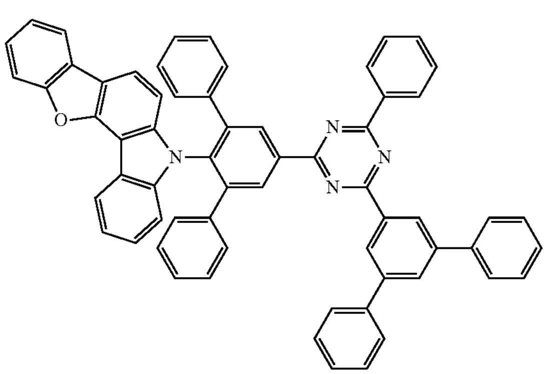
634
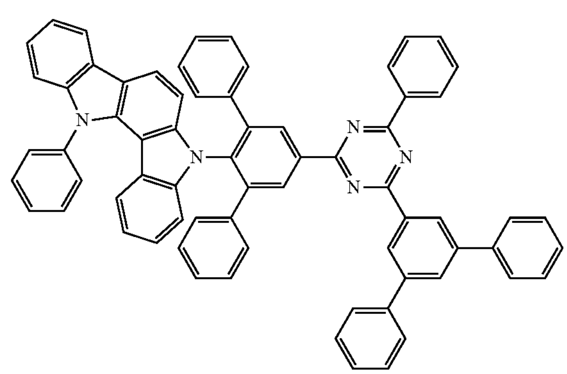

-continued
635
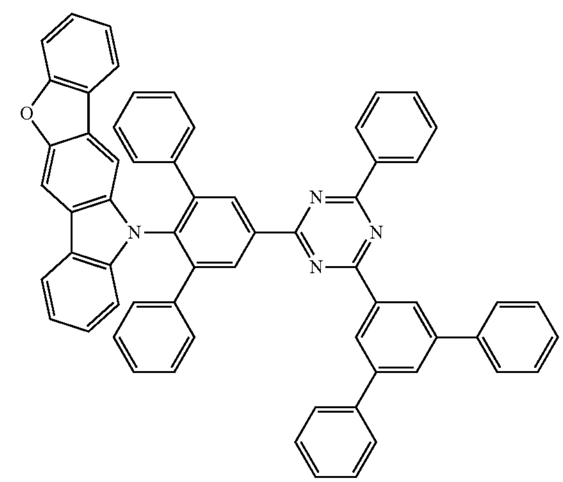
636
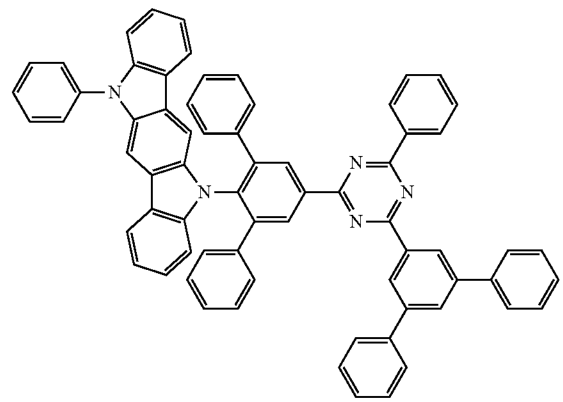
637
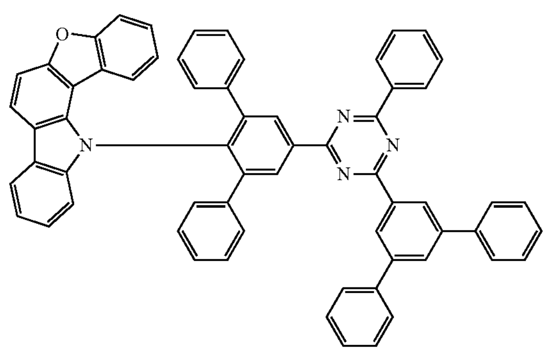
638
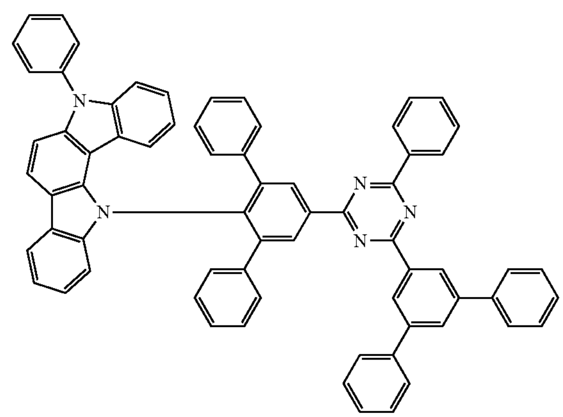
639
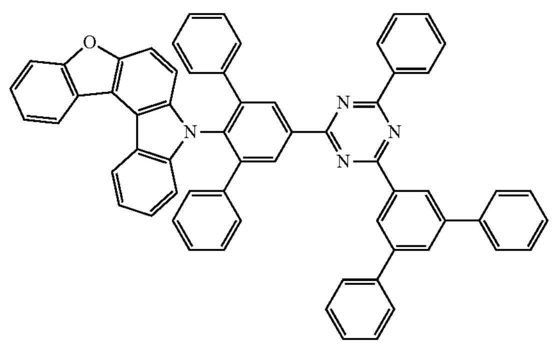
640
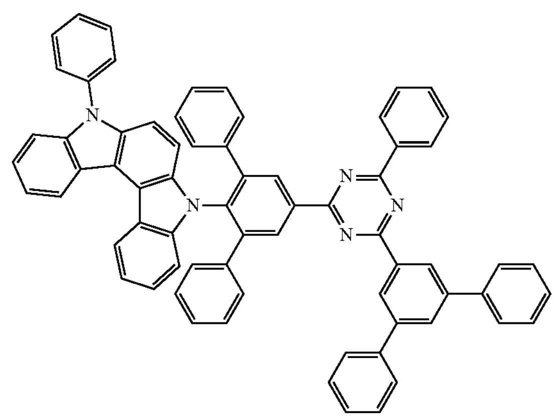

-continued
641
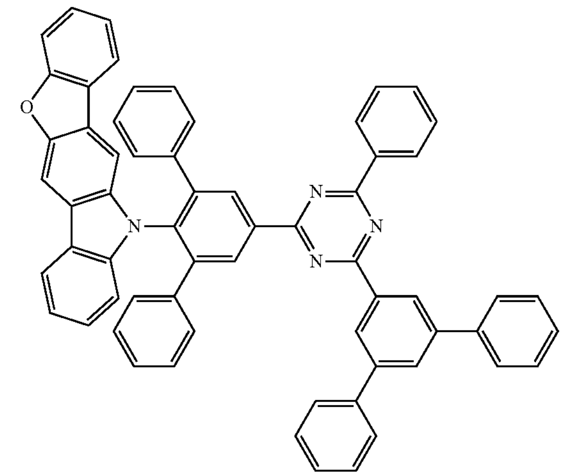
642
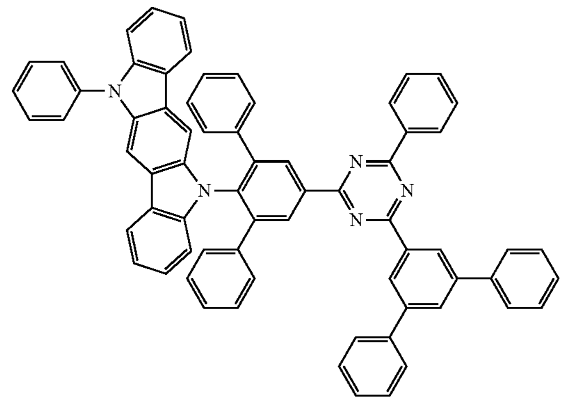
643
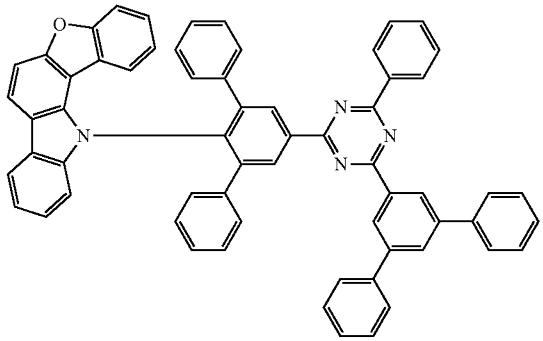
644
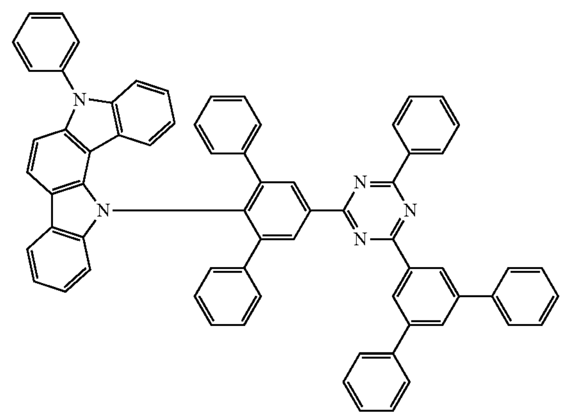
645
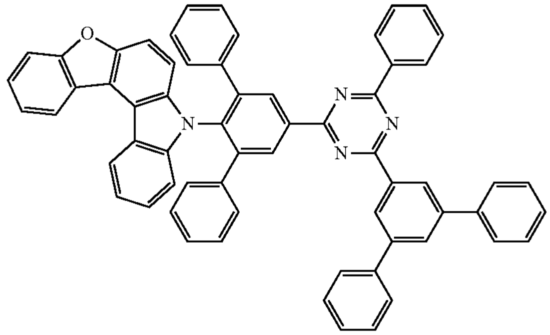
646
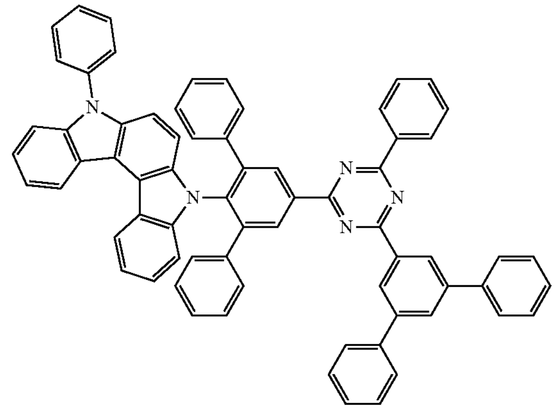

-continued
647
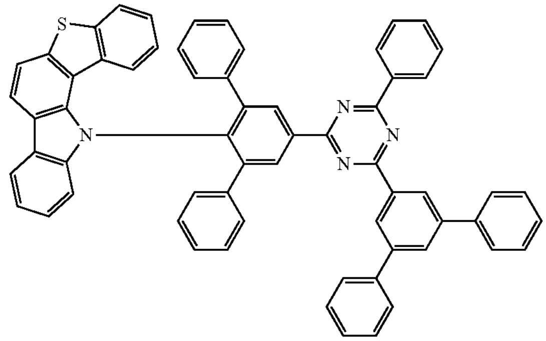
648
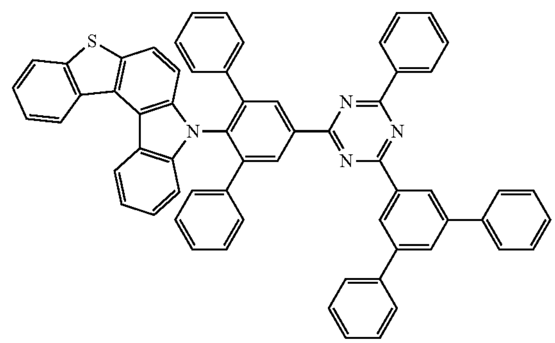
649
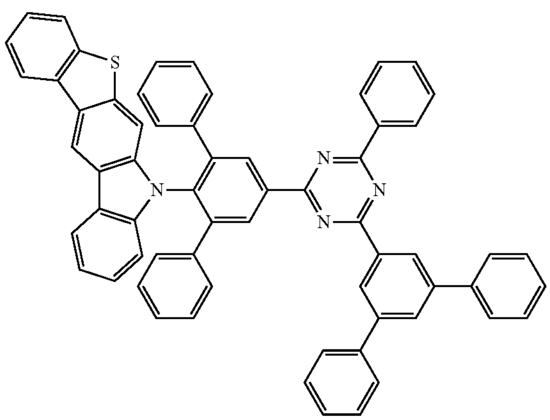
650
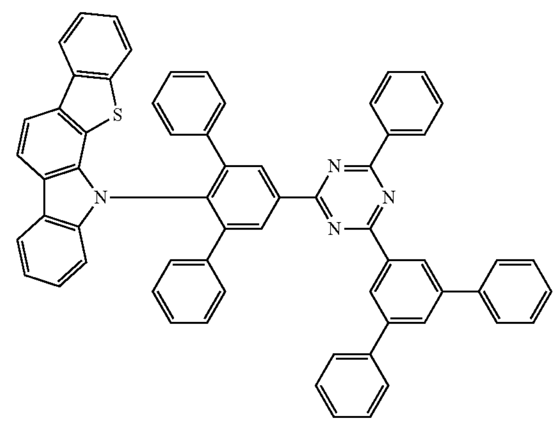
651
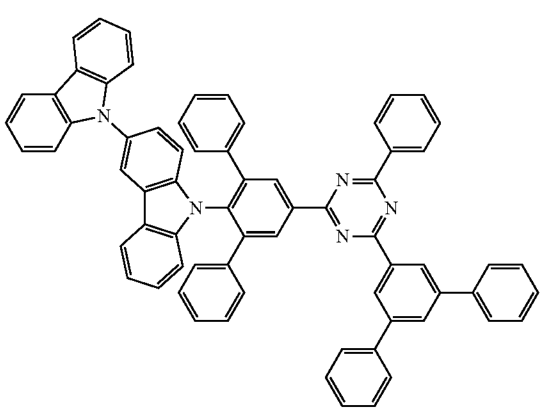
652
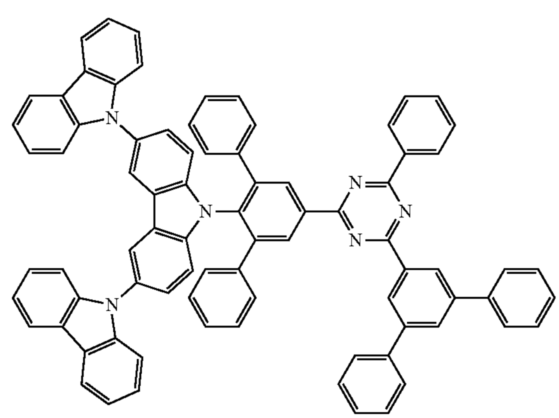

-continued
653
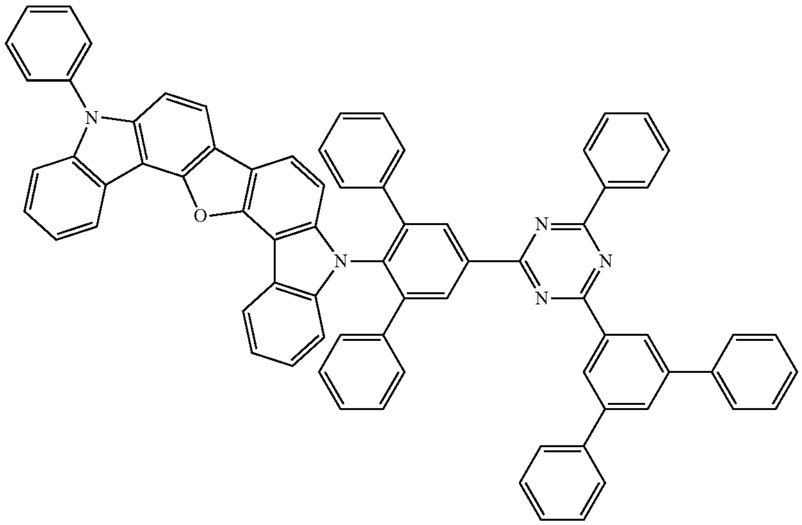
654
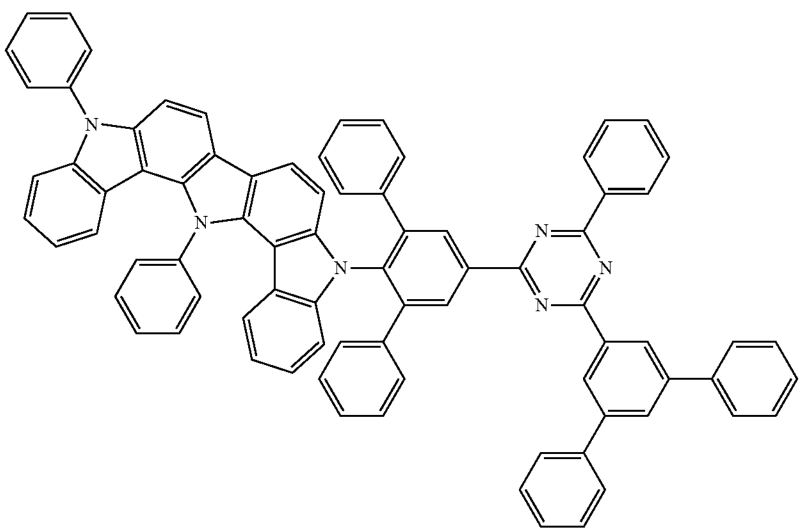
655
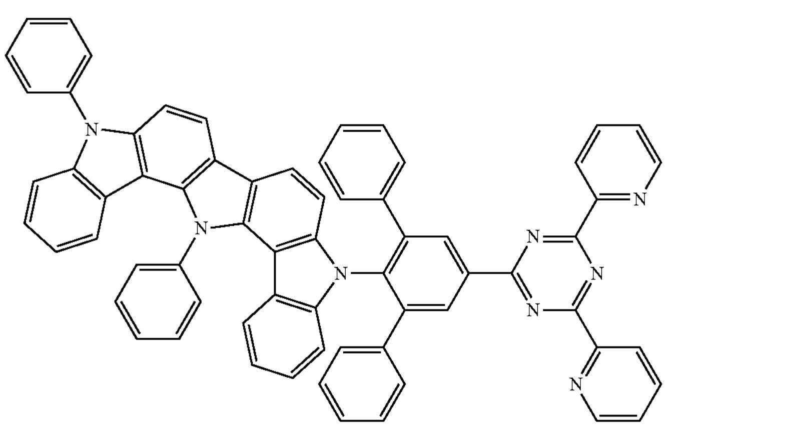

-continued
656
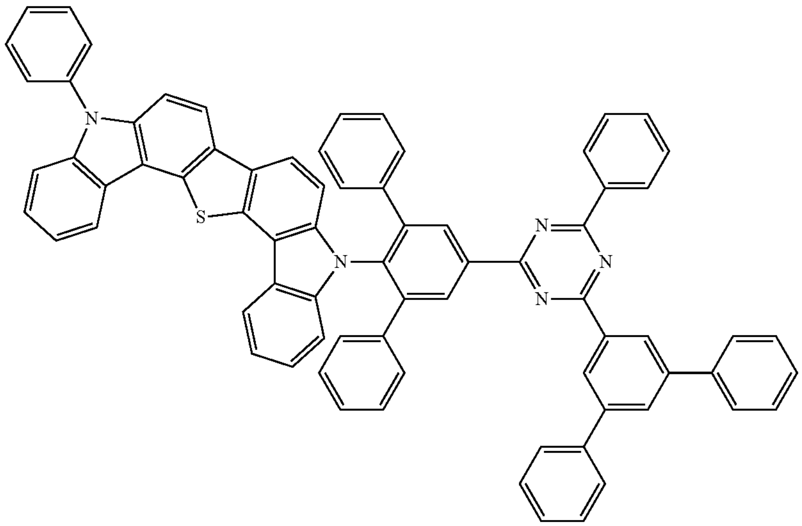
657
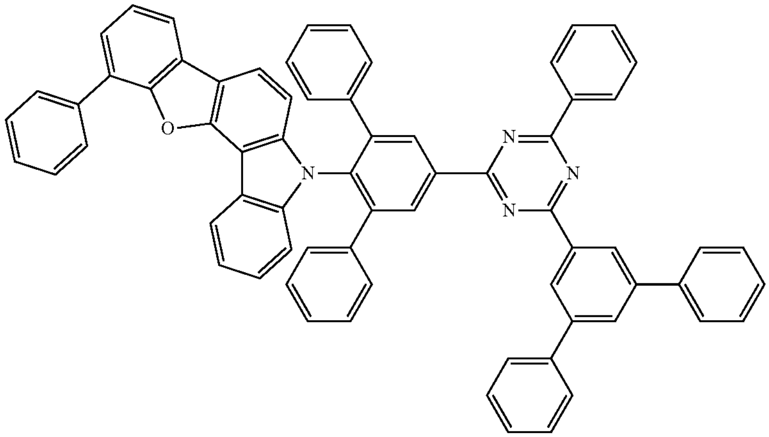
658
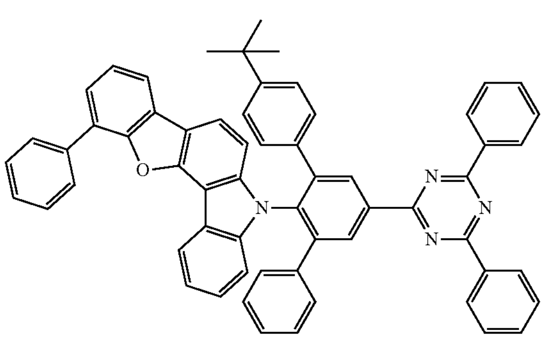
659
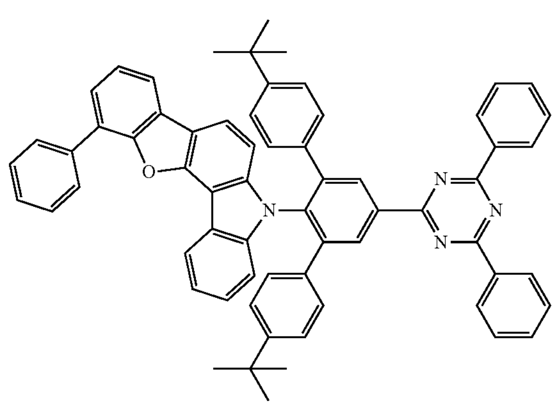

-continued
660
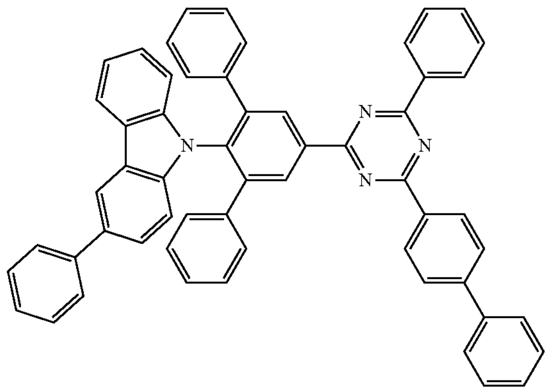
661
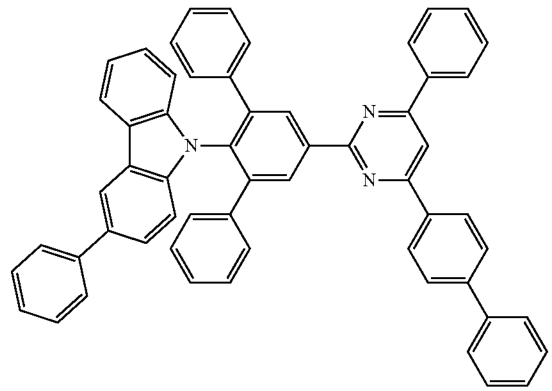
662
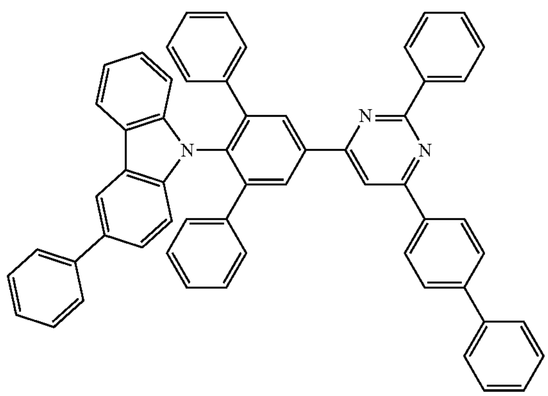
663
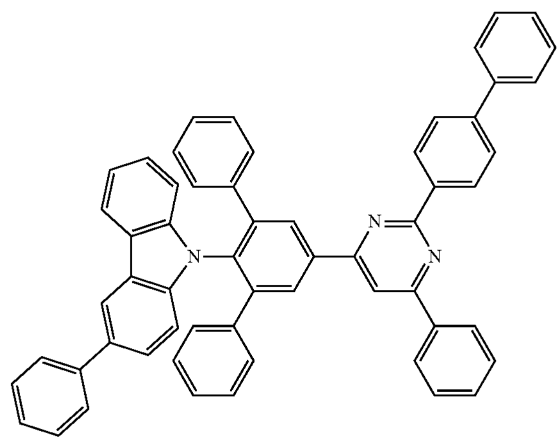
664
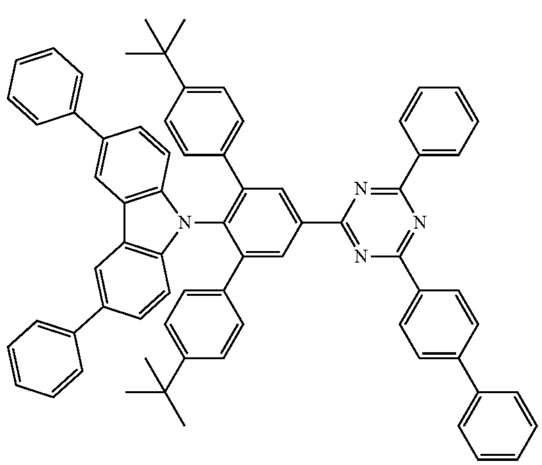
665
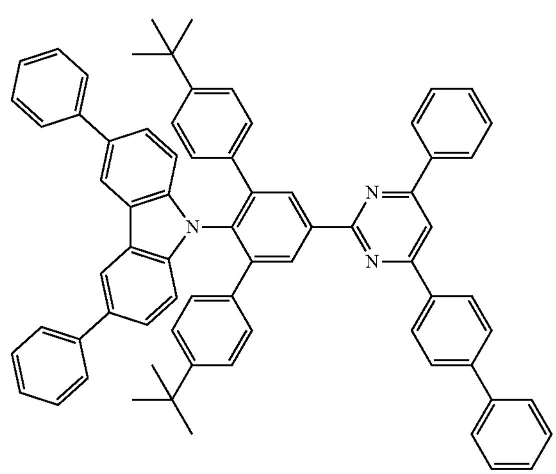

-continued
666
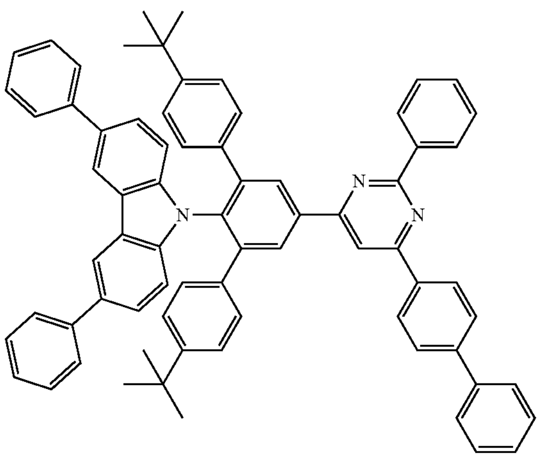
667
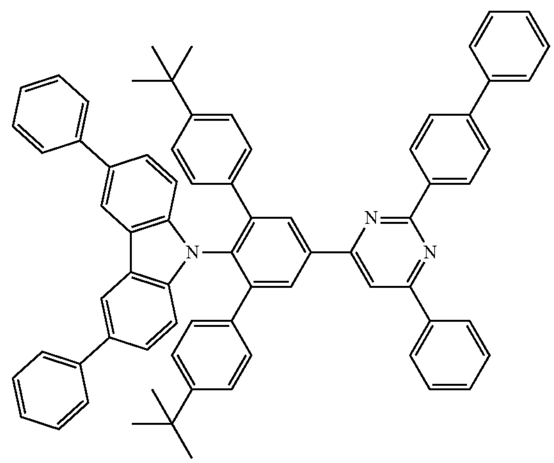
668
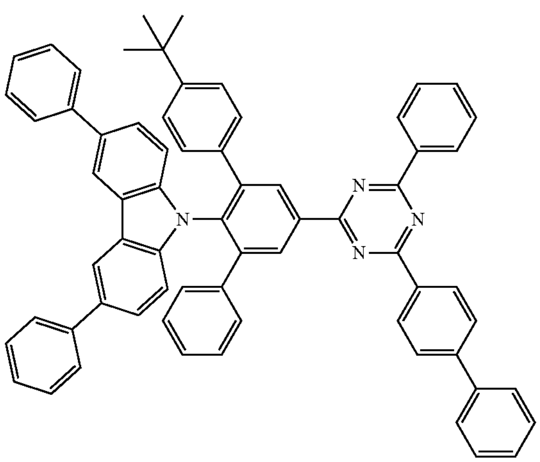
669
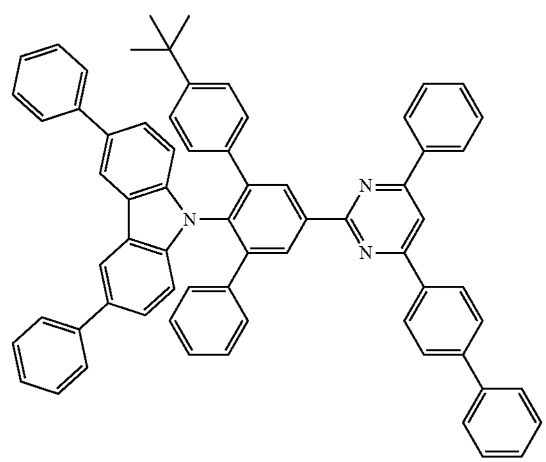
670
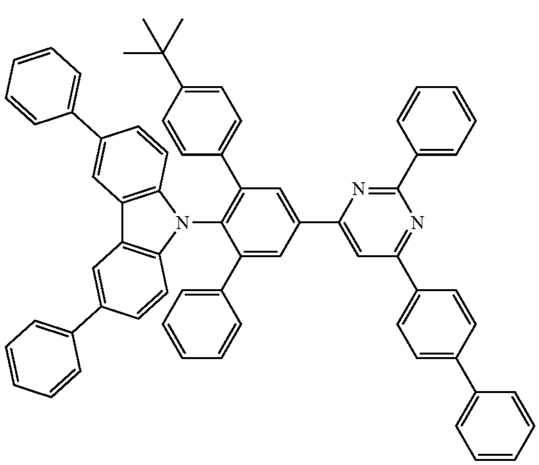
671
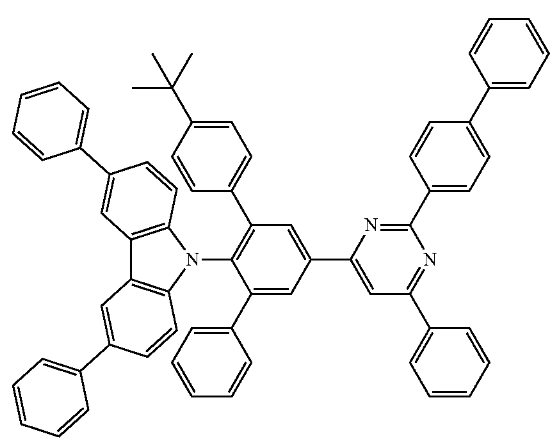

-continued
672
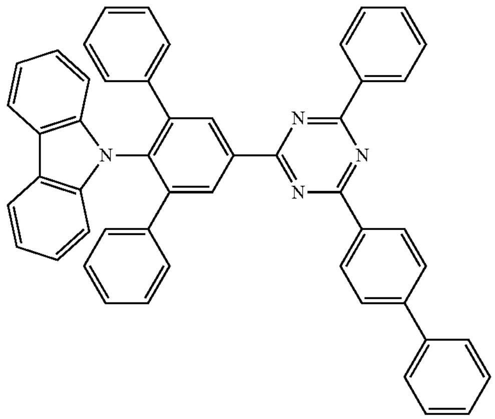
673
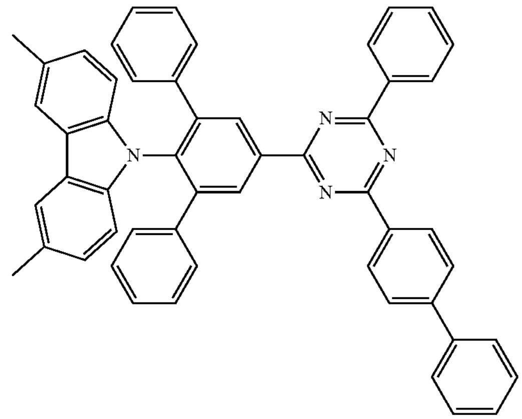
674
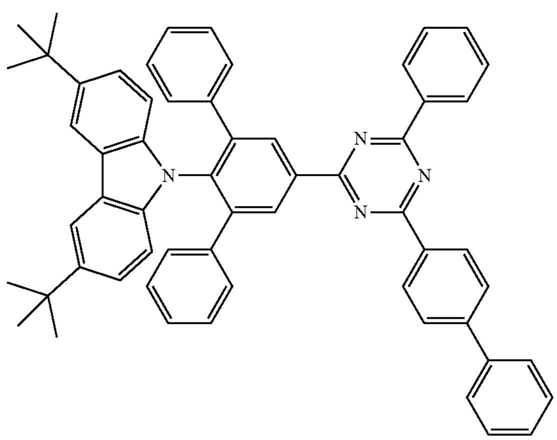
675
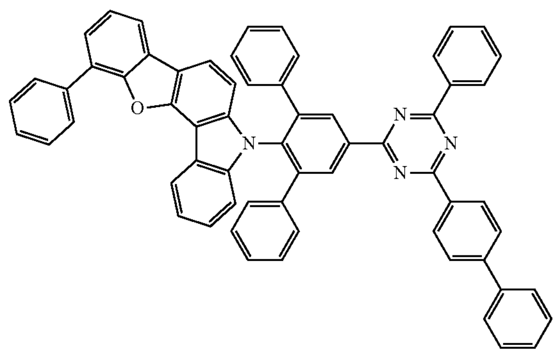
676
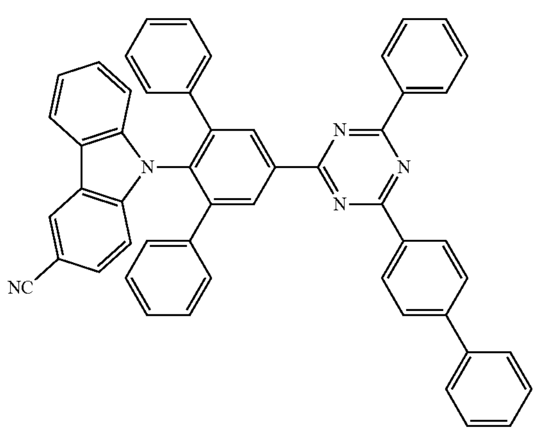
677
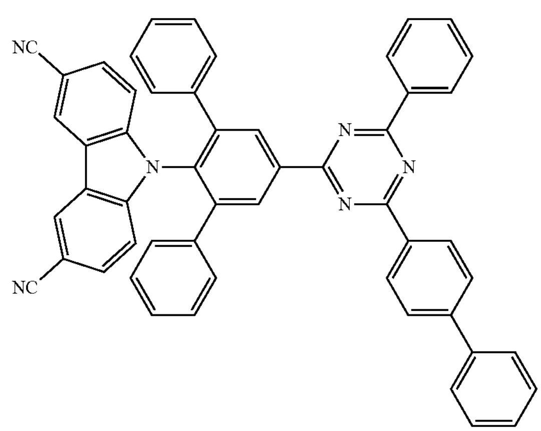

-continued
678
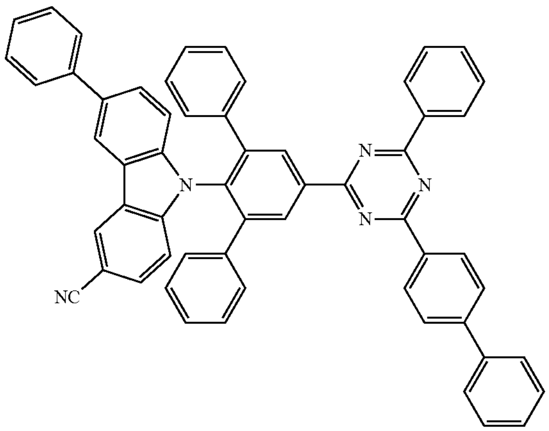
679
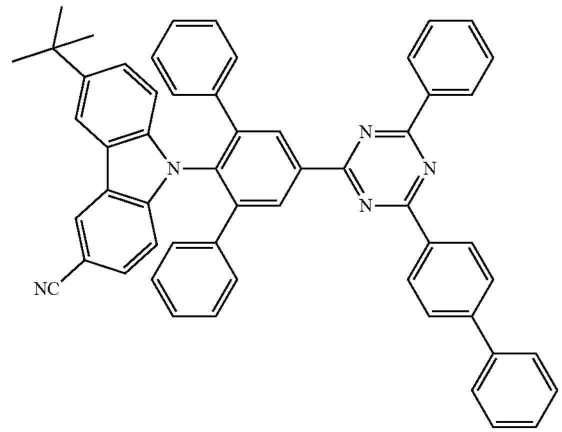
680
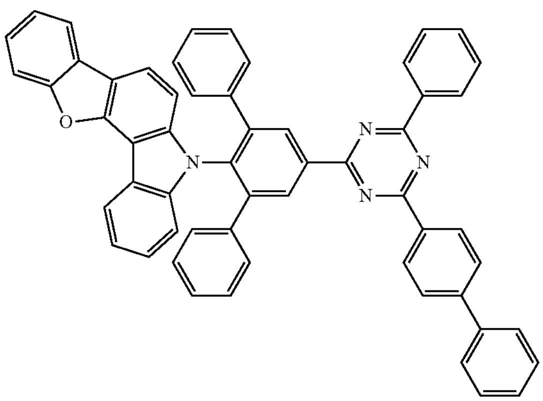
681
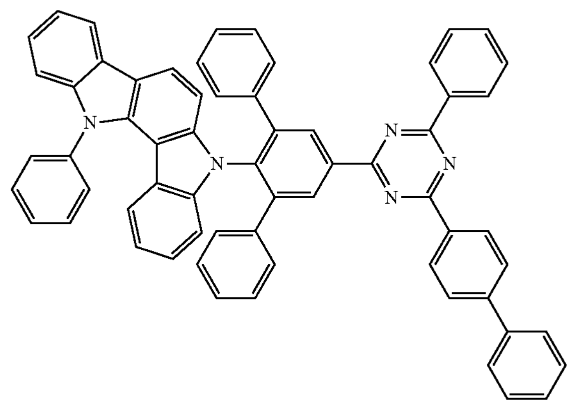
682
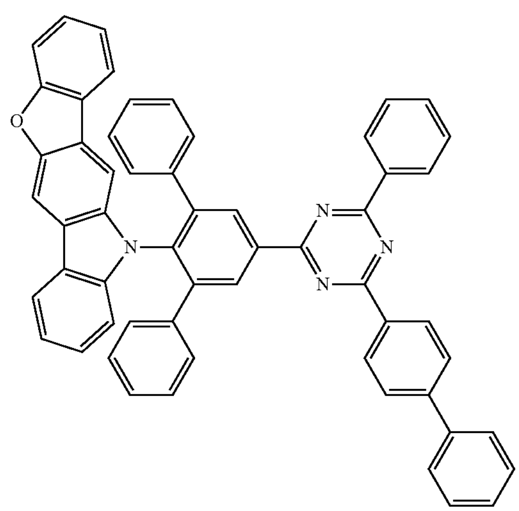
683
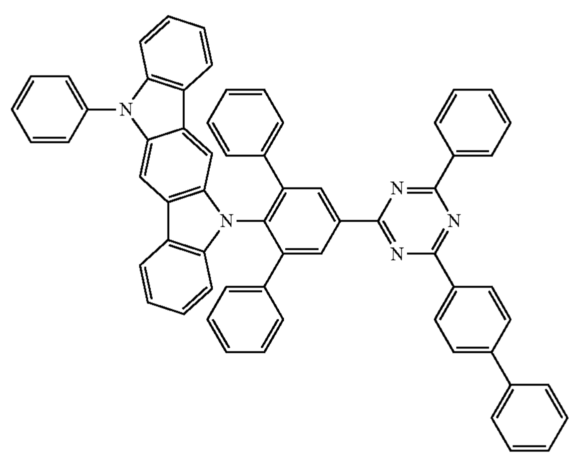

-continued
684
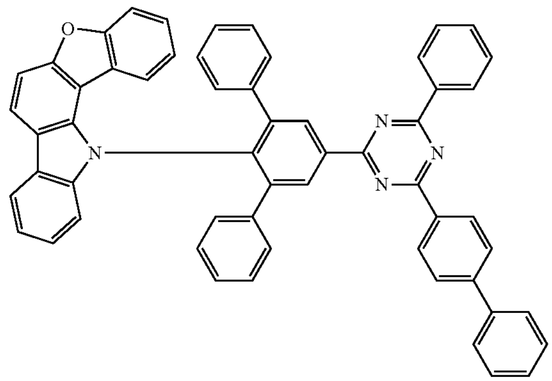
685
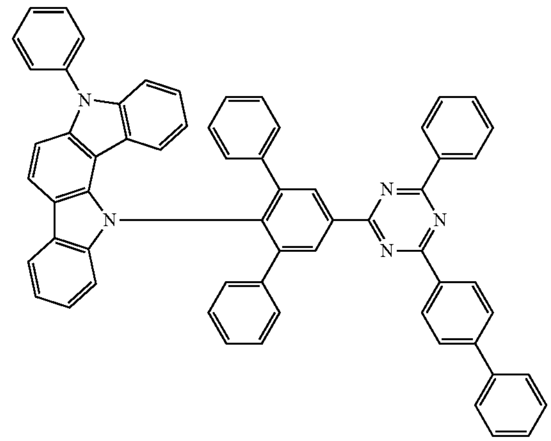
686
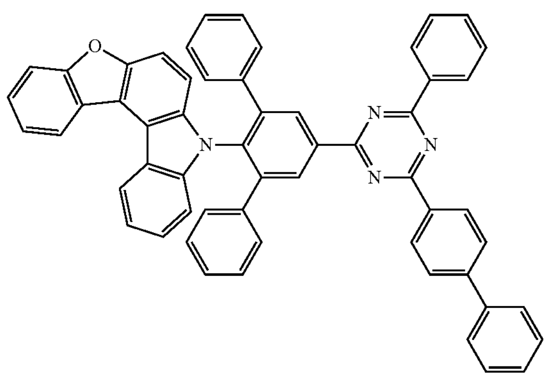
687
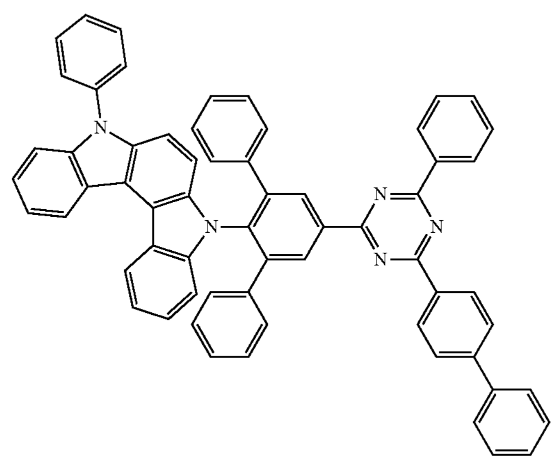
688
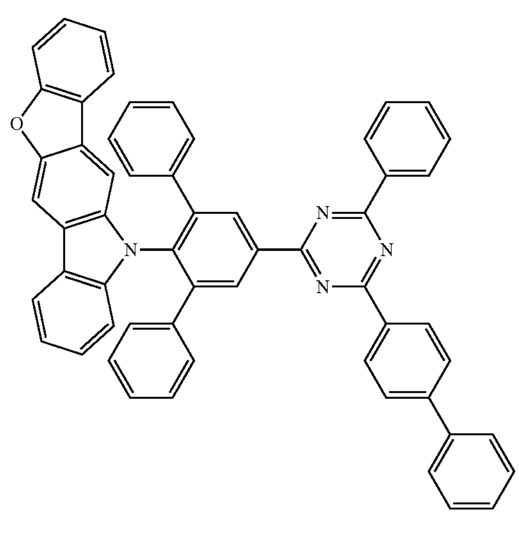
689
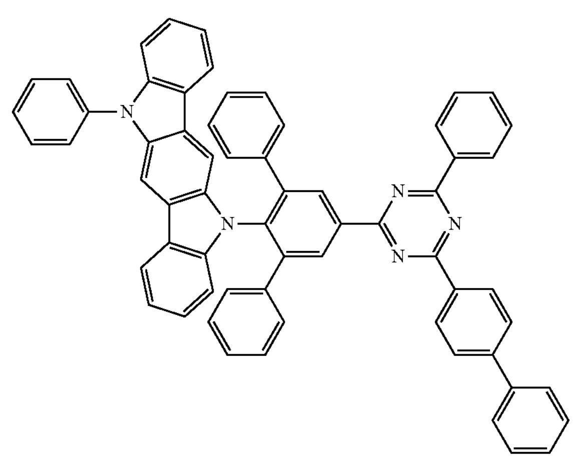

-continued
690
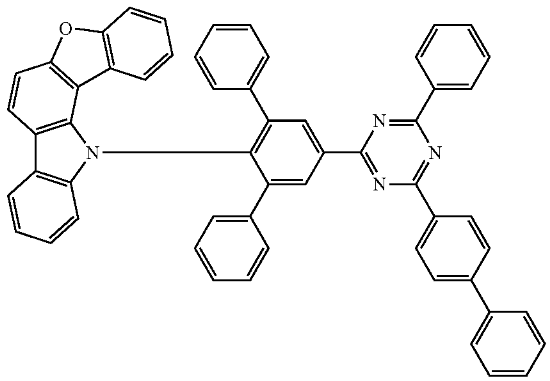
691
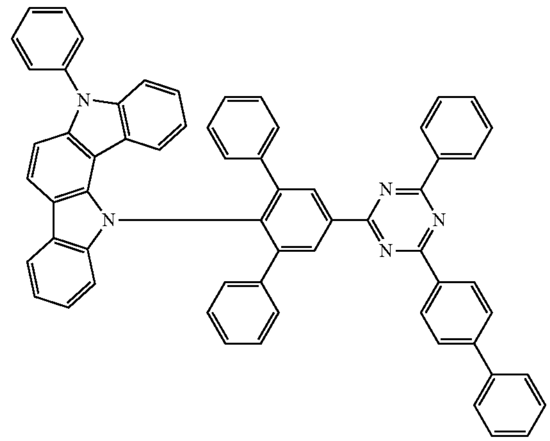
692
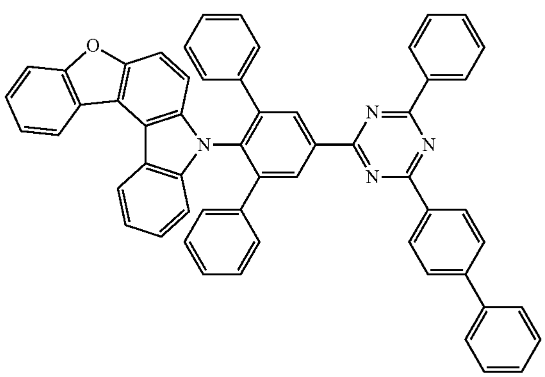
693
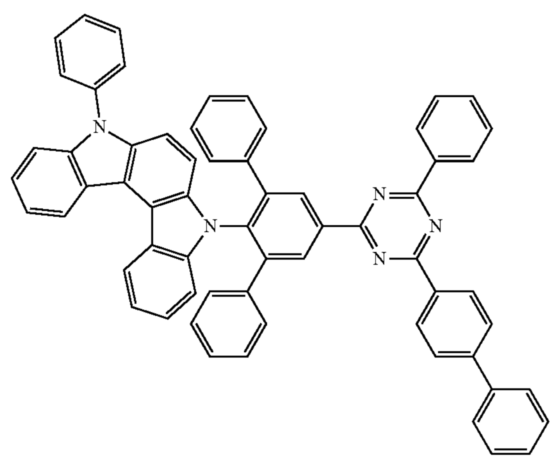
694
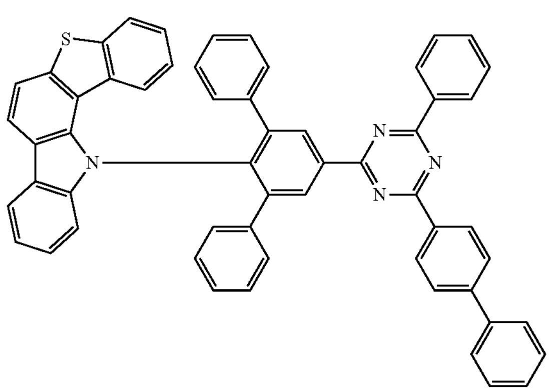
695
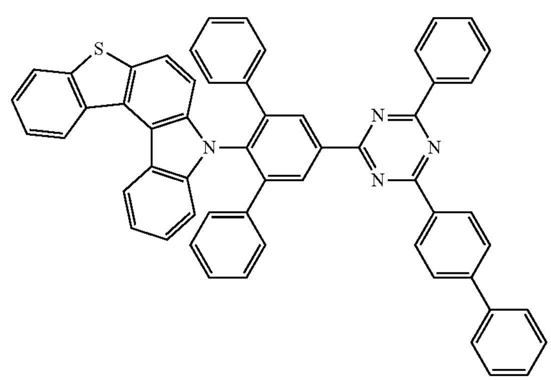

-continued
696
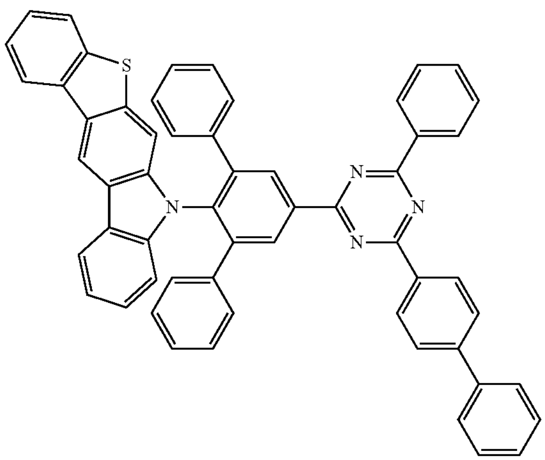
697
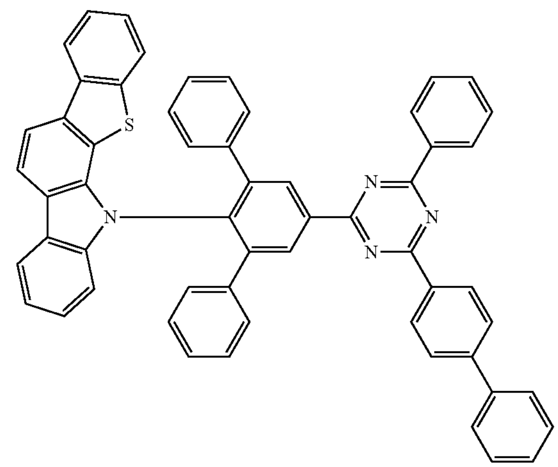
698
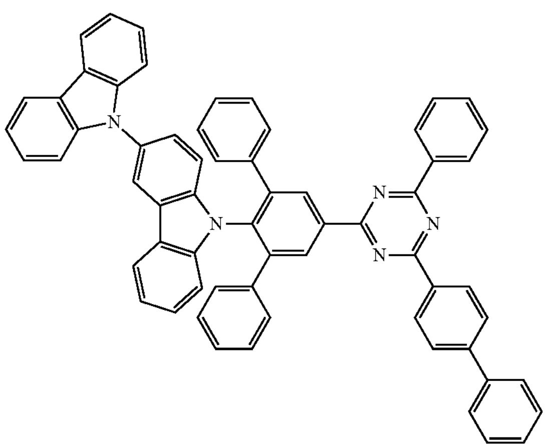
699
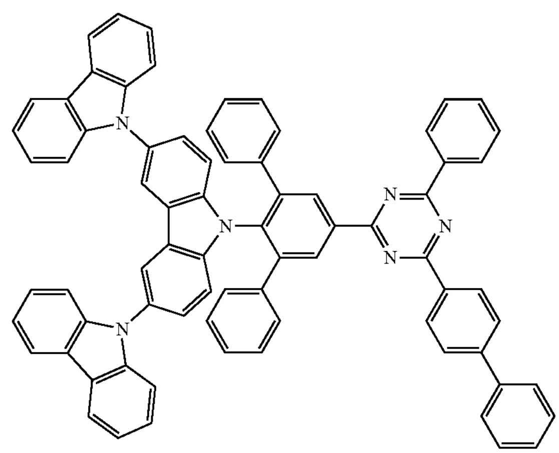
700
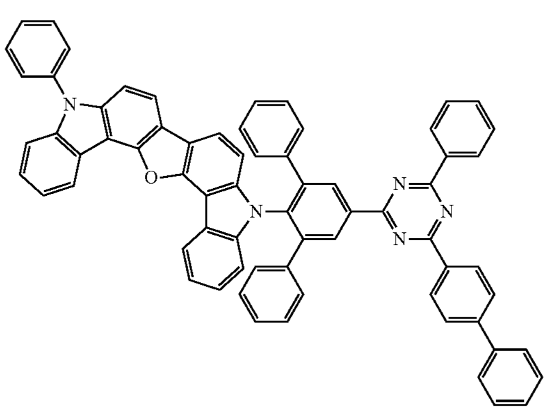
701
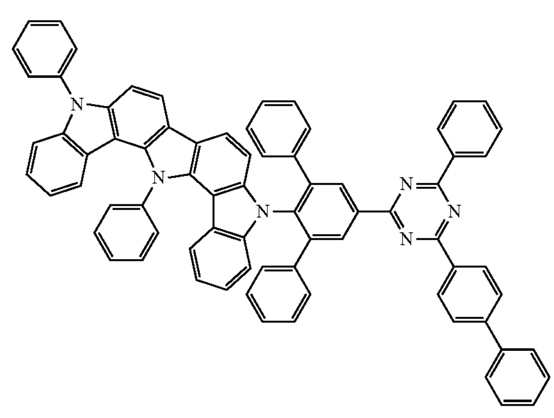

-continued
702
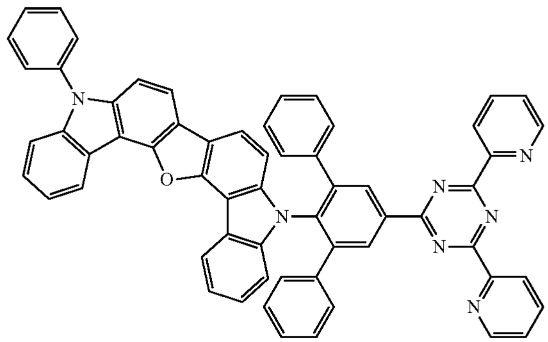
703
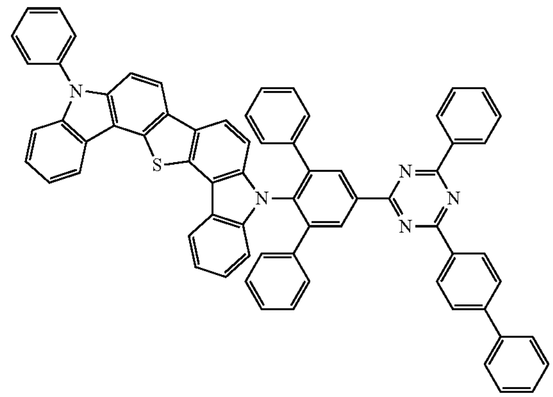
704
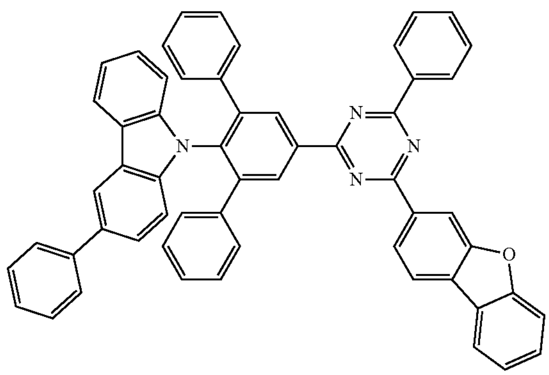
705
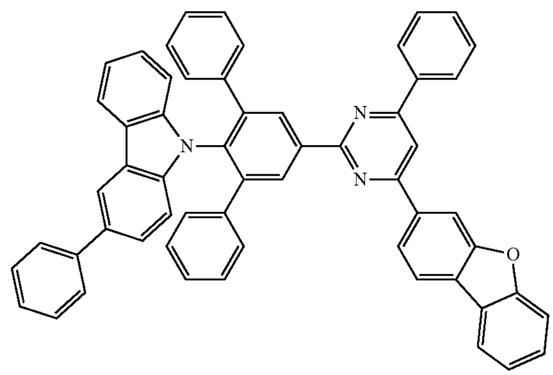
706
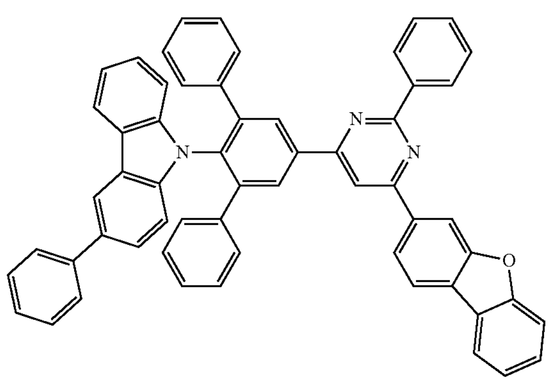
707
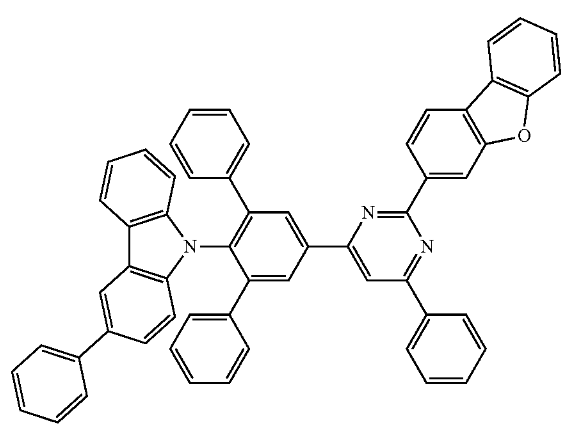

-continued
708
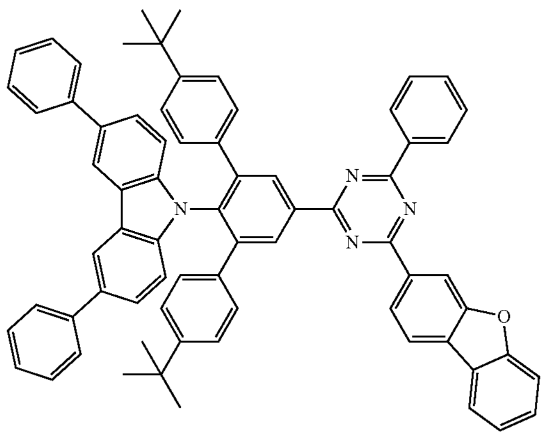
709
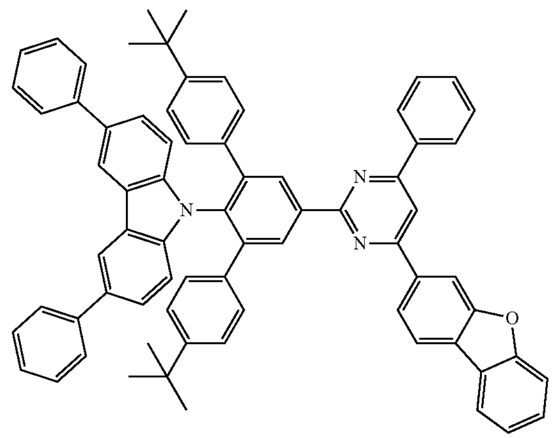
710
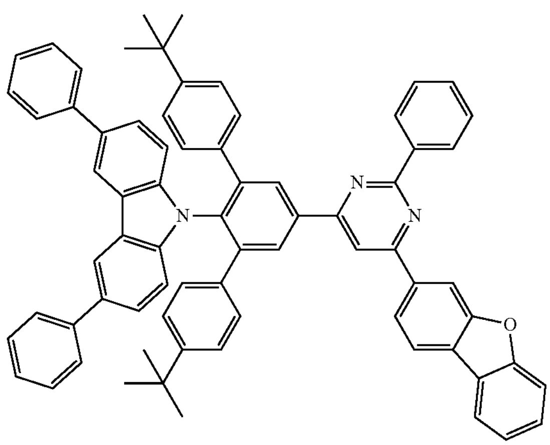
711
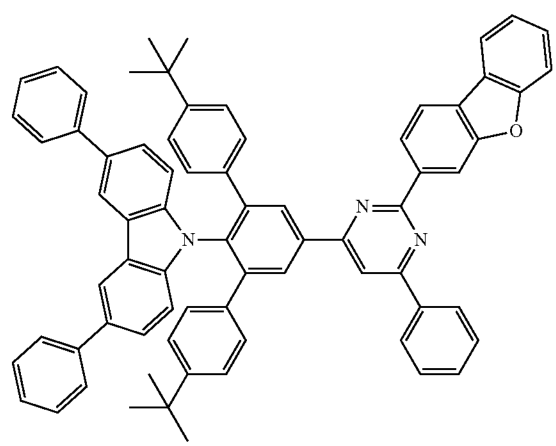
712
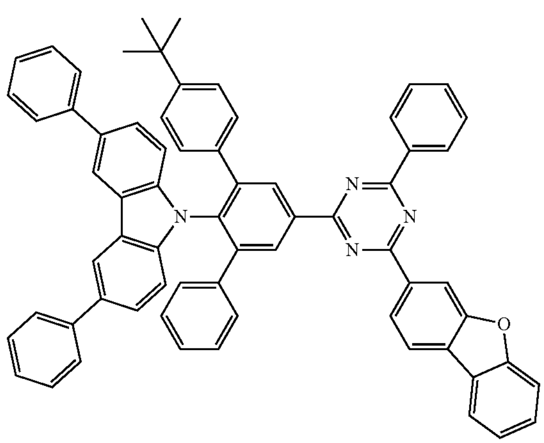
713
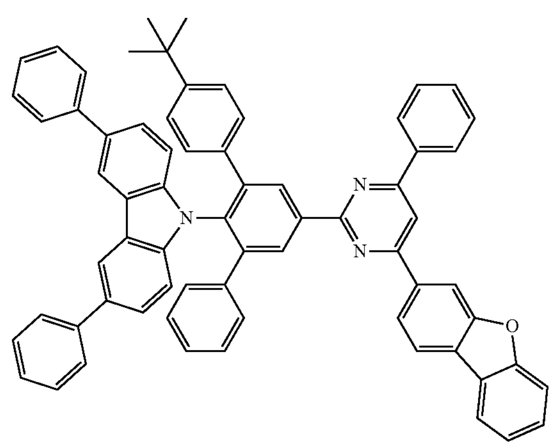

-continued
714
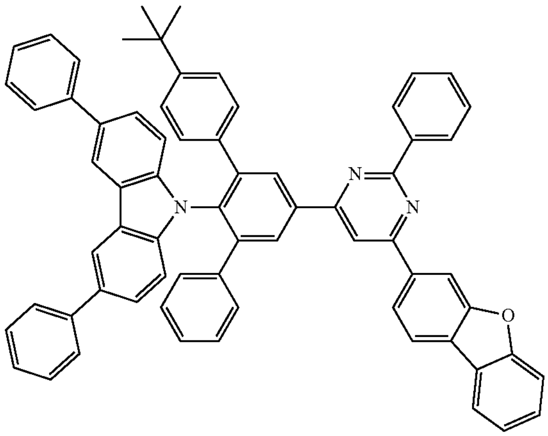
715
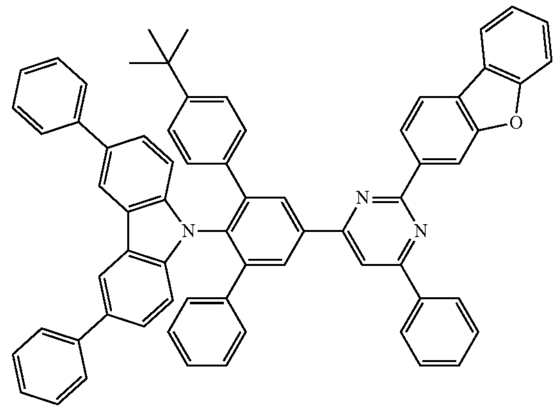
716
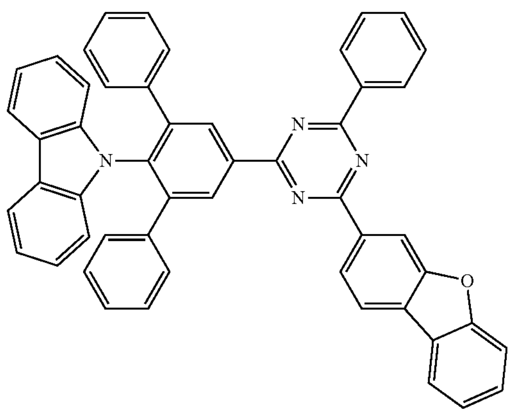
717
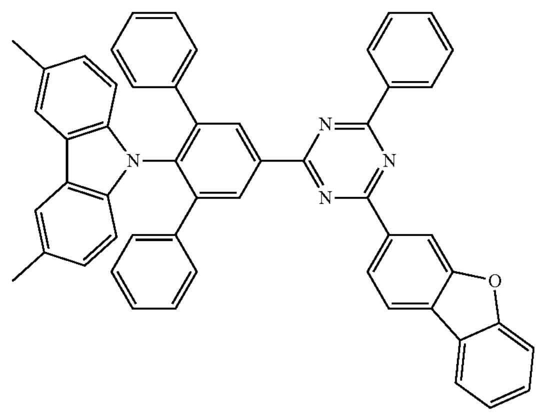
718
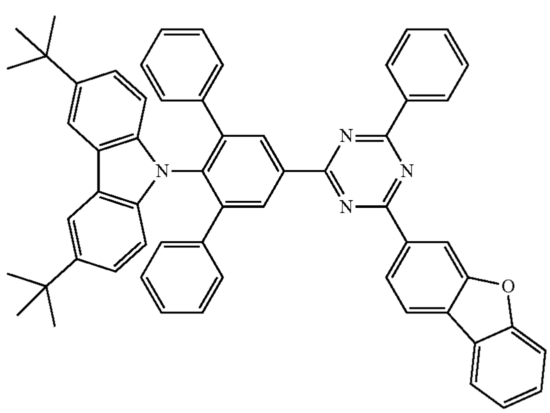
719
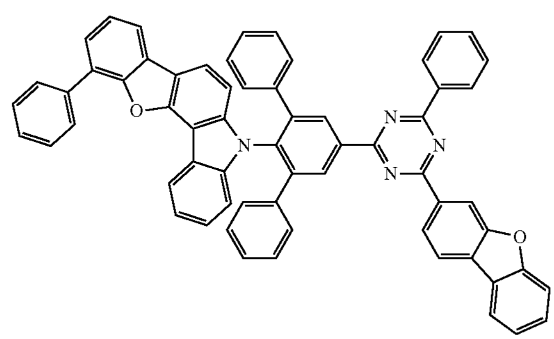

-continued
720
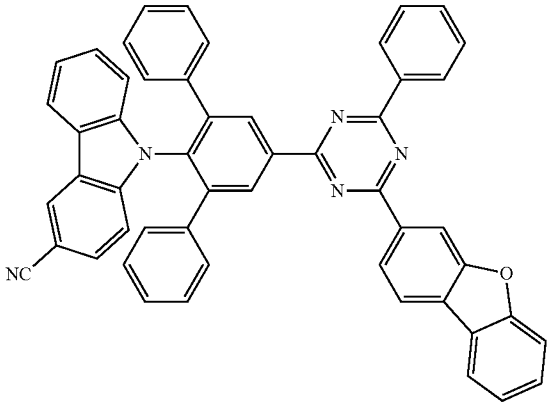
721
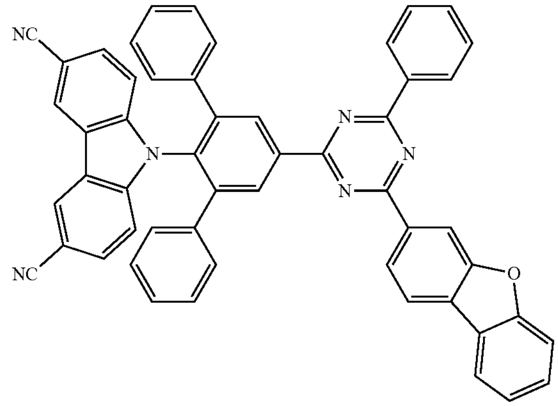
722
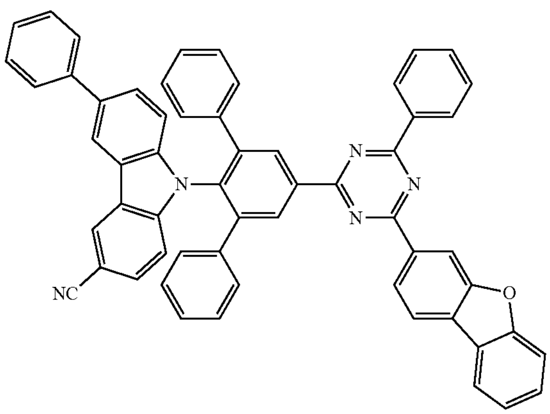
723
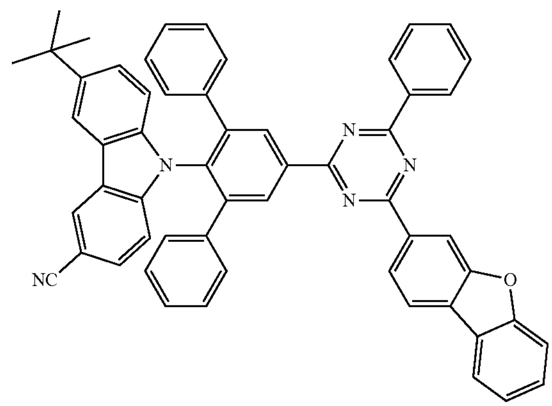
724
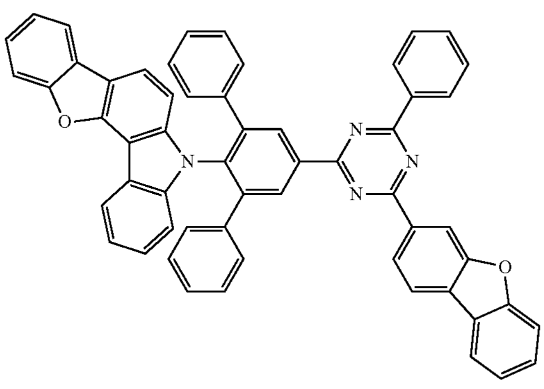
725
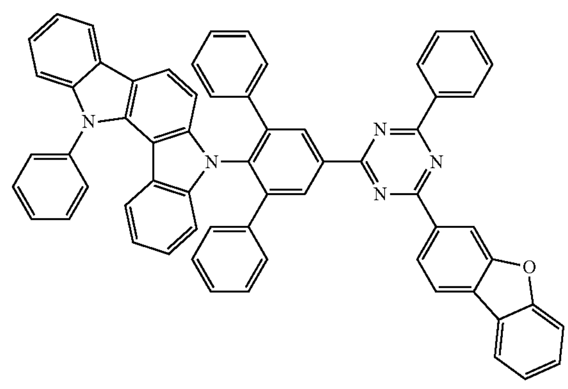

-continued
726
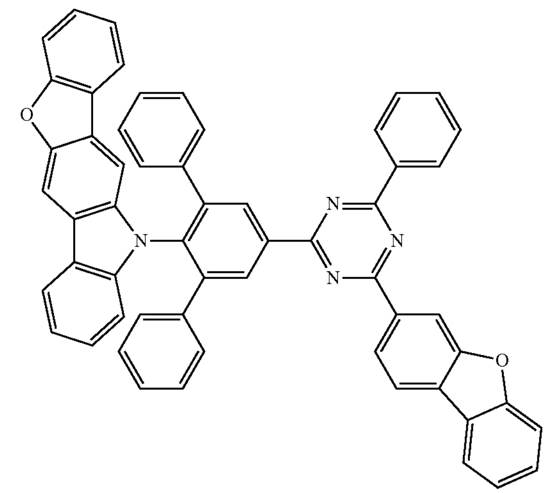
727
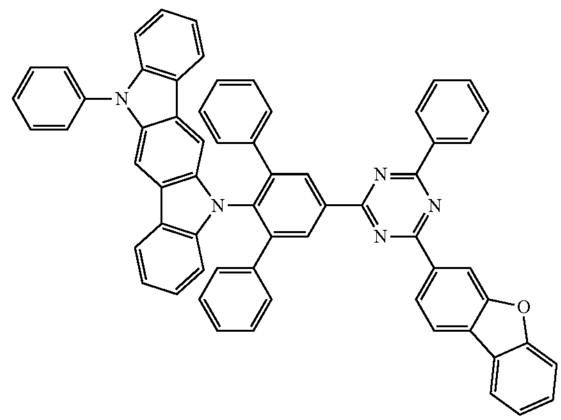
728
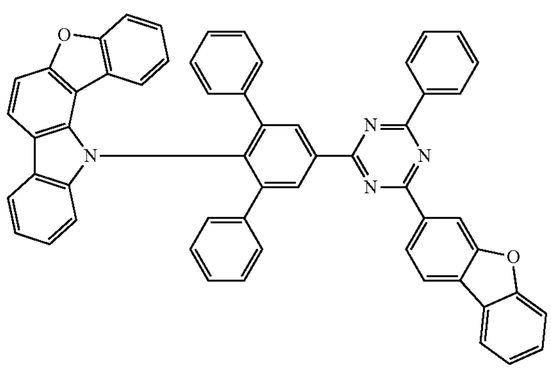
729
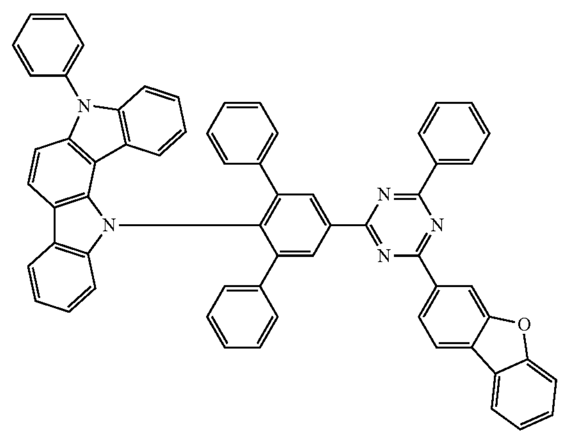
730
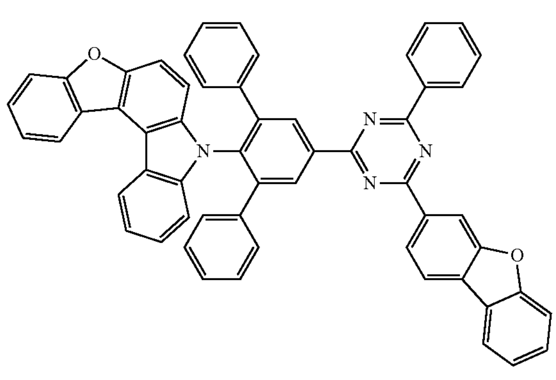
731
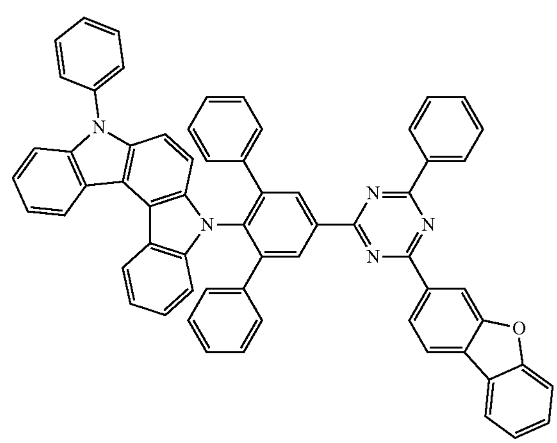

-continued
732
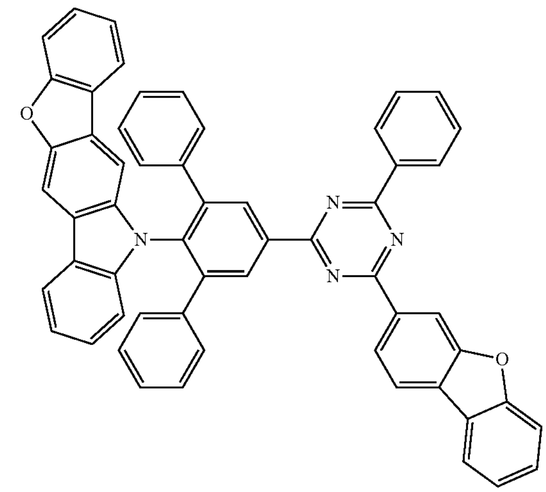
733
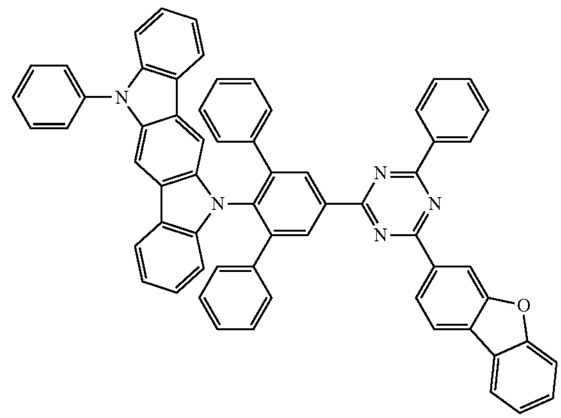
734
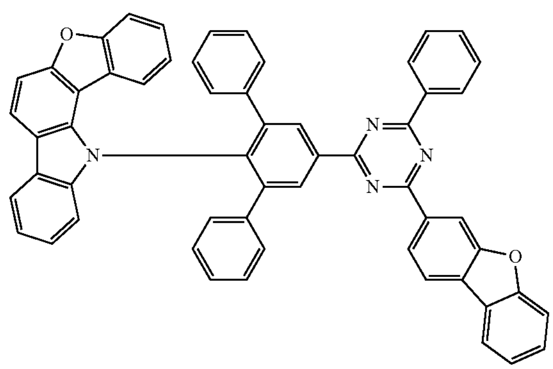
735
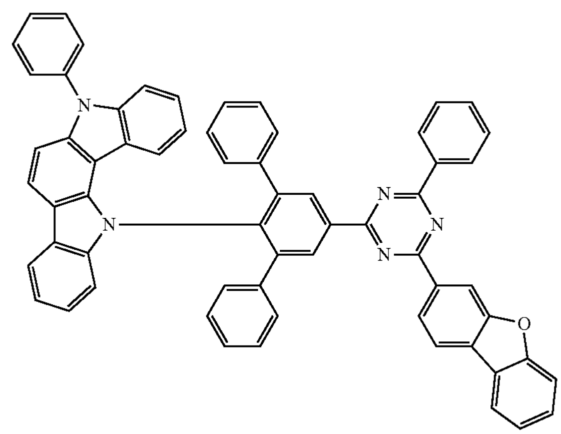
736
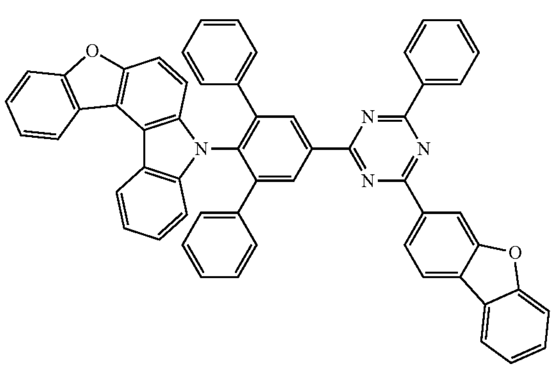
737
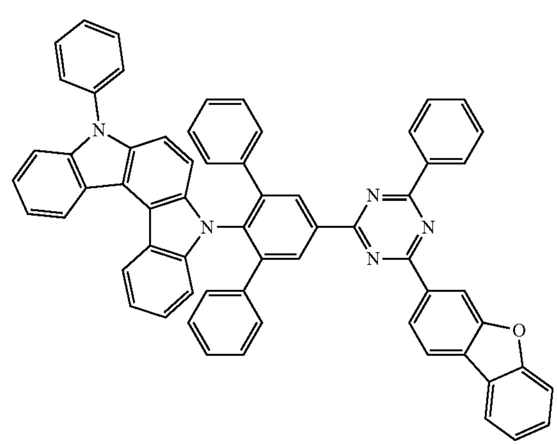

-continued
738
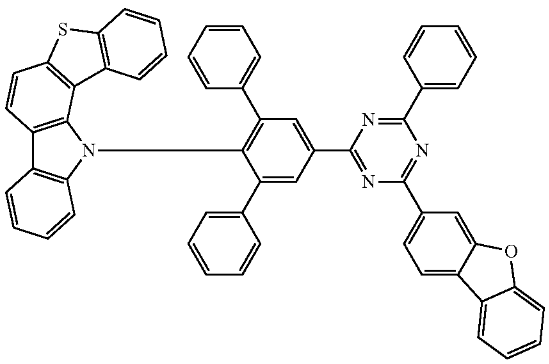
739
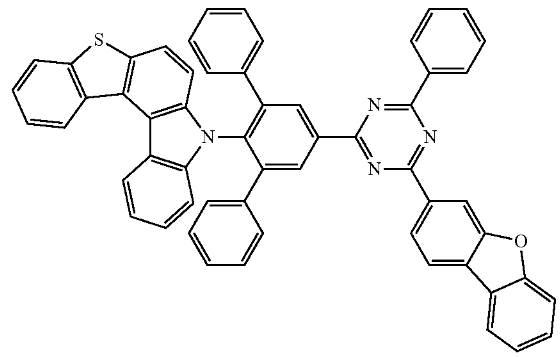
740
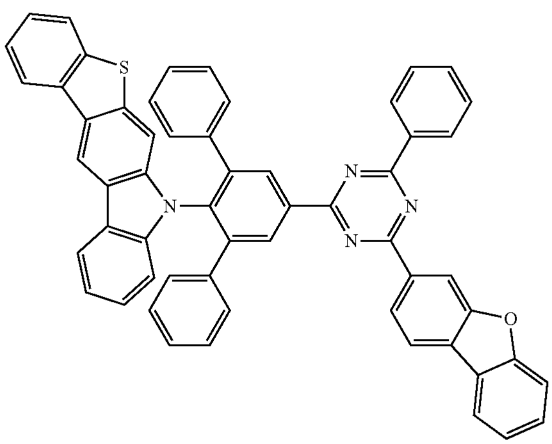
741
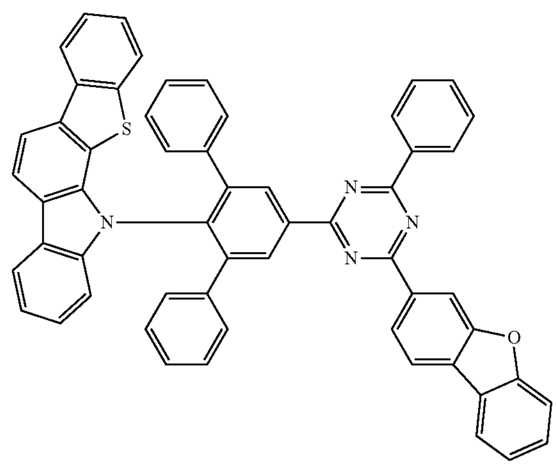
742
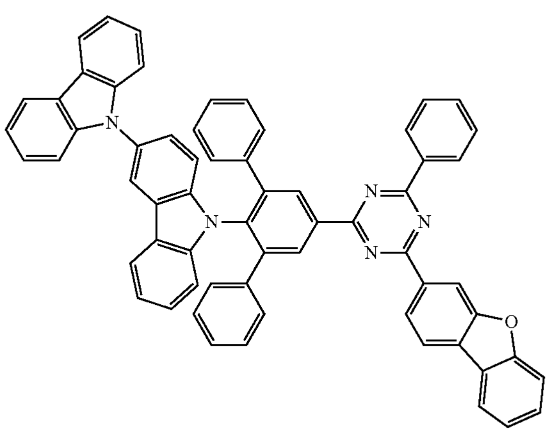
743
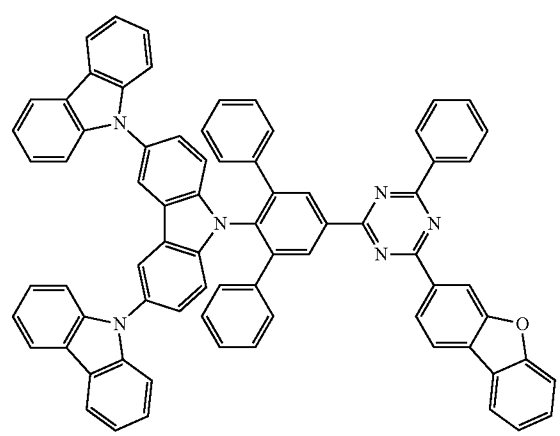

-continued
744
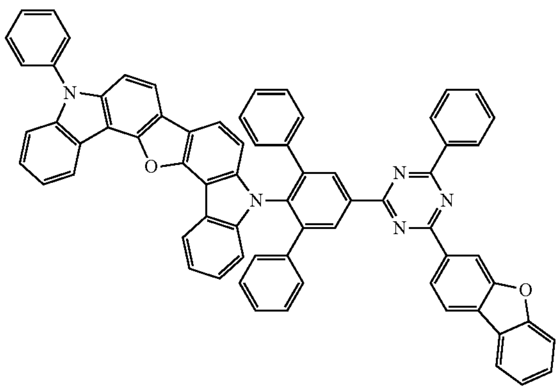
745
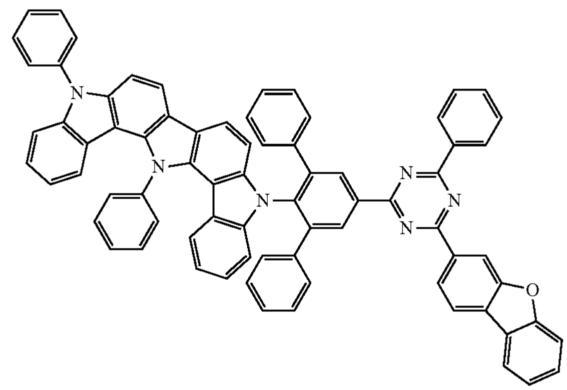
746
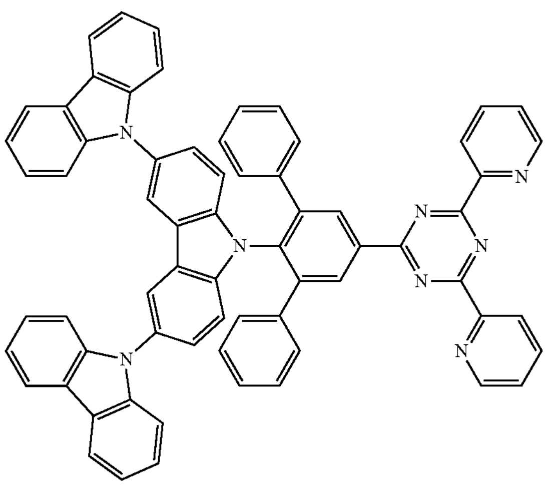
747
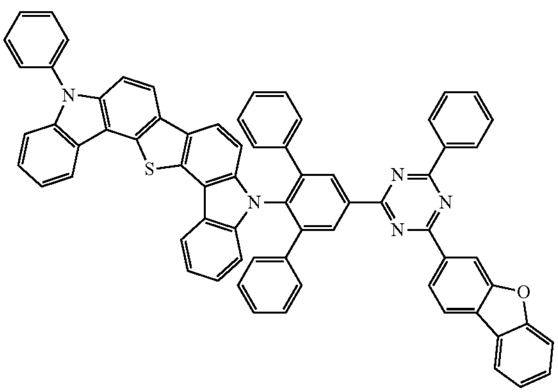
748
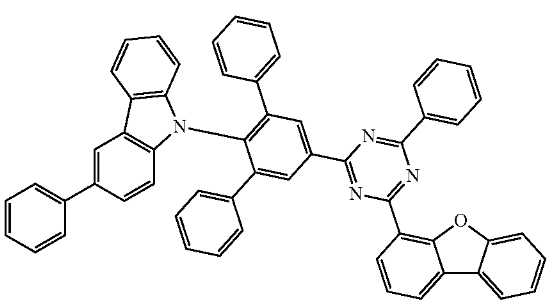
749
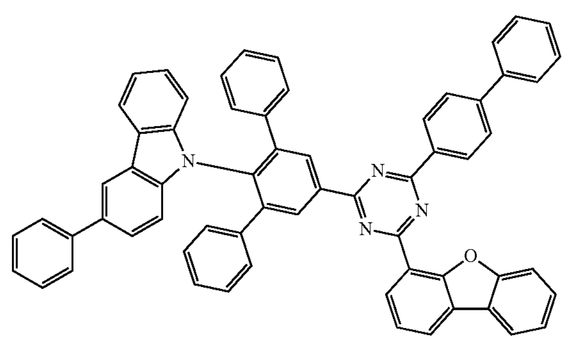
750
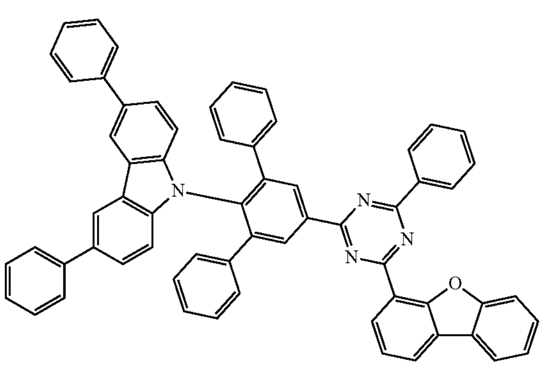
751
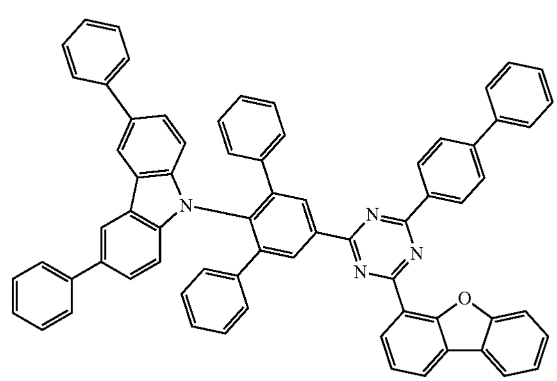

-continued
752
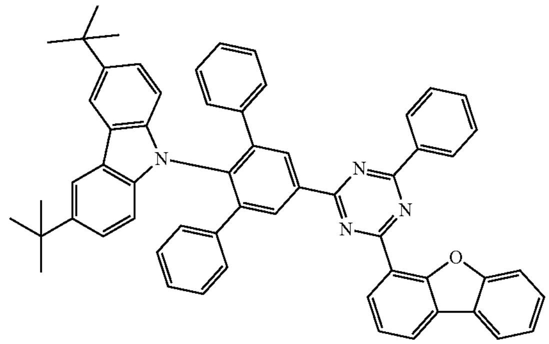
753
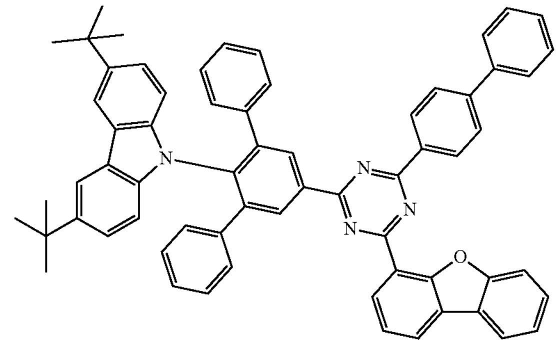
754
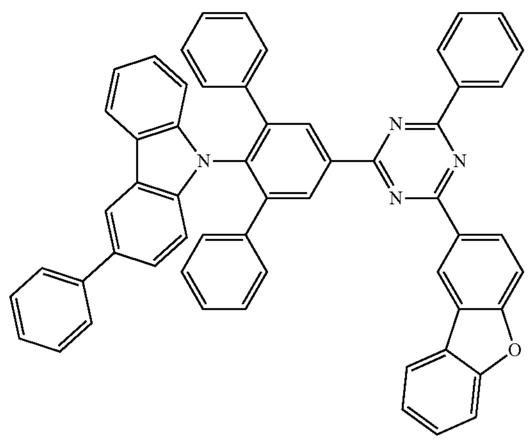
755
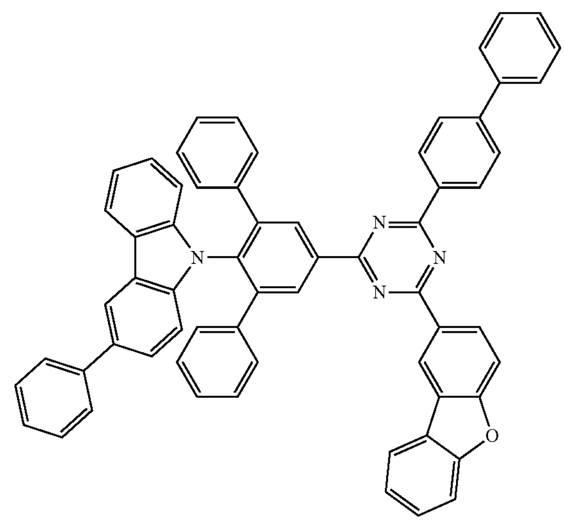
756
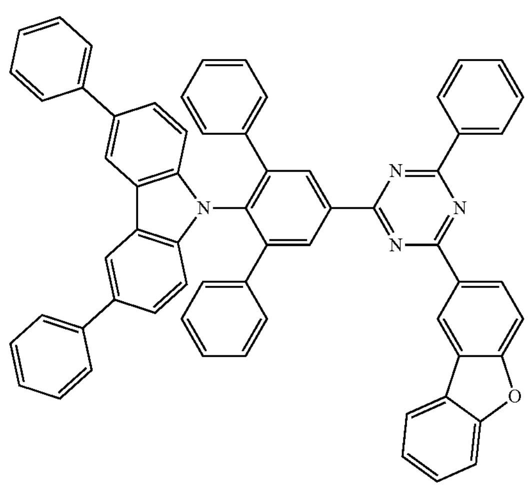
757
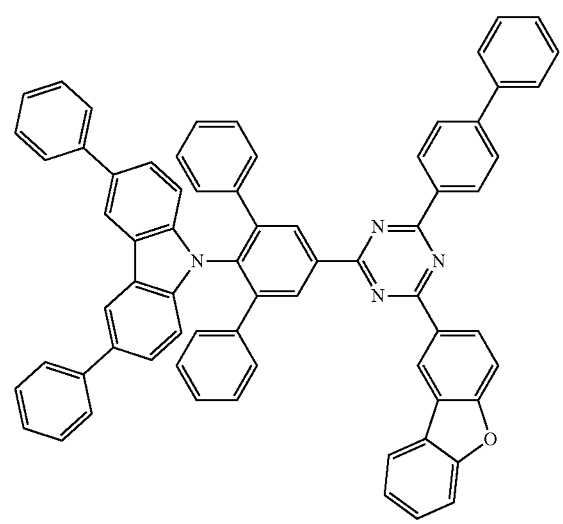

-continued
758
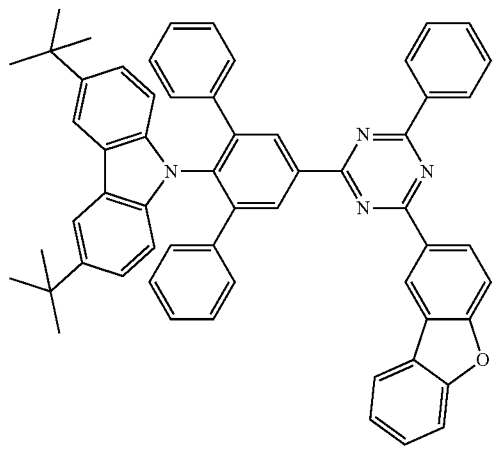
759
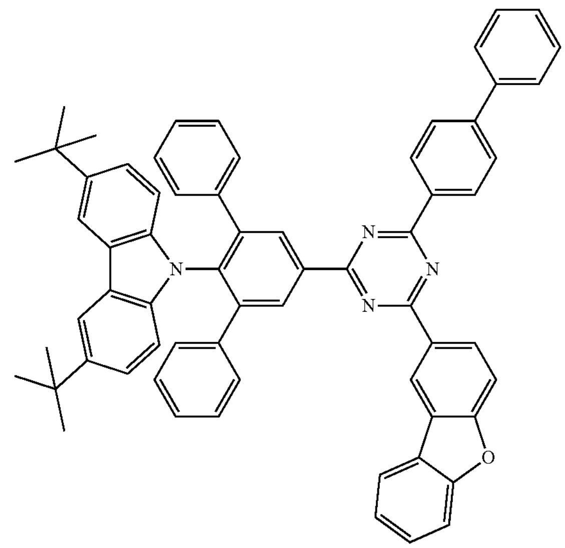
760
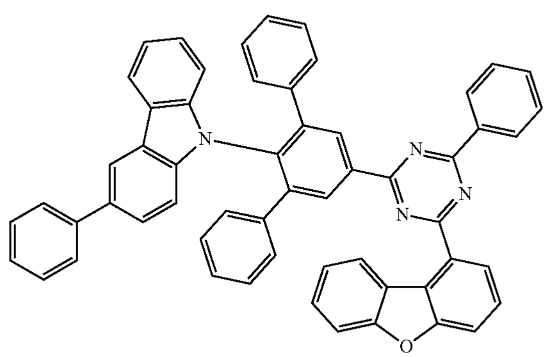
761
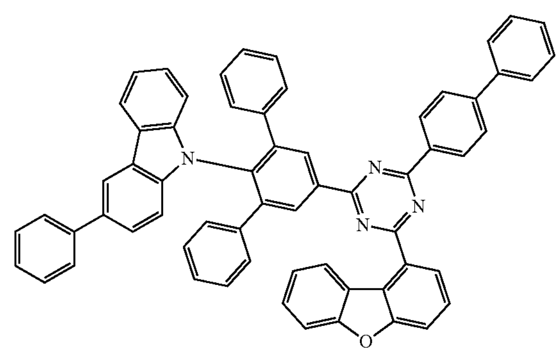
762
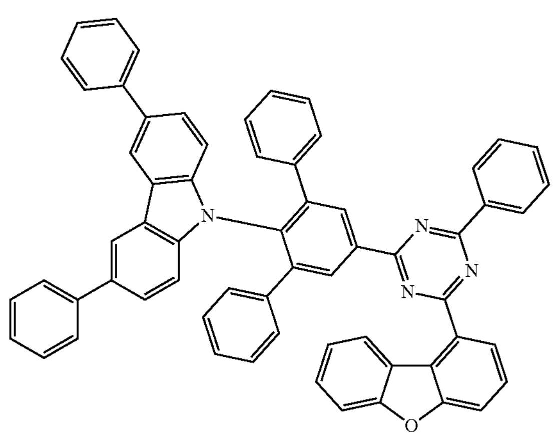
763
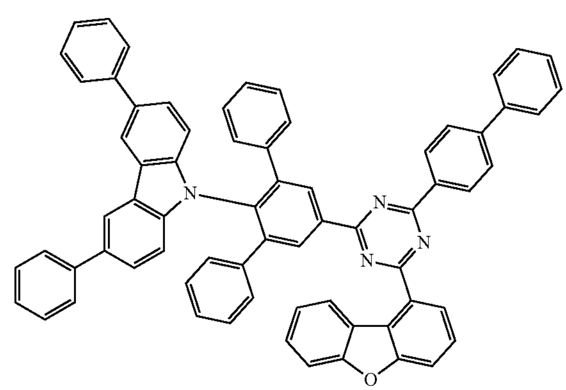

-continued
764
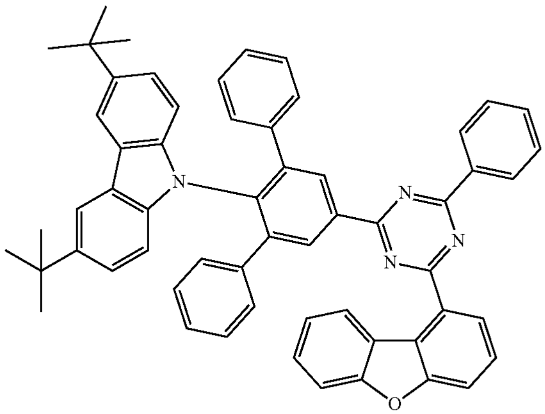
765
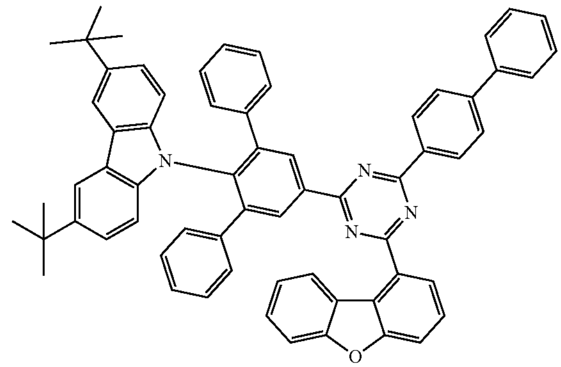
766
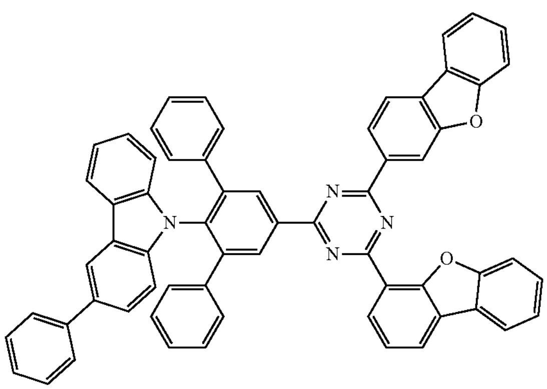
767
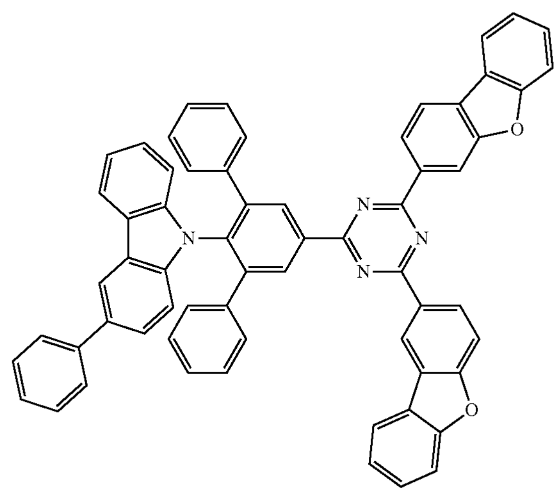
768
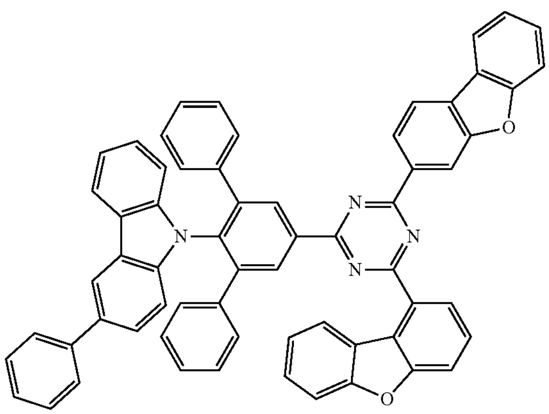
769
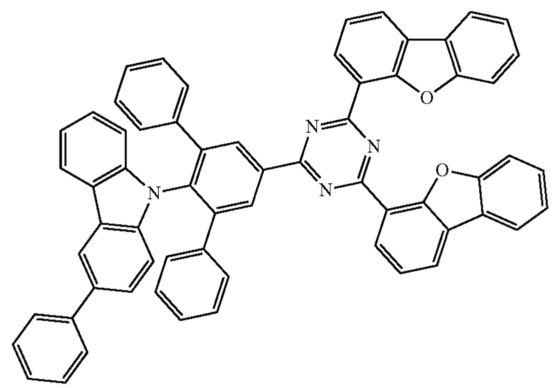

-continued
770
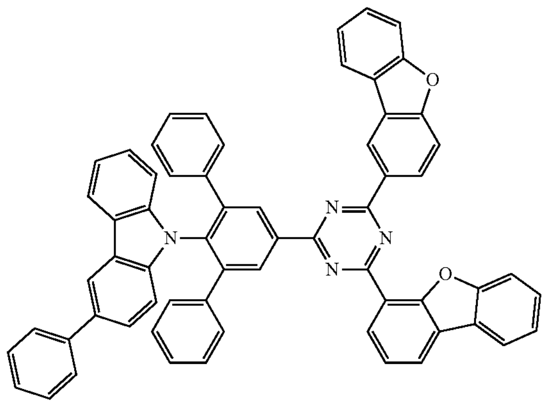
771
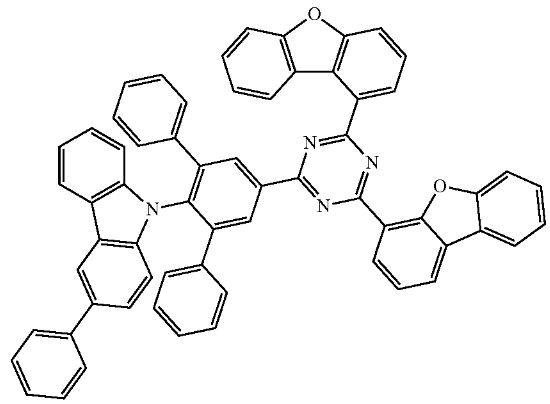
772
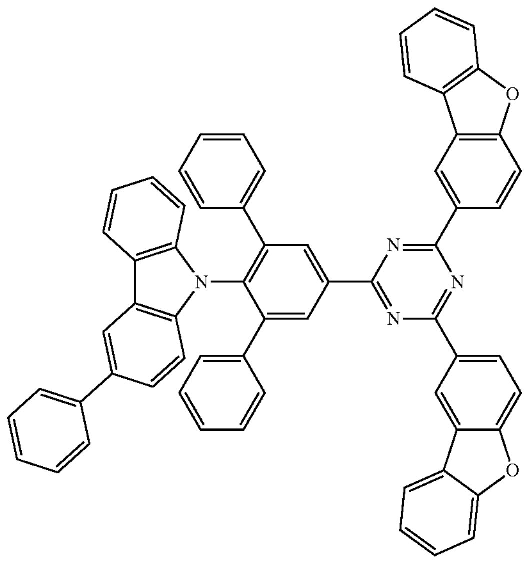
773
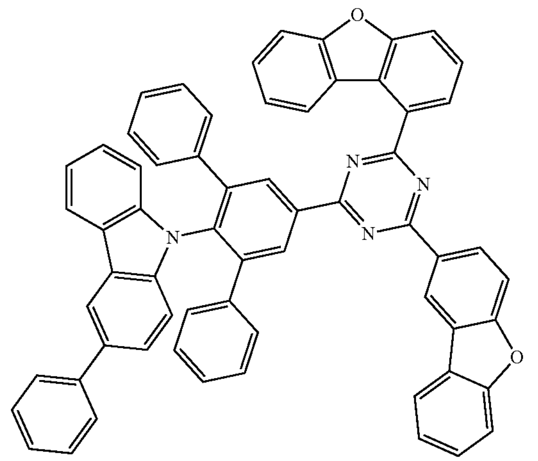
774
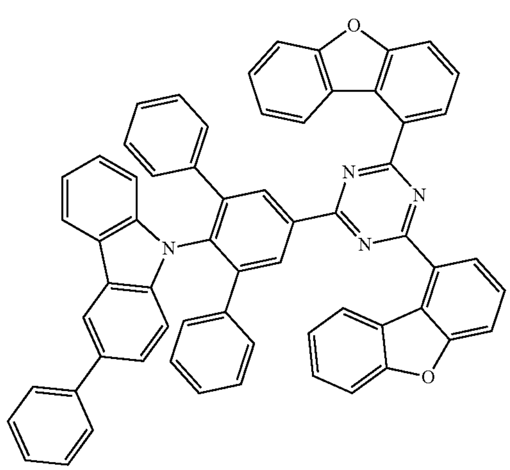
775
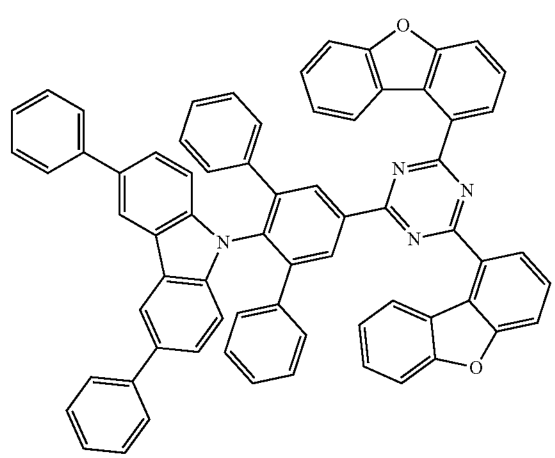

-continued
776
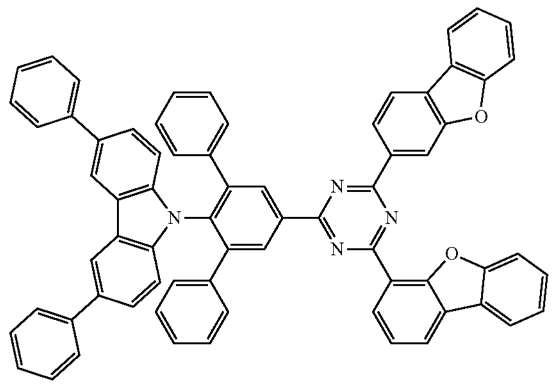
777
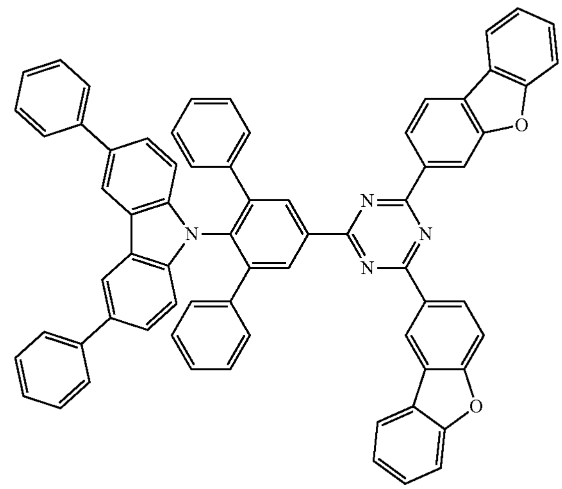
778
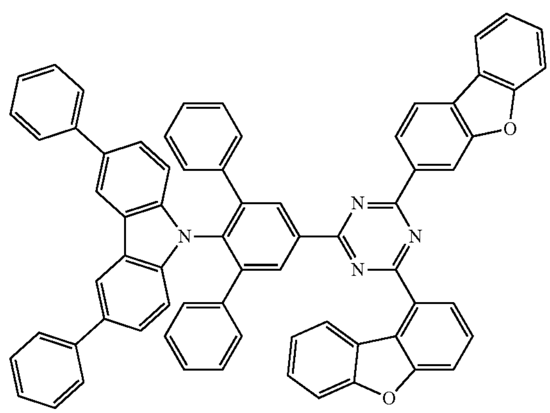
779
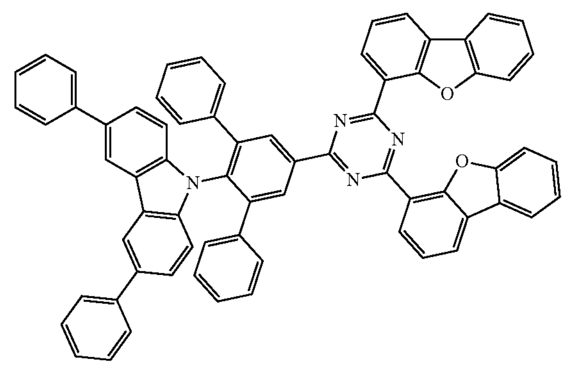
780
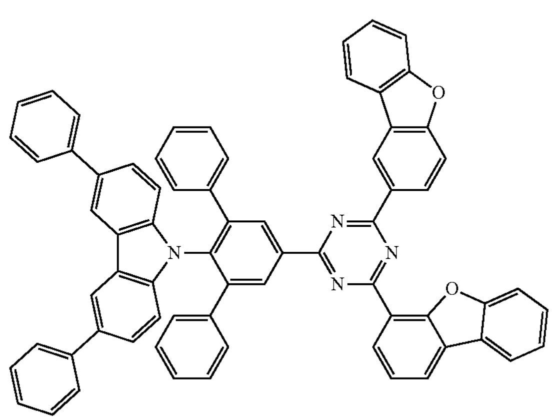
781
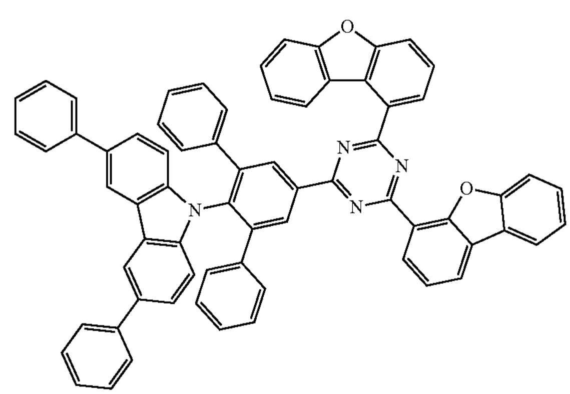

-continued
782
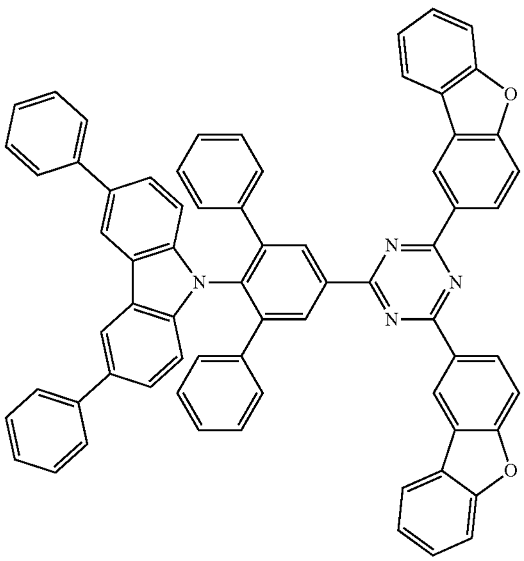
783
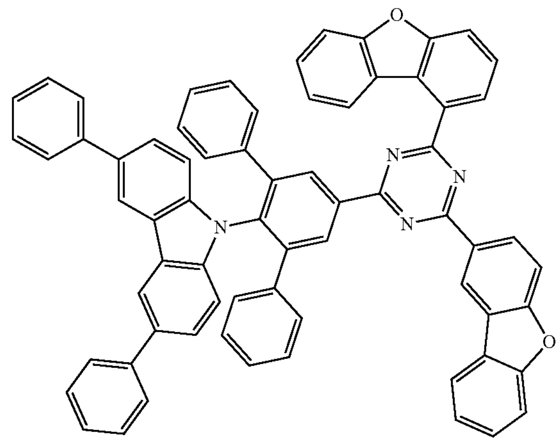
784
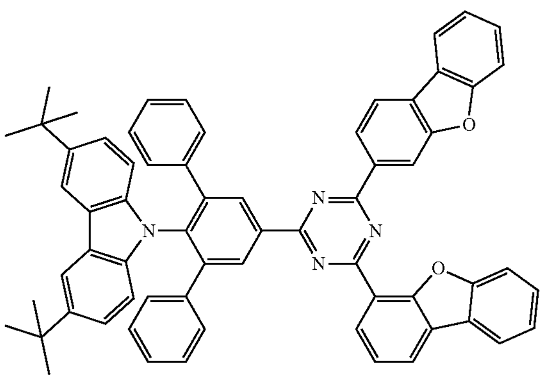
785
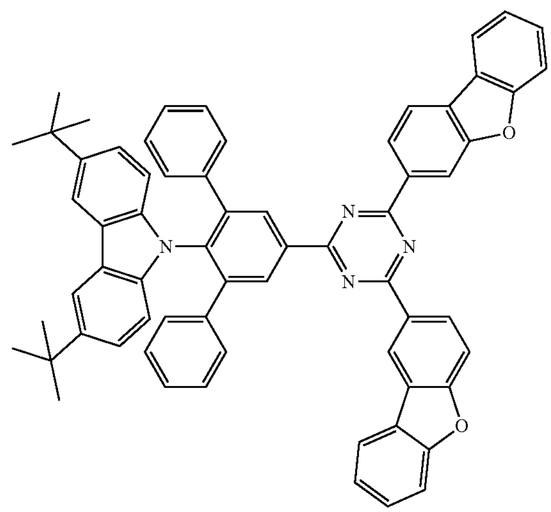
786
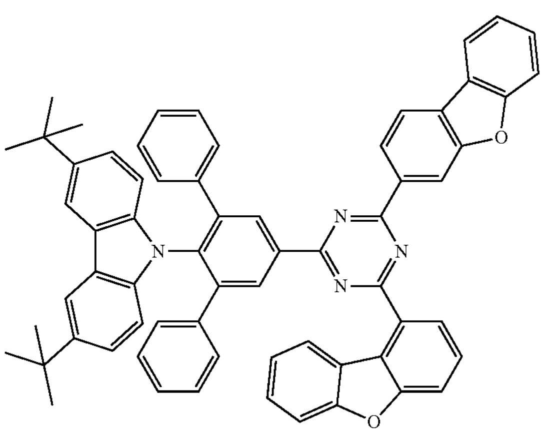
787
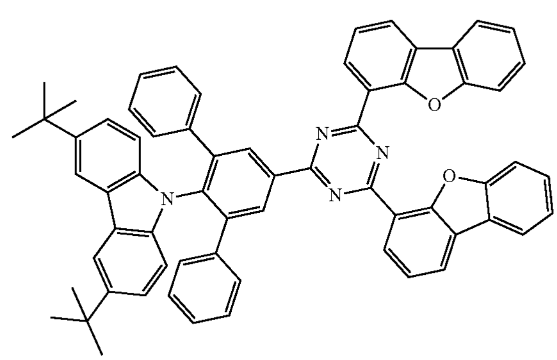

-continued
788
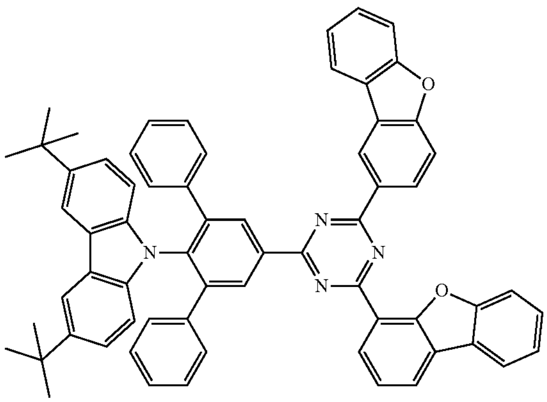
789
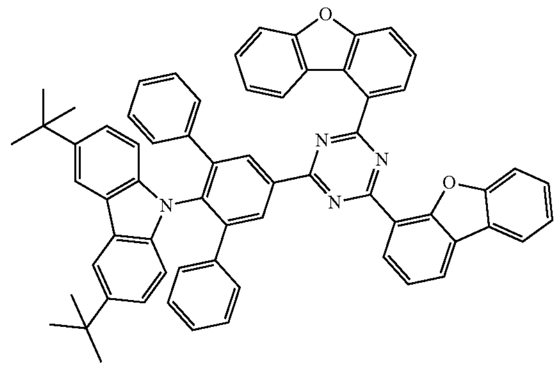
790
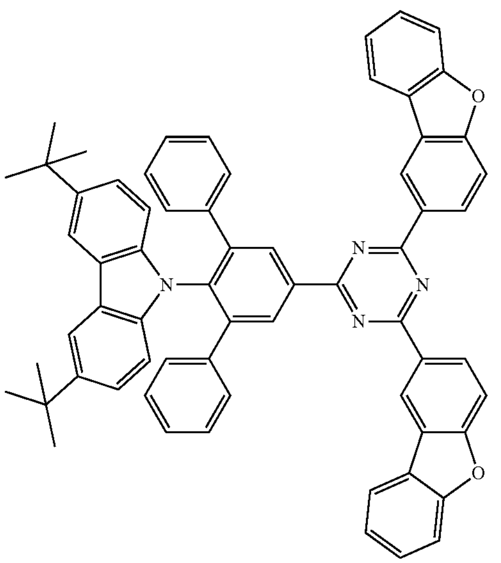
791
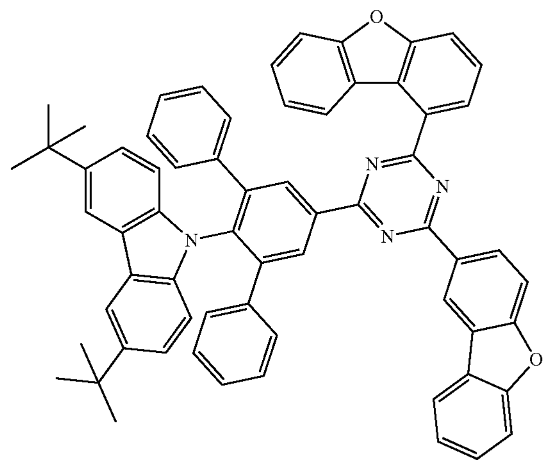
792
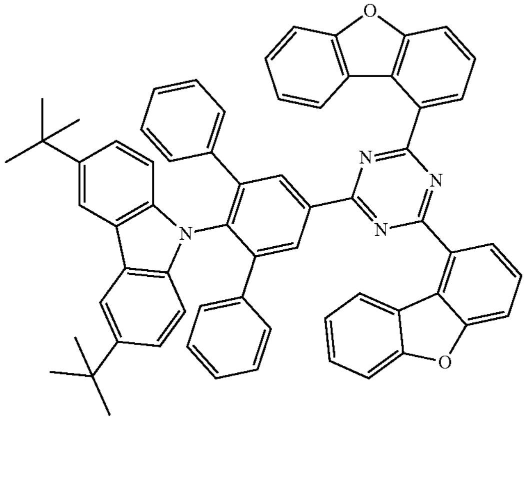

-continued
793
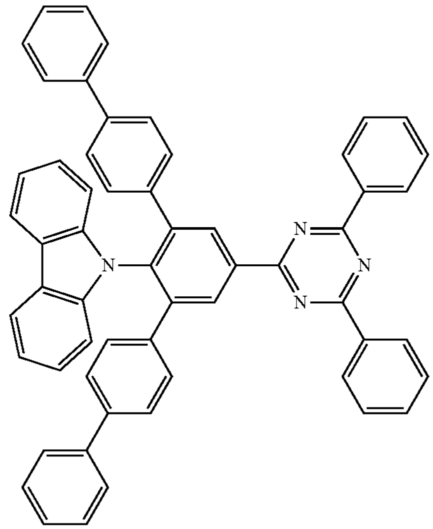
794
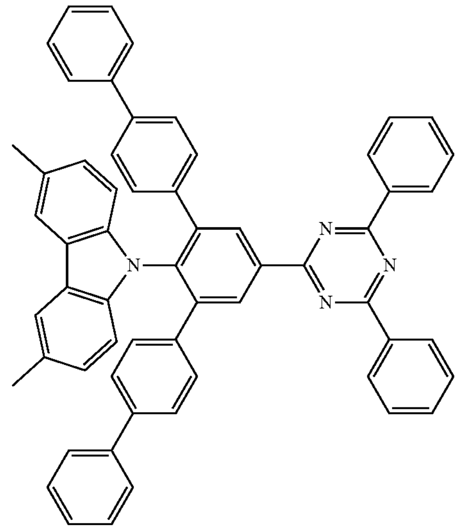
795
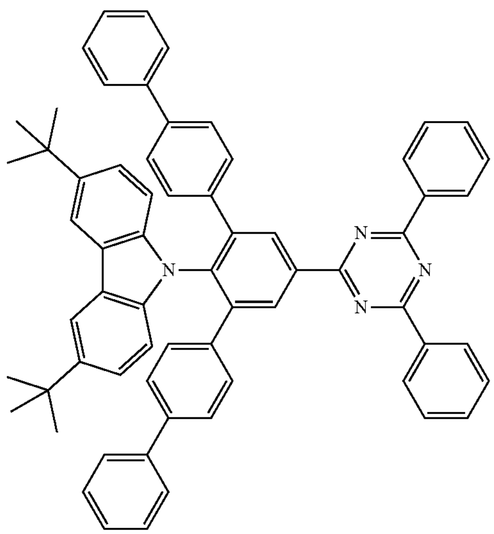
796
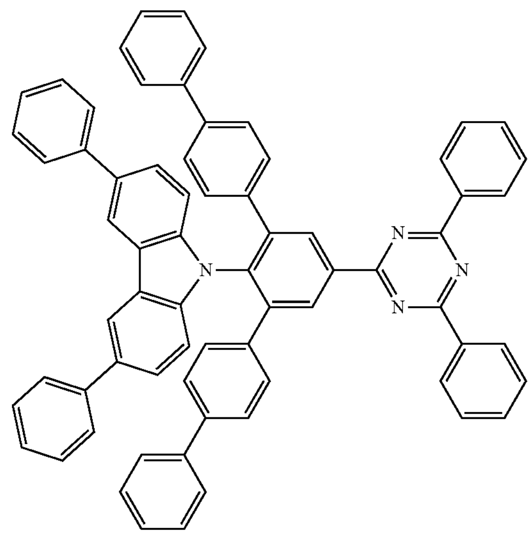
797
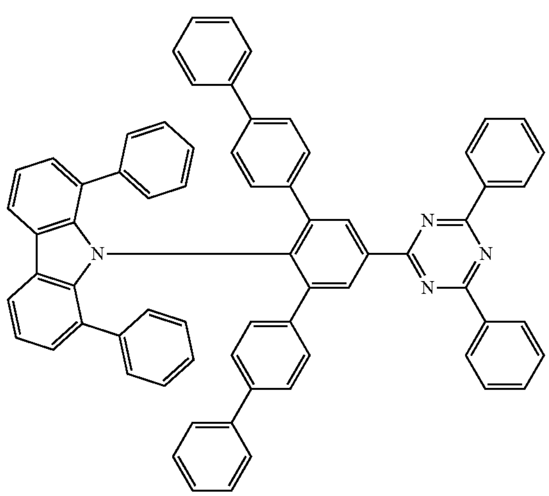
798
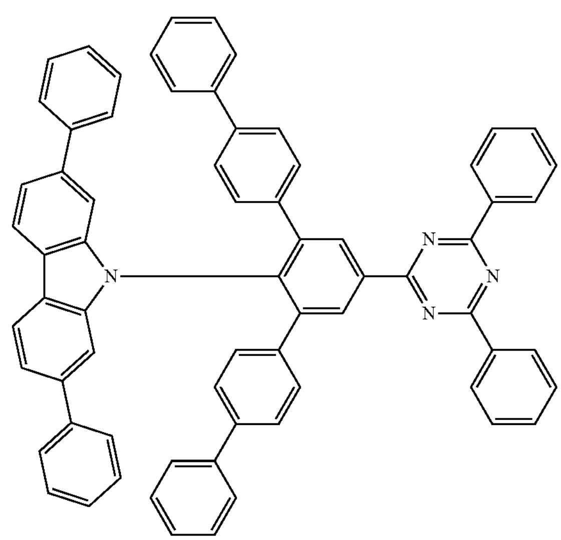

-continued
799
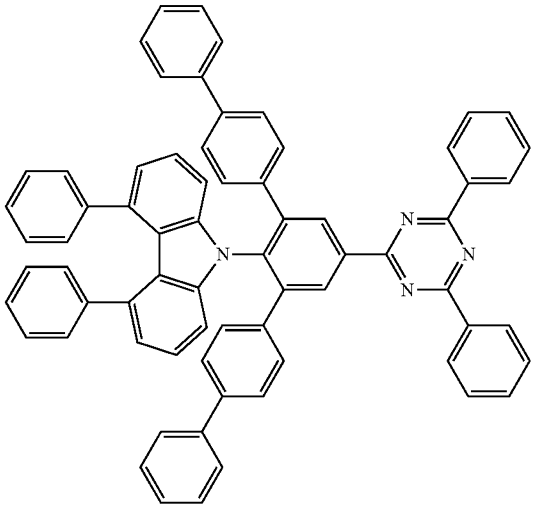
800
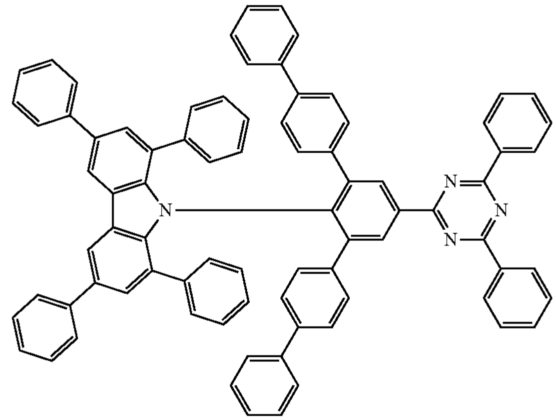
801
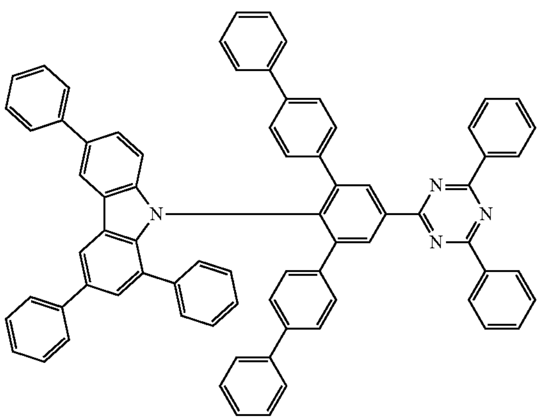
802
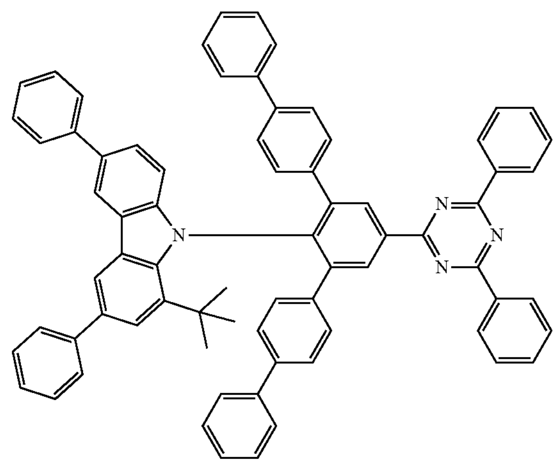
803
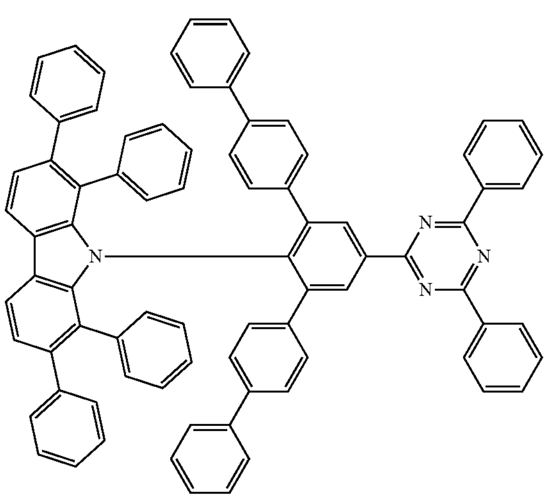
804
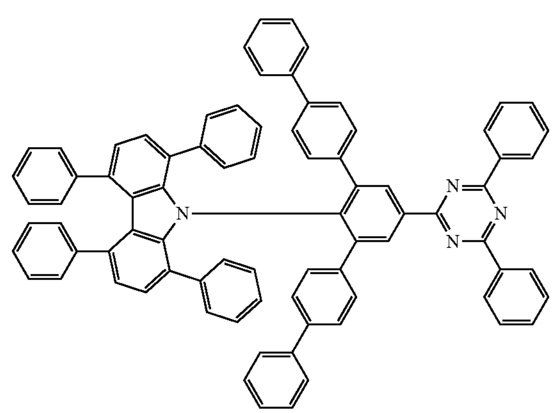

-continued
805
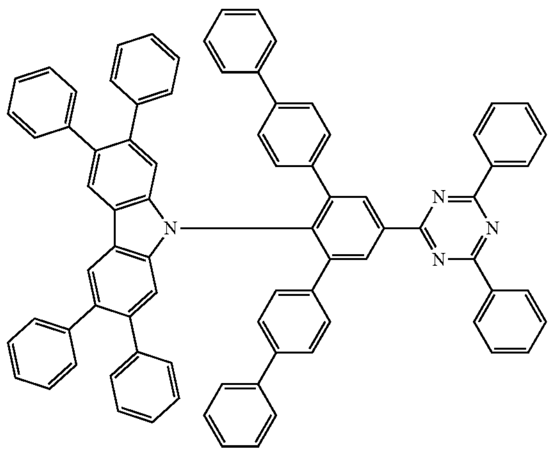
806
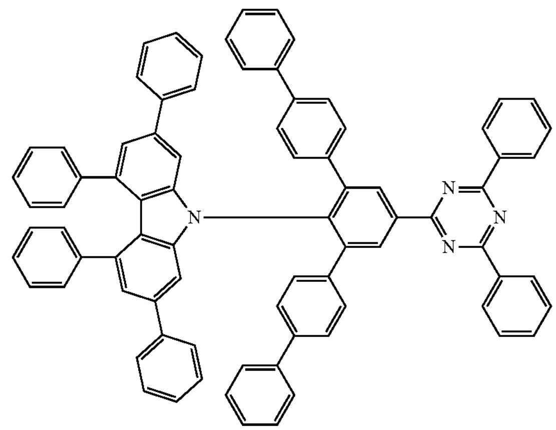
807
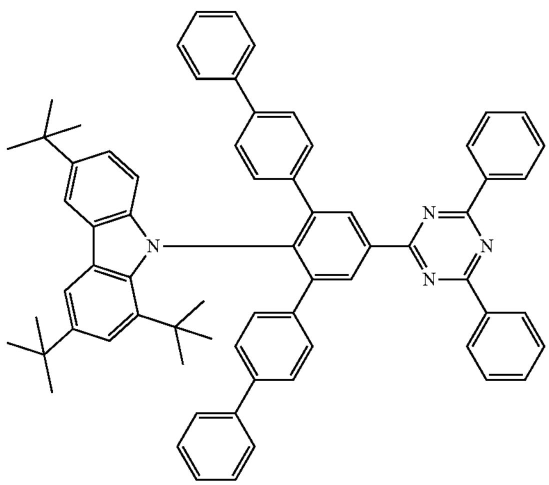
808
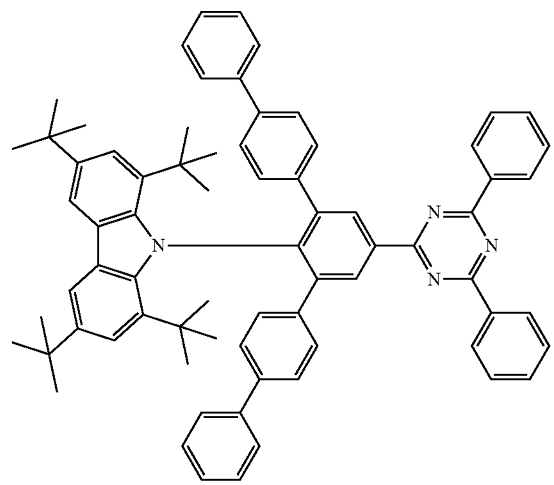
809
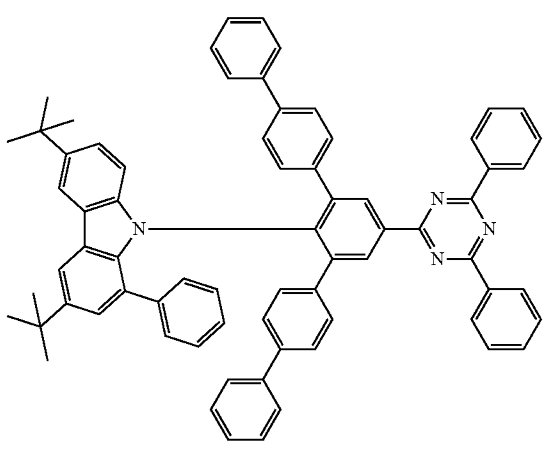
810
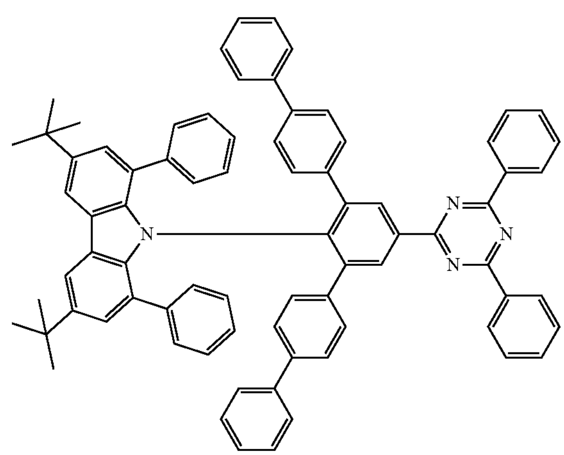

-continued
811
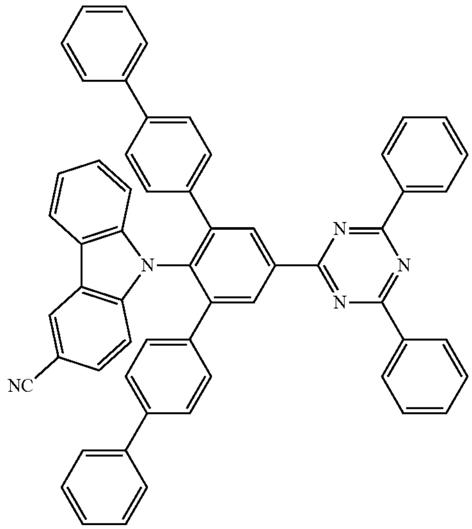
812
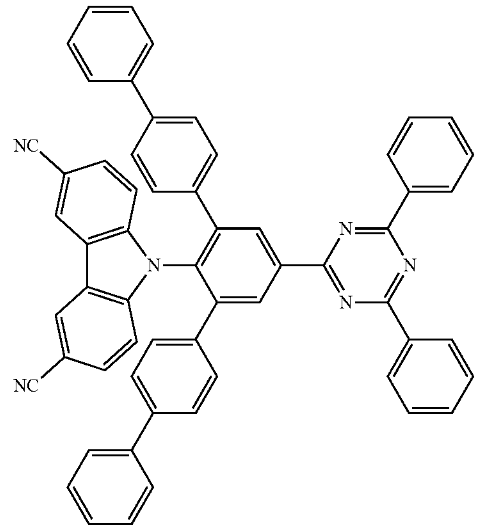
813
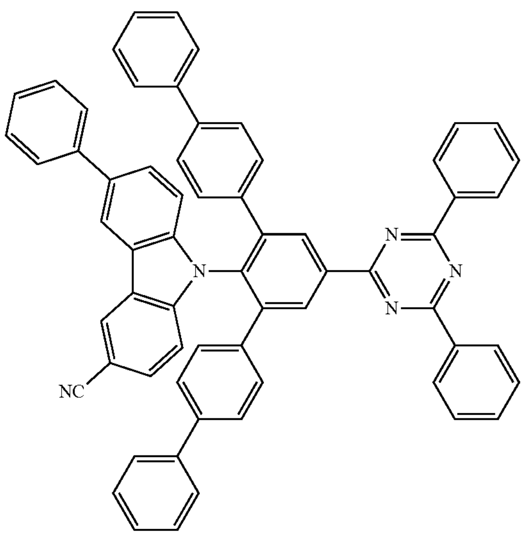
814
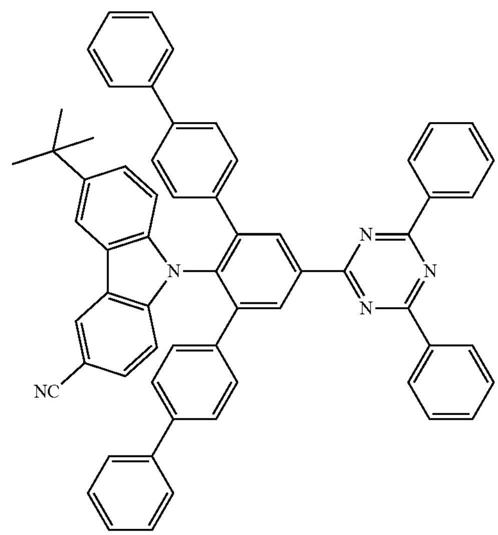
815
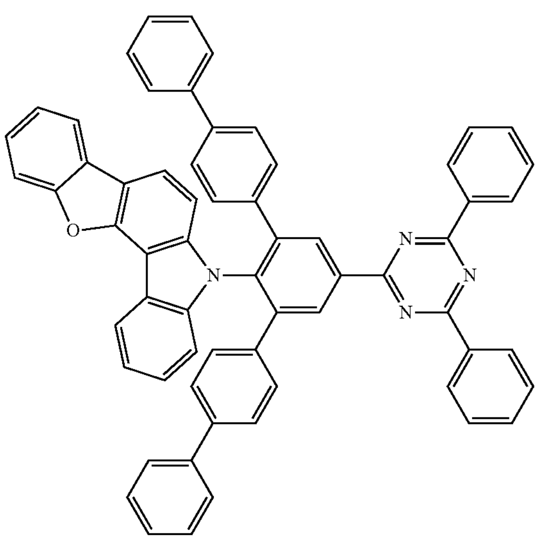
816
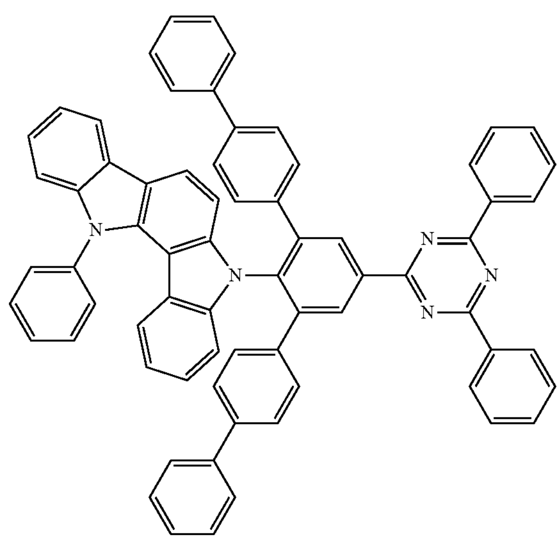

-continued
817
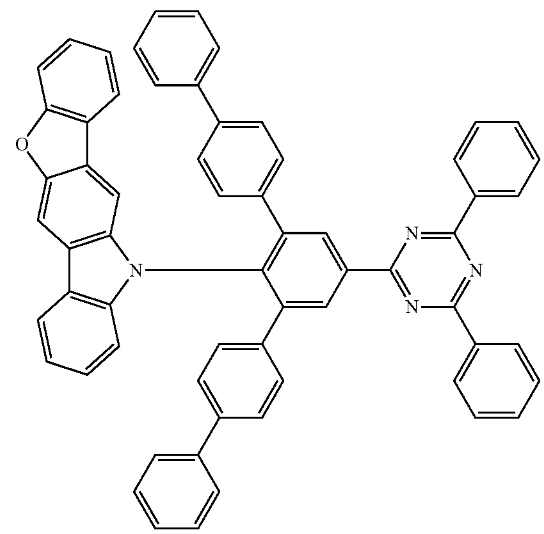
818
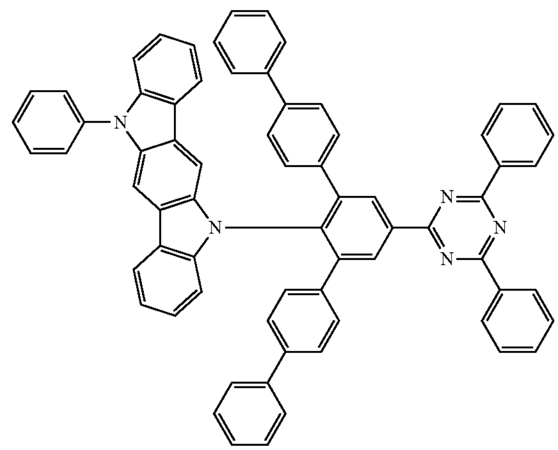
819
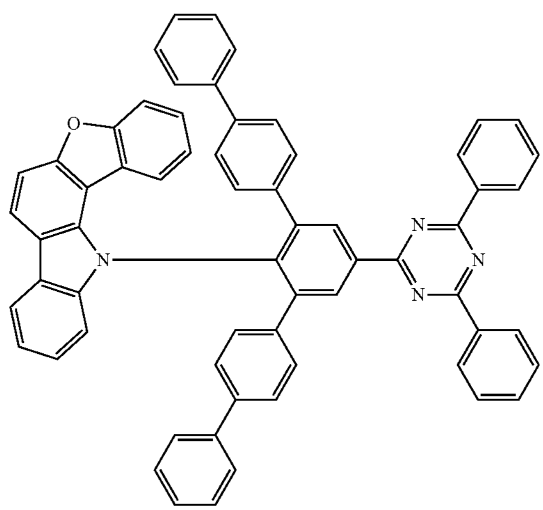
820
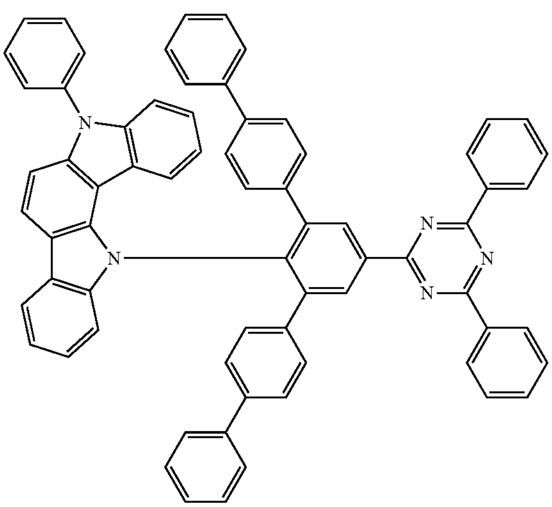
821
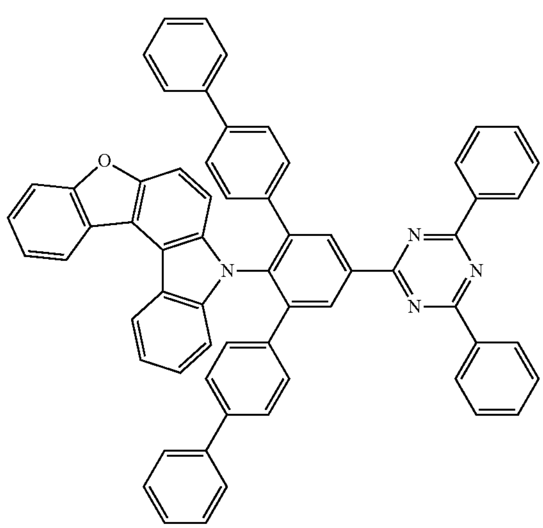
822
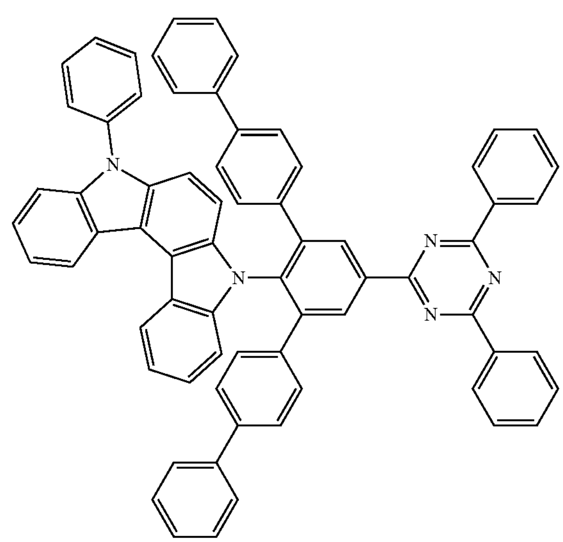

-continued
823
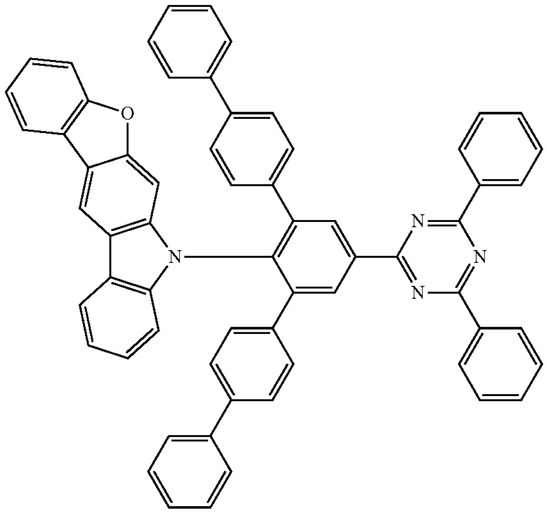
824
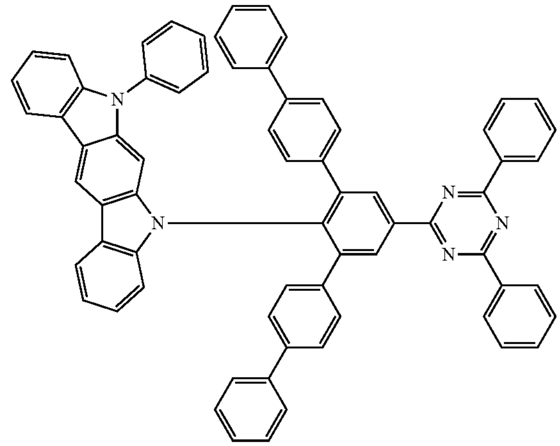
825
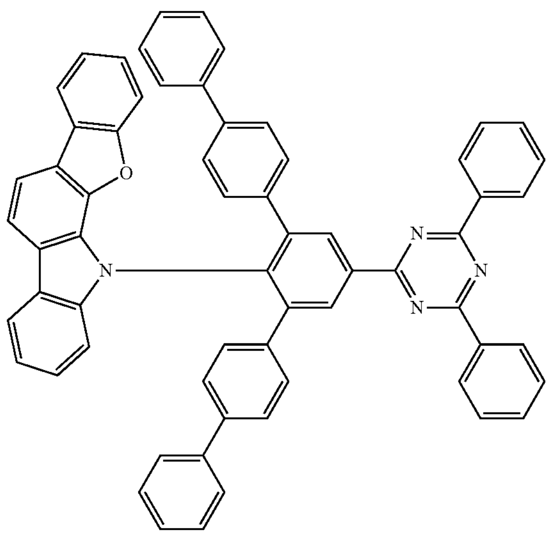
826
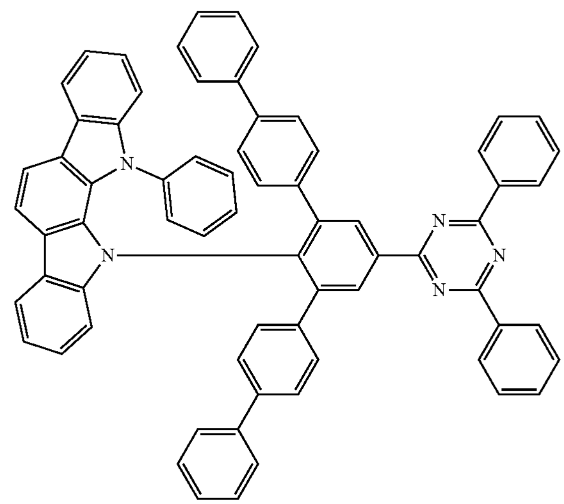
827
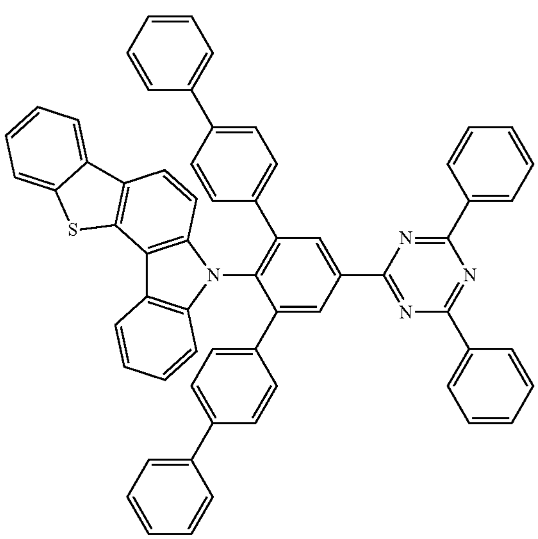
828
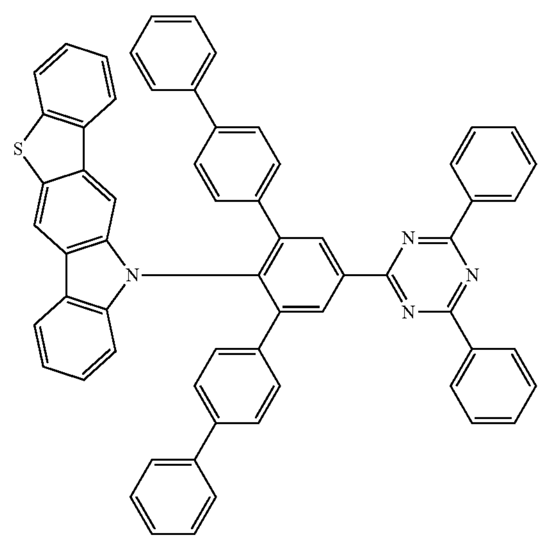

-continued
829
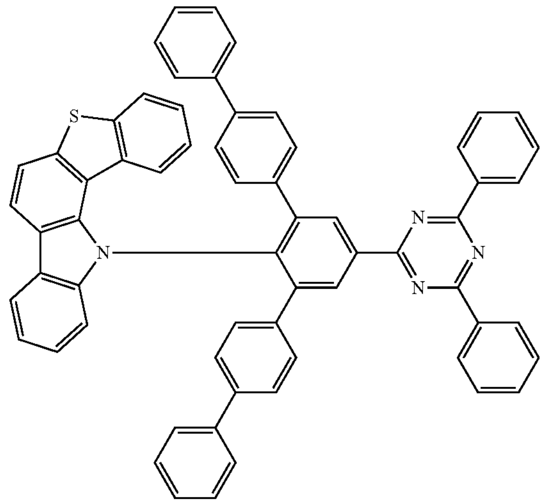
830
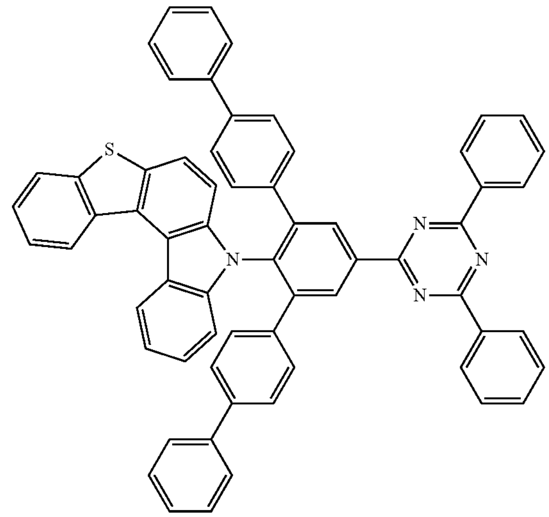
831
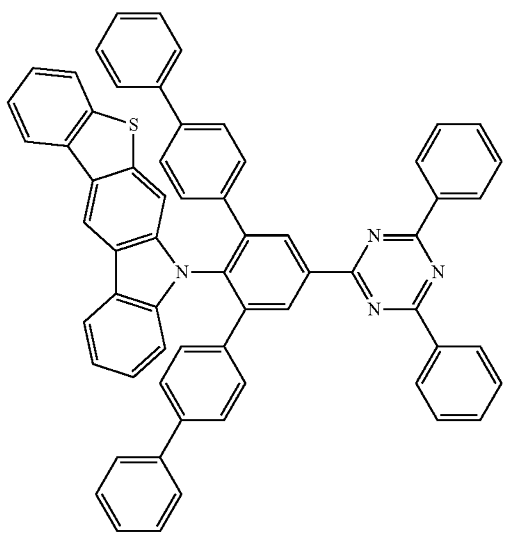
832
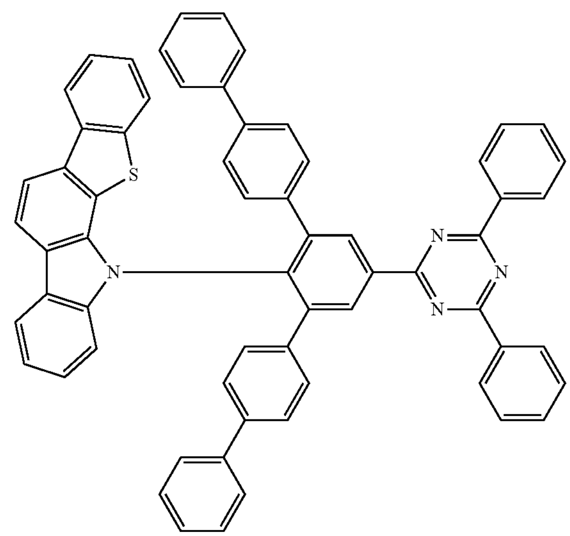
833
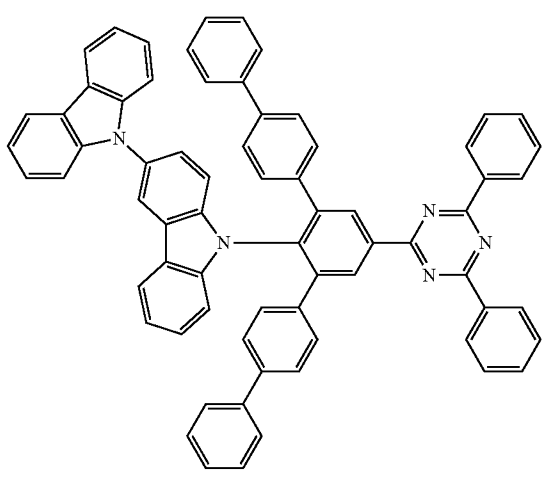
834
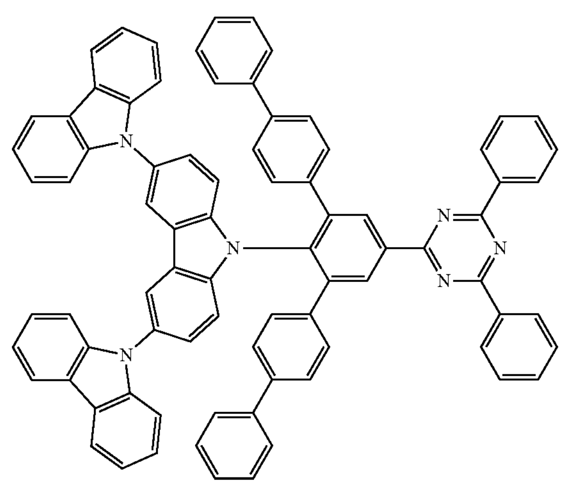

-continued
835
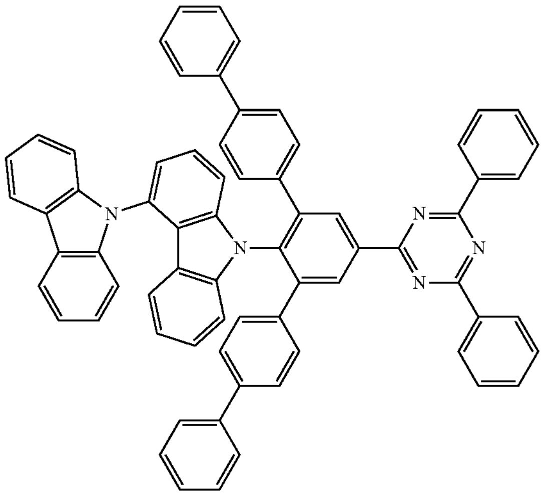
836
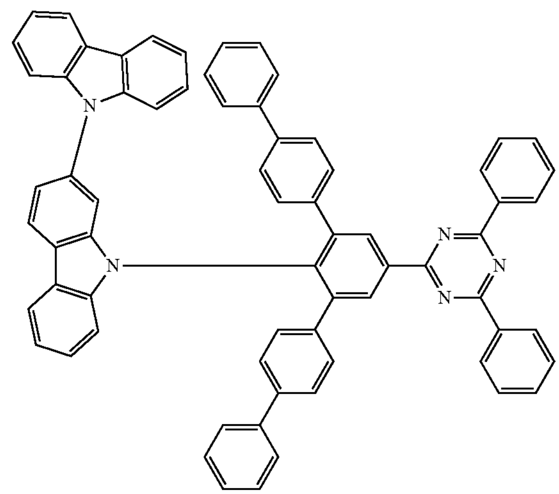
837
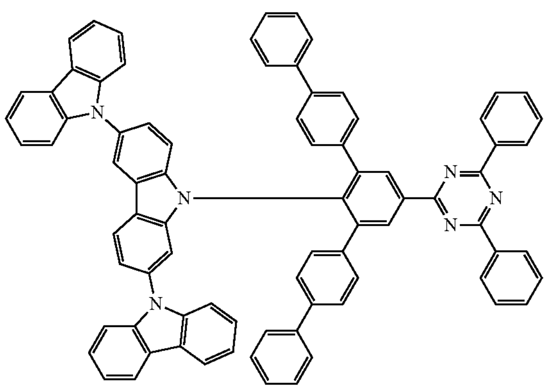
838
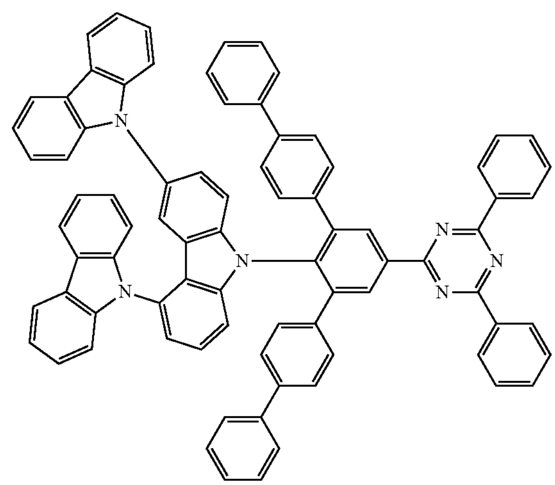
839
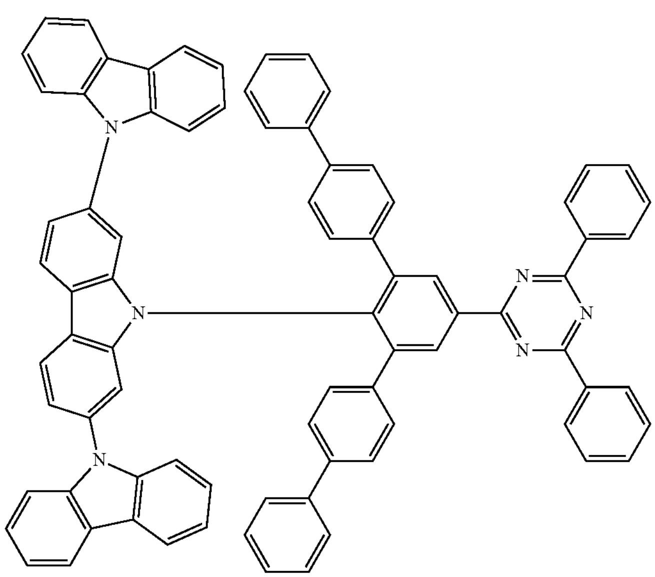

-continued
840
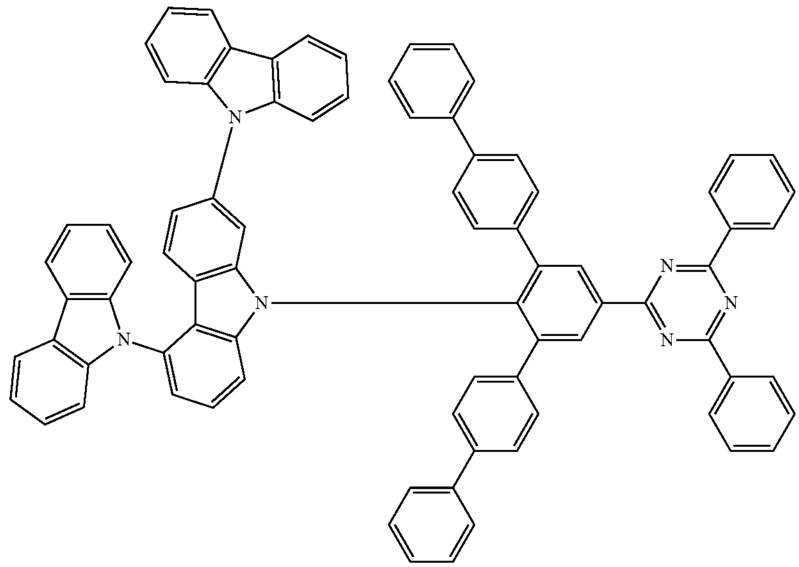
841
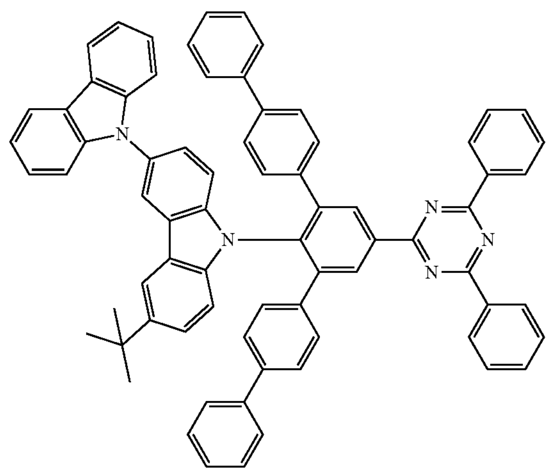
842
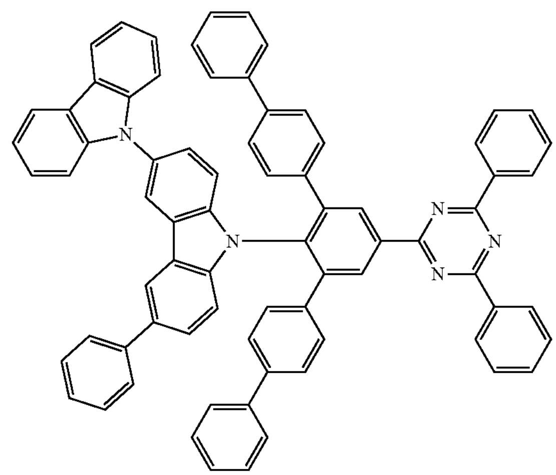
843
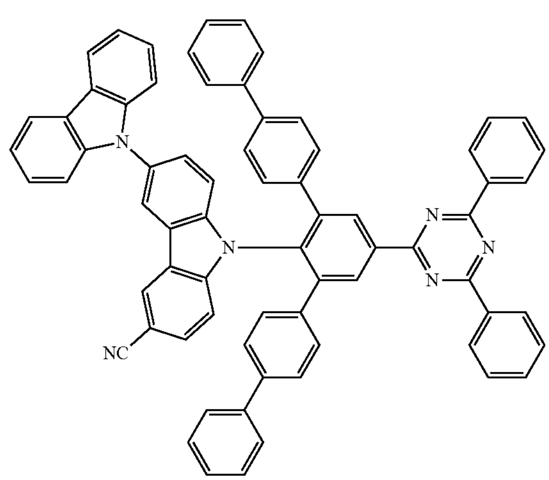
844
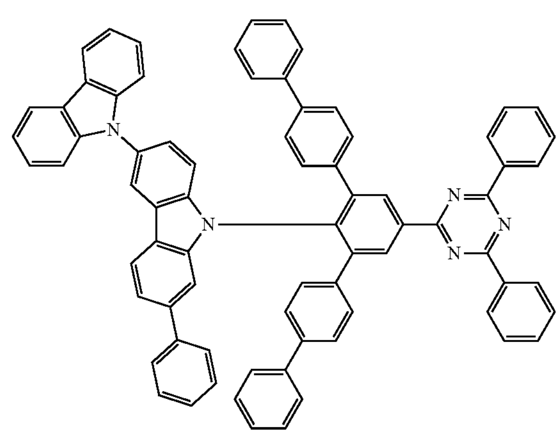

-continued
845
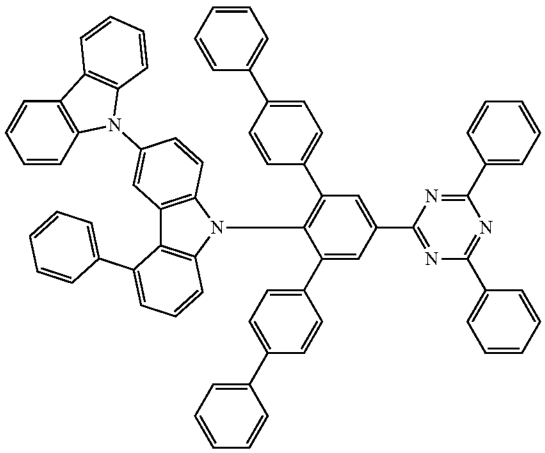
846
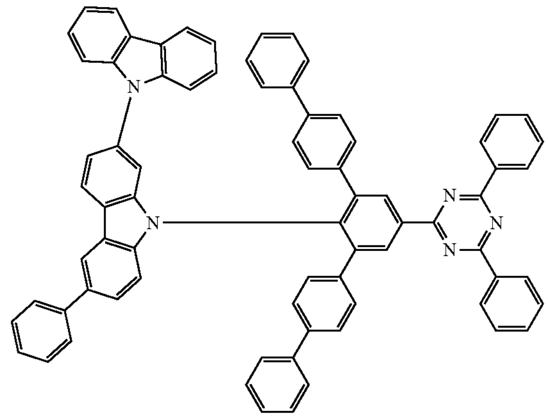
847
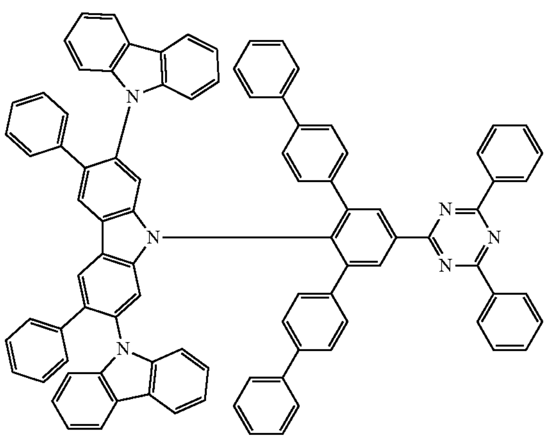
848
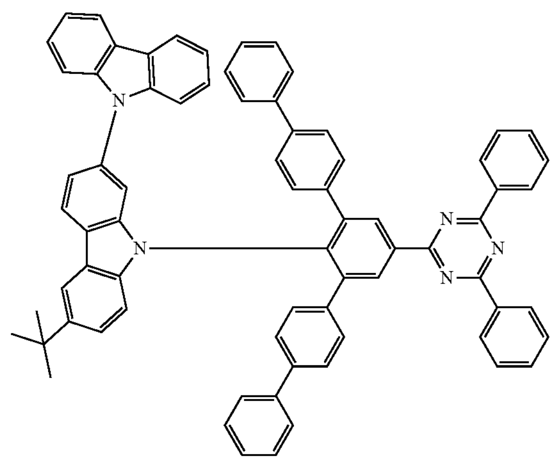
849
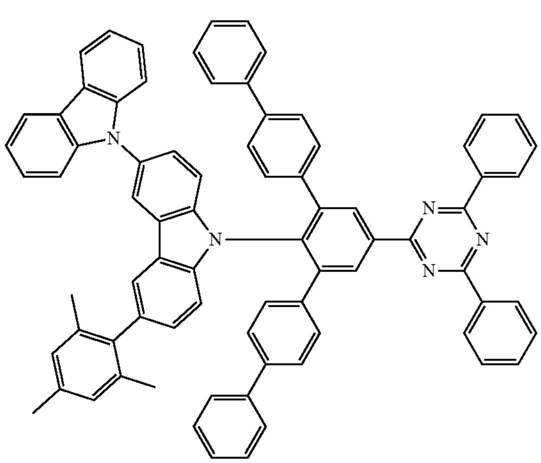
850
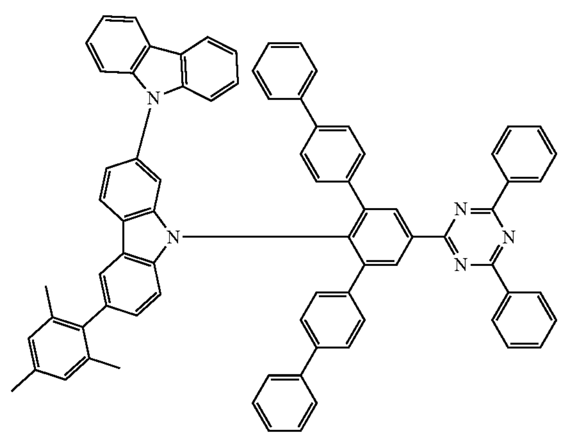

-continued
851
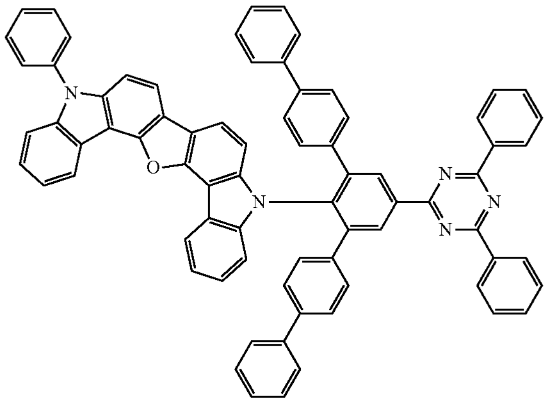
852
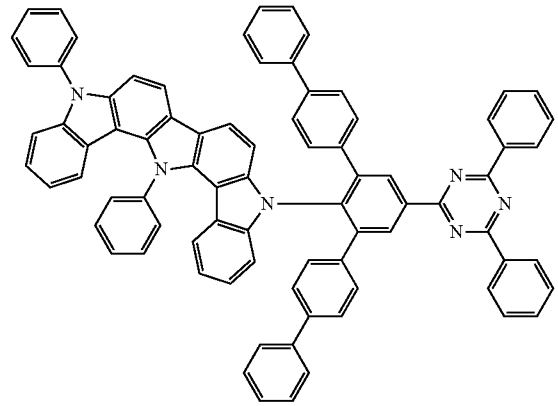
853
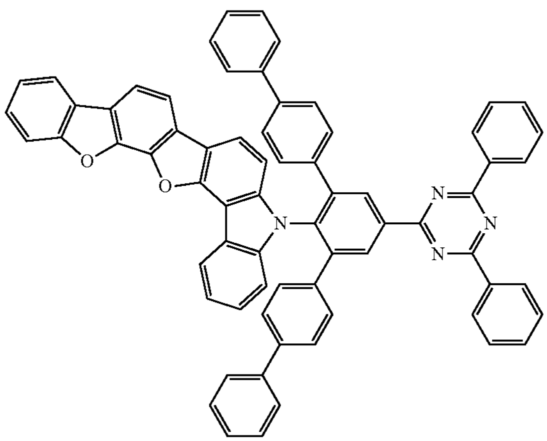
854
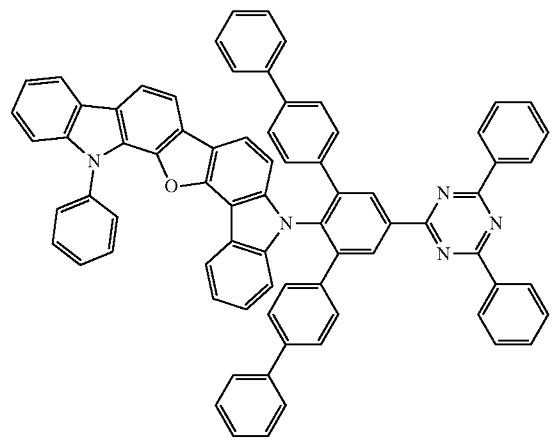
855
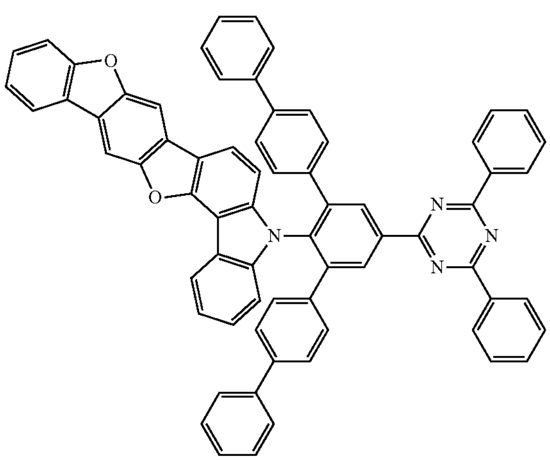
856
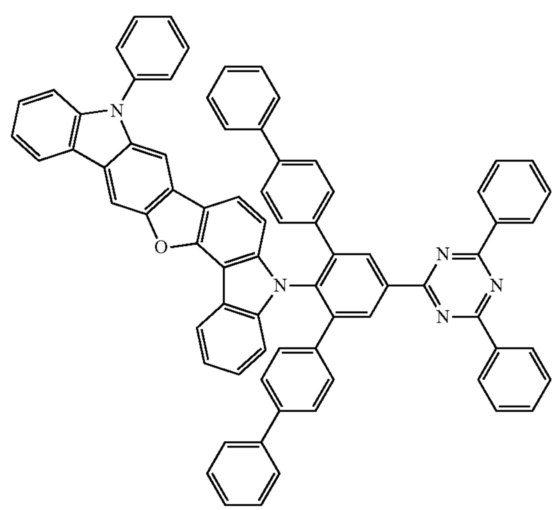

-continued
857
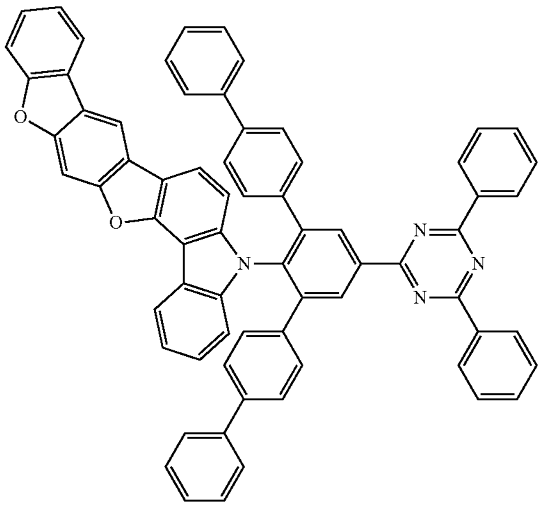
858
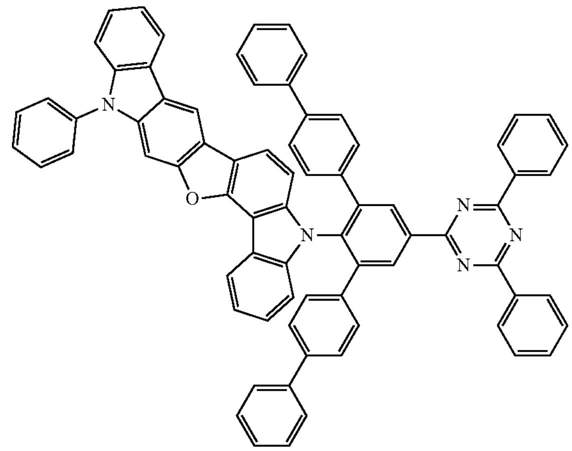
859
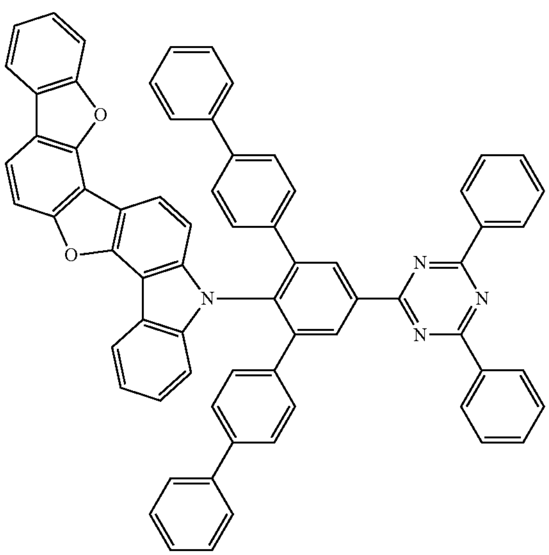
860
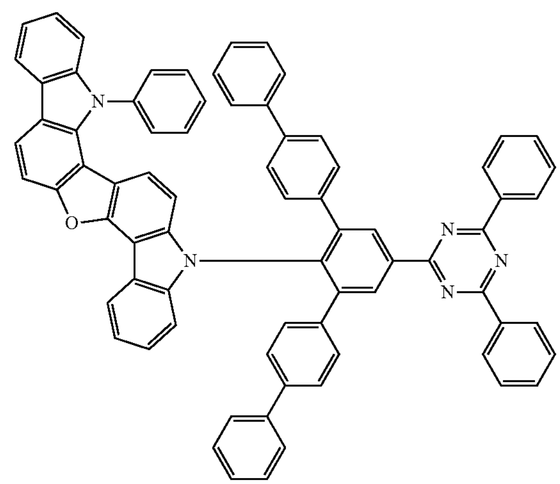
861
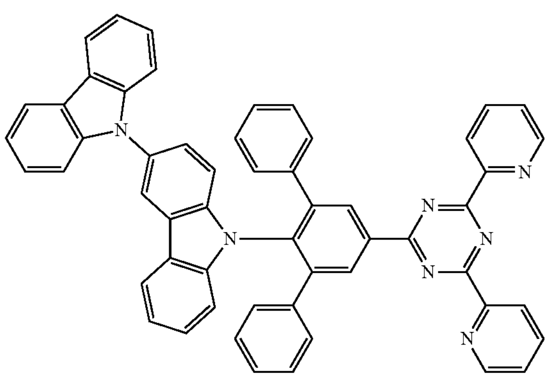
862
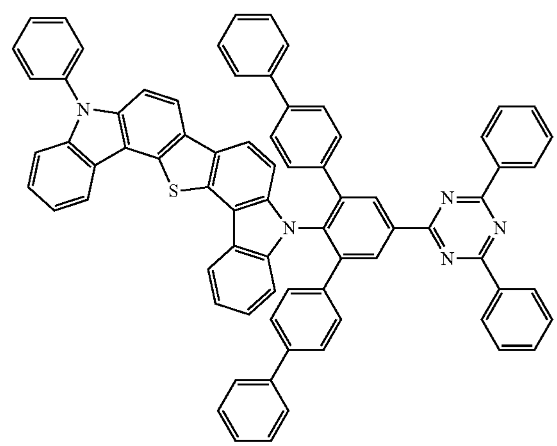

-continued
863
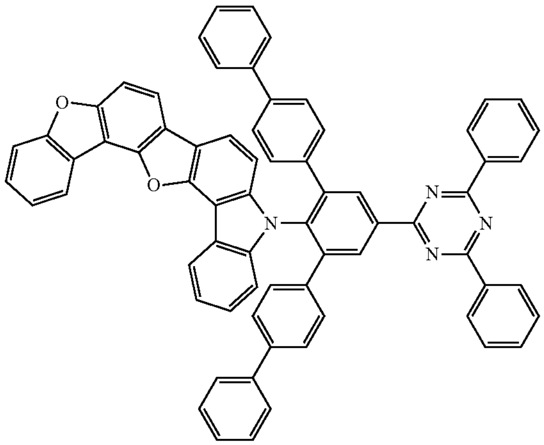
864
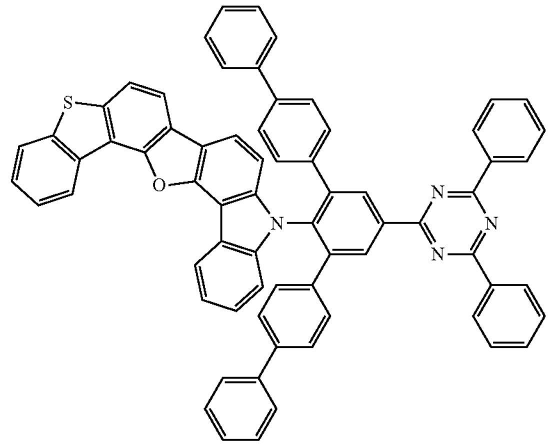
865
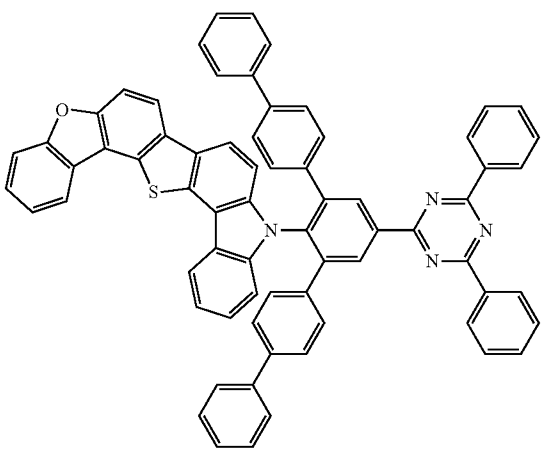
866
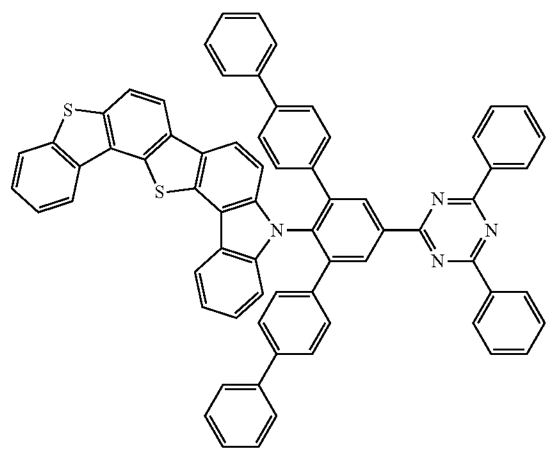
867
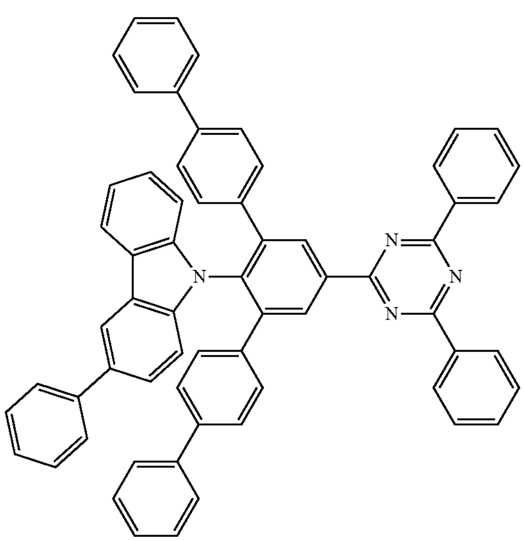
868
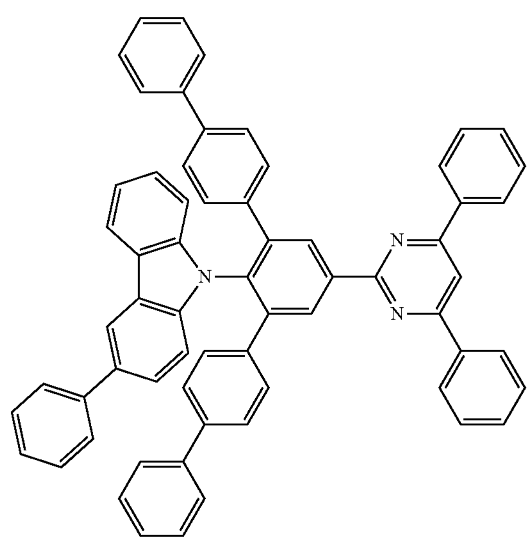

-continued
869
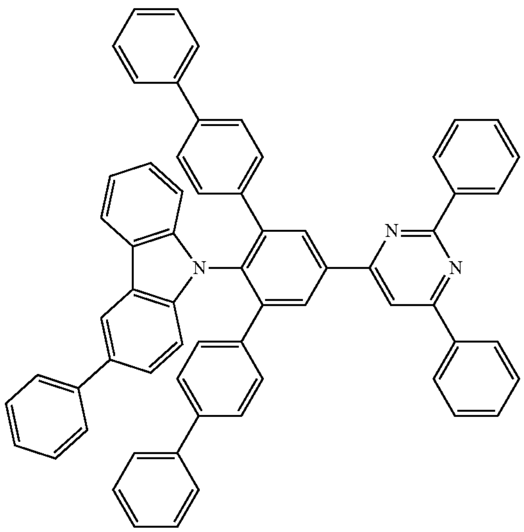
870
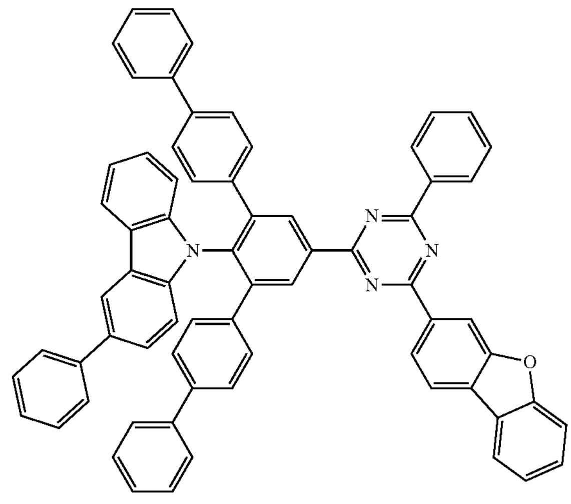
871
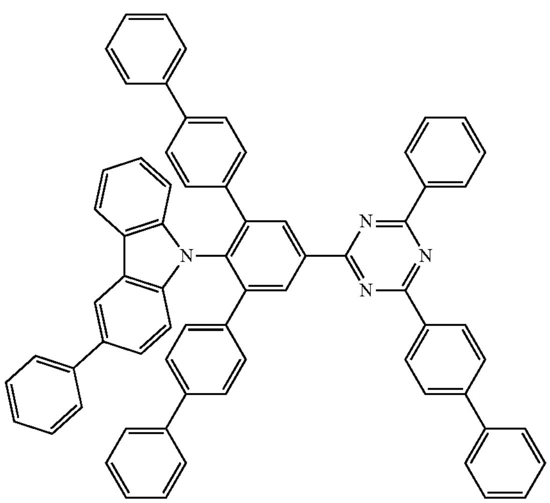
872
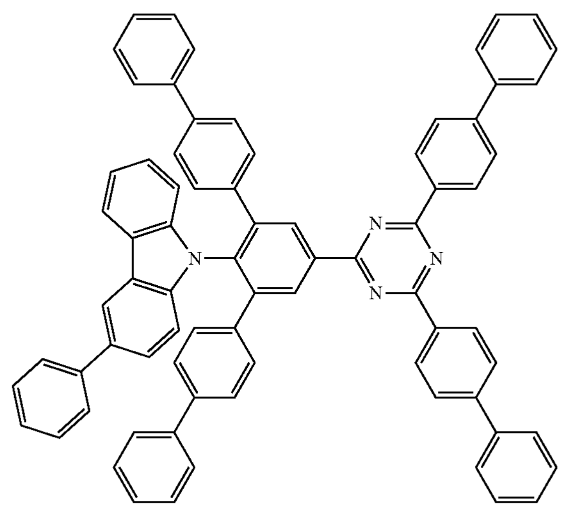
873
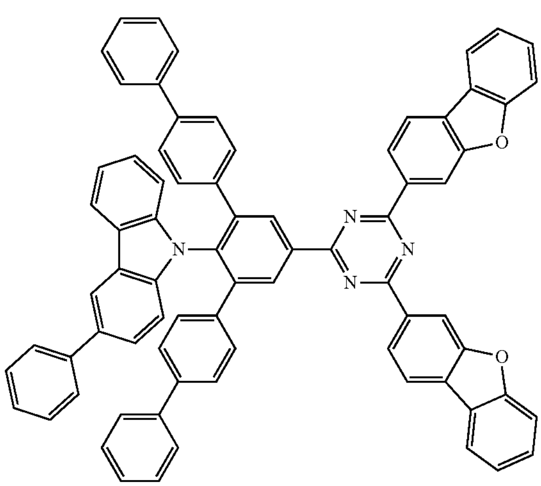
874
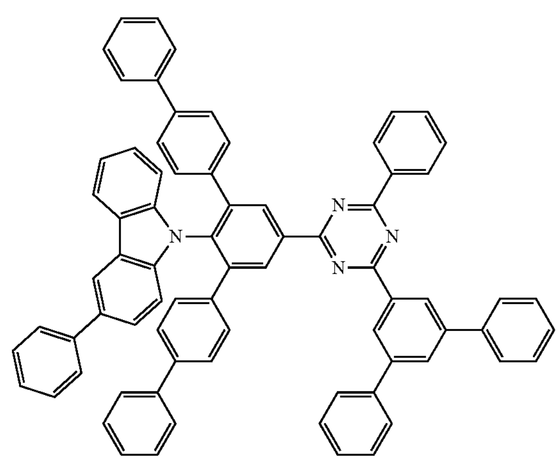

-continued
875
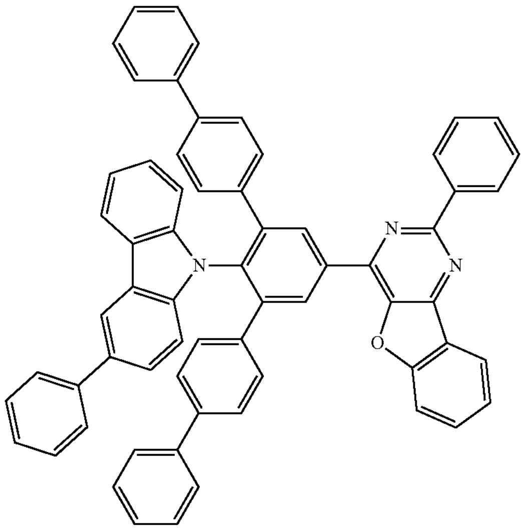
876
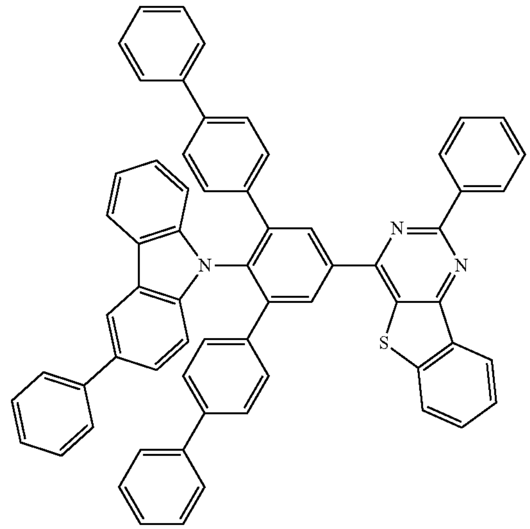
877
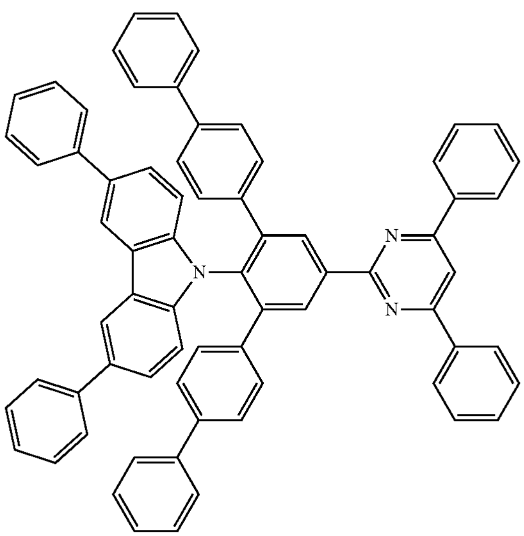
878
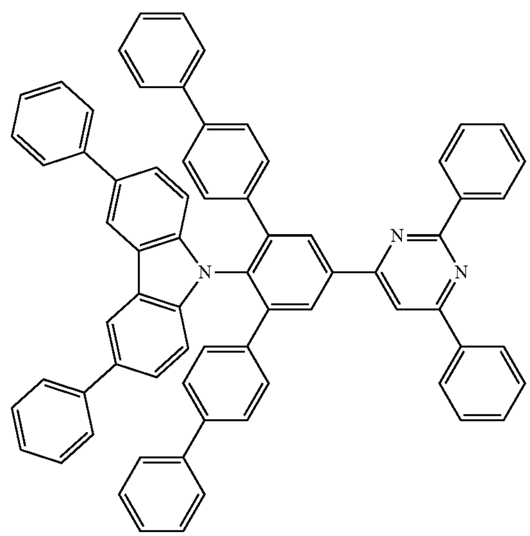
879
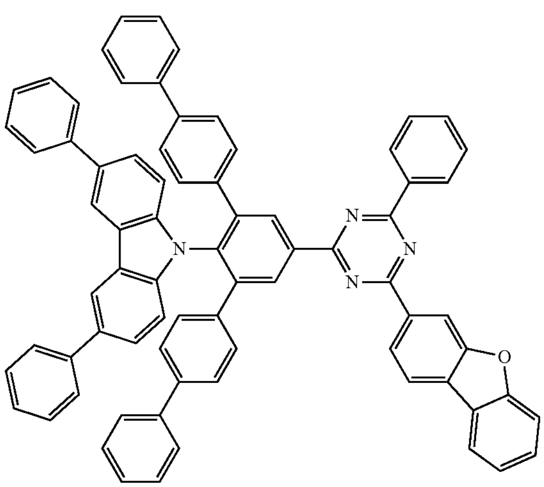
880
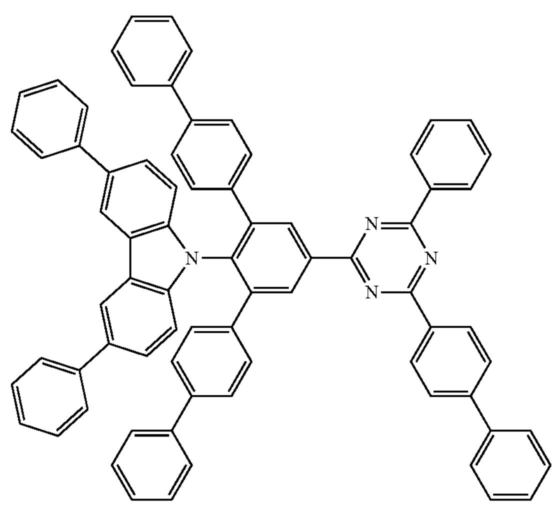

-continued
881
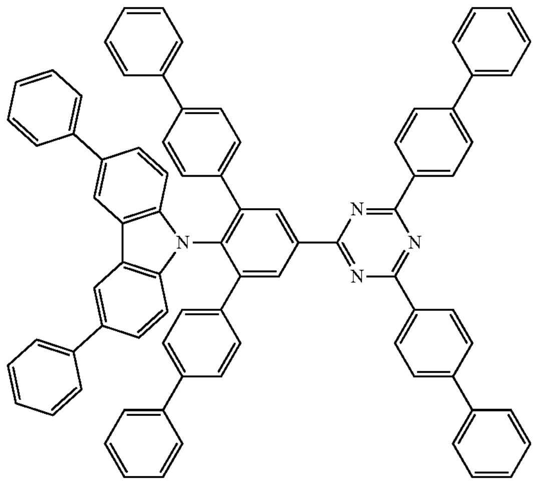
882
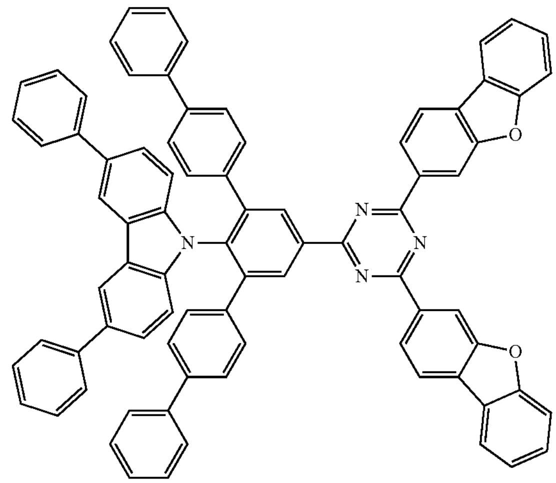
883
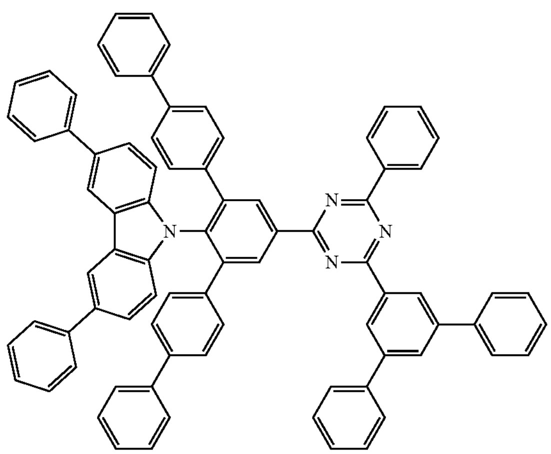
884
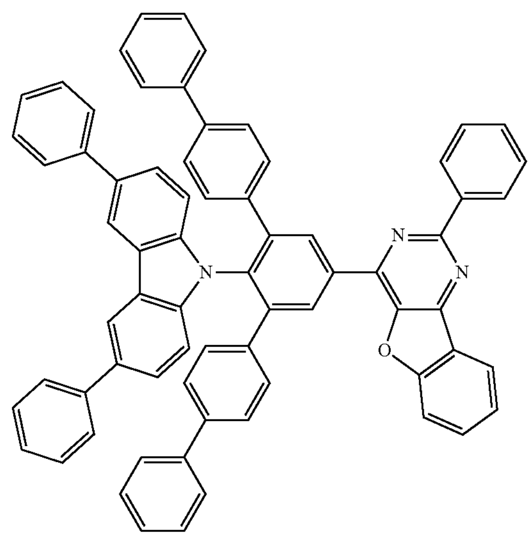
885
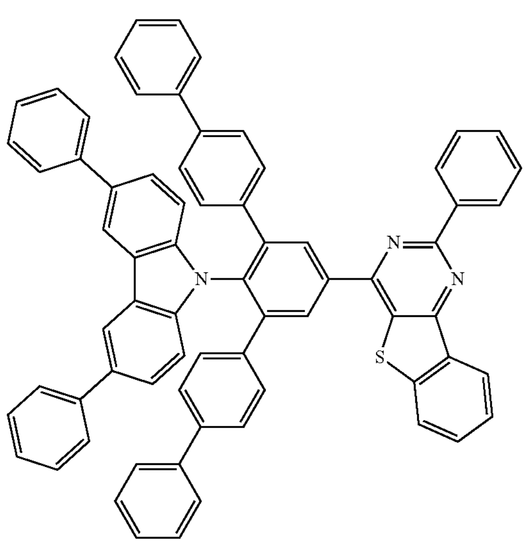
886
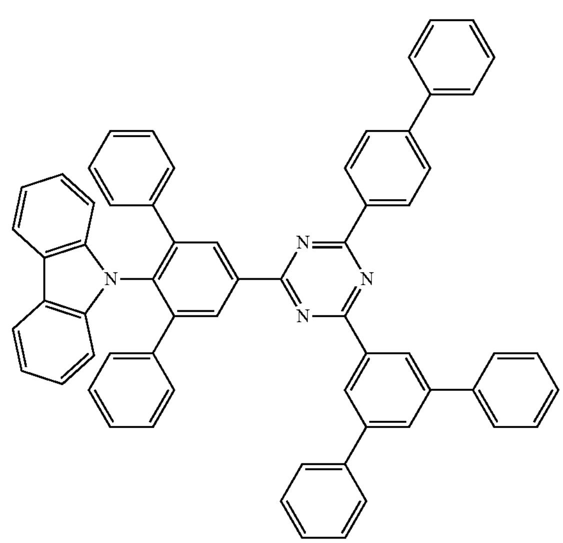

-continued
887
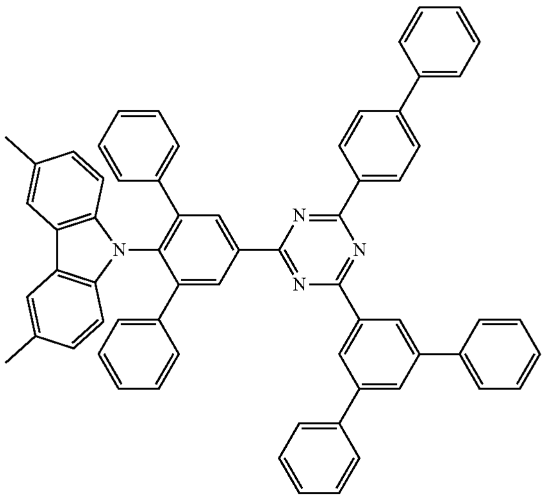
888
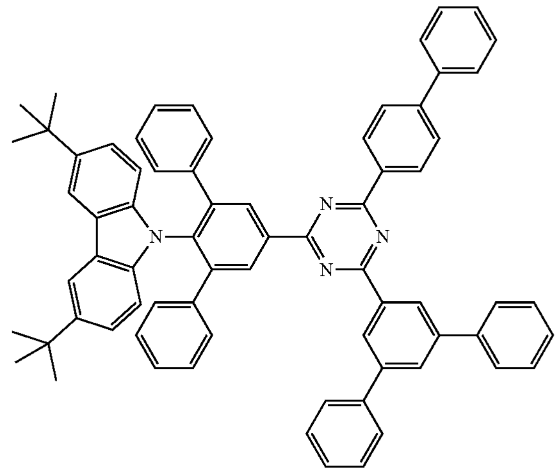
889
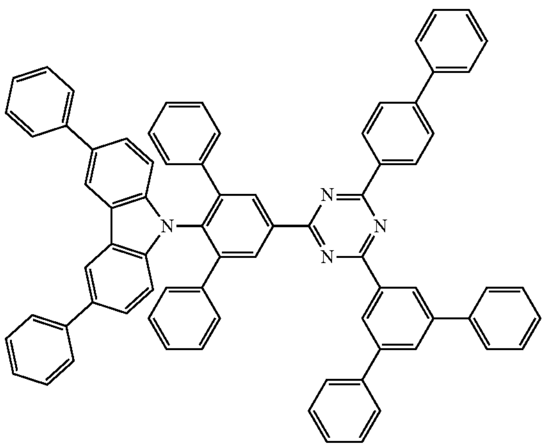
890
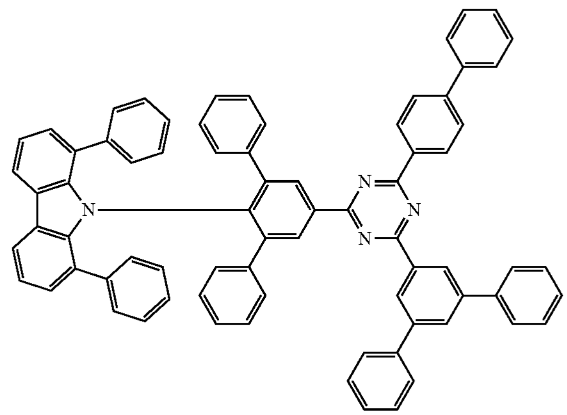
891
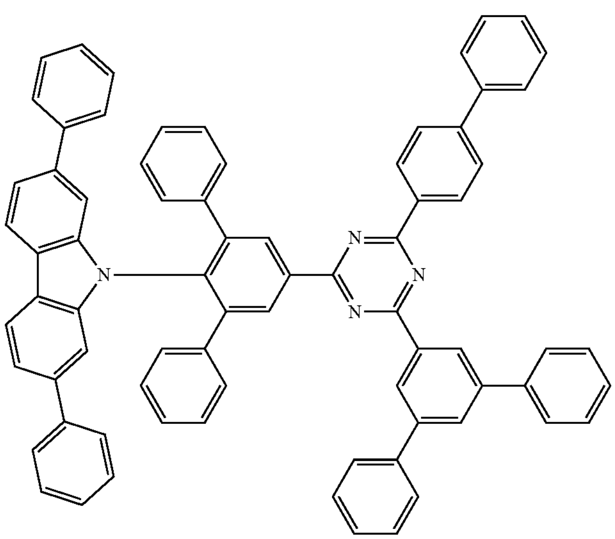

892
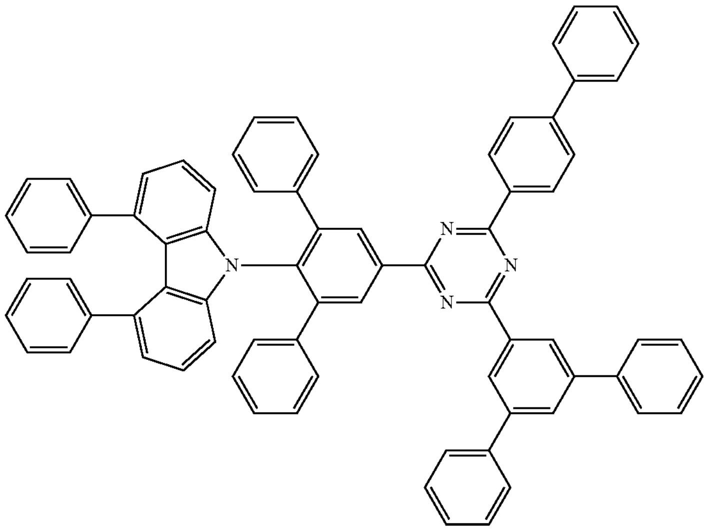
893
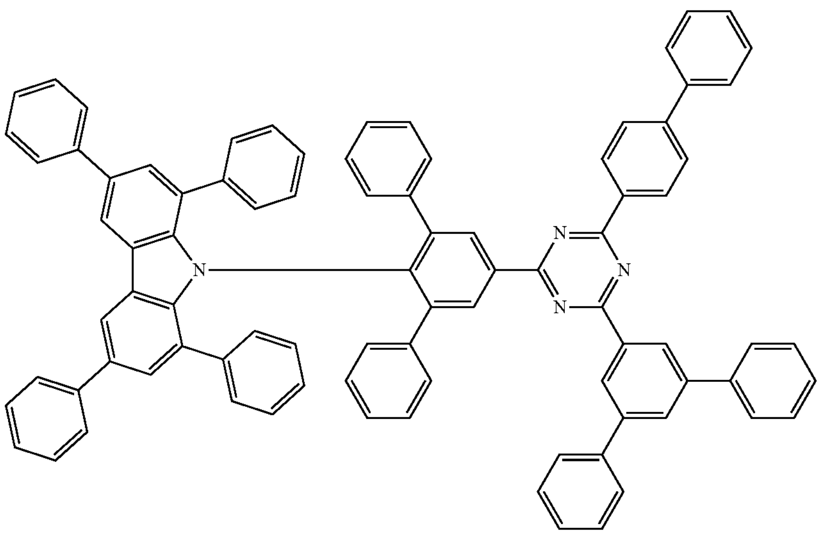
894
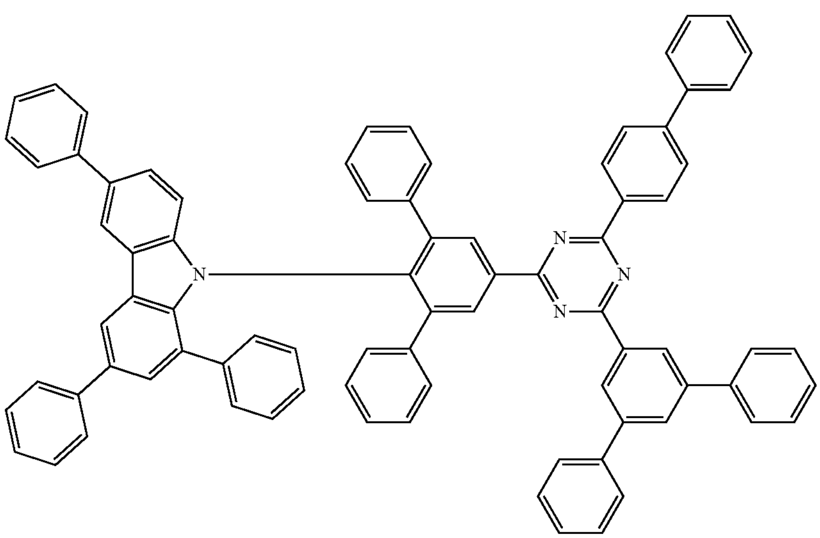

-continued
895
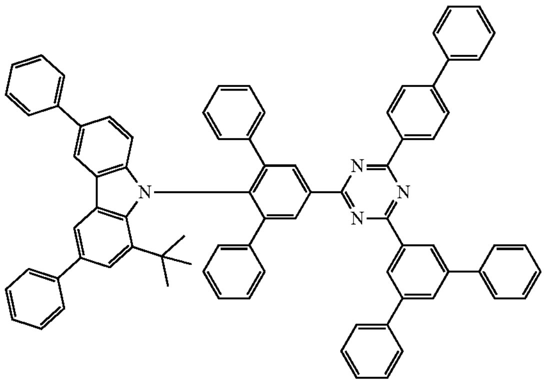
896
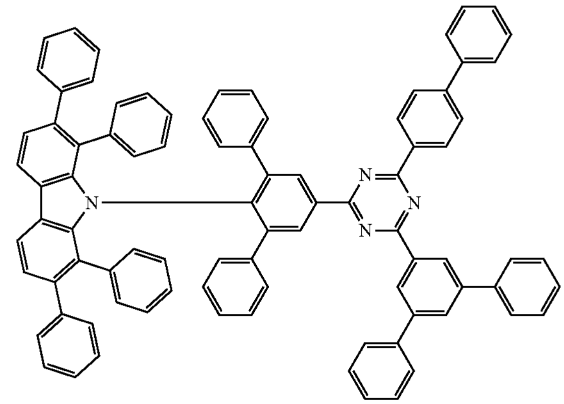
897
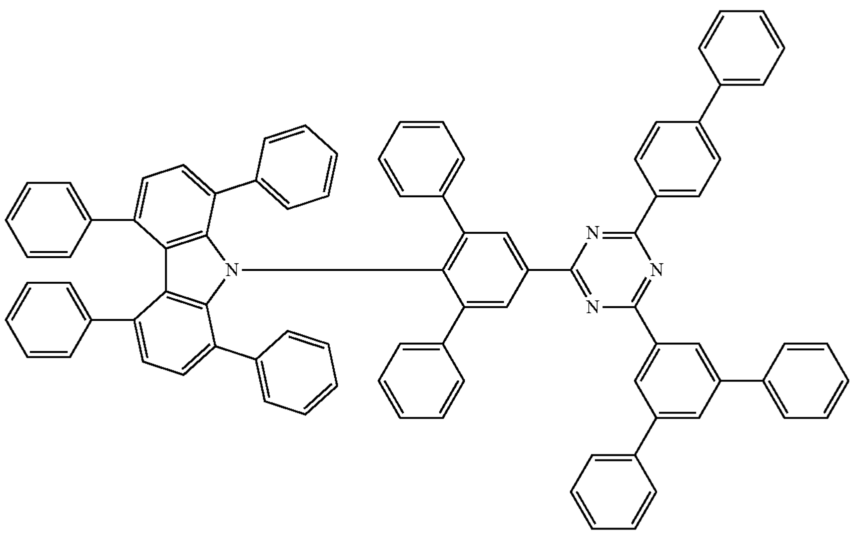
898
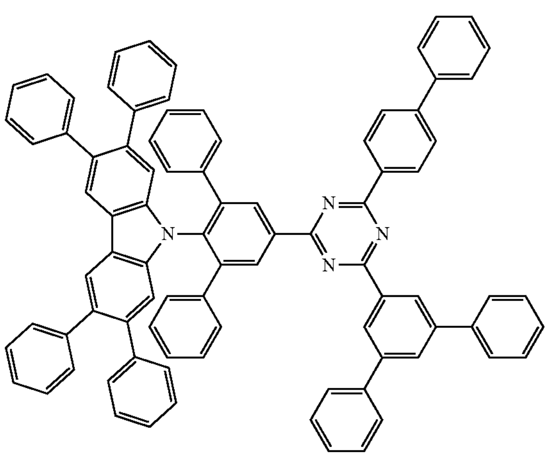
899
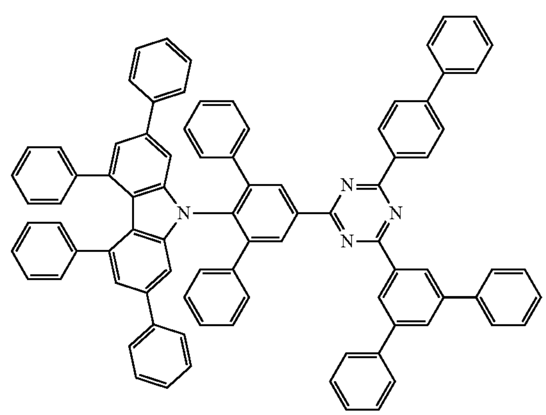

-continued
900
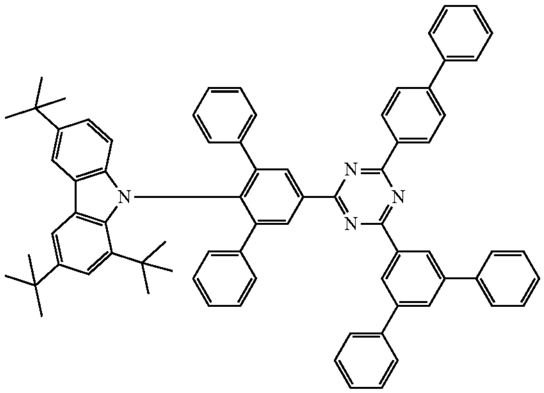
901
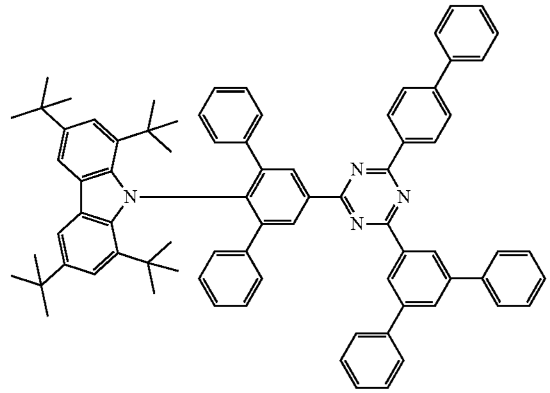
902
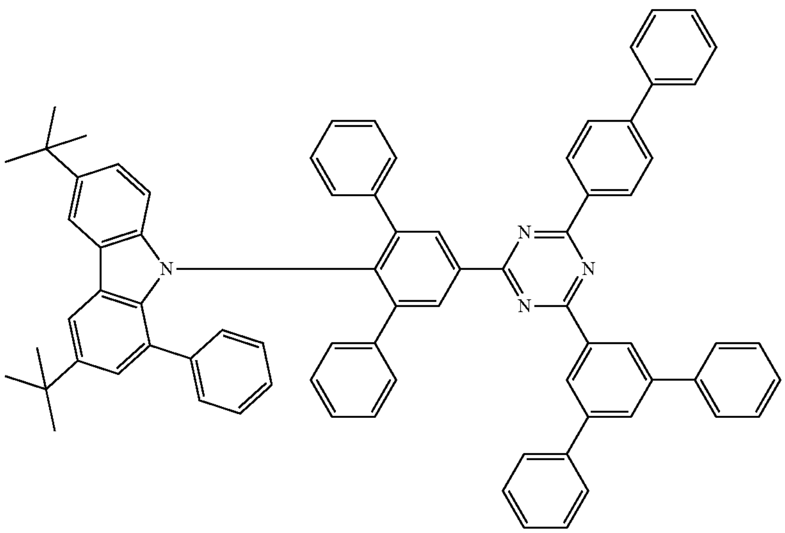
903
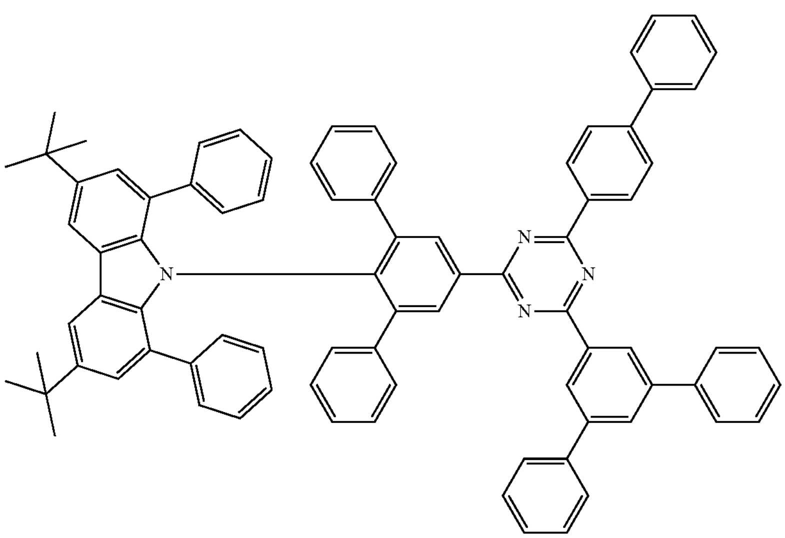

-continued
904
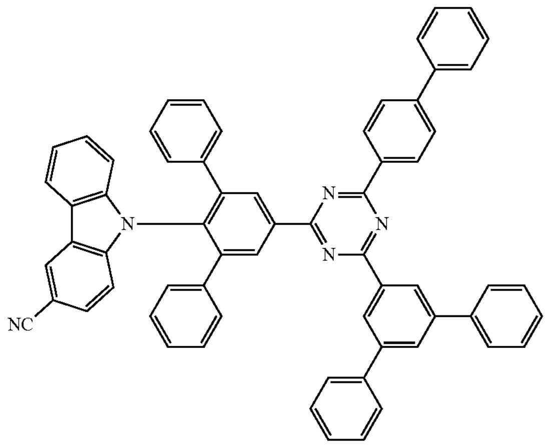
905
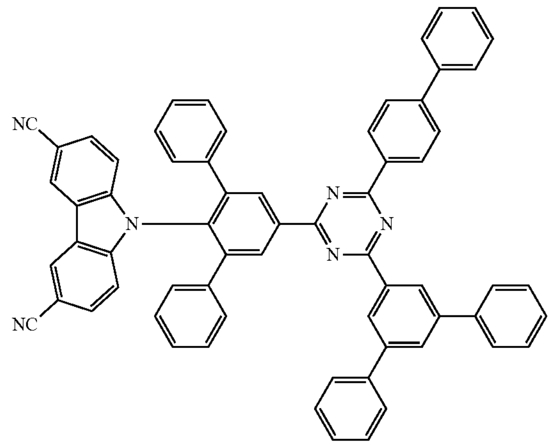
906
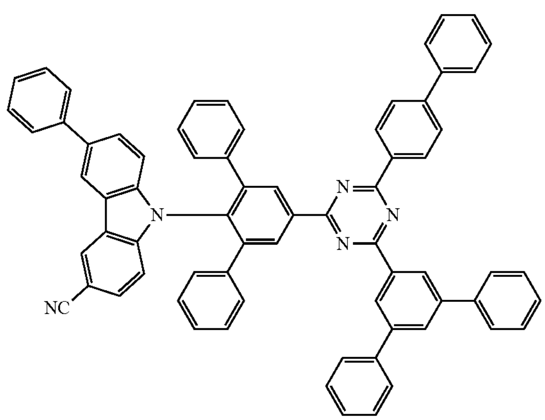
907
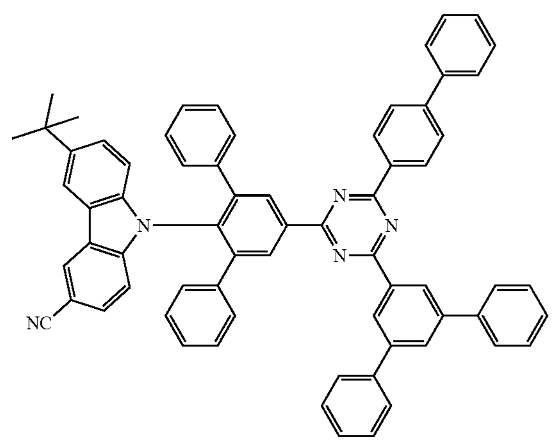
908
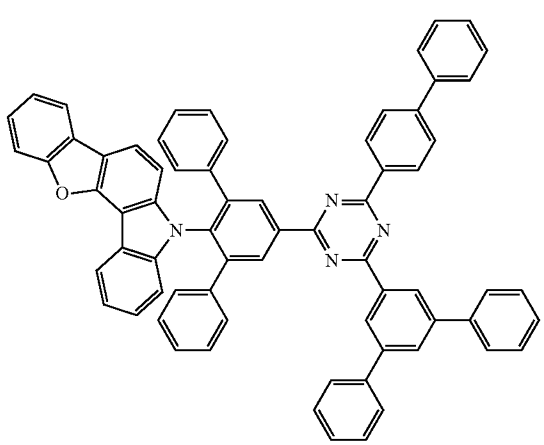
909
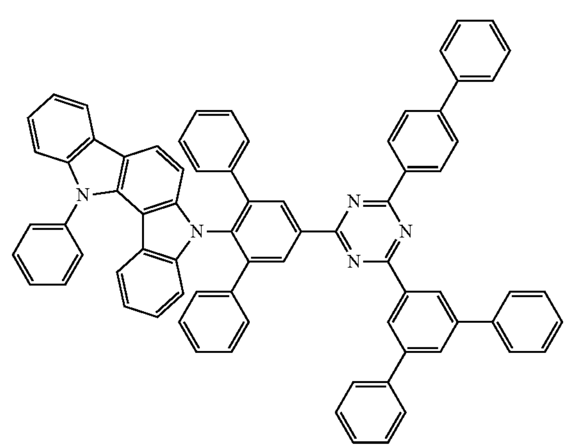

-continued
910
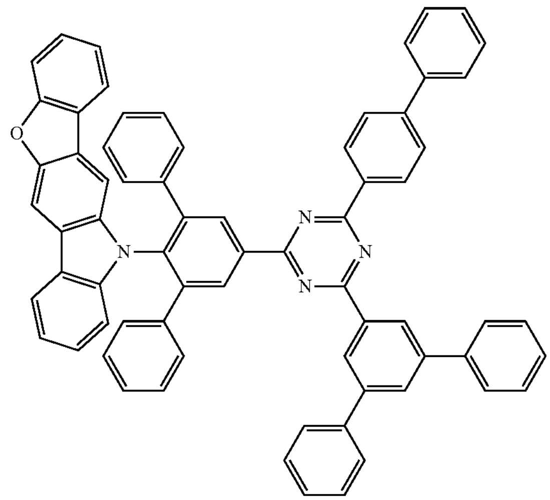
911
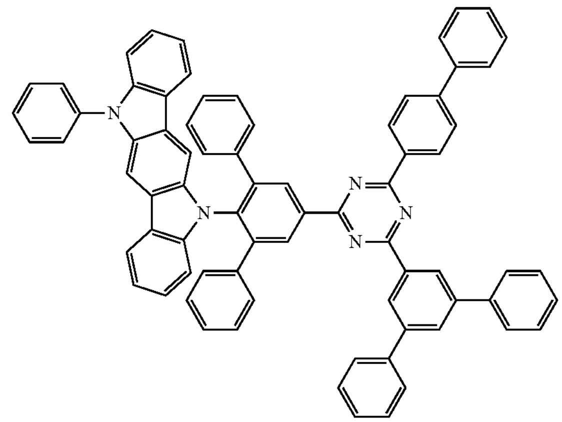
912
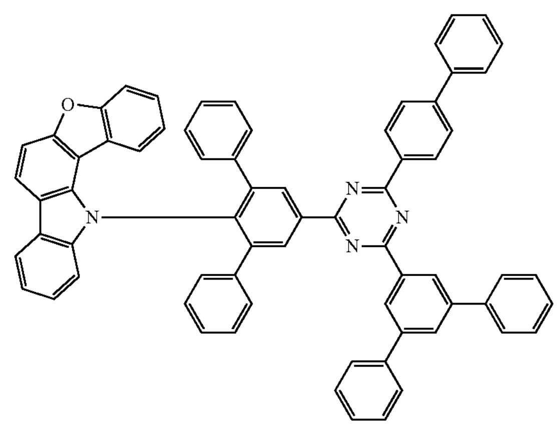
913
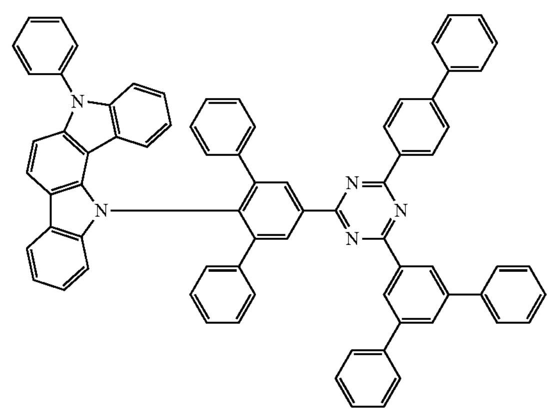
914
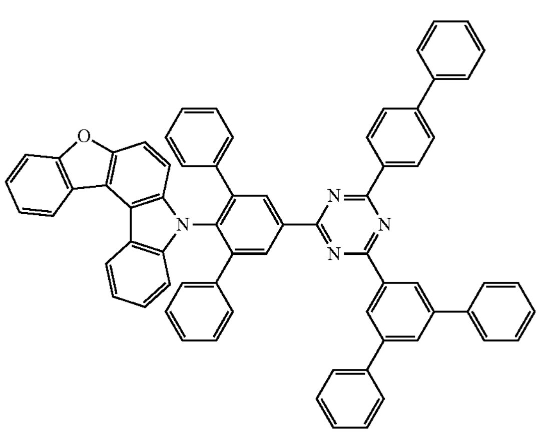
915
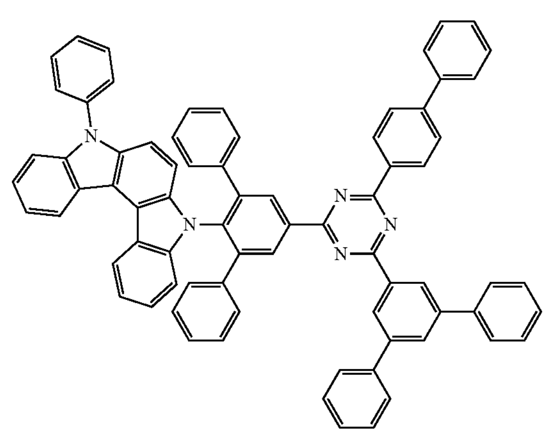

-continued
916
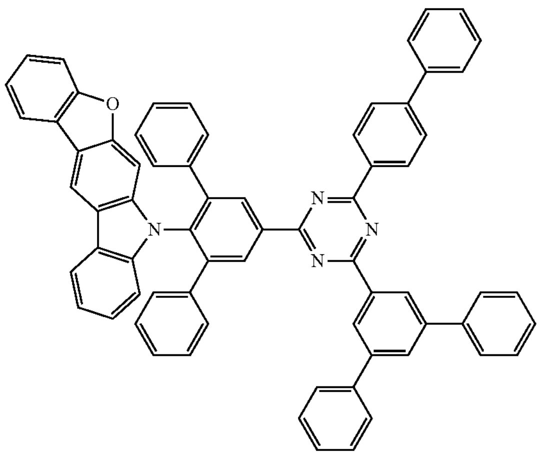
917
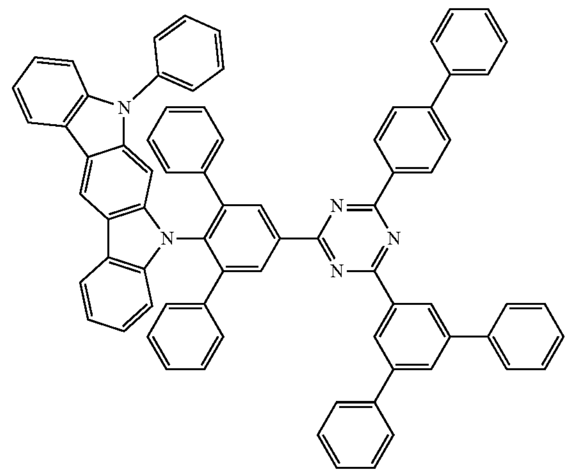
918
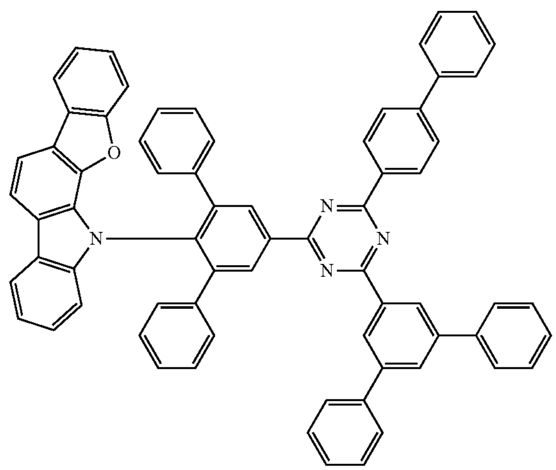
919
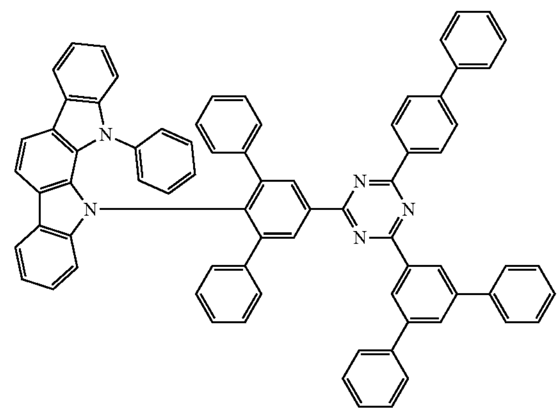
920
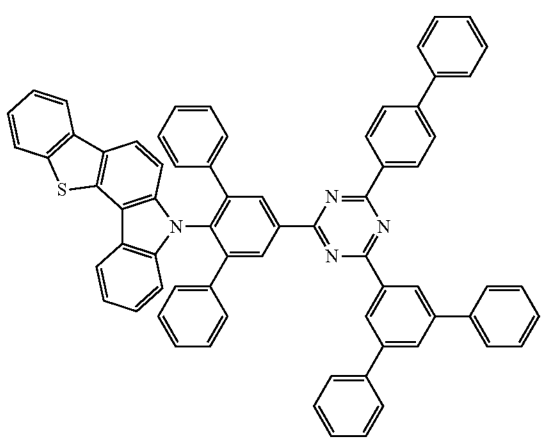
921
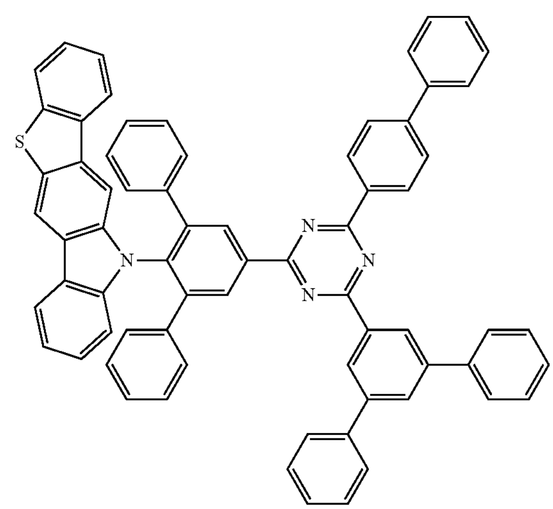

-continued
922
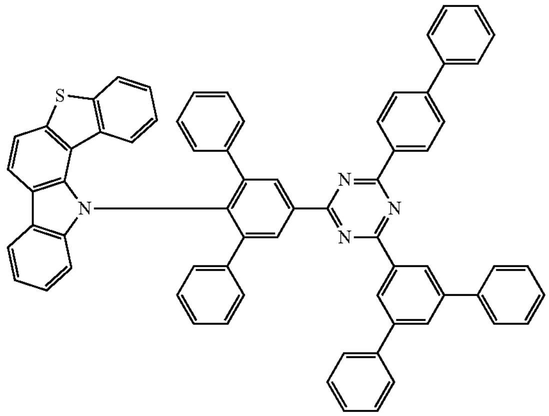
923
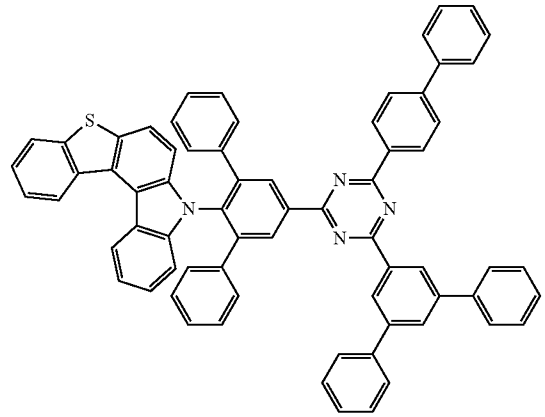
924
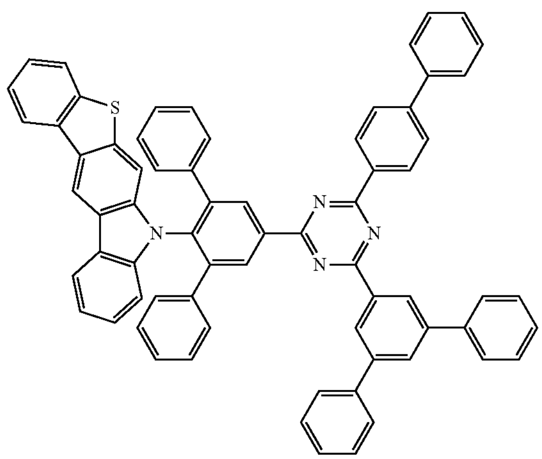
925
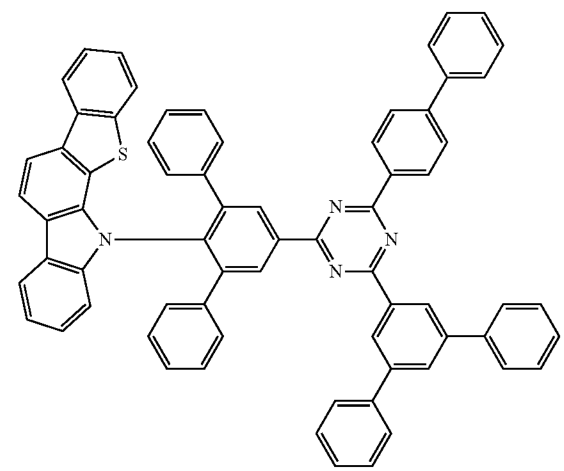
926
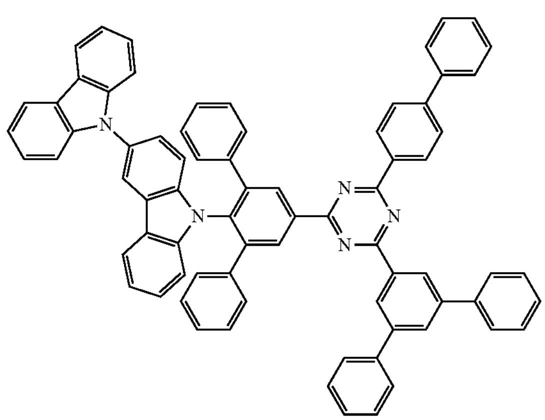
927
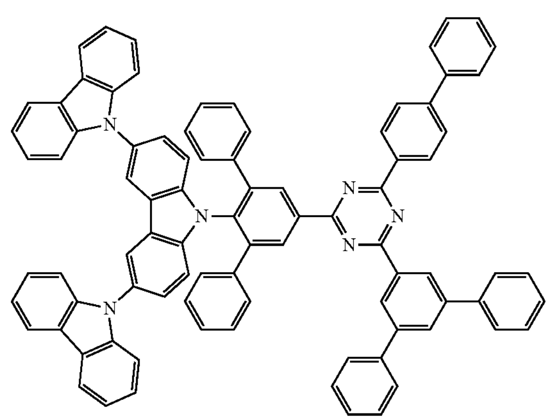

-continued
928
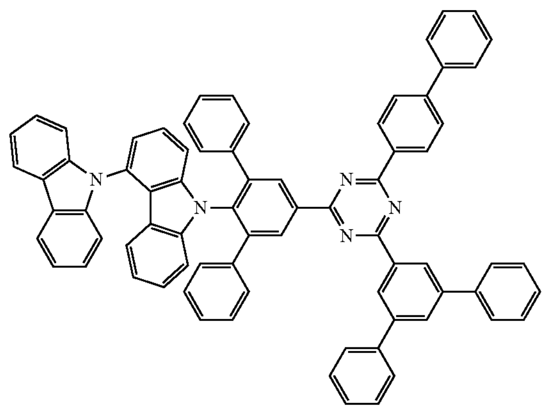
929
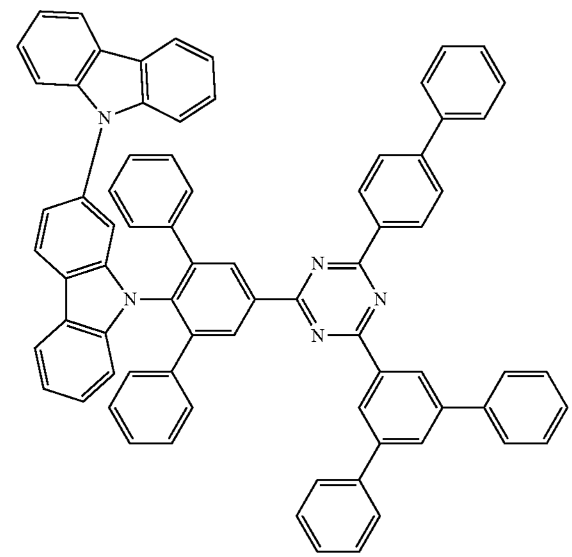
930
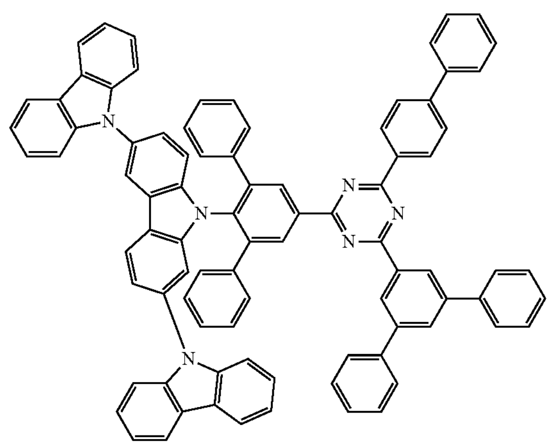
931
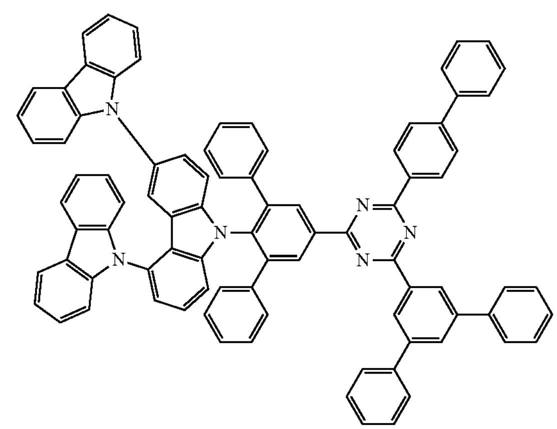
932
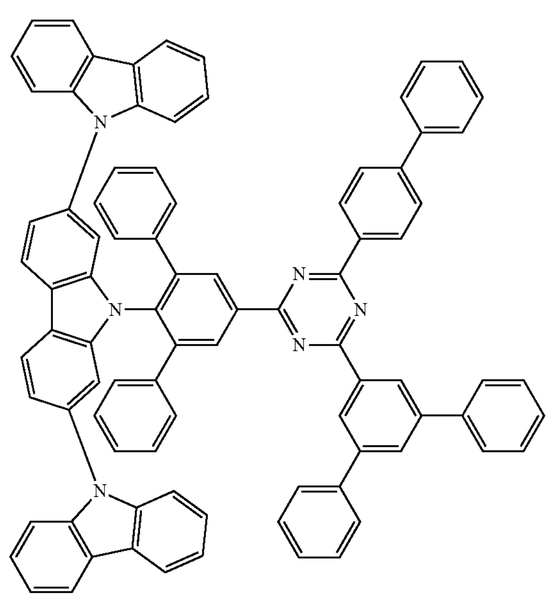
933
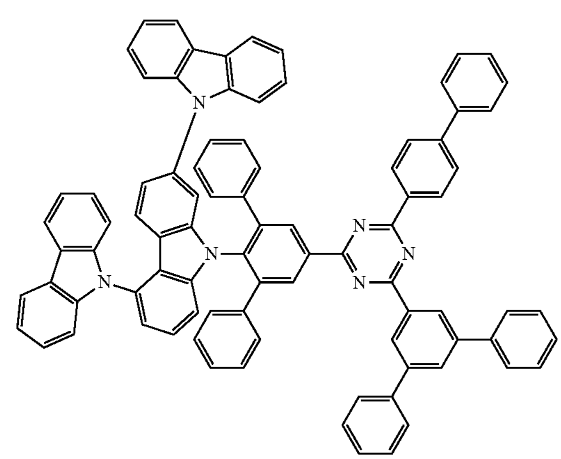

-continued
934
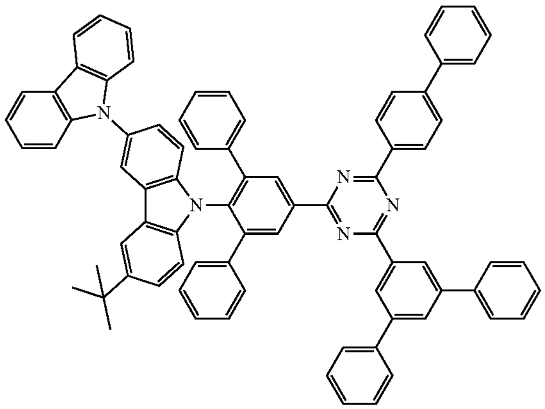
935
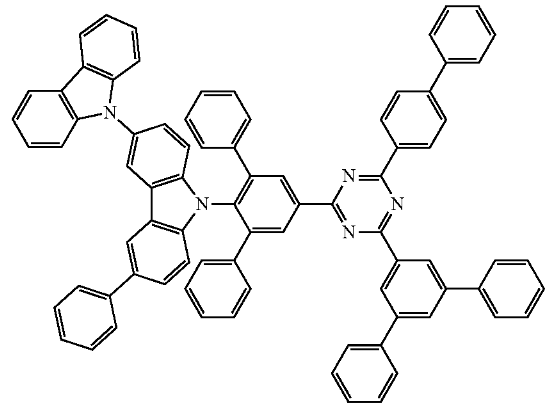
936
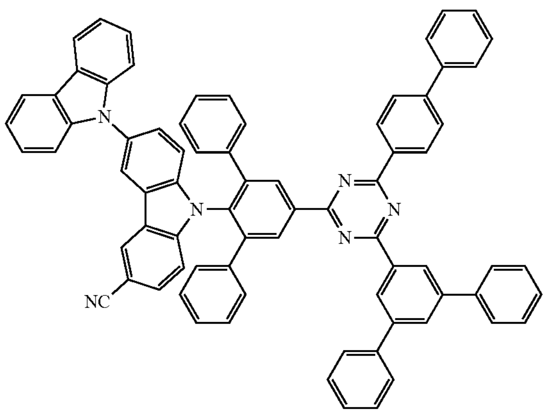
937
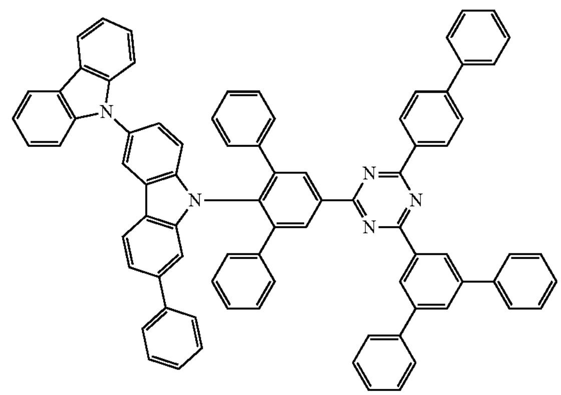
938
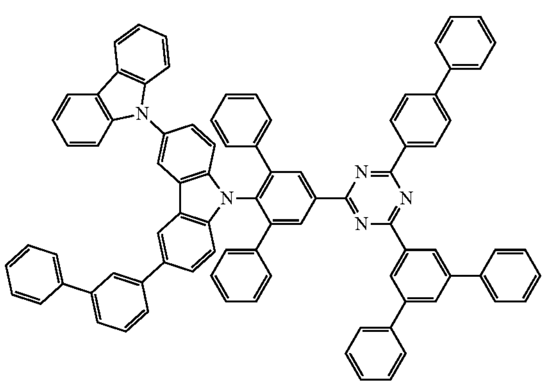
939
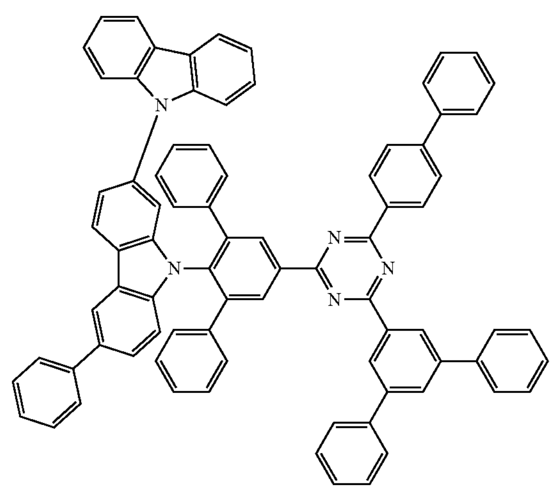

-continued
940
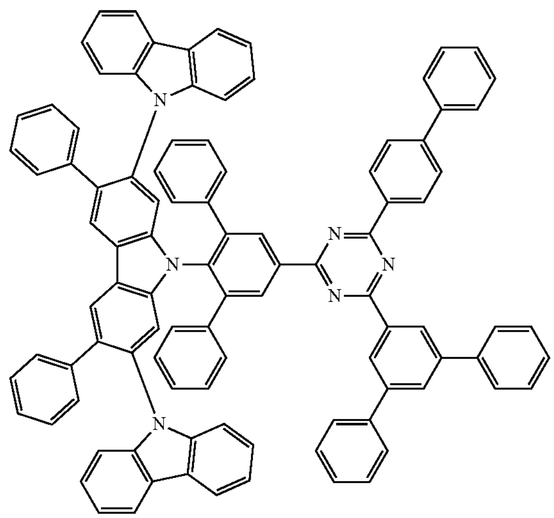
941
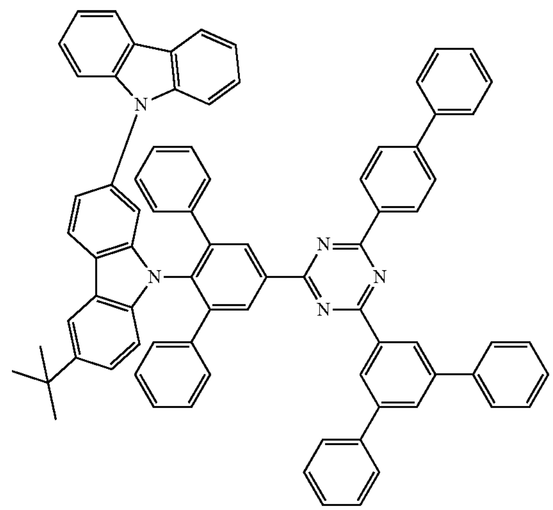
942
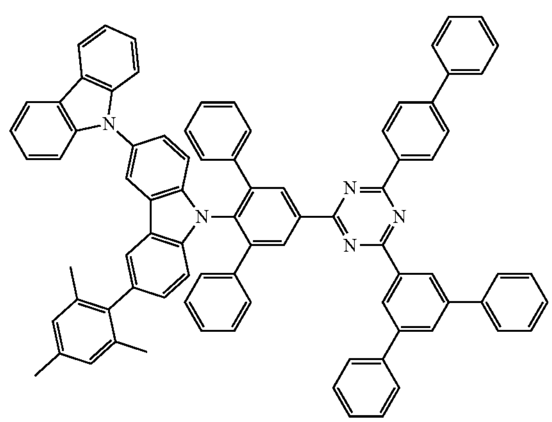
943
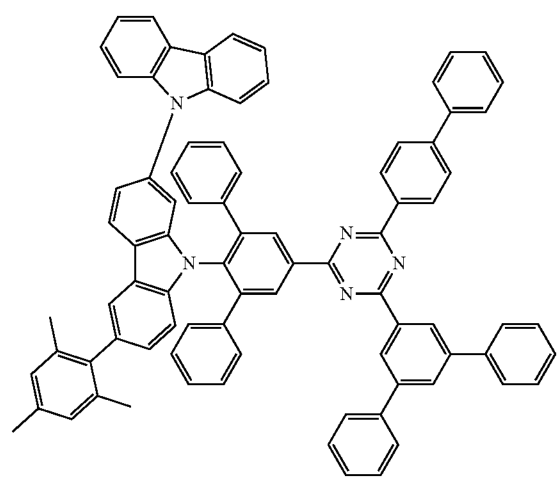
944
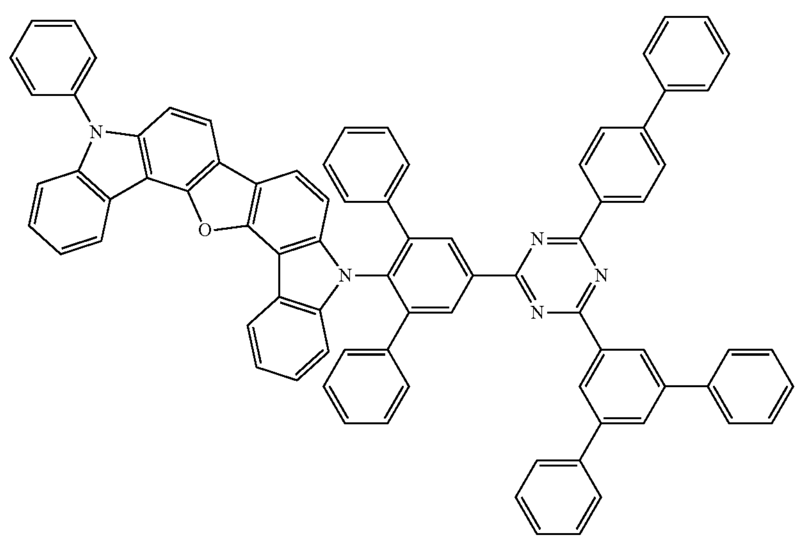

-continued
945
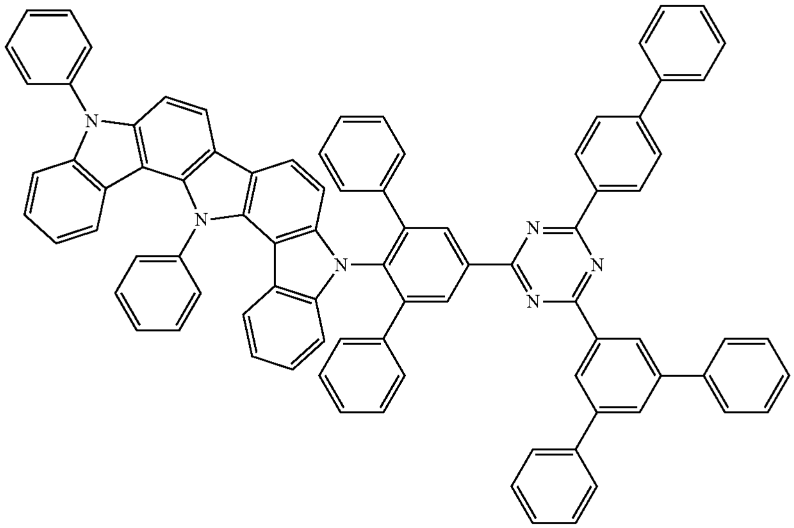
946
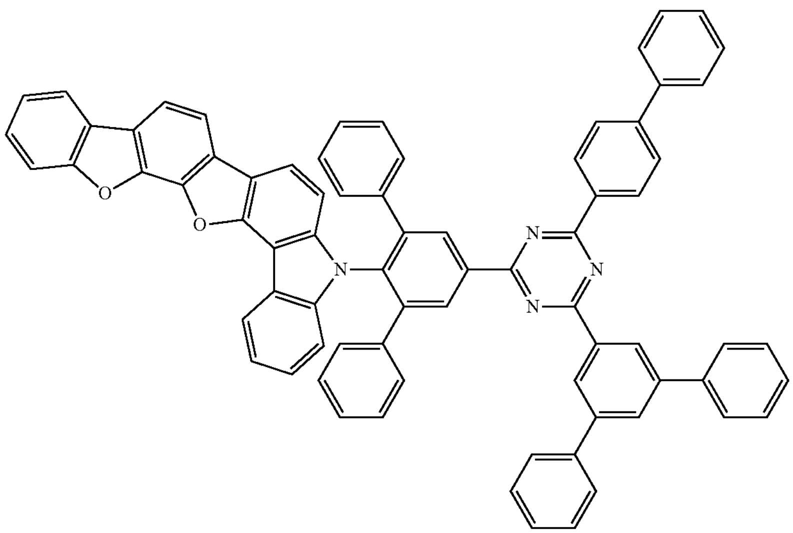
947
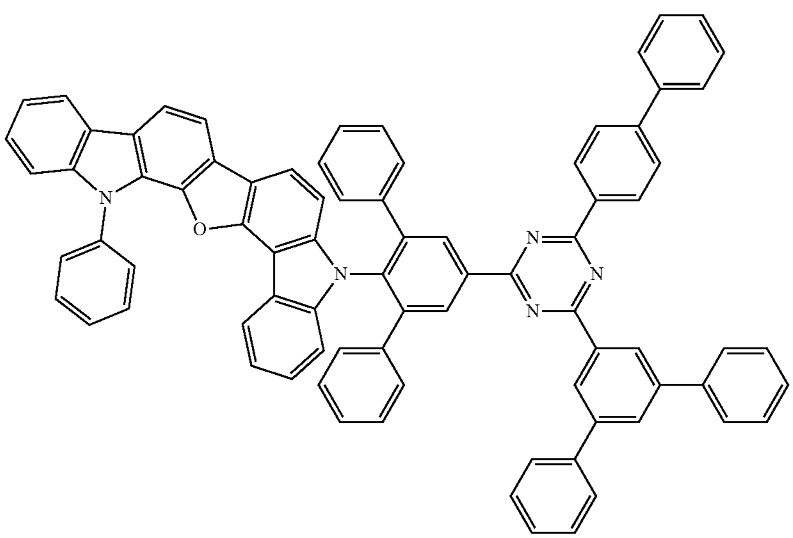

-continued
948
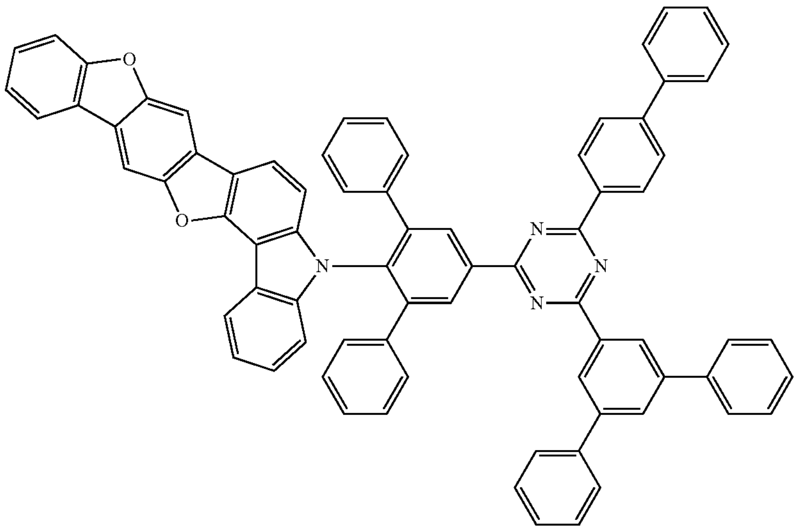
949
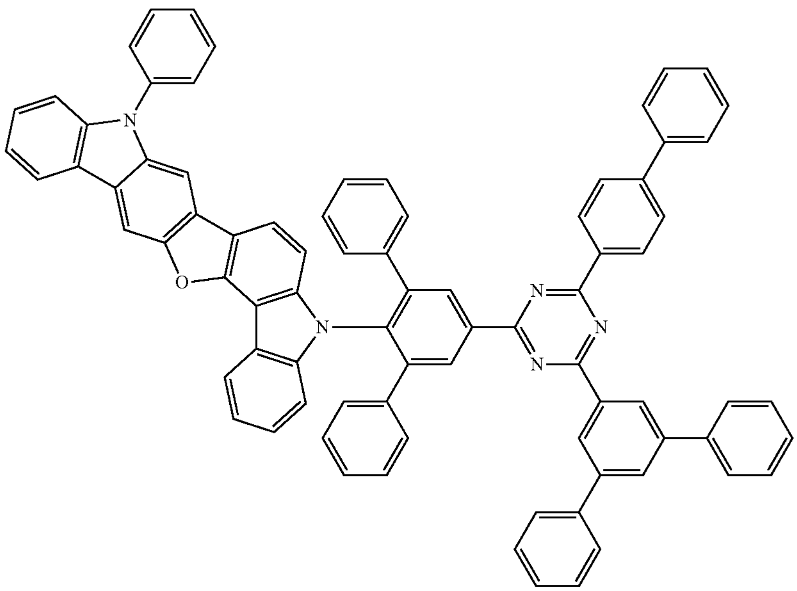
950
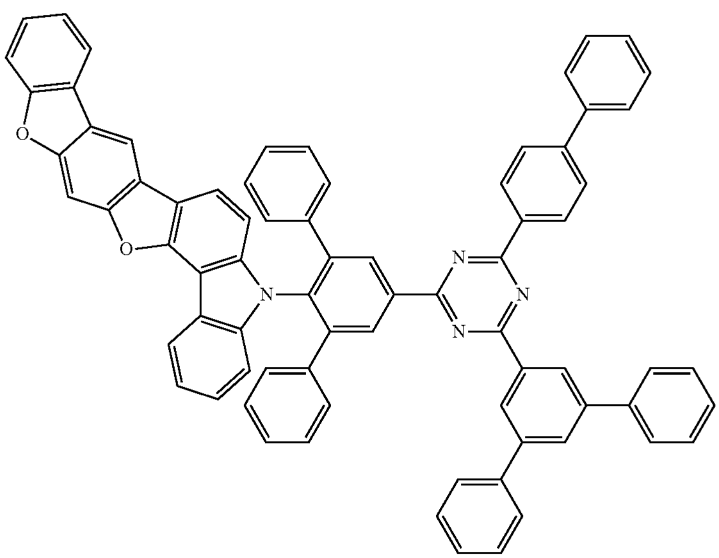

-continued
951
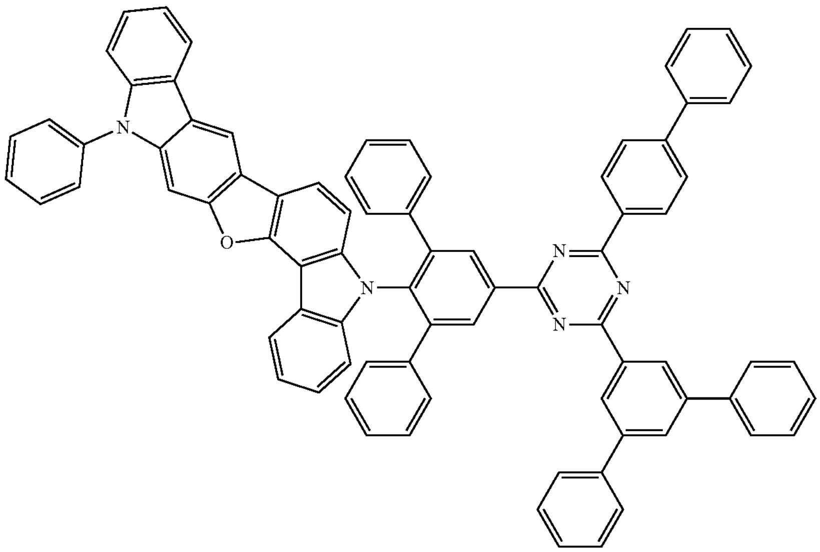
952
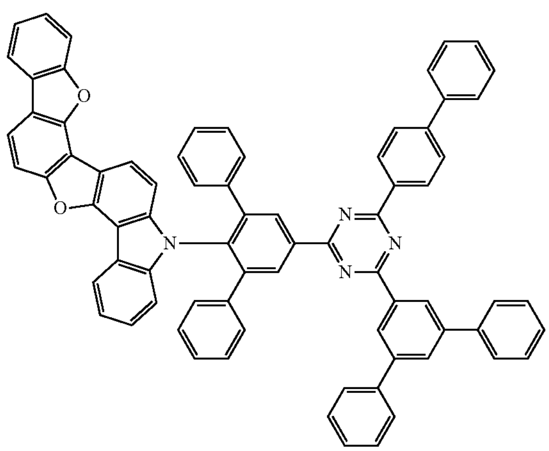
953
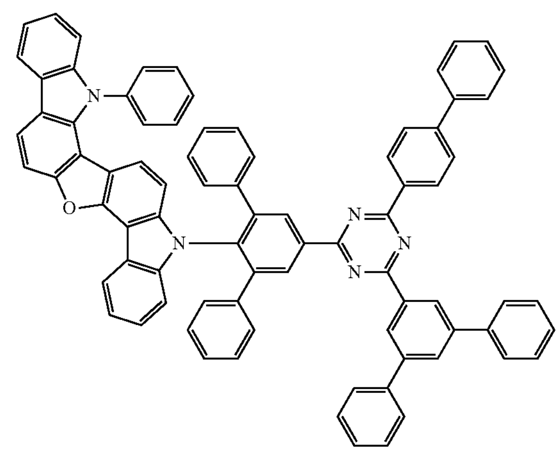
954
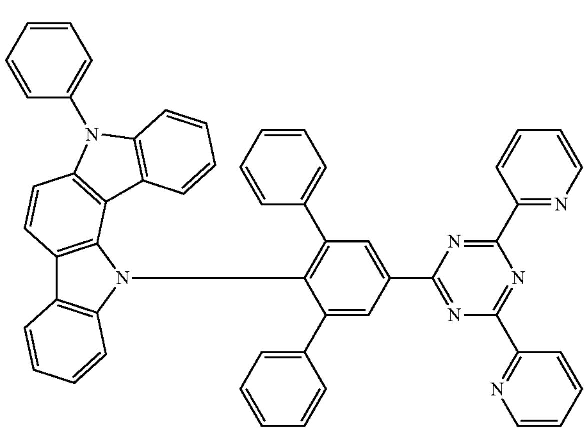

-continued
955
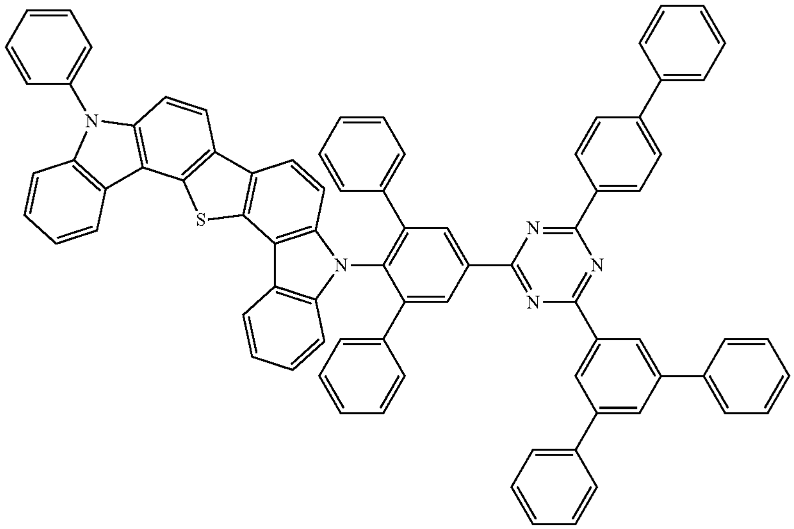
956
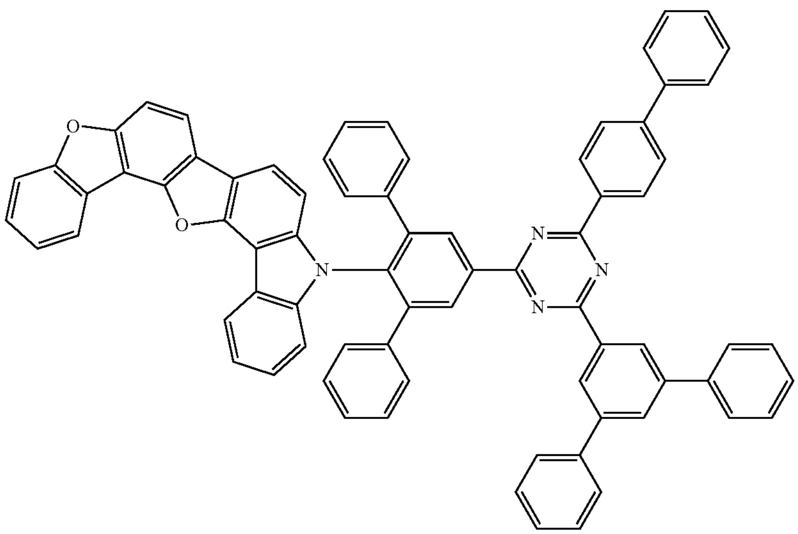
957
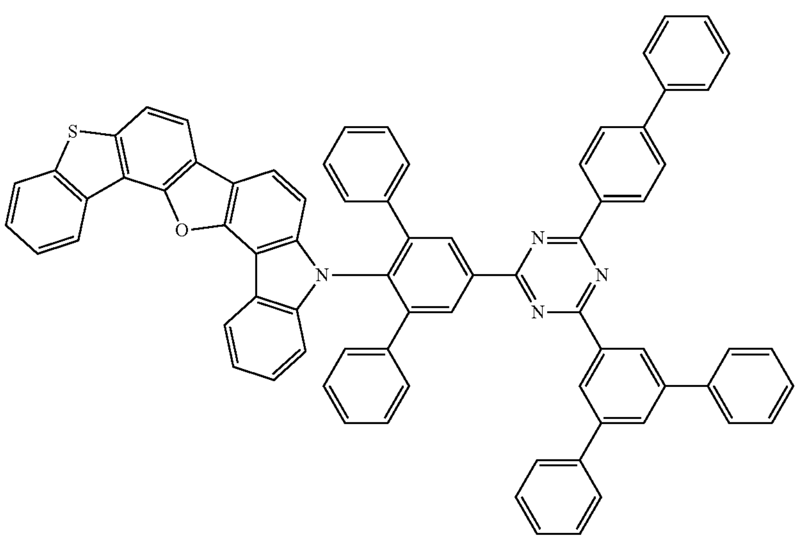

-continued
958
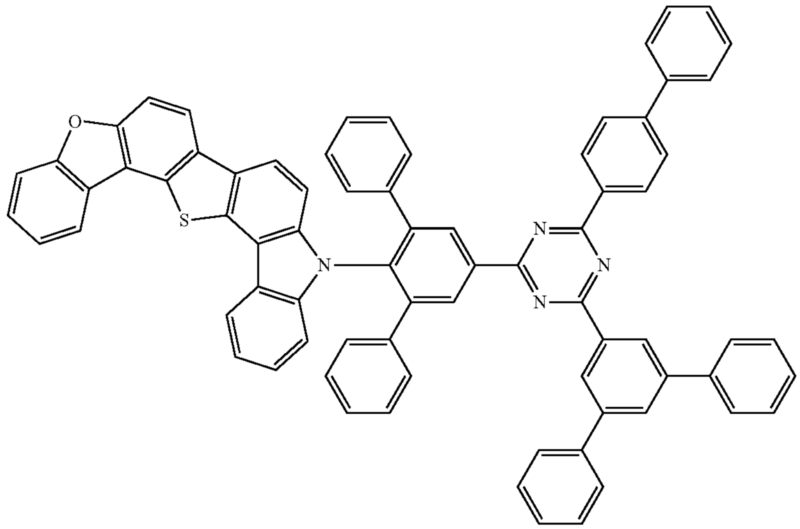
959
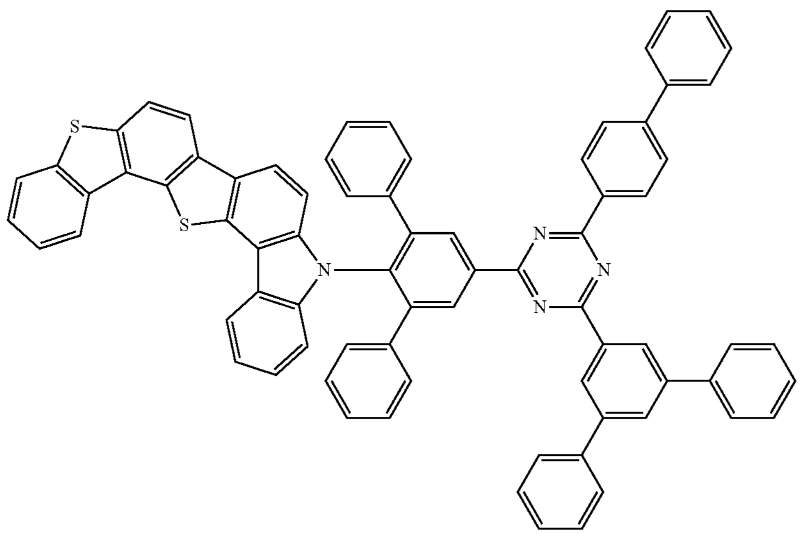
960
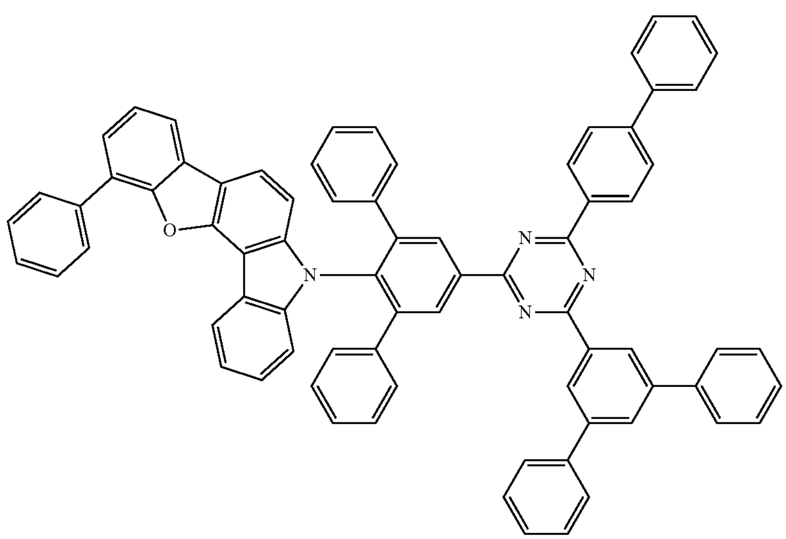

-continued
961
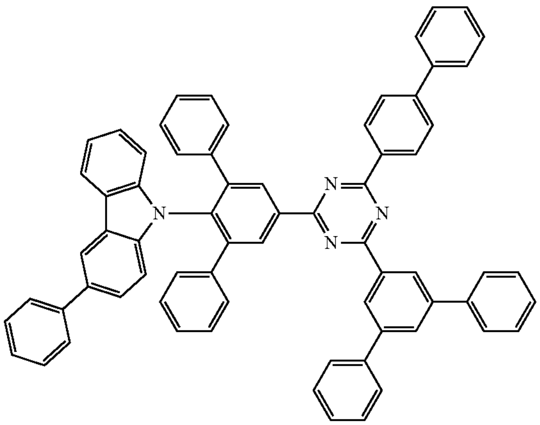
962
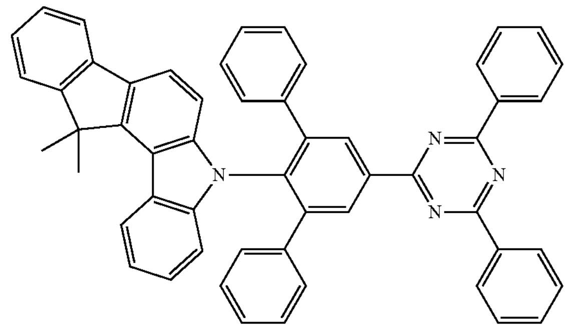
963
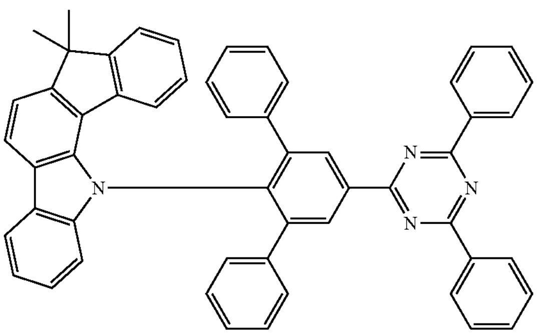
964
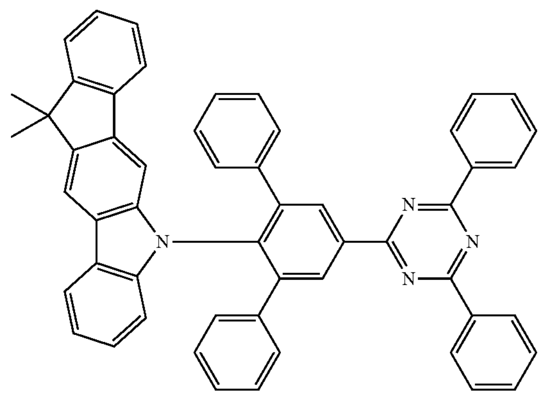
965
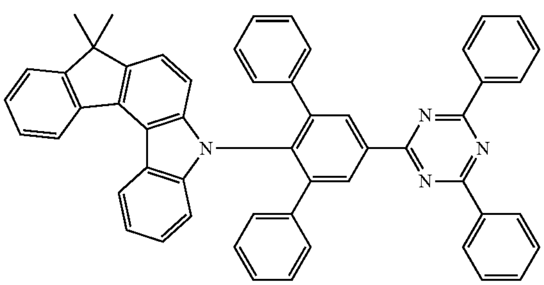
966
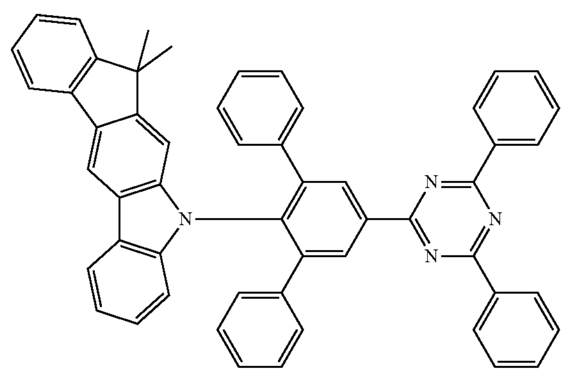
967
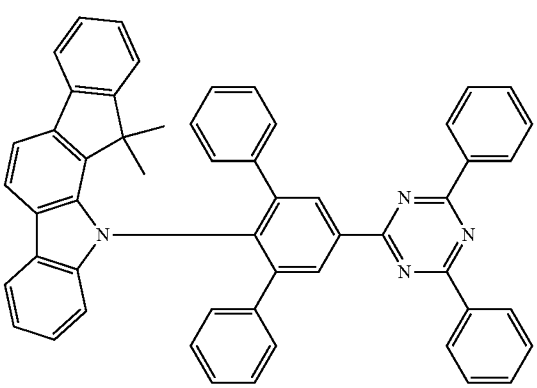
968
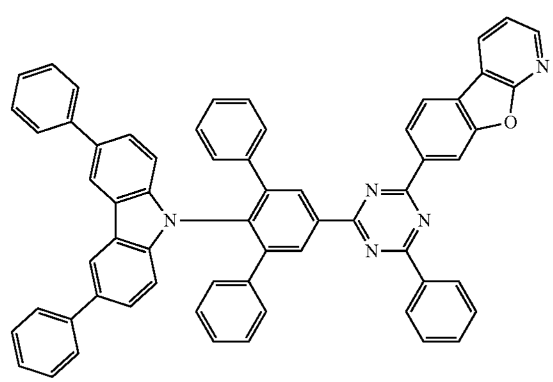

-continued
969
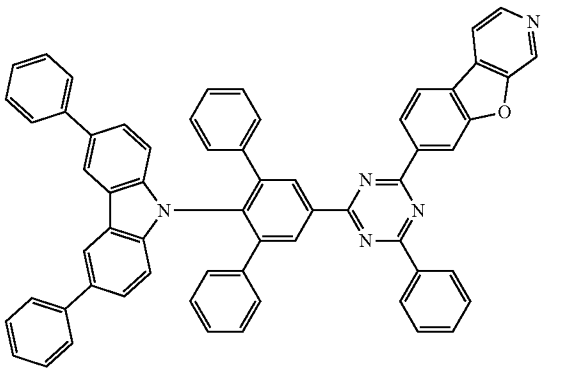
970
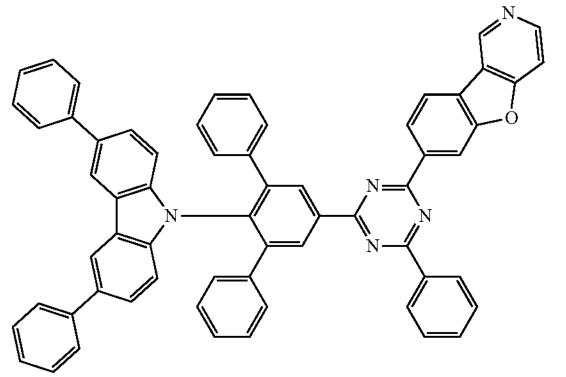
971
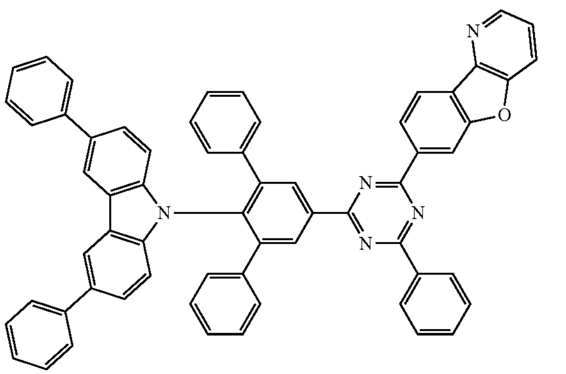
972
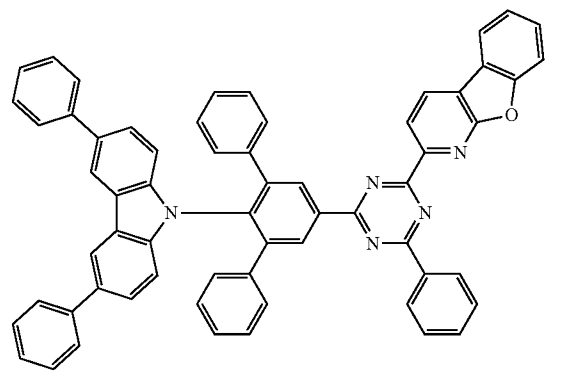
973
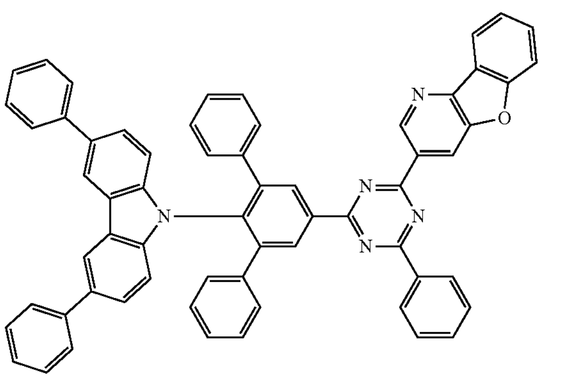
974
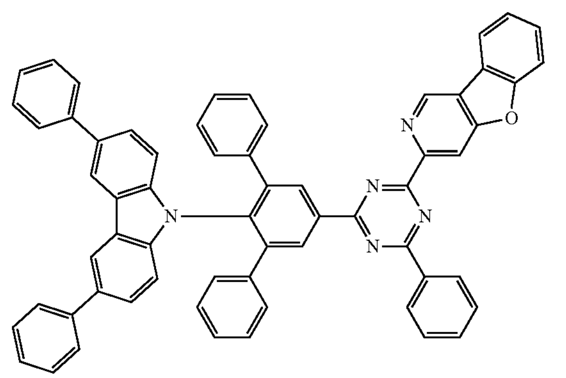
975
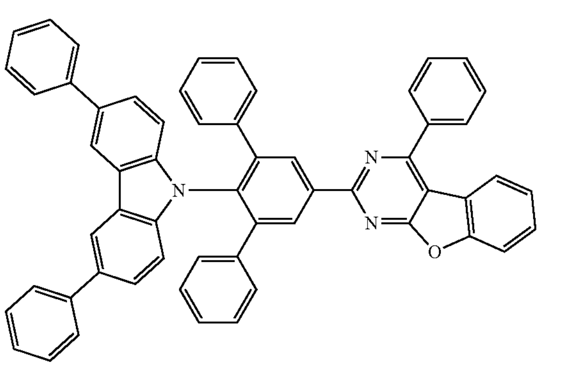
976
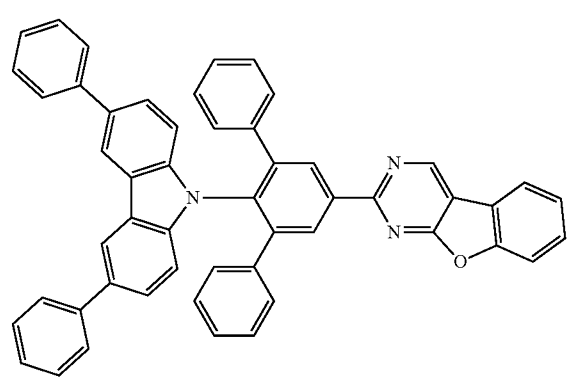

-continued
977
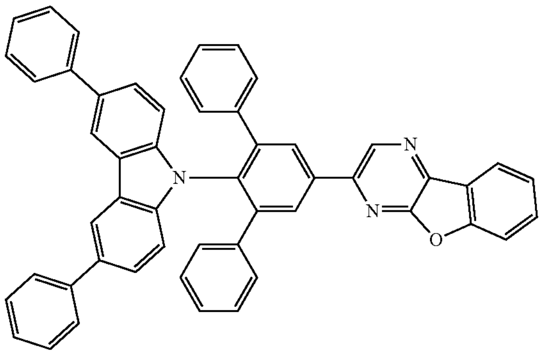
978
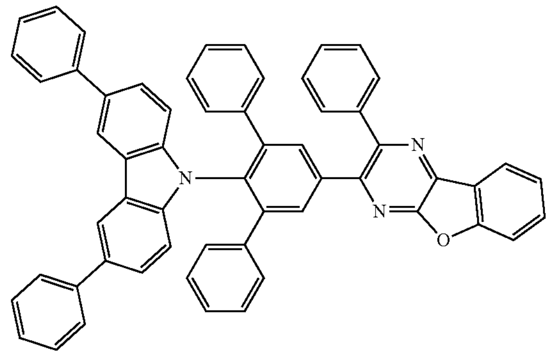
979
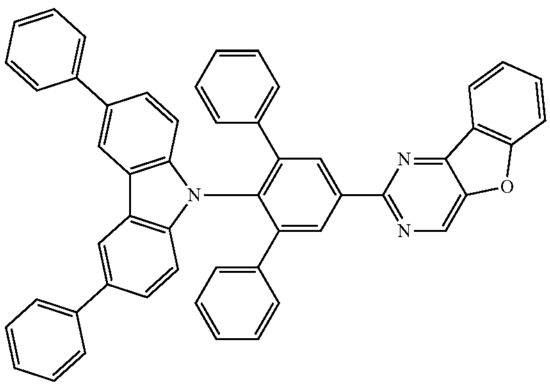
980
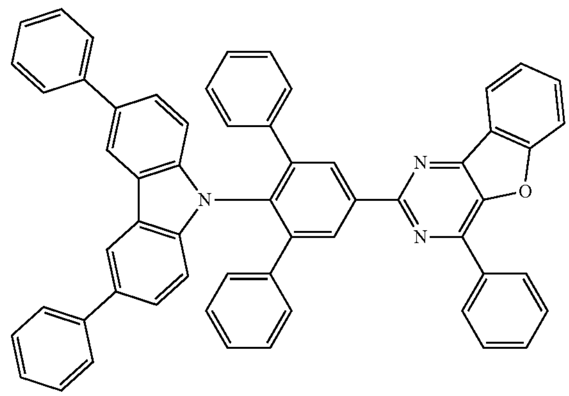
981
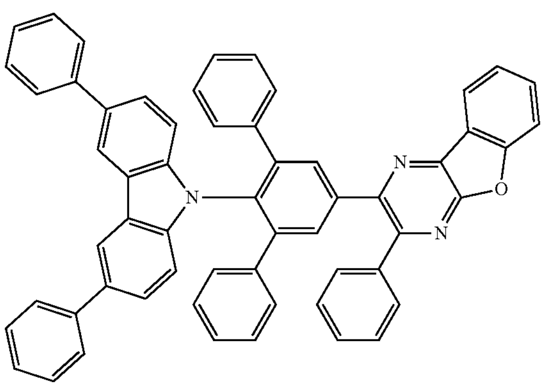
982
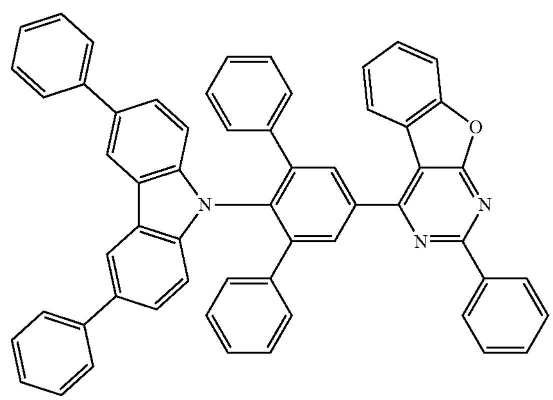
983
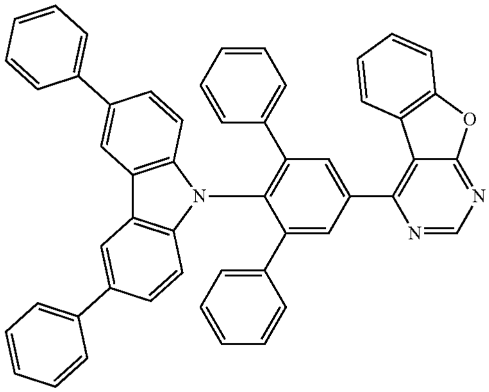

-continued
984
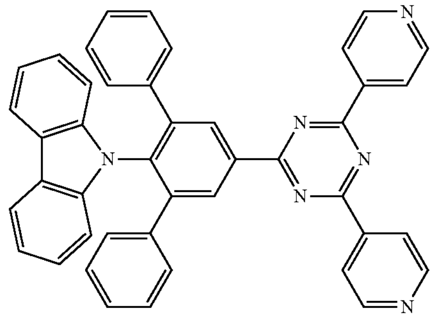
985
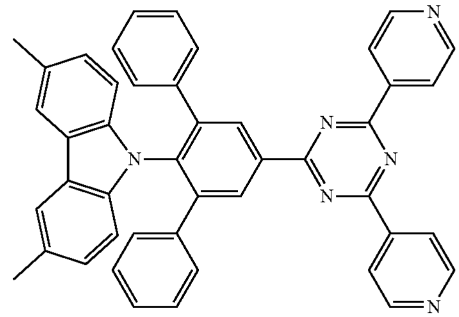
986
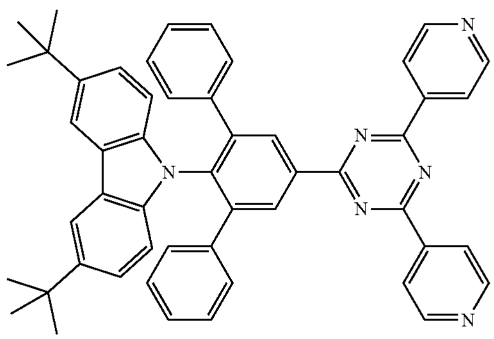
987
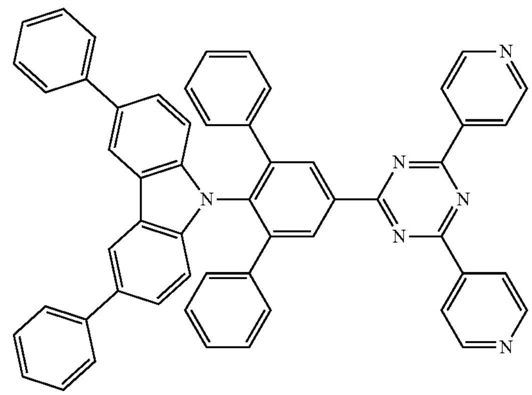
988
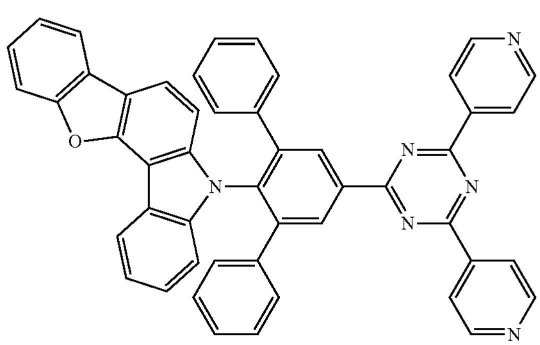
989
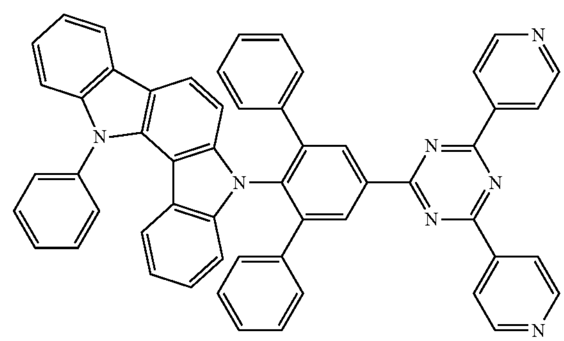
990
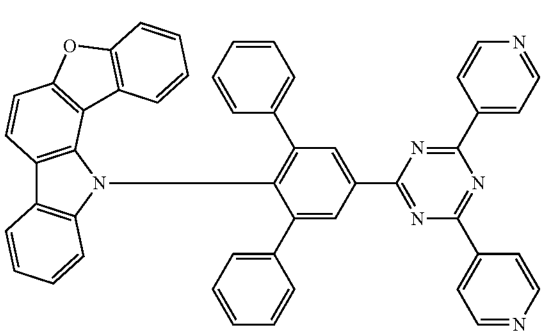
991
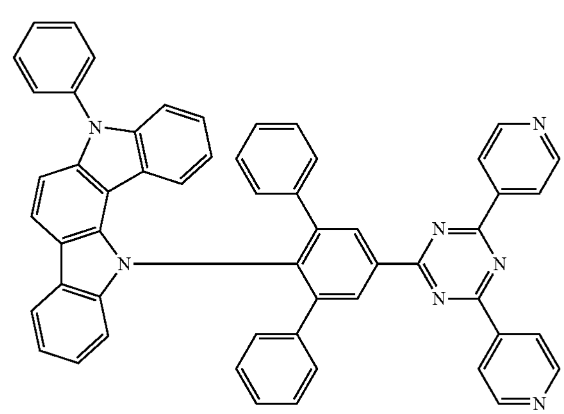

-continued
992
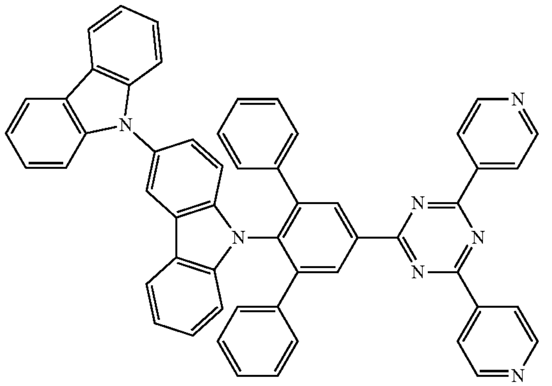
993
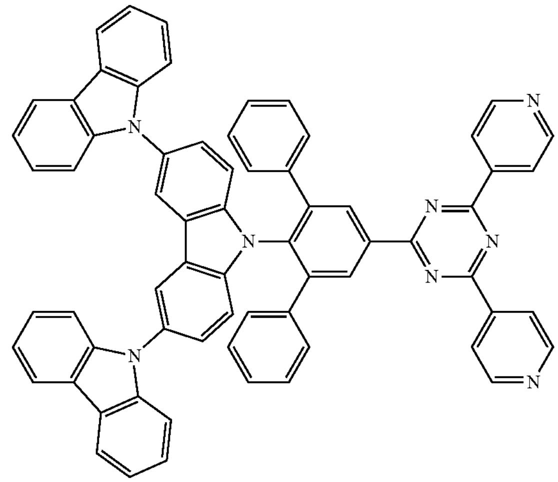
994
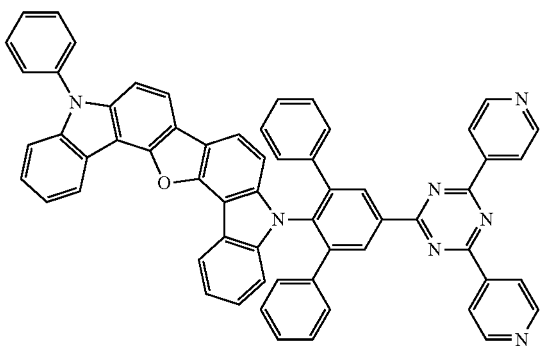
995
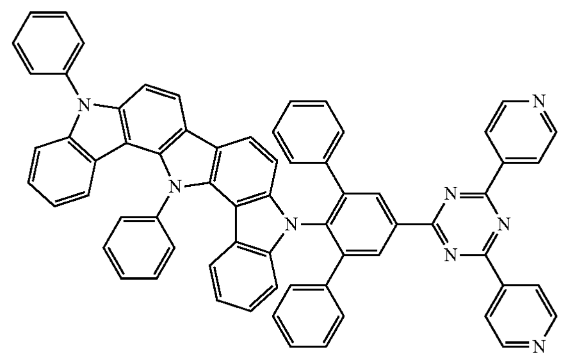
996
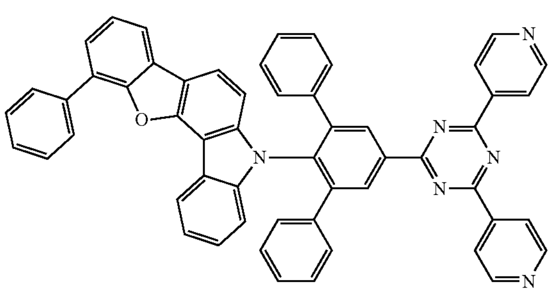
997
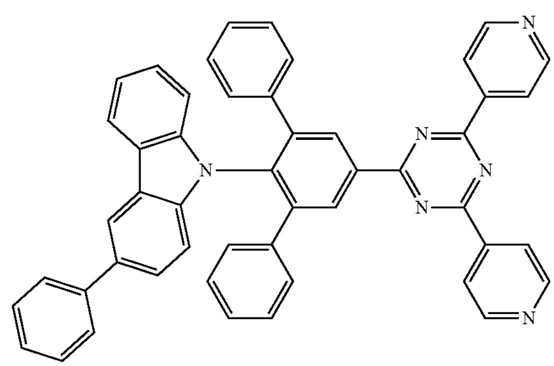
998
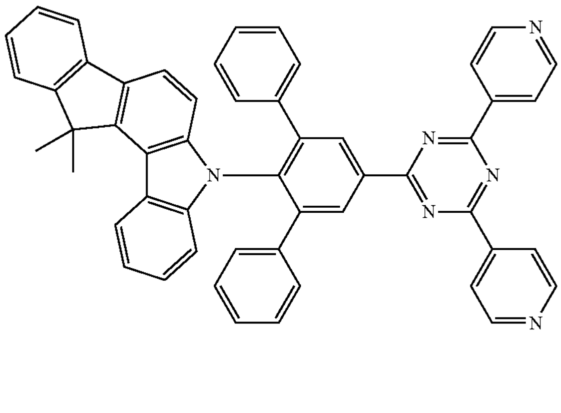
999
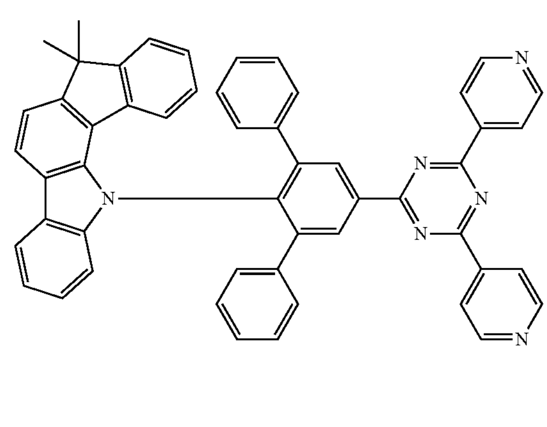

-continued
1000
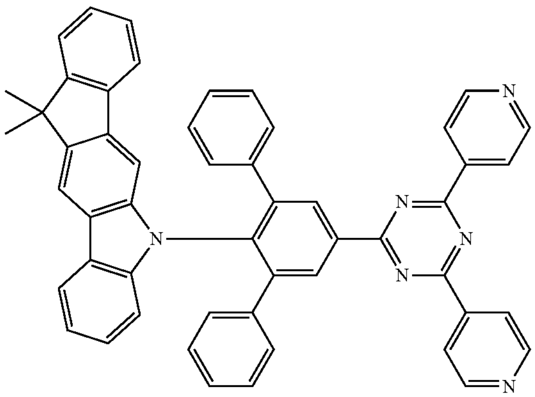
1001
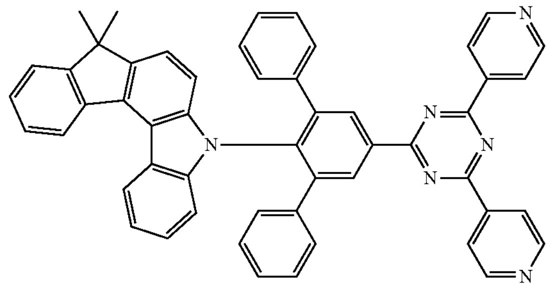
1002
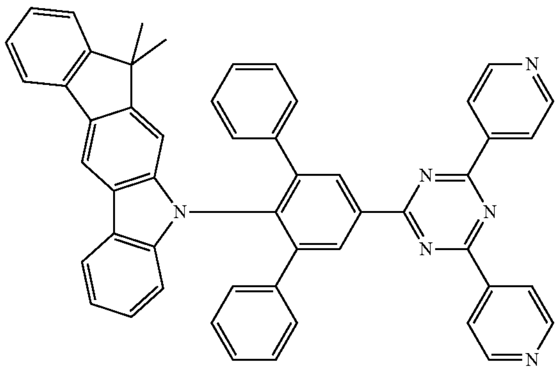
1003
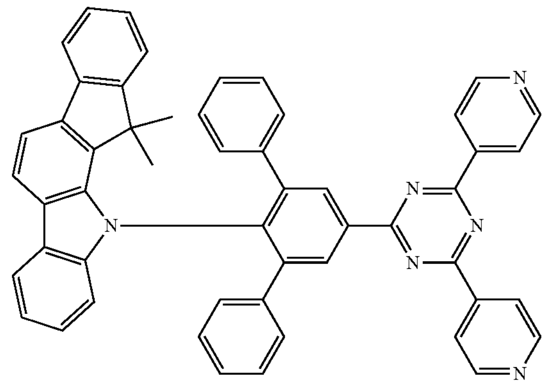
1004
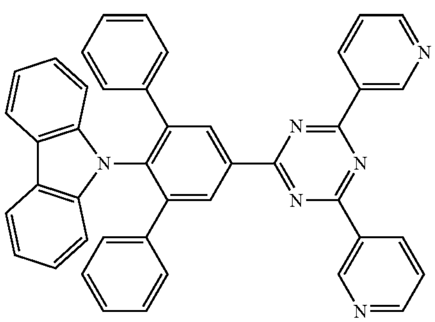
1005
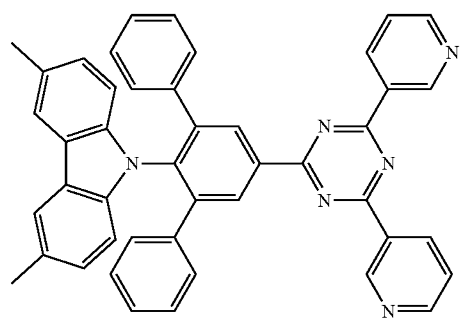
1006
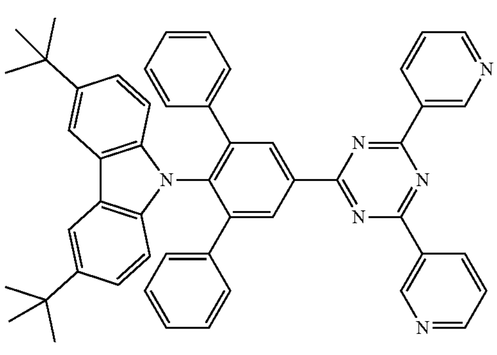
1007
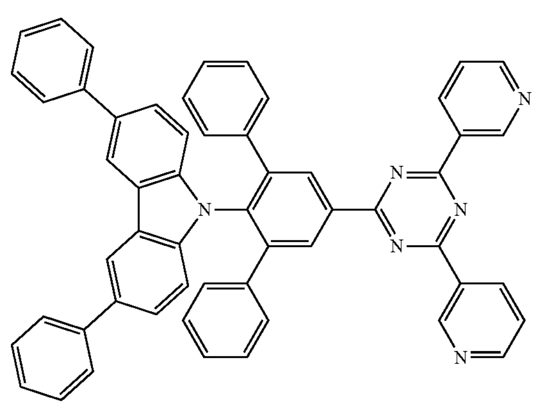

-continued
1008
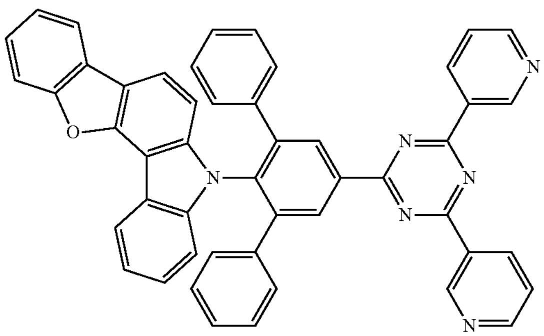
1009
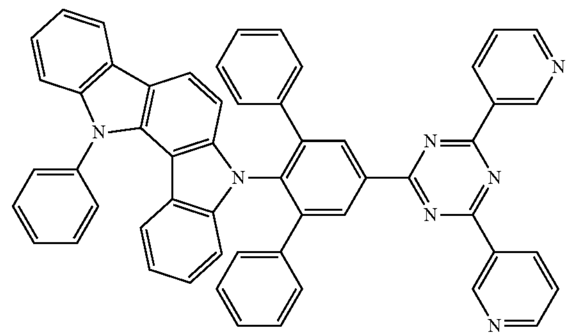
1010
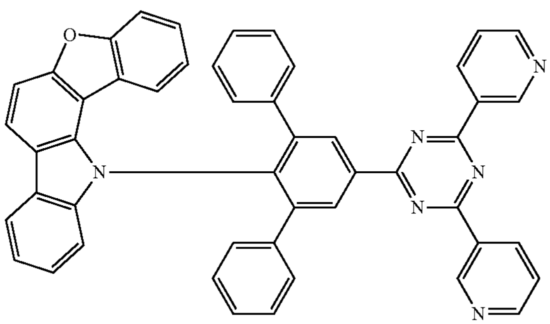
1011
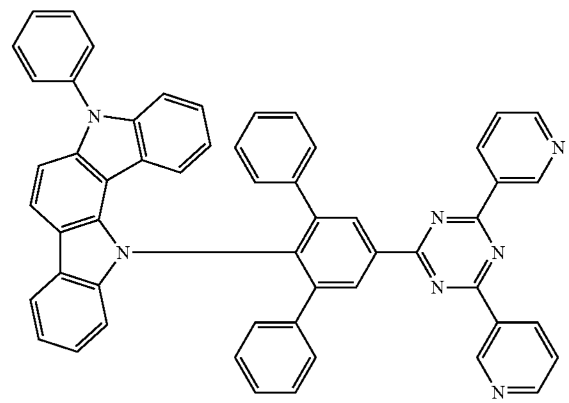
1012
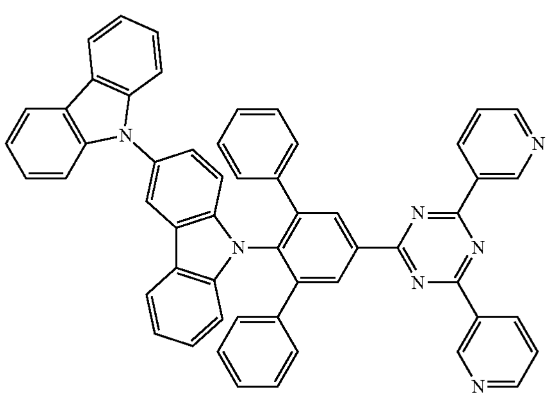
1013
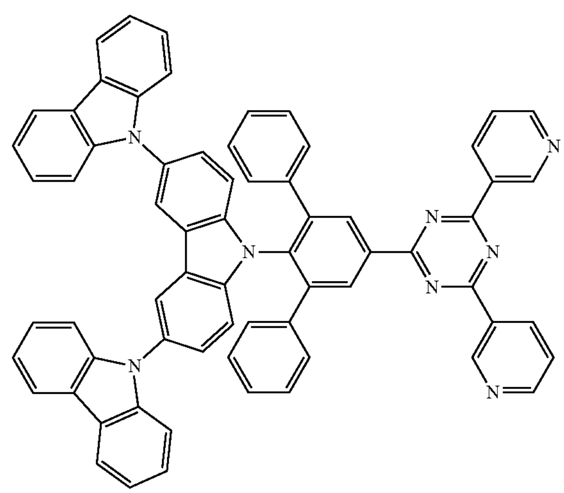
1014
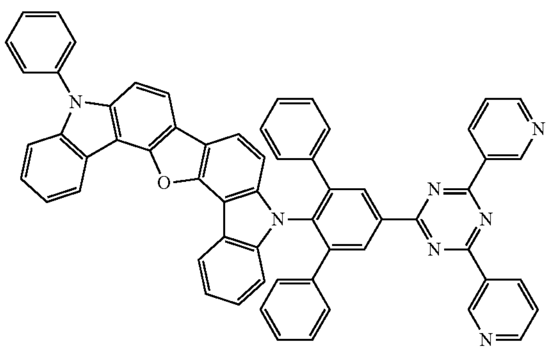
1015
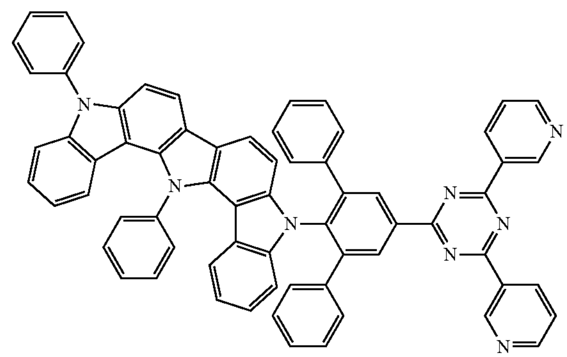

-continued
1016
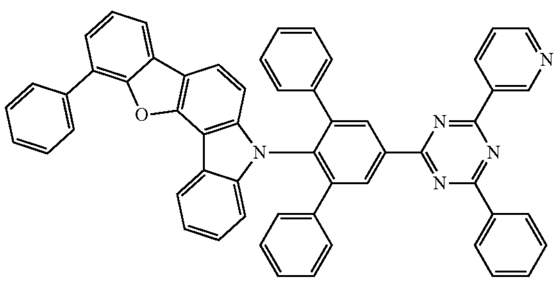
1017
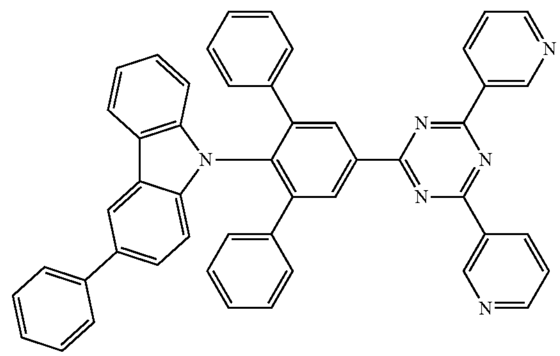
1018
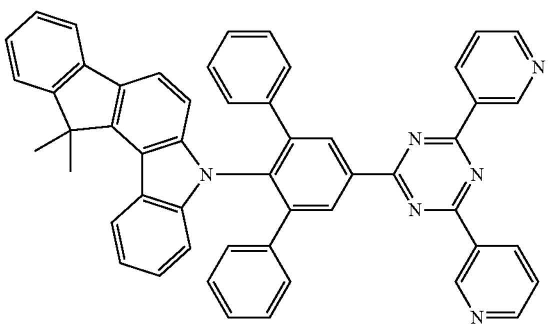
1019
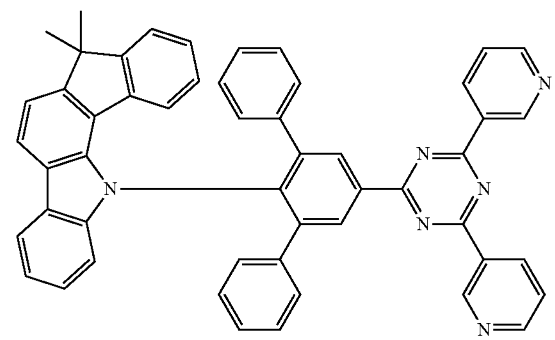
1020
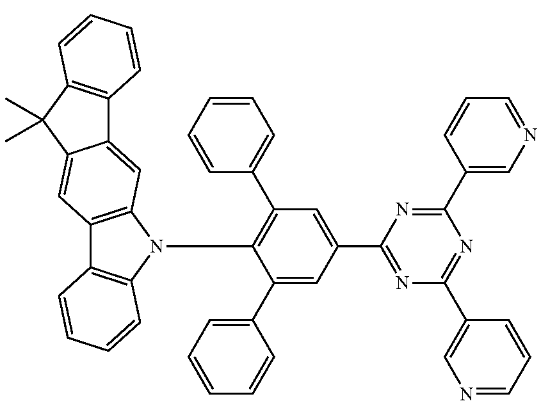
1021
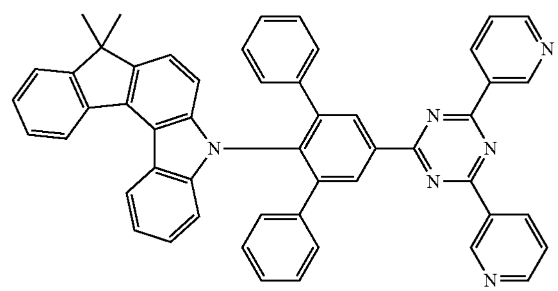
1022
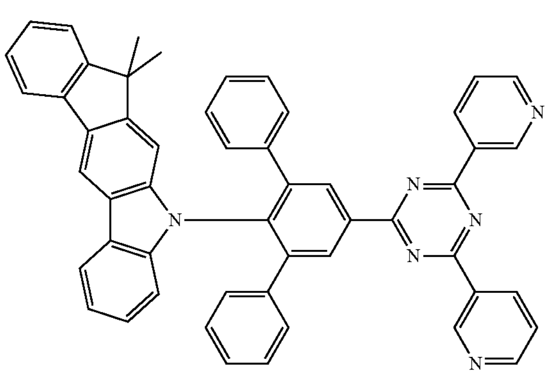
1023
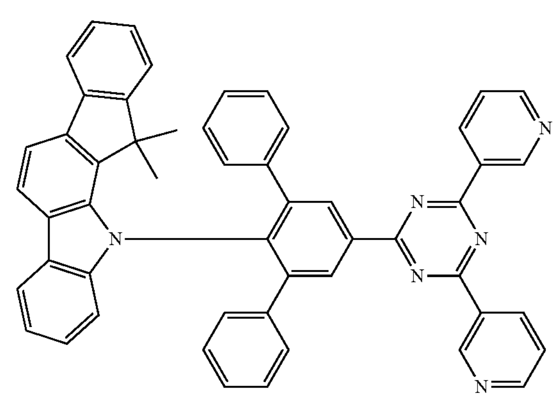

-continued
1024
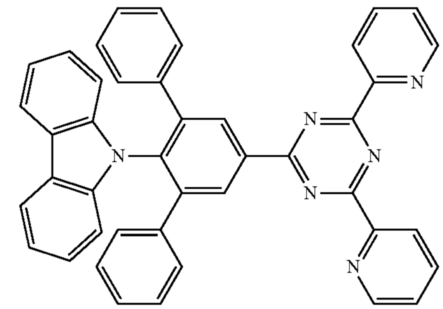
1025
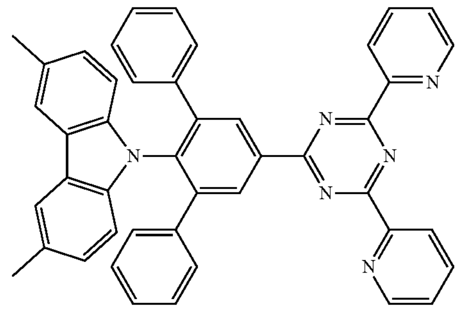
1026
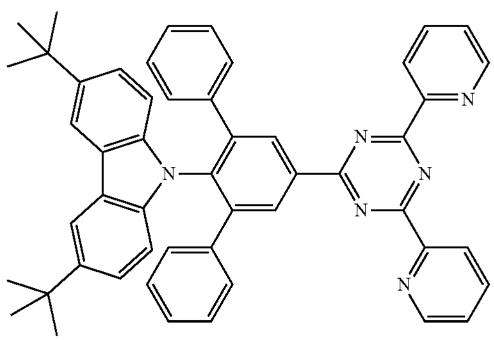
1027
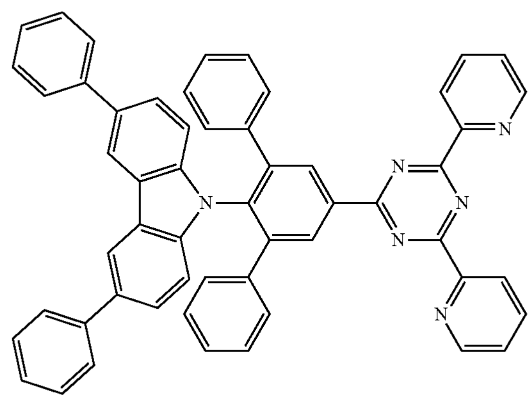
1028
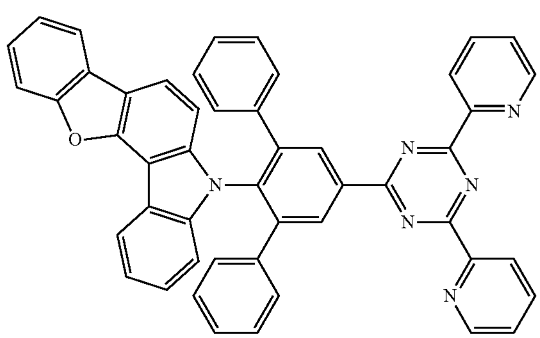
1029
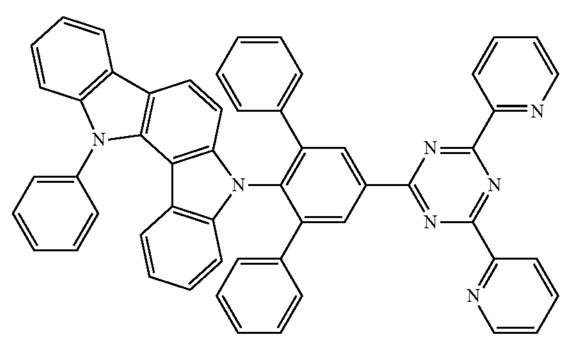
1030
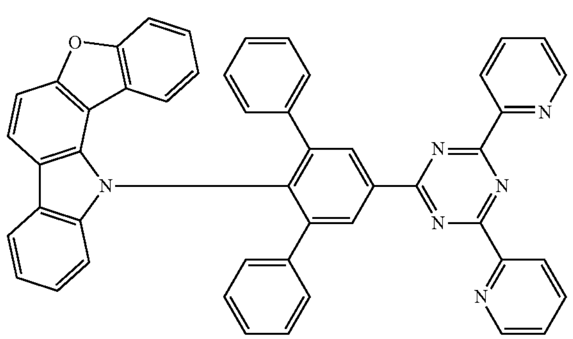

Group X
1
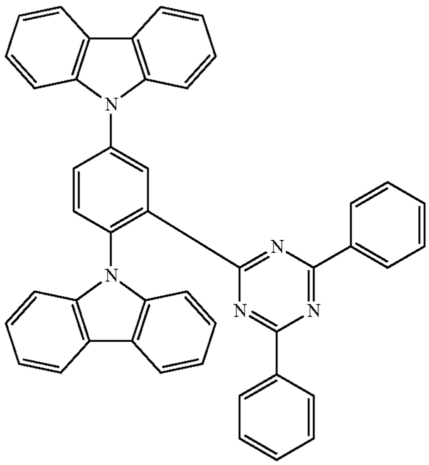
2
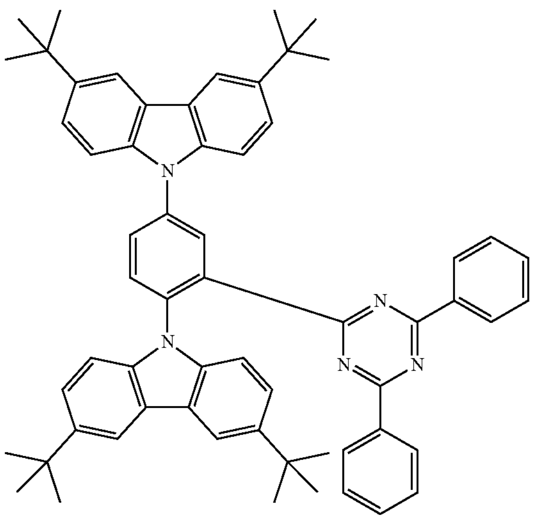
3
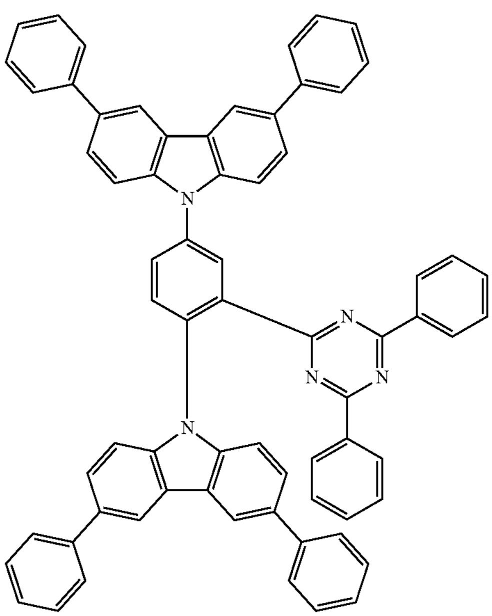
-continued
4
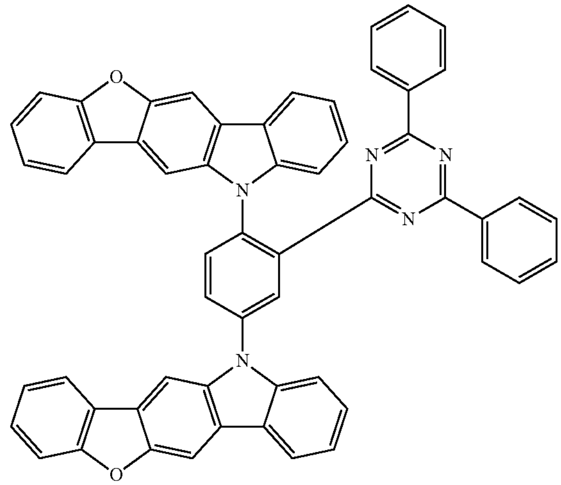
5
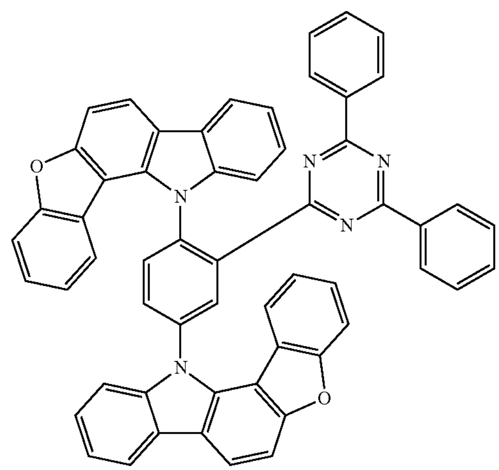
6
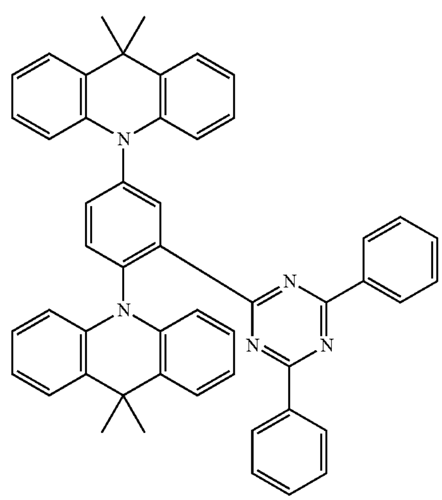

-continued
7
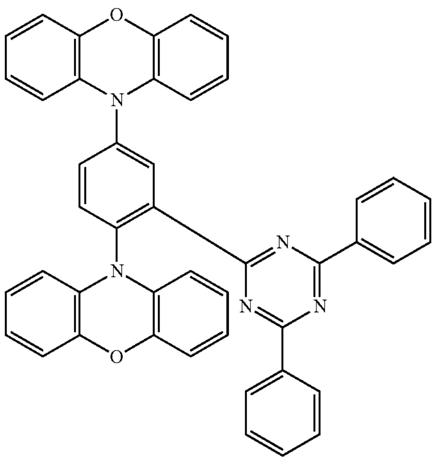
8
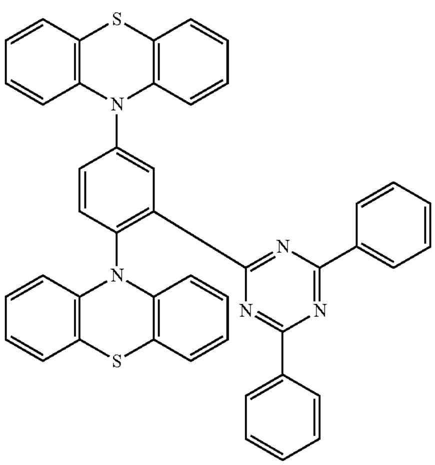
9
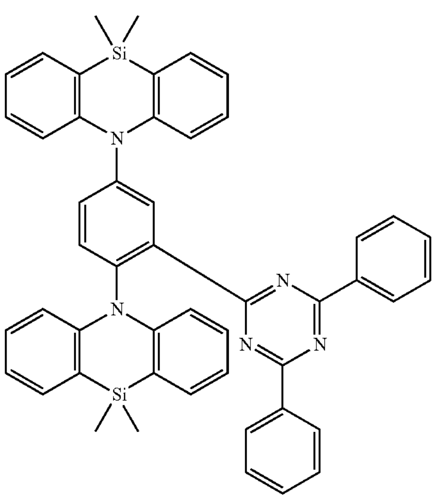
-continued
10
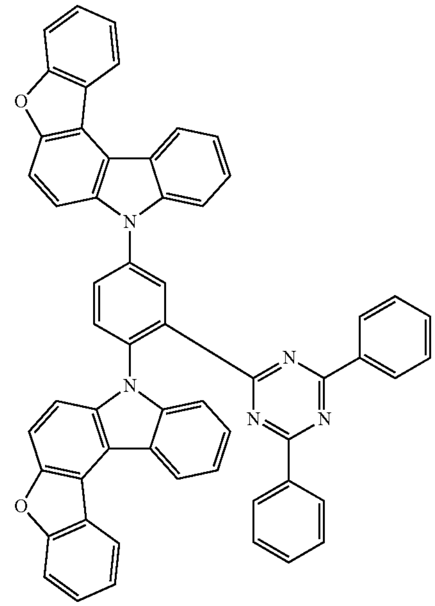
11
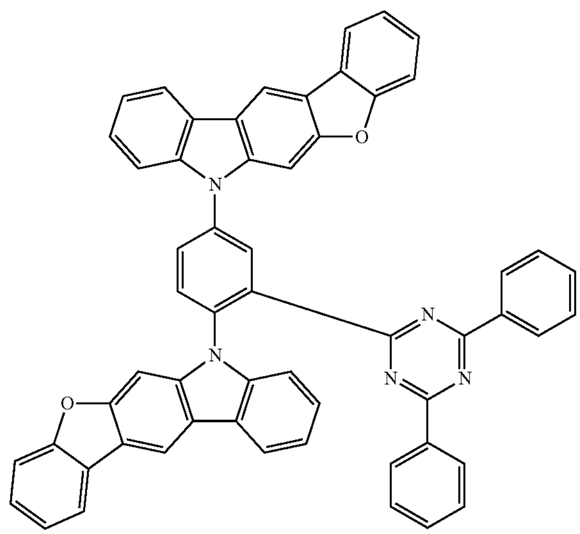
12
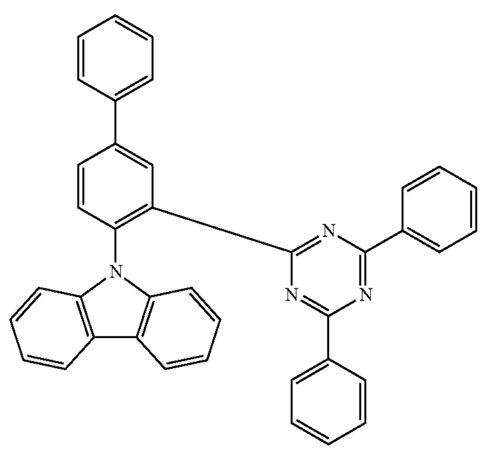

-continued
13
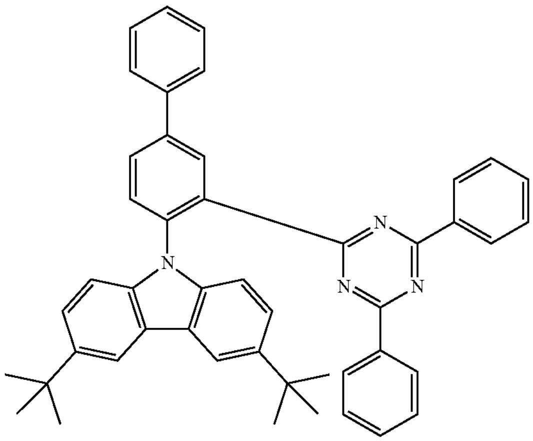
14
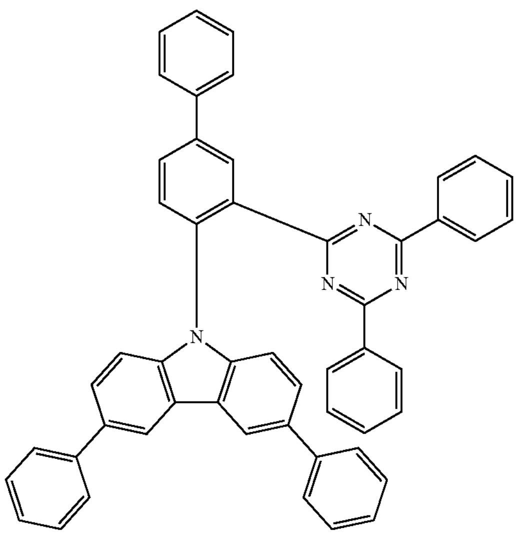
15
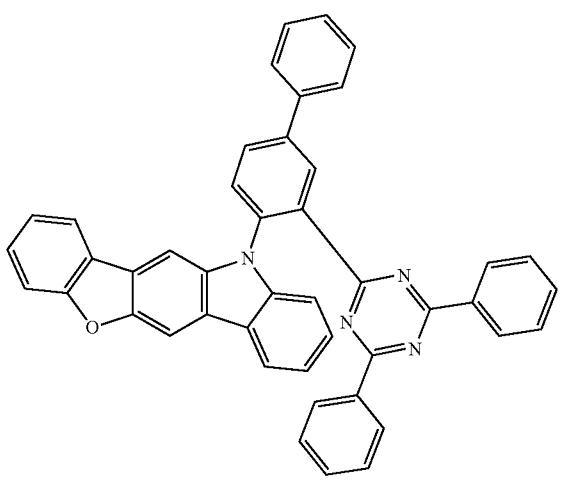
-continued
16
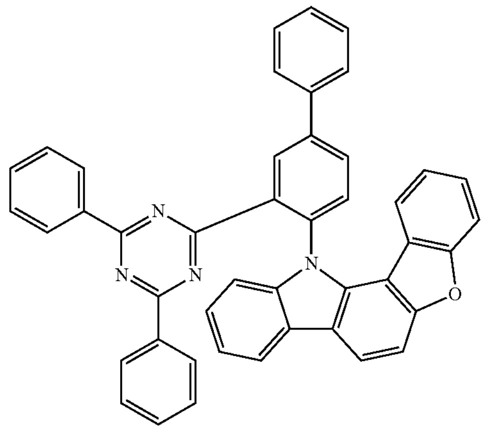
17
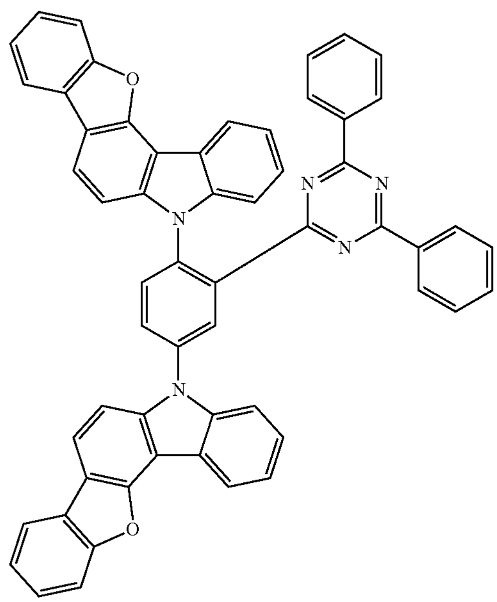
18
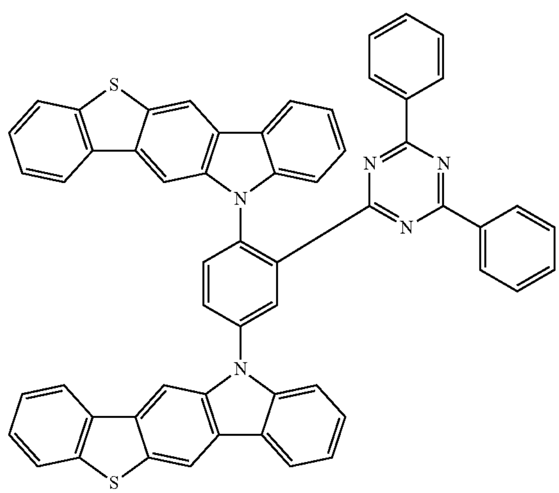

19
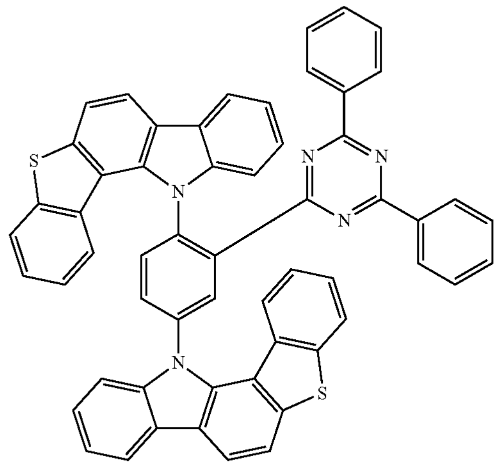
20
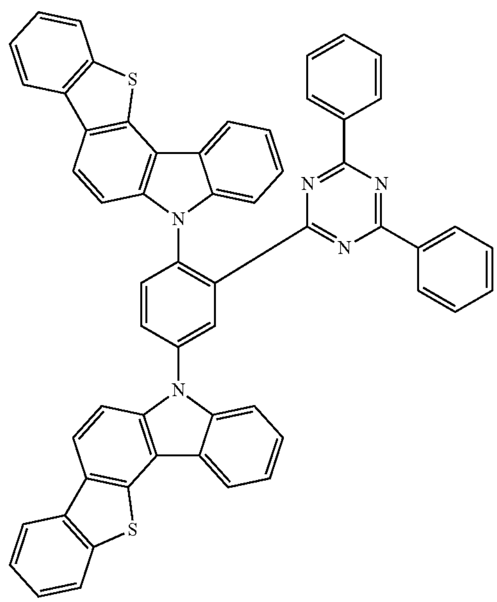
21
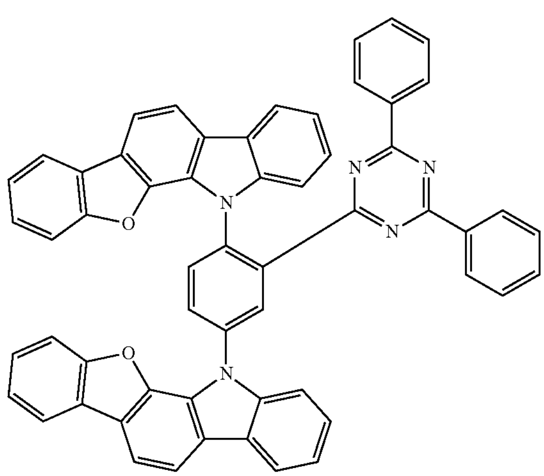
22
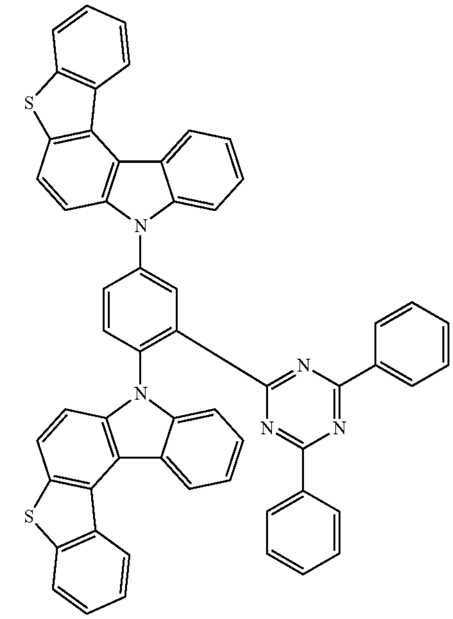
23
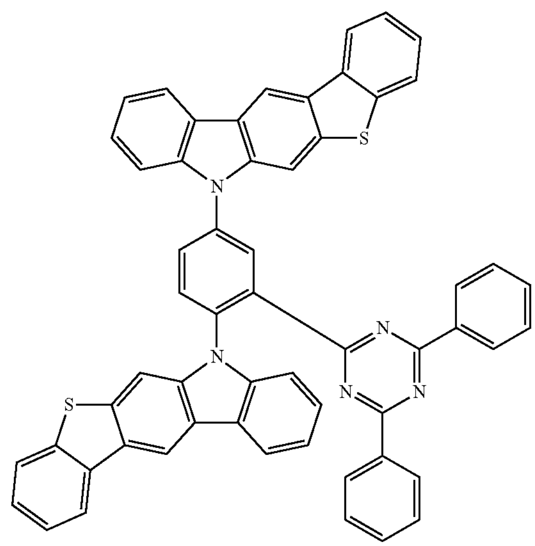
24
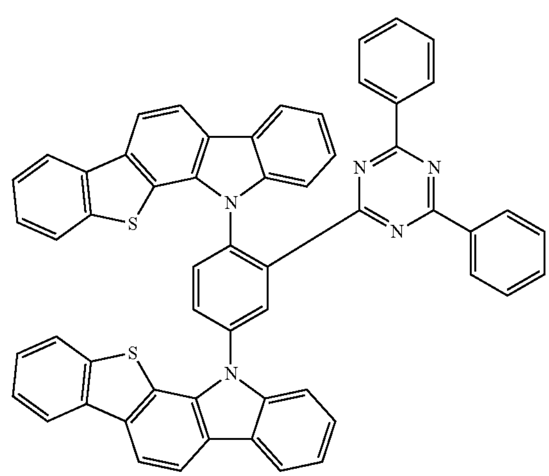

-continued
25
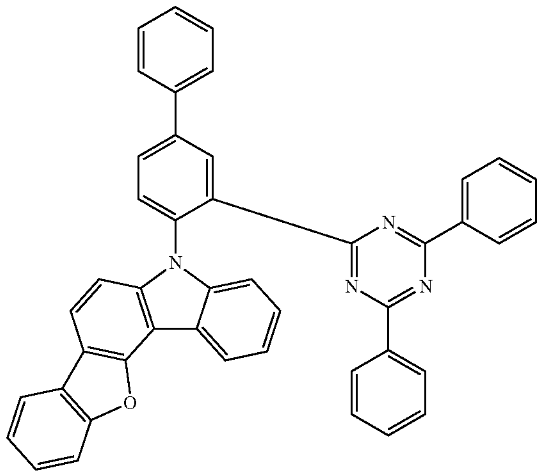
26
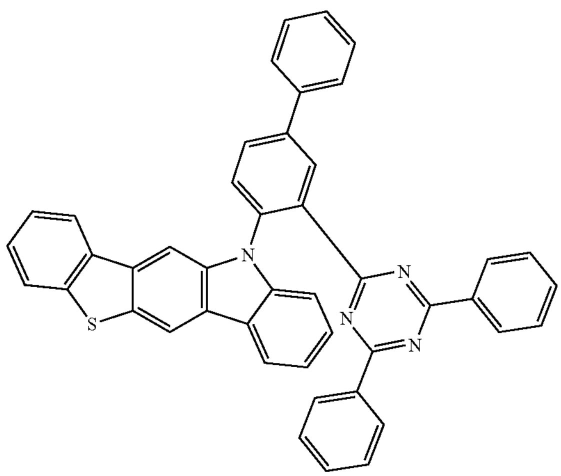
27
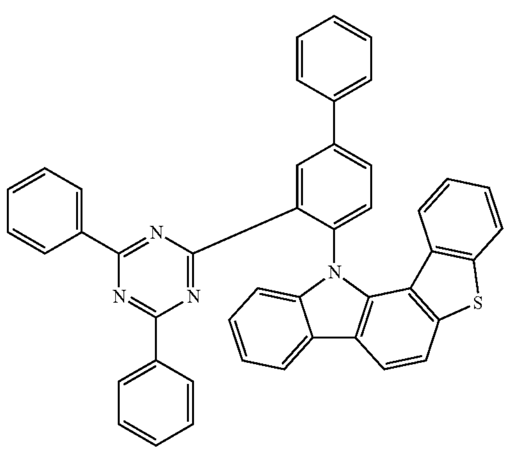
-continued
28
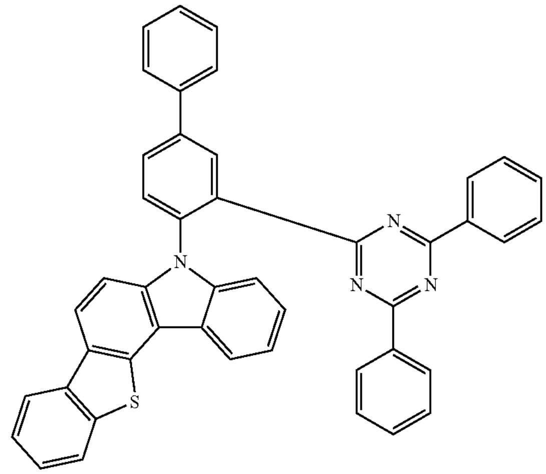
29
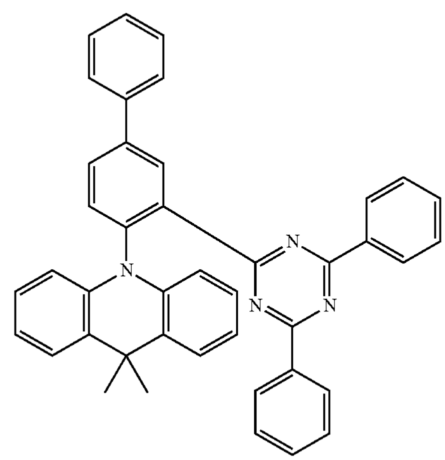
30
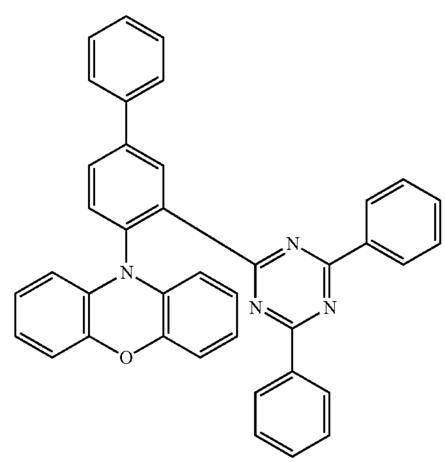

-continued
31
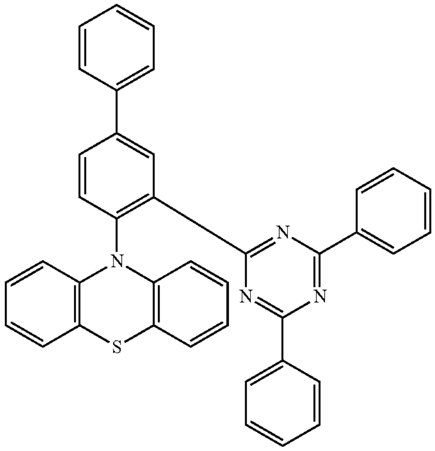
32
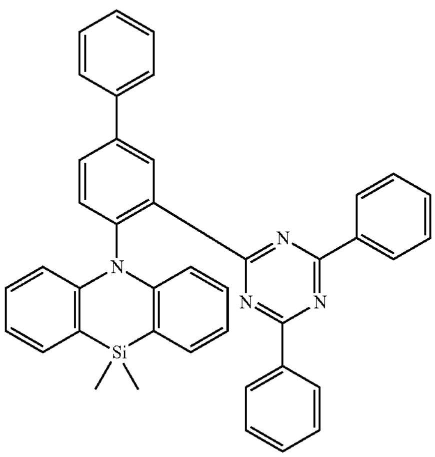
33
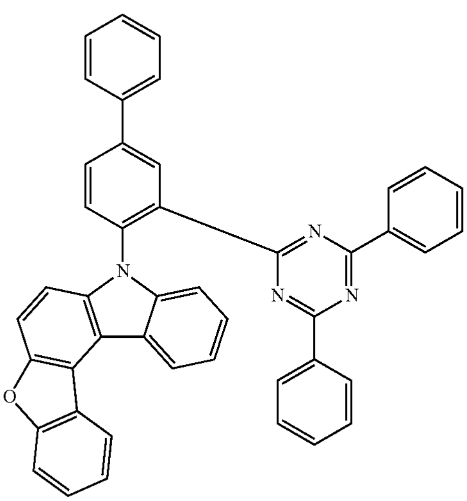
-continued
34
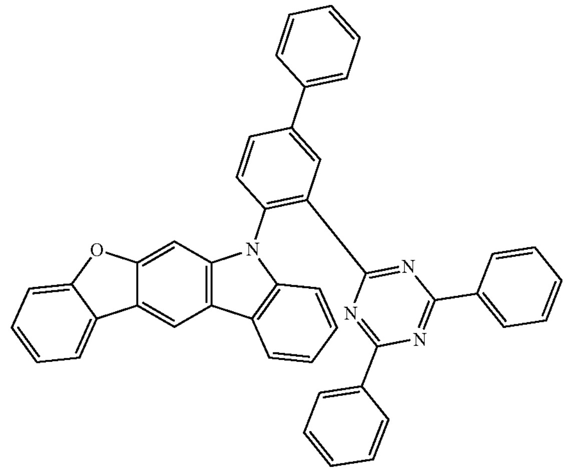
35
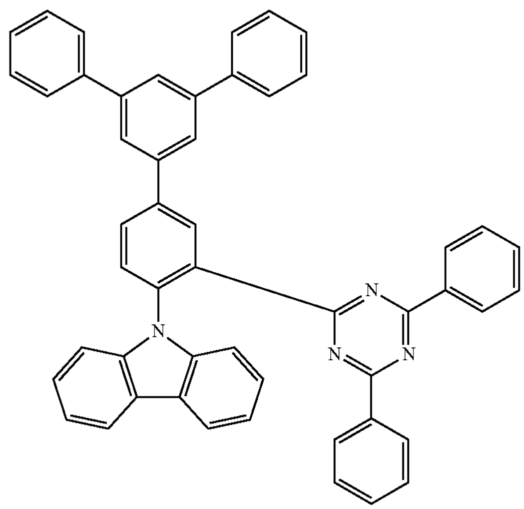
36
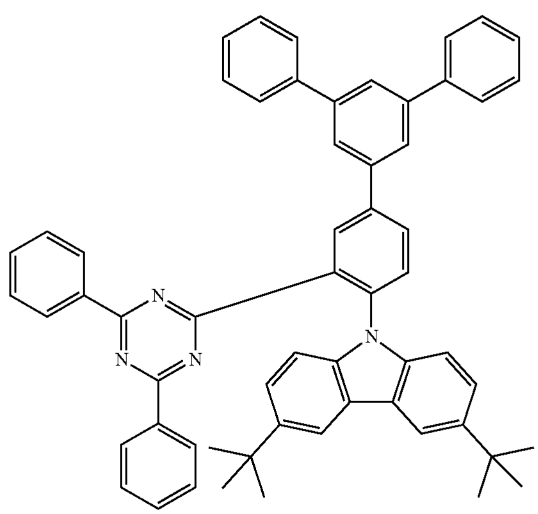

-continued
37
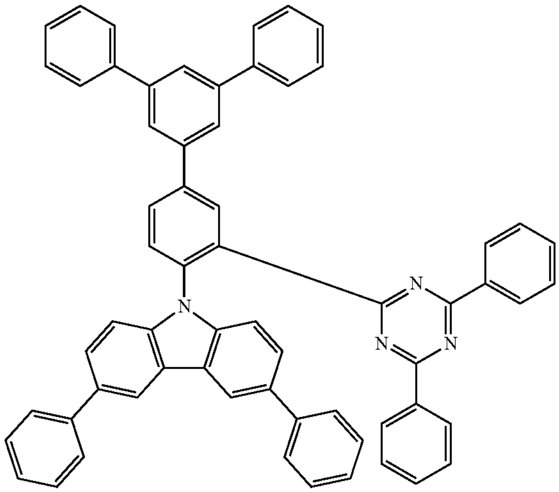
38
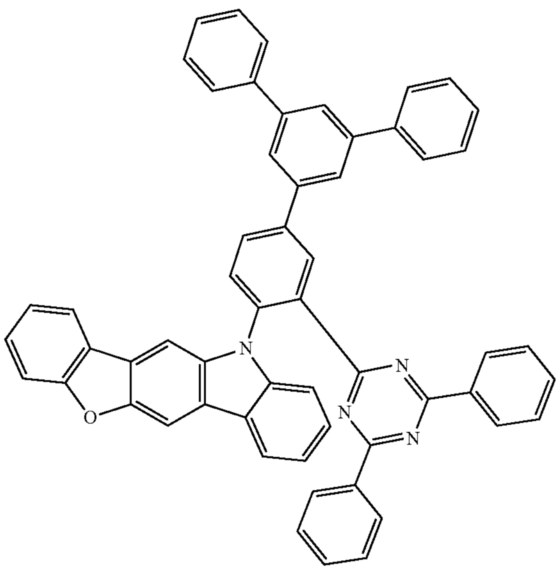
39
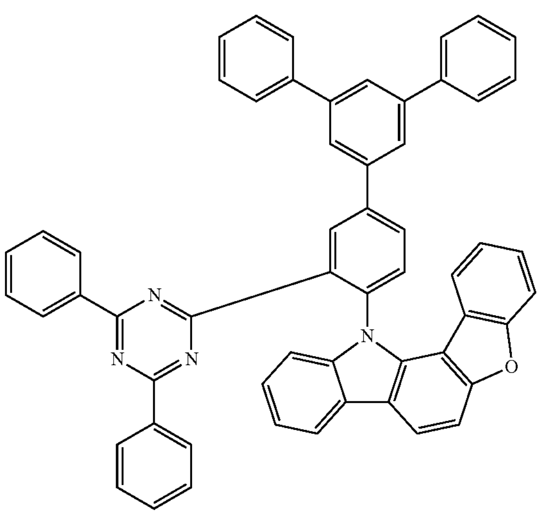
-continued
40
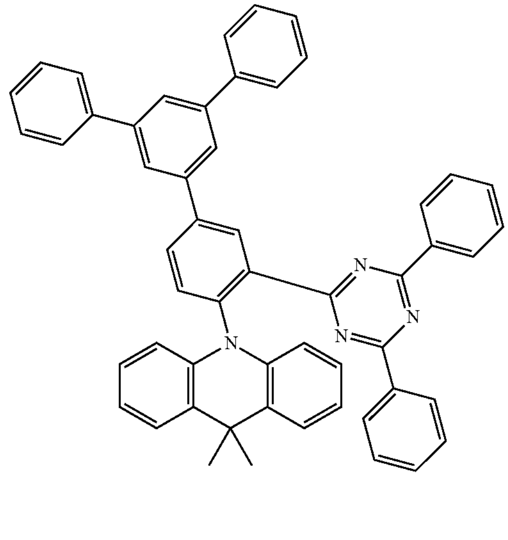
41
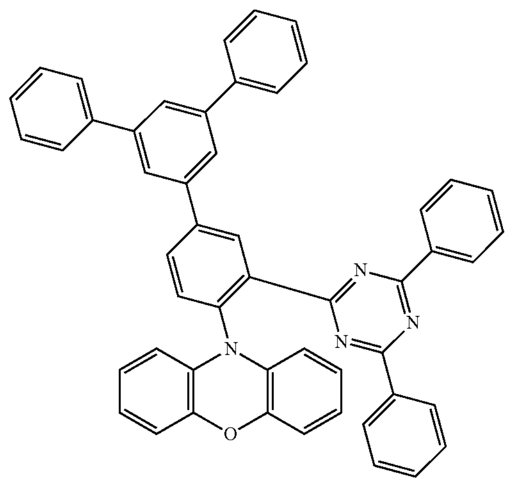
42
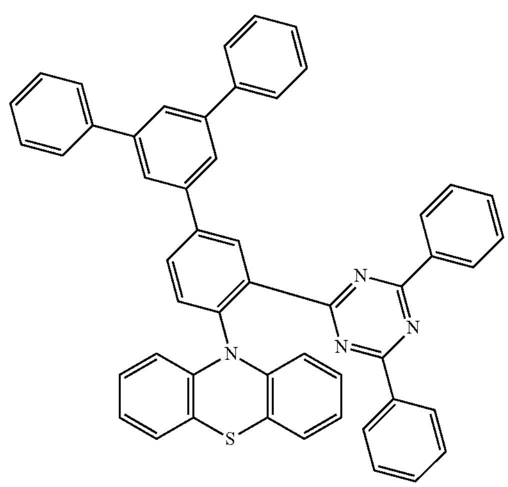

-continued
43
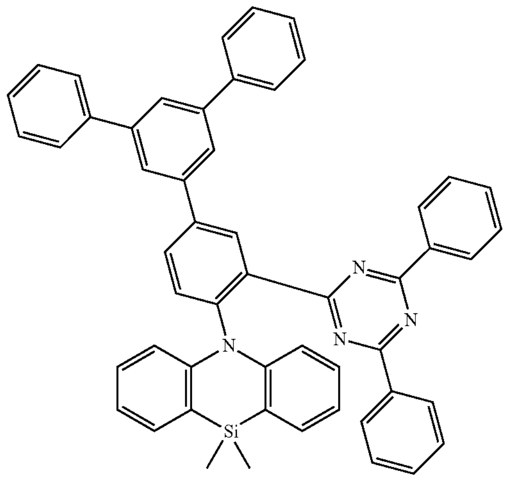
44
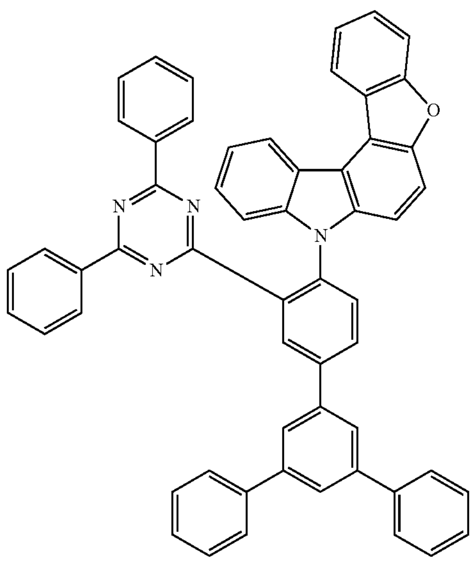
45
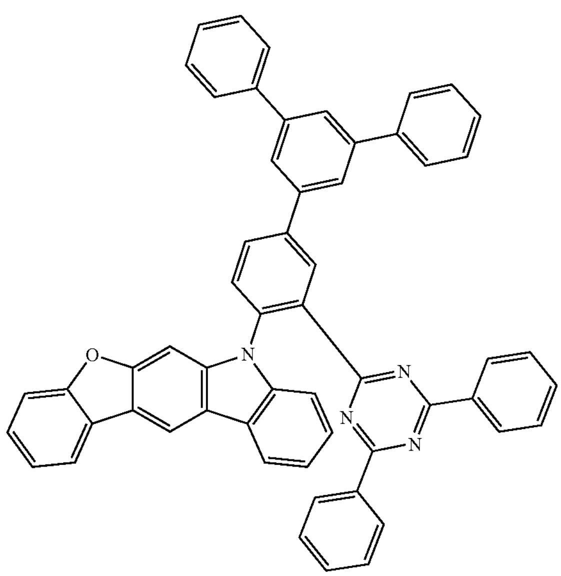
-continued
46
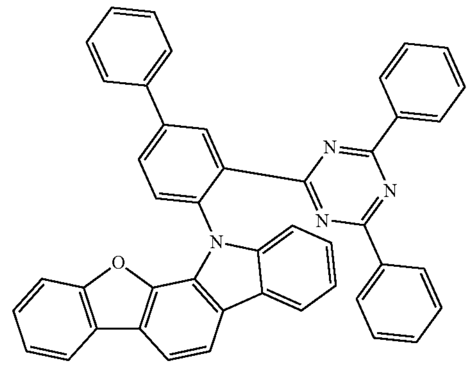
47
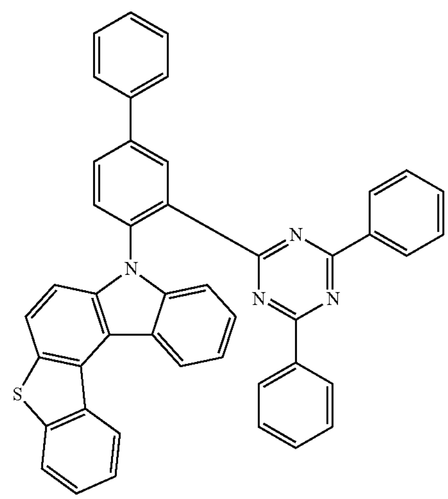
48
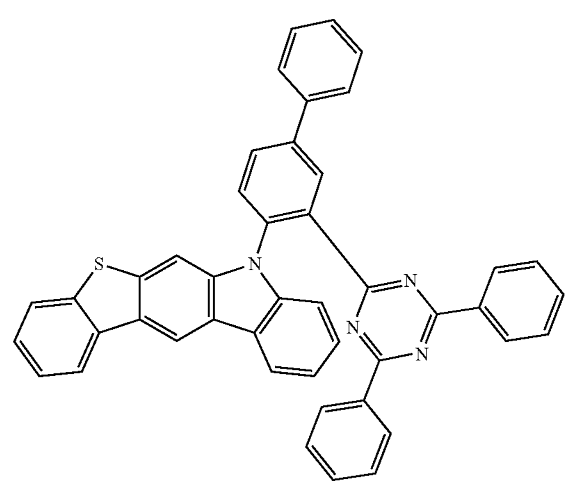

-continued
49
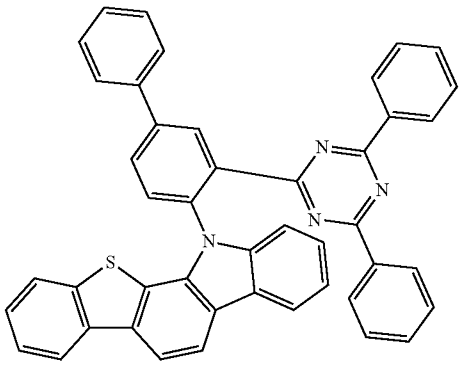
50
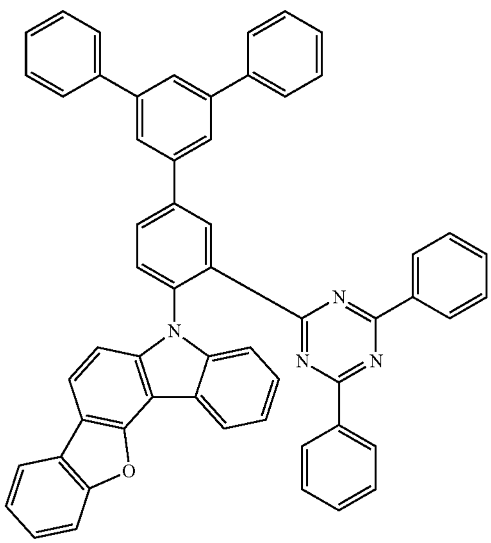
51
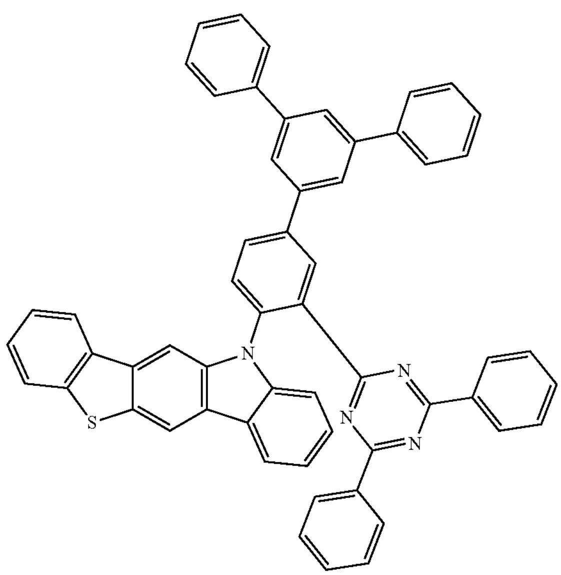
-continued
52
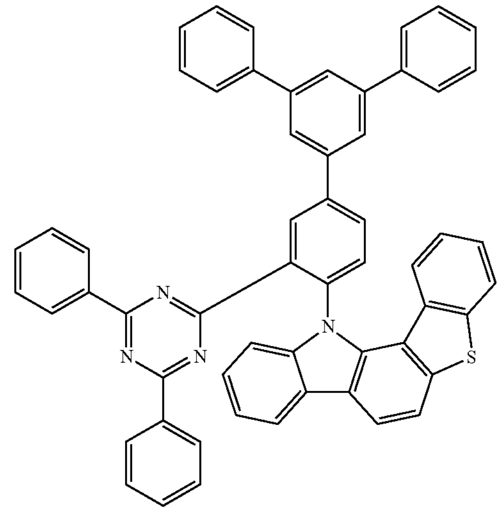
53
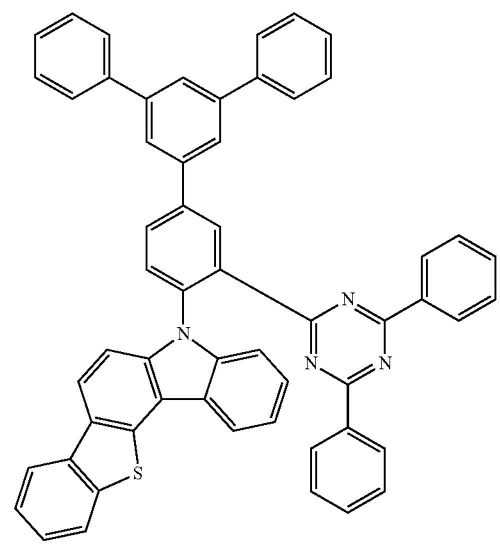
54
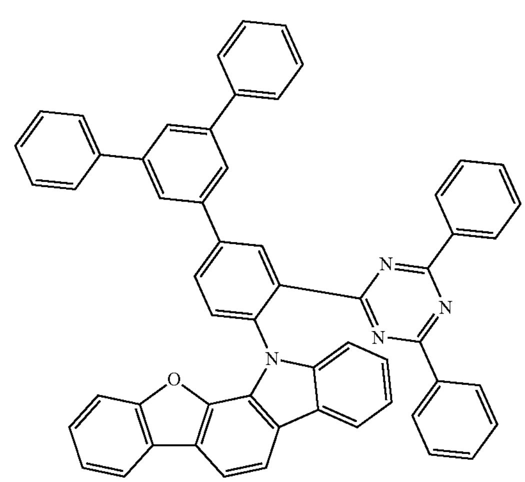

55
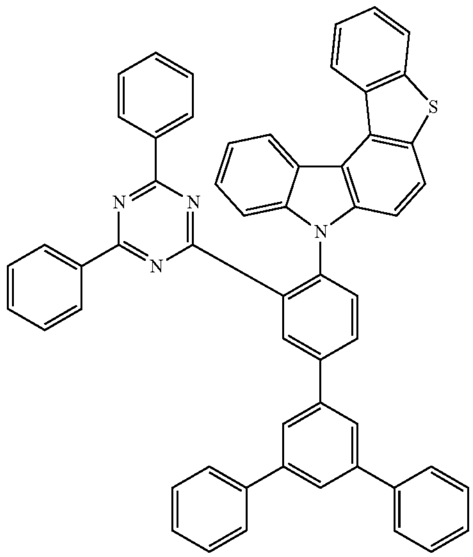
56
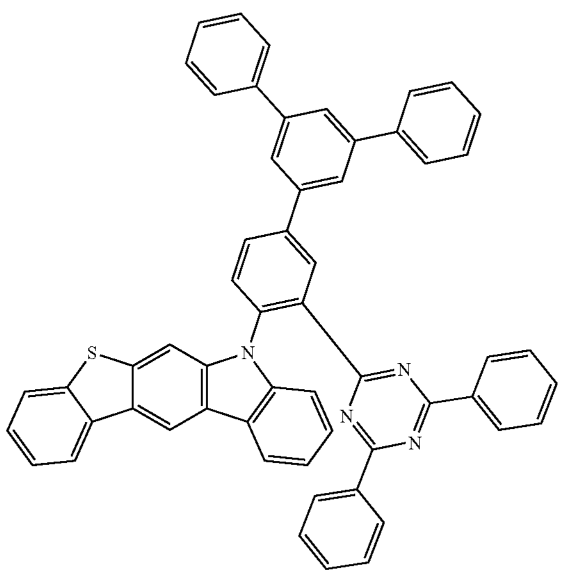
57
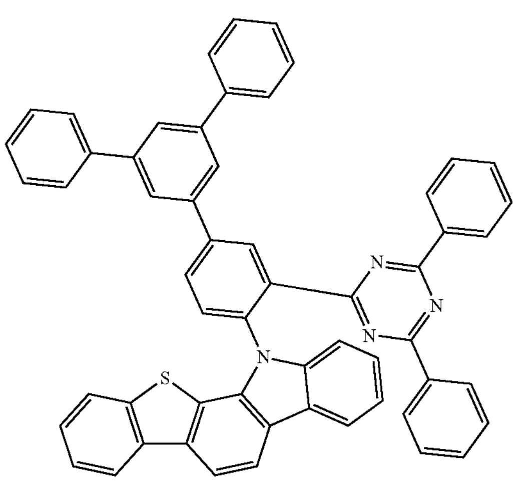
58
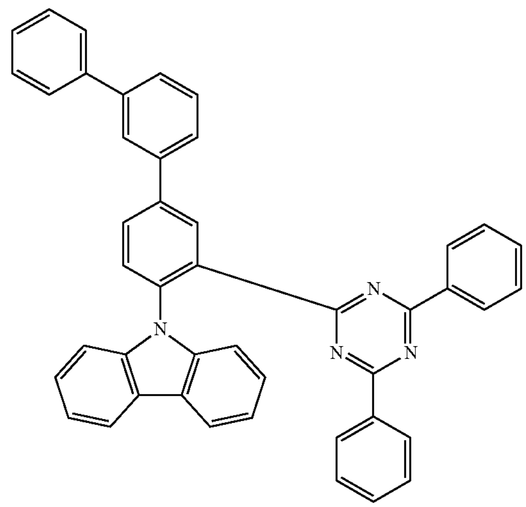
59
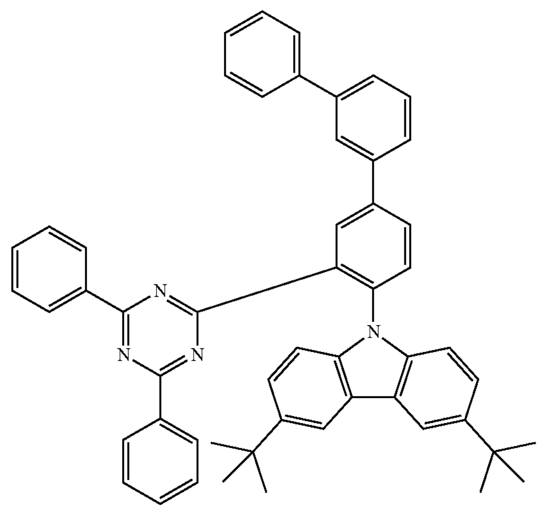
60
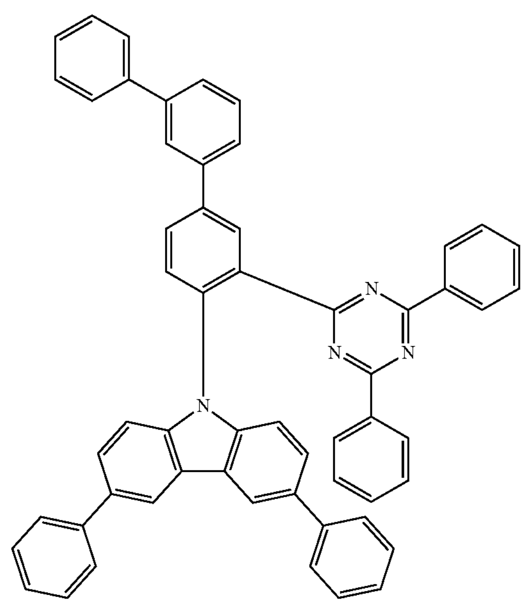

-continued
61
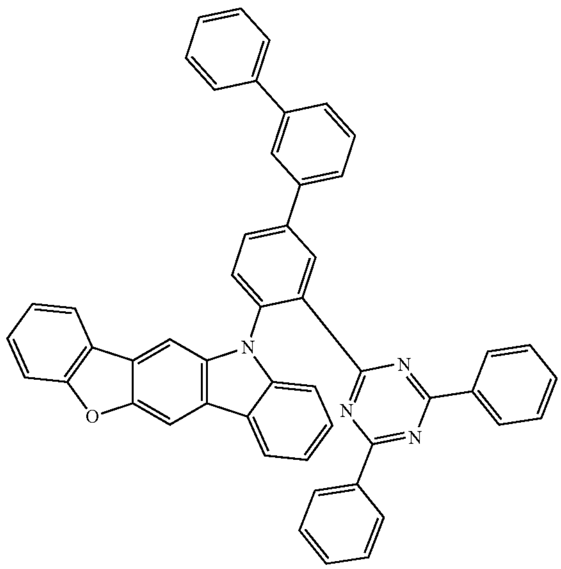
62
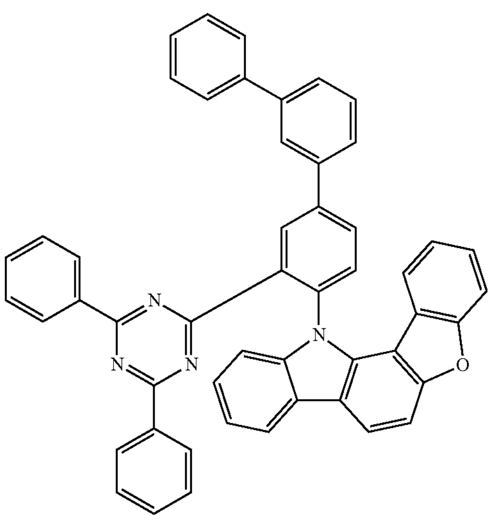
63
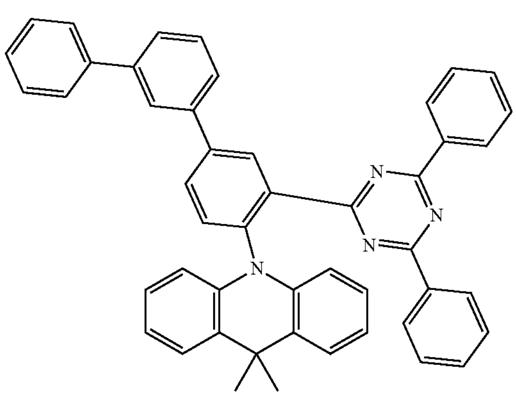
-continued
64
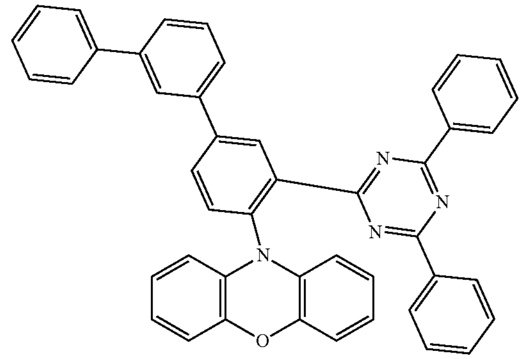
65
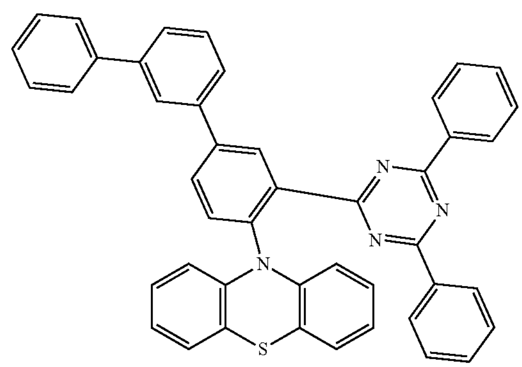
66
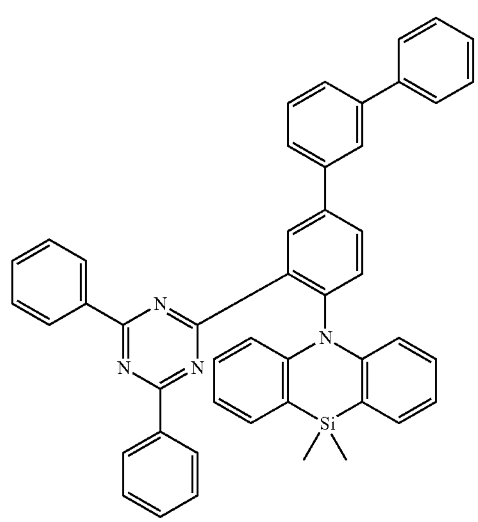

67
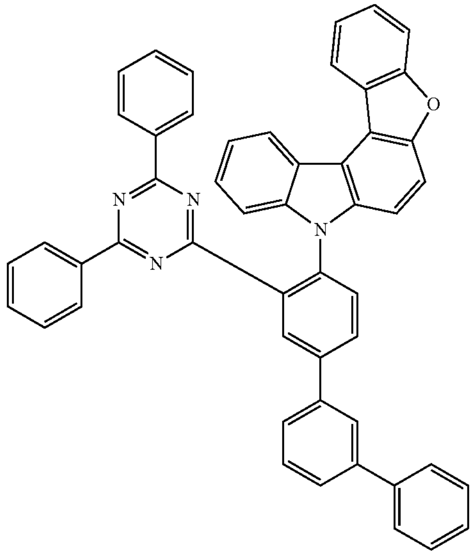
68
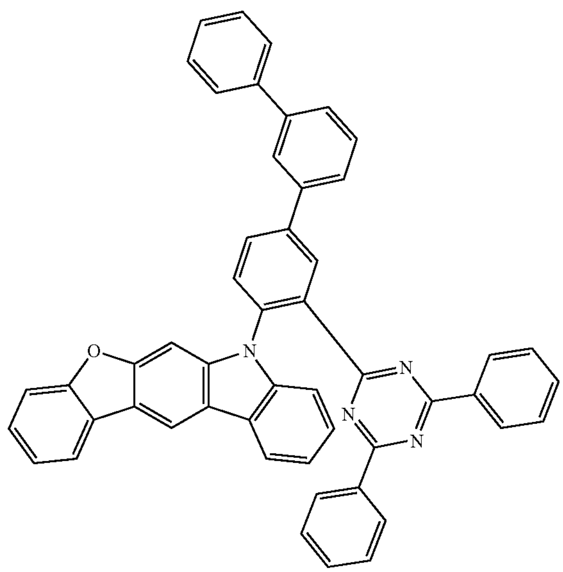
69
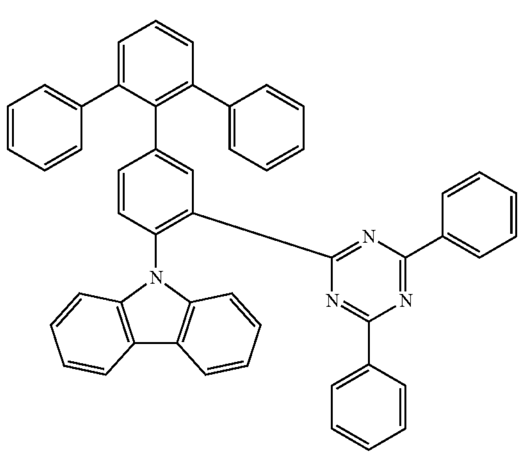
70
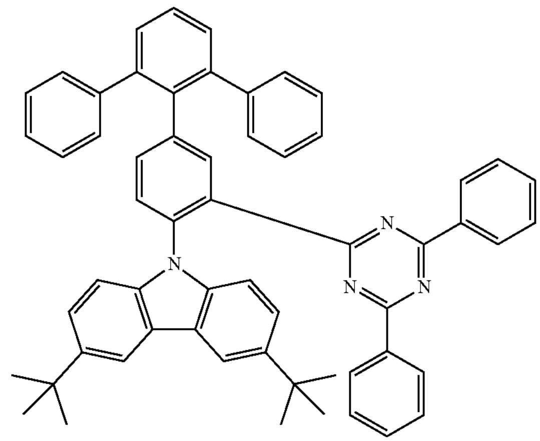
71
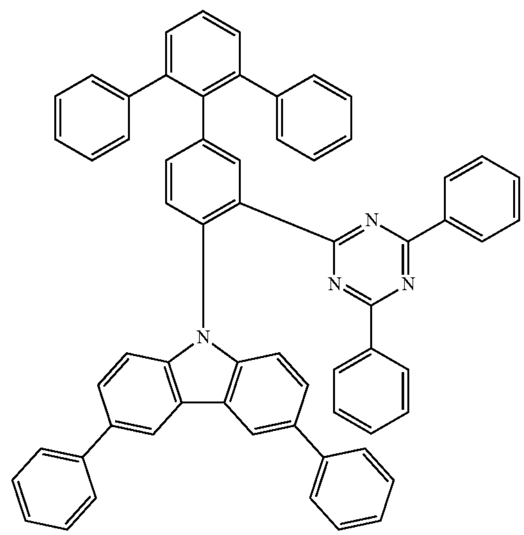
72
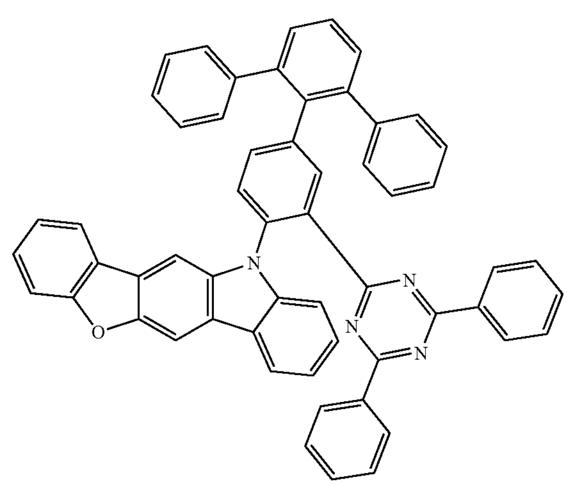

-continued
73
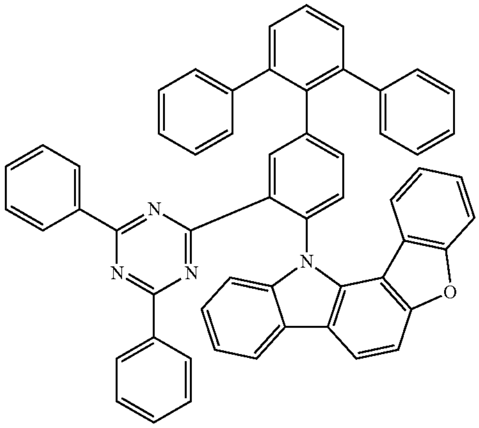
74
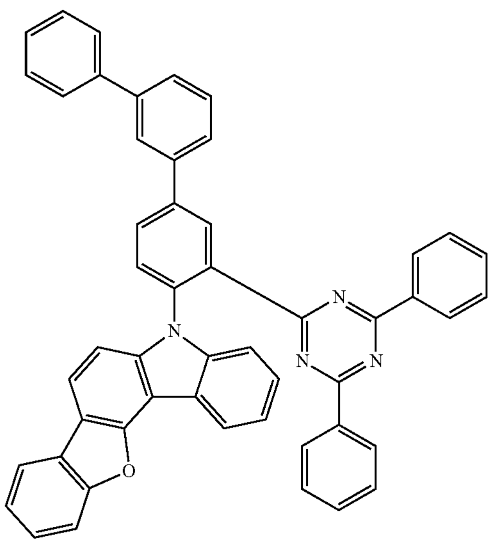
75
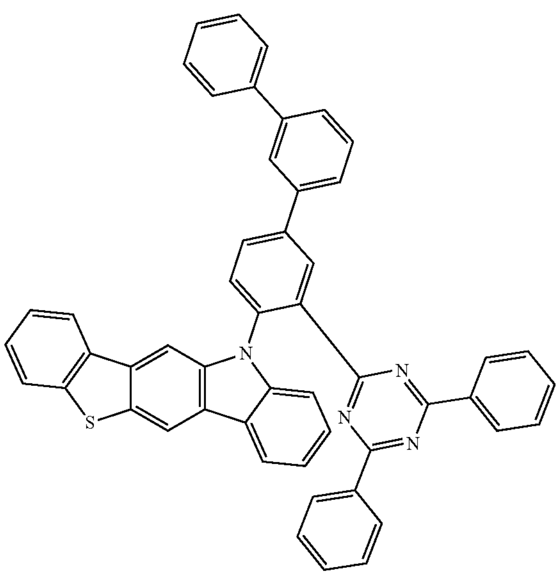
-continued
76
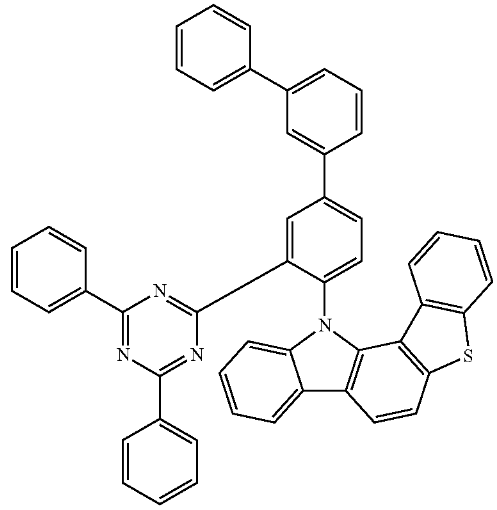
77
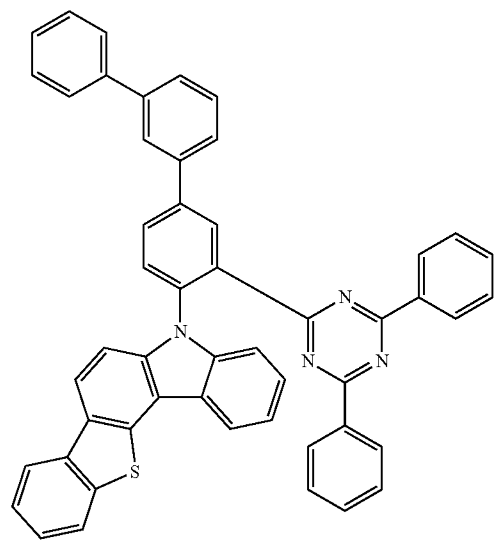
78
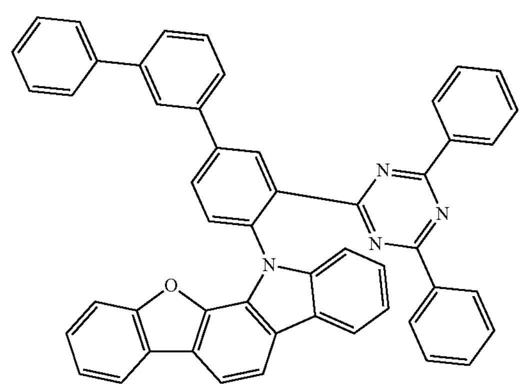

79
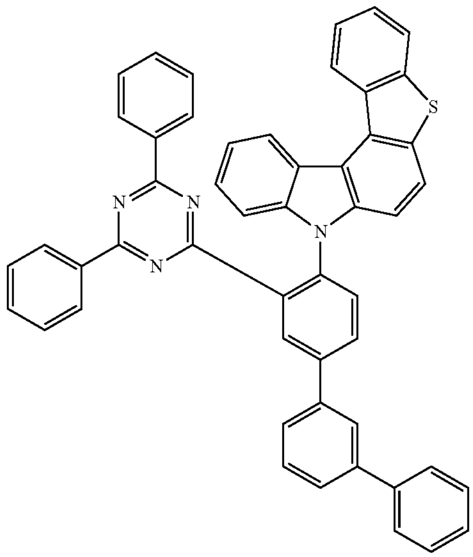
80
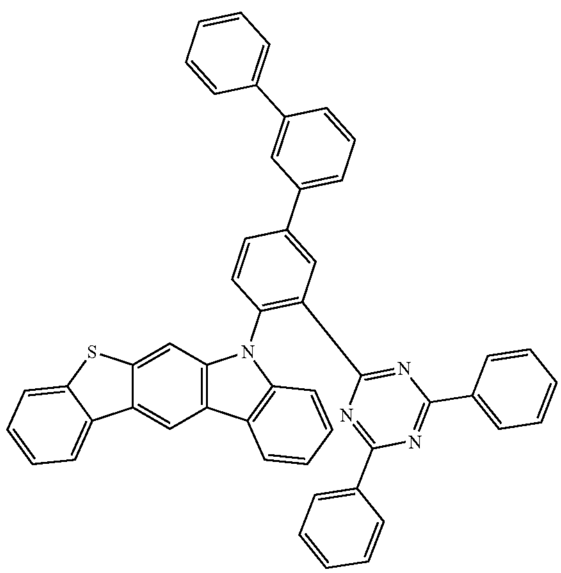
81
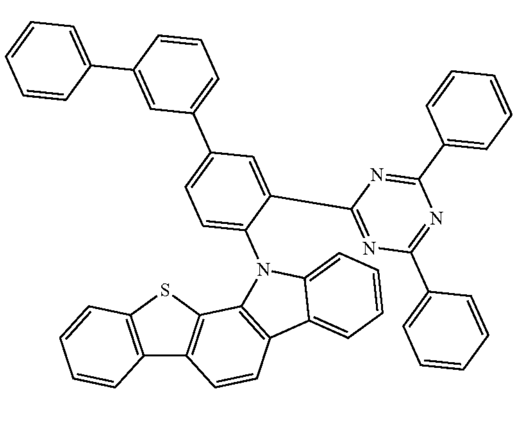
82
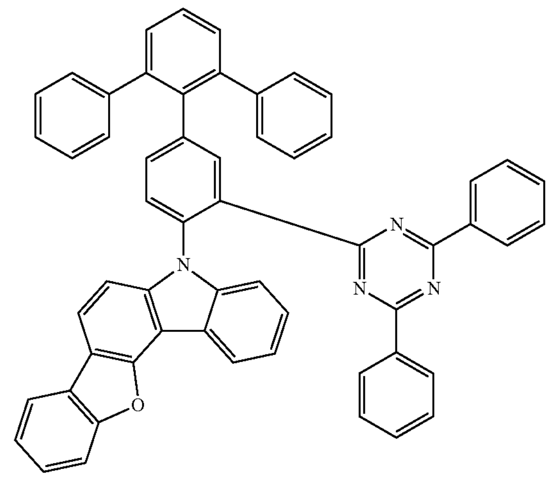
83
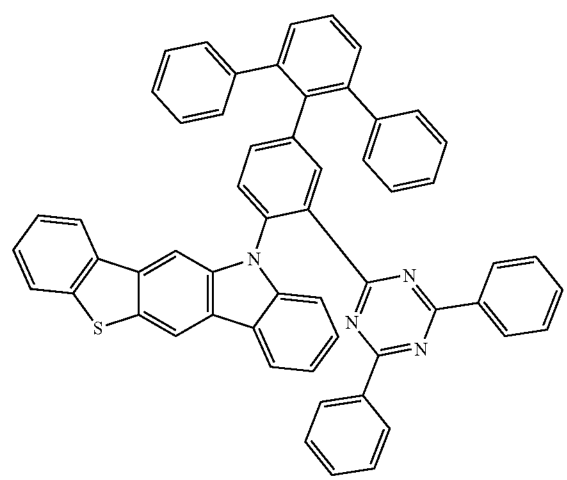
84
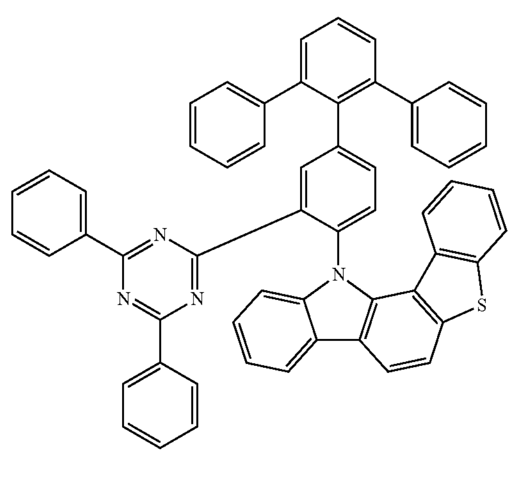

-continued
85
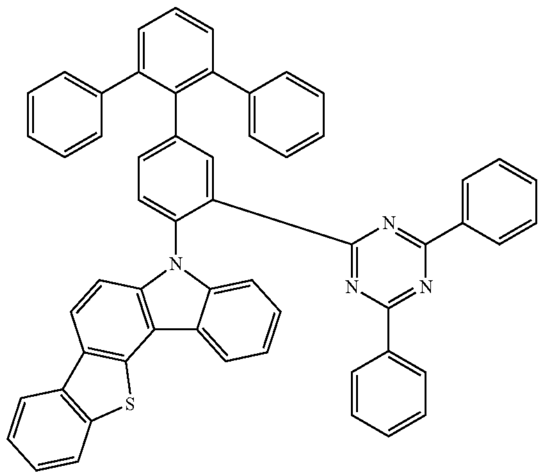
86
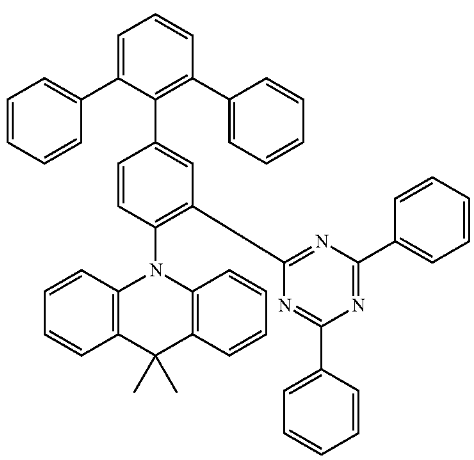
87
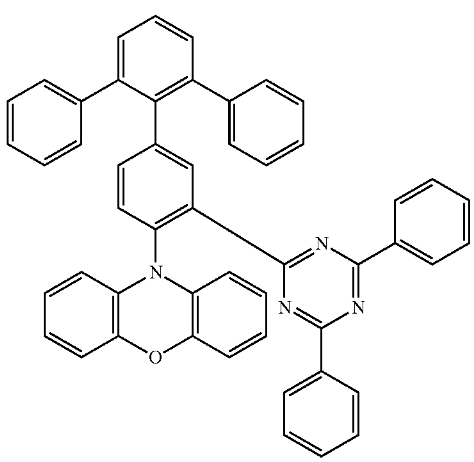
-continued
88
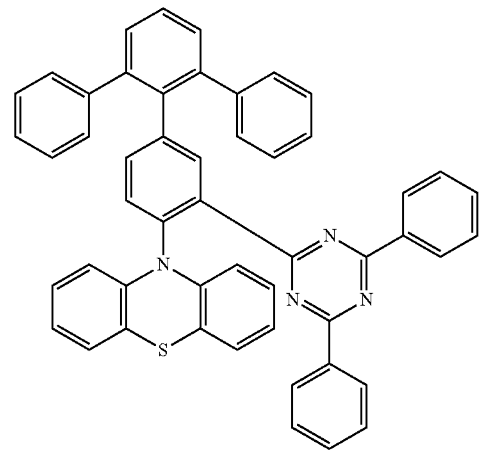
89
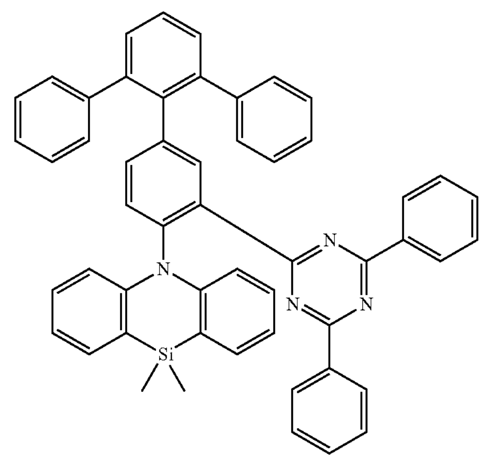
90
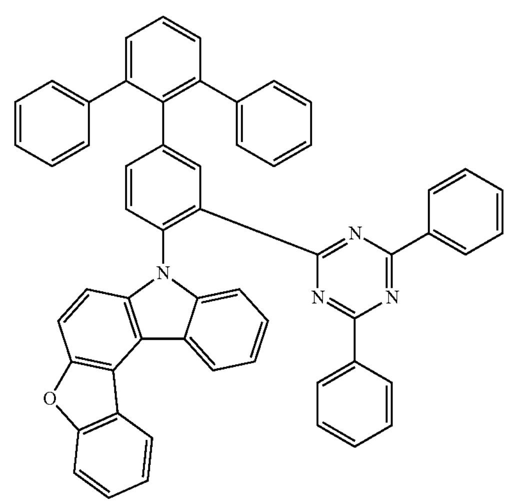

-continued
91
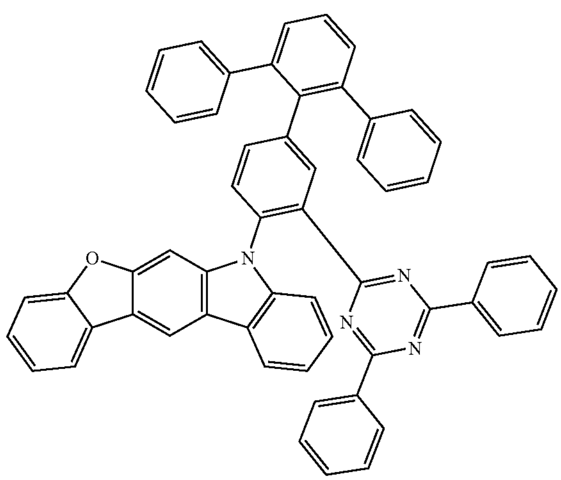
92
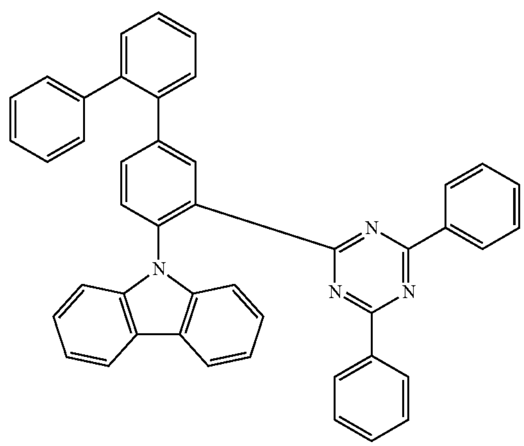
93
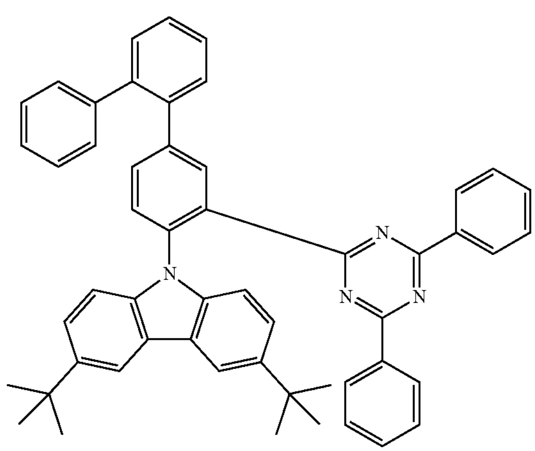
-continued
94
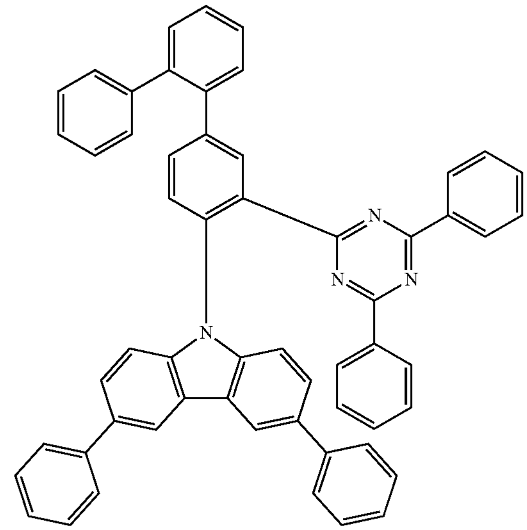
95
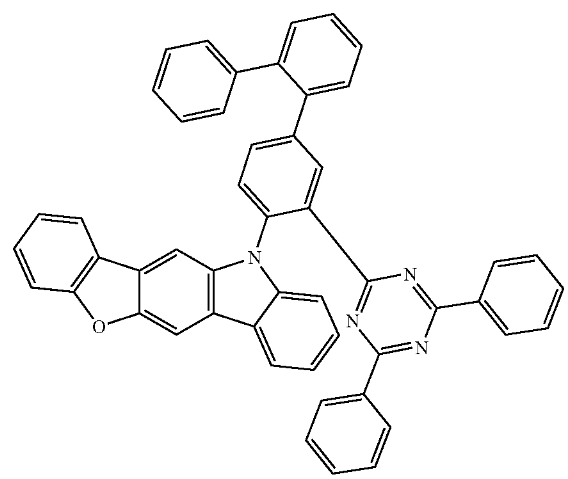
96
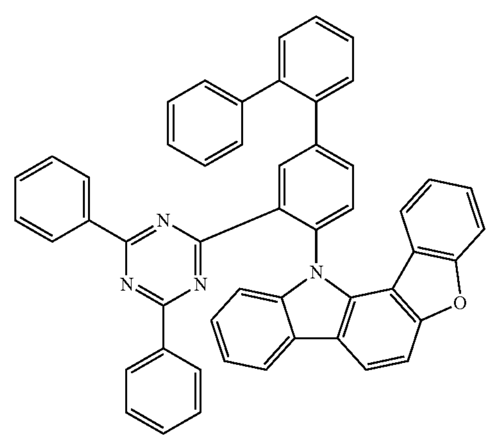

-continued
97
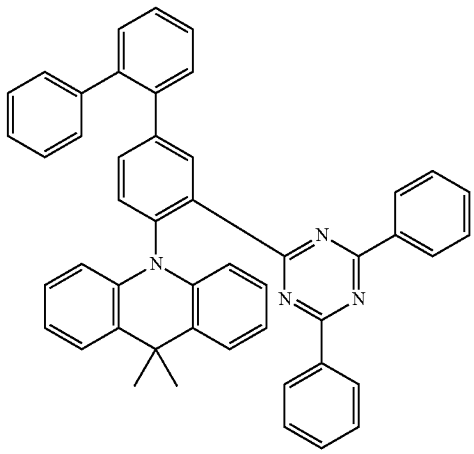
98
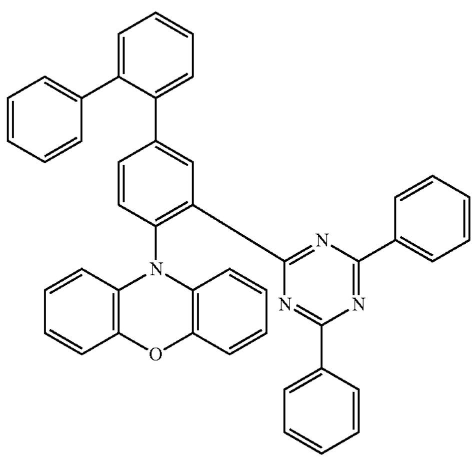
99
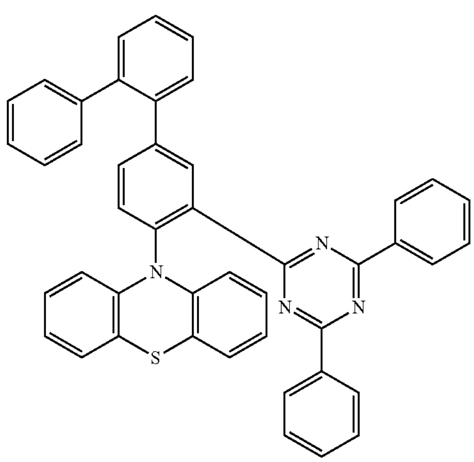
-continued
100
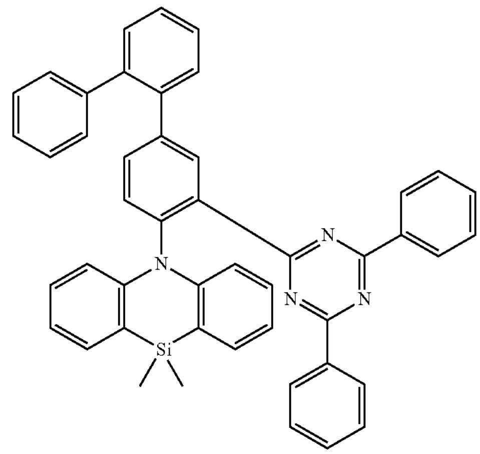
101
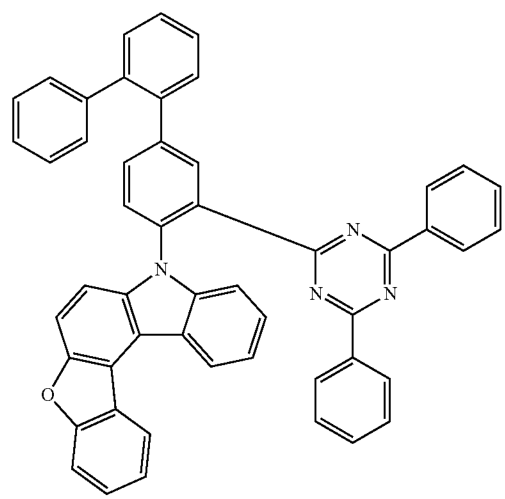
102
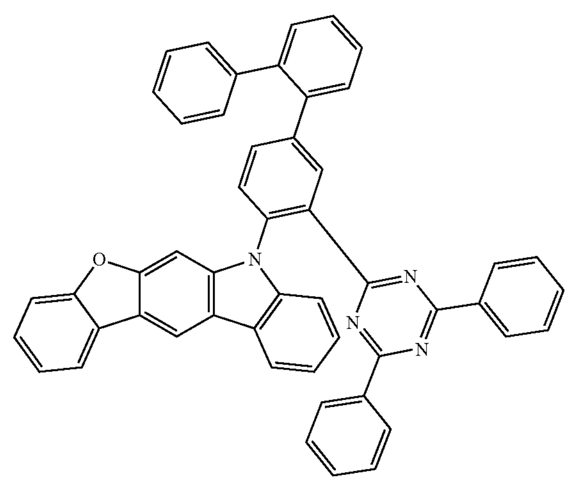

-continued
103
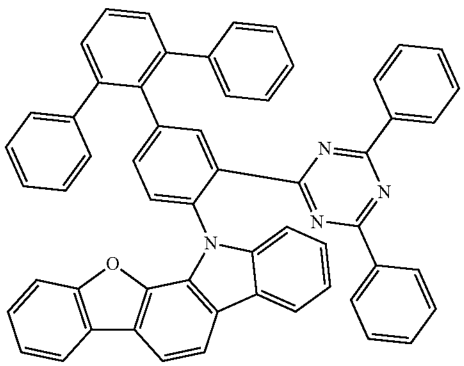
104
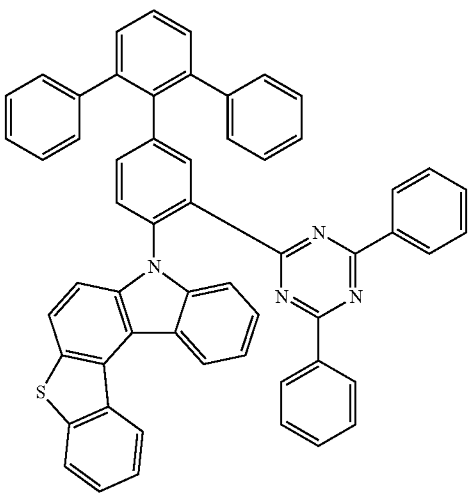
105
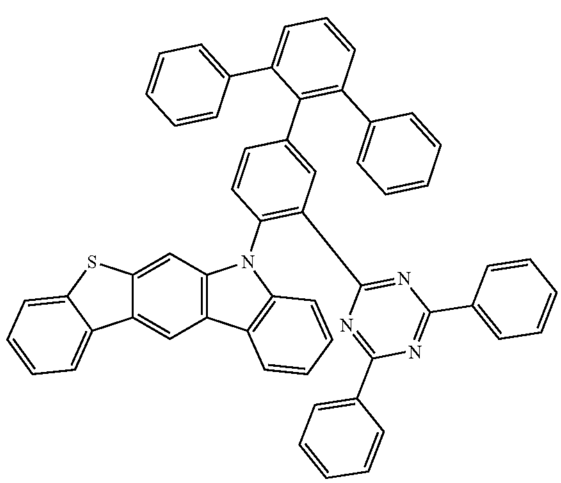
-continued
106
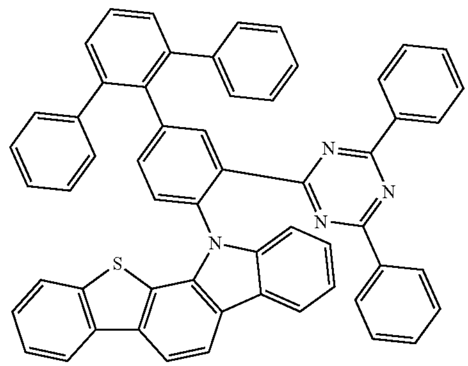
107
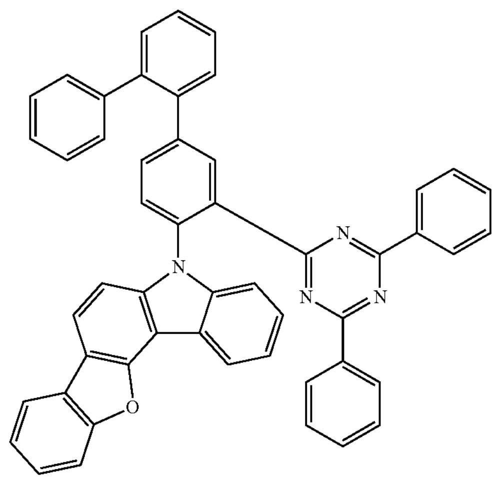
108
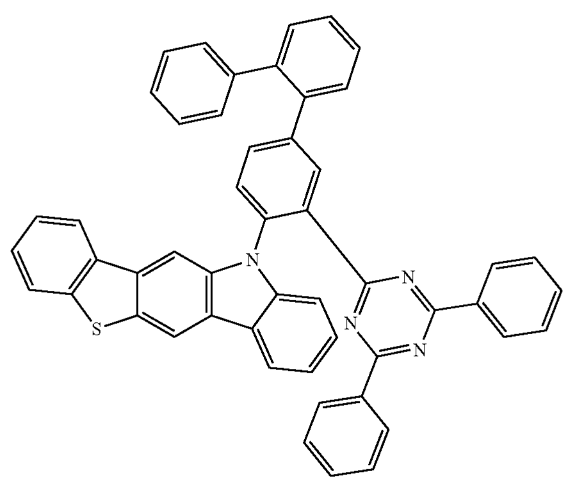

-continued
109
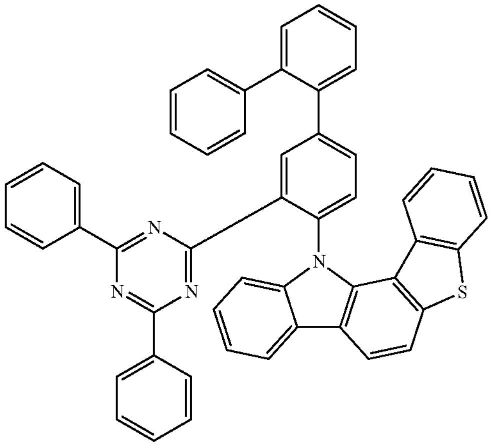
110
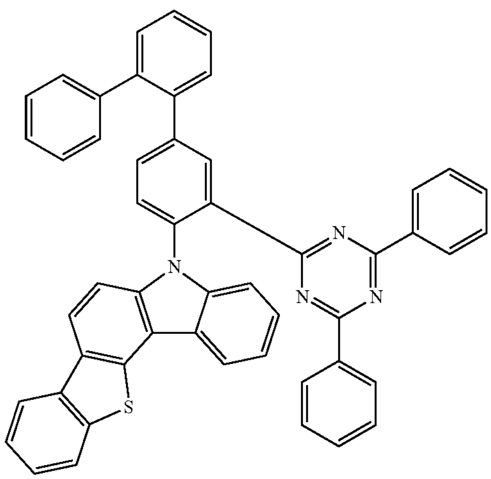
111
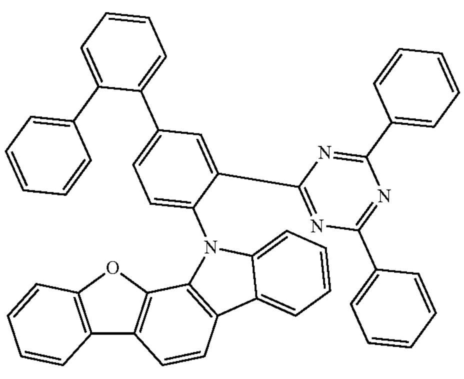
-continued
112
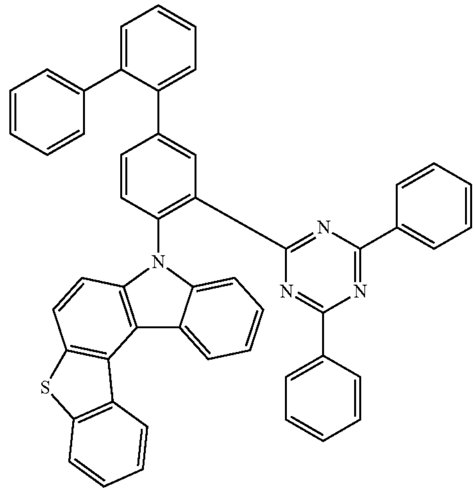
113
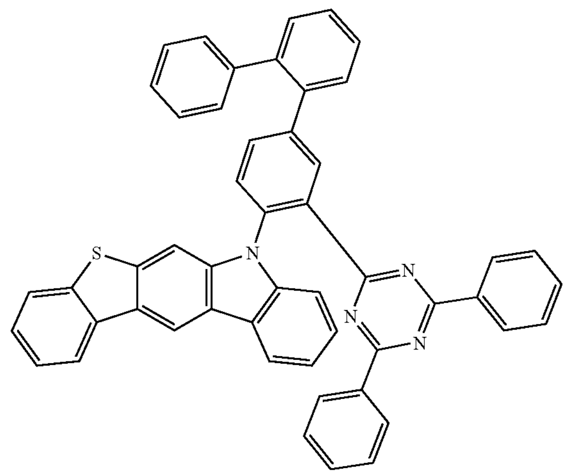
114
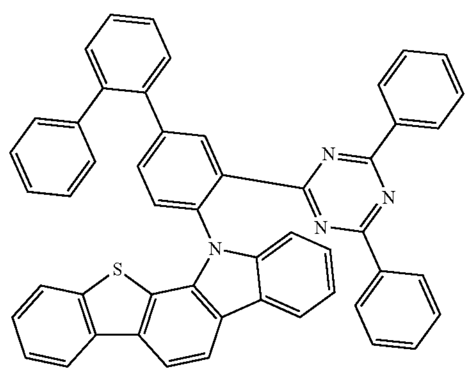

-continued
115
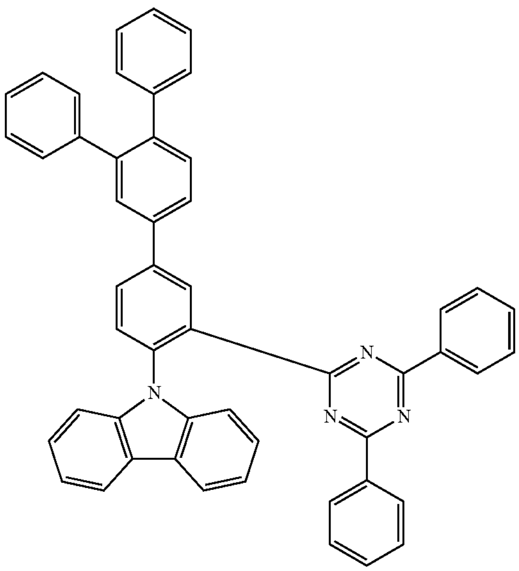
116
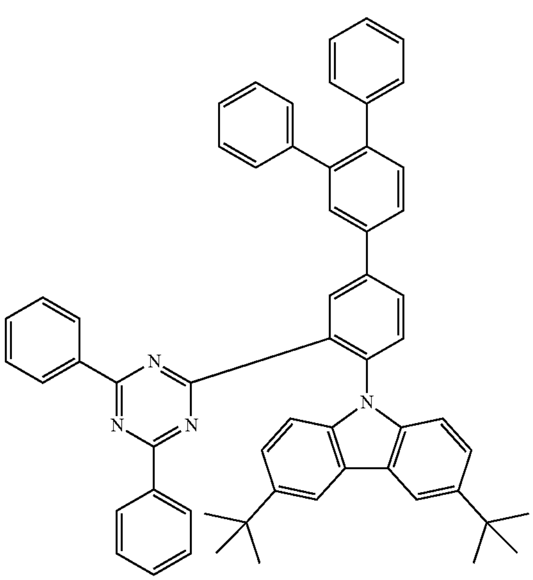
-continued
117
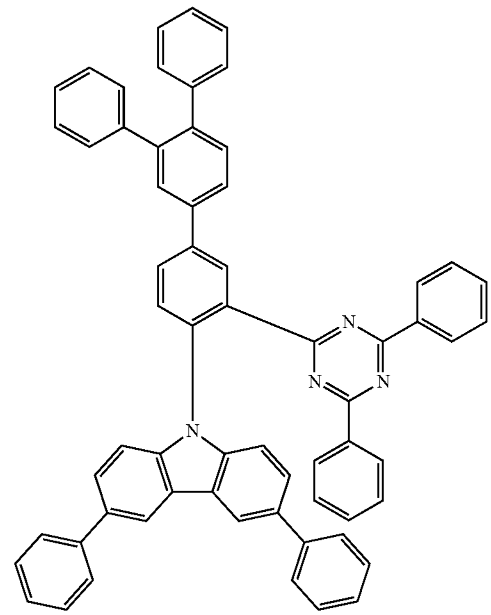
118
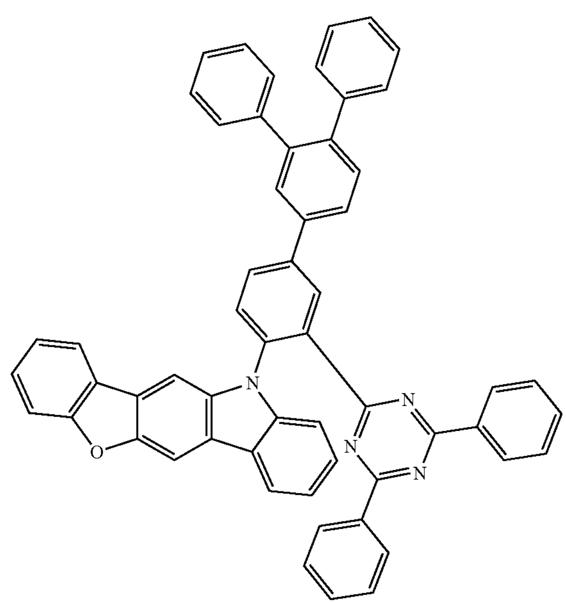

119
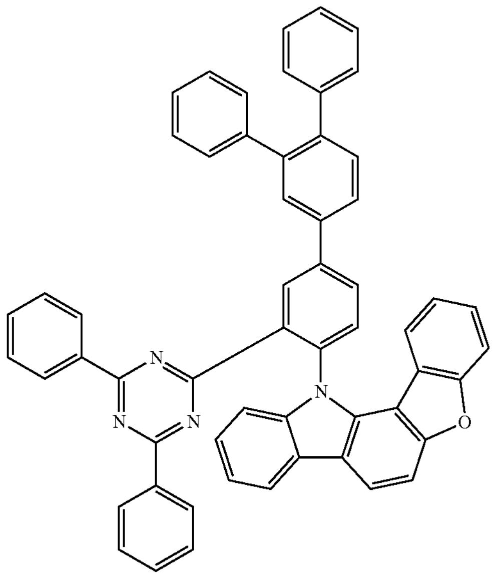
120
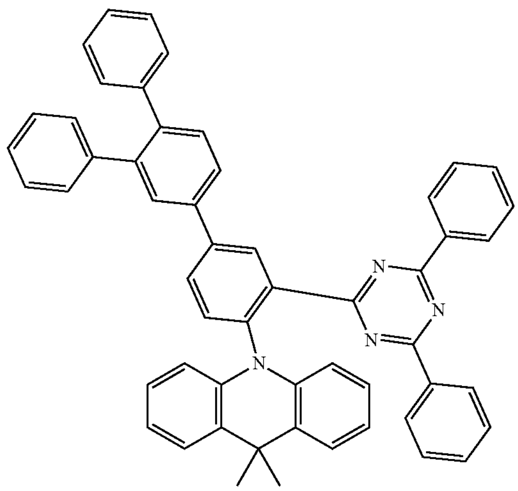
121
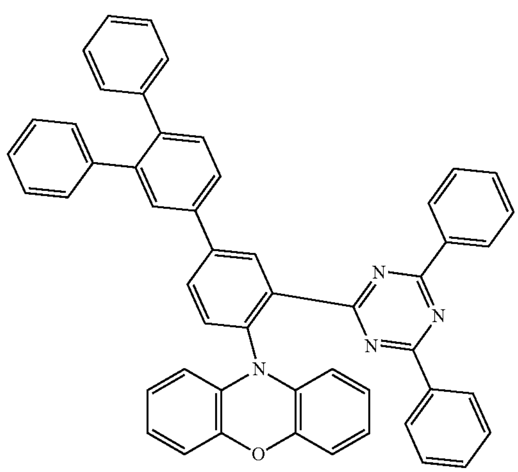
122
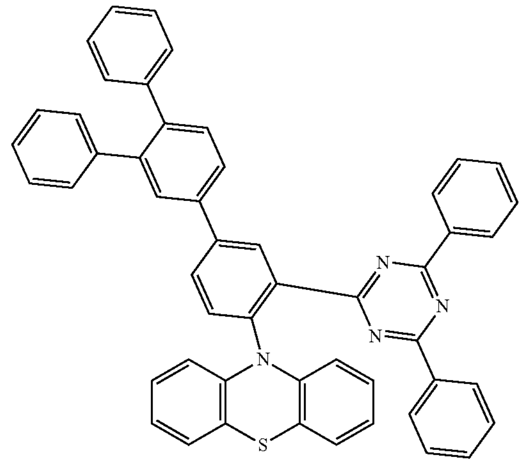
123
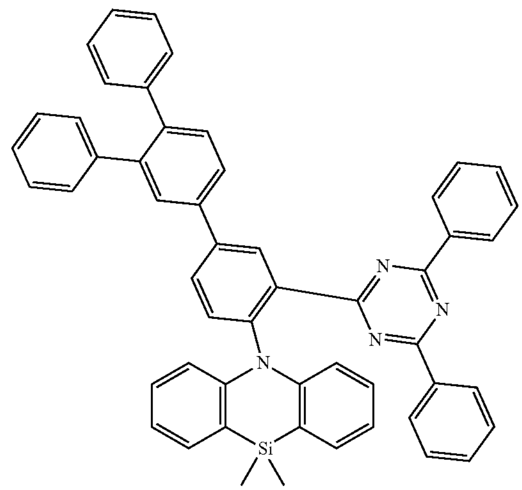
124
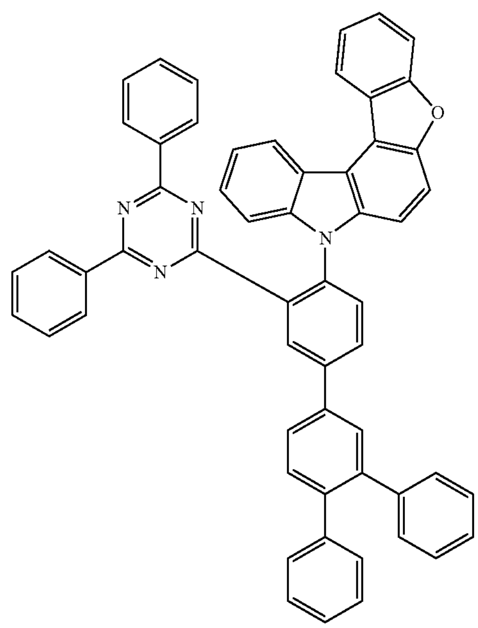

-continued
125
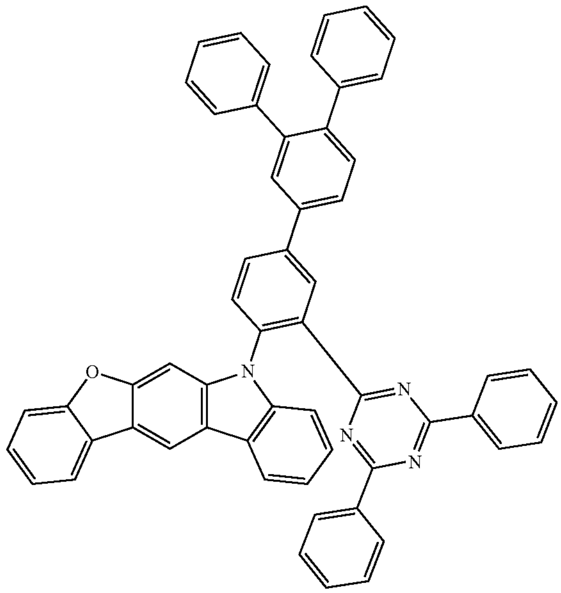
126
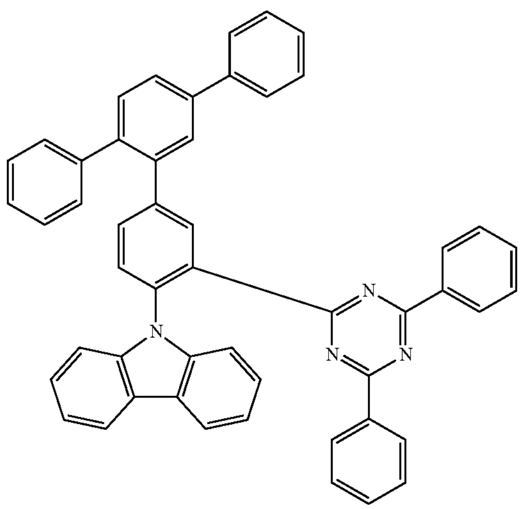
127
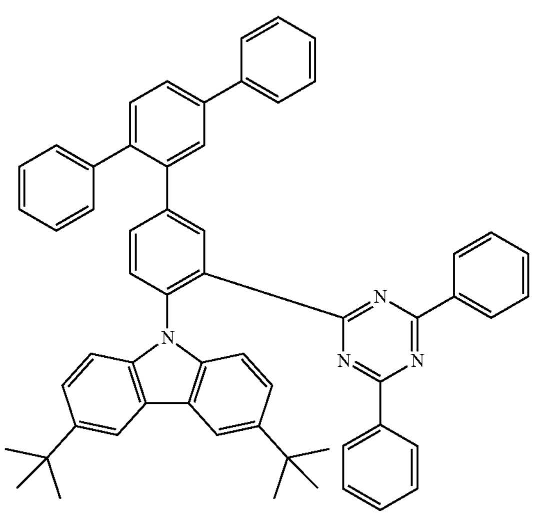
-continued
128
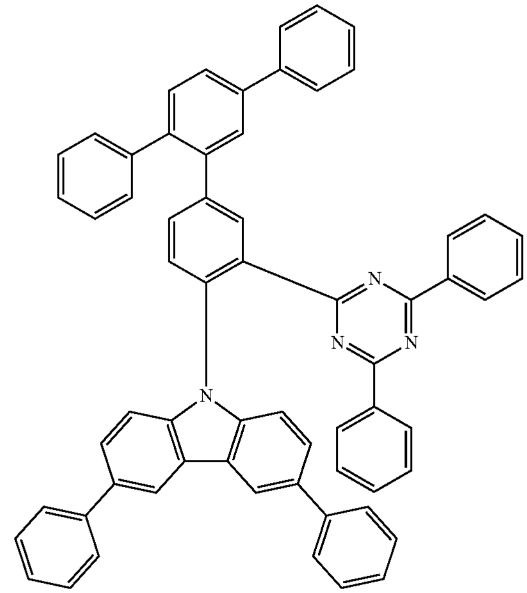
129
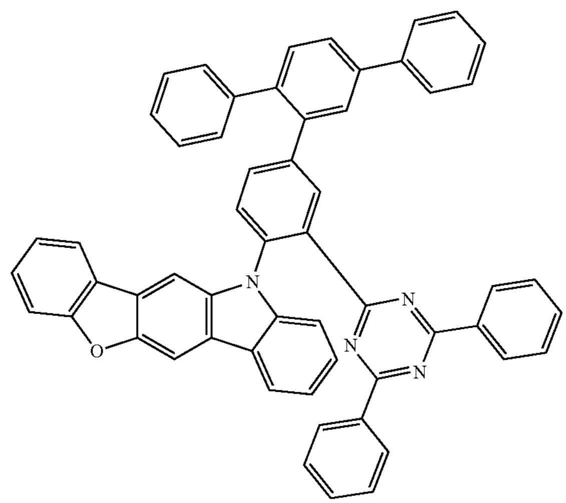
130
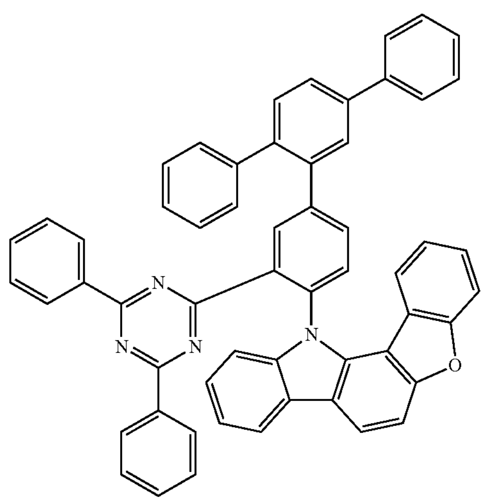

-continued
131
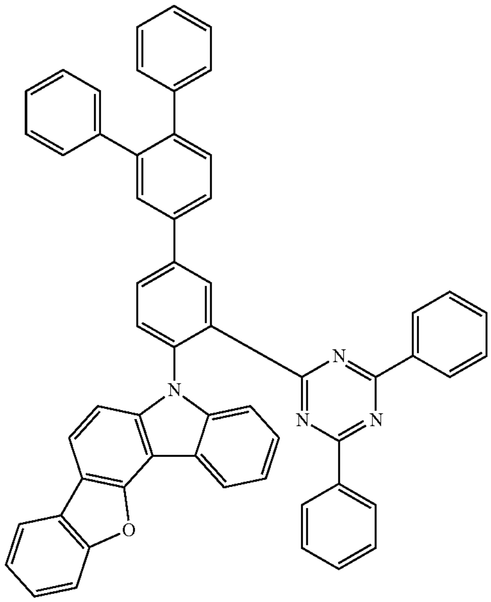
132
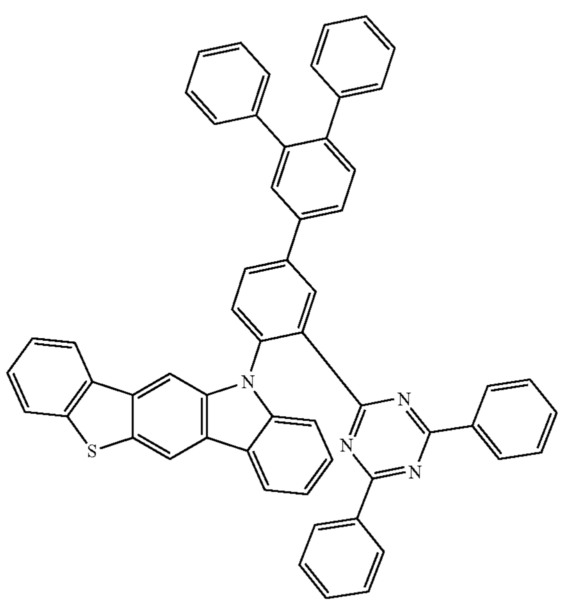
-continued
133
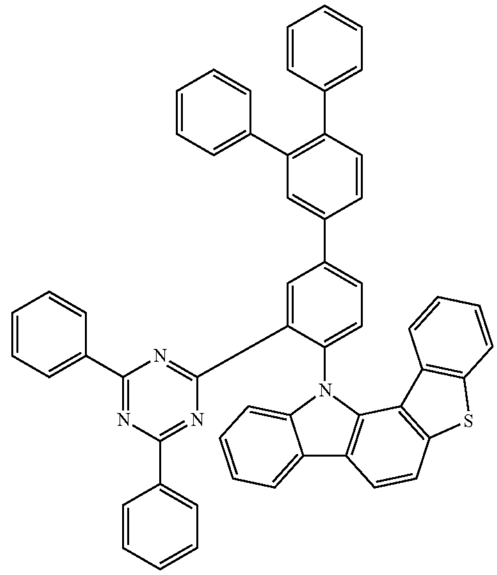
134
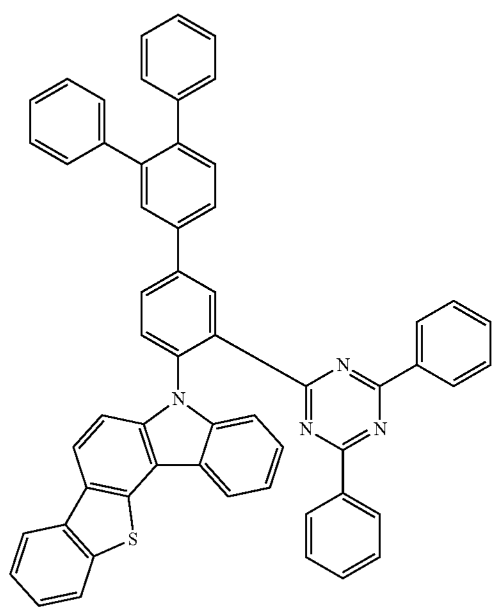

-continued
135
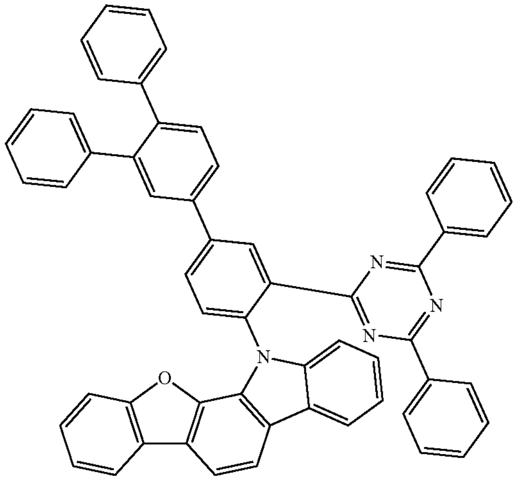
136
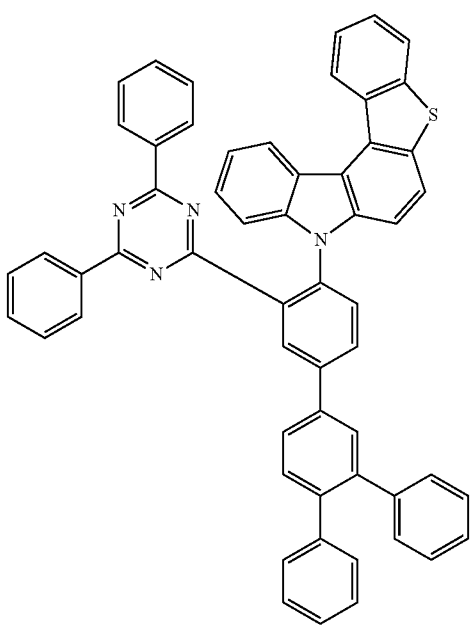
-continued
137
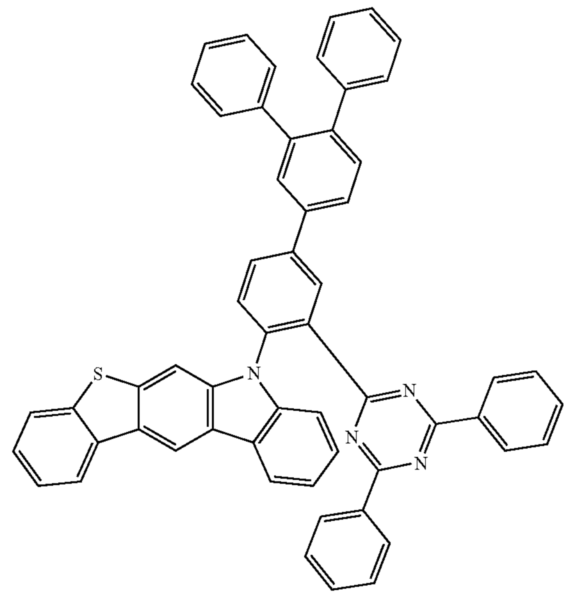
138
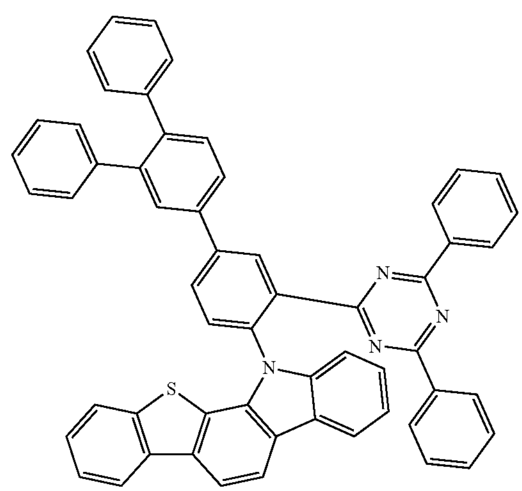

139
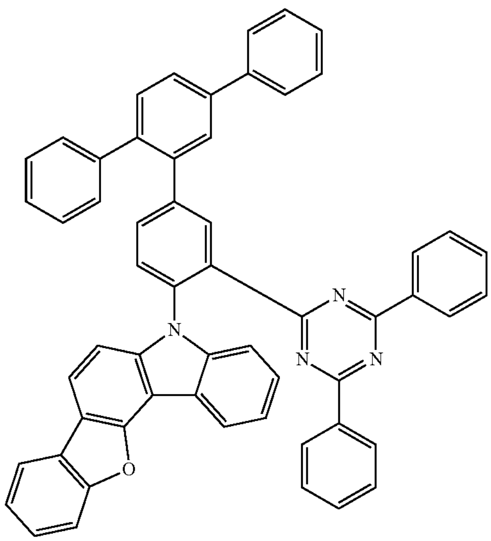
140
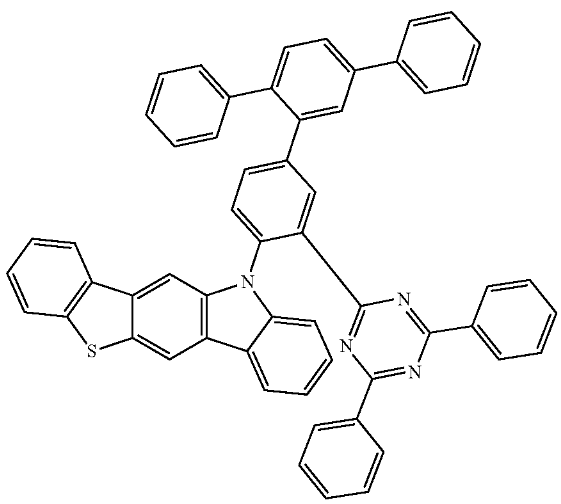
141
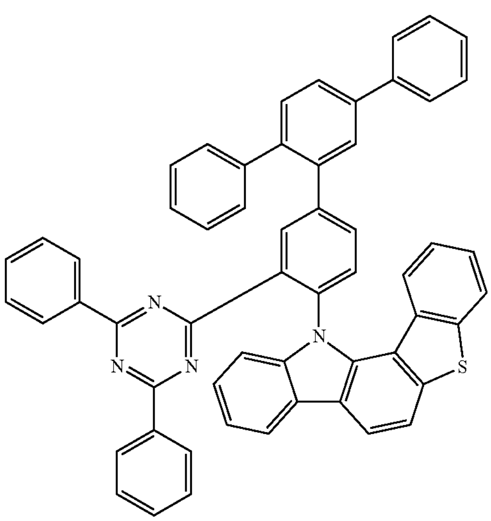
142
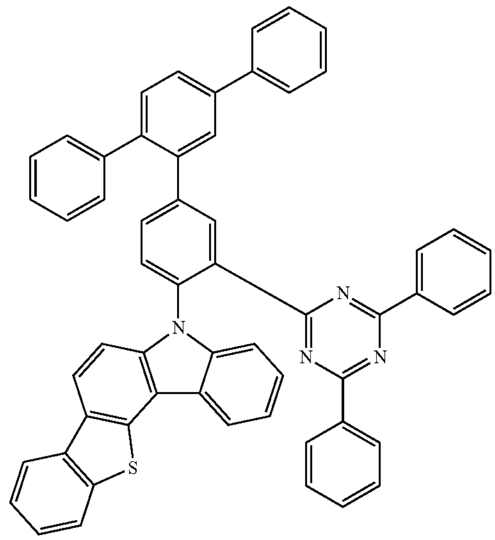
143
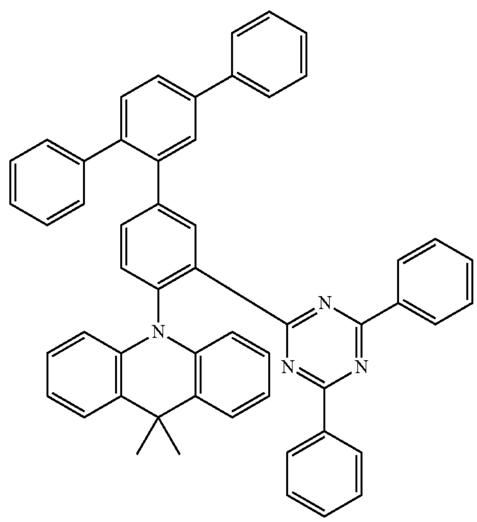
144
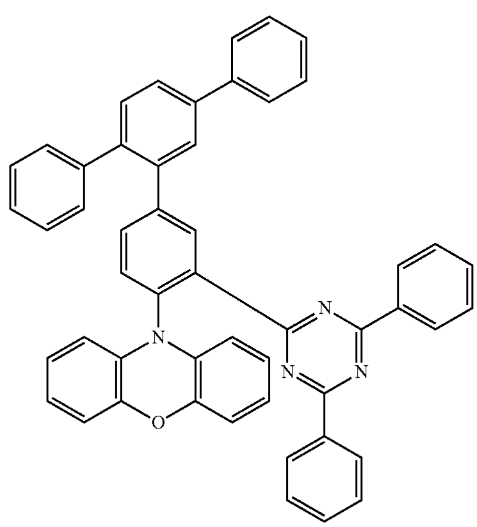

-continued
145
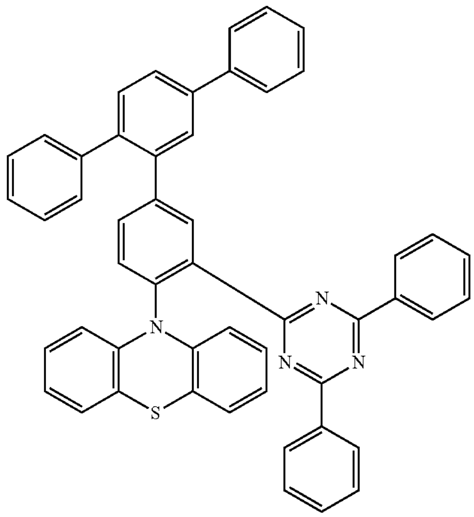
146
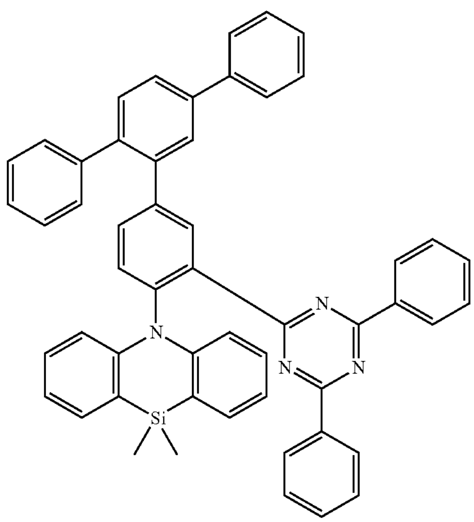
147
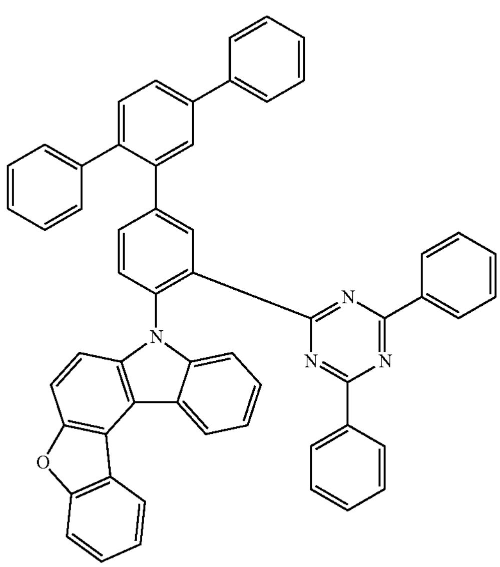
-continued
148
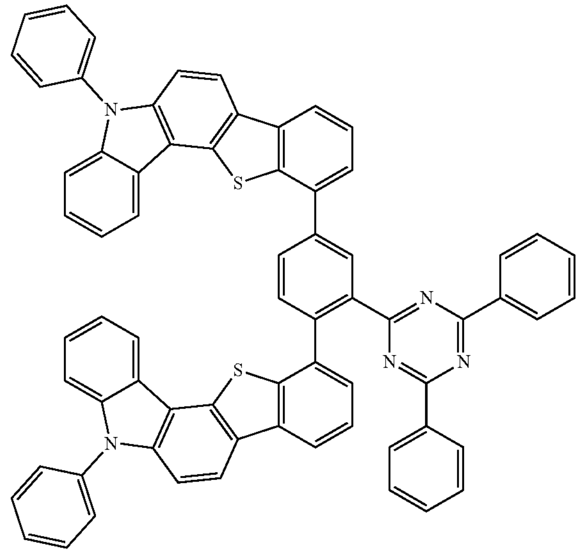
149
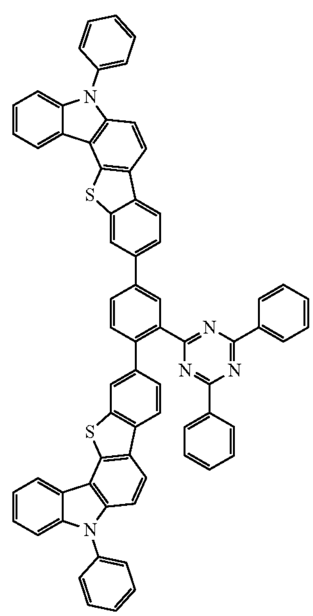

-continued
150
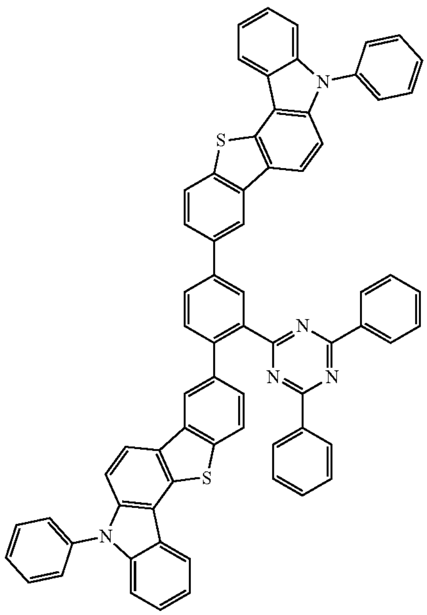
151
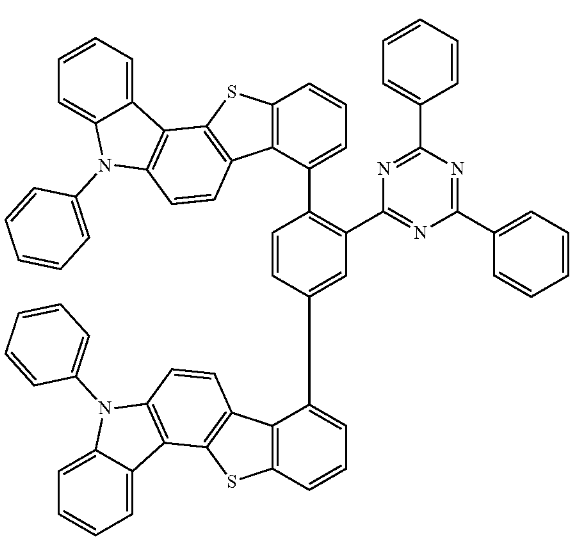
-continued
152
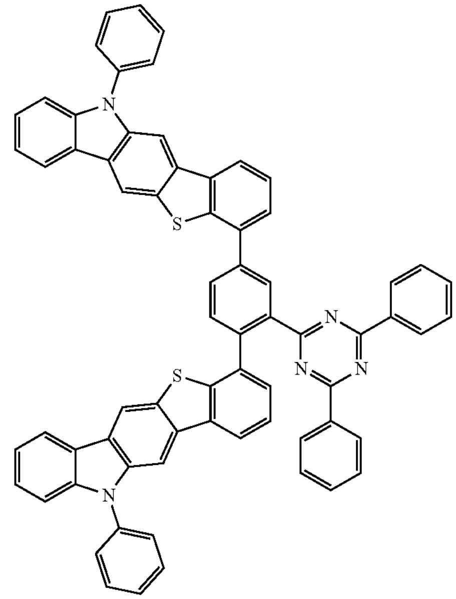
153
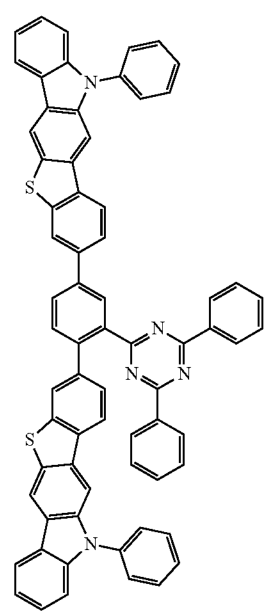

154
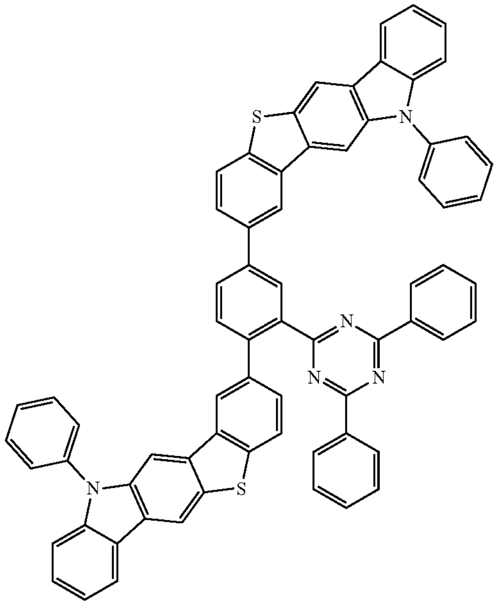
155
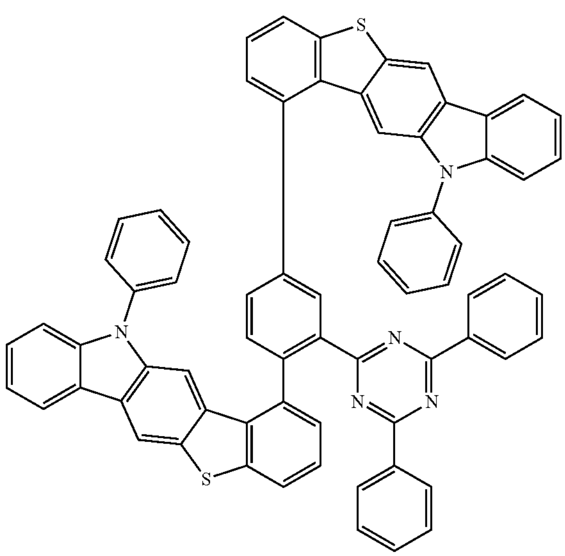
156
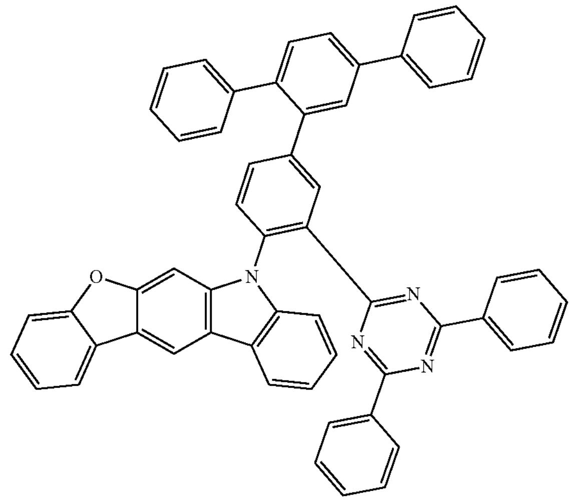
157
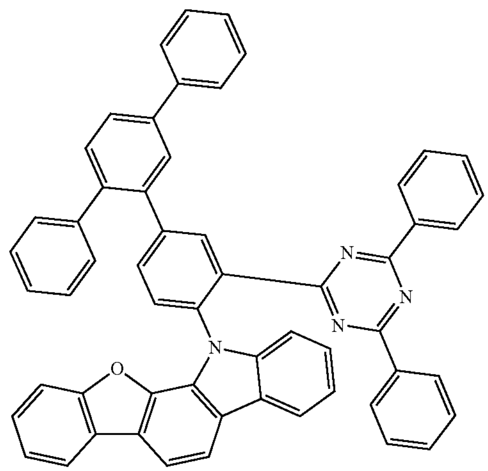
158
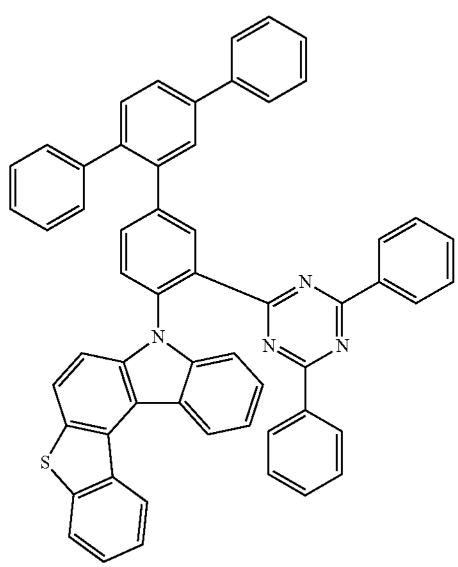

159
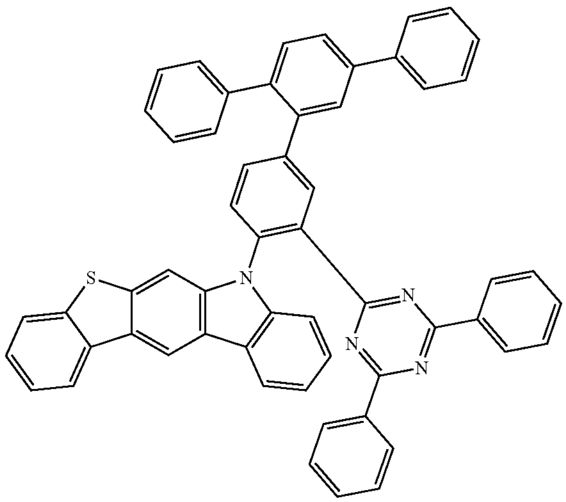
160
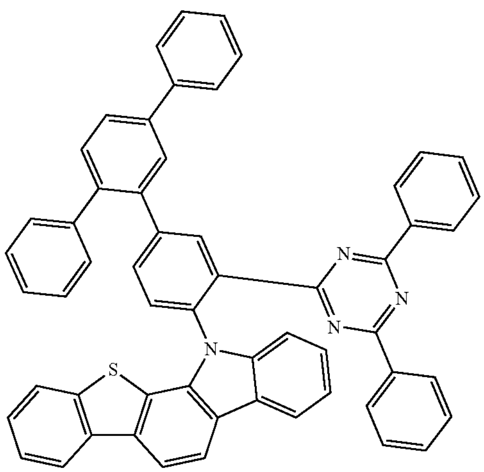
161
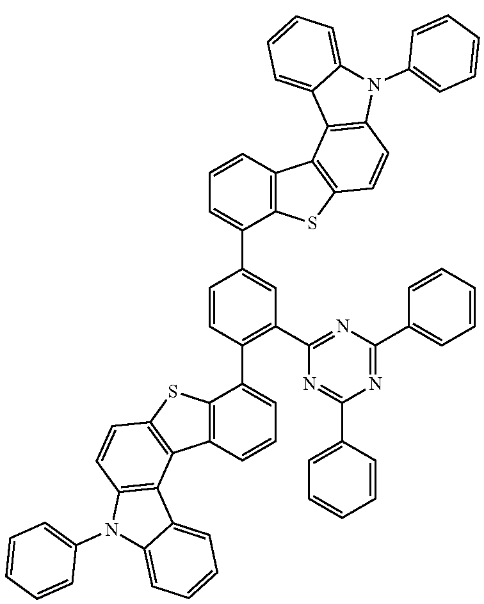
162
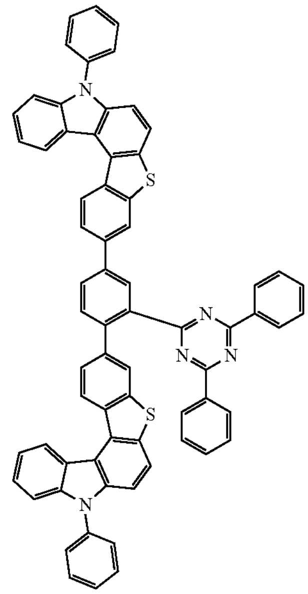
163
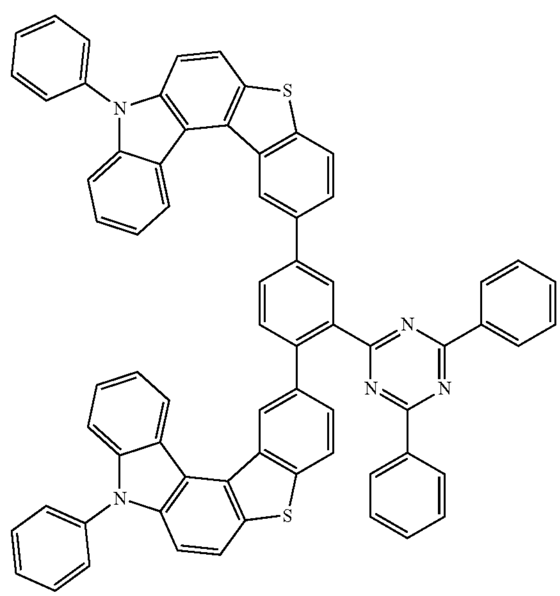

164
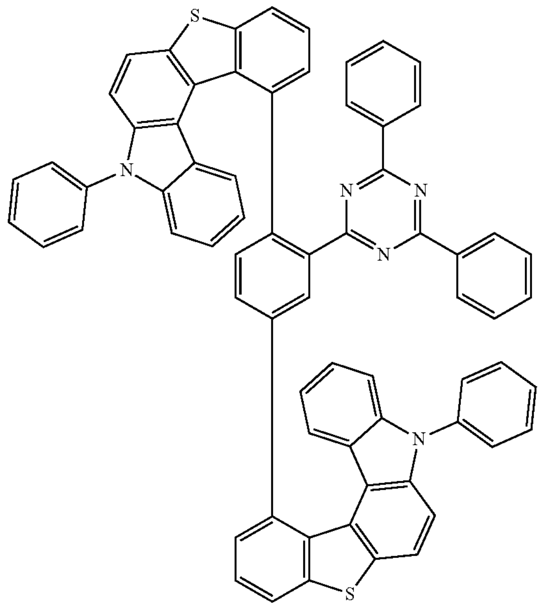
165
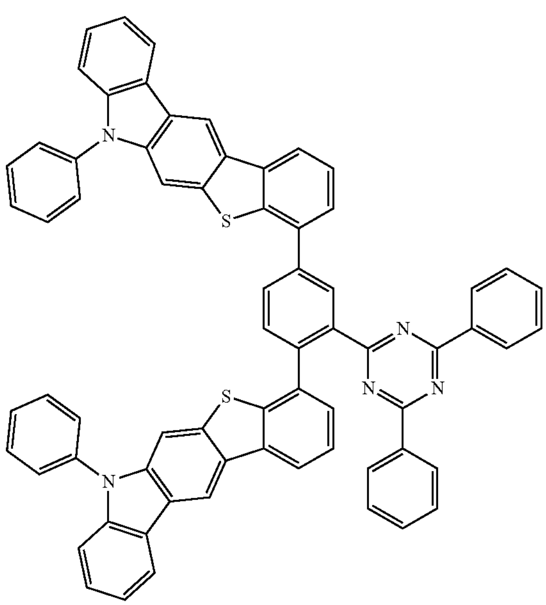
166
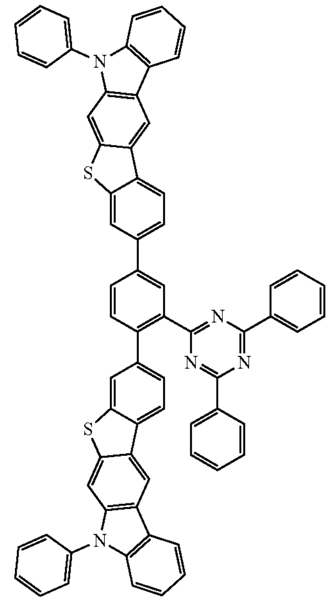
167
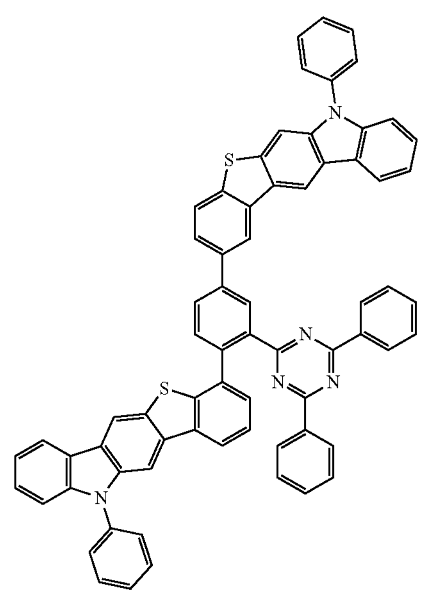

-continued
168
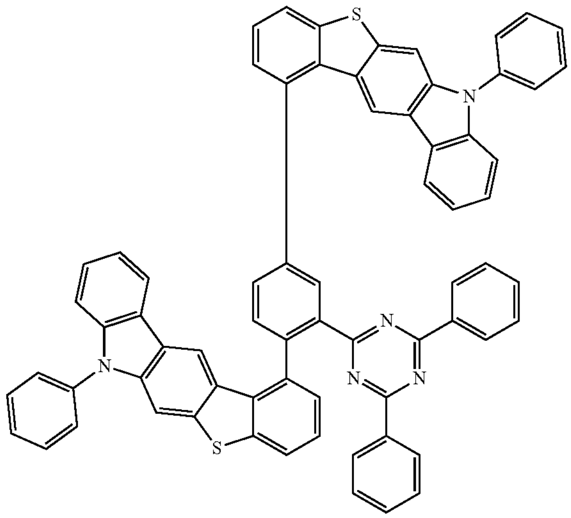
169
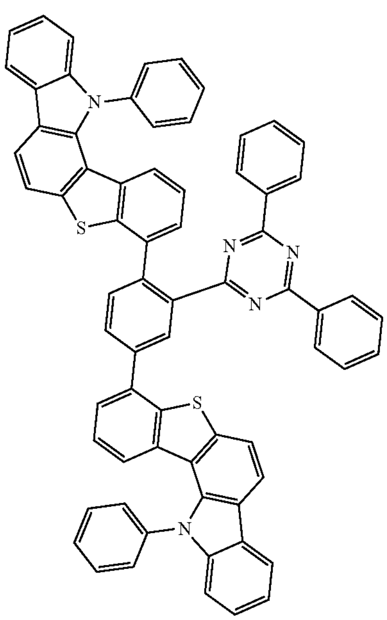
-continued
170
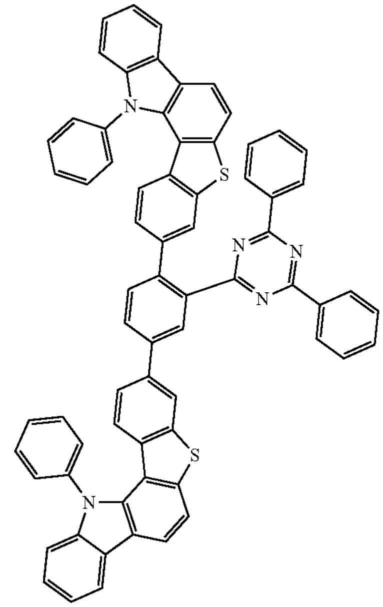
171
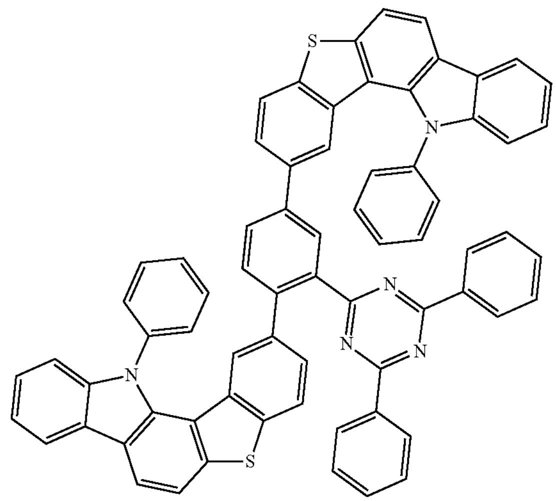
172
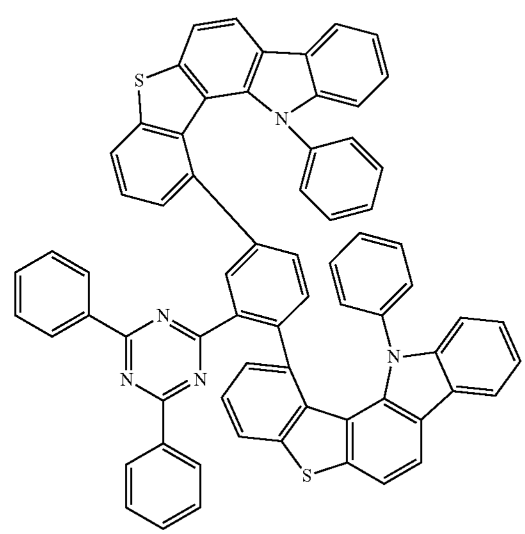

-continued
173
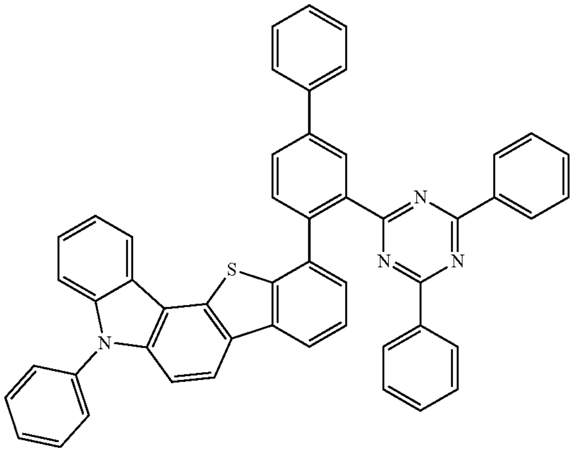
174
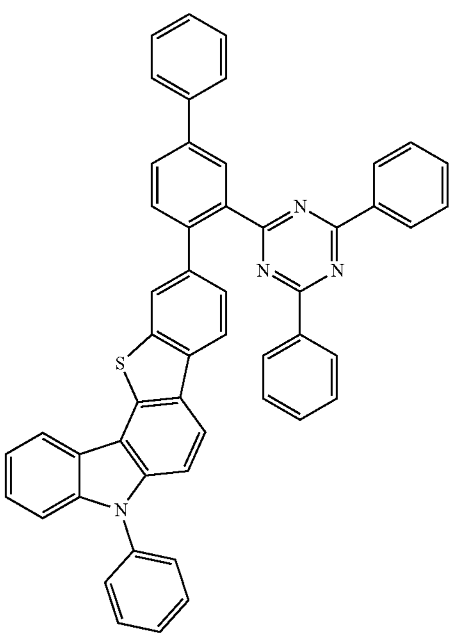
-continued
175
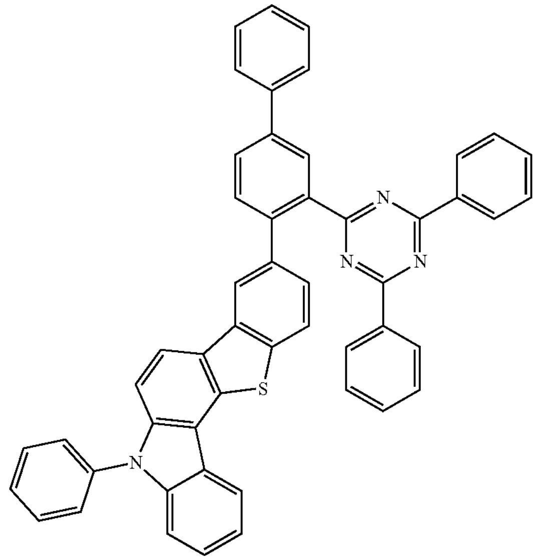
176
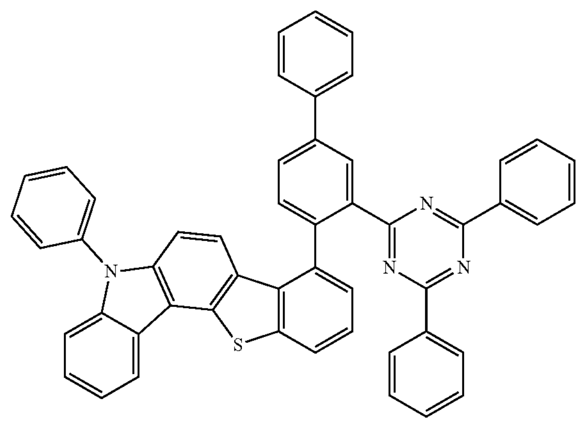
177
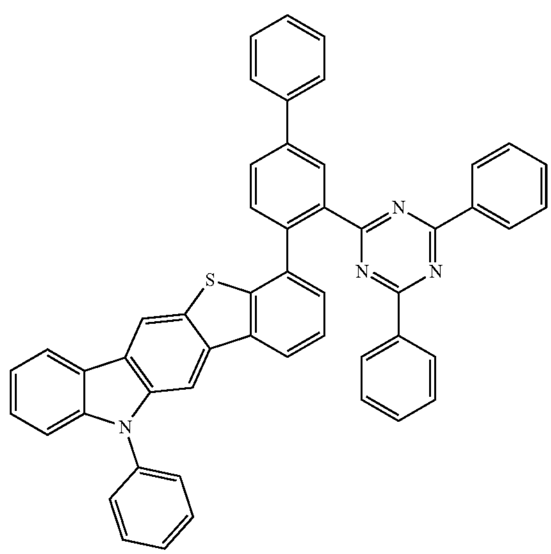

-continued
178
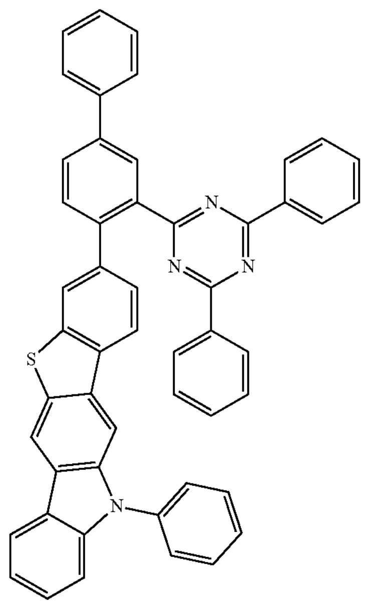
179
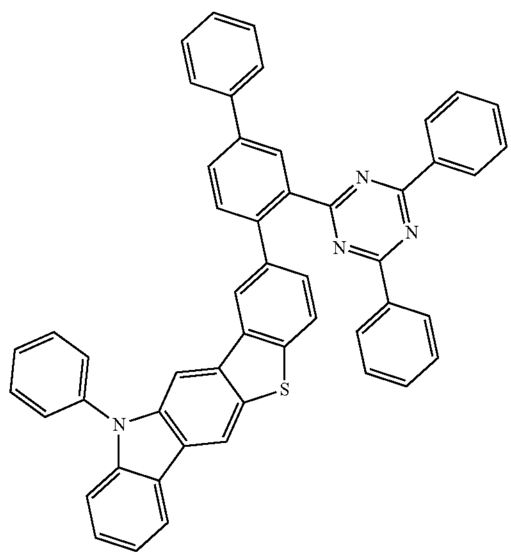
180
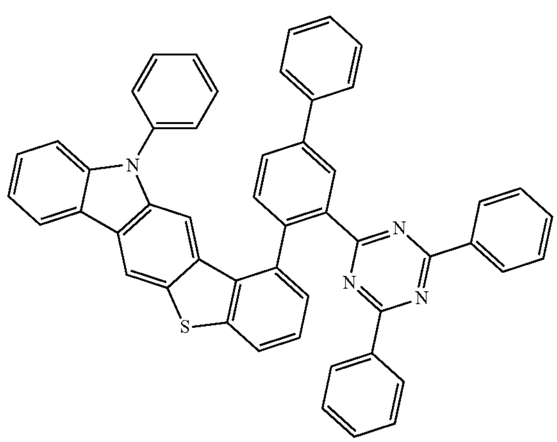
-continued
181
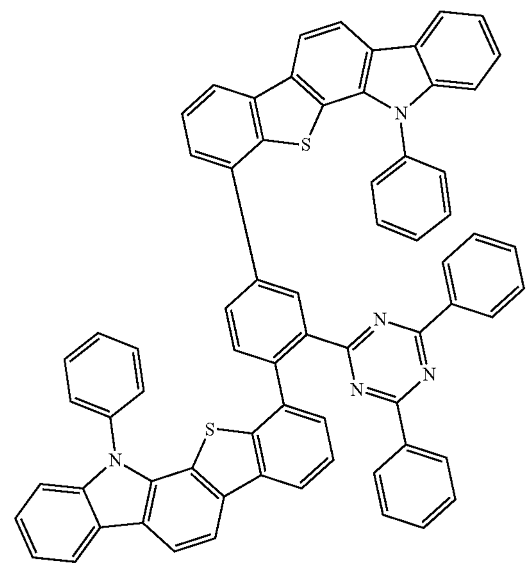
182
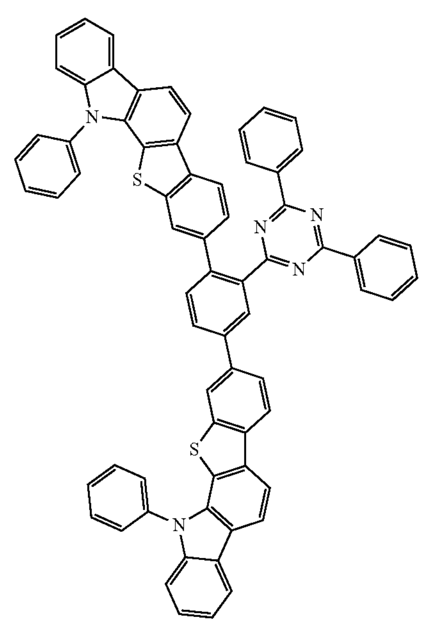

-continued
183
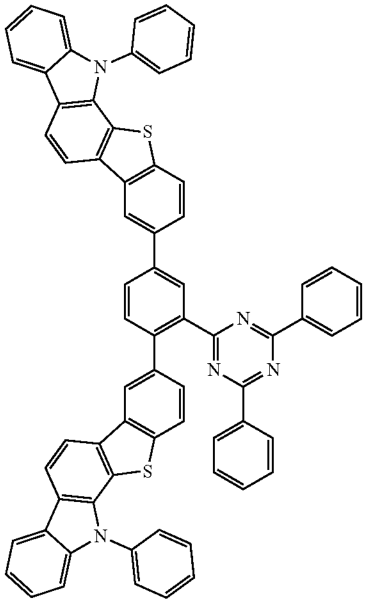
184
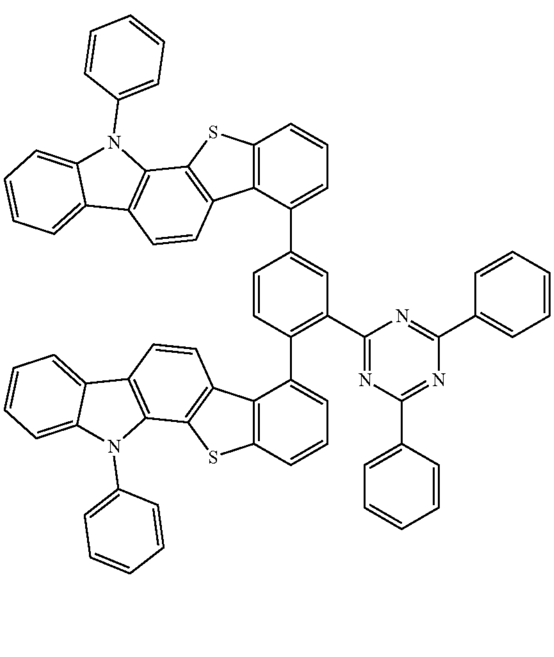
-continued
185
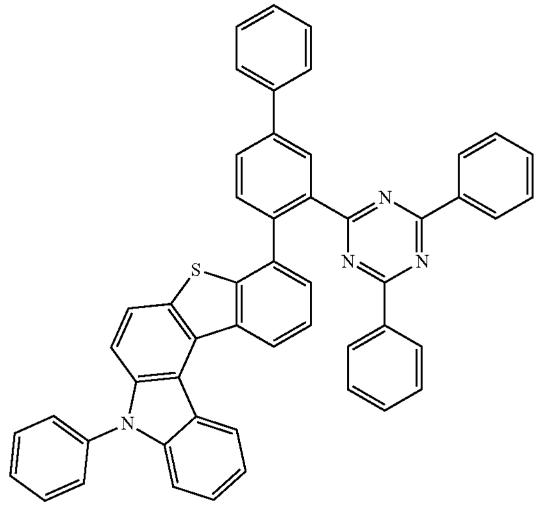
186
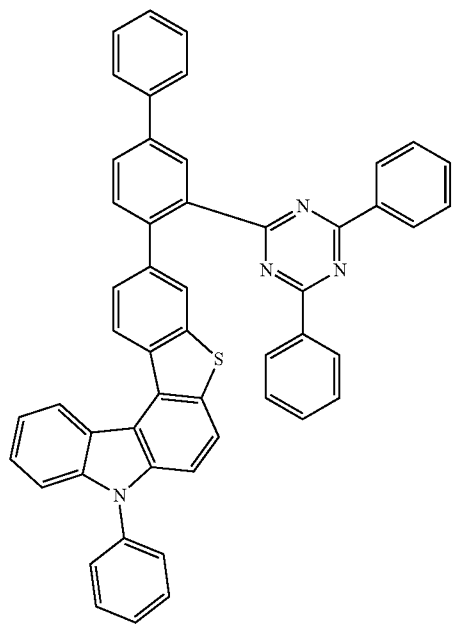
187
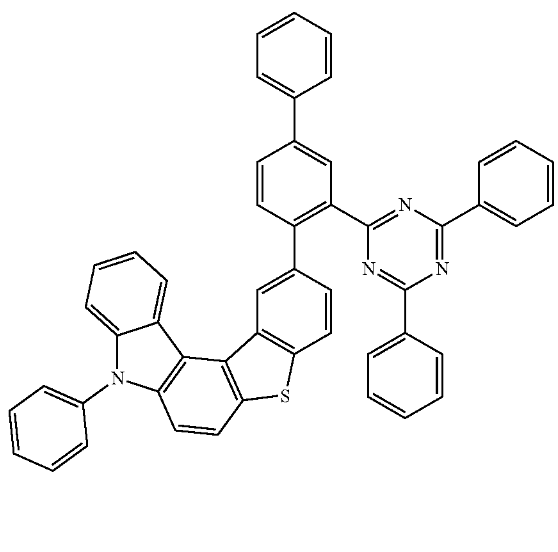

-continued
188
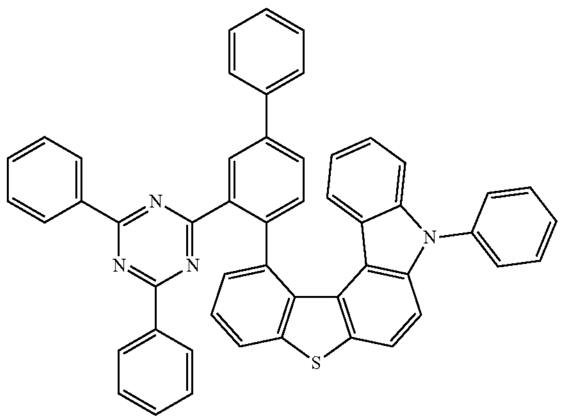
189
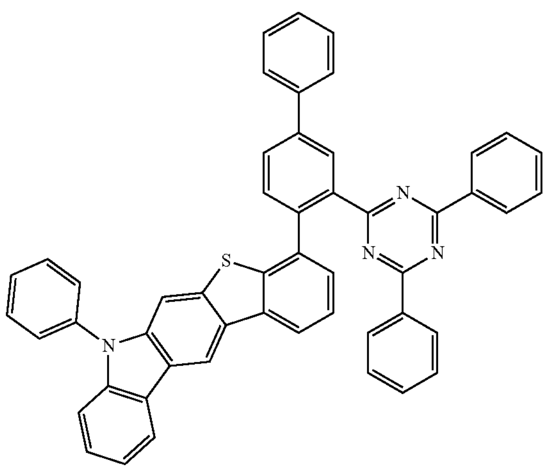
190
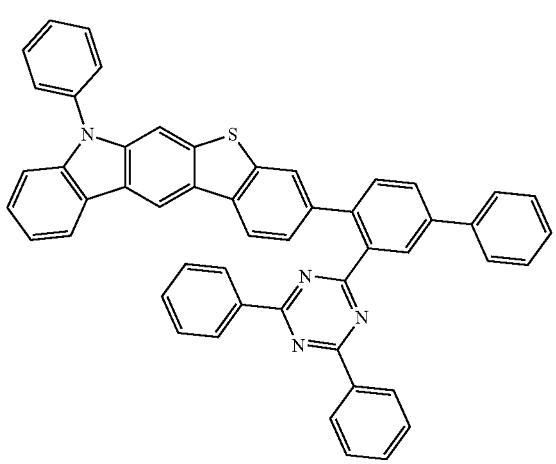
-continued
191
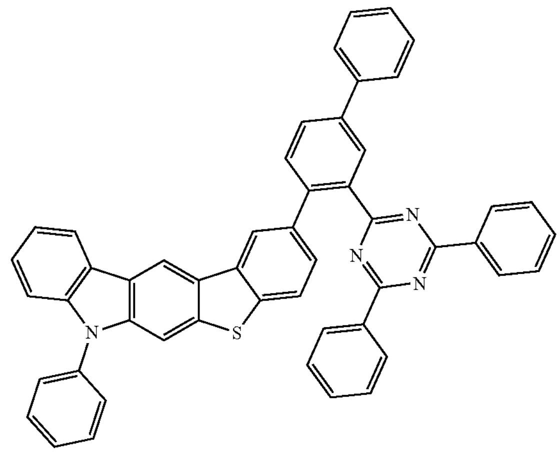
192
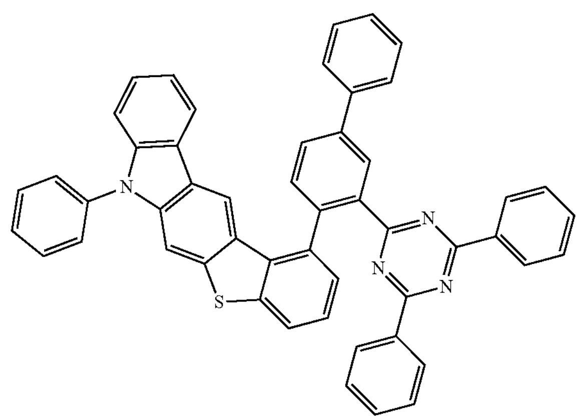
193
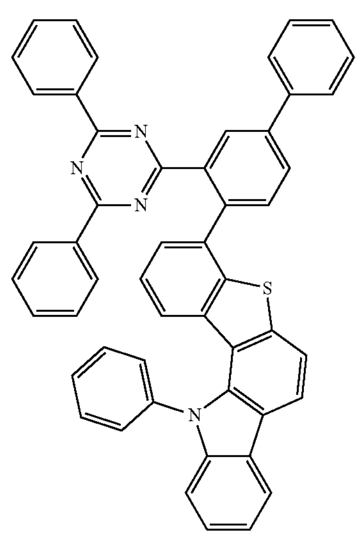

-continued
194
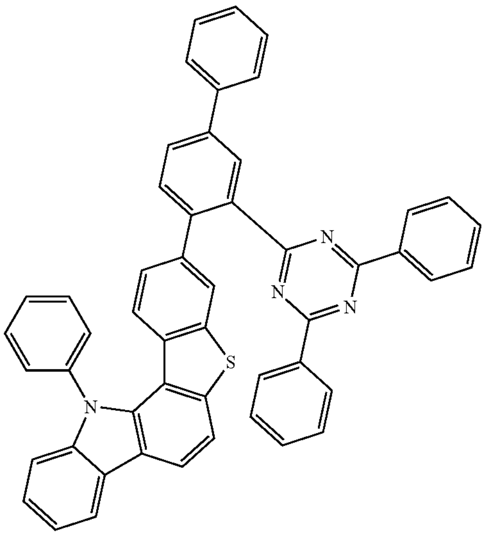
195
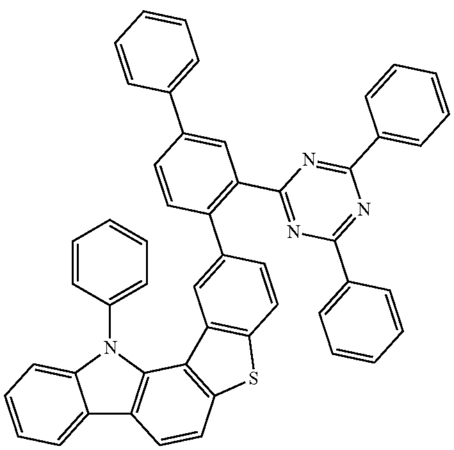
196
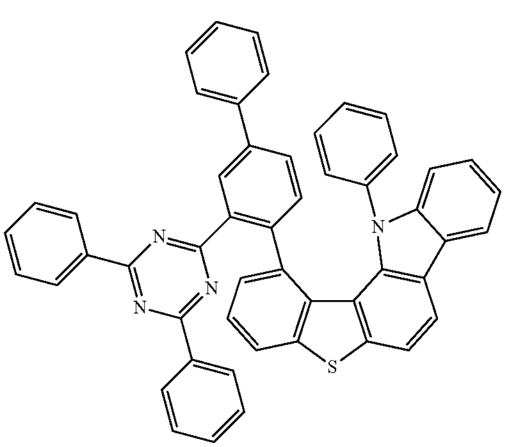
-continued
197
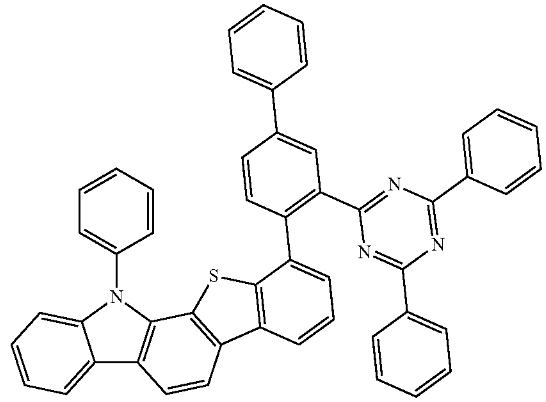
198
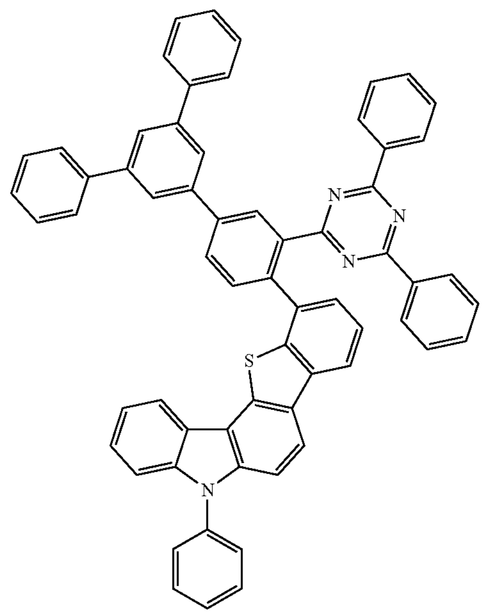
199
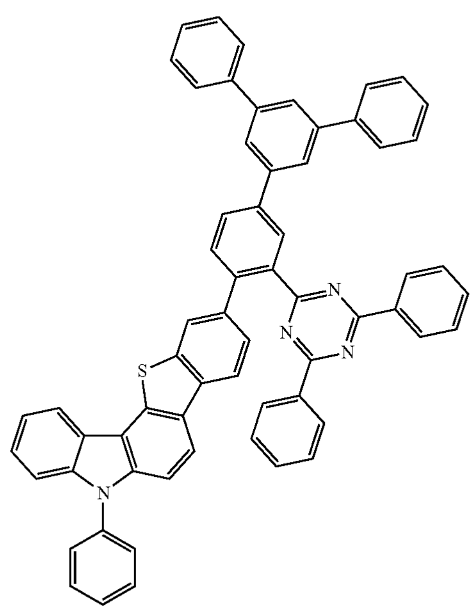

-continued
200
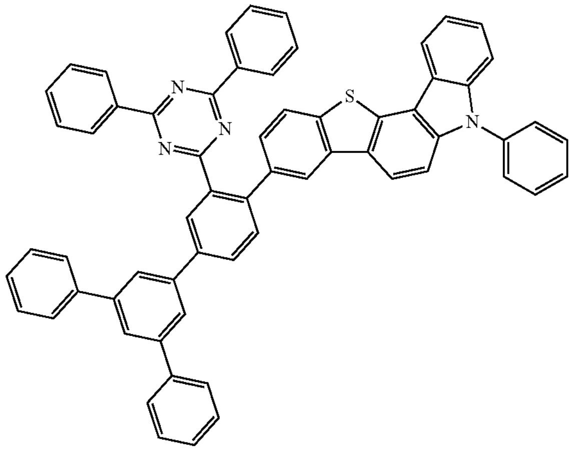
201
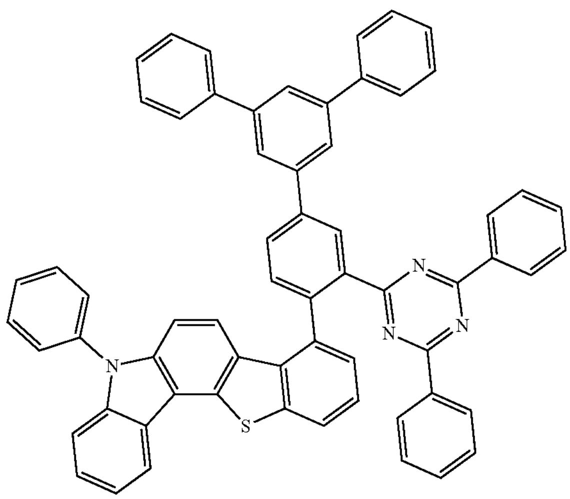
202
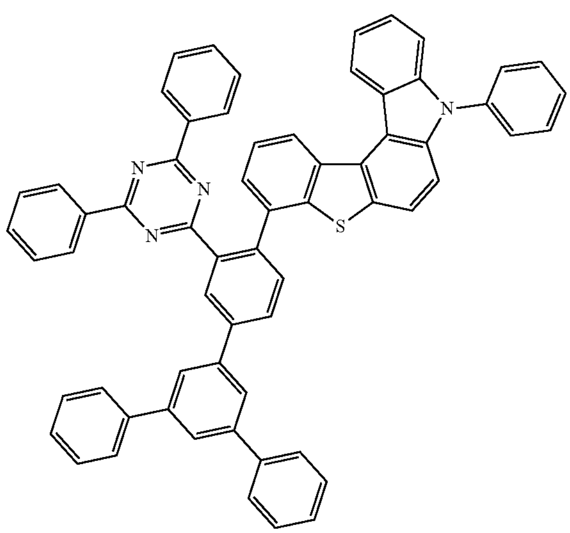
-continued
203
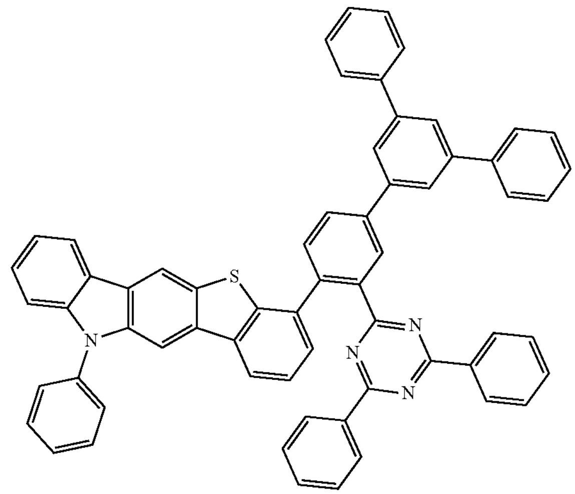
204
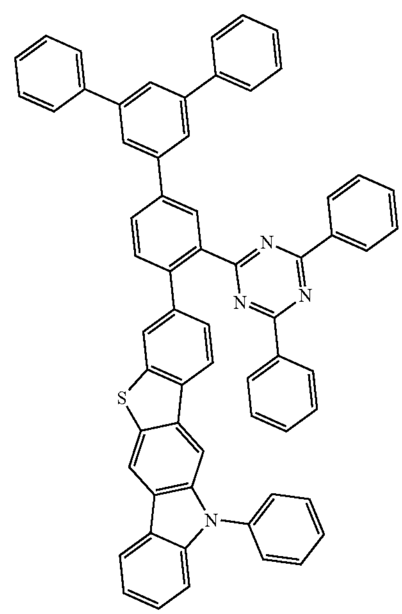

-continued
205
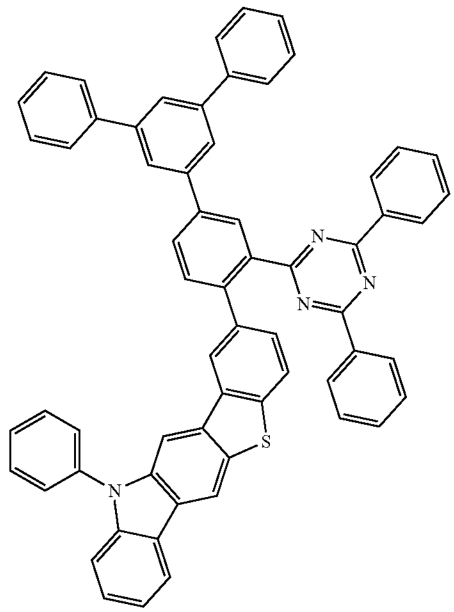
206
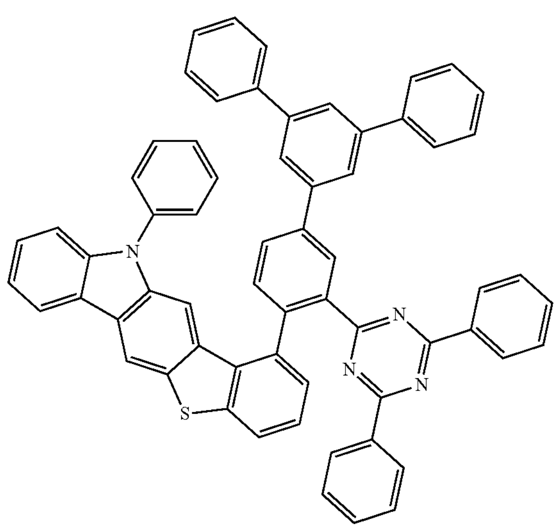
-continued
207
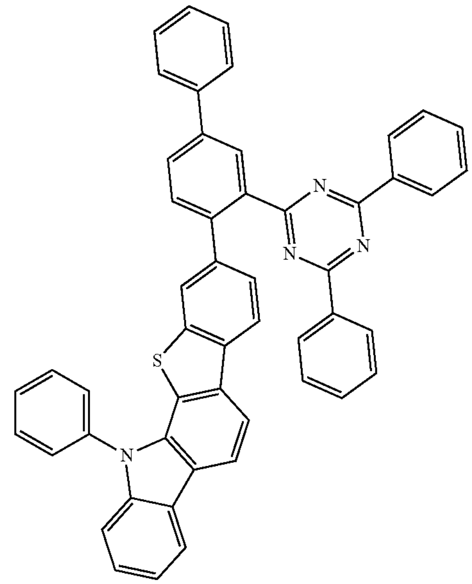
208
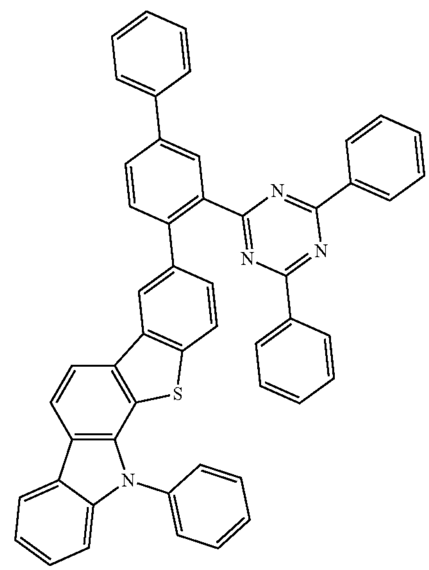
209
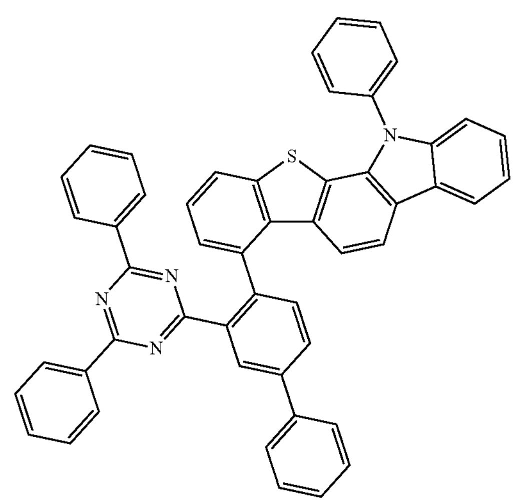

-continued
210
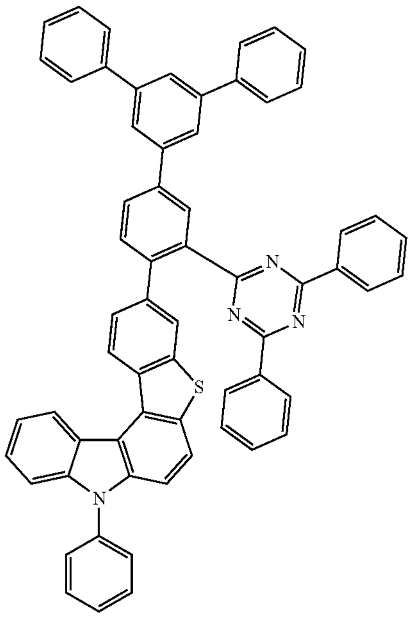
211
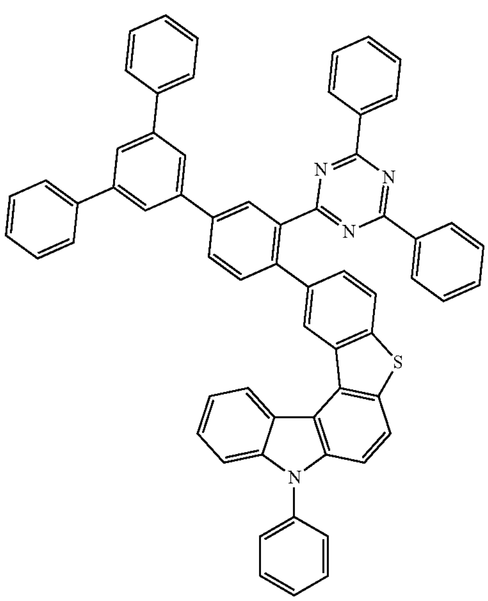
-continued
212
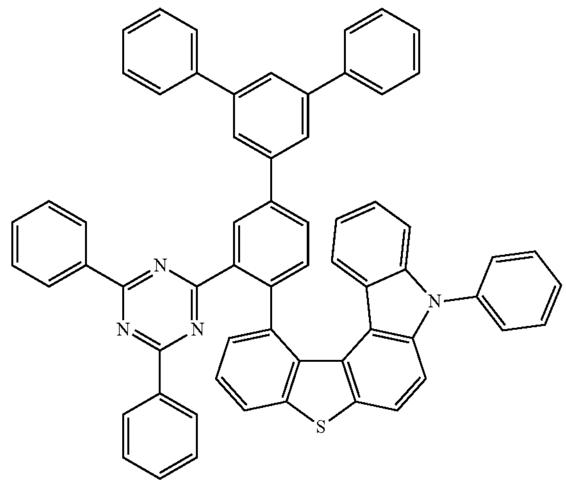
213
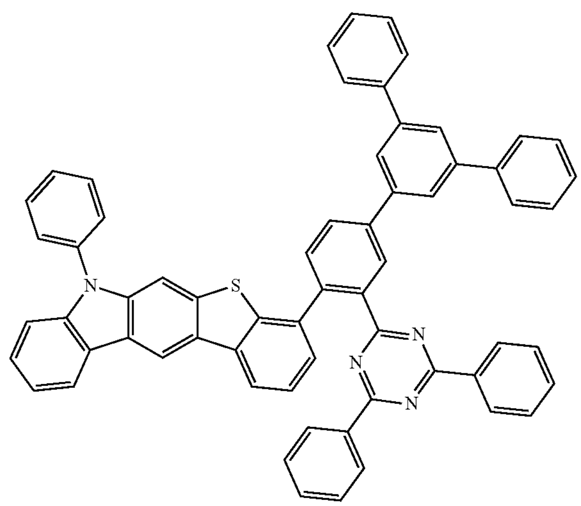
214
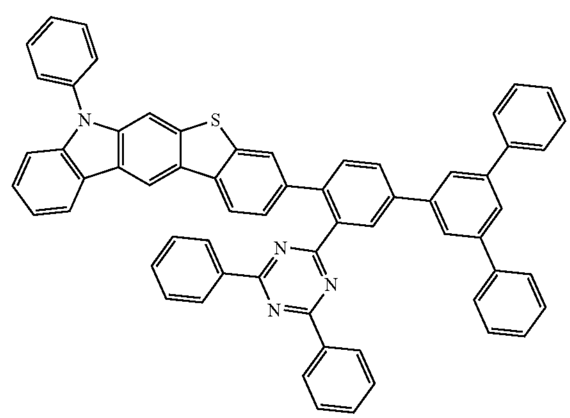

-continued
215
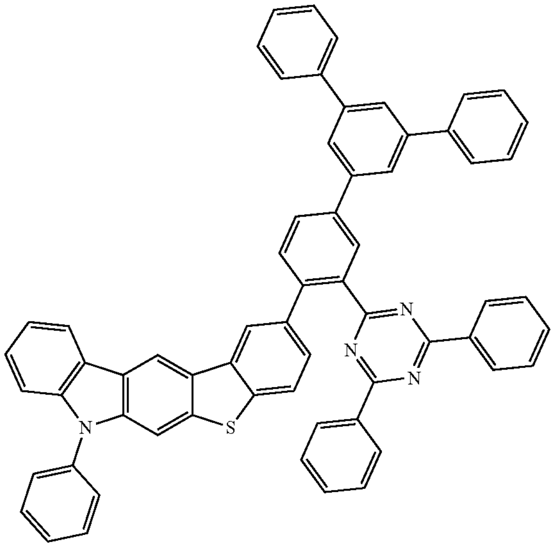
216
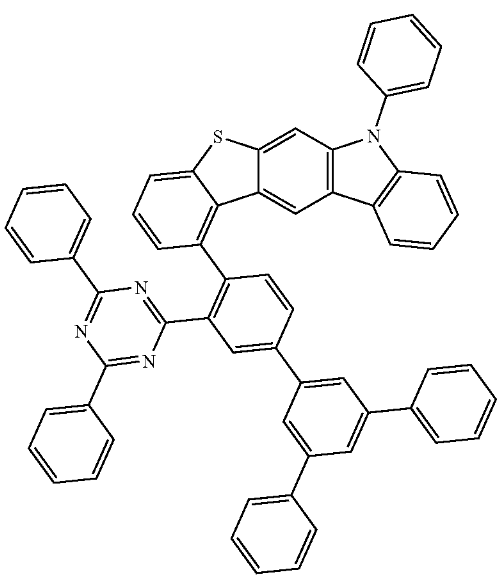
-continued
217
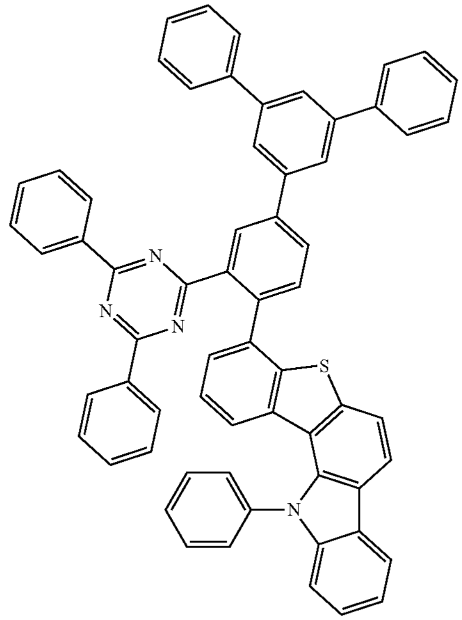
218
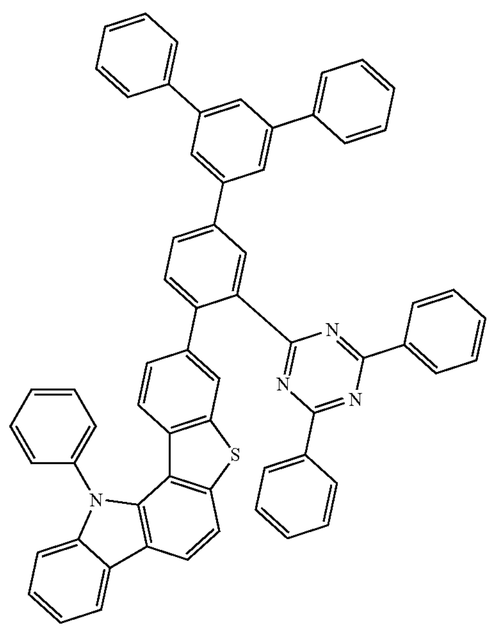

-continued
219
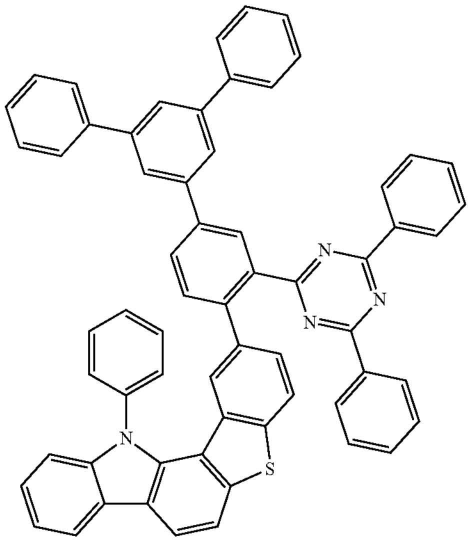
220
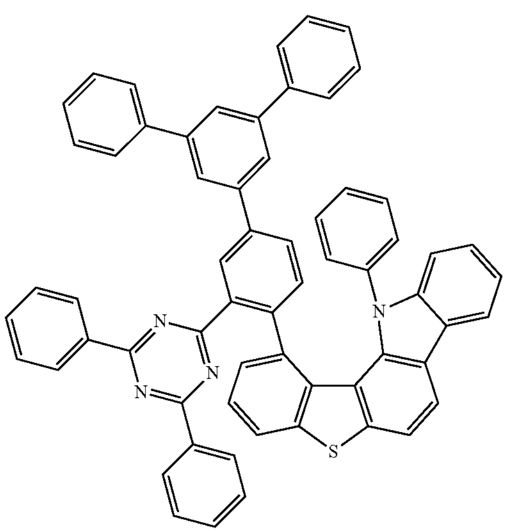
-continued
221
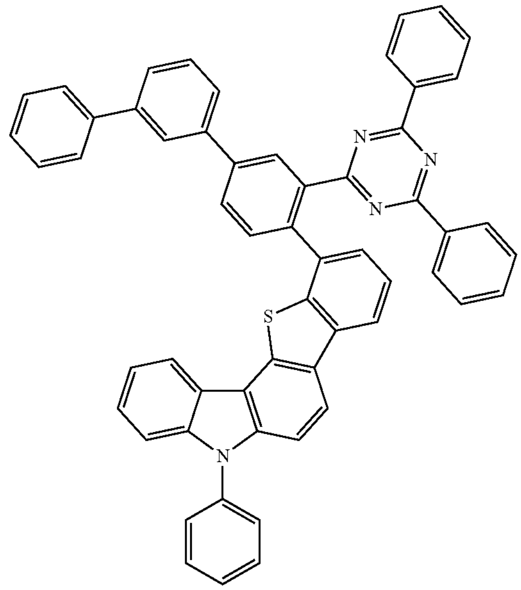
222
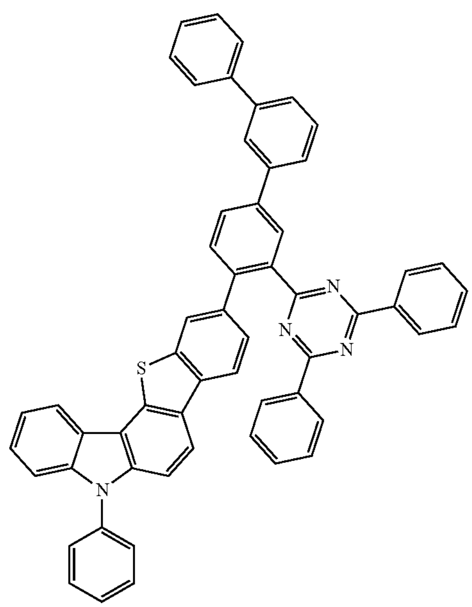

223
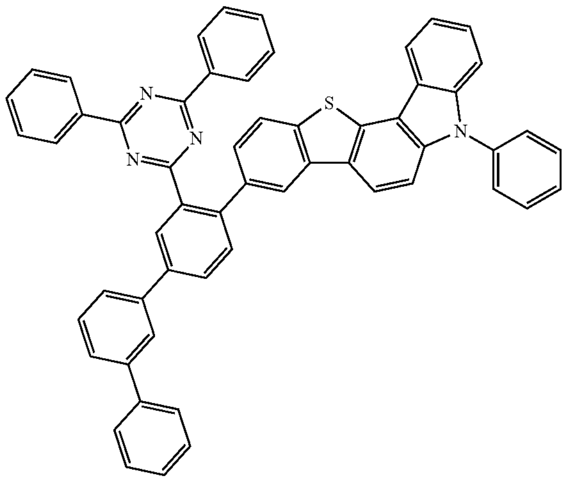
224
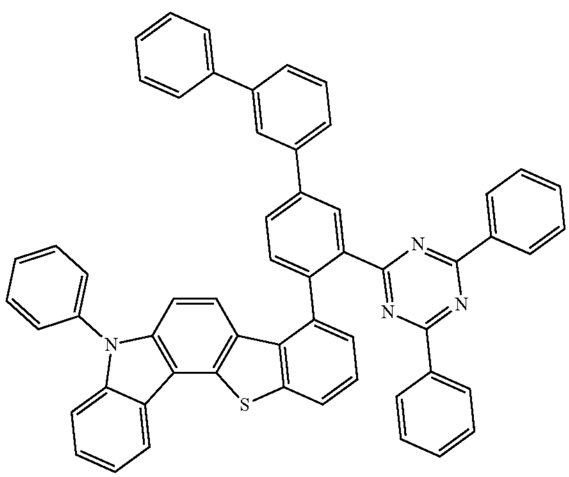
225
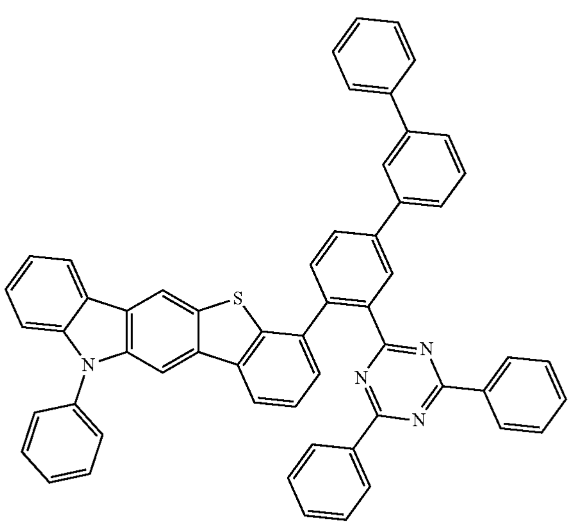
226
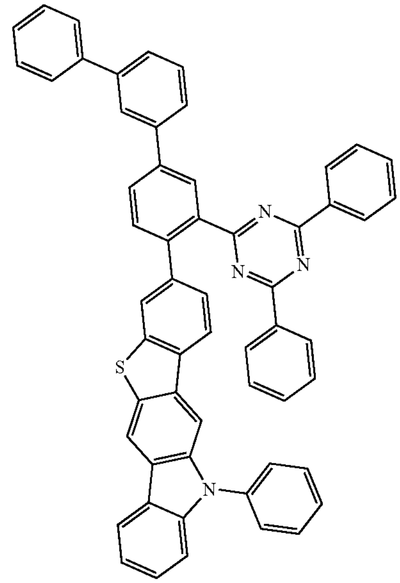
227
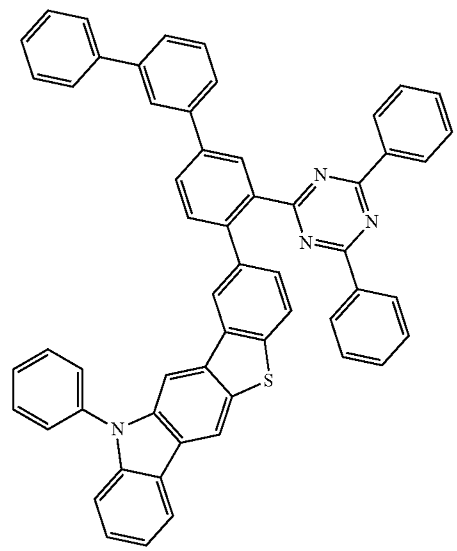
228
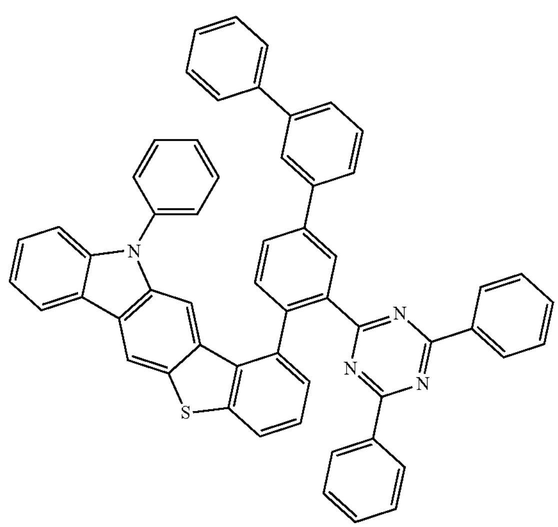

229
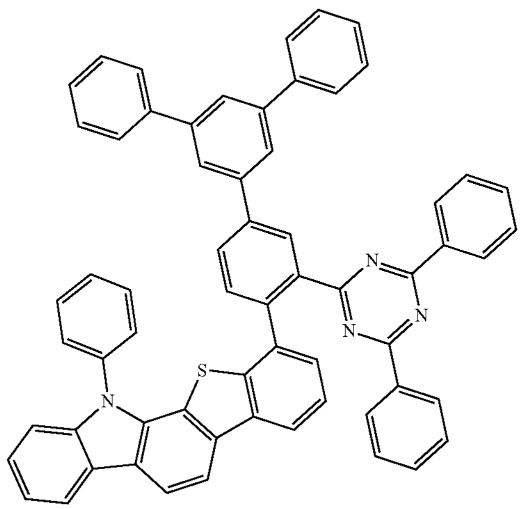
230
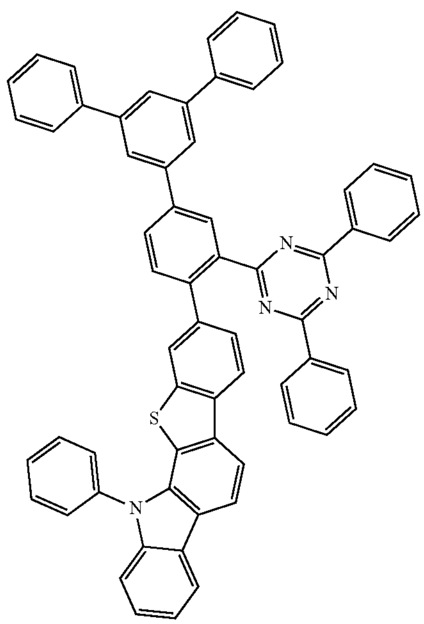
231
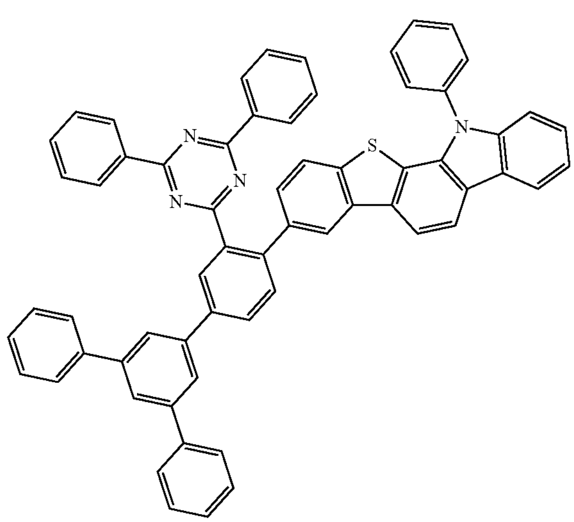
232
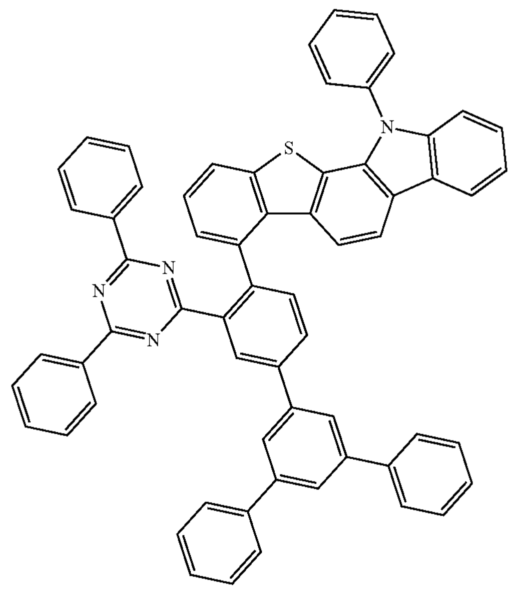
233
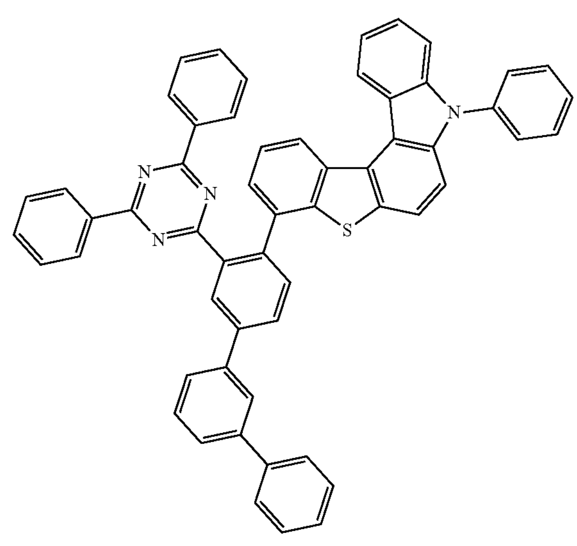

234
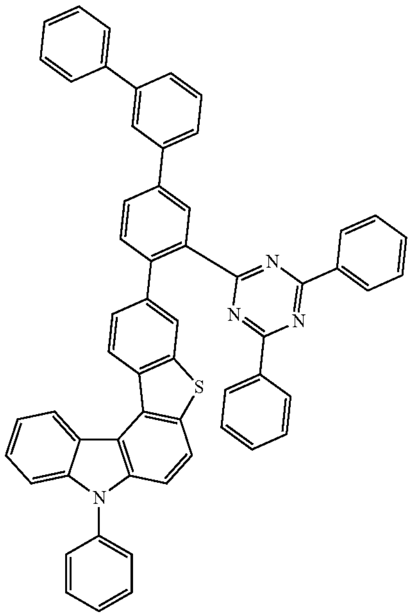
235
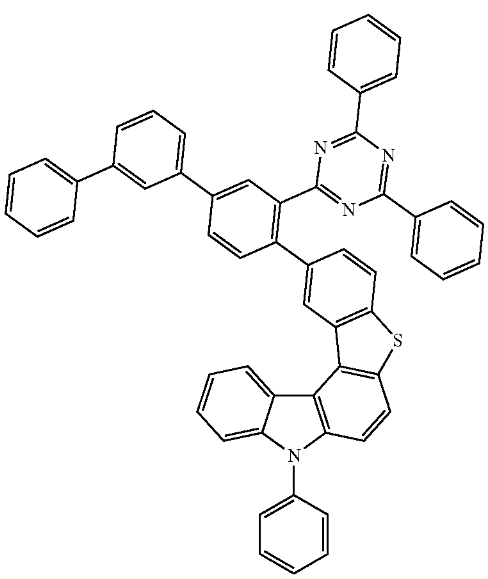
236
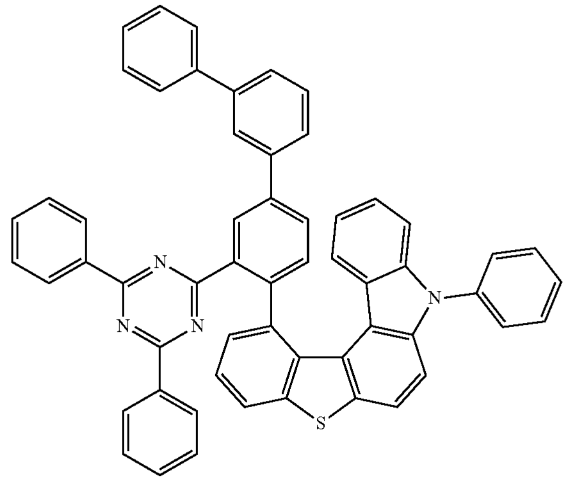
237
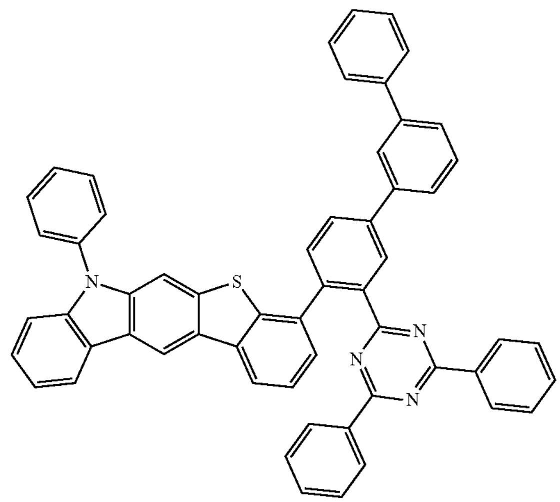
238
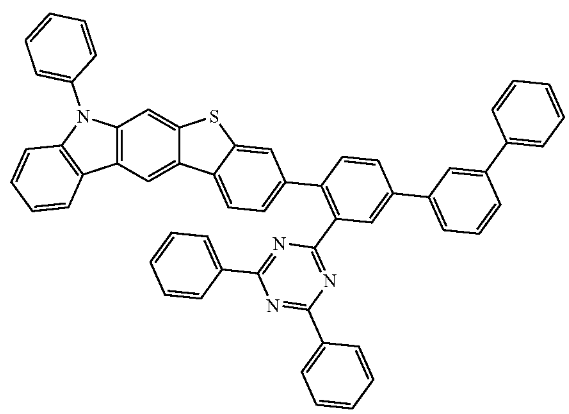

239
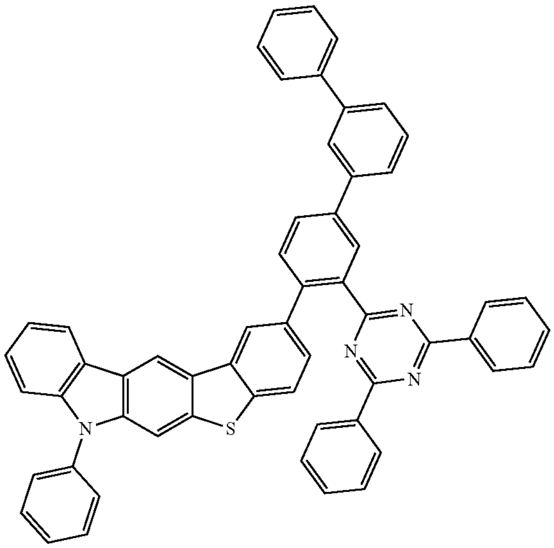
240
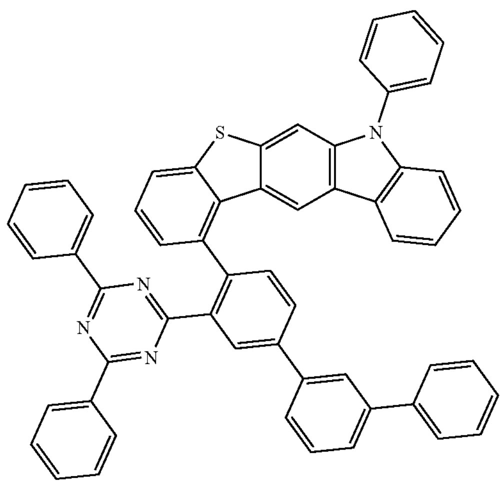
241
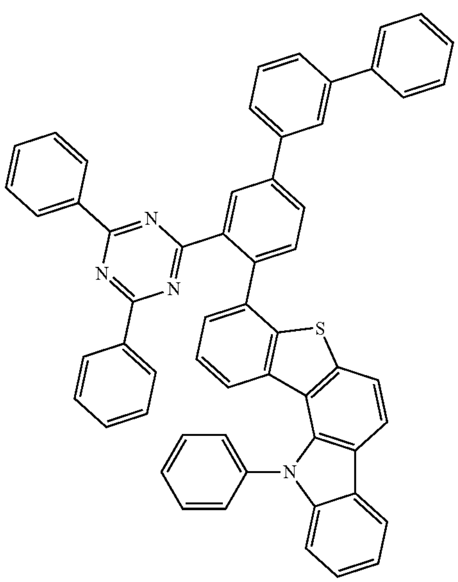
242
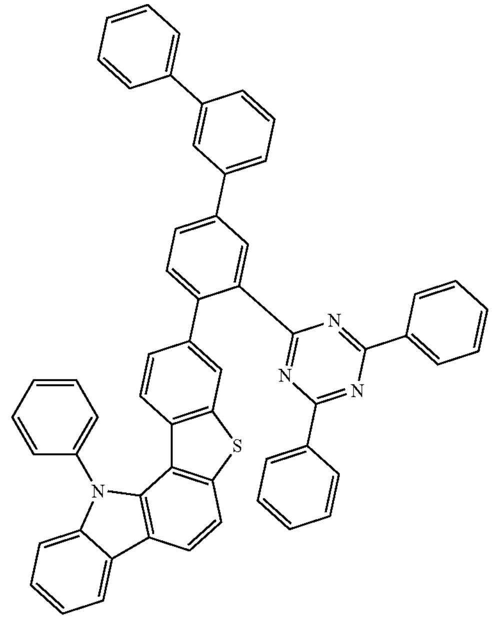
243
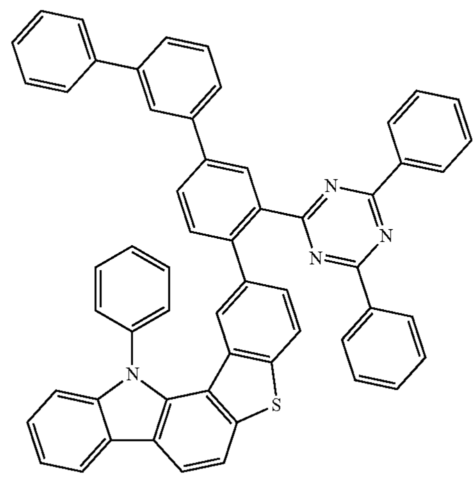
244
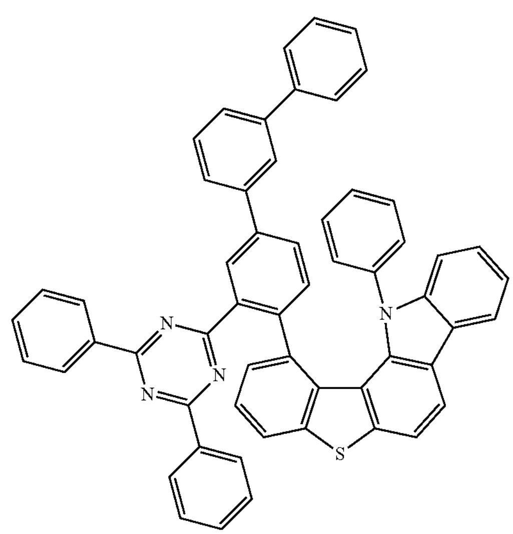

-continued
245
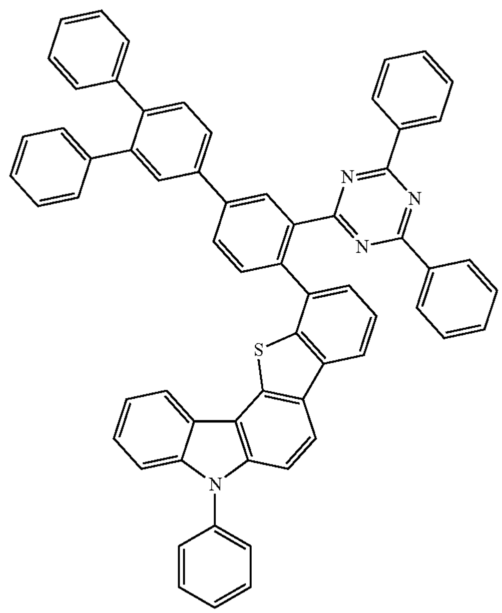
246
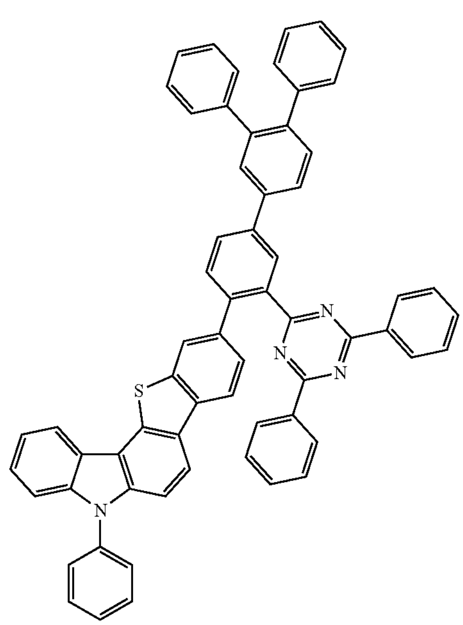
-continued
247
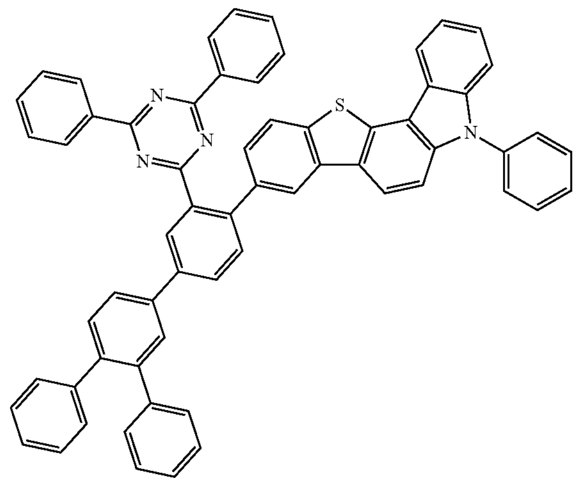
248
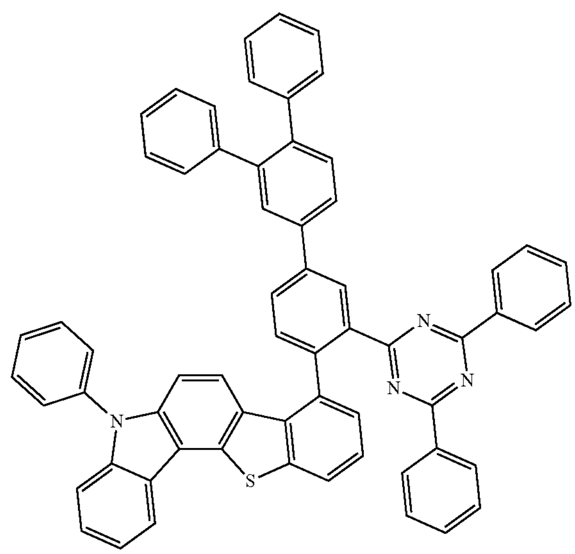
249
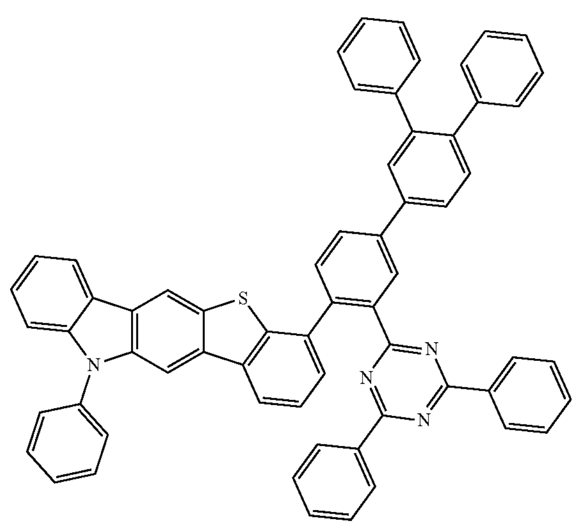

250
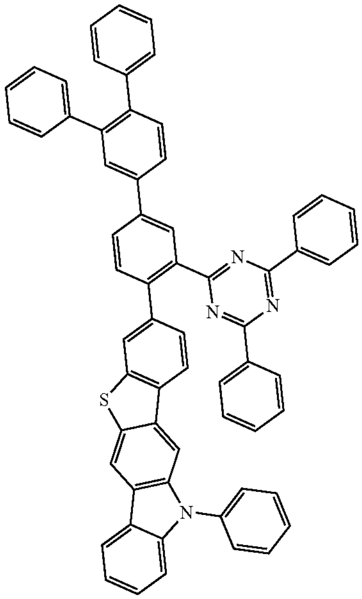
251
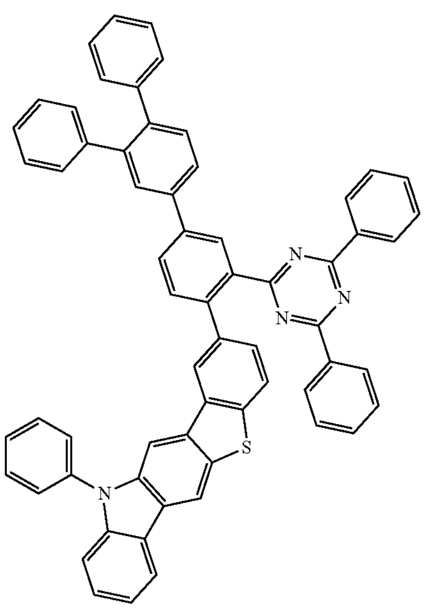
252
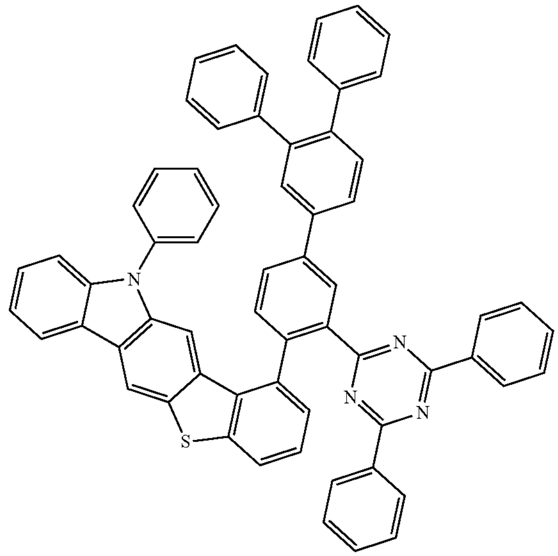
253
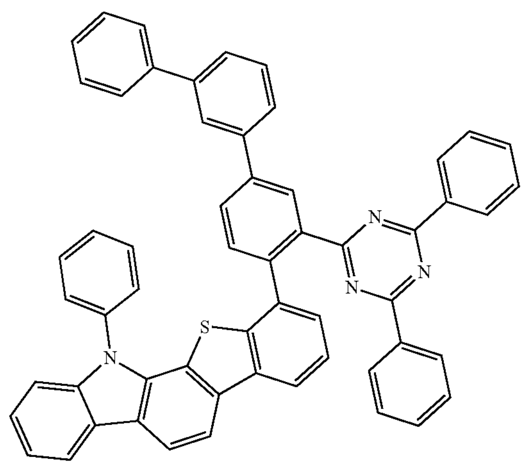
254
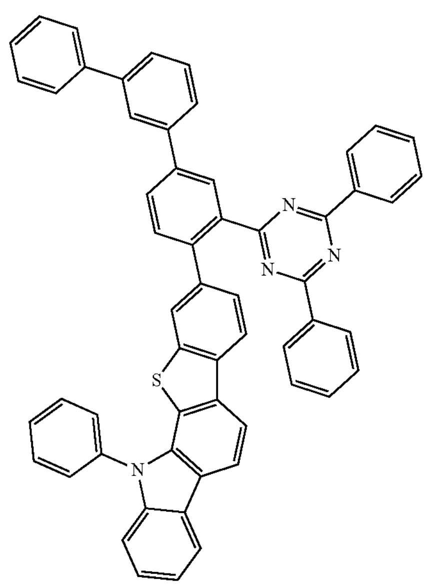

-continued
255
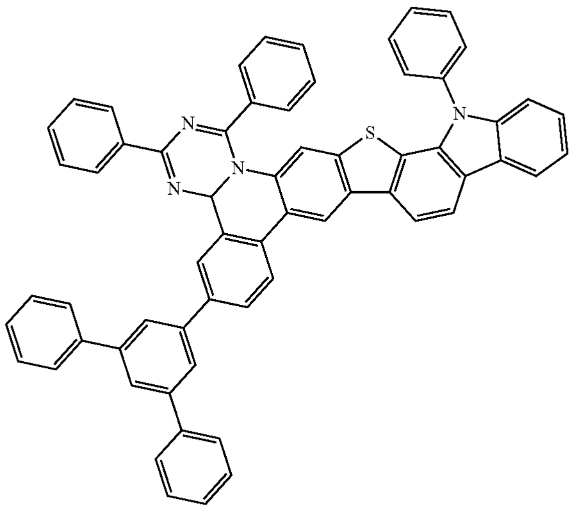
256
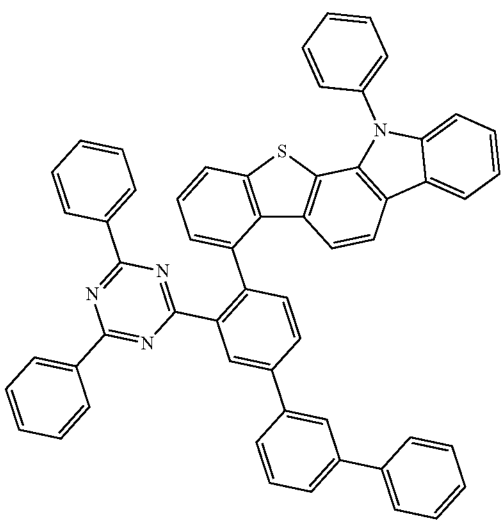
257
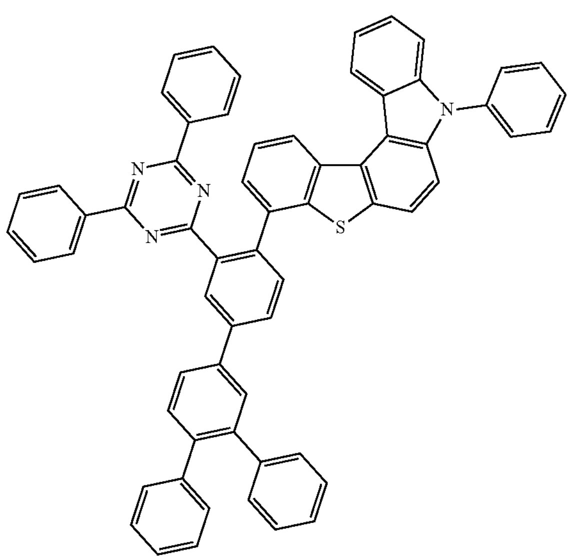
-continued
258
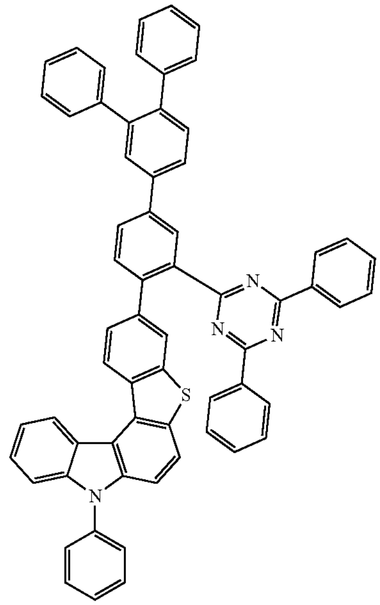
259
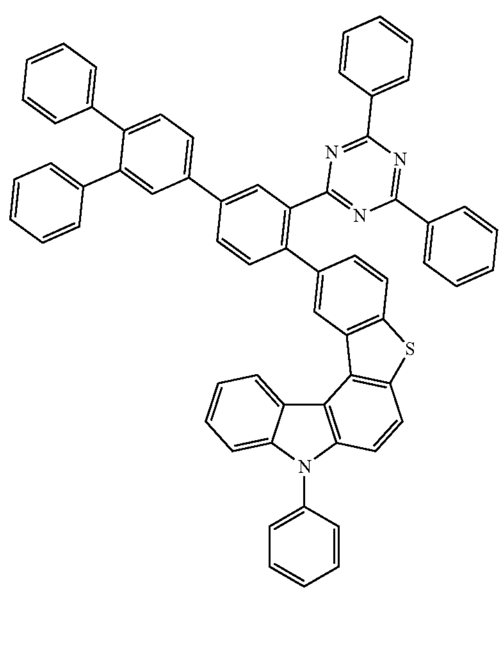

-continued
260
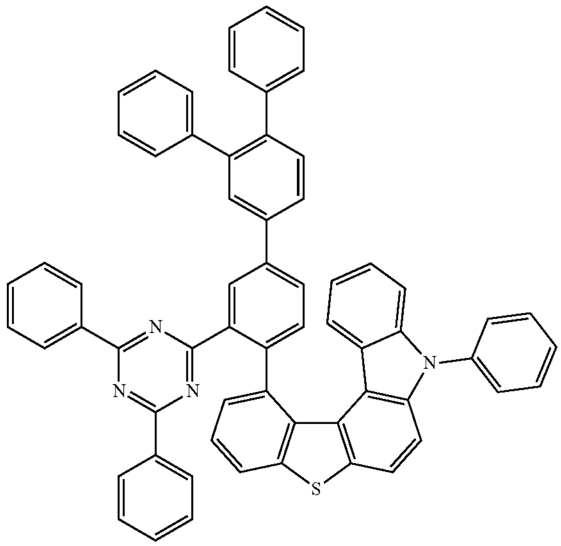
261
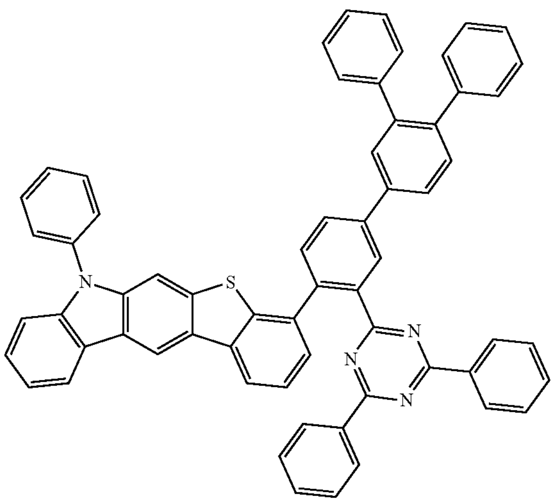
262
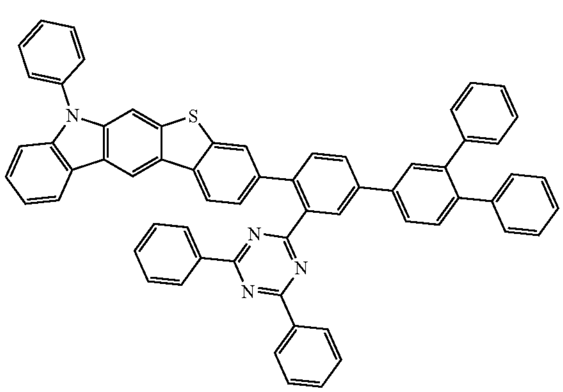
-continued
263
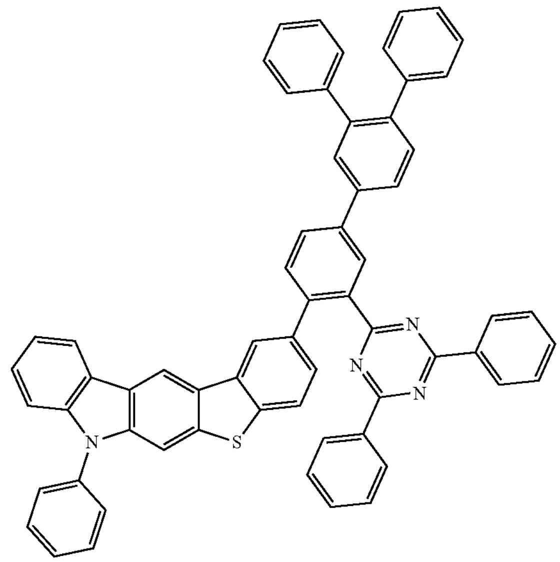
264
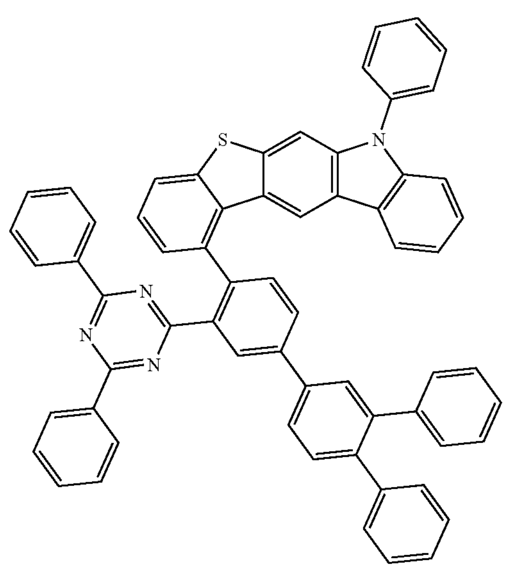

-continued
265
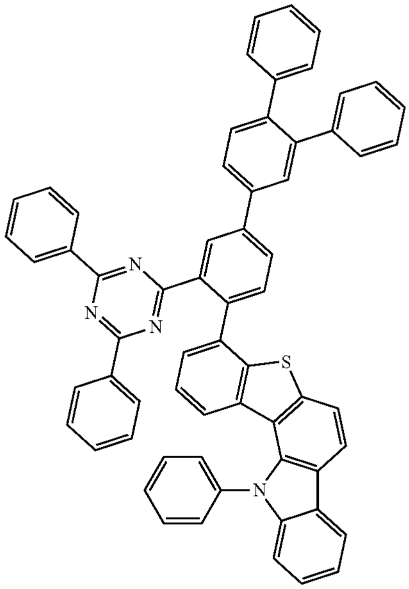
266
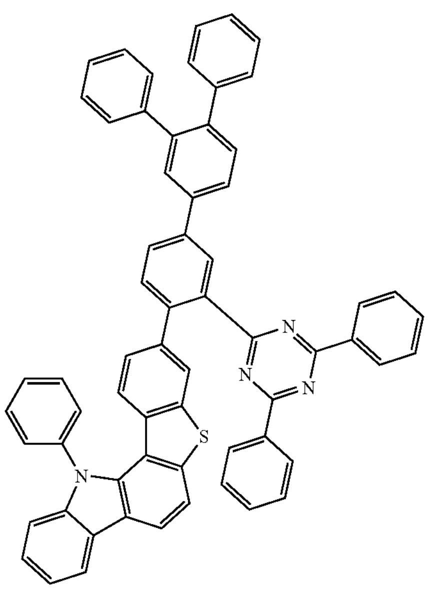
-continued
267
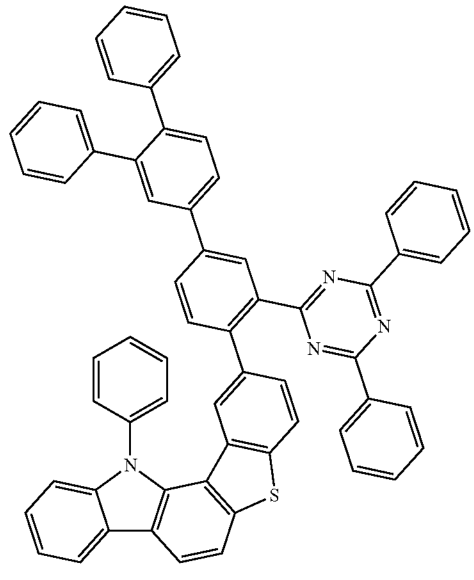
268
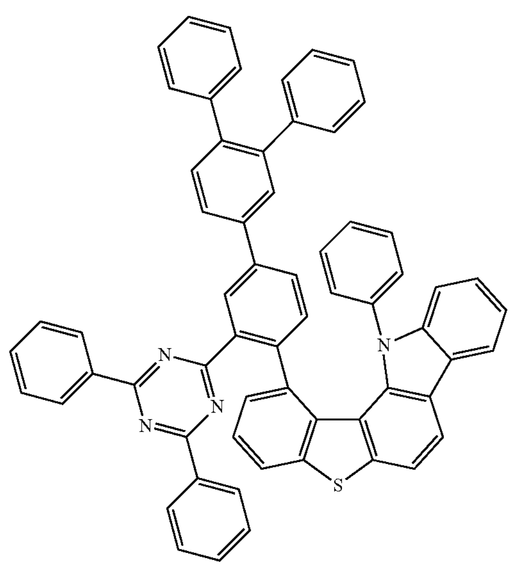

-continued
269
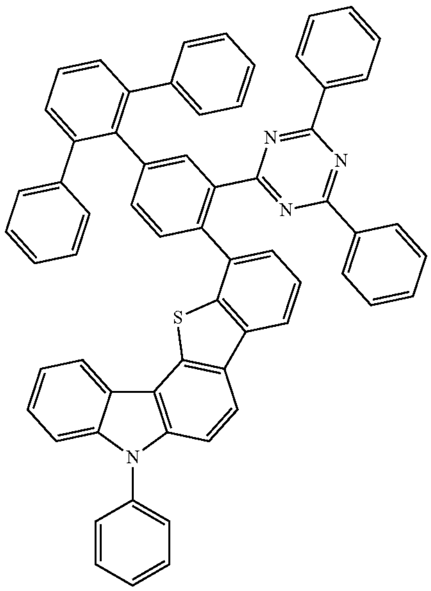
270
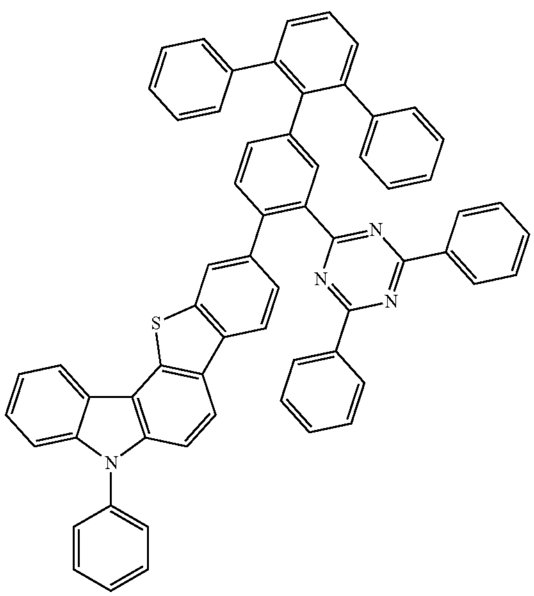
271
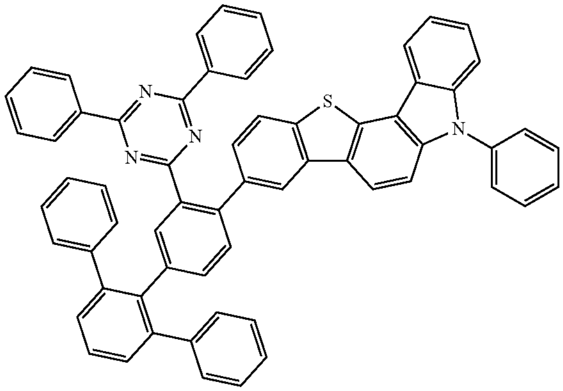
-continued
272
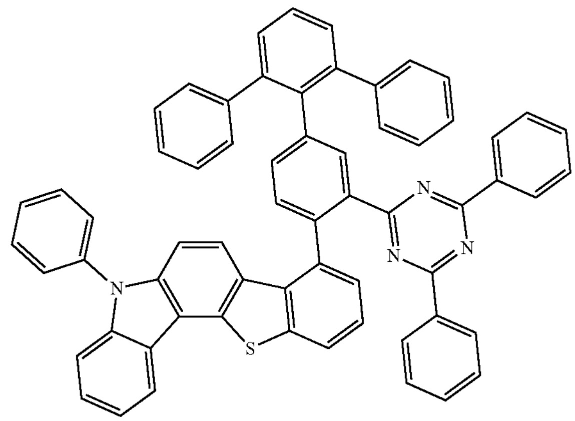
273
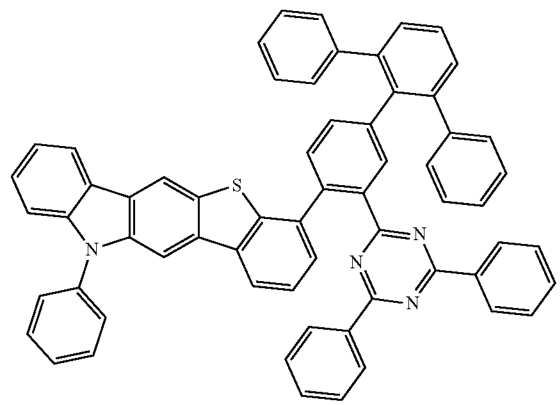
274
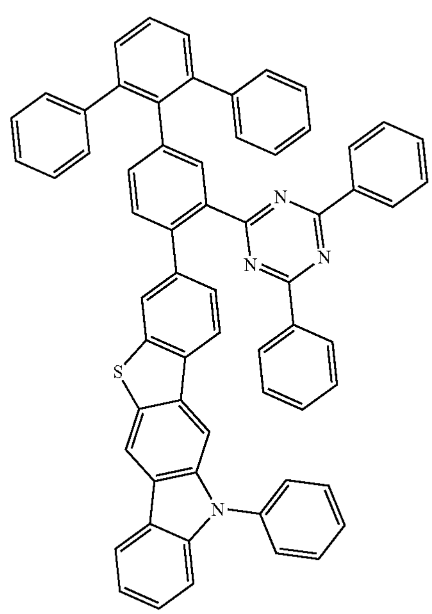

-continued
275
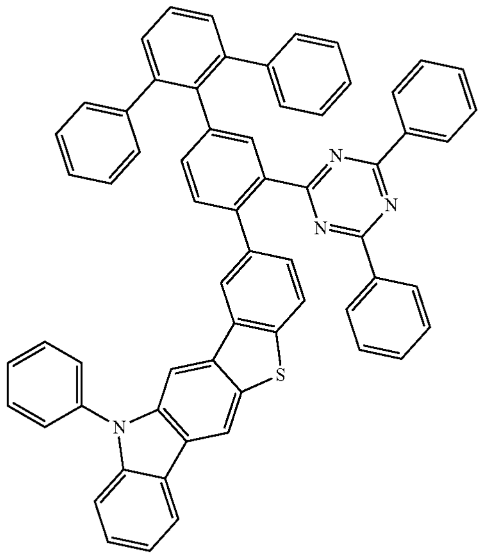
276
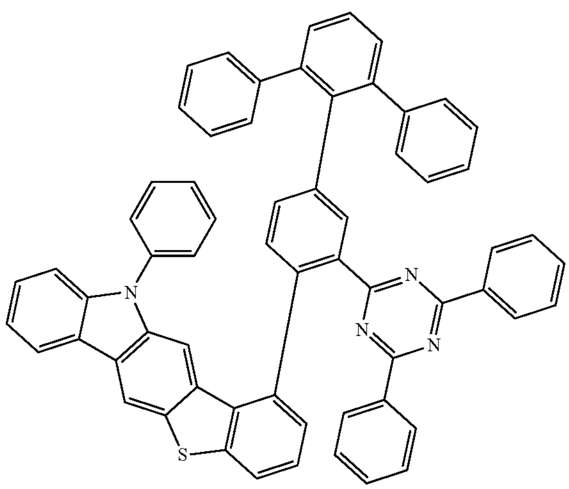
277
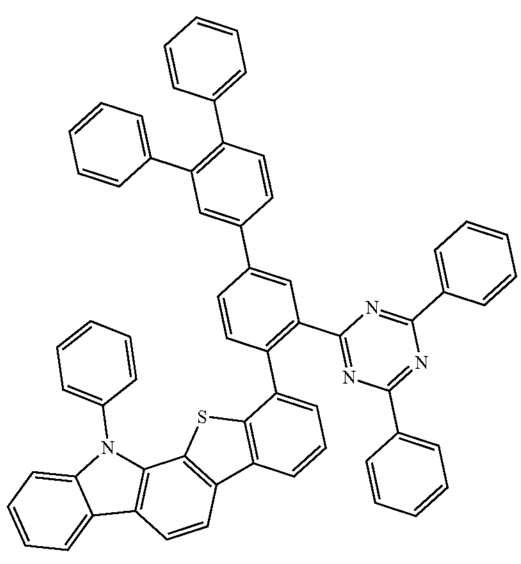
-continued
278
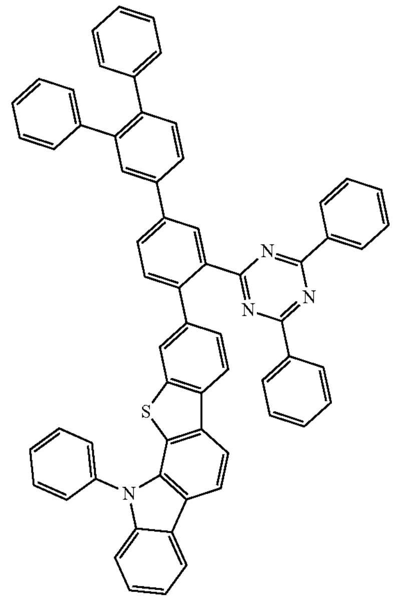
279
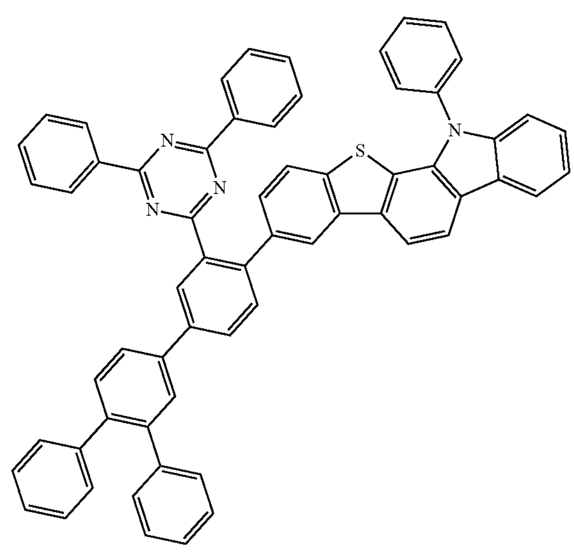

-continued
280
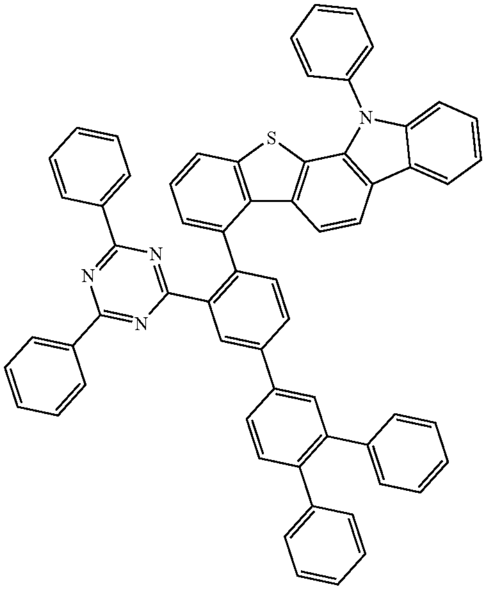
281
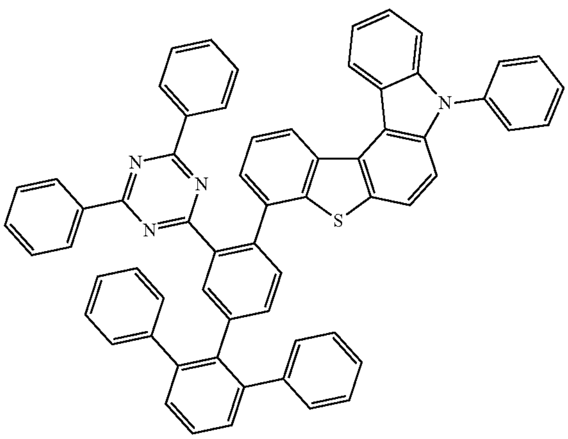
282
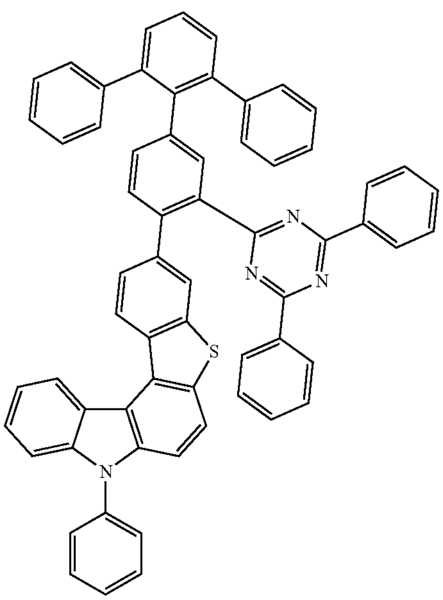
-continued
283
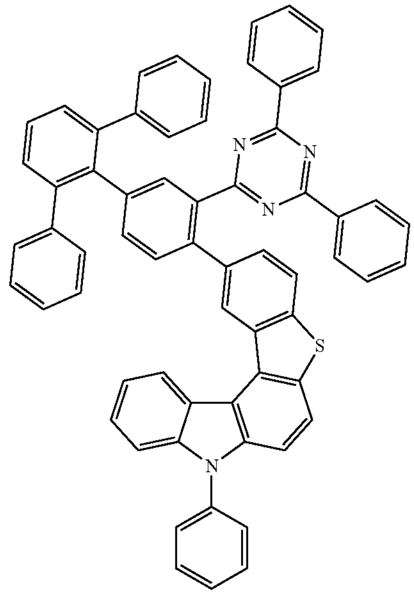
284
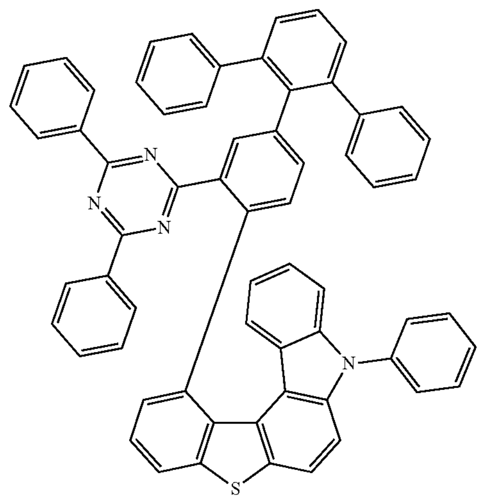
285
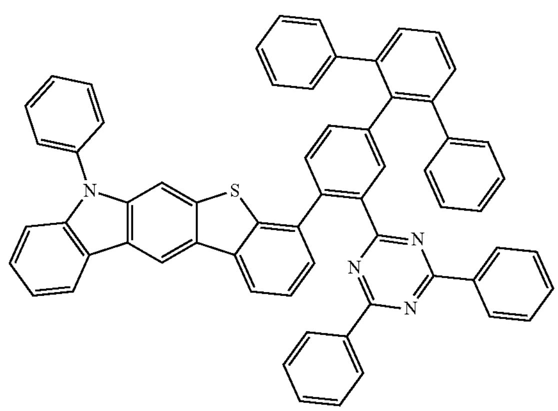

-continued
286
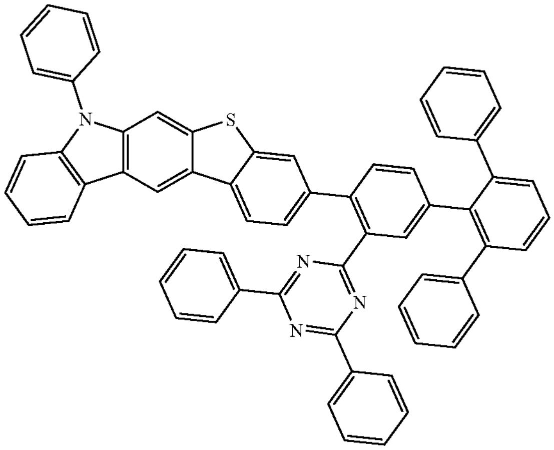
287
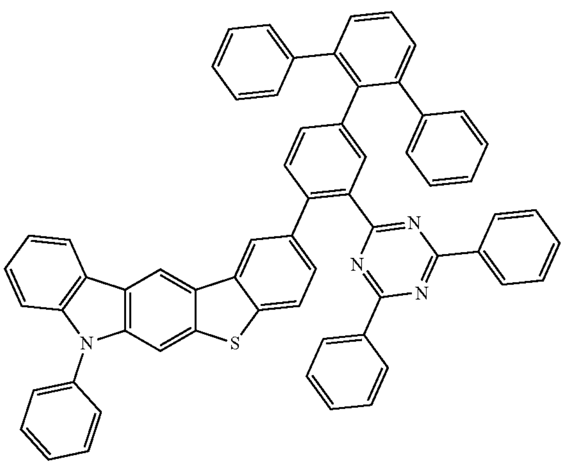
288
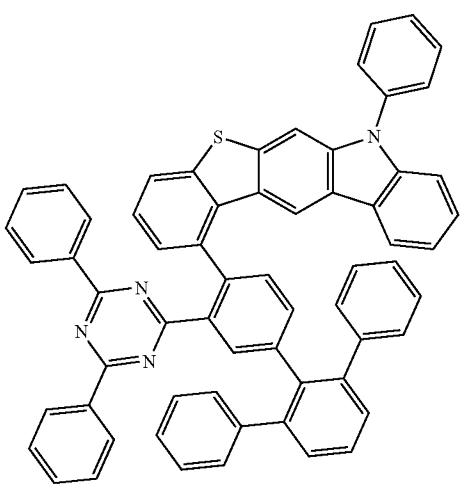
-continued
289
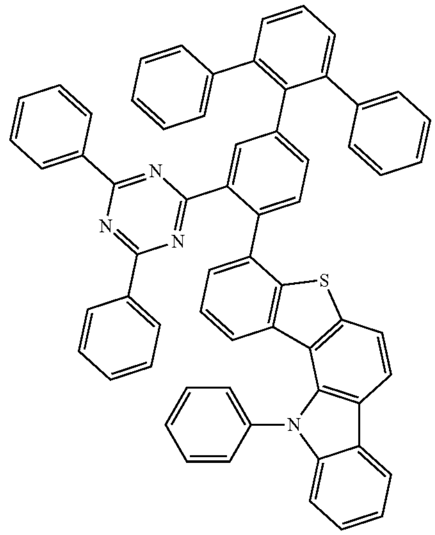
290
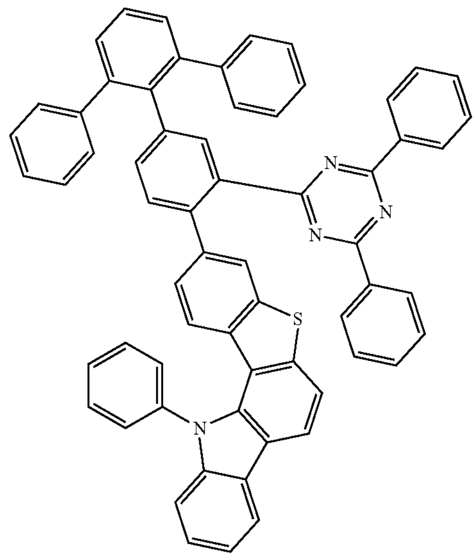
291
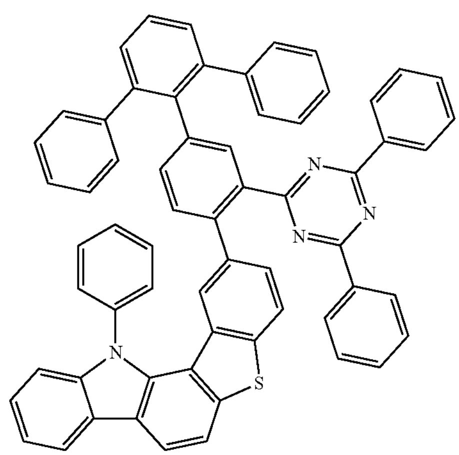

-continued
292
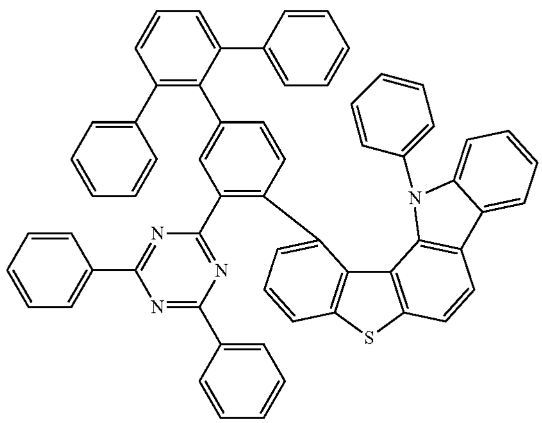
293
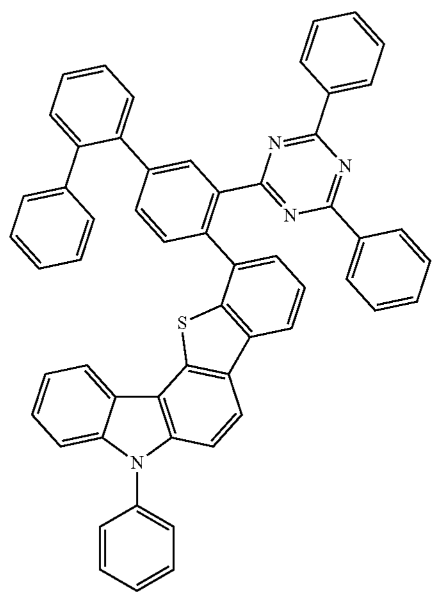
294
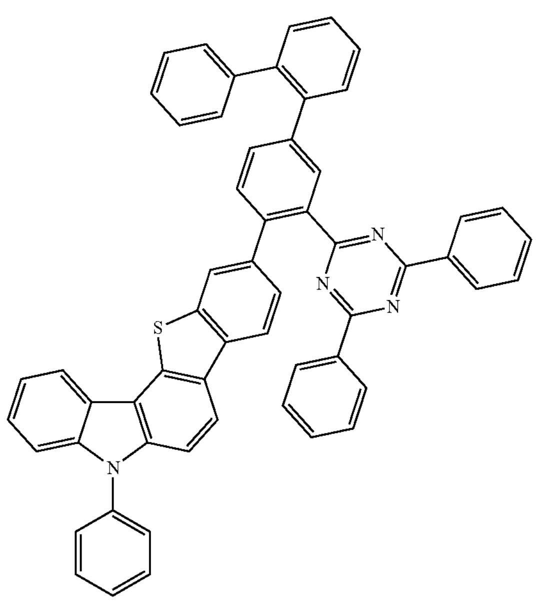
-continued
295
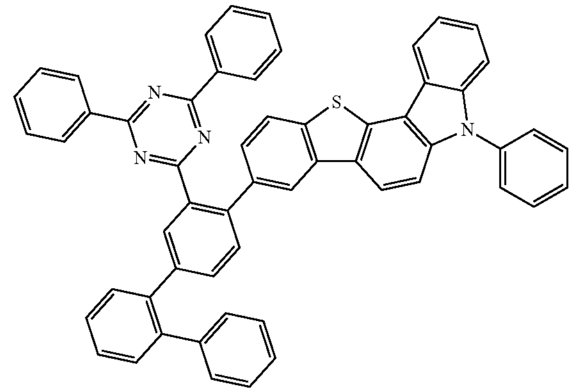
296
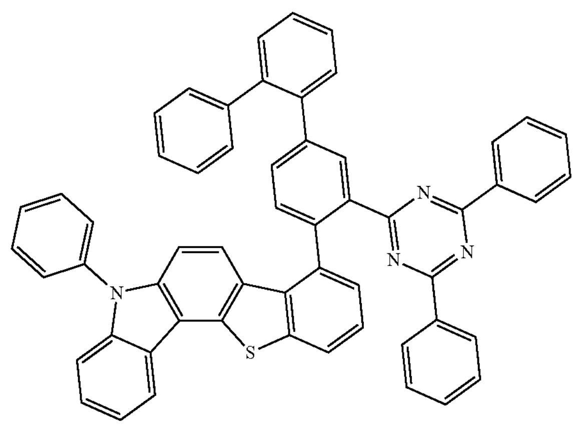
297
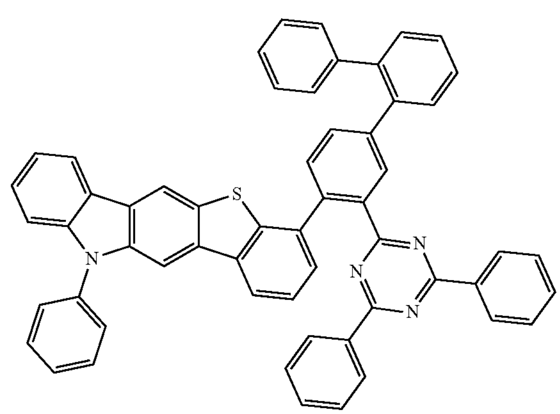

-continued
298
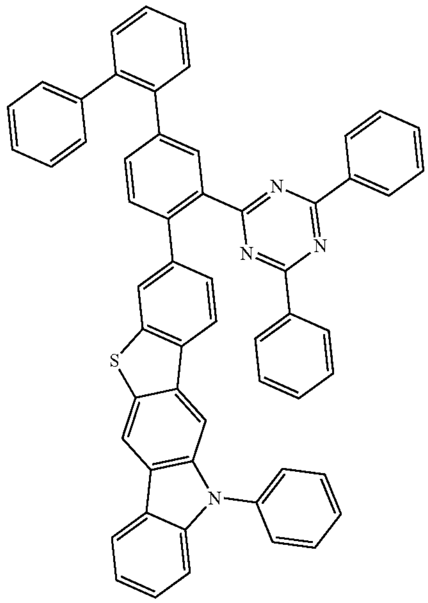
299
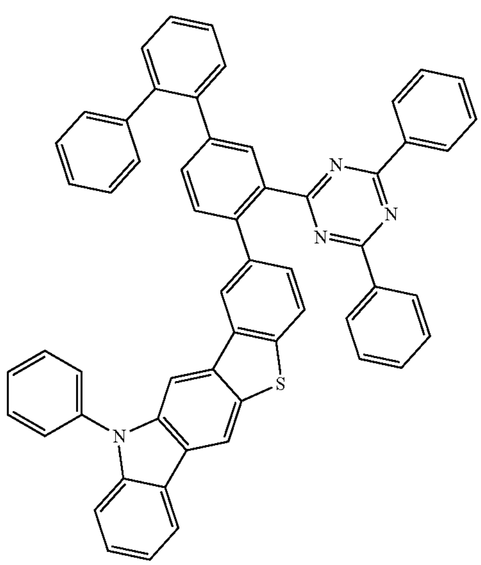
-continued
300
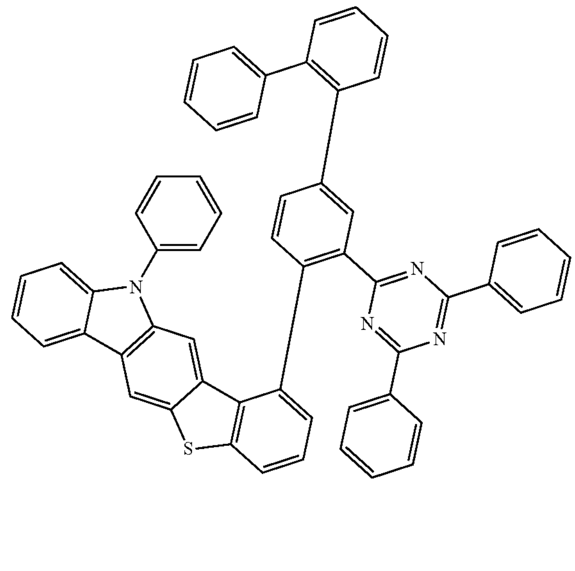
301
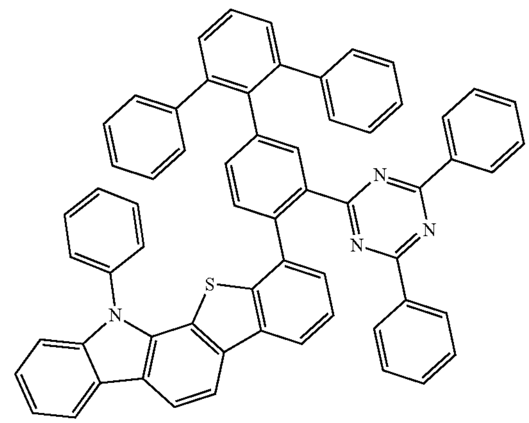
302
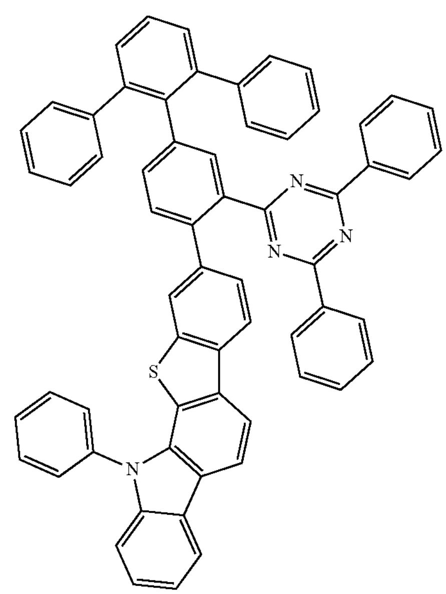

303
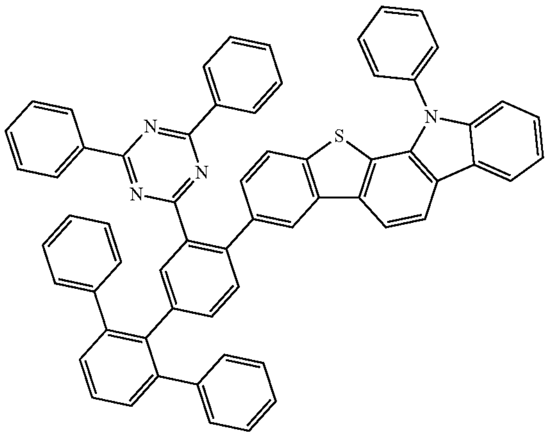
304
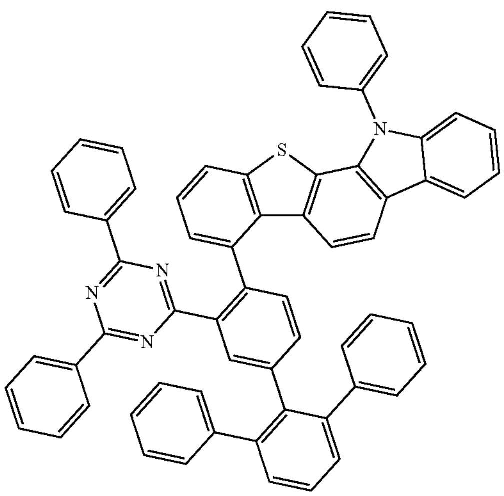
305
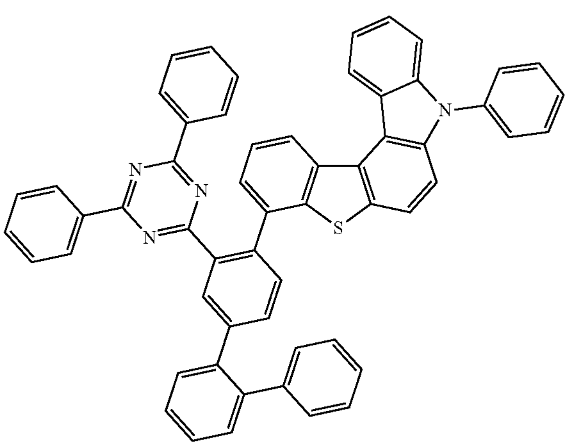
306
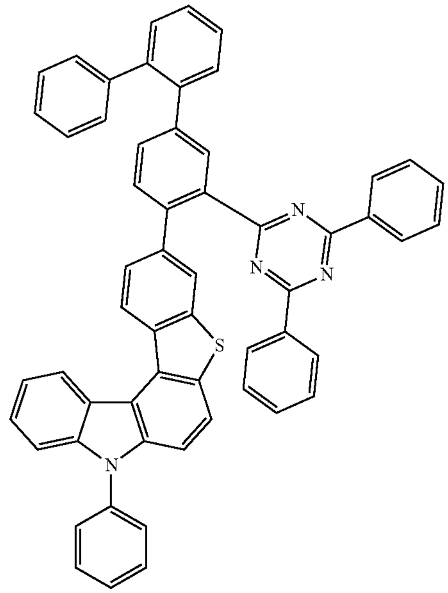
307
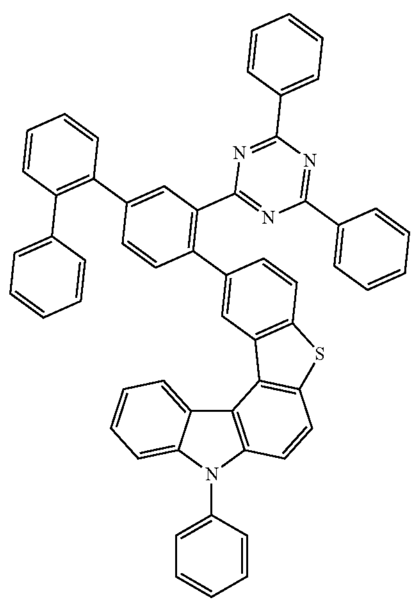

-continued
308
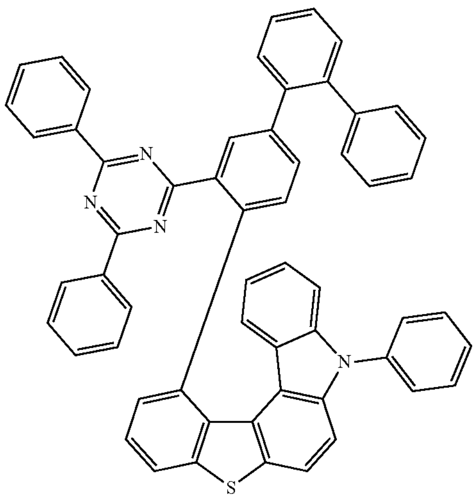
309
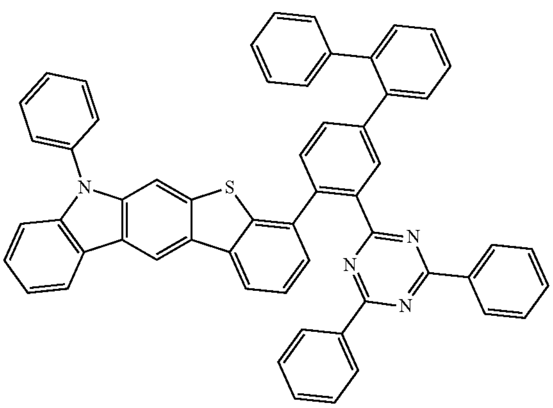
310
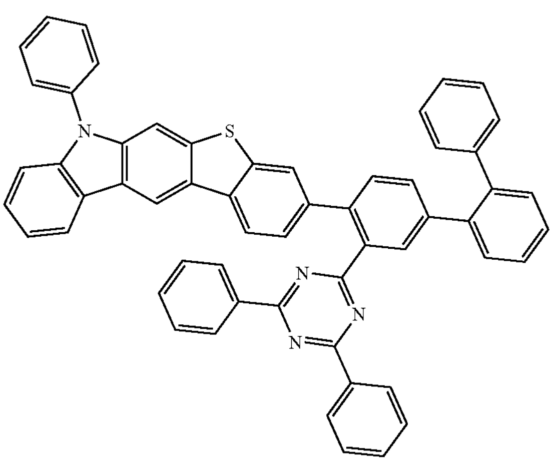
-continued
311
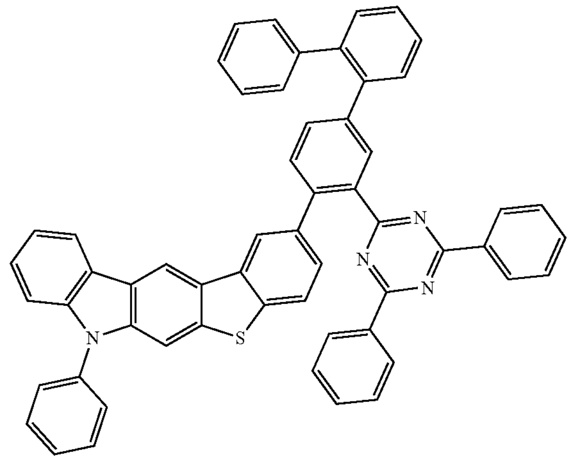
312
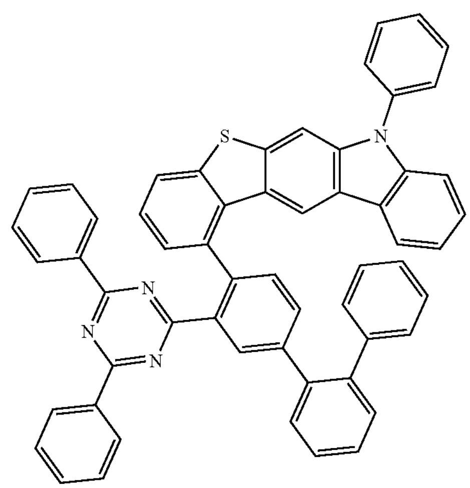
313
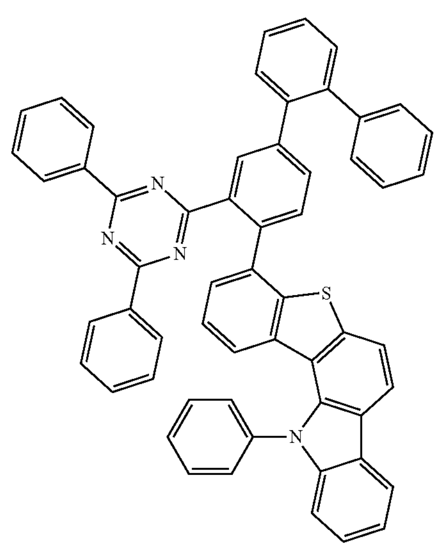

-continued
314
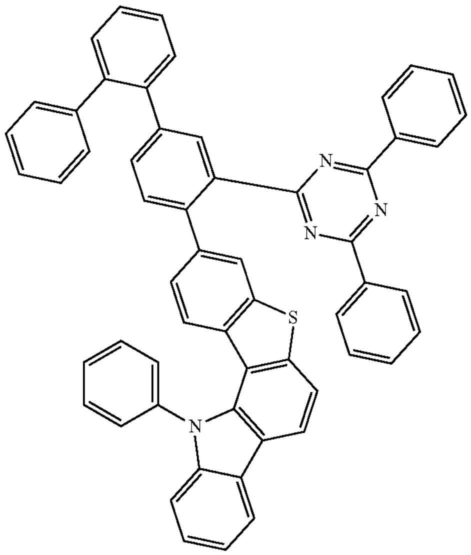
315
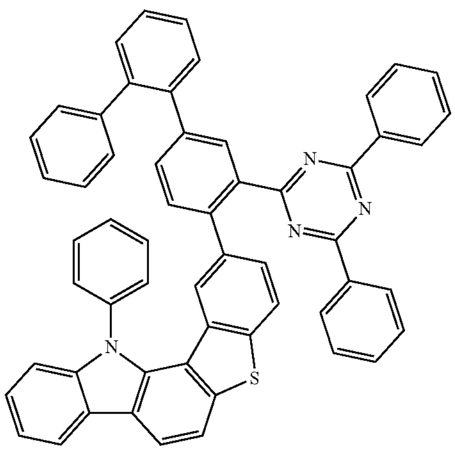
316
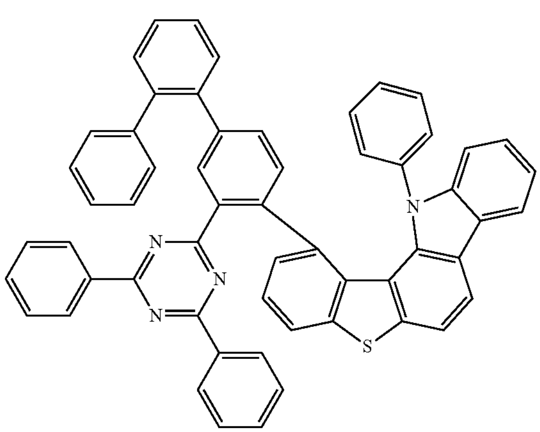
-continued
317
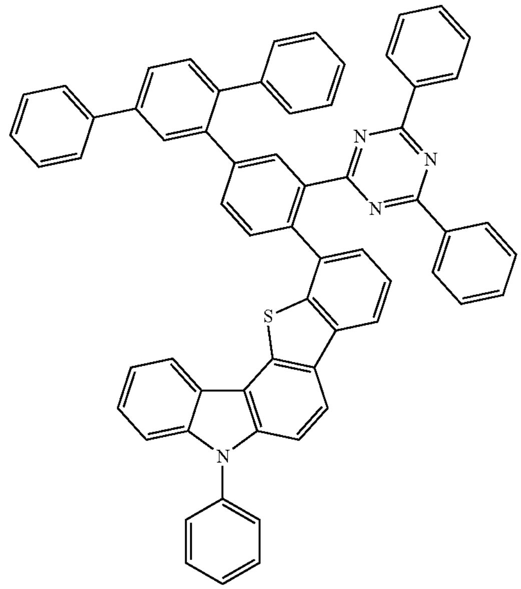
318
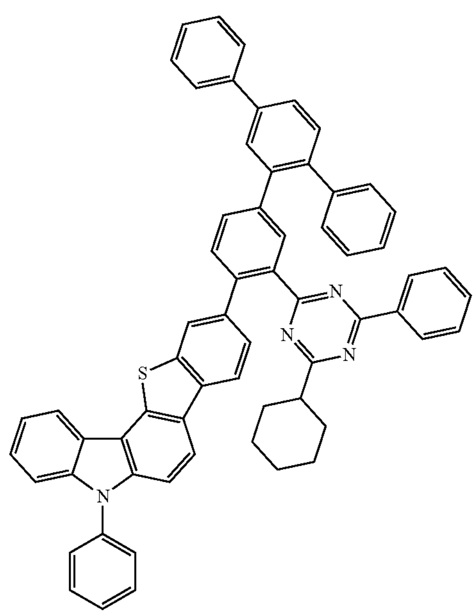

-continued
319
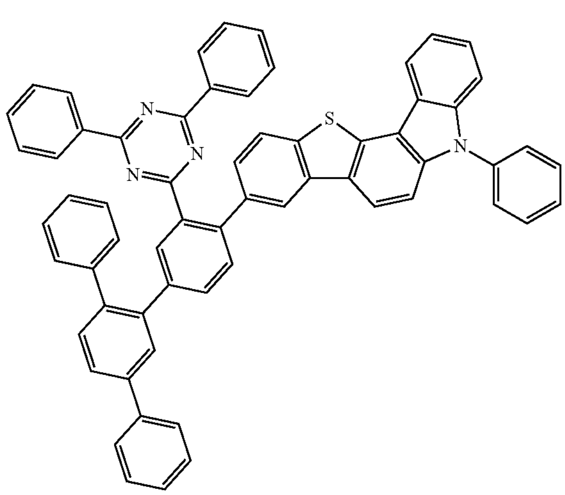
320
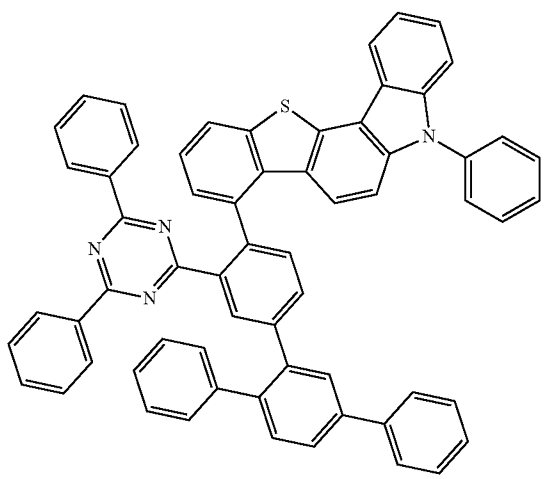
321
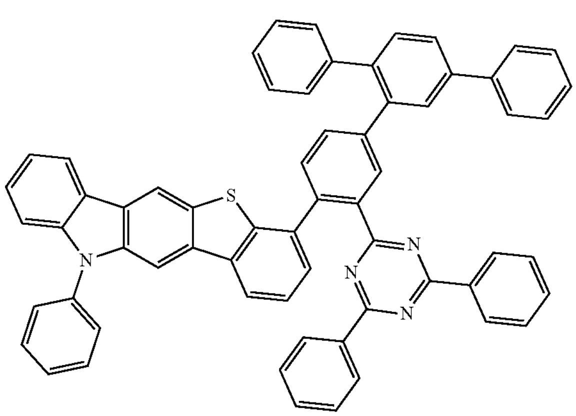
-continued
322
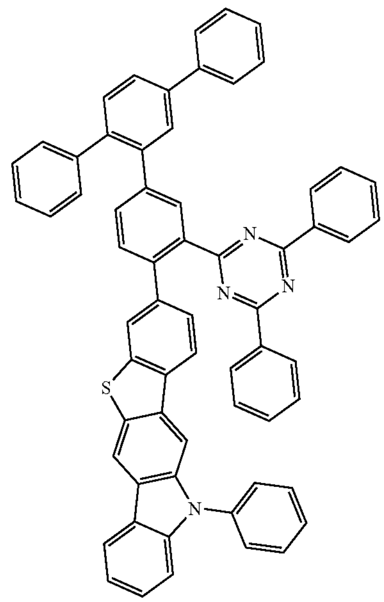
323
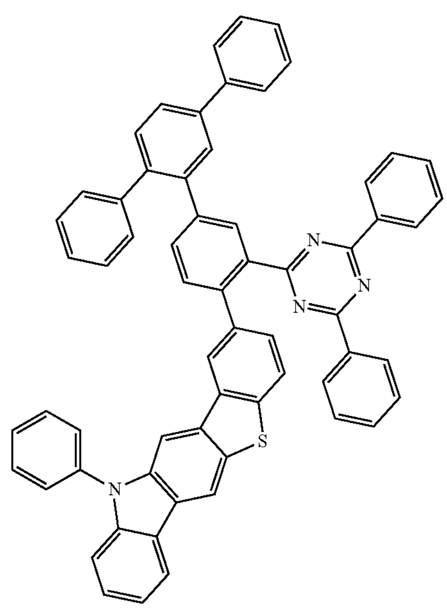

324
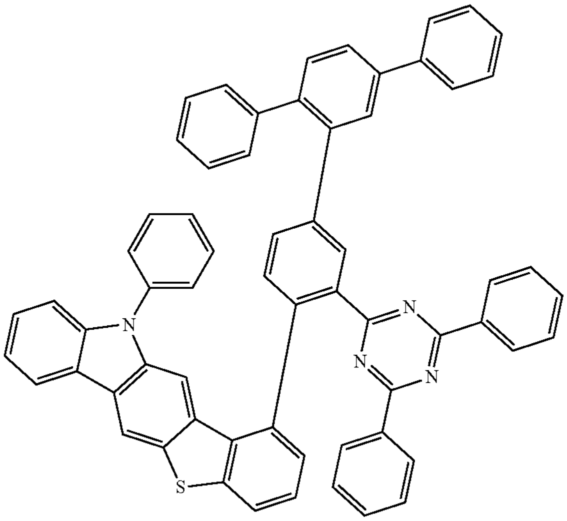
325
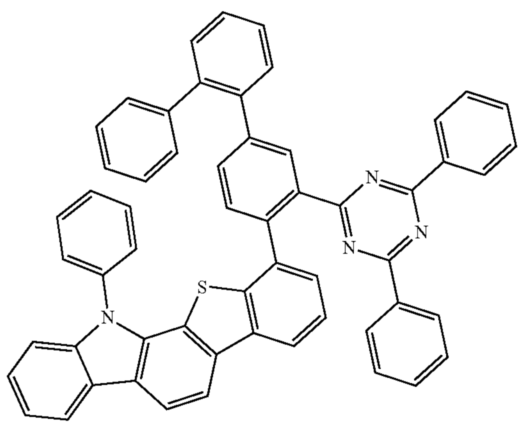
326
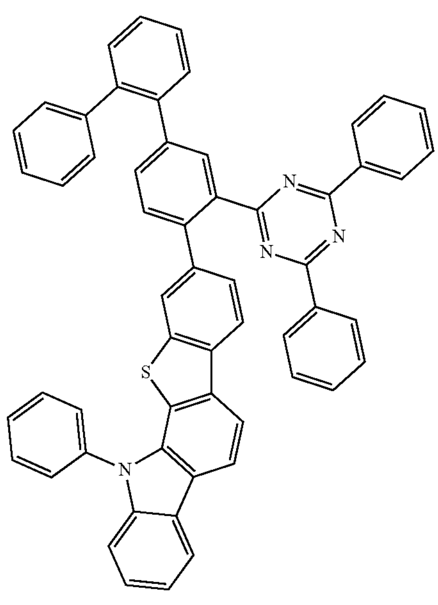
327
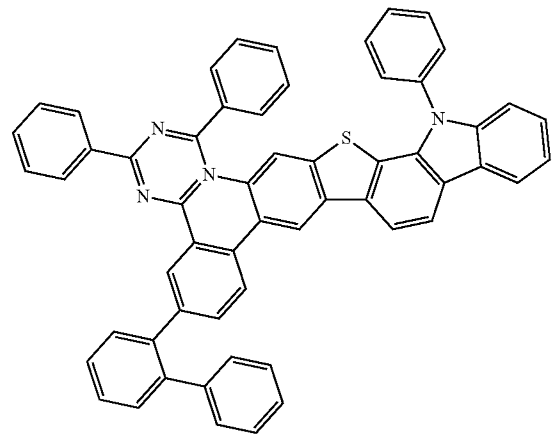
328
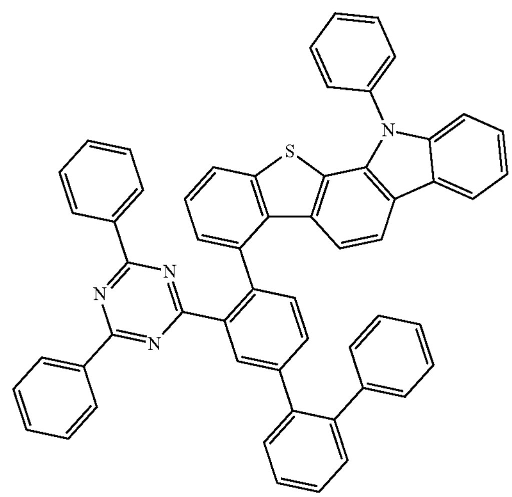
329
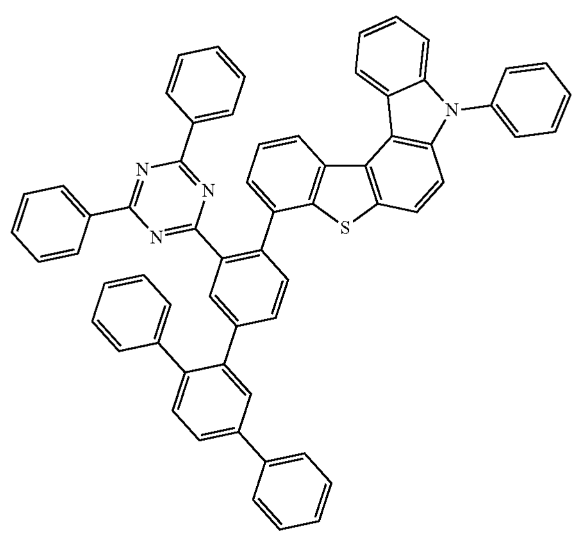

-continued
330
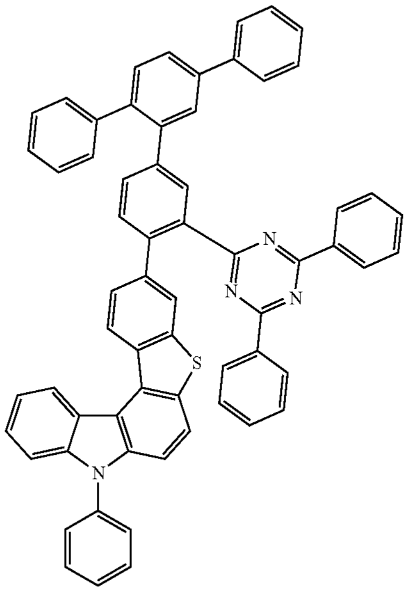
331
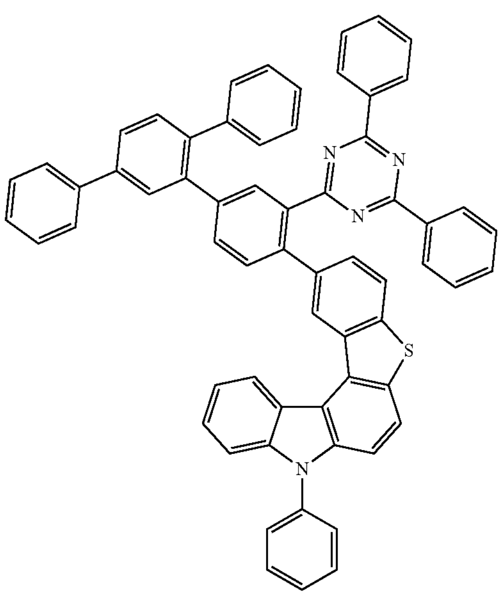
-continued
332
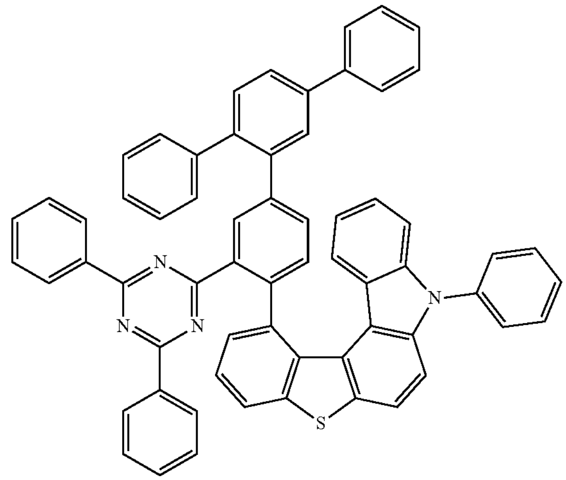
333
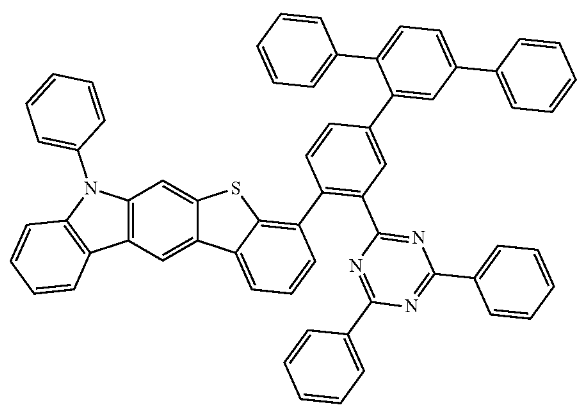
334
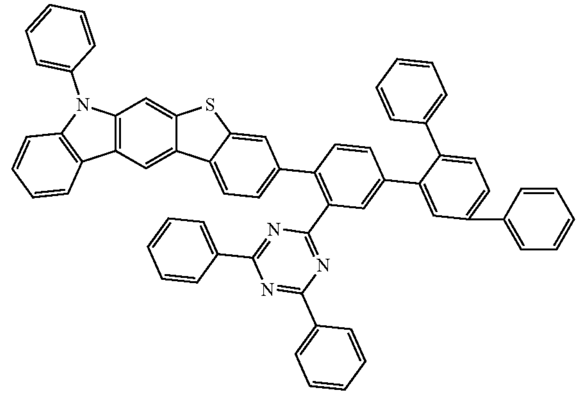

-continued
335
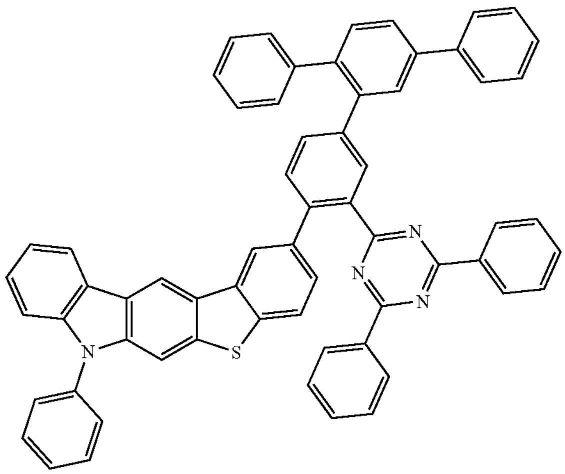
336
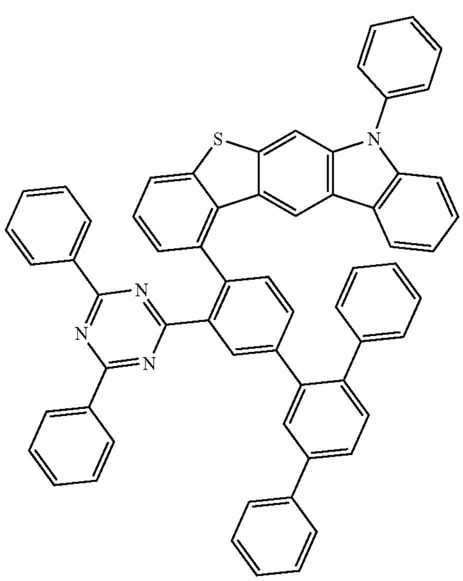
-continued
337
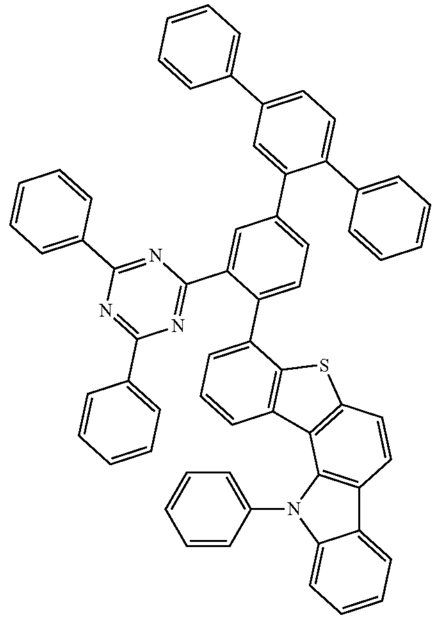
338
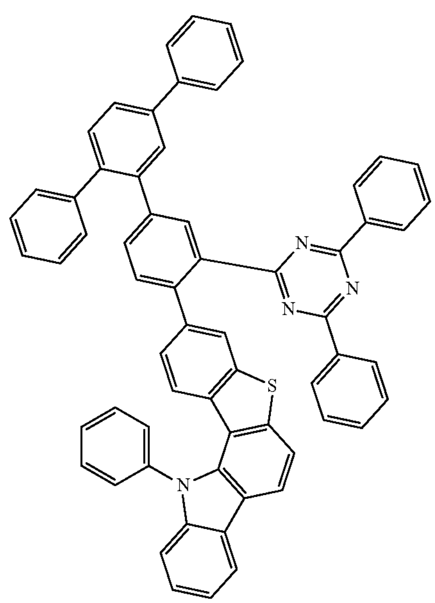

-continued
339
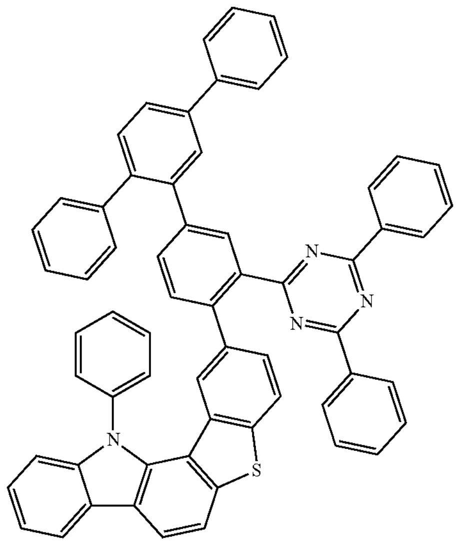
340
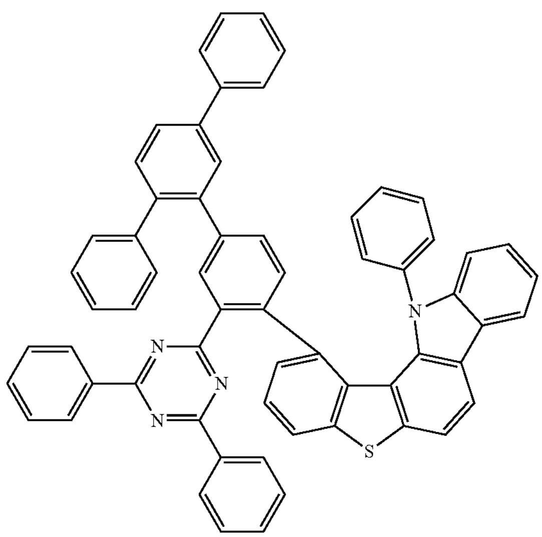
341
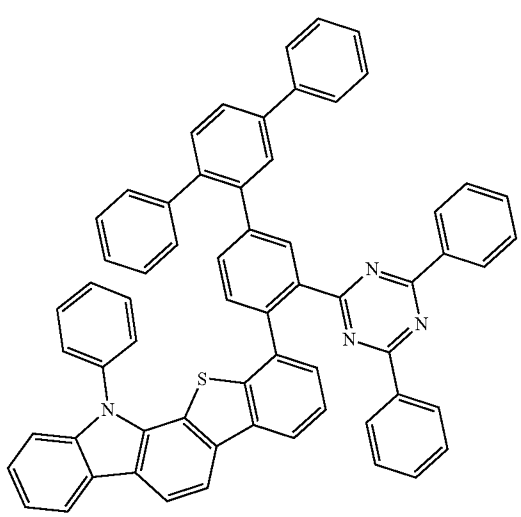
-continued
342
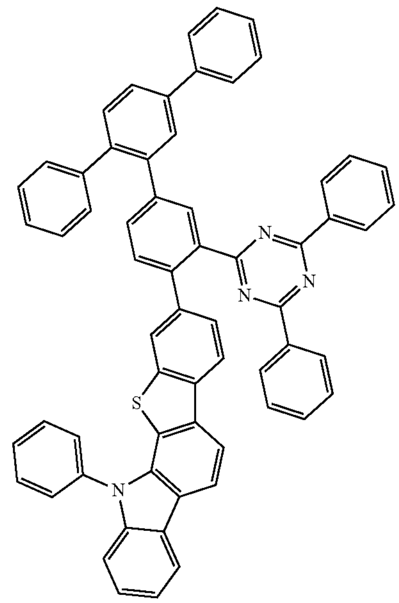
343
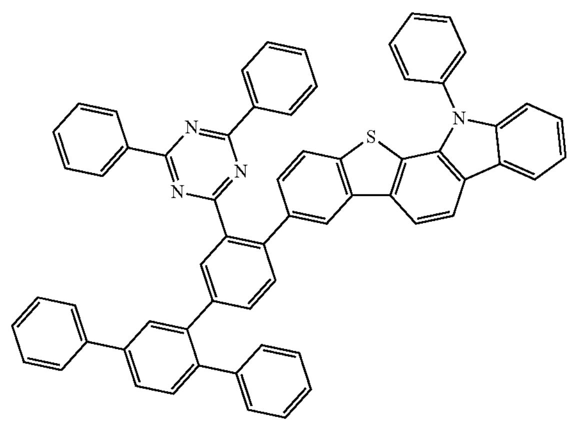
344
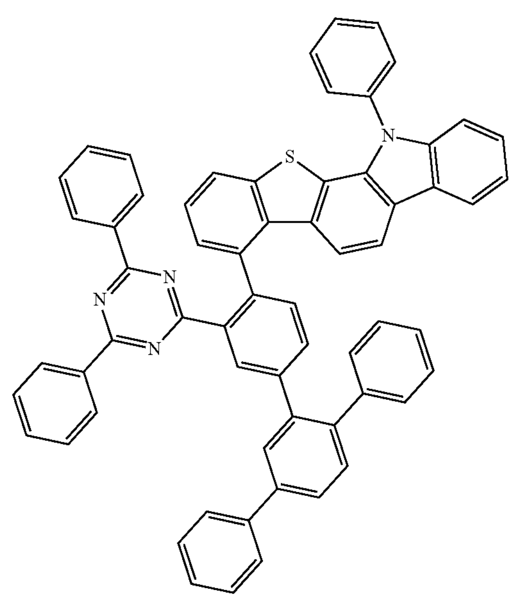

345
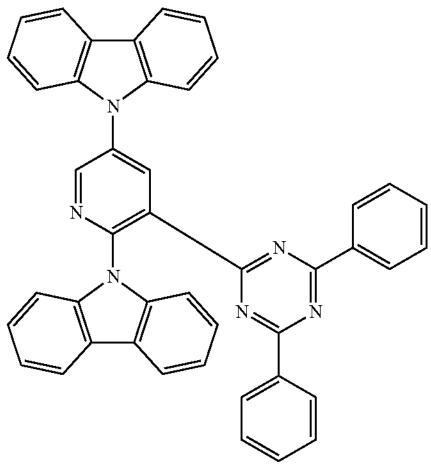
346
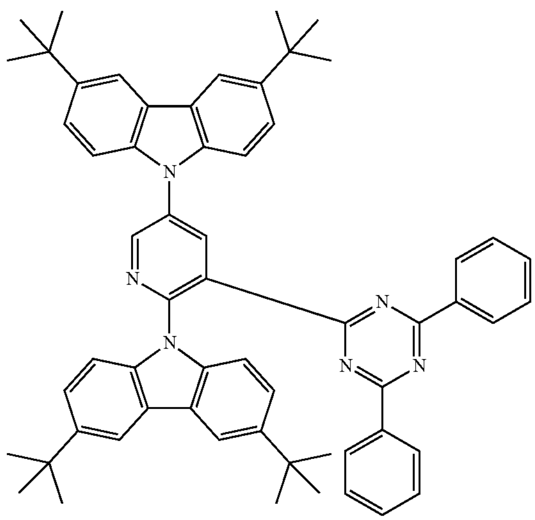
347
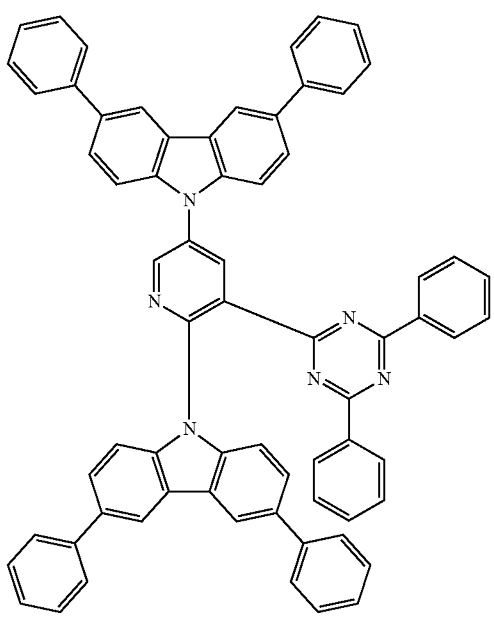
348
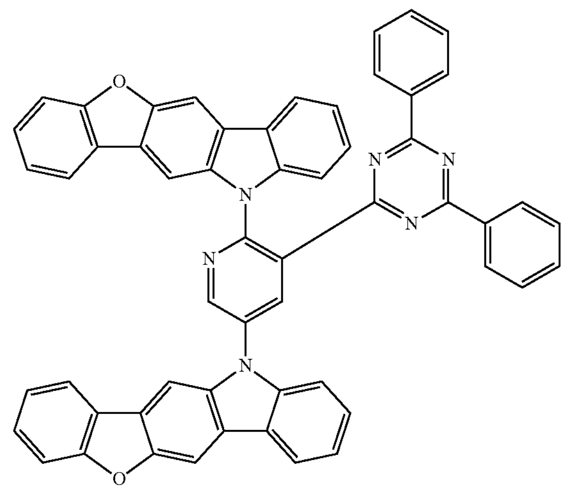
349
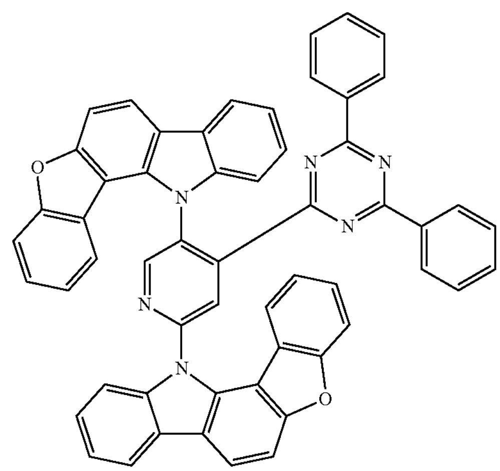
350
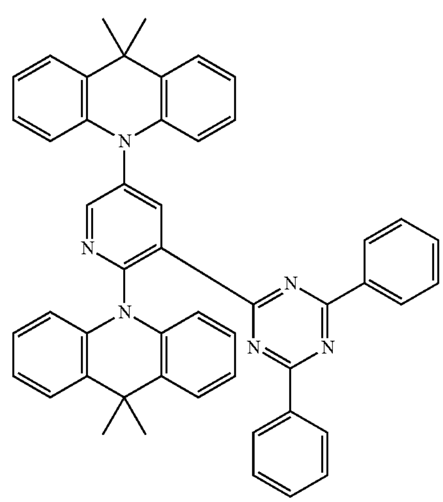

-continued
351
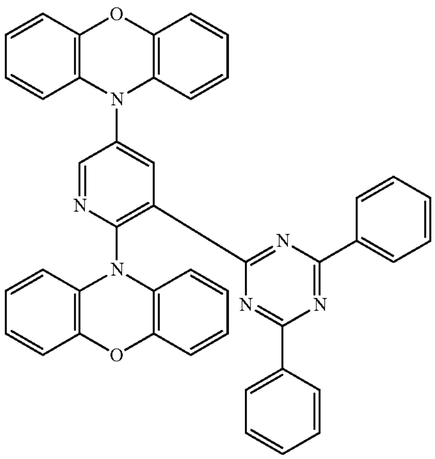
352
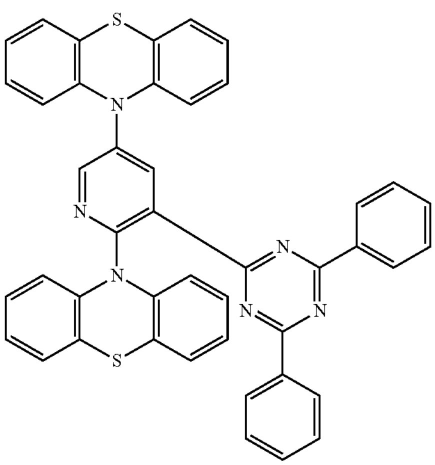
353
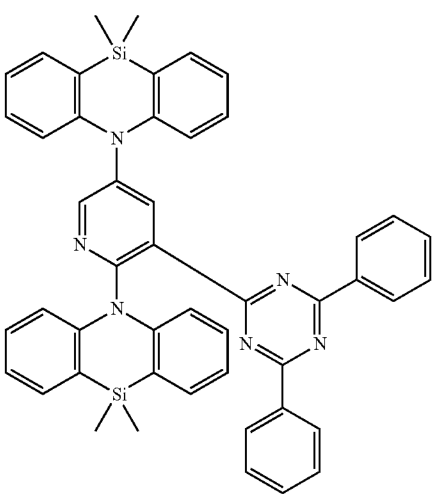
-continued
354
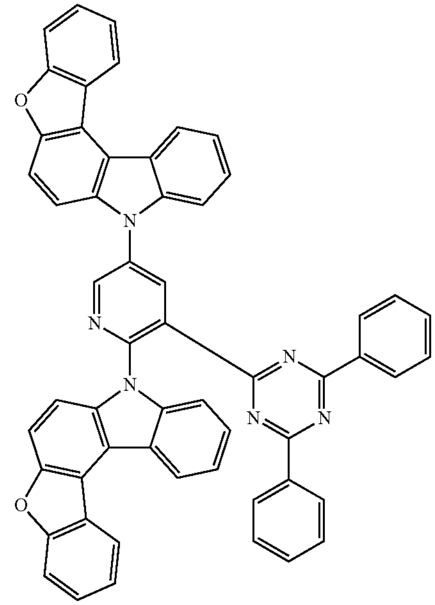
355
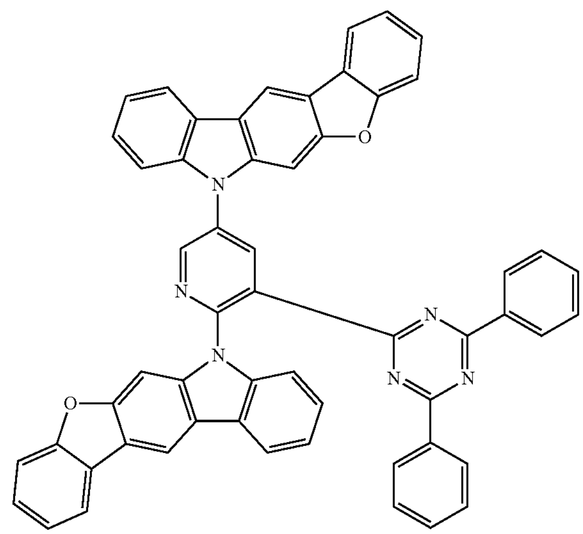
356
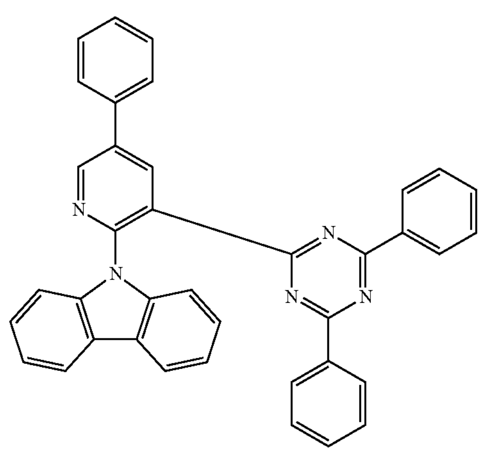

-continued
357
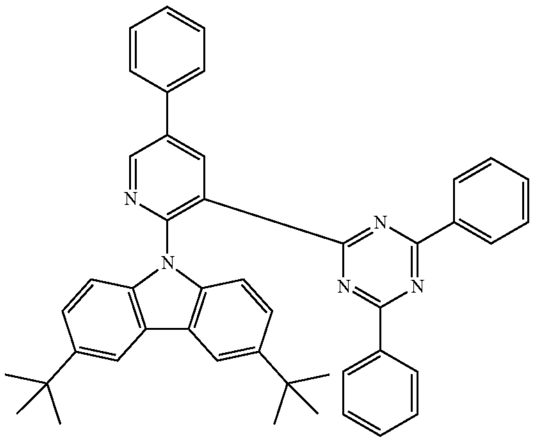
358
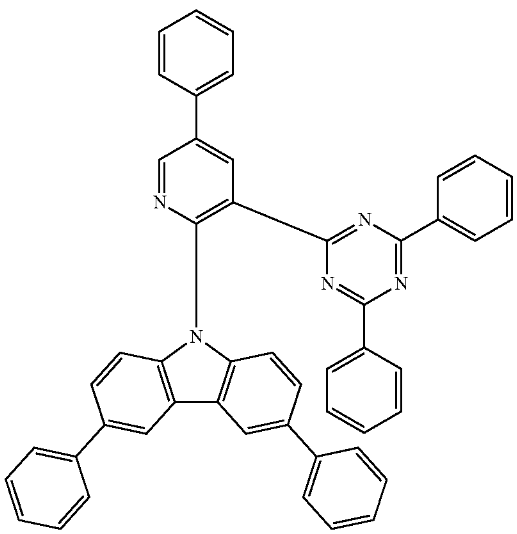
359
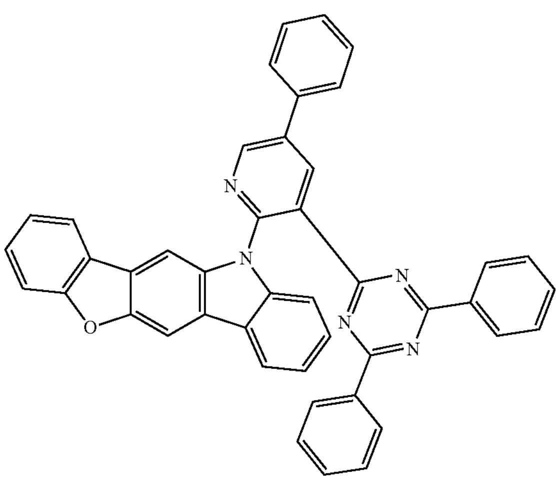
-continued
360
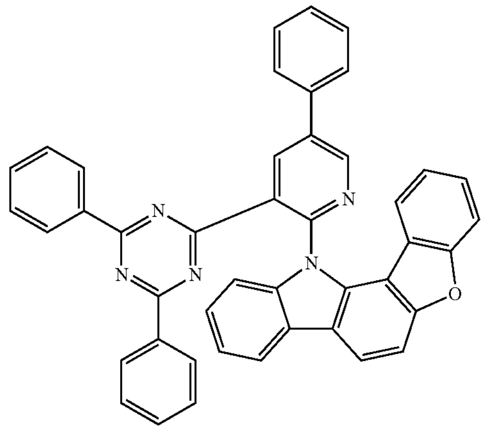
361
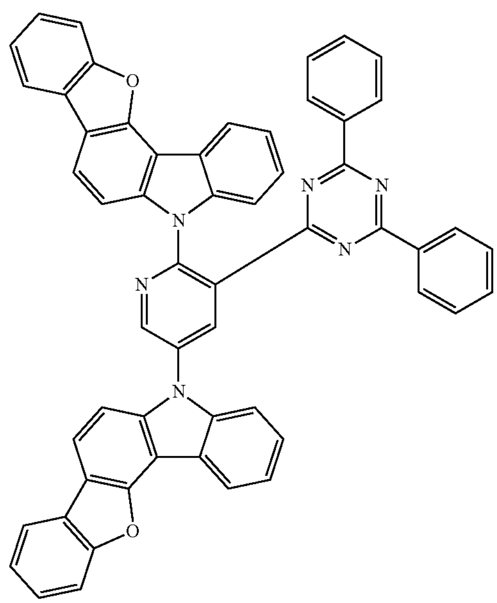
362
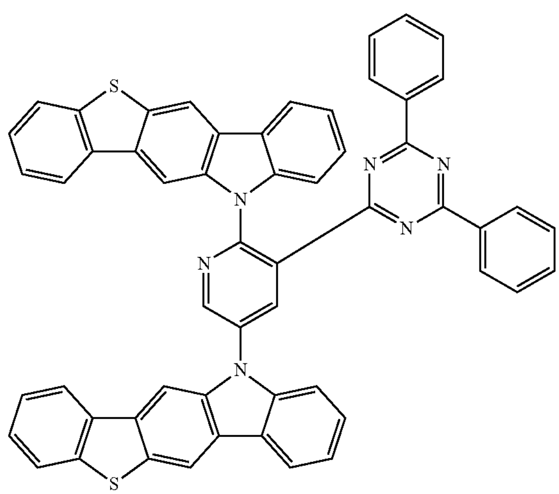

363
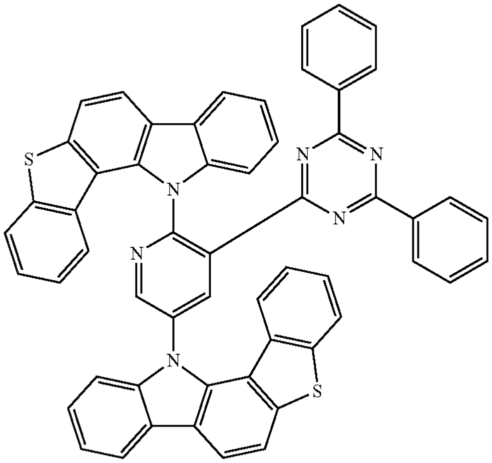
364
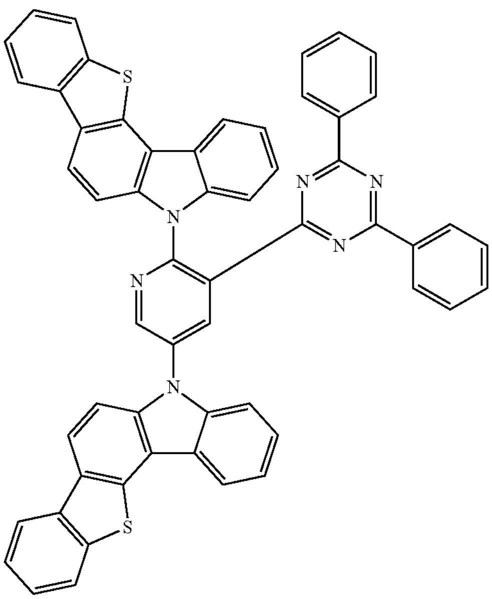
365
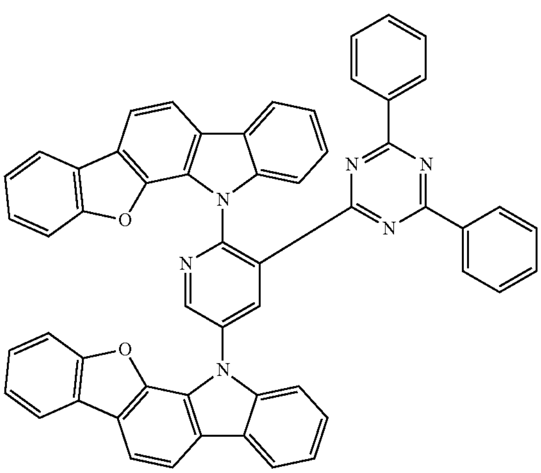
366
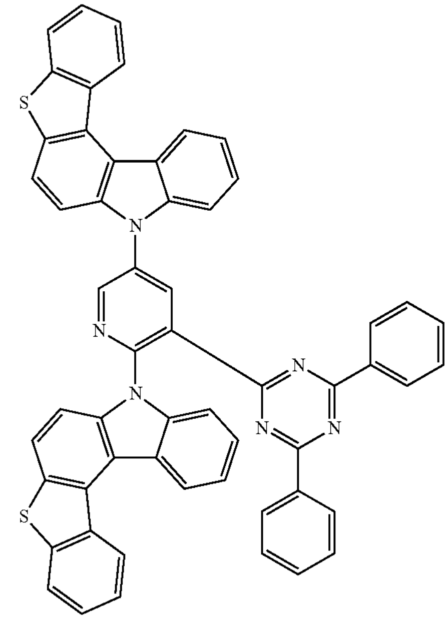
367
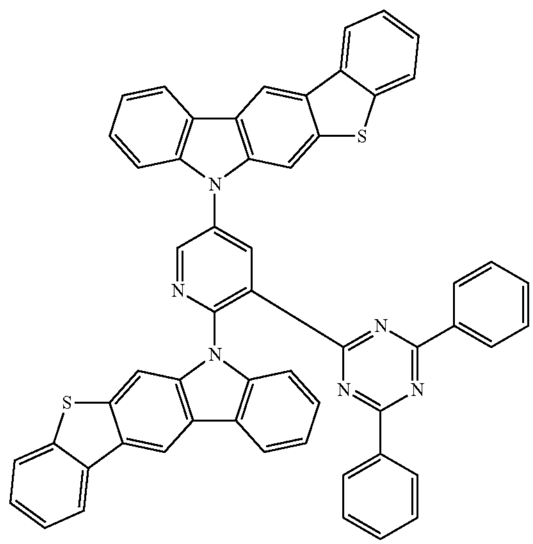
368
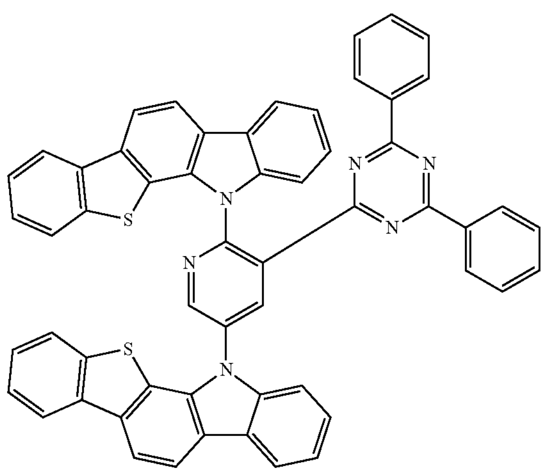

369
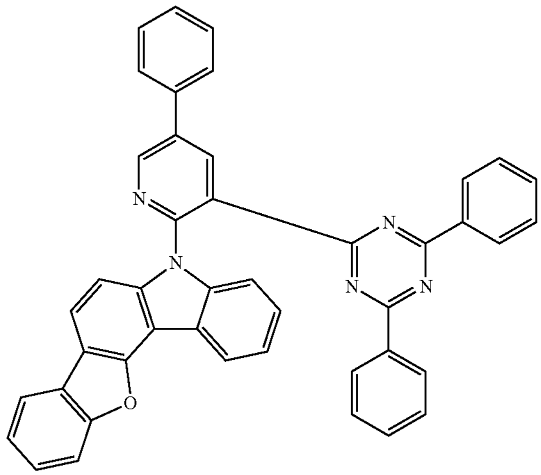
370
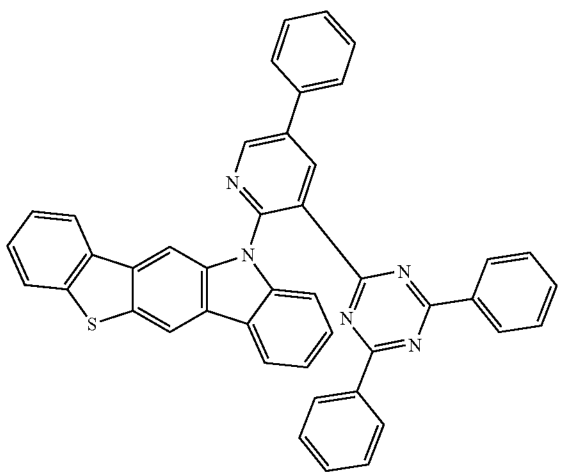
371
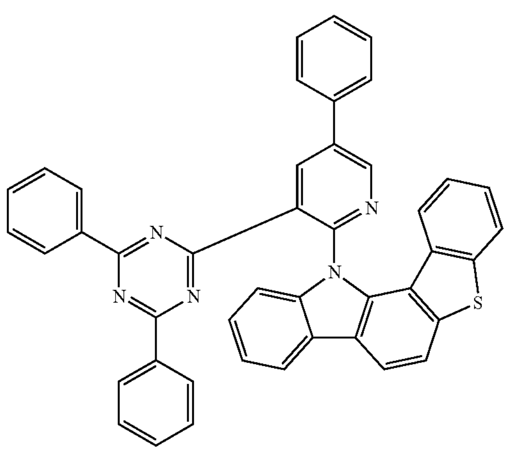
372
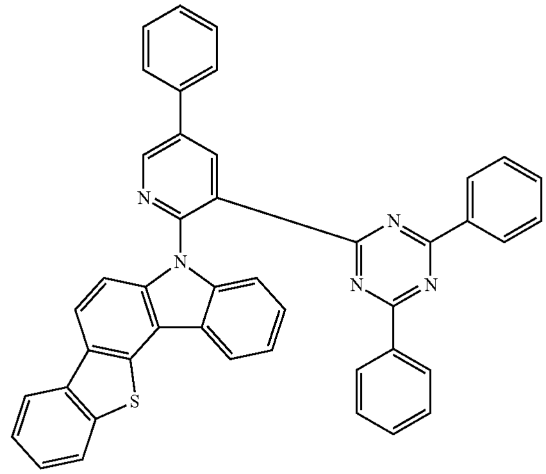
373
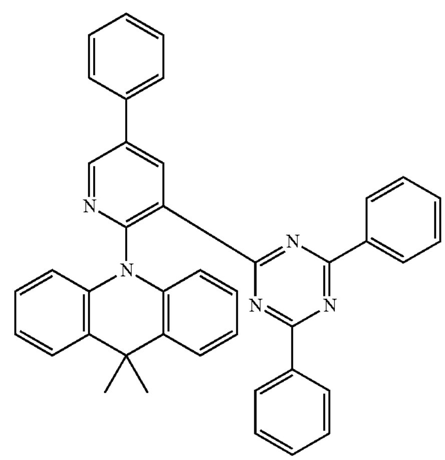
374
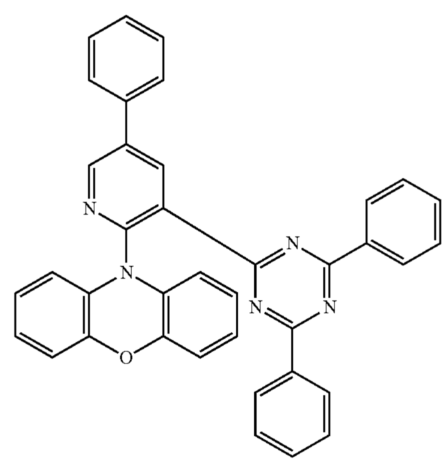

-continued
375
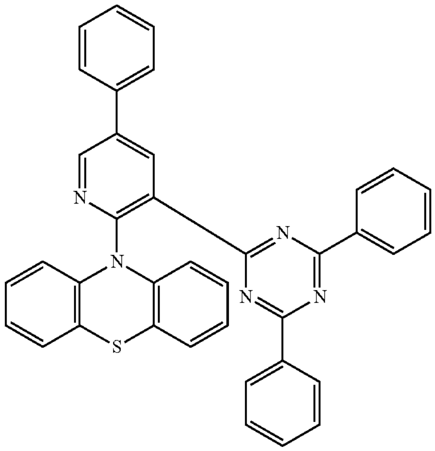
376
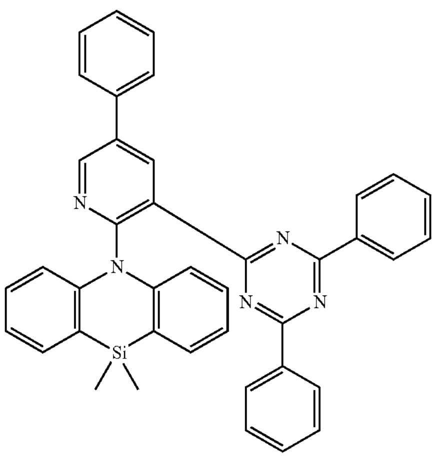
377
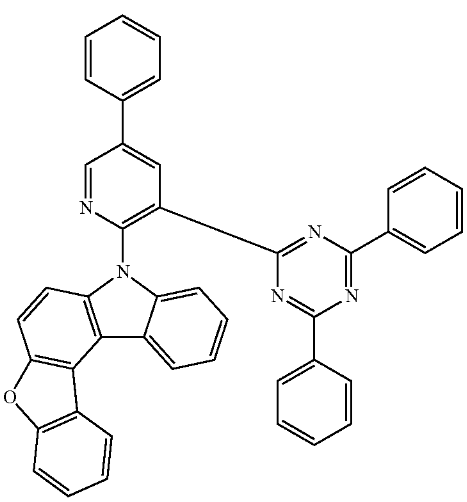
-continued
378
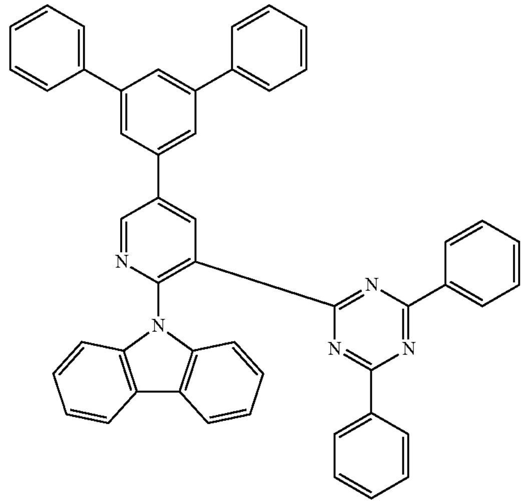
379
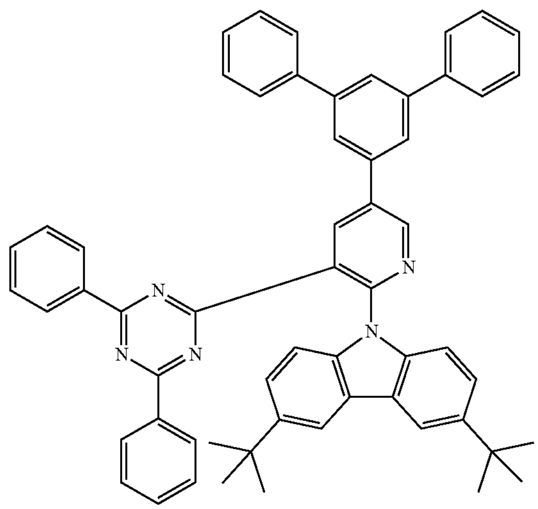
380
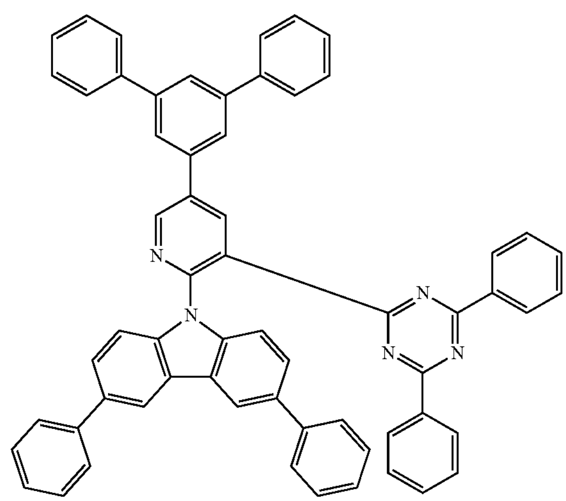

-continued
381
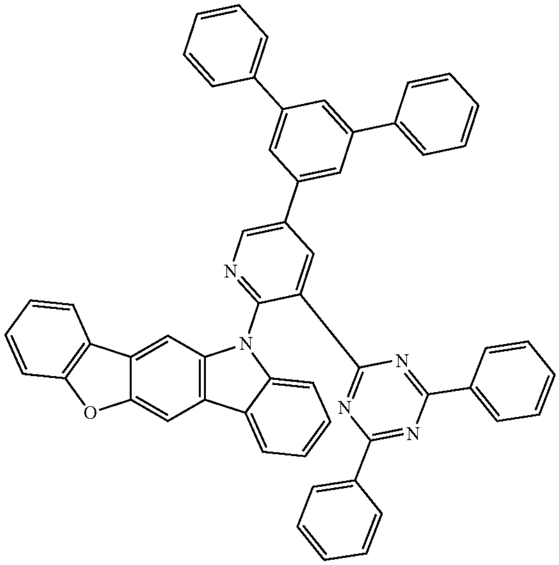
382
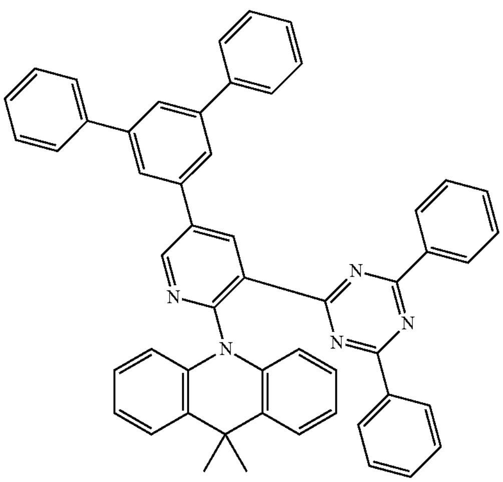
383
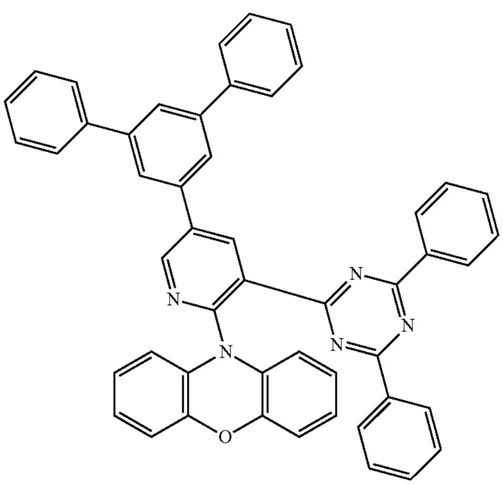
-continued
384
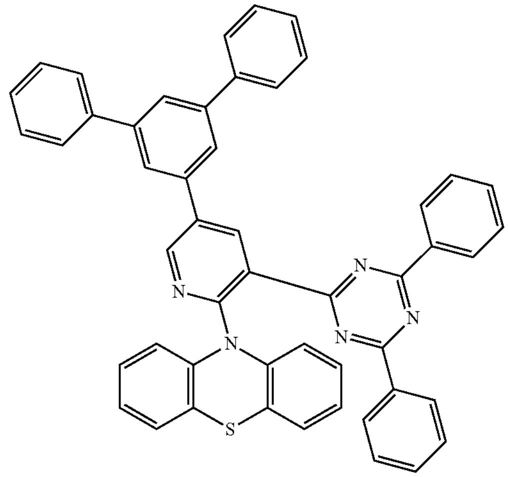
385
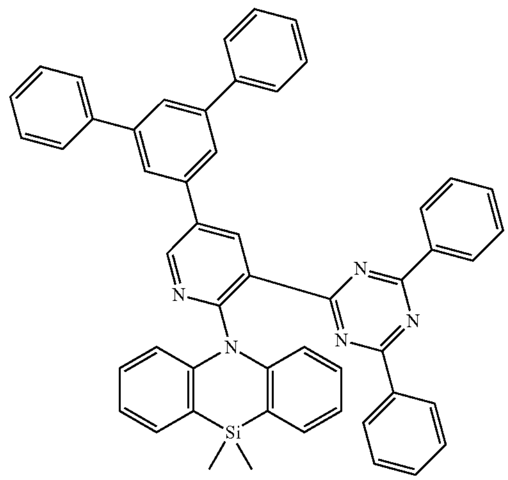
386
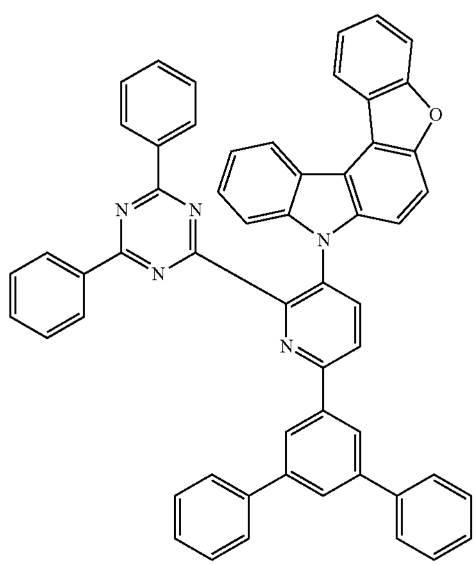

-continued
387
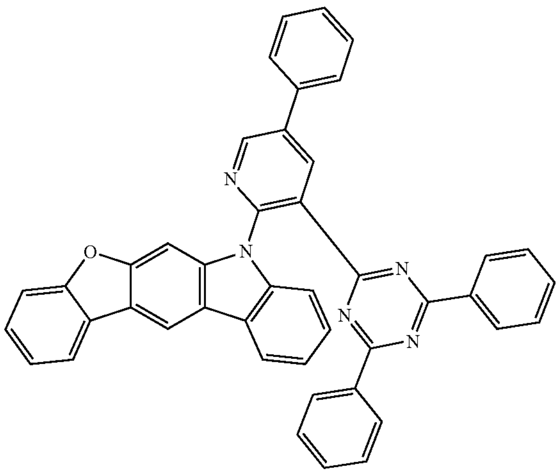
388
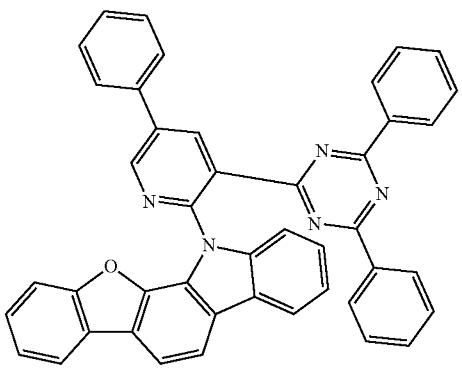
389
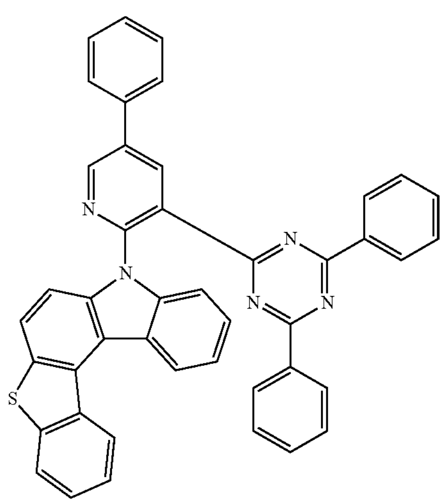
-continued
390
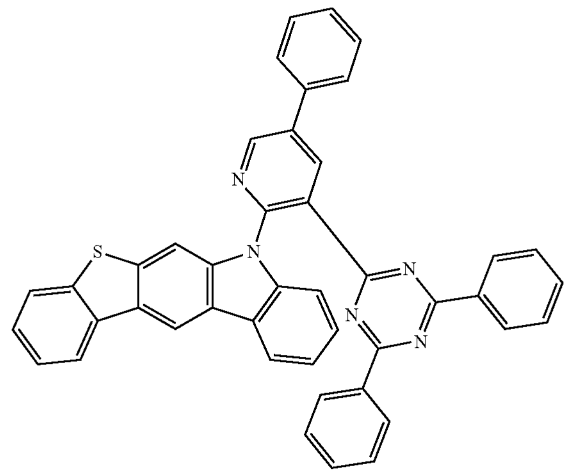
391
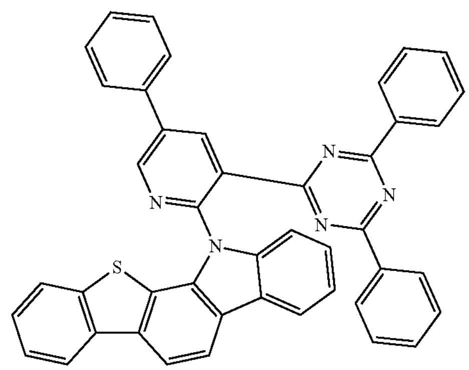
392
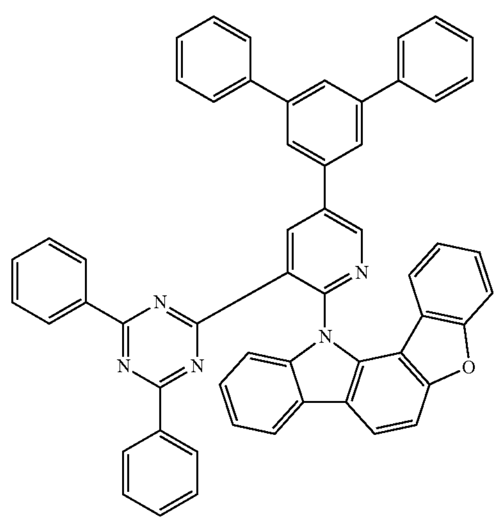

-continued
393
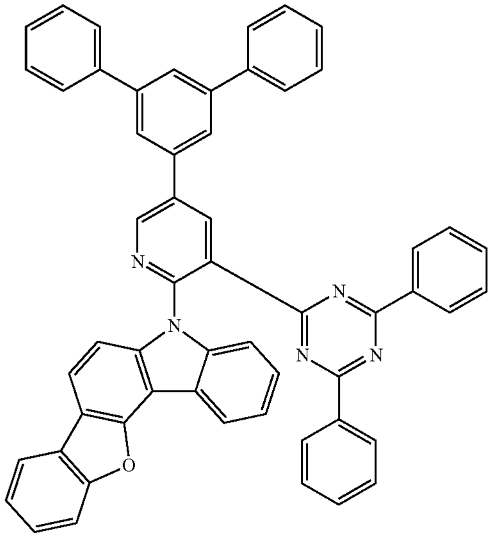
394
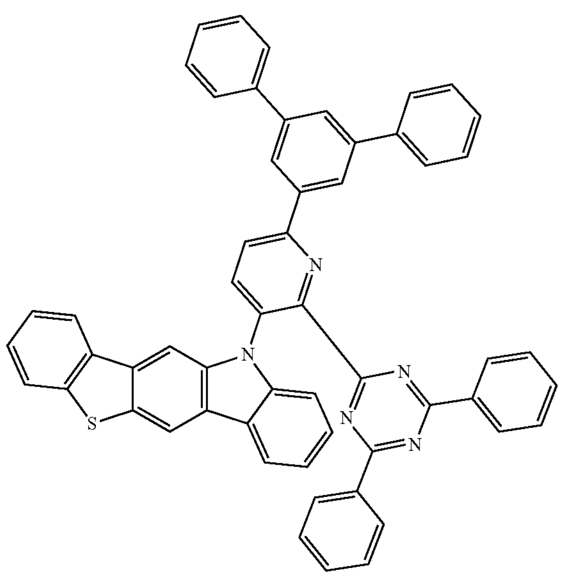
-continued
395
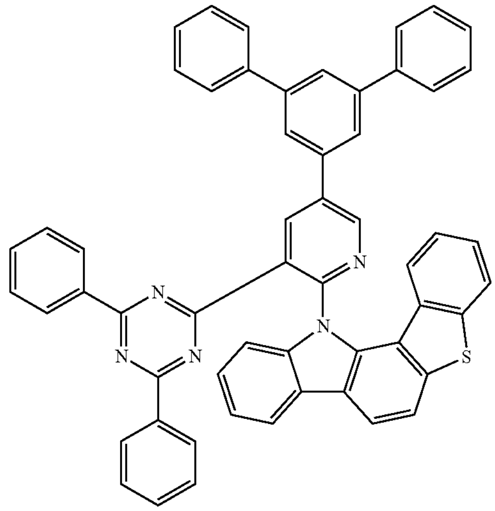
396
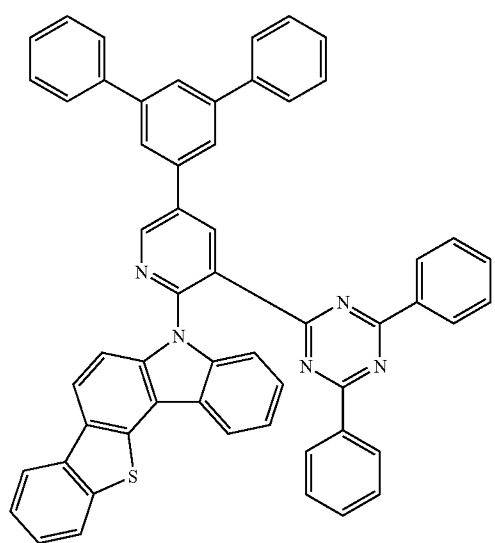

-continued
397
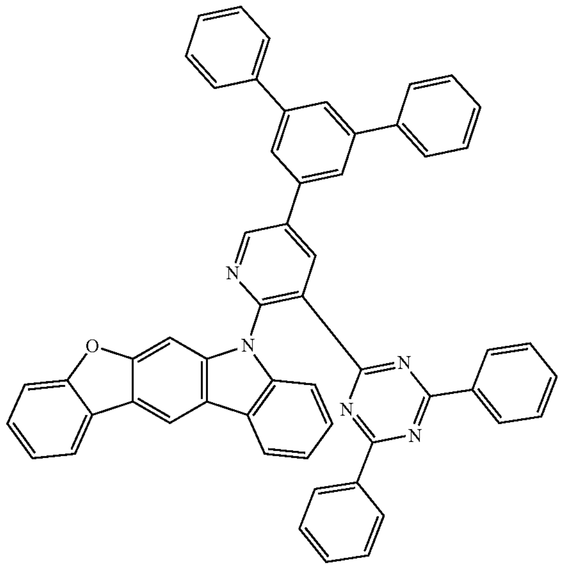
398
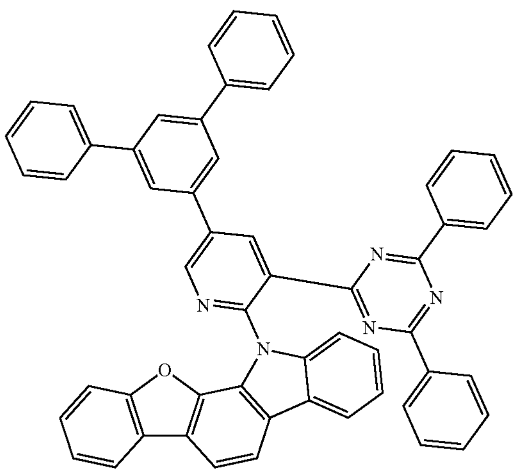
399
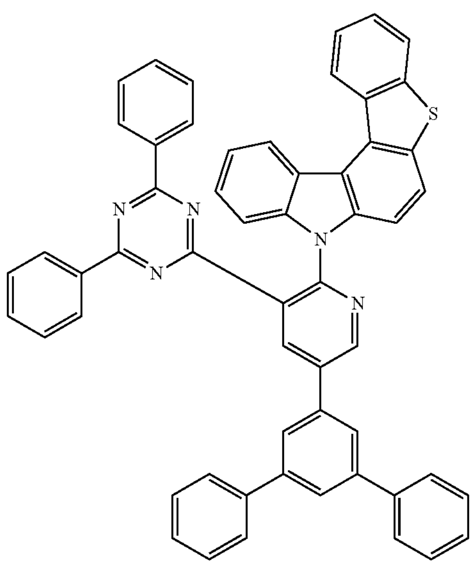
-continued
400
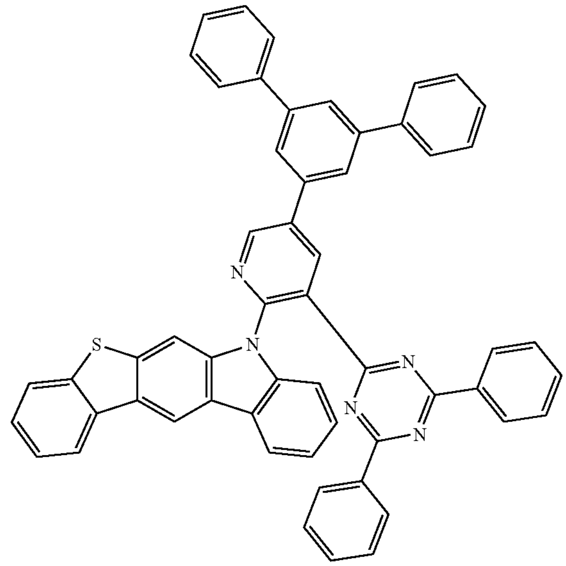
401
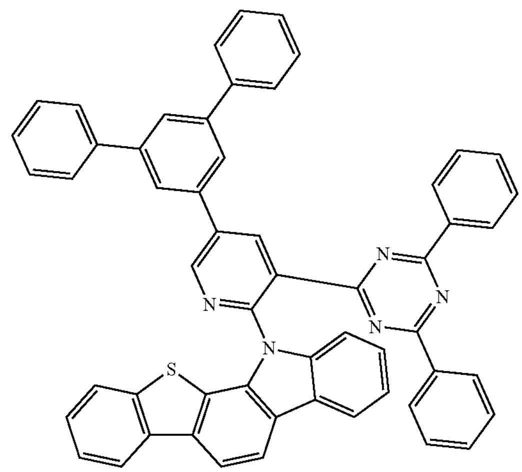
402
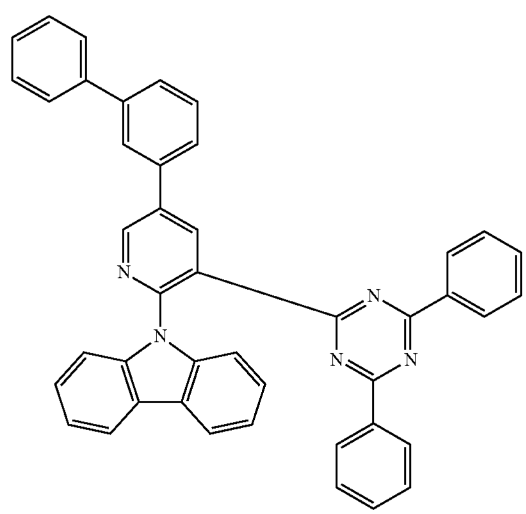

-continued
403
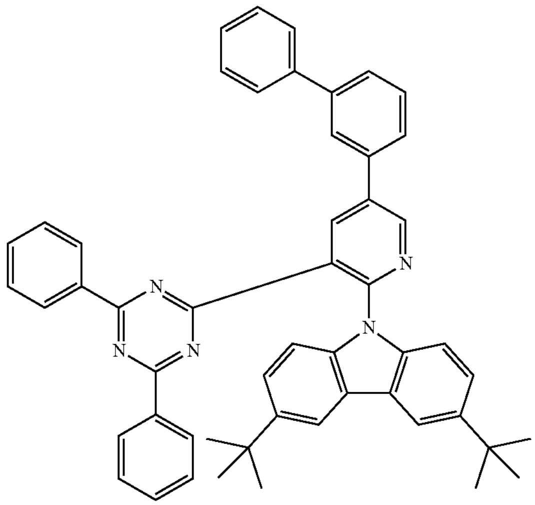
404
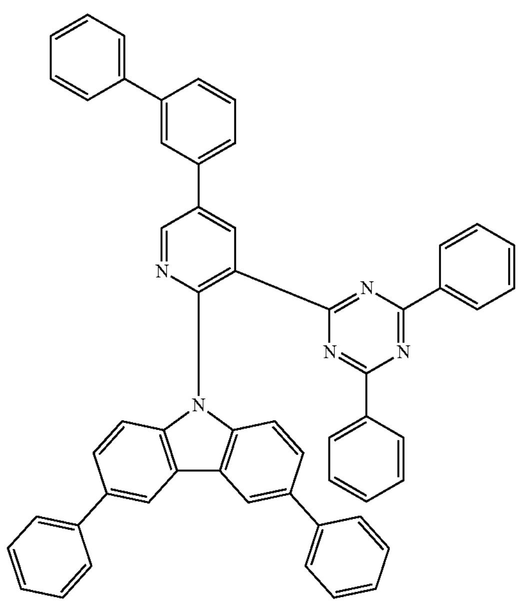
-continued
405
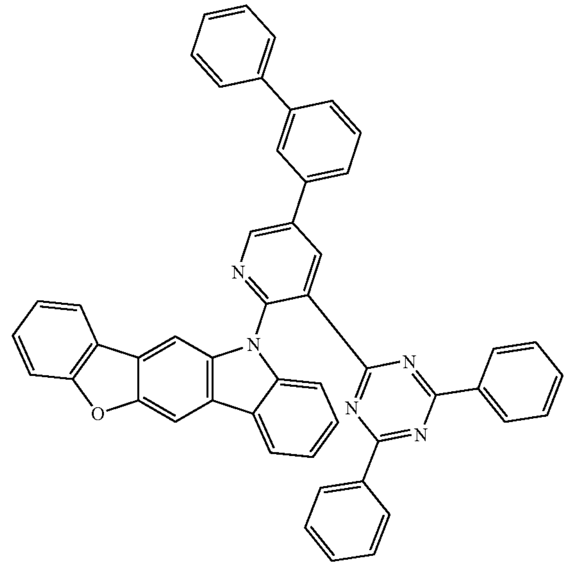
406
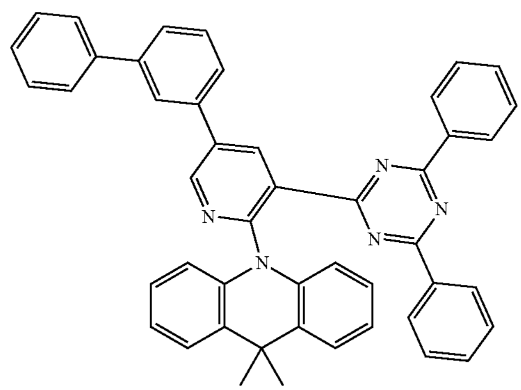
407
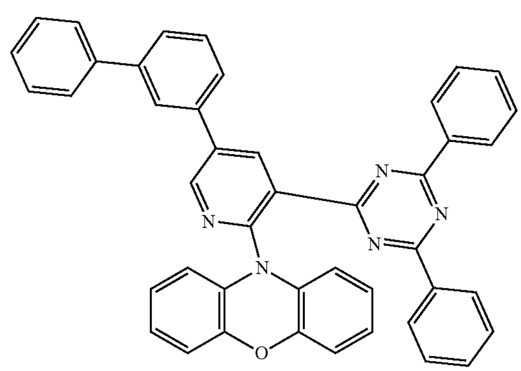

408
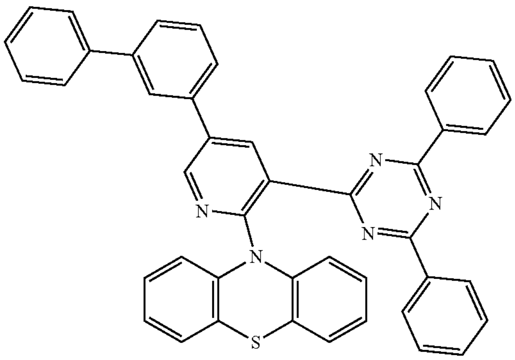
409
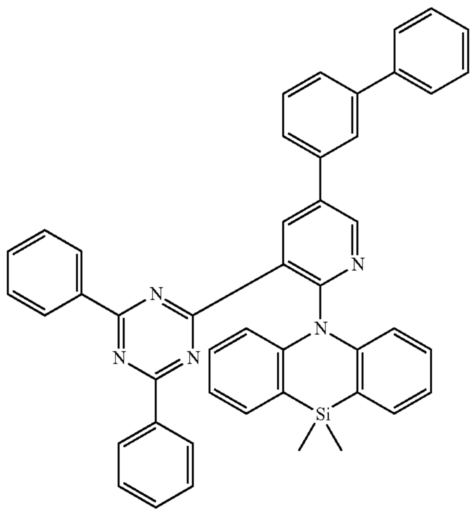
410
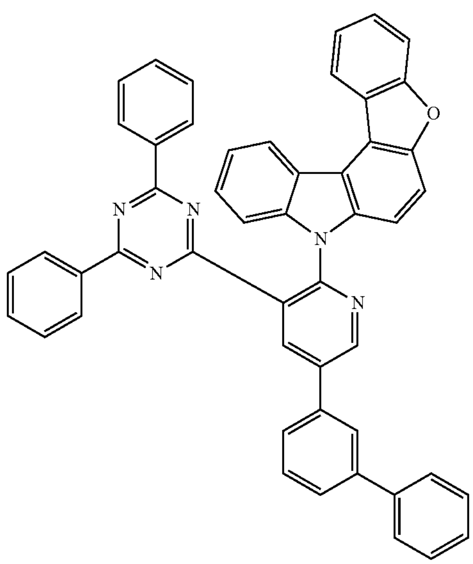
411
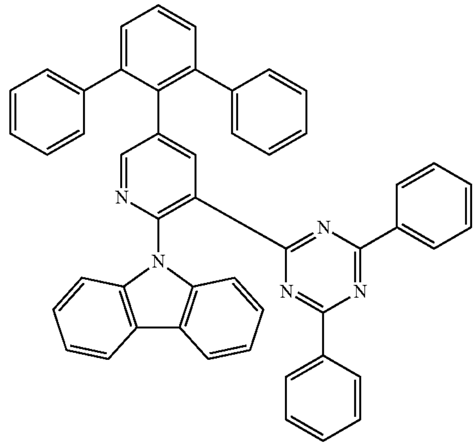
412
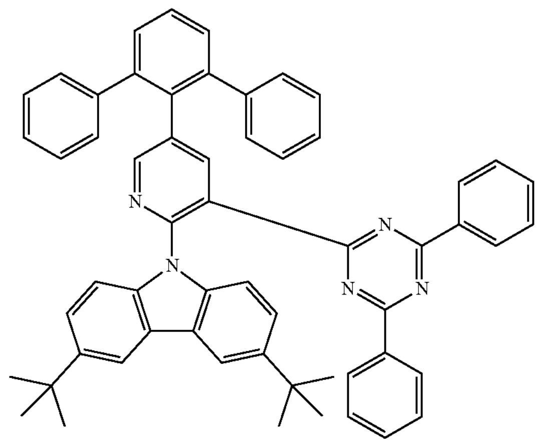
413
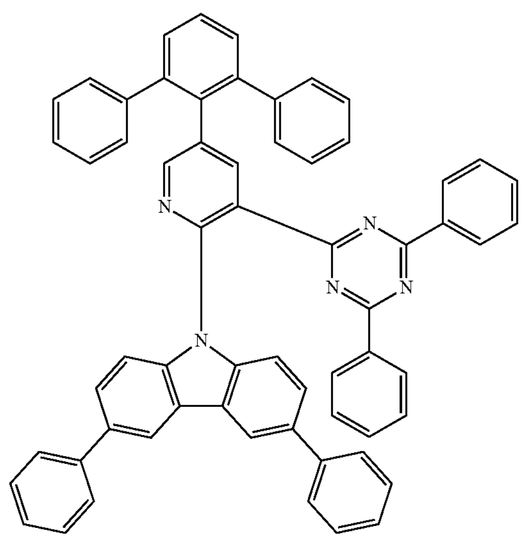

-continued
414
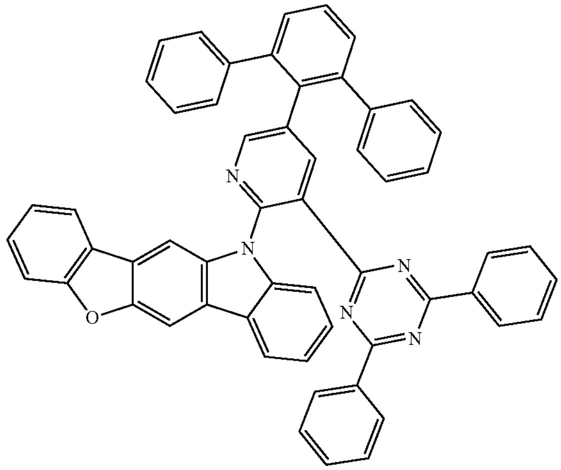
415
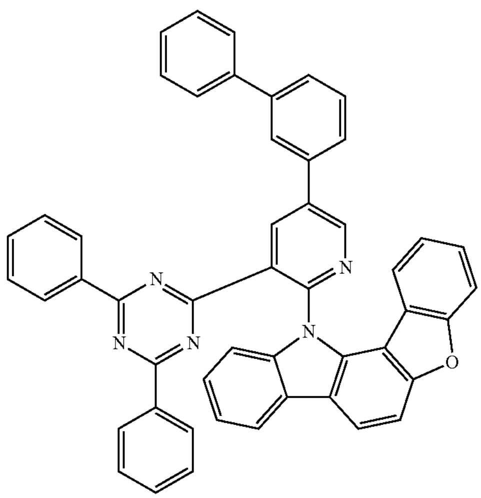
416
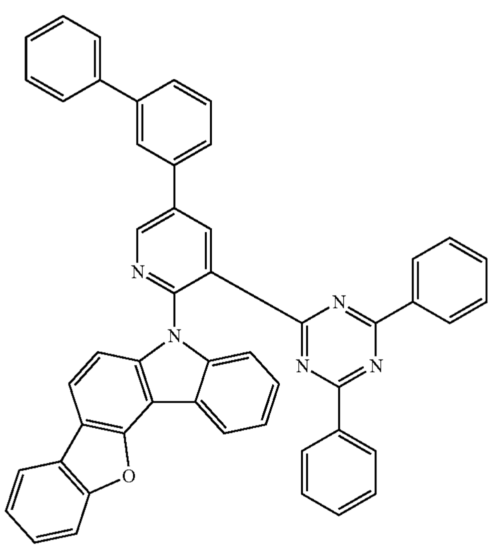
-continued
417
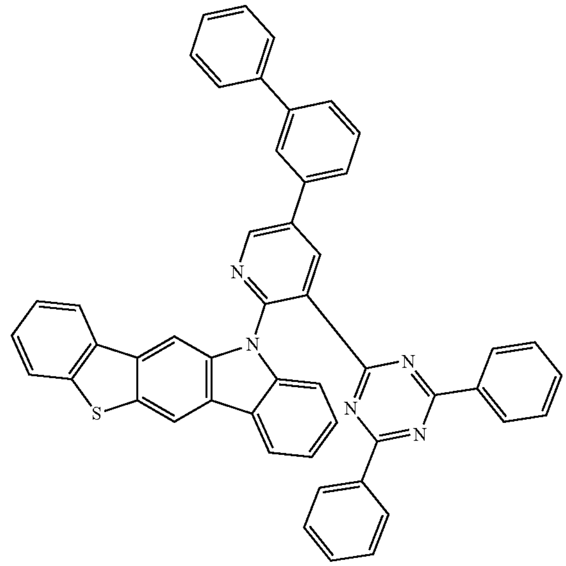
418
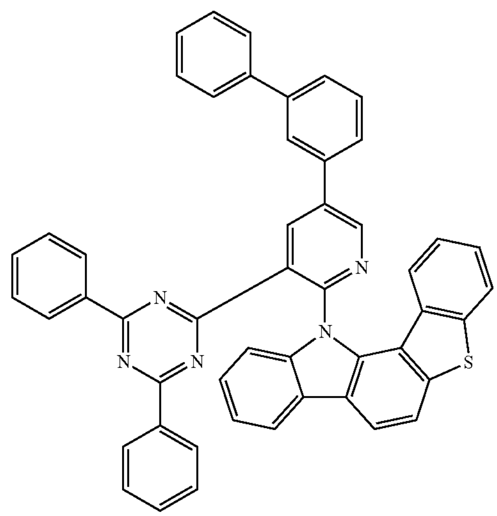
419
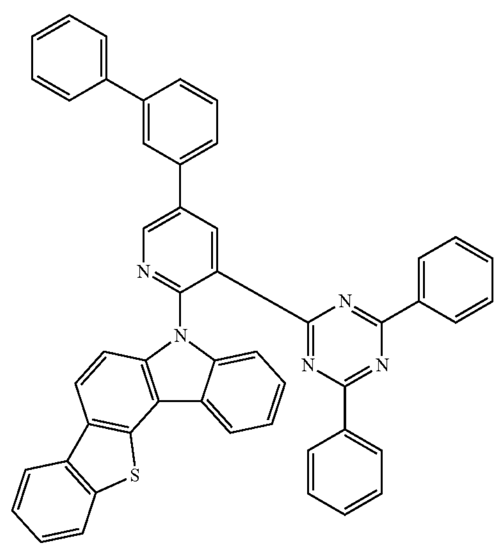

420
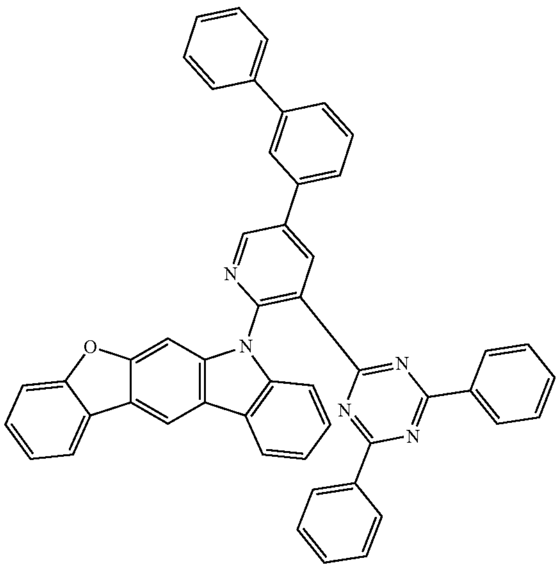
421
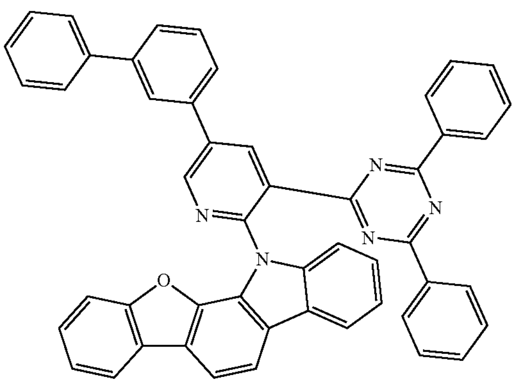
423
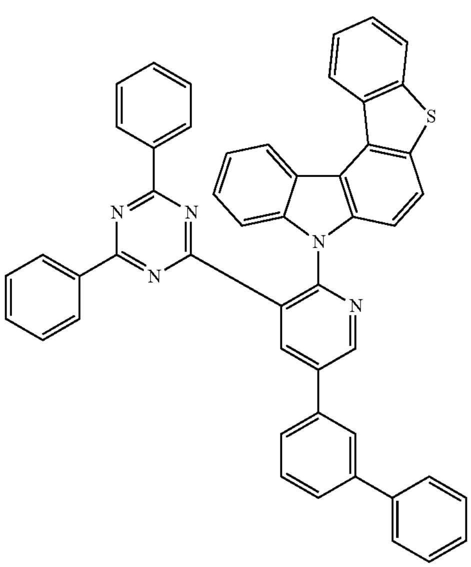
424
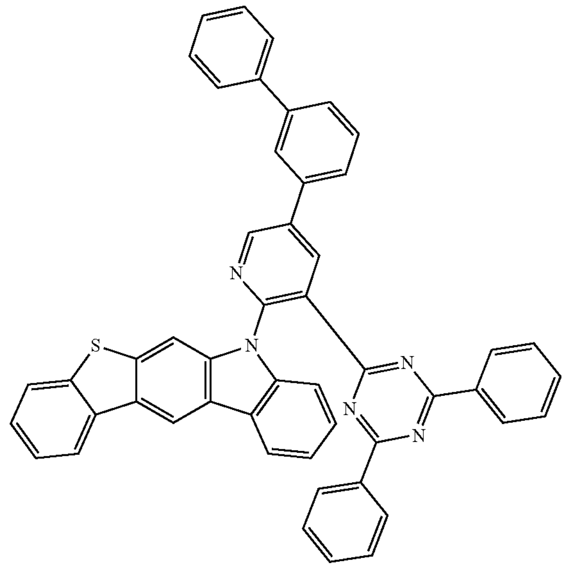
425
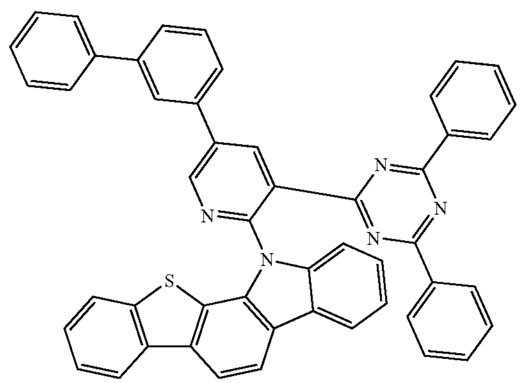
426
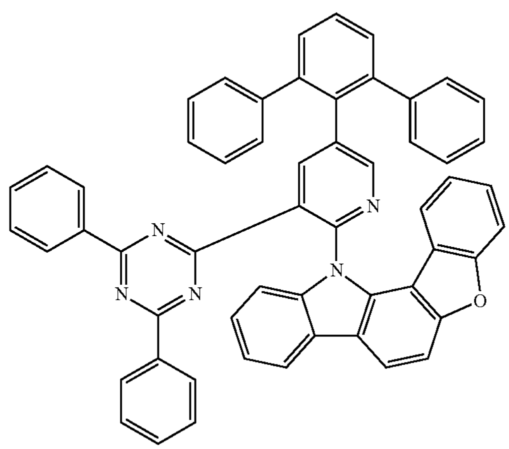

-continued
427
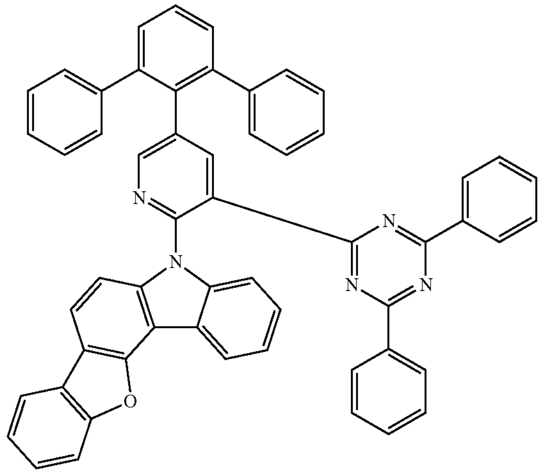
428
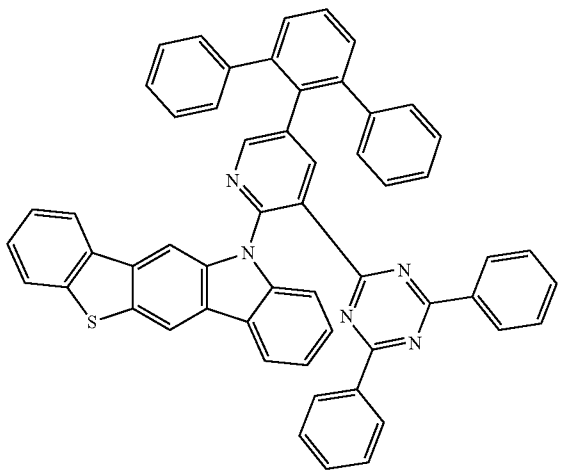
429
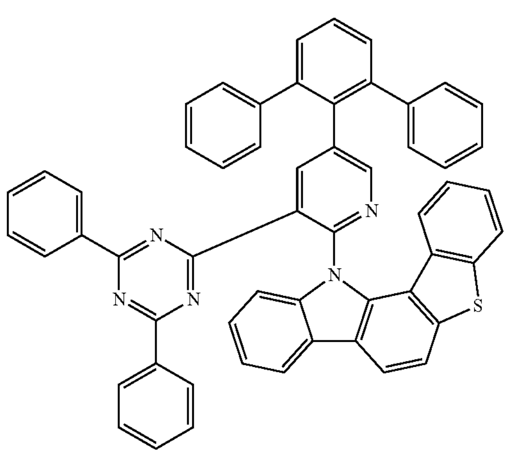
-continued
430
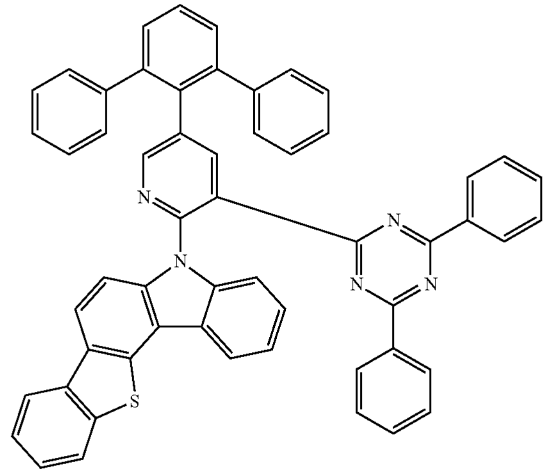
431
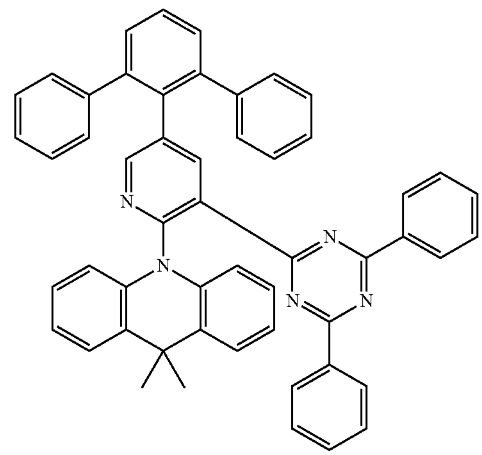
432
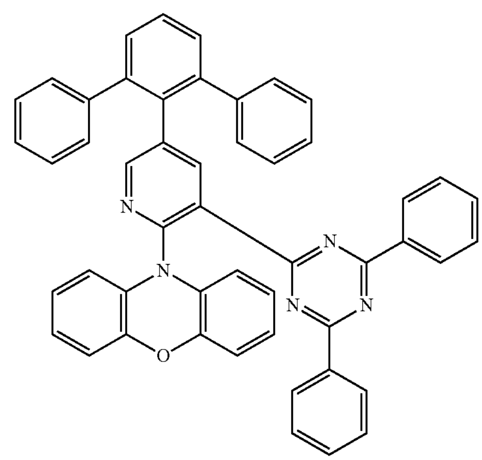

-continued
433
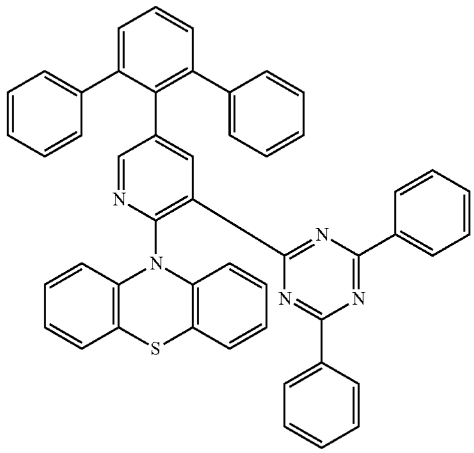
434
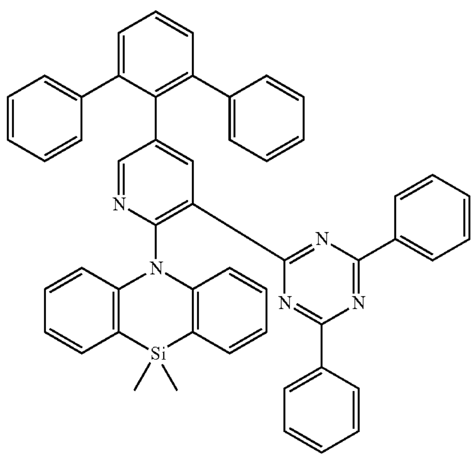
435
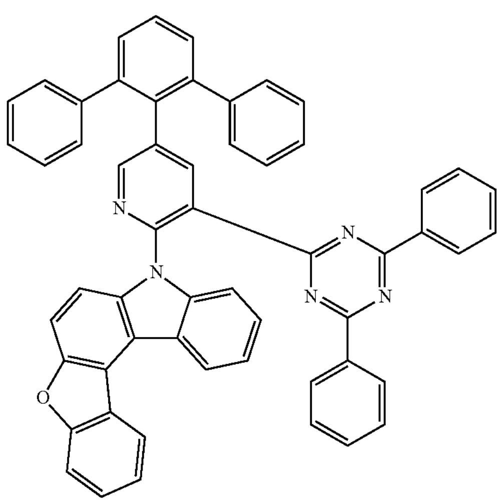
-continued
436
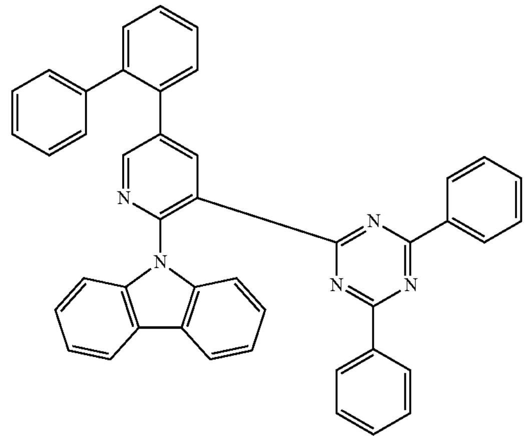
437
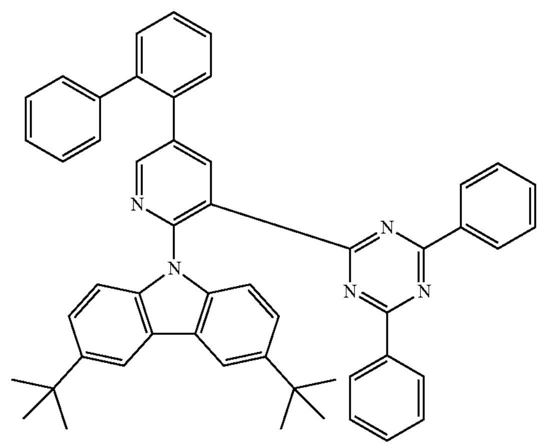
438
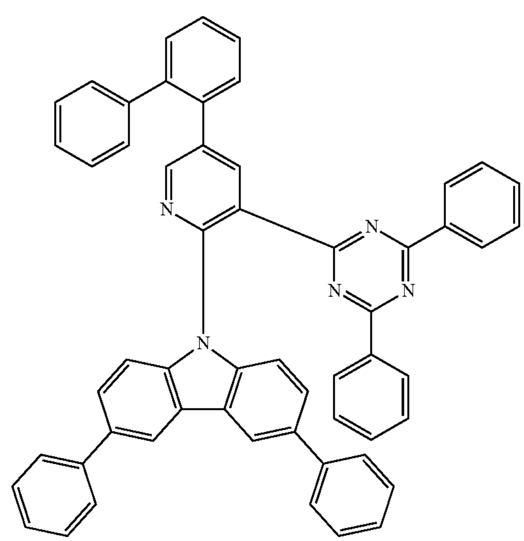

-continued
439
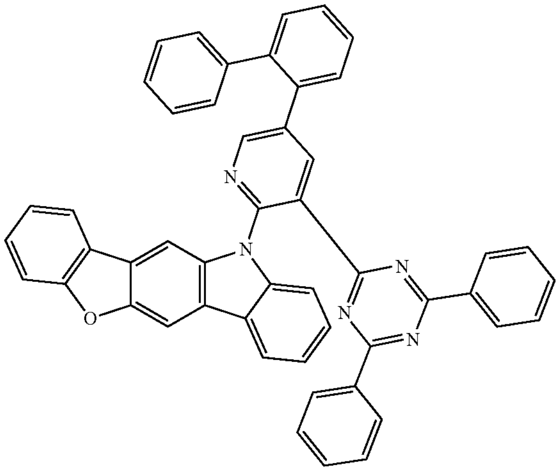
440
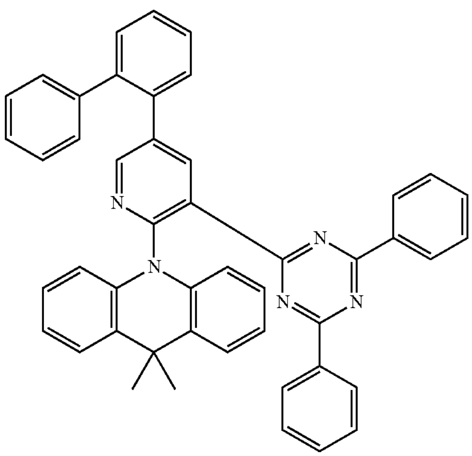
441
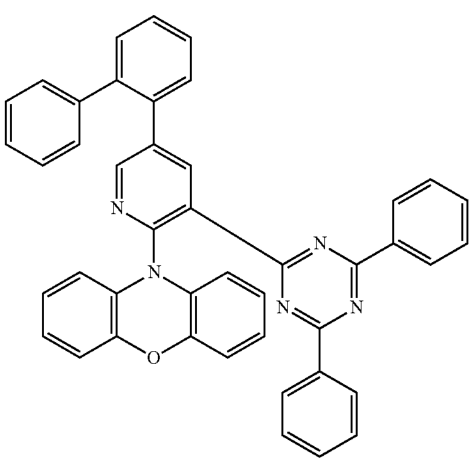
-continued
442
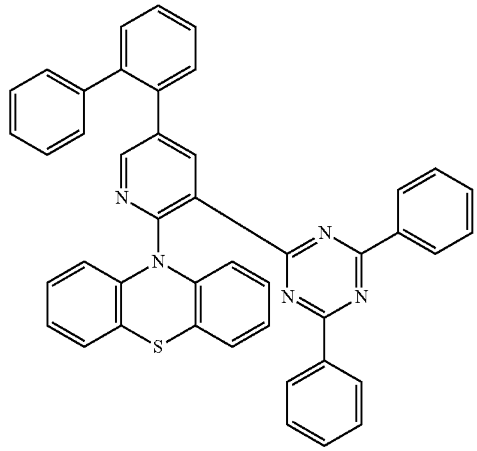
443
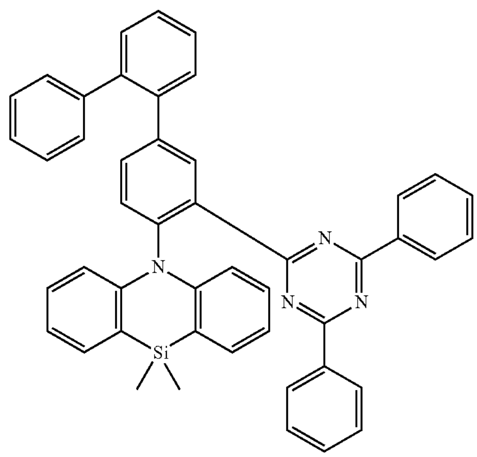
444
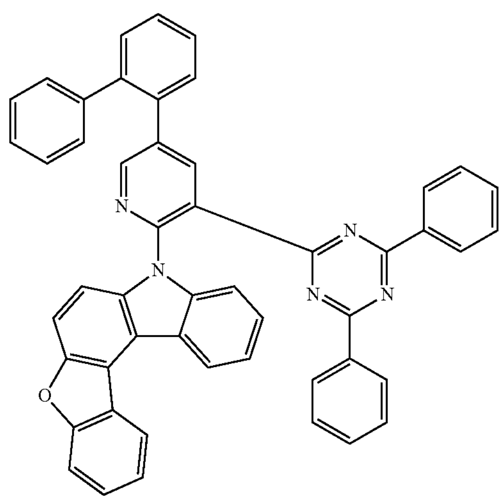

-continued
445
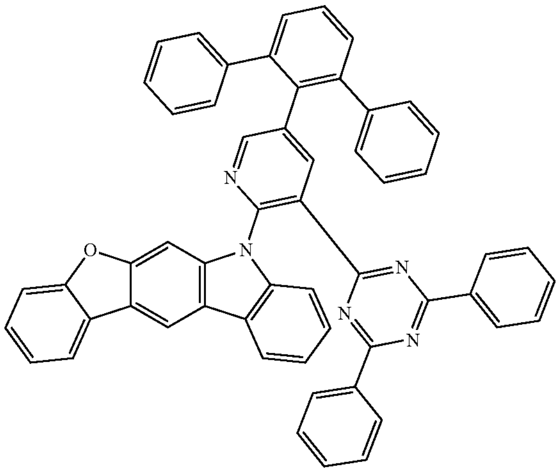
446
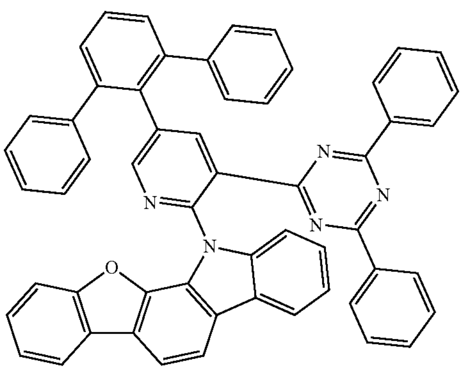
447
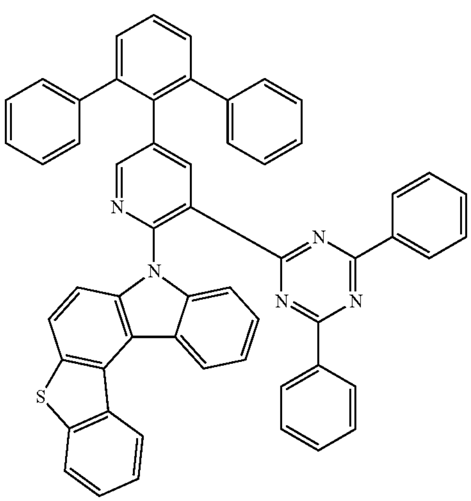
-continued
448
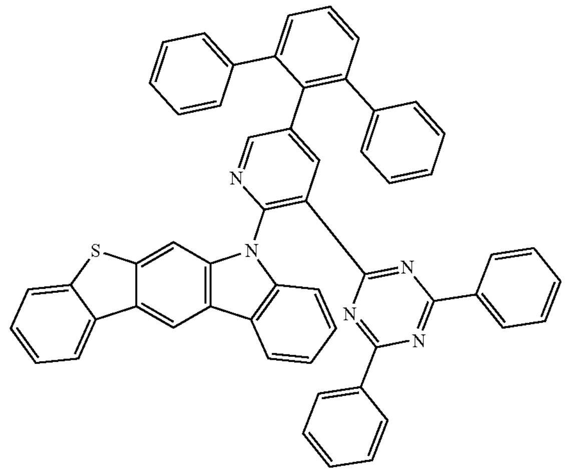
449
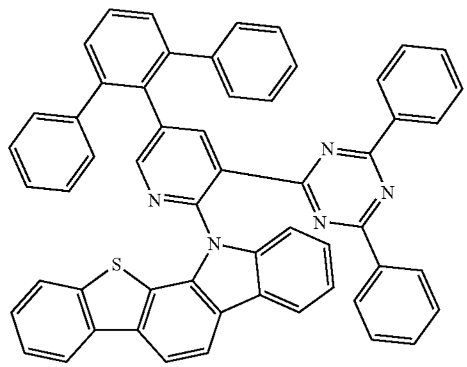
450
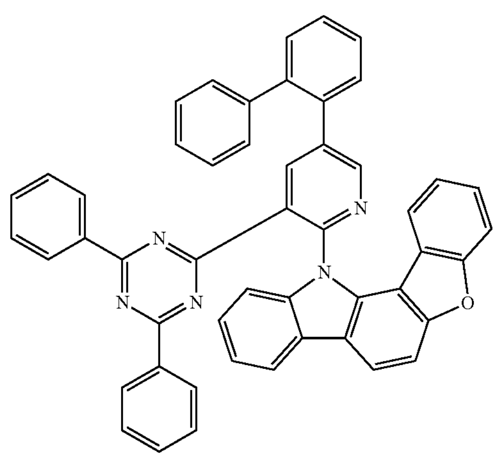

451
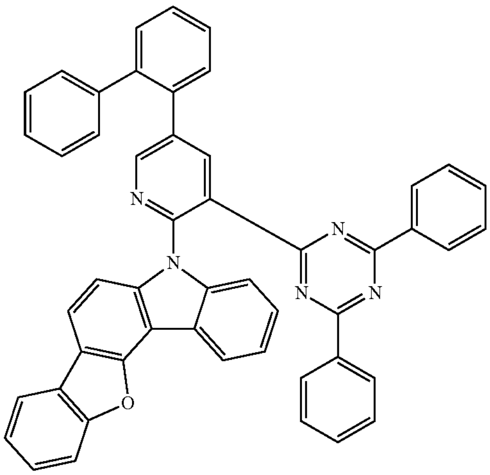
452
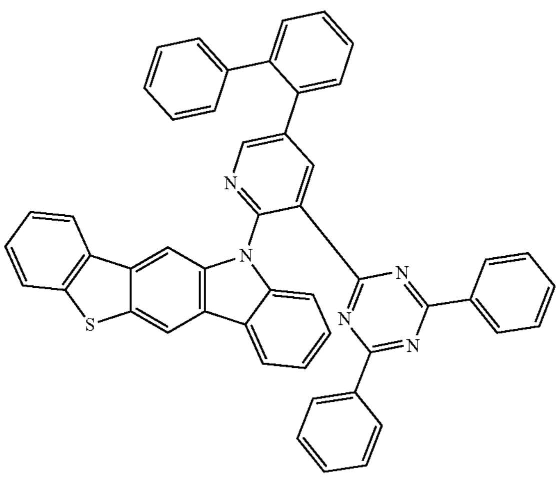
453
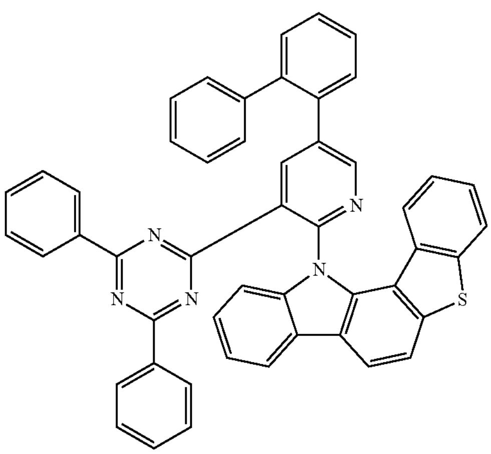
454
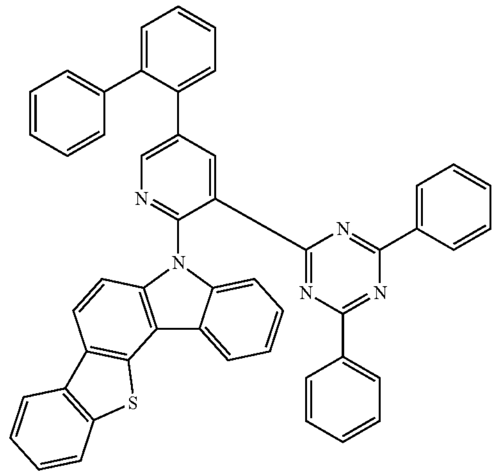
455
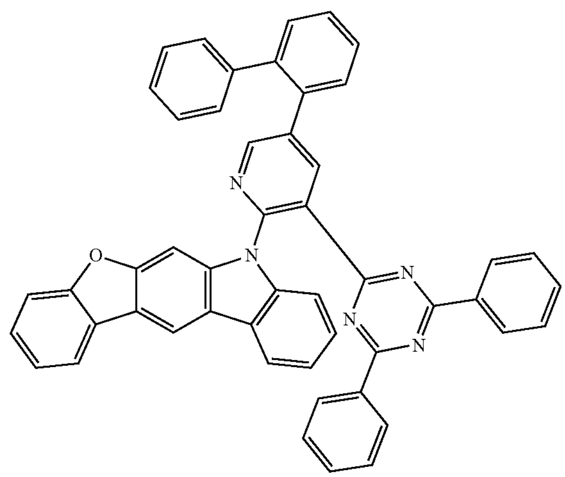
456
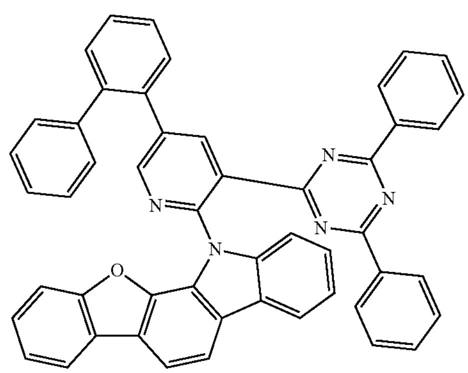

-continued
457
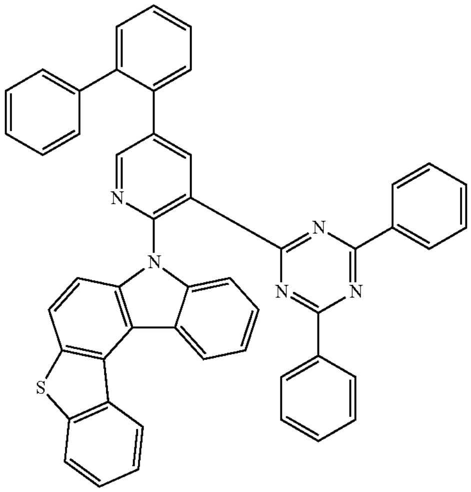
458
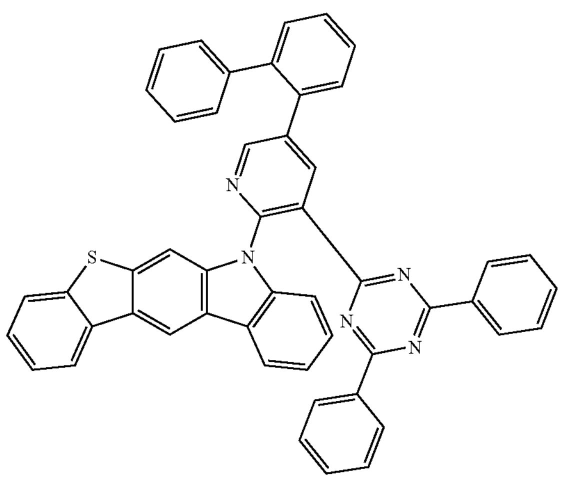
459
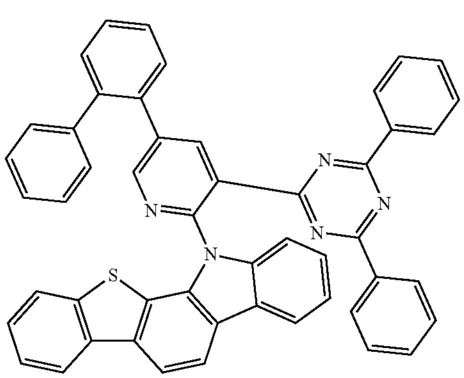
-continued
460
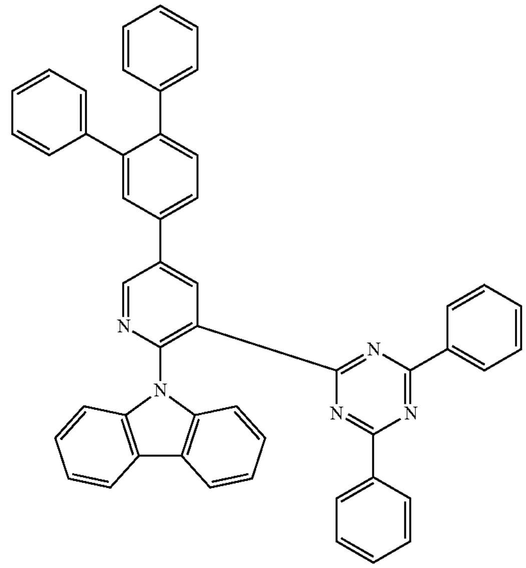
461
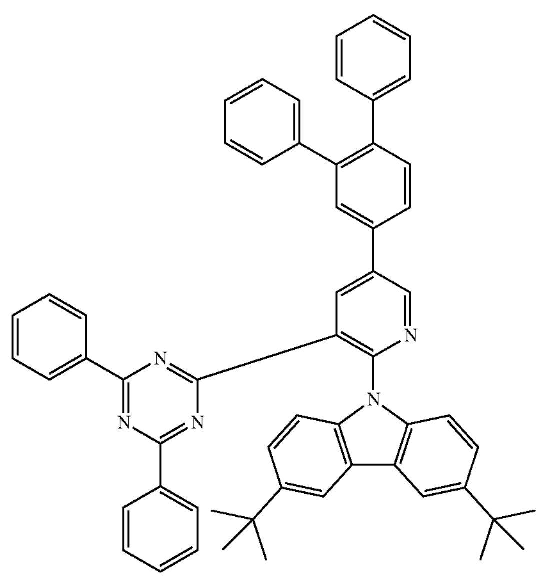

-continued
462
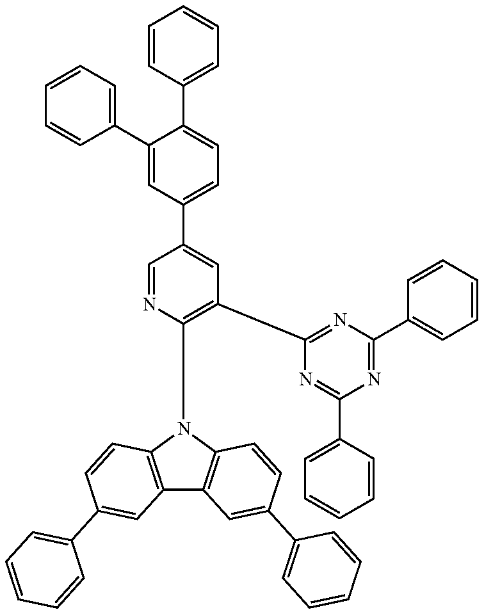
463
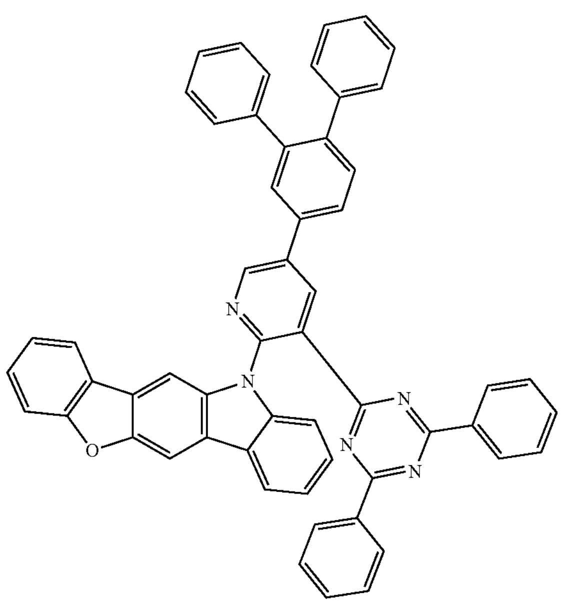
-continued
464
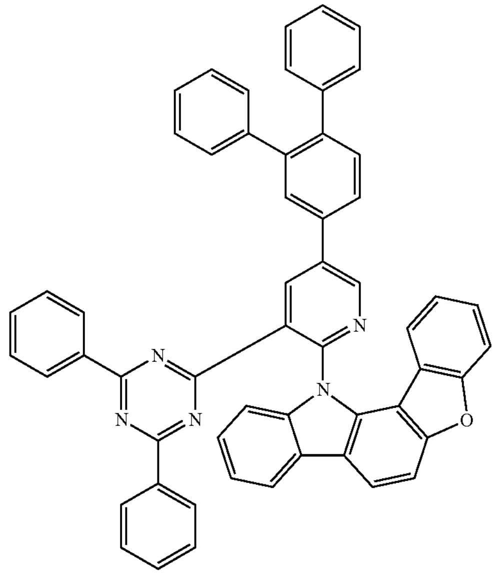
465
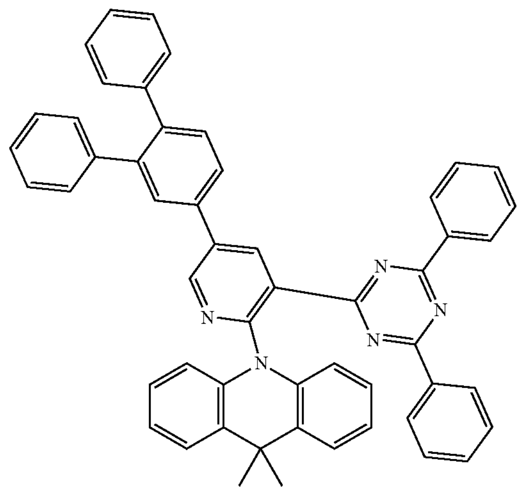
466
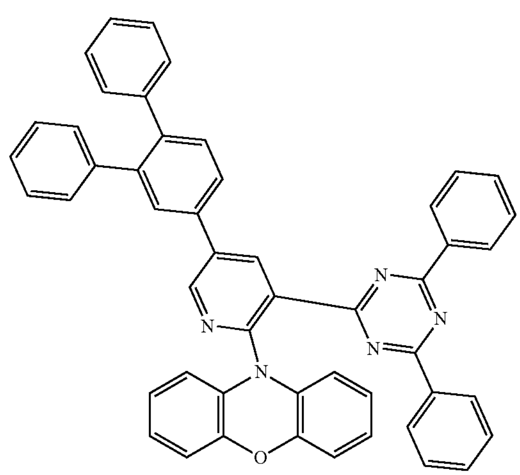

467
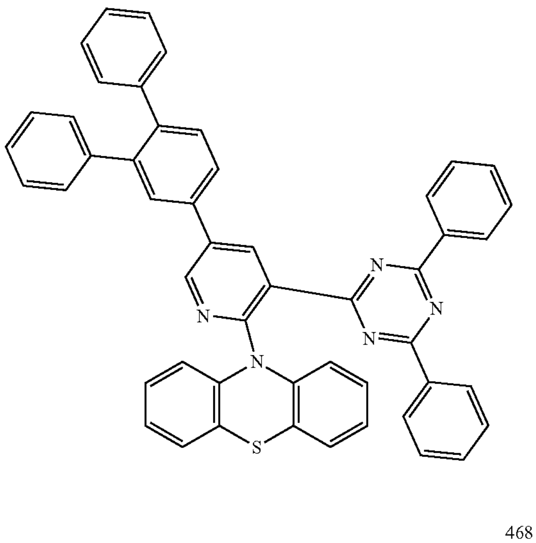
468
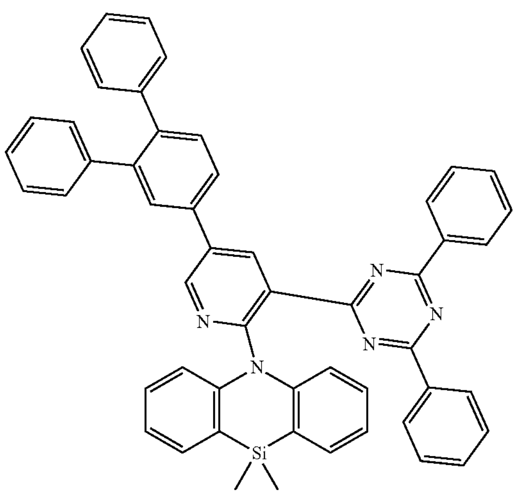
469
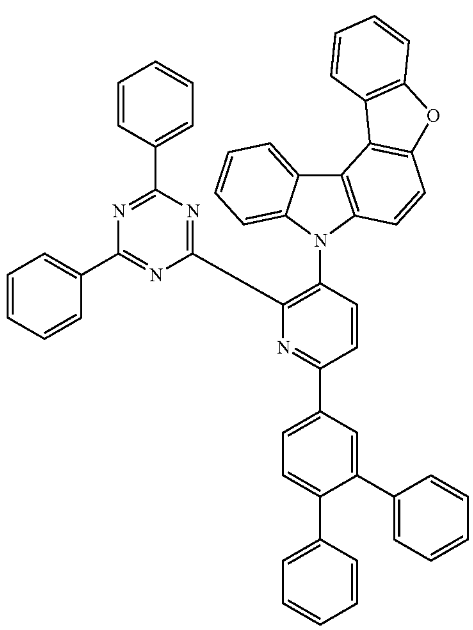
470
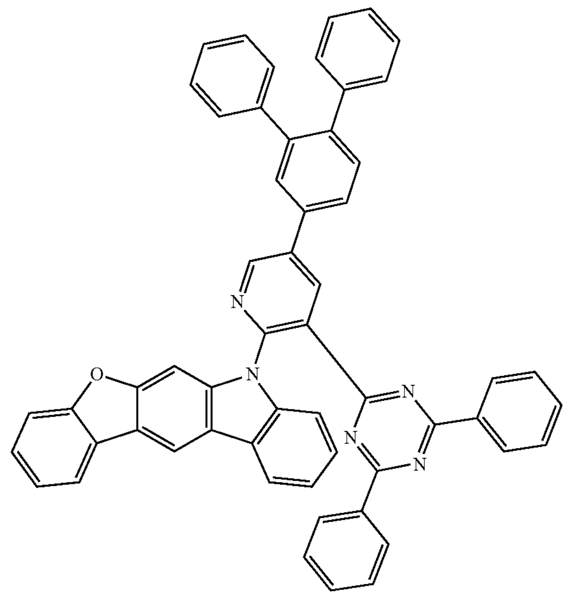
471
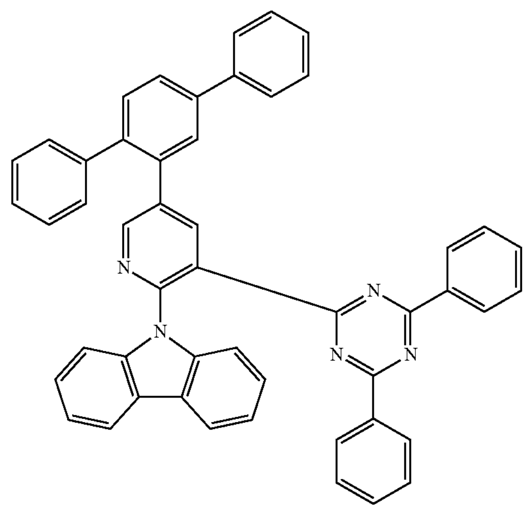
472
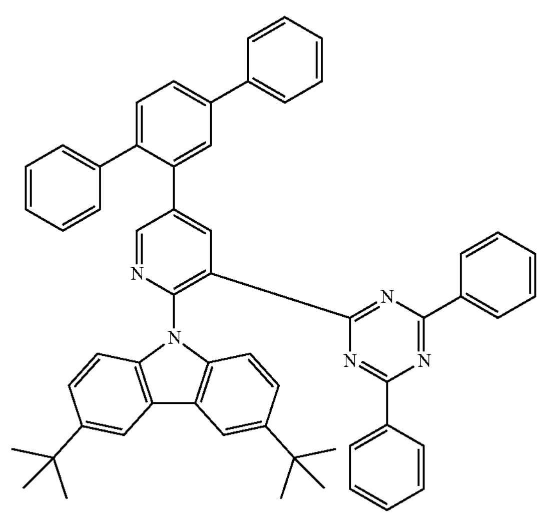

473
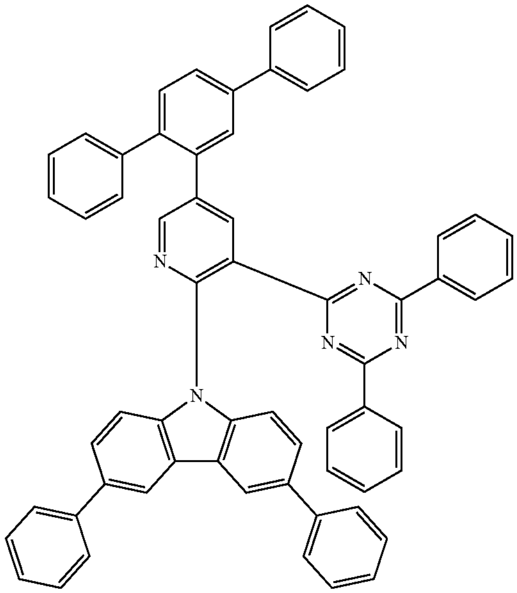
474
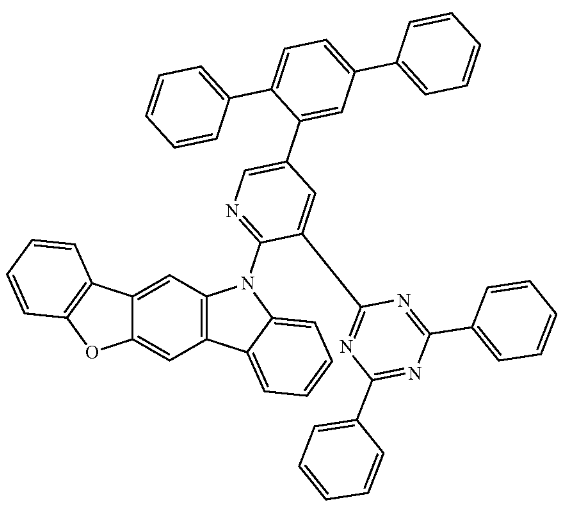
475
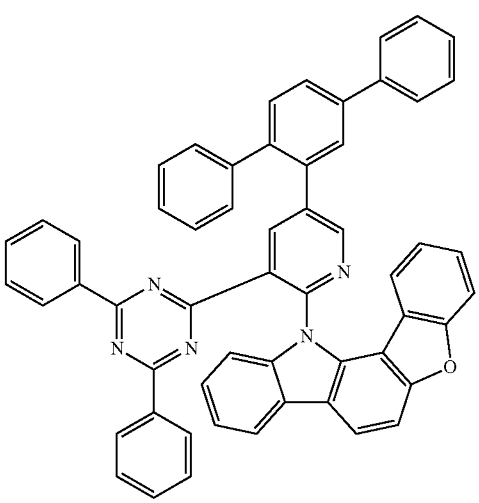
476
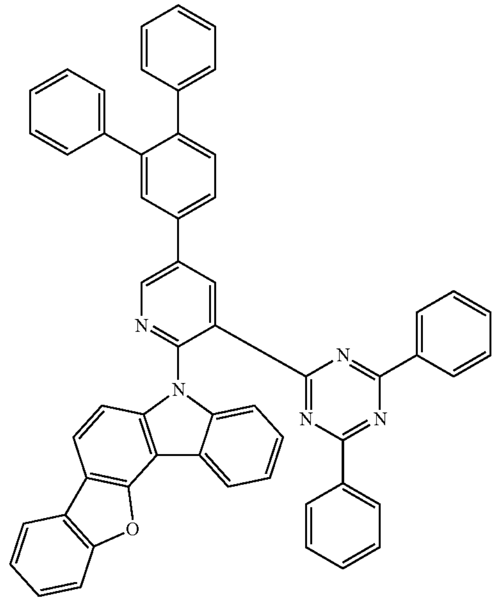
477
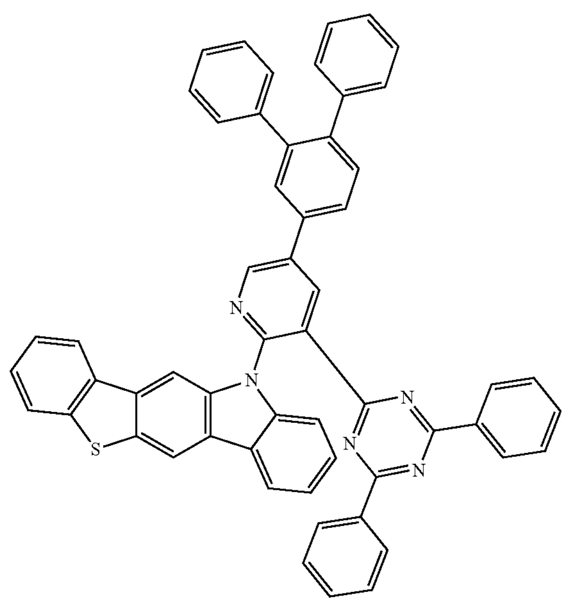

-continued
478
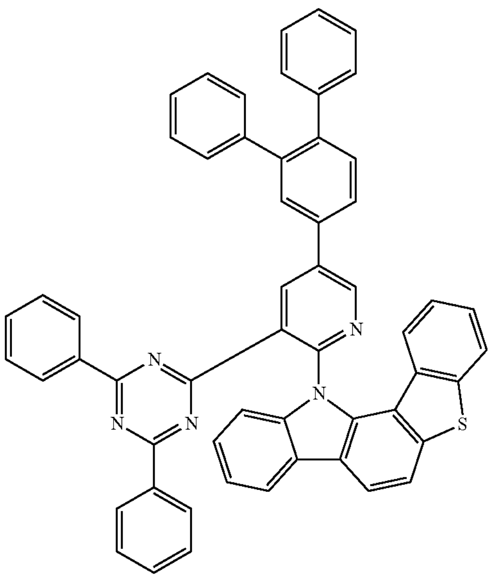
479
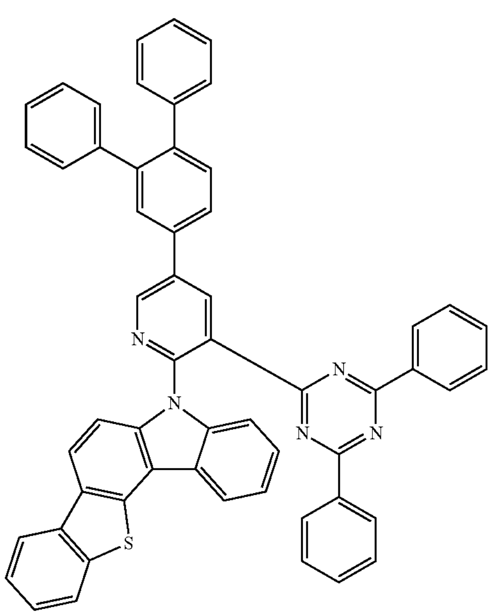
-continued
480
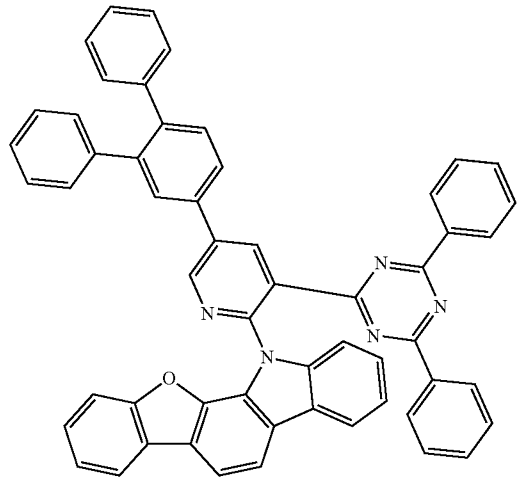
481
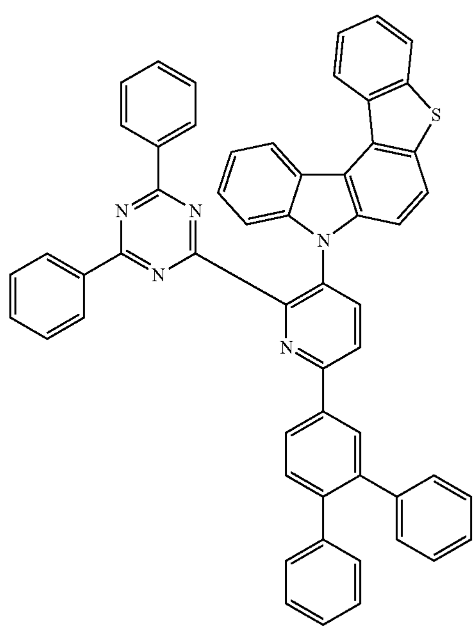

-continued
482
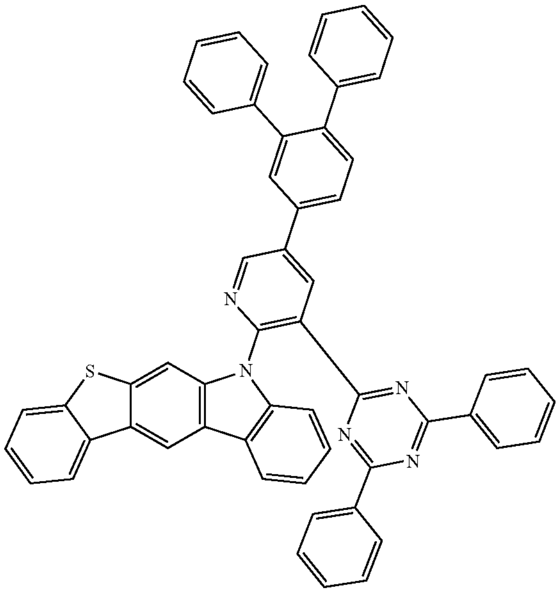
483
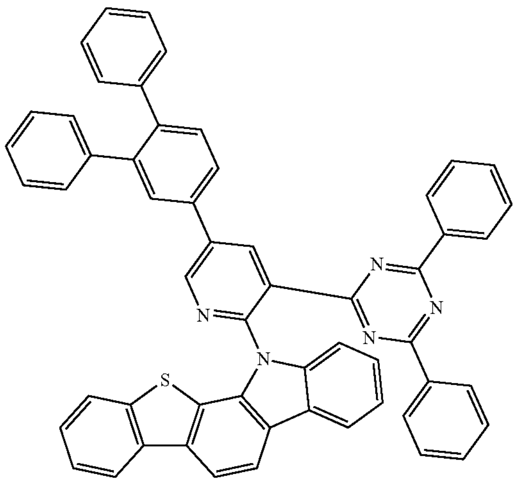
484
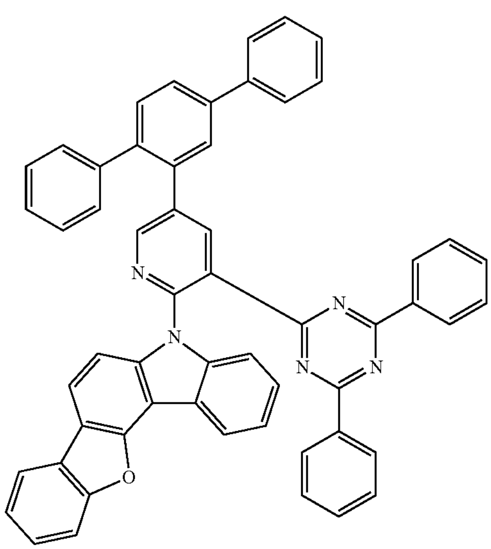
-continued
485
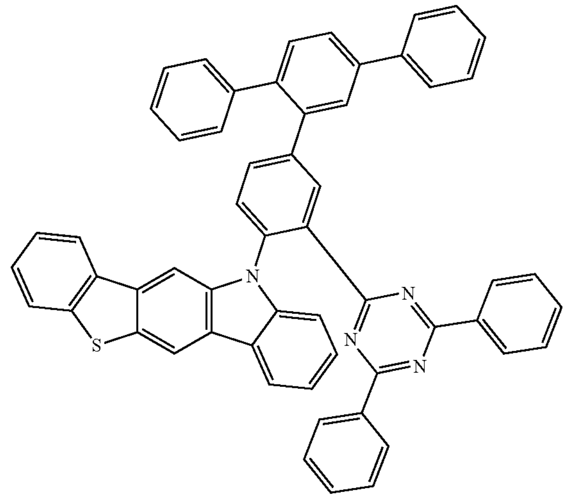
486
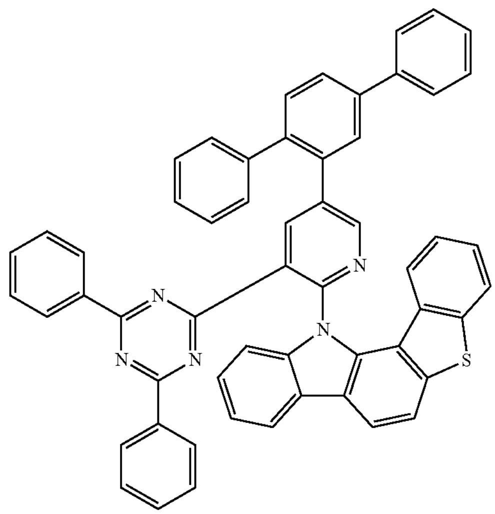
487
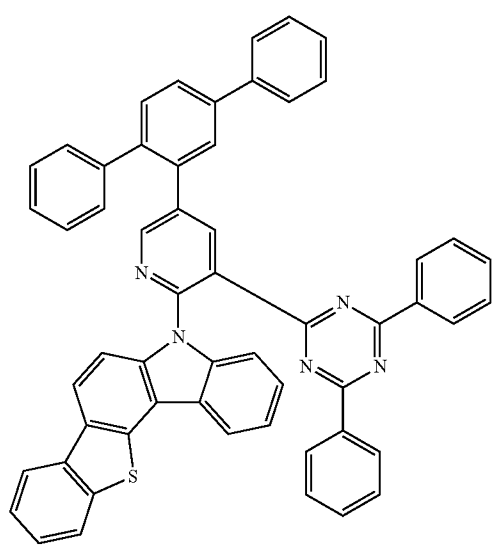

488
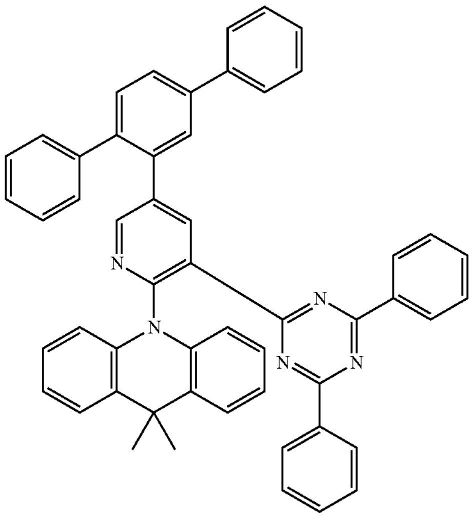
489
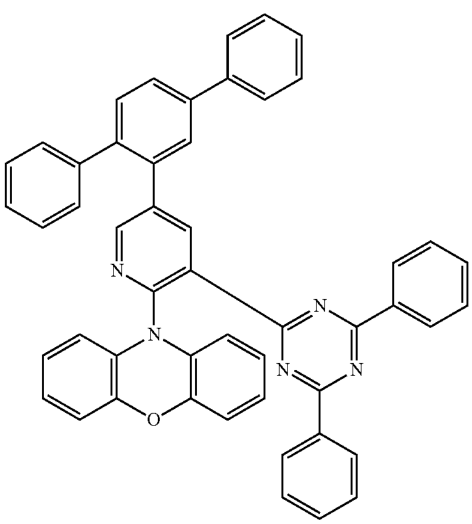
490
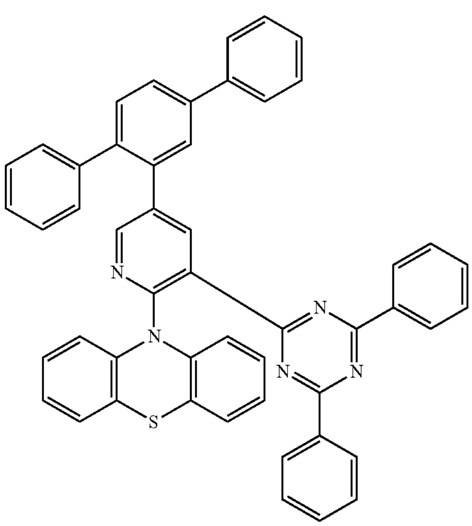
491
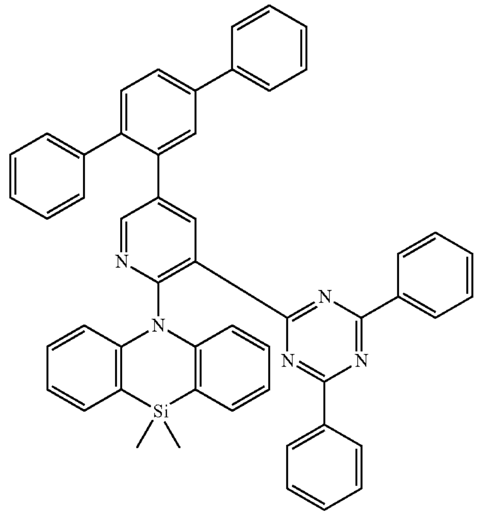
492
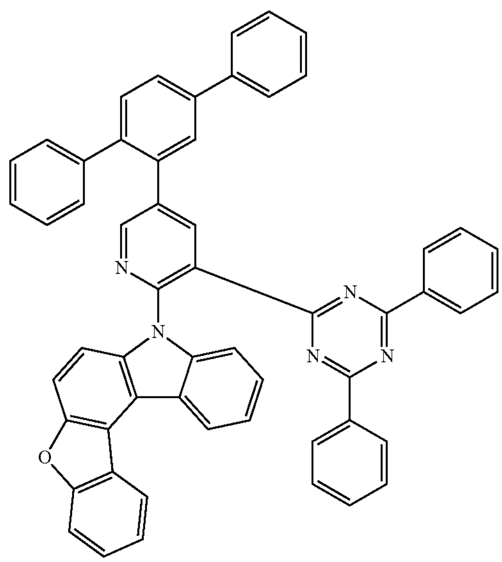
493
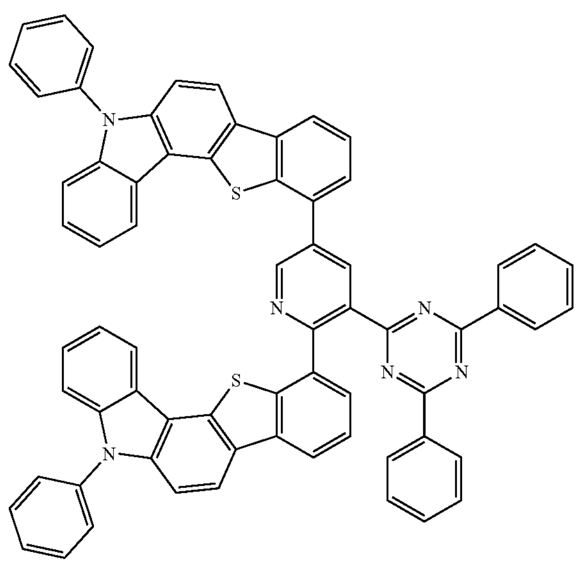

-continued
494
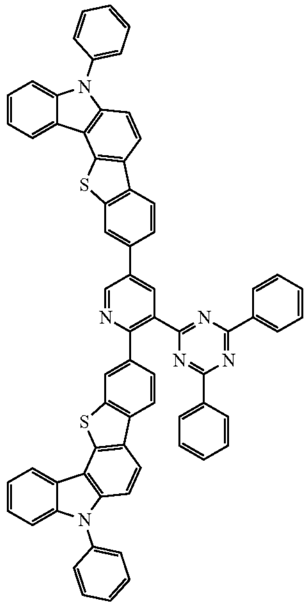
495
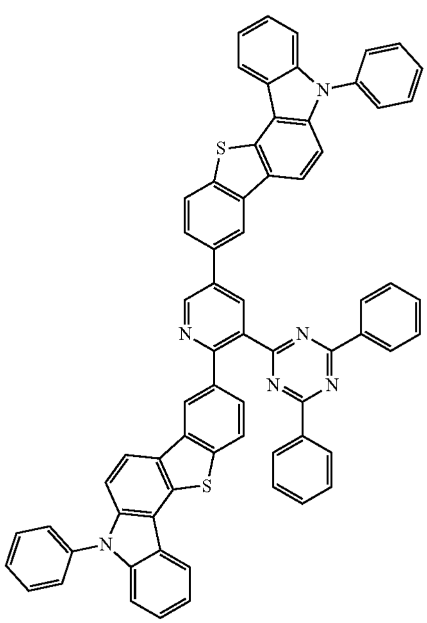
-continued
496
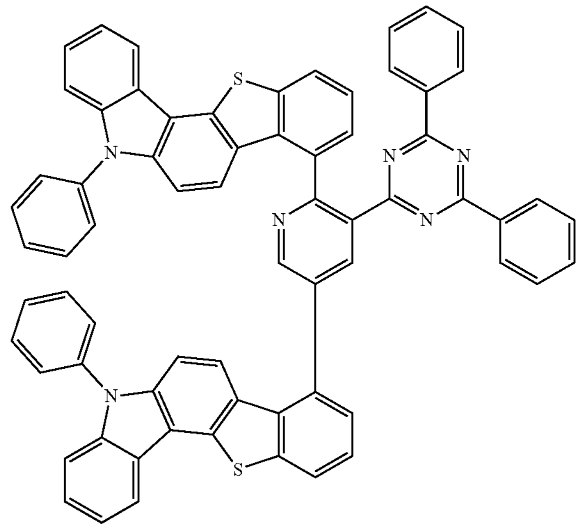
497
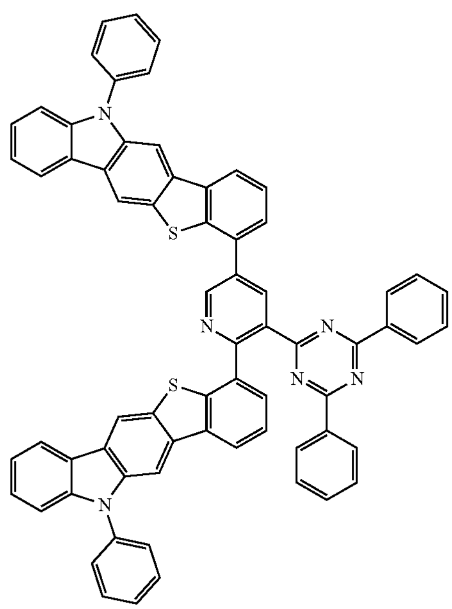

498
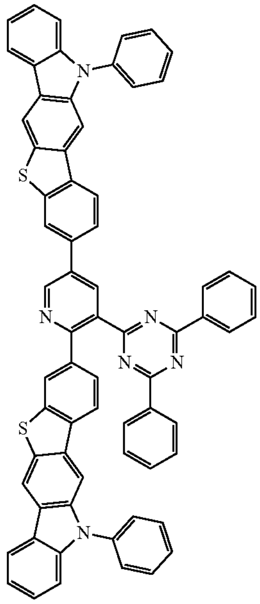
499
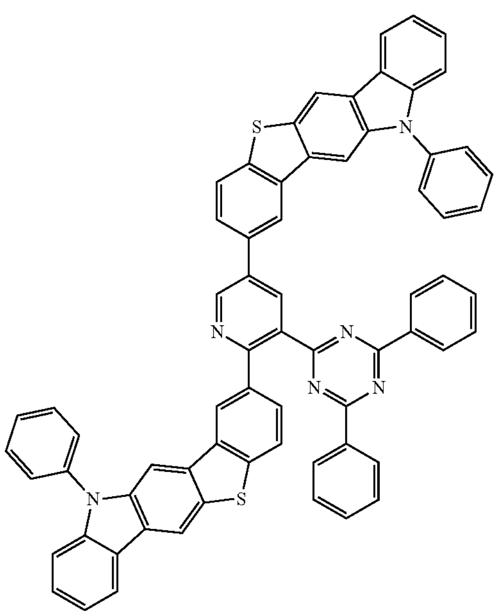
500
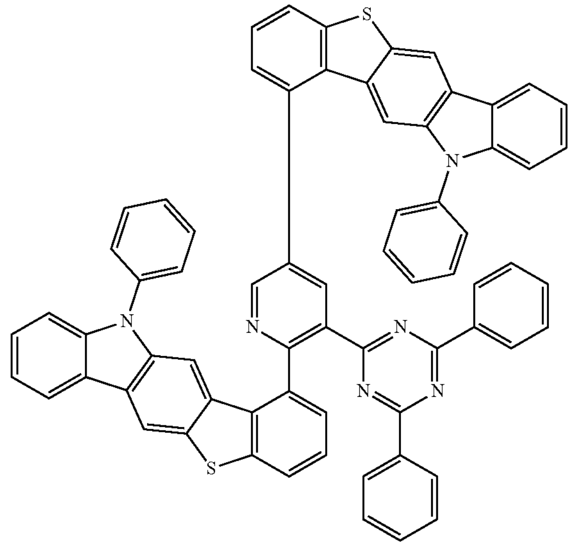
501
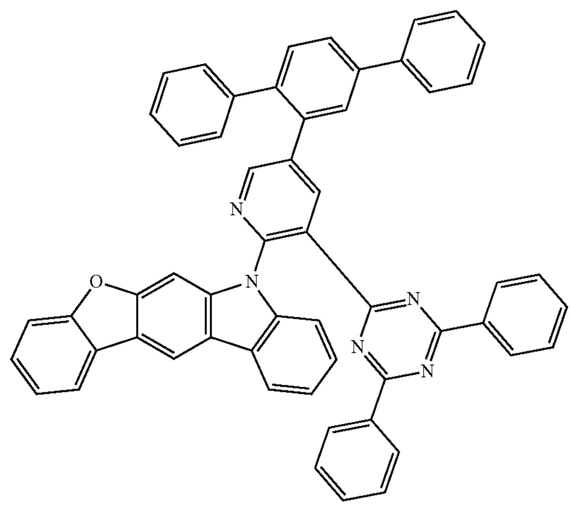
502
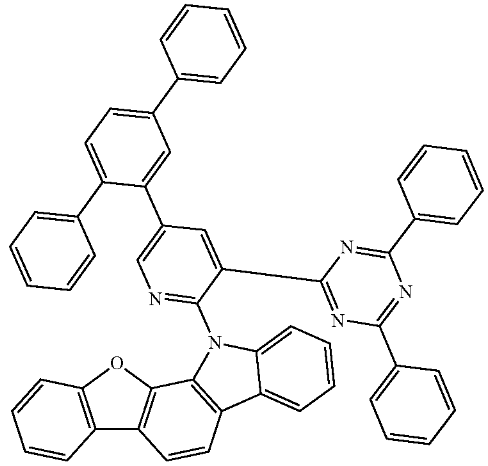

-continued
503
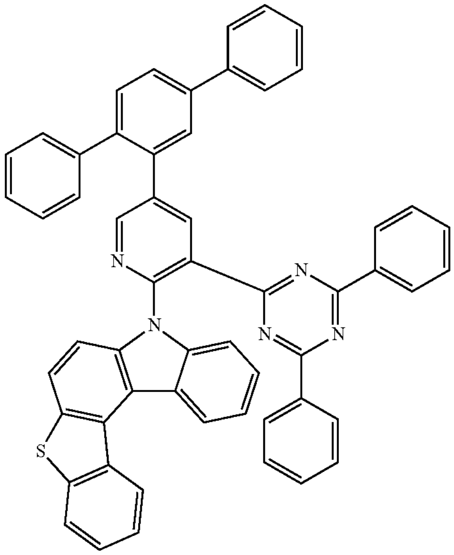
504
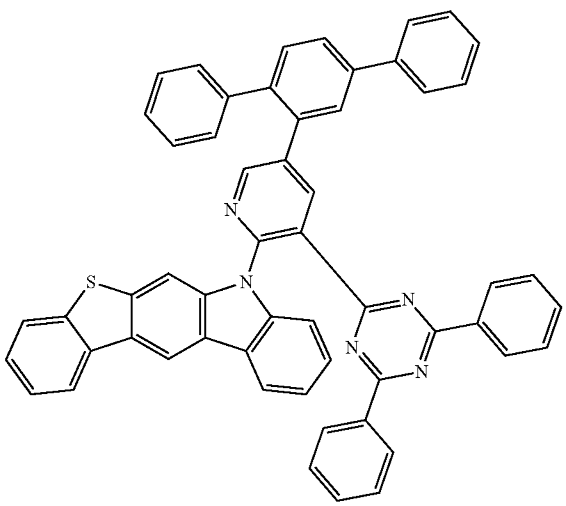
505
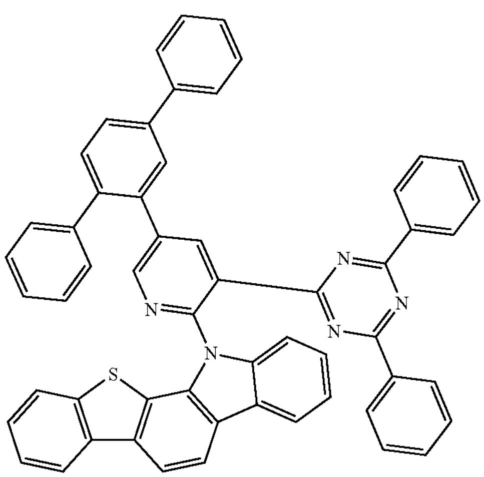
-continued
506
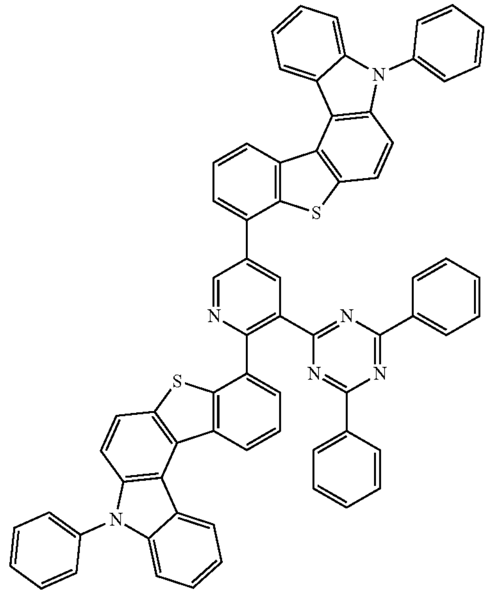
507
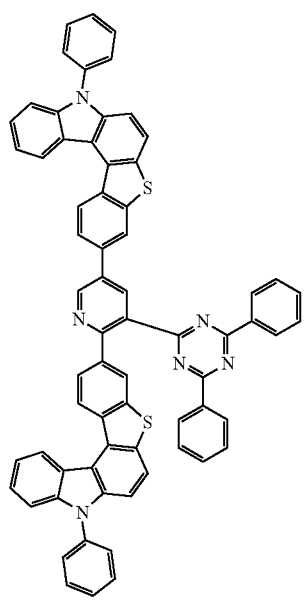

-continued
508
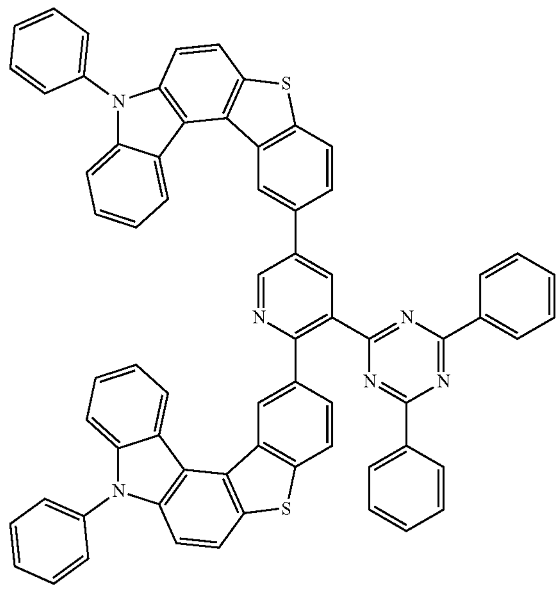
509
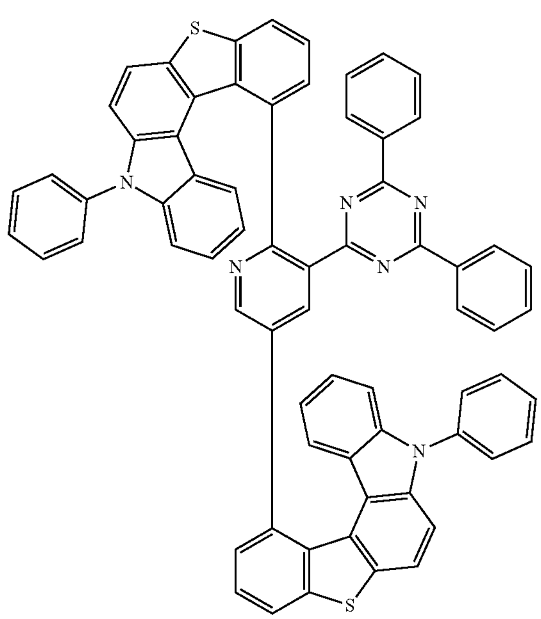
-continued
510
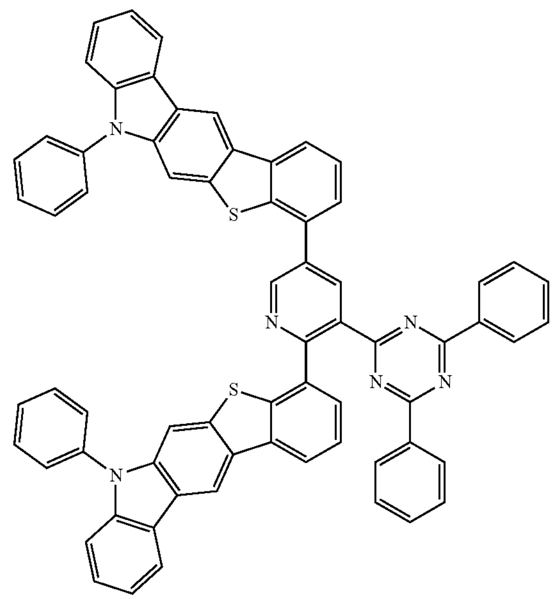
511
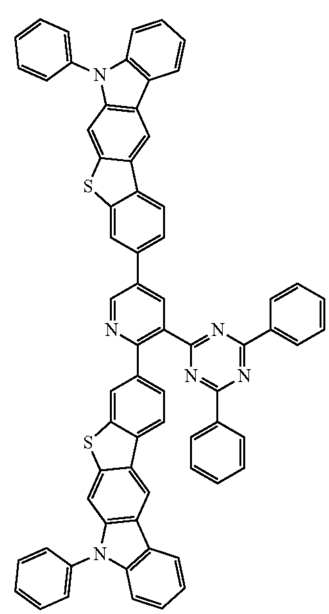

-continued
512
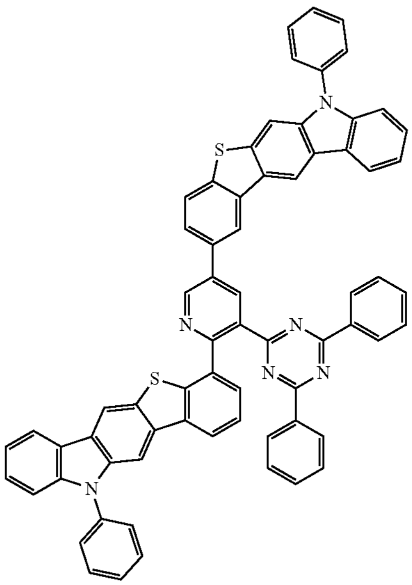
513
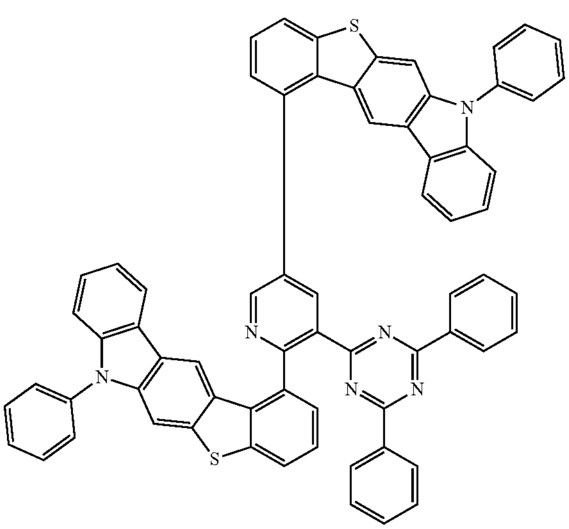
-continued
514
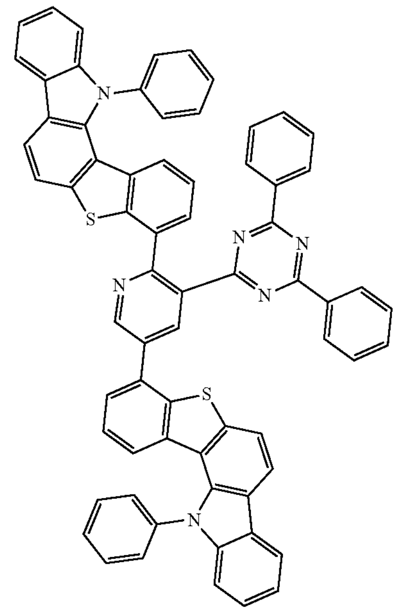
515
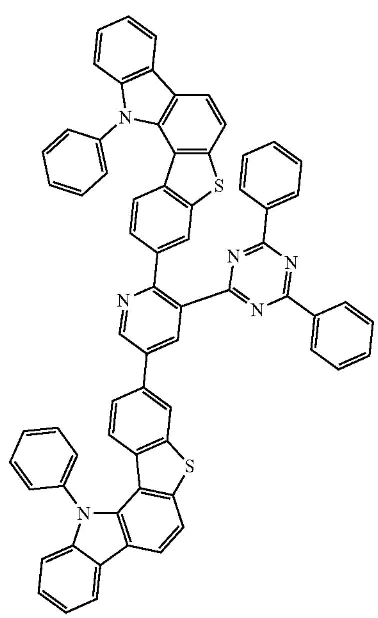

-continued
516
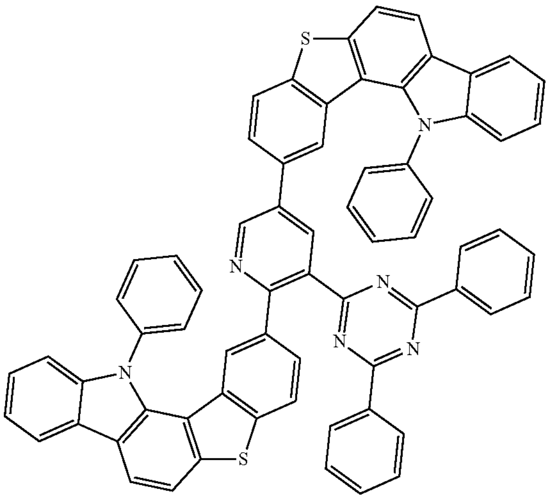
517
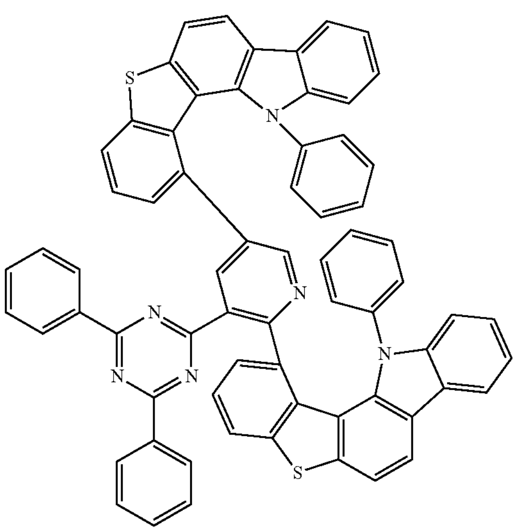
518
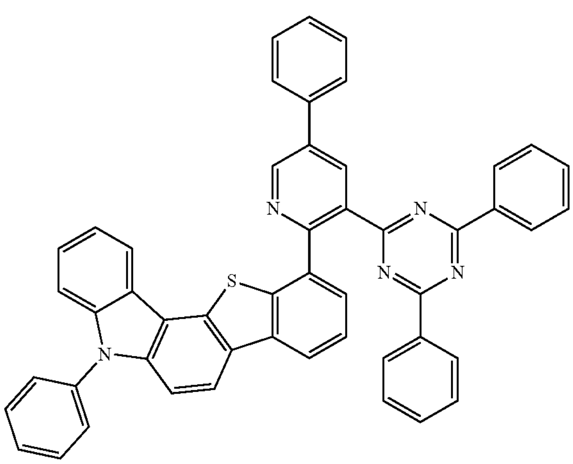
-continued
519
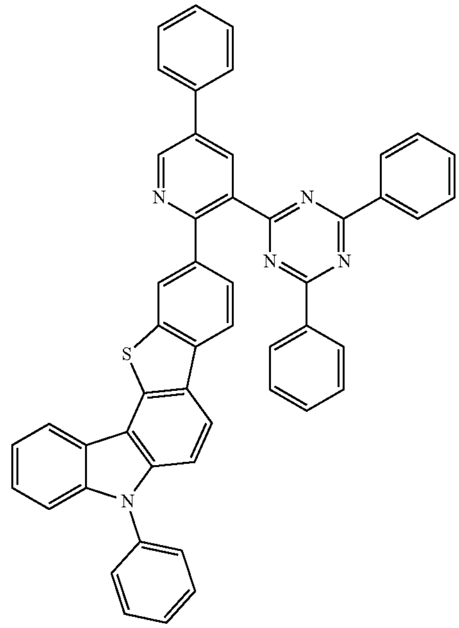
520
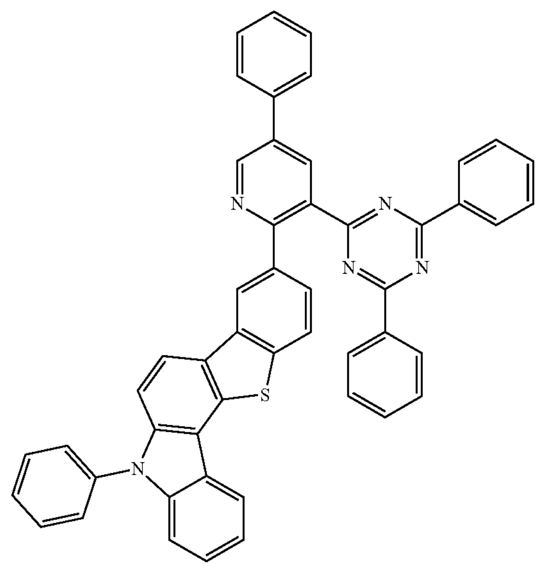
521
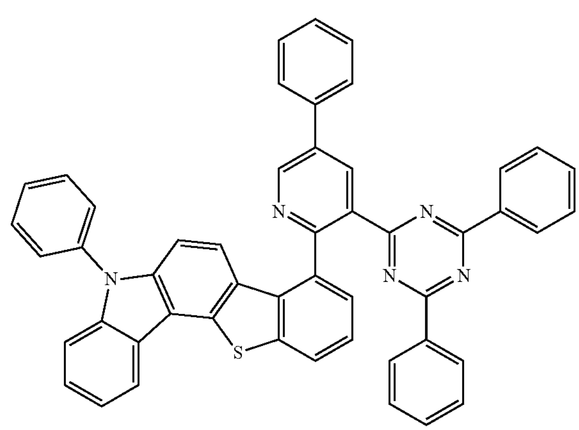

-continued
522
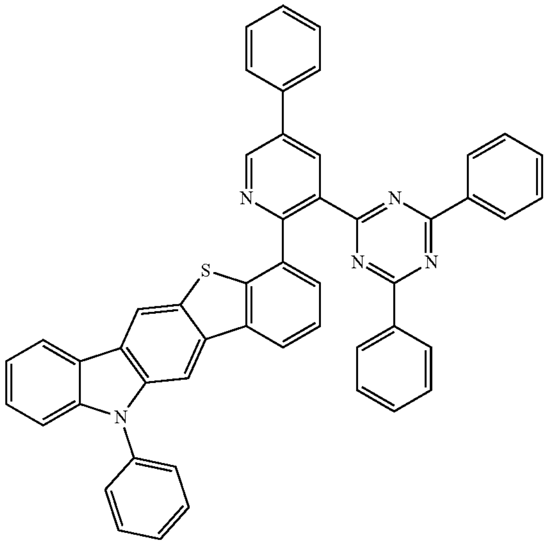
523
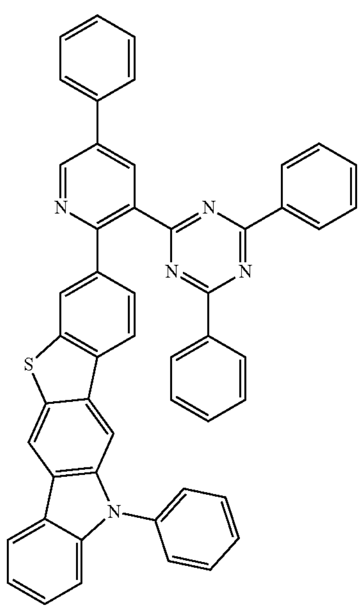
-continued
524
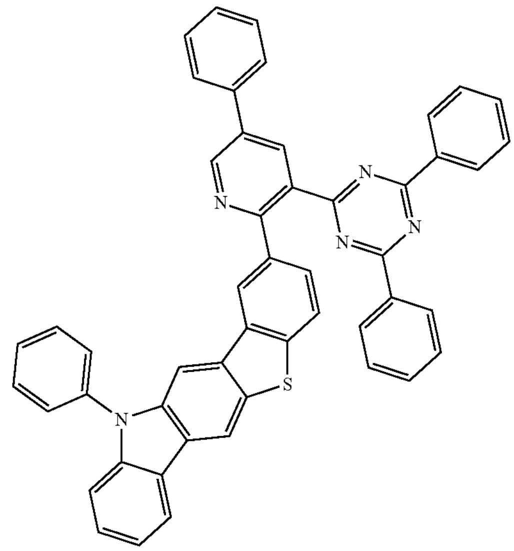
525
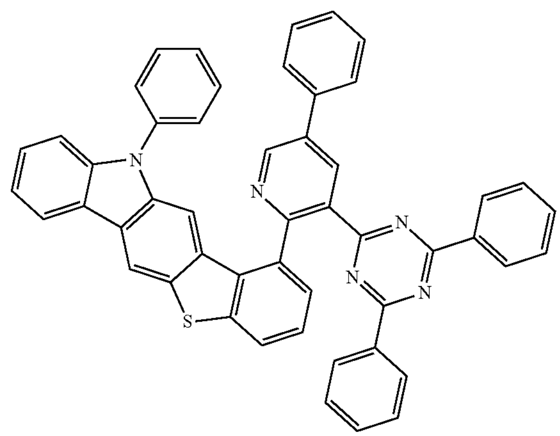
526
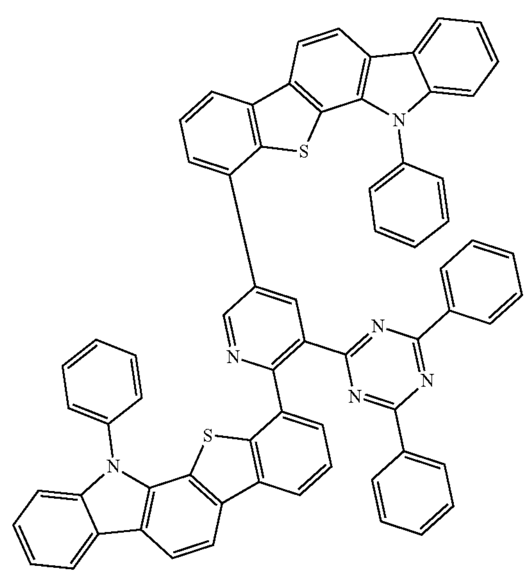

-continued
527
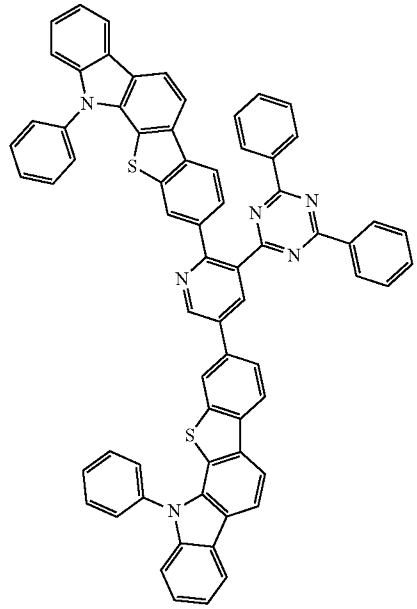
528
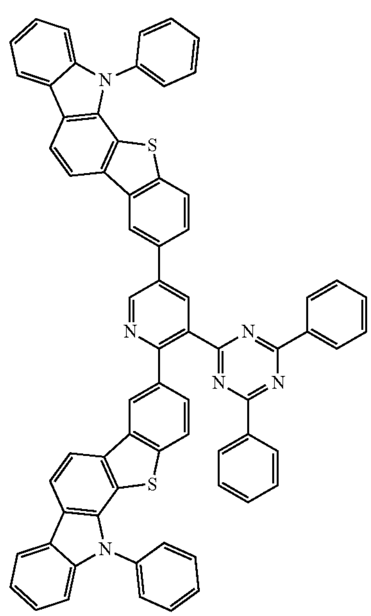
-continued
529
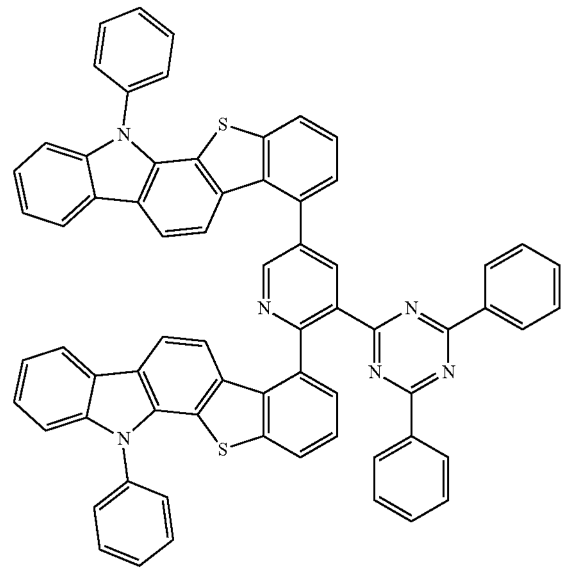
530
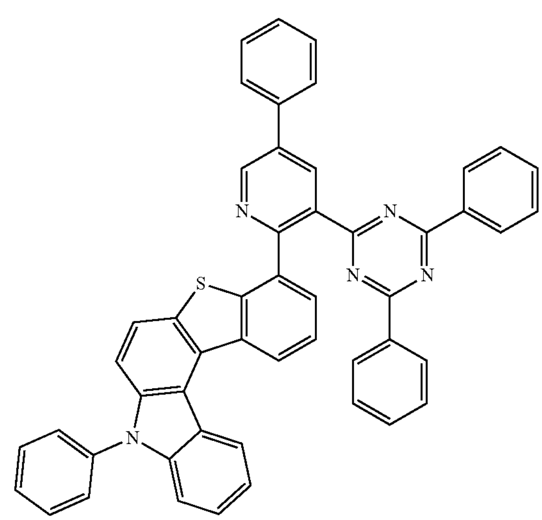

-continued
531
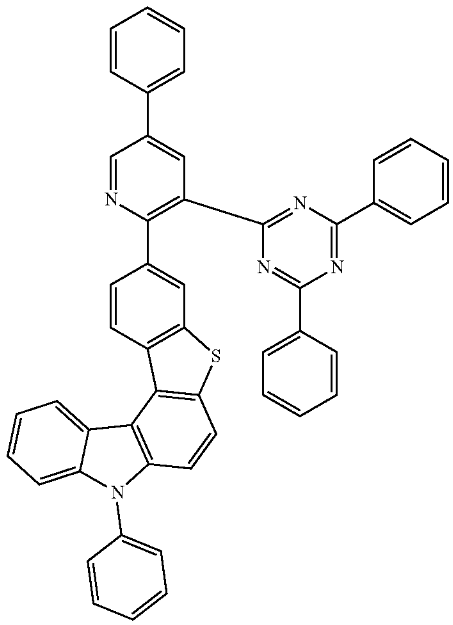
532
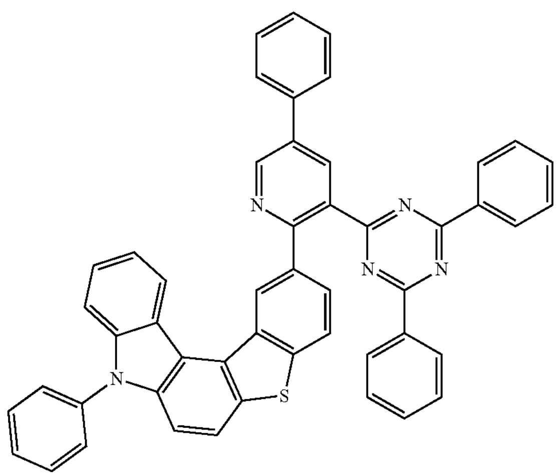
533
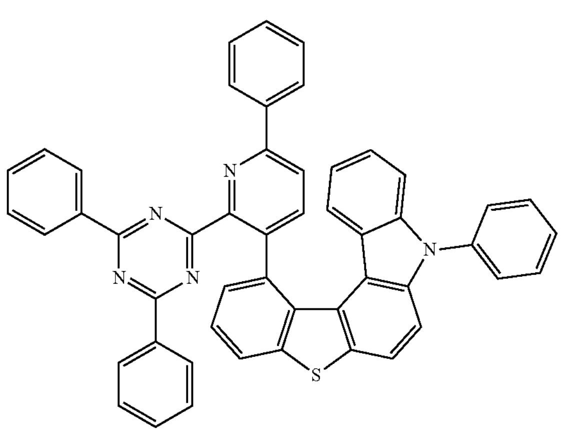
-continued
534
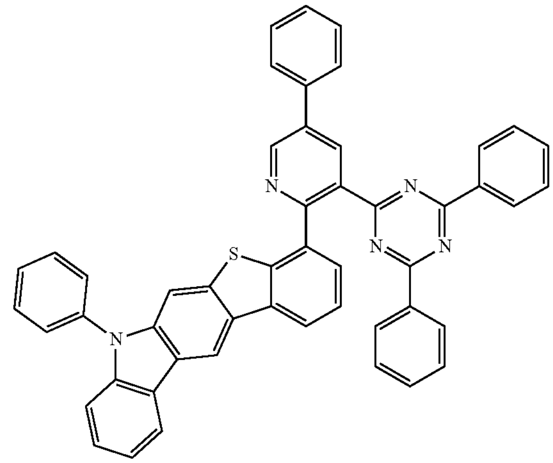
535
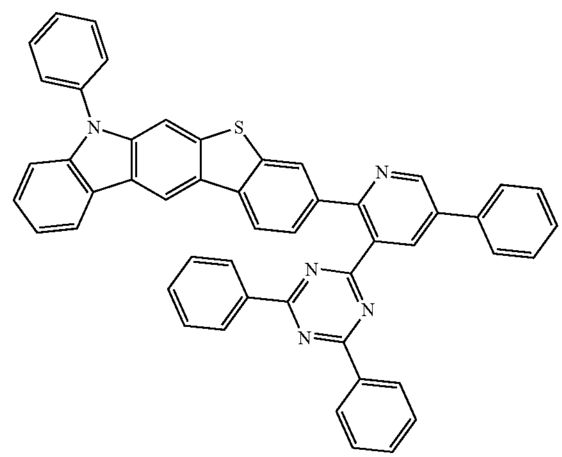
536
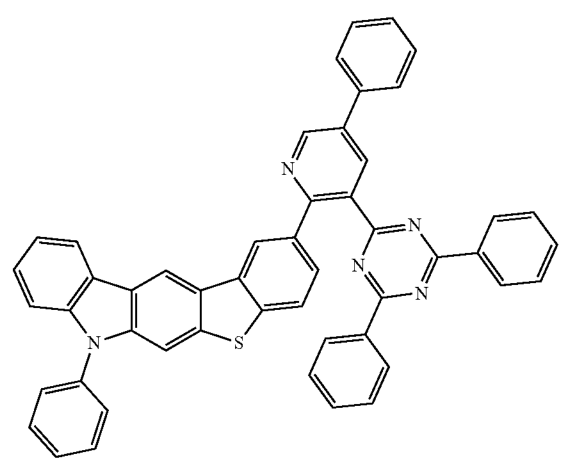

-continued
537
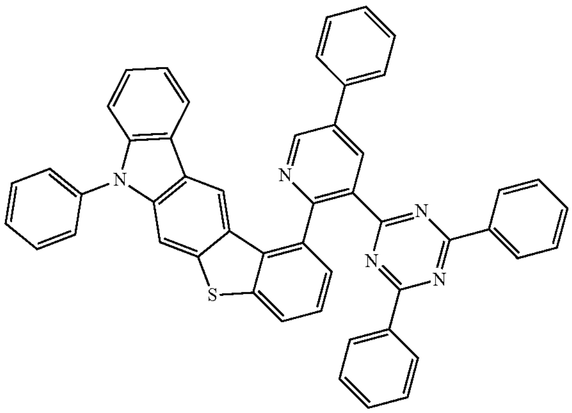
538
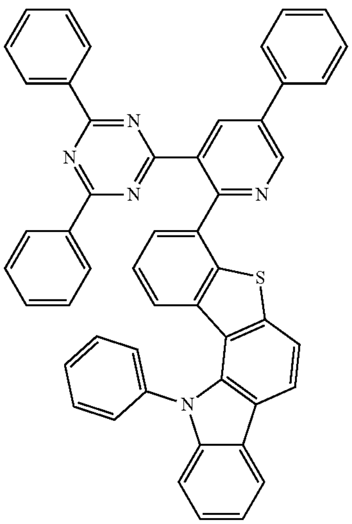
539
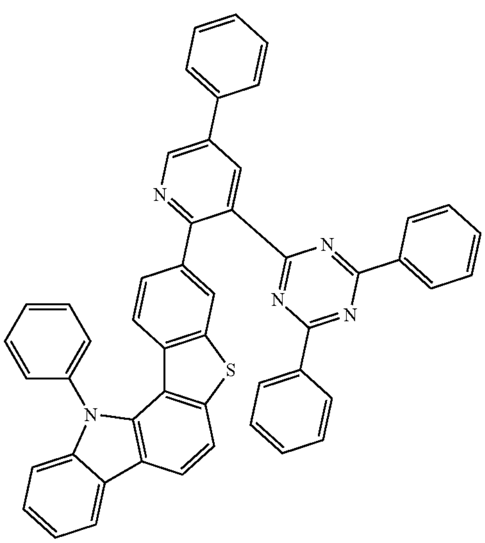
-continued
540
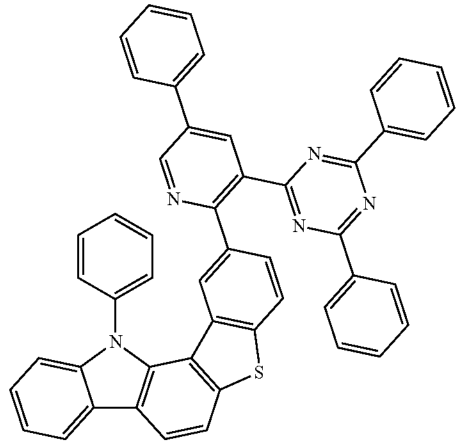
541
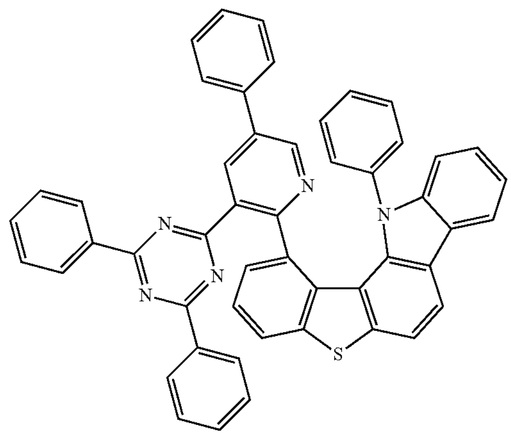
542
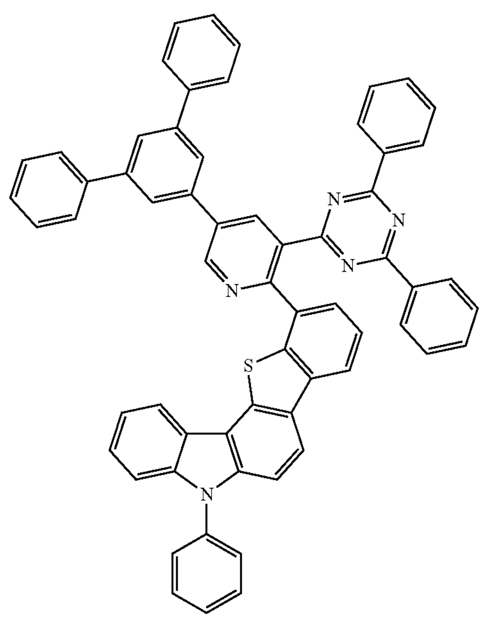

-continued
543
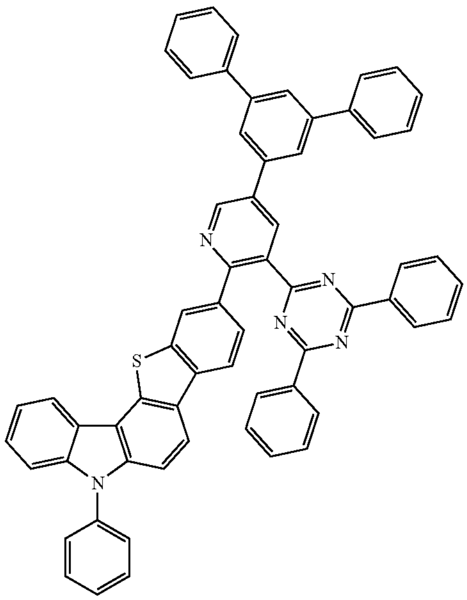
544
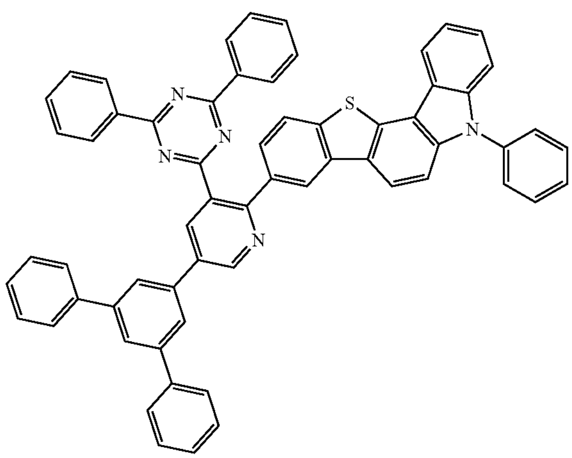
545
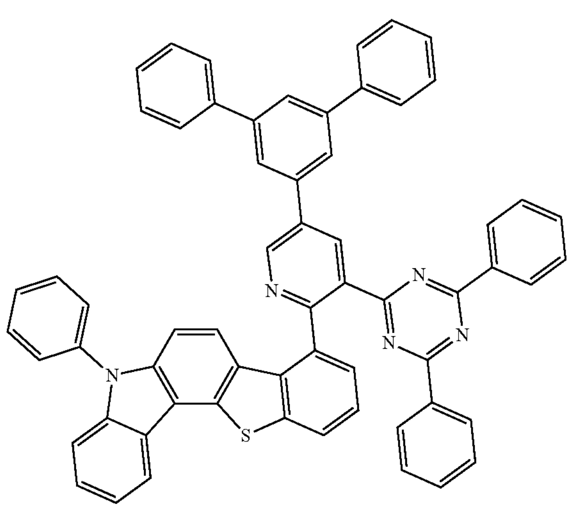
-continued
546
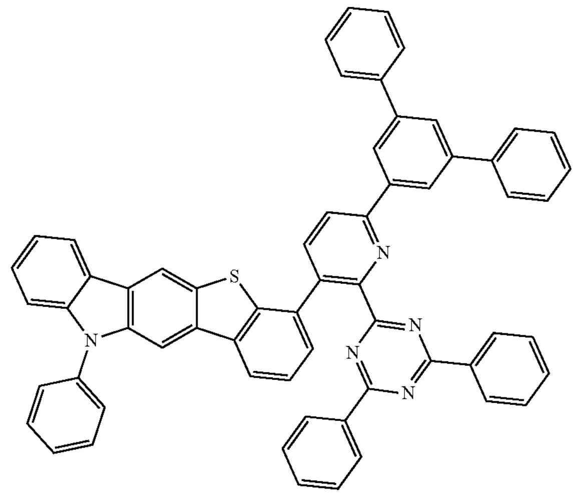
547
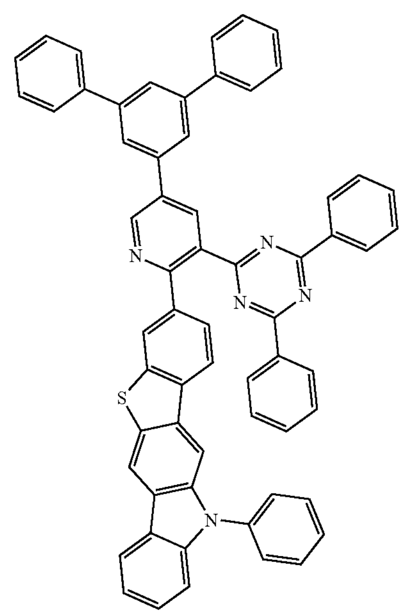

-continued
548
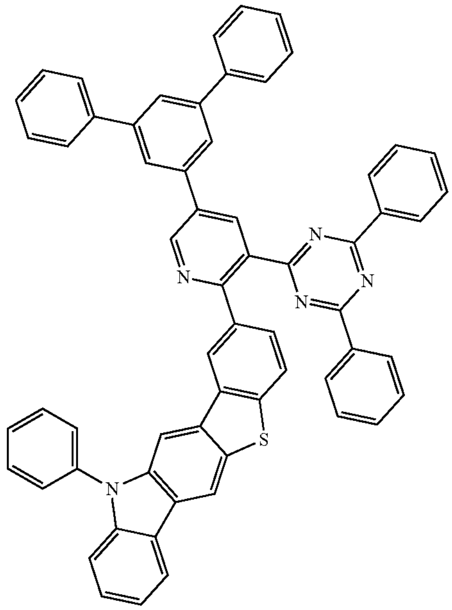
549
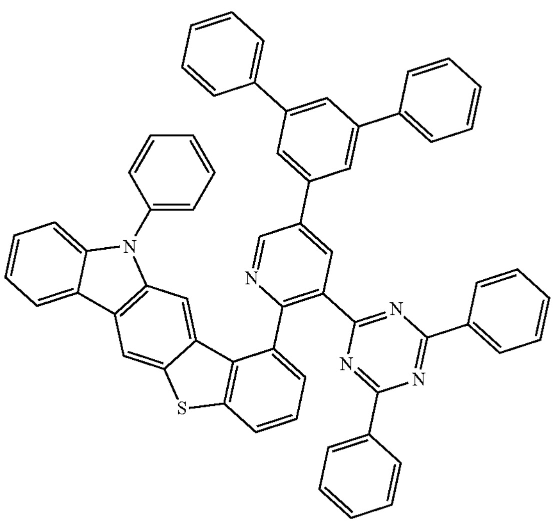
550
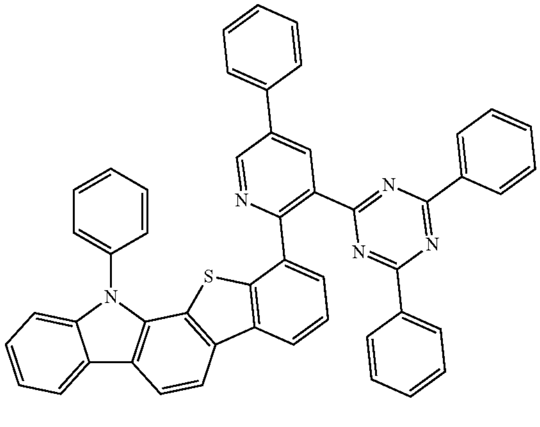
-continued
551
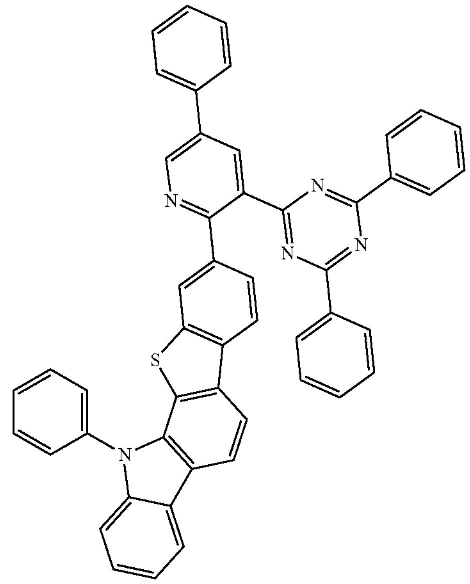
552
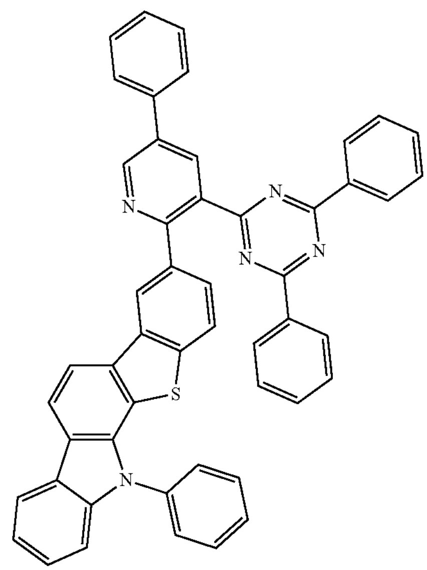
553
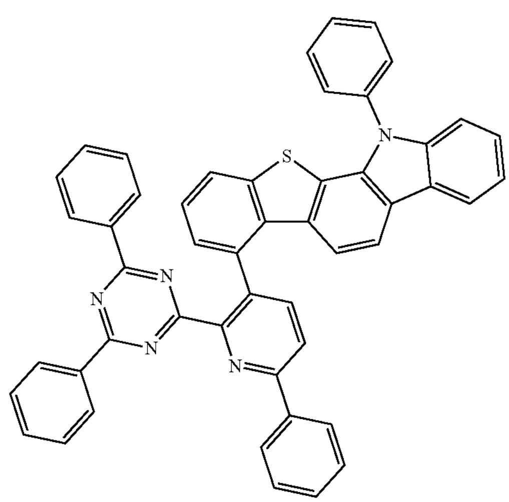

554
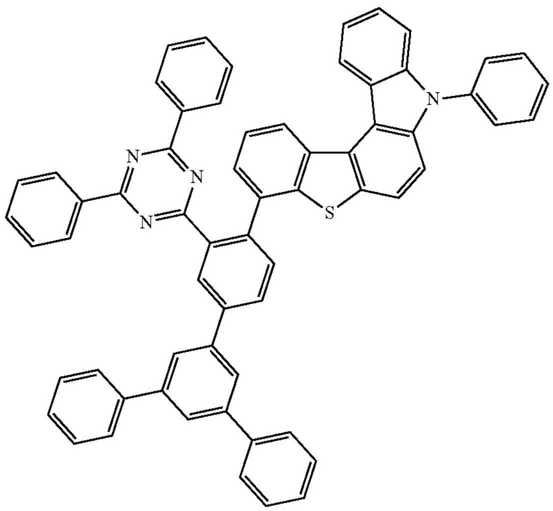
555
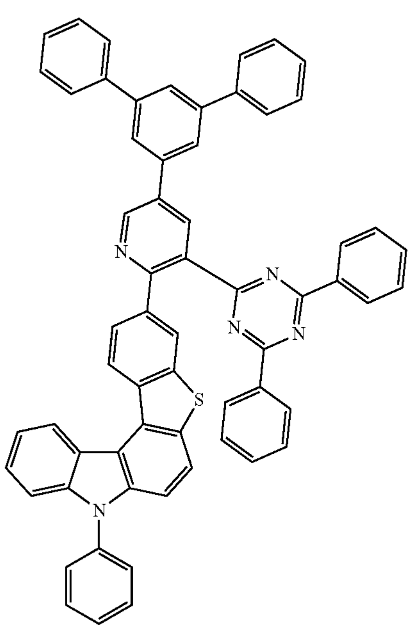
556
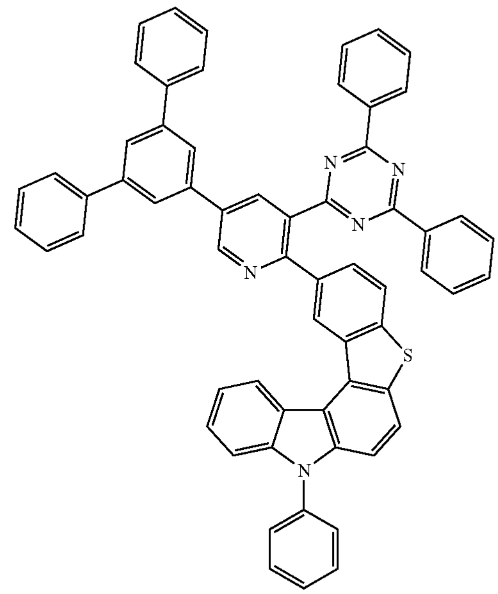
557
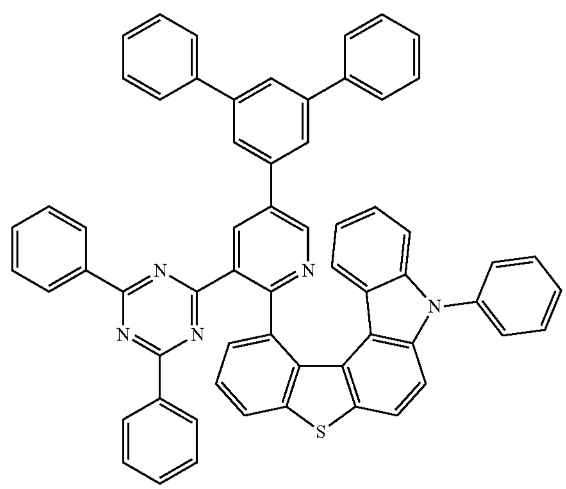
558
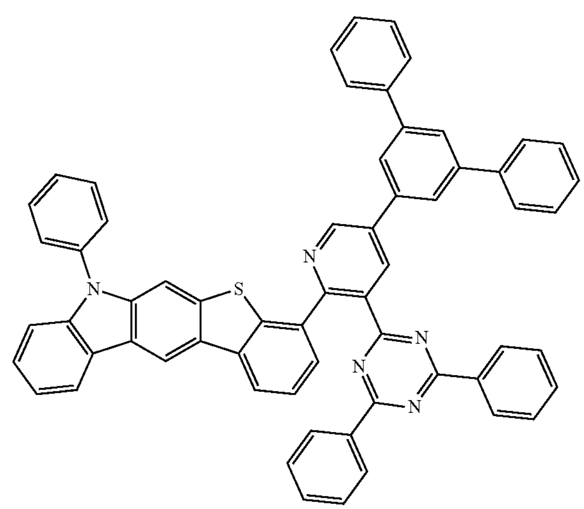

-continued
559
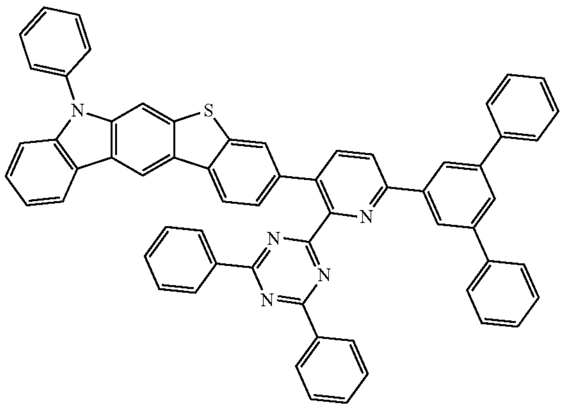
560
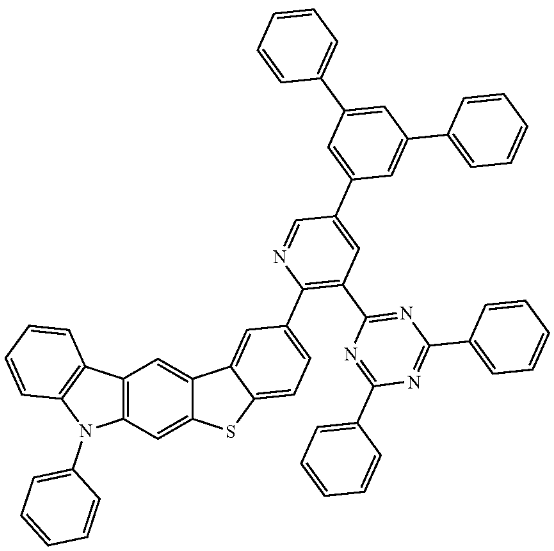
561
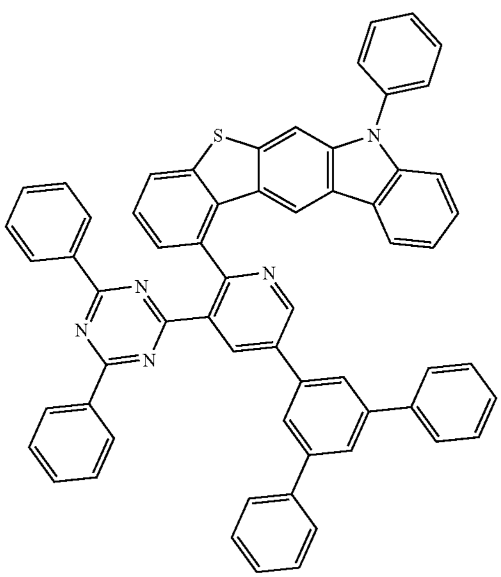
-continued
562
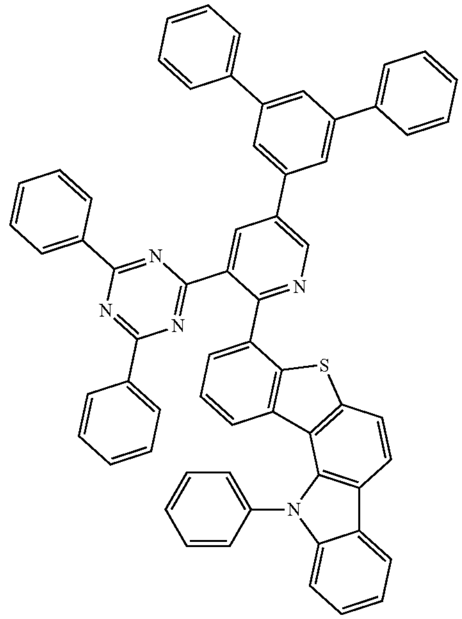
563
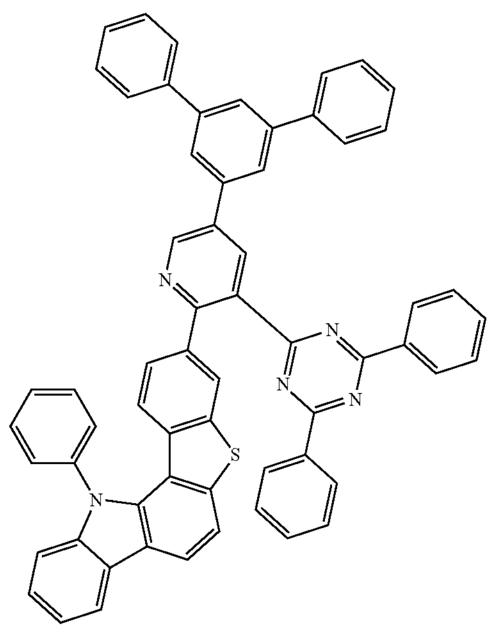

-continued
564
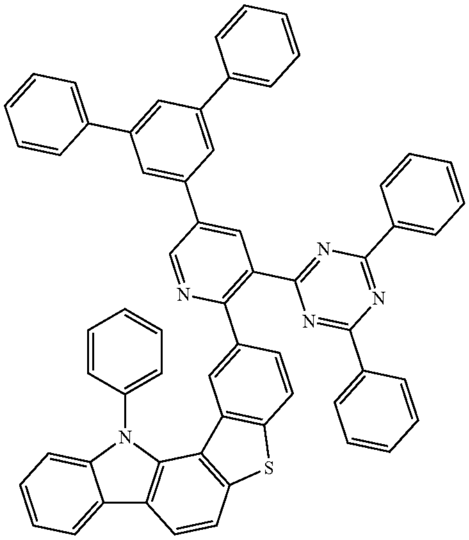
565
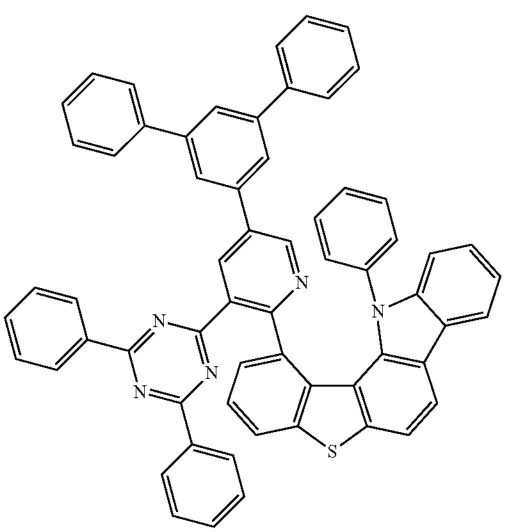
-continued
566
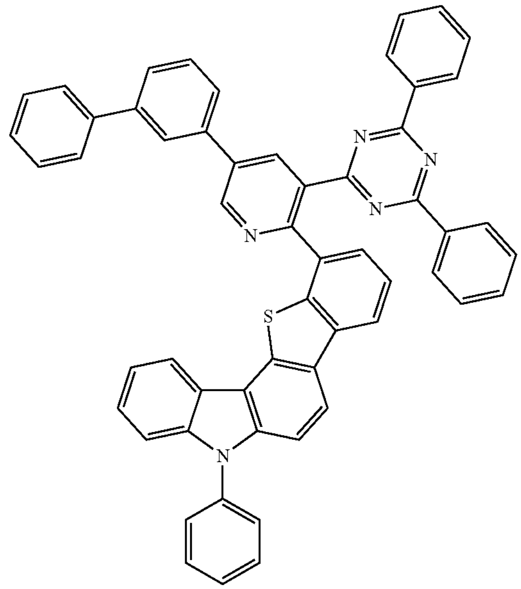
567
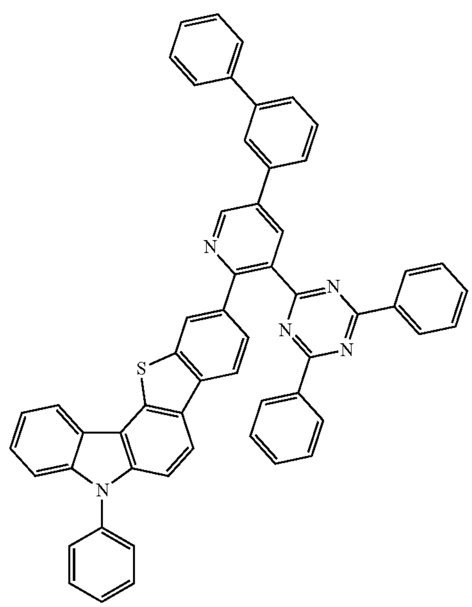

-continued
568
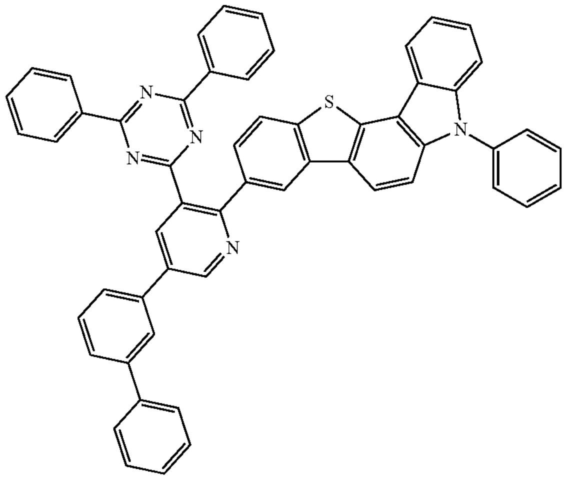
569
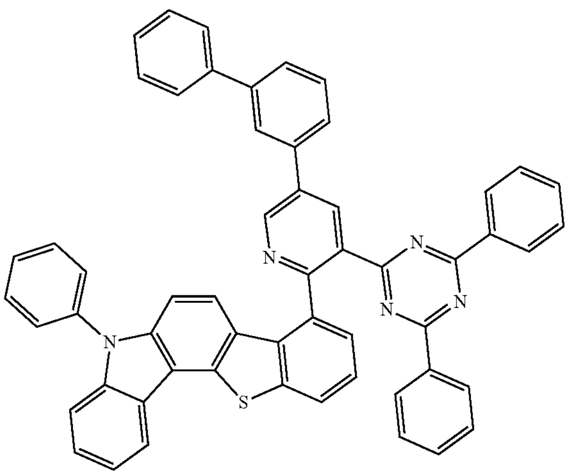
570
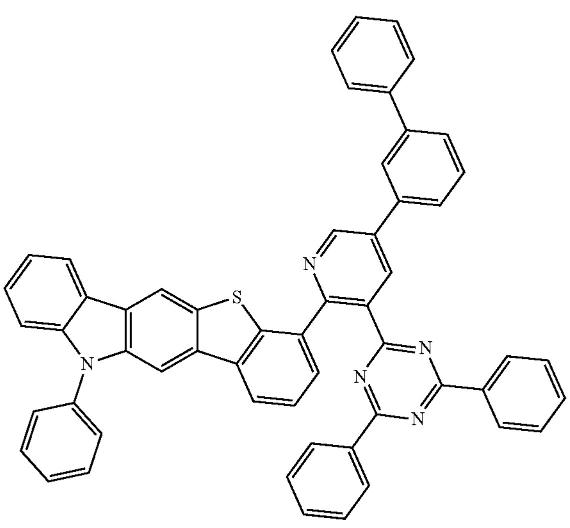
-continued
571
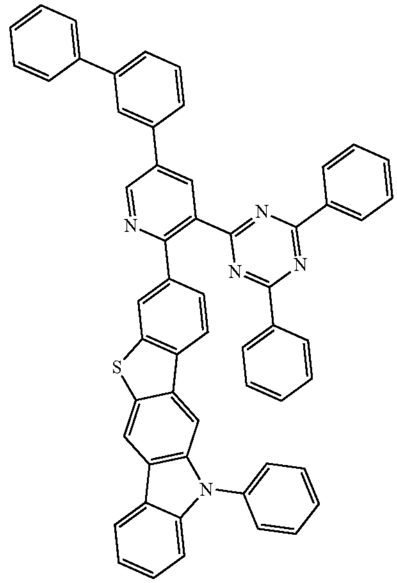
572
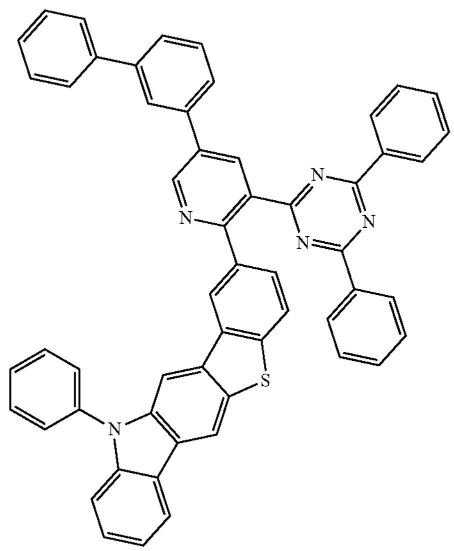
573
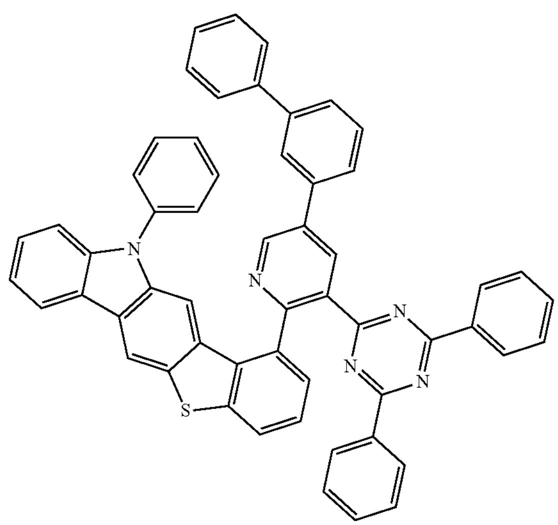

-continued
574
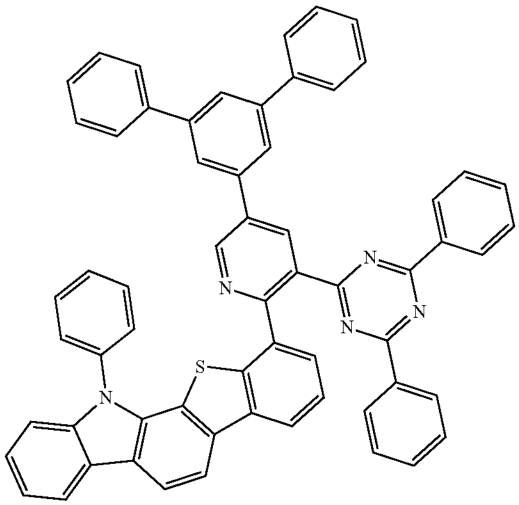
575
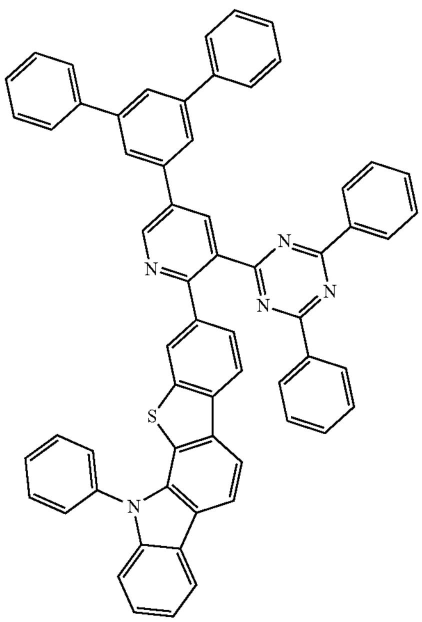
576
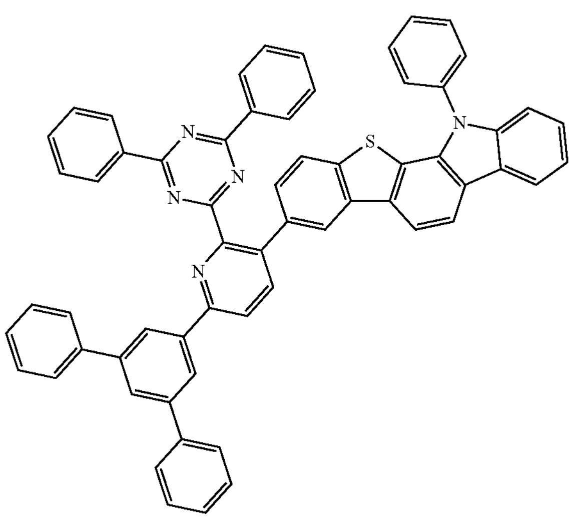
-continued
577
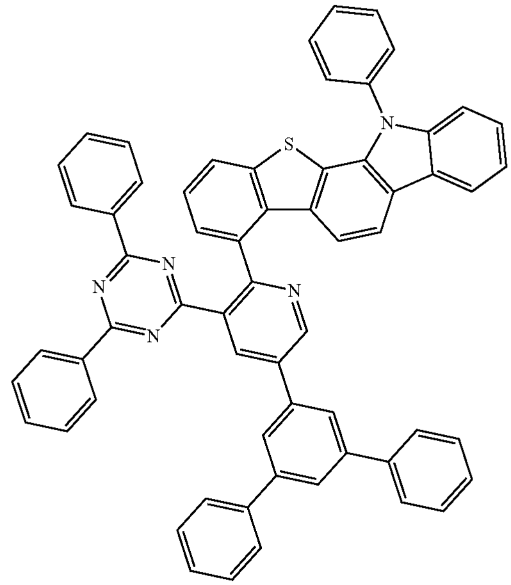
578
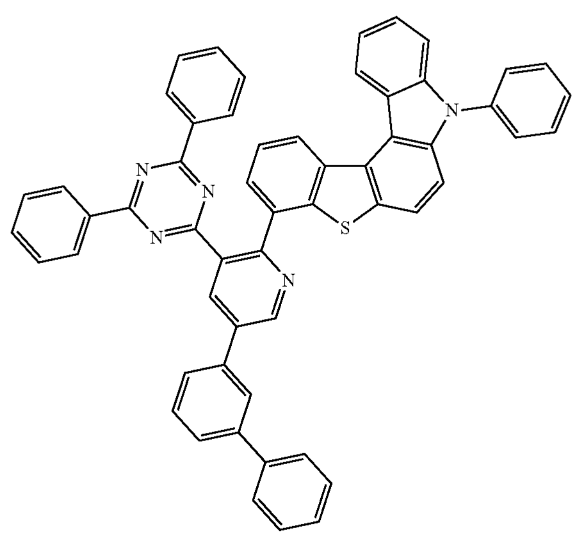

579
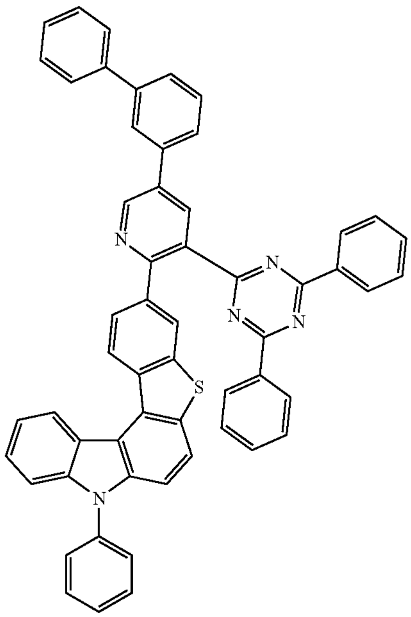
580
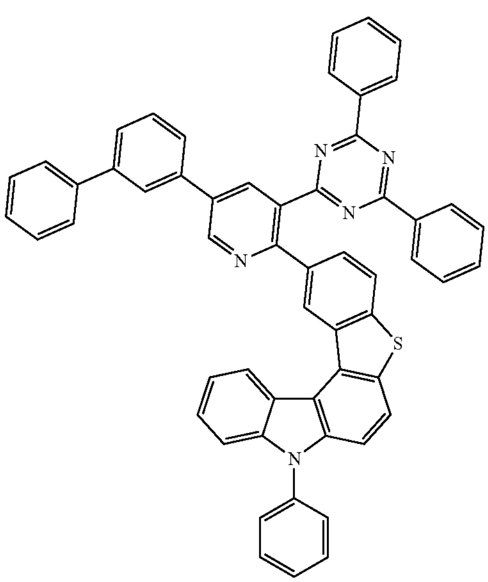
581
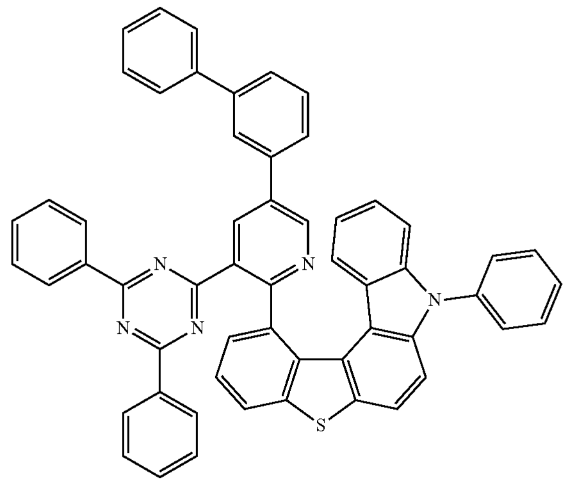
582
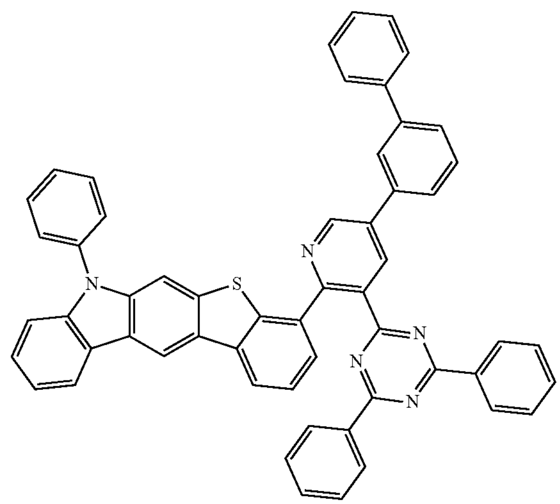
583
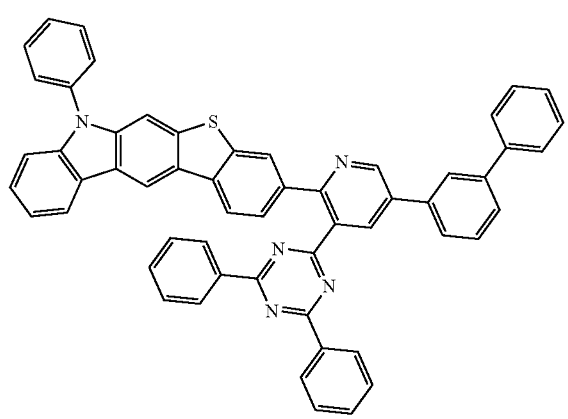

584
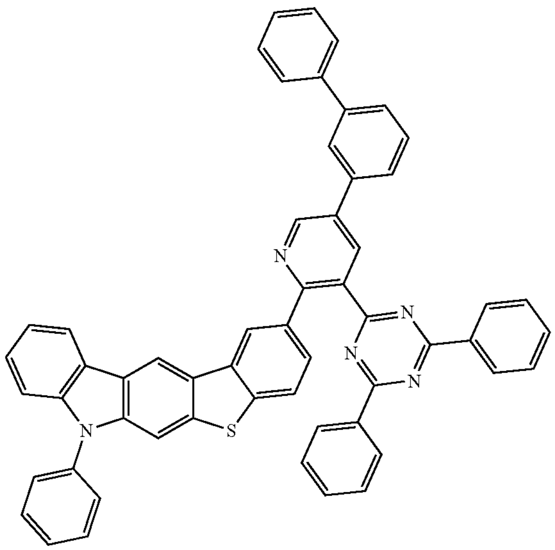
585
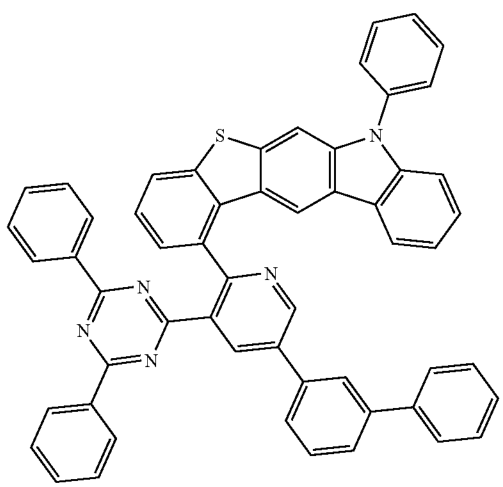
586
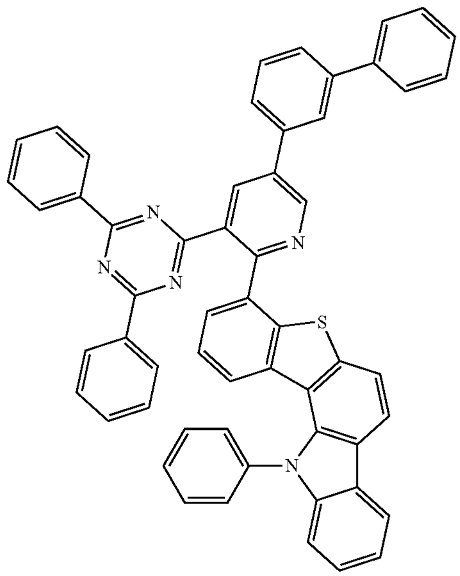
587
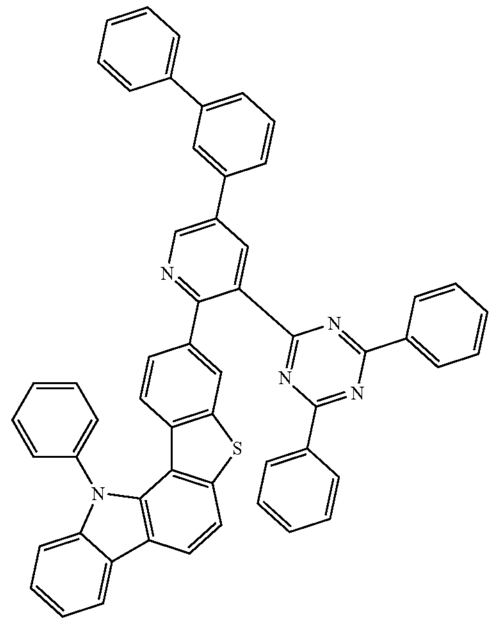
588
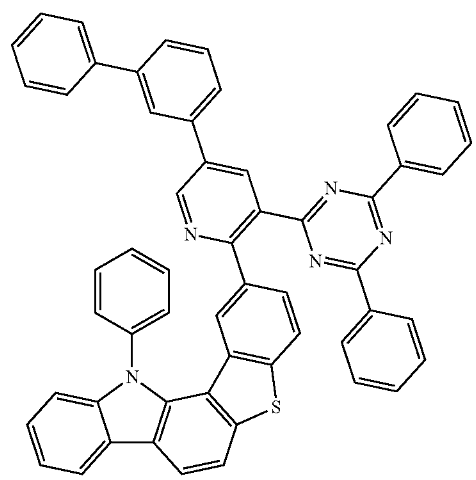
589
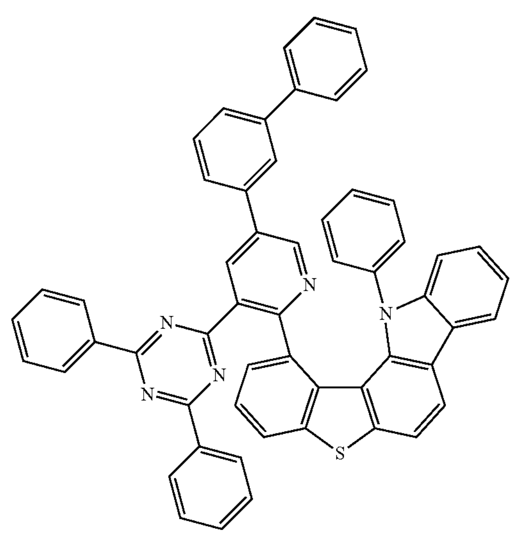

-continued
590
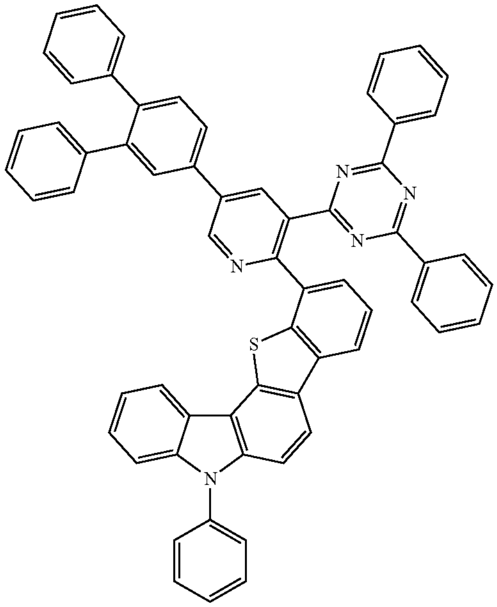
591
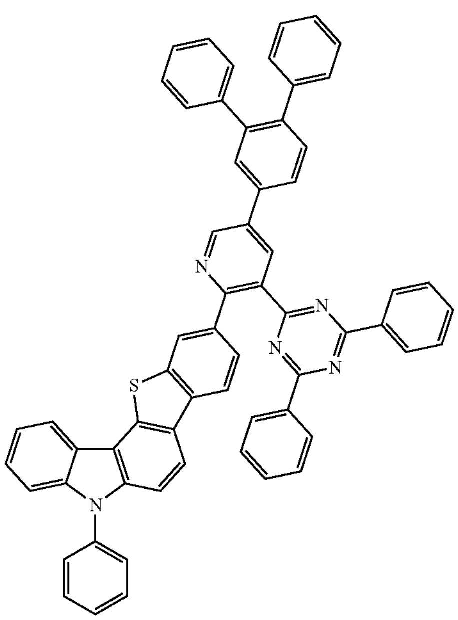
-continued
592
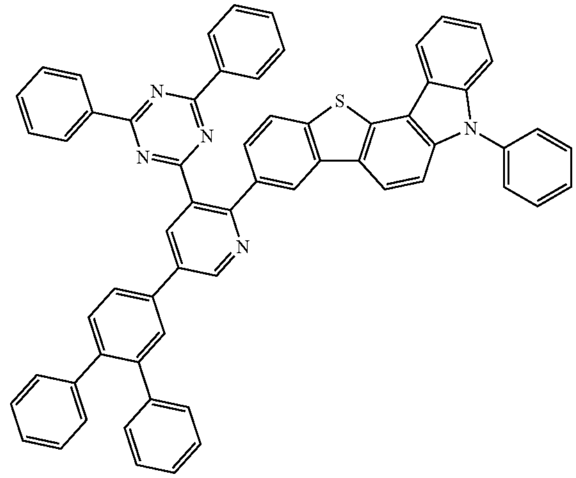
593
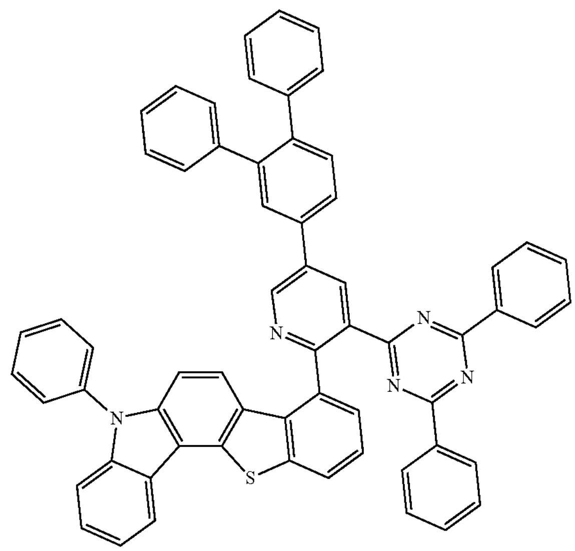
594
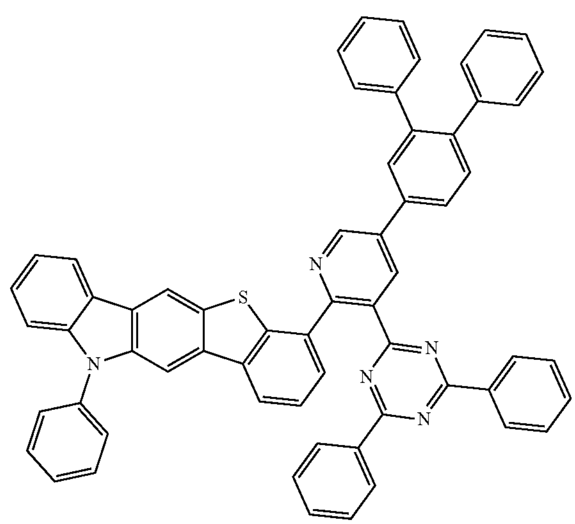

-continued
595
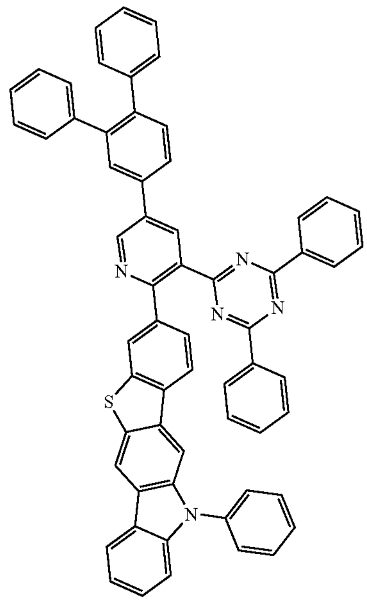
596
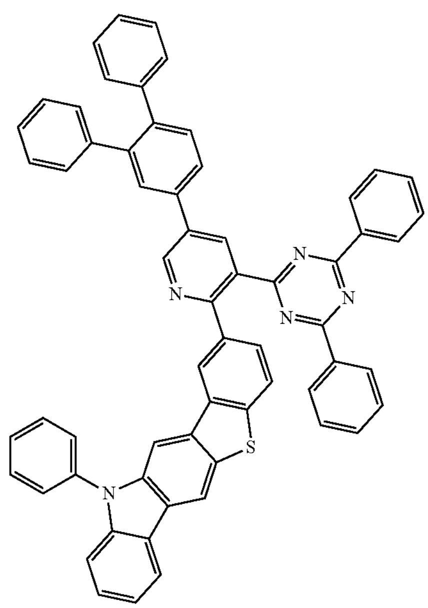
-continued
597
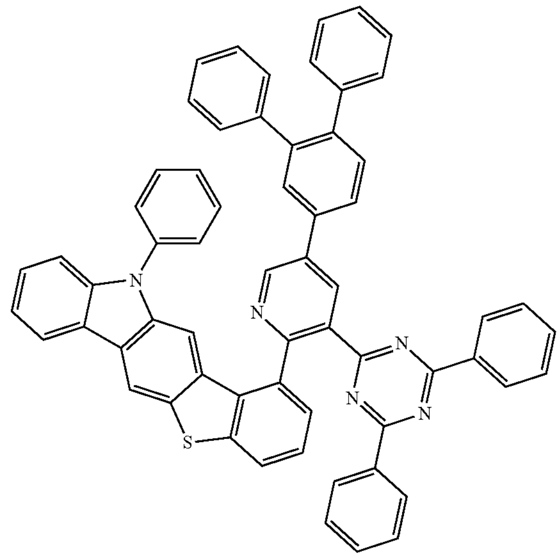
598
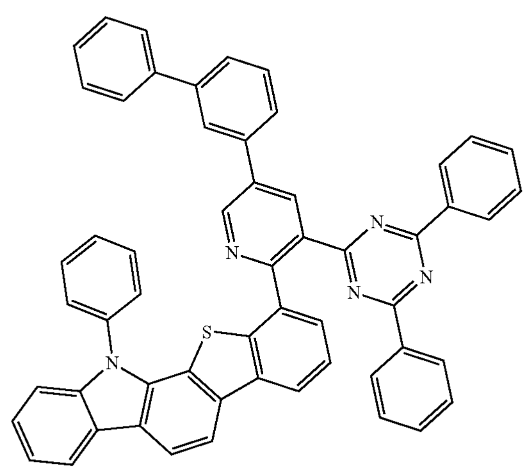

599
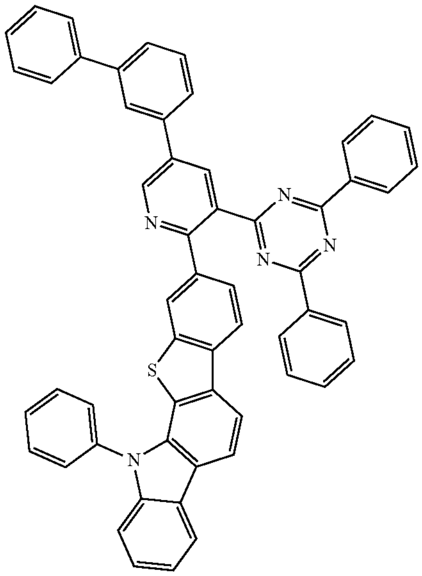
600
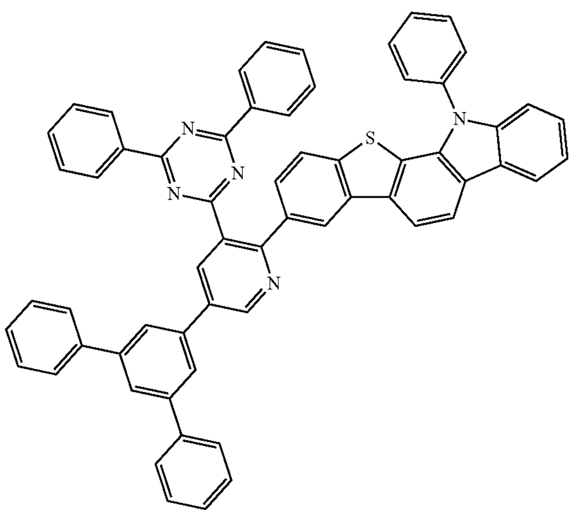
601
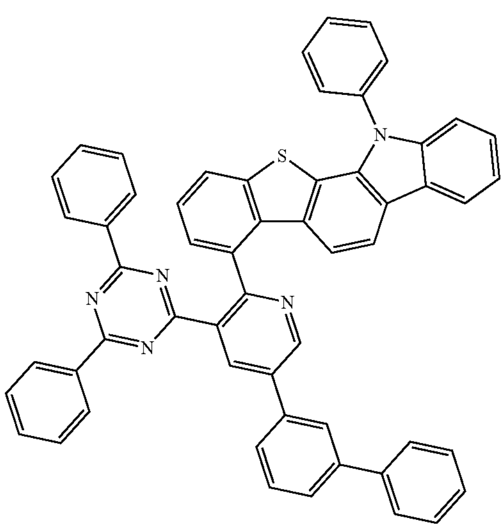
602
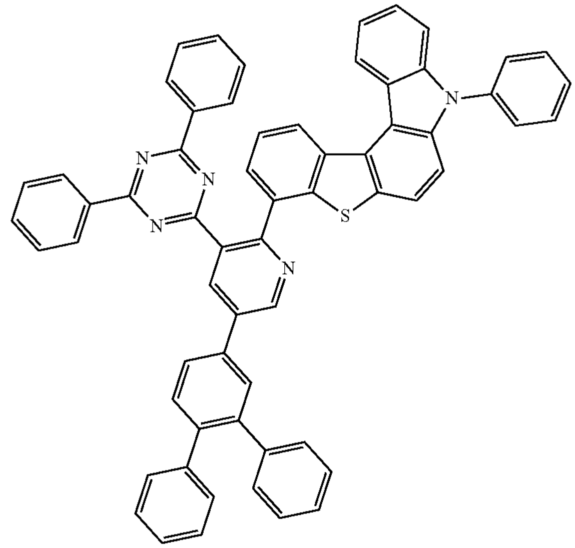
603
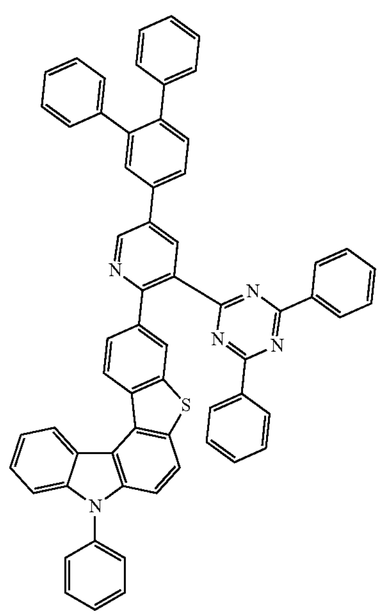

-continued
604
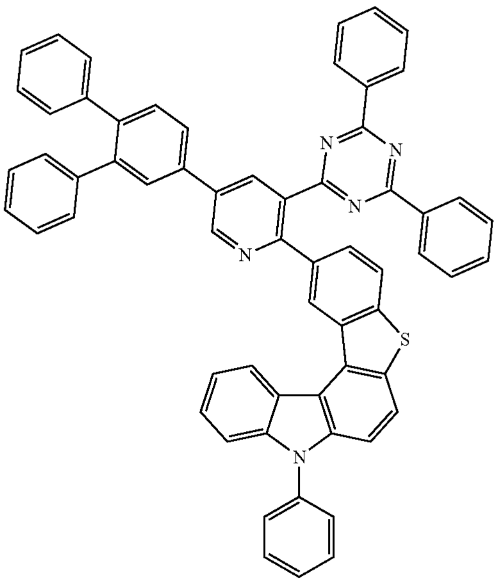
605
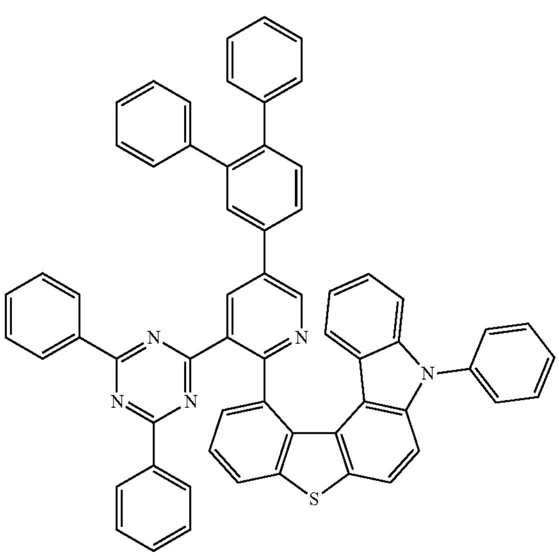
-continued
606
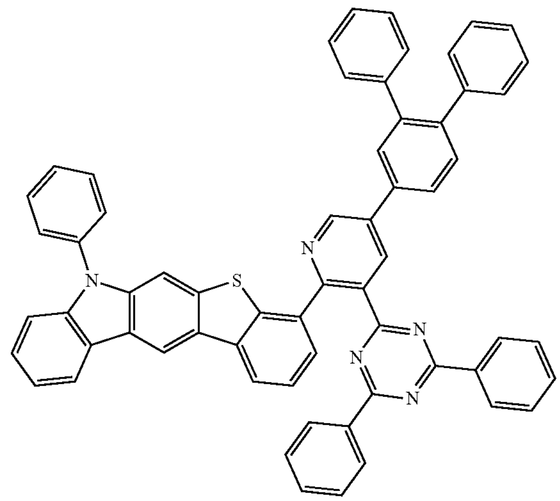
607
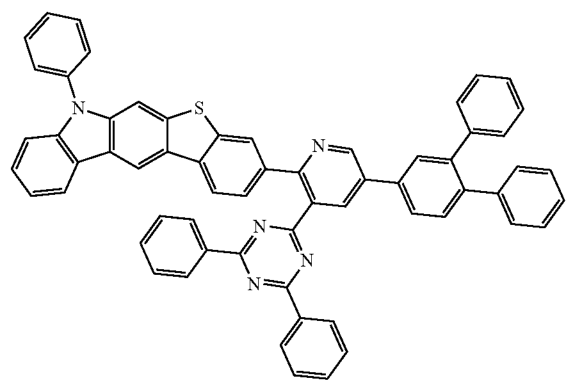
608
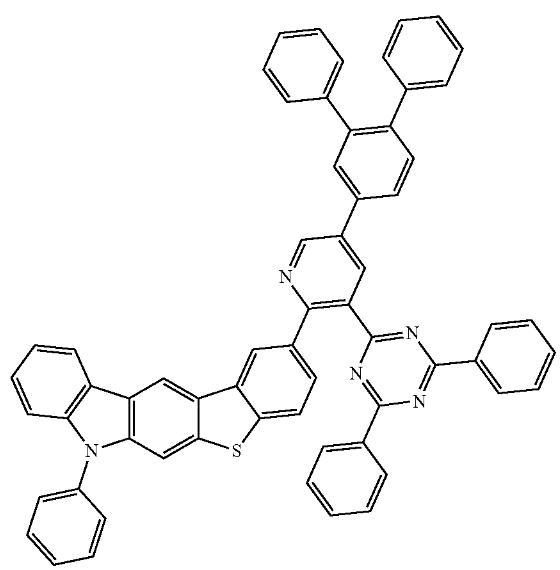

-continued
609
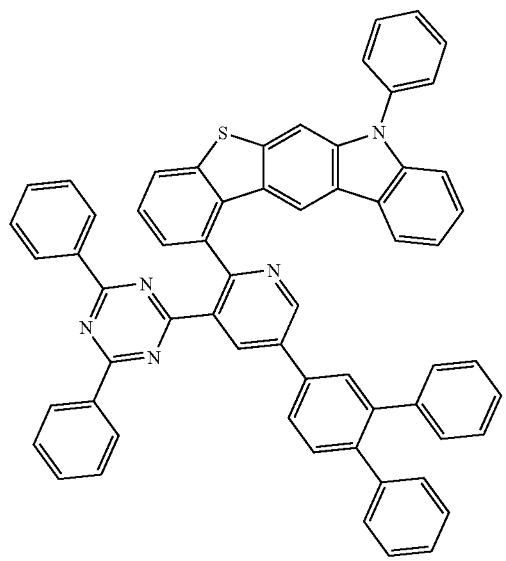
610
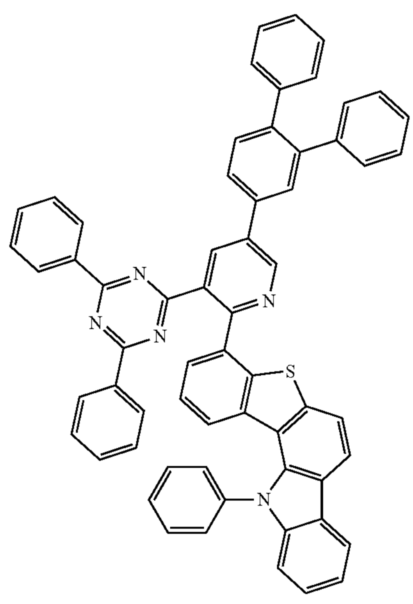
-continued
611
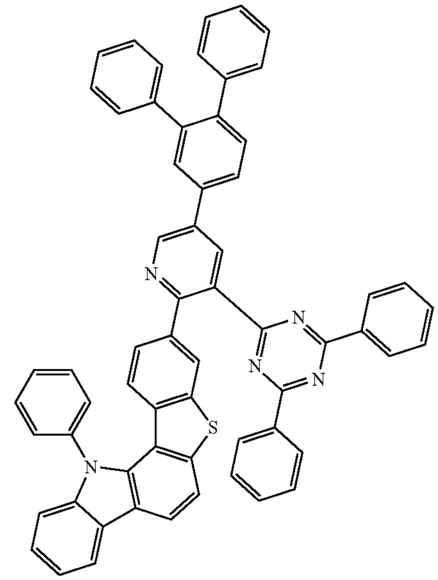
612
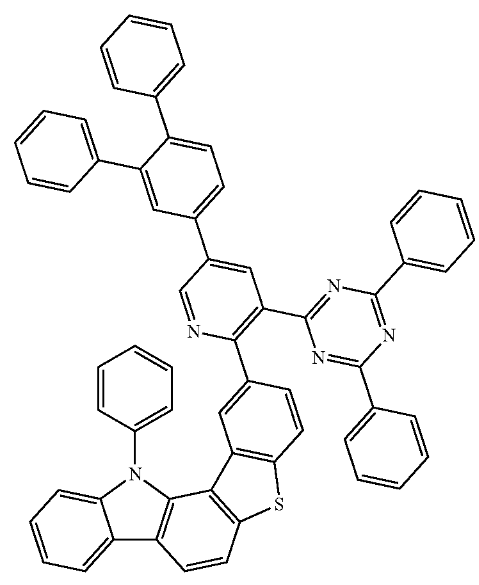

-continued
613
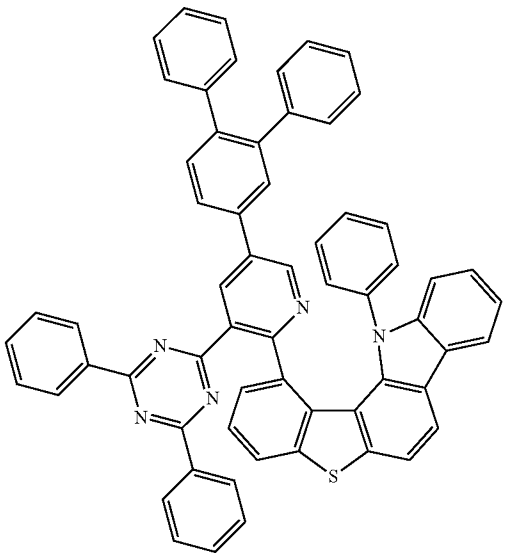
614
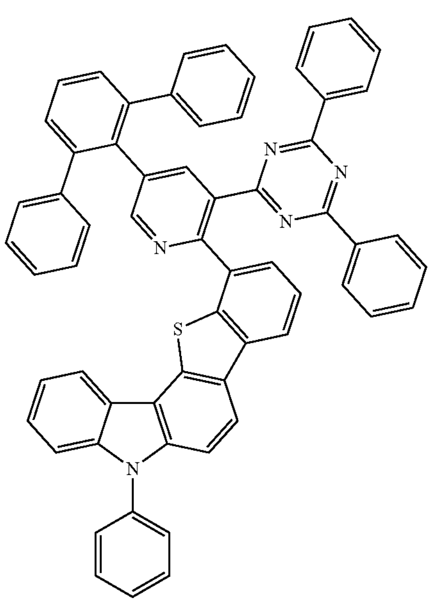
-continued
615
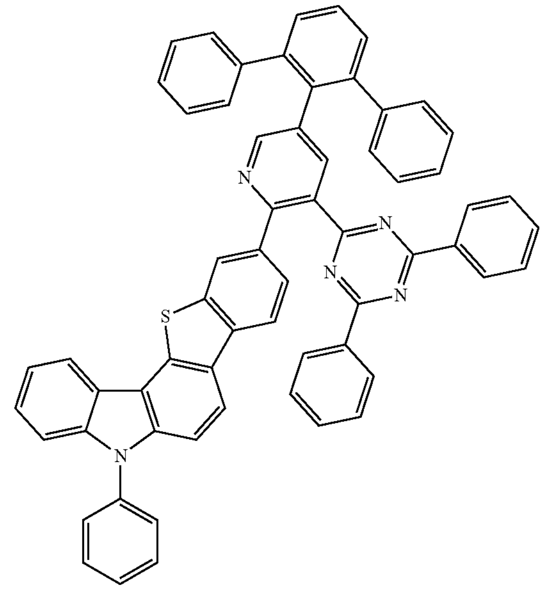
616
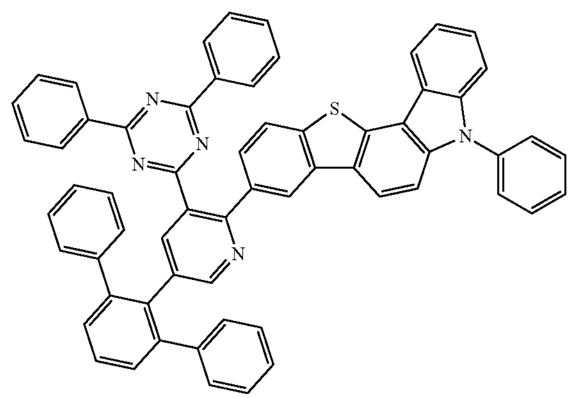
617
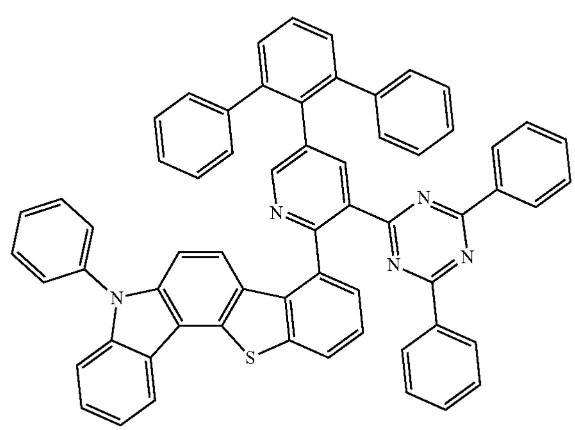

-continued
618
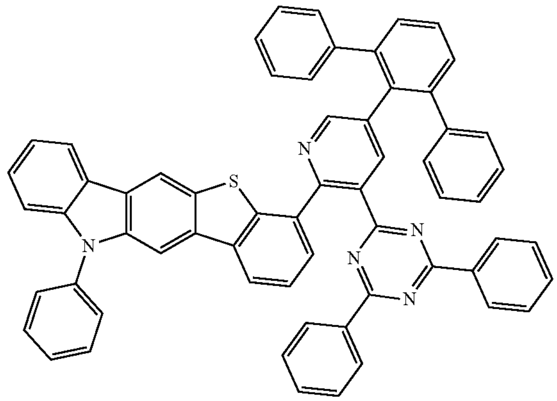
619
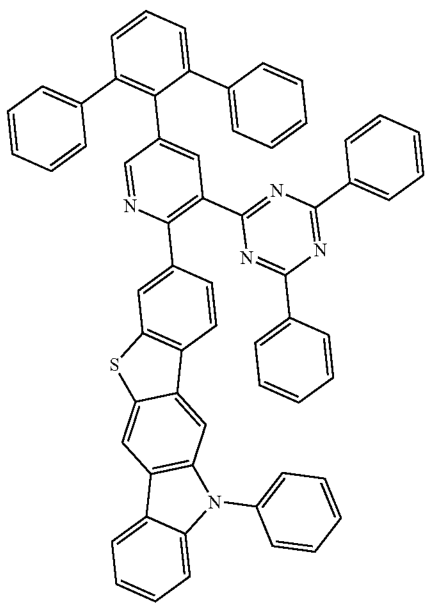
620
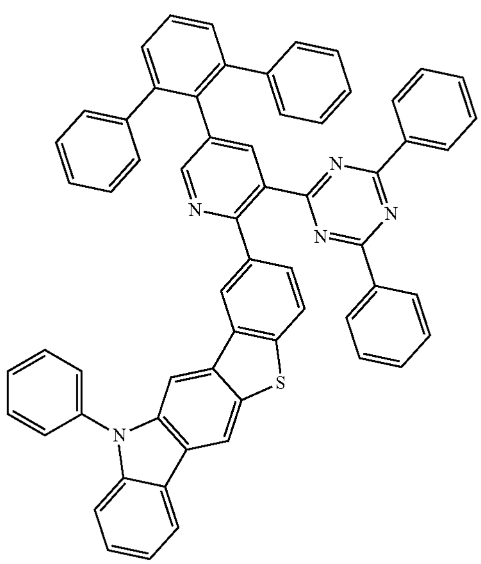
-continued
621
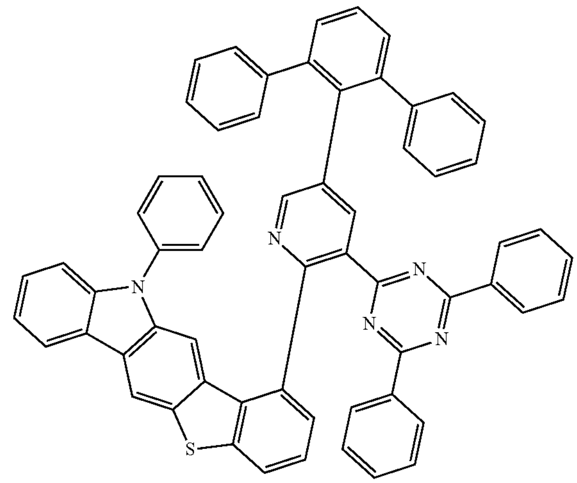
622
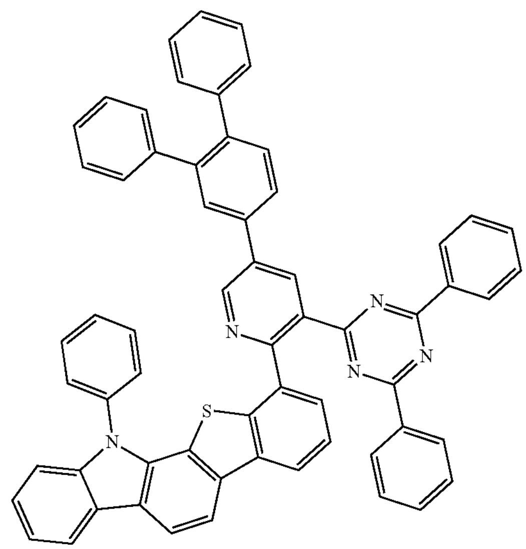
623
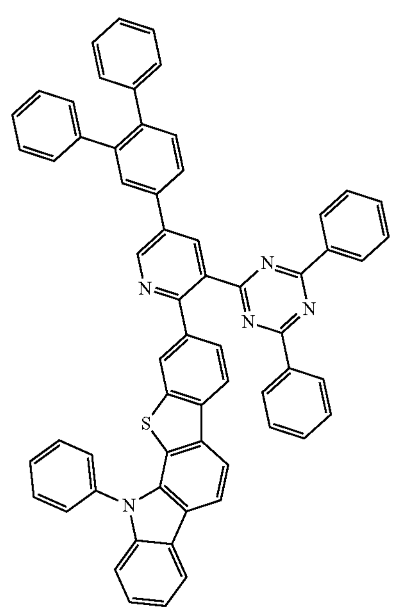

624
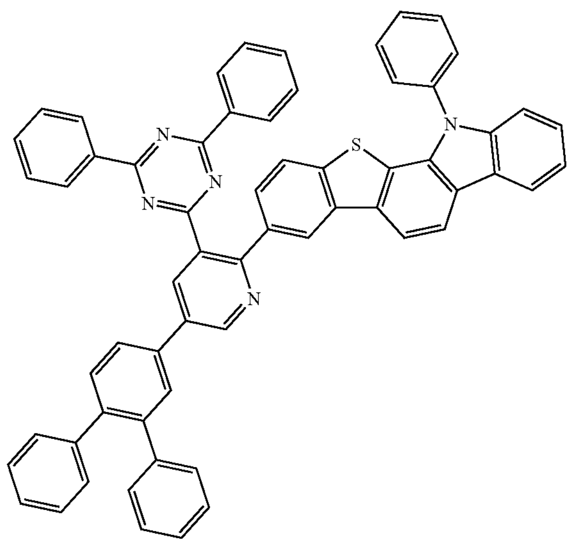
625
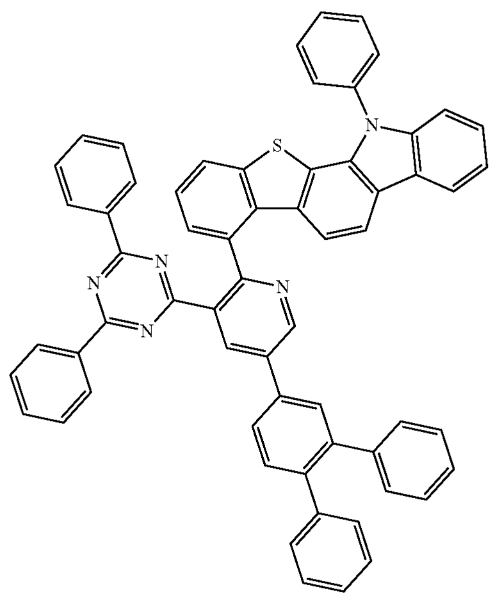
626
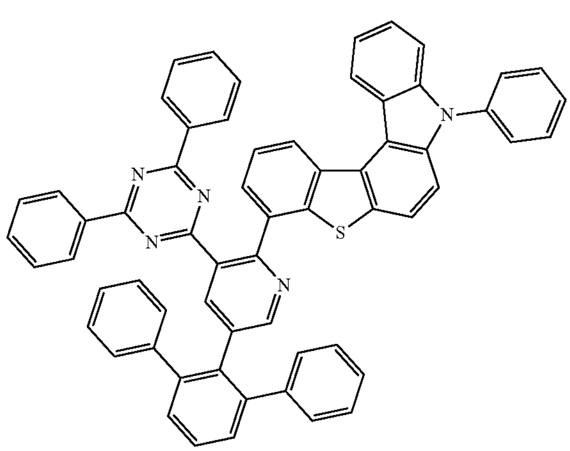
627
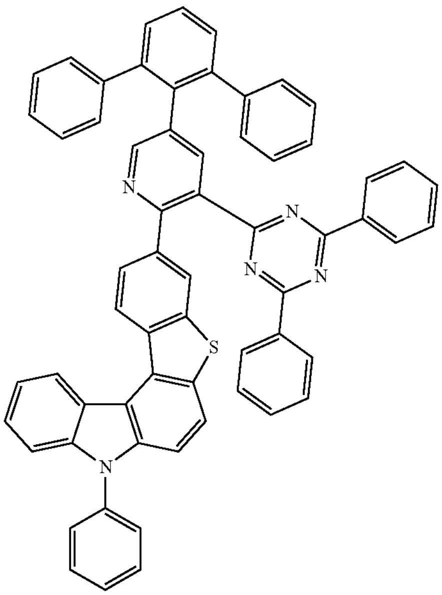
628
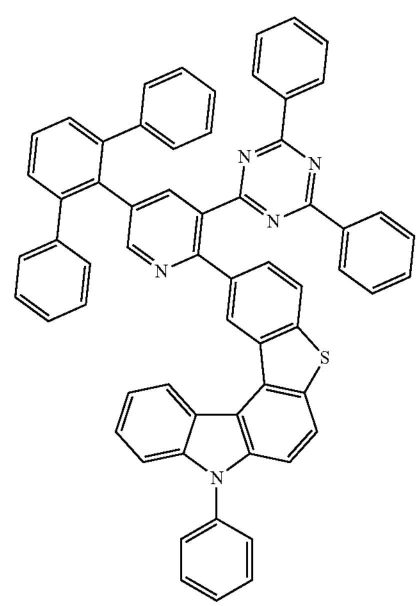

-continued
629
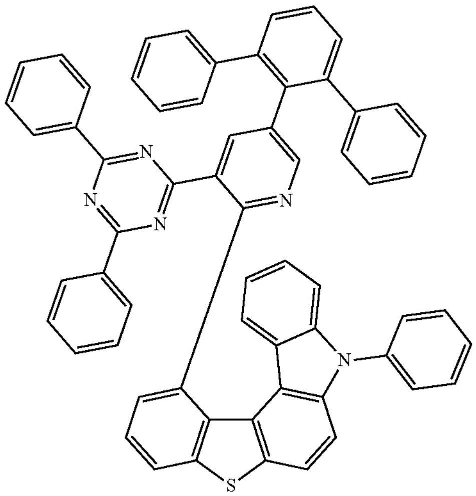
630
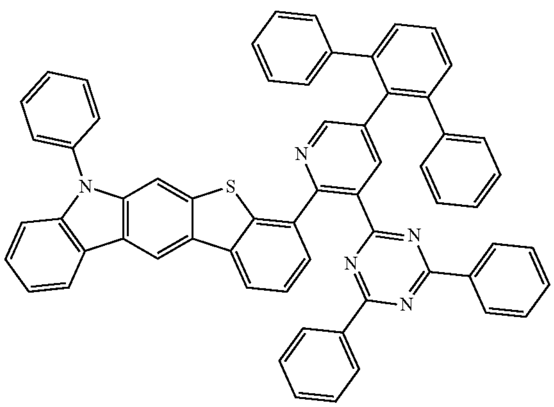
631
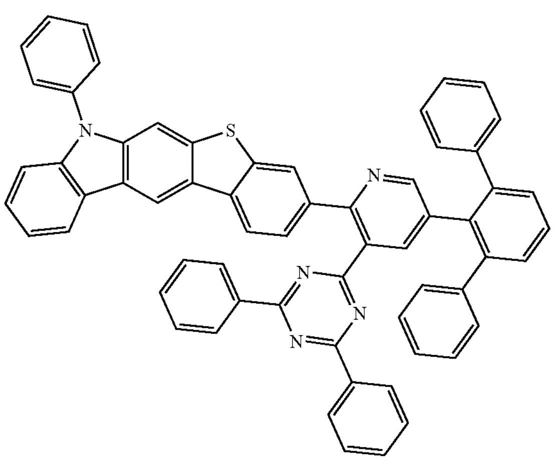
-continued
632
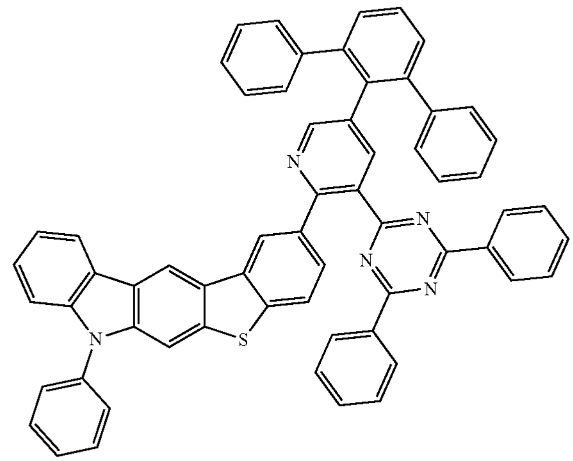
633
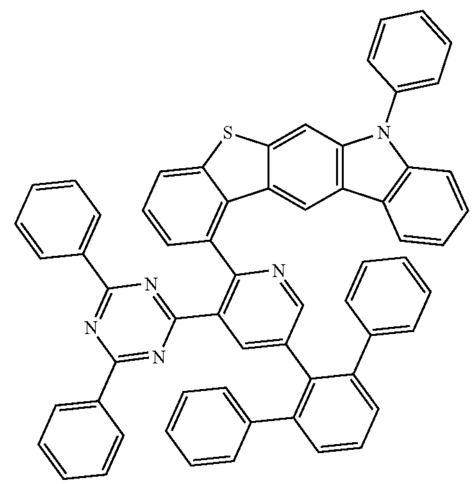
634
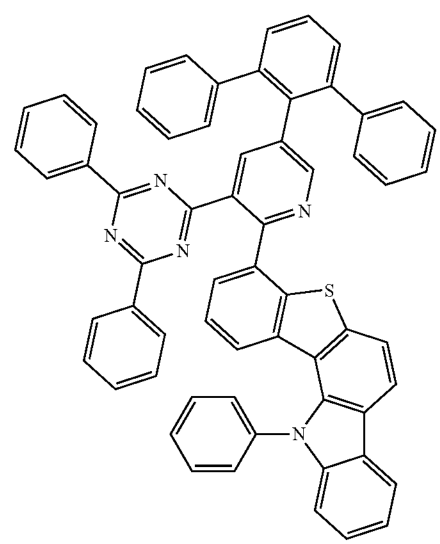

-continued
635
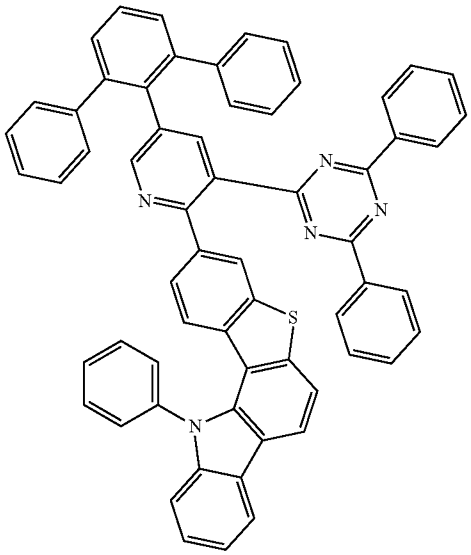
636
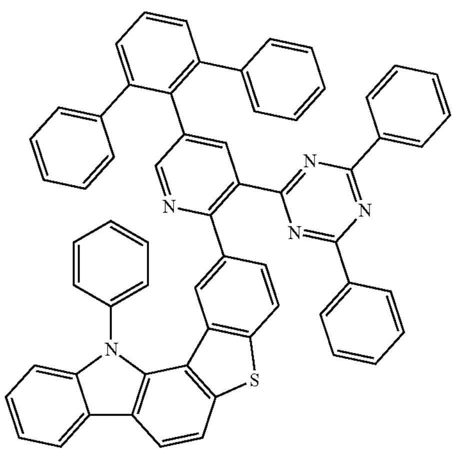
637
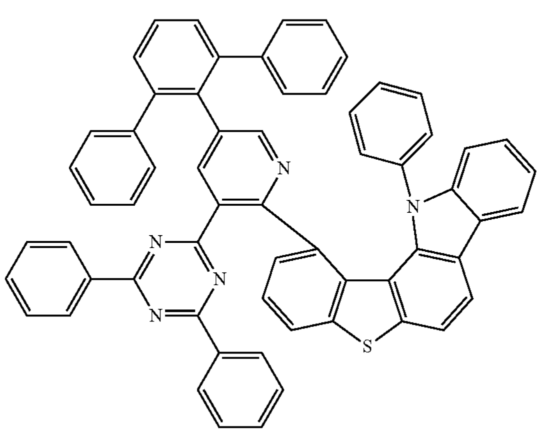
-continued
638
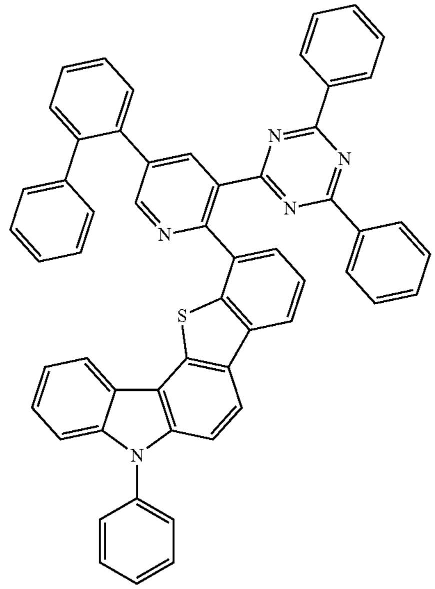
639
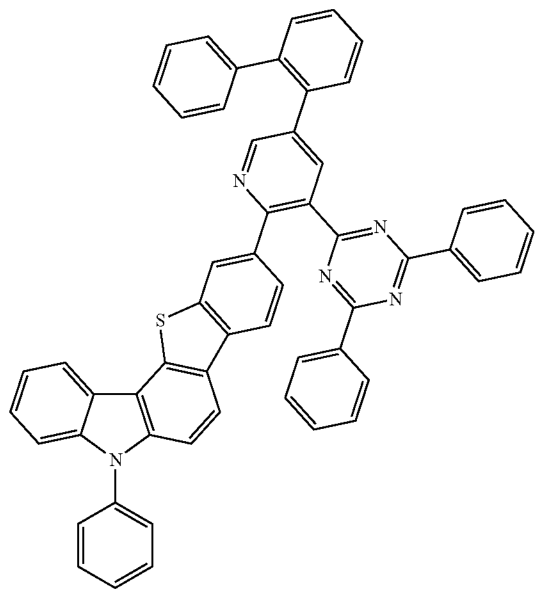
640
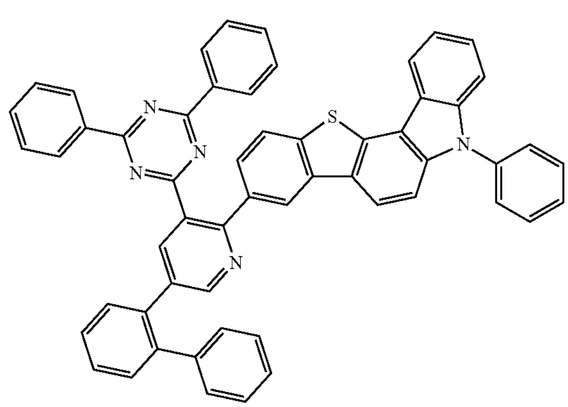

641
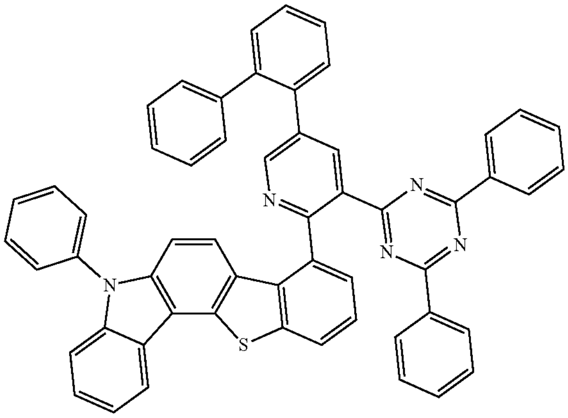
642
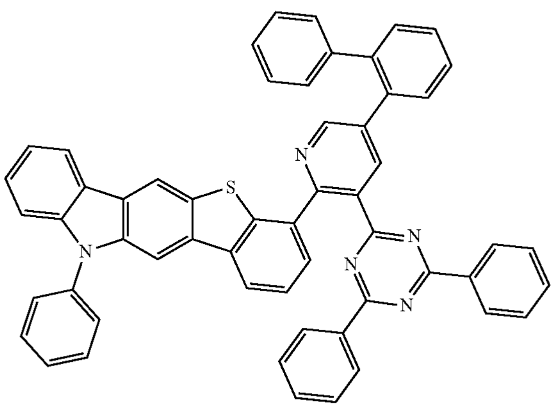
643
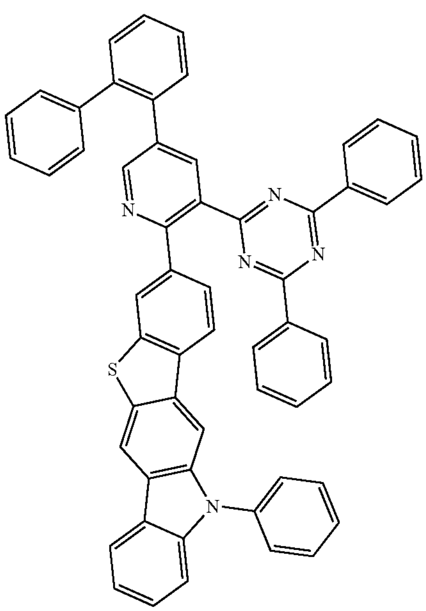
644
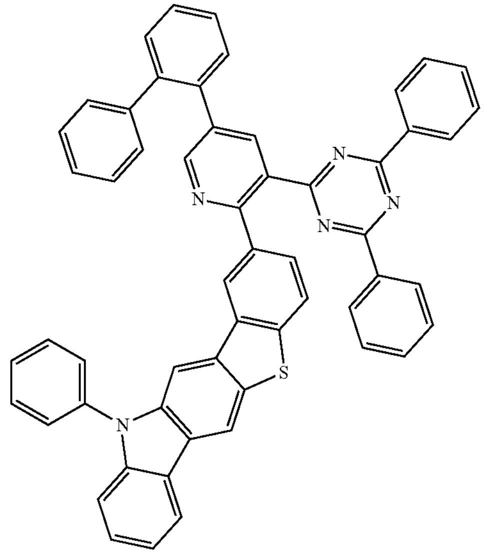
645
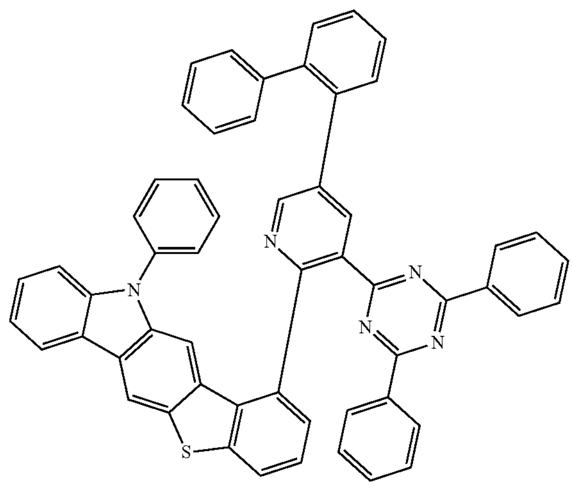
646
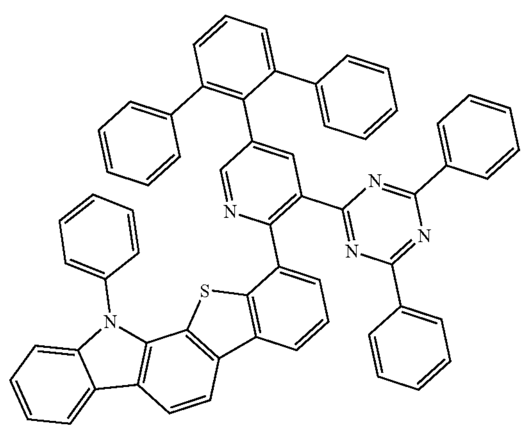

647
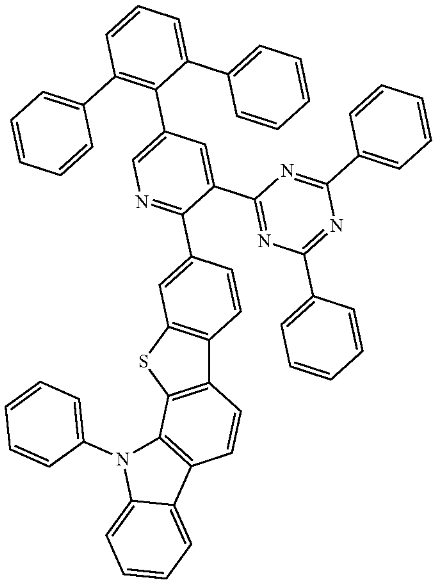
648
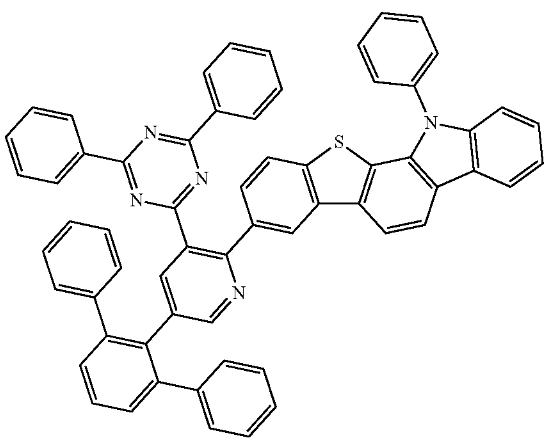
649
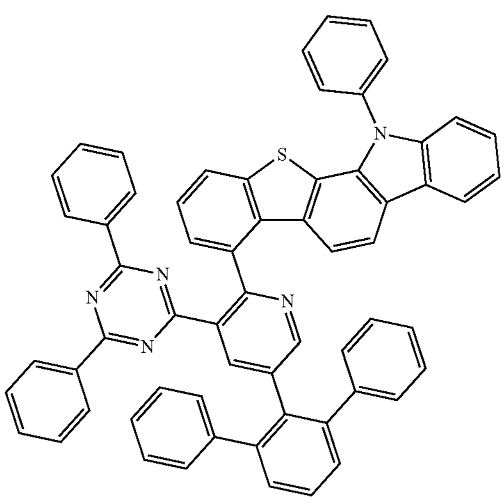
650
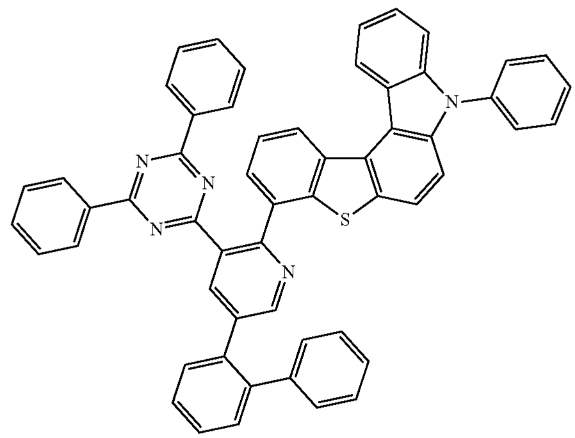
651
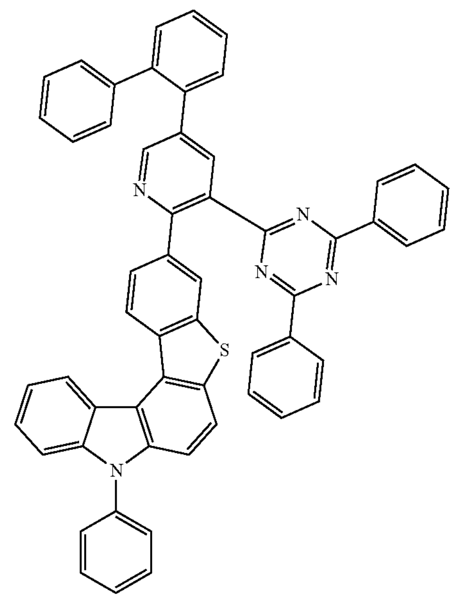
652
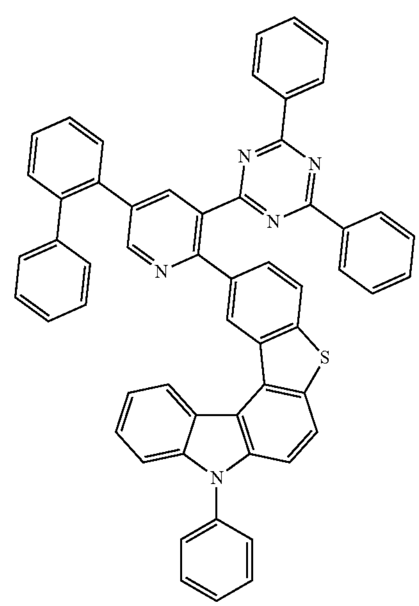

-continued
653
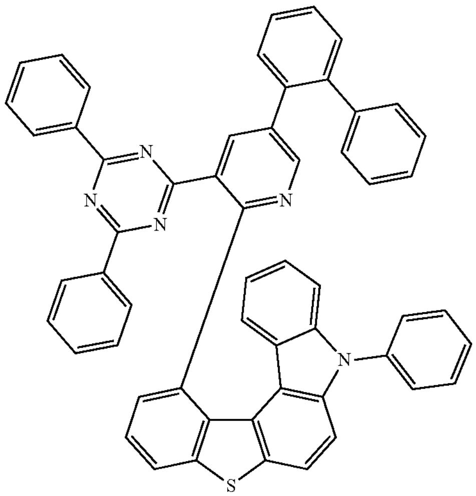
654
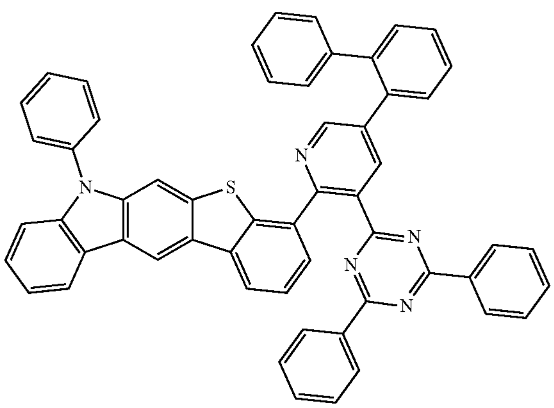
655
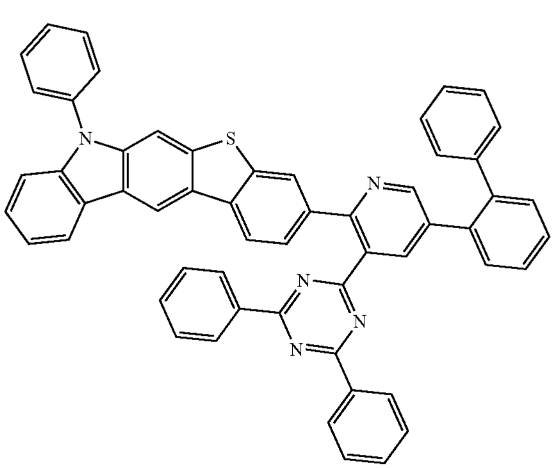
-continued
656
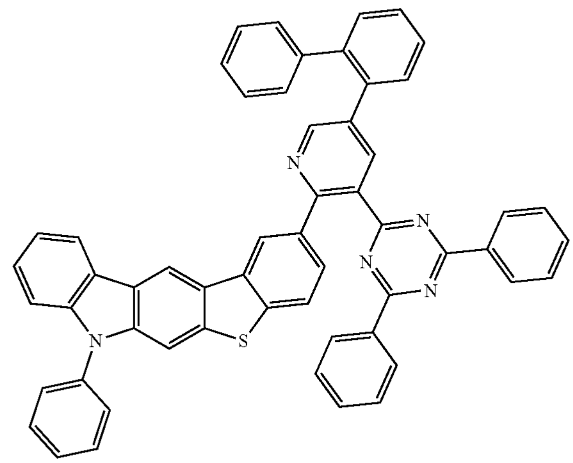
657
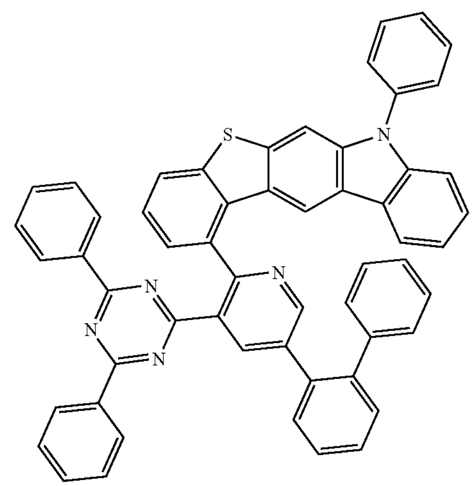
658
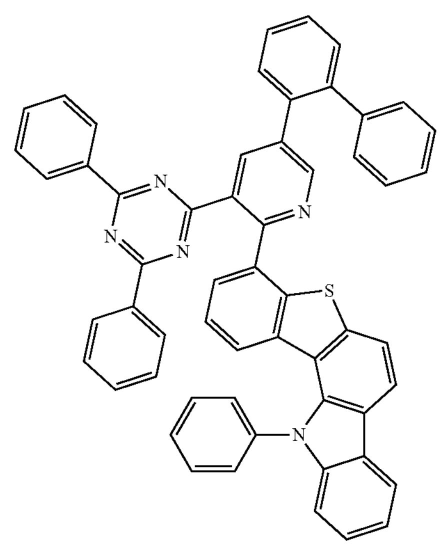

-continued
659
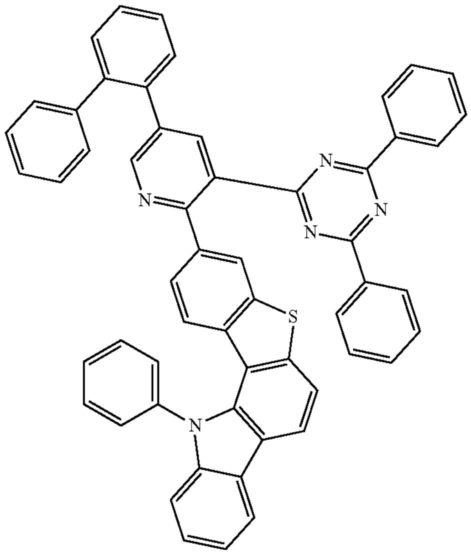
660
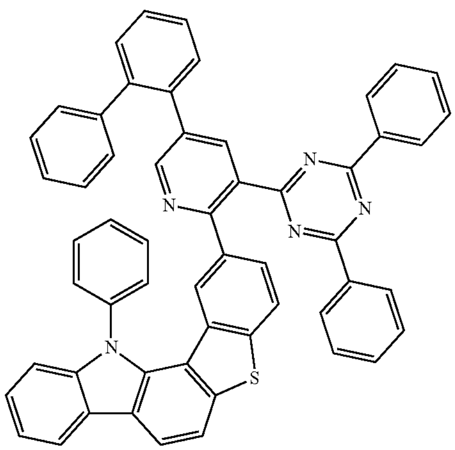
661
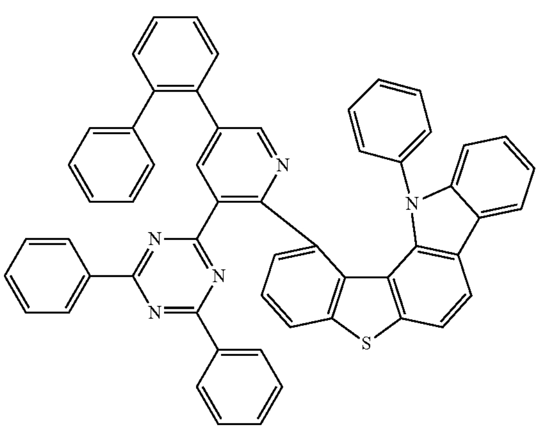
-continued
662
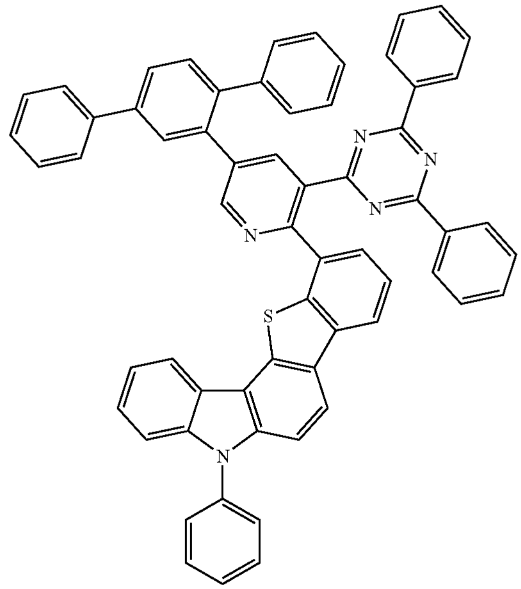
663
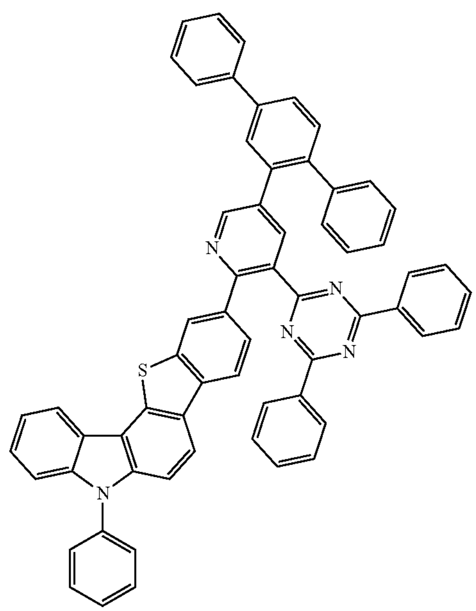

-continued
664
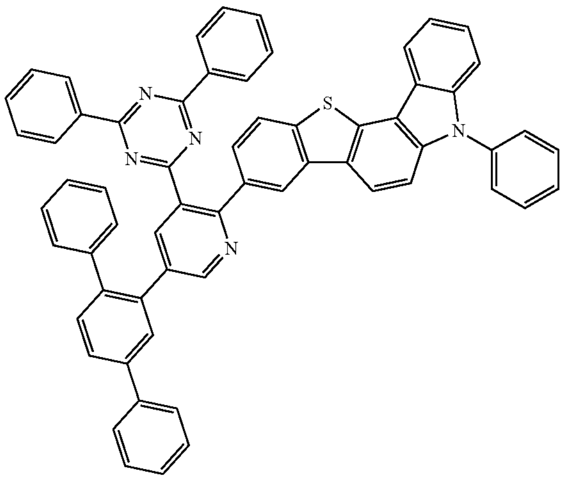
665
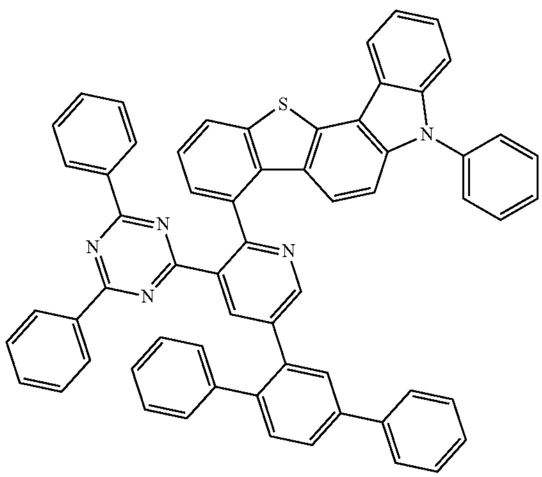
666
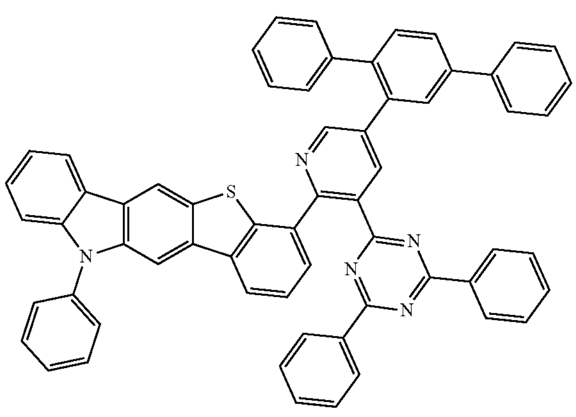
-continued
667
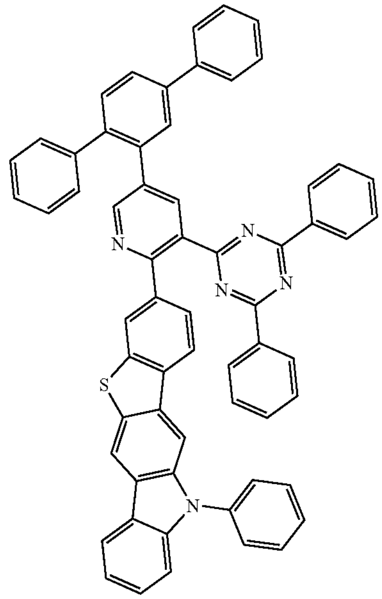
668
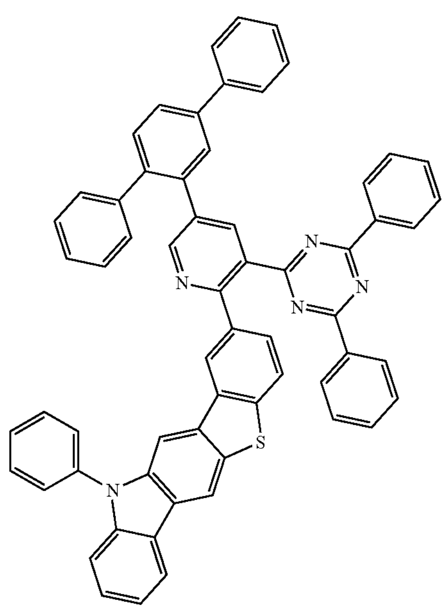

669
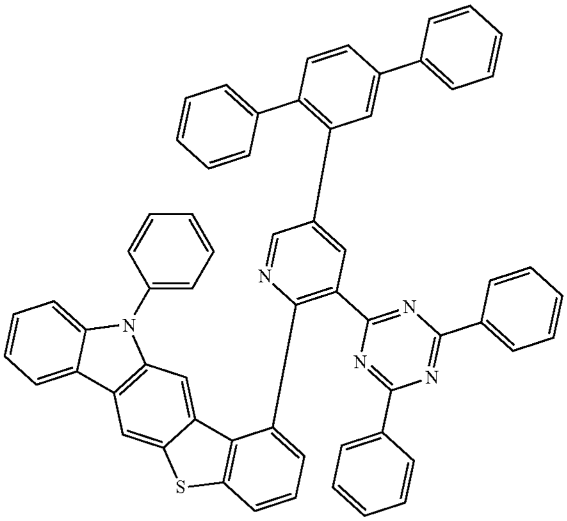
670
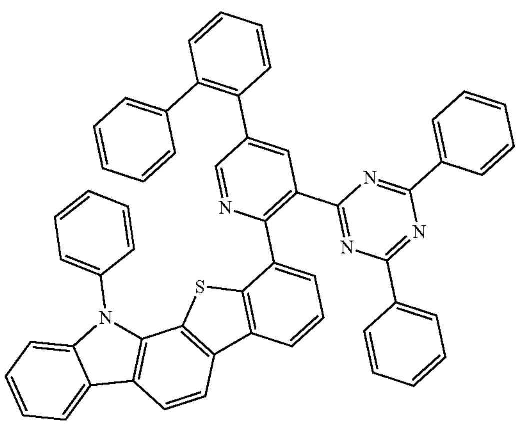
671
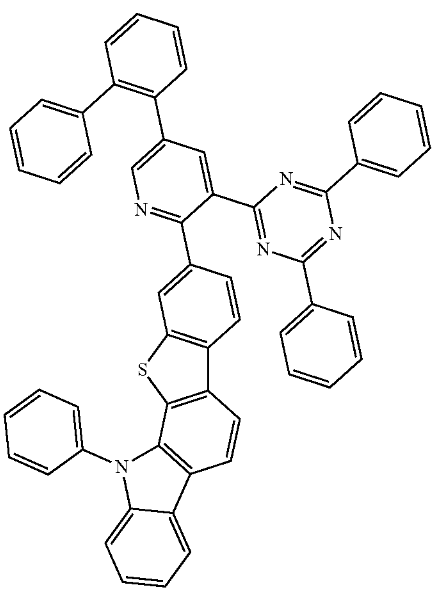
672
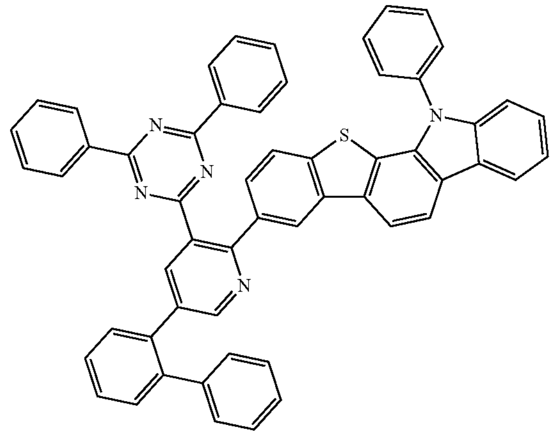
673
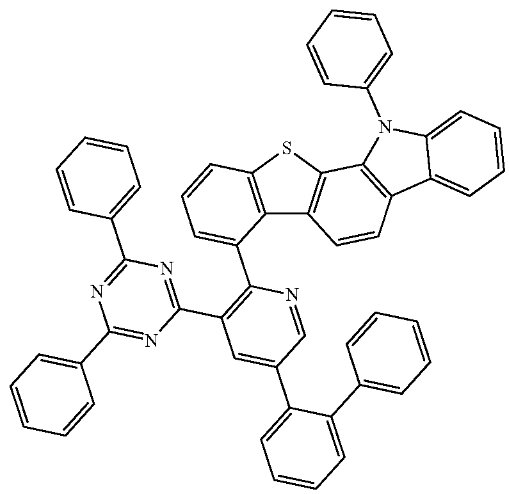
674
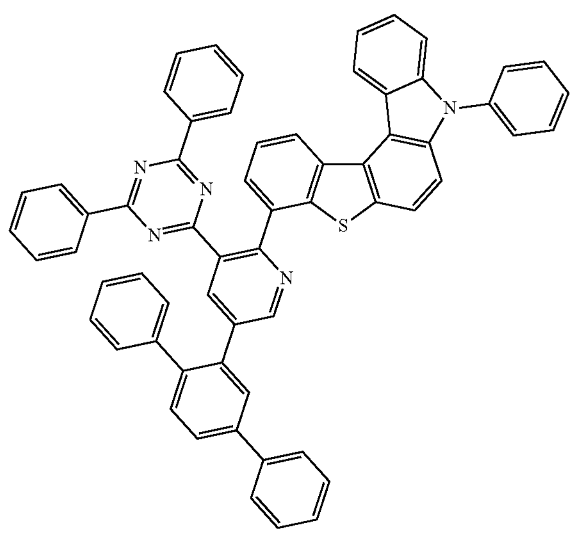

-continued
675
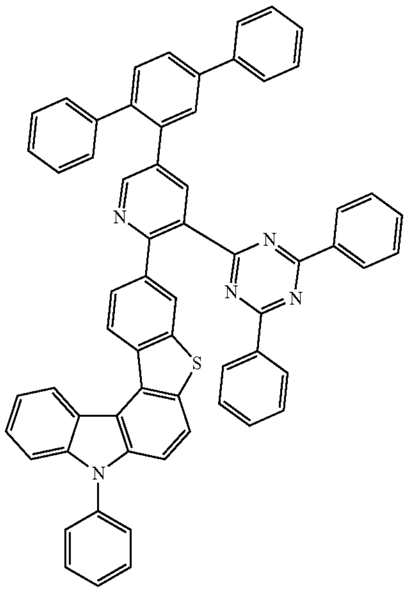
676
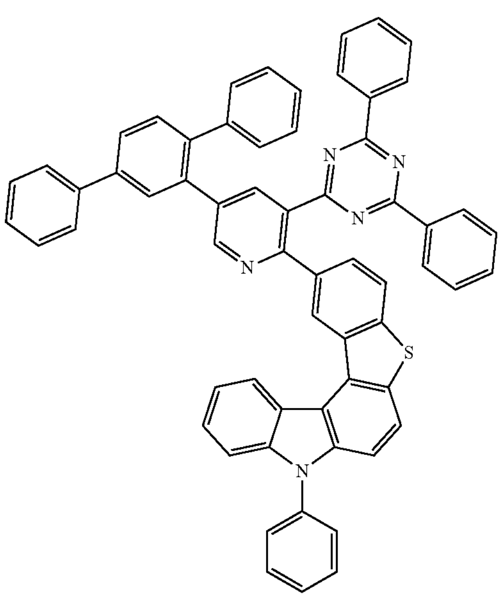
-continued
677
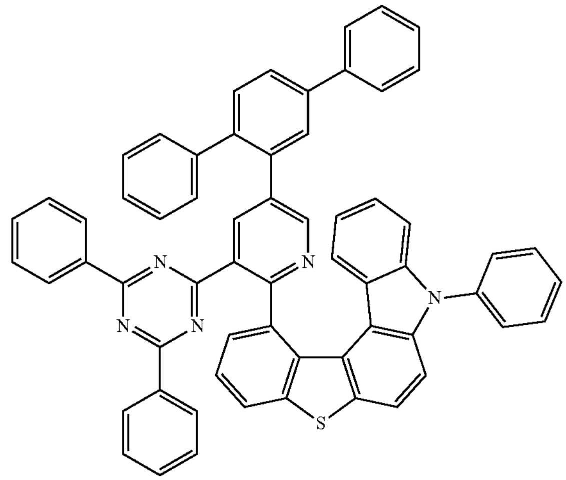
678
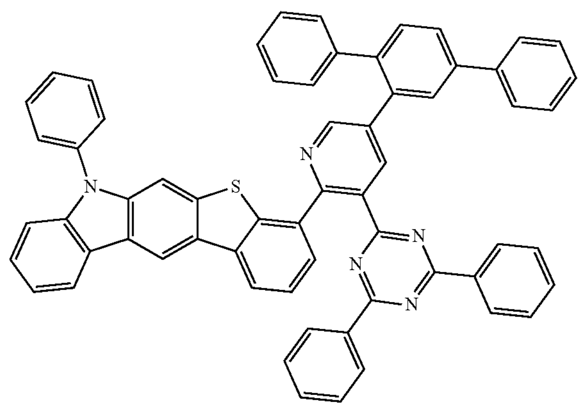
679
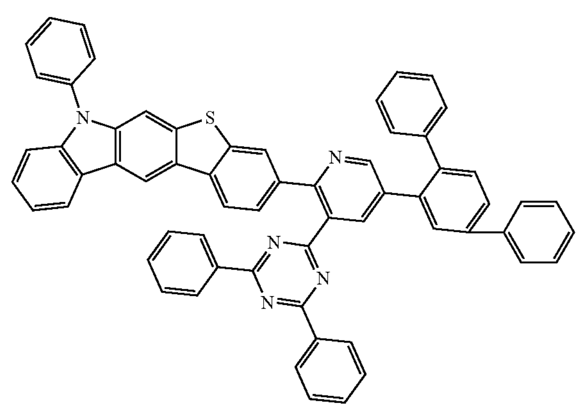

-continued
680
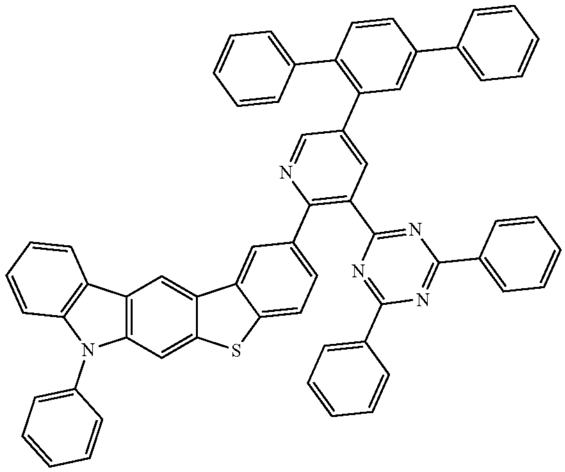
681
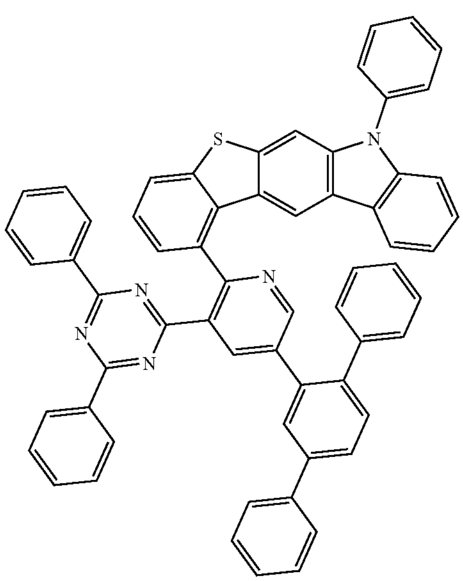
-continued
682
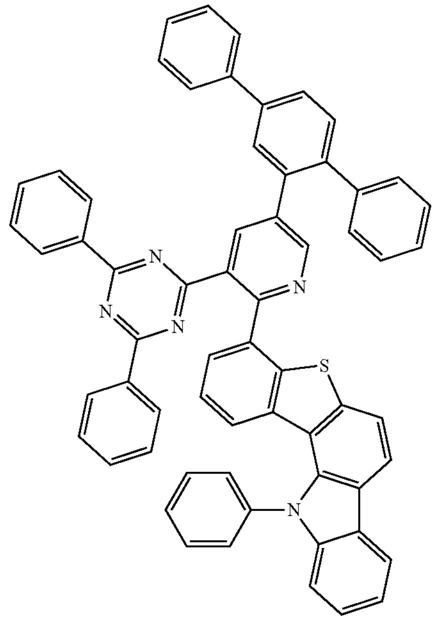
683
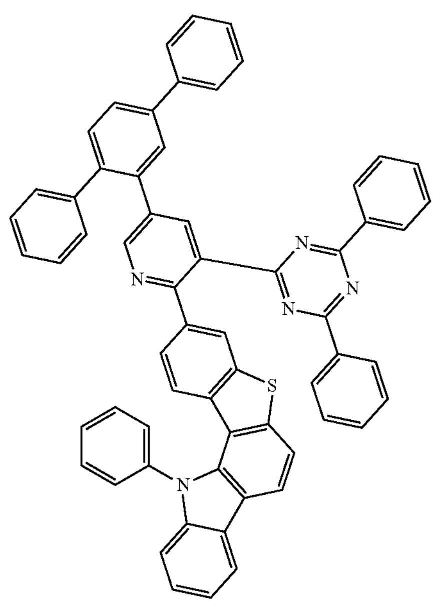

-continued
684
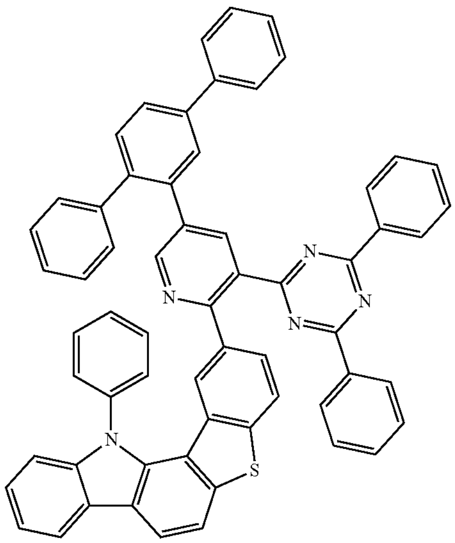
685
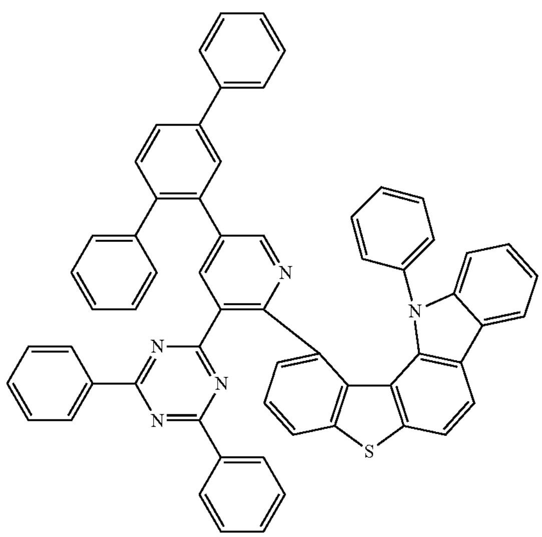
686
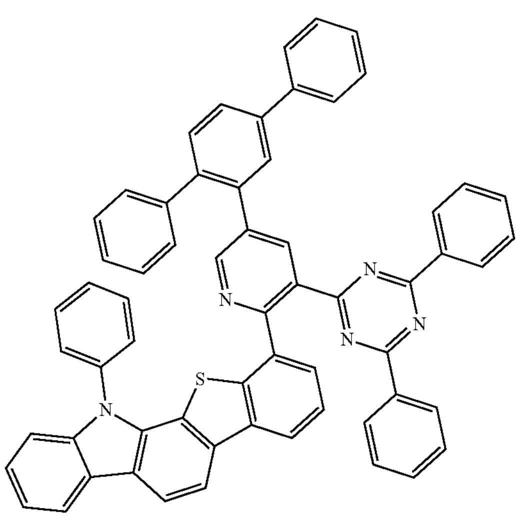
-continued
687
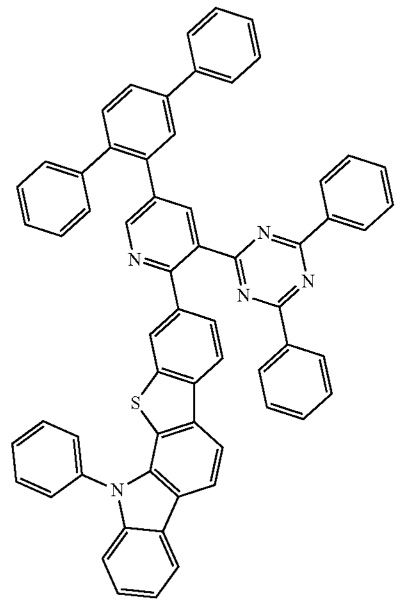
688
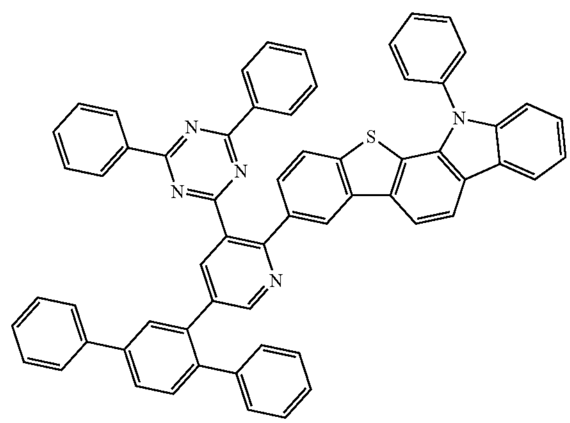
689
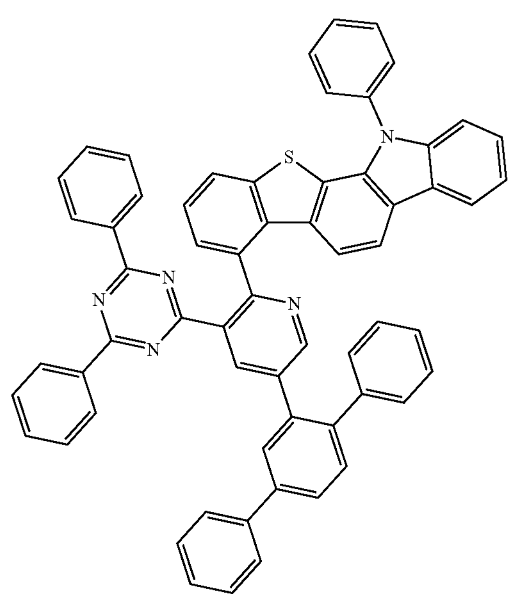

-continued
690
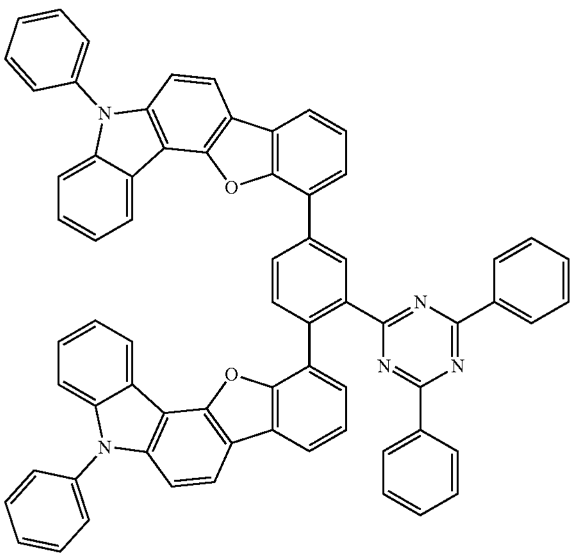
691
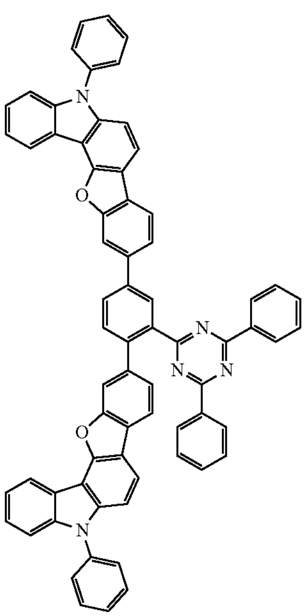
-continued
692
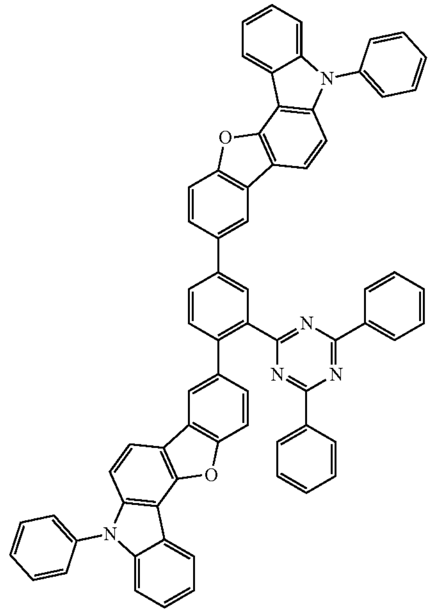
693
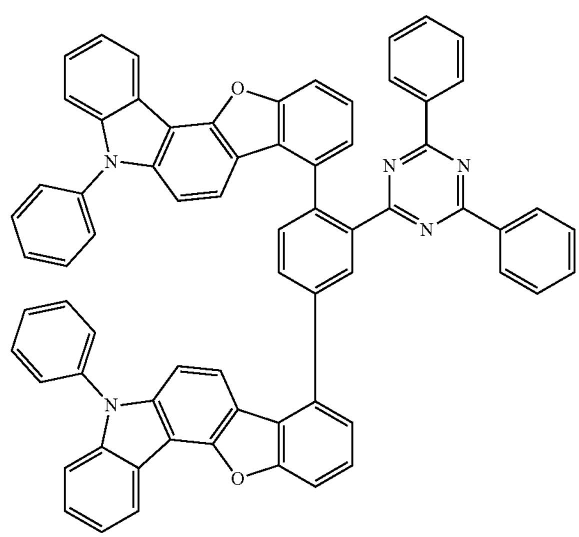

694
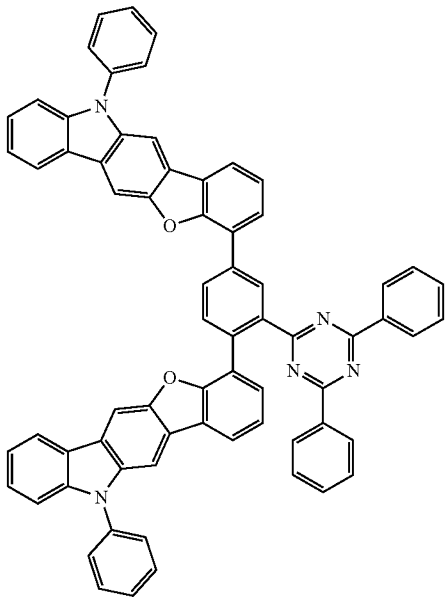
695
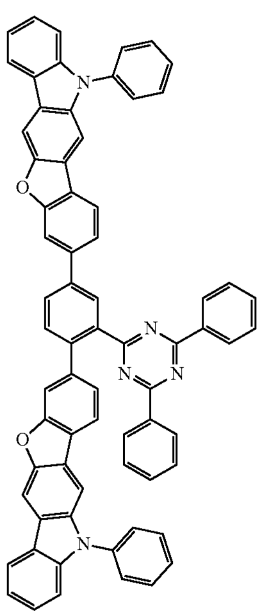
696
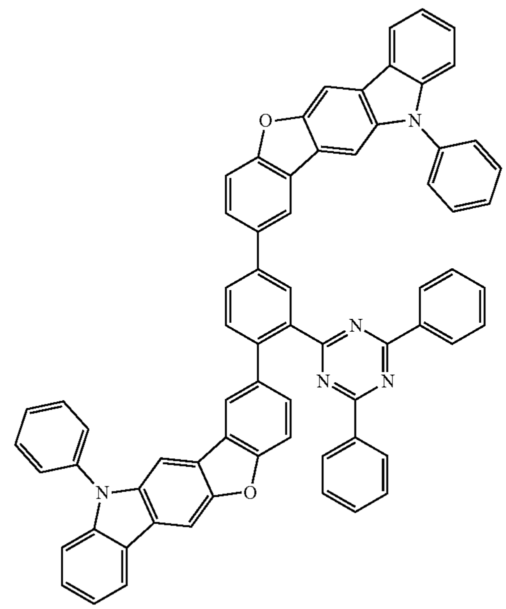
697
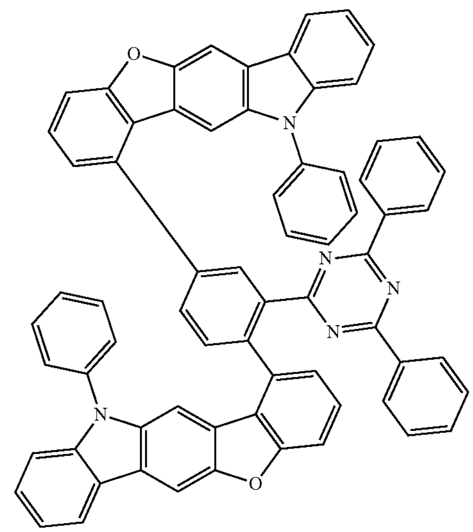
698
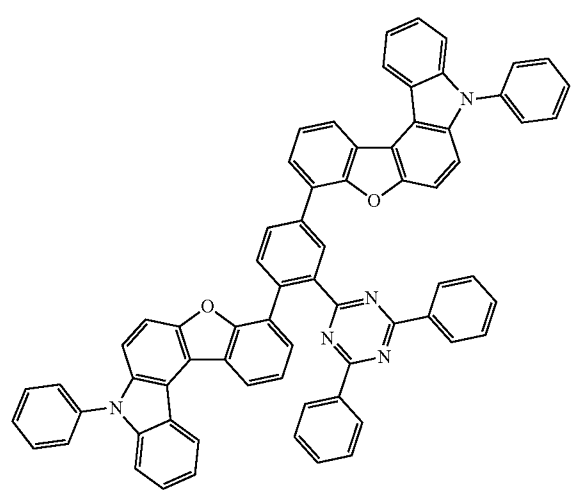

-continued
699
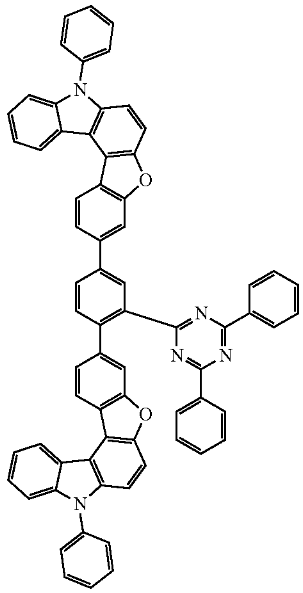
700
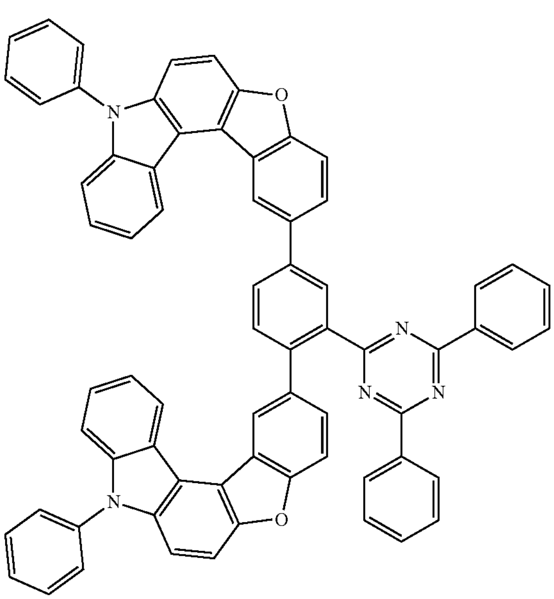
-continued
701
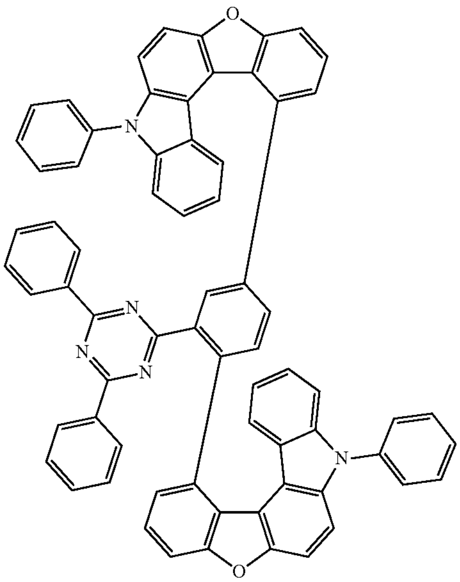
702
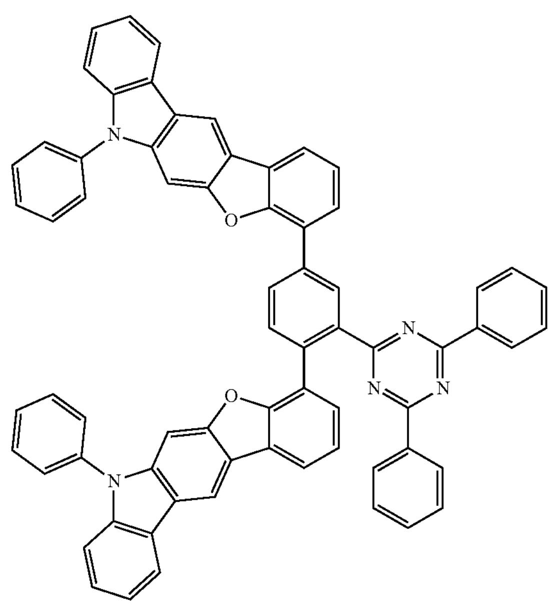

-continued
703
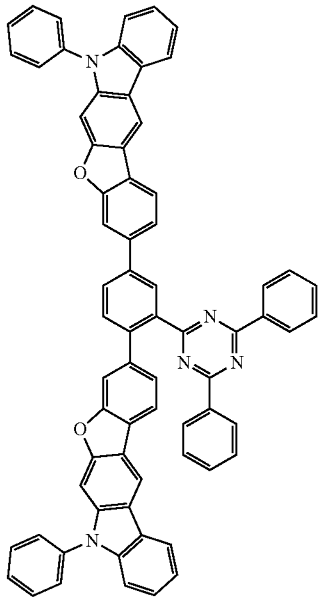
704
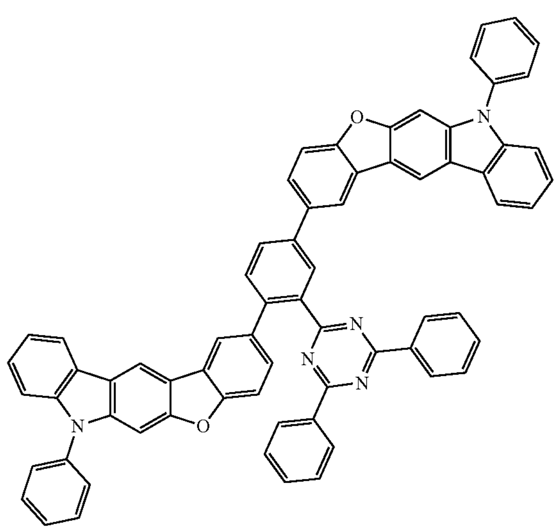
-continued
705
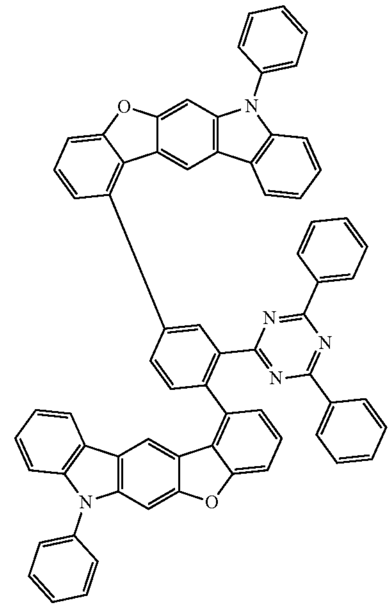
706
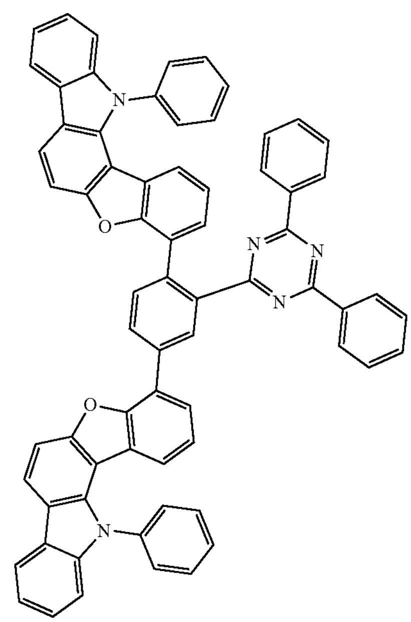

-continued
707
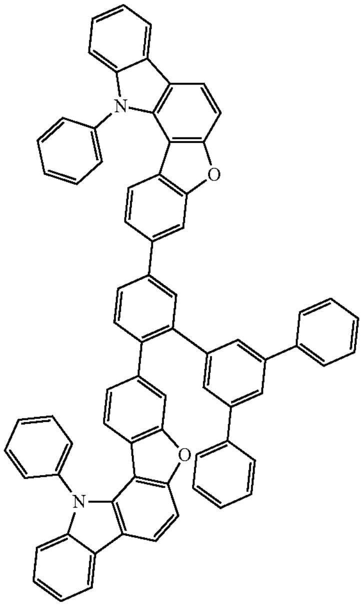
708
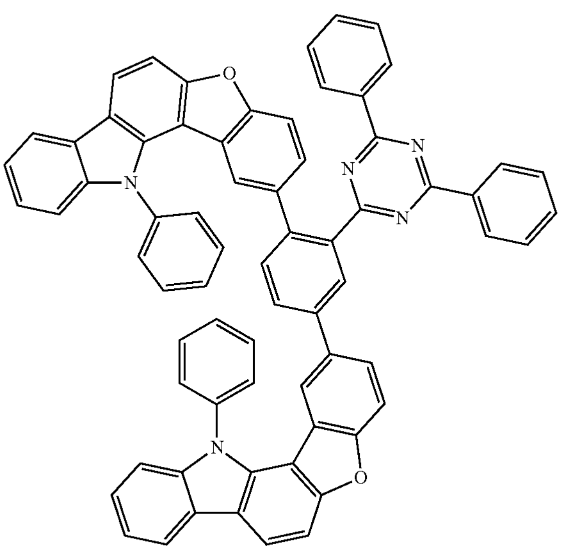
-continued
709
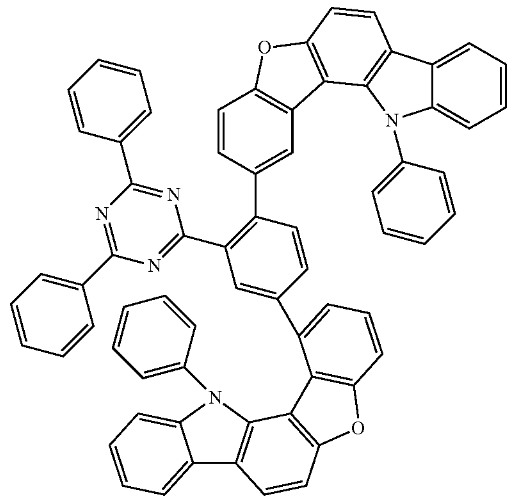
710
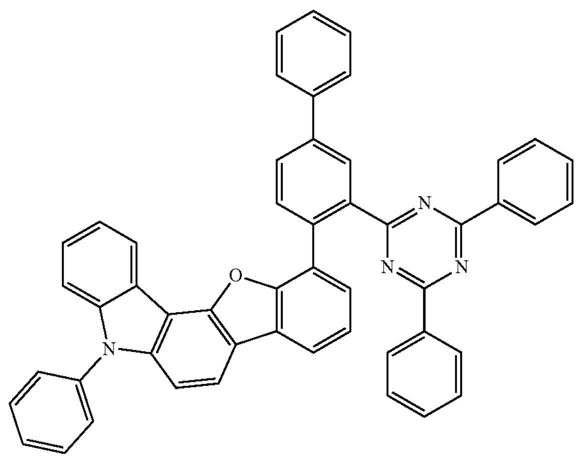
711
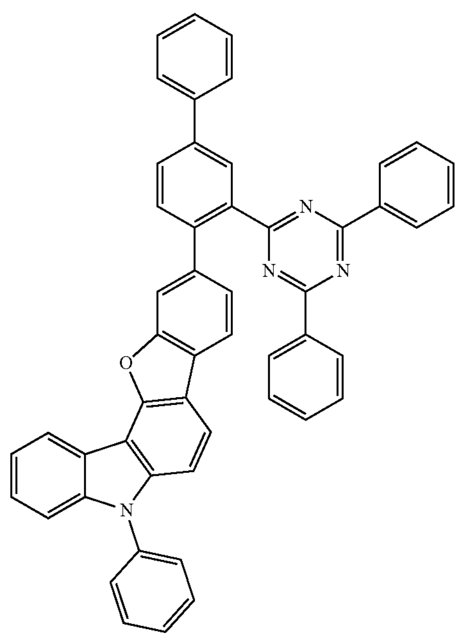

-continued
712
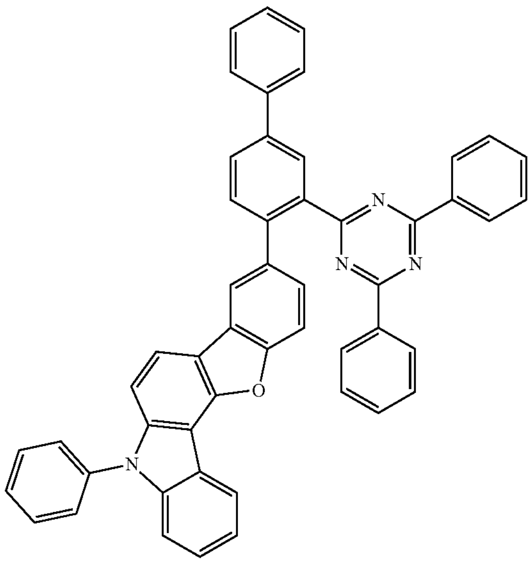
713
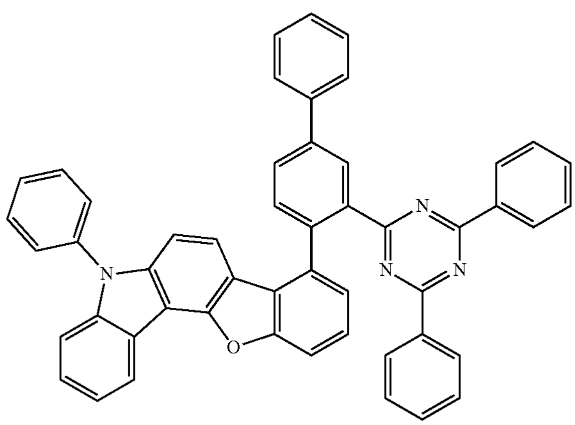
714
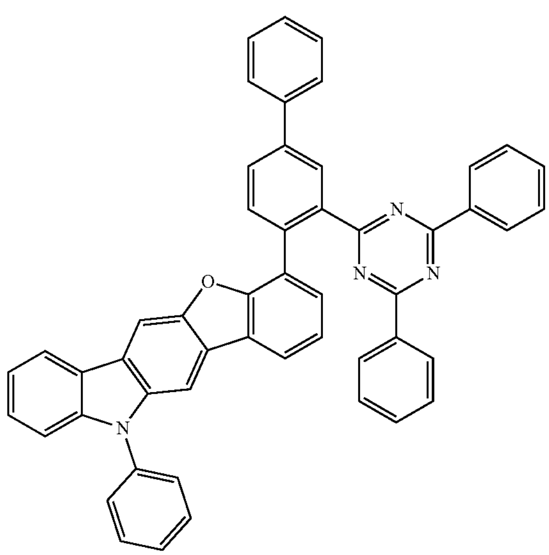
-continued
715
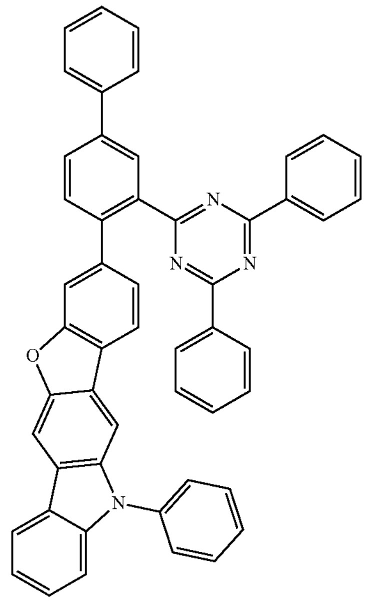
716
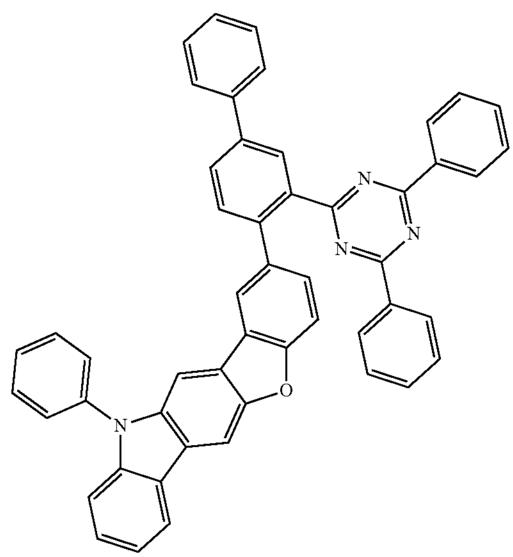
717
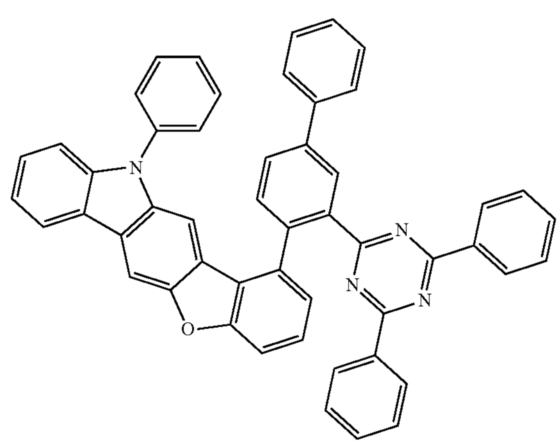

-continued
718
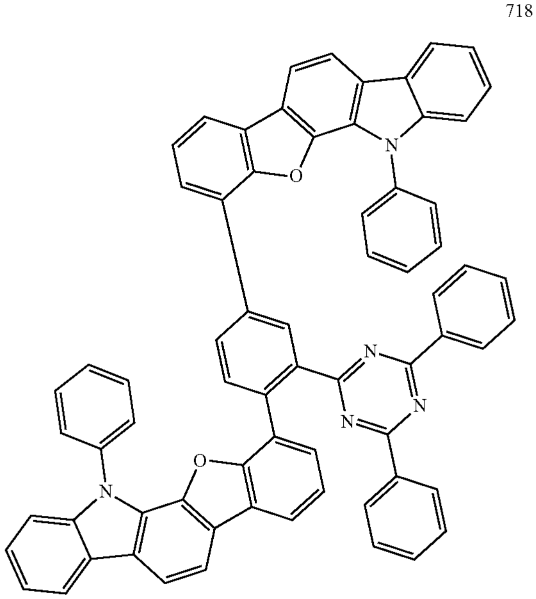
719
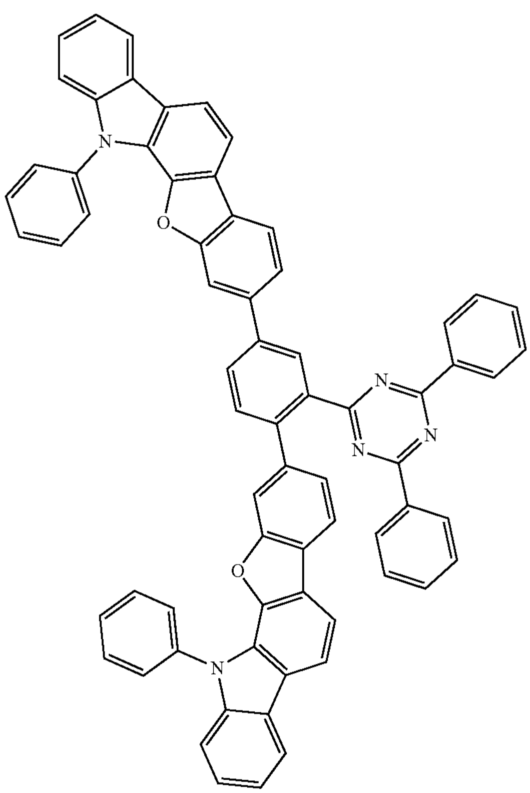
-continued
720
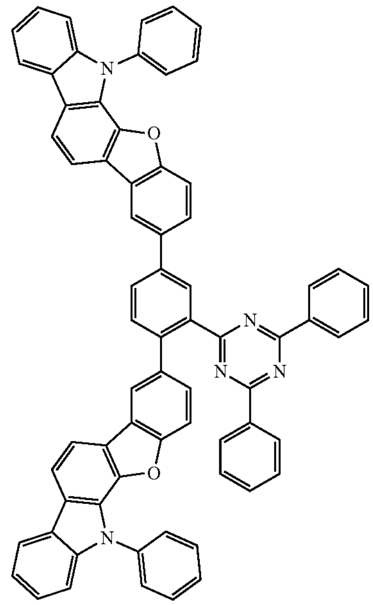
721
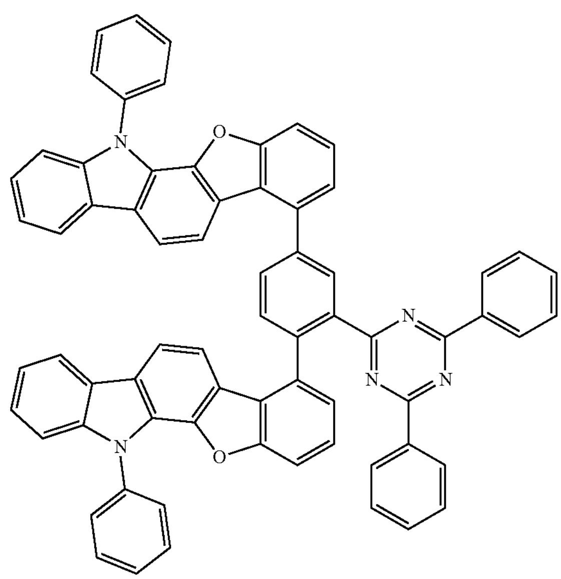

722
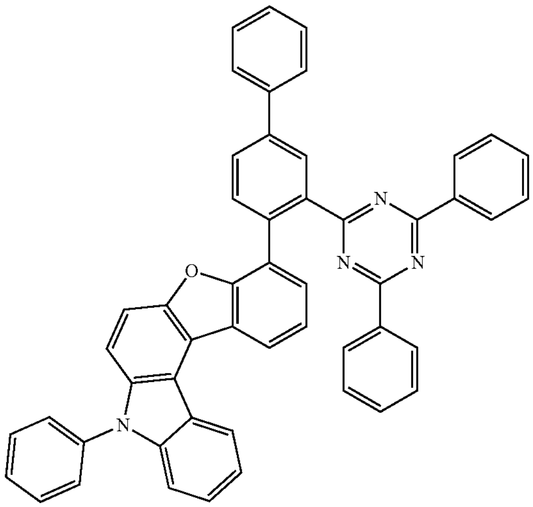
723
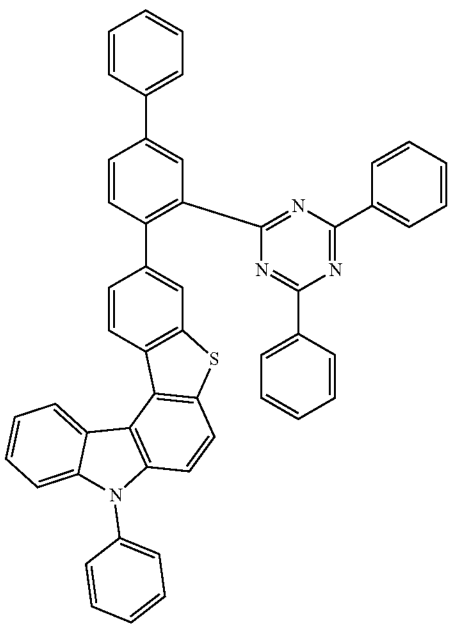
724
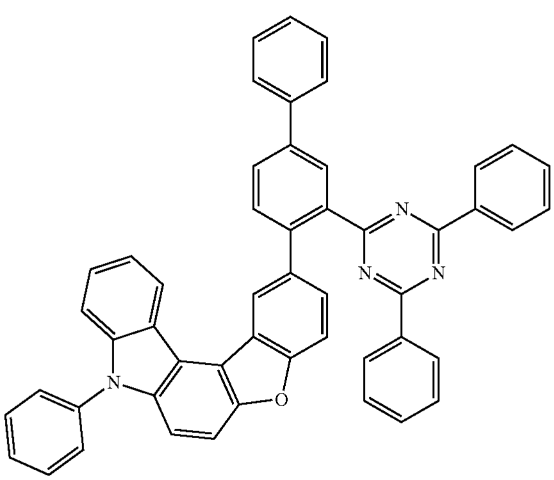
725
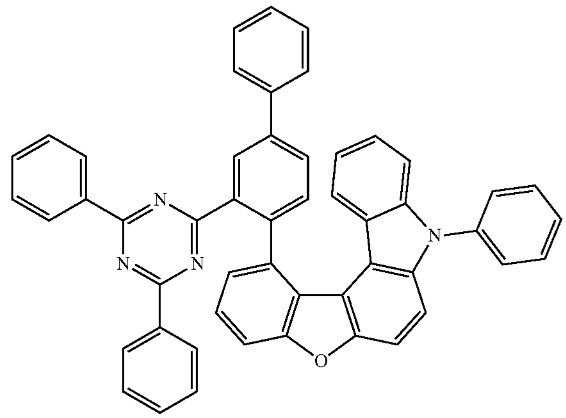
726
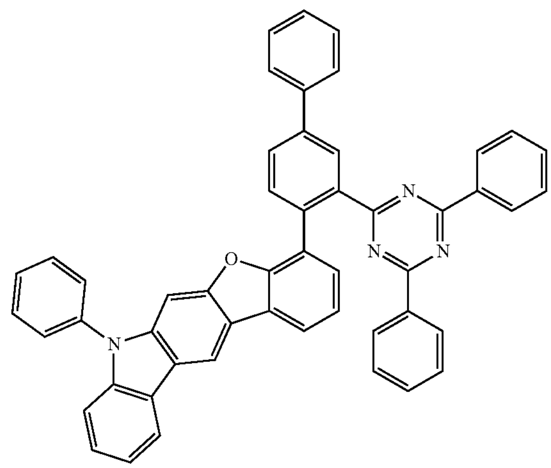
727
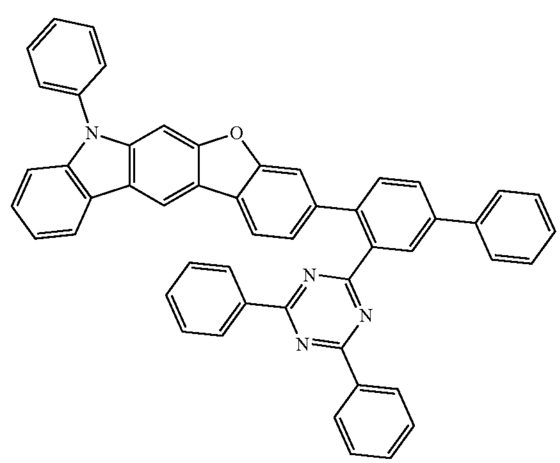

-continued
728
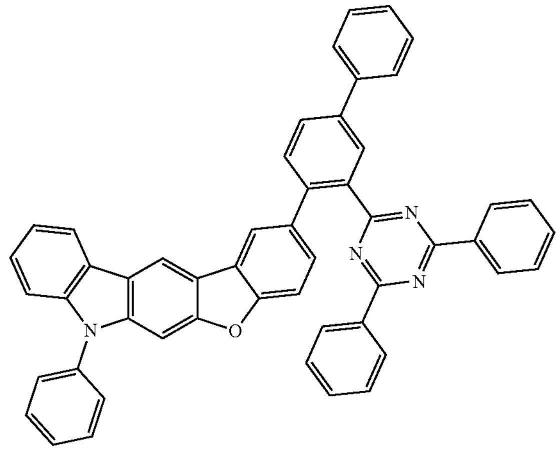
729
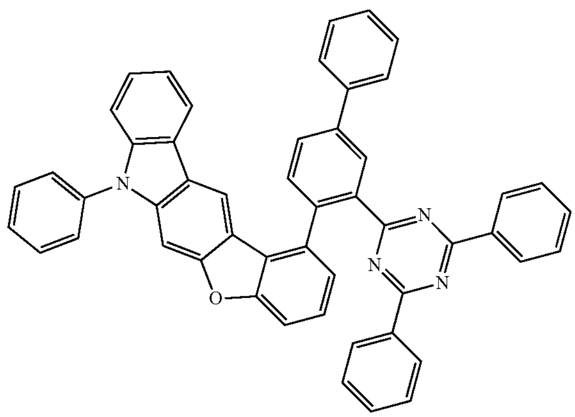
730
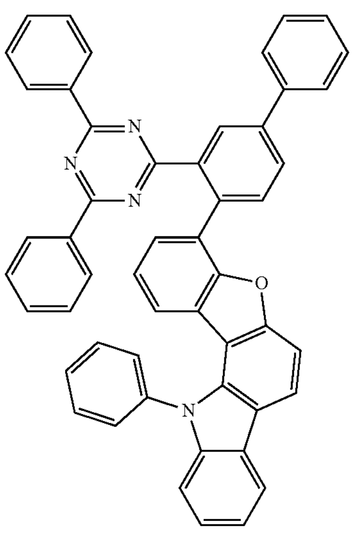
-continued
731
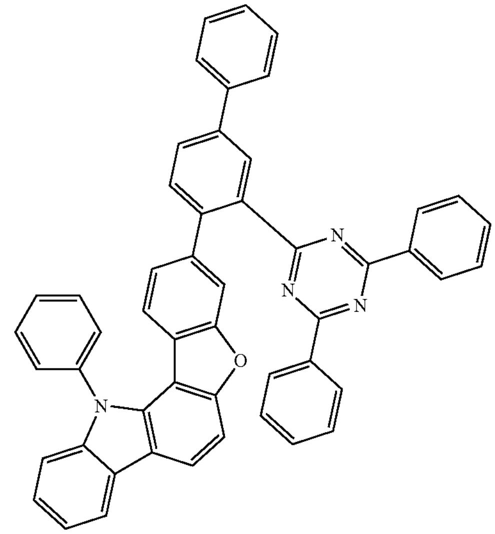
732
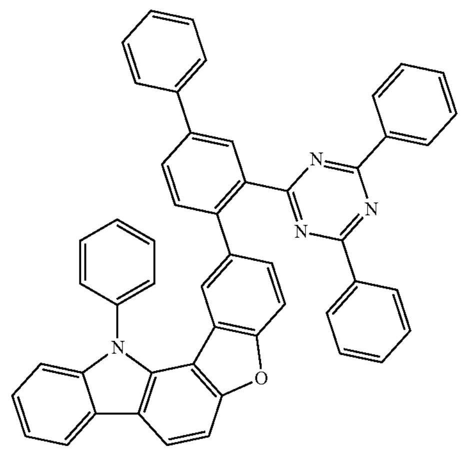
733
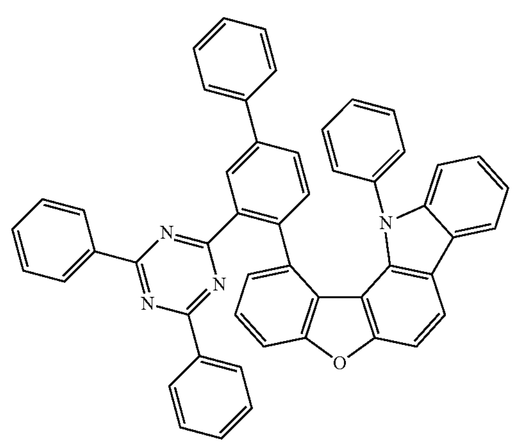

-continued
734
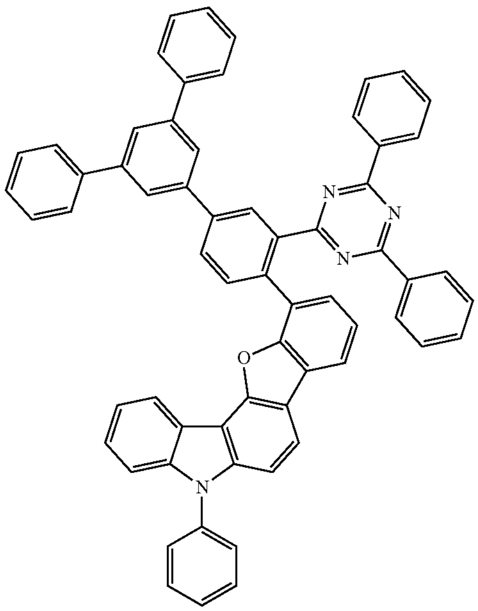
735
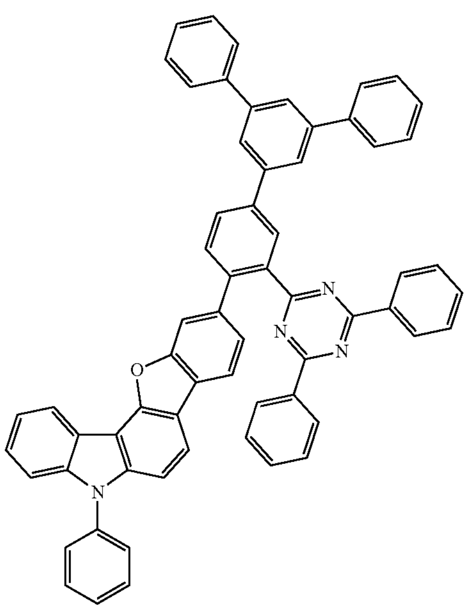
-continued
736
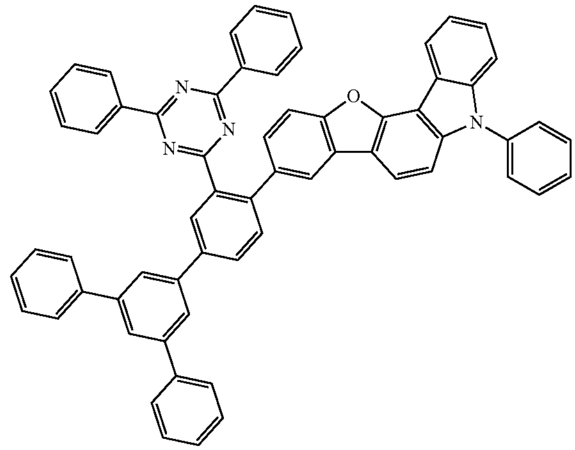
737
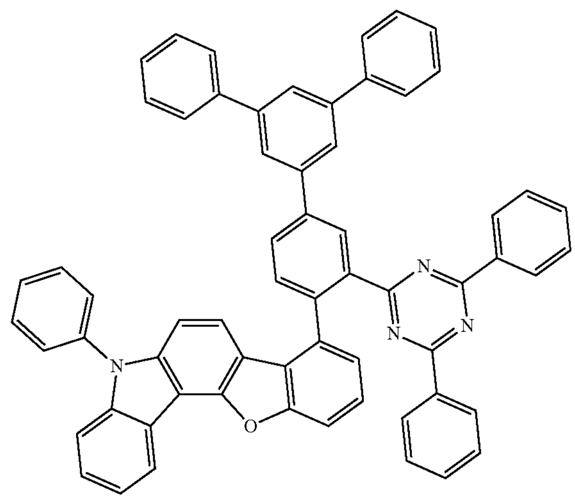
738
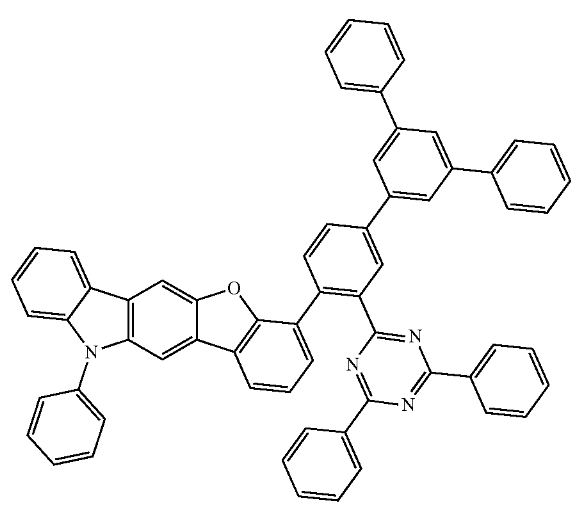

-continued
739
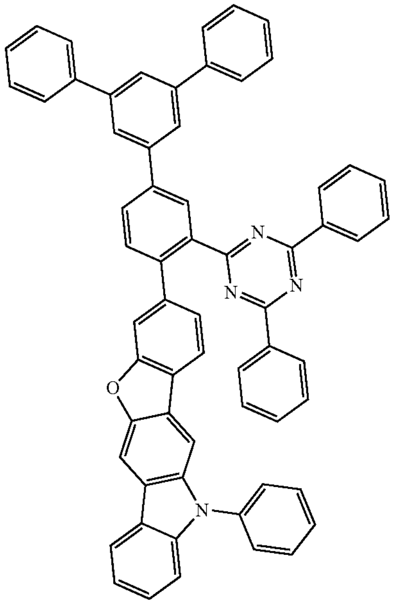
740
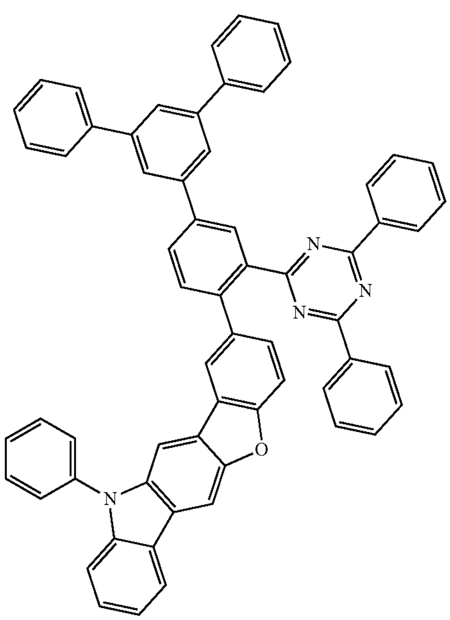
-continued
741
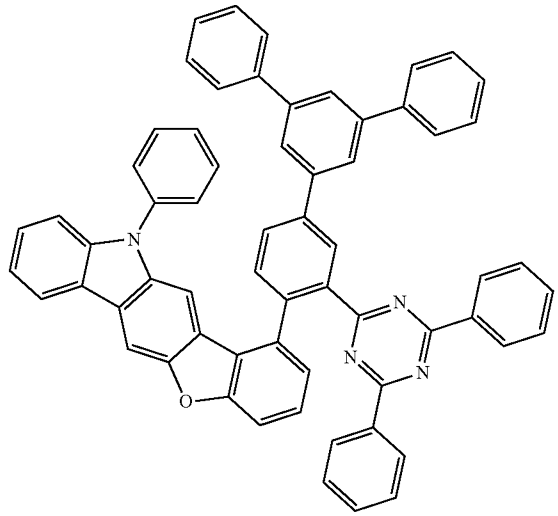
742
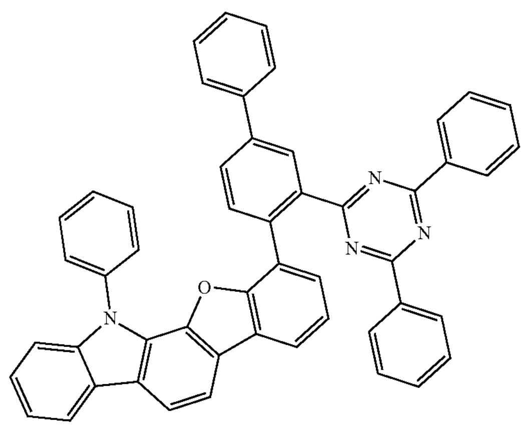
743
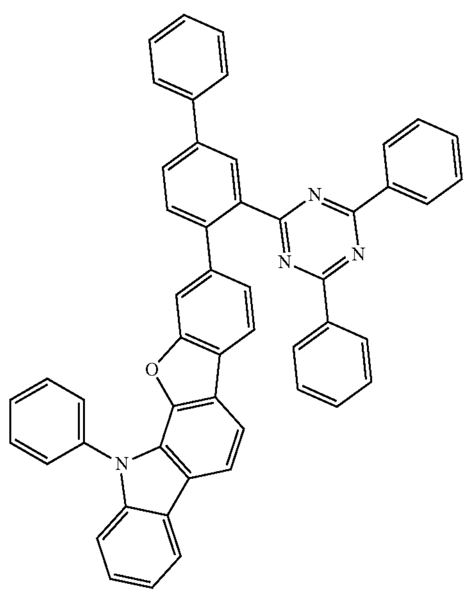

-continued
744
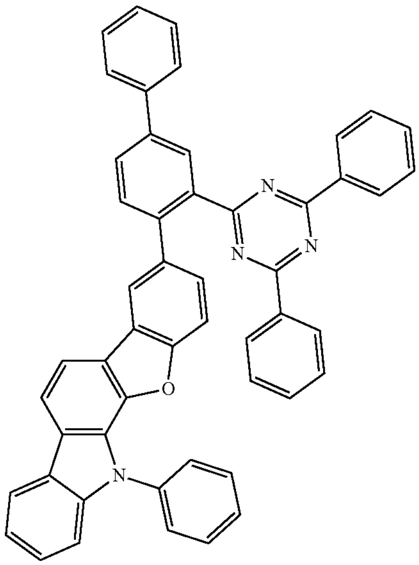
745
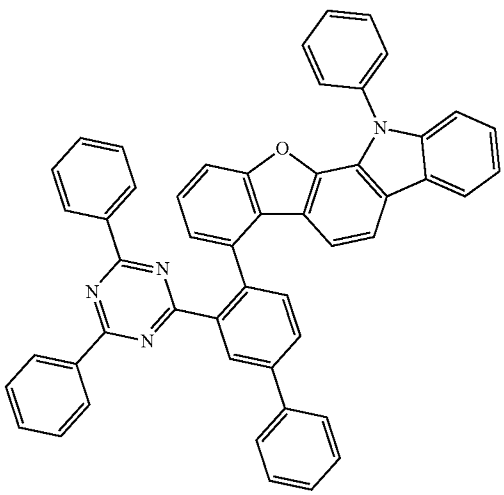
746
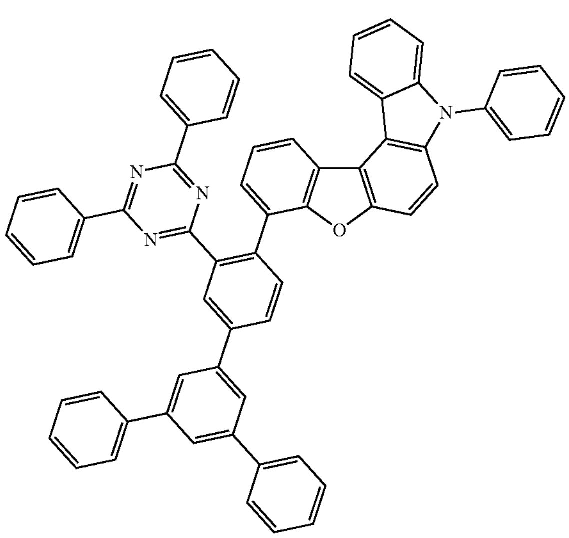
-continued
747
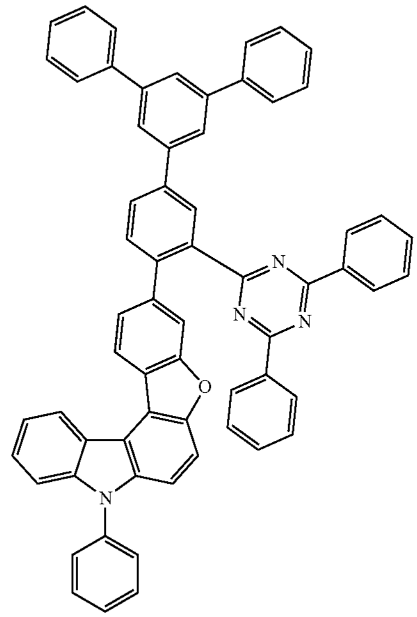
748
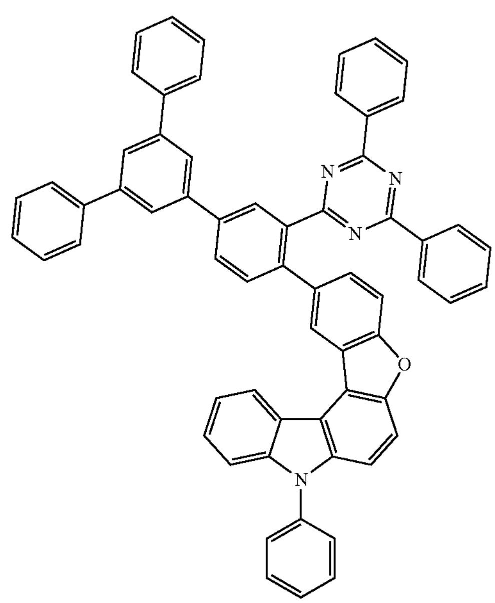

749
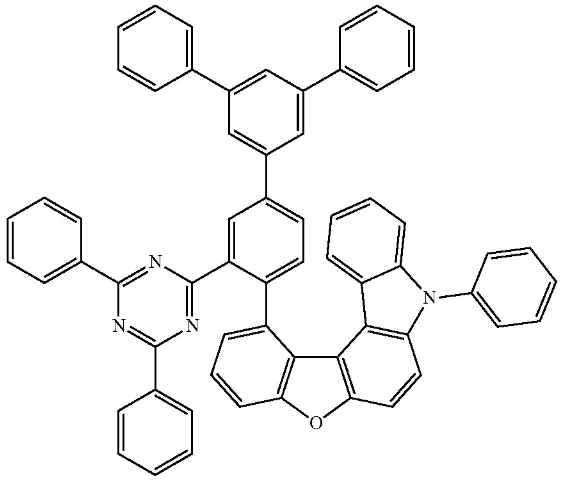
750
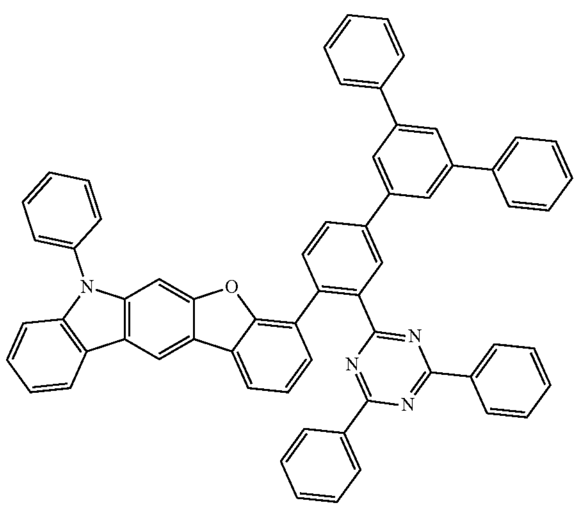
751
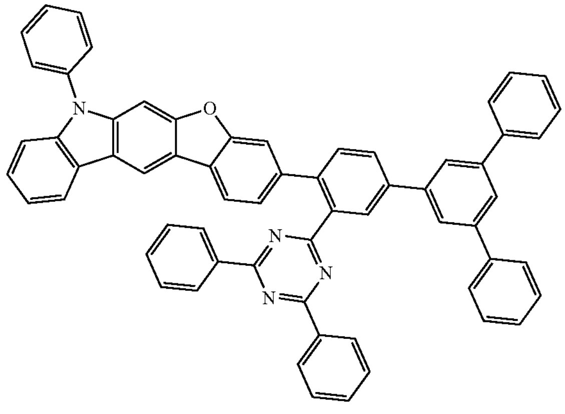
752
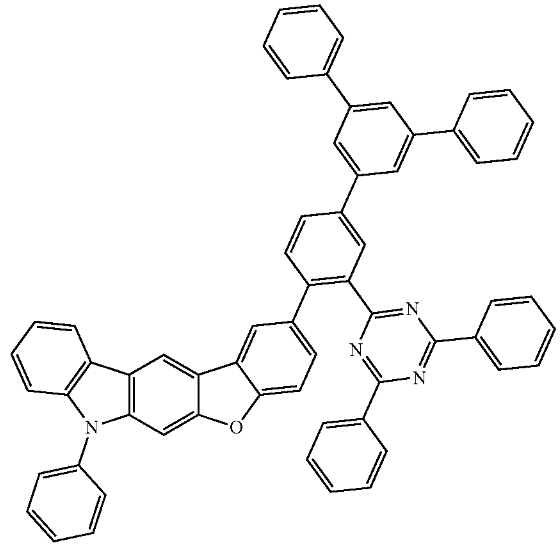
753
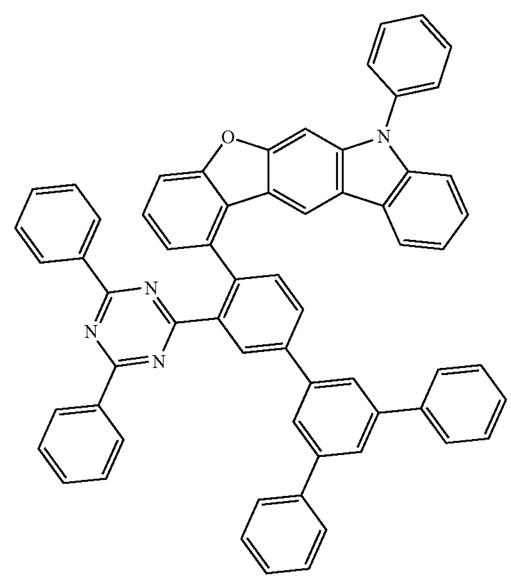

-continued
754
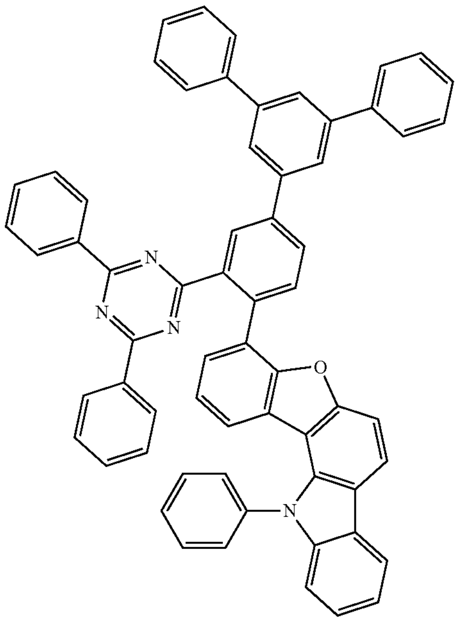
755
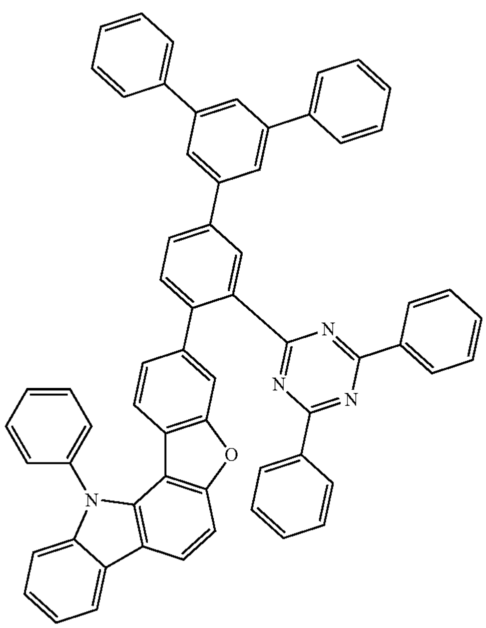
-continued
756
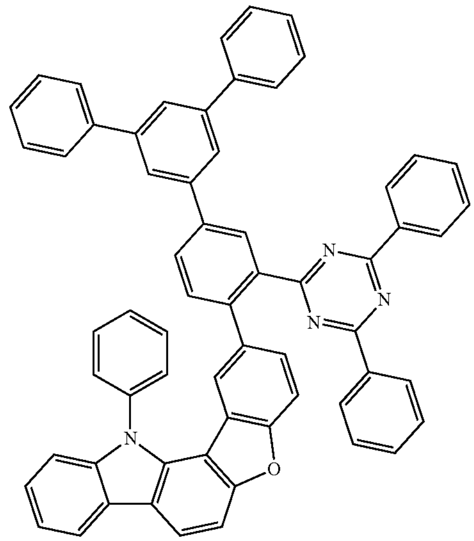
757
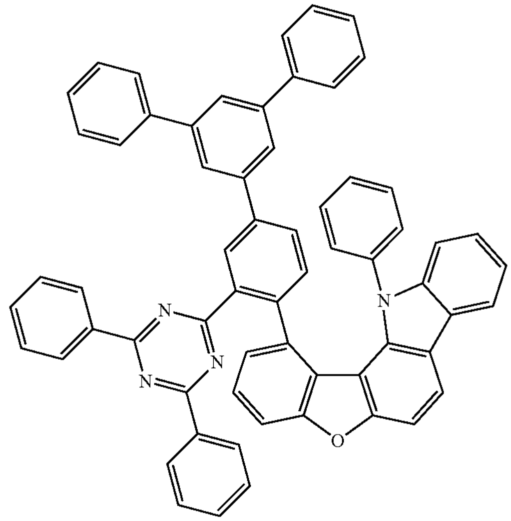

-continued
758
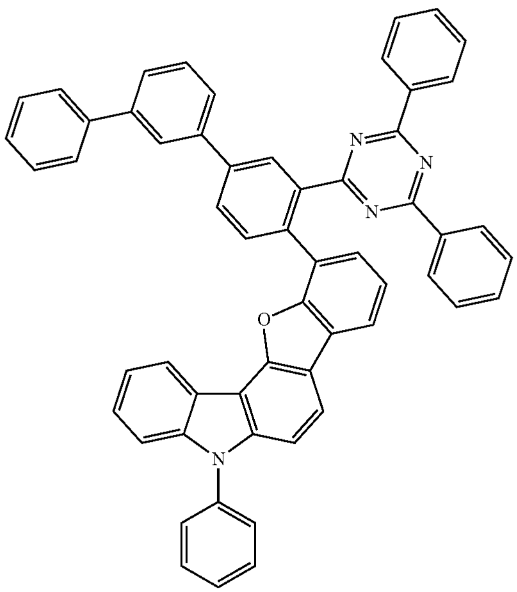
759
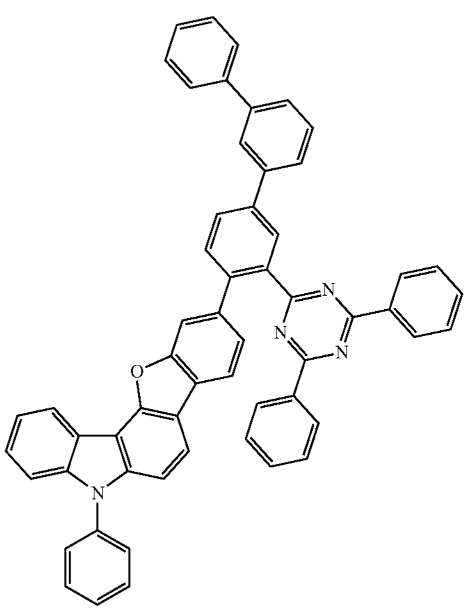
-continued
760
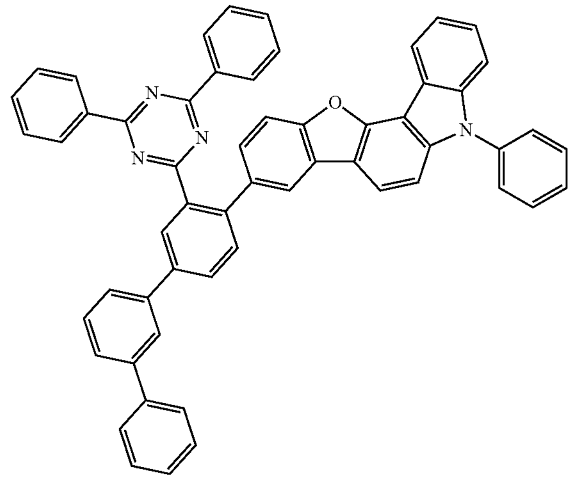
761
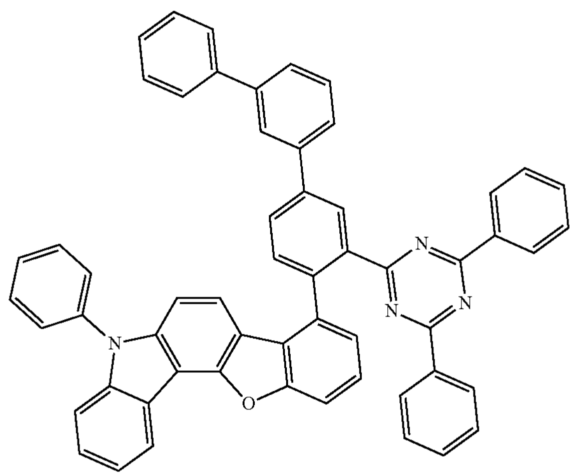
762
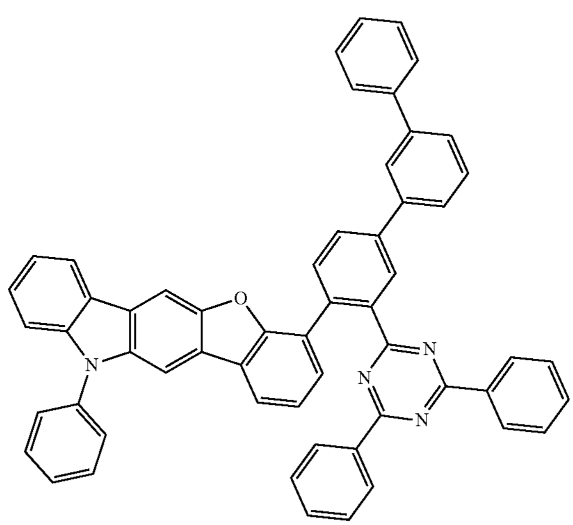

-continued
763
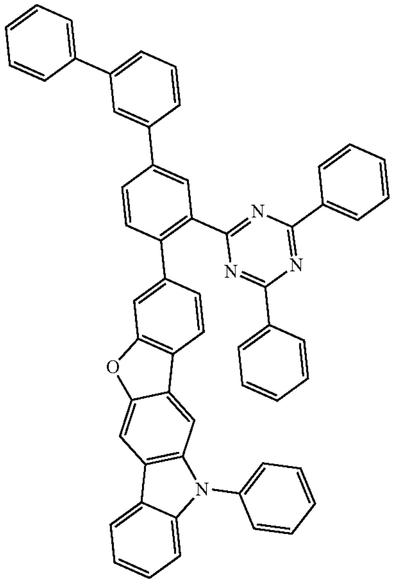
764
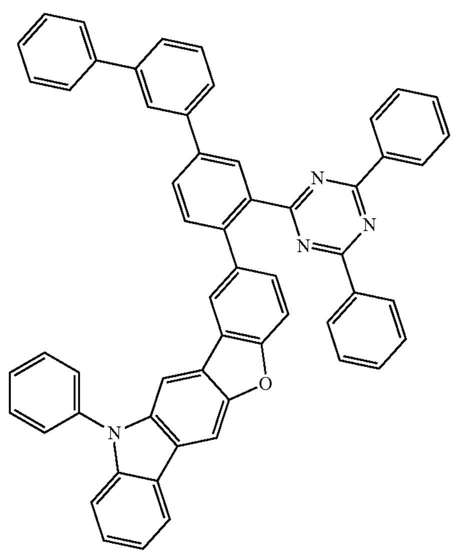
765
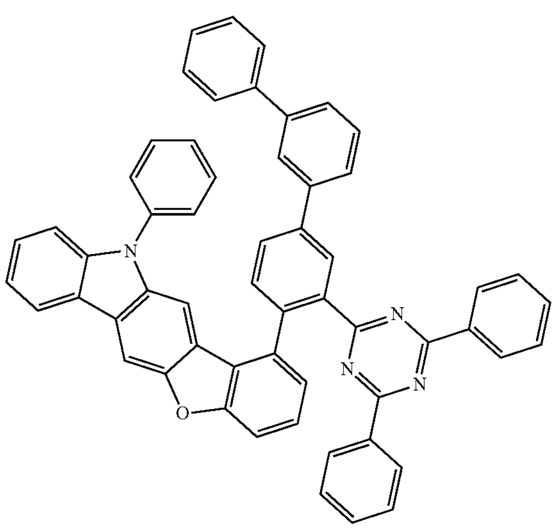
-continued
766
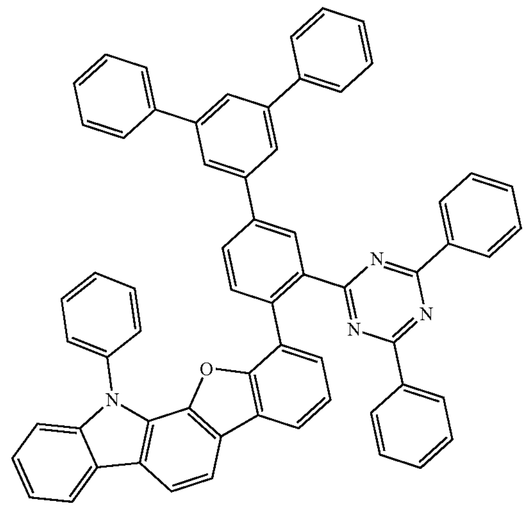
767
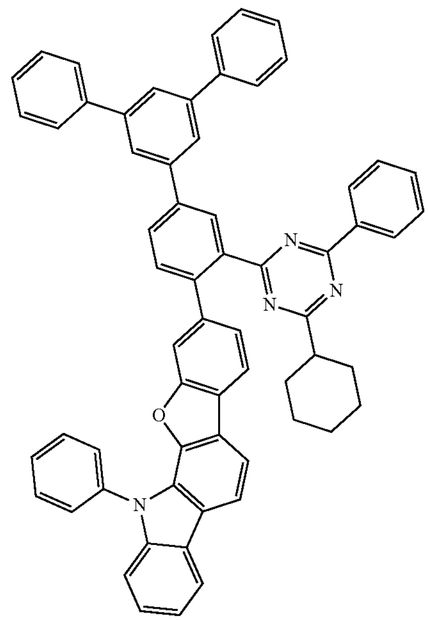
768
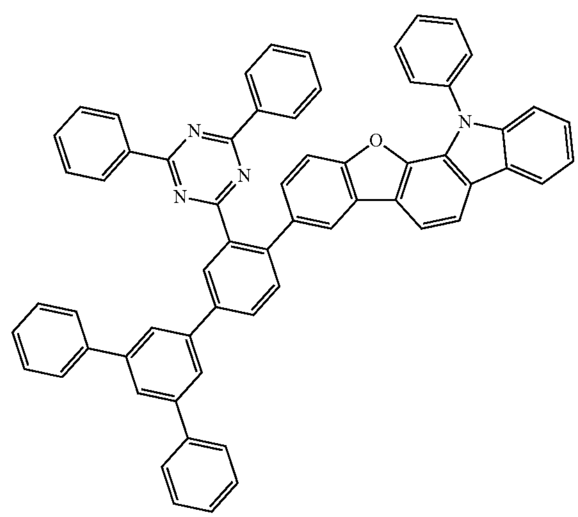

-continued
769
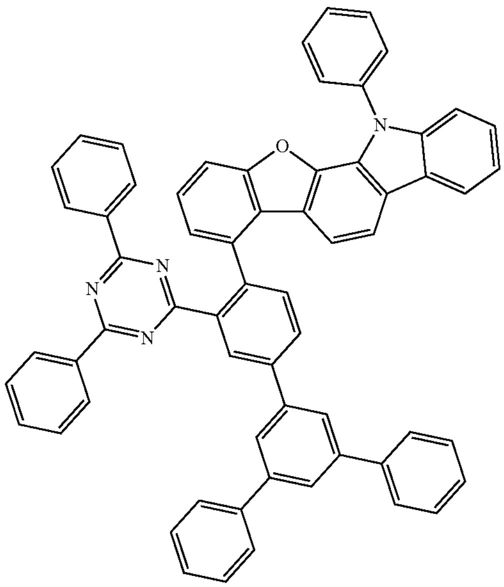
770
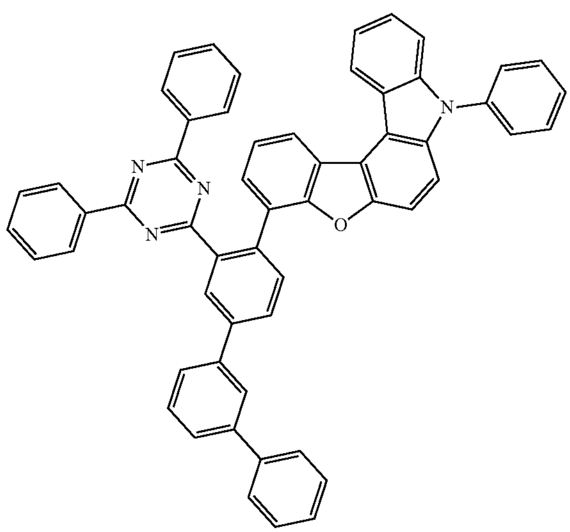
-continued
771
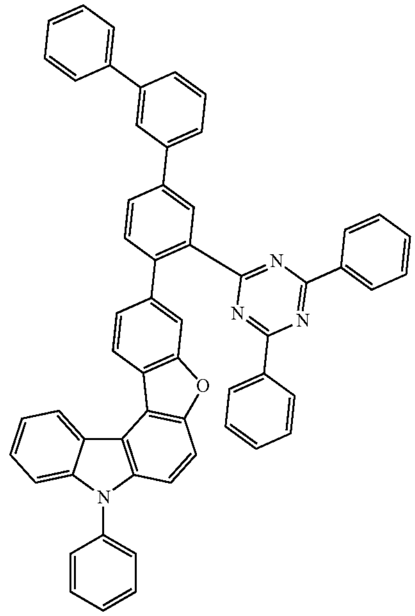
772
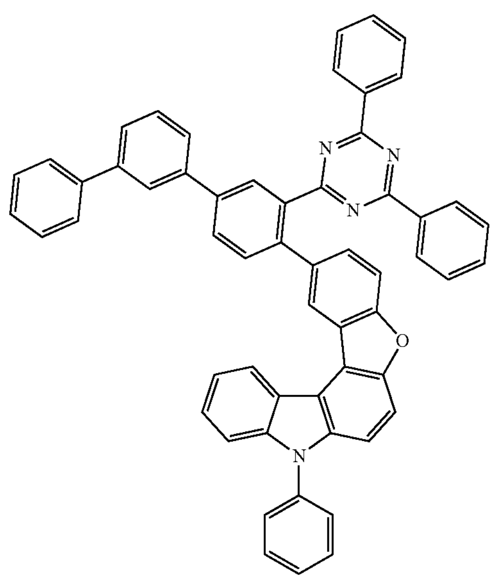

-continued
773
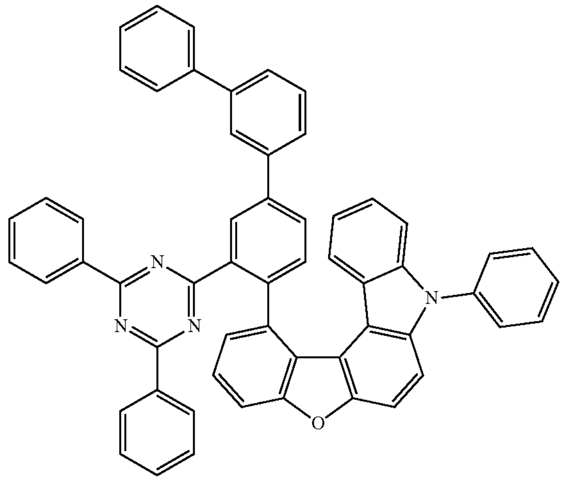
774
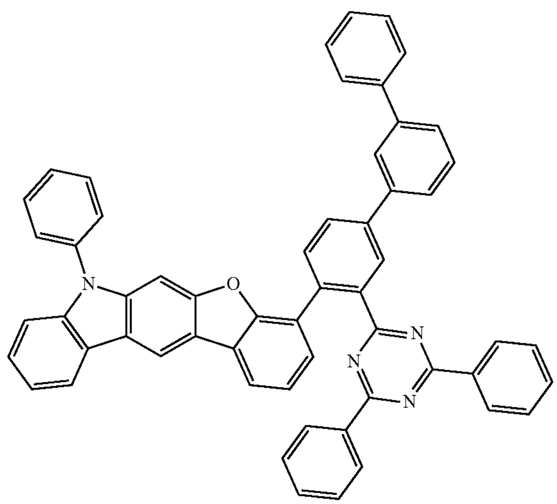
775
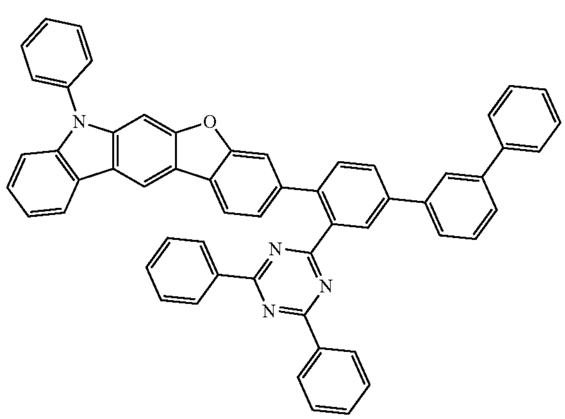
-continued
776
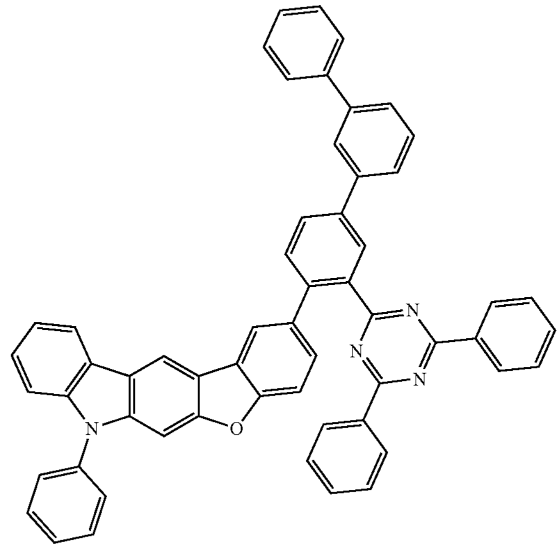
777
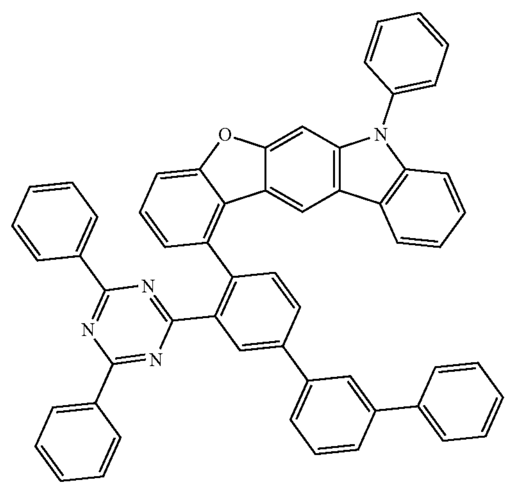
778
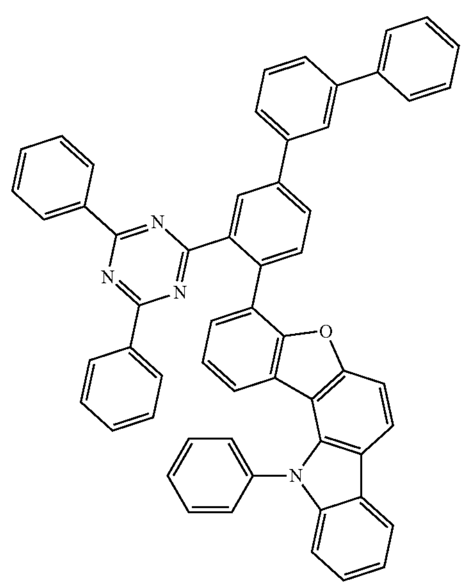

-continued
779
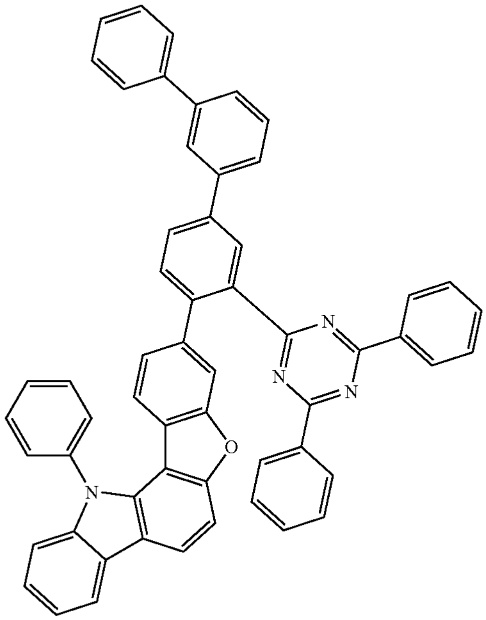
780
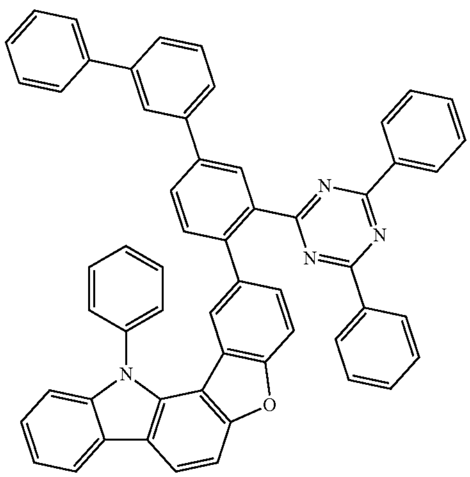
781
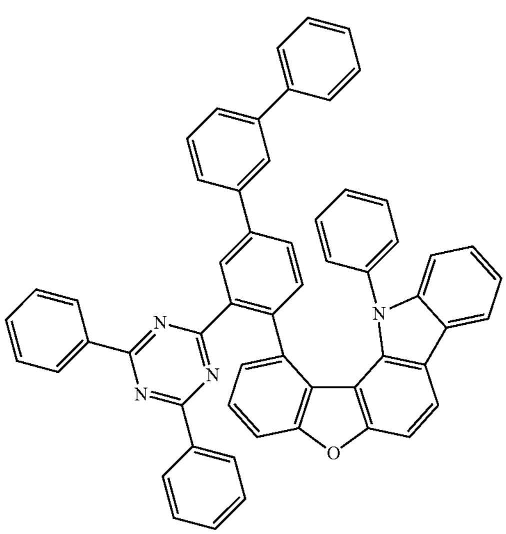
-continued
782
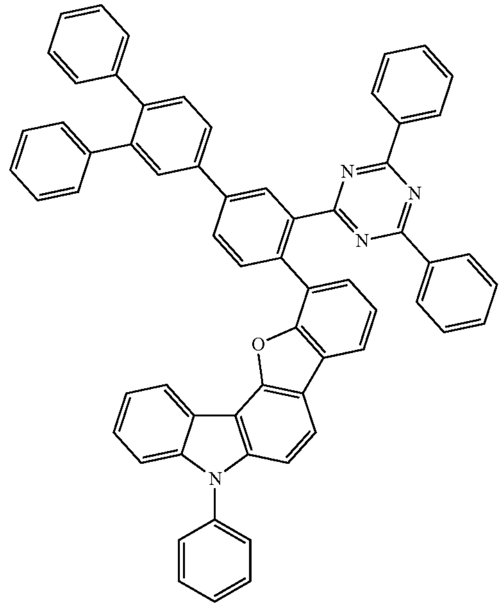
783
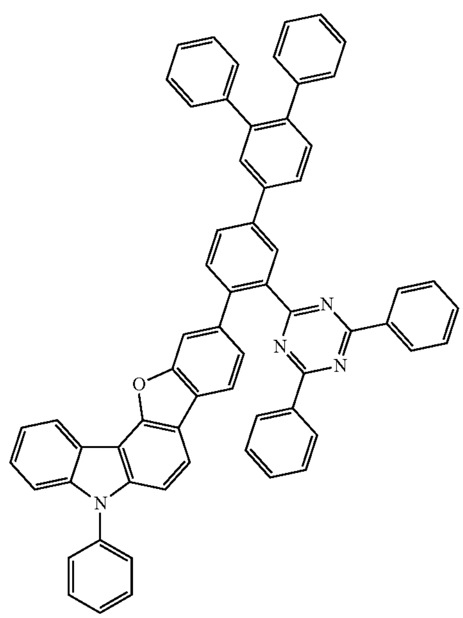

-continued
784
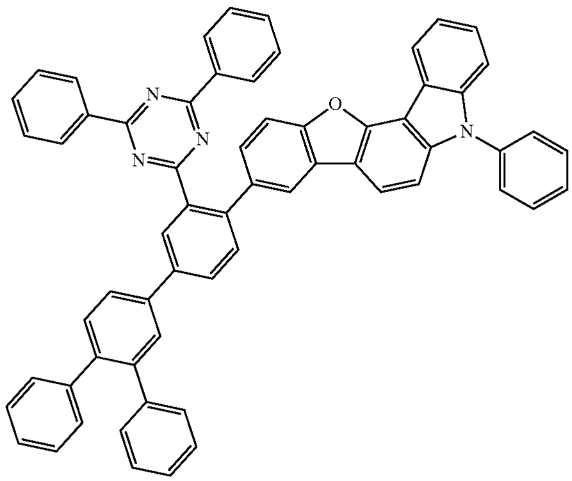
785
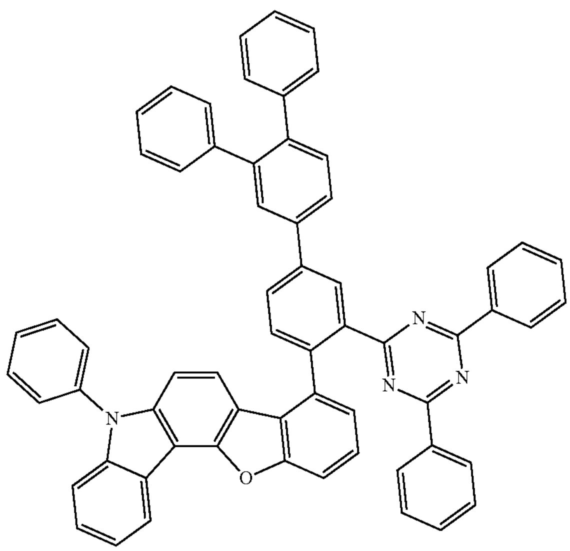
786
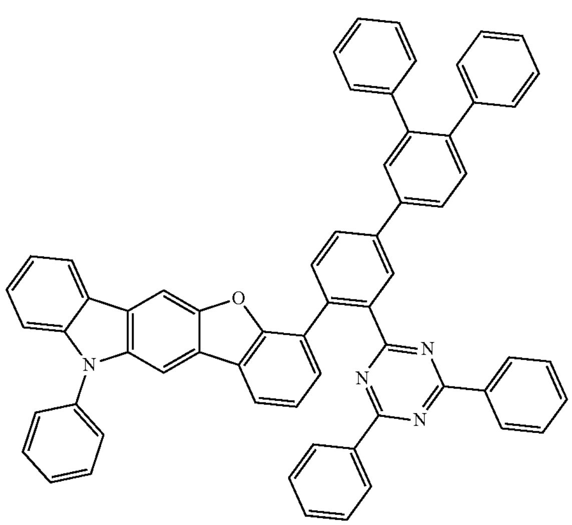
-continued
787
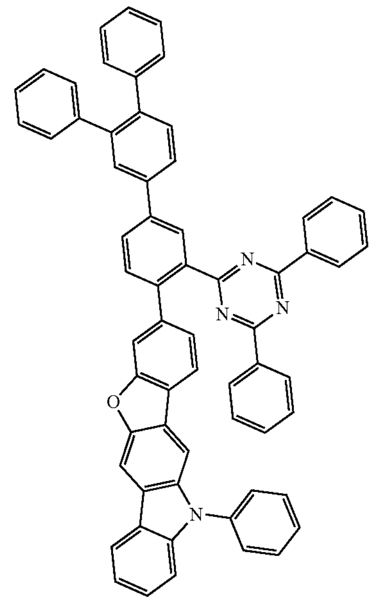
788
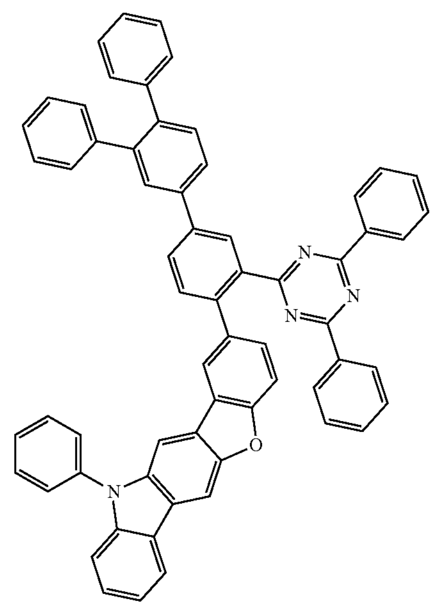

-continued
789
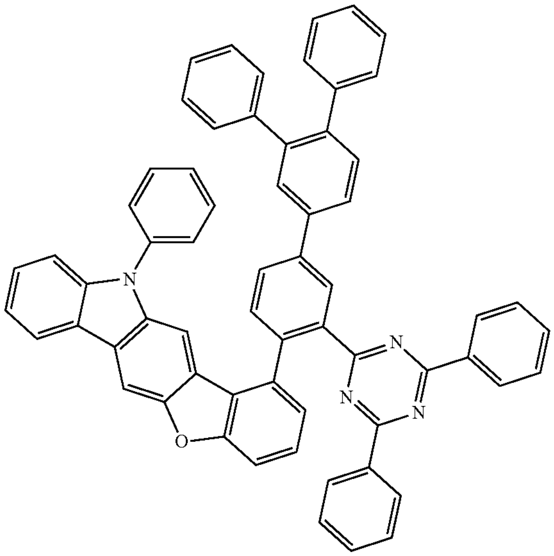
790
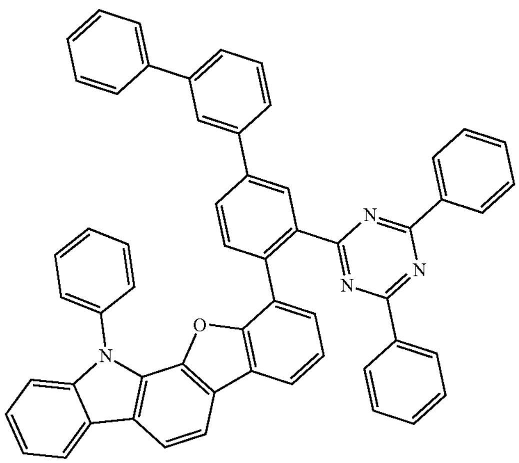
791
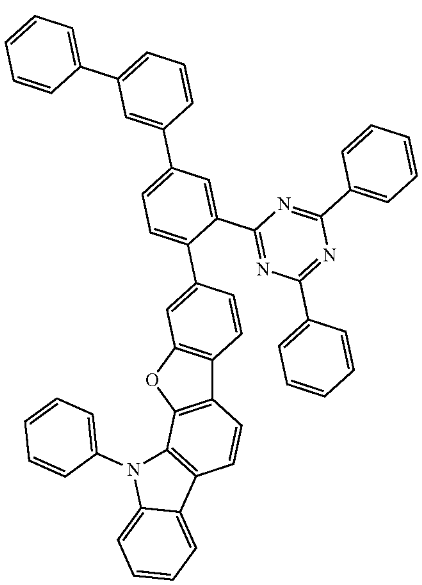
-continued
792
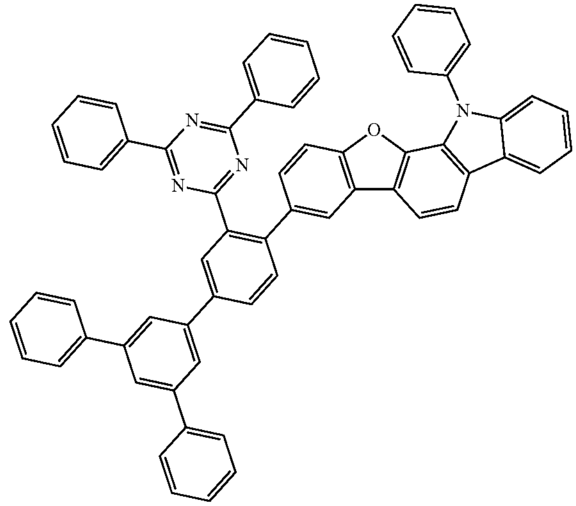
793
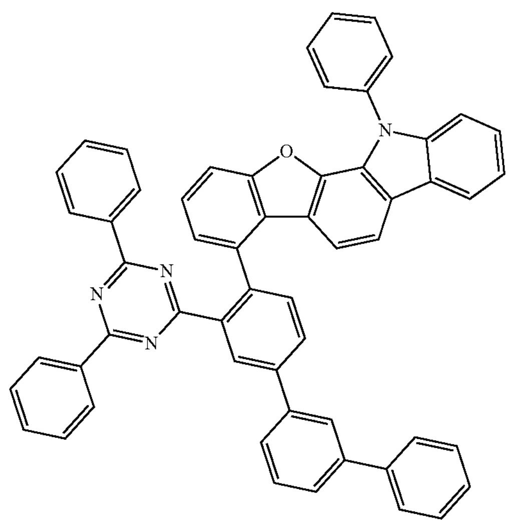
794
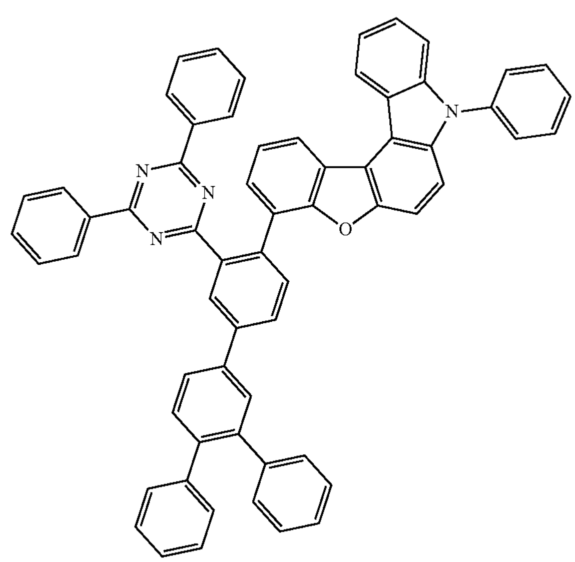

795
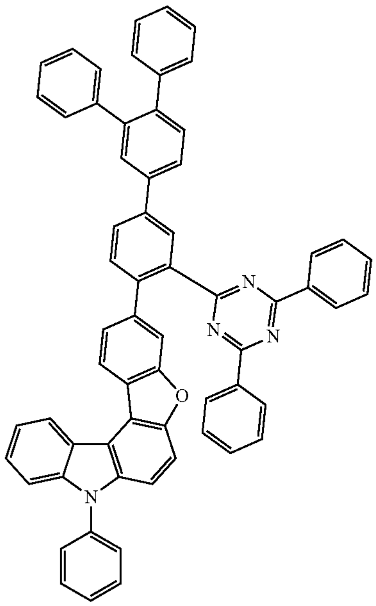
796
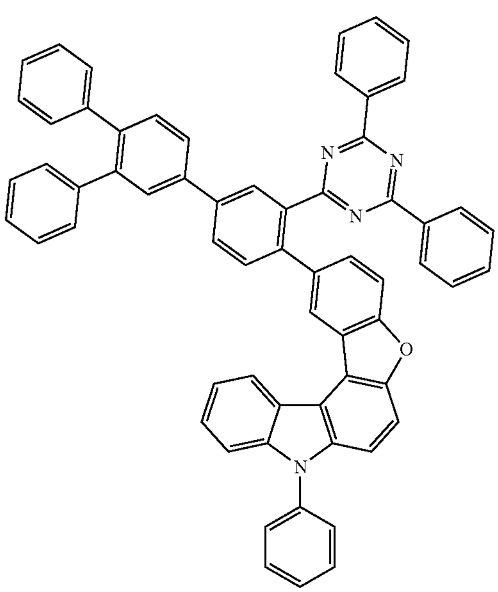
797
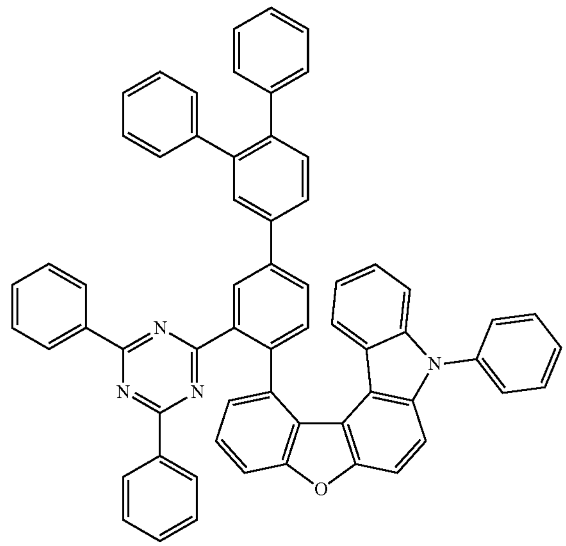
798
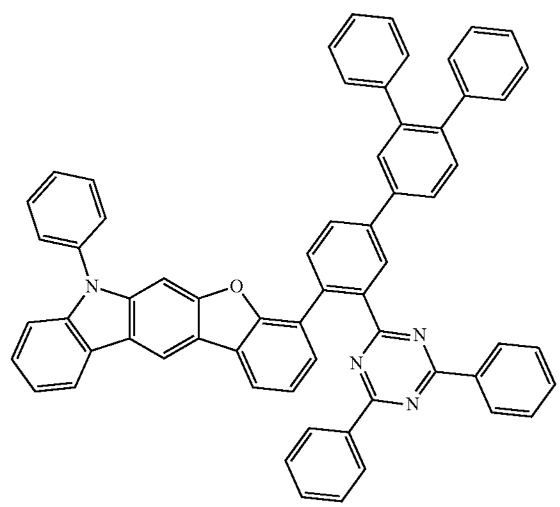
799
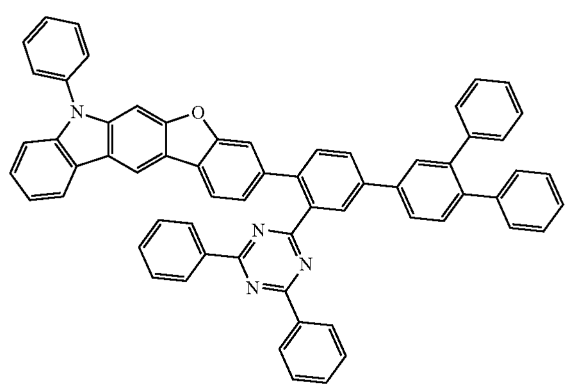

-continued
800
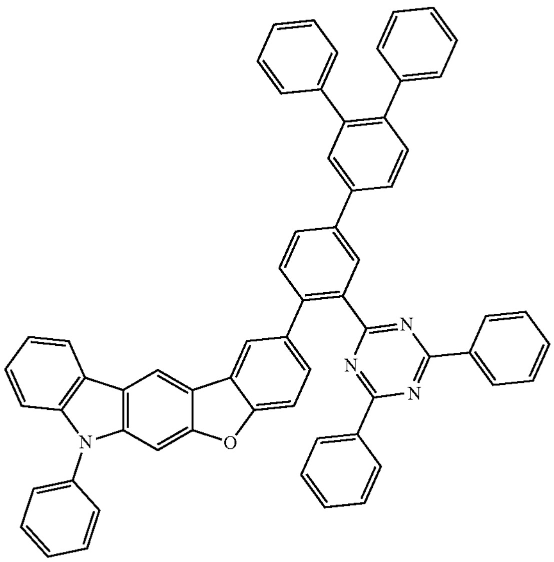
801
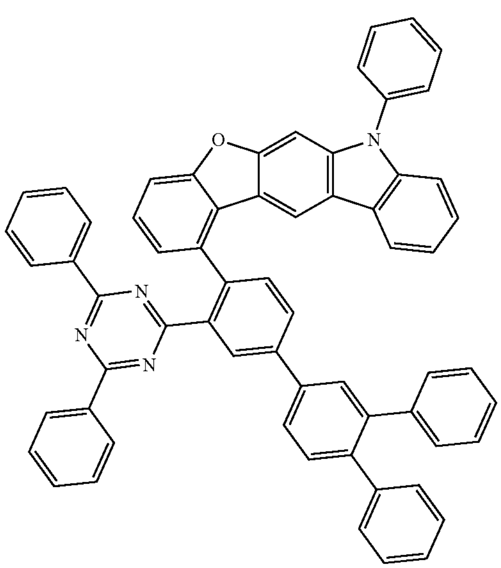
-continued
802
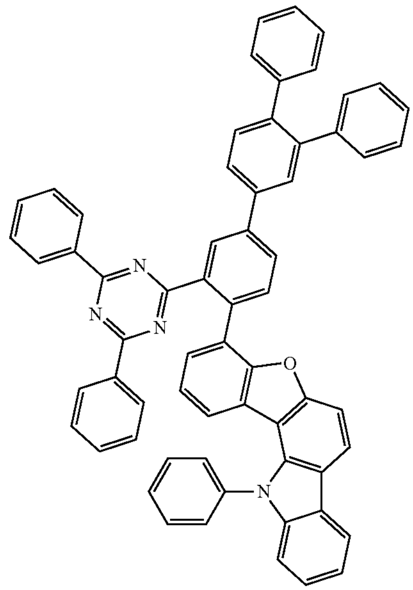
803
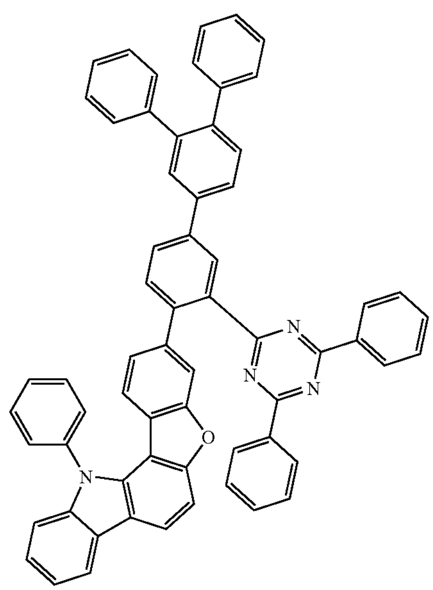

-continued
804
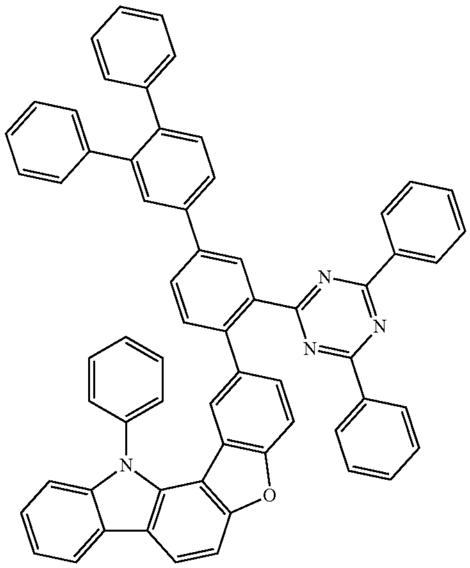
805
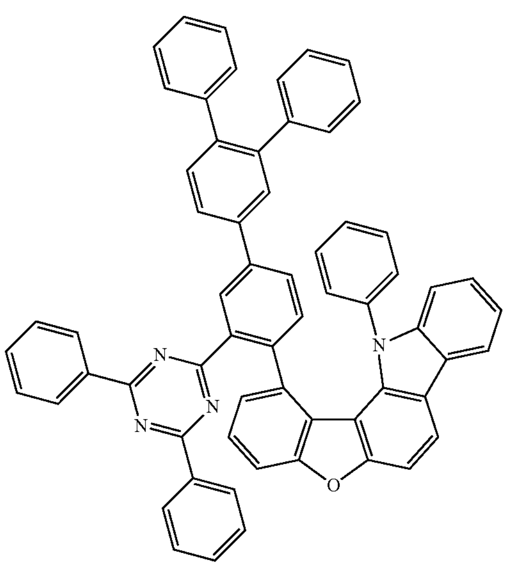
-continued
806
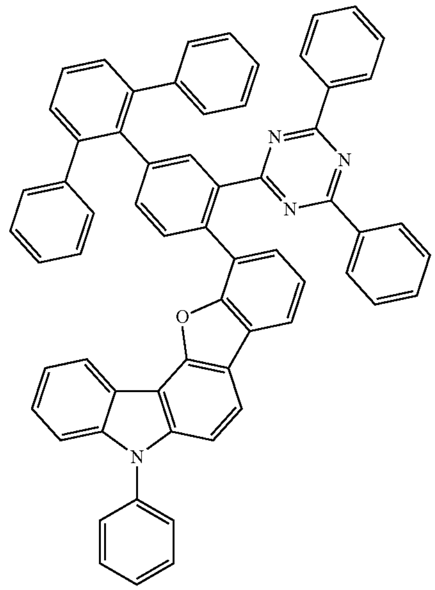
807
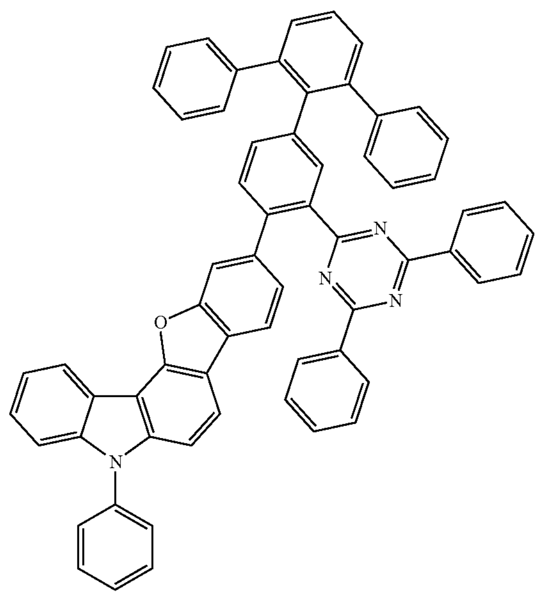
808
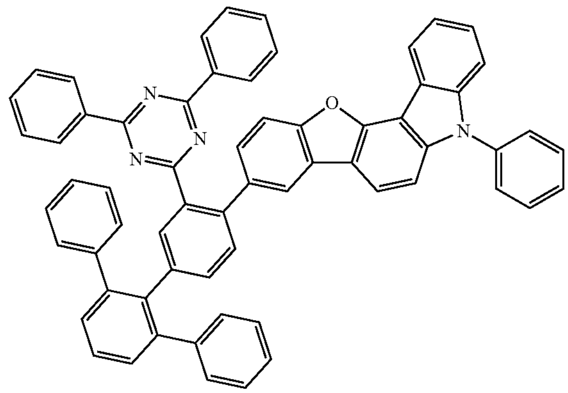

-continued
809
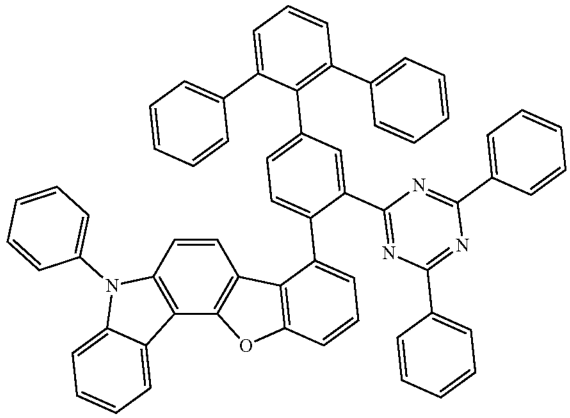
810
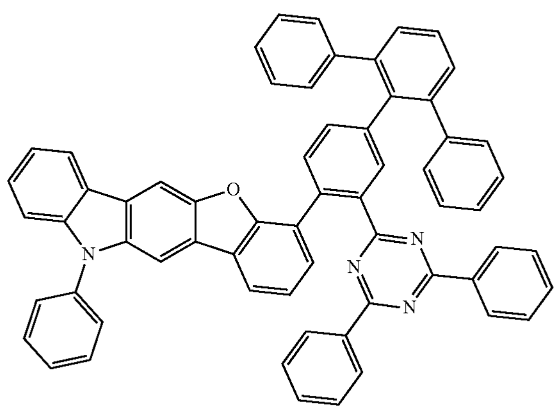
811
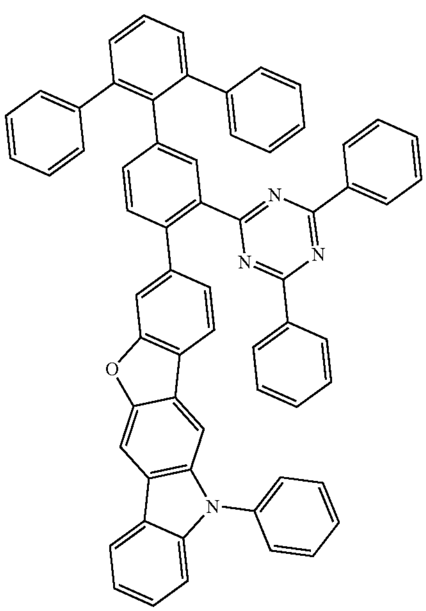
-continued
812
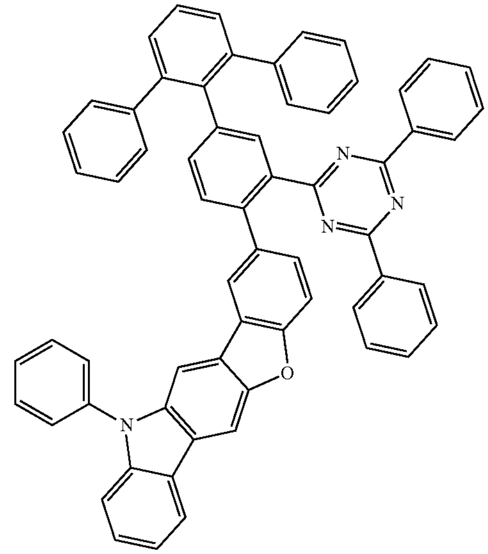
813
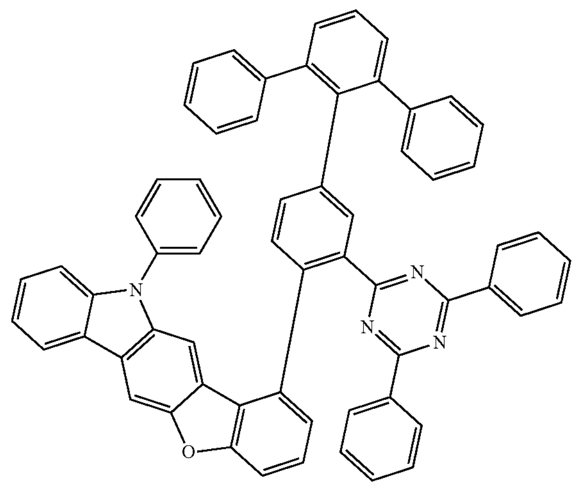
814
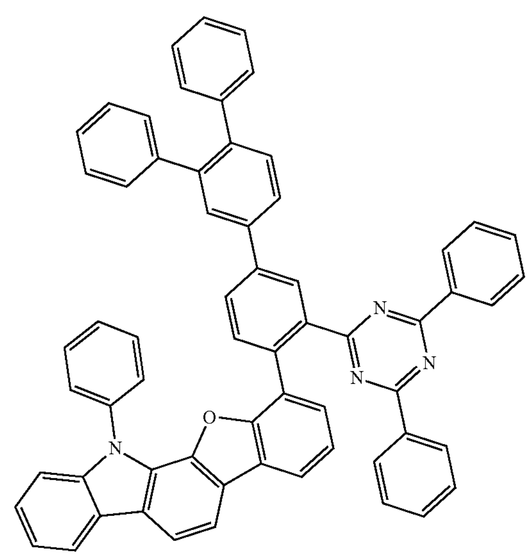

-continued
815
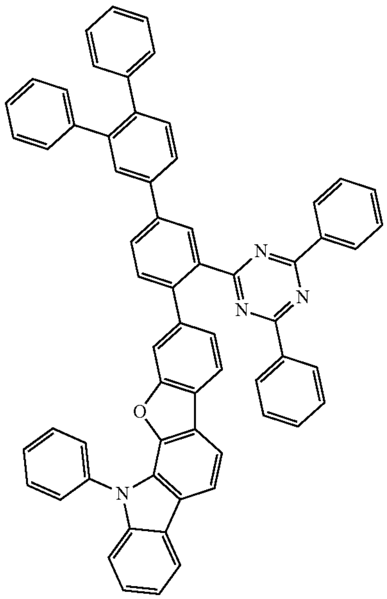
816
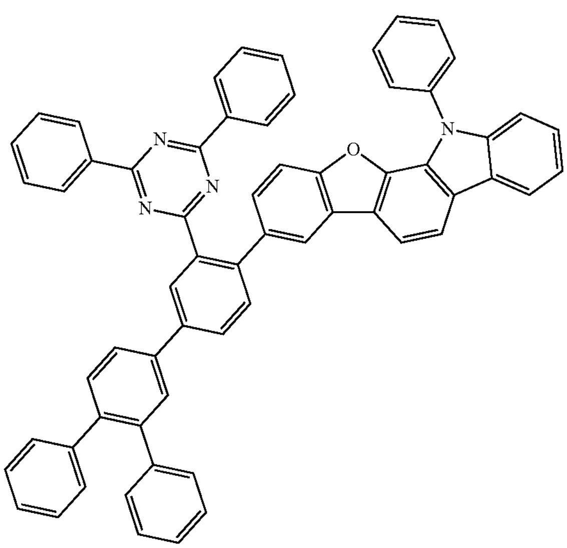
-continued
817
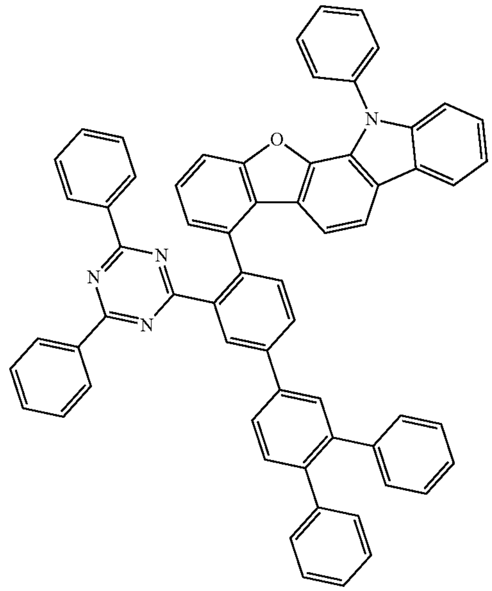
818
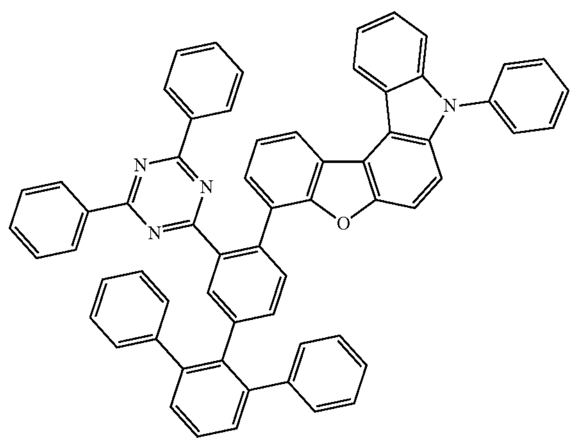
819
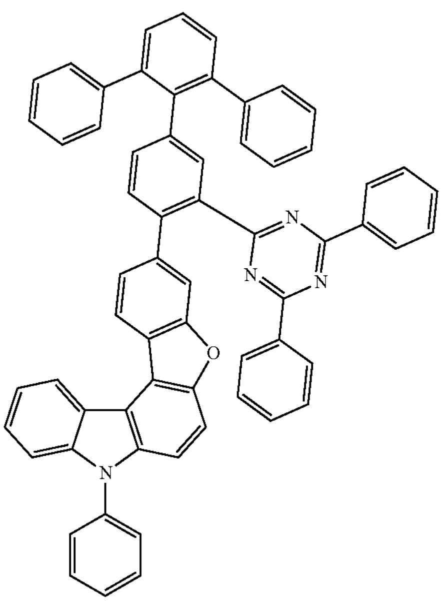

820
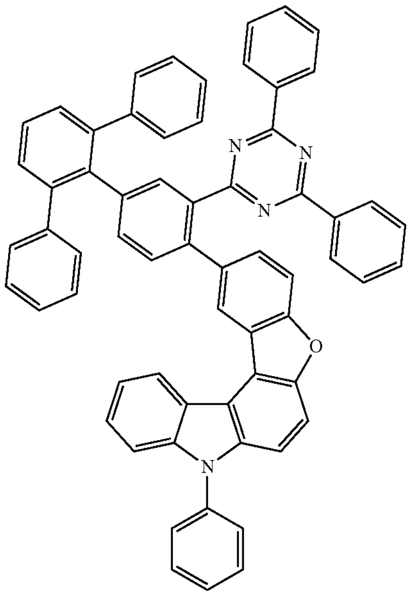
821
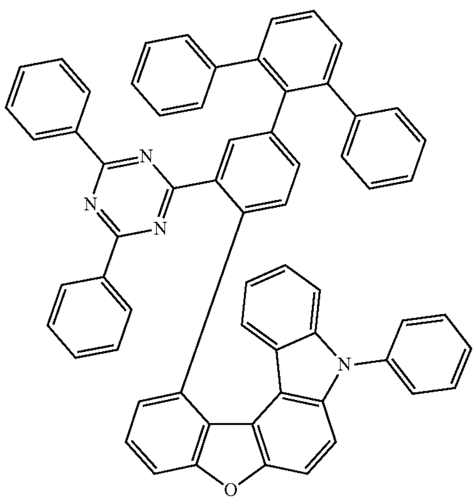
822
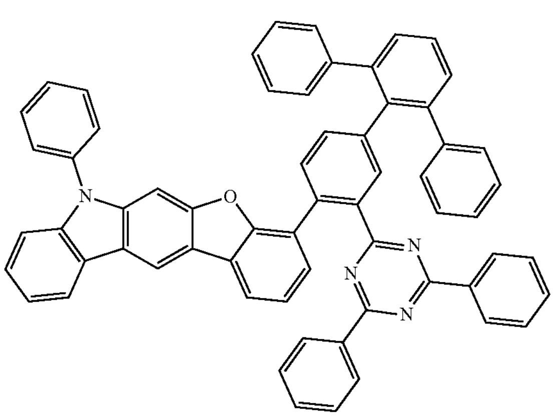
823
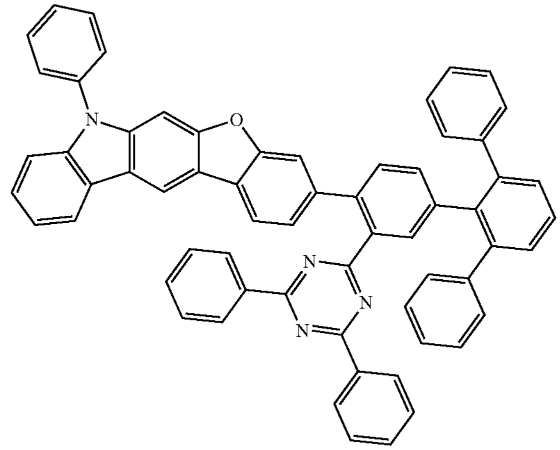
824
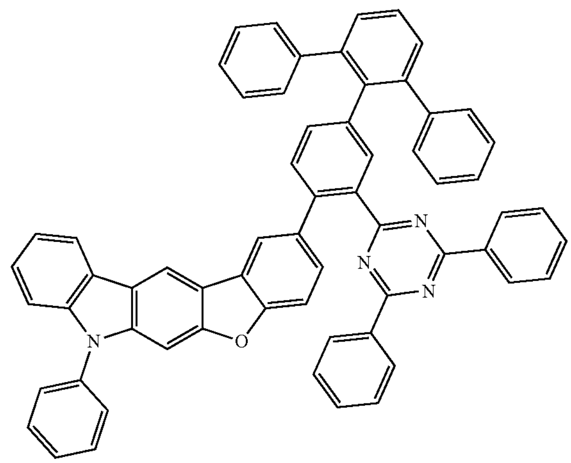
825
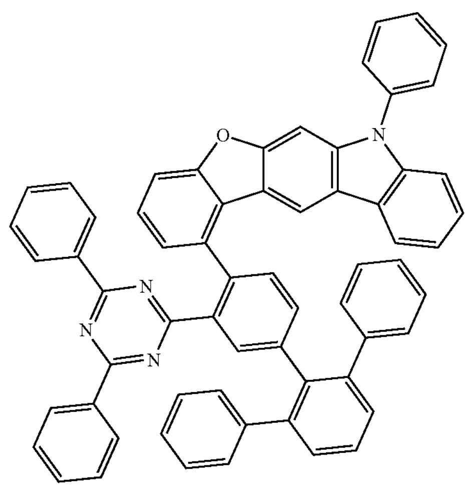

826
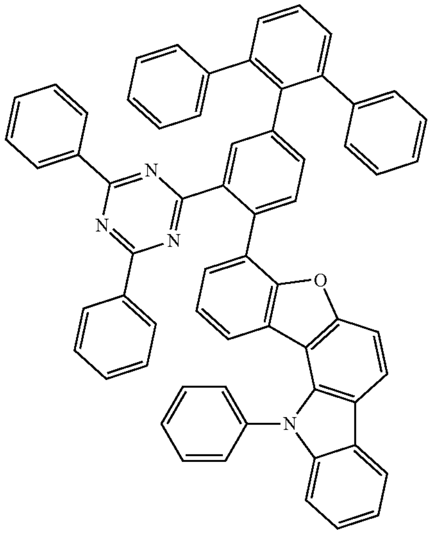
827
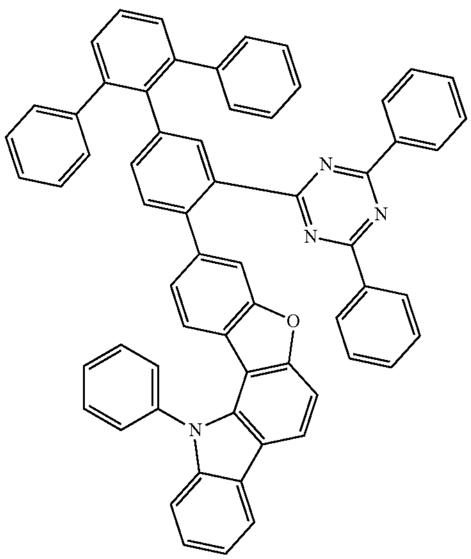
828
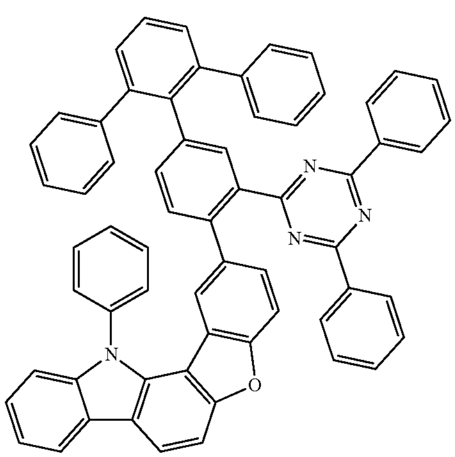
829
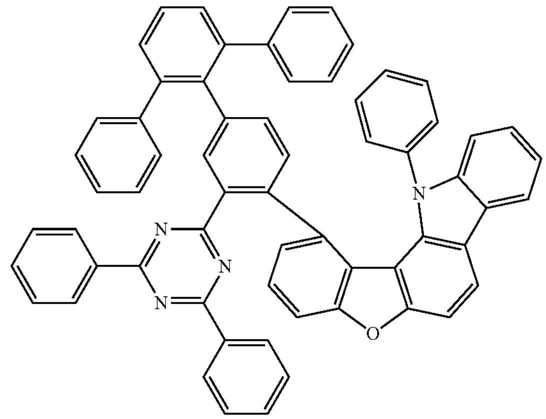
830
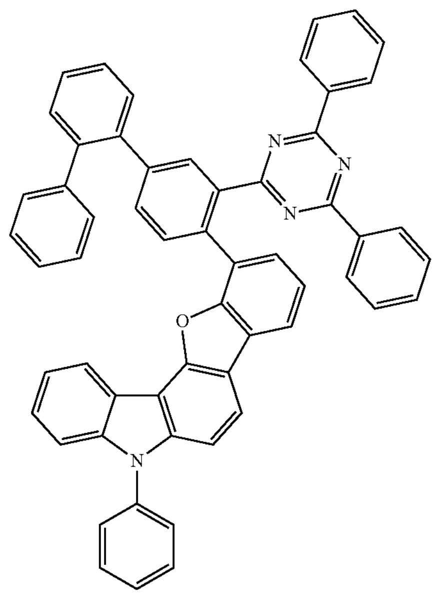
831
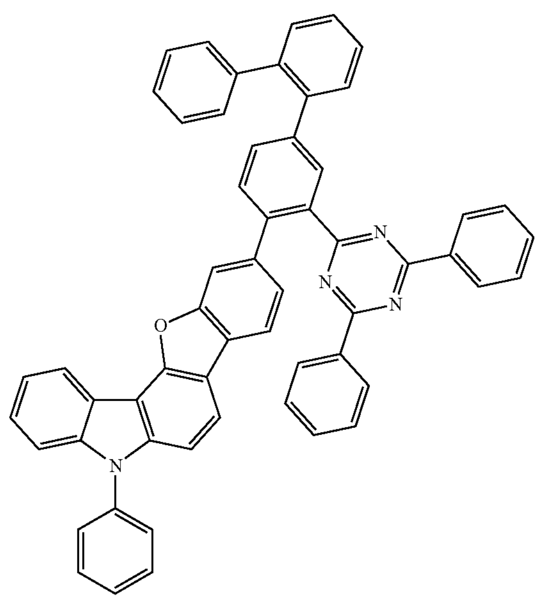

-continued
832
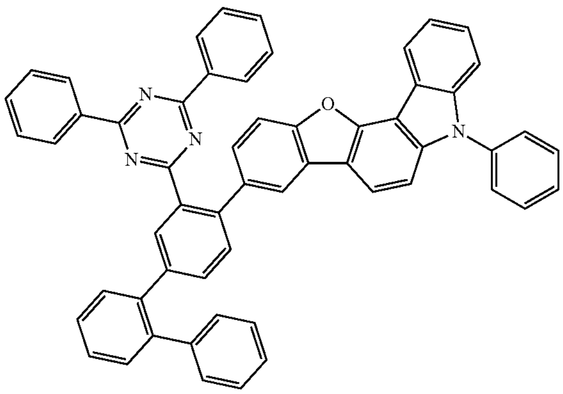
833
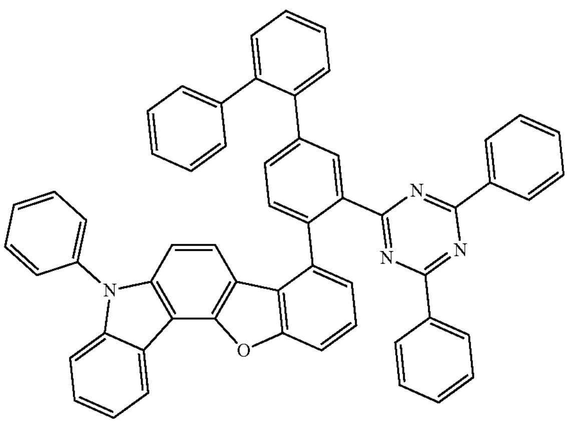
834
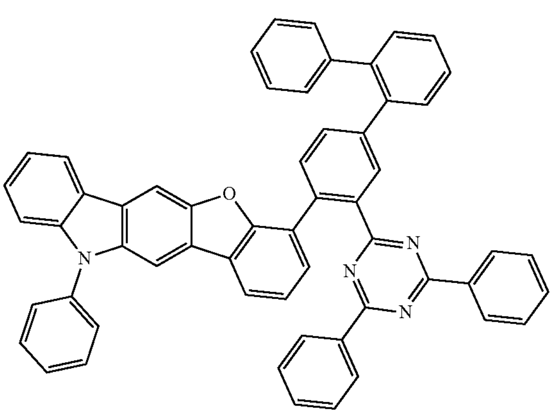
-continued
835
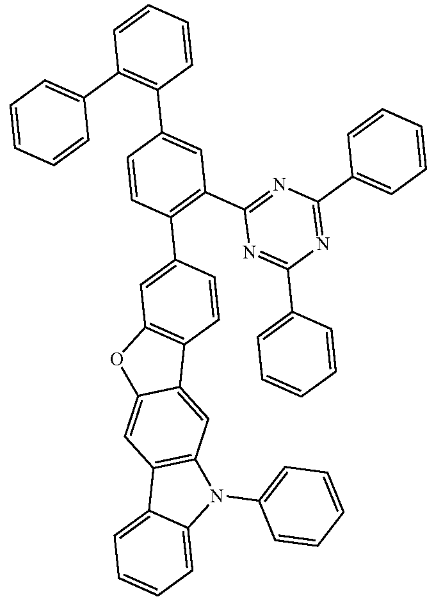
836
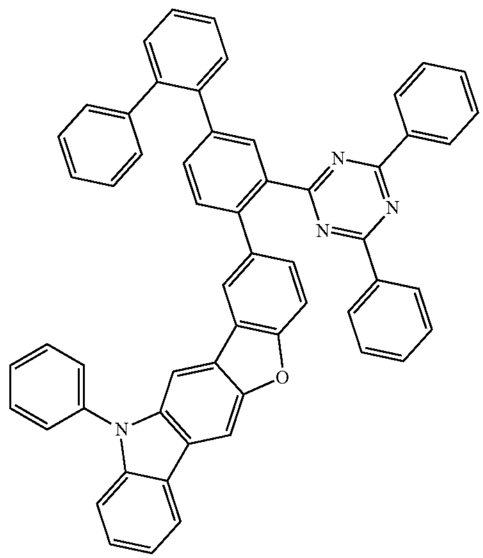
837
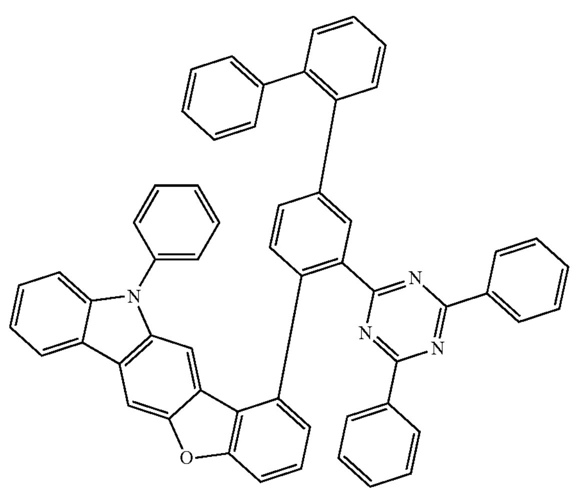

-continued
838
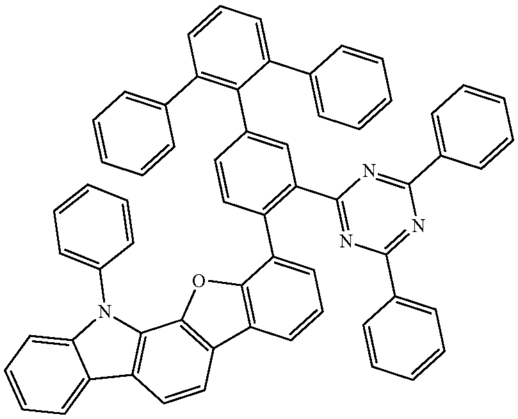
839
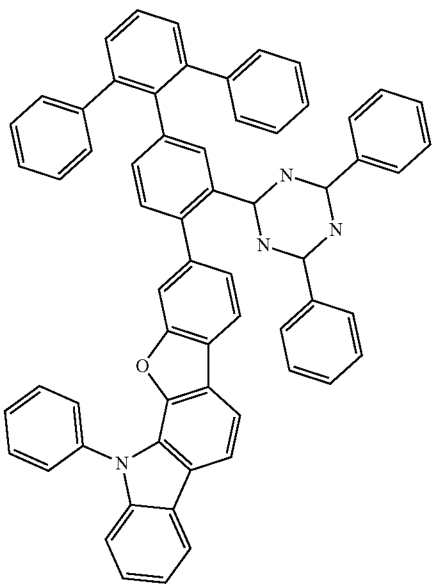
840
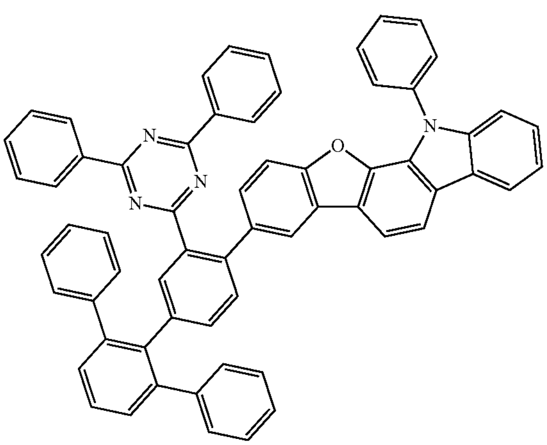
-continued
841
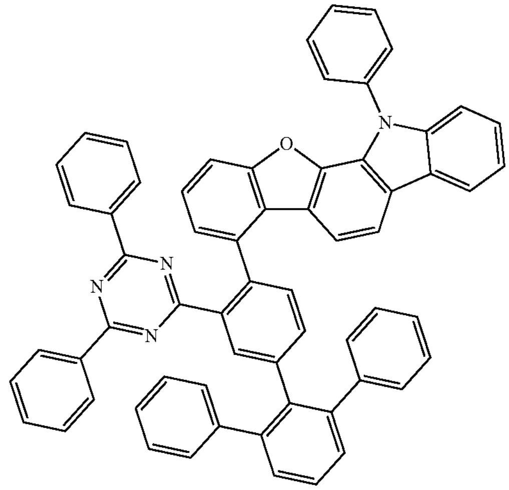
842
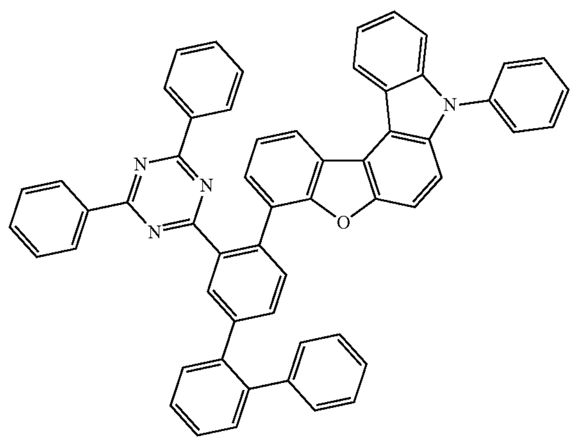
843
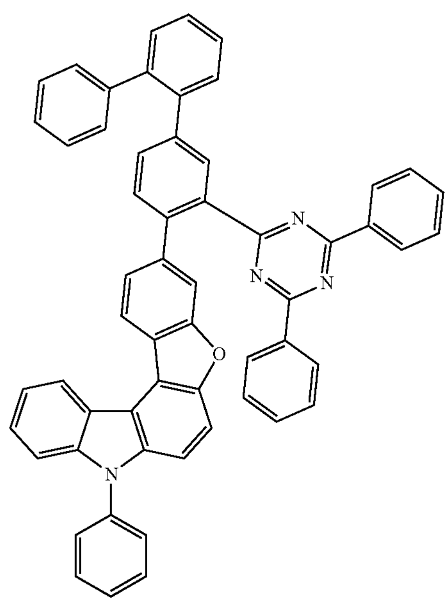

-continued
844
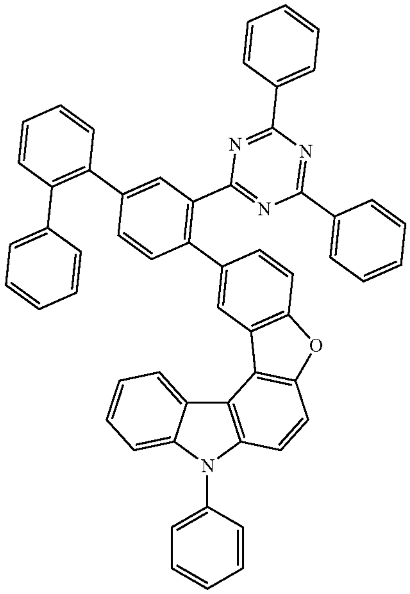
845
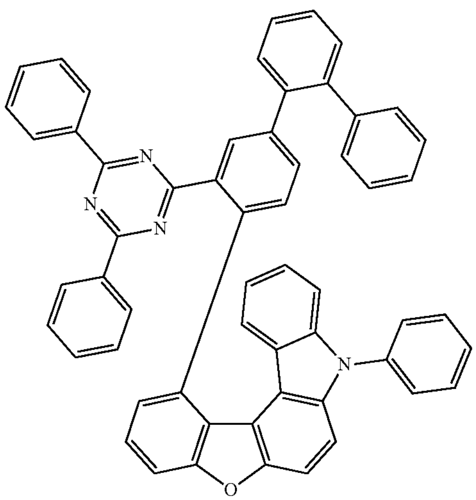
846
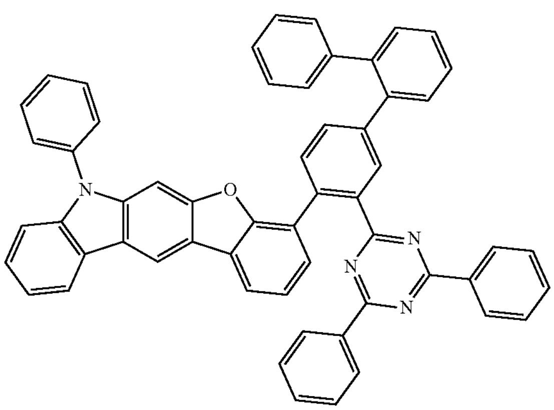
-continued
847
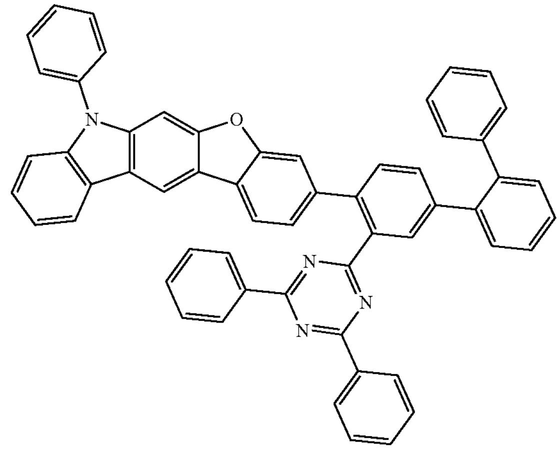
848
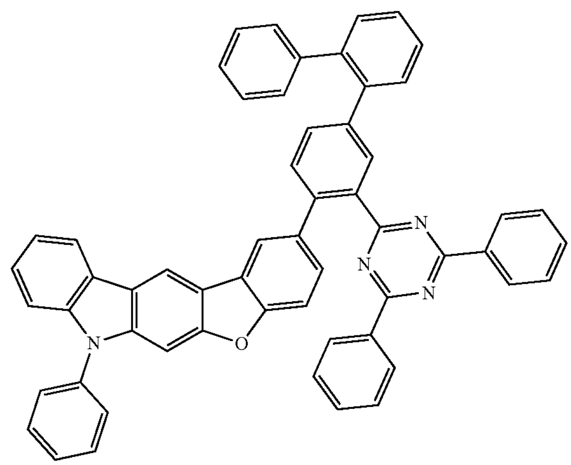
849
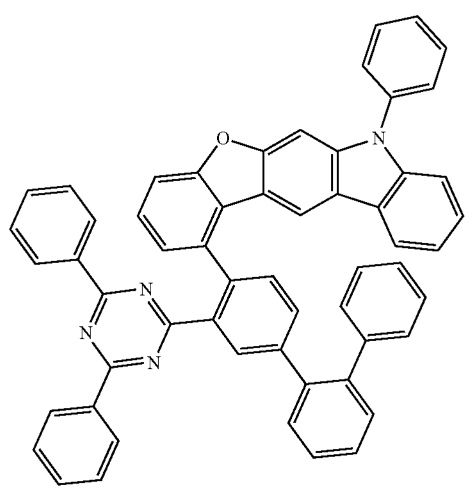

850
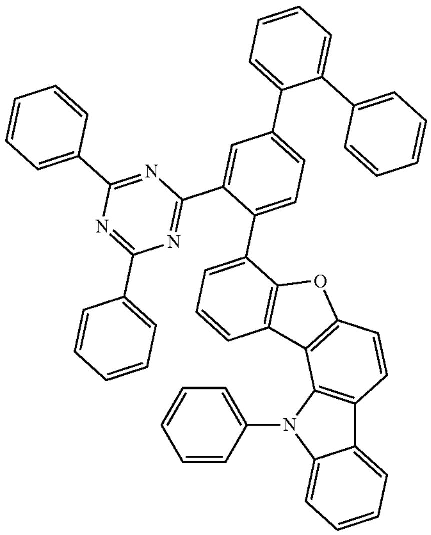
851
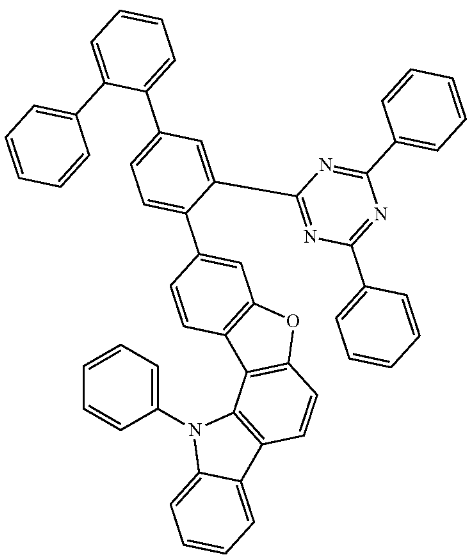
852
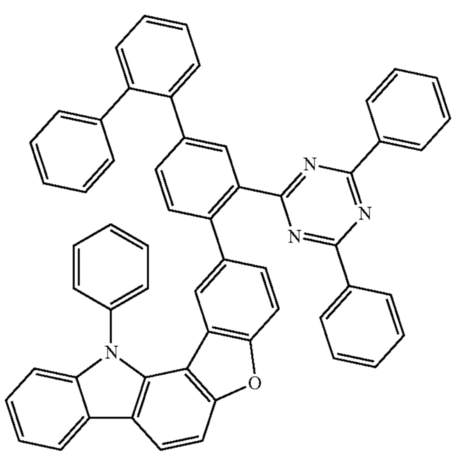
-continued
853
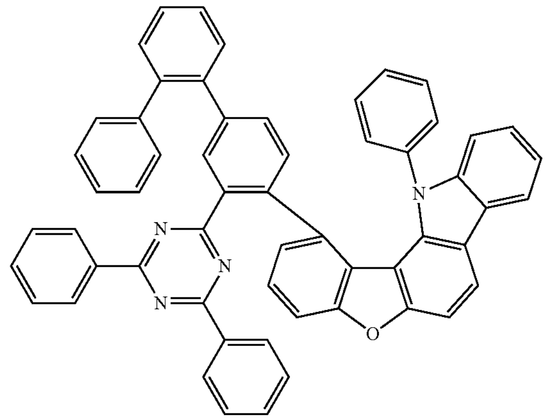
854
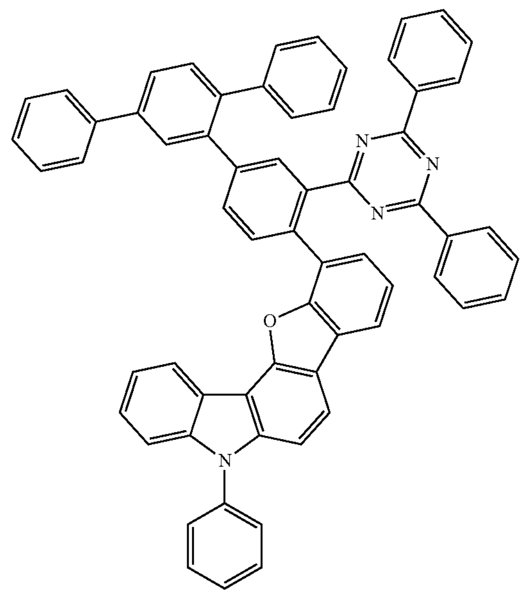
855
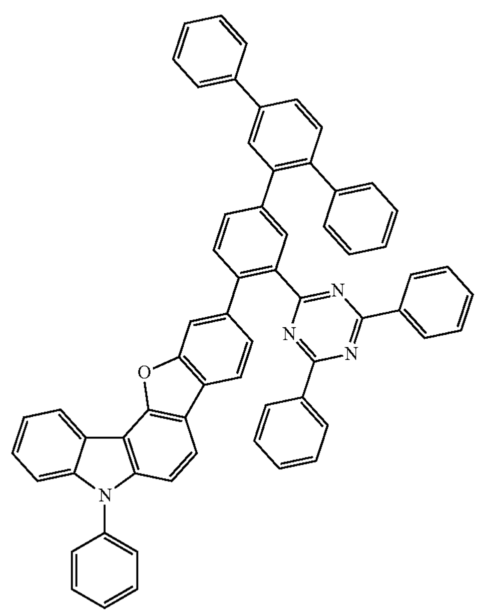

-continued
856
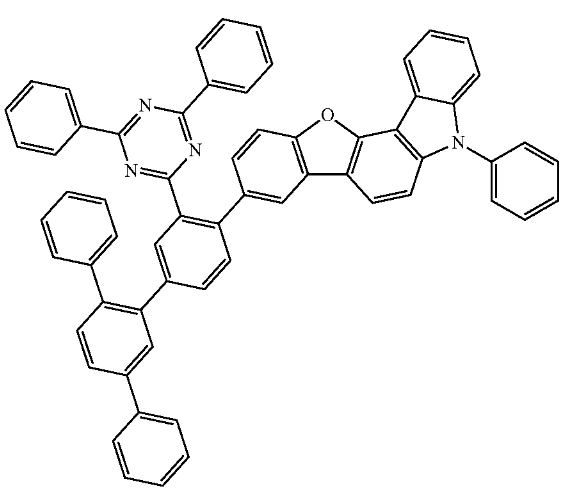
857
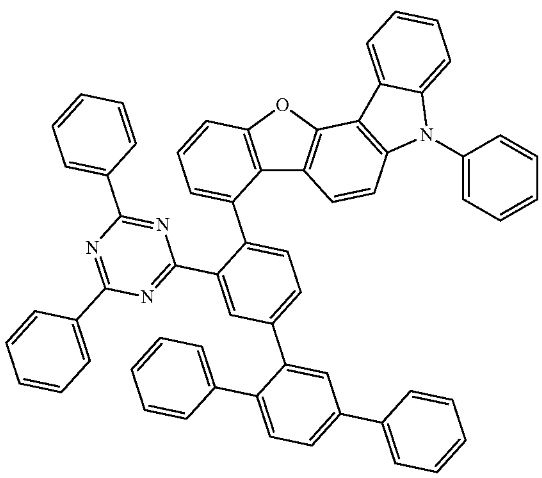
858
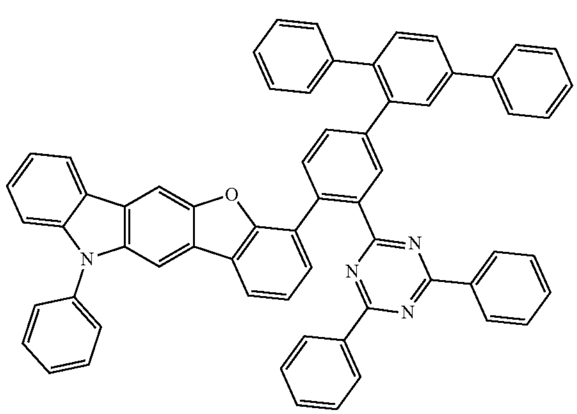
-continued
859
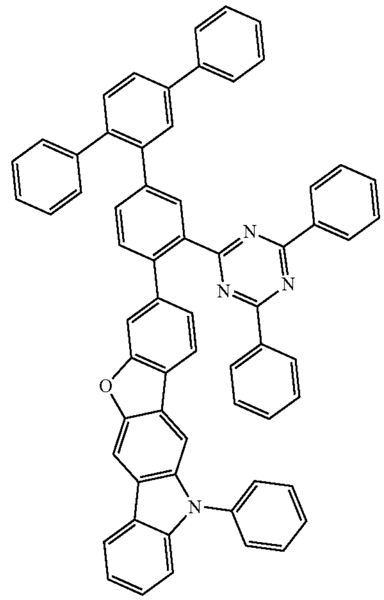
860
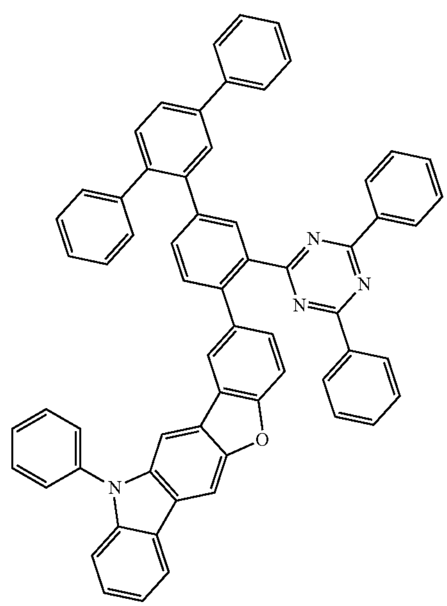

-continued
861
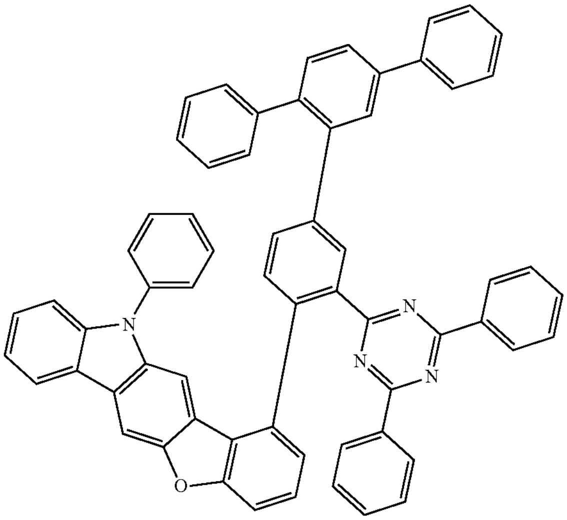
862
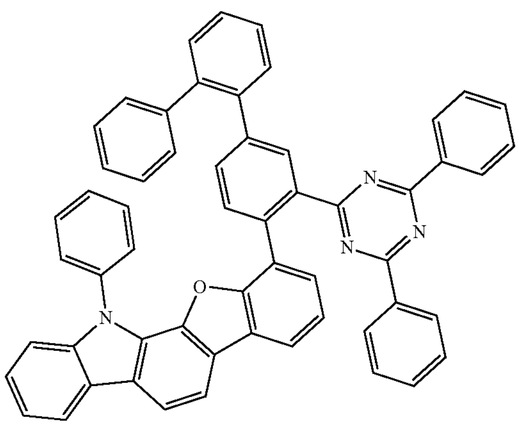
863
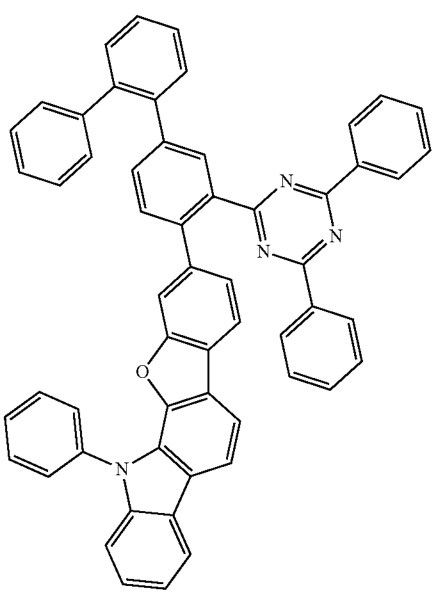
-continued
864
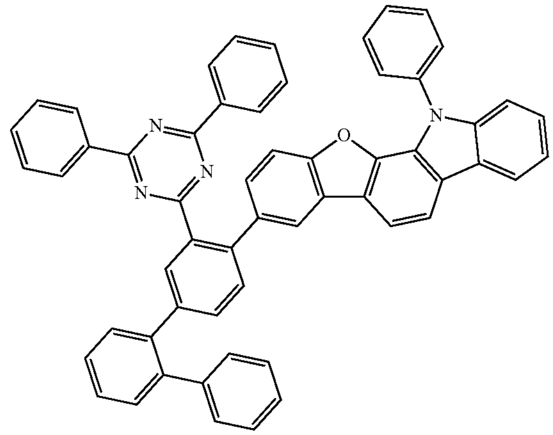
865
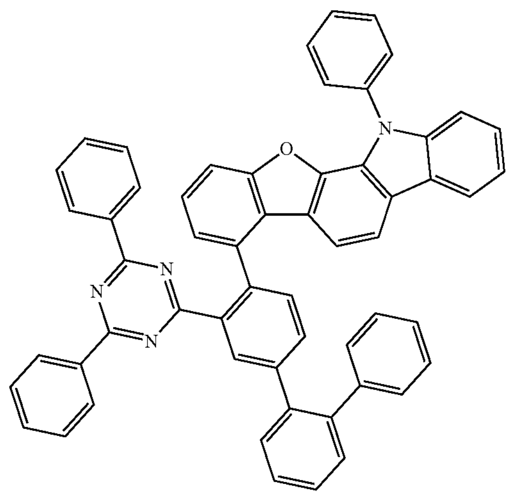
866
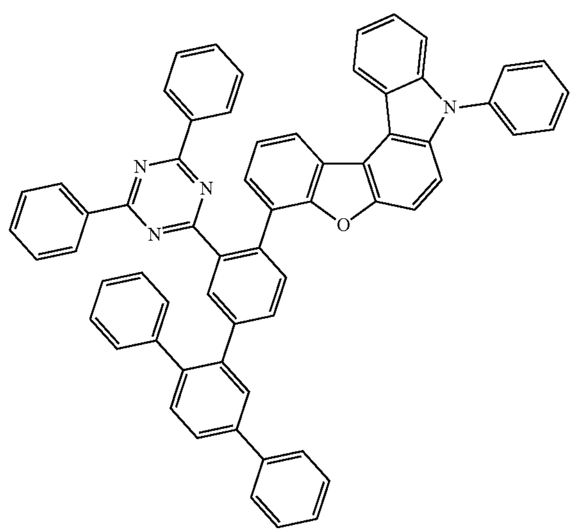

867
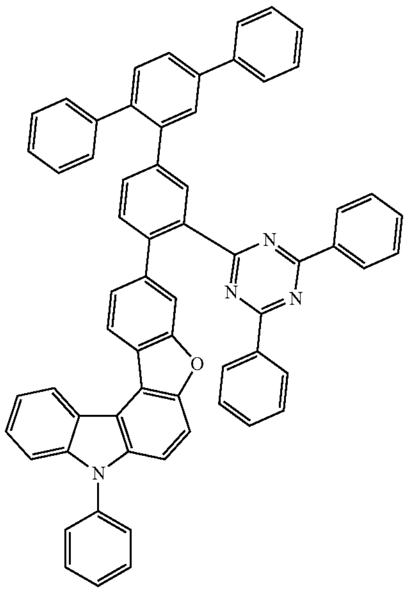
868
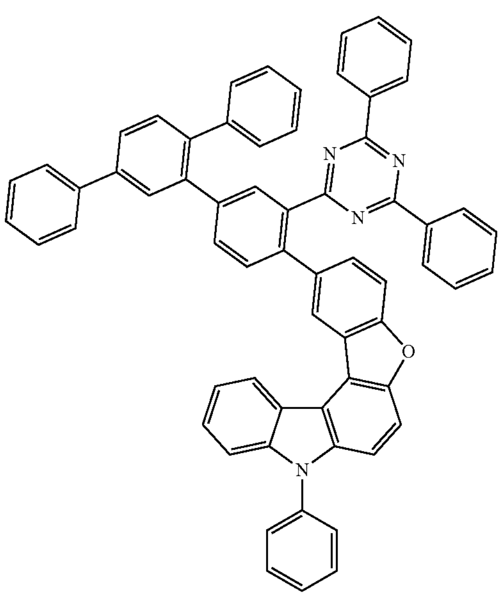
869
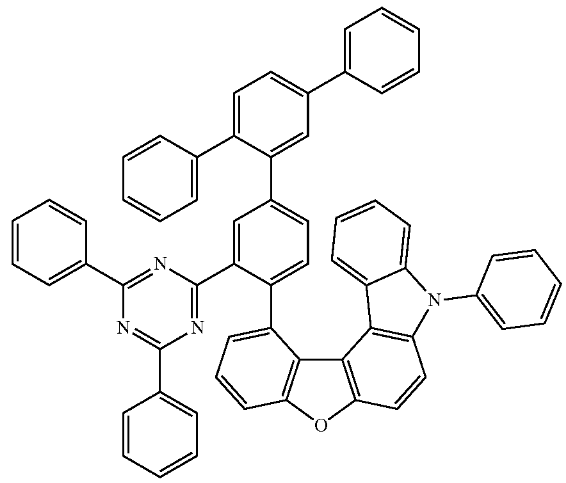
870
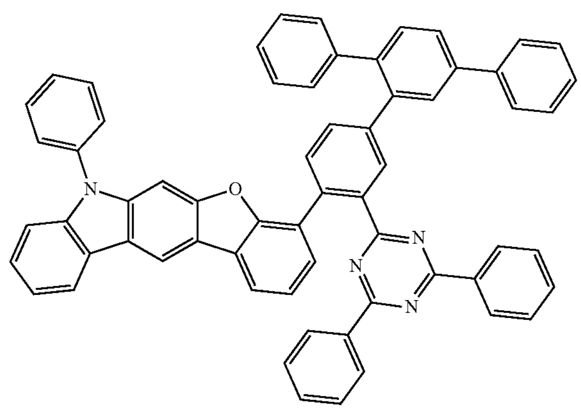
871
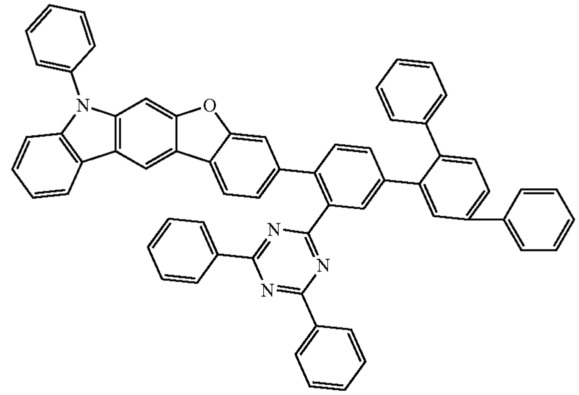

-continued
872
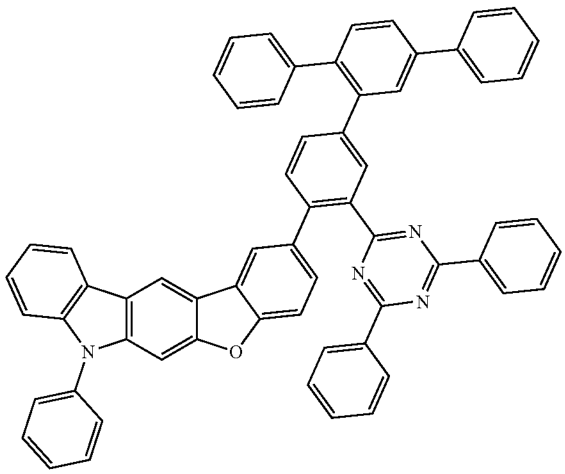
873
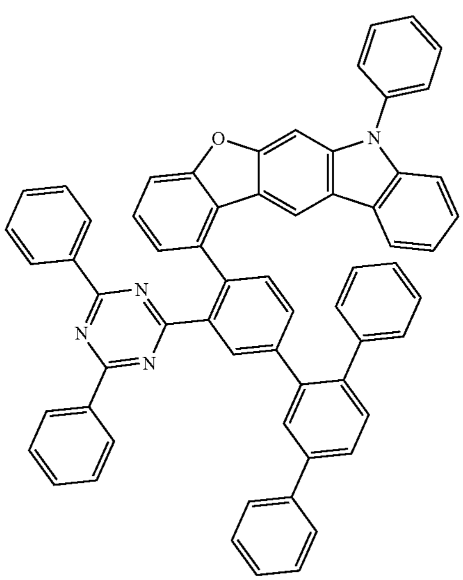
-continued
874
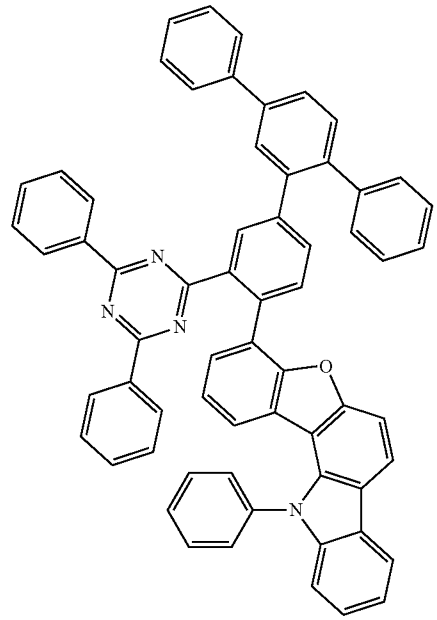
875
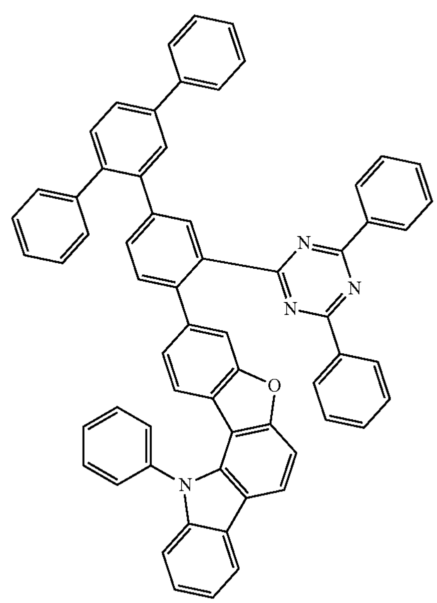

-continued
876
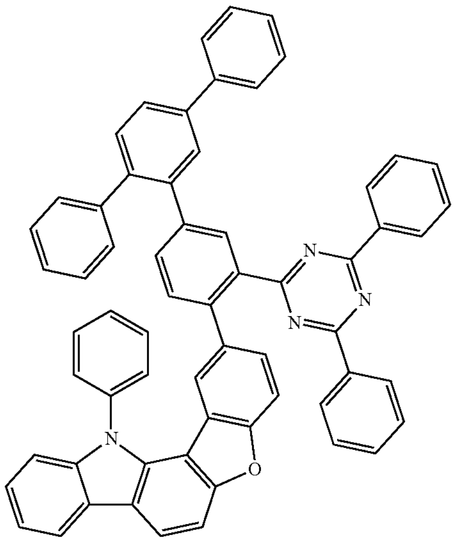
877
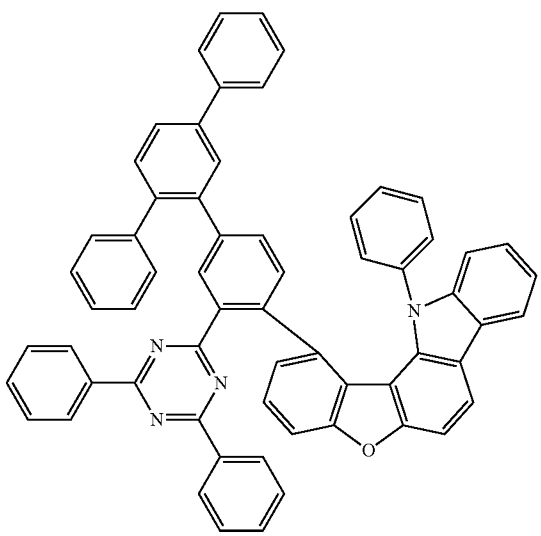
878
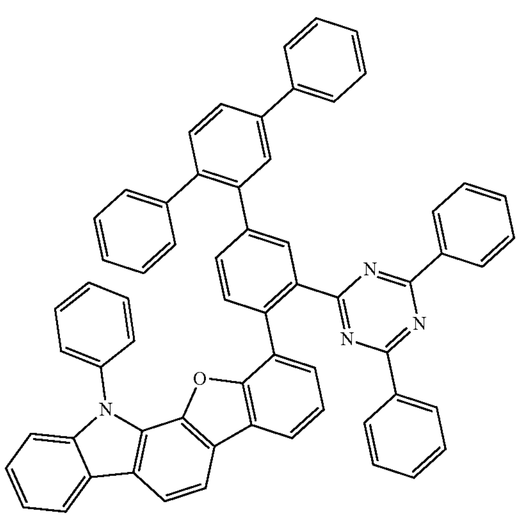
-continued
879
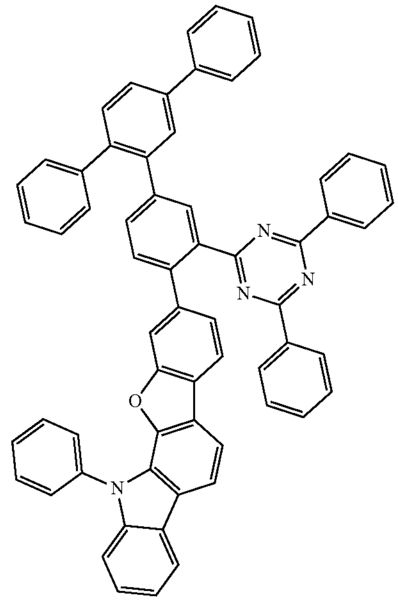
880
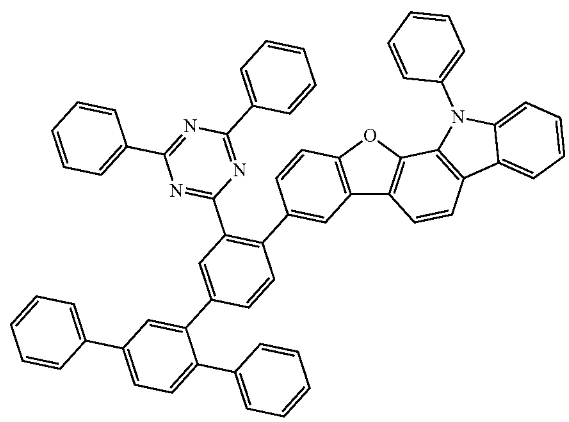
881
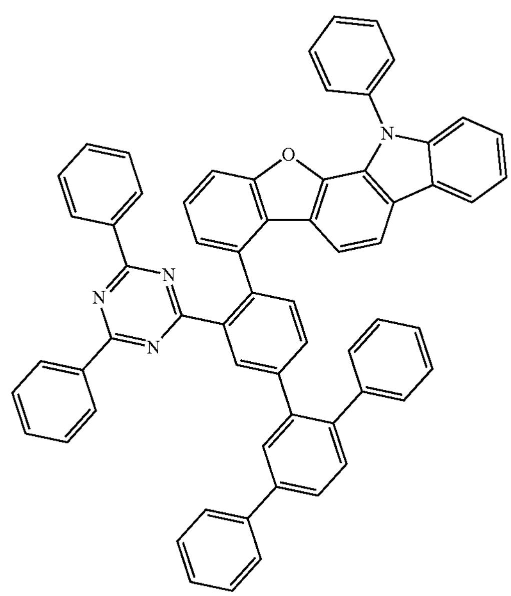

882
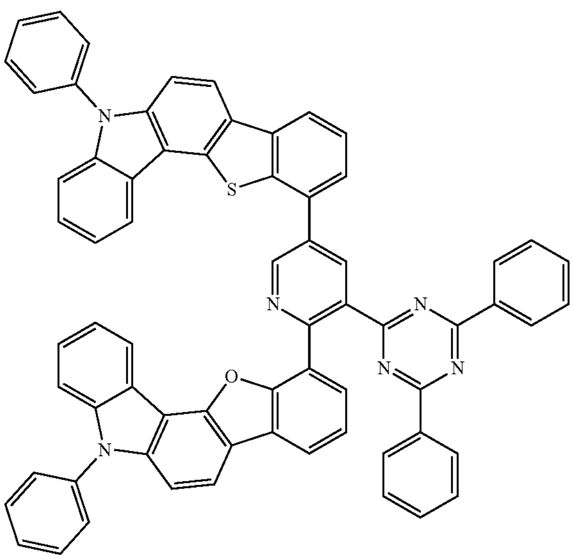
883
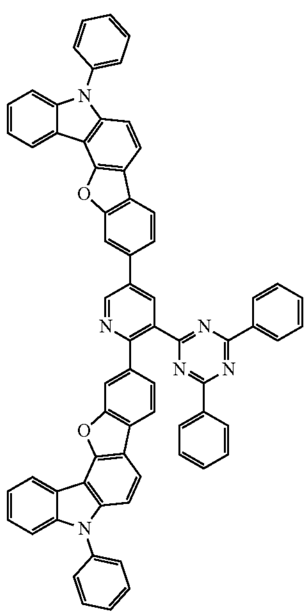
884
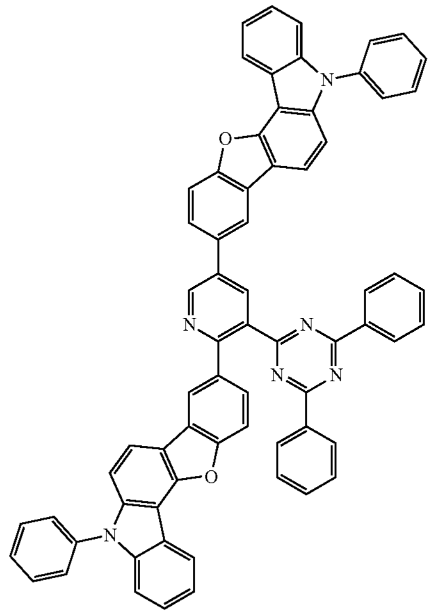
885
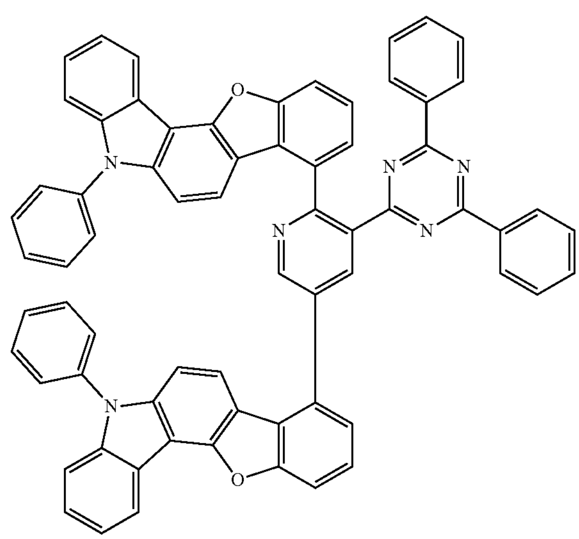

886
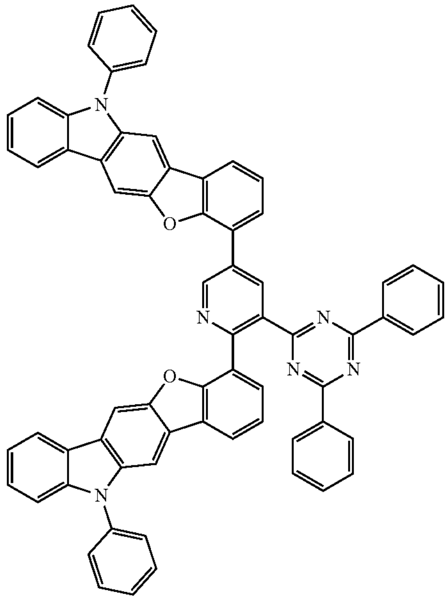
887
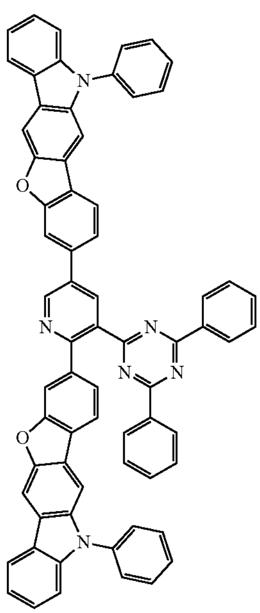
888
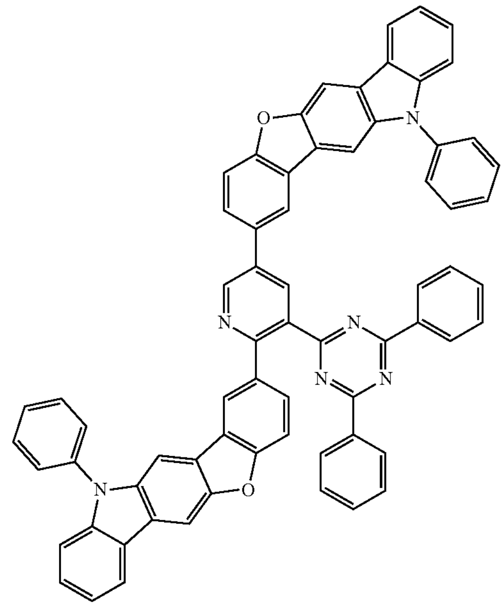
889
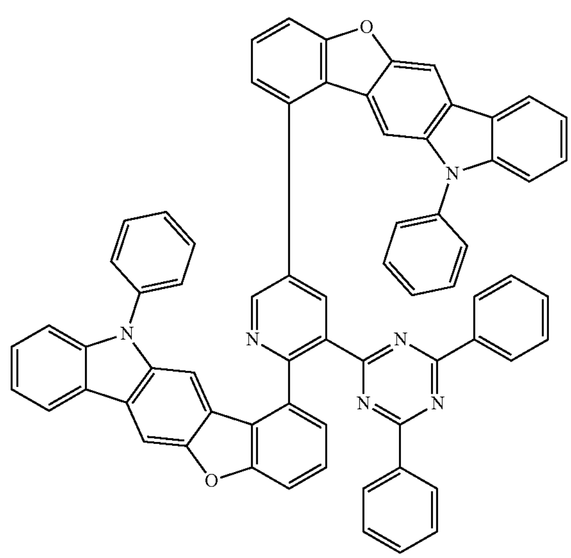

-continued
890
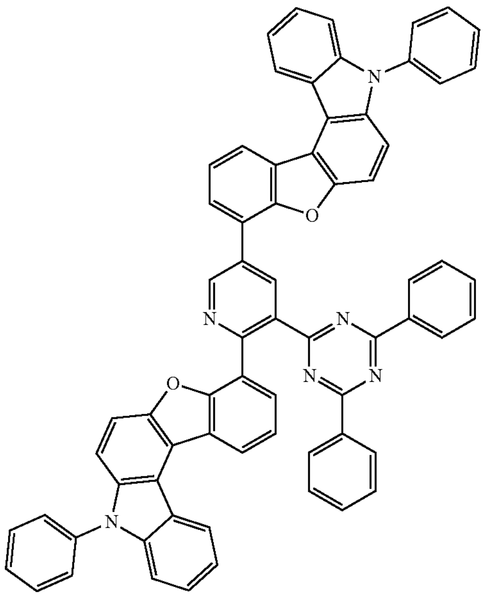
891
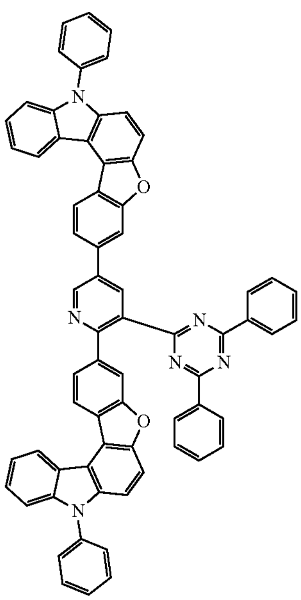
-continued
892
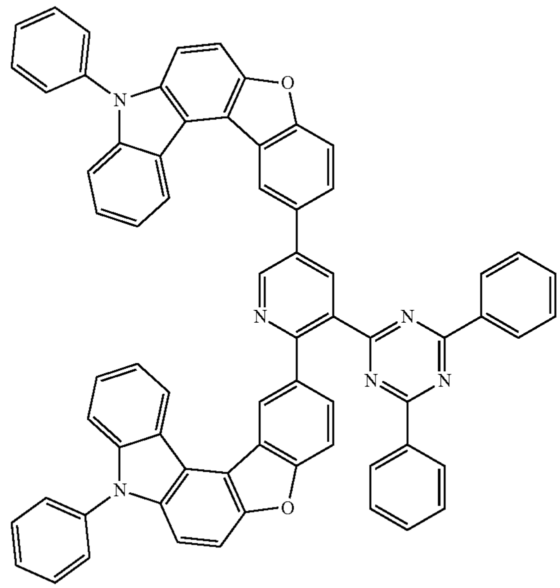
893
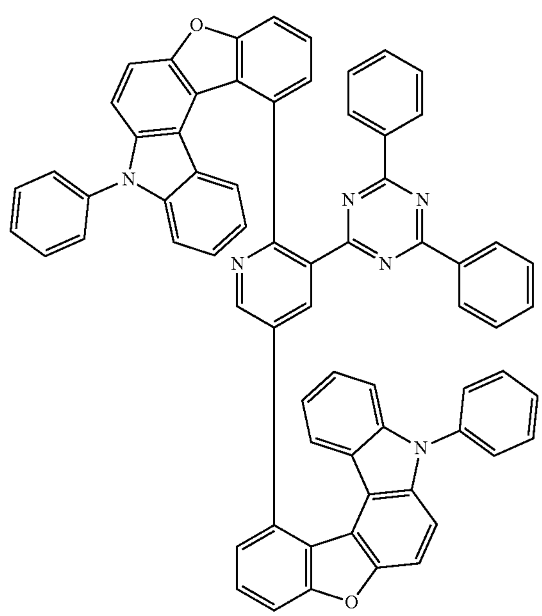

-continued
894
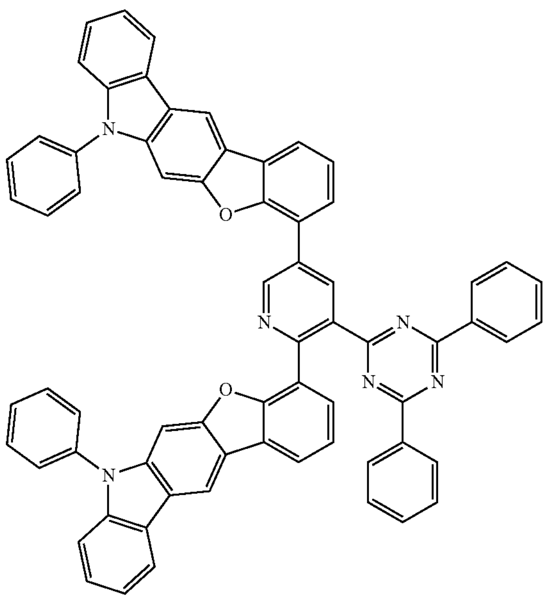
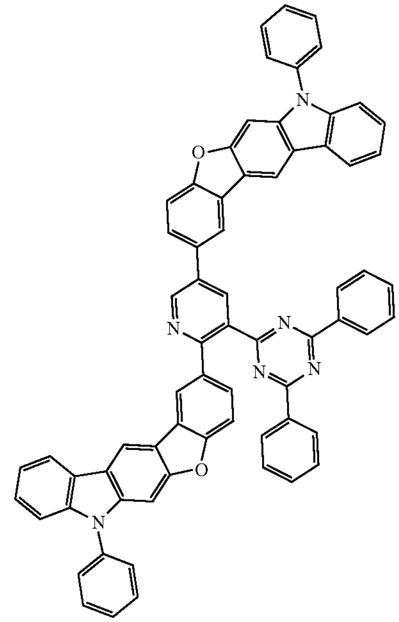
895
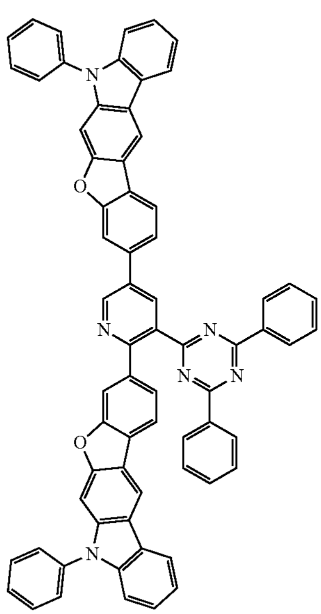
897
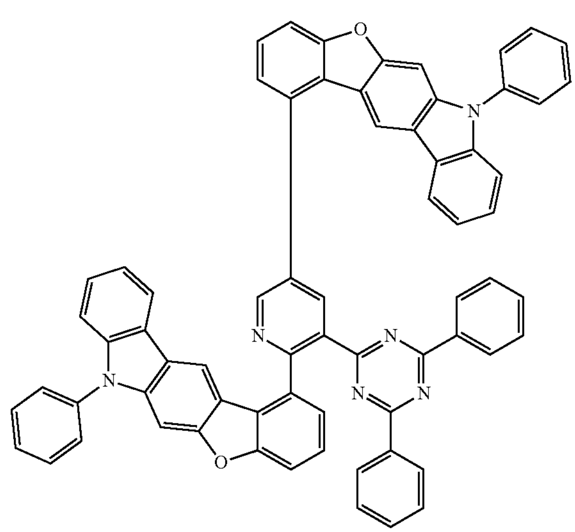

-continued
898
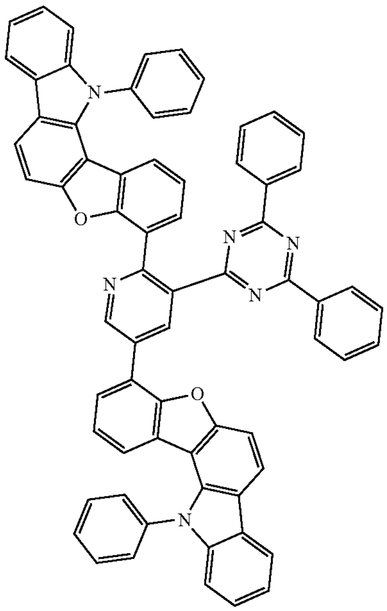
899
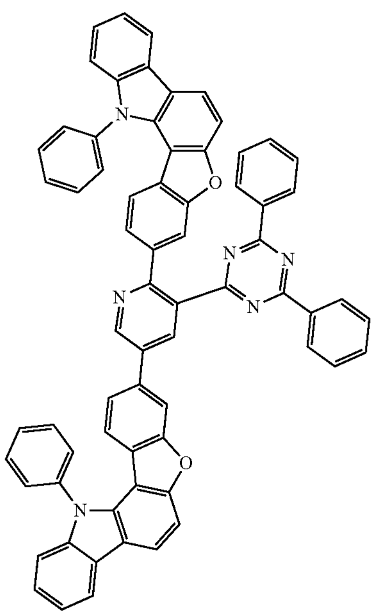
-continued
900
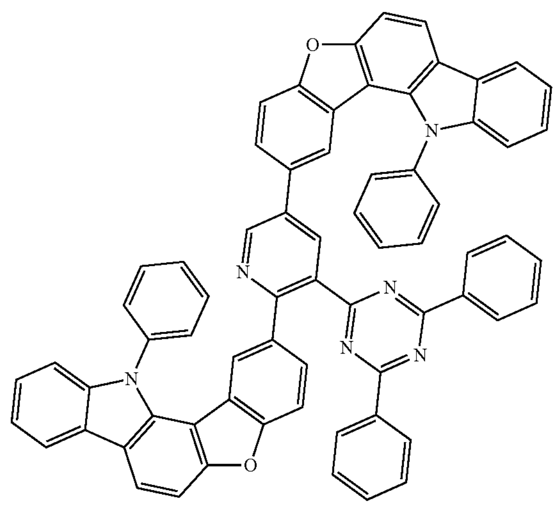
901
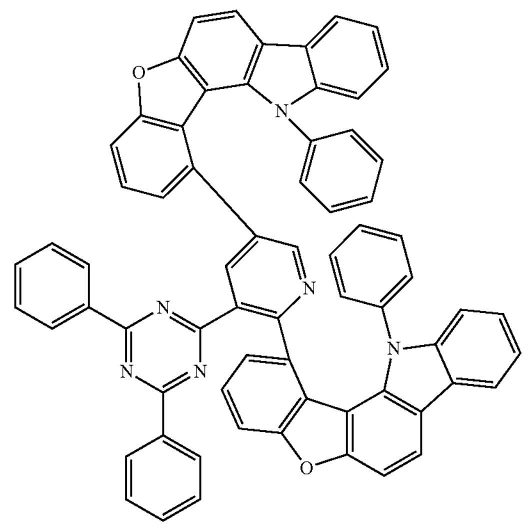
902
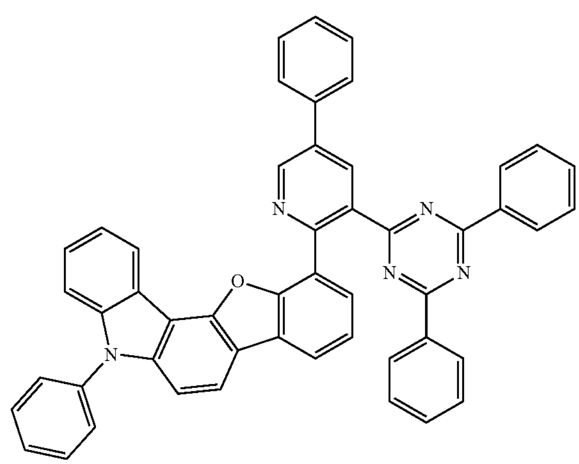

-continued
903
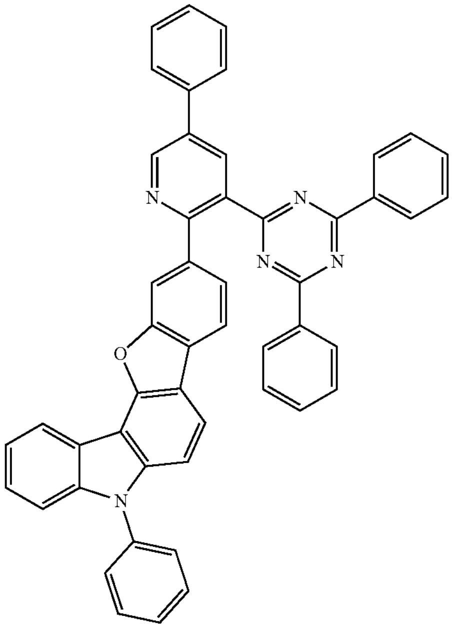
904
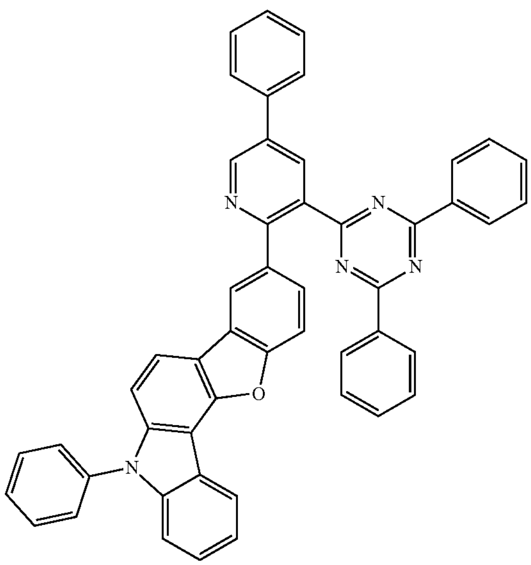
905
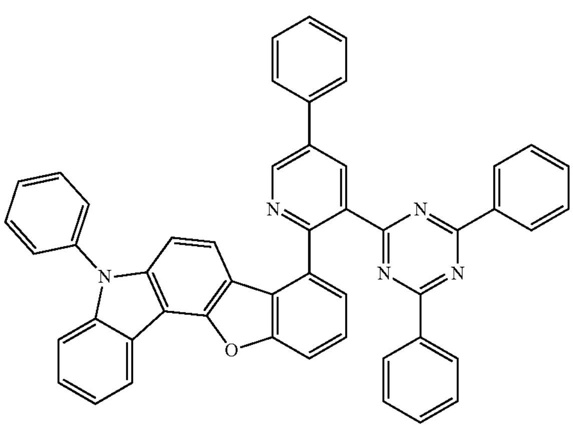
-continued
906
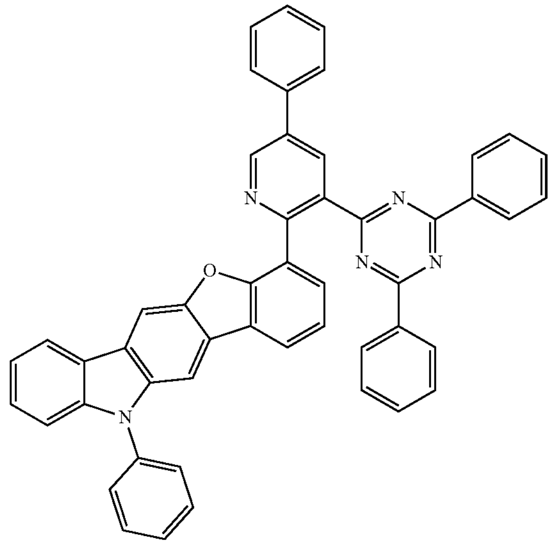
907
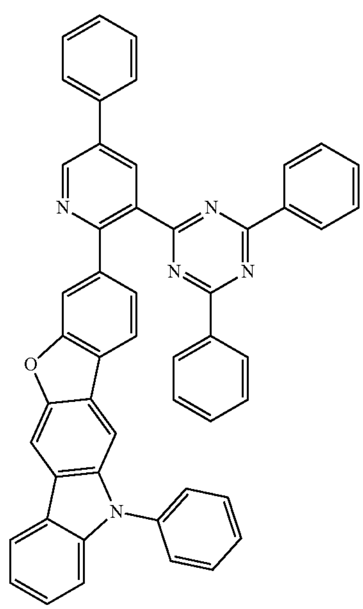

-continued
908
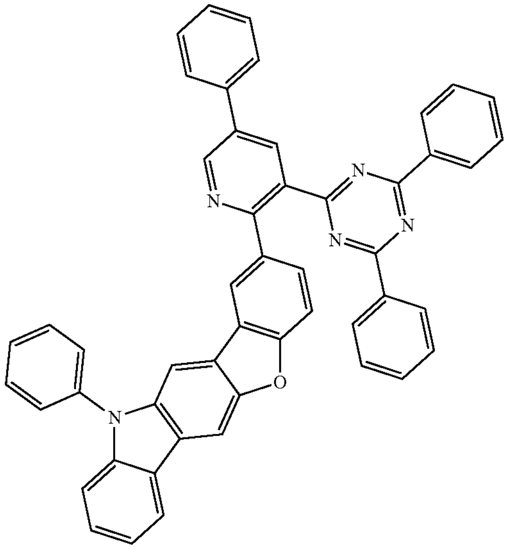
909
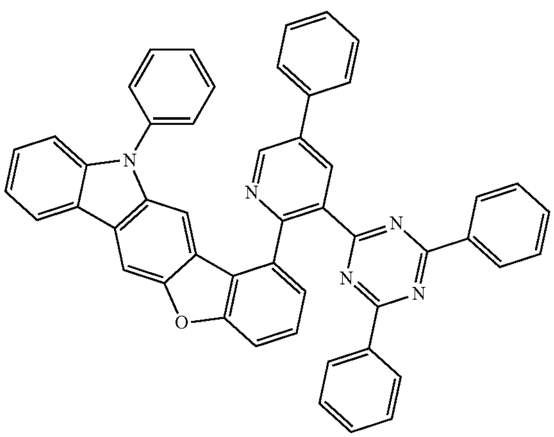
910
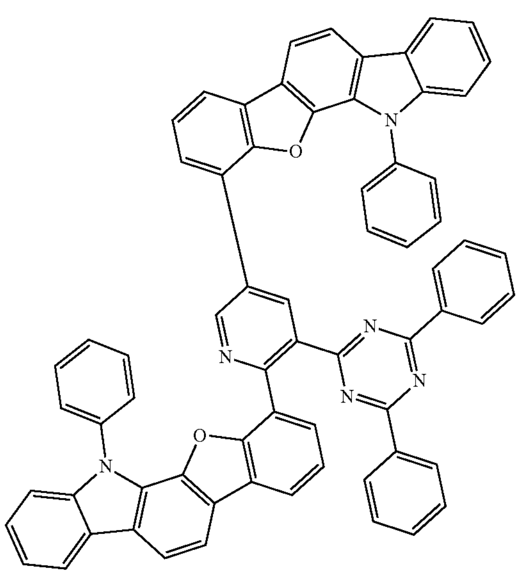
-continued
911
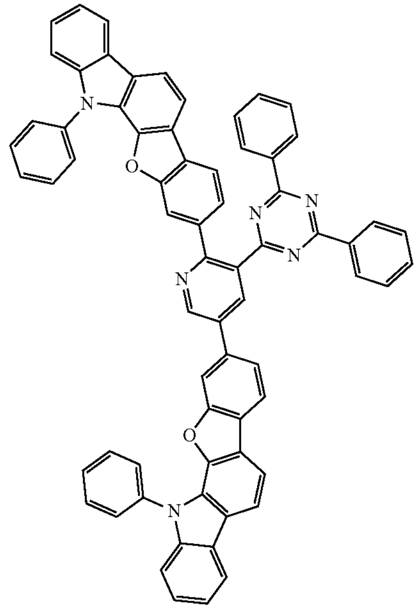
912
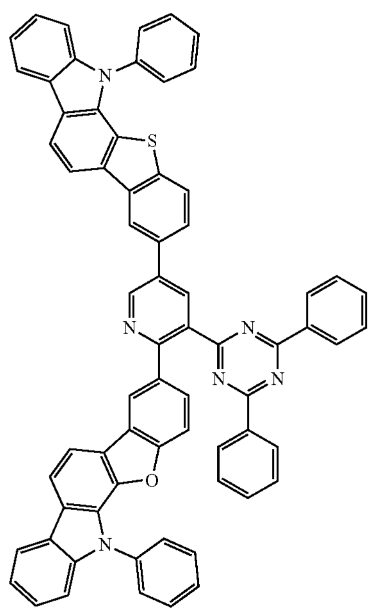

913
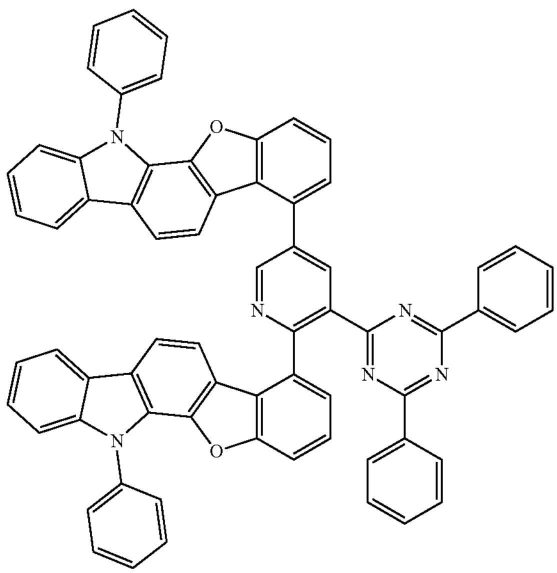
914
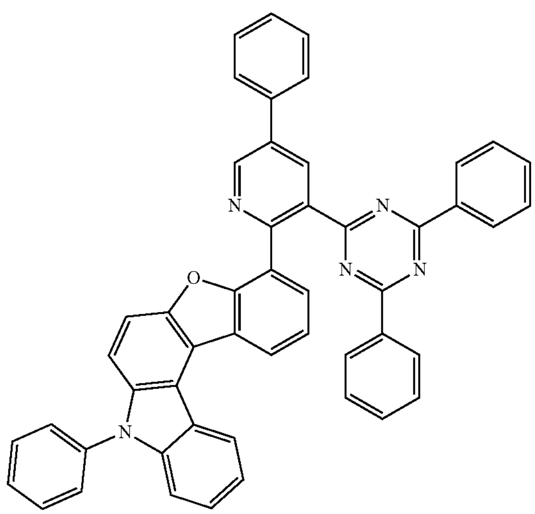
915
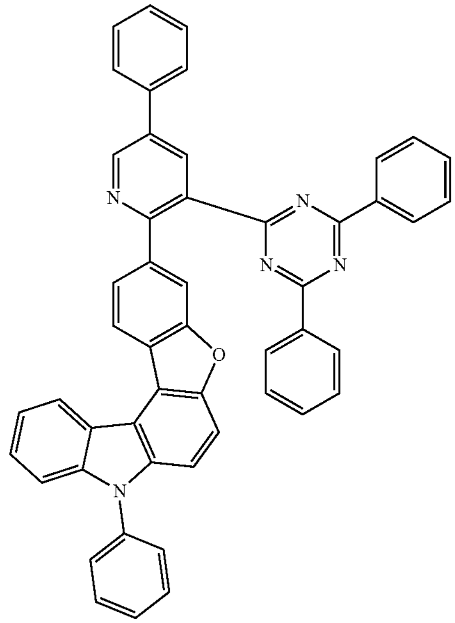
916
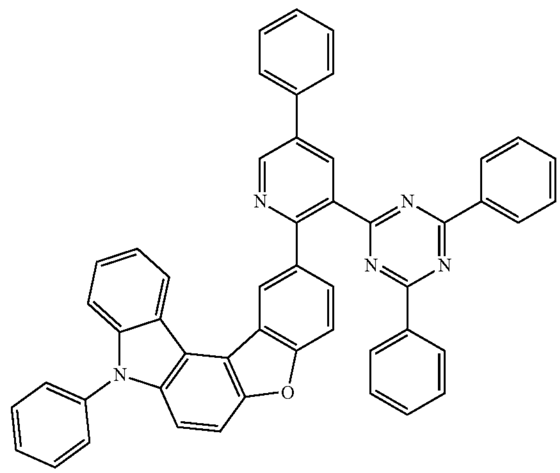
917
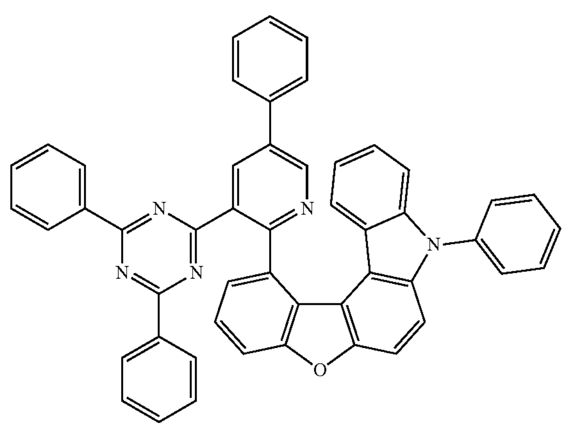

-continued
918
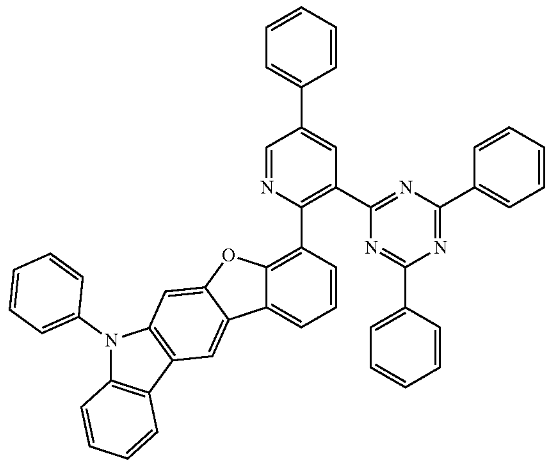
919
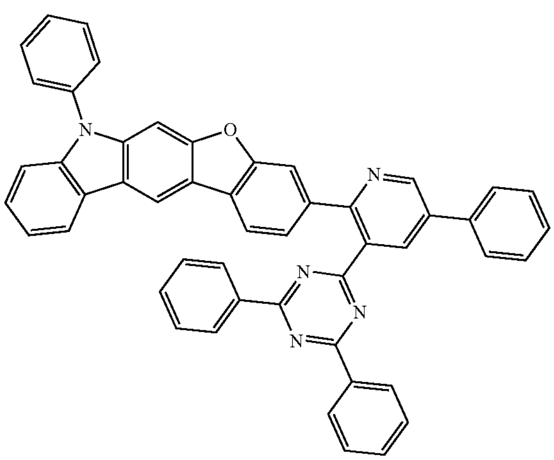
920
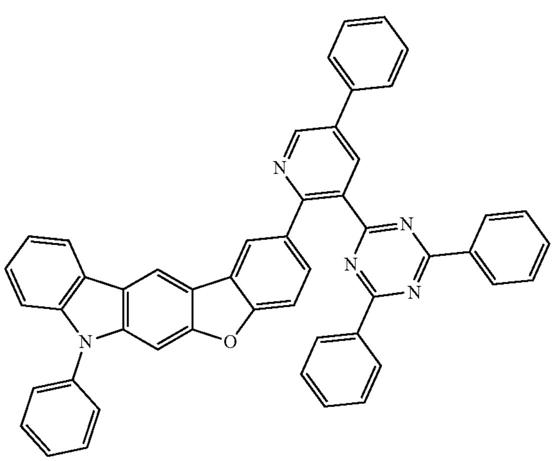
-continued
921
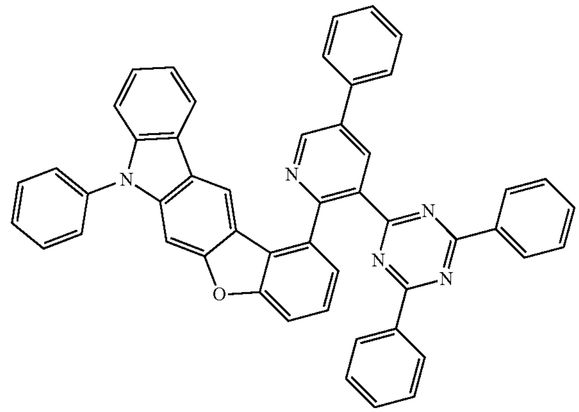
922
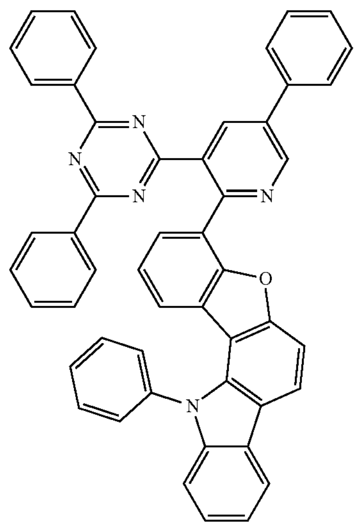
923
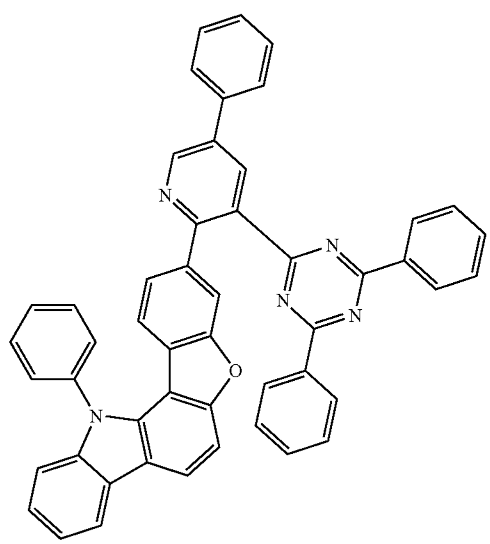

-continued
924
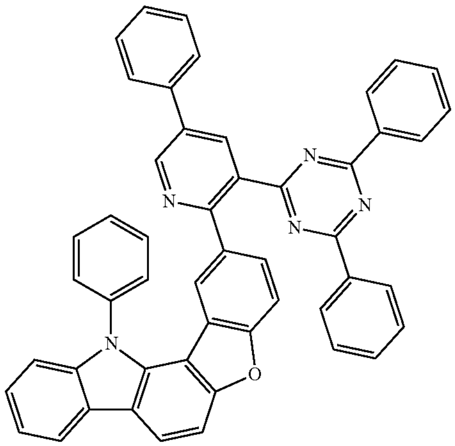
925
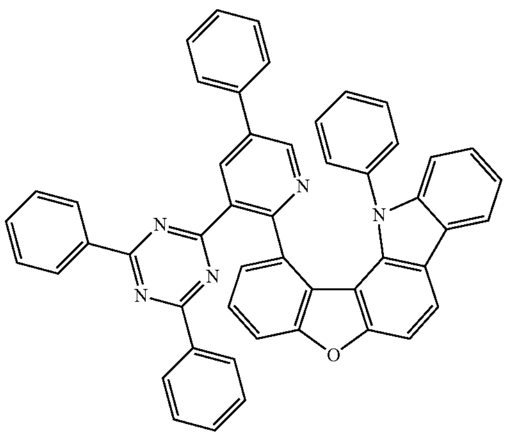
926
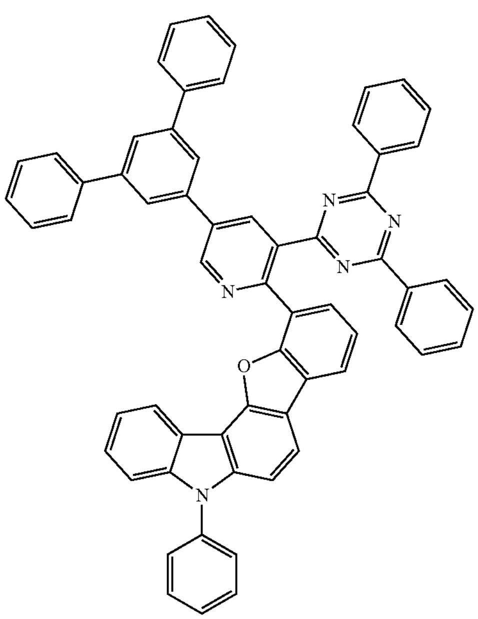
-continued
927
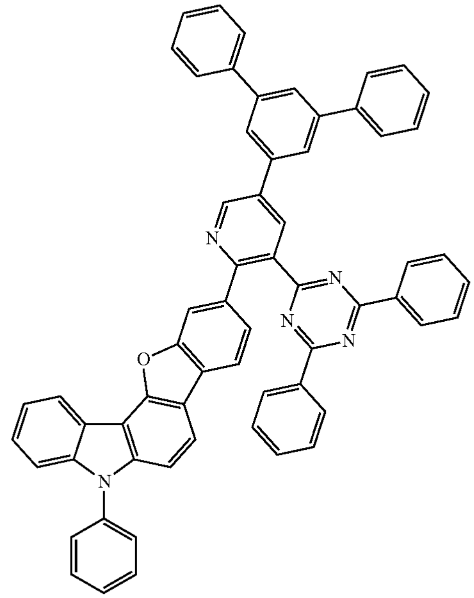
928
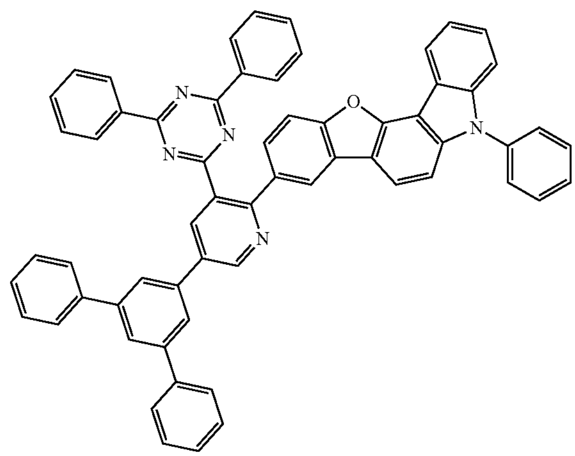
929
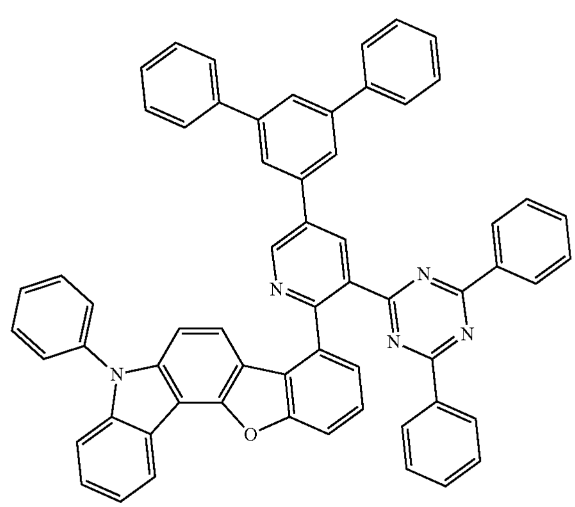

930
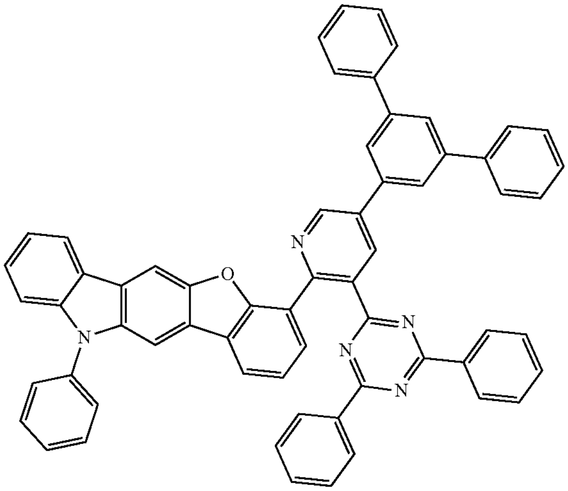
931
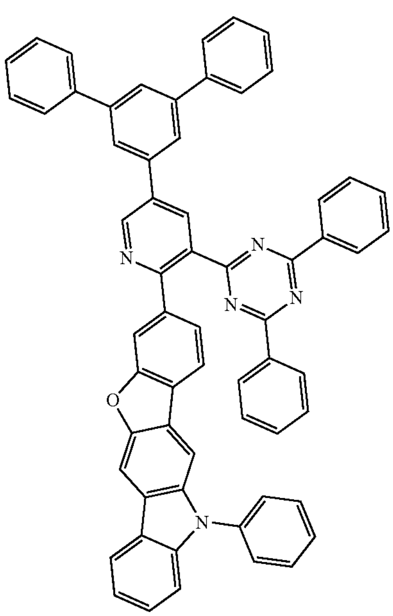
932
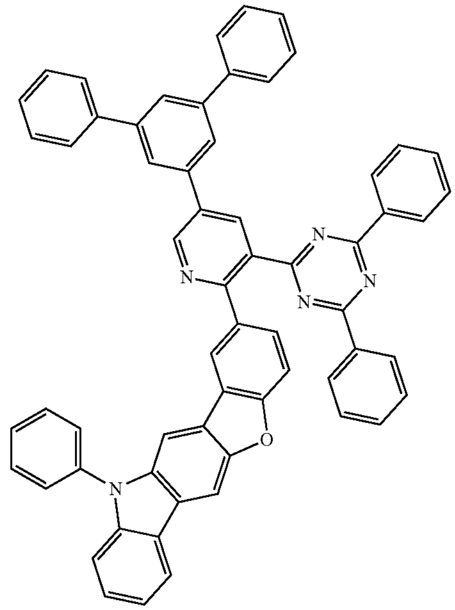
933
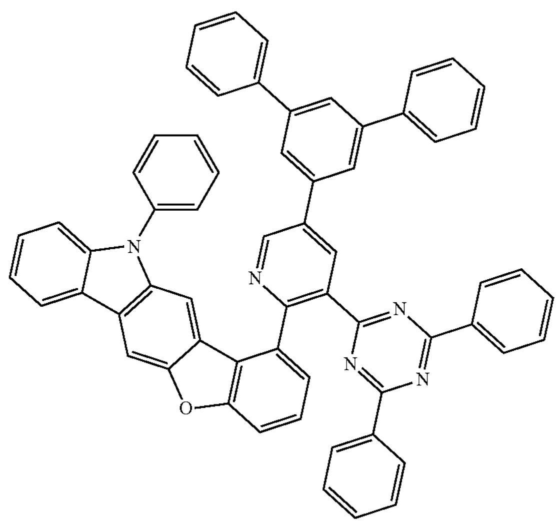
934
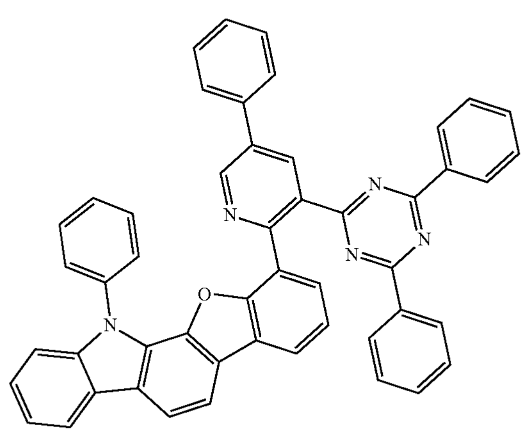

-continued
935
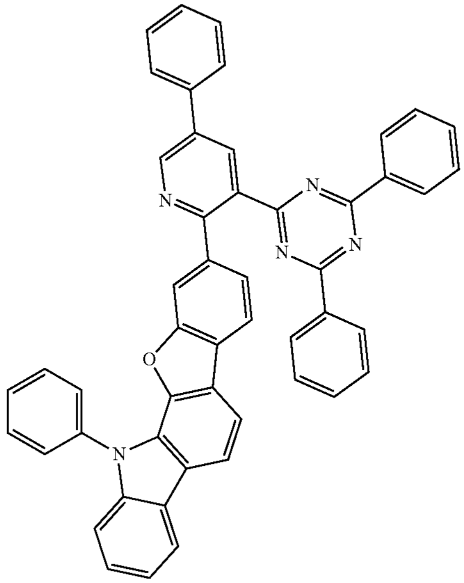
936
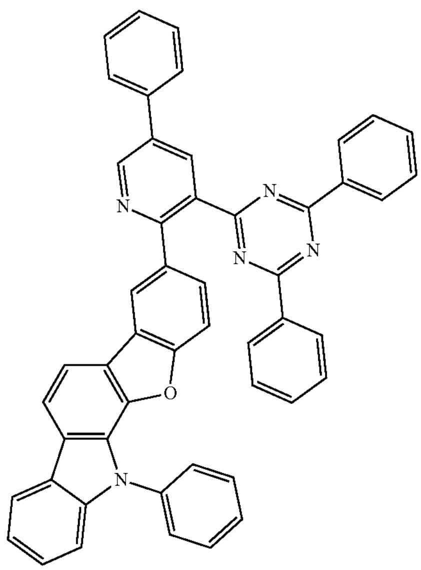
937
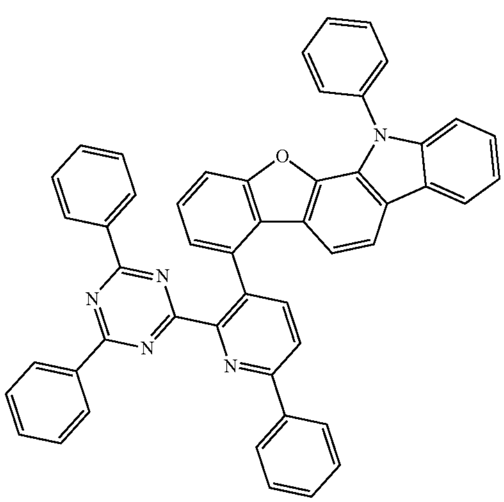
-continued
938
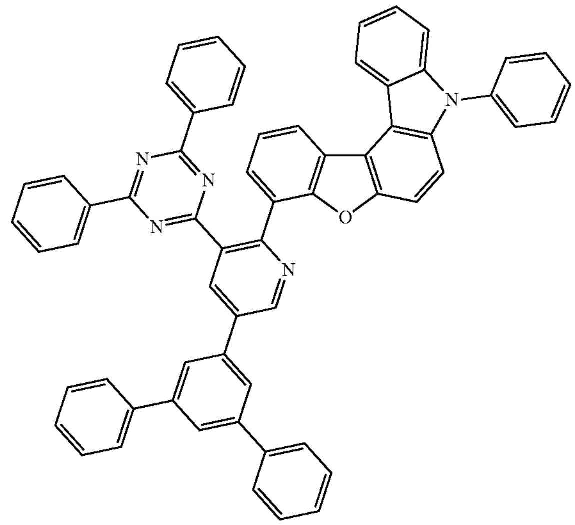
939
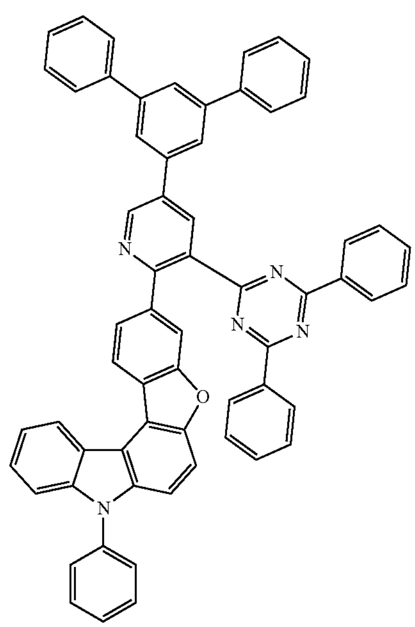

-continued
940
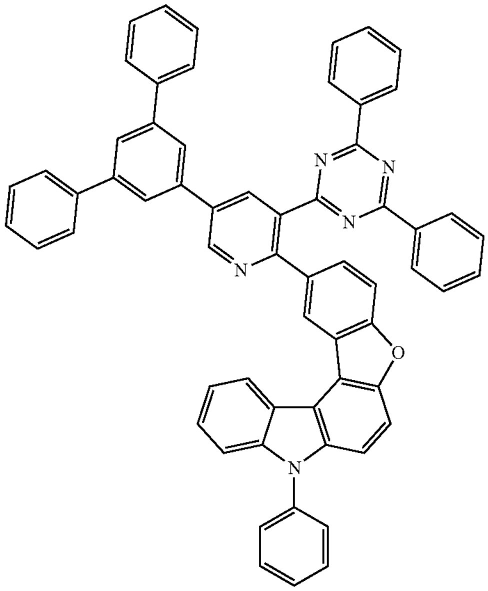
941
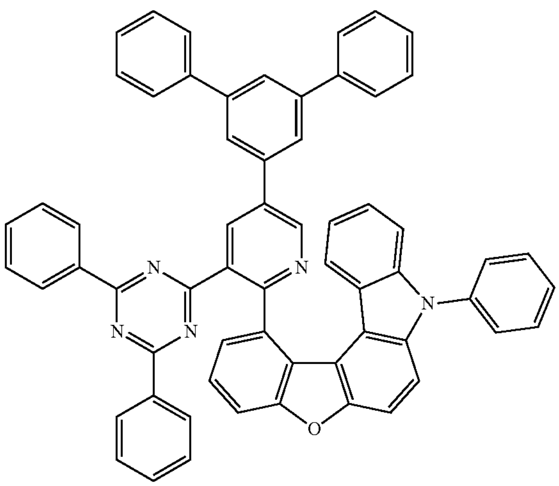
942
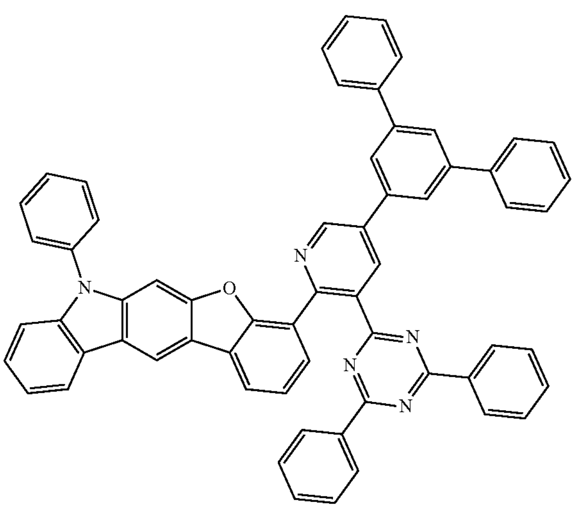
-continued
943
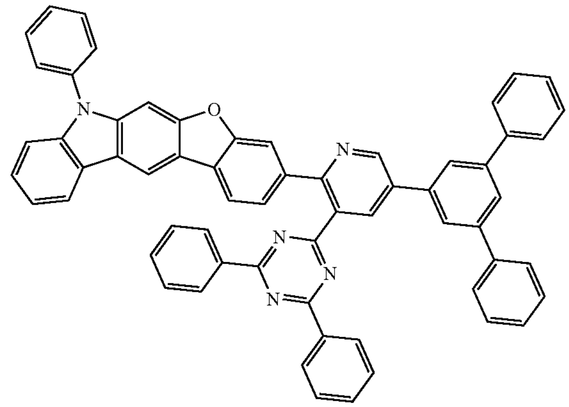
944
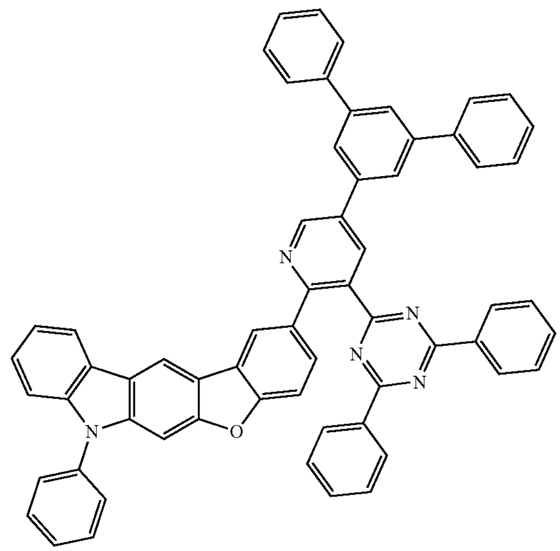
945
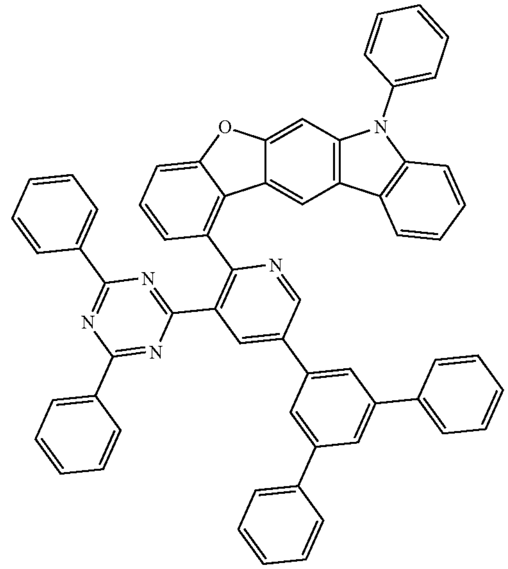

946
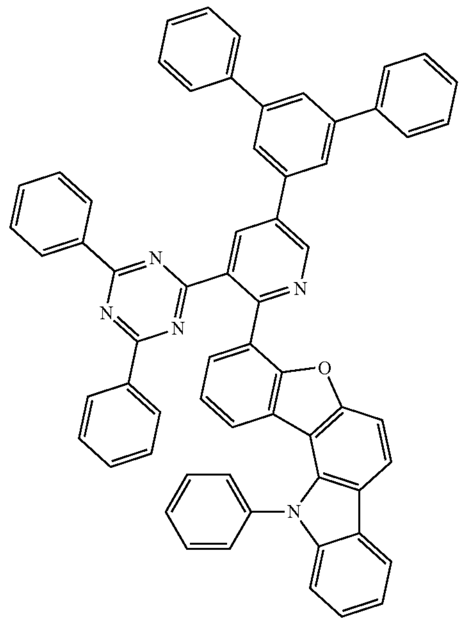
947
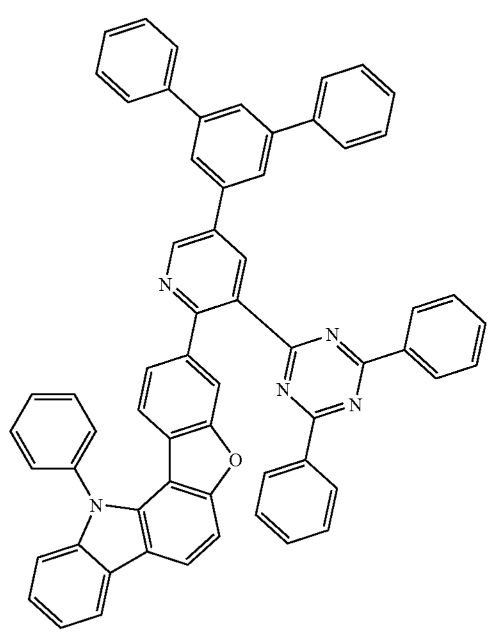
948
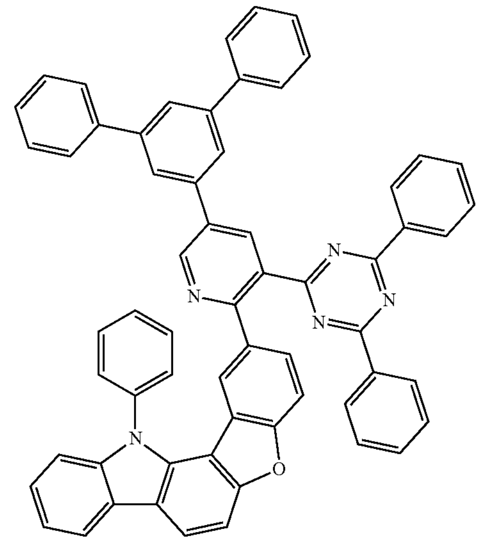
949
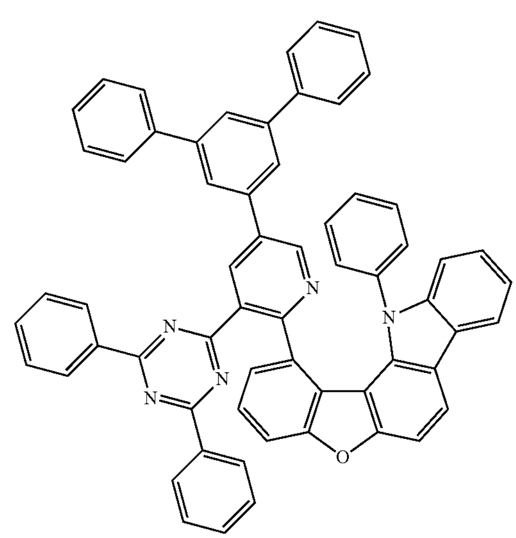

-continued
950
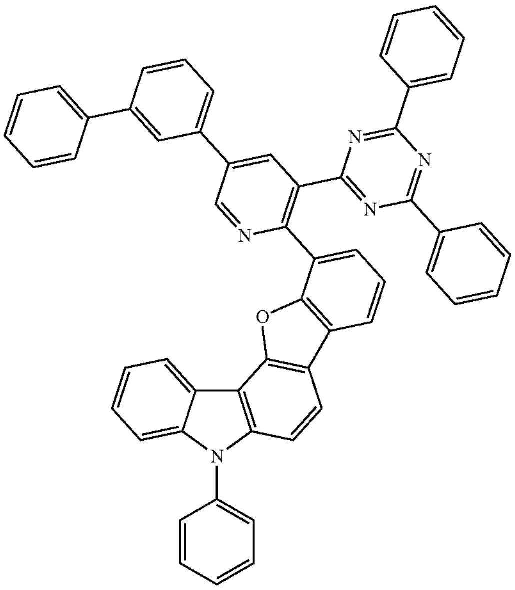
951
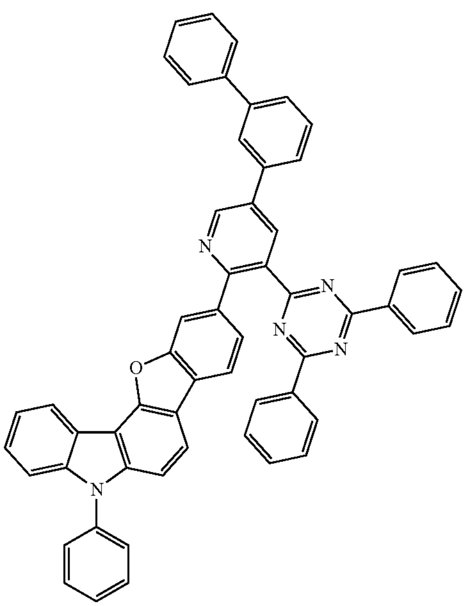
-continued
952
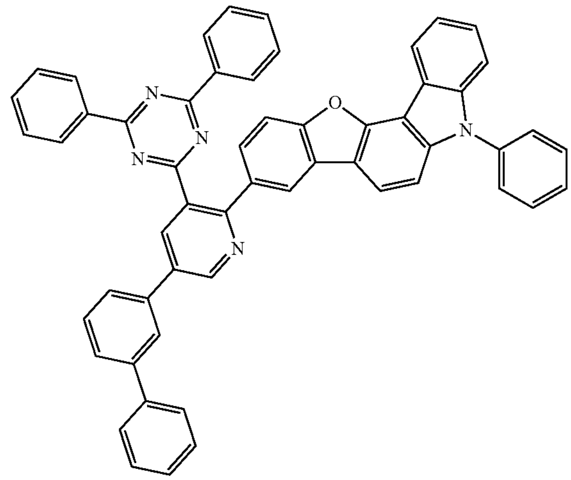
953
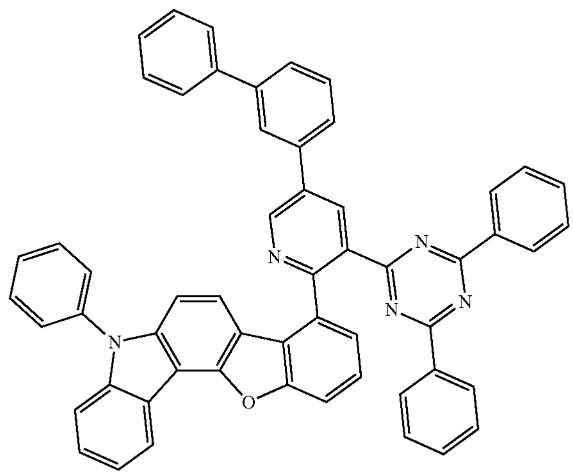
954
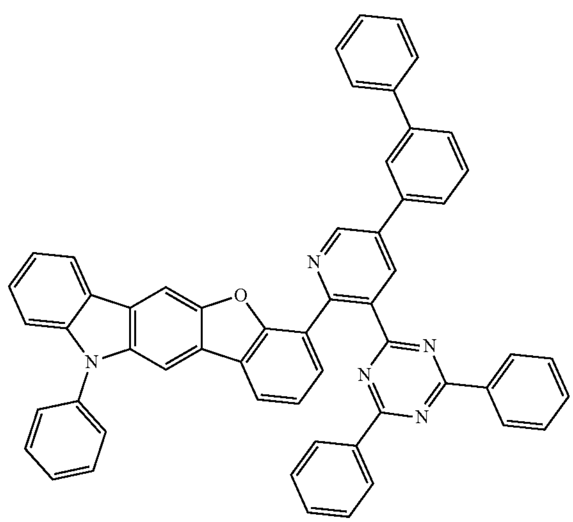

-continued
955
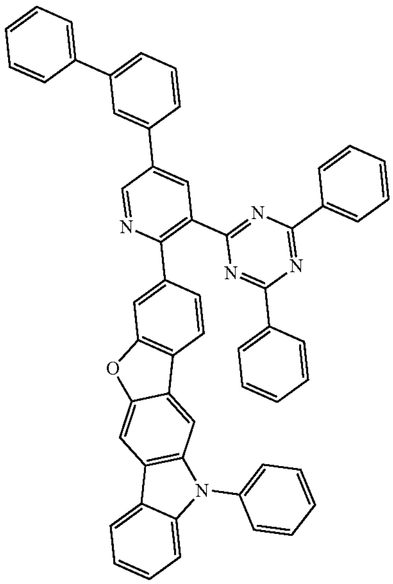
956
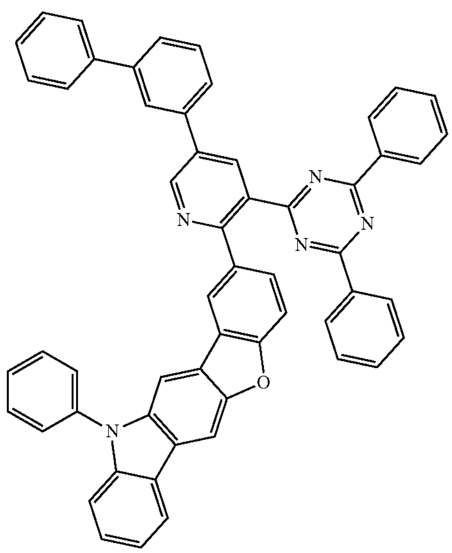
957
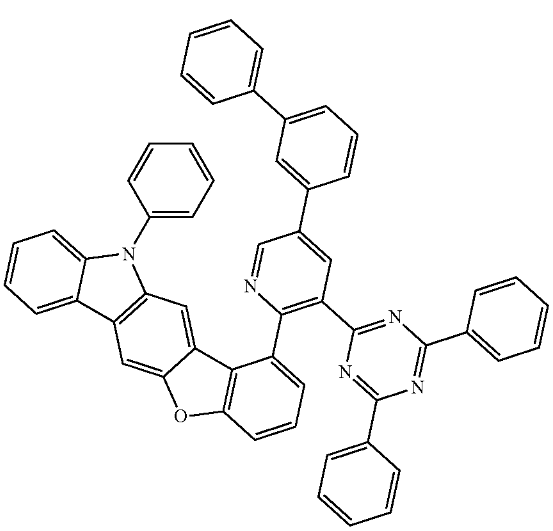
-continued
958
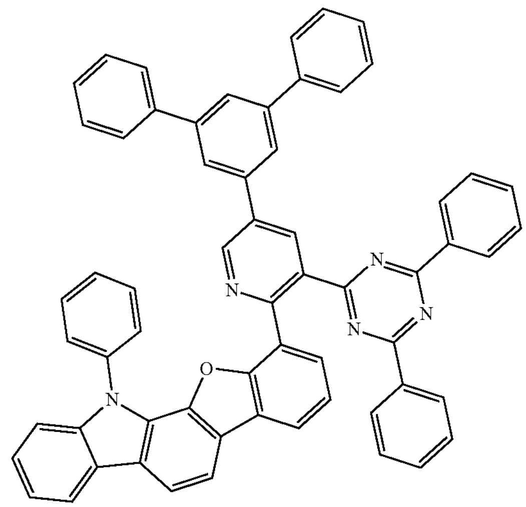
959
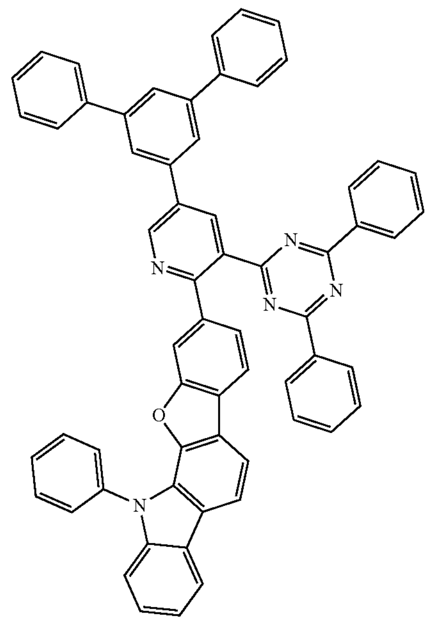
960
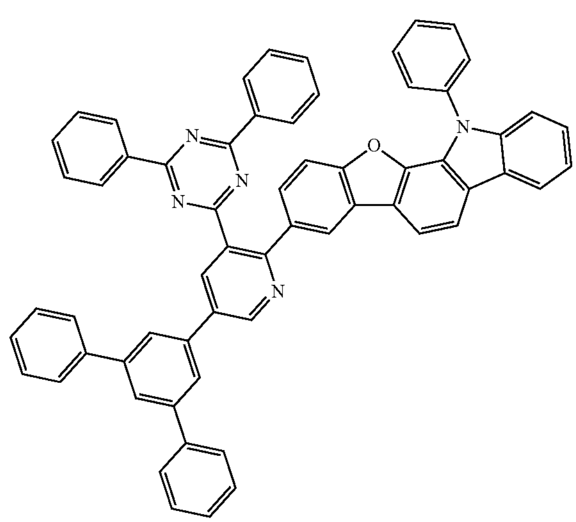

-continued
961
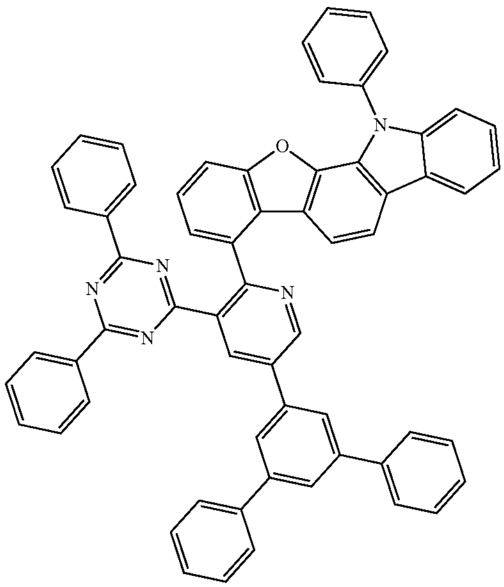
962
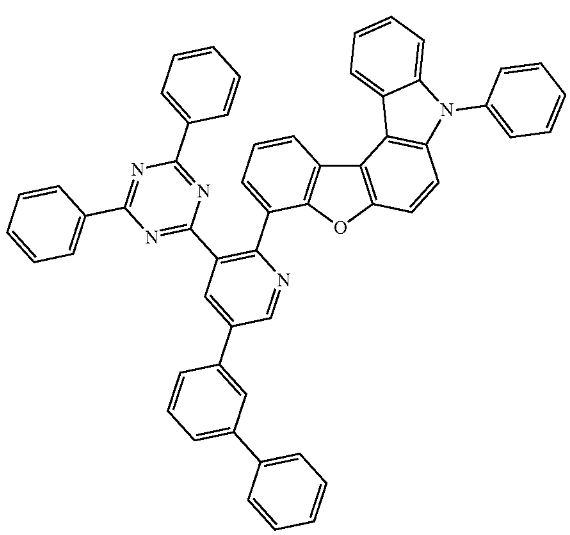
-continued
963
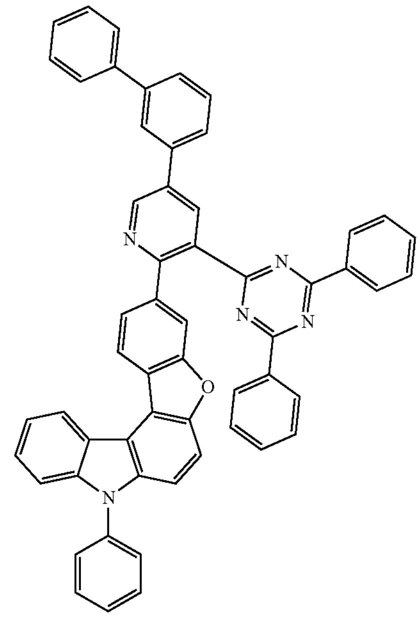
964
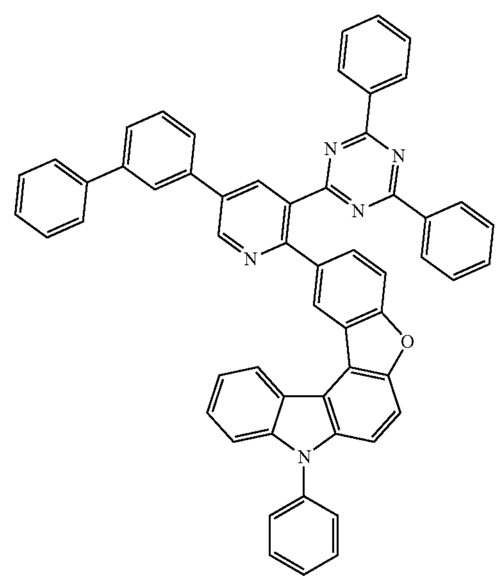

-continued
965
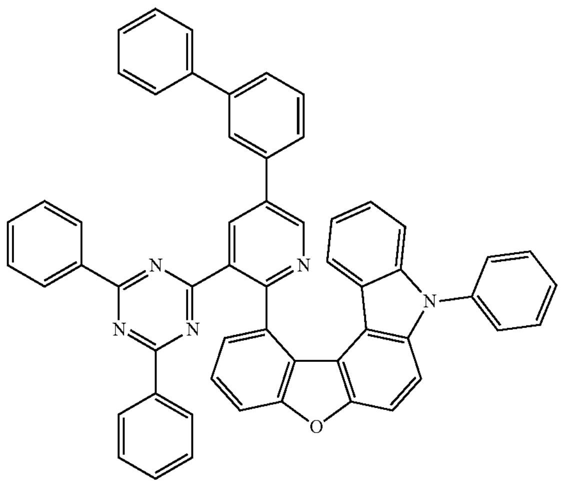
966
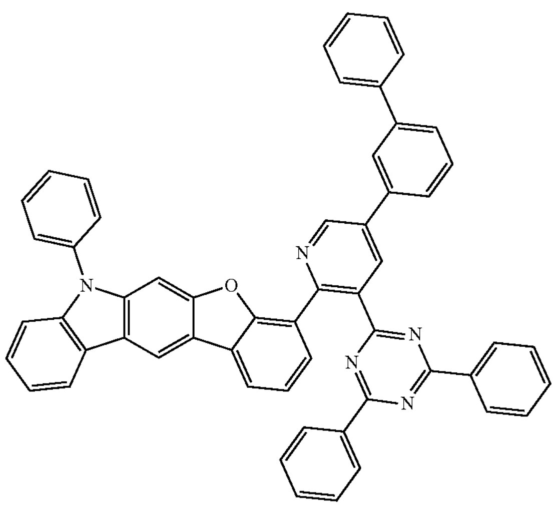
967
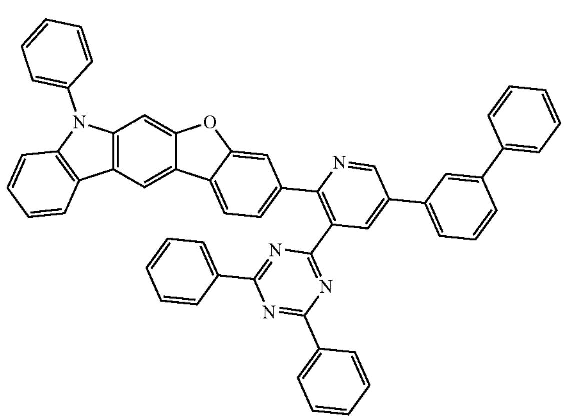
-continued
968
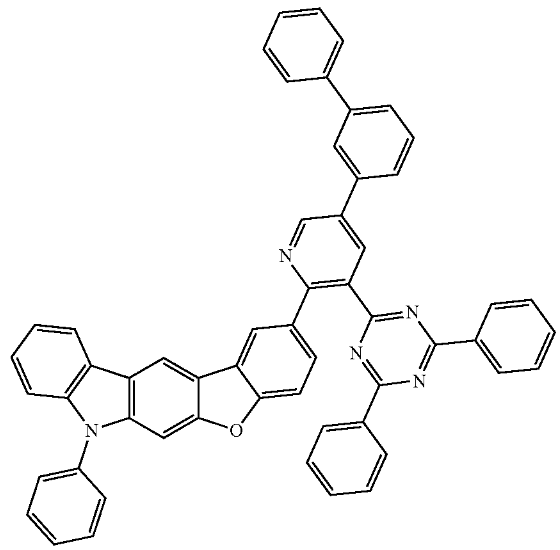
969
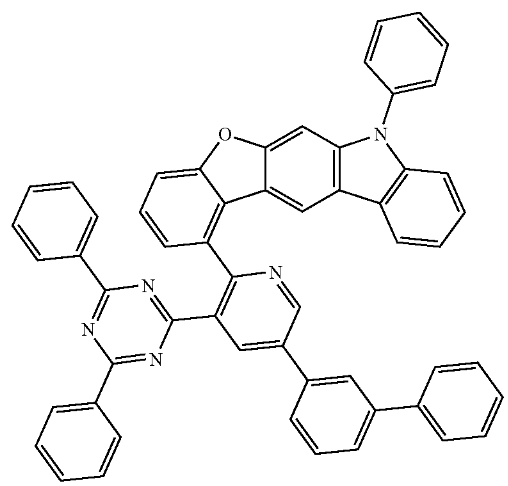
970
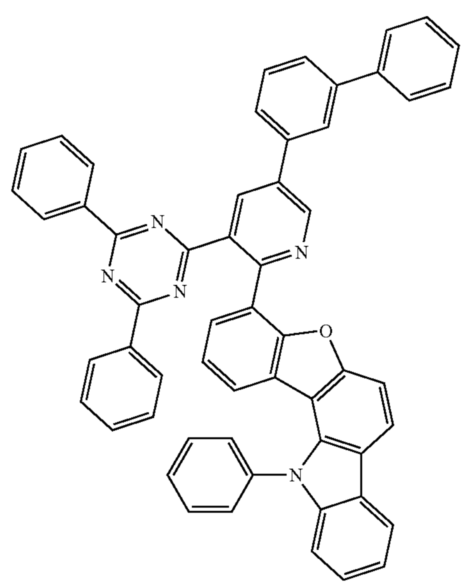

971
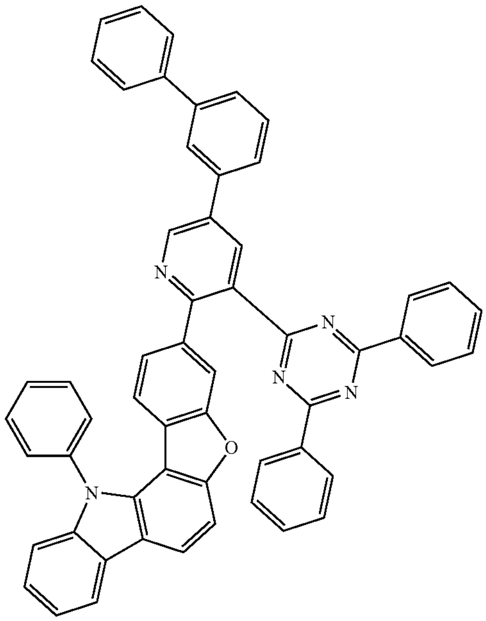
972
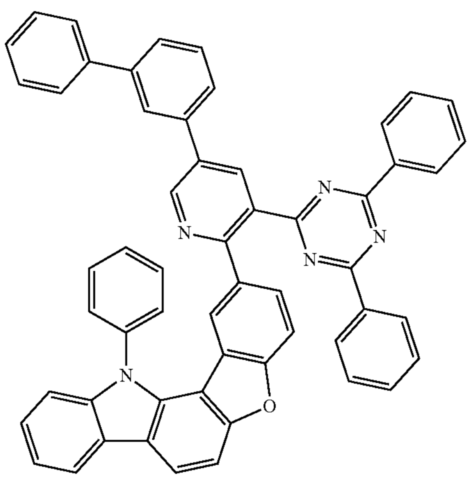
973
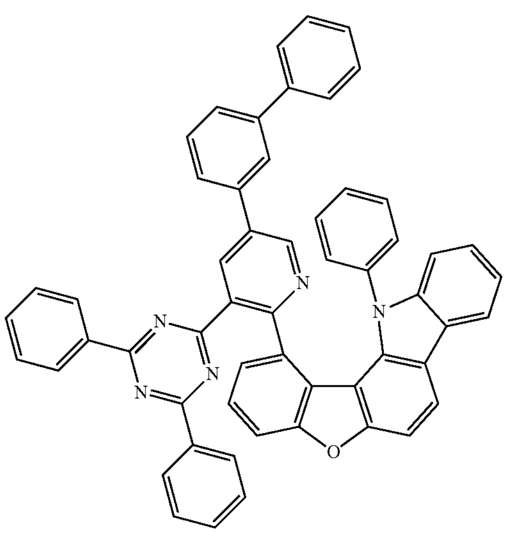
974
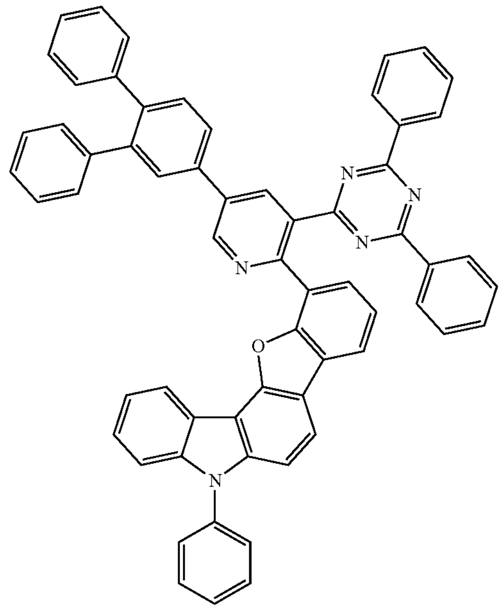
975
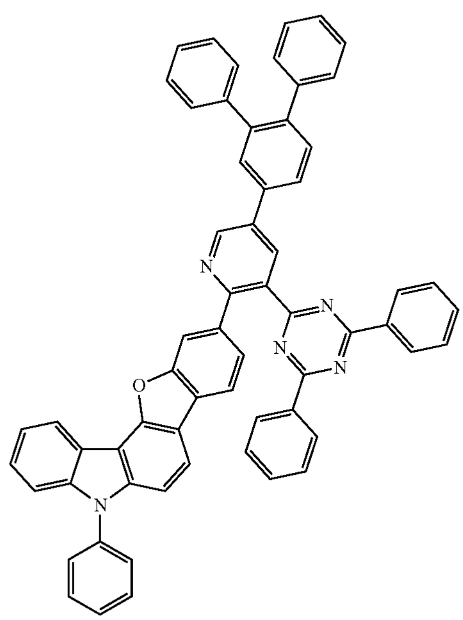

-continued
976
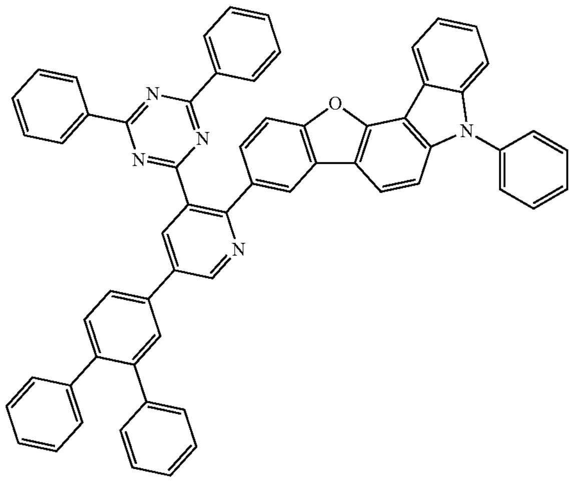
977
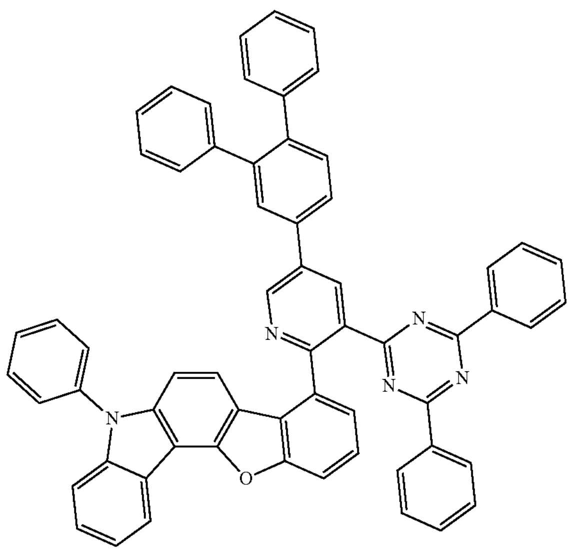
978
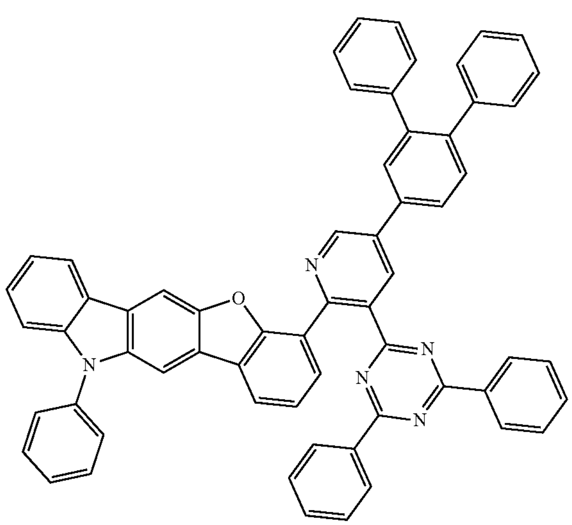
-continued
979
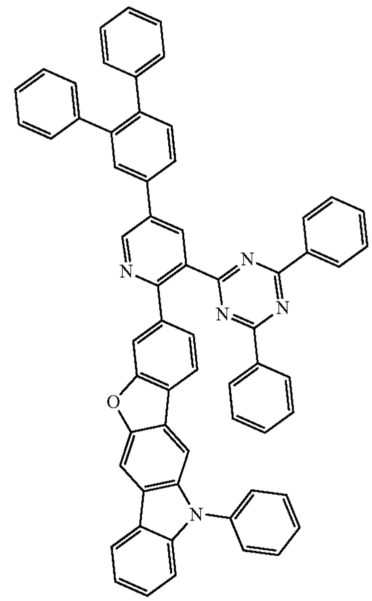
980
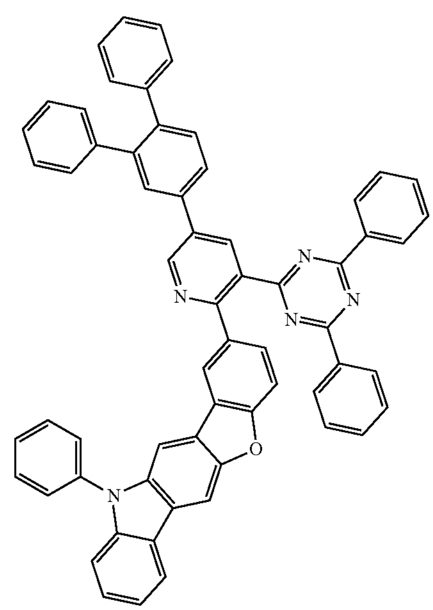

981
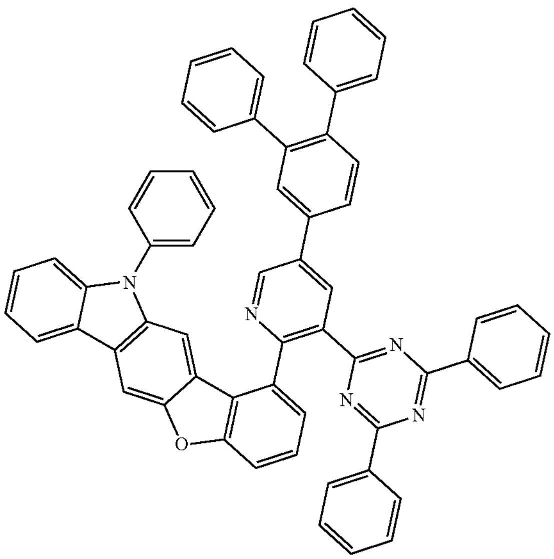
982
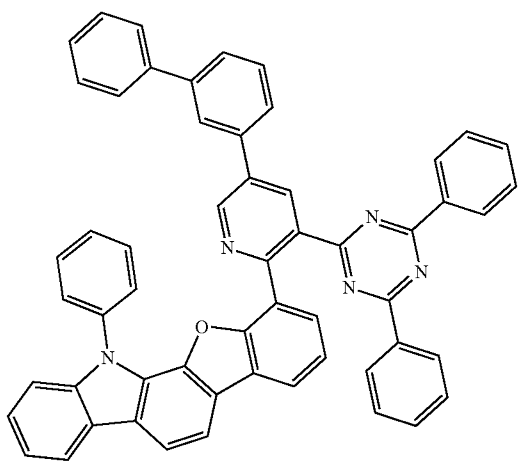
983
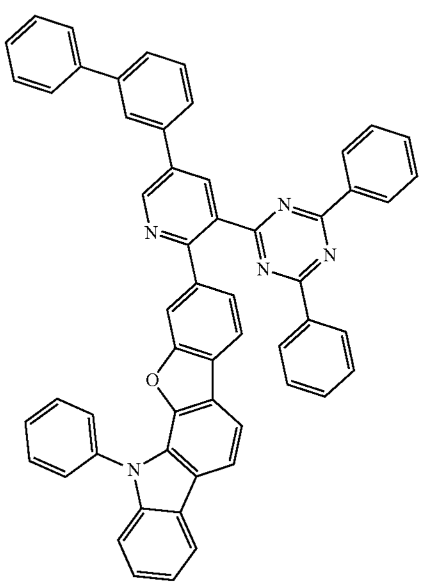
984
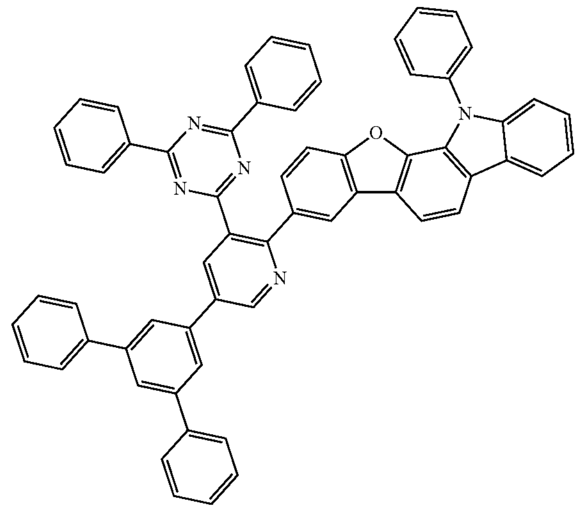
985
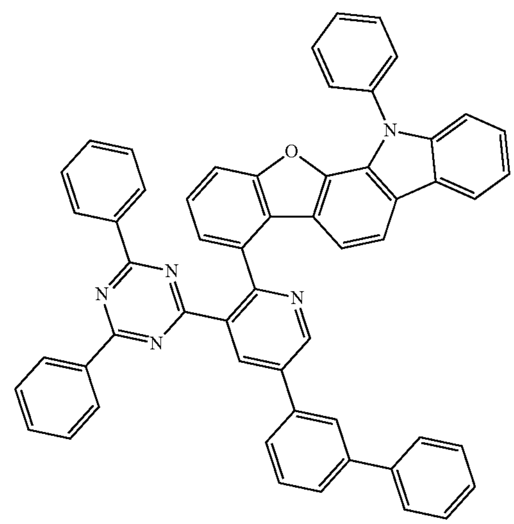
986
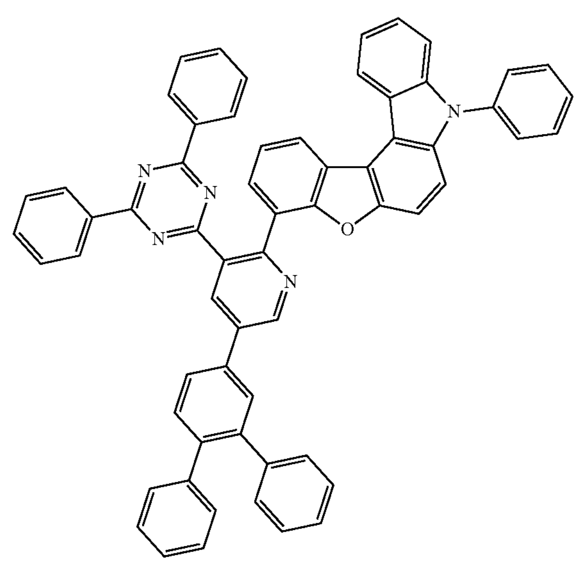

-continued
987
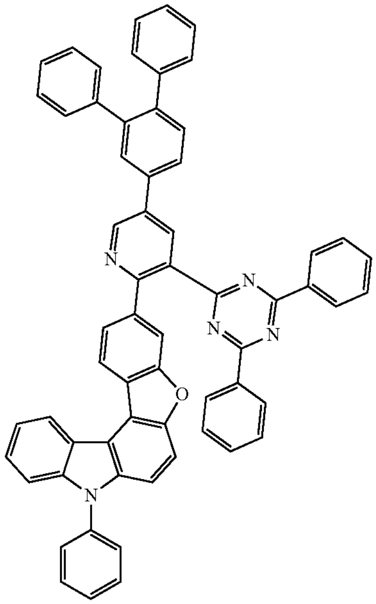
988
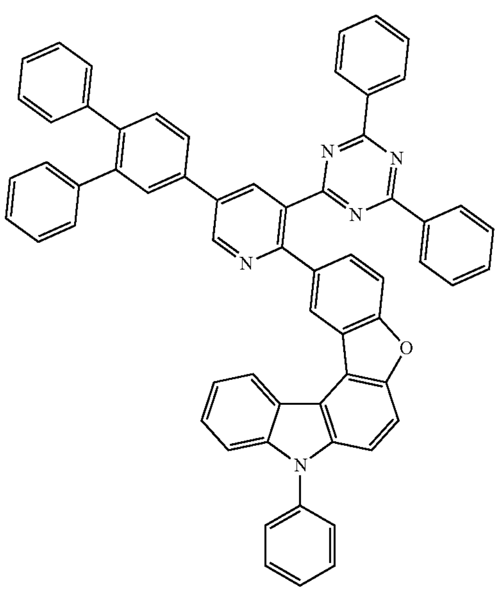
-continued
989
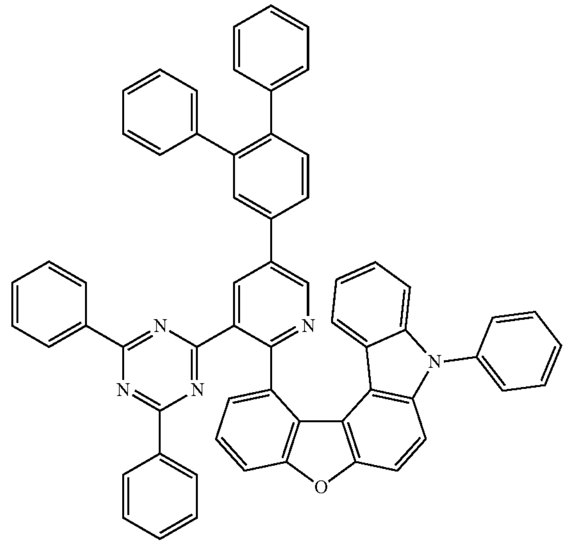
990
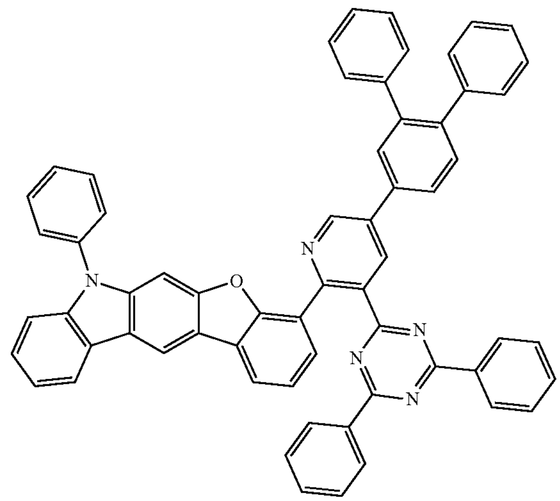
991
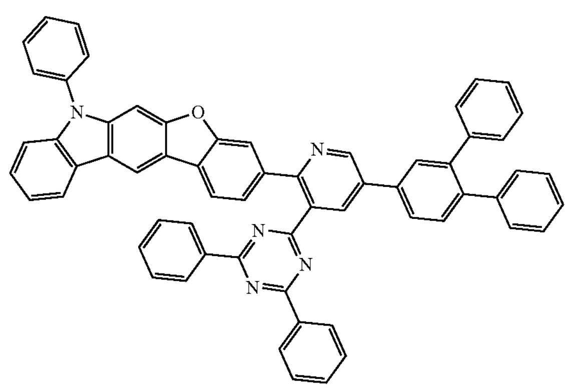

-continued
992
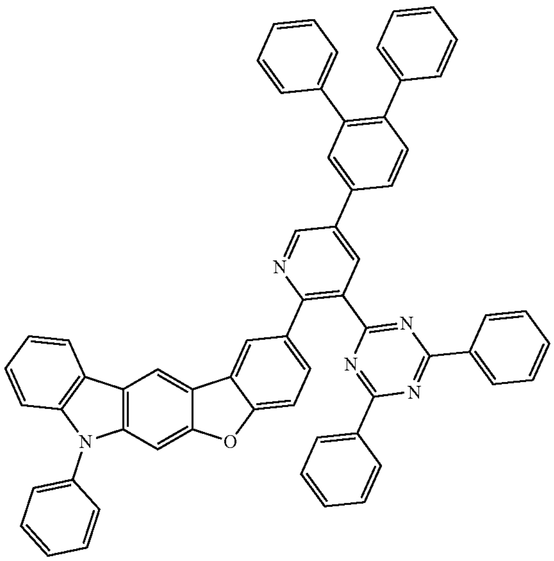
993
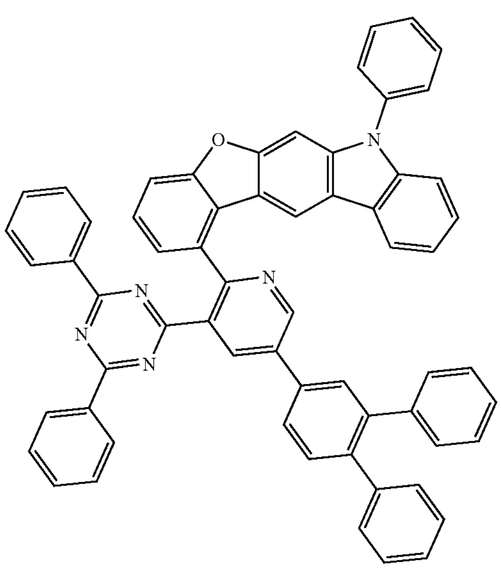
-continued
994
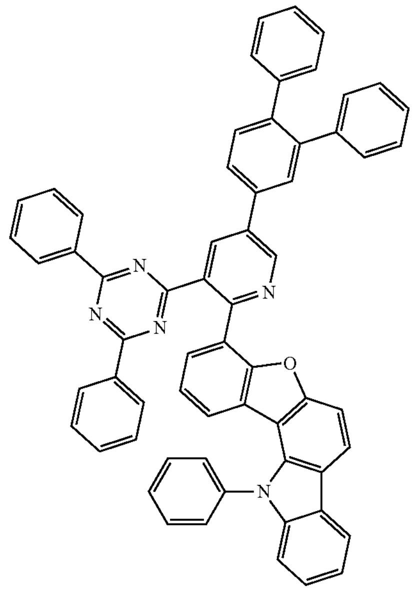
995
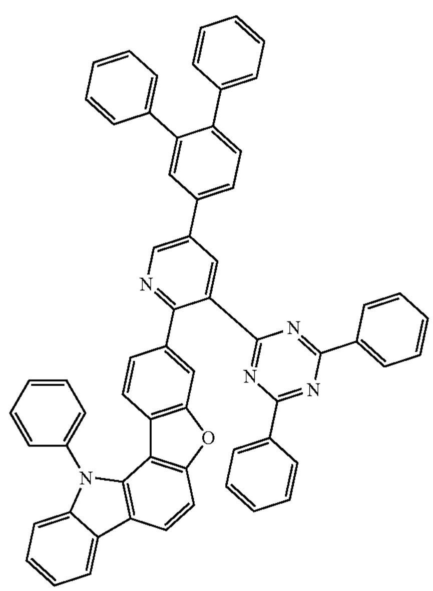

996
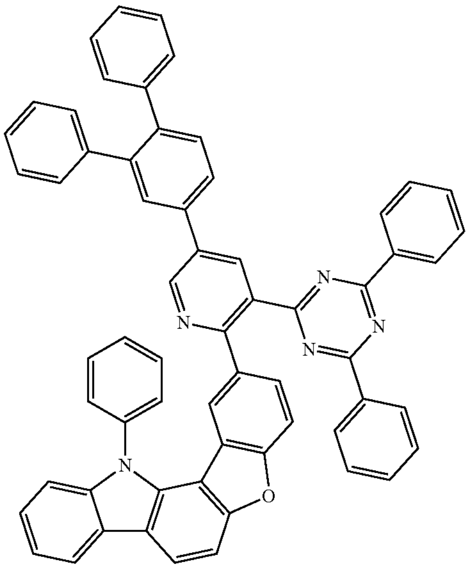
997
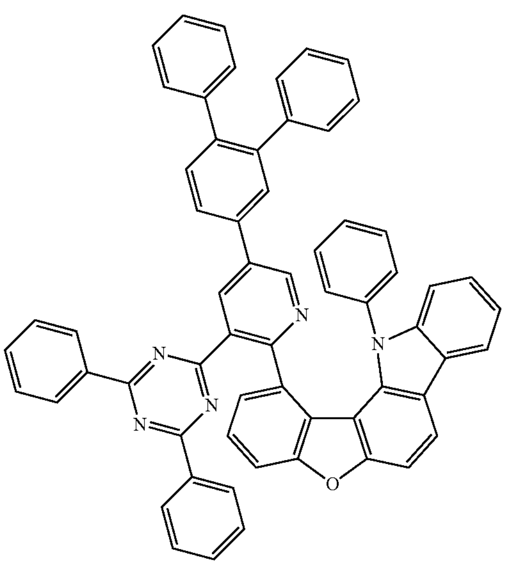
998
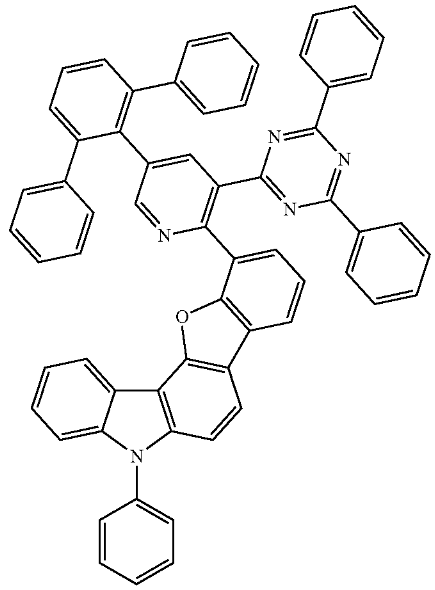
999
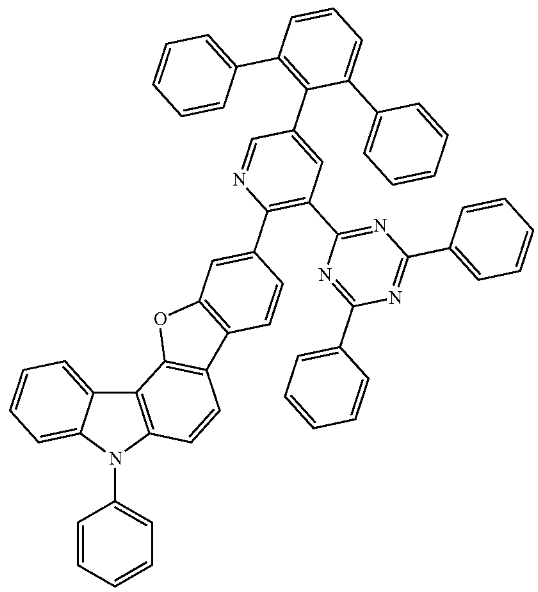
1000
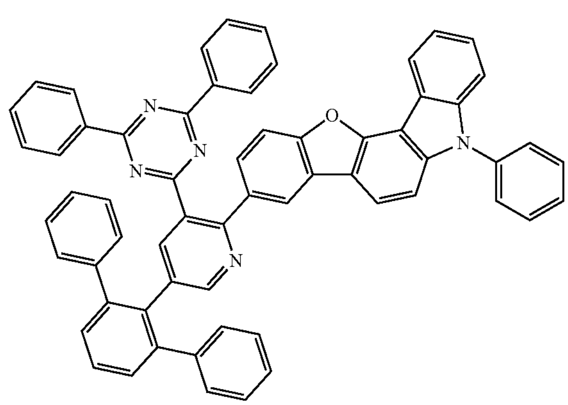

-continued
1001
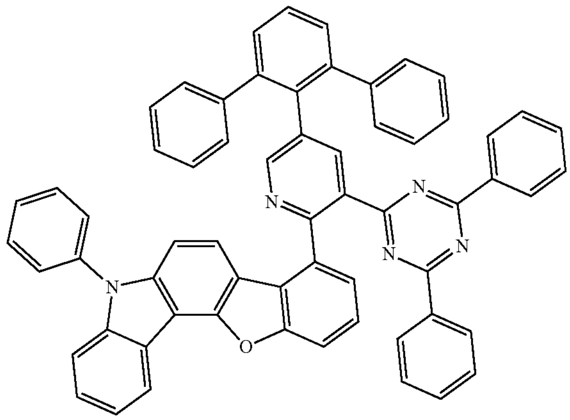
1002
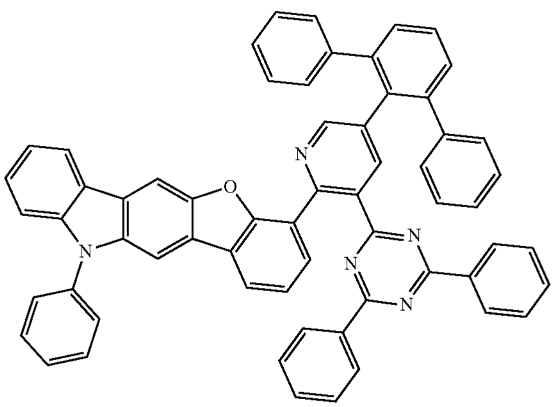
1003
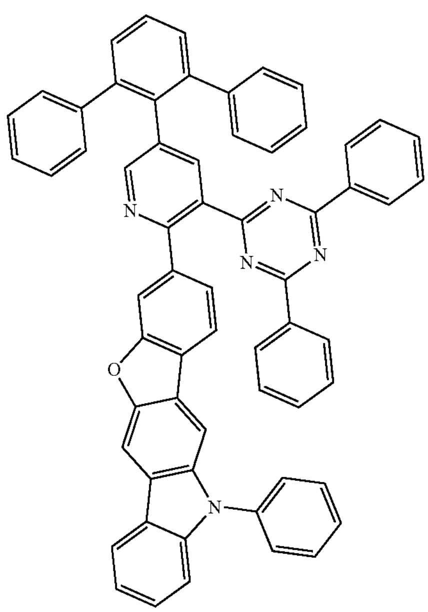
-continued
1004
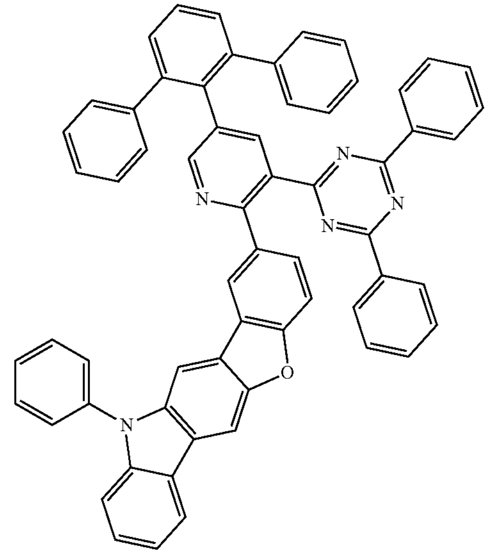
1005
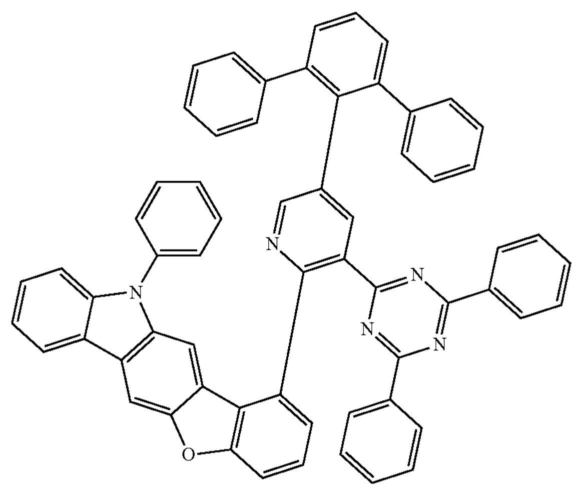
1006
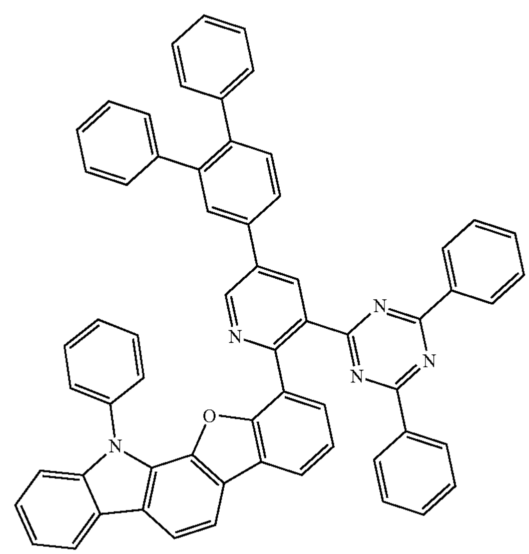

1007
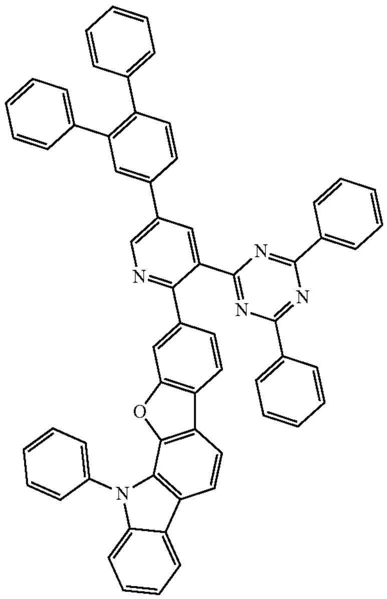
1008
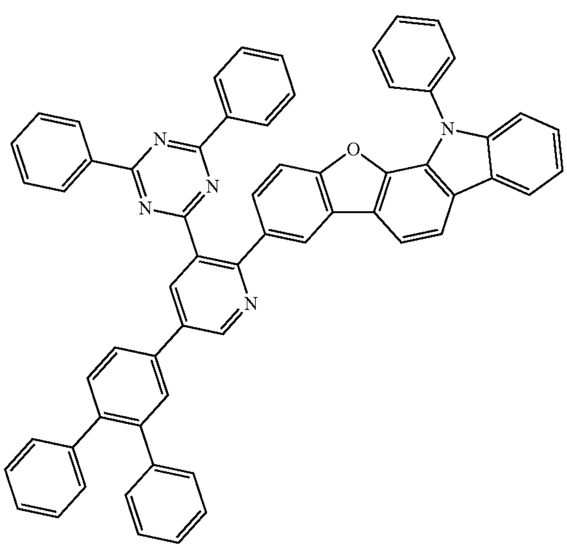
1009
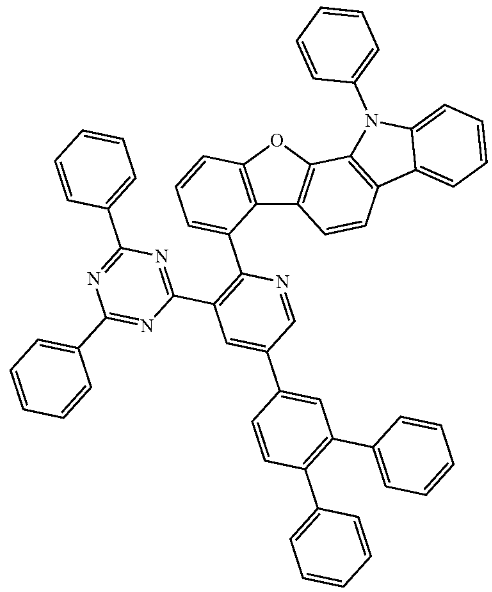
1010
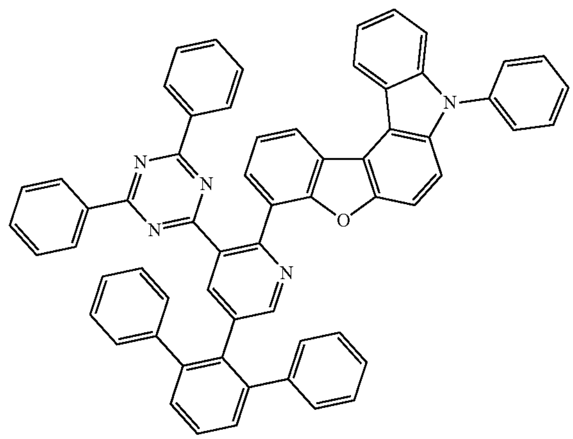
1011
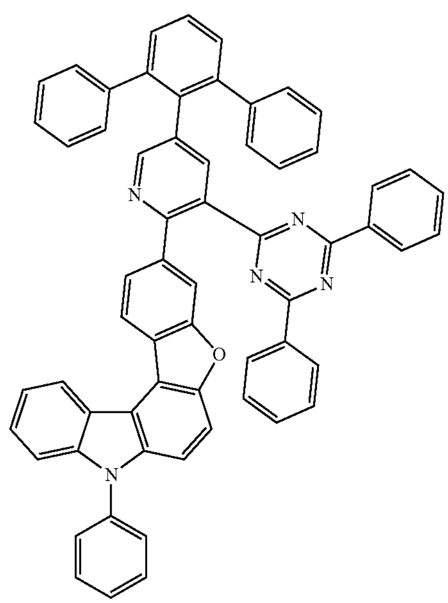

-continued
1012
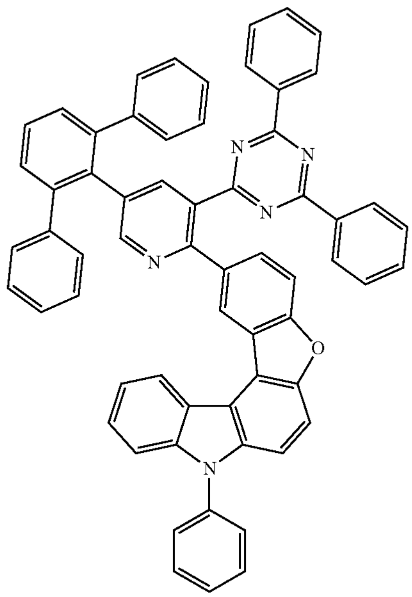
1013
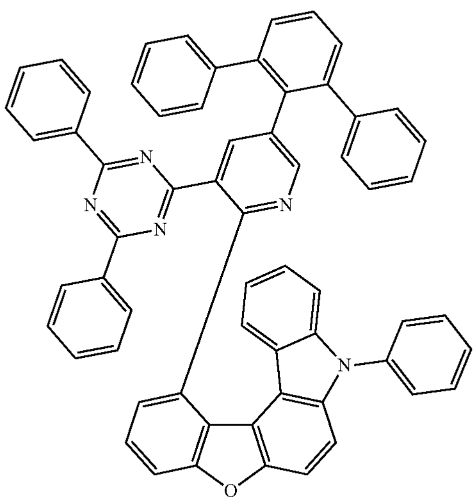
1014
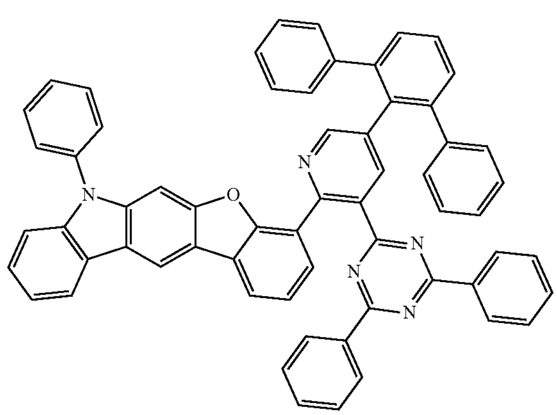
-continued
1015
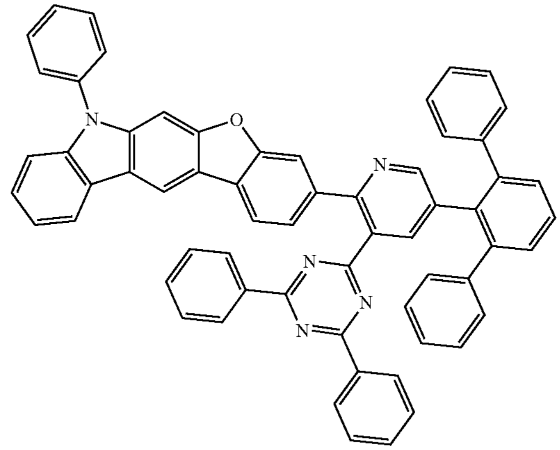
1016
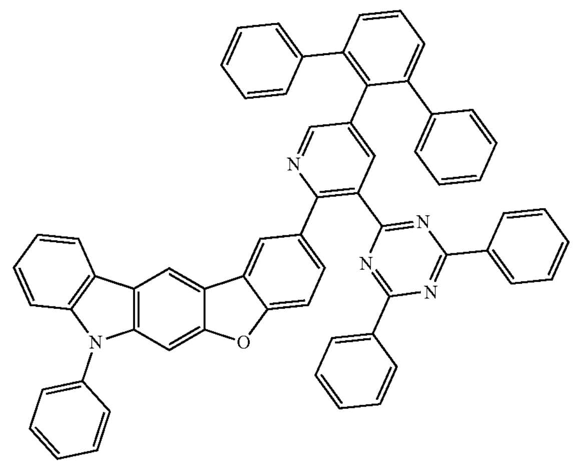
1017
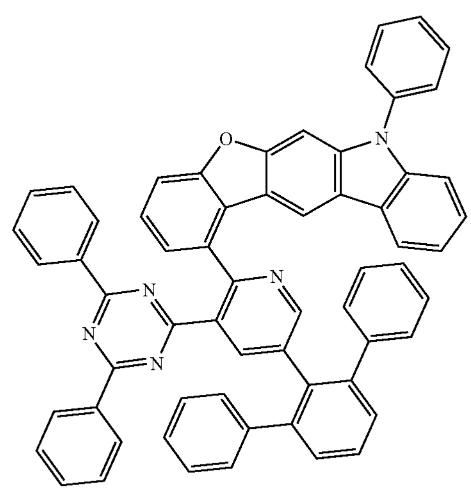

1018
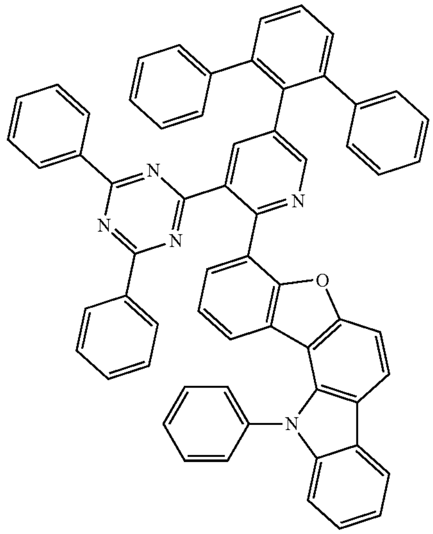
1019
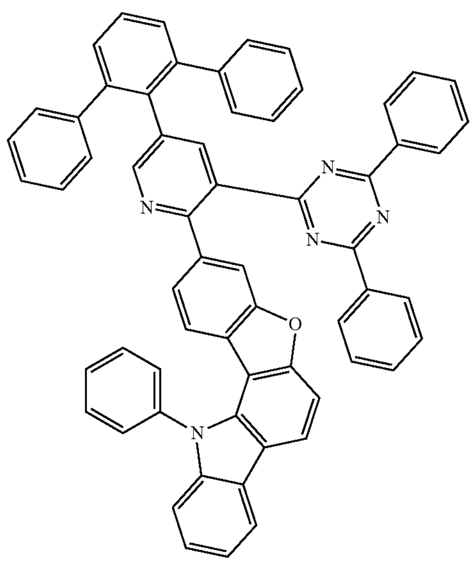
1020
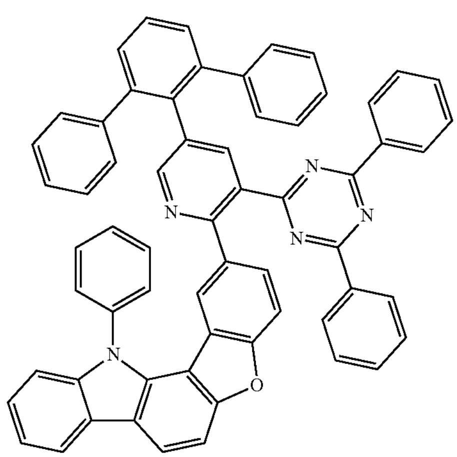
1021
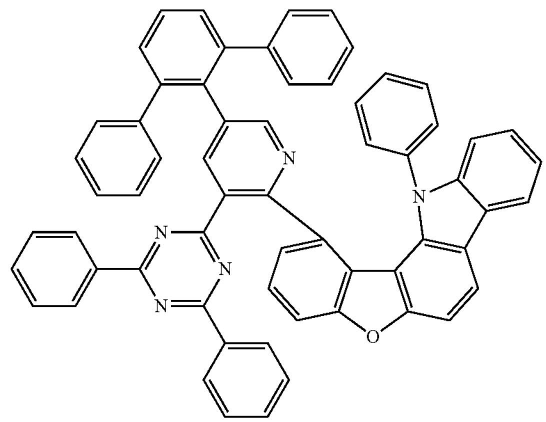
1022
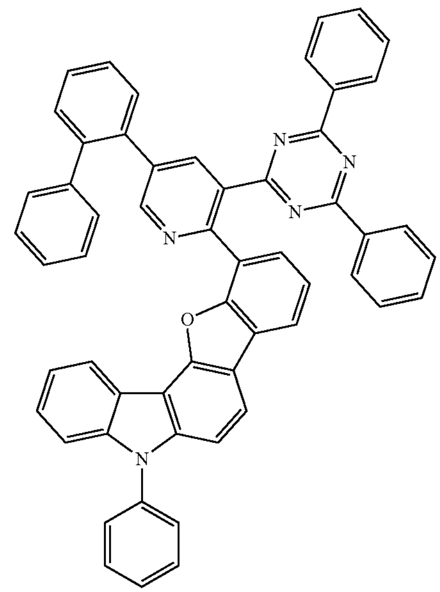
1023
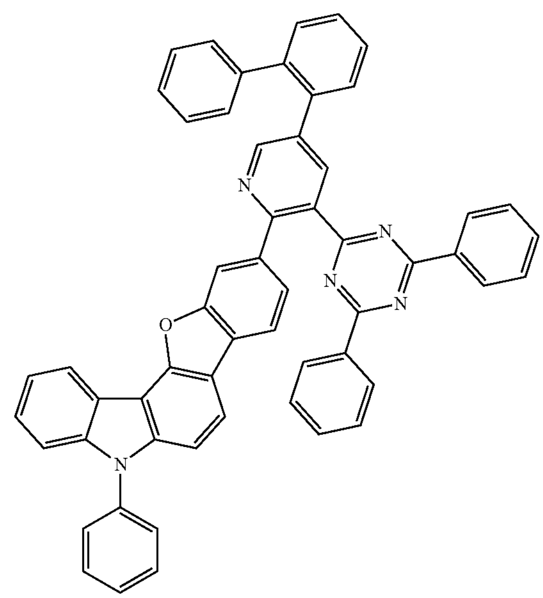

-continued
1024
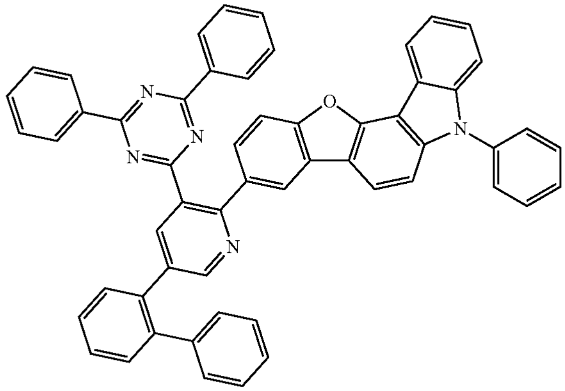
1025
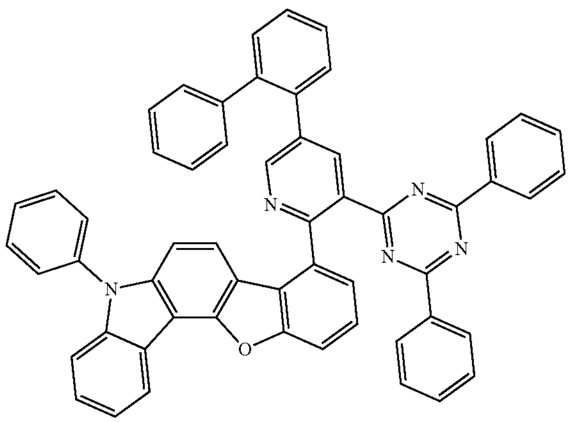
1026
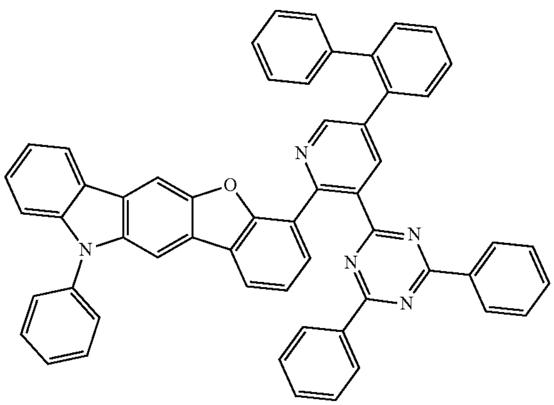
-continued
1027
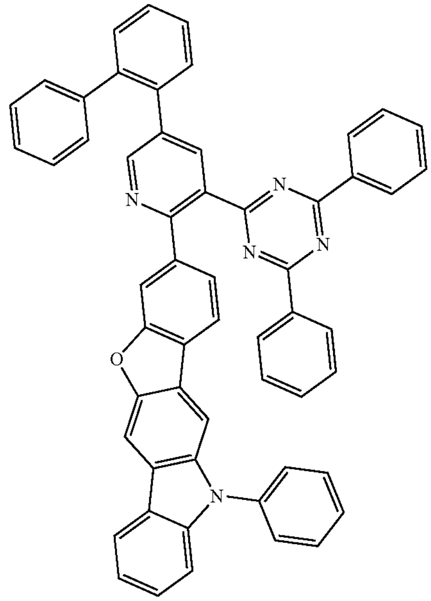
1028
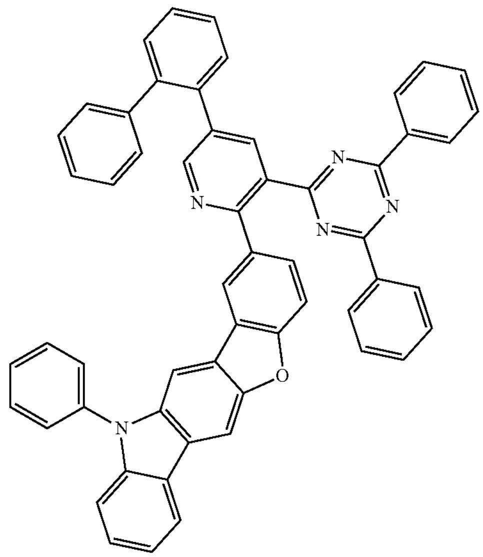
1029
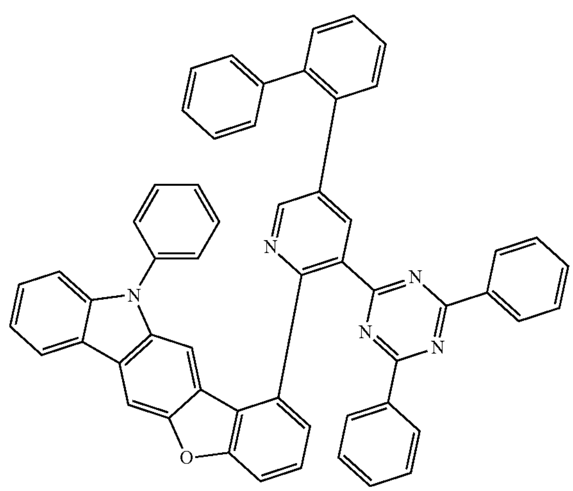

-continued
1030
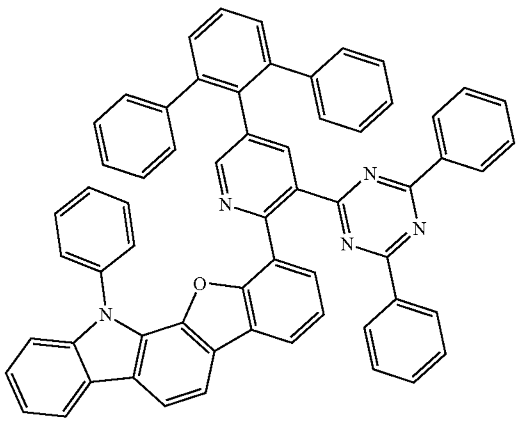
1031
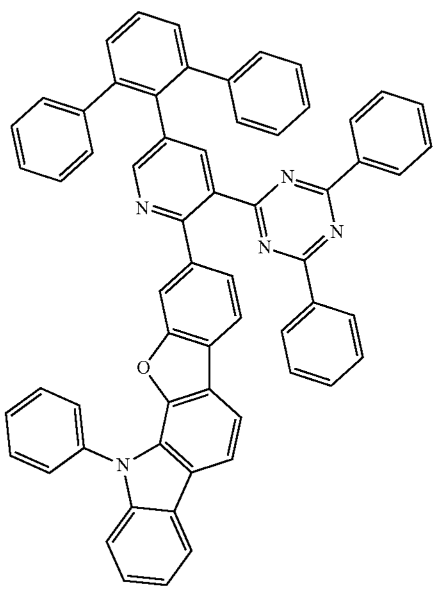
1032
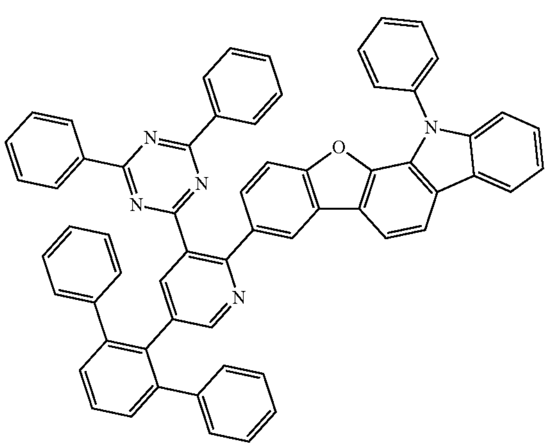
-continued
1033
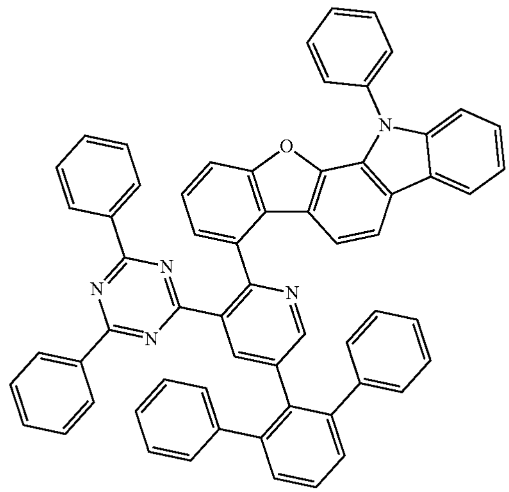
1034
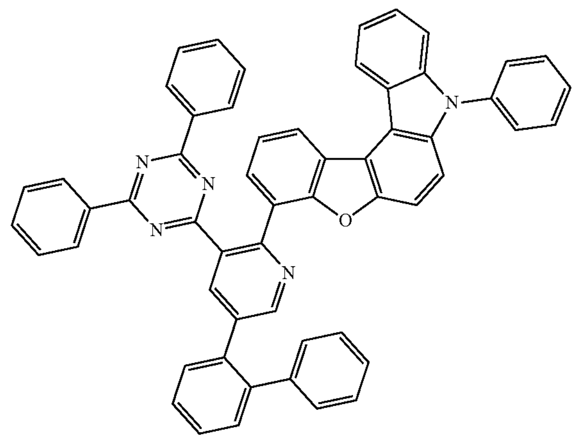
1035
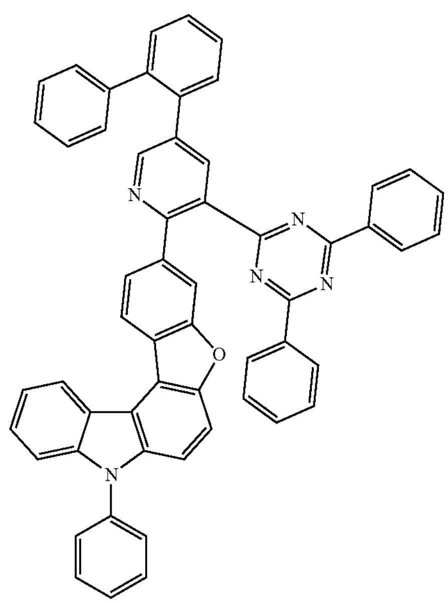

-continued
1036
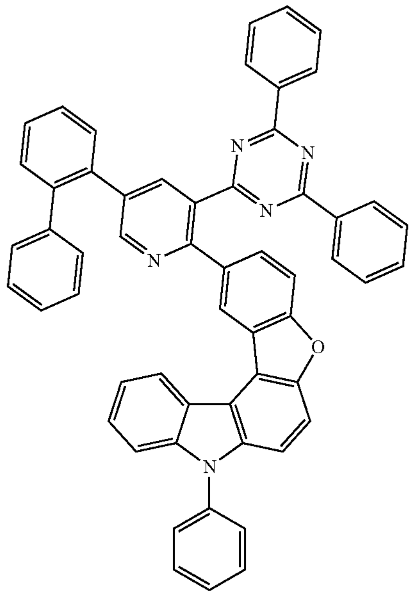
1037
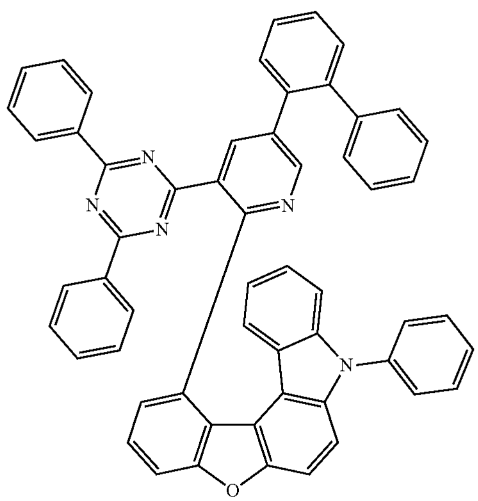
1038
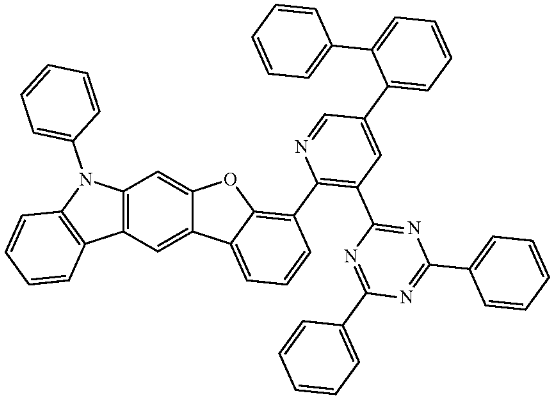
-continued
1039
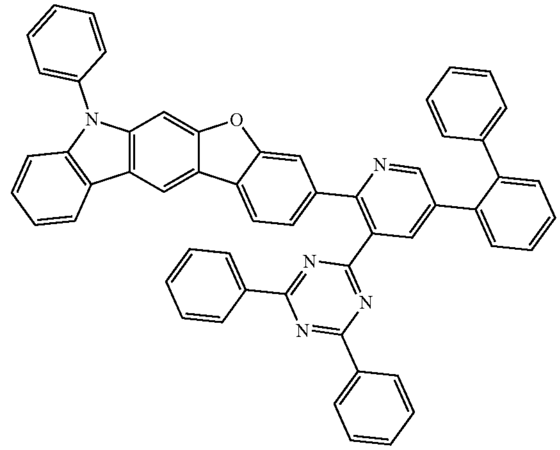
1040
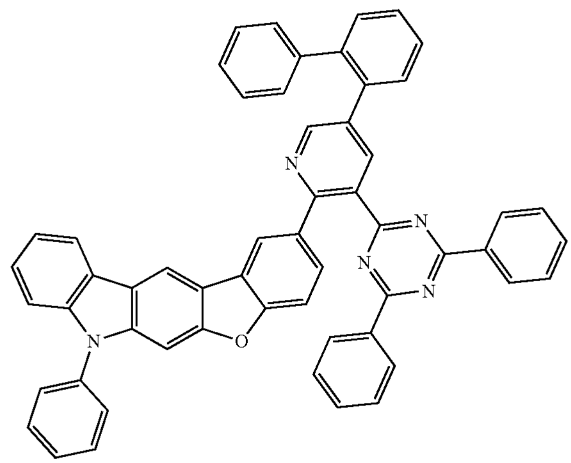
1041
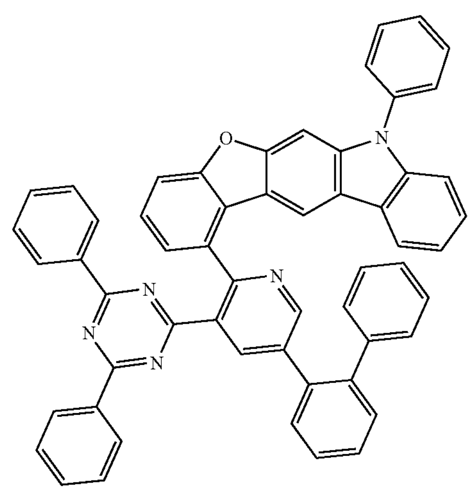

-continued
1042
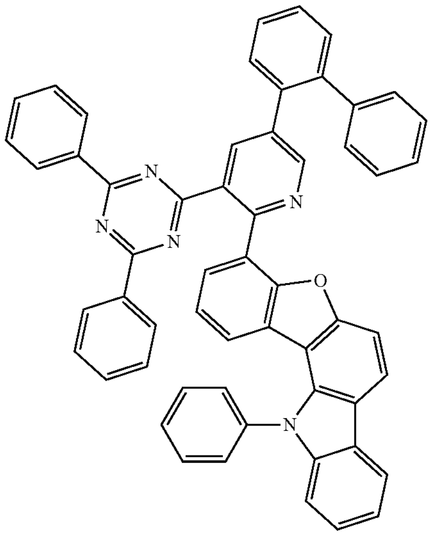
1043
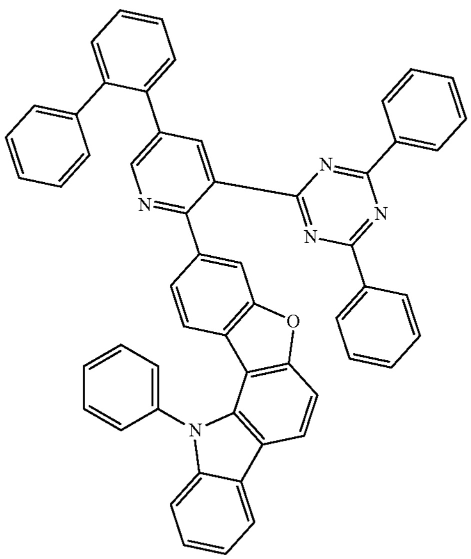
1044
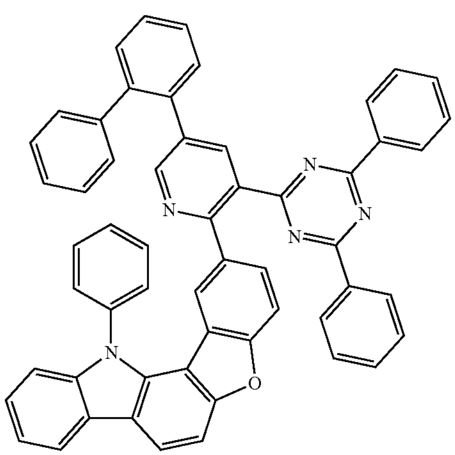
-continued
1045
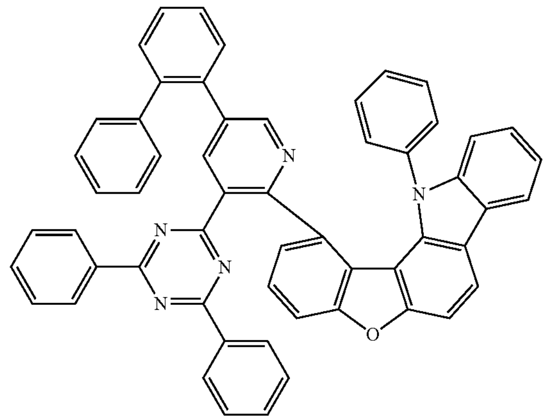
1046
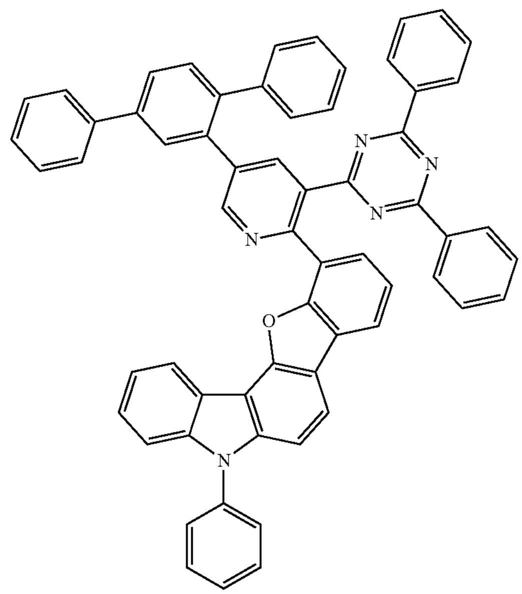
1047
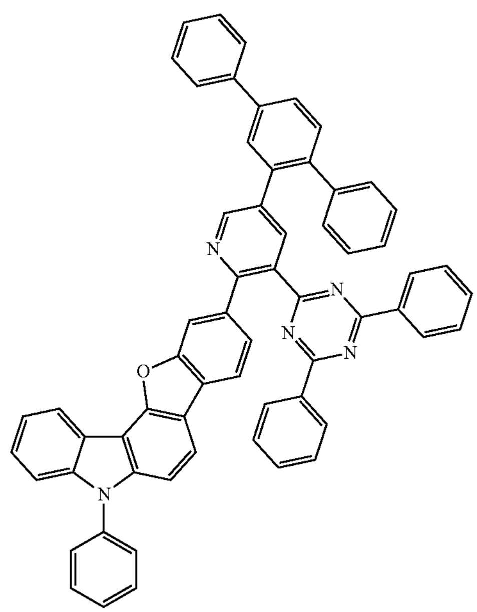

-continued
1048
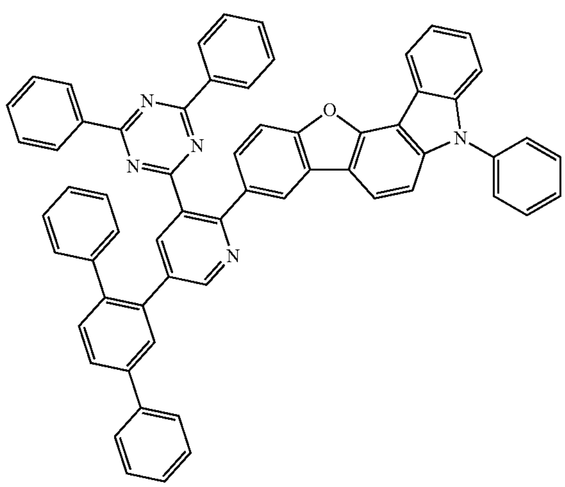
1049
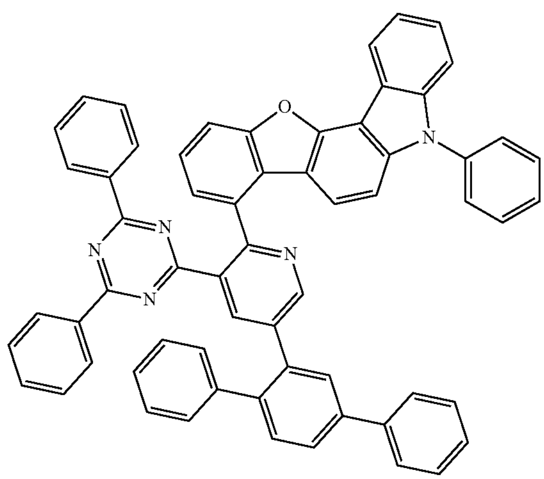
1050
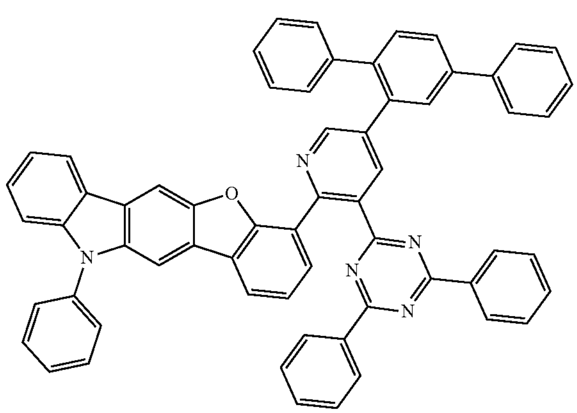
-continued
1051
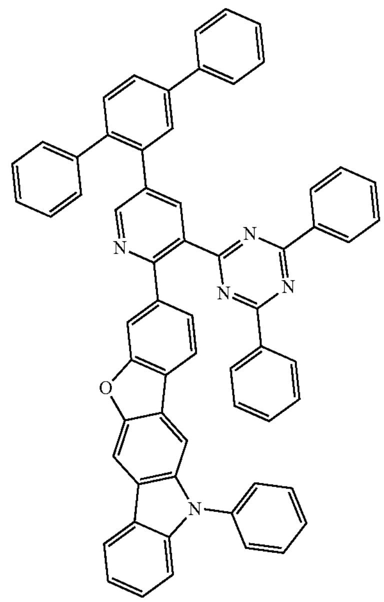
1052
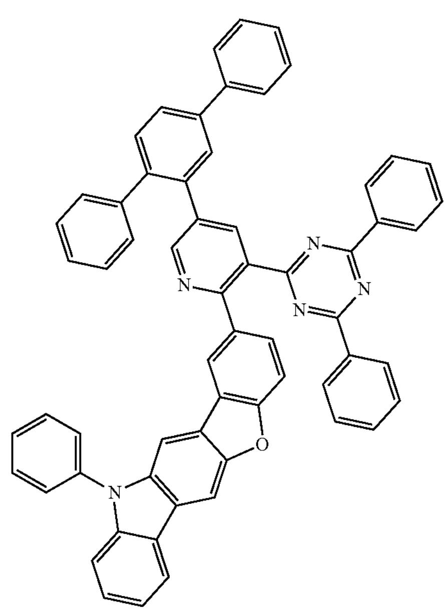

-continued
1053
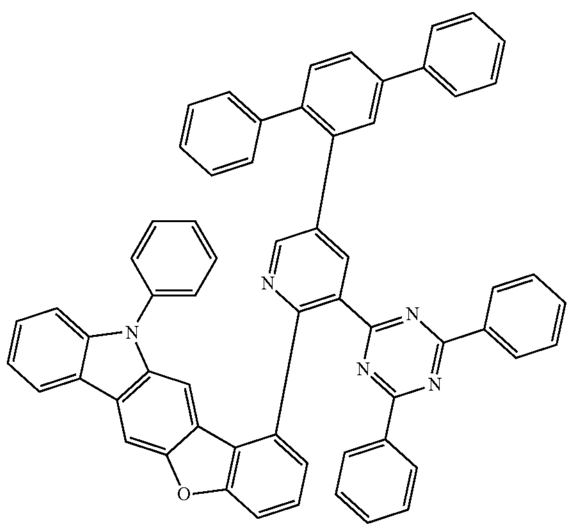
1054
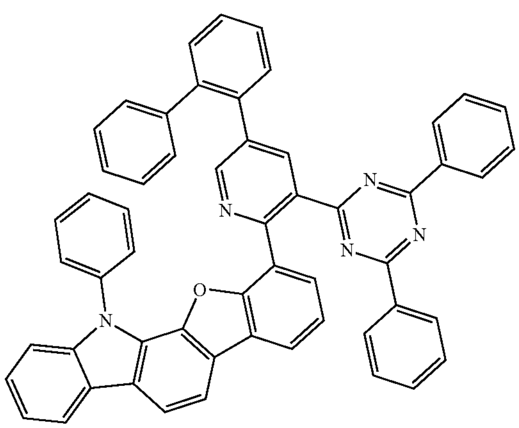
1055
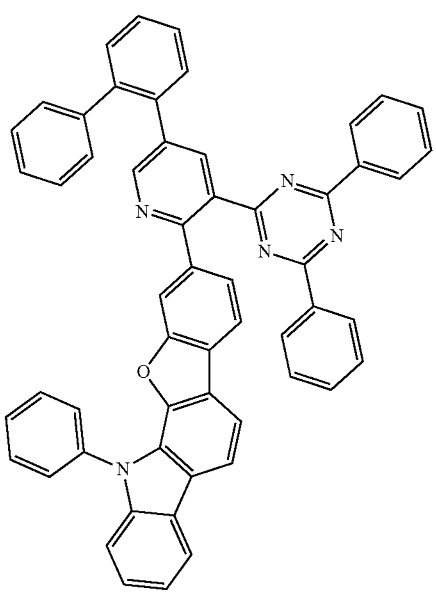
-continued
1056
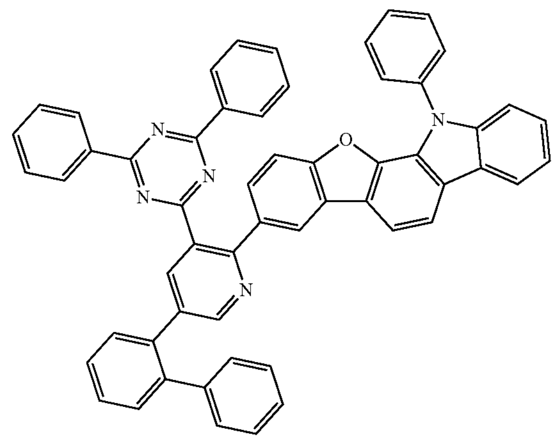
1057
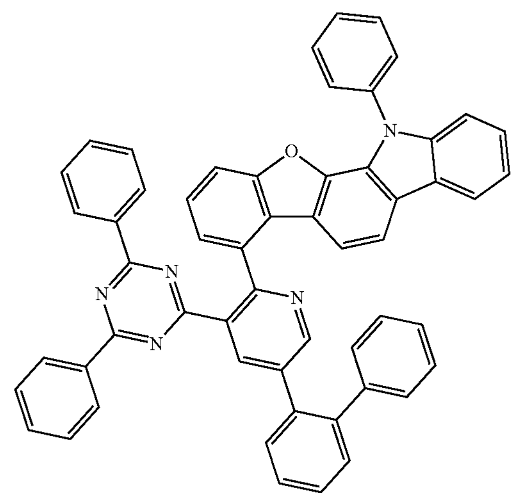
1058
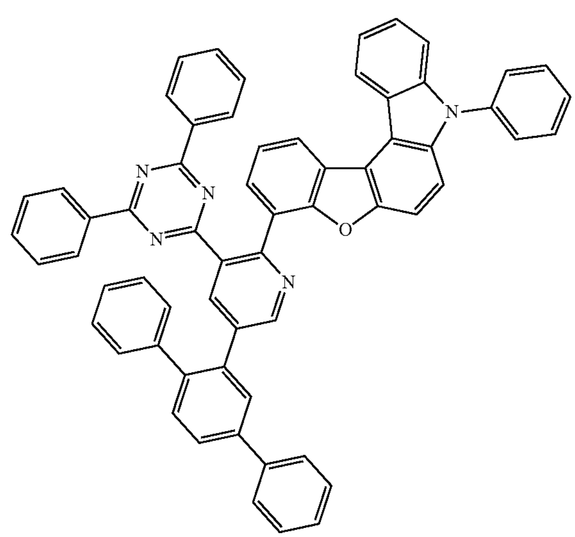

-continued
1059
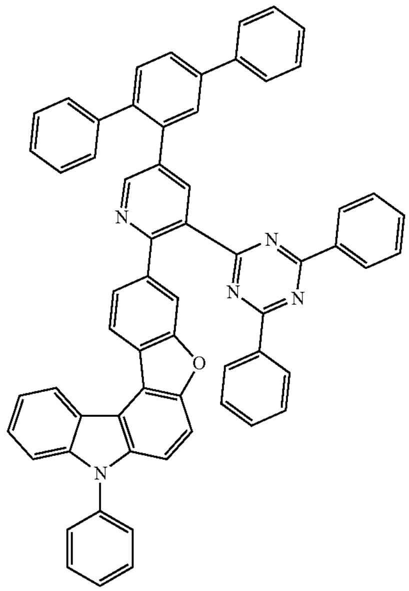
1060
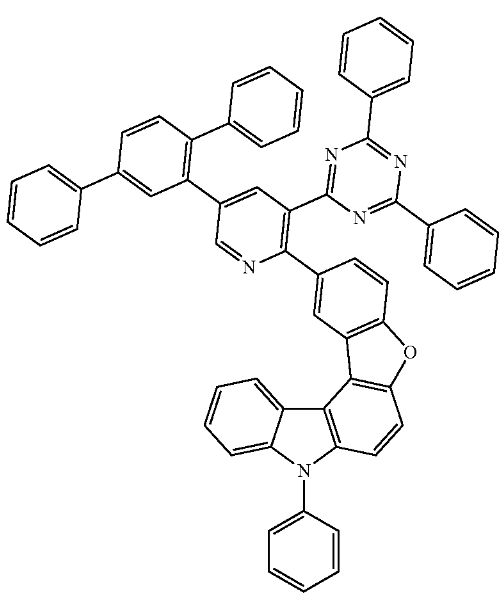
-continued
1061
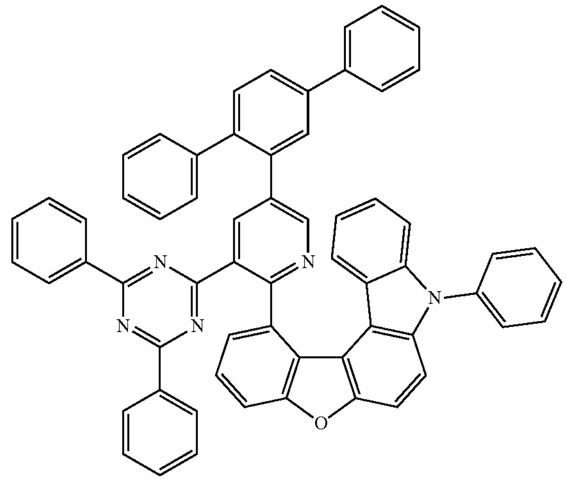
1062
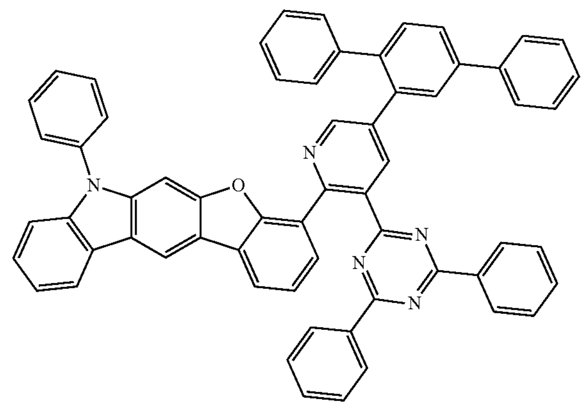
1063
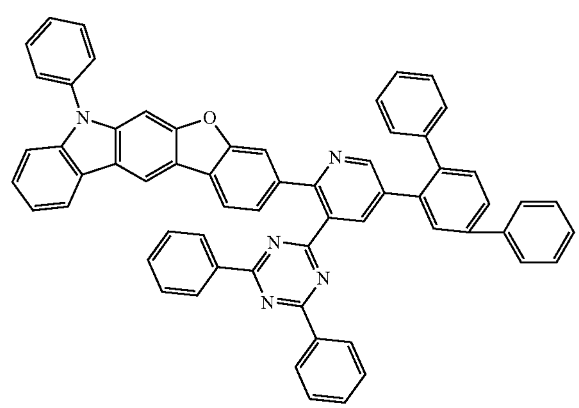

1064
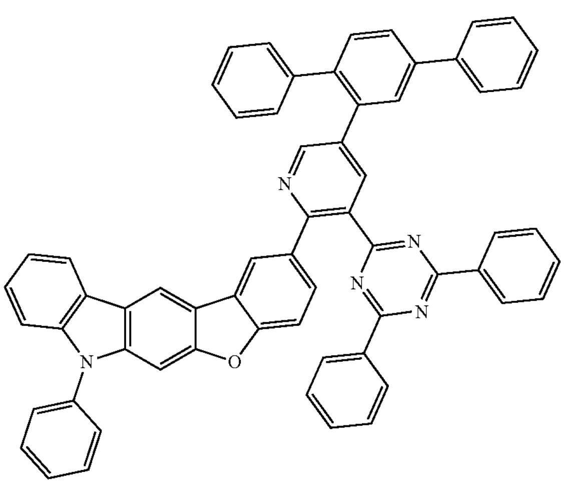
1065
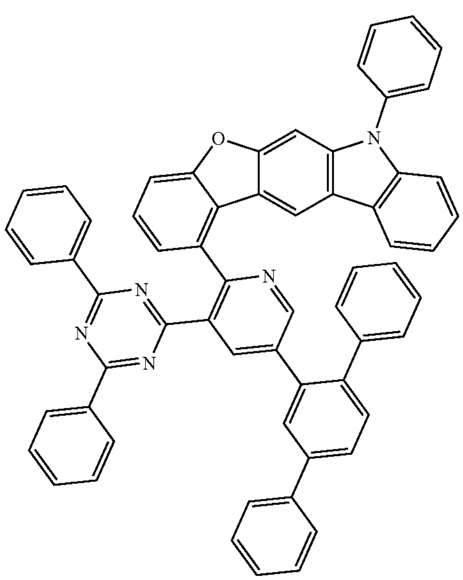
1066
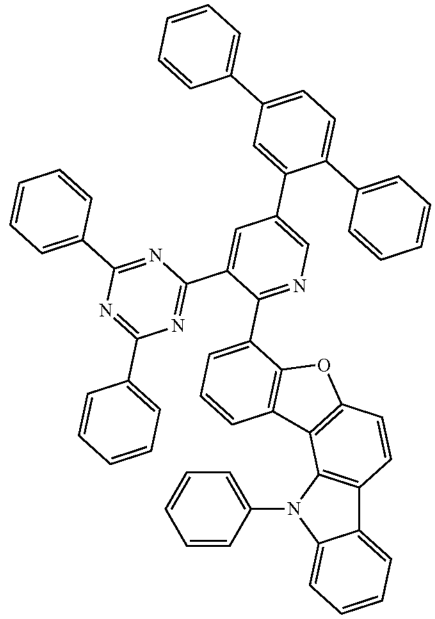
1067
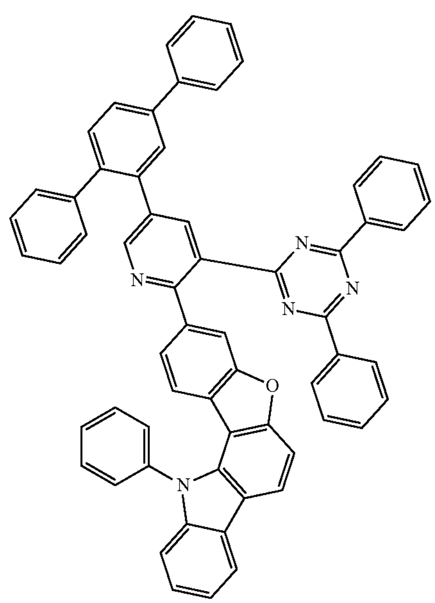

-continued
1068
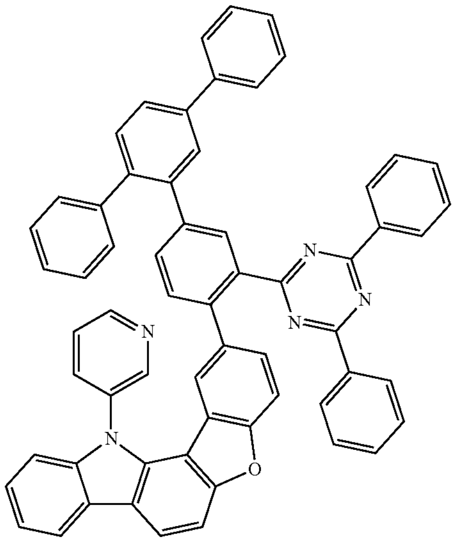
1069
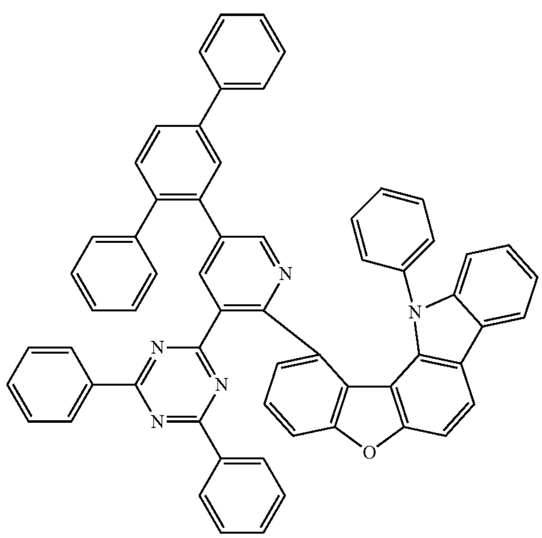
1070
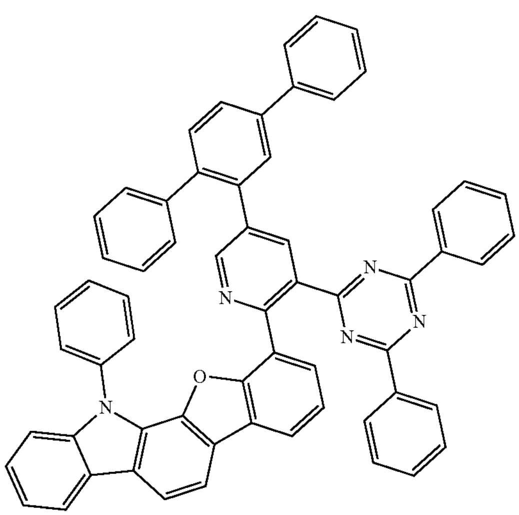
-continued
1071
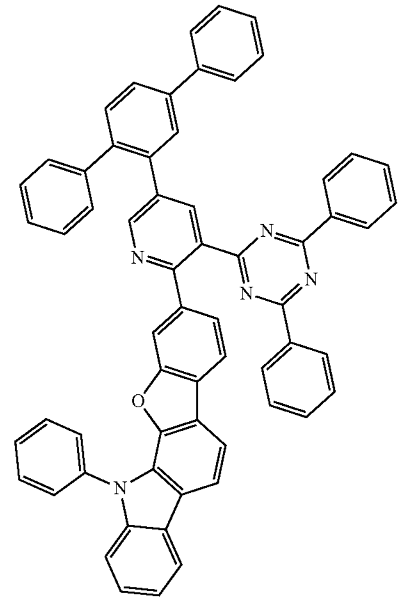
1072
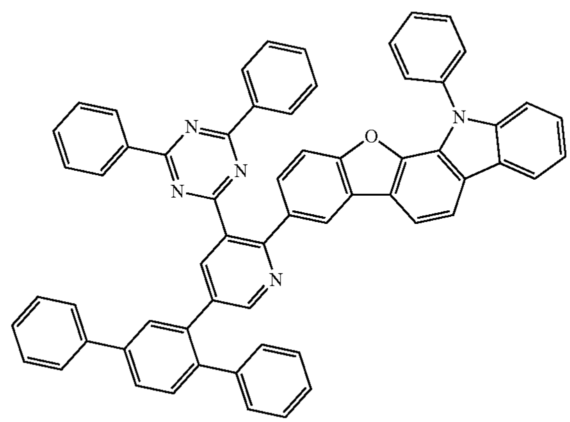
1073
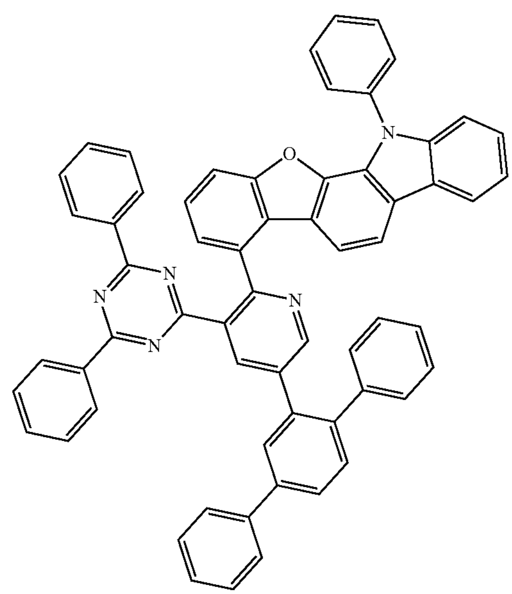

-continued
1074
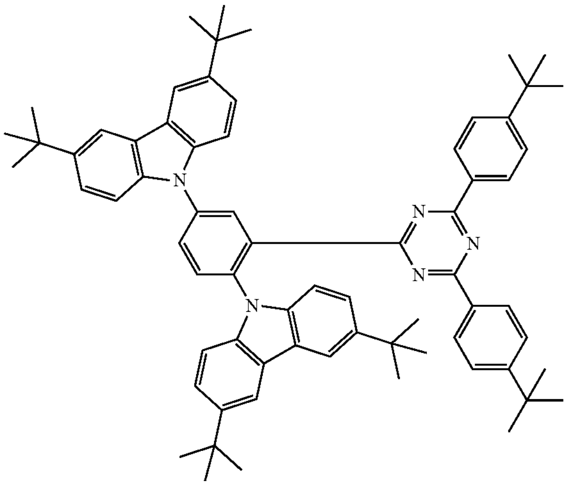
1075
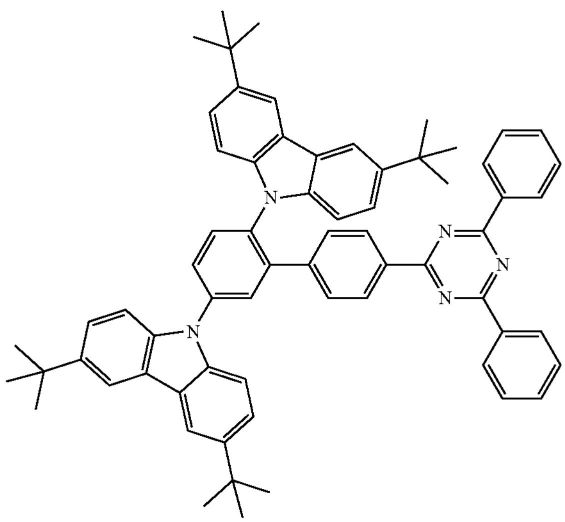
1076
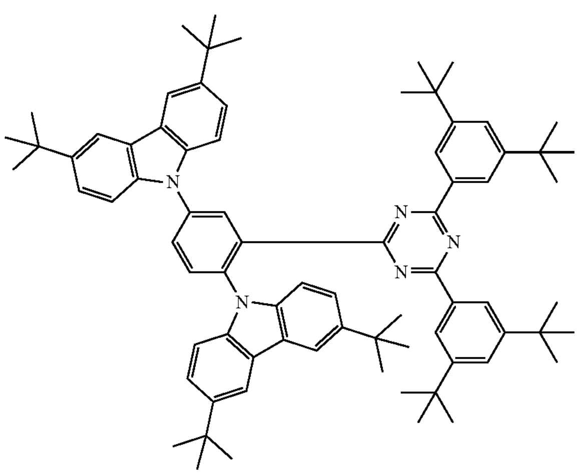
-continued
1077
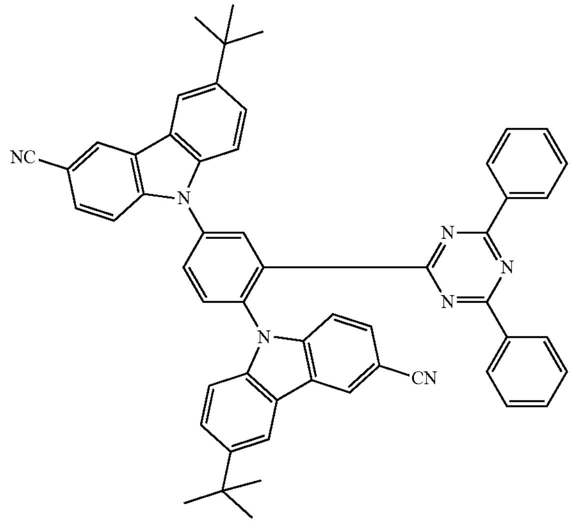
1078
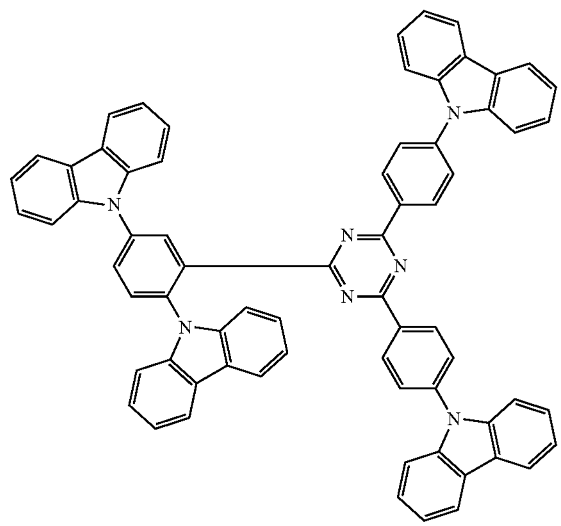
Group XI
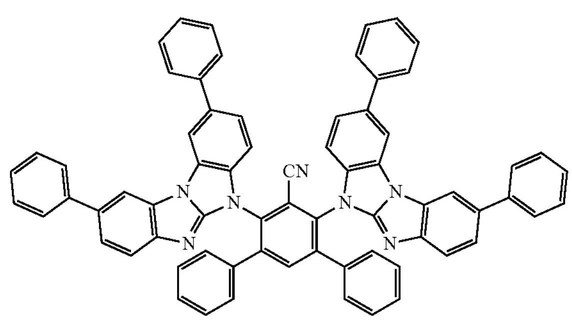

-continued

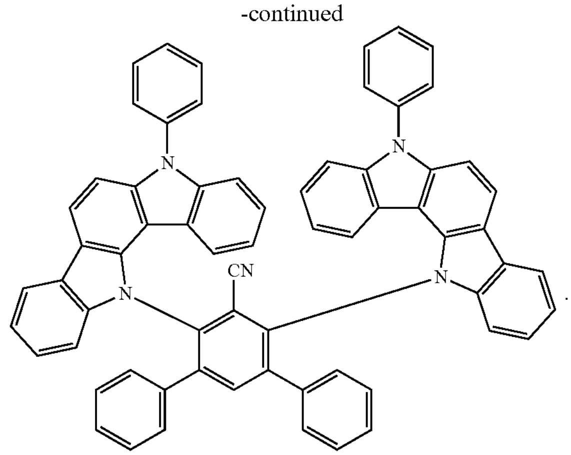

In an embodiment, the first electrode may be an anode, which is a hole injection electrode, and the second electrode may be a cathode, which is an electron injection electrode, or the first electrode may be a cathode, which is an electron injection electrode, and the second electrode may be an anode, which is a hole injection electrode.

In an embodiment, in the organic light-emitting device, the first electrode may be an anode, the second electrode may be a cathode, the organic layer may further include a hole transport region between the first electrode and the emission layer and an electron transport region between the emission layer and the second electrode, the hole transport region may include a hole injection layer, a hole transport layer, an electron blocking layer, a buffer layer, or any combination thereof, and the electron transport region may include a hole blocking layer, an electron transport layer, an electron injection layer, or any combination thereof.

The term "organic layer" used herein refers to a single layer and/or a plurality of layers between the first electrode and the second electrode of the organic light-emitting device. The "organic layer" may include, in addition to an organic compound, an organometallic complex including metal.

The term "sensitizer" used herein refers to a compound that is included in an organic layer (for example, an emission layer) and may deliver excitation energy to a light-emitting dopant compound.

OLED System

An organic light-emitting device according to an embodiment of the present disclosure may include an emission layer including a host compound, a first dopant compound, and a second dopant compound. An amount of the host in the emission layer may be greater than an amount of the dopant. In an embodiment, an amount of the host may be greater than a total amount of a first dopant and a second dopant.

An organic light-emitting device according to an embodiment of the present disclosure may include an emission layer including a host, a sensitizer, and a light-emitting dopant. In an embodiment, at least one of the first dopant compound and the second dopant compound may be a sensitizer, and the other may be a light-emitting dopant.

In an embodiment, the second dopant compound may include a compound having an energy relationship suitable for transferring excited singlet and/or excited triplet energy to the first dopant compound in a relationship with the first dopant compound.

In an embodiment, the sensitizer may include the second dopant, and the light-emitting dopant may be the organometallic compound.

Singlet excitons and triplet excitons of the second dopant compound may be respectively delivered to the excited singlet and excited triplet energy levels of the organometallic compound through a FRET mechanism and a DET mechanism, and triplet excitons of a phosphorescent dopant exhibit phosphorescent emission.

In an embodiment, the sensitizer may include the second dopant compound represented by Formula 1, and the light-emitting dopant may include a thermally activated delayed fluorescence (TADF) compound.

The singlet excitons and triplet excitons of the second dopant compound may be respectively delivered to the excited singlet and excited triplet energy levels of the first dopant compound through a FRET mechanism and a DET mechanism, and triplet excitons in the TADF compound may be converted to singlet excitons by reverse inter system crossing (RISC), and accumulated singlet excitons may be sequentially transitioned to a ground state, thereby exhibiting fluorescence.

In an embodiment, the sensitizer may include the second dopant compound represented by Formula 1, wherein the second dopant compound may be a TADF compound, and the light-emitting dopant may include the organometallic compound or a TADF compound.

In the TADF second dopant compound, triplet excitons are converted into singlet excitons by RISC, and at the same time, energy transfer to the light-emitting dopant by FRET and DET mechanisms may occur.

Since the sensitizer contains the second dopant compound represented by Formula 1, the triplet-triplet annihilation of the triplet excitons may be suppressed and the luminescence efficiency of the light-emitting dopant may be improved.

In an embodiment, the light-emitting dopant may include the second dopant compound represented by Formula 1, and the sensitizer may include the TADF compound or the organometallic compound. However, embodiments of the present disclosure are not limited thereto. Any suitable compound having an energy relationship in which excitons may be transferred to the second dopant compound may be included.

Excitons formed in the sensitizer are transferred to a light-emitting dopant compound through a DET mechanism or a FRET mechanism, and exciton energy transferred to the light-emitting dopant compound may emit light while being transitioned to a ground state.

In an embodiment, the excitons of the sensitizer may be formed by the FRET mechanism from the host compound, or may be formed by the delivery of excitons generated from the host by the DET mechanism.

In an embodiment, the sensitizer may be a TADF compound.

In addition, the sensitizer may satisfy Equation 1 below:

$$\Delta E_{ST} \leq 0.3 \text{ eV} \quad \text{Equation 1}$$

In an embodiment, $\Delta E_{ST}$ refers to an energy difference between the lowest excited singlet ($S_1$) and the lowest excited triplet ($T_1$).

The TADF compound may include singlet excitons and triplet excitons, and triplet excitons may be transferred to singlet excitons by RISC, and the singlet excitons accumulated in the excited singlet of the sensitizer may be energy-transitioned to the polycyclic compound by FRET and/or DET.

In an embodiment, the sensitizer may be the organometallic compound. In an embodiment, the sensitizer may be an organometallic compound including Pt as a central metal, but embodiments of the present disclosure are not limited thereto.

The organometallic compound may include singlet excitons and triplet excitons, and triplet excitons may be energy-transitioned to the excited triplet energy of the second dopant compound by the DET mechanism.

The organometallic compound may satisfy Equation 1 above, and when Equation 1 is satisfied, excitons may be delivered to the excited singlet and excited triplet energy levels of the second dopant compound by a mechanism similar to the TADF compound, that is, the FRET and/or DET mechanism.

In an embodiment, the excited singlet energy level and the excited triplet energy level of the sensitizer may be lower than the excited singlet energy and excited triplet energy of the host. Accordingly, excited singlet and triplet energy transfer from the host to the sensitizer may easily occur.

In an embodiment, the sensitizer and the light-emitting dopant may each independently include the second dopant compound represented by Formula 1.

In an embodiment, energy transfer between the sensitizer and the light-emitting dopant may be facilitated by FRET and DET mechanisms, and it is easy to manufacture a high-efficiency organic light-emitting device by suppressing triplet-triplet annihilation.

In general, it is known that since triplet excitons stay long in an excited state, they influence the decrease in the lifespan of organic light-emitting devices. While not wishing to be bound by theory, it is understood that due to the use of the second dopant compound, the time during which the sensitizer stays in the triplet excitons is reduced, and thus, the lifespan of an organic light-emitting device including the same may be improved.

In an embodiment, the second dopant compound may be a material capable of emitting fluorescent light. An emission layer emitting the fluorescent light may be clearly distinguished from an emission layer of the related art that emits phosphorescent light.

In an embodiment, the second dopant compound may emit TADF light.

The excited singlet and excited triplet energy levels of the second dopant compound may be lower than the excited singlet and excited triplet energy levels of the host compound described later. In an embodiment, singlet excitons and/or triplet excitons may be easily transitioned from the host compound to the second dopant compound.

The second dopant compound may receive singlet excitons and/or triplet excitons from the sensitizer.

In an embodiment, when the sensitizer is a TADF compound, the excited singlet energy level of the second dopant compound is lower than the excited singlet energy level of the sensitizer, and the second dopant compound may receive singlet excitons from the excited singlet of the sensitizer by the FRET and/or DET mechanism.

In an embodiment, when the sensitizer may be an organometallic compound, the excited triplet energy level of the second dopant compound may be lower than the excited triplet level of the sensitizer, and the second dopant compound may receive triplet excitons from the sensitizer by DET mechanism.

In an embodiment, when the sensitizer may be a TADF compound or an organometallic compound, the second dopant compound may further receive singlet excitons and/or triplet excitons from the host, and the triplet excitons received from the host may be transitioned to singlet energy of the second dopant compound by RISC.

While not wishing to be bound by theory, it is understood that due to this mechanism, triplet-triplet annihilation may be suppressed by reducing the time during which excitons stay in the excited triplet energy of the second dopant compound, and high-efficiency fluorescent light emission may be realized through the transition of multiple singlet excitons to the ground state.

An amount of the sensitizer in the emission layer may be from about 5 weight percentage (wt %) to less than about 50 wt %, for example, from about 5 wt % to about 40 wt %, from about 5 wt % to about 30 wt %, from about 5 wt % to about 20 wt %, from about 5 wt % to about 10 wt %, from about 10 wt % to about 50 wt %, from about 15 wt % to about 50 wt %, from about 20 wt % to about 50 wt %, from about 25 wt % to about 50 wt %, from about 30 wt % to about 50 wt %, from about 35 wt % to about 50 wt %, from about 40 wt % to about 50 wt %, or from about 45 wt % to about 50 wt %. Within these ranges, it is possible to achieve effective energy transfer in the emission layer, and accordingly, an organic light-emitting device having high efficiency and long lifespan may be obtained.

In an embodiment, the host, the first dopant compound, and the second dopant compound may satisfy the following Equation 2:

$$T_1(H)/S_1(H) \geq T_1(1D)/S_1(1D) \geq T_1(2D)/S_1(2D) \quad \text{Equation 2}$$

In Equation 2, $T_1(H)$ may be the lowest excited triplet energy level of the host, $S_1(H)$ may be the lowest excited singlet energy level of the host, $T_1(2D)$ may be a lowest excited triplet energy level of the second dopant compound, $S_1(2D)$ may be a lowest excited singlet energy level of the second dopant compound, $T_1(1D)$ may be a lowest excited triplet energy level of the first dopant, and $S_1(1D)$ may be a lowest excited singlet energy level of the first dopant.

While not wishing to be bound by theory, it is understood that when the host, the first dopant compound, and the second dopant compound further satisfy Equation 2 above, triplet excitons may be effectively transferred from the emission layer to the second dopant compound, and thus an organic light-emitting device having improved efficiency may be obtained.

A thickness of the emission layer may be in a range of about 100 Å to about 1,000 Å, for example, about 100 Å to about 600 Å, about 200 Å to about 600 Å, about 300 Å to about 500 Å, about 400 Å to about 800 Å, or about 500 Å to about 900 Å. When the thickness of the emission layer is within these ranges, improved light-emission characteristics may be obtained without a substantial increase in driving voltage.

Hereinafter, a configuration of an organic light-emitting device excluding an emission layer will be described with reference to FIGURE.

DESCRIPTION OF FIGURE

FIGURE is a schematic cross-sectional view of an organic light-emitting device 10 according to an embodiment. Hereinafter, a structure and a manufacturing method of an organic light-emitting device according to an embodiment of the present disclosure will be described with reference to FIGURE.

The organic light-emitting device 10 of FIGURE includes a first electrode 11, a second electrode 19 facing the first electrode 11, and an organic layer 10A between the first electrode 11 and the second electrode 19.

The organic layer 10A includes an emission layer 15, a hole transport region 12 is located between the first electrode 11 and the emission layer 15, and an electron transport region 17 is located between the emission layer 15 and the second electrode 19.

A substrate may be additionally located under the first electrode 11 or above the second electrode 19. For use as the substrate, any suitable substrate that is used in general organic light-emitting devices may be used, and the substrate may be a glass substrate or a transparent plastic substrate, each having suitable mechanical strength, thermal stability, transparency, surface smoothness, ease of handling, and water resistance.

First Electrode 11

In an embodiment, the first electrode 11 may be formed by depositing or sputtering a material for forming the first electrode 11 on the substrate. The first electrode 11 may be an anode. The material for forming the first electrode 11 may be materials with a suitable work function to facilitate hole injection. The first electrode 11 may be a reflective electrode, a semi-transmissive electrode, or a transmissive electrode. For use as the material for forming the first electrode 11, Indium tin oxide (ITO), indium zinc oxide (IZO), tin oxide ($SnO_2$), or zinc oxide (ZnO) may be used. In an embodiment, metals such as magnesium (Mg), aluminum (Al), aluminum-lithium (Al—Li), calcium (Ca), magnesium-indium (Mg—In), or magnesium-silver (Mg—Ag) may be used.

The first electrode 11 may have a single-layered structure or a multi-layered structure including two or more layers. In an embodiment, the first electrode 11 may have a three-layered structure of ITO/Ag/ITO, but embodiments of the present disclosure are not limited thereto.

The organic layer 10A may be located on the first electrode 11.

The organic layer 10A may include: the hole transport region 12; the emission layer 15; and the electron transport region 17.

Hole Transport Region 12

In the organic light-emitting device 10, the hole transport region 12 may be located between the first electrode 11 and the emission layer 15.

The hole transport region 12 may have a single-layered structure or a multi-layered structure.

In an embodiment, the hole transport region 12 may have a hole injection layer, a hole transport layer, a hole injection layer/hole transport layer structure, a hole injection layer/first hole transport layer/second hole transport layer structure, a hole transport layer/interlayer structure, a hole injection layer/hole transport layer/interlayer structure, a hole transport layer/electron blocking layer structure, or a hole injection layer/hole transport layer/electron blocking layer structure, but embodiments of the present disclosure are not limited thereto.

The hole transport region 12 may include any suitable compound that has hole transportation characteristics.

In an embodiment, the hole transport region 12 may include an amine-based compound.

In an embodiment, the hole transport region 12 may include at least one a compound represented by Formula 201 to a compound represented by Formula 205, but embodiments of the present disclosure are not limited thereto:

Formula 201

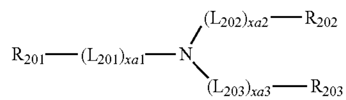

Formula 202

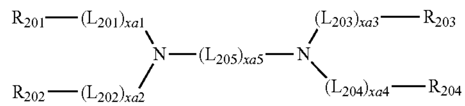

Formula 203

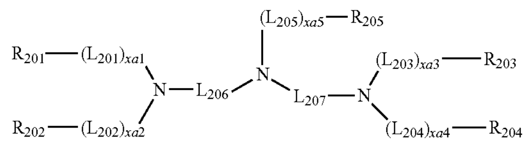

Formula 204

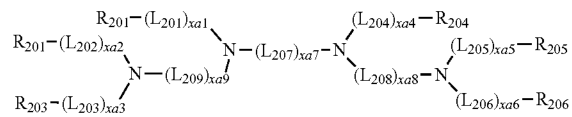

Formula 205

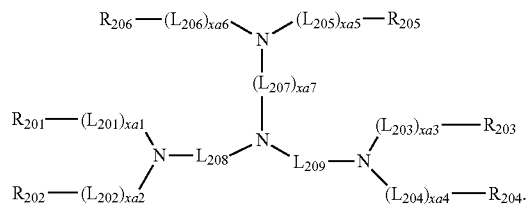

In Formulae 201 to 205, $L_{201}$ to $L_{209}$ may each independently be *—O—*', *—S—*', a substituted or unsubstituted $C_5$-$C_{60}$ carbocyclic group, or a substituted or unsubstituted $C_1$-$C_{60}$ heterocyclic group, xa1 to xa9 may each independently an integer from 0 to 5, and $R_{201}$ to $R_{206}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_6$-$C_{60}$ aryl alkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_1$-$C_{60}$ heteroalkyl aryl group, a substituted or unsubstituted monovalent non-aromatic condensed polycyclic group, or a substituted or unsubstituted monovalent non-aromatic condensed heteropolycyclic group, and two neighboring groups of $R_{201}$ to $R_{206}$ may optionally be linked to each other via a single bond, a dimethyl-methylene group, or a diphenyl-methylene group.

In an embodiment, $L_{201}$ to $L_{209}$ may be a phenyl group, a heptalene group, an indene group, a naphthalene group, an azulene group, a heptalene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a coronene group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, or a triindolobenzene group, each independently unsubstituted or substituted with deuterium, a $C_1$-$C_{10}$ alkyl group, a $C_1$-$C_{10}$ alkoxy group, a $C_1$-$C_{10}$ alkylthio group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, —$Si(Q_{11})(Q_{12})(Q_{13})$, or any combination thereof, xa1 to xa9 may each independently be 0, 1, or 2, $R_{201}$ to $R_{206}$ may each independently be a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an indeno carbazolyl group, an indolocarbazolyl group, a benzofurocarbazolyl group, or benzothienocarbazolyl group, each independently unsubstituted or substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_1$-$C_{20}$ alkylthio group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, —$N(Q_{31})(Q_{32})$, or any combination thereof, and $Q_{11}$ to $Q_{13}$ and $Q_{31}$ to $Q_{33}$ may each independently be a $C_1$-$C_{10}$ alkyl group, a $C_1$-$C_{10}$ alkoxy group, a $C_1$-$C_{10}$ alkylthio group, a phenyl group, a biphenyl group, a terphenyl group, or a naphthyl group.

In an embodiment, the hole transport region 12 may include a carbazole-containing amine-based compound.

In one or more embodiments, the hole transport region 12 may include a carbazole-containing amine-based compound and a carbazole-free amine-based compound.

The carbazole-containing amine-based compound may be, for example, compounds represented by Formula 201 including a carbazole group and further including at least one of a dibenzofuran group, a dibenzothiophene group, a fluorene group, a spiro-bifluorene group, an indenocarbazole group, an indolocarbazole group, a benzofurocarbazole group, or a benzothienocarbazole group.

The carbazole-free amine-based compound may be, for example, compounds represented by Formula 201 that do not include a carbazole group and that include at least one of a dibenzofuran group, a dibenzothiophene group, a fluorene group, a spiro-bifluorene group, an indenocarbazole group, an indolocarbazole group, a benzofurocarbazole group, or a benzothienocarbazole group.

In an embodiment, the hole transport region 12 may include at least one compounds represented by Formulae 201 or 202.

In an embodiment, the hole transport region 12 may include at least one compound represented by Formulae 201-1, 202-1, or 201-2, but embodiments of the present disclosure are not limited thereto:

Formula 201-1

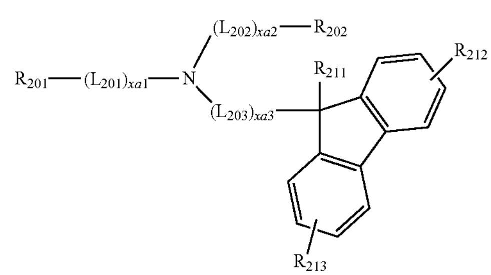

Formula 202-1

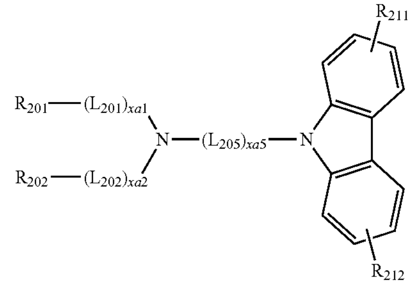

-continued

Formula 202-1

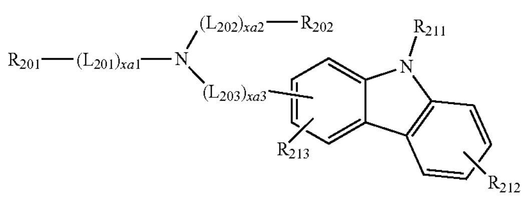

In Formulae 201-1, 202-1, and 201-2, $L_{201}$ to $L_{203}$, $L_{205}$, xa1 to xa3, xa5, $R_{201}$, and $R_{202}$ are the same as described herein, and $R_{211}$ to $R_{213}$ may each independently be hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a $C_1$-$C_{20}$ alkylthio group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a dimethylfluorenyl group, a diphenyl fluorenyl group, a triphenylenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, or a pyridinyl group.

In an embodiment, the hole transport region 12 may include at least one Compounds HT1 to HT39, but embodiments of the present disclosure are not limited thereto.

HT1

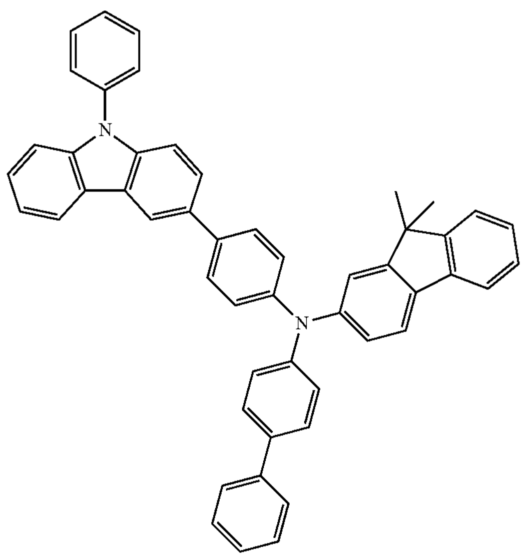

HT2

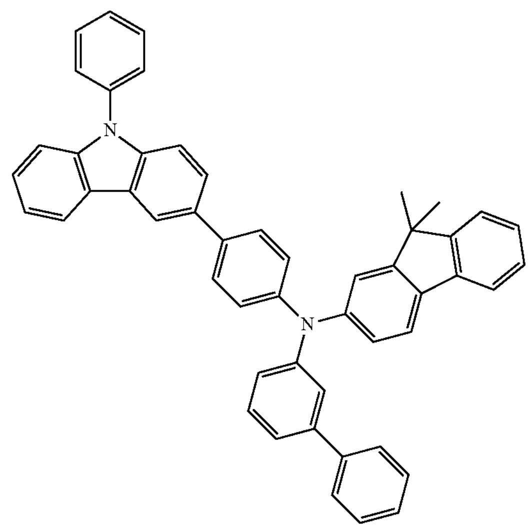

HT3

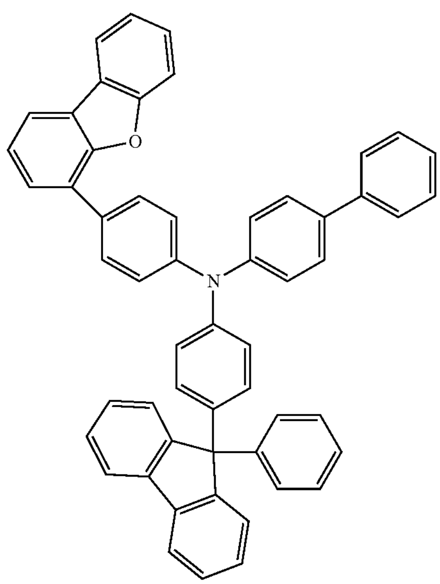

HT4

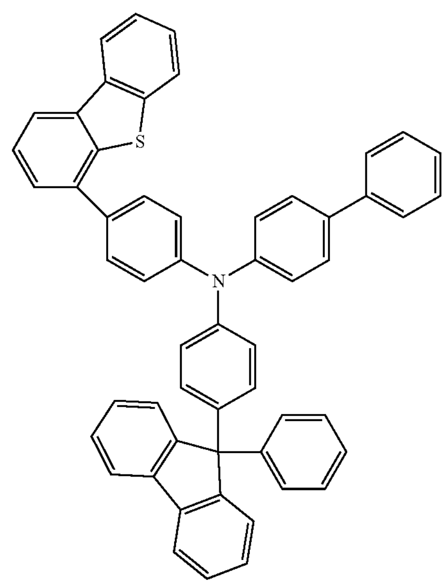

-continued
HT5
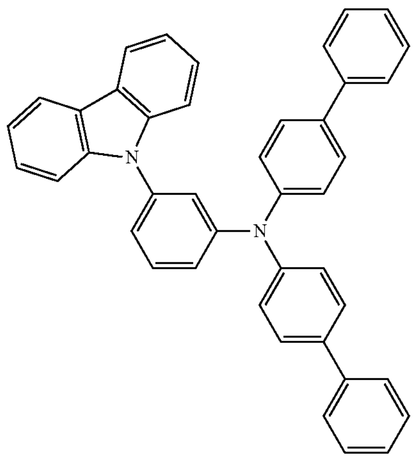
HT6
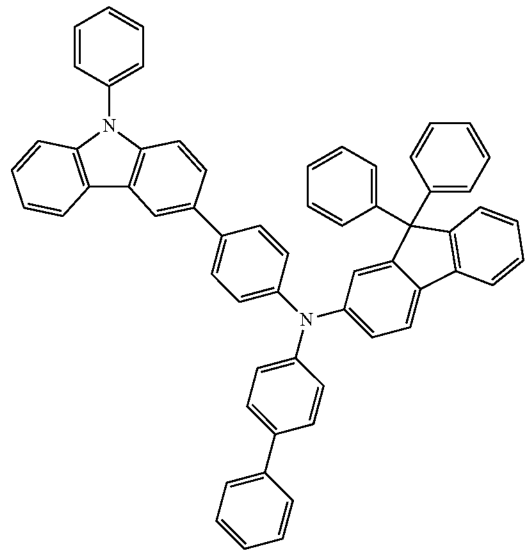
HT7
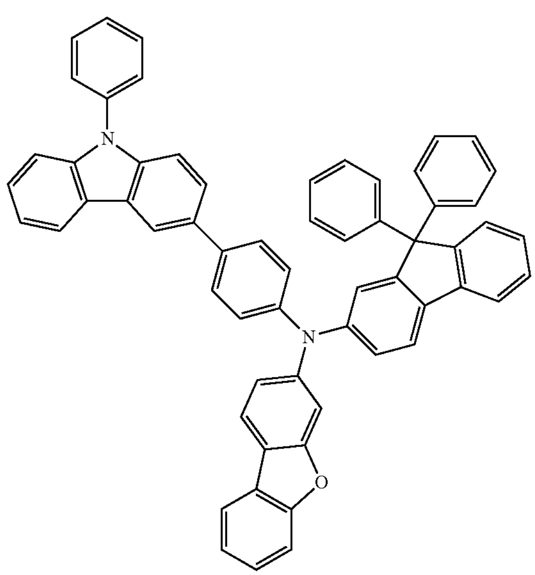
HT8
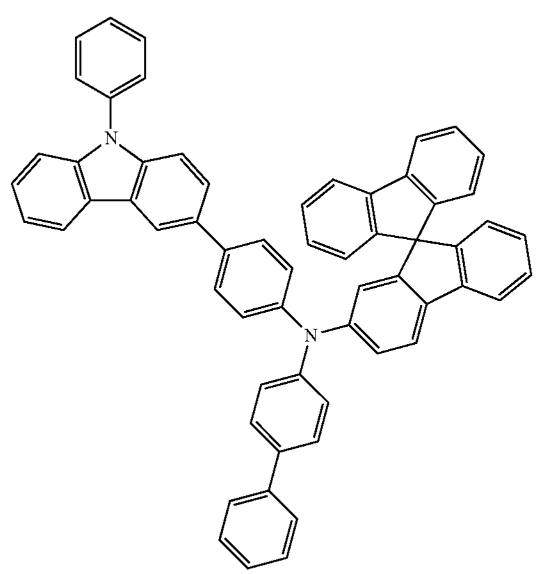

-continued
HT9
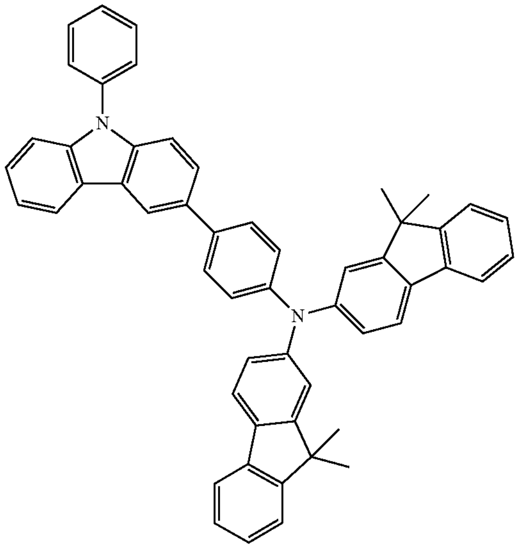
HT10
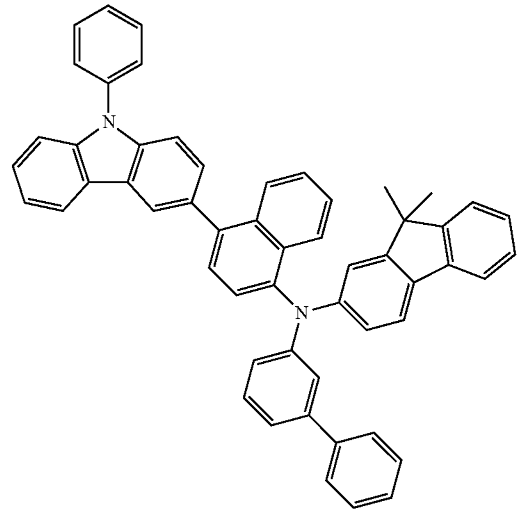
HT11
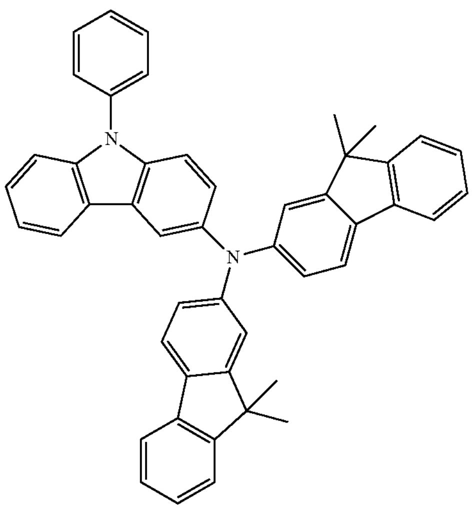
HT12
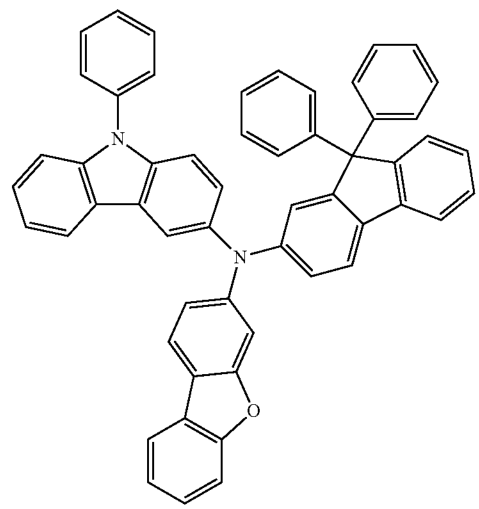
HT13
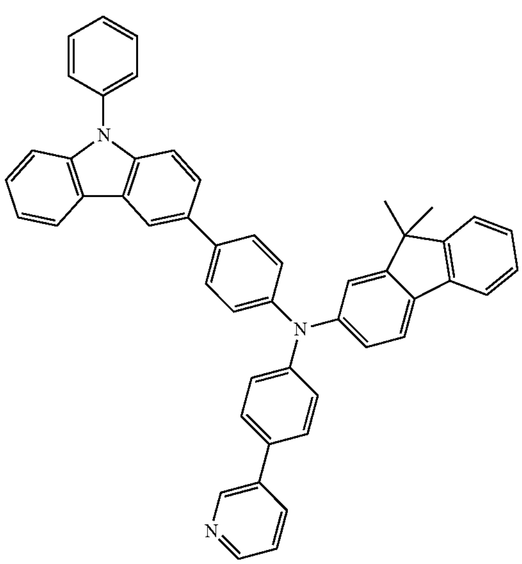
HT14
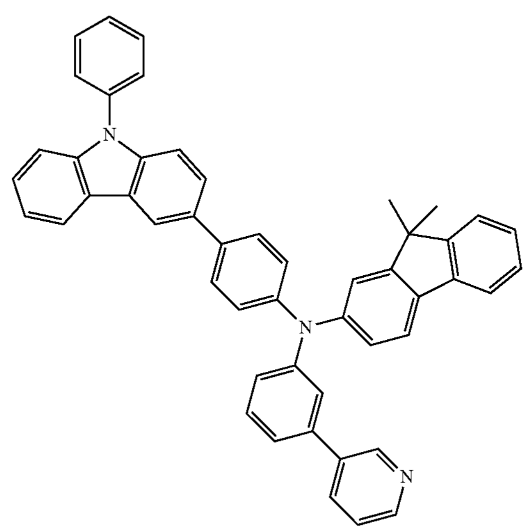

-continued
HT15
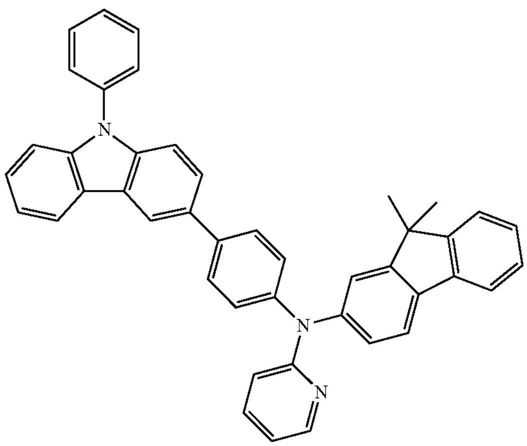
HT16
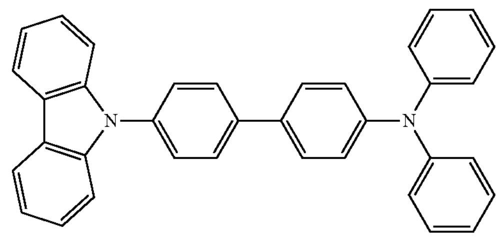
HT17
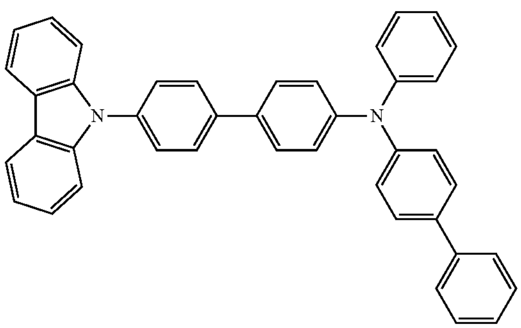
HT18
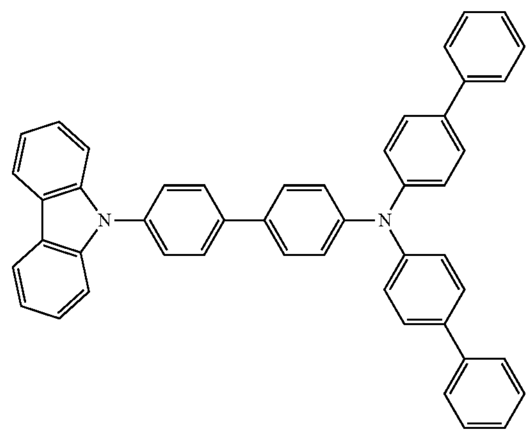
HT19
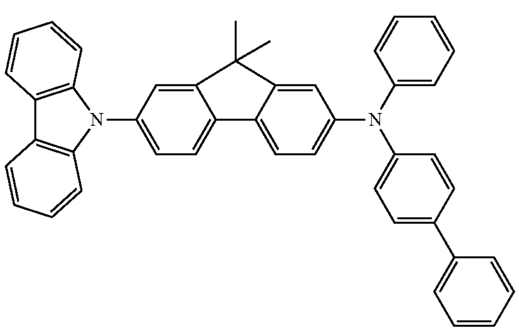
HT20
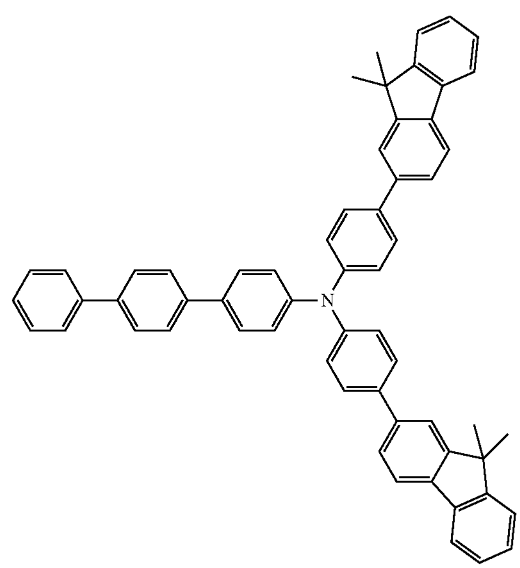

-continued
HT21
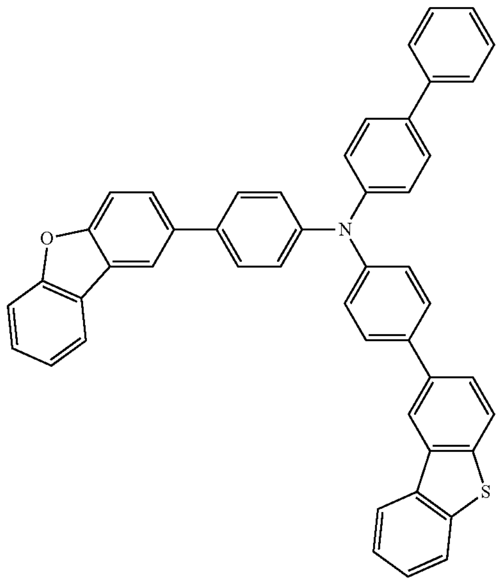
HT22
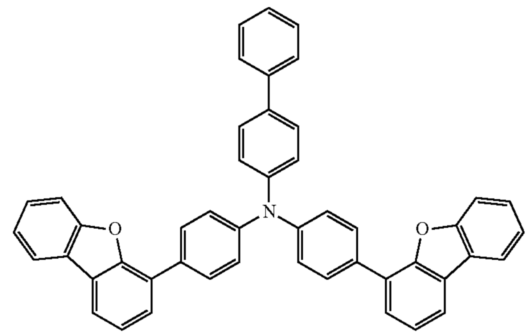
HT23
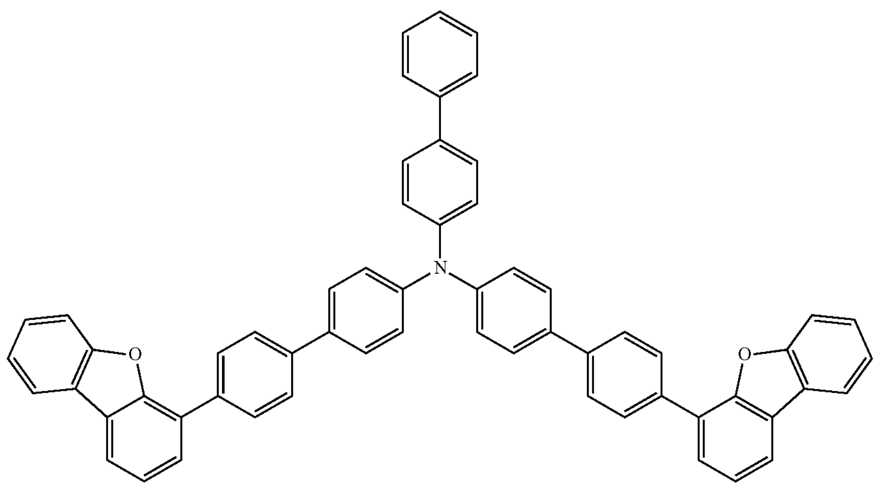
HT24
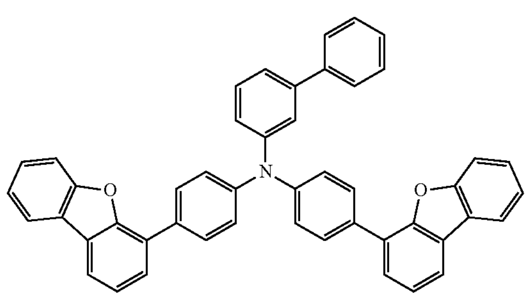
HT25
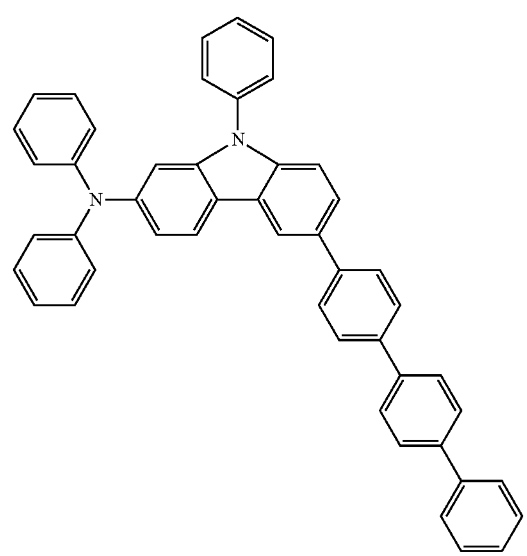

-continued
HT26
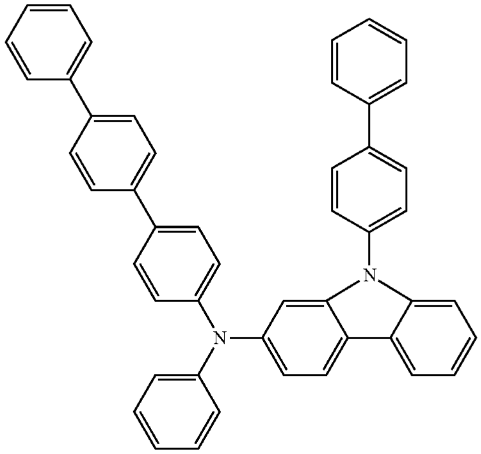
HT27
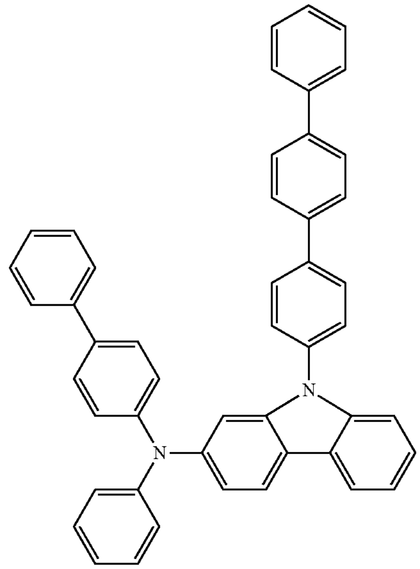
HT28
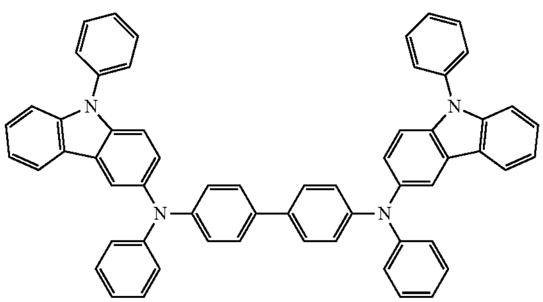
HT29
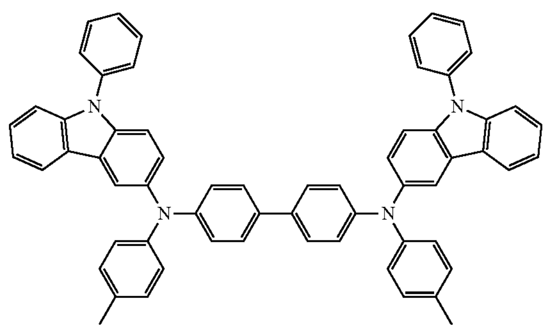
HT30
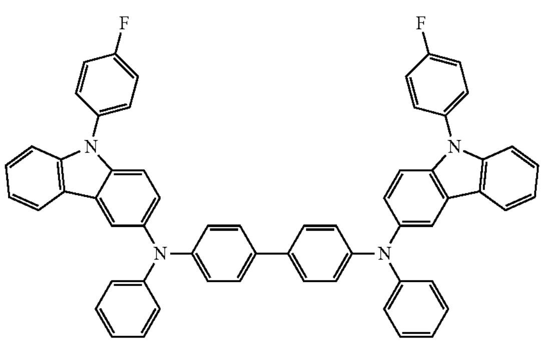
HT31
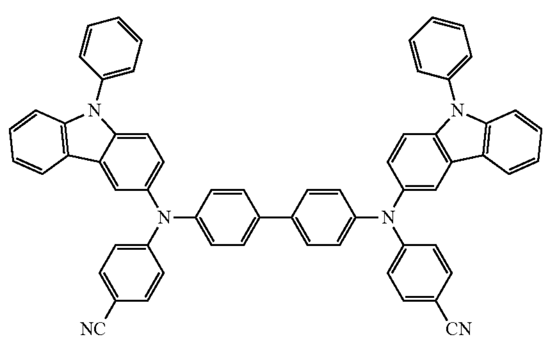

-continued
HT32
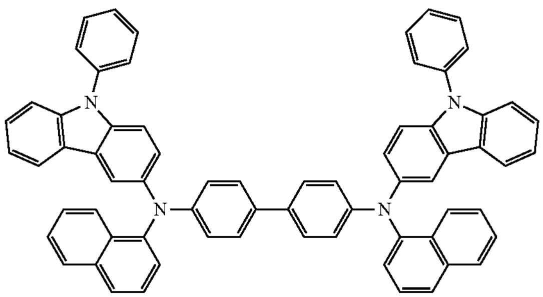
HT33
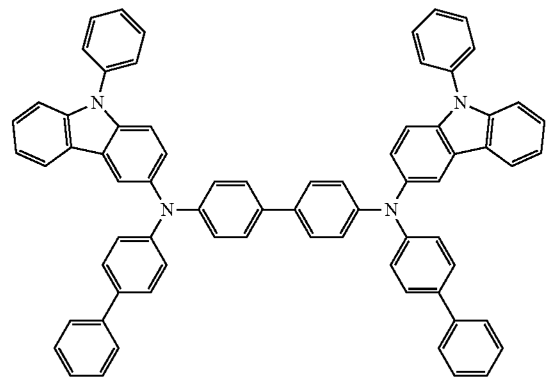
HT34
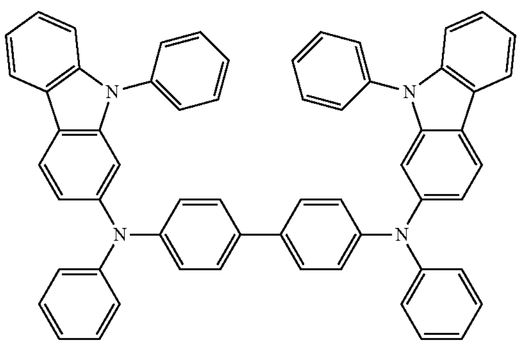
HT35
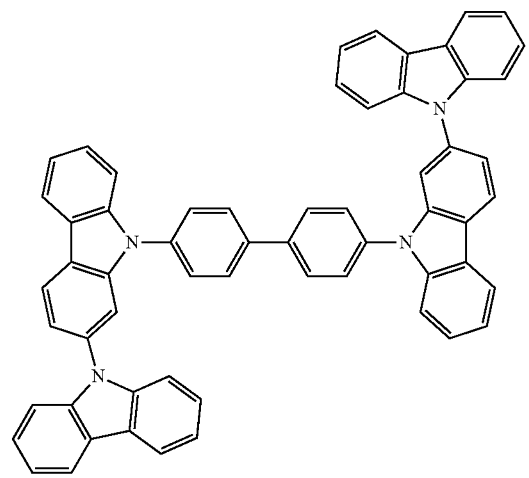
HT36
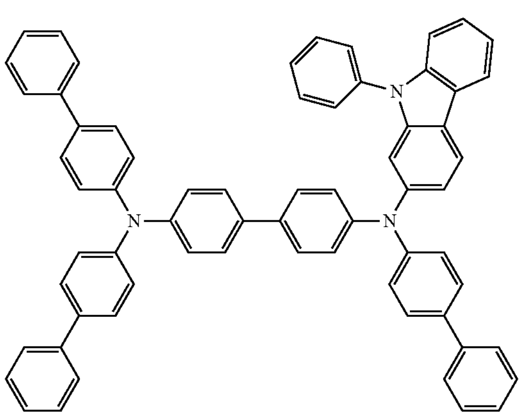
HT37
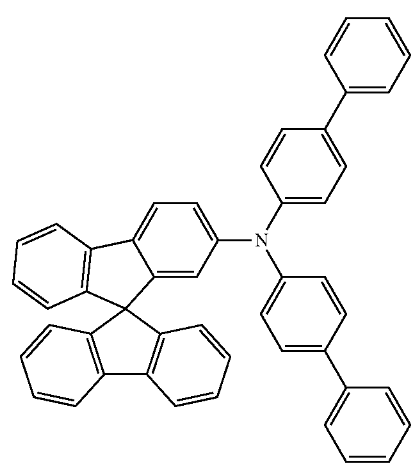

-continued

HT38

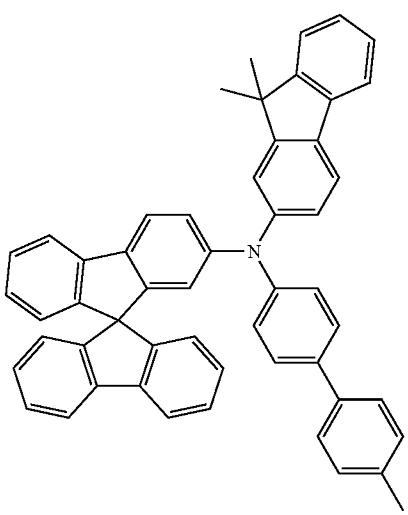

HT39

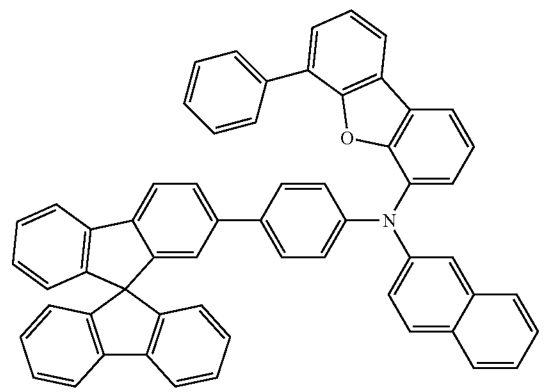

In an embodiment, the hole transport region 12 of the organic light-emitting device 10 may further include a p-dopant. When the hole transport region 12 further includes a p-dopant, the hole transport region 12 may have a structure including a matrix (for example, at least one of compounds represented by Formulae 201 to 205) and a p-dopant included in the matrix. The p-dopant may be uniformly or non-uniformly doped in the hole transport region 12.

In an embodiment, a LUMO energy level of the p-dopant may be −3.5 electronvolt (eV) or less.

The p-dopant may include at least one a quinone derivative, a metal oxide, or a cyano group-containing compound, but embodiments of the present disclosure are not limited thereto.

In an embodiment, the p-dopant may include at least one:

a quinone derivative, such as tetracyanoquinodimethane (TCNQ), 2,3,5,6-tetrafluoro-7,7,8,8-tetracyanoquinodimethane (F4-TCNQ), or F6-TCNNQ;

a metal oxide, such as tungsten oxide or molybdenum oxide;

1,4,5,8,9,12-hexaazatriphenylene-hexacarbonitrile (HAT-CN);

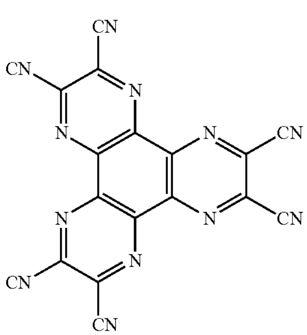

HAT-CN

-continued

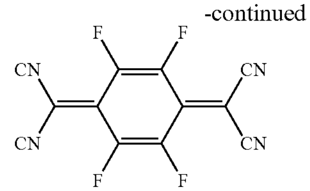

F4-TCNQ

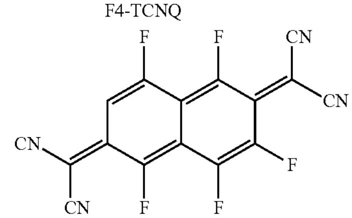

F6-TCNNQ or a compound represented by Formula 221 below, but embodiments of the present disclosure are not limited thereto:

Formula 221

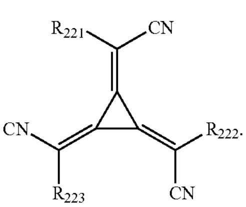

In Formula 221, $R_{221}$ to $R_{223}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, wherein at least one $R_{221}$ to $R_{223}$ may have at least one substituent a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, or a $C_1$-$C_{20}$ alkyl group substituted with —I.

The hole transport region 12 may have a thickness of about 100 Å to about 10,000 Å, for example, about 200 Å to about 1000 Å, about 400 Å to about 2,000 Å, about 500 Å to about 3000 Å, about 600 Å to about 4000 Å, about 700 Å to about 5000 Å, about 800 Å to about 6000 Å, about 900 Å to about 7000 Å, about 1000 Å to about 8000 Å, or about 2000 Å to about 9000 Å, and the emission layer 15 may have a thickness of about 100 Å to about 3,000 Å, for example, about 100 Å to about 500 Å, about 300 Å to about 1,000 Å, about 400 Å to about 1500 Å, about 500 Å to about 2000 Å, or about 600 Å to about 2500 Å. When the thickness of each of the hole transport region 12 and the emission layer 15 is within these ranges described above, satisfactory hole transportation characteristics and/or luminescence characteristics may be obtained without a substantial increase in driving voltage.

Emission Layer 15

The emission layer is the same as described in above.

In an embodiment, the emission layer may emit blue light, for example, blue light having a maximum emission wavelength of 450 or more (for example, 450 nanometers (nm) or more and 500 nm or less).

Electron Transport Region 17

Next, an electron transport region is located on the emission layer.

The electron transport region 17 may be located between the emission layer 15 and the second electrode 19 of the organic light-emitting device 10.

The electron transport region 17 may have a single-layered structure or a multi-layered structure.

In an embodiment, the electron transport region 17 may have an electron transport layer, an electron transport layer/electron injection layer structure, a buffer layer/electron transport layer structure, a hole blocking layer/electron transport layer structure, a buffer layer/electron transport layer/electron injection layer structure, or a hole blocking layer/electron transport layer/electron injection layer structure, but embodiments of the present disclosure are not limited thereto. The electron transport region 17 may further include an electron control layer.

The electron transport region 17 may include a known electron transport material.

The electron transport region (for example, a buffer layer, a hole blocking layer, an electron control layer, or an electron transport layer in the electron transport region) may include a metal-free compound containing at least one π-electron-deficient nitrogen-containing $C_1$-$C_{60}$ cyclic group. The π-electron-deficient nitrogen-containing $C_1$-$C_{60}$ cyclic group is the same as described above.

In an embodiment, the electron transport region may include a compound represented by Formula 601 below.

$$[Ar_{601}]_{xe11}\text{-}[(L_{601})_{xe1}\text{-}R_{601}]_{xe21} \quad \text{Formula 601}$$

In Formula 601, $Ar_{601}$ and $L_{601}$ may each independently be a $C_5$-$C_{60}$ carbocyclic group unsubstituted or substituted with at least one $R_{601a}$ or a $C_1$-$C_{60}$ heterocyclic group unsubstituted or substituted with at least one $R_{601a}$, xe11 may be 1, 2, or 3, xe1 may be an integer from 0 to 5, $R_{601a}$ and $R_{601}$ may each independently be a substituted or unsubstituted $C_3$-$C_{10}$ cycloalkyl group, a substituted or unsubstituted $C_1$-$C_1$ heterocycloalkyl group, a substituted or unsubstituted $C_3$-$C_{10}$ cycloalkenyl group, a substituted or unsubstituted $C_1$-$C_1$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), $Q_{601}$ to $Q_{603}$ may each independently be a $C_1$-$C_1$ alkyl group, a $C_1$-$C_1$ alkoxy group, a $C_1$-$C_1$ alkylthio group, a phenyl group, a biphenyl group, a terphenyl group, or a naphthyl group, and xe21 may be an integer from 1 to 5.

In an embodiment, at least one of $Ar_{601}$(s) in the number of xe11 and $R_{601}$(s) in the number of xe21 may include the π-electron-deficient nitrogen-containing $C_1$-$C_{60}$ cyclic group.

In an embodiment, ring $Ar_{601}$ and $L_{601}$ in Formula 601 may each independently be a phenyl group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, a benzoisoxazole group, a triazole group, a tetrazole group, an oxadiazole group, a triazine group, a thiadiazole group, an imidazopyridine group, an imidazopyrimidine group, or an azacarbazole group, each independently unsubstituted or substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_1$-$C_{20}$ alkylthio group, a phenyl group, a biphenyl group, a terphenyl group, a naphthyl group, —Si($Q_{31}$)($Q_{32}$)($Q_{33}$), —S(=O)$_2$($Q_{31}$), —P(=O)($Q_{31}$)($Q_{32}$), or any combination thereof, and $Q_{31}$ to $Q_{33}$ may each independently be a $C_1$-$C_{10}$ alkyl group, a $C_1$-$C_{10}$ alkoxy group, a $C_1$-$C_{10}$ alkylthio group, a phenyl group, a biphenyl group, a terphenyl group, or a naphthyl group.

When xe11 in Formula 601 is 2 or more, two or more of $Ar_{601}$(s) may be linked via a single bond.

In an embodiment, $Ar_{601}$ in Formula 601 may be an anthracene group.

In an embodiment, a compound represented by Formula 601 may be represented by Formula 601-1 below:

Formula 601-1

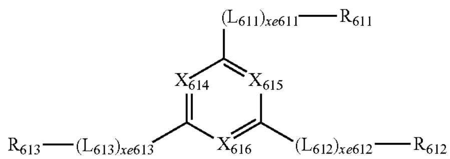

In Formula 601-1, $X_{614}$ may be N or $C(R_{614})$, $X_{615}$ may be N or $C(R_{615})$, $X_{616}$ may be N or $C(R_{616})$, and at least one $X_{614}$ to $X_{616}$ may be N, $L_{611}$ to $L_{613}$ are each understood by referring to corresponding descriptions provided in connection with $L_{601}$, xe611 to xe613 are each understood by referring to corresponding descriptions provided in connection with xe1, $R_{611}$ to $R_{613}$ are each understood by referring to corresponding descriptions provided in connection with $R_{601}$, and $R_{614}$ to $R_{616}$ may each independently be hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_1$-$C_{20}$ alkylthio group, a phenyl group, a biphenyl group, a terphenyl group, or a naphthyl group.

In an embodiment, xe1 and xe611 to xe613 in Formulae 601 and 601-1 may each independently be 0, 1, or 2.

In an embodiment, $R_{601}$ and $R_{611}$ to $R_{613}$ in Formulae 601 and 601-1 may each independently be a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzoisothiazolyl group, a benzoxazolyl group, an isobenzoxazolyl group, a triazolyl group, a tetrazolyl group, an imidazopyridinyl group, an imidazopyrimidinyl group, or azacarbazolyl group, each independently unsubstituted or substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_1$-$C_{20}$ alkylthio group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzoisothiazolyl group, a benzoxazolyl group, an isobenzoxazolyl group, a triazolyl group, a tetrazolyl group, an imidazopyridinyl group, an imidazopyrimidinyl group, an azacarbazolyl group, or any combination thereof; or —S(=O)$_2$($Q_{601}$) or —P(=O)($Q_{601}$)($Q_{602}$), and $Q_{601}$ and $Q_{602}$ are the same as described above.

The electron transport region may include at least one Compounds ET1 to ET36 below, but embodiments of the present disclosure are not limited thereto:

ET1

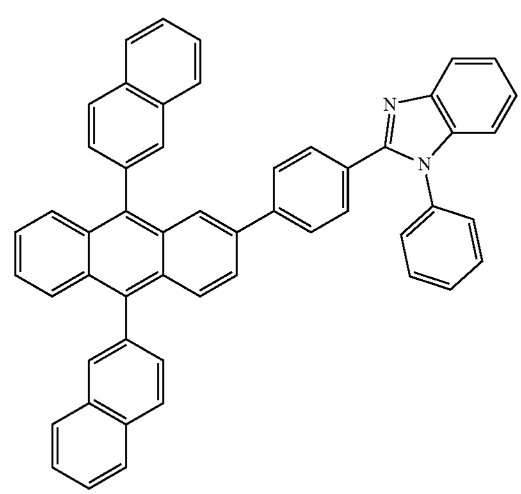

-continued
ET2
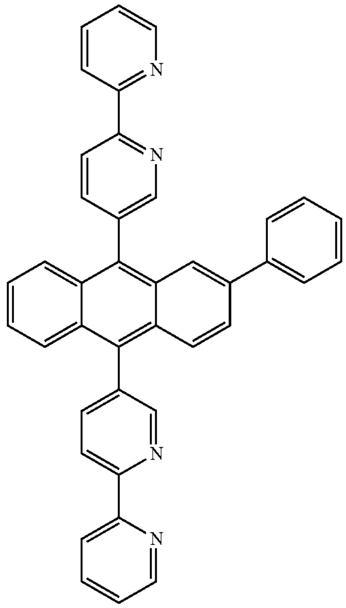
ET3
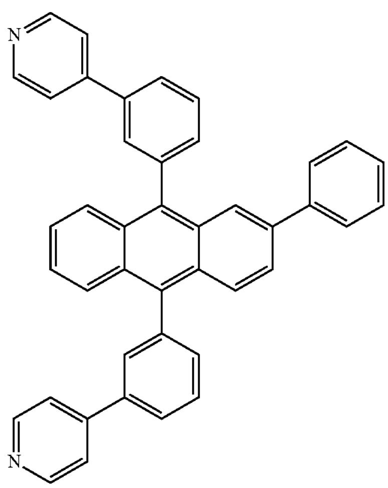
ET4
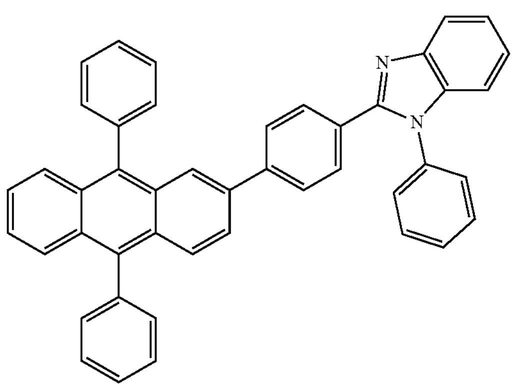
-continued
ET5
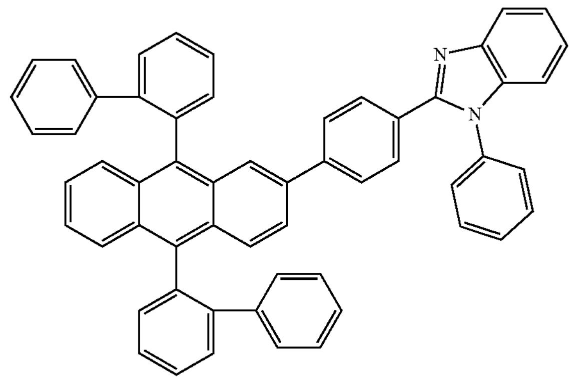
ET6
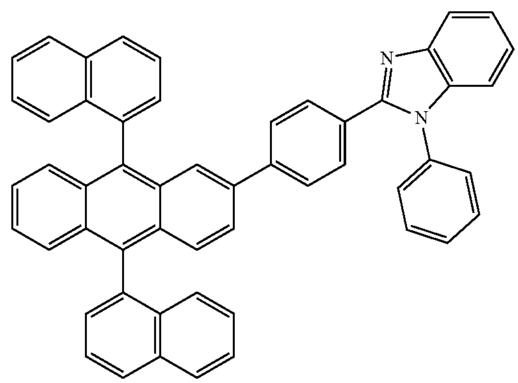
ET7
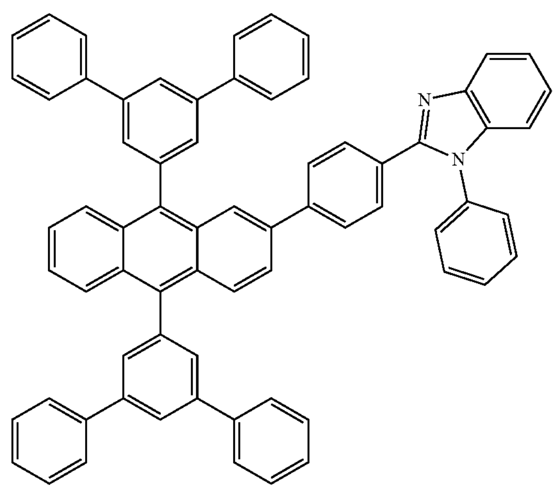

ET8
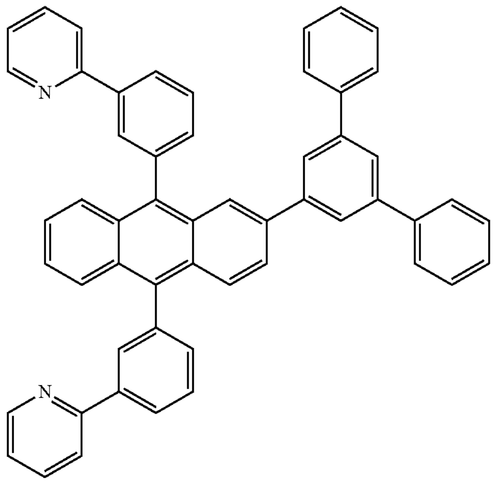
ET9
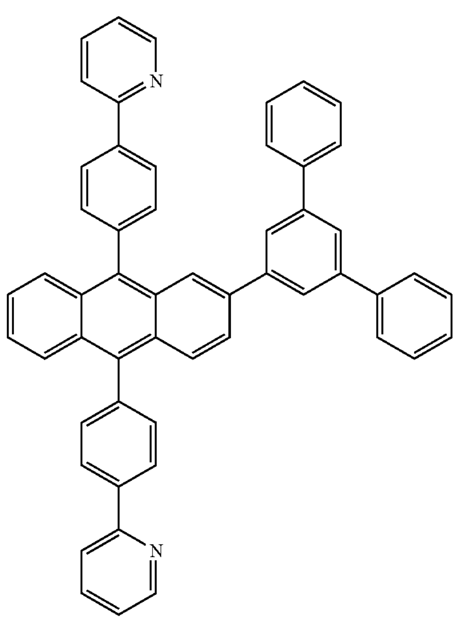
ET10
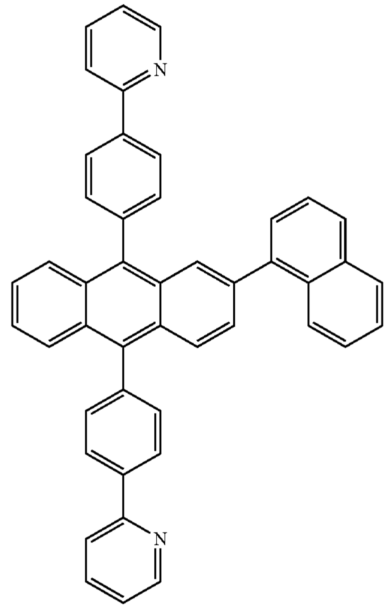
ET11
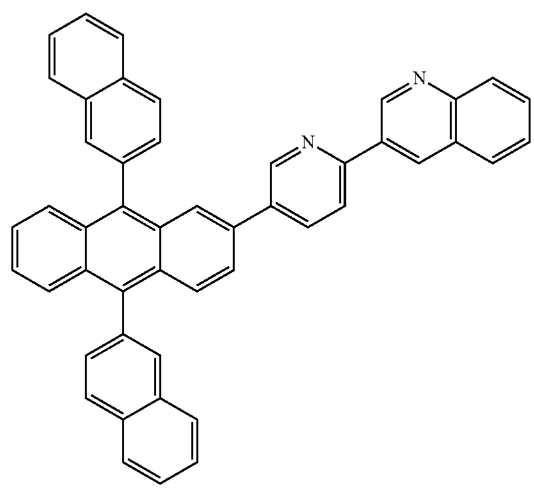
ET12
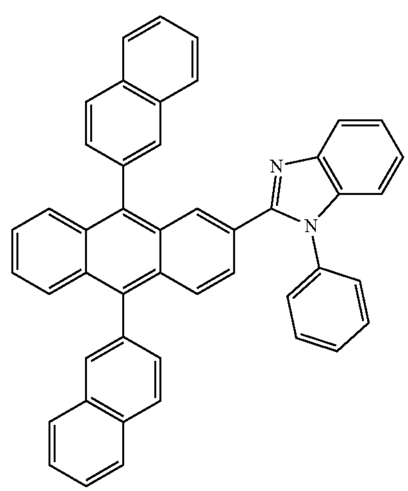

-continued
ET13
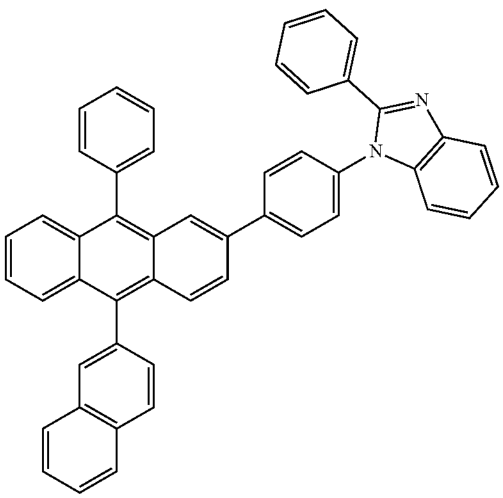
ET14
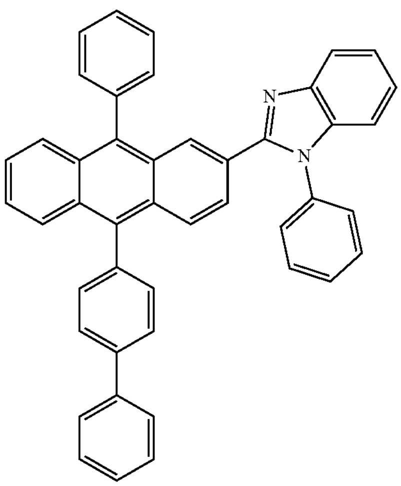
ET15
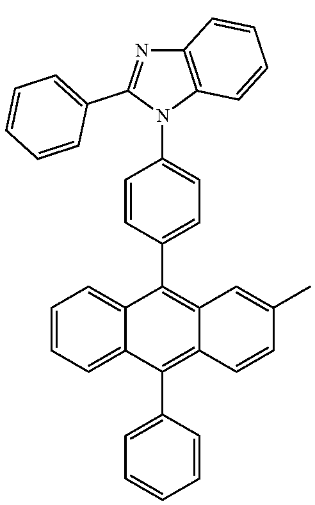
-continued
ET16
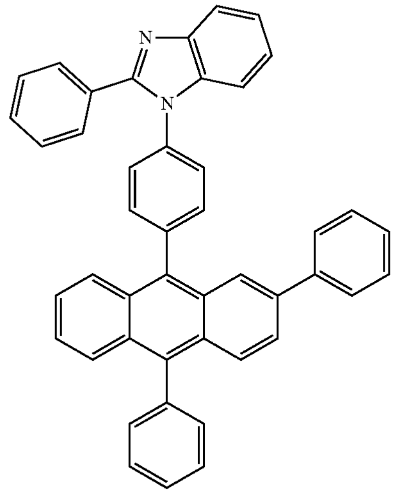
ET17
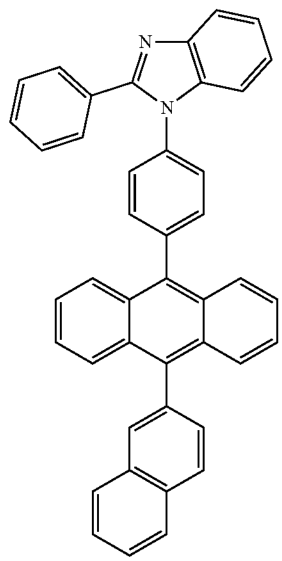
ET18
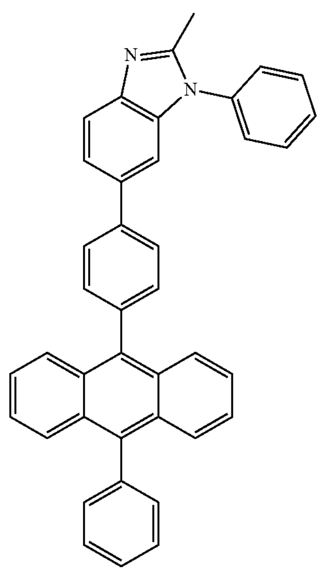

-continued
ET19
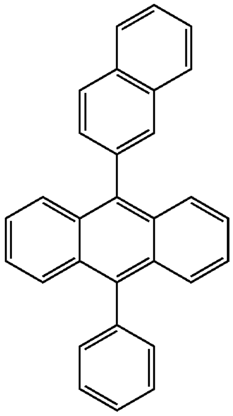
ET20
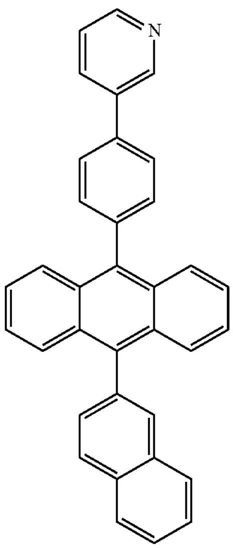
ET21
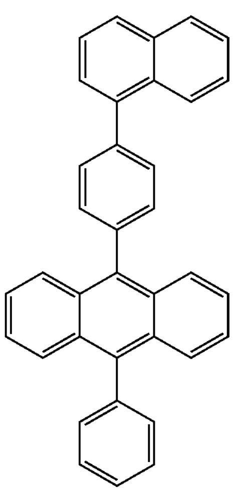
-continued
ET22
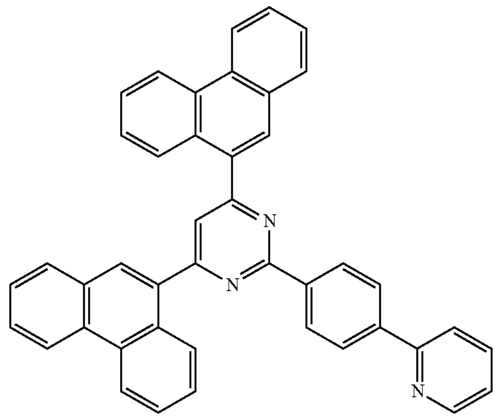
ET23
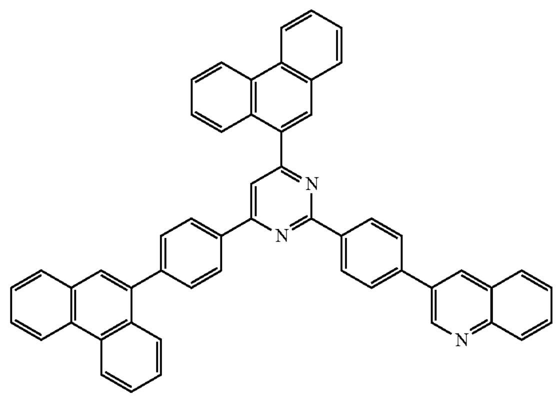
ET24
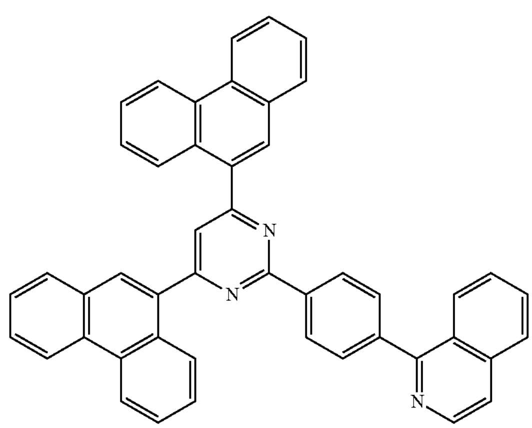

-continued
ET25
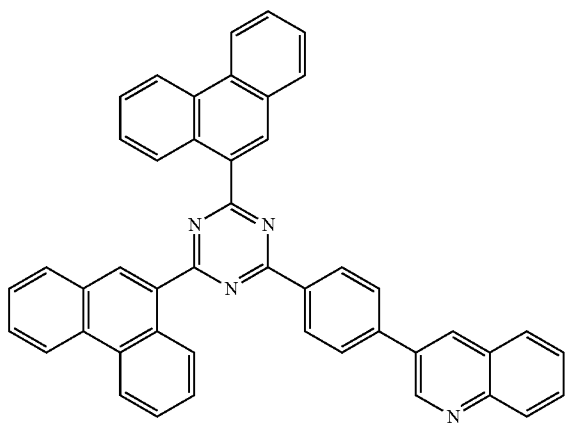
ET26
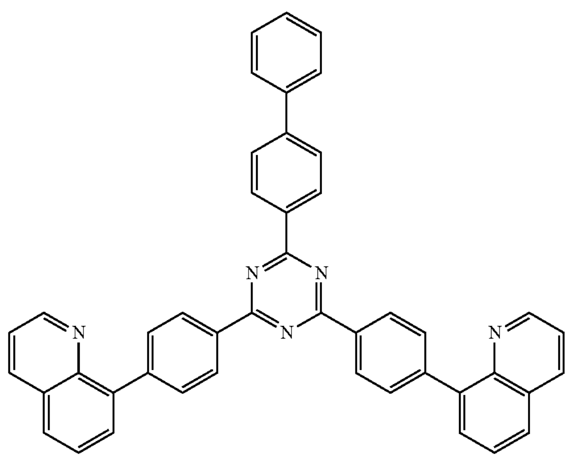
ET27
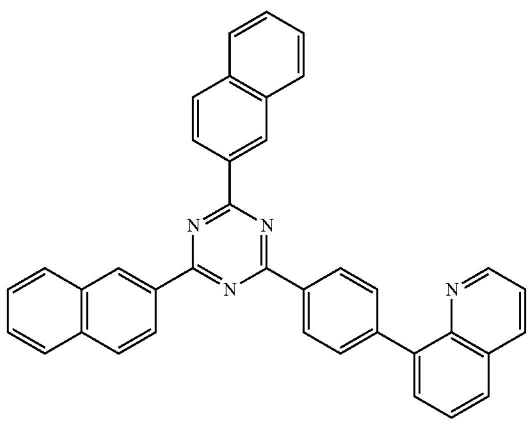
-continued
ET28
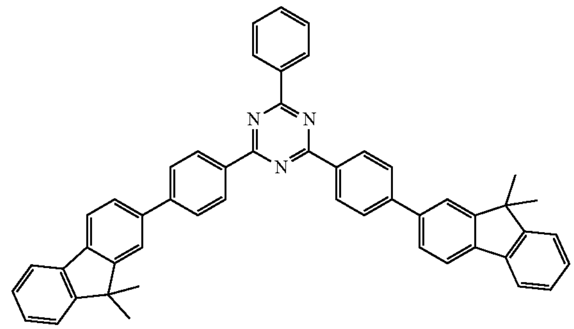
ET29
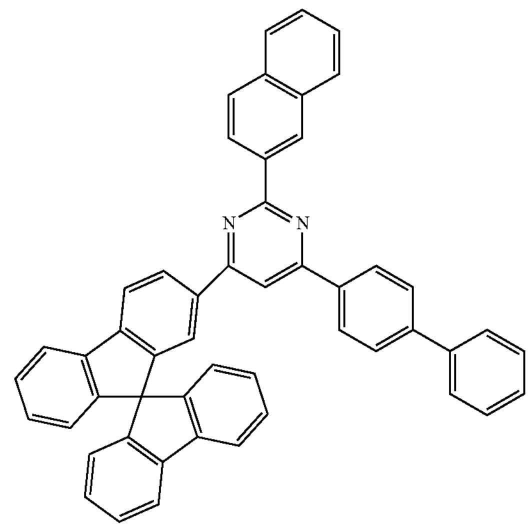
ET30
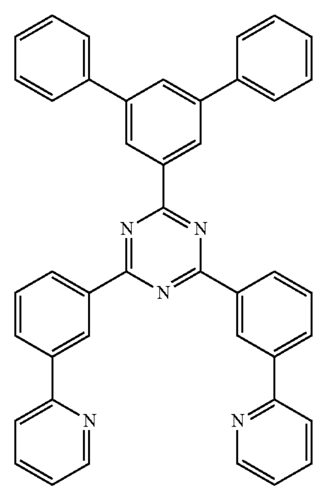

-continued
ET31
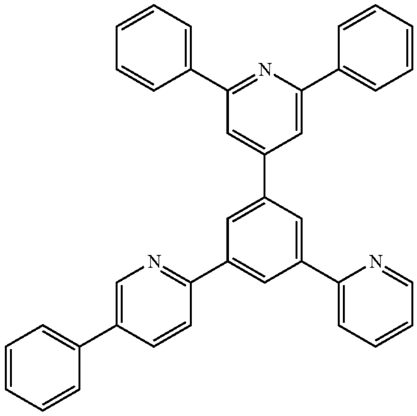
ET32
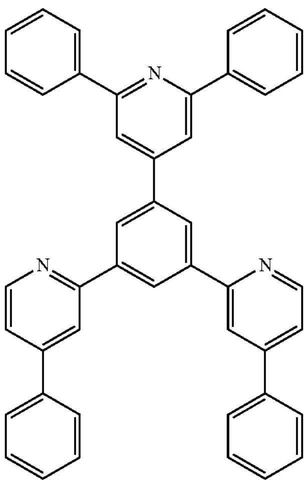
ET33
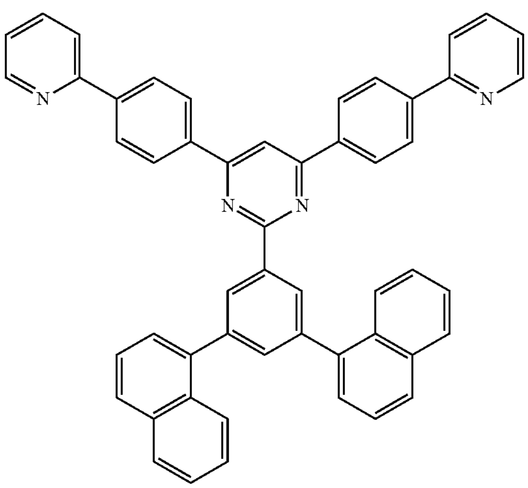
-continued
ET34
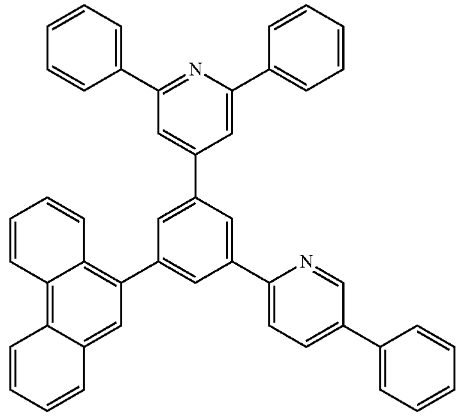
ET35
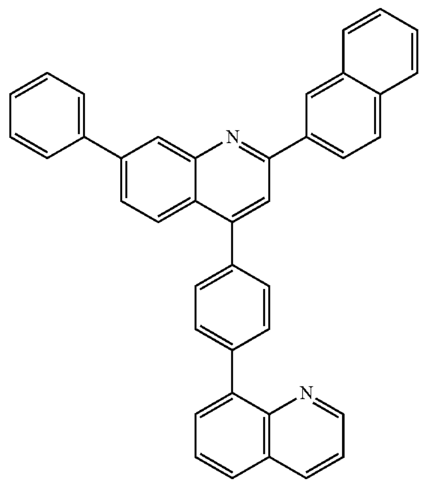
ET36
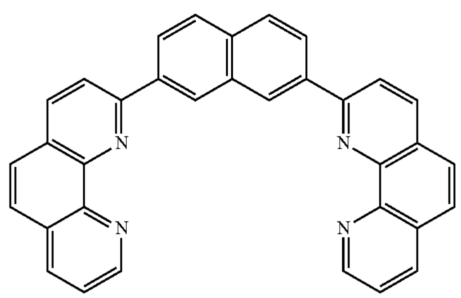
In an embodiment, the electron transport region may include at least one 2,9-dimethyl-4,7-diphenyl-1,10-phenanthroline (BCP), 4,7-dphenyl-1,10-phenanthroline (Bphen), $Alq_3$, BAlq, 3-(biphenyl-4-yl)-5-(4-tert-butylphenyl)-4-phenyl-4H-1,2,4-triazole (TAZ), or NTAZ.

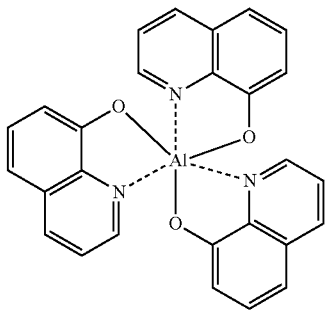
Alq3

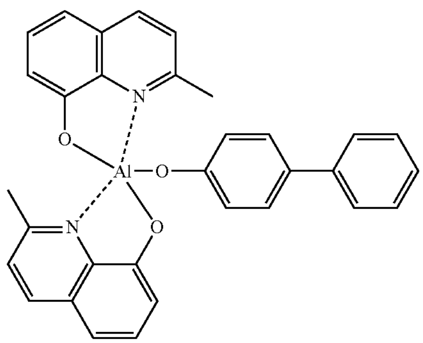
BAlq

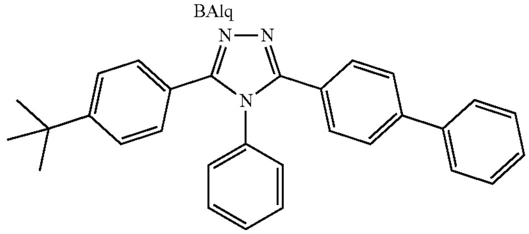
TAZ

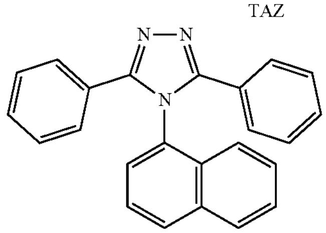
NTAZ

Thicknesses of the buffer layer, the hole blocking layer, and the electron control layer may each be in a range of about 20 Å to about 1,000 Å, for example, about 10 Å to about 100 Å, about 20 Å to about 200 Å, about 30 Å to about 300 Å, about 40 Å to about 400 Å, about 50 Å to about 500 Å, about 60 Å to about 600 Å, about 70 Å to about 700 Å, about 80 Å to about 800 Å, about 90 Å to about 900 Å, or about 100 Å to about 1000 Å. When the thicknesses of the buffer layer, the hole blocking layer, and the electron control layer are within these ranges, the electron blocking layer may have improved electron blocking characteristics or electron control characteristics without a substantial increase in driving voltage.

A thickness of the electron transport layer may be in a range of about 100 Å to about 1,000 Å, for example, about 150 Å to about 500 Å, about 200 Å to about 600 Å, about 250 Å to about 700 Å, about 300 Å to about 800 Å, about 350 Å to about 900 Å, or about 400 Å to about 1000 Å. When the thickness of the electron transport layer is within the range described above, the electron transport layer may have suitable electron transportation characteristics without a substantial increase in driving voltage.

The electron transport region 17 (for example, the electron transport layer in the electron transport region) may further include, in addition to the materials described above, a metal-containing material.

The metal-containing material may include at least one alkali metal complex or alkaline earth-metal complex. A metal ion of the alkali metal complex may be a Li ion, a Na ion, a K ion, a Rb ion, or a Cs ion, and a metal ion of the alkaline earth-metal complex may be a Be ion, a Mg ion, a Ca ion, a Sr ion, or a Ba ion. A ligand coordinated with the metal ion of the alkali metal complex or the alkaline earth-metal complex may be hydroxy quinoline, hydroxy isoquinoline, hydroxy benzoquinoline, hydroxy acridine, hydroxy phenanthridine, hydroxy phenyloxazole, hydroxy phenylthiazole, hydroxy diphenyloxadiazole, hydroxy diphenylthiadiazole, hydroxy phenylpyridine, hydroxy phenylbenzimidazole, hydroxy phenylbenzothiazole, bipyridine, phenanthroline, or cyclopentadiene, but embodiments of the present disclosure are not limited thereto.

In an embodiment, the metal-containing material may include a Li complex. The Li complex may include, for example, the following Compound ET-D1 (Liq) or ET-D2.

ET-D1

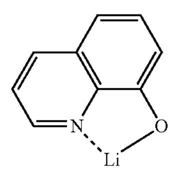

ET-D2

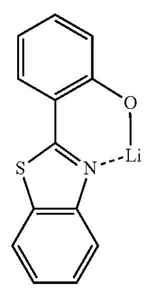

The electron transport region 17 may include an electron injection layer that facilitates the injection of electrons from the second electrode 19. The electron injection layer may be in direct contact with the second electrode 19.

The electron injection layer may have i) a single-layered structure including a single layer consisting of a single material, ii) a single-layered structure including a single layer consisting of a plurality of different materials, or iii) a multi-layered structure having a plurality of layers including a plurality of different materials.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combination thereof.

The alkali metal may be Li, Na, K, Rb, or Cs. In an embodiment, the alkali metal may be Li, Na, or Cs. In an embodiment, the alkali metal may be Li or Cs, but embodiments of the present disclosure are not limited thereto.

The alkaline earth metal may be Mg, Ca, Sr, or Ba.

The rare earth metal may be Sc, Y, Ce, Tb, Yb, or Gd.

The alkali metal compound, the alkaline earth-metal compound, and the rare earth metal compound may be oxides or halides (for example, fluorides, chlorides, bromides, or iodides) of the alkali metal, the alkaline earth-metal, or the rare earth metal.

The alkali metal compound may be alkali metal oxides, such as $Li_2O$, $Cs_2O$, or $K_2O$, or alkali metal halides, such as LiF, NaF, CsF, KF, Lil, Nal, Csl, or KI. In an embodiment, the alkali metal compound may be LiF, $Li_2O$, NaF, Lil, Nal, Csl, or KI, but embodiments of the present disclosure are not limited thereto.

The alkaline earth-metal compound may be alkaline earth-metal oxides, such as BaO, SrO, CaO, BaxSri-xO (wherein 0<x<1), or BaxCai-xO (wherein 0<x<1). In an embodiment, the alkaline earth-metal compound may be BaO, SrO, or CaO, but embodiments of the present disclosure are not limited thereto.

The rare earth metal compound may be $YbF_3$, $ScF_3$, $Sc_2O_3$, $Y_2O_3$, $Ce_2O_3$, $GdF_3$, or $TbF_3$. In an embodiment, the rare earth metal compound may be $YbF_3$, $ScF_3$, $TbF_3$, $YbI_3$, $ScI_3$, or $TbI_3$, but embodiments of the present disclosure are not limited thereto.

The alkali metal complex, the alkaline earth-metal complex, and the rare earth metal complex may include an ion of alkali metal, alkaline earth-metal, and rare earth metal as described above, and a ligand coordinated with a metal ion of the alkali metal complex, the alkaline earth-metal complex, or the rare earth metal complex may be hydroxy quinoline, hydroxy isoquinoline, hydroxy benzoquinoline, hydroxy acridine, hydroxy phenanthridine, hydroxy phenyloxazole, hydroxy phenylthiazole, hydroxy diphenyloxadiazole, hydroxy diphenylthiadiazole, hydroxy phenylpyridine, hydroxy phenylbenzimidazole, hydroxy phenylbenzothiazole, bipyridine, phenanthroline, or cyclopentadiene, but embodiments of the present disclosure are not limited thereto.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof, as described above. In an embodiment, the electron injection layer may further include an organic material. When the electron injection layer further includes an organic material, an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof may be homogeneously or non-homogeneously dispersed in a matrix including the organic material.

A thickness of the electron injection layer may be in a range of about 1 Å to about 100 Å, for example, about 3 Å to about 90 Å, about 6 Å to about 80 Å, about 9 Å to about 70 Å, about 12 Å to about 60 Å, about 15 Å to about 50 Å, about 18 Å to about 40 Å, or about 20 Å to about 30 Å. When the thickness of the electron injection layer is within the range described above, the electron injection layer may have satisfactory electron injection characteristics without a substantial increase in driving voltage.

Second Electrode 19

The second electrode 19 is located on the organic layer 10A having such a structure. The second electrode 19 may be a cathode which is an electron injection electrode, and in this regard, a material for forming the second electrode 19 may be a metal, an alloy, an electrically conductive compound, or a combination thereof, which have a relatively low work function.

The second electrode 19 may include at least one lithium (Li), silver (Ag), magnesium (Mg), aluminum (Al), aluminum-lithium (Al—Li), calcium (Ca), magnesium-indium (Mg—In), magnesium-silver (Mg—Ag), ITO, or IZO, but embodiments of the present disclosure are not limited thereto. The second electrode 19 may be a transmissive electrode, a semi-transmissive electrode, or a reflective electrode.

The second electrode 19 may have a single-layered structure having a single layer or a multi-layered structure including two or more layers.

Hereinbefore, the organic light-emitting device has been described with reference to FIGURE, but embodiments of the present disclosure are not limited thereto.

According to an aspect of the invention, provided is an electronic apparatus including the organic light-emitting device.

According to an embodiment, the electronic apparatus may be applied in various fields such as a diagnostic kit, a biosensor, a biomarker, a display, and a lighting device.

EXPLANATION OF TERMS

The term "$C_1$-$C_{60}$ alkyl group" as used herein refers to a linear or branched saturated aliphatic hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_1$-$C_{60}$ alkylthio group" used herein refers to a monovalent group represented by —$SA_{105}$ (wherein $A_{105}$ is the $C_1$-$C_{60}$ alkyl group), and examples thereof include a thiomethyl group, a thioethyl group, and a thioisopropyl group.

The term "$C_2$-$C_{60}$ alkenyl group" as used herein has a structure including at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein has a structure including at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom N, O, P, Si, or S as a ring-forming atom and 1 to 10 carbon atoms, and examples thereof include a tetrahydrofuranyl group and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom N, O, P, Si, or S as a ring-forming atom, 1 to 10 carbon atoms, and at least one double bond in its ring. Examples of the $C_1$-$C_{10}$ heterocycloalkenyl group are a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and a $C_6$-$C_{60}$ arylene group used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_6$-$C_{60}$ alkylaryl group" as used herein refers to a $C_6$-$C_{59}$ aryl group substituted with at least one $C_1$-$C_{54}$ alkyl or alkylene group, and the term "$C_6$-$C_{60}$ aryl alkyl group" as used herein indicates -$A_{106}A_{107}$ (wherein $A_{106}$ is the $C_6$-$C_{59}$ aryl group and $A_{107}$ is the $C_1$-$C_{54}$ alkyl or alkylene group).

The term "$C_1$-$C_{60}$ heteroaryl group" as used herein refers to a monovalent group having a cyclic aromatic system that has at least one heteroatom N, O, P, Si, or S as a ring-forming atom, and 1 to 60 carbon atoms. The term "$C_1$-$C_{60}$ heteroarylene group" as used herein refers to a divalent group having a carbocyclic aromatic system that has at least one heteroatom N, O, P, or S as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" as used herein refers to —$OA_{102}$ (here, $A_{102}$ is the $C_6$-$C_{60}$ aryl group), the $C_6$-$C_{60}$ arylthio group refers to —$SA_{103}$ (here, $A_{103}$ is the $C_6$-$C_{60}$ aryl group), and the $C_6$-$C_{60}$ aryl alkyl group refers to —$(CH_2)_nA_{104}$ (here, $A_{104}$ is a $C_6$-$C_{59}$ aryl group, and n is an integer from 1 to 10).

The term "$C_1$-$C_{60}$ heteroaryloxy group" as used herein refers to —$OA_{108}$ (wherein $A_{108}$ is the $C_1$-$C_{60}$ heteroaryl group), the term "$C_1$-$C_{60}$ heteroarylthio group" as used herein indicates —$SA_{109}$ (wherein $A_{109}$ is the $C_1$-$C_{60}$ heteroaryl group), and the term "$C_1$-$C_{60}$ heteroalkyl aryl group" as used herein refers to -$A_{110}A_{111}$ ($A_{110}$ is a $C_1$-$C_{55}$ heteroalkylene or heteroalkyl group, and $A_{111}$ is a $C_1$-$C_{59}$ heteroaryl group).

The term "$C_1$-$C_{60}$ heteroalkyl aryl group" as used herein refers to a $C_1$-$C_{60}$ heteroaryl group substituted with at least one $C_1$-$C_{59}$ alkyl or alkylene group.

The term "monovalent non-aromatic condensed polycyclic group" as used herein refers to a monovalent group (for example, having 8 to 60 carbon atoms) having two or more rings condensed with each other, only carbon atoms as ring-forming atoms, and non-aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, a heteroatom N, O, P, Si, or S, other than carbon atoms, as a ring-forming atom, and non-aromaticity in its entire molecular structure. The monovalent non-aromatic condensed heteropolycyclic group includes a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to, as a ring-forming atom, a saturated or unsaturated cyclic group including aromatic group having 5 to 30 carbon atoms. The $C_5$-$C_{30}$ carbocyclic group may be a monocyclic group or a polycyclic group. For example, the $C_5$-$C_{30}$ carbocyclic group may be a cyclopentane group, a cyclohexane group, a cyclohexene group, a phenyl group, a naphthalene group, an anthracene group, a phenanthrene group, a triphenylene group, a pyrene group, or like.

The term "$C_1$-$C_{30}$ heterocyclic group" as used herein refers to a saturated or unsaturated cyclic group having, as a ring-forming atom, at least one heteroatom N, O, P, Si, or S other than 1 to 30 carbon atoms. The $C_1$-$C_{30}$ heterocyclic group may be a monocyclic group or a polycyclic group.

For example, the π-electron-deficient nitrogen-containing $C_1$-$C_{60}$ cyclic group may be an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an isobenzothiazole group, a benzoxazole group, a benzoisoxazole group, a triazole group, a tetrazole group, an oxadiazole group, a triazine group, a thiadiazole group, an imidazopyridine group, an imidazopyrimidine group, an azacarbazole group, an azadibenzofuran group, an azadibenzothiophene group, an azadibenzosilole group, an acridine group, or a pyridopyrazine group.

In an embodiment, the π-electron-rich $C_3$-$C_{60}$ cyclic group may be a phenyl group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, a furan group, a thiophene group, an isoindole group, an indole group, an indene group, a benzofuran group, a benzothiophene group, a benzosilole group, a naphthopyrrole group, a naphthofuran group, a naphthothiophene group, a naphthosilole group, a benzocarbazole group, a dibenzocarbazole group, a dibenzofuran group, a dibenzothiophene group, a carbazole group, a dibenzosilole group, an indenocarbazole group, an indolocarbazole group, a benzofurocarbazole group, a benzothienocarbazole group, a benzosilolocarbazole group, a triindolobenzene group, a pyrrolophenanthrene group, a furanophenanthrene group, a thienophenanthrene group, a benzonaphthofuran group, a benzonaphthothiophene group, a (indolo)phenanthrene group, a (benzofurano)phenanthrene group, or a (benzothieno)phenanthrene group.

In an embodiment, the $C_5$-$C_{60}$ cyclic group may be a cyclopentane group, a cyclohexane group, a cyclohexene group, a phenyl or benzene group, a naphthalene group, an anthracene group, a phenanthrene group, a triphenylene group, a pyrene group, a chrysene group, a 1,2,3,4-tetrahydronaphthalene group, a cyclopentadiene group, an indene group, a fluorene group, a 5,6,7,8-tetrahydroisoquinoline group, a 5,6,7,8-tetrahydroquinoline group, an adamantane group, a norbornane group, or a norbornene group.

For example, the $C_1$-$C_{60}$ heterocyclic group may be a thiophene group, a furan group, a pyrrole group, a cyclopentadiene group, a silole group, a borole group, a phosphole group, a selenophene group, a germole group, a benzothiophene group, a benzofuran group, an indole group, an indene group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, or a benzothiadiazole group.

In the present specification, each of the π-electron-deficient nitrogen-containing $C_1$-$C_{60}$ cyclic group, the π-electron-rich $C_3$-$C_{60}$ cyclic group, the $C_5$-$C_{60}$ cyclic group, and the $C_1$-$C_{60}$ heterocyclic group may be part of a condensed cyclic or may be a monovalent, a divalent, a trivalent, a tetravalent, a pentavalent, or a hexavalent group, depending on a formula structure.

At least one substituent of the substituted π-electron-deficient nitrogen-containing $C_1$-$C_{60}$ cyclic group, the substituted π-electron-rich $C_3$-$C_{60}$ cyclic group, the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_6$-$C_{60}$ aryl alkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_1$-$C_{60}$ heteroalkyl aryl group, the substituted monovalent non-aromatic condensed polycyclic group, and the substituted monovalent non-aromatic condensed heteropolycyclic group is:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkylthio group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, a $C_1$-$C_{60}$ alkylthio group, or a $C_1$-$C_{60}$ alkoxy group, each independently substituted with at least one deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_6$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a $C_1$-$C_{60}$ heteroalkyl aryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—B(Q_{16})(Q_{17})$, or $—P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a $C_1$-$C_{60}$ heteroalkyl aryl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_6$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a $C_1$-$C_{60}$ heteroalkyl aryl group, a monovalent non-aromatic condensed polycyclic group, or a monovalent non-aromatic condensed heteropolycyclic group, each independently substituted with at least one deuterium, —F, —Cl, —Br, —I, $—CD_3$, $—CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_6$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, or —$P(=O)(Q_{28})(Q_{29})$; or —$N(Q_{31})(Q_{32})$, —$Si(Q_{33})(Q_{34})(Q_{35})$, —$B(Q_{36})(Q_{37})$, or —$P(=O)(Q_{38})(Q_{39})$, and $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_6$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a $C_1$-$C_{60}$ heteroalkyl aryl group, a monovalent non-aromatic condensed polycyclic group, or a monovalent non-aromatic condensed heteropolycyclic group.

In an embodiment, $Q_1$ to $Q_9$, $Q_{11}$ to $Q_{19}$, $Q_{21}$ to $Q_{29}$, and $Q_{31}$ to $Q_{39}$ as used herein may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each independently unsubstituted or substituted with deuterium, a $C_1$-$C_{10}$ alkyl group, a phenyl group, or any combination thereof.

The term "room temperature" used herein refers to a temperature of about 25° C.

The terms "a biphenyl group, a terphenyl group, and a tetraphenyl group" used herein respectively refer to monovalent groups in which two, three, or four phenyl groups which are linked together via a single bond.

The terms "a cyano-containing phenyl group, a cyano-containing biphenyl group, a cyano-containing terphenyl group, and a cyano-containing tetraphenyl group" used herein respectively refer to a phenyl group, a biphenyl group, a terphenyl group, and a tetraphenyl group, each of which is substituted with at least one cyano group. In "a cyano-containing phenyl group, a cyano-containing biphenyl group, a cyano-containing terphenyl group, and a cyano-containing tetraphenyl group", a cyano group may be substituted to any position of the corresponding group, and the "cyano-containing phenyl group, the cyano-containing biphenyl group, the cyano-containing terphenyl group, and the cyano-containing tetraphenyl group" may further include substituents other than a cyano group. In an embodiment, a phenyl group substituted with a cyano group, and a phenyl group substituted with a cyano group and a methyl group may all belong to "a cyano-containing phenyl group."

Hereinafter, a compound and an organic light-emitting device according to embodiments are described in detail with reference to Synthesis Examples and Examples. However, the organic light-emitting device is not limited thereto. The wording "'B' was used instead of 'A'" used in describing Synthesis Examples means that an amount of 'A' used was identical to an amount of 'B' used, in terms of a molar equivalent.

EXAMPLES

Synthesis Example 1: Synthesis of Compound 1

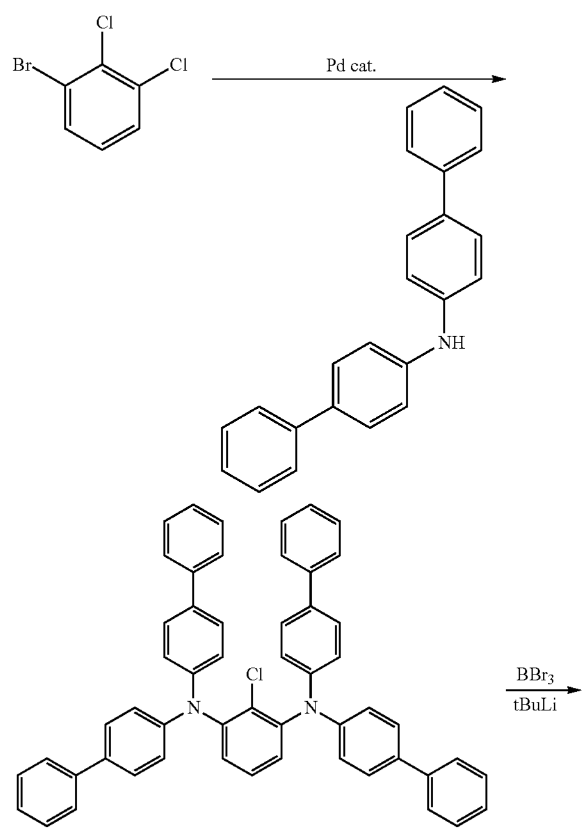

1-a

-continued

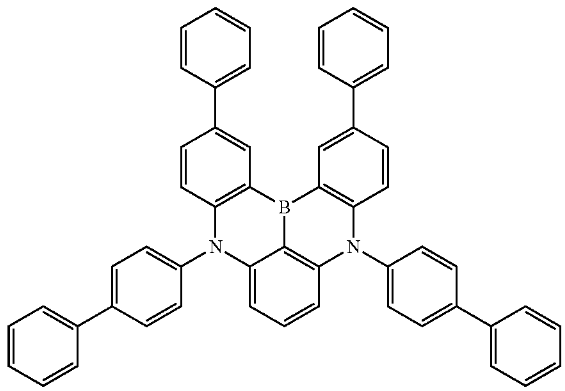

1

1-Bromo-2,3-dichlorobenzene (4.0 gram (g)), bis(4-biphenylyl)amine (12.0 g), sodium tert-butoxide (4.3 g), $Pd(dba)_2$ (Palladium(0) bis(dibenzylideneacetone), 0.81 g), and SPhos (2-dicyclohexylphosphino-2',6'-dimethoxybiphenyl, 0.44 g) were dissolved in toluene (350 milliliter (mL)), and then heated at 100° C. for 15 hours using an oil bath. The reaction product was cooled to room temperature, and a target product was extracted using ethyl acetate, dried over anhydrous magnesium sulfate, and then concentrated under reduced pressure. A compound obtained therefrom was purified through silica gel column chromatography to thereby obtain 11.4 g (yield: 86%, purity: 98%) of Intermediate 1-a.

A tert-butyl benzene solution (70 mL) of Intermediate 1-a (5.1 g) obtained therefrom was cooled to −78° C. A tert-BuLi solution (9.9 mL, 1.5 M in pentane) was added thereto, the resulting reaction mixture was heated at 60° C., and then stirred for an hour. Subsequently, the reaction mixture was cooled at −78° C., and boron tribromide (1.4 mL) was added thereto and then stirred at 0° C. for two hours. Again, the reaction mixture was cooled at −78° C., and diisopropylethylamine (2.4 mL) was added thereto, and then heated at 110° C. for three hours. The reaction mixture was cooled to room temperature, diluted using dichloromethane, subjected to filtration using FLORISIL®, and then concentrated under reduced pressure. A compound obtained therefrom was recrystallized using a toluene/dichloromethane solvent to thereby obtain 2.2 g (yield: 44%, purity: 98%) of Compound 1. Also, a target molecular weight ($[M+H]^+$ 725.3) was confirmed through ESI-MS measurement.

Synthesis Example 2

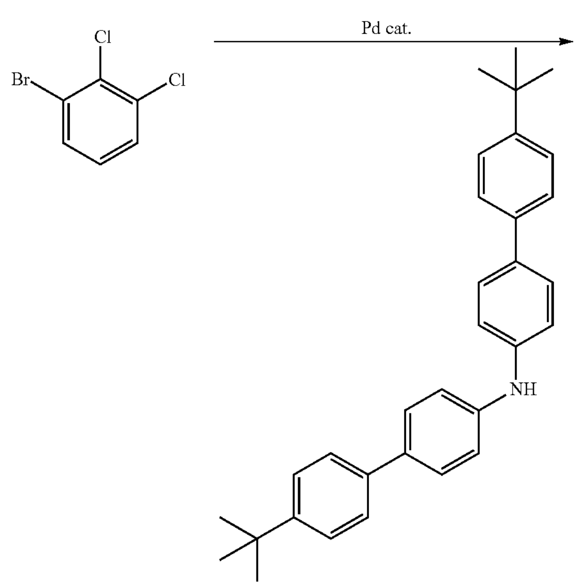

-continued

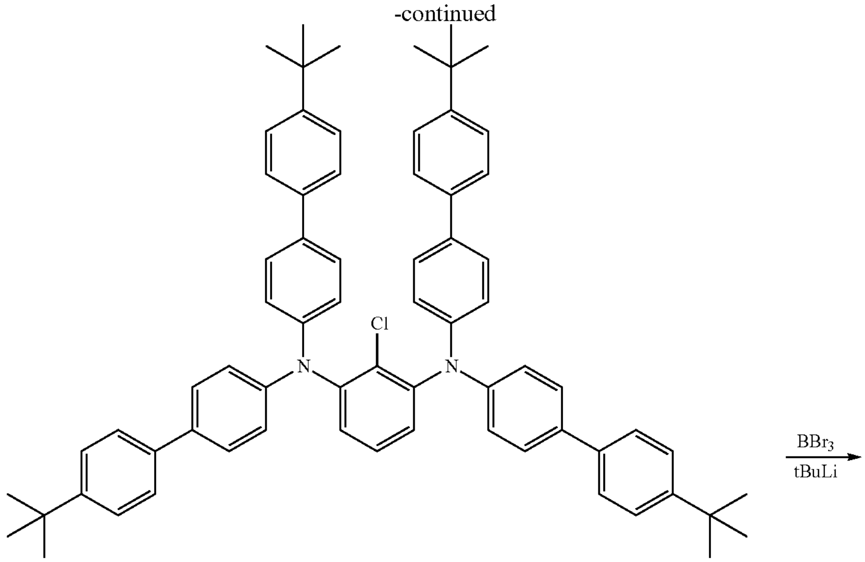

224-a

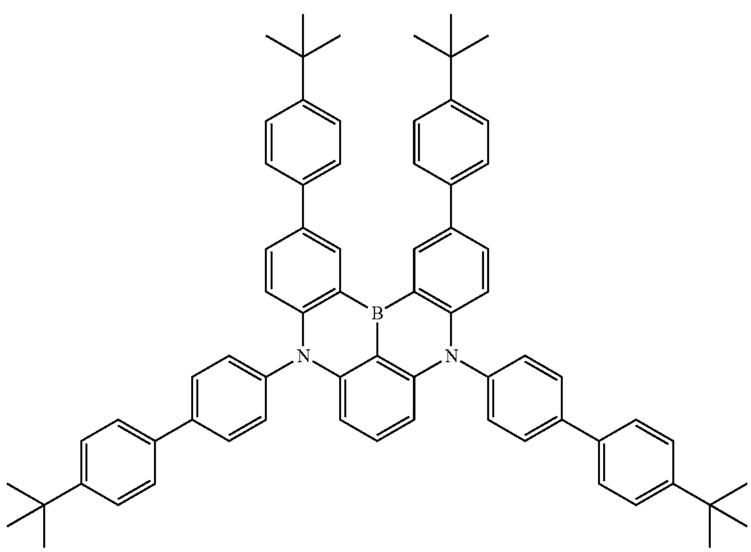

224

1-Bromo-2,3-dichlorobenzene (1.4 g), bis(4'-(tert-butyl)-[1,1'-biphenyl]-4-yl)amine (5.7 g), sodium tert-butoxide (1.7 g), $Pd(OAc)_2$ (27 mg), and SPhos (125 milligrams (mg)) were dissolved in o-xylene (50 mL), and then refluxed while heating for an hour using an oil bath. The reaction mixture was cooled to room temperature, and a target product was extracted using ethyl acetate, dried over magnesium sulfate, and then concentrated under reduced pressure. A compound obtained therefrom was purified by silica gel column chromatography to thereby obtain 5.5 g (yield: 94%, purity: >99%) of Intermediate 224-a.

A tert-butyl benzene solution (12 mL) of Intermediate 224-a (0.5 g) obtained therefrom was cooled at −78° C. A tert-BuLi solution (0.72 mL, 1.5 M in pentane) was added thereto, the resulting reaction mixture was heated at 80° C., and then stirred for two hours. Subsequently, the reaction mixture was cooled to −78° C., and boron tribromide (0.11 mL) was added thereto and then stirred at 0° C. for an hour. Again, the reaction mixture was cooled at −78° C., and diisopropylethylamine (0.18 mL) was added thereto and then heated at 110° C. for three hours. The reaction mixture was diluted using dichloromethane, subjected to filtration using FLORISIL®, and then concentrated under reduced pressure. A compound obtained therefrom was purified by silica gel column chromatography to thereby obtain 0.13 g (yield: 15%, purity: 95%) of Compound 224. Also, a target molecular weight ($[M+H]^+$ 949.6) was confirmed through ESI-MS measurement.

Synthesis Example 3

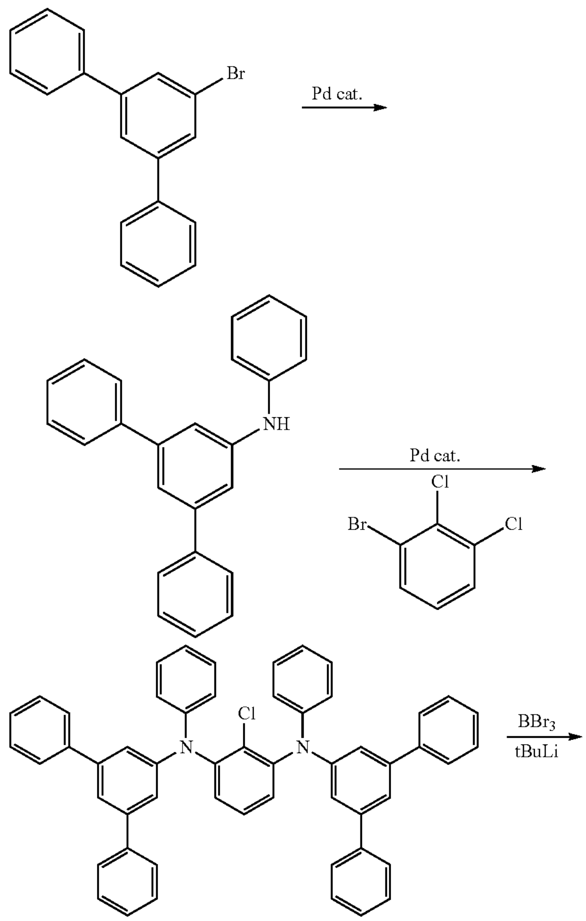

95-a

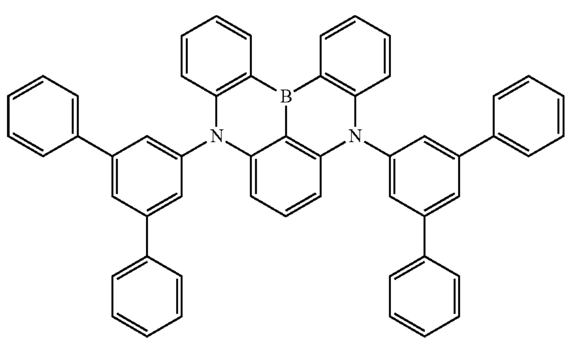

95

5-Bromo-m-terphenyl (10 g), aniline (4.2 mL), sodium tert-butoxide (4.7 g), $Pd(dba)_2$ (1.48 g), and SPhos (0.81 mg) were dissolved in toluene (150 mL), and then heated at 100° C. for 15 hours using an oil bath. The reaction mixture was cooled at room temperature, and a target product was extracted using ethyl acetate, dried over magnesium sulfate, and then concentrated under reduced pressure. A compound obtained therefrom was purified by silica gel column chromatography to thereby obtain 6.2 g (yield: 60%, purity: 97%) of Intermediate 95-b.

Intermediate 95-b (6.2 g) obtained therefrom, 1-bromo-2,3-dichlorobenzene (2.0 g), sodium tert-butoxide (2.5 g), $Pd(dba)_2$ (0.44 mg), and SPhos (0.24 mg) were dissolved in toluene (100 mL), and then heated 100° C. for 15 hours using an oil bath. The reaction mixture was cooled to room temperature, and a target product was extracted using ethyl acetate, dried over magnesium sulfate, and then concentrated under reduced pressure. A compound obtained therefrom was purified by silica gel column chromatography to thereby obtain 5.2 g (yield: 72%, purity: 97%) of Intermediate 95-a.

A tert-butyl benzene solution (12 mL) of Intermediate 95-a (0.5 g) obtained therefrom was cooled at −78° C. A tert-BuLi solution (0.98 mL, 1.5 M in pentane) was added thereto, heated at 80° C., and then stirred for two hours. Next, the reaction mixture was cooled to −78° C., and boron tribromide (0.16 mL) was added thereto and then stirred at 0° C. for an hour. Again, the reaction mixture was cooled to −78° C., and diisopropylethylamine (0.29 mL) was added thereto and then heated at 110° C. for three hours. The reaction mixture was cooled to room temperature, diluted using dichloromethane, subjected to filtration using FLORISIL®, and then concentrated under reduced pressure. A compound obtained therefrom was purified by silica gel column chromatography to thereby obtain 0.15 g (yield: 31%, purity: 91%) of Compound 95. Also, a target molecular weight ($[M+H]^+$ 725.3) was confirmed through ESI-MS measurement.

Synthesis Example 4

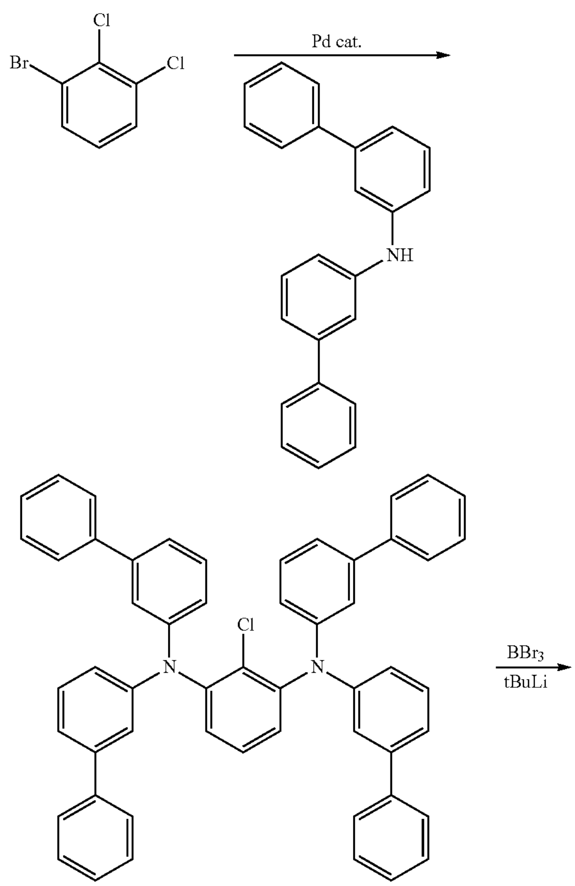

229-a

-continued

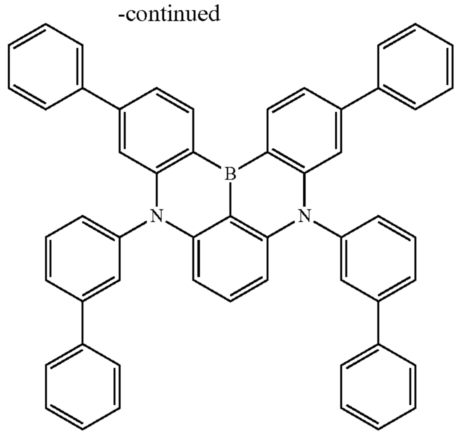

229

1-Bromo-2,3-dichlorobenzene (2.0 g), bis(3-biphenylyl) amine (6.0 g), sodium tert-butoxide (2.2 g), $Pd_2(dba)_3$ (0.21 g), and SPhos (0.22 g) were dissolved in toluene (150 mL), and then heated at 100° C. for 15 hours using an oil bath. The reaction mixture was cooled to room temperature, and a target product was extracted using ethyl acetate, dried over anhydrous magnesium sulfate, and then concentrated under reduced pressure. A compound obtained therefrom was purified by silica gel column chromatography to thereby obtain 5.8 g (yield: 88%, purity: 98%) of Intermediate 229-a.

A tert-butyl benzene solution (12 mL) of Intermediate 229-a (1.0 g) obtained therefrom was cooled at −78° C. A tert-BuLi solution (0.28 mL, 1.5 M in pentane) was added thereto, heated at 60° C., and then stirred for an hour. Next, the reaction mixture was cooled to −78° C., and boron tribromide (0.28 mL) was added thereto and then stirred at 0° C. for two hours. Again, the reaction result was cooled to −78° C., and diisopropylethylamine (0.48 mL) was added thereto and then heated at 110° C. for three hours. The reaction mixture was cooled to room temperature, diluted using dichloromethane, subjected to filtration using FLORISIL®, and then concentrated under reduced pressure. A compound obtained therefrom was recrystallized using a toluene/dichloromethane solvent to thereby obtain 0.36 g (yield: 38%, purity: 92%) of Compound 229. Also, a target molecular weight ($[M+H]^+$ 725.3) was confirmed through ESI-MS measurement.

Example 1

A glass substrate with an ITO electrode located thereon was cut to a size of 50 millimeters (mm)×50 mm×0.5 mm and then, sonicated in acetone isopropyl alcohol and pure water, each for 15 minutes, and then, washed by exposure of UV ozone thereto for 30 minutes.

Then, HAT-CN was deposited on the ITO electrode (anode) on the glass substrate to form a hole injection layer having a thickness of 100 angstrom (A), NPB was deposited on the hole injection layer to form a first hole transport layer having a thickness of 500 Å, TCTA was deposited on the first hole transport layer to form a second hole transport layer having a thickness of 50 Å, and mCP was deposited on the second hole transport layer to form an electron blocking layer having a thickness of 50 Å.

A first host (H1), a second host (H2), a sensitizer (S-1), and an emitter (Compound 1) were co-deposited on the electron blocking layer to form an emission layer having a thickness of 400 Å. At this time, the first host and the second host were mixed at a ratio of 60:40, and amounts of the sensitizer and the emitter were adjusted to be 10 wt % and 1.5 wt %, respectively, based on the total weight of the first host, the second host, the sensitizer, and the emitter.

2,8-bis(diphenylphosphine oxide) dibenzofuran (DBFPO) was deposited on the emission layer to form a hole blocking layer having a thickness of 100 Å, DBFPO and Liq were co-deposited thereon at a weight ratio of 5:5 to form an electron transport layer having a thickness of 300 Å, Liq was deposited on the electron transport layer to form an electron injection layer having a thickness of 10 Å, and Al was deposited on the electron injection layer to form a cathode having a thickness of 1000 Å, thereby completing the manufacture of an organic light-emitting device.

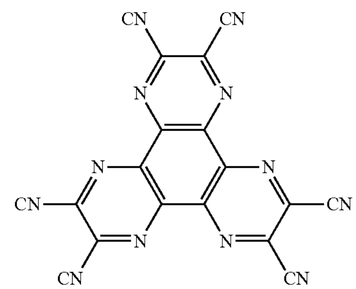

HT-D1(HAT-CN)

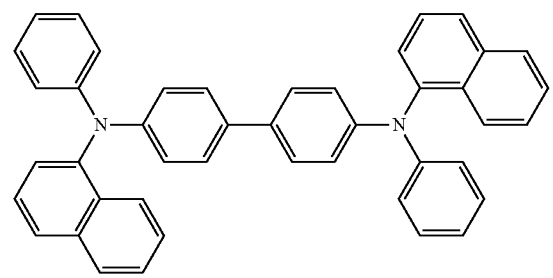

NPB

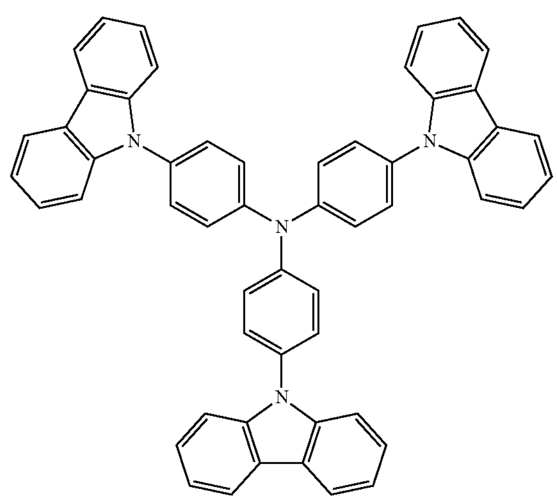

TCTA

-continued

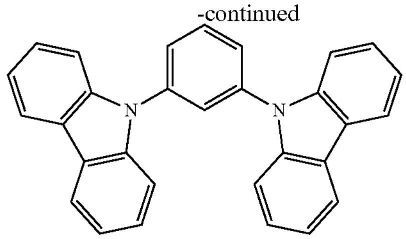

mCP

H1

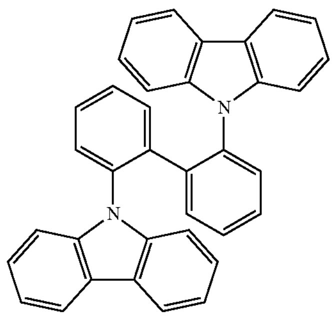

H2

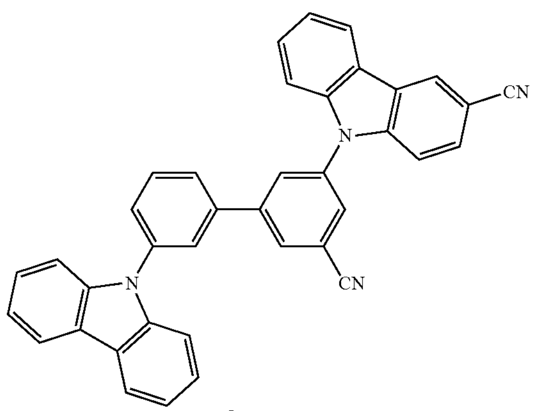

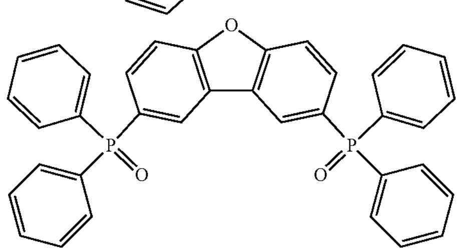

DBFPO

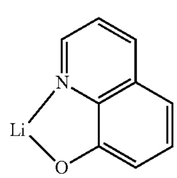

Liq

Example 2

An organic light-emitting device was manufactured in the same manner as in Example 1, except that, in forming an emission layer, 0.5 wt % of an emitter (Compound 1) was used.

Comparative Examples 1 to 7

An organic light-emitting device was manufactured in the same manner as in Example 1, except that, in forming an emission layer, corresponding compounds shown in Table 2 were used.

TABLE 2

| | Host | | | |
|---|---|---|---|---|
| | HT-HOST | ET-HOST | Sensitizer | Emitter |
| Comparative Example 1 | H1 6:4 | H2 | — — | Compound 1 0.5 wt % |
| Example 1 | H1 6:4 | H2 | S-1 10 wt % | Compound 1 1.5 wt % |
| Comparative Example 2 | H1 6:4 | H2 | S-1 10 wt % | Compound A 1.5 wt % |
| Comparative Example 3 | H1 6:4 | H2 | S-1 10 wt % | Compound B 1.5 wt % |
| Comparative Example 4 | H1 6:4 | H2 | S-1 10 wt % | Compound C 1.5 wt % |
| Example 2 | H1 6:4 | H2 | S-1 10 wt % | Compound 1 0.5 wt % |
| Comparative Example 5 | H1 6:4 | H2 | S-1 10 wt % | Compound A 0.5 wt % |
| Comparative Example 6 | H1 6:4 | H2 | S-1 10 wt % | Compound B 0.5 wt % |
| Comparative Example 7 | H1 6:4 | H2 | S-1 10 wt % | Compound C 0.5 wt % |

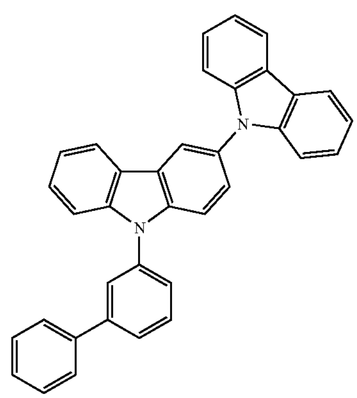 [SMILES: c1ccc(-c2cccc(-n3c4ccccc4c4cc(-n5c6ccccc6c6ccccc65)ccc43)c2)cc1]

H1

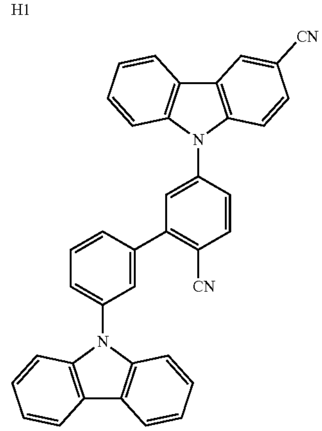

H2

TABLE 2-continued

| | Host | | | |
|---|---|---|---|---|
| | HT-HOST | ET-HOST | Sensitizer | Emitter |

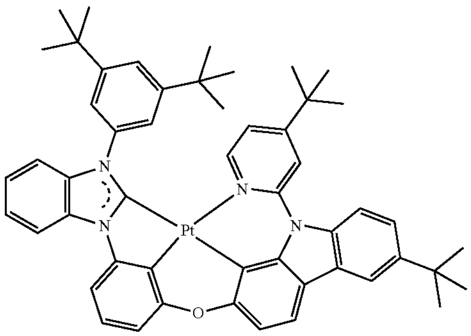

S-1

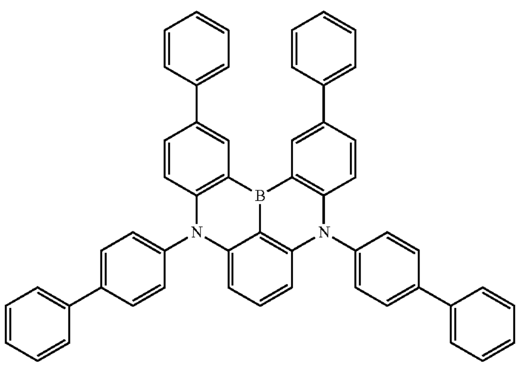 [SMILES: c1ccc(-c2ccc(N3c4ccc(-c5ccccc5)cc4B4c5cc(-c6ccccc6)ccc5N(c5ccc(-c6ccccc6)cc5)c5cccc3c54)cc2)cc1]

1

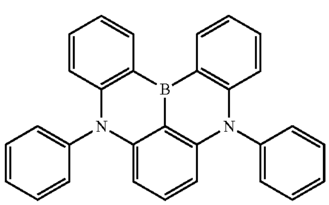 [SMILES: c1ccc(N2c3ccccc3B3c4ccccc4N(c4ccccc4)c4cccc2c43)cc1]

A

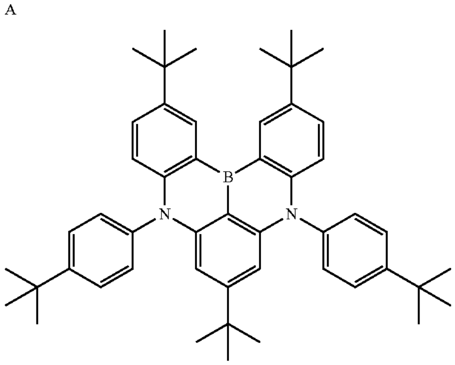

B

TABLE 2-continued

| | Host | | | |
|---|---|---|---|---|
| | HT-HOST | ET-HOST | Sensitizer | Emitter |

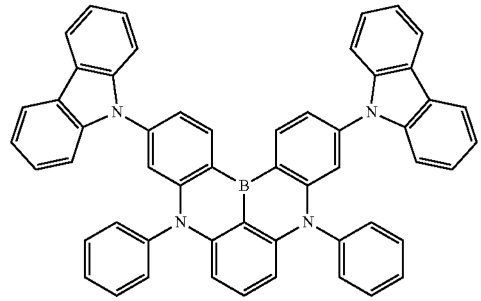 [SMILES: c1ccc(N2c3cc(-n4c5ccccc5c5ccccc54)ccc3B3c4ccc(-n5c6ccccc6c6ccccc65)cc4N(c4ccccc4)c4cccc2c43)cc1]

C

Evaluation Example 1: Characteristic Evaluation of Organic Light-Emitting Device For each of the organic light-emitting devices manufactured in Examples 1 and 2 and Comparative Examples 1 to 7, driving voltage, T95 lifespan, which is the time taken for initial luminance to decrease to 95%, and quantum efficiency were measured, and relative values with respect to Comparative Example 1 are shown in Table 3.

TABLE 3

| | Driving voltage (%) | Maximum quantum efficiency (%) | T95 lifespan (%) |
|---|---|---|---|
| Comparative Example 1 | 100 | 100 | 100 |
| Example 1 | 88 | 127 | 3381 |
| Comparative Example 2 | 97 | 106 | 223 |
| Comparative Example 3 | 97 | 121 | 308 |
| Comparative Example 4 | 91 | 133 | 903 |
| Example 2 | 88 | 125 | 3310 |
| Comparative Example 5 | 95 | 107 | 403 |
| Comparative Example 6 | 93 | 123 | 577 |
| Comparative Example 7 | 90 | 124 | 1189 |

As described in Tables 2 and 3, the organic light-emitting devices of Examples 1 and 2 each include an emission layer including two hosts, a sensitizer, and a dopant of Compound 1, thereby having low driving voltage, high efficiency, and long lifespan, compared to the organic light-emitting devices manufactured in Comparative Examples 1 (free of a sensitizer), 2 to 4, and 5 to 7.

An organic light-emitting device including a host, a first dopant, and a second dopant described herein has improved efficiency, low driving voltage, and improved lifespan.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present detailed description as defined by the following claims.

What is claimed is:

1. An organic light-emitting device comprising:

a first electrode;

a second electrode facing the first electrode; and an organic layer located between the first electrode and the second electrode and including an emission layer, wherein the emission layer comprises a host compound, a first dopant compound, and a second dopant compound, and the second dopant compound is represented by Formula 1:

$$A\text{-}(Ar_1)_{n11} \quad \text{Formula 1}$$

wherein, in Formula 1,

A is a group represented by Formula 1-1,

Formula 1-1

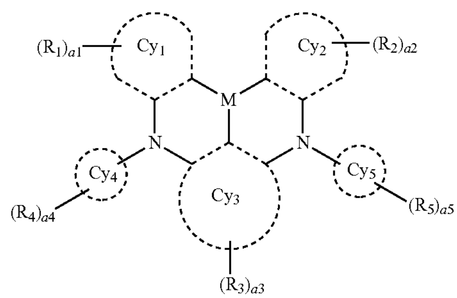

$Ar_1$ is a substituted or unsubstituted $C_5$-$C_{30}$ carbocyclic group or a substituted or unsubstituted $C_1$-$C_{30}$ heterocyclic group, n11 is an integer of 4 or more, $Ar_1$ in the number of n11 are identical to or different from each other, M is B, Al, $Si(R_a)$, $Ge(R_a)$, P, P(=O), or P(=S), $CY_1$ to $CY_5$ are each independently a $C_5$-$C_{30}$ carbocyclic group or a $C_1$-$C_{30}$ heterocyclic group, $R_a$ and $R_1$ to $R_5$ are each independently a binding site to $Ar_1$ in Formula 1, hydrogen, deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_1$-$C_{60}$ heteroalkyl aryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, or —$P(=O)(Q_8)(Q_9)$, a1 to a5 are each independently an integer from 1 to 10, two neighboring groups of $R_1$ to $R_5$ are optionally linked to each other to form a $C_5$-$C_{30}$ carbocyclic group unsubstituted or substituted with $R_{10}$ or a $C_1$-$C_{30}$ heterocyclic group unsubstituted or substituted with $R_{10}$, wherein $R_{10}$ is the same as described in connection with $R_1$, and at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_1$-$C_{60}$ heteroalkyl aryl group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkylthio group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, a $C_1$-$C_{60}$ alkylthio group, or a $C_1$-$C_{60}$ alkoxy group, each independently substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl alkyl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a $C_1$-$C_{60}$ heteroalkyl aryl group, a monovalent non-aromatic condensed polycyclic group, a monovalent non-aromatic condensed heteropolycyclic group, —$Si(Q_{11})(Q_{12})(Q_{13})$, —$N(Q_{14})(Q_{15})$, —$B(Q_{16})(Q_{17})$, or —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl alkyl group, a $C_6$-$C_{60}$ aryloxy group, a $C_6$-$C_{60}$ arylthio group, a $C_6$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a $C_1$-$C_{60}$ heteroalkyl aryl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ aryloxy group, a $C_6$-$C_{60}$ arylthio group, a $C_6$-$C_{60}$ alkyl aryl group, a $C_1$-$C_{60}$ heteroaryl group, a $C_1$-$C_{60}$ heteroaryloxy group, a $C_1$-$C_{60}$ heteroarylthio group, a $C_1$-$C_{60}$ heteroalkyl aryl group, a monovalent non-aromatic condensed polycyclic group, or a monovalent non-aromatic condensed heteropolycyclic group, each independently substituted with at least one deuterium, —F, —Cl, —Br, —I, —$CD_3$, —$CD_2H$, -$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl alkyl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a $C_1$-$C_{60}$ heteroalkyl aryl group, a monovalent non-aromatic condensed polycyclic group, a monovalent non-aromatic condensed heteropolycyclic group, —$Si(Q_{21})(Q_{22})(Q_{23})$, —$N(Q_{24})(Q_{25})$-$B(Q_{26})(Q_{27})$, or —$P(=O)(Q_{28})(Q_{29})$; or —$Si(Q_{31})(Q_{32})(Q_{33})$, —$N(Q_{34})(Q_{35})$, —$B(Q_{36})(Q_{37})$, or —$P(=O)(Q_{38})(Q_{39})$, wherein $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_1$-$C_{60}$ heteroalkyl aryl group, a substituted or unsubstituted monovalent non-aromatic condensed polycyclic group, or a substituted or unsubstituted monovalent non-aromatic condensed heteropolycyclic group, and wherein the first dopant compound comprises an organometallic compound represented by Formula 101 below:

$$M_{11}(L_1)_{n1}(L_2)_{n2} \quad \text{Formula 101}$$

wherein, in Formula 101, $M_{11}$ is a first-row transition metal of the Periodic Table of Elements, a second-row transition metal of the Periodic Table of Elements, or a third-row transition metal of the Periodic Table of Elements, $L_1$ is a ligand represented by one of Formulae 10-1 to 10-4, $L_2$ is a monodentate ligand or a bidentate ligand, n1 is 1, and n2 is 0, 1, or 2, 10-1

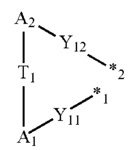

10-2

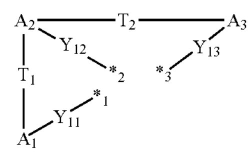

10-3

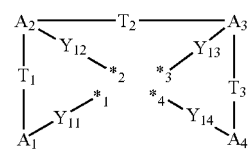

10-4

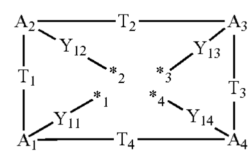

wherein, in Formulae 10-1 to 10-4, $A_1$ to $A_4$ are each independently a substituted or unsubstituted $C_5$-$C_{30}$ carbocyclic group, a substituted or unsubstituted $C_1$-$C_{30}$ heterocyclic group, or a non-cyclic group, $Y_{11}$ to $Y_{14}$ are each independently a chemical bond, O, S, $N(R_{91})$, $B(R_{91})$, $P(R_{91})$, or $C(R_{91})(R_{92})$, $T_1$ to $T_4$ are each independently a single bond, a double bond, *—$N(R_{93})$—*', *—$B(R_{93})$—*', *—$P(R_{93})$—*', *—$C(R_{93})(R_{94})$—*', *—$Si(R_{93})(R_{94})$—*', *—$Ge(R_{93})(R_{94})$—*', *—S—*', *—Se—*', *—O—*', *—C(=O)—*', *—S(=O)—*', *—$S(=O)_2$—*', *—$C(R_{93})$=*', *=$C(R_{93})$—*', *—$C(R_{93})$—$C(R_{94})$—*', *—C(=S)—*', or *—C≡C—*', a substituent of the substituted $C_5$-$C_{30}$ carbocyclic group, a substituent of the substituted $C_1$-$C_{30}$ heterocyclic group, or $R_{91}$ to $R_{94}$ are each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_1$-$C_{60}$ heteroalkyl aryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), or —P(=S)($Q_1$)($Q_2$), wherein each of the substituent of the substituted $C_5$-$C_{30}$ carbocyclic group or the substituent of the substituted $C_1$-$C_{30}$ heterocyclic group is not hydrogen, $*_1$, $*_2$, $*_3$, and $*_4$ each indicate a binding site to $M_{11}$, and $Q_1$ to $Q_3$ are each independently hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a heteroalkyl aryl group, a monovalent non-aromatic condensed polycyclic group, a monovalent non-aromatic condensed heteropolycyclic group, a $C_1$-$C_{60}$ alkyl group substituted with at least one deuterium, —F, a cyano group, a $C_1$-$C_{60}$ alkyl group, and a $C_6$-$C_{60}$ aryl group, or a $C_6$-$C_{60}$ aryl group substituted with at least one deuterium, —F, a cyano group, a $C_1$-$C_{60}$ alkyl group, or a $C_6$-$C_{60}$ aryl group.

2. The organic light-emitting device of claim 1, wherein the first electrode is an anode, the second electrode is a cathode, the organic layer further comprises a hole transport region located between the first electrode and the emission layer and an electron transport region located between the emission layer and the second electrode, the hole transport region comprises a hole injection layer, a hole transport layer, an electron blocking layer, a buffer layer, or any combination thereof, and the electron transport region comprises a hole blocking layer, an electron transport layer, an electron injection layer, or any combination thereof.

3. The organic light-emitting device of claim 1, wherein the host compound comprises two different compounds.

4. The organic light-emitting device of claim 1, wherein the host compound comprises a hole transport host compound and an electron transport host compound.

5. The organic light-emitting device of claim 4, wherein the hole transport host compound is a compound represented by Formula H-1 below:

Formula H-1

$$Ar_{401}—(L_{401})_{xd1}—(Ar_{402})_{xd11}$$

Formula 11

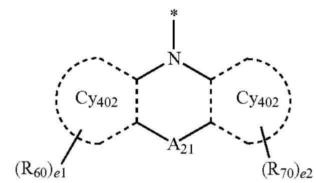

Formula 12

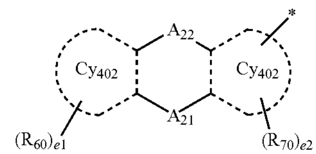

wherein, in Formulae H-1, 11, and 12, $L_{401}$ is:

a single bond; or a phenyl group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a coronene group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group or a triindolobenzene group, each independently unsubstituted or substituted with at least one deuterium, a $C_1$-$C_{10}$ alkyl group, a $C_1$-$C_{10}$ alkoxy group, a $C_1$-$C_{10}$ alkylthio group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, or —Si($Q_{401}$)($Q_{402}$)($Q_{403}$), xd1 is an integer from 1 to 10, wherein, when xd1 is 2 or more, two or more of $L_{401}$(s) are identical to or different from each other, $Ar_{401}$ is groups represented by Formulae 11 or 12, $Ar_{402}$ is:

groups represented by Formulae 11 and 12, a phenyl group, a naphthyl group, a fluorenyl group, a carbazolyl group, a dibenzofuranyl group, a dibenzothiophenyl group, a biphenyl group, a terphenyl group, or a triphenylenyl group; or a phenyl group, a naphthyl group, a fluorenyl group, a carbazolyl group, a dibenzofuranyl group, a dibenzothiophenyl group, a biphenyl group, a terphenyl group, or a triphenylenyl group, each independently substituted with at least one deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{20}$ alkylthio group, a phenyl group, a naphthyl group, a fluorenyl group, a carbazolyl group, a dibenzofuranyl group, a dibenzothiophenyl group, a biphenyl group, a terphenyl group, or a triphenylenyl group, xd11 is an integer from 1 to 10, $CY_{401}$ and $CY_{402}$ are each independently a phenyl group, a naphthalene group, a fluorene group, a carbazole group, a benzocarbazole group, an indolocarbazole group, a dibenzofuran group, a dibenzothiophene group, a dibenzosilole group, a benzonaphthofuran group, a benzonaphthothiophene group, or a benzonaphthosilole group, $A_{21}$ is a single bond, O, S, $N(R_{51})$, $C(R_{51})(R_{52})$, or $Si(R_{51})(R_{52})$, $A_{22}$ is a single bond, O, S, $N(R_{53})$, $C(R_{53})(R_{54})$, or $Si(R_{53})(R_{54})$, at least one of $A_{21}$ and $A_{22}$ in Formula 12 is not a single bond, $R_{51}$ to $R_{54}$, $R_{60}$, and $R_{70}$ are each independently:

hydrogen, deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkylthio group, or a $C_1$-$C_{20}$ alkoxy group;

a $C_1$-$C_{20}$ alkyl group, a $C_1$-$C_{20}$ alkylthio group, or a $C_1$-$C_{20}$ alkoxy group, each independently substituted with at least one deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a carbazolyl group, a dibenzofuranyl group, or a dibenzothiophenyl group;

a π-electron-deficient nitrogen-free cyclic group;

a π-electron-deficient nitrogen-free cyclic group substituted with at least one deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, $C_1$-$C_{20}$ alkylthio group, a phenyl group, a naphthyl group, a fluorenyl group, a carbazolyl group, a dibenzofuranyl group, a dibenzothiophenyl group, or a biphenyl group;

—$Si(Q_{404})(Q_{405})(Q_{406})$, e1 and e2 are each independently an integer from 0 to 10, $Q_{401}$ to $Q_{406}$ are each independently hydrogen, deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a carbazolyl group, a dibenzofuranyl group, a dibenzothiophenyl group, a biphenyl group, a terphenyl group, or a triphenylenyl group, and

* indicates a binding site to a neighboring atom.

6. The organic light-emitting device of claim 5, wherein the electron transport host compound comprises at least one of a cyano group or a x-electron-deficient nitrogen-containing cyclic group.

7. The organic light-emitting device of claim 1, wherein an amount of the host compound is greater than a total amount of a first dopant and a second dopant.

8. The organic light-emitting device of claim 1, wherein, in Formula 1-1, M is B.

9. The organic light-emitting device of claim 1, wherein, in Formula 1-1, ring $CY_1$ to ring $CY_5$ are each independently a first ring, a second ring, a condensed ring in which two or more groups selected from the first ring are condensed with each other, a condensed ring in which two or more groups selected from the second ring are condensed with each other, or a condensed ring in which at least one first ring and at least one second ring are condensed with each other, the first ring is a cyclopenta-1,3-diene group, an indene group, an azulene group, a phenyl group, a naphthalene group, an anthracene group, a phenanthrene group, a tetracene group, a tetraphene group, a pyrene group, a chrysene group, a triphenylene group, or a fluorene group, and the second ring is a furan group, a thiophene group, a pyrrole group, a borole group, a silole group, a pyrrolidine group, an imidazole group, a thiazole group, a triazole group, an oxazole group, an isoxazole group, a thiazole group, an isothiazole group, a pyridine group, a pyrimidine group, a pyridazine group, a triazine group, an indole group, an isoindole group, an indolizine group, a quinoline group, an isoquinoline group, a quinoxaline group, an isoquinoxaline group, a carbazole group, a dibenzofuran group, a dibenzothiophene group, a dibenzosilole group, or a dibenzoborole group.

10. The organic light-emitting device of claim 1, wherein, in Formula 1, $Ar_1$ in the number of n11 are identical to each other.

11. The organic light-emitting device of claim 1, wherein, in Formula 1, $Ar_1$ is:

a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, or a carbazolyl group; or a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, or a carbazolyl group, each independently substituted with at least one of deuterium, —F, —Cl, —Br, —I, a hydroxyl group, a cyano group (CN), a nitro group, an amino group, a $C_1$-$C_{60}$ alkyl group, a $C_1$-$C_{60}$ alkoxy group, a $C_1$-$C_{60}$ alkylthio group, a $C_6$-$C_{60}$ aryl alkyl group, a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a carbazolyl group, —Si($Q_{31}$)($Q_{32}$)($Q_{33}$), —N($Q_{34}$)($Q_{35}$), —B($Q_{36}$)($Q_{37}$), or —P(═O)($Q_{38}$)($Q_{39}$).

12. The organic light-emitting device of claim 1, wherein, $Ar_1$ is a group of Formulae 3-1 to 3-78:

3-1

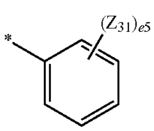

3-2

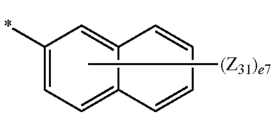

3-3

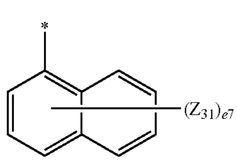

-continued 3-4

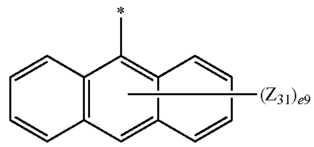

3-5

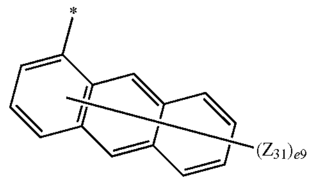

3-6

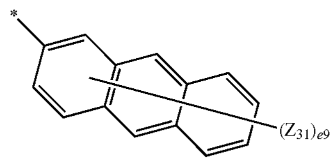

3-7

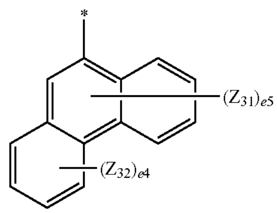

3-8

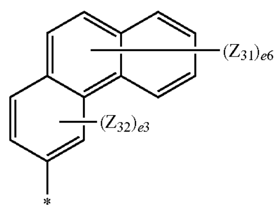

3-9

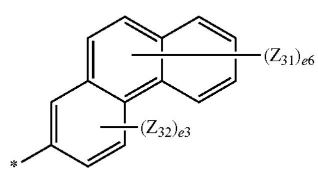

3-10

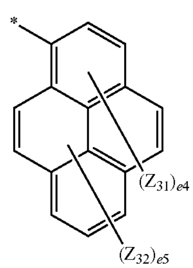

3-11

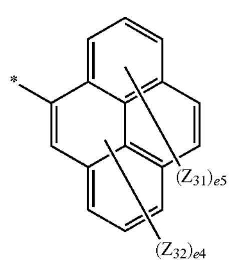

-continued
3-12
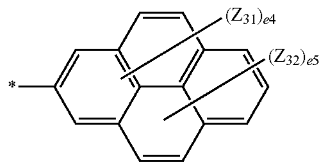
3-13
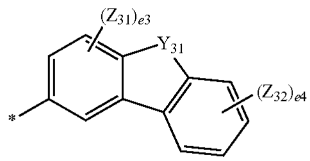
3-14
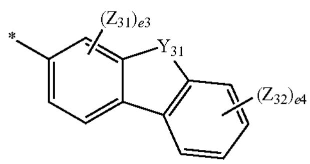
3-15
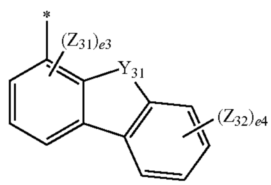
3-16
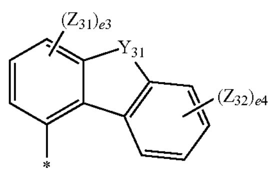
3-17
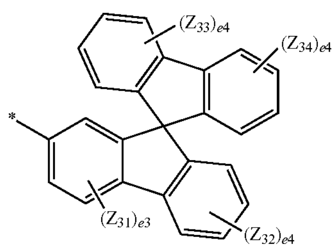
3-18
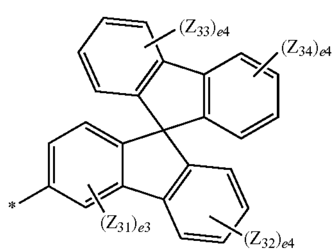
3-19
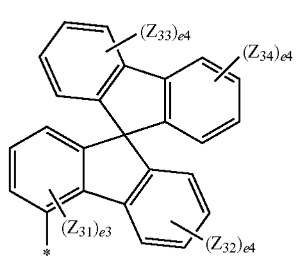
-continued
3-20
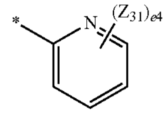
3-21
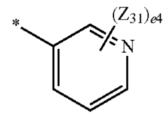
3-22
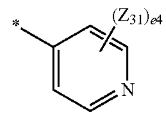
3-23
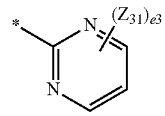
3-24
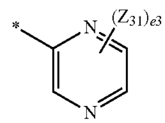
3-25
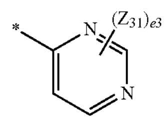
3-26
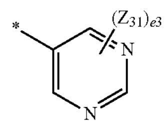
3-27
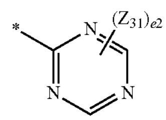
3-28
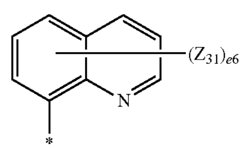
3-29
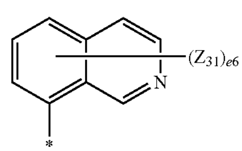
3-30
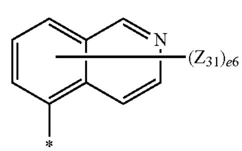
3-31
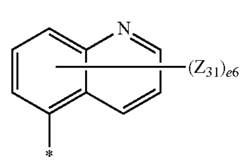

-continued
3-32
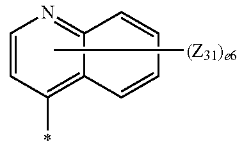
3-33
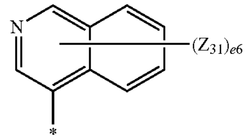
3-34
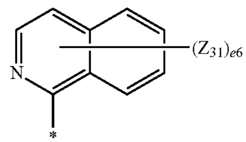
3-35
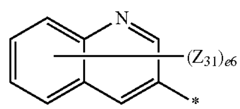
3-36
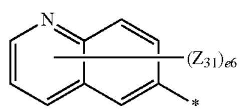
3-37
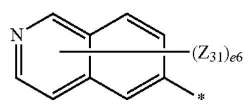
3-38
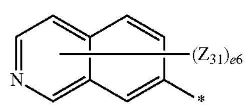
3-39
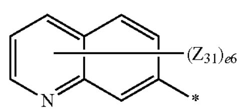
3-40
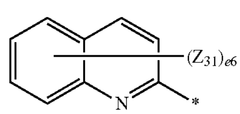
3-41
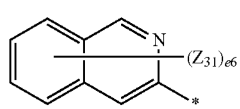
3-42
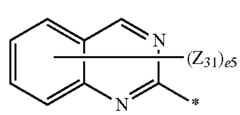
3-43
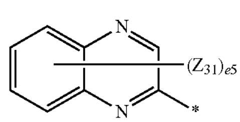
3-44
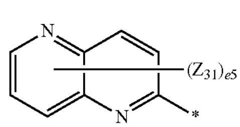
-continued
3-45
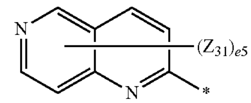
3-46
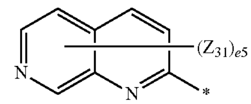
3-47
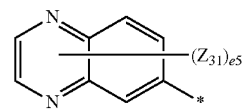
3-48
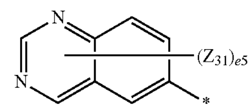
3-49
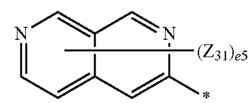
3-50
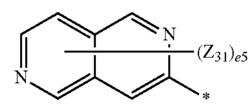
3-51
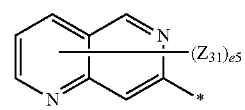
3-52
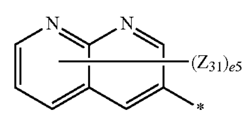
3-53
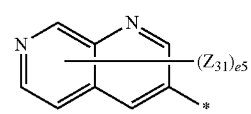
3-54
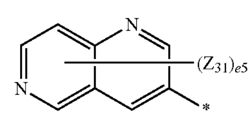
3-55
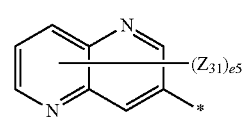
3-56
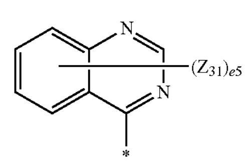
3-57
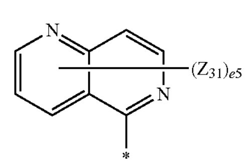

-continued
3-58
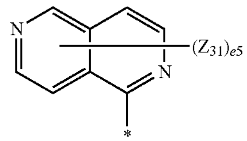
3-59
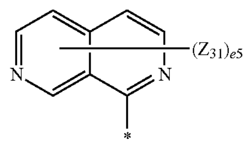
3-60
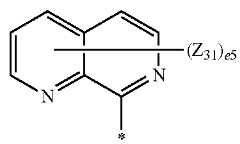
3-61
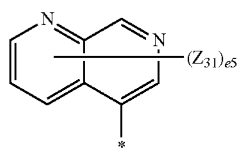
3-62
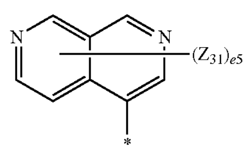
3-63
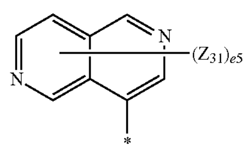
3-64
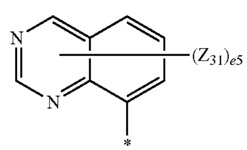
3-65
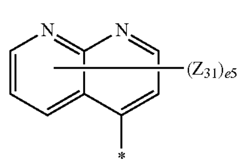
3-66
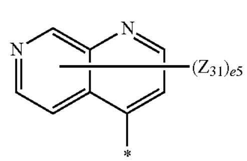
3-67
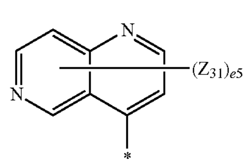
-continued
3-68
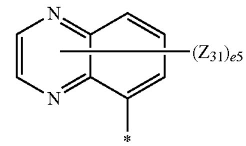
3-69
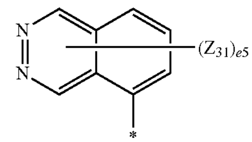
3-70
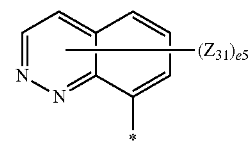
3-71
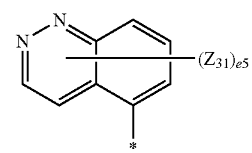
3-72
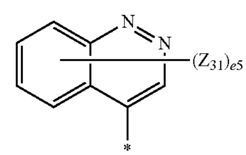
3-73
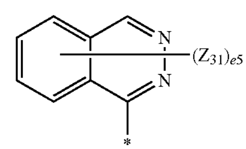
3-74
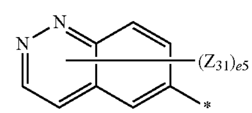
3-75
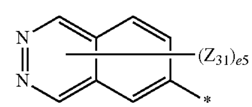
3-76
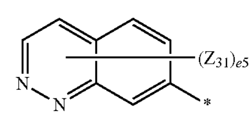
3-77
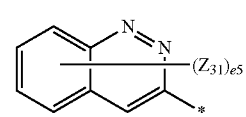
3-78
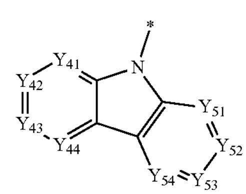

wherein, in Formulae 3-1 to 3-78, $Y_{31}$ is O, S, $N(R_{31})$, $C(R_{31})(R_{32})$, or $Si(R_{31})(R_{32})$, $Y_{41}$ is $C(R_{41})$ or N, $Y_{42}$ is $C(R_{42})$ or N, $Y_{43}$ is $C(R_{43})$ or N, $Y_{44}$ is $C(R_{44})$ or N, $Y_{51}$ is $C(R_{51})$ or N, $Y_{52}$ is $C(R_{52})$ or N, $Y_{53}$ is $C(R_{53})$ or N, $Y_{54}$ is $C(R_{54})$ or N, $Z_{31}$ to $Z_{34}$, $R_{31}$, $R_{32}$, $R_{41}$ to $R_{44}$, and $R_{51}$ to $R_{54}$ are each independently hydrogen, deuterium, —F, —Cl, —Br, —I, a hydroxyl group, a cyano group (CN), a nitro group, an amino group, a $C_1$-$C_{60}$ alkyl group, a $C_1$-$C_{60}$ alkoxy group, a $C_1$-$C_{60}$ alkylthio group, a $C_6$-$C_{60}$ aryl alkyl group, a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, or a carbazolyl group, e2 is an integer from 0 to 2, e3 is an integer from 0 to 3, e4 is an integer from 0 to 4, e5 is an integer from 0 to 5, e6 is an integer from 0 to 6, e7 is an integer from 0 to 7, e9 is an integer from 0 to 9,

* indicates a binding site to a neighboring atom, and substituents $Z_{31}$ to $Z_{34}$ are present on each ring through which the bond with the corresponding substituent passes.

13. The organic light-emitting device of claim 1, wherein $R_a$ and $R_1$ to $R_5$ are each independently:

a binding site to $Ar_1$ in Formula 1;

hydrogen, deuterium, —F, —Cl, —Br, —I, a hydroxyl group, a cyano group (CN), a nitro group, an amino group, a $C_1$-$C_{60}$ alkyl group, a $C_1$-$C_{60}$ alkylthio group, or a $C_1$-$C_{60}$ alkoxy group;

a $C_1$-$C_{60}$ alkyl group a $C_1$-$C_{60}$ alkylthio group, or a $C_1$-$C_{60}$ alkoxy group, each independently substituted with at least one of deuterium, —F, —Cl, —Br, —I, a hydroxyl group, a cyano group (CN), a nitro group, an amino group, a phenyl group, a biphenyl group, a naphthyl group, a fluorenyl group, a phenanthrenyl group, an anthracenyl group, a fluoranthenyl group, a triphenylenyl group, a pyrenyl group, or a chrysenyl group;

a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, or a carbazolyl group;

a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, or a carbazolyl group, each independently substituted with at least one of deuterium, —F, —Cl, —Br, —I, a hydroxyl group, a cyano group (CN), a nitro group, an amino group, a $C_1$-$C_{60}$ alkyl group, a $C_1$-$C_{60}$ alkoxy group, a $C_1$-$C_{60}$ alkylthio group, a $C_6$-$C_{60}$ aryl alkyl group, a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a carbazolyl group, —Si($Q_{31}$)($Q_{32}$)($Q_{33}$), —N($Q_{34}$)($Q_{35}$), —B($Q_{36}$)($Q_{37}$), or —P(═O)($Q_{38}$)($Q_{39}$); or —N($Q_1$)($Q_2$), —Si($Q_3$)($Q_4$)($Q_5$), —B($Q_6$)($Q_7$), or —P(═O)($Q_8$)($Q_9$).

14. The organic light-emitting device of claim 1, wherein Formula 1 is represented by Formula 1-2:

Formula 1-2

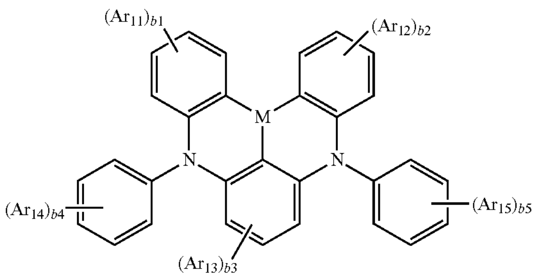

wherein, in Formula 1-2,

M is the same as described in claim 1, each of $Ar_{11}$ to $Ar_{15}$ is the same as described in connection with $Ar_1$ in claim 1, b1 and b2 are each independently an integer from 0 to 4, b3 is an integer from 0 to 3, b4 and b5 are each independently an integer from 0 to 5, and b1+b2+b3+b4+b5≥4.

15. The organic light-emitting device of claim 14, wherein (i) b1 is 4; b2 is 4; b4 is 4; or b5 is 4;

(ii) b1 is 3 and b2 is 1; b1 is 3 and b3 is 1; b1 is 3 and b4 is 1; or b1 is 3 and b5 is 1;

(iii) b1 is 2, b2 is 1, and b3 is 1; b1 is 2, b2 is 1, and b4 is 1; b1 is 2, b2 is 1, and b5 is 1; b1 is 2, b3 is 1, and b4 is 1; b1 is 2, b3 is 1, and b5 is 1; b1 is 2, b4 is 1, and b5 is 1; b1 is 2 and b2 is 2; b1 is 2 and b3 is 2; b1 is 2 and b4 is 2; or b1 is 2 and b5 is 2;

(iv) b1 is 1, b2 is 1, b3 is 1, and b4 is 1; b1 is 1, b2 is 1, b3 is 1, and b5 is 1; b1 is 1, b3 is 1, b4 is 1, and b5 is 1; b1 is 1, b2 is 2, and b3 is 1; b1 is 1, b2 is 2, and b4 is 1; b1 is 1, b2 is 2, and b5 is 1; b1 is 1, b2 is 1, and b3 is 2; b1 is 1, b3 is 2, and b4 is 1; b1 is 1, b3 is 2, and b5 is 1; b1 is 1, b2 is 1, and b4 is 2; b1 is 1, b3 is 1, and b4 is 2; b1 is 1, b4 is 2, and b5 is 1; b1 is 1, b2 is 1, and b5 is 2; b1 is 1, b3 is 1, and b5 is 2; b1 is 1, b4 is 1, and b5 is 2; b1 is 1 and b2 is 3; b1 is 1 and b3 is 3; b1 is 1 and b4 is 3; or b1 is 1 and b5 is 3;

(v) b2 is 3 and b3 is 1; b2 is 3 and b4 is 1; or b2 is 3 and b5 is 1;

(vi) b2 is 2, b3 is 1, and b4 is 1; b2 is 2, b3 is 1, and b5 is 1; b2 is 2, b4 is 1, and b5 is 1; b2 is 2 and b3 is 2; b2 is 2 and b4 is 2; or b2 is 2 and b5 is 2;

(vii) b2 is 1, b3 is 1, b4 is 1, and b5 is 1; b2 is 1, b3 is 2, and b4 is 1; b2 is 1, b3 is 2, and b5 is 1; b2 is 1, b3 is 1, and b4 is 2; b2 is 1, b4 is 2, and b5 is 1; b2 is 1, b5 is 2, and b3 is 1; b2 is 1, b5 is 2, and b4 is 1; b2 is 1 and b3 is 3; b2 is 1 and b4 is 3; or b2 is 1 and b5 is 3;

(viii) b3 is 3 and b4 is 1; or b3 is 3 and b5 is 1;

(ix) b3 is 2, b4 is 1, and b5 is 1; b3 is 2 and b4 is 2; or b3 is 2 and b5 is 2;

(x) b3 is 1, b4 is 2, and b5 is 1; or b3 is 1, b4 is 1, and b5 is 2;

(xi) b4 is 3 and b5 is 1;

(xii) b4 is 2 and b5 is 2; or (xiii) b4 is 1 and b5 is 3.

16. The organic light-emitting device of claim 1, wherein the emission layer emits blue light having a maximum emission wavelength of about 450 nanometers to about 500 nanometers.

17. The organic light-emitting device of claim 1, wherein the second dopant compound is Compounds 1 to 229 below:

1

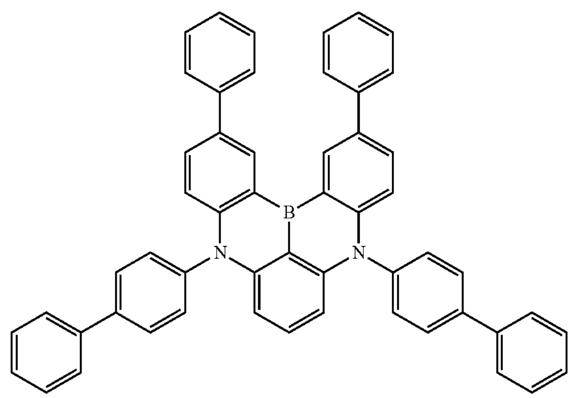

2

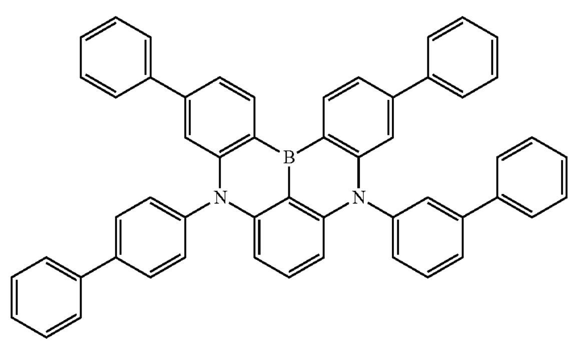

3

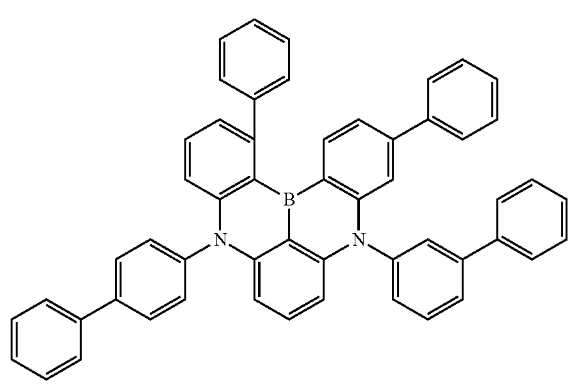

-continued
4
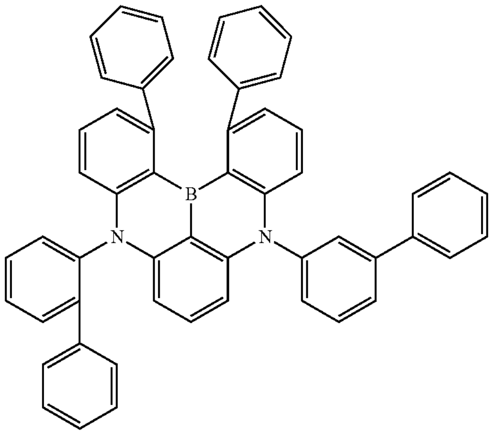
5
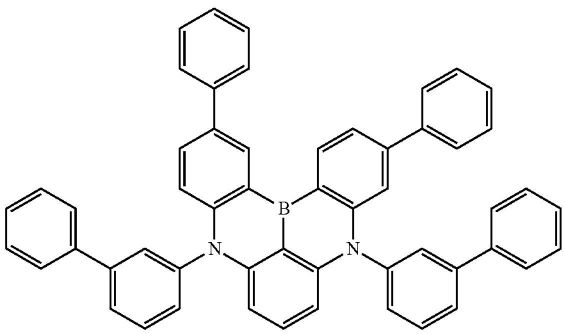
6
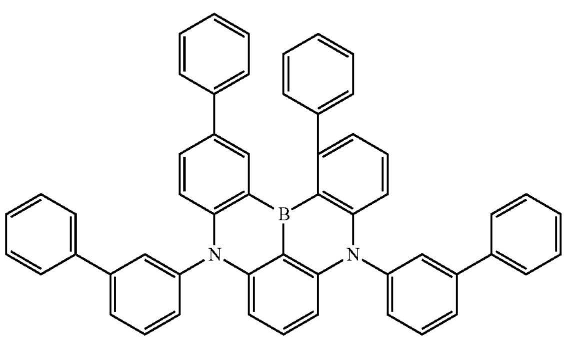
7
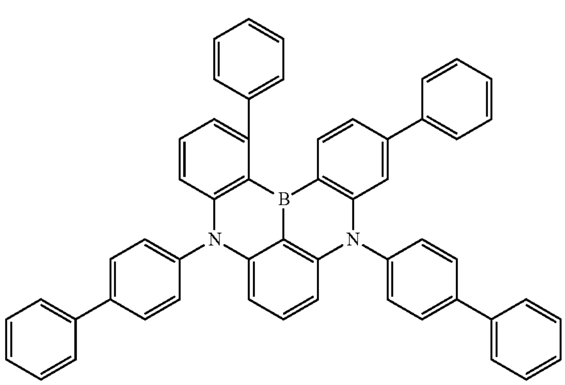
-continued
8
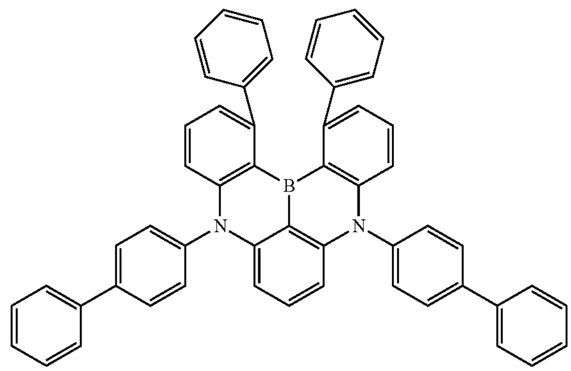
9
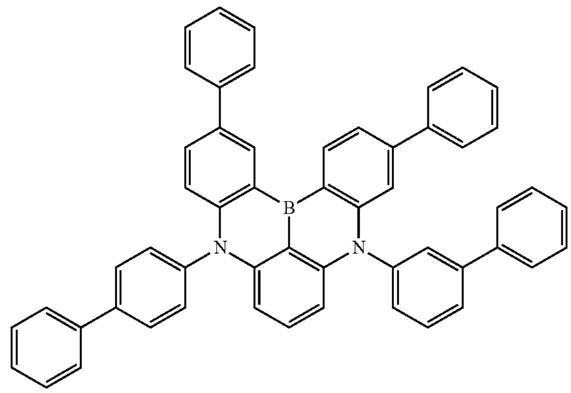
10
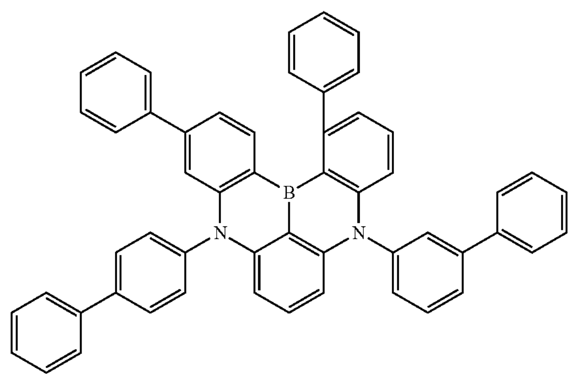
11
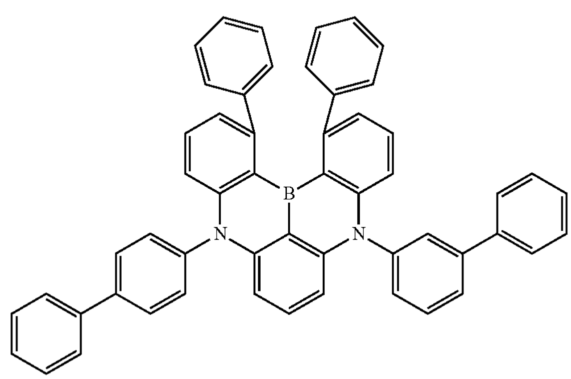

-continued
12
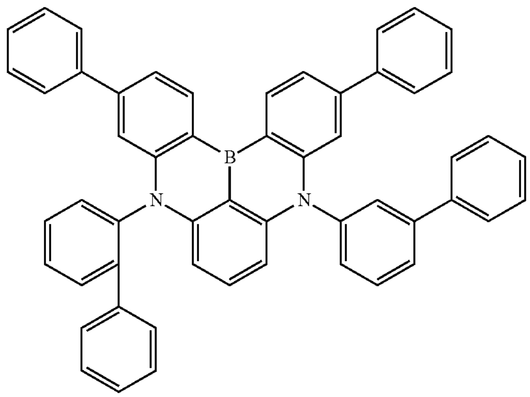
13
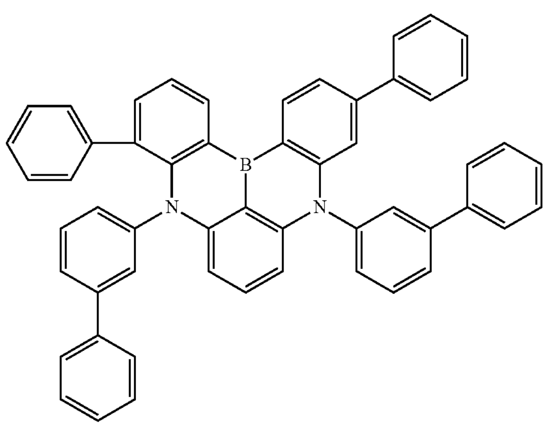
14
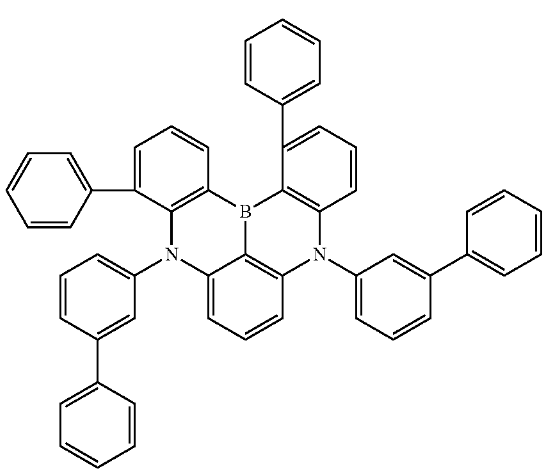
-continued
15
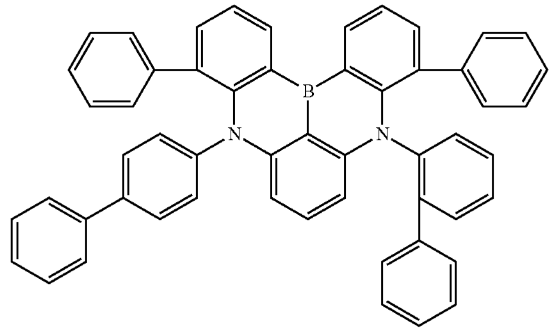
16
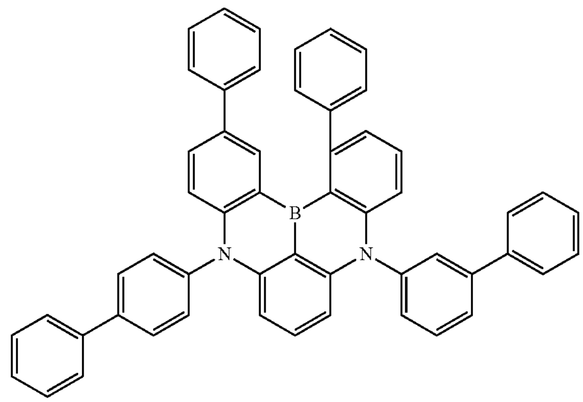
17
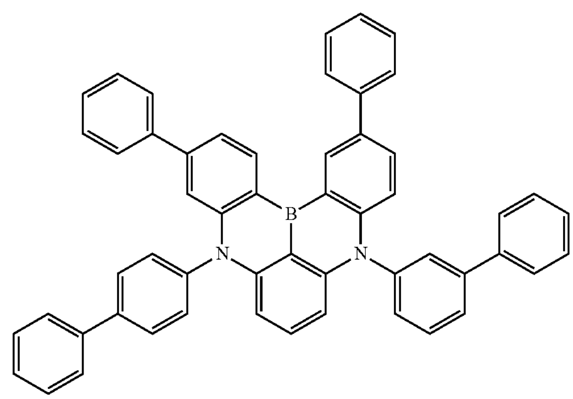
18
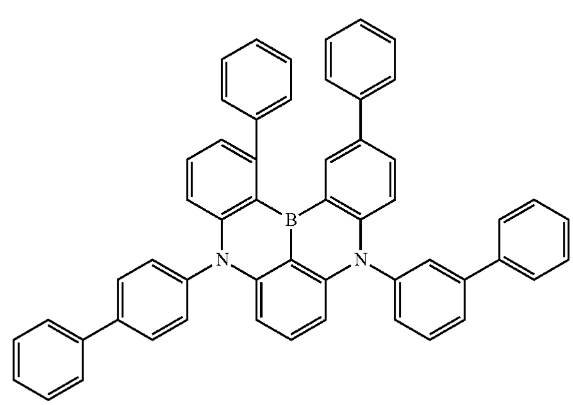

19
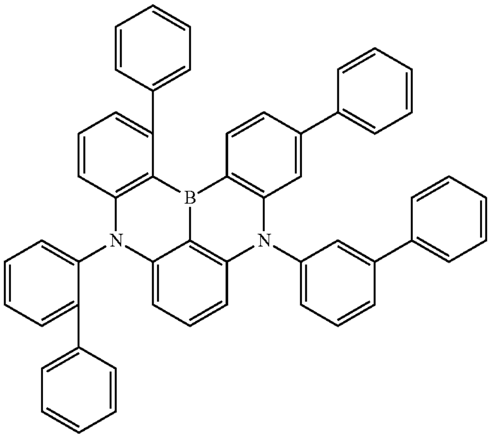
20
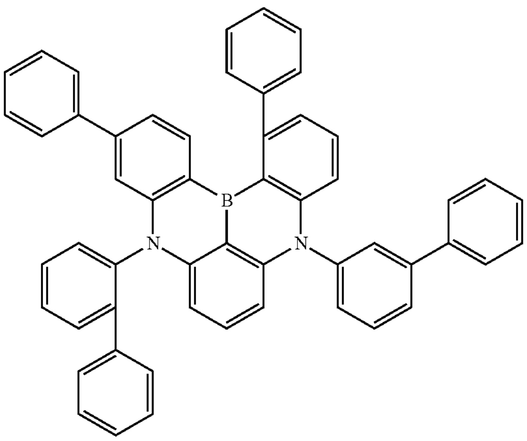
21
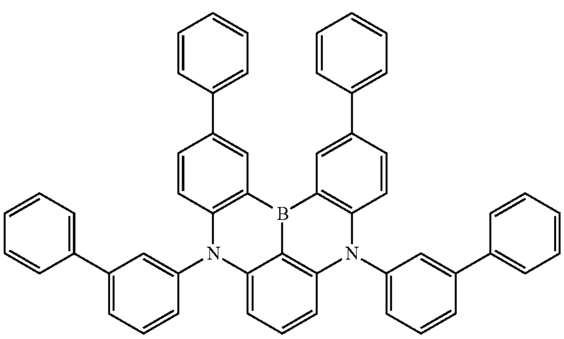
22
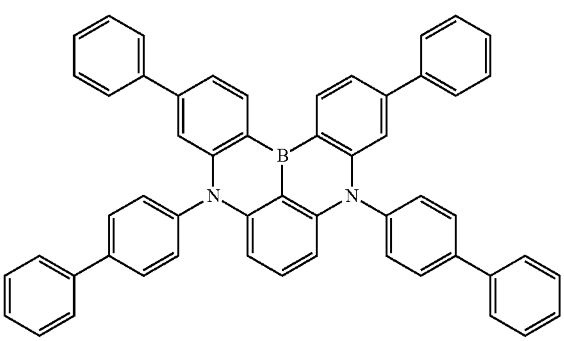
23
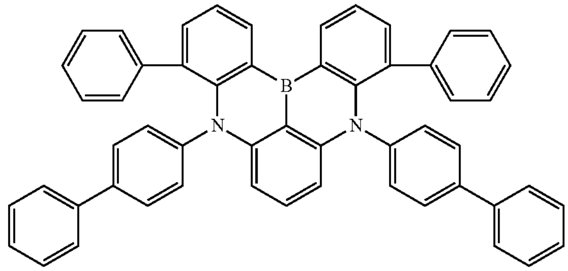
24
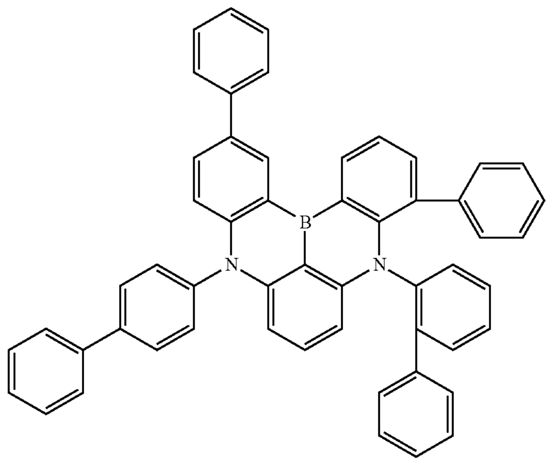
25
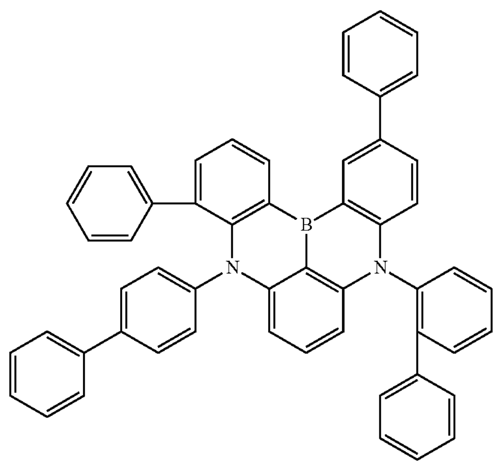
26
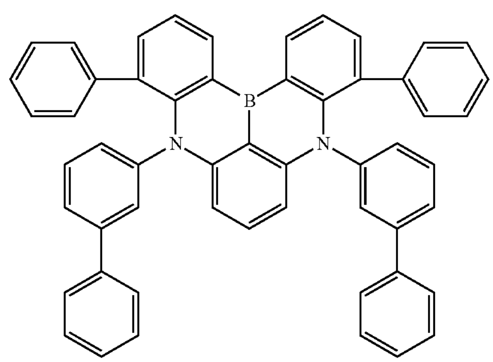

27
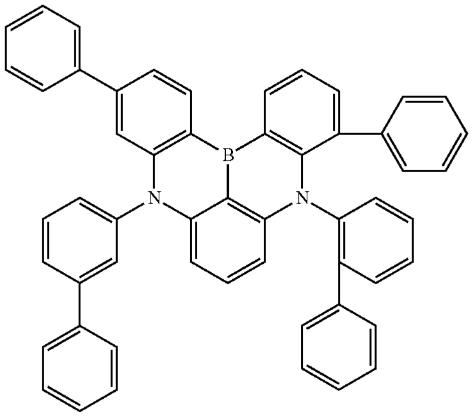
28
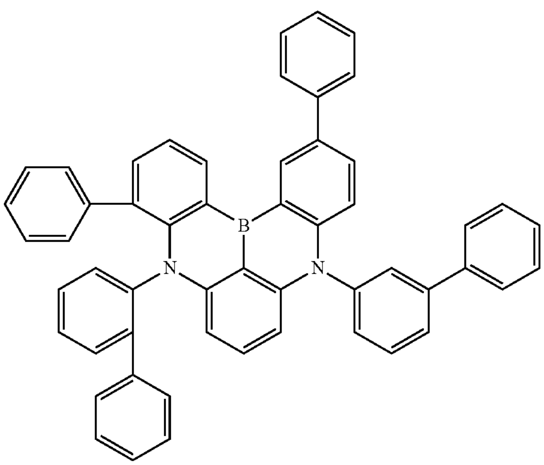
29
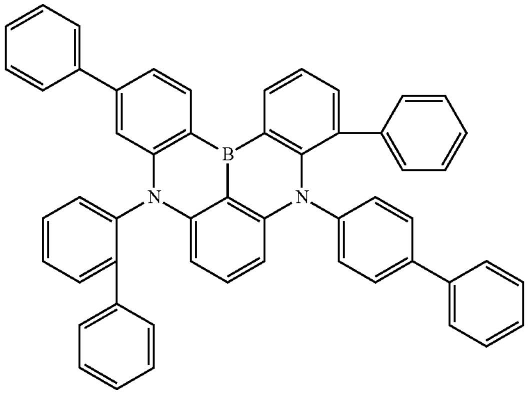
30
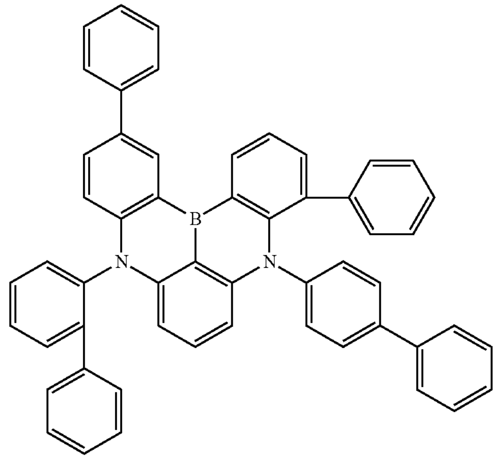
31
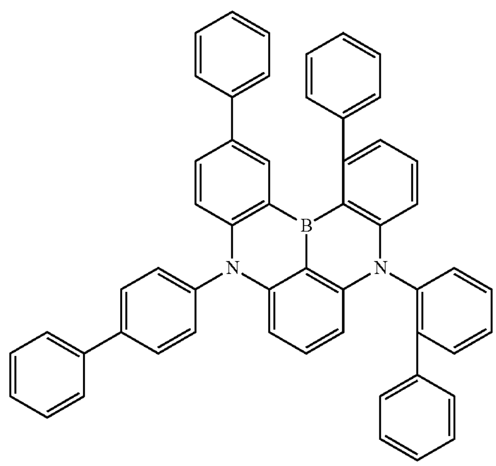
32
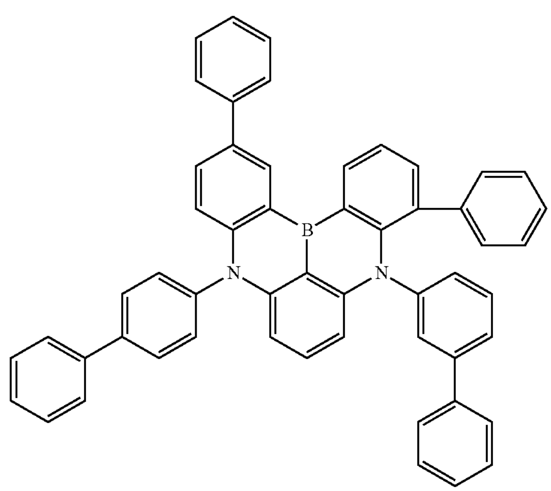

-continued
33
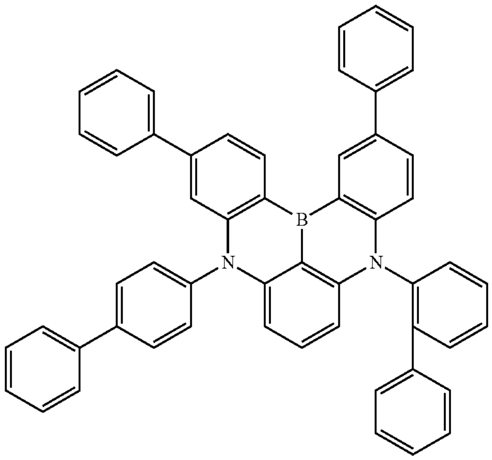
34
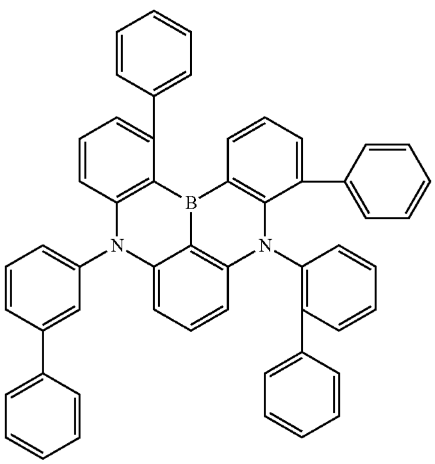
35
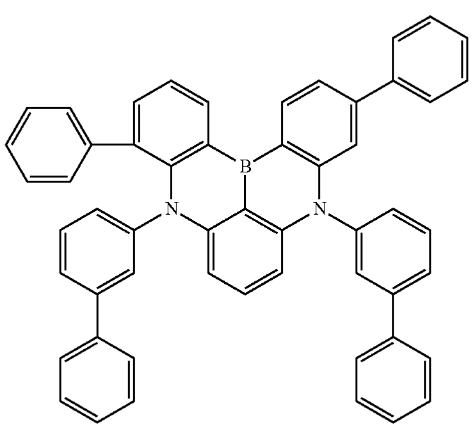
-continued
36
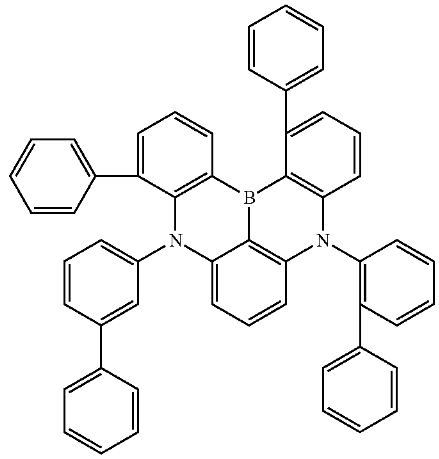
37
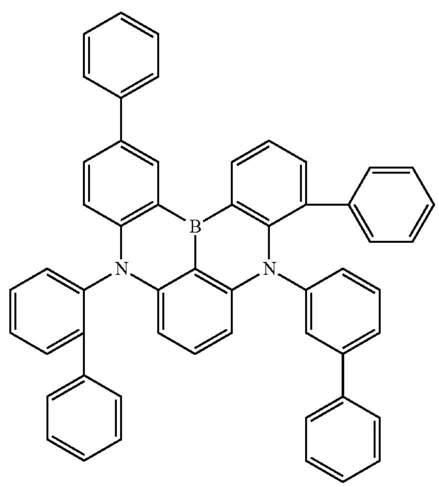
38
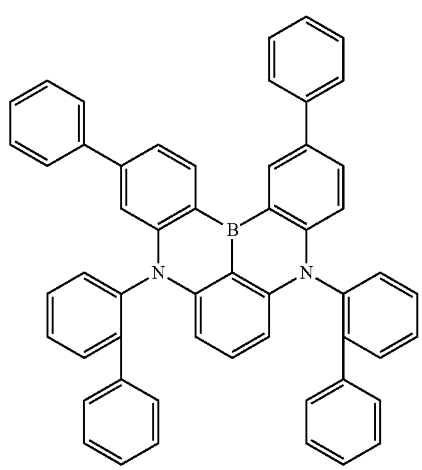

39
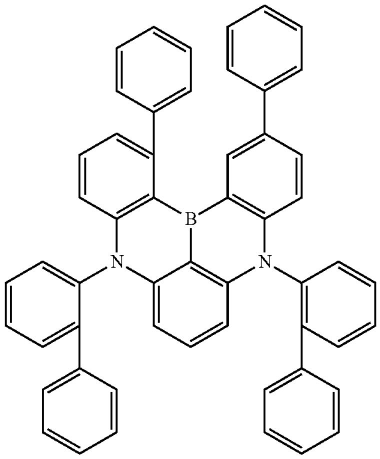
40
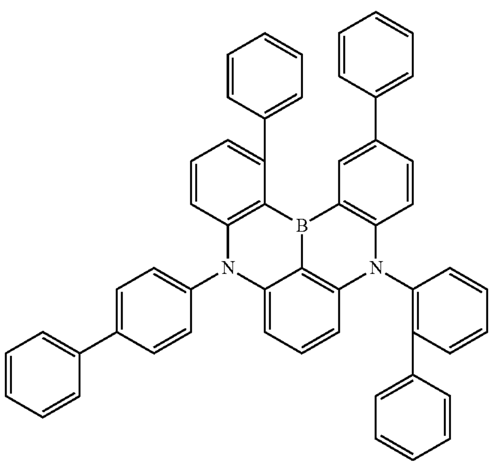
41
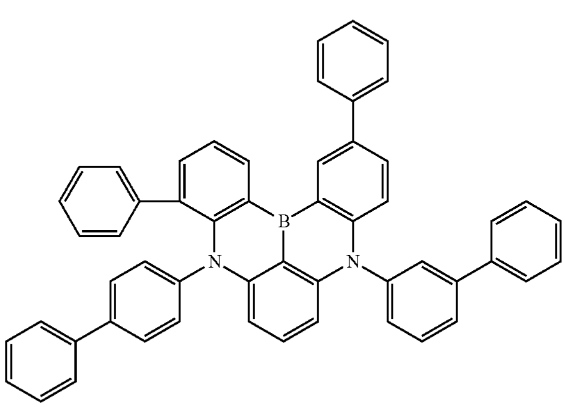
42
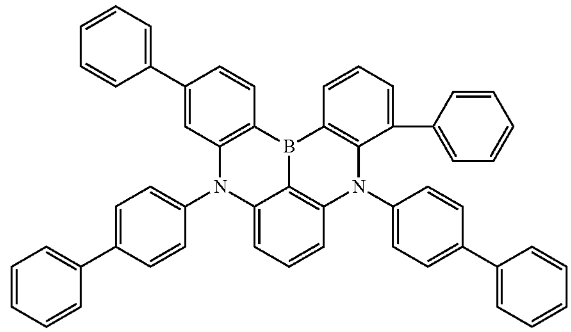
43
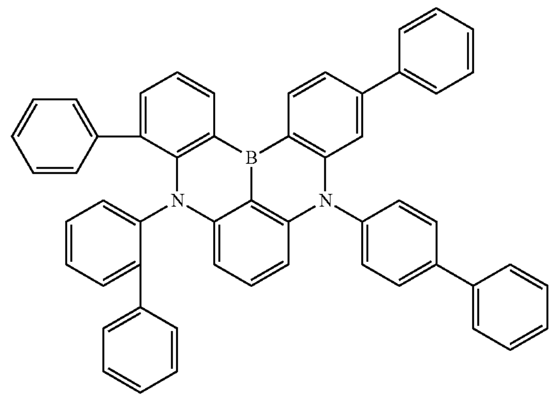
44
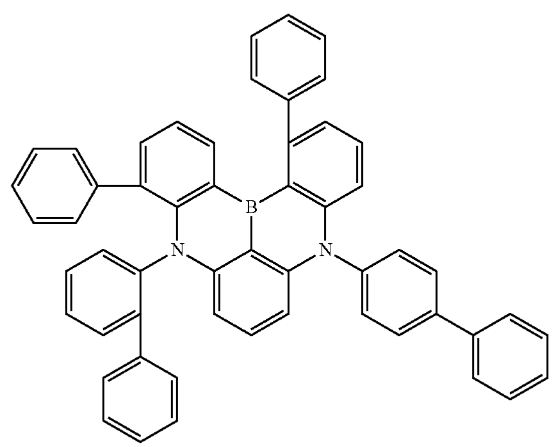
45
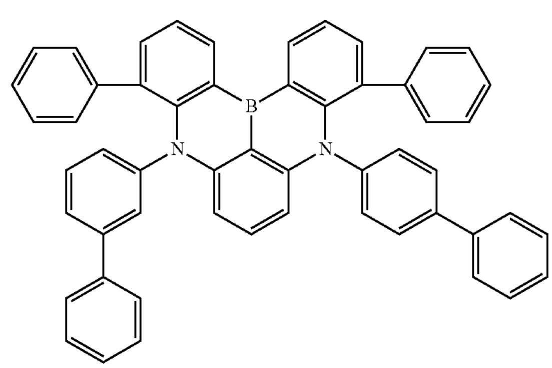

-continued
46
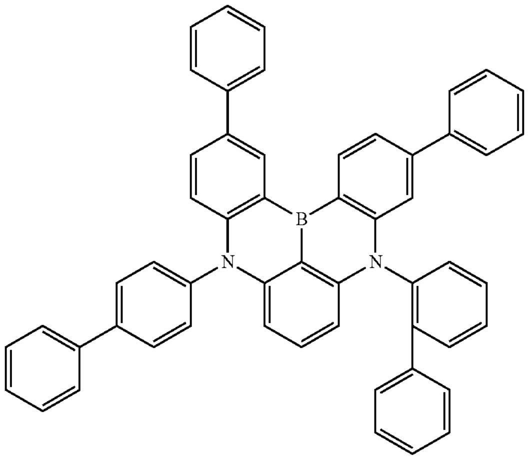
47
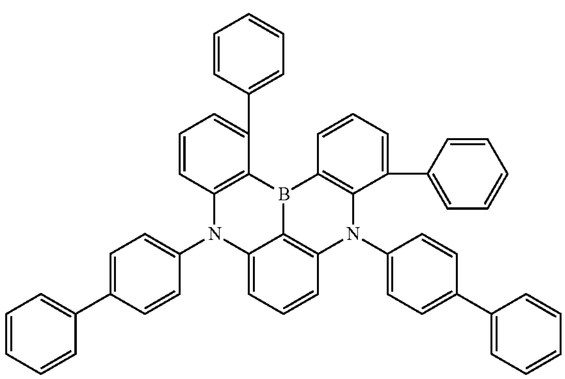
48
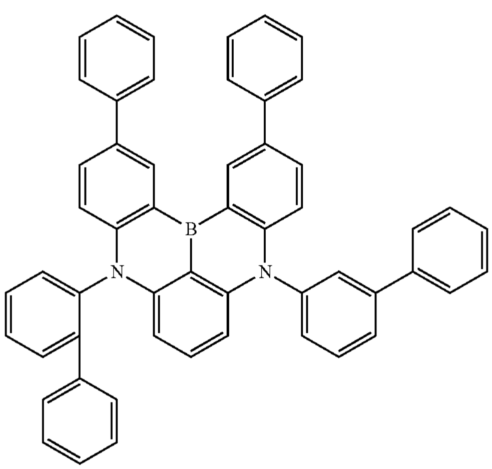
-continued
49
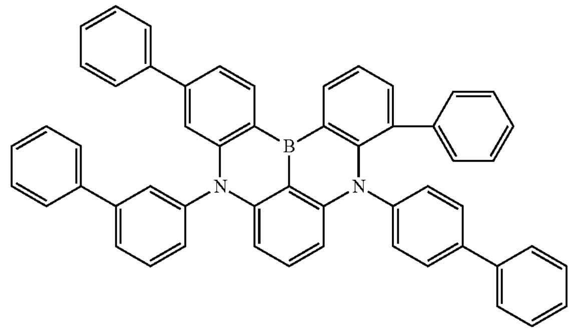
50
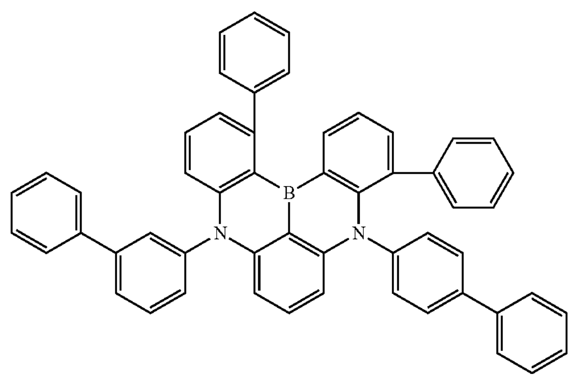
51
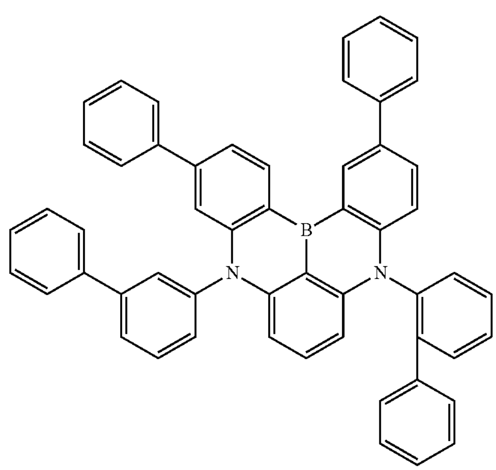

52
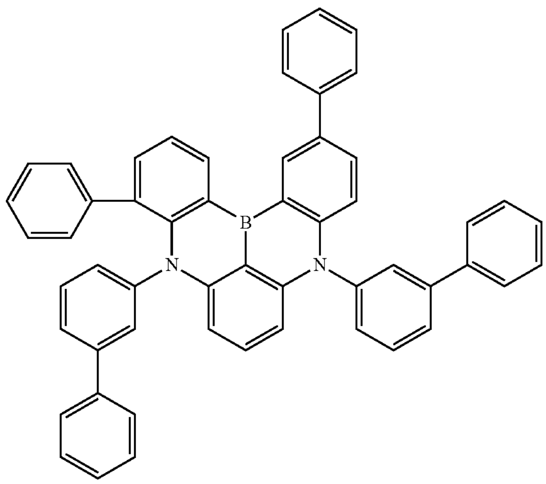
53
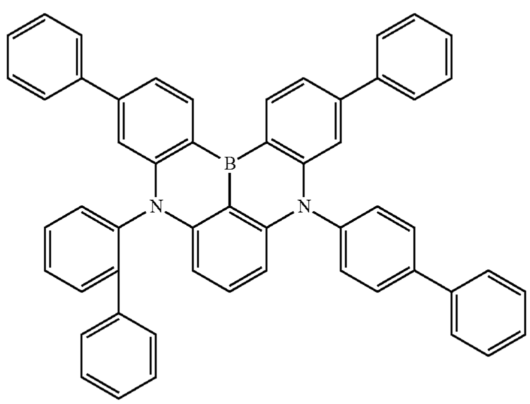
54
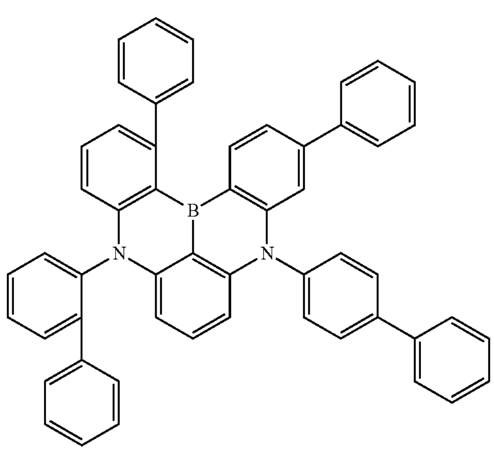
55
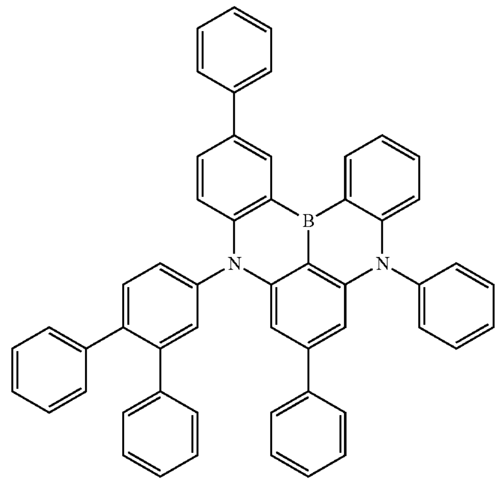
56
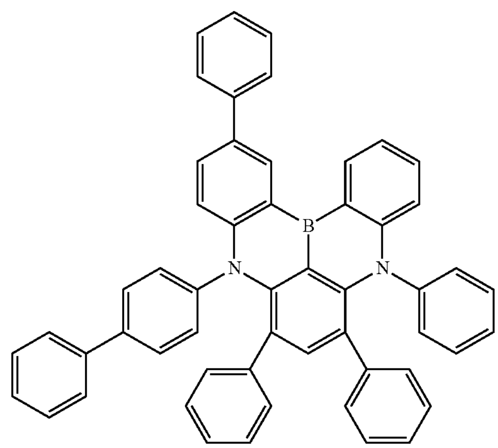
57
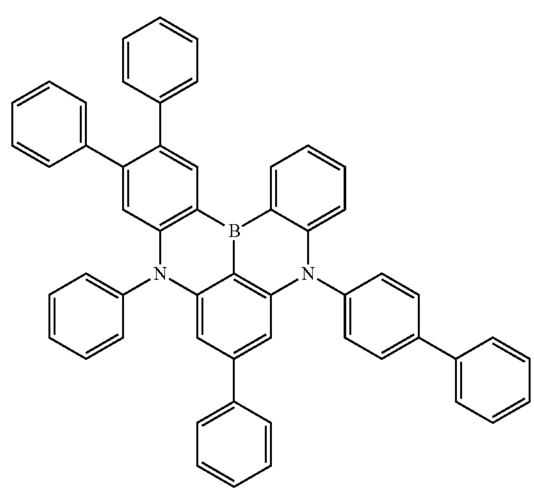

-continued
58
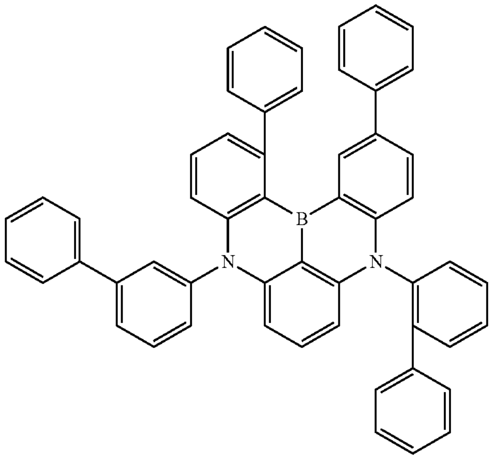
59
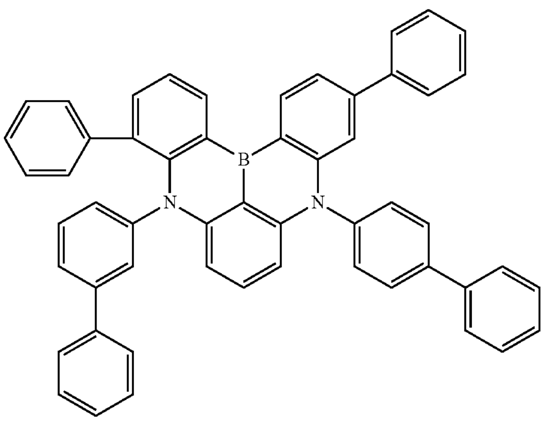
60
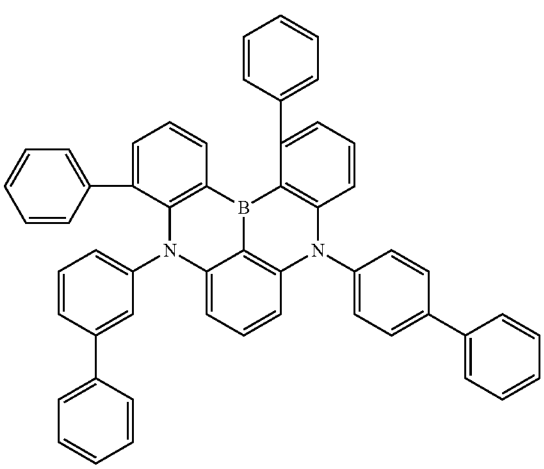
-continued
61
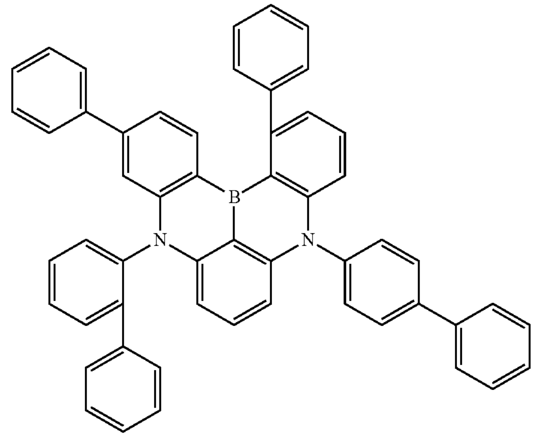
62
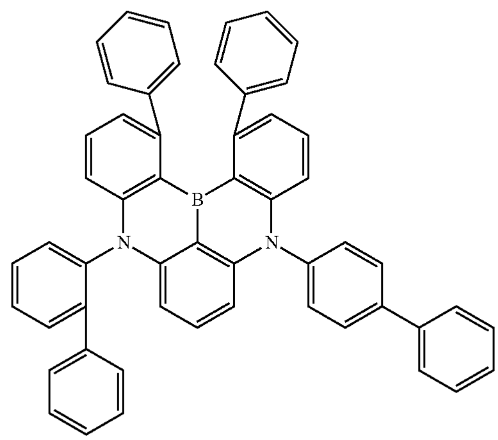
63
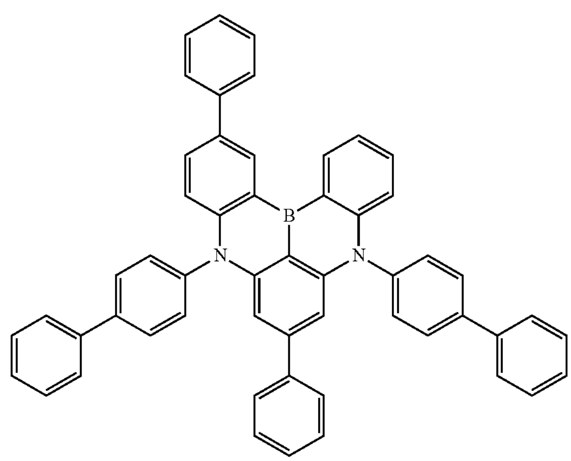

-continued
64
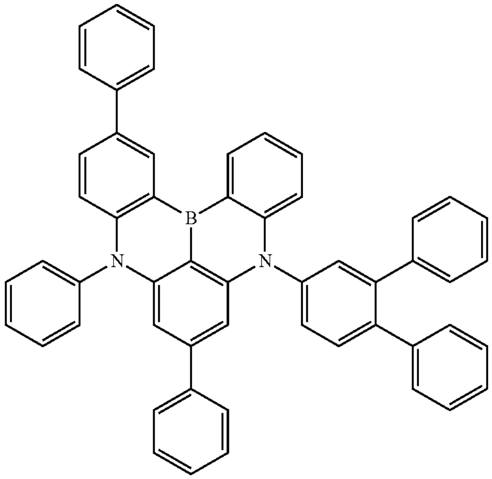
65
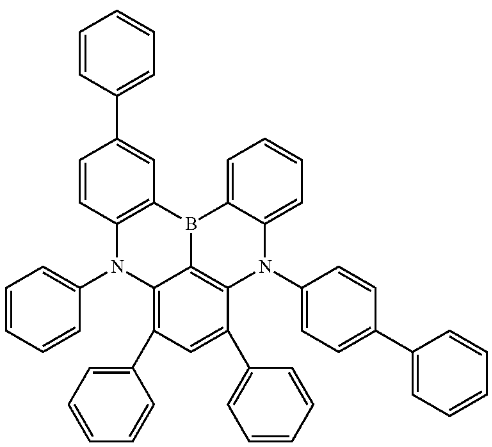
66
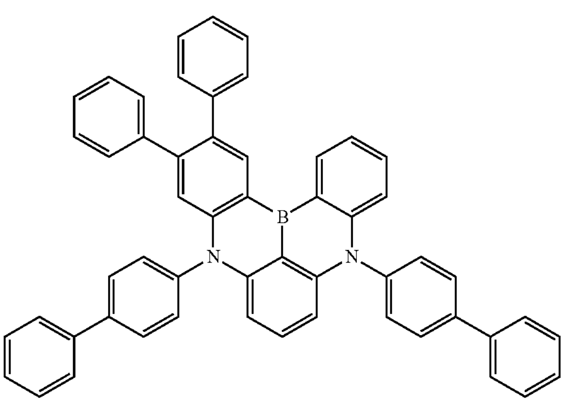
-continued
67
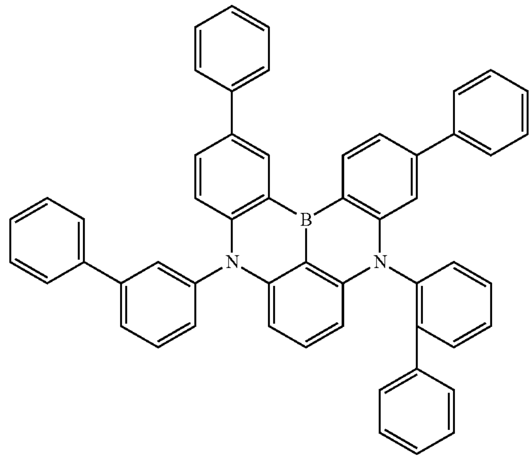
68
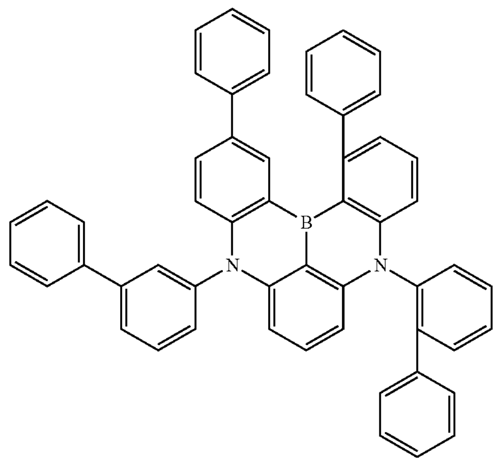
69
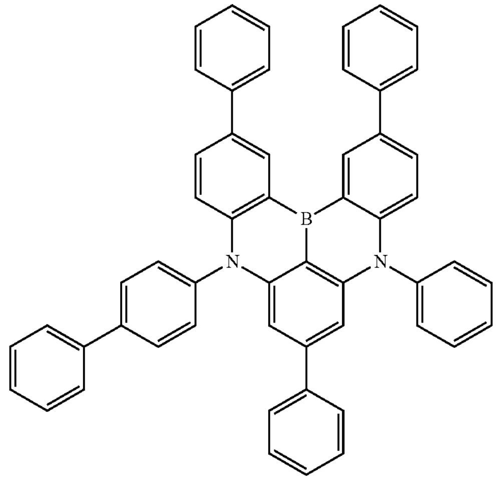

-continued
70
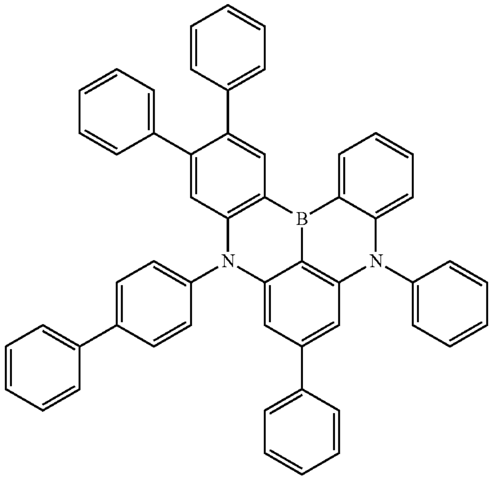
71
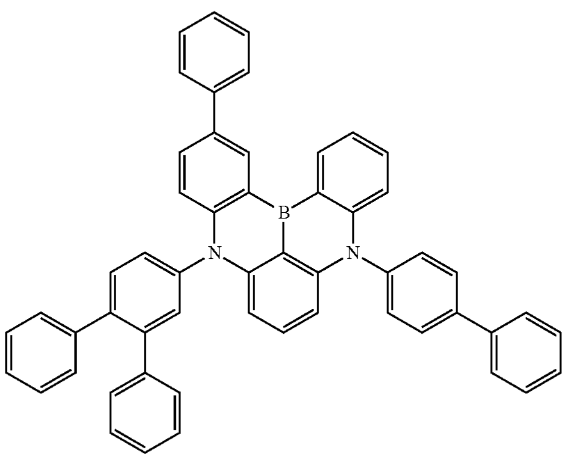
72
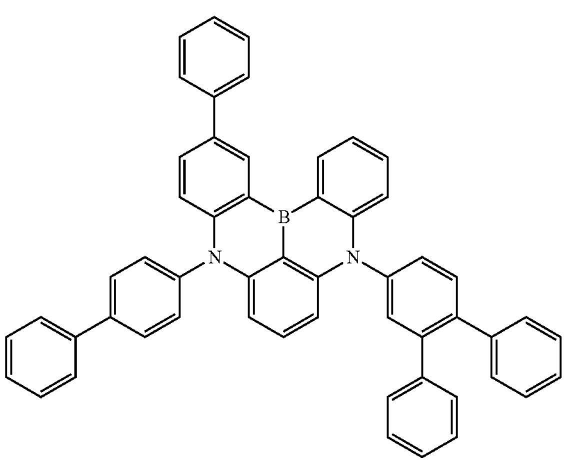
-continued
73
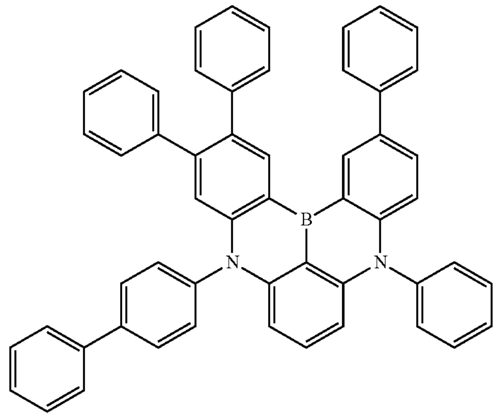
74
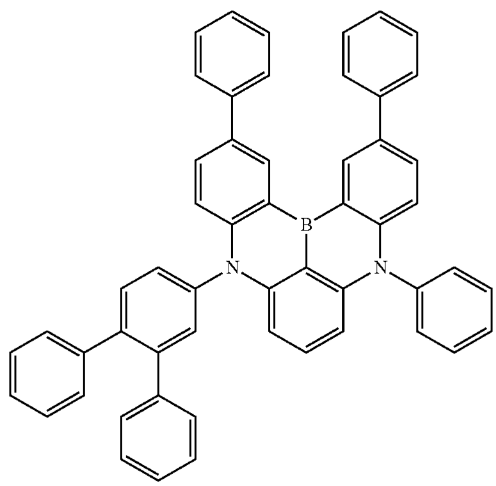
75
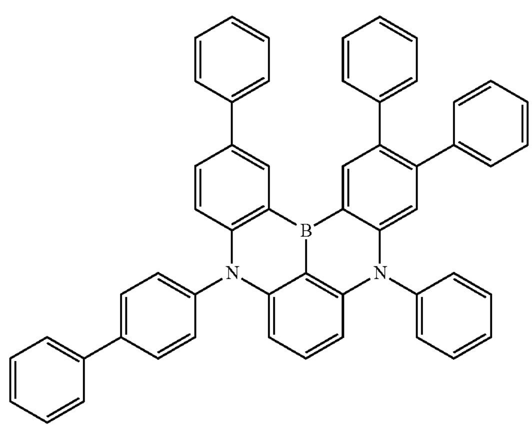

-continued
76
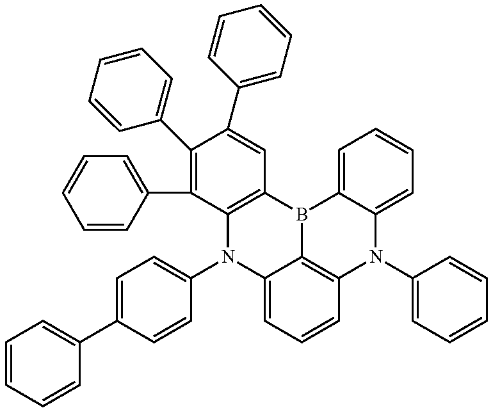
77
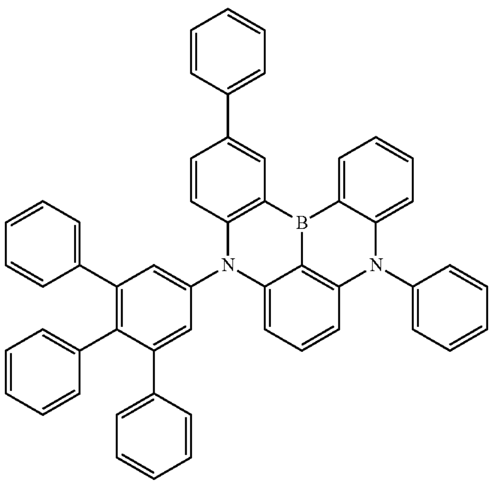
78
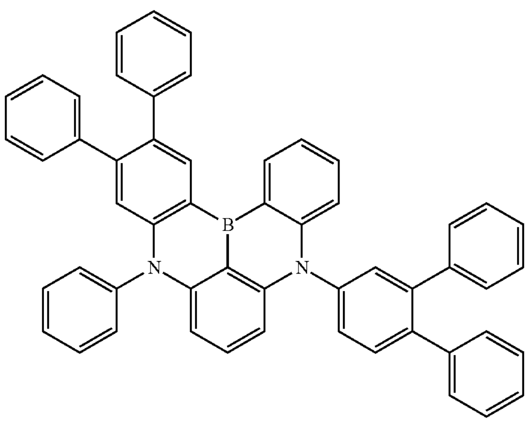
79
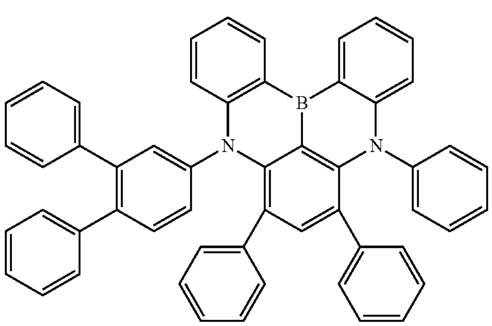
-continued
80
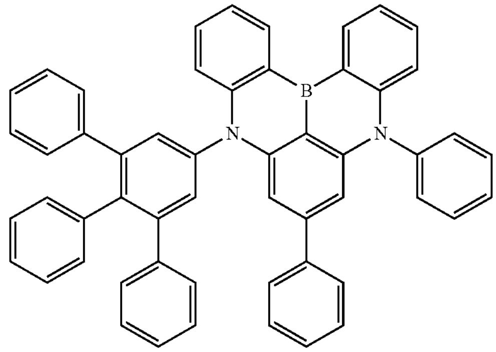
81
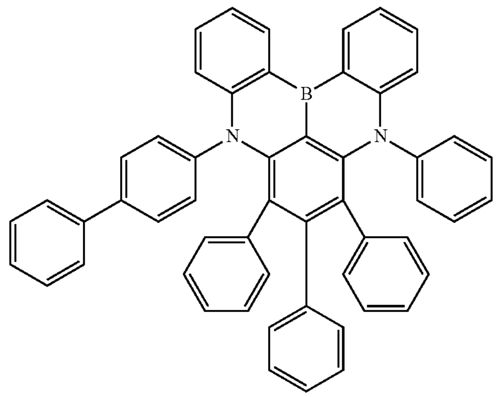
82
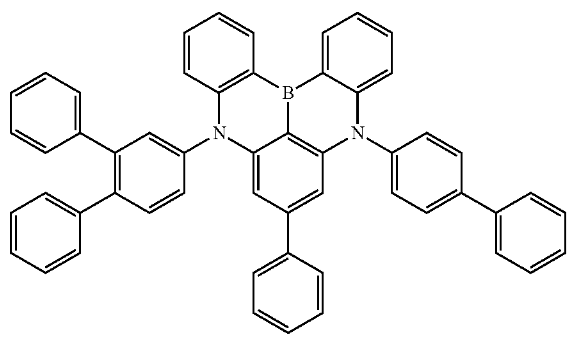
83
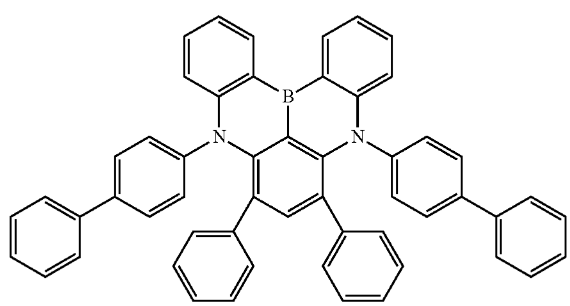

-continued
84
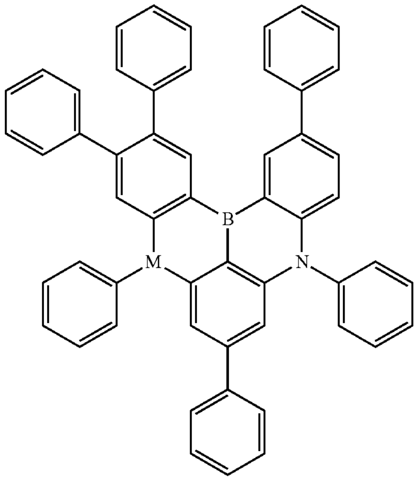
85
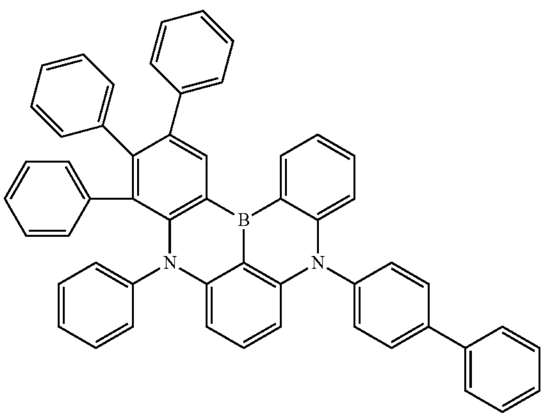
86
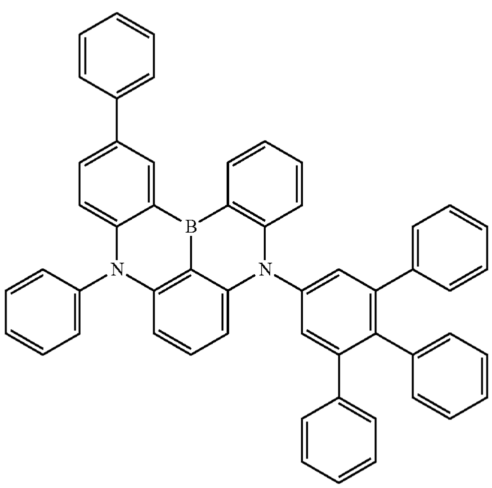
-continued
87
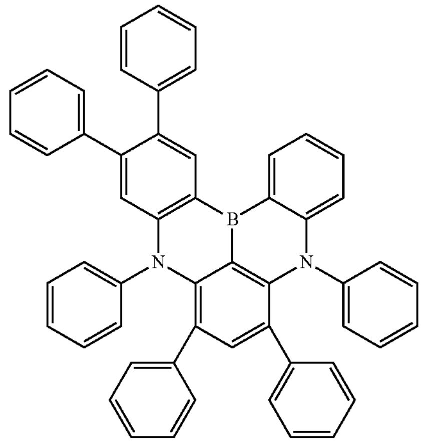
88
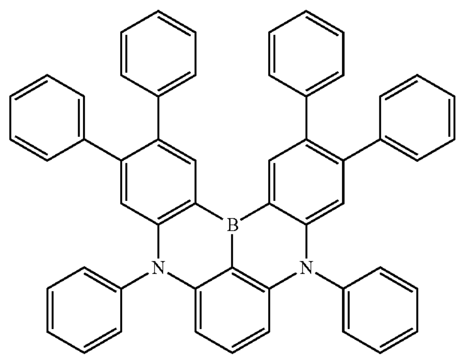
89
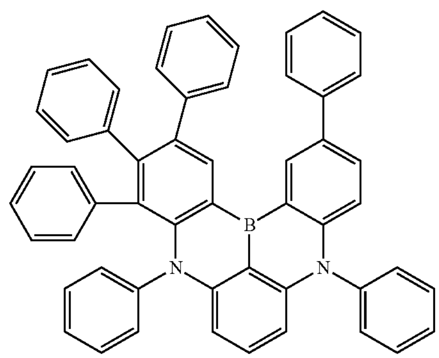
90
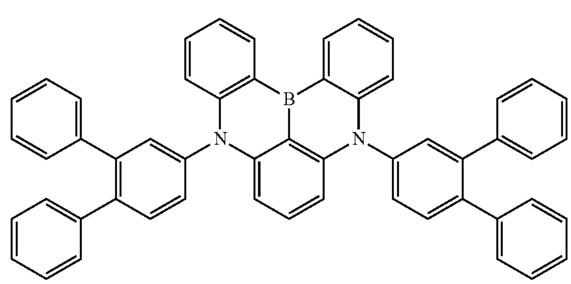

-continued
91
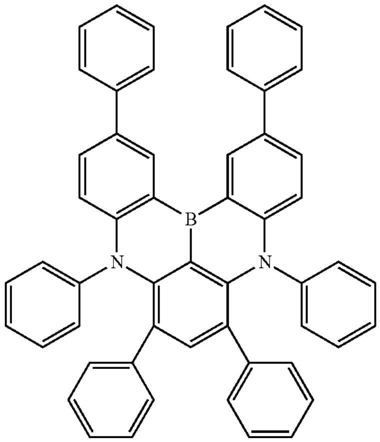
92
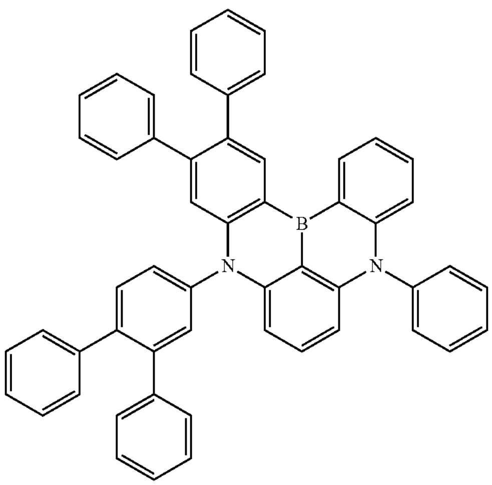
93
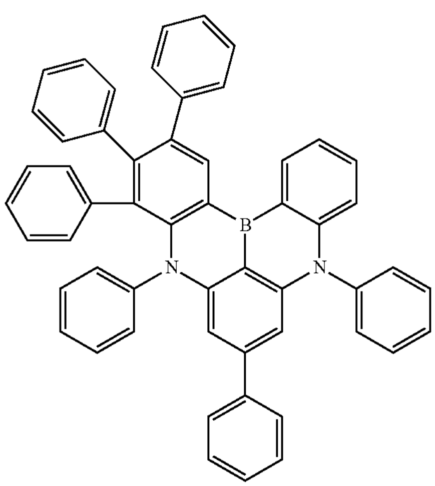
-continued
94
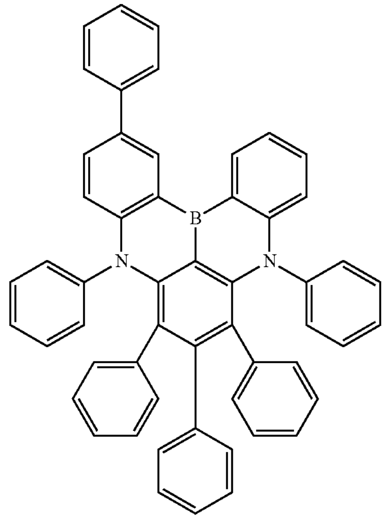
95
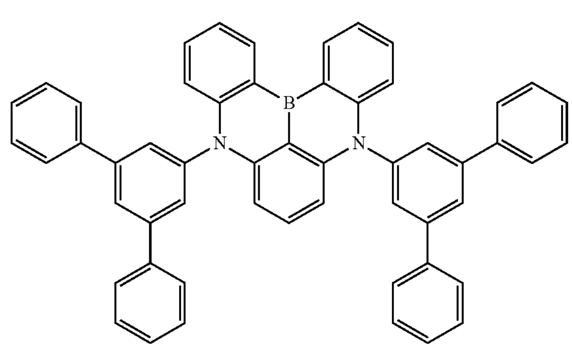
96
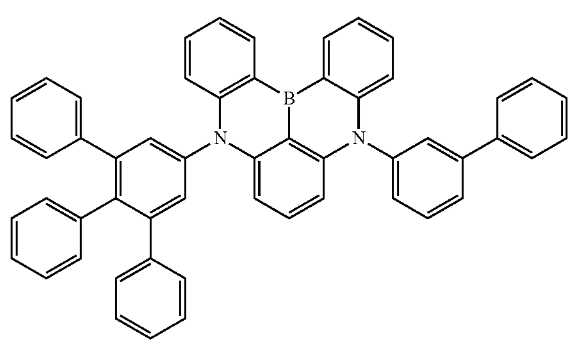

-continued
97
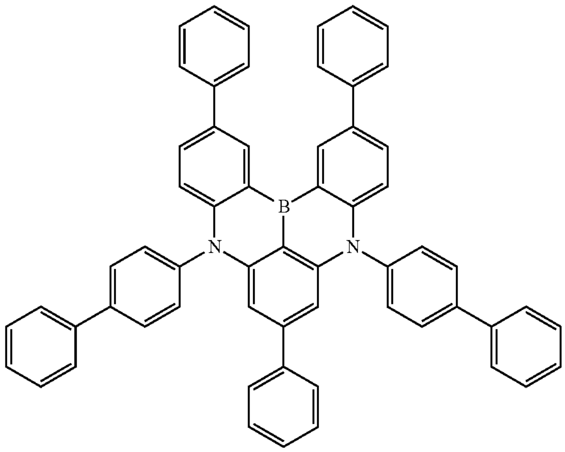
98
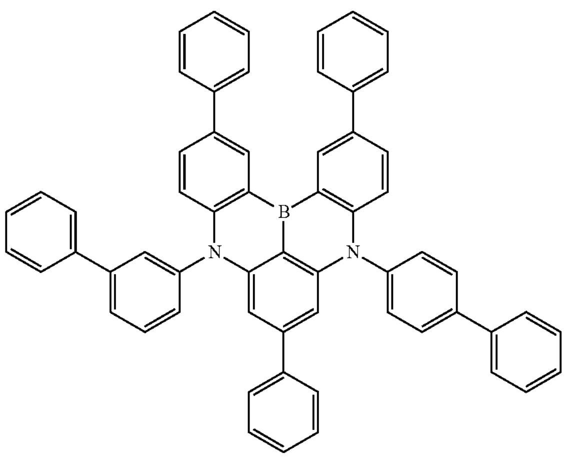
99
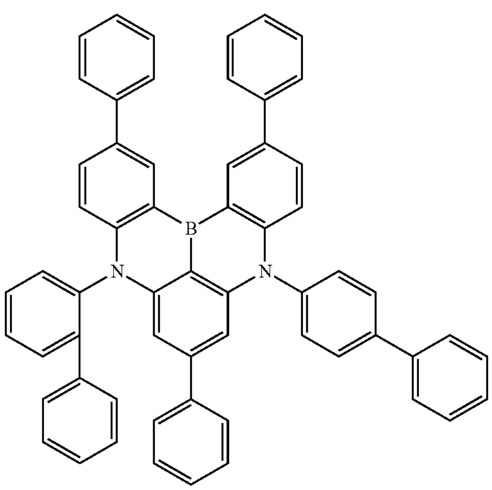
-continued
100
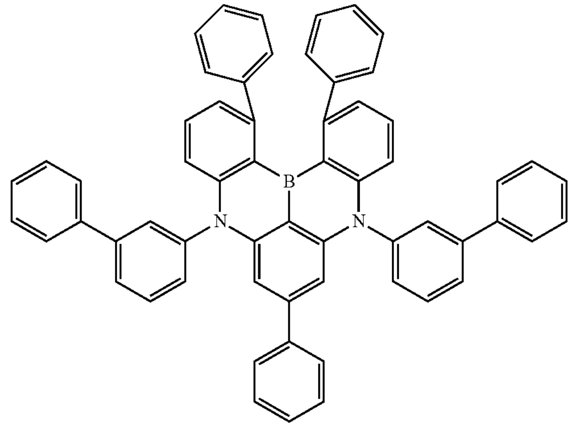
101
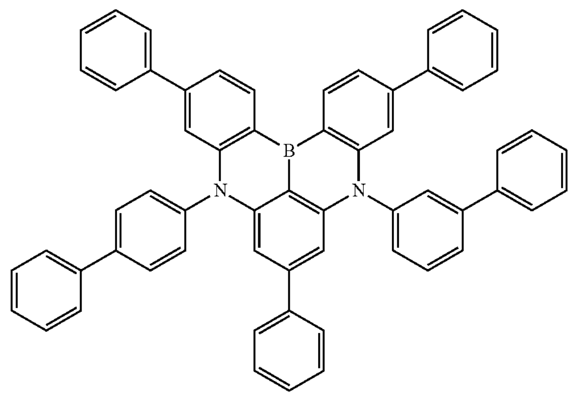
102
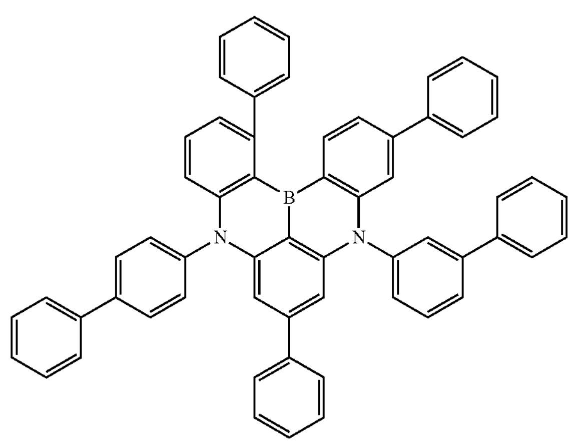

103
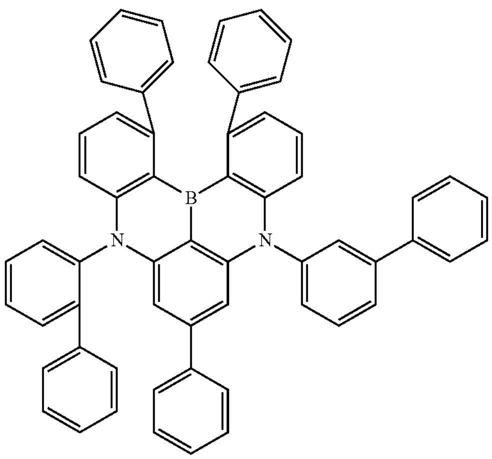
104
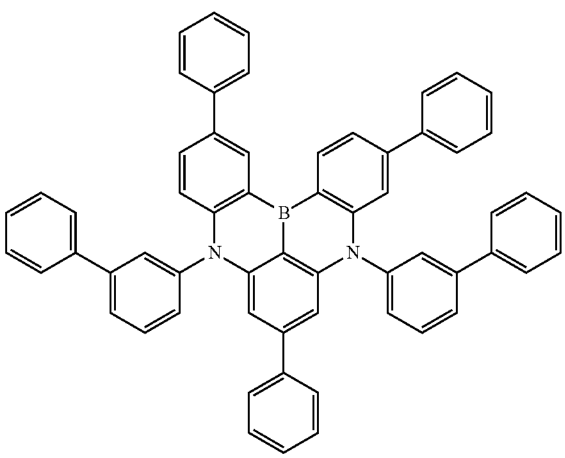
105
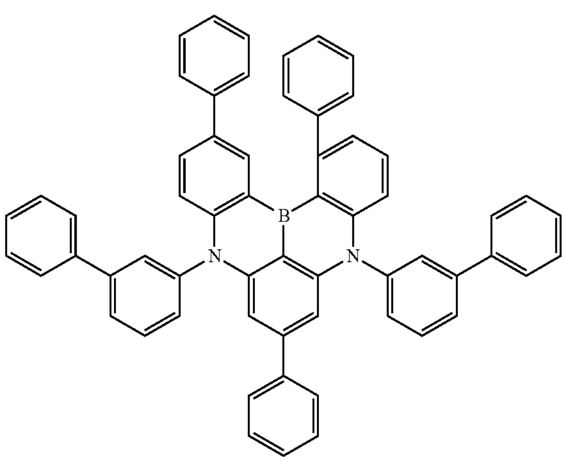
106
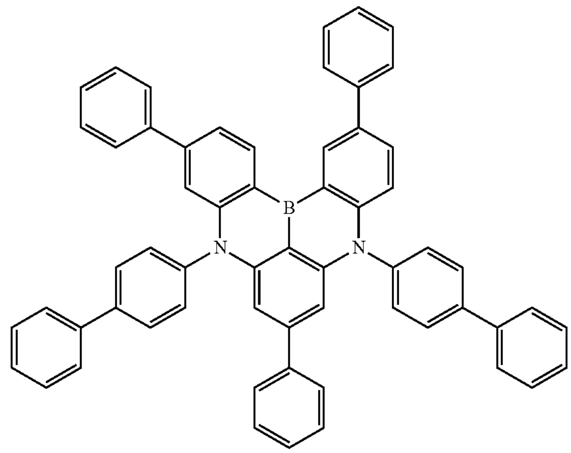
107
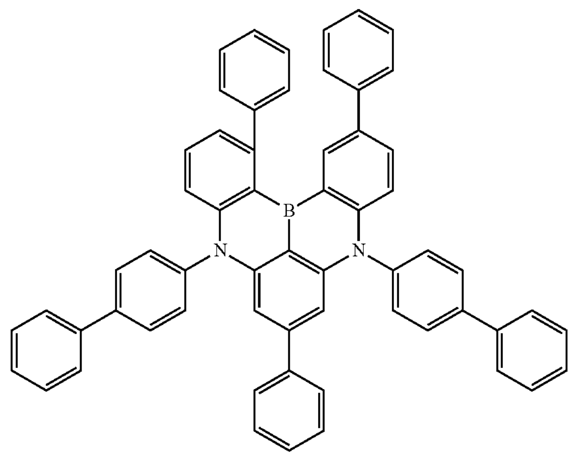
108
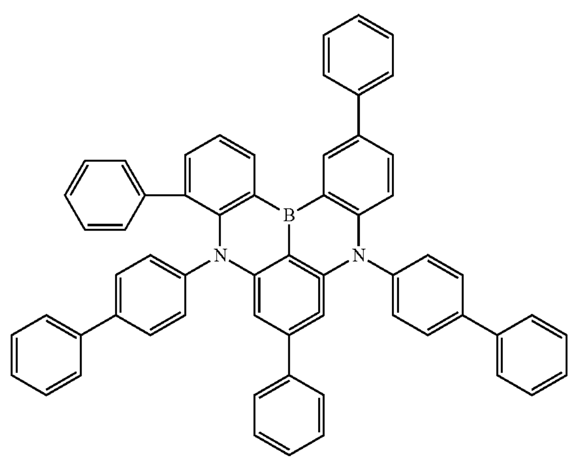

-continued
109
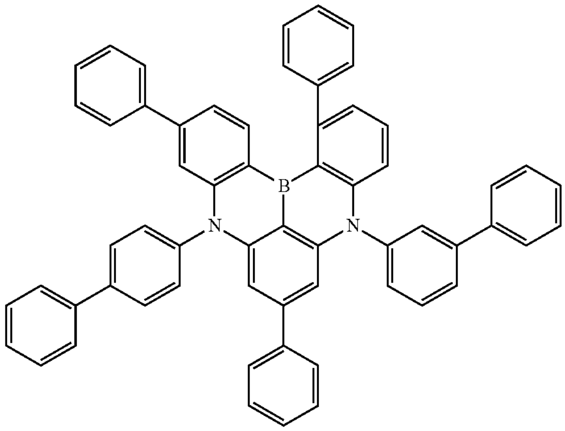
110
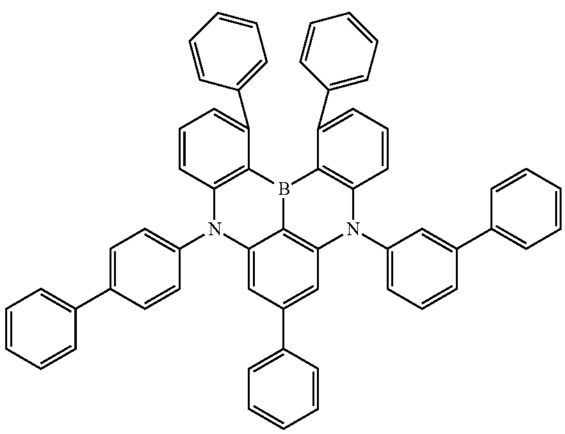
111
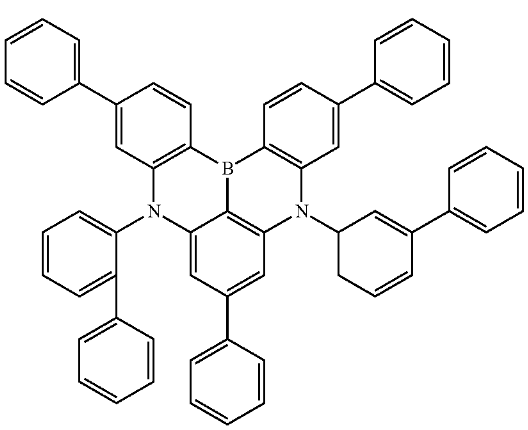
-continued
112
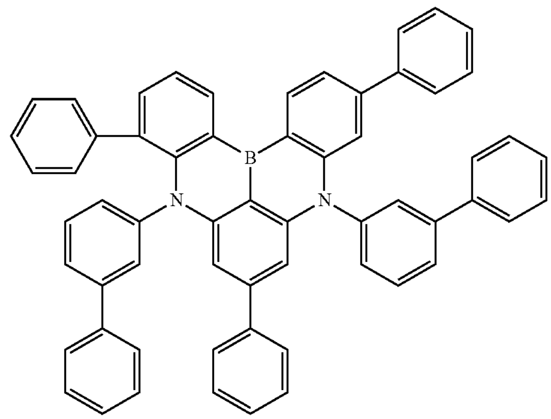
113
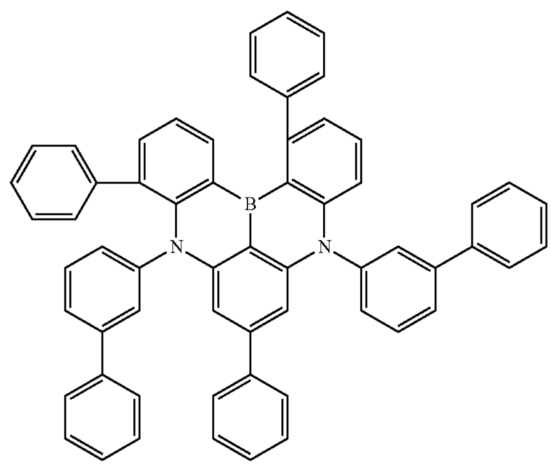
114
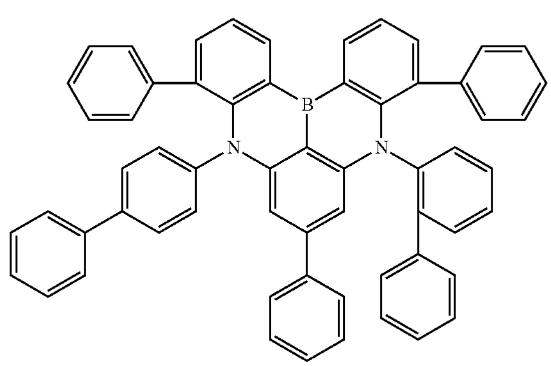

115
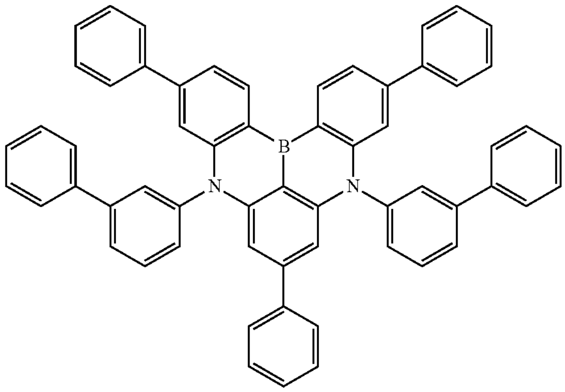
116
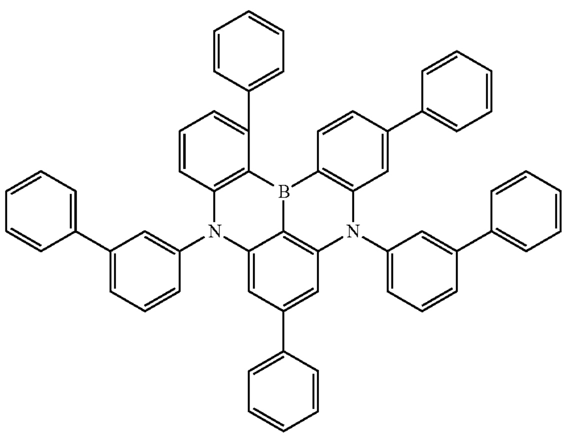
117
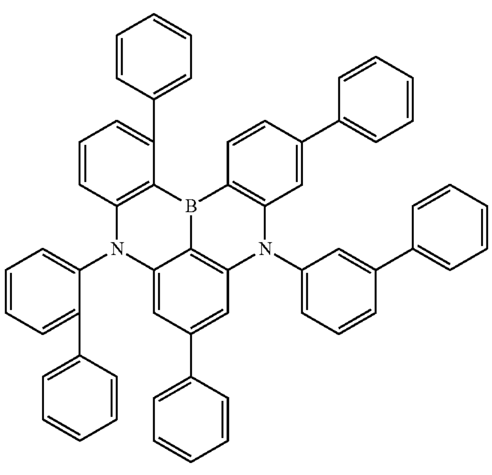
118
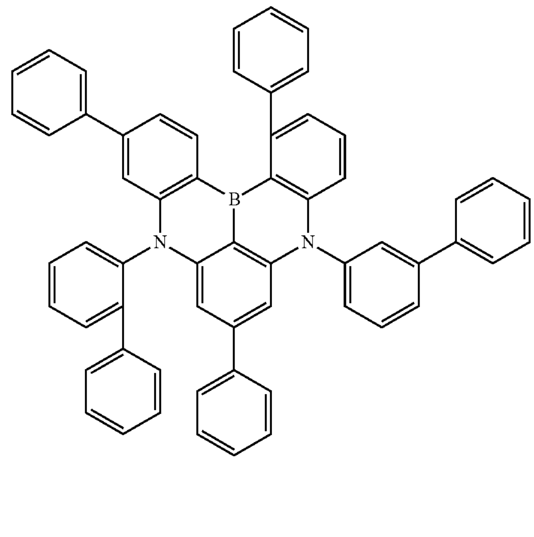
119
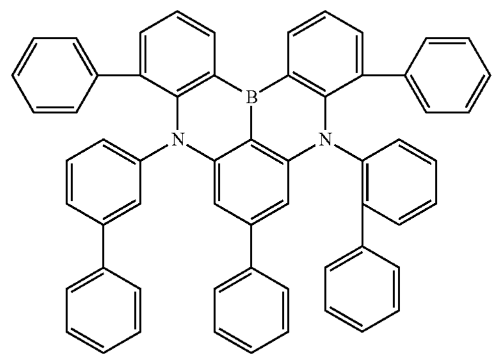
120
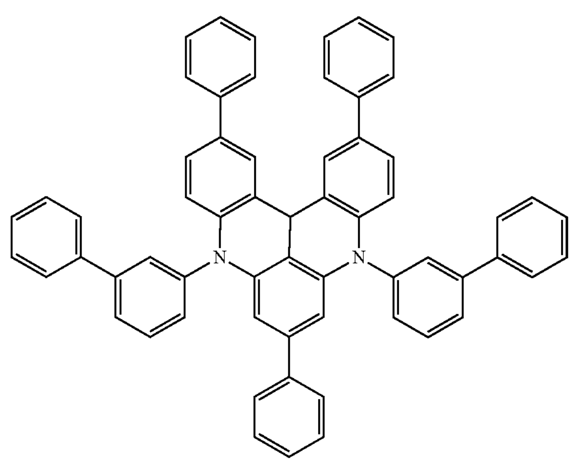

-continued
121
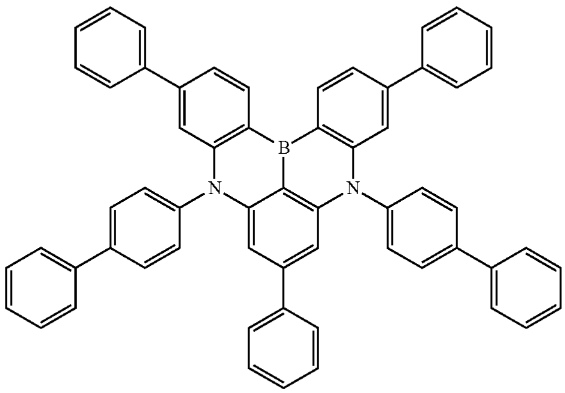
122
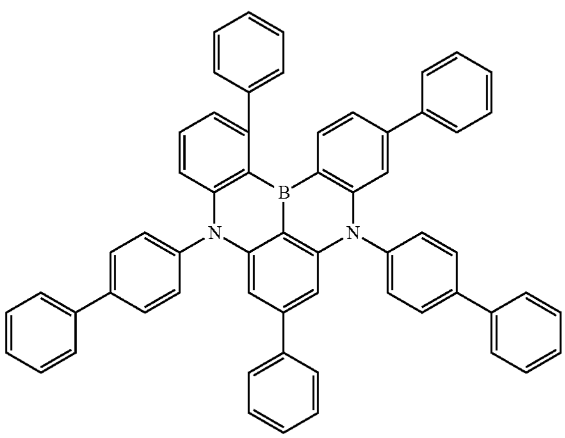
123
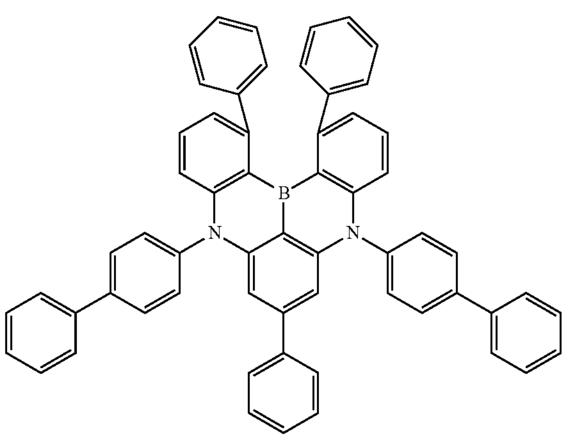
-continued
124
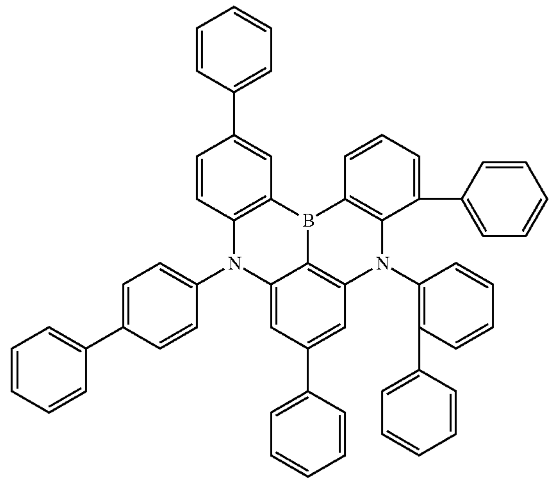
125
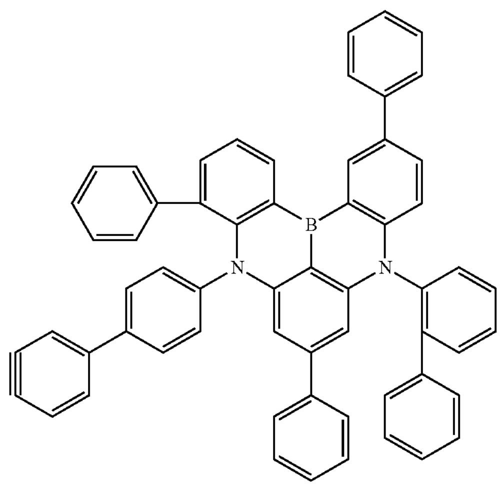
126
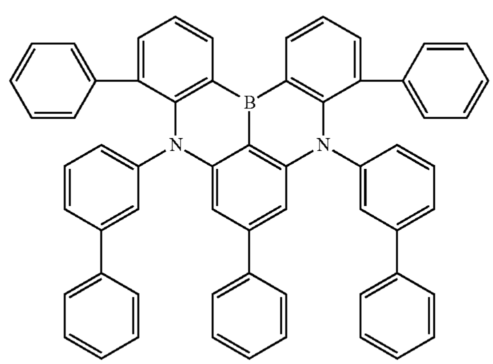

-continued
127
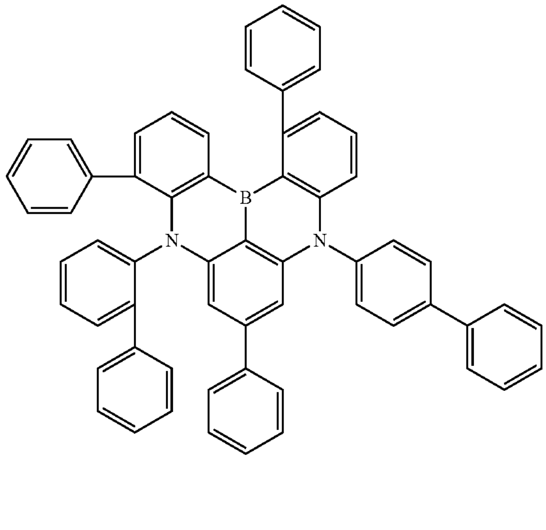
128
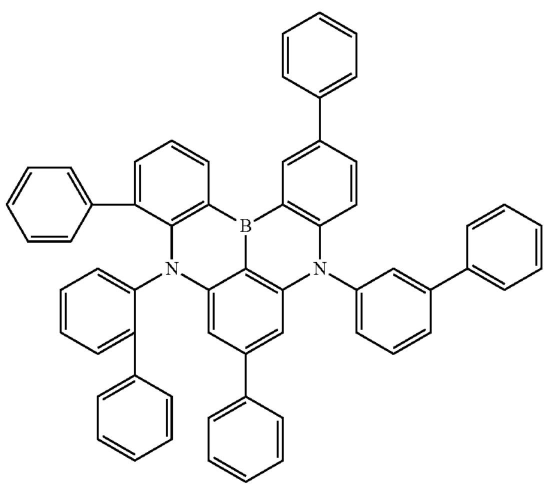
129
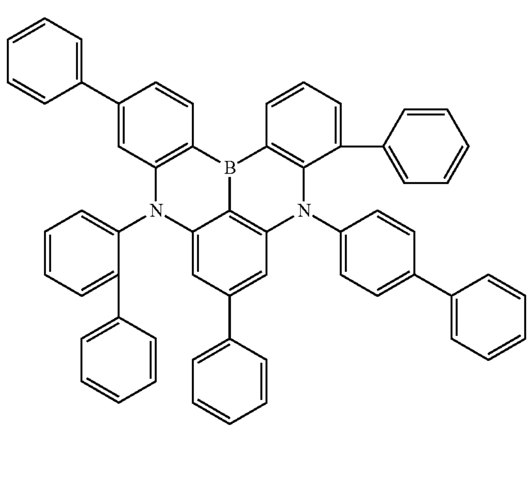
-continued
130
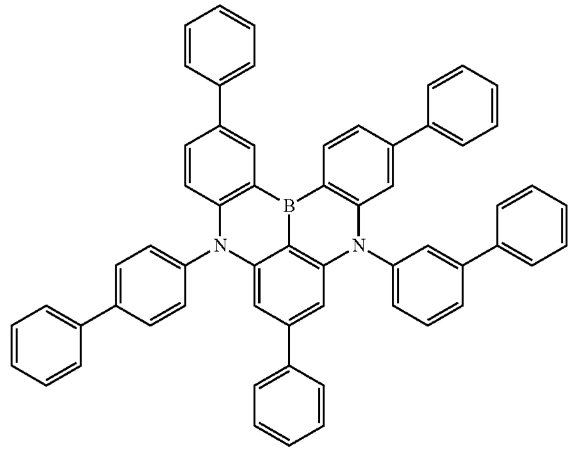
131
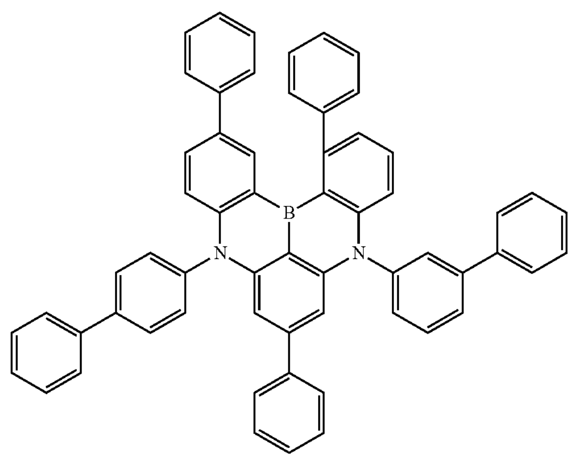
132
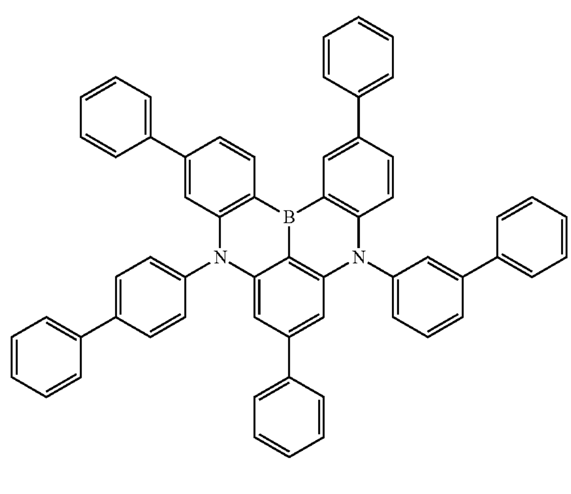

-continued
133
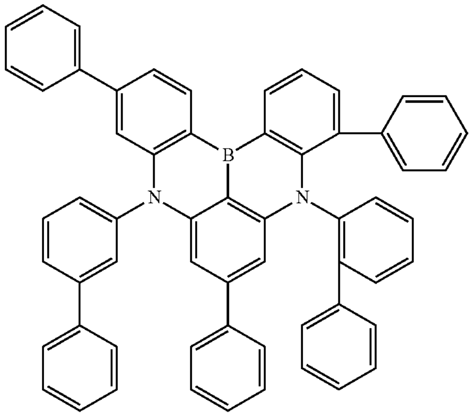
134
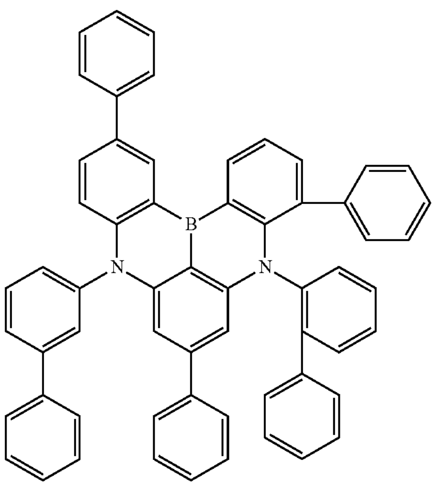
135
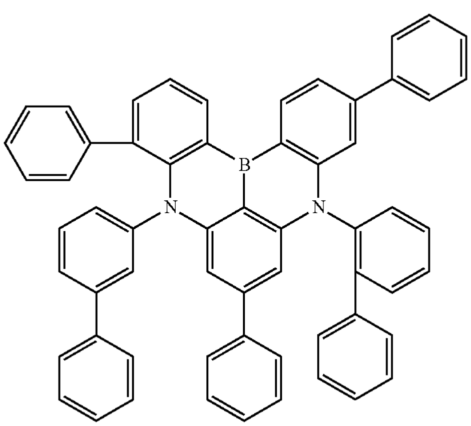
-continued
136
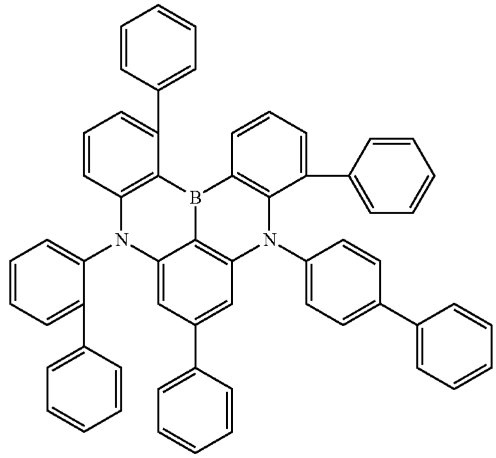
137
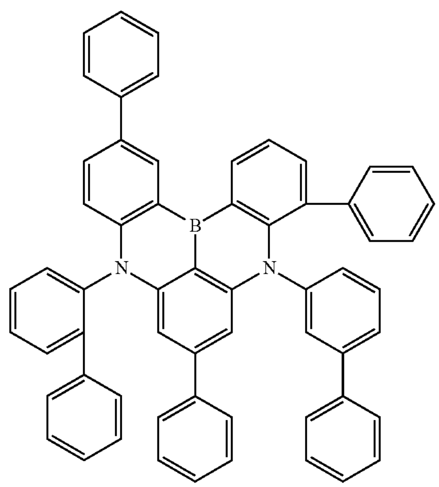
138
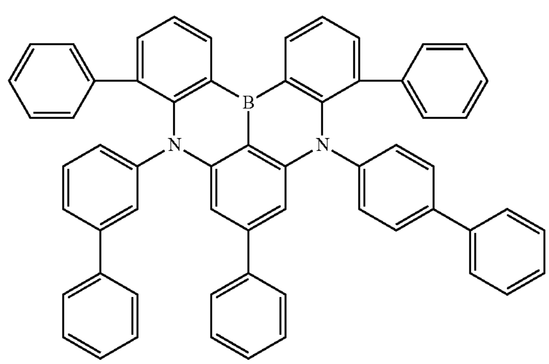

-continued
139
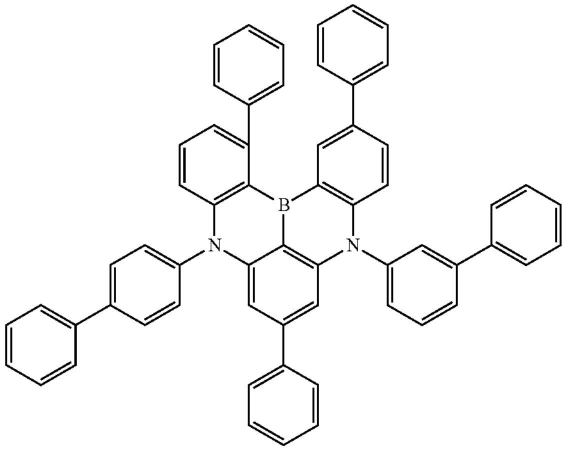
140
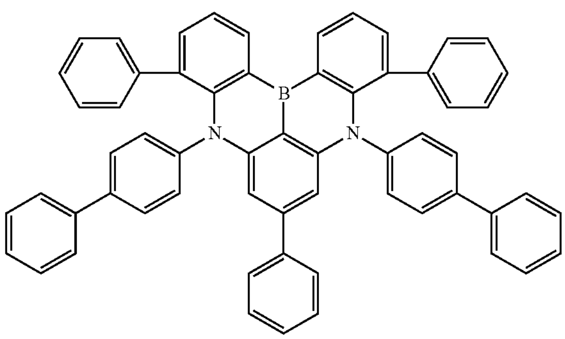
141
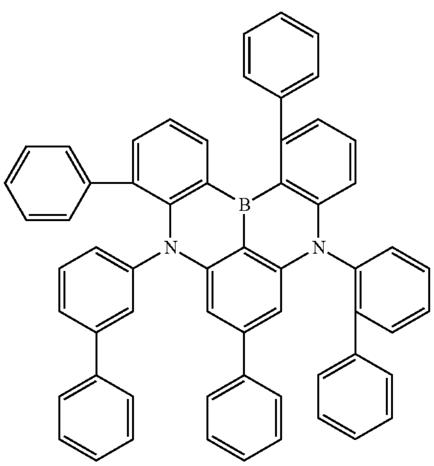
-continued
142
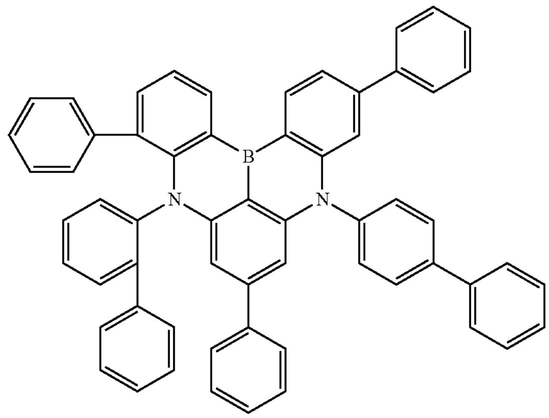
143
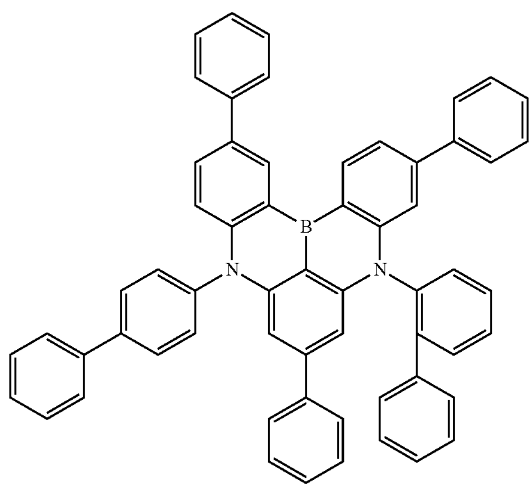
144
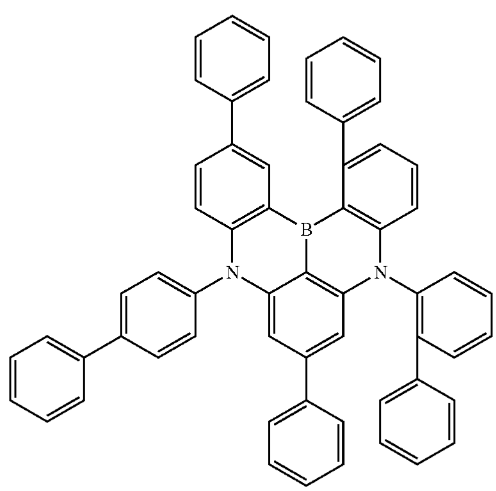

-continued
145
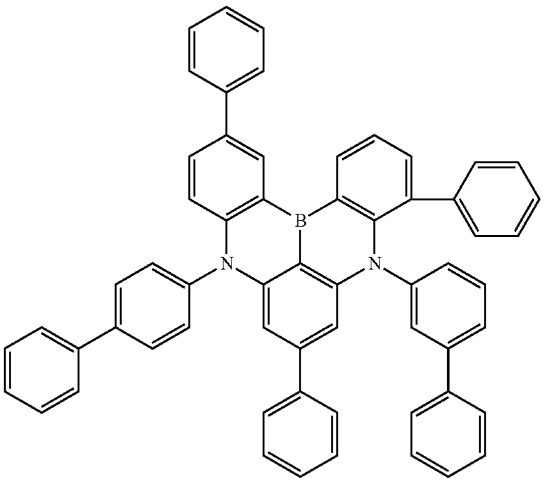
146
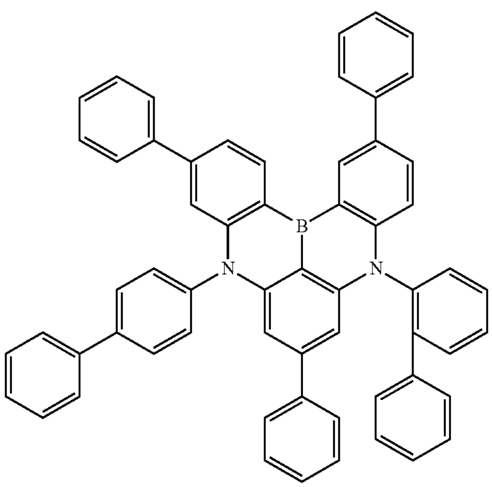
147
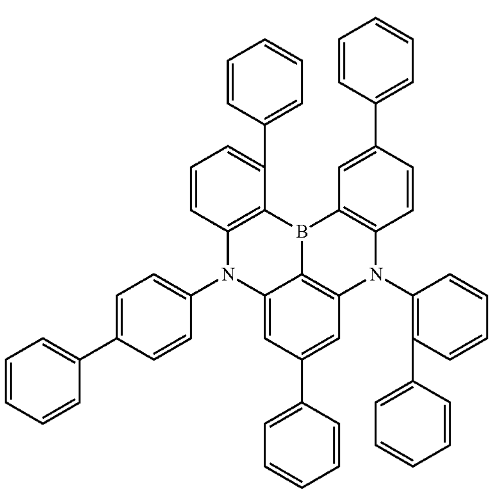
-continued
148
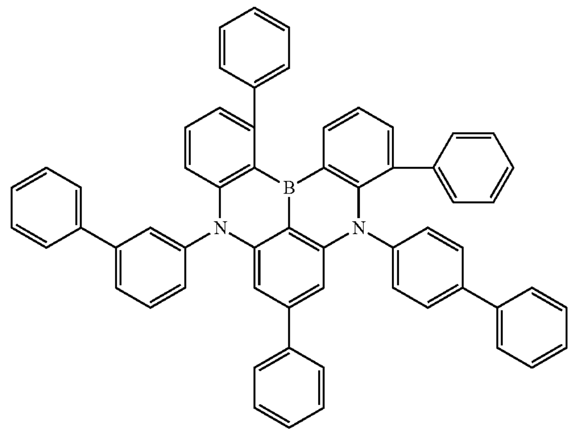
149
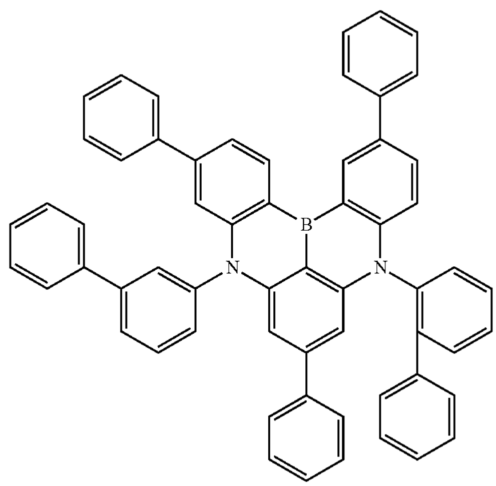
150
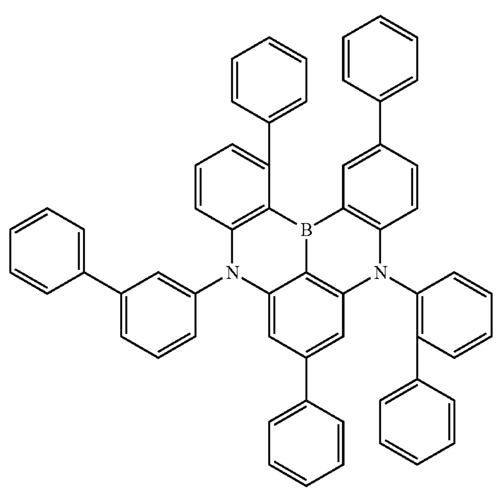

-continued
151
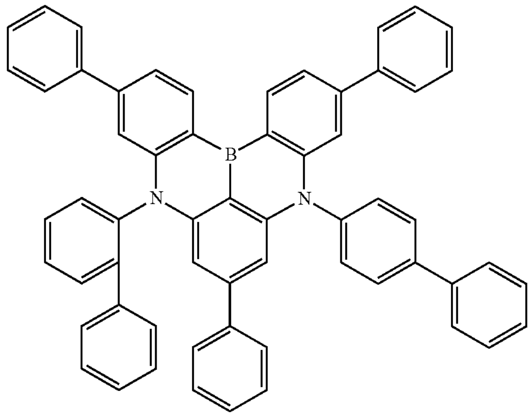
152
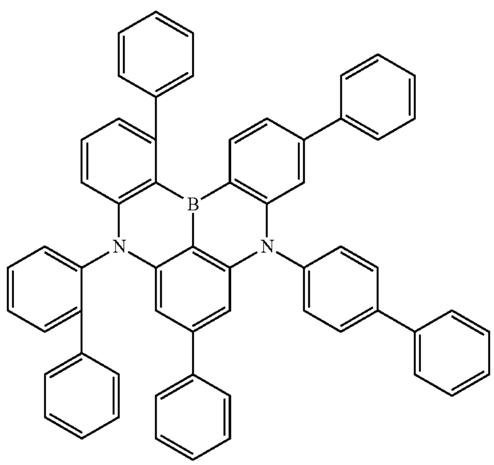
153
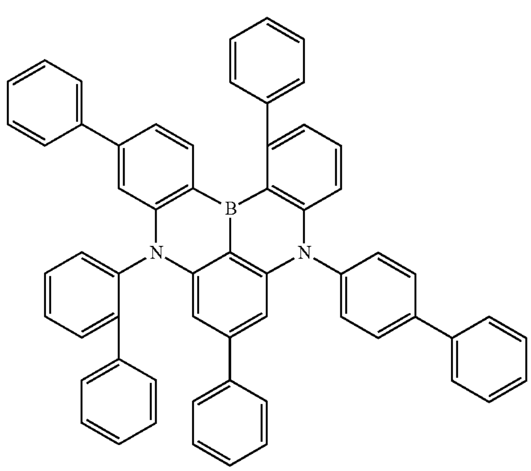
-continued
154
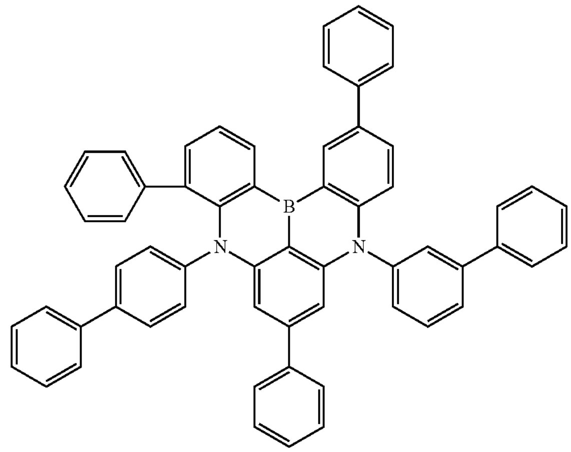
155
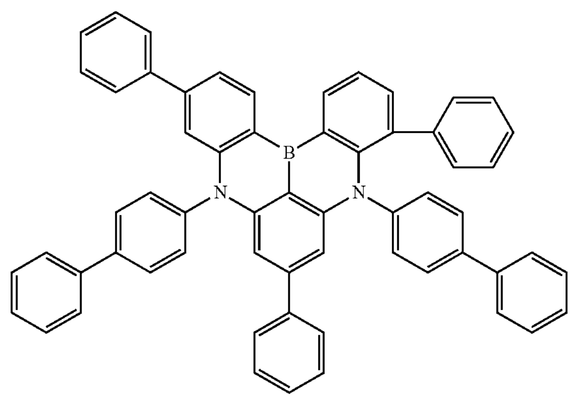
156
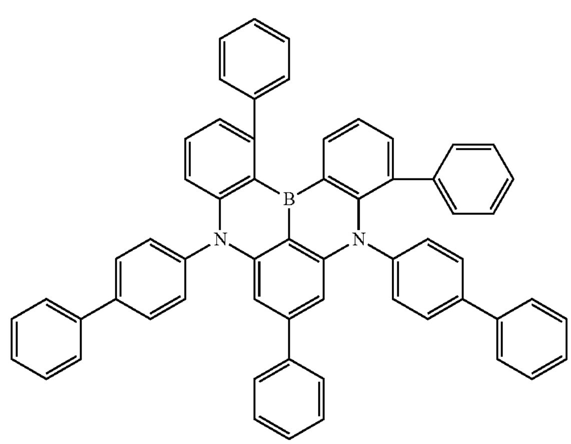

-continued
157
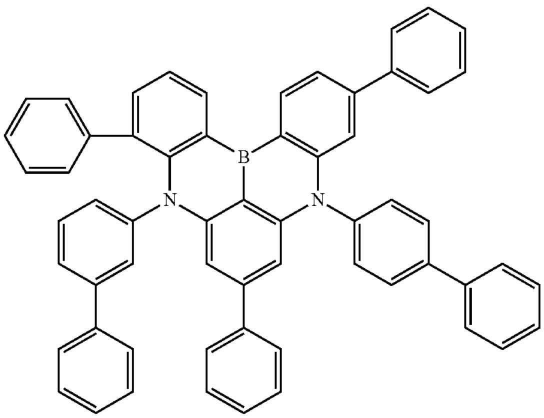
158
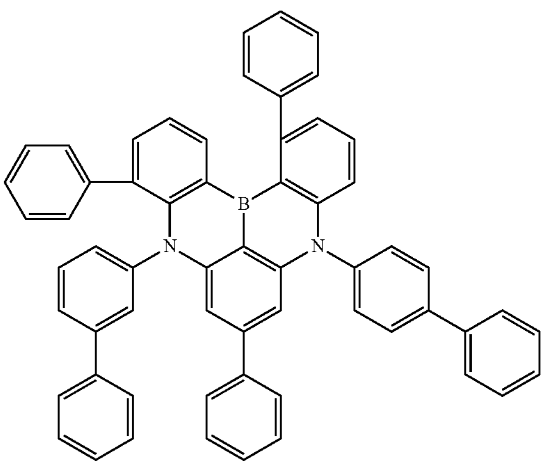
159
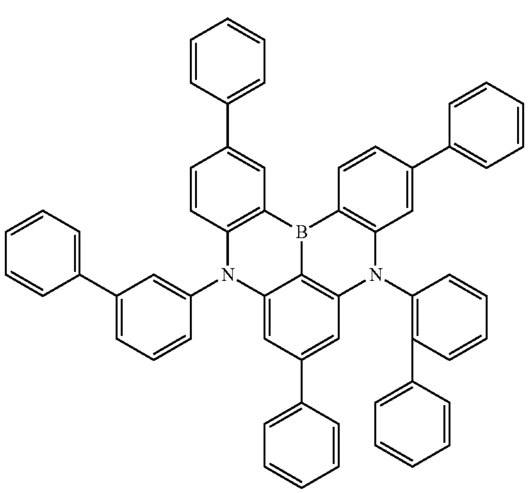
-continued
160
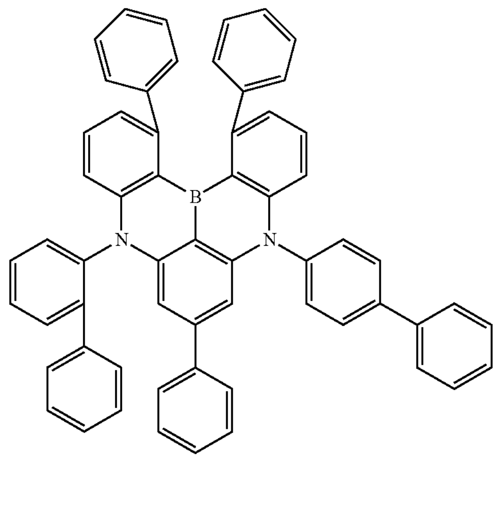
161
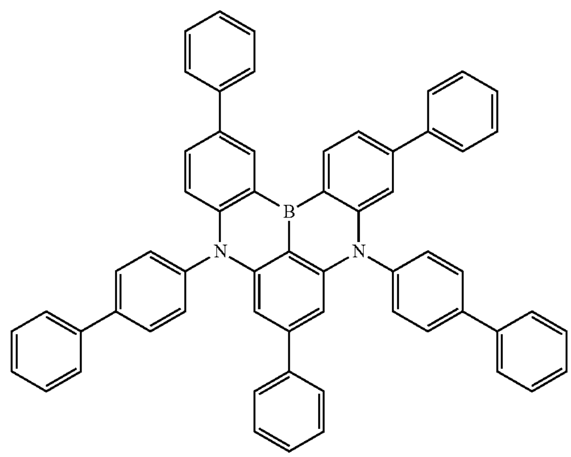
162
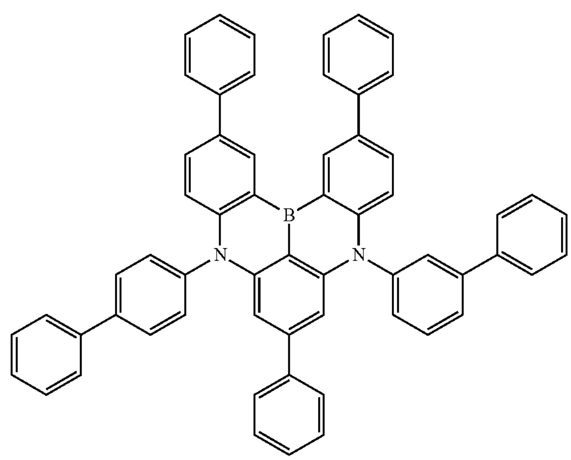

-continued
163
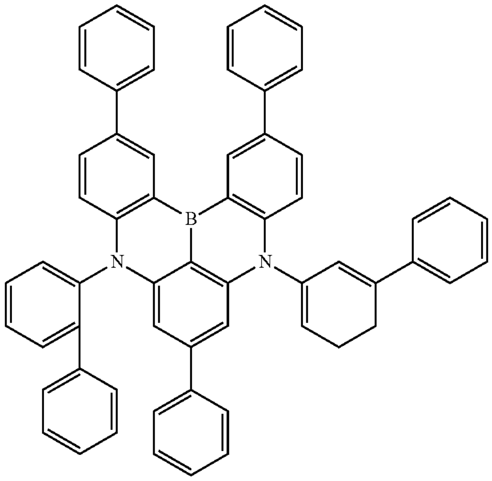
164
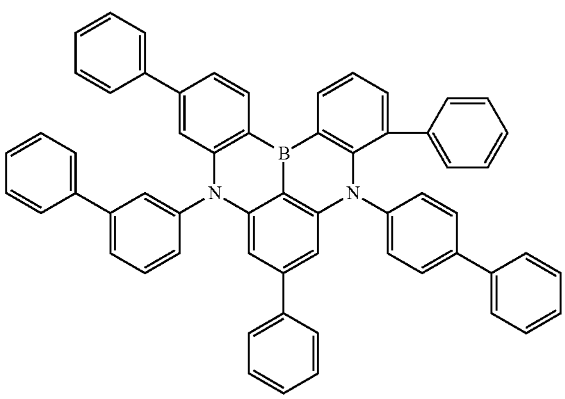
165
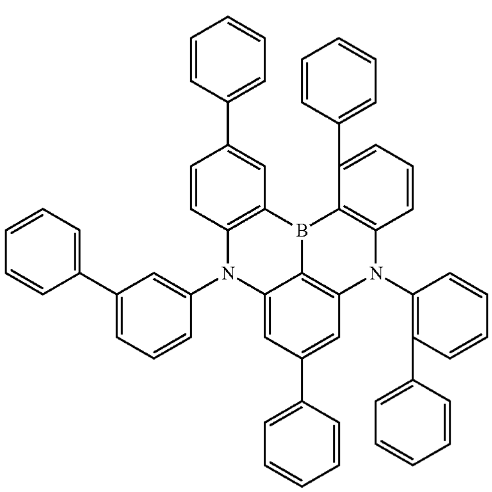
-continued
166
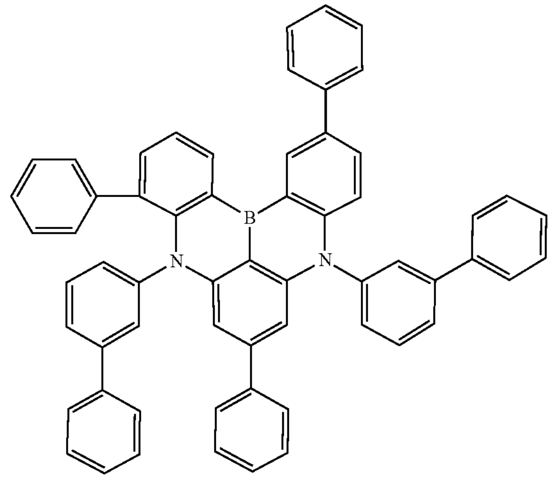
167
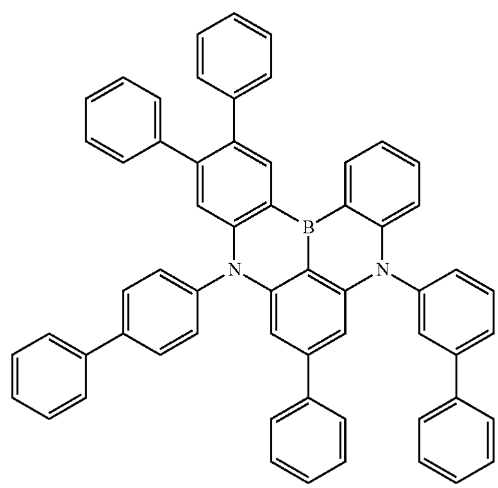
168
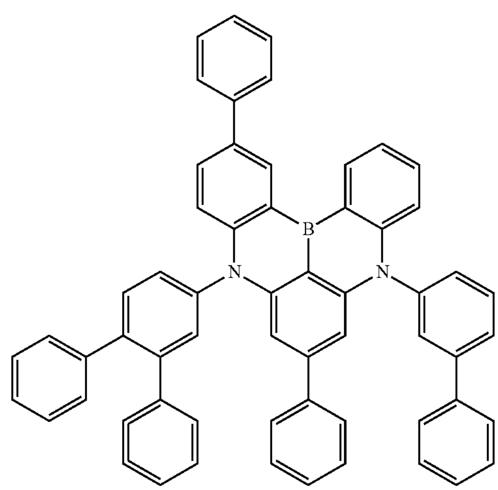

-continued
169
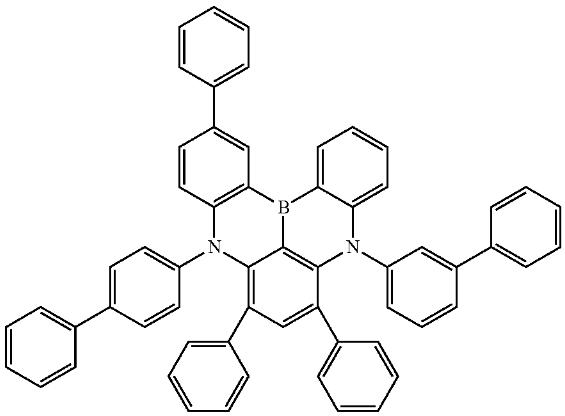
170
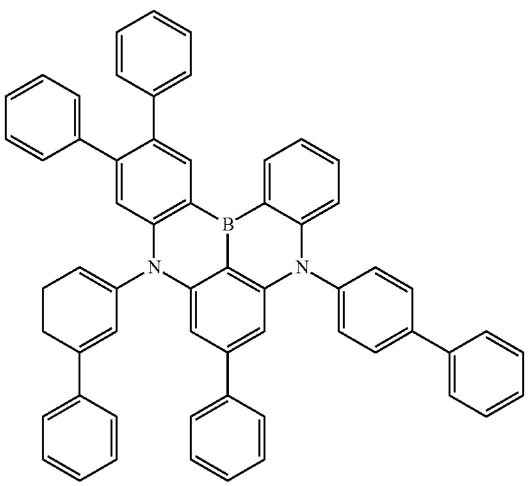
171
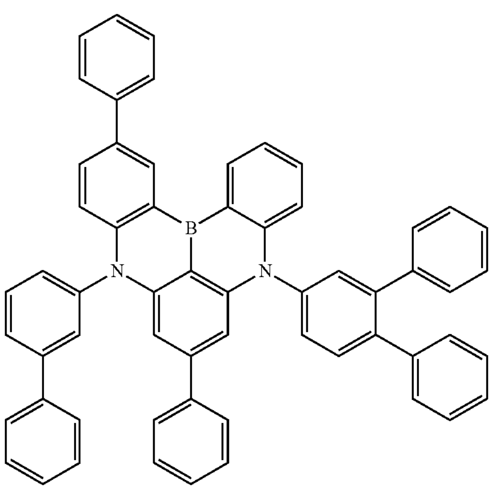
-continued
172
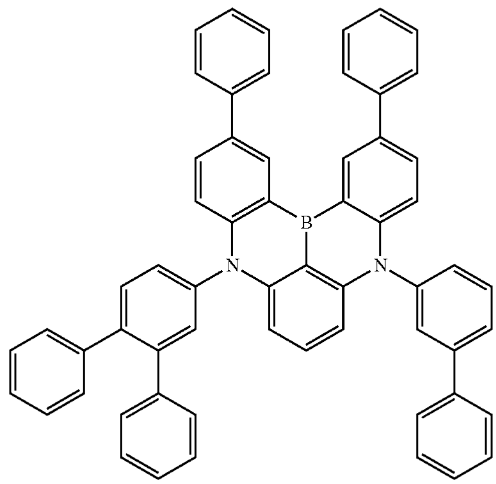
173
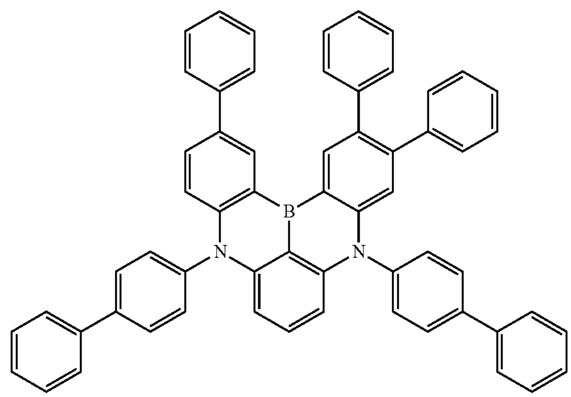
174
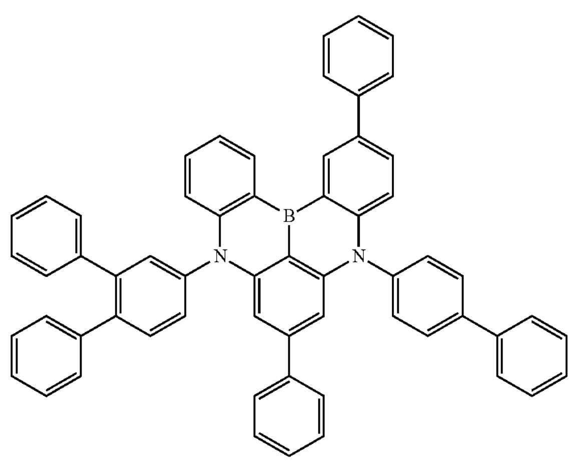

-continued
175
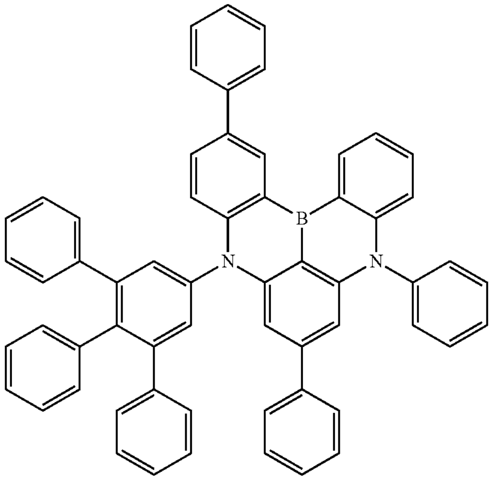
176
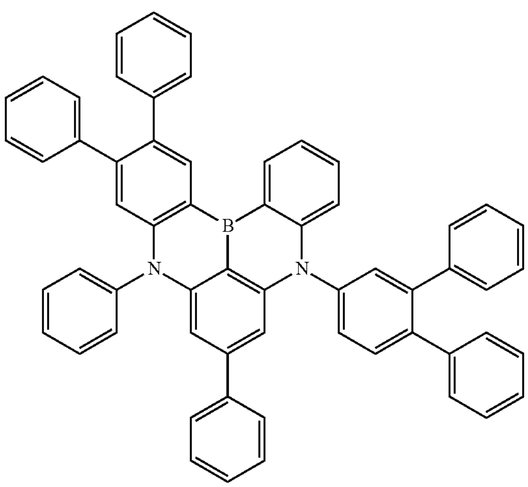
177
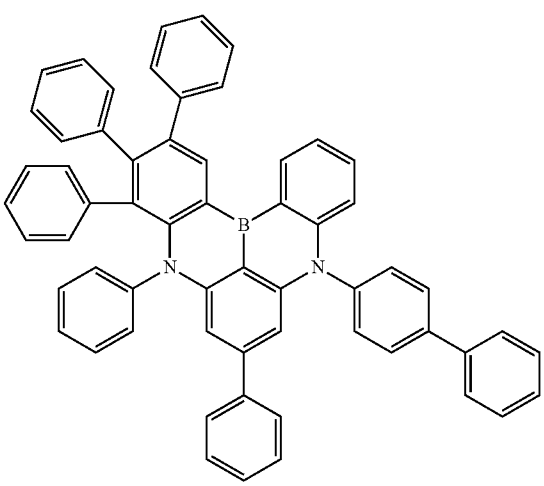
-continued
178
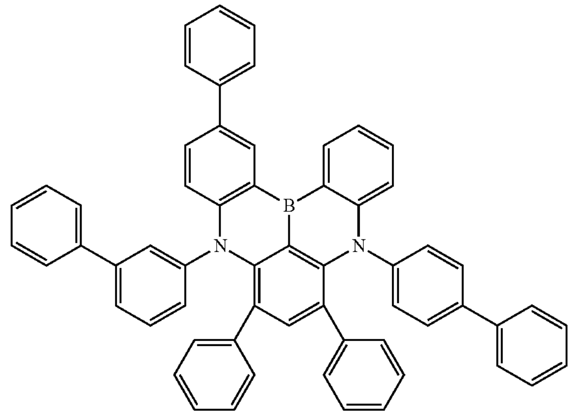
179
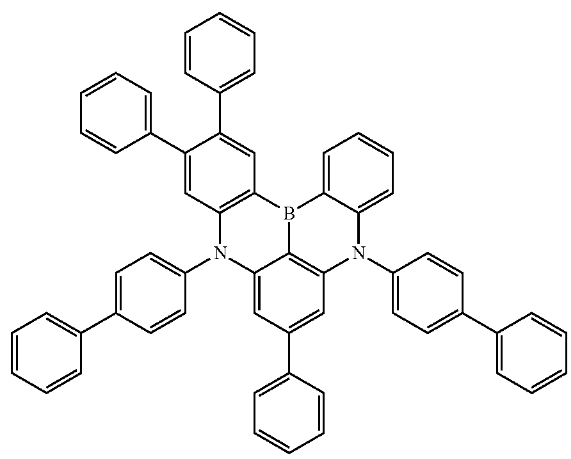
180
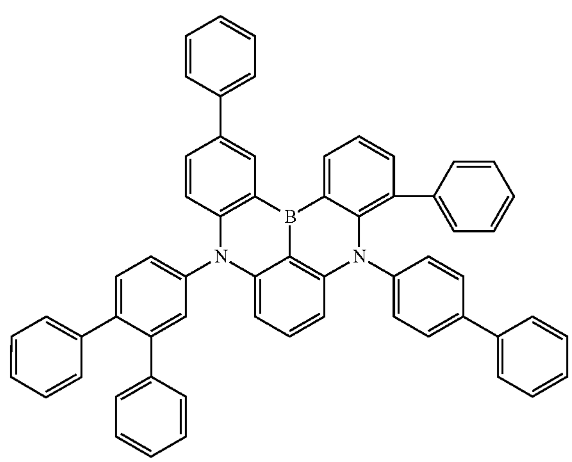

-continued
181
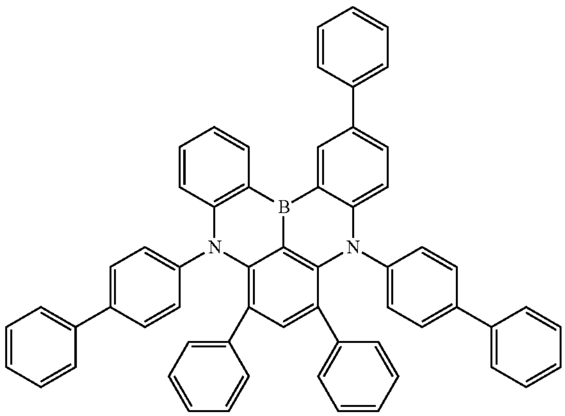
182
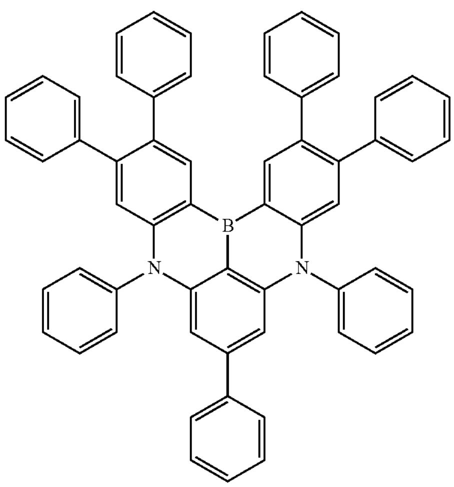
183
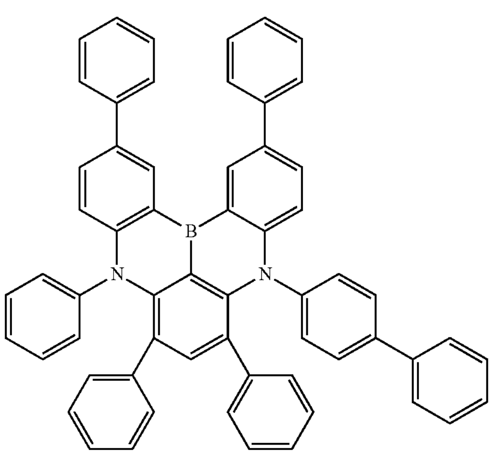
-continued
184
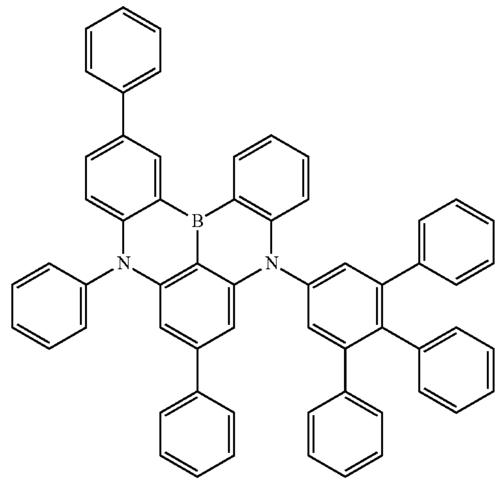
185
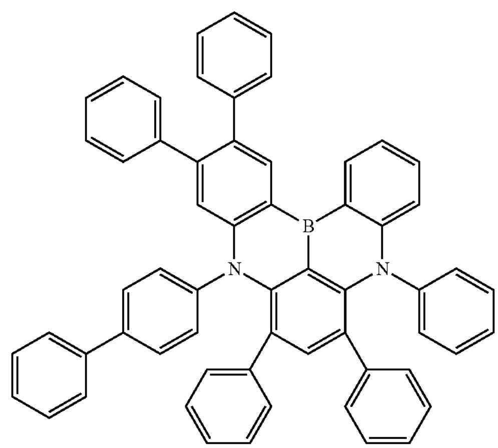
186
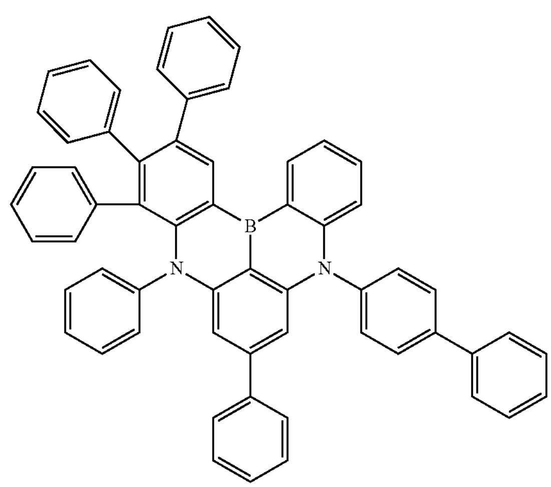

-continued
187
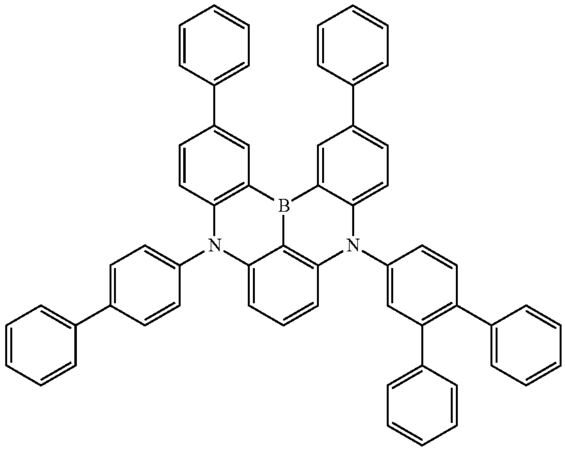
188
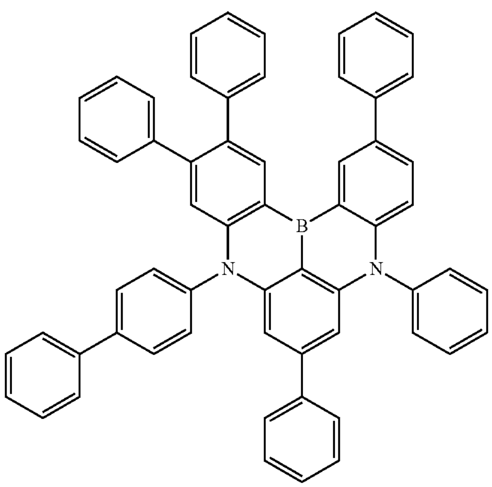
189
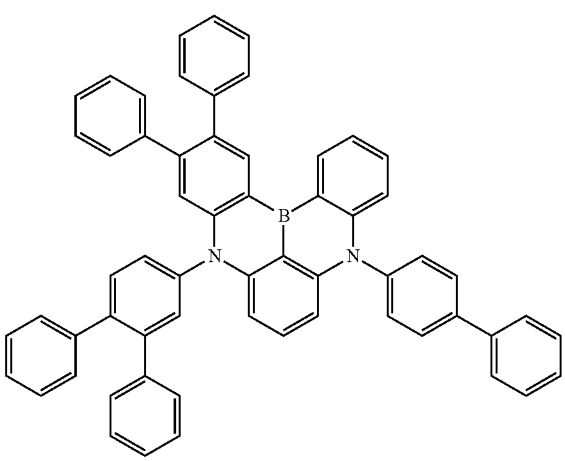
190
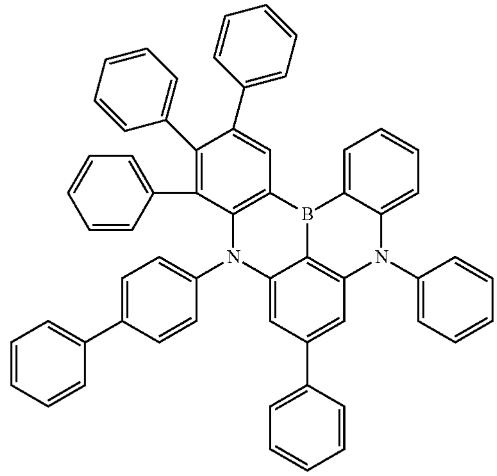
191
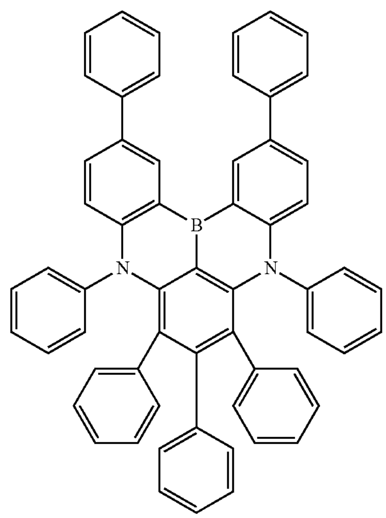
192
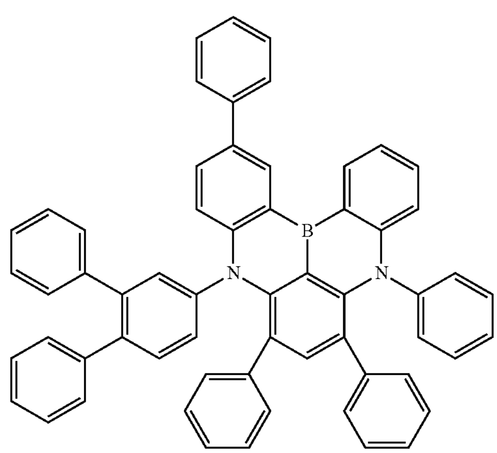

-continued
193
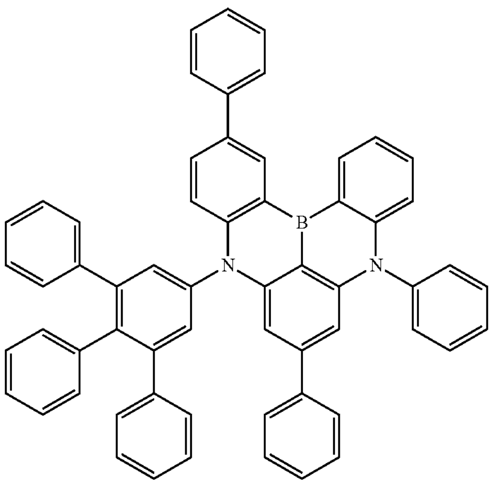
194
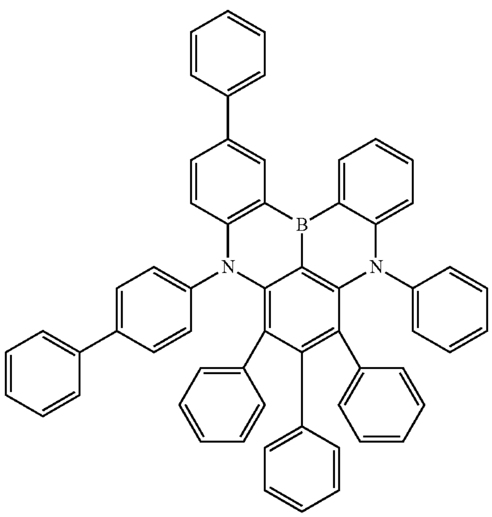
195
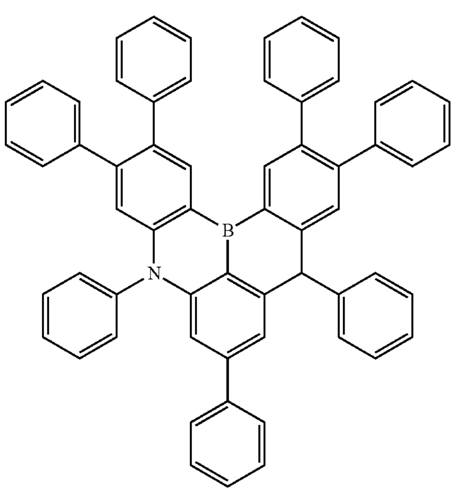
-continued
196
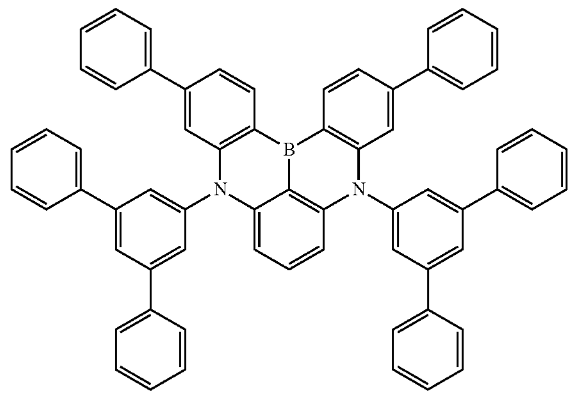
197
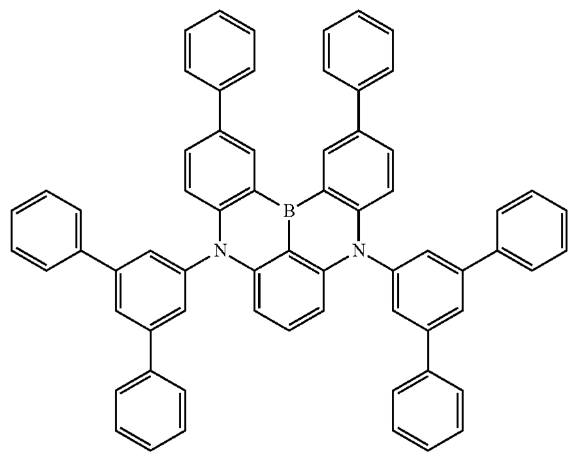
198
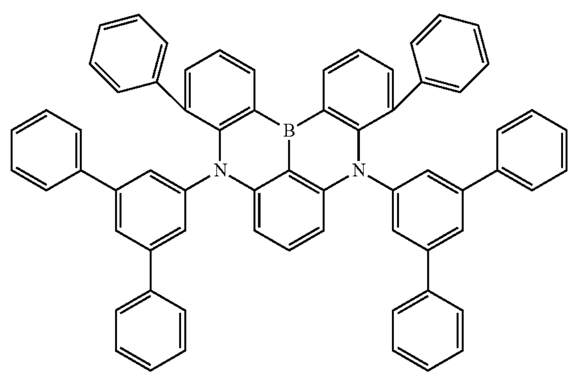
199
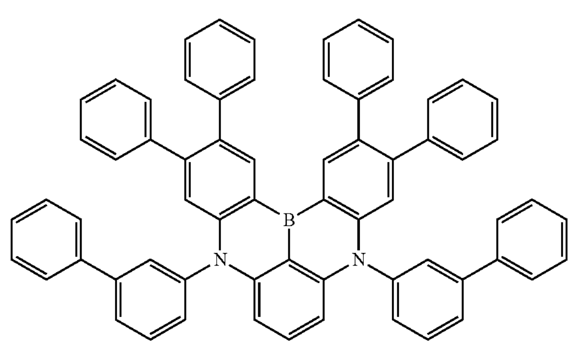

-continued
200
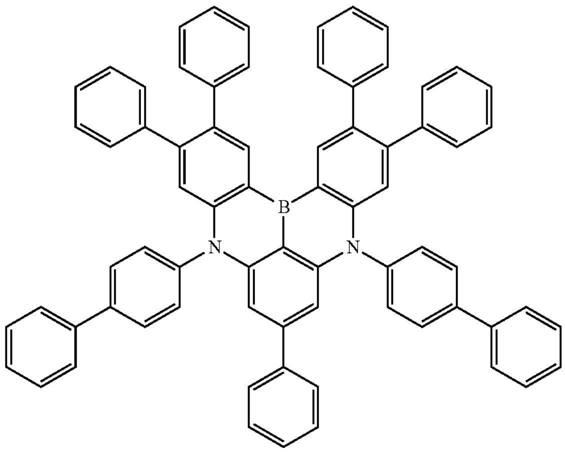
201
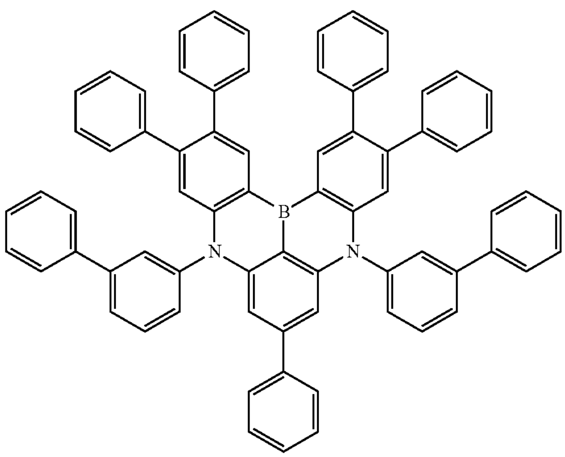
202
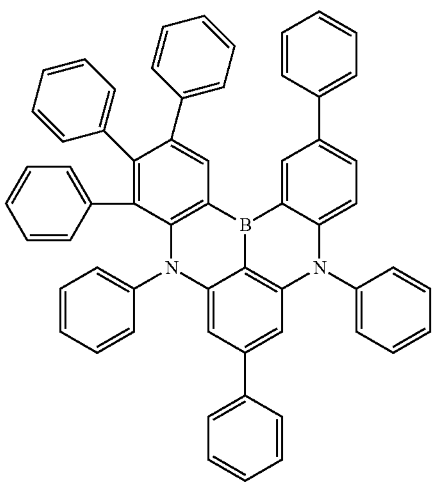
-continued
203
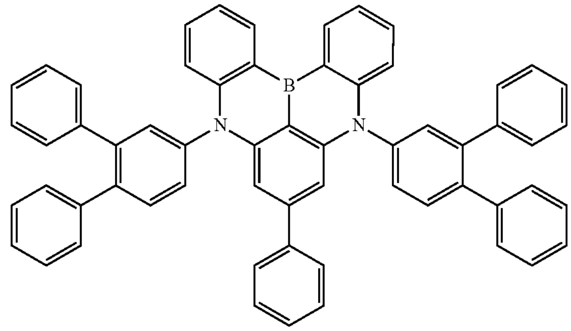
204
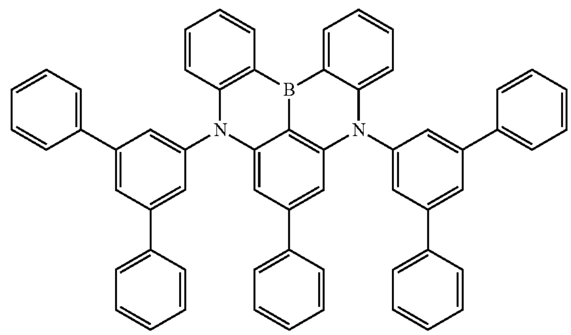
205
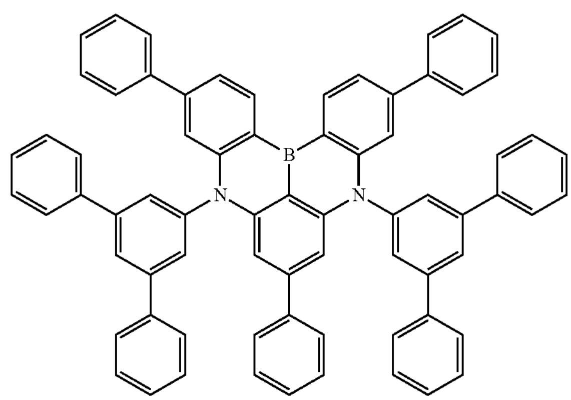
206
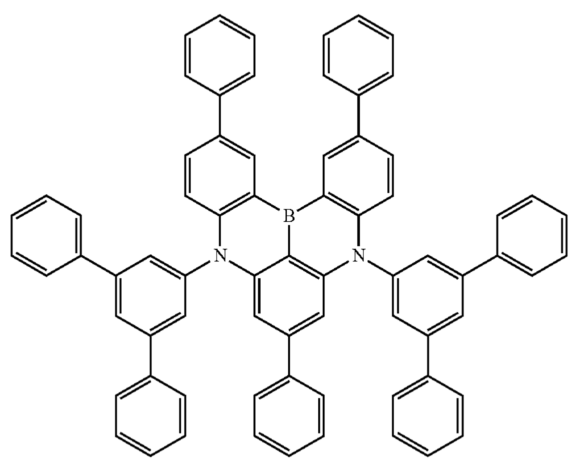

-continued
207
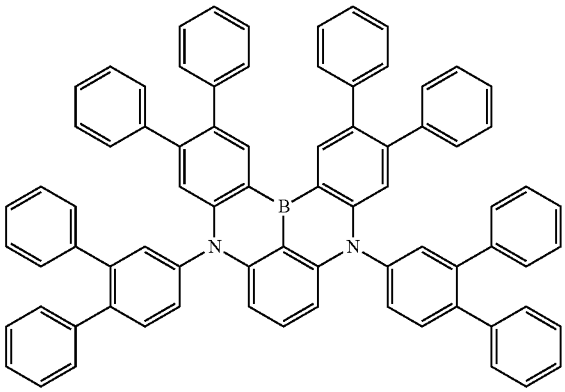
208
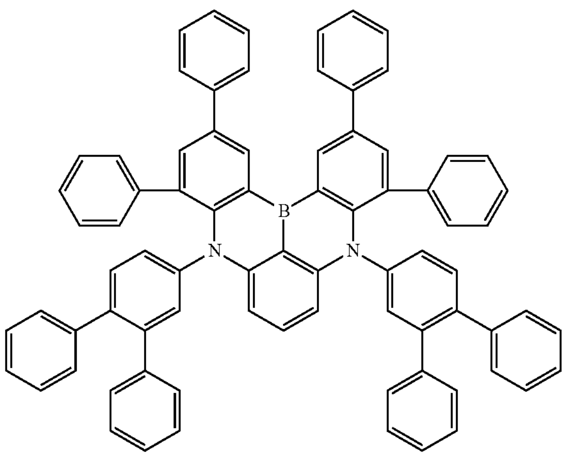
209
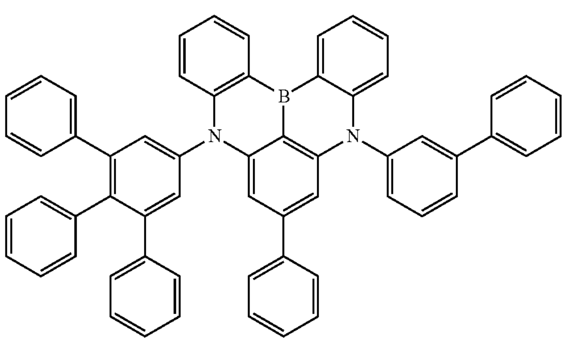
210
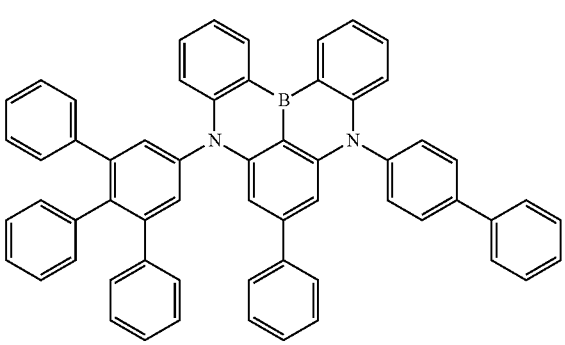
-continued
211
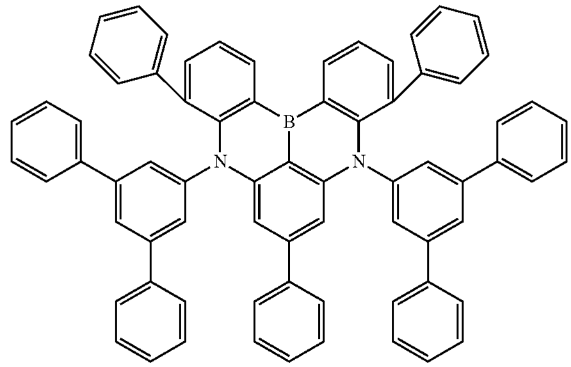
212
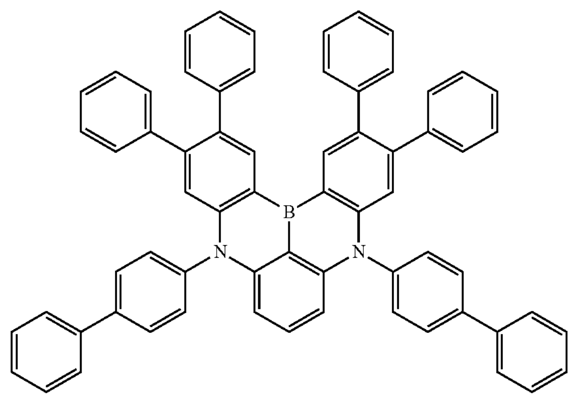
213
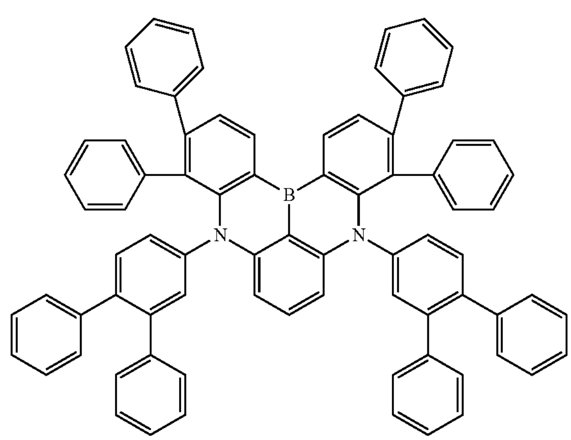

214
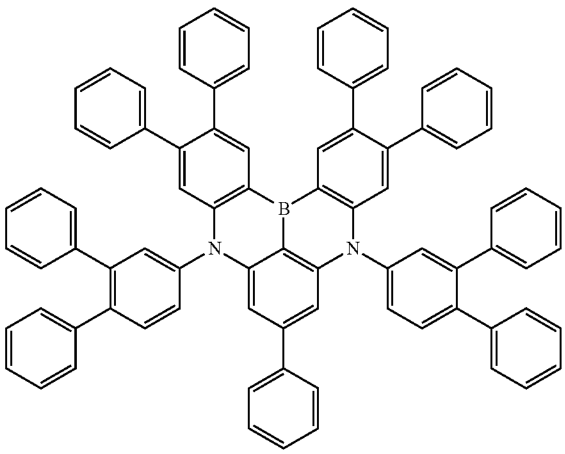
215
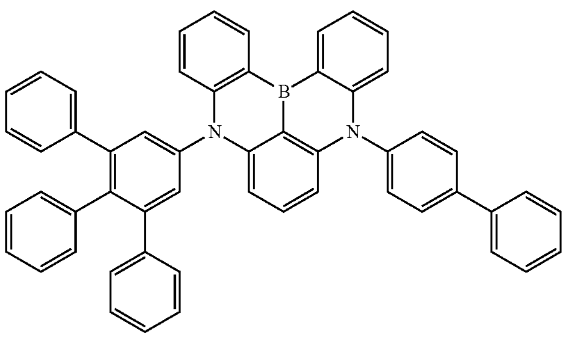
216
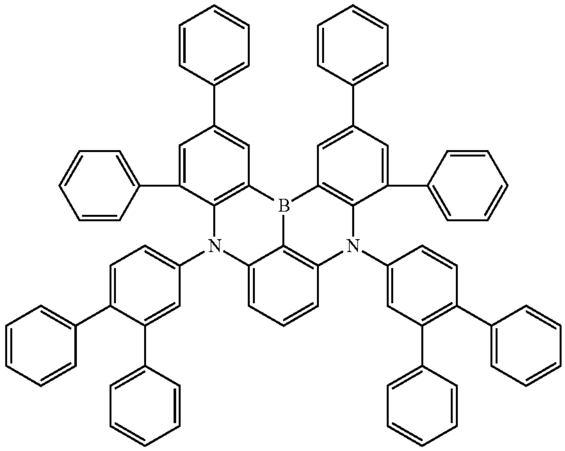
217
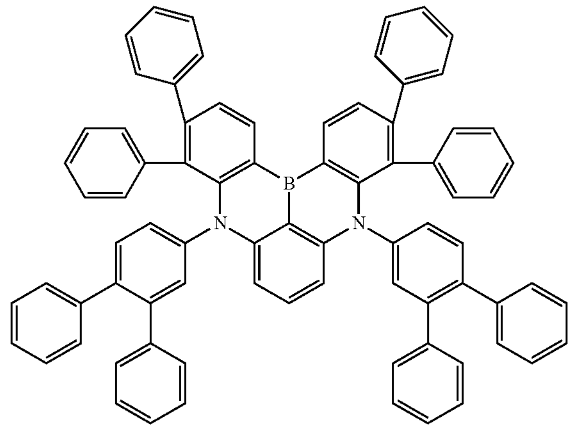
218
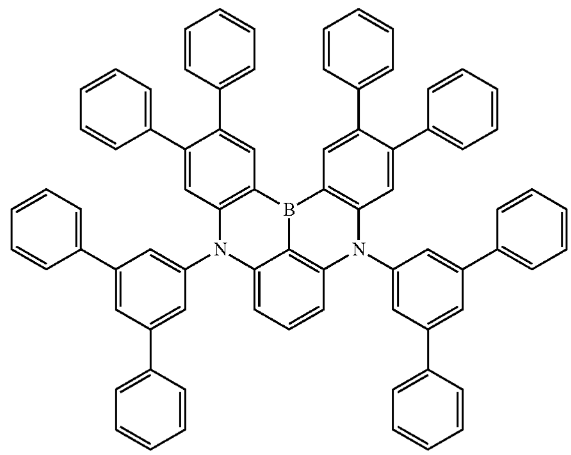
219
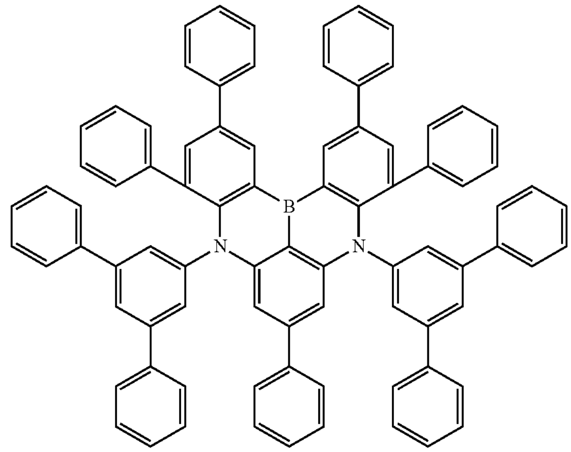

-continued
220
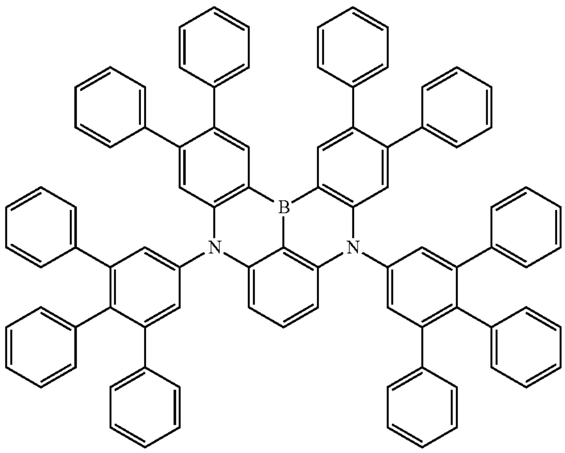
221
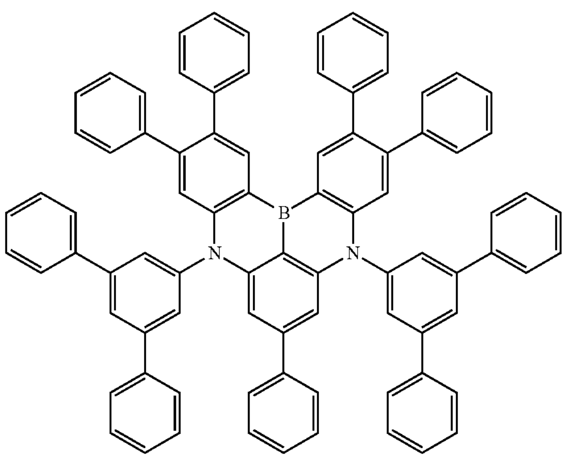
222
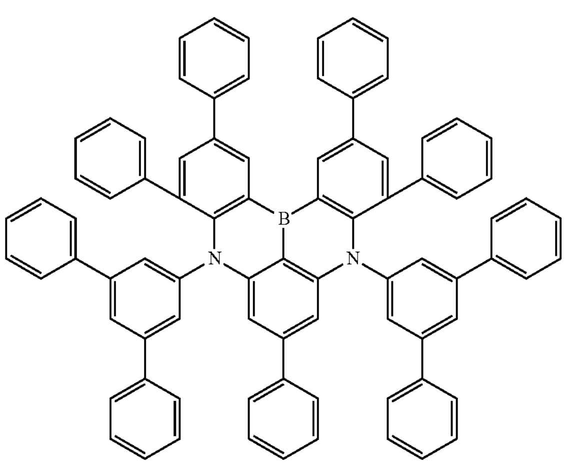
-continued
223
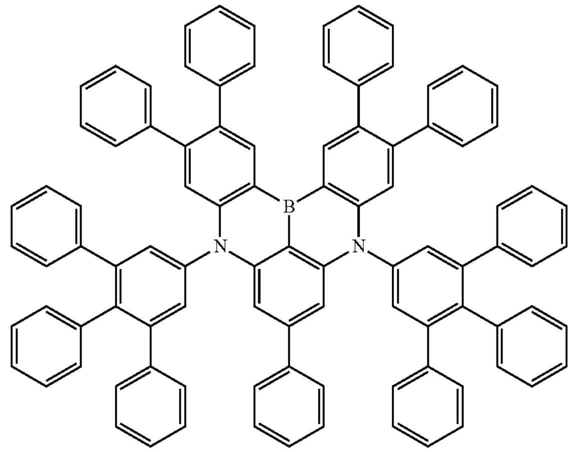
224
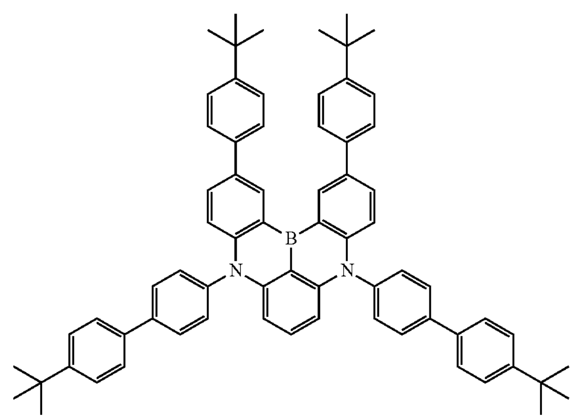
225
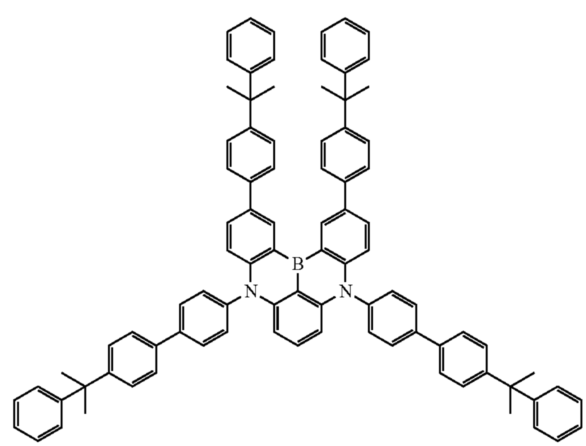

-continued
226
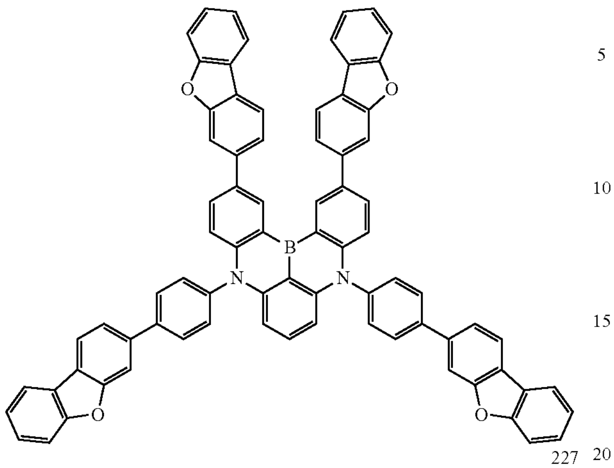
227
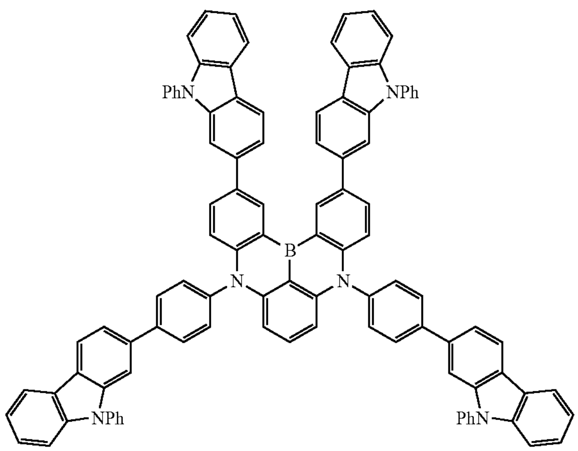
-continued
228
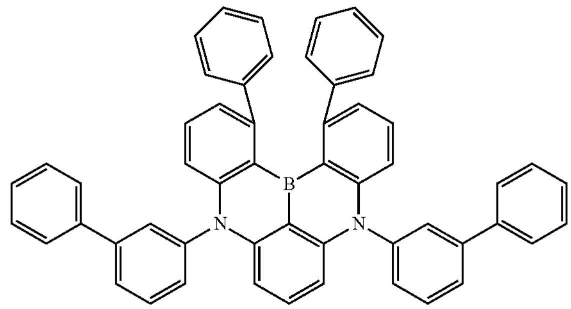
229
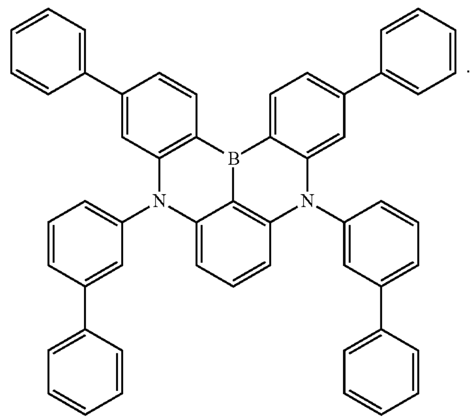
18. An electronic apparatus comprising the organic light-emitting device according to claim 1.
* * * * *